US005353243A

United States Patent [19]

Read et al.

[11] Patent Number: 5,353,243

[45] Date of Patent: Oct. 4, 1994

[54] HARDWARE MODELING SYSTEM AND METHOD OF USE

[75] Inventors: Andrew J. Read, Sunnyvale; Mark S. Papamarcos; Wayne P. Heideman, both of San Jose; Robert K. Mardjuki, Peasanton; Robert K. Couch, Santa Cruz; Peter R. Jaeger; William F. Kappauf, both of San Jose; Lawrence C. Widdoes, Jr.; Louis K. Scheffer, both of Los Altos Hills, all of Calif.

[73] Assignee: Synopsys Inc., Mountain View, Calif.

[21] Appl. No.: 939,393

[22] Filed: Aug. 31, 1992

Related U.S. Application Data

[63] Continuation of Ser. No. 359,711, May 31, 1989, abandoned.

[51] Int. Cl.[5] .............................................. G06F 15/20

[52] U.S. Cl. .................................................... 364/578

[58] Field of Search ............... 364/578, 579, 488, 490; 371/23, 24, 20.1, 27, 29.1; 324/73.1, 158 R

[56] References Cited

U.S. PATENT DOCUMENTS

| | | | |
|---|---|---|---|
| 3,720,131 | 3/1973 | Frohock, Jr. et al. | 324/158 R |
| 3,764,995 | 10/1973 | Holf, Jr. et al. | 324/73.1 |
| 3,832,535 | 8/1974 | DeVito | 235/153 AC |
| 3,854,125 | 12/1974 | Ehling et al. | 340/172.5 |
| 3,922,537 | 11/1975 | Jackson | 235/153 AC |
| 3,976,940 | 8/1976 | Chau et al. | 324/73.1 |
| 4,055,801 | 10/1977 | Pike et al. | 324/73.1 |
| 4,092,589 | 5/1978 | Chau et al. | 324/73.1 |
| 4,102,491 | 7/1978 | DeVito et al. | 235/302 |
| 4,168,796 | 9/1979 | Fulks et al. | 324/73.1 |
| 4,216,533 | 8/1980 | Ichimiya et al. | 365/230 |
| 4,236,246 | 11/1980 | Skilling | 324/73.1 |
| 4,450,560 | 5/1984 | Conner | 371/25.1 |
| 4,456,880 | 6/1984 | Warner et al. | 324/158 R |
| 4,488,354 | 12/1984 | Chan et al. | 29/830 |

(List continued on next page.)

FOREIGN PATENT DOCUMENTS

| | | | |
|---|---|---|---|
| 150260A2 | 8/1984 | European Pat. Off. . | |
| 2123156 | 1/1984 | United Kingdom . | |
| 2164768 | 3/1986 | United Kingdom | G06F 15/60 |

OTHER PUBLICATIONS

L. C. Widdoes, Jr., and W. Harding, "CAE Station Uses Real Chips to Simulate VLSI-Based Systems," *Electronic Design*, Mar. 22, 1984, pp. 167–176.

(List continued on next page.)

*Primary Examiner*—Ellis B. Ramirez
*Attorney, Agent, or Firm*—Marie H. MacNichol

[57] ABSTRACT

An improved hardware modeling system that is preferably embodied as a stand-alone system for networked connection to one or a variety of host computers that are used to design digital electronics systems, the hardware modeling system having a network interface for communicating between the hardware modeling system and the host computer, a central processing unit for controlling operation of the hardware modeling system, a central timing unit for generating timing signals for use in the operation of the hardware modeling system including the generation of precision clocks, data formatting strobes and sample strobes, an internal pattern bus for transmission of read/write requests from the central processing unit in one operational mode and pattern sequences for stimulation of the hardware modeling element in a second operational mode, a pattern controller for controlling presentation and delivery of the pattern sequences to the pattern bus, a pattern memory connected to the pattern controller for storing stimulus pattern sequences, pin electronics circuitry which is used for driving the pattern sequences on the pattern bus to the hardware modeling element and then sensing the five state values of the hardware modeling element pins, and an adapter that is used for fixturing the hardware modeling element to the pin electronics circuitry with the adapter supporting live insertion into a powered hardware modeling system.

111 Claims, 48 Drawing Sheets

U.S. PATENT DOCUMENTS

| | | | |
|---|---|---|---|
| 4,517,661 | 5/1985 | Graf et al. | 364/900 |
| 4,527,249 | 7/1985 | Van Brunt | 364/578 |
| 4,544,882 | 10/1985 | Flora | 324/73 R |
| 4,587,625 | 5/1986 | Marino, Jr. et al. | 364/578 |
| 4,590,581 | 5/1986 | Widdoes | 364/578 |
| 4,594,544 | 6/1986 | Necoechea | 324/73 |
| 4,628,471 | 12/1986 | Schuler et al. | 364/578 |
| 4,635,218 | 1/1987 | Widdoes | 364/578 |
| 4,635,259 | 1/1987 | Schinabeck et al. | 364/579 |
| 4,639,664 | 1/1987 | Chiu et al. | 324/73 |
| 4,644,487 | 2/1987 | Smith | 364/578 |
| 4,646,299 | 2/1987 | Schinabeck et al. | 324/73.1 |
| 4,656,632 | 4/1987 | Jackson | 371/20 |
| 4,675,673 | 6/1987 | Oliver | 340/825.87 |
| 4,686,627 | 8/1987 | Donovan et al. | 364/481 |
| 4,695,968 | 9/1987 | Sullivan, II et al. | 364/578 |
| 4,714,875 | 12/1987 | Balcoy et al. | 324/73.1 |
| 4,724,378 | 2/1988 | Murray et al. | 324/73 |
| 4,744,084 | 5/1988 | Beck et al. | 371/23 |
| 4,764,925 | 8/1988 | Grimes et al. | 371/20 |
| 4,771,428 | 9/1988 | Acuff | 371/25 |
| 4,782,440 | 11/1988 | Nominzu et al. | 364/200 |
| 4,787,061 | 11/1988 | Nei et al. | 364/900 |
| 4,806,852 | 2/1989 | Swan et al. | 324/73 R |
| 4,816,750 | 3/1989 | Van Der Kloot et al. | 324/73.1 |
| 4,931,723 | 6/1990 | Jeffrey et al. | 324/73.1 |

OTHER PUBLICATIONS

Stoll, "PMX: A Hardware Solution to the VLSI Model Availability Problem," IEEE Proceedings of the International Conference on Computer Design, Oct., 1985.

Johnson, "Considerations in Selecting a Physical Modeling System," ADEE Technical Session Proceedings, Sep., 1986, pp. 225–231.

Johnson, "Software vs. Hardware Models for Simulation," Design Automation Guide, 1988.

S. Bisset, "LSI Tester Gets Microprocessors to Generate Their Own Test Patters," Electronics, May 25, 1978, pp. 141–145.

Albrow, "2-head Auto-test System Takes on Complex VLSI," *Electronic Design,* Mar. 5, 1981, pp. 79–84.

Giles and Bowden, "Maintaining Simulation Accuracy Through Physical Device Models," IEEE Proceedings of the International Test Conference, 1985.

Parker, *Integrating Design and Test: Using CAE Tools for ATE Programming,* Computer Society Press of the IEEE, 1987.

Widdoes, L. C. Jr., and H. Stump, "Hardware Modeling," *VLSI Systems Design,* Jul., 1988.

Gillette, "Tester Takes on VLSI With 264-K Vectors Behind Its Pins," Electronics, Nov. 3, 1981, pp. 122–127.

"Testing a TV Character Generator with the Sentry II Sequence Processor," *Fairchild Systems Technology,* pp. 1–12.

Fairchild Technical Bulletin 4, Nov. 1974.

Huston, R., "Description of the Intel 8085 Microprocessor Test Programs for the Sentry II/VII with Sequence Processor Module," Fairchild Systems Technology, Nov., 1977, pp. 1–12.

U.S. patent application Ser. No. 518,134, filed Oct. 25, 1974.

200

| | | |
|---|---|---|
| 202 | BEGIN/END | INITIALIZES AND TERMINATES AN HMS MODELING SESSION. |
| 204 | CREATE | CREATES VARIOUS HMS ENTITIES. |
| 206 | RELEASE | RELEASES (FREES) VARIOUS HMS ENTITIES (COMPLEMENT OF CREATE). |
| 208 | SET | SETS PARAMETERS AND DEVICE PIN VALUES. |
| 210 | GET | RETRIEVES PARAMETERS AND DEVICE PIN VALUES (COMPLEMENT OF SET). |
| 212 | SAVE/RESTORE | SAVES/RESTORES THE FULL HMS STATE OF A SIMULATION. |
| 214 | INQUIRE | QUERIES THE STATE OF VARIOUS HMS PARAMETERS AND USAGE INFORMATION. |
| 216 | MISCELLANEOUS | PROVIDES VARIOUS UTILITIES. |

FIG. 3

HARDWARE MODELING SYSTEM AND METHOD OF USE

This is a continuation of application Ser. No. 07/359,711, filed May 31, 1989, now abandoned, entitled IMPROVED HARDWARE MODELING SYSTEM AND METHOD OF USE.

FIELD OF THE INVENTION

The present invention relates to systems used by electronics designers to simulate the operation of electronic circuits during development and testing of electronic systems. More specifically, the invention relates to hardware modeling systems that use examples of actual physical electronic circuits and components to model their behavior within a simulated electronic system design.

BACKGROUND OF THE INVENTION

A logic-simulation model of an electronic circuit is a diagnostic tool used by a logical-simulator to accurately mimic the logic and timing behavior of the circuit. The purpose of using such a model is to verify both logic and timing behavior of an operational electronic system containing the circuit. The internal operation and internal structure of a simulation model need not be similar to that of the actual circuit being simulated. However, the logical and timing behavior of the simulation model, as externally observed during simulation, must be identical to that of the actual circuit in its real environment.

Simulation models can be divided into three major classes: behavioral models, structural models, and hardware models. Behavioral models represent device behavior by using code written in an algorithmic language such as "C." They are compiled and linked with a simulator and run on a general-purpose computer. Structural models mimic the actual internal structure of a device; they generally run on either general-purpose or special-purpose computers. Behavioral models and structural models are both represented with software and are therefore also called "software models."

A hardware modeling system ("HMS") couples an actual "known-good" physical device (called a "hardware modeling element" or "HME") with a simulator; the physical device is used to model its own behavior during simulation. When the simulator requests a device evaluation, the HMS formats the inputs received from the simulator, applies the inputs to the physical device, measures device behavior, and returns the resulting outputs plus timing information to the simulator. The timing information is generally obtained from a table in a text file called a "software shell," which contains a representation of the data-book delays.

Before hardware modeling systems became available, logic simulation models were generally software models. Software models are practical for low-complexity circuits, but software models of complex very large scale integration ("VLSI") circuits have numerous disadvantages. For example, they may be costly and time consuming to develop, they may be inaccurate, they may be difficult to check, they may execute quite slowly, and they may not be portable between simulators.

In an attempt to address these problems, Valid Logic Systems in 1984 introduced the Realchip TM hardware modeling system which provided an alternative to software simulation models for complex circuits. Realchip is a trademark of Valid Logic Systems. Valid Logic Systems' Realchip TM system was the basis of two U.S. Pat. Nos. 4,590,581, and 4,635,218, which issued in 1987.

Similar hardware modeling systems were subsequently introduced by Mentor Graphics ("HML"), Daisy Systems ("PMX"), GenRad ("HiChip"), Teradyne ("DataSource"), Cadnetix ("CDX-7000"), HHB Systems ("CATS"), and Tektronix ("TurboChip"). The Mentor Graphics HML hardware modeling system formed the basis for U.S. Pat. No. 4,744,084, which issued in 1988 and claimed improvements over the Realchip TM system.

Users have attempted to apply these prior-art hardware modeling systems in several different ways in the design and test of electronic systems. The primary attempted application of prior-art hardware modeling systems is modeling standard devices and existing ASICs during simulation of electronic systems. In this mode, the designer may run real diagnostic software on the simulated system, verifying the operation of the entire system working together as if it had been prototyped.

Another attempted application of prior-art hardware modeling systems is to use an entire existing subsystem, such as a PC board, as an HME, verifying the operation of the entire system containing the PC board as if it had been prototyped.

Another attempted application of prior-art hardware modeling systems is to debug embedded system software and microcode before fabrication of the prototype system.

Another attempted application of prior-art hardware modeling systems is to examine the behavior of existing standard devices and ASICs for which specifications may be inadequate or inaccurate. In this mode, the design engineer uses the device in question as an HME, stimulating and observing it with the simulator's normal user interface. This enables him to directly and easily answer questions about its behavior while the system design progresses.

Another attempted application of prior-art hardware modeling systems is in ASIC design. Many ASICs which are designed and verified in isolation do not operate properly within the target system. A hardware modeling system can help to solve this problem because it gives the designer access to full-function models of all the complex devices in the embedding system and enables him to simulate the entire system together before ASIC fabrication.

Another attempted application of prior-art hardware modeling systems is for functional verification of prototype ASICs. In this mode, the engineer fixtures the prototype ASIC as an HME, uses the resulting hardware model in place of the earlier gate-level model, and runs the same simulation test cases that were run during the design phase.

Although the prior-art hardware modeling systems enjoyed some commercial success, they suffer from a number of serious limitations with respect to these applications. One limitation of prior-art hardware modeling systems is that they lack the capability to be easily integrated with simulators from multiple different vendors. Therefore, in general, each one works with only one or at most a small set of simulators and cannot be accessed concurrently by multiple simulators running on multiple host platforms. Thus, designers using simulators from multiple vendors may need to buy multiple hardware modeling systems.

Also, prior-art hardware modeling systems are limited in their support for ASICs. For example, state-of-art ASICs have very high pin counts, and prior-art hardware modeling systems do not directly support very-high-pin-count devices. Also, prior-art hardware modeling systems do not directly support the capture and replay of test vectors for ASIC prototype verification.

Also, prior-art hardware modeling systems do not support direct timing measurement of HME output delays. Direct timing measurement is important for the comprehensive verification of prototype ASICs. Direct timing measurement is also important to simplify creation of the shell software for new ASIC hardware models.

Also, prior-art hardware modeling systems have proven difficult to use due to requirements for custom pin wiring on device adapters, specialized initialization circuitry, and complex software shells.

Also, prior-art hardware modeling systems are generally not fully and easily configurable. Hardware modeling systems can be used in several distinct modes which require configuration of the modeler in different dimensions. For example, system-level simulation requires that the HMS be configured for a large number of devices simultaneously mounted; ASICs tend to have high pin counts, so modeling and verifying them requires support for high-pin-count devices; and simulating the execution of software on processor models requires deep pattern memory. Prior-art hardware modeling systems limited simultaneous configurability in these dimensions.

Also, prior-art modeling systems suffer from poor performance, particularly in round-trip access time from the simulator, and in pattern-presentation rate. Better performance in both areas is necessary to keep pace with faster simulators and workstations, and to properly refresh state-of-the-art high-speed dynamic devices so that correct results are obtained.

Also, prior-art hardware modeling systems suffer from limitations of the "pin electronics," which is the electronic circuitry used by the hardware modeling system to stimulate and sample the inputs, outputs, and bi-directional ("I/O") pins of the HME. For example, because of the primitive nature of the pin electronics in the prior-art hardware modeling systems, when certain types of integrated circuits, particularly those having feed-through paths connecting I/O pins, such as the 74ALS645 bi-directional bus buffer manufactured by Texas Instruments, are used as HMEs in such systems, the very process of electronically sampling some I/O pins of the integrated circuit may inadvertently stimulate the device and cause incorrect signal values to be sampled on other I/O or output pins. As a result, the hardware modeling system may return incorrect results to the workstation which is performing the simulation. Some users of prior-art hardware modeling systems refer to this problem as the "coupled-I/Os problem."

Also, in prior-art hardware modeling systems, generally at least two bits are stored in each stimulus pattern for each pin of the HME, e.g., one bit for the data value and one bit which can inhibit the HMS pin driver. Since memory for pattern storage is generally expensive, a system and associated method of use is needed for reducing the amount and, therefore, the cost of required pattern storage.

Also, prior-art hardware modeling systems suffer from other deficiencies due to inadequate pin electronics, such unreliability and a lack of capability to support multiple integrated circuit technologies (such as TTL and low-voltage CMOS). Because of the inability to support multiple integrated circuit technologies, some types of integrated circuits cannot be used as HMEs in prior-art hardware modeling systems.

Therefore, a need exists for an improved hardware modeling system, and a method which is directed toward solving and minimizing these and other problems of prior-art devices.

SUMMARY OF THE INVENTION

The present invention is an improved hardware modeling system and method of use.

The hardware modeling system ("HMS") of the present invention is adaptable for connection to a host computer, which includes a simulator, and is supported by software appropriate for communicating with the HMS. In fact, the HMS is capable of connecting to, and communicating with, a variety of host computers including a variety of simulators, in particular including conventional digital logic and fault simulators. The host computers are conventional electronic design workstations; the software that supports their use with the HMS is novel.

The host computer and the HMS are preferably connected by a local-area network over which information is transmitted bi-directionally between the two systems. Multiple HMSs can be networked with, and concurrently shared by, multiple host computers running multiple different simulators.

The HMS of the present invention provides hardware models of standard ICs, ASICs, and electronic subsystems. The HMS has a number of applications. Some of the major ones are as follows:

1) modeling standard off-the-shelf ICs, including static and dynamic ICs and VLSI ICs, in simulation of an electronic system design;

2) modeling custom static and dynamic ICs (ASICs) in simulation of an electronic system design;

3) modeling electronic subsystems and PC boards in simulation;

4) debugging embedded system software and microcode using a simulated prototype;

5) examining the behavior of existing physical standard devices and ASICs;

6) verifying the functional behavior and timing of ASIC prototypes; and 7) generating and capturing standard-device, ASIC, and PC-board test vectors during simulation.

In order to better understand the present invention, it is useful to briefly describe the general overall operation of the HMS as it is used by a typical simulator.

When an electronic circuit is being simulated by a digital simulator including software simulation models of some circuit components, the simulator repeatedly "evaluates" the software simulation models of the components within the circuit. In order to evaluate a single software simulation model of a component, the simulator prepares a stimulus pattern representing the values of the input signals of the component and then executes a software routine which computes the output signal values of the component on the basis of both the stimulus pattern and the current internal state of the component. This output pattern is used by the simulator, along with other information, to prepare stimulus patterns for subsequent evaluations of the same and other components within the circuit. Methods of simulating electronic circuits using software simulation models of components are well known in the prior art.

The simulator may also access the HMS to evaluate the logical and timing behavior of an HME in response to simulated events on the inputs of a device instance modeled by the HME. Each access proceeds generally as follows:

The simulator first generates a stimulus pattern for the HME in generally the same manner as such a pattern is generated for a software simulation model. This stimulus pattern is encoded and transmitted to the HMS over a network. The HMS receives and decodes the stimulus pattern, stores the decoded pattern at the end of a "history sequence" of patterns in pattern memory, generally, as a single bit per pin of the HME, and presents the history sequence to the HME via the HMS pin electronics. The history sequence is appropriate to cause the HMS pin electronics to drive the input and I/O pins of the HME in such a way as to mimic the electrical behavior of the circuitry connected to the corresponding component in the circuit being simulated. Therefore, the physical HME behaves as if it were operating within the electronic circuit being simulated. After presentation of the history sequence, the pin electronics electronically samples the output and I/O signals from the HME. The HMS converts the sampled output and I/O signal values into a corresponding output pattern, which is encoded and returned via the network to the simulator. This output pattern is used by the simulator for further simulation in generally the same manner as an output pattern produced by a software simulation model.

The HMS hardware has two sections: control and modeler. The control section includes a central processing unit ("CPU") which runs the supporting software programs that perform all modeler functions and communicates with the simulators of the host computers. The CPU has local main memory. The modeler section contains special-purpose hardware to store pattern sequences, to present patterns to the HME, to sense its outputs, and to provide the outputs to the CPU. The modeler section includes a Pattern Bus, Timing Generator ("TG"), Pattern Controllers ("PACs"), Fast Pattern Memories ("PAMs"), Pin Electronics Modules ("PELs"), and Device Adapter Boards ("DABs") to which the HMEs connect.

The HMS can be independently configured in three dimensions: HME pin count, depth of pattern memory, and number of HMEs. The Pattern Bus (also referred to as the HMS "backplane") preferably includes four lanes. In the preferred embodiment, each lane supports HMEs with up to 80 pins. The TG, PACs, and PELs connect directly to the lanes. The CPU connects to the lanes through the TG. Each lane has its own pattern-presentation hardware that includes a PAC, preferably having from one to four PAMs connected to it. Each lane also has one to eight PELs connected to it. Each PEL can drive and sense up to 80 HME pins. Novel circuitry of the PAC, PAM, and PEL, and an associated method of use, allow the pattern memory in the PAMs connected to the PAC to be dynamically shared between pattern sequences for all HMEs in a lane of the PAC.

DABs of various sizes, but generally similar design and construction, connect to from one to four PELs in adjacent lanes. HMEs having from 241 to 320 pins can be mounted on a DAB connecting to four adjacent PELs, HMEs having from 161 to 240 pins can be mounted on a DAB connecting to three adjacent PELs, HMEs having from 81 to 160 pins can be mounted on a DAB connecting to two adjacent PELs, and HMEs of 80 pins or less can be mounted on a DAB connecting to a single PEL. DABs of various sizes can be freely mixed in the HMS by connectiong PELs at the appropriate sites at the backplane. For example, four 320-pin DABs can be mounted simultaneously with four 160-pin DABs and eight 80-pin DABs.

The TG, which connects to, and is controlled by, the CPU, is the main timing source for the HMS. The TG generates adjustable precision high-speed clocks and adjustable precision reference timing signals for timing the presentation of stimulus on individual HME pin drivers on a pin-by-pin basis and for timing the simultaneous sampling of HME outputs. The TG also synchronizes the Pattern Bus, checks for errors on the Pattern Bus, and provides a means for the CPU to access the Pattern Bus.

The Pattern Bus preferably is a high-speed controlled-impedance terminated bus supporting presentation of patterns for a 320-pin HME at up to 25 million ("25 M") patterns per second. The pattern bus operates in two modes: "access" and "presentation." In the access mode, the Pattern Bus provides the CPU with read/write access to all PACs, PAMs, PELs, and DABs in the HMS. In the presentation mode, the PACs drive pre-stored patterns from the Pattern Bus and present corresponding stimulus to the pins of an HME being used as a simulation model. PELs in adjacent lanes which are connected to a single DAB can simultaneously receive patterns in each lane. These patterns are presented by separate PACs in the separate lanes, which are synchronized by the TG. The HMS is thus able to present patterns to an HME having up to 320 pins and connected to up to four PELs at the same high pattern-presentation rate as for an HME having only 80 pins and connected to only one PEL.

The PAC and connected PAM are initialized by the CPU in access mode. The PAC contains the logic for accessing patterns in the PAMs mounted on it, error-checking the patterns, and delivering the patterns to PELs within its lane via the pattern bus. The PAMs connected to a single PAC can be used for storing a single pattern sequence to be presented to a single HME or for storing multiple pattern sequences to be presented to multiple HMEs. Pattern sequences consist of lists of pattern blocks linked by addresses stored in a link table memory on the PAC. The links can span multiple PAMs connected to a single PAC. Pattern blocks are dynamically allocated, released, and managed by the CPU, using linked-list management methods.

The PAM is organized as 102-bit words, each containing 80 pattern bits, eleven control bits, five spare bits, and six parity bits. Among other functions, the control bits select a target PEL within the lane, specify the function to be performed by the PEL, mark the last pattern in the pattern sequence, and specify a condition for branching to the link address for the pattern block. The PAM memory consists of two interleaved sets of video dynamic RAMs ("VRAMs"). To allow high-speed pattern presentation, alternate patterns are fetched from alternate sets. An entire sequence of linked pattern blocks filling all the PAMs on a PAC can be presented to the Pattern Bus at 25M patterns per second without pauses. Novel PAC and PAM circuitry and an associated method of use, allows the internal VRAM shift registers to be used to continuously repeat a pattern sub-sequence to an HME while the HMS waits for a feedback condition to occur.

The PEL preferably includes control circuitry and five identical custom integrated circuits ("CICs"). A single PEL can support an HME having up to 80 pins. The PEL has programmable reference voltage generators and an electrical interface to the HME which allows it to support HMEs of any of a variety of logic families. Using precision timing signals from the TG, the PEL formats clocks and data, on a per-pin basis, to be presented to the HME. The PEL samples all of the HME pins and returns the sampled values for access by the CPU.

Novel circuitry and an associated method of use allow the HMS to accurately determine HME output delays. To determine HME output delays, the HMS repeatedly presents a fixed pattern sequence to the HME, each time sampling all HME outputs at a variable sampling time relative to the presentation time of the final pattern in the sequence. The HMS thus searches for the transition time of each HME output. A novel parallel binary search method reduces the number of repetitions required to determine all output transition times.

The five CICs on the PEL provide a means for driving and sensing the HME pins, and for checking for errors in the patterns received from the PAM via the PAC, Pattern Bus, and PEL. Each CIC preferably supports up to sixteen bi-directional HME pins. Functions of the CIC circuitry for driving and sensing HME pins (CIC "channels") are software programmable on a per-pin basis. Programming of each channel occurs serially using the Pattern Bus.

Novel analog and digital circuitry within the CIC and an associated method of use allow all pins of the HME, including I/O and control pins, to be accurately sampled while being simultaneously stimulated. This circuitry and method of use avoids any interference between the stimulus and the measurement by driving each I/O pin of the HME toward the target logic level of the simulated external circuitry using a current-limited soft driver in the CIC which can be overdriven to either logic level by the HME pin. At the same time that the CIC soft-drives the HME pin, the CIC compares the resulting voltage of the HME pin with four programmable reference voltages to determine whether the HME pin is driving toward the same logic level, the other logic level, is not driving, or is at an intermediate voltage level. Each channel of the CIC has the capability of distinguishing and retaining, for later CPU access, five states of each connected HME pin: driving low ("H0"), driving high ("H1"), non-driving low ("Z0"), non-driving high ("Z1") and unknown ("U"). In particular, the CIC channel has the capability to distinguish H0 from Z0 and H1 from Z1. Software-programmable reference voltages and software-programmable soft-drive current limits allow the CIC to properly stimulate and accurately sample HME devices of multiple logic families, including TTL, NMOS, CMOS, and low-voltage CMOS.

The DAB is the fixture for connecting the HME to be modeled to the PEL. The DAB has circuitry that allows the DAB, with the attached HME, to be connected to, and disconnected from, the HMS while the HMS is powered. Novel circuitry and an associated method of operation allow the HMS to automatically detect the presence and type of each DAB, and to track the DAB configuration as it changes. Novel connection means included on the DAB allows a single DAB type to support devices with multiple different package styles, sizes, and types.

The HMS software consists of the core modeler code ("CMC") and the host resident code ("HRC"). Because of the novel structure of the CMC and HRC, the HMS can be quickly and easily integrated with multiple different simulators which run on multiple different workstation types.

The software that executes on the host computer includes the Simulator Function Interface ("SFI") and utilities. The SFI consists of a library of routines which are linked with a target simulator and provide access to the HMS. All communications between the simulator and the HMS is through the SFI. The utilities consist of a library of routines which provide HMS administration, remote hardware diagnostics, and test-vector support. The SFI and utilities are simulator independent and are written in a standard programming language ("C"). The SFI and utilities can be integrated with various simulators running on various workstation types without detailed knowledge of the CMC.

The CMC includes the complex HMS control software, including a real-time operating system, a network support module, a Simulator Function Interface command processor, a shell-software compiler, and a modeler handler. The CMC is simulator, and platform, independent.

In operation, the HMS provides a means for presenting stimulus events originating within the simulator to an HME serving as a simulation model, and for returning the correct results to the stimulator.

Evaluation of a HME in response to a simulated event on an HME input proceeds as follows:

1. The HMS resets the HME to a known initial state using an "initialization sequence" specified in the shell software;

2. the HMS forces the HME to the internal state that the simulated device instance had prior to the current event;

3. the HMS presents the new event(s) on the appropriate HME pin(s);

4. after the HME outputs and I/Os have settled, the HMS samples all outputs and I/Os of the HME; and 5. the HMS returns any output changes to the simulator, with appropriate scheduling delays attached.

The scheduling delay for each output change is either inferred from a table of input-to-output delays in the shell software, or is directly measured by the HMS.

In general, forcing the state of the HME involves presenting a "history sequence" of patterns to the HME. The history sequence represents all events which have been presented by the simulator to the HME since the beginning of the simulation sequence. The HMS of the present invention uses novel pattern storage and presentation circuitry and method of use to represent the history sequence, generally using a single bit per pin in each pattern. The HMS of the present invention thus reduces the cost of required pattern memory and the cost of supporting pattern-transmission circuitry.

In general, for patterns in which a given HME I/O pin is not driving (as determined by previous measurement), the single pattern bit for the HME pin causes the CIC to drive the HME pin in the same direction that the simulated external circuitry is driving, and for patterns in which the HME pin itself is driving, the single bit causes the CIC to drive the HME pin in the same direction as the HME pin is driving. Patterns in which HME I/O pins switch direction are represented and stored as two sequential patterns: the first enables or disables the CIC pin driver, as appropriate, and the second contains the logic level for the CIC to drive toward. The HMS drives HME I/O pins using the current-limited "medium driver" of the CIC. The current limit of the medium driver avoids excessive current levels when the CIC and HME drivers temporarily fight during switching. The HMS drives HME input pins using hard drivers, and drives HME output pins using soft drivers.

An object of the present invention is to provide an HMS and methods of use that will allow modeling and verification of standard off-the-shelf ICs, ASICs, and PC boards, including both functionality and timing for those devices.

Another object of the present invention is to provide an HMS and method of use that incorporates simulator-independent architecture with a standard, high-level interface.

Another object of the present invention is to provide an HMS and method of use that can be networked and concurrently accessed by multiple simulators of different types, running on multiple workstations or host computers of different types.

Another object of the present invention is to provide an HMS and method of use which provides shorter round-trip access times and provides higher pattern-presentation rates for very long pattern sequences.

Another object of the present invention is to provide an HMS that is more reliable than prior-art systems and that can be manufactured at lower cost for equivalent functionality.

Another object of the present invention is to provide an HMS and method of use that correctly determines the states of HME I/O pins independent of the manner in which the I/O pins are connected inside the HME.

Another object of the present invention is to provide an HMS and method of use which requires a smaller number of physical pattern memory bits to store the history sequences for HMEs.

Another object of the present invention is to provide an HMS which is independently and easily configurable in the dimensions of HME pins count, pattern-memory depth, and number of HME devices simultaneously mounted.

Another object of the present invention is to provide an HMS and method of use that supports HMEs of multiple logic families.

Another object of the present invention is to provide an HMS which is capable of more conveniently and economically supporting HMEs with very high pin counts.

Another object of the present invention is to provide an HMS and method of use that supports direct measurement of output delays for use in simulation and verification of prototype ASICs.

Another object of the present invention is to provide an HMS and method of use that will allow any member of a family of different HME package sizes and types to be fixtured using a single standard fixture.

Another object of the present invention is to provide an HMS and method of use that will allow HMEs to be fixtured without extensive custom wiring, special initialization circuitry, or complex software shells.

Another object of the present invention is to provide an HMS and method of use that permits an HME to be connected to, or disconnected from the HMS while the HMS is powered.

Another object of the present invention is to provide an HMS and method of use that will allow the collection, in a simulator-independent manner, of test vectors for an HME being used in a simulation.

Another object of the present invention is to provide an HMS and method of use that will allow the functional verification of HME operation relative to a set of test vectors in a simulator-independent manner.

These and other objects of the present invention will be described more fully in the remainder of the specification.

BRIEF DESCRIPTION OF THE DRAWINGS

FIG. 3 shows the categories of functions supported by the Simulator Function Interface of the present invention.

FIG. 41 is a schematic drawing of the Soft-Drive Output Enable Formatter of the Formatter/Driver circuitry of FIG. 36.

FIGS. 52A–52F shows representative HME footprints to accommodate attachment of Pin Grid Array IC packages to the DAB of FIG. 51.

DETAILED DESCRIPTION OF A PREFERRED EMBODIMENT

The present invention is an improved HMS and method of use which may be embodied as a stand-alone system for connection to one or a variety of host computers, called workstations, that are used to design digital electronic systems.

Figure 1:
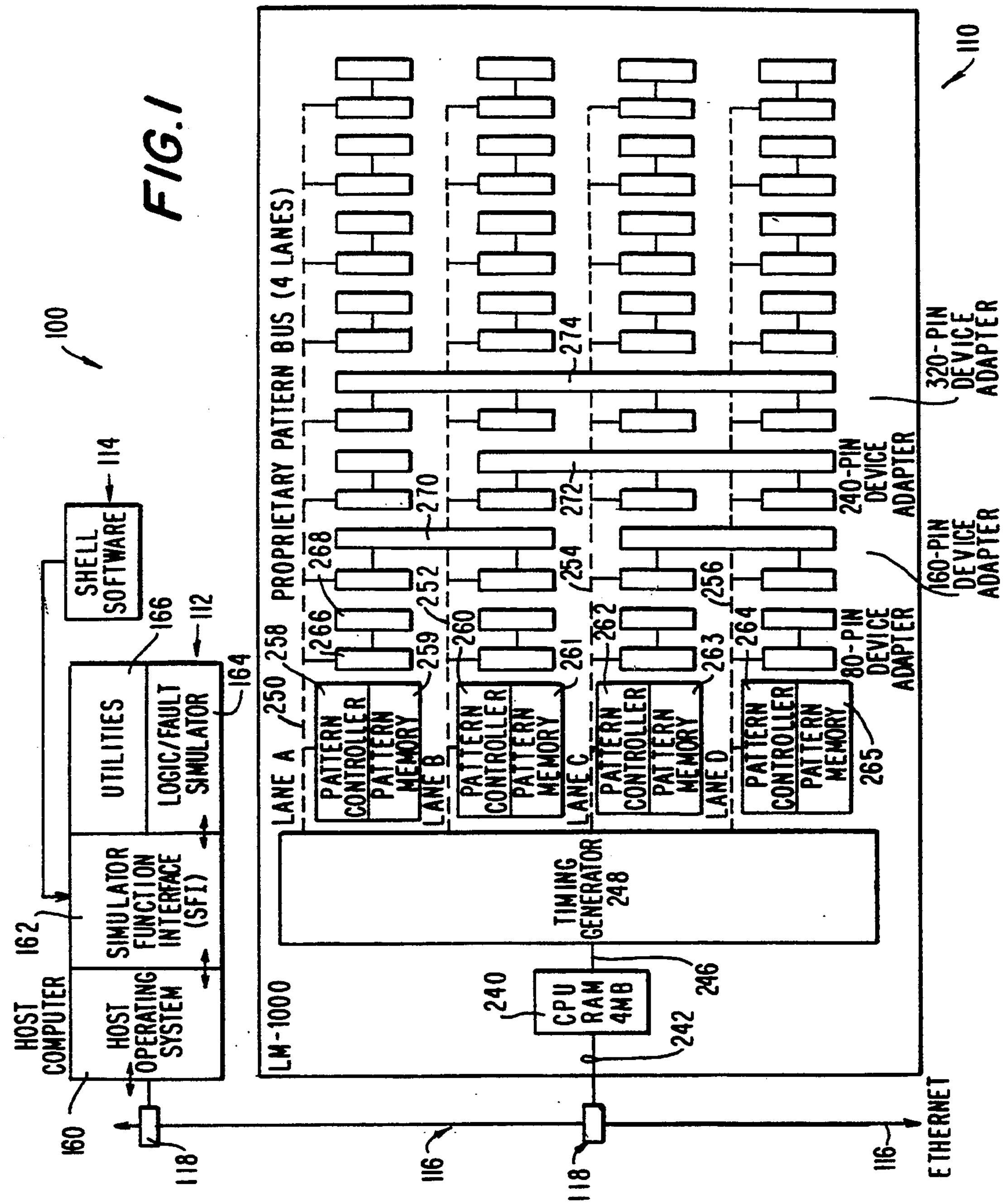
FIG. 1 is a schematic drawing of the preferred embodiment of the HMS of the present invention.

FIG. 1 shows the HMS of the present invention generally at 100. The HMS includes the section associated with the host computer, shown generally at 112, and the stand-alone section, shown generally at 110. The host computer and the stand-alone section of the HMS are preferably connected by an Ethernet® (IEEE 802.3), which is shown at 116. Ethernet® is a registered trademark of Xerox Corporation. Preferably, the Ethernet® hardware and software systems manufactured by Sun Microsystems are used. The Ethernet® protocols that are preferably used are the TCP/IP and UDP/IP protocols. The use of Ethernet® allows networking of a number of HMSs and host computers.

After a brief overview of the HMS of the present invention, the section associated with the host computer will be discussed in detail, then the stand-alone section will be discussed in detail.

Figure 2:
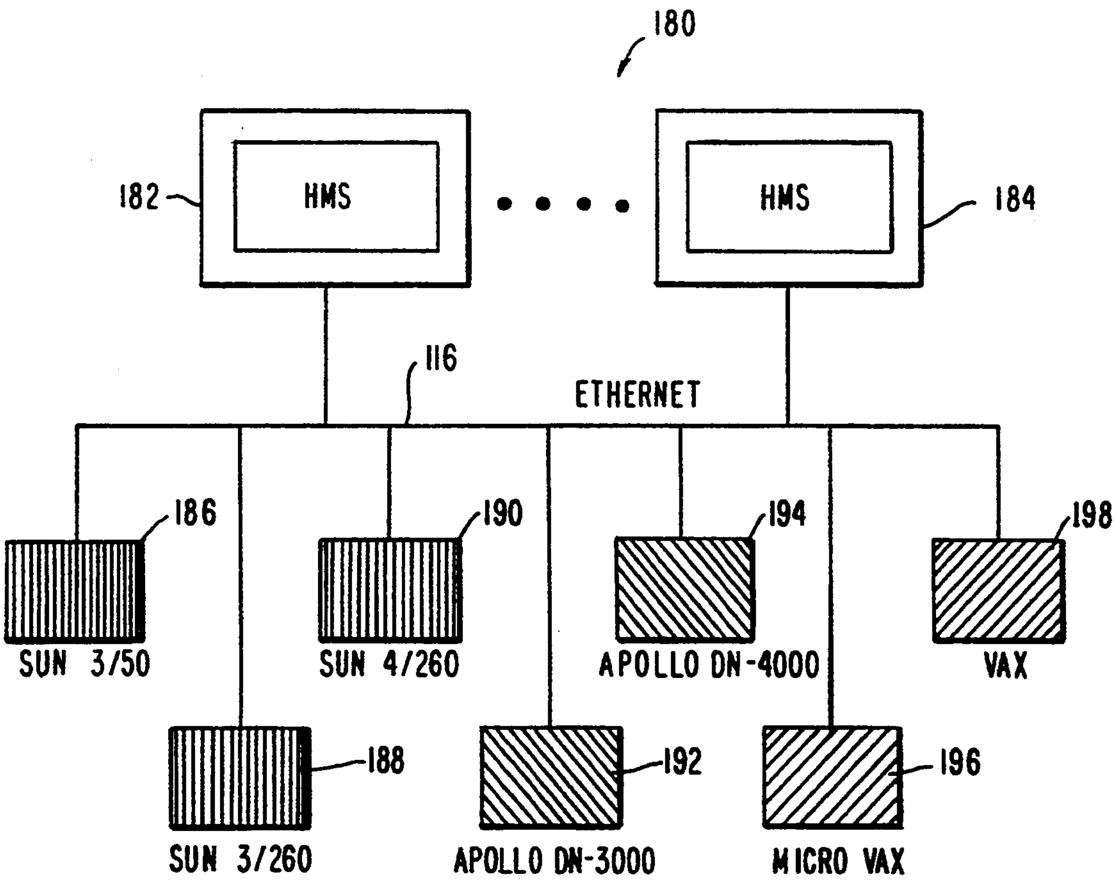
FIG. 2 is a block diagram of a network of workstations and the HMSs of the present invention.
Figure 4:
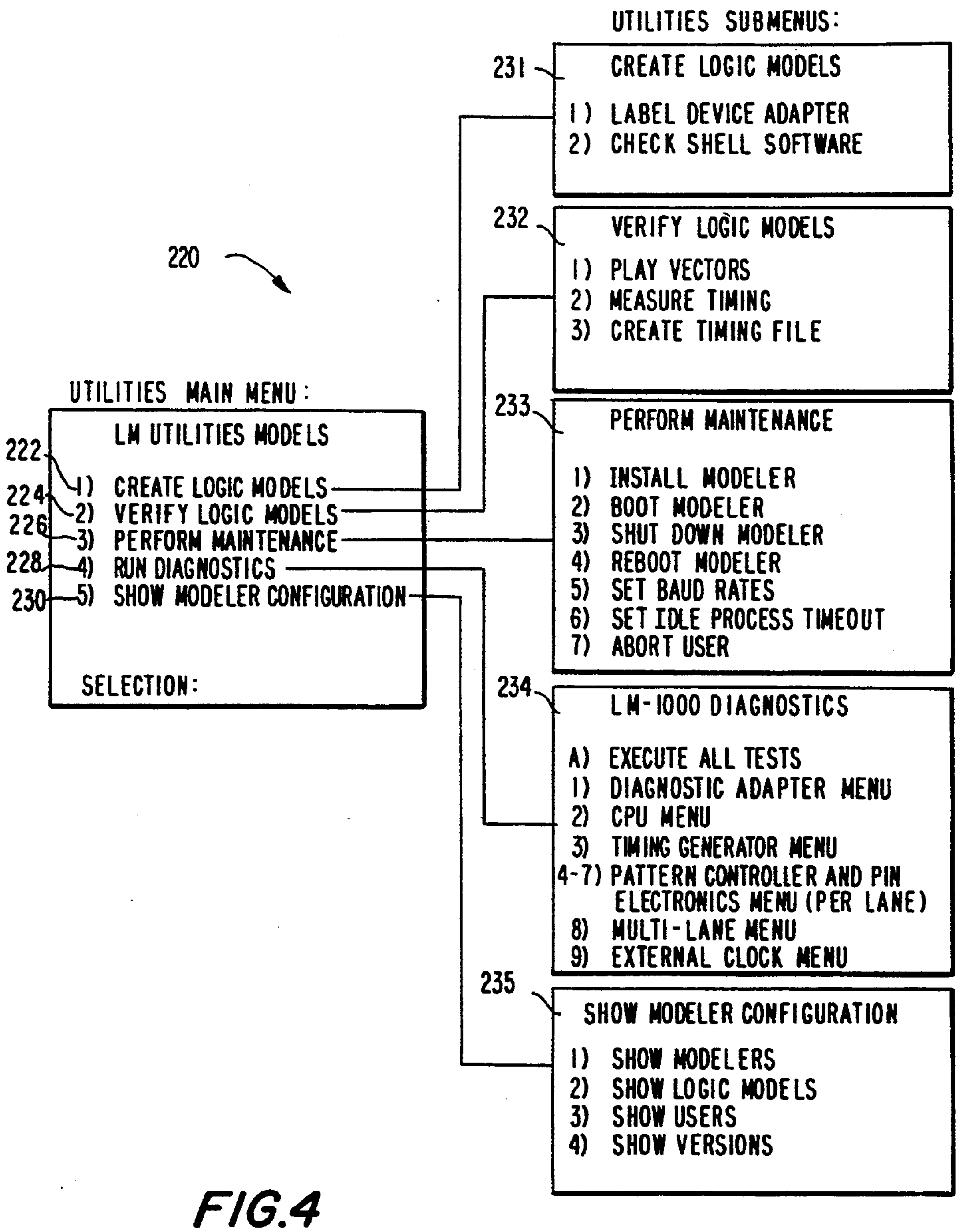
FIG. 4 is a block diagram of the Utilities.

The HMS 100 can be dedicated to a particular host computer, or it can be part of a network as shown in FIG. 2. The network generally shown at 180 includes HMSs, HMS1 to HMSN, and representative network workstations 186, 188, 190, 192, 194, 196, and 198. In network 180, the HMSs support multiple simulations on the several different workstations. Different simulator programs can run on the different workstations and can all concurrently access any HME on any of the HMSs.

The host computers shown in FIG. 2 are conventional workstations. They are representative host computers to which the HMS of the present invention may be connected. These host computers are the Sun-3 TM and Sun-4 TM manufactured by Sun Microsystems; Apollo® DN-3000, Apollo® DN-4000, and Apollo® DN-10000 manufactured by Apollo Computer; 80286-based and 80386-based personal computers manufactured by Compaq and IBM; and DEC VAX TM computers manufactured by Digital Equipment Corporation. Sun-3 TM and Sun-4 TM are trademarks of Sun Microsystems, Inc.; Apollo® is a registered trademark of Apollo Computer, Inc.; and DEC VAX TM is a trademark of Digital Equipment Corporation.

Again referring to FIG. 1, the depiction at 112 represents the host computer and the novel host resident software and shell software, which are part of the HMS of the present invention. Host operating system 160 and logic/fault simulator 164 are part of the conventional host computer and are not part of the present invention.

A listing of all the HMS software, including the CMC software, is attached as Appendix III. This listing of HMS software is written in the "C" programming language, as supported by the Sun-3 TM workstation manufactured by Sun Microsystems. The software listing is divided into major sections: "lm," "include," "sfi," "networkh," "networkm," "networkc," "shellswh," "shellswm," "shellswc," "diags," "bsp.diags," "tasks.-diags," "lm1000," "bsp.lm1000," "tasks.lm1000," "os," and "misc." The name of the major section is shown at the top of each listing page in the box labeled "SOURCE PROGRAM." The "SOURCE PROGRAM" box also shows the name of the routine listing on the page, following the major section name. Where appropriate, the specification will refer to specific portions of supporting software.

In order to better understand the HMS software, each of the major software sections will be briefly described. The "lm" section contains the primary source code for the utilities. This code relies on the "sfi" section for low level routines. The "include" section contains the source code for all "C" language include files that are shared by more than one section of code. The "sfi" section contains the source code for communication between the simulator and the HMS. The "networkh" section contains the source code that implements the host side of the Ethernet ®/UDP/IP support. The "networkm" section contains the source code that implements the upper levels of the modeler side of the Ethernet ®/UDP/IP support. The lower levels of the network support are part of the VRTX ® operating system. VRTX ® is a registered trademark of Ready Systems. The "networkc" section contains the source code for routines that are common to both the host and HMS sides of the network support. The "shellswh" section contains the source code for the small amount of shell software processing that is performed on the host. The "shellswm" section contains the source code for the shell software processing that is performed on the HMS: all scanning, parsing, constraining, and back-end code generation of the shell software is performed by this code. The "shellswc" section contains the source code for routines that are common to both the host and HMS sides of the shell software processing. The "diags" section contains the source code implementing the HMS diagnostics. The "bsp.diags" section contains low-level source code that supports interrupts, timers, UARTS, etc., during execution of the diagnostics on the HMS. The "tasks.diags" section contains the source code that implements the VRTX ® tasking model used during execution of the diagnostics; for example, there is a housekeeping task that executes as the lowest priority, performing various watchdog and clean-up activities as needed, there are receive and transmit tasks that handle modem and console port communications. The "lm1000" section contains the source code that implements pattern management, HME evaluation, and other basic HMS functionality. The "bsp.lm1000" section contains the source code that supports interrupts, timers, UARTS, etc., during the execution of the CMC. The "tasks.lm1000" section contains the source code that implements the VRTX ® tasking model used during execution of the CMC. The "os" section contains the source code that implements the VRTX ® support, including low-level network control and control of all CPU on-board resources. The "misc" section contains the source code implementing miscellaneous functions common to both the host and HMS code.

The host resident software includes SFI 162 and utilities 166. Shell software 114 is not part of the host resident software. SFI 162 is a library of routines which are linked with logic/fault simulator 164 and provide the simulator access to the section of the HMS shown at 100. The SFI consists of the routines and definitions in the major software listing sections "sfi," "include," "networkh," "networkc," "shellswh," "shellswc," and "misc." The SFI integrates eighteen HMS functions into simulator code, giving the simulator the ability to create HME definitions, instances, and faults on the HMS. The SFI also enables the simulator to map the simulator pin names to HMS pin names and map simulator logic/strength values to and from values supported by the HMS. The SFI permits input and I/O pin values from the simulator to be presented to the HME, and permits the sensed logic/strength value of an output pin or I/O pin transition to be returned to the simulator, with the minimum/typical/maximun delay values.

Preferably, SFI 162 is written in the "C" programming language as supported by the Sun-3 TM workstation manufactured by Sun Microsystems. If the simulator is written in a language other than "C," the simulator and HMS may be linked by routines that bridge the simulator language to "C." This feature, coupled with other features, renders the SFI independent of the simulator and host computer.

The SFI routines are divided into several categories on the basis of their use. These categories are shown in FIG. 3 generally at 200. The functions of Begin/End category 202 are used to begin an HMS modeling session and to end the session. The lm_begin_modeling_session function is used at the beginning of a simulation to allocate all host data structures, to initialize the communications link, and to allocate and initialize all HMS resources. The lm_end_modeling_session procedure is used to terminate the session and release all host and HMS resources. Each of these functions is called once per simulation.

The functions in Create category 204 are used to create device definitions (lm_create_definition), instances of these defined devices (lm_create_instance), and instances of the defined devices in faulty circuits (lm_create_fault). These three create functions generate a tree structure with the device definition as the root, device instances at the next level, and faulty circuit device instances (faults) at the leaf level. The fault creation functions are normally only used for fault simulators.

The functions in Release category 206 include the functions lm_release_definition, lm_release_instance, and lm_release_fault. These three functions are the complements of the three create functions, and are used to release (free) the resources associated with their respective entities.

The functions in Set category 208 establish settable parameters, mappings, and values. The function lm_set_simulation tick defines the simulator's minimum time unit, and the function lm_set_simulation_time establishes the current simulation duration (in simulation ticks). Following a call to the function, lm_set_simulation_time establishes the current simulation duration (in simulation ticks). Following a call to the function lm_set_simulation_tick, all time information communicated to or from the simulator is in the defined time units. The function lm_l set_pin_map creates a 1-to-1 mapping from simulator pin identifiers to HMS pin names defined in the shell software. The function lm_set_logic_level_map creates a mapping from simulator logic/strength values to those supported by the HMS. This mapping allows the simulator to use any desired internal representation to communicate with the HMS. The function lm_set_pin_value then allows the simulator to establish the logic/strength values for both input and I/O pins using the predefined logic level map. Only signal transitions need be communicated to the HMS, increasing performance and reducing network traffic.

Get category 210 contains only the function lm_get_pin_value. This function is used to retrieve the logic/strength value of an output (or I/O) pin, and the minimum, maximum, and typical delay values for the transition. Only outputs that transition are returned from the HMS.

Save/Restore category 212 contains two functions. The function lm_save_modeler_state saves the current state of the modeling session to a file, and the function lm_restore_modeler_state restores that state. This pair of functions may be used to allow suspension of a simulation for later resumption. The simulation state is stored as a file which is host and HMS-independent; any HMS which contains the necessary resources may be used for restoring. Thus, a save can be done on one HMS and the state can be restored on a different HMS.

The functions in Inquire category 214 provide a general mechanism for checking the status of the HMS parameters. These parameters include the total pattern memory, total system memory, available pattern memory, number of users, number of lanes and slots, number of HMEs, number of PELs, number of active instances, number of active faults, type and version number of each system component, available devices and their locations in the system, types of HMEs in the system and their DAB IDs, memory usage in each lane, memory usage of each instance, and memory usage of each user.

The functions in Miscellaneous category 216 perform the following operations: selecting a particular HMS for inquires, turning timing measurement on and off, extracting shell software created by the Create category, setting the HMS to repeat a specific pattern history in an infinite loop to allow observation of the HME using external test equipment, and conducting maintenance and diagnostics.

Utilities 166 is a library of routines which are installed on the host workstation and provide menu-driven simulator-independent utility programs designed to help create and verify models, perform maintenance on the HMS, and perform diagnostics. Utilities 166 consists of the routines and definitions in the major software listing sections "lm," "sfi," "include," "networkh," "networkc," "shellswh," "shellswc," and "misc." The Utilities have five main categories, each of which has a submenu. The five main categories are Create Logic Models category 222, Verify Logic Models category 224, Perform Maintenance category 226, Run Diagnostics category 228, and Show Modeler Configuration category 230.

Create Logic Models category 222 has the submenu shown at 231. The submenu includes Label Device Adapter and Check Shell Software. The Label Device Adapter labels the DAB. The label must match the label given in the Shell Software. The Check Shell Software utility performs a syntactic and semantic check on the specified shell software by sending the shell software to the HMS, where it is parsed and error checked.

Verify Logic Models category 224 has the submenu shown at 232. The submenu includes Play Vectors, Measure Timing, and Create Timing File. The Play Vectors utility presents test patterns in TSSI format, as supported by Test System Strategies, to the HME and compares the results with the expected results to verify the correct operation of the HME. Specifically, this utility creates an instance of the HME, plays patterns from a Test Vector file to the HME, and measures the states of the output and I/O pins of the HME after each pattern. It also stores the results in an output file. If there is a discrepancy, the instance number, pattern number within the file, and the pattern time are provided to the user.

The Measure Timing utility measures the actual physical output delays of the HME. This utility repeatedly presents inputs from the Test Vector input file to the HME, measures the resulting delays, and stores them in the Timing Measurement file.

The Create Timing File utility creates a single Timing file from one or more Timing Measurement files that were previously created with the Measure Timing utility. The Create Timing File utility reads all specified files, and for each delay, records the minimum and maximum values, and calculates the typical delay by averaging the minimum and maximum values. The resulting file lists each delay only once, and is appropriate for use as a shell software Timing file for the HMS.

Perform Maintenance category 226 has the submenu shown at 233. The submenu includes Install Modeler, Boot Modeler, Shut Down Modeler, Reboot Modeler, Set Baud Rates, Set Idle Process Timeout, and Abort User. The Install Modeler utility configures the HMS for booting. It collects and sends the boot information to the HMS, including down loading the CMC.

The Boot Modeler utility manually boots the HMS. In order to boot the HMS, the HMS must be shut down, and must wait for the CMC to be down loaded.

The Shut Down Modeler utility performs an orderly shutdown of the HMS. The HMS will remain shut down until it is booted with the Boot Modeler utility.

The Reboot Modeler utility performs an orderly shutdown of the HMS and immediately restarts the HMS.

The Set Baud Rates utility allows the user to set the baud rates of the two RS-232 HMS communication ports. The new baud rates are effective immediately after executing the utility.

The Set Idle Process Timeout utility establishes a timeout period on the HMS. When the timeout period is set, any process that has remained idle for the specified time period on the HMS will be checked by the host computer, and if the connected process no longer exists on the host computer, the modeling session is terminated and resources that had been allocated to the user on the HMS are made available to other users.

The Abort User utility allows the user to manually remove the HMS processes which are no longer active. Inactive processes are left on the HMS when the simulation session or utilities session terminates abnormally. Inactive processes may be holding resources on the HMS which are needed for other simulation sessions. The Abort User utility releases all HMS resources associated with a particular user.

Run Diagnostics category 228 has the submenu shown at 234. It includes Execute All Tests, Diagnostic Adapter Menu, CPU Menu, Timing Generator Menu, Pattern Controller and Pin Electronics Menu (per lane), Multi-Lane Menu, and External Clock Menu. The Run Diagnostics category allows the user to run HMS diagnostic programs from the host computer.

The Execute All Tests utility runs all of the diagnostic tests. As each test is completed, a status message is generated which is representative of the test that was performed and the outcome of the test.

The Diagnostic Adapter Tests utility performs tests on the PEL using a special diagnostic adapter which connects to the PEL in place of an HME. The diagnostic adapter plugs into a single PEL and allows all of the pin drivers and sensors of the PEL to be exercised using a signature analysis algorithm. The design of the diagnostic adapter is well within the capability of one skilled in the art. To fully verify the PELs, this utility should be run for each PEL. When this utility is used, the diagnostics search every configured lane in the HMS and perform the tests on every PEL that has a diagnostic adapter installed.

The CPU Menu, Timing Generator Menu, Pattern Controller Menu and Pin Electronics Menu (per lane), and Multi-Lane Menu contain the detailed diagnostic testing utilities for the specified component or circuitry.

The External Clock Menu utilities measure and verify the frequency of external clocks connected to the two external clock connections of the HMS. These tests are not run as part of the Execute All Tests utility because this utility requires additional hardware that may not always be connected to the HMS.

Show Modeler Configuration category 230 has the submenu shown at 235. This submenu includes the utilities Show Modelers, Show Logic Models, Show Users, and Show Versions. The Show Modelers utility lists the available HMSs on the network and describes their configuration. The configuration information may include a list of major hardware components, the amount of CPU memory being used, the number and location of PACs, PAMs, or PELs, the amount of pattern memory used or available per lane, the number of instances and faults being modeled per lane, a list of active users and their host machines, and the software version being used.

The Show Logic Models utility lists the HMEs currently available on a specified HMS, and provides information about each HME. This information may include its lane/slot location, the HME status, whether it is used as a public or private device, the number of active instances of the HME, the number of active faults, the type of DAB, and the DAB revision number and manufacturer.

The Show Users utility provides a brief summary of the status information about each current user. Such information may include the host name, the total number of public or private HMEs used, the total amount of pattern memory used and the total number of active instances and active faults created by the user.

The Show Versions utility provides the current revision levels of all installed HMS hardware and software.

Figure 5:
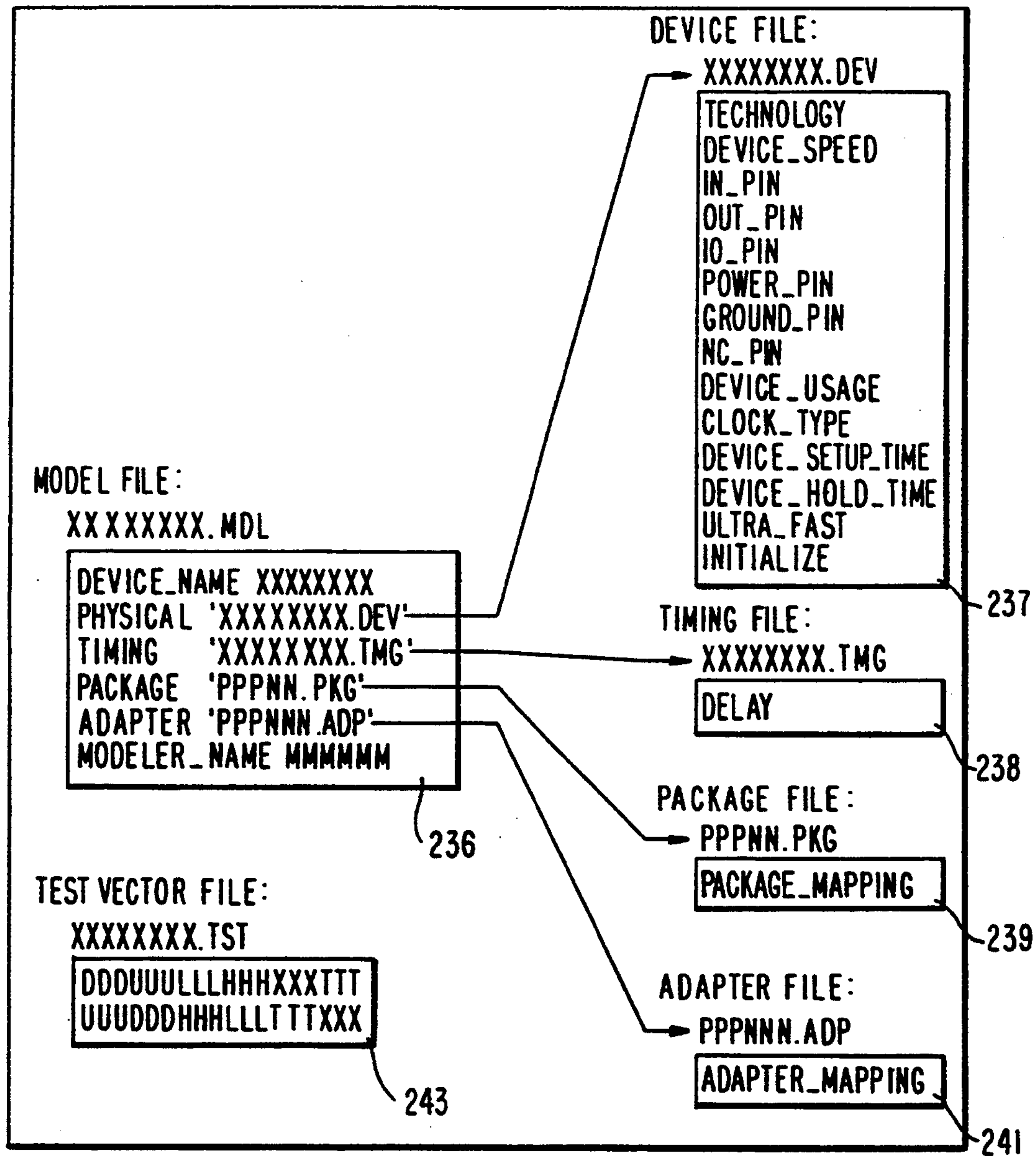
FIG. 5 is a block diagram of the Shell Software.

FIG. 5 shows the structure of shell software 114. By way of example, a listing of preferred shell software for an HME containing the MC68020 microprocessor manufactured by Motorola Semiconducter and a listing of preferred shell software for an HME containing the AM7990 Ethernet® controller IC manufactured by Advanced Micro Devices are provided in Appendices I and II, respectively. The shell software describes the HME to the HMS. The exact contents of the shell software varies depending upon the characteristics of the HME device. The following describes the features and capabilities of shell software in general.

All processing of the shell software is done on the HMS. The shell software consists of statements arranged in files that define the specific characteristics of the HME to be modeled, and the DAB to which it is attached. Table 1 lists representative statements, the file type, and a brief description of the shell software.

TABLE 1

| Statement | File | Description |
|---|---|---|
| device_name | Model | Associates the shell software with a particular HME. |
| technology | Device | Specifies the device technology process. |
| device_speed | Device | Specifies the device clock frequency range. |
| in_pin | Device | Defines the input pins and attributes. |
| out_pin | Device | Defines the output pins and attributes. |
| io_pin | Device | Defines the I/O pins and attributes. |
| power_pin | Device | Defines the power pin numbers. |
| ground_pin | Device | Defines the ground pin numbers. |
| nc_pin | Device | Defines the no-connect pin numbers. |
| package_mapping | Package | Defines the device package mapping. |
| adapter_mapping | Adapter | Defines the DAB mapping. |
| modeler_name | Model | Selects a specific HMS. |
| device_usage | Device | Enables and disables pattern history replay. |
| clock_type | Device | Selects the source of the pattern clock. |
| device_setup_time | Device | Specifies the worst case setup time of any HME pin. |
| device_hold_time | Device | Specifies the worst case hold time of any HME pin |
| initialize | Device | Defines the initialization pattern sequence. |
| delay | Timing | Lists the data sheet propagation delays. |

The shell software for an HME and DAB may be stored in a single file, except for the test vectors, which are stored in a separate file. However, the preferred file structure of shell software 114 is shown in FIG. 5. In FIG. 5, main Model file 236 serves as the header file for the shell software of the HME. The Model file contains the "device_name" statement, the "modeler_name" statement, and a list of shell software file directives which will be explained. The required "device_name" statement is used to associate the shell software with the physical DAB and HME. The character string "name" specified in the statement must exactly match the character string used to label the DAB as per the Label Device Adapter utility. If the two do not match, the HMS will not be able to locate the proper hardware for the shell software. The optional "modeler_name" statement is used to specify the name of the HMS to be used in case there are multiple HMSs on the network.

The four directives "physical," "timing," "package," and "adapter," provide a preferred method of structuring the shell software. The "physical" directive is used to include the information in the Device file 237 that describes the HME being modeled. The "timing" directive is used to include the information in Timing file 238 regarding model timing. The "package" directive is used to include the information in Package file 239 that describes the HME package. The "adapter" directive is used to include the information in Adapter File 241 that describes the DAB being used.

The statements of Device file 237 will now be described. The required "technology" statement describes the power supply and current levels appropriate for the fabrication technology of the HME, which could be, for example, NMOS, CMOS, LCMOS, or TTL. The current values defined with the "technology" statement apply to all pins of the HME, but may be overridden on a per-pin basis using the "out_pin" and "in_pin" statements.

The required "device_speed" statement specifies the allowable frequency or period of the pattern clock of the HME. The frequency that is specified is either a single maximum or a range. The specified period may also be either a single maximum or a range.

The six HME pin description statements are "in_pin," "out_pin," "io_pin," "power_pin," "ground_pin," and "nc_pin." All HME pins should be listed in the shell software as one of these pin types. Input and I/O pins have simulator data presented to them, while output and I/O pins are sampled to detect changes, which are then passed back to the simulator. Power, ground, and no-connect pins are not driven during simulation.

The "in_pin" statement maps the user-defined input pin name to the actual HME package pin number. The input pin attributes, which are part of the statement, specify which inputs can affect the state and the outputs of the HME. The attributes for "in_pin" are "eval," "store," "edge_rise," "edge_fall," and "keepalive." Changes on an "eval" pin may cause changes at the outputs of the HME, but do not cause changes in the internal state of the HME. Any rising or falling changes on a "store" pin may cause changes at the outputs of the HME and changes in the internal state of the HME. An "edge_rise" pin is a pin with respect to which only a rising edge on the pin may cause changes to the outputs and internal state of the HME. An "edge_fall" pin is a pin with respect to which only a falling edge on the pin may cause changes to the outputs and internal state of the HME. The "keepalive" attribute should be included to document which pin has the keepalive signal connected to it on the DAB. The "keepalive" attribute is used in addition to any of the other attributes.

The "out_pin" statement maps the user-defined output pin name to the actual HME package pin number. One output pin attribute is "feedback." If the HME pin is being used for feedback in an initialization sequence, then the "feedback" attribute must be specified. In this case, the HME pin must be connected to the feedback pad on the DAB, and the feedback sequence must be described in the "initialize" statement.

The "io_pin" statement maps the user defined I/O pin name to the actual HME package pin number. I/O pins share all of the attributes of input and output pins.

The "power_pin," "ground_pin," and "nc_pin" statements define the HME package pin numbers for the power, ground, and no-connect pins, respectively. These pins are not driven during simulation.

The optional "device_usage" statement is used to indicate whether the HME is public or private. A public HME is one to which a history sequence is presented in order to restore its internal state. A private HME retains its state internally between evaluations. A public HME can be shared between multiple simulations and between multiple device instances in a simulated design, whereas, a private HME can represent only a single device instance in a single simulation. Only static devices (devices with no minimum clock-rate specification) can be used in private HMEs. Either static or dynamic devices can be used in public HMEs.

The optional "clock-type" statement specifies the clock source for the HME. The clock may be the internal clock signal generated by the TG, or it may be an external clock.

The optional "device_setup_time" statement is for overriding the default setup time. The HMS will always present input and I/O transitions at least as much in advance of HME store, edge_rise, and edge_fall pin transitions as this parameter specifies, thus guaranteeing at least this amount of setup time.

The optional "device_hold_time" statement is for overriding the default hold time.

The optional "initialize" statement is used whenever a public device is evaluated, to put the device in the same fixed internal state prior to presenting the history sequence. This statement defines an initialization sequence that is applied to the HME for this purpose. This may be accomplished by an initialization sequence consisting of fixed patterns, or by feedback initialization, which consists of a pattern sequence that is repeatedly presented to the HME until a desired internal state is attained. The two types of sequences will be discussed in detail, subsequently.

Timing file 238 includes one statement, the "delay" statement. The HMS supports minimum/typical/maximum HME output delays by means of the shell software "delay" statement. When delay information about an output or I/O pin is provided in the Timing file, the value specified for the delay is returned to the simulator whenever that pin changes state during simulation.

Package file 239 and Adapter file 241 specify the mapping between the HME package pin numbers and the DAB net numbers which connect to the PEL. The "package_mapping" statement reflects the design of the HME device package; it translates HME device package pin numbers into DAB pin names. The "adapter_mapping" statement reflects the design of the DAB itself; it translates DAB pin names into DAB net numbers. Every DAB pin name in the master footprint area of the DAB maps to one DAB net number. Multiple DAB pin names may map to a single DAB net number.

Test Vector file 243 contains input stimuli and expected outputs for the HME in TSSI format, as supported by Test System Strategies. This file constitutes a functional test program for the HME.

Having discussed the section of the HMS associated with the host computer, stand-alone section 110 and its elements will now be discussed. Before describing the hardware elements of stand alone section 110, the software that executes on the CPU of the HMS will be described. This software is the CMC.

Figure 6:
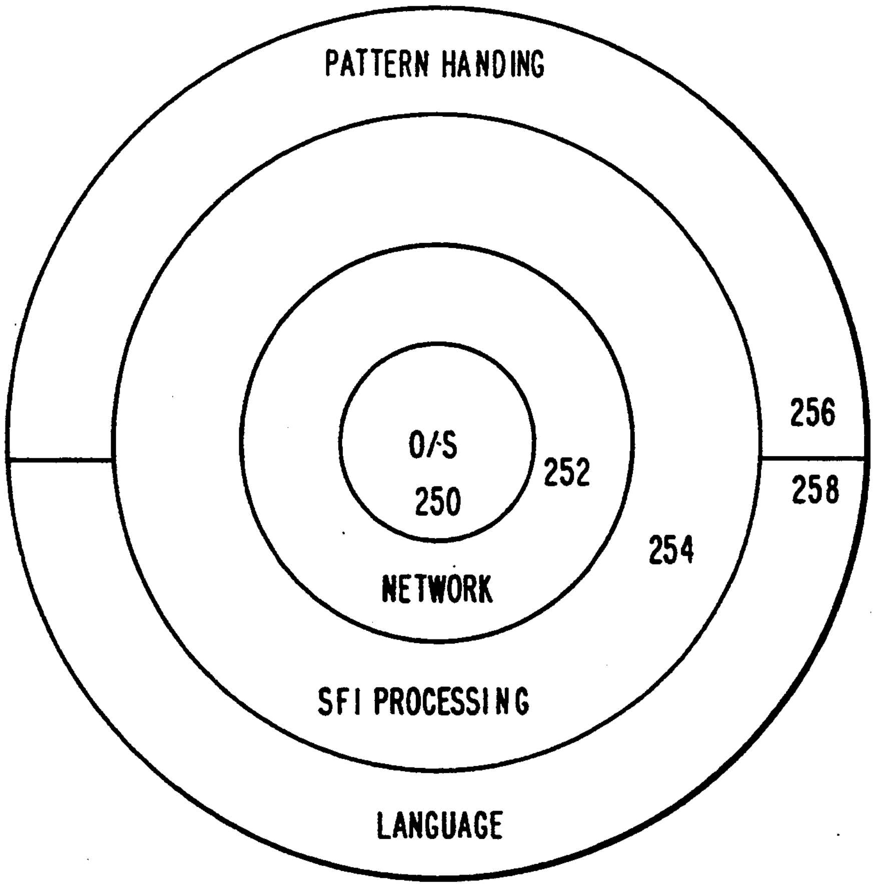
FIG. 6 is a block diagram of the Core Modeler Code.

Referring to FIG. 6, the CMC will be disclosed. The CMC includes diagnostics and run-time code that execute on CPU 240 of the HMS. The CMC diagnostics are used to verify the correct operation of the HMS hardware. They are downloaded to stand alone section 110 when the user runs diagnostics. The CMC diagnostics includes the routines and definitions in the major software listing sections "diags," "networkm," "networkc," "shellswm," "shellswc," "misc," "bsp.diags," and "tasks.diags." The CMC run-time code controls the normal operation of stand alone section 110. It manages pattern sequences in pattern memory, controls HME evaluations, manages the network, compiles shell software, and interfaces to the real-time operating system. The CMC run-time code includes the routines and definitions in the major software listing sections "lm1000," "networkm," "networkc," "shellswm," "shellswc," "misc," "bsp. lm1000," and "tasks.lm1000."

The CMC files preferably are ASCII files. These files are downloaded from the host computer over the Ethernet network to the HMS when the HMS is booted. The CMC includes the Ethernet® support software for the modeler, as well as the modeler control software. Most of the operations required to service simulator requests are performed by the CMC on the CPU.

The CMC software is stored on the host's mass storage system. After power-up or reset, the CMC diagnostics are downloaded to the CPU and executed. If the CMS diagnostics are executed successfully, the CMC run-time code is downloaded and executed. The CMC automatically determines the configuration of the PAMs, PELs, and the DABs. If a valid configuration is found, the CMC waits for requests from the host computer.

Referring now to FIG. 6, the execution of the CMC is supported by a real-time operating system 250. In the preferred embodiment it is the VRTX® system that is commercially available from Ready Systems. The VRTX® system manages the hardware resources of the CPU. Layered on top of the operating system is network support 252 for the Ethernet® connection protocols that are needed to communicate with the host system. The network layer creates a packetized byte stream between the host and the HMS. All communications between the host and the HMS are by this byte stream. The SFI command processing layer 254 on the HMS receives requests from the host computer and a byte stream provided by network layer 252. The SFI command processing layer processes host requests and generates replies which are passed back via the network to the requesting host.

SFI command processing calls upon two major subsections of the CMC to answer host requests. These are language processing and pattern handling subsections. Language processing module 258 parses and error checks the shell software and compiles a binary representation which is used by the HMS for the duration of the simulation. Pattern handling module 256 processes simulator requests for HME evaluation, and returns sampled HME pin changes and output delays to SFI layer 254 for delivery to the host via the network.

Multiple host and multiple user support preferably is provided by queuing multiple requests and then scheduling the CMC to handle each request on a first-come, first-serve basis.

Stand-alone section 110 forms the majority of the HMS of the present invention. For convenience, unless specified differently, a reference to 110 is a reference to the HMS generally.

Referring again to FIG. 1, the HMS at 110 will be described. The elements that are part of the stand-alone section 110 of HMS 100 and their interconnection will be first described in general, then each will be described in greater detail, and the supporting software will be described.

The HMS has two sections: control and modeler. The control section includes CPU 240. The modeler section includes TG 248, the Pattern Bus at 250, 252, 254, and 256, the PACs at 258, 260, 262, and 264, the PAMs at 259, 261, 263, and 265, the representative PEL 266, and the DABs 268, 270, 272, and 274.

CPU 240 is connected to Ethernet® 116 at node 118 by line 242. The CPU preferably has 4 Mbytes of memory. The CPU runs the CMC software and provides Ethernet® network support. TG 248 is connected to CPU 240. TG 248 generates precision timing edges and synchronizes the playing of patterns. CPU 240 accesses the remainder of the HMS through the TG. TG 248 is connected to the four lanes of the Pattern Bus at 250, 252, 254, and 256. The Pattern Bus is used to distribute data in both access and pattern-presentation modes of the HMS. In access mode, the lanes of the Pattern Bus are used to provide the CPU with access to the HMS components.

The HMS preferably has one to four PACs, which are shown at 258, 260, 262, and 264. Each PAC is connected to one of the Pattern Bus lanes. The PAC contains the logic for pattern sequencing. It delivers patterns from the PAMs onto the Pattern Bus for delivery to the PELs. Each PAC has at least one PAM connected to it. Up to four PAMs may be connected to each PAC. The maximum number of patterns stored in the PAMs attached to a single PAC is 2M (512K in each PAM).

PEL 266 is one of up to 32 PELs of the HMS. Each lane may have PELs connected to it. The PELs provide inputs and sense outputs of the HME. The PELs include custom ICs ("CICs") that are novel. The HME interfaces with the PEL via the DAB. DABs 268, 270, 272, and 274 connect to different PELs. The number of HME pins determines the number of PELs to which to the DAB must connect and, thereby, the DAB type. DAB 268 supports HMEs with up to 80 pins, DAB 270 supports up to 160 pins, DAB 272 supports up to 240 pins, and DAB 274 supports up to 320 pins.

Before describing the elements of the stand-alone section in detail, the following general statements regarding the HMS are provided to assist in understanding the operation of the elements of the stand-alone section, their interrelated operation, and the operation of the HMS generally.

The Pattern Bus, and therefore, the HMS, may be operated in one of two modes: "access" mode and "presentation" mode. The HMS operates in the access mode whenever the HME is not being evaluated. The evaluations take place during the presentation mode. During the access mode, the CPU may access the PAM, the pattern-block link table of the PAC, the PELs, and various control and status registers of the HMS. The CPU is capable of programming the various components of the HMS, performing error analysis, and reading and writing addresses. During the presentation mode, patterns are sent to the HME being modeled via the Pattern Bus.

During the presentation mode, an HME is evaluated as either a private or a public device. Private devices retain their internal state between evaluations and, therefore, do not have to have their state restored between such evaluations. Private devices can not be shared between device instances or users, because their internal state must be preserved for the next evaluation. Public devices can be shared between device instances or users because their states are restored before each evaluation.

Static devices may be modeled as either private or public devices. Dynamic devices, however, must be modeled as public devices.

CPU

CPU 240 preferably is a conventional microprocessor-based single-board computer based on the MC68020 microprocessor manufactured by Motorola Semiconductor. The detailed design of an equivalent CPU is well within the capability of one skilled in the art. CPU 240 executes all operational code, including boot, diagnostic, and HMS control functions. An on-board 128 KByte erasable programmable read only memory ("EPROM") contains the boot and diagnostic code. An on-board Ethernet® controller (preferably the AM7990 manufactured by Advanced Micro Devices) interfaces with the Ethernet®. The controller runs the lowest levels of network protocols, while the higher levels are run by the CPU. CPU 240 preferably accesses 4 MBytes of dynamic random access memory ("DRAM"). Approximately 1 MByte is used for programs, and approximately 3 MBytes are used for data. The CPU accesses the rest of the stand-alone section of the HMS through TG 248, during the access mode. The CPU control of the PACs, PAMs, and PELs during the access mode will be described in conjunction with the detailed description of each of those elements. CPU 240 directs the PACs to drive programmed pattern sequences over each of the Pattern Bus lanes to the PELs. The HMS supports 80 bits of pin data per lane at up to 25 MHz, therefore, the Pattern Bus throughput can reach a maximum of 8 billion pin-patterns/second during presentation mode.

Pattern Bus

The Pattern Bus at 250, 252, 254, and 256 is operated in the access and presentation modes. The PACs with their attached PAMs and the PELs with their attached DABs connect to the Pattern Bus. The CPU can cause the Pattern Bus to enter the presentation mode. When it does, the PACs drive pre-stored pattern sequences down each lane to the PELs. CPU 240, however, cannot access any of the elements connected to the Pattern Bus, except TG 248, during the presentation mode. TG 248 distributes a number of precision clocks and timing signals on the Pattern Bus. These are identically driven on all four lanes.

Timing Generator

An overall description of the TG and its operation will first be presented. The TG performs two main functions within the HMS. First, it provides a gateway for CPU communication to the PACs, PAMs, and PELs. Second, it controls the presentation of pattern sequences. The TG generates all system clocks and timing strobes as well as supervising the transition between backplane access and presentation modes. During presentation, the TG monitors the lanes involved for synchronization. If the lanes are out of synchronization, the presentation is aborted and an error is reported to the CPU.

The CPU communicates with the TG using a dedicated interface. The TG decodes each access from the CPU into TG, PAC, PAM, or PEL accesses. Accesses to the TG may occur at any time. Since accesses to the PACs, PAMs, and PELs are via the backplane, they can only take place when the backplane is in access mode.

The two modes of the backplane are referred to as access mode and presentation mode. In access mode, the TG repeats the CPU bus signals on the backplane, and vice-versa, allowing communication from the CPU through the TG to the PACs, PAMs and PELs. Access mode is the default mode and is entered upon power-up or after a system reset.

During presentation mode, PAM contents are clocked out of the PAMs, through the PACs, onto the backplane, and into the PELs and CICs. Using timing strobes generated by the TG, the PEL formats the patterns, as required, and presents them to the HME. During an evaluation of an HME, the backplane always starts in access mode, then transitions to presentation mode, then transitions back to access mode. A state machine on the TG controls these mode transitions. Any attempt by the CPU to access a PAC, PAM, or PEL while the backplane is in presentation mode results in a CPU "bus error."

The TG generates all of the system clocks used during pattern presentation. The system clocks preferably are derived from a phase-locked frequency synthesizer. The reference for this synthesizer is a precision quartz crystal oscillator of preferably 30 MHz.

The TG generates two types of timing strobes for use by the PEL. The first type, referred to as EDGES, is used by the PEL to format the pattern data before presenting to the HME. The EDGES are actually pulses preferably 8 ns wide. A total of six EDGES are generated by the TG. The second type of strobe, referred to as SAMPLE, is used by the PEL to measure the response of the HME to the last pattern in a pattern sequence (the "measurement pattern"). Each stimulus pattern presented to the HME has an associated group of EDGES. Each edge can be programmed to occur at a different time relative to the start of the pattern clock. A single SAMPLE strobe is generated at the end of each pattern sequence.

The TG contains two separate, but similar, ramp generators, one from which the EDGES are derived, and the other from which the SAMPLE strobe is derived. The ramp generators are created by charging a capacitor using a constant-current source and rapidly dumping the capacitor charge at appropriate intervals. The two constant current sources each have four selectable current levels, creating four slopes for each ramp. The ramp voltage thus increases at a software selectable but constant rate. By comparing the ramp waveform to a programmable reference voltage level, time delays can be generated that are proportional to the programmed voltage.

The EDGE ramp is synchronized to the system clock. The duration of the EDGE ramp can be selected to be from one to eight pattern clock cycles. This is the interval in which the six EDGES can be positioned under control of the CMC software running on the CPU. Ramp generation preferably is enabled by control bits from the PACs and PAMs which are driven on the backplane during presentation mode. When the proper code is present on these control bits, a ramp cycle is triggered. At the end of the programmed ramp duration, the ramp is automatically dumped.

Six separate comparators are connected to the EDGE ramp signal. Each comparator connects to an individually programmable reference voltage. Each comparator triggers a pulse generator when the EDGE ramp voltage crosses the reference voltage. In this way, six separate EDGES are generated from the same ramp waveform. The EDGE times are all relative to the trigger point of the EDGE ramp.

A separate comparator with a separate programmable reference voltage is connected to the SAMPLE ramp signal. When the SAMPLE ramp voltage crosses this reference voltage, it triggers the SAMPLE strobe rising edge. The falling-edge time of the SAMPLE strobe is programmable in units of pattern clock cycles. In this way, the rising edge of SAMPLE strobe is precisely adjustable. The rising edge preferably is used for two-state sampling of the HME pins by the CIC. The falling edge preferably is used for five-state sampling, and does not require precise positioning. It is important that the five-state measurement not be corrupted by noise. Therefore, during the SAMPLE strobe, the TG disables all system clocks, disables the feedback out signal, and instructs the PACs and PAMs to inhibit their memory refresh.

In normal five-state sampling, the HME pins are sampled at the end of a pattern sequence presentation. In this case, the two-state SAMPLE edge is simply ignored. In timing measurement, a pattern sequence is repeated many times, each time moving the two-state SAMPLE edge and determining whether or not the HME output pin has transitioned by that time. By noting the time at which the HME output pins transition and subtracting from it the time at which the causative HME input pin transitions, the actual HME output delays are determined. The same SAMPLE ramp slope is used to detect both the causative input pin transition and the output transition, in order to minimize error.

The reference voltages used for all of the ramp comparators are supplied by a programmable, precision DAC (digitial to analog converter). The placement resolution for the EDGES or SAMPLE is dependent upon the resolution available from the DAC and upon the slope of the ramp. Timing measurements are computed from knowledge of two threshold settings of the SAMPLE DAC: one corresponding to the causative input transition, and one corresponding to the resulting output transition.

The accuracy of the EDGE placements and the resulting timing measurements depend on the accuracy to which the ramp slopes are known. The TG contains dedicated hardware that, along with calibration routines in the CMC software, allows measurement of the exact ramp slopes and offsets for each EDGE and SAMPLE. The hardware is a single toggle flip-flop for each EDGE and SAMPLE. The "T" input of this flip-flop is driven from the pattern clock and the clock input is driven from the EDGE or SAMPLE. If the EDGE/-SAMPLE rising edge occurs while the system clock is high, the flip-flop toggles, and if it occurs while the system clock is low, the flip-flop does not toggle. After positioning a reference voltage at a particular setting, the time delay corresponding to that setting can be determined by changing the pattern clock period via the programmable phase-locked loop, and then determining whether or not the corresponding flip-flop toggles at that pattern clock period. By adjusting the pattern clock period and repeating the test, a pattern clock period can be found that corresponds to the unknown delay. Since the period of the pattern clock is known precisely, the ramp slope can be calibrated precisely by making two or more measurements.

During pattern presentation, the PAC outputs in the lanes participating in the presentation are compared for agreement of the control bits. If there is any disagreement, the TG latches the offending bits, stops the presentation, and interrupts the CPU.

Now that an overall description of the TG and its operation has been presented, the TG will be described in detail.

Figure 7:
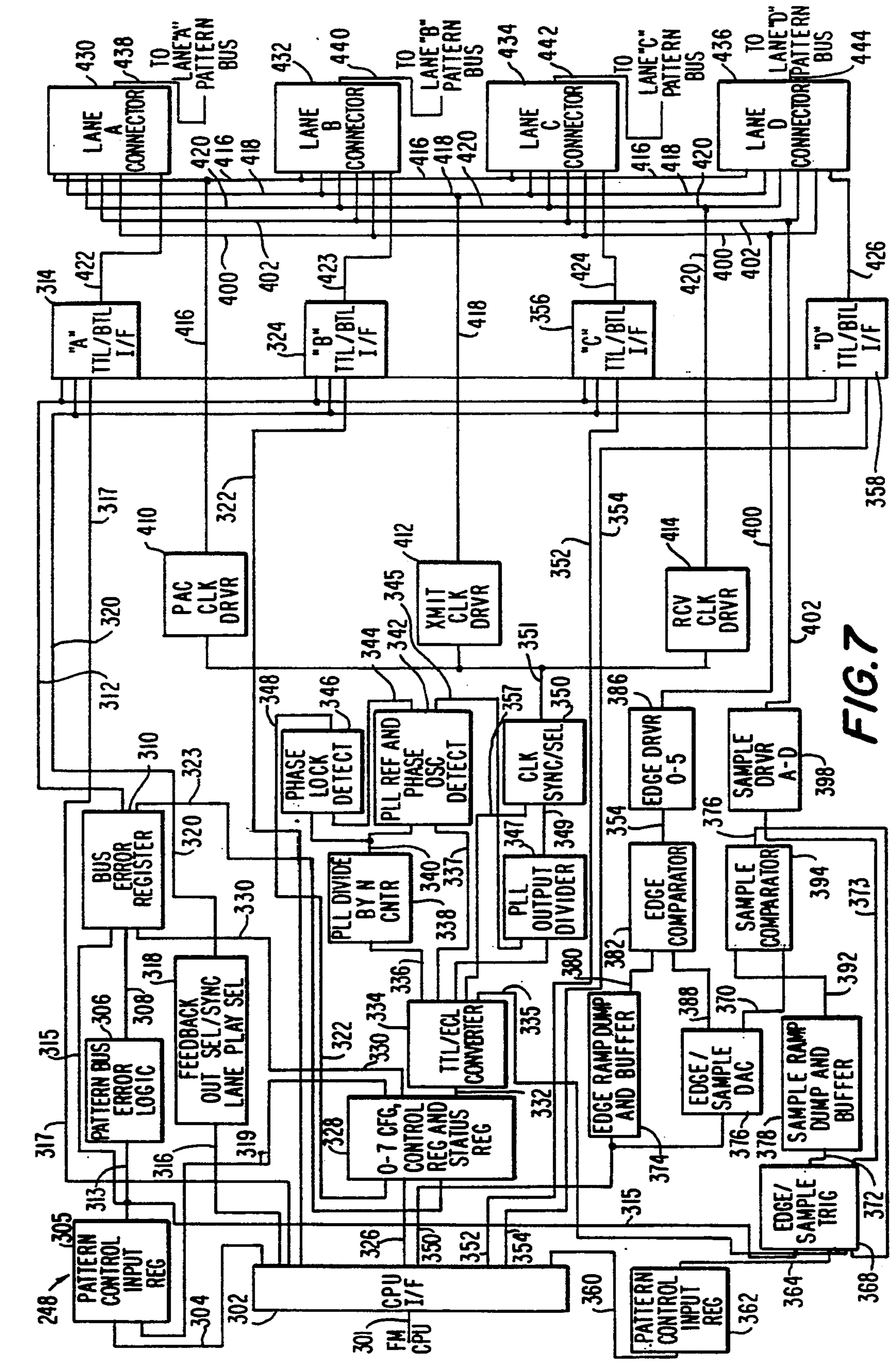
FIG. 7 is a block diagram of the TG of the HMS of FIG. 1.

Referring to FIG. 7, a block diagram of the TG 248 is shown. CPU interface ("CPU I/F") 302 communicates with CPU 240 on line 301. The signals on line 301 include the control signals from the CPU to the CPU I/F, and the address/data signals that are bi-directionally communicated between the CPU and CPU I/F. The CPU I/F buffers and decodes the signals for use by the remainder of the TG.

The decoded signals are used for Pattern Bus lane and PEL selection, and are used as control signals by the PACs and PELs. Line 317 from the CPU I/F connects the signals for Lane "A" to Lane "A" bus transceiver logic interface ("BTL I/F") 314. In a like manner, line 322 connects the signals for Lane "B" to Lane "B" BTL I/F 324, line 352 connects the signals for Lane "C" to Lane "C" BTL I/F 356, and line 354 connects the signals for Lane "D" to Lane "D" BTL I/F 358.

Pattern control input register 305 receives inputs from CPU I/F 302 on line 304 and from 0–7/control/-status register 328 on line 309. 0–7/control/status register 328 is connected to CPU I/F 302 via line 326. The information communicated from CPU I/F 302 to register 328 includes buffered control, status, and data signals. The signals received from the CPU I/F in this case, however, are the valid data signals for each lane. The signals received from the 0–7/control/status register are PEL control signals for each lane.

The output of pattern control input register 305 is input to Pattern Bus error logic 306 via line 313. Pattern Bus error logic 306 includes a programmable array logic ("PAL") which determines whether there are errors in the PEL control data and in the data being placed on any of the lanes.

The output of Pattern Bus error logic 306 on line 308 is input to bus error registers 310, along with the output of pattern control input register 305 on line 313 and the output of 0–7/control/status register 328 on line 330. The signal output from logic 306 is an error signal for the lanes; the signal output from register 305 clears error conditions. If there is an error, the bus error register provides error data to 0–7/control/status register 328 on line 323, and an error signal on line 312 to Lane "A" BTL I/F 314, Lane "B" BTL I/F 324, Lane "C" BTL I/F 356, and Lane "D" BTL I/F 358. The error signal will be processed by the PELs and PACs, and their respective associated circuitry, according to the type of error it is. A detected error will also cause the generation of a CPU interrupt signal that is transmitted back to the CPU by appropriate means.

The output of CPU I/F 302 on line 316 is input to the feedback out select synchronizer/lane play select 318. The outputs from CPU I/F 302 are the buffered lane signals from the CPU. Via bi-directional line 320, feedback out select synchronizer/lane play select 318 receives the feedback signal as an input from the HME, to indicate that a desired HME internal state has been achieved. Feedback out select synchronizer/lane play select 318 processes these signals such that the feedback and the lane select signals are clocked from a register at the same time. The signals are used for conducting pattern play, as will be described. The output of feedback out select synchronizer/lane play select 318 on bi-directional line 320 is input to Lane "A" BTL I/F 314, Lane "B" BTL I/F 324, Lane "C" BTL I/F 356, and Lane "D" BTL I/F 358.

All of the input signals to Lane "A" BTL I/F 314, Lane "B" BTL I/F 324, Lane "C" BTL I/F 356, and Lane "D" BTL I/F 358 have now been described. The outputs of these I/Fs are bi-directionally connected to their respective Pattern Bus lane connectors. That is, the output of Lane "A" BTL I/F 314 is connected to Lane "A" connector 430 by bi-directional line 422, the output of Lane "B" BTL I/F 324 is connected to Lane "B" connector 432 by bi-directional line 423, the output of Lane "C" BTL I/F 356 is connected to Lane "C" connector 434 by bi-directional line 424, and the output of Lane "D" BTL I/F 358 is connected to Lane "D" connector 436 by bi-directional line 426.

The signals output from TTL/ECL (transistor-transistor logic/emitter-coupled logic) converter 334 are used for generating delays for the sample strobes and edge times, and for generating the pattern clock signal. The circuitry for generating the clock signals will be discussed first, then the circuitry relating to the sample strobes and precision edges will be discussed.

The output of TTL/ECL converter 334 on line 336 are the programmed clock rate signals from CPU 240. These signals are input to PLL (phase-locked loop) divide-by-N counter 338. Based on the programmed rate, the signals representative of the clock rate are output on line 340 and input to PLL reference oscillator/phase detector 342. PLL reference oscillator/-phase detector 342 compares the frequency of the oscillator-generated signal and the signal output from the PLL divide-by-N counter. The difference in the signals drives a voltage controlled oscillator ("VCO").

The output of PLL reference oscillator/phase detector 342 on line 344 is the reference oscillator signal, which is input to phase-lock detector 346. The second input to phase lock detector 346 is the output of PLL divide-by-N counter 338 on line 340. The two inputs are compared, and when matched, the output of the phase-lock detector on line 348 changes state to indicate to that this has been achieved. The output of phase lock detector 346 is input to 0–7/control/status register 328. This register will place this status information on the bus that communicates with CPU 240.

A second output of PLL reference oscillator/phase detector 342 on line 345 is input to a PLL output divider 347. This output is the output of the VCO, and is used as a clocking signal for PLL output divider 347. The other inputs to the PLL output divider on line 339 from TTL/ECL converter 334 are the signals for determining how to divide the PLL output to obtain the desired clock rate. The input signals are processed, and the output of PLL output divider 347 on line 349 is input to clock synchronizer/selector 350.

Clock synchronizer/selector 350 receives an input from divider 347, and is capable of having two external clocks connected to it. The clock select signals from TTL/ECL converter 334 are also input to clock synchronizer/selector 350, via line 357. After the clock signal is selected, it is synchronized. This clock signal will be used to generate pattern clock signals.

The output of clock synchronizer/selector 350 on line 351 is input to PAC clock driver 410, transmit clock driver 412, and receive clock driver 414. The outputs of the PAC clock driver on line 416, the transmit clock driver on line 418, and the receive clock driver on line 420 are is input to each of Lanes "A," "B," "C," and "D" via lane connectors 430, 432, 434, and 436. The PAC clock signal is used for generating the clock signal for the PAC. The receive clock signal is used to direct the PAC to receive data. The transmit clock signal is used to direct the PAC to transmit data.

Generation of the sample strobes and the edge times will now be discussed. The signals output from CPU I/F 302 on line 360 are input to pattern control input register 362. These signals are the data valid signals for each lane, and the PEL control signals. The output of register 362 is one of the inputs to edge/sample trigger circuitry 368. The other inputs to this circuitry are the control and select signals for the six timing edges from TTL/ECL converter 334 on line 335, and the output of Pattern Bus error logic 306 on line 313.

The outputs of the edge/sample trigger circuitry 368 on line 378 are charging signals for generating the six timing edges, which are input to edge ramp dump buffer 374. The charging signals are input to circuitry that provides analog outputs for the six edges. These analog outputs are input to edge comparators 382 via line 380. The other input to the edge comparators is the output of the edge/sample DAC 376.

The signals input to the DAC are from CPU I/F 302 on line 350. These signals originate at CPU 240, and are converted to analog signals and compared with respective analog signals from edge ramp dump buffer 374. The comparison of the signals at each of the comparators will cause an output on line 384 to 0–5 edge driver 386. The output of the 0–5 edge driver on line 400 is input to each of Lanes "A," "B," "C," and "D," over its respective connector.

With regard to the sample strobes, the inputs to edge/sample trigger circuitry 368 are the sample mode selection signal and clocking signals from TTL/ECL converter 334. The output of edge/sample trigger circuitry 368 on line 373 is input to the ADC (analog to digital counter) sample driver 398. The output signal has a programmed width. The output of driver 398 on line 402 is input to each of Lanes "A," "B," "C," and "D," via its respective connector.

The other output of the edge/sample trigger circuitry, relating to the sample strobe, is on line 372, and it is input to sample ramp dump buffer 378. This output includes charging signals which are processed by sample ramp dump buffer 378 to generate an analog signal. The analog signal is output on line 392 and is input to sample comparator 394, where it is compared with an analog output from the edge/sample DAC. The output of sample ramp dump buffer 378 preferably is also provided as a test point.

The output of sample comparator 394 on line 396 is input to edge/sample trigger circuitry 368. This signal is used to set the register that provides the output signal to ADC sample driver 398 via line 373.

Having described the circuitry of TG 248, aspects of its operation and interrelationship with other elements of the HMS will now be discussed.

As stated, one of the primary functions of TG 248 is to provide a single source of timing signals for use by the HMS. However, TG 248 also performs other important functions. During the access mode, TG 248 provides a path between CPU 240 and the four lanes of the Pattern Bus, permitting the CPU to access the PACs, PAMs, and PELs to perform read and write operations. This is done in the form of read and write requests. The specific requests that can be made through TG 248 will be discussed in conjunction with the elements to which the requests are made.

The pattern clock that is output from TG 248 clocks the patterns from the pattern memory onto the Pattern Bus. The pattern clock rate is programmable by the CPU and is set according to the "device-speed" parameter specified in the shell software.

The six edge strobes generated by TG 248 are used for formatting HME data and clock input signals. The CMC automatically computes the edge times based on the "device_speed," "device_setup_time," and "device_hold_time" specified in the shell software. TG 248 uses the programmable-slope ramp generator and the six comparators to place the edges with a resolution of approximately 0.5 ns.

The sample strobe is used by the PELs to sample HME outputs. The rising edge of the signal can be swept by the CMC in four ranges, with resolution as fine as 0.5 ns, in order to precisely determine the time of output and I/O pin transitions. The falling edge, which is automatically placed by the CMC, samples the five-state output and I/O pin values.

As briefly discussed above, TG 248 performs error handling functions. The primary function is to detect errors on the four lanes of the Pattern Bus. If an error is detected, an interrupt signal is sent to the CPU. Depending on the type of error, the HMS may discontinue the current evaluation.

Errors detected by TG 248 include parity error, shorted pin error, and DAB error. Parity error detection ensures that proper transmission of patterns takes place and ensures that the patterns are properly received by the CICs on the PELs. A parity error is a fatal error.

The shorted pin error indicates that the CICs of the PEL have detected that a pin driver is shorted. This is not a fatal error.

The DAB error indicates that a DAB has either been inserted or removed, or that the DAB is not active. This is not a fatal error.

TG 248 generates other error signals, in addition to the main signals discussed above. These signals will be discussed in the course of describing the operation of the HMS and the elements that generate the various signals.

The six timing edges that are generated are used for HME data and clock formatting during pattern play. The slope of the analog voltage ramp used to generate the edges is selected to allow all six timing edges to occur within one pattern clock period. The ramp used preferably has a software-selectable slope of 0.5, 2, 10, or 50 ns/threshold.

The time delays of the six timing edges are programmable via an 8 bit address. The 8 bit address selects one of 256 points along the slope. For example, if the 0.5 ns/threshold slope is selected, the minimum timing delay available is: (0.5 ns/threshold)×(1 threshold)=0.5 ns. The maximum delay is: (0.5 ns/threshold)×(256 thresholds)=128 ns.

The TG performs timing checks on patterns transmitted by the PACs. It determines whether the pattern sequences transmitted by adjacent PACs stop at the same time, and verifies that patterns are sent to the same PEL in each lane.

TG 248 may also include an on-board clock for diagnostic purposes.

Pattern Controller

Figure 8:
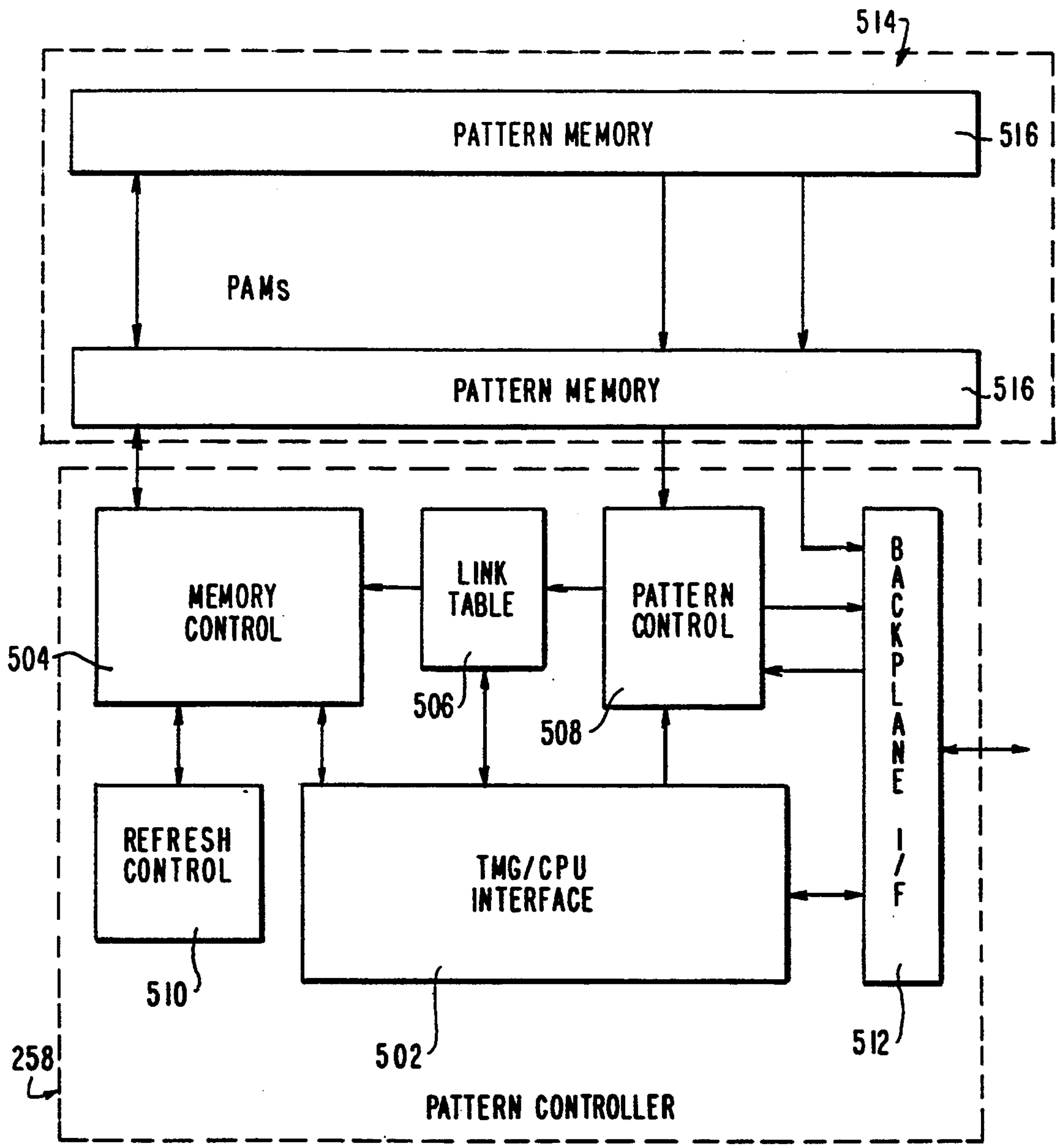
FIG. 8 is a block diagram of a PAC and attached PAMs of the HMS of FIG. 1.

Referring to FIG. 8, a block diagram of representative PAC 258 and PAM 259 is shown. The following description of PAC 258 and PAM 514 is representative of the other PACs and PAMs of the HMS. PAC 258 includes timing/CPU interface ("TMG/CPU I/F") 502, memory control 504, link table 506, pattern control 508, refresh control 510, and backplane I/F 512. The pattern memories of the PAC/PAM combination are shown at 514. PAM 514 includes from one to four PAM boards 516, which are connected to a PAC.

An overall description of the PAC and PAM operation will first be presented. The PAC, together with one or more PAMs, allows for the storage and presentation of pattern sequences in the HMS. The HMS preferably can support up to four PACs, one per lane. A minimum of one PAC is required for basic system operation. An edge connector on the PAC allows the PAC to be connected directly to a single lane of the backplane. Because the PAC itself has no memory for pattern storage, stacking connectors on the PAC allow from one to four PAMs to be connected to the PAC. This allows the user to configure and upgrade pattern memory within the system.

Pattern memory is allocated in blocks of 256 patterns by CMC software running on the CPU. A pattern sequence is initially allocated as a single block. Additional blocks of memory are allocated as the pattern sequence length increases beyond 256 during simulation or test-vector play. It is not necessary for the pattern blocks that make up a pattern sequence to be contiguous within the pattern memory, because pattern blocks are linked together by a 32K-by-15-bit "link table." The link table, located on the PAC, contains the information necessary to generate a continuous pattern sequence from the blocks which may be scattered throughout the pattern memory.

The CMC software running on the CPU allocates and deallocates pattern memory in 256-pattern blocks, and maintains pattern sequences as lists linked via the link table. The HMS hardware follows the links in the link table when presenting pattern sequences to the HME. Because of these linked-list pattern-memory allocation and presentation methods, multiple pattern sequences can share pattern memory and can grow and shrink without requiring the CPU to copy patterns from one location in pattern memory to another.

Linked pattern memory blocks are also used to support concurrent fault simulation. In concurrent fault simulation, multiple history sequences are retained in pattern memory. These history sequences represent multiple instances of a single device for different faults of the system being simulated. These multiple history sequences may have initial portions which are common. The HMS stores the common initial subsequence of these differing history sequences only once. It links the common initial subsequence to any of several different ending subsequences by storing the appropriate link in the link table immediately prior to presentation.

The backplane can be placed in either of two operational modes: access mode or presentation mode. The behavior of the PAC is dependent on the mode of the backplane. Between device evaluations, the entire backplane is in access mode. This mode of operation allows the CPU board to access the contents of the status and control registers on the PAC, the link table, and the memories residing on all PAMs connected to the PAC.

During evaluation of an HME, the backplane is in presentation mode. In presentation mode, all PACs operate synchronously, simultaneously presenting patterns to the PELs in each of the enabled lanes. Preferably, each PAC presents 80 data bits, 5 parity bits, and 11 control bits to the backplane during each pattern cycle.

Additional bits from the pattern word are used internally in the PAC.

The patterns presented to the backplane by the PAC during presentation mode are stored within memories on the PAM or PAMs connected to the PAC. Preferably, the pattern words stored within a PAM are 102 bits wide, and consist of 80 data bits, 16 control bits, and 6 parity bits.

Lengthy simulations may require that long pattern sequences be stored in the PAM. The memories used on the PAMs are, therefore, preferably able to output a long, continuous sequence of patterns at a high pattern rate (25 MHz). For this reason, the PAM uses Video RAMs ("VRAMs") for pattern storage.

PAMs preferably are of several different capacities. A 128K PAM preferably uses 256K-bit VRAMs such as the M5M4C264L-12 manufactured by Mitsubishi, and a 512K PAM preferably uses 1M-bit VRAMs, such as the TC524256AZ-12 manufactured by Toshiba. The 256K-bit VRAMs consist of a 64K-by-4-bit dynamic RAM port and a 256-by-4-bit serial read/write port. The serial port allows the data stored within the memory to be clocked out with a high speed clock. The 1M-bit VRAMs are similar, with the dynamic RAM port organized as 256K-by-4 bits and the serial port organized as 512-by-4 bits. During access mode the patterns are stored in the VRAMs using standard DRAM RAS/-CAS protocol. During presentation mode, the serial port is used to clock the data out of the memory and onto the backplane via the PAC.

Due to the high pattern rates encountered during presentation, the pattern memories preferably are interleaved. The pattern clock received by the PAC is divided by two, and half of the VRAMs use one phase of the divided clock to shift data out of their serial ports, while the remaining VRAMs use the other phase of the divided clock. Since the VRAMS have a 4-bit-wide serial output, a total of 24 VRAMs are required to store 96 bits of pattern and control data. The six additional parity bits require two more memory devices, for a total of 26 VRAMs per pattern word. Because the memories are interleaved, twice this number (52 VRAMs) preferably reside on the PAM.

During access mode, pattern memory is divided into three banks in order to make efficient use of the memory address space allocated to the PAC and connected PAMs. The 96-bit pattern/control word is split into three 32-bit words, each accessed in a different memory bank. Each 32-bit bank is further divided into a 16-bit low data word and a 16-bit high data word, allowing for 16-bit accesses from the CPU. The parity VRAMs are duplicated because of interleaving, that is, there are a total of four parity VRAMs on the PAM, two for each interleaved half of pattern memory. Only three of the four bits are used on each VRAM, one for each of the three memory banks.

During CPU write accesses to the PAC/PAM, two parity circuits on the PAC generate separate parity bits for the two 16-bit words. These parity bits are sent to the PAMs where they are written into the appropriate parity VRAMs. One parity bit is individually written into each affected parity VRAM by making use of the "write-per-bit" feature of the VRAMs. During a 32-bit write access, two parity bits are generated and written simultaneously. During a 16-bit write access, only one of the two parity bits is valid, and only that bit is written into the VRAM. Each parity generator preferably can be configured to output either even or odd parity.

When the CPU performs a read access to pattern memory, the parity bit or bits associated with the accessed location are read from the appropriate parity VRAM and routed to the parity circuitry on the PAC. The remainder of the pattern word is also sent to the parity circuitry, which computes the parity and compares the result with the parity bits. If the result indicates a parity error, then the CLK_READ signal latches the pattern word and the address at which it occurred. During a 16-bit access, only the 16 bits being accessed can generate a parity error.

In addition to the two parity generator/checkers which operate during access mode, there is another 16-bit parity checker which operates during presentation mode. This parity checker computes parity on the 16-bit pattern control word. The generated parity bit is compared with the appropriate parity bit stored in pattern memory. If a parity error is detected, the PAC halts pattern presentation.

The five parity bits associated with the 80 bits of pattern data are driven onto the backplane during presentation mode. The PEL receives these five parity bits, and the CICs on the PEL use them to check the parity of each 16-bit section of the 80-bit pattern data. If a parity error is detected by any CIC on the PEL, the PEL asserts the backplane ERROR* signal. The PAC receives the ERROR* signal and immediately halts pattern presentation.

During a CPU access, the low 32 pattern bits on the backplane are used by the PAC as address bits. When the backplane address strobe is asserted, the lane select and address bits are latched by the PAC. Decode logic on the PAC uses the backplane address strobe, the latched lane select, and address bits 20 through 27 to determine if the CPU is addressing the PAC/PAM. If it is, the PAC generates an internal signal indicating that a CPU request is in progress. A request code is sent to the memory control circuitry to determine what type of transaction the control circuitry should perform.

All memory and register requests are processed by the "request machine" circuitry of the PAC. This state machine is composed of two PROMs with registered outputs, and uses a 16 MHz crystal oscillator as its clock. All requests except pattern memory refresh requests are asynchronous to the 16 MHz clock and are first synchronized with a two stage flip-flop synchronizer.

Because stacking connectors preferably are used to connect multiple PAMs to a single PAC, each PAM is strapped with a two bit address. This is accomplished using a DIP switch on each PAM. Each DIP switch is set to a unique address, starting with zero. If both 512K and 128K PAMs are installed on the same PAC, the 512K PAMs are assigned the lowest switch settings. In order to verify that the switches have been set properly, the PAC and PAM contain memory detection circuitry. An analog comparator circuit on the PAC automatically determines the number of PAMs plugged into the PAC. This number can be read by the CPU.

When the CMC, running on the CPU, writes data patterns in the PAM, it also stores a 16-bit control word with each of the patterns. Bits D0 through D3 of the control word are PEL address bits. These bits are driven onto the HMS backplane during pattern presentation and are used to select the appropriate PEL within the lane. Bits D4 through D6 are PEL control bits. These bits are driven onto the HMS backplane during pattern presentation and are used by both the TG and the PELs. Bit D7 is the USER bit. It is driven onto the HMS backplane during pattern presentation and is received by the PEL. The PEL then drives the USER bit onto a test point on the DAB. Bits D11 through D13 are spare control bits which are unused by the PAC. Bits D14 and D15 are spare bits driven onto the backplane during presentation.

Bits D9 and D10 of the control word are branch command bits. These bits, in conjunction with the link table, instruct the PAC to stop fetching patterns from the current block and to begin fetching in the next block. The branch command code tells the PAC when to jump to the next block, and the link table contains the address of the next block. The transfer from one block to the next is accomplished by performing a "serial read transfer cycle" operation within the VRAM, transferring a new row of data from the dynamic RAM port to the serial shift register port.

Having presented an overall description of the PAC and PAM operation, a detailed description of the PAC will now be presented.

In order to understand operation of the PAC in both operational modes, it is necessary to understand the signals at backplane I/F 512. The Pattern Bus preferably carries signals of two logic families: BTL (as supported by BTL transceivers manufactured by National Semiconductor) and ECL. This was described in discussing the signals placed on the Pattern Bus by TG 248. BTL transceivers are used for the majority of the Pattern Bus signals. The ECL drivers and receivers are used for the more critical timing signals such as clocks, timing edges, and strobes. Table 2 shows the signals at the backplane I/F and their descriptions. Many of these signals have different functions for the access and presentation modes; this is reflected in the descriptions.

TABLE 2

| Signal | Description |
|---|---|
| RESET | The RESET signal is an active high BTL input signal driven by the TG. This signal is asserted upon power-on, or when the HME is initialized. While the RESET signal is asserted, refresh cycles cannot take place, and the contents of the pattern memory may be lost. |
| PLAY* | The PLAY* signal is an active low input signal driven by the TG. The state of the PLAY* signal determines the state of the Pattern Bus lane. PLAY* is inactive (high) during access mode, and is asserted during presentation mode. |
| ERROR* | The ERROR* signal is an active low BTL "party-line" signal driven by the TG, the PEL, and the PAC itself. During access mode, the PAC ignores ERROR*. During presentation mode, the PAC halts pattern play whenever ERROR* is asserted. The PAC asserts the ERROR* signal when an internal error condition is detected, independent of the Pattern Bus mode. The ERROR* signal is asserted until the error condition is cleared by the software or until the RESET signal is asserted. |
| PARITY<0 . . 4>* | The five Pattern Bus parity signals, PARITY<0 . . 4>*, are BTL signals which serve different purposes during each operational mode. During the pattern presentation mode, the signals are the parity |

TABLE 2-continued

| Signal | Description |
|---|---|
| | signals for the 80 pattern bits, one parity bit per sixteen pattern bits. The parity bits are stored in pattern memory and are driven onto the Pattern Bus by the PAC. During CPU access mode, the parity signals serve as control signals driven by the TG and received by the PAC. In the access mode: PARITY<0>* is the AS (address strobe) signal. This AS signal is an active high signal. This signal indicates when the address line signals are valid. PARITY<1>* is the READ (read data) signal. The READ signal determines the direction of CPU transfers. The READ signal is high when the CPU is reading data from the PAC or PAM. The READ signal is low when the CPU writes to the Pattern Bus. PARITY<2>* is the DS (data strobe) signal. The DS signal is an active high signal and indicates the data portion of a CPU transfer cycle. During CPU write cycles, the assertion of the DS signal indicates that valid data exists on the shared address/data bus. During CPU read cycles, the assertion of the signal indicates to the device being accessed that it may place data on the Pattern Bus. PARITY<3>* is the LW (long word) signal. This active high signal determines the width of data transfers. When LW is low, the CPU cycle is a 16-bit transfer. When Lw is high, a 32-bit transfer is performed. PARITY<4>* is the LANE (lane select) signal. The active high LANE signal is generated by the TG from CPU address bits. The PAC and PEL have no way of sensing which backplane lane they are in. Hence, the LANE signal acts as a lane select. |
| FB_IN* | The FB_IN* signal is an active low BTL "party-line" signal driven by the PAC and PEL. FB_IN* serves as an acknowledge signal asserted by the PAC at the end of the CPU access mode. During pattern presentation mode, the FB_IN* signal is used to transmit the feedback signal from the PEL to the TG. The PAC simply drives FB_IN* with a logic "1" value during this time. |
| FB_OUT* | The FB_OUT* signal is a BTL signal driven by the TG. It is received by the PAC and is used as the HME feedback signal during pattern presentation mode. During CPU access mode, FB_OUT* signal is ignored by the PAC. |
| PAC_CLK | PAC_CLK signal is a differential ECL signal that is used by the PAC and the PAM for clocking the majority of the control and data signals. |
| XMT_CLK | XMT_CLK signal is a differential ECL signal that is used to register the pattern bits output onto the Pattern Bus during pattern presentation. |
| RCV_CLK | RCV_CLK signal is a differential ECL signal that is used to clock the PAC inputs during presentation |

TABLE 2-continued

| Signal | Description |
|---|---|
| | mode. |
| SAMPLE | The SAMPLE signal, is a differential ECL signal driven by the TG. Whenever the received SAMPLE signal goes high, the PAC completes any refresh cycle it is in and withholds refresh cycles until the SAMPLE signal returns to the low state. |
| PEL_CTL<0 . . 2>* | The three PEL control bits, PEL_CTL<0 . . 2>*, are stored in the PAM as part of the pattern control word and are driven onto the Pattern Bus by the PAC during the pattern presentation mode. During CPU access mode, the PAC receives, but ignores, the PEL control signal, in order for the TG to drive them onto the Pattern Bus. |
| DATA_VALID* | The DATA_VALID* signal is a BTL signal that is driven by the PAC. This signal indicates when the Pattern Bus control and pattern bits are valid. Several clock cycles after presentation mode is initiated by the TG, the DATA_VALID* signal is asserted, indicating that the next clock cycle ontains valid data and control signals. When the DATA_VALID* signal goes high, data and control signals are valid for only one more clock cycle. |
| PEL_ADDR<0 . . 3>* | PEL_ADDR<0 . . 3>* are the PEL address signals. These signals are BTL signals which are driven by the PAC. These signals, stored in the PAM as part of the pattern control word, are only valid during the pattern presentation mode. |
| SPARE CONTROL | Spare control signals may be provided. These signals are similar to the PEL address bits in that they are driven by the PAC, but are only valid when the DATA_VALID* signal is active. The spare bits are stored in the PAM. In the preferred embodiment, the spare signals are not used by the TG or PEL. |
| USER* | The USER* signal is a BTL signal. The USER* signal is stored in the PAM as part of the pattern control word. It is only valid during the pattern presentation mode. |
| PAT<0 . . 79>* | These signals are BTL signals. During pattern presentation mode, the 80 signals contain pattern data and are driven by the PAC onto the Pattern Bus. During CPU access mode, 48 of the signals, PAT<32 . . 79>*, are not driven. The remaining 32 pattern signals, PAT<0 . . 31>*, are used as multiplexed address/data signals. They are driven by the TG during the address portion of the cycle and during the data portion of CPU write cycles. The PAC drives them during the data portion of CPU read cycles. |

Figure 9:
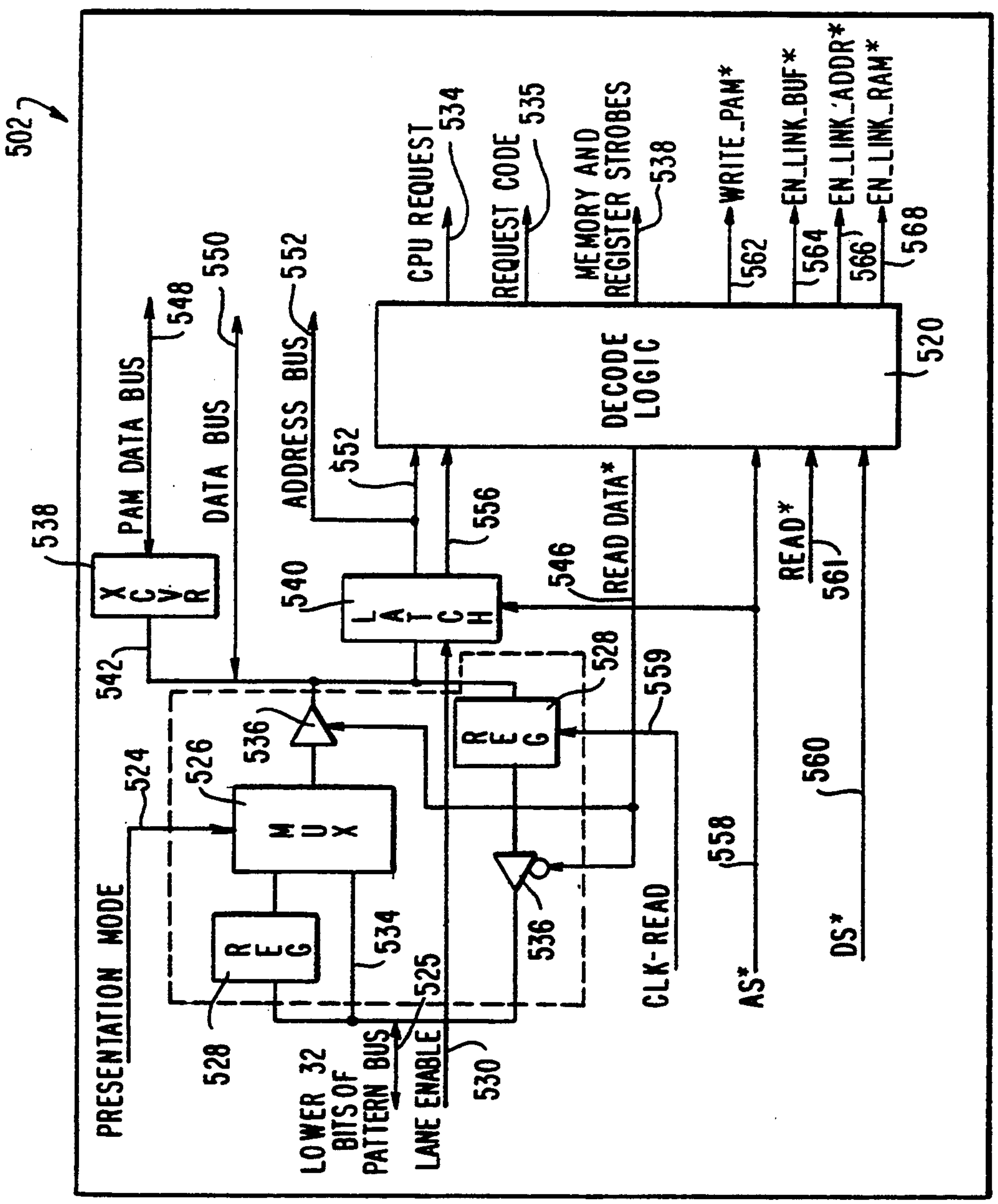
FIG. 9 is a schematic drawing of the TMG/CPU Interface of the PAC of FIG. 8.

FIG. 9 is a schematic diagram of TMG/CPU I/F 502. The TMG/CPU I/F uses the control strobes, the PLAY* signal (which is inverted to become the PRESENT signal), and the lower 32 bits of the Pattern Bus to generate separate address and data buses, as well as various control signals for use by the PAC and the PAM, as will be described.

Line 525 represents the lower 32 bits of the Pattern Bus, which may be within any one of the four lanes of the Pattern Bus. The lower 32 bits on line 525 are input to register 528. The READ_DATA* signal on line 546 is input to tri-state buffers 532 and 536. The READ_DATA* signal determines the direction of data flow through the Pattern Bus. When the READ_DATA* signal is a logic high value, the direction of data flow is from line 525 to line 542; when it is a logic low value, data flow is in the opposite direction. In the opposite direction, data on the PAC address/data bus is input to register 526 and then placed on Pattern Bus 525. The CLK_READ signal on the 559 clocks shift register 526.

The output of buffer 536 on line 542, which is the PAC address/data bus, is input to transceiver 538 and latch 540. Transceiver 538 provides bi-directional communications between PAM data bus 548 and the PAC address/data bus 542.

The second input to latch 540 is the lane enable signal on line 530. The outputs are the signals on address buses 552 and 556. The address bus signals are input to the decode logic 520 and sent to other portions of the PAC. The decode logic comprises two PALs. The other inputs to the decode logic are the AS* signal on line 558, the DS* signal on line 560, and the READ* signal on line 561. Decode logic 520 processes the input signals, and provides at its outputs the READ_DATA* signal on line 546, the CPU_REQ signal on line 534, the REQ_CODE on line 535, and various memory and register strobes at line 538. The READ_DATA* signal was explained above. The CPU_REQ signal, the REQ_CODE signal, and various memory and register strobes will be described in discussing the PAM and the remainder of the PAC.

During the access mode, the PLAY* signal, driven by TG 248, is deasserted on all four lanes of the Pattern Bus. TG 248 drives the address strobes in the deasserted state until a CPU read or write cycle takes place. While the address strobe is in its deasserted state, the lane enable signals and the lower 32 bits of the Pattern Bus are received by the PAC through latch 540.

At the beginning of a CPU access, the lower 32 bits of the Pattern Bus become address bits and, if the access is directed at the lane, the lane enable signal becomes active. When the address strobe becomes active, the lane enable and address bits are latched. Decode logic 520 uses the address strobe, the latched lane enable, and address bits 20–27 to determine whether the CPU is addressing the PAC/PAM. If it is, a CPU request signal is generated. Decode logic 520 also uses other control signals such as the RD* and DS* signals to generate various control strobes and memory selects.

The three bit REQ_CODE signal 535 is sent to the PAMs and determines the type of transaction the control circuitry must perform. The REQ_CODE signal is encoded as shown in Table 3. The first two entries in the table are for transfer cycles which occur only during the presentation mode. The remaining codes are for PAM reads and writes, and link table or register reads and writes.

TABLE 3

| Bits | | | |
|---|---|---|---|
| R1 | R2 | R3 | Transaction |
| 0 | 0 | 0 | ASYNC XFER |

TABLE 3-continued

| Bits | | | |
|---|---|---|---|
| R1 | R2 | R3 | Transaction |
| 0 | 0 | 1 | SYNC XFER |
| 0 | 1 | 0 | ILLEGAL |
| 0 | 1 | 1 | ILLEGAL |
| 1 | 0 | 0 | DRAM WRITE |
| 1 | 0 | 1 | DRAM READ |
| 1 | 1 | 0 | LINK/REG WRITE |
| 1 | 1 | 1 | LINK/REG READ |

The use of each transaction will be described in conjunction with the description of link table 506 and the PAM.

Figure 10:
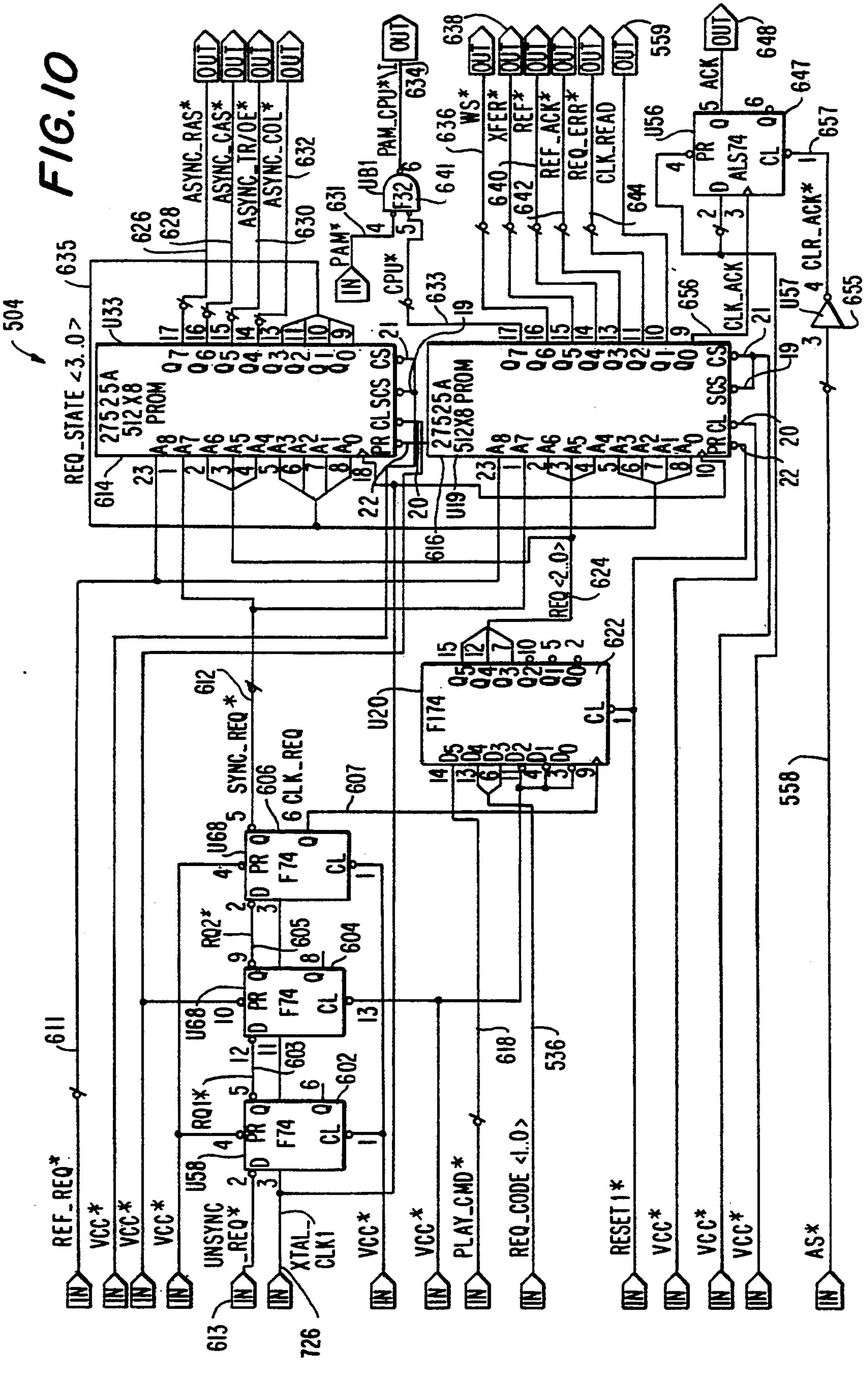
FIG. 10 is a schematic drawing of the memory control circuitry of the PAC of FIG. 8.

FIG. 10 is a schematic drawing of memory control circuitry 504. Memory control circuitry 504 processes all PAM, link table, and register requests. All of these requests, except the REF_REQ* signal on line 611, are multiplexed on line 613 as the UNSYNC_REQ* signal. The specific requests that are input to the memory control circuitry will be discussed after the disclosure regarding the circuit and its operation.

Memory control circuitry 504 includes programmable read only memories ("PROMs") 614 and 616, and flip-flops 602, 604, 606, 622, and 647. Flip flops 602, 604, and 606 are D-type flip-flops that are used to synchronize the UNSYNC_REQ* signal. The UNSYNC_REQ* signal, as stated, includes all of the request signals except the REF_REQ* signal on line 611. The three flip-flops are clocked by the 16 MHz XTAL_CLK signal on line 720 that is output from the crystal clock on the PAC. Following conventional clocking of the three flip-flops, the SYNC_REQ* signal is output from the "Q" output of flip-flop 606 on line 612. This signal is input to PROMs 614 and 616. The CLK_REQ signal is output on line 607 from the "Q*" output of flip-flop 606 to clock flip-flop 622.

The remaining inputs to PROMs 614 and 616 will now be described. The REF_REQ* signal on line 738, which is output from refresh PAL 714 (FIG. 11), is input directly to PROMs 614 and 616. The next input to the PROMs is the output of flip-flop 622. The inputs to the flip-flop are the PLAY_CMD* signal on line 618 and the three bit REQ_CODE signal on line 536.

The last input to PROMs 614 and 616 is the 4-bit REQ_STATE signal on line 635. This signal is output from PROM 614 and then input to both PROMs. The REQ_STATE signal inputs to the PROMs the current request type being processed by the PROMs. Outputs of PROM 614 include the synchronous control signals that are sent to the PAM after being gated with other signals. These signals are the ASYNC_RAS* signal on line 626, ASYNC_CAS* signal on line 628, ASYNC_TR/OE* signal on line 630, and ASYNC_COL* signal on line 632.

Figure 19:
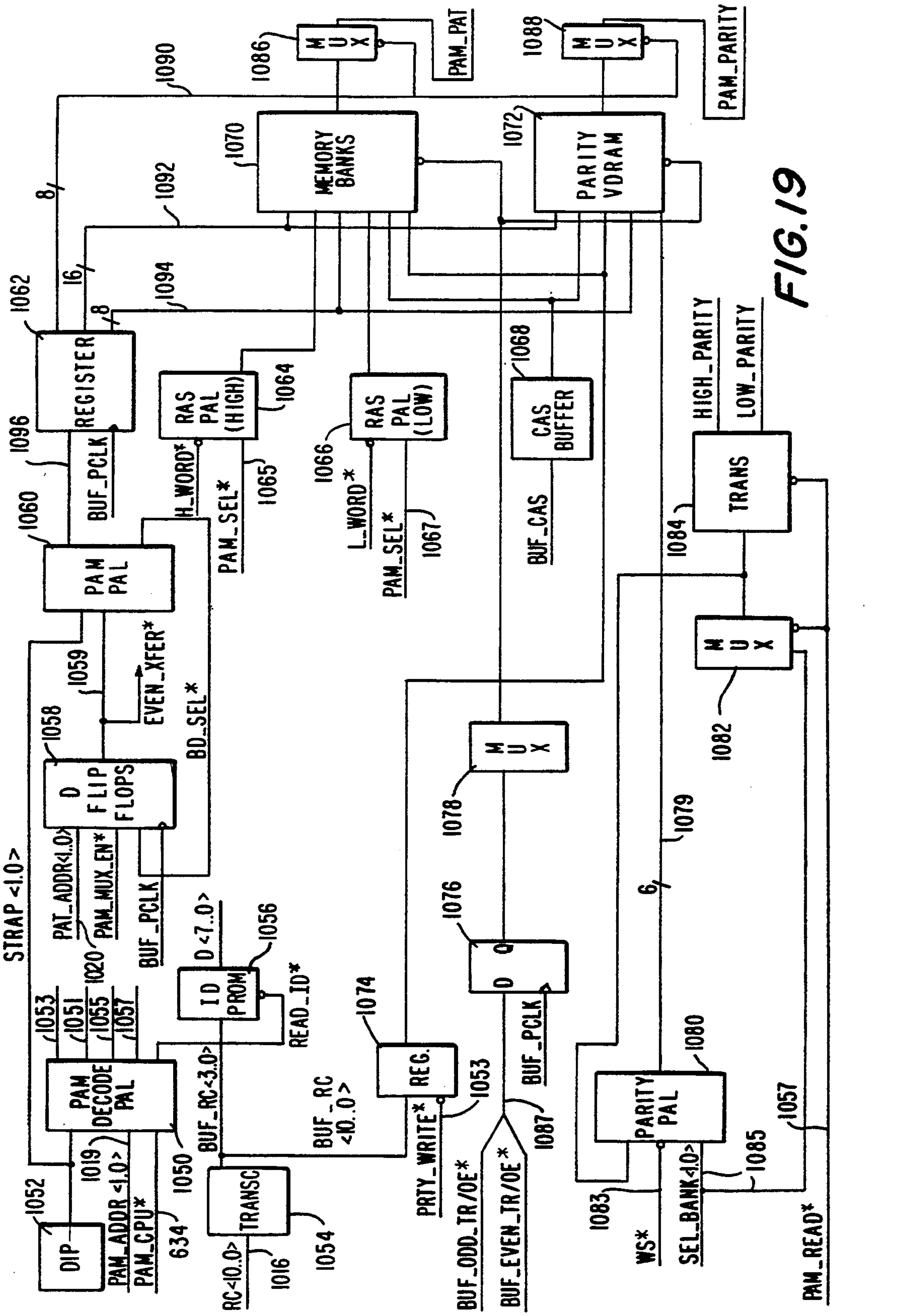
FIG. 19 is a schematic drawing of the preferred embodiment of the control circuitry for the PAM of the present invention.

The first output of PROM 616 is the CPU* signal on line 633. This signal and the PAM* signal on line 631 are input to OR gate 641. The PAM* signal is an output of decode logic 520 of the TMG/CPU I/F 502. The output of gate 641 is the PAM_CPU* signal on line 634 which is sent to the PAM Decode PAL 1050 (FIG. 19).

The next three outputs of PROM 616 are control signals that are sent to the PAM. These signals are the WS* signal on line 636, the XFER* signal on line 638, and the REF* signal on line 640. The WS* signal controls PAM write operations, and the XFER* and REF* signals are input to PAM RAS generation PALs 1064 and 1066 (FIG. 19) for generating various RAS signals. The XFER* signal is for effecting transfers from memory to a shift register. The REF* signal is the refresh enable signal.

The REF_ACK* signal on line 642 is the next output of PROM 616. This signal is input to the Refresh PAL 714. The REQ_ERR* signal on line 644 is output from PROM 616. The REQ_ERR* signal, when asserted, is used to generate the ERROR* signal which is placed on the Pattern Bus. The CLK_READ signal on line 559 clocks shift register 526 as described, and clocks the flip-flops for use in determining parity error.

The last output of PROM 616 is the CLK_ACK signal on line 656. This signal is input to the clock input of flip-flop 647. The input to the clear input is the CLR_ACK* signal on line 657. This signal is the AS* signal on line 558 after being inverted by inverter 655.

Memory control circuitry 504 processes link table and register read requests in exactly the same way since they are multiplexed as the UNSYNC_REQ* signal on line 613. A request is processed in two clock cycles. During both cycles, the COL* strobe and the signal on line 632 are asserted. Although these signals are asserted during all register and link table read operations, they are only used during reading of the PROM of the PAM. The CAS signal enables the lower address bits onto the row-column address bus. This bus connects to the output of the PAM ID PROM. The CPU signal, when gated with the PAM signal, turns the PAM data bus drivers on, allowing PAM ID PROM data to be read. Also, during the first of the two cycles, the CLK_ACK signal on line 656 is asserted. The rising edge of this active high signal clocks flip-flop 647, which asserts the ACK signal on the Pattern Bus. Even though valid data does not yet exist on the Pattern Bus, the negative setup time from data to acknowledge required by the TMG/CPU combination allows the PAC to assert the ACK signal two clock cycles before data is available.

During the second cycle, the CLK_ACK signal is deasserted and the CLK_READ is asserted. The rising edge of this active low signal clocks the desired data into the shift register of the TMG/CPU I/F section.

Memory control circuitry 504 then returns to its default state, deasserting the CAS signal, the CPU signal, and the CLK_READ signal. The backplane Pattern Bus ACK signal is automatically deasserted when the AS* is deasserted by the CPU, clearing flip-flop 647.

Link table and register write requests, like read requests, are processed in two clock cycles. During both cycles, the WS* signal is asserted. This active low signal is gated by various decoded memory/register select signals to generate the appropriate address select.

PAM read requests are processed in five clock cycles. During cycle 1, the CPU* signal on line 633 and the RAS signal sent to the PAM are asserted. These signals remain asserted during all five cycles. During cycle 2, the EVEN_TR/OR or ODD_TR/OR signal, and the COL* signal are asserted. In cycle 3, the CAS signal is asserted. In cycle 4, the CLK_ACK signal (and therefore the Pattern Bus ACK signal) is asserted. During cycle 5, the CLK_ACK signal on line 656 is deasserted and the CLK_READ clock is asserted. After cycle 5, all signals which remain asserted are deasserted. The Pattern Bus ACK signal is deasserted when the AS* signal is deasserted by the CPU, clearing flip-flop 647.

PAM write requests are also processed in five clock cycles. During cycle 1, the CPU signal is asserted. During cycle 2, the RAS and the CLK_ACK signals are asserted. In cycle 3, the COL* signal and the WS* are asserted and the CLK_ACK is deasserted. In cycle 4, the CAS signal is asserted. In cycle 5, all signals remain as they are. After cycle 5, all signals which remained asserted are deasserted. The Pattern Bus ACK signal acknowledge is deasserted when the AS* is deasserted by the CPU, clearing flip-flop 647.

Shift register transfer requests occur during pattern presentation. Each of the video memories ("VRAMs") of the PAM contains a serial shift register. This register is as long as one of the rows within the DRAM array (256 cells for VRAMs on a 128K PAM). Any row within the VRAM may be transferred to the shift register by performing a shift register transfer cycle. The contents of the shift register may be clocked out of the memory serially. The PCLK signal, divided by two, is used as the serial clock.

The row address selects the row to be transferred to the register. When the transfer takes place, the column address selects one of the registers as the first to be clocked out; this is the start address. If the register contents have been clocked out and another transfer does not take place, the same data from the start address is output again. That is, the shift register is cyclic.

At high PCLK rates, the placement of control signal transitions (RAS, CAS, etc.) relative to the serial clock is critical. These signals. therefore, must be generated by the PCLK signal itself. Pattern control 508, which uses the PCLK clock, generates the transfer control signals. This type of shift register transfer is a synchronous transfer, because the control signals are synchronous with PCLK.

Synchronous transfers are used at PCLK frequencies greater than 1 MHz, while asynchronous transfers are used below this frequency. A PCLK signal flip-flop on the PAC is set or cleared by software, depending on the frequency of the next pattern play. The output of this flip-flop is used by decode logic 520 when forming the three bit REQ_CODE signal. The state of this bit determines whether the request is a synchronous or an asynchronous transfer request.

When pattern control 508 sends a synchronous transfer request, memory control circuitry 504 finishes any refresh cycle which may be in progress, and then asserts the XFER* signal on line 638. This active low signal is buffered and sent to the PAMs where it is used as a RAS enable signal. The memory control circuitry asserts the XFER* signal until pattern control has completed the transfer operation and has removed the transfer request.

When pattern control 508 sends a synchronous transfer request, the request state machine finishes any refresh cycle which may be in progress, and then begins the six cycle transfer sequence. During cycle 1, the XFER* signal and the EVEN_TR/OE or ODD_TR/OE enable signals are asserted. In cycle 2, the RAS signal is asserted. In cycle 3, the COL* signal is asserted. During cycle 4, the CAS signal is asserted. In cycle 5, all signals remain asserted. After cycle 6, all signals are deasserted and the transfer is complete.

Refresh requests are not sent through the synchronizer because they are generated by the refresh control circuitry 510, which uses the same 16 MHz clock as memory control circuitry 504. Refresh requests, therefore, are sent directly to the memory control circuitry. They are processed only when the memory control circuitry is idle. Each CAS-before-RAS refresh sequence is four cycles long. During cycle 1, the REF* and the CAS signals are asserted. During cycle 2, the RAS signal is asserted. In cycle 3, the CAS signal is deasserted and the REF_ACK* signal is sent back to refresh control circuitry 510, to indicate that the REF_REQ* signal is being processed. During cycle 4, the REF_ACK* and the RAS signal are deasserted. After this cycle, the REF* signal is deasserted.

To minimize the size of the current pulse during refresh, only one PAM board is refreshed at a time.

Figure 11:
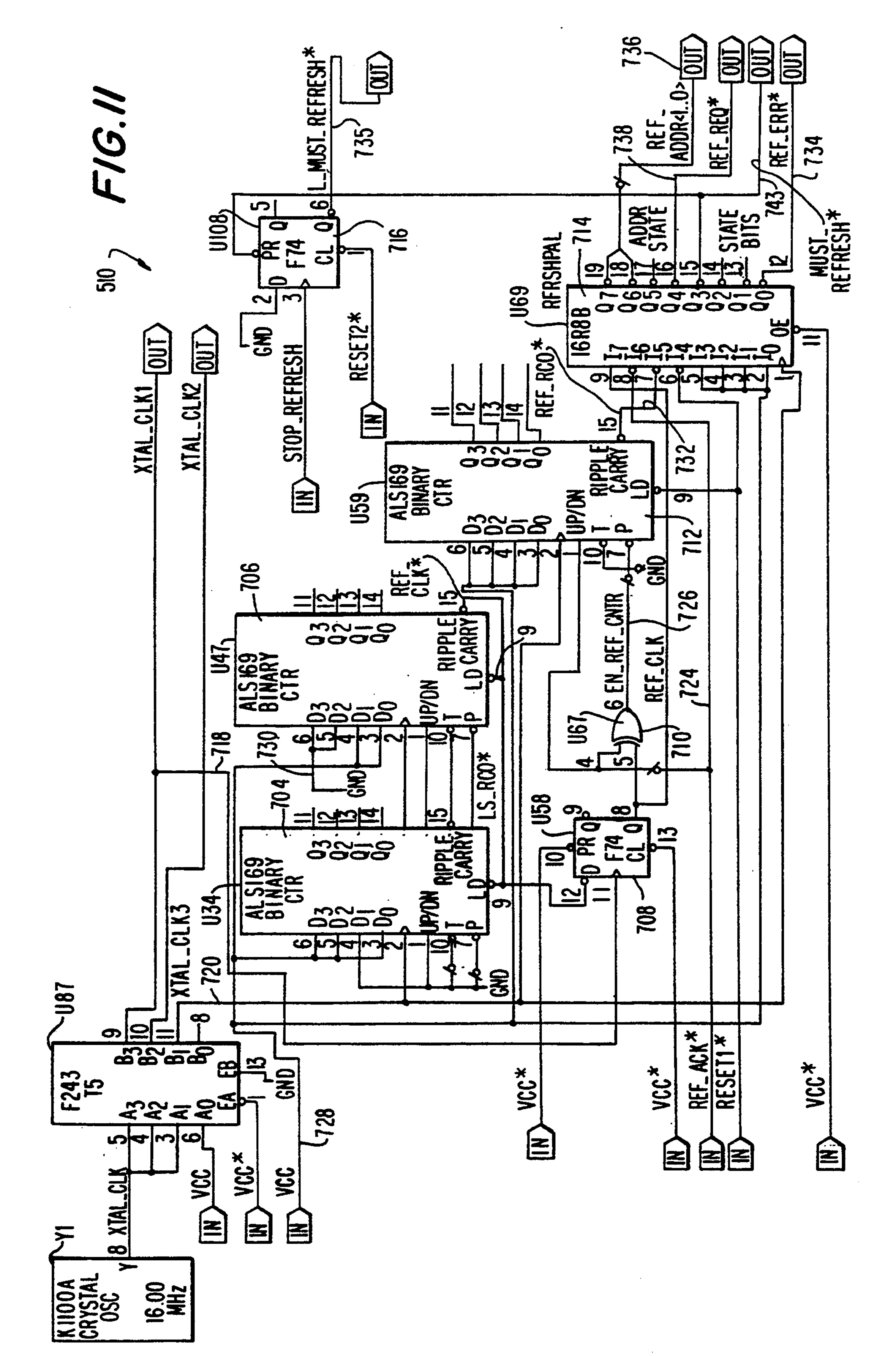
FIG. 11 is a schematic drawing of the refresh control circuitry of the PAC of FIG. 8.

Referring now to FIG. 11, to achieve a REF_CLK* signal with the right period for the refresh sequences, the 16 MHz clock is divided by 62 using 4-bit counters 704 and 706. This provides a REF_CLK* signal with a period of about 3.87 ms, which is within and approximates the maximum refresh request period of 3.9 ms.

The REF_CLK* signal resets counters 704 and 706, and is asserted at the input of flip-flop 708. Flip-flop 708 is clocked by the XTAL_CLK signal on line 718. Exclusive-OR gate 710 processes the REF_ACK* and REF_CLK signals and outputs the EN_REF_CNTR signal on line 726 to the parallel enables of counter 712. The output of counter 712 is the REF_RCO* signal on line 732, which is input to refresh PAL 714. Since transfer cycles cannot be interrupted, the refresh circuitry preferably can accumulate REF_CLK signals. Accordingly, a burst of refresh cycles are performed immediately after the transfer cycle is complete.

Refresh cycles are accumulated during the HME sampling time and during normal CPU accesses. Refresh PAL 714 provides at its output a 2-bit address for input to the PAM for performing refresh cycles. The second output is the REF_REQ* signal on line 738. The other output is the MUST_REFRESH* signal on line 740 and the REF_ERR* signal on line 734.

During synchronous transfer cycles, refresh control circuitry 510 may accumulate up to seven REF_CLK signals. This occurs at the minimum pattern clock rate used for synchronous transfers of 1 MHz. During CPU accesses and asynchronous transfer cycles, only one or two refresh clocks usually need to be accumulated. Holding refresh cycles while the sample strobe is active also causes REF_CLKs to accumulate. The width of the sample strobe determines the number of refresh requests accumulated.

The MUST_REFRESH* signal is also input to flip-flop 716. This flip-flop is clocked by the STOP_REFRESH* 3 signal. The output of the flip-flop (from the "Q*" output terminal) is the L_MUST_REFRESH* signal on line 735. The STOP_REFRESH will be used to clock the flip-flop when a pattern presentation starts or when the MUST_REFRESH* signal is asserted.

Figure 12:
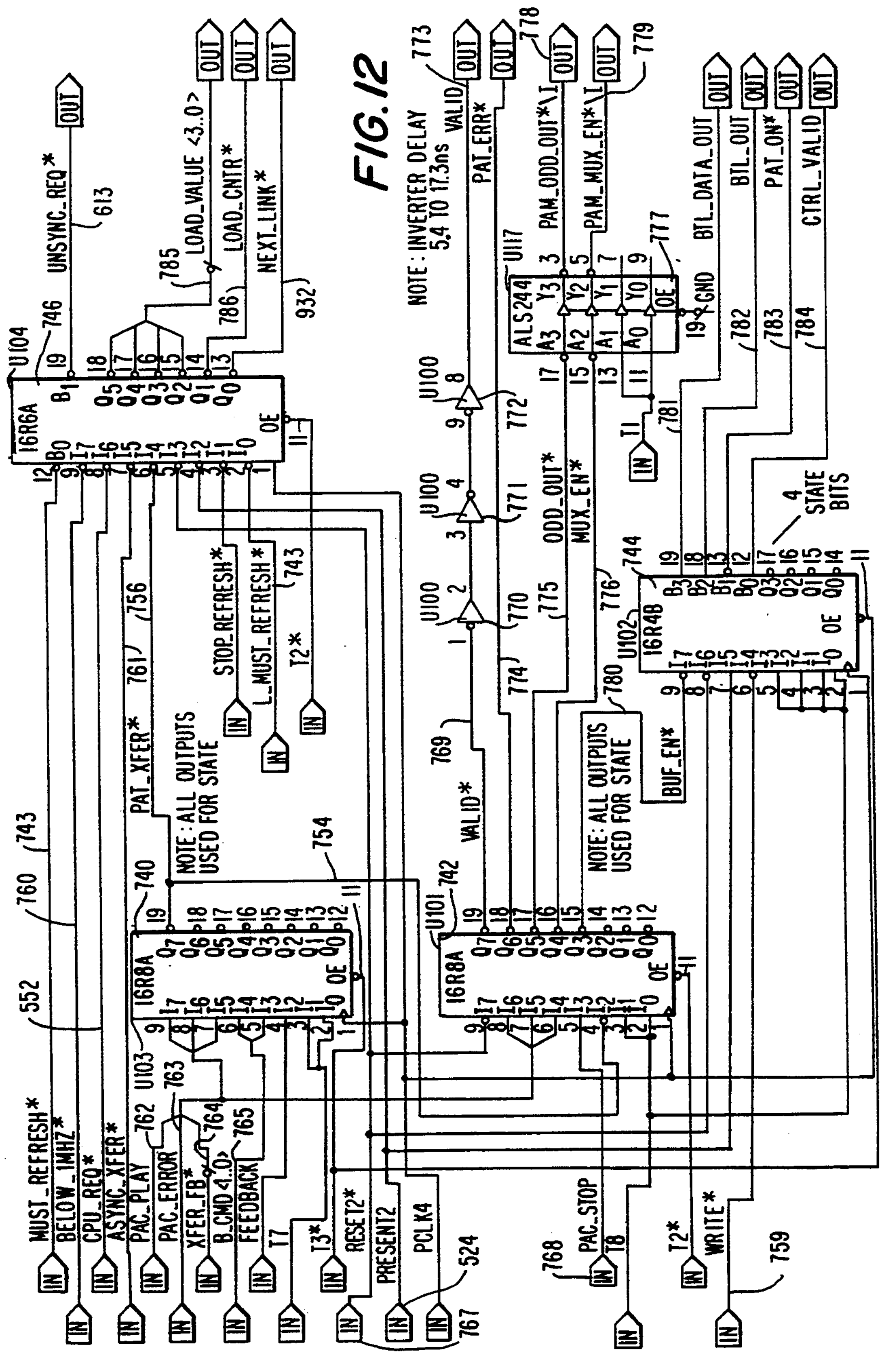
FIGS. 12 and 13 are schematic drawings of the pattern control circuitry of the PAC of FIG. 8.
Figure 13:
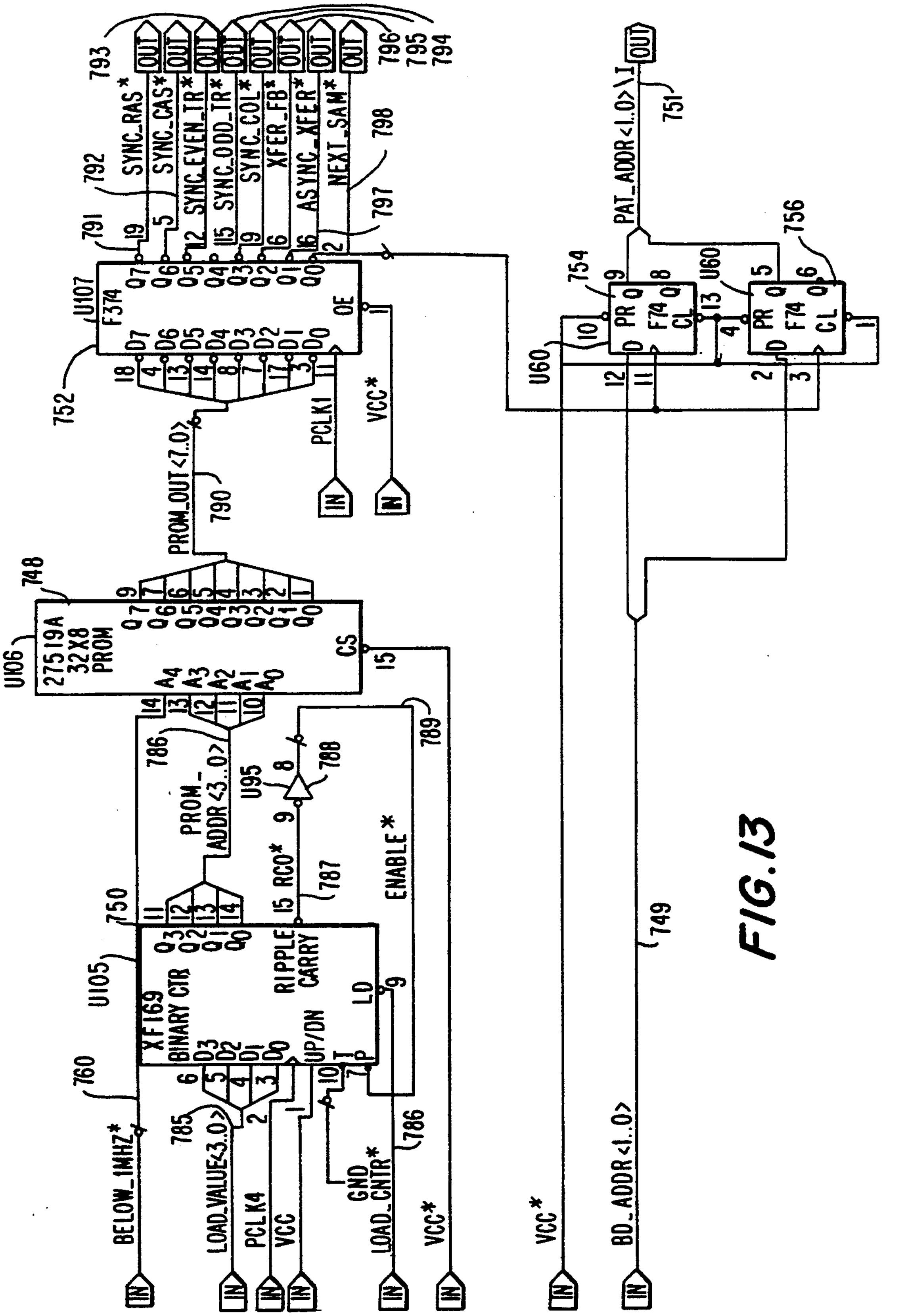

FIGS. 12 and 13 show pattern control circuitry 508. This circuitry includes, for the most part, a series of interconnected PALs and a PROM. Pattern control circuitry 508 uses the PCLK signal and, therefore, is only active during pattern presentation mode. Pattern control 508 performs several functions. It determines when the Pattern Bus changes from CPU access mode to pattern presentation mode, detects error conditions which occur during pattern presentation, indicates that a pattern-block branch must take place, indicates that a transfer operation is in progress, and indicates when a transfer cycle is complete.

Pattern Control 508 includes transfer PAL 740, Pattern control PAL 742, buffer control PAL 744, request PAL 746, transfer PROM 748, 4-bit counter 750, and register 752. Transfer PAL 740 includes pattern transfer circuitry and the branch circuitry.

The pattern transfer circuitry has one internal and three external inputs and a single output. The external inputs are the PAC_PLAY signal on line 762, PAC_ERROR signal on line 763, and XFER_FB* signal on line 764. The PAC_PLAY signal is the PLAY signal that has been buffered, inverted, and registered. A change in state of this signal informs the pattern transfer circuitry when the operating mode changes between the access mode and presentation mode. The PAC_ERROR signal is the ERROR signal on line 763 after it has been buffered, inverted, and registered. A change in state of this signal informs the pattern transfer circuitry that an error has been detected during pattern presentation.

The BRANCH signal is an output of the branch circuitry and is internally connected to the pattern transfer circuitry. This signal indicates that a pattern-block branch must take place. The XFER_FB* signal is an output of transfer PROM 748 and registered by register 752. It indicates that a transfer cycle is complete. The output of the pattern transfer circuitry is the PAT_XFER* signal on line 756. This signal is input to pattern control PAL 742 and request PAL 746 via lines 754 and 756, respectively. When asserted, this output indicates that a transfer operation is in progress.

The branch circuitry of transfer PAL 740 has three inputs. These are the 2-bit B_CMD signal on line 765 and the FEEDBACK signal on line 766. The output of the circuitry is the previously discussed BRANCH signal. The B_CMD bits reside in the PAM and are clocked into the PAC during pattern play. Prior to the 2-bit B_CMD signal being input to the transfer PAL, it is gated with the CNTL_VALID signal on line 784, which output from buffer control PAL 744. Therefore, when the pattern data is not valid, the signal will not be asserted. The FEEDBACK signal is the registered FB_OUT* signal. The output of the branch circuitry is the BRANCH signal, which is sent to the pattern transfer circuitry via an internal connection.

As stated, the PAT_XFER* signal on line 754 is input to pattern control PAL 742. The other inputs to the PAL are the RESET* signal on line 767, the PAC_PLAY signal on line 762, the PAC_ERROR signal on the 763, the XFER_FB* signal on line 764, and the PAC_STOP signal on line 768. The PAC_PLAY, PAC_ERROR, and XFER_FB* signals have been previously described, and those descriptions apply here. The RESET* signal is the Pattern Bus RESET* signal that has been buffered. The PAC_STOP signal is similar to the 2-bit B_CMD signal sent to transfer PAL 740. The PAC_STOP signal is asserted in case the PAC_ERR* signal is asserted while a transfer is taking place. This will allow the transfer to be completed.

The pattern control PAL has five outputs. These are the VALID signal on line 769, the ODD_OUT* signal on line 775, the MUX_EN* signal on line 776, and the BUF_EN* signal on line 780. The MUX_EN* signal is a PAM enable signal that is input to buffer 777. The ODD_OUT* signal is also input to buffer 777. The output of buffer 777 is the PAM_ODD_OUT* signal on line 778 and the PAM_MUX_EN* signal on line 779. When the PAM_MUX_EN* is asserted, it enables the pattern data multiplexers on the selected PAM board. The PAM_ODD_OUT* signal is the pattern clock divided by two, which turns on and off at the beginning and end of pattern play, respectively. It is sent to the PAM boards, where it is registered on the rising edge of the PCLK signal.

The VALID* signal is the Pattern Bus DATA_VALID* signal, before it is registered, level shifted, and placed on the Pattern Bus.

The BUF_EN* signal on line 780 is input to buffer control PAL 744. This signal, after further registering, is the signal that will be used for enabling the outputs.

Buffer control PAL 744 generates control signals which direct and gate pattern data during the presentation mode. The inputs to the PAL are the BUF_EN* signals on line 780, the RESET* signal on line 767, the PRESENT signal on line 524, and the WRITE* signal on line 759. The BUF_EN* signal is used to synchronously generate four state bits. These bits are routed internally to combinational logic, which then uses the remaining inputs to generate the four output signals.

PAL 744 outputs the BTL_DATA_OUT signal on line 781, the BTL_OUT signal on line 782, the PAT_ON* signal on line 783, and the CTRL_VALID signal on line 784. The BTL_DATA_OUT signal controls the direction of the four BTL transceivers used for the lower 32 pattern bits of backplane I/F 512. These bits differ from the remaining 48 pattern bits in that the lower bits are used as the shared address/data bus during access mode.

The BTL_OUT signal controls the direction of the bus transceiver of the backplane I/F. The transceiver receives the 5-bit PARITY signal and a 3-bit PEL_CTL signal. The BTL_OUT signal is asserted when the RESET* signal is asserted.

The PAT_ON* signal enables the registers of the backplane I/F used for the lower 32 pattern bits, the 5-bit PAM PARITY signal, and the 3-bit PAM_PEL_CTL signal, and enables the BTL transceivers of the backplane I/F used for the upper 48 pattern bits. The PAT_ON* signal is asserted when the pattern-on state bit and the PRESENT signal are asserted and the RESET* signal is deasserted. As discussed, the CTRL_VALID signal is gated with the branch command bits and the stop bit PAM_STOP signal when pattern data is not valid. The PARITY_VALID signal is the registered CTRL_VALID signal. When the PARTY_VALID signal is asserted and the P_CHECK signal is asserted, the PRTY_ERROR signal is asserted. The error signal will disable the control word parity checker until the pattern data is valid. The CTRL_VALID signal is deasserted when the control-valid state bit is deasserted, the PRESENT signal is deasserted during the access mode, or the RESET signal line is asserted.

Request PAL 746 has asynchronous and synchronous sections. The asynchronous section combines CPU requests, synchronous transfer requests, and asynchronous transfer requests for generating the UNSYNC_REQ* signal on line 613. This signal is sent to the request state machine. Request PAL 746 also has a synchronous section which is used only during pattern play. During this time, the request PAL generates six outputs which are the LOAD_CNTR* signal on line 786, NEXT_LINK* signal on line 932, and a 4-bit LOAD_VALUE signal on line 785.

Request PAL 746 has nine inputs; some of these signals have been previously described. The inputs to the request PAL were the RESET* signal on line 767, PRESENT signal on line 524, CPU_REQ* signal on line 552, BELOW_1 MHZ* signal on line 760, ASYNC_XFER* signal on line 761, PAT_XFER* signal on line 756, STOP_REFRESH* signal on line 741, L_MUST_REFRESH* signal on line 743, and MUST_REFRESH signal on line 743. The RESET* signal places the synchronous section of the PAL in a state in which the 4-bit LOAD_VALUE signal is asserted and each of the bits has a logic high value. This will allow the counter used by transfer PROM 748 to be loaded with a hexadecimal "F." The assertion of the RESET* signal also deasserts the UNSYNC_REQ* signal output from the PAL. Once RESET* is deasserted, the synchronous state machine goes to a wait state.

The PRESENT bit informs the asynchronous section of the request circuitry which mode the Pattern Bus is in.

The CPU_REQ* signal is asserted whenever the PAC/PAM is selected during access mode. When asserted, it will cause the UNSYNC_REQ* signal to be asserted.

During presentation mode, the BELOW_1 MHZ* signal determines whether the ASYNC_XFER* or the PAT_XFER* signal is used to generate the UNSYNC_REQ* signal. When the BELOW_1 MHZ* signal is asserted, the ASYNC_XFER* signal is used. Conversely, the PAT_XFER* signal generates the UNSYNC_REQ* signal when the BELOW_1 MHZ* signal is deasserted.

The synchronous section of the PAL always uses the PAT_XFER* signal. When the PAT_XFER* signal is first asserted, the synchronous section begins to count. In doing this, the LOAD_VALUE bits are used as a non-sequential counter. On the thirteenth count, the LOAD_CNTR* signal on line 786 is deasserted for one pattern clock cycle. This loads a seven into binary counter 750 that connects to transfer PROM 748. The request PAL then waits until the PAT_XFER* signal is deasserted before returning to a wait state which looks for the PAT_XFER* signal to be asserted. The remaining output of request PAL 746 is the NEXT_LINK* signal on line 932. This signal is the PAT_XFER* signal delayed one clock cycle.

The STOP_REFRESH* signal is the TTL version of the ECL SAMPLE signal. During HME sample periods, the STOP_REFRESH* signal is asserted and the BELOW_1 MHZ* signal is deasserted. The UNSYNC_REQ* signal output from the request PAL is asserted and clocked into the request circuitry synchronizer. The 2-bit REQ_CODE signal indicates a synchronous transfer request. This prevents the request circuitry from performing refresh cycles during the sample period.

The MUST_REFRESH* signal on line 743 is an output of refresh circuitry 510. If refresh cycles are being withheld, and more than 48 cycles are counted, the MUST_REFRESH* signal is asserted. This causes request PAL 746 to ignore the STOP_REFRESH* signal on line 741 and to deassert the UNSYNC_REQ* signal. The L_MUST_REFRESH* signal serves an identical function. It is necessary only when the MUST_REFRESH* signal is removed once refresh cycles begin to take place, even though refresh circuitry 510 has not processed all of the accumulated refresh clocks.

The transfer PROM 748 and its associated circuitry are used during presentation mode to provide various branch/transfer control signals. This circuitry includes PROM 748, 4-bit binary counter 750, and octal register 752. Binary counter 750 is normally disabled until it is loaded by request PAL 746 during a transfer operation. Once loaded with a seven, the binary counter is enabled and begins to count until it reaches a terminal count of hexadecimal "F." The output of the binary counter is the 4-bit PROM_ADDR signal that forms the lower four address bits for PROM 748. The highest order address bit is the BELOW_1 MHZ* signal. This bit determines whether the PROM generates signals appropriate for synchronous transfer or asynchronous transfer. Waveforms are stored within PROM 748 and are output as the counter sequences through the PROM.

During synchronous transfers, when memory control signals are generated using the P_CLK signal, transfer PROM 748 outputs the SYNC_RAS* and SYNC_CAS* signals output for the register 752 on line 791 and 792, respectively, SYNC_COL* signal on line 795, and the SYNC_EVEN_TR* signal and SYNC_ODD_TR* signals on lines 793 and 794, respectively. During asynchronous transfers, the ASYNC_XFER* signal is asserted during the appropriate clock cycle. The ASYNC_XFER* signal is sent to request PAL 746.

During both types of transfer cycles, the transfer PROM circuitry generates the XFER_FB* signal on line 796 and the NEXT_SAM* signal on line 798. The XFER_FB* signal is a timing signal used by both transfer PAL 740 and pattern control PAL 742. The rising edge of the NEXT_SAM* signal registers the 2-bit BD_ADDR signal on line 749. This signal is from the link table circuitry. The BD_ADDR signal is registered and becomes the address for the next transfer operation. The NEXT_SAM* signal also loads the block offset counter with an FC, so that the count will be zero coincident with the first pattern resulting from the transfer.

Figure 14:
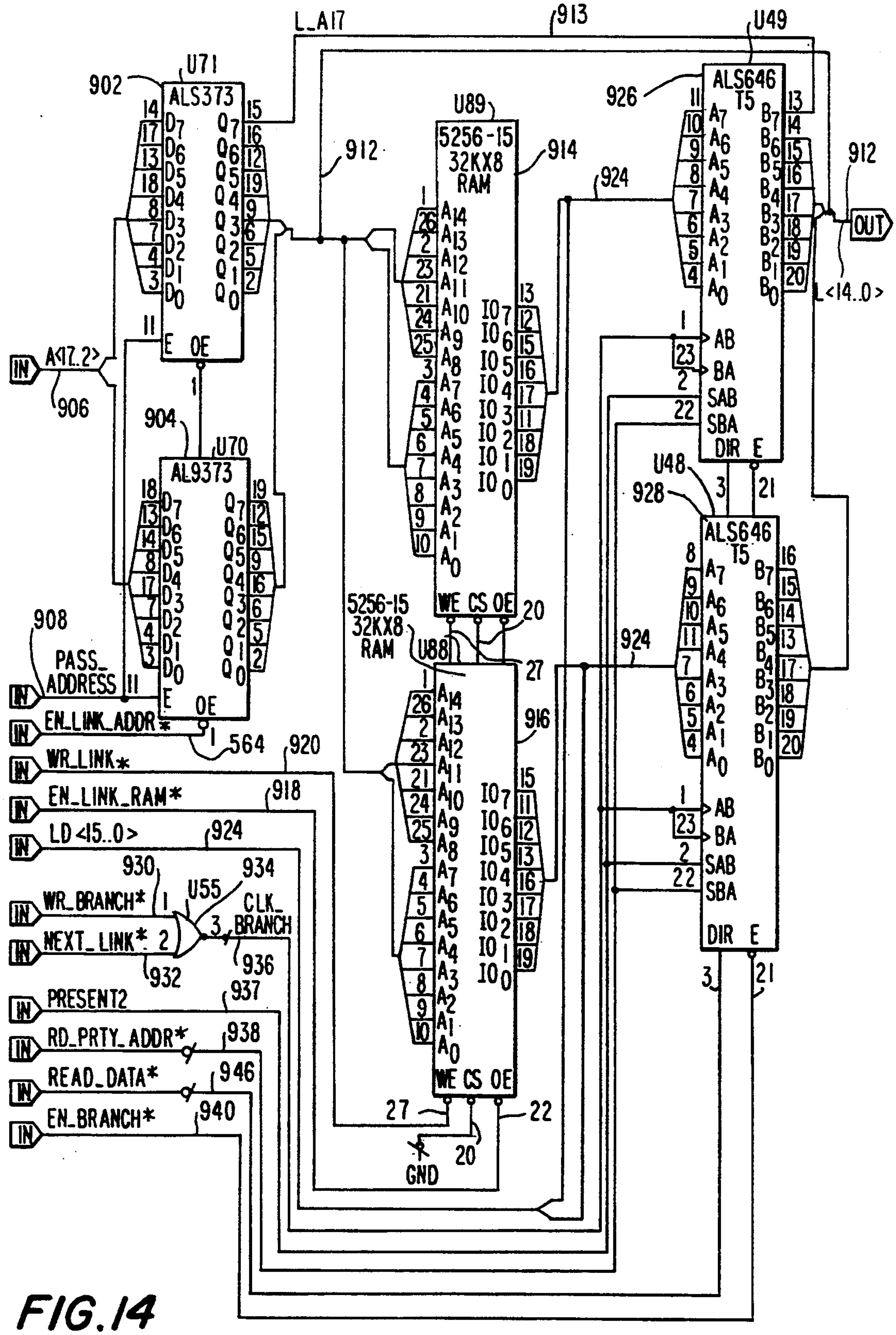
FIG. 14 is a schematic drawing of the link table circuitry of the PAC of FIG. 8.

FIG. 14 shows the elements of link table 506. The link table includes latches 902 and 904, RAMs 914 and 916, and bi-directional shift registers 926 and 928. The 16 bits from PAC address bus 906 are input to latches 902 and 908, with latch 902 receiving the upper order bits and latch 904 receiving the lower order bits. The PASS_ADDRESS signal on line 908 is input to the latch control inputs of latches 902 and 904. This active high signal indicates that no parity errors have been detected in the pattern control word. The EN_LINK_ADDR* signal on line 564 is input to the output enable inputs of the latches. This signal is one of the link table control signals output from decode logic 520 of the TMG/CPU I/F 502.

The output of the latches, except for the highest order bit, are placed on the link address bus 912. This consists of 15 of the 16 bits. The highest order bit on line 913 is input to bi-directional shift register 926 for placement on link data bus 924. The 15-bit address bus connects to the address inputs to RAMs 914 and 916. The signals input to the control inputs of the RAMs are the WR_LINK* signal on line 920, which is input to the write enable inputs, and the EN_LINK_RAM* signal on line 918.

The data inputs of RAMs 914 and 916 are connected to link data bus 924. The data bus also connects to bi-directional shift registers 926 and 928, such that the high order bits connect to register 926 and the low order bits connect to register 928. The inputs to the shift registers, in addition to the highest order address bit previously discussed, are the remaining 15 bits of link address bus 912.

The CLK_BRANCH signal on line 936 clocks the shift registers. The CLK_BRANCH signal is the output of AND gate 934. The signals input to AND gate 934 are the WR_BRANCH* signal on line 930 and the NEXT_LINK* signal on line 932. The WR_BRANCH* signal is one of the outputs of the PAC write control decoder and the NEXT_LINK* signal is one of the outputs from the request PAL 746.

The PRESENT signal on line 937 and the RD_PRTY_ADDR* signal on line 938 are input to the control inputs of the shift registers. The PRESENT signal has been discussed. The RD_PRTY_ADDR* signal is one of the outputs from the PAC read control decoder.

The other control inputs to the shift registers are the READ_DATA* signal on line 546 and the EN_BRANCH* signal on line 940. The previously discussed READ_DATA* signal is input to the direction input. The EN_BRANCH* signal is one of the outputs from decoder logic 520 of TMG/CPU I/F 502, and is input to the output enable of the shift registers.

Now considering the circuit and its operation, isolated blocks of PAM memory are linked together by the link table. During the presentation mode, the 15-bit address bus that connects to shift registers 926 and 928, which are the branch registers, is routed to both the address generator which creates the PAM address for the next branch operation and to the 15-bit address of the link table memory.

Each time a branch occurs, the shift registers are clocked. In this manner, the link table data bits on line 924 become link table address bits on line 912, which look up the next branch address. This process is continued until pattern presentation is complete.

During the access mode, latches 902 and 904 allow the CPU to read from, and write to, RAMs 914 and 916, and branch shift registers 926 and 928.

Pattern Memory

Figure 15:
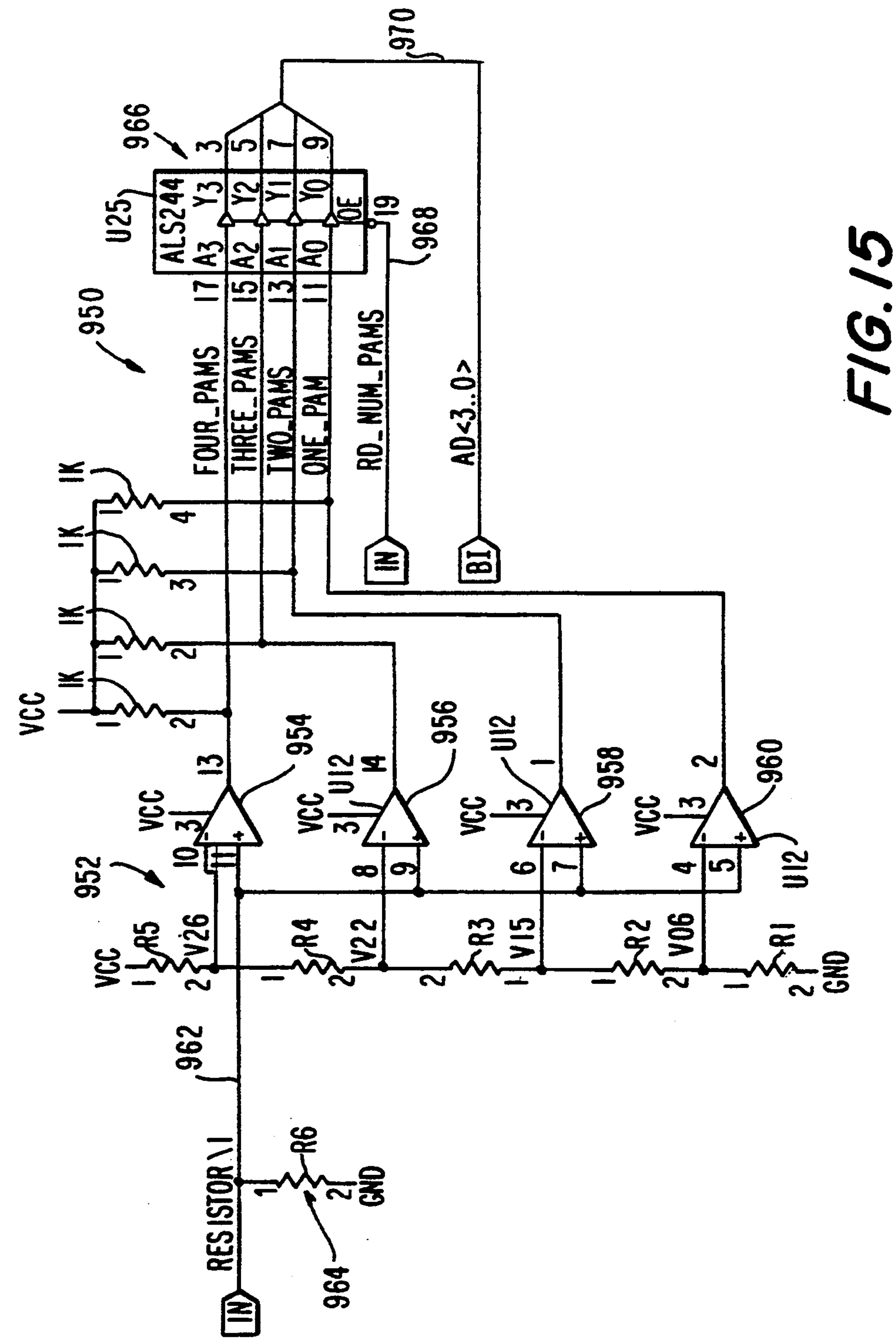
FIG. 15 is a schematic drawing of the PAM detection circuitry of the PAC of FIG. 8.
Figure 16:
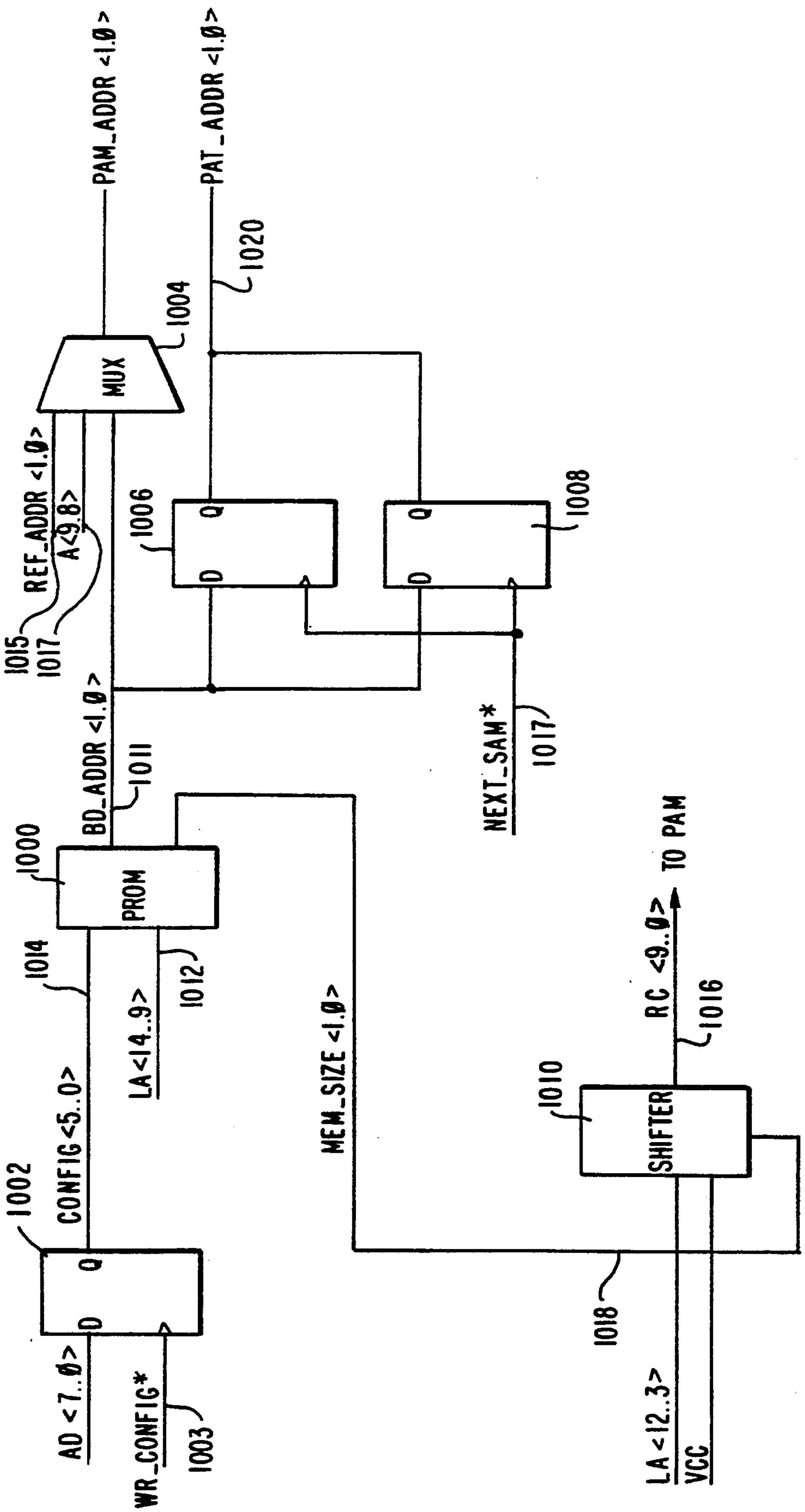
FIG. 16 is a schematic drawing of the Configuration PROM and associated circuitry of the PAC of FIG. 8.

FIGS. 15, 16, and 19 refer to the PAM circuitry and circuitry used for selecting specific PAM memory during the access and presentation modes.

Pattern memory 514, shown in FIG. 8, includes one or more individual PAM boards 516. Each PAM board is capable of storing 102-bit wide words, which are referred to as "patterns." Each of the individual PAM boards can store 128K, 512K, 2M, or 8M patterns (by 102 bits wide). The maximum memory depth of each PAM board depends upon the capacity of the VRAMs on it.

Referring to FIG. 15, analog comparator circuit 950 is shown. This circuit preferably is disposed on PAC 258. Its purpose is to determine the number of PAM boards that are connected to PAC 258. A resistor divider network 952 provides comparators 954, 956, 958, and 960 with a separate reference voltages. Nominally, these voltages are 2.50 v, 2.07 v, 1.48 v, and 0.55 v, respectively. The other input of each comparator is tied to a common signal, which in this case is the RESISTOR signal on line 962, and is a wire-tied composite of the RESISTOR signal from each PAM. Line 962 is connected to ground through 162 ohm resistor 964. Each PAM RESISTOR signal is based on PAM VCC after passing through a 562 Ohm resistor. As PAMs are added to the PAC, the 562 Ohm resistors are added in parallel and, therefore, the voltage seen at the input to each of the comparators increases. Each incremental change of voltage, caused by the addition of a PAM board, crosses one of the voltage thresholds. The nominal voltage of the comparator circuit input is 0 V for no PAMs, 1.12 V for one PAM, 1.83 V for two PAMs, 2.31 V for three PAMs, and 2.67 V for four PAMs. The comparator outputs are routed to a 4-bit buffer 966 which may be read during CPU access mode by asserting the RD_NUM_PAMS* signal on line 968. When read, the output of buffer 966 is placed on the 4-bit PAM AD bus on line 970. The number of logic high values in buffer 966 indicates the number of PAMs on PAC 258.

FIG. 16 shows configuration PROM 1000 and its supporting circuitry. Configuration PROM 1000 serves as a look-up table. It has a 12-bit input and a 4-bit output. The input comprises two signals: the 6-bit CONFIG signal on line 1014, and the 6-bit LA (link address) signal on line 1012. The 6-bit LA signal is from the PAC row/column generation circuitry. The CONFIG signal is based on the number and size of the PAMs connected to PAC 258.

The output of PROM 1000 consists of a 2-bit BD_ADDR signal on line 1011 and a 2-bit MEM_SIZE signal on line 1018. BD_ADDR is input to two D flip-flops 1006 and 1008. These flip-flop are clocked by the NEXT_SAM* signal on line 1017. The output of the flip-flops is the 2-bit PAT_ADDR signal on line 1020.

BD_ADDR signal on line 1011 is multiplexed with the 2-bit REF_ADDR signal on line 1015 and 2 bits of the PAL address bus on line 1017. The output of multiplexer 1054 is the 2-bit PAM_ADDR signal.

The MEM_SIZE signal on line 1018 is input to the control input of shift register 1010. The signals determine the row/column selection for memory. An access to a 128K PAM requires a 2-bit shift. A 2M PAM would require a three bit shift.

On the basis of the 6-bit LA signal and 6-bit CONFIG signal, Configuration PROM 1000 determines which PAM board is being addressed and outputs the signal which corresponds to the appropriate board.

Each time pattern memory 514 is accessed, the 32-bit Pattern Bus address must be converted into a 2-bit board address and a multiplexed row/column address. Such a conversion must also be made to the link table address during branching operations. Both the link table address and 22 bits of the CPU address bus are sent to a multiplexer circuit. During CPU access mode, the CPU address bus is selected. During pattern presentation mode, the 15-bit link table address (appended with seven zeros as the least significant bits) is selected. The 6 most significant bits of this 22-bit multiplexed address bus are sent to configuration PROM 1000 (the LA signal). The 20 least significant bits are multiplexed onto a ten bit row/column address bus before being sent to the PAMs.

Figure 17:
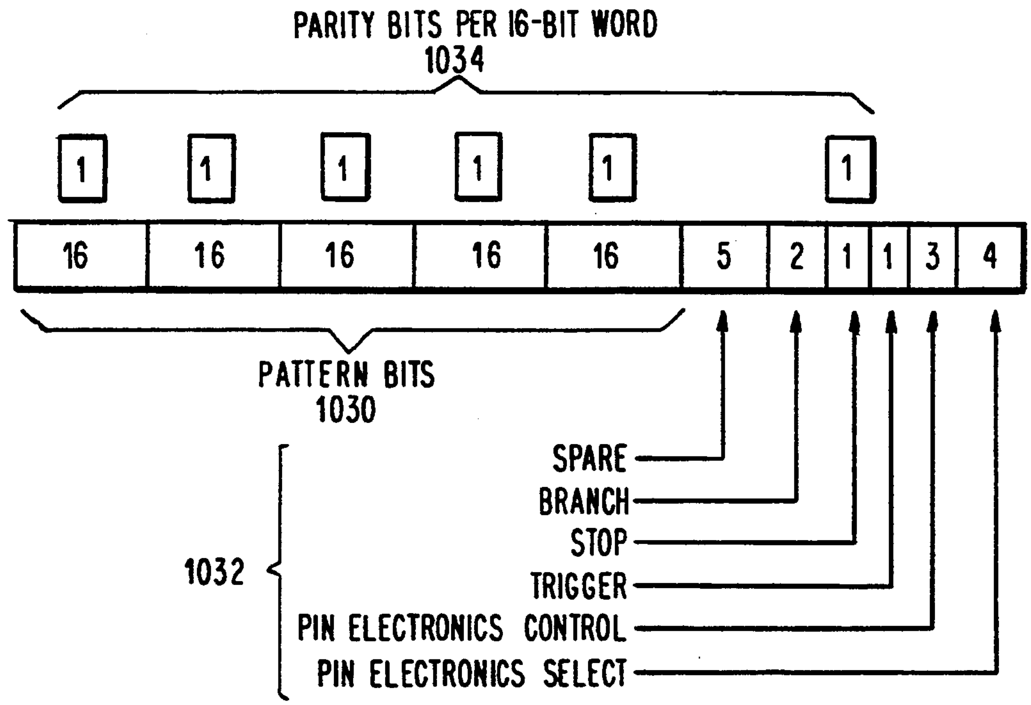
FIG. 17 is a block diagram of the 102-bit pattern word according to the present invention.

FIG. 17 shows an example of a pattern control word. Pattern words preferably are 102 bits wide including 6 parity bits, 80 data bits and 16 control bits which are shown at 1030 and 1032, respectively. There is one parity bit for every 16 data bits, and one parity bit for the 16 control bits. For HME devices wider than 80 pins, PACs in the multiple lanes are programmed with the same pattern control words and run synchronously.

Figure 18:
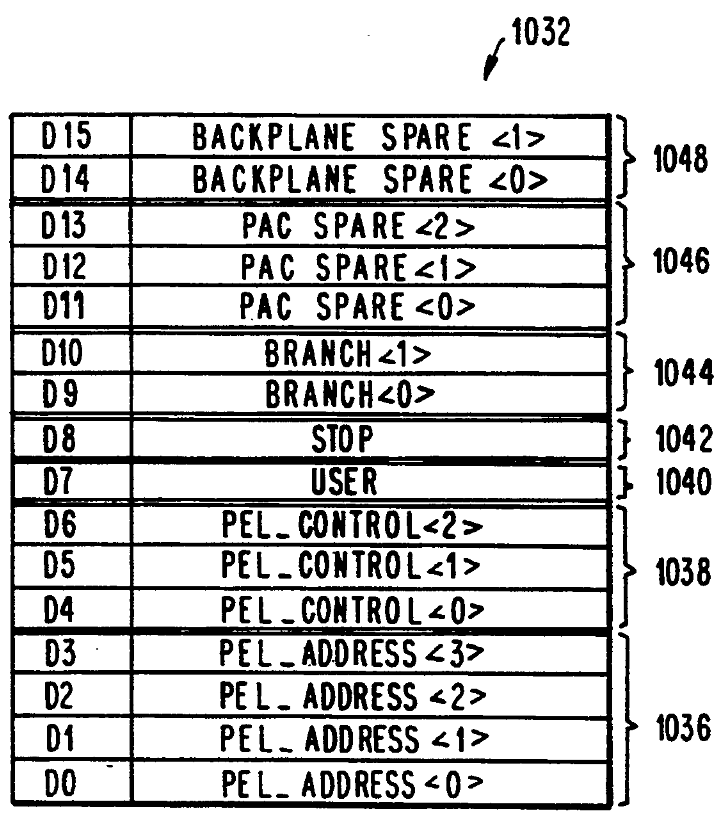
FIG. 18 shows bit assignments of the pattern control word according to the present invention.

Referring now to FIG. 18, control word 1032, which is part of each pattern in the sequence, includes 16 bits, illustratively labelled D0 through D15. Control word 1032 preferably includes the four PEL_ADDR bits at 1036 for addressing PEL 266 during pattern presentation. The three PEL_CONTROL bits 1038 are driven on the Pattern Bus during pattern presentation and are used by TG 248 and PELs 266. These bits control the function of the CICs on the PEL.

Control word 1032 preferably includes the USER bit at 1040. The bit may be driven to a test point on DAB 268. For this purpose, it is also driven onto the Pattern Bus for receipt by the PEL during pattern presentation. This bit preferably is asserted throughout pattern presentation.

The STOP bit at 1042 preferably is provided to inform a PAC that a pattern sequence is complete. After the STOP bit is recognized, the PAC outputs three more patterns onto the Pattern Bus before halting. Therefore, the STOP bit must be stored three patterns ahead of the last pattern.

Control word 1032 preferably includes the 2 BRANCH bits at 1044. These bits are for controlling pattern-block branching during pattern presentation. The two bits may be set to one of four states, as shown in Table 4.

TABLE 4

| D10 | D9 | BRANCH COMMAND |
|---|---|---|
| 0 | 0 | BRANCH NEVER |
| 0 | 1 | BRANCH ALWAYS |
| 1 | 0 | BRANCH ON FALLING FEEDBACK |
| 1 | 1 | BRANCH ON RISING FEEDBACK |

"Branch never" causes the pattern sequence to continue sequentially without branching. "Branch always" causes unconditional branching to the link address. The remaining two commands cause conditional branching, conditioned by either the falling or rising edge of the FEEDBACK signals. Branching on the FEEDBACK signal is used to initialize non-resettable HMEs, as will be described.

The branch commands of "branch always" or "branch on feedback" must be specified 26 patterns before the last pattern to be presented in the current pattern block. Also, branch commands must be placed in "odd" numbered patterns in a pattern sequence because pattern memory is interleaved.

The remaining 5 bits of the control word at 1046 and 1048 preferably are spare bits, which are driven to the PAC or onto the Pattern Bus during pattern presentation.

PAMs are addressed by the CPU in three banks, each 32 bits wide. This memory organization requires that each pattern which is stored in a sequence must be stored across all three banks.

Division of the PAM is treated differently during access and presentation mode. During CPU access mode, pattern memory 514 is divided into the three banks, and each bank is further divided into a low data word and a high data word. During pattern presentation mode, however, the memory is divided into two banks, even and odd. Each "even" memory bank is paired with an "odd" memory bank. The serial output ports of each pair are connected to a multiplexer. The outputs of the various multiplexers are routed to data connectors. The connectors route the data to registers of PAC 258. This multiplexing allows the memories to be operated at one half the pattern presentation rate. The even and odd banks are clocked with complementary versions of the pattern clock.

FIG. 19 shows the PAM control circuitry located on the PAM. The PAM control circuitry includes a PAM decode PAL 1050, a PAM PAL 1060, two row address strobe ("RAS") PALs 1064 and 1066, column address strobe ("CAS") buffers 1068, a parity PAL 1080, and the data and parity memory banks 1070 and 1072.

The 2-bit PAM ADDR signal on line 1019 is input to PAM decode PAL 1050. The second input to PAL 1050 is the 2-bit STRAP signal from DIP switch 1052. The outputs of PAL 1050 include the PRTY_WRITE* signal on line 1053, the PAM_SEC* signal on line 1055, PAM_ACCESS* signal on line 1051, and the PAM_READ* signal on line 1057. The PRTY_WRITE* signal is input to register 1074. The PAM_SEL* signal is input to RAS PALs 1064 and 1066 via lines 1065 and 1067, respectively. The PAM_ACCESS* signal enables registers that store data from banks 1070. The PAM_READ* signal, is a control input to transceiver 1084. The READ_ID* signal is a control input to ID PROM 1056. Transceiver 1054 and registers 1074 control the transfer of the RC signal on line 1016 to the data and partity memory banks. The PRTY_WRITE* signal on line 1053 enables register 1074.

PAM PAL 1060 receives the STRAP signal from DIP switches 1052 and input signals from registers 1058 via line 1059. Line 1059 carries the registered PAT_ADDR and PAM_MUX_EN* signals, and the EVEN_XFER* signal.

The BD_SEL* output is looped back to registers 1058. The other outputs of PAM PAL 1060 are registered in register 1062 which is clocked by the BUF_PCLK signal. The outputs of register 1062 are input to memory banks 1070 and parity memory 1072 on lines 1092 and 1094, and to the control inputs to multiplexers 1086 and 1088 on line 1090.

RAS PALs 1064 and 1066 control the high and low data words, respectively, for each of the three data memory banks 1070 and parity memory bank 1072. RAS PALs 1064 and 1066 receive the same input signals, except that PAL 1064 receives the H_WORD* signal, and PAL 1066 receives the L_WORD* signal. The other inputs to PALs 1064 and 1066 via lines 1065 and 1067 include: the EVEN_XFER* signal from register 1058, the PAM_SEL* signal from PAM decode PAL 1050, the RAS* signal, and various bank select signals. High and low CAS buffers 1068 receive buffered CAS* signals, and transmit them to the data and parity memory banks 1070 and 1072.

The inputs to parity PAL 1080 are the WS* signal on line 1083, the 2-bit SEL_BANK signal on line 1085, and the H_PARITY and L_PARITY signals on line 1081, which are outputs of H_PARITY multiplexer 1082. The outputs of parity PAL 1080 are the 3-bit H_PRTY signal and the 3-bit L_PRTY signal on line 1079. These outputs are input to parity memory 1072 and multiplexer 1082.

Multiplexer 1082 is controlled by the 2-bit SEL_BANK signal on line 1085. Multiplexer 1082 and transceiver 1084 are enabled by the PAM_READ* signal on line 1057 that is output from PAM decode PAL 1050.

Register 1076 and multiplexer 1078 transmit the buffered ODD_TR/OE* and EVEN_TR/OE* signals on line 1087. These signals enable the inputs of memory banks 1070 and 1072.

Figure 20:
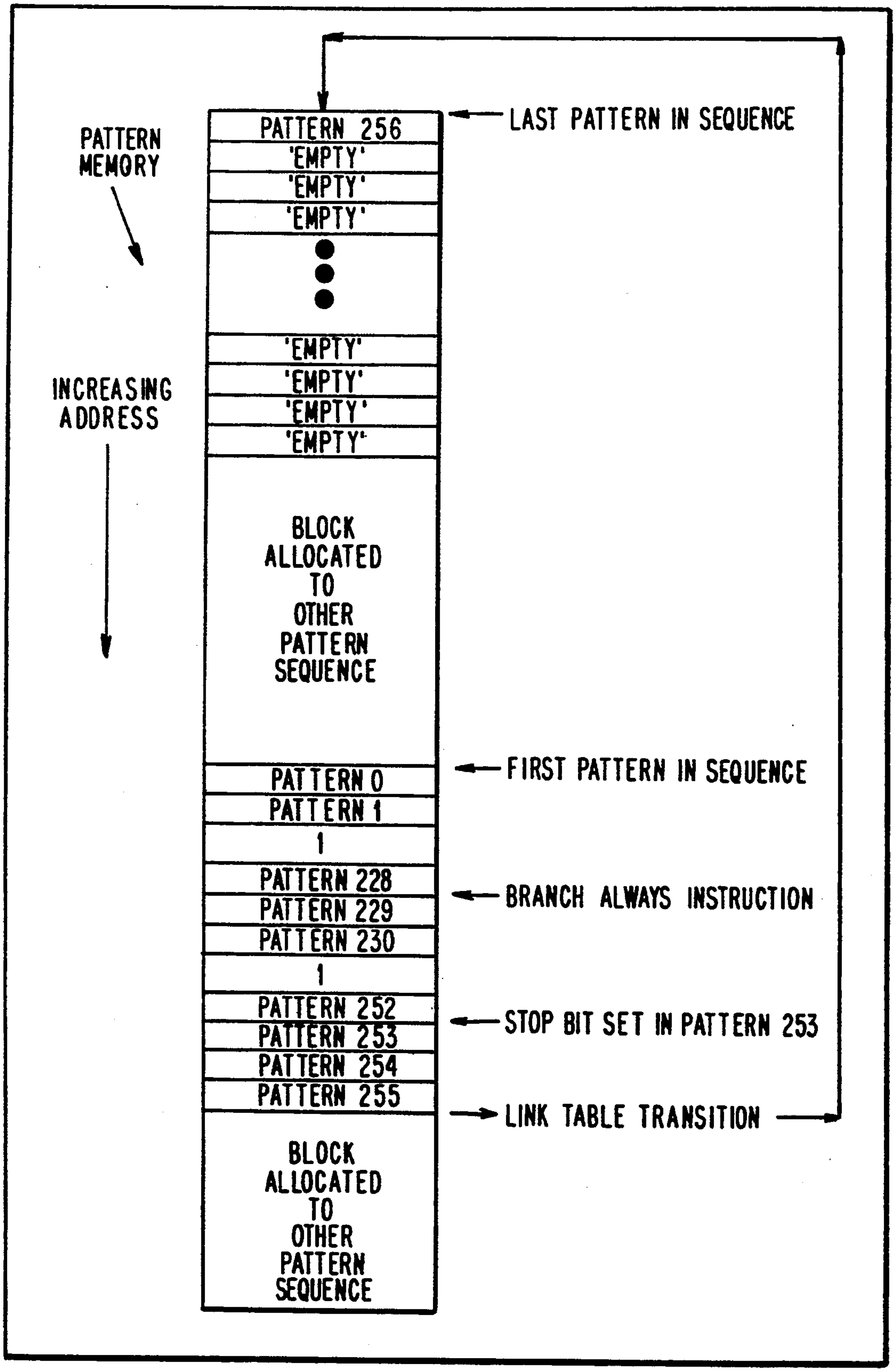
FIG. 20 is a block diagram of a pattern sequence according to the present invention.

Referring to FIG. 20, as pattern sequences are created, pattern memory is allocated in 256-pattern blocks. The blocks need not be contiguous within the memory because link table 506 causes PAC 258 to branch from one block to the next, creating a continuous output. The first pattern in any sequence must be stored on a block boundary.

The following is a description of accessing pattern memory and its presentation. The patterns to be presented preferably are stored in VRAMs. Each of the VRAMs of the PAM contains a serial shift register. This register is as long as a row within the VRAM array (256 bits for the VRAM used on the 128K PAM). The pattern data, when requested, is transferred to the VRAM shift register. Bits may then be shifted from this register at the preferred clock speed of 25 MHz. The 16-bit address specified in link table 506 defines the VRAM address of the next block to be transferred to the VRAM shift register. At the initiation of pattern presentation, a starting address in link table 506 must be specified for retrieving data from the VRAM.

Shift register transfer requests occur during pattern presentation. Any row within the VRAM may be transferred to the shift register by performing a shift register transfer cycle.

The row address selects the memory row that is transferred to the shift register. When the shift register transfer takes place, the column address selects one of the bits of the register as the first to be clocked out. If the shift register contents have all been clocked out and another shift register transfer cycle does not take place, the same data is output again. In other words, the shift register is cyclic.

PAC 258 performs a "feedback initialization" function in which non-resettable HME devices are placed in a known state. To do this, a stimulus pattern sequence is presented to the HME device until the desired state is attained. PAC 258 uses the shift registers inside the VRAM of the PAM to repeatedly present a given sequence of patterns to the device. A row of the VRAM is transferred into the shift register, where it is then continually clocked. Because the shift register is cyclic, the feedback pattern sequence is repeated indefinitely, as long as no branching takes place.

In the preferred embodiment of the invention, PAC 258 will stop presenting the feedback sequence once the device has achieved the desired state. To end feedback initialization and begin presenting normal patterns to the HME, a single-bit FEEDBACK* signal is sent from the HME through the TG to PAC 258. Either the rising or the falling edge of this FEEDBACK* signal is used to determine the state of the HME.

PAM And PAC Registers

As set forth previously, the PAC has been allocated 194 MBytes of CPU address space. The allocation is 192 MBytes to PAMs 514, 1 MByte for link table 506, and 1 MByte for the various control and status registers. The PAC has multiple control and status registers. One such status register is ID PROM 1056. Each PAM that is connected to the PAC also has an ID PROM, of which, ID PROM 1056 of FIG. 19 is representative. In addition, there are four PAM present status registers which are shared between the PAC and PAMs.

Various registers have been discussed in conjunction with the circuitry of which each is part. Here each will be discussed briefly to provide a reference section regarding these registers.

The PAC ID PROM 1056 (FIG. 19) is a 32-by-8 PROM which contains information pertaining to the PAC.

The number of PAMs register 966 is a 4-bit register which indicates the number of PAMs stacked onto the PAC. Table 5 shows the relationship between the number of PAMs connected to the PAC and the bit patterns found in the register. If the bit pattern is other than one of the five shown in Table 5, the PAC/PAM hardware is not functioning properly.

TABLE 5

| D3 | D2 | D1 | D0 | No. of PAMs |
|---|---|---|---|---|
| 0 | 0 | 0 | 0 | 0 |
| 0 | 0 | 0 | 1 | 1 |
| 0 | 0 | 1 | 1 | 2 |
| 0 | 1 | 1 | 1 | 3 |
| 1 | 1 | 1 | 1 | 4 |

Even though the all "0s" condition is legitimate, it is treated as an error condition since the PAC in not fully functional without at least one PAM.

The PAC configuration register 1102 (FIG. 16) is an 8-bit read/write register used to configure the PAC. Six of the bits are set according to the number and types of PAMs connected to the PAC. The 6-bit code is determined as shown in Table 6.

TABLE 6

| | |
|---|---|
| A. | If only one PAM is connected to the PAC:<br>CONFIG_CODE = 60 for a 128K PAM<br>CONFIG_CODE = 61 for a 512K PAM<br>CONFIG_CODE = 62 for a 2M PAM |
| B. | If more than one PAM is connected to the PAC:<br>CONFIG_CODE = [(MEM_SIZE)/128] − 1,<br>where MEM_SIZE is the sum of the size of all PAMs |

The two remaining bits configure the two parity generator/checker circuits. One bit configures the high word circuitry to compute either even or odd parity. The other bit configures the low word parity generator/checker in the same manner. Odd parity preferably is selected during normal operation.

The branch address registers 926 and 928 (FIG. 14) are 15-bit read/write registers used to specify the initial pattern address in block increments. Also, if a pattern sequence terminates due to an error condition, the CPU can examine the branch address register to determine which block was being played when the error occurred.

The error register is a 4-bit read/write error register which, together with a parity error address register indicates the source of an error condition. The CPU clears the error bit by performing a write operation. When the most significant bit is a logic high value, it indicates a refresh error has occurred. This is a fatal error. When the second most significant bit is a logic high value, it indicates a fatal hardware error. This error is generated by the state machine operating with the on-board 16 MHz clock. When the third most significant bit has a logic high value, it indicates that state machine operating the pattern clock has detected an error. This could be due to faulty hardware or an improperly loaded PAM. When the least significant bit has a logic high value, it indicates that a control word parity error occurred during a pattern presentation.

The block offset register is an 8-bit read only register which the CPU may read when an error occurs during presentation. It indicates the number of patterns offset from the block number residing in the branch register address.

The parity error address register is a 28-bit read only register containing the address of the memory location which generated a parity error. Two of the bits in the register indicate which word, low, high, or both, was in error. The CPU clears the two active-high error bits by performing a write operation on the error register. The two most significant bits are the high and low word parity error bits, respectively. The remainder of the bits correspond to the address bits 27-2. These 26 bits uniquely specify the long word address in the PAM address space.

The PAM 0 present register is a single bit read only register which allows the CPU to determine whether any of the PAMs stacked on the PAC are associated with address 00. When the bit has a logic low value, it indicates that the PAM is present, and when it is a logic high value, it indicates that the PAM is not present.

The PAM 0 ID PROM is a 32-by-8 bit read only memory which contains information pertaining to the PAM associated with address 00, viz., memory size, revision number, etc.

Each of the other three PAMs has a similar PAM present register and PAM ID PROM.

Pin Electronics Circuitry

An overall description of the PEL and its operation will first be presented. PEL 266 connects to the Pattern Bus and provides the electrical interface to the HME. The HME connects to the PEL via the DAB. PEL 266 preferably supports 80 HME pins and includes five CICs.

During pattern-presentation mode, the PEL receives patterns from the Pattern Bus preferably at up to 25M patterns per second. These patterns are clocked into a register using the pattern clock from the TG. From there the patterns are clocked directly into the five CICs. Clocking into the CICs is preferably simultaneous. The HMS, for example, could alternatively clock patterns into the CICs sequentially to minimize Pattern Bus width.

When receiving patterns, the PEL compares a hard-wired 4-bit backplane slot address with the 4-bit PEL address on the Pattern Bus. The PEL accepts only those patterns addressed to its own slot. This allows patterns to be delivered sequentially to PELs in different backplane slots. Patterns can be data or control, based on the 3-bit PEL control signal on the Pattern Bus. Control patterns are used to load internal CIC control registers.

The PEL can be accessed by the CPU in access mode. The CPU uses the access mode to read from, and write to, certain PEL control registers and to read from, and write to, registers internal to the CICs on the PEL. All CPU reads and writes preferably are multiplexed on the 16-bit PEL data bus.

The PEL contains programmable reference-voltage generators which are initialized by the CPU in access mode. Four reference voltages are delivered to each of the five CICs to allow five-state sampling of the HME pins. One additional reference voltage is used as the target voltage ("VSL") for the low soft drivers of the five CICs on the PEL. One additional reference Voltage is used as the target voltage ("VSH") for the high soft drivers of the five CICs on the PEL. The PEL also contains a multi-channel analog-to-digital converter ("ADC") which can be read by the CPU in access mode to check the programmed reference voltages.

In addition to soft drivers, the five CICs on the PEL also contain hard and medium drivers which are used to drive HME pins. Most circuitry within the CIC is powered from the PEL +5 V power plane. However, the pins of the CICs which are connected within the CICs to VCC of the hard and medium drivers are not connected to the PEL +5 V power plane. Instead, these pins are connected to a special power plane of the PEL. This special power plane is separated from the +5 V power plane and is connected instead to the DAB HMEVCC power plane. Thus, the hard and medium drivers of the CICs can drive between HMEVCC and signal ground, allowing HMEVCC on the DAB to be freely adjusted between +3 V and +5 V, independent of the +5 V PEL power plane.

Having presented an overall description of the PEL and its operation, the PEL will now be described in more detail.

PEL 266 in FIG. 1 is representative of all PELs of the system. Referring to FIGS. 21–24, the PELs of the system will be described. Generally, PEL 266 preferably includes one or more CICs which interface with the HME being modeled. PEL 266 preferably includes five such CICs, each of which provide 16 pins for interfacing with the HME. The five CICs are connected in parallel and, therefore, a total of 80 HME pins are supported by each PEL. Hence, HMEs having 80 pins or less may be connected to a single PEL using a DAB. In an alternative embodiment, the CICs are replaced with discrete circuits.

Figure 21:
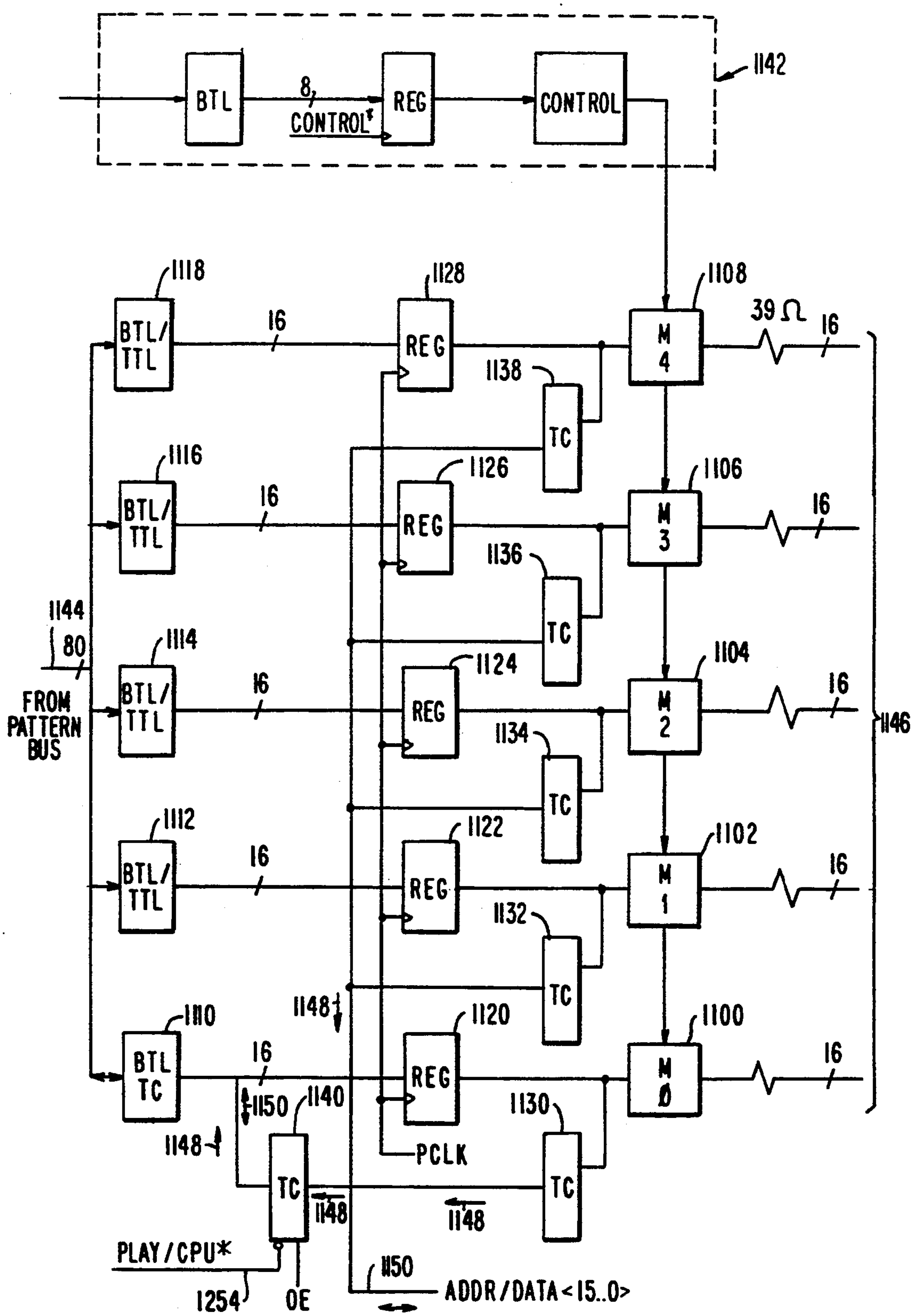
FIG. 21 is schematic drawing of the preferred embodiment of the PEL circuitry which interfaces the Pattern Bus of the HMS of FIG. 1 with an HME.

Referring now to FIG. 21, PEL 266 has circuitry for interfacing the CICs to the Pattern Bus. For descriptive purposes, the five CICs are shown at reference numbers 1100, 1102, 1104, 1106, and 1108. Each is mounted on PEL 266. Line 1144 from the Pattern Bus is input to BTL/TTL logic transceivers 1110, 1112, 1114, 1116, and 1118. A 16-bit signal is input to each of the five transceivers. An additional 16-bit control signal is transmitted from the Pattern Bus as part of the pattern data. Eight bits of the control signal are input to the PEL by the circuit shown at 1142.

In circuit 1142, the 8-bit signal is input to a BTL/TTL transceiver. The 8-bit output signal is input to an clocked octal register. When the register is clocked by the CONTROL* signal, the 8-bit signal is input to a series of PALs which will be described in detail in the discussion of FIG. 23. The outputs of each of the transceivers are input to clocked registers 1120, 1122, 1124, 1126, and 1128 and then to CICs 1100, 1102, 1104, 1106 and 1108, respectively.

During pattern presentation, data is sent from the PAM onto the Pattern Bus to the appropriate PEL. It is then processed by the BTL/TTL logic transceivers, and the clocked registers. The PCLK signal clocks registers 1120, 1122, 1124, 1126, and 1128, which output the data to the inputs of their respective CICs. The five CICs each output a 16-bit signal to the HME being modeled by five, 16-bit bi-directional lines which collectively are shown as the 80-bit bus line 1146.

The HMEs respond to stimulus signals sent over the 80-bit bus line, and the output is transmitted back to the CICs on bi-directional bus line 1146. When the CICs are read for determining the changes in the HME pin states as a result of the stimulus, the data is transmitted on the respective transceiver 1130, 1132, 1134, 1136, and 1138. The entire 80-bit signal is sent to the transceivers at the same time. The transceivers, however, are then sequentially enabled to multiplex the data onto a 16-bit address data bus and through transceiver 1140, as indicated by arrows 1148, onto line 1144 after processing by transceiver 1110.

Data is sent to the five CICs from PAC 258 and PAMs 514 on an 80-bit wide data bus. Data output from the five CICs is sent to CPU 240. It may then be sent to the host operating system to be used in simulations. The data path to the CPU is only 16 bits wide, so the data from the five CICs is multiplexed when transmitted from transceivers 1110, 1112, 1114, 1116, and 1118.

Transceiver 1140 changes operating states depending on whether the system is operating in pattern presentation mode or CPU access mode. The signal that controls this operation is the PLAY/CPU* signal on line 1154. During the CPU access mode, BTL/TTL transceivers 1112, 1114, 1116, and 1118 are not used. Instead, transceiver 1110 and transceiver 1140 are used. The transmission path between the Pattern Bus and various PEL control circuits in the access mode is via bus 1150 (shown in FIG. 22).

Figure 22:
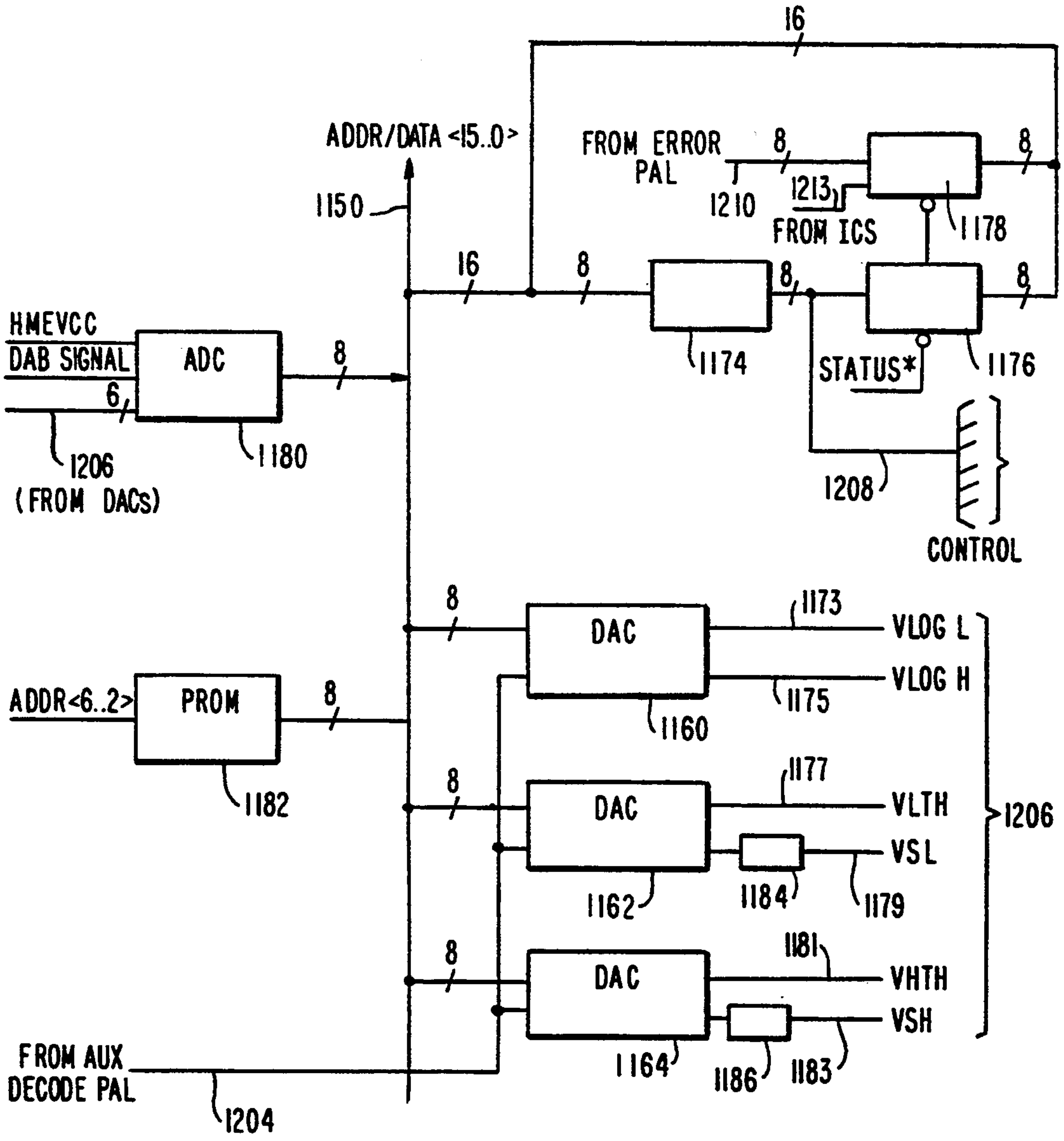
FIGS. 22–24 are schematic drawings of the control portion of the PEL circuitry of the HMS of FIG. 1.

Referring now to FIG. 22, bus 1150 forms a 16-bit address/data bus between CPU 240 and various control and status registers on PEL 266. Control register 1174 of PEL 266 controls whether the HME is a public or private device, resetting error conditions, activating light-emitting diodes, and initializing DAB 268. The 8-bit signals output from control register 1174 are input to error PAL 1202 on line 1208, as described with respect to FIG. 25. The output of control register 1174 is also input to an electrically-erasable programmable memory chip (EEPROM) on the DAB which identifies the DAB that is attached to the PEL. The bits of control register 1174 are reset to a logic low value when the HMS is reset.

The PEL includes status registers 1176 and 1168. The inputs to register 1176 are the signals output from control register 1174. The signals input to register 1178 are signals from the CICs, the output of error PAL 1202, and the output of the EEPROM.

Digital-to-analog converters ("DACs") 1160, 1162, and 1164 are disposed on the PEL. The DACs generate the six voltages used by CICs 1100, 1102, 1104, 1106, and 1108. These voltages are the VLOGL signal on line 1173, the VLOGH signal on line 1175, the VLTH signal on line 1177, the VSL signal on line 1179, the VHTH signal on line 1181, and the VSH signal on line 1183. The CICs use these signals to generate reference voltages and currents for sampling and driving the HME pins.

DACs 1160, 1162, and 1164 are controlled by the CPU and are connected to address/data bus 1150. The reference voltages of the DACs are connected to HMEVCC. The HMEVCC signal is input to the DACs to minimize the danger of the DACs generating a voltage which exceeds the specifications of the HME.

The outputs from DAC 1162 and DAC 1164, associated with the VSL and VSH signals, respectively, preferably have an analog power buffer disposed in the line. The VSL signal on line 1179 is output from DAC 1162, and becomes the output signal of power buffer 1184. Similarly, the VSH signal on the 1183 is output from DAC 1164, then output from power buffer 1186. The signal shown at line 1204 represents the control signals for the DACs. The DAC output signals 1206 are transmitted to the CICs and to an ADC 1180. These ADC inputs serve the diagnostic function of verifying the outputs of DACs 1160, 1162, and 1164.

ADC 1180 is an octal converter. The inputs to the ADC include the outputs from DACs 1160, 1162, and 1164. The remaining inputs include the HMEVCC signal and the HME analog output. There is also a 5 V reference signal input to the ADC which is used for comparison to the HMEVCC signal. The ADC also connects to bus 1150.

Each PEL 266 has a distinct STRAP signal assigned to it. The STRAP signal must match the PEL address signal which is part of the 16-bit control word used during pattern presentation. If the PEL address signal does not match the STRAP signal, the PEL is not selected for use. This will be explained in detail, referring to FIGS. 23 and 24.

Figure 23:
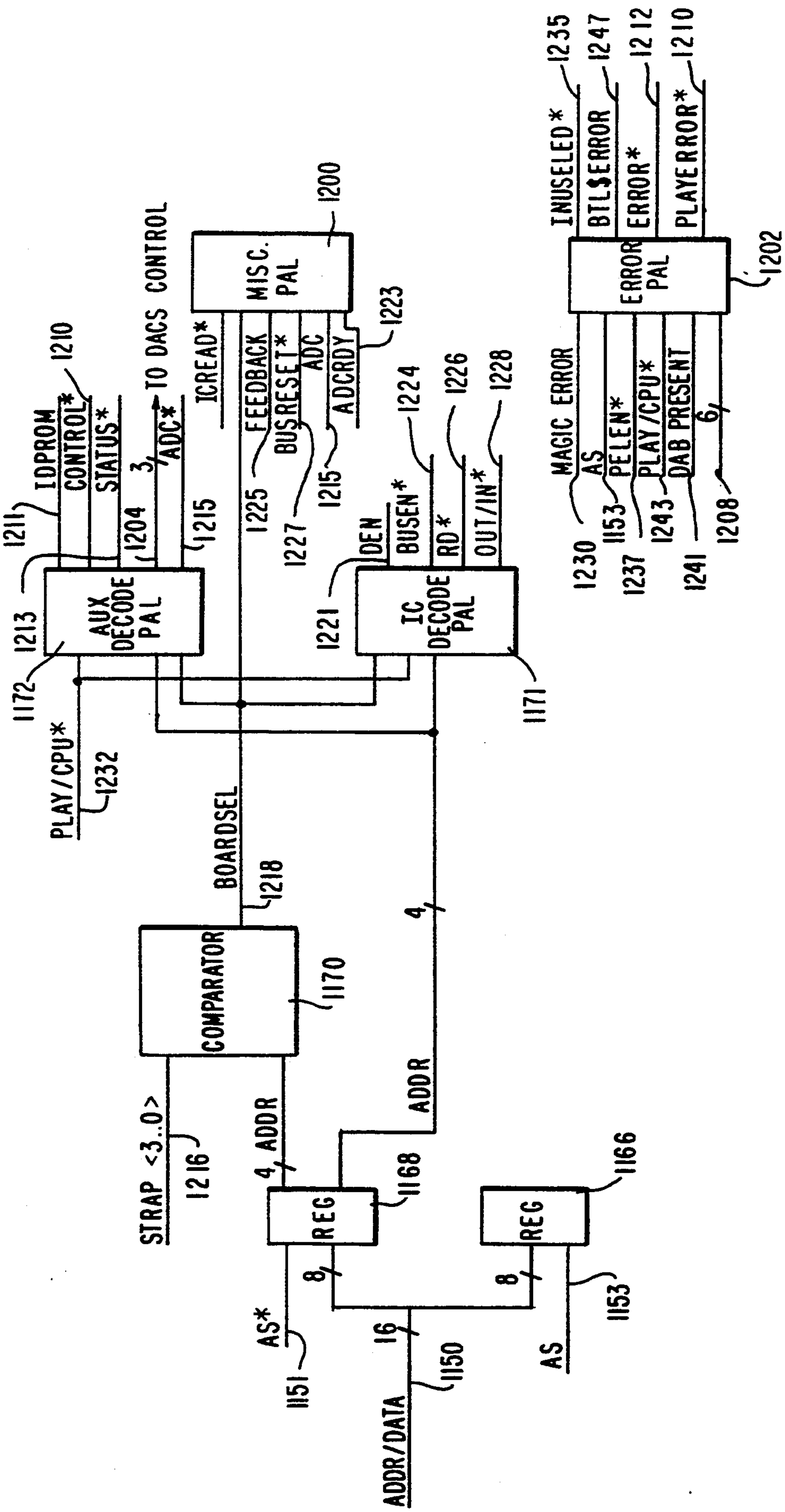

In FIG. 23, comparator 1170 is connected to ADDR-/DATA bus 1150 via a clocked register 1168. This register is clocked by the AS* signal on line 1151. A 4-bit PEL address signal on bus 1150 is latched by register 1168. The other input to comparator 1170 is the 4-bit STRAP signal. The output of the comparator is the BOARDSEL signal on line 1218. This signal is asserted when the PEL address signal from register 1168 matches the STRAP signal.

The BOARDSEL signal is input to Auxiliary Decode PAL 1172, CIC Decode PAL 1171, and Miscellaneous PAL 1200. The 4-bit ADDR signal output from register 1168 on line 1220 and the PLAY/CPU* signal on line 1232 are input to PALs 1171 and 1172.

Auxiliary decode PAL 1172 outputs the IDPROM* signal on line 1211, CONTROL* signal on line 1210, and STATUS* signal on line 1213. The CONTROL* and STATUS* signals are input to status register 1178 of FIG. 22. The IDPROM* signal is input to chip select of the IDPROM. PAL 1172 also outputs the chip select signals for each of the DACs. These signals are shown on composite line 1204. Also output from PAL 1172 is the ADC* signal on line 1215, which is the chip select signal for ADC 1180.

The outputs of CIC decode PAL 1171 are the BUSEN* signal on line 1224, the CIC RD* signal on line 1226, the OUT/IN* signal on line 1228, and the 5-bit CIC DEN signal on line 1221. The BUSEN* signal enables each of transceivers 1130, 1132, 1134, 1136, and 1138. The OUT/IN* and CIC RD* signals are transmitted to each of the CICs of the PEL on lines 1228 and 1226, respectively.

In addition to the BOARDSEL signal, the inputs to Miscellaneous PAL 1200 include the CIC READ* signal, the ADCRDY signal on line 1223, the ADC signal on line 1215, the FEEDBACK signal on line 1225, and the BUSRESET* signal on line 1227. The CIC RD* and ADC signals were described previously. The ADCRDY signal is asserted once ADC 1180 has made a conversion and is ready to output the data. The FEEDBACK signal is input from the DAB connected to the PEL, and the BUSRESET* signal from the Pattern Bus.

The outputs of Miscellaneous PAL 1200 are the CIC AS* signal on line 1231, the DEVRESET* signal on line 1233, and the BTL_FBIN* signal on line 1229. The CIC AS* signal is a control input to each of the five CICs. The DEVRESET* signal controls a flip-flop, whose output is the previously discussed ACTIVE signal. The flip-flop is clocked by the previously described INITIALIZE signal. The BTL_FBIN* signal on line 1229 has been previously discussed regarding the PAC.

Error PAL 1202 receives as inputs an error signal from the CICs on line 1230 and the previously described signals output from control register 1174 on line 1208. The signals on line 1208 are the INITIALIZE signal, the ACTIVE signal, the LED signal, and the CTL RESET* signal. The remaining input signals are the DABPRESENT signal on line 1241, the PELEN* signal on line 1237, the AS signal on line 1153, and the PLAY/CPU* signal on line 1243. Error PAL 1202 is switched between pattern presentation mode and CPU access mode by the PLAY/CPU* signal. When an error condition is detected, error PAL 1202 will output an ERROR* signal to output enable PAL 1232 on line 1212, and to status register 1178 on line 1210. Error PAL 1202 also transmits the BLT$ERROR Pattern Bus error signal on line 1247 to the CPU. Another output of PAL 1202 is the INUSELED* signal on line 1235. This signal will cause a status LED to light when the PEL is being accessed or patterns are being played.

Figure 24:
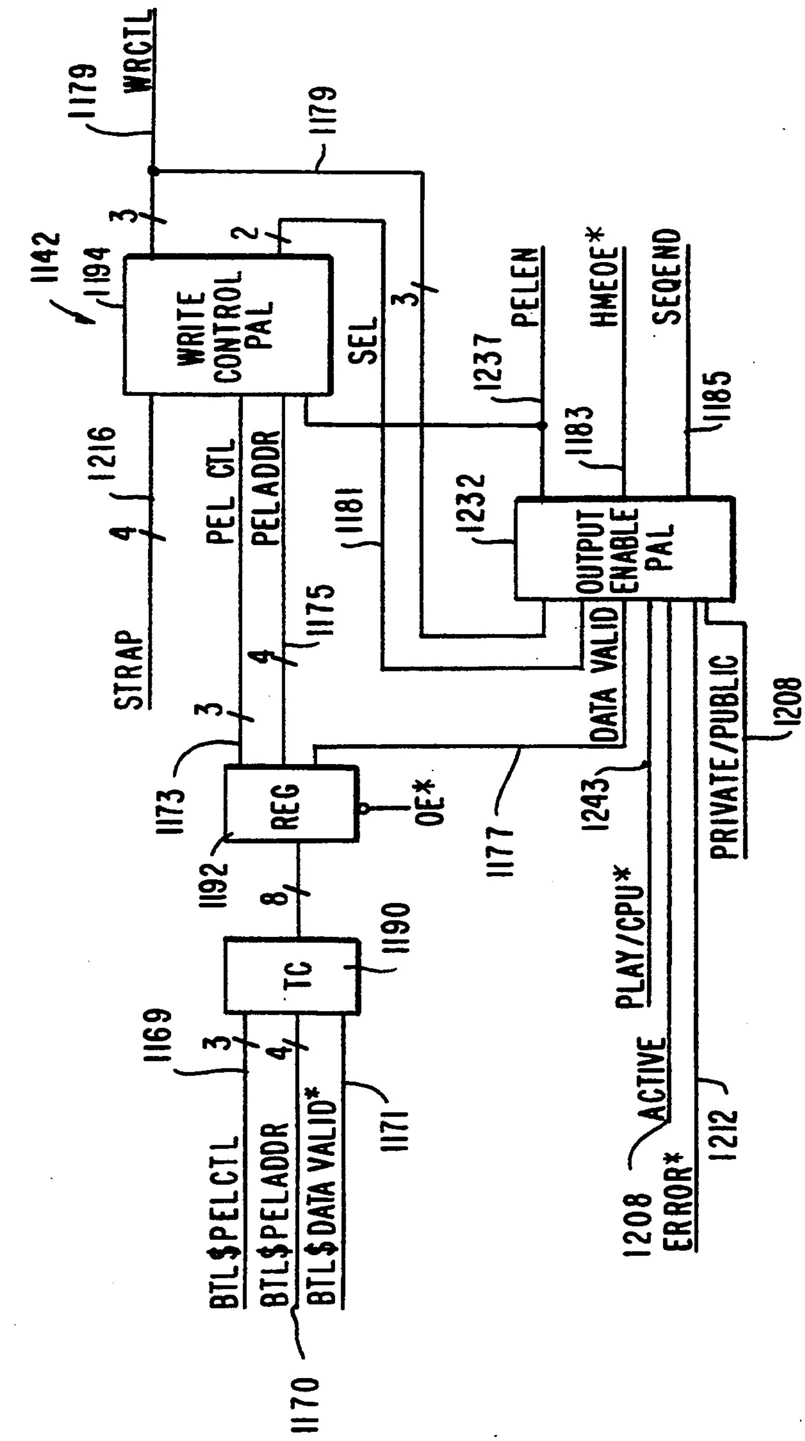

Referring now to FIG. 24, write control PAL 1194 and output enable PAL 1232 of control circuit 1142 are shown. The input signals to these PALs are registered signals from the Pattern Bus received through BTL/TTL transceiver 1190 and register 1192.

The inputs to transceivers 1190 are the 3-bit BTL$PELCTL signal on line 1169, the BTL$PELADDR signal on line 1170, and the BTL$DATAVALID* signal on line 1171. The 8-bit output of the transceiver is input to register 1192. The output of the register are the 3-bit PELCTL signal on line 1173 and the 4-bit PELADDR signal on line 1175. These are input to write control PAL 1194. Write control PAL 1194 receives the 4-bit PELADDR signal during pattern presentation as part of the control word, compares it to the 4-bit STRAP signal 1216, and outputs a 2-bit SEL signal which is input to output enable PAL 1232. The PEL is "selected" if the PELADDR signal matches the STRAP signal. The 3-bit PELCTL signal is output from PAL 1194 as the WRCTL signal on line 1179. This signal is transmitted to the CICs and to output enable PAL 1232. If the PEL has been selected for operation, the signal will be asserted. The WRCTL signal is discussed in detail in connection with the integrated circuits.

Output enable PAL 1232 receives WRCTL and SEL signals from error PAL 1202, the ERROR* signal on line 1212, and the ACTIVE and PRIVATE/PUBLCIC* signals from control register 1174 on line 1208. PAL 1194 also receives the DATAVALID signal on line 1177 from register 1192, and the PLAY/CPU* signal on line 1243. PAL 1232 outputs the SEQEND signal on line 1185 and the HMEOE* signal on line 1183 which are input to the CICs. The SEQEND signal is active high to initiate a measurement cycle at the end of a pattern sequence. The HMEOE* signal controls the HME pin drivers. The third output is the PELEN signal on line 1237.

PEL 266 generates an error signal when certain conditions occur. For example, PEL 266 generates an error signal if patterns are presented to the PEL before a DAB has been inserted, or when the PEL is not active. PEL 266 also generates an error signal when an error occurs on the CICs, such as shorting of the pins or a parity error. If the DAB is capable of live insertion, PEL 266 preferably generates an error signal when a DAB has been inserted, when the DAB is not active, and when a DAB has been removed after it has been initialized. Error signals relating to the DAB status inform the user that something has changed and that some action may be required.

Custom Integrated Circuits

An overall description of the CIC and its operation will first be presented. The CIC provides an electrical interface between the HMS and the HME pins. The CIC preferably is a mixed analog/digital CMOS standard-cell integrated circuit such as those manufactured by International Microelectronic Products. The CIC preferably supports 16 HME pins. The circuitry within the CIC for supporting a single HME pin is called a "channel." All 16 channels of the CIC are identical in function.

Each CIC channel also has two internal single-bit pattern data registers. A "presentation" register holds the single-bit value that is currently being presented via the pin drivers of the channel. The other register is a "staging" register which is used in supporting HMEs with more pins than the width of the Pattern Bus. To support such HMEs, the staging registers of multiple CICs are loaded at different times, while all the CICs present constant pattern data from their pattern registers. After loading the staging registers of the final set of CICs, all the CICs are commanded to simultaneously transfer the contents of their staging registers to their presentation registers. Thus, the staging register allows patterns to be accumulated within multiple CICs in preparation for simultaneous presentation to a single HME.

The CIC channels have various programmable functions. They are software programmable on a per-pin basis via the Pattern Bus. The CPU programs the CIC channels by causing special control patterns to be presented to the PEL. Ordinarily, such control patterns are prefixed to the beginning of each pattern sequence stored in PAM. When the pattern sequence is presented, these prefix patterns initialize the CICs.

Each CIC channel includes an HME pin driver which connects to an HME pin via a series damping resistor and controlled-impedance traces on the DAB. The HME pin driver consists of a hard driver, a medium driver, and a soft driver. These three types of drivers have their outputs connected in parallel within the CIC. The hard driver is capable of driving very high current levels in either the high or low state. The medium driver preferably is current limited to less than 16 mA in the low state and less than 8 mA in the high state. The hard driver is used for HME pins which are strictly inputs (so that these HME pins transition quickly when driven by the CIC channel). The medium driver is used to drive HME I/O pins during the presentation of the history sequence. The reason for using the medium driver to present the history sequence is that the HME I/O pins may at times temporarily drive in the opposite direction than the CIC pin driver is driving, and the medium driver will limit the current in such a situation.

Because of the relatively low current limits of the medium driver, the HME pin will ordinarily dominate in a conflict with the CIC pin driver, but the resulting logic level is not always predictable. However, novel HMS software discussed elsewhere herein creates one-bit-per-pin patterns which cause the CIC channel to drive in the same direction as the HME pin. To do this, the HMS measures the state of each HME pin before each new pattern is added to the pattern sequence. If an HME pin is found to be driving during measurement, the new pattern is constructed so that the CIC will drive in the same direction as the HME pin. Therefore, the steady state for each pattern in the pattern sequence is that the HME and the CIC drive in the same directions, and any medium-driver conflicts are transient.

The soft driver is used during five-state measurement of the HME pin's state after presentation of a pattern sequence. All CIC's connected to the HME measure all HME pin states simultaneously after the HME outputs have settled. As previously discussed, the measurement process can distinguish driving low, driving high, non-driving low, non-driving high, and unknown ("H0,"

"H1," "Z0," "Z1," and "U") HME pin states. The result of each measurement is latched in a 3-bit register in the CIC channel.

The soft driver is implemented as two drivers connected in parallel inside the CIC: a low soft driver and a high soft driver. The low soft driver is enabled only if the corresponding pattern bit is a zero; it drives toward the soft-low target voltage ("VSL") programmed on the PEL. The high soft driver is enabled only if the corresponding pattern bit is a one; it drives toward the soft-high target voltage ("VSH") programmed on the PEL. The low soft driver and high soft driver have current limits which are separately programmable using control patterns presented to the CIC.

The low soft driver in each CIC channel is preferably programmed with a current limit such that if the connected HME pin is not driving (for example, if it is an I/O pin in the input state), then the low soft driver will succeed in driving it to a valid logic low state, but if the HME pin is driving, then the HME pin will dominate and the pin will attain the same logic level as if the CIC channel were not connected to it. In this case, we say that the CIC pin driver is driving "soft-low," or is driving with "soft-drive low I/V characteristic."

Similarly, the high soft driver in each CIC channel is preferably programmed with a current limit such that if the connected HME pin is not driving (for example, if it is an I/O pin in the input state), then the high soft driver will succeed in driving it to a valid logic high state, but if the HME pin is driving, then the HME pin will dominate and the pin will attain the same logic level as if the CIC channel were not connected to it. In this case, we say that the CIC pin driver is driving "soft-high," or is driving with "soft-drive high I/V characteristic."

Thus, a CIC channel driving "soft-high" or "soft-low" can be dominated by an HME pin which is driving, but will cause a non-driving HME pin to attain a valid logic high or low state, respectively.

During the measurement process, the CIC channel drives the connected HME pin using either a soft-drive low I/V characteristic or a soft-drive high I/V characteristic, depending upon the value of the appropriate pattern bit of the measurement pattern. The target voltage for the low soft driver is programmed to be slightly above the bottom of the logic low state voltage range for the HME pin. The target voltage for the high soft driver is programmed (on the PEL) be slightly below the top of the logic high state voltage range for the HME pin.

While soft driving, the CIC channel compares the steady-state HME pin voltage simultaneously with four reference voltages generated on the PEL. The CIC channel may be soft-driving low or soft-driving high. If the CIC channel is soft-driving low, then an HME pin voltage lower than the target voltage of the low soft driver (VSL) indicates that the HME pin is in the HO state. A voltage which is a valid logic low, but is above the target voltage, indicates that the HME pin is in the Z0 state. A voltage which is a valid logic high indicates that the HME pin is in the H1 state, and any other voltage indicates that the HME pin is in the U state. The Z1 state is impossible.

Similarly, if the CIC channel is soft-driving high, then an HME pin voltage higher than the target voltage of the high soft driver (VSH) indicates that the HME pin is in the H1 state; a voltage which is a valid logic high but is below the target voltage indicates that the HME pin is in the Z1 state; a voltage which is a valid logic low indicates that the HME pin is in the H0 state; and any other voltage indicates that the HME pin is in the U state. The Z0 state is impossible.

Various alternative embodiments of this basic five-state sampling method would be obvious to one skilled in the art. For example, in an alternative embodiment, the current into, or out of, the HME pin could be compared with reference currents to distinguish the H0, H1, Z0, Z1, and U HME pin states.

In another alternative implementation, the CIC channel could be set to drive the HME pin toward a logic low level or a logic high level without regard to whether the CIC pin driver would dominate the HME pin. For example, the CIC channel could be set to hard drive the HME pin. As in the soft-drive method, voltage comparisons or current comparisons would be used to distinguish the H0, H1, Z0, Z1, and U pin states.

Now that its general operation has been presented, the CIC will be described in detail.

When simulator 164 of host computer 112 makes a request for a device evaluation, the HMS formats the request into signals to be presented to HME pins, applies the signals to the pins, measures the HME's behavior by sensing the pins after a predetermined time period, and returns the resulting outputs, plus timing information, to the simulator. An important consideration in this process is the method used to drive and sense the HME pins. In the present invention, CICs preferably are used to drive and sense the HME pins. In an alternative embodiment, some or all of these functions may be performed by discrete circuits. The CICs for the purpose defined herein may be packaged in any conventional packaging arrangement.

Figure 25:
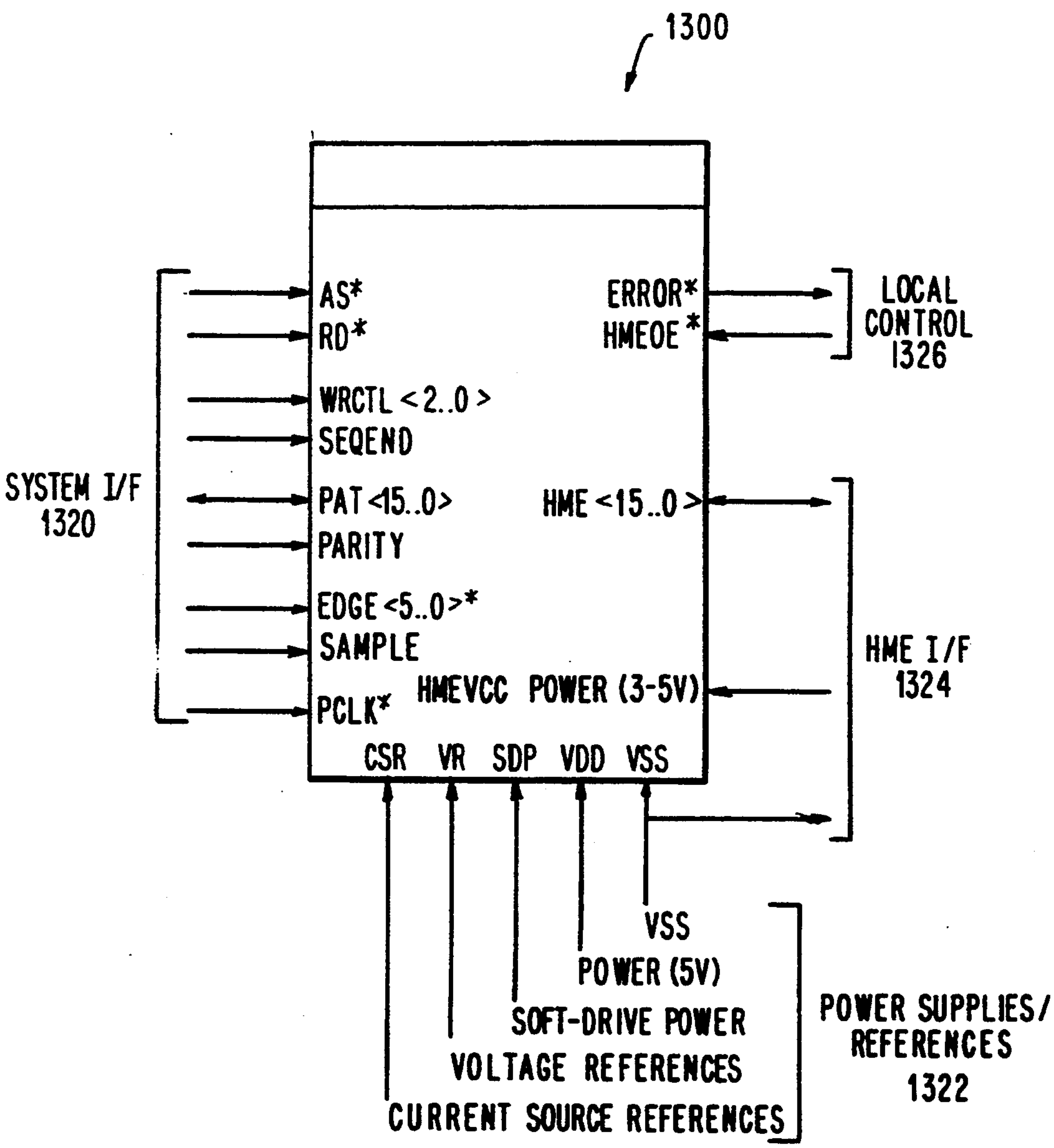
FIG. 25 is a block diagram of a CIC on the PEL circuitry of the present invention.

FIG. 25 at 1300, shows a chip-level block diagram of the CIC of the present invention. The major inputs to, and outputs from, CIC 1300 are shown. These are associated with system interface 1320, HME interface 1324, power supplies/references 1322, and local control 1326. Before disclosing the specifics of the components of CIC 1300 and their operation, the configuration of the CICs on the PEL will be disclosed.

Figure 26:
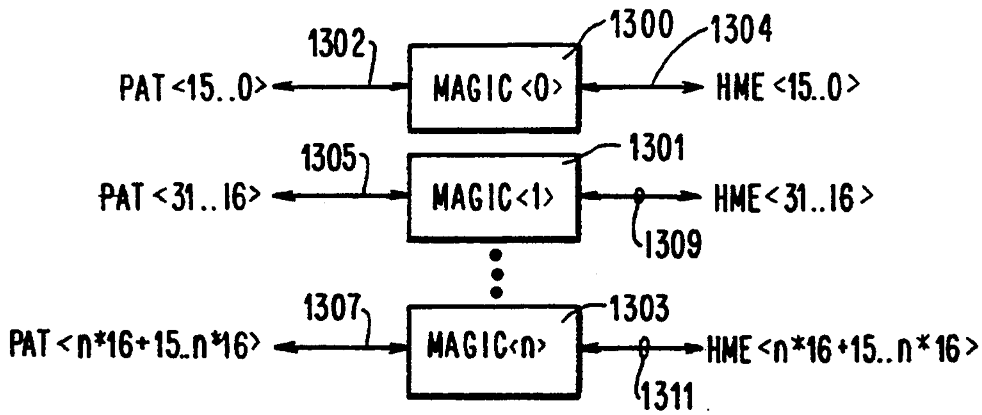
FIG. 26 is a block diagram showing the parallel connection of a number of CICs of FIG. 25.
Figure 27:
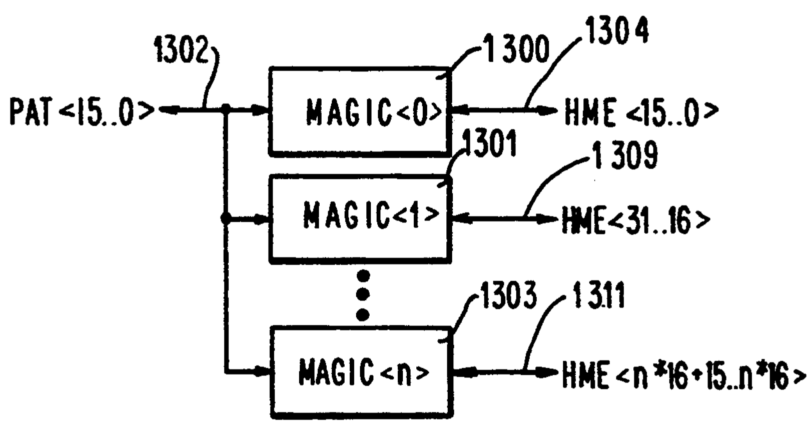
FIG. 27 is a block diagram illustrating the serial connection of a number of CICs of FIG. 25.

Referring to FIG. 26 and 27, there are preferably five CICs connected to each PEL. Each one has sixteen HME driver/sensor pin channels. However, it is understood that there may be more or less than five CICs per PEL and each CIC may have a fewer or greater number of driver/sensor pin channels.

The five CICs may be configured in series or in parallel to increase the number of HME pin driver/sensors of the system. Preferably, the CICs are connected in parallel to allow pattern presentation at maximum rates, but the CICs could also be connected in series for lower cost. The design of an HMS based on serially-connected CICs is well within the capability of one skilled in the art. Any number of CICs may be connected together to accommodate an HME having more than 16 pins. FIG. 26 shows the parallel connection of CICs 1300, 1301 and 1303. CICs 1300, 1301, and 1303 are connected to their own 16-bit Pattern Bus, 1302, 1305, and 1307, respectively. They are also connected to their own 16-bit HME bus 1304, 1309, and 1311, respectively.

FIG. 27 shows CICs 1300, 1301, and 1303 connected in series. Each CIC is connected to its own 16-bit HME bus 1304, 1309 and 1311, respectively, but they all share the same 16-bit Pattern Bus 1302. When the CICs are connected in series, each CIC is sequentially enabled to access multiplexed pattern bus 1302.

When the system is connected in parallel, the speed of data presentation during pattern play is faster than when they are connected in series. This is because all the data bits for each CIC are sent from the PAYs at the same time. However, when they are connected in series, the multiplexed pattern bus serially loads all of the data bits from the PAMs. This method is slower.

When the system is series connected, the size of Pattern Bus 1302 is reduced. Further, when the CICs are serially connected, the system may include any desired number of CICs without the need to redesign the Pattern Bus and addressing system. Even further, to operate CICs 1300, 1301, and 1303 in parallel, each HME pin driver/sensor must be accompanied by its own pattern data line.

Again referring to FIGS. 25, CIC 1300 has a number of signals associated with it. Tables 7 and 8 provide an explanation of these signals which are referred to throughout the description of CIC 1300.

There are two modes that are used to perform the system interface function. The first is pattern presentation mode. In this mode, bit patterns containing control and data signals are clocked onto the Pattern Bus using the PCLK* signal. The patterns are presented to the pins of the HME. After the patterns have been presented, a measurement cycle is performed to evaluate the HME response to the pattern sequence. The second mode is CPU access mode. In CPU access mode, the Pattern Bus is used by the system to read data from, and write data to, the CICs, among other components. The following signals, listed in Tables 7 and 8, are used in both modes of operation as will be explained.

TABLE 7

| Signal | Description |
|---|---|
| AS* | ADDRESS STROBE. This input is used during the CPU access mode. Asserting the AS* pulse causes PATTERN<5 . . 2> to be latched into the internal address register of the CIC during the register read operation. AS* preferably is a TTL level input. |
| RD* | READ. This input is used during in CPU access mode. RD* enables reading of the CIC status registers onto the Pattern Bus. The internal address register of the CIC points to the status register being read. RD* preferably is a TTL level input. |
| WRCTL<2 . . 0> | WRITE CONTROL. These inputs are used during pattern presentation mode to specify the operation the CIC will perform during the current pattern cycle. WRCTL<2 . . 0> preferably are synchronous TTL level inputs. |
| PAT<15 . . 0> | PATTERN I/O. During pattern presentation mode, the Pattern Bus is used to program the CIC control registers and to receive pattern data to be formatted onto the HME pins. During CPU access mode, the Pattern Bus is used to read the internal status registers of the CIC. PAT<15 . . 0> preferably are synchronous TTL level I/O with weak pull-ups. |
| PARITY | PATTERN PARITY IN. PARITY is used during pattern presentation mode to check the parity on the Pattern Bus. If there is a parity error, the ERROR* signal is asserted and the data with the parity error is saved. The CIC parity is odd. PARITY preferably is a synchronous TTL level input. |
| EDGE<5 . . 0>* | TIMING EDGES. The six timing edges are used by the data formatter as timing references during pattern presentation mode to generate the data formats DNRZ, R1, RZ and RC for the HME outputs. These signals are preferably 8 ns high-going pulses. EDGE<5 . . 0>* preferably are CMOS level inputs. |
| SAMPLE | SAMPLE. This signal is used during pattern presentation mode. The positive edge is used to take a 2-state sample of HME<15 . . 0> for timing measurement, while the negative edge is used to take a 5-state sample during soft-drive sampling. SAMPLE preferably is a TTL level input. |
| PLCK* | PATTERN CLOCK. The falling edge of PCLK* is used in pattern presentation to clock data onto the synchronous input pins. PCLK* preferably is a CMOS level input. |
| IM | MEDIUM-DRIVER CURRENT SOURCE. This signal is used to generate a reference current for the HME medium-drivers. The medium-driver output currents at 2.5 V are Imol = 16 * V(IM) / R(IM), and Imoh = −8 * V(IM) / R(IM). Preferably, the CIC will hold IM at VDD/2, and the R(IM) suggested value is 2.5K to VSS, which results in Imol = 16 mA and Imoh = −8 mA. |
| ISN | LOW SOFT-DRIVER CURRENT SOURCE. This signal is used to generate a reference current for the HME low soft-drivers. The formulas for the low soft-drivers are Isol<3> = 3 * V(ISN) /R (ISN), Isol<2> — 1.2 * V(ISN) / R(ISN), Isol<1> = 0.5 * V(ISN) /R(ISN), isol<0> = 0.2 * V(ISN) / R(ISN). Preferably, the CIC will hold this pin at VDD/2, and suggested R(ISN) value is 2.5K to VSS, which results in Isol<3> = 3 mA, Isol<2> = 1.2 mA, Isol<1> = 0.5 mA and Isol<0> = 0.2 mA. |
| ISP | HIGH SOFT-DRIVER CURRENT SOURCE. This pin is used to generate a reference current for the HME high soft-drivers. The formulas for the high soft-drivers are Isoh<3> = −V(ISP) / R(ISP), Isoh<2> = −0.6 * V(ISP) / R(ISP), Isoh<1> = −0.25 * V(ISP) / R(ISP), Isoh<0> = −0.06 * V(ISP) / R(ISP). The CIC will hold this pin at VDD/2, and the suggested R(ISP) value is 1.25K to VDD, which results in Isoh<3> = −2 mA, Isoh<2> = −1.2 mA, Isoh<1> = −0.5 mA, and Isoh<0> = −0.1 mA. |
| VHTH | Z1/H1 THRESHOLD. This voltage reference is used by the HME 5-state sampling circuitry. When the CIC is soft-driving an HME pin high, and VLOGH < V(HME) < VHTH, then the Z status bit for the HME pin will be sampled TRUE. If V(HME) > VHTH, then the Z status bit would be FALSE. |
| VLOGH | U/Z1 THRESHOLD. This voltage reference is used by the HME 5-state sampling circuitry. If V(HME) > VLOGH then the HME pin will be sampled as a H1 or Z1. If VLOGH < V(HME) < VLOGL, then the HME pin will be sampled as a U. |
| VLOGL | ZO/U THRESHOLD. This voltage reference is used by the HME 5-state sampling circuitry. If V(HME) < VLOGL, then the HME pin will be sampled as a logic low. If VLOGL < V(HME) < VLOGH, then HME pin will be sampled as a logic "U." |
| VLTH | H0/ZO THRESHOLD. This voltage reference is used by the HME 5-state sampling circuitry. When the CIC is |

TABLE 7-continued

| Signal | Description |
| --- | --- |
| | soft-driving an HME pin low, and VLTH < V(HME) < VLOGL, then the Z status bit for the HME pin will be sampled TRUE. If V(HME) < VLTH, then the Z status bit would be FALSE. |
| VSH | HIGH SOFT-DRIVE POWER. This is the high soft-driver power supply. Its input range is from 2.5 volts to HMEVCC. |
| VSL | LOW SOFT-DRIVE POWER. This is the low soft-driver power supply. Its input range is from 0 V to 1.0 V. |
| AVDD | ANALOG POWER. This is the analog +5 V supply. |
| VDD | POWER. The VDD pins are for a +5 V power supply. There are two pins for pattern I/O, and one pin for internal logic. |
| VSS | GROUND. The VSS pins are for the ground reference. There are four pins for pattern I/O, two pins for internal logic, and two pins for analog cells. |

Local control deals primarily with error handling. A preferred method of handling errors is to use the ERROR* signal to deassert the HMEOE* signal, and send an interrupt back to the HMS. The ERROR* signal preferably is also sent to a local status register on PEL 268. HMEOE* should only be asserted while patterns are being presented to an HME. For private devices, this occurs during the entire time the device is being used; for public devices it is only during individual pattern sequences. These signals are indicated generally at 1326 in FIG. 25. The last two groups of I/O signals of CIC 1300 interface the CIC with the HME and power the CIC. These signals are designated generally by reference numerals 1322 and 1324. These signals and their descriptions are set forth in Table 8.

TABLE 8

| Signal | Description |
| --- | --- |
| ERROR* | ERROR. ERROR* is an open drain output that indicates there was either a parity error on the Pattern Bus during pattern presentation, or a HME pin was detected to be shorted. The current input pattern is saved when this pin goes low. To reset this signal, a read of the reset register is required. ERROR* is a CMOS level I/O. |
| HMEOE* | HME OUTPUT ENABLE. Deasserting HMEOE* disables the HME drivers, and enables a weak pull-down. HMEOE* preferably is a TTL level input. |
| HME<15..0> | HME I/O. The HME bus is used to drive and sense HME pins. HME<15..0> preferably are programmable level I/O pins. |
| HMEVCC | HME POWER. This signal is the HME I/O pin-driver power supply. The advantage to having a separate supply from the VDD pins is that HMEVCC can be from 3 V to 5 V, allowing for the direct driving of low-voltage CMOS parts. |
| VSS | GROUND. There are four ground pins allocated for HME pin drivers. These ground pins should be common to both the CIC and the HME. |

CIC 1300 includes both digital and analog electronic circuitry. The digital circuitry includes data channels, control and data registers, and formatting circuitry. The analog circuitry includes the HME driver circuitry and 5-state sampler. The following description relates to the preferred embodiment of the present invention which includes CICs that have 16 HME pin driver/sensor channels.

CIC 1300 has the capability of per-pin programmability for driving and sensing the HME pins. Hence, each of the CIC's HME pins can be programmed as an input, an output, or an I/O. In addition, each pin may be programmed as a power or ground pin so that the user can jumper power or ground to the HME without having to disconnect the HME pin. The CIC is protected against damage when HME pins are connected to power or ground.

Figure 28:
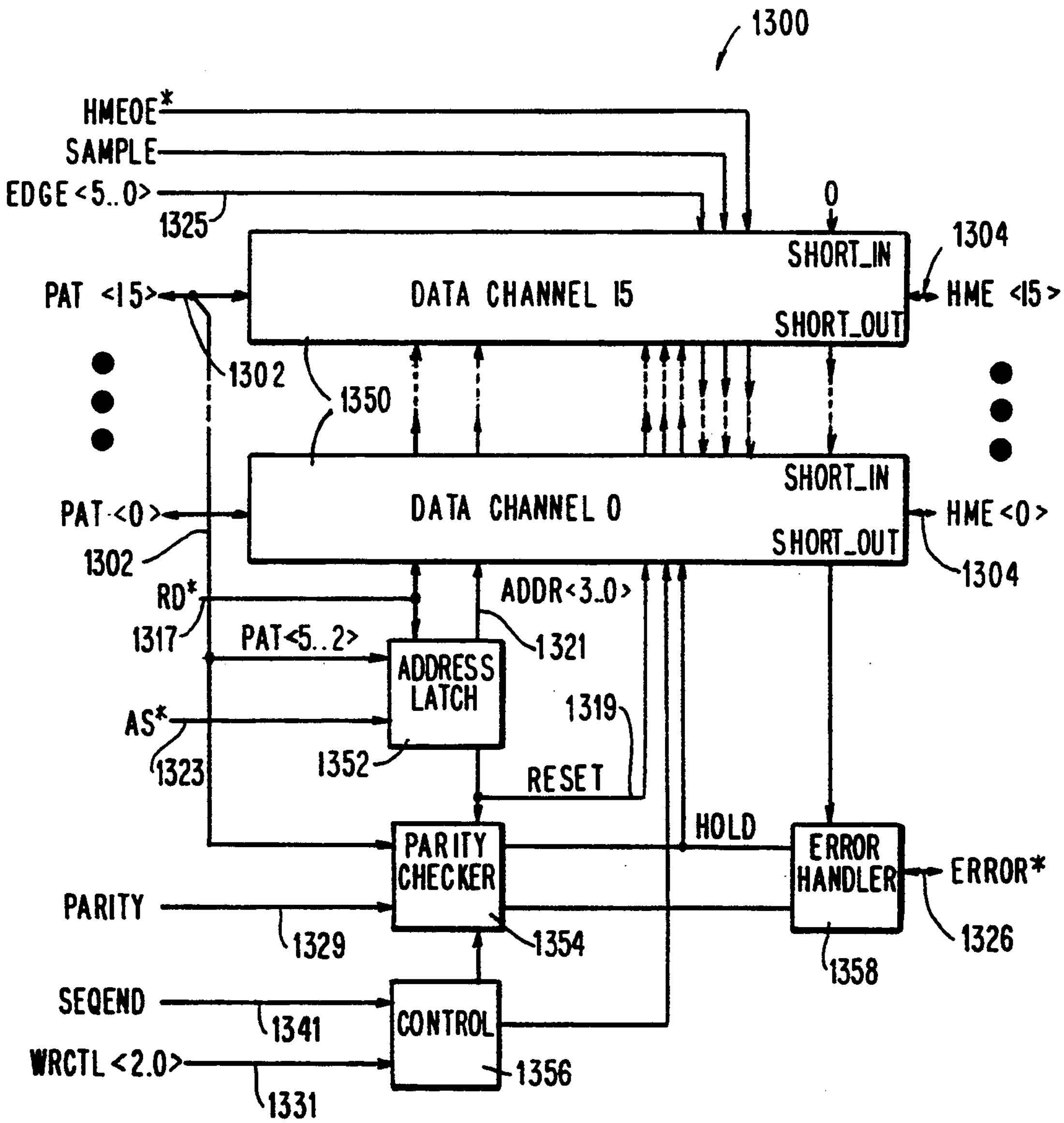
FIG. 28 is a schematic drawing of the digital circuitry of the CIC of FIG. 25.

Referring to FIG. 28, a block diagram of CIC 1300 shows the major components of the CIC. CIC 1300 preferably includes 16-bit Pattern Bus 1302 and 16-bit HME bus 1304. Data channels 1350 process the Pattern Bus signals for output therefrom to the HME bus. In processing data, data channels 1350 format data from the Pattern Bus and drive the formatted data on to the HME bus for input to the HME pins. The data channels sample the HME pins.

Circuit 1300 includes address latch 1352 which latches four pattern bits PAT<5..2> in a 4-bit register. The latched address is transmitted to each of the data channels 1350, to be used as a status/read select. When RD* on line 1317 is asserted, the internal RESET signal on line 1319 of circuit 1300 is asserted. The RESET signal is input to parity checker 1354 and data channels 1350. The latched address values are input to data channels 1350, as the 4-bit ADDR signal on line 1321 when the AS* signal on line 1323 is asserted.

CIC 1300 also includes a parity checker 1354, an error handler 1358, and control circuitry 1356. The parity checker will now be described.

Figure 29:
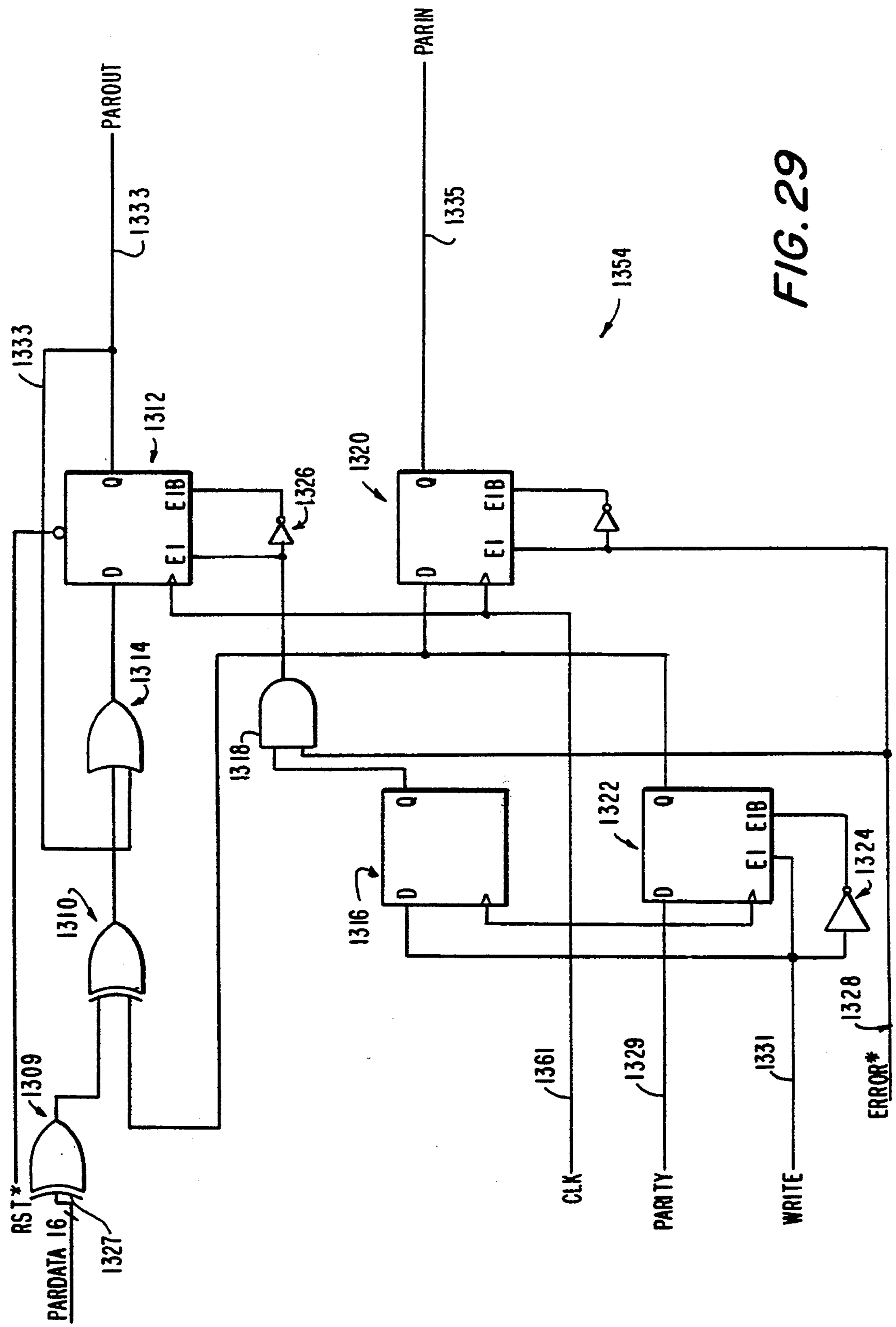
FIG. 29 is a schematic drawing of the Parity Checker circuitry of the CIC of FIG. 25.

During pattern presentation, parity checker 1354 (FIG. 29) checks Pattern Bus 1302 for parity against the PARITY signal on line 1329. The 16-bit input connects to eight exclusive-OR gates, two adjacent bit lines per gate. The output of the gates are input to four more exclusive-OR gates, two adjacent bit lines per gate. This process is continued until there is a single output signal. The four levels of exclusive-OR gates are represented by the exclusive-OR gate 1309. The signal output of gate 1309 is output to exclusive-OR gate 1310. The second input signal is the registered PARITY signal output from register 1332.

The PARITY signal on line 1329 is from the Pattern Bus and latched in register 1322. The PARITY signal is from the PAC. The register is clocked by PCLK signal on line 1361. The control inputs to the register are the WRITE* signal on line 1331 and its complement.

The output of exclusive-OR gate 1310 is input to OR gate 1314. The second input to OR gate 1314 is the signal on feedback line 1333. The output of OR gate 1314 is input to the data input of register 1312. The output of register 1312 is the PAROUT signal on line 1333 which is also fed back to the input of OR gate 1314. The control inputs to register 1312 are the output of AND gate 1318 and its complement.

The inputs to AND gate 1318 are the ERROR* signal on lines 1328 and the output of register 1316. The WRITE signal on line 1331 is in input to the data input to register 1316. PCLK signal on line 1361 in input to its clock input.

The PARITY signal output from register 1322 is input to the data input of register 1320. This register is clocked by the PCLK signal and its control inputs are the ERROR* signal on line 1326 and its complement. The output of the register is the PARIN signal on line 1335.

The PARIN signal line 1335 is the twice registered PARITY signal. This signal is clocked with the PAROUT signal so that if there is a parity error, the PARITY signal which generated the error may be retrieved. The PAROUT signal on line 1333 is a comparison of the PARITY signal on line 1329 and the PARDATA on line 1327.

If an error is detected, register 1312 and OR gate 1314 form a "hold" loop. This loop is controlled by the status ERROR* and WRITE signals, as gated by AND gate 1318. This loop will remain set by the RST* signal on line 1319.

Figure 30:
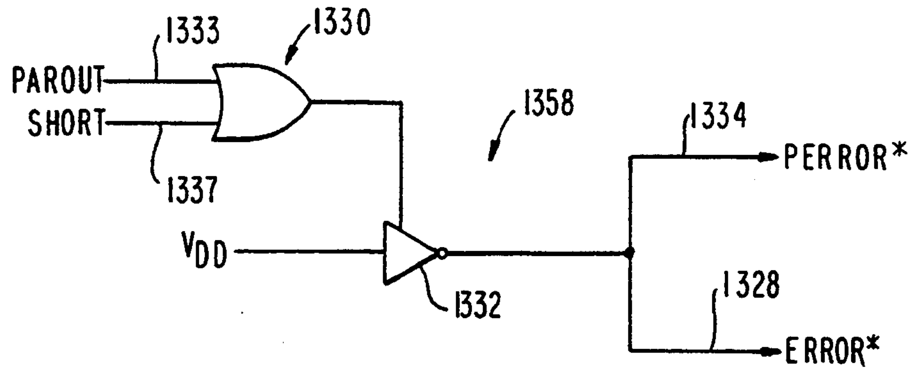
FIG. 30 is a schematic drawing of the Error Handler circuitry of the CIC of FIG. 25.

Referring to FIG. 30, error handler 1358 will be described. If an error exists on the CIC, viz., parity or short error, it is preferably sent to all data channels 1350 by error handler 1358. The PAROUT signal on line 1333 and the SHORT signal on line 1337 are input to OR gate 1330. The SHORT signal when asserted indicates that there is a short in the data channel circuitry. The output of OR gate 1330 enables a tri-state buffer 1332. This will assert the PERROR* signal on line 1334 which is input to the PEL, and assert the ERROR* signal on line 1328 which is input to parity checker 1354 and data channels 1350.

The ERROR* signal on line 1328 is sent to the data channels so that the error data can be held for future evaluation. The PARIN signal on line 1335 is saved in status register 1320. Error handler 1358 forces the data channels and parity checker 1354 into the "hold" state whenever the ERROR* signal is asserted (either internally or externally).

Figure 31:
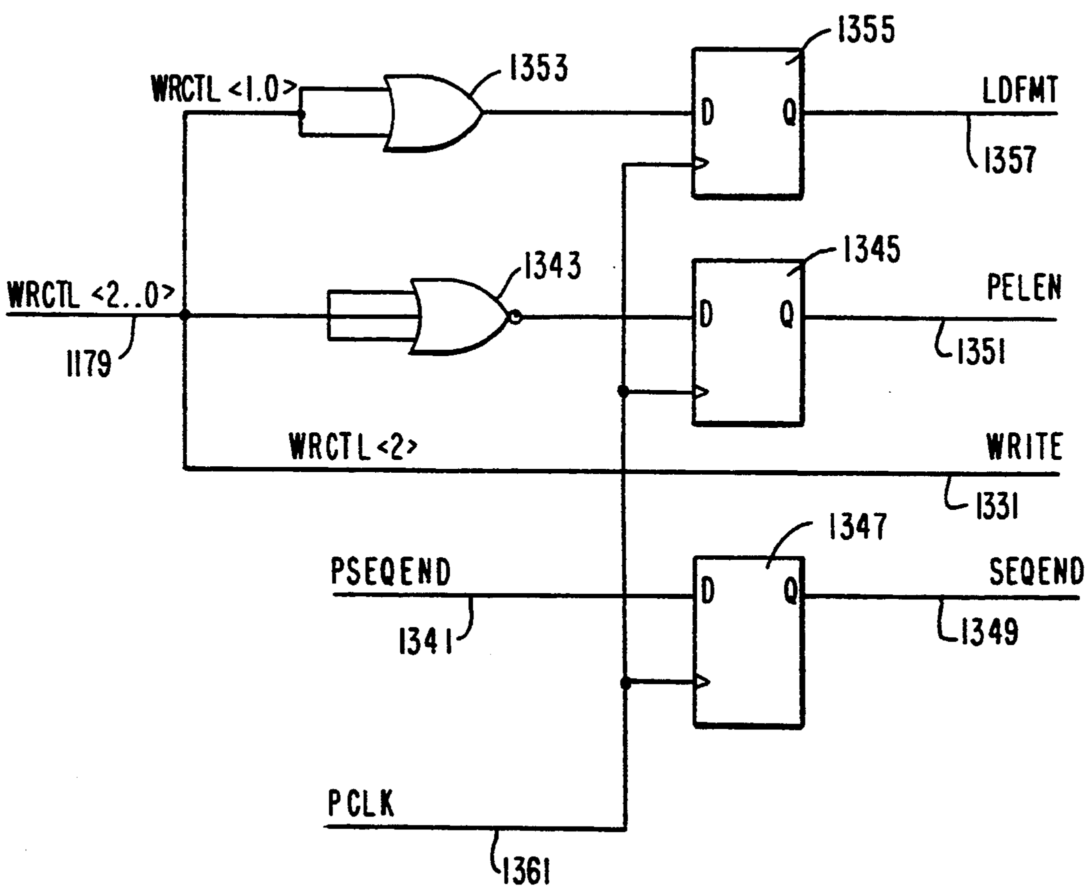
FIG. 31 is a schematic drawing of the Control Circuit of the CIC of FIG. 25.

FIG. 31 shows a block diagram of control circuitry 1356. Control circuitry 1356 generates certain control signals during pattern presentation mode. Certain of these signals control the input to the data channels. The single bit WRITE signal on line 1331 is sent to parity checker 1354 indicating when the parity checker has valid data. The circuit of FIG. 31 will now be discussed in detail.

The PSEQEND* signal on line 1341 is input to the data input of flip-flop 1347. The flip-flop is clocked by the PCLK signal. The SEQEND signal output from flip-flop 1347 on line 1349 is input to data channel 1350.

The 3-bit WRTCL signal on line 1179 is from PEL 266. The 3 bits are input to NOR gate 1343. The output of NOR gate 1343 is input to the data input of flip-flop 1345. This flip-flop is also clocked by the PCLK signal on line 1361. The output of the flip-flop 1345 is the PELEN signal on line 1351 which is input to the data channels, 1350.

The WRITE signal on line 1331 is the WRCTL<2> bit of the 3 bit WRCTL signal. This signal is input to parity checker 1354.

A 2-bit WRCTL<1..0> signal that is part of the 3-bit WRTCL signal on line 1179 is input to OR gate 1355. The output of OR gate 1355 is input to the data input of flip-flop 1355 whose output is clocked by the PCLK signal. The output of flip-flop 1355 is the load formatter ("LDFMT") signal on line 1357. The LDFMT signal is input to data channels 1350.

Figure 32:
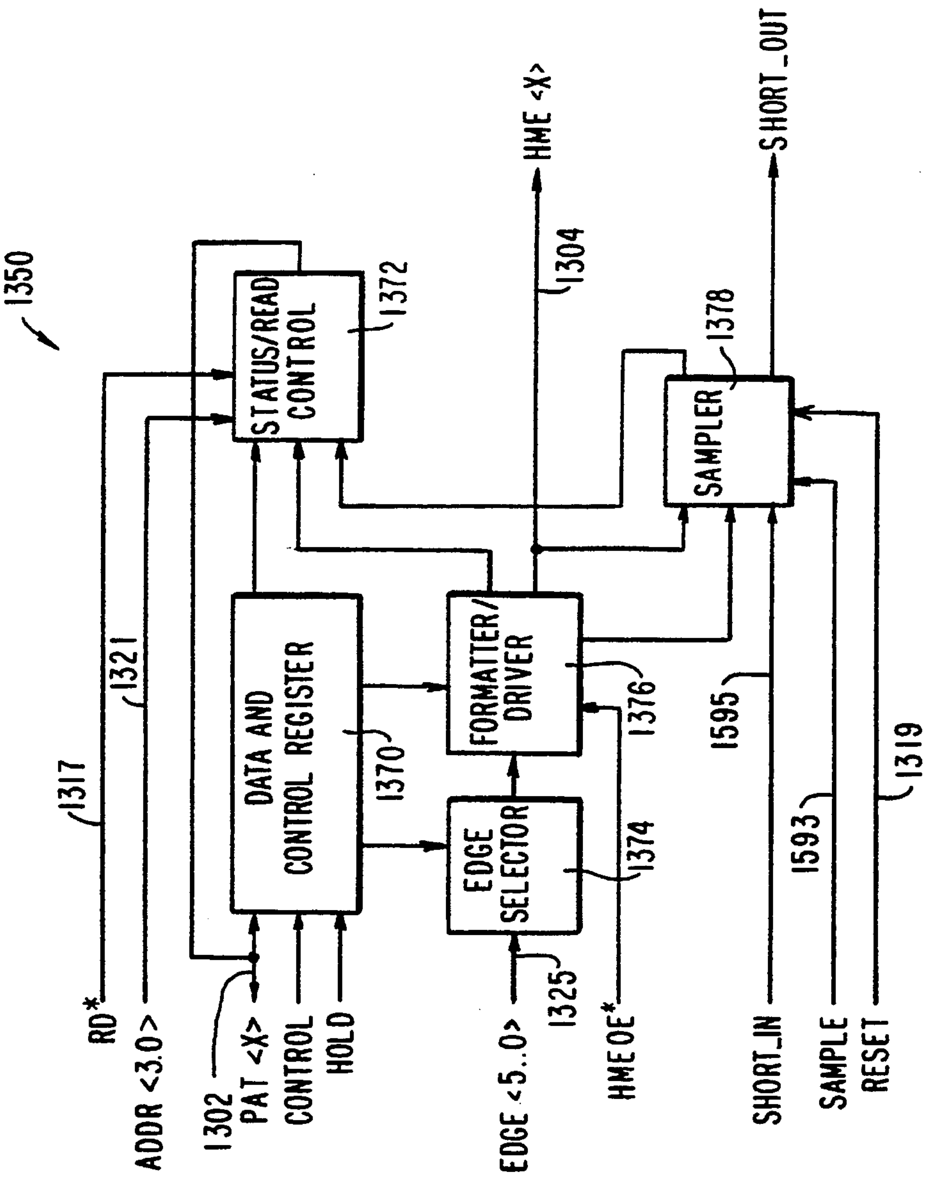
FIG. 32 is a schematic drawing of the Data Channel of the CIC of FIG. 25.

FIG. 32 is a block diagram of data channel 1350. It includes data and control registers 1370, status/read control circuitry 1372, edge selector 1374, formatter/-driver circuitry 1376, and sampler 1378. Registers 1370 receive data from the Pattern Bus. This data is stored in either a configuration register (FIG. 16), a data register, or the hard/medium drive enable register.

Status/read control 1372 is a 16:1 multiplexer that receives inputs from various internal nodes, including registers 1370, formatter/driver 1376, and sampler 1378.

Edge selector 1374 selects which of six timing edges will be used as the "set" edge, the "reset" edge, and the "driver off" edge for a particular bit of pattern data.

The inputs to formatter/driver circuitry 1376 are from data and control register 1370 and edge selector 1374. These inputs cause the formatter/driver circuitry to format the pattern data and drive it to the HME pins.

Sampler 1378 preferably performs two-state sampling on the rising edge of the SAMPLE signal, and five-state sampling on the falling edge of the signal. Sampler 1378 also includes circuitry for detecting short circuits. Each of these components is described subsequently.

Figure 33:
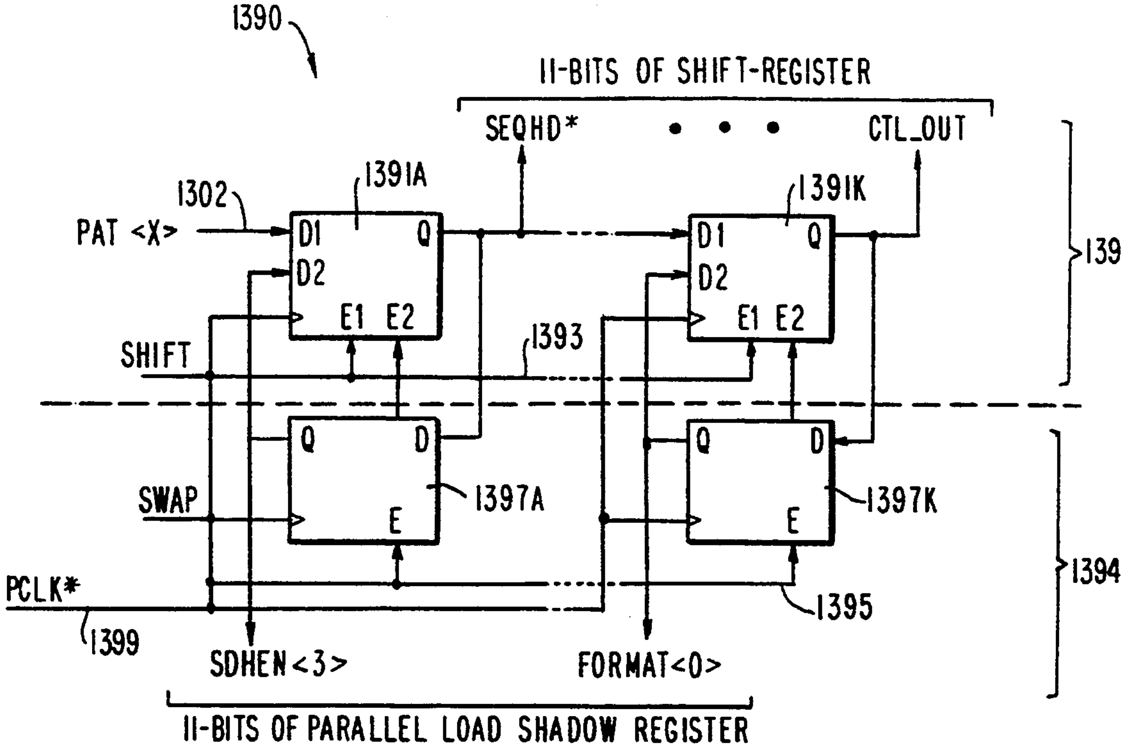
FIGS. 33 and 34 are a schematic drawings of the Data and Control Register of the Data Channel of FIG. 32.
Figure 34:
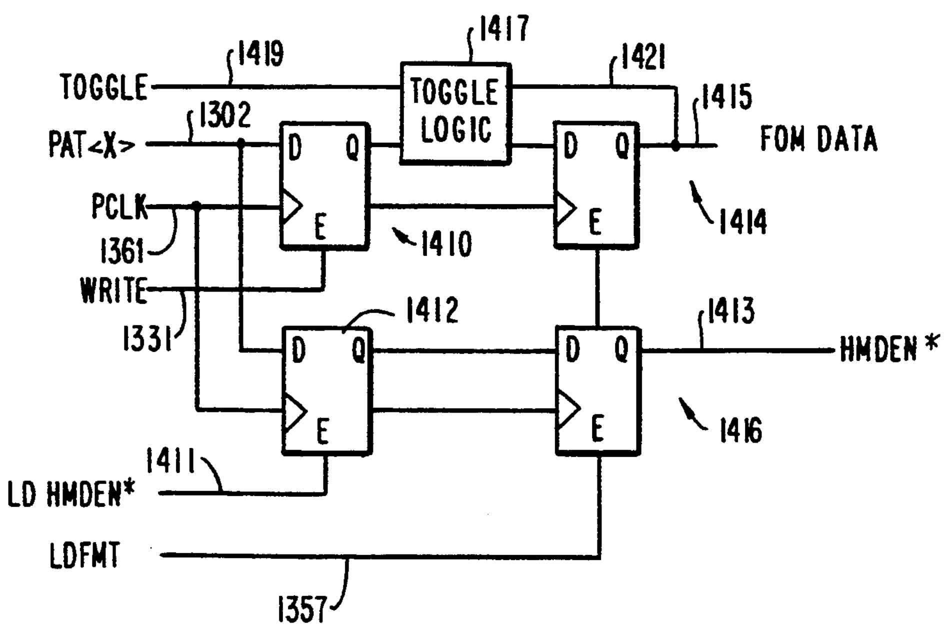

Data and Control registers 1370 include configuration register 1390, shown in FIG. 33, and data and HMDEN* (hard/medium drive enable) registers 1410 and 1412, shown in FIG. 34. Configuration register 1390 is an 11-bit shift register with a parallel-load shadow register. The configuration register must be fully updated when it is written because of the shifting operation. The data and HMDEN* registers, however, may be individually updated in each pattern.

Referring to FIG. 33, configuration register 1390 includes 11-bit shift register 1392 and 1-bit shadow register 1394. The combination of these registers provide control signals for the data channels. The signals output from the configuration register 1390 are set forth in Table 9 and Table 10. The signals in Table 9 are output from shift register 1392 and the signals in Table 10 are output from shadow register 1394.

TABLE 9

| Signal | Description |
|---|---|
| SEQHD* | IN SEQUENCE HARD-DRIVE ENABLE. Enables hard-driving during the interior of a sequence (SEQEND = FALSE) when HMDEN* is asserted low. Occurrence of a SET or RESET edge turns on the hard-drive output enable. |
| SEQMD* | IN SEQUENCE MEDIUM-DRIVE ENABLE. Enables medium-driving during the interior of a sequence (SEQEND = FALSE) when HMDEN* is asserted low. Occurrence of a SET or RESET edge turns on the medium-drive output enable. |
| LCYCHD* | LAST CYCLE HARD-DRIVE ENABLE. Enables hard-driving during the last pattern cycle (SEQEND = TRUE) when HMDEN* is asserted low. Occurrence of a SET or RESET edge turns on the hard-drive output enable. |
| LCYCMD* | LAST CYCLE MEDIUM-DRIVE ENABLE. Enables medium-driving during the last pattern cycle (SEQEND = TRUE) when HMDEN* is asserted low. Occurrence of a SET or RESET edge turns on medium-drive output enables. |
| HDDIS* | HARD-DRIVER DISABLE. When HDDIS* is asserted low, then the DOFF edge turns off the hard-driver during both the interior of a sequence and the last cycle of a sequence. |
| DOFF | DRIVER OFF EDGE SELECT. The DOFF edge turns off selected hard-drivers (using HDDIS*), and it turns off selected medium-drivers during the last cycle when LCYCMD* is asserted low. |
| SET<1 . . 0> | SET EDGE SELECT. Selects the edge for setting HME formatted data to a logic high value. |

TABLE 9-continued

| Signal | Description |
|---|---|
| RESET<1..0> | RESET EDGE SELECT. Selects the edge for setting HME formatted data to a logic low value. |
| CTL_OUT | CONTROL REGISTER OUTPUT. Performs no internal CIC control. Its purpose is to match the length of the shift register with the parallel load shadow register. It is also the bit of the configuration register that can be read (address 3). |

TABLE 10

| Signal | Description |
|---|---|
| SDHEN<3..0> | SOFT-DRIVE HIGH ENABLE. Selects the current for soft-driving a logic high value during the last cycle (SEQEND = TRUE). |
| SDLEN<3..0> | SOFT-DRIVE LOW ENABLE. Selects the current for soft-driving a logic low value during the last cycle (SEQEND = TRUE). |
| TOGGLE | TOGGLE FORMAT. When TRUE, TOGGLE selects the Input Pattern Data to be toggled when PAT<X> = 1, and unaffected when PAT<X> = 0. When FALSE, PAT<X> Input Pattern Data is unaffected. |
| FORMAT<1..0> | FORMAT: selects the data format used for a channel (RC = 00, RZ = 01, R1 = 10, DNRZ = 11). |

The method by which these signals are output from configuration register 1390 will now be described.

11-bit shift register 1392 includes eleven flip-flops, 1391A–1391K. Each flip-flop has two data inputs and a single output. For example, the first data input of flip-flop 1391A is connected to patten bus 1302. The output of flip-flop 1391A is connected to the first data input of the flip-flop 1391B. This output-to-input connection method between successive flip-flops is repeated for the remainder of the flip-flops, 1391C–1391K. The first input is provided at the output when the SHIFT signal on line 1393 is asserted and the second is provided at the output when the SWAP signal on line 1395 is disasserted. Flip-flops 1391A–1391K are clocked by the PCLK* signal on line 1399.

Parallel load shadow register 1394, like shift register 1392, has eleven flip-flops, 1397A–1397K. These flip-flops, however, have one input and one output and are enabled when the SWAP signal on line 1395 is asserted. Flip-flops, 1397A–1397K are also clocked by the PCLK* signal on lines 1399.

The output of each flip-flop of shift register 1392 is connected to the data input of one of the flip-flops of shadow register 1394. The output of each shadow register flip-flop is connected to the second data input of the flip-flop of shift register 1392 to which its data input is connected to the output of that same shift register flip-flop.

In operation, data from Pattern Bus line 1302 that is properly addressed is serially input to shift register 1392. This is accomplished by asserting the SHIFT signal which enables the first data input of each of the eleven flip-flops, 1391A–1391K. Therefore, on the next eleven PCLK* clock pulses, the eleven bits on the pattern data are serially loaded into shift register 1392.

The data that is loaded is control data that is organized such that the SEQHD* signal is at first flip-flop 1391A (or first bit) and the CTL_OUT signal is at eleventh flip-flop 1391K (or eleventh bit). The remainder of the flip-flops are loaded with a control data in the order presented in Table 9.

After shift register 1392 is loaded, the SHIFT signal is deasserted and the SWAP signal is asserted. This enables flip-flops 1397A–1397K of the shadow register and enables the second data input of the flip-flops 1391A–1391K. On the next clock, the data at the output of the flip-flops 1391A–1391K is clocked through shadow registor flip-flops 1397A–1397K.

During this same clocking operation the data at the output of the flip-flops 1397A–1397K, which is presented at the second data input of shift register flip-flops 1397A–1397K, is clocked through these flip-flops. This data will be shifted out as the next 11 bits are shifted into shift register 1392.

FIG. 34 shows the data and HMDEN* registers of data channels 1350. The data register is shown at 1410 and the HMDEN* register is shown at 1412. The Pattern Bus signal on line 1302 is input to the data input of each register and both registers are clocked by the PCLK signal on line 1361. However, each register is enabled by a different signal. Data register 1410 is enabled by the WRITE signal on line 1331 and the HMDEN* register is enabled by the LDHMDEN* (Load hard/medium drive enable) signal on line 1411.

The output of data register 1410 is input to toggle logic 1417. The other inputs to toggle logic 1417 are the TOGGLE signal on line 1419 and the feedback signal on line 1421 from the output of formatter register 1414. Toggle logic 1417, based on the state of the TOGGLE signal 1419, will provide at the output, the fed-back FOMDATA (formatted data) signal on line 1415, or the output of the data register 1410.

The output of the toggle logic is input to the data input of formatter register 1414. This register is clocked by the the PCLK signal on line 1361 and is enabled by the LDFMT signal on line 1357. The output of formatter register 1414 is the FOMDATA signal on line 1415 which is used at various places in the circuitry as will be disclosed.

The output of HMDEN* register 1412 is input to the data input of formatter register 1416. This formatter register is clocked by the the PCLK signal on line 1361 and is enabled by the LDFMT signal on line 1357. The output of formatter register 1416 is the HMDEN* signal on line 1413 which is also a signal used in various places in the circuitry.

The WRITE signal and the LDHMDEN* signal are asserted at different times so that the data from each register can be loaded into its associated formatter register on different patterns and output from the formatter registers at the same time when the LDFMT signal is asserted.

With regard to serially configuring the CICs, as shown in FIG. 27, the data and HMDEN* registers of all of the CICs are serially loaded with pattern data. Once each has its data clocked to its respective formatter registers, all of the formatter registers are enabled at the same time with the LDFMT signal.

Figure 35:
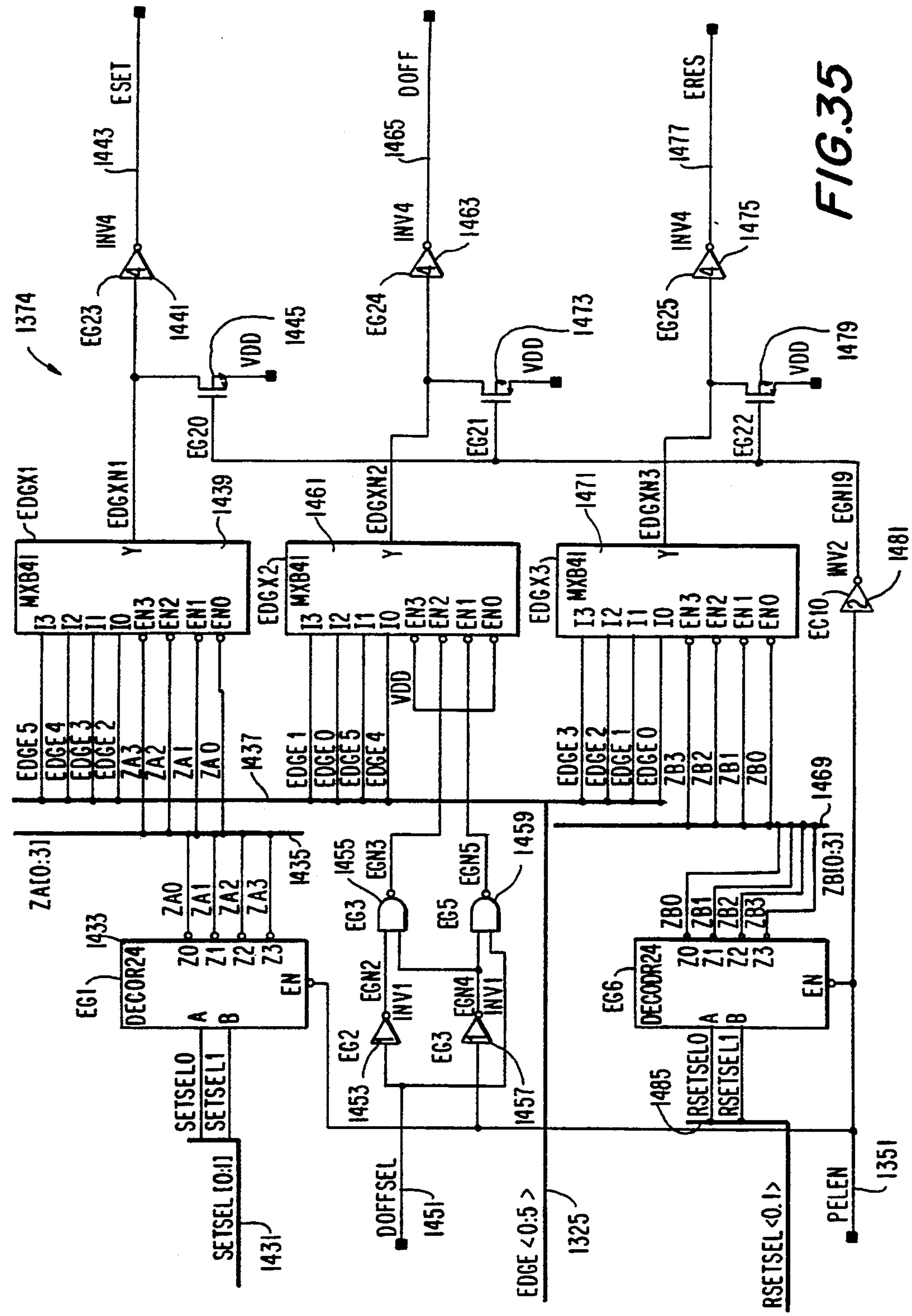
FIG. 35 is a schematic drawing of the Edge Selector circuitry the CIC of FIG. 25.

FIG. 35 shows edge selector circuitry 1374 of data channels 1350. Each data channel 1350 includes edge selector 1374. Generally, edge selector circuitry 1374 allows the user to program which of the six timing edges will function as the set, reset, and driver off edges. The six timing edges are generated by timing generator 248 and input to edge selector 1374 via the Pattern Bus.

The four inputs to the edge selector circuitry are the 2-bit SETSEL signal on line 1431, the DOFFSEL signal on line 1451, the 6-bit EDGE signal on line 1325, and the 2-bit RESETSEL signal on line 1485. All of these signals except the 6-bit EDGE signal are output from shift register 1392 (Table 9). A control input to the circuitry is the PELEN* signal on line 1351.

The 6-bit EDGE signal on line 1325 is a 6-bit bus that connects to data selectors 1439, 1461, and 1471. From this bus, the EDGE 2, 3, 4, and 5 bits are input to data selector 1439, the EDGE 0, 1, 4, and 5 bits are input to data selector 1461, and the EDGE 0, 1, 2, and 3 signals are input to data selector 1471.

The 2-bit SETSEL signal is input to decoder 1433. The decoder provides a parallel, 4-bit output on bus 1435. Bus 1435 is connected to the four enable inputs of data selector 1439. Based on the logic values of the 4-bit signal from bus 1435, one of the EDGE signals is selected as the ESET signal on line 1443 after being processed by inverter 1441.

The DOFFSEL signal on line 1451 is input to NAND gate 1455 after being processed by inverter 1453, and is input to NAND gate 1459. The PELEN signal on line 1351 is the second input to NAND gates 1455 and 1459 after being processed by inverter 1457. The outputs of the NAND gates are tied and input to the enable inputs of data selector 1461. The selected EDGE signal is the output from the data selector and is the DOFF signal on line 1465 after it has been processed by inverter 1463.

The 2-bit RESETSEL signal is input to decoder 1467. Decoder 1467 has a parallel, 4-bit output that is put on 4-bit bus 1469. Bus 1469 is connected to the four enable inputs to data selector 1471. The logic values of the 4-bit signal input to the enable inputs cause selection of one the EDGE signals as the ERES signal on line 1477 after being processed by inverter 1475.

The PELEN* signal is also the output enable signal for decoders 1433 and 1467. It is also the gate signal for the p-channel devices used as pull-ups for each of the output lines of the edge selector.

Table 11 shows the preferred edge select options and the corresponding edge assignments. However, it is understood that other selection options and edge assignments are possible within the scope of the present invention.

TABLE 11

| Edge Type | Select | Output |
|---|---|---|
| Set EDGE | 00 | EDGE<2> |
| Set EDGE | 01 | EDGE<3> |
| Set EDGE | 10 | EDGE<4> |
| Set EDGE | 11 | EDGE<5> |
| Reset EDGE | 00 | EDGE<0> |
| Reset EDGE | 01 | EDGE<1> |
| Reset EDGE | 10 | EDGE<2> |
| Reset EDGE | 11 | EDGE<3> |
| DOFF EDGE | 00 | EDGE<0> |
| DOFF EDGE | 01 | EDGE<5> |

An important feature of edge selector 1374 is that it can disable any timing edge from passing through the edge selector output, thereby permitting an entire PEL 266 to be disabled.

The data selectors of edge selector circuitry 1374 may be designed to suit the needs of particular applications. In applications in which it is desirable to save die area on the CIC, two 4:1 data selectors (with a 2-bit select) and one 2:1 data selector (with a 1-bit select) may be used. Where die area is not a limiting factor, it may be preferable to use three 6:1 data selectors or even three 8:1 data selectors. However, additional pins may be required to address the larger data selectors.

Figure 36:
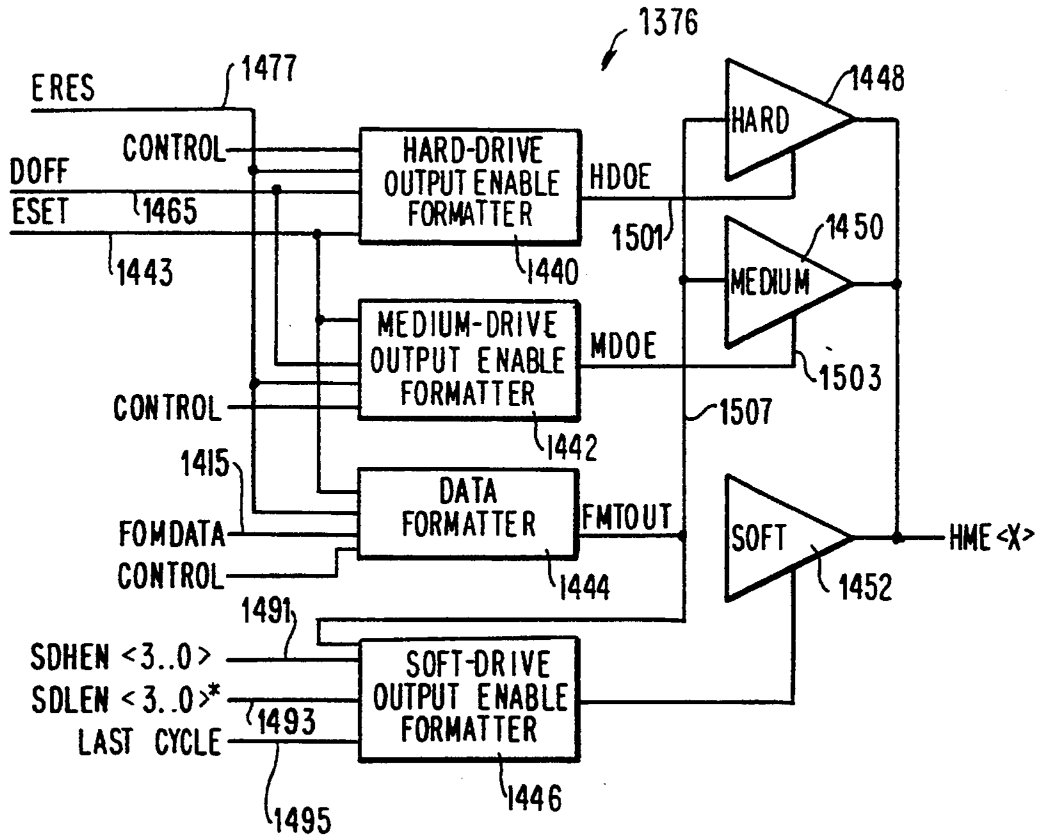
FIG. 36 is a schematic drawing of the Formatter/-Driver circuitry of the Data Channel of FIG. 32.

FIG. 36 shows data formatter 1376. Formatter 1376 includes hard-drive output enable formatter 1440, medium-drive output enable formatter 1442, data formatter 1444, and soft-drive output enable formatter 1446. Formatter 1376 also includes hard driver 1448, medium driver 1450, and soft driver 1452.

Figure 37:
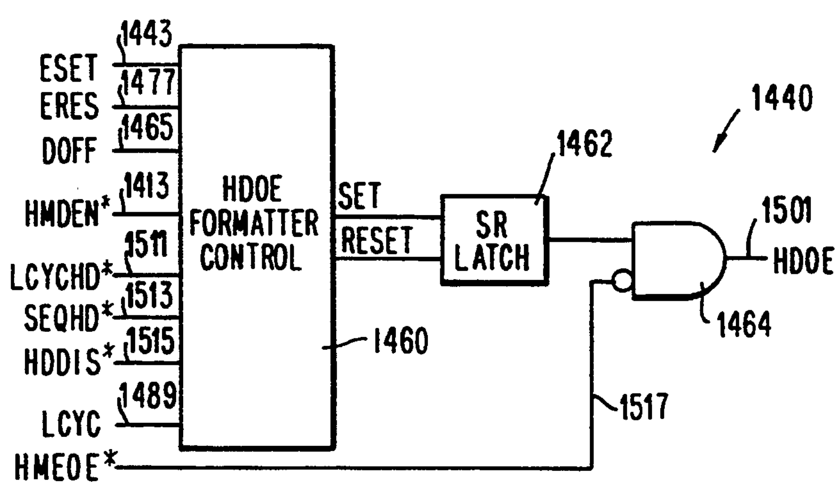
FIG. 37 is a schematic drawing of the Hard-Drive Output Enable Formatter of the Formatter/Driver circuitry of FIG. 36.

The common inputs to hard-drive output enable formatter 1440, medium-drive output enable formatter 1442, and data formatter 1444 are the ERES signal on line 1477 and the ESET signal on line 1443. A common input to just the hard-drive output enable formatter and the medium-drive output enable formatter is the DOFF signal on line 1465. The three signals, ERES, ESET, and DOFF, relate to the timing edges that were selected. The other inputs to the hard-drive output enable formatter are control signals that are representatively shown as the single input signal CONTROL. The signals on this line are the LCYC* signal on line 1495, HMDEN* signal on line 1413, HDDIS* signal on line 1515, SEQHD* signal on line 1513, LCYCHD* signal on line 1511; and the HMEOE* signal on line 1517 (FIG. 37). The output of the hard-drive output enable formatter is the HDOE signal on line 1501 which is the output enable signal for hard driver 1448.

Figure 38:
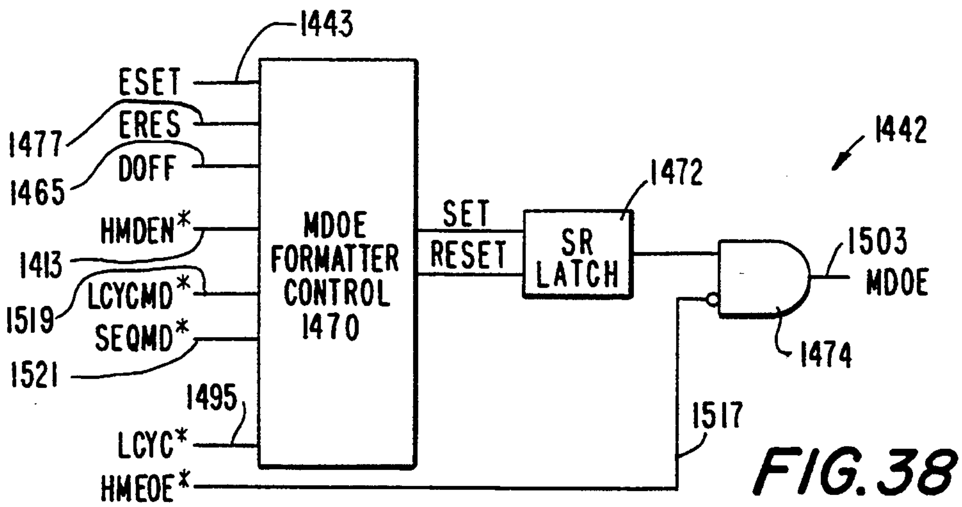
FIG. 38 is a schematic drawing of the Medium-Drive Output Enable Formatter of the Formatter/Driver circuitry of FIG. 36.

Similarly, the control inputs to medium-drive output enable formatter are the LCYC* signal on line 1495, SEQMD* signal on line 1521, HMDEN* signal on line 1413, LCYCMD* signal on line 1519; the HMEOE* signal on line 1517 (FIG. 38). The output of the medium-drive output enable formatter is the MDOE signal on line 1503 which is the enable signal for medium driver 1450.

The other inputs to data formatter 1444 are the 2-bit FORMAT signal on line 1523 and FOMDATA signal on line 1415. The output of data formatter 1444 is the FMTOUT (formatted data) signal on line 1507 which is input to the hard and medium drivers, and the soft-drive output enable formatter.

The inputs to soft-drive output enable formatter 1446 are the 4-bit SDHEN signal on line 1491, the 4-bit SDLEN* signal on line 1493, the LCYC signal on line 1489, which is the inverted LCYC* signal, and, as stated, the FMTOUT signal on line 1507.

Data formatter 1376 uses the ESET signal to set HME pins to logic high value, the ERES signal edge to reset HME pins to logic low value, and the DOFF signal to turn off the hard and medium drivers. The set and reset edges are also used to turn on the hard and medium driver. However, even though the set edge changes data from a logic low to a logic high value, it does not affect data which is already a logic high value. Conversely, even though the reset edge changes data from a logic high to a logic low value, it does not affect data which is already logic low value.

FIG. 37 is a block diagram of hard-drive output enable formatter 1440 in greater detail. The signals input to hard-driver output enable formatter were described in discussing FIG. 36. Formatter 1440 includes hard-drive control circuitry 1460, SR latch 1462, and AND gate 1464. The control circuitry operates according to the true table set forth in Table 12.

TABLE 12

| HMDEN* | LCYCHD* | SEQHD* | HDDIS* | LCYC* | EDGE(s) needed | LATCH |
|---|---|---|---|---|---|---|
| 1 | X | X | X | X | X | RESET |
| X | X | X | 0 | X | DOFF | RESET |
| 0 | X | 0 | X | 0 | Set or Reset | SET |
| 0 | 0 | X | X | 1 | Set or Reset | SET |

The input signals to HDOE formatter control 1460 will cause it to generate output signals at the set and reset outputs which are input to SR latch 1462. The output of the SR latch is input to AND gate 1464. The second input to AND gate 1464 is the HMEOE* signal on line 1464. This signal is input to the negative-true input of the AND gate. The output of AND gate 1464 is the HDOE signal on line 1501.

According to the logic in Table 12, several specialized operations are possible. Assertion of the LCYC* signal permits the HMS to hard drive an HME pin at one stage of the pattern presentation (e.g., during the "restore" operation of pattern presentation) and to soft drive the same HME pin at a second stage of the simulation (e.g., during the "measurement" cycle of pattern presentation).

HME pins known to be dedicated input pins preferably are always hard-driven to establish a fast, clean transition from a logic high to logic low value and from a logic low to logic high value. There is no need to soft-drive such pins since these pins can never become output pins.

HME I/O pins can be driven by pulsing the hard driver. Circuit 1460 also enables operating with two bits per pin (normal operation is one bit per pin). When operating in the two bits per pin mode, the first bit is control bit, and the second bit is the data bit.

FIG. 38 shows medium-drive output enable formatter 1442 in greater detail. The signals input to the medium-driver output enable formatter were described in discussing FIG. 38. The components of formatter 1442 are similar to the components of hard-drive output enable formatter 1440. The medium-driver output enable formatter includes medium-drive control circuitry 1470, SR latch 1472, and AND gate 1474. This circuitry operates according to the truth table set forth in Table 13.

Figure 39:
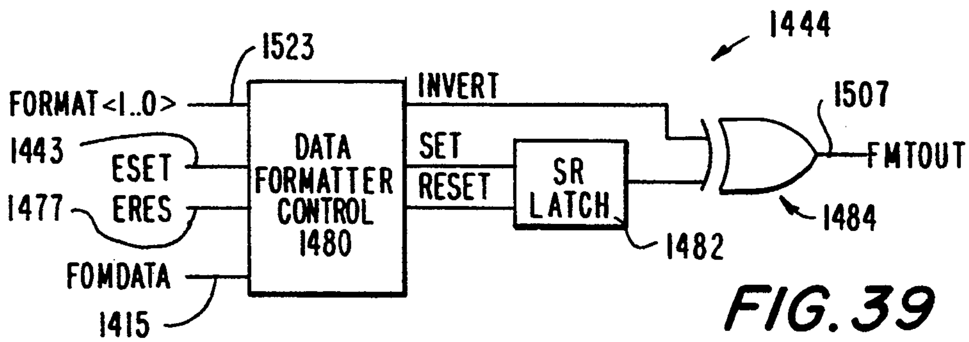
FIG. 39 is a schematic drawing of the Data Formatter of the Formatter/Driver circuitry of FIG. 36.

FIG. 39 shows data formatter 1444. The signals input to the data formatter were described in discussing FIG. 36. Formatter 1444 includes data formatter control circuitry 1480, SR latch 1482, and exclusive-OR gate 1484. This control circuitry operates according to the truth table in Table 14.

TABLE 14

| FORMAT<1..0> | FOMDATA | Set EDGE | Reset EDGE | Invert |
|---|---|---|---|---|
| RC=00 | 0 | PASS | PASS | 1 |
| | 1 | PASS | PASS | 0 |
| RZ=01 | 0 | — | PASS | 0 |
| | 1 | PASS | PASS | 0 |
| R1=10 | 0 | PASS | PASS | 0 |
| | 1 | PASS | — | 0 |
| DNRZ=11 | 0 | — | PASS | 0 |
| | 1 | PASS | — | 0 |

The INVERT output of data formatter control 1480 is the first input to exclusive OR gate 1484. The input signals are processed according to the logic values. The set and reset outputs are input to the SR latch 1402. The output of the SR latch is the second input to exclusive-OR gate 1484. The output of the gate is the FMTOUT signal on line 1507. Exclusive-OR gate 1484 is used to invert the data during "return to complement" formatting ("RC"), as will be explained.

Figure 40:
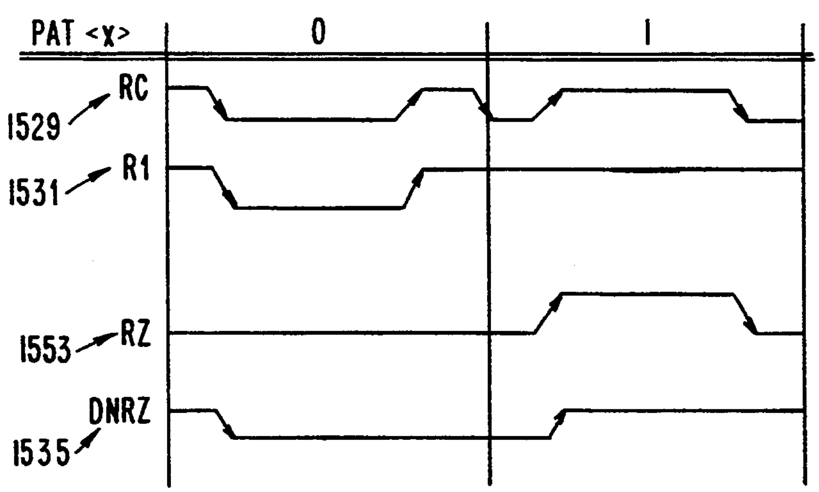
FIG. 40 shows the four signal formats for transmitting data and clocks to the HME in accordance with the present invention.
Figure 4I:
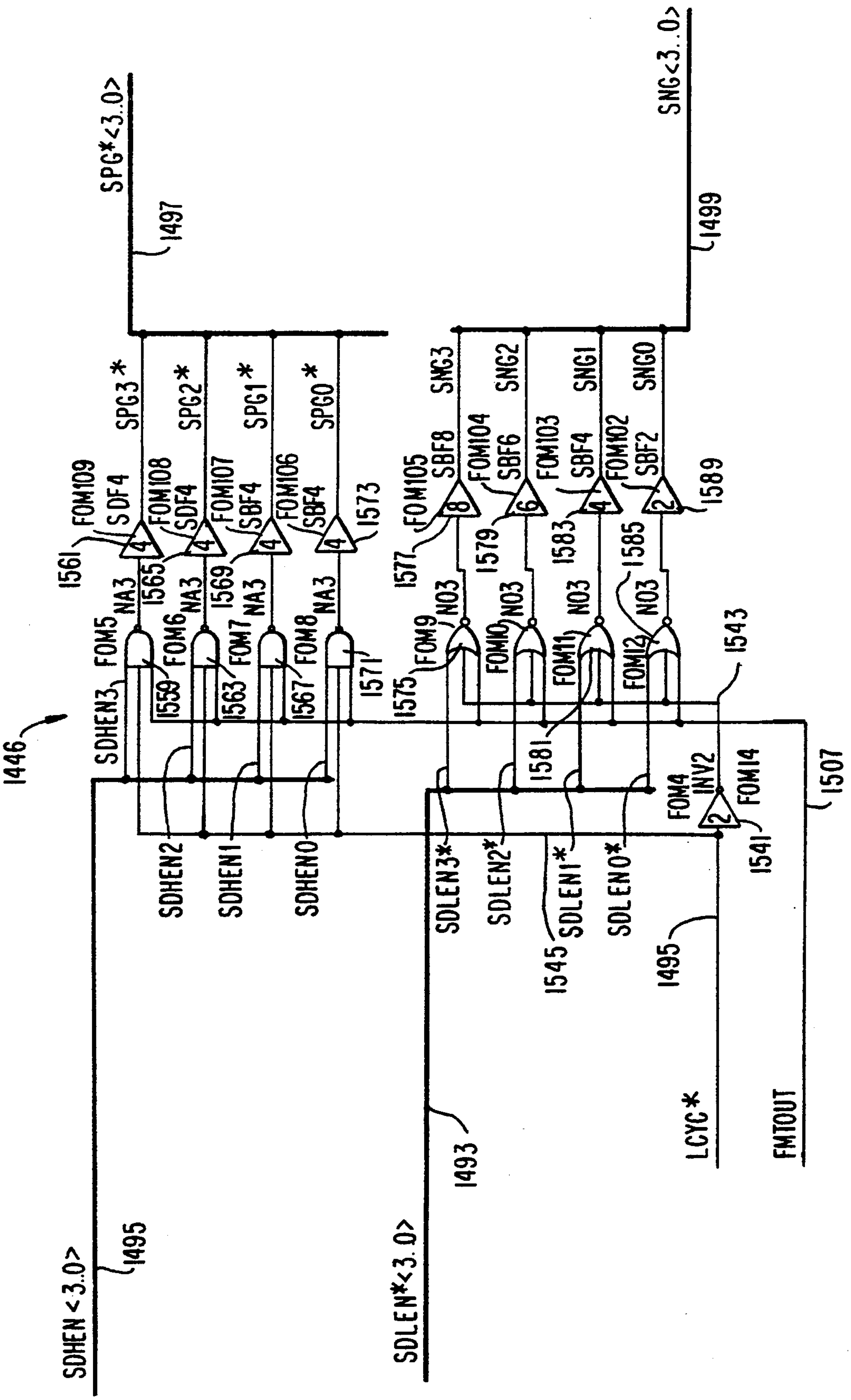

Referring now to FIG. 40, data may be transmitted using one of four formats. These formats where shown in Table 14. They are return to complement ("RC") format at 1529, return to zero ("RZ") format at 1533, return to one ("R1") format at 1531, or delay no return to zero ("DNRZ") format at 1535. In the figure, a rising edge indicates a set timing edge, and a falling edge indicates a reset timing edge. These four data formats permit the use of complex patterns while still using only one data bit per pin.

TABLE 13

| HMDEN* | LCYCMD* | SEQMD* | LCYC* | EDGE(s) needed | LATCH |
|---|---|---|---|---|---|
| 1 | X | X | X | X | RESET |
| X | X | X | 1 | DOFF | RESET |
| X | 1 | X | 1 | Set or Reset | RESET |
| 0 | X | 0 | 0 | Set or Reset | SET |
| 0 | 0 | X | 1 | Set or Reset | SET |

The input signals are processed by the MDOE formatter and the set and reset outputs are input to SR latch 1472. The output of SR latch 1472 is input to AND gate 1474. The second input to AND gate 1474 is the HMEOE* signal on line 1517 which is input to the negative-true input of the gate. The output of the gate is the MDOE signal on line 1503.

In the operation of the circuits in FIGS. 37 and 38, the SR latch set and reset edges, viz., the ERES and ESRT signals, must not overlap the driver off edge, viz., the DOFF signal. Further, AND gates 1464 and 1474 provide a means for overriding the output of latches 1462 and 1472, respectively, by permitting the respective output enable (HDOE or MDOE) to be gated with the HMEOE* signal.

Table 14 shows the function of each format. The RC format permits all data to pass to SR latch 1482, regardless of its value, but inverts the latch output. The RZ format passes all data with a logic high value, but only the reset timing edge is passed with a logic low value. The R1 format passes all data with a logic low value, but only the set timing edge is passed with a logic high value. In the DNRZ format, the only logic low value that will be passed is the reset timing edge when it has a true logic state; and similarly, the only logic high value that will be passed is set timing edge when it has a true logic state. The SR latch set and reset timing edges cannot overlap or operation may be unpredictable.

FIG. 41 shows soft-drive output enable formatter 1446. The formatter consists of two sections. The first is a series of four NAND gates with an inverter at the output of each NAND gate, and the second is a series of NOR gates with an inverter at the output of each NOR gate. The first section includes NAND gates 1559, 1563, 1567, and 1571. Each is a three input device with the LCYC* signal on line 1495 and the FMTOUT signal on line 1507 at two of the inputs. The third input to the NAND gates is one of the bits of the 4-bit SDHEN signal on line 1491. Under normal operations, the logic value of the 4-bits of the SDHEN signal determine the value of the outputs of the NAND gates, assuming the gates are enabled.

The outputs of NAND gates 1559, 1563, 1567, and 1571 are processed by inverters 1561, 1565, 1569, and 1573, respectively. The outputs of the inverters for form the 4-bit SPG* signal on line 1497.

The second section is similar to the first, except for the gates and the logic value of the LCYC* signal. The second section has four NOR gates with an inverter at the output of each. The second includes NOR gates 1575, 1579, 1581, and 1585. Each is a three input device with the LCYC signal on line 1593 and the FMTOUT signal on line 1507 at two of the inputs. The third input to the NOR gates is one of the bits of the 4-bit SDLEN signal on line 1493. Under normal circumstances, the logic value of the 4-bits of the SDLEN signal determine which output of the NOR gates will be asserted, assumming the gates are enabled.

The outputs of NOR gates 1575, 1591, 1581, and 1585 are processed by inverters 1577, 1579, 1583, and 1589, respectively. The outputs of the inverters form the 4-bit SNG signal on line 1499.

Soft driver 1452 preferably is enabled during the last cycle of a pattern sequence. Soft-drive output enable formatter 1446 uses the LCYC* signal to gate on and off the high and low soft driver enables, the 4-bit SDHEN signal, and the 4-bit SDLEN* signal. Soft driver 1452 includes separate high and low soft driver enables so that different levels of current may be programmed for driving a logic high and a logic low value. The HMEOE* signal can be used to gate the soft drive output enables off.

Figure 42:
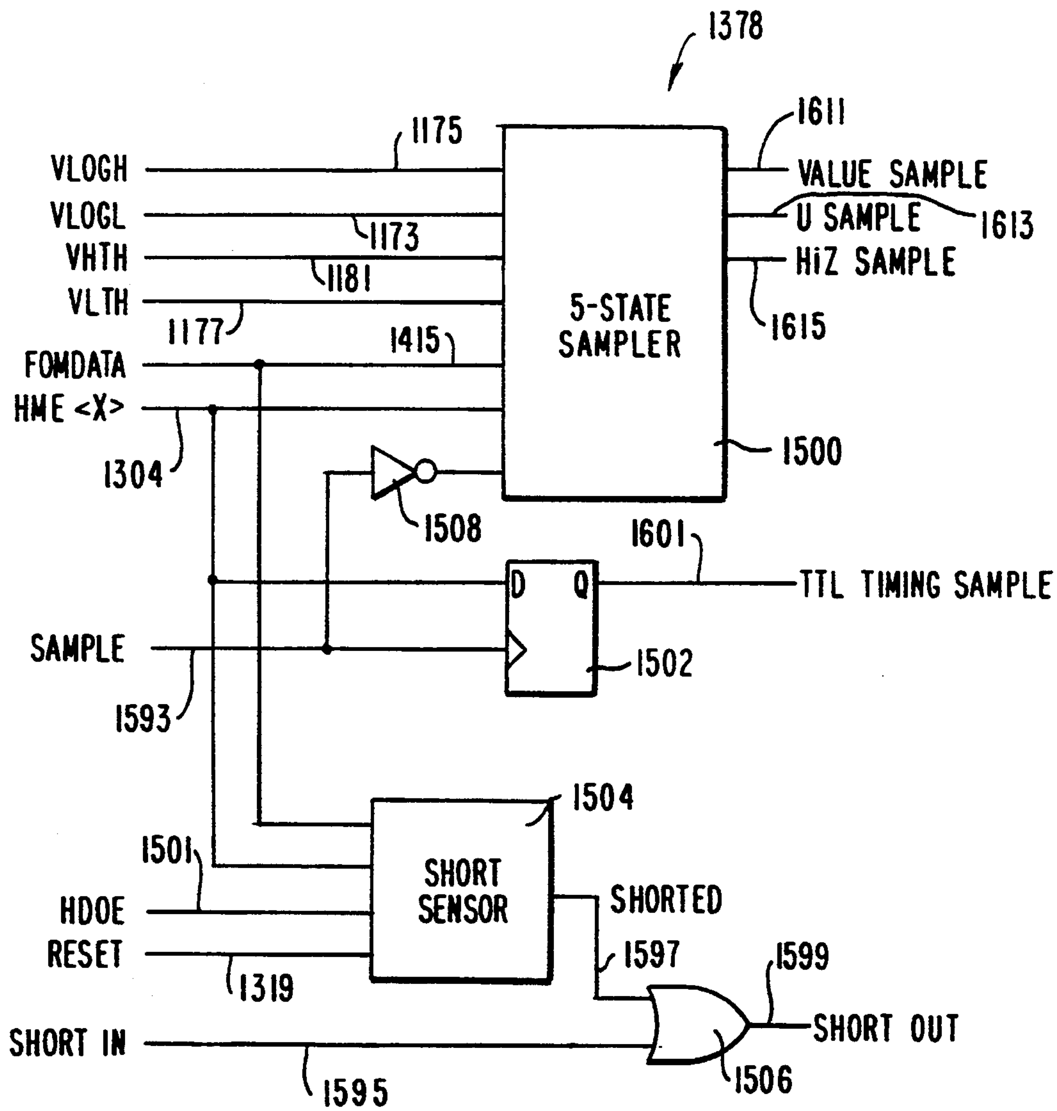
FIG. 42 is a schematic drawing of the sampling circuitry of the Data Channel of FIG. 32.

FIG. 42, is a block diagram of sampling circuitry 1378. This circuitry is used to sample the output signals from HME pins. Sampling circuitry 1378, preferably includes 5-state sampler 1500, 2-state timing sampler 1502, and short sensor 1504. 5-state sampler 1500 includes analog circuitry for determining whether an HME output signal is a driven high or low, non-driving high or non-driving low, or an unknown level. Before 5-state sampler 1500 is disclosed in detail, the 2-state sampler 1502, short sensor 1504, and the analog support circuits will be disclosed.

Again referring to FIG. 42, 2-state timing sampler 1502 preferably is a flip-flop that is clocked on the positive edge of the clock signal. The output of the flip-flop is TTL timing sample signal on line 1601. The input to flip-flop 1502 is the HME bus signal on line 1304 and the signal that clocks the flip-flop is the SAMPLE signal on line 1593. The 2-state sampler 1502 is controlled by strobing the SAMPLE signal.

Figure 43:
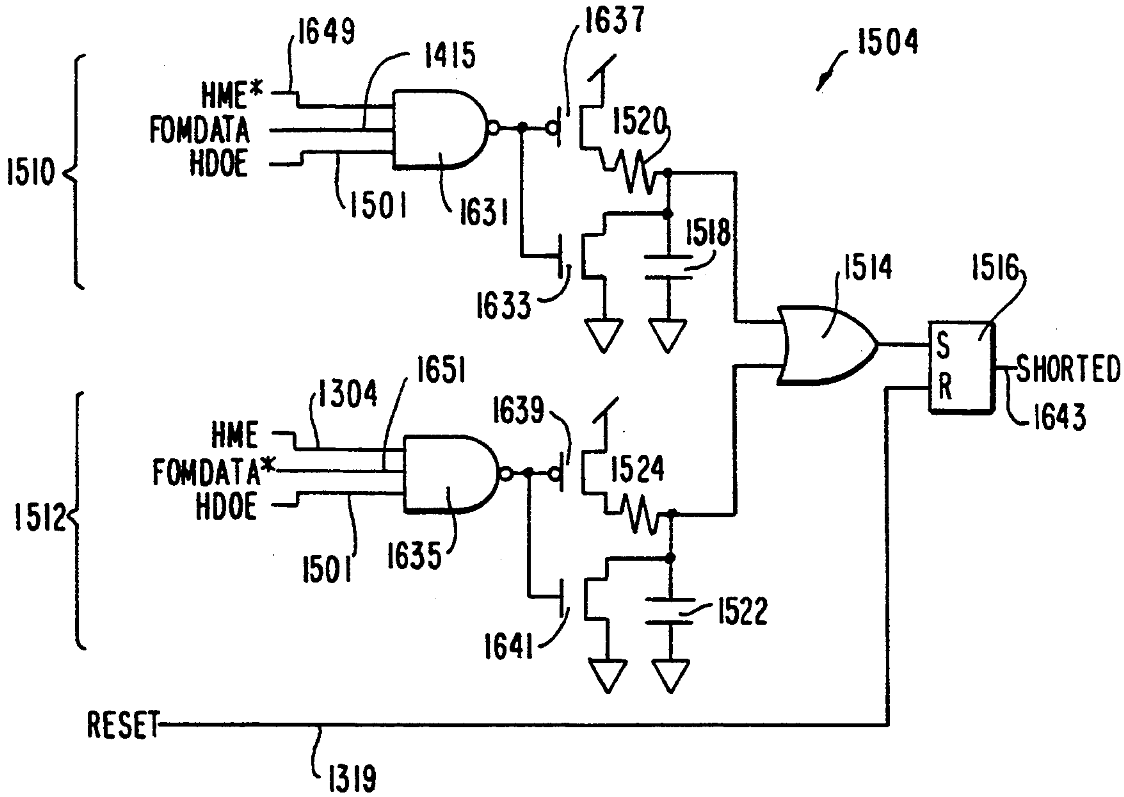
FIG. 43 is a schematic drawing of the Short Sensor circuitry of the sampling circuitry of FIG. 42.

FIG. 43 shows a detailed diagram of short sensor 1504. The short sensor circuitry at 1504 and OR gate 1506 (FIG. 42) combine to provide the SHORT_OUT signal on line 1599.

Generally, short sensor 1504 is used to detect when a hard-driver has been continuously shorted for more than about 200 ns. Sensor 1504 includes two identical resistor-capacitor circuits 1510 and 1512 that are used for detecting short circuits. Circuit 1510 detects shorts when the data channel is driving a logic high value for the FOMDATA signal and when sensing a logic low value for the HME* signal. Circuit 1512 detects shorts when the data channel is driving a logic low value for the FOMDATA* signal and when sensing a logic high value for the HME signal.

Circuits 1510 and 1512 will now be described. Taking first circuit 1510, the input signals to NAND gate 1631 are the HME* signal on line 1649, the FOMDATA signal on line 1415, and the HDOE signal on line 1501. The output of NAND gate is input to the gates of field effect transistors ("FETs") 1637 and 1633.

Circuit 1512 is the same as circuit 1510 except for the input signals. The inputs to NAND gate 1635 are FOMDATA* signal on line 1651 and the HME signal on line 1304. The HDOE signal on line 1501 is the same. The circuit that includes NAND gate 1635, FETs 1639 and 1641, resistor 1524 and capacitor 1522 is same as the corresponding elements in circuit 1510. The description of circuit 1510 applies here, and is incorporated by reference.

In operation, capacitors 1518 and 1522 charge slowly through resistor 1520 and 1524 when a conflict is being detected, and discharge quickly through FET 1635 and 1641 when there is no conflict. When the voltage on either of the capacitors charges to a logic high value, the bit is determined to be shorted, and the SHORTED error signal bit is latched in SR latch 1516 through OR gate 1514. A RESET signal is used to clear the SHORTED error signal.

Referring to FIG. 42, OR gate 1506 is used to propagate a chip-wide short-sensor status in a daisy-chain fashion. That is, the SHORT_OUT signal on line 1599 of the first data channel 1350 becomes the SHORT_IN signal to OR gate 1506 of the next data channel 1350.

In operation, the HMS drives signals to the HME pins, and then samples the HME pins to determine the HME's response. When an HME pin is known to be a dedicated input pin, the CIC can hard drive the pin without concern. When an HME pin is known to be a dedicated output pin, the CIC need only sample the pin. In these cases, the CIC need not determine the status of the pin prior to driving or sensing it.

The driving and sensing of I/O pins is not as simple. The CIC must not interfere with the sensing of an output and must not force pins to the wrong state. The CIC of the present invention uses soft drivers to drive I/O pins. The soft-drivers drive an I/O pin in such a manner that the pin is driven when in the input state, yet if the pin is itself driving, the CIC allows the HME to overdrive the CIC. The driving and sensing of all pins will now be discussed.

Figure 44:
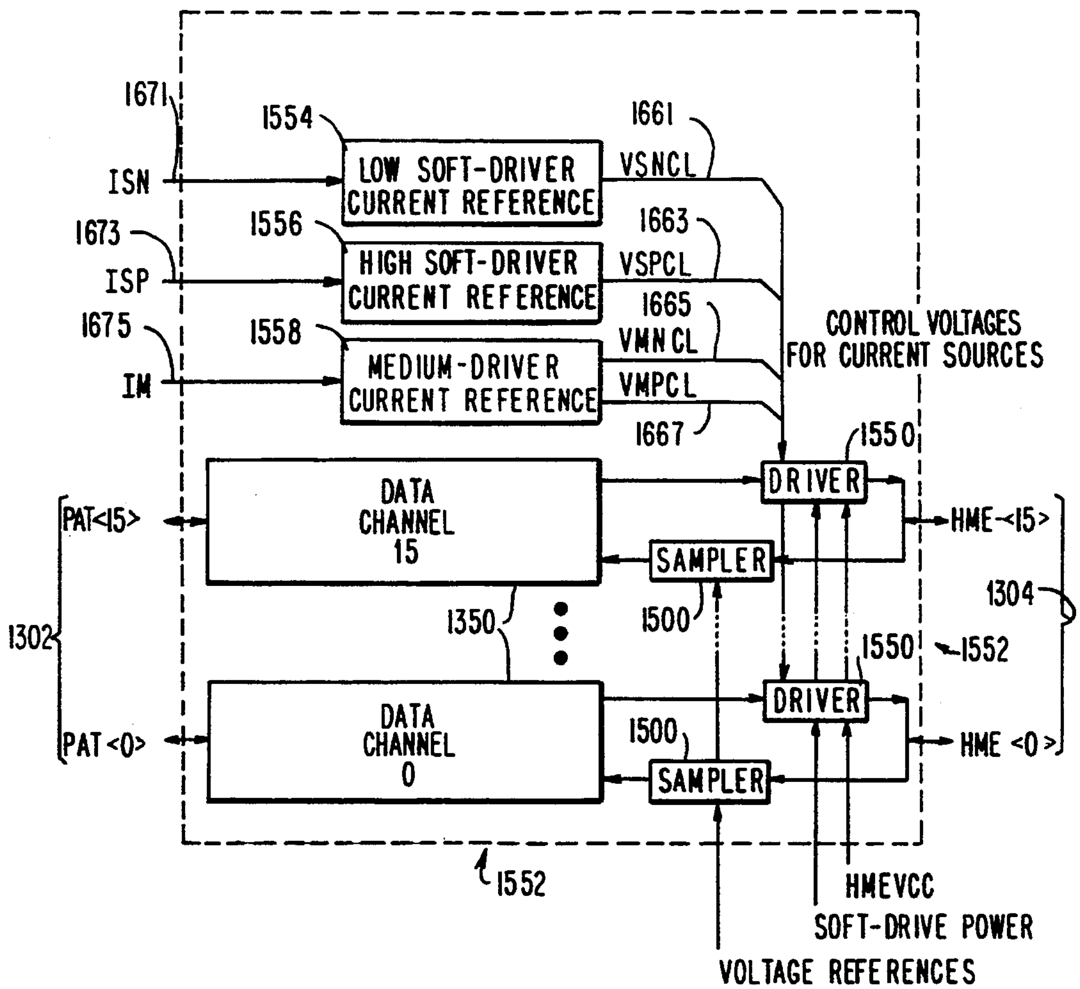
FIG. 44 is a block diagram of the analog sections of the CIC of FIG. 25.

FIG. 44 shows the three main analog sections of CIC 1300. These sections are current references 1554, 1556, and 1558, HME pin drivers 1550, and 5-state sampler 1500. Each of the data channels 1350 includes its own driver 1550 and sampler 1500.

Current references 1554, 1556, and 1558 generate control voltages for current sources in driver 1550. Driver 1550 uses the current sources as pin drivers to reduce current spikes during conflicts between the HME and CIC 1300 (using the medium-drivers), and also to perform unobtrusive 5-state sampling of the HME outputs (using the soft drivers).

The respective input to current reference 1554, 1556, and 1558 is ISN on line 1621, ISP on line 1673, and IM on line 1675. Current references 1554, 1556, and 1558 use these signals to generate control voltages for use by the soft and medium drivers. These are the low soft-driver VSNCL voltage on line 1661, the high soft-driver VSPCL voltage on line 1663, and the medium-driver VMNCL voltage on line 1665 and the medium driver VMPCL voltage on line 1667.

The ISN, ISP, and IM lines connect to ground through external resistors. Preferably, they are connected through 2.5K, 1.25K, and 2.5k ohm resistors, respectively. It is understood that other resistor values may be used to vary the output of the respective current sources.

Figure 45:
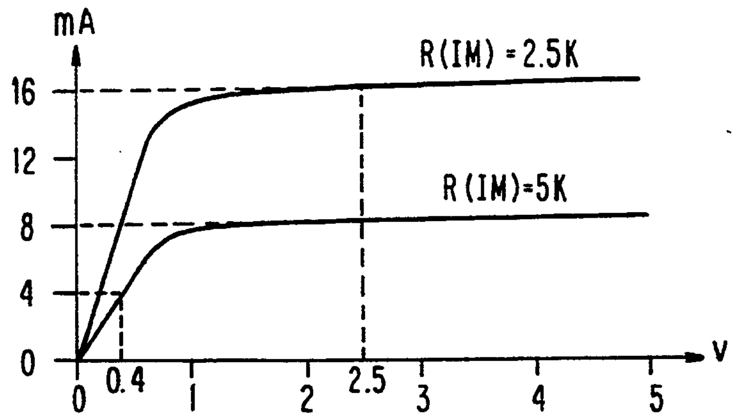
FIGS. 45 and are 46 current/voltage curves for the medium driver of FIG. 47.
Figure 46:
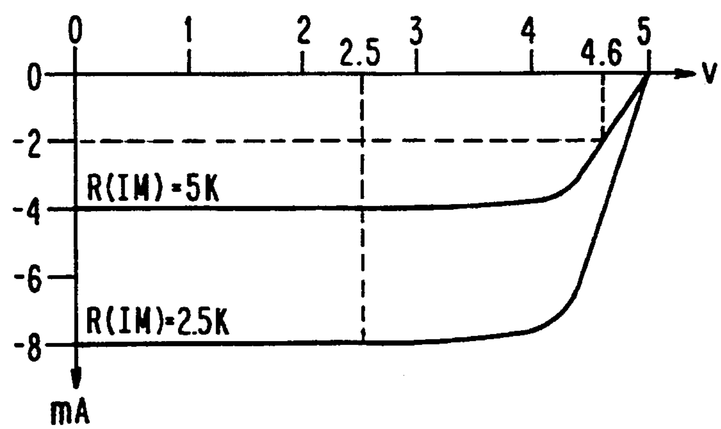

As examples, FIGS. 45 and 46 are representive I/V curves based on resistors of different sizes being connected in the IM line 1675.

Figure 47:
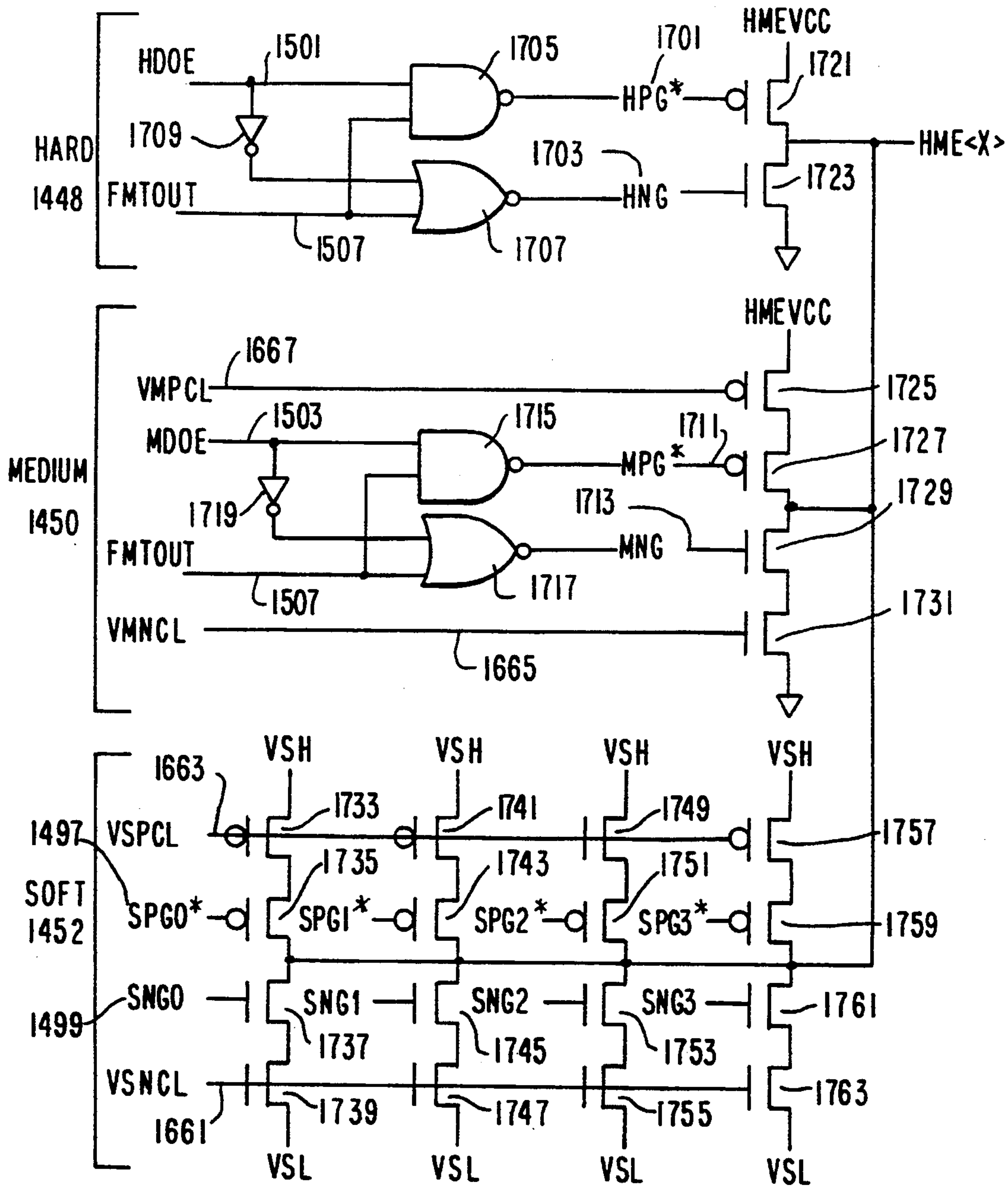
FIG. 47 is a schematic drawing of the soft, medium, and hard drivers of the CIC of FIG. 25.

FIG. 47 shows the HME pin drivers shown generally at 1550 in FIG. 44. The drivers are hard driver 1448, medium driver 1450, and soft driver 1452 (FIG. 36). Medium driver section 1450, and soft driver section 1452 are preferably current limited. The outputs of hard, medium and soft-driver sections are input to the HME pins.

Hard driver 1448 is used to drive an HME pin known to be a dedicated input pin. Hard driver 1570 is preferably not used to drive HME I/O pins except in pulsed mode.

Hard driver 1448 is powered by HMEVCC. The HNG signal on line 1783 and the HPG* signal on line 1701 are the control signals for output enabling the hard driver. These signals are generated by the connected circuit. Since the medium driver uses the same circuit to generate the MPG* signal on line 1711 and the MNG signal on line 1713, the circuit of the hard driver will be described with the corresponding reference numbers for the medium driver circuit shown in paranthesis.

The HDOE (MDOE) signal on line 1501 (1503) is input to NAND gate 1705 (1715) and its compliment is input to NOR gate 1707 (1717) after being inverted by inverter 1709 (1719). The second input to both gates is the FMTOUT signal on line 1507. When the formatted data represented by the FMTOUT signal is input to the gates, the HDOE (MDOE) signal will output enable both gates when it is asserted. Accordingly, this will assert the HPG* (MPG*) signal on line 1701 (1711) and the HNG (MNG) signal on line 1703 (1713) depending on the state of the FMTOUT signal.

Medium-driver 1572 is preferably designed to drive HME I/O pins during the presentation of the history sequence. Medium-driver 1572 has switching times on the order of 10 ns, however, because it is a current source, the driver is current limited. This minimizes current spikes which might occur if there is a conflict between the HME and the medium driver. The medium-driver preferably is current limited as shown in FIGS. 45 and 46.

In these figures, the low medium-driver current limit is programmable preferably from 8 mA to 16 mA and the high medium driver current limit is programmable preferably from −4 mA to −8 mA. This corresponds to the resistor in the IM line having a value of 2.5K.

The control signals for medium-driver 1572 are the MNG signal on line 1713, MPG* signal on line 1711, VMPCL signal on line 1667, and VMNCL signal on line 1665. The MPG* and MNG signals have been discussed. The VMPCL and VMNCL signals are control voltages generated by the low and high medium drivers current references.

Figure 48A:
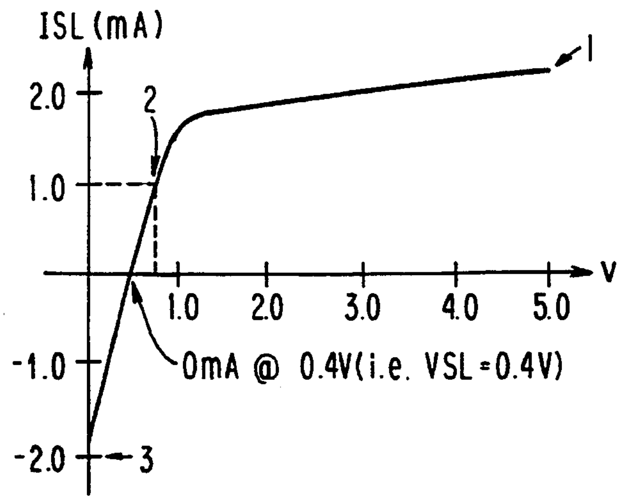
FIGS. 48A–48E show a representation of the I/V characteristic of the low and high soft drivers of FIG. 47.
Figure 48B:
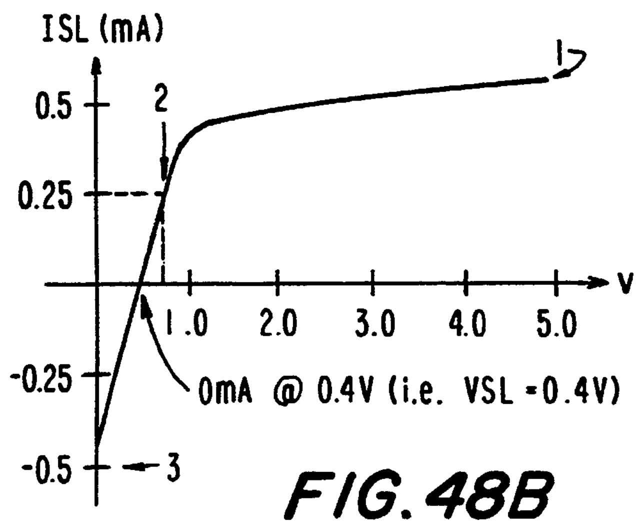

Referring to FIGS. 48A–48E, soft driver I/V characteristic curves will be described. The low soft drivers of the CIC are capable of non-intrusive driving during sampling. The low soft driver, CIC sensing circuitry, and related CMC software have several features to support this capability. Referring to FIGS. 48A and 48B, which are representative soft-drive low I/V characteristic curves for driving TTL, NMOS, CMOS and LCMOS HME pins, these features will be described.

The low soft driver drives toward the programmable drive voltage, VSL. Preferably, the CMC software running on the CPU sets VSL to an appropriate logic low voltage depending upon the HME logic family.

As shown at Point 1 in FIG. 48A, the low soft driver is current limited. This current limit, ISL, is programmable on a pin-by-pin basis. Preferably, the CMC software running on the CPU constrains the low soft driver current limit such that it is less than the source current of the HME pin in the driving high state. Thus, if the HME pin is in a driving high state, the HME pin will overdrive the enabled CIC low soft driver to a logic high.

Preferably, the CMC software running on the CPU sets the low soft driver current limit, depending upon the VSL used, such that if the HME pin is in a non-driving state, then the CIC low soft driver will drive the HME pin to a logic low. For example, for TTL HME pins, the CMC software constrains the low soft driver current limit such that it is more than twice the input leakage current for the HME pin in the non-driving low state. Referring to Point 2 of FIG. 48A, with VSL set at 0.4 V, the low soft driver will drive a TTL HME pin which is in the non-driving state to 0.6 V, which is a valid logic low.

Preferably, the CMC software running on the CPU sets a reference voltage, VLTH, for comparison with the HME pin voltage, depending upon the VSL used and the low soft driver current limit used, so that if the HME pin is in a driving low state and the CIC low soft driver is enabled, then the HME pin voltage will be less than VLTH. For example, at Point 3 in FIG. 48A, the "reverse" current of the low soft driver is less than ISL, the sink current of the HME pin is greater than ISL, and the I/V characteristic curve in this region in essentially linear. In this case, therefore, the CMC software sets VLTH to be closer to VSL than to 0.0 V.

Figure 48C:
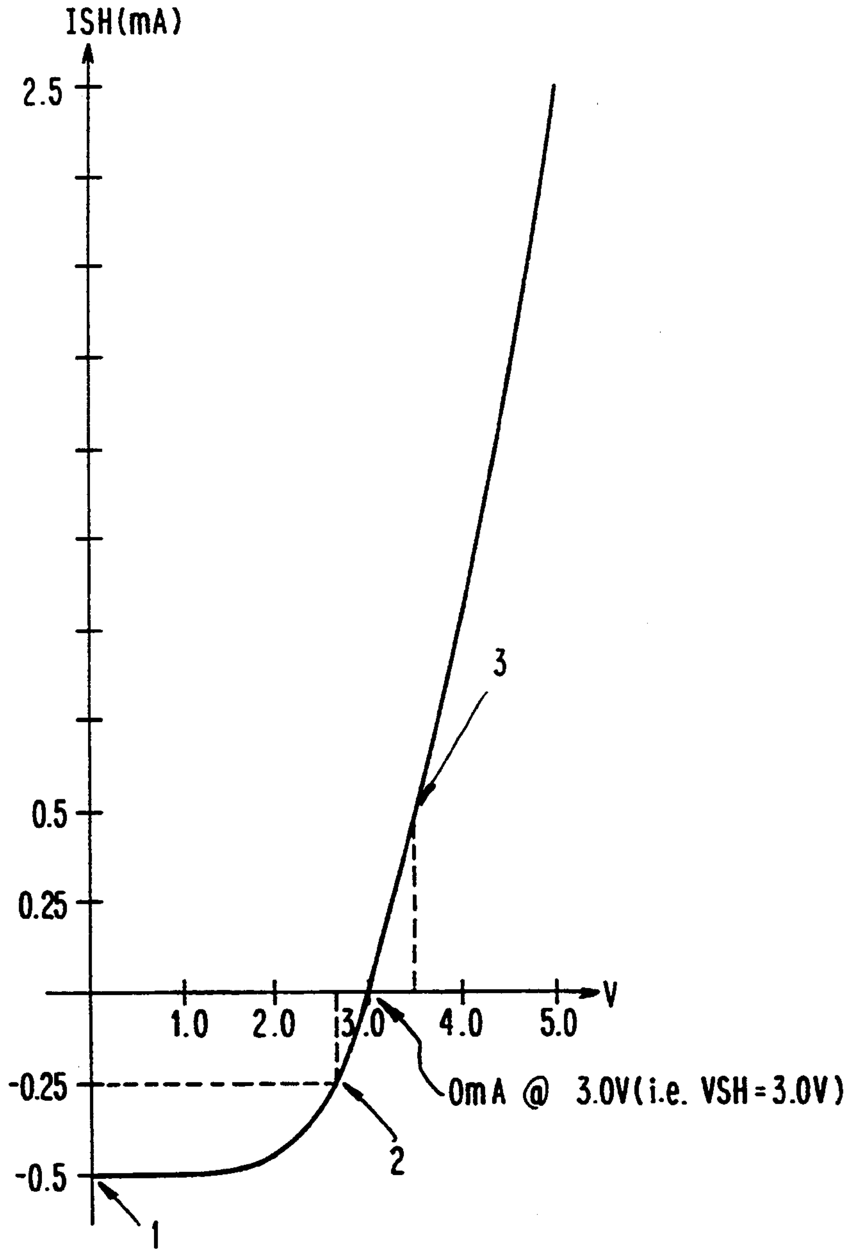
Figure 48D:
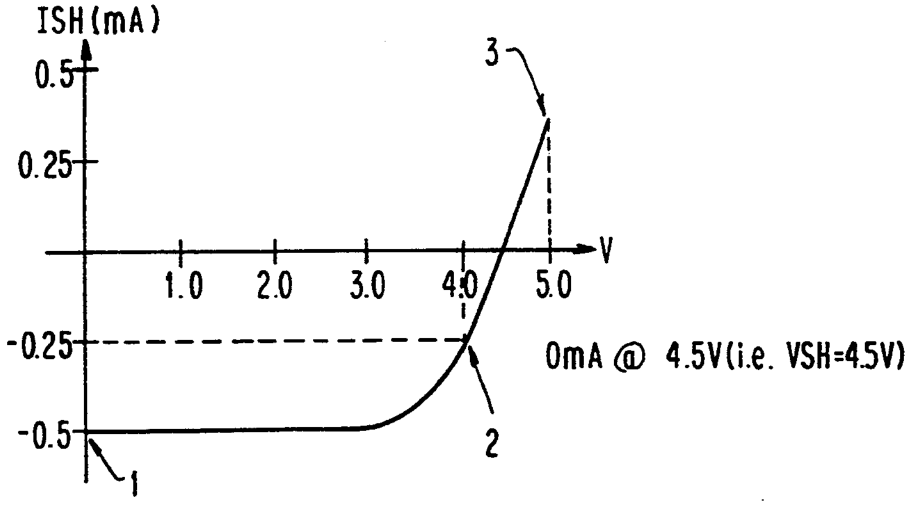
Figure 48E:
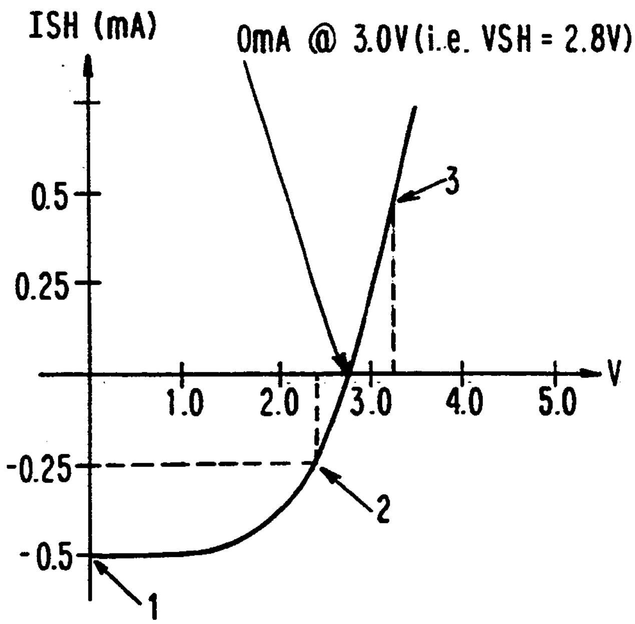

The high soft drivers of the CIC are capable of non-intrusive driving during sampling. The high soft driver, CIC sensing circuitry, and related CMC software have several features to support this capability. Referring to FIG. 48C, 48D, and 48E, which are representative soft-drive high I/V characteristic curves for driving TTL, NMOS, CMOS and LCMOS HME pins, these features will be described.

The high soft driver drives toward a programmable drive voltage, VSH. Preferably, the CMC software running on the CPU sets VSH to an appropriate logic high voltage depending upon the HME logic family.

As shown at Point 1 in FIG. 48C, the high soft driver is current limited. This current limit, ISH, is programmable on a pin-by-pin basis. Preferably, the CMC software running on the CPU constrains the high soft driver current limit such that it is less than the sink current of the HME pin in the driving low state. Thus, if the HME pin is in a driving low state, then the HME pin will overdrive the enabled CIC high soft driver to a logic low.

Preferably, the CMC software running on the CPU sets the high soft driver current limit, depending upon the VSH used, such that if the HME pin is in a non-driving state, then the CIC high soft driver will drive the HME pin to a logic high. For example, for TTL HME pins, the CMC software constrains the high soft driver current limit such that it is more than twice the input leakage current for the HME pin in the non-driving high state. Referring to Point 2 of FIG. 48C, with VSH set at 3.0 V, the high soft driver will drive a TTL HME pin which is in the non-driving state to 2.6 V, which is a valid logic high.

Preferably, the CMC software running on the CPU sets a reference voltage, VHTH, for comparison with the HME pin voltage, depending upon the VSH used and the high soft driver current limit used, so that if the HME pin is in a driving high state and the CIC high soft driver is enabled, then the HME pin voltage will be greater than VHTH. For example, for TTL HME pins, at Point 3 in FIG. 48C, the "reverse" current of the high soft driver is less than ISH, the source current of the HME pin is greater than ISH, and the I/V characteristic curve in this region is essentially linear. In this case, therefore, the CMC software sets VHTH to be closer to VSH than to the maximum HME drive voltage.

Table 15 shows the preferred settings for the programmable voltage levels used in driving and sampling HME pins of the above-indicated logic families.

TABLE 15

| FAMILY | VLTH | VSL | VLOGL | VLOGH | VSH | VHTH | HMEVCC |
|---|---|---|---|---|---|---|---|
| TTL | 0.35 V | 0.4 V | 0.8 V | 2.0 V | 2.9 V | 3.05 V | 5.0 V |
| NMOS | 0.25 | 0.4 | 0.8 | 2.0 | 2.9 | 3.2 | 5.0 |
| CMOS | 0.25 | 0.4 | 1.0 | 3.5 | 4.5 | 4.7 | 5.0 |
| LCMOS | 0.25 | 0.4 | 0.6 | 2.5 | 2.8 | 3.0 | 3.3 |

Similarly, Table 16 shows the preferred settings for programmable current levels used in driving and sampling the HME pins.

TABLE 16

| FAMILY | ISL | ISH |
|---|---|---|
| TTL | 2.0 mA | −0.5 mA |
| NMOS | 0.5 | −0.5 |
| CMOS | 0.5 | −0.5 |
| LCMOS | 0.5 | −0.5 |

Figure 49:
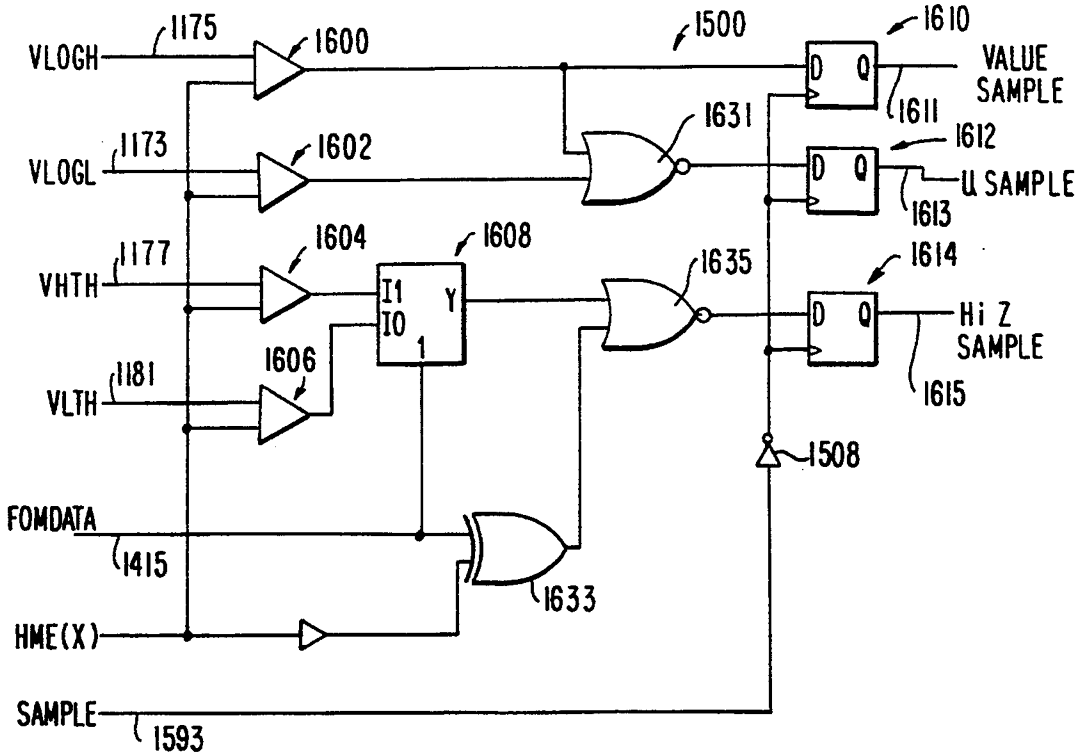
FIG. 49 is a schematic drawing of the 5-State Sampler of the sampling circuitry of FIG. 42.
Figure 50:
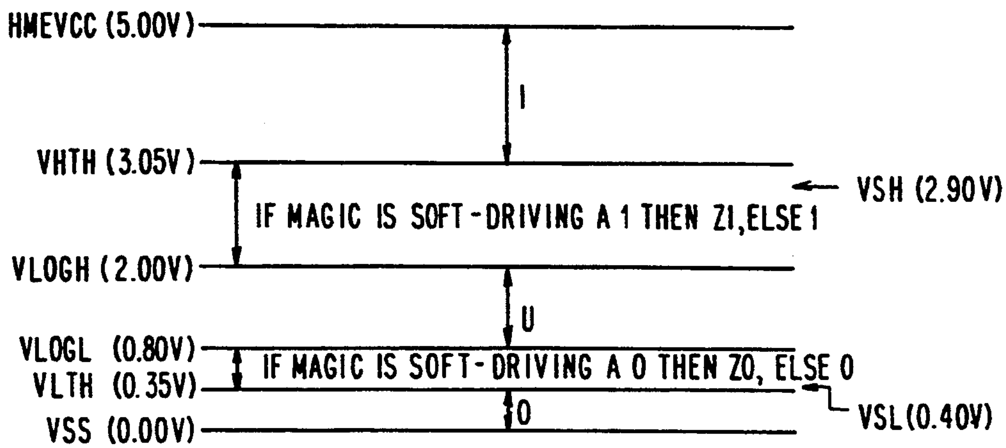
FIG. 50 shows a representation of the voltage ranges for the 5-state sampling of a TTL HME device.

The preferred embodiment of 5-state sampler 1500 is shown in FIG. 49. FIG. 50 also will be referred to in disclosing the 5-state sampler. The 5-state sampler includes analog voltage comparators 1600, 1602, 1604, and 1606. The comparators compare the voltage sensed at HME pins with the four reference voltages. These are VLOGH on line 1175, VLOGL on line 1173, VHTH on line 1177, and VLTH on line 1181. The outputs from the comparators are input to two NOR gates.

The inputs to NOR gate 1631 are the outputs of comparators 1600 and 1602. The inputs NOR gate 1635 is either the output of comparators 1604 or 1606, and the output of exclusive-OR gate 1633. The inputs to the exclusive-OR gate are the FOMDATA signal on line 1415 and the HME signal on line 1304.

Data selector 1608 selects whether the output of comparator 1604 or 1606 will be the input to NOR gate 1635. The FOMDATA signal is used to determine what is being soft driven to the HME pin.

The output of the comparators and the logic circuitry is latched by registers 1610, 1612, and 1614. The output of comparator 1600 is input to the data input of register 1610, the output of NOR gate 1631 is input to the data input of register 1613, and the output of NOR gate 1635 is input to the data input of register 1614. The three registers are clocked by the SAMPLE* signal which is the SAMPLE signal on line 1593 that has been inverted by inverter 1508. The SAMPLE signal may be asserted after a sufficient time delay to permit settling of the signal to occur. The output of registers 1610 is the VALUE SAMPLE signal on line 1611, the output of register 1612 is the U SAMPLE signal on line 1613, and the output of register 1614 in the HIZ SAMPLE signal on line 1615. This sampling operation may be performed on one or more pins while one or more different HME pins are being driven. Because each data channel includes its own sensing and driving circuitry, multiple pins of the HME are sensed simultaneously. The results of sampling are returned to the simulator.

There are three bits of sampled information output for the five state sampling circuitry. However, they provide five states of useful information: driving high ("H1"), non-driving high ("Z1"), driving low ("H0"), non-driving low ("Z0"), and unknown ("U"). An output of high or low (HIZ_SAMPLE deasserted), indicates that the HME pin is an output pin and that it is driving a logic high or logic low value. An output of Z1 or Z0, (HIZ SAMPLE asserted) indicates that the HME pin is in a non-driving state. An output of U, which is asserted as the U SAMPLE signal, indicates that the HME pin was sampled at an unknown level (between VLOGL and VLOGH).

FIG. 50 shows the relationship among the supply voltages, voltage references, and HME pin voltages shown in FIG. 49. The voltages shown on FIG. 49 are the preferred voltages for use in testing TTL logic circuits. The values of the reference voltages will differ depending upon the technology of the device being tested (e.g., TTL, ECL, CMOS, NMOS and LCMOS). These values may be selected through the software shell. The VSH and VSL voltages shown in FIG. 50 are the voltages at which the CIC soft drives a logic high and a logic low value, respectively.

Table 17 discloses how determination are made regarding the status of sampled HME pins:

TABLE 17

1. VHTH < HME pin voltage ≦ HMEVCC. The HME pin voltage is above both VSL and VSH, which are the target voltages of the soft drivers, therefore, the HME must be in the HI state. If the soft drivers are also driving a logic high value, the measured voltage is merely driven closer to HMEVCC.
2. VLOGH < HME pin voltage < VHTH. If the soft drivers are driving a logic high value, the HME pin is in the Z1 state (the HME is an input pin and the soft drivers are driving at VSH). If the soft drivers are TABLE 17-continued not driving, the HME is an output pin, and it is in the HI state. The logic circuitry of 5-state sampler 1500 determines whether or not the soft drivers are driving.

3. VLOGL < HME pin voltage < VLOGH. The HME pin voltage is between a valid logic low value and a valid logic high value, and therefore is classified as unknown. This state indicates that a problem exists.
4. VLTH < HME pin voltage < VLOGL. If the soft drivers are driving a logic low value, then the HME pin is in the ZO state (the HME is an input pin and the soft drivers are driving at VSL). If the soft drivers are not driving, the HME is an output pin, and it is in the HO state. The logic circuitry of 5-state sampler 1500 determines whether or not the soft drivers are driving.
5. HME pin voltage < VLTH. The HME pin voltage is below both VSL and VSH, so the HME is in the HO state.

This sampling method permits the HME pin to dominate whenever both the HME pin and the soft drivers are driving (i.e., when the HMS is trying to soft drive an I/O pin which is acting as an output). It also permits the user to know which of the high impedance zones (i.e., Z1 or Z0) the HME pin is in. For example, if the HME pin was an output pin driving a logic high value and then becomes a high impedance input, the CIC will soft drive low during the next calculation.

Referring again to FIG. 32, status/read control 1372 of data channel 1350 is a 16:1 multiplexer which used primarily for diagnostic purposes and for reading sampled results. The multiplexer receives as inputs the data described in the Table 18 and outputs data to the Pattern Bus. Control 1372 is read by first strobing the 4-bit address on the four pattern lines during CPU access mode and latching the address with the AS* signal. Then the RD* signal is asserted. The signals set forth in Table 18 provide the status of the individual data channels, with the exception of the parity status and RESET signals, which give the entire status of CIC 1300.

TABLE 18

| Address | Source | Source Description |
|---|---|---|
| 0 | FMT OUT | SR Data Formatted output. |
| 1 | MDOE | SR Medium-Drive output enable. |
| 2 | HDOE | SR Hard-Drive output enable. |
| 3 | CTL_OUT | Control Register CTL_OUT bit. |
| 4 | LCYC | Delayed version of SEQEND. |
| 5 | FORMATTER HMDEN* | Formatter hard/medium drive enable output from the Control Register. |
| 6 | FOMDATA | Formatter data output from the Control Register. |
| 7 | ERROR DATA | Last input pattern data before ERROR* is asserted. |
| 8 | SHORTED | Short sensor status |
| 9 | U SAMPLE | 5-state U sample |
| 10 | HIZ SAMPLE | 5-state Z sample |
| 11 | VALUE SAMPLE | 5-state 0/1 sample |
| 12 | TTL Timing Sample | 2-state timing measurement sample. |
| 13 | Unused | |
| 14 | Parity Status Register | PAT<0> contains the input PARITY bit. PAT<1> contains the output parity status. A value of 1 for this bit indicates a parity error. |
| 15 | RESET | Reading from this address causes the internal RESET to be asserted. Also, the value read is the CIC version number. |

TABLE 18-continued

Device Adapter Board

Figures 52D, 52E, 52F:
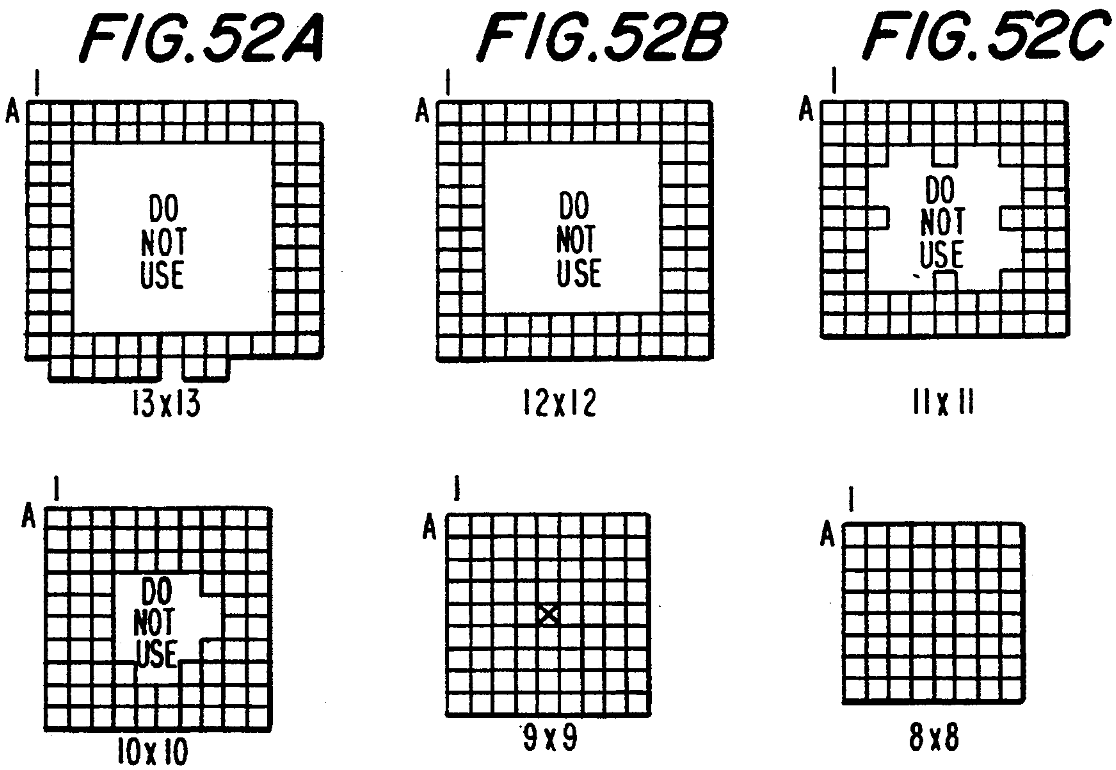

The primary function of DAB 268 is to fixture an HME to the PEL of an HMS. FIG. 52 shows a top view of a representative DAB. It is an 80 pin DAB. It is understood that the DAB may be a 160, 240, or 320-pin DAB, or be a DAB with more than 320 pins, and still be in the scope of the present invention.

Two main components of the DAB 268 shown in FIG. 52 are system connector 1702, which connects the DAB to the PEL of the HMS and, pad array 1704, referred to as the HME "footprint," to which an HME or an HME socket connects. The footprint is designed to permit a family of HMEs that have different pin-out configurations to be fixtured on the same pad array, without requiring any custom wiring on the DAB. DAB 268 also includes an array of power and ground pads, which may be connected directly to the pads that are intended to connect to HME power and ground pins.

System connector 1702 is used for communicating between the HME and the PEL. There may be one or more system connectors on a given DAB depending on the number of signal pins the DAB is intended to support.

The HME footprint preferably supports a class of HME package types having up to a predetermined number of device pins. The footprint pads preferably are laid out in a matrix with 0.1 inch centers. For example, the footprint for supporting a family of device packages with pin grid array ("PGA") pin-out configurations is a square matrix. The footprint for a family of device packages with dual-in line package ("DIP") pin-out configurations is a rectangular matrix with multiple parallel rows on 0.1 inch centers. Another example is the footprint for a family of device packages with plastic leaded chip carrier ("PLCC") pin-out configurations or quad-flat pack ("QFP") pin out configurations is a rectangular matrix also with multiplex parallel rows 0.1 inch centers. The footprint, therefore, may be configured in any manner which supports the direct connection of HMEs to the DAB. It is to be understood that custom DABs may be constructed for any special HME requirements, such as 50-mil PGA or high-density surface-mount devices.

Support for a class of HME package types is achieved by designing the HME footprint to be a superset of a specific class of HME package types. For illustration purposes only, the footprint of the 80-pin PGA DAB shown in FIG. 51 will be described.

The DAB matrix which supports the 80-pin PGA package has a total of 169 pads arranged in a square 13-by-13 matrix, on 0.1 inch centers in both dimensions. It is to be understood that the total number of signal pads of a given DAB footprint may exceed the number of signals available from the system connector. For example, the above-mentioned DAB footprint has 169 pads to which a maximum of 80 pins are connected. In connecting the footprint pads to the system connector pins, the 80 pins from the system connector are initially routed to one pad in the HME footprint. Each pin may then have one or more additional matrix pads connected to it. The pins that connect to more than one pad preferably are routed in a manner to take advantage of the concentric ringed nature of standard PGA packages. FIGS. 52A–52F illustrate the package pin-out configuration supported by the 80 pin PGA DAB footprint. If a device has a pin-out configuration that is a subset of any of the arrays that are shown in these figures, it can be supported by the DAB.

The impedances of the traces that connect the system connector pins to the HME footprint pads are controlled. Such impedances are selected to match the combined impedance of the PEL drivers and any series dampening resistors. Impedance matching decreases ringing and undershoot of the HME signal lines. Equalizing trace lengths to each of the pads permits very precise timing measurements to be made.

In a preferred embodiment, power supply, HMEVCC, pads and ground pads are distributed throughout the HME footprint for simplifying their connection to the HME footprint pads. These pads preferably are coded by shape: square pads for ground, as shown at 1708, and diamond pads for power, as shown at 1710. These shapes are easily distinguished from the round pads which are used for all other signals.

To accommodate mounting an HME to the DAB, vias are provided for every HME footprint pad. The vias are channels for the traces and allow the connection of the footprint pad to the system connector pins. Further, the HMEVCC and ground connections are on the front side of the DAB to allow the easy connection to the footprint pads.

In the preferred embodiment, DAB 268 includes circuitry to permit the DAB to be inserted or withdrawn from a powered HMS. This is referred to as a live insertion capability. Live insertion eliminates the need to power-down the HMS to insert or remove a DAB. This is particularly useful in systems supporting multiple users. The live insertion capability can be used with or without a specially designed HME footprint.

Live insertion is preferably accomplished in three phases: dissipation of electrostatic charge, equalization of signal ground potential, and gradual powering of the DAB power supplies. Each phase will now be discussed.

The system connector is designed such that its pins mate to the PEL connector at three different times. The first pin of the DAB system connector to mate with the female connector of the PEL connects to the PEL (and HMS) chassis ground. This dissipates any stored electrostatic charge on the DAB. The DAB system connector pin that makes the first contact is 0.5 inches longer than the normal connector pins.

The second pin of the DAB system connector to mate with the female connector of the PEL is associated with signal ground. When it mates it allows the equalization of the DAB and PEL signal grounds. If the signal grounds were not equalized before the main signal pins connect, it could result in a damaging voltage being sent to the PEL (and HMS). The DAB pin that makes this second contact is approximately 0.25 inches longer than the normal connector pins. After this mating, the main body of normal connector pins mate.

An important characteristic of the live insertion circuitry is the slow ramp-on of the power supplies. This substantially eliminates the large in-rush of current which might otherwise occur as the capacitors on the DAB and the HME charge when the power supplies are connected to the DAB. Unless the current in-rush were eliminated, it could cause damage to the HMS, HME, and DAB. This instantaneous in-rush of current could also cause voltage transients on PEL 266.

To accommodate a wide variety of circuits and support circuits that require voltages other than +5 V, the DAB is provided with three additional power supplies. These are the −12 V at 1712, −5.2 V at 1714, and the +12 V at 1716.

The DAB of the present invention also provides a means to regulate the HMEVCC voltage to accommodate HMEs with different supply voltages. This is effected by the circuit shown in FIG. 53. In the circuit, the +5 V supply voltage is connected to the input of voltage regulator 1773 and the terminal 1783 of switch 1779. The output of the voltage regulator is determined by the value of the resistor 1724 and 1725. Table 19 shows the relationship of the resistors and a number of output voltages.

TABLE 19

| VREG | RA value in ohms | RB value in ohms |
|---|---|---|
| 3.5 V | 100 | 180 |
| 3.3 V | 91 | 150 |
| 3.2 V | 43 | 68 |
| 3.0 V | 47 | 68 |
| 2.9 V | 91 | 120 |
| 2.8 V | 120 | 150 |
| 2.5 V | 91 | 91 |
| 2.4 V | 100 | 91 |
| 2.2 V | 120 | 91 |
| 2.0 V | 91 | 56 |
| 1.8 V | 75 | 33 |
| 1.5 V | 120 | 27 |

Figure 53:
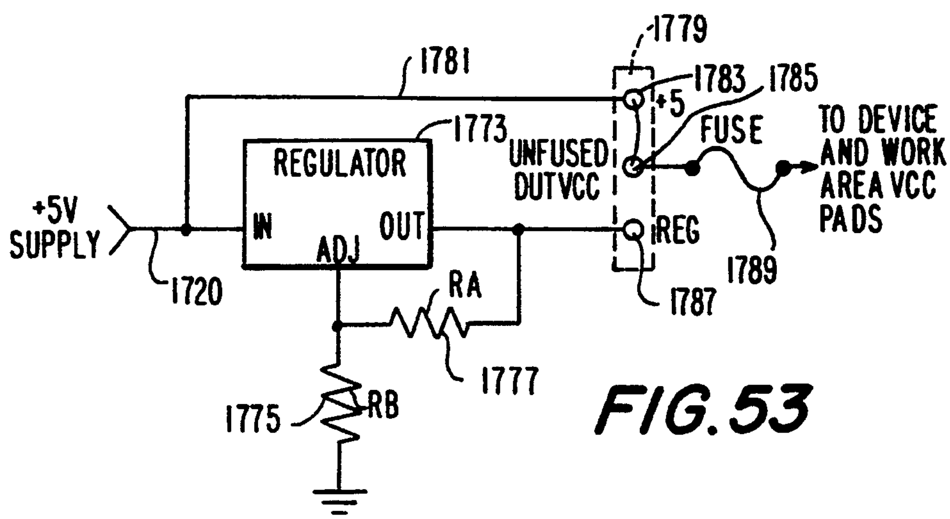
FIG. 53 is a schematic drawing of the circuit for generating variable HMEVCC voltages of the DAB of FIG. 51.

As shown in FIG. 53 either the regulated voltage at 1787 or the +5 V signal at 1783 may be selected for input to the HME after passing through fuse 1789.

It is desirable to connect all power supply pins of the system connector to the female connector of the PEL at the same time to prevent the need for power supply sequencing circuitry. However, when the DAB is being connected to the female connector of the PEL, pins near the edges can be connected and disconnected as the system connector is being rocked into position. If power supply pins are near the edges, it is possible for one power supply to be fully active and for another to be completely shut off as the connection is being made. To reduce the likelihood of this occurring, and, thereby, obviating the need for power sequencing, supply voltage pins are preferably placed near to the center of the system connector.

A public HME must be initializable to a consistent state before each evaluation. Certain HME circuits, for example, divide-by-N counters, cannot be initialized by assertion of a RESET signal. If the HME contains such a circuit, the HME may be initialized by repeatedly presenting a sequence of stimuli which causes the HME to advance to a particular internal state. One or more feedback pads such as FEEDBACK pad 1730 are provided on DAB 268 to allow the HME to transmit signals to the HMS regarding its internal state so it can be determined when the HME is initialized.

Figure 51:
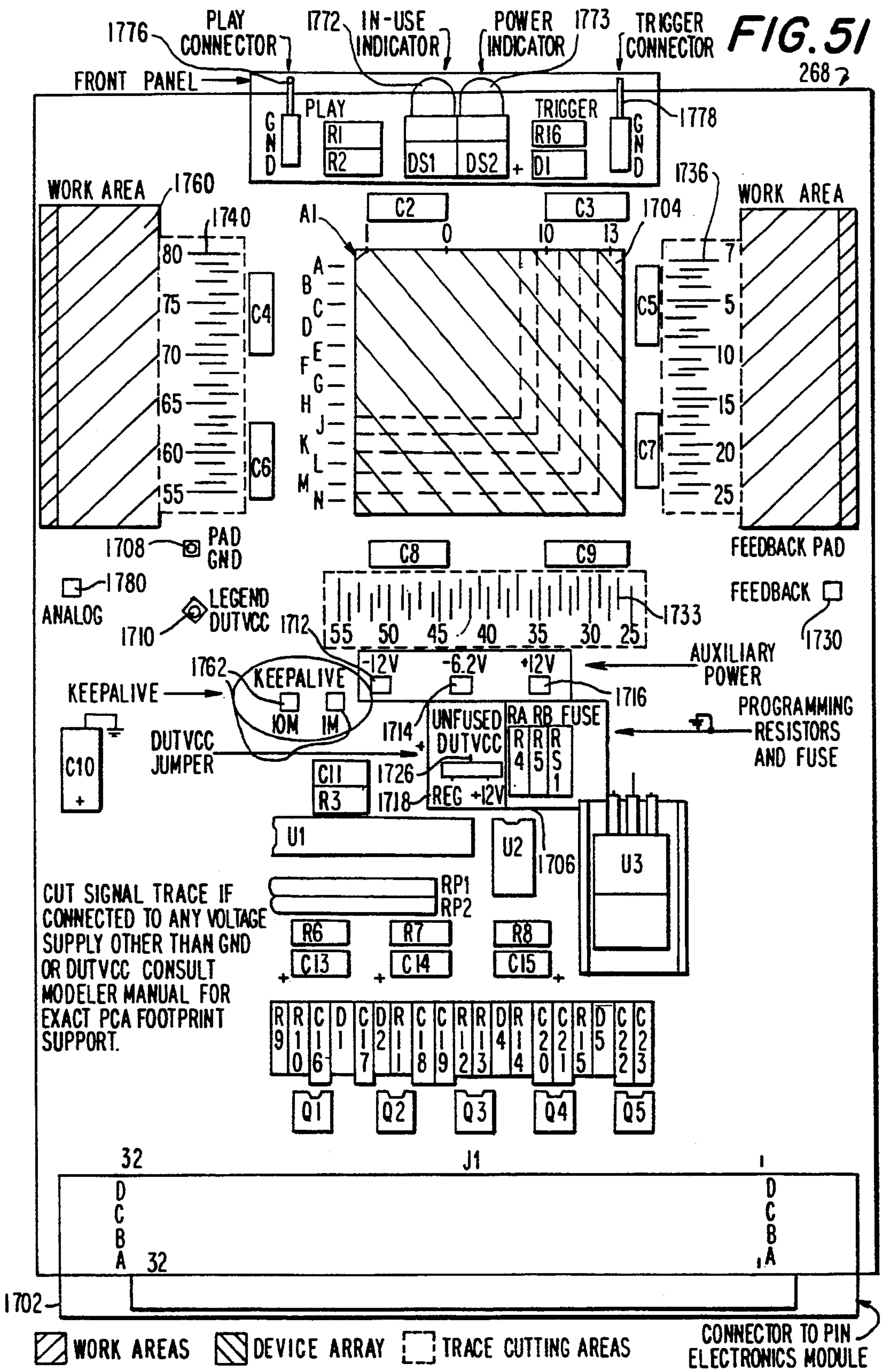
FIG. 51 is a top view of a representative DAB of the HMS of FIG. 1.

In a preferred embodiment of the invention, DAB 268 includes a configuration area. The configuration areas for the 80-pin DAB in FIG. 51 are shown at 1736, 1738, and 1740. Every trace from the system connector passes through one of the configuration areas. Each trace goes through a via from the system connector to one of the configuration areas, surfaces at the configuration area, and then through another via to a footprint pad. The vias and surface traces are arranged in an orderly pattern, and preferably are numbered.

Figure 54B:
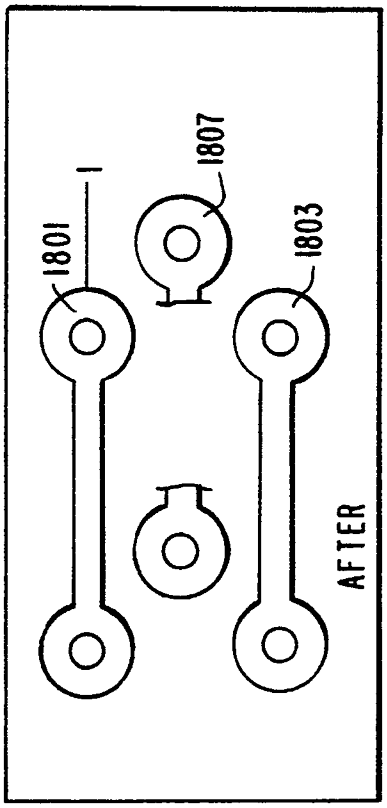
FIGS. 54A and 54B shows representative trace cuts in the configuration area of the DAB of FIG. 51.
Figure 54A:
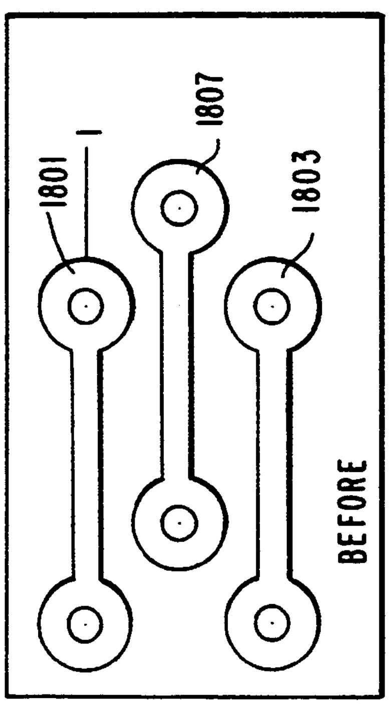

FIG. 54A shows three representation traces 1801, 1803, and 1807 in a configuration area. The traces may be cut in the configuration to increase the versatility of DAB 268 or the HME footprint. For example, the surface trace may be cut to permit the use of a power supply outside the range of the PEL output protection circuitry. That is, if the PEL is only designed to withstand continuous short circuits to HMEVCC or ground, the corresponding trace must be cut when the HME pin is connected to a voltage higher than HMEVCC. Surface traces may also be cut to connect a level translator (e.g., TTL-ECL or ECL-TTL) in series between the system connector and the HME footprint. FIG. 54B shows a representative trace 1807 that may have been cut for one of the above described purposes.

A DAB can only support an HME having a pin count which does not exceed the number of HME signal lines on the system connectors. This limit can be exceeded by cutting the trace to an HMEVCC, ground, or no-connect pin, in the configuration area, and connecting the system connector-side via of the cut trace to a previously unconnected HME signal pin.

DAB 268 preferably includes one or more work areas such as show at 1760. Work area 1760 include arrays of through-hole pads which are not connected to any signals or power supplies. Work area 1760 preferably is surrounded by alternating HMEVCC and ground pads for use in powering the circuitry disposed in the work area. The work area may be used to implement circuitry to support the HME. For example, special feedback logic for decoding a particular HME state into a single rising or falling edge may be mounted on a work area. Other circuits, such as level translators and analog support circuitry for the HME, including special HME clock drivers, indicators, and other HME support logic, may be mounted on the work area.

Many HMEs which specify a minimum operating clock frequency contain a substrate bias generator or other such circuitry in which operation is sustained by the presence of a clock. If the clock stops, or if the clock frequency becomes too low, such devices may require a very long time warm-up before use, or may even sustain permanent damage. To prevent this, keep alive circuitry preferably is provided on DAB 268 to ensure that the HME is clocked at all times. This circuitry preferably includes a register which is output enabled when ever the HME is not in use. This output is the register is connected to the HME clock pins. A range of clock frequencies may be provided to accommodate a predetermined range of HME operating frequencies.

The DAB has two indicators to provide visual indication of the states of the DAB. The first is LED 1770. This LED, when lit, indicates that HMEVCC is available on the DAB. This state is reached once the DAB is connected to the PEL and HMEVCC has ramped up. The second is LED 1772. This is the in-use LED. This LED turns-on when the first instance of the HME is created and goes off when the last instance of the device is released.

The DAB also has two test points that can be used for synchronizing, for example, the operation of external test equipment with that of the HME. The first test point is at 1776. This is used primarily by the software associated with the HME. Two representative events are marked by the changes in the state of the signal output from the first test point, viz., the beginning and end of the evaluation period. The second test point is a pulsed output that may be used to mark specific events during the period the HME is being evaluated. Either of the two test points may be connected, for example, to an external device for synchronizing its operation with the operation of the HME.

Analog sense connector 1780 is jumpered to the analog outputs of the HME. Monitoring of the analog output provides information regarding analog changes occurring in the HME during evaluation that would not be revealed if only the digital signal outputs were monitored.

Operation

Hardware modeling system 100 uses a five step method to evaluate a public HME. These five steps are: programming CIC 1300 and other hardware, resetting the HME to a known state, restoring the HME to the last measured state, stimulating the HME with a new stimulus pattern, and measuring the results of the stimulation.

The programming step preferably is accomplished by sending several patterns of programming data to PEL 266 in the initial patterns of the history sequence during the pattern presentation mode. According to the present invention, preferably 22 patterns of programming data are sent.

The resetting step is accomplished by clocking a RESET pattern sequence to the HME, if the HME is the type that will accept and act upon it. If the HME is not resettable in this manner, feedback looping is performed within the VRAM shift registers to bring the HME to a known state. The HME must be returned to a known state before the history sequence is presented, otherwise, there is no way to ensure that the subsequent restoring step will restore the HME to the last measured state.

During the restoring step, patterns are presented to the HME to restore it to its the last measured state. The entire sequence of patterns produced by the HMS from the time simulation began until just prior to the current event is presented to the HME. By completely replaying the pattern sequence before each new stimulation, the simulator may take whatever time is needed to perform analyses of the simulated external system. Without the restoring step, dynamic devices, which have minimum clock frequency specifications, would decay to unknown states between simulator accesses. The restoring step also permits the HME to be shared among more than one simulator and permits a single HME to represent a replicated device within the system being simulated. The restoring step brings the HME to a state from which timing measurements and other measurements may be performed. During the restoring step, patterns are sent to the CIC generally as one bit per pin to reduce the required pattern storage. Output pins of the HME are left floating during the restore step.

The single bit per pin of the pattern specifies a driving direction for the HME pin driver. Strict input pins of the HME are hard driven in the specified direction. I/O pins are driven using the CIC current-limited medium driver as follows: if the HME pin is driving, the CIC medium driver drives in the same direction as the HME pin, otherwise, the CIC medium driver drives in the direction that the simulated external network (connected to the HME pin in the simulated design) is driving. Strict output pins are effectively not driven during the restoring step.

During the stimulating and measuring steps, new stimulus is presented to the HME pins, and the outputs are sampled. In this process, the HMS waits a predetermined interval for the device outputs to settle, and then samples all outputs simultaneously. The changes are returned to the simulator. Scheduling delays are also returned with the changes. The delays can be obtained from the delay table specified in the shell software. This method allows the use of worst-case timing values or ranges from the device data sheet.

Figure 55:
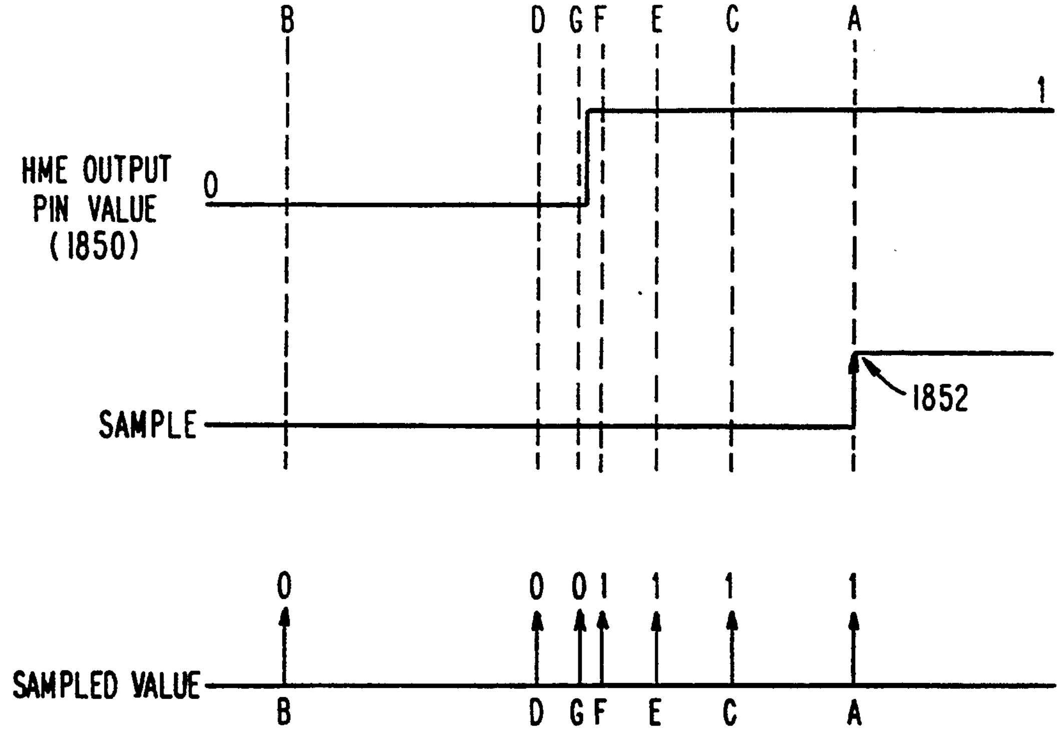
FIG. 55 shows a representation of the timing measurement process performed in accordance with the present invention.

The system of the present invention can perform its own timing delay measurements, such as determining the output delay of each HME output transition. This allows the HMS to create its own Timing file. The SAMPLE timing edge on line 1593 and register 1502 (FIG. 42) are used to perform the binary search shown in FIG. 55, until the output delay is determined. Binary searching consists of continually presenting the same pattern sequence to the HME, and placing the SAMPLE edge at different times during the measurement stage to determine when each HME output pin changes state. As shown, the rising SAMPLE edge at 1852 is placed at time A, and the HME pin value 1850 is sampled as a logic high value. The same pattern sequence is again presented to the HME, and SAMPLE edge 1852 is placed at time B. The output data is sampled as a logic low value. The measurement is continually iterated by repeating the pattern sequence, and continually cutting the interval (A to B) in half. If the sampled value is a logic low value, the next sampling time is increased. If the sampled value is a logic high value, the next sampling time is decreased. The final result of the process when the interval size reaches a small predetermined value is the transition of the signal.

An HME includes several types of pin connections, and each requires a special driving or sampling technique. According to the present invention power, ground, and "no-connect" pins are not driven. Dedicated input pins are driven by the hard drivers, which are turned on and remain on throughout all of the stages of a pattern presentation. Dedicated output pins are never driven with either the hard or medium drivers. During the restoring and stimulating steps of pattern presentation, the output pins are left floating. During the measurement step, the output pins are soft-driven to determine whether the output is driving high or driving low, or non-driving high or non-driving low or unknown. HME I/O pins operate as inputs sometimes and as outputs at other times. HME I/O pins are preferably medium-driven during the restoring and stimulating steps. I/O pins may also be driven by pulsing the hard drivers, preferably, using 15 ns pulses. After these hard driver pulses, the soft drivers may continue to drive in the same direction. Using pulsed hard drivers causes faster input voltage transitions than using medium drivers. This mode of use can be enabled by the HMS user for fastest pattern presentation rates.

HME input and I/O pins may be further classified into several pin types, relating to the pin function. These classifications include data pins, eval pins, store pins, edge_fall pins, edge_rise pins, and I/O store pins. A data pin is a pin which affects neither the output state nor the internal state of an HME. An eval pin is one which may affect the outputs of an HME, but does not affect the HME's internal state. A store pin may affect the output and/or the internal state of the HME. Edge_fall and edge_rise pins are store pins having only one edge which can cause internal state changes. The edge_fall and edge_rise pins affect the output and state of the HME only on the falling and rising edges, respectively. An I/O store pin is an I/O pin which is also a store pin. Patterns preferably are presented to this type of pin during the stimulating step using two bits per pin.

Figure 56:
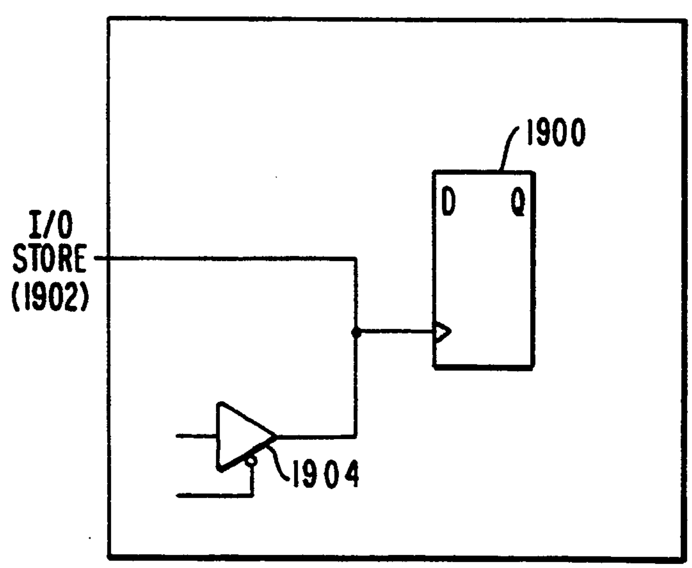
FIG. 56 is a schematic drawing of a representative circuit containing an I/O store pin.

During the stimulating step, patterns are sent to the HME according to the previously described method using one bit per pin, but patterns may be sent as two bits per pin if an I/O store pin is changing from input to output or output to input. FIG. 56 shows an example of an I/O store pin. The clock of register 1900 within the HME is connected to an I/O store pin 1902 and the output of an internal tri-state buffer 1904. During the stimulating step, it is not known whether pin 1902 or buffer 1904 is driving the clock input at register 1900.

Figure 57:
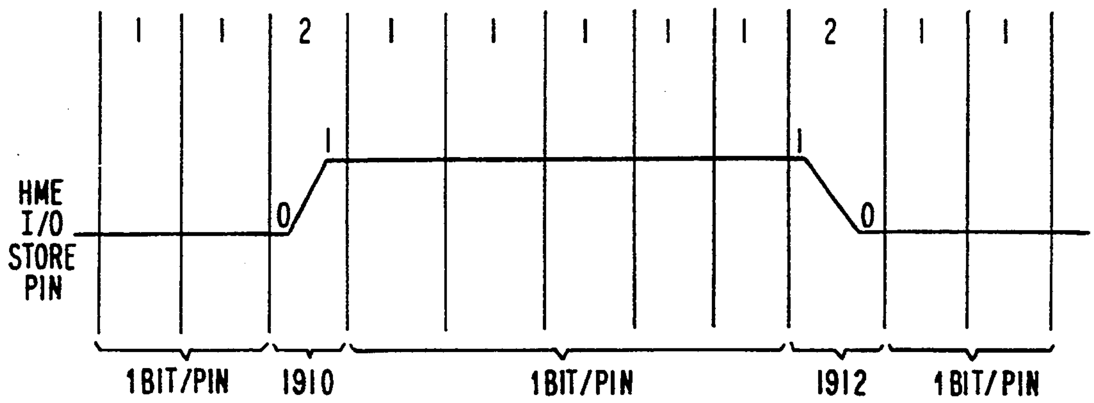
FIG. 57 shows a representative method of system operation using two bits per pin to sample an I/O store pin.

FIG. 57 shows patterns being presented to an I/O store pin. The patterns are sent to the pin as one bit per pin for all pattern cycles except cycles 1910 and 1912. During these two cycles, the HME pin direction was found to change (during a previous measurement step). During 1910, the HME I/O store pin transitions from non-driving low to driving high. During 1912, the HME I/O store pin transitions from driving high back to non-driving low. During each of these cycles, the appropriate pattern is sent using two bits per pin for every pin of the HME. The first bit is latched within the CIC channel and used as a control bit; it specifies whether the appropriate CIC medium driver will be enabled. The second bit is used for the data value. Thus, at 1910, the two bits for this particular HME I/O store pin would disable the CIC medium driver. The data value is irrelevant. At 1912, the two bits for this I/O store pin would re-enable the CIC medium driver and also begin to driving low.

Figure 58:
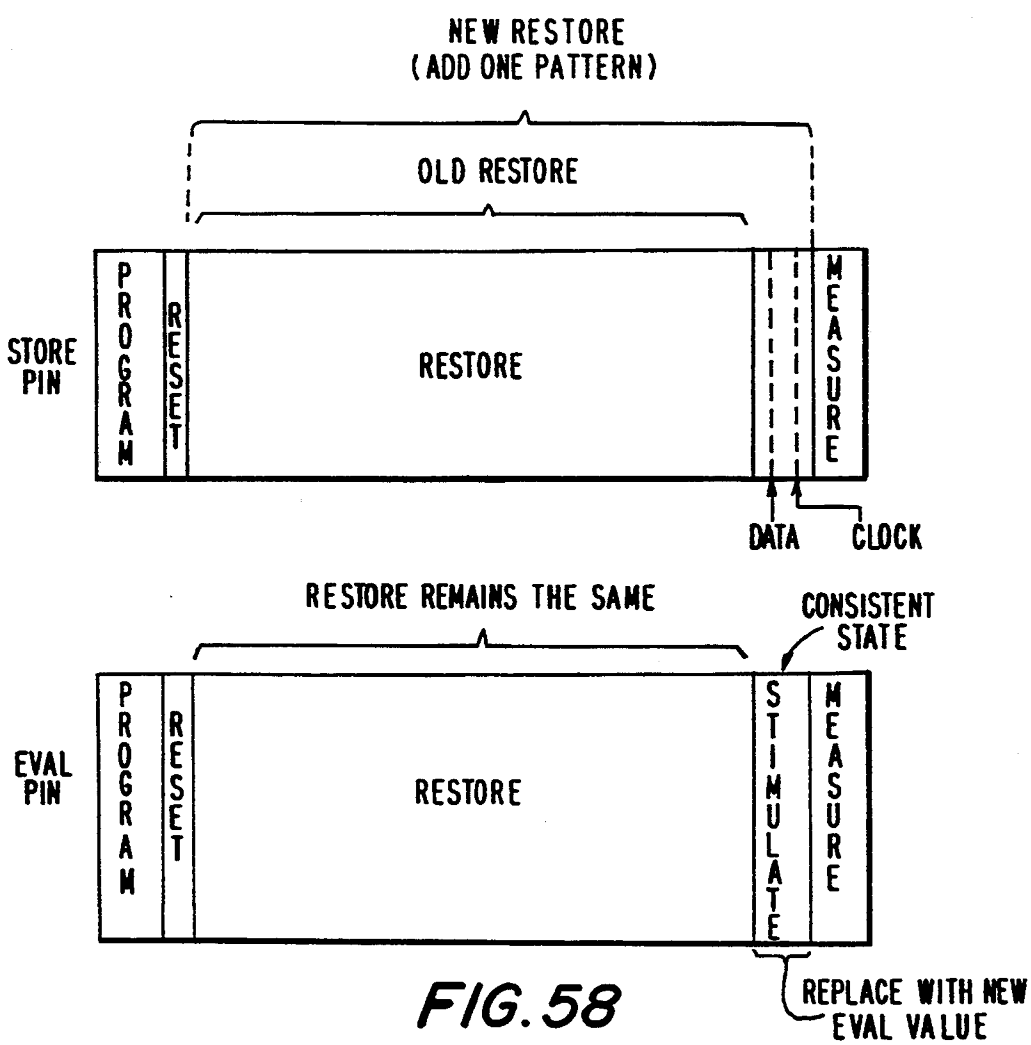
FIG. 58 is a diagram of the method for evaluating the store and eval pins of an HME.

For private HMEs, only a single stimulus pattern is presented to the HME during evaluation. However, as stated, a public HME is restored to its last known state by presenting a history sequence to the HME. To compress the history sequence, only certain measurements cause the sequence to grow. When a store pin, edge_fall pin, or edge_rise pin, transitions, the history sequence must grow to add one additional pattern as shown in FIG. 58. Because such transitions can change the internal state of the HME, the sequence must grow to ensure that the HME is properly restored by the sequence.

Data and eval pin transitions do not cause the sequence to grow. The current values of the data pins are queued on the host computer system until an eval or store pin changes. When measuring the effects of an eval or store pin transition, the pattern at the end of the history sequence is altered, and the HME is measured again, but the history sequence does not grown.

The following procedure is initiated by CPU 240 to begin a pattern presentation. CPU 240 programs the TG pattern clock frequency, and programs the edge and sampling times. The CPU then allocates the pattern memory in PAMs and sets up the pattern sequence to be played, including PEL control patterns and any device initialization sequence. Note that the pattern sequence may already be set up from a previous evaluation. CPU 240 then sends a start signal to TG 248 for the lanes in which the HME resides. Multiple lanes can be started simultaneously.

The above sequence of events results in the following: TG 248 starts PACs 258 in the selected lanes. PACs 258 sequence through the attached PAMs as programmed, delivering the history sequence patterns to the appropriate PELs. PELs 266 deliver the patterns to the pins of the selected HME via DAB 268. CICs on PELs 266 sample and latch the HME pin states. CPU 240 retrieves the sampled data from PELs 266 and returns it to simulator 164.

Having illustrated and described the principles of our invention with reference to one preferred embodiment, it should be apparent to those persons skilled in the art that such invention may be modified in arrangement and detail without departing from such principles.

The terms and expressions used herein are terms of expression and not of limitation, and there is no intention, in the use of such terms and expressions, of excluding any equivalents of the features shown and described, or portions thereof, it being recognized that various modifications are possible within the scope of the invention as claimed.

APPENDIXES I, II and III

APPENDIX I

Table of Contents

MC68020 . . . . . . . . . . . . . . . . . . . . . . . . Tab 1
PGA . . . . . . . . . . . . . . . . . . . . . . . . . . Tab 2
PGA160 . . . . . . . . . . . . . . . . . . . . . . . . Tab 3

Copyright 1989
Logic Modeling Systems

| FILE | DATE | PAGE # |
|---|---|---|
| MC68020A.MDL | 5/25/89 | 1/2 |
| | TIME 12:50:07 pm | |

LINE # TEXT

```
{*********************************************************************}
{*  Copyright (c) 1988-1989 by Logic Modeling Systems, Inc.          *}
{*  All rights reserved.                                             *}
{*********************************************************************}
{* Logic Model main MODEL file for Motorola MC68020                  *}
{* 32-Bit Microprocessor                                             *}
{*********************************************************************}
device_name     MC68020
{---------------------------------------------------------------------}
{ model_revision A,B }
{ shell_revision B }
{---------------------------------------------------------------------}
physical        'MC68020.DEV'
timing          'MC68020A.TMG'     { 12.5MHz }
package         'PGA.PKG'          { 114 }
adapter         'PGA160.ADP'
options         'MC68020.OPT'
names           'MC68020.NAM'
{---------------------------------------------------------------------}
```

Copyright 1989 Logic Modeling Systems

FILE MC68020.DEV

DATE 5/25/89 | TIME 12:50:07 pm | PAGE # 1/1

LINE # TEXT

```
{*****************************************************************}
{*  Copyright (c) 1988 by Logic Modeling Systems, Inc. All rights reserved.   *}
{*****************************************************************}
{* Logic Model DEVICE file for Motorola MC6802'                               *}
{* 32 Bit Microprocessor                                                      *}
{*****************************************************************}
{* Data obtained from M68000 Family Reference 1988                            *}
{-----------------------------------------------------------------}
{ model_revision A,B }
{ shell_revision B }
{-----------------------------------------------------------------}
technology        NMOS
{-----------------------------------------------------------------}
device_speed                8 MHz - 12.5 MHz       { MC68020RC12, MC68020RC16 }
device_setup_time           35                     { parameter 48, 12.5MHz }
device_hold_time            20                     { parameter 47B, 12.5MHz }
{-----------------------------------------------------------------}
in_pin
   CLK              =  C2 : store, keepalive       { clock - 10MHz keepalive }
    '-CDIS'         =  H1                          { cache disable }
    '-AVEC'         =  H2                          { autovector }
    '-BR'           =  B3                          { bus request }
    '-BGACK'        =  A1                          { bus grant acknowledge }
    '-BERR'         =  J2                          { bus error }
    '-IPL'[2:0]     = H12,J13,J12                  { interrupt priority level }
    '-DSACK'[1:0] =   J1,H3                        { data xfer/size acknowledge }
{-----------------------------------------------------------------}
out_pin
   A[31:0]        =  A3, B4, C5, A4, B5, A5, C6, B6, { address bus }
                      A6, A7, C7, B7, A8, B8, C8, C9,
                     B10,A11,B11,C10,A12,B12,C11,A13,
                     C12,B13,C13,D12,D13,E12, A2, C4
   SIZ[1:0]       =  G2,F1                         { transfer size }
   FC[2:0]        =  F2,F3,E1                      { function codes }
    '-RMC'        =  E2                            { read-modify-write cycle }
    '-AS'         =  L1                            { address strobe }
    '-DS'         =  M1                            { data strobe }
    'R/-W'        =  L2                            { read/write }
    '-DBEN'       =  G3                            { data buffer enable }
    '-IPEND'      = F13                            { interrupt pending }
    '-BG'         =  B2                            { bus grant }
    '-ECS'        =  G1                            { external cycle start }
    '-OCS'        = E13                            { operand cycle start }
{-----------------------------------------------------------------}
io_pin
   D[31:0]  =  N1, L3, M2, N2, L4, M3, N3, M4,     { data bus }
               L5, N4, M5, N5, L6, M6, N6, M7,
               L8, N9, M9,N10, L9,M10,N11,N12,
              L10,M11,M12,M13,L12,L13,K12,K13
   '-RESET' =  C1                                  { reset }
   '-HALT'  =  H2                                  { halt }
{-----------------------------------------------------------------}
power_pin
   VCC = A9,D3,M8,N8,N13,D1,D2,E3,G11,G13
{-----------------------------------------------------------------}
ground_pin
   GND = A10,B9,C3,F12,L7,L11,N7,K3,G12,H13,J3,K1,B1
{-----------------------------------------------------------------}
initialize
   CLK       = 520(1,0)
    '-RESET' = 520(0,0)
    '-HALT'  = 520(0,0)
{-----------------------------------------------------------------}
```

| Copyright 1989 Logic Modeling Systems | FILE MC68020A.TMG | DATE 5/25/89 | PAGE # 1/5 |
|---|---|---|---|
| | | TIME 12:50:07 pm | |

LINE # TEXT

```
{*****************************************************************}
{*  Copyright (c) 1988-1989 by Logic Modeling Systems, Inc.      *}
{*  All rights reserved.                                         *}
{*****************************************************************}
{* Logic Model TIMING file for Motorola M...020 (12.5MHz)        *}
{* 32 Bit Microprocessor                                         *}
{*****************************************************************}
{* Data from M68000 Family Reference 1988                        *}
{-----------------------------------------------------------------}
{ model_revision A,B }
{ shell_revision B }
{-----------------------------------------------------------------}
default_delay   min 3, max 30
{-----------------------------------------------------------------}
delay
    from high(CLK)
        to valid(A[31:0])           = 0, 40         { 6, 8 }
        to float(A[31:0])           = 0, 80         { 7 }
        to valid(FC[2:0])           = 0, 40         { 6, 8 }
        to float(FC[2:0])           = 0, 80         { 7 }
        to valid(SIZ[1:0])          = 0, 40         { 6, 8 }
        to float(SIZ[1:0])          = 0, 80         { 7 }
        to valid('-RMC')            = 0, 40         { 6, 8 }
        to float('-RMC')            = 0, 80         { 7 }
        to low('-ECS')              = 0, 30         { 6A }
        to low('-OCS')              = 0, 30         { 6A }
        to float(D[31:0])           = 0, 80         { 7 }
        to valid(D[31:0])           = 0, 40         { 23, 53 }
        to float('-AS')             = max 80        { 16 }
        to float('-DS')             = max 80        { 16 }
        to float('R/-W')            = max 80        { 16 }
        to high('R/-W')             = 0, 40         { 18 }
        to low('R/-W')              = 0, 40         { 20 }
        to float('-DBEN')           = max 80        { 16 }
        to low('-DBEN')             = 0, 40         { 40 }
        to high('-DBEN')            = 0, 40         { 43 }
    from low(CLK)
        to low('-AS')               = 3, 40         { 9 }
        to high('-AS')              = 0, 40         { 12 }
        to float('-AS')             = max 80        { UNSPEC }
        to low('-DS')               = 3, 40         { 9 }
        to high('-DS')              = 0, 40         { 12 }
        to float('-DS')             = max 80        { UNSPEC }
        to high('-ECS')             = 0, 40         { 12A }
        to high('-OCS')             = 0, 40         { 12A }
        to low('-BG')               = 0, 40         { 33 }
        to high('-BG')              = 0, 40         { 34 }
        to high('-DBEN')            = 0, 40         { 41 }
        to low('-DBEN')             = 0, 40         { 42 }
        to float('-DBEN')           = max 80        { UNSPEC }
        to valid(A[31:0])           = 0, 40         { UNSPEC }
        to float(A[31:0])           = max 80        { UNSPEC }
        to valid(FC[2:0])           = 0, 40         { UNSPEC }
        to float(FC[2:0])           = max 80        { UNSPEC }
        to valid(SIZ[1:0])          = 0, 40         { UNSPEC }
        to float(SIZ[1:0])          = max 80        { UNSPEC }
        to valid('R/-W')            = 0, 40         { UNSPEC }
        to float('R/-W')            = max 80        { UNSPEC }
        to valid('-RMC')            = 0, 40         { UNSPEC }
        to float('-RMC')            = max 80        { UNSPEC }
    from valid(CLK)
        to valid('-RESET')          = max 40        { UNSPEC }
        to valid('-HALT')           = max 40        { UNSPEC }
        to valid('-IPEND')          = max 40        { UNSPEC }
{-----------------------------------------------------------------}
```

Copyright 1989 Logic Modeling Systems

| FILE | DATE | PAGE # |
|---|---|---|
| MC68020.TST | 5/25/89 | 1/6 |
| | TIME 12:50:08 pm | |

LINE # TEXT

```
#test MC68020
#{ model_revision B }
#{ shell_revision B }
CLK                 1    I
-IPL2               2    I
-IPL1               3    I
-IPL0               4    I
-DSACK1             5    I
-DSACK0             6    I
-CDIS               7    I
-BR                 8    I
-BGACK              9    I
-BERR               10   I
-AVEC               11   I
D31                 12   IO
D30                 13   IO
D29                 14   IO
D28                 15   IO
D27                 16   IO
D26                 17   IO
D25                 18   IO
D24                 19   IO
D23                 20   IO
D22                 21   IO
D21                 22   IO
D20                 23   IO
D19                 24   IO
D18                 25   IO
D17                 26   IO
D16                 27   IO
D15                 28   IO
D14                 29   IO
D13                 30   IO
D12                 31   IO
D11                 32   IO
D10                 33   IO
D9                  34   IO
D8                  35   IO
D7                  36   IO
D6                  37   IO
D5                  38   IO
D4                  39   IO
D3                  40   IO
D2                  41   IO
D1                  42   IO
D0                  43   IO
-RESET              44   IO
-HALT               45   IO
SIZ1                46   O
SIZ0                47   O
R/-W                48   O
FC2                 49   O
FC1                 50   O
FC0                 51   O
A31                 52   O
A30                 53   O
A29                 54   O
A28                 55   O
A27                 56   O
A26                 57   O
A25                 58   O
A24                 59   O
A23                 60   O
A22                 61   O
A21                 62   O
A20                 63   O
A19                 64   O
A18                 65   O
A17                 66   O
A16                 67   O
A15                 68   O
A14                 69   O
A13                 70   O
A12                 71   O
A11                 72   O
A10                 73   O
A9                  74   O
A8                  75   O
A7                  76   O
A6                  77   O
A5                  78   O
A4                  79   O
A3                  80   O
A2                  81   O
A1                  82   O
A0                  83   O
-RMC                84   O
-OCS                85   O
-IPEND              86   O
-ECS                87   O
-DS                 88   O
-DBEN               89   O
-BG                 90   O
-AS                 91   O
#patterns  { IIIIIIIIIIIBBBBBBBBBBBBBBBBBBBBBBBBBBBBBBBBBBOOOOOOOOOOOOOOOOOOOOOOOOOOOOOOOOOOOOOOOOOOOOOO }
#          {  ----------                                ---                                      -------- }
#          { CIIIDDCBBBADDDDDDDDDDDDDDDDDDDDDDDDDDDDDDDDRHSSRFFFAAAAAAAAAAAAAAAAAAAAAAAAAAAAAAAAROIEDDBA }
#          { LPPPSSDRGEV33222222222211111111119876543210EAII/CCC33222222222211111111119876543210MCPCSBGS }
#          { KLLLAAI ARE1098765432109876543210          SLZZ-2101098765432109876543210          CSES E   }
#          {  210CCS CRC                                ET10W                                     N  N   }
#          {     KK  K                                  T                                         D      }
#          {     10                                                                                      }
#          {                                                                                             }
         0   UUUUUUUUUUUXXXXXXXXXXXXXXXXXXXXXXXXXXXXXXXXUUTTTTTTTTTTTTTTTTTTTTTTTTTTTTTTTTTTTTTTTHHHTTHT
         0   UUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
        25   DUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
        25   DUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
        26   DUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
        27   DUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
        75   UUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
        75   UUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
       125   DUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
       125   DUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
       175   UUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
       175   UUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
       225   DUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
       225   DUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
       275   UUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
       275   UUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
       325   DUUUUUUUUUUXXXXXXXXXXXXXXXXXXXXXXXXXXXXXXXXDDTTTTTTTTTTTTTTTTTTTTTTTTTTTTTTTTTTTTTTTHHHTTHT
```

Copyright 1989
Logic Modeling Systems

| FILE | DATE | TIME | PAGE # |
|---|---|---|---|
| MC68020.TST | 5/25/89 | 12:50:08 pm | 2/7 |

| LINE # | | TEXT |
|---|---|---|
| 121 | 325 | [illegible] |
| 122 | 375 | [illegible] |
| 123 | 375 | [illegible] |
| 124 | 425 | [illegible] |
| 125 | 425 | [illegible] |
| 126 | 475 | [illegible] |
| 127 | 475 | [illegible] |
| 128 | 525 | [illegible] |
| 129 | 525 | [illegible] |
| 130 | 575 | [illegible] |
| 131 | 575 | [illegible] |
| 132 | 600 | [illegible] |
| 133 | 625 | [illegible] |
| 134 | 625 | [illegible] |
| 135 | 675 | [illegible] |
| 136 | 675 | [illegible] |
| 137 | 725 | [illegible] |
| 138 | 725 | [illegible] |
| 139 | 775 | [illegible] |
| 140 | 775 | [illegible] |
| 141 | 825 | [illegible] |
| 142 | 825 | [illegible] |
| 143 | 875 | [illegible] |
| 144 | 875 | [illegible] |
| 145 | 925 | [illegible] |
| 146 | 925 | [illegible] |
| 147 | 975 | [illegible] |
| 148 | 975 | [illegible] |
| 149 | 1025 | [illegible] |
| 150 | 1025 | [illegible] |
| 151 | 1075 | [illegible] |
| 152 | 1075 | [illegible] |
| 153 | 1125 | [illegible] |
| 154 | 1125 | [illegible] |
| 155 | 1175 | [illegible] |
| 156 | 1175 | [illegible] |
| 157 | 1225 | [illegible] |
| 158 | 1225 | [illegible] |
| 159 | 1275 | [illegible] |
| 160 | 1275 | [illegible] |
| 161 | 1325 | [illegible] |
| 162 | 1325 | [illegible] |
| 163 | 1375 | [illegible] |
| 164 | 1375 | [illegible] |
| 165 | 1425 | [illegible] |
| 166 | 1425 | [illegible] |
| 167 | 1475 | [illegible] |
| 168 | 1475 | [illegible] |
| 169 | 1525 | [illegible] |
| 170 | 1525 | [illegible] |
| 171 | 1575 | [illegible] |
| 172 | 1575 | [illegible] |
| 173 | 1591 | [illegible] |
| 174 | 1600 | [illegible] |
| 175 | 1625 | [illegible] |
| 176 | 1625 | [illegible] |
| 177 | 1644 | [illegible] |
| 178 | 1675 | [illegible] |
| 179 | 1675 | [illegible] |
| 180 | 1725 | [illegible] |
| 181 | 1725 | [illegible] |
| 182 | 1775 | [illegible] |
| 183 | 1775 | [illegible] |
| 184 | 1792 | [illegible] |
| 185 | 1825 | [illegible] |
| 186 | 1825 | [illegible] |
| 187 | 1875 | [illegible] |
| 188 | 1875 | [illegible] |
| 189 | 1925 | [illegible] |
| 190 | 1925 | [illegible] |
| 191 | 1975 | [illegible] |
| 192 | 1975 | [illegible] |
| 193 | 1991 | [illegible] |
| 194 | 2025 | [illegible] |
| 195 | 2025 | [illegible] |
| 196 | 2075 | [illegible] |
| 197 | 2075 | [illegible] |
| 198 | 2125 | [illegible] |
| 199 | 2125 | [illegible] |
| 200 | 2175 | [illegible] |
| 201 | 2175 | [illegible] |
| 202 | 2192 | [illegible] |
| 203 | 2225 | [illegible] |
| 204 | 2225 | [illegible] |
| 205 | 2275 | [illegible] |
| 206 | 2275 | [illegible] |
| 207 | 2325 | [illegible] |
| 208 | 2325 | [illegible] |
| 209 | 2375 | [illegible] |
| 210 | 2375 | [illegible] |
| 211 | 2425 | [illegible] |
| 212 | 2425 | [illegible] |
| 213 | 2475 | [illegible] |
| 214 | 2475 | [illegible] |
| 215 | 2525 | [illegible] |
| 216 | 2525 | [illegible] |
| 217 | 2575 | [illegible] |
| 218 | 2575 | [illegible] |
| 219 | 2600 | [illegible] |
| 220 | 2625 | [illegible] |
| 221 | 2625 | [illegible] |
| 222 | 2675 | [illegible] |
| 223 | 2675 | [illegible] |
| 224 | 2691 | [illegible] |
| 225 | 2725 | [illegible] |
| 226 | 2725 | [illegible] |
| 227 | 2775 | [illegible] |
| 228 | 2775 | [illegible] |
| 229 | 2825 | [illegible] |
| 230 | 2825 | [illegible] |
| 231 | 2875 | [illegible] |
| 232 | 2875 | [illegible] |
| 233 | 2892 | [illegible] |
| 234 | 2900 | [illegible] |
| 235 | 2925 | [illegible] |
| 236 | 2925 | [illegible] |
| 237 | 2975 | [illegible] |
| 238 | 2975 | [illegible] |
| 239 | 3025 | [illegible] |
| 240 | 3025 | [illegible] |

Copyright 1989
Logic Modeling Systems

FILE PGA.PKG | DATE 5/25/89 | TIME 12:50:36 pm | PAGE # 1/1

LINE # TEXT

```
{*************************************************************************}
{*  Copyright (c) 1988 by Logic Modeling Systems, Inc. All rights reserved.  *}
{*************************************************************************}
{*  Logic Model PACKAGE map file for JEDEC standard PGA packages            *}
{*************************************************************************}
{ map_revision A }
{-------------------------------------------------------------------------}
package_mapping
          A1  =  A1
          A2  =  A2
          A3  =  A3
          A4  =  A4
          A5  =  A5
          A6  =  A6
          A7  =  A7
          A8  =  A8
          A9  =  A9
          A10 = A10
          A11 = A11
          A12 = A12
          A13 = A13
          A14 = A14
          A15 = A15
          A16 = A16
          A17 = A17
          A18 = A18
          A19 = A19
          A20 = A20
          B1  =  B1
          B2  =  B2
          B3  =  B3
          B4  =  B4
          B5  =  B5
          B6  =  B6
          B7  =  B7
          B8  =  B8
          B9  =  B9
          B10 = B10
          B11 = B11
          B12 = B12
          B13 = B13
          B14 = B14
          B15 = B15
          B16 = B16
          B17 = B17
          B18 = B18
          B19 = B19
          B20 = B20
          C1  =  C1
          C2  =  C2
          C3  =  C3
          C4  =  C4
          C5  =  C5
          C6  =  C6
          C7  =  C7
          C8  =  C8
          C9  =  C9
          C10 = C10
          C11 = C11
          C12 = C12
          C13 = C13
          C14 = C14
          C15 = C15
          C16 = C16
          C17 = C17
          C18 = C18
          C19 = C19
          C20 = C20
          D1  =  D1
          D2  =  D2
          D3  =  D3
          D4  =  D4
          D5  =  D5
          D6  =  D6
          D7  =  D7
          D8  =  D8
          D9  =  D9
          D10 = D10
          D11 = D11
          D12 = D12
          D13 = D13
          D14 = D14
          D15 = D15
          D16 = D16
          D17 = D17
          D18 = D18
          D19 = D19
          D20 = D20
          E1  =  E1
          E2  =  E2
          E3  =  E3
          E4  =  E4
          E5  =  E5
          E6  =  E6
          E7  =  E7
          E8  =  E8
          E9  =  E9
          E10 = E10
          E11 = E11
          E12 = E12
          E13 = E13
          E14 = E14
          E15 = E15
          E16 = E16
          E17 = E17
          E18 = E18
          E19 = E19
          E20 = E20
          F1  =  F1
          F2  =  F2
          F3  =  F3
          F4  =  F4
          F5  =  F5
          F6  =  F6
          F7  =  F7
          F8  =  F8
          F9  =  F9
          F10 = F10
          F11 = F11
          F12 = F12
```

Copyright 1989 Logic Modeling Systems

| FILE | DATE | TIME | PAGE # |
|---|---|---|---|
| PGA.PKG | 5/25/89 | 12:50:36 pm | 2/2 |

TEXT

```
F13 = F13
F14 = F14
F15 = F15
F16 = F16
F17 = F17
F18 = F18
F19 = F19
F20 = F20
G1 = G1
G2 = G2
G3 = G3
G4 = G4
G5 = G5
G6 = G6
G7 = G7
G8 = G8
G9 = G9
G10 = G10
G11 = G11
G12 = G12
G13 = G13
G14 = G14
G15 = G15
G16 = G16
G17 = G17
G18 = G18
G19 = G19
G20 = G20
H1 = H1
H2 = H2
H3 = H3
H4 = H4
H5 = H5
H6 = H6
H7 = H7
H8 = H8
H9 = H9
H10 = H10
H11 = H11
H12 = H12
H13 = H13
H14 = H14
H15 = H15
H16 = H16
H17 = H17
H18 = H18
H19 = H19
H20 = H20
J1 = J1
J2 = J2
J3 = J3
J4 = J4
J5 = J5
J6 = J6
J7 = J7
J8 = J8
J9 = J9
J10 = J10
J11 = J11
J12 = J12
J13 = J13
J14 = J14
J15 = J15
J16 = J16
J17 = J17
J18 = J18
J19 = J19
J20 = J20
K1 = K1
K2 = K2
K3 = K3
K4 = K4
K5 = K5
K6 = K6
K7 = K7
K8 = K8
K9 = K9
K10 = K10
K11 = K11
K12 = K12
K13 = K13
K14 = K14
K15 = K15
K16 = K16
K17 = K17
K18 = K18
K19 = K19
K20 = K20
L1 = L1
L2 = L2
L3 = L3
L4 = L4
L5 = L5
L6 = L6
L7 = L7
L8 = L8
L9 = L9
L10 = L10
L11 = L11
L12 = L12
L13 = L13
L14 = L14
L15 = L15
L16 = L16
L17 = L17
L18 = L18
L19 = L19
L20 = L20
M1 = M1
M2 = M2
M3 = M3
M4 = M4
M5 = M5
M6 = M6
M7 = M7
M8 = M8
M9 = M9
M10 = M10
M11 = M11
M12 = M12
```

Copyright 1989
Logic Modeling Systems

| FILE | DATE | TIME | PAGE # |
|---|---|---|---|
| PGA.PKG | 5/25/89 | 12:50:36 pm | 3/3 |

TEXT

```
M13 = M13
M14 = M14
M15 = M15
M16 = M16
M17 = M17
M18 = M18
M19 = M19
M20 = M20
N1 = N1
N2 = N2
N3 = N3
N4 = N4
N5 = N5
N6 = N6
N7 = N7
N8 = N8
N9 = N9
N10 = N10
N11 = N11
N12 = N12
N13 = N13
N14 = N14
N15 = N15
N16 = N16
N17 = N17
N18 = N18
N19 = N19
N20 = N20
P1 = P1
P2 = P2
P3 = P3
P4 = P4
P5 = P5
P6 = P6
P7 = P7
P8 = P8
P9 = P9
P10 = P10
P11 = P11
P12 = P12
P13 = P13
P14 = P14
P15 = P15
P16 = P16
P17 = P17
P18 = P18
P19 = P19
P20 = P20
R1 = R1
R2 = R2
R3 = R3
R4 = R4
R5 = R5
R6 = R6
R7 = R7
R8 = R8
R9 = R9
R10 = R10
R11 = R11
R12 = R12
R13 = R13
R14 = R14
R15 = R15
R16 = R16
R17 = R17
R18 = R18
R19 = R19
R20 = R20
T1 = T1
T2 = T2
T3 = T3
T4 = T4
T5 = T5
T6 = T6
T7 = T7
T8 = T8
T9 = T9
T10 = T10
T11 = T11
T12 = T12
T13 = T13
T14 = T14
T15 = T15
T16 = T16
T17 = T17
T18 = T18
T19 = T19
T20 = T20
U1 = U1
U2 = U2
U3 = U3
U4 = U4
U5 = U5
U6 = U6
U7 = U7
U8 = U8
U9 = U9
U10 = U10
U11 = U11
U12 = U12
U13 = U13
U14 = U14
U15 = U15
U16 = U16
U17 = U17
U18 = U18
U19 = U19
U20 = U20
V1 = V1
V2 = V2
V3 = V3
V4 = V4
V5 = V5
V6 = V6
V7 = V7
V8 = V8
V9 = V9
V10 = V10
V11 = V11
V12 = V12
```

Copyright 1989
Logic Modeling Systems

FILE PGA.PKG | DATE 5/25/89 | TIME 12:50:36 pm | PAGE # 4/4

LINE # TEXT

```
V13 = V13
V14 = V14
V15 = V15
V16 = V16
V17 = V17
V18 = V18
V19 = V19
V20 = V20
W1 = W1
W2 = W2
W3 = W3
W4 = W4
W5 = W5
W6 = W6
W7 = W7
W8 = W8
W9 = W9
W10 = W10
W11 = W11
W12 = W12
W13 = W13
W14 = W14
W15 = W15
W16 = W16
W17 = W17
W18 = W18
W19 = W19
W20 = W20
Y1 = Y1
Y2 = Y2
Y3 = Y3
Y4 = Y4
Y5 = Y5
Y6 = Y6
Y7 = Y7
Y8 = Y8
Y9 = Y9
Y10 = Y10
Y11 = Y11
Y12 = Y12
Y13 = Y13
Y14 = Y14
Y15 = Y15
Y16 = Y16
Y17 = Y17
Y18 = Y18
Y19 = Y19
Y20 = Y20
```

Copyright 1989 Logic Modeling Systems

| FILE | DATE | 5/25/89 | PAGE # |
|---|---|---|---|
| PGA160.ADP | TIME | 12:50:36 pm | 1/5 |

TEXT

```
{***************************************************************************}
{*  Copyright (c) 1988-1989 by Logic Modeling Systems, Inc.                *}
{*  All rights reserved.                                                   *}
{***************************************************************************}
{*  Logic Model ADAPTER m[illegible]le for 160 pin PGA adapter             *}
{***************************************************************************}
{ map_revision A }
{---------------------------------------------------------------------------}
adapter_mapping
         A1 = 108          : trace_delay = 1.3663 {, cut_label=1 }
         A2 =  95          : trace_delay = 1.1782 {, cut_label=160 }
         A3 = 110          : trace_delay = 1.3611 {, cut_label=3 }
         A4 =  92          : trace_delay = 1.3640 {, cut_label=5 }
         A5 =  89          : trace_delay = 1.0955 {, cut_label=8 }
         A6 =  86          : trace_delay = 1.0710 {, cut_label=12 }
         A7 =  83          : trace_delay = 1.3091 {, cut_label=17 }
         A8 =  80          : trace_delay = 1.0600 {, cut_label=18 }
         A9 =  79          : trace_delay = 1.3474 {, cut_label=20 }
        A10 =  77          : trace_delay = 1.0794 {, cut_label=23 }
        A11 =  48          : trace_delay = 1.3284 {, cut_label=26 }
        A12 =  72          : trace_delay = 1.1065 {, cut_label=29 }
        A13 =  71          : trace_delay = 1.2980 {, cut_label=34 }
        A14 =  53          : trace_delay = 1.1184 {, cut_label=31 }
        A15 =  54          : trace_delay = 1.2763 {, cut_label=40 }
        A16 =  55          : trace_delay = 1.0524 {, cut_label=39 }
{       A17 = no_connect }
         B1 = 107          : trace_delay = 1.3307 {, cut_label=157 }
         B2 = 106          : trace_delay = 1.1370 {, cut_label=158 }
         B3 = 109          : trace_delay = 1.1165 {, cut_label=4 }
         B4 =  93          : trace_delay = 1.0910 {, cut_label=6 }
         B5 =  91          : trace_delay = 1.3459 {, cut_label=9 }
         B6 =  87          : trace_delay = 1.3239 {, cut_label=13 }
         B7 =  84          : trace_delay = 1.0802 {, cut_label=14 }
         B8 =  81          : trace_delay = 1.3783 {, cut_label=15 }
         B9 =  78          : trace_delay = 1.0992 {, cut_label=19 }
        B10 =  75          : trace_delay = 1.3821 {, cut_label=22 }
        B11 =  49          : trace_delay = 1.1246 {, cut_label=25 }
        B12 =  50          : trace_delay = 1.3916 {, cut_label=28 }
        B13 =  70          : trace_delay = 1.1174 {, cut_label=33 }
        B14 =  69          : trace_delay = 1.2831 {, cut_label=36 }
        B15 =  66          : trace_delay = 1.0223 {, cut_label=37 }
        B16 =  67          : trace_delay = 1.2789 {, cut_label=38 }
{       B17 = no_connect }
         C1 = 105          : trace_delay = 1.1030 {, cut_label=154 }
         C2 = 104          : trace_delay = 1.3239 {, cut_label=155 }
         C3 =  94          : trace_delay = 1.4476 {, cut_label=159 }
         C4 = 111          : trace_delay = 1.2075 {, cut_label=2 }
         C5 =  90          : trace_delay = 1.0984 {, cut_label=10 }
         C6 =  88          : trace_delay = 1.4378 {, cut_label=7 }
         C7 =  85          : trace_delay = 1.4175 {, cut_label=11 }
         C8 =  82          : trace_delay = 1.1239 {, cut_label=16 }
         C9 =  76          : trace_delay = 1.3715 {, cut_label=24 }
        C10 =  74          : trace_delay = 1.1522 {, cut_label=21 }
        C11 =  73          : trace_delay = 1.3891 {, cut_label=30 }
        C12 =  51          : trace_delay = 1.1629 {, cut_label=27 }
        C13 =  52          : trace_delay = 1.3789 {, cut_label=32 }
        C14 =  68          : trace_delay = 1.1277 {, cut_label=35 }
        C15 =  64          : trace_delay = 1.0609 {, cut_label=43 }
        C16 =  65          : trace_delay = 1.2357 {, cut_label=44 }
        C17 =  59          : trace_delay = 1.0433 {, cut_label=45 }
         D1 = 103          : trace_delay = 1.1312 {, cut_label=156 }
         D2 = 102          : trace_delay = 1.3293 {, cut_label=151 }
         D3 = 100          : trace_delay = 1.0855 {, cut_label=152 }
         D4 = 101          : trace_delay = 1.2914 {, cut_label=153 }
         D5 =  55          : trace_delay = 1.2768 {, cut_label=39, W3 }
         D6 =  54          : trace_delay = 1.4407 {, cut_label=40 }
         D7 =  66          : trace_delay = 1.2242 {, cut_label=37, W2 }
         D8 =  67          : trace_delay = 1.4445 {, cut_label=38 }
         D9 =  64          : trace_delay = 1.2678 {, cut_label=43, W1 }
        D10 =  57          : trace_delay = 1.2023 {, cut_label=41 }
        D11 =  65          : trace_delay = 1.3465 {, cut_label=44 }
        D12 =  56          : trace_delay = 1.3540 {, cut_label=42 }
        D13 =  59          : trace_delay = 1.1683 {, cut_label=45, W4 }
        D14 =  58          : trace_delay = 1.2728 {, cut_label=46, W5 }
        D15 =  57          : trace_delay = 1.1146 {, cut_label=41 }
        D16 =  56          : trace_delay = 1.2890 {, cut_label=42 }
        D17 =  58          : trace_delay = 1.1655 {, cut_label=46 }
         E1 = 113          : trace_delay = 1.0541 {, cut_label=150 }
         E2 = 112          : trace_delay = 1.2679 {, cut_label=149 }
         E3 =  98          : trace_delay = 1.2570 {, cut_label=147 }
         E4 = 148          : trace_delay = 1.1905 {, cut_label=121, W18 }
         E5 =  53          : trace_delay = 1.2736 {, cut_label=31 }
         E6 =  69          : trace_delay = 1.4195 {, cut_label=36 }
         E7 =  68          : trace_delay = 1.2448 {, cut_label=35 }
         E8 =  58          : trace_delay = 1.3681 {, cut_label=46, W5 }
         E9 =  46          : trace_delay = 1.0855 {, cut_label=51 }
        E10 =  62          : trace_delay = 1.1798 {, cut_label=47, W6 }
        E11 =  61          : trace_delay = 1.3227 {, cut_label=48 }
        E12 =  63          : trace_delay = 1.0353 {, cut_label=53 }
        E13 =  60          : trace_delay = 1.0823 {, cut_label=49 }
        E14 =  62          : trace_delay = 1.1171 {, cut_label=47, W6 }
        E15 =  61          : trace_delay = 1.2543 {, cut_label=48 }
        E16 =  60          : trace_delay = 1.0229 {, cut_label=49 }
        E17 =  62          : trace_delay = 1.0157 {, cut_label=47 }
         F1 =  99          : trace_delay = 1.0395 {, cut_label=146 }
         F2 =  97          : trace_delay = 1.0946 {, cut_label=142 }
         F3 = 114          : trace_delay = 1.0765 {, cut_label=148 }
         F4 = 158          : trace_delay = 1.3379 {, cut_label=122 }
         F5 = 159          : trace_delay = 1.4392 {, cut_label=123 }
         F6 =  45          : trace_delay = 1.4630 {, cut_label=50 }
         F7 =   4          : trace_delay = 1.3005 {, cut_label=70 }
         F8 =  11          : trace_delay = 1.3623 {, cut_label=64 }
         F9 =  40          : trace_delay = 1.3152 {, cut_label=58 }
        F10 =  43          : trace_delay = 1.3254 {, cut_label=54 }
        F11 =  44          : trace_delay = 1.0445 {, cut_label=55 }
        F12 =  47          : trace_delay = 1.2466 {, cut_label=52 }
        F13 =  45          : trace_delay = 1.3248 {, cut_label=50 }
        F14 =  46          : trace_delay = 1.0037 {, cut_label=51 }
        F15 =  47          : trace_delay = 1.1836 {, cut_label=52 }
        F16 =  63          : trace_delay = 0.9594 {, cut_label=53 }
        F17 =  46          : trace_delay = 0.9541 {, cut_label=51 }
         G1 = 115          : trace_delay = 1.0185 {, cut_label=144 }
         G2 =  96          : trace_delay = 1.2366 {, cut_label=143 }
         G3 = 117          : trace_delay = 1.2401 {, cut_label=141 }
         G4 = 147          : trace_delay = 1.1373 {, cut_label=119, W19 }
         G5 = 146          : trace_delay = 1.3441 {, cut_label=120 }
         G6 = 124          : trace_delay = 1.3129 {, cut_label=102 }
         G7 =  27          : trace_delay = 1.1173 {, cut_label=78 }
         G8 =   0          : trace_delay = 1.2701 {, cut_label=74 }
         G9 =  10          : trace_delay = 1.2299 {, cut_label=65 }
```

Copyright 1989 Logic Modeling Systems

FILE PGA160.ADP

DATE 5/25/89

TIME 12:50:36 pm

PAGE # 2/6

TEXT

```
G10 =  31   : trace_delay = 1.2314 {, cut_label=61 }
G11 =  30   : trace_delay = 1.3637 {, cut_label=60 }
G12 =  41   : trace_delay = 1.2358 {, cut_label=57, N7 }
G13 =  42   : trace_delay = 1.2017 {, cut_label=56 }
G14 =  43   : trace_delay = 1.2365 {, cut_label=54 }
G15 =  44   : trace_delay = 0.9797 {, cut_label=55 }
G16 =  45   : trace_delay = 1.2768 {, cut_label=50 }
G17 =  43   : trace_delay = 1.1770 {, cut_label=54 }
 H1 = 116   : trace_delay = 1.2099 {, cut_label=145 }
 H2 = 119   : trace_delay = 1.2284 {, cut_label=139 }
 H3 = 118   : trace_delay = 1.0844 {, cut_label=140 }
 H4 = 135   : trace_delay = 1.2625 {, cut_label=118 }
 H5 = 134   : trace_delay = 1.0432 {, cut_label=117 }
 H6 = 122   : trace_delay = 1.1301 {, cut_label=101 }
 H7 =  19   : trace_delay = 1.2035 {, cut_label=88 }
 H8 =  23   : trace_delay = 1.1200 {, cut_label=82 }
 H9 =   5   : trace_delay = 1.4600 {, cut_label=71 }
H10 =   8   : trace_delay = 1.4349 {, cut_label=67 }
H11 =  12   : trace_delay = 1.3966 {, cut_label=62 }
H12 =  13   : trace_delay = 1.1104 {, cut_label=63 }
H13 =  29   : trace_delay = 1.1461 {, cut_label=59 }
H14 =  40   : trace_delay = 1.2310 {, cut_label=58 }
H15 =  41   : trace_delay = 1.0217 {, cut_label=57 }
H16 =  42   : trace_delay = 1.1508 {, cut_label=56 }
H17 =  40   : trace_delay = 1.1680 {, cut_label=58 }
 J1 = 149   : trace_delay = 1.0438 {, cut_label=138 }
 J2 = 151   : trace_delay = 1.2065 {, cut_label=137 }
 J3 = 150   : trace_delay = 1.0527 {, cut_label=136 }
 J4 = 137   : trace_delay = 1.4432 {, cut_label=116, N17 }
 J5 = 145   : trace_delay = 1.0707 {, cut_label=113, N15 }
 J6 = 143   : trace_delay = 1.2896 {, cut_label=104 }
 J7 =  37   : trace_delay = 1.4443 {, cut_label=97 }
 J8 =  18   : trace_delay = 1.3952 {, cut_label=91 }
 J9 =  22   : trace_delay = 1.4829 {, cut_label=85, N11 }
J10 =   2   : trace_delay = 1.3476 {, cut_label=72, N9 }
J11 =   6   : trace_delay = 1.2071 {, cut_label=68 }
J12 =   9   : trace_delay = 1.2998 {, cut_label=66, N8 }
J13 =  11   : trace_delay = 1.2718 {, cut_label=64 }
J14 =  31   : trace_delay = 1.1453 {, cut_label=61 }
J15 =  30   : trace_delay = 1.2747 {, cut_label=60 }
J16 =  29   : trace_delay = 1.0982 {, cut_label=59 }
J17 =  31   : trace_delay = 1.0859 {, cut_label=61 }
 K1 = 132   : trace_delay = 1.2620 {, cut_label=135 }
 K2 = 133   : trace_delay = 1.0777 {, cut_label=134 }
 K3 = 153   : trace_delay = 1.2369 {, cut_label=133 }
 K4 = 139   : trace_delay = 1.2711 {, cut_label=112 }
 K5 = 142   : trace_delay = 1.3450 {, cut_label=110, N14 }
 K6 = 125   : trace_delay = 1.0725 {, cut_label=107 }
 K7 = 120   : trace_delay = 1.1257 {, cut_label=99 }
 K8 =  16   : trace_delay = 1.1620 {, cut_label=92 }
 K9 =  32   : trace_delay = 1.1621 {, cut_label=86 }
K10 =  26   : trace_delay = 1.2063 {, cut_label=81, N10 }
K11 =  15   : trace_delay = 1.1050 {, cut_label=76 }
K12 =   3   : trace_delay = 1.3860 {, cut_label=73 }
K13 =   7   : trace_delay = 1.3416 {, cut_label=69 }
K14 =  10   : trace_delay = 1.1052 {, cut_label=65 }
K15 =  12   : trace_delay = 1.3015 {, cut_label=62 }
K16 =  13   : trace_delay = 1.0398 {, cut_label=63 }
K17 =  10   : trace_delay = 1.0422 {, cut_label=65 }
 L1 = 152   : trace_delay = 1.0898 {, cut_label=132 }
 L2 = 130   : trace_delay = 1.2495 {, cut_label=131 }
 L3 = 131   : trace_delay = 1.0785 {, cut_label=130 }
 L4 = 136   : trace_delay = 1.0632 {, cut_label=115 }
 L5 = 141   : trace_delay = 1.0475 {, cut_label=109 }
 L6 = 123   : trace_delay = 1.0793 {, cut_label=103 }
 L7 =  38   : trace_delay = 1.1975 {, cut_label=96 }
 L8 =  35   : trace_delay = 1.4054 {, cut_label=95 }
 L9 =  33   : trace_delay = 1.3370 {, cut_label=89 }
L10 =  25   : trace_delay = 1.0873 {, cut_label=80 }
L11 =  28   : trace_delay = 1.2647 {, cut_label=79 }
L12 =   1   : trace_delay = 1.3942 {, cut_label=75 }
L13 =   4   : trace_delay = 1.1827 {, cut_label=70 }
L14 =   8   : trace_delay = 1.3547 {, cut_label=67 }
L15 =   9   : trace_delay = 1.1110 {, cut_label=66 }
L16 =  11   : trace_delay = 1.2179 {, cut_label=64 }
L17 =   8   : trace_delay = 1.2953 {, cut_label=67 }
 M1 = 128   : trace_delay = 1.1914 {, cut_label=129 }
 M2 = 129   : trace_delay = 1.0395 {, cut_label=128 }
 M3 = 156   : trace_delay = 1.2802 {, cut_label=127 }
 M4 = 138   : trace_delay = 0.9886 {, cut_label=111 }
 M5 = 127   : trace_delay = 1.0316 {, cut_label=105 }
 M6 = 126   : trace_delay = 1.2711 {, cut_label=106 }
 M7 = 121   : trace_delay = 1.3101 {, cut_label=100, N13 }
 M8 =  36   : trace_delay = 1.0730 {, cut_label=94 }
 M9 =  34   : trace_delay = 1.0914 {, cut_label=90 }
M10 =  20   : trace_delay = 1.2434 {, cut_label=84, N12 }
M11 =  24   : trace_delay = 1.3075 {, cut_label=83 }
M12 =  14   : trace_delay = 1.2795 {, cut_label=77 }
M13 =   0   : trace_delay = 1.1663 {, cut_label=74 }
M14 =   5   : trace_delay = 1.3664 {, cut_label=71 }
M15 =   6   : trace_delay = 1.1270 {, cut_label=68 }
M16 =   7   : trace_delay = 1.2877 {, cut_label=69 }
M17 =   5   : trace_delay = 1.3168 {, cut_label=71 }
 N1 = 157   : trace_delay = 1.0902 {, cut_label=126 }
 N2 = 155   : trace_delay = 1.3015 {, cut_label=125 }
 N3 = 154   : trace_delay = 1.1742 {, cut_label=124 }
 N4 = 144   : trace_delay = 1.2432 {, cut_label=114, N16 }
 N5 = 140   : trace_delay = 1.1839 {, cut_label=108 }
 N6 = 124   : trace_delay = 1.2124 {, cut_label=102 }
 N7 = 122   : trace_delay = 1.0481 {, cut_label=101 }
 N8 =  39   : trace_delay = 1.3787 {, cut_label=98 }
 N9 =  17   : trace_delay = 1.3669 {, cut_label=93 }
N10 =  19   : trace_delay = 1.0861 {, cut_label=88 }
N11 =  21   : trace_delay = 1.2765 {, cut_label=87 }
N12 =  27   : trace_delay = 1.0035 {, cut_label=78 }
N13 =  23   : trace_delay = 1.0163 {, cut_label=82 }
N14 =   2   : trace_delay = 1.2413 {, cut_label=72, N9 }
N15 =   3   : trace_delay = 1.3049 {, cut_label=73 }
N16 =   4   : trace_delay = 1.1288 {, cut_label=70 }
N17 =   2   : trace_delay = 1.1403 {, cut_label=72 }
 P1 = 159   : trace_delay = 1.2588 {, cut_label=123 }
 P2 = 146   : trace_delay = 1.1932 {, cut_label=120 }
 P3 = 134   : trace_delay = 0.9133 {, cut_label=117 }
 P4 = 145   : trace_delay = 0.9906 {, cut_label=113, N15 }
 P5 = 142   : trace_delay = 1.2633 {, cut_label=110, N14 }
 P6 = 125   : trace_delay = 1.0088 {, cut_label=107 }
 P7 = 143   : trace_delay = 1.1822 {, cut_label=104 }
 P8 = 120   : trace_delay = 1.0426 {, cut_label=99 }
 P9 =  37   : trace_delay = 1.3590 {, cut_label=97 }
P10 =  16   : trace_delay = 1.0896 {, cut_label=92 }
```

Copyright 1989 Logic Modeling Systems

| FILE | DATE | 5/25/89 | PAGE # |
|---|---|---|---|
| PGA160.ADP | TIME | 12:50:36 pm | 3/7 |

LINE # TEXT

```
          P11 =  18     : trace_delay = 1.3074 {, cut_label=91 }
          P12 =  32     : trace_delay = 1.0884 {, cut_label=86 }
          P13 =  22     : trace_delay = 1.3817 {, cut_label=85, N11 }
          P14 =  26     : trace_delay = 1.3126 {, cut_label=81, N10 }
          P15 =  15     : trace_delay = 0.9987 {, cut_label=76 }
          P16 =   1     : trace_delay = 1.3203 {, cut_label=75 }
          P17 =  26     : trace_delay = 1.4148 {, cut_label=81 }
           R1 = 158     : trace_delay = 1.1408 {, cut_label=122 }
           R2 = 147     : trace_delay = 0.9557 {, cut_label=119 }
           R3 = 137     : trace_delay = 1.1913 {, cut_label=116 }
           R4 = 139     : trace_delay = 1.1872 {, cut_label=112 }
           R5 = 141     : trace_delay = 0.9822 {, cut_label=109 }
           R6 = 126     : trace_delay = 1.2074 {, cut_label=106 }
           R7 = 123     : trace_delay = 0.9962 {, cut_label=103 }
           R8 = 121     : trace_delay = 1.5086 {, cut_label=100 }
           R9 =  38     : trace_delay = 1.1221 {, cut_label=96 }
          R10 =  35     : trace_delay = 1.3193 {, cut_label=95 }
          R11 =  34     : trace_delay = 1.0334 {, cut_label=90 }
          R12 =  33     : trace_delay = 1.2521 {, cut_label=89 }
          R13 =  20     : trace_delay = 1.0062 {, cut_label=84 }
          R14 =  25     : trace_delay = 0.9809 {, cut_label=80 }
          R15 =  28     : trace_delay = 1.1805 {, cut_label=79 }
          R16 =   0     : trace_delay = 1.1024 {, cut_label=74 }
{         R17 = no_connect }
           T1 = 148     : trace_delay = 0.9435 {, cut_label=121 }
           T2 = 135     : trace_delay = 1.1249 {, cut_label=118 }
           T3 = 136     : trace_delay = 0.9555 {, cut_label=115 }
           T4 = 138     : trace_delay = 0.9238 {, cut_label=111 }
           T5 = 140     : trace_delay = 1.1371 {, cut_label=108 }
           T6 = 127     : trace_delay = 0.9486 {, cut_label=105 }
           T7 = 124     : trace_delay = 1.1644 {, cut_label=102 }
           T8 = 122     : trace_delay = 0.9967 {, cut_label=101 }
           T9 =  39     : trace_delay = 1.3178 {, cut_label=98 }
          T10 =  36     : trace_delay = 1.0003 {, cut_label=94 }
          T11 =  17     : trace_delay = 1.3130 {, cut_label=93 }
          T12 =  19     : trace_delay = 1.0177 {, cut_label=88 }
          T13 =  21     : trace_delay = 1.2226 {, cut_label=87 }
          T14 =  24     : trace_delay = 1.2249 {, cut_label=83 }
          T15 =  27     : trace_delay = 0.9396 {, cut_label=78 }
          T16 =  14     : trace_delay = 1.1958 {, cut_label=77 }
{         T17 = no_connect }
{          U1 = no_connect }
{          U2 = no_connect }
           U3 = 144     : trace_delay = 1.1174 {, cut_label=114 }
           U4 = 145     : trace_delay = 0.8862 {, cut_label=113 }
           U5 = 142     : trace_delay = 1.1597 {, cut_label=110 }
           U6 = 125     : trace_delay = 0.9620 {, cut_label=107 }
           U7 = 143     : trace_delay = 1.1228 {, cut_label=104 }
           U8 = 120     : trace_delay = 0.9832 {, cut_label=99 }
           U9 =  37     : trace_delay = 1.2996 {, cut_label=97 }
          U10 =  16     : trace_delay = 1.0246 {, cut_label=92 }
          U11 =  18     : trace_delay = 1.2606 {, cut_label=91 }
          U12 =  32     : trace_delay = 0.9972 {, cut_label=86 }
          U13 =  22     : trace_delay = 1.2260 {, cut_label=85 }
          U14 =  23     : trace_delay = 0.9316 {, cut_label=82 }
{         U15 = no_connect }
{         U16 = no_connect }
{         U17 = no_connect }
```

APPENDIX II

Table of Contents

AM7990 . . . . . . . . . . . . . . . . . . . . . . . . Tab 1

DIP . . . . . . . . . . . . . . . . . . . . . . . . . . Tab 2

| Copyright 1989 Logic Modeling Systems | FILE AM7990.MDL | DATE 5/25/89 | PAGE # |
|---|---|---|---|
| | | TIME 12:46:58 pm | 1/2 |

LINE # TEXT

```
{*************************************************************}
{*  Copyright (c) 1988-1989 by Logic Modeling Systems, Inc.   *}
{*  All rights reserved.                                      *}
{*************************************************************}
{* i~_   Model main MODEL file for Advanced Micro Devices AM7990 *}
{* Local Area Network Controller For Ethernet                 *}
{*************************************************************}
device_name     AM7990
{-------------------------------------------------------------}
{ model_revision A }
{ shell_revision A }
{-------------------------------------------------------------}
physical        'AM7990.DEV'
timing          'AM7990.TMG'
package         'DIP48.PKG'          { 48 }
adapter         'DIP76.ADP'
options         'AM7990.OPT'
names           'AM7990.NAM'
{-------------------------------------------------------------}
```

Copyright 1989 Logic Modeling Systems

| FILE | DATE | PAGE # |
|---|---|---|
| AM7990.DEV | 5/25/89 | 1/1 |
| | TIME 12:46:58 pm | |

LINE # TEXT

```
{*****************************************************************************}
{*  Copyright (c) 1988 by Logic Modeling Systems, Inc. All rights reserved.  *}
{*****************************************************************************}
{* Logic Model DEVICE file for Advanced Micro Devices AM7990                 *}
{* Local Area Network Controller For Ethernet                                *}
{*****************************************************************************}
{* Data obtained from October 1986 Data Sheet 05698B/0                       *}
{-----------------------------------------------------------------------------}
{ model_revision A }
{ shell_revision A }
{-----------------------------------------------------------------------------}
technology          NMOS
{-----------------------------------------------------------------------------}
device_speed        99 nS - 101 nS        { AM7990PC, AM7990DC }
device_setup_time  40                     { parameter 18 }
device_hold_time    5                     { parameter 17 }
{-----------------------------------------------------------------------------}
in_pin
   RCLK             = 27 : store                       { receive clock }
   TCLK             = 25 : store                       { transmit clock }
   RX               = 31                               { receive data }
   '-CS'            = 20                               { chip select }
   ADR              = 21                               { register address }
   '-RESET'         = 23                               { reset }
   CLSN             = 28                               { collision }
   RENA             = 30                               { receiver enable }
   '-HLDA'          = 19 : store                       { bus hold acknowledge }
{-----------------------------------------------------------------------------}
out_pin
   ALE              = 18                               { address latch enable }
   '-INTR'          = 11                               { interrupt }
   TX               = 29                               { transmit data }
   TENA             = 26                               { transmitter enable }
   '-BM1/BUSAKO'    = 16                               { byte mask }
   '-BM0/BYTE'      = 15                               { byte mask }
   '-DALI'          = 12                               { enable data in }
   '-DALO'          = 13                               { enable data out }
   A[23:16]         = 32,33,34,35,36,37,38,39          { high address byte }
{-----------------------------------------------------------------------------}
io_pin
   DAL[15:0]        = 40,41,42,43,44,45,46,47,         { data/address bus }
                       2, 3, 4, 5, 6, 7, 8, 9
   READ             = 10                               { read transfer }
   '-DAS'           = 14 : store                       { data strobe }
   '-READY'         = 22 : feedback                    { acknowledge }
   '-HOLD/BUSRQ'    = 17                               { bus hold/request }
{-----------------------------------------------------------------------------}
power_pin
   VCC              = 48
{-----------------------------------------------------------------------------}
ground_pin
   VSS              = 1, 24
{-----------------------------------------------------------------------------}
initialize
   {operation :  reset    wait ,   ->CSR1    wait      CSR1=0000    wait   }
   CLSN, RENA = 3(0,0), 3(0,0),  8(0,0), 0,0,0,0,  fall(0,0), 0,0,0,0
    TCLK,RCLK = 3(0,1), 3(0,1),  8(0,1), 0,1,0,1,  fall(0,1), 0,1,0,1
     '-RESET' = 3(0,0), 3(1,1),  8(1,1), 1,1,1,1,  fall(1,1), 1,1,1,1
    DAL[15:1] = 3(0,0), 3(0,0),  8(0,0), 0,0,0,0,  fall(0,0), 0,0,0,0
       DAL[0] = 3(1,1), 3(1,1),  8(1,1), 1,1,0,0,  fall(0,0), 0,0,0,0
        '-DAS' = 3(1,1), 3(1,1),  8(0,0), 1,1,1,1,  fall(0,0), 1,1,1,1
          ADR = 3(1,1), 3(1,1),  8(1,1), 1,1,0,0,  fall(0,0), 0,0,0,0
         READ = 3(0,0), 3(0,0),  8(0,0), 0,0,0,0,  fall(0,0), 0,0,0,0
        '-CS' = 3(1,1), 3(0,0),  8(0,0), 0,0,0,0,  fall(0,0), 0,0,1,1
     '-READY' = 3(1,1), 3(1,1),  8(1,1), 1,1,1,1,  fall(1,1), 1,1,1,1
{-----------------------------------------------------------------------------}
```

Copyright 1989 Logic Modeling Systems

| FILE | DATE | TIME | PAGE # |
|---|---|---|---|
| AM7990.TMG | 5/25/89 | 12:46:58 pm | 1/5 |

LINE # TEXT

```
{*****************************************************************}
{*  Copyright (c) 1988 by Logic Modeling Systems, Inc.  All rights reserved.  *}
{*****************************************************************}
{* Logic Model TIMING file for Advanced Micro Devices AM7990
{* Local Area Network Controller for Ethernet                     *}
{*****************************************************************}
{* Data from AMD October 1986 datasheet 05698 rev B               *}
{-----------------------------------------------------------------}
{ model_revision A }
{ shell_revision A }
{-----------------------------------------------------------------}
default_delay   min 0, max 35
delay
    from valid('-HLDA')
        to valid('-HOLD/BUSRQ')         = max 75        { UNSPEC }

    from high(TCLK)
        to valid(TENA)                  = 5, 70         { 6, 7 }
        to valid(TX)                    = 5, 70         { 8, 9 }
        to any('-HOLD/BUSRQ')           = max 95        { 65 }
        to valid(A[23:16])              = max 100       { 66, 67 }
        to float(A[23:16])              = max 95        { 21, 65 }
        to valid('-BM1/BUSAKO')         = max 75        { 67 }
        to float('-BM1/BUSAKO')         = max 95        { 21, 65 }
        to valid('-BM0/BYTE')           = max 75        { 67 }
        to float('-BM0/BYTE')           = max 95        { 21, 65 }
        to valid(DAL[15:0])             = max 75        { 67 }
        to float(DAL[15:0])             = max 95        { 21, 65 }
        to valid('-DALO')               = max 75        { 67 }
        to float('-DALO')               = max 95        { 21, 65 }
        to valid(READ)                  = max 75        { 67 }
        to float(READ)                  = max 95        { 21, 65 }
        to valid(ALE)                   = max 75        { 67 }
        to float(ALE)                   = max 95        { 21, 65 }
        to valid('-DAS')                = max 75        { 67 }
        to high('-DAS')                 = max 90        { 71 }
        to float('-DAS')                = max 95        { 21, 65 }
        to valid('-DALI')               = max 75        { 67 }
        to float('-DALI')               = max 95        { 21, 65 }
        to low('-READY')                = max 75        { UNSPEC }
    from low(TCLK)
        to low(ALE)                     = max 90        { 68 }
        to low('-DAS')                  = max 90        { 69 }
        to valid(DAL[15:0])             = max 75        { UNSPEC }
        to valid(A[23:16])              = max 75        { UNSPEC }
        to valid(READ)                  = max 75        { UNSPEC }
        to valid('-BM1/BUSAKO')         = max 75        { UNSPEC }
        to valid('-BM0/BYTE')           = max 75        { UNSPEC }
        to valid('-DALI')               = max 75        { UNSPEC }
        to valid('-DALO')               = max 75        { UNSPEC }
    from valid(TCLK)
        to any('-INTR')                 = max 75        { UNSPEC }

    from high('-DAS')
        to float(DAL[15:0])             = 0, 35         { 37 }
        to float('-READY')              = 0, 35         { 62 }
{-----------------------------------------------------------------}
```

Copyright 1989 Logic Modeling Systems

| FILE | DATE | PAGE # |
|---|---|---|
| AM7990.TST | 5/25/89 | 1/6 |
| | TIME 12:46:58 pm | |

LINE # TEXT

```
#test AM7990
#{ model_revision A }
#{ shell_revision A }
TCLK                 1   I
RX                   2   I
RENA                 3   I
RCLK                 4   I
CLSN                 5   I
ADR                  6   I
-RESET               7   I
-HLDA                8   I
-CS                  9   I
READ                10   IO
DAL15               11   IO
DAL14               12   IO
DAL13               13   IO
DAL12               14   IO
DAL11               15   IO
DAL10               16   IO
DAL9                17   IO
DAL8                18   IO
DAL7                19   IO
DAL6                20   IO
DAL5                21   IO
DAL4                22   IO
DAL3                23   IO
DAL2                24   IO
DAL1                25   IO
DAL0                26   IO
-READY              27   IO
-HOLD/BUSRQ         28   IO
-DAS                29   IO
TX                  30   O
TENA                31   O
ALE                 32   O
A23                 33   O
A22                 34   O
A21                 35   O
A20                 36   O
A19                 37   O
A18                 38   O
A17                 39   O
A16                 40   O
-INTR               41   O
-DALO               42   O
-DALI               43   O
-BM1/BUSAKO         44   O
-BM0/BYTE           45   O
#patterns  { IIIIIIIIIBBBBBBBBBBBBBBBBBBBBOOOOOOOOOOOOOOOO }
#          {       ---                 ---           ----- }
#          { TRRRCARHCRDDDDDDDDDDDDDDDDRHDTTAAAAAAAAAIDDBB }
#          { CXECLDELSEAAAAAAAAAAAAAAAAEOAXEL22221111NAAMM }
#          { L NLSRSD ALLLLLLLLLLLLLLLLALS NE32109876TLL10 }
#          { K AKN EA D1111119876543210DD  A         ROI// }
#          {       T   543210          Y/               BB }
#          {                            B               UY }
#          {                            U               ST }
#          {                            S               AE }
#          {                            R               K  }
#          {                            Q               O  }
           {                                               }
        0  UUDUDDDUUUDDDDDDDDDDDDDDDDUUUXLTTTTTTTTTTTTTT
        1  UUDUDDDUUUDDDDDDDDDDDDDDDDUUUXLTTTTTTTTTTTTTT
       70  UUDUDDDUUUZZZZZZZZZZZZZZZZUUUXLTTTTTTTTTTTTTT
       80  UUDUDDDUUUDDDDDDDDDDDDDDDDUUUXLTTTTTTTTTTTTTT
      140  UUDUDDDUUUZZZZZZZZZZZZZZZZUUUXLTTTTTTTTTTTTTT
      330  UUDUDDDUUUZZZZZZZZZZZZZZZMUUUXLTTTTTTTTTTTTTT
      350  UUDUDDDUUUZZZZZZZZZZZZZZZZUUUXLTTTTTTTTTTTTTT
      500  DUDDDDDUUUZZZZZZZZZZZZZZZZUUUXLTTTTTTTTTTTTTT
      501  DUDDDDDUUUZZZZZZZZZZZZZZZZUUUXLTTTTTTTTTTTTTT
      510  DNDDDDDUUUZZZZZZZZZZZZZZZZUUUXLTTTTTTTTTTTTTT
     1000  UNDUDDDUUUZZZZZZZZZZZZZZZZUUUXLTTTTTTTTTTTTTT
     1001  UNDUDDDUUUZZZZZZZZZZZZZZZZUUUXLTTTTTTTTTTTTTT
     1500  DNDDDDDUUUZZZZZZZZZZZZZZZZUUUXLTTTTTTTTTTTTTT
     1501  DNDDDDDUUUZZZZZZZZZZZZZZZZUUUXLTTTTTTTTTTTTTT
     2000  UNDUDDDUUUZZZZZZZZZZZZZZZZUUUXLTTTTTTTTTTTTTT
     2001  UNDUDDDUUUZZZZZZZZZZZZZZZZUUUXLTTTTTTTTTTTTTT
     2500  DNDDDDDUUUZZZZZZZZZZZZZZZZUUUXLTTTTTTTTTTTTTT
     2501  DNDDDDDUUUZZZZZZZZZZZZZZZZUUUXLTTTTTTTTTTTTTT
     3000  UNDUDDDUUUZZZZZZZZZZZZZZZZUUUXLTTTTTTTTTTTTTT
     3001  UNDUDDDUUUZZZZZZZZZZZZZZZZUUUXLTTTTTTTTTTTTTT
     3500  DNDDDDDUUUZZZZZZZZZZZZZZZZUUUXLTTTTTTTTTTTTTT
     3501  DNDDDDDUUUZZZZZZZZZZZZZZZZUUUXLTTTTTTTTTTTTTT
     4000  UNDUDDDUUUZZZZZZZZZZZZZZZZUUUXLTTTTTTTTTTTTTT
     4001  UNDUDDDUUUZZZZZZZZZZZZZZZZUUUXLTTTTTTTTTTTTTT
     4500  DNDDDDDUUUZZZZZZZZZZZZZZZZUUUXLTTTTTTTTTTTTTT
     4501  DNDDDDDUUUZZZZZZZZZZZZZZZZUUUXLTTTTTTTTTTTTTT
     5000  UNDUDDDUUUZZZZZZZZZZZZZZZZUUUXLTTTTTTTTTTTTTT
     5001  UNDUDDDUUUZZZZZZZZZZZZZZZZUUUXLTTTTTTTTTTTTTT
     5500  DNDDDDDUUUZZZZZZZZZZZZZZZZUUUXLTTTTTTTTTTTTTT
     5501  DNDDDDDUUUZZZZZZZZZZZZZZZZUUUXLTTTTTTTTTTTTTT
     6000  UNDUDDDUUUZZZZZZZZZZZZZZZZUUUXLTTTTTTTTTTTTTT
     6001  UNDUDDDUUUZZZZZZZZZZZZZZZZUUUXLTTTTTTTTTTTTTT
     6500  DNDDDDDUUUZZZZZZZZZZZZZZZZUUUXLTTTTTTTTTTTTTT
     6501  D[illegible]DUUUZZZZZZZZZZZZZZZZUUUXLTTTTTTTTTTTTTT
     6700  DDD[illegible]DUUUZZZZZZZZZZZZZZZZUUUXLTTTTTTTTTTTTTT
     7000  UDDUDDDUUUZZZZZZZZZZZZZZZZUUUXLTTTTTTTTTTTTTT
     7001  UDDUDDDUUUZZZZZZZZZZZZZZZZUUUXLTTTTTTTTTTTTTT
     7500  DDDDDDDUUUZZZZZZZZZZZZZZZZUUUXLTTTTTTTTTTTTTT
     7501  DDDDDDDUUUZZZZZZZZZZZZZZZZUUUXLTTTTTTTTTTTTTT
     8000  UDDUDDDUUUZZZZZZZZZZZZZZZZUUUXLTTTTTTTTTTTTTT
     8001  UDDUDDDUUUZZZZZZZZZZZZZZZZUUUXLTTTTTTTTTTTTTT
     8010  UNDUDDDUUUZZZZZZZZZZZZZZZZUUUXLTTTTTTTTTTTTTT
     8500  DNDDDDDUUUZZZZZZZZZZZZZZZZUUUXLTTTTTTTTTTTTTT
     8501  DNDDDDDUUUZZZZZZZZZZZZZZZZUUUXLTTTTTTTTTTTTTT
     9000  UNDUDDDUUUZZZZZZZZZZZZZZZZUUUXLTTTTTTTTTTTTTT
     9001  UNDUDDDUUUZZZZZZZZZZZZZZZZUUUXLTTTTTTTTTTTTTT
     9500  DNDDDDDUUUZZZZZZZZZZZZZZZZUUUXLTTTTTTTTTTTTTT
     9501  DNDDDDDUUUZZZZZZZZZZZZZZZZUUUXLTTTTTTTTTTTTTT
    10000  UNDUDDDUUUZZZZZZZZZZZZZZZZUUUXLTTTTTTTTTTTTTT
    10001  UNDUDDDUUUZZZZZZZZZZZZZZZZUUUXLTTTTTTTTTTTTTT
    10500  DNDDDDDUUUZZZZZZZZZZZZZZZZUUUXLTTTTTTTTTTTTTT
    10501  DNDDDDDUUUZZZZZZZZZZZZZZZZUUUXLTTTTTTTTTTTTTT
    11000  UNDUDDDUUUZZZZZZZZZZZZZZZZUUUXLTTTTTTTTTTTTTT
    11001  UNDUDDDUUUZZZZZZZZZZZZZZZZUUUXLTTTTTTTTTTTTTT
    11500  DNDDDDDUUUZZZZZZZZZZZZZZZZUUUXLTTTTTTTTTTTTTT
    11501  DNDDDDDUUUZZZZZZZZZZZZZZZZUUUXLTTTTTTTTTTTTTT
    12000  UNDUDDDUUUZZZZZZZZZZZZZZZZUUUXLTTTTTTTTTTTTTT
    12001  UNDUDDDUUUZZZZZZZZZZZZZZZZUUUXLTTTTTTTTTTTTTT
    12500  DNDDDDDUUUZZZZZZZZZZZZZZZZUUUXLTTTTTTTTTTTTTT
```

Copyright 1989 [redacted]
Logic Modeling Systems

FILE AM7990.TST

DATE 5/25/89 TIME 12:46:58 pm PAGE # 2/7

| LINE # | | TEXT |
|---|---|---|
| 121 | 12501 | [illegible] |
| 122 | 13000 | [illegible] |
| 123 | 13001 | [illegible] |
| 124 | 13500 | [illegible] |
| 125 | 13501 | [illegible] |
| 126 | 14000 | [illegible] |
| 127 | 14001 | [illegible] |
| 128 | 14500 | [illegible] |
| 129 | 14501 | [illegible] |
| 130 | 14700 | [illegible] |
| 131 | 15000 | [illegible] |
| 132 | 15001 | [illegible] |
| 133 | 15500 | [illegible] |
| 134 | 15501 | [illegible] |
| 135 | 15510 | [illegible] |
| 136 | 16000 | [illegible] |
| 137 | 16001 | [illegible] |
| 138 | 16500 | [illegible] |
| 139 | 16501 | [illegible] |
| 140 | 17000 | [illegible] |
| 141 | 17001 | [illegible] |
| 142 | 17500 | [illegible] |
| 143 | 17501 | [illegible] |
| 144 | 18000 | [illegible] |
| 145 | 18001 | [illegible] |
| 146 | 18500 | [illegible] |
| 147 | 18501 | [illegible] |
| 148 | 19000 | [illegible] |
| 149 | 19001 | [illegible] |
| 150 | 19500 | [illegible] |
| 151 | 19501 | [illegible] |
| 152 | 20000 | [illegible] |
| 153 | 20001 | [illegible] |
| 154 | 20500 | [illegible] |
| 155 | 20501 | [illegible] |
| 156 | 21000 | [illegible] |
| 157 | 21001 | [illegible] |
| 158 | 21500 | [illegible] |
| 159 | 21501 | [illegible] |
| 160 | 22000 | [illegible] |
| 161 | 22001 | [illegible] |
| 162 | 22500 | [illegible] |
| 163 | 22501 | [illegible] |
| 164 | 23000 | [illegible] |
| 165 | 23001 | [illegible] |
| 166 | 23500 | [illegible] |
| 167 | 23501 | [illegible] |
| 168 | 24000 | [illegible] |
| 169 | 24001 | [illegible] |
| 170 | 24500 | [illegible] |
| 171 | 24501 | [illegible] |
| 172 | 25000 | [illegible] |
| 173 | 25001 | [illegible] |
| 174 | 25500 | [illegible] |
| 175 | 25501 | [illegible] |
| 176 | 26000 | [illegible] |
| 177 | 26001 | [illegible] |
| 178 | 26500 | [illegible] |
| 179 | 26501 | [illegible] |
| 180 | 27000 | [illegible] |
| 181 | 27001 | [illegible] |
| 182 | 27500 | [illegible] |
| 183 | 27501 | [illegible] |
| 184 | 28000 | [illegible] |
| 185 | 28001 | [illegible] |
| 186 | 28500 | [illegible] |
| 187 | 28501 | [illegible] |
| 188 | 29000 | [illegible] |
| 189 | 29001 | [illegible] |
| 190 | 29500 | [illegible] |
| 191 | 29501 | [illegible] |
| 192 | 30000 | [illegible] |
| 193 | 30001 | [illegible] |
| 194 | 30500 | [illegible] |
| 195 | 30501 | [illegible] |
| 196 | 31000 | [illegible] |
| 197 | 31001 | [illegible] |
| 198 | 31500 | [illegible] |
| 199 | 31501 | [illegible] |
| 200 | 32000 | [illegible] |
| 201 | 32001 | [illegible] |
| 202 | 32500 | [illegible] |
| 203 | 32501 | [illegible] |
| 204 | 33000 | [illegible] |
| 205 | 33001 | [illegible] |
| 206 | 33500 | [illegible] |
| 207 | 33501 | [illegible] |
| 208 | 34000 | [illegible] |
| 209 | 34001 | [illegible] |
| 210 | 34500 | [illegible] |
| 211 | 34501 | [illegible] |
| 212 | 35000 | [illegible] |
| 213 | 35001 | [illegible] |
| 214 | 35250 | [illegible] |
| 215 | [illegible]30 | [illegible] |
| 216 | 35[illegible]90 | [illegible] |
| 217 | 35500 | [illegible] |
| 218 | 35501 | [illegible] |
| 219 | 36000 | [illegible] |
| 220 | 36001 | [illegible] |
| 221 | 36310 | [illegible] |
| 222 | 36311 | [illegible] |
| 223 | 36500 | [illegible] |
| 224 | 36501 | [illegible] |
| 225 | 37000 | [illegible] |
| 226 | 37001 | [illegible] |
| 227 | 37500 | [illegible] |
| 228 | 37501 | [illegible] |
| 229 | 38000 | [illegible] |
| 230 | 38001 | [illegible] |
| 231 | 38500 | [illegible] |
| 232 | 38501 | [illegible] |
| 233 | 39000 | [illegible] |
| 234 | 39001 | [illegible] |
| 235 | 39500 | [illegible] |
| 236 | 39501 | [illegible] |
| 237 | 40000 | [illegible] |
| 238 | 40001 | [illegible] |
| 239 | 40500 | [illegible] |
| 240 | 40501 | [illegible] |

Copyright 1989
Logic Modeling Systems

| FILE | DATE | TIME | PAGE # |
|---|---|---|---|
| DIP48.PKG | 5/25/89 | 12:48:16 pm | 1/1 |

LINE # TEXT

```
{****************************************************************}
{*  Copyright (c) 1988 by Logic Modeling Systems, Inc. All rights reserved.  *}
{****************************************************************}
{*  Logic Model PACKAGE map file for 48 pin dual inline [illegible]es        *}
{****************************************************************}
{ map_revision A }
{----------------------------------------------------------------}
package_mapping
          1 =  1
          2 =  2
          3 =  3
          4 =  4
          5 =  5
          6 =  6
          7 =  7
          8 =  8
          9 =  9
         10 = 10
         11 = 11
         12 = 12
         13 = 13
         14 = 14
         15 = 15
         16 = 16
         17 = 17
         18 = 18
         19 = 19
         20 = 20
         21 = 21
         22 = 22
         23 = 23
         24 = 24
         25 = 53
         26 = 54
         27 = 55
         28 = 56
         29 = 57
         30 = 58
         31 = 59
         32 = 60
         33 = 61
         34 = 62
         35 = 63
         36 = 64
         37 = 65
         38 = 66
         39 = 67
         40 = 68
         41 = 69
         42 = 70
         43 = 71
         44 = 72
         45 = 73
         46 = 74
         47 = 75
         48 = 76
```

| Copyright 1989 Logic Modeling Systems | FILE DIP76.ADP | DATE 5/25/89 TIME 12:48:16 pm | PAGE # 1/2 |
|---|---|---|---|

LINE # TEXT

```
{*************************************************************************}
{*  Copyright (c) 1988-1989 by Logic Modeling Systems, Inc.              *}
{*  All rights reserved.                                                 *}
{*************************************************************************}
{*  Logic Model ADAPTER map file for  76 pin DIP adapter                 *}
{*************************************************************************}
{ map_revision A }
{-------------------------------------------------------------------------}
adapter_mapping
          1 = 74          : trace_delay = 0.5670 {, cut_label=1 }
          2 = 75          : trace_delay = 0.5523 {, cut_label=2 }
          3 = 49          : trace_delay = 0.5553 {, cut_label=3 }
          4 = 51          : trace_delay = 0.5740 {, cut_label=4 }
          5 = 50          : trace_delay = 0.5602 {, cut_label=5 }
          6 = 53          : trace_delay = 0.5789 {, cut_label=6 }
          7 = 52          : trace_delay = 0.5665 {, cut_label=7 }
          8 = 68          : trace_delay = 0.5740 {, cut_label=8 }
          9 = 66          : trace_delay = 0.5988 {, cut_label=9 }
         10 = 67          : trace_delay = 0.5866 {, cut_label=10 }
         11 = 57          : trace_delay = 0.6014 {, cut_label=11 }
         12 = 56          : trace_delay = 0.5823 {, cut_label=12 }
         13 = 59          : trace_delay = 0.5912 {, cut_label=13 }
         14 = 62          : trace_delay = 0.6131 {, cut_label=14 }
         15 = 61          : trace_delay = 0.6040 {, cut_label=15 }
         16 = 46          : trace_delay = 0.6337 {, cut_label=16 }
         17 = 42          : trace_delay = 0.6822 {, cut_label=17 }
         18 = 41          : trace_delay = 0.6879 {, cut_label=18 }
         19 = 39          : trace_delay = 0.7084 {, cut_label=19 }
         20 = 17          : trace_delay = 0.6411 {, cut_label=20 }
         21 = 19          : trace_delay = 0.6204 {, cut_label=21 }
         22 = 20          : trace_delay = 0.5925 {, cut_label=22 }
         23 = 22          : trace_delay = 0.6184 {, cut_label=23 }
         24 = 24          : trace_delay = 0.5949 {, cut_label=24 }
         25 = 25          : trace_delay = 0.6050 {, cut_label=25 }
         26 = 27          : trace_delay = 0.5819 {, cut_label=26 }
         27 = 15          : trace_delay = 0.5744 {, cut_label=27 }
         28 = 14          : trace_delay = 0.5868 {, cut_label=28 }
         29 = 30          : trace_delay = 0.5644 {, cut_label=29 }
         30 = 31          : trace_delay = 0.5777 {, cut_label=30 }
         31 = 12          : trace_delay = 0.5584 {, cut_label=31 }
         32 =  9          : trace_delay = 0.5808 {, cut_label=32 }
         33 =  8          : trace_delay = 0.5925 {, cut_label=33 }
         34 =  5          : trace_delay = 0.5835 {, cut_label=34 }
         35 =  4          : trace_delay = 0.5694 {, cut_label=35 }
         36 =  2          : trace_delay = 0.5513 {, cut_label=36 }
         37 =  1          : trace_delay = 0.5696 {, cut_label=37 }
         38 =  0          : trace_delay = 0.5530 {, cut_label=38 }
         39 =  3          : trace_delay = 0.6306 {, cut_label=39 }
         40 =  6          : trace_delay = 0.6413 {, cut_label=40 }
         41 =  7          : trace_delay = 0.6186 {, cut_label=41 }
         42 = 11          : trace_delay = 0.6414 {, cut_label=42 }
         43 = 10          : trace_delay = 0.6249 {, cut_label=43 }
         44 = 13          : trace_delay = 0.6444 {, cut_label=44 }
         45 = 29          : trace_delay = 0.6623 {, cut_label=45 }
         46 = 28          : trace_delay = 0.6640 {, cut_label=46 }
         47 = 26          : trace_delay = 0.6607 {, cut_label=47 }
         48 = 23          : trace_delay = 0.6838 {, cut_label=48 }
         49 = 21          : trace_delay = 0.6947 {, cut_label=49 }
         50 = 32          : trace_delay = 0.7195 {, cut_label=50 }
         51 = 33          : trace_delay = 0.6913 {, cut_label=51 }
         52 = 18          : trace_delay = 0.7271 {, cut_label=52 }
         53 = 34          : trace_delay = 0.7125 {, cut_label=53 }
         54 = 16          : trace_delay = 0.7343 {, cut_label=54 }
         55 = 35          : trace_delay = 0.7223 {, cut_label=55 }
         56 = 36          : trace_delay = 0.7018 {, cut_label=56 }
         57 = 37          : trace_delay = 0.7238 {, cut_label=57 }
         58 = 44          : trace_delay = 0.6953 {, cut_label=58 }
         59 = 63          : trace_delay = 0.6960 {, cut_label=59 }
         60 = 47          : trace_delay = 0.6977 {, cut_label=60 }
         61 = 60          : trace_delay = 0.6919 {, cut_label=61 }
         62 = 58          : trace_delay = 0.6705 {, cut_label=62 }
         63 = 65          : trace_delay = 0.6623 {, cut_label=63 }
         64 = 64          : trace_delay = 0.6689 {, cut_label=64 }
         65 = 54          : trace_delay = 0.6465 {, cut_label=65 }
         66 = 55          : trace_delay = 0.6589 {, cut_label=66 }
         67 = 69          : trace_delay = 0.6375 {, cut_label=67 }
         68 = 71          : trace_delay = 0.6249 {, cut_label=68 }
         69 = 70          : trace_delay = 0.6373 {, cut_label=69 }
         70 = 73          : trace_delay = 0.6159 {, cut_label=70 }
         71 = 72          : trace_delay = 0.6339 {, cut_label=71 }
         72 = 48          : trace_delay = 0.6066 {, cut_label=72 }
         73 = 76          : trace_delay = 0.5984 {, cut_label=73 }
         74 = 77          : trace_delay = 0.6114 {, cut_label=74 }
         75 = 79          : trace_delay = 0.5897 {, cut_label=75 }
         76 = 78          : trace_delay = 0.6015 {, cut_label=76 }
{        77 = 45 : extra }
{        78 = 43 : extra }
{        79 = 40 : extra }
{        80 = 38 : extra }
```

APPENDIX III

Table of Contents lm . . . . . . . . . . . . . . . . . . . . . . . . Tab 1
include . . . . . . . . . . . . . . . . . . . . . . Tab 2
sfi . . . . . . . . . . . . . . . . . . . . . . . . Tab 3
networkh . . . . . . . . . . . . . . . . . . . . . Tab 4
networkm . . . . . . . . . . . . . . . . . . . . . Tab 5
networkc . . . . . . . . . . . . . . . . . . . . . Tab 6
shellswh . . . . . . . . . . . . . . . . . . . . . Tab 7
shellswm . . . . . . . . . . . . . . . . . . . . . Tab 8
shellswc . . . . . . . . . . . . . . . . . . . . . Tab 9
diags . . . . . . . . . . . . . . . . . . . . . . . Tab 10
bsp.diags . . . . . . . . . . . . . . . . . . . . . Tab 11
tasks.diags . . . . . . . . . . . . . . . . . . . . Tab 12
lm1000 . . . . . . . . . . . . . . . . . . . . . . Tab 13
bsp.lm1000 . . . . . . . . . . . . . . . . . . . . Tab 14
tasks.lm1000 . . . . . . . . . . . . . . . . . . . Tab 15
os . . . . . . . . . . . . . . . . . . . . . . . . Tab 16
misc . . . . . . . . . . . . . . . . . . . . . . . Tab 17

Copyright 1989
Logic Modeling Systems

SOURCE PROGRAM lm/checks.c

DATE 5/23/89 TIME 1:20:32 pm PAGE # 1/1

LINE # SOURCE TEXT

```
#include        <stdio.h>
#include        <ctype.h>
#include        "common.h"
#include        "lm_sfi.h"
#include        "lm_text.h"
#include        "eeprom.h"
#include        "network.h"

#define MIN_PORT        1024
#define MAX_PORT        0x010000
#define MIN_SEG         0
#define MAX_SEG         32
#define MIN_SLOT        0
#define MAX_SLOT        7
#define MIN_LANE        'a'
#define MAX_LANE        'd'

extern  char    error_prefix[];


user_number_check (user_number_str)
        char    *user_number_str;

{    long    number_of_users;
    long    *list_of_users;
    long    user_number, loop;
    char    **list_of_user_names, **list_of_host_names;

    if (FAILURE == integer_check (user_number_str))
        return(FAILURE);

    user_number = atoi (user_number_str);

    if ((user_number < 0) || (user_number > MAX_USERS)) {
        (void) fprintf (stderr, "%s: invalid user number %d \n", error_prefix, user_number);
        return(FAILURE);
    }

    LM_CHECK( lm_inquire_user_list (&number_of_users, &list_of_users,
            &list_of_host_names, &list_of_user_names));


    for (loop = 0; loop<number_of_users; loop++, list_of_users++) {
        if (*list_of_users == user_number)
                return(SUCCESS);
    }

    (void) fprintf (stderr, "%s: there is no user number %d \n", error_prefix, user_number);

    return (FAILURE);
}


check_users (modeler_name)
        char    *modeler_name;

        /* check to see if there are other users on the system */

{    long    number_of_users, others;
    long    *list_of_users;
    long    status;
    char    **list_of_user_names, **list_of_host_names;
    char    reply[80];

    status = lm_select_modeler(modeler_name);

    if (LM_SUCCESS != status) {

        /* I know this seems weird, but if we can't  */
        /* select the modeler, assume that there is  */
        /* noone on the modeler.                     */

        return (SUCCESS);
    }

    /* get the total number of users on the system */

    LM_CHECK( lm_inquire_user_list (&number_of_users, &list_of_users,
            &list_of_host_names, &list_of_user_names));


    /* if there are other users on the system, give the operator the */
    /*  option of quitting out.                                      */

    if ((others = number_of_users - 1) > 0) {

        (void) printf((others == 1)? "There is %d other user on the system. \n":
            "There are %d other users on the system. \n", others);

        lm_get_input ("Do you wish to continue? (y/n) ", reply, sizeof(reply));
        while (FAILURE == yes_or_no (reply)) {
            lm_get_input ("Do you wish to continue? (y/n) ",
                reply, sizeof(reply));
        }

        if ((reply[0] == 'Y') || (reply[0] == 'y')) return (SUCCESS);
        return (FAILURE);
    }

    (void) printf("There are no active users on modeler \"%s\" \n", modeler_name);
    return (SUCCESS);
}



is_ident(c)
        char    c;

{

        if (    ((c >= 'A') && (c <= 'Z')) ||
                ((c >= 'a') && (c <= 'z')) ||
                ((c >= '0') && (c <= '9')) ||
                (c == '_') || (c == '@') ||
                (c == '#') || (c == '$') ||
                (c == '%') || (c == '*') ||
                (c == '/') || (c == '.') ||
                (c == '(') || (c == ')') ) return (TRUE);

        return (FALSE);
```

Copyright 1989 Logic Modeling Systems

| SOURCE PROGRAM | DATE | PAGE # |
|---|---|---|
| lm/checks.c | 5/23/89 | 2/2 |
| | TIME 1:20:32 pm | |

LINE # SOURCE TEXT

```
}

is_space(c)
        char    c;
{
        if (isspace(c)) return (SUCCESS);
        return (FAILURE);
}

is_digit(c)
        char    c;
{
        if ((c >= '0') && (c <= '9')) return (SUCCESS);
        return (FAILURE);
}

host_check (host_name)
        char *host_name;
{
        u_long  internet_address;

        if (FAILURE == get_internet_address(host_name, &internet_address)) {
                (void) fprintf(stderr, "%s: unknown host: %s \n",
                        error_prefix, host_name);
                return(FAILURE);
        }
        return(SUCCESS);
}

integer_check(string)
        char    *string;

{       int     loop;

        if (strlen(string) == 0) {
                return(FAILURE);
        }
        for (loop = 0; loop<strlen(string); loop++) {
                if (FAILURE == is_digit(string[loop])) {
                        (void) fprintf(stderr,
                                "%s: value must be numeric: %s \n",
                                error_prefix, string);
                        return(FAILURE);
                }
        }

        if ((strlen(string)>10) ||
                ((strlen(string) == 10) &&
                        (str_cmp(string, "2147483647") > 0))) {
                        (void) fprintf(stderr,
                                "%s: integer value too large: %s \n",
                                error_prefix,  string);
                        return(FAILURE);
        }

        return(SUCCESS);
}

true_or_false(string)
        char    *string;
{
        if (strlen(string) == 0) {
                return(FAILURE);
        }
        if ((0 != str_ncmp ("true", string, strlen(string))) &&
                        (0 != str_ncmp("false", string, strlen(string)))) {
                (void) fprintf(stderr,
                        "%s: value must be either 'true' or 'false': %s \n",
                        error_prefix, string);
                return(FAILURE);
        }

        return(SUCCESS);
}

yes_or_no(string)
        char    *string;
{
        if (strlen(string) == 0) {
                return(FAILURE);
        }

        if ((0 != str_ncmp ("yes", string, strlen(string))) &&
                        (0 != str_ncmp("no", string, strlen(string)))) {
                (void) fprintf(stderr,
                        "%s: value must be either 'yes' or 'no': %s \n",
                        error_prefix, string);
                return(FAILURE);
        }

        return(SUCCESS);
}

lane_height_check (height)
        char    *height;
{
        if (FAILURE == integer_check(height))
                return(FAILURE);

        if ((atoi(height)<=4 ) && (atoi(height)>0))
                return(SUCCESS);

        (void) fprintf(stderr,
                "%s: device adapter height may not be greater than 4 \n",
                error_prefix);

        return(FAILURE);
}

slot_width_check (width)
        char    *width;
{
        if (FAILURE == integer_check(width))
                return(FAILURE);

        if ((atoi(width)<=8 ) && (atoi(width)>0))
                return(SUCCESS);

        (void) fprintf(stderr,
```

Copyright 1989
Logic Modeling Systems

LINE # SOURCE TEXT

```
                "%s: device adapter width may not be greater than 8 \n",
                error_prefix);

        return(FAILURE);
}

port_check (string)
        char    *string;

{

        if (strlen(string) == 0) {
                return (FAILURE);
        }

        if (0 == str_ncmp("console", string, strlen(string)))
                return(SUCCESS);

        if (0 == str_ncmp("modem", string, strlen(string)))
                return(SUCCESS);

        (void) fprintf (stderr, "%s: invalid port name: '%s' \n",
                error_prefix, string);
        return(FAILURE);

}

baud_rate_check (string)
        char    *string;
{
        if (strlen(string) == 0) {
                return (FAILURE);
        }

        if (0 == str_cmp("300", string))
                return(SUCCESS);

        if (0 == str_cmp("1200", string))
                return(SUCCESS);

        if (0 == str_cmp("2400", string))
                return(SUCCESS);

        if (0 == str_cmp("4800", string))
                return(SUCCESS);

        if (0 == str_cmp("9600", string))
                return(SUCCESS);

        if (0 == str_cmp("2400+", string))
                return(SUCCESS);

        if (0 == str_cmp("9600+", string))
                return(SUCCESS);

        (void) fprintf (stderr, "%s: invalid baud rate: '%s' \n",
                error_prefix, string);
        return(FAILURE);

}

mode_check (mode)
        char    *mode;
{
        if (strlen(mode) == 0) {
                return(FAILURE);
        }
        if ((0 == str_ncmp("diagnostics", mode, strlen(mode)) ||
                (0 == str_ncmp("normal", mode, strlen(mode))))) {
                return(SUCCESS);
        }

        (void) fprintf(stderr,
                "%s: mode must be either 'normal' or 'diagnostic' \n",
                error_prefix);

        return(FAILURE);

}

minute_check (minute)
        char    *minute;
{

        if (FAILURE == integer_check(minute))
                return(FAILURE);

        if ((atoi(minute)<1001 ) && (atoi(minute)>-1))
                return(SUCCESS);

        (void) fprintf(stderr, "%s: minutes must be between 0 and 1000\n",
                error_prefix);

        return(FAILURE).

}


internet_port_check (port_number)
        char    *port_number;
{
        if (FAILURE == integer_check(port_number))
                return(FAILURE);

        if ((atoi(port_number)<MAX_PORT) && (atoi(port_number)>MIN_PORT))
                return(SUCCESS);

        (void) fprintf(stderr,
                "%s: internet port number must be between %d and %d\n",
                error_prefix, MIN_PORT, MAX_PORT);

        return(FAILURE);

}

address_check (addr)
        char    *addr;

{       int     loop;
```

Copyright 1989 Logic Modeling Systems

SOURCE PROGRAM lm/checks.c | DATE 5/23/89 | TIME 1:20:32 pm | PAGE # 4/4

LINE # SOURCE TEXT

```
        for (loop = 0; loop<strlen(addr); loop++) {
                if (((addr[loop] != 'x') && (addr[loop] != 'X')) &&
                        (FAILURE == isxdigit(addr[loop])))  {
                                (void) fprintf(stderr,
                                        "%s: value must be numeric: %s \n",
                                        error_prefix, addr);
                                return(FAILURE);
                }
        }

        if ((strlen(addr)>10) ||
                ((strlen(addr) == 10) &&
                        (str_cmp(addr, "4294705156") > 0))) {
                        (void) fprintf(stderr, "%s: Address too large: %s \n",
                                error_prefix, addr);
                        return(FAILURE);
        }

        return(SUCCESS);
}


null_ok()
{
        return(SUCCESS);
}



always_ok(file_name)
        char    *file_name;

{
        if (strlen(file_name) == 0) {
                return(FAILURE);
        }
        return (SUCCESS);
}



library_file_check(file_name)
        char    *file_name;

{
        char    ret_file[max_str];

        if (strlen(file_name) == 0) {
                return(FAILURE);
        }

        LM_CHECK(lm_resolve_library_file("LM_LIB", file_name, ret_file, max_str));

        return (SUCCESS);
}



file_check(file_name)
        char    *file_name,

{       int     status;

        if (strlen(file_name) == 0) {
                return(FAILURE);
        }

        status = access(file_name, 0);
        if (status != 0) {
                (void) fprintf(stderr,
                        "%s: File does not exist or cannot be accessed: %s \n",
                        error_prefix, file_name);
                return (FAILURE);
        }
        return (SUCCESS);
}



file_list_check (file_list)
        char    *file_list;

{       char    *cur_file;
        char    current_file[max_str];
        char    delimiter[2];
        char    *name_pointer;
        char    *end_of_string;
        long    return_status, status;

        if (strlen(file_list) == 0) {
                return(FAILURE);
        }

        return_status = SUCCESS;

        name_pointer = file_list;

        /*  find out if it's a comma or space separted list  */

        cur_file = (char *) strpbrk (file_list, " ,");
        if (NULL == cur_file) cur_file = file_list + strlen(file_list);

        (void) strncpy (delimiter, cur_file, 1);
        delimiter[1] = NULL;

        end_of_string = file_list + strlen(file_list);

        /*  check each file in the list  */

        do {
                cur_file = (char *) strpbrk (name_pointer, delimiter);
                if (NULL == cur_file) cur_file = file_list + strlen(file_list);

                (void) strncpy (current_file, name_pointer, cur_file-name_pointer);
                current_file[cur_file-name_pointer] = NULL;
                clean_input(current_file);
                name_pointer = cur_file + 1;

                status = access(current_file, 0);
                if (status != 0) {
```

Copyright 1989 Logic Modeling Systems

SOURCE PROGRAM lm/checks.c | DATE 5/23/89 | TIME 1:20:32 pm | PAGE # 5/5

LINE # SOURCE TEXT

```
                        (void) fprintf(stderr,
                                "%s: File does not exist or cannot be accessed: %s \n",
                                error_prefix, current_file);
                        return_status = FAILURE;
                }

        } while (cur_file != end_of_string);

        return(return_status);
}

all_modeler_check(modeler_name)
        char    *modeler_name;
{
        long    number_of_modelers, modeler;
        char    **list_of_modelers;

        LM_CHECK(lm_inquire_modeler_list(&number_of_modelers,
                &list_of_modelers));

        for (modeler=0; modeler<number_of_modelers;
            modeler++, list_of_modelers++) {
                if (0 == str_cmp (modeler_name, *list_of_modelers))
                        return(SUCCESS);
        }

        if (0 == str_cmp(modeler_name, "all"))
                return(SUCCESS);

        (void) fprintf(stderr, "%s: unknown modeler: %s \n",
                error_prefix, modeler_name);

        /* let user specify modeler not in modelers.lis */
        return(SUCCESS);
}

modeler_check(modeler_name)
        char    *modeler_name;
{
        long    number_of_modelers, modeler;
        char    **list_of_modelers;

        if (strlen(modeler_name) == 0) return(FAILURE);

        LM_CHECK(lm_inquire_modeler_list (&number_of_modelers,
            &list_of_modelers));

        for (modeler=0; modeler<number_of_modelers; modeler++,
            list_of_modelers++) {
                if (0 == str_cmp (modeler_name, *list_of_modelers))
                        return(SUCCESS);
        }

        (void) fprintf(stderr,
                "%s: unknown modeler: \"%s\" \n", error_prefix, modeler_name);

        /* let user specify modeler not in modelers.lis */
        return(SUCCESS);
}

mfg_check(mfg_name)
        char    *mfg_name;
{

        if (strlen(mfg_name)>MAN_LENGTH) {
                (void) fprintf(stderr,
                "%s: manufacturer name must be %d characters or less: %s \n",
                        error_prefix, MAN_LENGTH, mfg_name);

                return(FAILURE);
        }

        return(SUCCESS);

}

device_check(device_name)
        char    *device_name;
{

        if (strlen(device_name)>NAME_LENGTH) {
                (void) fprintf(stderr,
                        "%s: device name must be %d characters or less: %s \n",
                        error_prefix, NAME_LENGTH, device_name);
                return(FAILURE);
        }

        return(SUCCESS);
}

adapter_check(adapter_type)
        char    *adapter_type;
{
        if (strlen(adapter_type)>TYPE_LENGTH) {
                (void) fprintf(stderr,
                        "%s: adapter type must be %d characters or less: %s \n",
                        error_prefix, TYPE_LENGTH, adapter_type);

                return(FAILURE);
        }

        return(SUCCESS);
}

rev_check(rev_string)
        char    *rev_string;
{
        if (strlen(rev_string)>REV_LENGTH) {
                (void) fprintf(stderr,
                    "%s: revision string must be %d characters or less: %s \n",
                    error_prefix, REV_LENGTH, rev_string);

                return(FAILURE);
        }

        return(SUCCESS);
}
```

Copyright 1989
Logic Modeling Systems

| SOURCE PROGRAM | DATE | PAGE # |
|---|---|---|
| lm/checks.c | 5/23/89<br>TIME 1:20:32 pm | 6/6 |

LINE # SOURCE TEXT

```
segment_check (segment_number)
        char    *segment_number;
{       int     slot_number;

        if (FAILURE == integer_ca   segment_number))
                return(FAILURE);

        slot_number = atoi(segment_number);
        if ((slot_number<MIN_SEG) || (slot_number>MAX_SEG)) {
                (void) fprintf(stderr,
                        "%s: segment number must be between %d and %d: %s \n",
                        error_prefix, MIN_SEG, MAX_SEG, segment_number);
                return(FAILURE);
        }

        return (SUCCESS);
}

slot_check (slot_string)
        char    *slot_string;
{
        int     slot_number;

        if (FAILURE == integer_check(slot_string))
                return(FAILURE);

        slot_number = atoi(slot_string);
        if ((slot_number<MIN_SLOT) || (slot_number>MAX_SLOT)) {
                (void) fprintf(stderr, "%s: invalid slot number: %s \n",
                        error_prefix, slot_string);
                return(FAILURE);
        }

        return(SUCCESS);
}

lane_check (lane_id)
        char    *lane_id;
{
        if (strlen(lane_id) == 0) {
                return(FAILURE);
        }

        if (strlen(lane_id)>1) {
                (void) fprintf(stderr, "%s: invalid lane: %s \n",
                        error_prefix, lane_id);
                return(FAILURE);
        }

        if (((lane_id[0]<MIN_LANE) || (lane_id[0]>MAX_LANE))
                && ((lane_id[0]<toupper(MIN_LANE))
                || (lane_id[0]>toupper(MAX_LANE)))) {

                        (void) fprintf(stderr, "%s: invalid lane: %s \n",
                                error_prefix, lane_id);
                        return(FAILURE);
        }

        return(SUCCESS);
}

lm_check (status)
        int     status;
{
        char    *message;
        int     severity;

        if (LM_SUCCESS != status) {
                do {
                        lm_get_message( &severity, &message);
                        if (severity == LM_ERROR) {
                            (void) fprintf(stderr, "LM modeler error: %s\n", message);
                        }

                        if (severity == LM_WARNING)
                                (void) fprintf(stderr, "LM modeler warning: %s\n",
                                        message);
                } while (severity != LM_NO_MORE_MESSAGES);
        }

        return (status);
}

lm_diag_check (status)
        int     status;
{
        char    *message;
        int     severity;

        if (LM_SUCCESS != status) {
                do {
                        lm_get_message( &severity, &message);
                        if (severity == LM_ERROR) {
                                (void) fprintf(stderr, "LM modeler error: %s\n",
                                        message);
                        }
                } while (severity != LM_NO_MORE_MESSAGES);
        }

        return (status);
}
```

Copyright 1989
Logic Modeling Systems

SOURCE PROGRAM lm/command.c

DATE 5/23/89 TIME 1:20:33 pm PAGE # 1/7

LINE # SOURCE TEXT

```
/* SCCS_ID: command.c rev 3.1, 4/24/89 at 07:51:41     */

/*
**
**      Text based util...
**      This module accepts and parses the commands entered
**      by the user
**
**      copyr. Logic Modeling Systems Incorporated, 1988
**
*/
#include        <stdio.h>
#include        <ctype.h>
#include        <sys/types.h>
#include        <time.h>
#include        <signal.h>
#include        <setjmp.h>
#include        "common.h"
#include        "lm_text.h"
#include        "lm_rd_wr.h"
#include        "lm_sfi.h"
#include        "mod_err.h"
#include        "params.h"
#include        "dmart.h"
#include        "menus.h"
#include        "cpu.h"
#include        "id.h"
#include        "mod_def.h"
#include        "network.h"
#include        "command.h"

extern char     error_prefix[];

int     re_boot(), install(), shut_down(), diags(), burnin(), qa(), boot();
int     label (), set_password();
int     play_vectors(), measure_timing(), check_shell_software();
int     set_baudrate(), set_net_timeout(), show_modeler();
int     show_logic_models(), show_users(), show_versions(), text_menu();
int     null_ok(), always_ok(), lane_check();
int     slot_check(), board_check(), lm_promote();
int     file_list_check(), file_check(), library_file_check(), modeler_check();
int     true_or_false(), yes_or_no();
int     host_check(), test_check(), integer_check(), device_check();
int     all_modeler_check(), address_check(), mode_check();
int     minute_check(), lane_height_check(), mfg_check();
int     internet_port_check(), adapter_check(), rev_check();
int     segment_check();
int     baud_rate_check(), port_check(), create_timing_file();
int     command_mode_help(), locate_model_file();
int     abort_user();
int     user_number_check();

struct param_st prompt_table [] = {
        {PR_MODELER_NAME,       "",             "Modeler Name",
                modeler_check,          LM_FALSE},
        {PR_MODELER_DISP,       "ALL",          "Modeler Name",
                all_modeler_check,      LM_FALSE},
        {PR_LANE,               "",             "Lane (A - D)",
                lane_check,             LM_FALSE},
        {PR_SLOT,               "",             "Slot (0 - 7)",
                slot_check,             LM_FALSE},
        {PR_DEVICE_NAME,        "",             "Device Name",
                device_check,           LM_FALSE},
        {PR_MODEL_NAME,         "",             "Model File (xxx.MDL)",
                library_file_check,     LM_FALSE},
        {PR_PATTERN_FILE,       "",             "Vector File (xxx.TST)",
                library_file_check,     LM_FALSE},
        {PR_TIMING_FILE,        "",             "Timing File (xxx.TIM)",
                always_ok,              LM_FALSE},
        {PR_OUTPUT_FILE,        "",             "Output File (xxx.OUT)",
                null_ok,                LM_FALSE},
        {PR_LOG_FILE,   "",             "Vector Log File (xxx.LOG)",
                null_ok,                LM_FALSE},
        {PR_BOOT_LIST,          "boot.lis",     "Boot List",
                null_ok,                LM_FALSE},
        {PR_FILENAME,           "",             "Application File",
                null_ok,                LM_FALSE},
        {PR_START_ADDRESS,      "",             "Start Address",
                address_check,          LM_FALSE},
        {PR_MODE,               "normal",       "Mode",
                mode_check,             LM_FALSE},
        {PR_WAIT,               "no",           "Wait",
                yes_or_no,              LM_FALSE},
        {PR_MINUTES,            "0",            "Minutes",
                minute_check,           LM_FALSE},
        {PR_AUTOBOOT,           "yes",          "Autoboot",
                yes_or_no,              LM_FALSE},
        {PR_HOST_NAME,          "",             "Boot Host Name",
                host_check,             LM_FALSE},
        {PR_DAB_MAKER,  "",                     "Model Developer",
                mfg_check,              LM_FALSE},
        {PR_DAB_MAKER_REV,                      "",     "Model Revision",
                rev_check,              LM_FALSE},
        {PR_MANUFACTURER,       "",             "Manufacturer",
                mfg_check,              LM_FALSE},
        {PR_REVISION,           "",             "Revision",
                rev_check,              LM_FALSE},
        {PR_DAB_TYPE,           "",             "Adapter Type",
                adapter_check,          LM_FALSE},
        {PR_LANES_HIGH,         "1",            "Lanes High",
                lane_height_check,      LM_FALSE},
        {PR_SLOTS_WIDE,         "1",            "Slots Wide",
                slot_check,             LM_FALSE},
        {PR_SEGMENT,            "0",            "Segment Number",
                segment_check,          LM_FALSE},
        {PR_INET_PORT_NO,       "1234",         "Internet Port Number",
                internet_port_check,    LM_FALSE},
        {PR_BAUD_RATE,          "9600+",        "Baud Rate",
                baud_rate_check,        LM_FALSE},
        {PR_PORT,               "console",      "Port",
                port_check,             LM_FALSE},
        {PR_TIM_FILE,           "",             "TIM File(s)",
                file_list_check,        LM_FALSE},
        {PR_TMG_FILE,           "",             "TMG File",
                always_ok,              LM_FALSE},
        {PR_FILE_NAME,          "",             "File Name",
                always_ok,              LM_FALSE},
        {PR_BUS_MODE,           "yes",          "Combine Bus Delays",
                yes_or_no,              LM_FALSE},
        {PR_USER_NO,            "",             "User Number",
```

Copyright 1989
Logic Modeling Systems

SOURCE PROGRAM lm/command.c | DATE 5/23/89 | TIME 1:20:33 pm | PAGE # 2/8

LINE # SOURCE TEXT

```
                        user_number_check,        LM_FALSE}
};

struct flag_st global_flag_table[] = {
        {"modeler_name",                  'm',      PR_MODELER_NAME},
        0
};

struct flag_st kill_ft[] = {
        {"user_number",                   'u',      PR_USER_NO},
        0
};

struct flag_st boot_ft[] = {
        {"boot_list",                     'b',      PR_BOOT_LIST},
        {"filename",                      'F',      PR_FILENAME},
        {"start_address",                 'S',      PR_START_ADDRESS},
        {"mode",                          'D',      PR_MODE},
        0
};

struct flag_st install_ft[] = {
        {"autoboot",                      'a',      PR_AUTOBOOT},
        {"host_name",                     'h',      PR_HOST_NAME},
        {"internet_port_number",          'I',      PR_INET_PORT_NO},
        0
};

struct flag_st cr_tmg_file_ft[] = {
        {"tim_file",                      'i',      PR_TIM_FILE},
        {"tmg_file",                      'g',      PR_TMG_FILE},
        {"bus_mode",                      'u',      PR_BUS_MODE},
        0
};

struct flag_st reboot_ft[] = {
        {"wait",                          'w',      PR_WAIT},
        {"minutes",                       'M',      PR_MINUTES},
        0
};

struct flag_st label_ft[] = {
        {"lane",                          'l',      PR_LANE},
        {"slot",                          's',      PR_SLOT},
        {"device_name",                   'd',      PR_DEVICE_NAME},
        {"segment",                       'N',      PR_SEGMENT},
        {"manufacturer",                  'p',      PR_DAB_MAKER},
        {"revision",                      'r',      PR_DAB_MAKER_REV},
        {"manufacturer",                  'P',      PR_MANUFACTURER},
        {"revision",                      'R',      PR_REVISION},
        {"dab_type",                      'T',      PR_DAB_TYPE},
        {"lanes_high",                    'H',      PR_LANES_HIGH},
        {"slots_wide",                    'W',      PR_SLOTS_WIDE},
        0
};

struct flag_st play_vectors_ft[] = {
        {"model_name",                    'f',      PR_MODEL_NAME},
        {"pattern_file",                  'p',      PR_PATTERN_FILE},
        {"output_file",                   'o',      PR_OUTPUT_FILE},
        {"log_file",                      'l',      PR_LOG_FILE},
        0
};

struct flag_st measure_timing_ft[] = {
        { "model_name",                   'f',      PR_MODEL_NAME},
        {"pattern_file",                  'p',      PR_PATTERN_FILE},
        {"output_file",                   'o',      PR_OUTPUT_FILE},
        {"timing_file",                   't',      PR_TIMING_FILE},
        {"log_file",                      'l',      PR_LOG_FILE},
        0
};

struct flag_st check_ft[] = {
        {"model_name",                    'f',      PR_MODEL_NAME},
        0
};

struct flag_st set_baud_ft[] = {
        {"baud_rate",                     'B',      PR_BAUD_RATE},
        {"port",                          'P',      PR_PORT},
        0
};

struct flag_st set_net_ft[] = {
        {"minutes",                       'M',      PR_MINUTES},
        0
};

struct flag_st shutdown_ft[] = {
        {"wait",                          'w',      PR_WAIT},
        {"minutes",                       'M',      PR_MINUTES},
        0
};

struct flag_st locate_ft[] = {
        {"filename",                      'f',      PR_FILE_NAME},
        0
};

struct command_st command_table [] = {
        {"abort_user",          abort_user,             kill_ft,            BMS},
        {"boot",                boot,                   boot_ft,            BMS},
        {"burnin",              burnin,                 0,                  BMS},
        {"change_password",     set_password,           0,                  BMS},
        {"check",               check_shell_software,   check_ft,           BMS},
        {"create_timing",       create_timing_file,     cr_tmg_file_ft,     BMS},
        {"find",                locate_model_file,      locate_ft,          NO_BMS},
        {"diagnostics",         diags,                  0,                  BMS},
        {"help",                command_mode_help,      0,                  NO_BMS},
        {"install",             install,                install_ft,         BMS},
        {"label",               label,                  label_ft,           BMS},
        {"measure_timing",      measure_timing,         measure_timing_ft,  BMS},
        {"menu",                text_menu,              0,                  NO_BMS},
        {"play_vectors",        play_vectors,           play_vectors_ft,    BMS},
        {"qa",                  qa,                     0,                  BMS},
        {"reboot",              re_boot,                reboot_ft,          BMS},
        {"set_baud",            set_baudrate,           set_baud_ft,        BMS},
        {"set_network",         set_net_timeout,        set_net_ft,         BMS},
        {"show_logic_models",   show_logic_models,      0,                  BMS},
```

Copyright 1989
Logic Modeling Systems

SOURCE PROGRAM lm/command.c | DATE 5/23/89 | TIME 1:20:33 pm | PAGE # 3/9

LINE # SOURCE TEXT

```
        {"show_modeler",        show_modeler,        0,             BMS},
        {"show_users",          show_users,          0,             BMS},
        {"show_versions",       show_versions,       0,             BMS},
        {"shutdown",            shut_down,           shutdown_ft,   BMS},
        0
};

struct param_st *find_tag_param();
struct param_st *find_flag_param();
struct param_st *find_string_param();
struct command_st *find_command();

int command_mode = TRUE;
int prompt_mode = FALSE;

command_line_mode (argc, argv)
        int     argc;
        char    *argv[];

        /* command line mode, looks and smells like UNIX (tm) */

{       int     cur_arg;
        struct command_st *command = 0;
        struct flag_st *flag_st = 0;
        struct param_st *param_st;
        void find_and_execute();
        jmp_buf jmpbuf;
        extern jmp_buf  *Jmpbuf;
#ifdef SUNOS3_5
        int     handle_intr();
#else
        void    handle_intr();
#endif

        Jmpbuf = (jmp_buf  *)jmpbuf;
        if (setjmp(Jmpbuf)) {
                /* got an interrupt */
                u_exit(); /* never returns */
        }
        (void) signal(SIGINT, handle_intr);

        for (cur_arg = 1; cur_arg < argc; ++cur_arg) {
                if (argv[cur_arg][0] == '-') {
                        if ((cur_arg == (argc - 1))
                            || (argv[cur_arg + 1][0] == '-')) {
                                (void) fprintf(stderr,
                                        "Missing parameter value for %s\n",
                                        argv[cur_arg]);
                                u_exit(); /* never returns */
                        }
                        if (strlen(argv[cur_arg]) == 2) {
                                param_st = find_flag_param(flag_st,
                                        argv[cur_arg][1]);
                        } else {
                                param_st = find_string_param(flag_st,
                                        &(argv[cur_arg][1]));
                        }
                        if (param_st) {
                                (void) strcpy(param_st->default_value,
                                        argv[++cur_arg]);
                                param_st->defined = LM_TRUE;
                        } else {
                                (void) fprintf(stderr, "%s: unknown parameter: %s \n",
                                        error_prefix, argv[cur_arg]);
                                u_exit();
                        }
                } else if (!strcmp(argv[cur_arg], "prompt")) {
                        prompt_mode = TRUE;
                } else if (!strcmp(argv[cur_arg], "field_engineering")) {
                        lm_promote();
                } else {
                        /* must be a command */
                        if (command) {
                                execute_command(command);
                        }
                        if (!(command = find_command(argv[cur_arg]))) {
                                (void) fprintf(stderr, "%s: unknown command: %s \n",
                                        error_prefix, argv[cur_arg]);
                                u_exit(); /* never returns */
                        }
                        flag_st = command->flag_st;
                }
        }
        if (command) execute_command(command);
        else {
                find_and_execute("menu"); /* default command is "menu" */
        }
        u_exit(); /* never returns */
}


find_flag_tag(flag_st, c)
        struct  flag_st *flag_st;
        char    c;

{
        /* look in local flag table if it exists */
        if (flag_st) for (; flag_st->tag; ++flag_st) {
                if (flag_st->flag == c) {
                        return flag_st->tag;
                }
        }

        /* look in global flag table */
        for (flag_st = global_flag_table; flag_st->tag; ++flag_st) {
                if (flag_st->flag == c) {
                        return flag_st->tag;
                }
        }

        return 0; /* undefined flag */
}


find_string_tag(flag_st, s)
        struct  flag_st *flag_st;
        char    *s;
```

Copyright 1989 Logic Modeling Systems

SOURCE PROGRAM lm/command.c | DATE 5/23/89 | TIME 1:20:33 pm | PAGE # 4/10

LINE # SOURCE TEXT

```
{
        /* look in local flag table if it exists */
        if (flag_st) for (; flag_st->tag; ++flag_st) {
                if (str_cmp(s, flag_st->string) == 0) {
                        return flag_st->tag;
                }
        }

        /* look in global flag table */
        for (flag_st = global_flag_table; flag_st->tag; ++flag_st) {
                if (str_cmp(s, flag_st->string) == 0) {
                        return flag_st->tag;
                }
        }

        return 0; /* undefined flag */
}



struct param_st *
find_tag_param(tag)

{       struct param_st *param_st;

        for (param_st = prompt_table; param_st->tag; ++param_st) {
                if (param_st->tag == tag) {
                        return param_st;
                }
        }

        return 0; /* undefined tag */
}



struct param_st *
find_flag_param(flag_st, c)
        struct  flag_st *flag_st;
        char    c;

{
        return find_tag_param(find_flag_tag(flag_st, c));
}



struct param_st *
find_string_param(flag_st, s)
        struct  flag_st *flag_st;
        char    *s;

{
        return find_tag_param(find_string_tag(flag_st, s));
}



struct command_st *
find_command(s)
        char    *s;

{       struct command_st *command;

        for (command = command_table; command->command; ++command) {
                if (str_ncmp(command->command, s, strlen(s)) == 0) {
                        return command;
                }
        }
        return 0;
}

execute_command(command)
struct command_st *command;
{
        if (command->bms == BMS) {
                local_begin_modeling_session();
        }
        (*command->routine)();
        local_end_modeling_session();
}

void
find_and_execute(s)
        char    *s;

{       struct command_st *command;

        if (command = find_command(s))
                execute_command(command);
        else
                (void) fprintf(stderr, "%s: unknown command: %s \n", error_prefix, s);
}



command_mode_help()

{       struct  command_st      *command;
        struct  flag_st         *flag_st;

        (void) printf("Command mode command summary:\n");

        for (flag_st = global_flag_table; flag_st->flag; ++flag_st) {
                (void) printf("\t-%c %s\n", flag_st->flag, flag_st->string);
        }

        for (command = command_table; command->command; ++command) {
                (void) printf("\t%s\n", command->command);
                if ((flag_st = command->flag_st) != 0) {
                        for (; flag_st->flag; ++flag_st) {
                                (void) printf("\t\t-%c %s\n", flag_st->flag,
                                        flag_st->string);
                        }
                }
        }
}


set_validation(tag, routine)
```

Copyright 1989 Logic Modeling Systems

SOURCE PROGRAM lm/command.c | DATE 5/23/89 | TIME 1:20:33 pm | PAGE # 5/11

LINE # SOURCE TEXT

```
        int     tag;
        int     (*routine)();
{       struct param_st *param_st = find_tag_param(tag);

        if (param_st) {
                param_st->validate = routine;
                return(SUCCESS);
        }
        (void) fprintf(stderr,
            "%s: internal error 1: bad parameter tag value: %d\n",
            error_prefix, tag);
        return(FAILURE);
}



set_default(tag, default_value)
        int     tag;
        char    *default_value;

{       struct param_st *param_st = find_tag_param(tag);

        if (param_st) {
                param_st->defined = LM_TRUE;
                (void) strcpy(param_st->default_value, default_value);
                return(SUCCESS);
        }
        (void) fprintf(stderr,
            "%s: internal error 1: bad parameter tag value: %d\n",
            error_prefix, tag);
        return(FAILURE);
}



char *
get_default(tag)
        int     tag;

{       struct param_st *param_st;

        if (param_st = find_tag_param(tag)) {
                return param_st->default_value;
        }

        return 0; /* undefined tag */
}



get_parameter (tag, return_value, size)
        int     tag;
        char    *return_value;
        int     size;

{       char    reply[max_str];
        char    *reply_ptr;
        char    prompt[max_str];
        int     number_of_modelers;
        char    **list_of_modelers;
        struct  param_st        *param_st;

        if (!(param_st = find_tag_param(tag))) {
                (void) fprintf(stderr,
                    "%s: internal error 2: bad parameter tag value: %d\n",
                    error_prefix, tag);
                return(FAILURE);
        }

        /* special handling for get modeler_name */
        /* if there's only one modeler, don't ask */

        switch (tag) {

        case PR_MODELER_DISP:
        case PR_MODELER_NAME:

                (void) lm_check(lm_inquire_modeler_list(&number_of_modelers,
                    &list_of_modelers));

                if (number_of_modelers == 1) {
                        reply_ptr = get_default (PR_MODELER_NAME);
                        if ((strlen(reply_ptr) == 0) || (0 == str_cmp(reply_ptr, *list_of_modelers))) {
                                (void) strcpy (return_value, *list_of_modelers);
                                return (SUCCESS);
                        }
                }
        }

        (void) sprintf(prompt, (strlen(param_st->default_value) != 0)?
            "%s [%s]: ": "%s: ", param_st->prompt_string,
            param_st->default_value);

        if (command_mode == TRUE) {
                (void) strcpy( return_value, param_st->default_value);
                if (((* param_st->validate)
                    (return_value)) == SUCCESS) return SUCCESS;

                if ((prompt_mode == FALSE) && (!(is_param_defined(tag))))
                        (void) fprintf(stderr, "%s not specified\n", param_st->prompt_string);

                return FAILURE;
        }

        /* prompt for value */
        do {
                lm_get_input(prompt, reply, max_str);
                if (strlen(reply) == 0)
                        (void)strcpy (reply, param_st->default_value);
        } while (SUCCESS != (*param_st->validate)(reply));

        (void) strncpy(return_value, reply, size);
        return(SUCCESS);
}



is_param_defined(tag)
        int     tag;
```

Copyright 1989
Logic Modeling Systems

| SOURCE PROGRAM | DATE | PAGE # |
|---|---|---|
| lm/command.c | 5/23/89 TIME 1:20:33 pm | 6/12 |

LINE # SOURCE TEXT

```
{       struct param_st *param_st;

        if (param_st = find_tag_param(tag)) {
                return param_st->defined;
        }

        return 0; /* undefined tag */
}


define_param(tag, state)
        int     tag;
        long    state;
{       struct param_st *param_st;

        if (param_st = find_tag_param(tag)) {
                param_st->defined = state;
        }
}
```

Copyright 1989
Logic Modeling Systems

| HEADER FILE | DATE | TIME | PAGE # |
|---|---|---|---|
| lm/command.h | 5/23/89 | 1:20:33 pm | 1/13 |

LINE # HEADER TEXT

```
/* SCCS_ID: command.h rev 3.1, 4/24/89 at 07:51:45 */

struct flag_st {
        char    *string;
        char    flag;
        int     tag; /* tag in prompt_table */
};

struct param_st {
        int     tag;
        char    default_value[max_str];
        char    *prompt_string;
        int     (*validate)();
        int     defined;
};

struct command_st {
        char    *command;
        int     (*routine)();
        struct flag_st *flag_st;
        int     bms; /* begin modeling session flag */
};

/* begin modeling session flag defines */

#define NO_BMS  0       /* don't begin modeling session before executing */
#define BMS     1       /* begin modeling session before executing */

/* Parameter table tag defines */

#define PR_MODELER_NAME         1
#define PR_MODELER_DISP         2
#define PR_LANE                 3
#define PR_SLOT                 4
#define PR_DEVICE_NAME          5
#define PR_MODEL_NAME           6
#define PR_PATTERN_FILE         7
#define PR_TIMING_FILE          8
#define PR_OUTPUT_FILE          9
#define PR_BOOT_LIST            10
#define PR_FILENAME             11
#define PR_START_ADDRESS        12
#define PR_MODE                 13
#define PR_WAIT                 14
#define PR_MINUTES              15
#define PR_AUTOBOOT             16
#define PR_HOST_NAME            17
#define PR_MANUFACTURER         18
#define PR_DAB_TYPE             19
#define PR_REVISION             20
#define PR_LANES_HIGH           21
#define PR_SLOTS_WIDE           22
#define PR_SEGMENT              23
#define PR_INET_PORT_NO         24
#define PR_BAUD_RATE            25
#define PR_PORT                 26
#define PR_TIM_FILE             27
#define PR_TMG_FILE             28
#define PR_BUS_MODE             29
#define PR_LOG_FILE             30
#define PR_USER_NO              31
#define PR_DAB_MAKER            32
#define PR_DAB_MAKER_REV        33
#define PR_FILE_NAME            34

struct command_st *find_command();
struct flag_st *find_param_string();
struct flag_st *find_param_flag();
int set_default();
char *get_default();
```

Copyright 1989
Logic Modeling Systems

| SOURCE PROGRAM | DATE | TIME | PAGE # |
|---|---|---|---|
| lm/display.c | 5/23/89 | 1:20:34 pm | 1/14 |

LINE # SOURCE TEXT

```c
/* SCCS_ID: display.c rev 2.10, 2/7/89 at 15:44:16      */

#include        <stdio.h>
#include        <ctype.h>
#include        <sys/types.h>
#include        <netinet/in.h>
#include        <netdb.h>

#ifdef VMS
#include        <descrip.h>
#endif

#include        "common.h"
#include        "network.h"
#include        "lm_text.h"
#include        "lm_rd_wr.h"
#include        "lm_sfi.h"
#include        "cpu.h"
#include        "id.h"
#include        "mod_def.h"
#include        "mod_err.h"
#include        "command.h"
#include        "nvram.h"

char dash[] = "- ";
char blank[] = "";

/*  Kinda reminds you of fortran, huh?  print with 100 */

char fmt1[] = " %-32s%9s%9s%9s%9s%9s\n";
char fmt2[] = " %-32s%8d %8d %8d %8d %8d \n";
char fmt3[] = " %-12s%9s%8d %8d %8d %8d \n";
char fmt4[] = " %-20s%-12s%-7s %-13s %-8s%-6s %s\n";
char fmt5[] = " %-20s%-12s%-7s %5d / %-5d %-8s%-6s %s\n";
char fmt6[] = "%-10s %-10s %-6s %-8s %-14s %-14s %-9s \n";
char fmt7[] = "%-10s %-10s %6d %8s %5d / %-5d %6s / %-6s %3d / %d\n";

typedef char printline[81];

extern void read_every_forth_byte();
extern char *create_revision();

#ifdef VMS
extern  vms_str_cmp();
#endif

extern int str_cmp(), str_ncmp();         /* case insensitive string compares  */
extern char *string_it();
extern char error_prefix[max_str];
extern  char    *boot_host();
extern  char    *string_internet();
extern  char    *extract_version();

display_users(modeler_name)
char *modeler_name;

{
    long user, number_of_users, pub_parts, priv_parts, pat_len, active_instances, idle_time;
    long active_faults, pat_alloc, pstat;
    long *list_of_users;
    long time_status;
    char **list_of_user_names, **list_of_host_names;
    char b[10], c[10];
    char idle_str[10];
    char user_name[80], host_name[80];
    printline *user_array;

    LM_CHECK(lm_select_modeler(modeler_name));

    /* get the total number of users on the system  */

    LM_CHECK(lm_inquire_user_list(&number_of_users, &list_of_users,
                                  &list_of_host_names, &list_of_user_names));

    /* warning:  the user may logout while this function is running  */

    (void) printf("\n");
    (void) printf("\"%s\" LM-1000 Users \n", modeler_name);
    (void) printf("\n");
    (void) printf(fmt6, "User", "Host", "User",   "   Idle", "  Devices",      "  Patterns",     "Simulator");
    (void) printf(fmt6, "Name", "Name", "Number", "   Time", "Public/Private", "Used/Allocated", "Instances");
    (void) printf("\n");

    user_array = (printline *) malloc ((unsigned int) number_of_users * sizeof(printline));

    for (user = 0; user < number_of_users; user++, list_of_users++) {
        /* truncate extra-long host and user names */
        (void) strncpy (user_name, *list_of_user_names++, 10);
        user_name[10] = '\0';
        (void) strncpy (host_name, *list_of_host_names++, 10);
        host_name[10] = '\0';

        time_status = lm_inquire_user(*list_of_users,
                                      LM_SECONDS_SINCE_LAST_RESPONSE, &idle_time);

        LM_CHECK_TO(dsp_user_cleanup,
                    lm_inquire_user(*list_of_users,
                                    LM_NUMBER_OF_PUBLIC_DEVICES, &pub_parts));
        LM_CHECK_TO(dsp_user_cleanup,
                    lm_inquire_user(*list_of_users,
                                    LM_NUMBER_OF_PRIVATE_DEVICES, &priv_parts));
        LM_CHECK_TO(dsp_user_cleanup,
                    lm_inquire_user(*list_of_users,
                                    LM_NUMBER_OF_PATTERNS, &pat_len));

        pstat = lm_inquire_user(*list_of_users, LM_NUMBER_OF_PATTERNS_ALLOCATED, &pat_alloc);
        if (LM_SUCCESS != pstat) pat_alloc = 0;

        LM_CHECK_TO(dsp_user_cleanup,
                    lm_inquire_user(*list_of_users,
                            LM_NUMBER_OF_ACTIVE_INSTANCES, &active_instances));
        LM_CHECK_TO(dsp_user_cleanup,
                    lm_inquire_user(*list_of_users,
                                LM_NUMBER_OF_ACTIVE_FAULTS, &active_faults));

        if (time_status != LM_SUCCESS) {
                (void) sprintf(idle_str, " ---- ");
        } else {
                int     days, hours, minutes, seconds;
```

Copyright 1989 Logic Modeling Systems

SOURCE PROGRAM lm/display.c | DATE 5/23/89 | TIME 1:20:34 pm | PAGE # 2/15

LINE # SOURCE TEXT

```
                days = idle_time / (24 * 60 * 60); idle_time = idle_time % (24 * 60 * 60);
                hours = idle_time / (60 * 60);     idle_time = idle_time % (60 * 60);
                minutes = idle_time / (60);        idle_time = idle_time % (60);
                seconds = idle_time;

                if (days > 3) {
                    if (12 < hours) days += 1;
                    (void) sprintf(idle_str, "%3d days", days);
                } else if ((0 == days) && (0 == hours)) {
                    (void) sprintf(idle_str, "   %2d:%02d", minutes, seconds);
                } else {
                    hours = hours + days * 24;
                    (void) sprintf(idle_str, "%2d:%02d:%02d", hours, minutes, seconds);
                }
        }

        (void) sprintf((char *) (user_array + user), fmt7,
                        user_name, host_name,
                        *list_of_users, idle_str,
                        pub_parts, priv_parts,
                        string_it(pat_len, b, 10),
                        string_it(pat_alloc, c, 10),
                        active_instances,
                        active_faults);
    }

#ifndef VMS
    qsort((char *) user_array, (int) number_of_users, sizeof(printline), str_cmp);
#else
    vms_qsort((char *) user_array, (int) number_of_users, sizeof(printline), vms_str_cmp);
#endif

    for (user = 0; user < number_of_users; user++) {
        (void) printf("%s", user_array + user);
    }

    (void) printf("\n");

dsp_user_cleanup:
    free((char *) user_array);

    return (SUCCESS);
}



show_logic_models()
{
    char modeler_name[max_str];
    long status;

    status = get_parameter(PR_MODELER_NAME,
                           modeler_name, sizeof(modeler_name));
    if (status != SUCCESS)
        return (FAILURE);

    LM_CHECK(lm_select_modeler(modeler_name));

    (void) display_logic_models(modeler_name);

    return (SUCCESS);
}



show_users()
{
    char modeler_name[max_str];
    long status;

    status = get_parameter(PR_MODELER_NAME,
                           modeler_name, sizeof(modeler_name));
    if (status != SUCCESS)
        return (FAILURE);

    LM_CHECK(lm_select_modeler(modeler_name));

    (void) display_users(modeler_name);

    return (SUCCESS);
}



show_modeler()
{
    char modeler_name[max_str];
    long status;

    status = get_parameter(PR_MODELER_NAME,
                           modeler_name, sizeof(modeler_name));
    if (status != SUCCESS)
        return (FAILURE);

    LM_CHECK(lm_select_modeler(modeler_name));

    (void) display_modeler(modeler_name);

    return (SUCCESS);
}



show_versions()
{
    char modeler_name[max_str];
    long status;

    status = get_parameter(PR_MODELER_NAME,
                           modeler_name, sizeof(modeler_name));
    if (status != SUCCESS)
        return (FAILURE);

    LM_CHECK(lm_select_modeler(modeler_name));

    (void) display_version(modeler_name);

    return (SUCCESS);
}
```

Copyright 1989 Logic Modeling Systems

| SOURCE PROGRAM | DATE | 5/23/89 | PAGE # |
|---|---|---|---|
| lm/display.c | TIME | 1:20:34 pm | 3/16 |

LINE # SOURCE TEXT

```
show_per_modeler(display_function)
long (*display_function) ();

{
    char selected_modeler[max_str], *modeler_name;
    long status;
    int number_of_modelers, modeler;
    char **list_of_modelers;
    char bogus[10];

    LM_CHECK(lm_inquire_modeler_list(&number_of_modelers, &list_of_modelers));

    status = get_parameter(PR_MODELER_DISP,
                           selected_modeler, sizeof(selected_modeler));
    if (status != SUCCESS)
        return (FAILURE);

    (void) printf("\n");

    if (0 == str_cmp(selected_modeler, "all")) {
        if (number_of_modelers == 0) {
            (void) printf("No modelers are currently available \n");
            return SUCCESS;
        }
        for (modeler = 0; modeler < (number_of_modelers - 1); modeler++) {
            status = do_show_per_modeler(display_function,
                                         *(list_of_modelers + modeler));
            if (status != LM_ERROR) {
                (void) lm_get_input("Press return for next modeler... ",
                                    bogus, 10);
                (void) printf("\n");
            }
        }
        modeler_name = *(list_of_modelers + modeler);
    } else {
        modeler_name = selected_modeler;
    }

    /* last modeler in the list */

    status = do_show_per_modeler(display_function, modeler_name);

    if (status != LM_ERROR) {
        (void) lm_get_input("Press return to continue... ", bogus, 10);
        (void) printf("\n");
    }
    return (SUCCESS);
}



do_show_per_modeler(display_function, modeler_name)
long (*display_function) ();
char *modeler_name;

{
    long status;
    int severity;
    char *message;

    status = lm_select_modeler(modeler_name);
    if (status == LM_ERROR) {
        (void) printf("%s: Modeler \"%s\" unavailable: ", error_prefix, modeler_name);
        do {
            lm_get_message(&severity, &message);
            if ((severity == LM_ERROR) || (severity == LM_WARNING)) {
                (void) printf("%s\n", message);
            }
        } while (severity != LM_NO_MORE_MESSAGES);
    } else {
        (*display_function) (modeler_name);
    }

    return (status);
}



display_modeler(modeler_name)
char *modeler_name;

{
    char buffer[128];
    long total_modeler_memory, total_pattern_memory, memory_used;
    long avail_modeler_memory, avail_pattern_memory;
    long number_of_users;
    long number_of_lanes, number_of_slots;
    long number_of_pacs, number_of_pams;
    long number_of_pels, number_of_dabs, active_instances;
    long active_faults, rev_no;
    long status;
    char b1[10], b2[10], b3[10], b4[10], b5[10];
    ID_PROM_CPU cpu_id_struct;
    BOOT_STRUCT     boot_save;

    LM_CHECK(lm_inquire_modeler
             (LM_TOTAL_MODELER_MEMORY, &total_modeler_memory));
    LM_CHECK(lm_inquire_modeler
             (LM_TOTAL_PATTERNS, &total_pattern_memory));
    LM_CHECK(lm_inquire_modeler
             (LM_AVAILABLE_MODELER_MEMORY, &avail_modeler_memory));
    LM_CHECK(lm_inquire_modeler
             (LM_AVAILABLE_PATTERNS, &avail_pattern_memory));
    LM_CHECK(lm_inquire_modeler
             (LM_NUMBER_OF_USERS, &number_of_users));
    LM_CHECK(lm_inquire_modeler
             (LM_NUMBER_OF_LANES, &number_of_lanes));
    LM_CHECK(lm_inquire_modeler
             (LM_NUMBER_OF_SLOTS_PER_LANE, &number_of_slots));
    LM_CHECK(lm_inquire_modeler
             (LM_NUMBER_OF_PACS, &number_of_pacs));
    LM_CHECK(lm_inquire_modeler
             (LM_NUMBER_OF_PAMS, &number_of_pams));
    LM_CHECK(lm_inquire_modeler
             (LM_NUMBER_OF_PELS, &number_of_pels));
    LM_CHECK(lm_inquire_modeler
             (LM_NUMBER_OF_DABS, &number_of_dabs));
    LM_CHECK(lm_inquire_modeler
```

Copyright 1989 Logic Modeling Systems

| SOURCE PROGRAM | DATE | PAGE # |
|---|---|---|
| lm/display.c | 5/23/89 TIME 1:20:34 pm | 4/17 |

LINE # SOURCE TEXT

```
            (LM_NUMBER_OF_ACTIVE_INSTANCES, &active_instances));
    LM_CHECK(lm_inquire_modeler
            (LM_NUMBER_OF_ACTIVE_FAULTS, &active_faults));
    LM_CHECK(lm_inquire_modeler
            (LM_SOFTWARE_REVISION_NUMBER, &rev_no));

    LM_CHECK(lm_read(modeler_name, (u_long) LM_NVSRAM_MEMORY,
                (u_long) 0, (u_long) 0, (u_long) sizeof(BOOT_STRUCT),
                (char *) &boot_save, &status));

    read_every_forth_byte(modeler_name, (u_long) CPU_ID_PROM,
                    (char *) &cpu_id_struct, (u_long) sizeof(cpu_id_struct));

    memory_used = total_modeler_memory - avail_modeler_memory;

    total_modeler_memory = (total_modeler_memory + (MEGABYTE / 2)) / MEGABYTE;
    avail_modeler_memory = (avail_modeler_memory + (MEGABYTE / 2)) / MEGABYTE;

    (void) printf("\n");
    (void) printf("\"%s\" LM-1000 Configuration \n", modeler_name);
    (void) printf("\n");
    (void) printf(fmt1, "Module", "Quantity", "Lane A", "Lane B", "Lane C", "Lane D");
    (void) printf("\n");
    (void) printf(fmt1, "CPU", "1 ", dash, dash, dash, dash);
    (void) sprintf(buffer, "CPU Memory Used (%ldMB total)", total_modeler_memory);
    (void) printf(fmt1, buffer, string_it(memory_used, b1, 6), dash, dash, dash, dash);
    (void) printf(fmt1, "Timing Generator", "1 ", dash, dash, dash, dash);

    /* Determine number of PACs per lane */
    {
        long pac[4], small_lane_pams[4], medium_lane_pams[4], lane_mem[4], lane_avail[4], used[4];
        long i, j, size, has_a_pac, small_pams, medium_pams, num_pams;

        size = 0;
        has_a_pac = 0;
        small_pams = 0;
        medium_pams = 0;
        num_pams = 0;

        for (i = 0; i < number_of_lanes; i++)
            pac[i] = small_lane_pams[i] = medium_lane_pams[i] =
              lane_mem[i] = lane_avail[i] = used[i] = 0;

        for (i = 0; i < number_of_lanes; i++) {
            LM_CHECK(lm_inquire_lane(i, LM_IS_LANE_USABLE, &has_a_pac));
            if (LM_TRUE == has_a_pac) {
                pac[i] = 1;
                LM_CHECK(lm_inquire_lane(i, LM_NUMBER_OF_PAMS, &num_pams));
                for (j = 0; j < num_pams; j++) {
                    LM_CHECK(lm_inquire_pam(i, j, LM_PAM_MEMORY_SIZE, &size));
                    if ((128 * 1024) == size) {
                        small_pams += size;
                        small_lane_pams[i]++;
                    }
                    if ((512 * 1024) == size) {
                        medium_pams += size;
                        medium_lane_pams[i]++;
                    }
                }
                LM_CHECK(lm_inquire_lane(i, LM_AVAILABLE_PATTERNS, &(lane_avail[i])));
                LM_CHECK(lm_inquire_lane(i, LM_TOTAL_PATTERNS, &(lane_mem[i])));
                lane_avail[i] += 256;
                avail_pattern_memory += 256;
                used[i] = lane_mem[i] - lane_avail[i];
            }
        }

        (void) printf(fmt2, "Pattern Controller", number_of_pacs, pac[0], pac[1], pac[2], pac[3]);
        (void) printf("\n");
        (void) printf(fmt3, "128K Fast Pattern Memory",
         string_it(small_pams, b1, 6), small_lane_pams[0], small_lane_pams[1],
                    small_lane_pams[2], small_lane_pams[3]);
        (void) printf(fmt3, "512K Fast Pattern Memory",
                    string_it(medium_pams, b1, 6), medium_lane_pams[0], medium_lane_pams[1],
                    medium_lane_pams[2], medium_lane_pams[3]);
        (void) printf(fmt1, "Total Pattern Memory",
                    string_it(total_pattern_memory, b1, 6),
                    string_it(lane_mem[0], b2, 6),
                    string_it(lane_mem[1], b3, 6),
                    string_it(lane_mem[2], b4, 6),
                    string_it(lane_mem[3], b5, 6));
        (void) printf("\n");
        (void) printf(fmt1, "Pattern Memory Available",
                    string_it(avail_pattern_memory, b1, 6),
                    string_it(lane_avail[0], b2, 6),
                    string_it(lane_avail[1], b3, 6),
                    string_it(lane_avail[2], b4, 6),
                    string_it(lane_avail[3], b5, 6));
        (void) printf(fmt1, "Pattern Memory Allocated", blank,
                    string_it(used[0], b1, 6), string_it(used[1], b2, 6),
                    string_it(used[2], b3, 6), string_it(used[3], b4, 6));
    }

    {
        long instances[4], faults[4], pels[4];
        long i, has_a_pac;

        for (i = 0; i < number_of_lanes; i++) {
            instances[i] = faults[i] = pels[i] = 0;
        }

        for (i = 0; i < number_of_lanes; i++) {
            LM_CHECK(lm_inquire_lane(i, LM_IS_LANE_USABLE, &has_a_pac));
            if (LM_TRUE == has_a_pac) {
                LM_CHECK(lm_inquire_lane(i, LM_NUMBER_OF_PELS, &(pels[i])));
            }
        }

        (void) instances_per_lane(instances, faults);
        (void) printf("\n");
        (void) printf(fmt3, "Number of Simulator Instances", blank,
                    instances[0], instances[1], instances[2], instances[3]);
        (void) printf(fmt3, "Number of Simulator Faults", blank,
                    faults[0], faults[1], faults[2], faults[3]);
        (void) printf(fmt2, "Pin Electronics Modules",
                    number_of_pels, pels[0], pels[1], pels[2], pels[3]);
        (void) printf("\n");
    }

    {
```

Copyright 1989 Logic Modeling Systems

LINE # SOURCE TEXT

```
        char **list_of_host_names, **list_of_user_names;
        long number_of_users;
        long *list_of_users;
        long i, real_users;

        real_users = 0;

        (void) printf(" Active Users: ");

        LM_CHECK(lm_inquire_user_list(&number_of_users, &list_of_users,
                                      &list_of_host_names, &list_of_user_names));

        for (i = 0; i < number_of_users; i++, list_of_host_names++, list_of_user_names++) {
            if ((strlen(*list_of_user_names) > 0) && (strlen(*list_of_host_names) > 0)) {
                (void) printf(" %s@%s ", *list_of_user_names, *list_of_host_names);
                real_users++;
                if (0 == ((real_users) % 4))
                    (void) printf("\n                ");
            }
        }

        if (0 != ((real_users) % 4))
            (void) printf("\n");
    }


    {   extern char *lmsi_version;
        char    modeler_string[100];
        long    status;
        unsigned long   version_address;

        status = lm_inquire_modeler(LM_GET_VERSION_STRING_ADDR, &version_address);
        if (status == LM_SUCCESS) {
                (void) lm_check(lm_read(modeler_name, (u_long) LM_MODELER_MEMORY,
                          (u_long) 0, (u_long) version_address, (u_long) 100,
                          (char *) modeler_string, &status));
               modeler_string[99] = '\0';  /* Make sure you null terminate string, just in case we read trash! */
        } else {
               strcpy (modeler_string, "");
        }

        (void) printf("\n");
        (void) printf(" LM-1000 Core Modeler Code Version: %s \n", extract_version(modeler_string));
        (void) printf(" LM-1000 Host Resident Code Version: %s \n", extract_version(lmsi_version));
    }

    if (boot_save.autoboot) {
        char    buffer[max_str];

        (void) printf(" Modeler is configured to autoboot from %s (%s) \n",
                             boot_host(boot_save.host_internet_address),
                             string_internet(boot_save.host_internet_address, buffer));
    } else {
        (void) printf(" Modeler is configured for manual boot \n");
    }

    (void) printf ("\n");
    return (SUCCESS);
}



char *
string_internet(internet_address, buffer)
        unsigned long   internet_address;
        char            *buffer;

{       char    *string_internet_address;

        internet_address = htonl(internet_address);

        string_internet_address = buffer;

        (void) sprintf(string_internet_address, "%d.%d.%d.%d",
                ((0xFF000000 & internet_address) >> 24),
                ((0x00FF0000 & internet_address) >> 16),
                ((0x0000FF00 & internet_address) >> 8),
                ((0x000000FF & internet_address) >> 0));
        return (string_internet_address);

}


char *
extract_version(lmsi_version)
        char    *lmsi_version;

{       char    *s, *t;

        if ((NULL == lmsi_version) || (0 == strlen(lmsi_version)))
                return ("PRE-R1.0 ");

        if (0 == (s = strrchr(lmsi_version, ';')))
                return ("unkmown version ");

        /*  remove all non-printing characters, (there shouldn't be,     */
        /*  but just in case we got trash from the modeler)              */

        t = s;
        while (*t) {
                if (!(isprint(*t)))
                        *t = '.';
                t++;
        }

        return (s+1);
}


char *
boot_host(internet_address)
        unsigned long   internet_address;

{       struct  hostent *host_entry;

        host_entry = gethostbyaddr ((char *) &internet_address, 4, AF_INET);
        if (NULL == host_entry) {
               return("<unkmown host>");
        }
        return (host_entry->h_name);
```

Copyright 1989
Logic Modeling Systems

| SOURCE PROGRAM | DATE | 5/23/89 | PAGE # |
|---|---|---|---|
| lm/display.c | TIME | 1:20:34 pm | 6/19 |

LINE # SOURCE TEXT

```
}



void
read_every_forth_byte(modeler_name, address, buffer, size)
        char    *modeler_name;
        u_long  address;
        char    *buffer;
        u_long  size;

{       int     i;
        long    status;

        for (i = 0; i < size; i++) {
                (void) lm_check(lm_read(modeler_name, (u_long) LM_MODELER_MEMORY,
                         (u_long) 0, (u_long) address, (u_long) 1,
                         (char *) buffer + i, &status));
                address += 4;
        }
}



char *
string_it(value, buffer, size)
        long    value;
        char    *buffer;
        short   size;

{       long    n;
static  char    suffix[] = " KMGT*";
        char    temp_buffer[max_str];

        n = 0;

        if (value>1023) {
                value = (value + 512)/1024;
                n++;
        }

        if ((0 != value) && (0 == value%1024)) {
                value = (value + 512)/1024;
                n++;
        }

        (void) sprintf(temp_buffer, "%ld%c", value, suffix[n]);

        if (strlen(temp_buffer) > size)
                (void) strcpy (buffer, "*");
        else
                (void) strcpy(buffer, temp_buffer);

        return (buffer);
}



instances_per_lane(instances, faults)
        long    instances[];
        long    faults[];

{
    long i, j, k;
    long number_of_devices, *list_of_device_numbers;
    long inst, flts, dabs, device_number, locs, *lanes, *slots;
    char **list_of_device_names;

    for (i = 0; i < 4; i++) {
        instances[i] = 0;
        faults[i] = 0;
    }

    LM_CHECK(lm_inquire_device_list(&number_of_devices, &list_of_device_numbers, &list_of_device_names));

    for (i = 0; i < number_of_devices; i++) {
        device_number = list_of_device_numbers[i];
        LM_CHECK(lm_inquire_device(device_number, LM_NUMBER_OF_ACTIVE_INSTANCES, &inst));
        LM_CHECK(lm_inquire_device(device_number, LM_NUMBER_OF_ACTIVE_FAULTS, &flts));
        LM_CHECK(lm_inquire_device(device_number, LM_NUMBER_OF_DABS, &dabs));
        for (j = 0; j < dabs; j++) {
            LM_CHECK(lm_inquire_dab_location(device_number, j, &locs, &lanes, &slots));
            for (k = 0; k < locs; k++) {
                instances[lanes[k]] += inst;
                faults[lanes[k]] += flts;
            }
        }
    }
    return (SUCCESS);
}



display_logic_models(modeler_name)
char modeler_name[];

{
    char locations[80], *c;
    long number_of_devices, *list_of_device_numbers;
    char **list_of_device_names;
    char *ret_string;
    printline *device_array;
    long dev_status;
    long active_i;
    long active_f;
    char dab_type[80];
    char dab_rev[80];
    char mfr[80];
    long locs, *lanes, *slots;
    long i, j;
    long device_number;

    /* for each modeler */

    (void) printf("\n");
    (void) printf("\"%s\" LM-1000 Logic Models \n", modeler_name);
    (void) printf("\n");
    (void) printf(fmt4, "Logic Model", "Lanes", "Device", "  Simulator", "Adapter", "Dev.", "Rev.");
    (void) printf(fmt4, blank,          blank,  "Status", "  Instances", "Type",    blank,  blank);
```

Copyright 1989 Logic Modeling Systems

LINE # SOURCE TEXT

```
        (void) printf("\n");

        LM_CHECK(lm_inquire_device_list(&number_of_devices,
                                &list_of_device_numbers, &list_of_device_names));

        if (number_of_devices == 0) {
            (void) printf(" No devices installed \n");
            return SUCCESS;
        }
        device_array = (printline *) malloc ((unsigned int) number_of_devices * sizeof(printline));

        for (i = 0; i < number_of_devices; i++) {
            device_number = list_of_device_numbers[i];
            LM_CHECK_TO(log_mod_cleanup, lm_inquire_device(device_number,
                                                LM_DEVICE_STATUS, &dev_status));
            LM_CHECK_TO(log_mod_cleanup, lm_inquire_device(device_number,
                                    LM_NUMBER_OF_ACTIVE_INSTANCES, &active_i));
            LM_CHECK_TO(log_mod_cleanup, lm_inquire_device(device_number,
                                        LM_NUMBER_OF_ACTIVE_FAULTS, &active_f));
            LM_CHECK_TO(log_mod_cleanup, lm_inquire_dab(device_number,
                                            (long) 0, LM_DAB_TYPE, &ret_string));
            (void) strcpy(dab_type, ret_string);
            LM_CHECK_TO(log_mod_cleanup, lm_inquire_dab(device_number,
                                (long) 0, LM_DAB_MAKER_REVISION, &ret_string));
            (void) strcpy(dab_rev, ret_string);
            LM_CHECK_TO(log_mod_cleanup, lm_inquire_dab(device_number,
                                            (long) 0, LM_DAB_MAKER, &ret_string));
            (void) strcpy(mfr, ret_string);
            LM_CHECK_TO(log_mod_cleanup,
                    lm_inquire_dab_location(device_number,
                                            (long) 0, &locs, &lanes, &slots));
            c = locations;
            for (j = 0; j < locs; j++) {
                *c++ = 'A' + lanes[j];
                *c++ = '0' + slots[j];
                if (j < locs - 1)
                    *c++ = ',';
            }
            *c = '\0';
            (void) sprintf((char *) (device_array + i), fmt5, *list_of_device_names++,
                    locations,
                    (dev_status == LM_PRIVATE) ? "PRIVATE" : "PUBLIC",
                    active_i, active_f, dab_type, mfr, dab_rev);
        }

#ifndef VMS
        qsort((char *) device_array, (int) number_of_devices, sizeof(printline), str_cmp);
#else
        vms_qsort((char *) device_array, (int) number_of_devices, sizeof(printline), vms_str_cmp);
#endif

        for (i = 0; i < number_of_devices; i++) {
            (void) printf("%s", device_array + i);
        }

log_mod_cleanup:
        (void) printf("\n");
        free((char *) device_array);

        return (SUCCESS);
}



#define LANE_OFFSET     0x80000000
#define PAM_SIZE        0x00000100
#define PEL_SIZE        0x00001000
#define PEL_OFFSET      0x0D000000

display_version(modeler_name)
char *modeler_name;

{
        (void) printf("\n");
        (void) printf("\n");
        (void) printf("\"%s\" LM-1000 Versions \n", modeler_name);
        (void) printf("\n");
        LM_CHECK(lm_select_modeler(modeler_name));

        (void) printf(" Module                                            Board ID  Revision \n");
        (void) printf("\n");


        if (FAILURE == display_cpu_revision(modeler_name))
            return (FAILURE);
        if (FAILURE == display_tmg_revision(modeler_name))
            return (FAILURE);

        (void) printf("\n");
        if (FAILURE == display_pac_revisions(modeler_name))
            return (FAILURE);

        (void) printf("\n");
        if (FAILURE == display_pam_revisions(modeler_name))
            return (FAILURE);

        (void) printf("\n");
        if (FAILURE == display_pel_revisions(modeler_name))
            return (FAILURE);

        (void) printf("\n");

        return (SUCCESS);
}



display_cpu_revision(modeler_name)
char *modeler_name;

{
        ID_PROM_CPU cpu_id_struct;

        read_every_forth_byte(modeler_name, (u_long) CPU_ID_PROM,
                        (char *) &cpu_id_struct, (u_long) sizeof(cpu_id_struct));

        if (ID_CHECKSUM_GOOD == id_checksum((u_char *) & cpu_id_struct)) {
            (void) printf(" CPU                                         %-4d    %4s \n",
                        cpu_id_struct.generic.board_type,
                          create_revision (cpu_id_struct.generic.revision, cpu_id_struct.generic.eco_level));
```

Copyright 1989 Logic Modeling Systems

| SOURCE PROGRAM | DATE | PAGE # |
|---|---|---|
| lm/display.c | 5/23/89 | 8/21 |
| | TIME 1:20:34 pm | |

LINE # SOURCE TEXT

```
    } else {
        (void) printf(" CPU                                  --- ID PROM READ ERROR --- \n");
    }

    return (SUCCESS);
}



display_tmg_revision(modeler_name)
char *modeler_name;

{
    ID_PROM_TMG tmg_id_struct;

    read_every_forth_byte(modeler_name, (u_long) TMG_ID_PROM,
                (char *) &tmg_id_struct, (u_long) sizeof(tmg_id_struct));

    if (ID_CHECKSUM_GOOD == id_checksum((u_char *) & tmg_id_struct)) {
        (void) printf(" Timing Generator                     %-4d    %4s \n",
            tmg_id_struct.generic.board_type,
                create_revision (tmg_id_struct.generic.revision, tmg_id_struct.generic.eco_level));
    } else {
        (void) printf(" Timing Generator                     --- ID PROM READ ERROR --- \n");
    }

    return (SUCCESS);
}



display_pac_revisions(modeler_name)
char *modeler_name;

{
    long lane;
    long number_of_lanes;
    long has_a_pac;
    ID_PROM_PAC pac_id_struct;

    LM_CHECK(lm_inquire_modeler(LM_NUMBER_OF_LANES, &number_of_lanes));

    for (lane = 0; lane < number_of_lanes; lane++) {

        LM_CHECK(lm_inquire_lane(lane, LM_IS_LANE_USABLE, &has_a_pac));

        if (LM_TRUE == has_a_pac) {

            read_every_forth_byte(modeler_name, (u_long) LANE_A_PAC_ID_PROM + LANE_SIZE * lane,
                    (char *) &pac_id_struct, (u_long) sizeof(pac_id_struct));
            if (ID_CHECKSUM_GOOD == id_checksum((u_char *) & pac_id_struct)) {
                (void) printf(" Pattern Controller, Lane %c          %-4d    %4s  \n",
                        lane + 'A', pac_id_struct.generic.board_type,
                    create_revision (pac_id_struct.generic.revision, pac_id_struct.generic.eco_level));
            } else {
                (void) printf(" Pattern Controller, Lane %c          --- ID PROM READ ERROR --- \n",
                        lane + 'A');
            }
        }
    }

    return (SUCCESS);
}



display_pam_revisions(modeler_name)
char *modeler_name;

{
    long lane;
    long number_of_lanes;
    long pams, pam, has_a_pac;
    long pam_size;
    char b[10];
    ID_PROM_PAM pam_id_struct;

    LM_CHECK(lm_inquire_modeler(LM_NUMBER_OF_LANES, &number_of_lanes));

    for (lane = 0; lane < number_of_lanes; lane++) {

        LM_CHECK(lm_inquire_lane(lane, LM_IS_LANE_USABLE, &has_a_pac));

        if (LM_TRUE == has_a_pac) {

            LM_CHECK(lm_inquire_lane(lane, LM_NUMBER_OF_PAMS, &pams));

            for (pam = 0; pam < pams; pam++) {

                LM_CHECK(lm_inquire_pam(lane, pam, LM_PAM_MEMORY_SIZE, &pam_size));
                read_every_forth_byte(modeler_name, (u_long) LANE_A_PAM_ID_PROM + LANE_SIZE * lane + PAM_SIZE
                                * pam,
                    (char *) &pam_id_struct, (u_long) sizeof(pam_id_struct));
                if (ID_CHECKSUM_GOOD == id_checksum((u_char *) & pam_id_struct)) {
                    (void) printf(" %s Fast Pattern Memory, Lane %c strap %d      %-4d    %4s \n",
                            string_it(pam_size, b, 4), lane + 'A', pam, pam_id_struct.generic.board_type,
                        create_revision (pam_id_struct.generic.revision, pam_id_struct.generic.eco_level));
                } else {
                    (void) printf(" %s Fast Pattern Memory, Lane %c strap %d--- ID PROM READ ERROR --- \n",
                            string_it(pam_size, b, 4), lane + 'A', pam);
                }
            }
        }
    }

    return (SUCCESS);
}



display_pel_revisions(modeler_name)
char *modeler_name;

{
    long lane;
    long slot;
    long number_of_slots;
    long number_of_lanes;
    long has_a_pac;
```

Copyright 1989
Logic Modeling Systems

| SOURCE PROGRAM | DATE | 5/23/89 | PAGE # |
|---|---|---|---|
| lm/display.c | TIME | 1:20:34 pm | 9/22 |

LINE # SOURCE TEXT

```
    long has_a_pel;
    ID_PROM_PEL pel_id_struct;

    LM_CHECK(lm_inquire_modeler(LM_NUMBER_OF_LANES, &number_of_lanes));
    LM_CHECK(lm_inquire_modeler(LM_NUMBER_OF_SLOTS_PER_LANE, &number_of_slots));

    for (lane = 0; lane < number_of_lanes; lane++) {

        LM_CHECK(lm_inquire_lane(lane, LM_IS_LANE_USABLE, &has_a_pac));

        if (LM_TRUE == has_a_pac) {
            for (slot = 0; slot < number_of_slots; slot++) {

                LM_CHECK(lm_inquire_pel(lane, slot, LM_DOES_PEL_EXIST, &has_a_pel));

                if (LM_TRUE == has_a_pel) {

                    read_every_forth_byte(modeler_name, (u_long) PEL_ID_PROM + LANE_OFFSET + PEL_OFFSET
                                           +
                                           LANE_SIZE * lane + PEL_SIZE * slot,
                     (char *) &pel_id_struct, (u_long) sizeof(pel_id_struct));
                    if (ID_CHECKSUM_GOOD == id_checksum((u_char *) & pel_id_struct)) {
                        (void) printf(" Pin Electronics Module, Lane %c Slot %d        %-4d    %4s \n",
                          lane + 'A', slot, pel_id_struct.generic.board_type,
                        create_revision (pel_id_struct.generic.revision, pel_id_struct.generic.eco_level));
                    } else {
                        (void) printf(" Pin Electronics Module, Lane %c Slot %d   --- ID PROM READ ERROR --- \n",
                                  lane + 'A', slot);
                    }
                }
            }
        }
    }

   return (SUCCESS);
}


static char *
create_revision(revision, eco_level)
        unsigned char   revision;
        unsigned char   eco_level;
{

        static  char     buffer[10];
        char    eco_str[10];

        if ((eco_level >= ID_MIN_ECO) && (eco_level <= ID_MAX_ECO))
                (void) sprintf(eco_str, "%d", eco_level);
        else
                (void) sprintf(eco_str, "%c", eco_level);

        (void) sprintf (buffer, "%c%s", revision, eco_str);

        return(buffer);
}


id_checksum(address)
u_char *address;
{
    register long checksum;
    register u_long byte_count;

    checksum = ID_CHECKSUM_INIT;

    for (byte_count = 0; byte_count < ID_NUM_BYTES; byte_count++) {
        checksum = (checksum << 1) + ((checksum & 0x80) >> 7);
        checksum += *(address + byte_count);
        checksum &= 0xFF;
    }
    return (checksum);
}



#ifdef VMS

extern  int     SOR$M_STABLE, SOR$M_NOSIGNAL;

vms_qsort (base, elements, size, comparison)
        char    *base;
        int     elements;
        int     size;
        int     (*comparison)();
{

        long    sort_status;
        int     i;
        long    context;
        short   length;
        char    *current_record;
        struct  dsc$descriptor  data_descriptor;
        short   short_size;
        long    flags;
        long    file_blocks;
        char    num_files;

        num_files = 2;
        file_blocks = 100;
        flags = 0;
        short_size = size;
        current_record = base;
        context = 0;
        length = size - 1;
        flags = SOR$M_STABLE + SOR$M_NOSIGNAL;

        data_descriptor.dsc$w_length = size;
        data_descriptor.dsc$b_dtype = DSC$K_DTYPE_Z;
        data_descriptor.dsc$b_class = DSC$K_CLASS_S;

        sort_status = SOR$BEGIN_SORT(0, &short_size, &flags,
                        &file_blocks, comparison, 0, 0, &num_files, &context);

        for (i=0; i<elements; i++) {
                data_descriptor.dsc$a_pointer = current_record;
                sort_status = SOR$RELEASE_REC (&data_descriptor, &context);
                current_record += size;
        }
```

000045

Copyright 1989
Logic Modeling Systems

| SOURCE PROGRAM | DATE | 5/23/89 | PAGE # |
|---|---|---|---|
| lm/display.c | TIME | 1:20:34 pm | 10/23 |

SOURCE TEXT

```
        sort_status = SOR$SORT_MERGE (&context);

        current_record = base;

        for (i=0; i<elements; i++) {
                data_descriptor.dsc$a_pointer = current_record;
                sort_status = sor$return_rec (&data_descriptor, &length, &context);
                current_record += size;
        }

        sort_status = SOR$END_SORT (&context);
}


vms_str_cmp (s1, s2, l1, l2, context)   /* must be called by vms_qsort() */
        char    *s1, *s2;
        int     l1, l2, context;
{
        if (str_cmp (s1, s2) < 0) return (-1);
        if (str_cmp (s1, s2) > 0) return (1);
        return(0);
}

#endif
```

Copyright 1989 Logic Modeling Systems

HEADER FILE lm/help.h | DATE 5/23/89 | TIME 1:20:35 pm | PAGE # 1/24

HEADER TEXT

```
/* SCCS_ID: help.h rev 3.1, 4/24/89 at 07:51:56 */

/* help file for the menu based utilities */

/*
 * All single quotes have been removed from this file.
 * The Apollo SYS5 compiler/preprocessor has a bug in its
 * handling of single quotes in some double-quoted strings.
 * Their removal is really only bad in two places: where
 * ownership is represented by an "'s". ld_help and in_help
 * are the two cases of this. I guess that's life in the
 * portable code world.
 */

static char    ld_help[] =

"This function labels a Device Adapter with the device name \n\
to be used for a custom Logic Model.  The device name must \n\
exactly match the \"device_name\" used in the Logic Model \n\
Shell Software.  The function will prompt for the following \n\
information: \n\
\n\
          Modeler Name -  the name of the modeler where \n\
                          the Device Adapter is installed. \n\
\n\
          Lane (A - D) -  the lane where the Device Adapter \n\
                          is installed. \n\
\n\
          Slot (0 - 7) -  the slot where the Device Adapter \n\
                          is installed. \n\
\n\
          Device Name  -  the name of the model device mounted on \n\
                          the Device Adapter. \n\
\n\
          Model Developer - the name of the company or person \n\
                            that developed the Logic Model. \n\
\n\
          Model Revision - the revision number of the Logic Model. \n\
";

static char    cs_help[] =

"This function performs a syntax check on the specified \n\
Shell Software, and returns a list of any errors encountered \n\
while attempting to parse the Shell Software.  It will \n\
prompt for the following information: \n\
\n\
          Model File (xxx.MDL) - the name of the file which \n\
                          contains the Shell Software to be checked. \n\
";

static char    ct_help[] =

"This function creates a timing (.TMG) file, which is suitable for \n\
usage as Shell Software, from timing measurement output file(s).  \n\
It will prompt for the following information: \n\
\n\
          TIM File(s)  - a list of one or more timing measurement \n\
                         output files, separated by commas or spaces. \n\
\n\
          TMG File     - the name of the resulting Shell Software \n\
                         timing file. \n\
\n\
          Combine Bus Delays - yes or no.  Combining bus delays \n\
                         combines the measured delays for all pin \n\
                         names which have the same prefix \n\
                         (e.g. data0 through data31). \n\
";

static char    pv_help[] =

"This function presents test vectors to a specified device \n\
from a test vector file.  Any discrepancies between the measured \n\
output and the expected results (specified in the vector file) \n\
are reported.  The function will prompt for the following \n\
information: \n\
\n\
          Model File (xxx.MDL) - the name of the file which \n\
                         contains the Shell Software for the \n\
                         device to be tested. \n\
\n\
          Vector File (xxx.TST) - the name of the file which \n\
                         contains the test vectors. \n\
\n\
          Output File (xxx.OUT) - the name of the file in which  \n\
                         to log any discrepancies detected while \n\
                         playing the vectors to the device.  If no \n\
                         file name is specified, the discrepancies \n\
                         are displayed on the screen. \n\
\n\
";

static char    mt_help[] =

"This function measures the actual propagation delays on a \n\
Logic Model device.  It presents test vectors to the specified \n\
device from a test vector file, and measures the resulting output \n\
pin delays.  These delays are stored in a timing measurement output \n\
file.  The function will prompt for the following information: \n\
\n\
          Model File (xxx.MDL) - the name of the file which \n\
                         contains the Shell Software for the \n\
                         device to be measured. \n\
\n\
          Vector File (xxx.TST) - the name of the file which \n\
                         contains the device test vectors. \n\
\n\
          Timing File (xxx.TIM) - the name of the file in which \n\
                         to log the measured delays. \n\
\n\
          Output File (xxx.OUT) - the name of the file in which \n\
                         to log any discrepancies detected while \n\
                         playing vectors to the device.  If no \n\
                         file name is specified, the discrepancies \n\
                         are displayed on the screen. \n\
";

static char    fm_help[] =

"This function is used to locate modeler files.  The \n\
```

| Copyright 1989 Logic Modeling Systems | HEADER FILE lm/help.h | DATE 5/23/89 TIME 1:20:35 pm | PAGE # 2/25 |
|---|---|---|---|

LINE # HEADER TEXT

```
function searches the LM_DIR and LM_LIB paths for a given\n\
filename.  If the file is found, the full pathname of the file \n\
is printed; if not found, an error message is displayed.  The \n\
function will prompt for the following information:\n\
\n\
        File Name -     the name of the file to be located.  \n\
                        NOTE: Wildcard characters are not allowed \n\
                        as part of the filename.\n\
";


static  char    in_help[] =

"This function is used to install a modeler.  It stores the \n\
modeler boot information in the non-volatile RAM in the modeler. \n\
The function will prompt for the following information: \n\
\n\
        Modeler Name - the name of the modeler to be \n\
                       installed. \n\
\n\
        Autoboot -     yes or no.  If set to \"yes\" the modeler \n\
                       will initiate the boot process, otherwise \n\
                       the modeler must be manually booted using \n\
                       Boot Modeler. \n\
\n\
        Boot Host Name - the name of the host computer to send \n\
                       autoboot requests.  The specified host must \n\
                       be running the lmdaemon program. \n\
";

static  char    bt_help[] =

"This function manually boots the modeler by downloading the \n\
Core Modeler Code files to the modeler.  It will prompt for the \n\
following information: \n\
\n\
        Modeler Name - the name of the modeler to be \n\
                       booted. \n\
";

static  char    sh_help[] =

"This function performs an orderly shutdown of the specified \n\
modeler.  The modeler will remain down until it is manually \n\
rebooted.  The function will prompt for the following information: \n\
\n\
        Modeler Name - the name of the modeler to be \n\
                       shut down. \n\
\n\
        Wait -         if there are other users on the \n\
                       system, enter \"yes\" to wait for all \n\
                       current simulation sessions to complete.\n\
\n\
        Minutes -      number of minutes to wait before \n\
                       shutting down the modeler. \n\
";

static  char    rb_help[] =

"This function reboots the specified modeler. It will prompt \n\
for the following information: \n\
\n\
        Modeler Name - the name of the modeler to be \n\
                       rebooted. \n\
\n\
        Wait -         if there are other users on the \n\
                       system, enter \"yes\" to wait for all \n\
                       current simulation sessions to complete.\n\
\n\
        Minutes -      number of minutes to wait before \n\
                       rebooting the modeler. \n\
\n\
";

static  char    sb_help[] =

"This function sets the baud rate for either the console \n\
port or the modem port.  It displays a menu which allows \n\
the selection of the port and baud rate. \n\
";

static  char    st_help[] =

"This function sets the inactive process timeout period on \n\
the modeler.  If a process on the modeler performs no activity \n\
for this period of time, the modeler will attempt to determine \n\
if the corresponding host process is still running.  If the host \n\
process is no longer running then the process on the modeler \n\
is aborted.  The function will prompt for the following: \n\
\n\
        Modeler Name - the name of the modeler on which to set \n\
                       the timeout.  \n\
\n\
        Minutes      - the number of minutes that a process \n\
                       may be inactive before it is cleared. \n\
";

static  char    au_help[] =

"This function aborts the specified modeler process.  It will \n\
prompt for the following information: \n\
\n\
        Modeler Name - the name of the modeler on which to \n\
                       abort the process.  \n\
\n\
        User Number  - the user number of the process to be  \n\
                       deleted.  This number can be determined \n\
                       using \"Show Users\". \n\
";

static  char    pw_help[] =

"This function sets/modifies the modeler password which \n\
protects utility functions which may affect other modeler users. \n\
It will prompt for the following information:\n\
\n\
        Modeler Name - the name of the modeler on which to \n\
                       set/modify the password.  \n\
\n\
        Enter OLD Modeler Password - the old modeler password.\n\
```

Copyright 1989 Logic Modeling Systems

| HEADER FILE | DATE 5/23/89 | PAGE # |
|---|---|---|
| lm/help.h | TIME 1:20:35 pm | 3/26 |

LINE # HEADER TEXT

```
                        The password will not be echoed to the \n\
                        screen.  If there was no password, enter \n\
                        a carriage return.\n\
\n\
        Enter NEW Modeler Password - the new modeler password. \n\
                        To disable password protection, enter \n\
                        a carriage return.\n\
\n\
        Repeat NEW Modeler Password - repeat the new modeler \n\
                        password to verify that the password was \n\
                        entered correctly.\n\
";



static  char    cl_help[] =

"This selection presents a menu of functions used to create \n\
Logic Models.  These functions include Device Adapter labeling \n\
and Shell Software syntax checking. \n\
";

static  char    vl_help[] =

"This selection presents a menu of functions used to verify \n\
the integrity of existing Logic Models.  These functions include \n\
playing test vectors and measuring device timing. \n\
";

static  char    pm_help[] =

"This selection presents a menu of functions used to perform \n\
modeler management.  These functions include booting, configuration,\n\
and installation of the modeler. \n\
";

static  char    mc_help[] =

"This selection presents a menu of functions used to display \n\
various modeler configuration and usage information. \n\
";

static  char    rd_help[] =

"This function boots and executes the modeler diagnostics.  The \n\
diagnostics exercise the hardware to assist in isolating \n\
hardware related problems.  The function will prompt for \n\
the following information: \n\
\n\
        Modeler Name - the name of the modeler to boot with the \n\
                        diagnostics. \n\
";

static  char    sm_help[] =

"This function displays the configuration of the modelers \n\
available on the network.  It will prompt for the following \n\
information:  \n\
\n\
        Modeler Name - the name of the modeler to be queried. \n\
                        By default, all modelers are displayed.\n\
";

static  char    sl_help [] =

"This function displays the Logic Models currently installed in \n\
a modeler.  It will prompt for the following information: \n\
\n\
        Modeler Name - the name of the modeler to be queried. \n\
                        By default, all modelers are displayed.\n\
";

static  char    su_help[] =

"This function displays information about the modeler users. \n\
It will prompt for the following information: \n\
\n\
        Modeler Name - the name of the modeler to be queried. \n\
                        By default, all modelers are displayed.\n\
";

static  char    sv_help[] =
"This function displays revision information about the boards \n\
installed in a modeler.  It will prompt for the following \n\
information: \n\
\n\
        Modeler Name - the name of the modeler to be queried. \n\
                        By default, all modelers are displayed.\n\
";
```

Copyright 1989 Logic Modeling Systems

SOURCE PROGRAM lm/hostdiag.c | DATE 5/23/89 | TIME 1:20:35 pm | PAGE # 1/27

LINE # SOURCE TEXT

```
/* SCCS_ID: hostdiag.c rev 3.1, 4/24/89 at 07:52:01 */

#include <stdio.h>
#include <sys/ioctl.h>
#include <setjmp.h>
#include <signal.h>
#include <time.h>
#include <ctype.h>
# ifdef SYS5
# include <termio.h>
# include <fcntl.h>
# endif /*SYS5*/
#include "common.h"
#include "mod_err.h"
#include "nvram.h"
#include "message.h"
#include "network.h"
#include "lm_diags.h"
#include "lm_sfi.h"
#include "lm_text.h"

extern  int     good_bye();
extern  int     lm_suspend();
extern  void    clean_input();
extern  void    get_line();
extern  char    *calloc();

extern  u_long  lm_network_timeout;
extern  u_long  lm_max_timeout_retry_attempts;

static  lm_save_timeout;
static  lm_save_retrys;
static  lm_boot_mode;

CONNECTION      *conn;
char selection_buffer[64];

#define DIAG_MAX_TRIES  30

#ifdef VMS
#define CLEANUP \
        Jmpbuf = save_jmpbuf;   \
        \
        (void) signal(SIGINT, save_intr_fn);    \
        (void) signal(SIGHUP, save_hup_fn);     \
        (void) signal(SIGTERM, save_term_fn);   \
        \
        lm_network_timeout = lm_save_timeout;   \
        lm_max_timeout_retry_attempts = lm_save_retrys;

#else
#define CLEANUP \
        Jmpbuf = save_jmpbuf;   \
        \
        (void) signal(SIGINT, save_intr_fn);    \
        (void) signal(SIGHUP, save_hup_fn);     \
        (void) signal(SIGTERM, save_term_fn);   \
        (void) signal(SIGTSTP, save_stp_fn);    \
        \
        lm_network_timeout = lm_save_timeout;   \
        lm_max_timeout_retry_attempts = lm_save_retrys; \
        \
        if (! power_up_mode) cook();

#endif
#define DIAG_CHECK(fn) \
\
        {       int     status; \
\
                status = lm_diag_check(fn); \
                if (status != SUCCESS) return(FAILURE); \
        }



lm_diagnostics(modeler_name, error_count, cmd_list, power_up_mode)
        char    *modeler_name;
        char    **cmd_list;
        int     *error_count;
        int     power_up_mode;

{       long    status;
        int     handle_intr();
#ifdef SUNOS3_5
        int     (*save_intr_fn)();
        int     (*save_hup_fn)();
        int     (*save_term_fn)();
        int     (*save_stp_fn)();
#else
        void    (*save_intr_fn)();
        void    (*save_hup_fn)();
        void    (*save_term_fn)();
        void    (*save_stp_fn)();
#endif
extern  jmp_buf *Jmpbuf;
        jmp_buf jmpbuf;
        jmp_buf *save_jmpbuf = Jmpbuf;
        int     try;
        char    *s;
        char    Host_name[32], *user_name, User_name[32];


        lm_boot_mode = power_up_mode;
        if (0 != gethostname (Host_name, sizeof(Host_name))) {
                strcpy (Host_name, "<unknown host>");
        }

        user_name = (char *) getenv ((char *) "USER");
        if (user_name)
                strcpy (User_name, user_name);
        else
                strcpy (User_name, "<unknown user>");

        conn = 0;
        if (error_count) *error_count = 0;

        if (!setjmp(jmpbuf)) {

                Jmpbuf = (jmp_buf *)jmpbuf;
                /* save interrupts and timeouts */
```

Copyright 1989 Logic Modeling Systems

| SOURCE PROGRAM | DATE | PAGE # |
|---|---|---|
| lm/hostdiag.c | 5/23/89 | 2/28 |
| | TIME 1:20:35 pm | |

SOURCE TEXT

```
                save_intr_fn  = signal (SIGINT, handle_intr);
                save_hup_fn   = signal (SIGHUP, good_bye);
                save_term_fn  = signal (SIGTERM, good_bye);
#ifndef VMS
                save_stp_fn   = signal (SIGTSTP, lm_suspend);
#endif

                lm_save_timeout = lm_network_timeout;
                lm_save_retrys  = lm_max_timeout_retry_attempts;

                if (! power_up_mode) raw ();

                conn = (CONNECTION *) calloc ((unsigned) 1, sizeof(CONNECTION));
                conn->name = modeler_name;

                (void)printf("Requesting connection...\n");

                for (try = 0; try < DIAG_MAX_TRIES; ++try) {
                        status = lm_check((int)lm_init_connection_for_client(conn));

                        if (status != SUCCESS) {
                                CLEANUP;
                                free((char *)conn);
                                return(FAILURE);
                        }

                        lm_network_timeout = 1000; /* 1 second. Lets be responsive. */
                        lm_max_timeout_retry_attempts = 1;
                        LM_CHK_PUT_LONG(conn, LM_DIAG_GIMME);
                        LM_CHK_PUT_LONG(conn, 4 + strlen(Host_name) + strlen(User_name) + 2);

                        s = User_name;
                        while (*s) {
                                LM_CHK_PUT_CHAR(conn, *s);
                                s++;
                        }
                        LM_CHK_PUT_CHAR(conn, '\0');

                        s = Host_name;
                        while (*s) {
                                LM_CHK_PUT_CHAR(conn, *s);
                                s++;
                        }
                        LM_CHK_PUT_CHAR(conn, '\0');

                        if (lm_send_request_get_reply(conn) == SUCCESS) {

                                /* connection established */

                                (void)printf("Connection established.\n");
                                (void) sprintf(selection_buffer,
                                        "%s selection: ", modeler_name);

                                lm_network_timeout = 30000; /* 30 seconds. */
                                lm_max_timeout_retry_attempts = 2000;

                                while (process_request(conn, error_count,
                                    &cmd_list, power_up_mode) == SUCCESS)
                                        ;
                                break;

                        } else {
                                lm_close_connection_for_client(conn);
                        }
                }

        } else {
                char state;
                int i;

                /* try twice to give lance a chance */
                /* (this might be right after boot up) */
                for (i = 0; i < 1; ++i) {
                        if (lm_is_modeler_alive(modeler_name, &state)
                            == LM_SUCCESS) {
                                /* only kill if running diagnostics */
                                if (state == RUNNING_DIAGS) {
                                        if (lm_remote_reset(modeler_name,
                                            &state) == LM_SUCCESS)
                                                break;
                                } else
                                        break;
                        }
                }
                if (conn) {
                        lm_close_connection_for_client(conn);
                        free((char *) conn);
                }
                CLEANUP;
#ifndef VMS
                save_intr_fn(SIGINT);
#endif
        }

        if (try == DIAG_MAX_TRIES) {
                (void) printf ("Connection failed.\n");
        } else {
                lm_close_connection_for_client(conn);
        }

        CLEANUP;

        if (conn)
                free((char *) conn);
        if (try == DIAG_MAX_TRIES) return (FAILURE);
        return(SUCCESS);
}


# ifdef SYS5
static unsigned char c_EOF , c_EOL ;
raw ( )
  { struct termio term ;
    if ( isatty ( 0 ) )
      { if ( ioctl ( 0 , TCGETA , & term ) == -1 )
          perror ( "raw stdin 1" ) ;
        term . c_lflag &= ~ICANON ;
        term . c_lflag &= ~ECHO ;
```

Copyright 1989
Logic Modeling Systems

SOURCE PROGRAM lm/hostdiag.c | DATE 5/23/89 | TIME 1:20:35 pm | PAGE # 3/29

LINE # SOURCE TEXT

```
        c_EOF = term . c_cc [ 4 ] ;
        c_EOL = term . c_cc [ 5 ] ;
        term . c_cc [ 4 ] = 1 ;
        term . c_cc [ 5 ] = 0 ;
          if ( ioctl ( 0 , TCSETA , & term ) == -1 )
            perror ( "raw stdin 2" ) ;
        }
    } /* raw */

cook ( )
  { struct termio term ;
    if ( isatty ( 0 ) )
      { if ( ioctl ( 0 , TCGETA , & term ) == -1 )
          perror ( "cook stdin 1" ) ;
        term . c_lflag |= ICANON ;
        term . c_lflag |= ECHO ;
        term . c_cc [ 4 ] = c_EOF ;
        term . c_cc [ 5 ] = c_EOL ;
        if ( ioctl ( 0 , TCSETA , & term ) == -1 )
          perror ( "cook stdin 2" ) ;
      }
  } /* cook */
# else /*SYS5*/
raw()

{       struct sgttyb tty;

#ifndef VMS

        if (isatty(0)) {
                if (ioctl(0, TIOCGETP, &tty) == -1) {
                        perror("raw stdin 1");
                }
                tty.sg_flags |= (CBREAK);
                tty.sg_flags &= ~(ECHO);
                if (ioctl(0, TIOCSETP, &tty) == -1) {
                        perror("raw stdin 2");
                }
        }

#endif

}



cook()

{       struct sgttyb tty;

#ifndef VMS

        if (isatty(0)) {
                if (ioctl(0, TIOCGETP, &tty) == -1) {
                        perror("cook stdin 1");
                }
                tty.sg_flags &= ~(CBREAK);
                tty.sg_flags |= (ECHO);
                if (ioctl(0, TIOCSETP, &tty) == -1) {
                        perror("cook stdin 2");
                }
        }

#endif

}
# endif /*SYS5*/


int
lm_suspend()
{
#ifndef VMS
        cook();

        (void) signal(SIGTSTP, SIG_DFL);

        if (sigsetmask(0) == -1) {
                perror("sigsetmask");
        }

        (void) kill (getpid(), SIGTSTP);
        (void) signal(SIGTSTP, lm_suspend);

        raw();

        return(SUCCESS);
#endif
}



static int
good_bye()

{       i_      pgrp;

#ifndef VMS
# ifdef SYS5
    if ( setpgrp ( ) == -1 )
      perror ( "setpgrp" ) ;
# else /*SYS5*/
        (void) ioctl(0, TIOCGPGRP, &pgrp);

        if (setpgrp(0, pgrp) == -1) {
            /* make sure we can cook */
            perror("setpgrp");
        }
# endif /*SYS5*/
#endif  /*VMS*/

        cook();

        (void) signal(SIGHUP, SIG_DFL);
        (void) signal(SIGINT, SIG_DFL);
        (void) signal(SIGTERM, SIG_DFL);
#ifndef VMS
        (void) signal(SIGTSTP, SIG_DFL);

        if (sigsetmask(0) == -1) {
```

Copyright 1989 Logic Modeling Systems

SOURCE PROGRAM lm/hostdiag.c

DATE 5/23/89 PAGE # 4/30

TIME 1:20:35 pm

LINE # SOURCE TEXT

```
                perror("sigsetmask");
        }
#endif  /*VMS*/

        LM_CHK_PUT_LONG(conn, LM_DIAG_[illegible]
        LM_CHK_PUT_LONG(conn, 4);
        (void)lm_check((int)lm_send_request_get_reply(conn));

        u_exit(); /* u_exit never returns, so good bye! */
}



process_request(conn, error_count, cmd_list, power_up_mode)
        CONNECTION      *conn;
        int             *error_count;
        char            ***cmd_list;
        int             power_up_mode;
{
        int     i, size, cmd;
        char    line[max_str];
        char    str[max_str];
        char    c;

        LM_CHK_PUT_LONG(conn, LM_DIAG_GIMME);
        LM_CHK_PUT_LONG(conn, 4);
        DIAG_CHECK((int)lm_send_request_get_reply(conn));

        while (1) {
                cmd = LM_GET_LONG(conn);
                size = LM_GET_LONG(conn);

                switch (cmd) {

                case LM_DIAG_GOTIT:
                        return SUCCESS;
                case LM_DIAG_SELECT:
                        if ((*cmd_list != 0) && (**cmd_list != 0)) {
                                if ((error_count) && (*error_count > 0)) {
                                        /* quit on first failure */
                                        (void) strcpy(str, "exit");
                                } else {
                                        (void) strcpy(str, *(*cmd_list)++);
                                }
                        } else {
                                get_selection (str);
                        }
                        LM_CHK_PUT_LONG(conn, LM_DIAG_SELECT);
                        LM_CHK_PUT_LONG(conn, strlen(str)+4);
                        for (i=0; i<strlen(str); i++) {
                                LM_CHK_PUT_CHAR(conn, str[i]);
                        }
                        DIAG_CHECK((int)lm_send_request_get_reply(conn));
                        break; /* process response */

                case LM_DIAG_END:
                        return FAILURE; /* end diags */

                case LM_DIAG_CHECKKEY:
                        c = key_has_been_pressed();
#ifdef VMS
                        if (c == INTR_CHARACTER) c = ctrl(X);  /* set to interrupt as modeler understands */
#endif
                        LM_CHK_PUT_LONG(conn, (c != 0)?LM_DIAG_GOTKEY:LM_DIAG_NOKEY);
                        LM_CHK_PUT_LONG(conn, 5);
                        LM_CHK_PUT_CHAR(conn, c); /* needed for ^X */
                        DIAG_CHECK((int)lm_send_request_get_reply(conn));
                        break; /* process response */

                case LM_DIAG_GETKEY:
                        c = getchar(); /* don't echo */
                        LM_CHK_PUT_LONG(conn, LM_DIAG_GETKEY);
                        LM_CHK_PUT_LONG(conn, 5);
                        LM_CHK_PUT_CHAR(conn, c);
                        DIAG_CHECK((int)lm_send_request_get_reply(conn));
                        break; /* process response */

                case LM_DIAG_GETLINE:
                        get_line(str, (long) max_str);
                        LM_CHK_PUT_LONG(conn, LM_DIAG_GETLINE);
                        LM_CHK_PUT_LONG(conn, strlen(str)+4);
                        for (i=0; i<strlen(str); i++) {
                                LM_CHK_PUT_CHAR(conn, str[i]);
                        }
                        DIAG_CHECK((int)lm_send_request_get_reply(conn));
                        break; /* process response */

                case LM_DIAG_TEST_FAILED:
                        if (error_count) {
                                ++*error_count;
                        }
                        return SUCCESS;

                default:
                        if (cmd & 1) { /* ERROR! */
                                int i;
                                char buffer[1600];
                                char *b, c;

                                /* core modeler error message */
                                for (i = 0; i < size; ++i) {
                                        switch (c = LM_GET_CHAR(conn)) {
                                        case ERROR_MSG:
                                                b = "\nError: "; break;
                                        case WARNING_MSG:
                                                b = "\nWarning: "; break;
                                        default:
                                                (void) printf("Error message type %d\n", c);
                                                return FAILURE; /* end diags */
                                        }
                                        (void) printf("%s", b);

                                        b = buffer;
                                        while ((*b++ = LM_GET_CHAR(conn)) != '\0')
                                                ;
                                        (void) printf("%s\n", buffer);
                                }
                                return FAILURE; /* end diags */
                        } else {
                                for (i=0; i<size-4; i++) {
```

Copyright 1989 Logic Modeling Systems

LINE # SOURCE TEXT

```
                                        line[i] = LM_GET_CHAR(conn);
                                }
                                line[i] = NULL;
                                if (!(power_up_mode && ((cmd == LM_DIAG_ITEM)
                                    || (cmd == LM_DIAG_WRITE)))) {
                                        (void) printf("%s", line);
                                        (void) fflush(stdout);
                                }
                        }
                        return SUCCESS;
                }
        }
}



get_selection (string_reply)
        char    *string_reply;

{


        (void) printf("\n");
        do {
                get_input(selection_buffer, string_reply, (long) max_str);
                clean_input (string_reply);

        } while (strlen(string_reply) == 0);

        (void) printf("\n");
}



static
get_input (prompt, reply, len)
        char    *prompt;
        char    *reply;
        long    len;

{

        (void) printf("%s", prompt);
        (void) fflush(stdout);
        get_line(reply, len);
}



static void
clean_input (line)
        char    *line;

{       char    temp_string[max_str];   /* use a temporary string to avoid   */
                                        /* portability problems              */
        char    *str_ptr;

        (void) strcpy (temp_string, line);
        str_ptr = temp_string;

        while (isspace(str_ptr[0]))
                str_ptr++; /* remove leading white space */

        (void) strcpy (line, str_ptr);
}



static void
get_line(string, len)
        char    *string;
        long    len;

{       char    *s = string;
        char    *limit = s + len;
        char    c;

        while ( ((c = getchar()) != LF) && (c != CR) && (s < limit) ) {
                switch (c) {
                case EOF:
                        (void) good_bye();
                        break;
                case BS:
                case DEL:
                        if (s > string) {
                                --s;
                                putchar(BS);
                                putchar(' ');
                                putchar(BS);
                        }
                        break;
                case ctrl(u):
                        while (s > string) {
                                --s;
                                putchar(BS);
                                putchar(' ');
                                putchar(BS);
                        }
                        break;
                case ctrl(w):
                        while ((s > string) && isspace(s[-1])) {
                                --s;
                                putchar(BS);
                                putchar(' ');
                                putchar(BS);
                        }
                        while ((s > string) && !isspace(s[-1])) {
                                --s;
                                putchar(BS);
                                putchar(' ');
                                putchar(BS);
                        }
                        break;
                default:
                        if (isprint(c)) {
                                *s++ = c;
                                putchar(c);
                        } else {
                                putchar(ctrl(g));
                        }
                }
        }
```

Copyright 1989
Logic Modeling Systems

SOURCE PROGRAM lm/hostdiag.c | DATE 5/23/89 | TIME 1:20:35 pm | PAGE # 6/32

LINE # SOURCE TEXT

```
        putchar('\n');
        *s = '\0';
}



/*
** key_has_been_pressed() returns 0 if no key has been pressed.
** If a key has been pressed, we read the input and search the
** buffer for the INTR_CHARACTER. If we find the INTR_CHARACTER
** anywhere in the buffer we return INTR_CHARACTER.  Else, we return
** the first character in the buffer.
**
** If this code is changed then ^X will not work.
*/
# ifdef SYS5
key_has_been_pressed ( )
  { int flags ;
    int count ;
    char *s , buffer [ 4096 ] ;

    if (lm_boot_mode) return (0);
    flags = fcntl ( 0 , F_GETFL , 0 ) ;
    if ( flags == -1 )
      { perror ( "fcntl 1" ) ;
        return 0 ;
      }
    if ( ! ( flags & O_NDELAY ) )
      if ( fcntl ( 0 , F_SETFL , flags | O_NDELAY ) == -1 )
        { perror ( "fcntl 2" ) ;
          return 0 ;
        }
    count = read ( 0 , buffer , sizeof ( buffer ) ) ;
    if ( count == -1 )
      { perror ( "read" ) ;
        return 0 ;
      }
    if ( ! ( flags & O_NDELAY ) )
      if ( fcntl ( 0 , F_SETFL , flags ) == -1 )
        { perror ( "fcntl 3" ) ;
          return 0 ;
        }
    if ( count == 0 )
      return 0 ;
    for ( s = buffer ; s < buffer + count ; ++s )
      if ( *s == INTR_CHARACTER )
        return INTR_CHARACTER ;
    return *buffer ;
  } /* key_has_been_pressed */
# else /*SYS5*/
#ifndef VMS
key_has_been_pressed()
{

        int arg;
        char buffer[4096];
        register char *s, *limit;
        register long count;

        if (lm_boot_mode) return (0);
        if (ioctl(0, FIONREAD, &arg) == -1) {
                perror("fionread");
                arg = 0; /* since can't tell, assume no key */
        }
        if (arg) {
                if ((count = read(0, buffer, 4096)) == -1) {
                        perror("read");
                } else {
                        arg = (int)(buffer[0]);
                        limit = &(buffer[count]);
                        for (s = buffer; s < limit; ++s)
                                if (*s == INTR_CHARACTER)
                                        return INTR_CHARACTER;
                }
        }
        return arg;
}
#else /*VMS*/

#include        <iodef>
#include        <ssdef>
#include        <descrip>


key_has_been_pressed()
{       $DESCRIPTOR(device_name, "TT");

        struct {
                unsigned short  condition_value;
                unsigned short  byte_count;
                unsigned long   status_bits;
        } io_status;

static  unsigned short  channel;
static  long            event_flag = -1;
        long            status;
        long            state;
        char            buffer[100];

        if (lm_boot_mode) return (0);
        if (event_flag == -1) {
                status = SYS$ASSIGN (&device_name, &channel, 0, 0);

                if (status != SS$_NORMAL) {
                        LIB$SIGNAL (status);
                        return(0);
                }
                status = LIB$GET_EF(&event_flag);

                if (status != SS$_NORMAL) {
                        LIB$SIGNAL (status);
                        return(0);
                }

        }

        status = SYS$QIO (event_flag, channel, IO$_READVBLK + IO$M_NOECHO + IO$M_NOFILTR,
                        &io_status, 0, 0, &buffer, 1, 0, 0, 0, 0);

        if (status != SS$_NORMAL) {
                LIB$SIGNAL (status);
```

Copyright 1989 Logic Modeling Systems

| SOURCE PROGRAM | DATE | PAGE # |
|---|---|---|
| lm/hostdiag.c | 5/23/89 | 7/33 |
| | TIME 1:20:35 pm | |

LINE # SOURCE TEXT

```
                return(0);
        }

        status = SYS$READEF (event_flag, &state);

        if (status == SS$_WASSET) {

                if (io_status.condition_value != SS$_NORMAL) {
                        LIB$SIGNAL (io_status.condition_value);
                        SYS$CANCEL (channel);
                        return(0);
                }

                if (io_status.byte_count == 0) {
                        SYS$CANCEL (channel);
                        return(0);
                }
                return(*buffer);
        }

        SYS$CANCEL (channel);
        return ((char) 0);

}

# endif /*VMS*/
# endif /*SYS5*/
```

Copyright 1989
Logic Modeling Systems

| HEADER FILE | DATE | 5/23/89 | PAGE # |
|---|---|---|---|
| lm/lm_text.h | TIME | 1:20:36 pm | 1/34 |

LINE # HEADER TEXT

```
/* SCCS_ID: lm_text.h rev 3.1, 4/24/89 at 07:52:05 */

/*
**      include file for text based utilities
*/

#define max_str          255
#define max_boot_files   20

#define LMSI_PROMPT      "LMSI> "
#define MEGABYTE         (1024 * 1024)
#define FOREVER          while (TRUE)
#define NEVER            while (FALSE)

#define and     &&
#define or      ||

#define LM_CHECK(fcn) if (lm_check(fcn) == LM_ERROR) return(FAILURE)
#define LM_CHECK_TO(cleanup,fcn) if (lm_check(fcn) == LM_ERROR) goto cleanup

void lm_get_input();
```

Copyright 1989
Logic Modeling Systems

| SOURCE PROGRAM | DATE | 5/23/89 | PAGE # |
|---|---|---|---|
| lm/main.c | TIME | 1:20:36 pm | 1/35 |

LINE # SOURCE TEXT

```
/* SCCS_ID: main.c rev 3.4, 5/11/89 at 16:21:09    */

/*
**
**      Text based utilities.
**      This module accepts and parses the commands entered
**      by the user
**
**      copyr. Logic Modeling Systems Incorporated, 1988
**
*/
#include        <stdio.h>
#include        <ctype.h>
#include        <sys/types.h>
#include        <signal.h>
#include        <time.h>
#include        <netdb.h>
#include        <setjmp.h>
#include        "common.h"
#include        "lm_text.h"
#include        "lm_rd_wr.h"
#include        "lm_sfi.h"
#include        "mod_err.h"
#include        "nvram.h"
#include        "duart.h"
#include        "menus.h"
#include        "cpu.h"
#include        "id.h"
#include        "mod_def.h"
#include        "network.h"
#include        "command.h"

#include        "help.h"

#define         BOOT_LIST       "boot.lis"
#define         vprintf         (void) printf

void    set_default_modeler();
int     check_lm_dir();
void    read_every_forth_byte();
int     instances_per_lane();
int     set_default();
int     id_checksum();
int     send_file();
char    *getenv();
char    *strpbrk();
char    *memcpy();
int     lm_check();
int     lm_suspend();
struct hostent *gethostbyname();

int     str_cmp(), str_ncmp();  /* case insensitive string compares  */
char    *string_it();
int     re_boot(), install(), shut_down(), diags(), boot();
int     label ();
int     command_mode_help();
long    time();

int     play_vectors(), measure_timing(), check_shell_software();
int     set_baudrate(), set_net_timeout(), show_modeler();
int     show_logic_models(), show_users(), show_versions(), text_menu();
int     u_exit(), lm_promote();

int     null_ok(), always_ok(), lane_check();
int     slot_check(), board_check();
int     file_check(), modeler_check(), true_or_false(), yes_or_no();
int     host_check(), test_check(), integer_check(), device_check();
int     all_modeler_check(), address_check(), mode_check();
int     minute_check(), lane_height_check(), mfg_check();
int     internet_port_check(), adapter_check(), rev_check();
int     segment_check();
int     baud_rate_check(), port_check(), create_timing_file();

extern  u_long  lm_network_timeout;
extern  u_long  lm_max_timeout_retry_attempts;
extern  int     lm_handle_SIGHUP, lm_handle_SIGINT, lm_handle_SIGTERM;
extern  int     lm_handle_SIGQUIT;

char    error_prefix[max_str];

extern int      command_mode;

char    *lm_path = "LM_DIR";
char    *User_name;
char    Host_name[max_str];

main (argc, argv)
        char    **argv;
        int     argc;
{
#ifndef VMS
#ifndef PC386
        setlinebuf(stdout);
        setlinebuf(stderr);
#endif
#endif

        (void) strcpy (error_prefix, argv[0]);

#ifndef VMS
        if (NULL != strrchr(error_prefix, '/'))
                (void) strcpy (error_prefix, strrchr(error_prefix, '/')+1);
#else
        if (NULL != strrchr(error_prefix, ']'))
                (void) strcpy (error_prefix, strrchr(error_prefix, ']')+1);
        if (NULL != strchr(error_prefix, '.'))
                * (strchr(error_prefix, '.')) = NULL;
        if (NULL != strchr(error_prefix, ';'))
                * (strchr(error_prefix, ';')) = NULL;
#endif
        if (0 != gethostname (Host_name, sizeof(Host_name))) {
                (void) fprintf(stderr, "%s: unable to get host name\n",
                        error_prefix);
                exit(1);
        }

        User_name = (char *) getenv ((char *) "USER");
        if (NULL == User_name) {
                (void) fprintf(stderr, "%s: unable to get user name\n",
                        error_prefix);
```

Copyright 1989 Logic Modeling Systems

| SOURCE PROGRAM | DATE | PAGE # |
|---|---|---|
| lm/main.c | 5/23/89 | 2/36 |
| | TIME 1:20:36 pm | |

LINE # SOURCE TEXT

```
                exit(1);
        }

        lm_handle_SIGHUP = lm_handle_SIGINT = lm_handle_SIGTERM = LM_FALSE;
        lm_handle_SIGQUIT = LM_FALSE;

        LM_CHECK (lm_check_path_variable (lm_path));
        LM_CHECK (lm_check_path_variable ("LM_LIB"));

        /* now we can call u_exit */

        (void) signal(SIGHUP, u_exit);
        (void) signal(SIGINT, u_exit);
        (void) signal(SIGTERM, u_exit);

        command_mode = (argc != 1)? TRUE: FALSE;
        command_line_mode(argc, argv);

        u_exit();
        return(SUCCESS);
}

text_menu ()
{
        extern  int     create_logic_models(), verify_logic_models();
        extern  int     diags(), config_menu(), perform_maint();
        extern  char    *lmsi_version;

        static  LM_MENU_ITEM        menu_list[]  = {
                { "1", " Create Logic Models ", create_logic_models,
                        LM_another_menu, LM_null, cl_help },
                { "2", " Verify Logic Models ", verify_logic_models,
                        LM_another_menu,  LM_null,vl_help },
                { "3", " Perform Maintenance ", perform_maint,
                        LM_another_menu, LM_null, pm_help },
                { "4", " Run Diagnostics      ", diags,
                        LM_routine, LM_null, rd_help },
                { "5", " Show Modeler Configuration ", config_menu,
                        LM_another_menu, LM_null, sc_help },
        };

        static LM_MENU main_menu = {
                " LM Utilities Menu ", /* menu title */
                sizeof(menu_list)/sizeof(LM_MENU_ITEM), /* # of menu items */
                0,
                menu_list /* pointer to the menu array     */
        };

        vprintf("%s\n", lmsi_version);
        command_mode = FALSE;
        local_begin_modeling_session();
        (void) set_default_modeler();
        local_end_modeling_session();
        (void) lm_display_menu(&main_menu);
        command_mode = TRUE;
        return;
}

create_logic_models ()

{
        extern  int     label(), label_pcb(), check_shell_software();

        static  LM_MENU_ITEM    menu_list[] = {
                { "1", " Label Device Adapter ", label,
                        LM_routine, LM_null, ld_help },
                { "2", " Check Shell Software ", check_shell_software,
                        LM_routine, LM_null, cs_help },
        };

        static LM_MENU              main_menu = {

                " Create Logic Models ",
                sizeof(menu_list)/sizeof(LM_MENU_ITEM),
                0, menu_list
       .};

        (void) lm_display_menu ( &main_menu );

}

verify_logic_models ()

{
        extern  int     play_vectors(), measure_timing(), locate_model_file();

        static  LM_MENU_ITEM    menu_list[] = {

                { "1", " Play Vectors          ", play_vectors, LM_routine, LM_null, pv_help },
                { "2", " Measure Timing        ", measure_timing, LM_routine, LM_null, mt_help },
                { "3", " Create Timing File    ", create_timing_file, LM_routine, LM_null, ct_help },
                { "4", " Find Model File       ", locate_model_file, LM_routine, LM_null, fm_help }

        };

        static LM_MENU              .  ._menu = {

                " Verify Logic Models ",
                sizeof(menu_list)/sizeof(LM_MENU_ITEM),
                0, menu_list
        };


        (void) lm_display_menu ( &main_menu );

}

set_baud_b ()

{
        extern  int     set_modem_baud();

        static  LM_MENU_ITEM        menu_list[] = {

                { "3", " 300", set_modem_baud, LM_routine | LM_automatic_quit, (char *) BAUD_300 },
                { "12", " 1200", set_modem_baud, LM_routine | LM_automatic_quit, (char *) BAUD_1200 },
                { "24", " 2400", set_modem_baud, LM_routine | LM_automatic_quit, (char *) BAUD_2400 },
                { "48", " 4800", set_modem_baud, LM_routine | LM_automatic_quit, (char *) BAUD_4800 },
                { "96", " 9600", set_modem_baud, LM_routine | LM_automatic_quit, (char *) BAUD_9600 },
                { "24+", " 2400+ (2400-9600-1200)", set_modem_baud, LM_routine | LM_automatic_quit, (char *) BAUD_24_96_12},
```

Copyright 1989
Logic Modeling Systems

SOURCE PROGRAM lm/main.c | DATE 5/23/89 | TIME 1:20:36 pm | PAGE # 3/37

SOURCE TEXT

```
                { "96+", " 9600+ (9600-1200-2400)", set_modem_baud, LM_routine | LM_automatic_quit, (char *) BAUD_96_12_24 }
        };

        static LM_MENU              main_menu = {

                " Set Modem Baud Rate ",
                sizeof(menu_list)/sizeof(LM_MENU_ITEM),
                0, menu_list
        };

        (void) lm_display_menu ( &main_menu );

}



set_modem_baud(rate)
        int     rate;

{
        long    status;
        char    real_rate;
        char    modeler_name[max_str];
        char    baud_str[max_str];

        real_rate = rate;

        switch (real_rate) {
                case(BAUD_300) : (void) strcpy (baud_str, "300"); break;
                case(BAUD_1200) : (void) strcpy (baud_str, "1200"); break;
                case(BAUD_2400) : (void) strcpy (baud_str, "2400"); break;
                case(BAUD_4800) : (void) strcpy (baud_str, "4800"); break;
                case(BAUD_9600) : (void) strcpy (baud_str, "9600"); break;
                case(BAUD_24_96_12) : (void) strcpy (baud_str, "2400+"); break;
                case(BAUD_96_12_24) : (void) strcpy (baud_str, "9600+"); break;
        }

        status = get_parameter(PR_MODELER_NAME,
                modeler_name, sizeof(modeler_name));
        if (status != SUCCESS) return(FAILURE);

        if (FAILURE == check_password(modeler_name))
                return(FAILURE);

        LM_CHECK(lm_write (modeler_name, LM_NVSRAM_MEMORY, (u_long) 0, (u_long) MODEM_BAUD,
                        (u_long) SIZEOF_MODEM_BAUD, (char *) &real_rate, &status));

        switch (real_rate) {
                case (BAUD_24_96_12) : real_rate = BAUD_2400; break;
                case (BAUD_96_12_24) : real_rate = BAUD_9600; break;
        }

        LM_CHECK(lm_write (modeler_name, LM_DUART_MODEM, (u_long) 0,
                        (u_long) 0, (u_long) 1, (char *) &real_rate, &status));

        vprintf("Set modem port baud rate to %s on modeler \"%s\"\n\n", baud_str, modeler_name);

        return (SUCCESS);
}

set_baud_a ()

{
        extern  int     set_console_baud();

        static  LM_MENU_ITEM        menu_list[] = {

                { "3", " 300", set_console_baud, LM_routine | LM_automatic_quit, (char *) BAUD_300 },
                { "12", " 1200", set_console_baud, LM_routine | LM_automatic_quit, (char *) BAUD_1200 },
                { "24", " 2400", set_console_baud, LM_routine | LM_automatic_quit, (char *) BAUD_2400 },
                { "48", " 4800", set_console_baud, LM_routine | LM_automatic_quit, (char *) BAUD_4800 },
                { "96", " 9600", set_console_baud, LM_routine | LM_automatic_quit, (char *) BAUD_9600 },
                { "24+", " 2400+ (2400-9600-1200)", set_console_baud, LM_routine | LM_automatic_quit, (char *) BAUD_24_96_12},
                { "96+", " 9600+ (9600-1200-2400)", set_console_baud, LM_routine | LM_automatic_quit, (char *) BAUD_96_12_24 }
        };

        static LM_MENU              main_menu = {

                " Set Console Baud Rate ",
                sizeof(menu_list)/sizeof(LM_MENU_ITEM),
                0, menu_list
        };

        (void) lm_display_menu ( &main_menu );

}



set_console_baud(rate)
        int     rate;

{
        long    status;
        char    real_rate;
        char    modeler_name[max_str];
        char    baud_str[max_str];

        real_rate = rate;

        switch (real_rate) {
                case (BAUD_300)  : (void) strcpy (baud_str, "300");  break;
                case (BAUD_1200) : (void) strcpy (baud_str, "1200"); break;
                case (BAUD_2400) : (void) strcpy (baud_str, "2400"); break;
                case (BAUD_4800) : (void) strcpy (baud_str, "4800"); break;
                case (BAUD_9600) : (void) strcpy (baud_str, "9600"); break;
                case(BAUD_24_96_12) : (void) strcpy (baud_str, "2400+"); break;
                case(BAUD_96_12_24) : (void) strcpy (baud_str, "9600+"); break;
        }

        status = get_parameter(PR_MODELER_NAME,
                modeler_name, sizeof(modeler_name));
        if (status != SUCCESS) return(FAILURE);

        if (FAILURE == check_password(modeler_name))
                return(FAILURE);

        LM_CHECK(lm_write (modeler_name,  (u_long)LM_NVSRAM_MEMORY, (u_long) 0,
```

Copyright 1989
Logic Modeling Systems

SOURCE PROGRAM
lm/main.c

DATE 5/23/89
TIME 1:20:36 pm

LINE # SOURCE TEXT

```
                (u_long) CONSOLE_BAUD, (u_long) SIZEOF_CONSOLE_BAUD,
                (char *)&real_rate, &status));

        switch (real_rate) {
                case (BAUD_24_96_12) : real_rate = BAUD_24?   break;
                case (BAUD_96_12_24) : real_rate = BAUD_9600; break;
        }

        LM_CHECK(lm_write (modeler_name, (u_long) LM_DUART_CONSOLE, (u_long) 0,
                (u_long) 0, (u_long) 1, (char *)&real_rate, &status));

        vprintf("Set console port baud rate to %s on modeler \"%s\"\n\n",
                baud_str, modeler_name);

        return (SUCCESS);
}


set_net_timeout()

{       char    modeler_name[max_str];
        char    seconds_string[max_str];
        long    status;
        u_short time_out;
static  char    idle_string[] =
            "Idle process timeout %sset to %d minutes on modeler \"%s\"\n";

        status = get_parameter(PR_MODELER_NAME,
                modeler_name, sizeof(modeler_name));
        if (status != SUCCESS) return(FAILURE);

        if (FAILURE == check_password(modeler_name))
                return(FAILURE);

        LM_CHECK(lm_read (modeler_name, (u_long) LM_NVSRAM_MEMORY, (u_long) 0,
                (u_long) NETWORK_TIMEOUT, (u_long) SIZEOF_NETWORK_TIMEOUT,
                (char *) &time_out, &status));

        vprintf(idle_string, "was ", time_out/60, modeler_name);

        status = get_parameter(PR_MINUTES,
                seconds_string, sizeof(seconds_string));
        if (status != SUCCESS) return (FAILURE);

        time_out = 60 * (atoi (seconds_string));

        LM_CHECK(lm_write (modeler_name, (u_long) LM_NVSRAM_MEMORY, (u_long) 0,
                (u_long) NETWORK_TIMEOUT, (u_long) SIZEOF_NETWORK_TIMEOUT,
                (char *) &time_out, &status));

        vprintf(idle_string, "", time_out/60, modeler_name);
        return (SUCCESS);
}



perform_maint ()

{       extern  int     boot(), install(), shut_down(), abort_user();
        extern  int     set_baud(), re_boot(), clear_counters(), set_net_timeout();
        extern  int     set_password();

static  LM_MENU_ITEM    menu_list[] = {
                { "1", " Install Modeler         ", install,       LM_routine, LM_null, in_help },
                { "2", " Boot Modeler            ", boot,          LM_routine, LM_null, bt_help },
                { "3", " Shut Down Modeler       ", shut_down,     LM_routine, LM_null, sh_help },
                { "4", " Reboot Modeler          ", re_boot,       LM_routine, LM_null, rb_help },
                { "5", " Set Baud Rates          ", set_baud,      LM_another_menu, LM_null, sb_help },
                { "6", " Set Idle Process Timeout  ", set_net_timeout , LM_routine, LM_null, nt_help },
                { "7", " Abort User              ", abort_user,    LM_routine, LM_null, au_help },
                { "8", " Change Modeler Password ", set_password, LM_routine, LM_null, pw_help },
                { "9", " Clear Run Time counters ", clear_counters, LM_routine, LM_null, 0 }
        };

static LM_MENU  main_menu = {
                " Perform Maintenance ",
                sizeof(menu_list)/sizeof(LM_MENU_ITEM),
                0, menu_list
        };

        if (!Fe_mode) {
                main_menu.number_of_items = sizeof(menu_list)/sizeof(LM_MENU_ITEM) - 1;
        }

        (void) lm_display_menu ( &main_menu );

        return (SUCCESS);

}



set_password ()

{       char    'eler_name[max_str];
        long status;
        long    good_password;
        char    password[max_str];
        char    new_password[max_str];
        char    another_new_password[max_str];
        char    password_prompt[max_str];

        status = get_parameter(PR_MODELER_NAME,
                modeler_name, max_str);
        if (status != SUCCESS) return(FAILURE);

        LM_CHECK (lm_select_modeler(modeler_name));

        good_password = LM_FALSE;

        (void) sprintf(password_prompt, "Enter OLD Modeler Password \"%s\": ", modeler_name);
        prompt(password_prompt, password, sizeof(password));

        (void) lm_password (LM_ENTER, password);
        (void) lm_inquire_modeler (LM_PASSWORD_CHECK, &good_password);

        (void) sprintf(password_prompt, "Enter NEW Modeler Password \"%s\": ", modeler_name);
        prompt (password_prompt, new_password, sizeof(new_password));

```

Copyright 1989 Logic Modeling Systems

SOURCE PROGRAM lm/main.c | DATE 5/23/89 | TIME 1:20:36 pm | PAGE # 5/39

LINE # SOURCE TEXT

```
        (void) sprintf(password_prompt, "Repeat NEW Modeler Password: ");
        prompt (password_prompt, another_new_password, sizeof(another_new_password));

        if (0 != strcmp(new_password, another_new password)) {
                vprintf("%s: Password not change... asswords did not match \n", error_prefix);
                return(FAILURE);
        }

        if (LM_FALSE == good_password) {
                vprintf ("%s: Password not changed, invalid password \n", error_prefix);
                return(FAILURE);
        }

        LM_CHECK (lm_password (LM_ASSIGN, new_password));

        vprintf("Password changed on modeler \"%s\" \n", modeler_name);
        return(SUCCESS);

}



set_baud ()

{       extern  int     set_baud_a(), set_baud_b();

static  LM_MENU_ITEM    menu_list[] = {
                { "1", " Console                ", set_baud_a, LM_another_menu | LM_automatic_quit, LM_null },
                { "2", " Modem                  ", set_baud_b, LM_another_menu | LM_automatic_quit, LM_null }
        };

static LM_MENU          main_menu = {
                " Set Baud Rates " ,
                sizeof(menu_list)/sizeof(LM_MENU_ITEM),
                0, menu_list
        };

        (void) lm_display_menu (&main_menu);

        return (SUCCESS);
}



config_menu ()
{
        extern  int     show_per_modeler();
        extern  int     display_modeler(), display_logic_models(),
                display_users(), display_version();
        static  LM_MENU_ITEM    menu_list[] = {
                { "1", " Show Modelers      ", show_per_modeler, LM_routine,
                        (char *)display_modeler, sm_help },
                { "2", " Show Logic Models ", show_per_modeler, LM_routine,
                        (char *)display_logic_models, sl_help },
                { "3", " Show Users         ", show_per_modeler, LM_routine,
                        (char *)display_users, su_help },
                { "4", " Show Versions      ", show_per_modeler, LM_routine,
                        (char *)display_version, sv_help }
        };
        static LM_MENU                  main_menu = {

                " Modeler Configuration ",
                sizeof(menu_list)/sizeof(LM_MENU_ITEM),
                0, menu_list
        };

        (void) lm_display_menu ( &main_menu );
        return (SUCCESS);
}

void
set_default_modeler()
{
        int     status;
        char    *message;
        int     severity;
        char    modeler_name[max_str];
        char    **list_of_modelers;
        int     number_of_modelers;
        char    *reply_ptr;

        reply_ptr = get_default(PR_MODELER_NAME);

        if (strlen(reply_ptr)>0) {
                (void) strcpy (modeler_name, reply_ptr);
        } else {

                (void) lm_check(lm_inquire_modeler_list(&number_of_modelers,
                    &list_of_modelers));

                if (number_of_modelers == 1) {
                        (void) strcpy (modeler_name, *list_of_modelers);
                } else {
                        set_validation(PR_MODELER_NAME, null_ok);
                        (void) get_parameter (PR_MODELER_NAME, modeler_name, max_str);
                        set_validation(PR_MODELER_NAME, modeler_check);
                }
        }

        (void) set_default (PR_MODELER_NAME, modeler_name);

        if (strlen(modeler_name)>0) {
                status = lm_select_modeler(modeler_name);
                vprintf("Default Modeler is \"%s\"\n", modeler_name);
                if (LM_SUCCESS != status) {
                        do {
                                lm_get_message( &severity, &message);
                                if ((severity == LM_ERROR)
                                || (severity == LM_WARNING))
                                        vprintf("%s\n", message);

                        } while (severity != LM_NO_MORE_MESSAGES);
                }
        }

        return;
}

clean_input (line)
        char    *line;
```

Copyright 1989
Logic Modeling Systems

LINE # SOURCE TEXT

```
{
        char    *old_line, newline[max_str];
        int     i;

        i = 0;
        old_line = line;

        while (isspace(old_line[0])) old_line++;

        if (NULL == old_line[0]) {
                (void) strcpy(line, "");
                return;
        }

        while (NULL != old_line[0]) {

                while ((NULL != old_line[0]) && (!(isspace(old_line[0])))) {
                        newline[i] = old_line[0];
                        old_line++;
                        i++;
                }

                newline[i] = ' ';
                i++;

                while (isspace(old_line[0])) old_line++;
        }

        i--;
        newline[i] = NULL;

        (void) strcpy(line, newline);
}


russ_index (string, substring, position)
        char    *string;
        char    *substring;
        int     *position;

{
        int     i, j, k;

        *position = -1;

        for (i = 0; i < strlen(string); i++) {
                j = 0;
                k = i;
                while (string[k] == substring[j]) {
                        j++;
                        k++;
                        if ((j == strlen(substring)) || (! is_ident(string[k]))) {
                                *position = i;
                                return(SUCCESS);
                        }
                }
        }

        return(FAILURE);
}


number_of_users (modeler_name)
        char    *modeler_name;

        /* return the number of users on the system */

{
        long    number_of_users;
        long    *list_of_users;
        int     status;
        char    **list_of_user_names, **list_of_host_names;

        status = lm_select_modeler(modeler_name);

        if (LM_SUCCESS != status) return (0);
                /* there are no users on the modeler */

        /* get the total number of users on the system  */

        status = lm_inquire_user_list (&number_of_users, &list_of_users,
                        &list_of_host_names, &list_of_user_names);

        if (LM_SUCCESS != status) return (0);
                else return (number_of_users);

}



diags()

{       char modeler_name[max_str];
        long status;

        status = get_parameter(PR_MODELER_NAME,
                modeler_name, max_str);
        if (status != SUCCESS) return(FAILURE);

        if (FAILURE == check_password(modeler_name))
                return(FAILURE);

        if (SUCCESS != check_users(modeler_name))
                return (FAILURE);

        if (reboot_diagnostics(modeler_name) != SUCCESS)
                return(FAILURE);

        /*  run the diagnostics (over the net)  */

        return (lm_diagnostics(modeler_name, (int *)0, (char **)0, 0));
}


all_test(modeler_name)
        char    *modeler_name;
```

Copyright 1989 Logic Modeling Systems

| SOURCE PROGRAM | DATE | PAGE # |
|---|---|---|
| lm/main.c | 5/23/89 | 7/41 |
| | TIME 1:20:36 pm | |

LINE # SOURCE TEXT

```
{       int     error_count = 0;
static  char    *cmd_list[] = {
                        "mincon print_messages=true",
                            failure_count=1",
                        "exit",
                        0
                };

        /* run the diagnostics (over the set) */

        if (lm_diagnostics(modeler_name, &error_count, cmd_list, 1) != SUCCESS) {
                (void) fprintf (stderr, "%s: Boot diagnostics failed \n", error_prefix);
                return (FAILURE);
        }

        if (error_count == 0) {
                vprintf("Diagnostics passed.\n");
                return (SUCCESS);

        } else {
                vprintf("Diagnostics failed %d tests.\n", error_count);
                return (FAILURE);
        }

}

burnin()

{       char modeler_name[max_str];
        long status;
static  char    *cmd_list[] = {
                        "burnin",
                        /* go to interactive mode */
                        0
                };

        status = get_parameter(PR_MODELER_NAME,
                modeler_name, max_str);
        if (status != SUCCESS) return(FAILURE);

        if (FAILURE == check_password(modeler_name))
                return(FAILURE);

        if (SUCCESS != check_users(modeler_name))
                return (FAILURE);

        if (reboot_diagnostics(modeler_name) != SUCCESS)
                return(FAILURE);

        /* run the diagnostics (over the set) */

        return (lm_diagnostics(modeler_name, (int *)0, cmd_list, 0));
}

qa()

{       char modeler_name[max_str];
        long status;
static  char    *cmd_list[] = {
                        "all",
                        "exit",
                        0
                };

        status = get_parameter(PR_MODELER_NAME,
                modeler_name, max_str);
        if (status != SUCCESS) return(FAILURE);

        if (FAILURE == check_password(modeler_name))
                return(FAILURE);

        if (SUCCESS != check_users(modeler_name))
                return (FAILURE);

        if (reboot_diagnostics(modeler_name) != SUCCESS)
                return(FAILURE);

        /* run the diagnostics (over the set) */

        return (lm_diagnostics(modeler_name, (int *)0, cmd_list, 1));
}


reboot_diagnostics(modeler_name)
        char    *modeler_name;

{       long    status;



        vprintf("Executing diagnostics on \"%s\"\n",modeler_name);

        /* Reboot the modeler */

        status = lm_select_modeler(modeler_name);
        if (LM_SUCCESS == status)
                lm_shutdown (0, LM_FALSE); /* so modeler doesn't ask daemon to boot it */

        /* Boot the modeler with the diagnostics */

        return (download_modeler_code (modeler_name, "diagnostics", BOOT_LIST));

}



download_modeler_code (modeler_name, code_type, boot_list)
        char    *modeler_name;
        char    *code_type;
        char    *boot_list;

{       int     file_num;
        char    state;
        char    *boot_files[max_boot_files];
        long    counter = 0;
        int     status;
#ifdef SUNOS3_5
        int     (*save_intr_fcn)(), handle_intr();
#else
```

Copyright 1989
Logic Modeling Systems

LINE # SOURCE TEXT

```
        void    (*save_intr_fcn)(), handle_intr();
#endif
        extern jmp_buf  *Jmpbuf;
        jmp_buf jmpbuf, *save_jmpbuf = Jmpbuf;

        if (FAILURE == get_bootfiles(boot_list, boot_files,
                        &file_num, modeler_name, code_type))
                        return(FAILURE);

        while (lm_is_modeler_alive(modeler_name, &state) == LM_WARNING) {
                ++counter;
                if (0 == (counter % 5))
                        (void) printf ("Waiting for modeler to respond... \n");
                if (200 < counter) {
                        (void) fprintf (stderr, "%s: Modeler not responding, boot failed.\n", error_prefix);
                        return (FAILURE);
                }

                lm_flush_message_queue();
                sleep(1);
        }

        if (log_boot(modeler_name) != SUCCESS)
                return(FAILURE);

        if (!setjmp(jmpbuf)) {
                Jmpbuf = (jmp_buf *)jmpbuf;
                save_intr_fcn = signal(SIGINT, handle_intr);

                status = lm_check(lm_boot (modeler_name, (u_long) file_num,
                        boot_files, (u_long) LM_FALSE, (u_long) 0));

                Jmpbuf = save_jmpbuf;
                (void) signal(SIGINT, save_intr_fcn);
        } else {
                Jmpbuf = save_jmpbuf;
                (void) signal(SIGINT, save_intr_fcn);
                status = FAILURE;
                vprintf("\n");
                if (lm_is_modeler_alive(modeler_name, &state) == LM_SUCCESS) {
                        /* only kill if booting */
                        if (state == BOOTING) {
                                lm_remote_reset(modeler_name, &state);
                        }
                }
                (void) handle_intr(SIGINT);
        }

        vprintf("Modeler \"%s\"%s booted\n", modeler_name,
                (status == SUCCESS)? "": " not");

        return status;
}


get_bootfiles(in_boot_list, boot_files, file_num, modeler_name, code_type)
        char    *in_boot_list;
        char    *boot_files[];
        int     *file_num;
        char    *modeler_name;
        char    *code_type;

{       char    boot_list[max_str];
        char    match_string[max_str];
static  char    boot_file_names[max_boot_files][max_str];
static  FILE    *boot_list_file = NULL;

        LM_CHECK( lm_resolve_filename(lm_path, in_boot_list,
                boot_list, (int) max_str, (int) 0));

        if (NULL != boot_list_file)
                (void) fclose (boot_list_file);

        boot_list_file = fopen(boot_list, "r");

        if (NULL == boot_list_file) {
                (void) fprintf(stderr, "%s: unable to open boot list file \"%s\"\n",
                                                        error_prefix, boot_list);
                return(FAILURE);
        }

        (void) strcpy (match_string, modeler_name);
        (void) strcat (match_string, ": ");
        (void) strcat (match_string, code_type);

        *file_num = 0;

        /*  first check for the modeler_name, at the beginning  */

        while (NULL != fgets(boot_file_names[*file_num], max_str, boot_list_file)) {
                clean_input (boot_file_names[*file_num]);
                remove_comments (boot_file_names[*file_num]);
                if (SUCCESS == present(boot_file_names[*file_num], match_string)) {
                        boot_files[*file_num] = boot_file_names[*file_num];
                        LM_CHECK( lm_resolve_filename (lm_path, boot_files[*file_num],
                                boot_files[*file_num], (int) max_str, (int) 0));
                        (*file_num)++;
                }
        }

        if (0 != *file_num) {
                (void) fclose(boot_list_file);
                return (SUCCESS);
        }

        rewind(boot_list_file);

        /*  there were no entries found with a name on it  */

        while (NULL != fgets (boot_file_names[*file_num], max_str, boot_list_file)) {
                clean_input (boot_file_names[*file_num]);
                remove_comments (boot_file_names[*file_num]);
                if (SUCCESS == present(boot_file_names[*file_num], code_type)) {
                        boot_files[*file_num] = boot_file_names[*file_num];
                        LM_CHECK (lm_resolve_filename (lm_path, boot_files[*file_num],
                                boot_files[*file_num], (int) max_str, (int) 0));
                        (*file_num)++;
                }
        }
```

Copyright 1989 Logic Modeling Systems

SOURCE PROGRAM lm/main.c | DATE 5/23/89 | TIME 1:20:36 pm | PAGE # 9/43

LINE # SOURCE TEXT

```
        (void) fclose(boot_list_file);
        if (0 != *file_num) return(SUCCESS);

        if (0 != strcmp(code_type, "boot_diags"))
                (void) fprintf (stderr, "%s: no \"%s\" files found in \"%s\" for modeler \"%s\" \n",
                                        error_prefix, code_type, boot_list, modeler_name );
        else (void) fprintf (stderr, "%s: WARNING: boot diagnostics NOT run. \n", error_prefix);

        return(FAILURE);
}



present (string1, string2)
        char    *string1, *string2;

        /* returns success if string2 is in string1 */
        /* oh, by the way, it changes string1 so that */
        /*  it is truncated from the end of string 2  */

{       char    t1[max_str];
        char    t2[max_str];

        (void) strncpy (t1, string1, max_str);
        (void) strncpy (t2, string2, max_str);

        clean_input(t1);
        clean_input(t2);

        (void) strcat (t2, ":");

        if (0 == str_ncmp(t1, t2, strlen(t2))) {
                if (0 == strchr (t1 + strlen(t2), ':')) {
                        (void) strcpy (string1, t1 + strlen(t2));
                        clean_input(string1);
                        return(SUCCESS);
                }
        }

        return(FAILURE);
}



remove_comments (s)
        char    *s;

{       char    line[max_str];
        char    *start_of_comment;

        (void) strcpy (line, s);

        if (0 != (start_of_comment = strchr(line, '#'))) {
                *start_of_comment = (char) 0;
        }

}


void
lm_get_input (prompt, reply, len)
        char    *prompt;
        char    *reply;
        short   len;
{
        (void) fprintf(stderr, "%s", prompt);
        (void) fflush(stderr);
        if (fgets(reply, len, stdin) == 0) u_exit();
        reply[strlen(reply) - 1] = 0;
        clean_input (reply);
}

clear_counters()
{
        RUNTIME_STAT_STRUCT     counters;
        char    modeler_name[max_str];
        long    status;

        status = get_parameter(PR_MODELER_NAME,
                modeler_name, sizeof(modeler_name));
        if (status != SUCCESS) return(FAILURE);

        if (FAILURE == check_password(modeler_name))
                return(FAILURE);

        counters.dab_insertion_count = 0;
        counters.pattern_count_msl = 0;
        counters.pattern_count_lsl = 0;
        counters.longest_pattern_seq = 0;
        counters.definition_count = 0;
        counters.instance_count = 0;
        counters.fault_count =0;

        LM_CHECK( lm_write(modeler_name, (u_long) LM_[illegible]SRAM_MEMORY, (u_long) 0, (u_long) RUNTIME_STAT,
                (u_long) SIZEOF_RUNTIME_STAT, (char *) &counters, &status));

        vprintf("Counters on modeler \"%s\" cleared\n", modeler_name);
        return(SUCCESS);

}



abort_user ()

{       char    modeler_name[max_str], user_number[max_str];
        char    reply[max_str];
        long    user_no, status, loop;
        char    *killed_user, *killed_host;
        long    *list_of_users, number_of_users, me;
        char    **list_of_user_names, **list_of_host_names;

        status = get_parameter(PR_MODELER_NAME, modeler_name, sizeof(modeler_name));
        if (status != SUCCESS) return(FAILURE);

        LM_CHECK (lm_select_modeler (modeler_name));

        if (FAILURE == check_password(modeler_name))
                return(FAILURE);
```

Copyright 1989 Logic Modeling Systems

| SOURCE PROGRAM | DATE | TIME | PAGE # |
|---|---|---|---|
| lm/main.c | 5/23/89 | 1:20:36 pm | 10/44 |

LINE # SOURCE TEXT

```
        status = get_parameter (PR_USER_NO, user_number, sizeof(user_number));
        if (status != SUCCESS) return(FAILURE);

        user_no = atoi(user_number);
        LM_CHECK( lm_inquire_user_list (&number_of_users, &list_of_users,
            &list_of_host_names, &list_of_user_names));

        for (loop = 0; loop<number_of_users; loop++,
                        list_of_users++, list_of_user_names++, list_of_host_names++) {
            if (*list_of_users == user_no) {
                killed_user = *list_of_user_names;
                killed_host = *list_of_host_names;
                break;
            }
        }

        /*  check to see that this is not me,   */
        /*  you cannot delete yourself          */

        LM_CHECK (lm_inquire_modeler(LM_WHICH_USER_AM_I, &me));
        if (user_no == me) {
                (void) fprintf (stderr, "%s: Can only abort other users \n", error_prefix);
                return (FAILURE);
        }

        vprintf ("Aborting user \"%s\" on \"%s\" \n", killed_user, killed_host);
        lm_get_input ("Do you wish to continue? (y/n) ", reply, sizeof(reply));
        while (FAILURE == yes_or_no (reply)) {
            lm_get_input ("Do you wish to continue? (y/n) ", reply, sizeof(reply));
        }

        if (('n' == reply[0]) || ('N' == reply[0])) {
                vprintf("\n");
                return(FAILURE);
        }

        LM_CHECK (lm_abort_user (user_no));

        vprintf ("User number %d aborted on modeler \"%s\" (user \"%s\" on \"%s\") \n",
                        user_no, modeler_name, killed_user, killed_host);

        return(SUCCESS);
}



install ()

{       char    modeler_name[max_str], host_name[max_str];
        char    boot_type_str[max_str], port_string[max_str];
        int     port_number;
        int     status;
        int     boot_type;
        BOOT_STRUCT     boot_struct;

        port_number = 1234;

        status = get_parameter(PR_MODELER_NAME,
                modeler_name, sizeof(modeler_name));
        if (status != SUCCESS) return(FAILURE);

        if (FAILURE == check_password(modeler_name))
                return(FAILURE);

        status = get_parameter(PR_AUTOBOOT,
                boot_type_str, sizeof(boot_type_str));
        if (SUCCESS != status) return(FAILURE);

        if (0 == str_ncmp (boot_type_str, "yes", strlen(boot_type_str)))
                boot_type = AUTOBOOT;
        else    boot_type = MANUALBOOT;

        if (0 == strlen(boot_type_str)) boot_type = AUTOBOOT;

        if (AUTOBOOT == boot_type) {
                (void) strcpy(host_name, Host_name);

                if (FALSE == command_mode)
                        if (FAILURE == set_default (PR_HOST_NAME, host_name))
                                return(FAILURE);

                status = get_parameter(PR_HOST_NAME,
                        host_name, sizeof(host_name));
                if (status != SUCCESS) return(FAILURE);

                if ((Fe_mode == TRUE) || (command_mode == TRUE)) {
                        status = get_parameter(PR_INET_PORT_NO,
                                port_string, sizeof(port_string));
                        if (status != SUCCESS) return(FAILURE);

                        port_number = atoi(port_string);
                }
        }

        status = lm_create_boot_file ( .ot_struct, modeler_name,
                        boot_type, host_name, port_number);
        if (status != SUCCESS) return(FAILURE);

        vprintf("Installed boot procedure for modeler \"%s\"\n", modeler_name);

        return(SUCCESS);
}



suffix(result_file, base_file, suffix)
        register        char    *result_file;
        register        char    *base_file;
        register        char    *suffix;
{
        register char *s;

#ifdef VMS
        if ((s = strrchr(base_file, ']')) != 0) {
                (void) strcpy(result_file, ++s);
        }
#else
        if ((s = strrchr(base_file, '/')) != 0) {
                (void) strcpy(base_file, ++s);
```

Copyright 1989
Logic Modeling Systems

SOURCE PROGRAM lm/main.c

DATE 5/23/89 TIME 1:20:36 pm PAGE # 11/45

LINE # SOURCE TEXT

```
        }

        (void) strcpy(result_file, base_file);
#endif

        if ((s = strrchr(result_file, '.')) != 0) {
                *s = '\0';
        }

        (void)strcat(result_file, suffix);
}



play_vectors ()

{       char    model_file[max_str];
        char    pattern_file[max_str];
        char    output_file[max_str];
        char    log_file[max_str];
        int     status;

        status = get_parameter(PR_MODEL_NAME,
                model_file, sizeof(model_file));
        if (status != SUCCESS) return(FAILURE);
        LM_CHECK(lm_resolve_library_file("LM_LIB",
                model_file, model_file, max_str));

        suffix (pattern_file, model_file, ".TST");
        if (FALSE == command_mode)
                if (FAILURE == set_default (PR_PATTERN_FILE, pattern_file))
                        return(FAILURE);

        status = get_parameter(PR_PATTERN_FILE,
                pattern_file, sizeof(pattern_file));
        if (status != SUCCESS) return(FAILURE);
        LM_CHECK(lm_resolve_library_file("LM_LIB",
                pattern_file, pattern_file, max_str));

        status = get_parameter(PR_OUTPUT_FILE,
                output_file, sizeof(output_file));
        if (status != SUCCESS) return(FAILURE);

        (void) strcpy (log_file, "");
        if (Fe_mode) {
                status = get_parameter(PR_LOG_FILE,
                        log_file, sizeof(log_file));
                if (status != SUCCESS) return(FAILURE);
        }

        vprintf("Playing vectors from file \"%s\"\n", pattern_file);
        (void) bobs_pattern_player (model_file,
                pattern_file, output_file, log_file, "");
        vprintf("Vector play completed\n");

        return(SUCCESS);
}



bobs_pattern_player (model_file_name, test_patterns, output_file, log_file, timing_file)
        char    *model_file_name, *test_patterns, *output_file, *log_file, *timing_file;

{       char    *modname;
        char    *devname;
        u_long  nsets;
        u_long  ngets;
        u_long  ntimes;
        u_long  nmaps;
        u_long  ndiscs;
        long    definition;
        long    instance;
        long    real_time;
        long    done_time;
        short   status;

        LM_CHECK(lm_set_simulation_tick ( 1 , LM_PICOSECONDS));
        LM_CHECK(lm_set_simulation_time ((unsigned int) 0, (unsigned int) 0));
        LM_CHECK(lm_set_logic_level_map (LM_LOGIC_ZERO, LM_LOGIC_ZERO));
        LM_CHECK(lm_set_logic_level_map (LM_LOGIC_SOFT_ZERO, LM_LOGIC_SOFT_ZERO));
        LM_CHECK(lm_set_logic_level_map (LM_LOGIC_ONE, LM_LOGIC_ONE));
        LM_CHECK(lm_set_logic_level_map (LM_LOGIC_SOFT_ONE, LM_LOGIC_SOFT_ONE));
        LM_CHECK(lm_set_logic_level_map (LM_LOGIC_FLOAT, LM_LOGIC_FLOAT));
        LM_CHECK(lm_set_logic_level_map (LM_LOGIC_UNKNOWN, LM_LOGIC_UNKNOWN));

    LM_CHECK(lm_create_definition_f (model_file_name, &definition, &modname, &devname));
    status = lm_check(lm_create_instance (definition, &instance, devname));
        (void) printf ("Playing to device \"%s\" on modeler \"%s\" \n", devname, modname);


    if (LM_SUCCESS == status) {

        if (strlen(output_file) == 0)
                output_file = LM_NO_FILE;

        status = lm_check(lm_reset_instance(instance));

        if (LM_SUCCESS == status) {
                if (strlen(log_file)>0)
                        (void) lm_check(lm_log_test_vectors(instance, LM_LOGGING_ON, log_file));

                if (strlen(timing_file)>0)
                        (void) lm_check(lm_timing_measurement(instance, LM_TIMING_ON, timing_file));

                real_time = (long) time ((long *)0);
                status = lm_check(lm_play_test_vectors (instance, test_patterns,
                                        output_file, 0, &nsets,
                                        &ngets, &ntimes, &nmaps, &ndiscs));
                done_time = (long) time((long *)0);
        }

    }

    if (LM_SUCCESS == status) {
        vprintf("\n");
        vprintf(" Device:         %s (%d signal pins) \n", devname, nmaps);
        vprintf(" Test Vectors:  %%d \n", ntimes);
        vprintf(" Pins set:       %%d \n", nsets);
        vprintf(" Pin Changes:    %%d \n", ngets);
        vprintf(" Discrepancies: %%d \n", ndiscs);
```

Copyright 1989 Logic Modeling Systems

SOURCE PROGRAM lm/main.c | DATE 5/23/89 | TIME 1:20:36 pm | PAGE # 12/46

LINE # SOURCE TEXT

```
        vprintf(" Elapsed Time:  %8d seconds \n", (done_time - real_time));
        vprintf("\n");
    }

    /* Clean up */

    if (strlen(log_file)>0)
        (void) lm_check(lm_log_test_vectors(instance, LM_LOGGING_OFF, log_file));

    if (strlen(timing_file)>0)
        (void) lm_check(lm_timing_measurement(instance, LM_TIMING_OFF, timing_file));

    (void) lm_check(lm_release_instance (instance));
    (void) lm_check(lm_release_definition (definition));

    return(status);
}

create_timing_file ()

{
        char    input_file_list[max_str];
        char    output_file_name[max_str];
        char    bus_mode[max_str];
        char    *next_file;
        char    *file_list;
static  FILE    *file_pointer = NULL;
        int     bus_mode_flag;
        int     status;
        char    *delimiter;
        char    delimiter_char;

        status = get_parameter(PR_TIM_FILE,
                input_file_list, sizeof(input_file_list));
        if (status != SUCCESS) return(FAILURE);

        status = get_parameter(PR_TMG_FILE,
                output_file_name, sizeof(output_file_name));
        if (status != SUCCESS) return(FAILURE);

        status = get_parameter(PR_BUS_MODE,
                bus_mode, sizeof(bus_mode));
        if (status != SUCCESS) return(FAILURE);

        bus_mode_flag =
                (('n' == bus_mode[0]) || ('N' == bus_mode[0]))? FALSE: TRUE;

        delimiter = strpbrk (input_file_list, " ,");
        if (delimiter != NULL) {
                delimiter_char = *delimiter;
        } else {
                delimiter_char = ',';
        }

        file_list = input_file_list;
        do {
                next_file = strchr(file_list, delimiter_char);
                if (next_file != NULL) {
                        * (char *) next_file = NULL;
                        next_file++;
                }

                clean_input (file_list);
                if (file_pointer != NULL) (void) fclose(file_pointer);

                file_pointer = fopen (file_list, "r");
                if (file_pointer == NULL) {
                        (void) fprintf(stderr, "%s: unable to open file %s for reading\n",
                                error_prefix, file_list);
                        return(FAILURE);
                }

                vprintf("Processing file %s\n", file_list);
                if (FAILURE == lm_filter_timing (file_pointer)) {
                        (void) fclose(file_pointer);
                        return(FAILURE);
                }

                file_list = next_file;
                (void) fclose(file_pointer);

        } while (next_file != NULL);

        if (file_pointer != NULL) (void) fclose(file_pointer);

        file_pointer = fopen (output_file_name, "w");
        if (file_pointer == NULL) {
                (void) fprintf(stderr, "%s: unable to open file %s for writing\n",
                                error_prefix, output_file_name);
                return(FAILURE);
        }

        vprintf("Creating timing file %s\n", output_file_name);
        if (FAILURE == lm_done_with_filter_timing (bus_mode_flag, file_pointer)) {
                (void) fclose(file_pointer);
                return(FAILURE);
        }

        vprintf("Timing file created\n");
        (void) fclose(file_pointer);
        return(SUCCESS);

}



locate_model_file ()

{
        char    filename[max_str];
        char    full_filename[max_str];
        long    status;

        status = get_parameter(PR_FILE_NAME, filename, sizeof(filename));
        if (status != SUCCESS) return(FAILURE);

        status = lm_resolve_filename ("LM_DIR", filename, full_filename, max_str, 0);
        if (status != LM_SUCCESS) {
                LM_CHECK(lm_resolve_library_file("LM_LIB", filename, full_filename, max_str));
        }
```

Copyright 1989 Logic Modeling Systems

LINE # SOURCE TEXT

```
        printf ("%s \n", full_filename);

        return(SUCCESS);
}



measure_timing ()

{
        char    model_file[max_str];
        char    pattern_file[max_str];
        char    output_file[max_str];
        char    timing_file[max_str];
        char    log_file[max_str];
        int     status;

        status = get_parameter(PR_MODEL_NAME,
                model_file, sizeof(model_file));
        if (status != SUCCESS) return(FAILURE);
        LM_CHECK(lm_resolve_library_file("LM_LIB", model_file, model_file, max_str));

        suffix (pattern_file, model_file, ".TST");
        if (FALSE == command_mode)
                if (FAILURE == set_default (PR_PATTERN_FILE, pattern_file))
                        return(FAILURE);

        status = get_parameter(PR_PATTERN_FILE,
                pattern_file, sizeof(pattern_file));
        if (status != SUCCESS) return(FAILURE);
        LM_CHECK(lm_resolve_library_file("LM_LIB", pattern_file, pattern_file, max_str));

        suffix (timing_file, model_file, ".TIM");
        if (FALSE == command_mode)
                if (FAILURE == set_default (PR_TIMING_FILE, timing_file))
                        return(FAILURE);

        status = get_parameter(PR_TIMING_FILE,
                timing_file, sizeof(timing_file));
        if (status != SUCCESS) return(FAILURE);

        status = get_parameter(PR_OUTPUT_FILE,
                output_file, sizeof(output_file));
        if (status != SUCCESS) return(FAILURE);

        (void) strcpy (log_file, "");
        if (Fe_mode) {
                status = get_parameter(PR_LOG_FILE,
                        log_file, sizeof(log_file));
                if (status != SUCCESS) return(FAILURE);
        }

        vprintf("Playing vectors from file \"%s\"\n", pattern_file);
        (void) bobs_pattern_player (model_file, pattern_file, output_file, log_file, timing_file);
        vprintf("Vector play completed\n");

        return(SUCCESS);
}


set_baudrate ()

{
        char    port[max_str];
        char    rate[max_str];
        char    modeler_name[max_str];
        long    status;
        char    real_rate;

        status = get_parameter(PR_MODELER_NAME,
                modeler_name, sizeof(modeler_name));
        if (status != SUCCESS) return(FAILURE);

        status = get_parameter(PR_BAUD_RATE,
                rate, sizeof(rate));
        if (status != SUCCESS) return(FAILURE);

        status = get_parameter(PR_PORT,
                port, sizeof(port));
        if (status != SUCCESS) return(FAILURE);

        if (FAILURE == check_password(modeler_name))
                return(FAILURE);

        real_rate = BAUD_96_12_24;
        if (0 == strcmp("300", rate)) real_rate = BAUD_300;
        if (0 == strcmp("1200", rate)) real_rate = BAUD_1200;
        if (0 == strcmp("2400", rate)) real_rate = BAUD_2400;
        if (0 == strcmp("4800", rate)) real_rate = BAUD_4800;
        if (0 == strcmp("9600", rate)) real_rate = BAUD_9600;
        if (0 == strcmp("2400+", rate)) real_rate = BAUD_24_96_12;
        if (0 == strcmp("9600+", rate)) real_rate = BAUD_96_12_24;

        if (0 == str_ncmp ("modem", port, strlen(port))) {

                LM_CHECK(lm_write (modeler_name, LM_NVSRAM_MEMORY, (u_long) 0,
                        (u_long) MODEM_BAUD, (u_long) SIZEOF_MODEM_BAUD,
                        (char *) &real_rate, &status));

                switch (real_rate) {
                        case (BAUD_24_96_12) : real_rate = BAUD_2400; break;
                        case (BAUD_96_12_24) : real_rate = BAUD_9600; break;
                }

                LM_CHECK(lm_write (modeler_name, LM_DUART_MODEM, (u_long) 0,
                        (u_long) 0, (u_long) 1,
                        (char *) &real_rate, &status));

        } else {

                LM_CHECK(lm_write (modeler_name,  (u_long)LM_NVSRAM_MEMORY,
                        (u_long) 0, (u_long) CONSOLE_BAUD,
                        (u_long) SIZEOF_CONSOLE_BAUD,
                        (char *)&real_rate, &status));

                switch (real_rate) {
                        case (BAUD_24_96_12) : real_rate = BAUD_2400; break;
                        case (BAUD_96_12_24) : real_rate = BAUD_9600; break;
                }
```

Copyright 1989 Logic Modeling Systems

SOURCE PROGRAM lm/main.c | DATE 5/23/89 | TIME 1:20:36 pm | PAGE # 14/48

LINE # SOURCE TEXT

```
			LM_CHECK(lm_write (modeler_name, (u_long) LM_DUART_CONSOLE,
				(u_long) 0, (u_long) 0, (u_long) 1,
				(char *)&new_rate, &status));
		}
		return(SUCCESS);
}



label()

{	int	status;
	char	lane[20], slot[20];
	char	device_name[max_str], manufacturer[max_str];
	char	modeler_name[max_str], dab_type[max_str], revision[max_str];
	char	maker[max_str], maker_rev[max_str];
	long	lane_number, slot_number;
	int	lanes_high;
	int	slots_wide;
	int	segment_number;
	long	dab_number, device_number;
	char	height[max_str], width[max_str];
	char	seg_str[max_str];

	segment_number = 0;

	status = get_parameter(PR_MODELER_NAME,
		modeler_name, sizeof(modeler_name));
	if (status != SUCCESS) return(FAILURE);

	LM_CHECK(lm_select_modeler(modeler_name));

	do {
		status = get_parameter(PR_LANE,
			lane, sizeof(lane));
		if (status != SUCCESS) return(FAILURE);

		status = get_parameter(PR_SLOT,
			slot, sizeof(slot));
		if (status != SUCCESS) return(FAILURE);

		if (isupper(lane[0])) lane[0] = tolower(lane[0]);

		lane_number = lane[0] - 'a';
		slot_number = atoi(slot);

	} while ((!command_mode) && (!Pe_mode) && (FAILURE ==
		check_for_dab (lane_number, slot_number, &device_number, &dab_number)));

	status = get_parameter(PR_DEVICE_NAME,
		device_name, sizeof(device_name));
	if (status != SUCCESS) return(FAILURE);

	status = get_parameter(PR_DAB_MAKER,
		maker, sizeof(maker));
	if (status != SUCCESS) return(FAILURE);

	status = get_parameter(PR_DAB_MAKER_REV,
		maker_rev, sizeof(maker_rev));
	if (status != SUCCESS) return(FAILURE);

	if ((Pe_mode == TRUE) || ((command_mode == TRUE) && (FAILURE ==
			check_for_dab (lane_number, slot_number, &device_number, &dab_number)))) {

		status = get_parameter(PR_SEGMENT,
			seg_str, sizeof(seg_str));
		if (status != SUCCESS) return(FAILURE);

		status = get_parameter(PR_MANUFACTURER,
			manufacturer, sizeof(manufacturer));
		if (status != SUCCESS) return(FAILURE);

		status = get_parameter(PR_REVISION,
			revision, sizeof(revision));
		if (status != SUCCESS) return(FAILURE);

		status = get_parameter(PR_DAB_TYPE,
			dab_type, sizeof(dab_type));
		if (status != SUCCESS) return(FAILURE);

		status = get_parameter(PR_LANES_HIGH,
			height, sizeof(height));
		if (status != SUCCESS) return(FAILURE);

		status = get_parameter(PR_SLOTS_WIDE,
			width, sizeof(width));
		if (status != SUCCESS) return(FAILURE);

		slots_wide = atoi (width);
		lanes_high = atoi (height);

	} else if ((command_mode == TRUE) && (SUCCESS ==
			check_for_dab (lane_number, slot_number, &device_number, &dab_number))){

		long	dab, device_number;
		long	number_of_locations, *lanes, *slots;
		long	max_slot, min_slot, max_lane, min_lane;
		long	pos;
		char	*ret_string;

		if (FAILURE == check_for_dab (lane_number, slot_number, &device_number, &dab))
			return(FAILURE);

		/* inquire device to determine size and upper left slot */

		LM_CHECK (lm_inquire_dab_location (device_number, dab,
				&number_of_locations, &lanes, &slots));

		min_lane = lanes[0]; min_slot = slots[0];
		max_lane = lanes[0]; max_slot = slots[0];

		for (pos = 0; pos < number_of_locations; pos++) {
			if (lanes[pos] < min_lane) min_lane = lanes[pos];
			if (slots[pos] < min_slot) min_slot = slots[pos];
			if (lanes[pos] > max_lane) max_lane = lanes[pos];
			if (slots[pos] > max_slot) max_slot = slots[pos];
		}

		lane_number = min_lane;
```

Copyright 1989 Logic Modeling Systems

| SOURCE PROGRAM | DATE | PAGE # |
|---|---|---|
| lm/main.c | 5/23/89 | 15/49 |
| | TIME 1:20:36 pm | |

LINE # SOURCE TEXT

```
                slot_number = min_slot;

                lanes_high = 1 + (max_lane - min_lane);
                slots_wide = 1 + (max_slot - min_slot);

                LM_CHECK(lm_inquire_dab(device_number, dab, LM_DAB_TYPE, &ret_string));
                (void) strcpy (dab_type, ret_string);

                LM_CHECK(lm_inquire_dab(device_number, dab, LM_DAB_REVISION, &ret_string));
                (void) strcpy (revision, ret_string);

                LM_CHECK(lm_inquire_dab(device_number, dab, LM_DAB_MANUFACTURER, &ret_string));
                (void) strcpy (manufacturer, ret_string);

                if (is_param_defined(PR_SEGMENT)) {
                        status = get_parameter(PR_SEGMENT, seg_str, sizeof(seg_str));
                        if (status != SUCCESS) return(FAILURE);
                }

                if (is_param_defined(PR_MANUFACTURER)) {
                        status = get_parameter(PR_MANUFACTURER, manufacturer, sizeof(manufacturer));
                        if (status != SUCCESS) return(FAILURE);
                }

                if (is_param_defined(PR_REVISION)) {
                        status = get_parameter(PR_REVISION, revision, sizeof(revision));
                        if (status != SUCCESS) return(FAILURE);
                }

                if (is_param_defined(PR_DAB_TYPE)) {
                        status = get_parameter(PR_DAB_TYPE, dab_type, sizeof(dab_type));
                        if (status != SUCCESS) return(FAILURE);
                }

                if (is_param_defined(PR_LANES_HIGH)) {
                        status = get_parameter(PR_LANES_HIGH, height, sizeof(height));
                        if (status != SUCCESS) return(FAILURE);
                        lanes_high = atoi (height);
                }

                if (is_param_defined(PR_SLOTS_WIDE)) {
                        status = get_parameter(PR_SLOTS_WIDE, width, sizeof(width));
                        if (status != SUCCESS) return(FAILURE);
                        slots_wide = atoi (width);
                }


        } else {

                long    dab, device_number;
                long    number_of_locations, *lanes, *slots;
                long    max_slot, min_slot, max_lane, min_lane;
                long    pos;
                char    *ret_string;

                if (FAILURE == check_for_dab (lane_number, slot_number, &device_number, &dab))
                        return(FAILURE);

                /* inquire device to determine size and upper left slot */

                LM_CHECK (lm_inquire_dab_location (device_number, dab,
                                &number_of_locations, &lanes, &slots));

                min_lane = lanes[0]; min_slot = slots[0];
                max_lane = lanes[0]; max_slot = slots[0];

                for (pos = 0; pos < number_of_locations; pos++) {
                        if (lanes[pos] < min_lane) min_lane = lanes[pos];
                        if (slots[pos] < min_slot) min_slot = slots[pos];
                        if (lanes[pos] > max_lane) max_lane = lanes[pos];
                        if (slots[pos] > max_slot) max_slot = slots[pos];
                }

                lane_number = min_lane;
                slot_number = min_slot;

                lanes_high = 1 + (max_lane - min_lane);
                slots_wide = 1 + (max_slot - min_slot);

                LM_CHECK(lm_inquire_dab(device_number, dab, LM_DAB_TYPE, &ret_string));
                (void) strcpy (dab_type, ret_string);

                LM_CHECK(lm_inquire_dab(device_number, dab, LM_DAB_REVISION, &ret_string));
                (void) strcpy (revision, ret_string);

                LM_CHECK(lm_inquire_dab(device_number, dab, LM_DAB_MANUFACTURER, &ret_string));
                (void) strcpy (manufacturer, ret_string);

        }

        LM_CHECK(lm_label_dab (lane_number, slot_number, dab_type, device_name, maker, maker_rev,
                        manufacturer, revision, lanes_high, slots_wide, segment_number));

        vprintf("\n");
        vprintf("Labeled Device Adapter in lane %c, slot %d\n", 'A' + lane_number, slot_number);
        vprintf("\n");

        return(SUCCESS);

}


check_for_dab (lane, slot, device_number, dab_number)
        long    lane;
        long    slot;
        long    *device_number;
        long    *dab_number;

{       long    number_of_devices, *list_of_devices;
        long    number_of_dabs, dab, device;
        long    number_of_locations, *lanes, *slots;
        long    pos;
        char    **list_of_device_names;

        /* return success if there is a dab here */

        LM_CHECK(lm_inquire_device_list(&number_of_devices, &list_of_devices, &list_of_device_names))

        for (device = 0; device < number_of_devices; device++, list_of_devices++, list_of_device_names++) {
                LM_CHECK(lm_inquire_device (*list_of_devices, LM_NUMBER_OF_DABS, &number_of_dabs));
```

Copyright 1989 Logic Modeling Systems

| SOURCE PROGRAM | DATE | TIME | PAGE # |
|---|---|---|---|
| lm/main.c | 5/23/89 | 1:20:36 pm | 16/50 |

LINE # SOURCE TEXT

```
                for (dab = 0; dab < number_of_dabs; dab++) {
                        LM_CHECK(lm_inquire_dab_location(*list_of_devices, dab, &number_of_locations, &lanes, &slots));
                        for (pos = 0; pos < number_of_locations; pos++) {
                                if ((lanes[pos]==lane) && (slots[pos]==slot)) {
                                        *device_number = *list_of_devices;
                                        *dab_number = dab;
                                        return (SUCCESS);
                                }
                        }
                }
        }

        (void) fprintf(stderr, "%s: no device adapter installed in lane %c slot %d\n",
                error_prefix, 'A' + lane, slot);

        return (FAILURE);

}

check_shell_software ()
{
        char    model_name[max_str];
        int     status;
        int     errors, warnings;
        char    *message;
        int     severity;

        errors = 0;
        warnings = 0;

        status = get_parameter(PR_MODEL_NAME,
                model_name, sizeof(model_name));
        if (status != SUCCESS) return(FAILURE);

        status = lm_check_shell_software_f(model_name);

        if (LM_SUCCESS != status) {
                do {
                        lm_get_message( &severity, &message);
                        if (severity == LM_ERROR) {
                                (void) fprintf(stderr,
                                        "LM modeler error: %s\n", message);
                                errors ++;
                        }

                        if (severity == LM_WARNING) {
                                (void) fprintf(stderr,
                                        "LM modeler warning: %s\n", message);
                                warnings ++;
                        }

                } while (severity != LM_NO_MORE_MESSAGES);
        }

        vprintf("\n\nModel \"%s\" checked with ", model_name);
        if (0 == errors)
                vprintf("no errors ");
        else if (1 == errors)
                vprintf("1 error ");
        else vprintf("%d errors ", errors);
        vprintf("and ");
        if (0 == warnings)
                vprintf("no warnings ");
        else if (1 == warnings)
                vprintf("1 warning ");
        else vprintf("%d warnings ", warnings);
        vprintf("\n");

        return(SUCCESS);
}



re_boot()

{       char    modeler_name[max_str];
        char    wait_string[max_str],   seconds_string[max_str];
        long    status;
        int     wait, seconds;
        BOOT_STRUCT     boot_save;

        status = get_parameter(PR_MODELER_NAME,
                modeler_name, sizeof(modeler_name));
        if (status != SUCCESS) return(FAILURE);

        if (FAILURE == check_password(modeler_name))
                return(FAILURE);

        if (SUCCESS != check_users(modeler_name))
                return (FAILURE);

        if (number_of_users(modeler_name)>1) {
                if (get_parameter(PR_WAIT, wait_string,
                    sizeof(wait_string)) != SUCCESS) return(FAILURE);
                if ((wait_string[0] == 'y') || (wait_string[0] == 'Y'))
                        wait = LM_TRUE; else wait = LM_FALSE;
        } else wait = LM_FALSE;

        if (get_parameter(PR_MINUTES, seconds_string,
            sizeof(seconds_string)) != SUCCESS) return(FAILURE);
        seconds = 60 * (atoi (seconds_string));

        vprintf("Rebooting modeler \"%s\" ", modeler_name);
        if (seconds > 0)
                vprintf("in %d minutes ", seconds/60);
        if (wait)
                vprintf("after all modeling sessions complete ");
        vprintf("\n");

        LM_CHECK(lm_select_modeler(modeler_name));

        LM_CHECK(lm_read(modeler_name, (u_long) LM_NVSRAM_MEMORY,
                (u_long) 0, (u_long) 0, (u_long) sizeof(BOOT_STRUCT),
                (char *) &boot_save, &status));


        LM_CHECK(lm_reboot(seconds, wait));
        if ((wait) || (boot_save.autoboot != LM_FALSE)) {
                vprintf ("Modeler \"%s\" will autoboot shortly \n", modeler_name);
                return (SUCCESS);
```

Copyright 1989
Logic Modeling Systems

| SOURCE PROGRAM | DATE | TIME | PAGE # |
|---|---|---|---|
| lm/main.c | 5/23/89 | 1:20:36 pm | 17/51 |

LINE # SOURCE TEXT

```
        }

        /* Reboot the modeler with core modeler code */

        return (downl...   ...eler_code (modeler_name, "modeler_code", BOOT_LIST));

}



boot ()

{       char    modeler_name[max_str];
        char    bootlist[max_str];
        char    mode_string[max_str];
        u_short mode;
        int     status;


        mode = TRUE;
        (void) strcpy (bootlist, BOOT_LIST);

        /* get parameters from the command line */

        status = get_parameter(PR_MODELER_NAME,
                modeler_name, sizeof(modeler_name));
        if (status != SUCCESS) return(FAILURE);

        if ((Fe_mode == TRUE) || (command_mode == TRUE)) {
                status = get_parameter(PR_BOOT_LIST,
                        bootlist, sizeof(bootlist));
                if (status != SUCCESS) return(FAILURE);

                status = get_parameter(PR_MODE,
                        mode_string, sizeof(mode_string));
                if (status != SUCCESS) return(FAILURE);

                if ((mode_string[0] == 'd') || (mode_string[0] == 'D'))
                        mode = FALSE;
        }

        if (!mode)
                return(download_modeler_code (modeler_name, "diagnostics", bootlist));

        if (SUCCESS == download_modeler_code (modeler_name, "boot_diags", bootlist)) {

                if (FAILURE == all_test(modeler_name)) {
                        vprintf ("Modeler \"%s\" failed diagnostics \n", modeler_name);
                        return(FAILURE);
                }
        }

        if (FAILURE == download_modeler_code (modeler_name, "modeler_code", bootlist))
                return(FAILURE);

        return(SUCCESS);

}



log_boot(modeler_name)
        char    *modeler_name;

{       char    filename[max_str];
        char    modeler_state;
        int     position;
        static  FILE    *stream = NULL;
        long    clock;
        char    *time_stamp_pointer;
        char    time_stamp[26];
        long    status;
        char    log_filename[max_str];
        int     new_file;

        modeler_state = -1;
        LM_CHECK( lm_read(modeler_name, (u_long) LM_NVSRAM_MEMORY,
                (u_long) 0, (u_long) MODELER_STATE,
                (u_long) SIZEOF_MODELER_STATE,
                (char *) &modeler_state, &status));

        switch (modeler_state) {
        case SHUTDOWN:
                vprintf("modeler \"%s\" was shutdown\n", modeler_name);
                (void) check_errors(modeler_name);
                break;
        case REBOOT:
                vprintf("modeler \"%s\" was rebooted\n", modeler_name);
                break;
        case BOOTME:
                vprintf("modeler \"%s\" is waiting to be booted\n",
                        modeler_name);
                break;
        case BOOTING:
                vprintf("modeler \"%s\" is being booted\n", modeler_name)
                return (FAILURE);
        case BOOTED:
                vprintf("modeler \"%s\" is booted\n",
                        modeler_name);
                return (FAILURE);
        case RUNNING_DIAGS:
                vprintf("modeler \"%s\" is running diagnostics\n",
                        modeler_name);
                return (FAILURE);
        case MODELER_RUNNING:
                vprintf("modeler \"%s\" is running\n",
                        modeler_name);
                return (FAILURE);
        default:
                vprintf("modeler \"%s\" was in an unknown state: %04x\n",
                        modeler_name, modeler_state);
                break;
        }

        (void) strcpy (log_filename, modeler_name);
        (void) strcat (log_filename, ".log");

        LM_CHECK (lm_resolve_filename (lm_path,
            log_filename, filename, (int) max_str, (int) 2));
```

Copyright 1989
Logic Modeling Systems

| SOURCE PROGRAM | DATE | 5/23/89 | PAGE # |
|---|---|---|---|
| lm/main.c | TIME | 1:20:36 pm | 18/52 |

LINE # SOURCE TEXT

```
        new_file = access (filename, 0);

        if (stream != NULL) (void) fclose(stream);
        stream = fopen (filename, "a");
        if (new_file) {
                /* try to set the protection to -rw-rw-rw */
                (void) chmod(filename, 0666);
        }
        if (NULL == stream) {
                (void) fprintf(stderr,
                        "%s: unable to open modeler log file \"%s\"\n",
                        error_prefix, filename);
                return(FAILURE);
        }

        clock = (long) time((long *)0);
        time_stamp_pointer = ctime(&clock);
        (void) strcpy (time_stamp, time_stamp_pointer);
        if (SUCCESS == russ_index(time_stamp, "\n", &position))
                time_stamp[position]= NULL;

        (void) fprintf(stream, "%s    Modeler booted by %s from %s\n",
                time_stamp, User_name, Host_name);
        (void) fclose(stream);

        modeler_state = BOOTING;

        LM_CHECK (lm_write (modeler_name, (u_long) LM_NVSRAM_MEMORY,
                (u_long) 0, (u_long) MODELER_STATE,
                (u_long) SIZEOF_MODELER_STATE,
                (char *)&modeler_state, &status));

        return (SUCCESS);

}



check_errors (modeler_name)
        char    *modeler_name;

{       char    error_condition;
        long    status;
static  FILE    *stream = NULL;
        char    filename[max_str];
        char    log_filename[max_str];
        int     new_file;

        (void) strcpy(log_filename, modeler_name);
        (void) strcat(log_filename, ".log");

        LM_CHECK (lm_resolve_filename(lm_path,
            log_filename, filename, (int) max_str, (int) 2));

        if (stream != NULL) (void) fclose(stream);
        new_file = access (filename, 0);
        stream = fopen (filename, "a");
        if (new_file) {
                /* try to set the protection to -rw-rw-rw */
                (void) chmod(filename, 0666);
        }
        if (NULL == stream) {
                (void) fprintf(stderr, "%s: Unable to open file: \"%s\"\n",
                        error_prefix, filename);
                return(FAILURE);
        }

        LM_CHECK(lm_read(modeler_name, (u_long) LM_NVSRAM_MEMORY,
                (u_long) 0, (u_long) MODELER_RESET,
                (u_long) SIZEOF_MODELER_RESET, (char *) &error_condition,
                &status));

        if ((error_condition != 0) &&
            (error_condition != SHUTDOWN) &&
            (error_condition != REMOTE_RESET))
        {
                (void) fprintf(stream,
                "*****************************************************\n");
                (void) fprintf(stream,
                "\n\nA fatal hardware error has been detected.\n");
                (void) fprintf(stream,
                "Run diagnostics or call Field Engineering.\n\n");
        }

        switch (error_condition) {

                case 0:
                case SHUTDOWN:
                case REMOTE_RESET:
                        (void) fclose(stream);
                        return (SUCCESS);

                case PARITY_ERROR:
                        (void) log_parity_error (modeler_name, stream);
                        break;

                case BACKPLANE_ERROR:
                        (void) log_backplane_error (modeler_name, stream);
                        break;

                case BUS_ERROR:
                        (void) log_bus_error (modeler_name, stream);
                        break;

                case SUICIDE:
                        (void) fprintf(stream, "SUISIDE\n");
                        break;

                case LANCE_ERROR:
                        (void) log_lance_error (modeler_name, stream);
                        break;

                case BAD_NVSRAM:
                        (void) log_nvs_ram_error (stream);
                        break;

                case OUTOFDATE_EPROMS:
                        (void) log_old_eproms (stream);
                        break;
```

Copyright 1989 Logic Modeling Systems

| SOURCE PROGRAM | DATE | PAGE # |
|---|---|---|
| lm/main.c | 5/23/89 | 19/53 |
| | TIME 1:20:36 pm | |

LINE # SOURCE TEXT

```
                case OUTOFDATE_HOST_UTILS:
                        (void) log_old_utils (stream);
                        break;

                default:
                        (void) fprintf(stream, "An unknown error occured. ");
                        (void) fprintf(stream, "Error code: 0x%x.\n",
                                error_condition);
                        break;

        }

        (void) fprintf(stream,
                "*******************************************************\n");

        error_condition = 0;    /* reset the error condition */

        LM_CHECK(lm_write(modeler_name, (u_long) LM_NVSRAM_MEMORY, (u_long) 0,
                (u_long) MODELER_STATE, (u_long) SIZEOF_MODELER_STATE,
                (char *)&error_condition, &status));

        (void) fclose(stream);
        return (SUCCESS);
}


log_parity_error (modeler_name, stream)
        char    *modeler_name;
        FILE    *stream;

{
        cpu_par_err_reg parity_error;
        long    status;

        LM_CHECK( lm_read(modeler_name, (u_long) LM_NVSRAM_MEMORY,
                (u_long) 0, (u_long) PARITY_ERR,
                (u_long) SIZEOF_PARITY_ERR, (char *) &parity_error, &status));

        (void) fprintf(stream, "PARITY ERROR ");
        (void) fprintf(stream, " 0x%x ", parity_error);

        (void) fprintf(stream, " - Bus Controlled by: ");

        if (!(parity_error.not_68020_master))      (void) fprintf(stream, "CPU ");
        else if (!(parity_error.not_VME_master))   (void) fprintf(stream, "VME ");
        else if (!(parity_error.not_LANCE_master)) (void) fprintf(stream, "LANCE ");
        else (void) fprintf(stream, "unknown ");

        (void) fprintf(stream, " - Byte: ");

        if (!(parity_error.not_error_hi)) (void) fprintf(stream, "1 ");
        if (!(parity_error.not_error_um)) (void) fprintf(stream, "2 ");
        if (!(parity_error.not_error_lm)) (void) fprintf(stream, "3 ");
        if (!(parity_error.not_error_lo)) (void) fprintf(stream, "4 ");

        (void) fprintf(stream, " - Address: ");
        (void) fprintf(stream, "0x%x\n", (parity_error.error_addr << 2));
        return (SUCCESS);
}

#define NUMBER_OF_MAGIC_CHIPS   5

log_backplane_error (modeler_name, stream)
char    *modeler_name;
FILE    *stream;
{
    /* Record backplane error in logfile */

        LM_HARDWARE_ERROR    hardware;
        long    status;
        int     lane, slot, pel, chip, bit;
        u_long    pel_control, data_valid;

    (void) fprintf(stream, "BACKPLANE ERROR ON MODELER %s\n",
        modeler_name);

    LM_CHECK(lm_read(modeler_name, (u_long) LM_NVSRAM_MEMORY,
        (u_long) 0, (u_long) HARDWARE_ERROR,
        (u_long) SIZEOF_HARDWARE_ERROR, (char *) &hardware, &status));

    if (hardware.error != 0)
        (void) fprintf(stream, "FATAL HARDWARE ERROR DETECTED\n");
    /* else return out of this routine ??? */

    if (hardware.tmg_error != 0) {
        (void) fprintf(stream, "Timing Generator error:\n");
        for (lane = 0; lane < NUMBER_OF_LANES; lane++) {
            if (( 1 & (hardware.lane_enable >> lane)) != 0) {
                switch (lane) {
                case (0) :
                    pel_control = hardware.lane_a_pel_control;
                    data_valid = hardware.lane_a_data_valid;
                    break;
                case (1) :
                    pel_control = hardware.lane_b_pel_control;
                    data_valid = hardware.lane_b_data_valid;
                    break;
                case (2) :
                    pel_control = hardware.lane_c_pel_control;
                    data_valid = hardware.lane_c_data_valid;
                    break;
                case (3) :
                    pel_control = hardware.lane_d_pel_control;
                    data_valid = hardware.lane_d_data_valid;
                    break;
                };
                (void) fprintf(stream,
                    "\tLane %c enabled, PEL control %x, Data valid %d\n",
                    'A' + lane, pel_control, data_valid);
            }
        }
    }

    for (lane = 0; lane < NUMBER_OF_LANES; lane++) {
        if (((hardware.lane_errors >> lane) & 1) == 0)
            continue;

        (void) fprintf(stream, "Lane %c errors:\n", 'A' + (char) lane);

        if (((hardware.pac_lane_errors >> lane) & 1) != 0) {
```

Copyright 1989 Logic Modeling Systems

LINE # SOURCE TEXT

```
            (void) fprintf(stream, "\tPattern Controller:\n");
            if (hardware.pac_error[lane].pac_refresh_error)
                (void) fprintf(stream, "\t\tRefresh Error\n");
            if (hardware.pac_error[lane].pac_request_error)
                (void) fprintf(stream, "\t\tRequest Error\n");
            if (hardware.pac_error[lane].pac_pattern_error)
                (void) fprintf(stream, "\t\tPattern Error\n");
            if (hardware.pac_error[lane].pac_control_word_parity_error) {
                (void) fprintf(stream,
                    "\t\tControl Word Parity Error\n");
            (void) fprintf(stream,
                "\t\t\tBranch Address: 0x%x, Block Offset: 0x%x\n",
                hardware.pac_error[lane].pac_branch_address,
                hardware.pac_error[lane].pac_block_offset);
            }

            if ((hardware.pac_error[lane].pac_high_word_parity_error)
              || (hardware.pac_error[lane].pac_low_word_parity_error)) {
                (void) fprintf(stream, "\t\tParity Error:");
                if (hardware.pac_error[lane].pac_high_word_parity_error)
                    (void) fprintf(stream, " high word");
                if (hardware.pac_error[lane].pac_low_word_parity_error)
                    (void) fprintf(stream, " low word");
                (void) fprintf(stream,
                    "\n\t\t\tParity Error Address: 0x%x\n",
                    hardware.pac_error[lane].pac_parity_error_address << 2);
            }
        }

        for (slot = 0; slot < NUMBER_OF_SLOTS; slot++) {
            pel = (lane * NUMBER_OF_SLOTS) + slot;
            if ((1 & (hardware.pel_error_list >> pel)) == 0) {
                    continue; /* no errors for this pel */
            }
            (void) fprintf(stream,
                "\tPin Electronics Module error in lane %c slot %d:\n",
                'A' + (char)lane, slot);

            if (hardware.pel_error[pel].dab_inserted & 1)
                (void) fprintf(stream, "\t\tDevice Adapter inserted\n");

            if (hardware.pel_error[pel].dab_removed & 1)
                (void) fprintf(stream, "\t\tDevice Adapter removed\n");

            if (hardware.pel_error[pel].play_error & 1)
                (void) fprintf(stream, "\t\tPlay to uninitialized module\n");

            if (hardware.pel_error[pel].any_magic_short & 1) {
                for (chip = 0; chip < NUMBER_OF_MAGIC_CHIPS; chip++) {
                    if (hardware.pel_error[pel].magic_short[chip] == 0)
                        continue;
                    (void) fprintf(stream,
                        "\t\tShorted pins on magic chip %d:\n\t\t\t", chip);
                    for (bit = 0; bit < 16; bit++) {
                        if (hardware.pel_error[pel].magic_short[chip]
                          & (1 << bit))
                            (void) fprintf(stream, "%2d ", (chip*16) + bit);
                    }
                    (void) fprintf(stream, "\n");
                }
            }

            if (hardware.pel_error[pel].any_magic_parity & 1) {
                (void) fprintf(stream,
                    "\t\tParity error on magic chip");
                for (chip = 0; chip < NUMBER_OF_MAGIC_CHIPS; chip++) {
                    if (hardware.pel_error[pel].magic_parity_out>>chip & 1 )
                        (void) fprintf(stream,
                            " %d", chip);
                }
                (void) fprintf(stream, "\n");
                (void) fprintf(stream,
                    "\t\t\tBranch Address: 0x%x, Block Offset: 0x%x\n",
                    hardware.pac_error[lane].pac_branch_address,
                    hardware.pac_error[lane].pac_block_offset);
            }
        }
    }
    return (SUCCESS);
}

log_bus_error (modeler_name, stream)
        char    *modeler_name;
        FILE    *stream;

{

        u_long  bus_error;
        u_short status_reg;
        u_short size;
        long    status;

        (void) fprintf(stream, "BUS ERROR");

        LM_CHECK( lm_read(modeler_name, (u_long) LM_NVSRAM_MEMORY,
                (u_long) 0, (u_long) BUS_ADDR,
                (u_long) SIZEOF_BUS_ADDR, (char *) &bus_error, &status));
        (void) fprintf(stream, " at address. %x\n", bus_error);

        LM_CHECK( lm_read(modeler_name, (u_long) LM_NVSRAM_MEMORY,
                (u_long) 0, (u_long) SSW_REG,
                (u_long) SIZEOF_SSW_REG, (char *) &status_reg, &status));
        if ((1<<15) & status_reg)
                (void) fprintf(stream,
                        "\t Fault on stage C of the instruction pipe\n");
        if ((1<<14) & status_reg)
                (void) fprintf(stream,
                        "\t Fault on stage B of the instruction pipe\n");
        if ((1<<13) & status_reg)
                (void) fprintf(stream,
                        "\t Rerun flag for stage C of the instruction pipe\n");
        if ((1<<12) & status_reg)
                (void) fprintf(stream,
                        "\t Rerun flag for stage B of the instruction pipe\n");
        if ((1<<8) & status_reg)
                (void) fprintf(stream,
                        "\t Fault on data cycle\n");
        if ((1<<7) & status_reg)
                (void) fprintf(stream,
                        "\t Fault on read/modify/write instruction\n");
        if ((1<<6) & status_reg)
```

Copyright 1989
Logic Modeling Systems

SOURCE PROGRAM lm/main.c

DATE 5/23/89 TIME 1:20:36 pm PAGE # 21/55

LINE # SOURCE TEXT

```
                (void) fprintf(stream, "\t Fault during READ ");
        else
                (void) fprintf(stream, "\t Fault during WRITE ");
        size = ((0x0030 & status_reg) >> 4);
        if (size == 0) (void) fprintf(stream, "BYTE operation\n");
        if (size == 1) (void) fprintf(stream, "WORD operation\n");
        if (size == 2) (void) fprintf(stream, "LONGWORD operation\n");
        return (SUCCESS);
}



log_lance_error (modeler_name, stream)
        char    *modeler_name;
        FILE    *stream;

{
        u_short lance_error;
        long    status;

        (void) fprintf(stream, "LANCE ERROR");

        LM_CHECK( lm_read(modeler_name, (u_long) LM_NVSRAM_MEMORY,
                (u_long) 0, (u_long) LANCE_CSR_REG,
                (u_long) SIZEOF_LANCE_CSR_REG, (char *) &lance_error, &status));
        (void) fprintf(stream, " 0x%x\n", lance_error);

        if (1 & (lance_error >> 14))
                (void) fprintf(stream, "\t Transmitter timeout error\n");
        if (1 & (lance_error >> 13))
                (void) fprintf(stream, "\t Collision error\n");
        if (1 & (lance_error >> 12))
                (void) fprintf(stream,
                        "\t Missed packet.  No space in receive buffers\n");
        if (1 & (lance_error >> 11))
                (void) fprintf(stream, "\t Memory error detected by LANCE\n");
        if (1 & (lance_error >> 5))
                (void) fprintf(stream, "\t LANCE transmitter turned off\n");
        return (SUCCESS);
}




log_nvs_ram_error (stream)
        FILE    *stream;
{
        (void) fprintf(stream,
                "NVS RAM has been corrupted.  Modeler must be re-installed\n");

}

log_old_eproms (stream)
        FILE    *stream;
{
        (void) fprintf(stream,
                "CPU EPROMs are not the current version, they must be replaced. \n");

}

log_old_utils (stream)
        FILE    *stream;
{
        (void) fprintf(stream,
                "An old version of the install procedure was used to install\n");
        (void) fprintf(stream,
                "this modeler.  The modeler must be re-installed with a newer version \n");
        (void) fprintf(stream,
                "of the installation program \n");


}





shut_down ()

{       char    modeler_name[max_str];
        char    wait_string[max_str];
        char    seconds_string[max_str];
        int     wait, seconds, status;
        char    reply[100];
        char    state;

        status = get_parameter(PR_MODELER_NAME,
                modeler_name, sizeof(modeler_name));
        if (status != SUCCESS) return(FAILURE);

        if (FAILURE == check_password(modeler_name))
                return(FAILURE);

        if (SUCCESS != check_users(modeler_name))
                return (FAILURE);

        if (number_of_users(modeler_name)>1) {
                status = get_parameter(PR_WAIT,
                        wait_string, sizeof(wait_string));
                if (status != SUCCESS) return(FAILURE);
                if ((wait_string[0] == 'y') || (wait_string[0] == 'Y'))
                        wait = LM_TRUE; else wait = LM_FALSE;
        } else wait = LM_FALSE;

        status = get_parameter(PR_MINUTES,
                seconds_string, sizeof(seconds_string));
        if (status != SUCCESS) return(FAILURE);
        seconds = 60 * (atoi (seconds_string));

        (void) lm_check(lm_select_modeler(modeler_name));
        status = lm_shutdown(seconds, wait);

        if (LM_ERROR == status) {
                lm_get_input ("Do you wish to force modeler shutdown? (y/n) ", reply, sizeof(reply));
                while (FAILURE == yes_or_no (reply)) {
                        lm_get_input ("Do you wish to force modeler shutdown? (y/n) ", reply, sizeof(reply));
                }
                if (('y' == reply[0]) || ('Y' == reply[0])) {
                        LM_CHECK(lm_remote_reset(modeler_name, &state));
                        vprintf("Modeler \"%s\" shutdown\n", modeler_name);
                        return(SUCCESS);
```

Copyright 1989 Logic Modeling Systems

SOURCE PROGRAM lm/main.c | DATE 5/23/89 | TIME 1:20:36 pm | PAGE # 22/56

LINE # SOURCE TEXT

```
		}
		else return(FAILURE);
	}

	(void) lm_check(status);

	if ((seconds == 0) && (!(wait)))
		vprintf("Modeler \"%s\" shutdown\n", modeler_name);
	else {
		vprintf("Shutting down modeler \"%s\" ", modeler_name);
		if (seconds > 0)
			vprintf("in %d minutes ", seconds/60);
		if (LM_TRUE == wait)
			vprintf("after all modeling sessions complete ");
		vprintf("\n");
	}

	return(SUCCESS);
}



lm_create_boot_file  (boot_struct, modeler_name,boot_type,host_name,port_number)
	BOOT_STRUCT	*boot_struct;
	char	*modeler_name;
	int	boot_type;
	char	*host_name;
	int	port_number;

{
	u_long  internet_address;

	(void) strcpy((char *) boot_struct->lmsi, "LMSI");
#ifdef VMS
	boot_struct->version = htons(EPROM_NVSRAM_VERSION);
	boot_struct->ethernet_packet_type = htons(LM_BOOT_PACKET_TYPE);
	boot_struct->internet_socket_number = htons(port_number);
#else
	boot_struct->version = EPROM_NVSRAM_VERSION;
	boot_struct->ethernet_packet_type = LM_BOOT_PACKET_TYPE;
	boot_struct->internet_socket_number = port_number;
#endif
	boot_struct->diagnostics = FALSE;

	(void) memcpy((char *) boot_struct->host_ethernet_address,
		"\0\0\0\0\0\0", 6);

	boot_struct->host_internet_address = 0;

	if (MANUALBOOT != boot_type) {

		if (FAILURE == get_internet_address(host_name, &internet_address)) {
			(void) fprintf(stderr, "%s: unknown host: \"%s\"\n",
				error_prefix, host_name);
			return(FAILURE);
		}
		boot_struct->host_internet_address = internet_address;
	}

	if (FAILURE == get_internet_address(modeler_name, &internet_address)) {
		(void) fprintf(stderr, "%s: unknown modeler: \"%s\"\n",
			error_prefix, modeler_name);
		return(FAILURE);
	}

	boot_struct->modeler_internet_address = internet_address;

	boot_struct->host_machine_type = LM_BOOT_MACHINE;
	boot_struct->autoboot = boot_type;

	if (FAILURE == send_file(modeler_name, boot_struct))
		return (FAILURE);

	return(SUCCESS);
}

get_internet_address (node_name, internet_address)
	char	*node_name;
	int	*internet_address;

{
	struct  hostent *address_structure;

	address_structure = (struct hostent *) gethostbyname (node_name);
	if (address_structure == NULL) return(FAILURE);
	*internet_address = * (unsigned int *) address_structure->h_addr;
	return(SUCCESS);

}

send_file (modeler, boot_struct)
	char	*modeler;
	BOOT_STRUCT	*boot_struct;

{
	long	status;

	LM_CHECK(lm_write(modeler, (u_long) LM_NVSRAM_MEMORY, (u_long) 0,
		(u_long) 0, (u_long) sizeof(BOOT_STRUCT),
		(char *) boot_struct, &status));

	return(SUCCESS);
}



u_exit ()
{
	(void) signal(SIGHUP, SIG_DFL);
	(void) signal(SIGINT, SIG_DFL);
	(void) signal(SIGTERM, SIG_DFL);

	vprintf("%s\n", command_mode? "": "\nEnding utilities session...");

	if (sigsetmask(0) == -1) {
		perror("sigsetmask");
	}

	local_end_modeling_session();
```

Copyright 1989 Logic Modeling Systems

SOURCE PROGRAM lm/main.c | DATE 5/23/89 | TIME 1:20:36 pm | PAGE # 23/57

LINE # SOURCE TEXT

```
        exit(0);
}


#define MAX_TRIES       3

check_password(modeler_name)
        char    *modeler_name;

{       u_long  count = 0;
        long    good_password;
        long    status;
        char    password[max_str];
        char    password_prompt[max_str];

        status = lm_select_modeler(modeler_name);
        if (status != LM_SUCCESS)
                return (SUCCESS);
                /* If we can't select a modeler, keep going */

        (void) lm_check (lm_inquire_modeler (LM_PASSWORD_CHECK, &good_password));

        while (LM_FALSE == good_password) {
                (void) sprintf(password_prompt, "Enter password for modeler \"%s\": ", modeler_name);
                prompt(password_prompt, password, sizeof(password));
                (void) lm_check (lm_password(LM_ENTER, password));
                (void) lm_check (lm_inquire_modeler (LM_PASSWORD_CHECK, &good_password));
                if (MAX_TRIES <= ++count) {
                        vprintf("%s: Too many password attempts \n", error_prefix);
                        return(FAILURE);
                }

        }
        return(SUCCESS);

}


prompt (prompt_string, return_buffer, buffer_size)
        char    *prompt_string;
        char    *return_buffer;
        int     buffer_size;

{
#ifdef SUNOS3_5
        int     (*save_stp_fn)(), handle_intr();
#else
        void    (*save_stp_fn)(), handle_intr();
#endif
extern  jmp_buf *Jmpbuf;
        jmp_buf jmpbuf;
        jmp_buf *save_jmpbuf = Jmpbuf;

        if (!setjmp(jmpbuf)) {

                Jmpbuf = (jmp_buf *)jmpbuf;
                save_stp_fn   = signal (SIGTSTP, lm_suspend);
                raw ();
                get_password(prompt_string, return_buffer, buffer_size);
        } else {
                Jmpbuf = save_jmpbuf;
                (void) signal (SIGTSTP, save_stp_fn);
                cook();
                (void) handle_intr(SIGINT);
        }

        Jmpbuf = save_jmpbuf;

        (void) signal (SIGTSTP, save_stp_fn);

        cook();

}



get_password (prompt, reply, len)
        char    *prompt;
        char    *reply;
        int     len;

{       char    c, *s;

        s = reply;

        (void) printf("%s", prompt);
        (void) fflush(stdout);
#ifndef VMS
        while ( ((c = getchar()) != LF) && (c != CR) && ((s-reply) < len) ) {
#else
        while ( ((c = vms_getchar()) != LF) && (c != CR) && ((s-reply) < len) ) {
#endif
                switch (c) {
                case BS:
                case DEL:
                        if (s > reply) --s;
                        break;
                default:
                        if (isprint(c)) {
                                *s++ = c;
                        } else {
                                putchar(ctrl(g));
                        }
                }
        }

        putchar('\n');
        *s = '\0';
}

#ifdef VMS
#include        <iodef>
#include        <ssdef>
#include        <descrip>


vms_getchar()
{       $DESCRIPTOR(device_name, "TT");

        struct {
```

Copyright 1989 Logic Modeling Systems

| SOURCE PROGRAM | DATE | PAGE # |
|---|---|---|
| lm/main.c | 5/23/89 | 24/58 |
| | TIME 1:20:36 pm | |

LINE # SOURCE TEXT

```
                unsigned short  condition_value;
                unsigned short  byte_count;
                unsigned long   status_bits;
        } io_status;

static  unsigned short  channel;
static  long            event_flag = -1;
        long            status;
        char            buffer[100];


        if (event_flag == -1) {
                status = SYS$ASSIGN (&device_name, &channel, 0, 0);

                if (status != SS$_NORMAL) {
                        LIB$SIGNAL (status);
                        return(0);
                }
                status = LIB$GET_EF(&event_flag);

                if (status != SS$_NORMAL) {
                        LIB$SIGNAL (status);
                        return(0);
                }

        }

        status = SYS$QIOW (event_flag, channel, IO$_READVBLK + IO$M_NOECHO + IO$M_NOFILTR,
                                &io_status, 0, 0, &buffer, 1, 0, 0, 0, 0);

        if (status != SS$_NORMAL) {
                LIB$SIGNAL (status);
                return(0);
        }

        return(*buffer);
}

#endif  /* VMS */
```

Copyright 1989
Logic Modeling Systems

| SOURCE PROGRAM | DATE | PAGE # |
|---|---|---|
| lm/menus.c | 5/23/89 | 1/59 |
| | TIME 1:20:39 pm | |

LINE # SOURCE TEXT

```
/* SCCS_ID: menus.c rev 3.1, 4/24/89 at 07:52:15 */

#include <stdio.h>
#include <ctype.h>
#include <varargs.h>
#include <setjmp.h>
#include <signal.h>
#include "common.h"
#include "lm_sfi.h"
#include "menus.h"
#include "lm_text.h"

static  long    current_depth = 0;

lm_display_menu (menu)
        LM_MENU *menu;

{
        LM_MENU_ITEM    *menu_item;
        long                    i, reply, quit_flag;
        char                    selection_string[max_str];

        ++current_depth;

        while (LM_TRUE) {

                print_menu (menu);

                diag_get_selection (selection_string);

                if (SUCCESS == built_in_commands (menu,
                    selection_string, &quit_flag)) {
                        if (quit_flag == LM_TRUE) {
                                current_depth--;
                                return(SUCCESS);
                        }

                } else {
                        reply = -1;
                        menu_item = menu->menu_items;
                        for (i = 0; i<menu->number_of_items; ++i) {
                                if (0 == str_cmp (selection_string, (menu_item + i)->selection))
                                        reply = i;
                        }

                        if ((reply > -1 ) && !((menu_item + reply)->attributes & LM_no_select)) {
                                menu -> current_selection = reply;
                                execute_routine (menu);
                                if (menu->menu_items[menu->current_selection].attributes & LM_automatic_quit) {
                                    current_depth--;
                                    return(SUCCESS);
                                }
                        } else (void) printf("Invalid selection: %s \n", selection_string);
                }
        }
}



built_in_commands (menu, selection_string, quit_flag)
        LM_MENU *menu;
        char    *selection_string;
        long    *quit_flag;

{       LM_MENU_ITEM    *menu_item;
        long            i;

        *quit_flag = LM_FALSE;

        if (0 == str_ncmp(selection_string, "quit",
            strlen(selection_string))) {
                *quit_flag = LM_TRUE;
                return(SUCCESS);
        }

        else if (0 == str_ncmp(selection_string, "help", strlen(selection_string))) {
                menu_item = menu->menu_items;
                if ((menu_item)->help_string == NULL)
                        (void) printf("Sorry, no help available \n");
                else {
                        lm_get_input ("Menu item: ", selection_string, max_str);
                        for (i = 0; i<menu->number_of_items; ++i) {
                                if (0 == str_cmp(selection_string, (menu_item + i)->selection)) {
                                        if ((menu_item)->help_string == NULL) {
                                                (void) printf("Sorry, no help available \n");
                                        } else {
                                                (void) printf ("\n%s\n", (menu_item + i)->help_string);
                                                lm_get_input ("[Press return to continue] ", selection_string, max_str);
                                        }
                                }
                        }
                }
                return(SUCCESS);
        }
        else if (0 == str_ncmp(selection_string, "exit", 1)) {
                u_exit(); /* never returns */
                return(SUCCESS);
        }
        else if (0 == str_cmp(selection_string, "field_engineering")) {
                lm_promote();
                return(SUCCESS);
        }

        return(FAILURE);
}

int Fe_mode = FALSE;

lm_promote()
{
        Fe_mode = TRUE;
}

print_menu (menu)
        LM_MENU *menu;

{       LM_MENU_ITEM    *menu_list;
        long                    i;

        (void) fprintf(stderr, "\n");
```

Copyright 1989
Logic Modeling Systems

SOURCE PROGRAM lm/menus.c

DATE 5/23/89 TIME 1:20:39 pm PAGE # 2/60

SOURCE TEXT

```
        (void) fprintf(stderr, "  %s  \n", menu->title);
        (void) fprintf(stderr, "\n");

        menu_list = menu->menu_items;

        for (i=0; i<menu->number_of_items; i++, menu_list++) {

                if (!(menu_list->attributes & LM_no_display))
                        (void) fprintf(stderr,  "%4s) %s \n", menu_list->selection, menu_list->menu_text);

        }

        menu_list = menu->menu_items;

        if ((menu_list)->help_string != NULL)
                (void) fprintf(stderr,  "%4s) %s \n", "h", " Help");

        (void) fprintf(stderr,  "%4s) %s \n", "q", " Quit");
}

diag_get_selection (string_reply)
        char    *string_reply;
{
        (void) fprintf(stderr, "\n");
        do {
                lm_get_input("selection: ", string_reply, max_str);
                clean_input (string_reply);
        } while (strlen(string_reply) == 0);

        (void) fprintf(stderr, "\n");

}

/* interrupts while executing should return user to the menu */

jmp_buf *Jmpbuf;

handle_intr(sig)
        int     sig;

{       if (sig == 0) sig = 1;
#ifndef lint
        longjmp(Jmpbuf, sig); /* sig better not be 0! why not? beacause
                                 sun4's will pass the 0 back as the
                                 return value to setjmp when you do
                                 the longjmp. That is a bad thing.*/
#else
        /* longjmp */(Jmpbuf, sig); /* lint is stupid. I'm smarter. */
#endif
}

execute_routine (menu)
        LM_MENU *menu;

{
#ifdef SUNOS3_5
    int (*save_intr_fcn)();
#else
    void (*save_intr_fcn)();
#endif
    jmp_buf jmpbuf, *save_jmpbuf = Jmpbuf;

    if (!(menu->menu_items[menu->current_selection].attributes
        & LM_no_execute)) {
        if (!setjmp(jmpbuf)) {
            Jmpbuf = (jmp_buf *)jmpbuf;
            save_intr_fcn = signal(SIGINT, handle_intr);
            if (menu->menu_items[menu->current_selection].attributes
              & LM_routine)
                local_begin_modeling_session();
            (*(menu->menu_items[menu->current_selection].action_routine))
                (menu->menu_items[menu->current_selection].user_data);
        }
        local_end_modeling_session();
        Jmpbuf = save_jmpbuf;
        (void) signal(SIGINT, save_intr_fcn);
    }
}

str_cmp (s1, s2)
        char    *s1, *s2;

{       long    l, i;
        char    c1, c2;


        l = strlen(s1);
        if (strlen(s2)>l) l = strlen(s2);

        for (i=0; i<l; i++) {
                c1 = s1[i];
                if (isupper(c1)) c1 = tolower(c1);
                c2 = s2[i];
                if (isupper(c2)) c2 = tolower(c2);
                if (c1 != c2) return (c1 - c2);
        }

        return(0);

}

str_ncmp (s1, s2, max)
        char    *s1, *s2;
        int     max;

{       long    l, i;
        char    c1, c2;


        l = strlen(s1);
        if (strlen(s2)>l) l = strlen(s2);
        if (max<l) l = max;

        for (i=0; i<l; i++) {
                c1 = s1[i];
                if (isupper(c1)) c1 = tolower(c1);
                c2 = s2[i];
                if (isupper(c2)) c2 = tolower(c2);
                if (c1 != c2) return (c1 - c2);
        }
```

Copyright 1989 Logic Modeling Systems

| SOURCE PROGRAM | DATE | TIME | PAGE # |
|---|---|---|---|
| lm/menus.c | 5/23/89 | 1:20:39 pm | 3/61 |

SOURCE TEXT

```
        return(0);

}

static int Modeling_session_in_progress = 0;

local_begin_modeling_session()
{
        extern char *User_name;
        extern char Host_name[];

        if (Modeling_session_in_progress == 0) {
                if (lm_check(lm_begin_modeling_session(LM_LOGIC_SIMULATOR, Host_name, User_name))
                    != LM_ERROR) {
                        Modeling_session_in_progress = 1;
                }
        }
}

local_end_modeling_session()
{
        if (Modeling_session_in_progress) {
                Modeling_session_in_progress = 0;
                lm_end_modeling_session();
        }
}
```

Copyright 1989
Logic Modeling Systems

HEADER FILE
lm/menus.h

DATE 5/23/89 | TIME 1:20:39 pm | PAGE # 1/62

LINE # HEADER TEXT

```
/* SCCS_ID: menus.h rev 3.1, 4/24/89 at 09:09:26 */

/*      Attribute fields */

#define LM_another_menu 0x0001 /* menu item is really a sub menu */
#define LM_routine      0x0002 /* menu item is a diagnostic routine */
#define LM_no_select    0x0004 /* menu item will not be selectable */
#define LM_no_display   0x0008 /* menu item will not be displayed */
#define LM_no_execute   0x0010 /* menu item will not be executed
                                        when "all" is selected */
#define LM_production_only      0x0020 /* menu item will display/execute
                                        in "production" only */
#define LM_no_repeat    0x0040 /* menu item cannot be repeated */
#define LM_automatic_quit       0x0080 /* quits after one selection */
#define LM_no_summary   0x0100 /* menu item will not display summary */

#define LM_null         (char *) 0

/*      Status word bit setting macros */


typedef struct {
        char    *selection; /* the character string for selecting the item */
        char    *menu_text; /* a description of the menu item */
        int     (* action_routine)(); /* the address of the routine to run */
        int     attributes; /* see attribute bits above */
        char    *user_data; /* pointer to user data, passed to user routine */
        char    *help_string;
} LM_MENU_ITEM;


typedef struct {
        char *title; /* the title of the menu */
        short number_of_items; /* number of items in the menu */
        short current_selection; /* index into menu_items */
        LM_MENU_ITEM *menu_items; /* address of the menu structure array */
} LM_MENU;

#define max_str         255
#define MAX_DEPTH       20


#define BS      8
#define CR      13
#define LF      10
#define DEL     127
#define ctrl(c) ('c' & 0x1f)

extern  int     lm_display_menu();


char lm_get_key();
char *lm_get_line();

extern int Fe_mode;
```

Copyright 1989 Logic Modeling Systems

SOURCE PROGRAM lm/tmgfiltr.c | DATE 5/23/89 | TIME 1:20:39 pm | PAGE # 1/63

SOURCE TEXT

```
/* SCCS_ID: tmgfiltr.c rev 1.2, 5/3/89 at 08:56:15 */

#include <stdio.h>
#include <ctype.h>
#include "common.h"

#define INITIAL_DELAY_TABLE      16384
#define INCREMENTAL_DELAY_TABLE 8192

#define LOW     0
#define HIGH    1
#define FLOAT   2

#define STATE(state)     s_array[state]

#define INVALID_COMPOSITE_INDEX 0xFFFFFFFF

#define NUMERIC_SUFFIX  0x01

typedef struct  delay {
        u_long  flag;
        char    *text;
        u_long  numeric;
        u_long  min_range;
        u_long  max_range;
        float   total;
        float   squared_total;
        u_long  number_of_elements;
        u_long  composite_index;
        char    *f_name;
        u_long  f_state;
        char    *t_name;
        u_long  t_state;
        u_long  minimum;
        u_long  maximum;
} DELAY;

static  int     heuristic;

static  FILE    *fpin;
static  FILE    *fpout;

static  u_long  delay_table_size = 0;
static  u_long  number_of_delays = 0;
static  DELAY   *delay_table = (DELAY *)NULL;

static  char    *s_array[] = { "low", "high", "float" };

#define vfprintf         (void) fprintf

#define MAXNAME 256
#define MAXLINE 1024

#define MAX_INTEGER      0xFFFFFFFF
#define MIN_INTEGER      0x0


#ifdef  DEBUG2
main(argc, argv)
int     argc;
char    **argv;
{
        FILE    *fp;

        int     i;
        int     bus_mode;
        int     error_condition;


        if (argc < 2) {
                vfprintf(stderr, "usage: %s file [file ...]\n", argv[0]);
                exit(EXIT_FATAL_ERROR);
        }

        bus_mode = FALSE;
        error_condition = FALSE;
        for(i=1; i<argc; ++i) {
                if ((fp=fopen(argv[i], "r")) == NULL) {
                        error_condition = TRUE;
                        vfprintf(stderr, "error: failure to open file %s for reading\n", argv[i]);
                }
                else {
                        if (lm_filter_timing(fp) != SUCCESS) {
                                error_condition = TRUE;
                        }
                        (void) fclose(fp);
                }
        }

        if (error_condition == FALSE) {
                if (lm_done_with_filter_timing(bus_mode, stdout) != SUCCESS) {
                        error_condition = TRUE;
                }
        }

        if (error_condition == TRUE)
                exit(EXIT_FATAL_ERROR);
        else exit(EXIT_NO_ERROR);
}
#endif  /* DEBUG2 */


lm_filter_timing(file_pointer_in)
FILE    *file_pointer_in;
{
        extern  char    *calloc();


        fpin = file_pointer_in;

        if ( (delay_table == (DELAY *)NULL) || (delay_table_size == 0) ) {
                delay_table_size = INITIAL_DELAY_TABLE;
                delay_table = (DELAY *) calloc((unsigned)delay_table_size, sizeof(DELAY));
                if (delay_table == (DELAY *) NULL) {
                        vfprintf(stderr, "error: failure to allocate host memory to store delay table\n");
                        return(FAILURE);
                }
        }

        if (read_in_information() != SUCCESS) {
```

Copyright 1989 Logic Modeling Systems

SOURCE PROGRAM lm/tmgfiltr.c

DATE 5/23/89 TIME 1:20:39 pm

PAGE # 2/64

LINE # SOURCE TEXT

```
                return(FAILURE);
        }

        return(SUCCESS);
}


lm_done_with_filter_timing(bus_mode, file_pointer_out)
int     bus_mode;
FILE    *file_pointer_out;
{
        u_long  i;

        int     error_condition;


        fpout = file_pointer_out;

        heuristic = bus_mode;

        error_condition = FALSE;
        if (process_information() != SUCCESS) {
                error_condition = TRUE;
        }
        else {
                if (print_results() != SUCCESS) {
                        error_condition = TRUE;
                }
        }

        for(i=0; i<number_of_delays; ++i) {
                if (delay_table[i].text != (char *)NULL)
                        (void) free(delay_table[i].text);
                if (delay_table[i].f_name != (char *)NULL)
                        (void) free(delay_table[i].f_name);
                if (delay_table[i].t_name != (char *)NULL)
                        (void) free(delay_table[i].t_name);
        }

        if (delay_table != (DELAY *)NULL)
                (void) free((char *)delay_table);

        number_of_delays = 0;
        delay_table_size = 0;
        delay_table = (DELAY *)NULL;

        if (error_condition == TRUE)
                return(FAILURE);
        else return(SUCCESS);
}


static
read_in_information()
{
        int     rtn;
        int     line_no;
        int     error_condition;
        int     max_errors_to_print;

        int     timestamp;
        int     current_timestamp;

        char    delay[MAXNAME];
        char    from[MAXNAME];
        char    f_state[MAXNAME];
        char    f_name[MAXNAME];
        char    to[MAXNAME];
        char    t_state[MAXNAME];
        char    t_name[MAXNAME];
        char    equals[MAXNAME];
        char    min[MAXNAME];
        char    max[MAXNAME];

        char    *ptr;
        char    line[MAXLINE];


        line_no = 0;
        error_condition = 0;
        current_timestamp = 0;
        max_errors_to_print = 10;
        while(fgets(line, MAXLINE, fpin) != NULL) {
                ++line_no;

                ptr = line + strspn(line, " \t");
                if (strncmp(ptr, "device", 6) == 0) {
                        continue;       /* Throw away lines with device information. */
                }
                else if (*ptr == '\n') {
                        continue;       /* Throw away white space lines. */
                }

                rtn=sscanf(line, "%d %s %s %[^\t (] ( %[^\t )] ) %s %[^\t (] ( %[^\t )] ) %s %[^\t ,] , %s",
                        &timestamp,
                        delay,
                        from,
                        f_state, f_name,
                        to,
                        t_state, t_name,
                        equals,
                        min, max
                );

                if (strcmp(delay, "delay") != 0) {
                        vfprintf(stderr, "error: expected a token \"delay\", instead got a token \"%s\" on line number %d:\n\t%s", delay, line
                        _no, line);
                        ++error_condition;
                        continue;
                }
                if (rtn != 11) {
                        vfprintf(stderr, "error: expected exactly 11 tokens on line number %d:\n\t%s", line_no, line);
                        ++error_condition;
                        continue;
                }
                if (strcmp(from, "from") != 0) {
                        vfprintf(stderr, "error: expected a token \"from\", instead got a token \"%s\" on line number %d:\n\t%s", from, line_n
                        o, line);
                        ++error_condition;
                        continue;
```

Copyright 1989 Logic Modeling Systems

SOURCE PROGRAM lm/tmgfiltr.c

DATE 5/23/89 TIME 1:20:39 pm PAGE # 3/65

SOURCE TEXT

```
		}
		if (strcmp(to, "to") != 0) {
			vfprintf(stderr, "error: expected a token \"to\", instead got a token \"%s\" on line number %d:\n\t%s", to, line_no, l
			ine);
			++error_condition;
			continue;
		}
		if (strcmp(equals, "=") != 0) {
			vfprintf(stderr, "error: expected a token \"=\", instead got a token \"%s\" on line number %d:\n\t%s", equals, line_no
			, line);
			++error_condition;
			continue;
		}

		if (timestamp > current_timestamp) {
			current_timestamp = timestamp;
		}
		else if (timestamp < current_timestamp) {
			vfprintf(stderr, "error: decreasing time on line number %d:\n\t%s", line_no, line);
			++error_condition;
			continue;
		}

		delay_table[number_of_delays].composite_index = INVALID_COMPOSITE_INDEX;

		if (nameenter(&delay_table[number_of_delays].f_name, f_name) != SUCCESS) {
			++error_condition;
			continue;
		}
		if (nameenter(&delay_table[number_of_delays].t_name, t_name) != SUCCESS) {
			++error_condition;
			continue;
		}
		intenter(&delay_table[number_of_delays].minimum, min);
		intenter(&delay_table[number_of_delays].maximum, max);

		if (state_enter(&delay_table[number_of_delays].f_state, f_state) != SUCCESS) {
			vfprintf(stderr, "error: expected a token \"low\", \"high\", or \"float\", instead got a token \"%s\" on line number %
			d:\n\t%s", f_state, line_no, line);
			++error_condition;
			continue;
		}
		if (state_enter(&delay_table[number_of_delays].t_state, t_state) != SUCCESS) {
			vfprintf(stderr, "error: expected a token \"low\", \"high\", or \"float\", instead got a token \"%s\" on line number %
			d:\n\t%s", t_state, line_no, line);
			++error_condition;
			continue;
		}

		/* Initialize all other flags */
		delay_table[number_of_delays].flag = 0;
		delay_table[number_of_delays].text = (char *)NULL;
		delay_table[number_of_delays].numeric = 0;
		delay_table[number_of_delays].min_range = 0;
		delay_table[number_of_delays].max_range = 0;
		delay_table[number_of_delays].total = 0.0;
		delay_table[number_of_delays].squared_total = 0.0;
		delay_table[number_of_delays].number_of_elements = 0;

		if (++number_of_delays >= delay_table_size) {
			if (increase_delay_table_size() != SUCCESS) {
				return(FAILURE);
			}
		}

		if (error_condition > max_errors_to_print) {
			vfprintf(stderr, "error: too many errors found: %d, giving up\n", error_condition);
			return(FAILURE);
		}
	}

	if (error_condition > 0)
		return(FAILURE);
	else return(SUCCESS);
}


static
nameenter(dest, src)
char	**dest;
char	*src;
{
	int	last;

	char	*ptr;
	char	temp[MAXNAME];


	last = strlen(src) - 1;

	/* If "src" is a legal name or already has quotes, use "src" */
	if ( ((isalpha(*src))||(*src=='_')) && (rest_of_string_is_alnum(src)==TRUE) ||
	     (*src=='\'' && src[last]=='\'') || (*src=='"' && src[last]=='"') )
	{
		if (strenter(dest, src) != SUCCESS) {
			return(FAILURE);
		}
	}
	else {	/* else, quote the name */
		temp[0] = '\'';
		for(ptr=temp; *src!='\0'; /**/) {
			if (*src == '\'')		/* double up single quotes */
				*++ptr = '\'';
			*++ptr = *src++;
		}
		*++ptr = '\'';
		*++ptr = '\0';
		if (strenter(dest, temp) != SUCCESS) {
			return(FAILURE);
		}
	}

	return(SUCCESS);
}


static
rest_of_string_is_alnum(src)
char	*src;
{
```

Copyright 1989 Logic Modeling Systems

SOURCE PROGRAM: lm/tmgfiltr.c

DATE 5/23/89 TIME 1:20:39 pm

PAGE # 4/66

LINE # SOURCE TEXT

```
        register        char    c;

        while((c = *++src) != '\0') {
                if ( c != '_' && !isalnum
                        return(FALSE);
        }

        return(TRUE);
}


static
strenter(dest, src)
char    **dest;
char    *src;
{
        if ((*dest=malloc((unsigned)(strlen(src)+1))) == (char *) NULL) {
                vfprintf(stderr, "error: failure to allocate host memory to store delay information\n");
                return(FAILURE);
        }

        (void) strcpy(*dest, src);

        return(SUCCESS);
}


static
intenter(dest, src)
u_long  *dest;
char    *src;
{
        extern  double  atof();


        *dest = (u_long) (atof(src) * 1000.0);
}


static
state_enter(dest, src)
u_long  *dest;
char    *src;
{
        int     i;


        for(i=0; i<sizeof(s_array)/sizeof(char *); ++i) {
                if (strcmp(s_array[i], src) == 0) {
                        *dest = i;
                        return(SUCCESS);
                }
        }

        return(FAILURE);
}


static
increase_delay_table_size()
{
        DELAY   *ptr;

        extern  char    *realloc();


        delay_table_size += INCREMENTAL_DELAY_TABLE;
        ptr = (DELAY *) realloc((char *)delay_table, (unsigned)(delay_table_size*sizeof(DELAY)));
        if (ptr == (DELAY *) NULL) {
                vfprintf(stderr, "error: failure to allocate host memory for internal delay table\n");
                return(FAILURE);
        }

        delay_table = ptr;

        return(SUCCESS);
}


static
process_information()
{
        int     compare();

#ifdef VMS
        vms_qsort((char *)delay_table, (int) number_of_delays, sizeof(DELAY), compare);
#else
        qsort((char *)delay_table, (int) number_of_delays, sizeof(DELAY), compare);
#endif  /* VMS */

        if (collapse_same_delays() != SUCCESS) {
                return(FAILURE);
        }

        if (create_composite_delays() != SUCCESS) {
                return(FAILURE);
        }

        if (heuristic == TRUE) {
                if (create_busses() != SUCCESS) {
                        return(FAILURE);
                }
        }

        return(SUCCESS);
}


static
compare(delay1, delay2)
register        DELAY   *delay1;
register        DELAY   *delay2;
{
        int     rtn;


        if (heuristic == TRUE) {
                /* Note that the order is extremely important to the bus creation routine. */
                rtn = xstrcmp(delay1->f_name, delay2->f_name);
                if (rtn != 0) return(rtn);
```

Copyright 1989 Logic Modeling Systems

LINE # SOURCE TEXT

```
                if (delay1->f_state < delay2->f_state)
                        return(-1);
                else if (delay1->f_state > delay2->f_state)
                        return(1);

                if (delay1->t_state < delay2->t_state)
                        return(-1);
                else if (delay1->t_state > delay2->t_state)
                        return(1);

                rtn = xstrcmp(delay1->t_name, delay2->t_name);
                if (rtn != 0) return(rtn);
        }
        else {
                rtn = xstrcmp(delay1->f_name, delay2->f_name);
                if (rtn != 0) return(rtn);

                if (delay1->f_state < delay2->f_state)
                        return(-1);
                else if (delay1->f_state > delay2->f_state)
                        return(1);

                rtn = xstrcmp(delay1->t_name, delay2->t_name);
                if (rtn != 0) return(rtn);

                if (delay1->t_state < delay2->t_state)
                        return(-1);
                else if (delay1->t_state > delay2->t_state)
                        return(1);
        }

        return(0);
}


static
collapse_same_delays()
{
        u_long  i;
        u_long  base_i;
        u_long  current_composite_index;


        base_i = 0;
        current_composite_index = 1;

        /* Setup the first element. */
        delay_table[base_i].total =
                (float)delay_table[base_i].minimum + (float)delay_table[base_i].maximum;
        delay_table[base_i].squared_total =
                (float) delay_table[base_i].minimum * (float) delay_table[base_i].minimum +
                (float) delay_table[base_i].maximum * (float) delay_table[base_i].maximum;
        delay_table[base_i].number_of_elements = 2;
        delay_table[base_i].composite_index = current_composite_index;

        for(i=1; i<number_of_delays; ++i) {
                /* Note that composite_index was set to INVALID above. */

                if (same_to_and_from_name_and_state(base_i, i) == TRUE) {
                        delay_table[base_i].composite_index = current_composite_index;

                        delay_table[base_i].total +=
                                (float)delay_table[i].minimum + (float)delay_table[i].maximum;
                        delay_table[base_i].squared_total +=
                                (float)delay_table[i].minimum * (float)delay_table[i].minimum +
                                (float)delay_table[i].maximum * (float)delay_table[i].maximum;
                        delay_table[base_i].number_of_elements += 2;

                        if (delay_table[base_i].minimum > delay_table[i].minimum)
                                delay_table[base_i].minimum = delay_table[i].minimum;
                        if (delay_table[base_i].maximum < delay_table[i].maximum)
                                delay_table[base_i].maximum = delay_table[i].maximum;
                }
                else {
                        base_i = i;
                        ++current_composite_index;

                        delay_table[i].total =
                                (float)delay_table[i].minimum + (float)delay_table[i].maximum;
                        delay_table[i].squared_total =
                                (float)delay_table[i].minimum * (float)delay_table[i].minimum +
                                (float)delay_table[i].maximum * (float)delay_table[i].maximum;
                        delay_table[i].number_of_elements = 2;
                        delay_table[i].composite_index = current_composite_index;
                }
        }

        return(SUCCESS);
}


static
same_to_and_from_name_and_state(i, next_i)
u_long  i;
u_long  next_i;
{
        if (next_i >= number_of_delays) {
                return(FALSE);
        }

        if ( (delay_table[i].f_state == delay_table[next_i].f_state) &&
             (delay_table[i].t_state == delay_table[next_i].t_state) &&
             (strcmp(delay_table[i].f_name, delay_table[next_i].f_name) == 0) &&
             (strcmp(delay_table[i].t_name, delay_table[next_i].t_name) == 0) )
        {
                return(TRUE);
        }

        return(FALSE);
}


static
create_composite_delays()
{
        u_long  i;
        u_long  base_i;
        u_long  current_composite_index;
```

Copyright 1989 Logic Modeling Systems

SOURCE PROGRAM lm/tmgfiltr.c

DATE 5/23/89 TIME 1:20:39 pm PAGE # 6/68

LINE # SOURCE TEXT

```
	base_i = 0;
	current_composite_index = 1;
	for(i=1; i<number_of_delays; ++i) {
		if (delay_table[i].composite_index == INVALID_COMPOSITE_INDEX) {
			continue;
		}

		delay_table[base_i].composite_index = current_composite_index;
		if (same_from_name_and_state(base_i, i) == TRUE) {
			delay_table[i].composite_index = current_composite_index;
		}
		else {
			base_i = i;
			++current_composite_index;
		}
	}

	return(SUCCESS);
}


static
same_from_name_and_state(i, next_i)
u_long  i;
u_long  next_i;
{
	if (next_i >= number_of_delays) {
		return(FALSE);
	}

	if ( (delay_table[i].f_state == delay_table[next_i].f_state) &&
	     (strcmp(delay_table[i].f_name, delay_table[next_i].f_name) == 0) )
	{
		return(TRUE);
	}

	return(FALSE);
}


static
create_busses()
{
	if (find_numeric_suffixes() != SUCCESS) {
		return(FAILURE);
	}

	if (collapse_busses() != SUCCESS) {
		return(FAILURE);
	}

	return(SUCCESS);
}


static
find_numeric_suffixes()
{
	u_long  i;

	char    *ptr;
	char    temp[MAXNAME];


	for(i=0; i<number_of_delays; ++i) {
		(void)strcpy(temp, delay_table[i].t_name);

		delay_table[i].flag = 0;
		delay_table[i].text = (char *)NULL;
		delay_table[i].numeric = 0;

		if (isdigit(temp[strlen(temp)-1])) {
			delay_table[i].flag = NUMERIC_SUFFIX;

			for(ptr = &temp[strlen(temp)-1]; isdigit(*ptr); --ptr)
				;	/* Just back up */

			delay_table[i].numeric = atoi(ptr+1);
			delay_table[i].min_range = delay_table[i].numeric;
			delay_table[i].max_range = delay_table[i].numeric;

			*++ptr = '\0';	/* Trash numeric suffix */
			if (strcatr(&delay_table[i].text, temp) != SUCCESS) {
				return(FAILURE);
			}
		}
	}

	return(SUCCESS);
}


static
collapse_busses()
{
	u_long  i;
	u_long  base_i;


	base_i = 0;	/* Start with element zero. */

	for(i=1; i<number_of_delays; ++i) {
		if (delay_table[i].composite_index == INVALID_COMPOSITE_INDEX) {
			continue;
		}

		if ( (delay_table[base_i].flag == NUMERIC_SUFFIX) &&
		     (delay_table[i].flag == NUMERIC_SUFFIX) &&
		     (delay_table[base_i].max_range+1 == delay_table[i].numeric) &&
		     (delay_table[base_i].f_state == delay_table[i].f_state) &&
		     (delay_table[base_i].t_state == delay_table[i].t_state) &&
		     (strcmp(delay_table[base_i].text, delay_table[i].text) == 0) )
		{
			delay_table[base_i].max_range = delay_table[i].numeric;
			delay_table[base_i].total += delay_table[i].total;
			delay_table[base_i].squared_total += delay_table[i].squared_total;
			delay_table[base_i].number_of_elements += delay_table[i].number_of_elements;

			if (delay_table[base_i].minimum > delay_table[i].minimum)
```

Copyright 1989 Logic Modeling Systems

SOURCE PROGRAM lm/tmgfiltr.c

DATE 5/23/89 TIME 1:20:39 pm PAGE # 7/69

SOURCE TEXT

```
					delay_table[base_i].minimum = delay_table[i].minimum;
				if (delay_table[base_i].maximum < delay_table[i].maximum)
					delay_table[base_i].maximum = delay_table[i].maximum;
				delay_table[i].composite_index = INVALID_COMPOSITE_INDEX;

			}
			else {
				base_i = i;
			}
	}

	return(SUCCESS);
}


#define PREFERRED_EQUAL_WIDTH   24
#define PREFERRED_COMMENT_WIDTH 40

static
print_results()
{
	int	len;
	int	spaces;

	u_long	i;
	u_long	current_composite_index;

	extern	double	standard_deviation();


	current_composite_index = INVALID_COMPOSITE_INDEX;
	for(i=0; i<number_of_delays; ++i) {
		if (delay_table[i].composite_index == INVALID_COMPOSITE_INDEX) {
			continue;
		}

		if (current_composite_index != delay_table[i].composite_index) {
			current_composite_index = delay_table[i].composite_index;
			vfprintf(fpout, "delay from %s(%s)\n",
				STATE(delay_table[i].f_state),
				delay_table[i].f_name
			);
		}

		if (delay_table[i].min_range == delay_table[i].max_range) {
			len = fprintf(fpout, "    to %s(%s)",
				STATE(delay_table[i].t_state),
				delay_table[i].t_name
			);
		}
		else {
			len = fprintf(fpout, "    to %s(%s[%d:%d])",
				STATE(delay_table[i].t_state),
				delay_table[i].text,
				delay_table[i].min_range,
				delay_table[i].max_range
			);
		}


		if (len < PREFERRED_EQUAL_WIDTH)
			spaces = PREFERRED_EQUAL_WIDTH - len;
		else spaces = 8 - len%8;

		len += fprintf(fpout, "%*s= %g, %g",
			spaces, " ",
			(((float)delay_table[i].minimum) / 1000.0),
			(((float)delay_table[i].maximum) / 1000.0)
		);

		if (len < PREFERRED_COMMENT_WIDTH)
			spaces = PREFERRED_COMMENT_WIDTH - len;
		else spaces = 8 - len%8;

		vfprintf(fpout, "%*s(Samples=%3d, Mean=%4.1f, Std dev=%8.2f)\n",
			spaces, " ",
			delay_table[i].number_of_elements,
			delay_table[i].total / delay_table[i].number_of_elements / 1000.0,
			(float) (standard_deviation(i) / 1000.0)
		);
	}

	return(SUCCESS);
}


static  double
standard_deviation(index)
u_long  index;
{
	double  total;
	double  squared;
	double  elements;

	extern  double  fabs();
	extern  double  sqrt();

	/*
	 *	standard deviation =
	 *		square_root((summation of (Xi^2) - N(mean^2))/(N-1))
	 *				or
	 *		square_root((summation of (Xi^2) - (total^2)/N)/(N-1))
	 *				or
	 *		square_root(squared_total - (total*total)/N)/(N-1))
	 */

	total = (double) delay_table[index].total;
	squared = (double) delay_table[index].squared_total;
	elements = (double) delay_table[index].number_of_elements;

	return(sqrt(fabs( (squared - total * total / elements) / (elements - 1.0) ) ) );
}


static
xstrcmp(str1, str2)
register	char *str1;
register	char *str2;
{
   /* This xstrcmp function orders subscripted names correctly, i.e.
    * "A31" is greater than "A5"
```

Copyright 1989 Logic Modeling Systems

SOURCE PROGRAM lm/tmgfiltr.c | DATE 5/23/89 | TIME 1:20:39 pm | PAGE # 8/70

SOURCE TEXT

```
 * stolen from Robert's sfl/util.c
 */

    u_long  str1_len;
    u_long  str2_len;
    u_long  subscript1;
    u_long  subscript2;
    char    *str1_subscript;
    char    *str2_subscript;
    char    *limit;
    char    save_char1;
    char    save_char2;
    u_char  str1_has_subscript = FALSE;
    u_char  str2_has_subscript = FALSE;

    str1_len = strlen(str1);
    str2_len = strlen(str2);

    if (isdigit(str1[str1_len - 1]))
       str1_has_subscript = TRUE;

    if (isdigit(str2[str2_len - 1]))
       str2_has_subscript = TRUE;

    if (! ((str1_has_subscript == TRUE) && (str2_has_subscript == TRUE))) {
       return(strcmp(str1, str2));
    }

    /* Scan from the end of the string. At the end of the while loop,
     * str1_subscript will point to the last non-digit character, or
     * point to the len -1 of the string if the string is all digits
     */
    str1_subscript = &str1[str1_len - 1];
    limit = &str1[0];
    while ((long)str1_subscript >= (long)limit) {
       if (isdigit(*str1_subscript))
          --str1_subscript;
       else
          break;
    }
    ++str1_subscript;

    str2_subscript = &str2[str2_len - 1];
    limit = &str2[0];
    while ((long)str2_subscript >= (long)limit) {
       if (isdigit(*str2_subscript))
          --str2_subscript;
       else
          break;
    }
    ++str2_subscript;

    save_char1 = *str1_subscript;
    save_char2 = *str2_subscript;

    *str1_subscript = '\0';
    *str2_subscript = '\0';

    if (strcmp(str1, str2) == 0) {
       /* The non digit part of the string matches ---> look at the subscript */

       *str1_subscript = save_char1;
       *str2_subscript = save_char2;

       (void)sscanf(str1_subscript, "%d", &subscript1);
       (void)sscanf(str2_subscript, "%d", &subscript2);

       if (subscript1 > subscript2)
          return(1);
       else if (subscript1 < subscript2)
          return(-1);
       else
          return(0);
    }

    *str1_subscript = save_char1;
    *str2_subscript = save_char2;

    return(strcmp(str1, str2));
}
#ifdef  DEBUG


static
print_delay_table()
{
        u_long  i;


        for(i=0; i<number_of_delays; ++i) {
                vfprintf(stdout, "0x%X ", delay_table[i].composite_index);
                if (delay_table[i].flag == NUMERIC_SUFFIX) {
                        vfprintf(stdout, "%s(%d) ",
                                delay_table[i].text,
                                delay_table[i].numeric
                        );
                }
                vfprintf(stdout, "delay from %s(%s) to %s(%s) = %d, %d",
                        STATE(delay_table[i].f_state),
                        delay_table[i].f_name,
                        STATE(delay_table[i].t_state),
                        delay_table[i].t_name,
                        delay_table[i].minimum,
                        delay_table[i].maximum
                );
                vfprintf(stdout, "\t(%0.1f, %0.1f, %0.1f)\n",
                        (float) delay_table[i].total,
                        (float) delay_table[i].squared_total,
                        (float) delay_table[i].number_of_elements
                );
        }
}
#endif  /* DEBUG */
```

Copyright 1989 Logic Modeling Systems

| HEADER FILE | DATE | PAGE # |
|---|---|---|
| include/HMBL.h | 5/23/89 | 1/1 |
| | TIME 1:20:15 pm | |

LINE # HEADER TEXT

```
/* SCCS_ID: HMBL.h rev 3.2, 5/9/89 at 15:30:29 */

/* header file for HMBL Analyzer */

# define OK 0 /* okay exit status */
# define FAIL 1 /* failure exit status */

# ifndef ushort
# define ushort unsigned short
# endif /* ushort */

extern int Process_HMBL ( ) ; /* called from main */
extern char
   *lm_malloc ( ) , /* malloc focus routine */
   *lm_realloc ( ) , /* realloc focus routine */
   *lm_Hget_input ( ) ; /* returns input file name */
extern ushort
   lm_Herrors ( ) , /* returns number of errors */
   lm_Hget_lineno ( ) , /* returns current line number */
   lm_Hc_flag_on ( ) , /* returns state of c_flag */
   lm_Hd_flag_on ( ) , /* returns state of d_flag */
   lm_Hq_flag_on ( ) , /* returns state of q_flag */
   lm_Hl_flag_on ( ) , /* returns state of l_flag */
   lm_Hm_flag_on ( ) , /* returns state of m_flag */
   lm_Hn_flag_on ( ) , /* returns state of n_flag */
   lm_Hp_flag_on ( ) , /* returns state of p_flag */
   lm_Hs_flag_on ( ) , /* returns state of s_flag */
   lm_Ht_flag_on ( ) , /* returns state of t_flag */
   lm_Hw_flag_on ( ) ; /* returns state of t_flag */
extern void
   lm_free ( ) , /* free focus routine */
   lm_queue_message ( ) ,
   lm_queue_error ( ) ,
   lm_Hinit_vars ( ) , /* initializes global variables */
   lm_Hset_c_flag ( ) , /* sets c_flag */
   lm_Hset_d_flag ( ) , /* sets d_flag */
   lm_Hset_q_flag ( ) , /* sets q_flag */
   lm_Hset_l_flag ( ) , /* sets l_flag */
   lm_Hset_m_flag ( ) , /* sets m_flag */
   lm_Hset_n_flag ( ) , /* sets n_flag */
   lm_Hset_p_flag ( ) , /* sets p_flag */
   lm_Hset_s_flag ( ) , /* sets s_flag */
   lm_Hset_t_flag ( ) , /* sets t_flag */
   lm_Hset_w_flag ( ) , /* sets w_flag */
   lm_Hset_input ( ) , /* sets input file name */
   lm_Hset_lineno ( ) , /* sets current line number */
   lm_Herror ( ) , /* reports, counts errors */
   lm_Hwarning ( ) , /* reports warnings */
   syntax_error ( ) , /* reports a syntax error */
   lm_Ffail ( ) ; /* _longjmp()s back to the backend pass */

/* end of header file for HMBL Analyzer */
```

Copyright 1989
Logic Modeling Systems

| HEADER FILE | DATE 5/23/89 | PAGE # |
| --- | --- | --- |
| include/Hconst.h | TIME 1:20:15 pm | 1/2 |

HEADER TEXT

```
/* SCCS_ID: Hconst.h rev 3.1, 4/24/89 at 07:32:47      */

/*
 * Header File for Constrainer for HDL Processor
 */

/* miscellaneous constants */
#define BUF_SIZE 1024 /* character buffer size */
#define ABS_MIN_PERIOD 1000 /* 1 GHz */
#define ABS_MAX_PERIOD 1000000000 /* 1 KHz */
#define MIN_PERIOD 40000 /* 25 MHz */
#define MAX_PERIOD 6666667 /* 150 KHz */
#define UNDEFINED (-1000) /* undefined value */
#define DEF_SETUP -1 /* for now */
#define DEF_HOLD -1 /* for now */
#define DEF_SAMPLE -1 /* for now */

/* TTL voltage/current defaults */
#define D_TTL_Vcc 5.0
#define D_TTL_Vhth 3.05
#define D_TTL_Vsh 2.9
#define D_TTL_Vih 2.0
#define D_TTL_Vil 0.8
#define D_TTL_Vsl 0.4
#define D_TTL_Vlth 0.35
#define D_TTL_Ish 0.5
#define D_TTL_Isl 2.0

/* NMOS voltage/current defaults */
#define D_NMOS_Vcc 5.0
#define D_NMOS_Vhth 3.2
#define D_NMOS_Vsh 2.9
#define D_NMOS_Vih 2.0
#define D_NMOS_Vil 0.8
#define D_NMOS_Vsl 0.4
#define D_NMOS_Vlth 0.25
#define D_NMOS_Ish 0.5
#define D_NMOS_Isl 0.5

/* CMOS voltage/current defaults */
#define D_CMOS_Vcc 5.0
#define D_CMOS_Vhth 4.7
#define D_CMOS_Vsh 4.5
#define D_CMOS_Vih 3.5
#define D_CMOS_Vil 1.0
#define D_CMOS_Vsl 0.4
#define D_CMOS_Vlth 0.25
#define D_CMOS_Ish 0.5
#define D_CMOS_Isl 0.5

/* LCMOS voltage/current defaults */
#define D_LCMOS_Vcc 3.3
#define D_LCMOS_Vhth 3.0
#define D_LCMOS_Vsh 2.8
#define D_LCMOS_Vih 2.5
#define D_LCMOS_Vil 0.6
#define D_LCMOS_Vsl 0.4
#define D_LCMOS_Vlth 0.25
#define D_LCMOS_Ish 0.5
#define D_LCMOS_Isl 0.5

/* more miscellaneous constants */
#define NOISE_MARGIN 0.4
#define LCMOS_NOISE_MARGIN 0.2
#define MAX_EDGE 6 /* maximum number of clock edges */
#define MAX_PINS 2560 /* maximum number of pins */
#define MAX_SUBSCRIPT 65535 /* maximum subscript value */
#define MAX_FB_SEQ_LEN 498 /* maximum feedback sequence length */
#define MAX_RES_SEQ_LEN 65535 /* maximum reset sequence length */

/* enumerated constants */
#define ID_ATTR 0 /* used in attribute structure */
#define CURRENT_SPEC 1
#define CYCLE_SPEC 2
#define sof(T)symtostr(textofnode(T)) /* abbreviation */
#define ASSERT(x)\
  if(!(x))lm_Herror(1,"internal error: assertion failed: x")

/* constant symbols used by the constrainer */
#define C_public (Q_lastreserved+1)
#define C_private (Q_lastreserved+2)
#define C_Hz (Q_lastreserved+3)
#define C_KHz (Q_lastreserved+4)
#define C_MHz (Q_lastreserved+5)
#define C_GHz (Q_lastreserved+6)
#define C_ms (Q_lastreserved+7)
#define C_us (Q_lastreserved+8)
#define C_ns (Q_lastreserved+9)
#define C_ps (Q_lastreserved+10)
#define C_infinity (Q_lastreserved+11)
#define C_static (Q_lastreserved+12)
#define C_internal (Q_lastreserved+13)
#define C_ext1 (Q_lastreserved+14)
#define C_ext2 (Q_lastreserved+15)
#define C_TTL (Q_lastreserved+16)
#define C_NMOS (Q_lastreserved+17)
#define C_CMOS (Q_lastreserved+18)
#define C_LCMOS (Q_lastreserved+19)
#define C_custom (Q_lastreserved+20)
#define C_Vcc (Q_lastreserved+21)
#define C_Vhth (Q_lastreserved+22)
#define C_Vlth (Q_lastreserved+23)
#define C_Vih (Q_lastreserved+24)
#define C_Vil (Q_lastreserved+25)
#define C_Vsh (Q_lastreserved+26)
#define C_Vsl (Q_lastreserved+27)
#define C_Ioh (Q_lastreserved+28)
#define C_Iol (Q_lastreserved+29)
#define C_Iih (Q_lastreserved+30)
#define C_Iil (Q_lastreserved+31)
#define C_eval (Q_lastreserved+32)
#define C_store (Q_lastreserved+33)
#define C_edge_rise (Q_lastreserved+34)
#define C_edge_fall (Q_lastreserved+35)
#define C_feedback (Q_lastreserved+36)
#define C_keepalive (Q_lastreserved+37)
#define C_in_sequence (Q_lastreserved+38)
#define C_last_cycle (Q_lastreserved+39)
#define C_hard (Q_lastreserved+40)
#define C_medium (Q_lastreserved+41)
```

Copyright 1989 Logic Modeling Systems

| HEADER FILE | DATE 5/23/89 | PAGE # |
| --- | --- | --- |
| include/Hconst.h | TIME 1:20:15 pm | 2/3 |

LINE # HEADER TEXT

```
# define C_hard_medium (Q_lastreserved+42)
# define C_rise (Q_lastreserved+43)
# define C_fall (Q_lastreserved+44)
# define C_low (Q_lastreserved+45)
# define C_high (Q_lastreserved+46)
# define C_float (Q_lastreserved+47)
# define C_valid (Q_lastreserved+48)
# define C_any (Q_lastreserved+49)
# define C_min (Q_lastreserved+50)
# define C_typ (Q_lastreserved+51)
# define C_max (Q_lastreserved+52)
# define C_on (Q_lastreserved+53)
# define C_off (Q_lastreserved+54)
# define C_missing_delays (Q_lastreserved+55)
# define C_io_store_changes (Q_lastreserved+56)
# define C_trace_delay (Q_lastreserved+57)
# define C_pull_up (Q_lastreserved+58)
# define C_pull_down (Q_lastreserved+59)

struct dev /* constrainer's device structure */
  { ushort
      edges , /* number of clock edges */
      num_in , /* number of input pins */
      num_out , /* number of output pins */
      num_io , /* number of I/O pins */
      num_power , /* number of power pins */
      num_ground , /* number of ground pins */
      num_nc , /* number of NC pins */
      pin_cnt , /* pin counter */
      apin_cnt , /* adapter pin counter */
      reset_cnt , /* reset sequence counter */
      num_seqs , /* number of sequences */
      rise_fb , /* is feedback sense rise? */
      pre_seq_length , /* length of prefeedback sequences */
      fb_seq_length , /* length of feedback sequences */
      post_seq_length , /* length of postfeedback sequences */
      ultra_fast , /* ultra fast mode invoked */
      dis_tim_check , /* disable timing checking */
      inh_tim_measure , /* inhibit timing measurement */
      delays_seen , /* are there any delays */
      use_default , /* has default_delay been seen */
      has_store_pins , /* set to indicate device has eval/store pins */
      has_adapter_map , /* set to indicate adapter map has been set */
      has_package_map , /* set to indicate package map has been set */
      has_feedback_pins ; /* set to indicate device has feedback pins */
    unsigned long
      clk_period1 , /* first clock period in picoseconds */
      clk_period2 , /* second clock period in picoseconds */
      min_default , /* minimum default delay */
      typ_default , /* typical default delay */
      max_default ; /* maximum default delay */
    tree tech_tree ; /* technology tree */
    symbol
      dev_name , /* device name */
      dev_type , /* device type */
      mod_name , /* modeler name */
      clk_type , /* clock type */
      technology , /* technology */
      missing_delays , /* missing delays */
      io_store_changes ; /* I/O store changes */
    double
      def_hold , /* default hold time in picoseconds */
      def_setup , /* default setup time in picoseconds */
      def_sample , /* default sample time in picoseconds */
      Vcc , /* DUT Vcc */
      Vhth , /* high threshold voltage */
      Vlth , /* low threshold voltage */
      Vih , /* logical high voltage */
      Vil , /* logical low voltage */
      Vsh , /* soft drive high voltage */
      Vsl , /* soft drive low voltage */
      Ioh , /* output high current in milliamps */
      Iol , /* output low current in milliamps */
      Iih , /* input high current in milliamps */
      Iil , /* input low current in milliamps */
      Isl , /* soft low current in milliamps */
      Ish ; /* soft high current in milliamps */
    struct pin_attr /* pin attributes */
      { char use_flag ; /* ID_ATTR, CURRENT_SPEC, CYCLE_SPEC */
        union
          { symbol id ; /* if ID_ATTR */
            struct
              { symbol cur ; /* current specifier: I[io][lh], pull_(up,down) */
                double val ; /* current value in milliamps (ohms if pull_*) */
              } cur_spec ; /* if CURRENT_SPEC */
            struct
              { symbol
                  seq , /* sequence specifier */
                  drv ; /* drive specifier */
              } cyc_spec ; /* if CYCLE_SPEC */
          } attr ;
      } data_format ;
    struct pins /* pin structure */
      { symbol name ; /* pin name */
        symbol pkg_name ; /* package pin name */
        symbol alias ; /* simulator pin name */
        ushort number ; /* adapter pin number */
        ushort trace_delay ; /* trace delay to this pin in pS */
        ushort num_attrs ; /* number of attributes */
        struct pin_attr *attr ; /* pointer to array of attributes */
        struct timing
          { symbol
              major_state , /* pin state for this pin */
              minor_state , /* other pin state involved */
              minor_pin_name ; /* other pin involved */
            unsigned long
              minimum , /* minimum time in picoseconds */
              typical , /* typical time in picoseconds */
              maximum ; /* maximum time in picoseconds */
            struct timing *next ; /* pointer to next timing spec */
          } *timing_list ; /* pointer to linked list of timing specs */
      } *pins ;
    struct sequence /* sequence structure */
      { symbol pin_name ; /* name of pin */
        tree bits ; /* tree representing sequence */
        ushort fb_kid ; /* which subtree has the feedback subsequence */
      } *sequences ; /* pointer to array of sequence structures */
  } ;

extern void
```

Copyright 1989 Logic Modeling Systems

| HEADER FILE | DATE | 5/23/89 | PAGE # |
|---|---|---|---|
| include/Hconst.h | TIME | 1:20:15 pm | 3/4 |

HEADER TEXT

```
    lm_print_message ( ) , /* to print without stdio */
    eerror ( ) , /* reports a constrainer error */
    ewarning ( ) , /* reports a constrainer warning */
    tr_entry ( ) , /* traces entry to a subtree */
    tr_exit ( ) , /* traces exit from a subtree */
    add_attr ( ) , /* adds an attribute to a pin */
    buf_instead ( ) , /* buffers up text for error reporting */
    buf_string ( ) , /* buffers up the text of a string token */
    check_state ( ) , /* make sure passed state is legal */
    process_timing ( ) , /* timing specification processor */
    walk_1 ( ) , /* first walk of the constrainer */
    walk_2 ( ) , /* second walk of the constrainer */
    walk_3 ( ) , /* third walk of the constrainer */
    walk_4 ( ) ; /* fourth walk of the constrainer */
  extern ushort
    scompare ( ) , /* compares symbols without regard to case */
    is_store_or_eval ( ) , /* returns 1 iff passed pin is a store or eval pin */
    do_pin_name ( ) ; /* processes pin names in walk_1 */
  extern struct dev *the ; /* the global device structure pointer */
  extern char buf [ BUF_SIZE ] ; /* the global character buffer */
  extern symbol gen_name ( ) ; /* generates a name given a symbol and a number */
  extern symbol prepend_underscore ( ) ; /* prepends '_' to the passed symbol */
  extern double check_num ( ) ; /* checks a passed number */
  extern unsigned long check_int ( ) ; /* makes sure number is an integer */

  /* end of Header File for Constrainer for HMDL Processor */
```

Copyright 1989
Logic Modeling Systems

| HEADER FILE | DATE 5/23/89 | PAGE # |
|---|---|---|
| include/Hparse.h | TIME 1:20:16 pm | 1/5 |

LINE # HEADER TEXT

```
/* SCCS_ID: Hparse.h rev 3.1, 4/24/89 at 07:32:50 */

# define END_OF_FILE 1
# define P_ID_ 2
# define P_NUM_ 3
# define P_STR_ 4
# define N_NAME 5
# define N_FAST 6
# define N_USAGE 7
# define N_REPORT 8
# define N_MODELER 9
# define N_CLOCK_TYPE 10
# define N_DIS_TIM_CHECK 11
# define N_INH_TIM_MEASURE 12
# define N_HOLD_TIME 13
# define N_SETUP_TIME 14
# define N_SAMPLE_TIME 15
# define N_SPEED 16
# define N_TECHNOLOGY 17
# define N_INITIALIZE 18
# define N_IN_PINS 19
# define N_IO_PINS 20
# define N_NC_PINS 21
# define N_OUT_PINS 22
# define N_POWER_PINS 23
# define N_GROUND_PINS 24
# define N_DELAY 25
# define N_DEFAULT_DELAY 26
# define N_PACKAGE 27
# define N_ADAPTER 28
# define N_PIN_MAP 29
# define N_UNIT 30
# define N_TECH_SPEC 31
# define N_NEGATIVE 32
# define N_INIT_SEQ 33
# define N_LIST 34
# define N_REPEAT 35
# define N_FEEDBACK 36
# define N_PIN_CORR 37
# define N_PIN_NAME 38
# define N_NAMES 39
# define N_ATTR 40
# define N_FROM 41
# define N_TO 42
# define N_PIN_STATE 43
# define N_TIMING 44
# define N_SPEC 45
# define N_MAPPING 46
# define Q_lastnodename 46
# define Q_firstreserved 47
# define T_device_name 47 /* 'device_name' */
# define T_ultra_fast 48 /* 'ultra_fast' */
# define T_device_usage 49 /* 'device_usage' */
# define T_report 50 /* 'report' */
# define T_modeler_name 51 /* 'modeler_name' */
# define T_clock_type 52 /* 'clock_type' */
# define T_disable_timing_checking 53 /* 'disable_timing_checking' */
# define T_inhibit_timing_measurement 54 /* 'inhibit_timing_measurement' */
# define T_device_hold_time 55 /* 'device_hold_time' */
# define T_device_setup_time 56 /* 'device_setup_time' */
# define T_device_sample_time 57 /* 'device_sample_time' */
# define T_device_speed 58 /* 'device_speed' */
# define T_technology 59 /* 'technology' */
# define T_initialize 60 /* 'initialize' */
# define T_in_pin 61 /* 'in_pin' */
# define T_io_pin 62 /* 'io_pin' */
# define T_nc_pin 63 /* 'nc_pin' */
# define T_out_pin 64 /* 'out_pin' */
# define T_power_pin 65 /* 'power_pin' */
# define T_ground_pin 66 /* 'ground_pin' */
# define T_delay 67 /* 'delay' */
# define T_default_delay 68 /* 'default_delay' */
# define T_package_mapping 69 /* 'package_mapping' */
# define T_adapter_mapping 70 /* 'adapter_mapping' */
# define T_pin_name_mapping 71 /* 'pin_name_mapping' */
# define T_da 72 /* '-' */
# define T_cm 73 /* ',' */
# define T_eq 74 /* '=' */
# define T_lp 75 /* '(' */
# define T_rp 76 /* ')' */
# define T_ls 77 /* '[' */
# define T_rs 78 /* ']' */
# define T_co 79 /* ':' */
# define T_from 80 /* 'from' */
# define T_to 81 /* 'to' */
# define Q_lastreserved 81
```

Copyright 1989 Logic Modeling Systems

| HEADER FILE | DATE 5/23/89 | PAGE # |
|---|---|---|
| include/arp.h | TIME 1:20:16 pm | 1/6 |

HEADER TEXT

```
/* SCCS_ID: arp.h rev 3.1, 4/24/89 at 07:32:52     */

/*
**      This file contains the ARP request and response
**      constants and data structu...   or information
**      on ARP and RARP see the DDN protocol handbook,
**      volume 3, pp 3-615.
*/


/*  ARP op-codes  */

#define ARP_REQUEST             1
#define ARP_REPLY               2


/*  ARP hardware types  */

#define ARP_ETHERNET            1
#define ARP_EXP_ETHERNET        2
#define ARP_RADIO_X25           3
#define ARP_TOKEN_RING          4
#define ARP_CHAOS               5


/*  ARP protocols types  */

#define ARP_IP                  0x0800
#define ARP_ARP                 0x0806
#define ARP_XNS                 0x0807
#define ARP_RARP                0x8035
#define ARP_LOOP                0x9000


/*  ARP address sizes  */

#define ARP_HARDWARE_SIZE       6
#define ARP_PROTOCOL_SIZE       4


/*  special ethernet addresses  */

#define BROADCAST       "\377\377\377\377\377\377"
#define NULL_ADDRESS    "\000\000\000\000\000\000"


/*  ARP data packet structure  */

struct  arp_packet {
                unsigned short  arp_hardware_type;
                unsigned short  arp_protocol_type;
                unsigned char   arp_hardware_address_length;
                unsigned char   arp_protocol_address_length;
                unsigned short  arp_opcode;
                unsigned char   arp_source_hardware_address[ARP_HARDWARE_SIZE];
                unsigned long   arp_source_protocol_address;
                unsigned char   arp_target_hardware_address[ARP_HARDWARE_SIZE];
                unsigned long   arp_target_protocol_address;
        };


/*  ethernet packet structure  */

struct  ethernet_arp_packet  {
                unsigned char           destination[6];
                unsigned char           source[6];
                unsigned short          type;
                struct arp_packet       arp;
        };

typedef struct icmp_header
{
        u_char type;
        u_char code;
        u_short checksum;
        u_short identifier;
        u_short sequence_no;
}ICMP_HEADER ;
```

Copyright 1989
Logic Modeling Systems

| HEADER FILE | DATE | PAGE # |
|---|---|---|
| include/bus.h | 5/23/89 | 1/7 |
| | TIME 1:20:16 pm | |

HEADER TEXT

```
/* SCCS_ID: bus.h rev 3.1, 4/24/89 at 07:32:54 */

/*
** The bus error handler
** see, m68020 user manual, ... tion 6
*/
/*
** we are only interested in errors for bus cycles
*/
typedef struct
{
        u_short sr;
        u_long  pc;
        u_short vector;
        u_short internal_reg;
        u_short spec_status_word;
        u_short internal_pipe_c;
        u_short internal_pipe_b;
        u_char  *address;
        u_long internal_reg2;
        u_long  data_out;
        u_long internal_reg3;
        u_long internal_reg4;
        u_long  data_in;
} STACK_FRAME;
```

Copyright 1989 Logic Modeling Systems

| HEADER FILE | DATE 5/23/89 | PAGE # |
|---|---|---|
| include/common.h | TIME 1:20:17 pm | 1/8 |

LINE # HEADER TEXT

```
/* SCCS_ID: common.h rev 3.1, 4/24/89 at 07:32:57   */

#ifndef _TYPES_
#define _TYPES_
typedef u...  d          char    u_char;
typedef unsigned         long    u_long;
typedef unsigned         short   u_short;
#endif


#ifndef NULL
#define NULL    0
#endif

#define TRUE             1
#define FALSE            0

#define SUCCESS          1
#define FAILURE          0
#define NOT_SUCCESS_OR_FAILURE  2

#ifdef  VMS
#define EXIT_NO_ERROR           1
#define EXIT_FATAL_ERROR        0
#else
#define EXIT_NO_ERROR           0
#define EXIT_FATAL_ERROR        1
#endif


/*
 * Defined to keep from having to use string.h and/or strings.h
 * Basically, a BSD/SYS5 portability consideration.
 */
extern  char    *strcat();
extern  char    *strncat();
extern  char    *strcpy();
extern  char    *strncpy();

extern  char    *strchr();
extern  char    *strrchr();
extern  char    *strpbrk();
extern  char    *strtok();

extern  int     strcmp();
extern  int     strncmp();
extern  int     strlen();
extern  int     strspn();
extern  int     strcspn();

/*
 * Defined to keep from having to use malloc.h and/or memory.h
 * Basically, a BSD/SYS5 portability consideration.
 */

#ifndef VMS  /* a VMS portability consideration */
extern  char    *malloc();
extern  char    *realloc();
#endif

#ifdef  MODELER
/*
 * The reason for defining sprintf() here, only for the modeler,
 * is that on some machines (most notably SYS5) sprintf() returns
 * an integer.  Therefore, the definition of sprintf() must be
 * picked up in from <stdio.h>, but <stdio.h> can not be used on
 * the modeler -- the concept of <stdio.h> does not exist.
 */
extern  char    *sprintf();
#endif

/*
 * Well, it turns out that Sun systems must also have sprintf() defined.
 */
#ifdef  SUN
extern  char    *sprintf();
#endif
```

Copyright 1989 Logic Modeling Systems

HEADER FILE include/cpu.h | DATE 5/23/89 | TIME 1:20:17 pm | PAGE # 1/9

LINE # HEADER TEXT

```
/* SCCS_ID: cpu.h rev 3.3, 5/9/89 at 17:45:44 */

#define CPU_RAM                  0x00000000    /* DRAM start */
#define CPU_BOOT_EPROM           0x00000000    /* EPROM start during boot */
#define CPU_BOOT_RAM             0x00100000    /* DRAM start during boot */
#define CPU_RAM_SIZE             0x00400000    /* DRAM size (4MB) */
#define CPU_VME32_RAM            0x00400000    /* VME DRAM start */
#define CPU_VME24_PERIPH         0x10800000    /* VME24 peripherals start */
#define CPU_VME24_PERIPH_SIZE    0x00400000    /*   (4MB) */
#define CPU_NVSRAM               0x10c00000    /* Non-volatile SRAM start */
#define CPU_NVSRAM_SIZE          0x00002000    /*   (8KB/2K reg) */
#define CPU_DUART                0x10c20000    /* 2681 start (64B/16 reg) */
#define CPU_TIMER                0x10c30000    /* 8254 start (16B/4 reg) */
#define CPU_LANCE_DATA_REG       0x10c40002    /* Am7990 data reg (word) */
#define CPU_LANCE_ADDR_REG       0x10c40006    /* Am7990 address reg (word) */
#define CPU_ID_PROM              0x10c50000    /* ID PROM start */
#define CPU_ID_PROM_SIZE         0x00000080    /*   (128B/32 reg) */
#define CPU_CONTROL_REG          0x10c60000    /* Control register (4B) */
#define CPU_CLEAR_ERRORS_REG     0x10c60000    /* Byte write to clear errors */

#define CPU_READ_CONTROL         0x10c60000    /* Read-only control byte */
#define CPU_FUNC_CONTROL         0x10c60001    /* Read/write control byte */
#define CPU_INTR_CONTROL         0x10c60002    /* Read/write control byte */
#define CPU_GLOBAL_INTR_ENA      0x80          /* Inside CPU_INTR_CONTROL */
#define CPU_MISC_CONTROL         0x10c60003    /* Read/write control byte */

#define CPU_PAR_ERR_REG          0x10c70000    /* Parity error status/addr */

#define CPU_EPROM                0x10d00000    /* EPROM start, always */
#define CPU_LANE_A               0x80000000    /* TMG and backplane */
#define CPU_LANE_B               0x90000000    /* TMG and backplane */
#define CPU_LANE_C               0xa0000000    /* TMG and backplane */
#define CPU_LANE_D               0xb0000000    /* TMG and backplane */
#define CPU_VME32_PERIPH         0xf0000000    /* VME32 peripherals start */
#define CPU_VME32_PERIPH_SIZE    0x10000000    /*   (256MB) */

typedef struct
{
    unsigned
        :1,
        not_68020_master:1,     /* Negated if 68020 master when parity error */
        not_VME_master:1,       /* Negated if VME master when parity error */
        not_LANCE_master:1,     /* Negated if LANCE master when parity error */
        not_error_hi:1,         /* Negated if parity error on high byte */
        not_error_um:1,         /* Same for upper middle byte */
        not_error_lm:1,         /* Same for lower middle byte */
        not_error_lo:1,         /* Same for low byte */
        :2,
        error_addr:22;          /* Address of parity error (bits 23..2) */
} cpu_par_err_reg;

/*
 *  Accesses to the control register should only be made using the following
 *  structure, except during diagnostics.  In particular, the CPU_READ_CONTROL
 *  read-only byte lives a dual life as the CPU_CLEAR_ERRORS write-only byte,
 *  so that a longword read-modify-write cycle on the control register
 */
typedef struct
{
    /*
     *  CPU_READ_CONTROL byte, read-only control register.
     *  Do not, under any circumstances, write any of these bits-- this is
     *  at the same address as the write-only CPU_CLEAR_ERRORS location.
     */
    unsigned
        lance_busy:1,           /* LANCE can't be accessed */
        not_parity_intr:1,      /* No parity error/interrupt pending */
        not_dtr_a:1,            /* DUART port A DTR is asserted */
        debug_mode:1,           /* VME24 can't access onboard DRAM */
        dipswitch:4,            /* 4-position dipswitch, 0=on */
    /*
     *  CPU_FUNC_CONTROL byte, read/write control register.
     */
        not_parity_value:1,     /* Inverse of parity bit written during */
                                /* parity testing */
        parity_force:1,         /* Enable parity testing */
        nvsram_write_ena:1,     /* Enable non-volatile SRAM writes */
        run_state:1,            /* EPROM not mapped in DRAM space */
        lance_enable:1,         /* Allow the LANCE to become master */
        cache_enable:1,         /* Enable the 68020's I-cache */
        timer_gate_1:1,         /* 8254 timer gate 1 */
        timer_gate_0:1,         /* 8254 timer gate 0 */
    /*
     *  CPU_INTR_CONTROL byte, read/write control register.
     */
        global_intr_ena:1,      /* Enable ALL interrupts, even NMI */
        parity_intr_ena:1,      /* Enable parity interrupt */
        timer_intr_ena_2:1,     /* Enable timer channel 2 interrupt */
        timer_intr_ena_1:1,     /* Enable timer channel 1 interrupt */
        timer_intr_ena_0:1,     /* Enable timer channel 0 interrupt */
        vme_intr_ena:1,         /* Enable interrupt from VME */
        tmg_intr_ena:1,         /* Enable interrupt from timing generator */
        doorbell:1,             /* Doorbell interrupt to 68020 */
    /*
     *  CPU_MISC_CONTROL byte, mostly read/write control register.
     *  not_tmg_intr is read-only.
     */
        not_load_led:1,         /* Negate bit to turn on orange LED */
        not_test_led:1,         /* Negate bit to turn on yellow LED */
        fault_led:1,            /* Turn on red LED */
        control_spare:1,        /* Unassigned bit */
        not_lance_reset:1,      /* Negate bit to reset LANCE [UNIMPLEMENTED] */
        not_tmg_intr:1,         /* Actual pollable interrupt from TMG */
        tmg_if_test_data:1,     /* Use with special TMG interface fixture */
        suicide:1;              /* Software hard reset */
} cpu_control_reg_struct;

/*
 *  Useful macros.
 */
#define CPU_ENABLE_INTERRUPTS   \
                *(unsigned char *)CPU_INTR_CONTROL |= CPU_GLOBAL_INTR_ENA
#define CPU_DISABLE_INTERRUPTS  \
                *(unsigned char *)CPU_INTR_CONTROL &= ~CPU_GLOBAL_INTR_ENA; \
                *(unsigned char *)CPU_INTR_CONTROL &= ~CPU_GLOBAL_INTR_ENA


/*
 *  Dipswitch stuff.
 */
#define CPU_SW_UP       1
```

Copyright 1989 Logic Modeling Systems

| HEADER FILE | DATE | 5/23/89 | PAGE # |
|---|---|---|---|
| include/cpu.h | TIME | 1:20:17 pm | 2/10 |

HEADER TEXT

```c
#define CPU_SW_DOWN     0

/*
 * Call cpu_sw(4-bit dipswitch register, number between 1 and 4)
 * Returns value of either CPU_SW_UP or CPU_SW_DOWN
 */
#define cpu_sw(reg, swpos) (((reg) >> (4 - (swpos))) & 0x1)

/*
 *   LED constants.
 */
#define LED_ON          1
#define LED_OFF         0
#define not_LED_ON      0
#define not_LED_OFF     1

/*
 * cpu_clear_errors() macro
 */
#define cpu_clear_errors() *((u_char *)CPU_CLEAR_ERRORS_REG)= 0

/*
 * For software delays of the form:
 *      register u_long delay_count;
 *
 *      delay_count= CONSTANT;
 *      while (--delay_count)
 *
 * CPU_LOOPS_PER_5_MICROSECONDS is the scale factor for computing CONSTANT.
 * With a value of 10, each loop takes 500ns.
 */
#define CPU_LOOPS_PER_5_MICROSECONDS 10

/*
 * Macros to delay for a given number of microseconds or milliseconds
 */
#define delay_microseconds(v, n) \
    { v= (CPU_LOOPS_PER_5_MICROSECONDS * n) / 5; \
    while (--v); }

#define delay_milliseconds(v, n) \
    { v= 200 * CPU_LOOPS_PER_5_MICROSECONDS * n; \
    while (--v); }
```

Copyright 1989 Logic Modeling Systems

HEADER FILE
include/cpu_diag.h

DATE 5/23/89
TIME 1:20:17 pm
PAGE # 1/11

HEADER TEXT

```
/* SCCS_ID: cpu_diag.h rev.1.1, 4/24/89 at 07:33:01 */

/*
 * cpu_diag.h
 * Copyright 1988 Logic Modeling Systems, Inc.
 * msp
 *
 * Definitions for general use in CPU diagnostics.
 */

#define CPUDIAG_NO_ERROR        0       /* No errors found */
#define CPUDIAG_ERROR_DRAM      1       /* One blink */
#define CPUDIAG_ERROR_IDPROM    2       /* Two blinks */
#define CPUDIAG_ERROR_EPROM     3       /* Three blinks */
#define CPUDIAG_ERROR_EXCEPTION 4       /* Four blinks */
#define CPUDIAG_ERROR_STATUS    5       /* Five blinks */

#define INLINE_BOOT             asm("bral _bsp_start")

#define INLINE_HYPERLINK        asm("movl #0x04000, a0"); asm("bral _hl_rom")

#define INPUT_BUF_LENGTH        20      /* maximum input line length */

#define SIZE_BYTE               1
#define SIZE_WORD               2
#define SIZE_LONG               4

#define INPUT_BAD               0
#define INPUT_GOOD              1
#define INPUT_ZERO              2
#define INPUT_ABORT             3

#define CPUDIAG_RAM_START       0x00001000
#define CPUDIAG_RAM_END         0x00300000

#define CPUMON_ADDR_PROMPT      ": "
#define CPUMON_DATA_PROMPT      "> "
```

Copyright 1989
Logic Modeling Systems

HEADER FILE
include/cpu_frame.h

DATE 5/23/89
TIME 1:20:17 pm
PAGE # 1/12

HEADER TEXT

```
/* SCCS_ID: cpu_frame.h rev 3.1, 4/24/89 at 07:33:04 */

/*
 * cpu_frame.h
 *
 * Definitions for 68020 CPU stack frames
 */

/*
 * Stack frame types.
 */
#define STACK_FRAME_GENERIC     0
#define STACK_FRAME_THROWAWAY   1
#define STACK_FRAME_SIXWORD     2
#define STACK_FRAME_CP_MIDINST  9
#define STACK_FRAME_BUS_SHORT   10
#define STACK_FRAME_BUS_LONG    11

#define STACK_FRAME_RERUN       1
#define STACK_FRAME_DONT_RERUN  0

#define STACK_FRAME_SIZE_BYTE   1
#define STACK_FRAME_SIZE_WORD   2
#define STACK_FRAME_SIZE_TRIPLE 3
#define STACK_FRAME_SIZE_LONG   0

/*
 * Generic exception stack frame.
 * This structure is common to all stack frames, and suffices for interrupts,
 * format errors, TRAPs, illegal instructions, A-line and F-line, privilege
 * violations, and coprocessor pre-instruction exceptions.
 */
typedef struct
{
    u_short     sr;
    u_long      pc;
    unsigned    type:4,
                vec:12;
} stack_frame_generic;

/*
 * Six-word exception stack frame.
 * This is used for CHK, CHK2, cpTRAPcc, TRAPcc, TRAPV, trace, zero divide,
 * and coprocessor post-instruction exceptions.
 */
typedef struct
{
    u_short     sr;
    u_long      pc;
    unsigned    type:4,
                vec:12;
    u_long      inst_addr;
} stack_frame_sixword;

/*
 * Coprocessor mid-instruction stack frame.
 * This should never happen in this system.
 */
typedef struct
{
    u_short     sr;
    u_long      pc;
    unsigned    type:4,
                vec:12;
    u_long      inst_addr;
    u_long      internal1;
    u_long      internal2;
} stack_frame_cp_midinst;

/*
 * Short bus error stack frame.
 */
typedef struct
{
    u_short     sr;
    u_long      pc;
    unsigned    type:4,
                vec:12;
    u_short     internal1;
    unsigned    fault_c:1,
                fault_b:1,
                rerun_c:1,
                rerun_b:1,
                bogus1:3,
                rerun_flag:1,
                rmc:1,
                read:1,
                size:2,
                bogus2:1,
                fc:3;
    u_short     pipe_c;
    u_short     pipe_b;
    u_long      fault_addr;
    u_long      internal2;
    u_long      data_out;
    u_long      internal3;
} stack_frame_bus_short;

/*
 * Long bus error stack frame.
 */
typedef struct
{
    u_short     sr;
    u_long      pc;
    unsigned    type:4,
                vec:12;
    u_short     internal1;
    unsigned    fault_c:1,
                fault_b:1,
                rerun_c:1,
                rerun_b:1,
                bogus1:3,
                rerun_flag:1,
                rmc:1,
                read:1,
                size:2,
                bogus2:1,
                fc:3;
    u_short     pipe_c;
```

Copyright 1989
Logic Modeling Systems

HEADER FILE include/cpu_frame.h | DATE 5/23/89 | TIME 1:20:17 pm | PAGE # 2/13

HEADER TEXT

```
    u_short     pipe_b;
    u_long      fault_addr;
    u_long      internal2;
    u_long      data_out;
    u_long      b_addr;
    u_long      internal3;
    u_long      data_in;
    u_long      internal4[11];
} stack_frame_bus_long;

typedef struct
{
    u_long      fault_addr;
    u_char      print_flag;
    u_char      rerun_flag;
    u_char      occur_flag;
    u_char      size;
    u_char      rmc;
    u_char      read;
    u_char      fc;
} bus_error_control_struct;

#define frame_set_trace_mode(sr, ctl) \
    sr= (sr & (0x3fff)) + (ctl << 14)
```

Copyright 1989 Logic Modeling Systems

HEADER FILE include/cpu_vec.h | DATE 5/23/89 | TIME 1:20:17 pm | PAGE # 1/14

LINE # HEADER TEXT

```
/* SCCS_ID: cpu_vec.h rev 3.1, 4/24/89 at 07:33:06      */

/*
 * cpu_vec.h
 *
 * Definitions relating to CPU exception vectors
 */

/*
 * General definitions
 */
#define VEC_BASE_ADDRESS        0x00000000
#define VEC_END_ADDRESS         0x00000400
#define VEC_NUM_VECS            256

/*
 * Define exception indices for miscellaneous exceptions
 */
#define VEC_RESET_ISP           0
#define VEC_RESET_PC            1
#define VEC_BUS_ERROR           2
#define VEC_ADDRESS_ERROR       3
#define VEC_ILLEGAL_INSTRUCTION 4
#define VEC_ZERO_DIVIDE         5
#define VEC_CHK_BOUNDS          6
#define VEC_CONDITIONAL_TRAP    7
#define VEC_PRIVILEGE_VIOLATION 8
#define VEC_TRACE               9
#define VEC_LINE_1010_EMULATOR  10
#define VEC_LINE_1111_EMULATOR  11
#define VEC_reserved_12         12
#define VEC_CP_PROTOCOL_VIOL    13
#define VEC_FORMAT_ERROR        14
#define VEC_UNINITIALIZED_INTR  15
#define VEC_reserved_16         16
#define VEC_reserved_17         17
#define VEC_reserved_18         18
#define VEC_reserved_19         19
#define VEC_reserved_20         20
#define VEC_reserved_21         21
#define VEC_reserved_22         22
#define VEC_reserved_23         23

/*
 * Interrupts (spurious and the auto-vectors)
 */
#define VEC_SPURIOUS_INTERRUPT  24
#define VEC_LEVEL_1_INTERRUPT   25
#define VEC_CB_INTERRUPT        25
#define VEC_LEVEL_2_INTERRUPT   26
#define VEC_VME_INTERRUPT       27
#define VEC_TIMER_INTERRUPT     28
#define VEC_DUART_INTERRUPT     29
#define VEC_LANCE_DOORBELL_INTR 30
#define VEC_PARITY_INTERRUPT    31
#define VEC_LEVEL_7_INTERRUPT   31

/*
 * Traps
 */
#define VEC_TRAP_0              32
#define VEC_TRAP_VRTX           32
#define VEC_TRAP_1              33
#define VEC_TRAP_RTSCOPE        33
#define VEC_TRAP_2              34
#define VEC_TRAP_3              35
#define VEC_TRAP_4              36
#define VEC_TRAP_5              37
#define VEC_TRAP_6              38
#define VEC_TRAP_7              39
#define VEC_TRAP_8              40
#define VEC_TRAP_9              41
#define VEC_TRAP_10             42
#define VEC_TRAP_11             43
#define VEC_TRAP_12             44
#define VEC_TRAP_13             45
#define VEC_TRAP_14             46
#define VEC_TRAP_15             47

/*
 * Vectors 48 through 58 are coprocessor exceptions.  Since we don't
 * implement any coprocessors, we don't particularly care a whole lot
 * about these exceptions.
 * Vectors 59 through 63 are unassigned and reserved.
 */


/*
 * Note that the user-defined vectors are only useful in the event of
 * an external vector-generating interrupt source.  This can happen
 * for VMEbus interrupts (if there were any VMEbus devices) or if the
 * EPROMs are burned wrong or go bad and a wrong "auto-vector" is
 * fetched during interrupt acknowledge EPROM read.
 */
#define VEC_USER_DEFINED_VECTOR 64
#define VEC_LAST_USER_DEFINED   255

/*
 * vec_handler()
 * This macro sets up the appropriate exception vector to point to the
 * designated handler function.
 */
#define vec_handler(vector, handler) \
        *(int *)(VEC_BASE_ADDRESS + (vector * 4))= (int)handler

/*
 * vec_entry_point()
 * Defines an alternate entry point for a function (especially an exception
 * handler).  The argument should be preceded by an underline character.
 */
#define vec_entry_point(label) \
        asm(".globl label"); asm("label:")

/*
 * vec_handler_start()
 * Saves all registers (except stack pointer).
 * Should be used after vec_entry_point() in exception handlers.
 */
#define vec_handler_start() \
    asm("moveml #0xFFFE,sp@-")

```

Copyright 1989
Logic Modeling Systems

| HEADER FILE | DATE 5/23/89 | PAGE # |
|---|---|---|
| include/cpu_vec.h | TIME 1:20:17 pm | 2/15 |

LINE # HEADER TEXT

```
/*
 * vec_handler_end()
 * Restores all registers (except stack pointer), and returns from exception.
 * Should be the last statement in exception handlers.
 */
#define vec_handler_end() \
    asm("moveml sp@+,#0x7FFF"); asm("rte")

typedef struct
{
    u_long s_d0;
    u_long s_d1;
    u_long s_d2;
    u_long s_d3;
    u_long s_d4;
    u_long s_d5;
    u_long s_d6;
    u_long s_d7;
    u_long s_a0;
    u_long s_a1;
    u_long s_a2;
    u_long s_a3;
    u_long s_a4;
    u_long s_a5;
    u_long s_a6;
    u_long sp;              /* not really saved, but here for sake of comparing
                               last breakpoint's sp to current breakpoint's */
    u_long sr;              /* same here */
} vec_saved_registers_struct;
```

Copyright 1989 Logic Modeling Systems

HEADER FILE include/device.h

DATE 5/23/89 TIME 1:20:17 pm PAGE # 1/16

LINE # HEADER TEXT

```c
/* SCCS_ID: device.h rev 3.1, 4/24/89 at 07:33:09 */
/* Device Description Data Structures */
# include "common.h"
# define LOW                (0x1) /* Used in TIMING_SPEC */
# define HIGH               0x2
# define VALID            (LOW|HIGH)
# define FLOAT              0xC
# define ANY            (VALID|FLOAT)
# define GATED_ON           (0) /* Used in PIN_SPEC */
# define ALWAYS_ON          1
# define DRIVE_OFF          (0)
# define DRIVE_ON           1
# define DATA               (0)
# define EVAL               1
# define STORE              2
# define NONE               (0)
# define IN                 1
# define OUT                2
# define IO                 3
# define POWER              4
# define GROUND             5
# define NC                 6
# define NO_DRIVE           (0)
# define H_DRIVE            1
# define M_DRIVE            2
# define HM_DRIVE           3
# define NRZ                (0)
# define DNRZ               1
# define R0                 2
# define R1                 3
# define RC                 4
# define PUBLIC             (0) /* Used in DEVICE_SPEC */
# define PRIVATE            1
# define FEEDBACK_RISE      (0)
# define FEEDBACK_FALL      1
# define INTERNAL           (0)
# define EXT1               1
# define EXT2               2
typedef struct
  { u_long      minimum ,        /* triple of minimum, typical, and maximum  */
                typical ,        /* delays, setups, holds, and pulse widths  */
                maximum ;        /* as extracted from the device's HDBL, pS  */
  } MIN_TYP_MAX ; /* 12 bytes */
typedef struct /* major pin number is implicit in the table index           */
  { u_short     minor_pin ,      /* "from" DAB pin number                    */
    unsigned    space:8 ,        /* must appear to pad to short size         */
                major_state:4 ,  /* "to" pin state and "from" pin state:     */
                minor_state:4 ;  /* LOW,HIGH,VALID,FLOAT,ANY                 */
    u_short     mtym_index ;     /* index into M/T/M table                   */
  } TIMING_SPEC ; /* 6 bytes */
typedef struct /* the DAB pin number is implicit in the table index */
  { char        *pin_name ,      /* name of device pin                       */
                *pin_number ,    /* package pin name                         */
                *pin_alias ;     /* simulator pin name                       */
    TIMING_SPEC *delay_table ;   /* table of pin delays                      */
    u_short     delay_cnt ,      /* count of pin delays                      */
                trace_delay ;    /* trace delay for this signal: pS          */
    unsigned    s_drive_low:4 ,  /* 16 discrete soft drive low current       */
                s_drive_hi:4 ,   /* 16 discrete soft drive high current      */
                direction:3 ,    /* direction pin drives: NONE,IN,...,NC     */
                clk_edge1:3 ,    /* index into edge table: range 0-5         */
                pin_class:2 ,    /* class of pin: DATA,EVAL,STORE            */
                clk_edge2:3 ,    /* index into edge table: range 0-5         */
                clk_format:3 ,   /* format of clock: DNRZ, R0, R1, RC        */
                in_seq_drive:2 ,/* NO_DRIVE,H_DRIVE,M_DRIVE,HM_DRIVE         */
                last_cyc_drive:2,/*NO_DRIVE,H_DRIVE,M_DRIVE,HM_DRIVE         */
                doff_edge:1 ,    /* 0 selects edge(6); 1 selects edge(5)     */
                h_drive:1 ,      /* hard drive enable: GATED_ON,ALWAYS_ON    */
                hm_drive:1 ,     /* hard/medium enable: DRIVE_OFF,DRIVE_ON   */
                feeds_back:1 ,   /* set to 1 iff pin is used in feedback     */
                kept_alive:1 ,   /* set to 1 iff pin is hooked to keepalive  */
                pulled_up:1 ,    /* set to 1 iff pin is pulled up            */
                pulled_down:1 ;  /* set to 1 iff pin is pulled down          */
  } PIN_SPEC ; /* 36 bytes, 15 bits spare */
typedef struct
  { char        *pre_bits ,      /* pre-fb init sequence bit pattern         */
                *fb_bits ,       /* feedback init sequence bit pattern       */
                *post_bits ,     /* post-fb init sequence bit pattern        */
                *seq_str ;       /* initialization sequence source string    */
    u_short     pin_number ;     /* DAB pin number for this init sequence    */
  } SEQ_SPEC ; /* 18 bytes */
typedef struct device
  { char        *device_name ,   /* name of device                           */
                *modeler_name ,  /* name of modeler device is in             */
                *extra_data ;    /* extra data, not from device's HDBL       */
    PIN_SPEC    *pin_table ;     /* table of device pins                     */
    SEQ_SPEC    *seq_table ;     /* table of reset sequences                 */
    TIMING_SPEC *timing_table ;  /* table of timing specifications           */
    MIN_TYP_MAX *mtym_table ;    /* table of unique M/T/M triplets           */
    struct device*next_device ;  /* linked list of devices                   */
    MIN_TYP_MAX default_delay ;  /* default delay triple                     */
    u_long      clock_period1 ,  /* shortest period of clock: pS             */
                clock_period2 ,  /* longest period of clock: pS              */
                two_state_sample,/* 2-state pin sample time: pS              */
                five_state_sample,/*5-state pin sample time: pS              */
    long        setup_time ,     /* default data setup time: pS              */
                hold_time ;      /* default data hold time: pS               */
    u_short     edge_skew_time ,/* constant edge-to-edge skew: pS            */
                md_settling_time,/*medium drive settling time: pS            */
                hd_settling_time,/*hard drive settling time: pS              */
                vcc , vsl , vsh,/* Vcc and soft-drive supplies: mV           */
                vlth , vhth ,    /* tristate voltage thresholds: mV          */
                vil , vih ,      /* logic-level voltage thresholds: mV       */
                pin_cnt ,        /* count of device pins                     */
                pre_seq_len ,    /* length of pre-feedback sequences         */
                fb_seq_len ,     /* length of feedback sequences             */
                post_seq_len ,   /* length of post-feedback sequences        */
                seq_cnt ,        /* count of pins in reset sequence          */
                timing_cnt ,     /* count of entries in timing table         */
                mtym_cnt ;       /* count of entries in M/T/M table          */
    unsigned    clock_type:2 ,   /* type of clock: INTERNAL, EXT1, EXT2      */
                device_type:1 ,  /* type of device: PUBLIC or PRIVATE        */
                fb_type:1 ,      /* type of feedback: RISE or FALL           */
                use_default:1 ,  /* 1 iff default delay is specified         */
                report_miss:1 ,  /* 1 iff missing delays are to be reported  */
                report_iosc:1 ,  /* 1 iff io_store_changes are to be reported*/
                ultra_fast:1 ,   /* ultra fast mode if set                   */
                dis_tim_check:1,/* disable timing checking                   */
                inh_tim_measure:1;/* inhibit timing measurement              */
  } DEVICE_SPEC ; /* 104 bytes, 6 bits spare */
```

Copyright 1989
Logic Modeling Systems

| HEADER FILE | DATE | TIME | PAGE # |
|---|---|---|---|
| include/diag_setjmp.h | 5/23/89 | 1:20:17 pm | 1/17 |

HEADER TEXT

```
/* SCCS_ID: diag_setjmp.h rev 3.1, 4/24/89 at 07:33:11 */

typedef int jmp_buf[15];        /* pc,lm_current_depth,cssstack;d2-7,a2-7 */
extern long lm_current_depth;
```

Copyright 1989
Logic Modeling Systems

| HEADER FILE | DATE 5/23/89 | PAGE # |
|---|---|---|
| include/duart.h | TIME 1:20:17 pm | 1/18 |

HEADER TEXT

```c
/* SCCS_ID: duart.h rev 3.1, 4/24/89 at 07:33:14    */

/*
** WRITE REGS FOR THE SN2681 DUART
*/
#define MODE_REG1_A          0          /* offset of mode reg 1 */
#define MODE_REG2_A          0          /* offset address of mode reg 2 */
#define CLK_SEL_REG_A        4          /* offset clock sel reg */
#define CMD_REG_A            8          /* offset command register */
#define TX_REG_A             0xc        /* transmit register */
#define AUX_CNTL_REG         0x10       /* offset of auxillary control register */
#define INT_MASK_REG         0x14       /* offset of interrupt mask reg */
#define CNT_TMR_UPER_REG     0x18       /* counter timer upper */
#define CNT_TMR_LOWR_REG     0x1c       /* counter timer lower */
#define MODE_REG1_B          0x20       /* offset of mode reg 1 */
#define MODE_REG2_B          0x20       /* offset address of mode reg 2 */
#define CLK_SEL_REG_B        0x24       /* offset clock sel reg */
#define CMD_REG_B            0x28       /* offset command register */
#define TX_REG_B             0x2c       /* transmit register */
#define OUT_PORT_REG         0x34       /* offset of output port config reg */
#define SET_O_P_PORT         0x38       /* set output port bits */
#define RES_O_P_PORT         0x3c       /* reset output port bits*/

/*
** READ REGS FOR SN2681
** note: some of the above regs are r/w.
**       see Data Sheet, for more details
*/
#define STAT_REG_A           4          /* status reg */
#define RCV_REG_A            0xc        /* rcvr */
#define IN_PORT_CHG          0x10       /* Input port change reg */
#define INT_STAT_REG         0x14       /* Interrupt status reg */
#define CNTR_TMR_UPER        0x18       /* counter/timer upper */
#define CNTR_TMR_LOWR        0x1c       /* counter/timer lower */
#define STAT_REG_B           0x24       /* status reg b */
#define RCV_REG_B            0x2c       /* rcvr b */
#define INPUT_PORT           0x34       /* input port */
#define START_CNTR           0x38       /* start counter */
#define STOP_CNTR            0x3c       /* stop counter */

/*
** Global DUART turn off/ turn on
*/
#define DUART_DISABLE        0          /* disable function */
#define DUART_ENABLE         1          /* enable function */

/*
** Mode reg 1, equates
*/
#define RX_INT_RRDY          0          /* rcvr ready int */
#define RX_INT_FFULL         1          /* fifo full int */

#define ERR_MODE_CHAR        0          /* error mode char */
#define ERR_MODE_BLOCK       1          /* Block err mode */

/*
**this combines parity type and parity mode
*/
#define PARITY_ODD           1          /* odd parity */
#define PARITY_EVEN          0          /* even parity */
#define PARITY_NONE          4          /* no parity */
#define PARITY_FORCED        2          /* parity = 1 */

#define BITS_PER_CHAR_5      0          /* 5 bits per char */
#define BITS_PER_CHAR_6      1          /* 6 bits per char */
#define BITS_PER_CHAR_7      2          /* 7 bits per char */
#define BITS_PER_CHAR_8      3          /* 8 bits per char */

/*
** Mode reg 2
*/
#define CH_MODE_NORMAL       0          /* normal channel */
#define CH_MODE_AUTO_ECHO    1          /* auto echo chars */
#define CH_MODE_LOCAL_LOOP   2          /* local loop */
#define CH_MODE_REMOTE_LOOP  3          /* remote loop */

#define STOP_BITS_HALF       0          /* half a stop bit */
#define STOP_BITS_1          7          /* 1 stop bit */
#define STOP_BITS_2          0xf        /* 2 stop bits */

/*
** Clock Select
*/
#define BAUD_110             1          /* Baud rate 110      */
#define BAUD_300             4          /* Baud rate 300      */
#define BAUD_1200            6          /* Baud rate 1200     */
#define BAUD_2400            8          /* Baud rate 2400     */
#define BAUD_4800            9          /* Baud rate 4800     */
#define BAUD_9600            0xb        /* Baud rate 9600     */
#define BAUD_96_12_24   (BAUD_9600 | 0x10) /* Baud rate 9600/1200/2400   */
#define BAUD_24_96_12   (BAUD_2400 | 0x10) /* Baud rate 2400/9600/1200   */

/*
** command reg
*/
#define NOP                  0          /* no op */
#define RESET_MODE_REG       1          /* reset mode reg ptr */
#define RESET_RCVR           2          /* reset rcvr */
#define RESET_TX             3          /* reset tx */
#define RESET_ERR            4          /* reset error */
#define RESET_CH             5          /* reset channel */
/*
** mode reg 1
*/
typedef struct
{
        unsigned
        rx_rts:1,                       /* RX RTS CONTROL */
        rx_int:1,                       /* RX INT SELECT  */
        error_mode:1,                   /* error mode */
        parity:3,                       /* parity mode & parity type */
        bits_per_char:2,                /* bits per char */
        pad:24;                         /* 24 bit pad */
} MODE_REG_1;

/*
** mode reg 2
*/
typedef struct
{
```

Copyright 1989
Logic Modeling Systems

HEADER FILE
include/duart.h

DATE 5/23/89
TIME 1:20:17 pm
PAGE # 2/19

HEADER TEXT

```
        unsigned
        Chan_mode:2,                    /* channel mode */
        tx_rts:1,                       /* tx rts */
        cts_enable:1,                   /* enable cts */
        stop_len:4,                     /* stop bits */
        pad:24;                         /* 24 bit pad */
} MODE_REG_2;

/*
** clock select
*/
typedef struct
{
        unsigned
        RX_clk:4,                       /* rcv clk sel */
        TX_clk:4,                       /* Tx clk sel  */
        pad:24;                         /* 24 bit pad */
} CLK_SEL;

/*
** command reg.
*/
typedef struct
{
        unsigned
        zero:1,                         /* Force zero */
        command:3,                      /* command */
        dis_tx:1,                       /* disable tx */
        ena_tx:1,                       /* enable tx */
        dis_rx:1,                       /* disable rx */
        ena_rx:1,                       /* enable rcvr */
        pad:24;                         /* 24 bit pad */
} CMND_REG;

/*
** STATUS reg
*/
typedef struct
{
        unsigned
        rcv_break:1,                    /* rcvd break */
        fram_err:1,                     /* framing error */
        par_err:1,                      /* parity error */
        overrrun_err:1,                 /* overrun error */
        tx_emt:1,                       /* tx empty */
        tx_rdy:1,                       /* tx ready */
        ffull:1,                        /* fifo full */
        rx_rdy:1,                       /* rcvr rdy */
        pad:24;
} STATUS_REG;

/*
** The AUX control reg. is one we write zeros in.
*/
typedef struct
{
        unsigned
        zero:8,
        pad:24;
} ACR;

typedef struct
{
        unsigned
        in_port:1,                      /* input port change */
        delta_brk_b:1,                  /* delta break b */
        rx_rdy_b:1,                     /* RXrdy / FFULLb */
        tx_rdy_b:1,                     /* Tx rdy */
        counter:1,                      /* counter */
        delta_brk_a:1,                  /* delta break a */
        rx_rdy_a:1,                     /* RXrdy / FFULLa */
        tx_rdy_a:1,                     /* Tx rdy */
        pad:24;
} INTERRUPT_REG;
```

Copyright 1989 Logic Modeling Systems

HEADER FILE
include/eeprom.h

DATE 5/23/89 | TIME 1:20:18 pm | PAGE # 1/20

HEADER TEXT

```
/* SCCS_ID: eeprom.h rev 3.1, 4/24/89 at 07:31:19    */

/*
 * NOTES:
 *
 * We don't need an explicit DAB size as that information is easily
 * calculated from "configuration" by counting the number of DAB slots.
 *
 * All DAB information is an even number of bytes long.  This facilitates
 * the reading and writing of the DAB EEPROM as it is 64 bytes by 16 bits
 * and not 128 bytes by 8 bits.
 */

#define DAB_EEPROM_VERSION      0x2B    /* used with "version_number" below, start  */
                                        /* somewhere other than 0 or 1.             */

#define NAME_LENGTH     20              /* length of "device_name"                  */
#define MAKER_LENGTH    16              /* length of "modeler_maker"                */
#define MAN_LENGTH      16              /* length of "manufacturer"                 */
#define REV_LENGTH      4               /* length of "revision"                     */
#define TYPE_LENGTH     8               /* length of "type"                         */
/*
** THIS STRUCTURE MUST ALWAYS BE 128 BYTES.
** THE WRITE COUNT AND CHECKSUM ARE THE LAST 2
** FIELDS.  THIS IS BECAUSE IF THE STRUCTURE CHANGES
** THE WRITE COUNT IS STILL SENSIBLE.
** THE CHECKSUM IS THE LAST FIELD, FOR CONSISTENCY.
** THE CHECKSUM & WRITE COUNT OCCUPY THE LAST 2
** FIELDS.  IF ANY ADDITIONS OR DELETIONS OCCUR
** CHANGE THE RESERVED FIELD APPROPRIATELY.
*/
typedef struct  {
        char    signature[ 4 ];         /* LMSI                                     */
        u_short version_number;         /* version of this information structure    */
        char    device_name[NAME_LENGTH];       /* name of device                   */
        char    model_maker[MAKER_LENGTH];      /* name of who made this model      */
        char    model_revision[REV_LENGTH];     /* examples: 1.0, 2.0, 3.0          */
        char    dab_manufacturer[MAN_LENGTH];   /* name of who made this DAB        */
        char    dab_revision[REV_LENGTH];       /* examples: 1.0, 2.0, 3.0          */
        char    dab_type[TYPE_LENGTH];  /* examples: DIP, PGA, LCC                  */
        u_short insertion_count;        /* number of times the DAB has been inserted */
        u_short segment_number;         /* 16 bit code indicating a DAB "segment#"  */
                                        /* number for multiple physical DABs making */
                                        /* up a single device.                      */
        u_long  configuration;          /* 32 bit code indicating the physical DAB  */
                                        /* configuration based upon 4 lanes X 8 slots */
        u_char  reserved[ 42 ];         /* for future use                           */

        u_short write_count;            /* number of times the EEPROM has been written*/
        u_short checksum;               /* checksum over all the other DAB information*/
} DAB_EEPROM;

#define SIG_WORD_0 (u_short)('M' + ('L' << 8))
#define SIG_WORD_1 (u_short)('I' + ('S' << 8))
#define EEPROM_SIGNATURE_0 0
#define EEPROM_SIGNATURE_1 1
#define EEPROM_WRITE_COUNT 62
#define EEPROM_CHECKSUM     63
#define CPU_E2PROM_SIZE 128
/*
** Equates for the offsets
*/
#define E2_SIGNATURE     0
#define E2_VER           4
#define E2_DEV_NAME      (E2_VER + 2)
#define E2_MODEL_MAKER   (E2_DEV_NAME + NAME_LENGTH)
#define E2_MODEL_REV     (E2_MODEL_MAKER + MAKER_LENGTH)
#define E2_DAB_MAN       (E2_MODEL_REV + REV_LENGTH)
#define E2_DAB_REV       (E2_DAB_MAN + MAN_LENGTH)
#define E2_DAB_TYPE      (E2_DAB_REV + REV_LENGTH)
#define E2_INS_COUNT     (E2_DAB_TYPE + TYPE_LENGTH)
#define E2_SEG_NUMBER    (E2_INS_COUNT + 2)
#define E2_CONFIG        (E2_SEG_NUMBER + 2)
/*
** This are the options
*/
#define START_OPCODE    0x1
#define EEPROM_READ 0x2
#define EEPROM_WRITE 0x1
#define EEPROM_ERASE 0x3
#define EEPROM_ALL   0x0

#define EEPROM_REG_OPTION 0xc0          /* if and option, use register */

#define EEPROM_EWEN  0x30
#define EEPROM_EWDS  0x00
#define EEPROM_ERAL  0x20
#define EEPROM_WRAL  0x10

#define SET_CLK_0         0x100
#define SET_CLK_1         0x101
#define TOG_CLK           0x102
#define NO_TOG_CLK        0x103
#define SET_CS_0          0x104
#define SET_CS_1          0x105
#define FEED_OPCODE       0x107
#define READ_DATA         0x108
#define WRITE_DATA        0x109
#define EEPROM_START      0x10a
#define WAIT_OUT_LOW      0x10b
#define WAIT_OUT_HIGH     0x10c
#define WAIT_IN_LOW       0x10d
#define WAIT_IN_HIGH      0x10e
#define NOP               0x10f
#define DONE              0x110
#define SET_DATA_IN_LOW 0x111
#define EEPROM_DELAY      0x112
#define LITERAL           0xc000
```

Copyright 1989
Logic Modeling Systems

| HEADER FILE | DATE | PAGE # |
|---|---|---|
| include/eprom.h | 5/23/89 | 1/21 |
| | TIME 1:20:18 pm | |

LINE # HEADER TEXT

```
/* SCCS_ID: eprom.h rev 3.1, 4/24/89 at 07:33:21 */

/*
 * This structure defines the organization of EPROM f*     * beginning through
 * the beginning of actual code.  Note that this structure should reflect the
 * organization of lowmem.s and boot.c.
 */

typedef struct
{
        u_long reset_sp;        /* reset vector: initial SP */
        u_long reset_pc;        /* reset vector: initial PC */
        u_long checksum;        /* EPROM checksum */
        u_long diagboot_offset; /* offset of DiagBoot object */
        u_long diagboot_entry;  /* entry point for DiagBoot */
        u_long eprom_used;      /* total number of bytes actually used */
        u_long eprom_size;      /* physical size of EPROM in bytes */
        char revision[68];      /* revision/identifier string */
} eprom_struct;

/*
 * Various constants referring to the previous structure.
 */
#define EPROM_NOCHECKSUM_START  0x08
#define EPROM_NOCHECKSUM_END    0x0C
#define EPROM_CODE_OFFSET       (sizeof(eprom_struct))
#define EPROM_REVISION_LENGTH   68

/*
 * Seeds checksum calculation (pretty random)
 */
#define EPROM_CHECKSUM_INIT     0x7be9c1bd

/*
 * Default eprom_size (for use by mkeprom)-- this assumes 27512's
 */
#define EPROM_SIZE_DEFAULT      (2 * 512 * 1024 / 8)

/*
 * Where to copy the top part of EPROM to in DRAM
 */
#define DIAGBOOT_START          0x300000
```

Copyright 1989
Logic Modeling Systems

| HEADER FILE | DATE 5/23/89 | PAGE # |
|---|---|---|
| include/fifo.h | TIME 1:20:18 pm | 1/22 |

HEADER TEXT

```
/* SCCS_ID: fifo.h rev 3.1, 4/24/89 at 07:33:24      */

/*
** fifo.h
** Fifo header for CPU board.
*/

/*
** max fifos in the system.
*/
#define MAX_FIFOS 4

/*
** max fifo entries in the system.
*/
#define MAX_FIFO_ENTRIES 900
#define MIN_TASK_ENTRIES 100

/*
** fifo header type
*/
struct fifo_header_type
{
        unsigned char user;
        unsigned char task;
        struct fifo_header_type *next;
        char *data;
};
/*
** per fifo information
*/
struct fifo_type
{
        int count;
        struct fifo_header_type *head;
        struct fifo_header_type *tail;
};

struct fifo_entry
{
        char *data;
        unsigned char task;
        unsigned char user;
        char fifo_no;
};
/*
** The fifos
*/
#define HEADER_FIFO 0
#define RX_FIFO 1
#define TX_FIFO 2

/*
** TASK # defns.
*/
#define NO_TASK 0
#define ISR_TASK 0xff
```

Copyright 1989 Logic Modeling Systems

HEADER FILE include/hardware.h DATE 5/23/89 TIME 1:20:18 pm PAGE # 1/23

HEADER TEXT

```
/* SCCS_ID: hardware.h rev 3.1, 4/24/89 at 07:33:22 */

/* This header file contains all of the system physical addresses as specified
 * in the document "LM-1000 [illegible] Maps" dated December 8, 1987.
 */

#define CPU_TIMER_ADDR                  0x10c30000
#define CPU_ID_PROM_ADDR                0x10c50000

#define CPU_STATUS_REG_ADDR             0x10c60000
#define CPU_TMG_INTR_MASK               0xfffffffb
#define CPU_DIP_SWITCH1_MASK            0xf7ffffff
#define CPU_DIP_SWITCH2_MASK            0xfbffffff
#define CPU_DIP_SWITCH3_MASK            0xfdffffff
#define CPU_DIP_SWITCH4_MASK            0xfeffffff
#define SOFTWARE_RESET_MASK             0xfffffffe

#define LANE_0_START_ADDR               0x80000000
#define LANE_ADDR_INC                   0x10000000

#define CLOB_START_ADDR                 0x8e000000

#define LANE_ADDR_MASK                  0xf0000000
#define LANE_SEGMENT_A_OFFSET           0x0
#define LANE_SEGMENT_B_OFFSET           0x4000000
#define LANE_SEGMENT_C_OFFSET           0x8000000
#define LANE_LINK_TABLE_OFFSET          0xc000000
#define LANE_PAC_START_OFFSET           0xc100000
#define LANE_PEL_0_START_OFFSET         0xd000000
#define LANE_PEL_ADDR_INC               0x1000

#define PAC_BOARD_ID_OFFSET             0x0
#define PAC_PAM_COUNT_REG_OFFSET        0x80
#define PAC_PAM_CONFIG_REG_OFFSET       0x100
#define PAC_BRANCH_ADDR_REG_OFFSET      0x180
#define PAC_CLOCK_SPEED_REG_OFFSET      0x200
#define PAC_ERROR_REG_OFFSET            0x280
#define PAC_BLOCK_OFFSET                0x300
#define PAC_PARITY_ERROR_ADDR_OFFSET    0x380
#define PAC_PAM_0_PRESENT_REG_OFFSET    0x400
#define PAC_PAM_0_ID_SIZE_REG_OFFSET    0x480
#define PAC_PAM_1_PRESENT_REG_OFFSET    0x500
#define PAC_PAM_1_ID_SIZE_REG_OFFSET    0x580
#define PAC_PAM_2_PRESENT_REG_OFFSET    0x600
#define PAC_PAM_2_ID_SIZE_REG_OFFSET    0x680
#define PAC_PAM_3_PRESENT_REG_OFFSET    0x700
#define PAC_PAM_3_ID_SIZE_REG_OFFSET    0x780
#define PAC_CONFIG_HIGH_WORD_PARITY_MASK        0xffffff7f
#define PAC_CONFIG_LOW_WORD_PARITY_MASK         0xffffffbf

#define PAC_PAM_PRESENT_REG_ADDR_INC    0x100
#define PAC_PAM_ID_SIZE_REG_ADDR_INC    0x100
#define PAC_LOW_WORD_PARITY_MASK        0xf7ffffff
#define PAC_HIGH_WORD_PARITY_MASK       0xfbffffff
#define PAC_PARITY_ADDR_MASK            0xfc000000

/* 2 MSB positions indicate the size of the PAM */
#define PAC_PAM_BOARD_ID_MASK           0x3fffffff
#define PAC_PAM_SIZE_SHIFT              30
#define PAC_PAM_128K                    0
#define PAC_PAM_512K                    1
#define PAC_PAM_2M                      2
#define BLOCKS_IN_128K                  512
#define BLOCKS_IN_512K                  2048
#define BLOCKS_IN_2M                    8192

#define PAC_PAM_COUNT_EQ_0              0x0
#define PAC_PAM_COUNT_EQ_1              0x1
#define PAC_PAM_COUNT_EQ_2              0x3
#define PAC_PAM_COUNT_EQ_3              0x7
#define PAC_PAM_COUNT_EQ_4              0xf

#define PEL_MC_0_OFFSET                   0x0
#define PEL_MC_ADDR_INC                   0x100

#define PEL_VIL_DAC_WRITE_OFFSET          0x500
#define PEL_VIH_DAC_WRITE_OFFSET          0x504
#define PEL_VLTH_DAC_WRITE_OFFSET         0x600
#define PEL_VSL_DAC_WRITE_OFFSET          0x604
#define PEL_VHTH_DAC_WRITE_OFFSET         0x700
#define PEL_VSH_DAC_WRITE_OFFSET          0x704
#define PEL_VIL_DAC_READ_OFFSET           0x800
#define PEL_VIH_DAC_READ_OFFSET           0x804
#define PEL_VLTH_DAC_READ_OFFSET          0x808
#define PEL_VSL_DAC_READ_OFFSET           0x80c
#define PEL_VHTH_DAC_READ_OFFSET          0x810
#define PEL_VSH_DAC_READ_OFFSET           0x814
#define PEL_DUTVCC_DAC_READ_OFFSET        0x818
#define PEL_DABSIGNAL_DAC_RESET_OFFSET    0x81c
#define PEL_ID_PROM_OFFSET                0x900
#define PEL_STATUS_CONTROL_OFFSET         0xa00

#define MAX_PEL_SDRIVE_CURRENT            3000    /* 300.0 mA */

#define PEL_SDRIVE_HIGH_3_CURRENT           20    /*   2.0 mA */
#define PEL_SDRIVE_HIGH_2_CURRENT           12    /*   1.2 mA */
#define PEL_SDRIVE_HIGH_1_CURRENT            5    /*   0.5 mA */
#define PEL_SDRIVE_HIGH_0_CURRENT            1    /*   0.1 mA */

#define PEL_SDRIVE_LOW_3_CURRENT            30    /*   3.0 mA */
#define PEL_SDRIVE_LOW_2_CURRENT            12    /*   1.2 mA */
#define PEL_SDRIVE_LOW_1_CURRENT             5    /*   0.5 mA */
#define PEL_SDRIVE_LOW_0_CURRENT             2    /*   0.2 mA */

#define DAC_TIMER_VALUE                    900    /* microseconds */
#define TMG_TIMER_VALUE                    500    /* microseconds */

#define MC_REG_0_OFFSET                   0x0
#define MC_REG_ADDR_INC                   0x4

#define MC_DATA_OUT_REG_OFFSET            0x0
#define MC_MDOE_REG_OFFSET                0x4
#define MC_EDOE_REG_OFFSET                0x8
#define MC_CTL_OUT_REG_OFFSET             0xc
#define MC_LAST_CYCLE_REG_OFFSET          0x10
#define MC_ENDEN_REG_OFFSET               0x14
#define MC_DATA_FORMAT_REG_OFFSET         0x18
#define MC_ERROR_DATA_REG_OFFSET          0x1c
#define MC_SHORT_SAMPLE_REG_OFFSET        0x20
#define MC_U_SAMPLE_REG_OFFSET            0x24
```

Copyright 1989 Logic Modeling Systems

HEADER FILE: include/hardware.h | DATE: 5/23/89 | TIME: 1:20:18 pm | PAGE #: 2/24

HEADER TEXT

```
#define MC_HIZ_SAMPLE_REG_OFFSET           0x28
#define MC_VALUE_SAMPLE_REG_OFFSET         0x2c
#define MC_TIMING_SAMPLE_REG_OFFSET        0x30
#define MC_UNUSED_REG_OFFSET               0x34
#define MC_STATU_     OFFSET               0x38
#define MC_RESET_REG_OFFSET                0x3c

/* The following addresses are not defined yet !!??? */
#define CPU_MEM_SIZE_ADDR               0x00100000
#define CPU_SLOT_COUNT_ADDR             0x10c00004
#define CPU_LANE_COUNT_ADDR             0x10c00008

#ifdef DBASE
/* These are dummy locations for these entities for data base purposes. */
#define PEL_DAB_EEPROM_OFFSET           0xb00
#endif

#define CLOB_BOARD_ID_OFFSET            0x0

#define MAX_EDGE_COUNT          7

#define MAX_SEGMENT_PER_DEVICE 32

/* feedback pipeline delay */
#define FB_PIPE_DELAY                   8

/* Constants related to edge placement */
#define MAX_MODELER_CLOCK_PERIOD        6666666  /* 150KHz in picoseconds */
#define MIN_MODELER_CLOCK_PERIOD        40000    /* 25 MHz in picoseconds */
#define MAGIC_OUTPUT_DEAD_TIME          5000     /* picosec */
#define EDOFF_OFFSET                    15000    /* picosec */
#define EDOFF_TO_STORE_OFFSET           10000    /* picosec */

/* For I/O store pins running in ultra_fast mode */
#define EDOFF_PERIOD_THRESHOLD         1000000  /* ps */
#define EDOFF_HOLD_TIME_THRESHOLD      200000   /* ps */
#define STORE_TO_EDOFF_OFFSET          20000    /* ps */

#define NO_TM_RISING_SAMPLE_TIME        125000   /* picosec */
#define MAX_SAMPLE_TIME_RANGE           1000000  /* picosec */
#define MIN_SAMPLE_PULSE_WIDTH          600000   /* picosec hardware constraint*/
/* The following constant has to be greater than MAX_SAMPLE_TIME_RANGE +
 * MIN_SAMPLE_PULSE_WIDTH.
 */
#define DEFAULT_FALL_SAMPLE_TIME        1600000  /* picosec */
#define DEFAULT_FALL_SAMPLE_TIME2       5000000  /* picosec */

#define MAX_PAM_COUNT           4

#define MAX_DUT_VCC_VOLTAGE     6000  /* mV */
#define MAX_ADC_VOLTAGE         5000  /* mV */

#define EXT0_REG_VALUE          3
#define EXT1_REG_VALUE          4

/* These 2 constants are also defined in tmg_def.h */
#define EARLYSAMPLETRIGGERMODE 0
#define EDGE7SAMPLETRIGGERMODE 1

#ifdef DBASE
#define MAX_MAN_ID_CHAR       16
#define MAX_DAB_TYPE_CHAR     4
#define MAX_REVISION_CHAR     4
#define MAX_PART_NAME_CHAR    20

typedef struct {
   u_short   stat_o_info;                /* for database management */
   u_short   value_type;                 /* for database management */
   char man_id[MAX_MAN_ID_CHAR];
   char dab_type[MAX_DAB_TYPE_CHAR];
   char revision[MAX_REVISION_CHAR];
   char part_name[MAX_PART_NAME_CHAR];
   u_long dab_shape;
   u_short dab_segment_number;
} EEPROM_CONTENTS;
#endif
```

Copyright 1989 Logic Modeling Systems

HEADER FILE include/id.h DATE 5/23/89 TIME 1:20:18 pm PAGE # 1/25

LINE # HEADER TEXT

```
/* SCCS_ID: id.h rev 3.1, 4/24/89 at 07:33:30      */

/*
 * Defi   r various LMSI hardware ID PROMs
 */

#define ID_NUM_BYTES              32              /* bytes in ID PROM */
#define ID_CHECK_BYTES            31              /* bytes to checksum */

#define ID_CHECKSUM_INIT          0x7b            /* checksum algorithm seed */
#define ID_CHECKSUM_GOOD          0
#define ID_CHECKSUM_OFFSET        (31 * 4)        /* byte offset to checksum */

#define ID_NULL_DATA              0x00            /* unblown state? */

/*
 * Values for board type (from the xxxxx in 073-xxxxx)
 */
#define ID_BT_CPU                 3
#define ID_BT_TMG                 4
#define ID_BT_PAC                 5
#define ID_BT_PAM128K             6
#define ID_BT_PAM512K             7
#define ID_BT_PAM2M               19
#define ID_BT_TTLPEL              8

/*
 * Other interesting definitions, including our Ethernet block and
 * various constant multipliers.
 */
#define ID_GEN_SPEED_K            1000000         /* All speed == MHz */
#define ID_GEN_WIDTH_K            16              /* All width == 16-pin words*/
#define ID_GEN_PATTERNS_K         1024            /* All patterns == Kpats    */

#define ID_CPU_ETHERNET_BYTE0     0x00            /* These three bytes        */
#define ID_CPU_ETHERNET_BYTE1     0x00            /*   constitute our assigned */
#define ID_CPU_ETHERNET_BYTE2     0xAB            /*   24-bit Ethernet block   */
#define ID_CPU_DRAM_SIZE_K        (1024*1024)     /* CPU DRAM == MB           */

/*
 * Default parameters (for "obscure" values, as per initial LM-1000)
 */
#define ID_DEF_CPU_MODEL_NUMBER 1000              /* i.e. LM-1000 */
#define ID_DEF_CPU_DRAM_SIZE      (4 * 1024*1024) /* 4 MB */

#define ID_DEF_TMG_SPEED          25000000        /* 25 MHz */
#define ID_DEF_TMG_WIDTH          320             /* 320 pins */

#define ID_DEF_PAC_SPEED          25000000        /* 25 MHz */
#define ID_DEF_PAC_WIDTH          80              /* 80 pins */
#define ID_DEF_PAC_PATTERNS       (8 * 1024*1024) /* 8M patterns */

#define ID_DEF_PAM_SPEED          25000000        /* 25 MHz */
#define ID_DEF_PAM_WIDTH          80              /* 80 pins */

#define ID_DEF_PEL_SPEED          25000000        /* 25 MHz */
#define ID_DEF_PEL_WIDTH          80              /* 80 pins */
#define ID_DEF_PEL_PATTERNS       0               /* no pattern memory */

/*
 * Date codes are used in various places...
 */
typedef struct
{
    u_char year;                       /* relative to 1900, 88-255 */
    u_char week;                       /* 1-53 */
} date_code;

/*
 * Generic first 4 bytes of an ID PROM...
 */
typedef struct
{
    u_char       board_type;       /* Fab number from 073 suffix */
    u_char       revision;         /* ASCII 'A'-'Z' */
    u_char       eco_level;        /* 1-31, ASCII ' ', then ASCII 'A'-'Z' */
    u_char       reserved;
} id_stuff;

#define ID_PRODUCTION_ECO         ' '                 /* for eco_level field */
#define ID_MIN_ECO                1
#define ID_MAX_ECO                31

typedef struct
{
    id_stuff     generic;
    u_char       b_s_data[27];     /* board-specific data */
    u_char       checksum;
} ID_PROM_GENERIC;

typedef struct
{
    id_stuff     generic;
    u_char       bogus[6];         /* Formerly serial number stuff */
    u_char       ethernet[6];      /* Ethernet address */
    u_short      model_number;     /* Model number of this box */
    u_char       dram_size;        /* (times ID_CPU_DRAM_SIZE_K, 0 -> 255) */
    u_char       unused[12];
    u_char       checksum;
} ID_PROM_CPU;

/*
 * Following constant necessary for CPU self-test to locate DRAM size
 * without loading IDPROM structure into DRAM.
 */
#define ID_CPU_DRAM_SIZE_OFFSET (18 * 4)

typedef struct
{
    id_stuff     generic;
    u_char       speed;            /* (times ID_GEN_SPEED_K) */
    u_char       width;            /* (times ID_GEN_WIDTH_K) */
    u_char       unused[25];
    u_char       checksum;
} ID_PROM_TMG;

typedef struct
{
    id_stuff     generic;
    u_char       speed;
```

Copyright 1989
Logic Modeling Systems

HEADER FILE include/id.h | DATE 5/23/89 | TIME 1:20:18 pm | PAGE # 2/26

LINE # HEADER TEXT

```
    u_char      width;
    u_short     patterns;        /* (times ID_GEN_PATTERNS_T) */
    u_char      unused[23];
    u_char      checksum;
} ID_PROM_PAC;

typedef struct
{
    id_stuff    generic;
    u_char      speed;
    u_char      width;
    u_short     patterns;
    u_char      unused[23];
    u_char      checksum;
} ID_PROM_PAM;

typedef struct
{
    id_stuff    generic;
    u_char      speed;
    u_char      width;
    u_short     patterns;        /* i.e. built-in pattern memory */
    date_code   magic_build;     /* Magic chips' lot date code */
    u_char      unused[21];
    u_char      checksum;
} ID_PROM_PEL;

/*
 * Call the following macro with argument equal to the board type to
 * determine if data should be stored inverted in the PROM when generating
 * the actual PROM contents.
 */
#define ID_INVERTED(x)          ((x == ID_BT_PAM128K) || (x == ID_BT_PAM512K) \
                                  || (x == ID_BT_PAM2M))
```

Copyright 1989 Logic Modeling Systems

HEADER FILE include/intr.h

DATE 5/23/89 TIME 1:20:18 pm PAGE # 1/27

HEADER TEXT

```
/* SCCS_ID: intr.h rev 3.1, 4/24/89 at 07:31:33 */

#ifdef DIAGS
#define INTR_INIT       jmp_buf *save_buf, local_buf; /* local variables */

#define INTR_BEGIN      save_buf = diag_jmpbuf; \
                        if (!diag_setjmp(local_buf)) { \
                                diag_jmpbuf = (jmp_buf *)local_buf;
#define INTR_GOT_ONE    } else { diag_jmpbuf = save_buf;
#define INTR_END        } diag_jmpbuf = save_buf;

extern jmp_buf *diag_jmpbuf;
#else DIAGS
#define INTR_INIT
#define INTR_BEGIN      if (1) {
#define INTR_GOT_ONE    } else {
#define INTR_END        }
#endif DIAGS
```

Copyright 1989
Logic Modeling Systems

HEADER FILE
include/lance.h

DATE 5/23/89
TIME 1:20:18 pm
PAGE # 1/28

HEADER TEXT

```
/* SCCS_ID: lance.h rev 3.1, 4/24/89 at 07:33:36     */

/*
 *      The following structure and #define definitions are for the
 *      Advanced Micro Devices:
 *
 *                  Am7990 Local Area Controller for Ethernet (LANCE)
 *
 *      as taken from the 10/86 LANCE data sheet (publication #05698B/0)
 */


/*
 * Used to select one of the LANCE's control and status registers.
 * Written into the register address port before accessing the
 * desired register data port.
 */
#define SELECT_CSR0     0
#define SELECT_CSR1     1               /* CSR1, CSR2, CSR3 are only accessable */
#define SELECT_CSR2     2               /* when the STOP bit of CSR0 is set.    */
#define SELECT_CSR3     3

/*
 * Control and Status Register 0
 *
 * In the comment section:
 *              INT = INTerrupt, SE = System Error, R/T-off = Receive/Transmit-off
 */
#define ERROR_SUMMARY           0x8000  /* Read-only ==> Logical OR of all *_ERRORs        */
#define TRANSMIT_BABBLE_ERROR   0x4000  /* Read/Write 1 to clear ==> INT,SE                */
#define COLLISION_ERROR         0x2000  /* Read/Write 1 to clear ==>     SE (heartbeat)    */
#define MISSED_PACKET_ERROR     0x1000  /* Read/Write 1 to clear ==> INT,SE                */
#define MEMORY_ERROR            0x0800  /* Read/Write 1 to clear ==> INT,SE,R/T-off        */
#define RECEIVE_INTERRUPT       0x0400  /* Read/Write 1 to clear ==> INT                   */
#define TRANSMIT_INTERRUPT      0x0200  /* Read/Write 1 to clear ==> INT                   */
#define INITIALIZE_DONE         0x0100  /* Read/Write 1 to clear ==> INT                   */
#define INTERRUPT_SUMMARY       0x0080  /* Read-only                                       */
#define INTERRUPT_ENABLE        0x0040  /* Complicated                                     */
#define RECEIVE_ON              0x0020  /* Read-only ==> check after every receive         */
#define TRANSMIT_ON             0x0010  /* Read-only ==> check after every transmit        */
#define TRANSMIT_DEMAND         0x0008  /* No-read/Write 1 to set                          */
#define STOP_ACTIVITY           0x0004  /* Read/Write 1 to set ==> before START_ACTIVITY*/
#define START_ACTIVITY          0x0002  /* Read/Write 1 to set ==> before INIT*_START    */
#define INITIALIZE_START        0x0001  /* Read/Write 1 to set ==> after START_ACTIVITY */


/*
 * Control and Status Registers 1 & 2
 *
 * These are the low order 16 bits of the initialization block
 * address (word aligned) plus 8 bits reserved plus the 8
 * high order bits of the initialization block address.
 *
 * See the above comment about accessability.
 */


/*
 * Control and Status Register 3
 *
 * See the above comment about accessability
 */
#define BYTE_SWAP               0x4     /* BSWP */
#define ALE_CONTROL             0x2     /* ACON */
#define BYTE_CONTROL            0x1     /* BCON */

/*
 * Definitions of who owns the receive or transmit buffer.
 * Used with "own_buffer" in *_message_descriptor.
 */
#define HOST_BUFFER_OWNERSHIP   0
#define LANCE_BUFFER_OWNERSHIP  1


/*
 * Initialization block structure definition
 *
 * This structure must be word aligned in system memory.
 */
typedef struct  initialization_block    {
        /* Mode Register (MODE) */
        unsigned        promiscuous:1,          /* PROM */
        unsigned        reserved_1:8,           /* RES  */
        unsigned        internal_loopback:1,    /* INTL */
        unsigned        disable_retry:1,        /* DRTY */
        unsigned        force_collision:1,      /* COLL */
        unsigned        disable_crc_transmit:1, /* DTCR */
        unsigned        loopback:1,             /* LOOP */
        unsigned        disable_transmit:1,     /* DTX  */
        unsigned        disable_receive:1,      /* DRX  */

        /*
         * Physical Address (PADR)
         *
         * 48 bit physical Ethernet address accessed via bytes to
         * handle VME access to the PROM that contains this data.
         *
         * The "strange" byte ordering is extremely important and must not
         * be changed in order to match up with the LANCE's expectations.
         *
         * If PADR[15:0] = 5CBA and PADR[31:16] = 9876 and PADR[47:32] = 5432
         * then the transmitted bit stream is (from first bit to last):
         *
         *      0101|1101|0011|1010|0110|1110|0001|1001|0100|1100|0010|1010
         *        A    B    C    5    6    7    8    9    2    3    4    5
         *
         * and the printed ASCII Ethernet Address is: BA-5C-76-98-32-54.
         *
         * This means that physical addresses have an even number as the first
         * printed ASCII Ethernet Address byte and that multicast addresses have
         * an odd number as the first printed ASCII Ethernet Address byte.
         */
        u_char          physical_address_2;     /* PADR */
        u_char          physical_address_1;     /* PADR ==> bit[0] must be 0 */
        u_char          physical_address_4;     /* PADR */
        u_char          physical_address_3;     /* PADR */
        u_char          physical_address_6;     /* PADR */
        u_char          physical_address_5;     /* PADR */

        /*
```

Copyright 1989 Logic Modeling Systems

LINE # HEADER TEXT

```
         * Logical Address Filter (LADRF)
         *
         * Must always be zero (0) as we don't implement any multi-casting.
         * This really should look like PADR, but we don't use it so punt.
         */
        u_long          logical_address_1;      /* LADRF */
        u_long          logical_address_2;      /* LADRF */

        /*
         * Receive Descriptor Ring Pointer (RDRA)
         *
         * The receive ring address must be quadword aligned (i.e., bits[2:0] = 0)
         */
        u_short         low_receive_ring_address;
        unsigned        receive_ring_length:3,  /* expressed as a power of 2 */
        unsigned        reserved_2:5;
        unsigned        high_receive_ring_address:8;

        /*
         * Transmit Descriptor Ring Pointer (TDRA)
         *
         * The transmit ring address must be quadword aligned (i.e., bits[2:0] = 0)
         */
        u_short         low_transmit_ring_address;
        unsigned        transmit_ring_length:3, /* expressed as a power of 2 */
        unsigned        reserved_3:5;
        unsigned        high_transmit_ring_address:8,
} INIT_BLOCK;


/*
 * Receive message descriptor structure definition
 *
 * This structure must be quadword aligned in system memory.
 */
typedef struct  receive_message_descriptor      {
        /* Receive Message Descriptor 0 (RMD0) */
        u_short         low_buffer_address;     /* LADR */

        /* Receive Message Descriptor 1 (RMD1) */
        unsigned        own_buffer:1,                   /* OWN   HOST=0, LANCE=1 */
        unsigned        error_summary:1,                /* ERR   ==> Logical OR of *_errors */
        unsigned        framing_error:1,                /* FRAM  */
        unsigned        overflow_error:1,               /* OFLO */
        unsigned        crc_error:1,                    /* CRC   */
        unsigned        buffer_error:1,                 /* BUFF  */
        unsigned        start_of_packet:1,              /* STP   */
        unsigned        end_of_packet:1,                /* ENP   */
        unsigned        high_buffer_address:8,          /* HADR  */

        /* Receive Message Descriptor 2 (RMD2) */
        unsigned        must_be_ones:4;
        unsigned        buffer_byte_count:12,           /* BCNT: two's complement number */

        /* Receive Message Descriptor 3 (RMD3) */
        unsigned        must_be_zeros:4,
        unsigned        message_byte_count:12,          /* MCNT  */
} RECV_MDE;


/*
 * Defined error returns from lance_transmit().  These exactly
 * correspond to the TMD3, RMD1 error indications from the LANCE.
 * Except, PACKET_OVERFLOW_ERROR which indicates that the received
 * packet did not fit in a single receive message buffer - this is
 * a fatal error as the code can not handle this situation.
 *
 * NOTE: all *_ERROR #defines must be maintained as a set exclusive
 *      of each other.  In particular, CSR0 has several *_ERRORs.
 */
#define BUFFER_ERROR                    0x00001
#define UNDERFLOW_ERROR                 0x00002
#define LATE_COLLISION_ERROR            0x00004
#define LOST_CARRIER_ERROR              0x00008
#define RETRY_ERROR                     0x00010
#define FRAMING_ERROR                   0x00020
#define OVERFLOW_ERROR                  0x00040
#define CRC_ERROR                       0x00080
#define PACKET_OVERFLOW_ERROR           0x00100
#define LANCE_TIMEOUT_ERROR             0x00200
#define BUFFER_TOO_SMALL                0x00400
#define FAILURE_TO_WRITE_TO_LANCE_CSR   0x00800
#define FAILURE_TO_READ_FROM_LANCE_CSR  0x01000
#define TRANSMITTER_IS_OFF              0x02000
#define RECEIVER_IS_OFF                 0x04000

/*
 * Transmit message descriptor structure definition
 *
 * This structure must be quadword aligned in system memory.
 */
typedef struct  transmit_message_descriptor     {
        /* Transmit Message Descriptor 0 (TMD0) */
        u_short         low_buffer_address,     /* LADR */

        /* Transmit Message Descriptor 1 (TMD1) */
        unsigned        own_buffer:1,                   /* OWN   HOST=0, LANCE=1 */
        unsigned        error_summary:1,                /* ERR   ==> Logical OR of *_errors */
        unsigned        reserved_as_zero_1:1,           /* RES  */
        unsigned        multiple_retries:1,             /* MORE */
        unsigned        one_retry:1,                    /* ONE  */
        unsigned        deferred:1,                     /* DEF  */
        unsigned        start_of_packet:1,              /* STP  */
        unsigned        end_of_packet:1,                /* ENP  */
        unsigned        high_buffer_address:8,          /* HADR */

        /* Transmit Message Descriptor 2 (TMD2) */
        unsigned        must_be_ones:4,
        unsigned        buffer_byte_count:12,           /* BCNT: two's complement number */

        /* Transmit Message Descriptor 3 (TMD3) */
        unsigned        buffer_error:1,                 /* BUFF ==> T-off */
        unsigned        underflow_error:1,              /* UFLO ==> T-off */
        unsigned        reserved_as_zero_2:1,           /* RES  */
        unsigned        late_collision_error:1,         /* LCOL */
        unsigned        lost_carrier_error:1,           /* LCAR */
        unsigned        retry_error:1,                  /* RTRY */
        unsigned        time_domain_reflectometry:10,   /* TDR  */
} TRANS_MDE;
```

Copyright 1989 Logic Modeling Systems

HEADER FILE include/lance.h

DATE 5/23/89

TIME 1:20:18 pm

PAGE # 3/30

HEADER TEXT

LINE #

```
/*
 * The number of buffers that are allocated for reception and transmission
 * must be equal for the TFTP-like protocol that     ed to work properly.
 * I have specified two sets of #defines in the (un)…kely event that we ever
 * have to change the upper level protocol to something other than TFTP-like.
 *
 * The maximum number of buffers that the LANCE can handle in it's receive
 * and transmit descriptor rings is 128 (i.e., MAX_*_BUFFERS must be <= 128).
 */
#define MAX_RECEIVE_BUFFERS        64
#define POWER_OF_2_MAX_RECEIVE_BUFFERS   6

#define MAX_TRANSMIT_BUFFERS       64
#define POWER_OF_2_MAX_TRANSMIT_BUFFERS 6
/*
 * This buffer allocations are used during network boot.
 * it is advantageous to have as few buffers as possible.
 * there is more RAM available to download
 */
#define MAX_RECEIVE_BT_BUFFERS 4
#define POWER_OF_2_RECEIVE_BT_BUFFERS    2

#define MAX_TRANSMIT_BT_BUFFERS 4
#define POWER_OF_2_TRANSMIT_BT_BUFFERS   2

/* FIXIT: buffer sizes */
/*
 * The size of the buffers needs to be adjusted to something more reasonable
 * based upon the HOST machine's Ethernet support and our upper level protocol.
 * Again, these must be the same size and have been specified as a pair per above.
 *
 * Ethernet specifies the minimum packet size at 64 bytes.
 * Remember to pad out the DATA area to 46 bytes if it is not that big.
 */
/* FIXIT: buffer sizes */
/*
 * The buffer size must contain space for the Ethernet, IP, and UDP headers.
 * This must be carefully cooridinated with the client #defines and code.
 *
 * The LANCE requires that the minimum receive buffer size be >= 64 bytes.
 * The LANCE requires that the minimum transmit buffer size be >= 64 bytes
 * when data-chaining is NOT used and >= 100 bytes when it is.
 */
#define MAX_RECEIVE_BUFFER_SIZE          1518
#define MAX_TRANSMIT_BUFFER_SIZE         1518

extern  u_short get_lance_ready_to_go();
extern  u_short start_lance();
extern  u_short read_lance_csr();
extern  u_short write_lance_csr();

extern  void    shutdown_lance();
extern  void    shutdown_and_reset_lance();
```

Copyright 1989 Logic Modeling Systems

HEADER FILE include/lm_diags.h

DATE 5/23/89

TIME 1:20:19 pm

PAGE # 1/31

LINE # HEADER TEXT

```
/* SCCS_ID: lm_diags.h rev 3.1, 4/24/89 at 07:33:40 */

/*      Attribute fields */

#define LM_DIAG_log_results      0x0001 /* log test results */
#define LM_DIAG_dflt_msg_off     0x0002 /* default to messages off */
#define LM_DIAG_no_select        0x0004 /* menu item will not be selectable */
#define LM_DIAG_no_display       0x0008 /* menu item will not be displayed */
#define LM_DIAG_no_execute       0x0010 /* menu item will not be executed
                                           when "all" is selected */
#define LM_DIAG_wizard_mode      0x0020 /* menu item will display/execute
                                           in "wizard" mode only */
#define LM_DIAG_no_repeat        0x0040 /* menu item cannot be repeated */
#define LM_DIAG_automatic_quit   0x0080 /* quits after one selection */
#define LM_DIAG_no_summary       0x0100 /* menu item will not display summary */
#define LM_DIAG_acceptance       0x0200 /* execute item in acceptance test */
#define LM_DIAG_no_banner        0x0400 /* don't print usual banner */
#define LM_DIAG_menu_banner      0x0800 /* print lead banner only if running
                                           "all" or "acceptance" */

#define LM_DIAG_another_menu     (LM_DIAG_no_repeat \
                                  | LM_DIAG_no_summary \
                                  | LM_DIAG_menu_banner)
#define LM_DIAG_diag_routine     (LM_DIAG_dflt_msg_off \
                                  | LM_DIAG_log_results)
#define LM_DIAG_disable          (LM_DIAG_no_execute \
                                  | LM_DIAG_no_select)
#define LM_DIAG_user_utility     (LM_DIAG_no_execute \
                                  | LM_DIAG_no_repeat \
                                  | LM_DIAG_no_summary)
#define LM_DIAG_utility          (LM_DIAG_user_utility \
                                  | LM_DIAG_wizard_mode)
#define LM_DIAG_utility_menu     (LM_DIAG_another_menu \
                                  | LM_DIAG_utility)
#define LM_DIAG_utility_repeat   (LM_DIAG_utility | LM_DIAG_no_repeat)

/*      Status bits */

#define LM_DIAG_null             0x0000 /* initial value for status field */
#define LM_DIAG_run              0x0001 /* menu item has been run */
#define LM_DIAG_fail             0x0002 /* menu item didn't return "success" */
#define LM_DIAG_stop_test        0x0004 /* menu item requests no further
                                           tests be run for this menu.
                                           this is a "punt" mechanism
                                           while running "all" */

/*      Status word bit setting macros */

#define TEST_RUN(menu_ptr)        ((LM_DIAG_MENU *)\
            menu_ptr)->menu_items[((LM_DIAG_MENU *)\
            menu_ptr)->current_selection].status |= LM_DIAG_run
#define TEST_FAILED(menu_ptr)     ((LM_DIAG_MENU *)\
            menu_ptr)->menu_items[((LM_DIAG_MENU *)\
            menu_ptr)->current_selection].status |= LM_DIAG_fail
#define STOP_TEST(menu_ptr)       ((LM_DIAG_MENU *)\
            menu_ptr)->menu_items[((LM_DIAG_MENU *)\
            menu_ptr)->current_selection].status |= LM_DIAG_stop_test

typedef struct {
        char *selection, /* the character string for selecting the item */
        char *menu_text, /* a description of the menu item */
        int     (* action_routine)(); /* the address of the routine to run */
        long    attributes, /* see attribute bits above */
        long    status, /* return status, see above */
        char *user_data, /* pointer to user data, passed to user routine */
} LM_DIAG_MENU_ITEM,


typedef struct {
        char *title, /* the title of the menu */
        short number_of_items, /* number of items in the menu */
        short current_selection, /* index into menu_items */
        LM_DIAG_MENU_ITEM *menu_items, /* address of the menu structure array */
} LM_DIAG_MENU,

#define max_str         255
#define MAX_DEPTH       20

/*      Global counters */

extern long     total_cycles[],
extern long     total_tests[],
extern long     total_errors[],
extern long     total_error_messg[],
extern long     total_warnings[],
extern long     total_messages[],

/*      External function definitions */

char lm_get_key(),
char *lm_get_line(),

/* Network diag command tokens and useful definitions */

#define BS      8
#define LF      10
#define CR      13
#define DEL     127
#define ctrl(c) ('c' & 0x1f)
#define UPPERCASE(c)    ((((c) >= 'a') && ((c) <= 'z'))? (c) - 'a' + 'A': (c))
#define INTR_CHARACTER  ctrl(X)

/*
** Note that all Tokens are even-numbered so that the core modeler can
** complain properly.
*/

#define LM_DIAG_SELECT          0x102
#define LM_DIAG_GOTIT           0x104 /* ACKnowledge token */
#define LM_DIAG_RESULT          0x106
#define LM_DIAG_ITEM            0x108
#define LM_DIAG_TITLE           0x10a
#define LM_DIAG_WRITE           0x10c
#define LM_DIAG_ERROR           0x10e
#define LM_DIAG_HELP            0x110
#define LM_DIAG_NULL            0x112
#define LM_DIAG_WARN            0x114
#define LM_DIAG_MESS            0x116
#define LM_DIAG_START           0x118
#define LM_DIAG_END             0x11a
```

Copyright 1989 Logic Modeling Systems

HEADER FILE include/lm_diags.h

DATE 5/23/89 TIME 1:20:19 pm PAGE # 2/32

HEADER TEXT

LINE #

```
#define LM_DIAG_GIMME             0x11c /* request next line */
#define LM_DIAG_GETKEY            0x11e
#define LM_DIAG_GETLINE           0x120
#define LM_DIAG_CHECKKEY          0x122
#define LM_DIAG_GOTKEY            0x124
#define LM_DIAG_NOKEY             0x126
#define LM_DIAG_TEST_FAILED       0x128
```

Copyright 1989
Logic Modeling Systems

| HEADER FILE | DATE | PAGE # |
|---|---|---|
| include/lm_rd_wr.h | 5/23/89 | 1/33 |
| | TIME 1:20:19 pm | |

HEADER TEXT

```
/* SCCS_ID: lm_rd_wr.h rev 3.1, 4/24/89 at 07:33:43    */

/*
** Interface to read/write from modeler.
** lm_read() , lm_write()
** A maximum of 512 bytes can be read or written at a time.
**
*/

/*
** Types of accessible memories
**
*/
#define LM_CPURAM_MEMORY         (u_long)0
#define LM_NVSRAM_MEMORY         (u_long)1
#define LM_EPROM_MEMORY          (u_long)2
#define LM_IDPROM_MEMORY         (u_long)3
#define LM_E2PROM_MEMORY         (u_long)4
#define LM_MODELER_MEMORY        (u_long)5
#define LM_CPUREG_MEMORY         (u_long)6
#define LM_DUARTA_MEMORY         (u_long)7
#define LM_DUARTB_MEMORY         (u_long)8
#define LM_MAX_MEMORY            (u_long)8

#define LM_DUART_MODEM           LM_DUARTB_MEMORY
#define LM_DUART_CONSOLE         LM_DUARTA_MEMORY
/*
** Status, Error codes
*/
#define INVALID_PARAMETER        (u_long)0x100
#define ERROR_ACCESSING_MEMORY   (u_long)0x101
#define NO_MEMORY                (u_long)0x102
/*
** failed to write to EEprom
*/
#define WRITE_FAILURE            (u_long)0x103
/*
** Error codes for SRAM, and EEprom
*/
#define INVALID_NVRAM    (unsigned long) 0x104
#define NO_NVRAM_ERROR   (unsigned long) 0x105
#define NO_NVRAM         (unsigned long) 0x106
#define INVALID_BOOT_STRUCT (unsigned long) 0x107
#define STALE_EPROM_SOFTWARE        (unsigned long) 0x108
#define STALE_BOOT_SOFTWARE (unsigned long) 0x109

/*
** process_lm_read( memory_type, ee_number, offset, number_of_bytes, buffer, status);
** lm_read( memory_type, ee_number, offset, number_of_bytes, buffer, status);
** u_char memory_type = one of the above.
** u_char ee_number, 0-31, for eeprom access.
** u_long offset, for particular memory. NOTE: MODELER_MEMORY provides raw access and offset is the address.
** u_short number_of_bytes, number of bytes to xfer.
** char *buffer, is memory buffer to copy to.
** u_short *status gives reason for failure.
*/
/*
** process_lm_write( memory_type, ee_number, offset, number_of_bytes, buffer, status);
** lm_write( memory_type, ee_number, offset, number_of_bytes, buffer, status);
** u_char memory_type = one of the above.
** u_char ee_number, 0-31, for eeprom access.
** u_long offset, for particular memory. NOTE: MODELER_MEMORY provides raw access and offset is the address.
** u_short number_of_bytes, number of bytes to xfer.
** char *buffer, is memory buffer to copy from.
** u_short *status gives reason for failure.
*/
/*
** options , used by memory routines.
*/
#define MEMORY_READ      (unsigned long) 0
#define MEMORY_WRITE     (unsigned long) 1
/*
** Following are used by non volatile memories.
*/
#define MEMORY_INIT      (unsigned long) 2
#define MEMORY_VALIDATE (unsigned long) 3
#define MEMORY_DIAG_INIT (unsigned long) 4
/*
** The Max. size of transfer
*/
#define MAX_RD_WR_BUFFER_SIZE 512
```

Copyright 1989 Logic Modeling Systems

| HEADER FILE | DATE 5/23/89 | PAGE # |
|---|---|---|
| include/lm_sfi.h | TIME 1:20:19 pm | 1/34 |

HEADER TEXT

```
/* SCCS_ID: lm_sfi.h rev 3.1, 4/24/89 at 07:33:47 */

/*              BEGIN_LM_DEFINITION                  */

        return codes for all SFI functions           */
#define LM_SUCCESS                      1
#define LM_WARNING                      0
#define LM_ERROR                        -1

#define LM_TRUE                         1
#define LM_FALSE                        0

/*      constants for lm_create_definition_s()       */
#define LM_END_OF_TEXT                  (long)0

/*      Bit 28 set, in C = 0x10000000                */
#define LM_INVALID_PIN_ID               (long)268435456

/*      constants for lm_release_*()                 */
#define LM_ALL_DEFINITIONS              (long)-2
#define LM_ALL_INSTANCES                (long)-3
#define LM_ALL_FAULTS                   (long)-4

/*      constants for lm_verify_simulator()          */
#define LM_FAULT_SIMULATOR              (long)16777216
#define LM_LOGIC_SIMULATOR              (long)16777217

/*      attributes for lm_set_logic_level_map()      */
#define LM_LOGIC_ZERO                   (long)2
#define LM_LOGIC_SOFT_ZERO              (long)3
#define LM_LOGIC_ONE                    (long)4
#define LM_LOGIC_SOFT_ONE               (long)5
#define LM_LOGIC_FLOAT                  (long)6
#define LM_LOGIC_UNKNOWN                (long)7

/*      constants for lm_set_pin_map()               */
#define LM_INPUT                        (long)9
#define LM_OUTPUT                       (long)10
#define LM_IO                           (long)11
#define LM_IO_AS_INPUT                  (long)12
#define LM_IO_AS_OUTPUT                 (long)13
#define LM_DONT_CARE                    (long)14


/*      constants for lm_pattern_history()           */
#define LM_KEEP_PATTERNS                (long)15
#define LM_DONT_KEEP_PATTERNS           (long)16

/*      constants for lm_inquire_modeler()           */
#define LM_TOTAL_MODELER_MEMORY         (long)18
#define LM_TOTAL_PATTERNS               (long)19
#define LM_AVAILABLE_MODELER_MEMORY     (long)20
#define LM_AVAILABLE_PATTERNS           (long)21
#define LM_NUMBER_OF_USERS              (long)22
#define LM_WHICH_USER_AM_I              (long)23
#define LM_NUMBER_OF_LANES              (long)24
#define LM_NUMBER_OF_SLOTS_PER_LANE     (long)25
#define LM_NUMBER_OF_PACS               (long)26
#define LM_NUMBER_OF_PAMS               (long)27
#define LM_NUMBER_OF_PELS               (long)28
#define LM_NUMBER_OF_DABS               (long)29
#define LM_NUMBER_OF_ACTIVE_INSTANCES   (long)30
#define LM_NUMBER_OF_ACTIVE_FAULTS      (long)31
#define LM_NUMBER_OF_PUBLIC_DEVICES     (long)32
#define LM_NUMBER_OF_PRIVATE_DEVICES    (long)33
#define LM_SOFTWARE_REVISION_NUMBER     (long)34

/*      constants for lm_inquire_user()              */
#define LM_NUMBER_OF_PATTERNS           (long)35
#define LM_SECONDS_SINCE_LAST_RESPONSE  (long)84

/*      constants for lm_inquire_lane()              */
#define LM_IS_LANE_USABLE               (long)36
#define LM_NUMBER_OF_POPULATED_PELS     (long)37


/*      constants for lm_inquire_pam()               */
#define LM_PAM_MEMORY_SIZE              (long)38


/*      constants for lm_inquire_pel()               */
#define LM_DOES_PEL_EXIST               (long)39
#define LM_IS_DAB_PRESENT               (long)40

/*      constants for lm_inquire_dab()               */
#define LM_DAB_TYPE                     (long)41
#define LM_DEVICE_STATUS                (long)42
#define LM_DAB_REVISION                 (long)43
#define LM_DAB_MANUFACTURER             (long)44
#define LM_DAB_MAKER                    (long)45
#define LM_DAB_MAKER_REVISION           (long)46
#define LM_DAB_INSERTIONS               (long)47
#define LM_PRIVATE                      (long)48
#define LM_PUBLIC                       (long)49

/*      constants for lm_inquire_instance()          */
#define LM_NUMBER_OF_FAULTS             (long)50
#define LM_ASSOCIATED_DEFINITION_ID     (long)51


/*      constants for lm_inquire_fault()             */
#define LM_ASSOCIATED_INSTANCE_ID       (long)52

/*      attributes for lm_get_message()              */
#define LM_NO_MORE_MESSAGES             (long)53

/*      entities for lm_timing_measurement()         */
#define LM_TIMING_ON                    (long)54
#define LM_TIMING_OFF                   (long)55
#define LM_NO_FILE                      (char *)NULL

/*      entities for lm_eval_control()               */
#define LM_NUMBER_OF_SAMPLES            (long)56
#define LM_NUMBER_OF_EVALUATIONS        (long)57
#define LM_EVERY_EVALUATION             (long)-1

/*      entities for lm_inquire_device_pins()        */
#define LM_POWER                        (long)58
#define LM_GROUND                       (long)59
#define LM_NO_CONNECT                   (long)60
```

Copyright 1989 Logic Modeling Systems

HEADER FILE include/lm_sfi.h

DATE 5/23/89 TIME 1:20:19 pm PAGE # 2/35

LINE # HEADER TEXT

```
#define LM_DATA_PIN                      (long)61
#define LM_EVAL_PIN                      (long)62
#define LM_STORE_PIN                     (long)63
#define LM_EDGE_RISE_PIN                 (long)64
#define LM_EDGE_FALL_PIN                 (long)65
#define LM_NO_MORE_PINS                  (char *)NULL

/*      additional entities for lm_inquire_modeler() */
#define LM_EPOCH_ADAPTER_INSERTIONS      (long)66
#define LM_EPOCH_LONGEST_SEQUENCE        (long)67
#define LM_EPOCH_PATTERNS_ADDED_HIGH     (long)68
#define LM_EPOCH_PATTERNS_ADDED_LOW      (long)69
#define LM_EPOCH_DEFINITIONS             (long)70
#define LM_EPOCH_INSTANCES               (long)71
#define LM_EPOCH_FAULTS                  (long)72

/*      entities for lm_get_pin_change()           */
#define LM_TABLE_DELAY                   (long)73
#define LM_MEASURED_DELAY                (long)74
#define LM_COMPOSITE_DELAY               (long)75
#define LM_UNSPECIFIED_DELAY             (long)76

/*      additional entities for lm_inquire_instance()*/
#define LM_PATTERN_FREQUENCY             (long)77

/*      entities for lm_set_simulation_tick()      */
#define LM_FEMTOSECONDS                  (long)78
#define LM_PICOSECONDS                   (long)79
#define LM_NANOSECONDS                   (long)80
#define LM_MICROSECONDS                  (long)81

/*      entities for lm_log_test_vector()          */
#define LM_LOGGING_ON                    (long)82
#define LM_LOGGING_OFF                   (long)83

/*      entities for lm_loop_patterns()            */
#define LM_LOOP_ON                       (long)85
#define LM_LOOP_OFF                      (long)86

/* Additional attribute to lm_inquire_modeler()    */
#define LM_PASSWORD_CHECK                (long)87

/*      entities for lm_password()                 */
#define LM_ASSIGN                        (long)88
#define LM_ENTER                         (long)89

/* Additional attribute to lm_inquire_user()       */
#define LM_NUMBER_OF_PATTERNS_ALLOCATED  (long)90

#define LM_GET_VERSION_STRING_ADDR       (long)91

/* Maximum legal attribute value for all lm calls  */
#define LM_MAXIMUM_ATTRIBUTE_VALUE       (long)92

/*              END_LM_DEFINITION                  */
```

Copyright 1989 Logic Modeling Systems

| HEADER FILE | DATE | 5/23/89 | PAGE # |
|---|---|---|---|
| include/lmsbsp.h | TIME | 1:20:19 pm | 1/36 |

HEADER TEXT

```
/* SCCS_ID: lmsbsp.h rev 3.1, 4/24/89 at 07:33:50      */

/*
** NOTE: this must match CPU_RAM IN cpu.h
*/
#define CPU_INIT_RAM  0x0000
/*
;----- HyperLink Workspace Address
#define          HL_CS_ADD          (CPU_INIT_RAM + 0x4000)
*/



/*
;------ Vrtx Configuration Defines
*/

#define          HR_MAX          0          /* Ready Systems highest comp. no. */
#define          USR_MAX         0          /* User highest comp. no.          */
#define          VRTX_WRK_SPACE  (CPU_INIT_RAM + 0x5000)  /* VRTX workspace address          */
#define          VRTX_WK_SIZE    0x28000 /* VRTX workspace size          */
#define          SYS_STK         0x2600   /* System stack size          */
#define          ISR_STK         0x2600   /* Interrupt stack size          */
#define          CB_COUNT        10        /* VRTX CB number WAS 4          */
#define          VC_DIS_LEVEL    7         /* Component disable level          */
#define          USR_STK         0x2600   /* User stack size          */
#define          TASK_COUNT      7        /* Number of VRTX tasks          */
#define          TRP_VRTX        0x0        /* VRTX Trap Number          */

/*
;------ Rtscope Configuration Defines
*/

#define          RTS_WRK_SPACE  (CPU_INIT_RAM + VRTX_WRK_SPACE + VRTX_WK_SIZE)  /* RTscope workspace address          */
#define          RTS_WK_SIZE    0x8000    /* RTscope workspace size          */
#define          RC_DIS_LEVEL   0         /* Component disable level          */
#define          RT_SCP_PRI     20        /* RTscope task priority level          */
#define          RT_SCP_TID     1         /* RTscope task ID number          */


/*
;------ Address of RAM location for System Configuration Tables
*/

#define          SYS_TBLES          (CPU_INIT_RAM + 0x1000)

/*
;------ Silicon Component Addresses and Defines
*/

#define          RTS_BASE          (CPU_INIT_RAM + RTS_WRK_SPACE + RTS_WK_SIZE)    /* RTscope physical address          */
#define          VRTX_BASE         (CPU_INIT_RAM + 0x02000)     /* VRTX physical address          */

#define          RTS_ENTRY         0x10          /* RTscope entry point (offset   */
                                                 /* from the physical address)   */



/*--------------------------------------------------------------------*/
/*------------------------- BSP Data Structures ----------------------*/
/*                                                                    */

/*----- Component Vector Table -----*/

typedef struct
{

    char          hr_max;
    char          usr_max;
    char          res1[ 6 ];
    char          res2[ 8 ];
    long          comp1_code;
    long          comp1_work;
    long          comp2_code;
    long          comp2_work;

} CVT_TBL;


/*----- RtScope Configuration Tables -----*/

typedef struct
{
        char     *db_abort;
        char     *db_eline;
        char     *db_backspc;
        char     *db_newline;
        char     *db_line_repr;
        char     *db_up_arrow;
        char     *db_dwn_arrow;
        char     *db_repeat;

} DB_SPCL;



typedef struct
{

        long     db_qid;
        long     db_qsize;
        short    db_inpt_ll;
        short    db_hstack;
        long     db_alias;
        long     db_sym_tab;
        short    db_num_chnl;
        char     db_toggle;
        char     db_xon;
        char     db_xoff;
        char     db_exit;
        long     db_txrdy;
        long     db_in_filter;
        long     db_out_filter;
        long     db_pgetc1;
        long     db_pputc1;
        long     db_pgetc2;
        long     db_pputc2;
        DB_SPCL  *db_spec_keys;

} RTIO_CNFTBL;

```

Copyright 1989
Logic Modeling Systems

HEADER FILE include/lmsbsp.h | DATE 5/23/89 | TIME 1:20:19 pm | PAGE # 2/37

HEADER TEXT

```
typedef struct
{
        long            db_vrtx_c;
        long            db_rt_v;
        long            db_wk_size;
        short           db_illegal;
        long            db_trap_t;
        short           db_comp_dis;
        short           db_priority;
        short           db_tid;
        long            db_utrap;
        RTIO_CNFTBL     *db_io_config;
        long            res1[ 4 ];
        long            db_vrtx_d;
        long            db_trp_vrtx;
        long            res2[ 3 ];


} RTCT_CNFTBL;

-
/*----- Vrtx Configuration Table -----*/

typedef struct
{

    long        v_wkspc;
    long        v_wk_size;
    short       sys_stk_size;
    short       isr_stk_size;
    short       cb_count;
    short       res1;
    long        res2;
    short       c_dis_lev;
    short       usr_stk_size;
    long        res3;
    short       usr_tsk_count;
    short       res4;
    long        tx_rdy;
    long        tcreate;
    long        tdelete;
    long        tswitch;
    CVT_TBL     *cvt_add;

} VRTX_CNFTBL;

/*----- System Configuration Tables -----*/

typedef struct
{

    VRTX_CNFTBL v_cnft;                       /* VRTX configuration table    */
    RTCT_CNFTBL r_cnft;                       /* RTscope configuration table */
    RTIO_CNFTBL rio_cnft;                     /* RTscope IO conf. table      */
    CVT_TBL     cvt;                          /* Component vectors table     */

} SYS_CONFIG;

/*
** we need a partition entry for eac partition we create
*/
struct malloc_partition_entry
{
        unsigned short part_id;
        unsigned long block_size;
};

/*
** ** ** ** ** ** ** NOTE ** ** ** ** ** **
**
** This MUST match the following is task.h
**        MAX_PARTITIONS
**
** ** ** ** ** ** ** NOTE ** ** ** ** ** **
*/
#define NO_OF_MALLOC_PARTITIONS 5
typedef struct
{
        unsigned short num_entries;
        struct malloc_partition_entry entries[ NO_OF_MALLOC_PARTITIONS ];

} malloc_table_type;

/*----- Define Pointer for Tables -----*/

SYS_CONFIG      *cftbls = (SYS_CONFIG *)SYS_TBLES;

/*                                                                    */
/*------------------------- End Data Structures -----------------------*/
/*--------------------------------------------------------------------*/
```

Copyright 1989 Logic Modeling Systems

HEADER FILE include/lmserver.h | DATE 5/23/89 | TIME 1:20:20 pm | PAGE # 1/38

HEADER TEXT

LINE #

```
/* SCCS_ID: lmserver.h rev 1.1, 4/24/89 at 07:33:53    */

extern char *lm_realloc();
extern char *lm_calloc();
extern char *lm_malloc();

#define  DREALLOC lm_realloc
#define  DFREE    lm_free
#define  DCALLOC lm_calloc
#define  DMALLOC lm_malloc

#define SOFTWARE_REVISION_NUMBER   0x01000000
#define LAST_COMPATIBLE_CNC_VERSION  0x01000000

#define MAX_STRING_LENGTH          256
#define MAXINT                     (((unsigned)~0) >> 1)
#define MAX_USER_COUNT             64
#define MAXMSG                     (16*1024)
#define MAXMSG_INCR                (2*1024)
#define MAX_FUNCTION               100
#define MAX_LANE_COUNT             4
#define MAX_SLOT_COUNT             8
#define MAX_PAM_COUNT              4
#define MAX_MAGIC_COUNT            5
#define TYPE_BIT_SHIFT             4
#define MAX_UNIT_COUNT             16
#define MAX_PIN_PER_UNIT           80
#define MAX_PIN_COUNT              (MAX_UNIT_COUNT * MAX_PIN_PER_UNIT)
#define MAX_BIT_PER_WORD           (sizeof(int)*8)
#define INST_TABLE_SIZE            16
#define INST_TABLE_INCR            16
#define DEF_TABLE_SIZE             8
#define DEF_TABLE_INCR             8

#define MAX_EVAL_CHANGES           320
#define EVAL_EVENT                   0
#define STORE_EVENT                  1

#define NO_TRANSITION                0
#define RISE_TRANSITION              1
#define FALL_TRANSITION              2

/* Possible values for pin values passed between host API and modeler */
#define LOGIC_0                  0x1
#define LOGIC_1                  0x2
#define LOGIC_Z0                 0x4
#define LOGIC_Z1                 0x8
#define LOGIC_U                  0x10
#define LOGIC_S0                 0x20
#define LOGIC_S1                 0x40

#define LOGIC_SX                 0x60
#define LOGIC_ZX                 0xc

#define LOGIC_MAX_STATE          LOGIC_S1

#define EDGE_RISE                STORE + 1
#define EDGE_FALL                STORE + 2

/* divide the pattern count by 32 for debugging purposes */
#ifndef DBASE
#define PAM128K_PTRN_COUNT              (128 * 1024)
#define PAM512K_PTRN_COUNT              (512 * 1024)
#define PAM2M_PTRN_COUNT                (2 * 1024 * 1024;
#else
#define PAM128K_PTRN_COUNT              (128 * 1024 / 32'
#define PAM512K_PTRN_COUNT              (512 * 1024 / 32)
#define PAM2M_PTRN_COUNT                (2 * 1024 * 1024 / 32)
#endif
#define PAM128K_FB_BLOCK_COUNT          2
#define PAM512K_FB_BLOCK_COUNT          4
#define PAM2M_FB_BLOCK_COUNT            8
#define MAX_PAM_CONFIG                  34
#define PAM128K_WEIGHT                  1
#define PAM512K_WEIGHT                  5
#define PAM2M_WEIGHT                    21

#define BLOCK_START_MASK                0xfffffc00
#define BLOCK_NUMBER_SHIFT              10
#define BLOCK_NUMBER_MASK               0x7fff
#define PTRN_ADDR_INC                   4
#define LINK_TABLE_ADDR_INC             4
#define MAX_LINK_TABLE_COUNT            32 * 1024
#define PTRN_PER_BLOCK                  256
#define BLOCK_ADDR_INC                  (PTRN_PER_BLOCK * PTRN_ADDR_INC)
#define BRANCH_LATENCY                  26
#define FB_LATENCY                      3
#define FREE_BLOCK_FLAG                 0x7fff
#define LAST_PATTERN_IN_BLOCK_MASK      0x3fc

#define FB_PTRN_COUNT                   512

/* The following number is determined empirically. */
#define MAX_DUMMY_COUNT_1_BIT_PER_PIN  28
#define MAX_DUMMY_COUNT_2_BIT_PER_PIN  44

#define    END_BLOCK_FLAG          0   /* flag in link table for last block
                                        * in the pattern sequence.
                                        */
#define SEQ_END_LATENCY            3

#define PEL_SEL_BIT_BUCKET         15

#define PEL_SEL_MASK               0xfffffff0
#define PEL_CTL_MASK               0xffffff8f
#define PEL_USER_MASK              0xffffff7f
#define PEL_STOP_MASK              0xfffffeff
#define PEL_BRANCH_MASK            0xfffff9ff

#define CTL_PTRN_MASK              0xffff0000

#define PEL_SEL_SHIFT              0
#define PEL_CTL_SHIFT              4
#define PEL_BRANCH_SHIFT           9

#define PEL_CTL_NOOP                    0
#define PEL_CTL_LOAD_SDEN_FORMAT        1
#define PEL_CTL_SELECT_PEL              2
#define PEL_CTL_LOAD_FMT                3
#define PEL_CTL_LOAD_DATA               4
```

Copyright 1989 Logic Modeling Systems

HEADER FILE include/lmserver.h | DATE 5/23/89 | TIME 1:20:20 pm | PAGE # 2/39

LINE # HEADER TEXT

```
#define PEL_CTL_LOAD_CONTROL          5
#define PEL_CTL_LOAD_ENDEN            6
#define PEL_CTL_LOAD_DATA_LAST_UNIT   7

/* PEL Control/Status register */
#define PEL_CS_IN_USE_LED_MASK              0xfffffffe
#define PEL_CS_RESET_MASK                   0xfffffffd
#define PEL_CS_PRIVATE_PUBLIC_MASK          0xfffffffb
#define PEL_CS_MAGIC_ERROR_ENABLE_MASK      0xfffffff7
#define PEL_CS_INITIALIZE_MASK              0xffffffef
#define PEL_CS_ACTIVE_MASK                  0xfffffdff
#define PEL_CS_PRESENT_MASK                 0xfffffbff
#define PEL_CS_ERROR_MASK                   0xfffff7ff
#define PEL_CS_PLAY_ERROR_MASK              0xffffefff
#define PEL_CS_MAGIC_ERROR_MASK             0xffffbfff

#define DUMMY_CTL_WORD(slotno)    ((PEL_CTL_SELECT_PEL << PEL_CTL_SHIFT) | \
                                   ((slotno) << PEL_SEL_SHIFT))

#define BRANCH_NEVER              0
#define BRANCH_ALWAYS             1
#define BRANCH_FALL               2
#define BRANCH_RISE               3

#define FEEDBACK_BLOCK      0
#define PATTERN_BLOCK       1

#define CERR_TMG_CAL                    0
#define CERR_NO_TMG                     1
#define CERR_NO_PMM_FOR_PAC             2
#define CERR_PMM_STRAPPED_WRONG         3
#define CERR_PMM_STACKED_WRONG          4
#define CERR_DUPLICATE_SEGMENT          5
#define CERR_MISSING_SEGMENT            6
#define CERR_NO_PEL_FOR_DAB             7
#define CERR_NO_PMM_FOR_DAB             8
#define CERR_ILLEGAL_DUPLICATE_DEVICE   9
#define CERR_DEVICE_TOO_LARGE          10
#define CERR_ILLEGAL_PEL_STACKING      11

/* state of save command.
 * Note modify field size of INSTANCE_INFO.restore_state if the last state
 * is greater than 15.
 */
#define SENT_RECV_NOTHING                   0
#define SENT_RECV_PTRN_LOADED               1
#define SENT_RECV_BNDNG_LOADED              2
#define SENT_RECV_LCYCNDS_LOADED            3
#define SENT_RECV_LCYCNDS_LOADED            4
#define SENT_RECV_LAST_CONSISTENT_SET       5
#define SENT_RECV_SIM_PIN_VALUE_DATA        6
#define SENT_RECV_SIM_PIN_VALUE_HIZ         7
#define SENT_RECV_SIM_PIN_VALUE_UNK         8
#define SENT_RECV_SIM_PIN_VALUE_SOFT        9
#define SENT_RECV_LAST_SAMPLE_VALUE_DATA   10
#define SENT_RECV_LAST_SAMPLE_VALUE_HIZ    11
#define SENT_RECV_LAST_SAMPLE_VALUE_UNK    12
#define SENT_RECV_LAST_SAMPLE_VALUE_SOFT   13
#define SENT_RECV_PATTERN                  14

#define TMG_LOCK_TIMEOUT                   5
/* ???? */
#define PTRN_PLAY_TIMEOUT                  1000  /* ms */
#define PTRN_COUNT_FUDGE_FACTOR            125000

#define MAX_SAMPLE_RAMP_RANGE              250
#define RESOLUTION_05_NS                   0
#define RESOLUTION_10_NS                   1
#define RESOLUTION_20_NS                   2
#define RESOLUTION_40_NS                   3
#define RESOLUTION_INVALID                 4

#define MAX_SHORT_WORD_COUNT               5
#define MAX_LONG_WORD_COUNT                3

/* This is the period threshold which determines what should be written to the
 * CLOCK SPEED register on the PAC.
 */
#define PAC_FREQUENCY_THRESHOLD            1000000  /* ps */

/* This is the period at which we going to play private devices. */
#define PRIVATE_PATTERN_PERIOD             5000000  /* ps == 200 KHz*/

#define MAX_PERCENT_TOLERANCE              5
#define MAX_DUTVCC                         5250     /* mV */
#define MIN_DUTVCC                         3000     /* mV */

#define DEFAULT_SAMPLE_COUNT                 5
#define DEFAULT_EVALUATION_COUNT           100
#define MAX_CHECK_INPUT_Z_COUNT            100

#define CRYPTED_PASSWORD_LENGTH             16

#define NO_PULLUP_OR_PULLDOWN                0
#define PULLUP                               1
#define PULLDOWN                             2

typedef struct {
    u_long mem_size;     /* in pattern unit */
    u_long board_id;
} PAM_INFO;

typedef struct {
    char        revision[REV_LENGTH + 1];
    char        dab_type[TYPE_LENGTH + 1];
    char        man_id[MAN_LENGTH + 1];
    char        model_maker[MAKER_LENGTH + 1];
    char        model_revision[REV_LENGTH + 1];
    u_short     insertion_count;
    unsigned              : 9;
    unsigned    lane_no   : 3;
    unsigned    slot_no   : 4;
    u_long      shape_bit_map;    /* the DAB shape map as stored in EEPROM */
} SEGMENT_EL;

typedef struct {
    unsigned  last_in_lane : 1;
    unsigned  lane_no      : 3;
    unsigned  slot_no      : 4;
} UNIT_LOCATION_EL;
```

Copyright 1989 Logic Modeling Systems®

HEADER FILE include/lmserver.h

DATE 5/23/89 TIME 1:20:20 pm PAGE # 3/40

HEADER TEXT

```
/*
 * word[0]  -->   pat<79..64>
 * word[1]  -->   pat<63..48>
 * word[2]  -->   pat<47..32>
 * word[3]  -->   pat<31..16>
 * word[4]  -->   pat<15..0>
 */
typedef struct {
   u_short word[MAX_SHORT_WORD_COUNT];
   u_short ctl;
} PTRN_BITS;

typedef struct {
   u_long word[MAX_LANE_WORD_COUNT];
} PTRN_BITS_LONGWORD;

typedef struct dab_info {
   SEGMENT_EL           *segment[MAX_SEGMENT_PER_DEVICE + 1];
   PTRN_BITS_LONGWORD   dummy_ptrs[MAX_LANE_COUNT];
   u_short              act_inst_count;
   u_short              act_var_count;
   char                 part_name[NAME_LENGTH + 1];
   u_char               used_as_private;
   u_char               segment_count;
   u_char               unit_count_per_lane;
   u_char               lane_count;   /* num of lanes occupied by this dab   */
   u_char               unit_count;
   u_char               lane_used[MAX_LANE_COUNT];
   u_char               ident_lane;   /* to select lane in pattern play */
   u_short              dut_vcc_measured;    /* mV */
   u_char               val_programmed; /* VSL currently programmed on DAB */
   u_char               vsh_programmed; /* VSH currently programmed on DAB */
   u_char               vhth_programmed;
   u_char               vlth_programmed;
   u_char               vil_programmed;
   u_char               vih_programmed;
   UNIT_LOCATION_EL     unit_location[MAX_UNIT_COUNT];
} DAB_INFO;

typedef struct {
   u_long board_id;
} PEL_INFO;

typedef struct {
   PTRN_BITS *data;
   PTRN_BITS *hiz;
   PTRN_BITS *unknown;
   PTRN_BITS *soft;
} FULL_VALUE;

/* Edge assignments:
 *   EDGE#     USED AS
 *   ------    -------
 *     0       HDOFF edge
 *     1       falling edge of Rl (edge_rise pin)
 *     2       data edge
 *     1       store edge
 *     4       rising edge of Rx (edge_fall pin)
 *     5       alternate HDOFF edge
 *     6       sample edge threshold we want to program at this evaluation
 *     7       sample edge threshold for store event
 *     8       sample edge threshold for eval event
 */
typedef struct {
   PTRN_BITS_LONGWORD   *ident_inputs;
   PTRN_BITS_LONGWORD   *ident_outputs;
   PTRN_BITS_LONGWORD   *ident_ios;
   PTRN_BITS_LONGWORD   *ident_Rl;
   PTRN_BITS_LONGWORD   *ident_Rx;
   PTRN_BITS_LONGWORD   *ident_store;
   u_long                logical_clock_period;
   u_long                actual_phy_clock_period;
   u_long                sample_edge_time1;
   u_long                sample_edge_time2;
   u_long                data_edge_time;
   u_long                hdoff_edge_time;
   u_long                hdoff_edge_time2;
   u_long                store_edge_time;
   u_long                non_significant_store_edge_time;
   u_long                edge_setting[MAX_EDGE_COUNT + 2];
   u_long                falling_sample_reg;
   u_char                lane_used;
   u_char                dab_ok;
   u_char                has_io_store;
   u_char                n_reg;
   u_char                k_reg;
   u_char                source_reg;
   u_char                val_dac_value;
   u_char                vsh_dac_value;
   u_char                vlth_dac_value;
   u_char                vhth_dac_value;
   u_char                vil_dac_value;
   u_char                vih_dac_value;
   u_char                private_val_dac_value;
   u_char                private_vsh_dac_value;
   u_char                eval_event_mode;
   u_char                store_event_mode;
   u_char                rl_or_rx_min_threshold; /* For early sample only */
} EXTRA_DEVICE_SPEC;

typedef struct {
   u_long  max_addr;        /* max addr of current block. 1 ptrs past the
                               block */
   u_long  prev_max_addr;   /* max addr of previous block              */
   u_long  last_unit_addr;  /* ptrs addr of the last unit in the lane  */
   u_long  new_block_addr;  /* addr of the new block just allocated    */
} LANE_ADDR_INFO;

typedef struct {
   long        min_delay;    /* M/T/M delays */
   long        typ_delay;
   long        max_delay;
   u_char      old_raw;
   u_char      old_filtered;
   u_char      new_raw;
   u_char      new_filtered;
   u_long      sim_time;
   short       next_input_pin_index;
   short       next_output_pin_index;
```

Copyright 1989 Logic Modeling Systems

HEADER FILE include/lmserver.h

DATE 5/23/89 TIME 1:20:20 pm PAGE # 4/41

LINE # HEADER TEXT

```
    unsigned     :8;
    unsigned     direction: 3;          /* copied from PIN_SPEC                */
    unsigned     has_resistor: 2;       /* copied from PIN_SPEC                */
    unsigned     uninitialized_pin: 1;  /* TRUE iff simulator hasn't set value */
    unsigned     output_pin_is_linked: 1;
    unsigned     input_pin_is_linked: 1;
    unsigned     event_pin_number: 8;
    unsigned     delay_type: 8; /* DELAY_TABLE_COMPOSITE --> min/typ/max valid */
                                /* DELAY_TABLE           --> min         valid */
                                /* MEASURED              --> min/max     valid */
} PIN_INFO;

typedef struct {
    short   next_pin_index;
    short   next_pin_to_be_measured;
    u_long  min_delay;
    u_long  max_delay;
    u_char  expected_value;
    u_char  min_threshold;
    u_char  max_threshold;
    u_char  delay_found;
    u_short event_pin_number;
    u_short delay_value_is_set;  /* only 1 bit is needed for this field */
} TM_PIN_INFO;

typedef struct {
    DEVICE_SPEC *definition;                      /* definition for this instance */
    PIN_INFO    *pin_info_table;                  /* cur pin info for this inst   */
    char        *device_info_string;              /* phys name (for instance only)*/
    u_long pattern_count;                         /* total # of lane-ptrns        */
    u_long static_pattern_count;                  /* # of lane ptrns for static   */
                                                  /* patterns                     */
    u_long common_pattern_count;                  /* total # of lane ptrns at the */
                                                  /* time the fault is created    */
    u_char fb_block_size[MAX_LANE_COUNT];         /* fb block count for each lane */
    u_long fb_block_addr[MAX_LANE_COUNT];         /* fb block addr for each lane  */
    u_long unit_addr[2][MAX_UNIT_COUNT];          /* last and next to last        */
                                                  /* ptrn addr for each unit      */
    u_long first_user_ptrn_unit_addr[MAX_UNIT_COUNT];
                                                  /* for inst/fault this is the   */
                                                  /* first ptrns to be saved      */
    LANE_ADDR_INFO lane_addr[MAX_LANE_COUNT];     /* last block information       */
    u_long seq_start_addr[MAX_LANE_COUNT];        /* seq start addr for each lane */
    u_long lcychdb_addr[MAX_UNIT_COUNT];          /* addr of LCYCHDB preamble     */
    u_long lcycmdb_addr[MAX_UNIT_COUNT];          /* addr of LCYCMDB preamble     */
    u_long var_seq_addr[MAX_LANE_COUNT];          /* addr of real variant seq     */
    u_long last_common_block_addr[MAX_LANE_COUNT]; /* last common block addr      */
                                                  /* between instance and variant */
    PTRN_BITS *ptrn_loaded;                       /* last pattern loaded/played   */
    PTRN_BITS *hmdemb_loaded;                     /* last HMDEMB loaded/played    */
    PTRN_BITS *lcychdb_loaded;                    /* last LCYCHDB loaded/played   */
    PTRN_BITS *lcycmdb_loaded;                    /* last LCYCMDB loaded/played   */
    PTRN_BITS *last_consistent_set;               /* obvious                      */
    FULL_VALUE sim_pin_value;                     /* cur logic values from sim    */
    FULL_VALUE last_sample_value;                 /* logic values sampled last    */
    u_short     fault_count;                      /* how many faults this inst has*/
    short       first_data_pin_index;
    short       first_eval_pin_index;
    short       first_store_pin_index;
    char        sample_count;                     /* sample dev this # of times   */
    u_long      evaluation_count;                 /* don't do mult sample if == 0 */
    char        check_input_z_count;              /* down counter to check IN == Z*/
    unsigned : 8;                                 /* struct allignment padding    */
    unsigned had_shorted_pin: 1;                  /* this instance was shorted    */
    unsigned fatal_error: 1;                      /* fatal error on this instance */
    unsigned first_eval: 1;                       /* first time device is eval'ed */
    unsigned purge_ptrn_on_next_eval: 1;          /* for PRIVATE device           */
    unsigned has_history: 1;                      /* for PRIVATE device           */
    unsigned failed_to_alloc_ptrn: 1;             /* TRUE --> this inst is dead   */
    unsigned use_2_bit_per_pin: 1;                /* to handle IO clock transition*/
    unsigned enable_timing_meas: 1;               /* 1 --> TMeas is enabled       */
    unsigned cur_unit_addr_index: 1;              /* index to unit_addr[] for     */
                                                  /* current pattern              */
    unsigned disjoint_flag: 1;                    /* 1 --> inst/var ptrn is disjnt */
    unsigned is_fault: 1;                         /* 1 --> this is a fault        */
    unsigned last_common_block_is_feedback: 1;/* 1 --> LCBlock is feedback blk */
    unsigned restore_state: 4;                    /* tells what has been restored */
    unsigned dab_info_index: 8;                   /* index to dab info table      */
} INSTANCE_INFO;

typedef struct {
    long fd;
    char           hostname[MAX_STRING_LENGTH];
    char           username[MAX_STRING_LENGTH];
    INSTANCE_INFO **free_inst_id, /* inst id that can be allocated          */
    INSTANCE_INFO **instance;     /* instance table address                 */
    DEVICE_SPEC   **definition,   /* list of all def's for this user        */
    DEVICE_SPEC   **free_def_id,  /* def id that can be allocated           */
    u_long last_unit_sent_addr[MAX_UNIT_COUNT]; /* address of last pattern  */
                                                /* sent in save command.    */
    u_long pattern_to_send_count; /* number of user patterns to send in save */
    u_long time_scale;
    u_long half_time_scale;
    long     save_buffer_offset;
    char     *save_buffer;
    u_short def_table_size;          /* current size of definitio  ble      */
    u_short inst_table_size;         /* current size of instance table      */
    u_short longword_pad;
    u_char active;                   /* says if this user is active         */
    u_char save_state;               /* state of the save command           */
                                     /* tells us what pattern has been sent last */
    u_char is_fault_simulator;
    u_char divide_delay;             /* TRUE  --> divide delay by time scale */
                                     /* FALSE --> multiply delay             */
    u_char good_password;            /* TRUE  --> password was entered correctly */
} USER_INFO;

/* This table map the pin id to the bit location of the pin in the pattern.  */
typedef struct {
    u_char unitno;
    u_char wordno;
    u_char bitno;
} UWB_OFFSET;

extern UWB_OFFSET  pn_to_short_offset[];

extern char *calloc();

extern USER_INFO *user_info_array[MAX_USER_COUNT];
```

Copyright 1989
Logic Modeling Systems

| HEADER FILE | DATE 5/23/89 | PAGE # |
|---|---|---|
| include/lmserver.h | TIME 1:20:20 pm | 5/42 |

LINE # HEADER TEXT

```
extern void (*function_array[MAX_FUNCTION])();

extern u_char    fatal_hardware_error_encountered;
extern u_char    fatal_configuration_error_encountered;
[illegible]  u_char    non_fatal_configuration_error_encountered;

extern long      time_reboot_was_issued;
extern long      reboot_delay_time;
extern u_char    rebooting;
extern u_char    rebutdown;
extern u_char    reboot_flag;

typedef struct {
    u_long     pac_present;
    PAM_INFO *pam[MAX_PAM_COUNT];
    PEL_INFO *pel[MAX_SLOT_COUNT];
} LANE_INFO;

/* Each lane has (MAX_PAM_COUNT) PAM_FB_BLOCK_COUNT structures. */
typedef struct {
    u_long PAM_max_addr[MAX_PAM_COUNT];          /* 1 ptrn past the last ptrn. */
                                                 /* byte address.              */
    u_long feedback_block_count[MAX_PAM_COUNT];
} PAM_FB_BLOCK_COUNT;

PAM_FB_BLOCK_COUNT fb_block_count_array[MAX_LANE_COUNT];

typedef struct {
    u_long tot_system_mem;
    u_long cpu_board_id;
    u_long clob_board_id;
    LANE_INFO *lane[MAX_LANE_COUNT];
    u_char slot_count;          /* number of slots on 1 lane */
    u_char phy_lane_count;      /* total physical lane in the system */
} SYSTEM_INFO;

typedef struct {
    PTRN_BITS *select_pel;
    PTRN_BITS *format0;
    PTRN_BITS *format1;
    PTRN_BITS *toggle;
    PTRN_BITS *adlen0b;
    PTRN_BITS *adlen1b;
    PTRN_BITS *adlen2b;
    PTRN_BITS *adlen1b;
    PTRN_BITS *adhen0;
    PTRN_BITS *adhen1;
    PTRN_BITS *adhen2;
    PTRN_BITS *adhen1;
    PTRN_BITS *load_aden;  /* used to load the ADEN/FORMAT registers */
    PTRN_BITS *ctl_out;
    PTRN_BITS *reset0;
    PTRN_BITS *reset1;
    PTRN_BITS *set0;
    PTRN_BITS *set1;
    PTRN_BITS *doff;
    PTRN_BITS *hddisb;
    PTRN_BITS *lcycmdb;
    PTRN_BITS *lcychdb;
    PTRN_BITS *seqmdb;
    PTRN_BITS *seqhdb;
    PTRN_BITS *dummy_hmdenb, /* needed to initialize HDOE/MDOE */
    PTRN_BITS *dummy_data;   /* needed to initialize HDOE/MDOE */
    PTRN_BITS *hmdenb;
    PTRN_BITS *dummy_data2,  /* needed because MC will not turn on properly */
                             /* during the first real pattern               */
} PREAMBLE;

typedef struct {
    PTRN_BITS *word[sizeof(PREAMBLE) / sizeof (PTRN_BITS *)];
} PREAMBLE_WORD;

typedef struct {
    u_char pam_config_num;
    u_char pam_weighted_num;
} PAM_CONFIG_EL;

extern PAM_CONFIG_EL pam_config_table[];
extern SYSTEM_INFO *system_config;
extern DAB_INFO     *dab_list[];

extern u_long   bitno_to_mask[];

extern PTRN_BITS *gbl_dummy_ptrn;

extern FULL_VALUE              gbl_new_sample_value;
extern FULL_VALUE              gbl_steady_state_result;
extern FULL_VALUE              gbl_temp_steady_state_result;
extern PTRN_BITS_LONGWORD      gbl_ident_inconsistent_pins[];
extern PTRN_BITS_LONGWORD      gbl_ident_change[];
extern TM_PIN_INFO             gbl_tm_pin_info_table[];

extern u_long free_block_list[];

extern u_char bit_to_logic_table[];

extern u_short    gbl_eval_pin_number[MAX_EVAL_CHANGES],
extern u_char     gbl_eval_pin_value[MAX_EVAL_CHANGES];
extern u_long     gbl_eval_min_delay[MAX_EVAL_CHANGES];
extern u_long     gbl_eval_max_delay[MAX_EVAL_CHANGES];

/* Lane number to lane address */
#define lane_offset(laneno)  (LANE_0_START_ADDR + (laneno) * LANE_ADDR_INC)

/* Pattern address (in segment A) to link table address */
#define ptol(addr)    (((addr) & LANE_ADDR_MASK) + LANE_LINK_TABLE_OFFSET +\
                       (((addr) & ~LANE_ADDR_MASK) >> (BLOCK_NUMBER_SHIFT - 2)))

/* Pattern address to block number */
#define ptob(addr)    (((u_long)(addr) >> BLOCK_NUMBER_SHIFT) & BLOCK_NUMBER_MASK)

/* Block number to link table address */
#define btol(laneno, block_number)  (lane_offset((laneno)) + \
                                     LANE_LINK_TABLE_OFFSET + \
                                     ((block_number) << BLOCK_NUMBER_SHIFT))

/* Block number to first pattern address in the block */
#define btop(laneno, block_number) (lane_offset((laneno)) + \
                                    ((block_number) << BLOCK_NUMBER_SHIFT))

```

Copyright 1989 Logic Modeling Systems

HEADER FILE include/lmserver.h

DATE 5/23/89 TIME 1:20:20 pm PAGE # 6/43

HEADER TEXT

```
#define even(x)      (! ((x) & 1))


/* The following is used if wordno and bitno are SHORT offset, i.e. if
 * using PTRN_BITS.
 */
#define CALC_PIN_NUMBER_SHORT(unitno, wordno, bitno)  (unitno * 80 + \
                                                       (79 - 16 * wordno) + \
                                                       (bitno - 15))

/* The following is used if wordno and bitno are LONG offset, i.e. if
 * using PTRN_BITS_LONGWORD.
 */
#define CALC_PIN_NUMBER_LONG(unitno, wordno, bitno)  (unitno * 80 + \
                                                      (79 - 32 * wordno) + \
                                                      (bitno - 31))

#define io_pin_transition(old_value, new_value, uninitialized_pin) \
   ((new_value & (LOGIC_0 | LOGIC_S0)) && (old_value & LOGIC_Z1) ?  \
      FALL_TRANSITION : \
     (new_value & (LOGIC_1 | LOGIC_S1)) && (old_value & LOGIC_Z0) ? \
      RISE_TRANSITION : \
    ((uninitialized_pin == FALSE) ? NO_TRANSITION : \
     ((new_value & (LOGIC_0 | LOGIC_S0)) ? FALL_TRANSITION : \
      ((new_value & (LOGIC_1 | LOGIC_S1)) ? RISE_TRANSITION : NO_TRANSITION))))

#define input_pin_transition(old_value, new_value, uninitialized_pin) \
  ((new_value & (LOGIC_0 | LOGIC_S0)) && \
                         (old_value & (LOGIC_1 | LOGIC_S1 | LOGIC_Z1)) ?\

     FALL_TRANSITION : \
    (new_value & (LOGIC_1 | LOGIC_S1)) && \
                         (old_value & (LOGIC_0 | LOGIC_S0 | LOGIC_Z0)) ?\

     RISE_TRANSITION : \
   ((uninitialized_pin == FALSE) ? NO_TRANSITION : \
    ((new_value & (LOGIC_0 | LOGIC_S0)) ? FALL_TRANSITION : \
     ((new_value & (LOGIC_1 | LOGIC_S1)) ? RISE_TRANSITION : NO_TRANSITION))))


typedef struct {
   u_char   steady_state_full_value;
   u_char   two_state_value;
   u_char   resolution;
   u_char   expected_time;
   u_char   set_by_user;
} TM_RESULT;

extern TM_RESULT  tm_result_array[];
extern u_char        is_measure_delay;

#define BOGUS_DEFINITION(user, def_ptr) \
  (((def_ptr) == NULL) || \
   (((u_long)(def_ptr) >= (u_long)&(user)->definition[0]) && \
    ((u_long)(def_ptr) < (u_long)&(user)->definition[(user)->def_table_size])))

/* inst_ptr is either
 *    1. NULL
 *    2. It points to somewhere in the table --> signify free instance.
 */
#define BOGUS_INSTANCE(user, inst_ptr) \
  (((inst_ptr) == NULL) || \
   (((u_long)(inst_ptr) >= (u_long)&(user)->instance[0]) && \
    ((u_long)(inst_ptr) < (u_long)&(user)->instance[(user)->inst_table_size])))


#define PTRN_COUNT_ON_BLOCK(ptrn_addr) \
        (((ptrn_addr) - ((ptrn_addr) & BLOCK_START_MASK)) / PTRN_ADDR_INC + 1)


extern u_char    read_loc_char();
extern u_short   read_loc_short();
extern u_long    read_loc_long();
extern void      write_loc_long();

#define REG_VALUE(low_limit, high_limit, value)\
      (((value) - (low_limit)) * 256 / ((high_limit) - (low_limit)))

#define fix_pel_sel(ptrn, unitno, dab_ptr)                                  \
        set_pel_sel(&((PTRN_BITS *)(ptrn))->ctl,                            \
                    (dab_ptr)->unit_location[(unitno)].slot_no);

#define fix_pel_br(ptrn)                                                    \
        set_pel_br(&((PTRN_BITS *)(ptrn))->ctl, BRANCH_NEVER);

#define fix_pel_ctl(ptrn, unitno, dab_ptr)                                  \
   {  u_short pel_ctl;                                                      \
      pel_ctl = (((PTRN_BITS *)(ptrn))->ctl & PEL_CTL_MASK) >> PEL_CTL_SHIFT; \
      if ((pel_ctl == PEL_CTL_LOAD_DATA) ||                                 \
          (pel_ctl == PEL_CTL_LOAD_DATA_LAST_UNIT)) {                       \
         if ((dab_ptr)->unit_location[(unitno)].last_in_lane)              \
            set_pel_ctl(&((PTRN_BITS *)(ptrn))->ctl,                        \
                        PEL_CTL_LOAD_DATA_LAST_UNIT);                       \
         else                                                               \
            set_pel_ctl(&((PTRN_BITS *)(ptrn))->ctl,                        \
                        PEL_CTL_LOAD_DATA);                                 \
      }                                                                     \
   }

#define fix_pel_ctl_word(ptrn, unitno, dab_ptr)                             \
        fix_pel_sel((ptrn), (unitno), (dab_ptr))                            \
        fix_pel_br((ptrn))                                                  \
        fix_pel_ctl((ptrn), (unitno), (dab_ptr))

#define ADJUST_DELAY(val, time_scale, half_time_scale, divide_delay)        \
        ((val) = ((divide_delay) == FALSE ? (val) * (time_scale) :          \
        ((val) + (half_time_scale)) / (time_scale)))

#define UNADJUST_DELAY(val, time_scale, half_time_scale, divide_delay)      \
        ((val) = (val) == 0 ? 0 : ((divide_delay) == FALSE ?                \
         (val) / (time_scale) :                                             \
        ((val) * (time_scale) - (half_time_scale))))

extern u_char lm_printit;

#ifdef DEBUG
#define DPRINTF(x) if (lm_printit == TRUE) (void)printf x
#else
#define DPRINTF(x) /* do nothing */
#endif

#define MAP_IN_LOGIC_VALUE(pin_number, has_resistor, value)                 \
```

Copyright 1989 Logic Modeling Systems

HEADER FILE include/lmserver.h DATE 5/23/89 TIME 1:20:20 pm PAGE # 7/44

HEADER TEXT

```
    if ((has_resistor) != NO_PULLUP_OR_PULLDOWN) {                          \
        if ((value) & (LOGIC_Z0 | LOGIC_Z1)) {                              \
            if ((has_resistor) == PULLUP) {                                 \
                DPRINTF(("I conv Z->S1 for PN: %d\n", (pin_number)));      \
                (value) = LOGIC_S1;                                         \
            }                                                               \
            else {                                                          \
                DPRINTF(("I conv Z->S0 for PN: %d\n", (pin_number)));      \
                (value) = LOGIC_S0;                                         \
            }                                                               \
        }                                                                   \
    }

#define MAP_OUT_LOGIC_VALUE(pin_number, has_resistor, direction, value)     \
  if ((has_resistor) != NO_PULLUP_OR_PULLDOWN) {                            \
      if (((value) & (LOGIC_Z0 | LOGIC_Z1)) && (has_resistor == PULLUP)) {  \
          DPRINTF(("O conv Z0/1->S1 for PN: %d\n", (pin_number)));         \
          (value) = LOGIC_S1;                                               \
      }                                                                     \
      else if (((value) & (LOGIC_Z0 | LOGIC_Z1)) &&                         \
                  (has_resistor == PULLDOWN)) {                             \
          DPRINTF(("O conv Z0/1->S0 for PN: %d\n", (pin_number)));         \
          (value) = LOGIC_S0;                                               \
      }                                                                     \
  }
```

Copyright 1989 Logic Modeling Systems

| HEADER FILE | DATE | 5/23/89 | PAGE # |
|---|---|---|---|
| include/lnetwork.h | TIME | 1:20:21 pm | 1/45 |

LINE # HEADER TEXT

```
/* SCCS_ID: lnetwork.h rev 3.2, 4/24/89 at 07:33:57 */

#define RETSUCCESS          -1
#define RETERROR            -2
#define RETACCEPT           -3

/* We want to limit the total size of the network buffer to 1000 bytes during
 * save and restore. The number of bytes to store pattern is 1000 minus the
 * storage required for the header (see save_ptrn_ans).
 */
#define SAVE_REST_PTRN_BUFFER_LIMIT (1000 - 5 * sizeof(long))

#define lm_put_int(val)  (LM_CHK_PUT_LONG(lm_global_comm_ptr, (val)))

#define lm_put_short(val) (LM_CHK_PUT_SHORT(lm_global_comm_ptr, (val)))

#define lm_put_char(c)    (LM_CHK_PUT_CHAR(lm_global_comm_ptr, (c)))

#define lm_get_int()     (LM_CHK_GET_LONG(lm_global_comm_ptr))

#define lm_get_short()    (LM_CHK_GET_SHORT(lm_global_comm_ptr))

#define lm_get_char()     (LM_CHK_GET_CHAR(lm_global_comm_ptr))

/*
#define lm_put_int(val) \
        (printf("Putl %08x <-- %08x\n", \
                lm_global_comm_ptr->outgoing_buffer_pointer, (val)); \
         LM_CHK_PUT_LONG(lm_global_comm_ptr, (val)))

#define lm_put_short(val) \
        (printf("Puts %08x <-- %04x\n", \
                lm_global_comm_ptr->outgoing_buffer_pointer, (val)); \
         LM_CHK_PUT_SHORT(lm_global_comm_ptr, (val)))

#define lm_put_char(c) \
        (printf("Putc %08x <-- %c\n", \
                lm_global_comm_ptr->outgoing_buffer_pointer, (c)); \
         LM_CHK_PUT_CHAR(lm_global_comm_ptr, (c)))


#define lm_get_int() \
        (printf("Getl %08x --> %08x\n", \
                lm_global_comm_ptr->incoming_buffer_pointer, \
                *((long *)(lm_global_comm_ptr->incoming_buffer_pointer))); \
         LM_CHK_GET_LONG(lm_global_comm_ptr))


#define lm_get_short() \
        (printf("Gets %08x --> %04x \n", \
                lm_global_comm_ptr->incoming_buffer_pointer, \
                *((short *)(lm_global_comm_ptr->incoming_buffer_pointer))); \
         LM_CHK_GET_SHORT(lm_global_comm_ptr))


#define lm_get_char() \
        (printf("Getc %08x --> %c\n", \
                lm_global_comm_ptr->incoming_buffer_pointer, \
                *lm_global_comm_ptr->incoming_buffer_pointer); \
         LM_CHK_GET_CHAR(lm_global_comm_ptr))

*/



#define lm_get_our_obuf_addr()  (LM_GET_ADDR(lm_global_comm_ptr))

#ifdef DEBUG
#define end_put(skt)        {if (lm_printit == TRUE) printf("end_put, user: %d\n", lm_global_comm_ptr->fd); lm_send_reply(lm_global_comm_ptr
);}
#else
#define end_put(skt)   lm_send_reply(lm_global_comm_ptr)
#endif

#define reset_obuf()
```

Copyright 1989 Logic Modeling Systems

| HEADER FILE | DATE | PAGE # |
|---|---|---|
| include/lsfi.h | 5/23/89 | 1/46 |
| | TIME 1:20:21 pm | |

LINE # HEADER TEXT

```
/* SCCS_ID: lsfi.h rev 1.1, 4/24/89 at 07:34:01 */

#ifdef DEBUG
#define  DREALLOC lm_realloc
#define  DFREE    lm_free
#define  DCALLOC lm_calloc
#define  DMALLOC lm_malloc
#else
#define  DREALLOC realloc
#define  DFREE    free
#define  DCALLOC  calloc
#define  DMALLOC  malloc
#endif

#define LAST_COMPATIBLE_SFI_VERSION    0x01000000
#define MAX_USER_COUNT                 32

#define MAX_PART_NAME_CHAR             20

#define MAX_RETURN_STRING_LEN          256
#define MAX_MODELER_NAME_CHAR          256

#define MAX_DEBUG                      30
#define MAXINT                         (((unsigned)~0) >> 1)
#define HOSTFILENAME                   "modelers.lis"
#define INVALID_KEY                    LM_INPUT+7
#define MAX_PIN_TYPE                   7

#define MAX_LANE_COUNT                 4
#define MAX_PAN_COUNT                  4
#define MAX_SLOT_COUNT                 8
#define MAX_PIN_COUNT                  (MAX_LANE_COUNT * MAX_SLOT_COUNT * 80)
#define TYPE_BIT_SHIFT                 4
#define MAX_PIN_NAME_LENGTH            100
#define INVALID_PIN_NUMBER             0xffff

#define DAB_STAT_PUBLIC                0
#define DAB_STAT_PRIVATE               1

#define MAX_PIN_ID                     0x0fffffff
#define PIN_TYPE_BIT_OFFSET            29

#define MAX_LOGIC_STATE                (LM_LOGIC_UNKNOWN - LM_LOGIC_ZERO + 2)
#define MAX_OUTPUT_LOGIC_SIZE          128

#define GET_PIN_VALUE_1                0
#define GET_PIN_VALUE_2                1

#define SAVE_SET_VERSION_ID            4
#define FILE_INTEGRITY_MARK            0xfabcae07

#define MAX_STRING_LENGTH              256
#define MAX_SYSTEM_TABLE_SIZE          128
#define MAX_NAME_LENGTH                32

#define PTRN_COUNT_FUDGE_FACTOR        512

#define NON_SPECIFIED_DELAY_VALUE      1     /* tick */

/* pin type used in DAB_PID */
#define NONE                           0
#define IN                             1
#define OUT                            2
#define IO                             3
#define POWER                          4
#define GROUND                         5
#define NC                             6

/* pin class used in DAB_PID */
#define DATA                           0
#define EVAL                           1
#define STORE                          2
#define EDGE_RISE                      3
#define EDGE_FALL                      4

/* Possible values for pin values passed between host SFI and modeler */
#define LOGIC_0                        0x1
#define LOGIC_1                        0x2
#define LOGIC_Z0                       0x4
#define LOGIC_Z1                       0x8
#define LOGIC_U                        0x10
#define LOGIC_S0                       0x20
#define LOGIC_S1                       0x40

#define LOGIC_SX                       0x60
#define LOGIC_ZX                       0xc

#define LOGIC_MAX_STATE                LOGIC_S1

#define MAX_LOOP_NETWORK_TIMEOUT       600

#define MAX_USER_PID_HASH_TABLE_SIZE  337  /* 19 */
#define MAX_UNSPECED_DELAY_TABLE_SIZE 256


#define NOT_OPENED                     0
#define UNAVAIL                        1
#define [illegible]                    2
#define USED_FOR_RD_WR                 3

/* Constants used for test vector generation */
#define NO_CHG                         0
#define DATA_CHG                       1
#define EVAL_OR_STORE_CHG              2
#define STIMULUS_VECTOR                0
#define RESULT_VECTOR                  1

typedef struct {
    char      *name;
    short      fd;          /* -1 if this host is not available          */
    u_short    state;       /* NOT_OPENED, UNAVAIL, USED, USED_FOR_RD_WR */
} SYSTEM_INFO;

typedef struct {
    char  *name;               /* name of the pin                        */
    char  *pin_number_str;     /* pin number string of the pin           */
    char  *pin_alias;
    u_long key;                /* key used to search -->                 */
                               /* consist of: 3-bit type and 29-bits pin-id */
    u_short  pin_number;       /* used in test vector generation         */
```

Copyright 1989 Logic Modeling Systems

HEADER TEXT

```
    unsigned : 9;
    unsigned processed: 1,    /* used in sorting for test vector generation   */
    unsigned pin_class: 3,    /* DATA, EVAL, STORE, EDGE_RISE, EDGE_FALL       */
    unsigned pin_type: 3,     /* NONE, IN, OUT, IO, POWER, GROUND, NC          */
    u_short  line_index,      /* used   test vector generation                 */
} DAB_PID,

/* If you change the following structure be sure to change the lm_insert_key
 * procedure.
 */
typedef struct user_pid {
    struct user_pid *next_in_bucket,
    u_long              key,
    u_long              dab_pid_table_index,
} USER_PID,

typedef struct {
    u_long minimum,
    u_long typical,
    u_long maximum,
} MIN_TYP_MAX,

typedef struct {
    u_char     in_value,         /* current value of the pin                  */
    u_char     out_value,        /* current value of output pin               */
    u_long     min_delay,        /* M/T/M delays of the pin                   */
    u_long     typ_delay,
    u_long     max_delay,
    u_long     sim_time,         /* simulation time for this INPUT pin change */
    short      input_change,     /* links all of the input pin changes        */
    short      output_change;    /* links all of the output pin changes       */
    unsigned   :6,
    unsigned   just_went_float: 1, /* indicate that the pin just went to Z   */
    unsigned   is_linked: 1;     /* indicate that the pin is in input chg list */
    u_char     delay_type;       /* LM_TABLE_DELAY, LM_MEASURED_DELAY,         */
                                 /* LM_COMPOSITE_DELAY, LM_UNSPECIFIED_DELAY   */
    u_short    event_pin_number; /* pin number that causes the output to change*/
} PIN_INFO;

typedef struct instance_info {
    FILE   *vector_file;
    FILE   *tm_file;
    char   *vector_buffer;
    struct instance_info *link,   /* used to free instance info structures    */
                                  /* also used to link all instances for the  */
                                  /* save definition during save operation    */
    struct instance_info *fault_link, /* used to link all faults derived from*/
                                  /* the same instance during save operation  */
    PIN_INFO  **pin_table,
    long         last_pin_change_time,/* used in test vector generation       */
    long         time_of_first_evaluation,
    char        *device_info_string,/* physical device name of the instance   */
    short        box_fd,          /* File descriptor of the system            */
    short        inst_id,         /* inst/var id which is used by the user    */
    short        assoc_inst_id,   /* used during save operation to find the   */
                                  /* instance given a fault                   */
    short        box_inst_id,     /* inst/var id which is used in the Modeler */
    short        assoc_box_inst_id,/* > 0 means that this is the box instance id
                                     which this fault is derived from         */
    short        def_id,          /* index to the definition id table         */
    u_short      data_pin_change_count,
    u_short      eval_pin_change_count,
    u_short      store_pin_change_count,
    short        data_pin_change_list,
    short        eval_pin_change_list,
    short        store_pin_change_list,
    short        output_change_list,
    u_char       some_eval_or_store_pin,
    u_char       type_of_pin_change,    /* NO_CHG, DATA_CHG, EVAL_OR_STORE_CHG */
    short        pin_change_count,      /* For vector logging                  */
    u_char       get_pin_change_called,
} INSTANCE_INFO,

/* Structure for unspecified delays */
typedef union {
    struct {
        unsigned         from_state:4,
        unsigned         from_pin:12,
        unsigned         to_state:4,
        unsigned         to_pin:12,
    }                 field,
    u_long              unspeced_value,
}                unspeced_delay_type,

/* Unspecified specified delay linked list structure */
typedef struct _unspeced_delay_list_element {
    unspeced_delay_type unspeced_delay,
    struct _unspeced_delay_list_element *next,
}                unspeced_delay_list_element,

typedef struct {
    char           *device_name,
    SYSTEM_INFO    *system_ptr,
    DAB_PID        *dab_pid_table,
    USER_PID       *user_pid_hash_table[MAX_USER_PID_HASH_TABLE_SIZE],
    INSTANCE_INFO  *instance_link, /* used during save operation to point to  */
                                   /* the head of the instance linked-list    */
    MIN_TYP_MAX    *delay_table,
    short           input_pin_number_returned,
    short           output_pin_number_returned,
    short           io_pin_number_returned,
    short           power_pin_number_returned;
    short           ground_pin_number_returned,
    short           nc_pin_number_returned.
    u_short         hash_table_element_count,
    u_short         dab_pid_table_size,
    u_short         def_id,
    u_short         box_def_id,
    u_short         longest_pin_name,
    u_short         real_pin_count,
    u_short         lowest_eval_or_store_pinno,  /* used to return time 0 val */
    u_char          table_validated,
    u_char          use_default,
    u_char          report_miss.
    unspeced_delay_list_element **unspecified_delay_list,
} DEFINITION_INFO;

typedef struct {
    u_long word[3],
} PTRN_BITS_LONGWORD,
```

Copyright 1989 Logic Modeling Systems

| HEADER FILE | DATE 5/23/89 | PAGE # |
|---|---|---|
| include/lsfi.h | TIME 1:20:21 pm | 3/48 |

HEADER TEXT

```
/*------------------------------------------------------------------------*/

typedef struct {
    long      user_value;
    u_short lm_value;
    u_short set;
} USER_TO_LM_LOGIC_LEVEL;

/*------------------------------------------------------------------------*/

typedef struct file_info {
    struct file_info   *next;
    char               *name;
    FILE               *file_ptr;
    u_short             instance_id;
} FILE_INFO;

/*------------------------------------------------------------------------*/

#define MAX_COMM_BUFFER_SIZE    10*1024
#define MAX_COMM_BUFFER_INCR    1024

/*------------------------------------------------------------------------*/

extern CONNECTION   *lm_table_of_conns[];
extern CONNECTION   *lm_global_conn_ptr;

extern char          lm_gbl_username[];
extern char          lm_gbl_hostname[];

#define lm_put_int(val)    LM_CHK_PUT_LONG(lm_global_conn_ptr, (int)(val))

#define lm_put_short(val) LM_CHK_PUT_SHORT(lm_global_conn_ptr, (short)(val))

#define lm_put_char(c)     LM_CHK_PUT_CHAR(lm_global_conn_ptr, (char)(c))

#define lm_get_int()       LM_CHK_GET_LONG(lm_global_conn_ptr)

#define lm_get_short()     LM_CHK_GET_SHORT(lm_global_conn_ptr)

#define lm_get_char()      LM_CHK_GET_CHAR(lm_global_conn_ptr)

/* Network Debugging macros */
/*
#define lm_put_int(val) \
        (printf("Putl %08x <-- %08x\n", \
                lm_global_conn_ptr->outgoing_buffer_pointer, (val)), \
         LM_CHK_PUT_LONG(lm_global_conn_ptr, (val)))

#define lm_put_short(val) \
        (printf("Puts %08x <-- %04x\n", \
                lm_global_conn_ptr->outgoing_buffer_pointer, (val)), \
         LM_CHK_PUT_SHORT(lm_global_conn_ptr, (val)))

#define lm_put_char(c) \
        (printf("Putc %08x <-- %c\n", \
                lm_global_conn_ptr->outgoing_buffer_pointer, (c)), \
         LM_CHK_PUT_CHAR(lm_global_conn_ptr, (c)))


#define lm_get_int() \
        (printf("Getl %08x --> %08x\n", \
                lm_global_conn_ptr->incoming_buffer_pointer, \
                *((long *)(lm_global_conn_ptr->incoming_buffer_pointer))), \
         LM_CHK_GET_LONG(lm_global_conn_ptr))


#define lm_get_short() \
        (printf("Gets %08x --> %04x \n", \
                lm_global_conn_ptr->incoming_buffer_pointer, \
                *((short *)(lm_global_conn_ptr->incoming_buffer_pointer))), \
         LM_CHK_GET_SHORT(lm_global_conn_ptr))


#define lm_get_char() \
        (printf("Getc %08x --> %c\n", \
                lm_global_conn_ptr->incoming_buffer_pointer, \
                *lm_global_conn_ptr->incoming_buffer_pointer), \
         LM_CHK_GET_CHAR(lm_global_conn_ptr))
*/

#define lm_choose_conn(skt) \
    { \
        if (((skt) == -1) || (lm_table_of_conns[(skt)] == NULL)) { \
            lm_queue_message(ERROR_MSG, "invalid socket number: %d", skt); \
            return(LM_ERROR); \
        } \
        lm_global_conn_ptr = lm_table_of_conns[(skt)]; \
    }

#define lm_end_put(skt)  lm_send_request_get_reply(lm_global_conn_ptr)

/*------------------------------------------------------------------------*/

/* Simulation tables */
extern SYSTEM_INFO        **lm_system_table,      /* ptr to system array        */
extern INSTANCE_INFO      **lm_inst_id_table,     /* ptr to instance id array   */
extern DEFINITION_INFO    **lm_def_id_table,      /* ptr to def id array        */
extern INSTANCE_INFO      **lm_free_instance_id,
extern u_short              lm_def_id_table_size,
extern u_short              lm_inst_id_table_size,
extern short                lm_def_id_avail,      /* next id to be assigned     */

/* Pointers to Entities selected */
extern SYSTEM_INFO         *lm_system_selected,
extern DEFINITION_INFO     *lm_definition_selected,
extern INSTANCE_INFO       *lm_instance_selected,
extern u_long               lm_last_instance_id_specified,
extern u_long               lm_last_definition_id_specified,

/* Logic level mapping */
extern USER_TO_LM_LOGIC_LEVEL    lm_user_to_lm_logic_level_map[];
extern u_short                   lm_to_user_logic_level_map[];
extern u_short                   lm_logic_level_map_count,

/* Temporary buffer for DARNEY processing */
extern char                 *lm_temp_buffer,
extern char                 *lm_tbuf_ptr,
extern char                 *lm_max_tbuf_addr,
```

Copyright 1989
Logic Modeling Systems

HEADER FILE
include/lsfi.h

DATE 5/23/89
TIME 1:20:21 pm
PAGE # 4/49

LINE # HEADER TEXT

```

/* simulation characteristics */
extern u_short                  lm_sim_verified;
extern u_long                   lm_simulation_time;
extern u_long                   lm_gbl_simulator_type;
extern u_long                   lm_gbl_time_scale_number;
extern u_long                   lm_gbl_time_scale_units;
extern long                     lm_gbl_divide_delay;
extern u_char                   lm_gbl_time_scale;
extern u_long                   lm_gbl_half_time_scale;
extern u_long

extern u_short                  lm_host_file_opened;
extern FILE                    *tm_file;

#ifdef DEBUG
extern u_char lm_debug[];
#endif

extern u_long           lm_network_timeout;

extern FILE_INFO     *lm_vector_file_ptr;
extern FILE_INFO     *lm_timing_file_ptr;

/*-----------------------------------------------------------------*/

#define BOGUS_INSTANCE(inst_ptr) \
 (((inst_ptr) == NULL) || \
  (((u_long)(inst_ptr) >= (u_long)&lm_inst_id_table[0]) && \
   ((u_long)(inst_ptr) <  (u_long)&lm_inst_id_table[lm_inst_id_table_size])))

#ifdef DEBUG
#define DPRINTF(x) (void)printf x
#else
#define DPRINTF(x) /* do nothing */
#endif

#define clear_errors   lm_flush_message_queue

#define XISDIGIT(X)  ((((X) >= '0') && ((X) <= '9')) ? 1 : 0)

#define ADJUST_DELAY(val, time_scale, half_time_scale, divide_delay)          \
        ((val) = ((divide_delay) == FALSE ? (val) * (time_scale) :            \
        ((val) + (half_time_scale)) / (time_scale)))
```

Copyright 1989 Logic Modeling Systems

| HEADER FILE | DATE | PAGE # |
|---|---|---|
| include/magic.h | 5/23/89 | 1/50 |
| | TIME 1:20:21 pm | |

HEADER TEXT

```
/* SCCS_ID: magic.h rev 1.1, 4/24/89 at 07:34:05      */

#define EMPTY_192_BYTES unsigned \
        :32, :32, :32, :32, :32, :32, :32, :32, :32, :32, \
        :32, :32, :32, :32, :32, :32, :32, :32, :32, :32, \
        :32, :32, :32, :32, :32, :32, :32, :32, :32, :32, \
        :32, :32, :32, :32, :32, :32, :32, :32, :32, :32, \
        :32, :32, :32, :32, :32, :32, :32, :32;

/*
 * All magic chip registers are one bit per dut channel, except
 * the status register (parity_*).
 */

typedef union {
        struct  {
                unsigned :16,
                        data_out:16;
                        /* formatted dut data out          */

                unsigned :16,
                        md_output_enable:16;
                        /* formatted medium drive output enable */

                unsigned :16,
                        hd_output_enable:16;
                        /* formatted hard drive output enable   */

                unsigned :16,
                        control_output:16;
                        /* last bit for the control shift register */

                unsigned :16,
                        last_cycle:16;
                        /* soft drive output enable        */

                unsigned :16,
                        hmd_enable:16;
                        /* hard/medium drive enable        */

                unsigned :16,
                        data_format:16;
                        /* input data format bit           */

                unsigned :16,
                        error_data:16;
                        /* last data before ERROR is asserted   */

                unsigned :16,
                        short_sample:16;
                        /* short circuit detection         */

                unsigned :16,
                        unkown_sample:16;
                        /* sampled U values on dut         */

                unsigned :16,
                        float_sample:16;
                        /* sampled HIZ values on dut       */

                unsigned :16,
                        logic_sample:16;
                        /* sampled logic values on dut  */

                unsigned :16,
                        ttl_sample:16;
                        /* sampled TTL logic values on dut      */

                unsigned :32;
                        /* unused          */


                        /* status register */
                unsigned :16,
                        :14,
                        /* unused               */
                        parity_out:1,
                        /* output parity        */
                        parity_in:1;
                        /* input parity         */

                unsigned :16,
                        reset:16;
                        /* reading causes an internal magic reset */

                EMPTY_192_BYTES
        } m;
        unsigned long reg[16];
} MAGIC_CHIP;
```

Copyright 1989 Logic Modeling Systems

HEADER FILE include/message.h DATE 5/23/89 TIME 1:20:21 pm PAGE # 1/51

LINE # HEADER TEXT

```
/* SCCS_ID: message.h rev 3.1, 4/24/89 at 07:34:08 */

/*
 * The following #defines are the types of messages that lm_queue_message() queues.
 *
 * SYS_* types are used to pick up the hosting operating system's error
 * string as defined by the operating system (VRTX, UNIX ...). This
 * operating system error string is appended to the string that is created
 * from the rest of lm_queue_message()'s parameters.
 *
 * In UNIX, any function that sets "errno" after failure should be followed by a
 * call to lm_queue_message(SYS_ERROR_MSG,...) or lm_queue_message(SYS_WARNING_MSG,...)
 * depending upon your code's view of the system calls failure.
 *
 * VMS handles all of the C library functions in a UNIX compatible way, with
 * special handling for VMS system services (that's the VMS_*_MSGs #defined below).
 * See me if this concerns you as the calls to lm_queue_message() are different
 * for these message types.
 *
 * We will make VRTX compatible with UNIX.
 *
 * By using the SYS_* types, the operating system dependent handling of error
 * indicators is far removed from your application code and thereby localised
 * and easily ported and/or changed.
 *
 * The ERROR_MSG and WARNING_MSG types are for messages that originate because
 * of errors and warnings that are detected by your application code functionality.
 */
#define ERROR_MSG       1
#define WARNING_MSG     2
#define SYS_ERROR_MSG   3
#define VMS_ERROR_MSG   4
#define SYS_WARNING_MSG 5
#define VMS_WARNING_MSG 6

/*
 * The size of the maximum message that lm_dequeue_message() will ever
 * format into its string argument. See the examples below for usage.
 */
#define MAX_MESSAGE     256

/*
 * Routine to queue messages.
 */
extern  void    lm_queue_message();

/*
 * Routine to DEqueue messages.
 */
extern  u_short lm_dequeue_message();

/*
 * Routine to clear out all pending messages.
 * It's use should be very carefully considered.
 */
extern  void    lm_flush_message_queue();

/*
 * Routine to return what message types are currently queued.
 */
extern  void    lm_message_types();

/*
 * EXAMPLES:
 *      All these examples are taken from the network handling code. There are
 *      many other examples, in their larger context, that you should feel free
 *      to peruse as you feel necessary. See "/gandalf/usr/wayne/src/network".
 *
 * 1.   lm_queue_message(ERROR_MSG, "too many attempts(%d) to contact modeler, giving up", MAX_RETRY_ATTEMPTS);
 *
 * 2.   lm_queue_message(WARNING_MSG, "message transmission retry or time out(%d)", network_timeout);
 *
 * 3.   lm_queue_message(SYS_ERROR_MSG, "failure to send %d bytes to the modeler, only sent %d", byte_count, sent);
 *
 * 4.   u_short type;
 *      char    str[MAX_MESSAGE];
 *
 *      while(lm_dequeue_message(&type, str) != FAILURE) {
 *              if (type == ERROR_MSG)
 *                      (void) fprintf(stderr, "ERROR: %s\n", str);
 *              else (void) fprintf(stderr, "WARNING: %s\n", str);
 *      }
 *
 * NOTES:
 *      1. There are to be no "error:" or "warning:" string prefixes on any of the
 *         message strings that are passed to lm_queue_message(). The "type" is
 *         used to indicate severity, with the caller of lm_dequeue_message()
 *         deciding what an appropriate and consistent message prefix is.
 *
 *      2. There is to be no newline, '\n', character appended to any of the message
 *         strings that are passed to lm_queue_message().
 *
 *      3. The rest of the lm_queue_message() parameters are anything that sprintf()
 *         will take - starting with the format string and ending with a list of the
 *         variables that supply values for the %? format specifiers.
 *
 *      4. The first parameter to lm_queue_message() must be one of the first four
 *         #defines listed above.
 *
 *      5. The distinction between ERROR_MSG and SYS_ERROR_MSG is a critical one and
 *         must be maintained in your code's usage of lm_queue_message().
 *
 */
```

Copyright 1989
Logic Modeling Systems

HEADER FILE include/mod_def.h

DATE 5/23/89

TIME 1:20:21 pm

PAGE # 1/52

LINE #

HEADER TEXT

```
/* SCCS_ID: mod_def.h rev 3.1, 4/24/89 at 07:34:11 */

/* Modeler Definitions */

/*
 * There are four lanes in the LM-1000: A, B, C, and D.
 * Each lane contains slots for eight PELs.
 * The first 68020 address for each lane is:
 *
 *              0x80000000 for lane A
 *              0x90000000 for lane B
 *              0xA0000000 for lane C
 *      and     0xB0000000 for lane D
 *
 */
#define NUMBER_OF_LANES 4
#define NUMBER_OF_SLOTS 8
#define NUMBER_OF_PELS  NUMBER_OF_SLOTS
#define LANE_SIZE      (u_long)0x10000000 /* 256 Mbytes */
#define LANE_A_OFFSET (u_long)0x80000000
#define LANE_B_OFFSET (LANE_A_OFFSET + LANE_SIZE)
#define LANE_C_OFFSET (LANE_B_OFFSET + LANE_SIZE)
#define LANE_D_OFFSET (LANE_C_OFFSET + LANE_SIZE)

#define PEL_ID_PROM 0x00000983
#define LANE_A_PAM_ID_PROM 0x8c100483
#define LANE_A_PAC_ID_PROM 0x8c100003
#define TMG_ID_PROM 0x8e000083

#define SEED (u_long)0xdeadbabe /* Default random seed */
#define DIAG_MAX_INPUT 256
#define NONE 0
#define TIMER_RES 5     /* Timer resolution = 5 ms */

/* Modeler Macros */

#define Lane_code(X) (1 << (X))

#define Clear_key_buf()  while(lm_check_key() != 0) lm_get_key()

/* Global declarations of functions that do not return integers */

void pac_play_cleanup();
void pac_configure_all_pacs();
void pac_info_init();
void pac_play_cleanup();
void pac_set_first_block();
void pac_probe_all_pacs();
void diag_get_long();
void diag_get_ulong();
void diag_get_uhex();
```

Copyright 1989 Logic Modeling Systems

| HEADER FILE | DATE | 5/23/89 | PAGE # |
|---|---|---|---|
| include/mod_err.h | TIME | 1:20:21 pm | 1/53 |

HEADER TEXT

```
/* SCCS_ID: mod_err.h rev 1.1, 4/24/89 at 07:34:14        */

typedef struct {
        unsigned
                pel_error_list:32;                      /* WHICH PEL HAS ERROR */
        unsigned
#ifndef VAX
                error:1,                /* Error detected */
                lane_errors:4,          /* Lanes A-D have errors*/
                pac_lane_errors:4,      /* pac lanes have errors*/
                dab_change:1,           /* dab inserted/ removed*/
                tmg_error:1,            /* TMG error              */
                unknown_source_of_interrupt:1, /* source of interrupt unknown*/
                lane_enable:4,
                lane_b_pel_control:3,
                lane_b_data_valid:1,
                lane_a_pel_control:3,
                lane_a_data_valid:1,
                lane_d_pel_control:3,
                lane_d_data_valid:1,
                lane_c_pel_control:3,
                lane_c_data_valid:1;
#else
                lane_c_data_valid:1,
                lane_c_pel_control:3,
                lane_d_data_valid:1,
                lane_d_pel_control:3,
                lane_a_data_valid:1,
                lane_a_pel_control:3,
                lane_b_data_valid:1,
                lane_b_pel_control:3,
                lane_enable:4,
                unknown_source_of_interrupt:1, /* source of interrupt unknown*/
                tmg_error:1,            /* TMG error              */
                dab_change:1,           /* dab inserted/ removed*/
                pac_lane_errors:4,      /* pac lanes have errors*/
                lane_errors:4,          /* Lanes A-D have errors*/
                error:1;                /* Error detected */
#endif

        struct
        {
#ifndef VAX
                unsigned
                        pac_refresh_error:1,
                        pac_request_error:1,
                        pac_pattern_error:1,
                        pac_control_word_parity_error:1,
                        pac_high_word_parity_error:1,
                        pac_low_word_parity_error:1,
                        pac_branch_address:15,
                        pac_block_offset:8,
                        pad2:3;
                unsigned
                        pac_parity_error_address:26,
                        pad3:6;
#else
                unsigned
                        pad2:3,
                        pac_block_offset:8,
                        pac_branch_address:15,
                        pac_low_word_parity_error:1,
                        pac_high_word_parity_error:1,
                        pac_control_word_parity_error:1,
                        pac_pattern_error:1,
                        pac_request_error:1,
                        pac_refresh_error:1;
                unsigned
                        pad3:6,
                        pac_parity_error_address:26;
#endif
        } pac_error[ 4 ];                       /* which pac has errors */
        struct
        {
#ifndef VAX
                unsigned
                        dab_inserted:1,
                        dab_removed:1,
                        play_error:1,
                        any_magic_short:1,
                        any_magic_parity:1,
                        magic_parity_out:5,
                        pad5:22;
#else
                unsigned
                        pad5:22,
                        magic_parity_out:5,
                        any_magic_parity:1,
                        any_magic_short:1,
                        play_error:1,
                        dab_removed:1,
                        dab_inserted:1;
#endif
                unsigned short magic_short[5];
        } pel_error[ 32 ];                      /* errors per PEL */
} LM_HARDWARE_ERROR;

typedef struct {
#ifndef VAX
    unsigned    do_tmg_calibration: 1;
    unsigned    pad: 25;
    unsigned    tmg_cal: 1;
    unsigned    no_tmg:1;
    unsigned    no_pam_for_pac:4;
#else
    unsigned    no_pam_for_pac:4;
    unsigned    no_tmg:1;
    unsigned    tmg_cal: 1;
    unsigned    pad: 25;
    unsigned    do_tmg_calibration: 1;
#endif
    u_short     pam_strapped_wrong;
    u_short     pam_stacked_wrong;
    u_long      duplicate_segment;
    u_long      missing_segment;
    u_long      no_pel_for_dab;
    u_long      no_pam_for_dab;
    u_long      illegal_duplicate_device;
    u_long      device_too_large;       /* more than MAX_UNIT_COUNT units */
    u_long      illegal_pel_stacking;
```

Copyright 1989
Logic Modeling Systems

HEADER FILE
include/mod_err.h

DATE 5/23/89
TIME 1:20:21 pm
PAGE # 2/54

LINE #

HEADER TEXT

```
} CONFIGURATION_ERRORS;

typedef struct {
    u_long      dab_insertion_count;  /* has to be the fi[illegible]se */
    u_long      pattern_count_msl;
    u_long      pattern_count_lsl;
    u_long      longest_pattern_seq;
    u_long      definition_count;
    u_long      instance_count;
    u_long      fault_count;
} RUNTIME_STAT_STRUCT;
```

Copyright 1989 Logic Modeling Systems

HEADER FILE
include/network.h

DATE 5/23/89
TIME 1:20:22 pm
PAGE # 1/55

LINE # HEADER TEXT

```
/* SCCS_ID: network.h rev 3.1, 4/24/89 at 07:34:19 */

/*
 * The size of socket_address must exa    equal that of sockaddr.
 */
typedef struct  socket_address  {
        short   family;
        short   port;
        long    address;
        u_char  destination[6];
        u_short packet_type;
} SOCKET_ADDRESS;

/*
 * MSG_PEEK is taken directly from UNIX and can not be changed from 0x2.
 */
#define MSG_PEEK        0x2             /* peek at incoming message */

/*
 * Used for timeouts on the modeler with recvfrom().
 * This value must remain exclusive of MSG_PEEK.
 */
#define RECVFROM_TIMEOUT        0x1

/* Used as a flag in the modeler's version of sendto(). */
#define RAW_PACKET      0x4
#define UDP_IP_PACKET   0x8
#define ALIVE_PACKET    0x10
#define DEATH_PACKET    0x20

/* Are You Alive commands */
#define AYA_INQUIRE     0x300
#define AYA_KILL        0x302
#define AYA_INTERRUPT   0x304

#define SOCK_SIZE       sizeof(SOCKET_ADDRESS)

/*
 * The following must exactly match their equivalents in
 * the UNIX files <sys/socket.h>, <netinet/in.h>,
 * <netdb.h>, and <sys/time.h>.
 */

#define AF_INET         2               /* internetwork: UDP, TCP, etc. */
#define SOCK_DGRAM      2               /* datagram socket */

#ifdef  MODELER
#define INADDR_ANY              0x00000000
#endif

/*
 * Structure used by kernel to store most addresses.
 */
#ifndef PC386
struct  sockaddr        {
        unsigned        short   sa_family;              /* address family */
        char    sa_data[14];            /* up to 14 bytes of direct address */
};
#endif

/*
 * End of the required UNIX matching items.
 */

/*
 * An arbitrary port number that can be anything greater than 1024.
 */
#define MODELERS_ETHERNET_PORT          2010
#define MODELERS_OUT_OF_BAND_PORT       2012
#define MODELERS_ARE_YOU_ALIVE_PORT     2014
#define MODELERS_DEATH_PORT             2016

typedef struct  ethernet_header {
        u_char  destination[6];
        u_char  source[6];
        u_short type;
} ETHERNET_HEADER;

typedef struct  ip_header       {
        u_char  version_and_header_length;
        u_char  type_of_service;
        u_short total_length;
        u_short identification;
        u_short fragment_offset;
        u_char  time_to_live;
        u_char  protocol;
        u_short checksum;
        u_long  source_address;
        u_long  destination_address;
} IP_HEADER;

typedef struct  udp_header      {
        u_short source_port;
        u_short destination_port;
        u_short length;
        u_short checksum;
} UDP_HEADER;

typedef struct  lm_header       {
        u_long  byte_count;
        u_long  process_id;
        u_long  sequence_number;
        u_long  partial_packet_count;
} LM_HEADER;

typedef struct  packet_header   {
#ifdef  MODELER
        ETHERNET_HEADER ethernet_hdr;
        IP_HEADER       ip_hdr;
        UDP_HEADER      udp_hdr;
#endif
        LM_HEADER       lm_hdr;
} PACKET_HEADER;

typedef struct  connection      {
        int     fd;
        char    *name;

        u_short am_sending;
        u_short am_receiving;
```

Copyright 1989 Logic Modeling Systems

| HEADER FILE | DATE | 5/23/89 | PAGE # |
|---|---|---|---|
| include/network.h | TIME | 1:20:22 pm | 2/56 |

HEADER TEXT

```
        u_short am_closing;
        u_short do_close;
        u_short am_timing_out;
        u_short am_processing;
        u_long  time_at_last_response;
        u_long  time_to_live;
        u_char  number_of_live_retries;
        u_long  bytes_left_to_send;
        u_long  bytes_left_to_receive;

        u_long  incoming_time;
        u_long  incoming_buffer_size;
        char    *incoming_message_end;
        char    *incoming_buffer_base;
        char    *incoming_buffer_pointer;

        u_long  outgoing_time;
        u_long  outgoing_buffer_size;
        char    *outgoing_buffer_end;
        char    *outgoing_buffer_base;
        char    *outgoing_buffer_pointer;
        char    *last_outgoing_buffer_pointer;

        LM_HEADER       header;
        SOCKET_ADDRESS  sock;
} CONNECTION;

/* FIXIT: P_HEADER_SIZE
 * The size of the packet header is not of fixed size due to
 * the possibility of options in the IP header structure.
 * I am not sure what to do about this, so punt for now.
 */
#define P_HEADER_SIZE           (sizeof(PACKET_HEADER))
#define LM_HEADER_SIZE          (sizeof(LM_HEADER))

#define BYTE_COUNT(X)           (((PACKET_HEADER *)(X))->lm_hdr.byte_count)
#define PROCESS_ID(X)           (((PACKET_HEADER *)(X))->lm_hdr.process_id)
#define SEQUENCE_NUMBER(X)      (((PACKET_HEADER *)(X))->lm_hdr.sequence_number)
#define PARTIAL_PACKET_COUNT(X) (((PACKET_HEADER *)(X))->lm_hdr.partial_packet_count)

/*
 * Define a maximum size for a host request or a modeler reply
 * so that we can do some kind of error checking for outrageous
 * host/modeler processing.
 *
 * The numbers set below are the largest (un)realistic request/reply
 * of all 32 DAMs = 80 pins/DAM * 8 bytes/pin + protocol overhead.
 */
/* MAX_NETWORK_OUTPUT is used by SFI save and restore. */
#define MAX_NETWORK_OUTPUT      (2 * 80 * 32 * 8)

#define MAX_REPLY_SIZE          (MAX_NETWORK_OUTPUT + P_HEADER_SIZE)
#define MAX_REQUEST_SIZE        (MAX_NETWORK_OUTPUT + P_HEADER_SIZE)

#define MAX_CLIENT_PACKET       1024

/*
 * Note that if the "server" is running anywhere other than the
 * modeler, the client and server maximum packet sizes are equal.
 */
#define MAX_SERVER_PACKET       (MAX_CLIENT_PACKET + P_HEADER_SIZE - LM_HEADER_SIZE)

#define LM_RESET_INCOMING(X)    (X)->incoming_buffer_pointer = (X)->incoming_buffer_base + P_HEADER_SIZE;
#define LM_RESET_OUTGOING(X)    (X)->outgoing_buffer_pointer = (X)->outgoing_buffer_base + P_HEADER_SIZE;

#define LM_SET_END_INCOMING(X)  (X)->incoming_message_end = (X)->incoming_buffer_base + BYTE_COUNT(((X)->incoming_buffer_base)) + P_HEADER_SIZ
E - LM_HEADER_SIZE;

#define OUTGOING_BUFFER_INCREMENT       512

/* Must be maintained as a set exclusive of SUCCESS and FAILURE */
#define PENDING         100
#define NONE_PENDING    101

/* Must be maintained as a set exclusive of SUCCESS and FAILURE */
#define PARTIAL_REQUEST 200
#define FULL_REQUEST    201
#define PARTIAL_REPLY   202
#define FULL_REPLY      203

#define MAX_NEGATIVE_LONG       ((long) (1 << 31))
#define MAX_NEGATIVE_SHORT      ((short) (1 << 15))

#define LM_SENDING_REPLY(X)     ((X)->am_sending)

/* MAX_USERS must be a power of 2 for the lmsw code. */
#define MAX_USERS       32

extern  void    lm_extend_outgoing_buffer();
extern  u_short lm_send_request_get_reply();
extern  u_short lm_init_connection_for_client();
extern  u_short lm_close_connection_for_client();
extern  u_short lm_send_reply();
extern  u_short lm_receive_request();
extern  u_short lm_pending_requests_or_replies();

/*
 * Note the different macros below which cause byte swaps for shorts and longs
 * (there is no difference for the character macros.)
 *
 * We do not need to mask any of the shifted values because C either always guarantees
 * (left shift) or guarantees if the shifted quantity is unsigned (right shift) to
 * fill the vacated bits with zeros.
 */

/* The BYTE_SWAP_*() macros are only used on PC386 and VMS */
#define BYTE_SWAP_LONG(X)       ( (((X) >> 24) & 0xFF) | (((X) >> 8) & 0xFF00) | \
                                  (((X) <<  8) & 0xFF0000) | ((X) << 24) )
#define BYTE_SWAP_SHORT(X)      ( (((X) <<  8) & 0xFF00) | (((X) >> 8) & 0xFF) )

#define LM_MARK_BUFFER(X)       \
        ((u_long)(X)->outgoing_buffer_pointer - (u_long)(X)->outgoing_buffer_base)

#define LM_BYTES_IN_BUFFER(X)   \
        ((u_long)(X)->outgoing_buffer_pointer - (u_long)(X)->outgoing_buffer_base - P_HEADER_SIZE)

#define LM_GET_CHAR(X)          \
        ( *((u_char *)(X)->incoming_buffer_pointer)++ )
#define LM_PUT_CHAR(X, Y)       \
        ( *((u_char *)(X)->outgoing_buffer_pointer)++ = (u_char)(Y) )
```

Copyright 1989 Logic Modeling Systems

HEADER FILE include/network.h DATE 5/23/89 TIME 1:20:22 pm PAGE # 3/57

HEADER TEXT

```
#define LM_PUT_CHAR_AT_MARK(M, X, Y)      \
        ( *(u_char *)((u_long)((X)->outgoing_buffer_base) + (u_long)(M)) = (u_char)(Y) )

#define LM_GET_ADDR(X)   ((X)->incoming_buffer_pointer)
#define LM_ADVANCE_ADDR(X, Y)    (((X)->incoming_buffer_pointer) += (Y))

/* Machine dependent get and put marcors */

#ifdef  SUN4
#define NET_BYTE_ALIGN
#endif
#ifdef  APOLLO10K
#define NET_BYTE_ALIGN
#endif
#ifdef  VMS
#define NET_BYTE_ALIGN
#endif

#ifdef  NET_BYTE_ALIGN  /* SUN4, APOLLO10K, VMS */
#define LM_GET_SHORT(X)                 ( (LM_GET_CHAR(X) << 8) |       \
                                          LM_GET_CHAR(X) )

#define LM_PUT_SHORT(X, Y)              ( LM_PUT_CHAR(X, ((Y) >> 8)), \
                                          LM_PUT_CHAR(X, (Y)) )

#define LM_PUT_SHORT_AT_MARK(M, X, Y)   ( LM_PUT_CHAR_AT_MARK(((M)+0), X, ((Y) >> 8)), \
                                          LM_PUT_CHAR_AT_MARK(((M)+1), X, (Y)) )

#define LM_GET_LONG(X)                  ( (LM_GET_CHAR(X) << 24) |      \
                                          (LM_GET_CHAR(X) << 16) |      \
                                          (LM_GET_CHAR(X) <<  8) |      \
                                           LM_GET_CHAR(X) )

#define LM_PUT_LONG(X, Y)               ( LM_PUT_CHAR(X, ((Y) >> 24)),  \
                                          LM_PUT_CHAR(X, ((Y) >> 16)),  \
                                          LM_PUT_CHAR(X, ((Y) >>  8)),  \
                                          LM_PUT_CHAR(X, (Y)) )

#define LM_PUT_LONG_AT_MARK(M, X, Y)    ( LM_PUT_CHAR_AT_MARK(((M)+0), X, ((Y) >> 24)), \
                                          LM_PUT_CHAR_AT_MARK(((M)+1), X, ((Y) >> 16)), \
                                          LM_PUT_CHAR_AT_MARK(((M)+2), X, ((Y) >>  8)), \
                                          LM_PUT_CHAR_AT_MARK(((M)+3), X, (Y)) )

#else   /* ! NET_BYTE_ALIGN */

#ifdef PC386    /* PC386 */
u_long ntohl(), htonl();
u_short ntohs(), htons();

#define LM_GET_SHORT(X)           ( ((X)->incoming_buffer_pointer+=sizeof(short)), \
                           (ntohs( *(u_short *)((X)->incoming_buffer_pointer-sizeof(short)))) )

#define LM_GET_LONG(X)            ( ((X)->incoming_buffer_pointer+=sizeof(long)), \
                           (ntohl( *(u_long *)((X)->incoming_buffer_pointer-sizeof(long)))) )

#define LM_PUT_SHORT(X, Y)        ( (*(u_short *)(X)->outgoing_buffer_pointer = htons((Y))), \
                                    ((X)->outgoing_buffer_pointer +=sizeof(short)) )

#define LM_PUT_LONG(X, Y)         ( (*(u_long *)(X)->outgoing_buffer_pointer = htoml((Y))), \
                                    ((X)->outgoing_buffer_pointer +=sizeof(long)) )

#define LM_PUT_SHORT_AT_MARK(M, X, Y)    (*(u_short *)((X)->outgoing_buffer_base + (M)) = htons((Y)))

#define LM_PUT_LONG_AT_MARK(M, X, Y)     (*(u_long *)((X)->outgoing_buffer_base + (M)) = htoss((Y)))

#else   /* SUN3, APOLLO68K, MODELER, HP300 */
#define LM_GET_SHORT(X)             \
        ( *((short *)(X)->incoming_buffer_pointer)++ )

#define LM_PUT_SHORT(X, Y)          \
        ( *((short *)(X)->outgoing_buffer_pointer)++ = (Y) )

#define LM_PUT_SHORT_AT_MARK(M, X, Y)     \
        ( *(short *)((u_long)((X)->outgoing_buffer_base) + (u_long)(M)) = (Y) )

#define LM_GET_LONG(X)              \
        ( *((long *)(X)->incoming_buffer_pointer)++ )

#define LM_PUT_LONG(X, Y)           \
        ( *((long *)(X)->outgoing_buffer_pointer)++  = (Y) )

#define LM_PUT_LONG_AT_MARK(M, X, Y)      \
        ( *(long *)((u_long)((X)->outgoing_buffer_base) + (u_long)(M))  = (Y) )
#endif
#endif

/* Machine independent get and put marcors */

#define LM_CHK_GET_CHAR(X)                                                 \
        ( (X)->incoming_buffer_pointer < (X)->incoming_message_end ?       \
            LM_GET_CHAR(X) : (char )'\0' )

#define LM_CHK_GET_LONG(X)                                                 \
        ( (X)->incoming_buffer_pointer+3 < (X)->incoming_message_end ?     \
            LM_GET_LONG(X) : (long) MAX_NEGATIVE_LONG     )

#define LM_CHK_GET_SHORT(X)                                                \
        ( (X)->incoming_buffer_pointer+1 < (X)->incoming_message_end ?     \
            LM_GET_SHORT(X): (short) MAX_NEGATIVE_SHORT  )

#define LM_CHK_PUT_CHAR(X, Y)                                              \
        ( (X)->outgoing_buffer_pointer < (X)->outgoing_buffer_end ?        \
            LM_PUT_CHAR(X, Y) :                                            \
           (lm_extend_outgoing_buffer(X), LM_PUT_CHAR(X, Y))  )

#define LM_CHK_PUT_LONG(X, Y)                                              \
        ( (X)->outgoing_buffer_pointer+3 < (X)->outgoing_buffer_end ?      \
            LM_PUT_LONG(X, Y) :                                            \
           (lm_extend_outgoing_buffer(X), LM_PUT_LONG(X, Y))  )

#define LM_CHK_PUT_SHORT(X, Y)                                             \
        ( (X)->outgoing_buffer_pointer+1 < (X)->outgoing_buffer_end ?      \
            LM_PUT_SHORT(X, Y) :                                           \
           (lm_extend_outgoing_buffer(X), LM_PUT_SHORT(X, Y)) )

extern  CONNECTION      *lm_global_conn_ptr;
```

Copyright 1989
Logic Modeling Systems

| HEADER FILE | DATE | 5/23/89 | PAGE # |
| --- | --- | --- | --- |
| include/nvsram.h | TIME | 1:20:22 pm | 1/58 |

LINE # HEADER TEXT

```
/* SCCS_ID: nvsram.h rev 3.3, 4/25/89 at 16:51:09      */

/*
**      LM-1000 Host Utility include file
**      copyright 1988, Logic Modeling Systems Inc.
**
**      ethernet packet type is 8000 hex for Unix and other systems
**              that support UDP/IP.  For VMS we need to find a number
**              which won't collide with any other protocols.
**
**      host_machine_type               1 = SUN
**                                      2 = APOLLO
**                                      3 = VAX/VMS
**                                      4 = IBM/PC
**
**      autoboot                        1 = modeler should autoboot
**                                      0 = modeler should manual boot
**
**      diagnostics                     1 = diagnostic
**                                      0 = no diagnostic
**
**      this needs to be differentiated because PCs may not have an
**              actual autoboot facility....
*/
/*
** This is the current EPROM_NVSRAM_VERSION
** If it does not match NVSRAM, we need either new EPROMS or
** new host utility.
** if EPROM_NVSRAM_VERSION > BOOT_STRUCT.version )
**      new_host_utility.
** if EPROM_NVSRAM_VERSION < BOOT_STRUCT.version )
**      new EPROMS.
*/

#define EPROM_NVSRAM_VERSION    0x0002

typedef struct  {
        unsigned char   lmsi[ 4 ];
        unsigned short  version;
        unsigned short  ethernet_packet_type;
        unsigned short  internet_socket_number;
        unsigned char   host_ethernet_address[6];
        unsigned long   host_internet_address;
        unsigned long   modeler_internet_address;
        unsigned char   host_machine_type;
        unsigned char   autoboot;
        unsigned char   diagnostics;
#ifdef VMS
        unsigned char   padding;                /* WARNING:  This structure must be an even number of  */
                                                /*           bytes on VMS, otherwise the sizeof        */
                                                /*           function produces "incorrect" results.    */
                                                /*           VMS is aligned to bytes, Unix to words    */
#endif
        }  BOOT_STRUCT;
/*
** The following must match the boot structure
*/


#define BSIG                (unsigned long ) 0
#define BVER                (unsigned long ) (BSIG          + 4*4)
#define BENET_TYPE          (unsigned long ) (BVER          + 2*4)
#define BNPORT              (unsigned long ) (BENET_TYPE    + 2*4)
#define BHENET              (unsigned long ) (BNPORT        + 2*4)
#define BHINET              (unsigned long ) (BHENET        + 6*4)
#define BMINET              (unsigned long ) (BHINET        + 4*4)
#define BHOST               (unsigned long ) (BMINET        + 4*4)
#define BAUTO               (unsigned long ) (BHOST         + 1*4)
#define DIAGNOSTICS         (unsigned long ) (BAUTO         + 1*4)
#define BOOT                (unsigned long ) BSIG

#define SIZEOF_BSIG                 (unsigned long ) 4
#define SIZEOF_BVER                 (unsigned long ) 2
#define SIZEOF_BENET_TYPE           (unsigned long ) 2
#define SIZEOF_BNPORT               (unsigned long ) 2
#define SIZEOF_BHENET               (unsigned long ) 6
#define SIZEOF_BHINET               (unsigned long ) 4
#define SIZEOF_BMINET               (unsigned long ) 4
#define SIZEOF_BHOST                (unsigned long ) 1
#define SIZEOF_BAUTO                (unsigned long ) 1
#define SIZEOF_DIAGNOSTICS          (unsigned long ) 1
#define SIZEOF_BOOT                 (unsigned long ) sizeof(BOOT_STRUCT)

#define MODELER_STATE   (unsigned long)((sizeof( BOOT_STRUCT ))*4)
#define MODELER_RESET   (unsigned long)(MODELER_STATE + 1*4)
/*
** baud rate selection
*/
#define BAUD_RATEA       (unsigned long) (MODELER_RESET + 1*4)
#define BAUD_RATEB       (unsigned long) (BAUD_RATEA + 1*4)
#define CONSOLE_BAUD    BAUD_RATEA
#define MODEM_BAUD      BAUD_RATEB

/*
** dab insertion count followed by
** number of times pattern played
*/
#define RUNTIME_ST.     (unsigned long)(BAUD_RATEB + 1*4)


/*
** bus error address
** and special status word
*/
#define BUS_ADDR        (unsigned long)(RUNTIME_STAT +  sizeof(RUNTIME_STAT_STRUCT)*4)
#define SSW_REG         (unsigned long)(BUS_ADDR+ 4*4)
/*
** clock board, PAM, PEL error
*/
#define HARDWARE_ERROR (unsigned long)(SSW_REG + 2*4)
/*
** CPU parity error
*/
#define PARITY_ERR      (unsigned long)(HARDWARE_ERROR + (sizeof(LM_HARDWARE_ERROR)*4))
/*
** reason for reset, see defines at the end of file
*/
/*
** network timeout
*/
```

Copyright 1989
Logic Modeling Systems

| HEADER FILE | DATE 5/23/89 | PAGE # |
|---|---|---|
| include/nvsram.h | TIME 1:20:22 pm | 2/59 |

HEADER TEXT

```
#define NETWORK_TIMEOUT (unsigned long)(PARITY_ERR + 4*4)
/*
** Configuration errors
*/
#define CONFIG_ERROR        (unsigned long)(NETWORK_TIM... + 2*4)
#define PAC_PAM_ERROR       (unsigned long)(CONFIG_ERROR + sizeof(CONFIGURATION_ERRORS) * 4)  /* (16 bytes * 4) */
#define LANCE_CSR_REG       (unsigned long)(PAC_PAM_ERROR + 4*4)
#define ERROR_VECTOR        (unsigned long)(LANCE_CSR_REG + 2*4)
#define PASSWORD            (unsigned long)(ERROR_VECTOR  + 2*4)

#define CPU_SKIP_MENU       (unsigned long)(0x7fd * 4)
#define CPU_TEST_BYTE       (unsigned long)(0x7fe * 4)
#define CHECKSUM            (unsigned long)(0x7ff * 4)

#define SIZEOF_RUNTIME_STAT       (unsigned long) (sizeof(RUNTIME_STAT_STRUCT))
#define SIZEOF_BAUD_RATEA         (unsigned long) 1
#define SIZEOF_BAUD_RATEB         (unsigned long) 1
#define SIZEOF_CONSOLE_BAUD       SIZEOF_BAUD_RATEA
#define SIZEOF_MODEM_BAUD         SIZEOF_BAUD_RATEB
#define SIZEOF_BUS_ADDR           (unsigned long) 4
#define SIZEOF_SSW_REG            (unsigned long) 2
#define SIZEOF_HARDWARE_ERROR     (unsigned long) (sizeof(LM_HARDWARE_ERROR))
#define SIZEOF_PARITY_ERR         (unsigned long) 4
#define SIZEOF_MODELER_STATE      (unsigned long) 1
#define SIZEOF_MODELER_RESET      (unsigned long) 1
#define SIZEOF_NETWORK_TIMEOUT    (unsigned long) 2
#define SIZEOF_CONFIG_ERROR       (unsigned long) (sizeof(CONFIGURATION_ERRORS))
#define SIZEOF_PAC_PAM_ERROR      (unsigned long) 16
#define SIZEOF_LANCE_CSR_REG      (unsigned long) 2
#define SIZEOF_ERROR_VECTOR       (unsigned long) 2
#define SIZEOF_PASSWORD           (unsigned long) 16
#define SIZEOF_CPU_SKIP_MENU      (unsigned long) 1
#define SIZEOF_CPU_TEST_BYTE      (unsigned long) 1
#define SIZEOF_CHECKSUM           (unsigned long) 1

/*
** boot options
*/
#define AUTOBOOT       1
#define MANUALBOOT     0
#define APPLICATION_BOOT 0
#define DIAGNOSTIC_BOOT  1

#ifdef  SUN
#define LM_BOOT_PACKET_TYPE      0x0800
#define LM_BOOT_MACHINE          1
#endif

#ifdef  APOLLO
#define LM_BOOT_PACKET_TYPE      0x0800
#define LM_BOOT_MACHINE          2
#endif

#ifdef  VMS
#define LM_BOOT_PACKET_TYPE      0x07FF           /* FIXIT, get a better number  */
#define LM_BOOT_MACHINE          3
#endif

/*
** MODELER STATES
*/
#define SHUTDOWN                 (char)2 /* state */
#define REBOOT                   (char)3 /* state */
#define DELAY_REBOOT             (char)4 /* state */
#define BOOTING                  (char)6 /* state */
#define BOOTME                   (char)7 /* state */
#define BOOTED                   (char)8 /* state */
#define MODELER_RUNNING          (char)31 /* state */
#define MODELER_CALIBRATING      (char)32 /* state */
#define RUNNING_LOOPMODE         (char)33 /* state */
#define RUNNING_DIAGS            (char)34 /* state */

/*
** MODELER RESET CONDITIONS
*/
#define PARITY_ERROR             (char)1 /* Reset condition */
#define BACKPLANE_ERROR          (char)4 /* Reset condition */
#define BUS_ERROR                (char)5 /* Reset condition */
#define LOST_POWER               (char)9 /* Reset condition */
#define SUICIDE                  (char)10 /* Reset condition */
#define SUICIDE0                 (char)11 /* Reset condition */
#define SUICIDE1                 (char)12 /* Reset condition */
#define SUICIDE2                 (char)13 /* Reset condition */
#define SUICIDE3                 (char)14 /* Reset condition */
#define SUICIDE4                 (char)15 /* Reset condition */
#define SUICIDE5                 (char)16 /* Reset condition */
#define SUICIDE6                 (char)17 /* Reset condition */
#define SUICIDE7                 (char)18 /* Reset condition */
#define SUICIDE8                 (char)19 /* Reset condition */
#define SUICIDE9                 (char)20 /* Reset condition */
#define BAD_NVSRAM               (char)30 /* Reset condition */
#define LANCE_ERROR              (char)33 /* Reset condition */
#define OUTOFDATE_EPROMS         (char)35 /* Reset condition */
#define OUTOFDATE_HOST_UTILS     (char)36 /* Reset condition */
#define REMOTE_RESET             (char)37 /* Reset condition */

/*
 * A.   rary value for CPU_SKIP_MENU
 */
#define CPU_SKIP_MENU_YES        (char)174
/*
** This it the NVsram, as a data structure.
*/
typedef struct {
        BOOT_STRUCT boot;                  /* EPROM version dependent */
        unsigned char modeler_state;             /* EPROM version dependent */
        unsigned char modeler_reset;             /* EPROM version dependent */
        unsigned char baud_rateA;                /* EPROM version dependent */
        unsigned char baud_rateB;                /* EPROM version dependent */
        RUNTIME_STAT_STRUCT rtime_structure;
        unsigned long bus_addr;
        unsigned short spec_status_word;
        LM_HARDWARE_ERROR lm_hardware_error;
        unsigned long parity_error;
        unsigned short network_timeout;
        CONFIGURATION_ERRORS config_errors;
        unsigned long pac_pam_errors[4];
        unsigned short lance_csr;
        unsigned short error_vector;
        unsigned char   password[ 16 ];
```

Copyright 1989
Logic Modeling Systems

HEADER FILE
include/nvsram.h

DATE 5/23/89
TIME 1:20:22 pm
PAGE # 3/60

HEADER TEXT

```
}NVSRAM_ORGANIZATION;

/*
** This is needed to figure out how much [illegible] is unused in between
** the above struct, and the checksum and [illegible]'s diags.
*/
typedef struct {
        NVSRAM_ORGANIZATION nvsram;
        unsigned char reserved[ 0x2000 - sizeof(NVSRAM_ORGANIZATION) ]; /* where 2000 is the size of nvsram */
        unsigned char cpu_skip_menu;
        unsigned char cpu_test_byte;
        unsigned char checksum;
} NVSRAM_ORG;

extern char modeler_state;
```

Copyright 1989 Logic Modeling Systems

HEADER FILE include/pac.h

DATE 5/23/89 TIME 1:20:22 pm

PAGE # 1/61

LINE # HEADER TEXT

```
/* SCCS_ID: pac.h rev 3.1, 4/24/89 at 07:34:26    */

/**********************************************
 *      pac.h                                 *
 *                                            *
 *      structure used in PAC diagnostics     *
 *                                            *
 **********************************************/

#define EMPTY_124_BYTES unsigned \
        :32, :32, :32, :32, :32, :32, :32, :32, :32, :32, \
        :32, :32, :32, :32, :32, :32, :32, :32, :32, :32, \
        :32, :32, :32, :32, :32, :32, :32, :32, :32, :32, :32;
#define EMPTY_SIZE 128

/*
 * There are from one to four PACs in the LM-1000, one for each of
 * the four lanes (A, B, C, and D). Each PAC can have from one to
 * four PAM (pattern memory) boards plugged into it.
 *
 * Pattern memory is organized in three banks.
 * Bank 0 is offset 0x00000000 from the lane address.
 * Bank 1 is offset 0x04000000 from Bank 0.
 * Bank 2 is offset 0x04000000 from Bank 1.
 */
#define PAT_MEM_BANK (u_long)0x04000000         /* 64 Mbytes */
#define BANK_0 (u_long)0x00000000
#define BANK_1 (BANK_0 + PAT_MEM_BANK)
#define BANK_2 (BANK_1 + PAT_MEM_BANK)
/*
 * The PAC Link Table is offset by 0x0C000000 from the lane address.
 * The current size of the link table is 32Kx16, on long word boudaries.
 */
#define LINK_OFFSET (u_long)0x0c000000
#define LINK_SIZE (u_long)0x00020000
/*
 * The following is a data structure for all PAC/PAM registers.
 * The PAC/PAM registers are offset by 0x0C100000 from the lane address.
 * All read/write registers are cleared on backplane reset (i.e. Power-on).
 * The PAC asserts ERROR* when any one of the six *_error conditions is true.
 */
#define PAC_REG_OFFSET (u_long)0x0c100000
typedef struct
{
  /* PAC ID PROM */
  /* offset: 0x0 = 0 */
#define PAC_ID    PAC_REG_OFFSET
  /* The PAC ID PROM is a byte wide resource on 32 bit boundaries.      */
  struct
  {
    unsigned :24, data:8;
  } id_prom[32];

  /* PAC PAM-COUNT REGISTER */
  /* offset: 0x80 = 128 = 32*4 + 0 */
#define PAM_COUNT   (PAC_ID + (u_long)0x80)
  /* Read only, 4-bit register */
  unsigned :28,
  pam_count:4;                 /* 4-bit code indicating number of pams */
                               /* stacked onto the PAC                 */

/* pam_count */
#define ZERO_PAMS 0x0
#define ONE_PAM 0x1
#define TWO_PAMS 0x3
#define THREE_PAMS 0x7
#define FOUR_PAMS 0xF

  EMPTY_124_BYTES

  /* PAC CONFIGURATION REGISTER */
  /* offset: 0x100 = 256 = 4 + 124 + 128 */
#define CONFIG_OFFSET (PAM_COUNT + EMPTY_SIZE)
  unsigned :24,
  high_word_parity:1,    /* parity setting on the high word        */
  low_word_parity:1,     /* parity setting on the low word         */
  configuration:6;

/* * word_parity */
#define SET_ODD_PARITY  1
#define SET_EVEN_PARITY 0

/* configuration: pseudo code
if (pam_count != ONE_PAM)
{
  configuration = (total_number_of_patterns / 128K) - 1;
}
else
{
  switch(number_of_patterns_in_PAM)
  {
    128K:    configuration = 60; break;
    512K:    configuration = 61; break;
    2048K:   configuration = 63; break;
  }
}
*/

  EMPTY_124_BYTES

  /* PAC BRANCH ADDRESS REGISTER */
  /* offset: 0x180 = 384 = 4 + 124 + 256 */
#define BRANCH_OFFSET (CONFIG_OFFSET + EMPTY_SIZE)
  unsigned :16,
  :1,
  branch_address:15;     /* contains block address of first        */
                         /* block in pattern sequence              */

  EMPTY_124_BYTES

  /* PAC CLOCK SPEED REGISTER */
  /* offset: 0x200 = 512 = 4 + 124 + 384 */
#define CLOCK_OFFSET (BRANCH_OFFSET + EMPTY_SIZE)
  unsigned :31,
  clock_speed:1;         /* clock speed setting (1MHz or >=1MHz  */

/* clock_speed */
#define BELOW_1MHZ      0
#define ABOVE_1MHZ      1
```

Copyright 1989 Logic Modeling Systems

HEADER FILE include/pac.h | DATE 5/23/89 | TIME 1:20:22 pm | PAGE # 2/62

HEADER TEXT

```
   EMPTY_124_BYTES

   /* PAC ERROR REGISTER */
   /* offset: 0x280 = 640 = 4 + 124 + 512 */
#define ERROR_OFFSET (BLOCK_OFFSET + EMPTY_SIZE)
   /* Read only, 4-bit register. All bits are active high.    */
   /* Register is cleared by writing any value to this address */
   unsigned :28,
   refresh_error:1,        /* Fatal refresh error  */
   request_error:1,        /* Fatal Request State Machine error   */
   pattern_error:1,        /* Fatal Pattern State Machine error   */
   parity_error:1;         /* Pattern presentation control word   */
                           /* parity error */

   EMPTY_124_BYTES

   /* PAC BLOCK OFFSET REGISTER */
   /* offset: 0x300 = 768 = 4 + 124 + 640 */
#define BLOCK_OFFSET (ERROR_OFFSET + EMPTY_SIZE)
   unsigned :24,
   block_offset:8;                  /* Pattern offset within a pattern block */
                                    /* on presentation halt due to an error. */
                                    /* There is some, as yet undetermined,   */
                                    /* latency in this address that must be  */
                                    /* accounted for.  Must read before      */
                                    /* errors are cleared.                   */

   EMPTY_124_BYTES

   /* PAC PARITY ERROR ADDRESS REGISTER */
   /* offset: 0x380 = 896 = 4 + 124 + 768 */
#define PARITY_OFFSET (BLOCK_OFFSET + EMPTY_SIZE)
   unsigned :4,
   high_word_parity_error:1,      /* error on high word parity,       */
   low_word_parity_error:1,       /* error on low word parity,        */
                                  /*      both could be set.          */
   parity_error_address:26;       /* contains A[27:2] on CPU read     */
                                  /* access parity error.             */
                                  /* Must read before clearing errors. */

   EMPTY_124_BYTES

   /* PAM PRESENT REGISTERS and ID PROMS */
   /* offset: 0x400 = 1024 = 4 + 124 + 896 */
#define PAM_OFFSET (PARITY_OFFSET + EMPTY_SIZE)
#define PAM_ID (PAM_OFFSET + EMPTY_SIZE)
   /* Only pam_register[0 ... pam_count].id_prom[] contain valid data.  */
   struct
   {
     unsigned :31, present:1;     /* indication that a PAM is present */
     EMPTY_124_BYTES              /* 124 bytes of hole                */
     /* The PAM ID PROM is a byte wide resource, on 32 bit boundaries.  */
     struct
     {
       unsigned :24, data:8;
     } id_prom[32];
   } pam_register[4];

/* pam_register[].id_prom[0].data */
#define PAM_TYPE        id_prom[0].data
#define PAM_128K        0x06
#define PAM_512K        0x07
#define PAM_2M          0x13

/* pam_register[].present */
#define PAM_PRESENT     0
#define PAM_NOT_PRESENT 1
} PAC;
```

Copyright 1989 Logic Modeling Systems

| HEADER FILE | DATE | 5/23/89 | PAGE # |
|---|---|---|---|
| include/pac_def.h | TIME | 1:20:22 pm | 1/63 |

LINE # HEADER TEXT

```
/* SCCS_ID: pac_def.h rev 3.1, 4/24/89 at 07:34:30 */

/*************************************************************************
 *      pac_def.h                                                        *
 *                                                                       *
 *      definitions, macros, and structures                              *
 *      used in PAC diagnostics                                          *
 *                                                                       *
 ************************************************************************/

/* PAC information table */
typedef struct
{
  int exists,            /* TRUE or FALSE */
  u_long lane_offset;
  int num_pams;
  int pam_size[4];
  int num_blocks;
  int num_patterns;
} PAC_INFO;

/*************************************************************************
 * Pattern word structure                                                *
 *                                                                       *
 * pattern bits 79..64 = PAT_WORD.pattern.data[0] \ PAT_WORD.mem_bank[0] *
 * pattern bits 63..48 = PAT_WORD.pattern.data[1] /                      *
 *                                                                       *
 * pattern bits 47..32 = PAT_WORD.pattern.data[2] \ PAT_WORD.mem_bank[1] *
 * pattern bits 31..16 = PAT_WORD.pattern.data[3] /                      *
 *                                                                       *
 * pattern bits 15..0  = PAT_WORD.pattern.data[4] \ PAT_WORD.mem_bank[2] *
 * control bits 15..0  = PAT_WORD.pattern.control /                      *
 *                                                                       *
 ************************************************************************/
typedef union
{
  u_long mem_bank[3];
  struct
  {
    u_short data[5];
    unsigned backplane_spare     : 2;
    unsigned pac_spare           : 3;
    unsigned branch              : 2;
    unsigned stop                : 1;
    unsigned user                : 1;
    unsigned pel_control         : 3;
    unsigned pel_address         : 4;
  } pattern;
} PAT_WORD;

/* PAC defines */
#define PATTERNS_IN_2M (2 << 20)
#define PATTERNS_IN_512K (512 << 10)
#define PATTERNS_IN_128K (128 << 10)
#define BLOCK_SIZE 256
#define BLKS_IN_2M (PATTERNS_IN_2M / BLOCK_SIZE)
#define BLKS_IN_512K (PATTERNS_IN_512K / BLOCK_SIZE)
#define BLKS_IN_128K (PATTERNS_IN_128K / BLOCK_SIZE)
#define BRANCH_LATENCY 27
#define MAX_BRANCHES ((BLOCK_SIZE - (BRANCH_LATENCY - 1)) / 2)
#define STOP_LATENCY 4
#define STOP 0x0100
#define BRANCH_ALWAYS 0x0200
#define BRANCH_FALLING 0x0400
#define BRANCH_RISING 0x0600
#define TRIGGER 0x0080
#define NOP_MASK (u_long)(~(STOP | BRANCH_RISING | TRIGGER))
#define PAM_ID_SPACE 0x0100
#define LOOP_MODE 1
#define STOP_MODE 0
#define FIRST_BLOCK 0
#define PAC_MAX_PERIOD 7900     /* 128 kHz (actually 126.582 kHz) */
#define PAC_MIN_PERIOD 38                 /* 25 MHz (actually 26.3 MHz) */

/* CPU access (read/write) macros */

/*      macro Write_long(X, Y)
 *
 *      INPUT:  X = pattern memory long address
 *              Y = 32-bit data word
 *      OUTPUT: none
 *      DESCRIPTION: Performs long word pattern memory write
 *      operation.
 */
#define Write_long(X, Y)  (*(u_long *)(X) = (Y))

/*      macro Write_word(X, Y)
 *
 *      INPUT:  X = pattern memory word address
 *              Y = 16-bit data word
 *      OUTPUT: none
 *      DESCRIPTION: Performs word pattern memory write
 *      operation.
 */
#define Write_word(X, Y)  (*(u_short *)(X) = (Y))

/*      macro Read_long(X)
 *
 *      INPUT:  X = pattern memory long address
 *      OUTPUT: long data value
 *      DESCRIPTION: Performs long word pattern memory read
 *      operation.
 */
#define Read_long(X)  (*(u_long *)(X))

/*      macro Read_word(X)
 *
 *      INPUT:  X = pattern memory long address
 *      OUTPUT: short data value
 *      DESCRIPTION: Performs word pattern memory read
 *      operation.
 */
#define Read_word(X)  (*(u_short *)(X))


/* Other PAC/PAM macros */

/*      macro Clear_pac_errors(X)
 *
 *      INPUT:  X = lane number (0, 1, 2, or 3)
```

Copyright 1989 Logic Modeling Systems

HEADER FILE include/pac_def.h | DATE 5/23/89 | TIME 1:20:22 pm | PAGE # 2/64

HEADER TEXT

```
 *      OUTPUT: none
 *      DESCRIPTION: Clears PAC error registers in specified lane.
 */
#define Clear_pac_errors(X)  (pacptr[X]->parity_error = 0)

/* Random number generation definitions */

#define TAP_MASK ((1 << 0) | (1 << 1) | (1 << 2) | (1 << 4) | (1 << 6))
#define MS_TAP (1 << 31)

/*      macro Pac_get_random(X)
 *
 *      INPUT:  X = 32-bit random number
 *      OUTPUT: next 32-bit random number
 *      DESCRIPTION: Generates next 32-bit pseudorandom number
 *      based on current random number.
 */
#define Pac_get_random(X)       (((X)&MS_TAP)?(((X)^TAP_MASK)<<1)|1:(X)<<1)


/*      macro Address_to_pattern(X)
 *
 *      INPUT:  X = 32-bit pattern memory address
 *      OUTPUT: 32-bit pattern number
 *      DESCRIPTION: Converts address to pattern number.
 */
#define Address_to_pattern(X)   ((int)(((X))>>2) & ~(0x3f << 24)))


/*      macro Pattern_to_address(X,Y,Z)
 *
 *      INPUT:  X = lane number
 *              Y = bank number
 *              Z = 32-bit pattern number
 *      OUTPUT: 32-bit pattern memory address
 *      DESCRIPTION: Converts pattern number to address.
 */
#define Pattern_to_address(X,Y,Z)       (pac[(X)].lane_offset +\
                                        ((Y) * PAT_MEM_BANK) + ((Z) << 2))


/*      macro Pam_base_address(X,Y)
 *
 *      INPUT:  X = lane number
 *              Y = pam number
 *      OUTPUT: 32-bit pattern memory address
 *      DESCRIPTION: Computes pattern memory base address (bank 0)
 *      for specified Pattern Memory Board.
 */
#define Pam_base_address(X,Y)   (Pattern_to_address((X), 0,\
                                (pac_get_first_pattern_no((X), (Y)))))


/*      macro Pac_set_parity(X,Y)
 *
 *      INPUT:  X = lane number
 *              Y = SET_ODD_PARITY or SET_EVEN_PARITY
 *      OUTPUT: none
 *      DESCRIPTION: Configures both the high and the low
 *      word parity generators to compute the specified
 *      parity. Done for PAC in lane X.
 */
#define Pac_set_parity(X,Y) (pacptr[(X)]->high_word_parity = (Y),\
                            pacptr[(X)]->low_word_parity = (Y))


/*      macro Pac_parity_address(X)
 *
 *      INPUT:  X = lane number
 *      OUTPUT: none
 *      DESCRIPTION: Computes address of parity error based
 *      on value latched in parity error address register.
 */
#define Pac_parity_address(X) (pac[(X)].lane_offset +\
                              (pacptr[(X)]->parity_error_address << 2))


/*      macro Pac_clock_speed(X,Y)
 *
 *      INPUT:  X = lane number
 *              Y = clock period in nanoseconds
 *      OUTPUT: none
 *      DESCRIPTION: Sets Pattern Controller clock speed register
 *      based on clock period.
 */
#define Pac_clock_speed(X,Y) (pacptr[(X)]->clock_speed = ((Y) > 1000) ?\
                             BELOW_1MHZ : ABOVE_1MHZ)



#define MIN_TIMEOUT     10      /* Min timeout of 10 ms */

/*      macro Timeout(X)
 *
 *      INPUT:  X = expected duration of pattern play in ms
 *      OUTPUT: none
 *      DESCRIPTION: Computes pattern play time-out (expected time multiplied
 *      by two, or min timeout).
 */
#define Timeout(X) ((((X) << 1) > MIN_TIMEOUT) ? (X) << 1 : MIN_TIMEOUT)
```

Copyright 1989 Logic Modeling Systems

HEADER FILE include/pel.h | DATE 5/23/89 | TIME 1:20:23 pm | PAGE # 1/65

LINE # HEADER TEXT

```
/* SCCS_ID: pel.h rev 3.1, 4/24/89 at 07:34:33 */

#define EMPTY_128_BYTES unsigned \
        :32, :32, :32, :32, :32, :32, :32, :32, :32, :32, \
        :32, :32, :32, :32, :32, :32, :32, :32, :32, :32, \
        :32, :32, :32, :32, :32, :32, :32, :32, :32, :32, \
        :32, :32;

#define EMPTY_192_BYTES unsigned \
        :32, :32, :32, :32, :32, :32, :32, :32, :32, :32, \
        :32, :32, :32, :32, :32, :32, :32, :32, :32, :32, \
        :32, :32, :32, :32, :32, :32, :32, :32, :32, :32, \
        :32, :32, :32, :32, :32, :32, :32, :32, :32, :32, \
        :32, :32, :32, :32, :32, :32, :32, :32;

#define EMPTY_224_BYTES EMPTY_192_BYTES unsigned :32, :32, :32, :32, :32, :32, :32, :32;
#define EMPTY_248_BYTES EMPTY_224_BYTES unsigned :32, :32, :32, :32, :32, :32;
#define EMPTY_252_BYTES EMPTY_248_BYTES unsigned :32;
#define EMPTY_256_BYTES EMPTY_252_BYTES unsigned :32;

typedef struct  {
        MAGIC_CHIP      magic_chip[5];

        unsigned char empty1[3], vlogl_dac;
        unsigned char empty2[3], vlogh_dac;
        EMPTY_248_BYTES

        unsigned char empty3[3], vlth_dac;
        unsigned char empty4[3], val_dac;
        EMPTY_248_BYTES

        unsigned char empty5[3], vhth_dac;
        unsigned char empty6[3], vsh_dac;
        EMPTY_248_BYTES

        unsigned char empty7[3], vlogl_adc;
        unsigned char empty8[3], vlogh_adc;
        unsigned char empty9[3], vlth_adc;
        unsigned char empty10[3], val_adc;
        unsigned char empty11[3], vhth_adc;
        unsigned char empty12[3], vsh_adc;
        unsigned char empty13[3], vcc_adc;
        unsigned char empty14[3], signal_adc;
        EMPTY_224_BYTES

        union {
            struct {
                    unsigned :24, data:8;
            } id_prom[32];
            unsigned long longprom[32];
        }idprom;
        EMPTY_128_BYTES

        unsigned :16;
        union {
                unsigned short reg;
                struct {
                        unsigned :2,
                                magic_errorL:1,
                                play_errorL:1,
                                errorL:1,
                                present:1,
                                active:1,
                                eeprom_out:1,
                                eeprom_sel:1,
                                eeprom_clk:1,
                                eeprom_in:1,
                                initialize:1,
                                magic_error_enableL:1,
                                private:1,
                                resetL:1,
                                in_use_led:1;
                } bit;
        } car;
        EMPTY_252_BYTES

        /* Devices 11-15: exist but are not to be used */
        EMPTY_256_BYTES
        EMPTY_256_BYTES
        EMPTY_256_BYTES
        EMPTY_256_BYTES
        EMPTY_256_BYTES
} PEL;

#define LANE_OFFSET     0x80000000
#define PEL_OFFSET      0x0D000000
#define PEL_SIZE        0x00001000
#define PEL_CSR         0x00000A00

#define pel_addr(lane, pel)     (LANE_OFFSET + lane * LANE_SIZE + PEL_OFFSET + pel * PEL_SIZE)

#define NO_DAB          1
#define DIAG_DAB        2
#define SPECIAL_DAB     4
#define UNKNOWN_DAB     8
#define NEED_PAC        16

#define PUBLIC_DAB      0
#define PRIVATE_DAB     1

#define VERBOSE         -1
#define NOT_VERBOSE     0

extern int current_pel;
extern int current_pel;

extern int dab_type;

extern int verbosity;
```

Copyright 1989 Logic Modeling Systems

| HEADER FILE | DATE 5/23/89 | PAGE # |
| --- | --- | --- |
| include/protans.h | TIME 1:20:23 pm | 1/66 |

LINE # HEADER TEXT

```
/* SCCS_ID: protans.h rev 3.1, 4/24/89 at 07:34:37 */

/* BEGIN_CONST_DECL */

#define READ_ANS                  3
#define WRITE_ANS                 5

#define CREATE_DEF_ANS            7
#define CREATE_INSTANCE_ANS       9
#define CREATE_FAULT_ANS          11

#define RELEASE_DEF_ANS           13
#define RELEASE_INSTANCE_ANS      15
#define RELEASE_FAULT_ANS         17

#define EVAL_ANS                  19

#define SAVE_DEF_ANS              21
#define SAVE_PTRN_ANS             23
#define SAVE_PTRN_CONT_ANS        25
#define RESTORE_INST_ANS          27
#define RESTORE_PTRN_ANS          29
#define PTRN_HIST_ANS             31

#define INQ_MODELER_ANS           33
#define INQ_USER_LIST_ANS         35
#define INQ_USER_ANS              37
#define INQ_LANE_ANS              39
#define INQ_PAM_ANS               41
#define INQ_PEL_ANS               43
#define INQ_DEVICE_LIST_ANS       45
#define INQ_DEVICE_NAME_ANS       47
#define INQ_DEVICE_ANS            49
#define INQ_DAB_ANS               51
#define INQ_DAB_LOC_ANS           53
#define INQ_INSTANCE_ANS          55
#define INQ_FAULT_ANS             57

#define INQ_AVAIL_PTRN_ANS        59

#define TMEASUREMENT_ANS          61

#define EXTRACT_DEF_ANS           63

#define LOOP_PTRN_ANS             65

#define RESET_INST_ANS            67

#define TEST_NETWORK_ANS          69

#define ABORT_ANS                 71

#define BEGIN_SESSION_ANS         73

#define LABEL_DAB_ANS             75

#define EVAL_CONTROL_ANS          77

#define REBOOT_ANS                79
#define SHUTDOWN_ANS              81

#define CHECK_DABDEF_ANS          83

#define SAVE_DEF_CONT_ANS         85

#define PASSWORD_ANS              87

#define NO_SUCH_ANS               89

/* END_CONST_DECL */

#define DELAY_TABLE_COMPOSITE     0
#define DELAY_TABLE               1
#define MEASURED                  2

typedef struct {
   u_short pin_number;
   u_char  pin_value;
   u_short event_pin_number;
   u_char delay_type;      /* DELAY_TABLE_COMPOSITE, DELAY_TABLE, MEASURED */
   union {
      struct {                     /* delay_type == DELAY_TABLE_COMPOSITE */
         u_long min_delay;
         u_long typ_delay;
         u_long max_delay;
      } OPC_delay_table_composite;
      long delay_table_index;      /* delay_type == DELAY_TABLE */
      struct {                     /* delay_type == MEASURED    */
         u_long min_delay;
         u_long max_delay;
      } OPC_measured;
   } OPC_union;
} OUTPUT_PIN_CHANGE;

typedef struct {
   u_char          error_type;
   char            error_msg[1];
} ERROR;

typedef struct {
   u_long                 error_count;
   union {
      ERROR               error_el[1];
      struct {
         u_short          defn_id;
         u_char           use_default;
         u_char           report_miss;
         MIN_TYP_MAX      default_delay;
         u_long           mtym_count;
         MIN_TYP_MAX      delay_table[1];
         u_long           pin_count;
         u_short          pin_number;
         u_short          pin_class;    /* DATA, EVAL, STORE */
         u_short          pin_type;     /* NONE, IN, OUT, IO */
         char             pin_name[1];
         char             pin_number_str[1];
         char             pin_alias[1];
      } CDA_struct;
   } CDA_union;
} create_def_ans;
```

Copyright 1989 Logic Modeling Systems

HEADER FILE include/protans.h

DATE 5/23/89 TIME 1:20:23 pm PAGE # 2/67

LINE # HEADER TEXT

```
typedef struct {
   u_short    pin_number;
   u_char     pin_value;
} INIT_PIN_VALUE;

typedef struct {
   u_long          error_count;
   union {
      ERROR        error_el[1];
      struct {
         u_short          instance_id;
         u_short          output_count;
         INIT_PIN_VALUE   init_pin_value[1];
      } CIA_struct;
   } CIA_union;
} create_instance_ans;

typedef struct {
   u_long          error_count;
   union {
      ERROR        error_el[1];
      u_short          fault_id;
   } CFA_union;
} create_fault_ans;

typedef struct {
   u_long          error_count;
   ERROR           error_el[1];
} release_def_ans;

typedef struct {
   u_long          error_count;
   ERROR           error_el[1];
} release_instance_ans;

typedef struct {
   u_long          error_count;
   ERROR           error_el[1];
} release_fault_ans;

typedef struct {
   u_long          error_count;
   union {
      ERROR        error_el[1];
      struct {
         u_short  output_count;
         OUTPUT_PIN_CHANGE output_list[1];
      } EA_struct;
   } EA_union;
} eval_ans;

typedef struct {
   u_long          error_count;
   union {
      ERROR        error_el[1];
      struct {
         u_long device_pattern_count;
         u_char definition[1];
      } SDA_struct;
   } SDA_union;
} save_def_ans;

typedef struct {
   u_long          error_count;
   union {
      ERROR        error_el[1];
      struct {
         u_char definition[1];
      } SDCA_struct;
   } SDCA_union;
} save_def_cont_ans;

typedef struct {
   u_long                      error_count;
   union {
      ERROR                    error_el[1];
      struct {
         u_char                unit_count;
         u_long                total_device_ptrn_count;
                                  /* # of actual user's ptrns */
         u_long                common_ptrn_count;
                                  /* # of common device ptrns for fault seq */
         u_char                check_input_x_count;
         u_char                first_eval;
         u_char                sample_count;
         u_long                evaluation_count;
         u_char                purge_on_next_eval;
         u_char                has_history;
         u_char                use_2_bit_per_pin;
         u_char                enable_timing_meas;
         u_short               pin_count;
         struct {
            u_short            pin_number;
            u_char             old_raw;
            u_char             old_filtered;
            u_char             new_raw;
            u_char             new_filtered;
            u_long             sim_time;
         }  pin_info_array[1];
         u_long                pattern_count_follows;
         PTRN_BITS_LONGWORD  ptrn_loaded;
         PTRN_BITS_LONGWORD  hmdenb_loaded;
         PTRN_BITS_LONGWORD  lcychdb_loaded;
         PTRN_BITS_LONGWORD  lcycmdb_loaded;
         PTRN_BITS_LONGWORD  last_consistent_set;
         PTRN_BITS_LONGWORD  sim_pin_value_data;
         PTRN_BITS_LONGWORD  sim_pin_value_hiz;
         PTRN_BITS_LONGWORD  sim_pin_value_unk;
         PTRN_BITS_LONGWORD  sim_pin_value_soft;
         PTRN_BITS_LONGWORD  last_sample_val_data;
         PTRN_BITS_LONGWORD  last_sample_val_hiz;
         PTRN_BITS_LONGWORD  last_sample_val_unk;
         PTRN_BITS_LONGWORD  last_sample_val_soft;
         PTRN_BITS_LONGWORD  pattern;
      } SPA_struct;
   } SPA_union;
} save_ptrn_ans;

typedef struct {
```

Copyright 1989 Logic Modeling Systems

HEADER FILE include/protans.h | DATE 5/23/89 | TIME 1:20:23 pm | PAGE # 3/68

HEADER TEXT

```
    u_long                      error_count;
    union {
        ERROR                   error_el[1];
        struct {
            u_long              pattern_count_follows;
            PTRN_BITS_LONGWORD  pattern;
        } SPCA_struct;
    } SPCA_union;
} save_ptrs_count_ans;

typedef struct {
    u_long          error_count;
    ERROR           error_el[1];
} restore_inst_ans;

typedef struct {
    u_long          error_count;
    ERROR           error_el[1];
} restore_ptrs_ans;

typedef struct {
-   u_long          error_count;
    ERROR           error_el[1];
} ptrs_hist_ans;

typedef struct {
    u_long          error_count;
    ERROR           error_el[1];
} inq_modeler_ans;

typedef struct {
    u_long              error_count;
    union {
        ERROR           error_el[1];
        struct {
            u_long      user_count;
            u_long      user_id[1];
            char        hostname[1];
            char        username[1];
        } IULA_struct;
    } IULA_union;
} inq_user_list_ans;

typedef struct {
    u_long          error_count;
    union {
        ERROR       error_el[1];
        u_long      value;
    } IUA_union;
} inq_user_ans;

typedef struct {
    u_long          error_count;
    union {
        ERROR       error_el[1];
        u_long      value;
    } ILA_union;
} inq_lane_ans;

typedef struct {
    u_long          error_count;
    union {
        ERROR       error_el[1];
        u_long      value;
    } IPA_union;
} inq_pam_ans;

typedef struct {
    u_long          error_count;
    union {
        ERROR       error_el[1];
        u_long      value;
    } IPA_union;
} inq_pal_ans;

typedef struct {
    u_long          error_count;
    union {
        ERROR       error_el[1];
        struct {
            u_long  device_count;
            u_long  device_number[1];
            char    device_name[1];
        } IDLA_struct;
    } IDLA_union;
} inq_device_list_ans;

typedef struct {
    u_long          error_count;
    union {
        ERROR       error_el[1];
        char        part_name[1];
    } IDNA_union;
} inq_device_name_ans;

typedef struct {
    u_long          error_count;
    union {
        ERROR       error_el[1];
        u_long      value;
    } IDA_union;
} inq_device_ans;

typedef struct {
    u_long          error_count;
    union {
        ERROR       error_el[1];
        char        string[1];
    } IDA_union;
} inq_dab_ans;

typedef struct {
    u_long                  error_count;
    union {
        ERROR               error_el[1];
        struct {
            u_long          location_count;
            struct {
                u_long      lane;
                u_long      slot;
```

Copyright 1989 Logic Modeling Systems

HEADER FILE include/protans.h DATE 5/23/89 TIME 1:20:23 pm PAGE # 4/69

HEADER TEXT

```
            } lane_slot[1];
        } IDLA_struct;
    } IDLA_union;
} inq_dab_loc_ans;

typedef struct {
    u_long          error_count;
    union {
        ERROR       error_el[1];
        u_long      value;
    } IIA_union;
} inq_instance_ans;

typedef struct {
    u_long          error_count;
    union {
        ERROR       error_el[1];
        u_long      value;
    } IFA_union;
} inq_fault_ans;

typedef struct {
    u_long          error_count;
    union {
        ERROR       error_el[1];
        u_long      value;
    } IFA_union;
} inq_avail_ptrs_ans;

typedef struct {
    u_long          error_count;
    ERROR           error_el[1];
} tmeasurement_ans;

typedef struct {
    u_long          error_count;
    union {
        ERROR       error_el[1];
        char        definition_text[1];
    } EDA_union;
} extract_def_ans;

typedef struct {
    u_long          error_count;
    ERROR           error_el[1];
} loop_ptrs_ans;

typedef struct {
    u_long          error_count;
    union {
        ERROR       error_el[1];
        struct {
            u_short         output_count;
            INIT_PIN_VALUE  init_pin_value[1];
        } RIA_struct;
    } RIA_union;
} reset_inst_ans;

typedef struct {
    u_long          total_number;
    u_long          number[1];
    u_long          checksum;
} test_network_ans;

typedef struct {
    u_long          error_count;
    ERROR           error_el[1];
} abort_ans;

typedef struct {
    u_long          error_count;
    ERROR           error_el[1];
} begin_session_ans;

typedef struct {
    u_long          error_count;
    ERROR           error_el[1];
} label_dab_ans;

typedef struct {
    u_long          error_count;
    ERROR           error_el[1];
} eval_control_ans;

typedef struct {
    u_long          error_count;
    ERROR           error_el[1];
} reboot_ans;

typedef struct {
    u_long          error_count;
    ERROR           error_el[1];
} shutdown_ans;

typedef struct {
    u_long          error_count;
    ERROR           error_el[1];
} check_dabdef_ans;

typedef struct {
    u_long          error_count;
    ERROR           error_el[1];
} password_ans;

/* Define a structure for version number and simulator type */

#ifdef VMS

typedef union {
    struct {
        unsigned            sim_type:10;
        unsigned            reserved:6;
        unsigned            minor:8;
        unsigned            Major:8;
    }                   field;
    unsigned long       Version;
}                   version_type;

#else
#ifdef PC386
```

Copyright 1989 Logic Modeling Systems

| HEADER FILE | DATE | PAGE # |
|---|---|---|
| include/protans.h | 5/23/89 | 5/70 |
| | TIME 1:20:23 pm | |

LINE # HEADER TEXT

```
typedef union {
    struct {
        unsigned            sim_type:10;
        unsigned            reserved:6;
        unsigned            minor:8;
        unsigned            Major:8;
    }                   field;
    unsigned long       Version;
}                   version_type;

#else

typedef union {
    struct {
        unsigned            Major:8;
        unsigned            minor:8;
        unsigned            reserved:6;
        unsigned            sim_type:10;
    }                   field;
    unsigned long       Version;
}                   version_type;

#endif
#endif

/* Define a mask to extract sym_type */
#define SIM_TYPE_MASK 0x3FF
```

Copyright 1989
Logic Modeling Systems

| HEADER FILE | DATE | PAGE # |
|---|---|---|
| include/protcmd.h | 5/23/89 | 1/71 |
| | TIME 1:20:23 pm | |

LINE # HEADER TEXT

```
/* SCCS_ID: protcmd.h rev 3.1, 4/24/89 at 07:34:40 */

/* BEGIN_CONST_DECL */
#define READ_CMD                2
#define WRITE_CMD               4

#define CREATE_DEF_CMD          6
#define CREATE_INSTANCE_CMD     8
#define CREATE_FAULT_CMD        10

#define RELEASE_DEF_CMD         12
#define RELEASE_INSTANCE_CMD    14
#define RELEASE_FAULT_CMD       16

#define EVAL_CMD                18

#define SAVE_DEF_CMD            20
#define SAVE_PTRN_CMD           22
#define SAVE_PTRN_CONT_CMD      24
#define RESTORE_INST_CMD        26
#define RESTORE_PTRN_CMD        28
#define PTRN_HIST_CMD           30

#define INQ_MODELER_CMD         32
#define INQ_USER_LIST_CMD       34
#define INQ_USER_CMD            36
#define INQ_LANE_CMD            38
#define INQ_PAM_CMD             40
#define INQ_PEL_CMD             42
#define INQ_DEVICE_LIST_CMD     44
#define INQ_DEVICE_NAME_CMD     46
#define INQ_DEVICE_CMD          48
#define INQ_DAB_CMD             50
#define INQ_DAB_LOC_CMD         52
#define INQ_INSTANCE_CMD        54
#define INQ_FAULT_CMD           56

#define INQ_AVAIL_PTRN_CMD      58

#define TMEASUREMENT_CMD        60

#define EXTRACT_DEF_CMD         62

#define LOOP_PTRN_CMD           64

#define RESET_INST_CMD          66

#define TEST_NETWORK_CMD        68

#define ABORT_CMD               70

#define BEGIN_SESSION_CMD       72

#define LABEL_DAB_CMD           74

#define EVAL_CONTROL_CMD        76

#define REBOOT_CMD              78
#define SHUTDOWN_CMD            80

#define CHECK_DABDEF_CMD        82

#define SAVE_DEF_CONT_CMD       84

#define PASSWORD_CMD            86

#define NO_SUCH_CMD             88

/* END_CONST_DECL */

typedef struct {
   u_short pin_number;
   u_long  sim_time;
   u_char  value;
} INPUT_PIN_CHANGE;

typedef struct {
   u_long number;
   long   units;
   char definition_text[1];
} create_def_cmd;

typedef struct {
   u_short def_id;
   char    device_info_string[1];
} create_instance_cmd;

/* common_ptrn_count == -1 means that this fault should branch from whatever
 * pattern the associated instance currently has.
 * common_ptrn_count == positive number means that this fault should branch
 * from this pattern number of the associated instance. This is used in the
 * restore fault.
 */
typedef struct {
   u_short inst_id;
   long    common_ptrn_count;
} create_fault_cmd;

typedef struct {
   u_short def_id;
} release_def_cmd;

typedef struct {
   u_short inst_id;
} release_instance_cmd;

typedef struct {
   u_short fault_id;
   u_short inst_id;
} release_fault_cmd;

typedef struct {
   u_short inst_id;
   u_short data_pin_count;
   u_short eval_pin_count;
   u_short store_pin_count;
   INPUT_PIN_CHANGE data_pin_list[1];
   INPUT_PIN_CHANGE eval_pin_list[1];
   INPUT_PIN_CHANGE store_pin_list[1];
} eval_cmd;
```

Copyright 1989
Logic Modeling Systems

HEADER FILE include/protcmd.h | DATE 5/23/89 | TIME 1:20:23 pm | PAGE # 2/72

LINE # | HEADER TEXT

```
typedef struct {
   u_short def_id;
} save_def_cmd;

typedef struct {
   u_long no_parameters_needed;
} save_def_cont_cmd;

typedef struct {
   u_short inst_id;
} save_ptrn_cmd;

typedef struct {
   u_short inst_id;
} save_ptrn_cont_cmd;

typedef struct {
   u_short inst_id;
   u_char  check_input_x_count;
   u_char  first_eval;
   u_char  sample_count;
   u_long  evaluation_count;
   u_char  purge_on_next_eval;
   u_char  has_history;
   u_char  use_2_bit_per_pin;
   u_char  enable_timing_meas;
   u_short pin_count;
   struct {
      u_short  pin_number;
      u_char   old_raw;
      u_char   old_filtered;
      u_char   new_raw;
      u_char   new_filtered;
      u_long   sim_time;
   } pin_info_array[1];
} restore_inst_cmd;

typedef struct {
   u_short            inst_id;
   u_long             unit_count;
   u_long             pattern_count_follows;
   PTRN_BITS_LONGWORD pattern;
} restore_ptrn_cmd;

typedef struct {
   u_short inst_id;
   u_char  command;
} ptrn_hist_cmd;

typedef struct {
   u_long attribute;
} inq_modeler_cmd;

typedef struct {
   u_long no_parameters;
} inq_user_list_cmd;

typedef struct {
   u_long user_number;
} inq_user_cmd;

typedef struct {
   u_long lane_number;
} inq_lane_cmd;

typedef struct {
   u_long lane_number;
   u_long pam_number;
   u_long attribute;
} inq_pam_cmd;

typedef struct {
   u_long lane_number;
   u_long slot_number;
   u_long attribute;
} inq_pel_cmd;

typedef struct {
   u_long no_parameters_needed;
} inq_device_list_cmd;

typedef struct {
   u_long device_number;
} inq_device_name_cmd;

typedef struct {
   u_long device_number;
   u_long attribute;
} inq_device_cmd;

typedef struct {
   u_long device_number;
   u_long dab_number;
   u_long attribute;
} inq_dab_cmd;

typedef struct {
   u_long device_number;
   u_long dab_number;
} inq_dab_loc_cmd;

typedef struct {
   u_short inst_id;
   u_long  attribute;
} inq_instance_cmd;

typedef struct {
   u_short fault_id;
   u_long  attribute;
} inq_fault_cmd;

typedef struct {
   u_short def_id;
} inq_avail_ptrn_cmd;

typedef struct {
   u_short inst_id;
   u_char  on_or_off;
} tmeasurement_cmd;
```

Copyright 1989
Logic Modeling Systems

| HEADER FILE | DATE 5/23/89 | PAGE # |
|---|---|---|
| include/protcmd.h | TIME 1:20:23 pm | 3/73 |

LINE # HEADER TEXT

```
typedef struct {
    u_short definition_id;
} extract_def_cmd;

typedef struct {
    u_short inst_id;
    u_long loop_time;
} loop_ptrs_cmd;

typedef struct {
    u_short inst_id;
} reset_inst_cmd;

typedef struct {
    u_long     total_number;
    u_long     number[1];
    u_long     checksum;
} test_network_cmd;

typedef struct {
    u_long     no_parameter_needed;
} abort_cmd;

typedef struct {
    u_char     sim_type;
    char       hostname[1];
    char       username[1];
} begin_session_cmd;

typedef struct {
    u_char     laneno;
    u_char     slotno;
    u_char     dab_type[1];            /* NULL terminated string */
    u_char     device_name[1];         /* NULL terminated string */
    u_char     manufacturer[1];        /* NULL terminated string */
    u_char     revision[1];            /* NULL terminated string */
    u_char     lanes_high;
    u_char     slots_wide;
    u_char     segment_number;
} label_dab_cmd;

typedef struct {
    u_short inst_or_fault_id;
    u_long  attribute;
    u_long  value;
} eval_control_cmd;

typedef struct {
    u_char flag;
    u_long seconds;
} reboot_cmd;

typedef struct {
    u_char flag;
    u_long seconds;
} shutdown_cmd;

typedef struct {
    char definition_text[1];
} check_dabdef_cmd;

typedef struct {
    u_long attribute;
    char   password[1];
} password_cmd;
```

Copyright 1989
Logic Modeling Systems

| HEADER FILE | DATE | PAGE # |
|---|---|---|
| include/strng.h | 5/23/89 | 1/74 |
| | TIME 1:20:23 pm | |

LINE # HEADER TEXT

```
/* SCCS_ID: strng.h rev 1.1, 4/24/89 at 07:34:48    */

/*
 *  header file for String Module
 *
 *  types defined:
 *    typedef unsigned short symbol ;
 *      a symbol is an unsigned 16-bit number
 *  functions defined:
 *    void strinit ( ) ;
 *      initializes the string module data structures
 *    void strfree ( ) ;
 *      frees the string module data structures
 *    symbol strtosym ( str ) char *str ;
 *      takes string, returns its symbol number
 *    symbol strlook ( str ) char *str ;
 *      returns symbol number if already entered
 *    symbol strlast ( ) ;
 *      returns last symbol number entered
 *    char *symtostr ( sym ) symbol sym ;
 *      takes symbol number, returns its string
 *    void set_pin_name ( sym , name ) symbol sym ; unsigned short name ;
 *      set the pin_name field of the passed symbol to the passed name
 *    void set_pin_number ( sym , num ) symbol sym ; unsigned short num ;
 *      set the pin_number field of the passed symbol to the passed number
 *    void set_apin_name ( sym , name ) symbol sym ; unsigned short name ;
 *      set the apin_name field of the passed symbol to the passed name
 *    void set_apin_number ( sym , num ) symbol sym ; unsigned short num ;
 *      set the apin_number field of the passed symbol to the passed number
 *    void g_declare ( sym , T ) symbol sym ; tree T ;
 *      globally declare the passed symbol as the passed tree
 *    void l_declare ( sym , T ) symbol sym ; tree T ;
 *      locally declare the passed symbol as the passed tree
 *    unsigned short pin_name_of ( sym ) symbol sym ;
 *      returns the pin_name field of the passed symbol
 *    unsigned short pin_number_of ( sym ) symbol sym ;
 *      returns the pin_number field of the passed symbol
 *    unsigned short apin_name_of ( sym ) symbol sym ;
 *      returns the apin_name field of the passed symbol
 *    unsigned short apin_number_of ( sym ) symbol sym ;
 *      returns the apin_number field of the passed symbol
 *    tree g_lookup ( sym ) symbol sym ;
 *      returns the global declaration for the passed symbol
 *    tree l_lookup ( sym ) symbol sym ;
 *      returns the local declaration for the passed symbol
 *    tree lookup ( sym ) symbol sym ;
 *      returns the (localest) declaration for the passed symbol
 *    void strstat ( ) ;
 *      prints statistics about string module data structure
 *    void strdump ( ) ;
 *      dumps contents of string module data structure
 */

# define STATS 1 /* to include strstat and strdump */
# define NULLSYM 0 /* non-null symbols are 1 or more */

typedef unsigned short symbol ;

void
# ifdef STATS
  strstat ( ) ,
  /*strdump ( ) ,*/
# endif /* STATS */
  strinit ( ) ,
  strfree ( ) ,
  set_pin_name ( ) ,
  set_pin_number ( ) ,
  set_apin_name ( ) ,
  set_apin_number ( ) ,
  g_declare ( ) ,
  l_declare ( ) ,
  set_xtra ( ) ;
symbol
  strtosym ( ) ,
  strlook ( ) ;
  /*strlast ( ) ;*/
char *symtostr ( ) ;
unsigned short
  pin_name_of ( ) ,
  pin_number_of ( ) ,
  apin_name_of ( ) ,
  apin_number_of ( ) ,
  g_lookup ( ) ,
  l_lookup ( ) ,
  /*lookup ( ) ,*/
  get_xtra ( ) ;

/* end of header file for String Module */
```

Copyright 1989
Logic Modeling Systems

| HEADER FILE | DATE | PAGE # |
|---|---|---|
| include/task.h | 5/23/89 | 1/75 |
| | TIME 1:20:23 pm | |

LINE # HEADER TEXT

```
/* SCCS_ID: task.h rev 3.1, 4/24/89 at 07:34:52      */

/*
** TASK.H
** Task related info.
*/

#define NOTIMEOUT        0L

/*
** task info
*/
/*
** Task ID's
*/
#define TRANSMIT_TASK_ID        40
#define PATTERN_TASK_ID         50
#define RECEIVE_TASK_ID         60
#define NET_BOOT_TASK_ID        70
#define SERIAL_TASK_ID          80
#define KEYBOARD_TASK_ID        90
#define HOUSEKEEPING_TASK_ID    100

/*
** Task Priority
*/
#define TRANSMIT_TASK_PRI       40
#define PATTERN_TASK_PRI        50
#define RECEIVE_TASK_PRI        60
#define NET_BOOT_TASK_PRI       70
#define SERIAL_TASK_PRI         80
#define KEYBOARD_TASK_PRI       90
#define HOUSEKEEPING_TASK_PRI   100

#define DIAG_KEYBOARD_TASK_PRI          30
#define DIAG_PATTERN_TASK_PRI           140
#define DIAG_RECEIVE_TASK_PRI           50
#define DIAG_SERIAL_TASK_PRI            60
#define DIAG_TRANSMIT_TASK_PRI          80
#define DIAG_HOUSEKEEPING_TASK_PRI      100
/*-------------------------------- END OF TASK.H --------------------------------*/
```

Copyright 1989
Logic Modeling Systems

| HEADER FILE | DATE | 5/23/89 | PAGE # |
|---|---|---|---|
| include/timer.h | TIME | 1:20:23 pm | 1/76 |

HEADER TEXT

```
/* SCCS_ID: timer.h rev 3.1, 4/24/89 at 07:34:55   */

/*
 *  Register offsets for 8254 on 1861 CPU bear
 */
#define TIMER_COUNTER0              0       /* Offset of timer counter 0 */
#define TIMER_COUNTER1              4       /* Offset of timer counter 1 */
#define TIMER_COUNTER2              8       /* Offset of timer counter 2 */
#define TIMER_CNTL_WORD             0xc     /* Offset of timer control word */

/*
 * Constants for use in 8254 timer control-word
 */
#define SELECT_TIMER_COUNTER0       0       /* control word, select timer 0 */
#define SELECT_TIMER_COUNTER1       1       /* control word, select timer 1 */
#define SELECT_TIMER_COUNTER2       2       /* control word, select timer 2 */

#define R_W_LSB_TIMER_CNTR          1       /* Read/write LSB only          */
#define R_W_MSB_TIMER_CNTR          2       /* Read/write MSB only          */
#define R_W_LSB_MSB_TIMER_CNTR      3       /* Read/write LSB then MSB      */

#define TIMER_MODE0                 0       /* Interrupt on terminal count  */
#define TIMER_MODE1                 1       /* Hardware retriggerable one-shot */
#define TIMER_MODE2                 2       /* Rate generator               */
#define TIMER_MODE3                 3       /* Square-wave mode             */
#define TIMER_MODE4                 4       /* Software-triggered strobe    */
#define TIMER_MODE5                 5       /* Hardware-triggered strobe    */

#define BINARY                      0       /* Count in binary              */
#define BCD                         1       /* Count in BCD                 */

/*
 *  Timer control-word structure
 */
typedef struct
{
        unsigned
        select_timer_counter:2,             /* SELECT_TIMER_COUNTER0/1/2    */
        R_W_timer_counter:2,                /* R_W_{LSB..MSB}_TIMER_CNTR    */
        timer_mode:3,                       /* TIMER_MODE0/1/2/3/4/5        */
        bcd:1,                              /* BINARY/BCD                   */
        pad:24;
} timer_control;

/*
 * Constants for use in 8254 timer read-back command
 */
#define READ_BACK_TIMER             3       /* Identifies read-back command */

#define READ_BACK_COUNT             1       /* ... of selected channel(s)   */
#define READ_BACK_STATUS            2       /* ... of selected channel(s)   */
#define READ_BACK_COUNT_AND_STATUS  0       /* ... of selected channel(s)   */

#define READ_TIMER0                 1       /* Identifies which channel(s)  */
#define READ_TIMER1                 2       /*  to read-back.  May be added */
#define READ_TIMER2                 4       /*  for multiple channels.      */

/*
 *  Read-back command structure
 */
typedef struct
{
        unsigned
        read_back:2,                        /* READ_BACK_TIMER              */
        count_status:2,                     /* READ_BACK_COUNT/STATUS       */
        counter:3,                          /* READ_TIMERx + ...            */
        zero:1,                             /* must be 0                    */
        pad:24;
} timer_status;

/*
 *  Constants for use in parsing 8254 timer read-back status
 */
#define OUT_HIGH                    1       /* Channel output is logic 1    */
#define OUT_LOW                     0       /* Channel output is logic 0    */

#define NULL_COUNT                  1       /* Counter hasn't loaded yet    */
#define NOT_NULL_COUNT              0       /* Counter has loaded           */

/*
 *  Read-back status structure
 */
typedef struct
{
        unsigned
        output:1,                           /* OUT_HIGH/OUT_LOW             */
        null_count:1,                       /* {NOT_}NULL_COUNT             */
        R_W_timer_counter:2,                /* R_W_{LSB/MSB}_TIMER_CNTR     */
        timer_mode:3,                       /* TIMER_MODE0/1/2/3/4/5        */
        bcd:1,                              /* BINARY/BCD                   */
        pad:24;
} counter_status;
```

Copyright 1989 Logic Modeling Systems

| HEADER FILE | DATE | PAGE # |
|---|---|---|
| include/tmg.h | 5/23/89 | 1/77 |
| | TIME 1:20:24 pm | |

LINE # HEADER TEXT

```
/* SCCS_ID: tmg.h rev 3.1, 4/24/89 at 07:34:58 */

/*
 * All registers are mapped ... very lane's address space.
 * However, software should r... to the TMG only at 0x8E000000.
 *
 * Except as noted, all bits in control registers 0 and 1 are set
 * to 0 on power up.
 *
 * * Differences between 1 and 2 bits per pin handling?
 *
 * ctc = Intel 8254 timer chip
 */

/* Global lane defines used for R4:lane_enable and R9:lane_intr */
#define LANE_A  0x1
#define LANE_B  0x2
#define LANE_C  0x4
#define LANE_D  0x8

typedef struct {
        /* Register 0 */
        unsigned :24,
                tmg_intr_clearL:1,      /* 0 clears timing gen. interrupt condition */
                backplane_error:1,      /* 1 drives error on backplane, 0 doesn't   */
                backplane_resetL:1,     /* 0 drives reset on backplane, 1 doesn't   */
                tmg_resetL:1,           /* 0 resets timing gen., 1 enables          */
                slow_clock_clearL:1,    /* 0 clears slow clock detector, 1 enables  */
                es_ff_clearL:1,         /* 0 clears all edge/sample FFs, 1 enables  */
                abort_pattern_play:1,   /* 1 aborts pattern play, auto clearing,    */
                                        /* use only as a very last resort.          */
                start_pattern_play:1;   /* 1 starts pattern play, auto clearing     */

        /* Register 1 */
        unsigned :24,
                slot_count:3,           /* pattern clocks (minus 1) per logical clock */
                ctc_intr_clearL:1,      /* 0 clears output, a 0->1 starts the ctc.  */
                ctc_intr_enable:1,      /* 1 enables, 0 disables                    */
                tmg_intr_enable:1,      /* 1 enables, 0 disables                    */
                lane_intr_enable:1,     /* 1 enables lane error interrupts, 0 dis-  */
                                        /* ables and clears flip flop latch on tmg. */
                pattern_intr_enable:1;  /* 1 enables pattern play interrupts, 0 dis- */
                                        /* ables and clears flip flop latch on tmg. */

        /*
         * Procedure for changing which clock is selected or changing the internal
         * clock frequency (i.e., changing the value of R6:clock_select, or
         * R2:pll_rate, or R3:pll_divisor).
         *
         *      - deassert R6:clock_enable
         *      - verify that the clock is off by polling R6:clock_on with timeout
         *        of 4 clocks @ 150KHz = 4*6.67us = 26.67us (should be implicit).
         *      - assert R6:clock_sync_clearL
         *      - change R6:clock_select, or R2:pll_rate, or R3:pll_divisor
         *      - deassert R6:clock_sync_clearL
         *      - assert R6:clock_enable
         */

        /* Register 2: phased lock loop rate
         *
         * Allowed values are: 1-129 -> 129 unique frequencies.
         * Setting to 1 yields 60MHz, setting to 129 yields 30MHz.
         * Software must load this register ASAP to allow for the most
         * possible settling time (i.e., fastest time to next pattern play).
         *
         * The equation for calculating the resultant pattern frequency is:
         *      given:  R = 1 to 129    (R2,0-7)
         *              D = 2 to 256    (R3,0-7)
         *              S = 1, 2, 4     (R7,3-5)
         *
         *      frequency = 60MHz * (257 - R)
         *                  -----------------
         *                      256*S*D
         *
         * Note that this is a general equation and can not be used across the
         * entire frequency range.  The desired pattern frequency must be divided
         * into the following three groups with the indicated restrictions on the
         * combinations of S and D.
         *
         * To get pattern clock rates between 150KHz and 30MHz:
         *      - choose source 0 from R7,3-5 (undivided phase loop output, S=1)
         *      - load R3,0-7 with k=255 to yield D=2 (to adjust the basic 60MHz
         *        phase locked loop output down to 30MHz)
         *      - adjust R=R2,0-7 to get the desired frequency as specified above
         *
         * To get pattern clock rates between 58.6KHz and 150KHz:
         *      - choose source 1 from R7,3-5 (divide by 2D phase loop output, S=2)
         *      - adjust R=R2,0-7 and D=R3,0-7 to get the desired frequency as
         *        specified above. FIXIT
         *
         * To get pattern clock rates between 29.3KHz and 58.6KHz:
         *      - choose source 2 from R7,3-5 (divide by 4D phase loop output, S=4)
         *      - load R3,0-7 with k=1 to yield D=256 (to adjust the basic 60MHz
         *        phase locked loop output down to 58.6KHz(=60MHz/4*256))
         *      - adjust R=R2,0-7 to get the desired frequency as specified above
         */
        unsigned :24,
                pll_rate:8;             /* Initialized to 128 on power up.          */

        /* Register 3: phased lock loop divisor
         *
         * Software sets R3:pll_divisor to numbers k = 1 upto 255.  This yields:
         *      divisor = D = 256 - (k - 1) = 256 downto 2.
         * Note that the minimum divisor, D, is 2 - not 1.
         */
        unsigned :24,
                pll_divisor:8;          /* Initialized to 128 on power up.          */
                                        /* NOTE: see above restriction on changing. */

        /* Register 4 */
        unsigned :24,
                sample_delay_range:2,   /* nominal 0.5, 1, 2, 4ns delay ranges   */
                edge_delay_range:2,     /* nominal 0.5, 2, 10, 50ns delay ranges */
                lane_enable:4;          /* choice of lanes to play patterns to,  */
                                        /* see #defines above.                   */

/* R4:*_delay_range */
#define RANGE_0_5       0       /* These defines are the nominal range that will */
#define RANGE_2         1       /* vary by 1% to 2%.  The actual ns/step is cal-  */
#define RANGE_10        2       /* culated at power up and used in all subsequent */
```

Copyright 1989 Logic Modeling Systems

HEADER FILE include/tmg.h

DATE 5/23/89 TIME 1:20:24 pm PAGE # 2/78

LINE # HEADER TEXT

```
#define RANGE_50          3          /* calculations.                          */

        /* Register 5 */
        unsigned :24,
                test_mode:2,
                delay_clock_delay:6;

/* R5:test_mode */
#define NO_TEST                  0          /* normal (no test)                      */
#define SINGLE_TRIGGER           1          /* single edge and single sample trigger */
#define DOUBLE_TRIGGER           2          /* double edge and single sample trigger */
#define SAMPLE_TRIGGER_ONLY      3          /* sample trigger only                   */

        /* Register 6 */
        unsigned :24,
                clock_sync_clearL:1,        /* 0 force sync clear, 1 don't force      */
                clock_enable:1,             /* 1 enables clock, 0 disables clock      */
                clock_select:3,             /* Select 1 of 5 clocks for pattern presen- */
                                            /* tation, also tells which clock is selected. */
                                            /* NOTE: see above restriction on changing. */
                sample_mode:1,
                ramp_dump_delay:2;

/* R6:clock_select */
#define INT_CLOCK_1     0      /* phased lock loop output divided by S where S=1   */
#define INT_CLOCK_2     1      /* phased lock loop output divided by S*D where S=2 */
#define INT_CLOCK_4     2      /* phased lock loop output divided by S*D where S=4 */
#define EXT_CLOCK_0     3      /* external clock 0                                 */
#define EXT_CLOCK_1     4      /* external clock 1                                 */

        /* Register 7
         * Sample width in units of the pattern clock.  This sets the 5-state sample
         * time (i.e., the falling edge of the sample signal that is sent out on the
         * backplane).  Software must guarantee that the placement of this edge is
         * beyond the rising edge of the sample signal which is derived from the ramp
         * generator (R23:sample_delay in units of R4:sample_delay_range).
         */
        unsigned :24,
                sample_width:8;             /* Load with the desired clock width minus 1 */

        /* Register 8: read only */
        unsigned :24,
                :4,                         /* always read as 1s                      */
                backplane_mode:1,           /* 1 pattern mode, 0 CPU access mode      */
                pll_locked:1,               /* 1 locked, 0 not locked                 */
                slow_clock:1,               /* cleared by R0:slow_clock_clearL        */
                clock_on:1;                 /* 1 if on and sync'd, 0 if off or not sync'd */

        /* Register 9: read only */
        unsigned :24,
                :1,                         /* always read as 1                       */
                pattern_intr:1,             /* poll for end of pattern play           */
                                            /* R1:pattern_intr_enable                 */
                ctc_intr:1,                 /* R1:ctc_intr_enable and R1:ctc_intr_clear */
                tmg_intr:1,                 /* R0:tmg_intr_clear, R1:tmg_intr_enable  */
                                            /* and error condition latches R11 and R12 */
                lane_intr:4;                /* R1:lane_intr_enable, see #defines above. */

        /* Register 10: read only */
        unsigned :24,
                :1,                         /* always read as 1         */
                sample_cal:1,               /* sample calibration flip flop */
                edge_cal:6;                 /* edge calibration flip flops */

/* R10:edge_cal */
#define EDGE_0_CAL      0x01
#define EDGE_1_CAL      0x02
#define EDGE_2_CAL      0x04
#define EDGE_3_CAL      0x08
#define EDGE_4_CAL      0x10
#define EDGE_5_CAL      0x20

        /*
         * Registers 11 and 12 latch the four bits per lane that caused
         * the timing generator error.  These registers contain valid data
         * only when R9:tmg_intr is asserted.  They are read only.
         */
        unsigned :24,
                lane_b_pel_control:3,
                lane_b_data_valid:1,
                lane_a_pel_control:3,
                lane_a_data_valid:1;
        unsigned :24,
                lane_d_pel_control:3,
                lane_d_data_valid:1,
                lane_c_pel_control:3,
                lane_c_data_valid:1;

        /* Registers 13, 14, and 15: do not exist            */
        unsigned :32, :32, :32;

        /* Registers 16-21: write only, edges 0 through 5, respectively
         * Software must write these registers ASAP to
         * allow for the most possible settling time.
         */
        struct  {
                unsigned :24, delay:8;
        } edge_delay[6];                    /* Each may have a different "zero" point that */
                                            /* is calculated at power up, but should all   */
                                            /* have the same "slope".                      */

        /* Register 22: write only */
        unsigned :24,
                sample_trigger_threshold:8;     /* Normally set to 255 */

        /* Register 23: write only */
        unsigned :24,
                sample_delay:8;             /* Sets the leading edge of the 2 state sample */
                                            /* timing measurement.  R4:sample_delay_range  */

        /*
         * Registers 24-27 are the 4 control registers of the
         * on board Intel 8254 counter timer chip.
         */
        struct  {
                unsigned :24, value:8;
        } ctc_register[4];

        /* Registers 28-31: do not exist          */
        unsigned :32, :32, :32, :32;
```

Copyright 1989 Logic Modeling Systems

| HEADER FILE | DATE | TIME | PAGE # |
|---|---|---|---|
| include/tmg.h | 5/23/89 | 1:20:24 pm | 3/79 |

LINE # HEADER TEXT

```
        /* Registers 32-63: IDPROM: read only    */
        /* The IDPROM is a byte wide resource on 32 bit boundaries.      */
        struct  {
                unsigned :24, data:8;
        } id_prom[32];
} TMG;

/*
 * Use to map all the registers - independent of bits - during
 * some parts of diagnostics.
 */
typedef struct  {
        struct  {
                unsigned :24, data:8;
        } reg[64];
} TMG_DIAG;
```

Copyright 1989 Logic Modeling Systems

| HEADER FILE | DATE 5/23/89 | PAGE # |
|---|---|---|
| include/tmg_def.h | TIME 1:20:24 pm | 1/80 |

LINE # HEADER TEXT

```
/* SCCS_ID: tmg_def.h rev 1.1, 4/24/89 at 07:35:01 */

/**********************************************************************
 *
 *      definitions used in hardware diagnostics
 *      last modified 5/13/88 -- wfk
 *      added interrupt flag definitions 6/13/88 -- wfk
 *      Renamed to tmg_def.h, cleaned up in general.
 *
 *********************************************************************/

/*
 *      Clock Board Address Definitions
 */
#define CLOCK_BASE   0x8e000000              /* base address          */
#define REG(i) ((u_char *)(((u_long)((&(((TMG_DIAG *)\
                ((u_long)tmgptr))->reg[(i)]))))) + 3))
#define TMG_TIMER_OFFSET (24 * 4 + 3)   /* byte offset of reg 0 */

#define TMG_INT !(*((u_char *)0x10c60003) & 0x04)/* TMG interrupt*/

/*      Interrupt flag definitions
 */
#define EOPFLAG 1          /* End of Play Interrupt        */
#define CTCFLAG 2          /* CTC Interrupt                */
#define OBINTFLAG 4        /* On Board Interrupt           */
#define BPERRORFLAG 8      /* Backplane Error Interrupt    */

/*      Miscellaneous   */

#define lm_tmg_lane_select(x)   (tmgptr->lane_enable = (x))

#define EARLYSAMPLETRIGGERMODE 0          /* fixed (early) sample trigger */
#define EDGE7SAMPLETRIGGERMODE 1          /* sample triggered by Edge 7   */
#define TOGGLEMODE 1
#define NOTOGGLEMODE 0
#define CHECKSUM_INIT 0xbd
#define SOME_MAX_TE 20  /* 100 mV                    */
#define TIMEOUT 1000    /* 1000 ms = 1 sec           */
#define T_REF_IN_PS 8533333 /* reference period in ps  */
#define RAMP_DUMP_TIME 15000    /* dump time in ps     */
#define MAGIC_DEAD_TIME 9450    /* dead time in ps              */
                                /* 7 ns for Magic Chip          */
                                /* 1.7 ns for driver skew       */
                                /* 0.75 ns for delay line slop  */
#define TMG_MAXTRIES 10         /* number of thresholds to try  */
#define TMG_CAL_TOGGLES 100     /* number of toggles used in cal*/
#define START_DEAD_TIME_FUDGE 2 /* extra number of thresholds added
                                   to minimum threshold */
#define END_DEAD_TIME_FUDGE 2   /* same, but for max thresh     */

/* CTC command definitions      */
#define CNTR0CW 0x32            /* Counter 0 Control Word       */
#define CNTR1CW 0x74            /* Counter 1 Control Word       */
#define CNTR2CW 0xb4            /* Counter 2 Control Word       */
#define CNTR12LATCH 0xcc        /* latch count/status for 1,2   */
#define LATCH_CNTR_1 0xc4
#define LATCH_CNTR_0 0xa2

/* Backplane macros */

#define PLAY_MODE 1
#define ACCESS_MODE 0

#define Lane_select(X) (tmgptr->lane_enable = (X))
#define Get_bp_error() (tmgptr->lane_intr)
#define Bp_reset_on() (tmgptr->backplane_resetL = 0)
#define Bp_reset_off() (tmgptr->backplane_resetL = 1)
#define Bp_mode() (tmgptr->backplane_mode ? PLAY_MODE : ACCESS_MODE)

/* Calibration definitions */

extern void tmg_adjust_delay();

#ifdef OLD_DELAY_CKT
#define tmg_ns_to_dly_reg(ns)          (((ns)<27)? \
                                            (((((ns)>>3)&7)<<4)|((ns)&7)): \
                                            (0x33))
#define tmg_dly_reg_to_ns(x)           ((((x) & 0x38) >> 1) + ((x) & 0x07))
#else OLD_DELAY_CKT
#define tmg_ns_to_dly_reg(ns)          (((((ns)>>1)&7)<<3)|(((ns+1)>>1)&7))
#define tmg_dly_reg_to_ns(x)           ((((x)>>3)&7)+((x)&7))
#endif OLD_DELAY_CKT

#define DETECT_BOOL      0
#define DETECT_COUNT     1
#define DETECT_LOW       2
#define DETECT_SAMPLE    4

#define tmg_set_slot_count(n)   (tmgptr->slot_count = (n) - 1)

/* Edge ramp definitions */

#define tmg_get_eramp() (tmgptr->edge_delay_range)
#define tmg_set_eramp(ramp) (tmgptr->edge_delay_range = (ramp))

#define tmg_set_threshold(edge, threshold) \
                (tmgptr->edge_delay[edge].delay = (threshold)); \
                { int count = 1001; while(--count); }

#define tmg_get_edge_cal() (tmgptr->edge_cal)

#define tmg_get_test_mode()      (tmgptr->test_mode)
#define tmg_set_test_mode(x)     (tmgptr->test_mode = (x))
#define tmg_get_delay_reg()      (tmgptr->delay_clock_delay)
#define tmg_set_delay_reg(x)     (tmgptr->delay_clock_delay = (x))
#define tmg_get_delay()          tmg_dly_reg_to_ns(tmg_get_delay_reg())
#define tmg_set_delay(ns)        tmg_set_delay_reg(tmg_ns_to_dly_reg(ns))

/* Sample ramp definitions */

#define tmg_set_edge_7_threshold(threshold) \
                (tmgptr->sample_trigger_threshold = (threshold)); \
                { int count = 1001; while(--count); }

#define tmg_get_sramp()          (tmgptr->sample_delay_range)
#define tmg_set_sramp(sramp)     (tmgptr->sample_delay_range = (sramp))

#define tmg_set_sample_threshold(threshold) \
```

Copyright 1989 Logic Modeling Systems

| HEADER FILE | DATE | PAGE # |
|---|---|---|
| include/tmg_def.h | 5/23/89 | 2/81 |
| | TIME 1:20:24 pm | |

LINE # HEADER TEXT

```
                (tmgptr->sample_delay = (threshold)); \
                { int count = 1001; while(--count); }

#define tmg_get_sample_cal() (tmgptr->sample_cal)
#define tmg_set_sample_width_reg(width) (tmgptr->sample_width = width)
#define tmg_get_sample_width_reg()              (tmgptr->sample_width)

#define TMG_MIN_SAMPLE_WIDTH    500000 /* to prevent pac error during calib */

/*
** tmg_predict_period and tmg_predict_threshold assume the following units:
**
**      period          picoseconds
**      threshold       millivolts
**      slope           millivolts/milliseconds
**      offset          picoseconds
*/

#ifdef PRECISION
#define tmg_predict_period(threshold, slope, offset) \
        ((long)(offset) + ((long)(threshold))*((long)(slope)))

#define tmg_predict_threshold(period, slope, offset) \
        (((long)(period) - (long)(offset)) /(long)(slope))

#define tmg_predict_offset(period, threshold, slope) \
        ((long)(period) - ((long)(threshold))*((long)(slope)))
#else PRECISION
#define XXXtmg_predict_period(threshold, slope, offset) \
        ((long)((double)(offset) \
        + ((double)(threshold))*(((double)(slope)))))

#define XXXtmg_predict_threshold(period, slope, offset) \
        ((long)(((double)(period - (offset))) / (double)(slope)))

#define XXXtmg_predict_offset(period, threshold, slope) \
        ((long)((double)(period) \
        - ((double)(threshold))*(((double)(slope)))))
#endif PRECISION

#define NUMBER_OF_ERAMPS        4
#define NUMBER_OF_EDGES         6
#define NUMBER_OF_SRAMPS        4

#define EDGE_0          0
#define EDGE_1          1
#define EDGE_2          2
#define EDGE_3          3
#define EDGE_4          4
#define EDGE_5          5
#define SAMPLE_EDGE     6

/*      A global pointer to the following structure is used by
 *      tmg_calibrate() who fills in the values.  The values
 *      are defined as follows:
 *
 *        EdgeMinThresh :  Array of minimum threshold settings
 *                         for each of 4 ranges for each of 6
 *                         edges below which edges cannot be
 *                         (reliably) generated.
 *
 *        EdgeMinDelay  :  Array of settings for each of 4 ranges
 *                         below which edge delays may not be
 *                         specified.
 *
 *        EdgeMaxDelay  :  Array of settings for each of 4 ranges
 *                         that represent the maximum allowable
 *                          delay setting.
 *                         Setting a delay above this value may
 *                         result in no edge.
 *
 *        EdgeOffset    :  Array of offsets for each of 4 ranges
 *                         for each of 6 edges, together with the
 *                         slope, describe completely the relationship
 *                         of the edge delay with the threshold setting.
 *
 *        EdgeSlope     :  Array of ratios for each of 4 ranges,
 *                         average of 6 edges that represent
 *                         pico seconds per bit of delay setting.
 *
 *        EdgeLinearity:  Array of linearity measurements for the slope
 *                              of the ramps. 0 = perfect linearity.
 *
 *        Edge7MinThresh:  Array of settings for each of 4 ranges
 *                         that represent the minimum allowable
 *                         threshold setting for Edge[7].  Below these
 *                         values an edge (and Sample Trigger) may not
 *                         be reliably generated.
 *
 *        SampleMinThresh: Array of settings for each of 4 ranges
 *                         that represent the minimum allowable
 *                         threshold setting for the Sample ramp.  Below
 *                         these values, the Sample may not be reliably
 *                         generated.
 *
 *        SampleMinDelay:  Array of minimum delay settings for
 *                         Sample   r each of 4 ranges.
 *
 *        SampleMaxDelay:  Array of maximum delay settings for
 *                         Sample for each of 4 ranges.  Setting
 *                         a delay above this value may result
 *                         in no Sample.
 *
 *        SampleSlope   :  Array of ratios for each of 4 ranges
 *                         that represent nanoseconds per bit of
 *                         Sample delay setting.
 *
 *        SampleOffset  :  Array of offsets for each of 4 Edge
 *                         ranges for each of 4 Sample ranges.
 *                         These numbers represent nanoseconds of
 *                         delay from pattern clock when both
 *                         Edge7 is set at Edge7MinDelay and Sample
 *                         is set at 0.
 *
 *        SampleLinearity:  Array of linearity measurements for the slope
 *                              of the ramps. 0 = perfect linearity.
 *
 *        EarlySampleMinDelay:  Array of minimum delays available with the
 *                              Early Sample Trigger Mode.
 *
```

Copyright 1989 Logic Modeling Systems

HEADER FILE include/tmg_def.h

DATE 5/23/89 TIME 1:20:24 pm PAGE # 3/82

LINE # HEADER TEXT

```
 *      EarlySampleMaxDelay:  Array of maximum delays available with the
 *                            Early Sample Trigger Mode.
 *
 *      EarlySampleOffset:    Array of offsets.
 *
 *
 *      DelayDelay       :  This is the value used for the delay clock
 *                          delay line setting.
 *
 *      DumpDelay        :  This is the value used for the dump delay
 *                          line setting.
 *
 *      CalCompleted     :  This is a flag (TRUE or FALSE) that indicates
 *                          to whomever cares whether the calibration has
 *                          been performed or not.
 *
 */

struct CALIB {

  u_long EdgeMinThresh[NUMBER_OF_ERAMPS][NUMBER_OF_EDGES];
  u_long EdgeMinDelay[NUMBER_OF_ERAMPS];
  u_long EdgeMaxDelay[NUMBER_OF_ERAMPS];
  long   EdgeOffset[NUMBER_OF_ERAMPS][NUMBER_OF_EDGES];
  u_long EdgeSlope[NUMBER_OF_ERAMPS][NUMBER_OF_EDGES];
  u_long EdgeLinearity[NUMBER_OF_ERAMPS][NUMBER_OF_EDGES];

  u_long Edge7MinThresh[NUMBER_OF_ERAMPS];
  u_long Edge7Slope[NUMBER_OF_ERAMPS];
  u_long Edge7Linearity[NUMBER_OF_ERAMPS];
  u_long SampleMinThresh[NUMBER_OF_SRAMPS];
  u_long SampleMinDelay[NUMBER_OF_ERAMPS];
  u_long SampleMaxDelay[NUMBER_OF_SRAMPS];
  u_long SampleSlope[NUMBER_OF_SRAMPS];
  u_long SampleLinearity[NUMBER_OF_SRAMPS];
  long   SampleOffset[NUMBER_OF_ERAMPS][NUMBER_OF_SRAMPS];
  long EarlySampleMinDelay[NUMBER_OF_SRAMPS];
  u_long EarlySampleMaxDelay[NUMBER_OF_SRAMPS];
  long   EarlySampleOffset[NUMBER_OF_SRAMPS];
  u_long DelayDelay;
  u_long DumpDelay;

  u_long CalCompleted;
};
```

Copyright 1989 Logic Modeling Systems

| HEADER FILE | DATE | 5/23/89 | PAGE # |
|---|---|---|---|
| include/trees.h | TIME | 1:20:24 pm | 1/83 |

LINE # HEADER TEXT

```
/* SCCS_ID: trees.h rev 3.1, 4/24/89 at 07:35:04     */

/*
 *  header file for tree module
 *
 *  types needed:
 *    type symbol from strings.h
 *  types defined
 *    typedef unsigned short tree
 *  functions defined:
 *    void treeinit ( ) ;
 *      initializes the tree data structure
 *    void treefree ( ) ;
 *      frees the tree data structure
 *    void bldtrm ( name , text ) symbol name , text ;
 *      build terminal node with passed name, text
 *    void bldnontrm ( name , kids ) symbol name , unsigned short kids ;
 *      build nonterminal node with passed name over kids
 *    tree poptop ( ) ;
 *      pops and returns completely built tree
 *    symbol nameofnode ( T ) tree T ;
 *      returns name of root node of passed tree
 *    symbol textofnode ( T ) tree T ;
 *      returns text of root node of passed tree if node is terminal
 *    void set_text ( T , text ) tree T , symbol text ;
 *      sets the text of the passed node to the passed symbol
 *    unsigned short kidcount ( T ) tree T ;
 *      returns number of subtrees of root node of passed tree
 *    tree subtree ( n , T ) unsigned short n , tree T ;
 *      returns the n'th subtree of the passed tree
 *    unsigned short whichkid ( T , kid ) tree T , kid ;
 *      returns n where kid is the n'th subtree of T
 *    symbol file_of ( T ) tree T ;
 *      returns the source file for this node
 *    symbol line_of ( T ) tree T ;
 *      returns the source line for this node
 *    void decorate ( T , dec ) tree T , long dec ;
 *      decorates the root node of the passed tree with the passed decoration
 *    long dec_ration ( T ) tree T ;
 *      returns the decoration on the root node of the passed tree
 *    void printtree ( T ) tree T ;
 *      prints the passed tree
 *    void printnode ( T ) tree T ;
 *      prints the root node of the passed tree
 */

# define DECOR /* to include decorate and dec_ration */
# define NULLTREE 0 /* the null tree */

typedef unsigned short tree ;

struct node /* node structure */
  { symbol name ; /* name of node */
    unsigned short kids ; /* kid count */
    unsigned short first ; /* index of first kid or text of node if terminal */
      /* ASSUMES: a symbol is an unsigned short (should use a union) */
# ifdef DECOR
    long decor ; /* decoration */
# endif /* DECOR */
    symbol src ; /* the source file name */
    unsigned short srcline ; /* the source line number */
  } ;

void
  treeinit ( ) ,
  treefree ( ) ,
  bldtrm ( ) ,
  bldnontrm ( ) ,
  set_text ( ) ,
# ifdef DECOR
  decorate ( ) ,
# endif /* DECOR */
  printtree ( ) ,
  printnode ( ) ;
tree
  poptop ( ) ,
  subtree ( ) ;
symbol
  nameofnode ( ) ,
  textofnode ( ) ,
  file_of ( ) ;
unsigned short
  kidcount ( ) ,
  /*whichkid ( ) ,*/
  line_of ( ) ;
# ifdef DECOR
long dec_ration ( ) ;
# endif /* DECOR */

/* end of header file for tree module */
```

Copyright 1989
Logic Modeling Systems

| HEADER FILE | DATE | PAGE # |
|---|---|---|
| include/vrtx.h | 5/23/89 | 1/84 |
| | TIME 1:20:24 pm | |

HEADER TEXT

```
/* SCCS_ID: vrtx.h rev 3.1, 4/24/89 at 07:35:07 */

/*
** When making use of the lm_delay() call,
** use of constants will be better utilization of <>, time.
** NOTE: The system timer tick is 5 ms.
** lm_delay() expects number of milliseconds to delay.
** It will delay a minimum of 5 ms; typical min. delay = 7.5 ms
** lm_time() returns number of milliseconds since power up
** (rounded to the lms system timer tick).
** lm_tick is a u_long updated by timer isr to calculate
** number of ticks since beginning of time.
** lm_number_of_ticks()
**      Given number of milliseconds calculate the number
** of system ticks=1.
*/
extern  unsigned long   lm_tick;
#define lm_number_of_ticks(x)  (( (x - 5) / 5 ) + 2)
#define lm_delay(x)       (sc_delay(( (x - 5) / 5 ) + 2))
#define lm_time()         (((lm_tick << 2) + lm_tick))
#define VRTX_OK           0x0
#define VRTX_TIMEOUT      0xa
```

Copyright 1989 Logic Modeling Systems

| SOURCE PROGRAM | DATE | PAGE # |
|---|---|---|
| sfi/access.c | 5/23/89 | 1/1 |
| | TIME 1:20:50 pm | |

SOURCE TEXT

```
/* SCCS_ID: access.c rev 3.2, 5/9/89 at 16:34:28    */

#include <stdio.h>
#include "common.h"
#include "network.h"
#include "lm_sfi.h"
#include "lsfi.h"
#include "lm_rd_wr.h"
#include "protcmd.h"
#include "protans.h"
#include "message.h"
#include "globals.h"

/* If you change this message, you have to make the corresponding change
 * in bootprom.c.
 */
static char waiting_to_be_booted_msg[]   = "Modeler waiting to be booted";
static char not_properly_installed_msg[] = "Modeler is not properly installed";
static char old_eproms_msg[] = "Must install new CPU EPROMS; call field engineering";
static char old_hosts_msg[] = "Must use newer version of utilities to install modeler";

lm_read(modeler_name,
        memory_type, ee_number, offset, number_of_bytes, buffer, status)
char    *modeler_name;
u_long memory_type;
u_long ee_number;
u_long offset;
register u_long number_of_bytes;
register char *buffer;
u_long *status;
{
   /*
    ** read from modeler memory space
    */
   long  ret;
   short i;

#ifdef DEBUG
   if (lm_debug[1]) {
      DPRINTF(("lm_read(%s, %d, %d, %d, %d, %08x, %08x)\n",
               modeler_name, memory_type, ee_number, offset, number_of_bytes,
               buffer, status));
   }
#endif

    if (lm_mopen(modeler_name) == LM_ERROR) return LM_ERROR;

   /* Do a sanity check... */
   if(number_of_bytes > MAX_RD_WR_BUFFER_SIZE) {
      lm_queue_message(ERROR_MSG,
        "internal error: maximum buffer size exceeded");
      return(LM_ERROR);
   }

   lm_put_int( READ_CMD );

   /* memory_type to read from */
   lm_put_int( memory_type);

   /* ee_number */
   lm_put_int( ee_number);

   /* offset */
   lm_put_int( offset);

   /* number_of_bytes */
   lm_put_int( number_of_bytes);

   if (! lm_end_put(lm_modeler_fd))
      return(LM_ERROR);

   if (lm_get_int() != READ_ANS) {
      lm_queue_message(ERROR_MSG,
           "internal error: wrong reply received from modeler: %s",
                       modeler_name);
      return(LM_ERROR);
   }

   if ((ret = lm_dequeue_errors()) == LM_ERROR)
      return(LM_ERROR);

   /* copy number_of_bytes to buffer */
   for( i=0; i < number_of_bytes; ++i )
      *buffer++ = lm_get_char();

   return(ret);
}

lm_write(modeler_name,
         memory_type, ee_number, offset, number_of_bytes, buffer, status)
char                *modeler_name;
u_long     memory_type;
u_long     ee_number;
u_long     offset;
register u_long     numb__of_bytes;
register char      *buffer;
u_long    *status;
{
   /*
    ** write to modeler memory space
    */
#ifdef DEBUG
   if (lm_debug[1]) {
      DPRINTF(("lm_write(%s, %d, %d, %d, %d, %08x, %08x)\n",
               modeler_name, memory_type, ee_number, offset, number_of_bytes,
               buffer, status));
   }
#endif

        if (lm_mopen(modeler_name) == LM_ERROR) return LM_ERROR;
        return lm_mwrite(memory_type, ee_number, offset,
                 number_of_bytes, buffer, status);
}

lm_mopen(modeler_name)
char                *modeler_name;
{
   clear_errors();

   if (!lm_sim_verified) {
```

Copyright 1989 Logic Modeling Systems

| SOURCE PROGRAM | DATE | PAGE # |
|---|---|---|
| sfi/access.c | 5/23/89 TIME 1:20:50 pm | 2/2 |

SOURCE TEXT

```
        lm_queue_message(ERROR_MSG,
        "internal simulator error: lm_begin_modeling_session() not yet been called");
        return(LM_ERROR);
    }

    if (check_connection(modeler_name) == FAILURE)
        return(LM_ERROR);

    lm_choose_comm(lm_modeler_fd);
    return lm_dequeue_errors();
}

lm_mwrite(memory_type, ee_number, offset, number_of_bytes, buffer, status)
register u_long     memory_type;
register u_long     ee_number;
register u_long     offset;
register u_long     number_of_bytes;
register char      *buffer;
register u_long    *status;
{
    register u_long i;

    *status = 0;
    /*  Do a sanity check....  */
    if( number_of_bytes > MAX_RD_WR_BUFFER_SIZE ) {
        lm_queue_message(ERROR_MSG,
          "internal error: maximum buffer size exceeded");
        return(LM_ERROR);
    }

    lm_put_int( WRITE_CMD );

    /* memory_type to write to */
    lm_put_int( memory_type);

    /* ee_number */
    lm_put_int( ee_number);

    /* offset */
    lm_put_int( offset);

    /* number_of_bytes */
    lm_put_int( number_of_bytes);

    /* copy the data from the buffer to outgoing buffer.... */
    for( i=0; i < number_of_bytes; ++i )
        lm_put_char(*buffer++);

    if (! lm_end_put(lm_modeler_fd))
        return(LM_ERROR);

    if (lm_get_int() != WRITE_ANS) {
        lm_queue_message(ERROR_MSG,
          "internal error: wrong reply received from modeler: %s",
                        lm_modeler_name_selected);
        return(LM_ERROR);
    }

    return lm_dequeue_errors();
}

static
check_connection(modeler_name)
char *modeler_name;
{
    short    akt;
    u_char   i;
    u_char   removed_error;

    if (lm_modeler_fd != -1) {
        if (strcmp(lm_modeler_name_selected, modeler_name) == 0)
            return(SUCCESS);
        else {
            /* The user is trying to talk to a different modeler;
             * close the connection to the previous modeler.
             */
            for (i = 0; lm_system_table[i] != NULL; ++i) {
                if (strcmp(lm_system_table[i]->name, lm_modeler_name_selected) == 0) {
                    break;
                }
            }

            if (lm_system_table[i] == NULL) {
                lm_queue_message(ERROR_MSG, "internal error: previously selected modeler: %s is missing from the system table",
                            lm_modeler_name_selected);
                return(FAILURE);
            }

            if (lm_system_table[i]->state == USED_FOR_RD_WR) {
                lm_choose_comm(lm_modeler_fd);
                lm_put_int(ABORT_CMD);

                (void)lm_end_put(lm_modeler_fd);

                close_modeler(lm_modeler_fd);

                lm_system_table[i]->state = NOT_OPENED;
                lm_system_table[i]->fd    = -1;
                lm_modeler_fd = -1;
            }
        }
    }

    for (i = 0; lm_system_table[i] != NULL; ++i) {
        if (strcmp(lm_system_table[i]->name, modeler_name) == 0) {
            break;
        }
    }

    if (lm_system_table[i] == NULL) {
        lm_queue_message(WARNING_MSG, "modeler: %s is not in %s file",
            modeler_name, HOSTFILENAME);
        /* allow user to specify modeler not in HOSTFILENAME */
        if (lm_enter_system(modeler_name, -1) == FAILURE)
            return(FAILURE);
    }

    switch (lm_system_table[i]->state) {
    case USED:
        break;
```

Copyright 1989 Logic Modeling Systems

| SOURCE PROGRAM | DATE | PAGE # |
|---|---|---|
| sfi/access.c | 5/23/89 | 3/3 |
| | TIME 1:20:50 pm | |

LINE # SOURCE TEXT

```
    case USED_FOR_RD_WR:
        break;
    case UNAVAIL:
        lm_queue_message(ERROR_MSG, "modeler: %s unavailable",
                         modeler_name);
        return(FAILURE);
    case NOT_OPENED:
        if (lm_initcomm(modeler_name, &skt) == FAILURE) {
            /*lm_system_table[i]->state = UNAVAIL;*/
            return(FAILURE);
        }
        else {
            if (lm_send_begin_session_cmd((char)skt, modeler_name) == FAILURE) {
                removed_error = FALSE;

                if (lm_remove_message(ERROR_MSG,
                                      old_hosts_msg) == SUCCESS)
                    removed_error = TRUE;

                if (lm_remove_message(ERROR_MSG,
                                      old_eproms_msg) == SUCCESS)
                            removed_error = TRUE;

                if (lm_remove_message(ERROR_MSG,
                                      waiting_to_be_booted_msg) == SUCCESS)
                    removed_error = TRUE;

                if (lm_remove_message(ERROR_MSG,
                                      not_properly_installed_msg) == SUCCESS)
                    removed_error = TRUE;

                if (removed_error == FALSE) {
                    lm_close_modeler(skt);
                    return(FAILURE);
                }
                else {
                    lm_system_table[i]->state = USED_FOR_RD_WR;
                    lm_system_table[i]->fd    = skt;
                }
            }
            else {
                lm_system_table[i]->state = USED;
                lm_system_table[i]->fd    = skt;
            }
        }
        break;
    default:
        lm_queue_message(ERROR_MSG, "internal error: unknown modeler accessibility state");
        return(FAILURE);
    }

    lm_modeler_fd = lm_system_table[i]->fd;
    (void)strcpy(lm_modeler_name_selected, modeler_name);

    return(SUCCESS);
}

lm_close_read_write_connection()
{
    u_char   i;

    for (i = 0; lm_system_table[i] != NULL; ++i) {
        if (lm_system_table[i]->state == USED_FOR_RD_WR) {
            lm_choose_comm(lm_system_table[i]->fd);
            lm_put_int(ABORT_CMD);

            (void)lm_end_put(lm_system_table[i]->fd);

            lm_close_modeler(lm_system_table[i]->fd);

            lm_system_table[i]->state = NOT_OPENED;
            lm_system_table[i]->fd    = -1;
        }
    }
    lm_modeler_fd = -1;
    return(SUCCESS);
}

lm_close_connection_after_boot(modeler_name)
char *modeler_name;
{
    u_char         i;

    for (i = 0; lm_system_table[i] != NULL; ++i) {
        if (strcmp(lm_system_table[i]->name, modeler_name) == 0) {
            break;
        }
    }

    if (lm_system_table[i] != NULL) {
        if (lm_system_table[i]->state == USED_FOR_RD_WR) {
            lm_close_modeler(lm_system_table[i]->fd);
            lm_system_table[i]->state = NOT_OPENED;
        }
    }

    lm_modeler_fd = -1;
    return(SUCCESS);
}
```

Copyright 1989
Logic Modeling Systems

HEADER FILE
sfi/conv.h

DATE 5/23/89
TIME 1:20:51 pm
PAGE # 1/4

HEADER TEXT

```
/* SCCS_ID: conv.h rev 3.1, 4/24/89 at 07:35:35     */

/* CONVERSION MACROS */

typedef struct {
   union {
#ifdef VAX
      struct {u_char LCC_b0, LCC_b1, LCC_b2, LCC_b3; } LCC_un_b;
      struct {u_short LCC_w0, LCC_w1; } LCC_un_w;
#else
      struct {u_char LCC_b3, LCC_b2, LCC_b1, LCC_b0; } LCC_un_b;
      struct {u_short LCC_w1, LCC_w0; } LCC_un_w;
#endif
      u_long LCC_long;
   } LCC_un;
#define lcc_long     LCC_un.LCC_long
#define lcc_short    LCC_un.LCC_un_w.LCC_w0
#define lcc_char     LCC_un.LCC_un_b.LCC_b0
#define lcc_b3       LCC_un.LCC_un_b.LCC_b3
#define lcc_b2       LCC_un.LCC_un_b.LCC_b2
#define lcc_b1       LCC_un.LCC_un_b.LCC_b1
#define lcc_b0       LCC_un.LCC_un_b.LCC_b0
#define lcc_w1       LCC_un.LCC_un_w.LCC_w1
#define lcc_w0       LCC_un.LCC_un_w.LCC_w0
} CONVERSION_RECORD;

#define write_long(fn, uval)  { CONVERSION_RECORD zzvalzz; \
                                   zzvalzz.lcc_long = (long)uval; \
                                   (void)putc(zzvalzz.lcc_b3, fn); \
                                   (void)putc(zzvalzz.lcc_b2, fn); \
                                   (void)putc(zzvalzz.lcc_b1, fn); \
                                   (void)putc(zzvalzz.lcc_b0, fn); \
                                   if (ferror(fn)) { \
                                      lm_queue_message(ERROR_MSG, "error writing save-set, check quota and file system"); \
                                      return(LM_ERROR); \
                                   } \
                                }

#define write_short(fn, uval) { CONVERSION_RECORD zzvalzz; \
                                   zzvalzz.lcc_short = (short)uval; \
                                   (void)putc(zzvalzz.lcc_b1, fn); \
                                   (void)putc(zzvalzz.lcc_b0, fn); \
                                   if (ferror(fn)) { \
                                      lm_queue_message(ERROR_MSG, "error writing save-set, check quota and file system"); \
                                      return(LM_ERROR); \
                                   } \
                              }


#define write_char(fn, uval)  { (void)putc((char)uval, fn); \
                                if (ferror(fn)) { \
                                   lm_queue_message(ERROR_MSG, "error writing save-set, check quota and file system"); \
                                   return(LM_ERROR); \
                                } \
                              }


#define read_long(fn, uval)   { CONVERSION_RECORD zzvalzz; \
                                   zzvalzz.lcc_b3 = fgetc(fn); \
                                   zzvalzz.lcc_b2 = fgetc(fn); \
                                   zzvalzz.lcc_b1 = fgetc(fn); \
                                   zzvalzz.lcc_b0 = fgetc(fn); \
                                   if (feof(fn) != 0) { \
                                      lm_queue_message(ERROR_MSG, "save-set file is corrupted"); \
                                      (void)fclose(fn); \
                                      return(LM_ERROR); \
                                   } \
                                   *uval = zzvalzz.lcc_long;  \
                                }

#define read_short(fn, uval)  { CONVERSION_RECORD zzvalzz; \
                                   zzvalzz.lcc_b1 = fgetc(fn); \
                                   zzvalzz.lcc_b0 = fgetc(fn); \
                                   if (feof(fn) != 0) { \
                                      lm_queue_message(ERROR_MSG, "save-set file is corrupted"); \
                                      (void)fclose(fn); \
                                      return(LM_ERROR); \
                                   } \
                                   *uval = zzvalzz.lcc_short; \
                                }

#define read_char(fn, uval)   { *uval = fgetc(fn); \
                                   if (feof(fn) != 0) { \
                                      lm_queue_message(ERROR_MSG, "save-set file is corrupted"); \
                                      (void)fclose(fn); \
                                      return(LM_ERROR); \
                                   } \
                                }

#define print_long(file, uval)  { read_long(file, uval); \
                                   printf("long  0x%08X\n", *uval); }

#define print_short(file, uval) { read_short(file, uval); \
                                   printf("short 0x%04X\n", *uval); }

#define print_char(file, uval)  { read_char(file, uval); \
                                   printf("char  0x%02X\n", *uval); }
```

Copyright 1989 Logic Modeling Systems

SOURCE PROGRAM sfi/futil.c | DATE 5/23/89 | TIME 1:20:51 pm | PAGE # 1/5

LINE # SOURCE TEXT

```
/* SCCS_ID: futil.c rev 3.2, 5/9/89 at 16:26:26 */

#include <stdio.h>
#include <sys/types.h>
#include <sys/stat.h>
#include "common.h"
#include "conv.h"
#include "message.h"
#include "network.h"
#include "lm_sfi.h"
#include "lsfi.h"

#ifndef PC386
#include <sys/file.h>
#else                                   /* PC386 */
#include <fcntl.h>
#include <io.h>
#endif                                  /* PC386 */

#ifdef VMS
#include        <ssdef>
#include        <rms>

#define         BLOCK_SIZE      512
#endif                                  /* VMS */

extern char             *lm_calloc();
extern char             *lm_malloc();
extern char             *lm_realloc();

lm_write_file_size(save_set, filename)
FILE                    *save_set;
char                    *filename;
{
    int                     fd;
    struct stat             file_info;
    long                    file_size;

    (void) fflush(save_set);

    fd = fileno(save_set);

    if (fstat(fd, &file_info) == -1) {
        lm_queue_message(ERROR_MSG, "fstat on filename: %s failed",
                        filename);
        return (LM_ERROR);
    }
    file_size = (long) file_info.st_size;

    /* The != 0 test is required for BSD and SYS5 compatibility */
    if (fseek(save_set, (long) 4, 0) != 0) {
        lm_queue_message(ERROR_MSG, "fseek on filename: %s failed",
                        filename);
        return (LM_ERROR);
    }
    write_long(save_set, file_size);
    return (LM_SUCCESS);
}

lm_check_file_size(save_set, filename)
FILE                    *save_set;
char                    *filename;
{
    int                     fd;
    struct stat             file_info;
    long                    file_size;

    fd = fileno(save_set);
    if (fstat(fd, &file_info) == -1) {
        lm_queue_message(ERROR_MSG, "fstat on filename: %s failed",
                        filename);
        (void) fclose(save_set);
        return (LM_ERROR);
    }
    read_long(save_set, &file_size);

    if (file_size != file_info.st_size) {
        lm_queue_message(ERROR_MSG, "save-set file: %s has been modified",
                        filename);
        (void) fclose(save_set);
        return (LM_ERROR);
    }
    return (LM_SUCCESS);
}

lm_get_file_size(file_ptr, filename, filesize)
FILE                    *file_ptr;
char                    *filename;
long                    *filesize;
{
    int                     fd;
    struct stat             file_info;

    (void) fflush(file_ptr);
    fd = fileno(file_ptr);
    if (fstat(fd, &file_info) == -1) {
        lm_queue_message(ERROR_MSG, "fstat on filename: %s failed",
                        filename);
        (void) fclose(file_ptr);
        return (FAILURE);
    }
    *filesize = file_info.st_size;
    return (SUCCESS);
}

lm_check_file_type(filename)
char                    *filename;
{
    FILE                    *infile;
    struct stat             file_info;
    int                     fd;
    u_short                 ftype;

    infile = fopen(filename, "r");

    /*
     * If file is not found then return SUCCESS. The fact that the file does not
     * exist will be checked later.
     */
    if (infile == NULL)
```

Copyright 1989 Logic Modeling Systems

| SOURCE PROGRAM | DATE 5/23/89 | PAGE # |
|---|---|---|
| sfi/futil.c | TIME 1:20:51 pm | 2/6 |

LINE # SOURCE TEXT

```
         return (SUCCESS);

   fd = fileno(infile);
   if (fstat(fd, &file_info) == -1) {
      lm_queue_message(ERROR_MSG, "fstat on filename: %s failed",
                       filename);
      return (FAILURE);
   }
   ftype = file_info.st_mode;

   (void) fclose(infile);

   if (ftype & S_IFDIR) {
      lm_queue_message(ERROR_MSG, "filename: %s is a directory",
                       filename);
      return (FAILURE);
   }
   return (SUCCESS);
}

lm_search_key_id(head, instance_id, file_ptr)
FILE_INFO              *head;
u_short                 instance_id;
FILE_INFO             **file_ptr;
{
   while (head != NULL) {
      if (head->instance_id == instance_id)
         break;
      head = head->next;
   }

   if (head != NULL) {
      *file_ptr = head;
      return (SUCCESS);
   } else
      return (FAILURE);
}

lm_search_key_name(head, filename)
FILE_INFO              *head;
char                   *filename;
{
   while (head != NULL) {
      if (strcmp(head->name, filename) == 0)
         break;
      head = head->next;
   }
   if (head != NULL)
      return (SUCCESS);
   else
      return (FAILURE);
}

lm_close_and_delete_file_key_id(head, instance_id)
FILE_INFO             **head;
u_short                 instance_id;
{
   FILE_INFO             *ptr;
   FILE_INFO             *prev_ptr;

   ptr = *head;
   prev_ptr = NULL;
   while (ptr != NULL) {
      if (ptr->instance_id == instance_id) {
         if (prev_ptr == NULL) {
            *head = ptr->next;
         } else {
            prev_ptr->next = ptr->next;
         }
         (void) fclose(ptr->file_ptr);
         free(ptr->name);
         free((char *) ptr);
         return;
      }
      prev_ptr = ptr;
      ptr = ptr->next;
   }
}

lm_open_and_insert_file(head, filename, instance_id)
FILE_INFO             **head;
char                   *filename;
u_short                 instance_id;
{
   FILE                   *file;
   char                   *temp_name;
   FILE_INFO              *file_info;

   temp_name = DMALLOC((unsigned) (strlen(filename) + 1));
   if (temp_name == NULL) {
      lm_queue_message(ERROR_MSG, "out of memory on host");
      return (FAILURE);
   }
   (void) strcpy(temp_name, filename);

   file_info = (FILE_INFO *) DMALLOC((unsigned) sizeof(FILE_INFO));
   if (file_info == NULL) {
      lm_queue_message(ERROR_MSG, "out of memory on host");
      free(temp_name);
      return (FAILURE);
   }
   file = fopen(filename, "w");
   if (file == NULL) {
      lm_queue_message(ERROR_MSG, "cannot open filename: %s for write",
                       filename);
      free(temp_name);
      free((char *) file_info);
      return (FAILURE);
   }
   file_info->name = temp_name;
   file_info->file_ptr = file;
   file_info->instance_id = instance_id;
   file_info->next = *head;
   *head = file_info;

   return (SUCCESS);
}

/*******************************************************************
 *
```

Copyright 1989
Logic Modeling Systems

| SOURCE PROGRAM | DATE | 5/23/89 | PAGE # |
| --- | --- | --- | --- |
| sfi/futil.c | TIME | 1:20:51 pm | 3/7 |

SOURCE TEXT

```
 * NAME:
 *      lm_ftruncate -- Truncate a file to a certain size.
 *
 * PURPOSE:
 *      "lm_ftruncate" will truncate the requested file to the requested
 *      size. If the file size is not greater than this, nothing is done.
 *
 * INTERFACE:
 *
 *      lm_ftruncate(file_name, size)
 *
 *      PARAMETER          TYPE          DESCRIPTION
 *      ------------------------------------------------------------------
 *      file_name          *char         The name of the file to truncate.
 *      size               u_long        The maximum size of the file after
 *                                       truncating.
 *
 * CALLS:
 *      System calls "open", "close", "unlink" and "fstat".
 *      C library call "sprintf".
 *
 * EXTERNAL REFERENCES:
 *      None.
 *
 * RESTRICTIONS:
 *      Should have write capability on source file.
 *
 * RETURNS:
 *      SUCCESS: If all goes well.
 *      FAILURE: If something goes wrong.
 *
 * DESIGNER:
 *      Steve Parks
 *
 ****************************************************************************/

static
lm_ftruncate(file_name, size)
char                    *file_name;
u_long                  size;

#ifndef VMS
{

#ifdef  APOLLO
   int                  From_FD;
#endif                          /* APOLLO */

#ifdef  SUN
   int                  From_FD;
#endif                          /* SUN */

#ifdef  PC386
   int                  From_FD;
#endif                          /* PC386 */

   struct stat          buf;

   /*
    * Get a file descriptor for the file to truncate.
    */
   From_FD = open(file_name, O_RDWR, 0);
   if (From_FD < 0) {
      return (FAILURE);
   }

   /*
    * Get some information about the source file.
    */
   if (fstat(From_FD, &buf) != 0) {
      (void) close(From_FD);
      return (FAILURE);
   }

   /*
    * If the file is already the right size, no need to continue.
    */
   if ((u_long) buf.st_size > size) {

#ifdef APOLLO
      if (ftruncate(From_FD, size) != 0) {
         (void) close(From_FD);
         return (FAILURE);
      }
#endif                          /* APOLLO */

#ifdef SUN
      if (ftruncate(From_FD, size) != 0) {
         (void) close(From_FD);
         return (FAILURE);
      }
#endif                          /* SUN */

#ifdef PC386
      if (chsize(From_FD, size) != 0) {
         (void) close(From_FD);
         return (FAILURE);
      }
#endif                          /* PC386 */
   }
   (void) close(From_FD);
   return (SUCCESS);
}

#else                           /* VMS */

{
   struct RAB           record_access_block;
   struct FAB           file_access_block;

   char                 file_buffer[BLOCK_SIZE];
   int                  rms_status;
   int                  total_bytes;

   record_access_block = cc$rms_rab;
   file_access_block = cc$rms_fab;

   record_access_block.rab$l_fab = &file_access_block;

   file_access_block.fab$l_fna = file_name;
```

Copyright 1989 Logic Modeling Systems

| SOURCE PROGRAM | DATE | PAGE # |
|---|---|---|
| sfi/futil.c | 5/23/89<br>TIME 1:20:51 pm | 4/8 |

SOURCE TEXT

```
    file_access_block.fab$b_fns = strlen(file_access_block.fab$l_fna);
    file_access_block.fab$b_fac |= FAB$M_GET;
    file_access_block.fab$b_fac |= FAB$M_TRN;
    file_access_block.fab$w_mrs = BLOCK_SIZE;
    file_access_block.fab$b_org = FAB$C_SEQ;

    rms_status = SYS$OPEN(&file_access_block);
    if ((rms_status != SS$_NORMAL) && (rms_status != RMS$_NORMAL)) {
        lm_queue_message(VMS_ERROR_MSG, rms_status, "Unable to open file %s ", file_name);
        return (FAILURE);
    }
    rms_status = SYS$CONNECT(&record_access_block);
    if ((rms_status != SS$_NORMAL) && (rms_status != RMS$_NORMAL)) {
        lm_queue_message(VMS_ERROR_MSG, rms_status, "Unable to connect to file %s ", file_name);
        return (FAILURE);
    }
    total_bytes = 0;
    while (total_bytes <= size) {
        record_access_block.rab$b_rac = RAB$C_SEQ;
        record_access_block.rab$l_ubf = file_buffer;
        record_access_block.rab$w_usz = sizeof(file_buffer);
        rms_status = SYS$FIND(&record_access_block);
        if ((rms_status != SS$_NORMAL) && (rms_status != RMS$_NORMAL)) {
            lm_queue_message(VMS_ERROR_MSG, rms_status, "Unable to read file %s ", file_name);
            return (FAILURE);
        }
        total_bytes += strlen(file_buffer) + 1;
    }

    rms_status = SYS$TRUNCATE(&record_access_block);
    if ((rms_status != SS$_NORMAL) && (rms_status != RMS$_NORMAL)) {
        lm_queue_message(VMS_ERROR_MSG, rms_status, "Unable to truncate file %s ", file_name);
        return (FAILURE);
    }
    rms_status = SYS$CLOSE(&file_access_block);
    if ((rms_status != SS$_NORMAL) && (rms_status != RMS$_NORMAL)) {
        lm_queue_message(VMS_ERROR_MSG, rms_status, "Unable to close file %s ", file_name);
        return (FAILURE);
    }
    return (SUCCESS);
}

#endif

lm_append_and_insert_file(head, filename, instance_id, filesize)
FILE_INFO           **head;
char                 *filename;
u_short               instance_id;
u_long                filesize;
{

    /*
     * This routine open "filename" for append and link the file information to
     * the FILE_INFO link list. It truncates the file to at most filesize bytes.
     */

    FILE                *file;
    char                *temp_name;
    FILE_INFO           *file_info;
    long                 accessible;
    int                  fd;

    temp_name = DMALLOC((unsigned) (strlen(filename) + 1));
    if (temp_name == NULL) {
        lm_queue_message(ERROR_MSG, "out of memory on host");
        return (FAILURE);
    }
    (void) strcpy(temp_name, filename);

    file_info = (FILE_INFO *) DMALLOC((unsigned) sizeof(FILE_INFO));
    if (file_info == NULL) {
        lm_queue_message(ERROR_MSG, "out of memory on host");
        free(temp_name);
        return (FAILURE);
    }
    accessible = (long) access(filename, (int) 0);

    if (accessible != 0) {
        lm_queue_message(WARNING_MSG, "filename: %s not found, can't continue logging",
                         filename);
        free(temp_name);
        free((char *) file_info);
        return (SUCCESS);
    }
    if (lm_ftruncate(filename, filesize) != SUCCESS) {
        lm_queue_message(WARNING_MSG, "cannot truncate filename: \"%s\", cannot continue logging",
                         filename);
        free(temp_name);
        free((char *) file_info);
        return (SUCCESS);
    }
    file = fopen(filename, "a");
    if (file == NULL) {
        lm_queue_message(WARNING_MSG, "cannot open filename: \"%s\" for append, cannot continue logging",
                         filename);
        free(temp_name);
        free((char *) file_info);
        return (SUCCESS);
    }
    file_info->name = temp_name;
    file_info->file_ptr = file;
    file_info->instance_id = instance_id;
    file_info->next = *head;
    *head = file_info;

    return (SUCCESS);
}
```

Copyright 1989 Logic Modeling Systems

SOURCE PROGRAM sfi/globals.c

DATE 5/23/89 TIME 1:20:51 pm PAGE # 1/9

LINE # SOURCE TEXT

```
/* SCCS_ID: globals.c rev 3.1, 4/24/89 at 07:35:46 */

#include <stdio.h>
#include <ctype.h>
#include "common.h"
#include "network.h"
#include "message.h"
#include "lm_sfi.h"
#include "lsfi.h"
#include "protams.h"
#include "protcmd.h"
#include "conv.h"

/* globals from sfi.c */

/* Simulation tables */
SYSTEM_INFO **lm_system_table,  /* ptr to system array      */
DEFINITION_INFO **lm_def_id_table,      /* ptr to def id array      */
INSTANCE_INFO **lm_inst_id_table;       /* ptr to instance id array */
INSTANCE_INFO **lm_free_instance_id,
u_short lm_def_id_table_size;
u_short lm_inst_id_table_size,
short lm_def_id_avail;

/* Pointers to Entities selected */
SYSTEM_INFO *lm_system_selected;
DEFINITION_INFO *lm_definition_selected,
INSTANCE_INFO *lm_instance_selected;
u_long lm_last_definition_id_specified,
u_long lm_last_instance_id_specified,

/* Logic level mapping */
USER_TO_LM_LOGIC_LEVEL lm_user_to_lm_logic_level_map[MAX_LOGIC_STATE];
u_short lm_to_user_logic_level_map[MAX_OUTPUT_LOGIC_SIZE],
u_short lm_logic_level_map_count;

/* File processing */
FILE_INFO *lm_vector_file_ptr,
FILE_INFO *lm_timing_file_ptr;

/* Temporary buffer for DAMDEF processing */
char *lm_temp_buffer,
char *lm_tbuf_ptr,
char *lm_max_tbuf_addr;

/* Simulation characteristics */
u_short lm_sim_verified,
u_long lm_gbl_simulator_type;
u_long lm_gbl_time_scale_number,
long lm_gbl_time_scale_units,
u_char lm_gbl_divide_delay;
u_long lm_gbl_time_scale,
u_long lm_gbl_half_time_scale,

u_long lm_simulation_time;
u_short lm_host_file_opened,

#ifdef DEBUG
u_char lm_debug[MAX_DEBUG];
#endif

char lm_gbl_username[MAX_STRING_LENGTH],
char lm_gbl_hostname[MAX_STRING_LENGTH],

/* sfi.c former static variables */

short lm_get_pin_value_type,
u_short lm_first_call,
FILE *lm_save_set,

char *lm_modeler_list_buf[MAX_SYSTEM_TABLE_SIZE];

long lm_iul_users[MAX_USER_COUNT],
char *lm_iul_hostnames[MAX_USER_COUNT];
char *lm_iul_usernames[MAX_USER_COUNT],
char lm_user_hbuf[MAX_USER_COUNT * MAX_STRING_LENGTH],
char lm_user_ubuf[MAX_USER_COUNT * MAX_STRING_LENGTH];

long lm_idl_device_numbers[MAX_LANE_COUNT * MAX_SLOT_COUNT];
char *lm_idl_device_names[MAX_LANE_COUNT * MAX_SLOT_COUNT],
char lm_idl_buf[MAX_LANE_COUNT * MAX_SLOT_COUNT * MAX_STRING_LENGTH],

char lm_gm_error_string[MAX_MESSAGE];

char lm_cdf_modeler_name[MAX_STRING_LENGTH],
char lm_cdf_device_name[MAX_STRING_LENGTH],

char lm_crd_modeler_name[MAX_STRING_LENGTH];
char lm_crd_device_name[MAX_STRING_LENGTH],

char lm_isd_string[MAX_STRING_LENGTH],

long lm_ids_lanes[MAX_LANE_COUNT * MAX_SLOT_COUNT],
long lm_ids_slots[MAX_LANE_COUNT * MAX_SLOT_COUNT],

char lm_idp_string[MAX_STRING_LENGTH],
char lm_idp_string2[MAX_STRING_LENGTH],
char lm_idp_string3[MAX_STRING_LENGTH];

/* access.c former static variables */

char lm_modeler_name_selected[MAX_STRING_LENGTH];
short lm_modeler_fd;

/* network.c global variables */

CONNECTION *lm_table_of_conns[MAX_SYSTEM_TABLE_SIZE + 1],
CONNECTION *lm_global_conn_ptr;

/* timer.c global variables */

u_long lm_tick,

lm_init_globals(simulator_type)
u_long simulator_type,
{

        lm_gbl_simulator_type = simulator_type;

        /* initialize global variables */
```

Copyright 1989
Logic Modeling Systems

| SOURCE PROGRAM | DATE | PAGE # |
| --- | --- | --- |
| sfi/globals.c | 5/23/89 | 2/10 |
| | TIME 1:20:51 pm | |

SOURCE TEXT

```
        lm_last_definition_id_specified = -1;
        lm_last_instance_id_specified = -1;
        lm_logic_level_map_count = MAX_LOGIC_STATE + 1;
        lm_vector_file_ptr = NULL;
        lm_timing_file_ptr = NULL;
        lm_sim_verified = 0;
        lm_gbl_time_scale_number = -1;
        lm_host_file_opened = 0;
        lm_get_pin_value_type = -1;

        lm_simulation_time = (u_long) 0;

        (void)strcpy(lm_gbl_username, "nouser");
        (void)strcpy(lm_gbl_hostname, "nohost");

        lm_first_call = TRUE;
        lm_save_set = NULL;

        lm_init_lists();

        /* from access.c: */

        (void) strcpy(lm_modeler_name_selected, "(none)");
        lm_modeler_fd = -1;

        /* from timer.c: */

        lm_tick = 0;
}

lm_init_lists()
{
        register int i;

        /* sfi.c: */
        /* lm_inquire_modeler_list: */

        for (i = 0; i < MAX_SYSTEM_TABLE_SIZE; ++i)
                lm_modeler_list_buf[i] = NULL;

        /* lm_inquire_user_list: */

        for (i = 0; i < MAX_USER_COUNT; ++i) {
                lm_iul_hostnames[i] = &(lm_user_hbuf[i * MAX_STRING_LENGTH]);
                lm_iul_usernames[i] = &(lm_user_ubuf[i * MAX_STRING_LENGTH]);
        }

        /* lm_inquire_device_list: */

        for (i = 0; i < MAX_LANE_COUNT * MAX_SLOT_COUNT; ++i) {
                lm_idl_device_names[i] = &(lm_idl_buf[i * MAX_STRING_LENGTH]);
        }

        /* network.c: */

        lm_global_conn_ptr = 0;
        for (i = 0; i <= MAX_SYSTEM_TABLE_SIZE; ++i)
                lm_table_of_conns[i] = NULL;
}
```

Copyright 1989 Logic Modeling Systems

| HEADER FILE | DATE | PAGE # |
|---|---|---|
| sfi/globals.h | 5/23/89 | 1/11 |
| | TIME 1:20:52 pm | |

LINE # HEADER TEXT

```
/* SCCS_ID: globals.h rev 3.1, 4/24/89 at 07:35:49 */

/* globals from sfi.c */

/* Simulation tables */
extern SYSTEM_INFO **lm_system_table,   /* ptr to system array        */
extern DEFINITION_INFO **lm_def_id_table,       /* ptr to def id array     */
extern INSTANCE_INFO **lm_inst_id_table,        /* ptr to instance id array */
extern INSTANCE_INFO **lm_free_instance_id,
extern u_short lm_def_id_table_size,
extern u_short lm_inst_id_table_size,
extern short lm_def_id_avail,

/* Pointers to Entities selected */
extern SYSTEM_INFO *lm_system_selected,
extern DEFINITION_INFO *lm_definition_selected,
extern INSTANCE_INFO *lm_instance_selected,
extern u_long lm_last_definition_id_specified,
extern u_long lm_last_instance_id_specified,

/* Logic level mapping */
extern USER_TO_LM_LOGIC_LEVEL lm_user_to_lm_logic_level_map[],
extern u_short lm_to_user_logic_level_map[],
extern u_short lm_logic_level_map_count,

/* File processing */
extern FILE_INFO *lm_vector_file_ptr;
extern FILE_INFO *lm_timing_file_ptr,

/* Temporary buffer for DARDEF processing */
extern char *lm_temp_buffer,
extern char *lm_tbuf_ptr,
extern char *lm_max_tbuf_addr;

/* Simulation characteristics */
extern u_short lm_sim_verified,
extern u_long lm_gbl_simulator_type,
extern u_long lm_gbl_time_scale_number;
extern long lm_gbl_time_scale_units,
extern u_char lm_gbl_divide_delay,
extern u_long lm_gbl_time_scale,
extern u_long lm_gbl_half_time_scale,

extern u_long lm_simulation_time,
extern u_short lm_host_file_opened,

#ifdef DEBUG
extern u_char lm_debug[],
#endif

extern long lm_input_pin_count;
extern long lm_output_pin_count,
#ifdef DEBUG
extern long lm_start_time,
extern long lm_total_time,
#endif

extern char lm_gbl_username[],
extern char lm_gbl_hostname[];


/* sfi.c former static variables */

extern short lm_get_pin_value_type,
extern u_short lm_first_call,
extern FILE *lm_save_set,

extern char *lm_modeler_list_buf[],

extern long lm_iul_users[],
extern char *lm_iul_hostnames[],
extern char *lm_iul_usernames[];
extern char lm_user_hbuf[],
extern char lm_user_ubuf[];

extern long lm_idl_device_numbers[];
extern char *lm_idl_device_names[],
extern char lm_idl_buf[],

extern char lm_gm_error_string[],

extern char lm_odf_modeler_name[],
extern char lm_cdf_device_name[];

extern char lm_crd_modeler_name[],
extern char lm_crd_device_name[],

extern char lm_ind_string[],

extern long lm_ida_lanes[],
extern long lm_ida_slots[],

extern char lm_idp_string[],
extern char lm_idp_string2[],
extern char lm_idp_string3[],

/* access.c former static variables */

extern char lm_modeler_name_selected[];
extern short lm_modeler_fd,

/* network.c global variables */

extern CONNECTION *lm_table_of_conns[],
extern CONNECTION *lm_global_conn_ptr;

/* timer.c global variables */

extern u_long lm_tick;
```

Copyright 1989 Logic Modeling Systems

SOURCE PROGRAM sfi/lmtest.c | DATE 5/23/89 | TIME 1:20:52 pm | PAGE # 1/12

SOURCE TEXT

```
/* SCCS_ID: lmtest.c rev 3.2, 5/9/89 at 15:52:50 */

/*
 * LM-1000 Test Vector Player
 *
 *   usage:
 *     lm_play_test_vectors
 *       ( instance_or_fault_id ,
 *         test_vector_file ,
 *         discrepancy_report_file ,
 *         discrepancy_cutoff ,
 *         number_of_sets ,
 *         number_of_gets ,
 *         number_of_time_settings ,
 *         number_of_pin_map_settings ,
 *         number_of_discrepancies
 *       ) ;
 *       long instance_or_fault_id ;
 *       char
 *         *test_vector_file ,
 *         *discrepancy_report_file ;
 *       unsigned long discrepancy_cutoff ;
 *       unsigned long
 *         *number_of_sets ,
 *         *number_of_gets ,
 *         *number_of_time_settings ,
 *         *number_of_pin_map_settings ,
 *         *number_of_discrepancies ;
 *
 *     instance_or_fault_id: id of instance or fault to which to play vectors
 *     test_vector_file: name of file containing test vectors to play (.TST)
 *       if LM_NO_FILE is passed, test vectors are taken from stdin
 *     discrepancy_report_file: name of file to which to write discrepancies
 *       if LM_NO_FILE is passed, discrepancies are written to stdout
 *     discrepancy_cutoff: count of number of discrepancies before quitting
 *       use 0 to indicate never quit
 *     number_of_sets: number of times lm_set_pin_value() was called
 *     number_of_gets: number of times lm_get_pin_change() was called
 *     number_of_time_settings: number of calls to lm_set_simulation_time()
 *     number_of_pin_map_settings: number of calls to lm_set_pin_map()
 *     number_of_discrepancies: number of discrepant vectors
 *
 *   resolves test vector filename unless LM_NO_FILE is passed:
 *     lm_resolve_library_file("LM_LIB",test_vector_file,tv_fn,sizeof(tv_fn))
 *   inquires the associated definition id of the passed instance:
 *     lm_inquire_instance(instance,LM_ASSOCIATED_DEFINITION,&definition)
 *   sets the pin map of the definition using test vector file header:
 *     lm_set_pin_map(definition,pin_name,LM_DONT_CARE,column-1)
 *       for each pin_name/column pair in the header
 *   plays vectors using the instance and the rest of test vector stream:
 *     lm_set_simulation_time((unsigned long)0,timestamp)
 *     lm_get_pin_change()
 *     lm_set_pin_value()
 *
 *   returns LM_SUCCESS if no warnings or errors
 *     otherwise returns LM_WARNING if no errors
 *       otherwise returns LM_ERROR
 */

# include <stdio.h>
# include "common.h"
# include "message.h"
# include "lm_sfi.h"

# define USE_MACROS
# define MAX_PIN_COUNT 640
# define MAX_TOKEN_LENGTH 1024
# define MAX_TV_FILENAME_LENGTH 256
# define LM_LIBRARY_VARIABLE_NAME "LM_LIB"

char lm_obscure_dont_set_pinmap_flag = 0 ;

static char tok [ MAX_TOKEN_LENGTH ] ;
static char pin [ MAX_TOKEN_LENGTH ] ;
static char tv_filename [ MAX_TV_FILENAME_LENGTH ] ;
static unsigned long
  timestamp ,
  set_count ,
  get_count ,
  vector_count ,
  pin_count ,
  disc_count ;
static FILE
  *tv_file ,
  *dr_file ;
static long definition_id ;
static struct test_pin
  { long in_val , out_val ;
    char tv_sym , is_in , is_out ;
  } test_pins [ MAX_PIN_COUNT ] ;

static unsigned short
lxerror ( str )
  register char *str ;
  { lm_queue_message
      ( ERROR_MSG ,
        "test vector lexical error: %s" ,
        str
      ) ;
    return 0 ;
  } /* lxerror */

static unsigned short
illchar ( c )
  register char c ;
  { lm_queue_message
      ( ERROR_MSG ,
        "test vector lexical error: illegal character: '%c'" ,
        c
      ) ;
    return 0 ;
  } /* illchar */

static unsigned short
cscan ( )
  /* scan a (character) token from tv_file, store it in tok */
  { register short nextc ;
    nextc = getc ( tv_file ) ;
    while ( nextc != EOF )
      switch ( nextc )
```

Copyright 1989 Logic Modeling Systems

| SOURCE PROGRAM | DATE | TIME | PAGE # |
|---|---|---|---|
| sfi/lmtest.c | 5/23/89 | 1:20:52 pm | 2/13 |

SOURCE TEXT

```
          { case '#' :
              while ( ( nextc = getc ( tv_file ) ) != EOF && nextc != '\n' ) ;
              if ( nextc == EOF )
                return lerror ( "unterminated comment" ) ;
              /* fall through */
            case 'D' :
            case 'U' :
            case 'N' :
            case 'Z' :
            case 'L' :
            case 'H' :
            case 'X' :
            case 'T' :
            case '0' :
            case '1' :
            case '?' :
            case 'F' :
            case ')' :
            case '\n' :
              *tok = nextc ;
              tok [ 1 ] = '\0' ;
              return 1 ;
            default :
              if ( nextc >= '\0' && nextc <= ' ' )
                { while
                    ( ( nextc = getc ( tv_file ) ) >= '\0' &&
                      nextc <= ' ' && nextc != '\n'
                    ) ;
                }
              else
                return illchar ( nextc ) ;
              break ;
          }
    *tok = '\0' ;
    return 1 ;
  } /* cscan */

static unsigned short
hscan ( )
  /* scan a (header) token from tv_file, store it in tok */
  { register short nextc ;
    register char *t ;
    nextc = getc ( tv_file ) ;
    while ( nextc != EOF )
      switch ( nextc )
        { case '#' :
            while
              ( ( nextc = getc ( tv_file ) ) != EOF &&
                nextc != '\n' && nextc >= '\0' && nextc <= ' '
              ) ;
            if ( nextc != EOF && nextc != '\n' )
              { if ( nextc == 't' )
                  { t = tok ;
                    *t++ = nextc ;
                    nextc = getc ( tv_file ) ;
                    if ( nextc == 'e' )
                      { *t++ = nextc ;
                        nextc = getc ( tv_file ) ;
                        if ( nextc == 's' )
                          { *t++ = nextc ;
                            nextc = getc ( tv_file ) ;
                            if ( nextc == 't' )
                              { *t++ = nextc ;
                                while
                                  ( ( nextc = getc ( tv_file ) ) != EOF &&
                                    nextc != '\n'
                                  ) ;
                                if ( nextc == EOF )
                                  return lerror ( "unterminated comment" ) ;
                                *t = '\0' ;
                                return 1 ;
                              }
                          }
                      }
                  }
                if ( nextc != EOF && nextc != '\n' )
                  while
                    ( ( nextc = getc ( tv_file ) ) != EOF && nextc != '\n'
                    ) ;
              }
            if ( nextc == EOF )
              return lerror ( "unterminated comment" ) ;
            /* fall through */
          case 'I' :
          case 'O' :
          case '(' :
          case '\n' :
            *tok = nextc ;
            tok [ 1 ] = '\0' ;
            return 1 ;
          default :
            if ( nextc >= '0' && nextc <= '9' )
              { t = tok ;
                *t++ = nextc ;
                while ( ( nextc = getc ( tv_file ) ) >= '0' && nextc <= '9' )
                  *t++ = nextc ;
                ( void ) ungetc ( nextc , tv_file ) ;
                *t = '\0' ;
                return 1 ;
              }
            else if ( nextc >= '\0' && nextc <= ' ' )
              { while
                  ( ( nextc = getc ( tv_file ) ) >= '\0' &&
                    nextc <= ' ' && nextc != '\n'
                  ) ;
              }
            else
              return illchar ( nextc ) ;
            break ;
        }
    *tok = '\0' ;
    return 1 ;
  } /* hscan */

static unsigned short
sscan ( )
  /* scan a (signalname) token from tv_file, store it in tok */
  { register short nextc ;
    register char *t ;
    nextc = getc ( tv_file ) ;
```

Copyright 1989 Logic Modeling Systems

SOURCE PROGRAM sfi/lmtest.c | DATE 5/23/89 | TIME 1:20:52 pm | PAGE # 3/14

SOURCE TEXT

```
  while ( nextc != EOF )
    switch ( nextc )
      { case '#' :
          while
            ( ( nextc = getc ( tv_file ) ) != EOF &&
              nextc != '\n' && nextc >= '\0' && nextc <= ' '
            ) ;
          if ( nextc != EOF && nextc != '\n' )
            { if ( nextc == 'p' )
                { t = tok ;
                  *t++ = nextc ;
                  nextc = getc ( tv_file ) ;
                  if ( nextc == 'a' )
                    { *t++ = nextc ;
                      nextc = getc ( tv_file ) ;
                      if ( nextc == 't' )
                        { *t++ = nextc ;
                          nextc = getc ( tv_file ) ;
                          if ( nextc == 't' )
                            { *t++ = nextc ;
                              nextc = getc ( tv_file ) ;
                              if ( nextc == 'e' )
                                { *t++ = nextc ;
                                  nextc = getc ( tv_file ) ;
                                  if ( nextc == 'r' )
                                    { *t++ = nextc ;
                                      nextc = getc ( tv_file ) ;
                                      if ( nextc == 'n' )
                                        { *t++ = nextc ;
                                          nextc = getc ( tv_file ) ;
                                          if ( nextc == 's' )
                                            { *t++ = nextc ;
                                              while
                                                ( ( nextc = getc ( tv_file )
                                                  ) != EOF &&
                                                  nextc != '\n'
                                                ) ;
                                              if ( nextc == EOF )
                                                return
                                                  lerror
                                                    ( "unterminated comment"
                                                    ) ;
                                              *t = '\0' ;
                                              return 1 ;
                                            }
                                        }
                                    }
                                }
                            }
                        }
                    }
                }
            }
          while ( ( nextc = getc ( tv_file ) ) != EOF && nextc != '\n' ) ;
          if ( nextc == EOF )
            return lerror ( "unterminated comment" ) ;
          /* fall through */
        case '\n' :
          *tok = nextc ;
          tok [ 1 ] = '\0' ;
          return 1 ;
        default :
          if ( nextc >= '!' && nextc <= '~' )
            { t = tok ;
              *t++ = nextc ;
              while
                ( ( nextc = getc ( tv_file ) ) >= '!' &&
                  nextc <= '~' && nextc != '#'
                )
                *t++ = nextc ;
              ( void ) ungetc ( nextc , tv_file ) ;
              *t = '\0' ;
              return 1 ;
            }
          else if ( nextc >= '\0' && nextc <= ' ' )
            { while
                ( ( nextc = getc ( tv_file ) ) >= '\0' &&
                  nextc <= ' ' && nextc != '\n'
                ) ;
            }
          else
            return illchar ( nextc ) ;
          break ;
      }
  *tok = '\0' ;
  return 1 ;
} /* sscan */

static unsigned short
nscan ( )
  /* scan a (number) token from tv_file, store it in tok */
  { register short nextc ;
    register char *t ;
    nextc = getc ( tv_file ) ;
    while ( nextc != EOF )
      switch ( nextc )
        { case '#' :
            while ( ( nextc = getc ( tv_file ) ) != EOF && nextc != '\n' ) ;
            if ( nextc == EOF )
              return lerror ( "unterminated comment" ) ;
            /* fall through */
          case '\n' :
            *tok = nextc ;
            tok [ 1 ] = '\0' ;
            return 1 ;
          case '.' :
            t = tok ;
            *t++ = nextc ;
            nextc = getc ( tv_file ) ;
            if ( nextc >= '0' && nextc <= '9' )
              { do
                  *t++ = nextc ;
                while ( ( nextc = getc ( tv_file ) ) >= '0' && nextc <= '9' ) ;
                ( void ) ungetc ( nextc , tv_file ) ;
                *t = '\0' ;
                return 1 ;
              }
            else
              return lerror ( "digit expected after '.'" ) ;
          case '\\' :
```

Copyright 1989 Logic Modeling Systems

SOURCE PROGRAM sfi/lmtest.c | DATE 5/23/89 | TIME 1:20:52 pm | PAGE # 4/15

LINE # SOURCE TEXT

```
              nextc = getc ( tv_file ) ;
              if ( nextc != '\n' )
                return lerror ( "newline expected after backslash" ) ;
              nextc = getc ( tv_file ) ;
              break ;
            default :
              if ( nextc >= '0' && nextc <= '9' )
                { t = tok ;
                  *t++ = nextc ;
                  while ( ( nextc = getc ( tv_file ) ) >= '0' && nextc <= '9' )
                    *t++ = nextc ;
                  if ( nextc == '.' )
                    { *t++ = nextc ;
                      while
                        ( ( nextc = getc ( tv_file ) ) >= '0' && nextc <= '9'
                        )
                        *t++ = nextc ;
                      ( void ) ungetc ( nextc , tv_file ) ;
                    }
                  else
                    ( void ) ungetc ( nextc , tv_file ) ;
                  *t = '\0' ;
                  return 1 ;
                }
              else if ( nextc >= '\0' && nextc <= ' ' )
                { while
                    ( ( nextc = getc ( tv_file ) ) >= '\0' &&
                      nextc <= ' ' && nextc != '\n'
                    ) ;
                }
              else
                return illchar ( nextc ) ;
              break ;
          }
    *tok = '\0' ;
    return 1 ;
  } /* nscan */

static unsigned short
vscan ( )
  /* scan a (vector) token from tv_file, store it in tok */
  { register short nextc ;
    nextc = getc ( tv_file ) ;
    while ( nextc != EOF )
      switch ( nextc )
        { case '#' :
            while ( ( nextc = getc ( tv_file ) ) != EOF && nextc != '\n' ) ;
            if ( nextc == EOF )
              return lerror ( "unterminated comment" ) ;
            /* fall through */
          case 'D' :
          case 'U' :
          case 'N' :
          case 'Z' :
          case 'L' :
          case 'H' :
          case 'X' :
          case 'T' :
          case '0' :
          case '1' :
          case '?' :
          case 'F' :
          case '\n' :
            *tok = nextc ;
            tok [ 1 ] = '\0' ;
            return 1 ;
          case '\\' :
            nextc = getc ( tv_file ) ;
            if ( nextc != '\n' )
              return lerror ( "newline expected after backslash" ) ;
            nextc = getc ( tv_file ) ;
            break ;
          default :
            if ( nextc >= '\0' && nextc <= ' ' )
              { while
                  ( ( nextc = getc ( tv_file ) ) >= '\0' &&
                    nextc <= ' ' && nextc != '\n'
                  ) ;
              }
            else
              return illchar ( nextc ) ;
            break ;
        }
    *tok = '\0' ;
    return 1 ;
  } /* vscan */

static long
tv_error ( str )
  register char *str ;
  { lm_queue_message
      ( ERROR_MSG ,
        "test vector syntax error: %s" ,
        str
      ) ;
    return LM_ERROR ;
  } /* tv_error */

static long
tv_check ( str )
  register char *str ;
  { lm_queue_message
      ( ERROR_MSG ,
        "test vector constraint error: %s" ,
        str
      ) ;
    return LM_ERROR ;
  } /* tv_check */

static long
tv_internal ( str )
  register char *str ;
  { lm_queue_message
      ( ERROR_MSG ,
        "test vector internal error: %s" ,
        str
      ) ;
    return LM_ERROR ;
  } /* tv_internal */
```

Copyright 1989 Logic Modeling Systems

SOURCE PROGRAM sfi/lmtest.c | DATE 5/23/89 | TIME 1:20:52 pm | PAGE # 5/16

LINE # SOURCE TEXT

```
static unsigned long
value_of ( str )
  register char *str ;
  /* returns the value of the passed string */
  { register unsigned long ret = 0 ;
    while ( *str != '\0' )
      { if ( *str >= '0' && *str <= '9' )
          { ret *= 10 ;
            ret += *str - '0' ;
          }
        else
          return -1 ;
        ++str ;
      }
    return ret ;
  } /* value_of */

# ifdef USE_MACROS
# define is_name(str)(*(str)>='!'&&*(str)<='~'&&*(str)!='$')
# else /* USE_MACROS */
static unsigned short
is_name ( str )
  char *str ;
  { return *str >= '!' && *str <= '~' && *str != '$' ;
  } /* is_name */
# endif /* USE_MACROS */

# ifdef USE_MACROS
# define is_column(str)(*(str)>='0'&&*(str)<='9')
# else /* USE_MACROS */
static unsigned short
is_column ( str )
  char *str ;
  { return *str >= '0' && *str <= '9' ;
  } /* is_column */
# endif /* USE_MACROS */

# ifdef USE_MACROS
# define is_state_char(str)(state_char_table[*(str)&0xFF])
static char state_char_table [ 256 ] =
  { 0 , 0 , 0 , 0 , 0 , 0 , 0 , 0 , 0 , 0 , 0 , 0 , 0 , 0 , 0 , 0 , /*^@ to ^O*/
    0 , 0 , 0 , 0 , 0 , 0 , 0 , 0 , 0 , 0 , 0 , 0 , 0 , 0 , 0 , 0 , /*^P to ^_*/
    0 , 0 , 0 , 0 , 0 , 0 , 0 , 0 , 0 , 0 , 0 , 0 , 0 , 0 , 0 , 0 , /*' ' to /*/
    1 , 1 , 0 , 0 , 0 , 0 , 0 , 0 , 0 , 0 , 0 , 0 , 0 , 0 , 0 , 1 , /*0 to ?*/
    0 , 0 , 0 , 0 , 1 , 0 , 1 , 0 , 1 , 0 , 0 , 0 , 1 , 0 , 1 , 0 , /*@ to O*/
    0 , 0 , 0 , 0 , 1 , 1 , 0 , 0 , 1 , 0 , 1 , 0 , 0 , 0 , 0 , 0 , /*P to _*/
    0 , 0 , 0 , 0 , 0 , 0 , 0 , 0 , 0 , 0 , 0 , 0 , 0 , 0 , 0 , 0 , /*` to o*/
    0 , 0 , 0 , 0 , 0 , 0 , 0 , 0 , 0 , 0 , 0 , 0 , 0 , 0 , 0 , 0 , /*p to ^?*/
    0 , 0 , 0 , 0 , 0 , 0 , 0 , 0 , 0 , 0 , 0 , 0 , 0 , 0 , 0 , 0 ,
    0 , 0 , 0 , 0 , 0 , 0 , 0 , 0 , 0 , 0 , 0 , 0 , 0 , 0 , 0 , 0 ,
    0 , 0 , 0 , 0 , 0 , 0 , 0 , 0 , 0 , 0 , 0 , 0 , 0 , 0 , 0 , 0 ,
    0 , 0 , 0 , 0 , 0 , 0 , 0 , 0 , 0 , 0 , 0 , 0 , 0 , 0 , 0 , 0 ,
    0 , 0 , 0 , 0 , 0 , 0 , 0 , 0 , 0 , 0 , 0 , 0 , 0 , 0 , 0 , 0 ,
    0 , 0 , 0 , 0 , 0 , 0 , 0 , 0 , 0 , 0 , 0 , 0 , 0 , 0 , 0 , 0 ,
    0 , 0 , 0 , 0 , 0 , 0 , 0 , 0 , 0 , 0 , 0 , 0 , 0 , 0 , 0 , 0 ,
    0 , 0 , 0 , 0 , 0 , 0 , 0 , 0 , 0 , 0 , 0 , 0 , 0 , 0 , 0 , 0
  } ;
# else /* USE_MACROS */
static unsigned short
is_state_char ( str )
  char *str ;
  { switch ( *str )
      { case 'D' :
        case 'U' :
        case 'N' :
        case 'Z' :
        case 'L' :
        case 'H' :
        case 'X' :
        case 'T' :
        case '0' :
        case '1' :
        case '?' :
        case 'F' :
          return 1 ;
        default : return 0 ;
      }
  } /* is_state_char */
# endif /* USE_MACROS */

# ifdef USE_MACROS
# define is_number(str)(*(str)>='0'&&*(str)<='9'||*(str)=='.')
# else /* USE_MACROS */
static unsigned short
is_number ( str )
  char *str ;
  { return *str >= '0' && *str <= '9' || *str == '.' ;
  } /* is_number */
# endif /* USE_MACROS */

static double
float_value ( str )
  register char *str ;
  { double val = 0 , power = 0 ;
    char *s = str ;
    while ( *str != '\0' )
      { switch ( *str )
          { case '.' :
              if ( power )
                { lm_queue_message ( ERROR_MSG , "bad timestamp: %s" , s ) ;
                  return -1 ;
                }
              power = 10 ;
              break ;
            case '0' :
            case '1' :
            case '2' :
            case '3' :
            case '4' :
            case '5' :
            case '6' :
            case '7' :
            case '8' :
            case '9' :
              if ( power )
                { val += ( *str - '0' ) / power ;
                  power *= 10 ;
                }
              else
                { val *= 10 ;
```

Copyright 1989 Logic Modeling Systems

| SOURCE PROGRAM | DATE | PAGE # |
|---|---|---|
| sfi/lmtest.c | 5/23/89 | 6/17 |
| | TIME 1:20:52 pm | |

SOURCE TEXT

```
                    val += *str - '0' ;
                  }
                break ;
              default :
                lm_queue_message ( ERROR_MSG , "bad timestamp: %s" , s ) ;
                return -1 ;
            }
          ++str ;
        }
      return val ;
    } /* float_value */

# ifdef USE_MACROS
# define is_known_direction(c)(known_direction_table[(c)&0xFF])
static char known_direction_table [ 256 ] =
  { 0 , 0 , 0 , 0 , 0 , 0 , 0 , 0 , 0 , 0 , 0 , 0 , 0 , 0 , 0 , 0 , /*^@ to ^O*/
    0 , 0 , 0 , 0 , 0 , 0 , 0 , 0 , 0 , 0 , 0 , 0 , 0 , 0 , 0 , 0 , /*^P to ^_*/
    0 , 0 , 0 , 0 , 0 , 0 , 0 , 0 , 0 , 0 , 0 , 0 , 0 , 0 , 0 , 0 , /*' ' to /*/
    0 , 0 , 0 , 0 , 0 , 0 , 0 , 0 , 0 , 0 , 0 , 0 , 0 , 0 , 0 , 0 , /*0 to ?*/
    0 , 0 , 0 , 0 , 1 , 0 , 0 , 0 , 1 , 0 , 0 , 0 , 1 , 0 , 1 , 0 , /*@ to O*/
    0 , 0 , 0 , 0 , 1 , 1 , 0 , 0 , 1 , 0 , 1 , 0 , 0 , 0 , 0 , 0 , /*P to _*/
    0 , 0 , 0 , 0 , 0 , 0 , 0 , 0 , 0 , 0 , 0 , 0 , 0 , 0 , 0 , 0 , /*` to o*/
    0 , 0 , 0 , 0 , 0 , 0 , 0 , 0 , 0 , 0 , 0 , 0 , 0 , 0 , 0 , 0 , /*p to ^?*/
    0 , 0 , 0 , 0 , 0 , 0 , 0 , 0 , 0 , 0 , 0 , 0 , 0 , 0 , 0 , 0 ,
    0 , 0 , 0 , 0 , 0 , 0 , 0 , 0 , 0 , 0 , 0 , 0 , 0 , 0 , 0 , 0 ,
    0 , 0 , 0 , 0 , 0 , 0 , 0 , 0 , 0 , 0 , 0 , 0 , 0 , 0 , 0 , 0 ,
    0 , 0 , 0 , 0 , 0 , 0 , 0 , 0 , 0 , 0 , 0 , 0 , 0 , 0 , 0 , 0 ,
    0 , 0 , 0 , 0 , 0 , 0 , 0 , 0 , 0 , 0 , 0 , 0 , 0 , 0 , 0 , 0 ,
    0 , 0 , 0 , 0 , 0 , 0 , 0 , 0 , 0 , 0 , 0 , 0 , 0 , 0 , 0 , 0 ,
    0 , 0 , 0 , 0 , 0 , 0 , 0 , 0 , 0 , 0 , 0 , 0 , 0 , 0 , 0 , 0 ,
    0 , 0 , 0 , 0 , 0 , 0 , 0 , 0 , 0 , 0 , 0 , 0 , 0 , 0 , 0 , 0
  } ;
# else /* USE_MACROS */
static unsigned short
is_known_direction ( c )
  char c ;
  { switch ( c )
      { case 'D' :
        case 'U' :
        case 'Z' :
        case 'N' :
        case 'L' :
        case 'H' :
        case 'T' :
        case 'X' :
          return 1 ;
        default : return 0 ;
      }
  } /* is_known_direction */
# endif /* USE_MACROS */

# ifdef USE_MACROS
# define is_sense(c)((c)=='L'||(c)=='H'||(c)=='T'||(c)=='X')
# else /* USE_MACROS */
static unsigned short
is_sense ( c )
  char c ;
  { switch ( c )
      { case 'L' :
        case 'H' :
        case 'T' :
        case 'X' :
          return 1 ;
        default : return 0 ;
      }
  } /* is_sense */
# endif /* USE_MACROS */

# ifdef USE_MACROS
# define is_drive(c)((c)=='D'||(c)=='U'||(c)=='Z'||(c)=='N')
# else /* USE_MACROS */
static unsigned short
is_drive ( c )
  char c ;
  { switch ( c )
      { case 'D' :
        case 'U' :
        case 'Z' :
        case 'N' :
          return 1 ;
        default : return 0 ;
      }
  } /* is_drive */
# endif /* USE_MACROS */

# ifdef USE_MACROS
# define map_symbol(c)((c)=='D'?LM_LOGIC_ZERO:(c)=='U'?LM_LOGIC_ONE:(c)=='Z'?LM_LOGIC_FLOAT:(c)=='N'?LM_LOGIC_UNKNOWN:LM_LOGIC_SIMULATOR)
# else /* USE_MACROS */
static long
map_symbol ( c )
  char c ;
  { switch ( c )
      { case 'D' : return LM_LOGIC_ZERO ;
        case 'U' : return LM_LOGIC_ONE ;
        case 'Z' : return LM_LOGIC_FLOAT ;
        case 'N' : return LM_LOGIC_UNKNOWN ;
        default : return LM_LOGIC_SIMULATOR ;
      }
  } /* map_symbol */
# endif /* USE_MACROS */

# ifdef USE_MACROS
# define unmap_symbol(lev)((lev)==LM_LOGIC_ZERO||(lev)==LM_LOGIC_SOFT_ZERO?'L':(lev)==LM_LOGIC_ONE||(lev)==LM_LOGIC_SOFT_ONE?'H':(lev)==LM_LOG
IC_FLOAT?'T':(lev)==LM_LOGIC_UNKNOWN?'X':'?')
# else /* USE_MACROS */
static char
unmap_symbol ( lev )
  long lev ;
  { switch ( lev )
      { case LM_LOGIC_ZERO : case LM_LOGIC_SOFT_ZERO : return 'L' ;
        case LM_LOGIC_ONE : case LM_LOGIC_SOFT_ONE : return 'H' ;
        case LM_LOGIC_FLOAT : return 'T' ;
        case LM_LOGIC_UNKNOWN : return 'X' ;
        default : return '?' ;
      }
  } /* unmap_symbol */
# endif /* USE_MACROS */

# ifdef USE_MACROS
```

Copyright 1989 Logic Modeling Systems

| SOURCE PROGRAM | DATE 5/23/89 | PAGE # |
|---|---|---|
| sfi/lmtest.c | TIME 1:20:52 pm | 7/18 |

SOURCE TEXT

```
# define match(val,sym)((val)==LM_LOGIC_SIMULATOR||(sym)=='X'?1:(sym)=='L'?(val)==LM_LOGIC_ZERO||(val)==LM_LOGIC_SOFT_ZERO:(sym)=='H'?(val)==L
M_LOGIC_ONE||(val)==LM_LOGIC_SOFT_ONE:(sym)=='T'?(val)==LM_LOGIC_FLOAT:0)
# else /* USE_MACROS */
static unsigned short
match ( val , sym )
  long val ;
  char sym ;
  { if ( val == LM_LOGIC_SIMULATOR || sym == 'X' )
      return 1 ;
    switch ( sym )
      { case 'L' : return val == LM_LOGIC_ZERO || val == LM_LOGIC_SOFT_ZERO ;
        case 'H' : return val == LM_LOGIC_ONE || val == LM_LOGIC_SOFT_ONE ;
        case 'T' : return val == LM_LOGIC_FLOAT ;
        default : return 0 ;
      }
  } /* match */
# endif /* USE_MACROS */

lm_play_test_vectors
  ( instance_or_fault_id ,
    test_vector_file ,
    discrepancy_report_file ,
    discrepancy_cutoff ,
    number_of_sets ,
    number_of_gets ,
    number_of_time_settings ,
    number_of_pin_map_settings ,
    number_of_discrepancies
  )
  long instance_or_fault_id ;
  char
    *test_vector_file ,
    *discrepancy_report_file ;
  unsigned long discrepancy_cutoff ;
  unsigned long
    *number_of_sets ,
    *number_of_gets ,
    *number_of_time_settings ,
    *number_of_pin_map_settings ,
    *number_of_discrepancies ;
  { register long ret ;
    long
      pin_id ,
      value ,
      dont_care,
      dont_care2,
      dont_care3,
      dont_care4,
      dont_care5;
    char
      is_in ,
      is_out ,
      i_or_o ,
      done ,
      *mess ;
    register unsigned long column ;
    unsigned long
      max_column = 0 ,
      warnings = 0 ;
    register struct test_pin *test_pin ;
    set_count = *number_of_sets = 0 ;
    get_count = *number_of_gets = 0 ;
    vector_count = *number_of_time_settings = 0 ;
    pin_count = *number_of_pin_map_settings = 0 ;
    disc_count = *number_of_discrepancies = 0 ;
    while
      ( (void) lm_get_message ( & dont_care , & mess ) ,
        dont_care != LM_NO_MORE_MESSAGES
      ) ;
    tv_file = stdin ;
    dr_file = stdout ;
    if ( test_vector_file != LM_NO_FILE )
      { ret =
          lm_resolve_library_file
            ( LM_LIBRARY_VARIABLE_NAME ,
              test_vector_file ,
              tv_filename ,
              ( long ) sizeof ( tv_filename )
            ) ;
        if ( ret == LM_ERROR )
          return LM_ERROR ;
        while
          ( (void) lm_get_message ( & dont_care , & mess ) ,
            dont_care != LM_NO_MORE_MESSAGES
          )
          ( void ) fprintf ( stderr , "LM modeler warning: %s\n" , mess ) ;
        if ( ( tv_file = fopen ( tv_filename , "r" ) ) == NULL )
          { lm_queue_message
              ( ERROR_MSG ,
                "can't open test vector file: %s" ,
                tv_filename
              ) ;
            return LM_ERROR ;
          }
      }
    if ( discrep[illegible]_report_file != LM_NO_FILE )
      if ( ( dr_file = fopen ( discrepancy_report_file , "w" ) ) == NULL )
        { lm_queue_message
            ( ERROR_MSG ,
              "can't create discrepancy report file: %s" ,
              discrepancy_report_file
            ) ;
          if ( tv_file != stdin )
            ( void ) fclose ( tv_file ) ;
          return LM_ERROR ;
        }
    ret =
      lm_inquire_instance
        ( instance_or_fault_id ,
          ( long ) LM_ASSOCIATED_DEFINITION_ID ,
          &definition_id
        ) ;
    if ( ret == LM_ERROR )
      return LM_ERROR ;
    while
      ( (void) lm_get_message ( & dont_care , & mess ) ,
        dont_care != LM_NO_MORE_MESSAGES
      )
      ( void ) fprintf ( stderr , "LM modeler warning: %s\n" , mess ) ;
    do
```

Copyright 1989
Logic Modeling Systems

SOURCE PROGRAM sfi/lmtest.c

DATE 5/23/89 TIME 1:20:52 pm

PAGE # 8/19

LINE # SOURCE TEXT

```
      if ( ! hscan ( ) )
        return LM_ERROR ;
    while ( *tok == '\n' ) ;
    if ( strcmp ( tok , "test" ) )
      return tv_error ( "$test expected" ) ;
    do
      if ( ! sscan ( ) )
        return LM_ERROR ;
    while ( *tok == '\n' ) ;
    do
      { if ( ! is_name ( tok ) )
          return tv_error ( "signal name expected" ) ;
        ( void ) strcpy ( pin , tok ) ;
        if ( ! hscan ( ) )
          return LM_ERROR ;
        if ( ! is_column ( tok ) )
          return tv_error ( "column number expected after signal name" ) ;
        column = value_of ( tok ) ;
        if ( column == 0 || column > MAX_PIN_COUNT )
          return tv_error ( "column number out of range" ) ;
        if ( ! hscan ( ) )
          return LM_ERROR ;
        if ( *tok != 'I' && *tok != 'O' )
          return tv_error ( "I or O expected after column number" ) ;
        if ( *tok == 'I' )
          { is_in = 1 ;
            is_out = 0 ;
          }
        else
          { is_in = 0 ;
            is_out = 1 ;
          }
        i_or_o = *tok ;
        if ( ! hscan ( ) )
          return LM_ERROR ;
        if ( *tok == '(' )
          { if ( ! sscan ( ) )
              return LM_ERROR ;
            if ( ! is_name ( tok ) )
              return tv_error ( "signal name expected after '('" ) ;
            if ( ! cscan ( ) )
              return LM_ERROR ;
            if ( ! is_state_char ( tok ) )
              return tv_error ( "state character expected after signal name" ) ;
            do
              if ( ! cscan ( ) )
                return LM_ERROR ;
            while ( is_state_char ( tok ) ) ;
            if ( *tok != ')' )
              return tv_error ( "')' expected after state character(s)" ) ;
            if ( ! hscan ( ) )
              return LM_ERROR ;
            if ( *tok == 'I' || *tok == 'O' )
              { if ( *tok == i_or_o )
                  return tv_error ( "duplicate pin direction" ) ;
                if ( *tok == 'I' )
                  is_in = 1 ;
                else
                  is_out = 1 ;
                if ( ! hscan ( ) )
                  return LM_ERROR ;
                if ( *tok == '(' )
                  { if ( ! sscan ( ) )
                      return LM_ERROR ;
                    if ( ! is_name ( tok ) )
                      return tv_error ( "signal name expected after '('" ) ;
                    if ( ! cscan ( ) )
                      return LM_ERROR ;
                    if ( ! is_state_char ( tok ) )
                      return
                        tv_error
                          ( "state character expected after signal name"
                          ) ;
                    do
                      if ( ! cscan ( ) )
                        return LM_ERROR ;
                    while ( is_state_char ( tok ) ) ;
                    if ( *tok != ')' )
                      /* These tokens must remain on a single line otherwise
                       * the Apollo SYS5 compiler/preprocessor will die.
                       */
                      return tv_error("')' expected after state character(s)");
                    if ( ! hscan ( ) )
                      return LM_ERROR ;
                    if ( *tok == '\n' )
                      do
                        if ( ! sscan ( ) )
                          return LM_ERROR ;
                      while ( *tok == '\n' ) ;
                    else
                      return tv_error ( "newline expected" ) ;
                  }
                else if ( *tok == '\n' )
                  do
                    if ( ! sscan ( ) )
                      return LM_ERROR ;
                  while ( *tok == '\n' ) ;
                else
                  return tv_error ( "newline expected" ) ;
              }
            else if ( *tok == '\n' )
              do
                if ( ! sscan ( ) )
                  return LM_ERROR ;
              while ( *tok == '\n' ) ;
            else
              return tv_error ( "newline expected" ) ;
          }
        else if ( *tok == 'I' || *tok == 'O' )
          { if ( *tok == i_or_o )
              return tv_error ( "duplicate pin direction" ) ;
            if ( *tok == 'I' )
              is_in = 1 ;
            else
              is_out = 1 ;
            if ( ! hscan ( ) )
              return LM_ERROR ;
            if ( *tok == '(' )
              { if ( ! sscan ( ) )
                  return LM_ERROR ;
```

Copyright 1989
Logic Modeling Systems

SOURCE PROGRAM
sfi/lmtest.c

DATE 5/23/89
TIME 1:20:52 pm
PAGE # 9/20

SOURCE TEXT

LINE #

```
                    if ( ! is_name ( tok ) )
                      return tv_error ( "signal name expected after '('" ) ;
                    if ( ! comma ( ) )
                      return LM_ERROR ;
                    if ( ! is_state_char ( tok ) )
                      return
                        tv_error
                          ( "state character expected after signal name"
                          ) ;
                    do
                      if ( ! sscan ( ) )
                        return LM_ERROR ;
                    while ( is_state_char ( tok ) ) ;
                    if ( *tok != ')' )
                      return tv_error ( "')' expected after state character(s)" ) ;
                    if ( ! hscan ( ) )
                      return LM_ERROR ;
                    if ( *tok == '\n' )
                      do
                        if ( ! nscan ( ) )
                          return LM_ERROR ;
                      while ( *tok == '\n' ) ;
                    else
                      return tv_error ( "newline expected" ) ;
                  }
                else if ( *tok == '\n' )
                  do
                    if ( ! nscan ( ) )
                      return LM_ERROR ;
                  while ( *tok == '\n' ) ;
                else
                  return tv_error ( "newline expected" ) ;
              }
            else if ( *tok == '\n' )
              do
                if ( ! nscan ( ) )
                  return LM_ERROR ;
              while ( *tok == '\n' ) ;
            else
              return tv_error ( "newline expected" ) ;
            ++pin_count ;
            if ( column > max_column )
              max_column = column ;
            if ( ! lm_obscure_dont_set_pinmap_flag )
              { ret =
                  lm_set_pin_map
                    ( definition_id ,
                      pin ,
                      ( long ) LM_DONT_CARE ,
                      ( long ) --column
                    ) ;
                if ( ret == LM_ERROR )
                  return LM_ERROR ;
                while
                  ( (void) lm_get_message ( & dont_care , & mess ) ,
                    dont_care != LM_NO_MORE_MESSAGES
                  )
                  ( void ) fprintf ( stderr , "LM modeler warning: %s\n" , mess ) ;
              }
            test_pin = test_pins + column ;
            test_pin -> tv_sym = 'X' ;
            test_pin -> is_in = is_in ;
            test_pin -> is_out = is_out ;
            test_pin -> in_val = LM_LOGIC_SIMULATOR ;
            test_pin -> out_val = LM_LOGIC_SIMULATOR ;
          }
        while ( *tok != '\0' && strcmp ( tok , "patterns" ) ) ;
        if ( pin_count != max_column )
          { lm_queue_message
              ( ERROR_MSG ,
                "discontiguous columns in %s" ,
                "test vector file"
              ) ;
          }
        if ( *tok == '\0' )
          return tv_error ( "premature EOF" ) ;
        done = 0 ;
        do
          { do
              if ( ! nscan ( ) )
                return LM_ERROR ;
            while ( *tok == '\n' ) ;
            if ( *tok == '\0' )
              done = 1 ;
            else
              { ++vector_count ;
                if ( ! is_number ( tok ) )
                  return tv_error ( "vector timestamp expected" ) ;
                timestamp = float_value ( tok ) ;
                if ( timestamp == -1 )
                  return LM_ERROR ;
                ret =
                  lm_set_simulation_time ( ( unsigned long ) 0 , timestamp ) ;
                if ( ret == LM_ERROR )
                  return LM_ERROR ;
                while
                  ( (void) lm_get_message ( & dont_care , & mess ) ,
                    dont_care != LM_NO_MORE_MESSAGES
                  )
                  ( void ) fprintf ( stderr , "LM modeler warning: %s\n" , mess ) ;
                column = 0 ;
                do
                  { if ( ! vscan ( ) )
                      return LM_ERROR ;
                    if ( is_state_char ( tok ) )
                      { if ( ! is_known_direction ( *tok ) )
                          return tv_check ( "unknown direction symbols illegal" ) ;
                        test_pins [ column++ ] . tv_sym = *tok ;
                      }
                  }
                while ( is_state_char ( tok ) ) ;
                if ( *tok != '\n' )
                  return tv_error ( "newline expected" ) ;
                if ( column != pin_count )
                  return tv_check ( "wrong number of columns" ) ;
                do
                  { ret =
                      lm_get_pin_change
                        ( instance_or_fault_id ,
                          & dont_care ,
```

Copyright 1989 Logic Modeling Systems

SOURCE PROGRAM sfi/lmtest.c | DATE 5/23/89 | TIME 1:20:52 pm | PAGE # 10/21

SOURCE TEXT

```
                    & pin_id ,
                    & value ,
                    & dont_care2 ,
                    ( unsigned long * ) & dont_care3 ,
                    ( unsigned long * ) & dont_care4 ,
                    ( unsigned long * ) & dont_care5
                  ) ;
              if ( ret == LM_ERROR )
                return LM_ERROR ;
              while
                ( (void) lm_get_message ( & dont_care , & mess ) ,
                  dont_care != LM_NO_MORE_MESSAGES
                )
                ( void ) fprintf
                  ( stderr ,
                    "LM modeler warning: %s\n" ,
                    mess
                  ) ;
              ++get_count ;
              if ( pin_id != LM_INVALID_PIN_ID )
                { if ( pin_id >= pin_count )
                    return tv_internal ( "bad pin_id" ) ;
                  test_pins [ pin_id ] . out_val = value ;
                }
            }
          while ( pin_id != LM_INVALID_PIN_ID ) ;
          for
            ( test_pin = test_pins , column = 0 ;
              column < pin_count ;
              ++test_pin , ++column
            )
            if ( test_pin -> is_out )
              if ( is_sense ( test_pin -> tv_sym ) )
                { if ( ! match ( test_pin -> out_val , test_pin -> tv_sym ) )
                    break ;
                }
              else if ( test_pin -> tv_sym != 'T' )
                { if
                    ( test_pin -> out_val != LM_LOGIC_SOFT_ZERO &&
                      test_pin -> out_val != LM_LOGIC_FLOAT &&
                      test_pin -> out_val != LM_LOGIC_SOFT_ONE
                    )
                    break ;
                }
              else
                if ( ! match ( test_pin -> out_val , 'T' ) )
                  break ;
          if ( column != pin_count )
            { ++disc_count ;
              ( void ) fprintf
                ( dr_file ,
                  "discrepancy at vector %lu, time %lu:\n" ,
                  vector_count ,
                  timestamp
                ) ;
              for ( column = 0 ; column < pin_count ; ++column )
                ( void ) fprintf
                  ( dr_file ,
                    "%c" ,
                    test_pins [ column ] . tv_sym
                  ) ;
              ( void ) fprintf ( dr_file , "\n" ) ;
              for
                ( test_pin = test_pins , column = 0 ;
                  column < pin_count ;
                  ++test_pin , ++column
                )
                { i_or_o = ' ' ;
                  if ( test_pin -> is_out )
                    if ( is_sense ( test_pin -> tv_sym ) )
                      { if
                          ( ! match
                            ( test_pin -> out_val ,
                              test_pin -> tv_sym
                            )
                          )
                          i_or_o = unmap_symbol ( test_pin -> out_val ) ;
                      }
                    else if ( test_pin -> tv_sym != 'T' )
                      { if
                          ( test_pin -> out_val != LM_LOGIC_SOFT_ZERO &&
                            test_pin -> out_val != LM_LOGIC_FLOAT &&
                            test_pin -> out_val != LM_LOGIC_SOFT_ONE
                          )
                          i_or_o = unmap_symbol ( test_pin -> out_val ) ;
                      }
                    else
                      if ( ! match ( test_pin -> out_val , 'T' ) )
                        i_or_o = unmap_symbol ( test_pin -> out_val ) ;
                  ( void ) fprintf ( dr_file , "%c" , i_or_o ) ;
                }
              ( void ) fprintf ( dr_file , "\n" ) ;
              if ( ! --discrepancy_cutoff )
                done = 1 ;
            }
          if ( ! done )
            for
              ( test_pin = test_pins , column = 0 ;
                column < pin_count ;
                ++test_pin , ++column
              )
              if ( is_drive ( test_pin -> tv_sym ) )
                { if
                    ( ( value = map_symbol ( test_pin -> tv_sym ) ) !=
                      test_pin -> in_val
                    )
                    { test_pin -> in_val = value ;
                      ret =
                        lm_set_pin_value
                          ( instance_or_fault_id ,
                            ( long ) LM_DONT_CARE ,
                            ( long ) column ,
                            value
                          ) ;
                      if ( ret == LM_ERROR )
                        return LM_ERROR ;
                      while
                        ( (void) lm_get_message ( & dont_care , & mess ) ,
                          dont_care != LM_NO_MORE_MESSAGES
                        )
```

Copyright 1989 Logic Modeling Systems

SOURCE PROGRAM sfi/lmtest.c

DATE 5/23/89 TIME 1:20:52 pm PAGE # 11/22

LINE # SOURCE TEXT

```
                    ( void ) fprintf
                      ( stderr ,
                        "LM modeler warning: %s\n" ,
                        mess
                      ) ;
                    ++set_count ;
                  }
              }
            else
              if
                ( test_pin -> is_in &&
                  test_pin -> is_val != LM_LOGIC_FLOAT
                )
                { test_pin -> is_val = LM_LOGIC_FLOAT ;
                  ret =
                    lm_set_pin_value
                      ( instance_or_fault_id ,
                        ( long ) LM_DONT_CARE ,
                        ( long ) column ,
                        LM_LOGIC_FLOAT
                      ) ;
                  if ( ret == LM_ERROR )
                    return LM_ERROR ;
                  while
                    ( (void) lm_get_message ( & dont_care , & mess ) ,
                      dont_care != LM_NO_MORE_MESSAGES
                    )
                    ( void ) fprintf
                      ( stderr ,
                        "LM modeler warning: %s\n" ,
                        mess
                      ) ;
                  ++set_count ;
                }
        }
      }
    while ( ! done ) ;
    if ( tv_file != stdin )
      ( void ) fclose ( tv_file ) ;
    if ( dr_file != stdout )
      ( void ) fclose ( dr_file ) ;
    *number_of_sets = set_count ;
    *number_of_gets = get_count ;
    *number_of_time_settings = vector_count ;
    *number_of_pin_map_settings = pin_count ;
    *number_of_discrepancies = disc_count ;
    return warnings ? LM_WARNING : LM_SUCCESS ;
  } /* lm_play_test_vectors */

/* end of LM-1000 Test Vector Player */
```

Copyright 1989 Logic Modeling Systems

| SOURCE PROGRAM | DATE | PAGE # |
|---|---|---|
| sfi/network.c | 5/23/89 TIME 1:20:53 pm | 1/23 |

SOURCE TEXT

```
/* SCCS_ID: network.c rev 3.1, 4/24/89 at 07:35:58 */

#include <stdio.h>
#include "common.h"
#include "message.h"
#include "network.h"
#include "lsfi.h"
#include "lm_sfi.h"
#include "globals.h"

lm_initcomm(lm_box_name, skt)
char *lm_box_name;
short *skt;
{
   CONNECTION  *conn;
   u_char       i;
   char        *lm_malloc();
   char        *lm_calloc();
   char         state;

   if (lm_is_modeler_alive(lm_box_name, &state) != LM_SUCCESS)
      return(FAILURE);

   /* Find an empty slot in lm_table_of_conns. */
   for (i = 0; lm_table_of_conns[i] != NULL; ++i)
      ;

   if (i == MAX_SYSTEM_TABLE_SIZE) {
      lm_queue_message(ERROR_MSG, "internal error: conn table full");
      return(FAILURE);
   }

   conn = (CONNECTION *)DCALLOC((unsigned)1, (unsigned)sizeof(CONNECTION));
   if (conn == (CONNECTION *) NULL) {
      lm_queue_message(ERROR_MSG, "out of memory on host");
      return(FAILURE);
   }

   conn->name = (char *)DMALLOC((unsigned)(strlen(lm_box_name) + 1));
   if (conn->name == NULL) {
      lm_queue_message(ERROR_MSG, "out of memory on host");
      return(FAILURE);
   }

   (void)strcpy(conn->name, lm_box_name);

   lm_table_of_conns[i] = conn;

   *skt = i;

   if (lm_init_connection_for_client(conn) == FAILURE)
      return(FAILURE);

   return(SUCCESS);
}

lm_close_modeler(skt)
short skt;
{
   CONNECTION *conn;

   conn = lm_table_of_conns[skt];

   lm_close_connection_for_client(conn);

   DFREE((char *)conn->name);
   DFREE((char *)conn);

   lm_table_of_conns[skt] = NULL;
}
```

Copyright 1989 Logic Modeling Systems

| SOURCE PROGRAM | DATE | TIME | PAGE # |
|---|---|---|---|
| sfi/sfi1.c | 5/23/89 | 1:20:53 pm | 1/24 |

SOURCE TEXT

```
/* SCCS_ID: sfi1.c rev 3.8, 5/10/89 at 00:51:06 */

#include <stdio.h>
#include <ctype.h>
#include "common.h"
#include "network.h"
#include "message.h"
#include "lm_sfi.h"
#include "lsfi.h"
#include "protana.h"
#include "protomd.h"
#include "conv.h"
#include "globals.h"
#include "mod_err.h"
#include "svaram.h"

extern char          *lm_calloc();
extern char          *lm_malloc();
extern char          *lm_realloc();

/* HDML entry points */
extern char          *lm_Hlexical_pass();
extern void           lm_Hinit_vars();

/* the only static variable allowed in this file: */
static u_char         begin_session_called = FALSE;

lm_begin_modeling_session(simulator_type, hostname, username)
u_long                simulator_type;
char                 *hostname;
char                 *username;
{
   u_short               error_count;
   u_short               warning_count;
   version_type          sim_Version;
   version_type          sfi_Version;
   version_type          Last_Compatible_Version;

   if (begin_session_called == TRUE) {
      lm_queue_message(ERROR_MSG, "lm_begin_modeling_session() called more than once");
      return (LM_ERROR);
   }
   /* Version number is encoded in simulator_type */
   sim_Version.Version = simulator_type;
   sfi_Version.Version = LM_LOGIC_SIMULATOR;
   Last_Compatible_Version.Version = LAST_COMPATIBLE_SFI_VERSION;

   switch (sim_Version.field.sim_type) {
      case (LM_FAULT_SIMULATOR & SIM_TYPE_MASK):
      case (LM_LOGIC_SIMULATOR & SIM_TYPE_MASK):
         break;
      default:
         lm_queue_message(ERROR_MSG, "internal simulator error: illegal simulator type");
         return (LM_ERROR);
   }

   /* Check Version Number */
   if ((sim_Version.field.Major > sfi_Version.field.Major)
      || (sim_Version.field.Major < Last_Compatible_Version.field.Major)
      || ((sim_Version.field.Major == Last_Compatible_Version.field.Major)
       && (sim_Version.field.minor < Last_Compatible_Version.field.minor))) {
      if (sim_Version.field.Major > sfi_Version.field.Major) {
         lm_queue_message(ERROR_MSG, "internal simulator error: Old SFI object library is not compatible with new SFI header file, relink simu
         lator with new SFI object library");
      } else {
         lm_queue_message(ERROR_MSG, "internal simulator error: New SFI object library is not compatible with old SFI header file, recompile s
         imulator with new SFI header file");
      }
      return (LM_ERROR);
   }
   lm_init_globals(simulator_type);

   if (lm_init() == FAILURE)
      return (LM_ERROR);

#ifdef DEBUG
   if (lm_debug(1)) {
      DPRINTF(("lm_begin_modeling_session(%d, %s, %s)\n",
               simulator_type, hostname, username));
   }
#endif

   if (lm_verify_name(hostname, "hostname", MAX_NAME_LENGTH) == FAILURE)
      return (LM_ERROR);

   (void) strcpy(lm_gbl_hostname, hostname);

   if (lm_verify_name(username, "username", MAX_NAME_LENGTH) == FAILURE)
      return (LM_ERROR);

   (void) strcpy(lm_gbl_username, username);

   /* Call the routine that sets up the signal handlers. */
   if (lm_handle_signals() == FAILURE)
      return (LM_ERROR);

   lm_message_types(&error_count, &warning_count);

   if (error_count != 0)
      return (LM_ERROR);

   lm_sim_verified = 1;

   begin_session_called = TRUE;

   if (warning_count != 0)
      return (LM_WARNING);

   return (LM_SUCCESS);
}

lm_end_modeling_session()
{
   u_long                save_lm_network_timeout;
   u_short               error_count;
   u_short               warning_count;
   u_short               i;

#ifdef DEBUG
   if (lm_debug(1)) {
```

Copyright 1989 Logic Modeling Systems

| SOURCE PROGRAM | DATE | PAGE # |
|---|---|---|
| sfi/sfi1.c | 5/23/89 TIME 1:20:53 pm | 2/25 |

SOURCE TEXT

```
        DPRINTF(("lm_end_modeling_session()\n"));
    }
#endif

    clear_errors();

    if (!lm_sim_verified) {
        return (LM_SUCCESS);
    }
    /* Output the last vector */
    lm_simulation_time = (u_long) - 1;

    if (lm_vector_file_ptr != NULL) {
        lm_output_all_test_vector(lm_vector_file_ptr);
    }
    save_lm_network_timeout = lm_network_timeout;
    lm_network_timeout = 1000;    /* 1 second */
    for (i = 0; i < MAX_SYSTEM_TABLE_SIZE; ++i) {
        if (lm_system_table[i] != NULL) {

            if (lm_system_table[i]->state != USED)
                continue;

            lm_choose_conn(lm_system_table[i]->fd);
            lm_put_int(ABORT_CMD);

            if (lm_end_put(lm_system_table[i]->fd) == FAILURE) {
                lm_choose_conn(lm_system_table[i]->fd);
                lm_put_int(ABORT_CMD);

                if (lm_end_put(lm_system_table[i]->fd) == FAILURE) {
                  lm_queue_message(ERROR_MSG, "internal error: failed to abort user on modeler: %s",
                                   lm_system_table[i]->name);
                  continue;
                }
            }

            if (lm_get_int() != ABORT_ANS) {
                lm_queue_message(ERROR_MSG, "internal error: wrong reply received from modeler: %s",
                                 lm_system_table[i]->name);
            } else {
              /* (void) lm_dequeue_errors(); Lets not deque for now */
            }
        }
    }

    (void) lm_close_read_write_connection();

    lm_uninit();                    /* Free host resources */

    lm_sim_verified = 0;

    begin_session_called = FALSE;

    lm_message_types(&error_count, &warning_count);

    lm_network_timeout = save_lm_network_timeout;

    if (error_count != 0)
        return (LM_ERROR);

    if (warning_count != 0)
        return (LM_WARNING);

    return (LM_SUCCESS);
}

/*------------------------------------------------------------------------*/

lm_create_definition_f(filename, definition_id, modeler_name, device_name)
char                *filename;
long                *definition_id;
char                **modeler_name;
char                **device_name;
{
    SYSTEM_INFO         *system_ptr;
    DEFINITION_INFO     *def;
    char                *xdevice_name;
    char                *xmodeler_name;
    char                *outbuf;
    u_long               n;
    u_long               buf_size;
    short                fd;
    u_short              device_usage;
    u_short              error_count;
    u_short              warning_count;
    char                 full_filename[MAX_STRING_LENGTH];

#ifdef DEBUG
    if (lm_debug[1]) {
        DPRINTF(("lm_create_definition_f(%s, 0x%x, 0x%x, 0x%x)\n",
                 filename, definition_id, modeler_name, device_name));
    }
#endif

    *definition_id = -1;
    *modeler_name = NULL;
    *device_name = NULL;

    clear_errors();

    if (!lm_sim_verified) {
        lm_queue_message(ERROR_MSG, "internal simulator error: lm_begin_modeling_session() has not yet been called");
        return (LM_ERROR);
    }
    if (lm_gbl_time_scale_number == -1) {
        lm_queue_message(ERROR_MSG, "internal simulator error: lm_set_simulation_tick() has not yet been called");
        return (LM_ERROR);
    }
    if (lm_verify_name(filename, "filename", MAX_STRING_LENGTH) == FAILURE)
        return (LM_ERROR);

    if (lm_resolve_library_file("LM_LIB", filename,
                            full_filename, (long) MAX_STRING_LENGTH) == FAILURE) {
        return (LM_ERROR);
    }
    if (lm_check_file_type(full_filename) == FAILURE) {
        return (LM_ERROR);
    }
    /* BSD/SYS5 compatibility change to hardcode O_RDONLY to equal 0. */
```

Copyright 1989 Logic Modeling Systems

| SOURCE PROGRAM | DATE | 5/23/89 | PAGE # |
|---|---|---|---|
| sfi/sfi1.c | TIME | 1:20:53 pm | 3/26 |

SOURCE TEXT

```
    if ((fd = open(full_filename, 0)) == -1) {
        lm_queue_message(ERROR_MSG, "cannot open Shell Software file: %s",
                         full_filename);
        return (LM_ERROR);
    }
    lm_tbuf_ptr = lm_temp_buffer;
    buf_size = lm_max_tbuf_addr - lm_temp_buffer - 1;

    while ((n = (u_long) read(fd, lm_tbuf_ptr, (int) buf_size)) > 0) {
        lm_tbuf_ptr += n;
        buf_size -= n;
        if (buf_size == 0) {
            if (lm_extend_tbuf() == FAILURE)
                return (LM_ERROR);
            buf_size = lm_max_tbuf_addr - lm_tbuf_ptr - 1;
        }
    }
    *lm_tbuf_ptr++ = '\0';

    if (close(fd) != 0) {
        lm_queue_message(ERROR_MSG, "cannot close file: %s",
                         full_filename);
        return (LM_ERROR);
    }

    /*
     * Run the HSML front-end processor (lexical_pass()]. lexical_pass() returns
     * NULL if there are lexical errors.
     */
    lm_Hinit_vars("HSML");
    outbuf = lm_Hlexical_pass(full_filename, lm_temp_buffer, &xdevice_name,
                              &xmodeler_name, &device_usage);

    if (outbuf == NULL) {
        /* error encountered when parsing the DARDEF */
        return (LM_ERROR);
    }
    if (xdevice_name == NULL) {
        lm_queue_message(ERROR_MSG, "no device_name statement in Shell Software: %s",
                         full_filename);

        /* Free the buffer allocated by HSML front end processor */
        free(outbuf);

        return (LM_ERROR);
    }
    if ((lm_gbl_simulator_type & SIM_TYPE_MASK) == (LM_FAULT_SIMULATOR & SIM_TYPE_MASK))
        device_usage = 0;          /* PUBLIC */

    if (lm_find_device(xdevice_name, device_usage,
                       xmodeler_name, &system_ptr) == FAILURE) {
        /* Free the buffer allocated by HSML front end processor */
        free(outbuf);
        return (LM_ERROR);
    };

    /*
     * We found a system (pointed by system_ptr) which has the device we are
     * looking for. Send the definition to that system.
     */
    if (lm_send_def(system_ptr, &def,
                    xdevice_name, outbuf, (short *) definition_id) == SUCCESS) {

        (void) strcpy(lm_cdf_modeler_name, def->system_ptr->name);
        (void) strcpy(lm_cdf_device_name, def->device_name);

        *modeler_name = lm_cdf_modeler_name;
        *device_name = lm_cdf_device_name;

        /* Free the buffer allocated by HSML front end processor */
        free(outbuf);

#ifdef DEBUG
        if (lm_debug[1])
            lm_dump_definition(def);
#endif

        *definition_id = def->def_id;

#ifdef DEBUG
        if (lm_debug[2]) {
            DPRINTF(("lm_create_definition_f(XX, %d, %s, %s)\n",
                     *definition_id, *modeler_name, *device_name));
        }
#endif

        lm_message_types(&error_count, &warning_count);

        if (error_count != 0)
            return (LM_ERROR);

        if (warning_count != 0)
            return (LM_WARNING);

        return (LM_SUCCESS);
    } else {

        /* Free the buffer allocated by HSML front end processor */
        free(outbuf);

        *definition_id = -1;

        return (LM_ERROR);
    }
}

lm_create_definition_s(string, definition_id, modeler_name, device_name)
char                    *string;
long                    *definition_id;
char                    **modeler_name;
char                    **device_name;
{
    SYSTEM_INFO             *system_ptr;
    DEFINITION_INFO         *def;
    char                    *str;
    char                    *xdevice_name;
    char                    *xmodeler_name;
    char                    *outbuf;
    u_short                  device_usage;
    u_short                  error_count;
```

Copyright 1989 Logic Modeling Systems

SOURCE PROGRAM sfi/sfi1.c

DATE 5/23/89 TIME 1:20:53 pm PAGE # 4/27

LINE # SOURCE TEXT

```
    u_short             warning_count;
    char                c;

#ifdef DEBUG
    if (lm_debug[1]) {
      DPRINTF(("lm_create_definition_s(%s, 0x%x, 0x%x, 0x%x)\n",
                  string, definition_id, modeler_name, device_name));
    }
#endif

    *definition_id = -1;
    *modeler_name = NULL;
    *device_name = NULL;

    clear_errors();

    if (!lm_sim_verified) {
      lm_queue_message(ERROR_MSG, "internal simulator error: lm_begin_modeling_session() has not yet been called");
      return (LM_ERROR);
    }
    if (lm_gbl_time_scale_number == -1) {
      lm_queue_message(ERROR_MSG, "internal simulator error: lm_set_simulation_tick() has not yet been called");
      return (LM_ERROR);
    }
    if (lm_first_call == TRUE) {
      lm_tbuf_ptr = lm_temp_buffer;
      lm_first_call = FALSE;
    }
    if (string != LM_END_OF_TEXT) {
      str = string;
      if (lm_max_tbuf_addr - lm_tbuf_ptr - 1 < strlen(str) + 1)
        if (lm_extend_tbuf() == FAILURE)
          return (LM_ERROR);
      while (c = *str++)
        *lm_tbuf_ptr++ = c;
      return (LM_SUCCESS);
    }
    *lm_tbuf_ptr++ = '\0';
    lm_first_call = TRUE;

    /*
     * Run the HML front-end processor (lexical_pass()). lexical_pass() returns
     * NULL if there are lexical errors.
     */
    lm_Hinit_vars("HML");
    outbuf = lm_Hlexical_pass("NULLNAME", lm_temp_buffer, &xdevice_name,
                              &xmodeler_name, &device_usage);

    if (outbuf == NULL) {
      /* error encountered when parsing the DARDEF */
      return (LM_ERROR);
    }
    if (xdevice_name == NULL) {
      lm_queue_message(ERROR_MSG, "no device_name statement in Shell Software: %s",
                       "NULLNAME");
      /* Free the buffer allocated by HML front end processor */
      free(outbuf);
      return (LM_ERROR);
    }
    if ((lm_gbl_simulator_type & SIM_TYPE_MASK) == (LM_FAULT_SIMULATOR & SIM_TYPE_MASK))
      device_usage = 0;          /* PUBLIC */

    if (lm_find_device(xdevice_name, device_usag.,
                       xmodeler_name, &system_ptr) == FAILURE) {
      /* Free the buffer allocated by HML front end processor */
      free(outbuf);
      return (LM_ERROR);
    };

    /*
     * We found a system (pointed by system_ptr) which has the device we are
     * looking for. Send the definition to that system.
     */
    if (lm_send_def(system_ptr, &def,
                    xdevice_name, outbuf, (short *) definition_id)) {

      (void) strcpy(lm_crd_modeler_name, def->system_ptr->name);
      (void) strcpy(lm_crd_device_name, def->device_name);

      *modeler_name = lm_crd_modeler_name;
      *device_name = lm_crd_device_name;

      /* Free the buffer allocated by HML front end processor */
      free(outbuf);

#ifdef DEBUG
      if (lm_debug[1])
        lm_dump_definition(def);
#endif

      *definition_id = def->def_id;

#ifdef DEBUG
      if (lm_debug[2]) {
        DPRINTF(("lm_create_definition_s(%X, %d, %s, %s)\n",
                    *definition_id, *modeler_name, *device_name));
      }
#endif

      lm_message_types(&error_count, &warning_count);

      if (error_count != 0)
        return (LM_ERROR);

      if (warning_count != 0)
        return (LM_WARNING);

      return (LM_SUCCESS);

    } else {

      free(outbuf);

      *definition_id = -1;

      return (LM_ERROR);
    }
}

lm_create_instance(definition_id, instance_id, device_info_string)
```

Copyright 1989 Logic Modeling Systems

SOURCE PROGRAM sfi/sfi1.c

DATE 5/23/89 TIME 1:20:53 pm PAGE # 5/28

SOURCE TEXT

LINE #

```
long                    definition_id;
long                    *instance_id;
char                    *device_info_string;
{
   INSTANCE_INFO        *inst_ptr;
   PIN_INFO             *pin;
   long                 ret;
   char                 *name;
   u_short              i;
   u_short              out_count;
   short                pin_no;
   u_short              box_inst_id;

#ifdef DEBUG
   if (lm_debug[1]) {
      DPRINTF(("lm_create_instance(%d, %x%x, %s)\n",
               definition_id, instance_id, device_info_string));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   *instance_id = -1;

   if (lm_verify_name(device_info_string,
                      "device_info_string", MAX_STRING_LENGTH) == FAILURE)
      return (LM_ERROR);

   name = (char *) DMALLOC((unsigned) (strlen(device_info_string) + 1));
   if (name == NULL) {
      lm_queue_message(ERROR_MSG, "out of memory on host");
      return (LM_ERROR);
   }
   (void) strcpy(name, device_info_string);

   if ((definition_id != lm_last_definition_id_specified) ||
       (definition_id == -1)) {

      if ((definition_id < 0) || (definition_id >= lm_def_id_avail)) {
         DFREE(name);
         lm_queue_message(ERROR_MSG, "internal simulator error: invalid definition id: %d specified",
                          definition_id);
         return (LM_ERROR);
      }
      if (lm_def_id_table[definition_id] == NULL) {
         lm_queue_message(ERROR_MSG, "internal simulator error: invalid definition id: %d specified",
                          definition_id);
         DFREE(name);
         return (LM_ERROR);
      }
      lm_last_definition_id_specified = definition_id;
      lm_definition_selected = lm_def_id_table[definition_id];
   }
   lm_choose_conn(lm_definition_selected->system_ptr->fd);
   lm_put_int(CREATE_INSTANCE_CMD);
   lm_put_short(lm_definition_selected->box_def_id);

   for (i = 0; device_info_string[i] != '\0'; ++i)
      lm_put_char(device_info_string[i]);
   lm_put_char('\0');

   if (!lm_end_put(lm_definition_selected->system_ptr->fd)) {
      DFREE(name);
      return (LM_ERROR);
   }
   if (lm_get_int() != CREATE_INSTANCE_ANS) {
      lm_queue_message(ERROR_MSG, "internal error: wrong reply received from modeler: %s",
                       lm_definition_selected->system_ptr->name);
      DFREE(name);
      return (LM_ERROR);
   }
   if ((ret = lm_dequeue_errors()) == LM_ERROR) {
      DFREE(name);
      return (LM_ERROR);
   }
   box_inst_id = lm_get_short();

   if (lm_new_instance_info(lm_definition_selected, &inst_ptr) == FAILURE) {
      /* Release the instance on the modeler */
      lm_choose_conn(lm_definition_selected->system_ptr->fd);
      lm_put_int(RELEASE_INSTANCE_CMD);
      lm_put_short(box_inst_id);

      if (lm_end_put(lm_definition_selected->system_ptr->fd)) {
         if (lm_get_int() != RELEASE_INSTANCE_ANS)
            lm_queue_message(ERROR_MSG, "internal error: wrong reply received from modeler: %s",
                             lm_definition_selected->system_ptr->name);
         else
            (void) lm_dequeue_errors();
      }
      DFREE(name);
      return (LM_ERROR);
   }
   inst_ptr->box_fd = lm_definition_selected->system_ptr->fd;
   inst_ptr->box_inst_id = box_inst_id;
   inst_ptr->assoc_inst_id = -1;
   inst_ptr->assoc_box_inst_id = -1;    /* this is an instance not a fault */
   inst_ptr->def_id = lm_definition_selected->def_id;
   inst_ptr->sees_eval_or_store_pin = FALSE;
   inst_ptr->device_info_string = name;

   *instance_id = inst_ptr->inst_id;

   out_count = lm_get_short();
   for (i = 0; i < out_count; ++i) {
      pin_no = lm_get_short();
      pin = inst_ptr->pin_table[pin_no];
      pin->out_value = lm_get_char();
   }

#ifdef DEBUG
   if (lm_debug[2]) {
      DPRINTF(("lm_create_instance(XX, %d, XX)\n", *instance_id));
   }
#endif
```

Copyright 1989
Logic Modeling Systems

| SOURCE PROGRAM | DATE 5/23/89 | PAGE # |
|---|---|---|
| sfi/sfi1.c | TIME 1:20:53 pm | 6/29 |

SOURCE TEXT

```
    return (ret);
}

lm_create_fault(instance_id, fault_id)
long                    instance_id;
long                    *fault_id;
{

    int                 ret;

#ifdef DEBUG
    if (lm_debug[1]) {
        DPRINTF(("lm_create_fault(%d, 0x%x)\n", instance_id, fault_id));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    if ((lm_gbl_simulator_type & SIM_TYPE_MASK) == (LM_LOGIC_SIMULATOR & SIM_TYPE_MASK)) {
        lm_queue_message(ERROR_MSG, "internal simulator error: Logic Simulator should not create fault");
        return (LM_ERROR);
    }
    ret = lm_local_create_fault((long) -1, instance_id, fault_id);

#ifdef DEBUG
    if ((ret == LM_SUCCESS) && lm_debug[2]) {
        DPRINTF(("lm_create_fault(XX, %d)\n", *fault_id));
    }
#endif

    return (ret);
}

/*------------------------------------------------------------------------*/

lm_release_definition(definition_id)
long                    definition_id;
{
    u_short             i;
    u_short             error_count;
    u_short             warning_count;

#ifdef DEBUG
    if (lm_debug[1]) {
        DPRINTF(("lm_release_definition(%d)\n", definition_id));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    if (definition_id == LM_ALL_DEFINITIONS) {
        for (i = 0; i < lm_def_id_table_size; ++i) {
            if (lm_def_id_table[i] != NULL) {
                if (lm_release_one_definition((long) i) == FAILURE)
                    return (LM_ERROR);
            }
        }
    } else {
        if (lm_release_one_definition((long) definition_id) == FAILURE)
            return (LM_ERROR);
    }

    lm_message_types(&error_count, &warning_count);

    if (error_count != 0)
        return (LM_ERROR);

    if (warning_count != 0)
        return (LM_WARNING);

    return (LM_SUCCESS);
}

lm_release_instance(instance_id)
long                    instance_id;
{
    INSTANCE_INFO       *instance;
    INSTANCE_INFO       *temp;
    FILE_INFO           *file_ptr;
    long                 ret;
    u_long               save_simulation_time;
    u_short              i;

#ifdef DEBUG
    if (lm_debug[1]) {
        DPRINTF(("lm_release_instance(%d)\n", instance_id));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    lm_last_instance_id_specified = -1;
    lm_instance_selected = NULL;

    ret = LM_SUCCESS;

    if (instance_id == LM_ALL_INSTANCES) {

        for (i = 0; i < lm_inst_id_table_size; ++i) {
            instance = lm_inst_id_table[i];

            if (BOGUS_INSTANCE(instance))
                continue;

            if (instance->assoc_box_inst_id == -1) {
                if (lm_release_instance((long) i) == LM_ERROR)
                    return (LM_ERROR);
            }
```

Copyright 1989 Logic Modeling Systems

SOURCE PROGRAM sfi/sfi1.c | DATE 5/23/89 | TIME 1:20:53 pm | PAGE # 7/30

SOURCE TEXT

```
        }
    } else {
        if ((instance_id < 0) ||
            (instance_id >= lm_inst_id_table_size)) {
            lm_queue_message(ERROR_MSG, "internal simulator error: invalid instance id: %d specified",
                             instance_id);
            return (LM_ERROR);
        }
        instance = lm_inst_id_table[instance_id];
        if (BOGUS_INSTANCE(instance)) {
            lm_queue_message(ERROR_MSG, "internal simulator error: invalid instance id: %d specified",
                             instance_id);
            return (LM_ERROR);
        }
        if (instance->assoc_box_inst_id != -1) {
            lm_queue_message(ERROR_MSG, "internal simulator error: instance id: %d is a fault",
                             instance_id);
            return (LM_ERROR);
        }
        /* Release all faults associated to this instance */
        for (i = 0; i < lm_inst_id_table_size; ++i) {
            temp = lm_inst_id_table[i];

            if (BOGUS_INSTANCE(temp))
                continue;

            if (temp->assoc_box_inst_id == instance->box_inst_id) {
                if (lm_release_fault((long) i) == LM_ERROR)
                    return (LM_ERROR);
            }
        }

        if (lm_search_key_id(lm_timing_file_ptr,
                             (u_short) instance->inst_id, &file_ptr) == SUCCESS) {
            lm_close_and_delete_file_key_id(&lm_timing_file_ptr,
                                            (u_short) instance->inst_id);
            instance->tm_file = NULL;
        }
        if (lm_search_key_id(lm_vector_file_ptr,
                             (u_short) instance->inst_id, &file_ptr) == SUCCESS) {

            lm_output_last_vector(instance);
            lm_close_and_delete_file_key_id(&lm_vector_file_ptr,
                                            (u_short) instance->inst_id);
            instance->vector_file = NULL;
        }
        lm_choose_comm(instance->box_fd);
        lm_put_int(RELEASE_INSTANCE_CMD);
        lm_put_short(instance->box_inst_id);

        if (!lm_end_put(instance->box_fd))
            return (LM_ERROR);

        if (lm_get_int() != RELEASE_INSTANCE_ANS) {
            lm_queue_message(ERROR_MSG, "internal error: wrong reply received from modeler: %s",
                             lm_def_id_table[instance->def_id]->system_ptr->name);
            return (LM_ERROR);
        }
        if ((ret = lm_dequeue_errors()) == LM_ERROR)
            return (LM_ERROR);

        lm_rls_instance_info(lm_def_id_table[instance->def_id], instance);
    }

    return (ret);
}

lm_release_fault(fault_id)
long                    fault_id;
{
    INSTANCE_INFO       *fault;
    FILE_INFO           *file_ptr;
    long                ret;
    u_long              save_simulation_time;
    u_short             i;

#ifdef DEBUG
    if (lm_debug[1]) {
        DPRINTF(("lm_release_fault(%d)\n", fault_id));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    lm_last_instance_id_specified = -1;
    lm_instance_selected = NULL;

    ret = LM_SUCCESS;

    if (fault_id == LM_ALL_FAULTS) {

        for (i = 0; i < lm_inst_id_table_size; ++i) {
            fault = lm_inst_id_table[i];

            if (BOGUS_INSTANCE(fault))
                continue;

            if (fault->assoc_box_inst_id != -1) {
                if (lm_release_fault((long) i) == LM_ERROR)
                    return (LM_ERROR);
            }
        }
    } else {
        if ((fault_id < 0) ||
            (fault_id >= lm_inst_id_table_size)) {
            lm_queue_message(ERROR_MSG, "internal simulator error: invalid fault id: %d specified",
                             fault_id);
            return (LM_ERROR);
        }
        fault = lm_inst_id_table[fault_id];
        if (BOGUS_INSTANCE(fault)) {
            lm_queue_message(ERROR_MSG, "internal simulator error: invalid fault id: %d specified",
                             fault_id);
            return (LM_ERROR);
        }
        if (fault->assoc_box_inst_id == -1) {
```

Copyright 1989 Logic Modeling Systems

SOURCE PROGRAM sfi/sfi1.c | DATE 5/23/89 | TIME 1:20:53 pm | PAGE # 8/31

SOURCE TEXT

```
         lm_queue_message(ERROR_MSG, "internal simulator error: fault id: %d is an instance",
                          fault_id);
         return (LM_ERROR);
      }
      if (lm_search_key_id(lm_timing_file_ptr,
                           (u_short) fault->inst_id, &file_ptr) == SUCCESS) {
         lm_close_and_delete_file_key_id(&lm_timing_file_ptr,
                                         (u_short) fault->inst_id);
         fault->tm_file = NULL;
      }
      if (lm_search_key_id(lm_vector_file_ptr,
                           (u_short) fault->inst_id, &file_ptr) == SUCCESS) {
         lm_output_last_vector(fault);
         lm_close_and_delete_file_key_id(&lm_vector_file_ptr,
                                         (u_short) fault->inst_id);
         fault->vector_file = NULL;
      }
      lm_choose_conn(fault->box_fd);
      lm_put_int(RELEASE_FAULT_CMD);
      lm_put_short(fault->box_inst_id);
      lm_put_short(fault->assoc_box_inst_id);

      if (!lm_end_put(fault->box_fd))
         return (LM_ERROR);

      if (lm_get_int() != RELEASE_FAULT_ANS) {
         lm_queue_message(ERROR_MSG, "internal error: wrong reply received from modeler: %s",
                          lm_def_id_table[fault->def_id]->system_ptr->name);
         return (LM_ERROR);
      }
      if ((ret = lm_dequeue_errors()) == LM_ERROR)
         return (LM_ERROR);

      lm_rls_instance_info(lm_def_id_table[fault->def_id], fault);

   }

   return (ret);
}

/*----------------------------------------------------------------------*/

lm_set_simulation_tick(number, units)
unsigned long        number;
long                 units;
{

#ifdef DEBUG
   if (lm_debug[1]) {
      DPRINTF(("lm_set_simulation_tick(%d, %d)\n", number, units));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   if (lm_gbl_time_scale_number != -1) {
      lm_queue_message(ERROR_MSG, "internal simulator error: lm_set_simulation_tick() called more than once");
      return (LM_ERROR);
   }
   switch (units) {
      case LM_FEMTOSECONDS:
      case LM_PICOSECONDS:
      case LM_NANOSECONDS:
      case LM_MICROSECONDS:
         break;
      default:
         lm_queue_message(ERROR_MSG, "internal simulator error: illegal unit: %d for simulation tick",
                          units);
         return (LM_ERROR);
   }

   lm_gbl_time_scale_units = units;

   if (number == 0) {
      lm_queue_message(ERROR_MSG, "internal simulator error: number has to be greater than 0");
      return (LM_ERROR);
   }
   lm_gbl_time_scale_number = number;

   if (lm_set_time_scale(lm_gbl_time_scale_number, lm_gbl_time_scale_units) == FAILURE)
      return (LM_ERROR);

   return (LM_SUCCESS);
}

/*----------------------------------------------------------------------*/

lm_set_simulation_time(htime, ltime)
unsigned long        htime;
unsigned long        ltime;
{

#ifdef DEBUG
   if (lm_debug[1]) {
      DPRINTF(("lm_set_simulation_time(%d, %d)\n", htime, ltime));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   if (lm_gbl_time_scale_number == -1) {
      lm_queue_message(ERROR_MSG, "internal simulator error: lm_set_simulation_tick() has not yet been called");
      return (LM_ERROR);
   }
   if (htime != 0) {
      lm_queue_message(ERROR_MSG, "internal simulator error: only 32-bit simulation time is currently supported");
      return (LM_ERROR);
   }
   if (ltime < lm_simulation_time) {
      lm_queue_message(ERROR_MSG, "internal simulator error: simulation time decreased from %ld to %ld", lm_simulation_time, ltime);
      return (LM_ERROR);
   }
```

Copyright 1989 Logic Modeling Systems

SOURCE TEXT

```
    lm_simulation_time = ltime;

    if (lm_vector_file_ptr != NULL) {
        lm_output_all_test_vector(lm_vector_file_ptr);
    }
    return (LM_SUCCESS);
}

lm_set_logic_level_map(attribute, value)
long                    attribute;
long                    value;
{

#ifdef DEBUG
    if (lm_debug[1]) {
        DPRINTF(("lm_set_logic_level_map(%d, %d)\n", attribute, value));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    switch (attribute) {
        case LM_LOGIC_ZERO:
            lm_user_to_lm_logic_level_map[0].user_value = value;
            lm_user_to_lm_logic_level_map[0].lm_value = LOGIC_0;
            if (lm_user_to_lm_logic_level_map[0].set == 0) {
                lm_user_to_lm_logic_level_map[0].set = 1;
                --lm_logic_level_map_count;
            }
            lm_to_user_logic_level_map[LOGIC_0] = value;

            break;
        case LM_LOGIC_SOFT_ZERO:
            lm_user_to_lm_logic_level_map[1].user_value = value;
            lm_user_to_lm_logic_level_map[1].lm_value = LOGIC_S0;
            if (lm_user_to_lm_logic_level_map[1].set == 0) {
                lm_user_to_lm_logic_level_map[1].set = 1;
                --lm_logic_level_map_count;
            }
            lm_to_user_logic_level_map[LOGIC_S0] = value;

            break;
        case LM_LOGIC_ONE:
            lm_user_to_lm_logic_level_map[2].user_value = value;
            lm_user_to_lm_logic_level_map[2].lm_value = LOGIC_1;
            if (lm_user_to_lm_logic_level_map[2].set == 0) {
                lm_user_to_lm_logic_level_map[2].set = 1;
                --lm_logic_level_map_count;
            }
            lm_to_user_logic_level_map[LOGIC_1] = value;

            break;
        case LM_LOGIC_SOFT_ONE:
            lm_user_to_lm_logic_level_map[3].user_value = value;
            lm_user_to_lm_logic_level_map[3].lm_value = LOGIC_S1;
            if (lm_user_to_lm_logic_level_map[3].set == 0) {
                lm_user_to_lm_logic_level_map[3].set = 1;
                --lm_logic_level_map_count;
            }
            lm_to_user_logic_level_map[LOGIC_S1] = value;

            break;
        case LM_LOGIC_FLOAT:
            lm_user_to_lm_logic_level_map[4].user_value = value;
            lm_user_to_lm_logic_level_map[4].lm_value = LOGIC_Z1;
            if (lm_user_to_lm_logic_level_map[4].set == 0) {
                lm_user_to_lm_logic_level_map[4].set = 1;
                --lm_logic_level_map_count;
            }
            lm_to_user_logic_level_map[LOGIC_Z1] = value;

            lm_user_to_lm_logic_level_map[5].user_value = value;
            lm_user_to_lm_logic_level_map[5].lm_value = LOGIC_Z0;
            if (lm_user_to_lm_logic_level_map[5].set == 0) {
                lm_user_to_lm_logic_level_map[5].set = 1;
                --lm_logic_level_map_count;
            }
            lm_to_user_logic_level_map[LOGIC_Z0] = value;

            break;
        case LM_LOGIC_UNKNOWN:
            lm_user_to_lm_logic_level_map[6].user_value = value;
            lm_user_to_lm_logic_level_map[6].lm_value = LOGIC_U;
            if (lm_user_to_lm_logic_level_map[6].set == 0) {
                lm_user_to_lm_logic_level_map[6].set = 1;
                --lm_logic_level_map_count;
            }
            lm_to_user_logic_level_map[LOGIC_U] = value;

            break;
        default:
            lm_queue_message(ERROR_MSG, "illegal attribute for function");
            return (LM_ERROR);
    }

    return (LM_SUCCESS);
}

lm_set_pin_map(definition_id, pin_name, pin_type, pin_id)
long                    definition_id;
char                    *pin_name;
long                    pin_type;
long                    pin_id;
{
    DAB_PID                 *dab_pid_ptr;
    u_long                  key;
    u_short                 dab_pid_index;

#ifdef DEBUG
    if (lm_debug[1]) {
        DPRINTF(("lm_set_pin_map(%d, %s, %d, %d)\n",
                 definition_id, pin_name, pin_type, pin_id));
    }
#endif
```

Copyright 1989 Logic Modeling Systems

SOURCE TEXT

```
    clear_errors();

    if (!lm_sim_verified) {
       lm_queue_message(ERROR_MSG, "internal simulator error: lm_begin_modeling_session() has not yet been called");
       return (LM_ERROR);
    }
    if ((definition_id != lm_last_definition_id_specified) ||
        (definition_id == -1)) {

       if ((definition_id < 0) || (definition_id >= lm_def_id_avail)) {
          lm_queue_message(ERROR_MSG, "internal simulator error: invalid definition id: %d specified",
                           definition_id);
          return (LM_ERROR);
       }
       if (lm_def_id_table[definition_id] == NULL) {
          lm_queue_message(ERROR_MSG, "internal simulator error: invalid definition id: %d specified",
                           definition_id);
          return (LM_ERROR);
       }
       lm_last_definition_id_specified = definition_id;
       lm_definition_selected = lm_def_id_table[definition_id];
    }
    if ((pin_type < LM_INPUT) || (pin_type > LM_DONT_CARE)) {
       lm_queue_message(ERROR_MSG, "internal simulator error: invalid pin_type: %d specified",
                        pin_type);
       return (LM_ERROR);
    }
    if (lm_verify_name(pin_name, "pin_name", MAX_STRING_LENGTH) == FAILURE)
       return (LM_ERROR);

    pin_type = pin_type - LM_INPUT;

    if ((pin_id < 0) || (pin_id > MAX_PIN_ID)) {
       lm_queue_message(ERROR_MSG, "internal simulator error: invalid pin_id: %d specified",
                        pin_id);
       return (LM_ERROR);
    }
    key = (pin_type << PIN_TYPE_BIT_OFFSET) | pin_id;
    if (lm_bin_search(lm_definition_selected->user_pid_hash_table,
                      key, &dab_pid_index) == TRUE) {
       lm_queue_message(ERROR_MSG, "internal simulator error: duplicate pin map specification for pin: %s of device_name: %s",
                        pin_name,
                        lm_definition_selected->device_name);

       return (LM_ERROR);
    }
    if (lm_search_pin_name(lm_definition_selected->dab_pid_table,
                           lm_definition_selected->dab_pid_table_size,
                           pin_name, &dab_pid_index) == FALSE) {
       lm_queue_message(ERROR_MSG, "internal simulator error: pin_name: %s of device_name: %s is not in Shell Software",
                        pin_name,
                        lm_definition_selected->device_name);
       return (LM_ERROR);
    }
    dab_pid_ptr = &lm_definition_selected->dab_pid_table[dab_pid_index];
    switch ((dab_pid_ptr->key >> PIN_TYPE_BIT_OFFSET) & MAX_PIN_TYPE) {
       case INVALID_KEY - LM_INPUT:
          lm_definition_selected->table_validated = FALSE;
          dab_pid_ptr->key = key;
          break;
       case LM_INPUT - LM_INPUT:
       case LM_OUTPUT - LM_INPUT:
       case LM_IO - LM_INPUT:
       case LM_DONT_CARE - LM_INPUT:

          /*
           * Conflicting specification for the same pin name. The pin was
           * specified as either INPUT/OUTPUT/IO/DONT_CARE before, and now the
           * same pin is being specified as INPUT/OUTPUT/
           * IO/IO_AS_INPUT/IO_AS_OUTPUT/DONT_CARE/ again.
           */
          lm_queue_message(ERROR_MSG, "internal simulator error: conflicting pin_type specification for pin: %s of device_name: %s",
                           pin_name,
                           lm_definition_selected->device_name);
          return (LM_ERROR);
       case LM_IO_AS_INPUT - LM_INPUT:
          if ((pin_type == LM_INPUT - LM_INPUT) ||
              (pin_type == LM_OUTPUT - LM_INPUT) ||
              (pin_type == LM_IO - LM_INPUT) ||
              (pin_type == LM_IO_AS_INPUT - LM_INPUT) ||
              (pin_type == LM_DONT_CARE - LM_INPUT)) {
             lm_queue_message(ERROR_MSG, "internal simulater error: conflicting pin_type specification for pin: %s of device_name: %s",
                              pin_name,
                              lm_definition_selected->device_name);
             return (LM_ERROR);
          } else {
             /* the user specified key must be LM_IO_AS_OUTPUT --> OK */
             lm_definition_selected->table_validated = FALSE;
             dab_pid_ptr->key = key;
          }
          break;
       case LM_IO_AS_OUTPUT - LM_INPUT:
          if ((pin_type == LM_INPUT - LM_INPUT) ||
              (pin_type == LM_OUTPUT - LM_INPUT) ||
              (pin_type == LM_IO - LM_INPUT) ||
              (pin_type == LM_IO_AS_OUTPUT - LM_INPUT) ||
              (pin_type == LM_DONT_CARE - LM_INPUT)) {
             lm_queue_message(ERROR_MSG, "internal simulater error: conflicting pin_type specification for pin: %s of device_name: %s",
                              pin_name,
                              lm_definition_selected->device_name);
             return (LM_ERROR);
          }
          /* else the key must be LM_IO_AS_INPUT --> there is nothing to be done */
          break;
       default:
          break;
    }

    if (lm_insert_key(lm_definition_selected, key, (u_short) dab_pid_index) == FAILURE)
       return (LM_ERROR);

    return (LM_SUCCESS);
}

lm_set_pin_value(instance_or_fault_id, pin_type, pin_id, value)
long                  instance_or_fault_id;
long                  pin_type;
long                  pin_id;
long                  value;
{
```

Copyright 1989 Logic Modeling Systems

| SOURCE PROGRAM | DATE 5/23/89 | PAGE # |
|---|---|---|
| sfi/sfi1.c | TIME 1:20:53 pm | 11/34 |

LINE # SOURCE TEXT

```
    DEFINITION_INFO     *definition;
    DAB_PID             *dab_pid_ptr;
    PIN_INFO            *pin;
    u_long               key;
    u_short              dab_pid;
    short                cur_index;
    short                prev_index;
    u_short              i;
    u_short              ptype;
    u_short              error_count;
    u_short              warning_count;
    char                 pin_type_str[12];
    u_char               new_value;
    u_char               type_of_pin_change = NO_CHG;
    char                *tmp_string;

#ifdef DEBUG
    if (lm_debug[1]) {
        DPRINTF(("lm_set_pin_value(%d, %d, %d, %d)\n",
                 instance_or_fault_id, pin_type, pin_id, value));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    if (lm_logic_level_map_count != 0) {
        if (lm_logic_level_map_count == 1) {
            if (lm_verify_logic_level_map() == FAILURE)
                return (LM_ERROR);
        } else {
            lm_queue_message(ERROR_MSG, "internal simulator error: incomplete/missing logic_level_map specification");
            return (LM_ERROR);
        }
    }
    if (lm_specify_instance_id(instance_or_fault_id) == LM_ERROR) {
        return (LM_ERROR);
    }

    /*
     * Validate the definition if necessary. We only need to do this for
     * INSTANCE and NOT for FAULT because we cannot create FAULT if we fail to
     * create instance.
     */
    definition = lm_def_id_table[lm_instance_selected->def_id];
    if (definition->table_validated == FALSE) {
        if (lm_validate_definition(definition) == FAILURE)
            return (LM_ERROR);
    }
    if ((pin_id < 0) || (pin_id > MAX_PIN_ID)) {

        lm_queue_message(ERROR_MSG, "internal simulator error: invalid pin_id: %d specified",
                         pin_id);
        return (LM_ERROR);
    }
    if ((pin_type < LM_INPUT) || (pin_type > LM_DONT_CARE)) {
        lm_queue_message(ERROR_MSG, "internal simulator error: invalid pin_type: %d specified",
                         pin_type);
        return (LM_ERROR);
    }
    ptype = pin_type - LM_INPUT;

    key = (ptype << PIN_TYPE_BIT_OFFSET) | pin_id;
    if (lm_bin_search(definition->user_pid_hash_table, key, &dab_pid) == FALSE) {
        lm_get_pin_type_str(pin_type_str, ptype);
        lm_queue_message(ERROR_MSG, "internal simulator error: invalid pin (pin_type: %s pin_id: %d) of instance: %s specified",
                         pin_type_str, pin_id,
                         lm_instance_selected->device_info_string);
        return (LM_ERROR);
    }
    pin = lm_instance_selected->pin_table[dab_pid];
    if (pin == NULL) {
        lm_queue_message(ERROR_MSG, "internal error: pin info missing");
        return (LM_ERROR);
    }
    for (i = 0; i < MAX_LOGIC_STATE; ++i) {
        if (value == lm_user_to_lm_logic_level_map[i].user_value)
            break;
    }

    if (i == MAX_LOGIC_STATE) {
        lm_queue_message(ERROR_MSG, "internal simulator error: illegal logic value: %d specified",
                         value);
        return (LM_ERROR);
    }
    dab_pid_ptr = &definition->dab_pid_table[dab_pid];

    new_value = lm_user_to_lm_logic_level_map[i].lm_value;

    pin->sim_time = lm_simulation_time;

    switch (dab_pid_ptr->pin_type) {
        case IN:

            /*
             * set the out_value = in_value so we can return its value properly
             * when the user calls lm_get_pin_value_2()
             */
            pin->out_value = new_value;
        case IO:
            switch (dab_pid_ptr->pin_class) {
                case DATA:
                    if (pin->is_linked == TRUE) {

                        if ((new_value != pin->in_value) ||
                            (pin->just_went_float == TRUE))
                            type_of_pin_change = DATA_CHG;

                        pin->in_value = new_value;
                    } else {
                        if ((new_value != pin->in_value) ||
                            (pin->just_went_float == TRUE)) {
                            type_of_pin_change = DATA_CHG;
                            pin->is_linked = TRUE;
                            pin->in_value = new_value;
                            ++lm_instance_selected->data_pin_change_count;
```

Copyright 1989 Logic Modeling Systems

| SOURCE PROGRAM | DATE 5/23/89 | PAGE # |
|---|---|---|
| sfi/sfi1.c | TIME 1:20:53 pm | 12/35 |

SOURCE TEXT

```
                    pin->input_change = lm_instance_selected->data_pin_change_list;
                    lm_instance_selected->data_pin_change_list = dab_pid;
                }
            }
            break;
        case EVAL:
            if (pin->is_linked == TRUE) {

                if ((new_value != pin->in_value) ||
                    (pin->just_went_float == TRUE))
                    type_of_pin_change = EVAL_OR_STORE_CHG;

                pin->in_value = new_value;
                lm_queue_message(WARNING_MSG, "internal simulator warning: multiple changes on eval pin: %s of instance: %s",
                                 definition->dab_pid_table[dab_pid].name,
                                 lm_instance_selected->device_info_string);
            } else {
                if ((new_value != pin->in_value) ||
                    (pin->just_went_float == TRUE)) {
                    type_of_pin_change = EVAL_OR_STORE_CHG;
                    lm_instance_selected->seen_eval_or_store_pin = TRUE;
                    pin->is_linked = TRUE;
                    pin->in_value = new_value;
                    ++lm_instance_selected->eval_pin_change_count;
                    pin->input_change = lm_instance_selected->eval_pin_change_list;
                    lm_instance_selected->eval_pin_change_list = dab_pid;
                }
            }
            break;
        case STORE:
        case EDGE_RISE:
        case EDGE_FALL:
            if (pin->is_linked == TRUE) {

                if ((new_value != pin->in_value) ||
                    (pin->just_went_float == TRUE))
                    type_of_pin_change = EVAL_OR_STORE_CHG;

                pin->in_value = new_value;
                lm_queue_message(WARNING_MSG, "internal simulator warning: multiple changes on store pin: %s of instance: %s",
                                 definition->dab_pid_table[dab_pid].name,
                                 lm_instance_selected->device_info_string);
            } else {
                if ((new_value != pin->in_value) ||
                    (pin->just_went_float == TRUE)) {
                    type_of_pin_change = EVAL_OR_STORE_CHG;
                    lm_instance_selected->seen_eval_or_store_pin = TRUE;
                    pin->is_linked = TRUE;
                    pin->in_value = new_value;
                    ++lm_instance_selected->store_pin_change_count;

                    if (lm_instance_selected->store_pin_change_list == -1) {
                        /* First one on the list */
                        pin->input_change = lm_instance_selected->store_pin_change_list;
                        lm_instance_selected->store_pin_change_list = dab_pid;
                    } else {
                        cur_index = lm_instance_selected->store_pin_change_list;
                        prev_index = -1;

                        while ((cur_index != -1) && (dab_pid > cur_index)) {
                            prev_index = cur_index;
                            cur_index = lm_instance_selected->pin_table[cur_index]->
                              input_change;
                        }

                        if (prev_index == -1) {
                            /* insert at head of list */
                            pin->input_change = lm_instance_selected->
                              store_pin_change_list;
                            lm_instance_selected->store_pin_change_list = dab_pid;
                        } else {
                            pin->input_change = lm_instance_selected->
                              pin_table[prev_index]->input_change;
                            lm_instance_selected->
                              pin_table[prev_index]->input_change = dab_pid;
                        }
                    }
                }
            }
            break;
        default:
            break;
        }
        pin->just_went_float = FALSE;
        break;
    case OUT:
    default:
        switch (dab_pid_ptr->pin_type) {
            case OUT:
                tmp_string = "output";
                break;
            case POWER:
                tmp_string = "power";
                break;
            case GROUND:
                tmp_string = "ground";
                break;
            case NC:
                tmp_string = "no connect";
                break;
            case NONE:
            default:
                tmp_string = "UNKNOWN";
                break;
        }
        lm_queue_message(WARNING_MSG, "internal simulator warning: cannot set value on %s pin: %s of instance: %s",
                         tmp_string,
                         definition->dab_pid_table[dab_pid].name,
                         lm_instance_selected->device_info_string);
        break;
    }

    if (lm_instance_selected->vector_file != NULL) {
        switch (type_of_pin_change) {
            case DATA_CHG:
            case EVAL_OR_STORE_CHG:
                ++lm_instance_selected->pin_change_count;
                lm_instance_selected->last_pin_change_time = lm_simulation_time;
                lm_instance_selected->type_of_pin_change = DATA_CHG;
                if (lm_set_vector_buffer(lm_instance_selected, dab_pid) == FAILURE)
```

Copyright 1989 Logic Modeling Systems

SOURCE PROGRAM sfi/sfi1.c

DATE 5/23/89

TIME 1:20:53 pm

PAGE # 13/36

SOURCE TEXT

```
                return (LM_ERROR);
            break;
        case NO_CHG:
            ;
    }
  }
  lm_message_types(&error_count, &warning_count);

  if (error_count != 0)
      return (LM_ERROR);

  if (warning_count != 0)
      return (LM_WARNING);

  return (LM_SUCCESS);

}

/*----------------------------------------------------------------------*/

lm_get_pin_change(instance_or_fault_id, pin_type, pin_id, value,
                  delay_type, min, typ, max)
long                 instance_or_fault_id;
long                 *pin_type;
long                 *pin_id;
long                 *value;
long                 *delay_type;
unsigned long        *min;
unsigned long        *typ;
unsigned long        *max;
{

    PIN_INFO             *pin;
    DEFINITION_INFO      *definition;
    u_long                key;
    short                 dab_pid;
    u_short               error_count;
    u_short               warning_count;

#ifdef DEBUG
    if (lm_debug(1)) {
        DPRINTF(("lm_get_pin_change(%d, 0x%x, 0x%x, 0x%x, 0x%x, 0x%x, 0x%x, 0x%x)\n",
                instance_or_fault_id, pin_type, pin_id,
                value, delay_type, min, typ, max));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    if (lm_get_pin_value_type != GET_PIN_VALUE_1) {
        if (lm_get_pin_value_type == -1) {

            /*
             * This is the first time this function is called because
             * lm_get_pin_value_type is still -1.
             */
            lm_get_pin_value_type = GET_PIN_VALUE_1;
        } else {
            lm_queue_message(ERROR_MSG, "internal simulator error: cannot mix lm_get_pin_change() and lm_get_pin_value_2()");
            return (LM_ERROR);
        }
    }
    if (lm_logic_level_map_count != 0) {
        if (lm_logic_level_map_count == 1) {
            if (lm_verify_logic_level_map() == FAILURE)
                return (LM_ERROR);
        } else {
            lm_queue_message(ERROR_MSG, "internal simulator error: incomplete/missing logic_level_map specification");
            return (LM_ERROR);
        }
    }
    if (lm_specify_instance_id(instance_or_fault_id) == LM_ERROR) {
        return (LM_ERROR);
    }

    /*
     * Validate the definition if necessary. We only need to do this for
     * INSTANCE and NOT for FAULT because we cannot create FAULT if we fail to
     * create instance.
     */
    definition = lm_def_id_table[lm_instance_selected->def_id];
    if (definition->table_validated == FALSE) {
        if (lm_validate_definition(definition) == FAILURE)
            return (LM_ERROR);
    }
    if (lm_instance_selected->some_eval_or_store_pin) {
        if (lm_instance_selected->output_change_list != -1) {

            /*
             * The instance needs to be evaluated while there are still leftover
             * output changes which have not been returned to the user.
             */
            lm_queue_message(ERROR_MSG, "internal simulator error: instance/fault id: %d was evaluated while there were leftover output changes",
                             instance_or_fault_id);
            (void) lm_eval_instance(lm_instance_selected);
            return (LM_ERROR);
        } else {
            if (lm_eval_instance(lm_instance_selected) == FALSE) {
                return (LM_ERROR);
            }
        }
    }

    if (lm_instance_selected->get_pin_change_called == FALSE) {
        lm_link_all_output_pins(lm_instance_selected);
        lm_instance_selected->get_pin_change_called = TRUE;
    }

    dab_pid = lm_instance_selected->output_change_list;
    if (dab_pid != -1) {
        pin = lm_instance_selected->pin_table[dab_pid];
        if (pin == NULL) {
            lm_queue_message(ERROR_MSG, "internal error: pin info missing");
            return (LM_ERROR);
        }
        lm_instance_selected->output_change_list = pin->output_change;
```

Copyright 1989 Logic Modeling Systems

SOURCE PROGRAM sfi/sfi1.c | DATE 5/23/89 | TIME 1:20:53 pm | PAGE # 14/37

SOURCE TEXT

```
      *value = lm_to_user_logic_level_map[pin->out_value];

      key = definition->dab_pid_table[dab_pid].key;

      *pin_id = key & MAX_PIN_ID;
      *pin_type = ((key >> PIN_TYPE_BIT_OFFSET) & MAX_PIN_TYPE) + LM_INPUT;

      *delay_type = pin->delay_type;
      *min = pin->min_delay;
      *typ = pin->typ_delay;
      *max = pin->max_delay;

#ifdef DEBUG
      if (lm_debug[2]) {
         DPRINTF(("lm_get_pin_change(XX, %d, %d, %d, %d, %d, %d, %d)\n",
                  *pin_type, *pin_id, *value, *delay_type, *min, *typ, *max));
      }
#endif

      lm_message_types(&error_count, &warning_count);

      if (error_count != 0)
         return (LM_ERROR);

      if (warning_count != 0)
         return (LM_WARNING);

      return (LM_SUCCESS);
   }
   *pin_type = -1;
   *pin_id = LM_INVALID_PIN_ID;
   *value = lm_to_user_logic_level_map[LOGIC_U];
   *delay_type = LM_UNSPECIFIED_DELAY;
   *min = 0;
   *typ = 0;
   *max = 0;

#ifdef DEBUG
   if (lm_debug[2]) {
      DPRINTF(("lm_get_pin_change(XX, %d, %d, %d, %d, %d, %d, %d)\n",
               *pin_type, *pin_id, *value, *delay_type, *min, *typ, *max));
   }
#endif

   lm_message_types(&error_count, &warning_count);

   if (error_count != 0)
      return (LM_ERROR);

   if (warning_count != 0)
      return (LM_WARNING);

   return (LM_SUCCESS);
}

lm_get_pin_value_2(instance_or_fault_id, pin_type, pin_id, value,
                   delay_type, min, typ, max)
long                 instance_or_fault_id;
long                 pin_type;
long                 pin_id;
long                *value;
long                *delay_type;
unsigned long       *min;
unsigned long       *typ;
unsigned long       *max;
{

   PIN_INFO            *pin;
   DEFINITION_INFO     *definition;
   u_long               key;
   u_short              dab_pid;
   short                pinno;
   u_short              error_count;
   u_short              warning_count;
   char                 pin_type_str[12];

#ifdef DEBUG
   if (lm_debug[1]) {
      DPRINTF(("lm_get_pin_value_2(%d, %d, %d, 0x%x, 0x%x, 0x%x, 0x%x, 0x%x)\n",
               instance_or_fault_id, pin_type, pin_id, value,
               delay_type, min, typ, max));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   if (lm_get_pin_value_type != GET_PIN_VALUE_2) {
      if (lm_get_pin_value_type == -1) {

         /*
          * This is the first time this function is called because
          * lm_get_pin_value_type is still -1.
          */
         lm_get_pin_value_type = GET_PIN_VALUE_2;
      } else {
         lm_queue_message(ERROR_MSG, "internal simulator error: cannot mix lm_get_pin_change() and lm_get_pin_value_2()");
         return (LM_ERROR);
      }
   }
   if (lm_logic_level_map_count != 0) {
      if (lm_logic_level_map_count == 1) {
         if (lm_verify_logic_level_map() == FAILURE)
            return (LM_ERROR);
      } else {
         lm_queue_message(ERROR_MSG, "internal simulator error: incomplete/missing logic_level_map specification");
         return (LM_ERROR);
      }
   }
   if (lm_specify_instance_id(instance_or_fault_id) == LM_ERROR) {
      return (LM_ERROR);
   }

   /*
    * Validate the definition if necessary. We only need to do this for
    * INSTANCE and NOT for FAULT because we cannot create FAULT if we fail to
```

Copyright 1989
Logic Modeling Systems

| SOURCE PROGRAM | DATE | 5/23/89 | PAGE # |
|---|---|---|---|
| sfi/sfi1.c | TIME | 1:20:53 pm | 15/38 |

SOURCE TEXT

```c
     * create instance.
     */
    definition = lm_def_id_table[lm_instance_selected->def_id];
    if (definition->table_validated == FALSE) {
        if (lm_validate_definition(definition) == FAILURE)
            return (LM_ERROR);
    }
    if ((pin_id < 0) || (pin_id > MAX_PIN_ID)) {
        lm_queue_message(ERROR_MSG, "internal simulator error: invalid pin_id: %d specified",
                         pin_id);
        return (LM_ERROR);
    }
    if ((pin_type < LM_INPUT) || (pin_type > LM_DONT_CARE)) {
        lm_queue_message(ERROR_MSG, "internal simulator error: invalid pin_type: %d specified",
                         pin_type);
        return (LM_ERROR);
    }
    pin_type = pin_type - LM_INPUT;

    key = (pin_type << PIN_TYPE_BIT_OFFSET) | pin_id;
    if (lm_bin_search(definition->user_pid_hash_table, key, &dab_pid) == FALSE) {
        lm_get_pin_type_str(pin_type_str, (u_char) pin_type);
        lm_queue_message(ERROR_MSG, "internal simulator error: invalid pin (pin_type: %s pin_id: %d) of instance: %s specified",
                         pin_type_str, pin_id,
                         lm_instance_selected->device_info_string);
        return (LM_ERROR);
    }
    if (lm_instance_selected->seen_eval_or_store_pin) {
        if (lm_instance_selected->output_change_list != -1) {

            /*
             * The instance needs to be evaluated while there are still leftover
             * output changes which have not been returned to the user.
             */
            lm_queue_message(ERROR_MSG, "internal simulator error: instance/fault id: %d was evaluated while there were leftover output changes",
                             instance_or_fault_id);
            (void) lm_eval_instance(lm_instance_selected);
            return (LM_ERROR);
        } else {
            if (lm_eval_instance(lm_instance_selected) == FALSE)
                return (LM_ERROR);
        }
    }
    pin = lm_instance_selected->pin_table[dab_pid];
    if (pin == NULL) {
        lm_queue_message(ERROR_MSG, "internal error: pin info missing");
        return (LM_ERROR);
    }
    *value = lm_to_user_logic_level_map[pin->out_value];

    *delay_type = pin->delay_type;
    *min = pin->min_delay;
    *typ = pin->typ_delay;
    *max = pin->max_delay;

    /*
     * We assume that if the user calls lm_get_pin_value_2(), he will never call
     * lm_get_pin_change(). So we can throw away the output pin change list.
     */
    pinno = lm_instance_selected->output_change_list;
    while (pinno != -1) {
        pin = lm_instance_selected->pin_table[pinno];
        pinno = pin->output_change;
        pin->output_change = -1;
    }

    lm_instance_selected->output_change_list = -1;

#ifdef DEBUG
    if (lm_debug[2]) {
        DPRINTF(("lm_get_pin_value_2(XX, XX, XX, %d, %d, %d, %d, %d)\n",
                 *value, *delay_type, *min, *typ, *max));
    }
#endif

    lm_message_types(&error_count, &warning_count);

    if (error_count != 0)
        return (LM_ERROR);

    if (warning_count != 0)
        return (LM_WARNING);

    return (LM_SUCCESS);
}

/*----------------------------------------------------------------------*/

lm_save_modeler_state(filename)
char                    *filename;
{
    DEFINITION_INFO     *def;
    INSTANCE_INFO       *instance;
    INSTANCE_INFO       *fault;
    USER_PID            *user_pid_ptr;
    FILE_INFO           *file_info_ptr;
    long                 filesize;
    u_short              def_count;
    u_short              inst_count;
    u_short              i;
    u_short              user_pid_count;
    u_short              error_count;
    u_short              warning_count;
    u_long               unspec_delay_count;
    u_char               file_count;
    unspeced_delay_list_element *elem_ptr;

    char                 c;

#ifdef DEBUG
    if (lm_debug[1]) {
        DPRINTF(("lm_save_modeler_state(%s)\n", filename));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
```

Copyright 1989 Logic Modeling Systems

SOURCE PROGRAM sfi/sfi1.c

DATE 5/23/89 TIME 1:20:53 pm

PAGE # 16/39

SOURCE TEXT

```
   }
   if (lm_verify_name(filename, "filename", MAX_STRING_LENGTH) == FAILURE)
      return (LM_ERROR);

   if ((lm_save_set = fopen(filename, "w")) == NULL) {
      lm_queue_message(ERROR_MSG, "cannot open save-set file: %s for write",
                       filename);
      return (LM_ERROR);
   }
   /* save the saveset version id */
   write_long(lm_save_set, SAVE_SET_VERSION_ID);

   /* save dummy byte count */
   write_long(lm_save_set, 0);

   /* save simulation tick */
   write_long(lm_save_set, lm_gbl_time_scale_units);
   write_long(lm_save_set, lm_gbl_time_scale_number);

   /* save the current simulation time */
   write_long(lm_save_set, lm_simulation_time);

   /* save the logic map */
   for (i = 0; i < MAX_LOGIC_STATE; ++i) {
      write_short(lm_save_set, lm_user_to_lm_logic_level_map[i].user_value);
      write_short(lm_save_set, lm_user_to_lm_logic_level_map[i].lm_value);
   }

   /* save lm_get_pin_value_type */
   write_short(lm_save_set, lm_get_pin_value_type);

   /* save the Timing Measurement file information */
   file_count = 0;
   file_info_ptr = lm_timing_file_ptr;
   while (file_info_ptr != NULL) {
      ++file_count;
      file_info_ptr = file_info_ptr->next;
   }

   write_char(lm_save_set, file_count);

   file_info_ptr = lm_timing_file_ptr;
   while (file_info_ptr != NULL) {
      write_short(lm_save_set, file_info_ptr->instance_id);
      for (i = 0; (c = file_info_ptr->name[i]) != '\0'; ++i) {
         write_char(lm_save_set, c);
      }
      write_char(lm_save_set, c);

      if (lm_get_file_size(file_info_ptr->file_ptr,
                           file_info_ptr->name, &filesize) == FAILURE) {
         filesize = 0;
      }
      write_long(lm_save_set, filesize);

      file_info_ptr = file_info_ptr->next;
   }

   /* save the Test Vector file information */
   file_count = 0;
   file_info_ptr = lm_vector_file_ptr;
   while (file_info_ptr != NULL) {
      ++file_count;
      file_info_ptr = file_info_ptr->next;
   }

   write_char(lm_save_set, file_count);

   file_info_ptr = lm_vector_file_ptr;
   while (file_info_ptr != NULL) {
      write_short(lm_save_set, file_info_ptr->instance_id);
      for (i = 0; (c = file_info_ptr->name[i]) != '\0'; ++i) {
         write_char(lm_save_set, c);
      }
      write_char(lm_save_set, c);

      if (lm_get_file_size(file_info_ptr->file_ptr,
                           file_info_ptr->name, &filesize) == FAILURE) {
         filesize = 0;
      }
      write_long(lm_save_set, filesize);

      file_info_ptr = file_info_ptr->next;
   }

   lm_sort_def_inst_fault(lm_def_id_table, lm_inst_id_table,
                          lm_def_id_table_size, lm_inst_id_table_size,
                          &def_count, &inst_count);

   /* save the definition count */
   write_short(lm_save_set, def_count);

   /* save the user definition id and the definition itself */
   for (i = 0; i < lm_def_id_table_size; ++i) {
      def = lm_def_id_table[i];

      if (def == NULL)
         continue;

      /* save the user definition id */
      write_short(lm_save_set, def->def_id);

      /* save the device pattern count and the definition text */
      if (lm_send_save_def_cmd(def->system_ptr,
                               lm_save_set, def->box_def_id) == LM_ERROR)
         return (LM_ERROR);

      /* save the user pid count */
      user_pid_count = def->hash_table_element_count;
      write_short(lm_save_set, user_pid_count);

      for (i = 0; i < MAX_USER_PID_HASH_TABLE_SIZE; ++i) {
         user_pid_ptr = def->user_pid_hash_table[i];
         while (user_pid_ptr != NULL) {
            write_long(lm_save_set, user_pid_ptr->dab_pid_table_index);
            write_long(lm_save_set, user_pid_ptr->key);
            user_pid_ptr = user_pid_ptr->next_in_bucket;
         }
      }
```

Copyright 1989 Logic Modeling Systems

SOURCE PROGRAM sfi/sfi1.c

DATE 5/23/89 TIME 1:20:53 pm

PAGE # 17/40

LINE # SOURCE TEXT

```
        /* First figure out how big the unspec delay table is. */
        unspec_delay_count = 0;
        if (def->unspecified_delay_list != (unspeced_delay_list_element **) NULL) {
            /* walk through the entire hash table ... */
            for (i = 0; i < MAX_UNSPECED_DELAY_TABLE_SIZE; i++) {
                elem_ptr = *(def->unspecified_delay_list + i);
                /* and count up all elements for each hash table entry. */
                while (elem_ptr != (unspeced_delay_list_element *) NULL) {
                    unspec_delay_count++;
                    elem_ptr = (elem_ptr)->next;
                }
            }
        }
        /* Now dump the table. */
        write_long(lm_save_set, unspec_delay_count);
        if (def->unspecified_delay_list != (unspeced_delay_list_element **) NULL) {
            /* walk through the entire hash table ... */
            for (i = 0; i < MAX_UNSPECED_DELAY_TABLE_SIZE; i++) {
                elem_ptr = *(def->unspecified_delay_list + i);
                /* and save all elements for each hash table entry. */
                while (elem_ptr != (unspeced_delay_list_element *) NULL) {
                    write_long(lm_save_set, elem_ptr->unspeced_delay.unspeced_value);
                    elem_ptr = (elem_ptr)->next;
                }
            }
        }
    }

    /* save inst/var count */
    write_short(lm_save_set, inst_count);

    /* save the inst/fault information */
    for (i = 0; i < lm_def_id_table_size; ++i) {
        def = lm_def_id_table[i];

        if (def == NULL)
            continue;

        instance = def->instance_link;
        while (instance != NULL) {

            if (lm_save_instance_info(def, instance, lm_save_set) == LM_ERROR)
                return (LM_ERROR);

            if (lm_save_instance_pattern(instance, lm_save_set) == LM_ERROR)
                return (LM_ERROR);

            fault = instance->fault_link;

            while (fault != NULL) {
                if (lm_save_instance_info(def, fault, lm_save_set) == LM_ERROR)
                    return (LM_ERROR);

                if (lm_save_instance_pattern(fault, lm_save_set) == LM_ERROR)
                    return (LM_ERROR);

                fault = fault->fault_link;
            }

            instance = instance->link;
        }
    }

    (void) lm_write_file_size(lm_save_set, filename);

    (void) fclose(lm_save_set);

    lm_message_types(&error_count, &warning_count);

    if (error_count != 0)
        return (LM_ERROR);

    if (warning_count != 0)
        return (LM_WARNING);

    return (LM_SUCCESS);
}

lm_restore_modeler_state(filename)
char                    *filename;
{
    long                    temp;
    long                    unit;
    long                    number;
    u_long                  filesize;
    u_short                 def_count;
    u_short                 inst_count;
    u_short                 error_count;
    u_short                 warning_count;
    u_short                 instance_id;
    char                    xfilename[MAX_STRING_LENGTH];
    u_char                  file_count;
    u_char                  i;
    u_char                  j;
    char                    c;

#ifdef DEBUG
    if (lm_debug[1]) {
        DPRINTF(("lm_restore_modeler_state(%s)\n", filename));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    if (lm_verify_name(filename, "filename", MAX_STRING_LENGTH) == FAILURE)
        return (LM_ERROR);

    lm_save_set = NULL;

    if ((lm_save_set = fopen(filename, "r")) == NULL) {
        lm_queue_message(ERROR_MSG, "cannot open save-set file: %s for read",
                         filename);
        return (LM_ERROR);
    }
    /* get the saveset version id */
    read_long(lm_save_set, &temp);
```

Copyright 1989 Logic Modeling Systems

| SOURCE PROGRAM | DATE | 5/23/89 | PAGE # |
|---|---|---|---|
| sfi/sfi1.c | TIME | 1:20:53 pm | 18/41 |

SOURCE TEXT

```
    if (temp != SAVE_SET_VERSION_ID) {
       lm_queue_message(ERROR_MSG, "mismatched save-set version id, expected: %d found: %d",
                        SAVE_SET_VERSION_ID, temp);
       (void) fclose(lm_save_set);
       return (LM_ERROR);
    }
    /* Discard all existing data structure */
    if (lm_release_definition((long) LM_ALL_DEFINITIONS) == LM_ERROR) {
       (void) fclose(lm_save_set);
       return (LM_ERROR);
    }
    /* close all currently open Timing Measurement files */
    while (lm_timing_file_ptr != NULL) {
       lm_close_and_delete_file_key_id(&lm_timing_file_ptr,
                                       lm_timing_file_ptr->instance_id);

    }

    /* close all currently open Test Vector files */
    while (lm_vector_file_ptr != NULL) {
       lm_close_and_delete_file_key_id(&lm_vector_file_ptr,
                                       lm_vector_file_ptr->instance_id);

    }

    if (lm_check_file_size(lm_save_set, filename) == LM_ERROR) {
       return (LM_ERROR);
    }
    read_long(lm_save_set, &unit);
    read_long(lm_save_set, &number);
    lm_gbl_time_scale_number = -1;

    if (lm_set_simulation_tick((unsigned long) number, unit) == LM_ERROR)
       return (LM_ERROR);

    /* restore the simulation time */
    read_long(lm_save_set, &lm_simulation_time);

    /* restore the logic map */
    for (i = 0; i < MAX_LOGIC_STATE; ++i) {
       read_short(lm_save_set, &temp);
       lm_user_to_lm_logic_level_map[i].user_value = (u_short) temp;

       read_short(lm_save_set, &temp);
       lm_user_to_lm_logic_level_map[i].lm_value = (u_short) temp;

       lm_user_to_lm_logic_level_map[i].set = 1;

       lm_to_user_logic_level_map[temp] =
         lm_user_to_lm_logic_level_map[i].user_value;
    }

    lm_logic_level_map_count = 0;

    /* restore lm_get_pin_value_type */
    read_short(lm_save_set, &lm_get_pin_value_type);

    /* Restore Timing Measurement file */
    lm_timing_file_ptr = NULL;
    read_char(lm_save_set, &file_count);
    for (i = 0; i < file_count; ++i) {
       read_short(lm_save_set, &instance_id);
       j = 0;
       do {
          read_char(lm_save_set, &c);
          xfilename[j++] = c;
       } while (c != '\0');

       read_long(lm_save_set, &filesize);

       if (lm_append_and_insert_file(&lm_timing_file_ptr,
                                     xfilename, instance_id, filesize) == FAILURE)
          return (LM_ERROR);
    }

    /* Restore Test Vector file */
    lm_vector_file_ptr = NULL;
    read_char(lm_save_set, &file_count);
    for (i = 0; i < file_count; ++i) {
       read_short(lm_save_set, &instance_id);
       j = 0;
       do {
          read_char(lm_save_set, &c);
          xfilename[j++] = c;
       } while (c != '\0');

       read_long(lm_save_set, &filesize);
       if (lm_append_and_insert_file(&lm_vector_file_ptr,
                                     xfilename, instance_id, filesize) == FAILURE)
          return (LM_ERROR);
    }

    /* get the definition count */
    read_short(lm_save_set, &def_count);

    for (i = 0; i < def_count; ++i) {
       if (lm_restore_definition(lm_save_set, filename) == LM_ERROR)
          return (LM_ERROR);
    }

    /* get the instance/fault count */
    read_short(lm_save_set, &inst_count);

    for (i = 0; i < inst_count; ++i) {
       if (lm_restore_instance(lm_save_set, filename) == LM_ERROR)
          return (LM_ERROR);
    }

    lm_definition_selected = NULL;
    lm_instance_selected = NULL;
    lm_last_definition_id_specified = -1;
    lm_last_instance_id_specified = -1;

    if (ferror(lm_save_set)) {
       clearerr(lm_save_set);
       lm_queue_message(ERROR_MSG, "error in reading from save-set file: %s during restore",
                        filename);
       return (LM_ERROR);
    }
    (void) fclose(lm_save_set);

    lm_message_types(&error_count, &warning_count);
```

Copyright 1989 Logic Modeling Systems

SOURCE TEXT

```
    if (error_count != 0)
        return (LM_ERROR);

    if (warning_count != 0)
        return (LM_WARNING);

    return (LM_SUCCESS);
}

lm_get_message(attribute, string)
long                    *attribute;
char                   **string;
{
    u_short                 type;

    if (lm_dequeue_message(&type, lm_gm_error_string) != FAILURE) {


        *string = lm_gm_error_string;
        if (type == WARNING_MSG)
            *attribute = LM_WARNING;
        else
            *attribute = LM_ERROR;
    } else {
        *string = NULL;
        *attribute = LM_NO_MORE_MESSAGES;
    }

#ifdef DEBUG
    if (lm_debug[2]) {
        DPRINTF(("lm_get_message(%d, %s)\n", *attribute, *string));
    }
#endif

    return (LM_SUCCESS);
}

/*-----------------------------------------------------------------------*/

lm_timing_measurement(instance_or_fault_id, command, filename)
long                    instance_or_fault_id;
long                    command;
char                   *filename;
{
    FILE_INFO               *file_ptr;
    u_short                  error_count;
    u_short                  warning_count;
    char                     unit_string[256];

#ifdef DEBUG
    if (lm_debug[1]) {
        DPRINTF(("lm_timing_measurement(%d, %d, %s)\n", instance_or_fault_id,
                command, filename));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    if (lm_specify_instance_id(instance_or_fault_id) == LM_ERROR) {
        return (LM_ERROR);
    }
    switch (command) {
        case LM_TIMING_OFF:
            lm_instance_selected->tm_file = NULL;
            if (lm_send_tmeas_cmd(lm_instance_selected,
                                  (u_char) command) == FAILURE)
                return (LM_ERROR);

            lm_message_types(&error_count, &warning_count);

            if (error_count != 0)
                return (LM_ERROR);

            if (warning_count != 0)
                return (LM_WARNING);

            return (LM_SUCCESS);
        case LM_TIMING_ON:
            break;
        default:
            lm_queue_message(ERROR_MSG, "internal simulator error: illegal command: %d specified",
                             command);
            return (LM_ERROR);
    }

    if (filename == LM_NO_FILE) {
        if (lm_search_key_id(lm_timing_file_ptr,
                       (u_short) instance_or_fault_id, &file_ptr) == SUCCESS) {
            lm_close_and_delete_file_key_id(&lm_timing_file_ptr,
                                      (u_short) instance_or_fault_id);
            lm_instance_selected->tm_file = NULL;
        }
    } else {

        if (lm_verify_name(filename, "filename", MAX_STRING_LENGTH) == FAILURE)
            return (LM_ERROR);

        if (lm_check_file_type(filename) == FAILURE) {
            return (LM_ERROR);
        }
        if (lm_search_key_id(lm_timing_file_ptr,
                       (u_short) instance_or_fault_id, &file_ptr) == SUCCESS) {
            if (strcmp(file_ptr->name, filename) != 0) {
                lm_close_and_delete_file_key_id(&lm_timing_file_ptr,
                                          (u_short) instance_or_fault_id);
                lm_instance_selected->tm_file = NULL;
            } else {
                if (lm_send_tmeas_cmd(lm_instance_selected,
                                      (u_char) command) == FAILURE)
                    return (LM_ERROR);
                lm_instance_selected->tm_file = file_ptr->file_ptr;

                lm_message_types(&error_count, &warning_count);

                if (error_count != 0)
```

Copyright 1989
Logic Modeling Systems

| SOURCE PROGRAM | DATE | PAGE # |
|---|---|---|
| sfi/sfi1.c | 5/23/89 | 20/43 |
| | TIME 1:20:53 pm | |

SOURCE TEXT

```
                return (LM_ERROR);

            if (warning_count != 0)
                return (LM_WARN...

            return (LM_SUCCESS);
        }
    }

    /*
     * Make sure that the filename is NOT used by other instance, or used for
     * vector file.
     */
    if (lm_search_key_name(lm_timing_file_ptr, filename) == SUCCESS) {
        lm_queue_message(ERROR_MSG, "filename: %s is used by other instance",
                         filename);
        return (LM_ERROR);
    }
    if (lm_search_key_name(lm_vector_file_ptr, filename) == SUCCESS) {
        lm_queue_message(ERROR_MSG, "filename: %s is used for vector logging",
                         filename);
        return (LM_ERROR);
    }
    if (lm_open_and_insert_file(&lm_timing_file_ptr, filename,
                                (u_short) instance_or_fault_id) == FAILURE)
        return (LM_ERROR);
    else {
        lm_instance_selected->tm_file = lm_timing_file_ptr->file_ptr;
        switch (lm_gbl_time_scale_units) {
            case LM_FEMTOSECONDS:
                (void) sprintf(unit_string, "femtoseconds");
                break;
            case LM_PICOSECONDS:
                (void) sprintf(unit_string, "picoseconds");
                break;
            case LM_NANOSECONDS:
                (void) sprintf(unit_string, "nanoseconds");
                break;
            case LM_MICROSECONDS:
                (void) sprintf(unit_string, "microseconds");
                break;
            default:
                break;
        }

        (void) fprintf(lm_instance_selected->tm_file,
                       "device: %s, instance: %d, simtime: %s, info: %s\n",
                lm_def_id_table[lm_instance_selected->def_id]->device_name,
                       lm_instance_selected->inst_id,
                       unit_string,
                       lm_instance_selected->device_info_string);
    }
  }

  if (lm_send_tmeas_cmd(lm_instance_selected, (u_char) command) == FAILURE)
      return (LM_ERROR);

  lm_message_types(&error_count, &warning_count);

  if (error_count != 0)
      return (LM_ERROR);

  if (warning_count != 0)
      return (LM_WARNING);

  return (LM_SUCCESS);
}

lm_loop_patterns(instance_or_fault_id, command)
long                instance_or_fault_id;
long                command;
{
  char                  state;
  int                   status;

#ifdef DEBUG
  if (lm_debug[1]) {
      DPRINTF(("lm_loop_patterns(%d, %d)\n", instance_or_fault_id, command));
  }
#endif

  clear_errors();

  if (!lm_sim_verified) {
      lm_queue_message(ERROR_MSG,
                  "internal simulator error: lm_begin_modeling_session() has not yet been called");
      return (LM_ERROR);
  }
  if (lm_specify_instance_id(instance_or_fault_id) == LM_ERROR) {
      return (LM_ERROR);
  }
  switch (command) {

      case LM_LOOP_ON:

          /* start loop mode */

          lm_choose_conn(lm_instance_selected->box_fd);
          lm_put_int(LOOP_PTRN_CMD);
          lm_put_short(lm_instance_selected->box_inst_id);

          if (!lm_end_put(lm_instance_selected->box_fd)) {
              return (LM_ERROR);
          }
          if (lm_get_int() != LOOP_PTRN_ANS) {
              lm_queue_message(ERROR_MSG,
                       "internal error: wrong reply received from modeler: %s",
               lm_def_id_table[lm_instance_selected->def_id]->system_ptr->name);

              return (LM_ERROR);
          }
          return lm_dequeue_errors();

      case LM_LOOP_OFF:
          status = lm_request_interrupt(lm_def_id_table[lm_instance_selected->def_id]
                                      ->system_ptr->name, &state);
          if ((status == LM_WARNING) && (state == RUNNING_LOOPMODE)) {
              lm_remove_message(WARNING_MSG, "modeler running loop mode");
              status = LM_SUCCESS;
```

Copyright 1989 Logic Modeling Systems

SOURCE PROGRAM sfi/sfi1.c | DATE 5/23/89 | TIME 1:20:53 pm | PAGE # 21/44

SOURCE TEXT

```
        } else if (status == LM_SUCCESS) {
            lm_queue_message(WARNING_MSG, "modeler not running loop mode");
            status = LM_WARNING;
        }
        return (status);

    default:
        lm_queue_message(ERROR_MSG, "internal simulator error: illegal command: %d specified",
                         command);
        return (LM_ERROR);
    }
}

lm_specify_instance_id(instance_or_fault_id)
register long          instance_or_fault_id;
{
    register INSTANCE_INFO *instance;

    if ((instance_or_fault_id != lm_last_instance_id_specified) ||
        (instance_or_fault_id == -1)) {

        if ((instance_or_fault_id < 0) ||
            (instance_or_fault_id >= lm_inst_id_table_size)) {
            lm_queue_message(ERROR_MSG,
             "internal simulator error: invalid instance/fault id: %d specified",
                         instance_or_fault_id);
            return (LM_ERROR);
        }
        instance = lm_inst_id_table[instance_or_fault_id];
        if (BOGUS_INSTANCE(instance)) {
            lm_queue_message(ERROR_MSG,
             "internal simulator error: invalid instance/fault id: %d specified",
                         instance_or_fault_id);
            return (LM_ERROR);
        }
        lm_last_instance_id_specified = instance_or_fault_id;
        lm_instance_selected = instance;
    }
    return (SUCCESS);
}

lm_reset_instance(instance_id)
long                    instance_id;
{
    INSTANCE_INFO       *instance;
    INSTANCE_INFO       *temp;
    FILE_INFO           *file_ptr;
    PIN_INFO            *pin;
    long                 ret;
    u_short              i;
    u_short              out_count;
    short                pin_no;

#ifdef DEBUG
    if (lm_debug[1]) {
        DPRINTF(("lm_reset_instance(%d)\n", instance_id));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    lm_last_instance_id_specified = -1;
    lm_instance_selected = NULL;

    if (instance_id == LM_ALL_INSTANCES) {

        lm_simulation_time = 0;

        /*
         * do through the instance table and reset all INSTANCES. The faults for
         * all instances will be released in the else part of the if statement
         * above.
         */
        for (i = 0; i < lm_inst_id_table_size; ++i) {
            instance = lm_inst_id_table[i];

            if (BOGUS_INSTANCE(instance))
                continue;

            if (instance->assoc_box_inst_id == -1) {
                /* If it is an INSTANCE then reset it. */
                if ((ret = lm_reset_instance((long) i)) == LM_ERROR)
                    return (LM_ERROR);
            }
        }
        return (ret);
    } else {
        if ((instance_id < 0) ||
            (instance_id >= lm_inst_id_table_size)) {
            lm_queue_message(ERROR_MSG, "internal simulator error: invalid instance id: %d specified",
                         instance_id);
            return (LM_ERROR);
        }
        instance = lm_inst_id_table[instance_id];
        if (BOGUS_INSTANCE(instance)) {
            lm_queue_message(ERROR_MSG, "internal simulator error: invalid instance id: %d specified",
                         instance_id);
            return (LM_ERROR);
        }
        if (instance->assoc_box_inst_id != -1) {
            lm_queue_message(ERROR_MSG, "internal simulator error: cannot reset a fault, fault id: %d",
                         instance_id);
            return (LM_ERROR);
        }
        /* Release all faults associated with this instance */
        for (i = 0; i < lm_inst_id_table_size; ++i) {
            temp = lm_inst_id_table[i];

            if (BOGUS_INSTANCE(temp))
                continue;

            if (temp->assoc_box_inst_id == instance->box_inst_id) {
                if (lm_release_fault((long) i) == LM_ERROR)
                    return (LM_ERROR);
            }
        }
```

Copyright 1989 Logic Modeling Systems

SOURCE TEXT

```
        if (lm_search_key_id(lm_timing_file_ptr,
                        (u_short) instance->inst_id, &file_ptr) == SUCCESS) {
            close_and_delete_file_key_id(&lm_timing_file_ptr,
                                (u_short) instance->inst_id);
            instance->tm_file = NULL;
        }
        if (lm_search_key_id(lm_vector_file_ptr,
                        (u_short) instance->inst_id, &file_ptr) == SUCCESS) {
            lm_output_last_vector(instance);
            lm_close_and_delete_file_key_id(&lm_vector_file_ptr,
                                (u_short) instance->inst_id);
            instance->vector_file = NULL;
        }
        if (lm_reinitialize_instance(instance) == FAILURE) {
            return (LM_ERROR);
        }
        lm_choose_conn(instance->box_fd);
        lm_put_int(RESET_INST_CMD);
        lm_put_short(instance->box_inst_id);

        if (!lm_end_put(instance->box_fd))
            return (LM_ERROR);

        if (lm_get_int() != RESET_INST_ANS) {
            lm_queue_message(ERROR_MSG, "internal error: wrong reply received from modeler: %s",
                        lm_def_id_table[instance->def_id]->system_ptr->name);
            return (LM_ERROR);
        }
        if ((ret = lm_dequeue_errors()) == LM_ERROR)
            return (LM_ERROR);

        out_count = lm_get_short();
        for (i = 0; i < out_count; ++i) {
            pin_no = lm_get_short();
            pin = instance->pin_table[pin_no];
            pin->out_value = lm_get_char();
        }
    }

    lm_simulation_time = 0;

    return (ret);
}

/*-------------------------------------------------------------------------*/

lm_log_test_vectors(instance_or_fault_id, command, filename)
long                    instance_or_fault_id;
long                    command;
char                    *filename;
{
    FILE_INFO           *file_ptr;
    u_long              save_simulation_time;

#ifdef DEBUG
    if (lm_debug[1]) {
        DPRINTF(("lm_log_test_vectors(%d, %d, %s)\n",
                instance_or_fault_id, command, filename));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    if (lm_specify_instance_id(instance_or_fault_id) == LM_ERROR) {
        return (LM_ERROR);
    }
    switch (command) {
        case LM_LOGGING_OFF:
            if (lm_instance_selected->vector_file != NULL) {
                lm_output_last_vector(lm_instance_selected);
                lm_close_and_delete_file_key_id(&lm_vector_file_ptr,
                                (u_short) instance_or_fault_id);
                lm_instance_selected->vector_file = NULL;
            }
            return (LM_SUCCESS);
        case LM_LOGGING_ON:
            break;
        default:
            lm_queue_message(ERROR_MSG, "internal simulator error: illegal command: %d specified",
                        command);
            return (LM_ERROR);
    }

    if (lm_verify_name(filename, "filename", MAX_STRING_LENGTH) == FAILURE)
        return (LM_ERROR);

    if (lm_check_file_type(filename) == FAILURE) {
        return (LM_ERROR);
    }
    if (lm_search_key_id(lm_vector_file_ptr,
                    (u_short) instance_or_fault_id, &file_ptr) == SUCCESS) {
        if (strcmp(file_ptr->name, filename) != 0) {
            lm_instance_selected->vector_file = NULL;
            lm_close_and_delete_file_key_id(&lm_vector_file_ptr,
                                (u_short) instance_or_fault_id);
        } else {
            lm_instance_selected->vector_file = file_ptr->file_ptr;
            return (LM_SUCCESS);
        }
    }

    /*
     * Make sure that the filename is NOT used by other instance, or used for
     * timing measurement file.
     */
    if (lm_search_key_name(lm_timing_file_ptr, filename) == SUCCESS) {
        lm_queue_message(ERROR_MSG, "filename: %s is used for timing measurement capture",
                    filename);
        return (LM_ERROR);
    }
    if (lm_search_key_name(lm_vector_file_ptr, filename) == SUCCESS) {
        lm_queue_message(ERROR_MSG, "filename: %s is used by another instance",
                    filename);
        return (LM_ERROR);
    }
```

Copyright 1989
Logic Modeling Systems

SOURCE PROGRAM sfi/sfi1.c | DATE 5/23/89 | TIME 1:20:53 pm | PAGE # 23/46

SOURCE TEXT

```
    if (lm_open_and_insert_file(&lm_vector_file_ptr, filename,
                                (u_short) instance_or_fault_id) == FAILURE)

        return (LM_ERROR);
    else {
        lm_instance_selected->vector_file = lm_vector_file_ptr->file_ptr;
    }

    if (lm_write_vector_file_header(lm_instance_selected) == FAILURE) {
        lm_close_and_delete_file_key_id(&lm_vector_file_ptr,
                                        (u_short) instance_or_fault_id);
        lm_instance_selected->vector_file = NULL;
        return (LM_ERROR);
    }
    lm_update_vector_buffer(lm_instance_selected);
    return (LM_SUCCESS);
}
```

Copyright 1989 Logic Modeling Systems

| SOURCE PROGRAM | DATE | PAGE # |
|---|---|---|
| sfi/sfi2.c | 5/23/89 | 1/47 |
| | TIME 1:20:56 pm | |

LINE # SOURCE TEXT

```
/* SCCS_ID: sfi2.c rev 3.2, 5/2/89 at 17:23:23     */

#include <stdio.h>
#include <ctype.h>
#include "common.h"
#include "network.h"
#include "message.h"
#include "lm_sfi.h"
#include "lsfi.h"
#include "protans.h"
#include "protcmd.h"
#include "conv.h"
#include "globals.h"

extern char *lm_calloc();
extern char *lm_malloc();
extern char *lm_realloc();

/* HDL entry points */
extern char *lm_Hlexical_pass();
extern void lm_Hinit_vars();

lm_pattern_history(instance_id, command)
long          instance_id;
long          command;
{
   INSTANCE_INFO *instance;
   long          ret;
   u_short       i;

#ifdef DEBUG
   if (lm_debug[1]) {
      DPRINTF(("lm_pattern_history(%d, %d)\n", instance_id, command));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   if (instance_id == LM_ALL_INSTANCES) {
      for (i = 0; i < lm_inst_id_table_size; ++i) {
         instance = lm_inst_id_table[i];

         if (BOGUS_INSTANCE(instance))
            continue;

         if (lm_pattern_history((long) i, command) == LM_ERROR)
            return (LM_ERROR);
      }
   } else {
      if ((instance_id < 0) ||
          (instance_id >= lm_inst_id_table_size)) {
         lm_queue_message(ERROR_MSG, "internal simulator error: invalid instance id: %d specified",
                          instance_id);
         return (LM_ERROR);
      }
      instance = lm_inst_id_table[instance_id];
      if (BOGUS_INSTANCE(instance)) {
         lm_queue_message(ERROR_MSG, "internal simulator error: invalid instance id: %d specified",
                          instance_id);
         return (LM_ERROR);
      }
      lm_choose_conn(instance->box_fd);
      lm_put_int(PTRN_HIST_CMD);
      lm_put_short(instance->box_inst_id);
      lm_put_char(command);

      if (!lm_end_put(instance->box_fd))
         return (LM_ERROR);

      if (lm_get_int() != PTRN_HIST_ANS) {
         lm_queue_message(ERROR_MSG, "internal error: wrong reply received from modeler: %s",
                          lm_def_id_table[instance->def_id]->system_ptr->name);
         return (LM_ERROR);
      }
      if ((ret = lm_dequeue_errors()) == LM_ERROR)
         return (LM_ERROR);
   }

   return (ret);
}

/*----------------------------------------------------------------------*/

lm_inquire_modeler_list(number_of_modelers, list_of_modelers)
long        *number_of_modelers;
char       **list_of_modelers[];

{
   u_short     error_count;
   u_short     warning_count;
   u_short     index;
   u_short     i;

#ifdef DEBUG
   if (lm_debug[1]) {
      DPRINTF(("lm_inquire_modeler_list(0x%x, 0x%x)\n",
               number_of_modelers, list_of_modelers));
   }
#endif

   clear_errors();

   *list_of_modelers = NULL;

   if (!lm_sim_verified) {
      lm_queue_message(ERROR_MSG, "internal simulator error: lm_begin_modeling_session() has not yet been called");
      return (LM_ERROR);
   }
   for (i = 0; i < MAX_SYSTEM_TABLE_SIZE; ++i)
      if (lm_modeler_list_buf[i] != NULL) {
         DFREE(lm_modeler_list_buf[i]);
         lm_modeler_list_buf[i] = NULL;
      }
   *number_of_modelers = 0;

   for (index = 0, i = 0; lm_system_table[i] != NULL; ++i) {
```

Copyright 1989 Logic Modeling Systems

| SOURCE PROGRAM | DATE 5/23/89 | PAGE # |
|---|---|---|
| sfi/sfi2.c | TIME 1:20:56 pm | 2/48 |

SOURCE TEXT

```
        if (strlen(lm_system_table[i]->name) == 0)
            continue;

        if (index == MAX_SYSTEM_TABLE_SIZE) {
            lm_queue_message(ERROR_MSG, "internal error: return space is full");
            return (LM_ERROR);
        }

        lm_modeler_list_buf[index] =
                    DMALLOC((unsigned)(strlen(lm_system_table[i]->name) + 1));

        if (lm_modeler_list_buf[index] == NULL) {
            lm_queue_message(ERROR_MSG, "out of memory on host");
            return (LM_ERROR);
        }
        (void) strcpy(lm_modeler_list_buf[index], lm_system_table[i]->name);

        ++index;
        ++(*number_of_modelers);
    }

    *list_of_modelers = lm_modeler_list_buf;

#ifdef DEBUG
    if (lm_debug(2)) {
        DPRINTF(("lm_inquire_modeler_list(%d, ", *number_of_modelers));
        if (*number_of_modelers) {
            for (i = 0; i < *number_of_modelers - 1; ++i) {
                DPRINTF(("%s, ", lm_modeler_list_buf[i]));
            }
            DPRINTF(("%s)\n", lm_modeler_list_buf[i]));
        }
    }
#endif

    lm_message_types(&error_count, &warning_count);

    if (error_count != 0)
        return (LM_ERROR);

    if (warning_count != 0)
        return (LM_WARNING);

    return (LM_SUCCESS);
}

lm_inquire_modeler(attribute, value)
long        attribute;
long        *value;
{
    long        ret;

#ifdef DEBUG
    if (lm_debug(1)) {
        DPRINTF(("lm_inquire_modeler(%d, 0x%x)\n", attribute, value));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    *value = 0;

    if (lm_system_selected == NULL) {
        lm_queue_message(ERROR_MSG, "no modeler has been selected");
        return (LM_ERROR);
    }
    lm_choose_conn(lm_system_selected->fd);
    lm_put_int(INQ_MODELER_CMD);
    lm_put_int(attribute);

    if (!lm_end_put(lm_system_selected->fd))
        return (LM_ERROR);

    if (lm_get_int() != INQ_MODELER_ANS) {
        lm_queue_message(ERROR_MSG, "internal error: wrong reply received from modeler: %s",
                         lm_system_selected->name);
        return (LM_ERROR);
    }
    if ((ret = lm_dequeue_errors()) == LM_ERROR)
        return (LM_ERROR);

    *value = lm_get_int();

#ifdef DEBUG
    if (lm_debug(2)) {
        DPRINTF(("lm_inquire_modeler(XX, %d)\n", *value));
    }
#endif

    return (ret);
}

lm_password(attribute, password)
long        attribute;
char        *password;
{
    long        ret;
    char        c;

#ifdef DEBUG
    if (lm_debug(1)) {
        DPRINTF(("lm_password(%d, %s)\n", attribute, password));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }

    if (lm_system_selected == NULL) {
        lm_queue_message(ERROR_MSG, "no modeler has been selected");
        return (LM_ERROR);
    }
```

Copyright 1989
Logic Modeling Systems

SOURCE PROGRAM sfi/sfi2.c | DATE 5/23/89 | TIME 1:20:56 pm | PAGE # 3/49

SOURCE TEXT

```
    lm_choose_comm(lm_system_selected->fd);
    lm_put_int(PASSWORD_CMD);
    lm_put_int(attribute);

    while (c = *password++) {
        lm_put_char(c);
    }
    lm_put_char('\0');

    if (!lm_end_put(lm_system_selected->fd))
        return (LM_ERROR);

    if (lm_get_int() != PASSWORD_ANS) {
        lm_queue_message(ERROR_MSG, "internal error: wrong reply received from modeler: %s",
                        lm_system_selected->name);
        return (LM_ERROR);
    }
    if ((ret = lm_dequeue_errors()) == LM_ERROR)
        return (LM_ERROR);

#ifdef DEBUG
    if (lm_debug[2]) {
        DPRINTF(("lm_password(XX, XX)\n"));
    }
#endif

    return (ret);
}

lm_inquire_user_list(number_of_users, list_of_users,
                     list_of_hostnames, list_of_usernames)
long        *number_of_users;
long        *list_of_users[];
char        **list_of_hostnames[];
char        **list_of_usernames[];

{
    char        *ptr;
    long        ret;
    u_short     i;
    u_short     j;
    char        c;

#ifdef DEBUG
    if (lm_debug[1]) {
        DPRINTF(("lm_inquire_user_list(0x%x, 0x%x, 0x%x, 0x%x)\n",
                number_of_users, list_of_users,
                list_of_hostnames, list_of_usernames));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    *number_of_users = 0;

    if (lm_system_selected == NULL) {
        lm_queue_message(ERROR_MSG, "no modeler has been selected");
        return (LM_ERROR);
    }
    lm_choose_comm(lm_system_selected->fd);
    lm_put_int(INQ_USER_LIST_CMD);

    if (!lm_end_put(lm_system_selected->fd))
        return (LM_ERROR);

    if (lm_get_int() != INQ_USER_LIST_ANS) {
        lm_queue_message(ERROR_MSG, "internal error: wrong reply received from modeler: %s",
                        lm_system_selected->name);
        return (LM_ERROR);
    }
    if ((ret = lm_dequeue_errors()) == LM_ERROR)
        return (LM_ERROR);

    *number_of_users = lm_get_int();
    for (i = 0; i < *number_of_users; ++i)
        lm_iul_users[i] = lm_get_int();

    for (i = 0; i < *number_of_users; ++i) {
        ptr = lm_iul_hostnames[i];
        for (j = 0; (c = lm_get_char()) != '\0'; ++j)
            ptr[j] = c;
        ptr[j] = '\0';
    }

    for (i = 0; i < *number_of_users; ++i) {
        ptr = lm_iul_usernames[i];
        for (j = 0; (c = lm_get_char()) != '\0'; ++j)
            ptr[j] = c;
        ptr[j] = '\0';
    }

    *list_of_users = lm_iul_users;
    *list_of_hostnames = lm_iul_hostnames;
    *list_of_usernames = lm_iul_usernames;

#ifdef DEBUG
    if (lm_debug[2]) {
        if (*number_of_users) {
            DPRINTF(("lm_inquire_user_list(%d, ", *number_of_users));
            for (i = 0; i < *number_of_users - 1; ++i) {
                DPRINTF(("%d %s %s, ", lm_iul_users[i],
                        lm_iul_hostnames[i], lm_iul_usernames[i]));
            }
            DPRINTF(("%d %s %s)\n", lm_iul_users[i],
                    lm_iul_hostnames[i], lm_iul_usernames[i]));
        }
        else {
            DPRINTF(("lm_inquire_user_list(%d)\n", *number_of_users));
        }
    }
#endif

    return (ret);
}
```

Copyright 1989
Logic Modeling Systems

| SOURCE PROGRAM | DATE 5/23/89 | PAGE # |
|---|---|---|
| sfi/sfi2.c | TIME 1:20:56 pm | 4/50 |

SOURCE TEXT

```
lm_inquire_user(user_number, attribute, value)
long        user_number,
long        attribute,
long       *value,
{
   long        ret,

#ifdef DEBUG
   if (lm_debug[1]) {
      DPRINTF(("lm_inquire_user(%d, %d, 0x%x)\n",
               user_number, attribute, value));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   *value = 0;

   if (lm_system_selected == NULL) {
      lm_queue_message(ERROR_MSG, "no modeler has been selected");
      return (LM_ERROR);
   }
   lm_choose_conn(lm_system_selected->fd);
   lm_put_int(INQ_USER_CMD);
   lm_put_int(user_number);
   lm_put_int(attribute);

   if (!lm_end_put(lm_system_selected->fd))
      return (LM_ERROR);

   if (lm_get_int() != INQ_USER_ANS) {
      lm_queue_message(ERROR_MSG, "internal error: wrong reply received from modeler: %s",
                       lm_system_selected->name);
      return (LM_ERROR);
   }
   if ((ret = lm_dequeue_errors()) == LM_ERROR)
      return (LM_ERROR);

   *value = lm_get_int();

#ifdef DEBUG
   if (lm_debug[2]) {
      DPRINTF(("lm_inquire_user(XX, XX, %d)\n",
               *value));
   }
#endif

   return (ret);
}

lm_inquire_lane(lane_number, attribute, value)
long        lane_number,
long        attribute,
long       *value,
{
   long        ret,

#ifdef DEBUG
   if (lm_debug[1]) {
      DPRINTF(("lm_inquire_lane(%d, %d, 0x%x)\n",
               lane_number, attribute, value));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   *value = 0;

   if (lm_system_selected == NULL) {
      lm_queue_message(ERROR_MSG, "no modeler has been selected");
      return (LM_ERROR);
   }
   lm_choose_conn(lm_system_selected->fd);
   lm_put_int(INQ_LANE_CMD);
   lm_put_int(lane_number);
   lm_put_int(attribute);

   if (!lm_end_put(lm_system_selected->fd))
      return (LM_ERROR);

   if (lm_get_int() != INQ_LANE_ANS) {
      lm_queue_message(ERROR_MSG, "internal error: wrong reply received from modeler: %s",
                       lm_system_selected->name);
      return (LM_ERROR);
   }
   if ((ret = lm_dequeue_errors()) == LM_ERROR)
      return (LM_ERROR);

   *value = lm_get_int();

#ifdef DEBUG
   if (lm_debug[2]) {
      DPRINTF(("lm_inquire_lane(XX, XX, %d)\n",
               *value));
   }
#endif

   return (ret);
}

lm_inquire_pam(lane_number, pam_number, attribute, value)
long        lane_number,
long        pam_number,
long        attribute,
long       *value,
{
   long        ret,

#ifdef DEBUG
   if (lm_debug[1]) {
      DPRINTF(("lm_inquire_pam(%d, %d, %d, 0x%x)\n",
               lane_number, pam_number, attribute, value));
```

Copyright 1989 Logic Modeling Systems

SOURCE PROGRAM sfi/sfi2.c | DATE 5/23/89 | TIME 1:20:56 pm | PAGE # 5/51

SOURCE TEXT

```
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    *value = 0;

    if (lm_system_selected == NULL) {
        lm_queue_message(ERROR_MSG, "no modeler has been selected");
        return (LM_ERROR);
    }
    lm_choose_conn(lm_system_selected->fd);
    lm_put_int(INQ_PAM_CMD);
    lm_put_int(lane_number);
    lm_put_int(pam_number);
    lm_put_int(attribute);

    if (!lm_end_put(lm_system_selected->fd))
        return (LM_ERROR);

    if (lm_get_int() != INQ_PAM_ANS) {
        lm_queue_message(ERROR_MSG, "internal error: wrong reply received from modeler: %s",
                         lm_system_selected->name);
        return (LM_ERROR);
    }
    if ((ret = lm_dequeue_errors()) == LM_ERROR)
        return (LM_ERROR);

    *value = lm_get_int();

#ifdef DEBUG
    if (lm_debug[2]) {
        DPRINTF(("lm_inquire_pam(XX, XX, XX, %d)\n",
                *value));
    }
#endif

    return (ret);
}

lm_inquire_pel(lane, slot, attribute, value)
long        lane;
long        slot;
long        attribute;
long        *value;
{
    long        ret;

#ifdef DEBUG
    if (lm_debug[1]) {
        DPRINTF(("lm_inquire_pel(%d, %d, %d, 0x%x)\n",
                lane, slot, attribute, value));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    *value = 0;

    if (lm_system_selected == NULL) {
        lm_queue_message(ERROR_MSG, "no modeler has been selected");
        return (LM_ERROR);
    }
    lm_choose_conn(lm_system_selected->fd);
    lm_put_int(INQ_PEL_CMD);
    lm_put_int(lane);
    lm_put_int(slot);
    lm_put_int(attribute);

    if (!lm_end_put(lm_system_selected->fd))
        return (LM_ERROR);

    if (lm_get_int() != INQ_PEL_ANS) {
        lm_queue_message(ERROR_MSG, "internal error: wrong reply received from modeler: %s",
                         lm_system_selected->name);
        return (LM_ERROR);
    }
    if ((ret = lm_dequeue_errors()) == LM_ERROR)
        return (LM_ERROR);

    *value = lm_get_int();

#ifdef DEBUG
    if (lm_debug[2]) {
        DPRINTF(("lm_inquire_pel(XX, XX, XX, %d)\n",
                *value));
    }
#endif

    return (ret);
}

lm_inquire_device_list(number_of_devices, list_of_device_numbers,
                       list_of_device_names)
long        *number_of_devices;
long        *list_of_device_numbers[];
char        **list_of_device_names[];

{
    char        *temp_ptr;
    long        ret;
    u_short     j;
    u_short     i;
    char        c;

#ifdef DEBUG
    if (lm_debug[1]) {
        DPRINTF(("lm_inquire_device_list(0x%x, 0x%x, 0x%x)\n",
                number_of_devices, list_of_device_numbers,
                list_of_device_names));
    }
#endif
```

Copyright 1989 Logic Modeling Systems

SOURCE PROGRAM sfi/sfi2.c | DATE 5/23/89 | TIME 1:20:56 pm | PAGE # 6/52

SOURCE TEXT

```
    clear_errors();

    if (!lm_sim_verified) {
        lm_queue_message(ERROR_MSG, "internal simulator error: lm_begin_modeling_session() has not yet been called");
        return (LM_ERROR);
    }
    *number_of_devices = 0;

    if (lm_system_selected == NULL) {
        lm_queue_message(ERROR_MSG, "no modeler has been selected");
        return (LM_ERROR);
    }
    lm_choose_conn(lm_system_selected->fd);
    lm_put_int(INQ_DEVICE_LIST_CMD);

    if (!lm_end_put(lm_system_selected->fd))
        return (LM_ERROR);

    if (lm_get_int() != INQ_DEVICE_LIST_ANS) {
        lm_queue_message(ERROR_MSG, "internal error: wrong reply received from modeler: %s",
                         lm_system_selected->name);
        return (LM_ERROR);
    }
    if ((ret = lm_dequeue_errors()) == LM_ERROR)
        return (LM_ERROR);

    *number_of_devices = lm_get_int();

    /* Get the device numbers from the Network buffer */
    for (i = 0; i < *number_of_devices; ++i) {
        lm_idl_device_numbers[i] = lm_get_int();
    }

    /* Get the device names from the Network buffer */
    for (i = 0; i < *number_of_devices; ++i) {
        temp_ptr = lm_idl_device_names[i];
        for (j = 0; (c = lm_get_char()) != '\0'; ++j)
            temp_ptr[j] = c;
        temp_ptr[j] = '\0';
    }

    *list_of_device_numbers = lm_idl_device_numbers;
    *list_of_device_names = lm_idl_device_names;

#ifdef DEBUG
    if (lm_debug[2]) {
        if (*number_of_devices) {
            DPRINTF(("lm_inquire_device_list(%d, ", *number_of_devices));
            for (i = 0; i < *number_of_devices - 1; ++i) {
                DPRINTF(("%d %s, ",
                         lm_idl_device_numbers[i], lm_idl_device_names[i]));
            }
            DPRINTF(("%d %s)\n", lm_idl_device_numbers[i], lm_idl_device_names[i]));
        }
        else {
            DPRINTF(("lm_inquire_device_list(%d)\n", *number_of_devices));
        }
    }
#endif

    return (ret);
}

lm_inquire_device(device_number, attribute, value)
long        device_number;
long        attribute;
long        *value;
{
    long        ret;

#ifdef DEBUG
    if (lm_debug[1]) {
        DPRINTF(("lm_inquire_device(%d, %d, 0x%x)\n",
                 device_number, attribute, value));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    *value = 0;

    if (lm_system_selected == NULL) {
        lm_queue_message(ERROR_MSG, "no modeler has been selected");
        return (LM_ERROR);
    }
    lm_choose_conn(lm_system_selected->fd);

    lm_put_int(INQ_DEVICE_CMD);

    lm_put_int(device_number);

    lm_put_int(attribute);

    if (!lm_end_put(lm_system_selected->fd))
        return (LM_ERROR);

    if (lm_get_int() != INQ_DEVICE_ANS) {
        lm_queue_message(ERROR_MSG, "internal error: wrong reply received from modeler: %s",
                         lm_system_selected->name);
        return (LM_ERROR);
    }
    if ((ret = lm_dequeue_errors()) == LM_ERROR)
        return (LM_ERROR);

    *value = lm_get_int();

#ifdef DEBUG
    if (lm_debug[2]) {
        DPRINTF(("lm_inquire_device(XX, XX, %d)\n",
                 *value));
    }
#endif

    return (ret);
}
```

Copyright 1989 Logic Modeling Systems

SOURCE PROGRAM sfi/sfi2.c

DATE 5/23/89 TIME 1:20:56 pm

SOURCE TEXT

```
lm_inquire_dab(device_number, dab_number, attribute, string)
long        device_number;
long        dab_number;
long        attribute;
char       **string;
{
    long        ret;
    char       *pro_str;

#ifdef DEBUG
    if (lm_debug[1]) {
        DPRINTF(("lm_inquire_dab(%d, %d, %d, 0x%x)\n",
                 device_number, dab_number, attribute, string));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    *string = NULL;

    if (lm_system_selected == NULL) {
        lm_queue_message(ERROR_MSG, "no modeler has been selected");
        return (LM_ERROR);
    }
    lm_choose_comm(lm_system_selected->fd);

    lm_put_int(INQ_DAB_CMD);

    lm_put_int(device_number);
    lm_put_int(dab_number);
    lm_put_int(attribute);

    if (!lm_end_put(lm_system_selected->fd))
        return (LM_ERROR);

    if (lm_get_int() != INQ_DAB_ANS) {
        lm_queue_message(ERROR_MSG, "internal error: wrong reply received from modeler: %s",
                         lm_system_selected->name);
        return (LM_ERROR);
    }
    if ((ret = lm_dequeue_errors()) == LM_ERROR)
        return (LM_ERROR);

    pro_str = (char *) LM_GET_ADDR(lm_global_comm_ptr);
    (void) strcpy(lm_ind_string, pro_str);
    *string = lm_ind_string;

#ifdef DEBUG
    if (lm_debug[2]) {
        DPRINTF(("lm_inquire_dab(XX, XX, XX, %s)\n",
                 *string));
    }
#endif

    return (ret);
}

lm_inquire_dab_location(device_number, dab_number,
                        number_of_locations, lanes, slots)
long        device_number;
long        dab_number;
long       *number_of_locations;
long       *lanes[];
long       *slots[];

{
    long        ret;
    u_short     i;

#ifdef DEBUG
    if (lm_debug[1]) {
        DPRINTF(("lm_inquire_dab_location(%d, %d, 0x%x, 0x%x, 0x%x)\n",
                 device_number, dab_number,
                 number_of_locations, lanes, slots));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    *number_of_locations = 0;

    if (lm_system_selected == NULL) {
        lm_queue_message(ERROR_MSG, "no modeler has been selected");
        return (LM_ERROR);
    }
    lm_choose_comm(lm_system_selected->fd);

    lm_put_int(INQ_DAB_LOC_CMD);

    lm_put_int(device_number);
    lm_put_int(dab_number);

    if (!lm_end_put(lm_system_selected->fd))
        return (LM_ERROR);

    if (lm_get_int() != INQ_DAB_LOC_ANS) {
        lm_queue_message(ERROR_MSG, "internal error: wrong reply received from modeler: %s",
                         lm_system_selected->name);
        return (LM_ERROR);
    }
    if ((ret = lm_dequeue_errors()) == LM_ERROR)
        return (LM_ERROR);

    *number_of_locations = lm_get_int();

    for (i = 0; i < *number_of_locations; ++i) {
        lm_ids_lanes[i] = lm_get_int();
        lm_ids_slots[i] = lm_get_int();
    }

    *lanes = lm_ids_lanes;
```

Copyright 1989 Logic Modeling Systems

SOURCE PROGRAM sfi/sfi2.c | DATE 5/23/89 | TIME 1:20:56 pm | PAGE # 8/54

SOURCE TEXT

```
   *slots = lm_ids_slots;

#ifdef DEBUG
   if (lm_debug[2]) {
      if (*number_of_locations) {
         DPRINTF(("lm_inquire_dab_location(XX, XX, %d, ",
                  *number_of_locations));
         for (i = 0; i < *number_of_locations - 1; ++i) {
            DPRINTF(("[%d, %d], ", lm_ids_lanes[i], lm_ids_slots[i]));
         }
         DPRINTF(("[%d, %d])\n", lm_ids_lanes[i], lm_ids_slots[i]));
      }
      else {
         DPRINTF(("lm_inquire_dab_location(XX, XX, %d)\n",
                  *number_of_locations));
      }
   }
#endif

   return (ret);

}

lm_inquire_instance(instance_id, attribute, value)
long        instance_id;
long        attribute;
long       *value;
{
   INSTANCE_INFO *temp;
   long         ret;
   u_short      fault_count;
   u_short      i;

#ifdef DEBUG
   if (lm_debug[1]) {
      DPRINTF(("lm_inquire_instance(%d, %d, 0x%x)\n",
               instance_id, attribute, value));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   *value = 0;

   if (lm_specify_instance_id(instance_id) == LM_ERROR) {
      return (LM_ERROR);
   }
   if (attribute == LM_NUMBER_OF_FAULTS) {
      if (lm_instance_selected->assoc_inst_id != -1) {
         lm_queue_message(ERROR_MSG, "instance id: %d is a fault",
                          instance_id);
         return (LM_ERROR);
      }
      fault_count = 0;
      for (i = 0; i < lm_inst_id_table_size; ++i) {
         temp = lm_inst_id_table[i];
         if (BOGUS_INSTANCE(temp))
            continue;

         if (temp->assoc_inst_id == instance_id)
            ++fault_count;
      }

      *value = fault_count;

#ifdef DEBUG
      if (lm_debug[2]) {
         DPRINTF(("lm_inquire_instance(XX, XX, %d)\n",
                  *value));
      }
#endif

      return (LM_SUCCESS);
   } else if (attribute == LM_ASSOCIATED_DEFINITION_ID) {
      *value = lm_instance_selected->def_id;

#ifdef DEBUG
      if (lm_debug[2]) {
         DPRINTF(("lm_inquire_instance(XX, XX, %d)\n",
                  *value));
      }
#endif

      return (LM_SUCCESS);
   }
   lm_choose_conn(lm_instance_selected->box_fd);
   lm_put_int(INQ_INSTANCE_CMD);
   lm_put_short(lm_instance_selected->box_inst_id);
   lm_put_int(attribute);

   if (!lm_end_put(lm_instance_selected->box_fd))
      return (LM_ERROR);

   if (lm_get_int() != INQ_INSTANCE_ANS) {
      lm_queue_message(ERROR_MSG, "internal error: wrong reply received from modeler: %s",
            lm_def_id_table[lm_instance_selected->def_id]->system_ptr->name);
      return (LM_ERROR);
   }
   if ((ret = lm_dequeue_errors()) == LM_ERROR)
      return (LM_ERROR);

   *value = lm_get_int();

#ifdef DEBUG
   if (lm_debug[2]) {
      DPRINTF(("lm_inquire_instance(XX, XX, %d)\n",
               *value));
   }
#endif

   return (ret);
}

lm_inquire_fault(fault_id, attribute, value)
long        fault_id;
long        attribute;
```

Copyright 1989 Logic Modeling Systems

SOURCE PROGRAM sfi/sfi2.c

DATE 5/23/89 TIME 1:20:56 pm PAGE # 9/55

SOURCE TEXT

```
long        *value;
{
    long        ret;

#ifdef DEBUG
    if (lm_debug[1]) {
        DPRINTF(("lm_inquire_fault(%d, %d, 0x%x)\n", fault_id, attribute, value));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    *value = 0;

    if (lm_specify_instance_id(fault_id) == LM_ERROR) {
        return (LM_ERROR);
    }
    if (attribute == LM_ASSOCIATED_INSTANCE_ID) {
        if (lm_instance_selected->assoc_inst_id == -1) {
            lm_queue_message(ERROR_MSG, "fault id: %d is an instance",
                              fault_id);
            return (LM_ERROR);
        }
        *value = lm_instance_selected->assoc_inst_id;

#ifdef DEBUG
        if (lm_debug[2]) {
            DPRINTF(("lm_inquire_fault(XX, XX, %d)\n", *value));
        }
#endif

        return (LM_SUCCESS);
    }
    lm_choose_conn(lm_instance_selected->box_fd);
    lm_put_int(INQ_FAULT_CMD);
    lm_put_short(lm_instance_selected->box_inst_id);
    lm_put_int(attribute);

    if (!lm_end_put(lm_instance_selected->box_fd))
        return (LM_ERROR);

    if (lm_get_int() != INQ_FAULT_ANS) {
        lm_queue_message(ERROR_MSG, "internal error: wrong reply received from modeler: %s",
                lm_def_id_table[lm_instance_selected->def_id]->system_ptr->name);
        return (LM_ERROR);
    }
    if ((ret = lm_dequeue_errors()) == LM_ERROR)
        return (LM_ERROR);

    *value = lm_get_int();

#ifdef DEBUG
    if (lm_debug[2]) {
        DPRINTF(("lm_inquire_fault(XX, XX, %d)\n", *value));
    }
#endif

    return (ret);
}

/*------------------------------------------------------------------------*/

lm_select_modeler(modeler_name)
char        *modeler_name;
{

    /*
     * This function first search the system name in the system table. If found
     * then set the system selected, if not found then try to initiate
     * connection to that system and obtain the system_info from that system and
     * enter it into system table. The last element in the lm_system_table is
     * used as a sentinel and it has to be always NULL.
     */

    u_short     i;
    short       skt;
    u_short     error_count;
    u_short     warning_count;

#ifdef DEBUG
    if (lm_debug[1]) {
        DPRINTF(("lm_select_modeler(%s)\n", modeler_name));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    if (lm_verify_name(modeler_name, "modeler_name", MAX_NAME_LENGTH) == FAILURE)
        return (LM_ERROR);

    for (i = 0; lm_system_table[i] != NULL; ++i) {
        if (strcmp(lm_system_table[i]->name, modeler_name) == 0) {
            lm_system_selected = lm_system_table[i];
            break;
        }
    }

    if (lm_system_table[i] == NULL) {
        lm_queue_message(WARNING_MSG, "modeler: %s is not in %s file",
                          modeler_name, HOSTFILENAME);
        /* allow user to specify modeler not in HOSTFILENAME */
        if (lm_enter_system(modeler_name, -1) == FAILURE)
            return (LM_ERROR);
    }
    switch (lm_system_table[i]->state) {
        case USED_FOR_RD_WR:
            (void)lm_close_read_write_connection();
            lm_system_table[i]->state = NOT_OPENED;
            lm_system_table[i]->fd = -1;
        case NOT_OPENED:
            if (lm_initcomm(modeler_name, &skt) == FAILURE) {
                /* lm_system_table[i]->state = UNAVAIL; */
```

Copyright 1989
Logic Modeling Systems

SOURCE PROGRAM sfi/sfi2.c

DATE 5/23/89 TIME 1:20:56 pm

SOURCE TEXT

```
                lm_system_selected = NULL;
                return (LM_ERROR);
            } else {
                if (lm_send_begin_session_cmd((char)skt,
                                              modeler_name) == FAILURE) {

                    lm_close_modeler(skt);
                    lm_system_selected = NULL;
                    return (LM_ERROR);
                }
                lm_system_table[i]->state = USED;
                lm_system_table[i]->fd = skt;
                lm_system_selected = lm_system_table[i];
            }
            break;
        case UNAVAIL:
            lm_queue_message(ERROR_MSG, "modeler: %s is unavailable",
                             modeler_name);
            return (LM_ERROR);
        case USED:
            lm_system_selected = lm_system_table[i];
            return (LM_SUCCESS);
        default:
            lm_queue_message(ERROR_MSG, "internal error: unknown modeler accessibility state");
            return (LM_ERROR);
    }

    lm_message_types(&error_count, &warning_count);

    if (error_count != 0)
        return (LM_ERROR);

    if (warning_count != 0)
        return (LM_WARNING);

    return (LM_SUCCESS);
}

lm_shutdown(seconds, flag)
long            seconds;
long            flag;
{
    long            ret;
    u_long          delay;
    u_char          i;

#ifdef DEBUG
    if (lm_debug[1]) {
        DPRINTF(("lm_shutdown(%d, %d)\n", seconds, flag));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    if (lm_system_selected == NULL) {
        lm_queue_message(ERROR_MSG, "no modeler has been selected");
        return (LM_ERROR);
    }
    lm_choose_conn(lm_system_selected->fd);

    lm_put_int(SHUTDOWN_CMD);
    lm_put_char(flag);
    lm_put_int(seconds);

    if (!lm_end_put(lm_system_selected->fd))
        return (LM_ERROR);

    if (lm_get_int() != SHUTDOWN_ANS) {
        lm_queue_message(ERROR_MSG, "internal error: wrong reply received from modeler: %s",
                         lm_system_selected->name);
        return (LM_ERROR);
    }
    if ((ret = lm_dequeue_errors()) == LM_ERROR)
        return (LM_ERROR);

    for (i = 0; lm_system_table[i] != NULL; ++i) {
        if (lm_system_table[i] == lm_system_selected)
            break;
    }

    if (lm_system_table[i] == NULL) {
        lm_queue_message(ERROR_MSG, "internal error: system table corrupted");
        return (FAILURE);
    }
    /* We want to wait for all users to complete */
    if (flag == (u_long) LM_TRUE) {

        lm_choose_conn(lm_system_selected->fd);

        lm_put_int(ABORT_CMD);

        if (!lm_end_put(lm_system_selected->fd))
            return (LM_ERROR);

        if (lm_get_int() != ABORT_ANS) {
            lm_queue_message(ERROR_MSG, "internal error: wrong reply received from modeler: %s",
                             lm_system_selected->name);
            return (LM_ERROR);
        }
        if ((ret = lm_dequeue_errors()) == LM_ERROR)
            return (LM_ERROR);
    }
    (void) lm_close_read_write_connection();
    lm_close_modeler(lm_system_table[i]->fd);
    lm_system_table[i]->fd = -1;
    lm_system_table[i]->state = NOT_OPENED;

    lm_system_selected = NULL;

    delay = 4000000;
    while (delay--);

    return (ret);
}

/*-----------------------------------------------------------------------*/
```

Copyright 1989
Logic Modeling Systems

| SOURCE PROGRAM | DATE 5/23/89 | PAGE # |
|---|---|---|
| sfi/sfi2.c | TIME 1:20:56 pm | 11/57 |

LINE # SOURCE TEXT

```
lm_test_network(total_count, loop_count)
long        total_count;
long        loop_count;
{
   /* transmit "total_count" number of longs "loop_count" times */

   u_long      i;
   u_long      checksum;
   u_long      checksum2;
   u_short     loopno;

#ifdef DEBUG
   if (lm_debug[1]) {
      DPRINTF(("lm_test_network(%d, %d)\n", total_count, loop_count));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   if (lm_system_selected == NULL) {
      lm_queue_message(ERROR_MSG, "no modeler has been selected");
      return (LM_ERROR);
   }
   lm_choose_comm(lm_system_selected->fd);

   lm_put_int(TEST_NETWORK_CMD);

   lm_put_int(1);                 /* command */

   lm_put_int(total_count);
   checksum = 0;
   for (i = 0; i < total_count; ++i) {
      lm_put_int(i);
      checksum += i;
   }

   lm_put_int(checksum);
   DPRINTF(("checksum on command: %d\n", checksum));

   if (!lm_end_put(lm_system_selected->fd))
      return (LM_ERROR);

   if (lm_get_int() != TEST_NETWORK_ANS) {
      lm_queue_message(ERROR_MSG, "internal error: wrong reply received from modeler: %s",
                       lm_system_selected->name);
      return (LM_ERROR);
   }
   if (lm_dequeue_errors() == LM_ERROR)
      return (LM_ERROR);

   total_count = lm_get_int();
   DPRINTF(("total_number in answer: %d\n", total_count));
   checksum = 0;
   for (i = 0; i < total_count; ++i) {
      checksum += lm_get_int();
   }

   DPRINTF(("checksum on answer: %d\n", checksum));

   if ((checksum2 = lm_get_int()) != checksum) {
      lm_queue_message(ERROR_MSG, "internal error: checksum error on reply, exp: %08x got: %08x",
                       checksum2, checksum);
      return (LM_ERROR);
   }
   --loop_count;


   for (loopno = 0; loopno < loop_count; ++loopno) {
      lm_choose_comm(lm_system_selected->fd);

      lm_put_int(TEST_NETWORK_CMD);
      lm_put_int(1);              /* command */
      lm_put_int(total_count);
      checksum = 0;
      for (i = 0; i < total_count; ++i) {
         lm_put_int(i);
         checksum += i;
      }

      lm_put_int(checksum);

      if (!lm_end_put(lm_system_selected->fd))
         return (LM_ERROR);

      if (lm_get_int() != TEST_NETWORK_ANS) {
         lm_queue_message(ERROR_MSG, "internal error: wrong reply received from modeler: %s",
                          lm_system_selected->name);
         return (LM_ERROR);
      }
      if (lm_dequeue_errors() == LM_ERROR)
         return (LM_ERROR);

      total_count = lm_get_int();
      checksum = 0;
      for (i = 0; i < total_count; ++i) {
         checksum += lm_get_int();
      }

      if ((checksum2 = lm_get_int()) != checksum) {
         lm_queue_message(ERROR_MSG, "internal error: checksum error on reply, exp: %08x got: %08x",
                          checksum2, checksum);
         return (LM_ERROR);
      }
   }

   return (LM_SUCCESS);
}

lm_label_dab(lane_number, slot_number,
             dab_type, device_name,
             maker, maker_revision,
             manufacturer, revision,
             lanes_high, slots_wide,
             segment_number)
long        lane_number;
long        slot_number;
```

Copyright 1989 Logic Modeling Systems

| SOURCE PROGRAM | DATE 5/23/89 | PAGE # |
|---|---|---|
| sfi/sfi2.c | TIME 1:20:56 pm | 12/58 |

SOURCE TEXT

```
char        *dab_type;
char        *device_name;
char        *maker;
char        *maker_revision;
char        *manufacturer;
char        *revision;
long         lanes_high;
long         slots_wide;
long         segment_number;
{
   long        ret;
   u_char      i;

#ifdef DEBUG
   if (lm_debug(1)) {

      DPRINTF(("lm_label_dab(%d, %d, %s, %s, %s, %s, %s, %s, %d, %d, %d)\n",
               lane_number, slot_number,
               dab_type, device_name,
               maker, maker_revision,
               manufacturer, revision,
               lanes_high, slots_wide,
               segment_number));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   if (lm_system_selected == NULL) {
      lm_queue_message(ERROR_MSG, "no modeler has been selected");
      return (LM_ERROR);
   }
   lm_choose_conn(lm_system_selected->fd);

   lm_put_int(LABEL_DAB_CMD);

   lm_put_char(lane_number);

   lm_put_char(slot_number);

   if (dab_type == NULL) {
      lm_queue_message(ERROR_MSG, "dab_type is NULL");
      return (LM_ERROR);
   }
   if (strlen(dab_type) == 0) {
      lm_queue_message(ERROR_MSG, "dab_type is an empty string");
      return (LM_ERROR);
   }
   if (lm_isascii_string(dab_type) == FALSE) {
      lm_queue_message(ERROR_MSG, "internal simulator error: dab_type is not an ascii string");
      return (LM_ERROR);
   }
   /* dab_type */
   for (i = 0; ((i < 127) && (dab_type[i] != '\0')); ++i)
      lm_put_char(dab_type[i]);
   lm_put_char('\0');

   if (device_name == NULL) {
      lm_queue_message(ERROR_MSG, "device_name is NULL");
      return (LM_ERROR);
   }
   if (strlen(device_name) == 0) {
      lm_queue_message(ERROR_MSG, "device_name is an empty string");
      return (LM_ERROR);
   }
   if (lm_isascii_string(device_name) == FALSE) {
      lm_queue_message(ERROR_MSG, "internal simulator error: device_name is not an ascii string");
      return (LM_ERROR);
   }
   /* device_name */
   for (i = 0; ((i < 127) && (device_name[i] != '\0')); ++i)
      lm_put_char(device_name[i]);
   lm_put_char('\0');

   if (maker == NULL) {
      lm_queue_message(ERROR_MSG, "maker is NULL");
      return (LM_ERROR);
   }
   if (strlen(maker) == 0) {
      lm_queue_message(ERROR_MSG, "maker is an empty string");
      return (LM_ERROR);
   }
   if (lm_isascii_string(maker) == FALSE) {
      lm_queue_message(ERROR_MSG, "internal simulator error: maker is not an ascii string");
      return (LM_ERROR);
   }
   /* maker */
   for (i = 0; ((i < 127) && (maker[i] != '\0')); ++i)
      lm_put_char(maker[i]);
   lm_put_char('\0');

   if (mal    revision == NULL) {
      lm_queue_message(ERROR_MSG, "maker_revision is NULL");
      return (LM_ERROR);
   }
/*
   if (strlen(maker_revision) == 0) {
      lm_queue_message(ERROR_MSG, "maker_revision is an empty string");
      return(LM_ERROR);
   }
*/

   if (lm_isascii_string(maker_revision) == FALSE) {
      lm_queue_message(ERROR_MSG, "internal simulator error: maker_revision is not an ascii string");
      return (LM_ERROR);
   }
   /* maker_revision */
   for (i = 0; ((i < 127) && (maker_revision[i] != '\0')); ++i)
      lm_put_char(maker_revision[i]);
   lm_put_char('\0');

   if (manufacturer == NULL) {
      lm_queue_message(ERROR_MSG, "manufacturer is NULL");
      return (LM_ERROR);
   }
   if (strlen(manufacturer) == 0) {
```

Copyright 1989 Logic Modeling Systems

SOURCE PROGRAM sfi/sfi2.c | DATE 5/23/89 | TIME 1:20:56 pm | PAGE # 13/59

LINE # SOURCE TEXT

```
      lm_queue_message(ERROR_MSG, "manufacturer is an empty string");
      return (LM_ERROR);
   }
   if (lm_isascii_string(manufacturer) == FALSE) {
      lm_queue_message(ERROR_MSG, "internal simulator error: manufacturer is not an ascii string");
      return (LM_ERROR);
   }
   /* manufacturer */
   for (i = 0; ((i < 127) && (manufacturer[i] != '\0')); ++i)
      lm_put_char(manufacturer[i]);
   lm_put_char('\0');

   if (revision == NULL) {
      lm_queue_message(ERROR_MSG, "revision is NULL");
      return (LM_ERROR);
   }
   if (strlen(revision) == 0) {
      lm_queue_message(ERROR_MSG, "revision is an empty string");
      return (LM_ERROR);
   }
   if (lm_isascii_string(revision) == FALSE) {
      lm_queue_message(ERROR_MSG, "internal simulator error: revision is not an ascii string");
      return (LM_ERROR);
   }
   /* revision */
   for (i = 0; ((i < 127) && (revision[i] != '\0')); ++i)
      lm_put_char(revision[i]);
   lm_put_char('\0');

   lm_put_char(lanes_high);
   lm_put_char(slots_wide);
   lm_put_char(segment_number);

   if (!lm_end_put(lm_system_selected->fd))
      return (LM_ERROR);

   if (lm_get_int() != LABEL_DAB_ANS) {
      lm_queue_message(ERROR_MSG, "internal error: wrong reply received from modeler: %s",
                 lm_system_selected->name);
      return (LM_ERROR);
   }
   if ((ret = lm_dequeue_errors()) == LM_ERROR)
      return (LM_ERROR);

   return (ret);
}

lm_eval_control(instance_or_fault_id, attribute, value)
long         instance_or_fault_id;
long         attribute;
unsigned long value;
{
   long         ret;

#ifdef DEBUG
   if (lm_debug[1]) {
      DPRINTF(("lm_eval_control(%d, %d, %d)\n",
            instance_or_fault_id, attribute, value));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   if (lm_specify_instance_id(instance_or_fault_id) == LM_ERROR) {
      return (LM_ERROR);
   }
   lm_choose_conn(lm_instance_selected->box_fd);
   lm_put_int(EVAL_CONTROL_CMD);
   lm_put_short(lm_instance_selected->box_inst_id);
   lm_put_int(attribute);
   lm_put_int(value);

   if (!lm_end_put(lm_instance_selected->box_fd))
      return (LM_ERROR);

   if (lm_get_int() != EVAL_CONTROL_ANS) {
      lm_queue_message(ERROR_MSG, "internal error: wrong reply received from modeler: %s",
            lm_def_id_table[lm_instance_selected->def_id]->system_ptr->name);
      return (LM_ERROR);
   }
   if ((ret = lm_dequeue_errors()) == LM_ERROR)
      return (LM_ERROR);

   return (ret);

}

lm_reboot(seconds, flag)
long         seconds;
long         flag;
{
   long         ret;
   u_long       delay;
   u_char       i;

#ifdef DEBUG
   if (lm_debug[1]) {
      DPRINTF(("lm_reboot(%d, %d)\n", seconds, flag));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   if (lm_system_selected == NULL) {
      lm_queue_message(ERROR_MSG, "no modeler has been selected");
      return (LM_ERROR);
   }
   lm_choose_conn(lm_system_selected->fd);

   lm_put_int(REBOOT_CMD);
   lm_put_char(flag);
   lm_put_int(seconds);
```

Copyright 1989 Logic Modeling Systems

SOURCE PROGRAM sfi/sfi2.c | DATE 5/23/89 | TIME 1:20:56 pm | PAGE # 14/60

LINE # SOURCE TEXT

```
    if (!lm_end_put(lm_system_selected->fd))
       return (LM_ERROR);

    if (lm_get_int() != REBOOT_ANS) {
       lm_queue_message(ERROR_MSG, "internal error: wrong reply received from modeler: %s",
                        lm_system_selected->name);
       return (LM_ERROR);
    }
    if ((ret = lm_dequeue_errors()) == LM_ERROR)
       return (LM_ERROR);

    for (i = 0; lm_system_table[i] != NULL; ++i) {
       if (lm_system_table[i] == lm_system_selected)
          break;
    }

    if (lm_system_table[i] == NULL) {
       lm_queue_message(ERROR_MSG, "internal error: system table corrupted");
       return (FAILURE);
    }
    /* We want to wait for all users to complete */
    if (flag == (u_long) LM_TRUE) {

       lm_choose_comm(lm_system_selected->fd);

       lm_put_int(ABORT_CMD);

       if (!lm_end_put(lm_system_selected->fd))
          return (LM_ERROR);

       if (lm_get_int() != ABORT_ANS) {
          lm_queue_message(ERROR_MSG, "internal error: wrong reply received from modeler: %s",
                           lm_system_selected->name);
          return (LM_ERROR);
       }
       if ((ret = lm_dequeue_errors()) == LM_ERROR)
          return (LM_ERROR);
    }
    (void) lm_close_read_write_connection();
    lm_close_modeler(lm_system_table[i]->fd);
    lm_system_table[i]->fd = -1;
    lm_system_table[i]->state = NOT_OPENED;

    lm_system_selected = NULL;

    delay = 2000000;
    while (delay--);
    return (ret);
}

lm_inquire_device_pins(definition_id, pin_type, pin_name, pin_number_str, pin_alias, pin_attribute)
long        definition_id;
long        pin_type;
char       **pin_name;
char       **pin_number_str;
char       **pin_alias;
long        *pin_attribute;
{
    short       pin_number;
    u_char      ptype;

#ifdef DEBUG
    if (lm_debug[1]) {
       DPRINTF(("lm_inquire_device_pins(%d, %d, 0x%x, 0x%x, 0x%x 0x%x)\n",
                definition_id, pin_type, pin_name, pin_number_str,
                pin_alias, pin_attribute));
    }
#endif

    clear_errors();

    if (!lm_sim_verified) {
       lm_queue_message(ERROR_MSG, "internal simulator error: lm_begin_modeling_session() has not yet been called");
       return (LM_ERROR);
    }
    if ((definition_id != lm_last_definition_id_specified) ||
        (definition_id == -1)) {

       if ((definition_id < 0) || (definition_id >= lm_def_id_avail)) {
          lm_queue_message(ERROR_MSG, "internal simulator error: invalid definition id: %d specified",
                           definition_id);
          return (LM_ERROR);
       }
       if (lm_def_id_table[definition_id] == NULL) {
          lm_queue_message(ERROR_MSG, "internal simulator error: invalid definition id: %d specified",
                           definition_id);
          return (LM_ERROR);
       }
       lm_last_definition_id_specified = definition_id;
       lm_definition_selected = lm_def_id_table[definition_id];
    }
    switch (pin_type) {
       case LM_INPUT:
          pin_number = lm_definition_selected->input_pin_number_returned;
          ptype = IN;
          break;
       case LM_OUTPUT:
          pin_number = lm_definition_selected->output_pin_number_returned;
          ptype = OUT;
          break;
       case LM_IO:
          pin_number = lm_definition_selected->io_pin_number_returned;
          ptype = IO;
          break;
       case LM_POWER:
          pin_number = lm_definition_selected->power_pin_number_returned;
          ptype = POWER;
          break;
       case LM_GROUND:
          pin_number = lm_definition_selected->ground_pin_number_returned;
          ptype = GROUND;
          break;
       case LM_NO_CONNECT:
          pin_number = lm_definition_selected->nc_pin_number_returned;
          ptype = NC;
          break;
       default:
          lm_queue_message(ERROR_MSG, "internal simulator error: invalid pin_type: %d specified",
                           pin_type);
```

Copyright 1989 Logic Modeling Systems

SOURCE PROGRAM sfi/sfi2.c | DATE 5/23/89 | TIME 1:20:56 pm | PAGE # 15/61

SOURCE TEXT

```
            return (LM_ERROR);
    }

    for (++pin_number;
        pin_number < lm_definition_selected->dab_pid_table_size; ++pin_number) {
        if (lm_definition_selected->dab_pid_table[pin_number].pin_type == ptype) {
            break;
        }
    }

    if (pin_number == lm_definition_selected->dab_pid_table_size)
        pin_number = -1;

    switch (pin_type) {
        case LM_INPUT:
            lm_definition_selected->input_pin_number_returned = pin_number;
            break;
        case LM_OUTPUT:
            lm_definition_selected->output_pin_number_returned = pin_number;
            break;
        case LM_IO:
            lm_definition_selected->io_pin_number_returned = pin_number;
            break;
        case LM_POWER:
            lm_definition_selected->power_pin_number_returned = pin_number;
            break;
        case LM_GROUND:
            lm_definition_selected->ground_pin_number_returned = pin_number;
            break;
        case LM_NO_CONNECT:
            lm_definition_selected->nc_pin_number_returned = pin_number;
            break;
        default:
            break;
    }

    if (pin_number == -1) {
        *pin_name       = LM_NO_MORE_PINS;
        *pin_number_str = "";
        *pin_attribute  = 0;
        *pin_alias      = "";

#ifdef DEBUG
        if (lm_debug[2]) {
            DPRINTF(("lm_inquire_device_pins(XX, XX, LM_NO_MORE_PINS, (null), (null), %d)\n",
                    *pin_attribute));
        }
#endif

        return (LM_SUCCESS);
    }
    switch (lm_definition_selected->dab_pid_table[pin_number].pin_class) {
        case DATA:
            *pin_attribute = LM_DATA_PIN;
            break;
        case EVAL:
            *pin_attribute = LM_EVAL_PIN;
            break;
        case STORE:
            *pin_attribute = LM_STORE_PIN;
            break;
        case EDGE_RISE:
            *pin_attribute = LM_EDGE_RISE_PIN;
            break;
        case EDGE_FALL:
            *pin_attribute = LM_EDGE_FALL_PIN;
            break;
        default:
            break;
    }

    (void) strcpy(lm_idp_string,
                lm_definition_selected->dab_pid_table[pin_number].name);
    *pin_name = lm_idp_string;

    (void) strcpy(lm_idp_string2,
            lm_definition_selected->dab_pid_table[pin_number].pin_number_str);
    *pin_number_str = lm_idp_string2;

    if (lm_definition_selected->dab_pid_table[pin_number].pin_alias == NULL) {
        *pin_alias = "";
    }
    else {
        (void) strcpy(lm_idp_string3,
                lm_definition_selected->dab_pid_table[pin_number].pin_alias);
        *pin_alias = lm_idp_string3;
    }

#ifdef DEBUG
    if (lm_debug[2]) {
        DPRINTF(("lm_inquire_device_pins(XX, XX, %s, %s, %s, %d)\n",
                *pin_name, *pin_number_str, *pin_alias, *pin_attribute));
    }
#endif

    return (LM_SUCCESS);
}

lm_check_shell_software_f(filename)
char        *filename;
{
    char        *device_name;
    char        *modeler_name;
    char        *outbuf;
    u_long       n;
    u_long       buf_size;
    short        fd;
    short        skt;
    u_short      device_usage;
    u_short      error_count;
    u_short      warning_count;
    u_char       i;
    u_char       opened_new_modeler = FALSE;
    char         full_filename[MAX_STRING_LENGTH];

#ifdef DEBUG
    if (lm_debug[1]) {
        DPRINTF(("lm_check_shell_software_f(%s)\n", filename));
    }
#endif
```

Copyright 1989
Logic Modeling Systems

SOURCE PROGRAM sfi/sfi2.c | DATE 5/23/89 | TIME 1:20:56 pm | PAGE # 16/62

SOURCE TEXT

```
clear_errors();

if (!lm_ . verified) {
   lm_queue_message(ERROR_MSG, "internal simulator error: lm_begin_modeling_session() has not yet been called");
   return (LM_ERROR);
}
if (lm_verify_name(filename, "filename", MAX_STRING_LENGTH) == FAILURE)
   return (LM_ERROR);

if (lm_resolve_library_file("LM_LIB", filename,
                       full_filename, (long) MAX_STRING_LENGTH) == FAILURE) {
   return (LM_ERROR);
}
if (lm_check_file_type(full_filename) == FAILURE) {
   return (LM_ERROR);
}
/* SUN/SYS5 compatibility change to hardcode O_RDONLY to equal 0. */
if ((fd = open(full_filename, 0)) == -1) {
   lm_queue_message(ERROR_MSG, "cannot open Shell Software file: %s",
                      full_filename);
   return (LM_ERROR);
}
lm_tbuf_ptr = lm_temp_buffer;
buf_size = lm_max_tbuf_addr - lm_temp_buffer - 1;

while ((n = (u_long) read(fd, lm_tbuf_ptr, (int) buf_size)) > 0) {
   lm_tbuf_ptr += n;
   buf_size -= n;
   if (buf_size == 0) {
      if (lm_extend_tbuf() == FAILURE)
         return (LM_ERROR);
      buf_size = lm_max_tbuf_addr - lm_tbuf_ptr - 1;
   }
}
*lm_tbuf_ptr++ = '\0';

if (close(fd) != 0) {
   lm_queue_message(ERROR_MSG, "cannot close file: %s",
                      full_filename);
   return (LM_ERROR);
}

/*
 * Run the HDBL front-end processor (lexical_pass()). lexical_pass() returns
 * NULL if there are lexical errors.
 */
lm_Hinit_vars("HDBL");
outbuf = lm_Hlexical_pass(full_filename, lm_temp_buffer, &device_name,
                           &modeler_name, &device_usage);

if (outbuf == NULL) {
   /* error encountered when parsing the DABDEF */
   return (LM_ERROR);
}
if (device_name == NULL) {
   lm_queue_message(ERROR_MSG, "no device_name statement in Shell Software: %s",
                      full_filename);
   return (LM_ERROR);
}
for (i = 0; lm_system_table[i] != NULL; ++i) {
   if (lm_system_table[i]->state == USED)
      break;
}

if (lm_system_table[i] == NULL) {
   for (i = 0; lm_system_table[i] != NULL; ++i) {
      if (lm_system_table[i]->state != NOT_OPENED)
         continue;

      if (lm_initcomm(lm_system_table[i]->name, &skt) == FAILURE) {
         /* lm_system_table[i]->state = UNAVAIL; */
         lm_system_table[i]->fd = -1;
      } else {
         if (lm_send_begin_session_cmd((char)skt,
                                      lm_system_table[i]->name) == FAILURE) {
            lm_close_modeler(skt);
         } else {
            opened_new_modeler = TRUE;
            lm_system_table[i]->state = USED;
            lm_system_table[i]->fd = skt;
            break;
         }
      }
   }

   /*
    * Clear the errors from all the modeler we talked to when trying to find
    * a good modeler to check Shell Software.
    */
   clear_errors();

   if (lm_system_table[i] == NULL) {
      lm_queue_message(ERROR_MSG, "cannot find any modeler to check Shell Software");
      return (LM_ERROR);
   }
}
(void) lm_send_def2(lm_system_table[i], outbuf);

/* Free the buffer allocated by HDBL front end processor */
free(outbuf);

if (opened_new_modeler == TRUE) {
   lm_choose_conn(lm_system_table[i]->fd);
   lm_put_int(ABORT_CMD);

   (void) lm_end_put(lm_system_table[i]->fd);

   lm_close_modeler(lm_system_table[i]->fd);
   lm_system_table[i]->fd = -1;
   lm_system_table[i]->state = NOT_OPENED;
}
lm_message_types(&error_count, &warning_count);

if (error_count != 0)
   return (LM_ERROR);

if (warning_count != 0)
   return (LM_WARNING);
```

Copyright 1989 Logic Modeling Systems

| SOURCE PROGRAM | DATE | PAGE # |
|---|---|---|
| sfi/sfi2.c | 5/23/89 | 17/63 |
| | TIME 1:20:56 pm | |

SOURCE TEXT

```
   return (LM_SUCCESS);
}

lm_check_shell_software_s(string)
char        *string;
{
   char        *device_name;
   char        *modeler_name;
   char        *outbuf;
   char        *str;
   short        skt;
   u_short      device_usage;
   u_short      error_count;
   u_short      warning_count;
   u_char       i;
   u_char       opened_new_modeler;

#ifdef DEBUG
   if (lm_debug[1]) {
      DPRINTF(("lm_check_shell_software_s(%s)\n", string));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   if (lm_first_call == TRUE) {
      lm_tbuf_ptr = lm_temp_buffer;
      lm_first_call = FALSE;
   }
   if (string != LM_END_OF_TEXT) {
      str = string;
      if (lm_max_tbuf_addr - lm_tbuf_ptr - 1 < strlen(str) + 1)
         if (lm_extend_tbuf() == FAILURE)
            return (LM_ERROR);
      for (; (*lm_tbuf_ptr++ = *str++) != '\n';);
      return (LM_SUCCESS);
   }
   *lm_tbuf_ptr++ = '\0';
   lm_first_call = TRUE;

   /*
    * Run the HMBL front-end processor (lexical_pass()). lexical_pass() returns
    * NULL if there are lexical errors.
    */
   lm_Hinit_vars("HMBL");
   outbuf = lm_Hlexical_pass("NULLNAME", lm_temp_buffer, &device_name,
                             &modeler_name, &device_usage);

   if (outbuf == NULL) {
      /* error encountered when parsing the DANDEF */
      return (LM_ERROR);
   }
   if (device_name == NULL) {
      lm_queue_message(ERROR_MSG, "no device_name statement in Shell Software: %s",
                       "NULLNAME");
      return (LM_ERROR);
   }
   for (i = 0; lm_system_table[i] != NULL; ++i) {
      if (lm_system_table[i]->state == USED)
         break;
   }

   if (lm_system_table[i] == NULL) {
      for (i = 0; lm_system_table[i] != NULL; ++i) {
         if (lm_system_table[i]->state != NOT_OPENED)
            continue;

         if (lm_initcomm(lm_system_table[i]->name, &skt) == FAILURE) {
            /* lm_system_table[i]->state = UNAVAIL; */
            lm_system_table[i]->fd = -1;
         } else {
            if (lm_send_begin_session_cmd((char)skt,
                                   lm_system_table[i]->name) == FAILURE) {
               lm_close_modeler(skt);
            } else {
               opened_new_modeler = TRUE;
               lm_system_table[i]->state = USED;
               lm_system_table[i]->fd = skt;
               break;
            }
         }
      }

      if (lm_system_table[i] == NULL) {
         lm_queue_message(ERROR_MSG, "cannot find any modeler to check Shell Software");
         return (LM_ERROR);
      }
   }
   (void) lm_send_def2(lm_system_table[i], outbuf);

   /* Free the buffer allocated by HMBL front end processor */
   free(outbuf);

   if (opened_new_modeler == TRUE) {
      lm_choose_conn(lm_system_table[i]->fd);
      lm_put_int(ABORT_CMD);

      (void) lm_end_put(lm_system_table[i]->fd);

      lm_close_modeler(lm_system_table[i]->fd);
      lm_system_table[i]->fd = -1;
      lm_system_table[i]->state = NOT_OPENED;
   }
   lm_message_types(&error_count, &warning_count);

   if (error_count != 0)
      return (LM_ERROR);

   if (warning_count != 0)
      return (LM_WARNING);

   return (LM_SUCCESS);
}


lm_lock_modeler()
```

Copyright 1989 Logic Modeling Systems

| SOURCE PROGRAM | DATE | PAGE # |
|---|---|---|
| sfi/sfi2.c | 5/23/89 TIME 1:20:56 pm | 18/64 |

LINE # SOURCE TEXT

```
{
    u_char      i;
    char        c;

#ifdef DEBUG
    if (lm_debug[1]) {
        DPRINTF(("lm_lock_modeler()\n"));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    if (lm_system_selected == NULL) {
        lm_queue_message(ERROR_MSG, "no modeler has been selected");
        return (LM_ERROR);
    }
    lm_choose_conn(lm_system_selected->fd);

    lm_put_int(TEST_NETWORK_CMD);

    lm_put_int(2);              /* command */

    lm_put_int(1000);           /* subcommand */

    for (i = 0; (c = lm_gbl_username[i]) != '\0'; ++i)
        lm_put_char(c);
    lm_put_char('\0');

    if (!lm_end_put(lm_system_selected->fd))
        return (LM_ERROR);

    if (lm_get_int() != TEST_NETWORK_ANS) {
        lm_queue_message(ERROR_MSG, "internal error: wrong reply received from modeler: %s",
                         lm_system_selected->name);
        return (LM_ERROR);
    }
    return (lm_dequeue_errors());
}

lm_unlock_modeler()
{

#ifdef DEBUG
    if (lm_debug[1]) {
        DPRINTF(("lm_unlock_modeler()\n"));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    if (lm_system_selected == NULL) {
        lm_queue_message(ERROR_MSG, "no modeler has been selected");
        return (LM_ERROR);
    }
    lm_choose_conn(lm_system_selected->fd);

    lm_put_int(TEST_NETWORK_CMD);

    lm_put_int(2);              /* command */

    lm_put_int(2000);           /* subcommand */

    if (!lm_end_put(lm_system_selected->fd))
        return (LM_ERROR);

    if (lm_get_int() != TEST_NETWORK_ANS) {
        lm_queue_message(ERROR_MSG, "internal error: wrong reply received from modeler: %s",
                         lm_system_selected->name);
        return (LM_ERROR);
    }
    return (lm_dequeue_errors());
}

lm_abort_user(user_number)
u_long      user_number;
{

#ifdef DEBUG
    if (lm_debug[1]) {
        DPRINTF(("lm_abort_user(%d)\n", user_number));
    }
#endif

    clear_errors();

    if (!lm_sim_verified) {
        lm_queue_message(ERROR_MSG, "internal simulator error: lm_begin_modeling_session() has not yet been called");
        return (LM_ERROR);
    }
    if (lm_system_selected == NULL) {
        lm_queue_message(ERROR_MSG, "no modeler has been selected");
        return (LM_ERROR);
    }
    lm_choose_conn(lm_system_selected->fd);

    lm_put_int(TEST_NETWORK_CMD);

    lm_put_int(3);              /* command */

    lm_put_int(user_number);

    if (!lm_end_put(lm_system_selected->fd))
        return (LM_ERROR);

    if (lm_get_int() != TEST_NETWORK_ANS) {
        lm_queue_message(ERROR_MSG, "internal error: wrong reply received from modeler: %s",
                         lm_system_selected->name);
        return (LM_ERROR);
    }
    return (lm_dequeue_errors());
}
```

Copyright 1989 Logic Modeling Systems

SOURCE PROGRAM sfi/sfi2.c | DATE 5/23/89 | TIME 1:20:56 pm | PAGE # 19/65

SOURCE TEXT

```
lm_clear_profile()
{

#ifdef DEBUG
   if (lm_debug[1]) {
      DPRINTF(("lm_clear_profile()\n"));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   if (lm_system_selected == NULL) {
      lm_queue_message(ERROR_MSG, "no modeler has been selected");
      return (LM_ERROR);
   }
   lm_choose_conn(lm_system_selected->fd);

   lm_put_int(TEST_NETWORK_CMD);

   lm_put_int(4);                  /* command */

   if (!lm_end_put(lm_system_selected->fd))
      return (LM_ERROR);

   if (lm_get_int() != TEST_NETWORK_ANS) {
      lm_queue_message(ERROR_MSG, "internal error: wrong reply received from modeler: %s",
                       lm_system_selected->name);
      return (LM_ERROR);
   }
   return (lm_dequeue_errors());
}

lm_dump_profile(filename)
char        *filename;
{
   FILE        *outfile;
   long         ret;
   long         total;
   long         i;
   long         addr;
   long         count;

#ifdef DEBUG
   if (lm_debug[1]) {
      DPRINTF(("lm_dump_profile(%s)\n", filename));
   }
#endif

   clear_errors();

   if (!lm_sim_verified) {
      lm_queue_message(ERROR_MSG, "internal simulator error: lm_begin_modeling_session() has not yet been called");
      return (LM_ERROR);
   }
   if (lm_system_selected == NULL) {
      lm_queue_message(ERROR_MSG, "no modeler has been selected");
      return (LM_ERROR);
   }
   outfile = fopen(filename, "w");
   if (outfile == NULL) {
      lm_queue_message(ERROR_MSG, "can't open file: %s for write",
                       filename);
      return (LM_ERROR);
   }
   lm_choose_conn(lm_system_selected->fd);

   lm_put_int(TEST_NETWORK_CMD);

   lm_put_int(5);                  /* command */

   if (!lm_end_put(lm_system_selected->fd))
      return (LM_ERROR);

   if (lm_get_int() != TEST_NETWORK_ANS) {
      lm_queue_message(ERROR_MSG, "internal error: wrong reply received from modeler: %s",
                       lm_system_selected->name);
      return (LM_ERROR);
   }
   if ((ret = lm_dequeue_errors()) == LM_ERROR)
      return (LM_ERROR);

   total = lm_get_int();
   for (i = 0; i < total; ++i) {
      addr = lm_get_int();
      count = lm_get_int();
      (void) fprintf(outfile, "%08X %d\n", addr, count);
   }

   return (ret);
}
```

Copyright 1989 Logic Modeling Systems

| SOURCE PROGRAM | DATE | PAGE # |
|---|---|---|
| sfi/signal.c | 5/23/89 TIME 1:20:58 pm | 1/66 |

SOURCE TEXT

```
/* SCCS_ID: signal.c rev 3.1, 4/24/89 at 07:36:14      */

#include <signal.h>
#include "common.h"
#include "message.h"
#include "lm_sfi.h"

#ifdef  SUNOS3_5
#define LM_BADSIG       (int (*)())-1
#else
#define LM_BADSIG       (void (*)())-1
#endif

#ifndef APOLLO
        int     lm_call_atexit = LM_TRUE;
#endif

#ifdef SIGHUP
        int     lm_handle_SIGHUP = LM_TRUE;
#endif
#ifdef SIGINT
        int     lm_handle_SIGINT = LM_TRUE;
#endif
#ifdef SIGQUIT
        int     lm_handle_SIGQUIT = LM_TRUE;
#endif
#ifdef SIGILL
        int     lm_handle_SIGILL = LM_TRUE;
#endif
#ifdef SIGTRAP
        int     lm_handle_SIGTRAP = LM_TRUE;
#endif
#ifdef SIGIOT
        int     lm_handle_SIGIOT = LM_TRUE;
#endif
#ifdef SIGEMT
        int     lm_handle_SIGEMT = LM_TRUE;
#endif
#ifdef SIGFPE
        int     lm_handle_SIGFPE = LM_TRUE;
#endif
#ifdef SIGBUS
        int     lm_handle_SIGBUS = LM_TRUE;
#endif
#ifdef SIGSEGV
        int     lm_handle_SIGSEGV = LM_TRUE;
#endif
#ifdef SIGSYS
        int     lm_handle_SIGSYS = LM_TRUE;
#endif
#ifdef SIGPIPE
        int     lm_handle_SIGPIPE = LM_TRUE;
#endif
#ifdef SIGTERM
        int     lm_handle_SIGTERM = LM_TRUE;
#endif
#ifdef SIGXCPU
        int     lm_handle_SIGXCPU = LM_TRUE;
#endif
#ifdef SIGXFSZ
        int     lm_handle_SIGXFSZ = LM_TRUE;
#endif
#ifdef SIGLOST
        int     lm_handle_SIGLOST = LM_TRUE;
#endif
#ifdef SIGUSR1
        int     lm_handle_SIGUSR1 = LM_TRUE;
#endif
#ifdef SIGUSR2
        int     lm_handle_SIGUSR2 = LM_TRUE;
#endif
#ifdef SIGABRT
        int     lm_handle_SIGABRT = LM_TRUE;
#endif
#ifdef SIGAPOLLO
        int     lm_handle_SIGAPOLLO = LM_TRUE;
#endif

extern  u_char  lm_debug[];

#ifdef DEBUG
#define DPRINTF(x) (void)printf x
#else
#define DPRINTF(x) /* do nothing */
#endif

lm_handle_signals()
{
        int     error_condition;
#ifdef  SUNOS3_5
        int     (*previous_signal)();
        int     lm_global_signal_handler();
#else
        void    (*previous_signal)();
        void    lm_global_signal_handler();
#endif
        static int      been_here_before = LM_FALSE;

        char    *sig_failed = "call to set signal handler for %s failed";
        char    *sig_previous = "overriding previously set signal handler for %s";

        extern  int     lm_end_modeling_session();


        if (been_here_before == LM_TRUE)
                return(SUCCESS);
        been_here_before = LM_TRUE;

#ifdef DEBUG
    if (lm_debug[6]) {
       DPRINTF(("lm_handle_signals(): entering signal handler setup\n"));
    }
#endif

        error_condition = LM_FALSE;

#ifndef APOLLO
        if (lm_call_atexit == LM_TRUE) {
#ifdef  SUN
#ifdef DEBUG
```

Copyright 1989 Logic Modeling Systems

| SOURCE PROGRAM | DATE | 5/23/89 | PAGE # |
|---|---|---|---|
| sfi/signal.c | TIME | 1:20:58 pm | 2/67 |

LINE # SOURCE TEXT

```
                if (lm_debug[6]) {
                        DPRINTF(("lm_handle_signals(): setting up os_exit()\n"));
                }
#endif
                if (os_exit(lm_end_modeling_session, (char *)NULL) != 0) {
                        error_condition = LM_TRUE;
                        lm_queue_message(SYS_ERROR_MSG,
                                "call to set exit handler 'os_exit' failed");
                }
#else   /* VMS or PC386 */
#ifdef DEBUG
                if (lm_debug[6]) {
                        DPRINTF(("lm_handle_signals(): setting up atexit()\n"));
                }
#endif
                if (atexit(lm_end_modeling_session) != 0) {
                        error_condition = LM_TRUE;
                        lm_queue_message(SYS_ERROR_MSG,
                                "call to set exit handler 'atexit' failed");
                }
#endif  /* SUN */
        }
#ifdef DEBUG
        else {
                if (lm_debug[6]) {
                        DPRINTF(("lm_handle_signals(): NOT setting up (at|os_)exit()\n"));
                }
        }
#endif  /* DEBUG */
#endif  /* !APOLLO */


#ifdef SIGHUP
        if (lm_handle_SIGHUP == LM_TRUE) {
#ifdef DEBUG
            if (lm_debug[6]) {
                DPRINTF(("lm_handle_signals(): setting up handler for SIGHUP()\n"));
            }
#endif
                previous_signal = signal(SIGHUP, lm_global_signal_handler);
                if (previous_signal == LM_BADSIG) {
                        error_condition = LM_TRUE;
                        lm_queue_message(SYS_ERROR_MSG, sig_failed, "SIGHUP");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGHUP");
                }
        }
#ifdef DEBUG
        else {
            if (lm_debug[6]) {
                DPRINTF(("lm_handle_signals(): NOT setting up handler for SIGHUP()\n"));
            }
        }
#endif
#endif

#ifdef SIGINT
        if (lm_handle_SIGINT == LM_TRUE) {
#ifdef DEBUG
            if (lm_debug[6]) {
                DPRINTF(("lm_handle_signals(): setting up handler for SIGINT()\n"));
            }
#endif
                previous_signal = signal(SIGINT, lm_global_signal_handler);
                if (previous_signal == LM_BADSIG) {
                        error_condition = LM_TRUE;
                        lm_queue_message(SYS_ERROR_MSG, sig_failed, "SIGINT");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGINT");
                }
        }
#ifdef DEBUG
        else {
            if (lm_debug[6]) {
                DPRINTF(("lm_handle_signals(): NOT setting up handler for SIGINT()\n"));
            }
        }
#endif
#endif

#ifdef SIGQUIT
        if (lm_handle_SIGQUIT == LM_TRUE) {
#ifdef DEBUG
            if (lm_debug[6]) {
                DPRINTF(("lm_handle_signals(): setting up handler for SIGQUIT()\n"));
            }
#endif
                previous_signal = signal(SIGQUIT, lm_global_signal_handler);
                if (previous_signal == LM_BADSIG) {
                        error_condition = LM_TRUE;
                        lm_queue_message(SYS_ERROR_MSG, sig_failed, "SIGQUIT");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGQUIT");
                }
        }
#ifdef DEBUG
        else {
            if (lm_debug[6]) {
                DPRINTF(("lm_handle_signals(): NOT setting up handler for SIGQUIT()\n"));
            }
        }
#endif
#endif

#ifdef SIGILL
        if (lm_handle_SIGILL == LM_TRUE) {
#ifdef DEBUG
            if (lm_debug[6]) {
```

Copyright 1989
Logic Modeling Systems

SOURCE PROGRAM sfi/signal.c

DATE 5/23/89 TIME 1:20:58 pm

PAGE # 3/68

LINE # SOURCE TEXT

```
                DPRINTF(("lm_handle_signals(): setting up handler for SIGILL()\n"));
            }
#endif
                previous_signal = signal(SIGILL, lm_global_signal_handler);
                if (previous_signal == LM_BADSIG) {
                        error_condition = LM_TRUE;
                        lm_queue_message(SYS_ERROR_MSG, sig_failed, "SIGILL");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGILL");
                }
        }
#ifdef DEBUG
        else {
            if (lm_debug[6]) {
                DPRINTF(("lm_handle_signals(): NOT setting up handler for SIGILL()\n"));
            }
        }
#endif
#endif

#ifdef SIGTRAP
        if (lm_handle_SIGTRAP == LM_TRUE) {
#ifdef DEBUG
            if (lm_debug[6]) {
                DPRINTF(("lm_handle_signals(): setting up handler for SIGTRAP()\n"));
            }
#endif
                previous_signal = signal(SIGTRAP, lm_global_signal_handler);
                if (previous_signal == LM_BADSIG) {
                        error_condition = LM_TRUE;
                        lm_queue_message(SYS_ERROR_MSG, sig_failed, "SIGTRAP");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGTRAP");
                }
        }
#ifdef DEBUG
        else {
            if (lm_debug[6]) {
                DPRINTF(("lm_handle_signals(): NOT setting up handler for SIGTRAP()\n"));
            }
        }
#endif
#endif

#ifdef SIGIOT
        if (lm_handle_SIGIOT == LM_TRUE) {
#ifdef DEBUG
            if (lm_debug[6]) {
                DPRINTF(("lm_handle_signals(): setting up handler for SIGIOT()\n"));
            }
#endif
                previous_signal = signal(SIGIOT, lm_global_signal_handler);
                if (previous_signal == LM_BADSIG) {
                        error_condition = LM_TRUE;
                        lm_queue_message(SYS_ERROR_MSG, sig_failed, "SIGIOT");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGIOT");
                }
        }
#ifdef DEBUG
        else {
            if (lm_debug[6]) {
                DPRINTF(("lm_handle_signals(): NOT setting up handler for SIGIOT()\n"));
            }
        }
#endif
#endif

#ifdef SIGEMT
        if (lm_handle_SIGEMT == LM_TRUE) {
#ifdef DEBUG
            if (lm_debug[6]) {
                DPRINTF(("lm_handle_signals(): setting up handler for SIGEMT()\n"));
            }
#endif
                previous_signal = signal(SIGEMT, lm_global_signal_handler);
                if (previous_signal == LM_BADSIG) {
                        error_condition = LM_TRUE;
                        lm_queue_message(SYS_ERROR_MSG, sig_failed, "SIGEMT");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGEMT");
                }
        }
#ifdef DEBUG
        else {
            if (lm_debug[6]) {
                DPRINTF(("lm_handle_signals(): NOT setting up handler for SIGEMT()\n"));
            }
        }
#endif
#endif

#ifdef SIGFPE
        if (lm_handle_SIGFPE == LM_TRUE) {
#ifdef DEBUG
            if (lm_debug[6]) {
                DPRINTF(("lm_handle_signals(): setting up handler for SIGFPE()\n"));
            }
#endif
                previous_signal = signal(SIGFPE, lm_global_signal_handler);
                if (previous_signal == LM_BADSIG) {
                        error_condition = LM_TRUE;
                        lm_queue_message(SYS_ERROR_MSG, sig_failed, "SIGFPE");
                }
```

Copyright 1989 Logic Modeling Systems

| SOURCE PROGRAM | DATE | 5/23/89 | PAGE # |
|---|---|---|---|
| sfi/signal.c | TIME | 1:20:58 pm | 4/69 |

LINE # SOURCE TEXT

```
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGFPE");
                }
        }
#ifdef DEBUG
        else {
            if (lm_debug[6]) {
                DPRINTF(("lm_handle_signals(): NOT setting up handler for SIGFPE()\n"));
            }
        }
#endif
#endif

#ifdef SIGBUS
        if (lm_handle_SIGBUS == LM_TRUE) {
#ifdef DEBUG
            if (lm_debug[6]) {
                DPRINTF(("lm_handle_signals(): setting up handler for SIGBUS()\n"));
            }
#endif
                previous_signal = signal(SIGBUS, lm_global_signal_handler);
                if (previous_signal == LM_BADSIG) {
                        error_condition = LM_TRUE;
                        lm_queue_message(SYS_ERROR_MSG, sig_failed, "SIGBUS");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGBUS");
                }
        }
#ifdef DEBUG
        else {
            if (lm_debug[6]) {
                DPRINTF(("lm_handle_signals(): NOT setting up handler for SIGBUS()\n"));
            }
        }
#endif
#endif

#ifdef SIGSEGV
        if (lm_handle_SIGSEGV == LM_TRUE) {
#ifdef DEBUG
            if (lm_debug[6]) {
                DPRINTF(("lm_handle_signals(): setting up handler for SIGSEGV()\n"));
            }
#endif
                previous_signal = signal(SIGSEGV, lm_global_signal_handler);
                if (previous_signal == LM_BADSIG) {
                        error_condition = LM_TRUE;
                        lm_queue_message(SYS_ERROR_MSG, sig_failed, "SIGSEGV");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGSEGV");
                }
        }
#ifdef DEBUG
        else {
            if (lm_debug[6]) {
                DPRINTF(("lm_handle_signals(): NOT setting up handler for SIGSEGV()\n"));
            }
        }
#endif
#endif

#ifdef SIGSYS
        if (lm_handle_SIGSYS == LM_TRUE) {
#ifdef DEBUG
            if (lm_debug[6]) {
                DPRINTF(("lm_handle_signals(): setting up handler for SIGSYS()\n"));
            }
#endif
                previous_signal = signal(SIGSYS, lm_global_signal_handler);
                if (previous_signal == LM_BADSIG) {
                        error_condition = LM_TRUE;
                        lm_queue_message(SYS_ERROR_MSG, sig_failed, "SIGSYS");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGSYS");
                }
        }
#ifdef DEBUG
        else {
            if (lm_debug[6]) {
                DPRINTF(("lm_handle_signals(): NOT setting up handler for SIGSYS()\n"));
            }
        }
#endif
#endif

#ifdef SIGPIPE
        if (lm_handle_SIGPIPE == LM_TRUE) {
#ifdef DEBUG
            if (lm_debug[6]) {
                DPRINTF(("lm_handle_signals(): setting up handler for SIGPIPE()\n"));
            }
#endif
                previous_signal = signal(SIGPIPE, lm_global_signal_handler);
                if (previous_signal == LM_BADSIG) {
                        error_condition = LM_TRUE;
                        lm_queue_message(SYS_ERROR_MSG, sig_failed, "SIGPIPE");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGPIPE");
                }
        }
#ifdef DEBUG
```

Copyright 1989 Logic Modeling Systems

LINE # SOURCE TEXT

```
        else {
            if (lm_debug[6]) {
                DPRINTF(("lm_handle_signals(): NOT setting up handler for SIGPIPE()\n"));
            }
        }
#endif
#endif

#ifdef SIGTERM
        if (lm_handle_SIGTERM == LM_TRUE) {
#ifdef DEBUG
            if (lm_debug[6]) {
                DPRINTF(("lm_handle_signals(): setting up handler for SIGTERM()\n"));
            }
#endif
                previous_signal = signal(SIGTERM, lm_global_signal_handler);
                if (previous_signal == LM_BADSIG) {
                        error_condition = LM_TRUE;
                        lm_queue_message(SYS_ERROR_MSG, sig_failed, "SIGTERM");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGTERM");
                }
        }
#ifdef DEBUG
        else {
            if (lm_debug[6]) {
                DPRINTF(("lm_handle_signals(): NOT setting up handler for SIGTERM()\n"));
            }
        }
#endif
#endif

#ifdef SIGXCPU
        if (lm_handle_SIGXCPU == LM_TRUE) {
#ifdef DEBUG
            if (lm_debug[6]) {
                DPRINTF(("lm_handle_signals(): setting up handler for SIGXCPU()\n"));
            }
#endif
                previous_signal = signal(SIGXCPU, lm_global_signal_handler);
                if (previous_signal == LM_BADSIG) {
                        error_condition = LM_TRUE;
                        lm_queue_message(SYS_ERROR_MSG, sig_failed, "SIGXCPU");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGXCPU");
                }
        }
#ifdef DEBUG
        else {
            if (lm_debug[6]) {
                DPRINTF(("lm_handle_signals(): NOT setting up handler for SIGXCPU()\n"));
            }
        }
#endif
#endif

#ifdef SIGXFSZ
        if (lm_handle_SIGXFSZ == LM_TRUE) {
#ifdef DEBUG
            if (lm_debug[6]) {
                DPRINTF(("lm_handle_signals(): setting up handler for SIGXFSZ()\n"));
            }
#endif
                previous_signal = signal(SIGXFSZ, lm_global_signal_handler);
                if (previous_signal == LM_BADSIG) {
                        error_condition = LM_TRUE;
                        lm_queue_message(SYS_ERROR_MSG, sig_failed, "SIGXFSZ");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGXFSZ");
                }
        }
#ifdef DEBUG
        else {
            if (lm_debug[6]) {
                DPRINTF(("lm_handle_signals(): NOT setting up handler for SIGXFSZ()\n"));
            }
        }
#endif
#endif

#ifdef SIGLOST
        if (lm_handle_SIGLOST == LM_TRUE) {
#ifdef DEBUG
            if (lm_debug[6]) {
                DPRINTF(("lm_handle_signals(): setting up handler for SIGLOST()\n"));
            }
#endif
                previous_signal = signal(SIGLOST, lm_global_signal_handler);
                if (previous_signal == LM_BADSIG) {
                        error_condition = LM_TRUE;
                        lm_queue_message(SYS_ERROR_MSG, sig_failed, "SIGLOST");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGLOST");
                }
        }
#ifdef DEBUG
        else {
            if (lm_debug[6]) {
                DPRINTF(("lm_handle_signals(): NOT setting up handler for SIGLOST()\n"));
            }
        }
#endif
#endif
```

Copyright 1989
Logic Modeling Systems

SOURCE PROGRAM sfi/signal.c | DATE 5/23/89 | TIME 1:20:58 pm | PAGE # 6/71

LINE # SOURCE TEXT

```
#ifdef SIGUSR1
        if (lm_handle_SIGUSR1 == LM_TRUE) {
#ifdef DEBUG
            if (lm_debug[6]) {
                DPRINTF(("lm_handle_signals(): setting up handler for SIGUSR1()\n"));
            }
#endif
                previous_signal = signal(SIGUSR1, lm_global_signal_handler);
                if (previous_signal == LM_BADSIG) {
                        error_condition = LM_TRUE;
                        lm_queue_message(SYS_ERROR_MSG, sig_failed, "SIGUSR1");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGUSR1");
                }
        }
#ifdef DEBUG
        else {
            if (lm_debug[6]) {
                DPRINTF(("lm_handle_signals(): NOT setting up handler for SIGUSR1()\n"));
            }
        }
#endif
#endif

#ifdef SIGUSR2
        if (lm_handle_SIGUSR2 == LM_TRUE) {
#ifdef DEBUG
            if (lm_debug[6]) {
                DPRINTF(("lm_handle_signals(): setting up handler for SIGUSR2()\n"));
            }
#endif
                previous_signal = signal(SIGUSR2, lm_global_signal_handler);
                if (previous_signal == LM_BADSIG) {
                        error_condition = LM_TRUE;
                        lm_queue_message(SYS_ERROR_MSG, sig_failed, "SIGUSR2");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGUSR2");
                }
        }
#ifdef DEBUG
        else {
            if (lm_debug[6]) {
                DPRINTF(("lm_handle_signals(): NOT setting up handler for SIGUSR2()\n"));
            }
        }
#endif
#endif

#ifdef SIGABRT
        if (lm_handle_SIGABRT == LM_TRUE) {
#ifdef DEBUG
            if (lm_debug[6]) {
                DPRINTF(("lm_handle_signals(): setting up handler for SIGABRT()\n"));
            }
#endif
                previous_signal = signal(SIGABRT, lm_global_signal_handler);
                if (previous_signal == LM_BADSIG) {
                        error_condition = LM_TRUE;
                        lm_queue_message(SYS_ERROR_MSG, sig_failed, "SIGABRT");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGABRT");
                }
        }
#ifdef DEBUG
        else {
            if (lm_debug[6]) {
                DPRINTF(("lm_handle_signals(): NOT setting up handler for SIGABRT()\n"));
            }
        }
#endif
#endif

#ifdef SIGAPOLLO
        if (lm_handle_SIGAPOLLO == LM_TRUE) {
#ifdef DEBUG
            if (lm_debug[6]) {
                DPRINTF(("lm_handle_signals(): setting up handler for SIGAPOLLO()\n"));
            }
#endif
                previous_signal = signal(SIGAPOLLO, lm_global_signal_handler);
                if (previous_signal == LM_BADSIG) {
                        error_condition = LM_TRUE;
                        lm_queue_message(SYS_ERROR_MSG, sig_failed, "SIGAPOLLO");
                }
                else if ( (previous_signal != SIG_DFL) &&
                          (previous_signal != SIG_IGN) &&
                          (previous_signal != lm_global_signal_handler) )
                {
                        lm_queue_message(WARNING_MSG, sig_previous, "SIGAPOLLO");
                }
        }
#ifdef DEBUG
        else {
            if (lm_debug[6]) {
                DPRINTF(("lm_handle_signals(): NOT setting up handler for SIGAPOLLO()\n"));
            }
        }
#endif
#endif

        if (error_condition == LM_TRUE)
                return(FAILURE);
        else return(SUCCESS);
}

#ifdef  SUNOS3_5
int
```

Copyright 1989 Logic Modeling Systems

SOURCE PROGRAM sfi/signal.c | DATE 5/23/89 | TIME 1:20:58 pm | PAGE # 7/72

LINE # SOURCE TEXT

```
#else
void
#endif
lm_global_signal_handler(sig)
int     sig;
{
#ifdef DEBUG
    if (lm_debug[6]) {
        DPRINTF(("lm_global_signal_handler(): called for signal '%d'\n", sig));
    }
#endif
        (void) lm_end_modeling_session();
        (void) signal(sig, SIG_DFL);
        (void) kill(getpid(), sig);
}
```

Copyright 1989 Logic Modeling Systems

| SOURCE PROGRAM | DATE | PAGE # |
|---|---|---|
| sfi/util1.c | 5/23/89 | 1/73 |
| | TIME 1:20:59 pm | |

LINE # SOURCE TEXT

```
/* SCCS_ID: util1.c rev 3.4, 5/9/89 at 16:26:37 */

#include <stdio.h>
#include <ctype.h>
#include "common.h"
#include "message.h"
#include "network.h"
#include "lm_sfi.h"
#include "lsfi.h"
#include "protans.h"
#include "protcmd.h"
#include "conv.h"

extern char         *calloc();
extern char         *lm_calloc();
extern char         *lm_malloc();
extern char         *lm_realloc();

#define MAX_INST_ID_TABLE_SIZE  128
#define MAX_INST_ID_TABLE_INCR  64

#define MAX_DEF_ID_TABLE_SIZE  128
#define MAX_DEF_ID_TABLE_INCR  64

#define MAX_DAB_PIN_ID_TABLE_SIZE  80
#define MAX_DAB_PIN_ID_TABLE_INCR  80

#define MAX_USER_PIN_ID_TABLE_SIZE  80
#define MAX_USER_PIN_ID_TABLE_INCR  40

#define PTR_SIZE  4

lm_init()
{
   INSTANCE_INFO      **temp_ptr;
   u_short              i;
   extern char         *getenv();

#ifdef DEBUG
   char                *temp;
   long                 number;

   /* Initialize lm_debug flag */
   for (i = 0; i < MAX_DEBUG; ++i)
      lm_debug[i] = 0;

   temp = (char *) getenv("HOSTDEBUG");
   if (temp != NULL) {
      i = 0;

      /* skip leading blank */
      while (temp[i] == ' ')
         i++;

      while (temp[i]) {
         if (sscanf(&temp[i], "%d", &number)) {
            if ((number < 0) || (number > MAX_DEBUG)) {
               (void) printf("Illegal lm_debug number: %d\n", number);
               exit(1);
            }
            (void) printf("Setting lm_debug number: %d\n", number);
            lm_debug[number] = 1;
         } else {
            (void) printf("Invalid decimal number in : %s\n", &temp[i]);
            exit(1);
         }
         while ((temp[i] != ' ') && (temp[i] != '\0'))
            i++;
         while ((temp[i] == ' ') && (temp[i] != '\0'))
            i++;
      }
   }
#endif

#ifdef DEBUG
   temp = (char *) getenv("NETWORK_TIMEOUT");
   if (temp != NULL) {
      if (sscanf(temp, "%d", &number)) {
         DPRINTF(("set network timeout to: %d\n", number));
         lm_network_timeout = number;
      }
   }
#endif

   /* Create the SYSTEM table */
   lm_system_table = (SYSTEM_INFO **)
     DMALLOC((unsigned) (MAX_SYSTEM_TABLE_SIZE * sizeof(SYSTEM_INFO *)));

   if (lm_system_table == NULL) {
      lm_queue_message(ERROR_MSG, "out of memory on host for system table");
      return (FAILURE);
   }
   for (i = 0; i < MAX_SYSTEM_TABLE_SIZE; ++i)
      lm_system_table[i] = NULL;

   /* Create the DEFINITION table */
   lm_def_id_table = (DEFINITION_INFO **)
     DMALLOC((unsigned) (MAX_DEF_ID_TABLE_SIZE * PTR_SIZE));
   if (lm_def_id_table == NULL) {
      lm_queue_message(ERROR_MSG, "out of memory on host for definition table");
      return (FAILURE);
   }
   for (i = 0; i < MAX_DEF_ID_TABLE_SIZE; ++i)
      lm_def_id_table[i] = NULL;
   lm_def_id_table_size = MAX_DEF_ID_TABLE_SIZE;
   lm_def_id_avail = 0;

   /* Create the INSTANCE table */
   lm_inst_id_table = (INSTANCE_INFO **)
     DMALLOC((unsigned) (MAX_INST_ID_TABLE_SIZE * PTR_SIZE));

   if (lm_inst_id_table == NULL) {
      lm_queue_message(ERROR_MSG, "out of memory on host for instance table");
      return (FAILURE);
   }
   lm_free_instance_id = lm_inst_id_table;
   temp_ptr = (INSTANCE_INFO **) & lm_inst_id_table[1];

   for (i = 0; i < (MAX_INST_ID_TABLE_SIZE - 1); ++i) {
      lm_inst_id_table[i] = (INSTANCE_INFO *) temp_ptr;
```

Copyright 1989 Logic Modeling Systems

| SOURCE PROGRAM | DATE | PAGE # |
|---|---|---|
| sfi/util1.c | 5/23/89 | 2/74 |
| | TIME 1:20:59 pm | |

SOURCE TEXT

```
         ++temp_ptr;
      }

      lm_inst_id_table[i] = NULL;
      lm_inst_id_table_size = MAX_INST_ID_TABLE_SIZE;

      /* Create the TEMPORARY Buffer for DAB Def storage */
      lm_temp_buffer = (char *) DMALLOC((unsigned) (MAX_COMM_BUFFER_SIZE));
      if (lm_temp_buffer == NULL) {
         lm_queue_message(ERROR_MSG, "out of memory on host for temp buffer");
         return (FAILURE);
      }
      lm_tbuf_ptr = lm_temp_buffer + 4;    /* the first int location is for the
                                            * length */
      lm_max_tbuf_addr = lm_temp_buffer + MAX_COMM_BUFFER_SIZE;

      /* initialize logic map */
      for (i = 0; i < MAX_LOGIC_STATE; ++i)
         lm_user_to_lm_logic_level_map[i].set = 0;

      if (lm_open_modelers_list_file() == FAILURE)
         return (FAILURE);

      return (SUCCESS);
   }

   lm_uninit()
   {
      register int          i, fd;
      register SYSTEM_INFO *system;

      (void) release_all_instances();
      DFREE((char *) lm_inst_id_table);

      for (i = 0; i < MAX_DEF_ID_TABLE_SIZE; ++i) {
         if (lm_def_id_table[i] != NULL) {
            rls_definition_info((u_short) i);
         }
      }
      lm_last_definition_id_specified = -1;
      lm_definition_selected = NULL;
      DFREE((char *) lm_def_id_table);

      for (i = 0; i < MAX_SYSTEM_TABLE_SIZE; ++i) {
         if ((system = lm_system_table[i]) != NULL) {
            if (system->name != NULL) {
               DFREE(system->name);
            }
            switch (system->state) {
               case USED:
               case USED_FOR_RD_WR:
                  if ((fd = system->fd) != -1) {
                     lm_close_modeler(fd);
                  }
            }
            DFREE((char *) system);
         }
      }
      DFREE((char *) lm_system_table);

      if (lm_temp_buffer != NULL)
         DFREE((char *) lm_temp_buffer);
   }

   static
   release_all_instances()
   {
      INSTANCE_INFO         *instance;
      FILE_INFO             *file_ptr;
      u_short                instance_id;

      clear_errors();

      lm_last_instance_id_specified = -1;
      lm_instance_selected = NULL;

      for (instance_id = 0; instance_id < lm_inst_id_table_size; ++instance_id) {
         instance = lm_inst_id_table[instance_id];

         if (BOGUS_INSTANCE(instance))
            continue;

         if (lm_search_key_id(lm_timing_file_ptr,
                              (u_short) instance->inst_id, &file_ptr) == SUCCESS) {
            lm_close_and_delete_file_key_id(&lm_timing_file_ptr,
                                            (u_short) instance->inst_id);
            instance->tm_file = NULL;
         }
         if (lm_search_key_id(lm_vector_file_ptr,
                              (u_short) instance->inst_id, &file_ptr) == SUCCESS) {
            lm_close_and_delete_file_key_id(&lm_vector_file_ptr,
                                            (u_short) instance->inst_id);
            instance->vector_file = NULL;
         }
         l⌐ rls_instance_info(lm_def_id_table[instance->def_id], instance);
      }

      return (LM_SUCCESS);
   }

   static
   extend_def_id_table()
   {
      char                   *ptr;
      u_short                i;
      u_short                 new_table_size;

   #ifdef DEBUG
      if (lm_debug[1]) {
         DPRINTF(("inside extend_def_id_table()\n"));
      }
   #endif

      new_table_size = lm_def_id_table_size + MAX_DEF_ID_TABLE_INCR;
      ptr = (char *) DREALLOC((char *) lm_def_id_table,
                              (unsigned) (new_table_size * PTR_SIZE));
      if (ptr == NULL) {
         lm_queue_message(ERROR_MSG, "out of memory on host for definition table");
         return (FAILURE);
      }
```

Copyright 1989 Logic Modeling Systems

| SOURCE PROGRAM | DATE | 5/23/89 | PAGE # |
|---|---|---|---|
| sfi/util1.c | TIME | 1:20:59 pm | 3/75 |

LINE # SOURCE TEXT

```
   lm_def_id_table = (DEFINITION_INFO **) ptr;

   for (i = lm_def_id_table_size; i < new_table_size; ++i)
      lm_def_id_table[i] = NULL;

   lm_def_id_table_size = new_table_size;
   return (SUCCESS);
}

lm_extend_inst_id_table()
{
   INSTANCE_INFO      **temp_ptr;
   char                *ptr;
   u_short              i;
   u_short              new_table_size;


#ifdef DEBUG
   if (lm_debug[1]) {
      DPRINTF(("inside lm_extend_inst_id_table\n"));
   }
#endif

   new_table_size = lm_inst_id_table_size + MAX_INST_ID_TABLE_INCR;
   ptr = (char *) DREALLOC((char *) lm_inst_id_table,
                           (unsigned) (new_table_size * PTR_SIZE));
   if (ptr == NULL) {
      lm_queue_message(ERROR_MSG, "out of memory on host for instance table");
      return (FAILURE);
   }
   lm_inst_id_table = (INSTANCE_INFO **) ptr;

   lm_free_instance_id = (INSTANCE_INFO **)
     & lm_inst_id_table[lm_inst_id_table_size];

   temp_ptr = lm_free_instance_id + 1;
   for (i = lm_inst_id_table_size; i < (new_table_size - 1); ++i) {
      lm_inst_id_table[i] = (INSTANCE_INFO *) temp_ptr;
      temp_ptr++;
   }
   lm_inst_id_table[i] = NULL;

   lm_inst_id_table_size = new_table_size;
   return (SUCCESS);
}

lm_extend_dab_pid_table(definition, pin_number)
DEFINITION_INFO      *definition;
u_long                pin_number;
{
   DAB_PID              *temp_ptr;
   char                 *ptr;
   u_long                new_size;
   u_short               i;


#ifdef DEBUG
   if (lm_debug[1]) {
      DPRINTF(("inside lm_extend_dab_pid_table\n"));
   }
#endif

   new_size = definition->dab_pid_table_size + MAX_DAB_PIN_ID_TABLE_INCR;
   while (pin_number >= new_size) {
      new_size += MAX_DAB_PIN_ID_TABLE_INCR;
   }

   ptr = (char *) DREALLOC((char *) definition->dab_pid_table,
                           (unsigned) (new_size * sizeof(DAB_PID)));
   if (ptr == NULL) {
      lm_queue_message(ERROR_MSG, "out of memory on host for Device Adapter pin_id table");
      return (FAILURE);
   }
   definition->dab_pid_table = (DAB_PID *) ptr;

   temp_ptr = &definition->dab_pid_table[definition->dab_pid_table_size];
   for (i = definition->dab_pid_table_size; i < new_size; ++i) {
      temp_ptr->name = NULL;
      temp_ptr->key = (INVALID_KEY - LM_INPUT) << PIN_TYPE_BIT_OFFSET;
      temp_ptr->pin_type = NONE;
      temp_ptr->pin_number = INVALID_PIN_NUMBER;
      temp_ptr++;
   }
   definition->dab_pid_table_size = new_size;
   return (SUCCESS);
}

lm_extend_tbuf()
{
   char                 *ptr;
   u_short               temp;
   u_short               new_size;

#ifdef DEBUG
   if (lm_debug[1]) {
      DPRINTF(("inside lm_extend_tbuf\n"));
   }
#endif

   temp = (u_short) (lm_tbuf_ptr - lm_temp_buffer);
   new_size = lm_max_tbuf_addr - lm_temp_buffer + MAX_COMM_BUFFER_INCR;
   ptr = (char *) DREALLOC((char *) lm_temp_buffer, (unsigned) new_size);
   if (ptr == NULL) {
      lm_queue_message(ERROR_MSG, "out of memory on host for temp buffer");
      return (FAILURE);
   }
   lm_temp_buffer = ptr;
   lm_tbuf_ptr = lm_temp_buffer + temp;
   lm_max_tbuf_addr = lm_temp_buffer + new_size;
   return (SUCCESS);
}

static
new_system_info(sys_ptr)
SYSTEM_INFO          **sys_ptr;
{
   SYSTEM_INFO          *temp;

   temp = (SYSTEM_INFO *) DCALLOC((unsigned) 1,
                                  (unsigned) (sizeof(SYSTEM_INFO)));
```

Copyright 1989 Logic Modeling Systems

| SOURCE PROGRAM | DATE | PAGE # |
|---|---|---|
| sfi/util1.c | 5/23/89<br>TIME 1:20:59 pm | 4/76 |

LINE # SOURCE TEXT

```
    if (temp == NULL) {
        lm_queue_message(ERROR_MSG, "out of memory on host for system_info");
        return (FAILURE);
    }
    temp->name = NULL;
    temp->fd = -1;
    temp->state = NOT_OPENED;

    *sys_ptr = temp;
    return (SUCCESS);
}

/*****************************************************************************
 *
 * NAME:
 *      free_unspeced_delay_list -- Free unspecified delay list memory.
 *
 * PURPOSE:
 *      "free_unspeced_delay_list" is called to dispose of the unspecified
 *      delay list created by "free_unspeced_delay_list".
 *
 * INTERFACE:
 *
 *      free_unspeced_delay_list(hash_table_ptr);
 *
 *      PARAMETER       TYPE                    DESCRIPTION
 *      ______________________________________________________________
 *      hash_table_ptr  ***unspeced_delay_list_element
 *                                              Address of pointer to list (a hash table).
 *
 * CALLS:
 *      DFREE();
 *
 * EXTERNAL REFERENCES:
 *      None.
 *
 * RESTRICTIONS:
 *      All memory should have been allocated by "insert_unspeced_delay".
 *
 * DESIGNER:
 *      Steve Parks
 *
 *****************************************************************************/

static void
free_unspeced_delay_list(hash_table_ptr)
unspeced_delay_list_element ***hash_table_ptr;
{
    register int            i;
    register unspeced_delay_list_element *elem_ptr;
    register unspeced_delay_list_element *save_ptr;

    /* If list exists ... */
    if (*hash_table_ptr != (unspeced_delay_list_element **) NULL) {
        /* walk through the entire hash table ... */
        for (i = 0; i < MAX_UNSPECED_DELAY_TABLE_SIZE; i++) {
            elem_ptr = **hash_table_ptr;
            /* and free up all elements for each hash table entry. */
            while (elem_ptr != (unspeced_delay_list_element *) NULL) {
                save_ptr = elem_ptr;
                elem_ptr = (elem_ptr)->next;
                DFREE((char *) save_ptr);
            }
            (*hash_table_ptr)++;
        }
        /* Free the table itself. */
        DFREE((char *) **hash_table_ptr);
        /* Reset the list pointer. */
        *hash_table_ptr = (unspeced_delay_list_element **) NULL;
    }
}

static
rls_definition_info(definition_id)
u_short                 definition_id;
{
    DEFINITION_INFO     *def_ptr;
    register USER_PID   *hash, *next;
    u_short             i;

    def_ptr = lm_def_id_table[definition_id];

    for (i = 0; i < def_ptr->dab_pid_table_size; ++i) {
        if (def_ptr->dab_pid_table[i].name != NULL)
            free((char *) def_ptr->dab_pid_table[i].name);
    }

    for (i = 0; i < MAX_USER_PID_HASH_TABLE_SIZE; ++i) {
        hash = def_ptr->user_pid_hash_table[i];
        while (hash != NULL) {
            next = hash->next_in_bucket;
            DFREE((char *) hash);
            hash = next;
        }
    }

    free((char *) def_ptr->device_name);
    free((char *) def_ptr->dab_pid_table);
    free((char *) &def_ptr->delay_table[-1]);
    free_unspeced_delay_list(&def_ptr->unspecified_delay_list);
    free((char *) def_ptr);

    lm_def_id_table[definition_id] = NULL;
}

lm_new_definition_info(def_ptr)
DEFINITION_INFO     **def_ptr;
{
    DEFINITION_INFO     *temp;
    DAB_PID             *temp_ptr;
    u_short             i;
    u_char              alloc_error = FALSE;

    *def_ptr = NULL;

    if (lm_def_id_avail == lm_def_id_table_size)
        if (extend_def_id_table() == FAILURE)
            return (FAILURE);

    temp = (DEFINITION_INFO *)
```

Copyright 1989 Logic Modeling Systems

| SOURCE PROGRAM | DATE | PAGE # |
|---|---|---|
| networkh/net_boot.c | 5/23/89 | 1/1 |
| | TIME 1:20:46 pm | |

LINE # SOURCE TEXT

```c
/* SCCS_ID: net_boot.c rev 3.1, 4/24/89 at 08:02:21 */

#include <stdio.h>
#include "common.h"
#include "message.h"
#include "network.h"
#include "lm_rd_wr.h"
#include "lm_afi.h"

u_short process_file( );
void ascii_to_hex_string();
u_short s_rec_rcvd();

#define MAX_SREC_SIZE   35
#define SREC_BUFSIZE    255

static char start_of_file;
static char srec_data[ SREC_BUFSIZE ];
static char buffer[ MAX_RD_WR_BUFFER_SIZE ];

static u_long count;
static u_long address;
static u_long start_execution;


lm_boot( modeler, number_of_files, file_list, jump, jump_address )
        char    *modeler;
        u_short number_of_files;
        char    *file_list[];
        u_short jump;
        u_long  jump_address;
{
        u_long i, status;

        /* initialize globals to allow multiple boots per session */
        count = 0;
        address = 0;
        start_execution = 0;

        /* set up data structures for lm_mwrite */
        if (lm_mopen(modeler) == LM_ERROR) return LM_ERROR;

        /*
        ** for each file process it
        */
        for( i = 0; i != number_of_files; i++)
        {
                start_of_file = TRUE;
                (void) printf("Transferring %s\n", file_list[ i ]);
                if( process_file(modeler, file_list[ i ]) == FAILURE)
                {
                        lm_close_connection_after_boot(modeler);
                        return( LM_ERROR );
                }
        }
        if( jump != FALSE )
                start_execution = jump_address;
        if(lm_mwrite(LM_CPUREG_MEMORY, (u_long)0, start_execution, (u_long)0, (char *)0, &status) == FAILURE)
        {
                lm_queue_message(ERROR_MSG,"Unable to set Program Counter on modeler.");
                lm_close_connection_after_boot(modeler);
                return( LM_ERROR );
        }

        lm_close_connection_after_boot(modeler);
        return( LM_SUCCESS );
}

static u_short process_file(modeler, file_name )
        char    *modeler;
        char    *file_name;
{
        u_long status;

        int ch;
        char *ptr_srec = srec_data;
        FILE *fp, *fopen();

        if(( fp = fopen( file_name, "r" )) == NULL)
        {
                lm_queue_message(SYS_ERROR_MSG, file_name);
                return(FAILURE);
        }
        /*
        ** read the file, and process data
        */
        if (process_lmbinary(modeler, fp) == LM_SUCCESS) {
                (void) fclose(fp);
                return LM_SUCCESS;
        }

        while ((ch=getc( fp )) != EOF) {
                if( (char)ch == 'S' )
                {
                        if( ptr_srec != srec_data )
                        {
                                if(s_rec_rcvd() == FAILURE )
                                {
                                        (void) fclose( fp );
                                        return( FAILURE );
                                }
                                ptr_srec = srec_data;.
                        }
                        /*
                        ** we better xfer what we have collected
                        */
                        if(( MAX_RD_WR_BUFFER_SIZE - count ) < MAX_SREC_SIZE)
                        {
                                if(lm_mwrite(LM_CPURAM_MEMORY,(u_long) 0,(u_long) address,(u_long) count, buffer, &status) != LM_SUCCESS )
                                {
                                        (void) fclose( fp );
                                        return( FAILURE );
                                }
                                count = 0;
                        }
                }
                *ptr_srec++ = (char)ch;
                if( ptr_srec > (srec_data+SREC_BUFSIZE))
                {
                        return( FAILURE );
```

| Copyright 1989 Logic Modeling Systems | SOURCE PROGRAM networkh/net_boot.c | DATE 5/23/89 TIME 1:20:46 pm | PAGE # 2/2 |
|---|---|---|---|

LINE # SOURCE TEXT

```
				}
		}
		if( ptr_srec != srec_data )
		{
			if(s_rec_rcvd() == FAILURE )
			{
				(void) fclose( fp );
				return( FAILURE );
			}
			if( count )
			{
				if(lm_mwrite(LM_CPURAM_MEMORY,(u_long) 0, (u_long)address, (u_long)count, buffer, &status) != LM_SUCCESS )
				{
					(void) fclose( fp );
					return( FAILURE );
				}
				count = 0;
			}
		}
		(void) fclose( fp );
		return ( SUCCESS );
}.

/*
** we have a complete S record
** place it in memory.
*/
static u_short
s_rec_rcvd()
{
		register unsigned char checksum;
		register u_short i;
		register u_long addr;
		/*
		** not interested in the record
		*/
		if( srec_data[ 1 ] > '3' || srec_data[ 1 ] < '1') return( SUCCESS );
		/*
		** get it from ascii to hex
		** note: 'SX' stays ascii, where X = 1, 2, or 3.
		*/
		ascii_to_hex_string( srec_data );
		/*
		** place in memory, do a sanity check
		*/
		checksum = 0;
		for(i =0, i <= srec_data[ 2 ] ; i++)
			checksum += srec_data[ i + 2 ];
		if( checksum != 0xff )
		{
				lm_queue_message(ERROR_MSC, "Bad Checksum for S record");
				return( FAILURE );
		}
		/*
		** set up address pointer
		*/
		i = 2;
		if( srec_data[ 1 ] == '1' )
		{
			/*addr = (u_long) *(unsigned short *) (srec_data + 3);*/
			addr = (u_long) (((u_short) ((u_char)srec_data[ 3 ])) << 8) | ((unsigned short) ((u_char)srec_data[ 4 ]));
		}
		else
		{
			/*addr = (u_long) *(unsigned long *) (srec_data + 3);*/
			addr = (u_long) (((u_long) ((u_char)srec_data[3])) << 24) |
					(((u_long) ((u_char)srec_data[4])) << 16) |
					(((u_long) ((u_char)srec_data[5])) << 8) |
					(((u_long) ((u_char)srec_data[6])));
			i = 4;
		}
		if( srec_data[ 1 ] == '2' )
		{
			addr = (addr  >> 8);
			/*
			addr = (u_long) (((u_long) (srec_data[3])) << 16) |
					(((u_long) (srec_data[4])) << 8) |
					(((u_long) (srec_data[5])));
			*/
			i = 3;
		}
		if( count == 0 )
			address = addr;
		/*
		** load the data
		*/
		--srec_data[ 2 ];
		if( start_of_file == TRUE)
		{
			if( start_execution < address)
				start_execution = address;
			start_of_file = FALSE;
		}
		/*
		** save the data past the LM header
		*/
		for( ; i < srec_data[ 2 ] ; i++)
			buffer[ count++ ] = srec_data[ 3 + i ];
		return ( SUCCESS );
}

/*
** Turn a S record ascii string to hex
*/

#define ascii_to_hex_byte(c) ((((c) >= '0') && ((c) <= '9'))? \
			(char)((c) - '0'): (char)((c) + 10 - 'A'))

static  void
ascii_to_hex_string(srec_data)
register char *srec_data;
{
		register char byte_count, cnt;
		register char bh, bl;
		register char *from = (srec_data + 2);

		srec_data += 2;
		bh = *from++;
		bl = *from++;
		byte_count = (char)(ascii_to_hex_byte(bh) << 4) | (ascii_to_hex_byte(bl));
```

Copyright 1989
Logic Modeling Systems

SOURCE PROGRAM networkh/net_boot.c | DATE 5/23/89 | TIME 1:20:46 pm | PAGE # 3/3

LINE # SOURCE TEXT

```
		*srec_data++ = byte_count;
		for (cnt = 0; cnt < byte_count; ++cnt) {
			bh = *from++;
			bl = *from++;
			*srec_data++
				= (ascii_to_hex_byte(bh)<<4)|(ascii_to_hex_byte(bl));
		}
}

/*
** an lmbinary file is very similar to an a.out file on a sun. (In fact
** it is 100% compatable).
**
** This is the sun3 a.out header definition and useful macros...
*/

struct exec {

	unsigned short	a_machtype;
	unsigned short	a_magic;
	unsigned long	a_text;
	unsigned long	a_data;
	unsigned long	a_bss;
	unsigned long	a_syms;
	unsigned long	a_entry;
	unsigned long	a_trsize;
	unsigned long	a_drsize;
};

#define OMAGIC	0407		/* old impure format */
#define NMAGIC	0410		/* read-only text */
#define ZMAGIC	0413		/* demand load format */

#define N_BADMAG(x) \
	((x).a_magic!=OMAGIC && (x).a_magic!=NMAGIC && (x).a_magic!=ZMAGIC)

static
process_lmbinary(modeler, fp)
char *modeler;
FILE *fp;
{
	struct exec header;
	register u_long size, addr;
	char buffer[MAX_RD_WR_BUFFER_SIZE];
	u_long status;

	if (fread((char *)&header, 1, sizeof(header), fp) != sizeof(header)) {
		goto abort_binary;
	}
	if (N_BADMAG(header) != 0) {
		goto abort_binary;
	}

	addr = header.a_entry;
	size = header.a_text + header.a_data;
	if( start_execution < addr) start_execution = addr;

	while (size > 0) {
		count = (size < MAX_RD_WR_BUFFER_SIZE)?
			size: MAX_RD_WR_BUFFER_SIZE;

		if ((count = fread(buffer, 1, (int)count, fp)) <= 0) {
			lm_queue_message(ERROR_MSG, "Corrupted lmbinary file.");
			goto abort_binary;
		}
		if(lm_mwrite(LM_CPURAM_MEMORY,(u_long) 0,
			(u_long)addr, (u_long)count,
			buffer, &status) != LM_SUCCESS ) {
			lm_queue_message(ERROR_MSG, "Write to modeler failed.");
			goto abort_binary;
		}
		size -= count;
		addr+= count;
	}

	return LM_SUCCESS;

abort_binary:
	rewind(fp);
	return FAILURE;
}
```

Copyright 1989
Logic Modeling Systems

SOURCE PROGRAM: networkh/net_clnt.c

DATE: 5/23/89 | TIME: 1:20:47 pm | PAGE #: 1/4

LINE # SOURCE TEXT

```
/* SCCS_ID: net_clnt.c rev 3.3, 5/5/89 at 17:31:34 */

#include <stdio.h>
#include <errno.h>
#include <sys/types.h>
#include <sys/time.h>
#include <netinet/in.h>
#include <netdb.h>
#include "common.h"
#include "message.h"
#include "network.h"
#include "lm_sfi.h"
#include "mod_err.h"
#include "svaran.h"



/*
 * The following is a list of all the global variables that
 * exist in the client network code.  The higher level user
 * can feel free to change these as he sees fit, but beware
 * their usage is non-trivial.
 */

/*
 * These track the total number of message retries for the entire
 * life of this routine (in the calling process), the total number
 * of packets that have been sent, the total number of mismatched
 * packet sequence numbers, and the total number of timeouts.
 */
u_long  lm_total_number_of_msg_retries = 0;
u_long  lm_total_number_of_packets_sent = 0;
u_long  lm_total_number_of_mismatches = 0;
u_long  lm_total_number_of_timeouts = 0;

/*
 * The following three variables control the dropping, duplication,
 * and failure to resend packets on timeout.  Dropping and duplicating
 * packets is only used during testing.  No resend on timeout is used
 * *only* for very special communication during modeler booting.
 */
u_long  lm_drop_packet = FALSE;
u_long  lm_duplicate_packet = FALSE;
u_long  lm_resend_on_timeout = TRUE;

/*
 * The maximum number of attempts that will be made to send a request
 * to the modeler.  After a time limit has expired (defined below)
 * the host will resend the current request to the modeler if there
 * has been less than or equal to lm_max_timeout_retry_attempts to do so.
 */
u_long  lm_max_timeout_retry_attempts = 3;

/*
 * Issue a warning message at the following interval (frequency) when
 * there have been that many timeouts or mismatched packets.
 */
u_long  lm_network_warning_freq = 100;

/*
 * The lm_network_timeout time should be set to the maximum value that
 * we ever expect to take to evaluate a given device.  With 2M patterns
 * at a pattern clock of 150KHz that means 14.0 seconds.  There could be
 * a maximum of 4 users (one per lane) eating up that kind of memory;
 * therefore, the total, longest wait time is 55.9 seconds.  But wait,
 * the product evolution allows for 16M patterns per lane with associated
 * time of 447.4 seconds.  This is obviously too long to wait, so go
 * with a conservative 15 seconds along with the simple adaptive algorithm
 * explained below.
 *
 * (Note that it takes 170 days (2M@150KHz), and 30 years (16M@150KHz)
 *  to evolve to the indicated pattern depths with an infinitely fast simulator.
 *  Bottom line, I like 15 seconds.)
 *
 * The time between request retries increases as the number of attempts
 * to get a response from the modeler increases (up to lm_max_timeout_retry_attempts).
 * Such that the total time before giving up is:
 *
 *       summation from i equals 1 to lm_max_timeout_retry_attempts
 *                                                of (i * lm_network_timeout)
 *
 * 3 retries at 15 seconds per, yields a total of 90 seconds.
 * Which is more than enough for the current generation pattern memories with
 * the absurd situation described above, given that it is impossible to build
 * patterns to the required depths at the slower frequencies.
 *
 * 10/10/88 - Klein  -  Well, it turns out that everybody whines and complains
 *                      that they have to wait too long for a modeler to timeout.
 *                      So, we've decided to go with 10 seconds, for a total timeout
 *                      of 66 seconds.
 */
u_long  lm_network_timeout = 20000;     /* 20 seconds */

extern  u_short send_single_message_get_ack();
extern  u_short send_multiple_message_get_ack();
extern  u_short receive_multiple_message();
extern  u_short receive_packet_with_timeout();
extern  u_short receive_packet();
extern  u_short send_packet();
extern  u_short obtain_modelers_address();
extern  u_short process_timeout();
extern  u_short process_mismatch();


u_short
lm_send_request_get_reply(conn)
register        CONNECTION      *conn;
{
        register        u_short error_condition;


        /*
         * Set the total number of bytes in the outgoing message buffer.
         * It is absolutely critical that this be done here, before any
         * further buffer processing is done as the latter processing
         * changes the value of conn->outgoing_buffer_pointer.
         */
        BYTE_COUNT(conn->outgoing_buffer_base) = (u_long)conn->outgoing_buffer_pointer - (u_long)conn->outgoing_buffer_base;

        /*
```

Copyright 1989
Logic Modeling Systems

SOURCE PROGRAM
networkh/net_clnt.c

DATE 5/23/89
TIME 1:20:47 pm
PAGE # 2/5

LINE # SOURCE TEXT

```
	 * Initialize where send_(sm)*() places the acknowledge.
	 */
	conn->incoming_buffer_pointer = conn->incoming_buffer_base;

	/*
	 * Initialize where send_(sm)*() takes the request from.
	 */
	conn->outgoing_buffer_pointer = conn->outgoing_buffer_base;

	error_condition = FALSE;
	if (BYTE_COUNT(conn->outgoing_buffer_base) <= MAX_CLIENT_PACKET) {
		/* The request WILL fit into a single network packet.  Set the  */
		/* indication that this is the only packet for this request.    */
		conn->header.partial_packet_count = 0;

		/* Send the request in a message and wait for the acknowledge.  */
		/* This could be a full or partial reply.  It's checked below.  */
		if (send_single_message_get_ack(conn) != SUCCESS) {
			error_condition = TRUE;
		}
	}
	else {	/* The request will NOT fit into a single network packet. */
		/* Set the indication that this is a partial packet.         */
		conn->header.partial_packet_count = BYTE_COUNT(conn->outgoing_buffer_base);

		/* Send the request as a multi-message and wait for the acknowledge.  */
		/* This could be a full or partial reply.  It's checked below.        */
		if (send_multiple_message_get_ack(conn) != SUCCESS) {
			error_condition = TRUE;
		}
	}

	/*
	 * Overlay a packet header struct on the reply to check for a partial reply.
	 */
	if (error_condition == FALSE) {
		if (PARTIAL_PACKET_COUNT(conn->incoming_buffer_base) != 0) {
			/* Received only a partial reply. */
			if (receive_multiple_message(conn) != SUCCESS) {
				error_condition = TRUE;
			}
		}
		/*
		 * Else, we have received the whole reply and no further
		 * processing need be done.
		 */
	}

	/*
	 * Properly set up the incoming and outgoing buffers
	 * for the upper software layers.
	 */
	LM_RESET_INCOMING(conn);
	LM_RESET_OUTGOING(conn);
	LM_SET_END_INCOMING(conn);

	if (error_condition == FALSE)
		return(SUCCESS);
	else return(FAILURE);
}


static	u_short
send_single_message_get_ack(conn)
register		CONNECTION	*conn;
{
register		u_short	rtn;
			char	state;
			u_long	network_timeout;		/* can't be made storage class register */
			u_short	number_of_message_attempts;	/* can't be made storage class register */
static			long	am_sending_packet  = -1;

	if (am_sending_packet != -1) {
		reset_network_connection (conn);

		PROCESS_ID(conn->outgoing_buffer_pointer) = conn->header.process_id;
		SEQUENCE_NUMBER(conn->outgoing_buffer_pointer) = 0;
		PARTIAL_PACKET_COUNT(conn->outgoing_buffer_pointer) = 0;
		BYTE_COUNT(conn->outgoing_buffer_pointer) = 16;

		send_packet(conn, conn->outgoing_buffer_pointer);
		(void) receive_packet_with_timeout (conn, 1000);
		lm_queue_message (WARNING_MSG, "Network connection lost due to user interrupt ");
		am_sending_packet = -1;
		return(FAILURE);
	}

	am_sending_packet = conn->header.sequence_number;

	/*
	 * Increment the sequence number before sending a new message.
	 */
	conn->header.sequence_number++;

	/*
	 * Set the appropriate header information in the message.
	 */
	PROCESS_ID(conn->outgoing_buffer_pointer) = conn->header.process_id;
	SEQUENCE_NUMBER(conn->outgoing_buffer_pointer) = conn->header.sequence_number;
	PARTIAL_PACKET_COUNT(conn->outgoing_buffer_pointer) = conn->header.partial_packet_count;

	/*
	 * Reset the count of how many times we have tried to send the message.
	 */
	number_of_message_attempts = 0;

	/*
	 * Reset the length of time we decide to wait for an acknowledge.
	 */
	network_timeout = lm_network_timeout;

	/*
	 * Send the message to the address in conn.
	 */
try_try_again:
	if (lm_drop_packet == FALSE) {
		if (send_packet(conn, conn->outgoing_buffer_pointer) != SUCCESS) {
			am_sending_packet = -1;
			return(FAILURE);
		}
```

Copyright 1989 Logic Modeling Systems

| SOURCE PROGRAM | DATE | PAGE # |
|---|---|---|
| networkh/net_clnt.c | 5/23/89 | 3/6 |
| | TIME 1:20:47 pm | |

LINE # SOURCE TEXT

```
		}

		/* Next time through the loop, let's send the packet. */
		lm_drop_packet = FALSE;

		if (lm_duplicate_packet == TRUE) {
			if (send_packet(conn, conn->outgoing_buffer_pointer) != SUCCESS) {
				am_sending_packet = -1;
				return(FAILURE);
			}
		}

		switch (receive_packet_with_timeout(conn, 1000)) {
		case SUCCESS:
			goto process_received_packet;
		case NOT_SUCCESS_OR_FAILURE:
			/* is the modeler alive? */
			if (lm_is_modeler_alive(conn->name, &state) != LM_SUCCESS) {
				am_sending_packet = -1;
				return(FAILURE);
			}
			break;
		default:
			am_sending_packet = -1;
			return(FAILURE);
		}

try_try_again_without_send:
	rtn = receive_packet_with_timeout(conn, network_timeout);
	if (rtn == SUCCESS) {
		; /* Fall through to below to process the received packet. */
	}
	else if (rtn == NOT_SUCCESS_OR_FAILURE) {
		/* We have timed out and must resend the request.          */
		if (process_timeout(&number_of_message_attempts,
		    &network_timeout) != SUCCESS) {
			am_sending_packet = -1;
			return(FAILURE);
		}

		if (lm_resend_on_timeout == TRUE)
			goto try_try_again;
		else {
			am_sending_packet = -1;
			return(SUCCESS);
		}
	}
	else {
		am_sending_packet = -1;
		return(FAILURE);
	}

process_received_packet:
	/*
	 * Verify that the acknowledge is for the correct message.
	 */
	if (conn->header.sequence_number == SEQUENCE_NUMBER(conn->incoming_buffer_pointer)) {
		/* The message and acknowledge sequence numbers match - great!  */
		am_sending_packet = -1;
		return(SUCCESS);
	}
	else if (SEQUENCE_NUMBER(conn->incoming_buffer_pointer) == conn->header.sequence_number - 1) {

		/* The message and acknowledge sequence numbers don't match - ouch!      */
		/* Must be a duplicated previous reply.  Go back to the point of packet */
		/* reception and receive the real (new) reply.  Note that we do not     */
		/* resend the request as we assume the modeler has already received it */
		/* and replied in the (to be) received reply.  If the modeler never    */
		/* received the request, we will time out and resend as usual.          */

		/* Process mismatched sequence numbers exactly as if a time out         */
		/* had occurred.  This checks for too many attempts at a correct        */
		/* acknowledge and may possibly give up if things don't straighten out. */

		if (process_mismatch() != SUCCESS) {
			am_sending_packet = -1;
			return(FAILURE);
		}
		goto try_try_again_without_send;
	}
	else {
		/* The whole world must be messed up - giveup! */
		lm_queue_message(ERROR_MSG, "mismatched message transaction sequence numbers from the modeler(%d, %d)",
			SEQUENCE_NUMBER(conn->incoming_buffer_pointer),
			conn->header.sequence_number
		);
	}

	am_sending_packet = -1;
	return(FAILURE);
}


static	u_short
send_multiple_message_get_ack(conn)
register		CONNECTION		*conn;
{
	register		u_long	packet_byte_count;
	register		u_long	message_bytes_left_to_send;


	/*
	 * Find the total bytes in the message buffer.  This is also the total
	 * number of bytes left to send beings we haven't sent anything, yet.
	 */
	message_bytes_left_to_send = BYTE_COUNT(conn->outgoing_buffer_pointer);

	/*
	 * Do a sanity check on the message size.  If its really big, assume that
	 * something BAD has happened in the upper level software and give up.
	 */
	if (message_bytes_left_to_send > 2*MAX_REQUEST_SIZE) {
		lm_queue_message(ERROR_MSG, "message is too large(%lu) to send to the modeler", message_bytes_left_to_send);
		return(FAILURE);
	}

	/*
	 * Kludge the "bytes left to send" as the first packet header is already
	 * included in the message that was passed down.  This kludge is undone
	 * during the first pass through the while() loop when message_bytes_left_to_send
```

Copyright 1989 Logic Modeling Systems

| SOURCE PROGRAM | DATE | PAGE # |
| --- | --- | --- |
| networkh/net_clnt.c | 5/23/89 | 4/7 |
| | TIME 1:20:47 pm | |

LINE # SOURCE TEXT

```
	 * is adjusted by P_HEADER_SIZE.  Note that subsequent passes through the
	 * while() loop are O.K. as the packet header is overlayed onto the message data.
	 */
	message_bytes_left_to_send -= P_HEADER_SIZE;

	while(message_bytes_left_to_send > 0) {
		/* Determine the size of the packet that we are going to send next.   */
		if (message_bytes_left_to_send > MAX_CLIENT_PACKET - P_HEADER_SIZE)
			packet_byte_count = MAX_CLIENT_PACKET;
		else packet_byte_count = message_bytes_left_to_send + P_HEADER_SIZE;

		/* Set the appropriate byte count in the packet to be sent.           */
		BYTE_COUNT(conn->outgoing_buffer_pointer) = packet_byte_count;

		/* Send the message and wait for the acknowledge.                     */
		if (send_single_message_get_ack(conn) != SUCCESS) {
			return(FAILURE);
		}

		/* Adjust the buffer pointer to its new location, but back up enough  */
		/* to overlay a new packet header structure on the next sent packet.  */
		/* NOTE: this trashes the message, but we don't care because the      */
		/* modeler has acknowledged its reception of the "trashed" data.      */
		conn->outgoing_buffer_pointer += packet_byte_count - P_HEADER_SIZE;

		/* We now have less message left to send, adjust by decreasing the    */
		/* message byte count by the amount the buffer pointer was incremented. */
		message_bytes_left_to_send -= packet_byte_count - P_HEADER_SIZE;
	}


	return(SUCCESS);
}


static u_short
receive_multiple_message(conn)
register	CONNECTION	*conn;
{
	register	char	*ptr;
	register	char	*buffer_ptr;

	register	u_long	packet_byte_count;
	register	u_long	message_bytes_left_to_receive;

	PACKET_HEADER	temporary; /* COPY */


	/*
	 * Note that upon entering this routine the incoming buffer already
	 * contains the first part of the multiple message that is being received.
	 */

	/*
	 * Find the total bytes in the message buffer (i.e., how much we will receive).
	 * The actual variable name is slightly misleading at this point due to the
	 * fact that the first part of the message has already been received.  Within
	 * the while() loop below, the variable name has its true meaning.
	 */
	message_bytes_left_to_receive = PARTIAL_PACKET_COUNT(conn->incoming_buffer_base);

	/*
	 * Do a sanity check on the message size.  If its really big, assume that
	 * something BAD has happened in the modeler software and give up.
	 */
	if (message_bytes_left_to_receive > 2*MAX_REPLY_SIZE) {
		lm_queue_message(ERROR_MSG, "message is too large(%lu) to receive from the modeler", message_bytes_left_to_receive);
		return(FAILURE);
	}

	/*
	 * If the incoming message will have a total byte count that is larger
	 * than the existing incoming buffer size.  Do a realloc() to the
	 * eventual total size of the incoming message.  A temporary pointer is
	 * used to maintain the current buffer in case we are out of memory.
	 */
	if (message_bytes_left_to_receive+MAX_SERVER_PACKET > conn->incoming_buffer_size) {
		ptr = realloc(conn->incoming_buffer_base, (unsigned)(message_bytes_left_to_receive+MAX_SERVER_PACKET));
		if (ptr == (char *) NULL) {
			lm_queue_message(SYS_ERROR_MSG, "out of memory on host for incoming messages");
			return(FAILURE);
		}

		/* Update the connection data structure. */
		conn->incoming_buffer_base = ptr;
		conn->incoming_buffer_size = message_bytes_left_to_receive+MAX_SERVER_PACKET;
	}

	/*
	 * Initialize our local buffer pointer to the existing incoming buffer base.
	 */
	buffer_ptr = conn->incoming_buffer_base;

	/*
	 * Initialize the outgoing message buffer pointer.
	 */
	conn->outgoing_buffer_pointer = conn->outgoing_buffer_base;

	/*
	 * Do a structure assignment to set the current packet header as a
	 * modeler acknowledgement for receiving the partial packet reply.
	 */
	*(PACKET_HEADER *) conn->outgoing_buffer_pointer = *(PACKET_HEADER *) buffer_ptr; /* COPY */

	/*
	 * Adjust the byte count in the acknowledge.
	 */
	BYTE_COUNT(conn->outgoing_buffer_pointer) = P_HEADER_SIZE;

	/*
	 * Set the packet byte count to equal the size of the current packet.
	 */
	packet_byte_count = BYTE_COUNT(buffer_ptr);

	/*
	 * Adjust the buffer pointer to its new location, but back up enough to
	 * overlay a new packet header structure for the next received packet.
	 * NOTE: this will trash part of the incoming message, but we will
	 * save and later restore that "trashed" data.
	 */
```

Copyright 1989 Logic Modeling Systems

SOURCE PROGRAM networkh/net_clnt.c | DATE 5/23/89 | TIME 1:20:47 pm | PAGE # 5/8

SOURCE TEXT

```c
		buffer_ptr += packet_byte_count - P_HEADER_SIZE;

		/*
		 * We now have less message to receive, adjust by decreasing the
		 * "bytes to receive" by the size of the incoming buffer.
		 */
		message_bytes_left_to_receive -= packet_byte_count;

		while(message_bytes_left_to_receive > 0) {
			/* Do a structure assignment to save the last P_HEADER_SIZE          */
			/* bytes so that they can be restored after the next incoming packet */
			/* is received and its header processed.                             */
			temporary = *(PACKET_HEADER *) buffer_ptr; /* COPY */

			/* Set the incoming buffer pointer that send_single_message_*() uses */
			/* to the current beginning of the whole incoming message buffer.    */
			conn->incoming_buffer_pointer = buffer_ptr;

			/* Send the request in a message and wait for the acknowledge.       */
			if (send_single_message_get_ack(conn) != SUCCESS) {
				return(FAILURE);
			}

			/* Do a structure assignment to set the current packet header as a   */
			/* modeler acknowledgement for receiving the partial packet reply.   */
			*(PACKET_HEADER *) conn->outgoing_buffer_pointer = *(PACKET_HEADER *) buffer_ptr; /* COPY */

			/* Adjust the byte count in the acknowledge.                         */
			BYTE_COUNT(conn->outgoing_buffer_pointer) = P_HEADER_SIZE;

			/* Determine how many bytes are in the just received packet.         */
			packet_byte_count = BYTE_COUNT(buffer_ptr);

			/* Restore the bytes that were saved above and trashed during the    */
			/* message reception.                                                */
			*(PACKET_HEADER *)buffer_ptr = temporary; /* COPY */

			/* Adjust the buffer pointer to its new location, but back up enough to */
			/* overlay a new packet header structure for the next received packet.  */
			/* NOTE: this will trash part of the incoming message, but we will      */
			/* save and later restore that "trashed" data.                          */
			buffer_ptr += packet_byte_count - P_HEADER_SIZE;

			/* We now have less message to receive, adjust by decreasing the     */
			/* "bytes to receive" by the amount the buffer_ptr was incremented.  */
			message_bytes_left_to_receive -= packet_byte_count - P_HEADER_SIZE;
		}

		/*
		 * Set the total number of bytes in the entire incoming message.
		 */
		BYTE_COUNT(conn->incoming_buffer_base) = PARTIAL_PACKET_COUNT(conn->incoming_buffer_base);

		return(SUCCESS);
}


static	u_short
receive_packet_with_timeout(conn, milli_seconds)
register		CONNECTION	*conn;
register		u_long	milli_seconds;
{
	int	rtn;
	int	readfds;
	struct	timeval timeout;
	int	counter;

#ifdef VMS
	fd_set	read_chans, write_chans, excep_chans;
#endif


	long elapsed_time;
	long first_int_time = 0;


	timeout.tv_sec  = ((long) milli_seconds)/1000;
	timeout.tv_usec = (((long) milli_seconds)%1000)*1000;
do_select:
	readfds = 1 << conn->fd;

#ifdef VMS

	timeout.tv_sec  = 0;
	timeout.tv_usec = 30;

	counter = 0;
	rtn = 0;
	while ((0 == rtn) && ((milli_seconds/30) > counter)) {
		FD_ZERO ( &read_chans );
		FD_ZERO ( &write_chans );
		FD_ZERO ( &excep_chans );
		FD_SET (conn->fd, &read_chans);

		counter++;

		rtn = select (0, &read_chans, &write_chans,
				&excep_chans, &timeout);
	}

	if (rtn == -1) {
#else
	if ((rtn = select(1 + conn->fd, &readfds,
	    (int *)NULL, (int *)NULL, &timeout)) == -1) {
#endif
		/*
		 * If select() is interrupted, consider it a non-fatal error and
		 * go back to wait some more.  To be completely correct we should
		 * not wait the same amount of time again, but rather decrease the
		 * time to wait.  However, I don't know how much time to decrease
		 * by, so just start over again.
		 */
			if (errno == EINTR) {
				if (first_int_time == 0) {
					first_int_time = time(0);
				} else {
					elapsed_time = time(0) - first_int_time;
					if (elapsed_time > (((long) milli_seconds)/1000)) {
						/* time is up */
						timeout.tv_sec  = 0;
```

Copyright 1989 Logic Modeling Systems

SOURCE PROGRAM networkh/net_clnt.c | DATE 5/23/89 | TIME 1:20:47 pm | PAGE # 6/9

LINE # SOURCE TEXT

```
                                timeout.tv_usec = 0;
                        } else {
                            /* wait some more */
                            timeout.tv_sec  = (((long) milli_seconds)/10... - elapsed_time;
                        }
                    }
                    goto do_select;
                }

                /* select() has failed, give up. */
                lm_queue_message(SYS_ERROR_MSG,
                    "failure to select modeler communication endpoint(socket)");
                return(FAILURE);
        }
        if (rtn == 0) {
                /* We have timed out.      */
                return(NOT_SUCCESS_OR_FAILURE);
        }
        /* We have received the data.  Note that it is  */
        /* not necessary to process the returned value  */
        /* as we know it is what we want (there was     */
        /* one readfds selected for viewing).           */

        /*
         * Receive the acknowledge packet from the address in conn.
         */
        return(receive_packet(conn, conn->incoming_buffer_pointer, milli_seconds));
}


static  u_short
receive_packet(conn, packet, milli_seconds)
register        CONNECTION      *conn;
register        char    *packet;
register        u_long  milli_seconds;
{

        register        int     rcnt;
        register        int     byte_count;

        register        char    *buffer_ptr;

#ifdef  VMS

        int             sock_size = SOCK_SIZE;
        register        LM_HEADER       *lm_header;

#endif


        /*
         * Initialize the receive buffer pointer, byte count, and socket size.
         */
        byte_count = 0;
        buffer_ptr = packet;

        /*
         * Loop until we receive all the packet, incrementing
         * buffer_ptr and byte_count as we go.
         */
        do {
                /*
                 * We use recv() rather than recvfrom() because performance is better.
                 * See the comments near the use of send() and connect().
                 */
                rcnt = recv(conn->fd, buffer_ptr, MAX_CLIENT_PACKET, 0);
                if (rcnt <= 0) {
                        lm_queue_message(SYS_ERROR_MSG, "failure to receive any data from the modeler");
                        return(FAILURE);
                }

                byte_count += rcnt;
                buffer_ptr += rcnt;
                /* Don't stop until we have all the bytes. */
#ifdef  VMS
        /* FIXIT: this doesn't work if recvfrom() doesn't return all data in one call. */
} while(byte_count != BYTE_SWAP_LONG(BYTE_COUNT(packet)));
#else
        } while(byte_count != BYTE_COUNT(packet));
#endif

#ifdef  VMS
        /*
         * Play games with the byte ordering to convert it from modeler order.
         * The rest of the data will be converted as it is read from the packet.
         */
        lm_header = &((PACKET_HEADER *) packet)->lm_hdr;

        lm_header->byte_count = BYTE_SWAP_LONG(lm_header->byte_count);
        lm_header->process_id = BYTE_SWAP_LONG(lm_header->process_id);
        lm_header->sequence_number = BYTE_SWAP_LONG(lm_header->sequence_number);
        lm_header->partial_packet_count = BYTE_SWAP_LONG(lm_header->partial_packet_count);
#endif

        return(SUCCESS);
}


static  u_short
send_packet(conn, packet)
register        CONNECTION      *conn;
register        char    *packet;
{
        register        int     scnt;
        register        int     byte_count;
#ifdef  VMS
        register        LM_HEADER       *lm_header;
#endif

        /*
         * We unconditionally send the packet to the connected user.  Other routines
         * determine whether the packet actually arrived at its destination.
         */

        /*
         * Set the number of bytes we have to send.
         */
        byte_count = BYTE_COUNT(packet);

#ifdef  VMS
```

Copyright 1989 Logic Modeling Systems

SOURCE PROGRAM networkh/net_clnt.c | DATE 5/23/89 | TIME 1:20:47 pm | PAGE # 7/10

LINE # SOURCE TEXT

```
        /*
         * On VMS we must adjust the byte count of the packet being sent to account
         * for the fact that we add the UDP and IP headers in the "user" buffer.
         * This normalizes the byte count in the packet to just the number of bytes
         * of real user data.
        BYTE_COUNT(packet) -= sizeof(UDP_HEADER) + sizeof(IP_HEADER);

         * Play games with the byte ordering to put it into modeler required order.
         * The rest of the data was converted when it was put into the packet.
         */
        lm_header = &((PACKET_HEADER *) packet)->lm_hdr;

        lm_header->byte_count = BYTE_SWAP_LONG(lm_header->byte_count);
        lm_header->process_id = BYTE_SWAP_LONG(lm_header->process_id);
        lm_header->sequence_number = BYTE_SWAP_LONG(lm_header->sequence_number);
        lm_header->partial_packet_count = BYTE_SWAP_LONG(lm_header->partial_packet_count);
#endif

        /*
         * Increment our tracking of the total number of packets that are sent,
         * and send the packet to the address in conn.
         */
        ++lm_total_number_of_packets_sent;

        /*
         * The code is measureably faster if send() is used rather than sendto().
         * This requires the use of connect(), however.  See comments elsewhere in
         * the code for details on connect()'s usage.
         */
        acnt = send(conn->fd, packet, byte_count, 0);

        /*
         * Verify that all the packet bytes were sent.
         */
        if (acnt != byte_count) {
                lm_queue_message(SYS_ERROR_MSG, "failure to send exactly %d bytes to the modeler, sent %d instead", byte_count, acnt);
                return(FAILURE);
        }

#ifdef  VMS
        /*
         * Undo the byte ordering that we done above.  I'm not sure that
         * this is required, but it's safest to do it just the same.
         */
        lm_header->byte_count = BYTE_SWAP_LONG(lm_header->byte_count);
        lm_header->process_id = BYTE_SWAP_LONG(lm_header->process_id);
        lm_header->sequence_number = BYTE_SWAP_LONG(lm_header->sequence_number);
        lm_header->partial_packet_count = BYTE_SWAP_LONG(lm_header->partial_packet_count);

        /*
         * Undo the adjustment that was done above (just in case anybody decides to
         * look at it in upper level routines).
         */
#endif

        return(SUCCESS);
}


u_short
lm_init_connection_for_client(conn)
register        CONNECTION      *conn;
{
        u_long  address;        /* can't be made storage class register */

        register        int     fd;
        register        int     pid;

        conn->fd = -1; /* start with an invalidated conn structure */

        /*
         * WARNING: if you change this routine check reset_network_connection()
         *          to see if the same changes are needed there.
         */

        /*
         * Verify that a name for the modeler was specified.
         */
        if (conn->name == (char *)NULL || *conn->name == '\0') {
                lm_queue_message(ERROR_MSG, "failure to specify a modeler name");
                return(FAILURE);
        }

        /*
         * Create a datagram socket for communication.
         */
        if ((fd=socket(AF_INET, SOCK_DGRAM, 0)) < 0) {
                lm_queue_message(SYS_ERROR_MSG, "could not create modeler communication endpoint(socket)");
                return(FAILURE);
        }

        /*
         * Obvious?
         */
        if (obtain_modelers_address(fd, conn->name, &address) != SUCCESS) {
                lm_close(fd);
                conn->fd = -1; /* invalidate the conn structure */
                return(FAILURE);
        }

        /*
         * Save the opened socket file descriptor, set the network family type
         * to internet, set the receiving port to be that of the modeler, and
         * set the address to look for requests from any address.
         */
        conn->fd = fd;
        conn->sock.family = AF_INET;
        conn->sock.port = MODELERS_ETHERNET_PORT;
#ifdef VMS
        conn->sock.port = BYTE_SWAP_SHORT(MODELERS_ETHERNET_PORT);
#endif
        conn->sock.address = address;

        /*
         * Use connect() to permanently associate the previously set addresses
         * with the socket file descriptor.  The use of this function is optional
         * given the use of sendto() and recvfrom() (rather than send() and recv()),
         * but the code is measureably faster if this association is done once, now
         * rather than every time sendto() or recvfrom() is called.
         */
```

Copyright 1989 Logic Modeling Systems

LINE # SOURCE TEXT

```
        if (connect(comm->fd, (struct sockaddr *)&comm->sock, SOCK_SIZE) != 0) {
                lm_queue_message(SYS_ERROR_MSG, "could not connect modeler communication endpoint(socket)");
                lm_close(fd);
                comm->fd = -1; /* invalidate the comm structure */
                return(FAILURE);
        }

        /*
         * Get the process id of the application.  This number becomes
         * part of the network protocol as an application ID.
         */
        pid = getpid();
        if (pid < 0) {
                lm_queue_message(SYS_ERROR_MSG, "illegal host process id(%d)", pid);
                lm_close(fd);
                comm->fd = -1; /* invalidate the comm structure */
                return(FAILURE);
        }

        /*
         * Set the default values into the packet header construct that is
         * used to track the state of the host communication.
         */
        comm->header.byte_count = -1;
        comm->header.process_id = pid;
        comm->header.sequence_number = 0;
        comm->header.partial_packet_count = 0;

        /*
         * Initialize the partial packet indicators.  (Technically, these don't
         * need to be initialized for the client as the client never references
         * them, but what the heck - let's be consistant and init everywhere.)
         */
        comm->am_sending = FALSE;
        comm->bytes_left_to_send = 0;
        comm->am_receiving = FALSE;
        comm->bytes_left_to_receive = 0;

        /*
         * Set the incoming buffer time, end of current message,
         * buffer size, and allocate memory space to receive messages.
         */
        comm->incoming_time = 0;
        comm->incoming_buffer_size = 2*MAX_CLIENT_PACKET;
        if ((comm->incoming_buffer_base = malloc(2*MAX_CLIENT_PACKET)) == (char *)NULL) {
                lm_queue_message(SYS_ERROR_MSG, "out of memory on host for incoming messages");
                lm_close(fd);
                free(comm->incoming_buffer_base);
                comm->fd = -1; /* invalidate the comm structure */
                return(FAILURE);
        }
        comm->incoming_message_end = comm->incoming_buffer_base;

        /*
         * Initialize the incoming buffer pointer properly.
         */
        LM_RESET_INCOMING(comm);

        /*
         * Set the outgoing buffer time, end of buffer,
         * buffer size, and allocate memory space to send messages.
         */
        comm->outgoing_time = 0;
        comm->outgoing_buffer_size = 2*MAX_CLIENT_PACKET;
        if ((comm->outgoing_buffer_base = malloc(2*MAX_CLIENT_PACKET)) == (char *)NULL) {
                lm_queue_message(SYS_ERROR_MSG, "out of memory on host for outgoing messages");
                lm_close(fd);
                free(comm->incoming_buffer_base);
                free(comm->outgoing_buffer_base);
                comm->fd = -1; /* invalidate the comm structure */
                return(FAILURE);
        }
        comm->outgoing_buffer_end = comm->outgoing_buffer_base + comm->outgoing_buffer_size;

        /*
         * Initialize the outgoing buffer pointer properly.
         */
        LM_RESET_OUTGOING(comm);

        return(SUCCESS);
}


static reset_network_connection (comm)
        CONNECTION      *comm;
{
        /*
         *  This routine completely resets the comm structure.
         *  Note that most of the code has been plagerized from
         *  close_comm_for_client() and init_comm_for_client()
         *  If either of these routines changes, check to see that
         *  this code does not need to be changed.
         */

        (void) free(comm->incoming_buffer_base);
        (void) free(comm->outgoing_buffer_base);

        /*
         * Set the default values into the packet header construct that is
         * used to tract the state of the host communication.
         */

        comm->header.sequence_number = 0;
        comm->header.partial_packet_count = 0;

        /*
         * Initialize the partial packet indicators.  (Technically, these don't
         * need to be initialized for the client as the client never references
         * them, but what the heck - let's be consistant and init everywhere.)
         */

        comm->am_sending = FALSE;
        comm->bytes_left_to_send = 0;
        comm->am_receiving = FALSE;
        comm->bytes_left_to_receive = 0;

        /*
         * Set the incoming buffer time, end of current message,
```

Copyright 1989 Logic Modeling Systems

SOURCE PROGRAM networkh/net_clnt.c | DATE 5/23/89 | TIME 1:20:47 pm | PAGE # 9/12

SOURCE TEXT

```
         * buffer size, and allocate memory space to receive messages.
         */

        conn->incoming_time = 0;
        conn->incoming_buffer_size = 2*MAX_CLIENT_PACKET;
        if ((conn->incoming_buffer_base = malloc(2*MAX_CLIENT_PACKET)) == (char *)NULL) {
                lm_queue_message(SYS_ERROR_MSG, "out of memory on host for incoming messages");
                return(FAILURE);
        }
        conn->incoming_message_end = conn->incoming_buffer_base;

        /*
         * Initialize the incoming buffer pointer properly.
         */
        LM_RESET_INCOMING(conn);

        /*
         * Set the outgoing buffer time, end of buffer,
         * buffer size, and allocate memory space to send messages.
         */
        conn->outgoing_time = 0;
        conn->outgoing_buffer_size = 2*MAX_CLIENT_PACKET;
        if ((conn->outgoing_buffer_base = malloc(2*MAX_CLIENT_PACKET)) == (char *)NULL) {
                lm_queue_message(SYS_ERROR_MSG, "out of memory on host for outgoing messages");
                return(FAILURE);
        }
        conn->outgoing_buffer_end = conn->outgoing_buffer_base + conn->outgoing_buffer_size;

        /*
         * Initialize the outgoing buffer pointer properly.
         */
        LM_RESET_OUTGOING(conn);

        return(SUCCESS);
}

u_short
lm_close_connection_for_client(conn)
register        CONNECTION      *conn;
{

        /*
         * WARNING: If you change this routine check reset_network_connection()
         *          to see if the same changes are needed there.
         */
        if (conn->fd == -1) {
                /* This conn has already been closed */
                return(SUCCESS);
        }

        if (lm_close(conn->fd) != 0) {
                lm_queue_message(SYS_ERROR_MSG, "failure to close modeler communication endpoint(socket)");
                return(FAILURE);
        }

        (void) free(conn->incoming_buffer_base);
        (void) free(conn->outgoing_buffer_base);

        conn->fd = -1; /* invalidate the conn structure */

        return(SUCCESS);
}


static  u_short
obtain_modelers_address(fd, modeler_name, address)
int     fd;
char    *modeler_name;
u_long  *address;
{
        register        struct  hostent *hp;

        extern  struct  hostent *gethostbyname();


        /*
         * Use the standard UNIX gethostbyname() routine for getting
         * the network address of the modeler.
         */
        hp = gethostbyname(modeler_name);
        if (hp == (struct hostent *)NULL) {
                lm_queue_message(ERROR_MSG, "modeler '%s' is unknown to the hosts database", modeler_name);
                return(FAILURE);
        }

        /*
         * Return the found address in the appropriate place.
         */
        *address = *(u_long *) hp->h_addr;

        return(SUCCESS);
}


static  u_short
process_timeout(number_of_message_attempts, network_timeout)
register        u_short *number_of_message_attempts;
register        u_long  *network_timeout;
{
        /*
         * Track the total number of retries that have been attempted
         * since this process began.
         */
        ++lm_total_number_of_msg_retries;       /* global */

        /*
         * Obviously, something has gone wrong if we get into this routine.
         * Let's be safe and print a warning message.
         *
         * Update, people don't want to see warning messages if something
         * isn't really wrong.  So for now we'll not say anything.
         */


        /*
         * Increment the number of times that we have tried to process
         * the current message.  If it has been too many times, give up.
         */
        if (++(*number_of_message_attempts) >= lm_max_timeout_retry_attempts) {
                lm_queue_message(ERROR_MSG, "modeler not responding");
                return(FAILURE);
```

Copyright 1989 Logic Modeling Systems

LINE # SOURCE TEXT

```
        }

        /*
         * Obviously, something has gone wrong if we get into this routine.
         * Let's be safe and print a warning message at infrequent intervals.
         */
        if ((++lm_total_number_of_timeouts % lm_network_warning_freq) == 0) {
                lm_queue_message(WARNING_MSG, "%lu out of %lu network packets have timed out, is your network OK?",
                        lm_total_number_of_timeouts,
                        lm_total_number_of_packets_sent
                );
        }

        /*
         * Increment the time that we wait for the next acknowledgement.
         * This is a simple attempt at adjusting for modeler load, and
         * is just a simple increase in wait time for each timeout.  */
        *network_timeout += lm_network_timeout;

        /*
         * Try, try, again.
         */
        return(SUCCESS);
}


static  u_short
process_mismatch()
{
        /*
         * Track the total number of retries that have been attempted
         * since this process began.
         */
        ++lm_total_number_of_msg_retries;       /* global */

        /*
         * Obviously, something has gone wrong if we get into this routine.
         * Let's be safe and print a warning message at infrequent intervals.
         */
        if ((++lm_total_number_of_mismatches % lm_network_warning_freq) == 0) {
                lm_queue_message(WARNING_MSG, "%lu out of %lu network packets have been mismatched, is your network OK?",
                        lm_total_number_of_mismatches,
                        lm_total_number_of_packets_sent
                );
        }

        /*
         * Try, try, again.
         */
        return(SUCCESS);
}


#define SMALL_BUFFER    256

/*
 * lm_is_modeler_alive() is guaranteed to determine if the modeler is alive
 * or dead (defined below) in less than 3 seconds.
 *
 *      It returns LM_ERROR if some internal error occurred.  (Make sure you
 *      read what the LM_WARNING return code means.)
 *
 *      It returns LM_SUCCESS if everything went OK and the modeler is alive.
 *      This is the only return code for which "state" contains valid information.
 *
 *      It returns LM_WARNING if everything went OK except for getting a response
 *      from the modeler.  I wanted to differentiate all out of my control errors
 *      from the condition that the modeler is not alive.  This is done by looking
 *      at the return code rather than doing some special garbage with "state".
 *
 *      In order for this routine to return LM_SUCCESS (i.e., say that the modeler
 *      is alive), it must be able to create a socket and send and receive packets
 *      on the host - AND - the modeler must be up and running to the point where
 *      it is correctly processing LANCE interrupts.
 */

lm_is_modeler_alive(modeler_name, state)
char    *modeler_name;
char    *state;
{
        return send_on_special_port(modeler_name, state,
                MODELERS_ARE_YOU_ALIVE_PORT, AYA_INQUIRE, 0, 0);
}

lm_request_interrupt(modeler_name, state)
char    *modeler_name;
char    *state;
{
        return send_on_special_port(modeler_name, state,
                MODELERS_ARE_YOU_ALIVE_PORT, AYA_INTERRUPT, 0, 0);
}

lm_remote_reset(modeler_name, state)
char    *modeler_name;
char    *state;
{
        return send_on_special_port(modeler_name, state,
                MODELERS_DEATH_PORT, AYA_KILL, 0, 0);
}

static send_on_special_port(modeler_name, state, port, cmd, size, buffer)
char    *modeler_name;
char    *state;
char    *buffer;
{
        register        u_short rts;

        int     fd;
        u_long  address;
        u_short number_of_message_attempts;     /* can't be made storage class register */

        CONNECTION      conn;

        char    in_buffer[SMALL_BUFFER];
        char    out_buffer[512 + sizeof(LM_HEADER) + 8];
        long    *lptr;
        int     packet_size = size + sizeof(LM_HEADER) + 8;

        *state = 0;
```

Copyright 1989 Logic Modeling Systems

SOURCE PROGRAM networkh/net_clnt.c | DATE 5/23/89 | TIME 1:20:47 pm | PAGE # 11/14

LINE # SOURCE TEXT

```
        if (packet_size > sizeof(out_buffer)) {
                lm_queue_message(ERROR_MSG,
                        "special packet size too big (%d bytes)", packet_size);
                return(LM_ERROR);
        }

        /* Verify that a name for the modeler was specified. */
        if (modeler_name == (char *)NULL || *modeler_name == '\0') {
                lm_queue_message(ERROR_MSG, "failure to specify a modeler name");
                return(LM_ERROR);
        }

        /* Store the name away in the comm for lower level routine's processing. */
        comm.name = modeler_name;

        /* Create a datagram socket for communication. */
        if ((fd=socket(AF_INET, SOCK_DGRAM, 0)) < 0) {
                lm_queue_message(SYS_ERROR_MSG, "could not create modeler communication endpoint(socket)");
                return(LM_ERROR);
        }

        if (obtain_modelers_address(fd, comm.name, &address) != SUCCESS) {
                (void)lm_close(fd);
                return(LM_ERROR);
        }

        comm.fd = fd;
        comm.sock.family = AF_INET;
        comm.sock.port = htons(port);
        comm.sock.address = address;

        if (connect(comm.fd, (struct sockaddr *)&comm.sock, SOCK_SIZE) != 0) {
                (void)lm_close(fd);
                lm_queue_message(SYS_ERROR_MSG, "could not connect modeler communication endpoint(socket)");
                return(LM_ERROR);
        }

        comm.incoming_buffer_base = in_buffer;
        comm.incoming_buffer_pointer = in_buffer;
        comm.outgoing_buffer_base = out_buffer;
        comm.outgoing_buffer_pointer = out_buffer;

        /* We really don't have an outgoing message, so just slap 4 bytes in. */
        lptr = (long *)(comm.outgoing_buffer_base + sizeof(LM_HEADER));
        *lptr++ = cmd;
        *lptr++ = size;
        if (size > 0) {
                bcopy(buffer, (char *)lptr, size);
        }
        BYTE_COUNT(comm.outgoing_buffer_base) = packet_size;

        /* It doesn't matter what these fields are, but set them to 0 anyway.   */
        /* There is some small probability that they could find their way into  */
        /* higher level code and cause serious corruptions if not caught.       */
        PROCESS_ID(comm.outgoing_buffer_base) = 0;
        SEQUENCE_NUMBER(comm.outgoing_buffer_base) = 0;
        PARTIAL_PACKET_COUNT(comm.outgoing_buffer_base) = 0;

        number_of_message_attempts = 0;

try_try_again:
        if (send_packet(&comm, comm.outgoing_buffer_base) != SUCCESS) {
                (void)lm_close(fd);
                return(LM_ERROR);
        }

        rts = receive_packet_with_timeout(&comm, (u_long)500); /* 0.5 seconds */
        if (rts == SUCCESS) {
                ; /* Fall through to below to process the received packet. */
        }
        else if (rts == NOT_SUCCESS_OR_FAILURE) {
                /* We have timed out and must resend the request.        */
                if (++number_of_message_attempts >= 3) {
                        (void)lm_close(fd);
                        lm_queue_message(WARNING_MSG,
                                "modeler does not respond");
                        return(LM_WARNING);
                }

                goto try_try_again;
        }
        else {
                (void)lm_close(fd);
                return(LM_ERROR);
        }

        /*
         * Ignore version for now, just return the state.
        version = comm.incoming_buffer_base[0+sizeof(PACKET_HEADER)];
         */

        *state = comm.incoming_buffer_base[1+sizeof(PACKET_HEADER)];
        (void)lm_close(fd);

        if (*state == RUNNING_LOOPMODE) {
                lm_queue_message(WARNING_MSG, "modeler running loop mode");
                return(LM_WARNING);
        }

        return(LM_SUCCESS);
}

static
lm_close(fd)
        int     fd;

{
#ifdef VMS
        return( netclose(fd) );
#else
        return( close(fd) );
#endif
}
```

Copyright 1989 Logic Modeling Systems

| SOURCE PROGRAM | DATE | 5/23/89 | PAGE # |
|---|---|---|---|
| networkm/net_srv.c | TIME | 4:42:06 pm | 1/1 |

SOURCE TEXT

```
/* SCCS_ID: net_srv.c rev 1.5, 5/9/89 at 17:28:38      */

#include "common.h"
#include "message.h"
#include "lance.h"
#include "network.h"
#include "task.h"
#include "fifo.h"
#include "cpu.h"
#include "mod_err.h"
#include "nvram.h"
#include "vrtx.h"


extern  u_short handle_first_part_of_reply();
extern  u_short send_next_part_of_reply();
extern  u_short handle_first_part_of_request();
extern  u_short receive_next_part_of_request();


extern  u_short set_up_out_of_luck_user();
extern  u_short set_close_connection_for_server();
extern  u_short receive_packet();
extern  u_short send_packet();
extern  u_short send_packet_to_host();
extern  u_short find_or_create_a_connection();
extern  u_short init_connection_for_server();
extern  u_short close_connection_for_server();

u_long lm_dead_user_mask = 0;

#define vprintf (void)printf

#define MSGLEN 50
static char tx_buffer[MAX_USERS] [ sizeof(PACKET_HEADER) + MSGLEN];
static char *tx_buffer_ptr;

#define LM_RESET_RAW_TX_BUFFER(X) (tx_buffer_ptr = tx_buffer[ (X) ] + sizeof( PACKET_HEADER ) -sizeof(LM_HEADER) )
#define LM_PUT_CHAR_TX_BUFFER(X) (*tx_buffer_ptr++ = (X))
#define LM_PUT_SHORT_TX_BUFFER(X) (*((u_short *)tx_buffer_ptr)++ = (X))
#define LM_PUT_LONG_TX_BUFFER(X) (*((u_long *)tx_buffer_ptr)++ = (X))
#define LM_TX_BYTECOUNT(X)       (tx_buffer_ptr - tx_buffer[(X)] - P_HEADER_SIZE + LM_HEADER_SIZE )

#ifdef MODELER
extern  BOOT_STRUCT     boot;
#else
BOOT_STRUCT     boot;
#endif
static  u_char active_users = 0;

static  CONNECTION      base_conn;

u_long  network_timeout;
u_long  print_sequence_mismatches = FALSE;

/*
** LMSImsg LMSI
** LMSIlive live
** LMSIdead dead
** LMSIkill kill
*/
#define LMSImsg  0x4c4d5349
#define LMSIlive 0x6c697665
#define LMSIdead 0x64656164
#define LMSIkill 0x6b696c6c
#define UNWANTED_USERS 1

static char dump_area[ MAX_SERVER_PACKET ];

CONNECTION      *table_of_conns[MAX_USERS+UNWANTED_USERS];


u_short
lm_send_reply(conn)
register        CONNECTION      *conn;
{
        u_short status;

        conn->am_processing = FALSE;

        if (conn->am_sending == FALSE) {
                /* Copy the request packet sequence number to the reply packet header.  */
                SEQUENCE_NUMBER(conn->outgoing_buffer_base) = SEQUENCE_NUMBER(conn->incoming_buffer_base);

                /* Set the total number of bytes in the outgoing message buffer.*/
                /* It is absolutely critical that this be done here, before any */
                /* further buffer processing is done as the latter processing  */
                /* changes the value of conn->outgoing_buffer_pointer.          */
                BYTE_COUNT(conn->outgoing_buffer_base) = (u_long)conn->outgoing_buffer_pointer - (u_long)conn->outgoing_buffer_base - P_HEADER
                _SIZE + LM_HEADER_SIZE;
                if (BYTE_COUNT(conn->outgoing_buffer_base) <= MAX_CLIENT_PACKET) {
                        /* The reply WILL fit into a single network packet.  Set the   */
                        /* indication that this is the only packet for this request.   */
                        conn->header.partial_packet_count = 0;
                        conn->last_outgoing_buffer_pointer = conn->outgoing_buffer_base;
                        if (send_packet(conn, conn->outgoing_buffer_base) != SUCCESS) {
                                return(FAILURE);
                        }
                }
                else {  /* The reply will NOT fit into a single network packet. */
                        /* Set the indication that this is a partial packet.    */
                        conn->header.partial_packet_count  = BYTE_COUNT(conn->outgoing_buffer_base);

                        if (handle_first_part_of_reply(conn) != SUCCESS) {
                                return(FAILURE);
                        }
                }
                conn -> am_timing_out = TRUE;
                conn -> time_to_live = (lm_tick * 5) + network_timeout;
                conn -> time_at_last_response = lm_tick;
        }
        else {
                /* Am sending a partial reply.  The first part of the    */
                /* reply has already been sent and is present in         */
                /* conn->outgoing_buffer_base.  Go put the next          */
                /* part of the reply.  This may or may not be the        */
                /* last part of the total reply.  It's checked below.    */
                if((status = send_next_part_of_reply(conn))==SUCCESS) {
                        conn -> am_timing_out = TRUE;
                        conn -> time_to_live = (lm_tick * 5) + network_timeout;
```

Copyright 1989 Logic Modeling Systems

| SOURCE PROGRAM | DATE | PAGE # |
|---|---|---|
| networkm/net_srv.c | 5/23/89 | 2/2 |
| | TIME 4:42:06 pm | |

LINE # SOURCE TEXT

```
                        conn -> time_at_last_response = lm_tick;
                }
                return( status );
        }
        return(SUCCESS);
}

static  u_short
handle_first_part_of_reply(conn)
register        CONNECTION      *conn;
{
        register        u_long  total_bytes_to_send;


        /*
         * Set the total number of bytes that must be sent.
         */
        total_bytes_to_send = BYTE_COUNT(conn->outgoing_buffer_base);

        /*
         * Do a sanity check on the buffer size.  If its really big, assume
         * that something BAD has happened in the modeler software and give up.
         */
        if (total_bytes_to_send > 3*MAX_REPLY_SIZE) {
                lm_queue_message(ERROR_MSG, "message is too large(%lu) to send to the host", total_bytes_to_send);
                return(FAILURE);
        }

        /*
         * Set the partial reply send indicator.
         */
        conn->am_sending = TRUE;

        /*
         * Adjust the byte count in the first part of the reply.
         */
        BYTE_COUNT(conn->outgoing_buffer_base) = MAX_CLIENT_PACKET;

        /*
         * Send the first part of the reply to the address in conn.
         */
        conn->last_outgoing_buffer_pointer = conn->outgoing_buffer_base;
        if (send_packet(conn, conn->outgoing_buffer_base) != SUCCESS) {
                return(FAILURE);
        }

        /*
         * Set the number of bytes that we have left to send.
         */
        conn->bytes_left_to_send = total_bytes_to_send - MAX_CLIENT_PACKET;

        /*
         * Set the outgoing buffer pointer to the beginning of
         * the next part of the reply that will be sent.
         */
        conn->outgoing_buffer_pointer = conn->outgoing_buffer_base + MAX_CLIENT_PACKET + P_HEADER_SIZE - LM_HEADER_SIZE;

        return(SUCCESS);
}

static  u_short
send_next_part_of_reply(conn)
register        CONNECTION      *conn;
{
        register        u_long  packet_byte_count;


        /*
         * Note that upon entering this routine the first part of the multiple
         * message reply has already been sent and is present in the outgoing buffer.
         */

        /*
         * Receive the request packet from the address in conn.
         * This is an acknowledgement of the previously sent partial reply
         * and also a request to receive the next part of the reply.
         */

        if (receive_packet(conn, conn->incoming_buffer_base) != SUCCESS) {
                return(FAILURE);
        }

        if (conn->header.sequence_number != SEQUENCE_NUMBER(conn->incoming_buffer_base)) {


                if (print_sequence_mismatches == TRUE) {
                        vprintf("MMS#1, %d, %d, %d\n",
                                conn->fd,
                                SEQUENCE_NUMBER(conn->incoming_buffer_base),
                                conn->header.sequence_number
                        );
                }
                if (conn->header.sequence_number == SEQUENCE_NUMBER(conn->incoming_buffer_base)+1) {
                        if (conn->am_processing == FALSE) {
                                if (send_packet(conn, conn->last_outgoing_buffer_pointer) != SUCCESS)
                                        return(FAILURE);
                        }
                        return(SUCCESS);
                }
                else {
                        return(FAILURE);
                }
        }

        conn->header.sequence_number++;

        /*
         * Back up the current outgoing buffer pointer enough to allow us
         * to overlay a new packet header structure for the next sent packet.
         * NOTE: this will trash part of the outgoing message, but we don't
         * care because the host has already acknowledged its reception.
         */

        conn->outgoing_buffer_pointer -= P_HEADER_SIZE;

        /*
         * Copy the request packet sequence number to the reply packet header.
         */
```

Copyright 1989 Logic Modeling Systems

SOURCE PROGRAM networkm/net_srv.c | DATE 5/23/89 | TIME 4:42:06 pm | PAGE # 3/3

SOURCE TEXT

```
        SEQUENCE_NUMBER(conn->outgoing_buffer_pointer) = SEQUENCE_NUMBER(conn->incoming_buffer_base);

        /*
         * Determine the size of the packet that we are going to send next.
         */

        if (conn->bytes_left_to_send > MAX_CLIENT_PACKET - LM_HEADER_SIZE)
                packet_byte_count = MAX_CLIENT_PACKET;
        else packet_byte_count = conn->bytes_left_to_send + LM_HEADER_SIZE;

        /*
         * Set the appropriate byte count in the packet to be sent.
         */
        BYTE_COUNT(conn->outgoing_buffer_pointer) = packet_byte_count;

        /*
         * Send the next part of the reply to the address in conn.
         */
        if (send_packet(conn, conn->outgoing_buffer_pointer) != SUCCESS) {
                return(FAILURE);
        }

        /*
         * Set the number of bytes that we have left to send.
         */
        conn->bytes_left_to_send -= packet_byte_count - LM_HEADER_SIZE;

        /*
         * Set the outgoing buffer pointer to the beginning of
         * the next part of the reply that will be sent.
         */
        conn->last_outgoing_buffer_pointer = conn->outgoing_buffer_pointer;
        conn->outgoing_buffer_pointer += packet_byte_count + P_HEADER_SIZE - LM_HEADER_SIZE;

        /*
         * Check for having sent all of the reply.
         */
        if (conn->bytes_left_to_send == 0) {
                /* Reset the am currently sending reply flag. */
                conn->am_sending = FALSE;
        }

        return(SUCCESS);
}


u_short
lm_receive_request(conn)
register        CONNECTION      *conn;
{
        if (conn->am_receiving == FALSE) {

                /* If the modeler has received the whole request but is
                 * still working on the reply then we should throw away
                 * all packets coming in from the client and make sure
                 * that we don't overwrite the incoming buffer.
                 */
                if (conn->am_processing == TRUE) {
                        if (receive_packet(conn, dump_area) != SUCCESS) {
                                return(FAILURE);
                        }
                        return(SUCCESS);
                }

                /*
                ** Receive the request packet from the address in conn.
                */
                if (receive_packet(conn, conn->incoming_buffer_base) != SUCCESS) {
                        return(FAILURE);
                }

                if (SEQUENCE_NUMBER(conn->incoming_buffer_base) != conn->header.sequence_number) {
                        if (print_sequence_mismatches == TRUE) {
                                vprintf("MMS#2, %d, %d, %d\n",
                                        conn->fd,
                                        SEQUENCE_NUMBER(conn->incoming_buffer_base),
                                        conn->header.sequence_number
                                );
                        }
                        if (SEQUENCE_NUMBER(conn->incoming_buffer_base) + 1 == conn->header.sequence_number) {
                                if (conn->am_processing == FALSE) {
                                        *(PACKET_HEADER *) conn->incoming_buffer_base =
                                                *(PACKET_HEADER *) conn->outgoing_buffer_base;
                                        BYTE_COUNT(conn->incoming_buffer_base) = sizeof(LM_HEADER);
                                        if (send_packet(conn, conn->last_outgoing_buffer_pointer) != SUCCESS)
                                                return(FAILURE);
                                }
                                return(SUCCESS);
                        }
                        else {
                                return(FAILURE);
                        }
                }

                conn->header.sequence_number++;

                /*
                ** Overlay a packet header on the request to check for a partial request.
                */
                if (PARTIAL_PACKET_COUNT(conn->incoming_buffer_base) != 0) {
                        /*
                        ** We have not received all of the request.  Set up,
                        ** check, and acknowledge the first part of the request.
                        */
                        if (handle_first_part_of_request(conn) != SUCCESS) {
                                return(FAILURE);
                        }
                        return(PARTIAL_REQUEST);
                }

                /*
                ** Properly set up the incoming and outgoing
                ** buffers for the upper software layers.
                */
                LM_RESET_INCOMING(conn);
                LM_RESET_OUTGOING(conn);
                LM_SET_END_INCOMING(conn);

                return(FULL_REQUEST);
        }
```

Copyright 1989 Logic Modeling Systems

SOURCE PROGRAM networkm/net_srv.c | DATE 5/23/89 | TIME 4:42:06 pm | PAGE # 4/4

LINE # SOURCE TEXT

```
        else {
                /* Am receiving a partial request.  The first part of   */
                /* the request has already been received and is present */
                /* in conn->incoming_buffer_base.  Go get the next       */
                /* part of the request.  This may or may not be the      */
                /* last part of the total request.  It's checked below.  */

                return(receive_next_part_of_request(conn));
        }
}


static  u_short
handle_first_part_of_request(conn)
register        CONNECTION      *conn;
{
        register        char    *ptr;
        register        u_long  total_bytes_to_receive;


        /*
         * Set the total number of bytes that will be received.
         */
        total_bytes_to_receive = PARTIAL_PACKET_COUNT(conn->incoming_buffer_base);

        /*
         * Do a sanity check on the buffer size.  If its really big, assume
         * that something BAD has happened in the host software and give up.
         */
        if (total_bytes_to_receive > 2*MAX_REQUEST_SIZE) {
                lm_queue_message(ERROR_MSG, "message is too large(%lu) to receive from the host", total_bytes_to_receive);
                return(FAILURE);
        }

        /*
         * If the incoming message will have a total byte count that is larger
         * than the existing incoming buffer size.  Do a realloc() to the
         * eventual total size of the incoming message.  A temporary pointer is
         * used to maintain the current buffer in case we are out of memory.
         */
        if (total_bytes_to_receive + MAX_SERVER_PACKET > conn->incoming_buffer_size) {

                ptr = realloc(conn->incoming_buffer_base,
                        (unsigned)total_bytes_to_receive + MAX_SERVER_PACKET);

                if (ptr == (char *) NULL) {
                        lm_queue_message(SYS_ERROR_MSG, "out of memory on modeler for incoming messages");
                        return(FAILURE);
                }

                /*
                 ** Update the connection data structure.
                 */
                conn->incoming_buffer_base = ptr;
                conn->incoming_buffer_size = total_bytes_to_receive + MAX_SERVER_PACKET;
        }

        /*
         * Set the partial request receive indicator.
         */
        conn->am_receiving = TRUE;
        conn -> am_timing_out = TRUE;
        conn -> time_to_live = (lm_tick * 5) + network_timeout;

        /*
         * Set the number of bytes that we have left to receive.
         */
        conn->bytes_left_to_receive = total_bytes_to_receive - BYTE_COUNT(conn->incoming_buffer_base);

        /*
         * Set the incoming buffer pointer to the end of the just received partial request.
         */
        conn->incoming_buffer_pointer = conn->incoming_buffer_base + BYTE_COUNT(conn->incoming_buffer_base) + P_HEADER_SIZE - LM_HEADER_SIZE;

        /*
         * Do a structure assignment to set the current packet header as a
         * modeler acknowledgement for receiving the partial packet request.
         */
        /* FIXIT: too much is getting copied. */
        *(PACKET_HEADER *) conn->outgoing_buffer_base = *(PACKET_HEADER *) conn->incoming_buffer_base; /* COPY */

        /*
         * Adjust the byte count in the acknowledge.
         */
        BYTE_COUNT(conn->outgoing_buffer_base) = LM_HEADER_SIZE;

        /*
         * Send the acknowledgement to the address in conn.
         */
        if (send_packet(conn, conn->outgoing_buffer_base) != SUCCESS) {
                return(FAILURE);
        }

        return(SUCCESS);
}


static  u_short
receive_next_part_of_request(conn)
register        CONNECTION      *conn;
{
        register        char    *buffer_ptr;

        PACKET_HEADER   temporary; /* COPY */


        /*
         * Note that upon entering this routine the incoming buffer already
         * contains the first part of the multiple message that is being received.
         */

        /*
         * Initialize our local buffer pointer to the existing incoming buffer
         * pointer, but back up enough to allow us to overlay a new packet
         * header structure for the next received packet.
         * NOTE: this will trash part of the incoming message, but we
         * will save and later restore that "trashed" data.
         */

        buffer_ptr = conn->incoming_buffer_pointer - P_HEADER_SIZE;
```

Copyright 1989 Logic Modeling Systems

| SOURCE PROGRAM | DATE | PAGE # |
|---|---|---|
| networkm/net_srv.c | 5/23/89 | 5/5 |
| | TIME 4:42:06 pm | |

LINE # SOURCE TEXT

```
        /*
         * Do a structure assignment to save the last P_HEADER_SIZE
         * bytes so that they can be restored after the next incoming packet
         * is received and its header processed.
         */
        temporary = *(PACKET_HEADER *) buffer_ptr; /* COPY */

        /*
         * Receive the request packet from the address in conn.
         */
        if (receive_packet(conn, buffer_ptr) != SUCCESS) {
                return(FAILURE);
        }

        /* check the incoming packet sequence number if it is a duplicate packet */
        /* generate a new reply  */

        if (SEQUENCE_NUMBER(buffer_ptr) != conn->header.sequence_number) {
                if (print_sequence_mismatches == TRUE) {
                        vprintf("MMS#3, %d, %d, %d\n",
                                conn->fd,
                                SEQUENCE_NUMBER(buffer_ptr),
                                conn->header.sequence_number
                        );
                }
                if (SEQUENCE_NUMBER(buffer_ptr) + 1 == conn->header.sequence_number) {
                        if (conn->am_processing == FALSE) {
                                *(PACKET_HEADER *)conn->outgoing_buffer_base = *(PACKET_HEADER *)buffer_ptr;
                                BYTE_COUNT(conn->outgoing_buffer_base) = LM_HEADER_SIZE;
                                *(PACKET_HEADER *)buffer_ptr = temporary;
                                if (send_packet(conn, conn->outgoing_buffer_base) != SUCCESS)
                                        return(FAILURE);
                        }
                        conn -> am_timing_out = TRUE;
                        conn -> time_to_live = (lm_tick * 5) + network_timeout;
                        return(PARTIAL_REQUEST);
                } else {
                        return(FAILURE);
                }
        }

        conn->header.sequence_number++;

        /*
         * Set the number of bytes that we have left to receive.
         */
        conn->bytes_left_to_receive -= BYTE_COUNT(buffer_ptr) - LM_HEADER_SIZE;
        /*
         * Check for having received all of the request.
         */
        if (conn->bytes_left_to_receive == 0) {
                /* generate a new reply  */

                /*
                ** Reset the am currently receiving request flag.
                */
                conn->am_receiving = FALSE;

                /*
                ** Set the total number of bytes in the entire incoming message.
                */
                BYTE_COUNT(conn->incoming_buffer_base) = PARTIAL_PACKET_COUNT(conn->incoming_buffer_base);
                SEQUENCE_NUMBER(conn->incoming_buffer_base) = SEQUENCE_NUMBER(buffer_ptr);

                /*
                 * Restore the bytes that were saved above and
                 * trashed during the message reception.
                 */
                *(PACKET_HEADER *)buffer_ptr = temporary; /* COPY */

                /*
                ** Properly set up the incoming and outgoing
                ** buffers for the upper software layers.
                */

                LM_RESET_INCOMING(conn);
                LM_RESET_OUTGOING(conn);
                LM_SET_END_INCOMING(conn);

                return(FULL_REQUEST);
        }
        else {
                /*
                ** Set the incoming buffer pointer to the end of the just received partial request.
                */

                conn->incoming_buffer_pointer += BYTE_COUNT(buffer_ptr) - LM_HEADER_SIZE;

                /*
                ** Do a structure assignment to save the current packet header as a
                ** modeler acknowledgement for receiving the partial packet reply.
                */
                /* FIXIT: too much is getting copied. */
                *(PACKET_HEADER *) conn->outgoing_buffer_base = *(PACKET_HEADER *) buffer_ptr; /* COPY */

                /*
                ** Adjust the byte count in the acknowledge.
                */
                BYTE_COUNT(conn->outgoing_buffer_base) = LM_HEADER_SIZE;

                /*
                 * Restore the bytes that were saved above and
                 * trashed during the message reception.
                 */
                *(PACKET_HEADER *)buffer_ptr = temporary; /* COPY */

                /*
                ** Send the acknowledgement to the address in conn.
                */
                if (send_packet(conn, conn->outgoing_buffer_base) != SUCCESS) {
                        return(FAILURE);
                }
                conn -> am_timing_out = TRUE;
                conn -> time_to_live = (lm_tick * 5) + network_timeout;
                return(PARTIAL_REQUEST);
        }
}
```

Copyright 1989 Logic Modeling Systems

| SOURCE PROGRAM | DATE | PAGE # |
|---|---|---|
| networkm/net_srv.c | 5/23/89 | 6/6 |
| | TIME 4:42:06 pm | |

LINE # SOURCE TEXT

```
static  u_short
receive_packet(conn, packet)
register        CONNECTION      *conn;
register        char    *packet;
{
        int     sock_size;      /* can not be made storage class register */

        register        int     rcnt;
#ifndef MODELER
        register        int     byte_count = 0;
#endif

        register        char    *buffer_ptr;


        /*
         * Initialize the receive buffer pointer and socket size.
         */
        buffer_ptr = packet;
        sock_size = SOCK_SIZE;

        /*
         * Loop until we receive all the packet, incrementing
         * buffer_ptr and byte_count as we go.
         */

#ifndef MODELER
        do {
                rcnt = recvfrom(conn->fd, buffer_ptr, MAX_SERVER_PACKET, 0, (struct sockaddr *)&conn->sock, &sock_size);
                if (rcnt <= 0) {
                        lm_queue_message(SYS_ERROR_MSG, "failure to receive any bytes from the modeler");
                        return(FAILURE);
                }

                byte_count += rcnt;
                buffer_ptr += rcnt;
        } while(byte_count != BYTE_COUNT(packet));   /* Don't stop until we have all the bytes. */
#else
        rcnt = recvfrom(conn->fd, buffer_ptr, MAX_SERVER_PACKET, 0, (struct sockaddr *)&conn->sock, &sock_size);
        if (rcnt <= 0) {
                lm_queue_message(SYS_ERROR_MSG, "failure to receive any bytes from the modeler");
                return(FAILURE);
        }

        if ((SEQUENCE_NUMBER(packet) != conn->header.sequence_number) &&
                (0 == SEQUENCE_NUMBER(packet)))  {

                reset_network_connection (conn);
                return(FAILURE);
        }

        if (rcnt != BYTE_COUNT(packet)) {
                lm_queue_message(SYS_ERROR_MSG, "failure to receive expected number of bytes from the modeler(%d, %d)", rcnt, BYTE_COUNT(packe
t));
                return(FAILURE);
        }
#endif

        return(SUCCESS);
}


#ifdef MODELER
void
tx_task()
{
        struct          fifo_entry fifo;

        while( 1 )
        {
                fifo.fifo_no    = TX_FIFO;
                fifo.task       = TRANSMIT_TASK_ID;
                if(fifo_get( &fifo ) == FAILURE)
                {
                        vprintf("failure to get packet from fifo in transmit task\n");
                        continue;
                }
                (void)send_packet_to_host( table_of_conns[ fifo.user  ], fifo.data);
        }
}
#endif

static  u_short
send_packet(conn, packet)
register        CONNECTION      *conn;
register        char    *packet;
{
        /*
         * We unconditionally send the packet to the connected user.  Other routines
         * determine whether the packet actually arrived at its destination.
         */

#ifdef  MODELER
        struct          fifo_entry fifo;

        fifo.user = conn->fd;
        fifo.data = packet;
        fifo.task = NO_TASK;
        fifo.fifo_no = TX_FIFO;
        return(fifo_put( &fifo ));
#else
        return(send_packet_to_host(conn, packet));
#endif
}


static  u_short
send_packet_to_host(conn, packet)
register        CONNECTION      *conn;
register        char    *packet;
{
        register        int     scnt;
        register        int     byte_count;
        /*
         * Set the number of bytes we have to send.
         */

        byte_count = BYTE_COUNT(packet);

        /*
```

Copyright 1989 Logic Modeling Systems

SOURCE PROGRAM: networkm/net_srv.c | DATE 5/23/89 | TIME 4:42:06 pm | PAGE # 7/7

SOURCE TEXT

```
         * Send the packet to the address in conn.
         */

        PROCESS_ID(packet) = conn->header.process_id;
        PARTIAL_PACKET_COUNT(packet) = conn->header.partial_packet_count;

        scnt = sendto(conn->fd, packet, byte_count, UDP_IP_PACKET, (struct sockaddr *)&conn->sock, SOCK_SIZE);

        /*
         * Verify that sendto() sent all the packet bytes.
         */
        if (scnt != byte_count) {
                lm_queue_message(SYS_ERROR_MSG, "failure to send %d bytes to the host, sent %d", byte_count, scnt);
                return(FAILURE);
        }

        return(SUCCESS);
}


u_short
init_socket()
{
        u_char i;
        register        int     fd;
        register        CONNECTION      *conn;


        /*
         * The first and only time this routine is called, set up the base socket
         * that is used for all communication with hosts.  Note that there
         * is not one socket per host connection, only one socket for all
         * connections.  This is made possible because of recvfrom(...MSG_PEEK,,);
         */


        conn = &base_conn;

        /*
         * Create a datagram socket for communication.
         */
        if ((fd=socket(AF_INET, SOCK_DGRAM, 0)) < 0) {
                lm_queue_message(SYS_ERROR_MSG, "could not create modeler communication endpoint(socket)");
                return(FAILURE);
        }

        /*
         * Save the opened socket file descriptor, set the network family type
         * to internet, set the receiving port to be that of the modeler, and
         * set the address to look for requests from any address.
         */
        conn->fd = fd;
        conn->sock.family = AF_INET;
        conn->sock.port = MODELERS_ETHERNET_PORT;
        conn->sock.address = INADDR_ANY;

        /*
         * Bind the socket file descriptor to only (and always) look
         * as was set up above.
         */
        if (bind(fd, (struct sockaddr *)&conn->sock, SOCK_SIZE) < 0) {
                lm_queue_message(SYS_ERROR_MSG, "could not bind modeler communication endpoint(socket)");
                return(FAILURE);
        }

        /*
         * Initialize the table of connections to contain no users.
         */
        for( i = 0; i < MAX_USERS; i++ ) {
                table_of_conns[i] = (CONNECTION *) NULL;
        }

        return(SUCCESS);
}


static u_short
check_for_daemon_msg( buffer )
char    *buffer;
{
        register        CONNECTION      *conn;
        register        CONNECTION      **conn_table;
        register        UDP_HEADER      *udp_header;
        register        IP_HEADER       *ip_header;

        register        u_long  i;
        register        u_long  *ptr;

        u_char  user;
        u_long  proc_id;

        int     rcnt;
        int     sock_size = SOCK_SIZE;
        SOCKET_ADDRESS  sock;


        ip_header = (IP_HEADER *)(buffer + sizeof(ETHERNET_HEADER));
        udp_header = (UDP_HEADER *)(buffer + sizeof(ETHERNET_HEADER) + sizeof(IP_HEADER));

        if(( udp_header -> source_port != boot.internet_socket_number) &&
          ( udp_header -> destination_port != MODELERS_OUT_OF_BAND_PORT ))
                return(FAILURE);

        rcnt = recvfrom(base_conn.fd, dump_area, MAX_SERVER_PACKET, 0, (struct sockaddr *)&sock, &sock_size);
        if (rcnt <= 0) {
                vprintf("failure to receive any bytes from the modeler, port OOB\n");
                return(FAILURE);
        }

        ptr = (u_long *)(dump_area + sizeof( ETHERNET_HEADER ) + sizeof( IP_HEADER ) + sizeof( UDP_HEADER ));
        if( *ptr++ == LMSImsg ) {
                if( *ptr == LMSIlive ) {
                        proc_id = *++ptr;
                        user = *(u_char *)++ptr;
                        if( user < MAX_USERS ) {
                                if( table_of_conns[ user ] != 0 && table_of_conns[ user ]->header.process_id == proc_id ) {
                                        table_of_conns[ user ]->number_of_live_retries = 0;
                                        table_of_conns[ user ]->time_to_live = (lm_tick * 5) + network_timeout;
                                }
                                else vprintf("LMSIlive proc ids did not match %d, %d\n", proc_id, user);
```

Copyright 1989
Logic Modeling Systems

SOURCE PROGRAM networkm/net_srv.c | DATE 5/23/89 | TIME 4:42:06 pm | PAGE # 8/8

SOURCE TEXT

```
                        }
                        else vprintf("LMSIlive user number out of range\n");
                }
                else if( *ptr == LMSIdead ) {
                        proc_id = *++ptr;
                        user = *(u_char *)++ptr;
                        if( user < MAX_USERS ) {
                                if(table_of_conns[ user ] != 0 &&  table_of_conns[ user ]->header.process_id == proc_id ) {

#ifdef  DIAGS
                                        abort_user( user );
                                        return(close_connection_for_server( table_of_conns[ user ]));

#else
                                        lm_dead_user_mask |= 1 << user;

#endif  DIAGS
                                }
                                else vprintf("LMSIdead proc ids did not match %d, %d\n", proc_id, user);

                        }
                        else vprintf("LMSIdead user number out of range\n");

                }
                else if( *ptr == LMSIkill ) {
                        proc_id = *++ptr;
                        user = *(u_char *)++ptr;
                        conn_table = &table_of_conns[ 0 ];
                        for( i = 0; i < MAX_USERS; i++) {
                                conn = *conn_table++;
                                if( (conn != 0) && (conn->header.process_id == proc_id) &&
                                    (conn->sock.address == ip_header->source_address) ) {
                                        vprintf("LMSIkill user %d\n", i);

#ifdef  DIAGS
                                        abort_user( user );
                                        return(close_connection_for_server( table_of_conns[ user ]));

#else
                                        lm_dead_user_mask |= 1 << user;

#endif  DIAGS
                                }

                        }

                }

        }
        return( SUCCESS );
}

u_short
lm_choose_connection(ret_user)
u_char  *ret_user;
{
        u_char user, new_user;
        u_short rts;
        int     sock_size;

        CONNECTION      *rts_conn;

#ifdef MODELER
        struct fifo_entry fifo;
#endif
        char    my_buffer[P_HEADER_SIZE];


        while(1) {
                /*
                 * Peek at the data on the incoming socket.  No data is actually read, the
                 * purpose is to obtain the source address of the next available request.
                 */
                sock_size = SOCK_SIZE;
                if (recvfrom(base_conn.fd, my_buffer, P_HEADER_SIZE, MSG_PEEK, (struct sockaddr *)&base_conn.sock, &sock_size) <= 0) {
                        vprintf("recvfrom() error while choosing connection\n");
                        (void)recvfrom(base_conn.fd, my_buffer, P_HEADER_SIZE, 0, (struct sockaddr *)&base_conn.sock, &sock_size);
                        return(FAILURE);
                }

                if(check_for_daemon_msg( my_buffer ) == SUCCESS )
                        continue;
                /*
                 * Find or create a connection for the just peeked at message.
                 */
                if (find_or_create_a_connection( &base_conn, &rts_conn, &user, &new_user) != SUCCESS) {
                        /* Clean up the new garbage network packet peeked at above. */
                        if (recvfrom(base_conn.fd, dump_area, MAX_SERVER_PACKET, 0, (struct sockaddr *)&base_conn.sock, &sock_size) <= 0) {
                                vprintf("failure to receive any bytes from the modeler, port CON\n");
                        }
                        return(FAILURE);
                }
                if( new_user ) {
                        table_of_conns[ user ]->header.process_id = PROCESS_ID( my_buffer );
                }

                *ret_user = user;
                if( rts_conn -> am_sending == TRUE ) {
                        return(PENDING);
                }
                else {
                        rts = lm_receive_request(rts_conn);
                        if ((rts == FULL_REQUEST)
                            && ((rts_conn->am_closing == TRUE)
                            || (rts_conn->do_close == TRUE)))
                        {
                                return( FAILURE );
                        }
                        if (rts == FULL_REQUEST) {
                                rts_conn->am_processing = TRUE;
#ifdef MODELER
                                fifo.fifo_no = RX_FIFO;
                                fifo.data = (char *) rts_conn;
                                fifo.user = user;
                                fifo.task = RECEIVE_TASK_ID;

#ifdef DIAGS
                                diag_fifo_put( &fifo ); /* for RX_FIFO */

#else DIAGS
                                fifo_put( &fifo );

#endif DIAGS
#endif
                                return( SUCCESS );
                        }

                        if (rts == FAILURE) {
                                if (new_user) {
                                        (void) close_connection_for_server(rts_conn);
                                }
                                return( FAILURE );
                        }
                }
```

Copyright 1989
Logic Modeling Systems

SOURCE PROGRAM
networkm/net_srv.c

DATE 5/23/89
TIME 4:42:06 pm
PAGE # 9/9

LINE # SOURCE TEXT

```
        }
}


static  u_short
find_or_create_a_connection(base_conn, rts_conn, user, new_user)
register        CONNECTION      *base_conn;
register u_char *user, *new_user;
CONNECTION      **rts_conn ;
{

        register        CONNECTION      *conn;
        register        CONNECTION      *new_conn;

        register        CONNECTION      **conn_table;

        register        u_char          i;
        register        u_char          next_free = MAX_USERS+1;
        register        u_char          active_users_found;
        u_long command;

        static char string[] = "Exceed maximum number of users on the modeler";
        char *string_ptr = string;


        *new_user = 0;
        /*
         * A three part process exists to find a connection struct
         * to return to the higher level procedure.
         */

        /*
         * 1. If there are no active users, make the first connection
         *    structure and use it.
         */
        if ( active_users == 0 ) {
                *new_user = 1;
                if ((conn=(CONNECTION *) malloc(sizeof(CONNECTION))) == (CONNECTION *) NULL) {
                        lm_queue_message(SYS_ERROR_MSG, "out of memory on modeler for network connections");
                        return(FAILURE);
                }

                /* Initialise the new connection.          */
                if (init_connection_for_server(conn) != SUCCESS) {
                        free((char *)conn);
                        return(FAILURE);
                }

                /* Set up the proper connection values. */
                conn->fd = base_conn->fd;
                conn->sock.family = base_conn->sock.family;
                conn->sock.port = base_conn->sock.port;
                conn->sock.address = base_conn->sock.address;
                conn->sock.packet_type = base_conn->sock.packet_type;
                conn->sock.destination[0] = base_conn->sock.destination[0];
                conn->sock.destination[1] = base_conn->sock.destination[1];
                conn->sock.destination[2] = base_conn->sock.destination[2];
                conn->sock.destination[3] = base_conn->sock.destination[3];
                conn->sock.destination[4] = base_conn->sock.destination[4];
                conn->sock.destination[5] = base_conn->sock.destination[5];

                conn->header.process_id = base_conn->header.process_id;

                *user = 0;
#ifdef  MODELER
                conn->fd = *user;
#endif
                table_of_conns [ *user ] = conn;

                ++active_users;
                *rts_conn = conn;

                return(SUCCESS);
        }

        /*
         * 2. Must already have active users.  Look through the current
         *    list of connections for a matching port and address.
         */
        conn_table = &table_of_conns[ 0 ];
        active_users_found = active_users;
        for( i = 0; i < MAX_USERS; ++i ) {
                conn = *conn_table++;
                if(conn != (CONNECTION *) NULL) {
                        --active_users_found;
                        if ( (conn->sock.port == base_conn->sock.port) &&
                             (conn->sock.address == base_conn->sock.address) )
                        {
                                *user = i;
#ifdef  MODELER
                                conn->fd = *user;
                                conn -> am_timing_out = FALSE;
                                conn -> number_of_live_retries = 0;
#endif
                                *rts_conn = conn;

                                return(SUCCESS);
                        }

                }
                else {
                        if( next_free == MAX_USERS+1 )
                                next_free = i;
                }
                /*
                ** we found all the active users there are
                ** make sure we know next free location
                */
                if (active_users_found == 0) {
                        if( next_free == MAX_USERS+1 )
                                next_free = i+1;
                        break;
                }
        }

        /*
        ** we have max users already
        */
        if (active_users == MAX_USERS) {
                lm_queue_message(ERROR_MSG, "exceeded maximum number of users, %d, on the modeler", MAX_USERS);
```

Copyright 1989 Logic Modeling Systems

SOURCE PROGRAM networkm/net_srv.c

DATE 5/23/89 TIME 4:42:06 pm PAGE # 10/10

SOURCE TEXT

```
                if( set_up_out_of_luck_user(base_conn) == FAILURE )
                        return( FAILURE );

                new_conn = table_of_conns[ MAX_USERS ];
                /*
                ** put the packet
                */
                if (receive_packet(new_conn, new_conn->incoming_buffer_base) != SUCCESS) {
                        (void) close_connection_for_server( new_conn );
                        return(FAILURE);
                }
                /*
                ** put a message to transmit.
                */
                LM_RESET_INCOMING(new_conn);
                LM_RESET_OUTGOING(new_conn);
                command = LM_GET_LONG( new_conn );
                command++;
                LM_PUT_LONG( new_conn, command);

                LM_PUT_LONG( new_conn, 1 );
                LM_PUT_CHAR( new_conn, ERROR_MSG );
                while( *string_ptr )
                {
                        LM_PUT_CHAR( new_conn, *string_ptr++ );
                }
                LM_PUT_CHAR( new_conn, 0);
                /*
                ** put msg to transmit in fifo.
                */
                ( void ) lm_send_reply( new_conn );
                /*
                ** set close connection for server
                */
                (void) set_close_connection_for_server( new_conn );
                return(FAILURE);
        }

        /*
         * 3. Must be a brand new connection.  Create a new connection
         *    structure, initialize that structure, add the new connection
         *    into the connection table, and use it.
         */

        *new_user = 1;
        if ((new_conn = (CONNECTION *) malloc(sizeof(CONNECTION))) == (CONNECTION *) NULL) {
                lm_queue_message(SYS_ERROR_MSG, "out of memory on modeler for network connections");
                return(FAILURE);
        }
        /*
         * Initialize the new connection.
         */
        if (init_connection_for_server(new_conn) != SUCCESS) {
                free((char *)new_conn);
                return(FAILURE);
        }
        /*
         * Set up the proper connection values.
         */
        new_conn->fd = base_conn->fd;
        new_conn->sock.family = base_conn->sock.family;
        new_conn->sock.port = base_conn->sock.port;
        new_conn->sock.address = base_conn->sock.address;
        new_conn->sock.packet_type = base_conn->sock.packet_type;
        new_conn->sock.destination[0] = base_conn->sock.destination[0];
        new_conn->sock.destination[1] = base_conn->sock.destination[1];
        new_conn->sock.destination[2] = base_conn->sock.destination[2];
        new_conn->sock.destination[3] = base_conn->sock.destination[3];
        new_conn->sock.destination[4] = base_conn->sock.destination[4];
        new_conn->sock.destination[5] = base_conn->sock.destination[5];

        new_conn->header.process_id = base_conn->header.process_id;

        *user = next_free;
#ifdef  MODELER
        new_conn->fd = *user;
#endif
        table_of_conns[ *user ] = new_conn;

        ++active_users;
        *rtn_conn = new_conn;

        return(SUCCESS);
}


u_short
close_connection_for_server(conn)
register        CONNECTION      *conn;
{

        /*
         * WARNING: if you change this routine check reset_network_connection()
         *          to see if the same changes are needed there.
         */


#ifndef MODELER
        register        u_char  i;

        register        CONNECTION      *next_conn;
        register        CONNECTION      **conn_table;
#endif


        /*
        ** The users > MAX_USERS are not real users.
        ** They are used to send messages back to the host.
        */
        if( conn->fd < MAX_USERS )
                --active_users;
        (void) free(conn->incoming_buffer_base);
        (void) free(conn->outgoing_buffer_base);

#ifdef MODELER
        /*
         * On the modeler the file descriptor is the index into the connection
         * table, therefore, we don't need to look through the table to find
         * what needs to be closed/cleaned-up.
         */
```

Copyright 1989 Logic Modeling Systems

SOURCE PROGRAM networkm/net_srv.c | DATE 5/23/89 | TIME 4:42:06 pm | PAGE # 11/11

SOURCE TEXT

```
        if (close(conn->fd) != 0) {
                lm_queue_message(SYS_ERROR_MSG, "failure to close modeler communication endpoint(socket)");
                return(FAILURE);
        }

        return(SUCCESS);
#else
        /*
        ** search thru table of connections, and delete appropriate
        ** connection.
        */
        conn_table = &table_of_conns[ 0 ];
        for( i = 0; i < MAX_USERS; ++i ) {
                next_conn= *conn_table++;
                if(next_conn != (CONNECTION *) NULL) {
                        if ( (conn->sock.port == next_conn->sock.port) &&
                             (conn->sock.address == next_conn->sock.address) )
                        {
                                (void) free((char *)table_of_conns[i]);
                                table_of_conns[i] = (CONNECTION *) NULL;
                                return(SUCCESS);
                        }
                }
        }
        vprintf("could not find user to close\n");

        return(FAILURE);
#endif
}


static  u_short
init_connection_for_server(conn)
register        CONNECTION      *conn;
{
        /*
         * WARNING: if you change this routine check reset_network_connection()
         *          to see if the same changes are needed there.
         */


        /*
         * Set default values into the packet header construct that is
         * used to track the state of the host communication.
         */
        conn->header.byte_count = -1;
        conn->header.process_id = -1;
        conn->header.sequence_number = 1;
        conn->header.partial_packet_count = 0;

        /*
         * Initialize the partial packet indicators.  (Technically, these don't
         * need to be initialized for the client as the client never references
         * them, but what the heck - let's be consistent and init everywhere.)
         */
        conn->am_sending = FALSE;
        conn->bytes_left_to_send = 0;
        conn->am_receiving = FALSE;
        conn->bytes_left_to_receive = 0;
        conn->am_closing = FALSE;
        conn->do_close = FALSE;
        conn->am_timing_out = FALSE;
        conn->time_at_last_response = lm_tick;
        conn->time_to_live = 0;
        conn->am_processing = FALSE;

        /*
         * Set the incoming buffer time, end of current message,
         * buffer size, and allocate memory space to receive messages.
         */
        conn->incoming_time = 0;
        conn->incoming_buffer_size = 2*MAX_SERVER_PACKET;
        if ((conn->incoming_buffer_base = malloc(2*MAX_SERVER_PACKET)) == (char *) NULL) {
                lm_queue_message(SYS_ERROR_MSG, "out of memory on modeler for incoming messages");
                return(FAILURE);
        }
        conn->incoming_message_end = conn->incoming_buffer_base;

        /*
         * Initialize the incoming buffer pointer properly.
         */
        LM_RESET_INCOMING(conn);

        /*
         * Set the outgoing buffer time, end of buffer,
         * buffer size, and allocate memory space to send messages.
         */
        conn->outgoing_time = 0;
        conn->outgoing_buffer_size = MAX_SERVER_PACKET;
        if ((conn->outgoing_buffer_base = malloc(MAX_SERVER_PACKET)) == (char *) NULL) {
                free((char *)conn->incoming_buffer_base);
                lm_queue_message(SYS_ERROR_MSG, "out of memory on modeler for outgoing messages");
                return(FAILURE);
        }
        conn->outgoing_buffer_end = conn->outgoing_buffer_base + conn->outgoing_buffer_size;

        /*
         * Initialize the outgoing buffer pointer properly.
         */
        LM_RESET_OUTGOING(conn);

        return(SUCCESS);
}


reset_network_connection (conn)
        CONNECTION      *conn;

{
        /*
         *  This routine completely resets the conn structure.
         *  Note that most of the code has been plagerized from
         *  close_conn_for_server() and init_conn_for_server()
         *  If either of these routines changes, check to see that
         *  this code does not need to be changed.
         *  These routines were not called directly for 2 reasons:
         *  1) The user number could change, and 2) if there are
         *  the maximum number of users on the modeler the init
         *  could fail and the connection would be lost.
         */
```

Copyright 1989
Logic Modeling Systems

SOURCE PROGRAM networkm/net_srv.c

DATE 5/23/89 TIME 4:42:06 pm PAGE # 12/12

SOURCE TEXT

```
        (void) free(conn->incoming_buffer_base);
        (void) free(conn->outgoing_buffer_base);

        /*
         * set default values into the packet header construct that is
         * used to track the state of the host communication.
         */

        conn->header.byte_count = -1;
        conn->header.sequence_number = 1;
        conn->header.partial_packet_count = 0;

        /*
         * Initialize the partial packet indicators.  (Technically, these don't
         * need to be initialized for the client as the client never references
         * them, but what the heck - let's be consistent and init everywhere.)
         */

        conn->am_sending = FALSE;
        conn->bytes_left_to_send = 0;
        conn->am_receiving = FALSE;
        conn->bytes_left_to_receive = 0;
        conn->am_timing_out = TRUE;
        conn->time_at_last_response = lm_tick;
        conn -> time_to_live = (lm_tick * 5) + network_timeout;
        conn->am_processing = FALSE;

        /*
         * Set the incoming buffer time, end of current message,
         * buffer size, and allocate memory space to receive messages.
         */

        conn->incoming_time = 0;
        conn->incoming_buffer_size = 2*MAX_SERVER_PACKET;
        if ((conn->incoming_buffer_base = malloc(2*MAX_SERVER_PACKET)) == (char *) NULL) {
                lm_queue_message(SYS_ERROR_MSG, "out of memory on modeler for incoming messages");
                return(FAILURE);
        }
        conn->incoming_message_end = conn->incoming_buffer_base;

        /*
         * Initialize the incoming buffer pointer properly.
         */

        LM_RESET_INCOMING(conn);

        /*
         * Set the outgoing buffer time, end of buffer,
         * buffer size, and allocate memory space to send messages.
         */

        conn->outgoing_time = 0;
        conn->outgoing_buffer_size = MAX_SERVER_PACKET;
        if ((conn->outgoing_buffer_base = malloc(MAX_SERVER_PACKET)) == (char *) NULL) {
                free((char *)conn->incoming_buffer_base);
                lm_queue_message(SYS_ERROR_MSG, "out of memory on modeler for outgoing messages");
                return(FAILURE);
        }

        conn->outgoing_buffer_end = conn->outgoing_buffer_base + conn->outgoing_buffer_size;

        /*
         * Initialize the outgoing buffer pointer properly.
         */

        LM_RESET_OUTGOING(conn);

        return(SUCCESS);

}


#ifdef  MODELER
int
close(fd)
int     fd;
{
        if (table_of_conns[fd] != (CONNECTION *) NULL) {
                (void) free((char *)table_of_conns[fd]);
                table_of_conns[fd] = (CONNECTION *) NULL;
                return(0);
        }

        return(-1);
}


int
socket(family, type, protocol)
int     family;
int     type;
int     protocol;
{
        /*
         * The modeler does not use the file descriptor that the UNIX socket(2)
         * call returns.  Just return "1", which means success by the UNIX definition.
         */
        return(1);
}


int
bind(fd, scket, size)
int     fd;
struct  sockaddr        *scket;
int     size;
{
        /*
         * The modeler does not use any thing that the UNIX bind(2) call returns
         * or sets.  Just return "0", which means success by the UNIX definition.
         */
        return(0);
}
#endif


u_short
set_close_connection_for_server(conn)
register        CONNECTION      *conn;
```

Copyright 1989
Logic Modeling Systems

SOURCE PROGRAM networkm/net_srv.c

DATE 5/23/89 TIME 4:42:06 pm PAGE # 13/13

SOURCE TEXT

LINE #

```
{
        if( conn -> am_closing == TRUE)
                return( FAILURE);
        conn -> am_closing = TRUE;
        return( SUCCESS );
}

u_short
check_connection_for_life( conn )
CONNECTION *conn;
{
        SOCKET_ADDRESS sock;
        int scnt;

        LM_RESET_RAW_TX_BUFFER((char) conn->fd);
        LM_PUT_CHAR_TX_BUFFER('L');
        LM_PUT_CHAR_TX_BUFFER('M');
        LM_PUT_CHAR_TX_BUFFER('S');
        LM_PUT_CHAR_TX_BUFFER('I');
        LM_PUT_CHAR_TX_BUFFER('p');
        LM_PUT_CHAR_TX_BUFFER('r');
        LM_PUT_CHAR_TX_BUFFER('o');
        LM_PUT_CHAR_TX_BUFFER('c');
        LM_PUT_LONG_TX_BUFFER( conn -> header.process_id );
        LM_PUT_CHAR_TX_BUFFER((char) conn->fd );

        sock = conn->sock;
        sock.port=host.internet_socket_number;
        scnt = sendto(0, tx_buffer[conn->fd], LM_TX_BYTECOUNT((char) conn->fd),UDP_IP_PACKET, (struct sockaddr *)&sock, sizeof( SOCKET_ADDRESS
         ));
        if( scnt < 12)
        {
                vprintf("failure to transmit LMSIproc packet to host\n");
                return( FAILURE );
        }
        return( SUCCESS );
}


#ifdef  DIAGS
abort_user(user)
{
        /*
        ** do not abort if running diags
        */
        return;
}
#else
#include "device.h"
#include "hardware.h"
#include "eeprom.h"
#include "lmserver.h"

abort_user_number(userno)
u_char  userno;
{
   abort_user(user_info_array[userno]);
}
#endif  DIAGS


static u_short
set_up_out_of_luck_user(base_conn)
register        CONNECTION      *base_conn;
{
register CONNECTION     *new_conn;
                /*
                ** is the extra user currently in use
                */
                if(table_of_conns[ MAX_USERS ] != (CONNECTION *) NULL)
                {
                        return( FAILURE );

                }
                if ((new_conn = (CONNECTION *) malloc(sizeof(CONNECTION))) == (CONNECTION *) NULL) {
                        lm_queue_message(SYS_ERROR_MSG, "out of memory on modeler for network connections");
                        return(FAILURE);
                }
                /*
                 * Initialize the new connection.
                 */
                if (init_connection_for_server(new_conn) != SUCCESS) {
                        return(FAILURE);

                }
                /*
                 * Set up the proper connection values.
                 */
                new_conn->fd = (int)MAX_USERS;
                new_conn->sock.family = base_conn->sock.family;
                new_conn->sock.port = base_conn->sock.port;
                new_conn->sock.address = base_conn->sock.address;
                new_conn->sock.packet_type = base_conn->sock.packet_type;
                new_conn->sock.destination[0] = base_conn->sock.destination[0];
                new_conn->sock.destination[1] = base_conn->sock.destination[1];
                new_conn->sock.destination[2] = base_conn->sock.destination[2];
                new_conn->sock.destination[3] = base_conn->sock.destination[3];
                new_conn->sock.destination[4] = base_conn->sock.destination[4];
                new_conn->sock.de  ation[5] = base_conn->sock.destination[5];

                new_conn->header.process_id = base_conn->header.process_id;

                /*
                ** if more than 1, extra user this needs to be changed.
                */
                table_of_conns[ MAX_USERS ] = new_conn;
                return( SUCCESS );
}
```

Copyright 1989
Logic Modeling Systems

| SOURCE PROGRAM | DATE 5/23/89 | PAGE # |
|---|---|---|
| networkc/net_com.c | TIME 1:20:44 pm | 1/1 |

SOURCE TEXT

```
/* SCCS_ID: net_com.c rev 3.1, 4/24/89 at 08:02:38 */

#include "common.h"
#include "message.h"
#include "network.h"


void
lm_extend_outgoing_buffer(conn)
CONNECTION      *conn;
{
        register        char    *ptr;
        register        u_long  new_buffer_size;
        register        u_long  previous_pointer_offset;


        /*
         * Save the offset of the current buffer pointer so that it can be restored
         * in the (likely) case that realloc() moves the buffer.
         */
        previous_pointer_offset = (u_long)conn->outgoing_buffer_pointer - (u_long)conn->outgoing_buffer_base;

        /*
         * Calculate the size of the new buffer.
         */
        new_buffer_size = conn->outgoing_buffer_size + OUTGOING_BUFFER_INCREMENT;

        /*
         * Increase the buffer size as calculated above.
         */
        ptr = realloc(conn->outgoing_buffer_base, (unsigned)new_buffer_size);
        if (ptr == (char *)NULL) {
                lm_queue_message(SYS_ERROR_MSG, "error, could not (re)allocate space for outgoing modeler messages");
        }
        else {
                /*
                 * Update all the required pointers and counts.
                 */
                conn->outgoing_buffer_base = ptr;
                conn->outgoing_buffer_pointer = ptr + previous_pointer_offset;

                conn->outgoing_buffer_size = new_buffer_size;
                conn->outgoing_buffer_end = conn->outgoing_buffer_base + conn->outgoing_buffer_size;
        }
}
```

Copyright 1989
Logic Modeling Systems

SOURCE PROGRAM
shellswh/Hprescan.c

DATE 5/23/89
TIME 1:21:08 pm
PAGE # 1/1

SOURCE TEXT

```
/* SCCS_ID: Hprescan.c rev 1.1, 4/24/89 at 08:00:06      */

/*
 * prescanner for HMDL
 */

# include "HMDL.h"
# include "common.h"
# include <stdio.h>

# define BUF_SIZE 1024
# define BUF_INCR 1024
# define MAXFILENAMELEN 128
# define MAXINCLUDEFILENAMELEN 256
# define LM_LIBRARY_VARIABLE "LM_LIB"

extern char *strcpy ( ) ;
static short
  nextc , /* prescanner's lookahead character */
  oldnextc , /* prescanner's lookahead character save space */
static char
  *output , /* pointer into output buffer */
  *source_name , /* source file name */
  *old_name , /* to save source name */
  *source_text , /* pointer to source text */
  directive [ 32 ] , /* name of directive */
  directive2 [ 32 ] , /* another name of directive */
  filename [ MAXFILENAMELEN ] , /* file name buffer */
  includefilename [ MAXINCLUDEFILENAMELEN ] ,
    /* include file name buffer */
static unsigned long
  mark , /* to mark start of token */
  out_index , /* index into output buffer */
  out_length , /* length of output buffer */
static ushort
  malloc_failed , /* to indicate malloc() failure */
  need_filename , /* indicates that a filename must be next */
  lineno , /* current line number */
  oldlineno , /* to save line number */
  oldnewlineno , /* to save new line number */
  newlineno , /* to delay line number incrementing */
  ncluding , /* flag indicating that we are including */
  ccount ; /* comment nesting count */
static FILE *include_file ; /* pointer to include file descriptor */

static void
pregetnext ( )
  /* gets the next character for the pre-scanner */
  { if ( ncluding )
      nextc = getc ( include_file ) ;
    else
      { nextc = *source_text++ ;
        if ( nextc == '\0' )
          nextc = EOF ;
      }
    if ( nextc == '\n' )
      ++newlineno ;
  } /* pregetnext */

void
lm_Hset_prescan_info ( )
  { lm_Hset_lineno ( lineno ) ;
    lm_Hset_input ( source_name ) ;
  } /* lm_Hset_prescan_info */

  /*VARARGS1*/
static void
lerror ( format , arg , arg2 )
  char
    *format ,
    *arg ,
    *arg2 ;
  /* reports other lexical errors via lm_Herror() */
  { lm_Hset_prescan_info ( ) ;
    lm_Herror ( 1 , format , arg , arg2 ) ;
  } /* lerror */

static void
lm_Hlexical_error ( )
  /* reports a lexical error via lm_Herror() */
  { char tmp [ 2 ] ;
    *tmp = nextc ;
    tmp [ 1 ] = '\0' ;
    lm_Hset_lineno ( newlineno ) ;
    lm_Hset_input ( source_name ) ;
    lm_Herror
      ( 1 ,
/*LMSG*/"lexical error: character %s illegal"
        , tmp
      ) ;
  } /* lm_Hlexical_error */

static ushort
is_directive ( str )
  char *str ;
  /* returns 1 iff the passed string is an include directive */
  { if ( strcmp ( str , "physical" ) == 0 )
      return 1 ;
    if ( strcmp ( str , "timing" ) == 0 )
      return 1 ;
    if ( strcmp ( str , "package" ) == 0 )
      return 1 ;
    if ( strcmp ( str , "adapter" ) == 0 )
      return 1 ;
    if ( strcmp ( str , "names" ) == 0 )
      return 1 ;
    if ( strcmp ( str , "options" ) == 0 )
      return 1 ;
    return 0 ;
  } /* is_directive */

static void
get_unquoted_filename ( )
  /* generates into filename the current token, which is unquoted */
  { char
      *str ,
      *fn ;
    str = output + out_index ;
    fn = filename ;
    do
```

Copyright 1989 Logic Modeling Systems

| SOURCE PROGRAM | DATE | PAGE # |
|---|---|---|
| shellswh/Hprescan.c | 5/23/89 | 2/2 |
| | TIME 1:21:08 pm | |

SOURCE TEXT

```
          *fn++ = *str++ ; /* need to make sure it fits */
      while ( *str != '\0' ) ;
      *fn = '\0' ;
    } /* get_unquoted_filename */

static void
get_single_quoted_filename ( )
  /* generates into filename the current token, which is single quoted */
  { char
      *str ,
      *fn ;
    str = output + out_index ;
    ++str ;
    fn = filename ;
    do
      { if ( *str == '\'' )
          ++str ;
        *fn++ = *str ; /* need to make sure it fits */
        if ( *str != '\0' )
          ++str ;
      }
    while ( *str != '\0' ) ;
  } /* get_single_quoted_filename */

static void
get_double_quoted_filename ( )
  /* generates into filename the current token, which is double quoted */
  { char
      *str ,
      *fn ;
    str = output + out_index ;
    ++str ;
    fn = filename ;
    do
      { if ( *str == '"' )
          ++str ;
        *fn++ = *str ; /* need to make sure it fits */
        if ( *str != '\0' )
          ++str ;
      }
    while ( *str != '\0' ) ;
  } /* get_double_quoted_filename */

static void
out_char ( c )
  char c ;
  /* outputs character to output buffer, extending if necessary */
  { static char last_c = ' ' ;
    if ( malloc_failed )
      return ;
    if ( last_c <= ' ' && c <= ' ' && c != '\n' )
      return ;
    if ( out_index == out_length - 2 )
      { output = realloc ( output , ( unsigned ) ( out_length += BUF_INCR ) ) ;
        if ( output == NULL )
          { lm_Eerror
              ( 1 ,
/*LMSG*/"out of memory on host (out_char)"
              ) ;
            malloc_failed = 1 ;
            return ;
          }
      }
    output [ out_index++ ] = c ;
    last_c = c ;
  } /* out_char */

static void
out_control ( line_number , file_name )
  ushort line_number ;
  char *file_name ;
  /* outputs a line control line via out_char() */
  { char
      *ptr ,
      num [ 12 ] ;
    out_char ( '#' ) ;
    out_char ( ' ' ) ;
    ( void ) sprintf ( num , "%u" , line_number ) ;
    for ( ptr = num ; *ptr != '\0' ; ++ptr )
      out_char ( *ptr ) ;
    out_char ( ' ' ) ;
    for ( ; *file_name != '\0' ; ++file_name )
      out_char ( *file_name ) ;
    out_char ( '\n' ) ;
  } /* out_control */

void
lm_Einit_prescan ( name , text )
  char
    *name ,
    *text ;
  /* initializes the prescanner */
  { output = malloc ( ( unsigned ) ( out_length = BUF_SIZE ) ) ;
    if ( output == NULL )
      { lm_Eerror
          ( 1 ,
/*LMSG*/"out of memory on host (lm_Einit_prescan)"
          ) ;
        malloc_failed = 1 ;
      }
    else
      { *output = '\0' ;
        malloc_failed = 0 ;
      }
    out_index = 0 ;
    including = 0 ;
    lineno = 1 ;
    newlineno = 1 ;
    need_filename = 0 ;
    source_name = name ;
    source_text = text ;
    out_control ( lineno , source_name ) ;
    lm_Eset_input ( name ) ;
    lm_Eset_lineno ( lineno ) ;
    pregetnext ( ) ;
  } /* lm_Einit_prescan */

char *
lm_Eprescan ( )
  /* prescan a token from source_text, output it to output buffer */
```

Copyright 1989
Logic Modeling Systems

| SOURCE PROGRAM | DATE | PAGE # |
|---|---|---|
| shellswh/Hprescan.c | 5/23/89 | 3/3 |
| | TIME 1:21:08 pm | |

SOURCE TEXT

```
      { while ( lineno = newlineno , nextc != EOF || ncluding )
          if ( nextc == EOF )
            { ( void ) fclose ( include_file ) ;
              ncluding = 0 ;
              nextc = oldnextc ;
              newlineno = oldnewlineno ;
              lineno = oldlineno ;
              source_name = old_name ;
              out_char ( '\n' ) ;
              out_control ( lineno , source_name ) ;
            }
          else if ( nextc <= ' ' )
            { if ( need_filename == 0 )
                out_char ( nextc ) ;
              pregetnext ( ) ;
            }
          else if
            ( nextc >= 'A' && nextc <= 'Z' ||
              nextc >= 'a' && nextc <= 'z' ||
              nextc == '_'
            )
            { mark = out_index ;
              out_char ( nextc ) ;
              while
                ( ( pregetnext ( ) , nextc ) >= 'A' && nextc <= 'Z' ||
                    nextc >= 'a' && nextc <= 'z' ||
                    nextc >= '0' && nextc <= '9' ||
                    nextc == '_' ||
                    nextc == '.'
                )
                out_char ( nextc ) ;
              output [ out_index ] = '\0' ;
              if ( need_filename )
                { out_index = mark ;
                  get_unquoted_filename ( ) ;
                  goto get_fn ;
                }
              if ( is_directive ( output + mark ) )
                { ( void ) strcpy ( directive2 , output + mark ) ;
                  if ( ncluding )
                    { lerror
                        (
/*LMSG*/"cannot reference %s files from within %s files"
                          , directive2 ,
                          directive
                        ) ;
                      nextc = EOF ;
                      continue ;
                    }
                  ( void ) strcpy ( directive , directive2 ) ;
                  out_index = mark ;
                  need_filename = 1 ;
                  continue ;
                }
              return output + mark ;
            }
          else if ( nextc == '\'' )
            { mark = out_index ;
              do
                { out_char ( '\'' ) ;
                  while
                    ( ( pregetnext ( ) , nextc ) != EOF &&
                        nextc != '\n' && nextc != '\''
                    )
                    out_char ( nextc ) ;
                  if ( nextc == EOF )
                    lerror
                      (
/*LMSG*/"unterminated string: end of file encountered within a single-quoted string"
                      ) ;
                  else if ( nextc == '\n' )
                    lerror
                      (
/*LMSG*/"mismatched quotes: newline encountered within a single-quoted string"
                      ) ;
                  else
                    { out_char ( '\'' ) ;
                      pregetnext ( ) ;
                    }
                }
              while ( nextc == '\'' ) ;
              output [ out_index ] = '\0' ;
              if ( need_filename )
                { out_index = mark ;
                  get_single_quoted_filename ( ) ;
get_fn :
/*save need_filename?*/
                  need_filename = 0 ;
                  if
                    ( ! lm_resolve_library_file
                        ( LM_LIBRARY_VARIABLE ,
                          filename ,
                          includefilename ,
                          sizeof ( includefilename )
                        )
                    )
                    { lerror
                        (
/*LMSG*/"can't resolve %s file %s"
                          , directive ,
                          filename
                        ) ;
                      nextc = EOF ;
                      continue ;
                    }
                  include_file = fopen ( includefilename , "r" ) ;
                  if ( include_file == NULL )
                    { lerror
                        (
/*LMSG*/"can't open %s file %s"
                          , directive ,
                          includefilename
                        ) ;
                      nextc = EOF ;
                      continue ;
                    }
                  ncluding = 1 ;
                  oldnextc = nextc ;
                  oldlineno = lineno ;
                  oldnewlineno = newlineno ;
```

Copyright 1989 Logic Modeling Systems

SOURCE PROGRAM shellswh/Hprescan.c | DATE 5/23/89 | TIME 1:21:08 pm | PAGE # 4/4

SOURCE TEXT

```
              old_name = source_name ;
              source_name = filename ;
              newlineno = lineno = 1 ;
              out_control ( newlineno , source_name ) ;
              pregetnext ( ) ;
              continue ;
            }
          return output + mark ;
        }
      else if ( nextc == '"' )
        { mark = out_index ;
          do
            { out_char ( '"' ) ;
              while
                ( ( pregetnext ( ) , nextc ) != EOF &&
                  nextc != '\n' && nextc != '"'
                )
                out_char ( nextc ) ;
              if ( nextc == EOF )
                lerror
                  (
/*LMSG*/"unterminated string: end of file encountered within a double-quoted string"
                  ) ;
              else if ( nextc == '\n' )
                lerror
                  (
/*LMSG*/"mismatched quotes: newline encountered within a double-quoted string"
                  ) ;
              else
                { out_char ( '"' ) ;
                  pregetnext ( ) ;
                }
            }
          while ( nextc == '"' ) ;
          output [ out_index ] = '\0' ;
          if ( need_filename )
            { out_index = mark ;
              get_double_quoted_filename ( ) ;
              goto got_fn ;
            }
          return output + mark ;
        }
      else if ( nextc >= '0' && nextc <= '9' || nextc == '.' )
        { mark = out_index ;
          out_char ( nextc ) ;
          while
            ( ( pregetnext ( ) , nextc ) >= 'A' && nextc <= 'Z' ||
              nextc >= 'a' && nextc <= 'z' ||
              nextc >= '0' && nextc <= '9' ||
              nextc == '_' ||
              nextc == '.'
            )
            out_char ( nextc ) ;
          output [ out_index ] = '\0' ;
          if ( need_filename )
            { out_index = mark ;
              get_unquoted_filename ( ) ;
              goto got_fn ;
            }
          return output + mark ;
        }
      else if ( nextc == '{'/*}*/ )
        { ccount = 0 ;
          out_char ( ' ' ) ;
          while
            ( ( ( pregetnext ( ) , nextc ) != /*{*/'}' || ccount ) &&
              nextc != EOF
            )
            { if ( nextc == /*{*/'}' )
                --ccount ;
              else if ( nextc == '{'/*}*/ )
                ++ccount ;
              if ( nextc == '\n' )
                out_char ( nextc ) ;
            }
          if ( nextc == /*{*/'}' )
            pregetnext ( ) ;
          else
            lerror
              (
/*LMSG*/"unterminated comment: end of file encountered within a comment"
              ) ;
        }
      else
        { if ( need_filename )
            { lerror
                (
/*LMSG*/"filename expected after %s directive"
                  , directive
                ) ;
              nextc = EOF ;
              continue ;
            }
          mark = out_index ;
          switch ( nextc )
            { case ',' :
              case '(' :
              case ')' :
              case ':' :
              case '[' :
              case ']' :
              case '-' :
              case '=' :
                break ;
              default :
                lm_Hlexical_error ( ) ;
                pregetnext ( ) ;
                continue ;
            }
          out_char ( nextc ) ;
          pregetnext ( ) ;
          output [ out_index ] = '\0' ;
          return output + mark ;
        }
    return NULL ;
  } /* lm_Hprescan */

char *
lm_Hdone_prescan ( )
  /* returns the final output buffer generated by prescan() */
```

Copyright 1989 Logic Modeling Systems

LINE # SOURCE TEXT

```
   { if ( malloc_failed )
       return NULL ;
     output [ out_index ] = '\0' ;
     return output ;
   } /* lm_Hdose_pre... */

/* end of prescanner for HDBL */
```

Copyright 1989 Logic Modeling Systems

| SOURCE PROGRAM | DATE | PAGE # |
|---|---|---|
| shellswh/Pr_host.c | 5/23/89 | 1/6 |
| | TIME 1:21:09 pm | |

SOURCE TEXT

```
/* SCCS_ID: Pr_host.c rev 1.1, 4/24/89 at 08:00:14 */

/*
 * Prescanner for MDBL, HOST SIDE


# include <stdio.h>
# include "common.h"
# include "MDBL.h"
# include "strng.h"
# include "Hparse.h"
# include "trees.h"
# include "Hconst.h"
# include "device.h"

# define MAX_DEV_NAME_LEN 20 /* maximum device name length */
# define MAX_MOD_NAME_LEN 32 /* maximum modeler name length */

extern void
  lm_Hset_prescan_info ( ) , /* to set prescan's idea of lineno, sourcename */
  lm_Hinit_prescan ( ) ; /* prescanner initializer */
extern char
  *lm_Hprescan ( ) , /* prescanner */
  *lm_Hdone_prescan ( ) ; /* called after prescan */

static char buffer [ BUF_SIZE ] ;

static void
buffer_string ( str )
  char *str ;
  /* fill buf with contents of passed "string" token (strip the quotes) */
  { char quote , *b ;
    quote = *str ;
    b = buffer ;
    do
      { ++str ;
        while ( *str != quote )
          *b++ = *str++ ;
        ++str ;
        if ( *str == quote )
          *b++ = *str ;
      }
    while ( *str != '\0' ) ;
/* need to make sure it fits */
    *b = '\0' ;
  } /* buffer_string */

char *
lm_Hlexical_pass ( name , source , dev_name , mod_name , usage )
  char
    *name ,
    *source ,
    **dev_name ,
    **mod_name ;
  ushort *usage ;
  /* makes a preliminary lexical pass over the source file text */
  /* returns device name, modeler name (if any), and device usage(1=private) */
  { char *tok , *t ;
    ushort len ;
    ushort
      dev_name_free = 1 ,
      mod_name_free = 1 ;
    *dev_name = NULL ;
    *mod_name = NULL ;
    *usage = 0 ;
    lm_Hinit_prescan ( name , source ) ;
    while ( ( tok = lm_Hprescan ( ) ) != NULL )
      { if ( strcmp ( tok , "device_name" ) == 0 )
          { if ( *dev_name != NULL )
              { lm_Hset_prescan_info ( ) ;
                lm_Herror
                  ( 1 ,
/*LMSC*/"device_name respecified"
                  ) ;
              }
            tok = lm_Hprescan ( ) ;
            if ( tok != NULL )
              { if ( *tok == '"' || *tok == '\'' )
                  { buffer_string ( tok ) ;
                    tok = buffer ;
                  }
                len = strlen ( tok ) ;
                if ( len == 0 )
                  { lm_Hset_prescan_info ( ) ;
                    lm_Herror
                      ( 1 ,
/*LMSC*/"zero-length device_name illegal"
                      ) ;
                  }
                else if ( len > MAX_DEV_NAME_LEN )
                  { lm_Hset_prescan_info ( ) ;
                    ( void ) sprintf ( buffer , "%u" , MAX_DEV_NAME_LEN ) ;
                    lm_Herror
                      ( 1 ,
/*LMSC*/"device_name too long (must be no more than %s characters)"
                      , buffer
                      ) ;
                  }
/* should I allocate the lesser of len and MAX_DEV_NAME_LEN and use strncpy? */
                *dev_name = malloc ( len + 1 ) ;
                if ( *dev_name == NULL )
                  { lm_Herror
                      ( 0 ,
/*LMSC*/"out of memory on host (device_name)"
                      ) ;
                    goto ret_failure ;
                  }
                ( void ) strcpy ( *dev_name , tok ) ;
                dev_name_free = 0 ;
              }
          }
        else if ( strcmp ( tok , "modeler_name" ) == 0 )
          { if ( *mod_name != NULL )
              { lm_Hset_prescan_info ( ) ;
                lm_Herror
                  ( 1 ,
/*LMSC*/"modeler_name respecified"
                  ) ;
              }
            tok = lm_Hprescan ( ) ;
```

Copyright 1989
Logic Modeling Systems

SOURCE PROGRAM shellswh/Pr_host.c | DATE 5/23/89 | TIME 1:21:09 pm | PAGE # 2/7

LINE # SOURCE TEXT

```
            if ( tok != NULL )
              { len = strlen ( tok ) ;
                if ( len == 0 )
                  { lm_Hset_prescan_info ( ) ;
                    lm_Herror
                      ( 1 ,
/*LMSG*/"zero-length modeler_name illegal"
                      ) ;
                  }
                else if ( len > MAX_MOD_NAME_LEN )
                  { lm_Hset_prescan_info ( ) ;
                    ( void ) sprintf ( buffer , "%u" , MAX_MOD_NAME_LEN ) ;
                    lm_Herror
                      ( 1 ,
/*LMSG*/"modeler_name too long (must be no more than %s characters)"
                      , buffer
                      ) ;
                  }
/* should I allocate the lesser of len and MAX_MOD_NAME_LEN and use strncpy? */
                *mod_name = malloc ( ( unsigned ) strlen ( tok ) + 1 ) ;
                if ( *mod_name == NULL )
                  { lm_Herror
                      ( 0 ,
/*LMSG*/"out of memory on host (modeler_name)"
                      ) ;
                    goto ret_failure ;
                  }
                ( void ) strcpy ( *mod_name , tok ) ;
                mod_name_free = 0 ;
              }
          }
        else if ( strcmp ( tok , "device_usage" ) == 0 )
          { if ( *usage )
              { lm_Hset_prescan_info ( ) ;
                lm_Herror
                  ( 1 ,
/*LMSG*/"device_usage respecified"
                  ) ;
                goto ret_failure ;
              }
            tok = lm_Hprescan ( ) ;
            if ( tok != NULL )
              { for ( t = tok ; *t != '\0' ; ++t )
                  if ( *t >= 'A' && *t <= 'Z' )
                    *t += 'a' - 'A' ;
                *usage = ! strcmp ( tok , "private" ) ;
              }
          }
      }
    if ( ! lm_Herrors ( ) )
      return lm_Hdone_prescan ( ) ;
ret_failure :
    if ( ! dev_name_free )
      ( void ) free ( *dev_name ) ;
    if ( ! mod_name_free )
      ( void ) free ( *mod_name ) ;
    *dev_name = NULL ;
    *mod_name = NULL ;
    return NULL ;
  } /* lm_Hlexical_pass */

/* end of Processor for HDBL, HOST SIDE */
```

Copyright 1989
Logic Modeling Systems

| SOURCE PROGRAM | DATE | TIME | PAGE # |
|---|---|---|---|
| shellswm/Hconst.c | 5/23/89 | 4:42:18 pm | 1/1 |

SOURCE TEXT

```
/* SCCS_ID: Hconst.c rev 3.1, 4/24/89 at 08:00:33     */

/*
 *  Constrainer for HML Processor
 */

# include "common.h"
# include "HML.h"
# include <strings.h>
# include "strng.h"
# include "Hparse.h"
# include "trees.h"
# include "Hconst.h"

extern void free_dev ( ) ;
static ushort depth ; /* to keep track of depth of indentation for tracing */
struct dev *the ; /* the global device structure */
char buf [ BUF_SIZE ] ; /* a global character buffer */

void
init_constrainer ( )
  /* enter all constant symbols needed by constrainer */
  { ( void ) strtosym ( "public" ) ;
    ( void ) strtosym ( "private" ) ;
    ( void ) strtosym ( "Hz" ) ;
    ( void ) strtosym ( "KHz" ) ;
    ( void ) strtosym ( "MHz" ) ;
    ( void ) strtosym ( "GHz" ) ;
    ( void ) strtosym ( "mS" ) ;
    ( void ) strtosym ( "uS" ) ;
    ( void ) strtosym ( "nS" ) ;
    ( void ) strtosym ( "pS" ) ;
    ( void ) strtosym ( "infinity" ) ;
    ( void ) strtosym ( "static" ) ;
    ( void ) strtosym ( "internal" ) ;
    ( void ) strtosym ( "external_clock0" ) ;
    ( void ) strtosym ( "external_clock1" ) ;
    ( void ) strtosym ( "TTL" ) ;
    ( void ) strtosym ( "NMOS" ) ;
    ( void ) strtosym ( "CMOS" ) ;
    ( void ) strtosym ( "LCMOS" ) ;
    ( void ) strtosym ( "custom" ) ;
    ( void ) strtosym ( "Vcc" ) ;
    ( void ) strtosym ( "Vhth" ) ;
    ( void ) strtosym ( "Vlth" ) ;
    ( void ) strtosym ( "Vih" ) ;
    ( void ) strtosym ( "Vil" ) ;
    ( void ) strtosym ( "Voh" ) ;
    ( void ) strtosym ( "Vol" ) ;
    ( void ) strtosym ( "Ioh" ) ;
    ( void ) strtosym ( "Iol" ) ;
    ( void ) strtosym ( "Iih" ) ;
    ( void ) strtosym ( "Iil" ) ;
    ( void ) strtosym ( "eval" ) ;
    ( void ) strtosym ( "store" ) ;
    ( void ) strtosym ( "edge_rise" ) ;
    ( void ) strtosym ( "edge_fall" ) ;
    ( void ) strtosym ( "feedback" ) ;
    ( void ) strtosym ( "keepalive" ) ;
    ( void ) strtosym ( "in_sequence" ) ;
    ( void ) strtosym ( "last_cycle" ) ;
    ( void ) strtosym ( "hard" ) ;
    ( void ) strtosym ( "medium" ) ;
    ( void ) strtosym ( "hard_medium" ) ;
    ( void ) strtosym ( "rise" ) ;
    ( void ) strtosym ( "fall" ) ;
    ( void ) strtosym ( "low" ) ;
    ( void ) strtosym ( "high" ) ;
    ( void ) strtosym ( "float" ) ;
    ( void ) strtosym ( "valid" ) ;
    ( void ) strtosym ( "any" ) ;
    ( void ) strtosym ( "min" ) ;
    ( void ) strtosym ( "typ" ) ;
    ( void ) strtosym ( "max" ) ;
    ( void ) strtosym ( "on" ) ;
    ( void ) strtosym ( "off" ) ;
    ( void ) strtosym ( "missing_delays" ) ;
    ( void ) strtosym ( "io_store_changes" ) ;
    ( void ) strtosym ( "trace_delay" ) ;
    ( void ) strtosym ( "pull_up" ) ;
    ( void ) strtosym ( "pull_down" ) ;
  } /* init_constrainer */

void
free_the ( )
  { free_dev ( the ) ;
  } /* free_the */

  /*VARARGS2*/
void
cerror ( T , mess , arg , arg2 )
  tree T ;
  char
    *mess ,
    *arg ,
    *arg2 ;
  /* report a constrainer error via lm_Herror() */
  {
ASSERT(T!=NULLTREE);
    lm_Hset_lineno ( line_of ( T ) ) ;
    lm_Hset_input ( symtostr ( file_of ( T ) ) ) ;
    lm_Herror ( 1 , mess , arg , arg2 ) ;
  } /* cerror */

  /*VARARGS2*/
void
cwarning ( T , mess , arg , arg2 )
  tree T ;
  char
    *mess ,
    *arg ,
    *arg2 ;
  /* report a constrainer warning via lm_Hwarning() */
  {
ASSERT(T!=NULLTREE);
    lm_Hset_lineno ( line_of ( T ) ) ;
    lm_Hset_input ( symtostr ( file_of ( T ) ) ) ;
    lm_Hwarning ( mess , arg , arg2 ) ;
  } /* cwarning */
```

Copyright 1989
Logic Modeling Systems

| SOURCE PROGRAM | DATE | PAGE # |
|---|---|---|
| shellswm/Hconst.c | 5/23/89 | 2/2 |
| | TIME 4:42:18 pm | |

SOURCE TEXT

LINE #

```
void
buf_instead ( i , j )
  ushort i , j ;
  /* fill buffer for error reporting */
  ( void ) sprintf ( buf , "%d instead of %d" , i , j ) ;
  } /* buf_instead */

void
tr_entry ( T )
  tree T ;
  /* trace entry to a subtree */
  { ushort i ;
    if ( lm_Et_flag_on ( ) )
      { for ( i = 0 ; i < depth ; ++i )
          ( void ) lm_print_message ( "  " ) ;
        ( void ) lm_print_message ( "+ " ) ;
        printnode ( T ) ;
        ( void ) lm_print_message ( "\n" ) ;
      }
    ++depth ;
  } /* tr_entry */

void
tr_exit ( T )
  tree T ;
  /* trace exit from a subtree */
  { ushort i ;
    --depth ;
    if ( lm_Et_flag_on ( ) )
      { for ( i = 0 ; i < depth ; ++i )
          ( void ) lm_print_message ( "  " ) ;
        ( void ) lm_print_message ( "- " ) ;
        printnode ( T ) ;
        ( void ) lm_print_message ( "\n" ) ;
      }
  } /* tr_entry */

static char
lower ( c )
  char c ;
  /* return the lower case equivalent of the passed character */
  { return c >= 'A' && c <= 'Z' ? c - 'A' + 'a' : c ;
  } /* lower */

ushort
scompare ( sym1 , sym2 )
  symbol
    sym1 ,
    sym2 ;
  /* return 1 iff the two passed symbols' lower case equivalents compare */
  { char
      *t1 ,
      *t2 ;
    t1 = symtostr ( sym1 ) ;
    t2 = symtostr ( sym2 ) ;
    while ( *t1 != '\0' && *t2 != '\0' && lower ( *t1 ) == lower ( *t2 ) )
      { ++t1 ;
        ++t2 ;
      }
    return *t1 == '\0' && *t2 == '\0' ;
  } /* scompare */

static struct dev *
allo_dev ( )
  /* returns pointer to newly-allocated device structure */
  { char *ptr ;
    ptr = lm_malloc ( sizeof ( struct dev ) ) ;
    if ( ptr == NULL )
      { lm_Herror
          ( 1 ,
/*LMSC*/"out of memory on modeler (allo_dev)"
          ) ;
          lm_Ffail ( ) ;
      }
    return ( struct dev * ) ptr ;
  } /* allo_dev */

static struct pins *
allo__pins ( size )
  ushort size ;
  /* returns pointer to newly-allocated array of pin structs of passed size */
  { char *ptr ;
    if ( size )
      ptr = lm_malloc ( sizeof ( struct pins ) * size ) ;
    else
      return NULL ;
    if ( ptr == NULL )
      { lm_Herror
          ( 1 ,
/*LMSC*/"out of memory on modeler (allo__pins)"
          ) ;
          lm_Ffail ( ) ;
      }
    return ( struct pins * ) ptr ;
  } /* allo__pins */

static struct sequence *
allo_sequences ( size )
  ushort size ;
  /* returns pointer to newly-allocated array of sequences */
  { char *ptr ;
    if ( size )
      ptr = lm_malloc ( sizeof ( struct sequence ) * size ) ;
    else
      return NULL ;
    if ( ptr == NULL )
      { lm_Herror
          ( 1 ,
/*LMSC*/"out of memory on modeler (allo_sequences)"
          ) ;
          lm_Ffail ( ) ;
      }
    return ( struct sequence * ) ptr ;
  } /* allo_sequences */

double
check_num ( num )
  tree num ;
  /* checks the number whose text is in the passed node */
  /* returns the floating point value */
```

Copyright 1989
Logic Modeling Systems

SOURCE PROGRAM shellswm/Hconst.c | DATE 5/23/89 | TIME 4:42:18 pm | PAGE # 3/3

SOURCE TEXT

```
  { char *str ;
    double
      val = 0 ,
      power = 0 ;
    tr_entry ( num ) ;
    if ( nameofnode ( num ) == N_NEGATIVE )
      { val = - check_num ( subtree ( 1 , num ) ) ;
        tr_exit ( num ) ;
        return val ;
      }
    str = symtostr ( textofnode ( num ) ) ;
    while ( *str != '\0' )
      { switch ( *str )
          { case '.' :
              if ( power )
                { cerror
                    ( num ,
/*LMSC*/"illegal number (multiple decimal points): %s"
                    , nof ( num )
                    ) ;
                  tr_exit ( num ) ;
                  return 0 ;
                }
              power = 10 ;
              break ;
            case '0' :
            case '1' :
            case '2' :
            case '3' :
            case '4' :
            case '5' :
            case '6' :
            case '7' :
            case '8' :
            case '9' :
              if ( power )
                { val += ( *str - '0' ) / power ;
                  power *= 10 ;
                }
              else
                { val *= 10 ;
                  val += *str - '0' ;
                }
              break ;
            case '_' :
              break ;
            default :
              cerror
                ( num ,
/*LMSC*/"illegal number (non-numeric characters): %s"
                , nof ( num )
                ) ;
              tr_exit ( num ) ;
              return 0 ;
          }
        ++str ;
      }
    tr_exit ( num ) ;
    return val ;
  } /* check_num */

unsigned long
check_int ( num )
  tree num ;
  /* checks the number in the passed node via check_num() */
  /* makes sure the value is integral */
  /* returns the unsigned long value */
  { double val ;
    val = check_num ( num ) ;
    if ( val - ( unsigned long ) val != 0 )
      cerror
        ( num ,
/*LMSC*/"integer value required: %s"
        , nof ( num )
        ) ;
    return val ;
  } /* check_int */

ushort
do_pin_name ( T )
  tree T ;
  /* processes a pin name, returning the number of pins it indicates */
  { tree kid ;
    ushort
      num1 = 0 ,
      num2 = 0 ;
    tr_entry ( T ) ;
    switch ( nameofnode ( T ) )
      { case P_ID_ :
        case P_NUM_ :
        case P_STR_ :
/* what about generators in strings? */
          break ;
        case N_PIN_NAME :
          kid = subtree ( 2 , T ) ;
          decorate ( kid , ( long ) ( num1 = num2 = check_int ( kid ) ) ) ;
          if ( kidcount ( T ) == 3 )
            { kid = subtree ( 3 , T ) ;
              decorate ( kid , ( long ) ( num2 = check_int ( kid ) ) ) ;
            }
          break ;
        default :
          cerror
            ( T ,
/*LMSC*/"internal error: do_pin_name: unknown node name: %s"
            , symtostr ( nameofnode ( T ) )
            ) ;
          break ;
      }
    tr_exit ( T ) ;
    if ( num1 > num2 )
      return num1 - num2 + 1 ;
    return num2 - num1 + 1 ;
  } /* do_pin_name */

void
buf_string ( str )
  char *str ;
  /* fill buf with contents of passed "string" token (strip the quotes) */
  { char quote , *b ;
```

Copyright 1989
Logic Modeling Systems

SOURCE PROGRAM shellswm/Hconst.c | DATE 5/23/89 | TIME 4:42:18 pm | PAGE # 4/4

SOURCE TEXT

```
    quote = *str ;
    b = buf ;
    do
      { ++str ;
        while ( *str != quote )
          *b++ = *str++ ;
        ++str ;
        if ( *str == quote )
          *b++ = *str ;
      }
    while ( *str != '\0' ) ;
/* need to make sure it fits */
    *b = '\0' ;
  } /* buf_string */

symbol
prepend_underscore ( sym , look_only )
  symbol sym ;
  ushort look_only ;
  /* prepends '_' to the passed symbol, returns the symbol it makes */
  /* if look_only is nonzero, only returns the symbol it makes if it exists */
  { ( void ) sprintf ( buf , "_%s" , symtostr ( sym ) ) ;
/* need to make sure it fits */
    return look_only ? strlook ( buf ) : strtosym ( buf ) ;
  } /* prepend_underscore */

symbol
gen_name ( pre , num )
  symbol pre ;
  ushort num ;
  /* takes a symbol and a number, returns their concatenation as a symbol */
  { char *str ;
    ushort len ;
    str = symtostr ( pre ) ;
    if ( *str == '\'' || *str == '"' )
      { buf_string ( str ) ;
        len = strlen ( buf ) ;
        ( void ) sprintf ( buf + len , "%u" , num ) ;
/* need to make sure it fits */
      }
    else
      ( void ) sprintf ( buf , "%s%u" , str , num ) ;
/* need to make sure it fits */
    return strtosym ( buf ) ;
  } /* gen_name */

void
add_attr ( T , attrs , ndex )
  tree T ;
  struct pin_attr *attrs ;
  ushort ndex ;
  /* fills in attribute structure at ndex position of attrs */
  /* with information derived from passed tree T */
  { ushort i ;
    tree kid ;
    symbol
      text ,
      text2 ,
      name ;
    long ohms ;
    name = nameofnode ( T ) ;
    for ( i = 0 ; i < ndex ; ++i )
      switch ( name )
        { case P_ID_ :
              text = textofnode ( T ) ;
              if
                ( text == C_eval ||
                  text == C_store ||
                  text == C_edge_rise ||
                  text == C_edge_fall
                )
                { if ( attrs [ i ] . use_flag == ID_ATTR )
                    { text2 = attrs [ i ] . attr . id ;
                      if
                        ( text2 == C_eval ||
                          text2 == C_store ||
                          text2 == C_edge_rise ||
                          text2 == C_edge_fall
                        )
                        cerror
                          ( T ,
/*LMSG*/"%s attribute respecified"
                            , symtostr ( text )
                          ) ;
                    }
                }
              else if ( text == C_feedback || text == C_keepalive )
                { if ( attrs [ i ] . use_flag == ID_ATTR )
                    { text2 = attrs [ i ] . attr . id ;
                      if ( text2 == text )
                        cerror
                          ( T ,
/*LMSG*/"%s attribute respecified"
                            , symtostr ( text )
                          ) ;
                    }
                }
              else if ( text == C_pull_up || text == C_pull_down )
                if ( attrs [ i   use_flag == ID_ATTR )
                  { text2 = attrs [ i ] . attr . id ;
                    if ( text2 == C_pull_up || text2 == C_pull_down )
                      cerror
                        ( T ,
/*LMSG*/"%s attribute respecified"
                          , symtostr ( text )
                        ) ;
                  }
                else if ( attrs [ i ] . use_flag == CURRENT_SPEC )
                  { text2 = attrs [ i ] . attr . cur_spec . cur ,
                    if ( text2 == C_pull_up || text2 == C_pull_down )
                      cerror
                        ( T ,
/*LMSG*/"%s attribute respecified"
                          , symtostr ( text )
                        ) ;
                  }
              break ;
            case N_ATTR :
              if ( nameofnode ( subtree ( 2 , T ) ) == P_ID_ )
                { if
```

Copyright 1989
Logic Modeling Systems

SOURCE PROGRAM
shellswm/Hconst.c

DATE 5/23/89
TIME 4:42:18 pm

SOURCE TEXT

```
                    ( attrs [ i ] . use_flag == CYCLE_SPEC &&
                      attrs [ i ] . attr . cyc_spec . seq ==
                        ( text = textofnode ( kid = subtree ( 1 , T ) ) )
                    )
                    cerror
                      ( kid ,
/*LMSG*/"%s attribute respecified"
                        , symtostr ( text )
                      ) ;
                  break ;
              }
            text = textofnode ( kid = subtree ( 1 , T ) ) ;
            if ( text == C_pull_up || text == C_pull_down )
              { if ( attrs [ i ] . use_flag == ID_ATTR )
                  { text2 = attrs [ i ] . attr . id ;
                    if ( text2 == C_pull_up || text2 == C_pull_down )
                      cerror
                        ( kid ,
/*LMSG*/"%s attribute respecified"
                          , symtostr ( text )
                        ) ;
                  }
                else if ( attrs [ i ] . use_flag == CURRENT_SPEC )
                  { text2 = attrs [ i ] . attr . cur_spec . cur ;
                    if ( text2 == C_pull_up || text2 == C_pull_down )
                      cerror
                        ( kid ,
/*LMSG*/"%s attribute respecified"
                          , symtostr ( text )
                        ) ;
                  }
                break ;
              }
            if
              ( attrs [ i ] . use_flag == CURRENT_SPEC &&
                attrs [ i ] . attr . cur_spec . cur == text
              )
              cerror
                ( kid ,
/*LMSG*/"%s attribute respecified"
                  , symtostr ( text )
                ) ;
            break ;
          default :
            cerror
              ( T ,
/*LMSG*/"internal error: add_attr: bad attribute"
              ) ;
            break ;
        }
    switch ( name )
      { case P_ID_ :
          attrs [ ndex ] . use_flag = ID_ATTR ;
          attrs [ ndex ] . attr . id = textofnode ( T ) ;
          break ;
        case N_ATTR :
          if ( nameofnode ( subtree ( 2 , T ) ) == P_ID_ )
            { attrs [ ndex ] . use_flag = CYCLE_SPEC ;
              attrs [ ndex ] . attr . cyc_spec . seq =
                textofnode ( subtree ( 1 , T ) ) ;
              attrs [ ndex ] . attr . cyc_spec . drv =
                textofnode ( subtree ( 2 , T ) ) ;
              break ;
            }
          attrs [ ndex ] . use_flag = CURRENT_SPEC ;
          text2 =
            attrs [ ndex ] . attr . cur_spec . cur =
              textofnode ( subtree ( 1 , T ) ) ;
          if ( text2 == C_pull_up || text2 == C_pull_down )
            { attrs [ ndex ] . attr . cur_spec . val =
                ohms = dec_ratios ( subtree ( 2 , T ) ) ;
              if ( text2 == C_pull_up )
                { if ( the -> Vcc / ohms * 2000 > 4 )
                    cerror
                      ( subtree ( 2 , T ) ,
/*LMSG*/"pull_up resistance too low: %s"
                        , symtostr ( textofnode ( subtree ( 2 , T ) ) )
                      ) ;
                }
              else if ( the -> Vcc / ohms * 2000 > 4 )
                cerror
                  ( subtree ( 2 , T ) ,
/*LMSG*/"pull_down resistance too low: %s"
                    , symtostr ( textofnode ( subtree ( 2 , T ) ) )
                  ) ;
              break ;
            }
          attrs [ ndex ] . attr . cur_spec . val =
            textofnode ( subtree ( 1 , T ) ) == C_Iil ||
            textofnode ( subtree ( 1 , T ) ) == C_Ioh ?
              -check_num ( subtree ( 2 , T ) ) :
              check_num ( subtree ( 2 , T ) ) ;
          break ;
        default :
          lm_Nerror
            ( 1 ,
/*LMSG*/"internal error: add_attr: unknown node name: %s"
            , symt··str ( text )
          ) ;
          break ;
      }
  } /* add_attr */

static void
init_device ( t )
  struct dev *t ;
  /* initializes all fields of the passed device structure */
  { t -> edges =
        t -> num_in =
        t -> num_out =
        t -> num_io =
        t -> num_power =
        t -> num_ground =
        t -> num_nc =
        t -> pin_cnt =
        t -> apin_cnt =
        t -> reset_cnt =
        t -> num_seqs =
        t -> rise_fb =
        t -> pre_seq_length =
```

Copyright 1989
Logic Modeling Systems

SOURCE PROGRAM shellswm/Hconst.c

DATE 5/23/89 TIME 4:42:18 pm PAGE # 6/6

SOURCE TEXT

```
      t -> fb_seq_length =
      t -> post_seq_length =
      t -> ultra_fast =
      t -> dis_tim_check =
      t -> inh_tim_measure =
      t -> delays_seen =
      t -> use_default =
      t -> has_store_pins =
      t -> has_adapter_map =
      t -> has_package_map =
      t -> has_feedback_pins =
        0 ;
    t -> clk_period1 =
      t -> clk_period2 =
      t -> min_default =
      t -> typ_default =
      t -> max_default =
        -1 ;
    t -> dev_name =
      t -> dev_type =
      t -> mod_name =
      t -> clk_type =
      t -> technology =
      t -> missing_delays =
      t -> io_store_changes =
        NULLSYM ;
    t -> tech_tree = NULLTREE ;
    t -> def_setup =
      t -> def_hold =
      t -> def_sample =
      t -> Vcc =
      t -> Vhth =
      t -> Vlth =
      t -> Vih =
      t -> Vil =
      t -> Vsh =
      t -> Vsl =
      t -> Ioh =
      t -> Iol =
      t -> Iih =
      t -> Iil =
      t -> Ish =
      t -> Isl =
        UNDEFINED ;
    t -> pins = NULL ;
    t -> sequences = NULL ;
  } /* init_device */

static double
round_up ( val , w1 , w2 , w3 , w4 )
  double
    val ,
    w1 ,
    w2 ,
    w3 ,
    w4 ;
  /* returns val rounded up to something representable with passed weights */
  { double ret ;
    val -= 0.0005 ;
    ret = w1 + w2 + w3 + w4 ;
    if ( ret - w4 >= val )
      ret -= w4 ;
    if ( ret - w3 >= val )
      ret -= w3 ;
    if ( ret - w2 >= val )
      ret -= w2 ;
    if ( ret - w1 >= val )
      ret -= w1 ;
    return ret ;
  } /* round_up */

void init_the ( )
  { the = NULL ;
  } /* init_the */

struct dev *
constrain ( T )
  tree T ;
  /* perform static semantic checking on the HMBL specification */
  { ushort
      k ,
      kids ,
      pin_of ,
      pin_seen ;
    symbol
      num ,
      pin ;
# ifdef ENFORCE_MARGINS
    double noise_margin ;
    char num_buf [ 32 ] ;
# endif ENFORCE_MARGINS
    depth = 0 ;
    if
      ( lm_Ht_flag_on ( ) &&
        ( lm_Hl_flag_on ( ) || lm_Hp_flag_on ( ) || lm_Hs_flag_on ( ) )
      )
      ( void ) lm_print_message ( "\n" ) ;

    t'     allo_dev ( ) ;
    init_device ( the ) ;
    kids = kidcount ( T ) ;
    tr_entry ( T ) ;

    /*in walk_1 we:
        process:
          device_name
          ultra_fast
          device_usage
          report
          modeler_name
          clock_type
          disable_timing_checking
          device_hold_time
          device_setup_time
          device_sample_time
          device_speed
          technology
            Vcc/Vhth/Vlth/Vih/Vil/Vsh/Vsl specification
            Ioh/Iol/Iih/Iil specification
          default_delay
```

Copyright 1989
Logic Modeling Systems

| SOURCE PROGRAM | DATE | 5/23/89 | PAGE # |
|---|---|---|---|
| shellswm/Hconst.c | TIME | 4:42:18 pm | 7/7 |

SOURCE TEXT

```
        count in/out/io/power/ground/nc pin names
          check against number of pin numbers
        count pre/fb/post reset sequences
        process device adapter mapping
          declare device adapter pin names
    */
    for ( k = 1 ; k <= kids ; ++k )
      walk_1 ( subtree ( k , T ) ) ;
    if ( the -> has_adapter_map == 0 )
      cerror
        ( T ,
/*LMSG*/"no adapter_mapping specified"
        ) ;

    { /* begin device-level default processing */
      if ( the -> dev_name == NULLSYM )
        cerror
          ( T ,
/*LMSG*/"internal error: no device_name found"
          ) ;
      if ( the -> dev_type == NULLSYM )
        the -> dev_type = C_public ;
      if ( the -> clk_periodl == -1 )
        cerror
          ( T ,
/*LMSG*/"no device_speed specified"
          ) ;
      if ( the -> clk_type == NULLSYM )
        the -> clk_type = C_internal ;
      switch ( the -> technology )
        { case C_custom :
            if ( the -> Vcc == UNDEFINED )
              cerror
                ( the -> tech_tree ,
/*LMSG*/"Vcc undefined"
                ) ;
            if ( the -> Vhth == UNDEFINED )
              cerror
                ( the -> tech_tree ,
/*LMSG*/"Vhth undefined"
                ) ;
            if ( the -> Vlth == UNDEFINED )
              cerror
                ( the -> tech_tree ,
/*LMSG*/"Vlth undefined"
                ) ;
            if ( the -> Vih == UNDEFINED )
              cerror
                ( the -> tech_tree ,
/*LMSG*/"Vih undefined"
                ) ;
            if ( the -> Vil == UNDEFINED )
              cerror
                ( the -> tech_tree ,
/*LMSG*/"Vil undefined"
                ) ;
            if ( the -> Vsh == UNDEFINED )
              cerror
                ( the -> tech_tree ,
/*LMSG*/"Vsh undefined"
                ) ;
            if ( the -> Vsl == UNDEFINED )
              cerror
                ( the -> tech_tree ,
/*LMSG*/"Vsl undefined"
                ) ;
            if ( the -> Ioh == UNDEFINED )
              cerror
                ( the -> tech_tree ,
/*LMSG*/"Ioh undefined"
                ) ;
            if ( the -> Iol == UNDEFINED )
              cerror
                ( the -> tech_tree ,
/*LMSG*/"Iol undefined"
                ) ;
            if ( the -> Iih == UNDEFINED )
              cerror
                ( the -> tech_tree ,
/*LMSG*/"Iih undefined"
                ) ;
            if ( the -> Iil == UNDEFINED )
              cerror
                ( the -> tech_tree ,
/*LMSG*/"Iil undefined"
                ) ;
            /* fall through */
          case NULLSYM :
            the -> technology = C_TTL ;
            /* fall through */
          default :
            /* fall through */
          case C_TTL :
            if ( the -> Vcc == UNDEFINED )
              the -> Vcc = D_TTL_Vcc ;
            if ( the -> Vhth == UNDEFINED )
              the -> Vhth = D_TTL_Vhth ;
            if ( the -> Vlth == UNDEFINED )
              the -> Vlth = D_TTL_Vlth ;
            if ( the -> Vih == UNDEFINED )
              the -> Vih = D_TTL_Vih ;
            if ( the -> Vil == UNDEFINED )
              the -> Vil = D_TTL_Vil ;
            if ( the -> Vsh == UNDEFINED )
              the -> Vsh = D_TTL_Vsh ;
            if ( the -> Vsl == UNDEFINED )
              the -> Vsl = D_TTL_Vsl ;
            if
              ( the -> Iil == UNDEFINED &&
                the -> Iih == UNDEFINED &&
                the -> Iol == UNDEFINED &&
                the -> Ioh == UNDEFINED
              )
              { the -> Iil = ( the -> Ioh = the -> Isl = D_TTL_Isl ) / 2 ;
                the -> Iih = ( the -> Iol = the -> Ish = D_TTL_Ish ) / 2 ;
              }
            else
              { if ( the -> Ioh == UNDEFINED )
                  the -> Ioh = D_TTL_Isl ;
                if ( the -> Iol == UNDEFINED )
```

Copyright 1989
Logic Modeling Systems

SOURCE PROGRAM
shellswm/Hconst.c

DATE 5/23/89
TIME 4:42:18 pm

PAGE # 8/8

SOURCE TEXT

```
                the -> Iol = D_TTL_Ish ;
              if ( the -> Iih == UNDEFINED )
                the -> Iih = D_TTL_Ish / 2 ;
              if ( the -> Iil == UNDEFINED )
                the -> Iil = D_TTL_Isl / 2 ;
            }
          break ;
        case C_NMOS :
          if ( the -> Vcc == UNDEFINED )
            the -> Vcc = D_NMOS_Vcc ;
          if ( the -> Vhth == UNDEFINED )
            the -> Vhth = D_NMOS_Vhth ;
          if ( the -> Vlth == UNDEFINED )
            the -> Vlth = D_NMOS_Vlth ;
          if ( the -> Vih == UNDEFINED )
            the -> Vih = D_NMOS_Vih ;
          if ( the -> Vil == UNDEFINED )
            the -> Vil = D_NMOS_Vil ;
          if ( the -> Vsh == UNDEFINED )
            the -> Vsh = D_NMOS_Vsh ;
          if ( the -> Vsl == UNDEFINED )
            the -> Vsl = D_NMOS_Vsl ;
          if
            ( the -> Iil == UNDEFINED &&
              the -> Iih == UNDEFINED &&
              the -> Iol == UNDEFINED &&
              the -> Ioh == UNDEFINED
            )
            { the -> Iil = ( the -> Ioh = the -> Isl = D_NMOS_Isl ) / 2 ;
              the -> Iih = ( the -> Iol = the -> Ish = D_NMOS_Ish ) / 2 ;
            }
          else
            { if ( the -> Ioh == UNDEFINED )
                the -> Ioh = D_NMOS_Isl ;
              if ( the -> Iol == UNDEFINED )
                the -> Iol = D_NMOS_Ish ;
              if ( the -> Iih == UNDEFINED )
                the -> Iih = D_NMOS_Ish / 2 ;
              if ( the -> Iil == UNDEFINED )
                the -> Iil = D_NMOS_Isl / 2 ;
            }
          break ;
        case C_CMOS :
          if ( the -> Vcc == UNDEFINED )
            the -> Vcc = D_CMOS_Vcc ;
          if ( the -> Vhth == UNDEFINED )
            the -> Vhth = the -> Vcc - 0.3 ;
          if ( the -> Vlth == UNDEFINED )
            the -> Vlth = D_CMOS_Vlth ;
          if ( the -> Vih == UNDEFINED )
            the -> Vih = the -> Vcc * 0.70 ;
          if ( the -> Vil == UNDEFINED )
            the -> Vil = the -> Vcc * 0.20 ;
          if ( the -> Vsh == UNDEFINED )
            the -> Vsh = the -> Vcc - 0.5 ;
          if ( the -> Vsl == UNDEFINED )
            the -> Vsl = D_CMOS_Vsl ;
          if
            ( the -> Iil == UNDEFINED &&
              the -> Iih == UNDEFINED &&
              the -> Iol == UNDEFINED &&
              the -> Ioh == UNDEFINED
            )
            { the -> Iil = ( the -> Ioh = the -> Isl = D_CMOS_Isl ) / 2 ;
              the -> Iih = ( the -> Iol = the -> Ish = D_CMOS_Ish ) / 2 ;
            }
          else
            { if ( the -> Ioh == UNDEFINED )
                the -> Ioh = D_CMOS_Isl ;
              if ( the -> Iol == UNDEFINED )
                the -> Iol = D_CMOS_Ish ;
              if ( the -> Iih == UNDEFINED )
                the -> Iih = D_CMOS_Ish / 2 ;
              if ( the -> Iil == UNDEFINED )
                the -> Iil = D_CMOS_Isl / 2 ;
            }
          break ;
        case C_LCMOS :
          if ( the -> Vcc == UNDEFINED )
            the -> Vcc = D_LCMOS_Vcc ;
          if ( the -> Vhth == UNDEFINED )
            the -> Vhth = the -> Vcc - 0.3 ;
          if ( the -> Vlth == UNDEFINED )
            the -> Vlth = D_LCMOS_Vlth ;
          if ( the -> Vih == UNDEFINED )
            the -> Vih = the -> Vcc * 0.75 ;
          if ( the -> Vil == UNDEFINED )
            the -> Vil = the -> Vcc * 0.18 ;
          if ( the -> Vsh == UNDEFINED )
            the -> Vsh = the -> Vcc - 0.5 ;
          if ( the -> Vsl == UNDEFINED )
            the -> Vsl = D_LCMOS_Vsl ;
          if
            ( the -> Iil == UNDEFINED &&
              the -> Iih == UNDEFINED &&
              the -> Iol == UNDEFINED &&
              the -> Ioh == UNDEFINED
            )
            { the -> Iil = ( the -> Ioh = the -> Isl = D_LCMOS_Isl ) / 2 ;
              the -> Iih = ( the -> Iol = the -> Ish = D_LCMOS_Ish ) / 2 ;
            }
          else
            { if ( the -> Ioh == UNDEFINED )
                the -> Ioh = D_LCMOS_Isl ;
              if ( the -> Iol == UNDEFINED )
                the -> Iol = D_LCMOS_Ish ;
              if ( the -> Iih == UNDEFINED )
                the -> Iih = D_LCMOS_Ish / 2 ;
              if ( the -> Iil == UNDEFINED )
                the -> Iil = D_LCMOS_Isl / 2 ;
            }
          break ;
      }
# ifdef ENFORCE_MARGINS
      if ( the -> Vhth > the -> Vcc - 0.05 )
        cerror
          ( subtree ( 1 , the -> tech_tree ) ,
/*LMSG*/"illegal Vhth specification (must be 50 mV or more below Vcc)"
          ) ;
# endif ENFORCE_MARGINS
```

Copyright 1989 Logic Modeling Systems

SOURCE PROGRAM shellswm/Hconst.c

DATE 5/23/89 TIME 4:42:18 pm PAGE # 9/9

SOURCE TEXT

```
        if ( the -> Vhth > the -> Vcc )
          cerror
            ( subtree ( 1 , the -> tech_tree ) ,
/*LMSG*/"illegal Vhth specification (must be no more than Vcc)"
            ) ;
        if ( the -> Vhth < the -> Vcc / 2 )
          cerror
            ( subtree ( 1 , the -> tech_tree ) ,
/*LMSG*/"illegal Vhth specification (must be no less than 50% of Vcc)"
            ) ;
# ifdef ENFORCE_MARGINS
        if ( the -> Vah > the -> Vhth - 0.05 )
          cerror
            ( subtree ( 1 , the -> tech_tree ) ,
/*LMSG*/"illegal Vah specification (must be 50 mV or more below Vhth)"
            ) ;
# endif ENFORCE_MARGINS
        if ( the -> Vah > the -> Vcc )
          cerror
            ( subtree ( 1 , the -> tech_tree ) ,
/*LMSG*/"illegal Vah specification (must be no more than Vcc)"
            ) ;
        if ( the -> Vah < the -> Vcc / 2 )
          cerror
            ( subtree ( 1 , the -> tech_tree ) ,
/*LMSG*/"illegal Vah specification (must be no less than 50% of Vcc)"
            ) ;
        if ( the -> Vih > the -> Vcc )
          cerror
            ( subtree ( 1 , the -> tech_tree ) ,
/*LMSG*/"illegal Vih specification (must be no more than Vcc)"
            ) ;
# ifdef ENFORCE_MARGINS
        noise_margin =
          the -> technology == C_LCMOS || the -> technology == C_custom ?
            LCMOS_NOISE_MARGIN : NOISE_MARGIN ;
        if ( the -> Vih > the -> Vah - noise_margin + 0.000001 )
          { ( void ) sprintf ( num_buf , "%g" , the -> Vah - noise_margin ) ;
            cerror
              ( subtree ( 1 , the -> tech_tree ) ,
/*LMSG*/"illegal Vih specification (must be no more than %s Volts)"
                , num_buf
              ) ;
          }
        if ( the -> Vil > the -> Vih - 0.05 )
          cerror
            ( subtree ( 1 , the -> tech_tree ) ,
/*LMSG*/"illegal Vil specification (must be 50 mV or more below Vih)"
            ) ;
        if ( the -> Val > the -> Vil - noise_margin + 0.000001 )
          { ( void ) sprintf ( num_buf , "%g" , the -> Val + noise_margin ) ;
            cerror
              ( subtree ( 1 , the -> tech_tree ) ,
/*LMSG*/"illegal Vil specification (must be no less than %s Volts)"
                , num_buf
              ) ;
          }
        if ( the -> Vlth > the -> Val - 0.05 )
          cerror
            ( subtree ( 1 , the -> tech_tree ) ,
/*LMSG*/"illegal Val specification (must be 50 mV or more above Vlth)"
            ) ;
# endif ENFORCE_MARGINS
        if ( the -> Val > the -> Vcc / 5 )
          cerror
            ( subtree ( 1 , the -> tech_tree ) ,
/*LMSG*/"illegal Val specification (must be no more than 20% of Vcc)"
            ) ;
# ifdef ENFORCE_MARGINS
        if ( the -> Vlth < 0.05 )
          cerror
            ( subtree ( 1 , the -> tech_tree ) ,
/*LMSG*/"illegal Vlth specification (must be no less than 50 mV)"
            ) ;
# endif ENFORCE_MARGINS
        if ( the -> Vlth > the -> Vcc / 5 )
          cerror
            ( subtree ( 1 , the -> tech_tree ) ,
/*LMSG*/"illegal Vlth specification (must be no more than 20% of Vcc)"
            ) ;
        if ( the -> Ial == UNDEFINED )
          { the -> Ial = 1.9 * the -> Iil ;
            the -> Ial = round_up ( the -> Ial , 0.2 , 0.5 , 1.2 , 3.0 ) ;
            the -> Iah = 1.9 * the -> Iih ;
            the -> Iah = round_up ( the -> Iah , 0.1 , 0.5 , 1.2 , 2.0 ) ;
          }
# ifdef ENFORCE_CURRENTS
        if ( the -> Ioh + 0.000001 < 2 * the -> Iil )
          cerror
            ( subtree ( 1 , the -> tech_tree ) ,
/*LMSG*/"Ioh must be at most twice Iil"
            ) ;
        if ( the -> Iol + 0.000001 < 2 * the -> Iih )
          cerror
            ( subtree ( 1 , the -> tech_tree ) ,
/*LMSG*/"Iol must be at least twice Iih"
            ) ;
# endif ENFORCE_CURRENTS
        if ( the -> num_in == 0 && the -> num_io == 0 )
          cerror
            ( T ,
/*LMSG*/"no in_pin or io_pin specified"
            ) ;
        if ( the -> num_out == 0 && the -> num_io == 0 )
          cerror
            ( T ,
/*LMSG*/"no out_pin or io_pin specified"
            ) ;
        if ( ! the -> has_store_pins )
          cerror
            ( T ,
/*LMSG*/"no eval pins or store pins specified"
            ) ;
        if ( the -> num_power == 0 )
          cwarning
            ( T ,
/*LMSG*/"no power_pin specified"
            ) ;
        if ( the -> num_ground == 0 )
          cwarning
```

Copyright 1989
Logic Modeling Systems

SOURCE PROGRAM shellswm/Hconst.c | DATE 5/23/89 | TIME 4:42:18 pm | PAGE # 10/10

SOURCE TEXT

```
            ( T ,
/*LMSG*/"no ground_pin specified"
            ) ;
    } /* end device-level defaults processing */

    /*in walk_2 we:
        process package mapping
          declare pin numbers
    */
    for ( k = 1 ; k <= kids ; ++k )
      walk_2 ( subtree ( k , T ) ) ;
    if ( the -> has_package_map == 0 )
      cerror
        ( T ,
/*LMSG*/"no package_mapping specified"
        ) ;

    /*in walk_3 we:
        fill pin array and attribute arrays
          declare pin names
    */
    pin_seen =
      the -> num_in + the -> num_out + the -> num_io +
      the -> num_power + the -> num_ground + the -> num_nc ;
    the -> pins = allo__pins ( pin_seen ) ;
    for ( k = 0 ; k < pin_seen ; ++k )
      { the -> pins [ k ] . attr = NULL ;
        the -> pins [ k ] . timing_list = NULL ;
      }
    for ( k = 1 ; k <= kids ; ++k )
      walk_3 ( subtree ( k , T ) ) ;
ASSERT(the->pin_cnt==pin_seen);

    /*in walk_4 we:
        process initialization sequences
        process delays
        process pin name mappings
    */
    if ( the -> has_feedback_pins && ! the -> num_seqs )
      cerror
        ( T ,
/*LMSG*/"must use an initialization sequence to have a feedback signal"
        ) ;
    the -> sequences = allo_sequences ( the -> num_seqs ) ;
    for ( k = 1 ; k <= kids ; ++k )
      walk_4 ( subtree ( k , T ) ) ;
ASSERT(the->reset_cnt==the->num_seqs);

    /* assign pin numbers */
    if ( ! lm_Herrors ( ) )
      for ( k = 0 ; k < the -> apin_cnt ; ++k )
        { ( void ) sprintf ( buf , "%d" , k ) ;
          num = strlook ( buf ) ;
          pin_seen = 0 ;
          while
            ( num != NULLSYM && ( pin = apin_number_of ( num ) ) != NULLSYM
            )
            { if
                ( ( pin = apin_name_of ( pin ) ) != NULLSYM &&
                  ( pin = pin_number_of ( pin ) ) != NULLSYM
                )
                if ( pin_seen )
                  { ( void ) sprintf ( buf , "%d" , k ) ;
                    cerror
                      ( T ,
/*LMSG*/"device adaptor pin number %s re-used by device signal name %s"
                        , buf ,
                        symtostr ( pin )
                      ) ;
                  }
                else
                  { pin_seen = 1 ;
                    pin_of = pin_name_of ( pin ) ;
                    while ( the -> pins [ pin_of ] . number < MAX_PINS )
                      ++pin_of ;
                    the -> pins [ pin_of ] . number = k ;
                  }
              num = prepend_underscore ( num , 1 ) ;
            }
        }

    if ( lm_Herrors ( ) )
      { strfree ( ) ;
        treefree ( ) ;
        free_the ( ) ;
        return NULL ;
      }
    return the ;
  } /* constrain */

/* end of Constrainer for MDL Processor */
```

Copyright 1989
Logic Modeling Systems

| SOURCE PROGRAM | DATE | TIME | PAGE # |
|---|---|---|---|
| shellswm/Hgen.c | 5/23/89 | 4:42:19 pm | 1/11 |

SOURCE TEXT

```
/* SCCS_ID: Hgen.c rev 3.1, 4/24/89 at 08:00:37     */

/*
 *  Generator for HMDL Processor
 */

# include "common.h"
# include "HMDL.h"
# include <strings.h>
# include "strng.h"
# include "Hparse.h"
# include "trees.h"
# include "Hconst.h"
# include "device.h"

# ifdef WRITE_DEVICE
# include <stdio.h>
# endif WRITE_DEVICE

# define EDGE_SKEW_TIME 5000 /* picoseconds */
# define MD_SETTLING_TIME 15000 /* picoseconds */
# define HD_SETTLING_TIME 0 /* picoseconds */

extern void free_device ( ) ;

static ushort zero = 0 ; /* used in ASSERTions */
static unsigned long
# ifdef WRITE_DEVICE
  offset , /* used in writing device structure */
# endif WRITE_DEVICE
  text_size ; /* size of text for writing device structure */
struct device *device ;

static DEVICE_SPEC *
allo_device ( )
  /* returns pointer to newly-allocated device structure */
  { DEVICE_SPEC *ptr ;
    ptr = ( DEVICE_SPEC * ) lm_malloc ( sizeof ( DEVICE_SPEC ) ) ;
    if ( ptr == NULL )
      { lm_Herror
          ( 1 ,
/*LMSG*/"out of memory on modeler (allo_device)"
          ) ;
          lm_Ffail ( ) ;
      }
    ptr -> device_name = NULL ;
    ptr -> modeler_name = NULL ;
    ptr -> pin_table = NULL ;
    ptr -> seq_table = NULL ;
    ptr -> timing_table = NULL ;
    ptr -> mtym_table = NULL ;
    return ptr ;
  } /* allo_device */

static PIN_SPEC *
allo_pins ( count )
  ushort count ;
  /* returns pointer to newly-allocated pin structure array of passed size */
  { PIN_SPEC *ptr , *p ;
    if ( count )
      ptr = ( PIN_SPEC * ) lm_malloc ( sizeof ( PIN_SPEC ) * count ) ;
    else
      return NULL ;
    if ( ptr == NULL )
      { lm_Herror
          ( 1 ,
/*LMSG*/"out of memory on modeler (allo_pins)"
          ) ;
          lm_Ffail ( ) ;
      }
    p = ptr ;
    while ( count-- )
      { p -> pin_name = NULL ;
        p -> pin_number = NULL ;
        p -> pin_alias = NULL ;
        p -> direction = NONE ;
        ++p ;
      }
    return ptr ;
  } /* allo_pins */

static TIMING_SPEC *
allo_timings ( count )
  ushort count ;
  /* returns pointer to newly-allocated timing structure array */
  { TIMING_SPEC *ptr ;
    if ( count )
      ptr = ( TIMING_SPEC * ) lm_malloc ( sizeof ( TIMING_SPEC ) * count ) ;
    else
      return NULL ;
    if ( ptr == NULL )
      { lm_Herror
          ( 1 ,
/*LMSG*/"out of memory on modeler (allo_timings)"
          ) ;
          lm_Ffail ( ) ;
      }
    return ptr ;
  } /* allo_timings */

static MIN_TYP_MAX *
allo_mtyms ( count )
  ushort count ;
  /* returns pointer to newly-allocated min-typ-max structure array */
  { MIN_TYP_MAX *ptr ;
    if ( count )
      ptr = ( MIN_TYP_MAX * ) lm_malloc ( sizeof ( MIN_TYP_MAX ) * count ) ;
    else
      return NULL ;
    if ( ptr == NULL )
      { lm_Herror
          ( 1 ,
/*LMSG*/"out of memory on modeler (allo_mtyms)"
          ) ;
          lm_Ffail ( ) ;
      }
    return ptr ;
  } /* allo_mtyms */

static SEQ_SPEC *
```

Copyright 1989
Logic Modeling Systems

| SOURCE PROGRAM | DATE | PAGE # |
|---|---|---|
| shellswm/Hgen.c | 5/23/89 TIME 4:42:19 pm | 2/12 |

LINE # SOURCE TEXT

```
allo_seqs ( count )
  ushort count ;
  /* returns pointer to newly-allocated sequence structure array */
  { SEQ_SPEC *ptr , *p ;
    if ( count )
      ptr = ( SEQ_SPEC * ) lm_malloc ( sizeof ( SEQ_SPEC ) * count ) ;
    else
      return NULL ;
    if ( ptr == NULL )
      { lm_Herror
          ( 1 ,
/*LMSC*/"out of memory on modeler (allo_seqs)"
          ) ;
        lm_Ffail ( ) ;
      }
    p = ptr ;
    while ( count-- )
      { p -> pre_bits = NULL ;
        p -> fb_bits = NULL ;
        p -> post_bits = NULL ;
        p++ -> seq_str = NULL ;
      }
    return ptr ;
  } /* allo_seqs */

static char *
allo_bits ( length )
  ushort length ;
  /* returns pointer to newly-allocated bit array of rounded-up length */
  { char *ptr ;
    --length ;
    length >>= 3 ;
    ++length ;
    ptr = lm_malloc ( length ) ;
    if ( ptr == NULL )
      { lm_Herror
          ( 1 ,
/*LMSC*/"out of memory on modeler (allo_bits)"
          ) ;
        lm_Ffail ( ) ;
      }
    text_size += length ;
    return ptr ;
  } /* allo_bits */

static char *
allo_string ( sym )
  symbol sym ;
  { char *str , *ret ;
    ushort len ;
    str = symtostr ( sym ) ;
    ret = lm_malloc ( len = strlen ( str ) + 1 ) ;
    if ( ret == NULL )
      { lm_Herror
          ( 1 ,
/*LMSC*/"out of memory on modeler (allo_string)"
          ) ;
        lm_Ffail ( ) ;
      }
    text_size += len ;
    ( void ) strcpy ( ret , str ) ;
    return ret ;
  } /* allo_string */

static ushort
is_dup_mtym ( dev , tim )
  struct dev *dev ;
  struct timing *tim ;
  /* searches timing specs on all pins in constrainer device structure */
  /* returns 1 iff the passed timing has the same min-typ-max values */
  { ushort i ;
    struct timing *t ;
    for ( i = 0 ; i < dev -> pin_cnt ; ++i )
      if ( dev -> pins [ i ] . number < MAX_PINS )
        { t = dev -> pins [ i ] . timing_list ;
          while ( t != NULL )
            { if ( t == tim )
                return 0 ;
              if
                ( t -> minimum == tim -> minimum &&
                  t -> typical == tim -> typical &&
                  t -> maximum == tim -> maximum
                )
                return 1 ;
              t = t -> next ;
            }
        }
ASSERT(zero);
    return 0 ;
  } /* is_dup_mtym */

static ushort
state_of ( state )
  symbol state ;
  /* maps constrainer states to device structure states */
  { switch ( state )
      { case NULLSYM :
          return NONE ;
        case C_low :
          return LOW ;
        case C_high :
          return HIGH ;
        case C_float :
          return FLOAT ;
        case C_valid :
          return VALID ;
        case C_any :
          return ANY ;
        default :
ASSERT(-zero);
          return 0 ;
      }
  } /* state_of */

static ushort
add_timing ( dev , d , tim , timings , mtyms )
  DEVICE_SPEC *dev ;
  struct dev *d ;
  struct timing *tim ;
  ushort
```

Copyright 1989 Logic Modeling Systems

SOURCE PROGRAM shellswm/Hgen.c | DATE 5/23/89 | TIME 4:42:19 pm | PAGE # 3/13

LINE # SOURCE TEXT

```
      timings ,
      mtyms ;
    /* adds the passed timing structure to the timings in the device structure */
    { ushort i ;
      TIMING_SPEC *t ;
      MIN_TYP_MAX *mtym ;
      t = dev -> timing_table + timings ;
      t -> minor_pin =
        tim -> minor_pin_name == NULLSYM ?
          MAX_PINS :
          d -> pins [ pin_name_of ( tim -> minor_pin_name ) ] . number ;
      t -> space = 0 ;
      t -> major_state = state_of ( tim -> major_state ) ;
      t -> minor_state = state_of ( tim -> minor_state ) ;
      for ( i = 0 ; i < mtyms ; ++i )
        { mtym = dev -> mtym_table + i ;
          if
            ( mtym -> minimum == tim -> minimum &&
              mtym -> typical == tim -> typical &&
              mtym -> maximum == tim -> maximum
            )
            { t -> mtym_index = i ;
              return 0 ;
            }
        }
      t -> mtym_index = mtyms ;
      mtym = dev -> mtym_table + mtyms ;
      mtym -> minimum = tim -> minimum ;
      mtym -> typical = tim -> typical ;
      mtym -> maximum = tim -> maximum ;
      return 1 ;
    } /* add_timing */

static ushort
valof ( sym )
    symbol sym ;
    /* returns the integer value of the passed symbol */
    { ushort val = 0 ;
      char *str = symtostr ( sym ) ;
      do
        { val *= 10 ;
          val += *str - '0' ;
        }
      while ( *++str != '\0' ) ;
      return val ;
    } /* valof */

static void
bitgen ( bits , index_addr , T )
    char *bits ;
    ushort *index_addr ;
    tree T ;
    /* generates the bit sequence for T into the passed character string */
    { ushort
        k ,
        kids ,
        count ;
      switch ( nameofnode ( T ) )
        { case P_NUM_ :
              count = valof ( textofnode ( T ) ) != 0 ;
              kids = *index_addr & 7 ;
              if ( kids == 0 )
                bits [ *index_addr >> 3 ] = count << 7 ;
              else
                bits [ *index_addr >> 3 ] |= count << ( 7 - kids ) ;
              *index_addr += 1 ;
              break ;
            case N_LIST :
              kids = kidcount ( T ) ;
              for ( k = 1 ; k <= kids ; ++k )
                bitgen ( bits , index_addr , subtree ( k , T ) ) ;
              break ;
            case N_REPEAT :
              count = valof ( textofnode ( subtree ( 1 , T ) ) ) ;
              while ( count-- )
                bitgen ( bits , index_addr , subtree ( 2 , T ) ) ;
              break ;
            default :
              lm_Herror
                ( 1 ,
/*LMSG*/"internal error: bitgen: bad node"
                ) ;
              lm_Pfail ( ) ;
        }
    } /* bitgen */

static char *
gen_bits ( len , T )
    ushort len ;
    tree T ;
    /* allocates, generates, and returns the bit sequence for T */
    { char *ret ;
      ushort ndex = 0 ;
      ret = allo_bits ( len ) ;
      bitgen ( ret , & ndex , T ) ;
ASSERT(ndex==len);
      return ret ;
    } /* gen_bits */

static ushort
map_drive ( drv )
    ushort drv ;
    /* maps constrainer drive types to device structure drive types */
    { switch ( drv )
        { case C_hard :
              return H_DRIVE ;
            case C_medium :
              return M_DRIVE ;
            case C_hard_medium :
              return HM_DRIVE ;
            default :
              lm_Herror
                ( 1 ,
/*LMSG*/"internal error: bad drive"
                ) ;
              return NO_DRIVE ;
        }
    } /* map_drive */

static ushort
```

Copyright 1989
Logic Modeling Systems

| SOURCE PROGRAM | DATE 5/23/89 | PAGE # |
|---|---|---|
| shellswm/Hgen.c | TIME 4:42:19 pm | 4/14 |

SOURCE TEXT

```
map_soft_drive ( val , w1 , w2 , w3 , w4 , round_up )
  ushort
    val ,
    w1 ,
    w2 ,
    w3 ,
    w4 ,
    round_up ;
  /* maps val into a 4-bit number based on the passed weights */
  { ushort ret ;
    ret = 0 ;
    if ( val >= w4 )
      { ret |= 8 ;
        val -= w4 ;
      }
    if ( val >= w3 )
      { ret |= 4 ;
        val -= w3 ;
      }
    if ( val >= w2 )
      { ret |= 2 ;
        val -= w2 ;
      }
    if ( val >= w1 )
      { ret |= 1 ;
        val -= w1 ;
      }
    if ( round_up && val > 0 && ret != 15 )
      ++ret ;
    return ret ;
  } /* map_soft_drive */

static void
edge_fall_filter ( bits , len )
  char *bits ;
  ushort len ;
  { ushort i , prev = 0 , byte , mod ;
    for ( i = 0 ; i < len ; ++i )
      { byte = i >> 3 ;
        mod = i & 7 ;
        if ( prev )
          { prev = ( bits [ byte ] >> ( 7 - mod ) ) & 1 ;
            bits [ byte ] ^= 1 << ( 7 - mod ) ;
          }
        else
          { prev = ( bits [ byte ] >> ( 7 - mod ) ) & 1 ;
            if ( prev )
              bits [ byte ] ^= 1 << ( 7 - mod ) ;
          }
      }
  } /* edge_fall_filter */

static void
edge_rise_filter ( bits , len )
  char *bits ;
  ushort len ;
  { ushort i , prev = 1 , byte , mod ;
    for ( i = 0 ; i < len ; ++i )
      { byte = i >> 3 ;
        mod = i & 7 ;
        if ( ! prev )
          { prev = ( bits [ byte ] >> ( 7 - mod ) ) & 1 ;
            bits [ byte ] ^= 1 << ( 7 - mod ) ;
          }
        else
          { prev = ( bits [ byte ] >> ( 7 - mod ) ) & 1 ;
            if ( ! prev )
              bits [ byte ] ^= 1 << ( 7 - mod ) ;
          }
      }
  } /* edge_rise_filter */

static ushort
seq_len ( T )
  tree T ;
  { ushort ret , i , kids ;
    kids = kidcount ( T ) ;
    switch ( nameofnode ( T ) )
      { case P_NUM_ : return strlen ( symtostr ( textofnode ( T ) ) ) ;
        case N_LIST :
          ret = 0 ;
          for ( i = 1 ; i <= kids ; ++i )
            ret += seq_len ( subtree ( i , T ) ) + ( i != 1 ) ;
          break ;
        case N_REPEAT :
        case N_FEEDBACK :
          ret = strlen ( symtostr ( textofnode ( subtree ( 1 , T ) ) ) ) ;
          ret += seq_len ( subtree ( 2 , T ) ) + 2 ;
          break ;
        default :
          lm_Serror
            ( 1 ,
/*LMSC*/"internal error: seq_len: bad node"
            ) ;
          lm_Ffail ( ) ;
      }
    return ret ;
  } /* seq_len */

static void
gen_str ( str , ndex , T )
  char *str ;
  ushort *ndex ;
  tree T ;
  { ushort i , kids ;
    char *s ;
    kids = kidcount ( T ) ;
    switch ( nameofnode ( T ) )
      { case P_NUM_ :
          s = symtostr ( textofnode ( T ) ) ;
          ( void ) strcpy ( str + *ndex , s ) ;
          *ndex += strlen ( s ) ;
          break ;
        case N_LIST :
          for ( i = 1 ; i <= kids ; ++i )
            { if ( i != 1 )
                ( void ) strcpy ( str + (*ndex)++ , "," ) ;
              gen_str ( str , ndex , subtree ( i , T ) ) ;
            }
          break ;
```

Copyright 1989 Logic Modeling Systems

| SOURCE PROGRAM | DATE | TIME | PAGE # |
|---|---|---|---|
| shellswm/Hgen.c | 5/23/89 | 4:42:19 pm | 5/15 |

SOURCE TEXT

```
        case N_REPEAT :
        case N_FEEDBACK :
          s = symtostr ( textofnode ( subtree ( 1 , T ) ) ) ;
          ( void ) strcpy ( str + *ndex , s ) ;
          *ndex += strlen ( s ) ;
          ( void ) strcpy ( str + (*ndex)++ , `,` ) ;
          gen_str ( str , ndex , subtree ( 2 , T ) ) ;
          ( void ) strcpy ( str + (*ndex)++ , ")" ) ;
          break ;
        default :
          lm_Rerror
            ( 1 ,
/*LMSG*/"internal error: gen_str: bad node"
            ) ;
          lm_Ffail ( ) ;
      }
  } /* gen_str */

static char *
gen_seq_str ( T )
  tree T ;
  { char *seq_str ;
    ushort len ;
    len = seq_len ( T ) ;
    seq_str = lm_malloc ( ++len ) ;
    text_size += len ;
    if ( seq_str == NULL )
      { lm_Rerror
          ( 1 ,
/*LMSG*/"out of memory on modeler (gen_seq_str)"
          ) ;
        lm_Ffail ( ) ;
      }
    len = 0 ;
    gen_str ( seq_str , &len , T ) ;
    return seq_str ;
  } /* gen_seq_str */

static void
generate ( t , dev )
  struct dev *t ;
  struct device *dev ;
  /* generates dev from t */
  { ushort
      i ,
      j ,
      fb ,
      ndex ,
      count ,
      mtyms ,
      timings ,
      iih_set ,
      iil_set ,
      last_cyc_set ;
    tree bits ;
    symbol text ;
    PIN_SPEC *pin ;
    struct timing *tim ;
    struct pin_attr *attr ;
    text_size = 0 ;
    dev -> device_name = allo_string ( t -> dev_name ) ;
    dev -> modeler_name =
      t -> mod_name == NULLSYM ?
        NULL :
        allo_string ( t -> mod_name ) ;
    dev -> timing_cnt =
      dev -> mtym_cnt =
        0 ;
    dev -> extra_data = NULL ;
    dev -> next_device = NULL ;
    dev -> clock_period1 = t -> clk_period1 ;
    dev -> clock_period2 = t -> clk_period2 == 0 ? -1 : t -> clk_period2 ;
    dev -> val = t -> Val * 1000 + 0.5 ;
    dev -> vah = t -> Vah * 1000 + 0.5 ;
    dev -> vlth = t -> Vlth * 1000 + 0.5 ;
    dev -> vhth = t -> Vhth * 1000 + 0.5 ;
    dev -> vil = t -> Vil * 1000 + 0.5 ;
    dev -> vih = t -> Vih * 1000 + 0.5 ;
    dev -> vcc = t -> Vcc * 1000 + 0.5 ;
    dev -> setup_time =
      t -> def_setup != UNDEFINED ? t -> def_setup + 0.5 : -1 ;
    dev -> hold_time =
      t -> def_hold != UNDEFINED ? t -> def_hold + 0.5 : -1 ;
    if ( t -> def_sample == UNDEFINED )
      dev -> five_state_sample = 0 ;
    else
      dev -> five_state_sample = t -> def_sample + 0.5 ;
    dev -> two_state_sample = 0 ; /* anything else here? */
    dev -> edge_skew_time = EDGE_SKEW_TIME ;
    dev -> md_settling_time = MD_SETTLING_TIME ;
    dev -> hd_settling_time = HD_SETTLING_TIME ;
    dev -> clock_type =
      t -> clk_type == C_internal ?
        INTERNAL :
        t -> clk_type == C_extl ?
          EXT1 :
          EXT2 ;
    dev -> device_type = t -> dev_type == C_public ? PUBLIC : PRIVATE ;
    dev -> fb_type = t -> rise_fb ? FEEDBACK_RISE : FEEDBACK_FALL ;
    dev -> dis_tim_check = t -> dis_tim_check ;
    dev -> inh_tim_measure = t -> inh_tim_measure ;
    dev -> ultra_fast = t -> ultra_fast ;
    dev -> use_default = t -> use_default ;
    dev -> default_delay . minimum = t -> min_default ;
    dev -> default_delay . typical = t -> typ_default ;
    dev -> default_delay . maximum = t -> max_default ;
    dev -> report_miss =
      the -> missing_delays == NULLSYM ?
        the -> delays_seen :
        the -> missing_delays == C_on ;
    dev -> report_iosc = the -> io_store_changes == C_on ;
    dev -> pin_table = allo_pins ( dev -> pin_cnt = t -> apin_cnt ) ;
    for ( i = 0 ; i < t -> pin_cnt ; ++i )
      if ( t -> pins [ i ] . number < MAX_PINS )
        { pin = dev -> pin_table + t -> pins [ i ] . number ;
ASSERT(pin->direction==NONE);
          iih_set = iil_set = last_cyc_set = 0 ;
          text = t -> pins [ i ] . alias ;
          pin -> pin_alias = text == NULLSYM ? NULL : allo_string ( text ) ;
          text = t -> pins [ i ] . pkg_name ;
```

Copyright 1989
Logic Modeling Systems

| SOURCE PROGRAM | DATE | TIME | PAGE # |
|---|---|---|---|
| shellswm/Hgen.c | 5/23/89 | 4:42:19 pm | 6/16 |

LINE # SOURCE TEXT

```
          pin -> pin_number = allo_string ( text ) ;
          text = t -> pins [ i ] . name ;
          pin -> pin_name = allo_string ( text ) ;
          pin -> trace_delay = t -> pins [ i ] . trace_delay ;
          switch ( nameofnode ( g_lookup ( text ) ) )
            { case N_IN_PINS :
                pin -> direction = IN ;
                pin -> in_seq_drive = H_DRIVE ;
                pin -> last_cyc_drive = H_DRIVE ;
                pin -> h_drive = ALWAYS_ON ;
                pin -> hm_drive = DRIVE_ON ;
                pin -> s_drive_low =
                  map_soft_drive ( 0 , 200 , 500 , 1200 , 3000 , 0 ) ;
                pin -> s_drive_hi =
                  map_soft_drive ( 0 , 100 , 500 , 1200 , 2000 , 0 ) ;
                break ;
              case N_OUT_PINS :
                pin -> direction = OUT ;
                pin -> in_seq_drive = NO_DRIVE ;
                pin -> last_cyc_drive = NO_DRIVE ;
                pin -> h_drive = GATED_ON ;
                pin -> hm_drive = DRIVE_OFF ;
                pin -> s_drive_low =
                  map_soft_drive
                    ( ( ushort ) ( t -> Isl * 1000 + 0.5 ) ,
                      200 ,
                      500 ,
                      1200 ,
                      3000 ,
                      0
                    ) ;
                pin -> s_drive_hi =
                  map_soft_drive ( 0 , 100 , 500 , 1200 , 2000 , 0 ) ;
                break ;
              case N_IO_PINS :
                pin -> direction = IO ;
                pin -> in_seq_drive = t -> ultra_fast ? HM_DRIVE : M_DRIVE ;
                pin -> last_cyc_drive = pin -> in_seq_drive ;
                pin -> h_drive = GATED_ON ;
                pin -> hm_drive = DRIVE_ON ;
                pin -> s_drive_low =
                  map_soft_drive
                    ( ( ushort ) ( t -> Isl * 1000 + 0.5 ) ,
                      200 ,
                      500 ,
                      1200 ,
                      3000 ,
                      0
                    ) ;
                pin -> s_drive_hi =
                  map_soft_drive
                    ( ( ushort ) ( t -> Ish * 1000 + 0.5 ) ,
                      100 ,
                      500 ,
                      1200 ,
                      2000 ,
                      0
                    ) ;
                break ;
              case N_POWER_PINS :
                pin -> direction = POWER ;
                continue ;
              case N_GROUND_PINS :
                pin -> direction = GROUND ;
                continue ;
              case N_NC_PINS :
                pin -> direction = NC ;
                continue ;
              default :
ASSERT(-(-zero));
                break ;
            }
          pin -> clk_edge1 = 0 ;
          pin -> clk_edge2 = 0 ;
          pin -> clk_format = NRZ ;
          pin -> pin_class = DATA ;
          pin -> feeds_back = 0 ;
          pin -> kept_alive = 0 ;
          pin -> pulled_up = 0 ;
          pin -> pulled_down = 0 ;
          for ( j = 0 ; j < t -> pins [ i ] . num_attrs ; ++j )
            { attr = t -> pins [ i ] . attr + j ;
              switch ( attr -> use_flag )
                { case ID_ATTR :
                    switch ( attr -> attr . id )
                      { case C_eval :
                          pin -> pin_class = EVAL ;
                          break ;
                        case C_store :
                          pin -> pin_class = STORE ;
                          pin -> clk_format = DNRZ ;
                          break ;
                        case C_edge_rise :
                          pin -> pin_class = STORE ;
                          pin -> clk_format =
                            pin -> direction == IO ? DNRZ : R1 ;
                          break ;
                        case C_edge_fall :
                          pin -> pin_class [illegible]RE ;
                          pin -> clk_format =
                            pin -> direction == IO ? DNRZ : R0 ;
                          break ;
                        case C_feedback :
                          pin -> feeds_back = 1 ;
                          break ;
                        case C_keepalive :
                          pin -> kept_alive = 1 ;
                          break ;
                        case C_pull_up :
                          pin -> pulled_up = 1 ;
                          if ( ! iih_set )
                            pin -> s_drive_hi =
                              map_soft_drive
                                ( ( ushort )
                                    ( 2000 * ( t -> Vcc / 5 ) + 0.5
                                    ) ,
                                  100 ,
                                  500 ,
                                  1200 ,
                                  2000 ,
```

Copyright 1989
Logic Modeling Systems

SOURCE TEXT

```
                              0
                            ) ;
                      if ( ! iil_set )
                        pin -> s_drive_low =
                          map_soft_drive
                            ( ( ushort )
                                ( 2000 * ( t -> Vcc / 5 ) + 0.5
                                ) ,
                              200 ,
                              500 ,
                              1200 ,
                              3000 ,
                              1
                            ) ;
                      break ;
                    case C_pull_down :
                      pin -> pulled_down = 1 ;
                      if ( ! iih_set )
                        pin -> s_drive_hi =
                          map_soft_drive
                            ( ( ushort )
                                ( 2000 * ( t -> Vcc / 5 ) + 0.5
                                ) ,
                              100 ,
                              500 ,
                              1200 ,
                              2000 ,
                              1
                            ) ;
                      if ( ! iil_set )
                        pin -> s_drive_low =
                          map_soft_drive
                            ( ( ushort )
                                ( 2000 * ( t -> Vcc / 5 ) + 0.5
                                ) ,
                              200 ,
                              500 ,
                              1200 ,
                              3000 ,
                              0
                            ) ;
                      break ;
                    default :
                      lm_Herror
                        ( 1 ,
/*LMSG*/"internal error: bad id_attr"
                        ) ;
                      break ;
                  }
                break ;
              case CURRENT_SPEC :
                switch ( attr -> attr . cur_spec . cur )
                  { case C_Iil :
                      iil_set = 1 ;
                      pin -> s_drive_low =
                        map_soft_drive
                          ( ( ushort )
                              ( attr -> attr . cur_spec . val * 1900 + 0.5
                              ) ,
                            200 ,
                            500 ,
                            1200 ,
                            3000 ,
                            1
                          ) ;
                      break ;
                    case C_Iih :
                      iih_set = 1 ;
                      pin -> s_drive_hi =
                        map_soft_drive
                          ( ( ushort )
                              ( attr -> attr . cur_spec . val * 1900 + 0.5
                              ) ,
                            100 ,
                            500 ,
                            1200 ,
                            2000 ,
                            1
                          ) ;
                      break ;
                    case C_Iol :
                    case C_Ioh :
                      break ;
                    case C_pull_up :
                      pin -> pulled_up = 1 ;
                      if ( ! iih_set )
                        { pin -> s_drive_hi =
                            map_soft_drive
                              ( ( ushort )
                                  ( 2000 *
                                    ( t -> Vcc /
                                      ( attr -> attr . cur_spec . val /
                                        1000.0
                                      )
                                    ) + 0.5
                                  ) ,
                                100 ,
                                500 ,
                                1200 ,
                                2000 ,
                                1
                              ) ;
                          if ( pin -> s_drive_hi == 0 )
                            pin -> s_drive_hi = 1 ;
                        }
                      if ( ! iil_set )
                        { pin -> s_drive_low =
                            map_soft_drive
                              ( ( ushort )
                                  ( 2000 *
                                    ( t -> Vcc /
                                      ( attr -> attr . cur_spec . val /
                                        1000.0
                                      )
                                    ) + 0.5
                                  ) ,
                                200 ,
                                500 ,
                                1200 ,
                                3000 ,
```

Copyright 1989
Logic Modeling Systems

SOURCE PROGRAM shellswm/Hgen.c | DATE 5/23/89 | TIME 4:42:19 pm | PAGE # 8/18

LINE # SOURCE TEXT

```
                                1
                              ) ;
                            if ( pin -> s_drive_low == 0 )
                              pin -> s_drive_low = 1 ;
                          }
                        break ;
                      case C_pull_down :
                        pin -> pulled_down = 1 ;
                        if ( ! iih_set )
                          { pin -> s_drive_hi =
                              map_soft_drive
                                ( ( ushort )
                                    ( 2000 *
                                      ( t -> Vcc /
                                        ( attr -> attr . cur_spec . val /
                                          1000.0
                                        )
                                      ) + 0.5
                                    ) ,
                                  100 ,
                                  500 ,
                                  1200 ,
                                  2000 ,
                                  1
                                ) ;
                            if ( pin -> s_drive_hi == 0 )
                              pin -> s_drive_hi = 1 ;
                          }
                        if ( ! iil_set )
                          { pin -> s_drive_low =
                              map_soft_drive
                                ( ( ushort )
                                    ( 2000 *
                                      ( t -> Vcc /
                                        ( attr -> attr . cur_spec . val /
                                          1000.0
                                        )
                                      ) + 0.5
                                    ) ,
                                  200 ,
                                  500 ,
                                  1200 ,
                                  3000 ,
                                  1
                                ) ;
                            if ( pin -> s_drive_low == 0 )
                              pin -> s_drive_low = 1 ;
                          }
                        break ;
                      default :
                        lm_Berror
                          ( 1 ,
/*LMSG*/"internal error: bad cur spec"
                          ) ;
                        break ;
                    }
                  break ;
                case CYCLE_SPEC :
                  switch ( attr -> attr . cyc_spec . seq )
                    { case C_in_sequence :
                        pin -> in_seq_drive =
                          map_drive ( attr -> attr . cyc_spec . drv ) ;
                        break ;
                      case C_last_cycle :
                        pin -> last_cyc_drive =
                          map_drive ( attr -> attr . cyc_spec . drv ) ;
                        last_cyc_set = 1 ;
                        break ;
                      default :
                        lm_Berror
                          ( 1 ,
/*LMSG*/"internal error: bad seq spec"
                          ) ;
                        break ;
                    }
                  break ;
                default :
                  lm_Berror
                    ( 1 ,
/*LMSG*/"internal error: bad use_flag"
                    ) ;
                  break ;
              }
          }
/*h_drive?*/
/*hm_drive?*/
          tim = t -> pins [ i ] . timing_list ;
          while ( tim != NULL )
            { ++ dev -> timing_cnt ;
              if ( ! is_dup_mtym ( t , tim ) )
                ++ dev -> mtym_cnt ;
              tim = tim -> next ;
            }
          if
            ( pin -> direction == IO &&
              pin -> pin_class == STORE &&
              ! last_cyc_set
            )
            pin ->    .t_cyc_drive = NO_DRIVE ;
        }
    dev -> timing_table = allo_timings ( dev -> timing_cnt ) ;
    dev -> mtym_table = allo_mtyms ( dev -> mtym_cnt ) ;
    timings =
      mtyms =
        0 ;
    for ( i = 0 ; i < t -> pin_cnt ; ++i )
      if ( t -> pins [ i ] . number < MAX_PINS )
        { pin = dev -> pin_table + t -> pins [ i ] . number ;
ASSERT(pin->direction!=NONE);
          if
            ( pin -> direction == POWER ||
              pin -> direction == GROUND ||
              pin -> direction == NC
            )
            continue ;
          count = 0 ;
          pin -> delay_table = dev -> timing_table + timings ;
          tim = t -> pins [ i ] . timing_list ;
          while ( tim != NULL )
            { mtyms += add_timing ( dev , t , tim , timings , mtyms ) ;
```

Copyright 1989
Logic Modeling Systems

| SOURCE PROGRAM | DATE | 5/23/89 | PAGE # |
|---|---|---|---|
| shellswm/Hgen.c | TIME | 4:42:19 pm | 9/19 |

LINE # SOURCE TEXT

```
                ++count ;
                ++timings ;
                tim = tim -> next ;
              }
            pin -> delay_cnt = count ;
          }
ASSERT(timings==dev->timing_cnt);
ASSERT(mtyms==dev->mtym_cnt);
    dev -> seq_table = allo_seqs ( dev -> seq_cnt = t -> num_seqs ) ;
    dev -> pre_seq_len = t -> pre_seq_length ;
    dev -> fb_seq_len = t -> fb_seq_length ;
    dev -> post_seq_len = t -> post_seq_length ;
    for ( i = 0 ; i < t -> num_seqs ; ++i )
      { dev -> seq_table [ i ] . pin_number =
          t -> pins
            [ pin_name_of ( t -> sequences [ i ] . pin_name )
            ] . number ;
        fb = t -> sequences [ i ] . fb_kid ;
        bits = t -> sequences [ i ] . bits ;
        if ( fb == 0 )
          { dev -> seq_table [ i ] . pre_bits =
              gen_bits ( dev -> pre_seq_len , bits ) ;
            dev -> seq_table [ i ] . fb_bits = NULL ;
            dev -> seq_table [ i ] . post_bits = NULL ;
          }
        else if ( fb == 1 )
          { dev -> seq_table [ i ] . pre_bits = NULL ;
            dev -> seq_table [ i ] . fb_bits =
              gen_bits
                ( dev -> fb_seq_len ,
                  subtree ( 2 , subtree ( 1 , bits ) )
                ) ;
            if ( kidcount ( bits ) > 1 )
              { dev -> seq_table [ i ] . post_bits =
                  allo_bits ( dev -> post_seq_len ) ;
                ndex = 0 ;
                for ( count = 2 ; count <= kidcount ( bits ) ; ++count )
                  bitgen
                    ( dev -> seq_table [ i ] . post_bits ,
                      & ndex ,
                      subtree ( count , bits )
                    ) ;
ASSERT(ndex==dev->post_seq_len);
              }
            else
              dev -> seq_table [ i ] . post_bits = NULL ;
          }
        else
          { dev -> seq_table [ i ] . pre_bits =
              allo_bits ( dev -> pre_seq_len ) ;
            ndex = 0 ;
            for ( count = 1 ; count < fb ; ++count )
              bitgen
                ( dev -> seq_table [ i ] . pre_bits ,
                  & ndex ,
                  subtree ( count , bits )
                ) ;
ASSERT(ndex==dev->pre_seq_len);
            dev -> seq_table [ i ] . fb_bits =
              gen_bits
                ( dev -> fb_seq_len ,
                  subtree ( 2 , subtree ( fb , bits ) )
                ) ;
            if ( kidcount ( bits ) > fb )
              { dev -> seq_table [ i ] . post_bits =
                  allo_bits ( dev -> post_seq_len ) ;
                ndex = 0 ;
                for ( count = fb + 1 ; count <= kidcount ( bits ) ; ++count )
                  bitgen
                    ( dev -> seq_table [ i ] . post_bits ,
                      & ndex ,
                      subtree ( count , bits )
                    ) ;
ASSERT(ndex==dev->post_seq_len);
              }
            else
              dev -> seq_table [ i ] . post_bits = NULL ;
          }
        dev -> seq_table [ i ] . seq_str =
          gen_seq_str ( t -> sequences [ i ] . bits ) ;
        if
          ( dev -> pin_table
              [ dev -> seq_table [ i ] . pin_number
              ] . clk_format == R0
          )
          { edge_fall_filter
              ( dev -> seq_table [ i ] . pre_bits ,
                dev -> pre_seq_len
              ) ;
            edge_fall_filter
              ( dev -> seq_table [ i ] . fb_bits ,
                dev -> fb_seq_len
              ) ;
            edge_fall_filter
              ( dev -> seq_table [ i ] . post_bits ,
                dev -> post_seq_len
              ) ;
          }
        else if
          ( dev -> pin_table
              [ dev -> seq_table [ i ] . pin_number
              ] . clk_format == R1
          )
          { edge_rise_filter
              ( dev -> seq_table [ i ] . pre_bits ,
                dev -> pre_seq_len
              ) ;
            edge_rise_filter
              ( dev -> seq_table [ i ] . fb_bits ,
                dev -> fb_seq_len
              ) ;
            edge_rise_filter
              ( dev -> seq_table [ i ] . post_bits ,
                dev -> post_seq_len
              ) ;
          }
      }
  } /* generate */

# ifdef WRITE_DEVICE
```

Copyright 1989
Logic Modeling Systems

SOURCE PROGRAM shellswm/Hgen.c | DATE 5/23/89 | TIME 4:42:19 pm | PAGE # 10/20

LINE # SOURCE TEXT

```
static void
write_str ( str , F )
  char *str ;
  FILE *F ;
  /* writes passed string to passed file */
  { ( void ) fwrite ( str , strlen ( str ) , 1 , F ) ;
  } /* write_str */

ushort
write_device ( F , dev )
  FILE *F ;
  struct device *dev ;
  /* writes the passed device to the passed file */
  { ushort
      i ,
      len1 ,
      len2 ,
      len3 ;
    unsigned long
      text_offset ,
      dev_size ,
      pin_size ,
      seq_size ,
      time_size ;
    char
      *save1 ,
      *save2 ,
      *save5 ,
      *save9 ,
      *save10 ;
    PIN_SPEC *save3 ;
    SEQ_SPEC *save4 ;
    TIMING_SPEC *save6 ;
    MIN_TYP_MAX *save7 ;
    text_offset =
      ( dev_size = sizeof ( DEVICE_SPEC ) ) +
      ( pin_size = dev -> pin_cnt * sizeof ( PIN_SPEC ) ) +
      ( seq_size = dev -> seq_cnt * sizeof ( SEQ_SPEC ) ) +
      ( time_size = dev -> timing_cnt * sizeof ( TIMING_SPEC ) ) +
      dev -> mtym_cnt * sizeof ( MIN_TYP_MAX ) ;
    offset = text_offset + text_size ;
    ( void ) fwrite ( ( char * ) & offset , sizeof ( offset ) , 1 , F ) ;
  /*(void)fprintf(stderr,"offset=%ld\n",offset);*/
    save1 = dev -> device_name ;
    dev -> device_name = ( char * ) text_offset ;
    text_offset += strlen ( save1 ) + 1 ;
    save2 = dev -> modeler_name ;
    if ( save2 != NULL )
      { dev -> modeler_name = ( char * ) text_offset ;
        text_offset += strlen ( save2 ) + 1 ;
      }
    save3 = dev -> pin_table ;
    dev -> pin_table = ( PIN_SPEC * ) ( offset = dev_size ) ;
    save4 = dev -> seq_table ;
    dev -> seq_table = ( SEQ_SPEC * ) ( offset += pin_size ) ;
    save6 = dev -> timing_table ;
    dev -> timing_table = ( TIMING_SPEC * ) ( offset += seq_size ) ;
    save7 = dev -> mtym_table ;
    dev -> mtym_table = ( MIN_TYP_MAX * ) ( offset += time_size ) ;
    ( void ) fwrite ( ( char * ) dev , sizeof ( *dev ) , 1 , F ) ;
    dev -> device_name = save1 ;
    dev -> modeler_name = save2 ;
    dev -> pin_table = save3 ;
    dev -> seq_table = save4 ;
    dev -> timing_table = save6 ;
    dev -> mtym_table = save7 ;
  /*(void)fprintf(stderr,"about to write pins\n");*/
    offset -= time_size ;
    for ( i = 0 ; i < dev -> pin_cnt ; ++i )
      { save3 = dev -> pin_table + i ;
        if ( save3 -> direction == NONE )
          ( void ) fwrite ( ( char * ) save3 , sizeof ( *save3 ) , 1 , F ) ;
        else
          { save1 = save3 -> pin_name ;
            save2 = save3 -> pin_number ;
            save5 = save3 -> pin_alias ;
            save3 -> pin_name = ( char * ) text_offset ;
            text_offset += strlen ( save1 ) + 1 ;
            save3 -> pin_number = ( char * ) text_offset ;
            text_offset += strlen ( save2 ) + 1 ;
            if ( save5 != NULL )
              { save3 -> pin_alias = ( char * ) text_offset ;
                text_offset += strlen ( save5 ) + 1 ;
              }
            if
              ( save3 -> direction != POWER &&
                save3 -> direction != GROUND &&
                save3 -> direction != NC
              )
              { save6 = save3 -> delay_table ;
                save3 -> delay_table =
                  ( TIMING_SPEC * ) offset + ( save6 - dev -> timing_table ) ;
                ( void ) fwrite
                  ( ( char * ) save3 , sizeof ( *save3 ) , 1 , F
                  ) ;
                save3 -> delay_table = save6 ;
              }
            else
              ( void ) fwrite ( ( char * ) save3 , sizeof ( *save3 ) , 1 , F ) ;
            save3 -> pin_name = save1 ;
            save3 -> pin_number = save2 ;
            save3 -> pin_alias = save5 ;
          }
      }
  /*(void)fprintf(stderr,"about to write seqs\n");*/
    len1 = ( ( dev -> pre_seq_len - 1 ) >> 3 ) + 1 ;
    len2 = ( ( dev -> fb_seq_len - 1 ) >> 3 ) + 1 ;
    len3 = ( ( dev -> post_seq_len - 1 ) >> 3 ) + 1 ;
    for ( i = 0 ; i < dev -> seq_cnt ; ++i )
      { save4 = dev -> seq_table + i ;
        if ( len1 )
          { save1 = save4 -> pre_bits ;
            save4 -> pre_bits = ( char * ) text_offset ;
            text_offset += len1 ;
          }
        if ( len2 )
          { save2 = save4 -> fb_bits ;
            save4 -> fb_bits = ( char * ) text_offset ;
            text_offset += len2 ;
          }
```

Copyright 1989 Logic Modeling Systems

| SOURCE PROGRAM | DATE | PAGE # |
|---|---|---|
| shellswm/Hgen.c | 5/23/89 | 11/21 |
| | TIME 4:42:19 pm | |

SOURCE TEXT

```
          if ( len3 )
            { save9 = save4 -> post_bits ;
              save4 -> post_bits = ( char * ) text_offset ;
              text_offset += len3 ;
            }
          save10 = save4 -> seq_str ;
          save4 -> seq_str = ( char * ) text_offset ;
          text_offset += strlen ( save10 ) + 1 ;
          ( void ) fwrite ( ( char * ) save4 , sizeof ( *save4 ) , 1 , F ) ;
          if ( len1 )
            save4 -> pre_bits = save1 ;
          if ( len2 )
            save4 -> fb_bits = save2 ;
          if ( len3 )
            save4 -> post_bits = save9 ;
          save4 -> seq_str = save10 ;
        }
  /*(void)fprintf(stderr,"about to write timings\n");*/
    ( void ) fwrite
      ( ( char * ) dev -> timing_table ,
        sizeof ( dev -> timing_table [ 0 ] ) ,
        ( int ) dev -> timing_cnt ,
        F
      ) ;
  /*(void)fprintf(stderr,"about to write mtyms\n");*/
    ( void ) fwrite
      ( ( char * ) dev -> mtym_table ,
        sizeof ( dev -> mtym_table [ 0 ] ) ,
        ( int ) dev -> mtym_cnt ,
        F
      ) ;
  /*(void)fprintf(stderr,"about to write text\n");*/
    write_str ( dev -> device_name , F ) ;
    if ( dev -> modeler_name != NULL )
      write_str ( dev -> modeler_name , F ) ;
    for ( i = 0 ; i < dev -> pin_cnt ; ++i )
      if ( dev -> pin_table [ i ] . direction != NONE )
        { write_str ( dev -> pin_table [ i ] . pin_name , F ) ;
          write_str ( dev -> pin_table [ i ] . pin_number , F ) ;
          if ( dev -> pin_table [ i ] . pin_alias != NULL )
            write_str ( dev -> pin_table [ i ] . pin_alias , F ) ;
        }
    for ( i = 0 ; i < dev -> seq_cnt ; ++i )
      { if ( dev -> pre_seq_len )
            ( void ) fwrite
              ( dev -> seq_table [ i ] . pre_bits ,
                ( int ) len1 ,
                1 ,
                F
              ) ;
          if ( dev -> fb_seq_len )
            ( void ) fwrite
              ( dev -> seq_table [ i ] . fb_bits ,
                ( int ) len2 ,
                1 ,
                F
              ) ;
          if ( dev -> post_seq_len )
            ( void ) fwrite
              ( dev -> seq_table [ i ] . post_bits ,
                ( int ) len3 ,
                1 ,
                F
              ) ;
          write_str ( de' -> seq_table [ i ] . seq_str , F ) ;
      }
  /*(void)fprintf(stderr,"about to close\n");*/
    return fclose ( F , == 0 ;
  } /* write_device */
# endif WRITE_DEVICE

void
free_dev ( dev )
  struct dev *dev ;
  { ushort i ;
    struct pins *pin ;
    struct pin_attr *attr , *prev_attr ;
    struct timing *tim ;
    prev_attr = NULL ;
    if ( dev == NULL )
      return ;
    for ( i = 0 ; i < dev -> pin_cnt ; ++i )
      { pin = dev -> pins + i ;
        attr = pin -> attr ;
        if ( attr != prev_attr )
          { prev_attr = attr ;
            if ( attr != NULL )
              ( void ) lm_free ( ( char * ) attr ) ;
          }
        while ( pin -> timing_list != NULL )
          { tim = pin -> timing_list -> next ;
            ( void ) lm_free ( ( char * ) pin -> timing_list ) ;
            pin -> timing_list = tim ;
          }
      }
    ( void ) lm_free ( ( char * ) dev -> pins ) ;
    if ( dev -> sequences != NULL )
      ( void ) lm_free ( ( char * ) dev -> sequences ) ;
    ( void ) lm_free ( ( char * ) dev ) ;
  } /* free_dev */

void
init_the_device ( )
  { device = NULL ;
  } /* init_the_device */

void
free_the_device ( )
  { free_device ( device ) ;
  } /* free_the_device */

struct device *
gen ( t )
  struct dev *t ;
  /* returns pointer to device structure generated from passed device */
  { device = allo_device ( ) ;
    generate ( t , device ) ;
    free_dev ( t ) ;
    strfree ( ) ;
    treefree ( ) ;
```

Copyright 1989
Logic Modeling Systems

| SOURCE PROGRAM | DATE | PAGE # |
|---|---|---|
| shellswm/Hgen.c | 5/23/89 | 12/22 |
| | TIME 4:42:19 pm | |

SOURCE TEXT

```
    return device ;
  } /* gen */

/* end of Generator for SMBL Processor */
```

Copyright 1989
Logic Modeling Systems

| SOURCE PROGRAM | DATE | TIME | PAGE # |
|---|---|---|---|
| shellswm/Hparse.c | 5/23/89 | 4:42:21 pm | 1/23 |

LINE # SOURCE TEXT

```
/* SCCS_ID: Hparse.c rev 3.1, 4/24/89 at 08:00:42     */

/* recursive descent parser generated from "HMBL.g"

*/

# include <strings.h>
# include "strng.h"
# include "trees.h"

extern void
  scan ( ) ,
  syntax_error ( ) ;

extern symbol
  tok_name ,
  tok_text ;
# include "Hparse.h"

# define Parse_Statement_list Q_1
# define Parse_Statement Q_2
# define Parse_Name Q_3
# define Parse_Opt_id Q_4
# define Parse_Unit Q_5
# define Parse_Opt_dash_unit Q_6
# define Parse_Opt_tech_spec_list Q_7
# define Parse_Init_seq_list Q_8
# define Parse_Pin_corr_list Q_9
# define Parse_From_list Q_10
# define Parse_Timing Q_11
# define Parse_Package_mapping_list Q_12
# define Parse_Adapter_mapping_list Q_13
# define Parse_Pin_name_mapping_list Q_14
# define Parse_Tech_spec_list Q_15
# define Parse_Tech_spec Q_16
# define Parse_Signed_num Q_17
# define Parse_Init_seq Q_18
# define Parse_Pin_name_list Q_19
# define Parse_Init_list Q_20
# define Parse_Init_value_list Q_21
# define Parse_Init_value Q_22
# define Parse_Pin_corr Q_23
# define Parse_Names Q_24
# define Parse_Opt_pin_attr_list Q_25
# define Parse_Pin_name Q_26
# define Parse_Subscript Q_27
# define Parse_Opt_colon_num Q_28
# define Parse_Name_list Q_29
# define Parse_Pin_attr_list Q_30
# define Parse_Pin_attr Q_31
# define Parse_From Q_32
# define Parse_Pin_state Q_33
# define Parse_To_list Q_34
# define Parse_To Q_35
# define Parse_Spec Q_36
# define Parse_Package_mapping Q_37
# define Parse_Adapter_mapping Q_38
# define Parse_Pin_name_mapping Q_39
# define Parse_Pin_names Q_40

static unsigned short
  Parse_Statement_list ( ) ,
  Parse_Statement ( ) ,
  Parse_Name ( ) ,
  Parse_Opt_id ( ) ,
  Parse_Unit ( ) ,
  Parse_Opt_dash_unit ( ) ,
  Parse_Opt_tech_spec_list ( ) ,
  Parse_Init_seq_list ( ) ,
  Parse_Pin_corr_list ( ) ,
  Parse_From_list ( ) ,
  Parse_Timing ( ) ,
  Parse_Package_mapping_list ( ) ,
  Parse_Adapter_mapping_list ( ) ,
  Parse_Pin_name_mapping_list ( ) ,
  Parse_Tech_spec_list ( ) ,
  Parse_Tech_spec ( ) ,
  Parse_Signed_num ( ) ,
  Parse_Init_seq ( ) ,
  Parse_Pin_name_list ( ) ,
  Parse_Init_list ( ) ,
  Parse_Init_value_list ( ) ,
  Parse_Init_value ( ) ,
  Parse_Pin_corr ( ) ,
  Parse_Names ( ) ,
  Parse_Opt_pin_attr_list ( ) ,
  Parse_Pin_name ( ) ,
  Parse_Subscript ( ) ,
  Parse_Opt_colon_num ( ) ,
  Parse_Name_list ( ) ,
  Parse_Pin_attr_list ( ) ,
  Parse_Pin_attr ( ) ,
  Parse_From ( ) ,
  Parse_Pin_state ( ) ,
  Parse_To_list ( ) ,
  Parse_To ( ) ,
  Parse_Spec ( ) ,
  Parse_Package_mapping ( ) ,
  Parse_Adapter_mapping ( ) ,
  Parse_Pin_name_mapping ( ) ,
  Parse_Pin_names ( ) ;

void
pinit ( )
  { strinit ( ) ; treeinit ( ) ;
    ( void ) strtosym ( "END_OF_FILE" ) ;
    ( void ) strtosym ( "_ID_" ) ;
    ( void ) strtosym ( "_NUM_" ) ;
    ( void ) strtosym ( "_STR_" ) ;
    ( void ) strtosym ( "NAME" ) ;
    ( void ) strtosym ( "FAST" ) ;
    ( void ) strtosym ( "USAGE" ) ;
    ( void ) strtosym ( "REPORT" ) ;
    ( void ) strtosym ( "MODELER" ) ;
    ( void ) strtosym ( "CLOCK_TYPE" ) ;
    ( void ) strtosym ( "DIS_TIM_CHECK" ) ;
    ( void ) strtosym ( "INH_TIM_MEASURE" ) ;
    ( void ) strtosym ( "HOLD_TIME" ) ;
    ( void ) strtosym ( "SETUP_TIME" ) ;
    ( void ) strtosym ( "SAMPLE_TIME" ) ;
```

Copyright 1989
Logic Modeling Systems

| SOURCE PROGRAM | DATE | PAGE # |
|---|---|---|
| shellswm/Hparse.c | 5/23/89 | 2/24 |
| | TIME 4:42:21 pm | |

LINE # SOURCE TEXT

```
    ( void ) strtosym ( "SPEED" ) ;
    ( void ) strtosym ( "TECHNOLOGY" ) ;
    ( void ) strtosym ( "INITIALIZE" ) ;
    ( void ) strtosym ( "IN_PINS" ) ;
    ( void ) strtosym ( "IO_PINS" ) ;
    ( void ) strtosym ( "NC_PINS" ) ;
    ( void ) strtosym ( "OUT_PINS" ) ;
    ( void ) strtosym ( "POWER_PINS" ) ;
    ( void ) strtosym ( "GROUND_PINS" ) ;
    ( void ) strtosym ( "DELAY" ) ;
    ( void ) strtosym ( "DEFAULT_DELAY" ) ;
    ( void ) strtosym ( "PACKAGE" ) ;
    ( void ) strtosym ( "ADAPTER" ) ;
    ( void ) strtosym ( "PIN_MAP" ) ;
    ( void ) strtosym ( "UNIT" ) ;
    ( void ) strtosym ( "TECH_SPEC" ) ;
    ( void ) strtosym ( "NEGATIVE" ) ;
    ( void ) strtosym ( "INIT_SEQ" ) ;
    ( void ) strtosym ( "LIST" ) ;
    ( void ) strtosym ( "REPEAT" ) ;
    ( void ) strtosym ( "FEEDBACK" ) ;
    ( void ) strtosym ( "PIN_CORR" ) ;
    ( void ) strtosym ( "PIN_NAME" ) ;
    ( void ) strtosym ( "NAMES" ) ;
    ( void ) strtosym ( "ATTR" ) ;
    ( void ) strtosym ( "FROM" ) ;
    ( void ) strtosym ( "TO" ) ;
    ( void ) strtosym ( "PIN_STATE" ) ;
    ( void ) strtosym ( "TIMING" ) ;
    ( void ) strtosym ( "SPEC" ) ;
    ( void ) strtosym ( "MAPPING" ) ;
    ( void ) strtosym ( "device_name" ) ;
    ( void ) strtosym ( "ultra_fast" ) ;
    ( void ) strtosym ( "device_usage" ) ;
    ( void ) strtosym ( "report" ) ;
    ( void ) strtosym ( "modeler_name" ) ;
    ( void ) strtosym ( "clock_type" ) ;
    ( void ) strtosym ( "disable_timing_checking" ) ;
    ( void ) strtosym ( "inhibit_timing_measurement" ) ;
    ( void ) strtosym ( "device_hold_time" ) ;
    ( void ) strtosym ( "device_setup_time" ) ;
    ( void ) strtosym ( "device_sample_time" ) ;
    ( void ) strtosym ( "device_speed" ) ;
    ( void ) strtosym ( "technology" ) ;
    ( void ) strtosym ( "initialize" ) ;
    ( void ) strtosym ( "in_pin" ) ;
    ( void ) strtosym ( "io_pin" ) ;
    ( void ) strtosym ( "nc_pin" ) ;
    ( void ) strtosym ( "out_pin" ) ;
    ( void ) strtosym ( "power_pin" ) ;
    ( void ) strtosym ( "ground_pin" ) ;
    ( void ) strtosym ( "delay" ) ;
    ( void ) strtosym ( "default_delay" ) ;
    ( void ) strtosym ( "package_mapping" ) ;
    ( void ) strtosym ( "adapter_mapping" ) ;
    ( void ) strtosym ( "pin_name_mapping" ) ;
    ( void ) strtosym ( "-" ) ;
    ( void ) strtosym ( "," ) ;
    ( void ) strtosym ( "=" ) ;
    ( void ) strtosym ( "(" ) ;
    ( void ) strtosym ( ")" ) ;
    ( void ) strtosym ( "[" ) ;
    ( void ) strtosym ( "]" ) ;
    ( void ) strtosym ( ":" ) ;
    ( void ) strtosym ( "from" ) ;
    ( void ) strtosym ( "to" ) ;
  } /* pinit */

tree
parse ( )
  { scan ( ) ; bldnostrm ( END_OF_FILE , Parse_Statement_list ( ) ) ;
    if ( tok_name != END_OF_FILE ) syntax_error ( 1 ) ;
    return poptop ( ) ;
  } /* parse */

static unsigned short
Parse_Statement_list ( )
  { unsigned short kids = 0 ;
    kids += Parse_Statement ( ) ;
    while
      ( tok_name == T_device_name ||
        tok_name == T_ultra_fast ||
        tok_name == T_device_usage ||
        tok_name == T_report ||
        tok_name == T_modeler_name ||
        tok_name == T_clock_type ||
        tok_name == T_disable_timing_checking ||
        tok_name == T_inhibit_timing_measurement ||
        tok_name == T_device_hold_time ||
        tok_name == T_device_setup_time ||
        tok_name == T_device_sample_time ||
        tok_name == T_device_speed ||
        tok_name == T_technology ||
        tok_name == T_initialize ||
        tok_name == T_in_pin ||
        tok_name == T_io_pin ||
        tok_name == T_nc_pin ||
        tok_name == T_out_pin ||
        tok_name == T_power_pin ||
        tok_name == T_ground_pin ||
        tok_name == T_delay ||
        tok_name == T_default_delay ||
        tok_name == T_package_mapping ||
        tok_name == T_adapter_mapping ||
        tok_name == T_pin_name_mapping
      )
      { /* handle left recursion */
        kids += Parse_Statement ( ) ;
      }
    return kids ;
  } /* Parse_Statement_list */

static unsigned short
Parse_Statement ( )
  { unsigned short kids = 0 ;
    if ( tok_name == T_pin_name_mapping )
      { scan ( ) ;
        kids += Parse_Pin_name_mapping_list ( ) ;
        bldnostrm ( N_PIN_MAP , kids ) ; kids = 1 ;
      }
```

Copyright 1989 Logic Modeling Systems

SOURCE PROGRAM shellswm/Hparse.c | DATE 5/23/89 | TIME 4:42:21 pm | PAGE # 3/25

LINE # SOURCE TEXT

```
        else if ( tok_name == T_adapter_mapping )
          { scan ( ) ;
            kids += Parse_Adapter_mapping_list ( ) ;
            bldnontrm ( N_ADAPTER , kids ) ; kids = 1 ;
          }
        else if ( tok_name == T_package_mapping )
          { scan ( ) ;
            kids += Parse_Package_mapping_list ( ) ;
            bldnontrm ( N_PACKAGE , kids ) ; kids = 1 ;
          }
        else if ( tok_name == T_default_delay )
          { scan ( ) ;
            kids += Parse_Timing ( ) ;
            bldnontrm ( N_DEFAULT_DELAY , kids ) ; kids = 1 ;
          }
        else if ( tok_name == T_delay )
          { scan ( ) ;
            kids += Parse_From_list ( ) ;
            bldnontrm ( N_DELAY , kids ) ; kids = 1 ;
          }
        else if ( tok_name == T_ground_pin )
          { scan ( ) ;
            kids += Parse_Pin_corr_list ( ) ;
            bldnontrm ( N_GROUND_PINS , kids ) ; kids = 1 ;
          }
        else if ( tok_name == T_power_pin )
          { scan ( ) ;
            kids += Parse_Pin_corr_list ( ) ;
            bldnontrm ( N_POWER_PINS , kids ) ; kids = 1 ;
          }
        else if ( tok_name == T_out_pin )
          { scan ( ) ;
            kids += Parse_Pin_corr_list ( ) ;
            bldnontrm ( N_OUT_PINS , kids ) ; kids = 1 ;
          }
        else if ( tok_name == T_nc_pin )
          { scan ( ) ;
            kids += Parse_Pin_corr_list ( ) ;
            bldnontrm ( N_NC_PINS , kids ) ; kids = 1 ;
          }
        else if ( tok_name == T_io_pin )
          { scan ( ) ;
            kids += Parse_Pin_corr_list ( ) ;
            bldnontrm ( N_IO_PINS , kids ) ; kids = 1 ;
          }
        else if ( tok_name == T_in_pin )
          { scan ( ) ;
            kids += Parse_Pin_corr_list ( ) ;
            bldnontrm ( N_IN_PINS , kids ) ; kids = 1 ;
          }
        else if ( tok_name == T_initialize )
          { scan ( ) ;
            kids += Parse_Init_seq_list ( ) ;
            bldnontrm ( N_INITIALIZE , kids ) ; kids = 1 ;
          }
        else if ( tok_name == T_technology )
          { scan ( ) ;
            if ( tok_name == P_ID_ )
              { bldtrm ( tok_name , tok_text ) ; ++kids ; scan ( ) ;
              } else syntax_error ( 2 ) ;
            kids += Parse_Opt_tech_spec_list ( ) ;
            bldnontrm ( N_TECHNOLOGY , kids ) ; kids = 1 ;
          }
        else if ( tok_name == T_device_speed )
          { scan ( ) ;
            kids += Parse_Unit ( ) ;
            kids += Parse_Opt_dash_unit ( ) ;
            bldnontrm ( N_SPEED , kids ) ; kids = 1 ;
          }
        else if ( tok_name == T_device_sample_time )
          { scan ( ) ;
            if ( tok_name == P_NUM_ )
              { bldtrm ( tok_name , tok_text ) ; ++kids ; scan ( ) ;
              } else syntax_error ( 3 ) ;
            bldnontrm ( N_SAMPLE_TIME , kids ) ; kids = 1 ;
          }
        else if ( tok_name == T_device_setup_time )
          { scan ( ) ;
            if ( tok_name == P_NUM_ )
              { bldtrm ( tok_name , tok_text ) ; ++kids ; scan ( ) ;
              } else syntax_error ( 4 ) ;
            bldnontrm ( N_SETUP_TIME , kids ) ; kids = 1 ;
          }
        else if ( tok_name == T_device_hold_time )
          { scan ( ) ;
            if ( tok_name == P_NUM_ )
              { bldtrm ( tok_name , tok_text ) ; ++kids ; scan ( ) ;
              } else syntax_error ( 5 ) ;
            bldnontrm ( N_HOLD_TIME , kids ) ; kids = 1 ;
          }
        else if ( tok_name == T_inhibit_timing_measurement )
          { scan ( ) ;
            bldnontrm ( N_INH_TIM_MEASURE , kids ) ; kids = 1 ;
          }
        else if ( tok_name == T_disable_timing_checking )
          { scan ( ) ;
            bldnontrm ( N_DIS_TIM_CHECK , kids ) ; kids = 1 ;
          }
        else if ( tok_name == T_[illegible]k_type )
          { scan ( ) ;
            if ( tok_name == P_ID_ )
              { bldtrm ( tok_name , tok_text ) ; ++kids ; scan ( ) ;
              } else syntax_error ( 6 ) ;
            bldnontrm ( N_CLOCK_TYPE , kids ) ; kids = 1 ;
          }
        else if ( tok_name == T_modeler_name )
          { scan ( ) ;
            kids += Parse_Name ( ) ;
            bldnontrm ( N_MODELER , kids ) ; kids = 1 ;
          }
        else if ( tok_name == T_report )
          { scan ( ) ;
            if ( tok_name == P_ID_ )
              { bldtrm ( tok_name , tok_text ) ; ++kids ; scan ( ) ;
              } else syntax_error ( 7 ) ;
            kids += Parse_Opt_id ( ) ;
            bldnontrm ( N_REPORT , kids ) ; kids = 1 ;
          }
        else if ( tok_name == T_device_usage )
          { scan ( ) ;
```

Copyright 1989
Logic Modeling Systems

| SOURCE PROGRAM | DATE | PAGE # |
|---|---|---|
| shellswm/Hparse.c | 5/23/89 | 4/26 |
| | TIME 4:42:21 pm | |

LINE # SOURCE TEXT

```
          if ( tok_name == P_ID_ )
            { bldtrm ( tok_name , tok_text ) ; ++kids ; scan ( ) ;
            } else syntax_error ( 8 ) ;
          bldnontrm ( N_USAGE , kids ) ; kids = 1 ;
        }
      else if ( tok_name == T_ultra_fast )
        { scan ( ) ;
          bldnontrm ( N_FAST , kids ) ; kids = 1 ;
        }
      else if ( tok_name == T_device_name )
        { scan ( ) ;
          kids += Parse_Name ( ) ;
          bldnontrm ( N_NAME , kids ) ; kids = 1 ;
        }
      else syntax_error ( 9 ) ;
      return kids ;
    } /* Parse_Statement */

static unsigned short
Parse_Name ( )
  { unsigned short kids = 0 ;
    if ( tok_name == P_STR_ )
      { bldtrm ( tok_name , tok_text ) ; ++kids ; scan ( ) ;
      }
    else if ( tok_name == P_NUM_ )
      { bldtrm ( tok_name , tok_text ) ; ++kids ; scan ( ) ;
      }
    else if ( tok_name == P_ID_ )
      { bldtrm ( tok_name , tok_text ) ; ++kids ; scan ( ) ;
      }
    else syntax_error ( 10 ) ;
    return kids ;
  } /* Parse_Name */

static unsigned short
Parse_Opt_id ( )
  { unsigned short kids = 0 ;
    if ( tok_name == P_ID_ )
      { bldtrm ( tok_name , tok_text ) ; ++kids ; scan ( ) ;
      }
    return kids ;
  } /* Parse_Opt_id */

static unsigned short
Parse_Unit ( )
  { unsigned short kids = 0 ;
    if ( tok_name == P_NUM_ )
      { bldtrm ( tok_name , tok_text ) ; ++kids ; scan ( ) ;
        if ( tok_name == P_ID_ )
          { bldtrm ( tok_name , tok_text ) ; ++kids ; scan ( ) ;
            bldnontrm ( N_UNIT , kids ) ; kids = 1 ;
          }
        else
          { bldnontrm ( N_UNIT , kids ) ; kids = 1 ;
          }
      }
    else if ( tok_name == P_ID_ )
      { bldtrm ( tok_name , tok_text ) ; ++kids ; scan ( ) ;
        bldnontrm ( N_UNIT , kids ) ; kids = 1 ;
      }
    else syntax_error ( 11 ) ;
    return kids ;
  } /* Parse_Unit */

static unsigned short
Parse_Opt_dash_unit ( )
  { unsigned short kids = 0 ;
    if ( tok_name == T_ds )
      { scan ( ) ;
        kids += Parse_Unit ( ) ;
      }
    return kids ;
  } /* Parse_Opt_dash_unit */

static unsigned short
Parse_Opt_tech_spec_list ( )
  { unsigned short kids = 0 ;
    if
      ( tok_name == P_ID_
      )
      { kids += Parse_Tech_spec_list ( ) ;
      }
    return kids ;
  } /* Parse_Opt_tech_spec_list */

static unsigned short
Parse_Init_seq_list ( )
  { unsigned short kids = 0 ;
    kids += Parse_Init_seq ( ) ;
    while
      ( tok_name == P_ID_ ||
        tok_name == P_STR_ ||
        tok_name == P_NUM_
      )
      { /* handle left recursion */
        kids += Parse_Init_seq ( ) ;
      }
    return kids ;
  } /* Parse_Init_s… ist */

static unsigned short
Parse_Pin_corr_list ( )
  { unsigned short kids = 0 ;
    kids += Parse_Pin_corr ( ) ;
    while
      ( tok_name == P_ID_ ||
        tok_name == P_STR_ ||
        tok_name == P_NUM_
      )
      { /* handle left recursion */
        kids += Parse_Pin_corr ( ) ;
      }
    return kids ;
  } /* Parse_Pin_corr_list */

static unsigned short
Parse_From_list ( )
  { unsigned short kids = 0 ;
    kids += Parse_From ( ) ;
    while
```

Copyright 1989
Logic Modeling Systems

SOURCE PROGRAM shellswm/Hparse.c | DATE 5/23/89 | TIME 4:42:21 pm | PAGE # 5/27

LINE # SOURCE TEXT

```
        ( tok_name == T_from
        )
        { /* handle left recursion */
          kids += Parse_From ( ) ;
        }
      return kids ;
    } /* Parse_from_list */

static unsigned short
Parse_Timing ( )
  { unsigned short kids = 0 ;
    if
      ( tok_name == P_NUM_ ||
        tok_name == T_lp ||
        tok_name == T_ds ||
        tok_name == P_ID_
      )
      { kids += Parse_Spec ( ) ;
        if ( tok_name == T_cm )
          { scan ( ) ;
            if
              ( tok_name == P_NUM_ ||
                tok_name == T_lp ||
                tok_name == T_ds ||
                tok_name == P_ID_
              )
              { kids += Parse_Spec ( ) ;
                if ( tok_name == T_cm )
                  { scan ( ) ;
                    kids += Parse_Spec ( ) ;
                    bldnontrm ( N_TIMING , kids ) ; kids = 1 ;
                  }
                else
                  { bldnontrm ( N_TIMING , kids ) ; kids = 1 ;
                  }
              }
            else syntax_error ( 12 ) ;
          }
        else
          { bldnontrm ( N_TIMING , kids ) ; kids = 1 ;
          }
      }
    else syntax_error ( 13 ) ;
    return kids ;
  } /* Parse_Timing */

static unsigned short
Parse_Package_mapping_list ( )
  { unsigned short kids = 0 ;
    kids += Parse_Package_mapping ( ) ;
    while
      ( tok_name == P_ID_ ||
        tok_name == P_STR_ ||
        tok_name == P_NUM_
      )
      { /* handle left recursion */
        kids += Parse_Package_mapping ( ) ;
      }
    return kids ;
  } /* Parse_Package_mapping_list */

static unsigned short
Parse_Adapter_mapping_list ( )
  { unsigned short kids = 0 ;
    kids += Parse_Adapter_mapping ( ) ;
    while
      ( tok_name == P_ID_ ||
        tok_name == P_STR_ ||
        tok_name == P_NUM_
      )
      { /* handle left recursion */
        kids += Parse_Adapter_mapping ( ) ;
      }
    return kids ;
  } /* Parse_Adapter_mapping_list */

static unsigned short
Parse_Pin_name_mapping_list ( )
  { unsigned short kids = 0 ;
    kids += Parse_Pin_name_mapping ( ) ;
    while
      ( tok_name == P_ID_ ||
        tok_name == P_STR_ ||
        tok_name == P_NUM_
      )
      { /* handle left recursion */
        kids += Parse_Pin_name_mapping ( ) ;
      }
    return kids ;
  } /* Parse_Pin_name_mapping_list */

static unsigned short
Parse_Tech_spec_list ( )
  { unsigned short kids = 0 ;
    kids += Parse_Tech_spec ( ) ;
    while
      ( tok_name == T_cm
      )
        /* handle left recursion */
        if ( tok_name == T_cm ) scan ( ) ; else syntax_error ( 14 ) ;
        kids += Parse_Tech_spec ( ) ;
      }
    return kids ;
  } /* Parse_Tech_spec_list */

static unsigned short
Parse_Tech_spec ( )
  { unsigned short kids = 0 ;
    if ( tok_name == P_ID_ )
      { bldtrm ( tok_name , tok_text ) ; ++kids ; scan ( ) ;
      } else syntax_error ( 15 ) ;
    if ( tok_name == T_eq ) scan ( ) ; else syntax_error ( 16 ) ;
    kids += Parse_Signed_num ( ) ;
    bldnontrm ( N_TECH_SPEC , kids ) ; kids = 1 ;
    return kids ;
  } /* Parse_Tech_spec */

static unsigned short
Parse_Signed_num ( )
  { unsigned short kids = 0 ;
```

Copyright 1989
Logic Modeling Systems

| SOURCE PROGRAM | DATE | PAGE # |
|---|---|---|
| shellswm/Hparse.c | 5/23/89 | 6/28 |
| | TIME 4:42:21 pm | |

LINE # SOURCE TEXT

```
    if ( tok_name == T_lp )
      { scan ( ) ;
        kids += Parse_Signed_num ( ) ;
        if ( tok_name == T_rp ) scan ( ) ; else syntax_error ( 17 ) ;
      }
    else if ( tok_name == T_ds )
      { scan ( ) ;
        kids += Parse_Signed_num ( ) ;
        bldnontrm ( N_NEGATIVE , kids ) ; kids = 1 ;
      }
    else if ( tok_name == P_NUM_ )
      { bldtrm ( tok_name , tok_text ) ; ++kids ; scan ( ) ;
      }
    else syntax_error ( 18 ) ;
    return kids ;
  } /* Parse_Signed_num */

static unsigned short
Parse_Init_seq ( )
  { unsigned short kids = 0 ;
    kids += Parse_Pin_name_list ( ) ;
    if ( tok_name == T_eq ) scan ( ) ; else syntax_error ( 19 ) ;
    kids += Parse_Init_list ( ) ;
    bldnontrm ( N_INIT_SEQ , kids ) ; kids = 1 ;
    return kids ;
  } /* Parse_Init_seq */

static unsigned short
Parse_Pin_name_list ( )
  { unsigned short kids = 0 ;
    kids += Parse_Pin_name ( ) ;
    while
      ( tok_name == T_cm
      )
      { /* handle left recursion */
        if ( tok_name == T_cm ) scan ( ) ; else syntax_error ( 20 ) ;
        kids += Parse_Pin_name ( ) ;
      }
    return kids ;
  } /* Parse_Pin_name_list */

static unsigned short
Parse_Init_list ( )
  { unsigned short kids = 0 ;
    kids += Parse_Init_value_list ( ) ;
    bldnontrm ( N_LIST , kids ) ; kids = 1 ;
    return kids ;
  } /* Parse_Init_list */

static unsigned short
Parse_Init_value_list ( )
  { unsigned short kids = 0 ;
    kids += Parse_Init_value ( ) ;
    while
      ( tok_name == T_cm
      )
      { /* handle left recursion */
        if ( tok_name == T_cm ) scan ( ) ; else syntax_error ( 21 ) ;
        kids += Parse_Init_value ( ) ;
      }
    return kids ;
  } /* Parse_Init_value_list */

static unsigned short
Parse_Init_value ( )
  { unsigned short kids = 0 ;
    if ( tok_name == P_NUM_ )
      { bldtrm ( tok_name , tok_text ) ; ++kids ; scan ( ) ;
        if ( tok_name == T_lp )
          { scan ( ) ;
            kids += Parse_Init_list ( ) ;
            if ( tok_name == T_rp ) scan ( ) ; else syntax_error ( 22 ) ;
            bldnontrm ( N_REPEAT , kids ) ; kids = 1 ;
          }
      }
    else if ( tok_name == P_ID_ )
      { bldtrm ( tok_name , tok_text ) ; ++kids ; scan ( ) ;
        if ( tok_name == T_lp ) scan ( ) ; else syntax_error ( 23 ) ;
        kids += Parse_Init_list ( ) ;
        if ( tok_name == T_rp ) scan ( ) ; else syntax_error ( 24 ) ;
        bldnontrm ( N_FEEDBACK , kids ) ; kids = 1 ;
      }
    else syntax_error ( 25 ) ;
    return kids ;
  } /* Parse_Init_value */

static unsigned short
Parse_Pin_corr ( )
  { unsigned short kids = 0 ;
    kids += Parse_Pin_name_list ( ) ;
    if ( tok_name == T_eq ) scan ( ) ; else syntax_error ( 26 ) ;
    kids += Parse_Names ( ) ;
    kids += Parse_Opt_pin_attr_list ( ) ;
    bldnontrm ( N_PIN_CORR , kids ) ; kids = 1 ;
    return kids ;
  } /* Parse_Pin_corr */

static unsigned short
Parse_Names ( )
  { unsigned short kids = 0 ;
    kids += Parse_Name_list ( ) ;
    bldnontrm ( N_NAMES , kids ) ; kids = 1 ;
    return kids ;
  } /* Parse_Names */

static unsigned short
Parse_Opt_pin_attr_list ( )
  { unsigned short kids = 0 ;
    if ( tok_name == T_co )
      { scan ( ) ;
        kids += Parse_Pin_attr_list ( ) ;
      }
    return kids ;
  } /* Parse_Opt_pin_attr_list */

static unsigned short
Parse_Pin_name ( )
  { unsigned short kids = 0 ;
    if ( tok_name == P_STR_ )
      { bldtrm ( tok_name , tok_text ) ; ++kids ; scan ( ) ;
```

Copyright 1989
Logic Modeling Systems

SOURCE PROGRAM shellswm/Hparse.c | DATE 5/23/89 | TIME 4:42:21 pm | PAGE # 7/29

LINE # SOURCE TEXT

```
          if
            ( tok_name == T_ls
            )
            { kids += Parse_Subscript ( ) ;
              bldnontrm ( N_PIN_NAME , kids ) ; kids = 1 ;
            }
        }
      else if ( tok_name == P_NUM_ )
        { bldtrm ( tok_name , tok_text ) ; ++kids ; scan ( ) ;
          if
            ( tok_name == T_ls
            )
            { kids += Parse_Subscript ( ) ;
              bldnontrm ( N_PIN_NAME , kids ) ; kids = 1 ;
            }
        }
      else if ( tok_name == P_ID_ )
        { bldtrm ( tok_name , tok_text ) ; ++kids ; scan ( ) ;
          if
            ( tok_name == T_ls
            )
            { kids += Parse_Subscript ( ) ;
              bldnontrm ( N_PIN_NAME , kids ) ; kids = 1 ;
            }
        }
      else syntax_error ( 27 ) ;
      return kids ;
    } /* Parse_Pin_name */

static unsigned short
Parse_Subscript ( )
  { unsigned short kids = 0 ;
    if ( tok_name == T_ls ) scan ( ) ; else syntax_error ( 28 ) ;
    if ( tok_name == P_NUM_ )
      { bldtrm ( tok_name , tok_text ) ; ++kids ; scan ( ) ;
      } else syntax_error ( 29 ) ;
    kids += Parse_Opt_colon_num ( ) ;
    if ( tok_name == T_rs ) scan ( ) ; else syntax_error ( 30 ) ;
    return kids ;
  } /* Parse_Subscript */

static unsigned short
Parse_Opt_colon_num ( )
  { unsigned short kids = 0 ;
    if ( tok_name == T_co )
      { scan ( ) ;
        if ( tok_name == P_NUM_ )
          { bldtrm ( tok_name , tok_text ) ; ++kids ; scan ( ) ;
          } else syntax_error ( 31 ) ;
      }
    return kids ;
  } /* Parse_Opt_colon_num */

static unsigned short
Parse_Name_list ( )
  { unsigned short kids = 0 ;
    kids += Parse_Name ( ) ;
    while
      ( tok_name == T_cm
      )
      { /* handle left recursion */
        if ( tok_name == T_cm ) scan ( ) ; else syntax_error ( 32 ) ;
        kids += Parse_Name ( ) ;
      }
    return kids ;
  } /* Parse_Name_list */

static unsigned short
Parse_Pin_attr_list ( )
  { unsigned short kids = 0 ;
    kids += Parse_Pin_attr ( ) ;
    while
      ( tok_name == T_cm
      )
      { /* handle left recursion */
        if ( tok_name == T_cm ) scan ( ) ; else syntax_error ( 33 ) ;
        kids += Parse_Pin_attr ( ) ;
      }
    return kids ;
  } /* Parse_Pin_attr_list */

static unsigned short
Parse_Pin_attr ( )
  { unsigned short kids = 0 ;
    if ( tok_name == P_ID_ )
      { bldtrm ( tok_name , tok_text ) ; ++kids ; scan ( ) ;
        if ( tok_name == T_eq )
          { scan ( ) ;
            if
              ( tok_name == P_NUM_ ||
                tok_name == T_lp ||
                tok_name == T_ds
              )
              { kids += Parse_Signed_num ( ) ;
                bldnontrm ( N_ATTR , kids ) ; kids = 1 ;
              }
            else if ( tok_name == P_ID_ )
              { bldtrm ( tok_name , tok_text ) ; ++kids ; scan ( ) ;
                bldnontrm ( N_ATTR , kids ) ; kids = 1 ;
              }
            else syntax_error ( 34 ) ;
          }
      }
    else syntax_error ( 35 ) ;
    return kids ;
  } /* Parse_Pin_attr */

static unsigned short
Parse_From ( )
  { unsigned short kids = 0 ;
    if ( tok_name == T_from ) scan ( ) ; else syntax_error ( 36 ) ;
    kids += Parse_Pin_state ( ) ;
    kids += Parse_To_list ( ) ;
    bldnontrm ( N_FROM , kids ) ; kids = 1 ;
    return kids ;
  } /* Parse_From */

static unsigned short
Parse_Pin_state ( )
  { unsigned short kids = 0 ;
```

Copyright 1989
Logic Modeling Systems

| SOURCE PROGRAM | DATE | TIME | PAGE # |
|---|---|---|---|
| shellswm/Hparse.c | 5/23/89 | 4:42:21 pm | 8/30 |

LINE # SOURCE TEXT

```
      if ( tok_name == P_ID_ )
        { bldtrm ( tok_name , tok_text ) ; ++kids ; scan ( ) ;
        } else syntax_error ( 37 ) ;
      if ( tok_name == T_lp ) scan ( ) ; else syntax_error ( 38 ) ;
      kids += Parse_Pin_name_list ( ) ;
      if ( tok_name == T_rp ) scan ( ) ; else syntax_error ( 39 ) ;
      bldnontrm ( N_PIN_STATE , kids ) ; kids = 1 ;
      return kids ;
    } /* Parse_Pin_state */

static unsigned short
Parse_To_list ( )
  { unsigned short kids = 0 ;
    kids += Parse_To ( ) ;
    while
      ( tok_name == T_to
      )
      { /* handle left recursion */
        kids += Parse_To ( ) ;
      }
    return kids ;
  } /* Parse_To_list */

static unsigned short
Parse_To ( )
  { unsigned short kids = 0 ;
    if ( tok_name == T_to ) scan ( ) ; else syntax_error ( 40 ) ;
    kids += Parse_Pin_state ( ) ;
    if ( tok_name == T_eq ) scan ( ) ; else syntax_error ( 41 ) ;
    kids += Parse_Timing ( ) ;
    bldnontrm ( N_TO , kids ) ; kids = 1 ;
    return kids ;
  } /* Parse_To */

static unsigned short
Parse_Spec ( )
  { unsigned short kids = 0 ;
    if
      ( tok_name == P_NUM_ ||
        tok_name == T_lp ||
        tok_name == T_ds
      )
      { kids += Parse_Signed_num ( ) ;
        bldnontrm ( N_SPEC , kids ) ; kids = 1 ;
      }
    else if ( tok_name == P_ID_ )
      { bldtrm ( tok_name , tok_text ) ; ++kids ; scan ( ) ;
        kids += Parse_Signed_num ( ) ;
        bldnontrm ( N_SPEC , kids ) ; kids = 1 ;
      }
    else syntax_error ( 42 ) ;
    return kids ;
  } /* Parse_Spec */

static unsigned short
Parse_Package_mapping ( )
  { unsigned short kids = 0 ;
    kids += Parse_Names ( ) ;
    if ( tok_name == T_eq ) scan ( ) ; else syntax_error ( 43 ) ;
    kids += Parse_Names ( ) ;
    bldnontrm ( N_MAPPING , kids ) ; kids = 1 ;
    return kids ;
  } /* Parse_Package_mapping */

static unsigned short
Parse_Adapter_mapping ( )
  { unsigned short kids = 0 ;
    kids += Parse_Names ( ) ;
    if ( tok_name == T_eq ) scan ( ) ; else syntax_error ( 44 ) ;
    kids += Parse_Names ( ) ;
    kids += Parse_Opt_pin_attr_list ( ) ;
    bldnontrm ( N_MAPPING , kids ) ; kids = 1 ;
    return kids ;
  } /* Parse_Adapter_mapping */

static unsigned short
Parse_Pin_name_mapping ( )
  { unsigned short kids = 0 ;
    kids += Parse_Pin_names ( ) ;
    if ( tok_name == T_eq ) scan ( ) ; else syntax_error ( 45 ) ;
    kids += Parse_Pin_names ( ) ;
    bldnontrm ( N_MAPPING , kids ) ; kids = 1 ;
    return kids ;
  } /* Parse_Pin_name_mapping */

static unsigned short
Parse_Pin_names ( )
  { unsigned short kids = 0 ;
    kids += Parse_Pin_name_list ( ) ;
    bldnontrm ( N_NAMES , kids ) ; kids = 1 ;
    return kids ;
  } /* Parse_Pin_names */

/* end of recursive descent parser */
```

Copyright 1989
Logic Modeling Systems

SOURCE PROGRAM shellswm/Hscan.c

DATE 5/23/89 TIME 4:42:23 pm PAGE # 1/31

LINE # SOURCE TEXT

```
/* SCCS_ID: Hscan.c rev 3.1, 4/24/89 at 08:00:48     */

/*
 * scanner for HHDL
 */

# include "HHDL.h"
# include "common.h"
# include <strings.h>
# include "strng.h"
# include "Hparse.h"

# define MAXTOKLEN 1024
# define SHOWTOKLEN 32

extern void lm_print_message ( ) ;

symbol
  tok_name , /* current token name */
  tok_text , /* current token text */
  source , /* symbols for source file name */
static short nextc ; /* the scanners lookahead character */
static char
  *source_text , /* the source text buffer */
  num_buf [ 12 ] , /* to print maximum token length */
  token [ MAXTOKLEN ] , /* the current token text buffer */
  *cursor ; /* cursor for token text */
static unsigned short
  newlineno , /* to delay line number incrementing */
  ccount ; /* comment nesting count */

static void
getnext ( )
  /* gets the next character for the scanner */
  { nextc = *source_text++ ;
    if ( nextc == '\n' )
      ++newlineno ;
  } /* getnext */

void
init_scanner ( text )
  char *text ;
  /* initializes the scanner */
  { source_text = text ;
    newlineno = 1 ;
    getnext ( ) ;
  } /* init_scanner */

static void
lexical_error ( )
  /* reports a lexical error, should never happen because of prescan() */
  { lm_Herror
      ( 1 ,
/*LMSG*/"internal error: unexpected lexical error"
      ) ;
  } /* lexical_error */

static void
trace_token ( )
  /* traces the current token (iff t_flag is on) */
  { if ( ! lm_Ht_flag_on ( ) )
      return ;
    lm_print_message
      ( "tok_name,tok_text=%s,%s\n" ,
        symtostr ( tok_name ) ,
        symtostr ( tok_text )
      ) ;
  } /* trace_token */

void
scan ( )
  /* the main scanner */
  { while ( lm_Hset_lineno ( newlineno ) , nextc != '\0' )
      if ( nextc <= ' ' )
        getnext ( ) ;
      else if
        ( nextc >= 'A' && nextc <= 'Z' ||
          nextc >= 'a' && nextc <= 'z' ||
          nextc == '_'
        )
        { cursor = token ;
          *cursor++ = nextc ;
          while
            ( ( getnext ( ) , nextc ) >= 'A' && nextc <= 'Z' ||
              nextc >= 'a' && nextc <= 'z' ||
              nextc >= '0' && nextc <= '9' ||
              nextc == '_' ||
              nextc == '.'
            )
            { *cursor++ = nextc ;
              if ( cursor - token == MAXTOKLEN - 1 )
                goto toolong ;
            }
          *cursor = '\0' ;
          tok_text = strtosym ( token ) ;
          if ( tok_text >= Q_firstreserved && tok_text <= Q_lastreserved )
            { tok_name = tok_text ;
              tok_text = NULLSYM ;
            }
          else
            tok_name = P_ID_ ;
          trace_token();
          return ;
        }
      else if ( nextc == '\'' )
        { cursor = token ;
          do
            { *cursor++ = '\'' ;
              if ( cursor - token == MAXTOKLEN - 1 )
                goto toolong ;
              while ( ( getnext ( ) , nextc ) != '\0' && nextc != '\'' )
                { *cursor++ = nextc ;
                  if ( cursor - token == MAXTOKLEN - 1 )
                    goto toolong ;
                }
              if ( nextc == '\0' )
                lm_Herror
                  ( 1 ,
/*LMSG*/"internal error: unterminated string"
                  ) ;
```

Copyright 1989
Logic Modeling Systems

LINE # SOURCE TEXT

```
                else
                  { *cursor++ = '\'' ;
                    if ( cursor - token == MAXTOKLEN - 1 )
                      goto toolong ;
                    getnext ( ) ;
                  }
              }
            while ( nextc == '\'' ) ;
            *cursor = '\0' ;
            tok_name = P_STR_ ;
            tok_text = strtosym ( token ) ;
            trace_token();
            return ;
          }
        else if ( nextc == '"' )
          { cursor = token ;
            do
              { *cursor++ = '"' ;
                if ( cursor - token == MAXTOKLEN - 1 )
                  goto toolong ;
                while ( ( getnext ( ) , nextc ) != '\0' && nextc != '"' )
                  { *cursor++ = nextc ;
                    if ( cursor - token == MAXTOKLEN - 1 )
                      goto toolong ;
                  }
                if ( nextc == '\0' )
                  lm_Herror
                    ( 1 ,
/*LMSG*/"internal error: unterminated string"
                    ) ;
                else
                  { *cursor++ = '"' ;
                    if ( cursor - token == MAXTOKLEN - 1 )
                      goto toolong ;
                    getnext ( ) ;
                  }
              }
            while ( nextc == '"' ) ;
            *cursor = '\0' ;
            tok_name = P_STR_ ;
            tok_text = strtosym ( token ) ;
            trace_token();
            return ;
          }
        else if ( nextc >= '0' && nextc <= '9' || nextc == '.' )
          { cursor = token ;
            *cursor++ = nextc ;
            while
              ( ( getnext ( ) , nextc ) >= 'A' && nextc <= 'Z' ||
                nextc >= 'a' && nextc <= 'z' ||
                nextc >= '0' && nextc <= '9' ||
                nextc == '_' ||
                nextc == '.'
              )
              { *cursor++ = nextc ;
                if ( cursor - token == MAXTOKLEN - 1 )
                  goto toolong ;
              }
            *cursor = '\0' ;
            tok_text = strtosym ( token ) ;
            tok_name = P_NUM_ ;
            trace_token();
            return ;
          }
        else if ( nextc == '#' )
          { do
              getnext ( ) ;
            while ( nextc <= ' ' ) ;
            ccount = 0 ;
            while ( nextc >= '0' && nextc <= '9' )
              { ccount *= 10 ;
                ccount += nextc - '0' ;
                getnext ( ) ;
              }
            while ( nextc <= ' ' && nextc != '\n' && nextc != '\0' )
              getnext ( ) ;
            cursor = token ;
            if ( nextc != '\n' && nextc != '\0' )
              do
                { *cursor++ = nextc ;
                  if ( cursor - token == MAXTOKLEN - 1 )
                    goto toolong ;
                }
              while ( getnext ( ) , nextc != '\0' && nextc != '\n' ) ;
            *cursor = '\0' ;
            newlineno = ccount ;
            lm_Hset_input ( symtostr ( source = strtosym ( token ) ) ) ;
          }
        else if ( nextc == '{' )
          { ccount = 0 ;
            while
              ( ( ( getnext ( ) , nextc ) != '}' || ccount ) &&
                nextc != '\0'
              )
              if ( nextc == '}' )
                --ccount ;
              else if ( nextc == '{' )
                ++ccount ;
            if ( nextc == '}' )
              getnext ( ) ;
            else
              lm_Herror
                ( 1 ,
/*LMSG*/"internal error: unterminated comment"
                ) ;
          }
        else
          { switch ( nextc )
              { case ',' :
                  tok_name = T_cm ;
                  break ;
                case '(' :
                  tok_name = T_lp ;
                  break ;
                case ')' :
                  tok_name = T_rp ;
                  break ;
                case ':' :
                  tok_name = T_co ;
                  break ;
```

Copyright 1989
Logic Modeling Systems

| SOURCE PROGRAM | DATE | PAGE # |
|---|---|---|
| shellswm/Hscan.c | 5/23/89 TIME 4:42:23 pm | 3/33 |

LINE # SOURCE TEXT

```
                case '[' :
                  tok_name = T_ls ;
                  break ;
                case ']' :
                  tok_name = T_rs ;
                  break ;
                case '-' :
                  tok_name = T_da ;
                  break ;
                case '=' :
                  tok_name = T_eq ;
                  break ;
/* only needed in behavioral sublanguage
                case '+' :
                  tok_name = T_pl ;
                  break ;
                case '^' :
                  tok_name = T_up ;
                  break ;
                case '*' :
                  tok_name = T_st ;
                  break ;
                case '/' :
                  tok_name = T_sl ;
                  break ;
                case '%' :
                  tok_name = T_pc ;
                  break ;
                case '~' :
                  tok_name = T_ti ;
                  break ;
                case '&' :
                  getnext ( ) ;
                  if ( nextc == '&' )
                    { tok_name = T_amam ;
                      break ;
                    }
                  tok_name = T_am ;
                  trace_token();
                  return ;
                case '|' :
                  getnext ( ) ;
                  if ( nextc == '|' )
                    { tok_name = T_vlvl ;
                      break ;
                    }
                  tok_name = T_vl ;
                  trace_token();
                  return ;
                case '!' :
                  getnext ( ) ;
                  if ( nextc == '=' )
                    { tok_name = T_exeq ;
                      break ;
                    }
                  tok_name = T_ex ;
                  trace_token();
                  return ;
                case '=' :
                  getnext ( ) ;
                  if ( nextc == '=' )
                    { tok_name = T_eqeq ;
                      break ;
                    }
                  tok_name = T_eq ;
                  trace_token();
                  return ;
                case '<' :
                  getnext ( ) ;
                  if ( nextc == '=' )
                    { tok_name = T_lteq ;
                      break ;
                    }
                  else if ( nextc == '<' )
                    { tok_name = T_ltlt ;
                      break ;
                    }
                  tok_name = T_lt ;
                  trace_token();
                  return ;
                case '>' :
                  getnext ( ) ;
                  if ( nextc == '=' )
                    { tok_name = T_gteq ;
                      break ;
                    }
                  else if ( nextc == '>' )
                    { tok_name = T_gtgt ;
                      break ;
                    }
                  tok_name = T_gt ;
                  trace_token();
                  return ;
only needed in behavioral sublanguage */
              default :
                lexical_error ( ) ;
                getnext ( ) ;
                continue ;
            }
          getnext ( ) ;
          trace_token();
          return ;
        }
    tok_name = END_OF_FILE ;
    trace_token();
    return ;
toolong :
    ( void ) sprintf ( num_buf , "%u" , MAXTOKLEN ) ;
    token [ SHOWTOKLEN ] = '\0' ;
    lm_Nerror
        ( 1 ,
/*LMSG*/"token too long: %s... (must be less than %s characters)"
          , token ,
          num_buf
        ) ;
    tok_name = END_OF_FILE ;
  } /* scan */

/* end of scanner for HMBL */
```

Copyright 1989
Logic Modeling Systems

| SOURCE PROGRAM | DATE | PAGE # |
|---|---|---|
| shellswm/Pr_mdlr.c | 5/23/89 | 1/34 |
| | TIME 4:42:23 pm | |

LINE # SOURCE TEXT

```
/* SCCS_ID: Pr_mdlr.c rev 1.2, 5/9/89 at 15:24:00      */

/*
 * Processor for HMBL, MODELER SIDE
 */

# ifdef WRITE_DEVICE
# include <stdio.h>
# endif WRITE_DEVICE

# include <setjmp.h>
# include "common.h"
# include "HMBL.h"
# include <strings.h>
# include "strng.h"
# include "Hparse.h"
# include "trees.h"
# include "Hconst.h"
# include "device.h"

extern void
  init_scanner ( ) , /* scanner initializer */
  init_constrainer ( ) , /* constrainer initializer */
  pinit ( ) , /* parser initializer */
  init_the ( ) ,
  init_the_device ( ) ,
  free_the ( ) ,
  free_the_device ( ) ;
extern struct dev *constrain ( ) ; /* the constrainer */
extern struct device *gen ( ) ; /* the device generator */
extern tree parse ( ) ; /* the parser */
# ifdef WRITE_DEVICE
extern void print_dev ( ) ; /* the device printer */
extern void print_map ( ) ; /* the device printer */
extern void dump_power_ground ( ) ; /* power/ground pin dumper */
extern ushort write_device ( ) ; /* the device writer */
# endif WRITE_DEVICE

jmp_buf backend_jump ;

void
syntax_error ( n )
  unsigned short n ;
  /* reports a syntax error via error() */
  { char *mess ;
    switch ( n )
      { case 1 :
        case 9 :
          mess =
/*LMSG*/"end of file or statement reserved word expected"
          ;
          break ;
        case 2 :
          mess =
/*LMSG*/"identifier expected after 'technology'"
          ;
          break ;
        case 3 :
          mess =
/*LMSG*/"number expected after 'device_sample_time'"
          ;
          break ;
        case 4 :
          mess =
/*LMSG*/"number expected af er 'device_sample_time'"
          ;
          break ;
        case 5 :
          mess =
/*LMSG*/"number expected after 'device_hold_time'"
          ;
          break ;
        case 6 :
          mess =
/*LMSG*/"identifier expected after 'clock_type'"
          ;
          break ;
        case 7 :
          mess =
/*LMSG*/"identifier expected after 'report'"
          ;
          break ;
        case 8 :
          mess =
/*LMSG*/"identifier expected after 'device_usage'"
          ;
          break ;
        case 10 :
        case 27 :
          mess =
/*LMSG*/"identifier, number, or string expected"
          ;
          break ;
        case 11 :
        case 25 :
          mess =
/*LMSG*/"identifier or number expected"
          ;
          break ;
        case 12 :
          mess =
/*LMSG*/"timing specification expected"
          ;
          break ;
        case 13 :
          mess =
/*LMSG*/"timing specification expected after ','"
          ;
          break ;
        case 14 :
        case 20 :
        case 21 :
        case 28 :
        case 32 :
        case 33 :
          mess =
/*LMSG*/"internal error: impossible syntax error"
          ;
          break ;
        case 15 :
```

Copyright 1989
Logic Modeling Systems

SOURCE PROGRAM shellswm/Pr_mdlr.c | DATE 5/23/89 | TIME 4:42:23 pm | PAGE # 2/35

LINE # SOURCE TEXT

```
            case 35 :
            case 37 :
              mess =
/*LMSG*/"identifier expected"
              ;
              break ;
            case 16 :
              mess =
/*LMSG*/"'=' expected after identifier"
              ;
              break ;
            case 17 :
              mess =
/*LMSG*/"')' expected after signed number"
              ;
              break ;
            case 18 :
              mess =
/*LMSG*/"signed number expected"
              ;
              break ;
            case 19 :
            case 26 :
            case 45 :
              mess =
/*LMSG*/"'=' expected after pin name list"
              ;
              break ;
            case 22 :
            case 24 :
              mess =
/*LMSG*/"')' expected after initialization list"
              ;
              break ;
            case 23 :
            case 38 :
              mess =
/*LMSG*/"'(' expected after identifier"
              ;
              break ;
            case 29 :
              mess =
/*LMSG*/"number expected after '['"
              ;
              break ;
            case 30 :
              mess =
/*LMSG*/"']' expected after number"
              ;
              break ;
            case 31 :
              mess =
/*LMSG*/"number expected after ':'"
              ;
              break ;
            case 34 :
              mess =
/*LMSG*/"identifier or signed number expected after '='"
              ;
              break ;
            case 36 :
              mess =
/*LMSG*/"'from' expected"
              ;
              break ;
            case 39 :
              mess =
/*LMSG*/"')' expected after pin name list"
              ;
              break ;
            case 40 :
              mess =
/*LMSG*/"'to' expected"
              ;
              break ;
            case 41 :
              mess =
/*LMSG*/"'=' expected after pin state"
              ;
              break ;
            case 42 :
              mess =
/*LMSG*/"identifier or signed number expected"
              ;
              break ;
            case 43 :
            case 44 :
              mess =
/*LMSG*/"'=' expected after name list"
              ;
              break ;
            default :
              mess =
/*LMSG*/"internal error: unknown syntax error"
              ;
              break ;
          }
      lm_Eerror
        ( 1 ,
/*LMSG*/"syntax error: %s"
          , mess
        ) ;
    } /* syntax_error */

static void
init_HMBL ( source )
  char *source ;
  /* initializes the backend */
  { init_the ( ) ;
    init_the_device ( ) ;
    pinit ( ) ;
    init_scanner ( source ) ,
    init_constrainer ( ) ;
  } /* init_HMBL */

static void
show_stats ( T )
  tree T ;
  { if
      ( lm_El_flag_on ( ) ||
```

Copyright 1989 Logic Modeling Systems

| SOURCE PROGRAM | DATE | PAGE # |
|---|---|---|
| shellswm/Pr_mdlr.c | 5/23/89 | 3/36 |
| | TIME 4:42:23 pm | |

LINE # SOURCE TEXT

```
          lm_Hp_flag_on ( ) ||
          lm_Hs_flag_on ( ) ||
          lm_Ht_flag_on ( )
        )
        ( void ) lm_print_message ( "\n" ) ;
      ( void ) lm_print_message ( "%d nodes in the AST\n" , T ) ;
  } /* show_stats */

static void
free_all ( )
  { free_the ( ) ;
    free_the_device ( ) ;
    strfree ( ) ;
    treefree ( ) ;
  } /* free_all */

void
lm_Ffail ( )
  { _longjmp ( backend_jump , 1 ) ;
  } /* lm_Ffail */

struct device *
backend_pass ( source )
  char *source ;
  /* make the backend pass (scan, parse, constrain, generate, write) */
  { tree AST ;
    struct dev *dev ;
    struct device *device ;
    if ( _setjmp ( backend_jump ) )
      { free_all ( ) ;
        return NULL ;
      }
    if ( lm_Hl_flag_on ( ) )
      ( void ) lm_print_message ( "%s" , source ) ;
    init_HMBL ( source ) ;
    AST = parse ( ) ;
    if ( lm_Herrors ( ) )
      { strfree ( ) ;
        treefree ( ) ;
        return NULL ;
      }
    if ( lm_Hp_flag_on ( ) )
      { if ( lm_Hl_flag_on ( ) )
          ( void ) lm_print_message ( "\n" ) ;
        printtree ( AST ) ;
      }
    if ( lm_Hs_flag_on ( ) )
      { if ( lm_Hl_flag_on ( ) || lm_Hp_flag_on ( ) )
          ( void ) lm_print_message ( "\n" ) ;
        strstat ( ) ;
      }
    if
      ( ( dev = constrain ( AST ) ) != NULL &&
        ( lm_Hg_flag_on ( ) ? ( show_stats ( AST ) , 1 ) : 1 ) &&
# ifdef WRITE_DEVICE
        ( lm_Hc_flag_on ( ) ? ( dump_power_ground ( dev , AST ) , 1 ) : 1 ) &&
        ( lm_Hd_flag_on ( ) ? ( print_dev ( dev ) , 1 ) : 1 ) &&
        ( lm_Hm_flag_on ( ) ? ( print_map ( AST ) , 1 ) : 1 ) &&
# endif WRITE_DEVICE
        ( device = gen ( dev ) ) != NULL
# ifdef WRITE_DEVICE
                                                   &&
        (
          ! lm_Hw_flag_on ( ) ||
          lm_Hs_flag_on ( ) ||
          write_device ( stdout , device )
        )
# endif WRITE_DEVICE
      )
      return device ;
    return NULL ;
  } /* backend_pass */

/* end of Processor for HMBL, MODELER SIDE */
```

Copyright 1989
Logic Modeling Systems

SOURCE PROGRAM: shellswm/extract_dev.c | DATE: 5/23/89 | TIME: 4:42:23 pm | PAGE # 1/37

LINE # SOURCE TEXT

```
/* SCCS_ID: extract_dev.c rev 3.1, 4/24/89 at 08:01:09     */

/* HDL Device Definition Extracter */

# include "device.h"
# include <stdio.h>

# define BUF_SIZE 10240 /* initial buffer size */
# define BUF_INCR 5120 /* buffer size increment */

extern char *lm_malloc ( ) , *lm_realloc ( ) ;

static char *the_buf ; /* the expanding buffer */
unsigned long buf_len ; /* the current buffer length */
unsigned long buf_size ; /* the current maximum buffer length */

static void
init_buf ( )
  { buf_len = 0 ;
    the_buf = lm_malloc ( BUF_SIZE ) ;
    if ( the_buf == NULL )
      { /* report error */
        buf_size = 0 ;
      }
    else
      buf_size = BUF_SIZE ;
  } /* init_buf */

static void
extend_buf ( )
  { if ( buf_size == 0 )
      return ;
    the_buf = lm_realloc ( the_buf , ( unsigned ) ( buf_size + BUF_INCR ) ) ;
    if ( the_buf == NULL )
      { /* report error */
        buf_size = 0 ;
      }
    else
      buf_size += BUF_INCR ;
  } /* extend_buf */

static void
print_str ( s )
  char *s ;
  { unsigned short len ;
    len = strlen ( s ) ;
    if ( len + buf_len >= buf_size )
      extend_buf ( ) ;
    if ( buf_size == 0 )
      return ;
    ( void ) strcpy ( the_buf + buf_len , s ) ;
    buf_len += len ;
  } /* print_str */

static void
print_num ( n )
  long n ;
  { unsigned short len ;
    char s [ 12 ] ;
/*
    ( void ) sprintf ( s , "%ld" , n ) ;
*/
{char t[12];
 unsigned short i;
 long o;
 o=n;
 t[11]='\0';
 i=10;
 if(o==0)
  t[i]='0';
 else
  {while(o)
   {t[i]=o%10+'0';
    o/=10;
    --i;
   }
   ++i;
  }
 (void)strcpy(s,t+i);
}
    len = strlen ( s ) ;
    if ( len + buf_len >= buf_size )
      extend_buf ( ) ;
    if ( buf_size == 0 )
      return ;
    ( void ) strcpy ( the_buf + buf_len , s ) ;
    buf_len += len ;
  } /* print_num */

static void
print_flt ( f )
  float f ;
  { unsigned short len ;
    char s [ 36 ] ;
    ( void ) sprintf ( s , "%g" , f ) ;
    len = strlen ( s ) ;
    if ( len + buf_len >= buf_size )
      extend_buf ( ) ;
    if ( buf_size == 0 )
      return ;
    ( void ) strcpy ( the_buf + buf_len , s ) ;
    buf_len += len ;
  } /* print_flt */

static char *
dev_of ( type )
  unsigned short type ;
  { switch ( type )
      { case PUBLIC :
          return "public" ;
        case PRIVATE :
          return "private" ;
        default :
          return "bad" ;
      }
  } /* dev_of */

static char *
clock_of ( type )
  unsigned short type ;
```

Copyright 1989
Logic Modeling Systems

| SOURCE PROGRAM | DATE 5/23/89 | PAGE # |
| --- | --- | --- |
| shellswm/extract_dev.c | TIME 4:42:23 pm | 2/38 |

LINE # SOURCE TEXT

```
    { switch ( type )
        { case INTERNAL :
            return "internal" ;
          case EXT1 :
            return "external_clock0" ;
          case EXT2 :
            return "external_clock1" ;
          default :
            return "bad" ;
        }
    } /* clock_of */

static char *
state_of ( type )
    unsigned short type ;
    { switch ( type )
        { case NONE :
            return "none" ;
          case LOW :
            return "low" ;
          case HIGH :
            return "high" ;
          case VALID :
            return "valid" ;
          case FLOAT :
            return "float" ;
          case ANY :
            return "any" ;
          default :
            return "bad" ;
        }
    } /* state_of */

static char *
class_of ( type , format )
    unsigned short type ;
    unsigned short format ;
    { switch ( type )
        { case EVAL :
            return "eval" ;
          case STORE :
            switch ( format )
                { case DNRZ :
                    return "store" ;
                  case R1 :
                    return "edge_rise" ;
                  case R0 :
                    return "edge_fall" ;
                  default :
                    return "badformat" ;
                }
          default :
            return "bad" ;
        }
    } /* class_of */

static char *
drive_of ( type )
    unsigned short type ;
    { switch ( type )
        { case H_DRIVE :
            return "hard" ;
          case M_DRIVE :
            return "medium" ;
          case HM_DRIVE :
            return "hard_medium" ;
          default :
            return "bad" ;
        }
    } /* drive_of */

static unsigned short
soft_drive_of ( val , w1 , w2 , w3 , w4 )
    unsigned short
        val ,
        w1 ,
        w2 ,
        w3 ,
        w4 ;
    { return
        ( val & 8 ? w4 : 0 ) +
        ( val & 4 ? w3 : 0 ) +
        ( val & 2 ? w2 : 0 ) +
        ( val & 1 ? w1 : 0 ) ;
    } /* soft_drive_of */

static char *
pin_name ( name )
    char *name ;
    { static char *str , buf [ 1024 ] , c [ 2 ] ;
      str = name ;
      while ( *str != '\0' )
        if
          ( *str >= 'A' && *str <= 'Z' ||
            *str >= 'a' && *str <= 'z' ||
            *str >= '0' && *str <= '9' ||
            *str == '_' || *str == '.'
          )
          ++str ;
        else
          break ;
      if ( *str == '\0' )
        return name ;
      c [ 1 ] = '\0' ;
      ( void ) strcpy ( buf , "'" ) ;
      for ( str = name ; *str != '\0' ; ++str )
        { *c = *str ;
          ( void ) strcat ( buf , c ) ;
          if ( *c == '\'' )
            ( void ) strcat ( buf , c ) ;
        }
      ( void ) strcat ( buf , "'" ) ;
      return buf ;
    } /* pin_name */

static unsigned short
seen_pin ( pin_table , i )
    PIN_SPEC *pin_table ;
    unsigned short i ;
    { char *name ;
```

Copyright 1989 Logic Modeling Systems

| SOURCE PROGRAM | DATE | PAGE # |
|---|---|---|
| shellswm/extract_dev.c | 5/23/89 TIME 4:42:23 pm | 3/39 |

LINE # SOURCE TEXT

```
    unsigned short dir ;
    name = pin_table [ i ] . pin_name ;
    dir = pin_table [ i ] . direction ;
    while ( i-- )
      if
        ( pin_table [ i ] . direction == dir &&
          strcmp ( pin_table [ i ] . pin_name , name ) == 0
        )
        return 1 ;
    return 0 ;
  } /* seen_pin */

static void
get_more_pins ( pin_table , i , pins )
  PIN_SPEC *pin_table ;
  unsigned short i , pins ;
  { char *name ;
    unsigned short dir ;
    name = pin_table [ i ] . pin_name ;
    dir = pin_table [ i ] . direction ;
    for ( ++i ; i < pins ; ++i )
      if
        ( pin_table [ i ] . direction == dir &&
          strcmp ( pin_table [ i ] . pin_name , name ) == 0
        )
        { print_str ( "," ) ;
          print_str ( pin_name ( pin_table [ i ] . pin_number ) ) ;
        }
  } /* get_more_pins */

static unsigned short
seen_delay ( pins , i , j )
  PIN_SPEC *pins ;
  unsigned short i , j ;
  { unsigned short ii , jj , pin , state ;
    pin = pins [ i ] . delay_table [ j ] . minor_pin ;
    state = pins [ i ] . delay_table [ j ] . minor_state ;
    for ( ii = 0 ; ii < i ; ++ii )
      if ( pins [ ii ] . direction == OUT || pins [ ii ] . direction == IO )
        for ( jj = 0 ; jj < pins [ ii ] . delay_cnt ; ++jj )
          if
            ( pin == pins [ ii ] . delay_table [ jj ] . minor_pin &&
              state == pins [ ii ] . delay_table [ jj ] . minor_state
            )
            return 1 ;
    for ( jj = 0 ; jj < j ; ++jj )
      if
        ( pin == pins [ i ] . delay_table [ jj ] . minor_pin &&
          state == pins [ i ] . delay_table [ jj ] . minor_state
        )
        return 1 ;
    return 0 ;
  } /* seen_delay */

static void
do_to_delay ( pin , delay , mtyms )
  PIN_SPEC *pin ;
  TIMING_SPEC *delay ;
  MIN_TYP_MAX *mtyms ;
  { print_str ( "to " ) ;
    print_str ( state_of ( delay -> major_state ) ) ;
    print_str ( "(" ) ;
    print_str ( pin_name ( pin -> pin_name ) ) ;
    print_str ( ")=" ) ;
    print_flt ( ( float ) mtyms [ delay -> mtym_index ] . minimum / 1000 ) ;
    print_str ( "," ) ;
    print_flt ( ( float ) mtyms [ delay -> mtym_index ] . typical / 1000 ) ;
    print_str ( "," ) ;
    print_flt ( ( float ) mtyms [ delay -> mtym_index ] . maximum / 1000 ) ;
    print_str ( "\n" ) ;
  } /* do_to_delay */

static void
get_more_to_delays ( pins , i , pin_cnt , j , mtyms )
  PIN_SPEC *pins ;
  unsigned short i , pin_cnt , j ;
  MIN_TYP_MAX *mtyms ;
  { unsigned short pin , state ;
    pin = pins [ i ] . delay_table [ j ] . minor_pin ;
    state = pins [ i ] . delay_table [ j ] . minor_state ;
    for ( ++j ; j < pins [ i ] . delay_cnt ; ++j )
      if
        ( pin == pins [ i ] . delay_table [ j ] . minor_pin &&
          state == pins [ i ] . delay_table [ j ] . minor_state
        )
        do_to_delay ( pins + i , pins [ i ] . delay_table + j , mtyms ) ;
    for ( ++i ; i < pin_cnt ; ++i )
      if ( pins [ i ] . direction == OUT || pins [ i ] . direction == IO )
        for ( j = 0 ; j < pins [ i ] . delay_cnt ; ++j )
          if
            ( pin == pins [ i ] . delay_table [ j ] . minor_pin &&
              state == pins [ i ] . delay_table [ j ] . minor_state
            )
            do_to_delay ( pins + i , pins [ i ] . delay_table + j , mtyms ) ;
  } /* get_more_to_delays */

char *
extract_device ( device )
  DEVICE_SPEC *device ;
  { unsigned short
      i ,
      j ,
      comma ,
      seen ;
    PIN_SPEC *pin ;
    TIMING_SPEC *delay ;
    double device_Isl = -1 ;
    if ( device == NULL )
      return NULL ;
    init_buf ( ) ;
    print_str ( "device_name " ) ;
    print_str ( pin_name ( device -> device_name ) ) ;
    print_str ( "\ndevice_usage " ) ;
    print_str ( dev_of ( device -> device_type ) ) ;
    if ( device -> modeler_name != NULL )
      { print_str ( "\nmodeler_name " ) ;
        print_str ( device -> modeler_name ) ;
      }
    print_str ( "\nclock_type " ) ;
    print_str ( clock_of ( device -> clock_type ) ) ;
```

Copyright 1989
Logic Modeling Systems

SOURCE PROGRAM shellswm/extract_dev.c | DATE 5/23/89 | TIME 4:42:23 pm | PAGE # 4/40

LINE # SOURCE TEXT

```
      print_str ( "\ndevice_speed " ) ;
      if ( device -> clock_period1 >= 1000000 )
        { print_flt ( ( float ) device -> clock_period1 / 1000000 ) ;
          print_str ( " uS-" ) ;
        }
      else
        { print_flt ( ( float ) device -> clock_period1 / 1000 ) ;
          print_str ( " nS-" ) ;
        }
      if ( device -> clock_period2 == -1 )
        print_str ( "infinity\n" ) ;
      else if ( device -> clock_period2 % 1000000 == 0 )
        { print_flt ( ( float ) device -> clock_period2 / 1000000 ) ;
          print_str ( " uS\n" ) ;
        }
      else
        { print_flt ( ( float ) device -> clock_period2 / 1000 ) ;
          print_str ( " nS\n" ) ;
        }
      if ( device -> ultra_fast )
        print_str ( "ultra_fast\n" ) ;
      if ( device -> dis_tim_check )
        print_str ( "disable_timing_checking\n" ) ;
      if ( device -> inh_tim_measure )
        print_str ( "inhibit_timing_measurement\n" ) ;
      if ( device -> report_miss )
        print_str ( "report missing_delays on\n" ) ;
      else
        print_str ( "report missing_delays off\n" ) ;
      if ( device -> report_iosc )
        print_str ( "report io_stare_changes on\n" ) ;
      for ( i = 0 ; device_Ial == -1 && i < device -> pin_cnt ; ++i )
        if ( device -> pin_table [ i ] . direction == OUT )
          device_Ial =
            ( float ) soft_drive_of
              ( device -> pin_table [ i ] . s_drive_low ,
                200 ,
                500 ,
                1200 ,
                3000
              ) / 1000 ;
      if ( device_Ial == -1 )
        device_Ial = 0.5 ;
      print_str ( "technology custom Vcc=" ) ;
      print_flt ( ( float ) device -> vcc / 1000 ) ;
      print_str ( ",Vhth=" ) ;
      print_flt ( ( float ) device -> vhth / 1000 ) ;
      print_str ( ",Vlth=" ) ;
      print_flt ( ( float ) device -> vlth / 1000 ) ;
      print_str ( ",Vih=" ) ;
      print_flt ( ( float ) device -> vih / 1000 ) ;
      print_str ( ",Vil=" ) ;
      print_flt ( ( float ) device -> vil / 1000 ) ;
      print_str ( ",Vah=" ) ;
      print_flt ( ( float ) device -> vah / 1000 ) ;
      print_str ( ",Val=" ) ;
      print_flt ( ( float ) device -> val / 1000 ) ;
      print_str ( ",Iil=-" ) ;
      print_flt ( device_Ial / 2 ) ;
      print_str ( ",Iih=" ) ;
      print_flt ( device_Ial / 2 ) ;
      print_str ( ",Iol=" ) ;
      print_flt ( device_Ial ) ;
      print_str ( ",Ioh=-" ) ;
      print_flt ( device_Ial ) ;
      print_str ( "\n" ) ;
      if ( device -> five_state_sample )
        { print_str ( "device_sample_time " ) ;
          print_flt ( ( float ) device -> five_state_sample / 1000 ) ;
          print_str ( "\n" ) ;
        }
/* what about two-state sample? */
      if ( device -> setup_time != -1 )
        { print_str ( "device_setup_time " ) ;
          print_flt ( ( float ) device -> setup_time / 1000 ) ;
          print_str ( "\n" ) ;
        }
      if ( device -> hold_time != -1 )
        { print_str ( "device_hold_time " ) ;
          print_flt ( ( float ) device -> hold_time / 1000 ) ;
          print_str ( "\n" ) ;
        }
      seen = 0 ;
      for ( i = 0 ; i < device -> pin_cnt ; ++i )
        { pin = device -> pin_table + i ;
          if ( pin -> direction == IN )
            { if ( ! seen )
                { print_str ( "in_pin\n" ) ;
                  seen = 1 ;
                }
              print_str ( pin_name ( pin -> pin_name ) ) ;
              print_str ( "=" ) ;
              print_str ( pin_name ( pin -> pin_number ) ) ;
              if ( comma = pin -> pin_class != DATA )
                { print_str ( ":" ) ;
                  print_str
                    ( class_of ( pin -> pin_class , pin -> clk_format )
                    ) ;
                }
              if ( pin -> kept_alive )
                print_str ( comma ? ",keepalive" : ":keepalive" ) ;
              print_str ( "\n" ) ;
            }
        }
      seen = 0 ;
      for ( i = 0 ; i < device -> pin_cnt ; ++i )
        { pin = device -> pin_table + i ;
          if ( pin -> direction == OUT )
            { if ( ! seen )
                { print_str ( "out_pin\n" ) ;
                  seen = 1 ;
                }
              print_str ( pin_name ( pin -> pin_name ) ) ;
              print_str ( "=" ) ;
              print_str ( pin_name ( pin -> pin_number ) ) ;
              if ( comma = pin -> feeds_back )
                print_str ( ":feedback" ) ;
              if ( pin -> pulled_up )
                print_str ( comma ? ",pull_up" : ":pull_up" ) ;
              else if ( pin -> pulled_down )
```

Copyright 1989 Logic Modeling Systems

SOURCE PROGRAM shellswm/extract_dev.c | DATE 5/23/89 | TIME 4:42:23 pm | PAGE # 5/41

LINE # SOURCE TEXT

```
                print_str ( comma ? ",pull_down" : ":pull_down" ) ;
              print_str ( "\n" ) ;
            }
        }
    seen = 0 ;
    for ( i = 0 ; i < device -> pin_cnt ; ++i )
      { pin = device -> pin_table + i ;
        if ( pin -> direction == IO )
          { if ( ! seen )
              { print_str ( "io_pin\n" ) ;
                seen = 1 ;
              }
            print_str ( pin_name ( pin -> pin_name ) ) ;
            print_str ( "=" ) ;
            print_str ( pin_name ( pin -> pin_number ) ) ;
            comma = pin -> pin_class != DATA ;
            if ( comma )
              { print_str ( ":" ) ;
                print_str
                  ( class_of ( pin -> pin_class , pin -> clk_format )
                  ) ;
              }
            if ( pin -> feeds_back )
              { print_str ( comma ? ",feedback" : ":feedback" ) ;
                comma = 1 ;
              }
            if ( pin -> kept_alive )
              { print_str ( comma ? ",keepalive" : ":keepalive" ) ;
                comma = 1 ;
              }
            if
              ( pin -> in_seq_drive !=
                ( device -> ultra_fast ? HM_DRIVE : M_DRIVE )
              )
              { print_str
                  ( comma ? ",in_sequence=" : ":in_sequence="
                  ) ;
                print_str ( drive_of ( pin -> in_seq_drive ) ) ;
                comma = 1 ;
              }
            if
              ( pin -> last_cyc_drive !=
                ( device -> ultra_fast ? HM_DRIVE : M_DRIVE ) &&
                pin -> last_cyc_drive != NO_DRIVE
              )
              { print_str ( comma ? ",last_cycle=" : ":last_cycle=" ) ;
                print_str ( drive_of ( pin -> last_cyc_drive ) ) ;
                comma = 1 ;
              }
            print_str ( comma ? ",Iil=-" : ":Iil=-" ) ;
            print_flt
              ( ( float ) soft_drive_of
                  ( pin -> s_drive_low ,
                    200 ,
                    500 ,
                    1200 ,
                    3000
                  ) / 2000
              ) ;
            print_str ( ",Iih=" ) ;
            print_flt
              ( ( float ) soft_drive_of
                  ( pin -> s_drive_hi ,
                    100 ,
                    500 ,
                    1200 ,
                    2000
                  ) / 2000
              ) ;
            if ( pin -> pulled_up )
              print_str ( ",pull_up" ) ;
            else if ( pin -> pulled_down )
              print_str ( ",pull_down" ) ;
            print_str ( "\n" ) ;
          }
      }
    for ( i = 0 ; i < device -> pin_cnt ; ++i )
      { pin = device -> pin_table + i ;
        if ( pin -> direction == POWER )
          { if ( ! seen_pin ( device -> pin_table , i ) )
                { print_str ( "power_pin " ) ;
                  print_str ( pin_name ( pin -> pin_name ) ) ;
                  print_str ( "=" ) ;
                  print_str ( pin_name ( pin -> pin_number ) ) ;
                  get_more_pins ( device -> pin_table , i , device -> pin_cnt ) ;
                  print_str ( "\n" ) ;
                }
          }
        else if ( pin -> direction == GROUND )
          { if ( ! seen_pin ( device -> pin_table , i ) )
                { print_str ( "ground_pin " ) ;
                  print_str ( pin_name ( pin -> pin_name ) ) ;
                  print_str ( "=" ) ;
                  print_str ( pin_name ( pin -> pin_number ) ) ;
                  get_more_pins ( device -> pin_table , i , device -> pin_cnt ) ;
                  print_str ( "\n" ) ;
                }
          }
        else if ( pin -> direction == NC )
          { if ( ! seen_pin ( device -> pin_table , i ) )
                { print_str ( "nc_pin " ) ;
                  print_str ( pin_name ( pin -> pin_name ) ) ;
                  print_str ( "=" ) ;
                  print_str ( pin_name ( pin -> pin_number ) ) ;
                  get_more_pins ( device -> pin_table , i , device -> pin_cnt ) ;
                  print_str ( "\n" ) ;
                }
          }
      }
    print_str ( "package_mapping\n" ) ;
    for ( i = 0 ; i < device -> pin_cnt ; ++i )
      { pin = device -> pin_table + i ;
        if ( pin -> direction != NONE )
          { print_str ( pin_name ( pin -> pin_number ) ) ;
            print_str ( "=" ) ;
            print_num ( ( long ) i ) ;
            print_str ( "\n" ) ;
          }
      }
    print_str ( "adapter_mapping\n" ) ;
```

Copyright 1989
Logic Modeling Systems

SOURCE PROGRAM shellswm/extract_dev.c | DATE 5/23/89 | TIME 4:42:23 pm | PAGE # 6/42

LINE # SOURCE TEXT

```
        j = 0 ;
        for ( i = 0 ; i < device -> pin_cnt ; ++i )
          { pin = device -> pin_table + i ;
            if ( pin -> direction != NONE )
              { print_num ( ( long ) i ) ;
                print_str ( "=" ) ;
                print_num ( ( long ) i ) ;
                if ( pin -> trace_delay )
                  { print_str ( ":trace_delay=" ) ;
                    print_flt ( ( float ) pin -> trace_delay / 1000 ) ;
                  }
                print_str ( "\n" ) ;
                if ( pin -> pin_alias != NULL )
                  j = 1 ;
              }
          }
        if ( j )
          { print_str ( "pin_name_mapping\n" ) ;
            for ( i = 0 ; i < device -> pin_cnt ; ++i )
              { pin = device -> pin_table + i ;
                if ( pin -> direction != NONE && pin -> pin_alias != NULL )
                  { print_str ( pin_name ( pin -> pin_alias ) ) ;
                    print_str ( "=" ) ;
                    print_str ( pin_name ( pin -> pin_name ) ) ;
                    print_str ( "\n" ) ;
                  }
              }
          }
        for ( i = 0 ; i < device -> seq_cnt ; ++i )
          { if ( i == 0 )
                print_str ( "initialize\n" ) ;
            print_str
              ( pin_name
                  ( device -> pin_table
                      [ device -> seq_table [ i ] . pin_number
                      ] . pin_name
                  )
              ) ;
            print_str ( "=" ) ;
            print_str ( device -> seq_table [ i ] . seq_str ) ;
            print_str ( "\n" ) ;
          }
        seen = 0 ;
        if ( device -> use_default )
          { print_str ( "default_delay " ) ;
            print_flt ( ( float ) device -> default_delay . minimum / 1000 ) ;
            print_str ( "," ) ;
            print_flt ( ( float ) device -> default_delay . typical / 1000 ) ;
            print_str ( "," ) ;
            print_flt ( ( float ) device -> default_delay . maximum / 1000 ) ;
            print_str ( "\n" ) ;
          }
        for ( i = 0 ; i < device -> pin_cnt ; ++i )
          { pin = device -> pin_table + i ;
            if ( pin -> direction == OUT || pin -> direction == IO )
              { for ( j = 0 ; j < pin -> delay_cnt ; ++j )
                  { delay = pin -> delay_table + j ;
                    if ( ! seen_delay ( device -> pin_table , i , j ) )
                      { if ( ! seen )
                          { print_str ( "delay\n" ) ;
                            seen = 1 ;
                          }
                        print_str ( "from " ) ;
                        print_str ( state_of ( delay -> minor_state ) ) ;
                        print_str ( "(" ) ;
                        print_str
                          ( pin_name
                              ( device ->
                                  pin_table [ delay -> minor_pin ] . pin_name
                              )
                          ) ;
                        print_str ( ")\n" ) ;
                        do_to_delay ( pin , delay , device -> mtym_table ) ;
                        get_more_to_delays
                          ( device -> pin_table ,
                            i ,
                            device -> pin_cnt ,
                            j ,
                            device -> mtym_table
                          ) ;
                      }
                  }
              }
          }
      return buf_size ? the_buf : NULL ;
    } /* extract_device */

/* end of [illegible] Device Definition Extracter */
```

Copyright 1989
Logic Modeling Systems

| SOURCE PROGRAM | DATE | PAGE # |
|---|---|---|
| shellswm/free_dev.c | 5/23/89 | 1/43 |
| | TIME 4:42:24 pm | |

LINE # SOURCE TEXT

```
/* SCCS_ID: free_dev.c rev 3.1, 4/24/89 at 08:01:16      */

/* routine to free a SWML device */

# include "device.h"

extern void lm_free ( ) ;

static void
free_pin_table ( device )
  struct device *device ;
  /* frees the pin table of the passed device */
  { unsigned short i ;
    if ( device -> pin_table == NULL )
      return ;
    for ( i = 0 ; i < device -> pin_cnt ; ++i )
      { if ( device -> pin_table [ i ] . pin_name != NULL )
          ( void ) lm_free ( device -> pin_table [ i ] . pin_name ) ;
        if ( device -> pin_table [ i ] . pin_number != NULL )
          ( void ) lm_free ( device -> pin_table [ i ] . pin_number ) ;
        if ( device -> pin_table [ i ] . pin_alias != NULL )
          ( void ) lm_free ( device -> pin_table [ i ] . pin_alias ) ;
      }
    ( void ) lm_free ( ( char * ) device -> pin_table ) ;
  } /* free_pin_table */

static void
free_seq_table ( device )
  struct device *device ;
  /* frees the initialization sequence of the passed device */
  { unsigned short i ;
    char *bits ;
    if ( device -> seq_table == NULL )
      return ;
    for ( i = 0 ; i < device -> seq_cnt ; ++i )
      { bits = device -> seq_table [ i ] . pre_bits ;
        if ( bits != NULL )
          ( void ) lm_free ( bits ) ;
        bits = device -> seq_table [ i ] . fb_bits ;
        if ( bits != NULL )
          ( void ) lm_free ( bits ) ;
        bits = device -> seq_table [ i ] . post_bits ;
        if ( bits != NULL )
          ( void ) lm_free ( bits ) ;
        bits = device -> seq_table [ i ] . seq_str ;
        if ( bits != NULL )
          ( void ) lm_free ( bits ) ;
      }
    ( void ) lm_free ( ( char * ) device -> seq_table ) ;
  } /* free_seq_table */

static void
free_timing_table ( device )
  struct device *device ;
  /* frees the timing table of the passed device */
  { if ( device -> timing_table != NULL )
      ( void ) lm_free ( ( char * ) device -> timing_table ) ;
  } /* free_timing_table */

static void
free_mtym_table ( device )
  struct device *device ;
  /* frees the min-typ-max table of the passed device */
  { if ( device -> mtym_table != NULL )
      ( void ) lm_free ( ( char * ) device -> mtym_t ble ) ;
  } /* free_mtym_table */

void
free_device ( device )
  struct device *device ;
  /* frees the device and associated structures pointed to by device */
  { if ( device == NULL )
      return ;
    if ( device -> device_name != NULL )
      ( void ) lm_free ( device -> device_name ) ;
    if ( device -> modeler_name != NULL )
      ( void ) lm_free ( device -> modeler_name ) ;
    free_pin_table ( device ) ;
    free_seq_table ( device ) ;
    free_timing_table ( device ) ;
    free_mtym_table ( device ) ;
    ( void ) lm_free ( ( char * ) device ) ;
  } /* free_device */

/* end of routine to free a SWML device */
```

Copyright 1989
Logic Modeling Systems

SOURCE PROGRAM shellswm/print.c

DATE 5/23/89 TIME 4:42:24 pm PAGE # 1/44

LINE # SOURCE TEXT

```
/* SCCS_ID: print.c rev 3.2, 5/9/89 at 15:25:06        */

/*
 *  Device Printer for HMBL Processor
 */

# ifdef WRITE_DEVICE

# include "common.h"
# include "HMBL.h"
# include <strings.h>
# include "strng.h"
# include "Hparse.h"
# include "trees.h"
# include "Hconst.h"

static void
print_attr ( attr )
  struct pin_attr *attr ;
  /* prints the passed attribute */
  { switch ( attr -> use_flag )
      { case ID_ATTR :
          lm_print_message ( "%s" , symtostr ( attr -> attr . id ) ) ;
          break ;
        case CURRENT_SPEC :
          switch ( attr -> attr . cur_spec . cur )
            { case C_Iih :
              case C_Iol :
                lm_print_message
                  ( "%s = %g" ,
                    symtostr ( attr -> attr . cur_spec . cur ) ,
                    attr -> attr . cur_spec . val
                  ) ;
                break ;
              case C_Iil :
              case C_Ioh :
                lm_print_message
                  ( "%s = -%g" ,
                    symtostr ( attr -> attr . cur_spec . cur ) ,
                    attr -> attr . cur_spec . val
                  ) ;
                break ;
              case C_pull_up :
              case C_pull_down :
                lm_print_message
                  ( "%s = %lu" ,
                    symtostr ( attr -> attr . cur_spec . cur ) ,
                    ( unsigned long ) attr -> attr . cur_spec . val
                  ) ;
                break ;
              default :
ASSERT(attr->attr.cur_spec.cur!=attr->attr.cur_spec.cur);
                break ;
            }
          break ;
        case CYCLE_SPEC :
          lm_print_message
            ( "%s = %s" ,
              symtostr ( attr -> attr . cyc_spec . seq ) ,
              symtostr ( attr -> attr . cyc_spec . drv )
            ) ;
          break ;
        default :
          lm_Herror
            ( 1 ,
/*LMSG*/"internal error: print_attr: bad use_flag: %d"
              , attr -> use_flag
            ) ;
          break ;
      }
  } /* print_attr */

static ushort
_valof ( sym )
  symbol sym ;
  /* returns the integer value of the passed symbol */
  { ushort val = 0 ;
    char *str = symtostr ( sym ) ;
    do
      { val *= 10 ;
        val += *str - '0' ;
      }
    while ( *++str != '\0' ) ;
    return val ;
  } /* _valof */

static void
gen_sequence ( bits )
  tree bits ;
  /* prints the source sequence that represents the passed tree */
  { ushort
      i ,
      kids ,
      repeat ;
    tree kid ;
    switch ( nameofnode ( bits ) )
      { case P_NUM_ :
          lm_print_message ( "%s" , symtostr ( textofnode ( bits ) ) ) ;
          break ;
        case N_LIST :
          kids = kidcount ( bits ) ;
          gen_sequence ( subtree ( 1 , bits ) ) ;
          for ( i = 2 ; i <= kids ; ++i )
            { lm_print_message ( "," ) ;
              gen_sequence ( subtree ( i , bits ) ) ;
            }
          break ;
        case N_REPEAT :
          kid = subtree ( 2 , bits ) ;
          repeat = _valof ( textofnode ( subtree ( 1 , bits ) ) ) ;
          lm_print_message ( "%d(" , repeat ) ;
          gen_sequence ( kid ) ;
          lm_print_message ( ")" ) ;
          break ;
        case N_FEEDBACK :
          lm_print_message
            ( "%s(" ,
              symtostr ( textofnode ( subtree ( 1 , bits ) ) )
            ) ;
          gen_sequence ( subtree ( 2 , bits ) ) ;
```

Copyright 1989
Logic Modeling Systems

SOURCE PROGRAM shellswm/print.c | DATE 5/23/89 | TIME 4:42:24 pm | PAGE # 2/45

LINE # SOURCE TEXT

```
            lm_print_message ( ")" ) ;
            break ;
          default :
            lm_Eerror
              ( 1 ,
/*LMSG*/"internal error: ba...      in gen_sequence"
              ) ;
            break ;
        }
  } /* gen_sequence */

static void
print_pin_name ( name )
  symbol name ;
  { char *n ;
    n = symtostr ( name ) ;
    while ( *n != '\0' )
      if
        ( *n >= 'A' && *n <= 'Z' ||
          *n >= 'a' && *n <= 'z' ||
          *n >= '0' && *n <= '9' ||
          *n == '_' || *n == '.'
        )
        ++n ;
      else
        break ;
    if ( *n == '\0' )
      { lm_print_message ( "%s" , symtostr ( name ) ) ;
        return ;
      }
    lm_print_message ( "'" ) ;
    n = symtostr ( name ) ;
    while ( *n != '\0' )
      { if ( *n == '\'' )
          lm_print_message ( "''" ) ;
        else
          lm_print_message ( "%c" , *n ) ;
        ++n ;
      }
    lm_print_message ( "'" ) ;
  } /* print_pin_name */

static void
print_sequence ( seq )
  struct sequence *seq ;
  /* prints the passed sequence */
  { lm_print_message ( "  " ) ;
    print_pin_name ( seq -> pin_name ) ;
    lm_print_message ( " = " ) ;
    gen_sequence ( seq -> bits ) ;
    lm_print_message ( "\n" ) ;
  } /* print_sequence */

static ushort
seen_pin ( pins , i )
  struct pins *pins ;
  ushort i ;
  { symbol name ;
    name = pins [ i ] . name ;
    while ( i-- )
      if ( pins [ i ] . name == name )
        return 1 ;
    return 0 ;
  } /* seen_pin */

static void
get_more_pins ( pins , i , count )
  struct pins *pins ;
  ushort i , count ;
  { symbol name ;
    name = pins [ i ] . name ;
    for ( ++i ; i < count ; ++i )
      if ( pins [ i ] . name == name )
        { lm_print_message ( "," ) ;
          print_pin_name ( pins [ i ] . pkg_name ) ;
        }
  } /* get_more_pins */

static void
print_timing ( min , typ , max )
  unsigned long min , typ , max ;
  { ushort comma = 0 ;
    if ( min != -1 )
      { lm_print_message ( "min %g" , ( float ) min / 1000 ) ;
        comma = 1 ;
      }
    if ( typ != -1 )
      { lm_print_message
          ( "%styp %g" , comma ? "," : "" , ( float ) typ / 1000 ) ;
        comma = 1 ;
      }
    if ( max != -1 )
      lm_print_message
        ( "%smax %g" , comma ? "," : "" , ( float ) max / 1000 ) ;
  } /* print_timing */

void
print_dev ( t )
  struct dev *t ;
  /* prints the passed device */
  { ushort
      i ,
      j ,
      comma ;
    tree dir ;
    symbol num ;
    struct timing *tim ;
    if
      ( lm_El_flag_on ( ) ||
        lm_Ep_flag_on ( ) ||
        lm_Es_flag_on ( ) ||
        lm_Et_flag_on ( ) ||
        lm_Eg_flag_on ( )
      )
      lm_print_message ( "\n" ) ;
    lm_print_message ( "device_name " ) ;
    print_pin_name ( t -> dev_name ) ;
    lm_print_message ( "\ndevice_usage %s\n" , symtostr ( t -> dev_type ) ) ;
    if ( t -> mod_name != NULLSYM )
      lm_print_message ( "modeler_name %s\n" , symtostr ( t -> mod_name ) ) ;
```

Copyright 1989
Logic Modeling Systems

SOURCE PROGRAM shellswm/print.c | DATE 5/23/89 | TIME 4:42:24 pm | PAGE # 3/46

LINE # SOURCE TEXT

```
      lm_print_message ( "clock_type %s\n" , symtostr ( t -> clk_type ) ) ;
      lm_print_message ( "device_speed " ) ;
      if ( t -> clk_period1 % 1000000 == 0 )
        lm_print_message ( "%g mS - " , ( float ) t -> clk_period1 / 1000000 ) ;
      else
        lm_print_message ( "%g mS - " , ( float ) t -> clk_period1 / 1000 ) ;
      if ( t -> clk_period2 == 0 )
        lm_print_message ( "infinity\n" ) ;
      else if ( t -> clk_period2 % 1000000 == 0 )
        lm_print_message ( "%g mS\n" , ( float ) t -> clk_period2 / 1000000 ) ;
      else
        lm_print_message ( "%g mS\n" , ( float ) t -> clk_period2 / 1000 ) ;
      if ( t -> ultra_fast )
        lm_print_message ( "ultra_fast\n" ) ;
      if ( t -> dis_tim_check )
        lm_print_message ( "disable_timing_checking\n" ) ;
      if ( t -> inh_tim_measure )
        lm_print_message ( "inhibit_timing_measurement\n" ) ;
      if ( t -> missing_delays != NULLSYM )
        lm_print_message
          ( "report missing_delays %s\n" ,
            symtostr ( t -> missing_delays )
          ) ;
      if ( t -> io_store_changes != NULLSYM )
        lm_print_message
          ( "report io_store_changes %s\n" ,
            symtostr ( t -> io_store_changes )
          ) ;
      lm_print_message ( "technology %s " , symtostr ( t -> technology ) ) ;
      lm_print_message ( "Vcc=%g," , t -> Vcc ) ;
      lm_print_message ( "Vhth=%g," , t -> Vhth ) ;
      lm_print_message ( "Vlth=%g," , t -> Vlth ) ;
      lm_print_message ( "Vih=%g," , t -> Vih ) ;
      lm_print_message ( "Vil=%g," , t -> Vil ) ;
      lm_print_message ( "Vsh=%g," , t -> Vsh ) ;
      lm_print_message ( "Vsl=%g," , t -> Vsl ) ;
      lm_print_message ( "Iil=-%g," , t -> Iil ) ;
      lm_print_message ( "Iih=%g," , t -> Iih ) ;
      lm_print_message ( "Iol=%g," , t -> Iol ) ;
      lm_print_message ( "Ioh=-%g\n" , t -> Ioh ) ;
      if ( t -> def_setup != UNDEFINED )
        lm_print_message ( "device_setup_time %g\n" , t -> def_setup / 1000 ) ;
      if ( t -> def_hold != UNDEFINED )
        lm_print_message ( "device_hold_time %g\n" , t -> def_hold / 1000 ) ;
      if ( t -> def_sample != UNDEFINED )
        lm_print_message ( "device_sample_time %g\n" , t -> def_sample / 1000 ) ;
      for ( i = 0 ; i < t -> pin_cnt ; ++i )
        if ( t -> pins [ i ] . number < MAX_PINS )
          { num = t -> pins [ i ] . name ;
            dir = g_lookup ( num ) ;
            if ( nameofnode ( dir ) == N_POWER_PINS )
              { if ( ! seen_pin ( t -> pins , i ) )
                  { lm_print_message ( "power_pin " ) ;
                    print_pin_name ( num ) ;
                    lm_print_message ( " = " ) ;
                    print_pin_name ( t -> pins [ i ] . pkg_name ) ;
                    get_more_pins ( t -> pins , i , t -> pin_cnt ) ;
                    lm_print_message ( "\n" ) ;
                  }
              }
            else if ( nameofnode ( dir ) == N_GROUND_PINS )
              { if ( ! seen_pin ( t -> pins , i ) )
                  { lm_print_message ( "ground_pin " ) ;
                    print_pin_name ( num ) ;
                    lm_print_message ( " = " ) ;
                    print_pin_name ( t -> pins [ i ] . pkg_name ) ;
                    get_more_pins ( t -> pins , i , t -> pin_cnt ) ;
                    lm_print_message ( "\n" ) ;
                  }
              }
            else if ( nameofnode ( dir ) == N_NC_PINS )
              { if ( ! seen_pin ( t -> pins , i ) )
                  { lm_print_message ( "nc_pin " ) ;
                    print_pin_name ( num ) ;
                    lm_print_message ( " = " ) ;
                    print_pin_name ( t -> pins [ i ] . pkg_name ) ;
                    get_more_pins ( t -> pins , i , t -> pin_cnt ) ;
                    lm_print_message ( "\n" ) ;
                  }
              }
            else
              {
ASSERT(i==pin_name_of(num));
                lm_print_message
                  ( nameofnode ( dir ) == N_IN_PINS ? "in_pin " :
                    nameofnode ( dir ) == N_IO_PINS ? "io_pin " :
                      "out_pin "
                  ) ;
                print_pin_name ( num ) ;
                lm_print_message ( " = " ) ;
                print_pin_name ( t -> pins [ i ] . pkg_name ) ;
                if ( t -> pins [ i ] . num_attrs )
                  { comma = 0 ;
                    for ( j = 0 ; j < t -> pins [ i ] . num_attrs ; ++j )
                      { lm_print_message ( " %c " , comma ? ',' : ':' ) ;
                        print_attr ( t -> pins [ i ] . attr + j ) ;
                        comma = 1 ;
                      }
                  }
                lm_print_message ( "\n" ) ;
              }
          }
      lm_print_message ( "package_mapping\n" ) ;
      for ( i = 0 ; i < t -> pin_cnt ; ++i )
        if ( t -> pins [ i ] . number < MAX_PINS )
          { print_pin_name ( t -> pins [ i ] . pkg_name ) ;
            lm_print_message ( "=%d\n" , t -> pins [ i ] . number ) ;
          }
      lm_print_message ( "adapter_mapping\n" ) ;
      j = 0 ;
      for ( i = 0 ; i < t -> pin_cnt ; ++i )
        if ( t -> pins [ i ] . number < MAX_PINS )
          { lm_print_message
              ( "%d=%d" ,
                t -> pins [ i ] . number ,
                t -> pins [ i ] . number
              ) ;
            if ( t -> pins [ i ] . trace_delay )
              lm_print_message
                ( ":trace_delay=%g" ,
```

Copyright 1989 Logic Modeling Systems

SOURCE PROGRAM shellswm/print.c | DATE 5/23/89 | TIME 4:42:24 pm | PAGE # 4/47

LINE # SOURCE TEXT

```
              ( float ) t -> pins [ i ] . trace_delay / 1000
            ) ;
          lm_print_message ( "\n" ) ;
          if ( t -> pins [ i ] . alias != NULLSYM )
            j = 1 ;
        }
      if ( j )
        { lm_print_message ( "pin_name_mapping\n" ) ;
          for ( i = 0 ; i < t -> pin_cnt ; ++i )
            if ( t -> pins [ i ] . number < MAX_PINS )
              if ( t -> pins [ i ] . alias != NULLSYM )
                { print_pin_name ( t -> pins [ i ] . alias ) ;
                  lm_print_message ( "=" ) ;
                  print_pin_name ( t -> pins [ i ] . name ) ;
                  lm_print_message ( "\n" ) ;
                }
        }
      if ( t -> num_seqs )
        { lm_print_message ( "initialize\n" ) ;
          for ( i = 0 ; i < t -> num_seqs ; ++i )
            print_sequence ( t -> sequences + i ) ;
        }
      if ( t -> use_default )
        { lm_print_message ( "default_delay " ) ;
          print_timing
            ( t -> min_default ,
              t -> typ_default ,
              t -> max_default
            ) ;
          lm_print_message ( "\n" ) ;
        }
      for ( i = 0 ; i < t -> pin_cnt ; ++i )
        { tim = t -> pins [ i ] . timing_list ;
          while ( tim != NULL )
            { lm_print_message
                ( "delay from %s("/*)*/ ,
                  symtostr ( tim -> minor_state )
                ) ;
              print_pin_name ( tim -> minor_pin_name ) ;
              lm_print_message
                ( /*(*/") to %s("/*)*/ ,
                  symtostr ( tim -> major_state )
                ) ;
              print_pin_name ( t -> pins [ i ] . name ) ;
              lm_print_message ( /*(*/")" ) ;
              lm_print_message ( " = " ) ;
              print_timing
                ( tim -> minimum ,
                  tim -> typical ,
                  tim -> maximum
                ) ;
              lm_print_message ( "\n" ) ;
              tim = tim -> next ;
            }
        }
  } /* print_dev */

static void
print_pin ( T )
  tree T ;
  { if ( nameofnode ( T ) == N_PIN_NAME )
      { lm_print_message ( symtostr ( textofnode ( subtree ( 1 , T ) ) ) ) ;
        lm_print_message ( "[" ) ;
        lm_print_message ( symtostr ( textofnode ( subtree ( 2 , T ) ) ) ) ;
        if ( kidcount ( T ) == 3 )
          { lm_print_message ( ":" ) ;
            lm_print_message ( symtostr ( textofnode ( subtree ( 3 , T ) ) ) ) ;
          }
        lm_print_message ( "]" ) ;
      }
    else
      lm_print_message ( symtostr ( textofnode ( T ) ) ) ;
  } /* print_pin */

static void
print_pin_map ( T )
  tree T ;
  { ushort j , i , kids ;
    tree k , kid ;
    kids = kidcount ( T ) ;
    for ( i = 1 ; i <= kids ; ++i )
      { kid = subtree ( i , T ) ;
        for ( j = 1 ; nameofnode ( k = subtree ( j , kid ) ) != N_NAMES ; ++j )
          { lm_print_message ( "     { " ) ;
            print_pin ( k ) ;
            lm_print_message ( "\t= " ) ;
            print_pin ( k ) ;
            lm_print_message ( " }\n" ) ;
          }
      }
  } /* print_pin_map */

void
print_map ( T )
  tree T ;
  { ushort i , kids ;
    tree kid ;
    lm_print_message ( "{ If you change the pin name mapping " ) ;
    lm_print_message ( "of any of the pins defined bel   \t}\n" ) ;
    lm_print_message ( "{ you must uncomment the following " ) ;
    lm_print_message ( "line by removing the two braces.\t}\n" ) ;
    lm_print_message ( "{pin_name_mapping}\n" ) ;
    lm_print_message ( "\n{ The following lines define the " ) ;
    lm_print_message ( "pin name mapping for this device.\t}\n" ) ;
    lm_print_message ( "\n{ Change the pin name on the left " ) ;
    lm_print_message ( "of the equals to correspond with your\t}\n" ) ;
    lm_print_message ( "{ CAE system's pin names.  Do not " ) ;
    lm_print_message ( "change the name on the right of the\t}\n" ) ;
    lm_print_message ( "{ equals.  If the pin name already " ) ;
    lm_print_message ( "matches your CAE system's pin name.\t}\n" ) ;
    lm_print_message ( "{ do not change the pin name and don't " ) ;
    lm_print_message ( "remove the braces from the line.\t}\n" ) ;
    kids = kidcount ( T ) ;
    lm_print_message ( "\n{ input pins (in_pin) }\n" ) ;
    for ( i = 1 ; i <= kids ; ++i )
      { kid = subtree ( i , T ) ;
        if ( nameofnode ( kid ) == N_IN_PINS )
          print_pin_map ( kid ) ;
      }
    lm_print_message ( "\n{ output pins (out_pin) }\n" ) ;
```

Copyright 1989
Logic Modeling Systems

| SOURCE PROGRAM | DATE | TIME | PAGE # |
|---|---|---|---|
| shellswm/print.c | 5/23/89 | 4:42:24 pm | 5/48 |

LINE # SOURCE TEXT

```
    for ( i = 1 ; i <= kids ; ++i )
      { kid = subtree ( i , T ) ;
        if ( nameofnode ( kid ) == N_OUT_PINS )
          print_pin_map ( kid ) ;
      }
    lm_print_message ( "\n[ bidirectional pins (io_pin) ]\n" ) ;
    for ( i = 1 ; i <= kids ; ++i )
      { kid = subtree ( i , T ) ;
        if ( nameofnode ( kid ) == N_IO_PINS )
          print_pin_map ( kid ) ;
      }
    lm_print_message ( "\n[ power pins (power_pin) ]\n" ) ;
    for ( i = 1 ; i <= kids ; ++i )
      { kid = subtree ( i , T ) ;
        if ( nameofnode ( kid ) == N_POWER_PINS )
          print_pin_map ( kid ) ;
      }
    lm_print_message ( "\n[ ground pins (ground_pin) ]\n" ) ;
    for ( i = 1 ; i <= kids ; ++i )
      { kid = subtree ( i , T ) ;
        if ( nameofnode ( kid ) == N_GROUND_PINS )
          print_pin_map ( kid ) ;
      }
    lm_print_message ( "\n[ no-connect pins (nc_pin) ]\n" ) ;
    for ( i = 1 ; i <= kids ; ++i )
      { kid = subtree ( i , T ) ;
        if ( nameofnode ( kid ) == N_NC_PINS )
          print_pin_map ( kid ) ;
      }
  } /* print_map */

static void
dump_pin ( T , pin )
  tree T ;
  ushort pin ;
  { ushort p , names , j , k , i , kids , comma = 0 ;
    tree names1 , names2 , kid ;
    symbol n ;
    char num [ 12 ] ;
    ( void ) sprintf ( num , "%u" , pin ) ;
    n = strtosym ( num ) ;
    kids = kidcount ( T ) ;
    for ( i = 1 ; i <= kids ; ++i )
      { kid = subtree ( i , T ) ;
        if ( nameofnode ( kid ) == N_ADAPTER )
          { k = kidcount ( kid ) ;
            for ( j = 1 ; j <= k ; ++j )
              { names1 = subtree ( 1 , subtree ( j , kid ) ) ;
                names2 = subtree ( 2 , subtree ( j , kid ) ) ;
                names = kidcount ( names2 ) ;
ASSERT(kidcount(names1)==names);
                for ( p = 1 ; p <= names ; ++p )
                  if ( textofnode ( subtree ( p , names2 ) ) == n )
                    { lm_print_message
                        ( "%s%s" ,
                          comma ? "," : "" ,
                          symtostr ( textofnode ( subtree ( p , names1 ) ) )
                        ) ;
                      comma = 1 ;
                    }
              }
          }
      }
    lm_print_message ( " " ) ;
  } /* dump_pin */

void
dump_power_ground ( t , T )
  struct dev *t ;
  tree T ;
  { ushort i ;
    symbol name ;
    lm_print_message ( "VCC\n    " ) ;
    for ( i = 0 ; i < t -> pin_cnt ; ++i )
      if ( t -> pins [ i ] . number < MAX_PINS )
        { name = t -> pins [ i ] . name ;
          if ( nameofnode ( g_lookup ( name ) ) == N_POWER_PINS )
            dump_pin ( T , t -> pins [ i ] . number ) ;
        }
    lm_print_message ( "\nGND\n    " ) ;
    for ( i = 0 ; i < t -> pin_cnt ; ++i )
      if ( t -> pins [ i ] . number < MAX_PINS )
        { name = t -> pins [ i ] . name ;
          if ( nameofnode ( g_lookup ( name ) ) == N_GROUND_PINS )
            dump_pin ( T , t -> pins [ i ] . number ) ;
        }
    lm_print_message ( "\n" ) ;
  } /* dump_power_ground */

# endif WRITE_DEVICE

/* end of Device Printer for BMBL Processor */
```

Copyright 1989
Logic Modeling Systems

SOURCE PROGRAM shellswm/strng.c | DATE 5/23/89 | TIME 4:42:25 pm | PAGE # 1/49

LINE # SOURCE TEXT

```
/* SCCS_ID: strng.c rev 3.2, 5/9/89 at 15:20:30      */

/*
 *  String Module
 */

# include <stdio.h>
# include <strings.h>
# include "strng.h"

# define NOMEM 1 /* no more memory error code */
# define NOSYMS 2 /* no more symbol space error code */
# define NOTEXT 3 /* no more text space error code */
# define BUCKETS 256 /* number of hash buckets */
# define MAXSYMS 65535
# define SYMHEADSIZE 256
# define SYMBLOCKSIZE 256
# define SYMHEAD(S)(S>>8)
# define SYMBLOCK(S)(S&255)
# define TEXTHEADSIZE 64
# define TEXTBLOCKSIZE 1024
# define TEXTHEAD(T)(T>>10)
# define TEXTBLOCK(T)(T&1023)

typedef unsigned short tree ; /* ASSUMES! that a tree is an unsigned short */

extern void
  lm_free ( ) ,
  lm_print_message ( ) ,
  lm_Herror ( ) , /* to report an error */
  lm_Ffail ( ) ; /* to cause an exit */

extern char *lm_malloc ( ) ;

static struct symbol /* symbol structure */
  { unsigned short symtext ; /* index of the text of the symbol */
    symbol nextsym ; /* index of next symbol in bucket */
    unsigned short
      pin_name , /* device signal name */
      pin_number , /* package pin_number */
      apin_name , /* adapter signal name */
      apin_number ; /* adapter pin number */
    tree
      g_dcls , /* global declaration */
      l_dcls ; /* local declaration */
  } symblock0 [ SYMBLOCKSIZE ] ; /* the 0'th symbol block */
static struct symbol *symheader [ SYMHEADSIZE ] ;
  /* array of pointers to symbol structures */
static symbol
  hashbuckets [ BUCKETS ] , /* indices into symspace */
  lastsym ; /* last symbol */
static char textblock0 [ TEXTBLOCKSIZE ] ; /* the 0'th text block */
static char *textheader [ TEXTHEADSIZE ] ;
  /* array of pointers to text blocks */
static unsigned short
  lastchar ,
  len ; /* index of last character, length of current string */

void
strinit ( )
  { register unsigned short i ;
    *symheader = symblock0 ; /* 0'th symbol block is symblock0 */
    for ( i = 1 ; i < SYMHEADSIZE ; ++i )
      symheader [ i ] = NULL ; /* all other symbol blocks unallocated */
    *textheader = textblock0 ; /* 0'th text block is textblock0 */
    for ( i = 1 ; i < TEXTHEADSIZE ; ++i )
      textheader [ i ] = NULL ; /* all other text blocks unallocated */
    for ( i = 0 ; i < BUCKETS ; ++i )
      hashbuckets [ i ] = NULLSYM ; /* all buckets are empty */
    symblock0 -> symtext = 0 ; /* empty text */
    *textblock0 = '\0' ; /* null symbol is empty */
    lastsym = NULLSYM ;
    lastchar = 0 ;
  } /* strinit */

void
strfree ( )
  { register unsigned short i ;
    for ( i = 1 ; i < SYMHEADSIZE && symheader [ i ] != NULL ; ++i )
      ( void ) lm_free ( ( char * ) symheader [ i ] ) ;
    for ( i = 1 ; i < TEXTHEADSIZE && textheader [ i ] != NULL ; ++i )
      ( void ) lm_free ( textheader [ i ] ) ;
  } /* strfree */

static void
strerr ( err )
  register unsigned short err ;
  { switch ( err )
      { case NOMEM :
          lm_Herror
            ( 0 ,
/*LMSG*/"out of memory on modeler (strings)"
            ) ;
          break ;
        case NOSYMS :
          lm_Herror
            ( 0 ,
/*LMSG*/"internal error: no more symbol space (too many symb's)"
            ) ;
          break ;
        case NOTEXT :
          lm_Herror
            ( 0 ,
/*LMSG*/"internal error: no more text space (too much symbol text)"
            ) ;
          break ;
        default :
          lm_Herror
            ( 0 ,
/*LMSG*/"internal error: unknown string module error"
            ) ;
          break ;
      }
    lm_Ffail ( ) ;
  } /* strerr */

static unsigned short
hash ( str )
  register char *str ;
  { unsigned char ret ;
```

Copyright 1989
Logic Modeling Systems

| SOURCE PROGRAM | DATE | PAGE # |
|---|---|---|
| shellswm/strng.c | 5/23/89 | 2/50 |
| | TIME 4:42:25 pm | |

LINE # SOURCE TEXT

```
      len = strlen ( str ) ; /* note side effect */
      switch ( len )
        { case 1 :
            ret = ( *str << 1 ) + 1 ;
            break ;
          case 2 :
            ret = ( *str << 1 ) ^ str [ 1 ] ;
            break ;
          default :
            ret =
              ( len & 0xFF ) ^
              *str ^
              ( str [ len >> 1 ] << 1 ) ^
              str [ len - 1 ] ;
            break ;
        }
      return ret ;
    } /* hash */

symbol
strtosym ( str )
  register char *str ;
  { register symbol i ;
    register char *text ;
    register struct symbol *sym ;
    register unsigned short
      h ,
      ndex ,
      empty ;
    if ( *str == '\0' )
      return NULLSYM ;
    h = hash ( str ) ;
    if ( hashbuckets [ h ] == NULLSYM )
      empty = 1 ;
    else
      { i = hashbuckets [ h ] ;
        do
          { sym = symheader [ SYMHEAD ( i ) ] + SYMBLOCK ( i ) ;
            ndex = sym -> symtext ;
            if
              ( strcmp
                  ( str ,
                    textheader [ TEXTHEAD ( ndex ) ] + TEXTBLOCK ( ndex )
                  ) == 0
              )
              return i ;
            else
              { h = i ;
                i = sym -> nextsym ;
              }
          }
        while ( i != NULLSYM ) ;
        empty = 0 ;
      }
    if ( lastsym == MAXSYMS )
      strerr ( NOSYMS ) ;
    if ( empty )
      hashbuckets [ h ] = ++lastsym ;
    else
      sym -> nextsym = ++lastsym ;
    ndex = SYMHEAD ( lastsym ) ;
    if ( symheader [ ndex ] == NULL )
      { sym =
          ( struct symbol * ) lm_malloc
            ( sizeof ( struct symbol ) * SYMBLOCKSIZE
            ) ;
        if ( sym == NULL )
          strerr ( NOMEM ) ;
        symheader [ ndex ] = sym ;
      } /* this could be one line */
    sym = symheader [ ndex ] + SYMBLOCK ( lastsym ) ;
    sym -> nextsym = NULLSYM ;
    sym -> pin_name =
      sym -> pin_number =
      sym -> apin_name =
      sym -> apin_number =
      sym -> g_dcln =
      sym -> l_dcln =
        0 ;
    i = TEXTBLOCK ( ++lastchar ) ;
    if ( i + len >= TEXTBLOCKSIZE )
      { lastchar += TEXTBLOCKSIZE - i ; /* wastage */
        if ( lastchar == 0 )
          strerr ( NOTEXT ) ;
        i = 0 ;
      }
    sym -> symtext = lastchar ;
    ndex = TEXTHEAD ( lastchar ) ;
    if ( textheader [ ndex ] == NULL )
      { text = lm_malloc ( TEXTBLOCKSIZE ) ;
        if ( text == NULL )
          strerr ( NOMEM ) ;
        textheader [ ndex ] = text ;
      } /* this could be one line */
    text = textheader [ ndex ] + i ;
    do
      { ++lastchar ;
        *text++ = *str++ ;
      }
    while ( *str ) ;
    *text = '\0' ;
    return lastsym ;
  } /* strtosym */

symbol
strlook ( str )
  register char *str ;
  { register symbol i ;
    register struct symbol *sym ;
    register unsigned short ndex ;
    if ( *str == '\0' )
      return NULLSYM ;
    if ( ( i = hashbuckets [ hash ( str ) ] ) != NULLSYM )
      do
        { sym = symheader [ SYMHEAD ( i ) ] + SYMBLOCK ( i ) ;
          ndex = sym -> symtext ;
          if
            ( strcmp
                ( str ,
                  textheader [ TEXTHEAD ( ndex ) ] + TEXTBLOCK ( ndex )
```

Copyright 1989
Logic Modeling Systems

SOURCE PROGRAM shellswm/strng.c

DATE 5/23/89 TIME 4:42:25 pm PAGE # 3/51

LINE # SOURCE TEXT

```
              ) == 0
            }
            return i ;
          else
            i = sym -> nextsym ;
        }
      while ( i != NULLSYM ) ;
    return NULLSYM ;
  } /* strlook */

/*symbol
strlast ( )
  { return lastsym ;
  } strlast */

char *
symtostr ( sym )
  register symbol sym ;
  { register unsigned short i ;
    i = symheader [ SYMHEAD ( sym ) ] [ SYMBLOCK ( sym ) ] . symtext ;
    return textheader [ TEXTHEAD ( i ) ] + TEXTBLOCK ( i ) ;
  } /* symtostr */

void
set_pin_name ( sym , name )
  register symbol sym ;
  register unsigned short name ;
  { symheader [ SYMHEAD ( sym ) ] [ SYMBLOCK ( sym ) ] . pin_name = name ;
  } /* set_pin_name */

void
set_pin_number ( sym , num )
  register symbol sym ;
  register unsigned short num ;
  { symheader [ SYMHEAD ( sym ) ] [ SYMBLOCK ( sym ) ] . pin_number = num ;
  } /* set_pin_number */

void
set_apin_name ( sym , name )
  register symbol sym ;
  register unsigned short name ;
  { symheader [ SYMHEAD ( sym ) ] [ SYMBLOCK ( sym ) ] . apin_name = name ;
  } /* set_apin_name */

void
set_apin_number ( sym , num )
  register symbol sym ;
  register unsigned short num ;
  { symheader [ SYMHEAD ( sym ) ] [ SYMBLOCK ( sym ) ] . apin_number = num ;
  } /* set_apin_number */

void
g_declare ( sym , T )
  register symbol sym ;
  register tree T ;
  { symheader [ SYMHEAD ( sym ) ] [ SYMBLOCK ( sym ) ] . g_dcln = T ;
  } /* g_declare */

void
l_declare ( sym , T )
  register symbol sym ;
  register tree T ;
  { symheader [ SYMHEAD ( sym ) ] [ SYMBLOCK ( sym ) ] . l_dcln = T ;
  } /* l_declare */

unsigned short
pin_name_of ( sym )
  register symbol sym ;
  { return symheader [ SYMHEAD ( sym ) ] [ SYMBLOCK ( sym ) ] . pin_name ;
  } /* pin_name_of */

unsigned short
pin_number_of ( sym )
  register symbol sym ;
  { return symheader [ SYMHEAD ( sym ) ] [ SYMBLOCK ( sym ) ] . pin_number ;
  } /* pin_number_of */

unsigned short
apin_name_of ( sym )
  register symbol sym ;
  { return symheader [ SYMHEAD ( sym ) ] [ SYMBLOCK ( sym ) ] . apin_name ;
  } /* apin_aname_of */

unsigned short
apin_number_of ( sym )
  register symbol sym ;
  { return symheader [ SYMHEAD ( sym ) ] [ SYMBLOCK ( sym ) ] . apin_number ;
  } /* apin_number_of */

tree
g_lookup ( sym )
  register symbol sym ;
  { return symheader [ SYMHEAD ( sym ) ] [ SYMBLOCK ( sym ) ] . g_dcln ;
  } /* g_lookup */

tree
l_lookup ( sym )
  register symbol sym ;
  { return symheader [ SYMHEAD ( sym ) ] [ SYMBLOCK ( sym ) ] . l_dcln ;
  } /* l_lookup */

/*tree
lookup ( sym )
  register symbol sym ;
  { register tree dcln ;
    return
      ( dcln = symheader [ SYMHEAD ( sym ) ] [ SYMBLOCK ( sym ) ] . l_dcln ) ?
      dcln :
      symheader [ SYMHEAD ( sym ) ] [ SYMBLOCK ( sym ) ] . g_dcln ;
  } lookup */

# ifdef STATS
void
strstat ( )
  { register symbol j ;
    register unsigned short
      i ,
      buckets ,
      onelong ,
      longest ,
```

Copyright 1989
Logic Modeling Systems

LINE # SOURCE TEXT

```
      longs ,
      length ;
    buckets =
      onelong =
      longest =
        0 ;
    lm_print_message
      ( "%d unique symbol%s, %d total character%s\n" ,
        lastsym ,
        lastsym == 1 ? "" : "s" ,
        lastchar - lastsym ,
        lastchar - lastsym == 1 ? "" : "s"
      ) ;
    for ( i = 0 ; i < BUCKETS ; ++i )
      if ( hashbuckets [ i ] != NULLSYM )
        { ++buckets ;
          j = hashbuckets [ i ] ;
          length = 0 ;
          do
            { ++length ;
              j = symheader [ SYMHEAD ( j ) ] [ SYMBLOCK ( j ) ] . nextsym ;
            }
          while ( j != NULLSYM ) ;
          if ( length == 1 )
            ++onelong ;
          if ( length > longest )
            { longest = length ;
              longs = 1 ;
            }
          else if ( length == longest )
            ++longs ;
        }
    lm_print_message
      ( "%d bucket%s used" ,
        buckets ,
        buckets == 1 ? "" : "s"
      ) ;
    if ( buckets )
      lm_print_message ( ", %d of length 1" , onelong ) ;
    if ( longest > 1 )
      lm_print_message ( ", %d of length %d" , longs , longest ) ;
    lm_print_message ( "\n" ) ;
  } /* strstat */

/*void
strdump ( )
  { register symbol j ;
    register unsigned short i ;
    lm_print_message ( "buckets:\n" ) ;
    for ( i = 0 ; i < BUCKETS ; ++i )
      if ( hashbuckets [ i ] != NULLSYM )
        { j = hashbuckets [ i ] ;
          lm_print_message ( "%d:%d" , i , j ) ;
          while
            ( ( j = symheader [ SYMHEAD ( j ) ] [ SYMBLOCK ( j ) ] . nextsym )
              != NULLSYM
            )
            lm_print_message ( ",%d" , j ) ;
          lm_print_message ( "\n" ) ;
        }
    lm_print_message ( "strings:\n" ) ;
    for ( j = 1 ; j <= lastsym ; ++j )
      lm_print_message ( "%d:%s\n" , j , symtostr ( j ) ) ;
  } strdump */
# endif STATS

/* end of String Module */
```

Copyright 1989 Logic Modeling Systems

| SOURCE PROGRAM | DATE 5/23/89 | PAGE # |
|---|---|---|
| shellswm/trees.c | TIME 4:42:25 pm | 1/53 |

LINE # SOURCE TEXT

```
/* SCCS_ID: trees.c rev 3.2, 5/9/89 at 15:22:40      */

/*
 * Tree Module
 */

# include <stdio.h>
# include <strings.h>
# include "strng.h"
# include "trees.h"

# define NOMEM 1 /* no more memory error code */
# define NONODES 2 /* no more node space error code */
# define NODEHEADSIZE 256
# define NODEBLOCKSIZE 256
# define NODEHEAD(N)(N>>8)
# define NODEBLOCK(N)(N&255)

extern void
  lm_free ( ) ,
  lm_print_message ( ) ,
  lm_Herror ( ) , /* to report an error */
  lm_Ffail ( ) ; /* to cause an exit */

extern char *lm_malloc ( ) ;

extern unsigned short lm_Hget_lineno ( ) ;

extern symbol source ;

static struct node nodeblock0 [ NODEBLOCKSIZE ] ; /* 0'th node block */
static struct node *nodeheader [ NODEHEADSIZE ] ; /* node space header */
static tree
  last_tree ,
  tree_top ; /* last tree, top of stack */

void
treeinit ( )
  { register unsigned short i ;
    *nodeheader = nodeblock0 ; /* point to the 0'th node block */
    for ( i = 1 ; i < NODEHEADSIZE ; ++i )
      nodeheader [ i ] = NULL ; /* the rest of the blocks are unallocated */
    last_tree = NULLTREE ; /* skip the 0'th tree */
    nodeblock0 -> name =
      nodeblock0 -> src =
        NULLSYM ;
    nodeblock0 -> kids =
      nodeblock0 -> first =
      nodeblock0 -> srcline =
        0 ;
# ifdef DECOR
    nodeblock0 -> decor = 0 ;
# endif DECOR
    tree_top = 0 ; /* first push will use the 65535'th spot */
  } /* treeinit */

void
treefree ( )
  { register unsigned short i ;
    for ( i = 1 ; i < NODEHEADSIZE ; ++i )
      if ( nodeheader [ i ] != NULL )
        ( void ) lm_free ( ( char * ) nodeheader [ i ] ) ;
  } /* treefree */

static void
treeerr ( err )
  register unsigned short err ;
  { switch ( err )
      { case NOMEM :
          lm_Herror
            ( 0 ,
/*LMSG*/"out of memory on modeler (trees)"
            ) ;
          break ;
        case NONODES :
          lm_Herror
            ( 0 ,
/*LMSG*/"internal error: no more node space (specification too large)"
            ) ;
          break ;
        default :
          lm_Herror
            ( 0 ,
/*LMSG*/"internal error: unknown tree module error"
            ) ;
          break ;
      }
    lm_Ffail ( ) ;
  } /* treeerr */

void
bldtrm ( name , text )
  register symbol
    name ,
    text ;
  { register struct node *node ;
    register unsigned short i ;
    if ( last_tree == tree_top - 1 )
      treee   NONODES ) ;
    --tree_top ;
    i = NODEHEAD ( tree_top ) ;
    if ( nodeheader [ i ] == NULL )
      { node =
          ( struct node * ) lm_malloc
            ( sizeof ( struct node ) * NODEBLOCKSIZE
            ) ;
        if ( node == NULL )
          treeerr ( NOMEM ) ;
        nodeheader [ i ] = node ;
      } /* this could be one line */
    node = nodeheader [ i ] + NODEBLOCK ( tree_top ) ;
    node -> name = name ;
    node -> first = text ;
    node -> kids = 0 ;
    node -> src = source ;
    node -> srcline = lm_Hget_lineno ( ) ;
  } /* bldtrm */

void
bldnontrm ( name , kids )
```

Copyright 1989
Logic Modeling Systems

SOURCE PROGRAM shellswm/trees.c

DATE 5/23/89 TIME 4:42:25 pm PAGE # 2/54

LINE # SOURCE TEXT

```
    register symbol name ;
    register unsigned short kids ;
    { register unsigned short i , ndex ;
      register struct node *node , *top ;
      if ( last_tree == tree_top - 1 )
        treeerr ( NONODES ) ;
      for ( i = 0 ; i < kids ; ++i )
        { ++last_tree ;
          ndex = NODEHEAD ( last_tree ) ;
          if ( nodeheader [ ndex ] == NULL )
            { node =
                ( struct node * ) lm_malloc
                  ( sizeof ( struct node ) * NODEBLOCKSIZE
                  ) ;
              if ( node == NULL )
                treeerr ( NOMEM ) ;
              nodeheader [ ndex ] = node ;
            } /* this could be one line */
          node = nodeheader [ ndex ] + NODEBLOCK ( last_tree ) ;
          top = nodeheader [ NODEHEAD ( tree_top ) ] + NODEBLOCK ( tree_top ) ;
          node -> name = top -> name ;
          node -> kids = top -> kids ;
          node -> src = top -> src ;
          node -> srcline = top -> srcline ;
          node -> first = top -> first ;
# ifdef DECOR
          node -> decor = 0 ;
# endif DECOR
          ++tree_top ;
        }
      --tree_top ;
      ndex = NODEHEAD ( tree_top ) ;
      if ( nodeheader [ ndex ] == NULL )
        { node =
            ( struct node * ) lm_malloc
              ( sizeof ( struct node ) * NODEBLOCKSIZE
              ) ;
          if ( node == NULL )
            treeerr ( NOMEM ) ;
          nodeheader [ ndex ] = node ;
        } /* this could be one line */
      node = nodeheader [ ndex ] + NODEBLOCK ( tree_top ) ;
      node -> name = name ;
      node -> kids = i ;
      node -> first = i == 0 ? NULLSYM : last_tree ;
      node -> src = source ;
      node -> srcline = lm_$get_lineno ( ) ;
    } /* bldnontrm */

tree
poptop ( )
  { register unsigned short i ;
    register struct node *node , *top ;
    if ( tree_top == 0 )
      return NULLTREE ;
    ++last_tree ;
    i = NODEHEAD ( last_tree ) ;
    if ( nodeheader [ i ] == NULL )
      { node =
          ( struct node * ) lm_malloc
            ( sizeof ( struct node ) * NODEBLOCKSIZE
            ) ;
        if ( node == NULL )
          treeerr ( NOMEM ) ;
        nodeheader [ i ] = node ;
      } /* this could be one line */
    node = nodeheader [ i ] + NODEBLOCK ( last_tree ) ;
    top = nodeheader [ NODEHEAD ( tree_top ) ] + NODEBLOCK ( tree_top ) ;
    node -> name = top -> name ;
    node -> kids = top -> kids ;
    node -> src = top -> src ;
    node -> srcline = top -> srcline ;
    node -> first = top -> first ;
# ifdef DECOR
    node -> decor = 0 ;
# endif DECOR
    ++tree_top ;
    return last_tree ;
  } /* poptop */

symbol
nameofnode ( T )
  register tree T ;
  { return nodeheader [ NODEHEAD ( T ) ] [ NODEBLOCK ( T ) ] . name ;
  } /* nameofnode */

symbol
textofnode ( T )
  register tree T ;
  { return
      nodeheader [ NODEHEAD ( T ) ] [ NODEBLOCK ( T ) ] . kids ?
        NULLSYM :
        nodeheader [ NODEHEAD ( T ) ] [ NODEBLOCK ( T ) ] . first ;
  } /* textofnode */

void
set_text ( T , text )
  register tree T ;
  register symbol text ;
  { nodeheader [ NODEHEAD ( T ) ] [ NODEBLOCK ( T ) ] . first = text ;
  } /* set_text */

unsigned short
kidcount ( T )
  register tree T ;
  { return nodeheader [ NODEHEAD ( T ) ] [ NODEBLOCK ( T ) ] . kids ;
  } /* kidcount */

tree
subtree ( n , T )
  register unsigned short n ;
  register tree T ;
  { return nodeheader [ NODEHEAD ( T ) ] [ NODEBLOCK ( T ) ] . first + 1 - n ;
  } /* subtree */

/*unsigned short
whichkid ( T , kid )
  register tree
    T ,
    kid ;
```

Copyright 1989 Logic Modeling Systems

SOURCE PROGRAM shellswm/trees.c | DATE 5/23/89 | TIME 4:42:25 pm | PAGE # 3/55

LINE # SOURCE TEXT

```
  { return
      nodeheader [ NODEHEAD ( T ) ] [ NODEBLOCK ( T ) ] . first - kid + 1 ;
  } whichkid */

symbol
file_of ( T )
  register tree T ;
  { return nodeheader [ NODEHEAD ( T ) ] [ NODEBLOCK ( T ) ] . src ;
  } /* file_of */

symbol
line_of ( T )
  register tree T ;
  { return nodeheader [ NODEHEAD ( T ) ] [ NODEBLOCK ( T ) ] . srcline ;
  } /* line_of */

# ifdef DECOR
void
decorate ( T , dec )
  register tree T ;
  register long dec ;
  { nodeheader [ NODEHEAD ( T ) ] [ NODEBLOCK ( T ) ] . decor = dec ;
  } /* decorate */

long
dec_ration ( T )
  register tree T ;
  { return nodeheader [ NODEHEAD ( T ) ] [ NODEBLOCK ( T ) ] . decor ;
  } /* dec_ration */
# endif DECOR

static void
tprint ( T , depth )
  register tree T ;
  register unsigned short depth ;
  { register unsigned short i , kids ;
    for ( i = 0 ; i < depth ; ++i )
      lm_print_message ( ". " ) ;
    printnode ( T ) ;
    lm_print_message ( "\n" ) ;
    kids = nodeheader [ NODEHEAD ( T ) ] [ NODEBLOCK ( T ) ] . kids ;
    ++depth ;
    for ( i = 1 ; i <= kids ; ++i )
      tprint
        ( nodeheader [ NODEHEAD ( T ) ] [ NODEBLOCK ( T ) ] . first + 1 - i ,
          depth
        ) ;
  } /* tprint */

void
printtree ( T )
  register tree T ;
  { tprint ( T , 0 ) ;
  } /* printtree */

void
printnode ( T )
  register tree T ;
  { register unsigned short kids ;
# ifdef DECOR
    tree dec ;
# endif DECOR
    if ( T == NULLTREE )
      { lm_print_message ( "NULLTREE" ) ;
        return ;
      }
    if
      ( ( kids = nodeheader [ NODEHEAD ( T ) ] [ NODEBLOCK ( T ) ] . kids ) ||
        nodeheader [ NODEHEAD ( T ) ] [ NODEBLOCK ( T ) ] . first == NULLSYM
      )
      lm_print_message
        ( "%s[%u] (%u kid%s)" ,
          symtostr
            ( nodeheader [ NODEHEAD ( T ) ] [ NODEBLOCK ( T ) ] . name
            ) ,
          T ,
          kids ,
          kids == 1 ? "" : "s"
        ) ;
    else
      lm_print_message
        ( "%s[%u] : %s" ,
          symtostr
            ( nodeheader [ NODEHEAD ( T ) ] [ NODEBLOCK ( T ) ] . name
            ) ,
          T ,
          symtostr
            ( nodeheader [ NODEHEAD ( T ) ] [ NODEBLOCK ( T ) ] . first
            )
        ) ;
# ifdef DECOR
    if ( dec = nodeheader [ NODEHEAD ( T ) ] [ NODEBLOCK ( T ) ] . decor )
      lm_print_message ( " : %ld" , dec ) ;
# endif DECOR
  } /* printnode */

/* end of tree module */
```

Copyright 1989
Logic Modeling Systems

| SOURCE PROGRAM | DATE | PAGE # |
|---|---|---|
| shellswm/walk_1.c | 5/23/89 | 1/56 |
| | TIME 4:42:25 pm | |

LINE # SOURCE TEXT

```
/* SCCS_ID: walk_1.c rev 3.1, 4/24/89 at 08:01:37      */

/*
 *  Constrainer (walk_1) for HMBL Processor
 */

# include "common.h"
# include "HMBL.h"
# include <strings.h>
# include "strng.h"
# include "Hparse.h"
# include "trees.h"
# include "Hconst.h"

static double value ; /* used to check values */
static char num_buf [ 32 ] ; /* used to print values */

static void
fill_buf ( sym1 , sym2 )
  symbol
    sym1 ,
    sym2 ;
  /* fills buffer with symbols' text for error reporting */
  { ( void ) strcpy ( buf , symtostr ( sym1 ) ) ;
    ( void ) strcat ( buf , " " ) ;
    ( void ) strcat ( buf , symtostr ( sym2 ) ) ;
  } /* fill_buf */

static void
buf_and ( sym1 , sym2 )
  symbol
    sym1 ,
    sym2 ;
  /* fills buffer with symbols' text and "and" for error reporting */
  { ( void ) strcpy ( buf , symtostr ( sym1 ) ) ;
    ( void ) strcat ( buf , " and " ) ;
    ( void ) strcat ( buf , symtostr ( sym2 ) ) ;
  } /* buf_and */

static void
do_tech_spec ( T )
  tree T ;
  /* processes a technology specification */
  { tree
      fkid ,
      lkid ;
    symbol text ;
    tr_entry ( T ) ;
    fkid = subtree ( 1 , T ) ;
    lkid = subtree ( 2 , T ) ;
    tr_entry ( fkid ) ;
    text = textofnode ( fkid ) ;
    if ( scompare ( text , C_Vcc ) )
      { set_text ( fkid , C_Vcc ) ;
        tr_exit ( fkid ) ;
        value = check_num ( lkid ) ;
        if ( value < 3 || value > 5 )
          { while ( kidcount ( lkid ) )
              lkid = subtree ( 1 , lkid ) ;
            ( void ) sprintf ( num_buf , "%g" , value ) ;
            cerror
              ( lkid ,
/*LMSG*/"Vcc out of range: %s (must have 3 <= Vcc <= 5)"
                , num_buf
              ) ;
          }
        else if ( the -> Vcc == UNDEFINED )
          the -> Vcc = value ;
        else
          cerror
            ( fkid ,
/*LMSG*/"Vcc respecified"
            ) ;
      }
    else if ( scompare ( text , C_Vhth ) )
      { set_text ( fkid , C_Vhth ) ;
        tr_exit ( fkid ) ;
        value = check_num ( lkid ) ;
        if ( value < 1.5 || value > 5 )
          { while ( kidcount ( lkid ) )
              lkid = subtree ( 1 , lkid ) ;
            ( void ) sprintf ( num_buf , "%g" , value ) ;
            cerror
              ( lkid ,
/*LMSG*/"Vhth out of range: %s (must have 1.5 <= Vhth <= 5)"
                , num_buf
              ) ;
          }
        else if ( the -> Vhth == UNDEFINED )
          the -> Vhth = value ;
        else
          cerror
            ( fkid ,
/*LMSG*/"Vhth respecified"
            ) ;
      }
    else if ( scompare ( text , C_Vlth ) )
      { set_text ( fkid , C_Vlth ) ;
        tr_exit ( fkid ) ;
        value = check_num ( lkid ) ;
        if ( value < 0 || value > 1 )
          { while ( kidcount ( lkid ) )
              lkid = subtree ( 1 , lkid ) ;
            ( void ) sprintf ( num_buf , "%g" , value ) ;
            cerror
              ( lkid ,
/*LMSG*/"Vlth out of range: %s (must have 0 <= Vlth <= 1)"
                , num_buf
              ) ;
          }
        else if ( the -> Vlth == UNDEFINED )
          the -> Vlth = value ;
        else
          cerror
            ( fkid ,
/*LMSG*/"Vlth respecified"
            ) ;
      }
    else if ( scompare ( text , C_Vih ) )
      { set_text ( fkid , C_Vih ) ;
```

Copyright 1989
Logic Modeling Systems

SOURCE PROGRAM shellswm/walk_1.c | DATE 5/23/89 | TIME 4:42:25 pm | PAGE # 2/57

LINE # SOURCE TEXT

```
            tr_exit ( fkid ) ;
            value = check_num ( lkid ) ;
            if ( value < 2 || value > 5 )
              { while ( kidcount ( lkid ) )
                  lkid = subtree ( 1 , lkid ) ;
                ( void ) sprintf ( num_buf , "%g" , value ) ;
                cerror
                  ( lkid ,
/*LMSG*/"Vih out of range: %s (must have 2 <= Vih <= 5)"
                  , num_buf
                  ) ;
              }
            else if ( the -> Vih == UNDEFINED )
              the -> Vih = value ;
            else
              cerror
                ( fkid ,
/*LMSG*/"Vih respecified"
                ) ;
          }
        else if ( scompare ( text , C_Vil ) )
          { set_text ( fkid , C_Vil ) ;
            tr_exit ( fkid ) ;
            value = check_num ( lkid ) ;
            if ( value < 0 || value > 2 )
              { while ( kidcount ( lkid ) )
                  lkid = subtree ( 1 , lkid ) ;
                ( void ) sprintf ( num_buf , "%g" , value ) ;
                cerror
                  ( lkid ,
/*LMSG*/"Vil out of range: %s (must have 0 <= Vil <= 2)"
                  , num_buf
                  ) ;
              }
            else if ( the -> Vil == UNDEFINED )
              the -> Vil = value ;
            else
              cerror
                ( fkid ,
/*LMSG*/"Vil respecified"
                ) ;
          }
        else if ( scompare ( text , C_Vah ) )
          { set_text ( fkid , C_Vah ) ;
            tr_exit ( fkid ) ;
            value = check_num ( lkid ) ;
            if ( value < 1.5 || value > 5 )
              { while ( kidcount ( lkid ) )
                  lkid = subtree ( 1 , lkid ) ;
                ( void ) sprintf ( num_buf , "%g" , value ) ;
                cerror
                  ( lkid ,
/*LMSG*/"Vah out of range: %s (must have 1.5 <= Vah <= 5)"
                  , num_buf
                  ) ;
              }
            else if ( the -> Vah == UNDEFINED )
              the -> Vah = value ;
            else
              cerror
                ( fkid ,
/*LMSG*/"Vah respecified"
                ) ;
          }
        else if ( scompare ( text , C_Val ) )
          { set_text ( fkid , C_Val ) ;
            tr_exit ( fkid ) ;
            value = check_num ( lkid ) ;
            if ( value < 0 || value > 1 )
              { while ( kidcount ( lkid ) )
                  lkid = subtree ( 1 , lkid ) ;
                ( void ) sprintf ( num_buf , "%g" , value ) ;
                cerror
                  ( lkid ,
/*LMSG*/"Val out of range: %s (must have 0 <= Val <= 1)"
                  , num_buf
                  ) ;
              }
            else if ( the -> Val == UNDEFINED )
              the -> Val = value ;
            else
              cerror
                ( fkid ,
/*LMSG*/"Val respecified"
                ) ;
          }
        else if ( scompare ( text , C_Ioh ) )
          { set_text ( fkid , C_Ioh ) ;
            tr_exit ( fkid ) ;
            value = check_num ( lkid ) ;
            if ( value > -0.2 )
              { while ( kidcount ( lkid ) )
                  lkid = subtree ( 1 , lkid ) ;
                ( void ) sprintf ( num_buf , "%g" , value ) ;
                cerror
                  ( lkid ,
/*LMSG*/"Ioh out of range: %s (must have Ioh <= -0.2 mA)"
                  , num_buf
                  ) ;
              }
            else if ( the -> Ioh == UNDEFINED )
              the -> Ioh = -value ;
            else
              cerror
                ( fkid ,
/*LMSG*/"Ioh respecified"
                ) ;
          }
        else if ( scompare ( text , C_Iol ) )
          { set_text ( fkid , C_Iol ) ;
            tr_exit ( fkid ) ;
            value = check_num ( lkid ) ;
            if ( value < 0.1 )
              { while ( kidcount ( lkid ) )
                  lkid = subtree ( 1 , lkid ) ;
                ( void ) sprintf ( num_buf , "%g" , value ) ;
                cerror
                  ( lkid ,
/*LMSG*/"Iol out of range: %s (must have Iol >= 0.1 mA)"
                  , num_buf
```

Copyright 1989
Logic Modeling Systems

SOURCE PROGRAM shellswm/walk_1.c | DATE 5/23/89 | TIME 4:42:25 pm | PAGE # 3/58

LINE # SOURCE TEXT

```
                ) ;
            }
          else if ( the -> Iol == UNDEFINED )
            the -> Iol = value ;
          else
            cerror
              ( fkid ,
/*LMSG*/"Iol respecified"
              ) ;
        }
      else if ( acompare ( text , C_Iih ) )
        { set_text ( fkid , C_Iih ) ;
          tr_exit ( fkid ) ;
          value = check_num ( lkid ) ;
          if ( value < 0 || value > 2 )
            { while ( kidcount ( lkid ) )
                lkid = subtree ( 1 , lkid ) ;
              ( void ) sprintf ( num_buf , "%g" , value ) ;
              cerror
                ( lkid ,
/*LMSG*/"Iih out of range: %s (must have 0 <= Iih <= 2 mA)"
                  , num_buf
                ) ;
            }
          else if ( the -> Iih == UNDEFINED )
            the -> Iih = value ;
          else
            cerror
              ( fkid ,
/*LMSG*/"Iih respecified"
              ) ;
        }
      else if ( acompare ( text , C_Iil ) )
        { set_text ( fkid , C_Iil ) ;
          tr_exit ( fkid ) ;
          value = check_num ( lkid ) ;
          if ( value > 0 || value < -2.5 )
            { while ( kidcount ( lkid ) )
                lkid = subtree ( 1 , lkid ) ;
              ( void ) sprintf ( num_buf , "%g" , value ) ;
              cerror
                ( lkid ,
/*LMSG*/"Iil out of range: %s (must have 0 >= Iil >= -2.5 mA)"
                  , num_buf
                ) ;
            }
          else if ( the -> Iil == UNDEFINED )
            the -> Iil = -value ;
          else
            cerror
              ( fkid ,
/*LMSG*/"Iil respecified"
              ) ;
        }
      else
        { cerror
            ( fkid ,
/*LMSG*/"illegal driver specifier: %s (must be Vcc, Iih, or Iil)"
              , symtostr ( text )
            ) ;
          tr_exit ( fkid ) ;
          ( void ) check_num ( lkid ) ;
        }
    tr_exit ( T ) ;
  } /* do_tech_spec */

static void
do_id_attr ( T )
  tree T ;
  /* processes an identifier attribute */
  { symbol text ;
    tr_entry ( T ) ;
    text = textofnode ( T ) ;
    if ( acompare ( text , C_eval ) )
      set_text ( T , C_eval ) ;
    else if ( acompare ( text , C_store ) )
      set_text ( T , C_store ) ;
    else if ( acompare ( text , C_edge_rise ) )
      set_text ( T , C_edge_rise ) ;
    else if ( acompare ( text , C_edge_fall ) )
      set_text ( T , C_edge_fall ) ;
    else if ( acompare ( text , C_feedback ) )
      set_text ( T , C_feedback ) ;
    else if ( acompare ( text , C_keepalive ) )
      set_text ( T , C_keepalive ) ;
    else if ( acompare ( text , C_pull_up ) )
      set_text ( T , C_pull_up ) ;
    else if ( acompare ( text , C_pull_down ) )
      set_text ( T , C_pull_down ) ;
    else
      cerror
        ( T ,
/*LMSG*/"illegal pin attribute: %s (must be eval, store, edge_rise, edge_fall, feedback, keepalive, pull_up, or pull_down)"
          , symtostr ( text )
        ) ;
    tr_exit ( T ) ;
  } /* do_id_attr */

static void
do_resistance ( T )
  tree T ;
  { ushort i , len , kohms = 0 ;
    double ohms ;
    symbol old ;
    ( void ) strcpy ( buf , symtostr ( old = textofnode ( T ) ) ) ;
    len = strlen ( buf ) - 1 ;
    if ( buf [ len ] == 'k' || buf [ len ] == 'K' )
      { for ( i = 0 ; i < len ; ++i )
          if
            ( ( buf [ i ] < '0' || buf [ i ] > '9' ) &&
              buf [ i ] != '.' && buf [ i ] != '_'
            )
            break ;
        if ( i == len )
          { buf [ len ] = '\0' ;
            set_text ( T , strtosym ( buf ) ) ;
            kohms = 1 ;
          }
      }
    ohms = check_num ( T ) ;
```

Copyright 1989 Logic Modeling Systems

| SOURCE PROGRAM | DATE | TIME | PAGE # |
|---|---|---|---|
| shellswm/walk_1.c | 5/23/89 | 4:42:25 pm | 4/59 |

LINE # SOURCE TEXT

```
    if ( kohms )
      { ohms *= 1000 ;
        set_text ( T , old ) ;
      }
    decorate ( T , ( long ) ( ohms + 0.5 ) ) ;
  } /* do_resistance */

static void
do_current_spec ( T )
  tree T ;
  /* processes a current or resistance specification */
  { tree kid ;
    symbol text ;
    tr_entry ( T ) ;
    kid = subtree ( 1, T ) ;
    tr_entry ( kid ) ;
    text = textofnode ( kid ) ;
    if ( scompare ( text , C_Ioh ) )
      { set_text ( kid , C_Ioh ) ;
        tr_exit ( kid ) ;
        kid = subtree ( 2 , T ) ;
        value = check_num ( kid ) ;
        if ( value > -0.2 )
          { while ( kidcount ( kid ) )
              kid = subtree ( 1 , kid ) ;
            ( void ) sprintf ( num_buf , "%g" , value ) ;
            cerror
              ( kid ,
/*LMSG*/"Ioh out of range: %s (must have Ioh <= -0.2 mA)"
                , num_buf
              ) ;
          }
      }
    else if ( scompare ( text , C_Iol ) )
      { set_text ( kid , C_Iol ) ;
        tr_exit ( kid ) ;
        kid = subtree ( 2 , T ) ;
        value = check_num ( kid ) ;
        if ( value < 0.1 )
          { while ( kidcount ( kid ) )
              kid = subtree ( 1 , kid ) ;
            ( void ) sprintf ( num_buf , "%g" , value ) ;
            cerror
              ( kid ,
/*LMSG*/"Iol out of range: %s (must have Iol >= 0.1 mA)"
                , num_buf
              ) ;
          }
      }
    else if ( scompare ( text , C_Iih ) )
      { set_text ( kid , C_Iih ) ;
        tr_exit ( kid ) ;
        kid = subtree ( 2 , T ) ;
        value = check_num ( kid ) ;
        if ( value < 0 || value > 2 )
          { while ( kidcount ( kid ) )
              kid = subtree ( 1 , kid ) ;
            ( void ) sprintf ( num_buf , "%g" , value ) ;
            cerror
              ( kid ,
/*LMSG*/"Iih out of range: %s (must have 0 <= Iih <= 2 mA)"
                , num_buf
              ) ;
          }
      }
    else if ( scompare ( text , C_Iil ) )
      { set_text ( kid , C_Iil ) ;
        tr_exit ( kid ) ;
        kid = subtree ( 2 , T ) ;
        value = check_num ( kid ) ;
        if ( value > 0 || value < -2.5 )
          { while ( kidcount ( kid ) )
              kid = subtree ( 1 , kid ) ;
            ( void ) sprintf ( num_buf , "%g" , value ) ;
            cerror
              ( kid ,
/*LMSG*/"Iil out of range: %s (must have 0 >= Iil >= -2.5 mA)"
                , num_buf
              ) ;
          }
      }
    else if ( scompare ( text , C_pull_up ) )
      { set_text ( kid , C_pull_up ) ;
        tr_exit ( kid ) ;
        kid = subtree ( 2 , T ) ;
        do_resistance ( kid ) ;
      }
    else if ( scompare ( text , C_pull_down ) )
      { set_text ( kid , C_pull_down ) ;
        tr_exit ( kid ) ;
        kid = subtree ( 2 , T ) ;
        do_resistance ( kid ) ;
      }
    else
      { cerror
          ( kid ,
/*LMSG*/"illegal pin attribute: %s (must be Iih, Iil, pull_up, or pull_down)"
            , symtostr ( text )
          ) ;
        tr_exit ( kid ) ;
        kid = subtree ( 2 , T ) ;
        ( void ) check_num ( kid ) ;
      }
    tr_exit ( T ) ;
  } /* do_current_spec */

static void
do_cycle_spec ( T )
  tree T ;
  /* processes a cycle specification */
  { tree kid ;
    symbol text ;
    tr_entry ( T ) ;
    kid = subtree ( 1, T ) ;
    tr_entry ( kid ) ;
    text = textofnode ( kid ) ;
    if ( scompare ( text , C_in_sequence ) )
      set_text ( kid , C_in_sequence ) ;
    else if ( scompare ( text , C_last_cycle ) )
      set_text ( kid , C_last_cycle ) ;
```

Copyright 1989 Logic Modeling Systems

| SOURCE PROGRAM | DATE | TIME | PAGE # |
|---|---|---|---|
| shellswm/walk_1.c | 5/23/89 | 4:42:25 pm | 5/60 |

LINE # SOURCE TEXT

```
      else
        cerror
          ( kid ,
/*LMSC*/"illegal cycle specifier: %s (must be in_sequence or last_cycle)"
            , symtostr ( text )
          ) ;
      tr_exit ( kid ) ;
      kid = subtree ( 2 , T ) ;
      tr_entry ( kid ) ;
      text = textofnode ( kid ) ;
      if ( scompare ( text , C_hard ) )
        set_text ( kid , C_hard ) ;
      else if ( scompare ( text , C_medium ) )
        set_text ( kid , C_medium ) ;
      else if ( scompare ( text , C_hard_medium ) )
        set_text ( kid , C_hard_medium ) ;
      else
        cerror
          ( kid ,
/*LMSC*/"illegal cycle specification: %s (must be hard, medium, or hard_medium)"
            , symtostr ( text )
          ) ;
      tr_exit ( kid ) ;
      tr_exit ( T ) ;
    } /* do_cycle_spec */

static void
do_in_pins ( T )
  tree T ;
  /* counts and checks attributes of input pins */
  { ushort
      i ,
      kids ,
      k ,
      count = 0 ;
    tree kid ,
    symbol text ,
    tr_entry ( T ) ;
    kids = kidcount ( T ) ;
    for
      ( kid = subtree ( i = 1 , T ) ;
        nameofnode ( kid ) != N_NAMES ;
        kid = subtree ( ++i , T )
      )
      count += do_pin_name ( kid ) ;
    the -> num_in += count ;
    tr_entry ( kid ) ;
    k = kidcount ( kid ) ;
    if ( k != count )
      { buf_instead ( k , count ) ;
        cerror
          ( subtree ( k , kid ) ,
/*LMSC*/"wrong number of in_pin numbers compared to device signal names: %s"
            , buf
          ) ;
      }
    tr_exit ( kid ) ;
    while ( ++i <= kids )
      { kid = subtree ( i , T ) ;
        switch ( nameofnode ( kid ) )
          { case P_ID_ :
              do_id_attr ( kid ) ;
              text = textofnode ( kid ) ;
              if ( text == C_feedback )
                cerror
                  ( kid ,
/*LMSC*/"%s attribute not allowed on in_pins"
                    , symtostr ( text )
                  ) ;
              else if ( text == C_pull_up || text == C_pull_down )
                cerror
                  ( kid ,
/*LMSC*/"%s attribute on an in_pin: must declare as an io_pin"
                    , symtostr ( text )
                  ) ;
              else if
                ( text == C_eval ||
                  text == C_store ||
                  text == C_edge_rise ||
                  text == C_edge_fall
                )
                the -> has_store_pins = 1 ;
              break ;
            case N_ATTR :
              if ( nameofnode ( subtree ( 2 , kid ) ) == P_ID_ )
                { do_cycle_spec ( kid ) ;
                  cerror
                    ( subtree ( 1 , kid ) ,
/*LMSC*/"cycle specification attribute illegal on in_pins"
                    ) ;
                  break ;
                }
              do_current_spec ( kid ) ;
              text = textofnode ( subtree ( 1 , kid ) ) ;
              if ( text == C_pull_up || text == C_pull_down )
                cerror
                  ( subtree ( 1 , kid ) ,
/*LMSC*/"%s attribute on an in_pin: must declare as an io_pin"
                    , symtostr ( text )
                  ) ;
              else
                cerror
                  ( subtree ( 1 , kid ) ,
/*LMSC*/"current specification attribute illegal on in_pins"
                  ) ;
              break ;
            default :
              cerror
                ( kid ,
/*LMSC*/"internal error: do_in_pins: unknown node name: %s"
                  , symtostr ( nameofnode ( kid ) )
                ) ;
              break ;
          }
      }
    tr_exit ( T ) ;
  } /* do_in_pins */

static void
do_out_pins ( T )
```

Copyright 1989 Logic Modeling Systems

SOURCE PROGRAM shellswm/walk_1.c

DATE 5/23/89 TIME 4:42:25 pm PAGE # 6/61

SOURCE TEXT

```
   tree T ;
   /* counts and checks attributes of output pins */
   { ushort
       i ,
       kids ,
       k ,
       count = 0 ;
     tree kid ;
     symbol text ;
     tr_entry ( T ) ;
     kids = kidcount ( T ) ;
     for
       ( kid = subtree ( i = 1 , T ) ;
         nameofnode ( kid ) != N_NAMES ;
         kid = subtree ( ++i , T )
       )
       count += do_pin_name ( kid ) ;
     the -> num_out += count ;
     tr_entry ( kid ) ;
     k = kidcount ( kid ) ;
     if ( k != count )
       { buf_instead ( k , count ) ;
         cerror
           ( subtree ( k , kid ) ,
/*LMSG*/"wrong number of out_pin numbers compared to device signal names: %s"
             , buf
           ) ;
       }
     tr_exit ( kid ) ;
     while ( ++i <= kids )
       { kid = subtree ( i , T ) ;
         switch ( nameofnode ( kid ) )
           { case P_ID_ :
               do_id_attr ( kid ) ;
               text = textofnode ( kid ) ;
               if
                 ( text == C_eval ||
                   text == C_store ||
                   text == C_edge_rise ||
                   text == C_edge_fall ||
                   text == C_keepalive
                 )
                 cerror
                   ( kid ,
/*LMSG*/"%s attribute not allowed on out_pins"
                     , symtostr ( text )
                   ) ;
               if ( text == C_feedback )
                 the -> has_feedback_pins = 1 ;
               break ;
             case N_ATTR :
               if ( nameofnode ( subtree ( 2 , kid ) ) == P_ID_ )
                 { do_cycle_spec ( kid ) ;
                   cerror
                     ( subtree ( 1 , kid ) ,
/*LMSG*/"cycle specification attribute illegal on out_pins"
                     ) ;
                   break ;
                 }
               do_current_spec ( kid ) ;
               text = textofnode ( subtree ( 1 , kid ) ) ;
               if ( text == C_Iih || text == C_Iil )
                 cerror
                   ( subtree ( 1 , kid ) ,
/*LMSG*/"%s current specifier not allowed on out_pins"
                     , symtostr ( text )
                   ) ;
               break ;
             default :
               cerror
                 ( kid ,
/*LMSG*/"internal error: do_out_pins: unknown node name: %s"
                   , symtostr ( nameofnode ( kid ) )
                 ) ;
               break ;
           }
       }
     tr_exit ( T ) ;
   } /* do_out_pins */

static void
do_io_pins ( T )
   tree T ;
   /* counts and checks attributes of I/O pins */
   { ushort
       i ,
       kids ,
       k ,
       count = 0 ;
     tree kid ;
     symbol text ;
     tr_entry ( T ) ;
     kids = kidcount ( T ) ;
     for
       ( kid = subtree ( i = 1 , T ) ;
         nameofnode ( kid ) != N_NAMES ;
         kid = subtree ( ++i , T )
       )
       count += d[illegible]n_name ( kid ) ;
     the -> num_io += count ;
     tr_entry ( kid ) ;
     k = kidcount ( kid ) ;
     if ( k != count )
       { buf_instead ( k , count ) ;
         cerror
           ( subtree ( k , kid ) ,
/*LMSG*/"wrong number of io_pin numbers compared to device signal names: %s"
             , buf
           ) ;
       }
     tr_exit ( kid ) ;
     while ( ++i <= kids )
       { kid = subtree ( i , T ) ;
         switch ( nameofnode ( kid ) )
           { case P_ID_ :
               do_id_attr ( kid ) ;
               text = textofnode ( kid ) ;
               if ( text == C_feedback )
                 the -> has_feedback_pins = 1 ;
               if
```

Copyright 1989
Logic Modeling Systems

SOURCE PROGRAM shellswm/walk_1.c | DATE 5/23/89 | TIME 4:42:25 pm | PAGE # 7/62

LINE # SOURCE TEXT

```
                ( text == C_eval ||
                  text == C_store ||
                  text == C_edge_rise ||
                  text == C_edge_fall
                )
                the -> has_store_pins = 1 ;
              break ;
            case N_ATTR :
              if ( nameofnode ( subtree ( 2 , kid ) ) == P_ID_ )
                do_cycle_spec ( kid ) ;
              else
                do_current_spec ( kid ) ;
              break ;
            default :
              cerror
                ( kid ,
/*LMSG*/"internal error: do_io_pins: unknown node name: %s"
                , symtostr ( nameofnode ( kid ) )
                ) ;
              break ;
          }
      }
    tr_exit ( T ) ;
  } /* do_io_pins */

static void
do_power_pins ( T )
  tree T ;
  /* counts and checks attributes of power pins */
  { ushort
      i ,
      kids ,
      k ,
      count = 0 ;
    tree kid ;
    tr_entry ( T ) ;
    kids = kidcount ( T ) ;
    for
      ( kid = subtree ( i = 1 , T ) ;
        nameofnode ( kid ) != N_NAMES ;
        kid = subtree ( ++i , T )
      )
      count += do_pin_name ( kid ) ;
    tr_entry ( kid ) ;
    k = kidcount ( kid ) ;
    if ( count == 1 && k != 1 )
      { decorate ( subtree ( 1 , T ) , ( long ) k ) ;
        the -> num_power += k ;
      }
    else
      the -> num_power += count ;
    if ( count != 1 && k != count )
      { buf_instead ( k , count ) ;
        cerror
          ( subtree ( k , kid ) ,
/*LMSG*/"wrong number of power_pin numbers compared to device signal names: %s"
          , buf
          ) ;
      }
    tr_exit ( kid ) ;
    while ( ++i <= kids )
      { kid = subtree ( i , T ) ;
        switch ( nameofnode ( kid ) )
          { case P_ID_ :
              do_id_attr ( kid ) ;
              cerror
                ( kid ,
/*LMSG*/"power_pin attributes illegal: %s"
                , sof ( kid )
                ) ;
              break ;
            case N_ATTR :
              if ( nameofnode ( subtree ( 2 , kid ) ) == P_ID_ )
                { do_cycle_spec ( kid ) ;
                  cerror
                    ( subtree ( 1 , kid ) ,
/*LMSG*/"cycle specification attribute illegal on power_pins"
                    ) ;
                  break ;
                }
              do_current_spec ( kid ) ;
              cerror
                ( subtree ( 1 , kid ) ,
/*LMSG*/"current or resistance specification attribute illegal on power_pins"
                ) ;
              break ;
            default :
              cerror
                ( kid ,
/*LMSG*/"internal error: do_power_pins: unknown node name: %s"
                , symtostr ( nameofnode ( kid ) )
                ) ;
              break ;
          }
      }
    tr_exit ( T ) ;
  } /* do_power_pins */

static
do_ground_pins ( T )
  tree T ;
  /* counts and checks attributes of ground pins */
  { ushort
      i ,
      kids ,
      k ,
      count = 0 ;
    tree kid ;
    tr_entry ( T ) ;
    kids = kidcount ( T ) ;
    for
      ( kid = subtree ( i = 1 , T ) ;
        nameofnode ( kid ) != N_NAMES ;
        kid = subtree ( ++i , T )
      )
      count += do_pin_name ( kid ) ;
    tr_entry ( kid ) ;
    k = kidcount ( kid ) ;
    if ( count == 1 && k != 1 )
      { decorate ( subtree ( 1 , T ) , ( long ) k ) ;
```

Copyright 1989
Logic Modeling Systems

SOURCE PROGRAM shellswm/walk_1.c

DATE 5/23/89 TIME 4:42:25 pm

LINE # SOURCE TEXT

```
          the -> sum_ground += k ;
        }
      else
        the -> sum_ground += count ;
      if ( count != 1 && k != count )
        { buf_instead ( k , count ) ;
          cerror
            ( subtree ( k , kid ) ,
/*LMSG*/"wrong number of ground_pin numbers compared to device signal names: %s"
              , buf
            ) ;
        }
      tr_exit ( kid ) ;
      while ( ++i <= kids )
        { kid = subtree ( i , T ) ;
          switch ( nameofnode ( kid ) )
            { case P_ID_ :
                do_id_attr ( kid ) ;
                cerror
                  ( kid ,
/*LMSG*/"ground_pin attributes illegal: %s"
                    , sof ( kid )
                  ) ;
                break ;
              case N_ATTR :
                if ( nameofnode ( subtree ( 2 , kid ) ) == P_ID_ )
                  { do_cycle_spec ( kid ) ;
                    cerror
                      ( subtree ( 1 , kid ) ,
/*LMSG*/"cycle specification attribute illegal on ground_pins"
                      ) ;
                    break ;
                  }
                do_current_spec ( kid ) ;
                cerror
                  ( subtree ( 1 , kid ) ,
/*LMSG*/"current or resistance specification attribute illegal on ground_pins"
                  ) ;
                break ;
              default :
                cerror
                  ( kid ,
/*LMSG*/"internal error: do_ground_pins: unknown node name: %s"
                    , symtostr ( nameofnode ( kid ) )
                  ) ;
                break ;
            }
        }
      tr_exit ( T ) ;
    } /* do_ground_pins */

static void
do_nc_pins ( T )
  tree T ;
  /* counts and checks attributes of NC pins */
  { ushort
      i ,
      kids ,
      k ,
      count = 0 ;
    tree kid ;
    tr_entry ( T ) ;
    kids = kidcount ( T ) ;
    for
      ( kid = subtree ( i = 1 , T ) ;
        nameofnode ( kid ) != N_NAMES ;
        kid = subtree ( ++i , T )
      )
      count += do_pin_name ( kid ) ;
    tr_entry ( kid ) ;
    k = kidcount ( kid ) ;
    if ( count == 1 && k != 1 )
      { decorate ( subtree ( 1 , T ) , ( long ) k ) ;
        the -> sum_nc += k ;
      }
    else
      the -> sum_nc += count ;
    if ( count != 1 && k != count )
      { buf_instead ( k , count ) ;
        cerror
          ( subtree ( k , kid ) ,
/*LMSG*/"wrong number of nc_pin numbers compared to device signal names: %s"
            , buf
          ) ;
      }
    tr_exit ( kid ) ;
    while ( ++i <= kids )
      { kid = subtree ( i , T ) ;
        switch ( nameofnode ( kid ) )
          { case P_ID_ :
              do_id_attr ( kid ) ;
              cerror
                ( kid ,
/*LMSG*/"nc_pin attributes illegal: %s"
                  , sof ( kid )
                ) ;
              break ;
            case N_ATTR :
              if ( nameofnode ( subtree ( 2 , kid ) ) == P_ID_ )
                { do_cycle_spec ( kid ) ;
                  cerror
                    ( subtree ( 1 , kid ) ,
/*LMSG*/"cycle specification attribute illegal on nc_pins"
                    ) ;
                  break ;
                }
              do_current_spec ( kid ) ;
              cerror
                ( subtree ( 1 , kid ) ,
/*LMSG*/"current or resistance specification attribute illegal on nc_pins"
                ) ;
              break ;
            default :
              cerror
                ( kid ,
/*LMSG*/"internal error: do_nc_pins: unknown node name: %s"
                  , symtostr ( nameofnode ( kid ) )
                ) ;
              break ;
          }
```

Copyright 1989 Logic Modeling Systems

SOURCE PROGRAM shellswm/walk_1.c | DATE 5/23/89 | TIME 4:42:25 pm | PAGE # 9/64

LINE # SOURCE TEXT

```
      }
    tr_exit ( T ) ;
  } /* do_ac_pins */

static ushort
do_resets ( T )
  tree T ;
  /* process reset pins, return how many */
  { ushort
      k ,
      count = 0 ,
      kids ;
    tr_entry ( T ) ;
    kids = kidcount ( T ) ;
    for ( k = 1 ; k < kids ; ++k )
      count += do_pin_name ( subtree ( k , T ) ) ;
    tr_exit ( T ) ;
    return count ;
  } /* do_resets */

static unsigned long
do_unit ( T , unit )
  tree T ;
  symbol *unit ;
  /* check clock rate units, return time in picoseconds, and unit identifier */
  { tree kid ;
    char *str , *s ;
    symbol text ;
    double val ;
    ushort set = 0 ;
    *unit = NULLSYM ;
    tr_entry ( T ) ;
    kid = subtree ( 1 , T ) ;
    if ( kidcount ( T ) == 1 )
      { text = textofnode ( kid ) ;
        str = symtostr ( text ) ;
        s = buf ;
        while ( ( *str < 'A' || *str > 'Z' ) && ( *str < 'a' || *str > 'z' ) )
          *s++ = *str++ ;
        *s = '\0' ;
        set_text ( kid , strtosym ( buf ) ) ;
        val = check_num ( kid ) ;
        set_text ( kid , text ) ;
        text = strtosym ( str ) ;
      }
    else
      { val = check_num ( kid ) ;
        kid = subtree ( 2 , T ) ;
        tr_entry ( kid ) ;
        text = textofnode ( kid ) ;
        set = 1 ;
        tr_exit ( kid ) ;
      }
    if ( scompare ( text , C_Hz ) )
      { *unit = C_Hz ;
        if ( set )
          set_text ( kid , C_Hz ) ;
        if ( val != 0 )
          val = 1 / val * 1E12 ;
      }
    else if ( scompare ( text , C_KHz ) )
      { *unit = C_KHz ;
        if ( set )
          set_text ( kid , C_KHz ) ;
        if ( val != 0 )
          val = 1 / val * 1E9 ;
      }
    else if ( scompare ( text , C_MHz ) )
      { *unit = C_MHz ;
        if ( set )
          set_text ( kid , C_MHz ) ;
        if ( val != 0 )
          val = 1 / val * 1E6 ;
      }
    else if ( scompare ( text , C_GHz ) )
      { *unit = C_GHz ;
        if ( set )
          set_text ( kid , C_GHz ) ;
        if ( val != 0 )
          val = 1 / val * 1E3 ;
      }
    else if ( scompare ( text , C_ms ) )
      { *unit = C_ms ;
        if ( set )
          set_text ( kid , C_ms ) ;
        if ( val != 0 )
          val *= 1E9 ;
        else
          cerror
            ( kid ,
/*LMSG*/"zero clock period illegal"
            ) ;
      }
    else if ( scompare ( text , C_us ) )
      { *unit = C_us ;
        if ( set )
          set_text ( kid , C_us ) ;
        if ( val != 0 )
          val *= 1E6 ;
        else
          cerror
            ( kid ,
/*LMSG*/"zero clock period illegal"
            ) ;
      }
    else if ( scompare ( text , C_ns ) )
      { *unit = C_ns ;
        if ( set )
          set_text ( kid , C_ns ) ;
        if ( val != 0 )
          val *= 1E3 ;
        else
          cerror
            ( kid ,
/*LMSG*/"zero clock period illegal"
            ) ;
      }
    else if ( scompare ( text , C_ps ) )
      { *unit = C_ps ;
        if ( set )
```

Copyright 1989
Logic Modeling Systems

SOURCE PROGRAM shellswm/walk_1.c | DATE 5/23/89 | TIME 4:42:25 pm | PAGE # 10/65

LINE # SOURCE TEXT

```
            set_text ( kid , C_ps ) ;
          if ( val == 0 )
            cerror
              ( kid ,
/*LMSG*/"zero clock period illegal"
              ) ;
        }
      else
        { cerror
            ( kid ,
/*LMSG*/"illegal unit specifier: %s (must be KHz, MHz, uS, or nS)"
              , symtostr ( text )
            ) ;
          val = 0 ;
        }
      if ( val != 0 )
        if ( val > ABS_MAX_PERIOD )
          val = 0 ;
        else if ( val < ABS_MIN_PERIOD )
          { fill_buf ( textofnode ( subtree ( 1 , T ) ) , textofnode ( kid ) ) ;
            ( void ) sprintf
              ( num_buf ,
                "%lu" ,
                ( unsigned long ) ABS_MIN_PERIOD / 1000
              ) ;
            cerror
              ( kid ,
/*LMSG*/"device_speed too high: %s (period must be no less than %s nS)"
                , buf ,
                num_buf
              ) ;
            val = 0 ;
          }
      tr_exit ( T ) ;
      return val + 0.999 ;
    } /* do_unit */

ushort
check_pin_number ( num )
  tree num ;
  /* checks and returns the passed device adapter pin number node */
  { char
      *s ,
      *str ;
    unsigned long val = 0 ;
    s =
      str =
        symtostr ( textofnode ( num ) ) ;
    if ( *s >= '1' && *s <= '9' )
      { val = *s - '0' ;
        while ( *++s >= '0' && *s <= '9' )
          if ( val < MAX_PINS )
            { val *= 10 ;
              val += *s - '0' ;
            }
        if ( *s != '\0' )
          { val = 0 ;
            cerror
              ( num ,
/*LMSG*/"illegal device adapter pin number (non-numeric characters): %s"
                , str
              ) ;
          }
      }
    else if ( *s != '0' || s [ 1 ] != '\0' )
      cerror
        ( num ,
/*LMSG*/"illegal device adapter pin number (leading zeros): %s"
          , str
        ) ;
    if ( val >= MAX_PINS )
      { val = 0 ;
        ( void ) sprintf ( num_buf , "%lu" , ( unsigned long ) MAX_PINS ) ;
        cerror
          ( num ,
/*LMSG*/"device adapter pin number too large: %s (must be less than %s)"
            , str
          ) ;
      }
    return val ;
  } /* check_pin_number */

static void
amapit ( from , to , parent )
  tree
    from ,
    to ,
    parent ;
  /* process mapping for a single device adapter mapping */
  { tree look ;
    ushort num ;
    symbol
      text1 ,
      text2 ;
    tr_entry ( from ) ;
    text1 = textofnode ( from ) ;
    if
      ( ( look = g_lookup ( text1 ) ) != NULLTREE &&
        name[illegible]le ( look ) == N_ADAPTER
      )
      cerror
        ( from ,
/*LMSG*/"device adapter mapping respecified for device adapter pin name %s"
          , symtostr ( text1 )
        ) ;
    else
      g_declare ( text1 , parent ) ;
    tr_exit ( from ) ;
    tr_entry ( to ) ;
    text2 = textofnode ( to ) ;
    if ( ( num = check_pin_number ( to ) ) >= the -> apin_cnt )
      the -> apin_cnt = num + 1 ;
    while ( apin_number_of ( text2 ) )
      text2 = prepend_underscore ( text2 , 0 ) ;
    set_apin_number ( text2 , text1 ) ;
    tr_exit ( to ) ;
  } /* amapit */

static void
do_amapping ( T , parent )
```

Copyright 1989 Logic Modeling Systems

LINE # SOURCE TEXT

```
  tree
    T ,
    parent ;
  /* process device adapter mappings */
  { tree
      kid1 ,
      kid2 ;
    ushort
      k ,
      kids1 ,
      kids2 ;
    tr_entry ( T ) ;
    kid1 = subtree ( 1 , T ) ;
    tr_entry ( kid1 ) ;
    kids1 = kidcount ( kid1 ) ;
    kid2 = subtree ( 2 , T ) ;
    kids2 = kidcount ( kid2 ) ;
    if ( kids1 > kids2 )
      { buf_instead ( kids2 , kids1 ) ;
        cerror
          ( subtree ( kids2 , kid2 ) ,
/*LMSG*/"too few device adapter pin numbers: %s"
            , buf
          ) ;
      }
    else if ( kids1 < kids2 )
      cerror
        ( subtree ( kids1 + 1 , kid2 ) ,
/*LMSG*/"too many device adapter pin numbers: %s"
          , symtostr ( textofnode ( subtree ( kids1 + 1 , kids2 ) ) )
        ) ;
    tr_exit ( kid1 ) ;
    tr_entry ( kid2 ) ;
    for ( k = 1 ; k <= kids1 ; ++k )
      if ( k <= kids2 )
        amapit ( subtree ( k , kid1 ) , subtree ( k , kid2 ) , parent ) ;
    tr_exit ( kid2 ) ;
    tr_exit ( T ) ;
  } /* do_amapping */

void
walk_1 ( T )
  tree T ;
  /* the constrainers first walk */
  { ushort
      k ,
      kids ;
    unsigned long
      rate1 ,
      rate2 ,
      tmp ;
    tree
      fkid ,
      lkid ;
    symbol
      name ,
      text ;
    tr_entry ( T ) ;
    name = nameofnode ( T ) ;
    kids = kidcount ( T ) ;
    if ( kids )
      fkid = subtree ( 1 , T ) ;
    if ( kids > 1 )
      lkid = subtree ( kids , T ) ;
    switch ( name )
      {
/*.MDL statement*/
        case N_NAME :
          tr_entry ( fkid ) ;
          if ( the -> dev_name == NULLSYM )
            if
              ( *symtostr ( textofnode ( fkid ) ) != '"' &&
                *symtostr ( textofnode ( fkid ) ) != '\'' 
              )
              the -> dev_name = textofnode ( fkid ) ;
            else
              { buf_string ( symtostr ( textofnode ( fkid ) ) ) ;
                the -> dev_name = strtosym ( buf ) ;
              }
          else
            cerror
              ( fkid ,
/*LMSG*/"internal error: device_name respecified: %s"
                , sof ( fkid )
              ) ;
          tr_exit ( fkid ) ;
          break ;
/*.OPT statements*/
        case N_FAST :
          if ( the -> ultra_fast )
            cerror
              ( T ,
/*LMSG*/"ultra_fast respecified"
              ) ;
          else
            the -> ultra_fast = 1 ;
          break ;
        case N_USAGE :
          tr_entry ( fkid ) ;
          text = textofnode ( fkid ) ;
          if ( scompare ( text , C_public ) )
            set_text ( fkid , C_public ) ;
          else if ( scompare ( text , C_private ) )
            set_text ( fkid , C_private ) ;
          else
            cerror
              ( fkid ,
/*LMSG*/"illegal device_usage: %s (must be public or private)"
                , symtostr ( text )
              ) ;
          if ( the -> dev_type == NULLSYM )
            the -> dev_type = textofnode ( fkid ) ;
          else
            cerror
              ( fkid ,
/*LMSG*/"internal error: device_usage respecified: %s"
                , symtostr ( text )
              ) ;
          tr_exit ( fkid ) ;
          break ;
```

Copyright 1989 Logic Modeling Systems

SOURCE PROGRAM shellswm/walk_1.c | DATE 5/23/89 | TIME 4:42:25 pm | PAGE # 12/67

LINE # SOURCE TEXT

```
          case N_REPORT :
            tr_entry ( fkid ) ;
            text = textofnode ( fkid ) ;
            if ( scompare ( text , C_missing_delays ) )
              set_text ( fkid , C_missing_delays ) ;
            else if ( scompare ( text , C_io_store_changes ) )
              set_text ( fkid , C_io_store_changes ) ;
            else
              cerror
                ( fkid ,
/*LMSG*/"illegal report specifier: %s (must be missing_delays or io_store_changes)"
                , symtostr ( text )
                ) ;
            name = textofnode ( fkid ) ;
            tr_exit ( fkid ) ;
            if ( kids == 2 )
              { tr_entry ( lkid ) ;
                text = textofnode ( lkid ) ;
                if ( scompare ( text , C_on ) )
                  set_text ( lkid , C_on ) ;
                else if ( scompare ( text , C_off ) )
                  set_text ( lkid , C_off ) ;
                else
                  { cerror
                      ( lkid ,
/*LMSG*/"illegal report command: %s (must be on or off)"
                      , symtostr ( text )
                    ) ;
                    text = NULLSYM ;
                  }
                text = textofnode ( lkid ) ;
                tr_exit ( lkid ) ;
              }
            else
              text = C_on ;
            if ( text != NULLSYM )
              switch ( name )
                { case C_missing_delays :
                    if ( the -> missing_delays != NULLSYM )
                      cerror
                        ( lkid ,
/*LMSG*/"report missing_delays respecified"
                        ) ;
                    else
                      the -> missing_delays = text ;
                    break ;
                  case C_io_store_changes :
                    if ( the -> io_store_changes != NULLSYM )
                      cerror
                        ( lkid ,
/*LMSG*/"report io_store_changes respecified"
                        ) ;
                    else
                      the -> io_store_changes = text ;
                    break ;
                  default : break ;
                }
            break ;
          case N_MODELER :
            tr_entry ( fkid ) ;
            if ( the -> mod_name == NULLSYM )
              if
                ( *symtostr ( textofnode ( fkid ) ) != '"' &&
                  *symtostr ( textofnode ( fkid ) ) != '\''
                )
                the -> dev_name = textofnode ( fkid ) ;
              else
                { buf_string ( symtostr ( textofnode ( fkid ) ) ) ;
                  the -> mod_name = strtosym ( buf ) ;
                }
            else
              cerror
                ( fkid ,
/*LMSG*/"internal error: modeler_name respecified: %s"
                , sof ( fkid )
                ) ;
            tr_exit ( fkid ) ;
            break ;
          case N_CLOCK_TYPE :
            tr_entry ( fkid ) ;
            text = textofnode ( fkid ) ;
            if ( scompare ( text , C_internal ) )
              set_text ( fkid , C_internal ) ;
            else if ( scompare ( text , C_ext1 ) )
              set_text ( fkid , C_ext1 ) ;
            else if ( scompare ( text , C_ext2 ) )
              set_text ( fkid , C_ext2 ) ;
            else
              cerror
                ( fkid ,
/*LMSG*/"illegal clock_type specifier: %s (must be internal, external_clock0, or external_clock1)"
                , symtostr ( text )
                ) ;
            if ( the -> clk_type == NULLSYM )
              the -> clk_type = textofnode ( fkid ) ;
            else
              cerror
                ( fkid ,
/*LMSG*/"clock_type respecified: %s"
                , symtostr ( text )
                ) ;
            tr_exit ( fkid ) ;
            break ;
          case N_DIS_TIM_CHECK :
            if ( the -> dis_tim_check )
              cerror
                ( T ,
/*LMSG*/"disable_timing_checking respecified"
                ) ;
            else
              the -> dis_tim_check = 1 ;
            break ;
          case N_INH_TIM_MEASURE :
            if ( the -> inh_tim_measure )
              cerror
                ( T ,
/*LMSG*/"inhibit_timing_measurement respecified"
                ) ;
            else
              the -> inh_tim_measure = 1 ;
```

Copyright 1989
Logic Modeling Systems

| SOURCE PROGRAM | DATE | TIME | PAGE # |
|---|---|---|---|
| shellswm/walk_1.c | 5/23/89 | 4:42:25 pm | 13/68 |

LINE # SOURCE TEXT

```
          break ;
/*.DEV statements*/
        case N_HOLD_TIME :
          if ( the -> def_hold == UNDEFINED )
            { the -> def_hold = 1000 * check_num ( fkid ) ;
              if ( the -> def_hold > MAX_PERIOD / 4 )
                { ( void ) sprintf
                    ( num_buf ,
                      "%lu" ,
                      ( unsigned long ) MAX_PERIOD / 4000
                    ) ;
                  cerror
                    ( fkid ,
/*LMSG*/"device_hold_time too large: %s (must be no more than %s nS)"
                      , symtostr ( textofnode ( fkid ) ) ,
                      num_buf
                    ) ;
                }
            }
          else
            cerror
              ( fkid ,
/*LMSG*/"device_hold_time respecified: %s"
                , symtostr ( textofnode ( fkid ) )
              ) ;
          break ;
        case N_SETUP_TIME :
          if ( the -> def_setup == UNDEFINED )
            { the -> def_setup = 1000 * check_num ( fkid ) ;
              if ( the -> def_setup > MAX_PERIOD / 2 )
                { ( void ) sprintf
                    ( num_buf ,
                      "%lu" ,
                      ( unsigned long ) MAX_PERIOD / 2000
                    ) ;
                  cerror
                    ( fkid ,
/*LMSG*/"device_setup_time too large: %s (must be no more than %s nS)"
                      , symtostr ( textofnode ( fkid ) ) ,
                      num_buf
                    ) ;
                }
            }
          else
            cerror
              ( fkid ,
/*LMSG*/"device_setup_time respecified: %s"
                , symtostr ( textofnode ( fkid ) )
              ) ;
          break ;
        case N_SAMPLE_TIME :
          if ( the -> def_sample == UNDEFINED )
            { the -> def_sample = 1000 * check_num ( fkid ) ;
              if ( the -> def_sample == 0 )
                cerror
                  ( fkid ,
/*LMSG*/"zero device_sample_time not allowed"
                  ) ;
            }
          else
            cerror
              ( fkid ,
/*LMSG*/"device_sample_time respecified: %s"
                , symtostr ( textofnode ( fkid ) )
              ) ;
          break ;
        case N_SPEED :
          if ( kidcount ( fkid ) == 1 )
            { name = textofnode ( subtree ( 1 , fkid ) ) ;
              if
                ( *symtostr ( name ) >= 'A' && *symtostr ( name ) <= 'Z' ||
                  *symtostr ( name ) >= 'a' && *symtostr ( name ) <= 'z'
                )
                { if ( scompare ( name , C_infinity ) )
                    { set_text ( subtree ( 1 , fkid ) , C_infinity ) ;
                      name = C_ns ;
                    }
                  else if ( scompare ( name , C_static ) )
                    { set_text ( subtree ( 1 , fkid ) , C_static ) ;
                      name = C_Hz ;
                    }
                  else
                    { cerror
                        ( subtree ( 1 , fkid ) ,
/*LMSG*/"illegal device_speed identifier: %s (must be infinity or static)"
                          , symtostr ( name )
                        ) ;
                      name = NULLSYM ;
                    }
                  rate1 = rate2 = 0 ;
                  if ( kids == 2 )
                    { text = textofnode ( subtree ( 1 , lkid ) ) ;
                      if
                        ( *symtostr ( text ) >= 'A' &&
                          *symtostr ( text ) <= 'Z' ||
                          *symtostr ( text ) >= 'a' &&
                          *symtostr ( text ) <= 'z'
                        )
                        { if ( scompare ( text , C_infinity ) )
                            { set_text ( subtree ( 1 , lkid ) , C_infinity ) ;
                              text = C_ns ;
                            }
                          else if ( scompare ( text , C_static ) )
                            { set_text ( subtree ( 1 , lkid ) , C_static ) ;
                              text = C_Hz ;
                            }
                          else
                            { cerror
                                ( subtree ( 1 , lkid ) ,
/*LMSG*/"illegal device_speed identifier: %s (must be infinity or static)"
                                  , symtostr ( text )
                                ) ;
                              text = NULLSYM ;
                            }
                        }
                      else
                        rate2 = do_unit ( lkid , &text ) ;
                    }
                }
              else
```

Copyright 1989
Logic Modeling Systems

LINE # SOURCE TEXT

```
                         { rate1 = rate2 = do_unit ( fkid , &name ) ;
                           if ( kids == 2 )
                             { if ( kidcount ( lkid ) == 1 )
                                 { text = textofnode ( subtree ( 1 , lkid ) ) ;
                                   if
                                     ( *symtostr ( text ) >= 'A' &&
                                       *symtostr ( text ) <= 'Z' ||
                                       *symtostr ( text ) >= 'a' &&
                                       *symtostr ( text ) <= 'z'
                                     )
                                     { if ( scompare ( text , C_infinity ) )
                                         { set_text
                                             ( subtree ( 1 , lkid ) ,
                                               C_infinity
                                             ) ;
                                           text = C_ns ;
                                         }
                                       else if ( scompare ( text , C_static ) )
                                         { set_text
                                             ( subtree ( 1 , lkid ) ,
                                               C_static
                                             ) ;
                                           text = C_Hz ;
                                         }
                                       else
                                         { cerror
                                             ( subtree ( 1 , lkid ) ,
/*LMSC*/"illegal device_speed identifier: %s (must be infinity or static)"
                                               , symtostr ( text )
                                             ) ;
                                           text = NULLSYM ;
                                         }
                                       rate2 = 0 ;
                                     }
                                   else
                                     rate2 = do_unit ( lkid , &text ) ;
                                 }
                               else
                                 rate2 = do_unit ( lkid , &text ) ;
                             }
                         }
                     }
                   else
                     { rate1 = rate2 = do_unit ( fkid , &name ) ;
                       if ( kids == 2 )
                         { if ( kidcount ( lkid ) == 1 )
                             { text = textofnode ( subtree ( 1 , lkid ) ) ;
                               if
                                 ( *symtostr ( text ) >= 'A' &&
                                   *symtostr ( text ) <= 'Z' ||
                                   *symtostr ( text ) >= 'a' &&
                                   *symtostr ( text ) <= 'z'
                                 )
                                 { if ( scompare ( text , C_infinity ) )
                                     { set_text ( subtree ( 1 , lkid ) , C_infinity ) ;
                                       text = C_ns ;
                                     }
                                   else if ( scompare ( text , C_static ) )
                                     { set_text ( subtree ( 1 , lkid ) , C_static ) ;
                                       text = C_Hz ;
                                     }
                                   else
                                     { cerror
                                         ( subtree ( 1 , lkid ) ,
/*LMSC*/"illegal device_speed identifier: %s (must be infinity or static)"
                                           , symtostr ( text )
                                         ) ;
                                       text = NULLSYM ;
                                     }
                                   rate2 = 0 ;
                                 }
                               else
                                 rate2 = do_unit ( lkid , &text ) ;
                             }
                           else
                             rate2 = do_unit ( lkid , &text ) ;
                         }
                     }
                   if ( kids == 2 )
                     switch ( text )
                       { case C_Hz :
                         case C_KHz :
                         case C_MHz :
                         case C_GHz :
                           switch ( name )
                             { case C_ms :
                               case C_us :
                               case C_ns :
                               case C_ps :
                                 buf_and ( name , text ) ;
                                 cerror
                                   ( subtree ( kidcount ( lkid ) , lkid ) ,
/*LMSC*/"inconsistent unit types: %s"
                                     , buf
                                   ) ;
                                 break ;
                               default :
                                 break ;
                             }
                           break ;
                         case C_ms :
                         case C_us :
                         case C_ns :
                         case C_ps :
                           switch ( name )
                             { case C_Hz :
                               case C_KHz :
                               case C_MHz :
                               case C_GHz :
                                 buf_and ( name , text ) ;
                                 cerror
                                   ( subtree ( kidcount ( lkid ) , lkid ) ,
/*LMSC*/"inconsistent unit types: %s"
                                     , buf
                                   ) ;
                                 break ;
                               default :
                                 break ;
                             }
                           break ;
```

Copyright 1989
Logic Modeling Systems

SOURCE PROGRAM shellswm/walk_1.c | DATE 5/23/89 | TIME 4:42:25 pm | PAGE # 15/70

LINE # SOURCE TEXT

```
              default : break ;
            }
          if ( rate1 == 0 && rate2 == 0 )
            cerror
              ( fkid ,
/*LMSG*/"no maximum device_speed specified"
              ) ;
          if ( rate1 == 0 || rate2 != 0 && rate1 > rate2 )
            { tmp = rate1 ;
              rate1 = rate2 ;
              rate2 = tmp ;
            }
# undef ENFORCE_RATE
# ifdef ENFORCE_RATE
            ( ( void ) sprintf
                ( num_buf ,
                  "%lu to %lu" ,
                  MIN_PERIOD / 1000 ,
                  MAX_PERIOD / 1000
                ) ;
              cerror
                ( subtree ( 1 , fkid ) ,
"device_speed out of supported range (%s nS)"
                , num_buf
                ) ;
            }
# endif ENFORCE_RATE
          if ( the -> clk_period1 == -1 )
            { the -> clk_period1 = rate1 ;
              the -> clk_period2 = rate2 ;
            }
          else
            cerror
              ( fkid ,
/*LMSG*/"device_speed respecified"
              ) ;
          break ;
        case N_TECHNOLOGY :
          tr_entry ( fkid ) ;
          text = textofnode ( fkid ) ;
          if ( scompare ( text , C_TTL ) )
            set_text ( fkid , C_TTL ) ;
          else if ( scompare ( text , C_NMOS ) )
            set_text ( fkid , C_NMOS ) ;
          else if ( scompare ( text , C_CMOS ) )
            set_text ( fkid , C_CMOS ) ;
          else if ( scompare ( text , C_LCMOS ) )
            set_text ( fkid , C_LCMOS ) ;
          else if ( scompare ( text , C_custom ) )
            set_text ( fkid , C_custom ) ;
          else
            cerror
              ( fkid ,
/*LMSG*/"illegal technology: %s (must be TTL, NMOS, CMOS, or LCMOS)"
                , symtostr ( text )
              ) ;
          if ( the -> technology == NULLSYM )
            { the -> technology = textofnode ( fkid ) ;
              the -> tech_tree = T ;
            }
          else
            cerror
              ( fkid ,
/*LMSG*/"technology respecified: %s"
                , symtostr ( text )
              ) ;
          tr_exit ( fkid ) ;
          for ( k = 2 ; k <= kids ; ++k )
            do_tech_spec ( subtree ( k , T ) ) ;
          break ;
        case N_INITIALIZE :
          for ( k = 1 ; k <= kids ; ++k )
            the -> num_seqs += do_resets ( subtree ( k , T ) ) ;
          break ;
/*more .DEV statements*/
        case N_IN_PINS :
          for ( k = 1 ; k <= kids ; ++k )
            do_in_pins ( subtree ( k , T ) ) ;
          break ;
        case N_IO_PINS :
          for ( k = 1 ; k <= kids ; ++k )
            do_io_pins ( subtree ( k , T ) ) ;
          break ;
        case N_NC_PINS :
          for ( k = 1 ; k <= kids ; ++k )
            do_nc_pins ( subtree ( k , T ) ) ;
          break ;
        case N_OUT_PINS :
          for ( k = 1 ; k <= kids ; ++k )
            do_out_pins ( subtree ( k , T ) ) ;
          break ;
        case N_POWER_PINS :
          for ( k = 1 ; k <= kids ; ++k )
            do_power_pins ( subtree ( k , T ) ) ;
          break ;
        case N_GROUND_PINS :
          for ( k = 1 ; k <= kids ; ++k )
            do_ground_pins ( subtree ( k , T ) ) ;
          break ;
/*.TMG statements*/
        case N_DEFAULT_DELAY :
          process_timing
            ( fkid ,
              & the -> min_default ,
              & the -> typ_default ,
              & the -> max_default
            ) ;
          if ( the -> use_default )
            cerror
              ( fkid ,
/*LMSG*/"default_delay respecified"
              ) ;
          else
            the -> use_default = 1 ;
          break ;
        case N_DELAY :
/*.PKG, .ADP, .NAM statements*/
        case N_PACKAGE :
        case N_PIN_MAP :
          break ; /* get these in a later pass */
```

Copyright 1989
Logic Modeling Systems

| SOURCE PROGRAM | DATE | TIME | PAGE # |
|---|---|---|---|
| shellswm/walk_1.c | 5/23/89 | 4:42:25 pm | 16/71 |

LINE # SOURCE TEXT

```
        case N_ADAPTER :
          the -> has_adapter_map = 1 ;
          for ( k = 1 , k <= kids , ++k )
            do_amapping ( subtree ( k , T ) , T ) ;
          break ;
        default :
          if ( kids )
            while ( kidcount ( fkid ) )
              fkid = subtree ( 1 , fkid ) ;
          else
            fkid = T ;
          cerror
            ( fkid ,
/*LMSC*/"internal error: walk_1: unknown node name: %s"
              , symtostr ( name )
            ) ;
          break ;
      }
    tr_exit ( T ) ;
  } /* walk_1 */

/* end of Constrainer (walk_1) for HMBL Processor */
```

Copyright 1989
Logic Modeling Systems

SOURCE PROGRAM shellswm/walk_2.c | DATE 5/23/89 | TIME 4:42:27 pm | PAGE # 1/72

LINE # SOURCE TEXT

```
/* SCCS_ID: walk_2.c rev 3.1, 4/24/89 at 08:01:43     */

/*
 * Constrainer (walk_2) for HMBL Processor
 */

# include "common.h"
# include "HMBL.h"
# include <strings.h>
# include "strng.h"
# include "Hparse.h"
# include "trees.h"
# include "Hconst.h"

static void
mapit ( from , to , parent , grandparent )
  tree
    from ,
    to ,
    parent ,
    grandparent ;
  /* process a single mapping of the package mapping */
  { tree
      look ,
      dcln ;
    symbol
      text1 ,
      text2 ;
    tr_entry ( from ) ;
    if ( nameofnode ( from ) == P_STR_ )
      { buf_string ( symtostr ( textofnode ( from ) ) ) ;
        text1 = strtosym ( buf ) ;
      }
    else
      text1 = textofnode ( from ) ;
    dcln = NULLTREE ;
    if
      ( ( look = l_lookup ( text1 ) ) != NULLTREE &&
        ( nameofnode ( look ) == N_PACKAGE ||
          nameofnode ( look ) == N_MAPPING
        )
      )
      cerror
        ( from ,
/*LMSG*/"package mapping respecified for package pin name %s"
          , symtostr ( text1 )
        ) ;
    else
      dcln = grandparent ;
    tr_exit ( from ) ;
    tr_entry ( to ) ;
    text2 = textofnode ( to ) ;
    if
      ( ( look = g_lookup ( text2 ) ) == NULLTREE ||
        nameofnode ( look ) != N_ADAPTER
      )
      if ( dcln != NULLTREE )
        dcln = parent ;
    if ( dcln != NULLTREE )
      l_declare ( text1 , dcln ) ;
    if ( apin_name_of ( text2 ) )
      cerror
        ( to ,
/*LMSG*/"duplicate device adapter pin name: %s"
          , symtostr ( text2 )
        ) ;
    else
      set_apin_name ( text2 , text1 ) ;
    tr_exit ( to ) ;
  } /* mapit */

static void
do_mapping ( T , parent )
  tree
    T ,
    parent ;
  /* process the package mappings */
  { tree
      kid1 ,
      kid2 ;
    ushort
      k ,
      kids1 ,
      kids2 ;
    tr_entry ( T ) ;
    kid1 = subtree ( 1 , T ) ;
    tr_entry ( kid1 ) ;
    kids1 = kidcount ( kid1 ) ;
    kid2 = subtree ( 2 , T ) ;
    kids2 = kidcount ( kid2 ) ;
    if ( kids1 > kids2 )
      { buf_instead ( kids2 , kids1 ) ;
        cerror
          ( subtree ( kids2 , kid2 ) ,
/*LMSG*/"too few device adapter pin names: %s"
            , buf
          ) ;
      }
    else if ( kids1 < kids2 )
      cerror
        ( subtree ( kids1 + 1 , kid2 ) ,
/*LMSG*/"too many device adapter pin names: %s"
          , symtostr ( textofnode ( subtree ( kids1 + 1 , kid2 ) ) )
        ) ;
    tr_exit ( kid1 ) ;
    tr_entry ( kid2 ) ;
    for ( k = 1 ; k <= kids1 ; ++k )
      if ( k <= kids2 )
        mapit ( subtree ( k , kid1 ) , subtree ( k , kid2 ) , T , parent ) ;
    tr_exit ( kid2 ) ;
    tr_exit ( T ) ;
  } /* do_mapping */

void
walk_2 ( T )
  tree T ;
  /* the constrainers second walk */
  { ushort
      k ,
      kids ;
```

Copyright 1989
Logic Modeling Systems

| SOURCE PROGRAM | DATE | TIME | PAGE # |
| --- | --- | --- | --- |
| shellswm/walk_2.c | 5/23/89 | 4:42:27 pm | 2/73 |

LINE # SOURCE TEXT

```
    tr_entry ( T ) ;
    kids = kidcount ( T ) ;
    switch ( nameofnode ( T ) )
      { case N_PACKAGE :
          the -> has_package_map = 1 ;
          for ( k = 1 ; k <= kids ; ++k )
            do_mapping ( subtree ( k , T ) , T ) ;
          break ;
        default : break ;
      }
    tr_exit ( T ) ;
  } /* walk_2 */

/* end of Constrainer (walk_2) for SMBL Processor */
```

Copyright 1989
Logic Modeling Systems

| SOURCE PROGRAM | DATE | PAGE # |
|---|---|---|
| shellswm/walk_3.c | 5/23/89 | 1/74 |
| | TIME 4:42:27 pm | |

LINE # SOURCE TEXT

```
/* SCCS_ID: walk_3.c rev 3.1, 4/24/89 at 08:01:46      */

/*
 *  Constraiser (walk_3) for HMBL Processor
 */

# include "common.h"
# include "HMBL.h"
# include <strings.h>
# include "strng.h"
# include "Hparse.h"
# include "trees.h"
# include "Hconst.h"

static struct pin_attr *
allo_attrs ( size )
  ushort size ;
  /* returns a pointer to a newly-allocated pin attribute array */
  { char *ptr ;
    if ( size )
      ptr = lm_malloc ( sizeof ( struct pin_attr ) * size ) ;
    else
      return NULL ;
    if ( ptr == NULL )
      { lm_Herror
          ( 1 ,
/*LMSG*/"out of memory on modeler (allo_attrs)"
          ) ;
        lm_Pfail ( ) ;
      }
    return ( struct pin_attr * ) ptr ;
  } /* allo_attrs */

static void
declare_pin_name ( text , T , direction , overdeclare )
  symbol text ;
  tree
    T ,
    direction ,
  ushort overdeclare ;
  /* declare passed pin name */
  { tree look ;
    if
      ( ! overdeclare && ( look = g_lookup ( text ) ) != NULLTREE &&
        ( nameofnode ( look ) == N_IN_PINS ||
          nameofnode ( look ) == N_IO_PINS ||
          nameofnode ( look ) == N_NC_PINS ||
          nameofnode ( look ) == N_OUT_PINS ||
          nameofnode ( look ) == N_POWER_PINS ||
          nameofnode ( look ) == N_GROUND_PINS
        )
      )
      cerror
        ( T ,
/*LMSC*/"device signal name redeclared: %s"
          , symtostr ( text )
        ) ;
    else
      g_declare ( text , direction ) ;
  } /* declare_pin_name */

static ushort
add_pin_name ( T , direction , ndex , dest , overdeclare )
  tree
    T ,
    direction ;
  ushort ndex ;
  struct pins *dest ;
  ushort overdeclare ;
  /* adds the pin name(s) in T starting at the ndex'th position in dest */
  /* declares them all via declare_pin_name(), returns how many pins */
  { ushort
      i ,
      num1 = 0 ,
      num2 = 0 ;
    symbol text ;
    tree kid , look ;
    tr_entry ( T ) ;
    switch ( nameofnode ( T ) )
      { case P_ID_ :
        case P_NUM_ :
          text = textofnode ( T ) ;
          dest -> name = text ;
          declare_pin_name
            ( dest -> name ,
              T ,
              direction ,
              overdeclare
            ) ;
          if ( ! overdeclare )
            set_pin_name ( dest -> name , ndex ) ;
          break ;
        case P_STR_ :
/* what about generators in strings? */
          buf_string ( symtostr ( textofnode ( T ) ) ) ;
          text = strtosym ( buf ) ;
          declare_pin_name
            ( dest -> name = text ,
              T ,
              direction ,
              overdeclare
            ) ;
          if ( ! overdeclare )
            set_pin_name ( dest -> name , ndex ) ;
          break ;
        case N_PIN_NAME :
          kid = subtree ( 1 , T ) ;
          tr_entry ( kid ) ;
          text = textofnode ( kid ) ;
          look = g_lookup ( text ) ;
          if ( look == NULLTREE )
            g_declare ( text , T ) ;
/* add buss name to a list of buss names? */
          tr_exit ( kid ) ;
          kid = subtree ( 2 , T ) ;
          tr_entry ( kid ) ;
          num1 =
            num2 =
              dec_ration ( kid ) ;
          tr_exit ( kid ) ;
```

Copyright 1989
Logic Modeling Systems

SOURCE PROGRAM shellswm/walk_3.c | DATE 5/23/89 | TIME 4:42:27 pm | PAGE # 2/75

SOURCE TEXT

```
              if ( kidcount ( T ) == 3 )
                { kid = subtree ( 3 , T ) ;
                  tr_entry ( kid ) ;
                  num2 = dec_ration ( kid ) ;
                  tr_exit ( kid ) ;
                }
              if ( num1 > num2 )
                for ( i = num1 ; ; --i )
                  { declare_pin_name
                      ( dest -> name = gen_name ( text , i ) ,
                        T ,
                        direction ,
                        overdeclare
                      ) ;
                    if ( ! overdeclare )
                      set_pin_name ( dest -> name , ndex++ ) ;
/* record highest buss member in this buss? */
                    if ( i == num2 )
                      break ;
                    ++dest ;
                  }
              else
                for ( i = num1 ; ; ++i )
                  { declare_pin_name
                      ( dest -> name = gen_name ( text , i ) ,
                        T ,
                        direction ,
                        overdeclare
                      ) ;
                    if ( ! overdeclare )
                      set_pin_name ( dest -> name , ndex++ ) ;
/* record highest buss member in this buss? */
                    if ( i == num2 )
                      break ;
                    ++dest ;
                  }
              break ;
          default :
              cerror
                ( T ,
/*LMSG*/"internal error: add_pin_name: unknown node name: %s"
                , symtostr ( nameofnode ( T ) )
                ) ;
              break ;
        }
      tr_exit ( T ) ;
      return num1 > num2 ? num1 - num2 + 1 : num2 - num1 + 1 ;
  } /* add_pin_name */

static void
do_pins ( T , direction )
  tree
    T ,
    direction ,
  /* do all the pins in a pin correspondence via add_pin_name() */
  /* add attributes to them all as well */
  { ushort
      i ,
      j ,
      kids ,
      k ,
      count = 0 ,
      start ,
      num ;
    tree
      kid ,
      kid2 ,
      look ;
    struct pin_attr *attrs ;
    symbol text ;
    start = the -> pin_cnt ;
    tr_entry ( T ) ;
    kids = kidcount ( T ) ;
    for
      ( kid = subtree ( i = 1 , T ) ;
        nameofnode ( kid ) != N_NAMES ;
        kid = subtree ( ++i , T )
      )
      { if ( ( num = dec_ration ( kid ) ) == 0 )
          num = 1 ;
        k = num ;
        while ( k-- )
          { j =
              add_pin_name
                ( kid ,
                  direction ,
                  the -> pin_cnt ,
                  the -> pins + the -> pin_cnt ,
                  ( ushort ) ( k != num - 1 )
                ) ;
            count += j ;
            the -> pin_cnt += j ;
          }
      }
ASSERT(start+count==the->pin_cnt);
    tr_entry ( kid ) ;
    k = kidcount ( kid ) ;
    for ( j = 0 ; j < count ; ++j )
      if ( j < k )
        { text = textofnode ( kid2 = subtree ( j + 1 , kid ) ) ;
          if ( nameofnode ( kid2 ) == P_STR_ )
            { buf_string ( symtostr ( text ) ) ;
              text = strtosym ( buf ) ;
            }
          if
            ( ( look = l_lookup ( text ) ) == NULLTREE ||
              nameofnode ( look ) != N_PACKAGE
            )
            if ( look != NULLTREE && nameofnode ( look ) == N_MAPPING )
              { if ( the -> has_adapter_map )
                  cerror
                    ( kid2 ,
/*LMSG*/"package pin name %s has no device adapter mapping"
                    , symtostr ( text )
                    ) ;
              }
            else if ( the -> has_package_map )
              cerror
                ( kid2 ,
/*LMSG*/"no such package pin name: %s"
```

Copyright 1989 Logic Modeling Systems

| SOURCE PROGRAM | DATE | TIME | PAGE # |
|---|---|---|---|
| shellswm/walk_3.c | 5/23/89 | 4:42:27 pm | 3/76 |

LINE # SOURCE TEXT

```
                    , symtostr ( text )
                  ) ;
            if ( pin_number_of ( text ) )
              cerror
                ( kid2 ,
/*IMSG*/"duplicate package ;.. name: %s"
                , symtostr ( text )
              ) ;
            else
              { set_pin_number ( text , the -> pins [ start + j ] . name ) ;
                the -> pins [ start + j ] . pkg_name = text ;
              }
          }
      tr_exit ( kid ) ;
      attrs = allo_attrs ( num = kids - ( j = i ) ) ;
      while ( ++i <= kids )
        { kid = subtree ( i , T ) ;
          add_attr ( kid , attrs , i - j - 1 ) ;
        }
      while ( start < the -> pin_cnt )
        { the -> pins [ start ] . alias = NULLSYM ;
          the -> pins [ start ] . number = MAX_PINS ,
          the -> pins [ start ] . trace_delay = 0 ;
          the -> pins [ start ] . num_attrs = num ;
          the -> pins [ start ] . attr = attrs ;
          ++start ;
        }
      tr_exit ( T ) ;
    } /* do_pins */

void
walk_3 ( T )
  tree T ;
  /* the constrainers third walk */
  { ushort
      k ,
      kids ;
    tr_entry ( T ) ;
    kids = kidcount ( T ) ;
    switch ( nameofnode ( T ) )
      { case N_IN_PINS :
          case N_IO_PINS :
          case N_NC_PINS :
          case N_OUT_PINS :
          case N_POWER_PINS :
          case N_GROUND_PINS :
            for ( k = 1 ; k <= kids ; ++k )
              do_pins ( subtree ( k , T ) , T ) ;
            break ;
          default :
            break ;
      }
    tr_exit ( T ) ;
  } /* walk_3 */

/* end of Constrainer (walk_3) for SMBL Processor */
```

Copyright 1989
Logic Modeling Systems

SOURCE PROGRAM shellswm/walk_4.c | DATE 5/23/89 | TIME 4:42:27 pm | PAGE # 1/77

LINE # SOURCE TEXT

```
/* SCCS_ID: walk_4.c rev 3.1, 4/24/89 at 08:01:53      */

/*
 * Constrainer (walk_4) for HDBL Processor
 */

# include "common.h"
# include "HDBL.h"
# include <strings.h>
# include "strng.h"
# include "Hparse.h"
# include "trees.h"
# include "Hconst.h"

static char num_buf [ 32 ] ; /* for error reporting */

static struct timing *
allo_timing ( )
  /* returns a pointer to a newly-allocated timing structure */
  { char *ptr ;
    ptr = lm_malloc ( sizeof ( struct timing ) ) ;
    if ( ptr == NULL )
      { lm_Herror
          ( 1 ,
/*LMSG*/"out of memory on modeler (allo_timing)"
          ) ;
        lm_Ffail ( ) ;
      }
    return ( struct timing * ) ptr ;
  } /* allo_timing */

ushort
has_feedback_attribute ( text )
  symbol text ;
  /* returns 1 iff the passed pin name has the feedback attribute */
  { ushort
      i ,
      ndex ;
    ndex = pin_name_of ( text ) ;
    for ( i = 0 ; i < the -> pins [ ndex ] . num_attrs ; ++i )
      if ( the -> pins [ ndex ] . attr [ i ] . use_flag == ID_ATTR )
        { text = the -> pins [ ndex ] . attr [ i ] . attr . id ;
          if ( text == C_feedback )
            return 1 ;
        }
    return 0 ;
  } /* has_feedback_attribute */

static void
do_reset_pin ( T , text , dest , offset )
  tree T ;
  symbol text ;
  struct sequence *dest ;
  ushort offset ;
  /* adds the sequence pin name into dest at offset */
  { ushort i ;
    tree look ;
    look = g_lookup ( text ) ;
    if ( look == NULLTREE )
      cerror
        ( T ,
/*LMSG*/"no such device signal name: %s"
          , symtostr ( text )
        ) ;
    else
      switch ( nameofnode ( look ) )
        { case N_IN_PINS :
          case N_IO_PINS :
            break ;
          case N_OUT_PINS :
            if ( ! has_feedback_attribute ( text ) )
              cerror
                ( T ,
/*LMSG*/"device signal name %s does not have the feedback attribute"
                  , symtostr ( text )
                ) ;
            break ;
          case N_NC_PINS :
          case N_POWER_PINS :
          case N_GROUND_PINS :
            cerror
              ( T ,
/*LMSG*/"device signal name %s is not an in_pin, io_pin, or out_pin"
                , symtostr ( text )
              ) ;
            break ;
          default :
            cerror
              ( T ,
/*LMSG*/"%s is not a device signal name"
                , symtostr ( text )
              ) ;
            break ;
        }
    for ( i = 0 ; i < offset ; ++i )
      if ( dest [ i ] . pin_name == text )
        { cerror
            ( T ,
/*LMSG*/"initialization sequence for device signal name %s respecified"
              , symtostr ( text )
            ) ;
          break ;
        }
    dest [ offset ] . pin_name = text ;
  } /* do_reset_pin */

static ushort
add_reset_pin ( T , dest , offset )
  tree T ;
  struct sequence *dest ;
  ushort offset ;
  /* calls do_reset_pin() for each pin indicated by T */
  { ushort
      i ,
      num1 = 0 ,
      num2 = 0 ;
    symbol text ;
    tree kid ;
    tr_entry ( T ) ;
    switch ( nameofnode ( T ) )
```

Copyright 1989 Logic Modeling Systems

SOURCE PROGRAM shellswm/walk_4.c | DATE 5/23/89 | TIME 4:42:27 pm | PAGE # 2/78

LINE # SOURCE TEXT

```
        { case P_ID_ :
          case P_NUM_ :
            do_reset_pin ( T , textofnode ( T ) , dest , offset ) ;
            break ;
          case P_STR_ :
/*        about generators in strings? */
            buf_string ( symtostr ( textofnode ( T ) ) ) ;
            text = strtosym ( buf ) ;
            do_reset_pin ( T , text , dest , offset ) ;
            break ;
          case N_PIN_NAME :
            kid = subtree ( 1 , T ) ;
            tr_entry ( kid ) ;
            text = textofnode ( kid ) ;
            tr_exit ( kid ) ;
            kid = subtree ( 2 , T ) ;
            tr_entry ( kid ) ;
            num1 =
              num2 =
                dec_ration ( kid ) ;
            tr_exit ( kid ) ;
            if ( kidcount ( T ) == 3 )
              { kid = subtree ( 3 , T ) ;
                tr_entry ( kid ) ;
                num2 = dec_ration ( kid ) ;
                tr_exit ( kid ) ;
              }
            if ( num1 > num2 )
              for ( i = num1 ; ; --i )
                { do_reset_pin ( T , gen_name ( text , i ) , dest , offset ) ;
                  if ( i == num2 )
                    break ;
                  ++offset ;
                }
            else
              for ( i = num1 ; ; ++i )
                { do_reset_pin ( T , gen_name ( text , i ) , dest , offset ) ;
                  if ( i == num2 )
                    break ;
                  ++offset ;
                }
            break ;
          default :
            cerror
              ( T ,
/*LMSC*/"internal error: add_reset_pin: unknown node name: %s"
                , symtostr ( nameofnode ( T ) )
              ) ;
            break ;
        }
      tr_exit ( T ) ;
      return num1 > num2 ? num1 - num2 + 1 : num2 - num1 + 1 ;
    } /* add_reset_pin */

static unsigned long
upseq_len ( T )
  tree T ;
  /* recursively determines the length of an up-sequence */
  { ushort
      k ,
      kids ;
    unsigned long len ;
    symbol text ;
    tree kid ;
    switch ( nameofnode ( T ) )
      { case P_NUM_ :
          len = check_int ( T ) ;
          if ( len && len != 1 )
            cerror
              ( T ,
/*LMSG*/"illegal initialization sequence value (must be 0 or 1): %s"
                , sof ( T )
              ) ;
          decorate ( T , ( long ) ( len == 1 ) ) ;
          return 1 ;
        case N_LIST :
          tr_entry ( T ) ;
          len = 0 ;
          kids = kidcount ( T ) ;
          for ( k = 1 ; k <= kids ; ++k )
            len += upseq_len ( subtree ( k , T ) ) ;
          tr_exit ( T ) ;
          return len ;
        case N_REPEAT :
          tr_entry ( T ) ;
          len = check_int ( subtree ( 1 , T ) ) ;
          if ( len == 0 )
            cerror
              ( subtree ( 1 , T ) ,
/*LMSG*/"zero repeat factor in initialize sequence illegal"
              ) ;
          if ( len > MAX_RES_SEQ_LEN )
            { ( void ) sprintf ( buf , "%lu" , len ) ;
              ( void ) sprintf
                ( num_buf ,
                  "%lu" ,
                  ( unsigned long ) MAX_RES_SEQ_LEN
                ) ;
              cerror
                ( subtree ( 1 , T ) ,
/*LMSG*/"initialize sequence repeat factor too large: %s (must be no more than %s)"
                  , buf ,
                  num_buf
                ) ;
              len = 0 ;
            }
          decorate ( subtree ( 1 , T ) , ( long ) len ) ;
          len *= upseq_len ( subtree ( 2 , T ) ) ;
          tr_exit ( T ) ;
          return len ;
        case N_FEEDBACK :
          tr_entry ( T ) ;
          kid = subtree ( 1 , T ) ;
          tr_entry ( kid ) ;
          text = textofnode ( kid ) ;
          if ( scompare ( text , C_rise ) )
            set_text ( kid , C_rise ) ;
          else if ( scompare ( text , C_fall ) )
            set_text ( kid , C_fall ) ;
          else
```

Copyright 1989
Logic Modeling Systems

| SOURCE PROGRAM | DATE | PAGE # |
|---|---|---|
| shellswm/walk_4.c | 5/23/89 | 3/79 |
| | TIME 4:42:27 pm | |

LINE # SOURCE TEXT

```
                cerror
                  ( kid ,
/*LMSG*/"illegal feedback condition: %s (must be rise or fall)"
                  , symtostr ( text )
                ) ;
              cerror
                ( kid ,
/*LMSG*/"feedback sequences illegal here"
                ) ;
              tr_exit ( kid ) ;
              len = upseq_len ( subtree ( 2 , T ) ) ;
              tr_exit ( T ) ;
              return len ;
            default :
              lm_Herror
                ( 1 ,
/*LMSG*/"internal error: upseq_len: bad node name: %s"
                  , symtostr ( nameofnode ( T ) )
                ) ;
              return 0 ;
          }
  } /* upseq_len */

static void
do_reset_seq
  ( T ,
    is_rise_addr ,
    pre_length_addr ,
    length_addr ,
    post_length_addr
  )
  tree T ;
  ushort
    *is_rise_addr ,
    *pre_length_addr ,
    *length_addr ,
    *post_length_addr ;
  /* processes a reset sequence specification */
  { ushort
      k ,
      k2 ,
      count ,
      kids ,
      kids2 ,
      start ,
      fb = 0 ,
      fb_seen = 0 ;
    tree
      kid ,
      kid2 ,
      kid3 ;
    long
      len ,
      pre_len = 0 ,
      post_len = 0 ;
    symbol text ;
    count =
      start =
        the -> reset_cnt ;
    *is_rise_addr =
      *length_addr =
        0 ;
    tr_entry ( T ) ;
    kids = kidcount ( T ) ;
    for ( k = 1 ; k < kids ; ++k )
      { kid = subtree ( k , T ) ;
        count += add_reset_pin ( kid , the -> sequences , count ) ;
      }
    the -> reset_cnt = count ;
    kid = subtree ( kids , T ) ;
    tr_entry ( kid ) ;
    kids2 = kidcount ( kid ) ;
    for ( k2 = 1 ; k2 <= kids2 ; ++k2 )
      { kid2 = subtree ( k2 , kid ) ;
        switch ( nameofnode ( kid2 ) )
          { case P_NUM_ :
            case N_REPEAT :
              if ( fb_seen )
                { post_len += upseq_len ( kid2 ) ;
                  if ( post_len > MAX_RES_SEQ_LEN )
                    { ( void ) sprintf ( buf , "%ld" , post_len ) ;
                      ( void ) sprintf
                        ( num_buf ,
                          "%lu" ,
                          ( unsigned long ) MAX_RES_SEQ_LEN
                        ) ;
                      cerror
                        ( kid2 ,
/*LMSG*/"post-feedback initialization sequence too long: %s (must be no more than %s)"
                          , buf ,
                          num_buf
                        ) ;
                      post_len = 0 ;
                    }
                }
              else
                { pre_len += upseq_len ( kid2 ) ;
                  if ( pre_len > MAX_RES_SEQ_LEN )
                    { ( void ) sprintf ( buf , "%ld" , pre_len ) ;
                      ( void ) sprintf
                        ( num_buf ,
                          "%lu" ,
                          ( unsigned long ) MAX_RES_SEQ_LEN
                        ) ;
                      cerror
                        ( kid2 ,
/*LMSG*/"pre-feedback initialization sequence too long: %s (must be no more than %s)"
                          , buf ,
                          num_buf
                        ) ;
                      pre_len = 0 ;
                    }
                }
              break ;
            case N_FEEDBACK :
              tr_entry ( kid2 ) ;
              kid3 = subtree ( 1 , kid2 ) ;
              tr_entry ( kid3 ) ;
              text = textofnode ( kid3 ) ;
              if ( scompare ( text , C_rise ) )
```

| Copyright 1989 Logic Modeling Systems | SOURCE PROGRAM shellswm/walk_4.c | DATE 5/23/89 | PAGE # 4/80 |
|---|---|---|---|
| | | TIME 4:42:27 pm | |

LINE # SOURCE TEXT

```
                  set_text ( kid3 , C_rise ) ;
                else if ( scompare ( text , C_fall ) )
                  set_text ( kid3 , C_fall ) ;
                else
                  cerror
                    ( kid ,
/*LMSC*/"illegal feedback condition: %s (must be rise or fall)"
                      , symtostr ( text )
                    ) ;
                tr_exit ( kid3 ) ;
                len = upseq_len ( subtree ( 2 , kid2 ) ) ;
                if ( len > MAX_FB_SEQ_LEN )
                  { ( void ) sprintf ( buf , "%ld" , len ) ;
                    ( void ) sprintf
                      ( num_buf ,
                        "%lu" ,
                        ( unsigned long ) MAX_FB_SEQ_LEN
                      ) ;
                    cerror
                      ( subtree ( 2 , kid2 ) ,
/*LMSC*/"feedback sequence too long: %s (must be no more than %s)"
                        , buf ,
                        num_buf
                      ) ;
                    len = 0 ;
                  }
                if ( fb_seen )
                  cerror
                    ( subtree ( 1 , kid2 ) ,
/*LMSC*/"feedback sequence respecified"
                    ) ;
                else
                  { fb = k2 ;
                    fb_seen = 1 ;
                    *is_rise_addr = textofnode ( kid3 ) == C_rise ;
                    *length_addr = len ;
                  }
                tr_exit ( kid2 ) ;
                break ;
              default :
                tr_entry ( kid2 ) ;
                lm_Serror
                  ( 1 ,
/*LMSC*/"internal error: do_reset_seq: bad node name: %s"
                    , symtostr ( nameofnode ( kid2 ) )
                  ) ;
                tr_exit ( kid2 ) ;
                break ;
          }
      }
    while ( start < the -> reset_cnt )
      { the -> sequences [ start ] . bits = kid ;
        the -> sequences [ start ] . fb_kid = fb ;
        ++start ;
      }
    tr_exit ( kid ) ;
    tr_exit ( T ) ;
    *pre_length_addr = pre_len ;
    *post_length_addr = post_len ;
  } /* do_reset_seq */

/* end of reset sequence handling code */

/* start of timing specification handling code */

void
check_state ( T )
  tree T ;
  /* checks the state identifier passed in T */
  { symbol text ;
    tr_entry ( T ) ;
    text = textofnode ( T ) ;
    if ( scompare ( text , C_low ) )
      set_text ( T , C_low ) ;
    else if ( scompare ( text , C_high ) )
      set_text ( T , C_high ) ;
    else if ( scompare ( text , C_float ) )
      set_text ( T , C_float ) ;
    else if ( scompare ( text , C_valid ) )
      set_text ( T , C_valid ) ;
    else if ( scompare ( text , C_any ) )
      set_text ( T , C_any ) ;
    else
      cerror
        ( T ,
/*LMSC*/"illegal signal state: %s (must be low, high, float, valid, or any)"
          , symtostr ( text )
        ) ;
    tr_exit ( T ) ;
  } /* check_state */

static unsigned long
do_spec ( T )
  tree T ;
  /* process a single time specification, return time in picoseconds */
  { ushort kids ;
    symbol text ;
    double val ;
    tree kid ;
    tr_entry ( T ) ;
    kids = kidcount ( T ) ;
    if ( kids == 2 )
      { kid = subtree ( 1 , T ) ;
        tr_entry ( kid ) ;
        text = textofnode ( kid ) ;
        if ( scompare ( text , C_min ) )
          set_text ( kid , C_min ) ;
        else if ( scompare ( text , C_typ ) )
          set_text ( kid , C_typ ) ;
        else if ( scompare ( text , C_max ) )
          set_text ( kid , C_max ) ;
        else
          cerror
            ( kid ,
/*LMSC*/"illegal time specifier: %s (must be min, typ, or max)"
              , symtostr ( text )
            ) ;
        tr_exit ( kid ) ;
      }
    val = check_num ( subtree ( kids , T ) ) ;
```

Copyright 1989
Logic Modeling Systems

| SOURCE PROGRAM | DATE | PAGE # |
|---|---|---|
| shellswm/walk_4.c | 5/23/89 | 5/81 |
| | TIME 4:42:27 pm | |

LINE # SOURCE TEXT

```
/* some kind of range check? */
    tr_exit ( T ) ;
    return val * 1000 + 0.5 ;
  } /* do_spec */

void
process_timing ( T , min_addr , typ_addr , max_addr )
  tree T ;
  unsigned long
    *min_addr ,
    *typ_addr ,
    *max_addr ;
  /* process a timing specification triple, returning min/typ/max */
  { ushort
      kids ,
      has1 ,
      has2 ,
      has3 ;
    tree
      fkid ,
      lkid ,
      kid ;
    unsigned long
      spec1 ,
      spec2 ,
      spec3 ;
    tr_entry ( T ) ;
    *min_addr =
      *typ_addr =
      *max_addr =
        -1 ;
    kids = kidcount ( T ) ;
    fkid = subtree ( 1 , T ) ;
    lkid = subtree ( kids , T ) ;
    switch ( kids )
      { case 1 :
          spec1 = do_spec ( fkid ) ;
          has1 = kidcount ( fkid ) == 2 ;
          if ( has1 )
            switch ( textofnode ( subtree ( 1 , fkid ) ) )
              { case C_min :
                case C_typ :
                  *min_addr =
                    *typ_addr =
                    *max_addr =
                      spec1 ;
                  break ;
                case C_max :
                  *min_addr = 0 ;
                  *typ_addr =
                    *max_addr =
                      spec1 ;
                  break ;
                default :
                  break ;
              }
          else
            { *min_addr = 0 ;
              *typ_addr =
                *max_addr =
                  spec1 ;
            }
          break ;
        case 2 :
          spec1 = do_spec ( fkid ) ;
          spec2 = do_spec ( lkid ) ;
          has1 = kidcount ( fkid ) == 2 ;
          has2 = kidcount ( lkid ) == 2 ;
          if ( has1 && has2 )
            switch ( textofnode ( subtree ( 1 , fkid ) ) )
              { case C_min :
                  *min_addr = spec1 ;
                  switch ( textofnode ( subtree ( 1 , lkid ) ) )
                    { case C_min :
                        cerror
                          ( subtree ( 1 , lkid ) ,
/*LMSG*/"minimum delay respecified"
                          ) ;
                        break ;
                      case C_typ :
                        *typ_addr =
                          *max_addr =
                            spec2 ;
                        break ;
                      case C_max :
                        *typ_addr = ( spec1 + spec2 ) / 2 ;
                        *max_addr = spec2 ;
                        break ;
                      default :
                        break ;
                    }
                  break ;
                case C_typ :
                  *typ_addr = spec1 ;
                  switch ( textofnode ( subtree ( 1 , lkid ) ) )
                    { case C_min :
                        *min_addr = spec2 ;
                        *max_addr = spec1 ;
                        break ;
                      case C_typ :
                        cerror
                          ( subtree ( 1 , lkid ) ,
/*LMSG*/"typical delay respecified"
                          ) ;
                        break ;
                      case C_max :
                        *min_addr = spec1 ;
                        *max_addr = spec2 ;
                        break ;
                      default :
                        break ;
                    }
                  break ;
                case C_max :
                  switch ( textofnode ( subtree ( 1 , lkid ) ) )
                    { case C_min :
                        *min_addr = spec2 ;
                        *typ_addr = ( spec1 + spec2 ) / 2 ;
                        break ;
                      case C_typ :
```

Copyright 1989 Logic Modeling Systems

| SOURCE PROGRAM | DATE | PAGE # |
|---|---|---|
| shellswm/walk_4.c | 5/23/89 TIME 4:42:27 pm | 6/82 |

SOURCE TEXT

```
                        *min_addr =
                          *typ_addr =
                            spec2 ;
                        break ;
                      case C_max :
                        cerror
                          ( subtree ( 1 , lkid ) ,
/*LMSC*/"maximum delay respecified"
                          ) ;
                        break ;
                      default :
                        break ;
                    }
                  break ;
                default :
                  break ;
              }
            else if ( has1 )
              cerror
                ( subtree ( 1 , fkid ) ,
/*LMSC*/"ambiguous delay specification"
                ) ;
            else if ( has2 )
              cerror
                ( subtree ( 1 , lkid ) ,
/*LMSC*/"ambiguous delay specification"
                ) ;
            else
              { *min_addr = spec1 ;
                *typ_addr = ( spec1 + spec2 ) / 2 ;
                *max_addr = spec2 ;
              }
            break ;
          case 3 :
            kid = subtree ( 2 , T ) ;
            spec1 = do_spec ( fkid ) ;
            spec2 = do_spec ( kid ) ;
            spec3 = do_spec ( lkid ) ;
            has1 = kidcount ( fkid ) == 2 ;
            has2 = kidcount ( kid ) == 2 ;
            has3 = kidcount ( lkid ) == 2 ;
            if ( has1 && has2 && has3 )
              switch ( textofnode ( subtree ( 1 , fkid ) ) )
                { case C_min :
                    *min_addr = spec1 ;
                    switch ( textofnode ( subtree ( 1 , kid ) ) )
                      { case C_min :
                          cerror
                            ( subtree ( 1 , kid ) ,
/*LMSC*/"minimum delay respecified"
                            ) ;
                          switch ( textofnode ( subtree ( 1 , lkid ) ) )
                            { case C_min :
                                cerror
                                  ( subtree ( 1 , kid ) ,
/*LMSC*/"minimum delay respecified"
                                  ) ;
                                break ;
                              case C_typ :
                                *typ_addr = spec3 ;
                                break ;
                              case C_max :
                                *max_addr = spec3 ;
                                break ;
                              default :
                                break ;
                            }
                          break ;
                        case C_typ :
                          *typ_addr = spec2 ;
                          switch ( textofnode ( subtree ( 1 , lkid ) ) )
                            { case C_min :
                                cerror
                                  ( subtree ( 1 , lkid ) ,
/*LMSC*/"minimum delay respecified"
                                  ) ;
                                break ;
                              case C_typ :
                                cerror
                                  ( subtree ( 1 , lkid ) ,
/*LMSC*/"typical delay respecified"
                                  ) ;
                                break ;
                              case C_max :
                                *max_addr = spec3 ;
                                break ;
                              default :
                                break ;
                            }
                          break ;
                        case C_max :
                          *max_addr = spec2 ;
                          switch ( textofnode ( subtree ( 1 , lkid ) ) )
                            { case C_min :
                                cerror
                                  ( subtree ( 1 , lkid ) ,
/*LMSC*/"minimum delay respecified"
                                  ) ;
                                break ;
                              case C_typ :
                                *typ_addr = spec3 ;
                                break ;
                              case C_max :
                                cerror
                                  ( subtree ( 1 , lkid ) ,
/*LMSC*/"maximum delay respecified"
                                  ) ;
                                break ;
                              default :
                                break ;
                            }
                          break ;
                        default :
                          switch ( textofnode ( subtree ( 1 , lkid ) ) )
                            { case C_min :
                                cerror
                                  ( subtree ( 1 , lkid ) ,
/*LMSC*/"minimum delay respecified"
                                  ) ;
                                break ;
```

Copyright 1989
Logic Modeling Systems

| SOURCE PROGRAM | DATE | PAGE # |
|---|---|---|
| shellswm/walk_4.c | 5/23/89 | 7/83 |
| | TIME 4:42:27 pm | |

LINE # SOURCE TEXT

```
                              case C_typ :
                                *typ_addr = spec3 ;
                                break ;
                              case C_max :
                                *max_addr = spec3 ;
                                break ;
                              default :
                                break ;
                          }
                        break ;
                    }
                  break ;
                case C_typ :
                  *typ_addr = spec1 ;
                  switch ( textofnode ( subtree ( 1 , kid ) ) )
                    { case C_min :
                        *min_addr = spec2 ;
                        switch ( textofnode ( subtree ( 1 , lkid ) ) )
                          { case C_min :
                              cerror
                                ( subtree ( 1 , kid ) ,
/*LMSG*/"minimum delay respecified"
                                ) ;
                              break ;
                            case C_typ :
                              cerror
                                ( subtree ( 1 , kid ) ,
/*LMSG*/"typical delay respecified"
                                ) ;
                              break ;
                            case C_max :
                              *max_addr = spec3 ;
                              break ;
                            default :
                              break ;
                          }
                        break ;
                      case C_typ :
                        cerror
                          ( subtree ( 1 , kid ) ,
/*LMSG*/"typical delay respecified"
                          ) ;
                        switch ( textofnode ( subtree ( 1 , lkid ) ) )
                          { case C_min :
                              *min_addr = spec3 ;
                              break ;
                            case C_typ :
                              cerror
                                ( subtree ( 1 , lkid ) ,
/*LMSG*/"typical delay respecified"
                                ) ;
                              break ;
                            case C_max :
                              *max_addr = spec3 ;
                              break ;
                            default :
                              break ;
                          }
                        break ;
                      case C_max :
                        *max_addr = spec2 ;
                        switch ( textofnode ( subtree ( 1 , lkid ) ) )
                          { case C_min :
                              *min_addr = spec3 ;
                              break ;
                            case C_typ :
                              cerror
                                ( subtree ( 1 , lkid ) ,
/*LMSG*/"typical delay respecified"
                                ) ;
                              break ;
                            case C_max :
                              cerror
                                ( subtree ( 1 , lkid ) ,
/*LMSG*/"maximum delay respecified"
                                ) ;
                              break ;
                            default :
                              break ;
                          }
                        break ;
                      default :
                        switch ( textofnode ( subtree ( 1 , lkid ) ) )
                          { case C_min :
                              *min_addr = spec3 ;
                              break ;
                            case C_typ :
                              cerror
                                ( subtree ( 1 , lkid ) ,
/*LMSG*/"typical delay respecified"
                                ) ;
                              break ;
                            case C_max :
                              *max_addr = spec3 ;
                              break ;
                            default :
                              break ;
                          }
                        break ;
                    }
                  break ;
                case C_max :
                  *max_addr = spec1 ;
                  switch ( textofnode ( subtree ( 1 , kid ) ) )
                    { case C_min :
                        *min_addr = spec2 ;
                        switch ( textofnode ( subtree ( 1 , lkid ) ) )
                          { case C_min :
                              cerror
                                ( subtree ( 1 , kid ) ,
/*LMSG*/"minimum delay respecified"
                                ) ;
                              break ;
                            case C_typ :
                              *typ_addr = spec3 ;
                              break ;
                            case C_max :
                              cerror
                                ( subtree ( 1 , kid ) ,
/*LMSG*/"maximum delay respecified"
```

Copyright 1989 Logic Modeling Systems

SOURCE PROGRAM shellswm/walk_4.c | DATE 5/23/89 | TIME 4:42:27 pm | PAGE # 8/84

LINE # SOURCE TEXT

```
                          ) ;
                        break ;
                      default :
                        break ;
                    }
                  break ;
                case C_typ :
                  *typ_addr = spec2 ;
                  switch ( textofnode ( subtree ( 1 , lkid ) ) )
                    { case C_min :
                        *min_addr = spec3 ;
                        break ;
                      case C_typ :
                        cerror
                          ( subtree ( 1 , lkid ) ,
/*LMSG*/"typical delay respecified"
                          ) ;
                        break ;
                      case C_max :
                        cerror
                          ( subtree ( 1 , lkid ) ,
/*LMSG*/"maximum delay respecified"
                          ) ;
                        break ;
                      default :
                        break ;
                    }
                  break ;
                case C_max :
                  cerror
                    ( subtree ( 1 , kid ) ,
/*LMSG*/"maximum delay respecified"
                    ) ;
                  switch ( textofnode ( subtree ( 1 , lkid ) ) )
                    { case C_min :
                        *min_addr = spec3 ;
                        break ;
                      case C_typ :
                        *typ_addr = spec3 ;
                        break ;
                      case C_max :
                        cerror
                          ( subtree ( 1 , lkid ) ,
/*LMSG*/"maximum delay respecified"
                          ) ;
                        break ;
                      default :
                        break ;
                    }
                  break ;
                default :
                  switch ( textofnode ( subtree ( 1 , lkid ) ) )
                    { case C_min :
                        *min_addr = spec3 ;
                        break ;
                      case C_typ :
                        *typ_addr = spec3 ;
                        break ;
                      case C_max :
                        cerror
                          ( subtree ( 1 , lkid ) ,
/*LMSG*/"maximum delay respecified"
                          ) ;
                        break ;
                      default :
                        break ;
                    }
                  break ;
              }
            break ;
          default :
            switch ( textofnode ( subtree ( 1 , kid ) ) )
              { case C_min :
                  *min_addr = spec2 ;
                  switch ( textofnode ( subtree ( 1 , lkid ) ) )
                    { case C_min :
                        cerror
                          ( subtree ( 1 , kid ) ,
/*LMSG*/"minimum delay respecified"
                          ) ;
                        break ;
                      case C_typ :
                        *typ_addr = spec3 ;
                        break ;
                      case C_max :
                        *max_addr = spec3 ;
                        break ;
                      default :
                        break ;
                    }
                  break ;
                case C_typ :
                  *typ_addr = spec2 ;
                  switch ( textofnode ( subtree ( 1 , lkid ) ) )
                    { case C_min :
                        *min_addr = spec3 ;
                        break ;
                      case C_typ :
                        cerror
                          ( subtree ( 1 , lkid ) ,
/*LMSG*/"typical delay respecified"
                          ) ;
                        break ;
                      case C_max :
                        *max_addr = spec3 ;
                        break ;
                      default :
                        break ;
                    }
                  break ;
                case C_max :
                  *max_addr = spec2 ;
                  switch ( textofnode ( subtree ( 1 , lkid ) ) )
                    { case C_min :
                        *min_addr = spec3 ;
                        break ;
                      case C_typ :
                        *typ_addr = spec3 ;
                        break ;
                      case C_max :
```

Copyright 1989 Logic Modeling Systems

SOURCE PROGRAM shellswm/walk_4.c | DATE 5/23/89 | TIME 4:42:27 pm | PAGE # 9/85

LINE # SOURCE TEXT

```
                                      cerror
                                        ( subtree ( 1 , lkid ) ,
/*LMSG*/"maximum delay respecified"
                                        ) ;
                                      break ;
                                    default :
                                      break ;
                                  }
                                break ;
                              default :
                                switch ( textofnode ( subtree ( 1 , lkid ) ) )
                                  { case C_min :
                                      *min_addr = spec3 ;
                                      break ;
                                    case C_typ :
                                      *typ_addr = spec3 ;
                                      break ;
                                    case C_max :
                                      *max_addr = spec3 ;
                                      break ;
                                    default :
                                      break ;
                                  }
                                break ;
                            }
                          break ;
                      }
                    else if ( has1 && has2 )
                      switch ( textofnode ( subtree ( 1 , fkid ) ) )
                        { case C_min :
                            *min_addr = spec1 ;
                            switch ( textofnode ( subtree ( 1 , kid ) ) )
                              { case C_min :
                                  cerror
                                    ( subtree ( 1 , kid ) ,
/*LMSG*/"minimum delay respecified"
                                    ) ;
                                  break ;
                                case C_typ :
                                  *typ_addr = spec2 ;
                                  *max_addr = spec3 ;
                                  break ;
                                case C_max :
                                  *max_addr = spec2 ;
                                  *typ_addr = spec3 ;
                                  break ;
                                default :
                                  break ;
                              }
                            break ;
                          case C_typ :
                            *typ_addr = spec1 ;
                            switch ( textofnode ( subtree ( 1 , kid ) ) )
                              { case C_min :
                                  *min_addr = spec2 ;
                                  *max_addr = spec3 ;
                                  break ;
                                case C_typ :
                                  cerror
                                    ( subtree ( 1 , kid ) ,
/*LMSG*/"typical delay respecified"
                                    ) ;
                                  break ;
                                case C_max :
                                  *max_addr = spec2 ;
                                  *min_addr = spec3 ;
                                  break ;
                                default :
                                  break ;
                              }
                            break ;
                          case C_max :
                            *max_addr = spec1 ;
                            switch ( textofnode ( subtree ( 1 , kid ) ) )
                              { case C_min :
                                  *min_addr = spec2 ;
                                  *typ_addr = spec3 ;
                                  break ;
                                case C_typ :
                                  *typ_addr = spec2 ;
                                  *min_addr = spec3 ;
                                  break ;
                                case C_max :
                                  cerror
                                    ( subtree ( 1 , kid ) ,
/*LMSG*/"maximum delay respecified"
                                    ) ;
                                  break ;
                                default :
                                  break ;
                              }
                            break ;
                          default :
                            switch ( textofnode ( subtree ( 1 , kid ) ) )
                              { case C_min :
                                  *min_addr = spec2 ;
                                  break ;
                                case C_typ :
                                  *typ_addr = spec2 ;
                                  break ;
                                case C_max :
                                  *max_addr = spec2 ;
                                  break ;
                                default :
                                  break ;
                              }
                            break ;
                        }
                    else if ( has2 && has3 )
                      switch ( textofnode ( subtree ( 1 , kid ) ) )
                        { case C_min :
                            *min_addr = spec2 ;
                            switch ( textofnode ( subtree ( 1 , lkid ) ) )
                              { case C_min :
                                  cerror
                                    ( subtree ( 1 , lkid ) ,
/*LMSG*/"minimum delay respecified"
                                    ) ;
                                  break ;
                                case C_typ :
```

Copyright 1989 Logic Modeling Systems

| SOURCE PROGRAM | DATE | TIME | PAGE # |
|---|---|---|---|
| shellswm/walk_4.c | 5/23/89 | 4:42:27 pm | 10/86 |

LINE # SOURCE TEXT

```
                        *typ_addr = spec3 ;
                        *max_addr = spec1 ;
                        break ;
                     case C_max :
                        *max_addr = spec3 ;
                        *typ_addr = spec1 ;
                        break ;
                     default :
                        break ;
                  }
               break ;
            case C_typ :
               *typ_addr = spec2 ;
               switch ( textofnode ( subtree ( 1 , lkid ) ) )
                  { case C_min :
                        *min_addr = spec3 ;
                        *max_addr = spec1 ;
                        break ;
                     case C_typ :
                        cerror
                          ( subtree ( 1 , lkid ) ,
/*LMSC*/"typical delay respecified"
                          ) ;
                        break ;
                     case C_max :
                        *max_addr = spec3 ;
                        *min_addr = spec1 ;
                        break ;
                     default :
                        break ;
                  }
               break ;
            case C_max :
               *max_addr = spec2 ;
               switch ( textofnode ( subtree ( 1 , lkid ) ) )
                  { case C_min :
                        *min_addr = spec3 ;
                        *typ_addr = spec1 ;
                        break ;
                     case C_typ :
                        *typ_addr = spec3 ;
                        *min_addr = spec1 ;
                        break ;
                     case C_max :
                        cerror
                          ( subtree ( 1 , lkid ) ,
/*LMSC*/"maximum delay respecified"
                          ) ;
                        break ;
                     default :
                        break ;
                  }
               break ;
            default :
               switch ( textofnode ( subtree ( 1 , lkid ) ) )
                  { case C_min :
                        *min_addr = spec3 ;
                        break ;
                     case C_typ :
                        *typ_addr = spec3 ;
                        break ;
                     case C_max :
                        *max_addr = spec3 ;
                        break ;
                     default :
                        break ;
                  }
               break ;
         }
      else if ( has1 && has3 )
         switch ( textofnode ( subtree ( 1 , fkid ) ) )
            { case C_min :
                  *min_addr = spec1 ;
                  switch ( textofnode ( subtree ( 1 , lkid ) ) )
                     { case C_min :
                           cerror
                             ( subtree ( 1 , lkid ) ,
/*LMSC*/"minimum delay respecified"
                             ) ;
                           break ;
                        case C_typ :
                           *typ_addr = spec3 ;
                           *max_addr = spec2 ;
                           break ;
                        case C_max :
                           *max_addr = spec3 ;
                           *typ_addr = spec2 ;
                           break ;
                        default :
                           break ;
                     }
                  break ;
               case C_typ :
                  *typ_addr = spec1 ;
                  switch ( textofnode ( subtree ( 1 , lkid ) ) )
                     { case C_min :
                           *min_addr = spec3 ;
                           *max_addr = spec2 ;
                           break ;
                        case C_typ :
                           cerror
                             ( subtree ( 1 , lkid ) ,
/*LMSC*/"typical delay respecified"
                             ) ;
                           break ;
                        case C_max :
                           *max_addr = spec3 ;
                           *min_addr = spec2 ;
                           break ;
                        default :
                           break ;
                     }
                  break ;
               case C_max :
                  *max_addr = spec1 ;
                  switch ( textofnode ( subtree ( 1 , lkid ) ) )
                     { case C_min :
                           *min_addr = spec3 ;
                           *typ_addr = spec2 ;
                           break ;
```

Copyright 1989
Logic Modeling Systems

LINE # SOURCE TEXT

```
                    case C_typ :
                      *typ_addr = spec3 ;
                      *min_addr = spec2 ;
                      break ;
                    case C_max :
                      cerror
                        ( subtree ( 1 , lkid ) ,
/*LMSC*/"maximum delay respecified"
                        ) ;
                      break ;
                    default :
                      break ;
                  }
                break ;
              default :
                switch ( textofnode ( subtree ( 1 , lkid ) ) )
                  { case C_min :
                      *min_addr = spec3 ;
                      break ;
                    case C_typ :
                      *typ_addr = spec3 ;
                      break ;
                    case C_max :
                      *max_addr = spec3 ;
                      break ;
                    default :
                      break ;
                  }
                break ;
            }
          else if ( has1 )
            cerror
              ( subtree ( 1 , fkid ) ,
/*LMSC*/"ambiguous delay specification"
              ) ;
          else if ( has2 )
            cerror
              ( subtree ( 1 , kid ) ,
/*LMSC*/"ambiguous delay specification"
              ) ;
          else if ( has3 )
            cerror
              ( subtree ( 1 , lkid ) ,
/*LMSC*/"ambiguous delay specification"
              ) ;
          else
            { *min_addr = spec1 ;
              *typ_addr = spec2 ;
              *max_addr = spec3 ;
            }
          break ;
        default :
          lm_Herror
            ( 1 ,
/*LMSC*/"internal error: process_timing: bad kidcount"
            ) ;
          break ;
      }
    if ( *min_addr != -1 )
      { if ( *typ_addr != -1 && *min_addr > *typ_addr )
          cerror
            ( T ,
/*LMSC*/"minimum time more than typical time"
            ) ;
        if ( *max_addr != -1 && *min_addr > *max_addr )
          cerror
            ( T ,
/*LMSC*/"minimum time more than maximum time"
            ) ;
      }
    if ( *typ_addr != -1 && *max_addr != -1 && *typ_addr > *max_addr )
      cerror
        ( T ,
/*LMSC*/"typical time more than maximum time"
        ) ;
    tr_exit ( T ) ;
  } /* process_timing */

static void
add_delay
  ( pin ,
    maj_st ,
    min_st ,
    pin_name ,
    timing
  )
  ushort pin ;
  symbol
    maj_st ,
    min_st ,
    pin_name ;
  tree timing ;
  /* adds a timing structure to the list for the passed pin with passed info */
  { struct timing
      *list ,
      *delay ;
    delay = allo_timing ( ) ;
    delay -> major_state = maj_st ;
    delay -> minor_state = min_st ;
    delay -> minor_pin_name = pin_name ;
    delay -> next = NULL ;
    process_timing
      ( timing ,
        & delay -> minimum ,
        & delay -> typical ,
        & delay -> maximum
      ) ;
    if ( ( list = the -> pins [ pin ] . timing_list ) == NULL )
      the -> pins [ pin ] . timing_list = delay ;
    else
      { do
          if
            ( list -> major_state == maj_st &&
              list -> minor_state == min_st &&
              list -> minor_pin_name == pin_name
            )
            cerror
              ( subtree ( 1 , subtree ( 1 , timing ) ) ,
/*LMSC*/"duplicate delay specification"
              ) ;
```

Copyright 1989 Logic Modeling Systems

LINE # SOURCE TEXT

```
          while ( list -> next != NULL && ( list = list -> next , 1 ) ) ;
          list -> next = delay ;
        }
  } /* add_delay */

static v..._
build_delays ( from , state , text , timing )
  tree
    from ,
    state ,
    timing ;
  symbol text ;
  /* builds the list of delay specs passed via add_delay() */
  { ushort
      i ,
      k ,
      kids ,
      pin ,
      num1 ,
      num2 ;
    symbol
      maj_st ,
      min_st ,
      text2 ;
    tree
      kid2 ,
      kid ;
    pin = pin_name_of ( text ) ;
    maj_st = textofnode ( state ) ;
    if ( from == NULLTREE )
      { add_delay
          ( pin ,
            maj_st ,
            NULLSYM ,
            NULLSYM ,
            timing
          ) ;
        return ;
      }
    min_st = textofnode ( subtree ( 1 , from ) ) ;
    kids = kidcount ( from ) ;
    for ( k = 2 ; k <= kids ; ++k )
      { kid = subtree ( k , from ) ;
        switch ( nameofnode ( kid ) )
          { case P_ID_ :
            case P_NUM_ :
              add_delay
                ( pin ,
                  maj_st ,
                  min_st ,
                  textofnode ( kid ) ,
                  timing
                ) ;
              break ;
            case P_STR_ :
/* what about generators in strings? */
              buf_string ( symtostr ( textofnode ( kid ) ) ) ;
              text2 = strtosym ( buf ) ;
              add_delay
                ( pin ,
                  maj_st ,
                  min_st ,
                  text2 ,
                  timing
                ) ;
              break ;
            case N_PIN_NAME :
              kid2 = subtree ( 1 , kid ) ;
              text2 = textofnode ( kid2 ) ;
              kid2 = subtree ( 2 , kid ) ;
              num1 =
                num2 =
                  dec_ration ( kid2 ) ;
              if ( kidcount ( kid ) == 3 )
                { kid2 = subtree ( 3 , kid ) ;
                  num2 = dec_ration ( kid2 ) ;
                }
              if ( num1 > num2 )
                for ( i = num1 ; ; --i )
                  { add_delay
                      ( pin ,
                        maj_st ,
                        min_st ,
                        gen_name ( text2 , i ) ,
                        timing
                      ) ;
                    if ( i == num2 )
                      break ;
                  }
              else
                for ( i = num1 ; ; ++i )
                  { add_delay
                      ( pin ,
                        maj_st ,
                        min_st ,
                        gen_name ( text2 , i ) ,
                        timing
                      ) ;
                    if ( i == num2 )
                      break ;
                  }
              break ;
            default :
              lm_Serror
                ( 1 ,
/*LMSG*/"internal error: build_delays: unknown node name: %s"
                  , symtostr ( nameofnode ( kid ) )
                ) ;
          }
      }
  } /* build_delays */

static void
do_outputs ( from , state , T , text , timing )
  tree
    from ,
    state ,
    T ,
    timing ;
  symbol text ;
```

Copyright 1989
Logic Modeling Systems

LINE # SOURCE TEXT

```
  /* check that text is an output or I/O, then call build_delays() */
  { tree look ;
    look = g_lookup ( text ) ;
    if ( look == NULLTREE )
      { cerror
          ( T ,
/*LMSG*/"no such device signal name: %s"
            , symtostr ( text )
          ) ;
        return ;
      }
    else
      switch ( nameofnode ( look ) )
        { case N_IN_PINS :
          case N_POWER_PINS :
          case N_GROUND_PINS :
          case N_NC_PINS :
            cerror
              ( T ,
/*LMSG*/"device signal name %s is not an out_pin or io_pin"
                , symtostr ( text )
              ) ;
            return ;
          case N_OUT_PINS :
          case N_IO_PINS :
            break ;
          default :
            cerror
              ( T ,
/*LMSG*/"%s is not a device signal name"
                , symtostr ( text )
              ) ;
            return ;
        }
    build_delays
      ( from ,
        state ,
        text ,
        timing
      ) ;
  } /* do_outputs */

ushort
is_store_or_eval ( text )
  symbol text ;
  /* returns 1 iff the passed pin name is a store or eval pin */
  { ushort
      i ,
      ndex ;
    ndex = pin_name_of ( text ) ;
    for ( i = 0 ; i < the -> pins [ ndex ] . num_attrs ; ++i )
      if ( the -> pins [ ndex ] . attr [ i ] . use_flag == ID_ATTR )
        { text = the -> pins [ ndex ] . attr [ i ] . attr . id ;
          if
            ( text == C_eval ||
              text == C_store ||
              text == C_edge_rise ||
              text == C_edge_fall
            )
            return 1 ;
        }
    return 0 ;
  } /* is_store_or_eval */

static ushort
do_stores ( T , text )
  tree T ;
  symbol text ;
  /* makes sure the passed pin name is an in or I/O, and a store or eval */
  /* returns 1 iff the passed pin name is okay */
  { tree look ;
    look = g_lookup ( text ) ;
    if ( look == NULLTREE )
      { cerror
          ( T ,
/*LMSG*/"no such device signal name: %s"
            , symtostr ( text )
          ) ;
        return 0 ;
      }
    else
      switch ( nameofnode ( look ) )
        { case N_IN_PINS :
          case N_IO_PINS :
            if ( ! is_store_or_eval ( text ) )
              { cerror
                  ( T ,
/*LMSG*/"device signal name %s is not a store or eval pin"
                    , symtostr ( text )
                  ) ;
                return 0 ;
              }
            break ;
          case N_OUT_PINS :
          case N_POWER_PINS :
          case N_GROUND_PINS :
          case N_NC_PINS :
            cerror
              ( T ,
/*LMSG*/"device signal name %s is not an in_pin or io_pin"
                , symtostr ( text )
              ) ;
            return 0 ;
          default :
            cerror
              ( T ,
/*LMSG*/"%s is not a device signal name"
                , symtostr ( text )
              ) ;
            return 0 ;
        }
    return 1 ;
  } /* do_stores */

static void
check_outputs ( from , state , T , timing )
  tree
    from ,
    state ,
    T ,
```

Copyright 1989
Logic Modeling Systems

| SOURCE PROGRAM | DATE | TIME | PAGE # |
|---|---|---|---|
| shellswm/walk_4.c | 5/23/89 | 4:42:27 pm | 14/90 |

SOURCE TEXT

```
      timing ;
    /* makes sure the passed pins in T are all outputs */
    /* continues processing via do_outputs() */
    { ushort
        i ,
        num1 /*= 0*/ ,
        num2 /*= 0*/ ;
      symbol text ;
      tree kid ;
      ( void ) do_pin_name ( T ) ;
      switch ( nameofnode ( T ) )
        { case P_ID_ :
          case P_NUM_ :
            do_outputs
              ( from ,
                state ,
                T ,
                textofnode ( T ) ,
                timing
              ) ;
            break ;
          case P_STR_ :
  /* what about generators in strings? */
            buf_string ( symtostr ( textofnode ( T ) ) ) ;
            text = strtosym ( buf ) ;
            do_outputs
              ( from ,
                state ,
                T ,
                text ,
                timing
              ) ;
            break ;
          case N_PIN_NAME :
            kid = subtree ( 1 , T ) ;
            text = textofnode ( kid ) ;
            kid = subtree ( 2 , T ) ;
            num1 =
              num2 =
                dec_ration ( kid ) ;
            if ( kidcount ( T ) == 3 )
              { kid = subtree ( 3 , T ) ;
                num2 = dec_ration ( kid ) ;
              }
            if ( num1 > num2 )
              for ( i = num1 ; ; --i )
                { do_outputs
                    ( from ,
                      state ,
                      T ,
                      gen_name ( text , i ) ,
                      timing
                    ) ;
                  if ( i == num2 )
                    break ;
                }
            else
              for ( i = num1 ; ; ++i )
                { do_outputs
                    ( from ,
                      state ,
                      T ,
                      gen_name ( text , i ) ,
                      timing
                    ) ;
                  if ( i == num2 )
                    break ;
                }
            break ;
          default :
            cerror
              ( T ,
 /*LMSG*/"internal error: check_outputs: unknown node name: %s"
                , symtostr ( nameofnode ( T ) )
              ) ;
            break ;
        }
    } /* check_outputs */

 static void
 check_stores ( T )
   tree T ;
   /* makes sure the passed pins in T are all stores */
   /* continues processing via do_stores() */
   { ushort
       i ,
       num1 /*= 0*/ ,
       num2 /*= 0*/ ;
     symbol text ;
     tree kid ;
     ( void ) do_pin_name ( T ) ;
     switch ( nameofnode ( T ) )
       { case P_ID_ :
         case P_NUM_ :
           ( void ) do_stores ( T , textofnode ( T ) ) ;
           break ;
         case P_STR_ :
 /* what about generators in strings? */
           buf_string ( symtostr ( textofnode ( T ) ) ) ;
           text = strtosym ( buf ) ;
           ( void ) do_stores ( T , text ) ;
           break ;
         case N_PIN_NAME :
           kid = subtree ( 1 , T ) ;
           text = textofnode ( kid ) ;
           kid = subtree ( 2 , T ) ;
           num1 =
             num2 =
               dec_ration ( kid ) ;
           if ( kidcount ( T ) == 3 )
             { kid = subtree ( 3 , T ) ;
               num2 = dec_ration ( kid ) ;
             }
           if ( num1 > num2 )
             for ( i = num1 ; ; --i )
               { ( void ) do_stores ( T , gen_name ( text , i ) ) ;
                 if ( i == num2 )
                   break ;
               }
           else
```

Copyright 1989 Logic Modeling Systems

LINE # SOURCE TEXT

```
            for ( i = num1 ; ; ++i )
              { ( void ) do_stores ( T , gen_name ( text , i ) ) ;
                if ( i == num2 )
                  break ;
              }
            break ;
          default :
            cerror
              ( T ,
/*LMSG*/"internal error: check_stores: unknown node name: %s"
                , symtostr ( nameofnode ( T ) )
              ) ;
            break ;
        }
  } /* check_stores */

static void
do_to_pinstate ( from , T , timing )
  tree
    from ,
    T ,
    timing ;
  /* checks the to pinstate and its pins via check_outputs() */
  { ushort
      k ,
      kids ;
    tr_entry ( T ) ;
    check_state ( subtree ( 1 , T ) ) ;
    kids = kidcount ( T ) ;
    for ( k = 2 ; k <= kids ; ++k )
      check_outputs
        ( from ,
          subtree ( 1 , T ) ,
          subtree ( k , T ) ,
          timing
        ) ;
    tr_exit ( T ) ;
  } /* do_to_pinstate */

static void
do_from_pinstate ( T )
  tree T ;
  /* checks the from pinstate and its pins via check_stores() */
  { ushort
      k ,
      kids ;
    symbol text ;
    tr_entry ( T ) ;
    check_state ( subtree ( 1 , T ) ) ;
    text = textofnode ( subtree ( 1, T ) ) ;
    if ( text == C_float || text == C_any )
      cerror
        ( subtree ( 1, T ) ,
/*LMSG*/"illegal delay from-pin state: %s (must not be float or any)"
          , symtostr ( text )
        ) ;
    kids = kidcount ( T ) ;
    for ( k = 2 ; k <= kids ; ++k )
      check_stores ( subtree ( k , T ) ) ;
    tr_exit ( T ) ;
  } /* do_from_pinstate */

static void
do_to_delay ( from , T )
  tree
    from ,
    T ;
  /* processes the to-delay construct via do_to_pinstate() */
  { ushort kids ;
    tr_entry ( T ) ;
    kids = kidcount ( T ) ;
    do_to_pinstate
      ( from ,
        subtree ( 1 , T ) ,
        subtree ( kids , T )
      ) ;
    tr_exit ( T ) ;
  } /* do_to_delay */

static void
do_from_delay ( T )
  tree T ;
  /* processes the from-delay construct via do_to_delay() */
  { ushort
      k ,
      kids ,
    tr_entry ( T ) ;
    do_from_pinstate ( subtree ( 1 , T ) ) ;
    kids = kidcount ( T ) ;
    for ( k = 2 ; k <= kids ; ++k )
      do_to_delay ( subtree ( 1 , T ) , subtree ( k , T ) ) ;
    tr_exit ( T ) ;
  } /* do_from_delay */

/* end of timing specification handling code */

/* start of trace delay handling code */

static void
do_trace_delays ( T )
  tree T ;
  { ushort
      k ,
      kids ,
      num ,
      td_seen = 0 ;
    tree
      fkid ,
      attr ,
      delay ;
    symbol name ;
    double val ;
    tr_entry ( T ) ;
    kids = kidcount ( T ) ;
    for ( k = 3 ; k <= kids ; ++k )
      { attr = subtree ( k , T ) ;
        switch ( nameofnode ( attr ) )
          { case P_ID_ :
              cerror
                ( attr ,
```

Copyright 1989 Logic Modeling Systems

SOURCE PROGRAM shellswm/walk_4.c | DATE 5/23/89 | TIME 4:42:27 pm | PAGE # 16/92

LINE # SOURCE TEXT

```
/*LMSG*/"illegal adapter pin attribute: %s"
                    , symtostr ( textofnode ( attr ) )
                  ) ;
                break ;
              case N_ATTR :
                if
                  ( scompare
                      ( textofnode ( subtree ( 1 , attr ) ) ,
                        C_trace_delay
                      )
                  )
                  { set_text ( subtree ( 1 , attr ) , C_trace_delay ) ;
                    if ( td_seen )
                      cerror
                        ( subtree ( 1 , attr ) ,
/*LMSG*/"trace_delay adapter pin attribute respecified"
                        ) ;
                    else
                      { delay = subtree ( 2 , attr ) ;
                        if ( nameofnode ( delay ) == P_ID_ )
                          cerror
                            ( delay ,
/*LMSG*/"trace_delay value is not numeric: %s"
                              , symtostr ( textofnode ( delay ) )
                            ) ;
                        else
                          { while
                              ( nameofnode ( delay ) == N_NEGATIVE &&
                                nameofnode ( subtree ( 1 , delay ) ) == N_NEGATIVE
                              )
                              delay = subtree ( 1 , subtree ( 1 , delay ) ) ;
                            if ( nameofnode ( delay ) == N_NEGATIVE )
                              cerror
                                ( delay ,
/*LMSG*/"negative trace_delay values illegal"
                                ) ;
                            else
                              { val = check_num ( delay ) ;
                                if ( val > 65 )
                                  cerror
                                    ( delay ,
/*LMSG*/"trace_delay value too large: %s (must be no more than 65)"
                                      , symtostr ( textofnode ( delay ) )
                                    ) ;
                                else
                                  { fkid = subtree ( 1 , T ) ;
                                    for
                                      ( td_seen = 1 ;
                                        td_seen <= kidcount ( fkid ) ;
                                        ++td_seen
                                      )
                                      { delay = subtree ( td_seen , fkid ) ;
                                        name = textofnode ( delay ) ;
                                        if
                                          ( ( name = apin_name_of ( name ) ) !=
                                          NULLSYM
                                          )
                                          if
                                            ( ( name = pin_number_of ( name ) ) !=
                                            NULLSYM
                                            )
                                            { num = pin_name_of ( name ) ;
ASSERT(num<MAX_PINS);
                                              the -> pirs [ num ] . trace_delay =
                                                val * 1000 + 0.5 ;
                                            }
                                      }
                                    td_seen = 1 ;
                                  }
                              }
                          }
                      }
                  }
                else
                  cerror
                    ( subtree ( 1 , attr ) ,
/*LMSG*/"illegal adapter pin attribute: %s (must be trace_delay)"
                      , symtostr ( textofnode ( subtree ( 1 , attr ) ) )
                    ) ;
                break ;
              default :
                cerror
                  ( attr ,
/*LMSG*/"internal error: bad adapter pin attribute"
                  ) ;
                break ;
          }
      }
    tr_exit ( T ) ;
  } /* do_trace_delays */

/* end of trace delay handling code */

/* start of pin name mapping handling code */

static void
do_pn_mapping ( T , parent )
  tree T   parent ;
  { ushort
      done1 ,
      done2 ,
      kids1 ,
      kids2 ,
      k1 ,
      k2 ,
      sub1 ,
      sub2 ,
      val1 ,
      val2 ,
      max1 ,
      max2 ,
      n ;
    tree
      kid1 ,
      kid2 ,
      names1 ,
      names2 ,
      slook ,
      plook ;
    symbol
```

Copyright 1989
Logic Modeling Systems

SOURCE PROGRAM shellswm/walk_4.c

DATE 5/23/89 TIME 4:42:27 pm

LINE # SOURCE TEXT

```
          text1 ,
          text2 ,
          device_signal_name ,
          simulator_pin_name ;
        tr_entry ( T ) ;
        names1 = subtree ( 1 , T ) ;
        tr_entry ( names1 ) ;
        kids1 = kidcount ( names1 ) ;
        tr_exit ( names1 ) ;
        names2 = subtree ( 2 , T ) ;
        tr_entry ( names2 ) ;
        kids2 = kidcount ( names2 ) ;
        tr_exit ( names2 ) ;
        done1 = done2 = 0 ;
        k1 = k2 = 0 ;
        sub1 = sub2 = 0 ;
        while ( ! done1 && ! done2 )
          { if ( ! sub1 || val1 == max1 )
              if ( k1 == kids1 )
                done1 = 1 ;
              else
                { ++k1 ;
                  sub1 = 0 ;
                }
            else
              val1 < max1 ? ++val1 : --val1 ;
            if ( ! sub2 || val2 == max2 )
              if ( k2 == kids2 )
                done2 = 1 ;
              else
                { ++k2 ;
                  sub2 = 0 ;
                }
            else
              val2 < max2 ? ++val2 : --val2 ;
            if ( ! done1 && ! done2 )
              { if ( sub1 )
                  simulator_pin_name = gen_name ( text1 , val1 ) ;
                else
                  { kid1 = subtree ( k1 , names1 ) ;
                    tr_entry ( kid1 ) ;
                    switch ( nameofnode ( kid1 ) )
                      { case P_ID_ :
                        case P_NUM_ :
                          simulator_pin_name = textofnode ( kid1 ) ;
                          break ;
                        case P_STR_ :
                          buf_string ( symtostr ( textofnode ( kid1 ) ) ) ;
                          simulator_pin_name = strtosym ( buf ) ;
                          break ;
                        case N_PIN_NAME :
                          sub1 = 1 ;
                          tr_entry ( subtree ( 1 , kid1 ) ) ;
                          text1 = textofnode ( subtree ( 1 , kid1 ) ) ;
                          tr_exit ( subtree ( 1 , kid1 ) ) ;
                          val1 = max1 = check_int ( subtree ( 2 , kid1 ) ) ;
                          if ( kidcount ( kid1 ) == 3 )
                            max1 = check_int ( subtree ( 3 , kid1 ) ) ;
                          simulator_pin_name = gen_name ( text1 , val1 ) ;
                          break ;
                        default :
                          cerror
                            ( kid1 ,
/*LMSG*/"internal error: bad simulator pin name"
                            ) ;
                          break ;
                      }
                    tr_exit ( kid1 ) ;
                  }
                if ( sub2 )
                  device_signal_name = gen_name ( text2 , val2 ) ;
                else
                  { kid2 = subtree ( k2 , names2 ) ;
                    tr_entry ( kid2 ) ;
                    switch ( nameofnode ( kid2 ) )
                      { case P_ID_ :
                        case P_NUM_ :
                          device_signal_name = textofnode ( kid2 ) ;
                          break ;
                        case P_STR_ :
                          buf_string ( symtostr ( textofnode ( kid2 ) ) ) ;
                          device_signal_name = strtosym ( buf ) ;
                          break ;
                        case N_PIN_NAME :
                          sub2 = 1 ;
                          tr_entry ( subtree ( 1 , kid2 ) ) ;
                          text2 = textofnode ( subtree ( 1 , kid2 ) ) ;
                          tr_exit ( subtree ( 1 , kid2 ) ) ;
                          val2 = max2 = check_int ( subtree ( 2 , kid2 ) ) ;
                          if ( kidcount ( kid2 ) == 3 )
                            max2 = check_int ( subtree ( 3 , kid2 ) ) ;
                          device_signal_name = gen_name ( text2 , val2 ) ;
                          break ;
                        default :
                          cerror
                            ( kid2 ,
/*LMSG*/"internal error: bad device signal name"
                            ) ;
                          break ;
                      }
                    tr_exit ( kid2 ) ;
                  }
                slook = q_lookup ( device_signal_name ) ;
                if
                  ( slook == NULLTREE ||
                    nameofnode ( slook ) != N_IN_PINS &&
                    nameofnode ( slook ) != N_IO_PINS &&
                    nameofnode ( slook ) != N_NC_PINS &&
                    nameofnode ( slook ) != N_OUT_PINS &&
                    nameofnode ( slook ) != N_POWER_PINS &&
                    nameofnode ( slook ) != N_GROUND_PINS
                  )
                  cerror
                    ( kid2 ,
/*LMSG*/"no such device signal name: %s"
                      , symtostr ( device_signal_name )
                    ) ;
                else
                  { n = pin_name_of ( device_signal_name ) ;
                    plook = l_lookup ( simulator_pin_name ) ;
```

Copyright 1989 Logic Modeling Systems

LINE # SOURCE TEXT

```
                if ( plook != NULLTREE && nameofnode ( plook ) == N_PIN_MAP )
                  cerror
                    ( kidl ,
/*LMSC*/"simulator pin name %s redeclared"
                      , symtost'  ' 'imulator_pin_name )
                    ) ;
                else if ( the -> pins [ n ] . alias != NULLSYM )
                  cerror
                    ( kidl ,
/*LMSC*/"pin name mapping for device signal name %s respecified: %s"
                      , symtostr ( device_signal_name ) ,
                      symtostr ( simulator_pin_name )
                    ) ;
                else
                  { l_declare ( simulator_pin_name , parent ) ;
                    the -> pins [ n ] . alias = simulator_pin_name ;
                  }
              }
          }
      }
    if ( ! done1 )
      cerror
        ( names2 ,
/*LMSC*/"fewer device signal names than simulator pin names"
        ) ;
    else if ( ! done2 )
      cerror
        ( names1 ,
/*LMSC*/"fewer simulator pin names than device signal names"
        ) ;
    tr_exit ( T ) ;
  } /* do_pn_mapping */

/* end of pin name mapping handling code */

void
walk_4 ( T )
  tree T ;
  /* the constrainers fourth and final walk */
  { ushort
      k ,
      kids ,
      len ,
      is ,
      pre_len ,
      post_len ;
    tr_entry ( T ) ;
    kids = kidcount ( T ) ;
    switch ( nameofnode ( T ) )
      { case N_INITIALIZE :
          k = 1 ;
          if ( the -> pre_seq_length == 0 && the -> fb_seq_length == 0 )
            { do_reset_seq
                ( subtree ( 1 , T ) ,
                  & the -> rise_fb ,
                  & the -> pre_seq_length ,
                  & the -> fb_seq_length ,
                  & the -> post_seq_length
                ) ;
              if ( the -> fb_seq_length && ! the -> has_feedback_pins )
                cerror
                  ( subtree ( 1 , subtree ( 1 , T ) ) ,
/*LMSC*/"must have a feedback signal to use feedback sequences"
                  ) ;
              if ( ! the -> fb_seq_length && the -> has_feedback_pins )
                cerror
                  ( subtree ( 1 , subtree ( 1 , T ) ) ,
/*LMSC*/"must use a feedback sequence to have a feedback signal"
                  ) ;
              ++k ;
            }
          for ( ; k <= kids ; ++k )
            { do_reset_seq
                ( subtree ( k ,T ) ,
                  & is ,
                  & pre_len ,
                  & len ,
                  & post_len
                ) ;
              if
                ( /*pre_len &&
                  the -> pre_seq_length &&*/
                  pre_len != the -> pre_seq_length
                )
                { buf_instead ( pre_len , the -> pre_seq_length ) ;
                  cerror
                    ( subtree ( 1 , subtree ( k , T ) ) ,
/*LMSC*/"pre-feedback initialization sequence length mismatch: %s"
                      , buf
                    ) ;
                }
              if
                ( /*len && the -> fb_seq_length &&*/
                  len != the -> fb_seq_length
                )
                { buf_instead ( len , the -> fb_seq_length ) ;
                  cerror
                    ( subtree ( 1 , subtree ( k , T ) ) ,
/*LMSC*/"feedback sequence length mismatch: %s"
                      , buf
                    ) ;
                }
              if ( len && the -> fb_seq_length && is != the -> rise_fb )
                cerror
                  ( subtree ( 1 , subtree ( k , T ) ) ,
/*LMSC*/"feedback condition mismatch: %s (all feedback conditions must be the same)"
                    , symtostr ( ( symbol ) ( is ? C_rise : C_fall ) )
                  ) ;
              if
                ( /*post_len && the -> post_seq_length &&*/
                  post_len != the -> post_seq_length
                )
                { buf_instead ( post_len , the -> post_seq_length ) ;
                  cerror
                    ( subtree ( 1 , subtree ( k , T ) ) ,
/*LMSC*/"post-feedback initialization sequence length mismatch: %s"
                      , buf
                    ) ;
                }
            }
```

Copyright 1989
Logic Modeling Systems

| SOURCE PROGRAM | DATE | TIME | PAGE # |
|---|---|---|---|
| shellswm/walk_4.c | 5/23/89 | 4:42:27 pm | 19/95 |

SOURCE TEXT

```
        break ;
      case N_DELAY :
        the -> delays_seen = 1 ;
        for ( k = 1 ; k <= kids ; ++k )
          do_from_delay ( subtree ( k , T ) ) ;
        break ;
      case N_ADAPTER :
        for ( k = 1 ; k <= kids ; ++k )
          do_trace_delays ( subtree ( k , T ) ) ;
        break ;
      case N_PIN_MAP :
        for ( k = 1 ; k <= kids ; ++k )
          do_ps_mapping ( subtree ( k , T ) , T ) ;
        break ;
      default : break ;
    }
  tr_exit ( T ) ;
 } /* walk_4 */

/* end of Constrainer (walk_4) for HDL Processor */
```

Copyright 1989 ... Modeling Systems

SOURCE PROGRAM shellswc/Pr_comm.c

DATE 5/23/89 TIME 1:21:06 pm PAGE # 1/1

SOURCE TEXT

```
/* SCCS_ID: Pr_comm.c rev 1.2, 5/3/89 at 15:45:04 */

/*
 *  Processor for HML COMMON PORTION
 */

# include <stdio.h>
# include "common.h"
# include "HML.h"
# include "strng.h"
# include "Rparse.h"
# include "trees.h"
# include "Rconst.h"
# include "device.h"

# define ERROR_MSG 1
# define WARNING_MSG 2

extern char *lexical_pass ( ) ;
extern void free_input ( ) ;
extern struct device *backend_pass ( ) ;

static char
  *progname , /* pointer to name of program */
  *input ; /* input file name */
static ushort
  lineno , /* source line number */
  errs , /* fatal error counter */
  c_flag , /* dump power/ground pins flag */
  d_flag , /* device print flag */
  g_flag , /* device statistics flag */
  l_flag , /* list grammar flag */
  m_flag , /* print mapping flag */
  n_flag , /* no write flag */
  p_flag , /* print tree flag */
  s_flag , /* string statistics flag */
  t_flag , /* trace constrainer flag */
  w_flag ; /* write device flag */

  /*VARARGS2*/
void
lm_Rerror ( err , format , arg , arg2 )
  ushort err ;
  char
    *format ,
    *arg ,
    *arg2 ;
  /* reports error indicated in format and arg to stderr */
  /* if global line number is nonzero, also prints file name, line number */
  /* increments global error count by err */
  { char errbuf [ 256 ] ;
/*  ( void ) sprintf ( errbuf , "%s: " , progname ) ;
*/  *errbuf = '\0' ;
    if ( lineno )
      { char num [ 12 ] ;
        ( void ) sprintf ( errbuf + strlen ( errbuf ) , "\"%s\", " , input ) ;
        ( void ) sprintf ( num , "%d" , lineno ) ;
        ( void ) sprintf ( errbuf + strlen ( errbuf ) , "line %s: " , num ) ;
      }
    ( void ) sprintf ( errbuf + strlen ( errbuf ) , format , arg , arg2 ) ;
    lm_queue_message ( ERROR_MSG , "%s" , errbuf ) ;
    errs += err ;
  } /* lm_Rerror */

  /*VARARGS2*/
void
lm_Rwarning ( format , arg , arg2 )
  char
    *format ,
    *arg ,
    *arg2 ;
  /* reports error indicated in format and arg to stderr */
  /* if global line number is nonzero, also prints file name, line number */
  /* increments global error count by err */
  { char errbuf [ 256 ] ;
/*  ( void ) sprintf ( errbuf , "%s: " , progname ) ;
*/  *errbuf = '\0' ;
    if ( lineno )
      { char num [ 12 ] ;
        ( void ) sprintf ( errbuf + strlen ( errbuf ) , "\"%s\", " , input ) ;
        ( void ) sprintf ( num , "%d" , lineno ) ;
        ( void ) sprintf ( errbuf + strlen ( errbuf ) , "line %s: " , num ) ;
        ( void ) sprintf ( errbuf + strlen ( errbuf ) , "warning: " ) ;
      }
    ( void ) sprintf ( errbuf + strlen ( errbuf ) , format , arg , arg2 ) ;
    lm_queue_message ( WARNING_MSG , "%s" , errbuf ) ;
  } /* lm_Rwarning */

ushort
lm_Rerrors ( )
  /* returns global error count */
  { return errs ;
  } /* lm_Rerrors */

static void
init_flags ( )
  { c_flag =
      d_flag =
      g_flag =
      l_flag =
      m_flag =
      n_flag =
      p_flag =
      s_flag =
      t_flag =
      w_flag =
        0 ;
  } /* init_flags */

void
lm_Rinit_vars ( name )
  char *name ;
  { progname = name ;
    input = "" ;
    lineno = 0 ;
    errs = 0 ;
    init_flags ( ) ;
  } /* lm_Rinit_vars */

void
```

Copyright 1989
Logic Modeling Systems

| SOURCE PROGRAM | DATE | PAGE # |
| --- | --- | --- |
| shellswc/Pr_comm.c | 5/23/89 | 2/2 |
| | TIME 1:21:06 pm | |

LINE # SOURCE TEXT

```
lm_Hset_c_flag ( )
  /* sets c_flag */
  { c_flag = 1 ;
  } /* lm_Hset_c_flag */

void
lm_Hset_d_flag ( )
  /* sets d_flag */
  { d_flag = 1 ;
  } /* lm_Hset_d_flag */

void
lm_Hset_g_flag ( )
  /* sets g_flag */
  { g_flag = 1 ;
  } /* lm_Hset_g_flag */

void
lm_Hset_l_flag ( )
  /* sets l_flag */
  { l_flag = 1 ;
  } /* lm_Hset_l_flag */

void
lm_Hset_m_flag ( )
  /* sets m_flag */
  { m_flag = 1 ;
  } /* lm_Hset_m_flag */

void
lm_Hset_n_flag ( )
  /* sets n_flag */
  { n_flag = 1 ;
  } /* lm_Hset_n_flag */

void
lm_Hset_p_flag ( )
  /* sets p_flag */
  { p_flag = 1 ;
  } /* lm_Hset_p_flag */

void
lm_Hset_s_flag ( )
  /* sets s_flag */
  { s_flag = 1 ;
  } /* lm_Hset_s_flag */

void
lm_Hset_t_flag ( )
  /* sets t_flag */
  { t_flag = 1 ;
  } /* lm_Hset_t_flag */

void
lm_Hset_w_flag ( )
  /* sets w_flag */
  { w_flag = 1 ;
  } /* lm_Hset_w_flag */

ushort
lm_Hc_flag_on ( )
  /* returns state of c_flag */
  { return c_flag ;
  } /* lm_Hc_flag_on */

ushort
lm_Hd_flag_on ( )
  /* returns state of d_flag */
  { return d_flag ;
  } /* lm_Hd_flag_on */

ushort
lm_Hg_flag_on ( )
  /* returns state of g_flag */
  { return g_flag ;
  } /* lm_Hg_flag_on */

ushort
lm_Hl_flag_on ( )
  /* returns state of l_flag */
  { return l_flag ;
  } /* lm_Hl_flag_on */

ushort
lm_Hm_flag_on ( )
  /* returns state of m_flag */
  { return m_flag ;
  } /* lm_Hm_flag_on */

ushort
lm_Hn_flag_on ( )
  /* returns state of n_flag */
  { return n_flag ;
  } /* lm_Hn_flag_on */

ushort
lm_Hp_flag_on ( )
  /* returns state of p_flag */
  { return p_flag ;
  } /* lm_Hp_flag_on */

ushort
lm_Hs_flag_on ( )
  /* returns state of s_flag */
  { return s_flag ;
  } /* lm_Hs_flag_on */

ushort
lm_Ht_flag_on ( )
  /* returns state of t_flag */
  { return t_flag ;
  } /* lm_Ht_flag_on */

ushort
lm_Hw_flag_on ( )
  /* returns state of w_flag */
  { return w_flag ;
  } /* lm_Hw_flag_on */

void
```

Copyright 1989 Logic Modeling Systems

| SOURCE PROGRAM | DATE | 5/23/89 | PAGE # |
|---|---|---|---|
| shellswc/Pr_comm.c | TIME | 1:21:06 pm | 3/3 |

LINE # SOURCE TEXT

```
lm_Eset_input ( str )
  char *str ;
  /* sets input file name to the passed string */
  /* you must not change the string's contents */
    input = str ;
  } /* lm_Eset_input */

char *
lm_Eget_input ( )
  /* returns input file name */
  { return input ;
  } /* lm_Eget_input */

void
lm_Eset_lineno ( num )
  ushort num ;
  /* sets global line number to passed number */
  { lineno = num ;
  } /* lm_Eset_lineno */

ushort
lm_Eget_lineno ( )
  /* returns global line number */
  { return lineno ;
  } /* lm_Eget_lineno */

/* end of Processor for EHDL, COMMON PORTION */
```

Copyright 1989
Logic Modeling Systems

SOURCE PROGRAM: diags/cpu.c | DATE: 5/23/89 | TIME: 4:41:13 pm | PAGE #: 1/1

LINE # | SOURCE TEXT

```
/* SCCS_ID: cpu.c rev 3.1, 4/24/89 at 07:48:20     */

/**********************************************************************
 *                                                                    *
 *      CPU routines                                                  *
 *                                                                    *
 **********************************************************************/

#include <math.h>
#include "common.h"
#include "lm_diags.h"
#include "vrtx.h"
#include "cpu.h"
#include "modeler_extn.h"

int hardware_reset(), flash();

cpu_diag_disp(parent_menu)
LM_DIAG_MENU *parent_menu;
{

        static LM_DIAG_MENU_ITEM menu_list[] =
        {
                {
                        "1",
                        "flash leds",
                        flash,
                        LM_DIAG_utility,
                        LM_DIAG_null,
                        0
                },
                {
                        "x",
                        "HARDWARE RESET",
                        hardware_reset,
                        LM_DIAG_utility,
                        LM_DIAG_null,
                        0
                },
        };

        static LM_DIAG_MENU menu =
        {
                "CPU UTILITIES",        /* not used */
                sizeof(menu_list) / sizeof(LM_DIAG_MENU_ITEM),
                0,
                menu_list
        };
        menu.title = parent_menu->
                menu_items[parent_menu->current_selection].menu_text;
        return lm_display_menu(&menu);
}

#define LEDS            0xe0
#define NEG_LEDS        0xc0

flash()
{
    register char *cr = (char *)CPU_MISC_CONTROL, startstate, nextstate;
    register long flag;
    register int delay;

    startstate = *cr & ~LEDS;
    for (delay = 500; delay > 0; delay = (2 * delay)/3) {
            for (flag = 0; flag <= 8; ++flag) {
                nextstate = startstate | (((flag << 5) & LEDS) ^ NEG_LEDS);
                *cr = nextstate;
                lm_delay(delay);
            }
    }
    return SUCCESS;
}

hardware_reset()
{
    lm_message("HARDWARE RESET...\n");
    lm_delay(100);
    ((cpu_control_reg_struct *)CPU_CONTROL_REG)->suicide = 1;
    /* See you later ...... */
    while(1)
        ;
}

set_fault_led()
{
    ((cpu_control_reg_struct *)CPU_CONTROL_REG)->fault_led = LED_ON;
}

clear_fault_led()
{
    ((cpu_control_reg_struct *)CPU_CONTROL_REG)->fault_led = LED_OFF;
}
```

Copyright 1989
Logic Modeling Systems

| SOURCE PROGRAM | DATE | PAGE # |
|---|---|---|
| diags/debugger.c | 5/23/89 | 1/2 |
| | TIME 4:41:13 pm | |

LINE # SOURCE TEXT

```
/* SCCS_ID: debugger.c rev 3.1, 4/24/89 at 07:48:22     */

#include "common.h"

#define is_hex_num(c)   ((c >= '0') && (c <= '9') \
                        || (c >= 'a') && (c <= 'f') \
                        || (c >= 'A') && (c <= 'F'))

#define ascii_to_hex_byte(c) ((((c) >= '0') && ((c) <= '9'))? \
        (char)((c) - '0'): (((c) >= 'a') && ((c) <= 'f'))? \
        (char)((c) + 10 - 'a'): (char)((c) + 10 - 'A'))

#define ctrl(c) ('c' & 0x1f)

debugger()
{
        char c;
        int (*start)();
        u_long accumulator = 0;
        u_long address = 0;
        int building_accum = 0;
        int line, l, lcount;
        char buffer[128];

        lm_banner("> ");
        while (1) {
                c = lm_get_key();
                if (is_hex_num(c)) {
                        lm_banner("%c", c);
                        if (building_accum++ == 0) {
                                lcount = 0;
                                accumulator = 0;
                        }
                        lcount++;
                        accumulator = (accumulator << 4) + ascii_to_hex_byte(c);
                        if (building_accum > 8) {
                                building_accum = 8;
                                sprintf(buffer, "\n%08x", accumulator);
                                lm_banner(buffer);
                        }
                } else if (c == '\b') {
                        if (lcount) {
                                lm_banner("\b \b");
                                --lcount;
                        }
                        if (building_accum) {
                                accumulator >>= 4;
                                --building_accum;
                        }
                } else {
                        if (c >= ' ') {
                                lm_banner("%c", c);
                        }
                        switch (c) {
                        case 'Q':
                        case 'q':
                                lm_banner("uit\n");
                                return;
                        case '\n':
                        case '\r':
                                lm_banner("\n");
                                break;
                        case 'l':
                                lm_banner("\n");
                                if (building_accum)
                                        address = accumulator;
                                break;
                        case 'm':
                                lm_banner("\n");
                                if (building_accum)
                                        address = accumulator;
                                for (line = 0; line < 20; ++line) {

                                        sprintf(buffer, "%08x:", address);
                                        lm_banner(buffer);
                                        for (l = 0; l < 8; ++l) {
                                                sprintf(buffer, " %04x",
                                                        *(u_short *)
                                                        address & 0xffff);
                                                lm_banner(buffer);
                                                address += 2;
                                        }
                                        lm_banner("\n");
                                }
                                break;
                        case 'r':
                                lm_banner("\n");
                                if (building_accum)
                                        address = accumulator;
                                sprintf(buffer, "%08x: %04x ",
                                        address,
                                        *(u_short *)
                                        address & 0xffff);
                                lm_banner(buffer);
                                break;
                        case 'w':
                                *(u_short *)address = accumulator;
                                building_accum = 0;
                                /* fall through */
                        case '+':
                                lm_banner("\n");
                                if (building_accum)
                                        address = accumulator;
                                else
                                        address += 2;
                                sprintf(buffer, "%08x: %04x ",
                                        address,
                                        *(u_short *)
                                        address & 0xffff);
                                lm_banner(buffer);
                                break;
                        case '-':
                                lm_banner("\n");
                                if (building_accum)
                                        address = accumulator;
                                else
                                        address -= 2;
                                sprintf(buffer, "%08x: %04x ",
                                        address,
                                        *(u_short *)
```

Copyright 1989 Logic Modeling Systems

SOURCE PROGRAM diags/debugger.c | DATE 5/23/89 | TIME 4:41:13 pm | PAGE # 2/3

SOURCE TEXT

```
                                        address & 0xffff);
                                lm_banner(buffer);
                                break;
                        case '?':
                        case 'h':
                                lm_banner("\n");
                                print_help();
                                break;
                        default:
                                lm_banner("%c?\n", ctrl(G));
                                break;
                        }
                        building_accum = 0;
                        lm_banner("> ");
                }
        }
}

static char *help_list[] = {
    "LM DIAGNOSTICS DEBUGGER COMMAND SUMMARY",
    "",
    "  <n>l  set current address to <n>",
    "  <n>m  display 320 bytes of memory from <n> or current address",
    "  <n>r  display memory word at <n> or current address",
    "  <n>w  write <n> to current address and increment",
    "  <n>+  display memory word at <n> or next address",
    "  <n>-  display memory word at <n> or previous address",
    "     q  quit debugger",
    "? or h  display help summary",
    0
};

static
print_help()
{
        char **c = help_list;
        char buffer[128];

        while (*c) {
                sprintf(buffer, "\t%s\n", *c++);
                lm_banner(buffer);
        }
}
```

Copyright 1989
Logic Modeling Systems

| SOURCE PROGRAM | DATE | PAGE # |
|---|---|---|
| diags/diag_bus.c | 5/23/89<br>TIME 4:41:14 pm | 1/4 |

LINE # SOURCE TEXT

```
/* SCCS_ID: diag_bus.c rev 3.1, 4/24/89 at 07:48:25     */

/*
** bus.c
** bus error handler
** It is more complicated than it needs to be,
** we need to use this to determine if a PAC
** is present...
*/
#include "common.h"
#include "cpu.h"
#include "cpu_vec.h"
#include "mod_err.h"
#include "nvram.h"
#include "lm_rd_wr.h"
#include "bus.h"
static char buf[ 200 ];
extern          bus_iar();
u_long setup_ivt_bus( );
extern u_short lm_nvram_access();
extern void reset_cpu();
void Bus_error_txa( );
void output_routine( );
u_short address_in_map();
static u_char *ignore_low_address;
static u_char *ignore_hi_address;
u_char ignore_mem_error;
static u_char mem_error;
static char debug_bus = 1;
/*
** Bus error handler
*/
diag_bus_error( )
{
        extern STACK_FRAME *bus_error_address;
        STACK_FRAME *stack_frame = bus_error_address;
        u_long err;
        int intr();
        extern u_long Diag_bus_err_addr;
        char buffer[80];

        if( address_in_map( stack_frame->address ) == SUCCESS)
        {
                if( ignore_mem_error == TRUE )
                    if( ignore_low_address >= stack_frame->address &&
                        ignore_hi_address <= stack_frame->address)
                    {
                            if(stack_frame->spec_status_word &  0x0100)
                            {
                                stack_frame->spec_status_word ^= 0x0100;
                                mem_error = TRUE;
                                return;
                            }
                    }
        }
        if(lm_nvram_access((char *) &stack_frame->address,
                BUS_ADDR, (u_long)SIZEOF_BUS_ADDR, MEMORY_WRITE,&err)==FAILURE)
        {
                reset_cpu(SUICIDE);
        }
        if(lm_nvram_access((char *) &stack_frame->spec_status_word,
                SSW_REG , (u_long)SIZEOF_SSW_REG, MEMORY_WRITE,&err)==FAILURE)
        {
                reset_cpu(SUICIDE);
        }
        /*
        ** we crashed
        */
        Diag_bus_err_addr = (int)(stack_frame->address);
        stack_frame->pc = (u_long)intr;
        stack_frame->vector = 0x0fff; /* pretend we got a 4 word stack frame */
}

#define BUS_ERR_VECT    *((int *)8)

install_diag_bus_error()
{
        int diag_bus_iar();

        BUS_ERR_VECT = (int)diag_bus_iar;
}
```

Copyright 1989
Logic Modeling Systems

| FILE | DATE | PAGE # |
|---|---|---|
| diags/diag_setjmp.s | 5/23/89 TIME 4:41:14 pm | 1/5 |

LINE # TEXT

```
| SCCS_ID: diag_setjmp.s rev 3.1, 4/24/89 at 07:48:27
        .text
        .globl  _diag_setjmp
_diag_setjmp:
        movl    sp@(4),a0
        movl    sp@(0),a0@
        movl    _lm_current_depth,a0@(4) | Vital menu state
        clrl    a0@(8)
        moveml  d2/d3/d4/d5/d6/d7/a2/a3/a4/a5/a6/a7,a0@(0xc)
        clrl    d0
        rts

        .globl  _diag_longjmp
_diag_longjmp:
        movl    sp@(4),a0
        movl    a0@(4),_lm_current_depth
        movl    sp@(8),d0
        bne     NOTZERO
        moveq   #1,d0
NOTZERO:
        movl    a0@,a1
        moveml  a0@(0xc),d2/d3/d4/d5/d6/d7/a2/a3/a4/a5/a6/a7
        addql   #4,sp
        jmp     a1@
```

Copyright 1989
Logic Modeling Systems

SOURCE PROGRAM: diags/fit.c | DATE: 5/23/89 | TIME: 4:41:14 pm | PAGE # 1/6

LINE # SOURCE TEXT

```
/* SCCS_ID: fit.c rev 3.1, 4/24/89 at 07:48:29     */

/**************************************************************************
 *      5/28/88                                                          *
 *      fit.c                                                            *
 *      Routine from Numerical Recipes in C                              *
 *      Calculates best fit line to data.                                *
 *                                                                       *
 *      Given a set of points x[1..mdata],y[1..mdata] with standard     *
 *      deviations sigy[1..mdata], fit them to a straight line          *
 *      y = a + bx by minimizing chi**2.  Returned are a, b, and their  *
 *      respective probable uncertainties siga and sigb, the            *
 *      chi-square chi2, and the goodness-of-fit probability q (that    *
 *      the fit would have chi**2 this large or larger).  If mwt = 0    *
 *      on input, then the standard deviations are assumed to be        *
 *      unavailable: q is returned as 1.0 and the normalization of      *
 *      chi2 is to unit standard deviation on all points.               *
 *      Note: y is the independent variable with error variance sigy    *
 *            and x is the dependent variable (known exactly).          *
 *                                                                       *
 *      Inputs:                                                          *
 *              x[1..mdata]: measured time delay                        *
 *              y[1..mdata]: threshold value                            *
 *              mdata: number of points                                 *
 *              sigy[1..mdata]: array of standard deviations            *
 *      Returns:                                                         *
 *              *a, *b: coeff of line y = a + bx                        *
 *              *siga, *sigb: probable uncertainties of a, b            *
 *              *chi2: chi square                                       *
 *              *q: goodness of fit                                     *
 *                                                                       *
 **************************************************************************/
#include <stdio.h>
#include <math.h>

static float sqrarg;
#define SQR(a) (sqrarg=(a),sqrarg*sqrarg)

/*ARGSUSED*/
void fit(x,y,mdata,sigy,mwt,a,b,siga,sigb,chi2,q)
float x[],y[],sigy[],*a,*b,*siga,*sigb,*chi2,*q;
unsigned long mwt;
unsigned long mdata;
{
  int i;
  float t,sxoss,sx=0.0,sy=0.0,st2=0.0,ss,sigdat;
#ifdef LOG_DEFINED
  float wt;
  float gammq();
#endif LOG_DEFINED

  *b = 0.0;
#ifdef LOG_DEFINED
  if(mwt)                         /* accumulate sums          */
  {
    ss = 0.0;
    for(i = 1; i <= mdata; i++) /* ...with weights           */
    {
      wt = 1.0 / SQR(sigy[i]);
      ss += wt;
      sx += x[i] * wt;
      sy += y[i] * wt;
    }
  }
  else
#endif LOG_DEFINED
  {
    for(i = 1; i <= mdata; i++) /* ...or without weights     */
    {
      sx += x[i];
      sy += y[i];
    }
    ss = mdata;
  }
  sxoss = sx / ss;
#ifdef LOG_DEFINED
  if(mwt)
  {
    for(i = 1; i <= mdata; i++)
    {
      t = (x[i] - sxoss) / sigy[i];
      st2 += t * t;
      *b += t * y[i] / sigy[i];
    }
  }
  else
#endif LOG_DEFINED
  {
    for(i = 1; i <= mdata; i++)
    {
      t = x[i] - sxoss;
      st2 += t * t;
      *b += t * y[i];
    }
  }
  *b /= st2;              /* Solve for a, b, siga, sigb   */
  *a = (sy - sx * (*b)) / ss;
  *siga = sqrt((1.0 + sx * sx / (ss * st2)) / ss);
  *sigb = sqrt(1.0 / st2);
  *chi2 = 0.0;            /* calculate chi squared        */
#ifdef LOG_DEFINED
  if(mwt)
  {
    for(i = 1; i <= mdata; i++)
      *chi2 += SQR((y[i] - (*a) - (*b) * x[i]) / sigy[i]);
    *q = gammq(0.5 * (mdata - 2), 0.5 * (*chi2));
  }
  else
#endif LOG_DEFINED
  {
    for(i = 1; i <= mdata; i++)
      *chi2 += SQR(y[i] - (*a) - (*b) * x[i]);
    *q = 1.0;
    sigdat = sqrt((*chi2) / (mdata - 2));
    *siga *= sigdat;
    *sigb *= sigdat;
  }
}

#ifdef LOG_DEFINED
```

Copyright 1989
Logic Modeling Systems

| SOURCE PROGRAM | DATE | PAGE # |
|---|---|---|
| diags/fit.c | 5/23/89<br>TIME 4:41:14 pm | 2/7 |

LINE # SOURCE TEXT

```
float gammq(a, x)          /* returns incomplete gamma function    */
float a, x;                /* Q(a, x) = 1 - P(a, x)                */
{
  float gamser, gammcf, gln;
  void gcf(), gser(), nrerror();

  if(x < 0.0 || a <= 0.0)
    nrerror("Invalid arguments in routing GAMMQ");
  if(x < (a + 1.0))        /* use the series representation        */
  {
    gser(&gamser, a, x, &gln);
    return(1.0 - gamser);        /* and take its complement        */
  }
  else                     /* Use the continued fraction rep.      */
  {
    gcf(&gammcf, a, x, &gln);
    return(gammcf);
  }
}


#define ITMAX 100
#define EPS 3.0e-7

void gser(gamser, a, x, gln)
float a, x, *gamser, *gln;
{
  int n;
  float sum, del, ap;
  float gammln();
  void nrerror();

  printf("gser\n");
  printf("________________________________________________\n");

  *gln = gammln(a);
  if(x <= 0.0)
  {
    if(x < 0.0)
      nrerror("x lexx than 0 in routine GSER");
    *gamser = 0.0;
    return;
  }
  else
  {
    ap = a;
    del = sum = 1.0 / a;
    for(n = 1; n <= ITMAX; n++)
    {
      ap += 1.0;
      del *= x / ap;
      sum += del;
      if(fabs(del) < fabs(sum) * EPS)
      {
        *gamser = sum * exp(-x + a * log(x) - (*gln));
        return;
      }
    }
    nrerror("a too large, ITMAX too small in routine GSER");
    return;
  }
}


void gcf(gammcf, a, x, gln)
float a, x, *gammcf, *gln;
{
  int n;
  float gold=0.0, g, fac=1.0, b1=1.0;
  float b0=0.0, anf, ana, an, a1, a0=1.0;
  float gammln();
  void nrerror();

  printf("gser(%x, %f, %f, %x)\n", gammcf, a, x, gln);
  printf("________________________________________________\n");

  *gln = gammln(a);
  a1 = x;
  for(n = 1; n <= ITMAX; n++)
  {
    an = (float) n;
    ana = an - a;
    a0 = (a1 + a0 * ana) * fac;
    b0 = (b1 + b0 * ana) * fac;
    anf = an * fac;
    a1 = x * a0 + anf * a1;
    b1 = x * b0 + anf * b1;
    if(a1)
    {
      fac = 1.0 / a1;
      g = b1 * fac;
      if(fabs((g - gold) / g) < EPS)
      {
        *gammcf = exp(-x + a * log(x) - (*gln)) * g;
        return;
      }
      gold = g;
    }
  }
  nrerror("a too large, ITMAX too small in routine GCF");
}


float gammln(xx)
float xx;
{
  double x, tmp, ser;
  static double cof[6] = {76.18009173, -86.50532033, 24.01409822,
                          -1.231739516, 0.120858003e-2, -0.536382e-5};
  int j;
  x = xx - 1.0;
  tmp = x + 5.5;
  tmp -= (x + 0.5) * log(tmp);
  ser = 1.0;
  for(j = 0; j <= 5; j++)
  {
    x += 1.0;
    ser += cof[j] / x;
  }
  printf("log(%f)\n", 2.50662827465 * ser);
```

Copyright 1989
Logic Modeling Systems

SOURCE PROGRAM: diags/fit.c | DATE: 5/23/89 | TIME: 4:41:14 pm | PAGE #: 3/8

LINE # SOURCE TEXT

```
    return(-tmp + log(2.50662827465 * ser));
}

void nrerror(error_text)
char error_text[];
{
    void exit();
    fprintf(stderr,"Numerical Recipes run-time error...\n");
    fprintf(stderr,"%s\n",error_text);
    fprintf(stderr,"...now exiting to system...\n");
    exit(1);
}
#endif LOG_DEFINED
```

Copyright 1989 Logic Modeling Systems

| SOURCE PROGRAM | DATE | TIME | PAGE # |
|---|---|---|---|
| diags/hex.c | 5/23/89 | 4:41:14 pm | 1/9 |

SOURCE TEXT

```
/* SCCS_ID: hex.c rev 3.1, 4/24/89 at 07:48:32     */

/*
** MAIN.c
** This file contains the startup code for the tasks.
** Tasks and resources begin here
*/
#include <stdio.h>
#include "common.h"
#include "cpu.h"
#include "task.h"
#include "lance.h"
#include "mod_err.h"
#include "nvram.h"
#include "lm_rd_wr.h"

/*
** The globals
*/
extern unsigned long timer_semaphor, rcv_lance_pkt_semaphore;
extern int key_hit;
int play_semaphore, malloc_semaphore;
/*****************************************************************/
/*                          main                                 */
/* The BSP creates the main task, and looks for the entry point */
/* named main.                                                   */
/*****************************************************************/
u_long auto_start = 0;
BOOT_STRUCT boot;
main()
{
void     serial_task();
void     output_routine( );
void     transmit_task();
void     housekeeping_task();
int      modem_task();
void     diags();
extern void    set_boot();
extern u_short lm_nvram_access();
void     temp_receive_task();
u_short write_lance_csr(), read_lance_csr();
int      err;
extern u_long modeler_inet;
extern          end;
unsigned long error;

        /*
        ** This routine creates the partition used in the system.
        ** The only usage is by malloc and friends.
        */
        create_malloc_partition(&end, (u_long)CPU_RAM_SIZE - (u_long)(&end));
        printf("\nLM-1000 Diagnostics loaded.\n");
        if(lm_nvram_access((char *) &boot, BOOT, SIZEOF_BOOT, MEMORY_READ,
             &error)==FAILURE)
        {
                output_routine( "\nFailed to read NVram");
        }
        modeler_inet = boot.modeler_internet_address;

        modeler_state = RUNNING_DIAGS;
        (void)lm_nvram_access(&modeler_state, MODELER_STATE,
                SIZEOF_MODELER_STATE, MEMORY_WRITE,(u_long *) &error);

        /*
        ** initialize the fifos
        */
        fifo_initialize();
        modem_init'); /* init modem queues */

        key_hit = sc_screate(0, 1, &err );
        if(err) sys_out("\nError creating event flag for checking.");

        /*
        ** The malloc semaphore controls access to the malloc and free
        ** functions. This avoids re-entrancy problems associated with
        ** a multi-tasking environment.
        */
        malloc_semaphore = sc_screate( 1, 0, &err);
        if ( err ) output_routine("\nError creating malloc semaphor");

        /*
        ** end of play interrupt semaphore
        */
        play_semaphore = sc_screate( 0, 1, &err);
        if(err) sys_out("\nError creating event flag for EOP interrupt.");
        /*
        ** create semaphor for lance rcv ISR
        ** 0 = init_value
        ** 0 = priority order
        */
        rcv_lance_pkt_semaphore = sc_screate( 0, 0 , &err);
        if( err ) output_routine("\nError creating rcv lance pkt  semaphor");

        if (get_lance_ready_to_go() != SUCCESS) {
                output_routine("\nError getting the LANCE ready to go.");
                sc_tsuspend(0, 0, &err);
        }

        if (start_lance() != SUCCESS) {
                output_routine("\nError starting the LANCE.");
                sc_tsuspend(0, 0, &err);
        }
        /*
        ** spin of the tasks
        */
        sc_tcreate(housekeeping_task, HOUSEKEEPING_TASK_ID,
                            DIAG_HOUSEKEEPING_TASK_PRI,&err);
        if(err) output_routine("\nError creating housekeeping task.");
        sc_tcreate( modem_task,
                KEYBOARD_TASK_ID, DIAG_KEYBOARD_TASK_PRI, &err);
        if(err) sys_out("\nError creating modem task.");

        sc_tcreate(transmit_task,
                TRANSMIT_TASK_ID, DIAG_TRANSMIT_TASK_PRI,&err);
        if(err) output_routine("\nError creating transmit task.");

        sc_tcreate(serial_task,
                SERIAL_TASK_ID, DIAG_SERIAL_TASK_PRI, &err);
        if(err) output_routine("\nError creating serial task.");
```

Copyright 1989
Logic Modeling Systems

SOURCE PROGRAM diags/hex.c | DATE 5/23/89 | TIME 4:41:14 pm | PAGE # 2/10

LINE # SOURCE TEXT

```
        /*
        sc_tcreate(diags,
                PATTERN_TASK_ID, DIAG_PATTERN_TASK_PRI, &err);
        if(err) output_routine("\nError creating diagnostics task.");
        */

        sc_tcreate(temp_receive_task,
                RECEIVE_TASK_ID, DIAG_RECEIVE_TASK_PRI, &err);
        if(err) output_routine("\nError creating receive task.");

        /* End of main task, main task commits suicide*/
        sc_tdelete( 0, 0, &err);
} /* end main */

/*
** This is temporarily the rec. task
** to spin off the diags task.
*/
static void
temp_receive_task()
{
int err;
void receive_task();
        sc_tcreate(diags,
                PATTERN_TASK_ID, DIAG_PATTERN_TASK_PRI, &err);
        if(err) output_routine("\nError creating diagnostics task.");
        receive_task();
}

/*****************************************************************/
/*                          sys_out                              */
/* Sends message to serial channel A                             */
/*****************************************************************/

sys_out( buf )
        char    *buf;
{
        while( *buf )
        {
                sc_putc( *buf++ );
        }
} /* end sys_out */
```

Copyright 1989
Logic Modeling Systems

| SOURCE PROGRAM | DATE | PAGE # |
|---|---|---|
| diags/intr.c | 5/23/89 | 1/11 |
| | TIME 4:41:14 pm | |

LINE # SOURCE TEXT

```
/* SCCS_ID: intr.c rev 3.1, 4/24/89 at 07:48:34      */

#include "common.h"
#include "lm_diags.h"
#include "diag_setjmp.h"
#include "cpu.h"

jmp_buf *diag_jmpbuf;

u_long Diag_bus_err_addr = 0;

intr()
{
        char board[80];

        if (Diag_bus_err_addr != 0) {
                map_addr_to_board(Diag_bus_err_addr, board);
                (void) send_line(LM_DIAG_ERROR, "\n[BUS ERROR at %08X]%s\n",
                        Diag_bus_err_addr, board);
                Diag_bus_err_addr = 0;
        }

        diag_longjmp(diag_jmpbuf,1);
}

/* grossly simplified cpu memory map */

map_addr_to_board(addr, s)
unsigned long addr;
char *s;
{
        char lane;
        unsigned long laneoffset;
        int bank, pel;

        *s = '\0';
        if ((addr >= 0x80000000) && (addr < 0xc0000000)) {
                lane = ((addr >> 28) & 7) + 'A';
                laneoffset = addr & 0x0fffffff;
                if (laneoffset < 0x0d000000) {
                        /* pacs and pams */
                        if (laneoffset < 0x0c000000) {
                                bank = (laneoffset >> 26) & 3;
                                sprintf(s, "(LANE %c PAM BANK %d)", lane, bank);
                        } else if (laneoffset < 0x0c020000) {
                                sprintf(s, "(LANE %c PAC LINK TABLE)", lane);
                        } else {
                                sprintf(s, "(LANE %c PAC)", lane);
                        }
                } else if (laneoffset < 0x0e000000) {
                        /* pels */
                        pel = (laneoffset >> 12) & 0xf;
                        sprintf(s, "(LANE %c PEL %d)", lane, pel);
                } else if (laneoffset < 0x0f000000) {
                        strcpy(s, "(TIMING GENERATOR)");
                }
        } else if ((addr >= CPU_RAM) && (addr < CPU_RAM + CPU_RAM_SIZE)) {
                strcpy(s, "(CPU RAM)");
        }
}
```

Copyright 1989
Logic Modeling Systems

| SOURCE PROGRAM | DATE | PAGE # |
|---|---|---|
| diags/lm_diags.c | 5/23/89 | 1/12 |
| | TIME 4:41:14 pm | |

LINE # SOURCE TEXT

```c
/* SCCS_ID: lm_diags.c rev 3.3, 5/9/89 at 17:46:40     */

#include <stdio.h>
#include <ctype.h>
#include <varargs.h>
#include <strings.h>
#include "common.h"
#include "message.h"
#include "network.h"
#include "lm_diags.h"
#include "lm_sfi.h"
#include "fifo.h"
#include "task.h"
#include "vrtx.h"
#include "cpu.h"
#include "diag_setjmp.h"
#include "mod_err.h"
#include "nvram.h"
#include "lm_rd_wr.h"

#ifndef DIAGS
#define DIAGS
#endif DIAGS
#include "intr.h"

#ifndef MODELER
#include <signal.h>
#endif

#ifdef CPU_DIAGS
#define get_key         cgetc
#define sc_getc         cgetc
#define sc_putc         cputc
#define printf          cprintf
#define check_key       cavailable
extern char     cgetc();
extern void     cprintf();
extern u_long   cavailable();
int enable_flashing_led = FALSE;
#else CPU_DIAGS
extern  CONNECTION      *table_of_conns[ ];
long    Fifo_task = 0;
static char *net_get_line();
static char net_get_key();
#endif CPU_DIAGS

static char serial_get_key();

int New_summary_data;
int lm_acceptance = LM_FALSE;
int lm_execute_all = LM_FALSE;
static int lm_pop_up = LM_FALSE;

/* Command line modifiable Parameters  */

long    lm_current_depth = 0;
long    lm_start_depth = 0;
long    lm_fast_test = LM_FALSE;

static  long    max_cycles;
static  long    max_errors;
static  long    max_failures;
static  long    max_warnings;
static  long    max_messages;
static  long    summary_count;
static  long    forever;

static  int     errors_on;
static  int     warnings_on;
static  int     messages_on;
int     banner_on;

static  int     print_depth;

char *new_get_parameter();

#define is_space(c)     (((c) == ' ') || ((c) == '\t'))
#define is_newline(c)   (((c) == CR) || ((c) == LF))
#define is_ident(c)     (!(is_space(c) || ((c) == '=') || ((c) == '\0')))
#define max(d1,d2)      (((d1) > (d2)) ? (d1) : (d2))

/*      Global counters */

long    total_cycles[MAX_DEPTH];
long    total_tests[MAX_DEPTH];
long    total_errors[MAX_DEPTH];
long    total_error_messg[MAX_DEPTH];
long    total_warnings[MAX_DEPTH];
long    total_messages[MAX_DEPTH];
long    total_failures;

long menu_debug = 0;
long lm_wizard_mode = 0;

#ifndef CPU_DIAGS
#define LM_PEEK_CHAR(X,O)                       \
        ( ((u_char *)(X)->incoming_buffer_pointer)[O] )
#ifdef VMS
#define LM_PEEK_LONG(X)                 (  LM_PEEK_CHAR(X,0)         |   \
                                         (LM_PEEK_CHAR(X,1) <<  8)   |   \
                                         (LM_PEEK_CHAR(X,2) << 16)   |   \
                                         (LM_PEEK_CHAR(X,3) << 24))
#else
#ifdef  SUN4
#define LM_PEEK_LONG(X)                 ( (LM_PEEK_CHAR(X,0) << 24)  |   \
                                         (LM_PEEK_CHAR(X,1) << 16)   |   \
                                         (LM_PEEK_CHAR(X,2) <<  8)   |   \
                                          LM_PEEK_CHAR(X,3) )
#else
#define LM_PEEK_LONG(X)          \
                (*((long *)(X)->incoming_buffer_pointer))
#endif
#endif

static char Fifo_user;

lm_select_mode()
{
    static    int    saved = FALSE;
    struct fifo_entry fifo;
```

Copyright 1989
Logic Modeling Systems

SOURCE PROGRAM diags/lm_diags.c | DATE 5/23/89 | TIME 4:41:14 pm | PAGE # 2/13

LINE # SOURCE TEXT

```
    CONNECTION      *conn;
    int size, cmd;

    if (saved == TRUE) return;
    printf("[HIT ANY KEY TO CONTINUE] ");
    modemprintline("[HIT ANY KEY TO CONTINUE] ");
    while (1) {
        fifo.fifo_no = RX_FIFO;
        if (fifo_get( &fifo) == SUCCESS) {
            switch (fifo.task) {
            case RECEIVE_TASK_ID:
                conn = table_of_conns[fifo.user];
                cmd = LM_PEEK_LONG(conn);
                if (cmd != LM_DIAG_GIMME) {
                    send_error_message(conn,
                        "Waiting to begin diagnostics");
                    set_close_connection_for_server(conn);
                    continue;
                } else {
                    LM_CHK_PUT_LONG(conn, LM_DIAG_ITEM);
                    LM_CHK_PUT_LONG(conn, 4);
                    lm_send_reply(conn);
                }
                break;
            case SERIAL_TASK_ID:
                break;
            default:
                    continue;
            }
            Fifo_user = fifo.user;
            Fifo_task = fifo.task;
            saved = TRUE;
            return;
        }
    }
}
#endif CPU_DIAGS

lm_diag_init()
{
        u_long err;

        lm_current_depth = 0;
        clear_fault_led();
        set_global_defaults();
        (void) lm_reset_counters((LM_DIAG_MENU *) 0);
#ifndef CPU_DIAGS
        install_diag_bus_error();
#endif CPU_DIAGS
}

/*
** lm_display_menu() returns FAILURE if executed by an all test
** and any of the tests in its menu or submenu fails.
** lm_display_menu() returns SUCCESS from "quit" or "main".
*/

lm_display_menu(menu)
LM_DIAG_MENU      *menu;
{
        long        return_status;
        char        string_reply[max_str];

        if (lm_current_depth == 0) (void) lm_diag_init();
        ++lm_current_depth;

        if ((lm_execute_all == LM_TRUE) || (lm_acceptance == LM_TRUE)) {
                return_status = execute_all(menu);
                --lm_current_depth;
                return(return_status);
        }

        while (LM_TRUE) {
                if (lm_pop_up == LM_TRUE) {
                        if (lm_current_depth > 1) {
                                --lm_current_depth;
                                return(SUCCESS);
                        } else {
                                lm_pop_up = LM_FALSE;
                        }
                }
                print_menu(menu);
                (void) lm_reset_counters(menu);

                get_selection(string_reply);
                lowarize(string_reply);

                lm_start_depth = lm_current_depth;

                if (SUCCESS != execute_string(string_reply, menu)) {
                        lm_current_depth--;
                        return(SUCCESS);
                }
        }
}

run_cont(menu)
        LM_DIAG_MENU      *menu;
{
        long      count;

        count = 0;

        while (SUCCESS != lm_check_key()) {
                execute_routine(menu, (long) 1);
                if (SUCCESS != failure_count_check()) {
                        /* send_line(LM_DIAG_WRITE, "[PS1]\n"); */
                        print_summary(menu);
                        break;
                }
                if (summary_count != 0) {
                        count++;
                        if (0 == ((count) % summary_count)) {
                                /* send_line(LM_DIAG_WRITE, "[PS2]\n"); */
                                print_summary(menu);
                                count = 0;
                        }
                }
        }
}
```

Copyright 1989 Logic Modeling Systems

| SOURCE PROGRAM | DATE | PAGE # |
|---|---|---|
| diags/lm_diags.c | 5/23/89 | 3/14 |
| | TIME 4:41:14 pm | |

LINE # SOURCE TEXT

```
lm_get_input(prompt, reply, len)
        char    *prompt;
        char    *reply;
        int     len;
{
        (void) send_line(LM_DIAG_NULL, "%s", prompt);
        lm_get_line(reply, len);
}

print_menu(menu)
        register LM_DIAG_MENU *menu;
{
        register LM_DIAG_MENU_ITEM      *menu_list;
        register long                   i;

        if (lm_wizard_mode)
                print_menu_title(menu->title);
        else
                (void) send_line(LM_DIAG_ITEM,  "%\n\t%s\n\n",
                        menu->title);

        /* don't display "a" unless there is a test or test menu is here */
        menu_list = menu->menu_items;
        for (i=0; i<menu->number_of_items; i++, menu_list++) {
                if (!(menu_list->attributes & LM_DIAG_no_execute)) {
                        send_line(LM_DIAG_WRITE, "%6s) %s\n",
                            "a", "Execute all tests");
                        break;
                }
        }

        menu_list = menu->menu_items;
        for (i=0; i<menu->number_of_items; i++, menu_list++) {
                if ((!lm_wizard_mode)
                        && (menu_list->attributes & LM_DIAG_wizard_mode))
                                continue;

                if (!(menu_list->attributes & LM_DIAG_no_display))
                        (void) send_line(LM_DIAG_ITEM,  "%6s) %s \n",
                            (menu_list->attributes & LM_DIAG_no_select)?
                            "n/a": menu_list->selection,
                            menu_list->menu_text);

        }
        send_line(LM_DIAG_WRITE, "%6s) %s\n",
            "h", "Display help information");
        send_line(LM_DIAG_WRITE, "%6s) %s\n",
            "q", "Quit - return to previous menu");
        send_line(LM_DIAG_WRITE, "%6s) %s\n",
            "e", "Exit - Exit diagnostics");
}

print_menu_title(s)
register char *s;
{
        char title[256];
        register char *t;
        register long count, i, line;

        (void) send_line(LM_DIAG_WRITE, "\n");
        while (*s == ' ')
                ++s;
        for (line = 0, count = strlen(s); ++line) {
                t = title;
                if (count > 32) {
                        for (count = 32; count && (s[count] != ' '); --count)
                                ;
                        if (!count)
                                count = 32;
                }
                /* one tab on the first line */
                *t++ = '\t';
                /* two tabs on all continuation lines */
                if (line)
                        *t++ = '\t';
                for (i = 0; i < count; ++i) {
                        *t++ = UPPERCASE(*s);
                        s++;
                        *t++ = ' ';
                }
                *t = '\0';
                (void) send_line(LM_DIAG_TITLE, "%s\n", title);
                while (*s == ' ')
                        ++s;
        }
        (void) send_line(LM_DIAG_WRITE, "\n");
}

print_summary(menu)
        LM_DIAG_MENU *menu;
{
        long    i;
        long tests = 0;
        long errors = 0;

        if (New_summary_data == FALSE)
                return;

        for (i = lm_current_depth; i < MAX_DEPTH; ++i) {
                tests += total_tests[i];
                errors += total_errors[i];
        }

        if (!tests)
                return;
        send_line(LM_DIAG_WRITE, "\n");
        if (total_cycles[lm_current_depth])
                send_line(LM_DIAG_RESULT, "Cycles Completed: %d \n",
                        total_cycles[lm_current_depth]);
        send_line(LM_DIAG_RESULT, "Tests Run:          %d \n", tests);
        send_line(LM_DIAG_RESULT, "Total Failures:     %d \n", errors);
        for (i = 0; i<menu->number_of_items; i++) {
                if (((menu->menu_items[i].status & LM_DIAG_fail)) &&
                        (menu->menu_items[i].status & LM_DIAG_run)) {
                        send_line(LM_DIAG_RESULT, "  TEST %2s FAILED: %s\n",
                                menu->menu_items[i].selection,
                                menu->menu_items[i].menu_text);
                }
        }
```

Copyright 1989
Logic Modeling Systems

| SOURCE PROGRAM | DATE | PAGE # |
|---|---|---|
| diags/lm_diags.c | 5/23/89<br>TIME 4:41:14 pm | 4/15 |

LINE # SOURCE TEXT

```
        send_line(LM_DIAG_WRITE, "\n");
        New_summary_data = FALSE;
}

execute_routine(menu, count)
        LM_DIAG_MENU *menu;
        long    count;
{
  long  loop;
  register long  return_status, i;
  register long no_leading_banner;
  register int repeat_banner;
  register char *s;
  char banner_string[256], dots[80];
  long attr;

  (void) lm_check_key(); /* is there an interrupt? */

  attr = menu->menu_items[menu->current_selection].attributes;

  /*  Don't execute routines which have the no_execute bit set
      and we are doing an 'all test' or acceptance test  */
  if ((lm_execute_all || lm_acceptance) && (attr & LM_DIAG_no_execute)) {
    return SUCCESS;
  }

  /*  Don't execute routines which don't have the acceptance bit set
      and we are doing an 'acceptance test'  */
  if (lm_acceptance && !(attr & LM_DIAG_acceptance)) {
    return SUCCESS;
  }

  repeat_banner = (messages_on || warnings_on || errors_on);
  no_leading_banner = (attr & LM_DIAG_menu_banner)
       && !(lm_execute_all || lm_acceptance);

  sprintf(banner_string, "%*s%s",
    (lm_current_depth - lm_start_depth) * 2, "",
      menu->menu_items[menu->current_selection].menu_text);

  if (attr & LM_DIAG_no_repeat) {
      count = 1;
  }

  TEST_RUN(menu);
  for (loop = 0; loop<count; loop ++) {
    (void) lm_check_key(); /* is there an interrupt? */
    if (SUCCESS != failure_count_check()) {
      break;
    }
    if (banner_on && !(attr & LM_DIAG_no_banner) && !no_leading_banner) {
      lm_force_start_of_line(LM_DIAG_MESS);
      lm_banner("%s%s", banner_string,
        (repeat_banner || (attr & LM_DIAG_menu_banner))? ":\n" : "...");
    }
    return_status
      = (*(menu->menu_items[menu->current_selection].action_routine))
        (menu, menu->menu_items[menu->current_selection].user_data);
    if (attr & LM_DIAG_log_results) {
      ++total_tests[lm_current_depth];
      New_summary_data = TRUE;
    }
    if (return_status != SUCCESS) {
      TEST_FAILED(menu);
      if (attr & LM_DIAG_log_results) {
        set_fault_led();
        ++total_errors[lm_current_depth];
        ++total_failures;
#ifndef CPU_DIAGS
        if (Fifo_task == RECEIVE_TASK_ID) {
          set_report_failure();
        }
#endif CPU_DIAGS
      }
    }
    if (!(attr & LM_DIAG_menu_banner)) {
      if (((return_status != SUCCESS) && (errors_on == LM_TRUE))
       || (banner_on && !(attr & LM_DIAG_no_banner))) {
        if (repeat_banner) {
          lm_force_start_of_line(LM_DIAG_MESS);
          lm_banner("%s...", banner_string);
        }
        for (s = dots, i = strlen(banner_string); i < 67; ++i) *s++ = '.';
        (void) strcpy(s, (return_status == SUCCESS) ? "PASS\n":
          ".....FAIL\n");
        lm_banner(dots);
      }
    } else if ((return_status != SUCCESS) && (errors_on == LM_TRUE)
     && (lm_execute_all || lm_acceptance)) {
      lm_force_start_of_line(LM_DIAG_MESS);
      lm_banner("%s produced failures.\n", banner_string);
    }
    if (!(lm_execute_all || lm_acceptance || forever)) {
      if ((summary_count != 0) && (0 == ((loop+1) % summary_count))) {
        /* send_line(LM_DIAG_WRITE, "[PS3]\n"); */
        print_summary(menu);
      }
    }
  }
  return return_status;
}

#ifdef CPU_DIAGS
flash_diag_led()
{
    register u_long delay_count;

    delay_milliseconds(delay_count, 500);
    ((cpu_control_reg_struct *)CPU_CONTROL_REG)->not_test_led = not_LED_OFF;
    delay_milliseconds(delay_count, 500);
    ((cpu_control_reg_struct *)CPU_CONTROL_REG)->not_test_led = not_LED_ON;
}
#endif CPU_DIAGS

failure_count_check()
{
        return ((max_failures > 0) && (total_failures >= max_failures))?
                FAILURE: SUCCESS;
}
```

Copyright 1989
Logic Modeling Systems

SOURCE PROGRAM diags/lm_diags.c | DATE 5/23/89 | TIME 4:41:14 pm | PAGE # 5/16

LINE # SOURCE TEXT

```
error_count_check()
{
  if (((max_errors>0) && (total_error_messg[lm_current_depth] > max_errors))
     || ((max_warnings>0) && (total_warnings[lm_current_depth] > max_warnings))
     || ((max_messages>0) && (total_messages[lm_current_depth] > max_messages)))
       return(FAILURE);

  return(SUCCESS);
}

static struct help_list {
     int print_always;
     char *text;
} help_list[] = {
  1, "Built in Commands: \n",
  1, "\t all              (a)          execute all tests\n",
  1, "\t quit             (q)          exit from this menu \n",
  1, "\t main             (m)          goto the main menu \n",
  1, "\t exit             (e)          exit from this program \n",
  1, "\t help             (h)          display this information \n",
  1, "\t \n",
  1, "Command Qualifiers: \n",
  1, "\t continuous       (c) = <t/f> run test continuously \n",
  1, "\t repeat           (r) = <n>   run test <n> times \n",
  1, "\t summary          (s) = <n>   print summary every <n> cycles \n",
  0, "\t error_count      (e) = <n>   set error threshold to <n> errors \n",
  0, "\t warning_count    (w) = <n>   set warning threshold to <n> warnings \n",
  0, "\t message_count    (m) = <n>   set message threshold to <n> messages \n",
  0, "\t failure_count    (f) = <n>   stop testing after <n> tests fail \n",
  0, "\t fast_test     (fast) = <t/f> run short version of test if available\n",
  0, "\t \n",
  0, "Output Qualifiers: \n",
  0, "\t print_errors   (pe) = <f/t> supresses error messages \n",
  0, "\t print_warnings (pw) = <f/t> supresses warning messages \n",
  0, "\t print_messages (pm) = <f/t> supresses messages \n",
  1, "\t print_banners  (pb) = <f/t> supresses test banners \n",
  1, "\t \n",
#ifndef MODELER
  0, "\t output           (o) = <filename> log output to the named file \n",
  0, "\t \n",
#endif
  0, 0
};

help()
{
        print_text_array(help_list);
        (void) send_line(LM_DIAG_NULL, "hit return to continue");
        (void) lm_get_key();
}

print_text_array(help_list)
struct help_list *help_list;
{
        for (; help_list->text; ++help_list)
                if (lm_wizard_mode || help_list->print_always)
                        (void) send_line(LM_DIAG_HELP, help_list->text);
}

/*
** execute_all() returns FAILURE if any of the tests in
** its menu or submenu fails.
*/

execute_all(menu)
        LM_DIAG_MENU    *menu;
{
        long    i, return_value = SUCCESS;

        for (i=0; i<menu->number_of_items; ++i) {
                if (SUCCESS != failure_count_check()) {
                  break;
                }
                menu->current_selection = i;
                if (execute_routine(menu, (long) i) != SUCCESS)
                        return_value = FAILURE;
#ifdef CPU_DIAGS
                /*
                 * CPU diagnostics enter at depth=1, and immediately
                 * increment to 2 in the top level menu, so flash the
                 * LED only in between tests at the top level menu.
                 */
                if ((enable_flashing_led) && (lm_current_depth == 2) &&
                    (!(menu->menu_items[menu->current_selection].attributes &
                        LM_DIAG_no_execute)))
                    flash_diag_led();
#endif CPU_DIAGS
                if (menu->menu_items[i].status & LM_DIAG_stop_test)
                        break; /* or should we return? */
        }
        ++total_cycles[lm_current_depth];
        return return_value;
}

lm_reset_counters(menu)
        LM_DIAG_MENU    *menu;
{       long    i;
        LM_DIAG_MENU_ITEM       *menu_item;

        New_summary_data = FALSE;

        for (i=0; i<MAX_DEPTH; i++) {
                total_cycles[i] = 0;
                total_tests[i] = 0;
                total_errors[i] = 0;
                total_error_messg[i] = 0;
                total_messages[i] = 0;
                total_warnings[i] = 0;
        }
        total_failures = 0;

        if (menu) {
                menu_item = menu->menu_items;
                for (i=0; i<menu->number_of_items; i++, menu_item++) {
                        menu_item->status = 0;
                }
        }

        return(SUCCESS);
```

Copyright 1989
Logic Modeling Systems

LINE # SOURCE TEXT

```
}

lm_increment_cycle_count()
{

        ++total_cycles[lm_current_depth];
        if (total_cycles[lm_current_depth] > max_cycles) return(FAILURE);
        return(SUCCESS);

}

static int at_start_of_line = 1;

lm_force_start_of_line(print_mode)
{
        if (!at_start_of_line)
                (void) send_line(print_mode, "\n", 0);
        at_start_of_line = 1;
}

/*VARARGS*/ /*ARGSUSED*/
lm_error(va_alist)
        char *va_alist;
{       va_list argp;
        char    lm_diag_buffer[255];
        char    format[255];

        (void) lm_check_key(); /* look for interrupt */

        ++total_error_messg[lm_current_depth];
        if ((LM_TRUE == errors_on) && (print_depth > lm_current_depth)) {
                lm_force_start_of_line(LM_DIAG_ERROR);
                va_start(argp);
                strcpy(format, "ERROR: ");
                strcat(format, va_arg(argp, char *));
                (void) vsprintf(lm_diag_buffer, format, argp);
                va_end(argp);
                (void) do_send_line(LM_DIAG_ERROR, lm_diag_buffer);
                at_start_of_line
                        = is_newline(lm_diag_buffer[strlen(lm_diag_buffer)-1]);
        }
        if ((max_errors>0)
                && (total_error_messg[lm_current_depth] >= max_errors))
                return(FAILURE);
        return(SUCCESS);
}

/*VARARGS0*/ /*ARGSUSED*/
lm_warning(va_alist)
        char *va_alist;
{       va_list argp;
        char    lm_diag_buffer[255];
        char    format[255];

        (void) lm_check_key(); /* look for interrupt */

        ++total_warnings[lm_current_depth];
        if ((LM_TRUE == warnings_on) && (print_depth > lm_current_depth)) {
                lm_force_start_of_line(LM_DIAG_WARN);
                va_start(argp);
                strcpy(format, "WARNING: ");
                strcat(format, va_arg(argp, char *));
                (void) vsprintf(lm_diag_buffer, format, argp);
                va_end(argp);
                (void) do_send_line(LM_DIAG_WARN, lm_diag_buffer);
                at_start_of_line
                        = is_newline(lm_diag_buffer[strlen(lm_diag_buffer)-1]);
        }
        if ((max_warnings>0) &&
                (total_warnings[lm_current_depth] >= max_warnings))
                return(FAILURE);
        return(SUCCESS);
}

/*VARARGS*/ /*ARGSUSED*/
lm_message(va_alist)
        char *va_alist;
{       va_list argp;
        char    lm_diag_buffer[255];
        char    *format;

        (void) lm_check_key(); /* look for interrupt */

        ++total_messages[lm_current_depth];
        if ((LM_TRUE == messages_on)
            && (print_depth > (lm_current_depth - lm_start_depth))) {
                va_start(argp);
                format= va_arg(argp, char *);
                (void) vsprintf(lm_diag_buffer, format, argp);
                va_end(argp);
                (void) do_send_line(LM_DIAG_MESS, lm_diag_buffer);
                at_start_of_line
                        = is_newline(lm_diag_buffer[strlen(lm_diag_buffer)-1]);
        }

        if ((max_messages>0) &&
                (total_messages[lm_current_depth] >= max_messages))
                return(FAILURE);

        return(SUCCESS);
}

/*VARARGS*/ /*ARGSUSED*/
/* always print this */
lm_banner(va_alist)
        char *va_alist;
{       va_list argp;
        char    lm_diag_buffer[255];
        char    *format;

        (void) lm_check_key(); /* look for interrupt */

        va_start(argp);
        format= va_arg(argp, char *);
        (void) vsprintf(lm_diag_buffer, format, argp);
        va_end(argp);
        (void) do_send_line(LM_DIAG_MESS, lm_diag_buffer);
        at_start_of_line
                = is_newline(lm_diag_buffer[strlen(lm_diag_buffer)-1]);
        return(SUCCESS);
```

Copyright 1989
Logic Modeling Systems

| SOURCE PROGRAM | DATE | PAGE # |
|---|---|---|
| diags/lm_diags.c | 5/23/89 | 7/18 |
| | TIME 4:41:14 pm | |

LINE # SOURCE TEXT

```
}

clean_input(line)
        char    *line;
{       char    temp_string[...._str];    /* use a temporary string to avoid    */
                                          /* portability problems               */
        char    *str_ptr;

        (void) strcpy(temp_string, line);
        str_ptr = temp_string;

        while (is_space(str_ptr[0]))
                str_ptr++;   /* remove leading white space */

        (void) strcpy(line, str_ptr);
}

/*VARARGS2*/
/*ARGSUSED*/
send_line(line_type, fmt, va_alist)
int line_type;
char *fmt;
char *va_alist;
{
        va_list         pvar;
        char            str[MAX_SERVER_PACKET];

        va_start(pvar);
        (void) vsprintf(str, fmt, pvar);
        va_end(pvar);
        do_send_line(line_type, str);
}

do_send_line(line_type, str)
char *str;
{
#ifndef CPU_DIAGS
        CONNECTION      *conn;
        int             bytes, i;
        char            text[MAX_SERVER_PACKET];
        u_long          cmd;

        if (Fifo_task == RECEIVE_TASK_ID) {
                bytes = strlen(str);
                get_request(&conn, &cmd, text);
                /* who cares what the cmd was? */
                LM_CHK_PUT_LONG(conn, line_type);
                LM_CHK_PUT_LONG(conn, bytes+4);
                for (i=0; i<bytes; i++) {
                        LM_CHK_PUT_CHAR(conn, str[i]);
                }
                lm_send_reply(conn);
        } else {
                if (Fifo_user == 0) {
                    printf("%s", str);
                } else {
                    modemprintline(str);
                }
        }
#else CPU_DIAGS
                printf("%s", str);
#endif CPU_DIAGS
}

exit_request()
{
        /* modeler requesting death */
#ifndef CPU_DIAGS
        (void) send_line(LM_DIAG_END, "");
#else CPU_DIAGS
        u_long err;
        char skip_menu_val = CPU_SKIP_MENU_YES;
        (void) lm_nvram_access((char *) 0, 0, 0, MEMORY_DIAG_INIT, &err);
        (void) lm_nvram_access(&skip_menu_val, CPU_SKIP_MENU,
                                SIZEOF_CPU_SKIP_MENU, MEMORY_WRITE, &err);
#endif CPU_DIAGS
        lm_reset_cpu();
}

lm_reset_cpu()
{
#ifdef MODELER
        register cpu_control_reg_struct *control_reg;
        register u_long                 delay;

        /*  send a reply to the hardware that were outta here */
        control_reg = (cpu_control_reg_struct *) CPU_CONTROL_REG;
        control_reg->suicide = 1;

        delay_milliseconds(delay, 8000);
#else MODELER
        kill(getpid(), SIGTERM);
#endif MODELER
}

char
lm_get_key()
{
        register char c;

        do {
#ifndef CPU_DIAGS
                if (Fifo_task == RECEIVE_TASK_ID) {
                        c = net_get_key();
                } else {
                        c = serial_get_key();
                }
#else CPU_DIAGS
                c = get_key();
#endif CPU_DIAGS
                if (c == INTR_CHARACTER) intr();
        } while (c == ctrl(s)); /* simple ^S strategy:
                                   any char resumes printing */
        return c;
}

static char
serial_get_key()
{
#ifndef CPU_DIAGS
```

Copyright 1989
Logic Modeling Systems

SOURCE PROGRAM diags/lm_diags.c

DATE 5/23/89 TIME 4:41:14 pm PAGE # 8/19

LINE # SOURCE TEXT

```
    CONNECTION  *conn;
    u_long cmd;
    char buffer[MAX_SERVER_PACKET];

    get_request(&conn, &cmd, buffer);
    return buffer[0];
#else CPU_DIAGS
    char c;
    c = get_key();
#endif CPU_DIAGS
}

static char *
serial_get_line(string, len)
register char *string;
{
        register char *s = string, *limit = s + len;
        char c;
        static char backspace[] = "\b \b";

        while (((c = lm_get_key()) != CR) && (c != LF) && (s < limit)) {
                switch (c) {
                case BS:
                case DEL:
                        if (s > string) {
                                --s;
                                serial_puts(backspace);
                        }
                        break;
                case ctrl(u):
                        while (s > string) {
                                --s;
                                serial_puts(backspace);
                        }
                        break;
                case ctrl(w):
                        while ((s > string) && isspace(s[-1])) {
                                --s;
                                serial_puts(backspace);
                        }
                        while ((s > string) && !isspace(s[-1])) {
                                --s;
                                serial_puts(backspace);
                        }
                        break;
                default:
                        if (isprint(c)) {
                                *s++ = c;
                                serial_putc(c);
                        } else {
                                serial_putc(c);
                                serial_putc(ctrl(g));
                        }
                }
        }
        serial_putc('\n');
        *s = '\0';
        return string;
}

char *
lm_get_line(reply, len)
register char   *reply;
long    len;
{
        register char *c;

#ifndef CPU_DIAGS
        if (Fifo_task == RECEIVE_TASK_ID) {
                c = net_get_line(reply, len);
        } else
#endif CPU_DIAGS
        {
                c = serial_get_line(reply, len);
        }
        while (*reply)
                if (*reply++ == INTR_CHARACTER) intr();
        return c;
}

serial_puts(str)
char *str;
{
#ifndef CPU_DIAGS
    if (Fifo_user == 0) printf("%s", str);
    else modemprintline(str);
#else CPU_DIAGS
    printf("%s", str);
#endif CPU_DIAGS
}

serial_putc(c)
{
#ifndef CPU_DIAGS
    if (Fifo_user == 0) printf("%c", c);
    else putmodemc(c);
#else CPU_DIAGS
    printf("%c", c);
#endif CPU_DIAGS
}

get_selection(string_reply)
        char    *string_reply;
{

#ifndef CPU_DIAGS
        if (Fifo_task == RECEIVE_TASK_ID) net_get_selection(string_reply);
        else
#endif CPU_DIAGS
        {
                (void) send_line(LM_DIAG_WRITE, "\n");
                do {
                        lm_get_input("selection: ", string_reply, max_str);
                        clean_input(string_reply);
                } while (strlen(string_reply) == 0);
                (void) send_line(LM_DIAG_WRITE, "\n");
        }
}

/* lm_check_key flushes the input buffer */
```

Copyright 1989 Logic Modeling Systems

LINE # SOURCE TEXT

```
/* returns the interrupt character if in the buffer, */
/* or returns the first character in the buffer */
/* or returns 0 if no key */


lm_check_key()
{
        register int retval;

#ifndef CPU_DIAGS
        if (fifo_task == RECEIVE_TASK_ID) {
                retval = net_check_key();
        } else
        {
                retval = serial_check_key();
        }
#else CPU_DIAGS
        retval = serial_check_key();
#endif CPU_DIAGS
        if (retval == INTR_CHARACTER) intr();
        return retval;
}

serial_check_key()
{
#ifndef CPU_DIAGS
        struct     fifo_entry    fifo;
        register int retval;
        register int i;

        fifo.fifo_no = RX_FIFO;
        retval = fifo_inquiry(&fifo);

        if (retval) {
                retval = serial_get_key();
                while (fifo_inquiry(&fifo)) {
                        i = serial_get_key();
                        if (i == INTR_CHARACTER)
                                retval = i;
                }
                if (i == ctrl(s)) {
                        (void) serial_get_key();
                        /* simple ^S strategy: any char resumes printing */
                }
        }
        return retval;
#else CPU_DIAGS
        register int retval = check_key();
        register int i;

        if (retval) {
                retval = get_key();
                while (check_key()) {
                        i = get_key();
                        if (i == INTR_CHARACTER)
                                retval = i;
                }
                if (i == ctrl(s)) (void) get_key(); /* simple ^S strategy:
                                        any char resumes printing */
        }
        return retval;
#endif CPU_DIAGS
}

/* parameter parsing routines */

#define CMDTOKEN_NOT_BUILT_IN    0
#define CMDTOKEN_quit            1
#define CMDTOKEN_all             2
#define CMDTOKEN_exit            3
#define CMDTOKEN_help            4
#define CMDTOKEN_main            5
#define CMDTOKEN_wizard          6
#define CMDTOKEN_burnin          7

#define TOKEN_UNDEFINED          0
#define TOKEN_max_cycles         1
#define TOKEN_max_errors         2
#define TOKEN_max_warnings       3
#define TOKEN_max_messages       4
#define TOKEN_summary_count      5
#define TOKEN_errors_on          6
#define TOKEN_warnings_on        7
#define TOKEN_messages_on        8
#define TOKEN_banner_on          9
#define TOKEN_print_depth        10
#define TOKEN_lm_fast_test       11
#define TOKEN_forever            12
#define TOKEN_output             13
#define TOKEN_COUNT              14
#define TOKEN_max_failures       15

#define DFLT_max_cycles          1
#define DFLT_max_errors          1
#define DFLT_max_failures        0
#define DFLT_max_warnings        0
#define DFLT_max_messages        0
#define DFLT_summary_count       0
#define DFLT_errors_on           LM_FALSE
#define DFLT_warnings_on         LM_FALSE
#define DFLT_messages_on         LM_FALSE
#define DFLT_banner_on           LM_TRUE
#define DFLT_print_depth         20
#define DFLT_lm_fast_test        LM_TRUE
#define DFLT_forever             LM_FALSE

char *get_identifier();

struct token {
        char *name;
        long length;
        long token;
};

struct token cmdtokens[] = {
        { "all",        1,      CMDTOKEN_all},
        { "burnin",     4,      CMDTOKEN_burnin},
        { "quit",       1,      CMDTOKEN_quit},
        { "exit",       1,      CMDTOKEN_exit},
        { "help",       1,      CMDTOKEN_help},
```

Copyright 1989
Logic Modeling Systems

| SOURCE PROGRAM | DATE | PAGE # |
|---|---|---|
| diags/lm_diags.c | 5/23/89 | 10/21 |
| | TIME 4:41:14 pm | |

LINE # SOURCE TEXT

```
        { "main",               1,      CMDTOKEN_main},
        { "wizard",             3,      CMDTOKEN_wizard},
        0
};

struct token new_options[] = {
        { "continuous",         1,      TOKEN_forever},
        { "error_count",        1,      TOKEN_max_errors},
        { "failure_count",      1,      TOKEN_max_failures},
        { "fast_test",          4,      TOKEN_lm_fast_test},
        { "message_count",      1,      TOKEN_max_messages},
        { "print_banners",      7,      TOKEN_banner_on},
        { "print_depth",        7,      TOKEN_print_depth},
        { "print_errors",       7,      TOKEN_errors_on},
        { "print_messages",     7,      TOKEN_messages_on},
        { "print_warnings",     7,      TOKEN_warnings_on},
        { "pbanner",            2,      TOKEN_banner_on},
        { "pdepth",             2,      TOKEN_print_depth},
        { "perror",             2,      TOKEN_errors_on},
        { "pmessage",           2,      TOKEN_messages_on},
        { "pwarning",           2,      TOKEN_warnings_on},
        { "repeat",             1,      TOKEN_max_cycles},
        { "summary_print",      1,      TOKEN_summary_count},
        { "warning_count",      1,      TOKEN_max_warnings},
        0
};

set_global_defaults()
{
        max_cycles = DFLT_max_cycles;
        max_errors = DFLT_max_errors;
        max_failures = DFLT_max_failures;
        max_warnings = DFLT_max_warnings;
        max_messages = DFLT_max_messages;
        summary_count = DFLT_summary_count;
        errors_on = DFLT_errors_on;
        warnings_on = DFLT_warnings_on;
        messages_on = DFLT_messages_on;
        banner_on = DFLT_banner_on;
        print_depth = DFLT_print_depth;
        lm_fast_test = DFLT_lm_fast_test;
        forever = DFLT_forever;
}

/* execute_string() returns FAILURE only if we want to quit */

execute_string(string, menu)
register char *string;
LM_DIAG_MENU    *menu;
#define is_specified(token)     (specified & (1 << (token)))
{
        INTR_INIT
        register LM_DIAG_MENU_ITEM  *menu_item;
        long value, cmdtoken, token;
        long        reply;
        char        command[max_str];
        long specified = 0; /* nothing specified yet */

        set_global_defaults();

        if (!(string = get_identifier(string, command)))
                return SUCCESS;

        cmdtoken = identify_token(command, &(cmdtokens[0]));

        while (string = new_get_parameter(string, &token, &value)) {
                switch (token) {
                case TOKEN_max_cycles: max_cycles = value; break;
                case TOKEN_max_errors: max_errors = value; break;
                case TOKEN_max_failures: max_failures = value; break;
                case TOKEN_max_warnings: max_warnings = value; break;
                case TOKEN_max_messages: max_messages = value; break;
                case TOKEN_summary_count: summary_count = value; break;
                case TOKEN_errors_on: errors_on = value; break;
                case TOKEN_warnings_on: warnings_on = value; break;
                case TOKEN_messages_on: messages_on = value; break;
                case TOKEN_banner_on: banner_on = value; break;
                case TOKEN_print_depth: print_depth = value; break;
                case TOKEN_lm_fast_test: lm_fast_test = value; break;
                case TOKEN_forever: forever = value; break;
                case TOKEN_UNDEFINED:
                        lm_banner("Syntax error: %s\n", string);
                        return SUCCESS;
                default:
                        lm_banner("Token %d not implemented\n", token);
                        return SUCCESS;
                }
                specified |= (1 << token);
        }

        /*
        ** Defaults:
        **
        ** 1. Turn on all messages, warnings, errors only if a utility or
        **    you are a wizard running a single test with no reps.
        **
        ** 2. Turn off banners for multiply executed alltests.
        **
        ** 3. pb=f implies pe=f implies pw=f implies pm=f
        **
        ** 4. pm=t implies pw=t implies pe=t implies pb=t
        **    (overrides 3 above)
        */

        /* See 1. above */
        if (lm_wizard_mode && (max_cycles <= 1) &&
            (forever == LM_FALSE) && (cmdtoken != CMDTOKEN_all)) {
                if (!is_specified(TOKEN_errors_on)) errors_on = LM_TRUE;
                if (!is_specified(TOKEN_warnings_on)) warnings_on = LM_TRUE;
                if (!is_specified(TOKEN_messages_on)) messages_on = LM_TRUE;
        }

        /* 2. default pb = f if r > 1 */
        if ((max_cycles > 1) || (forever == LM_TRUE)) {
                if (!is_specified(TOKEN_banner_on)) banner_on = LM_FALSE;
        }

        /* 3. pb=f implies pe=f implies pw=f implies pm=f */
        if (is_specified(TOKEN_banner_on) && (banner_on == LM_FALSE)) {
                if (!is_specified(TOKEN_messages_on)) messages_on = LM_FALSE;
```

Copyright 1989 Logic Modeling Systems

SOURCE PROGRAM diags/lm_diags.c | DATE 5/23/89 | TIME 4:41:14 pm | PAGE # 11/22

LINE # SOURCE TEXT

```
                        if (!is_specified(TOKEN_warnings_on)) warnings_on = LM_FALSE;
                        if (!is_specified(TOKEN_errors_on)) errors_on = LM_FALSE;
                }
                if (is_specified(TOKEN_errors_on) && (errors_on == LM_FALSE)) {
                        if (!is_specified(TOKEN_messages_on)) messages_on = LM_FALSE;
                        if (!is_specified(TOKEN_warnings_on)) warnings_on = LM_FALSE;
                }
                if (is_specified(TOKEN_warnings_on) && (warnings_on == LM_FALSE)) {
                        if (!is_specified(TOKEN_messages_on)) messages_on = LM_FALSE;
                }

                /* 4. pm=t implies pw=t implies pe=t implies pb=t */
                if (is_specified(TOKEN_messages_on) && (messages_on == LM_TRUE)) {
                        if (!is_specified(TOKEN_banner_on)) banner_on = LM_TRUE;
                        if (!is_specified(TOKEN_errors_on)) errors_on = LM_TRUE;
                        if (!is_specified(TOKEN_warnings_on)) warnings_on = LM_TRUE;
                }
                if (is_specified(TOKEN_warnings_on) && (warnings_on == LM_TRUE)) {
                        if (!is_specified(TOKEN_banner_on)) banner_on = LM_TRUE;
                        if (!is_specified(TOKEN_errors_on)) errors_on = LM_TRUE;
                }
                if (is_specified(TOKEN_errors_on) && (errors_on == LM_TRUE)) {
                        if (!is_specified(TOKEN_banner_on)) banner_on = LM_TRUE;
                }

                switch (cmdtoken) {
                case CMDTOKEN_quit:
                        return FAILURE; /* quit */
                case CMDTOKEN_all:
                        lm_all_test(menu);
                        break;
                case CMDTOKEN_burnin:
                        lm_banner("Burn in:\n");
                        if (!is_specified(TOKEN_forever)) forever = LM_TRUE;
                        if (!is_specified(TOKEN_errors_on)) errors_on = LM_TRUE;
                        if (!is_specified(TOKEN_messages_on)) messages_on = LM_FALSE;
                        if (!is_specified(TOKEN_warnings_on)) warnings_on = LM_FALSE;
                        if (!is_specified(TOKEN_banner_on)) banner_on = LM_FALSE;
                        lm_all_test(menu);
                        break;
                case CMDTOKEN_exit:
                        exit_request();
                        break;
                case CMDTOKEN_help:
                        help();
                        break;
                case CMDTOKEN_wizard:
                        promote();
                        break;
                case CMDTOKEN_main:
                        lm_pop_up = LM_TRUE;
                        return FAILURE; /* quit */
                default: /* not a built in command */
                        menu_item = menu->menu_items;
                        for (reply = 0;
                            reply<menu->number_of_items; ++reply, ++menu_item) {
                                if (0 == strcmp(command, menu_item->selection))
                                        break;
                        }

                        if ((reply == menu->number_of_items)
                            || ((menu_item->attributes & LM_DIAG_wizard_mode)
                            && !lm_wizard_mode)
                            || (menu_item->attributes & LM_DIAG_no_select)) {
                                send_line(LM_DIAG_ERROR, "Invalid selection: %s \n",
                                        command);
                                break;
                        }
                        if (!(menu_item->attributes & LM_DIAG_dflt_msg_off)) {
                          /* a utility */
                          if (!is_specified(TOKEN_errors_on)) errors_on = LM_TRUE;
                          if (!is_specified(TOKEN_warnings_on)) warnings_on = LM_TRUE;
                          if (!is_specified(TOKEN_messages_on)) messages_on = LM_TRUE;
                        }
                        menu->current_selection = reply;
                        INTR_BEGIN {
                                if (menu->menu_items[menu->current_selection].attributes
                                    & LM_DIAG_no_repeat) {
                                        execute_routine(menu, 1); /* no c=t or r>1 */
                                } else {
                                        if (LM_TRUE == forever) {
                                                run_cont(menu);
                                                break;
                                        } else {
                                                execute_routine(menu, max_cycles);
                                        }
                                }
                        }
                        INTR_END

                        /* current_selection may be modified in execute_routine() */
                        menu->current_selection = reply;
                        if (menu->menu_items[menu->current_selection].attributes
                            & LM_DIAG_automatic_quit)
                        {       /* markp */
                                return FAILURE; /* quit */
                        }

                        if (!(menu->menu_items[menu->current_selection].attributes
                            & LM_DIAG_no_summary)) {
                                /* send_line(LM_DIAG_WRITE, "[PS4]\n"); */
                                print_summary(menu);
                        }
                        break;
                }
                return SUCCESS;
}

lm_acceptance_test(menu)
LM_DIAG_MENU *menu;
{
        INTR_INIT
        register long loop;
        long return_value = SUCCESS;

        INTR_BEGIN {
                lm_acceptance = LM_TRUE;
                for (loop = 0; (loop<max_cycles) || (forever == LM_TRUE);
                    loop++) {
                        if (SUCCESS != failure_count_check()) {
```

Copyright 1989 Logic Modeling Systems

SOURCE PROGRAM diags/lm_diags.c | DATE 5/23/89 | TIME 4:41:14 pm | PAGE # 12/23

LINE # SOURCE TEXT

```
                                        break;
                                }
                                if (execute_all(menu) != SUCCESS)
                                        return_value = FAILURE;
                                /* send_line(LM_DIAG_WRITE, "[PS5]\n"
                                print_summary(menu);
                        }
                        lm_acceptance = LM_FALSE;
                }
                INTR_GOT_ONE {
                        lm_acceptance = LM_FALSE;
                        /* send_line(LM_DIAG_WRITE, "[PS6]\n"); */
                        print_summary(menu);
                }
                INTR_END

                return return_value;
}

lm_all_test(menu)
LM_DIAG_MENU *menu;
{
                INTR_INIT
                register long loop;
                long return_value = SUCCESS;

                INTR_BEGIN {
                        lm_execute_all = LM_TRUE;
                        for (loop = 0;
                                (loop<max_cycles) || (forever == LM_TRUE); loop++) {
                                if (SUCCESS != failure_count_check()) {
                                  break;
                                }
                                if (execute_all(menu) != SUCCESS)
                                        return_value = FAILURE;
                                /* send_line(LM_DIAG_WRITE, "[PS7]\n"); */
                                print_summary(menu);
                        }
                        lm_execute_all = LM_FALSE;
                }
                INTR_GOT_ONE {
                        lm_execute_all = LM_FALSE;
                        /* send_line(LM_DIAG_WRITE, "[PS8]\n"); */
                        print_summary(menu);
                }
                INTR_END

                return return_value;
}

int promotion[] = {
                'g', 'a', 'r', 'g', 'a', 'm', 'e', 'l', '\0' /* fool "strings" */
};

promote()
{
                register int *i, c, retval = SUCCESS;

                (void) send_line(LM_DIAG_NULL, "Password: ");

                i = promotion;
                while (((c = lm_get_key()) != CR) && (c != LF)) {
#define ENGINEERING
#ifdef ENGINEERING
                        if (c == ctrl(p)) {
                                lm_wizard_mode = 1;
                                (void) send_line(LM_DIAG_NULL, "\nWelcome, Lazy.\n");
                                return SUCCESS;
                        }
#endif ENGINEERING
                        if (*i) {
                                if (c != *i++) {
                                        retval = FAILURE;
                                }
                        } else {
                                retval = FAILURE;
                        }
                }
                if (*i) {
                        retval = FAILURE;
                }

                if (retval == SUCCESS) {
                        lm_wizard_mode = 1;
                        (void) send_line(LM_DIAG_NULL, "\nWelcome, Master.\n");
                } else {
                        lm_wizard_mode = 0;
                        (void) send_line(LM_DIAG_NULL, "\nIntruder alert.\n");
                }
                return retval;
}

char *
get_identifier(command_line, identifier)
register char *command_line, *identifier;
{
                *identifier = '\0';

                while (is_space(*command_line))
                        ++command_line;

                if (!*command_line)
                        return 0;

                for (; is_ident(*command_line); *identifier++ = *command_line++)
                        ;
                *identifier = '\0';

                while (is_space(*command_line))
                        ++command_line;

                return command_line;
}

char *
new_get_parameter(string, token, value)
char *string;
long *token, *value;
{
                char parameter[80];
```

Copyright 1989 Logic Modeling Systems

| SOURCE PROGRAM | DATE | PAGE # |
|---|---|---|
| diags/lm_diags.c | 5/23/89 | 13/24 |
| | TIME 4:41:14 pm | |

LINE # SOURCE TEXT

```
        register char *s;

        /* If there is a syntax error, or undefined parameter, */
        /* set token = TOKEN_UNDEFINED, but return string */

        *token = TOKEN_UNDEFINED;
        *value = 0;

        if (!(s = get_identifier(string, parameter))) return 0;

        if (!*s) return 0;

        if ((*token = identify_token(parameter, &(nev_options[0])))
                == TOKEN_UNDEFINED)
                return string; /* undefined token */

        if (*s++ != '=')
                return string; /* syntax error */

        if (!(s = get_identifier(s, parameter))) return 0;

        /* Notice that we make no distinction between integer and boolean */
        /* parameters. I suspect that this is ok. */

        switch (parameter[0]) {
                case 'F':
                case 'f': *value = LM_FALSE; break;
                case 'T':
                case 't': *value = LM_TRUE; break;
                default: *value = atoi(parameter);
        }
        return s;
}

identify_token(string, token_pointer)
char *string;
struct token *token_pointer;
{
        register long length;

        length = strlen(string);
        for (; token_pointer->name; ++token_pointer)
                if (!strncmp(string, token_pointer->name,
                        max(length, token_pointer->length)))
                        return token_pointer->token;
        return TOKEN_UNDEFINED;
}

#define lower_case(c)   ((((c)>='A')&&((c)<='Z'))?((c)-'A'+'a'):(c))

lowerize(s)
register char *s;
{
        do {
                *s = lower_case(*s);
        } while (*s++);
}

/* io functions */

#ifdef CPU_DIAGS

/* network specific functions */


get_request(conn, cmd, text)
    CONNECTION  **conn;
    u_long      *cmd;
    char        *text;
{
    u_long      size;

    while (read_rx_fifo(conn, cmd, text, &size) == FAILURE)
        ;
    return size;
}

read_rx_fifo(conn, cmd, text, sizep)
    CONNECTION  **conn;
    u_long      *cmd;
    char        *text;
    u_long      *sizep;
{
    struct      fifo_entry     fifo;
    register u_long            size, i;
    static char message[] = "Modeler is running diagnostics.";

    /*   get data from fifo  */
    fifo.fifo_no = RX_FIFO;
    if (fifo_get(&fifo) == SUCCESS) {
        if ((fifo.user != Fifo_user) || (fifo.task != Fifo_task)) {
            /* We must have switched modes */
            Fifo_user = fifo.user;
            Fifo_task = fifo.task;
            intr(); /* does not return */
        }
        switch (fifo.task) {
        case RECEIVE_TASK_ID:
            *conn = table_of_conns[fifo.user];
            *cmd = LM_GET_LONG(*conn);
            if (*cmd == LM_DIAG_END) {
                /* host requesting death */
                LM_CHK_PUT_LONG(*conn, LM_DIAG_END);
                LM_CHK_PUT_LONG(*conn, 4);
                lm_send_reply(*conn);
                sc_delay(100);
                lm_reset_cpu(); /* we're history */
            }
            size = LM_GET_LONG(*conn) - 4;
            *sizep = size;
            if (size > MAX_SERVER_PACKET) {
                printf("[BOGUS PACKET SIZE]\n");
                return FAILURE;
            }
            for (i=0; i<size; i++) {
                *text++ = LM_GET_CHAR(*conn);
            }
            *text = NULL;
            return SUCCESS;
        case SERIAL_TASK_ID:
```

Copyright 1989 Logic Modeling Systems

SOURCE PROGRAM diags/lm_diags.c | DATE 5/23/89 | TIME 4:41:14 pm | PAGE # 14/25

LINE # SOURCE TEXT

```
            *text++ = (char)fifo.data;
            *text++ = NULL;
            *sizep = 1;
            return SUCCESS;
        }
    }
    return FAILURE; /* wrong device talking */
}

#define ONE_SECOND      200 /* ticks at 200 ticks/sec */

net_check_key()
{
    CONNECTION  *conn;
    u_long cmd;
    char buffer[MAX_SERVER_PACKET];
    long returnval;
    static u_long last_check_over_the_net = 0;

    if ((lm_tick < (last_check_over_the_net + ONE_SECOND))
        && (lm_tick >= last_check_over_the_net))
            return FALSE;

    get_request(&conn, &cmd, buffer);
    LM_CHK_PUT_LONG(conn, LM_DIAG_CHECKKEY);
    LM_CHK_PUT_LONG(conn, (u_long) 4);
    lm_send_reply(conn);

    get_request(&conn, &cmd, buffer);
    if (cmd == LM_DIAG_GOTKEY) {
        returnval = (long)(buffer[0]);
    } else if (cmd == LM_DIAG_NOKEY) {
        returnval = FALSE;
    } else {
        /* error condition! */
        returnval = FALSE;
    }
    LM_CHK_PUT_LONG(conn, LM_DIAG_GOTIT);
    LM_CHK_PUT_LONG(conn, (u_long) 4);
    lm_send_reply(conn);
    last_check_over_the_net = lm_tick;
    return returnval;
}

static char
net_get_key()
{
    CONNECTION  *conn;
    u_long cmd;
    char buffer[MAX_SERVER_PACKET];
    char c;

    get_request(&conn, &cmd, buffer);
    LM_CHK_PUT_LONG(conn, LM_DIAG_GETKEY);
    LM_CHK_PUT_LONG(conn, (u_long) 4);
    lm_send_reply(conn);

    get_request(&conn, &cmd, buffer);
    if (cmd == LM_DIAG_GETKEY) {
        c = buffer[0];
    } else {
        /* error condition! */
        c = -1;
    }
    LM_CHK_PUT_LONG(conn, LM_DIAG_GOTIT);
    LM_CHK_PUT_LONG(conn, (u_long) 4);
    lm_send_reply(conn);
    return c;
}

static char *
net_get_line(reply, len)
char    *reply;
long    len;
{
    CONNECTION  *conn;
    u_long cmd;
    char buffer[MAX_SERVER_PACKET];
    long size;

    get_request(&conn, &cmd, buffer);
    LM_CHK_PUT_LONG(conn, LM_DIAG_GETLINE);
    LM_CHK_PUT_LONG(conn, (u_long) 4);
    lm_send_reply(conn);

    size = get_request(&conn, &cmd, buffer);
    if (cmd == LM_DIAG_GETLINE) {
            LM_CHK_PUT_LONG(conn, LM_DIAG_GOTIT);
            LM_CHK_PUT_LONG(conn, (u_long) 4);
    } else {
        /* error condition! */
        *reply = '\0';
    }
    lm_send_reply(conn);
    if (size >= len)
        buffer[len - 1] = '\0';
    else
        buffer[size] = '\0';
    (void) strcpy(reply, buffer);
    return reply;
}

net_get_selection(string_reply)
        char    *string_reply;
{
    CONNECTION  *conn;
    u_long cmd;

    get_request(&conn, &cmd, string_reply);
    LM_CHK_PUT_LONG(conn, LM_DIAG_SELECT);
    LM_CHK_PUT_LONG(conn, (u_long) 4);
    lm_send_reply(conn);

    get_request(&conn, &cmd, string_reply);
    LM_CHK_PUT_LONG(conn, LM_DIAG_GOTIT);
    LM_CHK_PUT_LONG(conn, (u_long) 4);
    lm_send_reply(conn);
}

net_report_failure()
```

Copyright 1989 Logic Modeling Systems

SOURCE PROGRAM diags/lm_diags.c | DATE 5/23/89 | TIME 4:41:14 pm | PAGE # 15/26

LINE # SOURCE TEXT

```
{
    CONNECTION  *conn;
    u_long cmd;
    char buffer[MAX_SERVER_PACKET];

    get_request(&conn, &cmd, buffer);
    LM_CHK_PUT_LONG(conn, LM_DIAG_TEST_FAILED);
    LM_CHK_PUT_LONG(conn, (u_long) 4);
    lm_send_reply(conn);
}
#endif CPU_DIAGS
```

Copyright 1989
Logic Modeling Systems

SOURCE PROGRAM diags/mdl_menu.c

DATE 5/23/89 TIME 4:41:17 pm PAGE # 1/27

LINE # SOURCE TEXT

```
/* SCCS_ID: mdl_menu.c rev 1.1, 4/24/89 at 07:48:44      */

/***********************************************************************
 *        modeler_menu.c                                               *
 *                                                                     *
 *        Main .. .ler Menu                                            *
 *        used in diagnostics                                          *
 *                                                                     *
 ***********************************************************************/
#include "common.h"
#include "lm_diags.h"
#include "modeler_extn.h"
#include "mod_def.h"
#include "tmg.h"
#include "tmg_def.h"
#include "tmg_extn.h"
#include "pac.h"
#include "pac_def.h"
#include "pac_extn.h"
#include "magic.h"
#include "pel.h"
#include "diag_setjmp.h"
#include "intr.h"                     /* keyboard interrupt macros */

#define MENU_INDEX_DAT            0
#define MENU_INDEX_MIN_CNF        1
#define MENU_INDEX_TMG            2
#define MENU_INDEX_LANE_A         3
#define MENU_INDEX_LANE_B         4
#define MENU_INDEX_LANE_C         5
#define MENU_INDEX_LANE_D         6
#define MENU_INDEX_MULTI          7
#define MENU_INDEX_EXTCLK         8
#define MENU_INDEX_UTILS          9

int
diags()
{
  register int laneno;
  jmp_buf diag_interrupt;
  int acceptance_test();
  int min_config_test();
  int cpu_diag_disp();
  int tmg_diag_disp();
  int pac_or_pel_disp();
  int multi_lane_disp();
  int diag_util_disp();
  int external_clock_test_menu();
  char banner[128];
  extern char *lmsi_version;

  /* WARNING: DO NOT CHANGE ORDER OF THIS MENU WITHOUT UPDATING INDEX MACROS! */

  static LM_DIAG_MENU_ITEM menu_list[] =
  {
    {
      "1",
      "Diagnostic Adapter Tests",
      acceptance_test,
      LM_DIAG_user_utility | LM_DIAG_no_banner | LM_DIAG_dflt_msg_off,
      LM_DIAG_null
    },
    {
      "2",
      "Minimum Configuration Test",
      min_config_test,
      LM_DIAG_no_execute | LM_DIAG_log_results,
      LM_DIAG_null
    },
    {
      "3",
      "Timing Generator Menu",
      tmg_diag_disp,
      LM_DIAG_another_menu,
      LM_DIAG_null
    },
    {
      "4",
      "Lane A: Pattern Controller and Pin Electronics Menu",
      pac_or_pel_disp,
      LM_DIAG_another_menu | LM_DIAG_acceptance,
      LM_DIAG_null,
      "A"
    },
    {
      "5",
      "Lane B: Pattern Controller and Pin Electronics Menu",
      pac_or_pel_disp,
      LM_DIAG_another_menu | LM_DIAG_acceptance,
      LM_DIAG_null,
      "B"
    },
    {
      "6",
      "Lane C: Pattern Controller and Pin Electronics Menu",
      pac_or_pel_disp,
      LM_DIAG_another_menu | LM_DIAG_acceptance,
      LM_DIAG_null,
      "C"
    },
    {
      "7",
      "Lane D: Pattern Controller and Pin Electronics Menu",
      pac_or_pel_disp,
      LM_DIAG_another_menu | LM_DIAG_acceptance,
      LM_DIAG_null,
      "D"
    },
    {
      "8",
      "Multi-lane Menu",
      multi_lane_disp,
      LM_DIAG_another_menu,
      LM_DIAG_null
    },
    {
      "9",
      "External Clock Menu",
      external_clock_test_menu,
      LM_DIAG_utility_menu,
```

Copyright 1989 Logic Modeling Systems

| SOURCE PROGRAM | DATE 5/23/89 | PAGE # 2/28 |
|---|---|---|
| diags/mdl_menu.c | TIME 4:41:17 pm | |

SOURCE TEXT

```
        LM_DIAG_null
      },
      {
        "10",
        "Modeler Diagnostic Utilities Menu",
        sg_util_disp,
        LM_DIAG_utility_menu,
        LM_DIAG_null
      },
      {
        "mincon",
        "Minimum Configuration Test",
        min_config_test,
        LM_DIAG_no_execute | LM_DIAG_log_results | LM_DIAG_no_display,
        LM_DIAG_null
      }
    };

    static LM_DIAG_MENU modeler_menu = {
      "LM-1000 DIAGNOSTICS",
      sizeof(menu_list) / sizeof(LM_DIAG_MENU_ITEM),
      0,
      menu_list
    };

    lm_select_mode(); /* tty or net */
    lm_banner("\nLM-1000 Diagnostics loaded.\n");
    lm_banner("%s\n", lmsi_version);

    diag_setjmp(diag_interrupt); /* the beginning of time */
    diag_jmpbuf = (jmp_buf *)diag_interrupt;

    while (1) {
      lm_diag_init();
      /* Initialize PAC information structure */
      pac_info_init();

      menu_list[MENU_INDEX_DAT].attributes |= LM_DIAG_no_select;
      menu_list[MENU_INDEX_TMG].attributes |= LM_DIAG_disable;
      menu_list[MENU_INDEX_LANE_A].attributes |= LM_DIAG_disable;
      menu_list[MENU_INDEX_LANE_B].attributes |= LM_DIAG_disable;
      menu_list[MENU_INDEX_LANE_C].attributes |= LM_DIAG_disable;
      menu_list[MENU_INDEX_LANE_D].attributes |= LM_DIAG_disable;
      menu_list[MENU_INDEX_MULTI].attributes |= LM_DIAG_disable;
      menu_list[MENU_INDEX_EXTCLK].attributes |= LM_DIAG_no_select;

      /* Probe hardware to determine the proper menu */
      if(probe_tmg() == SUCCESS)
      {
        menu_list[MENU_INDEX_TMG].attributes &= ~LM_DIAG_disable;
        menu_list[MENU_INDEX_EXTCLK].attributes &= ~LM_DIAG_no_select;

        /* Reset the backplane and such */
        if(tmg_init() != SUCCESS)
        {
          (void)lm_error("Timing Generator initialization failed.");
        }

        /* Enable menu items based on the number of populated lanes */
        for (laneno=0; laneno < NUMBER_OF_LANES; ++laneno)
        {
          if (probe_lane(laneno) == SUCCESS)
          {
            menu_list[laneno + MENU_INDEX_LANE_A].attributes &= ~LM_DIAG_disable;
            menu_list[MENU_INDEX_MULTI].attributes &= ~LM_DIAG_disable;
            menu_list[MENU_INDEX_DAT].attributes &= ~LM_DIAG_no_select;
          }
        }
      }

      /* Display main menu */
      lm_display_menu(&modeler_menu);
    }
  }

  external_clock_test_menu(parent_menu)
  LM_DIAG_MENU *parent_menu;
  {
    extern int tmg_freq_ext0(),
               tmg_freq_ext1();
    static LM_DIAG_MENU_ITEM menu_list[] =
    {
      {
        "1",
        "Measure Ext0 Frequency",
        tmg_freq_ext0,
        LM_DIAG_diag_routine,
        LM_DIAG_null
      },
      {
        "2",
        "Measure Ext1 Frequency",
        tmg_freq_ext1,
        LM_DIAG_diag_routine,
        LM_DIAG_null
      },
    };

    static LM_DIAG_MENU menu =
    {
      0,
      sizeof(menu_list) / sizeof(LM_DIAG_MENU_ITEM),
      0,
      menu_list
    };
    menu.title = parent_menu->
      menu_items[parent_menu->current_selection].menu_text;

    return lm_display_menu(&menu);
  }

  acceptance_test(menu)
  LM_DIAG_MENU *menu;
  {
    if (pel_count_ddabs() == 0) {
      lm_banner("No diagnostic adapters present\n");
      return SUCCESS;
    }

    if (lm_acceptance_test(menu) != SUCCESS)
```

Copyright 1989
Logic Modeling Systems

SOURCE PROGRAM: diags/mdl_menu.c | DATE: 5/23/89 | TIME: 4:41:17 pm | PAGE # 3/29

SOURCE TEXT

```
        return FAILURE;

    return SUCCESS;
}

min_config_test()
{
        int lane;
        int slot;
        int found_a_blank;
        int minimum;
        int illegal;
        static char gap_msg[]
            = "Empty slot to the left of Pin Electronics in Lane %c Slot %d\n";
        static char nopac_msg[]
            = "Lane %c has Pin Electronics but no Pattern Controller\n";

        /* Probe hardware to determine the proper menu */
        minimum = FAILURE;
        illegal = 0;
        if(probe_tmg() == SUCCESS) {
            for (lane=0; lane < NUMBER_OF_LANES; ++lane) {
                if(probe_all_pels(lane) == SUCCESS) {
                    if(probe_pac(lane) == SUCCESS) {
                        minimum = SUCCESS;
                        found_a_blank = 0;
                        for (slot = 0; slot < 8; ++slot) {
                            if(probe_pel(lane, slot) == SUCCESS) {
                                if (found_a_blank) {
                                    illegal = 1;
                                    lm_error(gap_msg, 'A' + lane, slot);
                                }
                            } else {
                                found_a_blank = 1;
                            }
                        }
                    } else {
                        lm_warning(nopac_msg, 'A' + lane);
                    }
                }
            }
            if (minimum == FAILURE)
                lm_error("No properly configured lanes present\n");
        } else
            lm_error("Timing generator not present\n");
        if (illegal) minimum = FAILURE;
        return(minimum);
}

static char picture_prototype[6][80] = {
    "Configuration\t        Key",
    "____________________       ______________________________________________",
    "_|______|________          T = Timing Generator        C = Pattern Controller",
    "_|______|________          m = 128K Pattern Memory     M = 512K Pattern Memory",
    "  |______|________         E = Pin Electronics         A = PEL with Device Adapter",
    "  |______|________         D = PEL with Diagnostic Adapter"
};

picture()
{
        int lane;
        int slot;
        int pam;
        int size;
        char printout[4][80];
        char *p;

        pac_info_init();          /* Initialize PAC information structure */
        pac_probe_all_pacs();
        for (lane = 0; lane < 4; ++lane) {
                strcpy(printout[lane], picture_prototype[lane + 2]);
        }
        if(probe_tmg() == SUCCESS)
                printout[0][0] = 'T';
        for (lane = 0; lane < 4; ++lane) {
                if(probe_pac(lane) == SUCCESS) {
                        printout[lane][2] = 'C';
                        pac_get_num_pams(lane);
                        for (pam = 0; pam < pac[lane].num_pams; ++pam) {
                                size = pac_get_pam_size(lane, pam);
                                if (size == 0x20000) {
                                        printout[lane][3 + pam] = 'm';
                                } else if (size == 0x80000) {
                                        printout[lane][3 + pam] = 'M';
                                }
                        }
                }
                for (slot = 0; slot < 8; ++slot) {
                        if(probe_pel(lane, slot) == SUCCESS) {
                                p = &(printout[lane][8 + slot]);
                                switch (what_dab(lane, slot)) {
                                case NO_DAB:
                                        *p = 'E';
                                        break;
                                case DIAG_DAB:
                                        *p = 'D';
                                        break;
                                case UNKNOWN_DAB:
                                        *p = 'A';
                                        break;
                                }
                        }
                }
        }
        lm_message("%s\n", picture_prototype[0]);
        lm_message("%s\n", picture_prototype[1]);
        for (lane = 0; lane < 4; ++lane) {
                lm_message("%s\n", printout[lane]);
        }
        return SUCCESS;
}

#define MENU_INDEX_PAC          0
#define MENU_INDEX_PEL_0        1

/**********************************************************************
 *      PAC or PEL Menu                                               *
 **********************************************************************/
pac_or_pel_disp(parent_menu, lane_sel)
LM_DIAG_MENU *parent_menu;
```

Copyright 1989
Logic Modeling Systems

SOURCE PROGRAM diags/mdl_menu.c | DATE 5/23/89 | TIME 4:41:17 pm | PAGE # 4/30

SOURCE TEXT

```
char *lane_sel;
{
  char buffer[80];
  register int pelno;
  static char pac_selection[80];
  static char pac_menu_text[80];
  static char pac_user_data[80];
  static char pel_selection[NUMBER_OF_PELS][80];
  static char pel_menu_text[NUMBER_OF_PELS][80];
  static char pel_user_data[NUMBER_OF_PELS][80];
  static LM_DIAG_MENU_ITEM menu_list[NUMBER_OF_PELS + 1];
  static LM_DIAG_MENU pac_pel_menu;
  int pac_diag_disp();
  int pel_menu();

  sprintf(buffer,"LANE %c PAC/PEL DIAGNOSTICS",
    *lane_sel);
  /* pac_pel_menu.title = buffer; */
  pac_pel_menu.title
    = parent_menu->menu_items[parent_menu->current_selection].menu_text;

  sprintf(pac_selection, "%d", 1);
  sprintf(pac_menu_text, "Lane %c Pattern Controller Menu", *lane_sel);
  sprintf(pac_user_data, "%d", 0);
  pac_pel_menu.current_selection = 0;
  pac_pel_menu.menu_items = menu_list;
  pac_pel_menu.number_of_items = sizeof(menu_list) / sizeof(LM_DIAG_MENU_ITEM);

  menu_list[0].selection = pac_selection;
  menu_list[0].menu_text = pac_menu_text;
  menu_list[0].action_routine = pac_diag_disp;
  menu_list[0].attributes = LM_DIAG_another_menu;
  menu_list[0].status = LM_DIAG_null;
  menu_list[0].user_data = pac_user_data;

  for (pelno=0; pelno < NUMBER_OF_PELS; ++pelno) {
    sprintf(pel_selection[pelno], "%d", 2 + pelno);
    sprintf(pel_menu_text[pelno], "Lane %c Pin Electronics Module %d Menu",
      *lane_sel, pelno);
    sprintf(pel_user_data[pelno], "%d", pelno);

    menu_list[pelno + MENU_INDEX_PEL_0].selection = pel_selection[pelno];
    menu_list[pelno + MENU_INDEX_PEL_0].menu_text = pel_menu_text[pelno];
    menu_list[pelno + MENU_INDEX_PEL_0].action_routine = pel_menu;
    menu_list[pelno + MENU_INDEX_PEL_0].attributes
      = LM_DIAG_another_menu | LM_DIAG_acceptance;
    menu_list[pelno + MENU_INDEX_PEL_0].status = LM_DIAG_null;
    menu_list[pelno + MENU_INDEX_PEL_0].user_data = pel_user_data[pelno];
  }

  if (!Host) {
    /* Init TMG without asserting backplane reset */
    if(tmg_reset(FALSE) != SUCCESS) {
      (void)lm_error("Could not initialize timing generator.\n");
      return(FAILURE);
    }
    /* Set global lane variable */
    switch(*lane_sel) {
      case 'A':
        current_lane = 0;
        break;
      case 'B':
        current_lane = 1;
        break;
      case 'C':
        current_lane = 2;
        break;
      case 'D':
        current_lane = 3;
        break;
      default:
        (void)lm_error("Software problem: Lane select unknown).\n");
        current_lane = 0;
        break;
    }

    /* Select the current lane for pattern play */
    Lane_select(Lane_code(current_lane));

    /* Check to see if there is a PAC in the lane */
    if(probe_pac(current_lane) != SUCCESS) { /* No PAC in the lane */
      menu_list[MENU_INDEX_PAC].attributes |= LM_DIAG_disable;
    } else {
      /* there is at least a pac in the lane */
      menu_list[MENU_INDEX_PAC].attributes &= ~LM_DIAG_disable;

      pac[current_lane].exists = TRUE;  /* Log PAC into info structure */

      /* Since there is a PAC in the lane, configure it */
      if((Lane_code(current_lane) & configured_lanes) != 0) {
        if(pac_stack_pams(current_lane) != SUCCESS) {
          (void)lm_error("Unable to configure previously configured PAC.\n");
          configured_lanes -= Lane_code(current_lane);
        }
      } else { /* PAC not yet configured */
        if(pac_stack_pams(current_lane) != SUCCESS) {
          (void)lm_error("Unable to configure PAC.\n");
        } else {
          (void)pac_clear_pat_ _(current_lane);
          configured_lanes += Lane_code(current_lane);
        }
      }
    }
    /* now lets look for pels */
    for (pelno=0; pelno < NUMBER_OF_PELS; ++pelno) {
      if (probe_pel(current_lane, pelno) != SUCCESS) {
        menu_list[pelno + MENU_INDEX_PEL_0].attributes |= LM_DIAG_disable;
      } else {
        menu_list[pelno + MENU_INDEX_PEL_0].attributes &= ~LM_DIAG_disable;
      }
    }
  }
  return lm_display_menu(&pac_pel_menu);
}

/********************************************************************
 *      Modeler Diagnostic Utilities Menu                           *
 ********************************************************************/
diag_util_disp(parent_menu)
LM_DIAG_MENU *parent_menu;
```

Copyright 1989 Logic Modeling Systems

| SOURCE PROGRAM | DATE | PAGE # |
|---|---|---|
| diags/mdl_menu.c | 5/23/89 TIME 4:41:17 pm | 5/31 |

LINE # SOURCE TEXT

```
{
  int diag_display();
  int diag_reset();
  int diag_cycle_addr();
  int diag_mem_test();
  int debugger();
  int picture();
  static LM_DIAG_MENU_ITEM menu_list[] =
  {
    {
      "1",
      "Display Modeler Configuration",
      diag_display,
      LM_DIAG_utility | LM_DIAG_no_banner,
      LM_DIAG_null
    },
    {
      "2",
      "Display Modeler Configuration Picture",
      picture,
      LM_DIAG_utility | LM_DIAG_no_banner,
      LM_DIAG_null
    },
    {
      "3",
      "Reset Timing Generator and Backplane",
      diag_reset,
      LM_DIAG_utility,
      LM_DIAG_null
    },
    {
      "4",
      "Cycle on Address",
      diag_cycle_addr,
      LM_DIAG_utility,
      LM_DIAG_null
    },
    {
      "5",
      "Debugger",
      debugger,
      LM_DIAG_utility | LM_DIAG_no_banner,
      LM_DIAG_null
    },
  };

  static LM_DIAG_MENU diag_util_menu =
  {
    "DIAGNOSTIC UTILITIES MENU",
    sizeof(menu_list) / sizeof(LM_DIAG_MENU_ITEM),
    0,
    menu_list
  };
  diag_util_menu.title = parent_menu->
    menu_items[parent_menu->current_selection].menu_text;

  return lm_display_menu(&diag_util_menu);
}

/**************************************************************************
 *       Multi-lane Tests Menu                                            *
 **************************************************************************/
multi_lane_disp(parent_menu)
LM_DIAG_MENU *parent_menu;
{
  int diag_lane_error();
  int diag_pel_ctrl();
  static LM_DIAG_MENU_ITEM menu_list[] =
  {
    {
      "1",
      "Pattern Controller Synchronization Test",
      diag_lane_error,
      LM_DIAG_diag_routine,
      LM_DIAG_null
    },
    {
      "2",
      "Pin Electronics Control Test",
      diag_pel_ctrl,
      LM_DIAG_diag_routine,
      LM_DIAG_null
    }
  };

  static LM_DIAG_MENU diag_multi_menu =
  {
    "MULTI-LANE TEST MENU",
    sizeof(menu_list) / sizeof(LM_DIAG_MENU_ITEM),
    0,
    menu_list
  };
  diag_multi_menu.title = parent_menu->
    menu_items[parent_menu->current_selection].menu_text;

  if (!Host)
  {
    if(diag_tmg_reset(TRUE) != SUCCESS)
    {
      (void)lm_error("Multi-lane tests: cannot reset Timing Generator.\n");
      return(FAILURE);
    }

    pac_configure_all_pacs();
    if(configured_lanes == NONE)
    {
      (void)lm_error("Unable to configure PACs in any lane.\n");
      return(FAILURE);
    }
  }

  return lm_display_menu(&diag_multi_menu);
}
```

Copyright 1989 Logic Modeling Systems

| SOURCE PROGRAM | DATE | TIME | PAGE # |
|---|---|---|---|
| diags/mdl_menu_diag.c | 5/23/89 | 4:41:17 pm | 1/32 |

SOURCE TEXT

```
/* SCCS_ID: mdl_menu_diag.c rev 3.3, 5/9/89 at 16:04:44     */

/***********************************************************************
 *       modeler_menu_diag.c                                           *
 *                                                                     *
 *       Main Functions called directly by Modeler Menu                *
 *       used in diagnostics                                           *
 *                                                                     *
 ***********************************************************************/
#include "common.h"
#include "lm_diags.h"
#include "cpu.h"
#include "mod_def.h"
#include "modeler_extn.h"
#include "tmg.h"
#include "tmg_def.h"
#include "tmg_extn.h"
#include "pac.h"
#include "pac_def.h"
#include "pac_extn.h"
#include "magic.h"
#include "pel.h"
#include "id.h"


/*
 *       diag_mem_test()
 *
 *       OUTPUT  = returns SUCCESS or FAILURE
 *       DESCRIPTION: Allows user to perform memory
 *       test on memory specified by user.
 */
diag_mem_test()
{
  (void)lm_message("Function not yet implemented, try again later.\n");
  return(SUCCESS);
}


/*
 *       diag_cycle_addr()
 *
 *       OUTPUT  = returns SUCCESS or FAILURE
 *       DESCRIPTION: Continuously writes or reads
 *       location specified by user.  The function
 *       either "probes" the location if the access
 *       generates a bus error, or reads/writes the
 *       location if the access is successful.
 */
diag_cycle_addr()
{
  u_long data_value;
  u_long address;
  int input;
  char mode[2];
  char buffer[80];
  char *lm_get_line();

  do {
    (void)lm_message("Enter w[bsl] to write, r[bsl] to read, q to quit: ");
    lm_get_line(buffer);
    if (buffer[0] == 'q') return SUCCESS;
  } while((buffer[0] != 'w') && (buffer[0] != 'r'));
  mode[0] = buffer[0];
  mode[1] = buffer[1];
  while((mode[1] != 'b') && (mode[1] != 's') && (mode[1] != 'l')) {
    (void)lm_message("Enter b, s or l for byte, short, or long (q to quit): ");
    lm_get_line(buffer);
    if (buffer[0] == 'q') return SUCCESS;
    mode[1] = buffer[0];
  }
  if(mode[0] == 'w')
  {
    data_value = 0l;
    (void)lm_message("Enter data value to write (enter in hex).\n");
    switch (mode[1]) {
      case 'b':
        diag_get_uhex(&data_value, "value", 0l, 0xFFl);
        break;
      case 's':
        diag_get_uhex(&data_value, "value", 0l, 0xFFFFl);
        break;
      case 'l':
        diag_get_uhex(&data_value, "value", 0l, 0xFFFFFFFFl);
        break;
    }
  }
  do
  {
    input = SUCCESS;
    address = LANE_A_OFFSET;
    (void)lm_message("Enter address value (enter in hex).\n");
    diag_get_uhex(&address, "value", 0l, 0xFFFFFFFFl);
    switch (mode[1]) {
      case 'b':
        break;
      case 's':
        if ((address & 0x01) != 0)
        {
          (void)lm_error("Address is not on short word boundary.\n");
          input = FAILURE;
        }
        break;
      case 'l':
        if((address & 0x03) != 0)
        {
          (void)lm_error("Address is not on long word boundary.\n");
          input = FAILURE;
        }
        break;
    }
  } while(input != SUCCESS);

  switch(mode[0])
  {
    case 'w':          /* write mode */
      if ((mode[1] == 'l')
       && (lm_write_probe((long)address, (long)data_value) != SUCCESS))
      {
        (void)lm_message("Bus error during access.\n");
```

Copyright 1989
Logic Modeling Systems

SOURCE PROGRAM diags/mdl_menu_diag.c | DATE 5/23/89 | TIME 4:41:17 pm | PAGE # 2/33

LINE # SOURCE TEXT

```
          (void)lm_message("Probing location %08X, hit key to exit.\n",
           address);
          while(lm_check_key() == 0)
            (void)lm_write_probe((long)address, (long)data_value);
          Clear_key_buf();
          (void)lm_message("Probing complete.\n");
        }
        else
        {
          (void)lm_message("Writing location %08X, hit key to exit.\n",
           address);
          switch (mode[1]) {
            case 'b':
              while(lm_check_key() == 0)
                *((u_char *)address) = (u_char)data_value;
              break;
            case 's':
              while(lm_check_key() == 0)
                *((u_short *)address) = (u_short)data_value;
              break;
            case 'l':
              while(lm_check_key() == 0)
                *((long *)address) = data_value;
              break;
          }
          Clear_key_buf();
          (void)lm_message("Writing complete.\n");
        }
        break;
      case 'r':            /* read mode */
        if((mode[1] == 'l') && (lm_read_probe((long)address) != SUCCESS))
        {
          (void)lm_message("Bus error during access.\n");
          (void)lm_message("Probing location %08X, hit key to exit.\n",
           address);
          while(lm_check_key() == 0)
            (void)lm_read_probe((long)address);
          Clear_key_buf();
          (void)lm_message("Probing complete.\n");
        }
        else
        {
          (void)lm_message("Reading location %08X, hit key to exit.\n",
           address);
          switch (mode[1]) {
            case 'b':
              while(lm_check_key() == 0)
                data_value = *((u_char *)address);
              break;
            case 's':
              while(lm_check_key() == 0)
                data_value = *((u_short *)address);
              break;
            case 'l':
              while(lm_check_key() == 0)
                data_value = *((long *)address);
              break;
          }
          Clear_key_buf();
          (void)lm_message("Reading complete.\n");
        }
        break;
      default:
        (void)lm_error("Software broken in diag_cycle_addr.\n");
        return(FAILURE);
  }
  return(SUCCESS);
}

/*
 *      diag_pel_ctrl()
 *
 *      OUTPUT  = returns SUCCESS or FAILURE
 *      DESCRIPTION: Performs mutli-lane test of
 *      TMC's ability to detect PEL control bits
 *      which do not match across lanes.
 */
diag_pel_ctrl()
{
  int returncode = SUCCESS;
  u_long pattern_no;
  int bit_no;

  if(diag_clear_errors() != SUCCESS)
    return(FAILURE);

  switch(configured_lanes)
  {
    case 1:
    case 2:
    case 4:
    case 8:
      (void)lm_message("Cannot perform test with less than two Pattern \
Controllers.\n");
      return(SUCCESS);
    default:
      break;
  }

  if(diag_multi_lane_play() != SUCCESS)
  {
    returncode = FAILURE;
    (void)lm_error("Multi-lane play did not succeed.\n");
    goto cleanup;
  }

  /* for each pac in 'configured_lanes' */
  for(current_lane = 0; current_lane < NUMBER_OF_LANES; current_lane++)
  {
    if(pac[current_lane].exists == TRUE)
    {
      for(pattern_no = 0; pattern_no < 8; pattern_no += 7)
      {
        for(bit_no = 0; bit_no < 3; bit_no++)
        {
          (void)pac_comp_pel_ctrl(pattern_no, bit_no);  /* complement bit*/
          pac_set_first_block(configured_lanes, 0);
          if(pac_play(TIMEOUT) != SUCCESS)
          {
            returncode = FAILURE;
```

Copyright 1989
Logic Modeling Systems

| SOURCE PROGRAM | DATE | TIME | PAGE # |
|---|---|---|---|
| diags/mdl_menu_diag.c | 5/23/89 | 4:41:17 pm | 3/34 |

SOURCE TEXT

```
              (void)lm_error("PEL Ctrl Error: Multi-lane play returned error.\n");
              goto cleanup;
            }
            if(!tmgptr->tmg_intr)
            {
              returncode = FAILURE;
              if(lm_error("%s\n%s\n",
                "PEL Ctrl Error: did not detect error caused by",
                "\tLane %c, pattern %d, bit %d.\n",
                current_lane + 'A', pattern_no, bit_no) != SUCCESS)
                  goto cleanup;
            }
            else
            {
              if(tmg_verify_pel_ctrl_error(configured_lanes,
               Lane_code(current_lane), bit_no) != SUCCESS)
              {
                returncode = FAILURE;
                (void)lm_error("PEL Ctrl Error: could not verify error.\n");
                if(tmg_display_error(configured_lanes) != SUCCESS)
                  goto cleanup;
              }
              if(tmg_clear_error() != SUCCESS)
              {
                returncode = FAILURE;
                (void)lm_error("PEL Ctrl Error: Cannot reset error.\n");
                goto cleanup;
              }
            }
            (void)pac_comp_pel_ctrl(pattern_no, bit_no);  /* complement bit*/
          }
        }
      }
    }
cleanup:
  if(tmg_clear_error() != SUCCESS)
  {
    returncode = FAILURE;
    (void)lm_error("Cannot reset error.\n");
  }
  pac_play_cleanup();
  tmgptr->tmg_intr_clearL = 0;
  tmgptr->tmg_intr_enable = 0;
  return(returncode);
}


/*
 *      diag_lane_error()
 *
 *      OUTPUT  = returns SUCCESS or FAILURE
 *      DESCRIPTION: Performs mutli-lane test of
 *      TMG's ability to detect data-valid signals
 *      which do not match across lanes.
 */
diag_lane_error()
{
  int returncode = SUCCESS;
  int special_case;

  if(diag_clear_errors() != SUCCESS)
    return(FAILURE);

  if(diag_multi_lane_play() != SUCCESS)
  {
    returncode = FAILURE;
    (void)lm_error("Multi-lane play did not succeed.\n");
    goto cleanup;
  }

  switch(configured_lanes)
  {
    case 1:
    case 2:
    case 4:
    case 8:
      special_case = TRUE;
      lm_message("Special case: only one Pattern Controller.\n");
      break;
    default:
      special_case = FALSE;
      break;
  }

  if(special_case == TRUE)                /* enable all lanes anyway      */
  {
    Lane_select(0x0f);  /* all lanes */
    pac_set_first_block(0x0f, 0);
    if(pac_play(TIMEOUT) != SUCCESS)
    {
      returncode = FAILURE;
      (void)lm_error("Sync Error: pac_play() returned error.\n");
      goto cleanup;
    }
    if(!tmgptr->tmg_intr)
    {
      returncode = FAILURE;
      if(lm_error("Sync Error: no error generated when desired.\n") != SUCCESS)
        goto cleanup;
    }
    else
    {
      if(tmg_verify_data_valid_error(0x0f, configured_lanes) != SUCCESS)
      {
        returncode = FAILURE;
        (void)lm_error("Sync Error: could not verify error.\n");
        if(tmg_display_error(0x0f) != SUCCESS)  /* all lanes    */
          goto cleanup;
      }
    }
  }
  else
  {

    /* for each pac in 'configured_lanes'       */
    for(current_lane = 0; current_lane < NUMBER_OF_LANES; current_lane++)
    {
      if(pac[current_lane].exists == TRUE)
      {
        /* Put stop bit in first location of pattern memory */
```

Copyright 1989 Logic Modeling Systems

| SOURCE PROGRAM | DATE | PAGE # |
|---|---|---|
| diags/mdl_menu_diag.c | 5/23/89 TIME 4:41:17 pm | 4/35 |

LINE # SOURCE TEXT

```
            *(u_long *)(pac[current_lane].lane_offset + BANK_2) = STOP;
            pac_set_first_block(configured_lanes, 0);
            if(pac_play(TIMEOUT) != SUCCESS)
            {
              returncode = FAILURE;
              (void)lm_error("Sync Error: pac_play() returned error.\n");
              goto cleanup;
            }
            if(!tmgptr->tmg_intr)
            {
              returncode = FAILURE;
              if(lm_error("Sync Error: did not detect error caused by\n\
\tLane %c with stop bit early.\n", current_lane + 'A') != SUCCESS)
                goto cleanup;
            }
            else
            {
              if(tmg_verify_data_valid_error(configured_lanes,
               Lane_code(current_lane)) != SUCCESS)
              {
                returncode = FAILURE;
                (void)lm_error(
                  "Sync Error: no error with lane %c stopping early.\n",
                  current_lane + 'A');
                if(tmg_display_error(configured_lanes) != SUCCESS)
                  goto cleanup;
              }
              if(tmg_clear_error() != SUCCESS)
              {
                returncode = FAILURE;
                (void)lm_error("Cannot reset error.\n");
                goto cleanup;
              }
              if(tmgptr->tmg_intr)
              {
                returncode = FAILURE;
                (void)lm_error("Sync Error: cannot reset error.\n");
                goto cleanup;
              }
            }
            /* Remove stop bit from first location of pattern memory */
            *(u_long *)(pac[current_lane].lane_offset + BANK_2) = 0L;
        }
      }
    }
cleanup:
  if(tmg_clear_error() != SUCCESS)
  {
    returncode = FAILURE;
    (void)lm_error("Cannot reset error.\n");
  }
  pac_play_cleanup();
  tmgptr->tmg_intr_clearL = 0;
  tmgptr->tmg_intr_enable = 0;
  return(returncode);
}

/*        diag_reset()
 *
 *        OUTPUT: return code = SUCCESS or FAILURE
 *        DESCRIPTION: Resets all lanes in modeler.
 */
diag_reset()
{
  return diag_tmg_reset(TRUE);
}

#define BOARDS_IN_LANE (NUMBER_OF_SLOTS + 1)

/*        diag_display()
 *
 *        OUTPUT: return code = SUCCESS or FAILURE
 *        DESCRIPTION: Displays modeler configuration
 */
diag_display()
{
  int boards_in_lane;
  int failures_in_lane;
  int lane_no;
  int slot_no;

  (void)lm_message("LM-1000 HARDWARE CONFIGURATION:\n\n");

  (void)diag_display_cpu();

  if(probe_tmg() != SUCCESS)
  {
    (void)lm_warning("Insure that CPU/Timing Generator cable is installed.\n");
    return(FAILURE);
  }

  (void)diag_display_tmg();

  /* Fill in .exists portion of PAC info structure */
  pac_probe_all_pacs();

  (void)lm_message("\n\t(hit return to continue)\n");
  while(lm_get_key() != '\n')
    ;

  for(lane_no = 0; lane_no < NUMBER_OF_LANES; ++lane_no)
  {
    boards_in_lane = 0;
    failures_in_lane = 0;

    (void)lm_message("\nLane %c Information:\n", 'A' + (char)lane_no);

    if(probe_pac(lane_no) == SUCCESS)
    {
      boards_in_lane++;
      if(diag_display_pac(lane_no) != SUCCESS)
        failures_in_lane++;
    }

    (void)lm_message("\n");
    for(slot_no = 0; slot_no < NUMBER_OF_SLOTS; slot_no++)
    {
      if(probe_pel(lane_no, slot_no) == SUCCESS)
      {
        boards_in_lane++;
```

| Copyright 1989 Logic Modeling Systems | SOURCE PROGRAM diags/mdl_menu_diag.c | DATE 5/23/89 | PAGE # |
|---|---|---|---|
| | | TIME 4:41:17 pm | 5/36 |

LINE # SOURCE TEXT

```
        if(diag_display_pel(lane_no, slot_no) != SUCCESS)
          failures_in_lane++;
        else {
          current_lane = lane_no;
          current_pel = slot_no;
          pel_dab_eeprom();
        }
      }
    }

    if(boards_in_lane == 0)
      (void)lm_message(" No boards in lane %c.\n", 'A' + (char)lane_no);
    else
    {
      if((boards_in_lane == BOARDS_IN_LANE) && (failures_in_lane ==
       BOARDS_IN_LANE))
        (void)lm_warning("Insure that Timing Generator is fully seated.\n");
    }
    (void)lm_message("\n\t(hit return to continue)\n");
    while(lm_get_key() != '\n')
      ;
  }
  return(SUCCESS);
}


/*      int diag_display_cpu()
 *
 *      INPUT:  none
 *      OUTPUT: return code = SUCCESS or FAILURE
 *      DESCRIPTION: Displays CPU board ID Prom information.
 *      Returns FAILURE if ID Prom checksum fails.
 */
int
diag_display_cpu()
{
  ID_PROM_CPU id_prom_table;
  ID_PROM_CPU *cpu_id_info = &id_prom_table;
  int i;

  (void)lm_message("CPU board: ");
  if(diag_get_id_info(CPU_ID_PROM, (char *)cpu_id_info) != SUCCESS)
  {
    (void)lm_message("Bad ID PROM\n");
    return(FAILURE);
  }
  diag_display_generic((ID_PROM_GENERIC *)cpu_id_info);
  /* Display other important info */
  (void)lm_message(" Total memory: %d MBytes.\n",
   (cpu_id_info->dram_size == 0xff) ? 256 : cpu_id_info->dram_size);
  (void)lm_message(" Ethernet address ");
  for(i = 0; i < 6; i++)
    (void)lm_message("%02X%c", cpu_id_info->ethernet[i], (i < 5) ? ':' : '\n');
  (void)lm_message(" Modeler model number: LM-%d.\n",
   cpu_id_info->model_number);
  return(SUCCESS);
}


/*      int diag_display_tmg()
 *
 *      INPUT:  none
 *      OUTPUT: return code = SUCCESS or FAILURE
 *      DESCRIPTION: Displays Timing Generator ID Prom information.
 *      Returns FAILURE if ID Prom checksum fails.
 */
int
diag_display_tmg()
{
  ID_PROM_TMG id_prom_table;
  ID_PROM_TMG *tmg_id_info = &id_prom_table;

  (void)lm_message("\nTiming Generator: ");
  if(diag_get_id_info(TMG_ID_PROM, (char *)tmg_id_info) != SUCCESS)
  {
    (void)lm_message("Bad ID PROM\n");
    return(FAILURE);
  }
  diag_display_generic((ID_PROM_GENERIC *)tmg_id_info);
  return(SUCCESS);
}


/*      int diag_display_pac(lane_no)
 *
 *      INPUT:  lane_no = lane number of Pattern Controller
 *      OUTPUT: return code = SUCCESS or FAILURE
 *      DESCRIPTION: Displays Pattern Controller ID Prom information.
 *      Returns FAILURE if ID Prom checksum fails.
 */
int
diag_display_pac(lane_no)
int lane_no;
{
  ID_PROM_PAC id_prom_table;
  ID_PROM_PAC *pac_id_info = &id_prom_table;
  int pam_no;

  (void)lm_message("\n  Pattern Controller: ");

  if(diag_get_id_info((int)((lane_no * LANE_SIZE) + LANE_A_PAC_ID_PROM),
    (char *)pac_id_info) != SUCCESS)
    (void)lm_message("Bad ID PROM\n");
  else
    diag_display_generic((ID_PROM_GENERIC *)pac_id_info);

  if(pac_get_num_pams(lane_no) != SUCCESS)
  {
    (void)lm_error("Could not display PAM information.\n");
    return(FAILURE);
  }
  for(pam_no =0; pam_no < pac[lane_no].num_pams; pam_no++)
  {
    (void)diag_display_pam(lane_no, pam_no);
  }
  return(SUCCESS);
}


/*      int diag_display_pam(lane_no, pam_no)
```

Copyright 1989
Logic Modeling Systems

LINE # SOURCE TEXT

```
 *
 *      INPUT:  lane_no = lane number of Pattern Controller
 *              pam_no = PAM number
 *      OUTPUT: return code = SUCCESS or FAILURE
 *      DESCRIPTION: Displays Pattern Memory Board ID Prom information.
 *      Returns FAILURE if ID Prom checksum fails.
 */
int
diag_display_pam(lane_no, pam_no)
int lane_no;
int pam_no;
{
  ID_PROM_PAM id_prom_table;
  ID_PROM_PAM *pam_id_info = &id_prom_table;

  (void)lm_message("   Pattern Memory #%d: ", pam_no);

  if(diag_get_id_info((int)((lane_no * LANE_SIZE) + LANE_A_PAM_ID_PROM +
   (pam_no * PAM_ID_SPACE)), (char *)pam_id_info)
   != SUCCESS)
  {
    (void)lm_message("Bad ID PROM\n");
    return(FAILURE);
  }
  (void)lm_message("%dK patterns, ", pam_id_info->patterns);
  diag_display_generic((ID_PROM_GENERIC *)pam_id_info);
  return(SUCCESS);
}



/*      int diag_display_pel()
 *
 *      INPUT:  lane_no = lane number of Pin Electronics Module
 *              slot_no = slot number of Pin Electronics Module
 *      OUTPUT: return code = SUCCESS or FAILURE
 *      DESCRIPTION: Displays Pin Electronics Module ID Prom information.
 *      Returns FAILURE if ID Prom checksum fails.
 */
int
diag_display_pel(lane_no, slot_no)
int lane_no;
int slot_no;
{
  ID_PROM_PEL id_prom_table;
  ID_PROM_PEL *pel_id_info = &id_prom_table;

  (void)lm_message("  Pin Electronics Module in slot %d: ", slot_no);

  if(diag_get_id_info((int)(pel_addr(lane_no, slot_no) + PEL_ID_PROM),
   (char *)pel_id_info) != SUCCESS)
  {
    (void)lm_message("Bad ID PROM\n");
    return(FAILURE);
  }
  diag_display_generic((ID_PROM_GENERIC *)pel_id_info);
  return(SUCCESS);
}


int
diag_get_id_info(id_prom_address, id_info)
int id_prom_address;
char *id_info;
{
  u_char *promptr;
  int byte_count;

  promptr = (u_char *)(id_prom_address);

  if(id_checksum(promptr) != ID_CHECKSUM_GOOD)
    return(FAILURE);

  for(byte_count= 0; byte_count < ID_NUM_BYTES; byte_count++)
  {
    *id_info++ = *promptr;
    promptr += 4;
  }
  return(SUCCESS);
}

diag_display_generic(id_info)
ID_PROM_GENERIC *id_info;
{
  id_stuff *ptr = &(id_info->generic);
  char eco[32];

  sprintf(eco, (ptr->eco_level < 32)? "%d" : "%c", ptr->eco_level);

  lm_message("Part no. %03d, Revision %c%s\n",
   ptr->board_type, ptr->revision, eco);
}
```

Copyright 1989
Logic Modeling Systems

| SOURCE PROGRAM | DATE | TIME | PAGE # |
|---|---|---|---|
| diags/modeler_diag.c | 5/23/89 | 4:41:18 pm | 1/38 |

LINE # SOURCE TEXT

```
/* SCCS_ID: modeler_diag.c rev 3.1, 4/24/89 at 07:48:51        */

/********************************************************************
 *      modeler_diag.c                                              *
 *                                                                  *
 *      Functions called by routines in modeler_menu_diag.c         *
 *      used in diagnostics                                         *
 *                                                                  *
 ********************************************************************/
#include "common.h"
#include "lm_diags.h"
#include "mod_def.h"
#include "modeler_extn.h"
#include "tmg.h"
#include "tmg_def.h"
#include "tmg_extn.h"
#include "pac.h"
#include "pac_def.h"
#include "pac_extn.h"

/*
 *      int diag_multi_lane_play()
 *
 *      INPUT   = none
 *      OUTPUT  = returns SUCCESS or FAILURE
 *      DESCRIPTION: Performs mutli-lane play.
 */
int
diag_multi_lane_play()
{
  /* verify no error condition exists now        */
  if(tmgptr->tmg_intr)
  {
    (void)lm_error("Muti-lane play : pre-existing error condition.\n");
    return(FAILURE);
  }

  tmgptr->tmg_intr_clearL = 1;  /* remove interrupt clear        */
  tmgptr->tmg_intr_enable = 1;  /* enable error checking         */

  /* setup and play good stuff in all lanes with PACs   */
  for(current_lane = 0; current_lane < NUMBER_OF_LANES; current_lane++)
  {
    if(pac[current_lane].exists == TRUE)
    {
      (void)pac_fill_pel_ctrl(PATTERNS_IN_128K);
    }
  }
  Lane_select(configured_lanes);
  pac_set_first_block(configured_lanes, 0);
  if(diag_play() != SUCCESS)
  {
    (void)lm_error("Multi-lane play : diag_play returned error.\n");
    pac_play_cleanup();
    return(FAILURE);
  }
  if(tmgptr->tmg_intr)
  {
    (void)lm_error("Multi-lane play : presentation caused error.\n");
    tmg_display_error(configured_lanes);
    tmg_clear_error();
    return(FAILURE);
  }
  return SUCCESS;
}
```

Copyright 1989
Logic Modeling Systems

| HEADER FILE | DATE | TIME | PAGE # |
|---|---|---|---|
| diags/modeler_extn.h | 5/23/89 | 4:41:18 pm | 1/39 |

LINE # HEADER TEXT

```
/* SCCS_ID: modeler_extn.h rev 3.1, 4/24/89 at 07:48:54 */

/*********************************************************************
 *      modeler_extn.h                                              *
 *                                                                  *
 *      External declarations of global variables                   *
 *      used in lm-1000 diagnostics                                 *
 *                                                                  *
 *********************************************************************/

extern int current_lane;        /* current lane being accessed
                                ** = NONE, LANE_A, LANE_B, LANE_C, or LANE_D */

extern int configured_lanes;    /* Lanes which have configured PACs */

extern long Host;       /* Host == 1 if not running on the modeler */
```

Copyright 1989 Logic Modeling Systems

| SOURCE PROGRAM | DATE | TIME | PAGE # |
|---|---|---|---|
| diags/modeler_glbl.c | 5/23/89 | 4:41:18 pm | 1/40 |

LINE # SOURCE TEXT

```
/* SCCS_ID: modeler_glbl.c rev 3.1, 4/24/89 at 07:48:57 */

/**********************************************************************
 *      modeler_glbl.c                                                 *
 *                                                                     *
 *      Global variables                                               *
 *      used in lm-1000 diagnostics                                    *
 *                                                                     *
 **********************************************************************/

#include "common.h"

int current_lane;          /* current lane being accessed
                           ** = NONE, LANE_A, LANE_B, LANE_C, or LANE_D */

int configured_lanes;   /* Lanes which have configured PACs */

long Host = 0; /* Host == 1 if not running on the modeler */
u_long *Host_memory = 0;
```

Copyright 1989
Logic Modeling Systems

SOURCE PROGRAM: diags/modeler_util.c | DATE: 5/23/89 | TIME: 4:41:18 pm | PAGE # 1/41

SOURCE TEXT

```
/* SCCS_ID: modeler_util.c rev 3.1, 4/24/89 at 07:49:00      */

/*********************************************************************
 *        modeler_util.c                                              *
 *                                                                    *
 *        Utility routines                                            *
 *        used in diagnostics                                         *
 *                                                                    *
 *********************************************************************/
#include "common.h"
#include "lm_diags.h"
#include "mod_def.h"
#include "modeler_extn.h"
#include "vrtx.h"
#include "tmg.h"
#include "tmg_def.h"
#include "tmg_extn.h"
#include "pac.h"
#include "pac_def.h"
#include "pac_extn.h"
#include "id.h"

int lm_message(), lm_warning(), lm_error();

/*        int diag_play()
 *
 *        INPUT:  none
 *        OUTPUT: returns SUCCESS or FAILURE
 *        DESCRIPTION: Sees if there are any backplane errors and attempts
 *        to clear any that exist. Returns FAILURE if backplane error still
 *        exits.
 */
int
diag_clear_errors()
{
  int lane;
  int pel_no;
  int returncode = SUCCESS;

  /* See if there are any backplane errors */
  if(Get_bp_error() == 0)
    return(SUCCESS);
  /* There are errors on the backplane */
  for(lane = 0; lane < NUMBER_OF_LANES; ++lane)
  {
    if((Lane_code(lane) & Get_bp_error()) != 0)
    {
      /* See what's driving the error line and attempt to clear the error */
      if(probe_pac(lane) == SUCCESS)
      {
        if(pac_check_errors(lane, lm_message) != SUCCESS)
          Clear_pac_errors(lane);
      }
      pel_no = 0;
      while(((Lane_code(lane) & Get_bp_error()) != 0) &&
       (pel_no < NUMBER_OF_PELS))
      {
        if(probe_pel(lane, pel_no) == SUCCESS)
        {
          if(pel_check_errors(lane, pel_no, lm_message) != SUCCESS)
            pel_disable_bp_error(lane, pel_no);
        }
        ++pel_no;
      }
    }
    if((Lane_code(lane) & Get_bp_error()) != 0)
    {
      returncode = FAILURE;
      (void)lm_error("Unable to remove backplane error from lane %c.\n",
       (char)lane + 'A');
    }
  }
  return(returncode);
}

report_bp_error()
{
  int lane;
  int pel_no;
  int returncode;

  /* See if there are any backplane errors */
  if((returncode = Get_bp_error()) == 0)
    return(returncode);
  /* There are errors on the backplane */
  for(lane = 0; lane < NUMBER_OF_LANES; ++lane)
  {
    if((Lane_code(lane) & Get_bp_error()) != 0)
    {
      (void)lm_error("There is a backplane error in lane %c.\n",
       (char)lane + 'A');
      /* See what's driving the error line */
      if(probe_pac(lane) == SUCCESS)
      {
        pac_check_errors(lane, lm_error);
      }
      for(pel_no = 0; pel_no < NUMBER_OF_PELS; ++pel_no)
      {
        if(probe_p[illegible] lane, pel_no) == SUCCESS)
        {
          pel_check_errors(lane, pel_no, lm_error);
        }
      }
    }
  }
  return(returncode);
}

/*       int diag_play()
 *
 *       INPUT:  none
 *       OUTPUT: returns SUCCESS or FAILURE
 *       DESCRIPTION: Sets up PAC clock speed reg, computes timeout,
 *       and performs a pattern play.
 */
int
diag_play()
{
  int timeout;
```

Copyright 1989 Logic Modeling Systems

| SOURCE PROGRAM | DATE | 5/23/89 | PAGE # |
|---|---|---|---|
| diags/modeler_util.c | TIME | 4:41:18 pm | 2/42 |

LINE # SOURCE TEXT

```
  if((timeout = pac_pre_play()) == 0)
  {
    (void)lm_error("Unable to prepare for pattern play.\n");
    return(FAILURE);
  }
  if(pac_play(timeout) != SUCCESS)
  {
    (void)lm_error("Pattern play fails.\n");
    return(FAILURE);
  }
  return(SUCCESS);
}


/*      void diag_get_long(&long_value, &prompt, low, high)
 *
 *      INPUT:  &long_value = address of long value
 *              &prompt = address of input prompt
 *              low = lower bound of input (input >= low)
 *              high = upper bound of input (input <= high)
 *      OUTPUT: none
 *      DESCRIPTION: Gets long value from keyboard.
 *      Checks bounds on input.
 */
void
diag_get_long(long_value, prompt, low, high)
long *long_value;
char *prompt;
long low;
long high;
{
  char reply[DIAG_MAX_INPUT];
  char buffer[1024];
  char *extra;
  register long answer_val;

  /* Get input from keyboard */
  sprintf(buffer, "Enter %s (%d): ", prompt, *long_value);
  do
  {
    lm_get_input(buffer, reply, DIAG_MAX_INPUT);
    if (reply[0] == '\0')
      return;
    answer_val = strtol(reply, &extra, 0);
    if((*extra == NULL) && (answer_val >= low) && (answer_val <= high))
    {
      *long_value = answer_val;
      return;
    }
  (void)lm_message("%d <= value <= %d\n", low, high);
  } while(1);
}

/*      void diag_get_ulong(&ulong_value, &prompt, low, high)
 *
 *      INPUT:  &ulong_value = address of unsigned long value
 *              &prompt = address of input prompt
 *              low = lower bound of input (input >= low)
 *              high = upper bound of input (input <= high)
 *      OUTPUT: none
 *      DESCRIPTION: Gets unsigned long value from keyboard.
 *      Checks bounds on input.
 */
void
diag_get_ulong(ulong_value, prompt, low, high)
u_long *ulong_value;
char *prompt;
u_long low;
u_long high;
{
  char reply[DIAG_MAX_INPUT];
  char buffer[1024];
  char *extra;
  register u_long answer_val;

  /* Get input from keyboard */
  sprintf(buffer, "Enter %s (%u): ", prompt, *ulong_value);
  do
  {
    lm_get_input(buffer, reply, DIAG_MAX_INPUT);
    if (reply[0] == '\0')
      return;
    answer_val = (u_long)strtol(reply, &extra, 0);
    if((*extra == NULL) && (answer_val >= low) && (answer_val <= high))
    {
      *ulong_value = answer_val;
      return;
    }
  (void)lm_message("%u <= value <= %u\n", low, high);
  } while(1);
}


/*      void diag_get_uhex(&ulong_value, &prompt, low, high)
 *
 *      INPUT:  &ulong_value = address of unsigned long hex value
 *              &prompt = address of input prompt
 *              low = lower bound of input (input >= low)
 *              high = upper bound of input (input <= high)
 *      OUTPUT: none
 *      DESCRIPTION: Gets unsigned long hex value from keyboard.
 *      Checks bounds on input.
 */
void
diag_get_uhex(ulong_value, prompt, low, high)
u_long *ulong_value;
char *prompt;
u_long low;
u_long high;
{
  char reply[DIAG_MAX_INPUT], *reply_ptr = reply;
  char buffer[1024];
  char *extra;
  register u_long answer_val;

  /* Place a leading 0x in front of the input */
  *reply_ptr++ = '0';
  *reply_ptr++ = 'x';
  /* Get input from keyboard */
  sprintf(buffer, "Enter %s (%X): ", prompt, *ulong_value);
```

Copyright 1989
Logic Modeling Systems

| SOURCE PROGRAM | DATE | PAGE # |
|---|---|---|
| diags/modeler_util.c | 5/23/89 | 3/43 |
| | TIME 4:41:18 pm | |

LINE # SOURCE TEXT

```
    do
    {
      lm_get_input(buffer, reply_ptr, DIAG_MAX_INPUT);
      if (*reply_ptr == '\0')
        return;
      answer_val = (u_long)strtol((reply_pt   2), &extra, 0);
      if((*extra == NULL) && (answer_val >= low) && (answer_val <= high))
      {
        *ulong_value = answer_val;
        return;
      }
    (void)lm_message("%X <= value <= %X\n", low, high);
    } while(1);
}


/*      int id_checksum(&address)
 *
 *      INPUT:  &address - pointer to first location of ID PROM
 *                         (Subsequent ID_NUM_BYTES-1 bytes are 4 bytes apart)
 *      OUTPUT: returns ID PROM checksum (8 bits)
 *      DESCRIPTION: Computes ID PROM checksum.
 *  Algorithm:
 *      initialize checksum to an arbitrary (but well-known) value
 *      for each byte (including checksum)
 *          circular left shift left checksum
 *          add data byte
 *          mask checksum to 8 bits
 */
int
id_checksum(address)
u_char *address;
{
    register int checksum;
    register u_long byte_count;

    checksum= ID_CHECKSUM_INIT;

    for (byte_count= 0; byte_count < ID_NUM_BYTES; byte_count++)
    {
        checksum= (checksum << 1) + ((checksum & 0x80) >> 7);
        checksum+= *(address + 4 * byte_count);
        checksum&= 0xFF;
    }
    return(checksum);
}
```

Copyright 1989
Logic Modeling Systems

| SOURCE PROGRAM | DATE 5/23/89 | PAGE # |
|---|---|---|
| diags/pac_diag.c | TIME 4:41:19 pm | 1/44 |

LINE # SOURCE TEXT

```
/* SCCS_ID: pac_diag.c rev 3.1, 4/24/89 at 07:49:03     */

/*********************************************************************
 *        pac_diag.c                                                 *
 *                                                                   *
 *        Diagnostic routines called by PAC menu functions           *
 *        used in PAC diagnostics                                    *
 *                                                                   *
 *********************************************************************/
#include "common.h"
#include "mod_def.h"
#include "modeler_extn.h"
#include "tmg.h"
#include "tmg_def.h"
#include "tmg_extn.h"
#include "pac.h"
#include "pac_def.h"
#include "pac_extn.h"
#include "id.h"


/*      int pac_parity_test(address)
 *
 *      INPUT:  address = pattern memory address (long word)
 *      OUTPUT: return code = SUCCESS or FAILURE
 *      DESCRIPTION: Performs extensive parity test on long word
 *      specified by 'address'.  Returns SUCCESS if test passes,
 *      FAILURE if test fails.
 */
int
pac_parity_test(address)
u_long address;
{
   int returncode = SUCCESS;

  /* Check for  existing parity errors  and clear them if nec */
  if((pacptr[current_lane]->high_word_parity_error == TRUE) ||
   (pacptr[current_lane]->low_word_parity_error == TRUE))
  Clear_pac_errors(current_lane);

  /* Perform parity tests, writing and reading with same parity */
  pacptr[current_lane]->high_word_parity = SET_EVEN_PARITY;
  if(good_parity_check(address) != SUCCESS)     /* High word, even parity */
  {
    returncode = FAILURE;
    if(lm_error("PAC parity test (high word, even parity).\n") != SUCCESS)
      goto cleanup;
  }
  pacptr[current_lane]->high_word_parity = SET_ODD_PARITY;
  if(good_parity_check(address) != SUCCESS)     /* High word, odd parity */
  {
    returncode = FAILURE;
    if(lm_error("PAC parity test (high word, odd parity).\n") != SUCCESS)
      goto cleanup;
  }
  pacptr[current_lane]->low_word_parity = SET_EVEN_PARITY;
  if(good_parity_check(address + 2) != SUCCESS) /* Low word, even parity */
  {
    returncode = FAILURE;
    if(lm_error("PAC parity test (low word, even parity).\n") != SUCCESS)
      goto cleanup;
  }
  pacptr[current_lane]->low_word_parity = SET_ODD_PARITY;
  if(good_parity_check(address + 2) != SUCCESS) /* Low word, odd parity */
  {
    returncode = FAILURE;
    if(lm_error("PAC parity test (low word, odd parity).\n") != SUCCESS)
      goto cleanup;
  }

  /* Perform parity tests, writing with odd parity */
  /* and reading with even parity */
  if(bad_parity_check(address) != SUCCESS)      /* High word parity */
  {
    returncode = FAILURE;
    if(lm_error("PAC parity test (high word, odd/even).\n") != SUCCESS)
      goto cleanup;
  }
  if(bad_parity_check(address + 2) != SUCCESS)  /* Low word parity */
  {
    returncode = FAILURE;
    (void)lm_error("PAC parity test (low word, odd/even).\n");
  }
cleanup:
  /* Restore parity circuits to ODD parity */
  Pac_set_parity(current_lane, SET_ODD_PARITY);
  return(returncode);
}


/*      void pac_build_fast_branch()
 *
 *      INPUT:  none
 *      OUTPUT: none
 *      DESCRIPTION: Places branch always instructions in
 *      second location of each block (except block near
 *      center of pattern memory). The link table is set up
 *      to branch from the outermost blocks toward the center
 *      of the memory, starting from the last block.
 */
void
pac_build_fast_branch()
{
  u_long *memptr;
  u_long block;
  u_long i;

  memptr = (u_long *)(pac[current_lane].lane_offset + BANK_2 + 4);
  /* Put branch instructions in second location of each block (minimum) */
  for(block = 0; block < pac[current_lane].num_blocks; ++block)
  {
    *memptr |= BRANCH_ALWAYS;
    memptr += BLOCK_SIZE;
  }

  /* Remove branch command in "middle" of pattern memory and */
  /* place stop command near branch location */
  memptr = (u_long*)(pac[current_lane].lane_offset + BANK_2 +
   4 * ((pac[current_lane].num_blocks/2 - 1) * BLOCK_SIZE + 1));
  *memptr &= NOP_MASK;
```

Copyright 1989 Logic Modeling Systems

SOURCE PROGRAM diags/pac_diag.c | DATE 5/23/89 | TIME 4:41:19 pm | PAGE # 2/45

LINE # SOURCE TEXT

```
    memptr += BRANCH_LATENCY - STOP_LATENCY;
    *memptr |= STOP;

    /* Fill up link table to branch toward the center of memory */
    memptr = (u_long *)(pac[current_lane].lane_offset + LINK_OFFSET);
    for(block = 0, i = pac[current_lane].num_blocks - 2;
     block < ((pac[current_lane].num_blocks >> 1) - 1); ++block, --i)
      *(memptr++) = i;
    *(memptr++) = pac[current_lane].num_blocks - 1;
    for(/* Old block and i */; block < pac[current_lane].num_blocks; ++block, --i)
      *(memptr++) = i;

   /* Set branch address register to start with last block */
   pacptr[current_lane]->branch_address = pac[current_lane].num_blocks - 1;
 }


/*      int pac_sweep_test(patterns)
 *
 *      INPUT:  patterns = number of patterns to be played
 *      OUTPUT: return code = SUCCESS or FAILURE
 *      DESCRIPTION: Plays patterns at various frequencies,
 *      measuring time of play and comparing with expected
 *      time.
 */
int
pac_sweep_test(patterns)
int patterns;
{
  int actual_time;
  int period_step;
  int period;
  int i;
  int returncode = SUCCESS;
  void setup_good_sample();

  /* Sweep from lowest frequency to 1 MHz (10 steps)*/
  pacptr[current_lane]->clock_speed = BELOW_1MHZ;
  period_step = (PAC_MAX_PERIOD - 1000)/9;
  (void)lm_message("Playing patterns");
  for(period = PAC_MAX_PERIOD, i = 0; i < 10; period -= period_step, i++)
  {
    (void)lm_message(".");
    if(pac_set_pattern_clock(period) != SUCCESS)
    {
      (void)lm_error("Sweep test could not set pattern clock.\n");
      return(FAILURE);
    }
    setup_good_sample(period * 1000);   /* needs period in ps   */
    tmgptr->sample_width = pac_compute_sample_width(period);
    if(pac_timed_play(period, patterns, &actual_time) != SUCCESS)
    {
      returncode = FAILURE;
      if(lm_error("Play timing failed during sweep test. Clock period = %d.\n",
       period) != SUCCESS)
        return(FAILURE);
    }
  }

  /* Sweep from 1 MHz to highest frequency (10 steps)*/
  pacptr[current_lane]->clock_speed = ABOVE_1MHZ;
  period_step = (1000 - PAC_MIN_PERIOD)/9;
  for(period = 1000, i = 0; i < 10; period -= period_step, i++)
  {
    (void)lm_message(".");
    if(pac_set_pattern_clock(period) != SUCCESS)
    {
      (void)lm_error("Sweep test could not set pattern clock.\n");
      return(FAILURE);
    }
    setup_good_sample(period * 1000);   /* needs period in ps   */
    tmgptr->sample_width = pac_compute_sample_width(period);
    if(pac_timed_play(period, patterns, &actual_time) != SUCCESS)
    {
      returncode = FAILURE;
      if(lm_error("Play timing failed during sweep test. Clock period = %d.\n",
       period) != SUCCESS)
        return(FAILURE);
    }
  }
  (void)lm_message("done.\n");
  return(returncode);
}

/*      int good_parity_check(address)
 *
 *      INPUT:  address = word address of pattern memory
 *      OUTPUT: return code = SUCCESS or FAILURE
 *      DESCRIPTION: Checks parity circuitry on PAC and PAM
 *      by writing and reading the location specified by 'address'.
 *      The location is written and read 32 times with a pattern of
 *      shifting ones and zeros.
 */
int
good_parity_check(address)
register u_long address;
{
  u_long i;
  int j;
  u_short temp;
  int returncode = SUCCESS;

  for(i=0, j=0; j < 32; i ^= (1 << (j++ & 0x0f)))
  {
    Write_word(address,i);
    temp = Read_word(address);
    if((pacptr[current_lane]->high_word_parity_error == TRUE) ||
     (pacptr[current_lane]->low_word_parity_error == TRUE))
    {
      returncode = FAILURE;
      Clear_pac_errors(current_lane);
      if(lm_error("PAC 'good' parity test. Address= %08x, DATA= %04x.\n",
       address, i) != SUCCESS)
        return(FAILURE);
    }
  }
#ifdef list
    if (temp); /* shut lint up */
#endif list
  return(returncode);
```

Copyright 1989
Logic Modeling Systems

| SOURCE PROGRAM | DATE | 5/23/89 | PAGE # |
|---|---|---|---|
| diags/pac_diag.c | TIME | 4:41:19 pm | 3/46 |

LINE # SOURCE TEXT

```
}

/*        int bad_parity_check(address)
 *
 *        INPUT:  address = word address of pattern memory
 *        OUTPUT: return code = SUCCESS or FAILURE
 *        DESCRIPTION: Checks parity circuitry on PAC and PAM
 *        by writing and reading the location specified by 'address'.
 *        The location is written and read 32 times with a pattern of
 *        shifting ones and zeros. The location is written with the
 *        parity set to 'odd' and then read with the parity set to
 *        'even'. This should create a parity error, latching the
 *        address. The latched address is compared with the actual
 *        address to see if this circuitry is working.
 */
int
bad_parity_check(address)
register u_long address;
{
  u_long i;
  int j;
  u_long read_addr;
  u_long expect_addr;
  u_short temp;
  int returncode = SUCCESS;

  switch(address & 0x02)          /* High or low word? */
  {
    case 0:                       /* High word test */
      for(i=0, j=0; j < 32; i ^= (1 << (j++ & 0x0f)))
      {
        pacptr[current_lane]->high_word_parity = SET_ODD_PARITY;
        Write_word(address,i);
        pacptr[current_lane]->high_word_parity = SET_EVEN_PARITY;
        temp = Read_word(address);
        if((pacptr[current_lane]->high_word_parity_error == TRUE) &&
         (pacptr[current_lane]->low_word_parity_error == FALSE))
        {
          if((read_addr = pacptr[current_lane]->parity_error_address) !=
           (expect_addr = (address >> 2) & 0x3FFFFFF))
          {
            returncode = FAILURE;
            if(lm_error("PAC parity address test. Expected = %07x, \
Actual = %07x.\n", expect_addr, read_addr) != SUCCESS)
              return(FAILURE);
          }
        }
        else
        {
          returncode = FAILURE;
          if(lm_error("PAC 'bad' parity test. Address = %08x, Data = %04x .\n",
           address, i) != SUCCESS)
            return(FAILURE);
        }
        Clear_pac_errors(current_lane);
      }
      break;
    case 2:                       /* Low word test */
      for(i=0, j=0; j < 32; i ^= (1 << (j++ & 0x0f)))
      {
        pacptr[current_lane]->low_word_parity = SET_ODD_PARITY;
        Write_word(address,i);
        pacptr[current_lane]->low_word_parity = SET_EVEN_PARITY;
        temp = Read_word(address);
        if((pacptr[current_lane]->high_word_parity_error == FALSE) &&
         (pacptr[current_lane]->low_word_parity_error == TRUE))
        {
          if((read_addr = pacptr[current_lane]->parity_error_address) !=
           (expect_addr = (address >> 2) & 0x3FFFFFF))
          {
            returncode = FAILURE;
            if(lm_error("PAC parity address test. Expected = %07x, \
Actual = %07x.\n", expect_addr, read_addr) != SUCCESS)
              return(FAILURE);
          }
        }
        else
        {
          returncode = FAILURE;
          if(lm_error("PAC 'bad' parity test. Address = %08x, Data = %04x .\n",
           address, i) != SUCCESS)
            return(FAILURE);
        }
        Clear_pac_errors(current_lane);
      }
      break;
    default:                      /* Bad address */
      return(FAILURE);
      break;
  }
#ifdef lint
    if (temp); /* shut lint up */
#endif lint
    return(returncode);
}


/*        int pam_idprom_test(lane_no)
 *
 *        INPUT:  lane_no = lane number to check PAM ID PROMS in
 *        OUTPUT: return code = SUCCESS or FAILURE
 *        DESCRIPTION: Performs checksum tests on PAM ID PROMs.
 *        The function returns SUCCESS if all of the checksums
 *        are correct, and returns FAILURE if any of the checksum
 *        tests fail.
 */
int
pam_idprom_test(lane_no)
int lane_no;
{
  int temp;
  int pamno;
  u_long base_address;
  int returncode = SUCCESS;

  base_address = pac[lane_no].lane_offset + PAM_ID;
  for(pamno = 0; pamno < pac[lane_no].num_pams; ++pamno)
  {
    if((temp = id_checksum((u_char *)(base_address + pamno * PAM_ID_SPACE + 3)))
     != ID_CHECKSUM_GOOD)
```

Copyright 1989 Logic Modeling Systems

SOURCE PROGRAM diags/pac_diag.c | DATE 5/23/89 | TIME 4:41:19 pm | PAGE # 4/47

SOURCE TEXT

```
      {
        returncode = FAILURE;
        if(lm_error("PAM %d ID PROM checksum. Expected = %02x. Actual = %02x.\n",
         pamno, ID_CHECKSUM_GOOD, temp) != SUCCESS)
          return(FAILURE);
      }
    }
  return(returncode);
}


/*      int pac_comp_pel_ctrl(pattern_no, bit_no)
 *
 *      INPUT:  pattern_no = pattern number, 0's counting
 *              bit_no = PEL control bit number (0, 1, or 2)
 *      OUTPUT: return code = SUCCESS or FAILURE
 *      DESCRIPTION: Complements the PEL control bit specified by
 *      bit_no in the pattern specified by pattern_no.  The function
 *      checks if the pattern number is within pattern memory.
 */
int
pac_comp_pel_ctrl(pattern_no, bit_no)
u_long pattern_no;
int bit_no;
{
  u_long address;

  if((pattern_no < 0) || (pattern_no > (pac[current_lane].num_patterns - 1)))
  {
    (void)lm_error("Pattern outside of pattern memory.\n");
    return(FAILURE);
  }
  address = pac[current_lane].lane_offset + BANK_2 + (4 * pattern_no);
  *(u_long *)address ^= 1 << (4 + bit_no);
  return(SUCCESS);
}


/*      int pac_fill_pel_ctrl(patterns)
 *
 *      INPUT:  patterns = number of patterns to fill
 *      OUTPUT: return code = SUCCESS or FAILURE
 *      DESCRIPTION: Fills the PEL control bits with a counting
 *      pattern for the number of patterns specified.  Pattern
 *      control is also written.
 */
int
pac_fill_pel_ctrl(patterns)
int patterns;
{
  register u_long *memptr;
  register int pat_no;

  if((patterns < 4) || (patterns > pac[current_lane].num_patterns))
  {
    (void)lm_error("Number of patterns invalid.\n");
    return(FAILURE);
  }
  memptr = (u_long *)(pac[current_lane].lane_offset + BANK_2);
  for(pat_no = 0; pat_no < patterns; pat_no++)
  {
    *memptr++ = (pat_no & 0x7) << 4;
  }
  if(build_pattern_control(0,patterns,STOP_MODE) != SUCCESS)
  {
    (void)lm_error("Could not build pattern control.\n");
    return(FAILURE);
  }
  return(SUCCESS);
}


/*      int pac_predict_offsets(pattern, error_latency, &branch_offset,
 *       &block_offset)
 *
 *      INPUT:  pattern = pattern number with parity error
 *              error_latency = number of patterns played after parity error
 *              &branch_offset = address of predicted branch_offset
 *              &block_offset = address of predicted block_offset
 *      OUTPUT: return code = SUCCESS or FAILURE
 *      DESCRIPTION: Given the specified pattern number, this function
 *      determines what the contents of the branch address and block offset
 *      registers would be after a pattern play. The function returns
 *      FAILURE if the pattern would not be played because of a STOP
 *      instruction in the block. Note: there must not be a parity error
 *      in pattern memory when this function is called. Nor should there
 *      be a parity error condition.
 */
int
pac_predict_offsets(pattern, error_latency, branch_offset, block_offset)
int pattern;
int error_latency;
int *branch_offset;
int *block_offset;
{
  u_long *memptr;
  int block[2];
  register int i;
  int branch_no;
  int stop_no;
  int played;
  int pattern_offset;

  /* Figure out which block number pattern is in */
  block[0] = pattern / BLOCK_SIZE;
  /* Figure out offset into  block */
  pattern_offset = pattern % BLOCK_SIZE;

  /* Assign "most probable" values to returned arguments (may be modified
     later in the function) */
  *branch_offset = block[0];
  *block_offset = (pattern_offset + error_latency) % BLOCK_SIZE;

  /* Search for branch and stop instructions */
  /* (assumes one and only one branch and/or stop per block) */
  memptr = (u_long *)(pac[current_lane].lane_offset + BANK_2 +
   block[0] * BLOCK_SIZE * 4);
  branch_no = -1;
  stop_no = -1;
  for(i = 0; i < BLOCK_SIZE; i++)
```

Copyright 1989
Logic Modeling Systems

SOURCE PROGRAM diags/pac_diag.c | DATE 5/23/89 | TIME 4:41:19 pm | PAGE # 5/48

SOURCE TEXT

```
    {
      if((*memptr & BRANCH_ALWAYS) != 01)
      {
        branch_no = i;
        break;
      }
      if((*memptr++ & STOP) != 01)
      {
        stop_no = i;
        break;
      }
    }
    if(branch_no == -1)   /* no branch found => only a stop command */
    {
      /* See if pattern gets played */
      if((stop_no + STOP_LATENCY) > pattern_offset)       /* pattern is played */
        return(SUCCESS);
      else              /* pattern is not played */
        return(FAILURE);
    }

    /* At this point there is at least a branch command */
    /* See if pattern with error is played before/during branch */
    if((branch_no + BRANCH_LATENCY) > pattern_offset)     /* pattern is played */
    {
      /* See if branch command is reached before halt */
      if((pattern_offset + error_latency - 2) > branch_no)        /* reached */
      {
        /* At this point, we can compute the block offset. We still do
           not know the correct branch offset.  The block offset is
           either correct, or if it occurs near the end of a branch, must
           be modified. */
        if((played = pattern_offset - (branch_no + BRANCH_LATENCY -
         error_latency - 4)) >= 0)        /* need to modify block_offset */
          *block_offset = (played + 0xfc) % BLOCK_SIZE;

        /* Now we must determine the correct block number */
        /* look up next block */
        block[1] = Read_long(pac[current_lane].lane_offset + LINK_OFFSET +
         block[0] * 4) & 0x7fff;
        /* See if block 2 is entered before halt */
        /* First, see how many patterns are played in block 1, if any */
        if((played = (pattern_offset + error_latency) -
         (branch_no + BRANCH_LATENCY + 2)) > 0)   /* patterns played in block 1 */
        {
          /* See if there is a branch command within the first "played"
             patterns in block 1, to see if we branch into block 2 */
          memptr = (u_long *)(pac[current_lane].lane_offset + BANK_2 +
           block[1] * BLOCK_SIZE * 4);
          for(i = 0; i < played; i++)
          {
            if((*memptr++ & BRANCH_ALWAYS) != 01)
              break;
          }
          if(i == played)         /* Did not get to block 2 */
          {
            *branch_offset = block[1];
            return(SUCCESS);
          }
          else                    /* Got to block 2 */
          {
            *branch_offset = Read_long(pac[current_lane].lane_offset +
             LINK_OFFSET + block[1] * 4) & 0x7fff;
            return(SUCCESS);
          }
        }
        else                  /* no patterns played in block 1 */
        {
          *branch_offset = block[1];
          return(SUCCESS);
        }
      }
      else                  /* branch is not reached */
        return(SUCCESS);
    }
    else            /* pattern is not played */
      return(FAILURE);
}


/*       void pac_build_walking_branch()
 *
 *       INPUT:  none
 *       OUTPUT: none
 *       DESCRIPTION: Places branch always instructions in
 *       decreasing locations in each block, for a total number
 *       of blocks equal to the number of possible branch locations
 *       within a block. The link table is set up to appropriately.
 */
void
pac_build_walking_branch()
{
  u_long *memptr;
  u_long *linkptr;
  u_long block;

  memptr = (u_long *)(pac[current_lane].lane_offset + BANK_2 +
   (4 * (2 * BLOCK_SIZE - BRANCH_LATENCY)));
  linkptr = (u_long *)(pac[c   nt_lane].lane_offset + LINK_OFFSET + 4);
  /* Put branch instructions in increasing locations in each block */
  /* and fill up link table */
  for(block = 0; block < MAX_BRANCHES; ++block)
  {
    *memptr |= BRANCH_ALWAYS;
    memptr += BLOCK_SIZE - 2;
    *linkptr++ = block + 2;
  }
}


/*
 *       void setup_good_sample(int)
 *
 *       This sets up a safe sample situation for tests that do not
 *       care about the placement of sample, only that "runt" samples
 *       do not occur.
 */
void
setup_good_sample(period)
int period;
```

Copyright 1989
Logic Modeling Systems

SOURCE PROGRAM diags/pac_diag.c | DATE 5/23/89 | TIME 4:41:19 pm | PAGE # 6/49

LINE # SOURCE TEXT

```
{
  int ramp;

  /* find the fastest safe ramp to use for Edge7        */
  for(ramp = 0; ramp < 3; ramp++)
    if(calib.EdgeMaxDelay[ramp] > period)
      break;

  /* set up some stuff on the TMG         */
  tmgptr->edge_delay_range = ramp;
  tmgptr->sample_delay_range = 0;        /* choose fastest ramp  */
  tmgptr->sample_mode = EDGE7SAMPLETRIGGERMODE;
  tmgptr->sample_trigger_threshold = calib.Edge7MinThresh[ramp];
  tmgptr->sample_delay = calib.SampleMinThresh[0];

}
```

Copyright 1989
Logic Modeling Systems

HEADER FILE diags/pac_extn.h

DATE 5/23/89 | TIME 4:41:19 pm | PAGE # 1/50

LINE # HEADER TEXT

```
/* SCCS_ID: pac_extn.h rev 3.1, 4/24/89 at 07:49:07     */

/*****************************************************************
 *      pac_extn.h                                               *
 *                                                               *
 *      External declarations of global variables                *
 *      used in PAC diagnostics                                  *
 *                                                               *
 *****************************************************************/

/* External variables */
extern PAC *pacptr[NUMBER_OF_LANES];     /* PAC board (one for each lane) */
extern PAC_INFO pac[NUMBER_OF_LANES];    /* PAC information table */
```

Copyright 1989
Logic Modeling Systems

| SOURCE PROGRAM | DATE | PAGE # |
|---|---|---|
| diags/pac_glbl.c | 5/23/89 | 1/51 |
| | TIME 4:41:19 pm | |

LINE # SOURCE TEXT

```
/* SCCS_ID: pac_glbl.c rev 3.1, 4/24/89 at 07:49:10    */

/*****************************************************************
 *      pac_glbl.c                                               *
 *                                                               *
 *      Global variables                                         *
 *      used in PAC diagnostics                                  *
 *                                                               *
 *****************************************************************/
#include "common.h"
#include "mod_def.h"
#include "pac.h"
#include "pac_def.h"

PAC *pacptr[NUMBER_OF_LANES];          /* PAC boards (one for each lane) */
PAC_INFO pac[NUMBER_OF_LANES];         /* PAC information table */
```

Copyright 1989
Logic Modeling Systems

| SOURCE PROGRAM | DATE | PAGE # |
|---|---|---|
| diags/pac_memtest.c | 5/23/89 TIME 4:41:19 pm | 1/52 |

LINE # SOURCE TEXT

```
/* SCCS_ID: pac_memtest.c rev 3.1, 4/24/89 at 07:49:15      */

/*****************************************************************************
 *        pac_memtest.c                                                      *
 *                                                                           *
 *        Memory test routines                                               *
 *        used in PAC diagnostics                                            *
 *                                                                           *
 *****************************************************************************/
#include "common.h"
#include "mod_def.h"
#include "modeler_exts.h"
#include "pac.h"
#include "pac_def.h"
#include "pac_exts.h"


typedef struct
{
  u_long bad_data_bits;
  u_long vrams1thru24;
  u_long vrams27thru50;
  int bad_parity_errors;
} MEM_ERRORS;



/*       void pac_init_mem_err(error_ptr)
 *
 *       INPUT:  error_ptr = pointer to memory error structure
 *       OUTPUT: none
 *       DESCRIPTION: Initializes pattern memory test error structure.
 */
void
pac_init_mem_err(error_ptr)
MEM_ERRORS *error_ptr;
{
  error_ptr->bad_data_bits = 0l;
  error_ptr->vrams1thru24 = 0l;
  error_ptr->vrams27thru50 = 0l;
  error_ptr->bad_parity_errors = FALSE;
}



/*       void pac_display_mem_err(error_ptr)
 *
 *       INPUT:  error_ptr = pointer to memory error structure
 *       OUTPUT: none
 *       DESCRIPTION: Displays pattern memory test error structure.
 */
void
pac_display_mem_err(error_ptr)
MEM_ERRORS *error_ptr;
{
  register int i;
  register u_long bad_ics;
  register int word;
  register int num_printed = 0;

  (void)lm_message("\nPattern Memory Failure Summary:\n\n");
  if(error_ptr->bad_data_bits != 0)
  {
    (void)lm_message("Bits which did not compare: %08X\n",
     error_ptr->bad_data_bits);
  }
  for(word = 0; word < 2; ++word)        /* word=0 => low word */
  {
    bad_ics = (word) ? error_ptr->vrams1thru24 : error_ptr->vrams27thru50;
    if(bad_ics != 0)
    {
      (void)lm_message("\n%s word memory ICs:\n", (word) ? "High" : "Low");
      num_printed = 0;
      for(i = 1; i < 25; ++i)
      {
        if(((1 << i) & bad_ics) != 0)
        {
          (void)lm_message(" U%d", (word) ? i : i + 26);
          ++num_printed;
        }
        if(num_printed > 12)
        {
          (void)lm_message("\n");
          num_printed = 0;
        }
      }
    }
  }
  if(num_printed != 0)
    (void)lm_message("\n");
  if(error_ptr->bad_parity_errors == TRUE)
    (void)lm_message("Parity memory is suspect.\n");
}



/*       int data_bus_test(address, error_ptr)
 *
 *       INPUT:  address = memory address
 *               error_ptr = pointer to memory error structure
 *       OUTPUT: returns SUCCESS or FAILURE
 *       DESCRIPTION: Performs data bus test on a  32-bit memory location.
 */
int
data_bus_test(address, error_ptr)
u_long address;
MEM_FRRORS *error_ptr;
{
  register u_long *memptr = (u_long *)address;
  register int i;
  register u_long expected;
  register u_long actual;
  register int returncode = SUCCESS;
  int invert_data;

  for(invert_data = 0; invert_data < 2; invert_data++)
  {
    for(i = 1; i <= (1 << 31); i <<= 1)
    {
      expected = (invert_data) ? ~i : i;
      *memptr = expected;
```

Copyright 1989
Logic Modeling Systems

SOURCE PROGRAM diags/pac_memtest.c | DATE 5/23/89 | TIME 4:41:19 pm | PAGE # 2/53

LINE # SOURCE TEXT

```
        if((actual = *memptr++) != expected)
        {
          returncode = FAILURE;
          if(pac_mem_error((u_long)(memptr - 1), expected, actual, error_ptr)
           != SUCCESS)
            re[illegible] (returncode);
        }
      }
    }
  return(returncode);
}


/*      int vram_test(pam_no, error_ptr)
 *
 *      INPUT:   pam_no = PAM number
 *               error_ptr = pointer to memory error structure
 *      OUTPUT: returns SUCCESS or FAILURE
 *      DESCRIPTION: Performs data bus test all video rams on specified PAM,
 *      excluding parity ram.
 */
int
vram_test(pam_no, error_ptr)
int pam_no;
MEM_ERRORS *error_ptr;
{
  register int bank_no;
  register u_long pam_base_address;
  register u_long bank_base_address;
  register int i;
  int returncode = SUCCESS;

  pam_base_address = Pam_base_address(current_lane, pam_no);
  for(bank_no = 0; bank_no < 3; bank_no++)
  {
    bank_base_address = (u_long)get_base_address(pam_no, bank_no);
    /* test the "even" and "odd" ICs in the bank */
    for(i = 0; i <= 4; i += 4)
    {
      if(data_bus_test(bank_base_address + i, error_ptr) != SUCCESS)
      {
        returncode = FAILURE;
        if(lm_error("Data bus test fails.\n") != SUCCESS)
          return(FAILURE);
      }
    }
  }
  return(returncode);
}


/*      int vram_parity_test(pam_no, error_ptr)
 *
 *      INPUT:   pam_no = PAM number
 *               error_ptr = pointer to memory error structure
 *      OUTPUT: returns SUCCESS or FAILURE
 *      DESCRIPTION: Performs data bus test on all parity video rams
 *      on selected PAM
 */
int
vram_parity_test(pam_no, error_ptr)
int pam_no;
MEM_ERRORS *error_ptr;
{
  register int bank_no;
  register int bit_pos;
  register u_long pam_base_address;
  register u_long ram_address;
  register int i;
  int returncode = SUCCESS;

  Clear_pac_errors(current_lane);
  pam_base_address = Pam_base_address(current_lane, pam_no);
  /* test the four parity ICs on the board */
  for(i = 0; i < 8; i += 2)
  {
    ram_address = pam_base_address + i;
    /* Write and read walking bit in parity ram (bank selects bit #) */
    for(bit_pos = 0; bit_pos < 3; bit_pos++)
    {
      /* write the bits */
      for(bank_no = 0; bank_no < 3; bank_no++)
      {
        Write_word(ram_address + (bank_no * PAT_MEM_BANK),
         (bank_no == bit_pos));
      }
      /* read the bits and check for parity errors */
      for(bank_no = 0; bank_no < 3; bank_no++)
      {
        (void)Read_word(ram_address + (bank_no * PAT_MEM_BANK));
        if(pac_parity_error_check(error_ptr) != SUCCESS)
          returncode = FAILURE;
      }
    }
  }
  return(returncode);
}


/*      int pac_test_a_pam(pam_no)
 *
 *      INPUT:  pam_no = pattern memory to test (0,1,2,or3)
 *      OUTPUT: returns SUCCESS or FAILURE
 *      DESCRIPTION: Performs pattern memory test on specified PAM.
 *      The procedure is as follows:
 *
 *      1) Perform an address line test
 *      1) Initialize the error structure and set the high and low
 *         parity generators to produce even parity.
 *      2) Clear pattern memory.
 *      3) Step through pattern memory, one bank at a time,
 *         reading zeros and writing ones. This test checks
 *         addressing and ability to clear all memory bits
 *         (stored as 1's in VRAM's).
 *      4) Step through pattern memory, one bank at a time,
 *         reading ones and checking for parity errors after
 *         each bank. This test checks ability to set all
 *         memory bits (stored as 0's in VRAM's), and parity
 *         VRAMS.
 *      5) Now set the high and low parity generators to produce
```

Copyright 1989 Logic Modeling Systems

LINE # SOURCE TEXT

```
 *          odd parity (default). Then clear all of pattern memory.
 *          This puts memory back in same state that it was in after
 *          step 2, except the parity memory bits are inverted.
 *      6) Step through pattern memory, one bank at a time,
 *          reading zeros and checking for parity errors after
 *          each bank. This test checks opposite state of parity VRAMS.
 *      7) Now perform a data bus test on each VRAM. This entails
 *          checking each bank, even and odd (6 locations), testing
 *          eight ICs at once (4 bits each) by performing a walking
 *          ones test followed by a walking zeros test.
 *      8) Finally, perform a walking ones/walking zeros test in
 *          each parity VRAM.
 */
int
pac_test_a_pam(pam_no)
int pam_no;
{
  MEM_ERRORS mem_errors, *err_ptr = &mem_errors;
  int returncode = SUCCESS;

  /* Perform an address line test */
  if(pam_addr_test(pam_no) != SUCCESS)
  {
    returncode = FAILURE;
    if(lm_error("Address line test on PAM %d failed.\n", pam_no) != SUCCESS)
      return FAILURE;
  }

  /* Initialize the pattern memory error structure */
  pac_init_mem_err(err_ptr);

  /* Set PAC for even parity */
  Pac_set_parity(current_lane, SET_EVEN_PARITY);

  /* Clear pattern memory */
  (void)pac_clear_a_pam(current_lane, pam_no);

  if(pac_read0s_write1s(pam_no, err_ptr) != SUCCESS)
  {
    returncode = FAILURE;
    if(lm_error("Pattern Memory %d fails \"read 0's, write 1's\" test.\n",
      pam_no) != SUCCESS)
      goto cleanup;
  }
  if(pac_read_value(pam_no, ~0l, err_ptr) != SUCCESS)
  {
    returncode = FAILURE;
    if(lm_error("Pattern Memory %d fails \"read 1's\" test.\n", pam_no)
      != SUCCESS)
      goto cleanup;
  }
  /* Set PAC back to odd parity */
  Pac_set_parity(current_lane, SET_ODD_PARITY);

  /* Clear pattern memory */
  (void)pac_clear_a_pam(current_lane, pam_no);

  if(pac_read_value(pam_no, 0l, err_ptr) != SUCCESS)
  {
    returncode = FAILURE;
    if(lm_error("Pattern Memory %d fails \"read 0's\" test.\n", pam_no)
      != SUCCESS)
      goto cleanup;
  }
  if(vram_test(pam_no, err_ptr) != SUCCESS)
  {
    returncode = FAILURE;
    if(lm_error("Pattern Memory %d data bus test fails.\n", pam_no)
      != SUCCESS)
      goto cleanup;
  }
  /* See if parity errors occurred during the previous tests */
  if(err_ptr->had_parity_errors == TRUE)
  {
    returncode = FAILURE;
    (void)lm_error("Parity errors occurred during memory tests.\n");
  }
  else if(returncode != FAILURE)
  /* Test the parity ram bus if all previous tests have passed */
  {
    if(vram_parity_test(pam_no, err_ptr) != SUCCESS)
    {
      returncode = FAILURE;
      (void)lm_error("Pattern Memory %d parity bus test fails.\n", pam_no);
    }
  }

cleanup:

  if(returncode != SUCCESS)
  {
    /* Restore odd parity and clear all PAC errors */
    Pac_set_parity(current_lane, SET_ODD_PARITY);
    Clear_pac_errors(current_lane);
    pac_display_mem_err(err_ptr);
  }
  return(returncode);
}


/* Address line test */
pam_addr_test(pam_no)
int pam_no;
{
  u_long *base;
  register int bank;
  register int bit;
  register int index;
  register int max_bits = bitcount(pac[current_lane].pam_size[pam_no]);
  register int high_offset = pac[current_lane].pam_size[pam_no] - 1;
  int returncode = SUCCESS;

  /* Clear walking 1's and walking 0's address locations in each bank */
  for (bank = 0; bank < 3; ++bank)
  {
    base = (u_long *)get_base_address(pam_no, bank);
    for (bit = 0; bit < max_bits; ++bit)
    {
      index = 1 << bit;
      base[index] = 0l;
```

Copyright 1989
Logic Modeling Systems

SOURCE PROGRAM diags/pac_memtest.c | DATE 5/23/89 | TIME 4:41:19 pm | PAGE # 4/55

LINE # SOURCE TEXT

```
        base[high_offset ^ index] = 01;
      }
    }

    for (bank = 0; bank < 3; ++bank)
    {
      base = (u_long *)get_base_address(pam_no, bank);
                                  /* Walking 1's */
      /* Verify that values are cleared */
      if(pac_verify_clear(pam_no, base, max_bits, 01, &returncode) != SUCCESS)
        return(FAILURE);
      base[0] = ~01;
      if (base[0] != ~01) /* verify that base address was set */
      {
        returncode = FAILURE;
        if(lm_error("PAM %d: Address %08X: Expected %08X, read %08X.\n",
            pam_no, base, ~01, base[0]) != SUCCESS)
          return FAILURE;
      }
      /* Verify that values are still cleared */
      if(pac_verify_clear(pam_no, base, max_bits, 01, &returncode) != SUCCESS)
        return(FAILURE);

                                  /* Walking 0's */
      if(pac_verify_clear(pam_no, base, max_bits, high_offset, &returncode)
        != SUCCESS)
        return(FAILURE);
      base[high_offset] = ~01;
      if (base[high_offset] != ~01)        /* verify that high address was set */
      {
        returncode = FAILURE;
        if(lm_error("PAM %d: Address %08X: Expected %08X, read %08X.\n",
            pam_no, &(base[high_offset]), ~01, base[high_offset]) != SUCCESS)
          return FAILURE;
      }
      if(pac_verify_clear(pam_no, base, max_bits, high_offset, &returncode)
        != SUCCESS)
        return(FAILURE);
    }
    return(returncode);
}

int
pac_verify_clear(pam_no, base, max_bits, offset, returncode)
int pam_no;
u_long *base;
int max_bits;
int offset;
int *returncode;
{
  register int bit;
  register int index;

  for (bit = 0; bit < max_bits; ++bit)
  {
    index = offset ^ (1 << bit);
    if (base[index] != 01)
    {
      *returncode = FAILURE;
      if(lm_error("PAM %d, Address %08X: Expected 0, read %08X.\n",
        pam_no, &(base[index]), base[index]) != SUCCESS)
        return(FAILURE);
    }
  }
  return(SUCCESS);
}

int
get_base_address(board, bank)
int board;
int bank;
{
  return Pattern_to_address(current_lane, bank,
    pac_get_first_pattern_no(current_lane, board));
}

int
bitcount(x)
{
  register int count;

  for (count = 0; x = (x >> 1); ++count)
    ;
  return(count);
}

/*      int pac_read0s_write1s(pam_no, err_ptr)
 *
 *      INPUT:  pam_no = PAM number
 *              err_ptr = pointer to memory error structure
 *      OUTPUT: returns SUCCESS or FAILURE
 *      DESCRIPTION: Performs test on pattern memory. Reads zeros
 *      and writes ones. The pattern memory must be zeroed before this
 *      routine is run.
 */
int
pac_read0s_write1s(pam_no, err_ptr)
int pam_no;
MEM_ERRORS *err_ptr;
{
  register u_long *memptr;
  register u_long temp;
  register u_long i;
  register int bank_no;
  register int returncode = SUCCESS;

  (void)lm_message("Reading 0's, writing 1's");
  for(bank_no = 0; bank_no < 3; bank_no++)
  {
    lm_message(".");    /* walking period before each bank */
    memptr = (u_long *)get_base_address(pam_no, bank_no);
    i = pac[current_lane].pam_size[pam_no];
    do
    {
      if((temp = *memptr) != 01)
      {
        returncode = FAILURE;
        if(pac_mem_error((u_long)memptr, 01, temp, err_ptr) != SUCCESS)
          return(returncode);
      }
```

Copyright 1989 Logic Modeling Systems

| SOURCE PROGRAM | DATE | PAGE # |
|---|---|---|
| diags/pac_memtest.c | 5/23/89 TIME 4:41:19 pm | 5/56 |

LINE # SOURCE TEXT

```
      *memptr++ = ~0l;
    } while (--i);
  }
  (void)lm_message("done.\n");
  return(returncode);
}

/*      int pac_parity_error_check(err_ptr)
 *
 *      INPUT:  err_ptr = pointer to memory error structure
 *      OUTPUT: returns SUCCESS or FAILURE
 *      DESCRIPTION: Determines if a parity error was detected during
 *      a memory test read. If not, simply returns. If an error did
 *      occur, displays address and whether high word, low word, or
 *      both caused error. Fills in error structure and clears error.
 */
int
pac_parity_error_check(err_ptr)
MEM_ERRORS *err_ptr;
{
  int returncode = SUCCESS;

  if(pacptr[current_lane]->high_word_parity_error == 1)
  {
    (void)lm_error("High word parity error reading address %08X.\n",
     Pac_parity_address(current_lane));
    returncode = FAILURE;
  }
  if(pacptr[current_lane]->low_word_parity_error == 1)
  {
    (void)lm_error("Low word parity error reading address %08X.\n",
     Pac_parity_address(current_lane));
    returncode = FAILURE;
  }
  if(returncode != SUCCESS)
  {
    /* Log into error structure and clear errors */
    err_ptr->had_parity_errors = TRUE;
    Clear_pac_errors(current_lane);
  }
  return(returncode);
}

/*      int pac_read_value(pam_no, value, err_ptr)
 *
 *      INPUT:  pam_no = PAM number
 *              value = 32-bit value to read
 *              err_ptr = pointer to memory error structure
 *      OUTPUT: returns SUCCESS or FAILURE
 *      DESCRIPTION: Performs test on pattern memory. Reads value
 *      specified. The pattern memory must be set to value before this
 *      routine is run.
 */
int
pac_read_value(pam_no, value, err_ptr)
int pam_no;
register u_long value;
MEM_ERRORS *err_ptr;
{
  register u_long *memptr;
  register u_long temp;
  register u_long i;
  register int bank_status;
  int returncode = SUCCESS;
  int bank_no;

  (void)lm_message("Reading %08X's", value);
  for(bank_no = 0; bank_no < 3; bank_no++)
  {
    lm_message(".");    /* walking period before each bank */
    memptr = (u_long *)get_base_address(pam_no, bank_no);
    i = pac[current_lane].pam_size[pam_no];
    bank_status = SUCCESS;
    do
    {
      if((temp = *memptr++) != value)
      {
        bank_status = FAILURE;
        if(pac_mem_error((u_long)(memptr - 1), value, temp, err_ptr) != SUCCESS)
          return(FAILURE);
      }
    } while (--i);
    if(bank_status == SUCCESS)
      (void)pac_parity_error_check(err_ptr);
    else
      returncode = FAILURE;
  }
  (void)lm_message("done.\n");
  return(returncode);
}


/*      int pac_link_memtest()
 *
 *      INPUT:  none
 *      OUTPUT: returns SUCCESS or FAILURE
 *      DESCRIPTION: Performs link table memory test.
 */
int
pac_link_memtest()
{
  void pac_clear_link();
  register u_long *memptr;
  register u_long temp;
  register u_long i;
  u_long base_address;
  int returncode = SUCCESS;

  /* First clear link table */
  pac_clear_link();

  base_address = pac[current_lane].lane_offset + LINK_OFFSET;

  /* Next perform a read 0's, write 1's test */
  memptr = (u_long *)(base_address);
  i = LINK_SIZE >> 2;
  do
  {
    if((temp = ((*memptr) & 0xffff)) != 0l)
    {
```

Copyright 1989 Logic Modeling Systems

| SOURCE PROGRAM | DATE | 5/23/89 | PAGE # |
|---|---|---|---|
| diags/pac_memtest.c | TIME | 4:41:19 pm | 6/57 |

LINE # SOURCE TEXT

```
        returncode = FAILURE;
        if(lm_error("Link table memory failure at address %08x.\n\
\tExpected = %04x, actual = %04x.\n", 0, memptr, temp) != SUCCESS)
          return(FAILURE);
      }
      *memptr++ = ~0l;
    } while (--i);

    /* Next perform a read 1's, write 0's test */
    memptr = (u_long *)(base_address);
    i = LINK_SIZE >> 2;
    do
    {
      if((temp = ((*memptr) & 0xffff)) != 0xffffl)
      {
        returncode = FAILURE;
        if(lm_error("Link table memory failure at address %08x.\n\
\tExpected = %04x, actual = %04x.\n", 0xffff, memptr, temp) != SUCCESS)
          return(FAILURE);
      }
      *memptr++ = 0l;
    } while (--i);

    /* Now perform a location test on the first link table location */
    if(location_test(base_address, 0, 16) != SUCCESS)
    {
      returncode = FAILURE;
      (void)lm_error("Link table data bus test fails.\n");
    }
    return(returncode);
}


/*      int pac_mem_error(address, expected, actual, mem_error_ptr)
 *
 *      INPUT:  address = memory address of failed location
 *              expected = expected value of failed location
 *              actual = actual value of failed location
 *              mem_error_ptr = pointer to memory error structure
 *      OUTPUT: returns SUCCESS or FAILURE (return of lm_error)
 *      DESCRIPTION: Outputs error message based on arguments.
 *      Computes U-number of suspect memory IC(s). Fills in
 *      memory error structure.
 */
int
pac_mem_error(address, expected, actual, mem_error_ptr)
register u_long address;
register u_long expected;
register u_long actual;
MEM_ERRORS *mem_error_ptr;
{
  register u_long ref_des;
  register u_long bad_bits;
  register int nibble;
  u_long base;
  char buffer[(4 * 8) + 1];
  char *bufptr = buffer;

  bad_bits = expected ^ actual;
  mem_error_ptr->bad_data_bits |= bad_bits;

  base = 1 + ((2 - ((address >> 26) & 3)) << 1) + (1 - ((address >> 2) & 1));

  for(nibble = 0; nibble < 8; nibble++)
  {
    if(((bad_bits >> (nibble << 2)) & 0xf) != 0)
    {
      ref_des = base + (26 * (1 - nibble / 4) + 6 * (3 - nibble % 4));
      /* Fill in memory error structure with ref des */
      if(ref_des < 27)
        mem_error_ptr->vrams1thru24 |= 1 << ref_des;
      else
        mem_error_ptr->vrams27thru50 |= 1 << (ref_des - 26);
      /* Now fill up buffer for printing */
      *bufptr++ = 'U';
      if(ref_des > 9)
      {
        *bufptr++ = '0' + (char)(ref_des / 10);
        *bufptr++ = '0' + (char)(ref_des % 10);
      }
      else
        *bufptr++ = '0' + (char)(ref_des);
      *bufptr++ = ' ';
    }
  }
  *bufptr = '\0';

  return(lm_error("Memory error: Addr=%08X Bits=%08X RAMS=%s\n",
   address, bad_bits, buffer));
}
```

Copyright 1989
Logic Modeling Systems

| SOURCE PROGRAM | DATE | | PAGE # |
|---|---|---|---|
| diags/pac_menu.c | 5/23/89 | TIME 4:41:20 pm | 1/58 |

LINE # SOURCE TEXT

```
/* SCCS_ID: pac_menu.c rev 3.1, 4/24/89 at 07:49:19      */

/*********************************************************************
 *      pac_menu.c                                                   *
 *                                                                   *
 *      Main Menu                                                    *
 *      used in Pattern Controller diagnostics                       *
 *                                                                   *
 *********************************************************************/
#include "common.h"
#include "lm_diags.h"
#include "mod_def.h"
#include "modeler_extn.h"
#include "pac_def.h"
#include "pac.h"
#include "pac_extn.h"

pac_diag_disp(parent_menu)
LM_DIAG_MENU *parent_menu;
{
  int pac_reg_test();
  int pac_link_mem_test();
  int pac_idprom_test();
  int pac_detect_pams();
  int pac_check_pamid();
  int pac_pat_mem_disp();
  int pac_strapping_test();
  int pac_cpu_parity_test();
  int pac_pattern_disp();
  int pac_util_disp();

  static LM_DIAG_MENU_ITEM menu_list[] =
  {
    {
      "1",
      "Pattern Controller Register Test",
      pac_reg_test,
      LM_DIAG_diag_routine,
      LM_DIAG_null
    },
    {
      "2",
      "Link Table Test",
      pac_link_mem_test,
      LM_DIAG_diag_routine,
      LM_DIAG_null
    },
    {
      "3",
      "Pattern Controller ID Prom Test",
      pac_idprom_test,
      LM_DIAG_diag_routine,
      LM_DIAG_null
    },
    {
      "4",
      "Pattern Memory Detection Test",
      pac_detect_pams,
      LM_DIAG_diag_routine,
      LM_DIAG_null
    },
    {
      "5",
      "Pattern Memory ID Prom Test",
      pac_check_pamid,
      LM_DIAG_diag_routine,
      LM_DIAG_null
    },
    {
      "6",
      "Pattern Memory Strapping Test",
      pac_strapping_test,
      LM_DIAG_diag_routine,
      LM_DIAG_null
    },
    {
      "7",
      "Pattern Memory Test Menu",
      pac_pat_mem_disp,
      LM_DIAG_another_menu,
      LM_DIAG_null
    },
    {
      "8",
      "Pattern Controller Parity Circuit Test",
      pac_cpu_parity_test,
      LM_DIAG_diag_routine,
      LM_DIAG_null
    },
    {
      "9",
      "Pattern Play Test Menu",
      pac_pattern_disp,
      LM_DIAG_another_menu,
      LM_DIAG_null
    },
    {
      "10",
      "Pattern Controller Utilities Menu",
      pac_util_disp,
      LM_DIAG_utility_menu,
      LM_DIAG_null
    }
  };

  static LM_DIAG_MENU pac_main_menu =
  {
    "PATTERN CONTROLLER DIAGNOSTICS",
    sizeof(menu_list) / sizeof(LM_DIAG_MENU_ITEM),
    0,
    menu_list
  };
  pac_main_menu.title = parent_menu->
    menu_items[parent_menu->current_selection].menu_text;

  return lm_display_menu(&pac_main_menu);
}

/*********************************************************************
 *      Pattern Memory Test  Menu                                    *
```

Copyright 1989 Logic Modeling Systems

LINE # SOURCE TEXT

```
 ***************************************************************************/
pac_pat_mem_disp(parent_menu)
LM_DIAG_MENU *parent_menu;
{
  register int pam_no;
  static char pam_buffer[4][80];

  int pac_pat_mem_test();

  static LM_DIAG_MENU_ITEM menu_list[] =
  {
    {
      "1",
      pam_buffer[0],
      pac_pat_mem_test,
      LM_DIAG_diag_routine,
      LM_DIAG_null,
      "0"
    },
    {
      "2",
      pam_buffer[1],
      pac_pat_mem_test,
      LM_DIAG_diag_routine,
      LM_DIAG_null,
      "1"
    },
    {
      "3",
      pam_buffer[2],
      pac_pat_mem_test,
      LM_DIAG_diag_routine,
      LM_DIAG_null,
      "2"
    },
    {
      "4",
      pam_buffer[3],
      pac_pat_mem_test,
      LM_DIAG_diag_routine,
      LM_DIAG_null,
      "3"
    }
  };

  static LM_DIAG_MENU menu =
  {
    0,
    sizeof(menu_list) / sizeof(LM_DIAG_MENU_ITEM),
    0,
    menu_list
  };
  menu.title = parent_menu->
    menu_items[parent_menu->current_selection].menu_text;

  for(pam_no = 0; pam_no < 4; pam_no++)
  {
    if(pac[current_lane].num_pams > pam_no)      /* enable test */
    {
      menu_list[pam_no].attributes &= ~LM_DIAG_disable;
      sprintf(pam_buffer[pam_no], "PAM %d Memory Test (%dK)", pam_no,
        pac[current_lane].pam_size[pam_no] >> 10);
    }
    else                                         /* disable test */
    {
      menu_list[pam_no].attributes |= LM_DIAG_disable;
      sprintf(pam_buffer[pam_no], "PAM %d Memory Test ( - )", pam_no);
    }
  }
  return lm_display_menu(&menu);
}

/*************************************************************************
 *      Pattern Play Menu                                                *
 *************************************************************************/

#define MENU_INDEX_PAT_BIT 3
#define MENU_INDEX_PAT_BUS 4
#define MENU_INDEX_CRC 5

pac_pattern_disp(parent_menu)
LM_DIAG_MENU *parent_menu;
{
  int pels_found;

  int pac_freq_test();
  int pac_error_test();
  int pac_branch_test();
  int pac_pattern_bits_test();
  int pac_pattern_bus_test();
  int pac_crc_test();

  static LM_DIAG_MENU_ITEM menu_list[] =
  {
    {
      "1",
      "Frequency Sweep Test",
      pac_freq_test,
      LM_DIAG_diag_routine,
      LM_DIAG_null
    },
    {
      "2",
      "Parity Error Test",
      pac_error_test,
      LM_DIAG_diag_routine,
      LM_DIAG_null
    },
    {
      "3",
      "Fast Branching Test",
      pac_branch_test,
      LM_DIAG_diag_routine,
      LM_DIAG_null
    },
    {
      "4",
      "Pattern Bit Test",
      pac_pattern_bits_test,
      LM_DIAG_diag_routine,
```

Copyright 1989 Logic Modeling Systems

SOURCE PROGRAM diags/pac_menu.c | DATE 5/23/89 | TIME 4:41:20 pm | PAGE # 3/60

LINE # SOURCE TEXT

```
        LM_DIAG_null
      },
      {
        "5",
        "Pattern Bus Test",
        pac_pattern_bus_te-.,
        LM_DIAG_diag_routine,
        LM_DIAG_null
      },
      {
        "6",
        "Diagnostic Adapter CRC Test",
        pac_crc_test,
        LM_DIAG_diag_routine,
        LM_DIAG_null
      }
    };

    static LM_DIAG_MENU pac_play_menu =
    {
    "PATTERN PLAY SUB-MENU",
      sizeof(menu_list) / sizeof(LM_DIAG_MENU_ITEM),
      0,
      menu_list
    };
    pac_play_menu.title = parent_menu->
      menu_items[parent_menu->current_selection].menu_text;

    if((pels_found = pac_check_for_pels()) == 0)  /* No PELs in lane */
    {
      menu_list[MENU_INDEX_PAT_BIT].attributes |= LM_DIAG_disable;
      menu_list[MENU_INDEX_PAT_BUS].attributes |= LM_DIAG_disable;
      menu_list[MENU_INDEX_CRC].attributes |= LM_DIAG_disable;
    }
    else
    {
      menu_list[MENU_INDEX_PAT_BIT].attributes &= ~LM_DIAG_disable;
      menu_list[MENU_INDEX_PAT_BUS].attributes &= ~LM_DIAG_disable;
      /* Check for diagnostic adapters */
      if(pac_check_for_diag_dabs(pels_found) == 0) /* No diag dabs in lane */
        menu_list[MENU_INDEX_CRC].attributes |= LM_DIAG_disable;
      else
        menu_list[MENU_INDEX_CRC].attributes &= ~LM_DIAG_disable;
    }

    return lm_display_menu(&pac_play_menu);
  }


/*************************************************************************
 *      Pattern Controller Utilities Menu                                *
 *************************************************************************/
pac_util_disp(parent_menu)
LM_DIAG_MENU *parent_menu;
{
    int pac_config_report();
    int pac_display_errors();
    int pac_refresh_test();
    int pac_fill_memory_disp();
    int pac_play_util_disp();
    int pac_sig_analysis();

    static LM_DIAG_MENU_ITEM menu_list[] =
    {
      {
        "1",
        "Display Pattern Controller Configuration",
        pac_config_repor .,
        LM_DIAG_utility,
        LM_DIAG_null
      },
      {
        "2",
        "Display Pattern Controller Errors",
        pac_display_errors,
        LM_DIAG_utility,
        LM_DIAG_null
      },
      {
        "3",
        "Refresh Test",
        pac_refresh_test,
        LM_DIAG_utility,
        LM_DIAG_null
      },
      {
        "4",
        "Fill Pattern Memory - Menu",
        pac_fill_memory_disp,
        LM_DIAG_utility_menu,
        LM_DIAG_null
      },
      {
        "5",
        "Pattern Play - Menu",
        pac_play_util_disp,
        LM_DIAG_utility_menu,
        LM_DIAG_null
      },
      {
        "6",
        "Signature Analysis",
        pac_sig_analysis,
        LM_DIAG_utility,
        LM_DIAG_null
      }
    };

    static LM_DIAG_MENU pac_util_menu =
    {
      "PATTERN CONTROLLER UTILITIES MENU",
      sizeof(menu_list) / sizeof(LM_DIAG_MENU_ITEM),
      0,
      menu_list
    };
    pac_util_menu.title = parent_menu->
      menu_items[parent_menu->current_selection].menu_text;

    return lm_display_menu(&pac_util_menu);
}
```

Copyright 1989 Logic Modeling Systems

| SOURCE PROGRAM | DATE | TIME | PAGE # |
|---|---|---|---|
| diags/pac_menu.c | 5/23/89 | 4:41:20 pm | 4/61 |

LINE # SOURCE TEXT

```
/**********************************************************************
 *      Memory Fill Menu                                              *
 *********************************************************************/
pac_fill_memory_disp(parent_menu)
LM_DIAG_MENU *parent_menu;
{
  int pac_fill_mem_zero();
  int pac_fill_mem_random();
  int pac_fill_mem_counting();
  int pac_fill_mem_walk1();
  int pac_fill_mem_walk0();
  int pac_fill_mem_1and0();

  static LM_DIAG_MENU_ITEM menu_list[] =
  {
    {
      "1",
      "Clear Pattern Memory",
      pac_fill_mem_zero,
      LM_DIAG_utility | LM_DIAG_automatic_quit,
      LM_DIAG_null
    },
    {
      "2",
      "Fill with random data",
      pac_fill_mem_random,
      LM_DIAG_utility | LM_DIAG_automatic_quit,
      LM_DIAG_null
    },
    {
      "3",
      "Fill with Counting Data",
      pac_fill_mem_counting,
      LM_DIAG_utility | LM_DIAG_automatic_quit,
      LM_DIAG_null
    },
    {
      "4",
      "Fill with Walking Ones",
      pac_fill_mem_walk1,
      LM_DIAG_utility | LM_DIAG_automatic_quit,
      LM_DIAG_null
    },
    {
      "5",
      "Fill with Walking Zeros",
      pac_fill_mem_walk0,
      LM_DIAG_utility | LM_DIAG_automatic_quit,
      LM_DIAG_null
    },
    {
      "6",
      "Fill with Alternating Ones and Zeros",
      pac_fill_mem_1and0,
      LM_DIAG_utility | LM_DIAG_automatic_quit,
      LM_DIAG_null
    }
  };

  static LM_DIAG_MENU fill_memory_menu =
  {
    "FILL PATTERN MEMORY MENU",
    sizeof(menu_list) / sizeof(LM_DIAG_MENU_ITEM),
    0,
    menu_list
  };
  fill_memory_menu.title = parent_menu->
    menu_items[parent_menu->current_selection].menu_text;

  return lm_display_menu(&fill_memory_menu);
}


/**********************************************************************
 *      Pattern Play Utility Menu
 *********************************************************************/
pac_play_util_disp(parent_menu)
LM_DIAG_MENU *parent_menu;
{
  int pac_sel_pat_clk();
  int pac_single_play();
  int pac_loop_with_sample();
  int pac_loop_no_sample();
  int pac_loop_no_pams();

  static LM_DIAG_MENU_ITEM menu_list[] =
  {
    {
      "1",
      "Select Pattern Clock Frequency",
      pac_sel_pat_clk,
      LM_DIAG_utility,
      LM_DIAG_null
    },
    {
      "2",
      "Single Presentation (reports time in ms)",
      pac_single_play,
      LM_DIAG_utility,
      LM_DIAG_null
    },
    {
      "3",
      "Looping Play with Sample",
      pac_loop_with_sample,
      LM_DIAG_utility,
      LM_DIAG_null
    },
    {
      "4",
      "Looping Play, no Sample",
      pac_loop_no_sample,
      LM_DIAG_utility,
      LM_DIAG_null
    },
    {
      "5",
      "Looping Play, dummy Pattern Memory",
```

Copyright 1989
Logic Modeling Systems

| SOURCE PROGRAM | DATE | TIME | PAGE # |
|---|---|---|---|
| diags/pac_menu.c | 5/23/89 | 4:41:20 pm | 5/62 |

SOURCE TEXT

```
        pac_loop_no_pams,
        LM_DIAG_utility,
        LM_DIAG_null
      }
    };

  static LM_DIAG_MENU play_util_menu =
  {
    "PATTERN PLAY UTILITIES MENU",
    sizeof(menu_list) / sizeof(LM_DIAG_MENU_ITEM),
    0,
    menu_list
  };
  play_util_menu.title = parent_menu->
    menu_items[parent_menu->current_selection].menu_text;

  return lm_display_menu(&play_util_menu);
}
```

Copyright 1989
Logic Modeling Systems

| SOURCE PROGRAM | DATE | TIME | PAGE # |
|---|---|---|---|
| diags/pac_menu_diag.c | 5/23/89 | 4:41:20 pm | 1/63 |

SOURCE TEXT

```
/* SCCS_ID: pac_menu_diag.c rev 3.1, 4/24/89 at 07:49:22      */

/********************************************************************
 *         pac_menu_diag.c                                          *
 *                                                                  *
 *         Main diagnostic routines called directly by PAC menus    *
 *         used in PAC diagnostics                                  *
 *                                                                  *
 *******************************************************************/
#include "vrtx.h" /* for lm_delay and lm_time */
#include "common.h"
#include "lm_diags.h"
#include "mod_def.h"
#include "modeler_exts.h"
#include "tmg.h"
#include "tmg_def.h"
#include "tmg_exts.h"
#include "pac.h"
#include "magic.h"
#include "pel.h"
#include "pac_def.h"
#include "pac_exts.h"
#include "id.h"

/*         int pac_error_test()
 *
 *         INPUT:  none
 *         OUTPUT: return code = SUCCESS or FAILURE
 *         DESCRIPTION:
 */
int
pac_error_test()
{
  void pac_build_walking_branch();
  int pattern;
  int timeout;
  u_long *memptr;
  int branch_address;
  int block_offset;
  int gen_err;

  if(pac_stack_pams(current_lane) != SUCCESS)
  {
    (void)lm_error("Pattern memory configuration error.\n");
    return(FAILURE);
  }

  if(diag_clear_errors() != SUCCESS)
    return(FAILURE);

  /* Fill pattern memory with random data */
  if(pac_fill_random(BLOCK_SIZE, (MAX_BRANCHES + 1) * BLOCK_SIZE, NOP_MASK,
   SEED) != SUCCESS)
  {
    (void)lm_error("Could not fill with random data.\n");
    return(FAILURE);
  }
  /* Set up pattern memory for "walking" branching */
  pac_build_walking_branch();
  if(pac_set_pattern_clock(PAC_MIN_PERIOD) != SUCCESS)
  {
    (void)lm_error("Could not set pattern clock to minimum period.\n");
    return(FAILURE);
  }
  setup_good_sample(PAC_MIN_PERIOD * 1000);      /* needs period in ps    */
  /* Prepare for pattern play and compute a conservative timeout */
  if((timeout = pac_pre_play()) == 0)
  {
    (void)lm_error("Pattern play preparation failed.\n");
    return(FAILURE);
  }
  /* Put a stop instruction in the last block */
  /* so that 10 patterns within the last block are played */
  memptr = (u_long *)(pac[current_lane].lane_offset + BANK_2 +
   (4 * (((MAX_BRANCHES + 1) * BLOCK_SIZE) + 10 - STOP_LATENCY)));
  *memptr |= STOP;

  (void)lm_message("Playing patterns");

  for(pattern = BLOCK_SIZE, pattern < ((MAX_BRANCHES * BLOCK_SIZE) + 11);
   pattern++)
  {
    if((pattern % (BLOCK_SIZE << 2)) == 0)
      (void)lm_message(".");
    gen_err = pac_predict_offsets(pattern, 5, &branch_address, &block_offset);
    if(pac_insert_parity_error(pattern, 0) != SUCCESS)
    {
      (void)lm_error("Could not insert parity error in pattern control.\n");
      return(FAILURE);
    }
    pacptr[current_lane]->branch_address = 1;
    if(pac_play(timeout) != SUCCESS)
    {
      (void)lm_error("Pattern play failed.\n");
      return(FAILURE);
    }
    if(gen_err != SUCCESS)
    {
      if(pacptr[current_lane]->parity_error    TRUE)
      {
        (void)lm_error("Pattern play generated error.\n");
        return(FAILURE);
      }
    }
    else
    {
      if(pacptr[current_lane]->parity_error != TRUE)
      {
        (void)lm_error("Pattern play did not generate error (should have).\n");
        return(FAILURE);
      }
      if(pacptr[current_lane]->branch_address != branch_address)
      {
        (void)lm_error("Branch address incorrect.\n\tExpected %d. Actual %d.\n",
         branch_address, pacptr[current_lane]->branch_address);
        return(FAILURE);
      }
      if(pacptr[current_lane]->block_offset != block_offset)
      {
        (void)lm_error("Block offset incorrect.\n\tExpected %d. Actual %d.\n",
```

Copyright 1989 Logic Modeling Systems

| SOURCE PROGRAM | DATE | PAGE # |
|---|---|---|
| diags/pac_menu_diag.c | 5/23/89 | 2/64 |
| | TIME 4:41:20 pm | |

LINE # SOURCE TEXT

```
            block_offset, pacptr[current_lane]->block_offset);
          return(FAILURE);
        }
      }
      if(pac_remove_parity_error(pattern, 0) != SUCCESS)
      {
        (void)lm_error("Could not remove parity error in pattern control.\n");
        return(FAILURE);
      }
      if(gen_err != SUCCESS)
        /* Increment pattern count to next block boundary (-1) */
        pattern = (((pattern / BLOCK_SIZE) + 1) * BLOCK_SIZE) - 1;
    }
    (void)lm_message("done.\n");
    return(SUCCESS);
}


/*      int pac_cpu_parity_test()
 *
 *      INPUT:  none
 *      OUTPUT: return code = SUCCESS or FAILURE
 *      DESCRIPTION: Performs test on PAC parity
 *      circuitry used for CPU reads and writes.
 *      Tests are run on first location in pattern
 *      memory.
 */
int
pac_cpu_parity_test()
{
  if(pac_stack_pams(current_lane) != SUCCESS)
  {
    (void)lm_error("Pattern memory configuration error.\n");
    return(FAILURE);
  }

  /* Perform pac_parity_test using first location in Bank 0 of pattern mem */
  return pac_parity_test(pac[current_lane].lane_offset);
}


/*      int pac_refresh_test()
 *
 *      INPUT:  none
 *      OUTPUT: return code = SUCCESS or FAILURE
 *      DESCRIPTION: Tests refresh of pattern memory
 *      by writing random data, pausing for 1 second,
 *      and then reading the data back. This is repeated
 *      for a user specified number of trials. Each trial
 *      uses a new seed (random) to generate a different
 *      set of random numbers.
 */
int
pac_refresh_test()
{
  u_long random_seed;
  u_long i;
  u_long trials;
  u_long failures;

  if(diag_clear_errors() != SUCCESS)
    return(FAILURE);

  failures = 0;
  random_seed = SEED;
  trials = 1;
  diag_get_ulong(&trials,"number of trials", 1l, 65535l);
  (void)lm_message("Hit key to exit after a trial.\n");
  for(i = 0; (i < trials) && (lm_check_key() == 0); ++i)
  {
    /* Fill all of pattern memory with random data, using random seed */
    if(pac_fill_random(0, pac[current_lane].num_patterns, ~0l,
     (random_seed = Pac_get_random(random_seed))) != SUCCESS)
    {
      (void)lm_error("Could not perform refresh test.\n");
      return(FAILURE);
    }
    lm_delay(1000);      /* Pause for 1 second */
    if(pac_read_random(0, pac[current_lane].num_patterns, ~0l, random_seed)
     != SUCCESS)
    {
      if(lm_error("Refresh test fails random read number %d.\n", i + 1)
       != SUCCESS)
        return(FAILURE);
      else
        ++failures;
    }
    else
      (void)lm_message("Trial number %d passes.\n", i + 1);
  }
  Clear_key_buf();
  if(failures != 0)
  {
    (void)lm_error("Refresh test failed %d times.\n", failures);
    return(FAILURE);
  }
  else
  {
    (void)lm_message("Refresh test passes.\n");
    return(SUCCESS);
  }
}


/*      int pac_branch_test()
 *
 *      INPUT:  none
 *      OUTPUT: return code = SUCCESS or FAILURE
 *      DESCRIPTION:
 */
int
pac_branch_test()
{
  void pac_build_fast_branch();
  int patterns;
  int returncode = SUCCESS;

  if(pac_stack_pams(current_lane) != SUCCESS)
  {
    (void)lm_error("Pattern memory configuration error.\n");
```

Copyright 1989
Logic Modeling Systems

SOURCE PROGRAM diags/pac_menu_diag.c | DATE 5/23/89 | TIME 4:41:20 pm | PAGE # 3/65

LINE # SOURCE TEXT

```
    return(FAILURE);
  }

  if(diag_clear_errors() != SUCCESS)
    return(FAILURE);

  patterns = pac[current_lane].num_blocks * (BRANCH_LATENCY + 1);
  /* Fill all of pattern memory with random data */
  if(pac_fill_random(0, pac[current_lane].num_patterns, NOP_MASK, SEED)
   != SUCCESS)
  {
    (void)lm_error("Could not perform branch test.\n");
    return(FAILURE);
  }
  /* Set up pattern memory for fast branching */
  pac_build_fast_branch();
  if(pac_sweep_test(patterns) != SUCCESS)
  {
    returncode = FAILURE;
    if(lm_error("Fast branching, random data, test failed.\n") != SUCCESS)
      return(FAILURE);
  }

  /* Fill all of pattern memory with alternating ones and zeros data */
  if(pac_fill_1and0(0, pac[current_lane].num_patterns, NOP_MASK) != SUCCESS)
  {
    (void)lm_error("Could not perform branch test.\n");
    return(FAILURE);
  }
  /* Set up pattern memory for fast branching */
  pac_build_fast_branch();
  if(pac_sweep_test(patterns) != SUCCESS)
  {
    (void)lm_error("Fast branching, 1/0 data, test failed.\n");
    return(FAILURE);
  }
  return(returncode);
}


/*      int pac_single_play()
 *
 *      INPUT:  none
 *      OUTPUT: return code = SUCCESS or FAILURE
 *      DESCRIPTION:
 */
int
pac_single_play()
{
  int sample_width;
  int first_pattern;
  int patterns;
  int play_time;
  int period;

  if(diag_clear_errors() != SUCCESS)
    return(FAILURE);

  sample_width = 16;
  diag_get_long(&(long)sample_width, "sample width", 01, 2551);

  first_pattern = 0;
  diag_get_long(&(long)first_pattern, "first pattern number", 01,
   (long)(pac[current_lane].num_patterns - BLOCK_SIZE));

  patterns = pac[current_lane].num_patterns;
  diag_get_long(&(long)patterns, "number of patterns", 41, (long)patterns);

  if(build_pattern_control(first_pattern, patterns, STOP_MODE) != SUCCESS)
  {
    (void)lm_error("Unable to build pattern control.\n");
    return(FAILURE);
  }
  /* Insert PEL control in last pattern to generate sample */
  *(u_long *)(pac[current_lane].lane_offset + BANK_2 + 4 * (first_pattern +
   patterns - 1)) |= 0x7 << 4;
  tmgptr->sample_width = sample_width;
  /* Prepare for pattern play and compute a conservative timeout */
  if(pac_pre_play() == 0)
  {
    (void)lm_error("Pattern play preparation failed.\n");
    return(FAILURE);
  }

  period = tmg_measure_period();
  setup_good_sample(period);
  if(pac_timed_play(period / 1000, patterns, &play_time)
   != SUCCESS)
  {
    (void)lm_error("Timed play fails.\n");
    return(FAILURE);
  }
  (void)lm_message("Play lasted %dms +/- %dms.\n", play_time, TIMER_RES);
  return(SUCCESS);
}


/*      int pac_loop no_sample()
 *
 *      INPUT:  none
 *      OUTPUT: return code = SUCCESS or FAILURE
 *      DESCRIPTION:
 */
int
pac_loop_no_sample()
{
  int first_pattern;
  int patterns;
  int period;

  if(diag_clear_errors() != SUCCESS)
    return(FAILURE);

  /* Set sample width to 16 */
  tmgptr->sample_width = 16;

  first_pattern = 0;
  diag_get_long(&(long)first_pattern, "first pattern number", 01,
   (long)(pac[current_lane].num_patterns - BLOCK_SIZE));
```

Copyright 1989 Logic Modeling Systems

SOURCE PROGRAM diags/pac_menu_diag.c | DATE 5/23/89 | TIME 4:41:20 pm | PAGE # 4/66

LINE # SOURCE TEXT

```c
    patterns = pac[current_lane].num_patterns;
    diag_get_long(&(long)patterns, "number of patterns", 41, (long)patterns);

    if(build_pattern_control(first_pattern, patterns, LOOP_MODE) != SUCCESS)
    {
      (void)lm_error("Unable to build pattern con.  .\n");
      return(FAILURE);
    }
    /* Prepare for pattern play and compute a conservative timeout */
    if(pac_pre_play() == 0)
    {
      (void)lm_error("Pattern play preparation failed.\n");
      return(FAILURE);
    }

    period = tmg_measure_period();
    setup_good_sample(period);

    (void)lm_message("Initiating looping play...\n");
    (void)lm_message("(Hit key to abort)\n");
    if(tmg_initiate_play() != SUCCESS)
    {
      (void)lm_error("Unable to initiate play.\n");
      pac_play_cleanup();
      return(FAILURE);
    }
    /* Wait for key hit */
    (void)lm_get_key();
    Clear_key_buf();
    if(Get_bp_error() == Lane_code(current_lane))
    {
      (void)lm_error("Error line asserted on backplane.\n");
      report_bp_error();
      return(FAILURE);
    }
    else
    {
      if(pac_abort_play() != SUCCESS)
      {
        (void)lm_error("Could not abort play.\n");
        return(FAILURE);
      }
      else
      {
        (void)lm_message("Looping aborted.\n");
        return(SUCCESS);
      }
    }
}


/*      int pac_link_mem_test()
 *
 *      INPUT:  none
 *      OUTPUT: return code = SUCCESS or FAILURE
 *      DESCRIPTION: Tests link table memory. The
 *      link table is a 16-bit memory on 32-bit
 *      boundaries.
 */
int
pac_link_mem_test()
{
  if(pac_link_memtest() != SUCCESS)
    return(FAILURE);
  return(SUCCESS);
}


/*      int pac_pat_mem_test(&status, &info)
 *
 *      INPUT:  &status = address of status word
 *              &info = address of test info: in this case, PAM number
 *      OUTPUT: return code = SUCCESS or FAILURE
 *      DESCRIPTION: Tests pattern memory on specified PAM
 */
int
pac_pat_mem_test(status, info)
int *status;
char *info;
{
  if(pac_stack_pams(current_lane) != SUCCESS)
  {
    (void)lm_error("Pattern memory configuration error.\n");
    return(FAILURE);
  }

  if(diag_clear_errors() != SUCCESS)
    return(FAILURE);

  return(pac_test_a_pam((int)(*info - '0')));
}


/*      int pac_freq_test()
 *
 *      INPUT:  none
 *      OUTPUT: return code = SUCCESS or FAILURE
 *      DESCRIPTION:
 */
int
pac_freq_test()
{
  register int pam_no;
  register int first_pattern;
  register int num_patterns;
  int returncode = SUCCESS;

  if(pac_stack_pams(current_lane) != SUCCESS)
  {
    (void)lm_error("Pattern memory configuration error.\n");
    return(FAILURE);
  }

  if(diag_clear_errors() != SUCCESS)
    return(FAILURE);

  for(pam_no = 0; pam_no < pac[current_lane].num_pams; pam_no++)
  {
    first_pattern = pac_get_first_pattern_no(current_lane, pam_no);
    num_patterns = pac[current_lane].pam_size[pam_no];
```

Copyright 1989
Logic Modeling Systems

| SOURCE PROGRAM | DATE | PAGE # |
|---|---|---|
| diags/pac_menu_diag.c | 5/23/89 | 5/67 |
| | TIME 4:41:20 pm | |

LINE # SOURCE TEXT

```
      /* Fill pattern memory with random data */
      if(pac_fill_random(first_pattern, num_patterns, NOP_MASK, SEED) != SUCCESS)
      {
        returncode = FAILURE;
        if(lm_error("Could not perform fr... ncy test on PAM %d.\n", pam_no)
         != SUCCESS)
          return(FAILURE);
        else
          continue;
      }
      /* Set up pattern memory to branch through pattern memory */
      if(build_pattern_control(first_pattern, num_patterns, STOP_MODE) != SUCCESS)
      {
        returncode = FAILURE;
        if(lm_error("Could not perform frequency test on PAM %d.\n", pam_no)
         != SUCCESS)
          return(FAILURE);
        else
          continue;
      }
      if(pac_sweep_test(num_patterns) != SUCCESS)
      {
        returncode = FAILURE;
        if(lm_error("Frequency sweep test failed using PAM %d.\n", pam_no)
         != SUCCESS)
          return(FAILURE);
        else
          continue;
      }
    }
  return(returncode);
}


/*      int pac_fill_mem_random()
 *
 *      INPUT:  none
 *      OUTPUT: return code = SUCCESS or FAILURE
 *      DESCRIPTION: Fills entire pattern memory with
 *      a pseudorandom sequence.
 */
int
pac_fill_mem_random()
{
  if(pac_fill_random(0, pac[current_lane].num_patterns, ~01, SEED) != SUCCESS)
  {
    (void)lm_error("Could not fill pattern memory.\n");
    return(FAILURE);
  }
  return(SUCCESS);
}

/*      int pac_fill_mem_counting()
 *
 *      INPUT:  none
 *      OUTPUT: return code = SUCCESS or FAILURE
 *      DESCRIPTION: Fills entire pattern memory with
 *      counting data.
 */
int
pac_fill_mem_counting()
{
  if(pac_fill_counting(0, pac[current_lane].num_patterns, ~01) != SUCCESS)
  {
    (void)lm_error("Could not fill pattern memory.\n");
    return(FAILURE);
  }
  return(SUCCESS);
}

/*      int pac_fill_mem_walk1()
 *
 *      INPUT:  none
 *      OUTPUT: return code = SUCCESS or FAILURE
 *      DESCRIPTION: Fills entire pattern memory with
 *      walking ones data.
 */
int
pac_fill_mem_walk1()
{
  if(pac_fill_walking(0, pac[current_lane].num_patterns, ~01, 1) != SUCCESS)
  {
    (void)lm_error("Could not fill pattern memory.\n");
    return(FAILURE);
  }
  return(SUCCESS);
}


/*      int pac_fill_mem_walk0()
 *
 *      INPUT:  none
 *      OUTPUT: return code = SUCCESS or FAILURE
 *      DESCRIPTION: Fills entire pattern memory with
 *      walking zeros data.
 */
int
pac_fill_mem_walk0()
{
  if(pac_fill_walking(0, pac[current_lane].num_patterns, ~01, 0) != SUCCESS)
  {
    (void)lm_error("Could not fill pattern memory.\n");
    return(FAILURE);
  }
  return(SUCCESS);
}


/*      int pac_fill_mem_land0()
 *
 *      INPUT:  none
 *      OUTPUT: return code = SUCCESS or FAILURE
 *      DESCRIPTION: Fills entire pattern memory with
 *      alternating ones and zeros data.
 */
int
pac_fill_mem_land0()
{
  if(pac_fill_land0(0, pac[current_lane].num_patterns, ~01) != SUCCESS)
```

Copyright 1989
Logic Modeling Systems

| SOURCE PROGRAM | DATE | PAGE # |
|---|---|---|
| diags/pac_menu_diag.c | 5/23/89<br>TIME 4:41:20 pm | 6/68 |

LINE # SOURCE TEXT

```
  {
    (void)lm_error("Could not fill pattern memory.\n");
    return(FAILURE);
  }
  return(SUCCESS);
}



/*      int pac_detect_pams(&status)
 *
 *      INPUT:  &status = address of status word
 *      OUTPUT: return code = SUCCESS or FAILURE
 *      DESCRIPTION: Checks to see if PAMs can be tested
 *      detected on current PAC. If not, tests are aborted.
 */
int
pac_detect_pams(status)
u_long *status;
{
  if(pac_get_num_pams(current_lane) != SUCCESS)
  {
    (void)lm_error("PAM detect test failed.  Cannot perform further tests \
on PAC.\n");
    STOP_TEST(status);
    return(FAILURE);
  }
  return(SUCCESS);
}


/*      int pac_check_pamid(&status)
 *
 *      INPUT:  &status = address of status word
 *      OUTPUT: return code = SUCCESS or FAILURE
 *      DESCRIPTION: Checks  the PAM ID Proms.  If any
 *      fail checksum, tests are aborted.
 */
int
pac_check_pamid(status)
u_long *status;
{
  static char message[] =
    "PAM ID Prom test failed.  Cannot perform further tests on PAC.\n";

  if(pac[current_lane].num_pams == 0)
  {
    (void)lm_error("No pattern memory in this lane.\n");
    return FAILURE;
  }

  if(pam_idprom_test(current_lane) != SUCCESS)
  {
    (void)lm_error(message);
    STOP_TEST(status);
    return(FAILURE);
  }
  return(SUCCESS);
}


pac_strapping_test(status)
u_long *status;
{
  if(pac_stack_pams(current_lane) != SUCCESS)
  {
    (void)lm_error("Pattern memory configuration error.\n");
    STOP_TEST(status);
    return(FAILURE);
  }
  return SUCCESS;
}


/*      int pac_fill_mem_zero()
 *
 *      INPUT:  none
 *      OUTPUT: return code = SUCCESS or FAILURE
 *      DESCRIPTION: Clears pattern memory.
 */
int
pac_fill_mem_zero()
{
  /* Check to make sure that there are PAMs on the PAC */
  if(pac[current_lane].num_pams == 0)
  {
    (void)lm_error("There are no PAMs on this PAC.\n");
    return(FAILURE);
  }
  else
  {
    (void)pac_clear_pat_mem(current_lane);
    return(SUCCESS);
  }
}

/*      int pac_sel_pat_clk()
 *
 *      INPUT:  none
 *      OUTPUT: return code = SUCCESS or FAILURE
 *      DESCRIPTION: Sets pattern clock frequency by getting
 *      the desired clock period from the keyboard. Also allows
 *      the user to select an external clock. The clock is not
 *      turned on by the function.
 */
int
pac_sel_pat_clk()
{
  int user_input;

  (void)lm_message("Enter 0 for external clock 0,\n");
  (void)lm_message("enter 1 for external clock 1,\n");
  (void)lm_message("or enter period for internal clock.\n");
  (void)lm_message("(%d <= period <= %d)\n", PAC_MIN_PERIOD, PAC_MAX_PERIOD);
  user_input = 401;     /* 25 MHz */
  diag_get_long(&(long)user_input, "value", 0l, (long)PAC_MAX_PERIOD);
  if(user_input == 0)
  {
    tmgptr->clock_select = EXT_CLOCK_0;
    (void)lm_message("External clock 0 selected.\n");
```

Copyright 1989 Logic Modeling Systems

LINE # SOURCE TEXT

```
  }
  else if(user_input == 1)
  {
    tmpptr->clock_select = EXT_CLOCK_1;
    (void)lm_message("External clock 1 selected.\n");
  }
  else
  {
    if(pac_set_pattern_clock(user_input) != SUCCESS)
    {
      (void)lm_error("Unable to set internal clock frequency.\n");
      return(FAILURE);
    }
    else
    {
      /* Make sure PAC clock speed register set properly */
      (void)pac_pre_play();
    }
  }
  return(SUCCESS);
}


/*      int pac_idprom_test()
 *
 *      INPUT:  none
 *      OUTPUT: return code = SUCCESS or FAILURE
 *      DESCRIPTION: Performs checksum test on PAC ID PROM.
 *      The function returns SUCCESS if the checksums is
 *      correct, and returns FAILURE if the checksum test fails.
 */
int
pac_idprom_test()
{
  int temp;

  if((temp = id_checksum((u_char *)(pac[current_lane].lane_offset +
   PAC_ID + 3))) != ID_CHECKSUM_GOOD )
  {
    if(lm_error("PAC ID PROM checksum. Expected = %02x. Actual = %02x.\n",
     ID_CHECKSUM_GOOD, temp) != SUCCESS)
      return(FAILURE);
  }
  return(SUCCESS);
}


/*      int pac_reg_test()
 *
 *      INPUT:  none
 *      OUTPUT: return code = SUCCESS or FAILURE
 *      DESCRIPTION: Performs register test on all PAC read/write
 *      registers.  Returns SUCCESS or FAILURE.
 */
int
pac_reg_test()
{
  u_long addr;
  u_long state;
  int returncode = SUCCESS;

  /* Test the PAC Configuration Register */
  addr = pac[current_lane].lane_offset + CONFIG_OFFSET;
  state = Read_long(addr);                  /* Save the state of the register */
  if(location_test(addr, 0, 8) != SUCCESS)
  {
    returncode = FAILURE;
    if(lm_error("PAC Configuration Register test fails.\n") != SUCCESS)
      return(FAILURE);
  }
  Write_long(addr, state);                  /* Return register to former state */

  /* Test the PAC Clock Speed Register */
  addr = pac[current_lane].lane_offset + CLOCK_OFFSET;
  state = Read_long(addr);                  /* Save the state of the register */
  if(location_test(addr, 0, 1) != SUCCESS)
  {
    returncode = FAILURE;
    if(lm_error("PAC Clock Speed Register test fails.\n") != SUCCESS)
      return(FAILURE);
  }
  Write_long(addr, state);                  /* Return register to former state */

  /* Test the PAC Branch Address Register */
  addr = pac[current_lane].lane_offset + BRANCH_OFFSET;
  state = Read_long(addr);                  /* Save the state of the register */
  if(location_test(addr, 0, 16) != SUCCESS)
  {
    returncode = FAILURE;
    if(lm_error("PAC Branch Address Register test fails.\n") != SUCCESS)
      return(FAILURE);
  }
  Write_long(addr, state);                  /* Return register to former state */

  return(returncode);
}

int
pac_config_report()
{
  int i;

  if(pac_stack_pams(current_lane) != SUCCESS)
  {
    (void)lm_error("PAC configuration error.\n");
    return(FAILURE);
  }
  else
  {
    (void)lm_message("PAC configuration successful.\n");
    (void)lm_message("There are a total of %d PAMs.\n",
     pac[current_lane].num_pams);
    for(i=0; i < pac[current_lane].num_pams; i++)
    {
      (void)lm_message(" PAM # %ld is a %dK PAM.\n", i,
       pac[current_lane].pam_size[i] >> 10);
    }
    (void)lm_message("There are a total of %dK patterns (%d blocks).\n",
     pac[current_lane].num_patterns >> 10, pac[current_lane].num_blocks);
    return(SUCCESS);
```

Copyright 1989
Logic Modeling Systems

| SOURCE PROGRAM | DATE | 5/23/89 | PAGE # |
|---|---|---|---|
| diags/pac_menu_diag.c | TIME | 4:41:20 pm | 8/70 |

LINE # SOURCE TEXT

```
    }
}

int
pac_check_errors(lane, prtfcn)
int lane;
int (*prtfcn)();
{
  int returncode = SUCCESS;

  if((pacptr[lane]->refresh_error) != 0)
  {
    returncode = FAILURE;
    (void)prtfcn("Pattern Controller Refresh error.\n");
  }
  if((pacptr[lane]->request_error) != 0)
  {
    returncode = FAILURE;
    (void)prtfcn("Pattern Controller Request Control Machine error.\n");
  }
  if((pacptr[lane]->pattern_error) != 0)
  {
    returncode = FAILURE;
    (void)prtfcn("Pattern Control Machine error.\n");
  }
  if((pacptr[lane]->parity_error) != 0)
  {
    returncode = FAILURE;
    (void)prtfcn("Pattern Controller pattern control word parity error.\n\
\tBlock number = %d.\n\
\tBlock offset = %d.\n", pacptr[lane]->branch_address,
      pacptr[lane]->block_offset);
  }
  if((pacptr[lane]->high_word_parity_error) != 0)
  {
    returncode = FAILURE;
    (void)prtfcn("Pattern Controller High Word parity error.\n");
  }
  if((pacptr[lane]->low_word_parity_error) != 0)
  {
    returncode = FAILURE;
    (void)prtfcn("Pattern Controller Low Word parity error.\n");
  }
  if(((pacptr[lane]->low_word_parity_error) != 0)
     || ((pacptr[lane]->high_word_parity_error) != 0))
    (void)prtfcn("Pattern Controller parity error address = %08X.\n",
     Pac_parity_address(lane));
  return(returncode);
}


int
pac_display_errors()
{
  if(pac_check_errors(current_lane, lm_message) == SUCCESS)
    (void)lm_message("No Pattern Controller error conditions present.\n");
  return(SUCCESS);
}

/*      int pac_loop_no_pams()
 *
 *      INPUT:  none
 *      OUTPUT: return code = SUCCESS or FAILURE
 *      DESCRIPTION:
 */
int
pac_loop_no_pams()
{
  int timeout;
  int period;

  /* Check to make sure that there are no PAMs on the PAC */
  if(pac[current_lane].num_pams != 0)
  {
    (void)lm_error("There are PAMs on this PAC.\n");
    return(FAILURE);
  }

  Clear_pac_errors(current_lane);

  pacptr[current_lane]->low_word_parity = SET_ODD_PARITY;
  tmgptr->sample_width = 16;

  /* Prepare for pattern play and compute a conservative timeout */
  if((timeout = pac_pre_play()) == 0)
  {
    (void)lm_error("Pattern play preparation failed.\n");
    return(FAILURE);
  }
  period = tmg_measure_period();
  setup_good_sample(period);
  (void)lm_message("Initiating looping play...\n");
  (void)lm_message("(Hit key to abort)\n");
  while((Get_bp_error() != Lane_code(current_lane)) && (lm_check_key() == 0x0))
  {
    pacptr[current_lane]->branch_address = 0;
    if(pac_play(timeout) != SUCCESS)
    {
      pac_play_cleanup();
      break;
    }
  }
  Clear_key_buf();
  if(Get_bp_error() == Lane_code(current_lane))
  {
    (void)lm_error("Error line asserted on backplane.\n");
    (void)report_bp_error();
  }
  else
    (void)lm_message("Looping aborted.\n");
  return(SUCCESS);
}


/*      int pac_loop_with_sample()
 *
 *      INPUT:  none
 *      OUTPUT: return code = SUCCESS or FAILURE
 *      DESCRIPTION:
 */
```

Copyright 1989 Logic Modeling Systems

SOURCE PROGRAM diags/pac_menu_diag.c | DATE 5/23/89 | TIME 4:41:20 pm | PAGE # 9/71

LINE # SOURCE TEXT

```
int
pac_loop_with_sample()
{
  long sample_width;
  int first_pattern;
  int first_block,
  int patterns,
  int timeout;
  int period;

  if(diag_clear_errors() != SUCCESS)
    return(FAILURE);

  sample_width = 16;
  diag_get_long(&sample_width, "sample width", 01, 2551);
  first_pattern = 0;
  diag_get_long(&(long)first_pattern, "first pattern number", 01,
   (long)(pac[current_lane].num_patterns - BLOCK_SIZE));
  patterns = pac[current_lane].num_patterns;
  diag_get_long(&(long)patterns, "number of patterns", 41, (long)patterns);

  if(build_pattern_control(first_pattern, patterns, STOP_MODE) != SUCCESS)
  {
    (void)lm_error("Unable to build pattern control.\n");
    return(FAILURE);
  }
  /* Insert PEL control in last pattern to generate sample */
  *(u_long *)(pac[current_lane].lane_offset + BANK_2 + 4 * (first_pattern +
   patterns - 1)) |= 0x7 << 4;
  tmgptr->sample_width = sample_width;
  first_block = first_pattern/BLOCK_SIZE;

  /* Prepare for pattern play and compute a conservative timeout */
  if((timeout = pac_pre_play()) == 0)
  {
    (void)lm_error("Pattern play preparation failed.\n");
    return(FAILURE);
  }
  period = tmg_measure_period();
  setup_good_sample(period);
  (void)lm_message("Initiating looping play...\n");
  (void)lm_message("(Hit key to abort)\n");
  while((Get_bp_error() != Lane_code(current_lane)) && (lm_check_key() == 0x0))
  {
    pacptr[current_lane]->branch_address = first_block;
    if(pac_play(timeout) != SUCCESS)
    {
      pac_play_cleanup();
      break;
    }
  }
  Clear_key_buf();
  if(Get_bp_error() == Lane_code(current_lane))
  {
    (void)lm_error("Error line asserted on backplane.\n");
    (void)report_bp_error();
  }
  else
    (void)lm_message("Looping aborted.\n");
  return(SUCCESS);
}


/*       int pac_sig_analysis()
 *
 *       INPUT:  none
 *       OUTPUT: return code = SUCCESS or FAILURE
 *       DESCRIPTION: Puts lane in signature analysis
 *       mode, playing random data through entire memory.
 *       The trigger pin is set in the first pattern only.
 */
int
pac_sig_analysis()
{
  if(diag_clear_errors() != SUCCESS)
    return(FAILURE);

  if(pac_fill_random(0, pac[current_lane].num_patterns, ~0x0801, SEED)
   != SUCCESS)
  {
    (void)lm_error("Could not fill pattern memory.\n");
    return(FAILURE);
  }
  if(build_pattern_control(0, pac[current_lane].num_patterns, LOOP_MODE)
   != SUCCESS)
  {
    (void)lm_error("Unable to build pattern control.\n");
    return(FAILURE);
  }
  /* Set trigger bit in first location of pattern memory */
  *(u_long *)(pac[current_lane].lane_offset + BANK_2) |= 0x0801;
  /* Prepare for pattern play and compute a conservative timeout */
  if(pac_pre_play() == 0)
  {
    (void)lm_error("Pattern play preparation failed.\n");
    return(FAILURE);
  }

  pacptr[current_lane]->branch_address = 0;
  (void)lm_message("Initiating signature analysis...\n");
  (void)lm_message("(Hit key to abort)\n");
  if(tmg_initiate_play() != SUCCESS)
  {
    (void)lm_error("Unable to initiate play.\n");
    pac_play_cleanup();
    return(FAILURE);
  }
  /* Wait for key hit */
  while(lm_check_key() == 0x0)
    ;
  Clear_key_buf();
  if(Get_bp_error() == Lane_code(current_lane))
  {
    (void)lm_error("Error line asserted on backplane.\n");
    (void)report_bp_error();
    return(FAILURE);
  }
  else
  {
    if(pac_abort_play() != SUCCESS)
```

Copyright 1989
Logic Modeling Systems

SOURCE PROGRAM diags/pac_menu_diag.c | DATE 5/23/89 | TIME 4:41:20 pm | PAGE # 10/72

LINE # SOURCE TEXT

```
      {
        (void)lm_error("Could not abort play.\n");
        return(FAILURE);
      }
      else
      {
        (void)lm_message("Signature analysis halted.\n");
        return(SUCCESS);
      }
    }
  }


/*      int pac_pattern_bits_test()
 *
 *      INPUT:  none
 *      OUTPUT: return code = SUCCESS or FAILURE
 *      DESCRIPTION:
 */
int
pac_pattern_bits_test()
{
  int pam_no;
  int pels_found;
  int pams_failed;
  int pels_failed = 0;

  if(pac_stack_pams(current_lane) != SUCCESS)
  {
    (void)lm_error("Pattern memory configuration error.\n");
    return(FAILURE);
  }

  if(diag_clear_errors() != SUCCESS)
    return(FAILURE);

  /* See if there are any PELs in the lane */
  if((pels_found = pac_check_for_pels()) == 0)
  {
    (void)lm_error("Can not test pattern bits (no Pin Electronics in lane).\n");
    return(FAILURE);
  }

  /* Test the PELs one at a time (need to set global PEL variable) */
  /* The first PEL which passes the test => the PAC passes and the */
  /* test is over */
  for(current_pel = 0; current_pel < NUMBER_OF_PELS; ++current_pel)
  {
    if(((1 << current_pel) & pels_found) == 0)  /* current PEL not found */
      continue;

    /* Test the pattern bits coming out of each pattern memory on the PAC */
    pams_failed = FALSE;
    for(pam_no = 0; pam_no < pac[current_lane].num_pams; ++pam_no)
    {
      if(pattern_bits_test(pam_no) != SUCCESS)
      {
        pams_failed = TRUE;
        pels_failed |= 1 << current_pel;
        if(lm_error("Pattern bits test failed using Pin Electronics %d, \
Pattern Memory %d.\n", current_pel, pam_no) != SUCCESS)
          return(FAILURE);
      }
    }
    if(pams_failed == FALSE)
    {
      if(pels_failed == 0)
        return(SUCCESS);
      else
        (void)lm_message("Pattern bits test passed using Pin Electronics %d.\n",
         current_pel);
    }
  }
  /* If we got here, then at least one test failed for each PEL */
  if((pels_found == pels_failed))
    (void)lm_error("Pattern bits test failed for all Pin Electronics in \
lane.\n");
  else
    (void)lm_message("Pattern bits test passed at least once in lane.\n");
  return(FAILURE);
}

/*      int pac_pattern_bus_test()
 *
 *      INPUT:  none
 *      OUTPUT: return code = SUCCESS or FAILURE
 *      DESCRIPTION:
 */
int
pac_pattern_bus_test()
{
  int first_pattern;
  int pels_found;
  int pams_failed;
  int pels_failed = 0;

  if(pac_stack_pams(current_lane) != SUCCESS)
  {
    (void)lm_error("Pattern memory configuration error.\n");
    return(FAILURE);
  }

  if(diag_clear_errors() != SUCCESS)
    return(FAILURE);

  /* See if there are any PELs in the lane */
  if((pels_found = pac_check_for_pels()) == 0)
  {
    (void)lm_error("Cannot test pattern bus (no Pin Electronics in lane).\n");
    return(FAILURE);
  }

  /* Test the PELs one at a time (need to set global PEL variable) */
  /* The first PEL which passes the test => the PAC passes and the */
  /* test is over */
  for(current_pel = 0; current_pel < NUMBER_OF_PELS; ++current_pel)
  {
    if(((1 << current_pel) & pels_found) == 0)  /* current PEL not found */
      continue;
```

Copyright 1989
Logic Modeling Systems

SOURCE PROGRAM: diags/pac_menu_diag.c | DATE: 5/23/89 | TIME: 4:41:20 pm | PAGE # 11/73

LINE # SOURCE TEXT

```
    /* Test all of the pattern memory on the PAC in 128K chunks */
    pams_failed = FALSE;
    for(first_pattern = 0; first_pattern < pac[current_lane].num_patterns;
     first_pattern += PATTERNS_IN_128K)
    {
      if(pattern_bus_test(first_pattern, PATTERNS_IN_128K) != SUCCESS)
      {
        pams_failed = TRUE;
        pels_failed |= 1 << current_pel;
        if(lm_error("Pattern bus test failed using Pin Electronics %d, Pattern \
Memory %d.\n", current_pel, pac_get_pam_number(first_pattern)) != SUCCESS)
          return(FAILURE);
      }
    }
    if(pams_failed == FALSE)
    {
      if(pels_failed == 0)
        return(SUCCESS);
      else
        (void)lm_message("Pattern bus test passed using Pin Electronics %d.\n",
         current_pel);
    }
  }
  /* If we got here, then at least one test failed for each PEL */
  if((pels_found == pels_failed))
    (void)lm_error("Pattern bus test failed for all Pin Electronics in \
lane.\n");
  else
    (void)lm_message("Pattern bus test passed at least once in lane.\n");
  return(FAILURE);
}

/*      int pac_crc_test()
 *
 *      INPUT:  none
 *      OUTPUT: return code = SUCCESS or FAILURE
 *      DESCRIPTION:
 */
int
pac_crc_test()
{
  int first_pattern;
  int dabs_found;
  int pams_failed;
  int dabs_failed = 0;

  if(pac_stack_pams(current_lane) != SUCCESS)
  {
    (void)lm_error("Pattern memory configuration error.\n");
    return(FAILURE);
  }

  if(diag_clear_errors() != SUCCESS)
    return(FAILURE);

  /* See if there are any Diagnostic Adapters in the lane */
  if((dabs_found = pac_check_for_diag_dabs(pac_check_for_pels())) == 0)
  {
    (void)lm_error("Cannot perform CRC (no Diagnostic Adapters in lane).\n");
    return(FAILURE);
  }

  /* Test the PELs one at a time (need to set global PEL variable) */
  /* The first PEL which passes the test => the PAC passes and the */
  /* test is over */
  for(current_pel = 0; current_pel < NUMBER_OF_PELS; ++current_pel)
  {
    if(((1 << current_pel) & dabs_found) == 0)  /* current DAB not found */
      continue;

    /* Set up the PEL and the DAB for the CRC test (set global dab_type) */
    dab_type = DIAG_DAB;
    if(pel_crc_setup() != SUCCESS)
    {
      (void)lm_error("Unable to perform Pattern Controller CRC test with Pin \
Electronics in slot %d.\n", current_pel);
      dabs_failed |= 1 << current_pel;
      continue;
    }
    /* Test all of the pattern memory on the PAC in 128K chunks */
    pams_failed = FALSE;
    for(first_pattern = 0; first_pattern < pac[current_lane].num_patterns;
     first_pattern += PATTERNS_IN_128K)
    {
      if(pel_crc_test_128K(first_pattern) != SUCCESS)
      {
        pams_failed = TRUE;
        dabs_failed |= 1 << current_pel;
        if(lm_error("CRC test failed using Pin Electronics %d, Pattern \
Memory %d.\n", current_pel, pac_get_pam_number(first_pattern)) != SUCCESS)
          return(FAILURE);
      }
    }
    if(pams_failed == FALSE)
    {
      if(dabs_failed == 0)
        return(SUCCESS);
      else
        (void)lm_message("CRC test passed us:.. Pin Electronics in slot %d.\n",
         current_pel);
    }
  }
  /* If we got here, then at least one test failed for each PEL */
  if((dabs_found == dabs_failed))
    (void)lm_error("CRC test failed for all Pin Electronics in lane.\n");
  else
    (void)lm_message("Pattern bus test passed at least once in lane.\n");
  return(FAILURE);
}
```

Copyright 1989
Logic Modeling Systems

SOURCE PROGRAM: diags/pac_util.c | DATE: 5/23/89 | TIME: 4:41:22 pm | PAGE # 1/74

LINE # SOURCE TEXT

```
/* SCCS_ID: pac_util.c rev 3.1, 4/24/89 at 07:49:27     */

/*****************************************************************
 *        pac_util.c                                             *
 *                                                               *
 *        Utility routines                                       *
 *        used in PAC diagnostics                                *
 *                                                               *
 *****************************************************************/
#include <math.h>
#include "vrtx.h" /* for lm_delay and lm_time */
#include "common.h"
#include "mod_def.h"
#include "modeler_extn.h"
#include "tmg.h"
#include "tmg_def.h"
#include "tmg_extn.h"
#include "tmg_run.h"
#include "pac.h"
#include "magic.h"
#include "pel.h"
#include "pac_def.h"
#include "pac_extn.h"
#include "id.h"



int
pac_check_for_pels()
{
  int slot;
  int pels_found = 0;

  for(slot = 0; slot < NUMBER_OF_SLOTS; ++slot)
    pels_found |= (probe_pel(current_lane, slot) == SUCCESS) ? (1 << slot) : 0;
  return(pels_found);
}

int
pac_check_for_diag_dabs(pels_found)
int pels_found;
{
  int pel = 0;
  int diag_dabs = 0;

  pels_found &= ~(~0 << NUMBER_OF_PELS);
  while(pels_found > 0)
  {
    if((pels_found & 1) != 0)
    {
     if(what_dab(current_lane, pel) == DIAG_DAB)
        diag_dabs |= 1 << pel;
    }
    ++pel;
    pels_found >>= 1;
  }
  return(diag_dabs);
}

/*       int pac_pre_play()
 *
 *       INPUT:  none
 *       OUTPUT: returns conservative timeout in ms (0 => FAILURE)
 *       DESCRIPTION: Measures clock frequency and then
 *       sets clock speed register on PAC. Computes and returns
 *       conservative timeout based on clock period and max
 *       patterns in enabled lanes.
 */
int
pac_pre_play()
{
  int pac_compute_playtime();
  int enabled_lanes;
  int clock_period;
  int max_patterns;
  int lane_no;

  /* Find out which lanes have been enabled */
  enabled_lanes = tmgptr->lane_enable;

  /* Measure the clock period */
  if((clock_period = tmg_measure_period() / 1000) == 0)
  {
    (void)lm_error("Unable to measure the clock period.\n");
    return(0);
  }
  /* Set the PAC clock speed registers in each of the enabled  and configured
    lanes. Figure out the greatest number of patterns in enabled lanes */
  for(lane_no = 0, max_patterns = 0; lane_no < NUMBER_OF_LANES; lane_no++)
  {
    if((Lane_code(lane_no) & enabled_lanes & configured_lanes) != 0)
    {
      Pac_clock_speed(lane_no, clock_period);
      if(pac[lane_no].num_patterns > max_patterns)
       max_patterns = pac[lane_no].num_patterns;
    }
  }
  /* Return a timeout based on a worst case expected play time */
  return(Timeout(pac_compute_playtime(max_patterns, clock_period)));
}


/*       int pac_play(timeout)
 *
 *       INPUT:  timeout = pattern play timeout in ms
 *       OUTPUT: returns SUCCESS or FAILURE
 *       DESCRIPTION: Performs a pattern play.
 */
int pac_play(timeout)
int timeout;
{
  /* Check for errors on the backplane */
  if((Get_bp_error() & tmgptr->lane_enable) != 0)
  {
    report_bp_error();
    (void)lm_error("Unable to play due to backplane error(s).\n");
    return(FAILURE);
  }

  if(tmg_play((long)timeout) != SUCCESS)
```

Copyright 1989
Logic Modeling Systems

SOURCE PROGRAM diags/pac_util.c | DATE 5/23/89 | TIME 4:41:22 pm | PAGE # 2/75

SOURCE TEXT

```
    {
      (void)lm_error("Pattern play fails with a timeout of %dms.\n", timeout);
      pac_play_cleanup();
      return(FAILURE);
    }
  return(SUCCESS);
}


/*      void pac_info_init()
 *
 *      INPUT:  none
 *      OUTPUT: none
 *      DESCRIPTION: Initializes PAC information table and
 *      PAC pointers.
 */
void
pac_info_init()
{
  int lane_no;

  for(lane_no = 0; lane_no < NUMBER_OF_LANES; lane_no++)
  {
    pac[lane_no].lane_offset = LANE_A_OFFSET + (lane_no * LANE_SIZE);
    pac[lane_no].num_pams = 0;
    pac[lane_no].exists = FALSE;
    pac[lane_no].num_blocks = Host ? 0x40000 : 01;
    pac[lane_no].num_patterns = Host ? 0x40000 : 01;
    pacptr[lane_no] = (PAC *)(pac[lane_no].lane_offset + PAC_REG_OFFSET);
  }
  configured_lanes = NONE;
}

/*      int pac_write_pattern(pattern, &pattern_word)
 *
 *      INPUT:  pattern = pattern number (0 counting)
 *              &pattern_word = address of pattern to be written
 *      OUTPUT: returns SUCCESS or FAILURE
 *      DESCRIPTION: Writes pattern word to pattern location. Returns
 *      FAILURE if pattern number is outside pattern memory.
 */
int
pac_write_pattern(pattern, patptr)
int pattern;
PAT_WORD *patptr;
{
  u_long location;

  /* Check if pattern number is valid */
  if((pattern < 0) || (pattern > (pac[current_lane].num_patterns - 1)))
    return(FAILURE);

  /* Compute base address */
  location = pac[current_lane].lane_offset + (4 * pattern);

  /* Write pattern word */
  Write_long(location + BANK_0, patptr->mem_bank[0]);
  Write_long(location + BANK_1, patptr->mem_bank[1]);
  Write_long(location + BANK_2, patptr->mem_bank[2]);
  return(SUCCESS);
}


/*      int pac_read_pattern(pattern, &pattern_word)
 *
 *      INPUT:  pattern = pattern number (0 counting)
 *              &pattern_word = address of pattern to place read values
 *      OUTPUT: returns SUCCESS or FAILURE
 *      DESCRIPTION: Reads pattern word from pattern location. Returns
 *      FAILURE if pattern number is outside pattern memory.
 */
int
pac_read_pattern(pattern, patptr)
int pattern;
PAT_WORD *patptr;
{
  u_long location;

  /* Check if pattern number is valid */
  if((pattern < 0) || (pattern > (pac[current_lane].num_patterns - 1)))
    return(FAILURE);

  /* Compute base address */
  location = pac[current_lane].lane_offset + (4 * pattern);

  /* Read pattern word */
  patptr->mem_bank[0] = Read_long(location + BANK_0);
  patptr->mem_bank[1] = Read_long(location + BANK_1);
  patptr->mem_bank[2] = Read_long(location + BANK_2);
  return(SUCCESS);
}


/*      int pac_timed_play(clock_period, patterns, &play_time)
 *
 *      INPUT:  clock_period = pattern clock period in ns
 *              patterns = number of patterns to play time before play times out
 *              &play_time = address of play_time
 *      OUTPUT: playtime - time of pattern play in ms (5ms resolution)
 *              returns SUCCESS or FAILURE
 *      DESCRIPTION: Performs pattern play to selected lanes. Both
 *      the TMG and the PAC must be set up.
 */
int
pac_timed_play(clock_period, patterns, play_time)
int clock_period;
int patterns;
int *play_time;
{
  int pac_compute_playtime();
  int start;
  int expected_time;
  int play_result;

  *play_time = 0;
  /* Check for errors on the backplane */
  if((Get_bp_error() & tmgptr->lane_enable) != 0)
  {
    report_bp_error();
    (void)lm_error("Unable to play due to backplane error(s).\n");
```

Copyright 1989 Logic Modeling Systems

SOURCE PROGRAM diags/pac_util.c | DATE 5/23/89 | TIME 4:41:22 pm | PAGE # 3/76

LINE # SOURCE TEXT

```
      return(FAILURE);
  }

  expected_time = (long)pac_compute_playtime(patterns, clock_period);

  start = lm_time();                      /* Sync time           */
  while(start == lm_time())               /*    and              */
    ;                                     /*    then             */
  start = lm_time();                      /* record current time  */
  play_result = tmg_play((long)Timeout(expected_time));
  *play_time = lm_time() - start;                   /* Record play time */
  if(play_result != SUCCESS)
  {
    (void)lm_error("tmg_play fails.\n");
    pac_play_cleanup();
    return(FAILURE);
  }
  /* Check to see if there is an error on the backplane */
  if(report_bp_error() != 0)
  {
    (void)lm_error("Timed pattern play caused backplane error.\n");
    return(FAILURE);
  }
  /* Check to see if actual time was close to expected time */
  if((*play_time < (expected_time - TIMER_RES)) ||
   (*play_time > (expected_time + TIMER_RES)))
  {
    (void)lm_error("Play timing error: Expected %d ms. Actual %d ms.\n",
     expected_time, *play_time);
    return(FAILURE);
  }
  return(SUCCESS);
}

/*      void pac_play_cleanup()
 *
 *      INPUT:  none
 *      OUTPUT: none
 *      DESCRIPTION: Performs pattern play cleanup after a failed play.
 */
void
pac_play_cleanup()
{
  if(Bp_mode() == PLAY_MODE)
  {
    (void)lm_message("Backplane is still in play mode.\n");
    (void)lm_message("Attempting to abort play.\n");
    if(pac_abort_play() != SUCCESS)
    {
      (void)lm_message("Abort failed. Forcing backplane into access mode.\n");
      tmgptr->abort_pattern_play = 1;
      (void)pac_clock_off();
      (void)pac_clock_on();
      lm_delay(5);
      (void)pac_clock_off();
      if(Bp_mode() == PLAY_MODE)
        (void)lm_message("Unable to force backplane into access mode.\n");
    }
  }
}

/*      void pac_set_first_block(lanes, first_block)
 *
 *      INPUT:  lanes = desired lanes for pattern play
 *              first_block = block number of first pattern
 *      OUTPUT: none
 *      DESCRIPTION: Sets the branch address register to the
 *      desired block number in each of the desired lanes. All
 *      desired lanes must be configured.
 */
void
pac_set_first_block(lanes, first_block)
int lanes;
int first_block;
{
  int lane_no;

  for(lane_no = 0; lane_no < NUMBER_OF_LANES; lane_no++)
  {
    if((Lane_code(lane_no) & lanes & configured_lanes) != 0)
    {
      pacptr[lane_no]->branch_address = first_block;
    }
  }
}

/*      int pac_abort_play()
 *
 *      INPUT:  none
 *      OUTPUT: returns SUCCESS or FAILURE
 *      DESCRIPTION: Aborts pattern play by asserting and then removing
 *      the error line.
 */
int
pac_abort_play()
{
  int start;

  start = lm_time();
  tmgptr->backplane_error = 1;            /* Assert error line */
  while(tmgptr->clock_on)                 /* Wait for clocks to shut off */
    if((lm_time() - start) > 5)           /* 5ms timeout */
    {
      tmgptr->backplane_error = 0;        /* Deassert error line */
      (void)lm_error("Could not halt play - clocks are on.\n");
      return(FAILURE);
    }
  tmgptr->backplane_error = 0;             /* Deassert error line */
  /* Flush error signal out of pipeline */
  if(pac_clock_off() != SUCCESS)          /* Turn off clock */
    return(FAILURE);
  if(pac_clock_on() != SUCCESS)           /* Turn on clock */
    return(FAILURE);
  if(pac_clock_off() != SUCCESS)          /* Turn off clock */
    return(FAILURE);
  if(Bp_mode() == PLAY_MODE)
  {
    (void)lm_message("Unable to abort play.\n");
    (void)lm_message("Backplane is still in play mode.\n");
    return(FAILURE);
```

Copyright 1989 Logic Modeling Systems

SOURCE PROGRAM diags/pac_util.c

DATE 5/23/89 TIME 4:41:22 pm PAGE # 4/77

LINE # SOURCE TEXT

```
  }
  return(SUCCESS);
}


/*      int pac_clock_on()
 *
 *      INPUT:  none
 *      OUTPUT: returns SUCCESS or FAILURE
 *      DESCRIPTION: Turns on pattern clock.
 */
int
pac_clock_on()
{
  int start;

  tmgptr->clock_sync_clearL = 1;
  tmgptr->clock_enable = 1;
  start = lm_time();
  while(!tmgptr->clock_on)
  {
    if((lm_time() - start) > 5)        /* 5ms timeout */
    {
      (void)lm_error("Unable to turn on clock.\n");
      return(FAILURE);
    }
  }
  return(SUCCESS);
}


/*      int pac_clock_off()
 *
 *      INPUT:  none
 *      OUTPUT: returns SUCCESS or FAILURE
 *      DESCRIPTION: Turns off pattern clock.
 */
int
pac_clock_off()
{
  int start;

  tmgptr->clock_enable = 0;
  start = lm_time();
  while(tmgptr->clock_on)
  {
    if((lm_time() - start) > 5)        /* 5ms timeout */
    {
      (void)lm_error("Unable to turn off clock.\n");
      return(FAILURE);
    }
  }
  tmgptr->clock_sync_clearL = 0;
  return(SUCCESS);
}


/*
 *      int pac_set_pattern_clock(period)
 *
 *      INPUT:  period = clock period in nanoseconds
 *      OUTPUT: returns SUCCESS or FAILURE
 *      DESCRIPTION: Sets pattern clock to period specified.
 *      This routine computes the values for n, k, and clock
 *      select register setting to give the best approximation
 *      of the desired clock period.  The clock period provided
 *      is always equal to or greater than that requested.
 *      The actual clock period is related to n, k as follows:
 *              period = (k / n) * T_REF, where
 *      k = 1, 2, ..., 256 or k = 2, 4, ..., 512,
 *      n = 128, 129, ..., 256, and
 *      T_REF = 256 / 30 MHz = PLL reference period.
 *
 *      Returns: FAILURE if period out of range, else SUCCESS
 */
int
pac_set_pattern_clock(period)
int period;
{
  double error;
  double besterror;
  double kprime;
  int tmpk;
  int n;
  int save_k;
  int save_n;

  if((period > PAC_MAX_PERIOD) || (period < PAC_MIN_PERIOD))
    return(FAILURE);
  if(pac_clock_off() != SUCCESS)
    return(FAILURE);
  for(besterror = 1.0, n = N_MIN; n <= N_MAX; n++)
  {
    kprime = n * period / 8533.3333;    /* 8533.3333 = T_REF in ns */
    if((tmpk = (int)ceil(kprime)) > 512)/* see if out of range   */
      continue;                         /* if so, ignore it      */
    if(tmpk > 256)                      /* see if above 256      */
      if(tmpk & 1)                      /* see if odd            */
        tmpk++;                         /* make even             */
    if((error = (((double)tmpk - kprime) / kprime)) < besterror)
    {
      save_n = n;
      save_k = tmpk;
      besterror = error;
    }
  }
  tmgptr->pll_rate = 256 - save_n + 1;          /* put in reg   */
  if(save_k == 1)
  {
    tmgptr->pll_divisor = 255;                  /* special case        */
    tmgptr->clock_select = 0;                   /* select div by 2     */
  }
  else
    if(save_k > 256)
    {
      tmgptr->pll_divisor = 256 - (save_k >> 1) + 1; /* divide k by 2  */
      tmgptr->clock_select = 2;                 /* select div by 4k    */
    }
    else
    {
```

Copyright 1989
Logic Modeling Systems

| SOURCE PROGRAM | DATE | 5/23/89 | PAGE # |
|---|---|---|---|
| diags/pac_util.c | TIME | 4:41:22 pm | 5/78 |

LINE # SOURCE TEXT

```c
            tmgptr->pll_divisor = 256 - save_k + 1;   /* normal case        */
            tmgptr->clock_select = 1;                 /* select div by 2k   */
        }
    return(SUCCESS);
}


/*      int pac_stack_pams(lane_no)
 *
 *      INPUT:  lane_no = lane number to stack
 *      OUTPUT: return code = SUCCESS or FAILURE
 *      DESCRIPTION: Reads the PAC COUNT register to see
 *      how many PAMs are stacked onto the PAC. If there
 *      are none, the function returns FAILURE.  If there
 *      is at least one PAM, the PAM PRESENT registers
 *      and the PAM ID PROMS are read. If the PAMs are
 *      strapped correctly, the PAC CONFIGURATION register
 *      is written, the PAC_INFO structure is filled,
 *      and the function returns SUCCESS. If the PAM
 *      strapping is incorrect the function returns FAILURE.
 */
int
pac_stack_pams(lane_no)
int lane_no;
{
    if(pac[lane_no].exists != TRUE)
    {
        (void)lm_error("PAC in lane %c does not exist.\n", 'A' + (char)lane_no);
        return(FAILURE);
    }
    if(pac_get_num_pams(lane_no) != SUCCESS)
    {
        (void)lm_error("Could not determine number of PAMs in lane %c.\n",
         'A' + (char)lane_no);
        return(FAILURE);
    }

    if(pam_idprom_test(lane_no) != SUCCESS)
    {
        (void)lm_error("Bad ID Prom(s) in PAM(s) in lane %c.\n", 'A' +
         (char)lane_no);
        return(FAILURE);
    }

    if(pac_get_pam_types(lane_no) != SUCCESS)
    {
        (void)lm_error("Could not get PAM types in lane %c.\n", 'A' +
         (char)lane_no);
        return(FAILURE);
    }

    if(pac_configure_pac(lane_no) != SUCCESS)
    {
        (void)lm_error("Could not configure PAC in lane %c.\n", 'A' +
         (char)lane_no);
        return(FAILURE);
    }

    return(SUCCESS);
}


/*      int pac_get_num_pams(lane_no)
 *
 *      INPUT:  lane_no = l.ne number
 *      OUTPUT: return code = SUCCESS or FAILURE
 *      DESCRIPTION: Reads the PAC COUNT register to see
 *      how many PAMs are stacked onto the PAC. If there
 *      are none, the function returns FAILURE.  If there
 *      is at least one PAM, the PAM PRESENT registers
 *      are read. If the PAMs are strapped correctly,
 *      the PAC_INFO structure is filled, and the function
 *      returns SUCCESS. If the PAM strapping is incorrect
 *      the function returns FAILURE.
 */
int
pac_get_num_pams(lane_no)
int lane_no;
{
    int pamno;

    if(pac[lane_no].exists != TRUE)
    {
        (void)lm_error("PAC in lane %c does not exist.\n", 'A' + (char)lane_no);
        return(FAILURE);
    }

    switch(pacptr[lane_no]->pam_count)
    {
        case ZERO_PAMS:
            (void)lm_error("There are no PAMs on the PAC in lane %c.\n",
             'A' + (char)lane_no);
            pac[lane_no].num_pams = 0;
            return(FAILURE);
        case ONE_PAM:
            pac[lane_no].num_pams = 1;
            break;
        case TWO_PAMS:
            pac[lane_no].num_pams = 2;
            break;
        case THREE_PAMS:
            pac[lane_no].num_pams = 3;
            break;
        case FOUR_PAMS:
            pac[lane_no].num_pams = 4;
            break;
        default:
            (void)lm_error("PAM Detect register in lane %c returns invalid code.\n",
             'A' + (char)lane_no);
            pac[lane_no].num_pams = 0;
            return(FAILURE);
    }
    for(pamno = 0; pamno < pac[lane_no].num_pams; pamno++)
    {
        if(pacptr[lane_no]->pam_register[pamno].present == PAM_NOT_PRESENT)
        {
            (void)lm_error("PAM %d in lane %c is strapped incorrectly\n",pamno,
             'A' + (char)lane_no);
            pac[lane_no].num_pams = 0;
            return(FAILURE);
```

Copyright 1989
Logic Modeling Systems

SOURCE PROGRAM diags/pac_util.c | DATE 5/23/89 | TIME 4:41:22 pm | PAGE # 6/79

LINE # SOURCE TEXT

```
      }
    }
  return(SUCCESS);
}


/*      int pac_get_pam_size(lane_no, pam_no)
 *
 *      INPUT:  lane_no = lane number
 *              pam_no = Pattern memory board number
 *      OUTPUT: number of patterns in the board
 *      DESCRIPTION: Reads the PAM ID Prom to determine the
 *      number of patterns.
 */
int
pac_get_pam_size(lane_no, pam_no)
int lane_no;
int pam_no;
{
  ID_PROM_PAM id_prom_table;
  ID_PROM_PAM *pam_id_info = &id_prom_table;

  (void)diag_get_id_info((int)((lane_no * LANE_SIZE) + LANE_A_PAM_ID_PROM +
   (pam_no * PAM_ID_SPACE)), (char *)pam_id_info);

  return(pam_id_info->patterns << 10);
}

/*      int pac_get_pam_types(lane_no)
 *
 *      INPUT:  lane_no = lane number
 *      OUTPUT: return code = SUCCESS or FAILURE
 *      DESCRIPTION: Checks the PAM ID Proms and if they
 *      have proper checksums, reads the PAM ID in each.
 *      If the PAMs are strapped correctly, the PAC_INFO
 *      structure is filled, and the function returns SUCCESS.
 *      If the PAM strapping is incorrect the function returns
 *      FAILURE.
 */
int
pac_get_pam_types(lane_no)
int lane_no;
{
  int pam_no;
  register u_long current;
  register u_long patterns;

  pac[lane_no].num_blocks = 0;
  pac[lane_no].num_patterns = 0;

  if(pac[lane_no].exists != TRUE)
  {
    (void)lm_error("PAC in lane %c does not exist.\n", 'A' + (char)lane_no);
    return(FAILURE);
  }
  current = PATTERNS_IN_2M;
  for(pam_no = 0; pam_no < pac[lane_no].num_pams; pam_no++)
  {
    if((patterns = pac_get_pam_size(lane_no, pam_no)) > current)
    {
      (void)lm_error("PAMs in lane %c are strapped out of order.\n",
       'A' + (char)lane_no);
      pac[lane_no].num_patterns = 0;
      return(FAILURE);
    }
    else
    {
      pac[lane_no].p_m_size[pam_no] = current = patterns;
      pac[lane_no].num_patterns += patterns;
    }
  }
  pac[lane_no].num_blocks = pac[lane_no].num_patterns / BLOCK_SIZE;
  return(SUCCESS);
}

/*      int pac_configure_pac(lane_no)
 *
 *      INPUT:  lane_no = lane number of PAC to configure
 *      OUTPUT: return code = SUCCESS or FAILURE
 *      DESCRIPTION: Uses values stored in the PAC information
 *      table (global) to write the PAC CONFIGURATION register.
 */
int
pac_configure_pac(lane_no)
int lane_no;
{
  if(pac[lane_no].exists != TRUE)
  {
    (void)lm_error("PAC in lane %c does not exist.\n", 'A' + (char)lane_no);
    return(FAILURE);
  }
  switch(pac[lane_no].num_pams)
  {
    case 1:
      switch(pac[lane_no].num_blocks)
      {
        case BLKS_IN_128K:
          pacptr[lane_no]->configuration = 60;
          break;
        case BLKS_IN_512K:
          pacptr[lane_no]->configuration = 61;
          break;
        case BLKS_IN_2M:
          pacptr[lane_no]->configuration = 62;
          break;
        default:
          (void)lm_error("Number of blocks in information table invalid.\n");
          break;
      }
      break;
    case 2:
    case 3:
    case 4:
      pacptr[lane_no]->configuration = (pac[lane_no].num_blocks /
       BLKS_IN_128K) - 1;
      break;
    default:
      (void)lm_error("Number of PAMs in information table invalid.\n");
      return(FAILURE);
  }
```

Copyright 1989
Logic Modeling Systems

| SOURCE PROGRAM | DATE | PAGE # |
|---|---|---|
| diags/pac_util.c | 5/23/89 | 7/80 |
| | TIME 4:41:22 pm | |

SOURCE TEXT

```
  Pac_set_parity(lane_no, SET_ODD_PARITY);
  return(SUCCESS);
}


/*      int pac_fill_check(first_pattern, patterns)
 *
 *      INPUT:  first_pattern = first pattern number to fill (0 counting)
 *              patterns = number of patterns to fill
 *      OUTPUT: return code = SUCCESS or FAILURE
 *      DESCRIPTION: Checks bounds on first_pattern and patterns.
 *      Used by pac_fill_xx functions.  The function returns
 *      SUCCESS if the patterns to be filled
 *      are within the pattern memory and FAILURE if any
 *      portion of the fill space is outside the physical
 *      pattern memory address space.
 */
int
pac_fill_check(first_pattern,patterns)
int first_pattern;
int patterns;
{
  if((first_pattern < 0) ||
   (first_pattern > (pac[current_lane].num_patterns - 1)))
  {
    (void)lm_error("First pattern number passed to fill routine \
outside of pattern memory.\n");
    return(FAILURE);
  }
  if((patterns < 1) || ((first_pattern + patterns) >
   pac[current_lane].num_patterns))
  {
    (void)lm_error("Number of patterns passed to fill routine \
outside of pattern memory.\n");
    return(FAILURE);
  }
  return(SUCCESS);
}


/*      int pac_fill_random(first_pattern, patterns, fill_mask, seed)
 *
 *      INPUT:  first_pattern = first pattern number to fill
 *              patterns = number of patterns to fill
 *              fill_mask = control word mask
 *              seed = random number seed
 *      OUTPUT: return code = SUCCESS or FAILURE
 *      DESCRIPTION: Fills pattern memory with pseudorandom
 *      data starting at the pattern number specified by 'first_pattern'.
 *      The total number of patterns is specified by 'patterns'.
 *      The function returns SUCCESS if the operation is
 *      successful and FAILURE if any portion of the fill
 *      space is outside the physical pattern memory address
 *      space.
 */
int
pac_fill_random(first_pattern, patterns, fill_mask, seed)
int first_pattern;
int patterns;
register u_long fill_mask;
u_long seed;
{
  register u_long *memptr;
  register u_long i;
  register u_long random_number;
  u_long pattern_offset;
  u_long bank_offset;
  int bank;

  if(pac_fill_check(first_pattern,patterns) != SUCCESS)
    return(FAILURE);

  pattern_offset = pac[current_lane].lane_offset + 4*first_pattern;
  random_number = seed;

  (void)lm_message("Filling %d patterns with random data", patterns);
  for(bank = 0, bank_offset = 0; bank < 3; ++bank)
  {
    (void)lm_message(".");
    memptr = (u_long *)(pattern_offset + bank_offset);
    i= patterns / 4;
    if((bank == 2) && (fill_mask != ~0l))
    {
      do
      {
        random_number = Pac_get_random(random_number);
        *memptr++ = random_number & fill_mask;
        random_number = Pac_get_random(random_number);
        *memptr++ = random_number & fill_mask;
        random_number = Pac_get_random(random_number);
        *memptr++ = random_number & fill_mask;
        random_number = Pac_get_random(random_number);
        *memptr++ = random_number & fill_mask;
      } while (--i);
      for(i=0; i < (patterns % 4); ++i)
      {
        random_number = Pac_get_random(random_number);
        *memptr++ = random_number & fill_mask;
      }
    }
    else
    {
      do
      {
        random_number = Pac_get_random(random_number);
        *memptr++ = random_number;
        random_number = Pac_get_random(random_number);
        *memptr++ = random_number;
        random_number = Pac_get_random(random_number);
        *memptr++ = random_number;
        random_number = Pac_get_random(random_number);
        *memptr++ = random_number;
      } while (--i);
      for(i=0; i < (patterns % 4); ++i)
      {
        random_number = Pac_get_random(random_number);
        *memptr++ = random_number;
      }
    }
    bank_offset += PAT_MEM_BANK;
```

Copyright 1989 Logic Modeling Systems

SOURCE PROGRAM diags/pac_util.c

DATE 5/23/89 TIME 4:41:22 pm

PAGE # 8/81

LINE # SOURCE TEXT

```
  }
  (void)lm_message("done.\n");
  return(SUCCESS);
}


/*      int pac_read_random(first_pattern, patterns, fill_mask, seed)
 *
 *      INPUT:  first_pattern = first pattren number to read
 *              patterns = number of patterns to read
 *              fill_mask = control word mask
 *              seed = random number seed
 *      OUTPUT: return code = SUCCESS or FAILURE
 *      DESCRIPTION: Reads pattern memory and compares with pseudorandom
 *      data starting at the pattern number specified by 'first_pattern'.
 *      The total number of patterns is specified by 'patterns'.
 *      The function returns SUCCESS if all patterns are identical.
 *      The function returns FAILURE if any of the patterns do not
 *      compare.  The failed address and the good and bad data words
 *      are output as an error message.
 */
int
pac_read_random(first_pattern, patterns, fill_mask, seed)
int first_pattern;
register int patterns;
register u_long fill_mask;
u_long seed;
{
  register u_long *memptr;
  register u_long i;
  register u_long temp;
  register u_long random_number;
  u_long pattern_offset;
  u_long bank_offset;
  int bank;
  int returncode = SUCCESS;

  if(pac_fill_check(first_pattern, patterns) != SUCCESS)
    return(FAILURE);
  pattern_offset = pac[current_lane].lane_offset + 4 * first_pattern;
  random_number = seed;

  (void)lm_message("Reading %d random data patterns", patterns);
  for(bank = 0, bank_offset = 0; bank < 3; ++bank)
  {
    (void)lm_message(".");
    memptr = (u_long *)(pattern_offset + bank_offset);
    if((bank == 2) && (fill_mask != ~0l))
    {
      for(i=0; i < patterns; ++i)
      {
        random_number = Pac_get_random(random_number);
        if((temp = *memptr++) != (random_number & fill_mask))
        {
          if(lm_error("Random read test. Address = %08x.\n\
Expected = %08x, Actual = %08x.\n", memptr - 1, random_number & fill_mask,
           temp) != SUCCESS)
            return(FAILURE);
          else
            returncode = FAILURE;
        }
      }
    }
    else
    {
      for(i=0; i < patterns; ++i)
      {
        random_number = Pac_get_random(random_number);
        if((temp = *memptr++) != random_number)
        {
          if(lm_error("Random read test. Address = %08x.\n\
Expected = %08x, Actual = %08x.\n", memptr - 1, random_number, temp) != SUCCESS)
            return(FAILURE);
          else
            returncode = FAILURE;
        }
      }
    }
    bank_offset += PAT_MEM_BANK;
  }
  (void)lm_message("done.\n");
  return(returncode);
}

/*      int pac_fill_counting(first_pattern, patterns, fill_mask)
 *
 *      INPUT:  first_pattern = first pattern
 *              patterns = number of patterns to fill
 *              fill_mask = control word mask
 *      OUTPUT: return code = SUCCESS or FAILURE
 *      DESCRIPTION: Fills pattern memory with 'counting' data
 *      starting at the pattern number specified by 'first_pattern'.
 *      The total number of patterns is specified by 'patterns'.
 *      The function returns SUCCESS if the operation is successful
 *      and FAILURE if any portion of the fill space is outside
 *      the physical pattern memory address space.
 */
int
pac_fill_counting(first_pattern, patterns, fill_    k)
int first_pattern;
register int patterns;
register u_long fill_mask;
{
  register u_long i;
  register u_long location;

  if(pac_fill_check(first_pattern, patterns) != SUCCESS)
    return(FAILURE);
  location = pac[current_lane].lane_offset + 4*first_pattern;
  (void)lm_message("Filling %d patterns with counting data...", patterns);
  for(i=0; i < patterns; i++)
  {
    /* Write count to Banks 0 and 1 */
    Write_long(location + BANK_0, i);
    Write_long(location + BANK_1, i);
    /* Write count to Bank 2, masking off control bits */
    Write_long(location + BANK_2, i & fill_mask);
    location += 4;      /* Increment location to next long word address */
  }
  (void)lm_message("done.\n");
```

Copyright 1989
Logic Modeling Systems

| SOURCE PROGRAM | DATE | PAGE # |
|---|---|---|
| diags/pac_util.c | 5/23/89 | 9/82 |
| | TIME 4:41:22 pm | |

LINE # SOURCE TEXT

```
  return(SUCCESS);
}


/*      int pac_fill_land0(first_pattern, patterns, fill_mask)
 *
 *      INPUT:  first_pattern = first pattern
 *              patterns = number of patterns to fill
 *              fill_mask = control word mask
 *      OUTPUT: return code = SUCCESS or FAILURE
 *      DESCRIPTION: Fills pattern memory with alternating ones
 *      and zeros data starting at the pattern number specified by
 *      'first_pattern'.  The total number of patterns is specified by
 *      'patterns'.  The function returns SUCCESS if the operation
 *      is successful and FAILURE if any portion of the fill
 *      space is outside the physical pattern memory address space.
 */
int
pac_fill_land0(first_pattern, patterns, fill_mask)
int first_pattern;
register int patterns;
register u_long fill_mask;
{
  register u_long i;
  register u_long value;
  register u_long location;

  if(pac_fill_check(first_pattern, patterns) != SUCCESS)
    return(FAILURE);
  location = pac[current_lane].lane_offset + 4*first_pattern;
  (void)lm_message("Filling %d patterns with alternating ones and \
zeros data...", patterns);
  for(i=0; i < patterns; i++)
  {
    if((i & 1) == 0)    /* If pattern number is even */
      value = 0;        /* value is all zeros */
    else
      value = ~0;       /* value is all ones */
    /* Write value to Banks 0 and 1 */
    Write_long(location + BANK_0, value);
    Write_long(location + BANK_1, value);
    /* Write count to BANK 2, masking off control bits */
    Write_long(location + BANK_2, value & fill_mask);
    location += 4;      /* Increment location to next long word address */
  }
  (void)lm_message("done.\n");
  return(SUCCESS);
}


/*      int pac_fill_walking(first_pattern, patterns, fill_mask, data)
 *
 *      INPUT:  first_pattern = block address of first pattern
 *              patterns = number of patterns to fill
 *              fill_mask = control word mask
 *              data = pattern data (0 or 1)
 *      OUTPUT: return code = SUCCESS or FAILURE
 *      DESCRIPTION: Fills pattern memory with walking ones or
 *      zeros data starting at the block number specified by
 *      'first_pattern'.  The total number of patterns is specified by
 *      'patterns'.  The function returns SUCCESS if the operation
 *      is successful and FAILURE if the any portion of the fill
 *      space is outside the physical pattern memory address space.
 */
int
pac_fill_walking(first_pattern, patterns, fill_mask, data)
int first_pattern;
register int patterns;
u_long fill_mask;
int data;
{
  register u_long i;
  u_long same;
  u_long shift[32];
  register u_long location;

  if(pac_fill_check(first_pattern, patterns) != SUCCESS)
    return(FAILURE);
  if(data == 0)           /* Fill array with walking zeros */
  {
    same=~0;
    shift[0] = ~1;
    for(i=1; i < 32; ++i)
      shift[i] = (shift[i-1] << 1) | 0x01;
  }
  else                    /* Fill array with walking ones */
  {
    same=0;
    shift[0] = 1;
    for(i=1; i < 32; ++i)
      shift[i] = (shift[i-1] << 1);
  }
  location = pac[current_lane].lane_offset + 4*first_pattern;
  (void)lm_message("Filling %d patterns with walking %s data...",
      patterns, (data == 0) ? "zeros" : "ones");
  for(i=0; i < patterns; i++)
  {
    switch((i/32)%3)
    {
      case 0:
        Write_long(location + BANK_0, shift[i%32]);
        Write_long(location + BANK_1, same);
        Write_long(location + BANK_2, same & fill_mask);
        break;
      case 1:
        Write_long(location + BANK_0, same);
        Write_long(location + BANK_1, shift[i%32]);
        Write_long(location + BANK_2, same & fill_mask);
        break;
      case 2:
        Write_long(location + BANK_0, same);
        Write_long(location + BANK_1, same);
        Write_long(location + BANK_2, shift[i%32] & fill_mask);
        break;
      default:
        return(FAILURE);
        break;
    }
    location += 4;      /* Increment location to next long word address */
  }
```

Copyright 1989 Logic Modeling Systems

LINE # SOURCE TEXT

```
    (void)lm_message("done.\n");
   return(SUCCESS);
 }


/*      int location_test(address, first_bit, num_bits)
 *
 *      INPUT:  address = long word address
 *              first_bit = first valid bit in register (0-31)
 *              num_bits = number of valid bits in register (1-32)
 *      OUTPUT: returns SUCCESS or FAILURE
 *      DESCRIPTION: Performs complete register (or memory location)
 *      test on location pointed to by address. The first and last
 *      bits in the register determine which bits the function checks.
 */
int
location_test(address, first_bit, num_bits)
u_long address;
int first_bit;
int num_bits;
{
  u_long i;
  int j;
  u_long mask;
  u_long temp;
  int returncode = SUCCESS;

  mask = (~01 << first_bit) & ~(~01 << (first_bit + num_bits));

  /* Perform walking ones test */
  for(i = 1 << first_bit, j = 0; j < num_bits; j++, i <<= 1)
  {
    Write_long(address, i);                /* Write pattern to location */
    if((temp = ((Read_long(address)) & mask)) != i)
    {
      returncode = FAILURE;
      if(lm_error("PAC location test. Address = %08x.\n\
\tExpected = %08x,\n\tActual = %08x.\n", address, i, temp) != SUCCESS)
          return(FAILURE);
    }
  }

  /* Perfrom walking zeros test */
  for(i = (~(1 << first_bit) & mask), j = 0, j < num_bits, j++,
   i = ((i << 1) | 0x01) & mask)
  {
    Write_long(address,i);                 /* Write pattern to location */
    if((temp = ((Read_long(address)) & mask)) != i)
    {
      returncode = FAILURE;
      if(lm_error("PAC location test. Address = %08x.\n\
\tExpected = %08x,\n\tActual = %08x.\n", address, i, temp) != SUCCESS)
        return(FAILURE);
    }
  }
  return(returncode);
}


/*      int build_pattern_control(first_pattern, patterns, mode)
 *
 *      INPUT:  first_pattern = first pattern number to link
 *              patterns = number of patterns to link
 *              mode = STOP_MODE or LOOP_MODE
 *      OUTPUT: return code = SUCCESS or FAILURE
 *      DESCRIPTION: Links blocks of pattern memory with
 *      Link Table.  Puts Branch Always Instructions in the
 *      proper locations. In STOP_MODE, a stop instruction is
 *      placed at the end of the pattern sequence.  In LOOP_MODE,
 *      a Branch Always instruction is placed at the end of the
 *      pattern sequence and the Link Table is loaded so that
 *      the last branch is to the initial pattern block.  The
 *      function returns SUCCESS or FAILURE.
 */
int
build_pattern_control(first_pattern, patterns, mode)
int first_pattern;
register int patterns;
int mode;
{
  register int i;
  register int j;
  register int max_index;
  register int total_branches;
  register u_long *memptr;
  u_long *linkptr;
  u_long pat_mem;
  u_long link_table;
  int first_block;

  if((first_pattern < 0) ||
   (first_pattern > (pac[current_lane].num_patterns - 1)))
  {
    (void)lm_error("First pattern number passed to fill routine \
outside of pattern memory.\n");
    return(FAILURE);
  }
  if((patterns < 1) || (patterns > pac[current_lane].num_patterns))
  {
    (void)lm_error("Number of patterns passed to fill routine \
outside of pattern memory.\n");
    return(FAILURE);
  }
  if((first_pattern % BLOCK_SIZE) != 0)
  {
    (void)lm_error("First pattern in seq not on block boundary.\n");
    return(FAILURE);
  }
  if((mode == LOOP_MODE) && ((patterns % BLOCK_SIZE) != 0 ))
  {
    (void)lm_error("Can only loop in block increments.\n");
    return(FAILURE);
  }

  /* Compute first block number and total number of branches */
  first_block = first_pattern/BLOCK_SIZE;
  pacptr[current_lane]->branch_address = first_block;
  total_branches = (patterns - 1)/BLOCK_SIZE;

  /* Compute first address of pattern memory and link table */
```

Copyright 1989
Logic Modeling Systems

| SOURCE PROGRAM | DATE | 5/23/89 | PAGE # |
|---|---|---|---|
| diags/pac_util.c | TIME | 4:41:22 pm | 11/84 |

LINE # SOURCE TEXT

```
    pat_mem = pac[current_lane].lane_offset + BANK_2;
    memptr = (u_long *)(pat_mem + 4 * first_pattern);
    link_table = pac[current_lane].lane_offset + LINK_OFFSET;
    linkptr = (u_long *)(link_table + 4 * first_block);
    /* See if pattern sequence wraps around pattern memory */
    if((first_pattern + patterns) <= pac[current_lane].num_patterns) /* No */
    {
      /* Put NOP instructions (Don't branch or stop) in pattern sequence */
      for(i=0; i < patterns; i++)
      {
        *(memptr++) &= NOP_MASK;
      }

      /* Fill link table and place branch always instructions */
      memptr = (u_long *)(pat_mem + 4 * (first_pattern + BLOCK_SIZE -
       BRANCH_LATENCY));
      for(i = first_block + 1, j = 0; j < total_branches, i++, j++)
      {
        *(linkptr++) = i;          /* Connect blocks in link table */
        *memptr |= BRANCH_ALWAYS;  /* Place branch always instruction */
        memptr += BLOCK_SIZE;      /* Go to next branch location */
      }
    }
    else  /* pattern sequence wraps around to beginning of pattern memory */
    {
      /* Put NOP instructions (Don't branch or stop) in pattern sequence */
      max_index = pac[current_lane].num_patterns - first_pattern;
      for(i=0; i < max_index; i++)
      {
        *(memptr++) &= NOP_MASK;
      }
      memptr = (u_long *)(pat_mem);
      max_index = patterns - max_index;
      for(i=0; i < max_index; i++)
      {
        *(memptr++) &= NOP_MASK;
      }

      /* Fill link table and place branch always instructions */
      memptr = (u_long *)(pat_mem + 4 * (first_pattern + BLOCK_SIZE -
       BRANCH_LATENCY));
      max_index = pac[current_lane].num_blocks - first_block;
      for(i = first_block + 1, j = 0; j < max_index; i++, j++)
      {
        *(linkptr++) = i;          /* Connect blocks in link table */
        *memptr |= BRANCH_ALWAYS;  /* Place branch always instruction */
        memptr += BLOCK_SIZE;      /* Go to next branch location */
      }
      *(--linkptr) = 0;            /* Point back to first block */
      linkptr = (u_long *)(link_table);
      memptr = (u_long *)(pat_mem + 4 * (BLOCK_SIZE - BRANCH_LATENCY));
      max_index = total_branches - max_index;
      for(i = 0; i < max_index; i++)
      {
        *(linkptr++) = i + 1;      /* Connect blocks in link table */
        *memptr |= BRANCH_ALWAYS,  /* Place branch always instruction */
        memptr += BLOCK_SIZE;      /* Go to next branch location */
      }
    }
    *linkptr = first_block;                  /* Go back to first block */

    /* Place stop or branch instruction, depending on mode */
    if(mode == LOOP_MODE)
    {
      *memptr |= BRANCH_ALWAYS;   /* Place branch always instruction */
    }
    else  /* must be STOP_MODE */
    {
      memptr = (u_long *)(pat_mem + 4 * ((first_pattern + patterns -
       STOP_LATENCY) % pac[current_lane].num_patterns));
      *memptr |= STOP;            /* Place stop instruction */
    }
    return(SUCCESS);
  }


/*      void pac_clear_link()
 *
 *      INPUT:  none
 *      OUTPUT: none
 *      DESCRIPTION: Clears link table in current lane.
 */
void
pac_clear_link()
{
   register u_long *memptr;
   register u_long i;

   memptr = (u_long *)(pac[current_lane].lane_offset + LINK_OFFSET);

   i = (LINK_SIZE >> 2) / 8;
   do
   {
     *memptr++ = 0;
     *memptr++ = 0;
     *memptr++ = 0;
     *memptr++ = 0;
     *memptr++ = 0;
     *memptr++ = 0;
     *memptr++ = 0;
     *memptr++ = 0;
   } while(--i);
}


/*      int pac_clear_a_pam(lane_no, pam_no)
 *
 *      INPUT:  lane_no = lane number of PAC/PAMs
 *              pam_no  = PAM number
 *      OUTPUT: return code = SUCCESS or FAILURE
 *      DESCRIPTION: Clears pattern memory on specified PAM.
 */
int
pac_clear_a_pam(lane_no, pam_no)
int lane_no;
int pam_no;
{
  register u_long *memptr;
  register u_long i;
  register u_long total_patterns;
```

Copyright 1989 Logic Modeling Systems

SOURCE PROGRAM diags/pac_util.c

DATE 5/23/89 TIME 4:41:22 pm PAGE # 12/85

LINE # SOURCE TEXT

```
    int bank;
    u_long bank_offset;

    if(pac[lane_no].exists != TRUE)
    {
      (void)lm_error("PAC in lane %c does not exist.\n", 'A' + (char)lane_no);
      return(FAILURE);
    }
    if ((total_patterns = pac[lane_no].pam_size[pam_no]) == 0)
    {
      return SUCCESS; /* nothing to clear */
    }
    (void)lm_message("Clearing PAM %d (%dK) in lane %c", pam_no,
      total_patterns >> 10, 'A' + (char)lane_no);
    for(bank = 0, bank_offset = 0; bank < 3; ++bank)
    {
      lm_message(".");     /* walking period before each bank */
      memptr = (u_long *)(Pam_base_address(lane_no, pam_no) + bank_offset);
      i = total_patterns / 8;
      do
      {
        *memptr++ = 0;
        *memptr++ = 0;
        *memptr++ = 0;
        *memptr++ = 0;
        *memptr++ = 0;
        *memptr++ = 0;
        *memptr++ = 0;
        *memptr++ = 0;
      } while(--i);
      bank_offset += PAT_MEM_BANK;
    }
    (void)lm_message("done.\n");
    return(SUCCESS);
}


/*      int pac_clear_pat_mem(lane_no)
 *
 *      INPUT:  lane_no = lane number of PAC to clear
 *      OUTPUT: return code = SUCCESS or FAILURE
 *      DESCRIPTION: Clears all of pattern memory.
 */
int
pac_clear_pat_mem(lane_no)
int lane_no;
{
  int pam_no;

  for(pam_no = 0; pam_no < pac[lane_no].num_pams; pam_no++)
  {
    if(pac_clear_a_pam(lane_no, pam_no) != SUCCESS)
    {
      (void)lm_error("Unable to clear pattern memory in lane %c.\n",
        'A' + (char)lane_no);
      return(FAILURE);
    }
  }
  return(SUCCESS);
}

/*      int pac_compute_playtime(count, clock_period)
 *
 *      INPUT:  count = length of pattern play in physical clocks
 *              clock_period = clock period in ns
 *      OUTPUT: play time in ms
 *      DESCRIPTION: Computes duration of pattern play in milliseconds.
 */
int
pac_compute_playtime(count, clock_period)
int count;
int clock_period;
{
  return((int)(((double)count * (double)clock_period) /
     1000000.0));
}


#define MIN_SAMPLE_PULSE 600     /* Min sample pulse width = 600 ns */

/*      int pac_compute_sample_width(clock_period)
 *
 *      INPUT:  clock_period = clock period in ns
 *      OUTPUT: sample width in clock cycles
 *      DESCRIPTION: Computes sample width for pattern play.
 */
int
pac_compute_sample_width(clock_period)
int clock_period;
{
  int sample_width;

  sample_width = (u_long)MIN_SAMPLE_PULSE / clock_period;
  return((sample_width < 1) ? 1 : sample_width);
}

/*      void pac_probe_all_pacs()
 *
 *      INPUT:  none
 *      OUTPUT: none
 *      DESCRIPTION: Probes all PACs in the modeler and
 *      fills in the .exists PAC information attribute.
 */
void
pac_probe_all_pacs()
{
  register int lane;

  for(lane = 0; lane < NUMBER_OF_LANES; lane++)
  {
      pac[lane].exists = (probe_pac(lane) == SUCCESS)? TRUE : FALSE;
  }
}

/*      void pac_configure_all_pacs()
 *
 *      INPUT:  none
 *      OUTPUT: none
 *      DESCRIPTION: Configures all PACs in the modeler.
 */
```

Copyright 1989 Logic Modeling Systems

| SOURCE PROGRAM | DATE | PAGE # |
|---|---|---|
| diags/pac_util.c | 5/23/89 TIME 4:41:22 pm | 13/86 |

LINE # SOURCE TEXT

```
void
pac_configure_all_pacs()
{
  int lane_no;

  pac_info_init();      /* Initialize PAC information structure */
  pac_probe_all_pacs();
  for(lane_no = 0; lane_no < NUMBER_OF_LANES; lane_no++)
  {
    if (pac[lane_no].exists == TRUE)
    {
      if(pac_stack_pams(lane_no) == SUCCESS)
      {
        if(pac_clear_pat_mem(lane_no) == SUCCESS)
          configured_lanes |= Lane_code(lane_no);
      }
    }
  }
}


/*      int pac_insert_parity_error(pattern, word_no)
 *
 *      INPUT:  pattern = pattern number to insert parity error
 *              word_no = word number within pattern number
 *      OUTPUT: return code = SUCCESS or FAILURE
 *      DESCRIPTION: Inserts a parity error in pattern memory
 *      at the location specified by the pattern number and the
 *      word number. The word number is encoded  as follows
 *                      0 = control word
 *                      1 = pattern bits 0-15
 *                      2 = pattern bits 16-31
 *                      3 = pattern bits 32-47
 *                      4 = pattern bits 48-63
 *                      5 = pattern bits 64-79
 */
int
pac_insert_parity_error(pattern, word_no)
int pattern;
int word_no;
{
  u_long bank;
  u_long word;
  u_long address;
  u_long contents;

  /* Check bounds on pattern */
  if((pattern < 0) || (pattern > (pac[current_lane].num_patterns - 1)))
  {
    (void)lm_error("Pattern number out of bounds.\n");
    return(FAILURE);
  }
  /* decode word number */
  switch(word_no)
  {
    case 0:
      bank = BANK_2;
      word = 2;
      break;
    case 1:
      bank = BANK_2;
      word = 0;
      break;
    case 2:
      bank = BANK_1;
      word = 2;
      break;
    case 3:
      bank = BANK_1;
      word = 0;
      break;
    case 4:
      bank = BANK_0;
      word = 2;
      break;
    case 5:
      bank = BANK_0;
      word = 0;
      break;
    default:
      (void)lm_error("Word number out of bounds.\n");
      return(FAILURE);
      break;
  }
  /* Compute address */
  address = pac[current_lane].lane_offset + bank + (4 * pattern) + word;

  contents = Read_word(address);

  /* change parity to opposite of current state */
  if(word == 0)
    pacptr[current_lane]->high_word_parity =
      !pacptr[current_lane]->high_word_parity;
  else
    pacptr[current_lane]->low_word_parity =
      !pacptr[current_lane]->low_word_parity;

  Write_word(address, contents);

  /* change parity back to original state */
  if(word == 0)
    pacptr[current_lane]->high_word_parity =
      !pacptr[current_lane]->high_word_parity;
  else
    pacptr[current_lane]->low_word_parity =
      !pacptr[current_lane]->low_word_parity;
  return(SUCCESS);
}


/*      int pac_remove_parity_error(pattern, word_no)
 *
 *      INPUT:  pattern = pattern number with parity error
 *              word_no = word number within pattern number
 *      OUTPUT: return code = SUCCESS or FAILURE
 *      DESCRIPTION: Removes a parity error in pattern memory
 *      at the location specified by the pattern number and the
 *      word number. The word number is encoded  as follows
 *                      0 = control word
 *                      1 = pattern bits 0-15
```

Copyright 1989
Logic Modeling Systems

SOURCE PROGRAM diags/pac_util.c

DATE 5/23/89 TIME 4:41:22 pm PAGE # 14/87

LINE # SOURCE TEXT

```
 *                      2 = pattern bits 16-31
 *                      3 = pattern bits 32-47
 *                      4 = pattern bits 48-63
 *                      5 = pattern bits 64-79
 */
int
pac_remove_parity_error(pattern, word_no)
int pattern;
int word_no;
{
  u_long bank;
  u_long word;
  u_long address;
  u_long contents;

  /* Check bounds on pattern */
  if((pattern < 0) || (pattern > (pac[current_lane].num_patterns - 1)))
  {
    (void)lm_error("Pattern number out of bounds.\n");
    return(FAILURE);
  }
  /* decode word number */
  switch(word_no)
  {
    case 0:
      bank = BANK_2;
      word = 2;
      break;
    case 1:
      bank = BANK_2;
      word = 0;
      break;
    case 2:
      bank = BANK_1;
      word = 2;
      break;
    case 3:
      bank = BANK_1;
      word = 0;
      break;
    case 4:
      bank = BANK_0;
      word = 2;
      break;
    case 5:
      bank = BANK_0;
      word = 0;
      break;
    default:
      (void)lm_error("Word number out of bounds.\n");
      return(FAILURE);
      break;
  }
  /* Compute address */
  address = pac[current_lane].lane_offset + bank + (4 * pattern) + word;

  contents = Read_word(address);
  Write_word(address, contents);
  Clear_pac_errors(current_lane);
  return(SUCCESS);
}


/*      int pac_get_pam_number(pattern_no)
 *
 *      INPUT:  pattern_no = pattern number
 *      OUTPUT: Returns board number containing pattern number
 *      DESCRIPTION: Determines which Pattern Memory board
 *      contains the specified pattern number. The function
 *      returns -1 if the pattern number is outside of pattern
 *      memory.
 */
int
pac_get_pam_number(pattern_no)
register int pattern_no;
{
  register int total_patterns;
  register int pam_no;
  register int total_pams = pac[current_lane].num_pams;

  if((pattern_no < 0) || (pattern_no > (pac[current_lane].num_patterns - 1)))
    return(-1);

  for(total_patterns = 0, pam_no = 0; pam_no < total_pams; ++pam_no)
  {
    total_patterns += pac[current_lane].pam_size[pam_no];
    if(pattern_no < total_patterns)
      return(pam_no);
  }
  return(-1);
}


/*      int pac_get_first_pattern_no(lane_no, pam_no)
 *
 *      INPUT:  lane_no = lane number
 *              pam_no = pattern memory board number
 *      OUTPUT: Returns first pattern number in specified pattern memory board
 *      DESCRII  ': Determines the first pattern number (zeros counting)
 *      in the specified Pattern Memory board.
 */
int
pac_get_first_pattern_no(lane_no, pam_no)
register int lane_no;
register int pam_no;
{
  register int first_pattern = 0;
  register int i;

  for(i = 0; i < pam_no; ++i)
    first_pattern += pac[lane_no].pam_size[i];
  return(first_pattern);
}

/*      int pac_replay()
 *
 *      INPUT:  none
 *      OUTPUT: return code = SUCCESS or FAILURE
 *      DESCRIPTION: Performs a pattern play from pattern
 *      number entered by user. Assumes play has just been
```

Copyright 1989
Logic Modeling Systems

| SOURCE PROGRAM | DATE | PAGE # |
|---|---|---|
| diags/pac_util.c | 5/23/89 | 15/88 |
| | TIME 4:41:22 pm | |

SOURCE TEXT

```
 *      performed to get default pattern number.
 */
int
pac_replay()
{
  int first_pattern;
  int last_block;
  int input_good;

  /* Find out where last pattern play left off */
  last_block = pacptr(current_lane)->branch_address;
  /* Look up first block number in link table  and compute pattern */
  first_pattern = (Read_long(pac[current_lane].lane_offset + LINK_OFFSET +
   (last_block << 2)) & 0x7fff) * BLOCK_SIZE;
  do
  {
    input_good = TRUE;
    diag_get_uhex((u_long *)&first_pattern, "first pattern number (hex)", 0l,
     (u_long)(pac[current_lane].num_patterns - BLOCK_SIZE));
    if((first_pattern % BLOCK_SIZE) != 0)
    {
      (void)lm_message("First pattern must be multiple of 256 (100 hex).\n");
      input_good = FALSE;
    }
  } while(input_good != TRUE);

  pac_set_first_block(Lane_code(current_lane), first_pattern / BLOCK_SIZE);
  if(diag_play() != SUCCESS)
  {
    (void)lm_error("Pattern play failed trying to play from pattern %X.\n",
     first_pattern);
    return(FAILURE);
  }
  return(SUCCESS);
}
```

Copyright 1989
Logic Modeling Systems

| SOURCE PROGRAM | DATE | TIME | PAGE # |
|---|---|---|---|
| diags/parity.c | 5/23/89 | 4:41:23 pm | 1/89 |

LINE # SOURCE TEXT

```
/* SCCS_ID: parity.c rev 3.1, 4/24/89 at 07:49:32     */

/*
** Parity error handler
**
*/
#include "common.h"
#include "cpu.h"
#include "mod_err.h"
#include "nvram.h"
#include "lm_rd_wr.h"
extern u_short lm_nvram_access();
extern void output_routine(), reset_cpu();
parity_error()
{
        register cpu_control_reg_struct *control_reg = (cpu_control_reg_struct *) CPU_CONTROL_REG;
        register cpu_par_err_reg *parity_reg = (cpu_par_err_reg *) CPU_PAR_ERR_REG, parity;
        u_long error;
        char buffer[ 100 ];

                parity = *parity_reg;
                if (control_reg->not_parity_intr == 0)
                {
                    sprintf(buffer, "Parity error addr = %08x\n",
                        parity_reg->error_addr * 4);
                        output_routine(buffer);
                    sprintf(buffer, "68020 %d VME %d LANCE %d\n",
                        parity_reg->not_68020_master,
                        parity_reg->not_VME_master,
                        parity_reg->not_LANCE_master);
                        output_routine(buffer);
                    sprintf(buffer, "hi %d um %d lm %d lo %d\n",
                        parity_reg->not_error_hi,
                        parity_reg->not_error_um,
                        parity_reg->not_error_lm,
                        parity_reg->not_error_lo);
                        output_routine(buffer);
                        (void)lm_nvram_access((char *) parity_reg, PARITY_ERR , SIZEOF_PARITY_ERR, MEMORY_WRITE,&error);
                        control_reg->parity_force= 0;
                        reset_cpu(PARITY_ERROR);
                }
}

u_long network_timeout;
```

Copyright 1989
Logic Modeling Systems

SOURCE PROGRAM diags/pat_bus.c | DATE 5/23/89 | TIME 4:41:23 pm | PAGE # 1/90

LINE # SOURCE TEXT

```
/* SCCS_ID: pat_bus.c rev 3.1, 4/24/89 at 07:49:36    */

/*********************************************************************
 *                                                                   *
 *      Pattern bus routines                                         *
 *      used in PAC/PEL diagnostics                                  *
 *                                                                   *
 *********************************************************************/

#include "common.h"
#include "vrtx.h"
#include "mod_def.h"
#include "modeler_extn.h"
#include "lm_diags.h"
#include "tmg.h"
#include "tmg_extn.h"
#include "tmg_def.h"
#include "pac.h"
#include "pac_def.h"
#include "pac_extn.h"
#include "magic.h"
#include "pel.h"


pel_disable_bp_error(lane, pel_no)
int lane;
int pel_no;
{
    short dummy;
    register PEL *pel = (PEL *)(pel_addr(lane, pel_no));

    dummy = pel->magic_chip[0].m.reset;        /* Clear MAGIC errors */
    pel->car.bit.resetL = 0;
#ifdef lint
    if (dummy); /* shut lint up */
#endif lint
}

int
pel_xor_pattern_bits(pattern_no, bad_bits)
int pattern_no;
u_short *bad_bits;
{
  register PEL *pel = (PEL *)(pel_addr(current_lane, current_pel));
  register u_short memory;
  register u_short chip;
  PAT_WORD pattern_word, *patptr = &pattern_word;
  int magic_chip;
  int returncode = SUCCESS;
  u_short diffs;

  /* Read the pattern in pattern memory */
  (void)pac_read_pattern(pattern_no, patptr);
  /* Compare pattern with the outputs of the MAGIC chips one at a time */
  for(magic_chip = 0; magic_chip < 5; ++magic_chip)
  {
    memory = patptr->pattern.data[4 - magic_chip];
    chip = pel->magic_chip[magic_chip].m.data_format;
    if((diffs = memory ^ chip) != 0)
    {
      (void)lm_error("Magic chip %d has bad bits. Expected %04X. Actual %04X.\n"
       , magic_chip, memory, chip);
      bad_bits[4 - magic_chip] |= diffs;
      returncode = FAILURE;
    }
  }
  return(returncode);
}

#define PLAY_ZEROS "z2z5z5z5z5z5z5z5z5z1z7"
#define PLAY_ZEROS_SIZE (sizeof(PLAY_ZEROS) / 2)
int
pattern_bits_test(pam_no)
register int pam_no;
{
  register int first_pattern = pac_get_first_pattern_no(current_lane, pam_no);
  register int end_pattern;
  u_short bad_bits[5];
  register int timeout;
  register int magic_chip;
  register int pattern_bit;
  register int returncode = SUCCESS;

  /* Initialize the current lane for pattern play */
  if(pel_lane_init() != SUCCESS)
  {
    (void)lm_error("Unable to initialize lane for pattern bits test.\n");
    return(FAILURE);
  }
  /* Build a pattern string which plays a zero pattern to the PEL */
  if(build_pattern_data(PLAY_ZEROS, first_pattern) != PLAY_ZEROS_SIZE)
  {
    (void)lm_error("Unable to build pattern data for pattern bits test.\n");
    return(FAILURE);
  }
  if(build_pattern_control(first_pattern, PLAY_ZEROS_SIZE, STOP_MODE)
   != SUCCESS)
  {
    (void)lm_error("Unable to build pattern control in pattern bits test.\n");
    return(FAILURE);
  }
  if((timeout = pac_pre_play()) == 0)
  {
    (void)lm_error("Unable to prepare for pattern bit test play.\n");
    return(FAILURE);
  }
  /* Clear error bits */
  for(magic_chip = 0; magic_chip < 5; ++magic_chip)
    bad_bits[magic_chip] = 0;

  end_pattern = first_pattern + PLAY_ZEROS_SIZE - 1;
  for(pattern_bit = 0; pattern_bit < 80; ++pattern_bit)
  {
    set_pattern_bit(end_pattern, pattern_bit, 1);
    /* Clear any MAGIC errors and make sure the PEL can't assert a PLAY error */
    /* on the backplane */
    pel_disable_bp_error(current_lane, current_pel);
    if(pac_play(timeout) != SUCCESS)
    {
      returncode = FAILURE;
```

Copyright 1989 Logic Modeling Systems

SOURCE PROGRAM diags/pat_bus.c | DATE 5/23/89 | TIME 4:41:23 pm | PAGE # 2/91

LINE # SOURCE TEXT

```
      if(lm_error("Play failed during pattern bit test.\n") != SUCCESS)
        return(FAILURE);
    }
    if(pel_xor_pattern_bits(end_pattern, bad_bits)
      != SUCCESS)
    {
      returncode = FAILURE;
      if(lm_error("Pattern bits did not match.\n") != SUCCESS)
        return(FAILURE);
    }
    set_pattern_bit(end_pattern, pattern_bit, 0);
  }
  if(returncode == FAILURE)
  {
    /* Print out all bad bits */
    (void)lm_message("Bad pattern bits: ");
    for(magic_chip = 0; magic_chip < 5; ++magic_chip)
      (void)lm_message("%04X", bad_bits[magic_chip]);
    (void)lm_message(".\n");
  }
  return(returncode);
}


int
pel_check_for_parity_errors()
{
  register PEL *pel = (PEL *)(pel_addr(current_lane, current_pel));
  register int chip;
  register int returncode = SUCCESS;

  for(chip =0; chip < 5; ++chip)
  {
    if(pel->magic_chip[chip].m.parity_out != 0)
    {
      returncode = FAILURE;
      if(lm_error("Magic chip %d detected a parity error.\n", chip) != SUCCESS)
        return(FAILURE);
    }
  }
  return(returncode);
}


#define PEL_0_CTL_0 ~0x7f1
int
pattern_bus_test(first_pattern, num_patterns)
int first_pattern;
int num_patterns;
{
  register long *memptr;
  register int load_patterns = num_patterns - 1;
  register int pel_no = current_pel;
  int returncode = SUCCESS;

  /* Initialize the current lane for pattern play */
  if(pel_lane_init() != SUCCESS)
  {
    (void)lm_error("Unable to initialize lane for pattern bus test.\n");
    return(FAILURE);
  }
  /* Clear any MAGIC errors and make sure the PEL can't assert a PLAY error */
  /* on the backplane */
  pel_disable_bp_error(current_lane, current_pel);
  /* Fill pattern memory with random data */
  if(pac_fill_random(first_pattern, num_patterns, PEL_0_CTL_0, SEED) != SUCCESS)
  {
    (void)("Unable to fill memory with random data in pattern bus test.\n");
    return(FAILURE);
  }
  /* Now OR in the current PEL and the PEL control bits 010 in the first */
  /* location and 100 in the rest */
  memptr = (long *)Pattern_to_address(current_lane, 2, first_pattern);
  *memptr++ |= pel_no | (0x2 << 4);
  do
  {
    *memptr++ |= pel_no | (0x4 << 4);
  }
  while(--load_patterns);
  if(build_pattern_control(first_pattern, num_patterns, STOP_MODE) != SUCCESS)
  {
    (void)lm_error("Unable to build pattern control in pattern bus test.\n");
    return(FAILURE);
  }
  if(diag_play() != SUCCESS)
  {
    (void)lm_error("Pattern play failed during pattern bus test.\n");
    return(FAILURE);
  }

  /* Make sure there weren't any lane errors */
  if(pac_check_errors(current_lane, lm_error) != SUCCESS)
  {
    Clear_pac_errors(current_lane);
    (void)lm_error("Pattern play caused a Pattern Controller error.\n");
    returncode = FAILURE;
  }
  if(pel_check_for_parity_errors() != SUCCESS)
  {
    pel_disable_bp_error(current_lane, current_pel);
    (void)lm_error("Pattern play caused a Pin Electronics error.\n");
    returncode = FAILURE;
  }
  return(returncode);
}


int
pel_pattern_bus_test()
{
  if(diag_clear_errors() != SUCCESS)
    return(FAILURE);

  return(pattern_bus_test(0, PATTERNS_IN_128K));
}


int
pel_pattern_bits_test()
{
```

Copyright 1989
Logic Modeling Systems

| SOURCE PROGRAM | DATE | PAGE # |
|---|---|---|
| diags/pat_bus.c | 5/23/89<br>TIME 4:41:23 pm | 3/92 |

LINE # SOURCE TEXT

```
  if(diag_clear_errors() != SUCCESS)
    return(FAILURE);

  return(pattern_bits_test(0));
}


int
pel_check_parity(pattern, error_chip)
int pattern;
int error_chip;
{
  register PEL *pel = (PEL *)(pel_addr(current_lane, current_pel));
  PAT_WORD pattern_word, *patptr = &pattern_word;
  long diffs;
  long memory;
  long sum_bits;
  long parity;
  int chip;
  int i;
  int returncode = SUCCESS;

  /* Read the pattern with the parity error */
  (void)pac_read_pattern(pattern, patptr);

  /* Verify that only the proper magic chip detected a parity error */
  /* and that the data compares in each chip */
  for(chip = 0; chip < 5; ++chip)
  {
    if(chip == error_chip)      /* Should have detected error */
    {
      if(pel->magic_chip[chip].m.parity_out != 1)
      {
        returncode = FAILURE;
        if(lm_error("Magic chip %d did not detect error.\n", chip) != SUCCESS)
          return(FAILURE);
      }
    }
    else                        /* Should not have detected error */
    {
      if(pel->magic_chip[chip].m.parity_out != 0)
      {
        returncode = FAILURE;
        if(lm_error("Magic chip %d detected error.\n", chip) != SUCCESS)
          return(FAILURE);
      }
    }
    /* Read the word stored in memory and compute odd parity */
    memory = patptr->pattern.data[4 - chip];
    for(sum_bits = 0, i = 0; i < 16; ++i)
      sum_bits += (memory >> i) & 1;
    parity = sum_bits & 1;

    if(pel->magic_chip[chip].m.parity_in != ((chip == error_chip) ?
     ( parity) & 1 : parity))
    {
      returncode = FAILURE;
      if(lm_error("Magic chip %d latched incorrect parity sense.\n", chip)
       != SUCCESS)
        return(FAILURE);
    }
    if((diffs = pel->magic_chip[chip].m.error_data ^ memory) != 0)
    {
      returncode = FAILURE;
      if(lm_error("Magic chip %d latched the following bad bits: %04X.\n",
       chip, diffs) != SUCCESS)
        return(FAILURE);
    }
  }
  return(returncode);
}


#define PEL_ERROR_DELAY 6

/*      int pel_parity_error_test()
 *
 *      INPUT:  none
 *      OUTPUT: return code = SUCCESS or FAILURE
 *      DESCRIPTION:
 */
int
pel_parity_error_test()
{
  register int pel_no = current_pel;
  register long *memptr;
  int pattern;
  int timeout;
  int branch_address[3];
  int block_offset[3];
  int actual_branch;
  int actual_block;
  int magic_chip;
  int i;
  int returncode = SUCCESS;

  if(diag_clear_errors() != SUCCESS)
    return(FAILURE);

  /* Initialize the current lane for pattern play */
  if(pel_lane_init() != SUCCESS)
  {
    (void)lm_error("Unable to initialize lane for pattern bits test.\n");
    return(FAILURE);
  }

  if(dab_type == NO_DAB)        /* Make sure we don't get a play error */
    pel_disable_bp_error(current_lane, current_pel);
  else
    pel_dab_init(PUBLIC_DAB);

  /* Fill a block of pattern memory with random data, starting with block 1 */
  if(pac_fill_random(BLOCK_SIZE, BLOCK_SIZE, PEL_0_CTL_0, SEED) != SUCCESS)
  {
    (void)lm_error("Could not fill block number one with random data.\n");
    return(FAILURE);
  }
  /* Now OR in the current PEL and the PEL control bits  010 in the first */
  /* location and 100 in the rest */
  memptr = (long *)Pattern_to_address(current_lane, 2. BLOCK_SIZE);
```

Copyright 1989
Logic Modeling Systems

| SOURCE PROGRAM | DATE | PAGE # |
|---|---|---|
| diags/pat_bus.c | 5/23/89 | 4/93 |
| | TIME 4:41:23 pm | |

SOURCE TEXT

```
    *memptr++ |= pel_no | (0x2 << 4);
    pattern = BLOCK_SIZE - 1;
    do
    {
      *memptr++ |= pel_no | (0x4 << 4);
    }
    while(--pattern);
    if(build_pattern_control(BLOCK_SIZE, BLOCK_SIZE, STOP_MODE) != SUCCESS)
    {
      (void)lm_error("Could not build pattern control in block number one.\n");
      return(FAILURE);
    }
    /* Prepare for pattern play and compute a conservative timeout */
    if((timeout = pac_pre_play()) == 0)
    {
      (void)lm_error("Pattern play preparation failed.\n");
      return(FAILURE);
    }
    for(pattern = BLOCK_SIZE + 1; pattern < ((2 * BLOCK_SIZE) - 1); ++pattern)
    {
      if(dab_type != NO_DAB)
      {
        for(i = 0; i < 3; ++i)
        {
          if(pac_predict_offsets(pattern, PEL_ERROR_DELAY + i, &branch_address[i],
           &block_offset[i]) != SUCCESS)
          {
            (void)lm_error("Unable to predict parity error offsets for pattern \
number %d, error delay = %d.\n", pattern, PEL_ERROR_DELAY + i);
            return(FAILURE);
          }
        }
      }
      for(magic_chip = 0; magic_chip < 5; ++magic_chip)
      {
        if(pac_insert_parity_error(pattern, magic_chip + 1) != SUCCESS)
        {
          (void)lm_error("Could not insert parity error for magic chip %d.\n",
           magic_chip);
          return(FAILURE);
        }
        pacptr[current_lane]->branch_address = 1;
        if(pac_play(timeout) != SUCCESS)
        {
          (void)lm_error("Pattern play failed.\n");
          return(FAILURE);
        }
        /* If there's a DAB, see if pattern play generated a backplane error */
        if((dab_type != NO_DAB) && ((Get_bp_error() & Lane_code(current_lane))
         == 0))
        {
          (void)lm_error("Pattern play did not generate error (should have).\n");
          return(FAILURE);
        }
        if(pel_check_parity(pattern, magic_chip) != SUCCESS)
        {
          returncode = FAILURE;
          if(lm_error("Magic chip parity error verification failed.\n")
           != SUCCESS)
            return(FAILURE);
        }
        /* Check PAC offsets if there is a DAB */
        if(dab_type != NO_DAB)
        {
          actual_branch = pacptr[current_lane]->branch_address;
          if((actual_branch != branch_address[0]) &&
           (actual_branch != branch_address[1]) &&
           (actual_branch != branch_address[2]))
          {
            returncode = FAILURE;
            if(lm_error("Branch address for pattern %d is incorrect.\n\
\tExpected %d, %d or %d. Actual %d.\n", pattern, branch_address[0],
             branch_address[1], branch_address[2], actual_branch) != SUCCESS)
              return(FAILURE);
          }
          actual_block = pacptr[current_lane]->block_offset;
          if((actual_block != block_offset[0]) &&
           (actual_block != block_offset[1]) &&
           (actual_block != block_offset[2]))
          {
            returncode = FAILURE;
            if(lm_error("Block offset for pattern %d is incorrect.\n\
\tExpected %d, %d or %d. Actual %d.\n", pattern, block_offset[0],
             block_offset[1], block_offset[2], actual_block) != SUCCESS)
              return(FAILURE);
          }
        }
        if(pac_remove_parity_error(pattern, magic_chip + 1) != SUCCESS)
        {
          (void)lm_error("Could not remove parity error for magic chip %d.\n",
           magic_chip);
          return(FAILURE);
        }
        /* Get rid of any PEL errors */
        if(dab_type == NO_DAB)
          pel_disable_bp_error(current_lane, current_pel);
        else
          pel_clear_pel_errors();
      }
    }
  return(returncode);
}
```

Copyright 1989
Logic Modeling Systems

SOURCE PROGRAM diags/pel.c | DATE 5/23/89 | TIME 4:41:24 pm | PAGE # 1/94

LINE # SOURCE TEXT

```
/* SCCS_ID: pel.c rev 3.1, 4/24/89 at 07:49:40      */

/*********************************************************************
 *      pel_menu.c                                                   *
 *                                                                   *
 *      Main Menu                                                    *
 *      used in PEL diagnostics                                      *
 *                                                                   *
 *********************************************************************/
#include <math.h>
#include "common.h"
#include "lm_diags.h"
#include "vrtx.h"
#include "tmg.h"
#include "mod_def.h"
#include "modeler_extn.h"
#include "magic.h"
#include "pel.h"
#include "id.h"
#include "eeprom.h"

int current_pel = 0;
int  dab_type = NO_DAB;

#define PEL_TEST_INDEX  0
#define PEL_DIAG_DAB_TEST_INDEX 1

pel_menu(parent_menu, info)
LM_DIAG_MENU *parent_menu;
char *info;
{
        char buffer[132];
        static char test_buffer[132];
        static char diag_dab_test_buffer[132];
        register char *buf;

        int pel_test_menu();
        int pel_diag_dab_test_menu();
        int pel_test_utilities();
        int pel_play_utilities();
        int pel_pattern_utilities();
        extern int lm_acceptance;

        static LM_DIAG_MENU_ITEM menu_list[] =
        {
                {
                        "1",
                        test_buffer,
                        pel_test_menu,
                        LM_DIAG_another_menu,
                        LM_DIAG_null,
                        0
                },
                {
                        "2",
                        diag_dab_test_buffer,
                        pel_diag_dab_test_menu,
                        0,
                        LM_DIAG_null,
                        0
                },
                {
                        "3",
                        "PEL Test Utilities",
                        pel_test_utilities,
                        LM_DIAG_utility_menu,
                        LM_DIAG_null,
                        0
                },
                {
                        "4",
                        "PEL Pattern Utilities",
                        pel_pattern_utilities,
                        LM_DIAG_utility_menu,
                        LM_DIAG_null,
                        0
                },
                {
                        "5",
                        "PEL Play Utilities",
                        pel_play_utilities,
                        LM_DIAG_utility_menu,
                        LM_DIAG_null,
                        0
                },
        };

        static LM_DIAG_MENU menu =
        {
                0,
                sizeof(menu_list) / sizeof(LM_DIAG_MENU_ITEM),
                0,
                menu_list
        };

        /***************************************************************/

        current_pel = (long)(*info - '0');
        if (Host) {
                dab_type = DIAG_DAB;
        } else {
                dab_type = what_dab(current_lane, current_pel);
        }

        if (lm_acceptance && (dab_type != DIAG_DAB))
                return SUCCESS;

        menu_list[PEL_DIAG_DAB_TEST_INDEX].attributes
                = LM_DIAG_another_menu | LM_DIAG_disable;
        switch (dab_type) {
                case NO_DAB:
                        buf = "NO";
                        break;
                case DIAG_DAB:
                        buf = "DIAGNOSTIC";
                        menu_list[PEL_TEST_INDEX].attributes
                                |= LM_DIAG_acceptance;
                        menu_list[PEL_DIAG_DAB_TEST_INDEX].attributes
                                |= LM_DIAG_acceptance;
                        /* turn off the disable bit only if there is a PAC
```

Copyright 1989
Logic Modeling Systems

SOURCE PROGRAM diags/pel.c | DATE 5/23/89 | TIME 4:41:24 pm | PAGE # 2/95

LINE # SOURCE TEXT

```
                        in the lane */
                    if(probe_pac(current_lane) == SUCCESS)
                    {
                      menu_list[PEL_DIAG_DAB_TEST_INDEX].attributes
                            &= ~LM_DIAG_disable;
                    }
                    break;
                case UNKNOWN_DAB:
                default:
                    buf = "NON-DIAGNOSTIC";
                    break;
        }

        sprintf(buffer, "%s (%s DAB)", parent_menu->
                menu_items[parent_menu->current_selection].menu_text, buf);
        menu.title = buffer;

        sprintf(test_buffer, "Lane %c PEL %d Test Menu (%s DAB)",
                current_lane + 'A', current_pel, buf);

        sprintf(diag_dab_test_buffer,
                "Lane %c PEL %d Diagnostic Adapter Test Menu (%s DAB)",
                current_lane + 'A', current_pel, buf);

        return lm_display_menu(&menu);
}

pel_test_menu(parent_menu)
LM_DIAG_MENU *parent_menu;
{
        register long i;
        register int pac_present;
        register LM_DIAG_MENU_ITEM *m;

        int pel_idprom_checksum();
        int pel_wr_car();
        int pel_wr_magic_ctl();
        int pel_dac_adc();
        int pel_pattern_control();
        int pel_pattern_bits_test();
        int pel_pattern_bus_test();
        int pel_parity_error_test();
        int pel_edge();

        static LM_DIAG_MENU_ITEM menu_list[] =
        {
                {
                        "1",
                        "Pin Electronics ID Prom Test",
                        pel_idprom_checksum,
                        LM_DIAG_diag_routine|LM_DIAG_acceptance,
                        LM_DIAG_null,
                        (char *)(DIAG_DAB|NO_DAB|UNKNOWN_DAB)
                },
                {
                        "2",
                        "Control/Status Register Test",
                        pel_wr_car,
                        LM_DIAG_diag_routine|LM_DIAG_acceptance,
                        LM_DIAG_null,
                        (char *)(DIAG_DAB|NO_DAB|UNKNOWN_DAB)
                },
                {
                        "3",
                        "DACs and ADCs Test",
                        pel_dac_adc,
                        LM_DIAG_diag_routine|LM_DIAG_acceptance,
                        LM_DIAG_null,
                        (char *)(DIAG_DAB|NO_DAB|UNKNOWN_DAB)
                },
                {
                        "4",
                        "MAGIC Chip Control Register Test",
                        pel_wr_magic_ctl,
                        LM_DIAG_diag_routine|LM_DIAG_acceptance,
                        LM_DIAG_null,
                        (char *)(DIAG_DAB|NO_DAB|UNKNOWN_DAB|NEED_PAC)
                },
                {
                        "5",
                        "Pattern Control Test",
                        pel_pattern_control,
                        LM_DIAG_diag_routine|LM_DIAG_acceptance,
                        LM_DIAG_null,
                        (char *)(DIAG_DAB|NO_DAB|UNKNOWN_DAB|NEED_PAC)
                },
                {
                        "6",
                        "Pattern Bit Test",
                        pel_pattern_bits_test,
                        LM_DIAG_diag_routine|LM_DIAG_acceptance,
                        LM_DIAG_null,
                        (char *)(DIAG_DAB|NO_DAB|UNKNOWN_DAB|NEED_PAC)
                },
                {
                        "7",
                        "Pattern Bus Test",
                        pel_pattern_bus_test,
                        LM_DIAG_diag_routine|LM_DIAG_acceptance,
                        LM_DIAG_null,
                        (char *)(DIAG_DAB|NO_DAB|UNKNOWN_DAB|NEED_PAC)
                },
                {
                        "8",
                        "Parity Error Detection Test",
                        pel_parity_error_test,
                        LM_DIAG_diag_routine|LM_DIAG_acceptance,
                        LM_DIAG_null,
                        (char *)(DIAG_DAB|NO_DAB|UNKNOWN_DAB|NEED_PAC)
                },
                {
                        "9",
                        "Timing Edge Test",
                        pel_edge,
                        LM_DIAG_diag_routine|LM_DIAG_acceptance,
                        LM_DIAG_null,
                        (char *)(DIAG_DAB|NO_DAB|UNKNOWN_DAB|NEED_PAC)
                },
        };
```

Copyright 1989
Logic Modeling Systems

LINE # SOURCE TEXT

```
	static LM_DIAG_MENU menu =
	{
		0,
		sizeof(menu_list) / sizeof(LM_DIAG_MENU_ITEM),
		0,
		menu_list
	};

	/**************************************************************/

	if (Host) {
		dab_type = DIAG_DAB;
	} else {
		dab_type = what_dab(current_lane, current_pel);
		pac_present = probe_pac(current_lane);
		for (m = menu_list, i = 0; i < menu.number_of_items; ++i, ++m) {
			if ((long)(m->user_data) & dab_type) {
				m->attributes &= ~LM_DIAG_disable;
			} else {
				m->attributes |= LM_DIAG_disable;
			}
			if ((((long)(m->user_data) & NEED_PAC) != 0) &&
			   (pac_present != SUCCESS))
				m->attributes |= LM_DIAG_disable;
		}
	}

	menu.title = parent_menu->
		menu_items[parent_menu->current_selection].menu_text;
	return lm_display_menu(&menu);
}

pel_diag_dab_test_menu(parent_menu)
LM_DIAG_MENU *parent_menu;
{
	register long i;
	register LM_DIAG_MENU_ITEM *m;

	int pel_opens_and_shorts();
	int pel_crc();
	int pel_feedback_test();
	int pel_short_sensor_test();
	int pel_error_test();
	int pel_keepalive_test();
	int pel_driver_test();
	int pel_comparator_test();

	static LM_DIAG_MENU_ITEM menu_list[] =
	{
		{
			"1",
			"Diagnostic Adapter Opens/Shorts Test",
			pel_opens_and_shorts,
			LM_DIAG_diag_routine|LM_DIAG_acceptance,
			LM_DIAG_null,
			(char *)(DIAG_DAB)
		},
		{
			"2",
			"Diagnostic Adapter CRC Test",
			pel_crc,
			LM_DIAG_diag_routine|LM_DIAG_acceptance,
			LM_DIAG_null,
			(char *)(DIAG_DAB)
		},
		{
			"3",
			"Diagnostic Adapter Feedback Test",
			pel_feedback_test,
			LM_DIAG_diag_routine|LM_DIAG_acceptance,
			LM_DIAG_null,
			(char *)(DIAG_DAB)
		},
		{
			"4",
			"Diagnostic Adapter Short Sensor Test",
			pel_short_sensor_test,
			LM_DIAG_diag_routine|LM_DIAG_acceptance,
			LM_DIAG_null,
			(char *)(DIAG_DAB)
		},
		{
			"5",
			"Diagnostic Adapter Error Handling Test",
			pel_error_test,
			LM_DIAG_diag_routine|LM_DIAG_acceptance,
			LM_DIAG_null,
			(char *)(DIAG_DAB)
		},
		{
			"6",
			"Diagnostic Adapter Keepalive/Trigger Bit Test",
			pel_keepalive_test,
			LM_DIAG_diag_routine|LM_DIAG_acceptance,
			LM_DIAG_null,
			(char *)(DIAG_DAB)
		},
		{
			"7",
			"Diagnostic Adapter LM-1000 Driver Test",
			pel_driver_test,
			LM_DIAG_diag_routine|LM_DIAG_acceptance,
			LM_DIAG_null,
			(char *)(DIAG_DAB)
		},
		{
			"8",
			"Diagnostic Adapter LM-1000 Receiver Test",
			pel_comparator_test,
			LM_DIAG_diag_routine|LM_DIAG_acceptance,
			LM_DIAG_null,
			(char *)(DIAG_DAB)
		},
/*
 * A D D   T H E S E   T E S T S
 *
 *  1. Address decoding (CPU access and pattern play)
 *  2. Measure currents on drivers (soft/medium/hard)
 *  3. timing measurement
 *  4. complete comparator test (LM-100 receiver test)
```

Copyright 1989
Logic Modeling Systems

SOURCE PROGRAM diags/pel.c | DATE 5/23/89 | TIME 4:41:24 pm | PAGE # 4/97

LINE # SOURCE TEXT

```
 */
		};

		static LM_DIAG_MENU menu =
		{
			0,
			sizeof(menu_list) / sizeof(LM_DIAG_MENU_ITEM),
			0,
			menu_list
		};

		/*****************************************************************/

		if (Host) {
			dab_type = DIAG_DAB;
		} else {
			dab_type = what_dab(current_lane, current_pel);
			for (m = menu_list, i = 0; i < menu.number_of_items; ++i, ++m) {
				if ((long)(m->user_data) & dab_type) {
					m->attributes &= ~LM_DIAG_disable;
				} else {
					m->attributes |= LM_DIAG_disable;
				}
			}
		}

		menu.title = parent_menu->
			menu_items[parent_menu->current_selection].menu_text;
		return lm_display_menu(&menu);
}

pel_test_utilities(parent_menu)
LM_DIAG_MENU *parent_menu;
{
		int pel_type_pattern_string();
		int display_magic_control();
		int pel_set_pel_csr();
		int show_all_adc();
		int loop_adc_read();
		int loop_dac_toggle();
		int display_pattern_memory();
		int display_pattern_preamble();
		int display_pattern_preamble_verbosely();
		int print_magic_state();
		int display_pel_errors();

		static LM_DIAG_MENU_ITEM menu_list[] =
		{
			{
				"1",
				"Display and set pel control register",
				pel_set_pel_csr,
				LM_DIAG_utility,
				LM_DIAG_null,
				0
			},
			{
				"2",
				"Display MAGIC control register",
				display_magic_control,
				LM_DIAG_utility,
				LM_DIAG_null,
				0
			},
			{
				"3",
				"Display MAGIC status register",
				print_magic_state,
				LM_DIAG_utility,
				LM_DIAG_null,
				0
			},
			{
				"4",
				"Display PEL errors",
				display_pel_errors,
				LM_DIAG_utility,
				LM_DIAG_null,
				0
			},
			{
				"5",
				"Show all ADC values",
				show_all_adc,
				LM_DIAG_utility,
				LM_DIAG_null,
				0
			},
			{
				"6",
				"Read ADC indefinitely",
				loop_adc_read,
				LM_DIAG_utility,
				LM_DIAG_null,
				0
			},
			{
				"7",
				"Toggle DAC outputs indefinitely",
				loop_dac_toggle,
				LM_DIAG_utility,
				LM_DIAG_null,
				0
			},
		};

		static LM_DIAG_MENU menu =
		{
			"PEL UTILITIES",
			sizeof(menu_list) / sizeof(LM_DIAG_MENU_ITEM),
			0,
			menu_list
		};
		menu.title = parent_menu->
			menu_items[parent_menu->current_selection].menu_text;
		return lm_display_menu(&menu);
}

pel_check_csr(csr, value)
register unsigned short *csr;
```

Copyright 1989
Logic Modeling Systems

SOURCE PROGRAM diags/pel.c | DATE 5/23/89 | TIME 4:41:24 pm | PAGE # 5/98

LINE # SOURCE TEXT

```
u_short value;
{
        *car = value;
        if ((*car & 0xff) != value) {
                lm_message("Wrote %02x, Read %02x\n", value, (*car & 0xff));
                return (-1);
        } else {
                return (0);
        }
}

pel_set_pel_car()
{
        long answer;
        register PEL *pel = (PEL *)(pel_addr(current_lane, current_pel));

        lm_message("Pel car = %04x\n\n", pel->car.reg);
        lm_message("      magic_errorL (%d)\n",  pel->car.bit.magic_errorL);
        lm_message("      play_errorL (%d)\n",  pel->car.bit.play_errorL);
        lm_message("      errorL (%d)\n",  pel->car.bit.errorL);
        lm_message("      present (%d)\n",  pel->car.bit.present);
        lm_message("      active (%d)\n",  pel->car.bit.active);
        lm_message("      eeprom_out (%d)\n",  pel->car.bit.eeprom_out);

        answer = pel->car.bit.eeprom_sel;
        diag_get_long(&answer, "eeprom_sel", 01, 11);
        pel->car.bit.eeprom_sel = answer;

        answer = pel->car.bit.eeprom_clk;
        diag_get_long(&answer, "eeprom_clk", 01, 11);
        pel->car.bit.eeprom_clk = answer;

        answer = pel->car.bit.eeprom_in;
        diag_get_long(&answer, "eeprom_in", 01, 11);
        pel->car.bit.eeprom_in = answer;

        answer = pel->car.bit.initialize;
        diag_get_long(&answer, "initialize", 01, 11);
        pel->car.bit.initialize = answer;

        answer = pel->car.bit.magic_error_enableL;
        diag_get_long(&answer, "magic_error_enableL", 01, 11);
        pel->car.bit.magic_error_enableL = answer;

        answer = pel->car.bit.private;
        diag_get_long(&answer, "private", 01, 11);
        pel->car.bit.private = answer;

        answer = pel->car.bit.resetL;
        diag_get_long(&answer, "resetL", 01, 11);
        pel->car.bit.resetL = answer;

        answer = pel->car.bit.in_use_led;
        diag_get_long(&answer, "in_use_led", 01, 11);
        pel->car.bit.in_use_led = answer;
}

pel_wr_car()
{
        register PEL *pel
                = (PEL *)(pel_addr(current_lane, current_pel));
        register unsigned short *car = &(pel->car.reg);

        register long errors = 0;

        if (!Host) {
                errors += pel_check_car(car, 0x00);
                errors += pel_check_car(car, 0x01);
                errors += pel_check_car(car, 0x02);
                errors += pel_check_car(car, 0x04);
                errors += pel_check_car(car, 0x08);
                errors += pel_check_car(car, 0x10);
                errors += pel_check_car(car, 0x20);
                errors += pel_check_car(car, 0x40);
                errors += pel_check_car(car, 0x80);
                errors += pel_check_car(car, 0x00);
        } else {
                lm_message("Can't run this test on the host\n");
        }

        lm_message("\nlane %c / pel %d / address %x / ", current_lane + 'A', current_pel, car);
        lm_message("PEL size %x\n", sizeof(PEL));
        pel_display_car(pel);

        if (errors) {
                return(FAILURE);
        } else {
                return(SUCCESS);
        }
}

pel_display_car(pel)
register PEL *pel;
{
        lm_message("PEL CSR[%04X]:\n", pel->car.reg);
        lm_message("MAGICERROR*  = %d\n", pel->car.bit.magic_errorL);
        lm_message("PLAYERROR*   = %d\n", pel->car.bit.play_errorL);
        lm_message("ERROR*       = %d\n", pel->car.bit.errorL);
        lm_message("PRESENT      = %d\n", pel->car.bit.present);
        lm_message("ACTIVE       = %d\n", pel->car.bit.active);
        lm_message("EEOUT        = %d\n", pel->car.bit.eeprom_out);
        lm_message("EESEL        = %d\n", pel->car.bit.eeprom_sel);
        lm_message("EECLK        = %d\n", pel->car.bit.eeprom_clk);
        lm_message("EEIN         = %d\n", pel->car.bit.eeprom_in);
        lm_message("INITIALIZE   = %d\n", pel->car.bit.initialize);
        lm_message("MAGIC ERREN* = %d\n", pel->car.bit.magic_error_enableL);
        lm_message("PRIVATE      = %d\n", pel->car.bit.private);
        lm_message("RESET*       = %d\n", pel->car.bit.resetL);
        lm_message("INUSE LED    = %d\n", pel->car.bit.in_use_led);
}

pel_idprom_checksum()
{
    register PEL *pel
        = (PEL *)(pel_addr(current_lane, current_pel));
    ID_PROM_PEL id;

    if (Host) {
        lm_message("Can't read pel id prom on host\n");
        return FAILURE;
```

Copyright 1989 Logic Modeling Systems

SOURCE PROGRAM diags/pel.c

DATE 5/23/89 TIME 4:41:24 pm PAGE # 6/99

LINE # SOURCE TEXT

```
    }


    pel_id_load(pel, &id);
    lm_message("\nPEL base address = %08x\n\n", pel);
    lm_message("Board type      = %02d\n", id.generic.board_type);
    lm_message("Revision        = %c\n", id.generic.revision);
    lm_message("ECO level       = %d\n", id.generic.eco_level);
    lm_message("Speed           = %dMhz\n", id.speed);
    lm_message("Pattern width   = %d\n", id.width * ID_GEN_WIDTH_K);
    lm_message("Pattern memory = %dK\n", id.patterns);
    lm_message("MAGIC fab date = %02d%02d\n", id.magic_build.year, id.magic_build.week);
    lm_message("Checksum        = %02x\n", id.checksum);

    if (id.generic.board_type != ID_BT_TTLPEL) {
        (void)pel_error("ID Prom is not TTLPEL\n");
        return(FAILURE);
    }

    if (!pel_id_check(pel)) {
        return SUCCESS;
    } else {
        return FAILURE;
    }
}

what_dab(lane, pel_no)
int lane;
int pel_no;
{
    register PEL *pel = (PEL *)(pel_addr(lane, pel_no));
    DAB_EEPROM dab;

    if (Host) {
        lm_message("Can't probe on host\n");
        return UNKNOWN_DAB;
    }

    pel->car.reg = 0;    /* make sure EEIN=0 (for Diagnostic DAB)          */

    if (!pel->car.bit.present) {
        dab_type = NO_DAB;
        return(NO_DAB);
    } else {
        if ((lm_read_eeprom(pel_no + (lane << 3), &dab)
          == SUCCESS) && !strcmp(dab.device_name, "DIAGNOSTIC_ADAPTER")) {
            dab_type = DIAG_DAB;
            return(DIAG_DAB);
        } else {
            dab_type = UNKNOWN_DAB;
            return(UNKNOWN_DAB);
        }
    }
}



loop_adc_read()
{
    register PEL *pel
        = (PEL *)(pel_addr(current_lane, current_pel));
    int dummy;

    flush_key_buf();

    lm_message("Hit key to stop...");

    while (!lm_check_key()) {
        dummy = pel->vlth_adc;
        lm_delay(1);
        dummy = pel->vhth_adc;
        lm_delay(1);
    }
    return dummy; /* shut lint up */
}

loop_dac_toggle()
{
    register PEL *pel
        = (PEL *)(pel_addr(current_lane, current_pel));

    flush_key_buf();

    lm_message("Hit key to stop...");

    while (!lm_check_key()) {
        pel->vlogl_dac = 0;
        pel->vlogh_dac = 0;
        pel->vlth_dac  = 0;
        pel->val_dac   = 0;
        pel->vhth_dac  = 0;
        pel->vah_dac   = 0;
        lm_delay(1);

        pel->vlogl_dac = 0xff;
        pel->vlogh_dac = 0xff;
        pel->vlth_dac  = 0xff;
        pel->val_dac   = 0xff;
        pel->vhth_dac  = 0xff;
        pel->vah_dac   = 0xff;
        lm_delay(1);
    }
}

display_eeprom_info()
{
    DAB_EEPROM dab;
    char configbuf[256];

    if (lm_read_eeprom(current_pel + (current_lane << 3), &dab) != SUCCESS) {
        (void)pel_error("Cannot read DAB EEPROM\n");
        return(FAILURE);
    }

    construct_cnf_str(configbuf, dab.configuration);

    lm_message("  Device Adapter in Lane %c Slot %d:\n",
        current_lane + 'A', current_pel);
    lm_message("     signature:        %-20.4s |", dab.signature);
    lm_message("  insertion count: %u\n", dab.insertion_count);
```

Copyright 1989 Logic Modeling Systems

SOURCE PROGRAM diags/pel.c | DATE 5/23/89 | TIME 4:41:24 pm | PAGE # 7/100

SOURCE TEXT

```
    lm_message("    device_name:    %-20.20s |", dab.device_name);
    lm_message("  segment number:  %u\n", dab.segment_number);
    lm_message("    manufacturer:    %-20.16s |", dab.dab_manufacturer);
    lm_message("  version number:  %x\n", dab.version_number);
    lm_message("    model revision:  %-20.4s |", dab.model_revision);
    lm_message("  dab revision:    %.4s\n", dab.dab_revision);
    lm_message("    type:            %-20.8s |", dab.dab_type);
    lm_message("  write count:     %u\n", dab.write_count);
    lm_message("    location:        %-20.20s |", configbuf);
    lm_message("  checksum:        %04X\n", dab.checksum);

    return(SUCCESS);
}

construct_cnf_str(s, config)
register char *s;
register u_long config;
{
        int pel, lane, bit, not_first = 0;

        bit = 0;
        for (lane = 0; lane < 3; ++lane) {
                for (pel = 0; pel < 8; ++pel) {
                        if (config & (1 << bit++)) {
                                if (not_first++) {
                                        *s++ = ',';
                                }
                                *s++ = 'A' + lane + current_lane;
                                *s++ = '0' + pel + current_pel;
                        }
                }
        }
        *s = '\0';
}

pel_dab_eeprom()
{
    DAB_EEPROM dab;

    if (lm_read_eeprom(current_pel + (current_lane << 3), &dab) != SUCCESS) {
        return(FAILURE);
    } else {
        display_eeprom_info();
        return(SUCCESS);
    }
}

/******************************************************************
 *                                                                *
 *      DIAGNOSTIC DAB DUT opens/shorts test:                     *
 *                                                                *
 ******************************************************************/

pel_opens_and_shorts()
{
    u_short pattern[5];

    if (set_vlogl(0.8) == FAILURE) return(FAILURE);
    if (set_vlogh(2.0) == FAILURE) return(FAILURE);
    if (set_vlth(0.3) == FAILURE) return(FAILURE);
    if (set_vsl(0.4) == FAILURE) return(FAILURE);
    if (set_vsh(4.0) == FAILURE) return(FAILURE);
    if (set_vhth(4.4) == FAILURE) return(FAILURE);

    if(diag_clear_errors() != SUCCESS)
      return(FAILURE);

    if (pel_lane_init() != SUCCESS) { /* set up pac/tmg/pel/dab */
        (void)lm_error("Unable to initialize lane %c\n", current_lane + 'A');
        return(FAILURE);
    }
    if (pel_dab_init(PUBLIC_DAB) != SUCCESS) {
        (void)lm_error("Unable to initialize DAB in lane %c, PEL %d\n",
        current_lane + 'A', current_pel);
        return(FAILURE);
    }

  /*
   *  shorts test: play bus<15..0> = 0xaaaa and verify that all of the
   *  MAGIC chips get aaaa for result
 */
    if (pel_play_pattern_string(
        "z2f5f5z5z5f5f5f5f5z5z5z5z1u5z5z5z5z5f5f5f5A5f5f5f6f7z6a7",
        0) != SUCCESS) {
        (void)pel_error("DUT opens/shorts test fails.\n");
        return (FAILURE);
    }
    pattern[4] = 0x0000;
        pattern[3] = 0x0000;
        pattern[2] = 0x0000;
        pattern[1] = 0x0000;
        pattern[0] = 0x0000;
    if (compare_magic_chips(9, pattern) != SUCCESS) { /* U */
        (void)pel_error("Register 9 miscompared.\n");
        return(FAILURE);
    }
    pattern[4] = 0x0000;
        pattern[3] = 0x0000;
        pattern[2] = 0x0000;
        pattern[1] = 0x0000;
        pattern[0] = 0x0000;
    if (compare_magic_chips(10, pattern) != SUCCESS) { /* HIZ */
        (void)pel_error("Register 10 miscompared.\n");
        return(FAILURE);
    }
    pattern[4] = 0xaaaa;
        pattern[3] = 0xaaaa;
        pattern[2] = 0xaaaa;
        pattern[1] = 0xaaaa;
        pattern[0] = 0xaaaa;
    if (compare_magic_chips(11, pattern) != SUCCESS) { /* VALUE */
        (void)pel_error("Register 11 miscompared.\n");
        return(FAILURE);
    }

    return (SUCCESS);
}

pel_play_utilities(parent_menu)
LM_DIAG_MENU *parent_menu;
```

Copyright 1989
Logic Modeling Systems

SOURCE PROGRAM: diags/pel.c

DATE: 5/23/89 TIME: 4:41:24 pm PAGE # 8/101

SOURCE TEXT

```
{
        int pel_type_pattern_string();
        int pel_set_timing();
        int pel_set_voltages();
        int pac_replay();
        int pel_loop_play();
        int pel_eval_soft_drivers();
        int pel_eval_dacs_adcs();

        static LM_DIAG_MENU_ITEM menu_list[] =
        {
                {
                        "1",
                        "Enter and play patterns",
                        pel_type_pattern_string,
                        LM_DIAG_utility,
                        LM_DIAG_null,
                        0
                },
                {
                        "2",
                        "Set Timing",
                        pel_set_timing,
                        LM_DIAG_utility,
                        LM_DIAG_null,
                        0
                },
                {
                        "3",
                        "Set Voltages",
                        pel_set_voltages,
                        LM_DIAG_utility,
                        LM_DIAG_null,
                        0
                },
                {
                        "4",
                        "Play",
                        pac_replay,
                        LM_DIAG_utility,
                        LM_DIAG_null,
                        0
                },
                {
                        "5",
                        "Loop play",
                        pel_loop_play,
                        LM_DIAG_utility,
                        LM_DIAG_null,
                        0
                },
                {
                        "6",
                        "Evaluate Soft-Drivers",
                        pel_eval_soft_drivers,
                        LM_DIAG_utility,
                        LM_DIAG_null,
                        0
                },
                {
                        "7",
                        "Evaluate DACs and ADCs",
                        pel_eval_dacs_adcs,
                        LM_DIAG_utility,
                        LM_DIAG_null,
                        0
                },
        };

        static LM_DIAG_MENU menu =
        {
                "PEL UTILITIES",
                sizeof(menu_list) / sizeof(LM_DIAG_MENU_ITEM),
                0,
                menu_list
        };
        menu.title = parent_menu->
                menu_items[parent_menu->current_selection].menu_text;
        return lm_display_menu(&menu);
}


display_pel_errors()
{
    if (pel_check_errors(current_lane, current_pel, lm_message) == SUCCESS) {
        lm_message("No errors on Pin Electronics Module %ld\n", current_pel);
    }
    return(SUCCESS);
}


pel_check_errors(lane, slot, prtfcn)
int     lane, slot;
int     (*prtfcn)();
{
    register PEL *pel = (PEL *)(pel_addr(lane, slot));
    int errors = 0;
    int i;

    if (!pel->car.bit.errorL) {
        if (pel->car.bit.present && !pel->car.bit.active) {                 /* DAB insertion        */
            prtfcn("PEL error: DAB inserted\n");
            errors++;
        }
        if (!pel->car.bit.present && pel->car.bit.initialize) {             /* DAB removal          */
            prtfcn("PEL error: DAB removed\n");
            errors++;
        }
        if (!pel->car.bit.play_errorL) {                                    /* PLAYERROR*           */
            prtfcn("PEL error: Playing to an unitialized PEL\n");
            errors++;
        }
        if (!pel->car.bit.magic_errorL && !pel->car.bit.magic_error_enableL) { /* enabled MAGIC errors */
            for (i = 0; i < 5; i++) {                                       /* MAGIC parity         */
                if (pel->magic_chip[i].m.parity_out) {
                    prtfcn("PEL error: MAGIC[%ld] parity error\n", i);
                    errors++;
                }
            }
```

Copyright 1989
Logic Modeling Systems

SOURCE PROGRAM: diags/pel.c | DATE: 5/23/89 | TIME: 4:41:24 pm | PAGE # 9/102

SOURCE TEXT

```
            for (i = 0; i < 5; i++) {                      /* MAGIC shorts        */
                if (pel->magic_chip[i].m.short_sample) {
                    prtfcn("PEL error: MAGIC(%ld) short error = %04x\n",
                                        i, pel->magic_chip[i].m.short_sample);
                    errors++;
                }
            }
        }
        if (!errors) {                                     /* unknown             */
            prtfcn("PEL error: unknown error\n");
            errors++;
        }
    }

    return errors ? FAILURE : SUCCESS;
}



pel_count_ddabs()
{
    int lane_no, slot_no;
    int count = 0;

    if(diag_tmg_reset(TRUE) != SUCCESS) {
        (void)pel_error("Backplane reset failed during lane probe.\n");
        return 0;
    }
    for(lane_no = 0; lane_no < NUMBER_OF_LANES; lane_no++) {
        if(probe_pac(lane_no) == SUCCESS) {
            for(slot_no = 0; slot_no < NUMBER_OF_SLOTS; slot_no++) {
                if(probe_pel(lane_no, slot_no) == SUCCESS) {
                    if (what_dab(lane_no, slot_no) == DIAG_DAB) {
                        ++count;
                    }
                }
            }
        }
    }
    return count;
}

pel_error(s)
char *s;
{
        (void)lm_error("Lane %c Pel %d: %s",
                current_lane + 'A', current_pel, s);
}
```

Copyright 1989
Logic Modeling Systems

SOURCE PROGRAM
diags/pel_analog.c

DATE 5/23/89
TIME 4:41:25 pm

LINE # SOURCE TEXT

```
/* SCCS_ID: pel_analog.c rev 3.1, 4/24/89 at 07:49:46      */

/*************************************************************
 *        pel_analog.c                                        *
 *                                                            *
 *        PEL DAC/ADC tests                                   *
 *        used in PEL diagnostics                             *
 *                                                            *
 *************************************************************/
#include <math.h>
#include "common.h"
#include "lm_diags.h"
#include "vrtx.h"
#include "tmg.h"
#include "mod_def.h"
#include "modeler_extn.h"
#include "magic.h"
#include "pel.h"

int set_vlogl_dac();
int set_vlogh_dac();
int set_vhth_dac();
int set_vsh_dac();
int set_vlth_dac();
int set_vsl_dac();

#define DUTVCC_min          3.0
#define DUTVCC_max          5.25
#define VSH_NO_DAB 0.6
#define DUT_ANALOG_ERROR 0.2
#define ADC_LSB             (5.0 / 256.0)
#define DUTVCC_ADC_LSB      (6.0 / 256.0)
#define DAC_ADC_ERROR       0.140

/* The following formulas compute floating point voltage setting boundaries */
/* based on a floating point DUT Vcc value */
/* X = DUT VCC (float) */
#define VLOGL_max(X)        (X)
#define VLOGH_max(X)        (X)
#define VHTH_max(X)         (X)
#define VSH_max(X)          (X)
#define VLTH_max(X)         ((X)/5.0)
#define VSL_max(X)          ((X)/5.0)
#define VHTH_min(X)         ((X)/2.0)
#define VSH_min(X)          ((X)/2.0)
#define VLOGL_min(X)        (0.0)
#define VLOGH_min(X)        (0.0)
#define VLTH_min(X)         (0.0)
#define VSL_min(X)          (0.0)

/* The following formulas convert a floating point voltage setting into */
/* an 8-bit DAC value based on a floating point DUT Vcc value */
/* X = input value to set (float), Y = DUT VCC (float) */
#define DAC_value_vhth(X,Y)  (((Y) == 0.0)?\
                              0:(u_char)((((X)/(Y)-0.5)*2.0*256.0)))
#define DAC_value_vsh(X,Y)   DAC_value_vhth(X,Y)
#define DAC_value_vlth(X,Y)  (((Y) == 0.0)?0:(u_char)(((X)/(Y)*5.0*256.0)))
#define DAC_value_vsl(X,Y)   DAC_value_vlth(X,Y)
#define DAC_value_vlogl(X,Y) (((Y) == 0.0)?0:(u_char)(((X)/(Y)*256.0)))
#define DAC_value_vlogh(X,Y) DAC_value_vlogl(X,Y)

/* The following formulas convert an 8-bit DAC value into a floating point */
/* voltage setting based on a floating point DUT Vcc value */
/* X = DAC value to set (u_char), Y = DUT VCC (float) */
#define Float_value_vhth(X,Y)   (((((float)(X))/(2.0*256.0))+0.5) (Y))
#define Float_value_vsh(X,Y)    Float_value_vhth(X,Y)
#define Float_value_vlth(X,Y)   (((float)(X))*(Y)/(5.0*256.0))
#define Float_value_vsl(X,Y)    Float_value_vlth(X,Y)
#define Float_value_vlogl(X,Y)  (((float)(X))*(Y)/(256.0))
#define Float_value_vlogh(X,Y)  Float_value_vlogl(X,Y)

void
get_dutanalog(dutanalog)
float *dutanalog;
{
  register PEL *pel = (PEL *)(pel_addr(current_lane, current_pel));
  register u_char raw_dac_value;

  /* Read DAC value twice (hardware requirement) */
  raw_dac_value = pel->signal_adc;
  raw_dac_value = pel->signal_adc;
  *dutanalog = (float)(raw_dac_value) * ADC_LSB ;
}

void
get_dutvcc(dutvcc)
float *dutvcc;
{
  register PEL *pel = (PEL *)(pel_addr(current_lane, current_pel));
  register u_char raw_dac_value;

  /* Read DAC value twice (hardware requirement) */
  raw_dac_value = pel->vcc_adc;
  raw_dac_value = pel->vcc_adc;
  *dutvcc = (float)(raw_dac_value)* DUTVCC_ADC_LSB ;
}

int
pel_dac_adc()
{
  int returncode = SUCCESS;
  float dutvcc, dutanalog;

  get_dutvcc(&dutvcc);          /* Read the DUT Vcc line */

  if(dab_type == NO_DAB)
  {
    if(dutvcc > DAC_ADC_ERROR)
    {
      (void)lm_error("Lane %c Pel %d DUT Vcc = %1.3f exceeds no-DAB maximum.\n",
         current_lane + 'A', current_pel, dutvcc);
      return(FAILURE);
    }
  }
  else
  {
    if ((dutvcc > DUTVCC_max) || (dutvcc < DUTVCC_min))
    {
      (void)lm_error("DUT Vcc = %1.3fV. Legal range is %1.3fV to %1.3fV.\n",
       dutvcc, DUTVCC_min, DUTVCC_max);
```

Copyright 1989
Logic Modeling Systems

SOURCE PROGRAM diags/pel_analog.c | DATE 5/23/89 | TIME 4:41:25 pm | PAGE # 2/104

SOURCE TEXT

```
      return(FAILURE);
    }
  }

  if(test_all_dacs(dutvcc, &returncode) != SUCCESS)
    return(FAILURE);

  if(dab_type == DIAG_DAB)
  {
    get_dutanalog(&dutanalog);
    if((dutanalog > (1.0 + DUT_ANALOG_ERROR)) ||
     (dutanalog < (1.0 - DUT_ANALOG_ERROR)))
    {
      (void)lm_error("DUTANALOG on Diagnostic DAB = %1.3f. Expected \
1.000 V +/- %1.3f V.\n", dutanalog, DUT_ANALOG_ERROR);
      return(FAILURE);
    }
  }
  return(returncode);
}

int
test_a_dac(funcptr, charptr, dutvcc, returncode)
int (*funcptr)();
char *charptr;
float dutvcc;
int *returncode;
{
  register int i;
  register test;
  static u_char value[9] =
  {
    0x00,
    0x80,
    0x01,
    0x40,
    0x02,
    0x20,
    0x04,
    0x10,
    0x08
  };

  if(dab_type == NO_DAB)
  {
    if(funcptr(0, 0.0) != SUCCESS)
    {
      *returncode = FAILURE;
      if(lm_error("DAC test for %s (no DAB) fails.\n", charptr) != SUCCESS)
        return(FAILURE);
    }
  }
  else
  {
    for(test = 0; test < 2; ++test) /* Test 0 => walking 0, else walking 1 */
    {
      for(i = 0; i < 9; ++i)
      {
        if(funcptr(test == 0 ? value[i] : ~value[i], dutvcc) != SUCCESS)
        {
          *returncode = FAILURE;
          if(lm_error("DAC test for %s fails.\n", charptr) != SUCCESS)
            return(FAILURE);
        }
      }
    }
  }
  return(SUCCESS);
}

int
test_all_dacs(dutvcc, returncode)
float dutvcc;
int *returncode;
{
  if(test_a_dac(set_vlogl_dac, "vlogl", dutvcc, returncode) != SUCCESS)
    return(FAILURE);
  if(test_a_dac(set_vlogh_dac, "vlogh", dutvcc, returncode) != SUCCESS)
    return(FAILURE);
  if(test_a_dac(set_vhth_dac, "vhth", dutvcc, returncode) != SUCCESS)
    return(FAILURE);
  if(test_a_dac(set_vsh_dac, "vsh", dutvcc, returncode) != SUCCESS)
    return(FAILURE);
  if(test_a_dac(set_vlth_dac, "vlth", dutvcc, returncode) != SUCCESS)
    return(FAILURE);
  if(test_a_dac(set_vsl_dac, "vsl", dutvcc, returncode) != SUCCESS)
    return(FAILURE);
  return(SUCCESS);
}

int
check_dac_value(value, min, max)
float value;
float min;
float max;
{
  if ((value > max) || (value < min))
  {
    (void)lm_error("Desired DAC setting = %1.3f out of range (%1.3f - %1.3f)\n",
     value, min, max);
    return(FAILURE);
  }
  return(SUCCESS);
}

int
set_vlogl_dac(dac_value, dutvcc)
u_char dac_value;
float dutvcc;
{
  register PEL *pel = (PEL *)(pel_addr(current_lane, current_pel));
  float value;

  /* Compute the expected floating point value */
  value = Float_value_vlogl(dac_value, dutvcc);
  if(set_dac_and_compare(&pel->vlogl_dac, &pel->vlogl_adc, dac_value, value) !=
   SUCCESS)
  {
    (void)pel_error("Failure setting vlogl DAC.\n");
    return(FAILURE);
```

Copyright 1989 Logic Modeling Systems

SOURCE PROGRAM diags/pel_analog.c | DATE 5/23/89 | TIME 4:41:25 pm | PAGE # 3/105

SOURCE TEXT

```
  }
  return(SUCCESS);
}

int
set_vlogl(value)
float value;
{
  float dutvcc;

  get_dutvcc(&dutvcc);          /* Read the DUT Vcc line */
  if(check_dac_value(value, VLOGL_min(dutvcc), VLOGL_max(dutvcc)) != SUCCESS)
  {
    (void)pel_error("Unable to set vlogl to desired value.\n");
    return(FAILURE);
  }
  return(set_vlogl_dac(DAC_value_vlogl(value, dutvcc), dutvcc));
}

int
set_vlogh_dac(dac_value, dutvcc)
u_char dac_value;
float dutvcc;
{
  register PEL *pel = (PEL *)(pel_addr(current_lane, current_pel));
  float value;

  /* Compute the expected floating point value */
  value = float_value_vlogh(dac_value, dutvcc);
  if(set_dac_and_compare(&pel->vlogh_dac, &pel->vlogh_adc, dac_value, value) !=
   SUCCESS)
  {
    (void)pel_error("Failure setting vlogh DAC.\n");
    return(FAILURE);
  }
  return(SUCCESS);
}

int
set_vlogh(value)
float value;
{
  float dutvcc;

  get_dutvcc(&dutvcc);          /* Read the DUT Vcc line */
  if(check_dac_value(value, VLOGH_min(dutvcc), VLOGH_max(dutvcc)) != SUCCESS)
  {
    (void)pel_error("Unable to set vlogh to desired value.\n");
    return(FAILURE);
  }
  return(set_vlogh_dac(DAC_value_vlogh(value, dutvcc), dutvcc));
}

int
set_vlth_dac(dac_value, dutvcc)
u_char dac_value;
float dutvcc;
{
  register PEL *pel = (PEL *)(pel_addr(current_lane, current_pel));
  float value;

  /* Compute the expected floating point value */
  value = float_value_vlth(dac_value, dutvcc);
  if(set_dac_and_compare(&pel->vlth_dac, &pel->vlth_adc, dac_value, value) !=
   SUCCESS)
  {
    (void)pel_error("Failure setting vlth DAC.\n");
    return(FAILURE);
  }
  return(SUCCESS);
}

int
set_vlth(value)
float value;
{
  float dutvcc;

  get_dutvcc(&dutvcc);          /* Read the DUT Vcc line */
  if(check_dac_value(value, VLTH_min(dutvcc), VLTH_max(dutvcc)) != SUCCESS)
  {
    (void)pel_error("Unable to set vlth to desired value.\n");
    return(FAILURE);
  }
  return(set_vlth_dac(DAC_value_vlth(value, dutvcc), dutvcc));
}

int
set_vsl_dac(dac_value, dutvcc)
u_char dac_value;
float dutvcc;
{
  register PEL *pel = (PEL *)(pel_addr(current_lane, current_pel));
  float value;

  /* Compute the expected floating point value */
  value = float_value_vsl(dac_value, dutvcc);
  if(set_dac_and_compare(&pel->vsl_dac, &pel->vsl_adc, dac_value, value) !=
   SUCCESS)
  {
    (void)pel_error("Failure setting vsl DAC.\n");
    return(FAILURE);
  }
  return(SUCCESS);
}

int
set_vsl(value)
float value;
{
  float dutvcc;

  get_dutvcc(&dutvcc);          /* Read the DUT Vcc line */
  if(check_dac_value(value, VSL_min(dutvcc), VSL_max(dutvcc)) != SUCCESS)
  {
    (void)pel_error("Unable to set vsl to desired value.\n");
    return(FAILURE);
  }
  return(set_vsl_dac(DAC_value_vsl(value, dutvcc), dutvcc));
}
```

Copyright 1989 Logic Modeling Systems

SOURCE PROGRAM diags/pel_analog.c | DATE 5/23/89 | TIME 4:41:25 pm | PAGE # 5/107

LINE # SOURCE TEXT

```
{
  *dacptr = dac_value;  /* Set the DAC */
  lm_delay(1);          /* Let the DAC settle */

  return(read_adc_and_compare(adcptr, dac_value, expected_value));
}

show_all_adc()
{
   register PEL *pel = (PEL *)(pel_addr(current_lane, current_pel));
   register int dummy;

   dummy = pel->vlogl_adc; lm_delay(1);
   (void)lm_message("VLOGL      = %1.3f\n", pel->vlogl_adc  * ADC_LSB);
   dummy = pel->vlogh_adc; lm_delay(1);
   (void)lm_message("VLOGH      = %1.3f\n", pel->vlogh_adc  * ADC_LSB);
   dummy = pel->vlth_adc; lm_delay(1);
   (void)lm_message("VLTH       = %1.3f\n", pel->vlth_adc   * ADC_LSB);
   dummy = pel->vsl_adc; lm_delay(1);
   (void)lm_message("VSL        = %1.3f\n", pel->vsl_adc    * ADC_LSB);
   dummy = pel->vhth_adc; lm_delay(1);
   (void)lm_message("VHTH       = %1.3f\n", pel->vhth_adc   * ADC_LSB);
   dummy = pel->vsh_adc; lm_delay(1);
   (void)lm_message("VSH        = %1.3f\n", pel->vsh_adc    * ADC_LSB);
   dummy = pel->vcc_adc; lm_delay(1);
   (void)lm_message("DUTVCC     = %1.3f\n", pel->vcc_adc    * DUTVCC_ADC_LSB);
   dummy = pel->signal_adc; lm_delay(1);
   (void)lm_message("DUTANALOG = %1.3f\n", pel->signal_adc * ADC_LSB);
#ifdef lint
    if (dummy); /* shut lint up */
#endif lint
}



find_voltages_using_dacs(f_vsl, f_vsh)
float f_vsl, f_vsh;
{
    register PEL *pel = (PEL *)(pel_addr(current_lane, current_pel));
    int vsl, vsh, vlth, vhth, vlogl, vlogh;
    static long edgetime[6] = {
        10000, 10000, 10000, 10000, 10000, 10000
    };
    long temp;
    static long period = 40000;
    float dutvcc, vlth_error, vlogl_error, vhth_error, vlogh_error;
    int low, high;

    get_dutvcc(&dutvcc);
    vsl = DAC_value_vsl(f_vsl,dutvcc);
    vsh = DAC_value_vsh(f_vsh,dutvcc);

    if(diag_clear_errors() != SUCCESS)
      return(FAILURE);
   if (pel_dab_init(PUBLIC_DAB) != SUCCESS) {
        (void)pel_error("Unable to initialize Diagnostic DAB\n");
        return(FAILURE);
    }
    if (pel_lane_init() != SUCCESS) {    /* set up pac/tmg/pel/dab       */
        (void)lm_error("Unable to initialize lane %c\n", current_lane + 'A');
        return(FAILURE);
    }
    if (tmg_set_timing(period, edgetime, 01, 1000001, 25000001) != SUCCESS) {
      return FAILURE;
    }

    pel->vhth_dac = 255;

    pel->vsl_dac = vsl;
    pel->vsh_dac = vsh;

    if (set_vlogl(1.0) == FAILURE) return(FAILURE);
    if (set_vlogh(2.0) == FAILURE) return(FAILURE);

    /*
     *  Find Vlth
     */
    low = 0;
    high = 255;
    while (high > low + 1) {
        pel->vlth_dac = (low + high) >> 1;
        if (pel_play_pattern_string("z2f5f5z5f5f5f5z5z5z5z5f5z1u5z5z5z5z5z5f5f5f5f5f6a7a7", 0) != SUCCESS) {
            (void)pel_error("Failure to play pattern");
            return (FAILURE);
        }
        if (pel->magic_chip[0].m.float_sample == 0xffff)
            low = (low + high) >> 1;
        else
            high = (low + high) >> 1;
    }
    vlth = high;
    pel->vlth_dac  = 0;

    /*
     *  Find Vhth
     */
    low = 0;
    high = 255;
    while (high > low + 1) {
        pel->vhth_dac = (low + high) >> 1;
        if (pel_play_pattern_string("z2f5f5z5f5f5f5z5z5z5z5f5z1u5z5z5z5z5z5f5f5f5f5f6a7a7", 0) != SUCCESS) {
            (void)pel_error("Failure to play pattern");
            return (FAILURE);
        }
        if (pel->magic_chip[0].m.float_sample == 0xffff)
            high = (low + high) >> 1;
        else
            low = (low + high) >> 1;
    }
    vhth = high;
    pel->vhth_dac  = 255;

    /*
     *  Find Vlogl
     */
    low = 0;
    high = 255;
    while (high > low + 1) {
        pel->vlogl_dac = (low + high) >> 1;
        if (pel_play_pattern_string("z2f5f5z5f5f5f5z5z5z5z5f5z1u5z5z5z5z5z5f5f5f5f5f6a7a7", 0) != SUCCESS) {
```

Copyright 1989
Logic Modeling Systems

SOURCE PROGRAM diags/pel_analog.c | DATE 5/23/89 | TIME 4:41:25 pm | PAGE # 4/106

LINE # SOURCE TEXT

```
int
set_vhth_dac(dac_value, dutvcc)
u_char dac_value;
float dutvcc;
{
  register PEL *pel = (PEL *)(pel_addr(current_lane, current_pel));
  float value;

  /* Compute the expected floating point value */
  value = Float_value_vhth(dac_value, dutvcc);
  if(set_dac_and_compare(&pel->vhth_dac, &pel->vhth_adc, dac_value, value) !=
   SUCCESS)
  {
    (void)pel_error("Failure setting vhth DAC.\n");
    return(FAILURE);
  }
  return(SUCCESS);
}

int
set_vhth(value)
float value;
{
  float dutvcc;

  get_dutvcc(&dutvcc);          /* Read the DUT Vcc line */
  if(check_dac_value(value, VHTH_min(dutvcc), VHTH_max(dutvcc)) != SUCCESS)
  {
    (void)pel_error("Unable to set vhth to desired value.\n");
    return(FAILURE);
  }
  return(set_vhth_dac(DAC_value_vhth(value, dutvcc), dutvcc));
}

int
set_vsh_dac(dac_value, dutvcc)
u_char dac_value;
float dutvcc;
{
  register PEL *pel = (PEL *)(pel_addr(current_lane, current_pel));
  float value;
  u_char adc_value;

  /* Compute the expected floating point value */
  if(dab_type == NO_DAB)        /* Special case during DAC/ADC test w/o DAB */
  {
    /* Read ADC twice (hardware requirement) */
    adc_value = pel->vsh_adc;
    lm_delay(1);
    value = ((float)(adc_value = pel->vsh_adc)) * ADC_LSB;
    /* Compare result against vsh without DAB upper bound */
    if(value > (VSH_NO_DAB + DAC_ADC_ERROR))
    {
      (void)lm_error("DAC set to %1.3f (%02X). ADC measured %1.3f (%02X).\n",
       VSH_NO_DAB, dac_value, value, adc_value);
      return(FAILURE);
    }
    return(SUCCESS);
  }
  else
    value = Float_value_vsh(dac_value, dutvcc);
  if(set_dac_and_compare(&pel->vsh_dac, &pel->vsh_adc, dac_value, value) !=
   SUCCESS)
  {
    (void)pel_error("Failure setting vsh DAC.\n");
    return(FAILURE);
  }
  return(SUCCESS);
}

int
set_vsh(value)
float value;
{
  float dutvcc;

  get_dutvcc(&dutvcc);          /* Read the DUT Vcc line */
  if(check_dac_value(value, VSH_min(dutvcc), VSH_max(dutvcc)) != SUCCESS)
  {
    (void)pel_error("Unable to set vsh to desired value.\n");
    return(FAILURE);
  }
  return(set_vsh_dac(DAC_value_vsh(value, dutvoc), dutvcc));
}

int
read_adc_and_compare(adcptr, dac_value, expected_value)
u_char *adcptr;
u_char dac_value;
float expected_value;
{
  float measured_value, measured_value_II;
  u_char adc_value;

  /* Read ADC twice (hardware requirement) */
  adc_value = *adcptr;
  lm_delay(1);
  measured_value = ((float)(adc_value = *adcptr)) * ADC_LSB;
  lm_delay(1);
  measured_value_II = ((float)(adc_value = *adcptr)) * ADC_LSB;
  /* Compare values */
  if ((measured_value > (expected_value + DAC_ADC_ERROR)) ||
   (measured_value < (expected_value - DAC_ADC_ERROR)))
  {
    (void)lm_error("DAC set to %1.3f (%02X). ADC first  measurement %1.3f (%02X).\n",
     expected_value, dac_value, measured_value, adc_value);
    (void)lm_error("DAC set to %1.3f (%02X). ADC second measurement %1.3f (%02X).\n",
     expected_value, dac_value, measured_value_II, adc_value);
    return(FAILURE);
  }
  return(SUCCESS);
}

int
set_dac_and_compare(dacptr, adcptr, dac_value, expected_value)
u_char *dacptr;
u_char *adcptr;
u_char dac_value;
float expected_value;
```

Copyright 1989
Logic Modeling Systems

LINE # SOURCE TEXT

```
                (void)pel_error("Failure to play pattern");
                return (FAILURE);
            }
            if (pel->magic_chip[0].m.unknown_sample == 0x0000)
                high = (low + high) >> 1;
            else
                low = (low + high) >> 1;
        }
        vlogl = high;
        if (set_vlogl(1.0) == FAILURE) return(FAILURE);

        /*
         * Find Vlogh
         */
        low = 0;
        high = 255;
        while (high > low + 1) {
            pel->vlogh_dac = (low + high) >> 1;
            if (pel_play_pattern_string(
                "z2f5f5z5f5f5f5z5z5z5f5z1u5z5z5z5z5z5f5f5f5f5f6a7a7",
                0) != SUCCESS) {
                (void)pel_error("Failure to play pattern");
                return (FAILURE);
            }
            if (pel->magic_chip[0].m.unknown_sample == 0x0000)
                low = (low + high) >> 1;
            else
                high = (low + high) >> 1;
        }
        vlogh = high;

        vlth_error  = Float_value_val(val,dutvcc) - Float_value_vlth(vlth,dutvcc);
        if (vlth_error < 0) vlth_error = -vlth_error;
        vlogl_error = Float_value_val(val,dutvcc) - Float_value_vlogl(vlogl,dutvcc);
        if (vlogl_error < 0) vlogl_error = -vlogl_error;
        vhth_error  = Float_value_vsh(vsh,dutvcc) - Float_value_vhth(vhth,dutvcc);
        if (vhth_error < 0) vhth_error = -vhth_error;
        vlogh_error = Float_value_vsh(vsh,dutvcc) - Float_value_vlogh(vlogh,dutvcc);
        if (vlogh_error < 0) vlogh_error = -vlogh_error;

        lm_message("val = %5.3f, vlth  = %5.3f, error = %5.3f\n",
            Float_value_val(val,dutvcc), Float_value_vlth(vlth,dutvcc),
            vlth_error);
        lm_message("val = %5.3f, vlogl = %5.3f, error = %5.3f\n",
            Float_value_val(val,dutvcc), Float_value_vlogl(vlogl,dutvcc),
            vlogl_error);
        lm_message("vsh = %5.3f, vhth  = %5.3f, error = %5.3f\n",
            Float_value_vsh(vsh,dutvcc), Float_value_vhth(vhth,dutvcc),
            vhth_error);
        lm_message("vsh = %5.3f, vlogh = %5.3f, error = %5.3f\n",
            Float_value_vsh(vsh,dutvcc), Float_value_vlogh(vlogh,dutvcc),
            vlogh_error);

        if (vlth_error > 0.30) {
            pel_error("val/vlth comparator mismatch");
            return(FAILURE);
        }
        if (vlogl_error > 0.60) {
            pel_error("val/vlogl comparator mismatch");
            return(FAILURE);
        }
        if (vhth_error > 0.30) {
            pel_error("vsh/vhth comparator mismatch");
            return(FAILURE);
        }
        if (vlogh_error > 0.60) {
            pel_error("vsh/vlogh comparator mismatch");
            return(FAILURE);
        }

        return(SUCCESS);
}



pel_comparator_test()
{
        float dutvcc;

        get_dutvcc(&dutvcc);

        if (find_voltages_using_dacs(0.1, dutvcc/2.0 + 0.1) == FAILURE) return(FAILURE);
        if (find_voltages_using_dacs(0.2, dutvcc/2.0 + 0.4) == FAILURE) return(FAILURE);
        if (find_voltages_using_dacs(0.3, 3.1) == FAILURE) return(FAILURE);
        if (find_voltages_using_dacs(0.4, 3.4) == FAILURE) return(FAILURE);
        if (find_voltages_using_dacs(0.5, 3.7) == FAILURE) return(FAILURE);
        if (find_voltages_using_dacs(0.6, 4.0) == FAILURE) return(FAILURE);
        if (find_voltages_using_dacs(0.7, 4.3) == FAILURE) return(FAILURE);
        if (find_voltages_using_dacs(0.8, dutvcc - 0.4) == FAILURE) return(FAILURE);
        if (find_voltages_using_dacs(0.9, dutvcc - 0.1) == FAILURE) return(FAILURE);

        return(SUCCESS);
}



pel_eval_dacs_adcs()
{
        register PEL *pel = (PEL *)(pel_addr(current_lane, current_pel));
        register int dac_value;
        register int dummy;
        float dutvcc, result;

        get_dutvcc(&dutvcc);

        (void)lm_message("    vlth  val          vlogl vlogh        vsh   vhth\n");
        (void)lm_message("------------------------------------------------------------\n");
        for (dac_value = 0; dac_value < 256; dac_value++) {
            pel->vlth_dac  = dac_value;
            pel->val_dac   = dac_value;
            pel->vlogl_dac = dac_value;
            pel->vlogh_dac = dac_value;
            pel->vsh_dac   = dac_value;
            pel->vhth_dac  = dac_value;
            lm_delay(1);

            (void)lm_message("%02x: ", dac_value);

            result = pel->vlth_adc  * ADC_LSB;
            result = pel->vlth_adc  * ADC_LSB;
```

Copyright 1989
Logic Modeling Systems

SOURCE PROGRAM diags/pel_analog.c | DATE 5/23/89 | TIME 4:41:25 pm | PAGE # 7/109

SOURCE TEXT

```
        (void)lm_message("%5.3f ", result);
        result = pel->vsl_adc   * ADC_LSB;
        result = pel->vsl_adc   * ADC_LSB;
        (void)lm_message("%5.3f ", result);
        (void)lm_message("(%5.3f) ", Float_value_vlth(dac_value,dutvcc));

        result = pel->vlogl_adc   * ADC_LSB;
        result = pel->vlogl_adc   * ADC_LSB;
        (void)lm_message("%5.3f ", result);
        result = pel->vlogh_adc   * ADC_LSB;
        result = pel->vlogh_adc   * ADC_LSB;
        (void)lm_message("%5.3f ", result);
        (void)lm_message("(%5.3f) ", Float_value_vlogl(dac_value,dutvcc));

        result = pel->vhth_adc   * ADC_LSB;
        result = pel->vhth_adc   * ADC_LSB;
        (void)lm_message("%5.3f ", result);
        result = pel->vsh_adc   * ADC_LSB;
        result = pel->vsh_adc   * ADC_LSB;
        (void)lm_message("%5.3f ", result);
        (void)lm_message("(%5.3f) ", Float_value_vhth(dac_value,dutvcc));

        (void)lm_message("\n");
    }
}
```

Copyright 1989 Logic Modeling Systems

| SOURCE PROGRAM | DATE | 5/23/89 | PAGE # |
|---|---|---|---|
| diags/pel_crc.c | TIME | 4:41:26 pm | 1/110 |

LINE # SOURCE TEXT

```
/* SCCS_ID: pel_crc.c rev 3.1, 4/24/89 at 07:49:50 */

/*********************************************************************
 *                                                                   *
 *      CRC routines                                                 *
 *      used in PEL diagnostics                                      *
 *                                                                   *
 *********************************************************************/

#include "common.h"
#include "mod_def.h"
#include "modeler_exts.h"
#include "vrtx.h"
#include "lm_diags.h"
#include "tmg.h"
#include "tmg_exts.h"
#include "tmg_def.h"
#include "pac.h"
#include "pac_def.h"
#include "pac_exts.h"
#include "magic.h"
#include "pel.h"

#define DDAB_SEL_HIDATA 0x01
#define DDAB_NOT_COE    0x02
#define DDAB_NOT_CLR    0x04
#define DDAB_CLK        0x08

#define DDAB_TEST_LODATA_NO_CLK (DDAB_NOT_CLR | DDAB_NOT_COE)
#define DDAB_TEST_LODATA        (DDAB_TEST_LODATA_NO_CLK | DDAB_CLK)
#define DDAB_TEST_HIDATA        (DDAB_TEST_LODATA | DDAB_SEL_HIDATA)

#define CRC_PREAMBLE_LODATA \
    "z2f5t5z5A5f5f5f505z5z5z5z1u5T5T5T5T5f5f5%c5%c5%c5%c5f6f7z6r7r7"
#define CRC_POSTAMBLE_LODATA "U6R7"
#define CRC_POSTAMBLE_LO_SIZE (sizeof(CRC_POSTAMBLE_LODATA)/2)
#define CRC_PREAMBLE_HIDATA \
    "z2f5g5z5A5f5f5f505z5z5z5z1u5G5G5G5G5f5f5%c5%c5%c5%c5f6f7z6k7k7"
#define CRC_POSTAMBLE_HIDATA "O7S7U6R7"
#define CRC_POSTAMBLE_HI_SIZE (sizeof(CRC_POSTAMBLE_HIDATA)/2)
#define CRC_SHIFT_PATTERN \
        "z2f5t5z5A5f5f5f505z5z5z5z1u5T5T5T5T5f5f5A5A5A5A5c7U6R7"

#define FBACK_LOAD "s7c7"
#define FBACK_LOAD_SIZE (sizeof(FBACK_LOAD) / 2)
#define RISING_8_CRC    0x44
#define FALLING_8_CRC   0x26
#define RISING_512_CRC    0x93
#define FALLING_512_CRC   0x40

u_long pel_debug = 0;

generate_preamble(s, chip, byte)
register char *s;
{
        register char c;

        c = 'A' + (char)chip;
        sprintf(s, (byte == 0)? CRC_PREAMBLE_LODATA: CRC_PREAMBLE_HIDATA,
                c, c, c, c, c);
        return(strlen(s) >> 1);
}

generate_postamble(s, byte)
char *s;
{
        register char *string;
        register int count;

        if (byte == 0) {
                string = CRC_POSTAMBLE_LODATA;
                count = CRC_POSTAMBLE_LO_SIZE;
        } else {
                string = CRC_POSTAMBLE_HIDATA;
                count = CRC_POSTAMBLE_HI_SIZE;
        }
        strcpy(s, string);
        return count;
}

int
set_pel_voltages()
{
  if(set_vlogl(0.8) != SUCCESS) return(FAILURE);
  if(set_vlogh(2.0) != SUCCESS) return(FAILURE);
  if(set_vlth(0.3) != SUCCESS) return(FAILURE);
  if(set_val(0.4) != SUCCESS) return(FAILURE);
  if(set_vah(4.0) != SUCCESS) return(FAILURE);
  if(set_vhth(4.4) != SUCCESS) return(FAILURE);
  return(SUCCESS);
}


/* set up TMG/PAC/PEL/DAB */
int
pel_diag_dab_test_init(dab_mode)
int dab_mode;           /* PUBLIC_DAB or PRIVATE_DAB */
{
  if(pel_lane_init() != SUCCESS)
  {
    (void)pel_error("Unable to initialize lane for Diagnostic Adapter test.\n");
    return(FAILURE);
  }
  if (pel_dab_init(dab_mode) != SUCCESS)
  {
      (void)pel_error("Unable to initialize Diagnostic DAB\n");
      return(FAILURE);
  }
  if(set_pel_voltages() != SUCCESS)
  {
    (void)pel_error("Unable to set Pin Electronics DAC voltages.\n");
    return(FAILURE);
  }
  return(SUCCESS);
}

int
pel_crc_setup()
{
  if(pel_diag_dab_test_init(PRIVATE_DAB) != SUCCESS)
```

Copyright 1989
Logic Modeling Systems

SOURCE PROGRAM diags/pel_crc.c

DATE 5/23/89 TIME 4:41:26 pm

PAGE # 2/111

SOURCE TEXT

```
  {
    (void)pel_error("Unable to initialize PEL/DAB for CRC test.\n");
    return(FAILURE);
  }
  return(pel_set_diag_dab_period(PAC_MIN_PERIOD * 1000));
}

int
pel_set_diag_dab_period(clock_period)
int clock_period;        /* in picoseconds */
{
  register int edge;
  char buffer[80];
  long edgetime[6];      /* Default edges for Diagnostic Adapter */

  if(clock_period < 200000)      /* edge times are close */
  {
    edgetime[0] = 10000;
    edgetime[1] = 10000;
    edgetime[2] = 10000;
    edgetime[3] = 18000;
    edgetime[4] = 10000;
    edgetime[5] = 0;
  }
  else           /* edge times are spread out */
  {
    edgetime[0] = 500000;
    edgetime[1] = 500000;
    edgetime[2] = 500000;
    edgetime[3] = 1000000;
    edgetime[4] = 500000;
    edgetime[5] = 0;
  }

  if(pel_debug & 2)
  {
    diag_get_long(&(long)clock_period, "Period", 400001, 80000000001);
    for(edge = 0; edge < 6; ++edge)
    {
      sprintf(buffer, "Edge %d", edge);
      diag_get_long(&(edgetime[edge]), buffer, 01, (long)clock_period);
    }
  }

  if(tmg_set_timing((long)clock_period, edgetime, 01, 1000001, 25000001)
   != SUCCESS)
  {
    (void)lm_error("Unable to set edges (%dps clock period) for CRC test.\n",
     clock_period);
    return(FAILURE);
  }
  return(SUCCESS);
}

int
pel_crc_test_128K(first_pattern) /* Must run pel_crc_setup before running */
int first_pattern;
{
  register int byte;
  int returncode = SUCCESS;

  for(byte = 0; byte < 2; ++byte)
  {
    if(pel_play_crc_sequence(first_pattern, PATTERNS_IN_128K, byte) != SUCCESS)
    {
      returncode = FAILURE;
      if(lm_error("CRC sequence fails while testing %s byte.\n",
       byte ? "high" : "low") != SUCCESS)
        return(FAILURE);
    }
  }
  return(returncode);
}


/*
 * PEL CRC Test:
 */
pel_crc()
{
  if(diag_clear_errors() != SUCCESS)
    return(FAILURE);

  if(pel_crc_setup() != SUCCESS)
  {
    (void)pel_error("Unable to perform Pin Electronics CRC test.\n");
    return(FAILURE);
  }
  return(pel_crc_test_128K(0));
}

int
pel_play_crc_sequence(first_pattern, num_patterns, byte)
int first_pattern;
int num_patterns;
int byte;
{
  register PEL *pel = (PEL *)(pel_addr(current_lane, current_pel));
  register int pattern_count;
  register int time_out;
  register int crc_patterns = num_patterns - BLOCK_SIZE;
  register int shift;
  register int chip;
  register int pass;
  int i;
  int magic_0;
  int crc_result;
  int returncode = SUCCESS;
  char amble_buffer[256];


  static u_long right_crc_result[2][10]=
  {
    {
      0x1021D,
      0x0B66E,
      0x18A93,
      0x10AD2,
      0x04852,              /* Results for pass 0 */
      0x0D26A,
```

Copyright 1989
Logic Modeling Systems

| SOURCE PROGRAM | DATE | PAGE # |
|---|---|---|
| diags/pel_crc.c | 5/23/89 | 3/112 |
| | TIME 4:41:26 pm | |

LINE # SOURCE TEXT

```
        0x01C0C,
        0x1948D,
        0x0E9FF,
        0x09E4F
     },
     {
        0x1C106,
        0x1CBF4,
        0x1BFD7,
        0x11323,
        0x15846,                   /* Results for pass 1 */
        0x07924,
        0x01D45,
        0x19357,
        0x03CE9,
        0x00ACE
     }
  };

  if((time_out = pac_pre_play()) == 0)
  {
    (void)pel_error("Unable to prepare for play.\n");
    return(FAILURE);
  }

  for(pass = 0; pass < 2; ++pass)
  {
    if(pel_fill_crc(first_pattern + (pass ? BLOCK_SIZE : 0), crc_patterns,
     current_pel, byte? DDAB_TEST_HIDATA : DDAB_TEST_LODATA, byte,
       (int)(SEED << pass)) != SUCCESS)
    {
      (void)pel_error("Unable to fill pattern memory with CRC data.\n");
      return(FAILURE);
    }

    if(pel_load_pattern_string(CRC_SHIFT_PATTERN, first_pattern +
     (pass ? 0 : crc_patterns), STOP_MODE) == 0)
    {
      (void)pel_error("Unable to load shift pattern string in CRC test.\n");
      return(FAILURE);
    }

    (void)lm_message("Start pattern %X, Pass %d, %s Byte: Playing patterns",
      first_pattern, pass, byte ? "High" : "Low");

    for(chip = 0; chip < 5; ++chip)
    {
      lm_message(".");            /* Walking dots while messages are on */
      (void)generate_preamble(amble_buffer, chip, byte);
      if((build_pattern_data(amble_buffer, first_pattern +
       (pass ? BLOCK_SIZE : 0))) == 0)
      {
        (void)pel_error("Unable to build preamble pattern data.\n");
        return(FAILURE);
      }

      pattern_count = generate_postamble(amble_buffer, byte);
      if((build_pattern_data(amble_buffer, first_pattern +
       crc_patterns - pattern_count + (pass ? BLOCK_SIZE : 0))) == 0)
      {
        (void)pel_error("Unable to build postamble pattern data.\n");
        return(FAILURE);
      }

      if(build_pattern_control(first_pattern + (pass ? BLOCK_SIZE : 0),
       crc_patterns, STOP_MODE) != SUCCESS)
      {
        (void)pel_error("Could not build CRC pattern control.\n");
        return(FAILURE);
      }
      if(pac_play(time_out) != SUCCESS)
      {
        (void)pel_error("Pattern play failed during CRC tests.\n ");
        return(FAILURE);
      }
      /* Read the CRC result from magic chip 0 by playing a shift */
      /* sequence twice and concatenating the results to form a 17 bit */
      /* checksum */

      for(crc_result = shift = 0; shift < 3; ++shift)
      {
        if(pel_debug & 4) /* Read raw data out of all five magic chips */
        {
          for(i = 0; i < 5; ++i)
          {
            (void)lm_message("Pass %d Byte %d Chip %d Shift %d Magic %d:%04X\n",
             pass, byte, chip, shift, i, pel->magic_chip[i].reg[11]);
          }
        }
        /* Make sure control word byte = 0x04 */
        if(((magic_0 = pel->magic_chip[0].reg[11]) & 0xff00) != 0x0400)
        {
          returncode = FAILURE;
          if(lm_error("Magic chip CRC control byte not equal to 04 \
(actual %02X).\n", (magic_0 >> 8) & 0xff) != SUCCESS)
            return(FAILURE);
        }
        crc_result |= ((magic_0 & 0xff) <  (8 * shift));
        if(shift < 2) /* Shift CRC data b_ _laying the shift pattern */
        {
          pac_set_first_block(Lane_code(current_lane), (first_pattern +
           (pass ? 0 : crc_patterns)) / BLOCK_SIZE);
          if(pac_play(time_out) != SUCCESS)
          {
            (void)pel_error("Pattern play failed trying to shift CRC data.\n");
            return(FAILURE);
          }
        }
      }

      crc_result &= 0x1ffff;

      /* Compare the actual CRC result with the expected result */
      if(crc_result != right_crc_result[pass][5 * byte + chip])
      {
        returncode = FAILURE;
        if(lm_error("Pass %d, Byte %d, Chip %d, CRC = %05x. Expected %05x.\n",
         pass, byte, chip, crc_result, right_crc_result[pass][5 * byte + chip])
         != SUCCESS)
          return(FAILURE);
```

Copyright 1989 Logic Modeling Systems

SOURCE PROGRAM diags/pel_crc.c

DATE 5/23/89 TIME 4:41:26 pm

LINE # SOURCE TEXT

```
        if(pel_debug & 1)
          tmg_play_til_key();
      }
    }
    (void)lm_message("done.\n");
  }

  return(returncode);
}

/*      int pel_fill_crc(first_pattern, patterns, pel_no, control, dbyte, seed)
 *
 *      INPUT:  first_pattern = first pattern number to fill (0's counting)
 *              patterns =  number of patterns to fill
 *              pel_no =  four bit PEL number code
 *              control = eight bit control word
 *              dbyte : 0 => data in low byte, 1 => data in high byte
 *              seed = random number seed
 *      OUTPUT: return code = SUCCESS or FAILURE
 *      DESCRIPTION: Fills pattern memory with pseudorandom
 *      data as well as control bits. Used during PAC/PEL CRC checksum
 *      diagnostics.
 */

int
pel_fill_crc(first_pattern, patterns, pel_no, control, dbyte, seed)
int first_pattern;
int patterns;
int pel_no;
int control;
int dbyte;
int seed;
{
  register int cbyte = (dbyte == 0); /* cbyte is opposite dbyte */
  register u_long *memptr;
  register u_long i;
  register u_long fill_mask;
  register u_long fill_data;
  register u_long random_number;
  u_long base_address;
  u_long bank_offset;
  int bank;

  if(pac_fill_check(first_pattern, patterns) != SUCCESS)
    return(FAILURE);

  base_address = pac[current_lane].lane_offset + 4 * first_pattern;
  random_number = seed;

  /* Compute fill_mask and fill_data for banks 0 and 1 (data only) */
  fill_mask = 0xff << (8 * cbyte);
  fill_mask |= fill_mask << 16;
  fill_mask = ~fill_mask;
  fill_data = ((u_long)control & 0xff) << (8 * cbyte);
  fill_data |= fill_data << 16;
  for(bank = 0, bank_offset = 0; bank < 3; ++bank)
  {
    if(bank == 2)       /* modify fill_mask and fill_data */
    {
      fill_mask = (fill_mask | 0xffff) & ~0x7ff;
      fill_data = (fill_data & ~0xffff) | ((u_long)pel_no & 0xf) | (0x7 << 4);
    }
    memptr = (u_long *)(base_address + bank_offset);
    if(patterns > 1)
    {
      i = patterns - 1;
      do              /* do loop for speed */
      {
        random_number = Pac_get_random(random_number);
        *memptr++ = (random_number & fill_mask) | fill_data;
      } while (--i);
    }
    *memptr++ = fill_data;
    bank_offset += PAT_MEM_BANK;
  }
  return(SUCCESS);
}


/*      int pel_build_crc_fback(pel_no, fback_edge, seq_length)
 *
 *      INPUT:  pel_no =  four bit PEL number code
 *              fback_edge = branch code (BRANCH_FALLING or BRANCH_RISING)
 *              seq_length = 0, 8, or 512
 *      OUTPUT: returns number of blocks written (0 => FAILURE)
 *      DESCRIPTION: Builds feedback sequence in first several blocks
 *      of pattern memory.
 */
int
pel_build_crc_fback(pel_no, fback_edge, seq_length)
int pel_no;
int fback_edge;
int seq_length;
{
  PAT_WORD pattern_word, *patptr = &pattern_word;
  u_long *memptr;
  int pattern_no;
  int word;
  int i;
  int blocks_filled;

  /* Fill first two blocks of pattern memory with 0's in the lower byte */
  /* of each magic chip pattern word and diag DAB control in the other */
  /* (the control word does not contain a clock bit) */
  if(pel_fill_crc(0, 2 * BLOCK_SIZE, pel_no, DDAB_TEST_LODATA_NO_CLK, 0, 0)
   != SUCCESS)
  {
    (void)pel_error("Unable to fill first two blocks in pattern memory.\n");
    return(FAILURE);
  }
  memptr = (u_long *)Pattern_to_address(current_lane, 2, 01);
  switch(seq_length)
  {
    case 0:     /* Place branch (no clock command) every 8 locations */
      for(i = 0; i < (BLOCK_SIZE / 4); ++i)
      {
        memptr+ = 7;
        *memptr++ |= fback_edge;
      }
      break;
```

Copyright 1989
Logic Modeling Systems

SOURCE PROGRAM
diags/pel_crc.c

DATE 5/23/89
TIME 4:41:26 pm
PAGE # 5/114

LINE # SOURCE TEXT

```
      case 8:      /* Place clock command and branch every 8 locations */
        pattern_no = 0;
        while(pattern_no < (2 * BLOCK_SIZE))
        {
          (void)pac_read_pattern(pattern_no, patptr);
          for(word = 0; word < 5; ++word)
            patptr->pattern.data[word] |= DDAB_TEST_LODATA << 8;
          (void)pac_write_pattern(pattern_no, patptr);
          memptr += 7;
          *memptr++ |= fback_edge;
          pattern_no += 8;
        }
        break;
      case 512:    /* Place one clock command and branch near end of block */
        pattern_no = (2 * BLOCK_SIZE) - 8;
        (void)pac_read_pattern(pattern_no, patptr);
        for(word = 0; word < 5; ++word)
          patptr->pattern.data[word] |= DDAB_TEST_LODATA << 8;
        (void)pac_write_pattern(pattern_no, patptr);
        memptr += (2 * BLOCK_SIZE) - 1;
        *memptr |= fback_edge;
        break;
      default:
        (void)pel_error("Software failure - feedback sequence length invalid.\n");
        return(0);
    }
    /* Find out size of PAM $0 and copy first two blocks appropriate number */
    /* of times */
    switch(pac_get_pam_size(current_lane, 0))
    {
      case PATTERNS_IN_128K:
        return(2);                  /* Done - already filled two blocks */
      case PATTERNS_IN_512K:
        blocks_filled = 4;
        break;
      case PATTERNS_IN_2M:
        blocks_filled = 8;
        break;
      default:
        (void)pel_error("Pattern memory size not valid.\n");
        return(0);
    }
    /* Now copy the first two blocks (blocks_filled/2) number of times */
    for(i = 0; i <= (blocks_filled >> 3); ++i)
    {
      if(pel_copy_pat_mem(0, (2 * BLOCK_SIZE) << i, (2 * BLOCK_SIZE) << i)
       != SUCCESS)
      {
        (void)pel_error("Unable to copy pattern memory.\n");
        return(0);
      }
    }
    return(blocks_filled);
}

int
pel_copy_pat_mem(from_pattern, to_pattern, num_patterns)
register int from_pattern;
register int to_pattern;
register int num_patterns;
{
    PAT_WORD pattern_word, *patptr = &pattern_word;
    register int pattern_no;

    if((pac_fill_check(from_pattern, num_patterns) != SUCCESS) ||
     (pac_fill_check(to_pattern, num_patterns) != SUCCESS))
      return(FAILURE);

    for(pattern_no = 0; pattern_no < num_patterns; ++pattern_no)
    {
      (void)pac_read_pattern(pattern_no + from_pattern, patptr);
      (void)pac_write_pattern(pattern_no + to_pattern, patptr);
    }
    return(SUCCESS);
}

pel_feedback_test()
{
    PEL *pel = (PEL *)(pel_addr(current_lane, current_pel));
    int returncode = SUCCESS;
    int i;
    int preamble_length;
    int postamble_length;
    char amble_buffer[256];
    int num_blocks;
    int  patterns;
    int  added_patterns;
    int  nops;
    int ptr_offset;
    int crc_result;
    long *memptr;
    int dummy;

    if(diag_clear_errors() != SUCCESS)
      return(FAILURE);

    /* Initialize the PEL and the Diagnostic DAB */
    if(pel_crc_setup() != SUCCESS)
    {
      (void)pel_error("Unable to perform feedback test.\n");
      return(FAILURE);
    }

    /* First place a feedback sequence starting at block 0 in pattern memory */
    if((num_blocks = pel_build_crc_fback(current_pel, BRANCH_FALLING, 0)) == 0)
      return(FAILURE);


    /* Next, place the CRC preamble and postamble in pattern memory */
    /* Set the memory pointer to the beginning of pattern memory, bank 2 */
    memptr = (long *)Pattern_to_address(current_lane, 2, 0l);
    /* First, add the preamble */
    preamble_length = generate_preamble(amble_buffer, 0, 0);
    if(build_pattern_data(amble_buffer, num_blocks * BLOCK_SIZE) == 0)
    {
      (void)pel_error("Unable to build preamble pattern data.\n");
      return(FAILURE);
    }
    /* Now we add patterns to write a one into the CRC circuit */
    if(build_pattern_data(FBACK_LOAD, (num_blocks * BLOCK_SIZE) +
```

Copyright 1989 Logic Modeling Systems

SOURCE PROGRAM diags/pel_crc.c

DATE 5/23/89 TIME 4:41:26 pm

PAGE # 6/115

SOURCE TEXT

```
 preamble_length) == 0)
{
  (void)pel_error("Unable to add feedback load patterns to preamble.\n");
  return(FAILURE);
}
preamble_length += FBACK_LOAD_SIZE;
/* Add at least 8 NOP patterns to end of preamble */
added_patterns = 8;
/* Add a branch always command to the preamble block */
ptr_offset = preamble_length + added_patterns - BRANCH_LATENCY;
if((nops = 1 - ptr_offset) > 0)
{
  added_patterns += nops;
  ptr_offset += nops;
}
if((ptr_offset & 1) == 0)
{
  ++added_patterns;
  ++ptr_offset;
}
/* Add NOP patterns to end of preamble */
if(pel_fill_crc((num_blocks * BLOCK_SIZE) + preamble_length,
 added_patterns, current_pel, DDAB_TEST_LODATA_NO_CLK, 0, 0) != SUCCESS)
{
  (void)pel_error("Unable to add NOP patterns to preamble.\n");
  return(FAILURE);
}
preamble_length += added_patterns;
*(memptr + (num_blocks * BLOCK_SIZE) + ptr_offset) |= BRANCH_ALWAYS;

/* Now, add the postamble */
postamble_length = generate_postamble(amble_buffer, 0);
added_patterns = ((ptr_offset = postamble_length - STOP_LATENCY) < 0) ?
 -ptr_offset : 0;
if(added_patterns > 0)        /* Add NOP patterns to beginning of postamble */
{
  if(pel_fill_crc((num_blocks + 1) * BLOCK_SIZE, added_patterns, current_pel,
   DDAB_TEST_LODATA_NO_CLK, 0, 0) != SUCCESS)
  {
    (void)pel_error("Unable to add NOP patterns to postamble.\n");
    return(FAILURE);
  }
}
if(build_pattern_data(amble_buffer, ((num_blocks + 1) * BLOCK_SIZE) +
 added_patterns) == 0)
{
  (void)pel_error("Unable to build postamble pattern data.\n");
  return(FAILURE);
}
postamble_length += added_patterns;
*(memptr + ((num_blocks + 1) * BLOCK_SIZE) + ptr_offset + added_patterns) |=
 STOP;

/* Load the link table */
memptr = (long *)(pac[current_lane].lane_offset + LINK_OFFSET);
*memptr = num_blocks + 1;
memptr += num_blocks;
*memptr = 0;

Pac_clock_speed(current_lane, PAC_MIN_PERIOD);
for(i = 0; i < 2; ++i)
{
  /* Check for backplane errors */
  if(report_bp_error() != 0)
  {
    (void)pel_error("Backplane errors - can't initiate play.\n");
    return(FAILURE);
  }
  pac_set_first_block(Lane_code(current_lane), num_blocks);
  /* Play the pattern (should time out) */
  if(tmg_initiate_play() != SUCCESS)
  {
    pac_play_cleanup();
    return(FAILURE);
  }
  lm_delay(1);          /* Wait 5ms (plenty of time at 25 MHz) */
  if(Bp_mode() != PLAY_MODE)  /* Should still be in play mode */
  {
    returncode = FAILURE;
    if(lm_error("Pattern play completed - expected time out.\n") != SUCCESS)
      return(FAILURE);
  }
  else
  {
    if(pac_abort_play() != SUCCESS)
    {
      pac_play_cleanup();
      return(FAILURE);
    }
  }
  if(i == 1)
    break;
  /* Now place a rising feedback sequence in pattern memory */
  if(pel_build_crc_fback(current_pel, BRANCH_RISING, 0) != num_blocks)
    return(FAILURE);
}

for(i = 0; i < 2; ++i)

  /* Place an 8-cycle feedback sequence in pattern memory */
  if(pel_build_crc_fback(current_pel, i ? BRANCH_RISING : BRANCH_FALLING, 8)
   != num_blocks)
    return(FAILURE);
  pac_set_first_block(Lane_code(current_lane), num_blocks);
  if(pac_play(TIMEOUT) != SUCCESS)
  {
    (void)pel_error("Pattern play failed during 8-cycle feedback.\n");
    return(FAILURE);
  }
  /* Read CRC result and compare with expected */
  crc_result = pel->magic_chip[0].reg[11] & 0xff;
  if(crc_result != (i ? RISING_8_CRC : FALLING_8_CRC))
  {
    returncode = FAILURE;
    if(lm_error("CRC result does not match. Expected %02X. Actual %02X.\n",
     i ? RISING_8_CRC : FALLING_8_CRC, crc_result) != SUCCESS)
      return(FAILURE);
  }
}
if(pel_set_diag_dab_period(PAC_MAX_PERIOD * 1000) != SUCCESS)
```

Copyright 1989 Logic Modeling Systems

SOURCE PROGRAM diags/pel_crc.c

DATE 5/23/89 TIME 4:41:26 pm

LINE # SOURCE TEXT

```
    {
      (void)pel_error("Unable to set clock to min frequency in feedback test.\n");
      return(FAILURE);
    }
    Pac_clock_speed(current_lane, PAC_MAX_PERIOD);

    for(i = 0; i < 2; ++i)
    {
      /* Place a 512-cycle feedback sequence in pattern memory */
      if(pel_build_crc_fback(current_pel, i ? BRANCH_RISING : BRANCH_FALLING, 512)
       != num_blocks)
        return(FAILURE);
      patterns = preamble_length + postamble_length + BRANCH_LATENCY - 1 +
       (2 * BLOCK_SIZE) * (i ? 16 : 17);
      pac_set_first_block(Lane_code(current_lane), num_blocks);
      if(pac_timed_play(PAC_MAX_PERIOD, patterns, &dummy) != SUCCESS)
      {
        returncode = FAILURE;
        if(lm_error("Timed pattern play failed during 512-cycle feedback.\n")
         != SUCCESS)
          return(FAILURE);
      }
      /* Read CRC result and compare with expected */
      crc_result = pel->magic_chip[0].reg[11] & 0xff;
      if(crc_result != (i ? RISING_512_CRC : FALLING_512_CRC))
      {
        returncode = FAILURE;
        if(lm_error("CRC result does not match. Expected %02X. Actual %02X.\n",
         i ? RISING_512_CRC : FALLING_512_CRC, crc_result) != SUCCESS)
          return(FAILURE);
      }
    }

  return(returncode);
}



set_user_bit(pattern_no, value)
{
    PAT_WORD pattern_word;

    (void)pac_read_pattern(pattern_no, &pattern_word);
    pattern_word.pattern.user = value;
    (void)pac_write_pattern(pattern_no, &pattern_word);
}



#define INUSELED_MASK    0x8000
#define KEEPALIVE_MASK   0x4000
#define CLK1MHZ_MASK     0x2000
#define CLK10MHZ_MASK    0x1000
#define USER_MASK        0x0f00
#define KEEPALIVE_PATTERN       "x2f5f5x5f5f5f5f5x5x5x5x5x1u5x5x5x5x5x5x5f5f5f5f5f6x7x7"
#define MAX_CLK1MHZ_ATTEMPTS    100
#define MAX_CLK10MHZ_ATTEMPTS   50

pel_keepalive_test()
{
    static long edgetime[6] = {
        100001, 100001, 100001, 100001, 100001, 100001
    };
    static long period = 40000l;
    int pac_replay();
    register PEL *pel
        = (PEL *)(pel_addr(current_lane, current_pel));
    u_short pattern[5];
    int attempts, differences, found_a_0, found_a_1;
    int errors = 0;

    if(diag_clear_errors() != SUCCESS)
        return(FAILURE);

    if (set_vlogl(0.8) == FAILURE) return(FAILURE);
    if (set_vlogh(2.0) == FAILURE) return(FAILURE);
    if (set_vlth(0.3) == FAILURE) return(FAILURE);
    if (set_val(0.4) == FAILURE) return(FAILURE);
    if (set_vah(3.0) == FAILURE) return(FAILURE);
    if (set_vhth(4.4) == FAILURE) return(FAILURE);

    if (pel_lane_init() != SUCCESS) {   /* set up pac/tmg/pel/dab */
        (void)lm_error("Unable to initialize lane %c\n", current_lane + 'A');
        return(FAILURE);
    }

    if(pel_diag_dab_test_init(PUBLIC_DAB) != SUCCESS) {
        (void)pel_error("Unable to initialize PEL/DAB for keepalive/trigger bit test.\n");
        return(FAILURE);
    }

    if (tmg_set_timing(period, edgetime, 0l, 100000l, 2500000l) != SUCCESS) {
      return FAILURE;
    }

    /*
     * 1. Verify that nothing is driving bus<16..1>
     */
    if (pel_play_pattern_string( "z2z2z2z7", 0) != SUCCESS) {
        (void)pel_error("Unable to play keepalive/trigger bit test pattern.\n");
        return (FAILURE);
    }
    pattern[4] = pattern[3] = pattern[2] = pattern[1] = pattern[0] = 0x0000;
    if (compare_magic_chips(11, pattern) != SUCCESS) {          /* VALUE SAMPLE */
        (void)pel_error("Failed buffer HIZ test.\n");
        errors++;
    }


    /*
     *  2. Verify USER=1, INUSE LED*=0, KEEPALIVE*=1, CLK 10MHZ=1 and CLK 1MHZ=1
     */
    pel->csr.bit.eeprom_sel = 1;
    pel->csr.bit.in_use_led = 1;
    if (pel_load_pattern_string(KEEPALIVE_PATTERN, 0, STOP_MODE) == FAILURE) {
        (void)pel_error("Unable to load keepalive/trigger bit test pattern.\n");
        return (FAILURE);
    }
    (void)set_user_bit(strlen(KEEPALIVE_PATTERN)/2 - 1, 1);
    if(diag_play() != SUCCESS) {
```

Copyright 1989 Logic Modeling Systems

SOURCE PROGRAM diags/pel_crc.c

DATE 5/23/89 TIME 4:41:26 pm

SOURCE TEXT

```
            (void)pel_error("Unable to play keepalive/trigger bit test pattern.\n");
            return(FAILURE);
        }
        if ((pel->magic_chip[0].m.logic_sample & INUSELED_MASK) != 0) {
            (void)pel_error("IN USE LED not functional.\n");
            errors++;
        }
        if ((pel->magic_chip[0].m.logic_sample & USER_MASK) != USER_MASK) {
            (void)pel_error("USER TRIGGER bit not functional.\n");
            errors++;
        }
        if ((pel->magic_chip[0].m.logic_sample & KEEPALIVE_MASK) != KEEPALIVE_MASK) {
            (void)pel_error("KEEPALIVE* bit not functional.\n");
            errors++;
        }
        if ((pel->magic_chip[0].m.logic_sample & CLK1MHZ_MASK) != CLK1MHZ_MASK) {
            (void)pel_error("CLK 1MHZ bit not functional.\n");
            errors++;
        }
        if ((pel->magic_chip[0].m.logic_sample & CLK10MHZ_MASK) != CLK10MHZ_MASK) {
            (void)pel_error("CLK 10MHZ bit not functional.\n");
            errors++;
        }


        /*
         * 3. Verify USER=0, INUSE LED*=1 and KEEPALIVE*=0
         */
        pel->car.bit.in_use_led = 0;
        if (pel_play_pattern_string( "z2z2z2z7", 0) != SUCCESS) {
            (void)pel_error("Unable to play keepalive/trigger bit test pattern.\n");
            return (FAILURE);
        }
        if ((pel->magic_chip[0].m.logic_sample & INUSELED_MASK) != INUSELED_MASK) {
            (void)pel_error("IN USE LED not functional.\n");
            errors++;
        }
        if ((pel->magic_chip[0].m.logic_sample & USER_MASK) != 0) {
            (void)pel_error("USER TRIGGER bit not functional.\n");
            errors++;
        }
        if ((pel->magic_chip[0].m.logic_sample & KEEPALIVE_MASK) != 0) {
            (void)pel_error("KEEPALIVE* bit not functional.\n");
            errors++;
        }


        /*
         * 4. Verify that CLK10 MHZ toggles
         */
        attempts = 0;
        found_a_0 = FALSE;
        found_a_1 = FALSE;
        while (++attempts <= MAX_CLK10MHZ_ATTEMPTS && (!found_a_0 || !found_a_1)) {
            if (diag_play() != SUCCESS) {
                (void)pel_error("Unable to play keepalive/trigger bit test pattern.\n");
                return (FAILURE);
            }
            if ((pel->magic_chip[0].m.ttl_sample & CLK10MHZ_MASK) == 0) {
                found_a_0 = TRUE;
            } else {
                found_a_1 = TRUE;
            }
        }
        if (--attempts == MAX_CLK10MHZ_ATTEMPTS) {
            (void)lm_error("CLK 10MHZ bit not functional in %d attempts.\n", attempts);
            errors++;
        } else {
            (void)lm_message("It took %d attempts to verify that CLK 10MHZ toggles.\n", attempts);
        }


        /*
         * 5. Verify that CLK1 MHZ is approximately the right frequency
         */

        /* first see if CLK 1MHZ toggles     */
        attempts = 0;
        found_a_0 = FALSE;
        found_a_1 = FALSE;
        while (++attempts <= MAX_CLK1MHZ_ATTEMPTS && (!found_a_0 || !found_a_1)) {
            if (diag_play() != SUCCESS) {
                (void)pel_error("Unable to play keepalive/trigger bit test pattern.\n");
                return (FAILURE);
            }
            if ((pel->magic_chip[0].m.ttl_sample & CLK1MHZ_MASK) == 0) {
                found_a_0 = TRUE;
            } else {
                found_a_1 = TRUE;
            }
        }
        if (--attempts == MAX_CLK1MHZ_ATTEMPTS) {
            (void)lm_error("CLK 1MHZ bit not functional in %d attempts.\n", attempts);
            errors++;
        } else {
            (void)lm_message("It took %d attempts to verify that CLK 1MHZ toggles.\n", attempts);
        }

        /*
         * Measure CLK 1MHZ frequency crudely
         *
         *      note: It is important that the keepalive clocks get turned off before they get turned on
         *             to verify that they start up both quickly and correctly.
         */
        attempts = 0;
        differences = 0;
        for (attempts = 0; attempts < MAX_CLK1MHZ_ATTEMPTS; attempts++) {
            pel->car.bit.private = 1;
            if (pel_play_pattern_string( "z2z2z7z7", 0) != SUCCESS) {       /* turn off clocks      */
                (void)pel_error("Unable to play keepalive/trigger bit test pattern.\n");
                return (FAILURE);
            }
            lm_delay(1);                         /* make keepalive clocks stay off for a while   */
            pel->car.bit.private = 0;
            if (pel_play_pattern_string( "z2z2z2z7", 0) != SUCCESS) {       /* turn on clocks       */
                (void)pel_error("Unable to play keepalive/trigger bit test pattern.\n");
                return (FAILURE);
            }
            if ((pel->magic_chip[0].m.ttl_sample & CLK1MHZ_MASK) != (pel->magic_chip[0].m.logic_sample & CLK1MHZ_MASK)) {
                differences++;
```

Copyright 1989
Logic Modeling Systems

| SOURCE PROGRAM | DATE | PAGE # |
|---|---|---|
| diags/pel_crc.c | 5/23/89 TIME 4:41:26 pm | 9/118 |

LINE # SOURCE TEXT

```
            }
        }
        if ((differences * 100) / attempts > 50) {
            pel_error("CLK 1MHZ is off frequency\n");
            errors++;
        }
        lm_message("For CLK 1MHZ found %d differences in %d attempts\n", differences, attempts);

        return errors ? FAILURE : SUCCESS;
}
```

Copyright 1989
Logic Modeling Systems

| SOURCE PROGRAM | DATE | PAGE # |
|---|---|---|
| diags/pel_edge.c | 5/23/89 | 1/119 |
| | TIME 4:41:27 pm | |

LINE # SOURCE TEXT

```
/* SCCS_ID: pel_edge.c rev 3.1, 4/24/89 at 07:49:55     */

/*********************************************************************
 *                                                                   *
 *      EDGE routines                                                *
 *      used in PEL diagnostics                                      *
 *                                                                   *
 *********************************************************************/

#include "common.h"
#include "mod_def.h"
#include "modeler_extn.h"
#include "vrtx.h"
#include "lm_diags.h"
#include "tmg.h"
#include "tmg_extn.h"
#include "pac.h"
#include "pac_def.h"
#include "pac_extn.h"
#include "magic.h"
#include "pel.h"


#define  EDGE_TEST_PREAMBLE     "z2f5z5z5A5f5f5f505z5z5z5z1u5a5h5a5h5z5f5f5f5f5f5"
#define  EDGE_TEST_PATTERN      "z2z2z2f7"
#define  EDGE_TEST_PERIOD       100000


/*
 * EDGE Tests:
 */
pel_edge()
{
    register PEL *pel = (PEL *)(pel_addr(current_lane, current_pel));
    static long edgetime[6] = {
        10000, 20000, 30000, 40000, 50000, 60000
    };
    long temp;
    static long period = EDGE_TEST_PERIOD;
    u_short pattern[5];
    short test, edge;
    int   errors;

    static short result[6] = {
        0xeeee, 0xcccc, 0x9999, 0x3333, 0x7777, 0xffff};

    if(diag_clear_errors() != SUCCESS)
      return(FAILURE);

    errors = 0;

    if (pel_lane_init() != SUCCESS) {    /* set up pac/tmg/pel/dab        */
        (void)lm_error("Unable to initialize lane %c\n", current_lane + 'A');
        return(FAILURE);
    }
    pel->car.bit.resetL = 0;             /* disable backplane errors      */

    if (tmg_set_timing(period, edgetime, 01, 1000001, 25000001) != SUCCESS) {
      return FAILURE;
    }

    /*
     *  Set up MAGIC Control register and turn off MAGIC output enables
     *
     *  Repeat for all nibbles:
     *          DUT<0>:    RZ    SET(2)    RESET(0)
     *          DUT<1>:    RZ    SET(3)    RESET(1)
     *          DUT<2>:    RZ    SET(4)    RESET(2)
     *          DUT<3>:    RZ    SET(5)    RESET(3)
     */
    if (pel_play_pattern_string(EDGE_TEST_PREAMBLE, 0) != SUCCESS) {
        (void)pel_error("Failure to play EDGE test preamble");
        return (FAILURE);
    }

    for (test = 0; test < 6; test++) {
        temp = edgetime[0];
        edgetime[0] = edgetime[5];
        edgetime[5] = edgetime[4];
        edgetime[4] = edgetime[3];
        edgetime[3] = edgetime[2];
        edgetime[2] = edgetime[1];
        edgetime[1] = temp;

        if (tmg_set_timing(period, edgetime, 01, 1000001, 25000001) != SUCCESS) {
            return(FAILURE);
        }

        if (pel_play_pattern_string(EDGE_TEST_PATTERN, 0) != SUCCESS) {
            (void)pel_error("Failure to play EDGE test pattern");
            return (FAILURE);
        }

        pattern[4] = pattern[3] = pattern[2] = pattern[1] = pattern[0]
            = result[test];
        if (compare_magic_chips(0, pattern) != SUCCESS) {
            errors++;
        }
    }

    return errors ? FAILURE : SUCCESS;
}




pattern_word_rotate(pattern_no)
int pattern_no;
{
    PAT_WORD pattern_word, *patptr = &pattern_word;
    int tmp;

    (void)pac_read_pattern(pattern_no, patptr);
    tmp = patptr->pattern.data[0];
    patptr->pattern.data[0] = patptr->pattern.data[1];
    patptr->pattern.data[1] = patptr->pattern.data[2];
    patptr->pattern.data[2] = patptr->pattern.data[3];
    patptr->pattern.data[3] = patptr->pattern.data[4];
    patptr->pattern.data[4] = tmp;
    (void)pac_write_pattern(pattern_no, patptr);
```

Copyright 1989 Logic Modeling Systems

| SOURCE PROGRAM | DATE | PAGE # |
|---|---|---|
| diags/pel_edge.c | 5/23/89 | 2/120 |
| | TIME 4:41:27 pm | |

LINE # SOURCE TEXT

```
}



struct soft_driver_test {
    char *driver;
    short result;
    char *pattern;
};

struct soft_driver_test Soft_Driver_Tests[] = {
    {"200uA Low  (LSB)", 0x0200, "z2f5f5z5A5f5f5f515z5z5z5zlu5f5f5f5f5f5f5f5z5f5f6r7z6r7H7"},
    {"200uA Low  (LSB)", 0x02ff, "z2f5f5z5A5f5f5f5z515z5z5zlu5f5f5f5f5f5f5f5z5f5f6r7z6r7H7"},
    {"500uA Low  (LSB)", 0x0200, "z2f5f5z5f5A5f5f515z5z5z5zlu5f5f5f5f5f5f5f5z5f5f6r7z6r7H7"},
    {"500uA Low  (LSB)", 0x02ff, "z2f5f5z5f5A5f5f51515z5z5zlu5f5f5f5f5f5f5f5z5f5f6r7z6r7H7"},
    {"1.2mA Low  (LSB)", 0x0200, "z2f5f5z5f5f5A5f51515z5z5zlu5f5f5f5f5f5f5f5z5f5f6r7z6r7H7"},
    {"1.2mA Low  (LSB)", 0x02ff, "z2f5f5z5f5f5A5f5z51515z5zlu5f5f5f5f5f5f5f5z5f5f6r7z6r7H7"},
    {"3.0mA Low  (LSB)", 0x0200, "z2f5f5z5f5f5f5A515z5z515zlu5f5f5f5f5f5f5f5z5f5f6r7z6r7H7"},
    {"3.0mA Low  (LSB)", 0x02ff, "z2f5f5z5f5f5f5A5z5151515zlu5f5f5f5f5f5f5f5z5f5f6r7z6r7H7"},

    {"100uA High (LSB)", 0x02ff, "z2f5f5z505f5f5f505z5z5z5zlu5f5f5f5f5f5f5f5z5f5f6r7z6r7I7"},
    {"100uA High (LSB)", 0x0200, "z2f5f5z5B5f5f5f505z5z5z5zlu5f5f5f5f5f5f5f5z5f5f6r7z6r7I7"},
    {"500uA High (LSB)", 0x02ff, "z2f5f5z5B5f5f5f5z505z5z5zlu5f5f5f5f5f5f5f5z5f5f6r7z6r7I7"},
    {"500uA High (LSB)", 0x0200, "z2f5f5z5B5B5f5f5z505z5z5zlu5f5f5f5f5f5f5f5z5f5f6r7z6r7I7"},
    {"1.2mA High (LSB)", 0x02ff, "z2f5f5z5B5B5f5f5z5z505z5zlu5f5f5f5f5f5f5f5z5f5f6r7z6r7I7"},
    {"1.2mA High (LSB)", 0x0200, "z2f5f5z5f5B5B5f5z5z505z5zlu5f5f5f5f5f5f5f5z5f5f6r7z6r7I7"},
    {"2.0mA High (LSB)", 0x02ff, "z2f5f5z5B5f5B5f5z5z5z505zlu5f5f5f5f5f5f5f5z5f5f6r7z6r7I7"},
    {"2.0mA High (LSB)", 0x0200, "z2f5f5z5f5f5f5B5z5z5z505zlu5f5f5f5f5f5f5f5z5f5f6r7z6r7I7"},

    {"200uA Low  (MSB)", 0x00ff, "z2f5f5z5A5f5f5f515z5z5z5zlu5f5f5f5f5f5f5f5z5f5f6f7z6f7J7"},
    {"200uA Low  (MSB)", 0xffff, "z2f5f5z5A5f5f5f5z515z5z5zlu5f5f5f5f5f5f5f5z5f5f6f7z6f7J7"},
    {"500uA Low  (MSB)", 0x00ff, "z2f5f5z5f5A5f5f515z5z5z5zlu5f5f5f5f5f5f5f5z5f5f6f7z6f7J7"},
    {"500uA Low  (MSB)", 0xffff, "z2f5f5z5f5A5f5f51515z5z5zlu5f5f5f5f5f5f5f5z5f5f6f7z6f7J7"},
    {"1.2mA Low  (MSB)", 0x00ff, "z2f5f5z5f5f5A5f51515z5z5zlu5f5f5f5f5f5f5f5z5f5f6f7z6f7J7"},
    {"1.2mA Low  (MSB)", 0xffff, "z2f5f5z5f5f5A5f5z51515z5zlu5f5f5f5f5f5f5f5z5f5f6f7z6f7J7"},
    {"3.0mA Low  (MSB)", 0x00ff, "z2f5f5z5f5f5f5A515z5z515zlu5f5f5f5f5f5f5f5z5f5f6f7z6f7J7"},
    {"3.0mA Low  (MSB)", 0xffff, "z2f5f5z5f5f5f5A5z5151515zlu5f5f5f5f5f5f5f5z5f5f6f7z6f7J7"},

    {"100uA High (MSB)", 0xffff, "z2f5f5z5V5f5f5f505z5z5z5zlu5f5f5f5f5f5f5f5z5f5f6f7z6f7K7"},
    {"100uA High (MSB)", 0x00ff, "z2f5f5z5B5f5f5f505z5z5z5zlu5f5f5f5f5f5f5f5z5f5f6f7z6f7K7"},
    {"500uA High (MSB)", 0xffff, "z2f5f5z5B5f5f5f5z505z5z5zlu5f5f5f5f5f5f5f5z5f5f6f7z6f7K7"},
    {"500uA High (MSB)", 0x00ff, "z2f5f5z5B5B5f5f5z505z5z5zlu5f5f5f5f5f5f5f5z5f5f6f7z6f7K7"},
    {"1.2mA High (MSB)", 0xffff, "z2f5f5z5B5B5f5f5z5z505z5zlu5f5f5f5f5f5f5f5z5f5f6f7z6f7K7"},
    {"1.2mA High (MSB)", 0x00ff, "z2f5f5z5f5B5B5f5z5z505z5zlu5f5f5f5f5f5f5f5z5f5f6f7z6f7K7"},
    {"2.0mA High (MSB)", 0xffff, "z2f5f5z5B5f5B5f5z5z5z505zlu5f5f5f5f5f5f5f5z5f5f6f7z6f7K7"},
    {"2.0mA High (MSB)", 0x00ff, "z2f5f5z5f5f5f5B5z5z5z505zlu5f5f5f5f5f5f5f5z5f5f6f7z6f7K7"},
    0
};

struct medium_driver_test {
    char *driver;
    short result;
    char *pattern;
};

struct medium_driver_test Medium_Driver_Tests[] = {
    {"Med High (LSB)", 0x02ff, "z2f5f5z505f505f5z5z5z5z5zlu5f5f5f5z5f5A5f5A5f5f6r7z6r7I7"},
    {"Med High (LSB)", 0x0200, "z2f5f5z5f5f5f505z5z5z5z5zlu5f5f5f5z5f5A5f5A5f5f6r7z6r7I7"},
    {"Med Low  (LSB)", 0x0200, "z2f5f5z5f5f5f5f5z5z5A5A5zlu5f5f5f5z5f5A5f5A5f5f6r7z6r7H7"},
    {"Med Low  (LSB)", 0x02ff, "z2f5f5z5f5f5f5f5A5A5z5A5zlu5f5f5f5z5f5A5B5A5f5f6r7z6r7H7"},

    {"Med High (MSB)", 0xffff, "z2f5f5z505f505f5z5z5z5z5zlu5f5f5f5z5f5A5f5A5f5f6f7z6f7K7"},
    {"Med High (MSB)", 0x00ff, "z2f5f5z5f5f5f505z5z5z5z5zlu5f5f5f5z5f5A5f5A5f5f6f7z6f7K7"},
    {"Med Low  (MSB)", 0x00ff, "z2f5f5z5f5f5f5f5z5z5A5A5zlu5f5f5f5z5f5A5f5A5f5f6f7z6f7J7"},
    {"Med Low  (MSB)", 0xffff, "z2f5f5z5f5f5f5f5A5A5z5A5zlu5f5f5f5z5f5A5B5A5f5f6f7z~f7J7"},
    0
};


pel_driver_test()
{
    struct soft_driver_test *soft_driver_test;
    struct medium_driver_test *medium_driver_test;

    static long edgetime[6] = {
        0l, 15000l, 15000l, 15000l, 15000l, 15000l
    };
    static long period = 40000l;
    register PEL *pel
        = (PEL *)(pel_addr(current_lane, current_pel));
    u_short pattern[5];
    float dutvcc;
    int magic;
    int return_status = SUCCESS;
    static char format[]
        = "Lane %c pel %d: Magic chip %d with %d failed %s test.\n";

    if(diag_clear_errors() != SUCCESS)
        return(FAILURE);

    if (pel_dab_init(PUBLIC_DAB) != SUCCESS) {
        (void)pel_error("Unable to initialize Diagnostic DAB\n");
        return(FAILURE);
    }

    if (set_vlogl(0.8) == FAILURE) return(FAILURE);
    if (set_vlogh(2.5) == FAILURE) return(FAILURE);
    if (set_vlth(0.3) == FAILURE) return([illegible]AILURE);
    if (set_vsl(0.0) == FAILURE) return([illegible]URE);
    get_dutvcc(&dutvcc);
    if (set_vsh(dutvcc - 0.05) == FAILURE) return(FAILURE);     /* make sure it is not out of range     */
    if (set_vhth(4.4) == FAILURE) return(FAILURE);

    if (tmg_set_timing(period, edgetime, 0l, 100000l, 10000000l) != SUCCESS) {
      return FAILURE;
    }


    /*
     *  Test all soft-drivers
     */
    lm_message("Testing Soft Drivers");
    for (soft_driver_test = Soft_Driver_Tests; soft_driver_test->driver; ++soft_driver_test) {
        lm_message(".");
        pattern[4] = pattern[3] = pattern[2] = pattern[1] = pattern[0] = soft_driver_test->result.
        if (pel_play_pattern_string(soft_driver_test->pattern, 0) != SUCCESS) {
            (void)pel_error("Unable to play driver test pattern.\n");
            return (FAILURE);
        }
        if (compare_magic_chips(1l, pattern) != SUCCESS) {              /* value */
```

Copyright 1989 Logic Modeling Systems

| SOURCE PROGRAM | DATE | PAGE # |
|---|---|---|
| diags/pel_edge.c | 5/23/89 | 3/121 |
| | TIME 4:41:27 pm | |

SOURCE TEXT

```
                return_status = FAILURE;
                if (lm_error(format,
                    current_lane + 'A', current_pel,
                    0, 1, soft_driver_test->driver) != SUCCESS) {
                    return(FAILURE);
                }
            }
            for (magic = 1; magic < 5; magic++) {
                pattern_word_rotate(4);
                pattern_word_rotate(5);
                pattern_word_rotate(6);
                pattern_word_rotate(7);
                pattern_word_rotate(8);
                pattern_word_rotate(9);
                pattern_word_rotate(10);
                pattern_word_rotate(11);
                pattern_word_rotate(28);
                if (diag_play() == FAILURE) {
                    (void)pel_error("Unable to play driver test pattern.\n");
                    return(FAILURE);
                }
                if (compare_magic_chips(11, pattern) != SUCCESS) {          /* value */
                    return_status = FAILURE;
                    if (lm_error(format,
                        current_lane + 'A', current_pel,
                        magic, (magic + 1) % 5,
                        soft_driver_test->driver) != SUCCESS) {
                        return(FAILURE);
                    }
                }
            }
        }
        lm_message("done.\n");


        /*
         *  Test all medium drivers
         */

        if (tmg_set_timing(period, edgetime, 0l, 1000001, 100000001) != SUCCESS) {
            return FAILURE;
        }

        lm_message("Testing Medium Drivers");
        for (medium_driver_test = Medium_Driver_Tests; medium_driver_test->driver; ++medium_driver_test) {
            lm_message(".");
            pattern[4] = pattern[3] = pattern[2] = pattern[1] = pattern[0] = medium_driver_test->result;
            if (pel_play_pattern_string(medium_driver_test->pattern, 0) != SUCCESS) {
                (void)pel_error("Unable to play driver test pattern.\n");
                return (FAILURE);
            }
            if (compare_magic_chips(11, pattern) != SUCCESS) {              /* value */
                return_status = FAILURE;
                if (lm_error("Lane %c pel %d: Magic chip 0 failed %s test.\n",
                    current_lane + 'A', current_pel,
                    medium_driver_test->driver) != SUCCESS) {
                    return(FAILURE);
                }
            }
            for (magic = 1; magic < 5; magic++) {
                pattern_word_rotate(4);
                pattern_word_rotate(5);
                pattern_word_rotate(6);
                pattern_word_rotate(7);
                pattern_word_rotate(8);
                pattern_word_rotate(9);
                pattern_word_rotate(10);
                pattern_word_rotate(11);
                pattern_word_rotate(20);
                pattern_word_rotate(21);
                pattern_word_rotate(22);
                pattern_word_rotate(28);
                if (diag_play() == FAILURE) {
                    (void)pel_error("Unable to play driver test pattern.\n");
                    return(FAILURE);
                }
                if (compare_magic_chips(11, pattern) != SUCCESS) {          /* value */
                    return_status = FAILURE;
                    if (lm_error("Lane %c pel %d: Magic chip %d failed %s test.\n",
                        current_lane + 'A', current_pel,
                        magic,
                        medium_driver_test->driver) != SUCCESS) {
                        return(FAILURE);
                    }
                }
            }
        }
        lm_message("done.\n");

        return(return_status);
}
```

Copyright 1989
Logic Modeling Systems

| SOURCE PROGRAM | DATE | 5/23/89 | PAGE # |
|---|---|---|---|
| diags/pel_err.c | TIME | 4:41:27 pm | 1/122 |

SOURCE TEXT

```
/* SCCS_ID: pel_err.c rev 1.1, 4/24/89 at 07:49:58     */

#include "common.h"
#include "mod_def.h"
#include "modeler_exts.h"
#include "magic.h"
#include "pel.h"

pel_error_test()
{
        /* This test simulates the insertion and removal of an adapter. */
        /* On the diagnostic dab, EEIN is connected to PRESENT*. */
        /* If EEIN is high, adapter is removed. */
        /* If EEIN is low, adapter is inserted. */
        /* Check 1 (reset):              car = f922 */
        /* Check 2 (insertion):          car = f502 */
        /* Check 3 (initialization): car = ff12 */
        /* Check 4 (removal):            car = f132 */
        /* Check 5 (play error):         car = e122 */

        register PEL *pel = (PEL *)(pel_addr(current_lane, current_pel));
        register long retval = SUCCESS;
        char *error_format =
                "%s:playerror=%d error=%d(%d) present=%d(%d) active=%d(%d)\n";

        if(diag_clear_errors() != SUCCESS)
          return(FAILURE);

        if (pel_lane_init() != SUCCESS) {  /* set up pac/tmg/pel/dab */
                (void)lm_error("Unable to initialize lane %c\n",
                 current_lane + 'A');
                return(FAILURE);
        }

        pel->car.reg = 0; /* start in a known (default) state */
        pel->car.bit.eeprom_in = 1; /* diag dab not present */
        pel_clear_pel_errors();
        lm_message("Check 1 (reset):            car = %04x\n", pel->car.reg);
        if ((pel->car.reg) != 0xf922) {
                (void)lm_error(error_format, "Reset check",
                        pel->car.bit.play_errorL, 1,
                        pel->car.bit.errorL, 1,
                        pel->car.bit.present, 0,
                        pel->car.bit.active, 0);
                retval = FAILURE;
        }
        pel->car.bit.eeprom_in = 0; /* diag dab present */
        lm_message("Check 2 (insertion):        car = %04x\n", pel->car.reg);
        if ((pel->car.reg) != 0xf502) {
                (void)lm_error(error_format, "Insertion check",
                        pel->car.bit.play_errorL, 1,
                        pel->car.bit.errorL, 0,
                        pel->car.bit.present, 1,
                        pel->car.bit.active, 0);
                retval = FAILURE;
        }
        pel->car.bit.resetL = 0; /* reset */
        pel->car.bit.initialize = 0;
        pel->car.bit.initialize = 1;
        pel->car.bit.resetL = 1; /* lift reset */
        lm_message("Check 3 (initialization): car = %04x\n", pel->car.reg);
        if ((pel->car.reg) != 0xff12) {
                (void)lm_error(error_format, "Initialization check",
                        pel->car.bit.play_errorL, 1,
                        pel->car.bit.errorL, 1,
                        pel->car.bit.present, 1,
                        pel->car.bit.active, 1);
                retval = FAILURE;
        }
        pel->car.bit.eeprom_in = 1; /* diag dab not present */
        lm_message("Check 4 (removal):          car = %04x\n", pel->car.reg);
        if ((pel->car.reg) != 0xf132) {
                (void)lm_error(error_format, "Removal check",
                        pel->car.bit.play_errorL, 1,
                        pel->car.bit.errorL, 0,
                        pel->car.bit.present, 0,
                        pel->car.bit.active, 0);
                retval = FAILURE;
        }

        pel->car.bit.initialize = 0;
        pel->car.bit.resetL = 0; /* reset */
        pel->car.bit.resetL = 1; /* lift reset */
        if (pel_play_pattern_string("z2z2z2z4", 0) != SUCCESS) {
            lm_message("ERROR playing pattern string\n");
            return FAILURE;
        }
        lm_message("Check 5 (play error):       car = %04x\n", pel->car.reg);
        if ((pel->car.reg) != 0xe122) {
                (void)lm_error(error_format, "Play error check",
                        pel->car.bit.play_errorL, 0,
                        pel->car.bit.errorL, 0,
                        pel->car.bit.present, 0,
                        pel->car.bit.active, 0);
                retval = FAILURE;
        }

        pel_clear_pel_errors();
        return retval;
}
```

Copyright 1989
Logic Modeling Systems

| SOURCE PROGRAM | DATE | PAGE # |
|---|---|---|
| diags/pel_id.c | 5/23/89 | 1/123 |
| | TIME 4:41:27 pm | |

LINE # SOURCE TEXT

```
/* SCCS_ID: pel_id.c rev 3.1, 4/24/89 at 07:50:08      */

#include "common.h"
#include "lm_diags.h"
#include "id.h"
#include "magic.h"
#include "pel.h"

/*
 * Compute and verify checksum on ID PROM
 *
 * Pass pointer to first byte in ID PROM.
 * Subsequent ID_NUM_BYTES-1 bytes are 4 bytes apart.
 * Algorithm:
 *     initialize checksum to an arbitrary (but well-known) value
 *     for each byte (including checksum)
 *         circular left shift left checksum
 *         add data byte
 *         mask checksum to 8 bits
 * Returns computed checksum.
 */
int
pel_id_check(pel)
PEL *pel;
{
    register int checksum;
    register u_long byte_count;

    checksum= ID_CHECKSUM_INIT;

    for (byte_count= 0; byte_count < ID_NUM_BYTES; byte_count++)
    {
        checksum= (checksum << 1) + ((checksum & 0x80) >> 7);
        checksum+= (int)pel->idprom.id_prom[byte_count].data;
        checksum&= 0xFF;
    }
    return(checksum);
}

/*
 * Load an ID PROM into a character buffer
 *
 * address is the physical byte address of the first byte in the ID PROM.
 * buffer is the byte address of the first byte in a ID_NUM_BYTES buffer.
 * In practice, buffer is really an appropriate ID_PROM_XXX structure, and
 * a pointer to it is passed, cast to (u_char *).
 */
void
pel_id_load(pel, buffer)
PEL *pel;
u_char *buffer;
{
    register int byte_count;

    for (byte_count= 0; byte_count < ID_NUM_BYTES; byte_count++)
    {
        *buffer= (unsigned char)pel->idprom.id_prom[byte_count].data;
        buffer++;
    }
}
```

Copyright 1989
Logic Modeling Systems

SOURCE PROGRAM
diags/pel_magic.c

DATE 5/23/89
TIME 4:41:27 pm

PAGE # 1/124

LINE # SOURCE TEXT

```
/* SCCS_ID: pel_magic.c rev 3.1, 4/24/89 at 07:50:11 */

/**********************************************************************
 *                                                                    *
 *      Pattern play routines                                         *
 *      used in PEL diagnostics                                       *
 *                                                                    *
 **********************************************************************/

#include <math.h>
#include "common.h"
#include "mod_def.h"
#include "modeler_extn.h"
#include "vrtx.h"
#include "lm_diags.h"
#include "tmg.h"
#include "tmg_extn.h"
#include "pac.h"
#include "pac_def.h"
#include "pac_extn.h"
#include "magic.h"
#include "pel.h"
#include "pel_preamble.h"

print_magic_register(reg)
int     reg;
{
    register PEL *pel
        = (PEL *)(pel_addr(current_lane, current_pel));
    register long chip;

    for (chip = 4; chip >= 0; chip--) {
        lm_message("%04x ", pel->magic_chip[chip].reg[reg]);
    }
    lm_message("\n");
}

print_magic_state()
{
    lm_message("DATA OUT   (0)  = "); print_magic_register(0);
    lm_message("MDOE       (1)  = "); print_magic_register(1);
    lm_message("EDOE       (2)  = "); print_magic_register(2);
    lm_message("CTLOUT     (3)  = "); print_magic_register(3);
    lm_message("LCYC       (4)  = "); print_magic_register(4);
    lm_message("ENDEN      (5)  = "); print_magic_register(5);
    lm_message("DATA IN    (6)  = "); print_magic_register(6);
    lm_message("ERROR DATA (7)  = "); print_magic_register(7);
    lm_message("SHORT      (8)  = "); print_magic_register(8);
    lm_message("U          (9)  = "); print_magic_register(9);
    lm_message("HIZ        (10) = "); print_magic_register(10);
    lm_message("VALUE      (11) = "); print_magic_register(11);
    lm_message("TIMING     (12) = "); print_magic_register(12);
    lm_message("STATUS     (14) = "); print_magic_register(14);
}

magic_circular_shift()
{
    register PEL *pel
        = (PEL *)(pel_addr(current_lane, current_pel));
    register u_short *car = &(pel->car.reg);
    PAT_WORD    pattern;

   *car = 0; /* MUST keep the PEL reset during this test */

    if (!pel_load_pattern_string("z2z2z2z5", 0, STOP_MODE)) {
        pel_error("Could not load pattern string!\n");
        return (FAILURE);
    }

    pel_read_pattern(3, &pattern);
    pattern.pattern.data[0] = pel->magic_chip[4].reg[3];
    pattern.pattern.data[1] = pel->magic_chip[3].reg[3];
    pattern.pattern.data[2] = pel->magic_chip[2].reg[3];
    pattern.pattern.data[3] = pel->magic_chip[1].reg[3];
    pattern.pattern.data[4] = pel->magic_chip[0].reg[3];
    pel_write_pattern(3, &pattern);

    if (diag_play() == FAILURE) {
        pel_error("Could not play pattern!\n ");
        pac_play_cleanup();
        return(FAILURE);
    }
    return(SUCCESS);
}

magic_swap()
{
    register PEL *pel
        = (PEL *)(pel_addr(current_lane, current_pel));
    register u_short *car = &(pel->car.reg);

   *car = 0; /* MUST keep the PEL reset during this test */

    if (!pel_load_pattern_string("z2z2z2z1", 0, STOP_MODE)) {
        pel_error("Could not load pattern string!\n ");
        return (FAILURE);
    }

    if (diag_play() == FAILURE) {
        pel_error("Could not play pattern!\n ");
        pac_play_cleanup();
        return(FAILURE);
    }
    return(SUCCESS);
}

char wmc_S1[] = "z2f555d5A5B5C5D5E5z5a5u5f1z5a5u505152535455f555d5z1";
char wmc_S2[] = "z2z2z2z5";
char wmc_S3[] = "z2z2z2z1";

struct wr_magic_ctl {
        char *name;
        char *string;
        u_short pattern[5];
} Wr_magic_ctl_data[] = {
        "CTLOUT",       wmc_S1, 0xffff, 0xffff, 0xffff, 0xffff, 0xffff,
        "RESET<0>",     wmc_S2, 0x5555, 0x5555, 0x5555, 0x5555, 0x5555,
        "RESET<1>",     wmc_S2, 0xcdef, 0x3210, 0x7654, 0xba98, 0xfedc,
        "SET<0>",       wmc_S2, 0x0000, 0xffff, 0xffff, 0xffff, 0xffff,
        "SET<1>",       wmc_S2, 0xffff, 0x0000, 0xffff, 0xffff, 0xffff,
```

Copyright 1989
Logic Modeling Systems

LINE # SOURCE TEXT

```
        "DOFF",         wmc_S2, 0xffff, 0xffff, 0x0000, 0xffff, 0xffff,
        "EDOIS*",       wmc_S2, 0xffff, 0xffff, 0xffff, 0x0000, 0xffff,
        "LCYCMD*",      wmc_S2, 0xffff, 0xffff, 0xffff, 0xffff, 0x0000,
        "LCYCND*",      wmc_S2, 0x0000, 0x0000, 0x0000, 0x0000, 0x0000,
        "SEQMD*",       wmc_S2, 0xaaaa, 0xaaaa, 0xaaaa, 0xaaaa, 0xaaaa,
        "SEQND*",       wmc_S2, 0x3210, 0xcdef, 0x89ab, 0x4567, 0x0123,
        "FORMAT<0>",    wmc_S3, 0x0000, 0x0000, 0x0000, 0x0000, 0x0000,
        "FORMAT<1>",    wmc_S2, 0xaaaa, 0xaaaa, 0xaaaa, 0xaaaa, 0xaaaa,
        "TOGGLE",       wmc_S2, 0x3210, 0xcdef, 0x89ab, 0x4567, 0x0123,
        "SDLEN<0>*",    wmc_S2, 0xffff, 0x0000, 0x0000, 0x0000, 0x0000,
        "SDLEN<1>*",    wmc_S2, 0x0000, 0xffff, 0x0000, 0x0000, 0x0000,
        "SDLEN<2>*",    wmc_S2, 0x0000, 0x0000, 0xffff, 0x0000, 0x0000,
        "SDLEN<3>*",    wmc_S2, 0x0000, 0x0000, 0x0000, 0xffff, 0x0000,
        "SDHEN<0>",     wmc_S2, 0x0000, 0x0000, 0x0000, 0x0000, 0xffff,
        "SDHEN<1>",     wmc_S2, 0xffff, 0xffff, 0xffff, 0xffff, 0xffff,
        "SDHEN<2>",     wmc_S2, 0x5555, 0x5555, 0x5555, 0x5555, 0x5555,
        "SDHEN<3>",     wmc_S2, 0xcdef, 0x3210, 0x7654, 0xba98, 0xfedc,
        0
};

#ifdef info
string format dcdcdcdcdcdc... where d = data, c = control
the shift register is x deep by 80 wide (5 chips X 16 bits).
#endif info

pel_wr_magic_ctl()
{
        register PEL *pel
                = (PEL *)(pel_addr(current_lane, current_pel));
        register u_short *car = &(pel->car.reg);
        register struct wr_magic_ctl *wmcdp;
        int errors = 0;

        if(diag_clear_errors() != SUCCESS)
                return(FAILURE);

        if (pel_lane_init() != SUCCESS) {
                (void)pel_error("Pin Electronics lane init fails.\n");
                return FAILURE;
        }

        *car = 0; /* MUST keep the PEL reset during this test */

        for (wmcdp = Wr_magic_ctl_data; wmcdp->name; ++wmcdp) {
                if (pel_play_pattern_string(wmcdp->string, 0) != SUCCESS) {
                        lm_error("Lane %c Pel %d %s pattern play failed\n",
                                current_lane + 'A', current_pel,
                                wmcdp->name);
                        return (FAILURE);
                }
                if (compare_magic_chips(3, wmcdp->pattern) != SUCCESS) {
                        lm_error("Lane %c Pel %d %s compare failed\n",
                                current_lane + 'A', current_pel,
                                wmcdp->name);
                        ++errors;
                }
        }

        if (errors > 0)
                return (FAILURE);
        else
                return (SUCCESS);
}

display_magic_control(,
{
        register struct wr_magic_ctl *wmcdp;
        register int count;

        setup_good_sample(tmg_measure_period());

        wmcdp = Wr_magic_ctl_data;
        for (count = 0; count < 11; ++wmcdp, ++count) {
                lm_message("%-10s= ", wmcdp->name);
                print_magic_register(3);
                magic_circular_shift();
        }

        magic_swap();
        for (count = 0; count < 11; ++wmcdp, ++count) {
                lm_message("%-10s= ", wmcdp->name);
                print_magic_register(3);
                magic_circular_shift();
        }
        magic_swap();
        return (SUCCESS);
}

/* compare_magic_chips(reg, pattern) */
/* pattern is a 20 character string representing the 80 bits of expected data */
        /* "44443333222211110000" */

compare_magic_chips(reg, pattern)
u_short *pattern;
{
    register PEL *pel = (PEL *)(pel_addr(current_lane, current_pel));
    char *format = "magic chip %d, reg %d got %04x, expected %04x\n";
    register u_short result;
    register long chip, errors;
    u_short errbits;
    int i;
    char buffer[256], buf[8];

    errors = 0;

    for (chip = 0; chip < 5; ++chip) {
        if ((result = pel->magic_chip[chip].reg[reg]) != pattern[chip]) {
            (void)lm_error(format, chip, reg, result, pattern[chip]);
            errors++;

            errbits = result ^ pattern[chip];
            strcpy(buffer, "Check pattern pin(s)");
            for (i = 0; i < 16; ++i) {
                if (errbits & (1 << i)) {
                        sprintf(buf, " %d", chip * 16 + i);
                        strcat(buffer, buf);
                }
            }
            lm_error("%s\n", buffer);
        }
```

Copyright 1989
Logic Modeling Systems

| SOURCE PROGRAM | DATE | TIME | PAGE # |
|---|---|---|---|
| diags/pel_magic.c | 5/23/89 | 4:41:27 pm | 3/126 |

SOURCE TEXT

```
        }

        if (errors != 0) {
            return(FAILURE);
        } else {
            return(SUCCESS);
        }
}
```

Copyright 1989
Logic Modeling Systems

SOURCE PROGRAM diags/pel_opcode.c | DATE 5/23/89 | TIME 4:41:28 pm | PAGE # 1/127

LINE # SOURCE TEXT

```
/* SCCS_ID: pel_opcode.c rev 3.1, 4/24/89 at 07:50:15     */

/*************************************************************************
 *                                                                       *
 *      PEL opcode routi...                                              *
 *      used in PEL diag... ..os                                         *
 *                                                                       *
 *************************************************************************/

#include "common.h"
#include "mod_def.h"
#include "modeler_extn.h"
#include "vrtx.h"
#include "lm_diags.h"
#include "tmg.h"
#include "tmg_extn.h"
#include "pac.h"
#include "pac_def.h"
#include "pac_extn.h"
#include "magic.h"
#include "pel.h"


#define  OPCODE_TEST_PERIOD      40000
#define  EDGE_ON                 OPCODE_TEST_PERIOD / 4
#define  EDGE_OFF                OPCODE_TEST_PERIOD


/*
 * PEL opcode Tests:
 */
pel_pattern_control()
{
    register PEL *pel = (PEL *)(pel_addr(current_lane, current_pel));
    static long edgetime[6] = {
        EDGE_ON, EDGE_ON, EDGE_ON, EDGE_ON, EDGE_ON, EDGE_ON
    };
    static long period = OPCODE_TEST_PERIOD;
    u_short pattern[5];
    int    errors;

    if(diag_clear_errors() != SUCCESS)
      return(FAILURE);

    pel_reset_all_pels_in_lane();
    errors = 0;

    if (pel_lane_init() != SUCCESS) {    /* set up pac/tmg/pel/dab        */
        (void)lm_error("Unable to initialize lane %c\n", current_lane + 'A');
        return(FAILURE);
    }
    pel->csr.bit.resetL = 0;             /* disable backplane errors      */

    if (tmg_set_timing(period, edgetime, 01, 1000001, 25000001) != SUCCESS) {
      return FAILURE;
    }


    /*
     * 1. Test opcodes 000 through 110 with PEL enabled and selected for current operation.
     */
    lm_message("Testing PEL opcodes 000 through 110 with PEL enabled and selected.\n");
    if (pel_play_pattern_string("z2f5f5z5f5f5f5f5z5z5z5z5z1a5z5z5z5z5z5z5f5f5f5f5f6z7f4z3z2z7z0", 0) != SUCCESS) {
        (void)pel_error("Failure to play OPCODE test pattern");
        return (FAILUR?);
    }
    pattern[4] = pattern[3] = pattern[2] = pattern[1] = pattern[0] = 0xffff;    /* check DATA OUT       */
    if (compare_magic_chips(0, pattern) != SUCCESS) {
        (void)pel_error("     PEL (selected) opcodes 000 through 110 failure \
(DATA OUT)\n");
        errors++;
    }
    pattern[4] = pattern[3] = pattern[2] = pattern[1] = pattern[0] = 0xaaaa;    /* check CTL_OUT        */
    if (compare_magic_chips(3, pattern) != SUCCESS) {
        (void)pel_error("     PEL (selected) opcodes 000 through 110 failure \
(CTL_OUT)\n");
        errors++;
    }
    pattern[4] = pattern[3] = pattern[2] = pattern[1] = pattern[0] = 0xffff;    /* check BMDEN*         */
    if (compare_magic_chips(5, pattern) != SUCCESS) {
        (void)pel_error("     PEL (selected) opcodes 000 through 110 failure \
(BMDEN*)\n");
        errors++;
    }


    /*
     * 2. Test opcode 111 with PEL enabled and selected for current operation.
     */
    lm_message("Testing PEL opcode 111 with PEL enabled and selected.\n");
    if (pel_play_pattern_string("f256f2z7", 0) != SUCCESS) {
        (void)pel_error("Failure to play OPCODE test pattern");
        return (FAILURE);
    }
    pattern[4] = pattern[3] = pattern[2] = pattern[1] = pattern[0] = 0x0000;    /* check DATA OUT       */
    if (compare_magic_chips(0, pattern) != SUCCESS) {
        (void)pel_error("     PEL (selected) opcode 111 failure (DATA OUT)\n");
        errors++;
    }
    pattern[4] = pattern[3] = pattern[2] = pattern[1] = pattern[0] = 0xaaaa;    /* check CTL_OUT        */
    if (compare_magic_chips(3, pattern) != SUCCESS) {
        (void)pel_error("     PEL (selected) opcode 111 failure (CTL_OUT)\n");
        errors++;
    }
    pattern[4] = pattern[3] = pattern[2] = pattern[1] = pattern[0] = 0x5555;    /* check BMDEN*         */
    if (compare_magic_chips(5, pattern) != SUCCESS) {
        (void)pel_error("     PEL (selected) opcode 111 failure (BMDEN*)\n");
        errors++;
    }


    /*
     * 3. Test opcodes 000 and 001 with PEL enabled and but not selected for current operation.
     */
    lm_message("Testing PEL opcodes 000 and 001 with PEL enabled and but not selected.\n");
    if (pel_play_pattern_string("z2z2f7fbz7fa", 0) != SUCCESS) {
        (void)pel_error("Failure to play OPCODE test pattern");
        return (FAILURE);
    }
    pattern[4] = pattern[3] = pattern[2] = pattern[1] = pattern[0] = 0xffff;    /* check DATA OUT       */
```

Copyright 1989 Logic Modeling Systems

| SOURCE PROGRAM | DATE | TIME | PAGE # |
|---|---|---|---|
| diags/pel_opcode.c | 5/23/89 | 4:41:28 pm | 2/128 |

LINE # SOURCE TEXT

```
    if (compare_magic_chips(0, pattern) != SUCCESS) {
        (void)pel_error("    PEL (enabled) opcodes 000 and 001 failure \
(DATA OUT)\n");
        errors++;
    }
    pattern[4] = pattern[3] = pattern[2] = pattern[1] = pattern[0] = 0xaaaa;    /* check CTL_OUT         */
    if (compare_magic_chips(3, pattern) != SUCCESS) {
        (void)pel_error("    PEL (enabled) opcodes 000 and 001 failure \
(CTL_OUT)\n");
        errors++;
    }
    pattern[4] = pattern[3] = pattern[2] = pattern[1] = pattern[0] = 0x5555;    /* check ENDEN*          */
    if (compare_magic_chips(5, pattern) != SUCCESS) {
        (void)pel_error("    PEL (enabled) opcodes 000 and 001 failure \
(ENDEN*)\n");
        errors++;
    }


    /*
     * 4. Test opcode 010 with PEL enabled and but not selected for current operation.
     */
    lm_message("Testing PEL opcode 010 with PEL enabled and but not selected.\n");
    if (pel_play_pattern_string("f2f2z7fc", 0) != SUCCESS) {
        (void)pel_error("Failure to play OPCODE test pattern");
        return (FAILURE);
    }
    pattern[4] = pattern[3] = pattern[2] = pattern[1] = pattern[0] = 0x0000;    /* check DATA OUT        */
    if (compare_magic_chips(0, pattern) != SUCCESS) {
        (void)pel_error("    PEL (enabled) opcode 010 failure (DATA OUT)\n");
        errors++;
    }
    pattern[4] = pattern[3] = pattern[2] = pattern[1] = pattern[0] = 0xaaaa;    /* check CTL_OUT         */
    if (compare_magic_chips(3, pattern) != SUCCESS) {
        (void)pel_error("    PEL (enabled) opcode 010 failure (CTL_OUT)\n");
        errors++;
    }
    pattern[4] = pattern[3] = pattern[2] = pattern[1] = pattern[0] = 0x5555;    /* check ENDEN*          */
    if (compare_magic_chips(5, pattern) != SUCCESS) {
        (void)pel_error("    PEL (enabled) opcode 010 failure (ENDEN*)\n");
        errors++;
    }


    /*
     * 5. Test opcodes 011 and 100 with PEL enabled and but not selected for current operation.
     */
    lm_message("Testing PEL opcodes 011 and 100 with PEL enabled and but not selected.\n");
    if (pel_play_pattern_string("z2f4zezdze", 0) != SUCCESS) {
        (void)pel_error("Failure to play OPCODE test pattern");
        return (FAILURE);
    }
    pattern[4] = pattern[3] = pattern[2] = pattern[1] = pattern[0] = 0xffff;    /* check DATA OUT        */
    if (compare_magic_chips(0, pattern) != SUCCESS) {
        (void)pel_error("    PEL (enabled) opcodes 011 and 100 failure \
(DATA OUT)\n");
        errors++;
    }
    pattern[4] = pattern[3] = pattern[2] = pattern[1] = pattern[0] = 0xaaaa;    /* check CTL_OUT         */
    if (compare_magic_chips(3, pattern) != SUCCESS) {
        (void)pel_error("    PEL (enabled) opcodes 011 and 100 failure \
(CTL_OUT)\n");
        errors++;
    }
    pattern[4] = pattern[3] = pattern[2] = pattern[1] = pattern[0] = 0x5555;    /* check ENDEN*          */
    if (compare_magic_chips(5, pattern) != SUCCESS) {
        (void)pel_error("    PEL (enabled) opcodes 011 and 100 failure \
(ENDEN*)\n");
        errors++;
    }


    /*
     * 6. Test opcode 101 with PEL enabled and but not selected for current operation.
     */
    lm_message("Testing PEL opcode 101 with PEL enabled and but not selected.\n");
    if (pel_play_pattern_string("f2f2z7ff", 0) != SUCCESS) {
        (void)pel_error("Failure to play OPCODE test pattern");
        return (FAILURE);
    }
    pattern[4] = pattern[3] = pattern[2] = pattern[1] = pattern[0] = 0x0000;    /* check DATA OUT        */
    if (compare_magic_chips(0, pattern) != SUCCESS) {
        (void)pel_error("    PEL (enabled) opcode 101 failure (DATA OUT)\n");
        errors++;
    }
    pattern[4] = pattern[3] = pattern[2] = pattern[1] = pattern[0] = 0xaaaa;    /* check CTL_OUT         */
    if (compare_magic_chips(3, pattern) != SUCCESS) {
        (void)pel_error("    PEL (enabled) opcode 101 failure (CTL_OUT)\n");
        errors++;
    }
    pattern[4] = pattern[3] = pattern[2] = pattern[1] = pattern[0] = 0x5555;    /* check ENDEN*          */
    if (compare_magic_chips(5, pattern) != SUCCESS) {
        (void)pel_error("    PEL (enabled) opcode 101 failure (ENDEN*)\n");
        errors++;
    }


    /*
     * 7. Test opcodes 110 and 111 with PEL enabled and but not selected for current operation.
     */
    lm_message("Testing PEL opcodes 110 and 111 with PEL enabled and but not selected.\n");
    if (pel_play_pattern_string("z2f4zazbzczezfzgzhze", 0) != SUCCESS) {
        (void)pel_error("Failure to play OPCODE test pattern");
        return (FAILURE);
    }
    pattern[4] = pattern[3] = pattern[2] = pattern[1] = pattern[0] = 0xffff;    /* check DATA OUT        */
    if (compare_magic_chips(0, pattern) != SUCCESS) {
        (void)pel_error("    PEL (enabled) opcodes 110 and 111 failure \
(DATA OUT)\n");
        errors++;
    }
    pattern[4] = pattern[3] = pattern[2] = pattern[1] = pattern[0] = 0xaaaa;    /* check CTL_OUT         */
    if (compare_magic_chips(3, pattern) != SUCCESS) {
        (void)pel_error("    PEL (enabled) opcodes 110 and 111 failure \
(CTL_OUT)\n");
        errors++;
    }
    pattern[4] = pattern[3] = pattern[2] = pattern[1] = pattern[0] = 0x5555;    /* check ENDEN*          */
    if (compare_magic_chips(5, pattern) != SUCCESS) {
        (void)pel_error("    PEL (enabled) opcodes 110 and 111 failure \
```

Copyright 1989
Logic Modeling Systems

| SOURCE PROGRAM | DATE | PAGE # |
|---|---|---|
| diags/pel_opcode.c | 5/23/89 | 3/129 |
| | TIME 4:41:28 pm | |

LINE # SOURCE TEXT

```
(ENDEN")\n");
        errors++;
    }

    return errors ? FAILURE : SUCCESS;
}
```

Copyright 1989 Logic Modeling Systems

| SOURCE PROGRAM | DATE | PAGE # |
|---|---|---|
| diags/pel_pattern.c | 5/23/89 | 1/130 |
| | TIME 4:41:28 pm | |

LINE # SOURCE TEXT

```
/* SCCS_ID: pel_pattern.c rev 3.1, 4/24/89 at 07:50:19    */

/**********************************************************************
 *
 *      Pattern play routines
 *      used in PEL diagnostics
 *
 **********************************************************************/

#include <math.h>
#include "common.h"
#include "mod_def.h"
#include "modeler_exts.h"
#include "vrtx.h"
#include "lm_diags.h"
#include "tmg.h"
#include "tmg_exts.h"
#include "pac.h"
#include "pac_def.h"
#include "pac_exts.h"
#include "magic.h"
#include "pel.h"
#include "pel_preamble.h"

/*************************************************************
 *
 *      Globals:
 *              current_pel, current_lane
 *
 *      pel_load_pattern_string:
 *              converts a string (encoded with the rules shown
 *              below) into patterns that get written into
 *              pattern memory.
 *
 *              The string is organized in pairs of characters.
 *              The first character determines the pattern
 *              data. The choices are in String_pattern[].
 *
 *              The second character in the string determines
 *              the pel_control and whether the pattern is sent
 *              to the current_pel or the null PEL (PEL 15).
 *                  0-7 => pel_control = 0-7 (current_pel)
 *                  8-h => pel_control = 0-7 (current_pel + 1)
 *
 *************************************************************/

struct string_pattern {
        char code;
        short data[5];
} String_pattern[] = {
        {'0',   0x0000, 0x0000, 0x0000, 0x0000, 0xffff},
        {'1',   0x0000, 0x0000, 0x0000, 0xffff, 0x0000},
        {'2',   0x0000, 0x0000, 0xffff, 0x0000, 0x0000},
        {'3',   0x0000, 0xffff, 0x0000, 0x0000, 0x0000},
        {'4',   0xffff, 0x0000, 0x0000, 0x0000, 0x0000},
        {'5',   0x5555, 0x5555, 0x5555, 0x5555, 0x5555},
        {'A',   0xffff, 0xffff, 0xffff, 0xffff, 0x0000},
        {'B',   0xffff, 0xffff, 0xffff, 0x0000, 0xffff},
        {'C',   0xffff, 0xffff, 0x0000, 0xffff, 0xffff},
        {'D',   0xffff, 0x0000, 0xffff, 0xffff, 0xffff},
        {'E',   0x0000, 0xffff, 0xffff, 0xffff, 0xffff},
        {'G',   0x0008, 0x0008, 0x0008, 0x0008, 0x0008},
        {'H',   0x02ff, 0x02ff, 0x02ff, 0x02ff, 0x0200},
        {'I',   0x0200, 0x0200, 0x0200, 0x0200, 0x02ff},
        {'J',   0xffff, 0xffff, 0xffff, 0xffff, 0x00ff},
        {'K',   0x00ff, 0x00ff, 0x00ff, 0x00ff, 0xffff},
        {'O',   0x0607, 0x0607, 0x0607, 0x0607, 0x0607},
        {'R',   0x0400, 0x0400, 0x0400, 0x0400, 0x0400},
        {'S',   0x0606, 0x0606, 0x0606, 0x0606, 0x0606},
        {'T',   0x0800, 0x0800, 0x0800, 0x0800, 0x0800},
        {'U',   0x00ff, 0x00ff, 0x00ff, 0x00ff, 0x00ff},
        {'V',   0xff00, 0xff00, 0xff00, 0xff00, 0xff00},
        {'a',   0xaaaa, 0xaaaa, 0xaaaa, 0xaaaa, 0xaaaa},
        {'c',   0x0e00, 0x0e00, 0x0e00, 0x0e00, 0x0e00},
        {'d',   0xfedc, 0xba98, 0x7654, 0x3210, 0xcdef},
        {'f',   0xffff, 0xffff, 0xffff, 0xffff, 0xffff},
        {'g',   0xfff7, 0xfff7, 0xfff7, 0xfff7, 0xfff7},
        {'h',   0xcccc, 0xcccc, 0xcccc, 0xcccc, 0xcccc},
        {'k',   0x0301, 0x0301, 0x0301, 0x0301, 0x0301},
        {'l',   0x800f, 0x800f, 0x800f, 0x800f, 0x800f},
        {'m',   0x000f, 0x000f, 0x000f, 0x000f, 0x000f},
        {'q',   0x02ff, 0x02ff, 0x02ff, 0x02ff, 0x02ff},
        {'r',   0x0200, 0x0200, 0x0200, 0x0200, 0x0200},
        {'s',   0x0e80, 0x0e80, 0x0e80, 0x0e80, 0x0e80},
        {'t',   0xf7ff, 0xf7ff, 0xf7ff, 0xf7ff, 0xf7ff},
        {'u',   0x0123, 0x4567, 0x89ab, 0xcdef, 0x3210},
        {'z',   0x0000, 0x0000, 0x0000, 0x0000, 0x0000},
        0
};

pel_pattern_utilities(parent_menu)
LM_DIAG_MENU *parent_menu;
{
        int pel_enter_pattern_string();
        int display_pattern_memory();
        int display_pattern_preamble();
        int display_pattern_preamble_verbosely();
        int build_preamble();
        int display_pattern_string_code();

        static LM_DIAG_MENU_ITEM menu_list[] =
        {
                {
                        "1",
                        "Enter patterns",
                        pel_enter_pattern_string,
                        LM_DIAG_utility,
                        LM_DIAG_null,
                        0
                },
                {
                        "2",
                        "Display pattern memory",
                        display_pattern_memory,
                        LM_DIAG_utility,
                        LM_DIAG_null,
                        0
                },
                {
                        "3",
```

Copyright 1989 Logic Modeling Systems

SOURCE PROGRAM diags/pel_pattern.c | DATE 5/23/89 | TIME 4:41:28 pm | PAGE # 2/131

SOURCE TEXT

```
                        "Display pattern memory preamble (short)",
                        display_pattern_preamble,
                        LM_DIAG_utility,
                        LM_DIAG_null,
                        0
                },
                {
                        "4",
                        "Display pattern memory preamble (long)",
                        display_pattern_preamble_verbosely,
                        LM_DIAG_utility,
                        LM_DIAG_null,
                        0
                },
                {
                        "5",
                        "Display pattern string code",
                        display_pattern_string_code,
                        LM_DIAG_utility,
                        LM_DIAG_null,
                        0
                },
                {
                        "6",
                        "Build Preamble",
                        build_preamble,
                        LM_DIAG_utility,
                        LM_DIAG_null,
                        0
                },
        };

        static LM_DIAG_MENU menu =
        {
                "PEL UTILITIES",
                sizeof(menu_list) / sizeof(LM_DIAG_MENU_ITEM),
                0,
                menu_list
        };
        menu.title = parent_menu->
                menu_items[parent_menu->current_selection].menu_text;
        return lm_display_menu(&menu);
}

#define MIN_PATTERN_LENGTH      4
#define ODD_ERROR       -1

pel_pattern_count(pattern_string)
char *pattern_string;
{
        register long len;
        static char Odd_error[] =
                "Pattern string has odd number of chars:\n\t\"%s\"\n";

        if ((len = strlen(pattern_string)) % 2) {
                (void)lm_error(Odd_error, pattern_string);
                return ODD_ERROR;
        }
        return len >> 1; /* pattern count */
}

build_pattern_data(pattern_string, first_pattern_no)
char    *pattern_string;
{
        struct string_pattern *pel_decode_string_pattern();
        static char Set_error[] =
                "Pattern memory set error at lane = %d, address = %08x\n";

        PAT_WORD    pattern;
        register long   i;
        register u_long n, pattern_count;
        struct string_pattern *string_pattern;

        if ((pattern_count = pel_pattern_count(pattern_string)) == ODD_ERROR) {
                return (0);
        }

        for (n = first_pattern_no; *pattern_string != '\0'; ++n) {
                /* set the pattern data according to first character in pair */
                if (!(string_pattern
                        = pel_decode_string_pattern(*pattern_string))) {
                        lm_message("Bad pel_load_pattern_string\n");
                        return(0);
                }

                for (i = 0; i < 5; i++)
                        pattern.pattern.data[i] = string_pattern->data[i];

                pattern_string++; /* move to second pair of characters */

                /* compute pel_control and pel_address
                   from second of character pair */
                if ((*pattern_string >= '0') && (*pattern_string <= '7')) {
                        pattern.pattern.pel_control
                                = *pattern_string - '0';
                        pattern.pattern.pel_address = current_pel;
                } else if ((*pattern_string>='a') && (*pattern_string<='h')) {
                        pattern.pattern.pel_control
                                = *pattern_string - 'a';
                        pattern.pattern.pel_address
                                = (current_pel + 1) % 16;
                } else {
                        lm_message("Bad pel_load_pattern_string\n");
                        return(0);
                }
                /* Make sure the branch bits and the stop bit are zero (NOP) */
                pattern.pattern.branch = 0;
                pattern.pattern.stop = 0;

                /* Set the spare bits to zero so that pattern loading is */
                /* consistent. Clear the USER bit */
                pattern.pattern.backplane_spare = 0;
                pattern.pattern.pec_spare = 0;
                pattern.pattern.user = 0;

                pattern_string++; /* move to next pair of characters */

                /* write the pattern to pattern memory,
                        and move to next address */
                if (pel_write_pattern(n, &pattern) != SUCCESS) {
```

Copyright 1989
Logic Modeling Systems

| SOURCE PROGRAM | DATE | PAGE # |
|---|---|---|
| diags/pel_pattern.c | 5/23/89 TIME 4:41:28 pm | 3/132 |

LINE # SOURCE TEXT

```
                        lm_message(Set_error, current_lane, n);
                        return(0);
                }
        }
    return (pattern_count);
}

pel_type_pattern_string()
{
    char pattern[256];
    long start_pattern = 0, dab_type = 0;

    pattern[0] = '\0';
    lm_get_input("Enter pattern string: ", pattern, 256);
    diag_get_long(&start_pattern, "start pattern number", 0l,
    (long)pac[current_lane].num_patterns);
    diag_get_long(&dab_type,
    "Enter DAB type (PUBLIC_DAB = 0, PRIVATE_DAB = 1)", 0l, 1l);

    if (set_vlogl(0.8) == FAILURE) return(FAILURE);
    if (set_vlogh(2.0) == FAILURE) return(FAILURE);
    if (set_vlth(0.3) == FAILURE) return(FAILURE);
    if (set_vsl(0.4) == FAILURE) return(FAILURE);
    if (set_vsh(4.0) == FAILURE) return(FAILURE);
    if (set_vhth(4.4) == FAILURE) return(FAILURE);

    if (pel_lane_init() != SUCCESS) { /* set up pac/tmg/pel/dab */
        (void)lm_error("Unable to  initialize lane %c\n", current_lane + 'A');
        return(FAILURE);
    }
    if (pel_dab_init(dab_type) != SUCCESS) {
        (void)lm_error("Unable to initialize DAB %c, PEL %d\n",
        current_lane + 'A', current_pel);
        return(FAILURE);
    }

    if (pel_play_pattern_string(pattern, start_pattern) == SUCCESS) {
        print_magic_state();
        return SUCCESS;
    } else {
        lm_message("ERROR playing pattern string\n");
        return FAILURE;
    }
}

pel_enter_pattern_string()
{
    char pattern[256];
    long start_pattern = 0;

    pattern[0] = '\0';
    lm_get_input("Enter pattern string: ", pattern, 256);
    diag_get_long(&start_pattern, "start pattern number", 0l,
    (long)pac[current_lane].num_patterns);

    if (!pel_load_pattern_string(pattern, start_pattern, STOP_MODE)) {
        (void)pel_error("pel_load_pattern_string failed!\n ");
        return (FAILURE);
    }
    return (SUCCESS);
}

pel_play_pattern_string(pattern_string, first_pattern_no)
char *pattern_string;
{
        if (!pel_load_pattern_string(pattern_string,
        first_pattern_no, STOP_MODE)) {
                (void)pel_error("pel_play_pattern_string failed!\n ");
                return (FAILURE);
        }

        if (diag_play() == FAILURE) {
              (void)pel_error("pel_play_pattern_string failed in diag_play!\n ");
                return(FAILURE);
        }

        return (SUCCESS);
}

pel_load_pattern_string(pattern_string, first_pattern_no, mode)
char    *pattern_string;
{
    register u_long pattern_count;

    if ((pattern_count = build_pattern_data(pattern_string,
        first_pattern_no)) == 0) {
        (void)pel_error("Can't load pattern data\n");
        return 0;
    }

    if (pel_build_pattern_control(first_pattern_no,pattern_count,mode)
    != SUCCESS) {
        (void)pel_error("Can't load pattern control\n");
        return(0);
    }

    return pattern_count;
}

struct string_pattern *
pel_decode_string_pattern(c)
char c;
{
        struct string_pattern *p;

        for (p = String_pattern; p->code; ++p) {
                if (c == p->code) return p;
        }
        return 0; /* undefined code */
}

char
pel_encode_string_pattern(d)
short d[];
{
        register int chip;
        register struct string_pattern *p;

        for (p = String_pattern; p->code; ++p) {
                for (chip = 0; chip < 5; ++chip) {
```

Copyright 1989
Logic Modeling Systems

SOURCE PROGRAM
diags/pel_pattern.c

DATE 5/23/89
TIME 4:41:28 pm

PAGE # 4/133

LINE # SOURCE TEXT

```
                        if (p->data[chip] != d[chip]) break;
                }
                if (chip == 5) return p->code;
        }
        return 0; /* undefined code */
}

display_pattern_preamble()
{
  pattern_preamble(0);
}

display_pattern_preamble_verbosely()
{
  pattern_preamble(1);
}

get_pattern_preamble(start_pattern, preamble_array)
u_long start_pattern;
preamble preamble_array[];
{
  PAT_WORD patptr;
  u_long pattern, limit_pattern = start_pattern + PREAMBLE_SIZE;
  u_long pin, start_pin, limit_pin;
  u_long chip;

  for (pin = 0; pin < 80; ++pin) {
      preamble_array[pin].x = 0;
  }
  for (pattern = start_pattern; pattern < limit_pattern; ++pattern) {
    pel_read_pattern(pattern, &patptr);
    for (chip = 0; chip < 5; ++chip) {
      start_pin = (4 - chip) * 16;
      limit_pin = start_pin + 16;
      for (pin = start_pin; pin < limit_pin; ++pin) {
        if ((patptr.pattern.data[chip] & (1 << (pin % 16))) != 0)
          preamble_array[pin].x |=
            (1 << (pattern - start_pattern));
      }
    }
  }
  return SUCCESS;
}

set_pattern_preamble(start_pattern, preamble_array)
u_long start_pattern;
preamble preamble_array[];
{
  PAT_WORD patptr;
  u_long pattern, limit_pattern;
  u_long pin, start_pin, limit_pin;
  u_long chip;

  limit_pattern = start_pattern + PREAMBLE_SIZE;

  for (pattern = start_pattern; pattern < limit_pattern; ++pattern) {
    pel_read_pattern(pattern, &patptr);
    for (chip = 0; chip < 5; ++chip) {
      patptr.pattern.data[chip] = 0;
      start_pin = (4 - chip) * 16;
      limit_pin = start_pin + 16;
      for (pin = start_pin; pin < limit_pin; ++pin) {
        if ((patptr.pattern.data[chip] & (1 << (pin % 16))) != 0)
          preamble_array[pin].x |=
            (1 << (pattern - start_pattern));

        if ((preamble_array[pin].x & (1 << (pattern - start_pattern))) != 0)
          patptr.pattern.data[chip] |= (1 << (pin % 16));
      }
    }
    pel_write_pattern(pattern, &patptr);
  }
  return SUCCESS;
}

pattern_preamble(verbose)
{
  register int count;
  preamble preamble_array[80];
  long start_pattern;
  int pin;
  int chip;

  start_pattern = 0;
  diag_get_long(&start_pattern, "start pattern", start_pattern,
    (u_long)(pac[current_lane].num_patterns - 1));

  get_pattern_preamble(start_pattern, preamble_array);

  if (verbose) {
    for (count = pin = 0; pin < 80; ++pin, ++count) {
      if (count && (!(count % 20)))
          if (!(count = more(pin, 80, count)))
            break;
      lm_message("pin %2d|", pin);
      decode_preamble(preamble_array[pin].x);
    }
  } else {
    for (pin = 0; pin < 16; ++pin) {
      lm_message("|");
      for (chip = 0; chip < 5; ++chip) {
        lm_message("pin %2d %07x|",
          pin + 16 * chip, preamble_array[pin + 16 * chip].x);
      }
      lm_message("\n");
    }
  }
  return SUCCESS;
}

  static char *array_format[] =
  {
    "RC  ",
    "RZ  ",
    "R1  ",
    "DNRZ",
  };
  static char *array_toggle[] =
  {
    "    ",
```

Copyright 1989 Logic Modeling Systems

| SOURCE PROGRAM | DATE | PAGE # |
|---|---|---|
| diags/pel_pattern.c | 5/23/89 TIME 4:41:28 pm | 5/134 |

LINE # SOURCE TEXT

```
      "TOG",
    };
    static char *array_doff[] =
    {
      "DOFF0",
      "DOFF5",
    };
    static char *array_hddis[] =
    {
      "HDDIS",
      "     ",
    };
    static char *array_lcycmd[] =
    {
      "LMD",
      "   ",
    };
    static char *array_lcychd[] =
    {
      "LHD",
      "   ",
    };
    static char *array_seqmd[] =
    {
      "SQMD",
      "    ",
    };
    static char *array_seqhd[] =
    {
      "SQHD",
      "    ",
    };
    static char *array_hmden[] =
    {
      "HMDEN",
      "     ",
    };

decode_preamble(x)
preamble x;
{
  lm_message("%s %s SLEN%x EHEN%x R%d S%d %s %s %s %s %s %s %s\n",
    array_format[x.b.format],
    array_toggle[x.b.toggle],
    x.b.sdlen,
    x.b.sdhen,
    x.b.reset,
    x.b.set + 2,
    array_doff[x.b.doff],
    array_hddis[x.b.hddis],
    array_lcycmd[x.b.lcycmd],
    array_lcychd[x.b.lcychd],
    array_seqmd[x.b.seqmd],
    array_seqhd[x.b.seqhd],
    array_hmden[x.b.hmden]);
}

build_preamble()
{
  char reply[DIAG_MAX_INPUT], *s;
  preamble preamble_array[80];
  preamble x;
  u_long start_pattern;
  u_long pin, start_pin, end_pin;
  u_long format;
  u_long toggle;
  u_long sdlen;
  u_long sdhen;
  u_long reset;
  u_long set;
  u_long doff;
  u_long hddis;
  u_long lcycmd;
  u_long lcychd;
  u_long seqmd;
  u_long seqhd;
  u_long hmden;
  char *get_range();

  start_pattern = 0;
  diag_get_ulong(&start_pattern, "start pattern", start_pattern,
    (u_long)(pac[current_lane].num_patterns - 1));

  lm_get_input("Enter pin list (p p,p, p-p,...) ",
    reply, (short)DIAG_MAX_INPUT);

  if (!(s = get_range(reply, &start_pin, &end_pin))) {
    lm_message ("Although s = %d and e = %d\n", start_pin, end_pin);
    (void)pel_error("Illegal pin selection string\n");
    return FAILURE;
  }

  if ((start_pin <0) || (start_pin > 79)) {
    (void)lm_error("Illegal pin number %d\n", start_pin);
    return FAILURE;
  }

  get_pattern_preamble(start_pattern, preamble_array);
  x.x = preamble_array[start_pin].x;
  format = x.b.format;
  toggle = x.b.toggle;
  sdlen = (~x.b.sdlen) & 0xf;
  sdhen = x.b.sdhen;
  reset = x.b.reset;
  set = x.b.set + 2;
  doff = x.b.doff;
  hddis = (~x.b.hddis) & 0x1;
  lcycmd = (~x.b.lcycmd) & 0x1;
  lcychd = (~x.b.lcychd) & 0x1;
  seqmd = (~x.b.seqmd) & 0x1;
  seqhd = (~x.b.seqhd) & 0x1;
  hmden = (~x.b.hmden) & 0x1;

  diag_get_ulong(&format, "data format: 0->RC, 1->RZ, 2->R1, 3->DNRZ", 0l, 3l);
  diag_get_ulong(&toggle, "toggle", 0l, 1l);
  diag_get_ulong(&sdlen, "sdlen", 0l, 15l);
  diag_get_ulong(&sdhen, "sdhen", 0l, 15l);
  diag_get_ulong(&reset, "reset edge", 0l, 3l);
  diag_get_ulong(&set, "set edge", 2l, 5l);
  diag_get_ulong(&doff, "driver off edge: 0->0, 1->5", 0l, 1l);
```

Copyright 1989 Logic Modeling Systems

| SOURCE PROGRAM | DATE | TIME | PAGE # |
|---|---|---|---|
| diags/pel_pattern.c | 5/23/89 | 4:41:28 pm | 6/135 |

LINE # SOURCE TEXT

```
    diag_get_ulong(&hddis, "hddis", 01, 11);
    diag_get_ulong(&lcycmd, "lcycmd", 01, 11);
    diag_get_ulong(&lcychd, "lcychd", 01, 11);
    diag_get_ulong(&seqmd, "seqmd", 01, 11);
    diag_get_ulong(&seqhd, "seqhd", 01, 11);
    diag_get_ulong(&hmden, "hmden", 01, 11);
    x.b.format = format;
    x.b.toggle = toggle;
    x.b.adles = ~adles;
    x.b.adhen = adhen;
    x.b.reset = reset;
    x.b.set = set - 2;
    x.b.doff = doff;
    x.b.hddis = ~hddis;
    x.b.lcycmd = ~lcycmd;
    x.b.lcychd = ~lcychd;
    x.b.seqmd = ~seqmd;
    x.b.seqhd = ~seqhd;
    x.b.hmden = ~hmden;
    lm_message("%X\n", x.x);

    do {
      lm_message("%d ... %d\n", start_pin, end_pin);

      if ((start_pin <0) || (start_pin > 79)) {
        (void)lm_error("Illegal pin number %d\n", start_pin);
        return FAILURE;
      }

      if ((end_pin <0) || (end_pin > 79)) {
        (void)lm_error("Illegal pin number %d\n", end_pin);
        return FAILURE;
      }
      for (pin = start_pin; pin <= end_pin; ++pin) {
          preamble_array[pin].x = x.x;
      }
    } while (s = get_range(s, &start_pin, &end_pin));

    set_pattern_preamble(start_pattern, preamble_array);
    return SUCCESS;
  }

 char *preamble_bit_meaning[] = {
          "start preamble",
          "format",
          "\" \"",
          "toggle",
          "adles*",
          "\" \"",
          "\" \"",
          "\" \"",
          "adhen",
          "\" \"",
          "\" \"",
          "\" \"",
          "(shift)",
          "",
          "reset",
          "\" \"",
          "set",
          "\" \"",
          "doff",
          "hddis*",
          "lcycmd*",
          "lcychd*",
          "seqmd*",
          "seqhd*",
          "",
          "",
          "hmden*",
          "end preamble",
 };

print_preamble_line_meaning(bit)
{
        if ((bit >= 0) && (bit < PREAMBLE_SIZE)) {
                lm_message(preamble_bit_meaning[bit]);
        }
}

display_pattern_string_code()
{
  char buffer[80];
  long start_pattern, end_pattern, this_end;
  int count, origin;

  start_pattern = 0;
  end_pattern = pac[current_lane].num_patterns - 1;
  diag_get_long(&start_pattern, "start pattern", start_pattern, end_pattern);
  diag_get_long(&end_pattern, "end pattern", start_pattern, end_pattern);

  count = 0;
  origin = start_pattern;
  for (this_end = start_pattern + 31; start_pattern < end_pattern;
    start_pattern += 32, this_end += 32) {
      if (this_end > end_pattern) this_end = end_pattern;
      lm_message("%10d: ", start_pattern);
      pel_get_pattern_string(start_pattern, this_end, buffer);
      lm_message("%s\n", buffer);

      if ((start_pattern < end_pattern) && !(++count % 20)) {
        if (!(count = more((int)(start_pattern - origin),
          (end_pattern - origin), count)))
          break;
      }
  }
  return SUCCESS;
}

pel_get_pattern_string(start_pattern, end_pattern, s)
u_long start_pattern, end_pattern;
char *s;
{
  PAT_WORD patptr;
  u_long pattern;

  for (pattern = start_pattern; pattern <= end_pattern; ++pattern) {
    pel_read_pattern(pattern, &patptr);
    if (!(*s = pel_encode_string_pattern(patptr.pattern.data)))
          *s = '?';
```

Copyright 1989 Logic Modeling Systems

SOURCE PROGRAM diags/pel_pattern.c

DATE 5/23/89 TIME 4:41:28 pm PAGE # 7/136

LINE # SOURCE TEXT

```
        ++s;
        *s++ = '0' + patptr.pattern.pel_control;
    }
    *s = '\0';
    return SUCCESS;
}

display_pattern_memory()
{
      register int i, count;
      PAT_WORD patptr;
      long start_pattern, stop_pattern, start_preamble;
      char pattern_string[3];

    start_pattern = 0;
    stop_pattern = pac[current_lane].num_patterns - 1;
    diag_get_long(&start_pattern, "start pattern", start_pattern, stop_pattern);
    diag_get_long(&stop_pattern, "stop pattern", start_pattern, stop_pattern);

      start_preamble = stop_pattern +1; /* don't display preamble bits
                                            if no preamble */
      for (i = start_pattern, count = 0; i <= stop_pattern; ++i) {
          pel_read_pattern(i, &patptr);
          lm_message("%10d: %04X %04X %04X %04X %04X :",
              i,
              patptr.pattern.data[0],
              patptr.pattern.data[1],
              patptr.pattern.data[2],
              patptr.pattern.data[3],
              patptr.pattern.data[4]);
          lm_message(" PA%02d", patptr.pattern.pel_address);
          lm_message(" PC%d", patptr.pattern.pel_control);
          switch (patptr.pattern.branch) {
              case 1: lm_message(" BA"); break;
              case 2: lm_message(" BF"); break;
              case 3: lm_message(" BR"); break;
              default: lm_message("   "); break;
          }
          lm_message("%5s ", (patptr.pattern.stop)? "STOP": "");
          lm_message("%5s ", (patptr.pattern.user)? "USER": "");
          pel_get_pattern_string(i, i, pattern_string);
          lm_message("%s ", pattern_string);

          if (patptr.pattern.pel_control == 2)
            start_preamble = i; /* start of preamble */
          print_preamble_line_meaning(i - start_preamble);
          lm_message("\n");
          if ((i < stop_pattern) && !(++count % 20)) {
            if (!(count = more(i-(int)start_pattern,
              stop_pattern-start_pattern, count)))
              break;
          }
      }
}

pel_read_pattern(pattern, patptr)
int pattern;
PAT_WORD *patptr;
{
  extern u_long *Host_memory;
  register u_long i, *mem;

  if (!Host) return pac_read_pattern(pattern, patptr);

  /* Check if pattern number is valid */
  if((pattern < 0) || (pattern > 0x40000))
    return(FAILURE);

  mem = &(Host_memory[4 * pattern]);

  /* Read pattern word */
  for (i = 0; i < 3; ++i)
    patptr->mem_bank[i] = *mem++;
  return(SUCCESS);
}

pel_write_pattern(pattern, patptr)
int pattern;
PAT_WORD *patptr;
{
  extern u_long *Host_memory;
  register u_long i, *mem;

  if (!Host) return pac_write_pattern(pattern, patptr);

  /* Check if pattern number is valid */
  if((pattern < 0) || (pattern > 0x40000))
    return(FAILURE);

  mem = &(Host_memory[4 * pattern]);

  /* Read pattern word */
  for (i = 0; i < 3; ++i)
    *mem++ = patptr->mem_bank[i];
  return(SUCCESS);
}

pel_build_pattern_control(first_pattern_no,pattern_count,mode)
{
  if (Host) return SUCCESS;
  return build_pattern_control(first_pattern_no,pattern_count,mode);
}


char  *Soft_pattern[2] = {
     "z2f5f5z5%c5%c5%c5%c5z5z5z5z5z1u5z5z5z5z5f5f5f5z5V5f6f7z6f7f7U7",
     "z2f5f5z5f5f5f5f5%c5%c5%c5%c5z1u5z5z5z5z5f5f5f5z5V5f6f7z6f7f7f7"
};

char Magic_soft_select[5][2] = {
     'A', '0',
     'B', '1',
     'C', '2',
     'D', '3',
     'E', '4'
};

char No_soft_driver[2] = {
     'f', 'z'
};
```

Copyright 1989
Logic Modeling Systems

LINE # SOURCE TEXT

```
load_drive_soft(magic, value, soft_drivers)
int magic, value, soft_drivers;
{
    char pattern_sequence[70], c[4];
    int i;

    for (i = 0; i < 4; i++) {
        if (soft_drivers & 1)
            c[i] = Magic_soft_select[magic][value];
        else
            c[i] = No_soft_driver[value];
        soft_drivers = soft_drivers >> 1;
    }

    sprintf(pattern_sequence, Soft_pattern[value], c[0], c[1], c[2], c[3]);

    if (pel_play_pattern_string(pattern_sequence, 0) == FAILURE) {
        (void)pel_error("Unable to load Soft-Driver Evaluation test pattern.\n");
        return (FAILURE);
    }
}



find_voltage(bit, voltage, dutvcc)
int bit;
float *voltage, dutvcc;
{
    int i, mask;
    float hi, lo;
    register PEL *pel = (PEL *)(pel_addr(current_lane, current_pel));

    hi = dutvcc;
    lo = 0.0;
    *voltage = (hi + lo) / 2.0;

    mask = 1 << bit;

    for (i = 0; i < 8; i++) {
        if (*voltage > 2.0) {    /* only set voltage for comparator to be used */
            if (set_vlogh(*voltage) == FAILURE) return(FAILURE);
            if (set_vlogl(0.0) == FAILURE) return(FAILURE);
        } else {
            if (set_vlogh(dutvcc - 0.1) == FAILURE) return(FAILURE);
            if (set_vlogl(*voltage) == FAILURE) return(FAILURE);
        }

        if (diag_play() == FAILURE) {
            (void)pel_error("Unable to play Soft-Driver Evaluation test pattern.\n");
            return(FAILURE);
        }

        if (*voltage > 2.0) {    /* use vlogh comparator (value) */
            if (pel->magic_chip[0].reg[11] & mask) {
                lo = *voltage;
            } else {
                hi = *voltage;
            }
        } else {                 /* use vlogl comparator (0)     */
            if (pel->magic_chip[0].reg[9] & mask) {
                lo = *voltage;
            } else {
                hi = *voltage;
            }
        }

        *voltage = (hi + lo) / 2.0;
    }

    return(SUCCESS);
}



set_soft_drive_user_bit(value)
int value;
{
    PAT_WORD pattern_word, *patptr = &pattern_word;
    int pattern_no, tmp;

    pattern_no = (strlen(Soft_pattern[0]) >> 1) - 3;

    (void)pac_read_pattern(pattern_no, patptr);
    patptr->pattern.user = value;
    (void)pac_write_pattern(pattern_no, patptr);
}


float Resistance[12] = {0.0, 0.0, 0.0, 0.0, 0.0, 0.0, 0.0, 0.0,
                        200.0, 1000.0, 4700.0, 15000.0 };

#define FORWARD 0
#define REVERSE 1

eval_current(value, direction, vsl, vsh)
int value, direction;
float vsl, vsh;
{
    int bit;
    float voltage, current, dutvcc;
    register PEL *pel = (PEL *)(pel_addr(current_lane, current_pel));

    set_soft_drive_user_bit(value ^ direction ^ 1);
    get_dutvcc(&dutvcc);

    lm_message("#####  ");
    if (direction == FORWARD) {
        lm_message("FORWARD");
        pel->vsh_dac = 0xff;
        pel->vsl_dac = 0x00;
    } else {
        if (set_vsl(0.4) == FAILURE) return(FAILURE);
        if (set_vsh(2.9) == FAILURE) return(FAILURE);
        lm_message("REVERSE  ##  ");
        if (value == 0)
            lm_message("VSL = %5.2f", vsl);
        else
```

Copyright 1989
Logic Modeling Systems

SOURCE PROGRAM
diags/pel_pattern.c

DATE 5/23/89
TIME 4:41:28 pm

LINE # SOURCE TEXT

```
            lm_message("VSE = %5.2f", vsh);
    }
    lm_message("  ##  DUTVCC = %5.2f  #####\n", dutvcc);

    for (bit = 8; bit < 12; bit++) {
        if (find_voltage(bit, &voltage, dutvcc) == FAILURE) return(FAILURE);
            if (value == direction) {
                current = (dutvcc - voltage) / Resistance[bit] * 1000.0;
            } else {
                current = voltage / Resistance[bit] * 1000.0;
            }
            lm_message("bit %2d, voltage = %5.2f, current = %5.2f, resistance = %4.1fK\n",
                bit, voltage, current, Resistance[bit] / 1000.0);
    }

    return(SUCCESS);
}



pel_eval_soft_drivers()
{
    register PEL *pel
        = (PEL *)(pel_addr(current_lane, current_pel));
    int magic, value, soft_drivers;

    if(diag_clear_errors() != SUCCESS)
        return(FAILURE);

    if (pel_diag_dab_test_init(PUBLIC_DAB) != SUCCESS) {
        (void)pel_error("Unable to initialize PEL/DAB for Soft-Driver evaluation.\n");
        return(FAILURE);
    }

    pel->car.bit.eeprom_sel = 1;        /* turn on resistors on DIAGDAB */

    for (magic = 0; magic < 5; magic++) {
        lm_message("\n*****  Testing MAGIC[%x]  *****\n", magic);
        for (value = 0; value < 2; value++) {
            for (soft_drivers = 1; soft_drivers < 16; soft_drivers++) {
                lm_message("Testing % Soft-Drivers 0x%x\n", soft_drivers);
                if (load_drive_soft(magic, value, soft_drivers) == FAILURE) return(FAILURE);
                if (eval_current(value, FORWARD, 0.0, 0.0) == FAILURE) return(FAILURE);
                if (eval_current(value, REVERSE, 0.4, 2.9) == FAILURE) return(FAILURE);
            }
        }
    }
    return(SUCCESS);
}
```

Copyright 1989 Logic Modeling Systems

HEADER FILE diags/pel_preamble.h | DATE 5/23/89 | TIME 4:41:29 pm | PAGE # 1/139

LINE # HEADER TEXT

```
/* SCCS_ID: pel_preamble.h rev 3.1, 4/24/89 at 07:50:22      */

typedef struct {
                /* during the first real pattern                */
        unsigned :4,
        :1,  /* needed because MC will not turn on properly  */
        hmden:1,
        :2, /* needed to initialize SDOE/MDOE */
        seqhd:1,
        seqmd:1,
        lcychd:1,
        lcycmd:1,
        hddis:1,
        doff:1,
        set:2,
        reset:2,
        ctl_out:1,
        load_sden:1,  /* used to load the SDEN/FORMAT registers */
        adhen:4,
        adlen:4,
        toggle:1,
        format:2,
        select_pel:1;
} PEL_PREAMBLE;

typedef union {
        PEL_PREAMBLE b;
        unsigned long x;
} preamble;

#define PREAMBLE_SIZE   28
```

Copyright 1989 Logic Modeling Systems

SOURCE PROGRAM diags/pel_sst.c | DATE 5/23/89 | TIME 4:41:29 pm | PAGE # 1/140

LINE # SOURCE TEXT

```
/* SCCS_ID: pel_sst.c rev 3.1, 4/24/89 at 07:50:25 */

#include "common.h"
#include "mod_def.h"
#include "modeler_exts.h"
#include "vrtx.h"
#include "lm_diags.h"
#include "tmg.h"
#include "tmg_exts.h"
#include "tmg_def.h"
#include "pac.h"
#include "pac_def.h"
#include "pac_exts.h"
#include "magic.h"
#include "pel.h"
#include "pel_preamble.h"

long pel_sst_debug = 0;

/* short sensor delay is spec'd at 200 ns minimum. */

#ifdef info

        /*
        The way we test this puppy is to create a preamble similar to
        the one used in the crc test, but having all pins using the R1
        clock, all hard and medium drivers on, all data bits going the
        same way.

        Then I change one pin and see that the short sensors
        don't come on after a short pulse (200ns) and that they do
        come on after a relatively long time (1 uS).

        Anyway, I walk a 1 through all of the data pins to verify
        that the sensors trip when they should (1us pulse) and
        don't when they're not (200ns pulse).

        Then I walk a zero across the pins.

        I then move the edges around to find where the short
        sensor trips.
        */
#endif info

pel_short_sensor_test()
{
  long byte, trip, walking_zeros, retval = SUCCESS;
  register char *pattern_string;
  static long edgetime[6] = {
    200000, 00000, 000000, 00000, 00000, 0
  };

  if(diag_clear_errors() != SUCCESS)
    return(FAILURE);

  if (pel_lane_init() != SUCCESS) {  /* set up pac/tmg/pel/dab */
    (void)lm_error("Unable to initialize lane %c\n", current_lane + 'A');
    return(FAILURE);
  }

  if (pel_dab_init(PUBLIC_DAB) != SUCCESS) {
    (void)lm_error("Unable to initialize DAB %c, PEL %d\n",
        current_lane + 'A', current_pel);
    return(FAILURE);
  }

  if (set_vlogl(0.8) == FAILURE) return(FAILURE);
  if (set_vlogh(2.0) == FAILURE) return(FAILURE);
  if (set_vlth(0.3) == FAILURE) return(FAILURE);
  if (set_vsl(0.4) == FAILURE) return(FAILURE);
  if (set_vsh(4.0) == FAILURE) return(FAILURE);
  if (set_vhth(4.4) == FAILURE) return(FAILURE);

  lm_message("Playing patterns");
  for (walking_zeros = 0; walking_zeros < 2; ++walking_zeros) {
    for (trip = 0; trip < 2; ++trip) {
      lm_message(".");
      if (trip) {
        /* long pulse should make sensor trip */
        edgetime[0] = 1000000;
      } else {
        /* short pulse should not make sensor trip */
        edgetime[0] = 200000;
      }

      if (tmg_set_timing(15000001, edgetime, 01, 1500001, 25000001)
          != SUCCESS) {
        return FAILURE;
      }
      for (byte = 0; byte < 2; ++byte) {

        if (walking_zeros) {
          pattern_string = byte?
            "r2f5r5r5f5f5f5f5r5r5r5r5r1r5r5r5r5r5f5f5f5f5U5U5f6f7r6V7V7V7":
            "r2f5r5r5f5f5f5f5r5r5r5r5r1r5r5r5r5r5f5f5f5f5r5r5f6f7r6q7q7q7";
        } else {
          pattern_string = byte?
            "r2f5r5r5f5f5f5f5r5r5r5r5r1r5r5r5r5r5f5f5f5f5U5U5f6f7r6r7r7r7":
            "r2f5r5r5f5 '5f5r5r5r5r5r1r5r5r5r5r5f5f5f5f5r5r5f6f7r6r7r7r7";
        }

        if ((build_pattern_data(pattern_string, 0)) == 0) {
          (void)pel_error("Unable to build pattern data\n");
          return (FAILURE);
        }

        if (build_pattern_control(0,
            strlen(pattern_string)/2, STOP_MODE) != SUCCESS) {
          (void)pel_error("Could not build control string\n");
          return(FAILURE);
        }
        if (pel_short_byte(byte, trip) != SUCCESS) {
          lm_error("Lane %c Pel %d: trip %d byte %d short byte failed\n",
            current_lane + 'A', current_pel, trip, byte);
          retval = FAILURE;
        }
      }
    }
  }
  lm_message("done.\n");
```

Copyright 1989 Logic Modeling Systems

| SOURCE PROGRAM | DATE | PAGE # |
|---|---|---|
| diags/pel_sst.c | 5/23/89 TIME 4:41:29 pm | 2/141 |

LINE # SOURCE TEXT

```
    if (pel_short_sensor_measure() != SUCCESS) {
      pel_error("Short sensor measure failed\n");
      retval = FAILURE;
    }
    return retval;
}

pel_short_byte(byte, trip)
{
      int retval = SUCCESS, time_out, play_status;
      register long chip, bit, pin;
      register PEL *pel = (PEL *)(pel_addr(current_lane, current_pel));

      /* long pulse should make sensor trip */

      if((time_out = pac_pre_play()) == 0)
      {
        (void)pel_error("Unable to prepare for play.\n");
        return(FAILURE);
      }

      for (chip = 0; chip < 5; ++chip) {
          for (bit = 0; bit < 8; ++bit) {
              pin = chip * 16 + byte * 8 + bit;

              toggle_pattern_bit(22, pin);        /* turn off SEQMD* for shorted pin      */
              toggle_pattern_bit(28, pin);

              /* clear pel errors */
              pel_clear_pel_errors();

              /* disable backplane errors */
              pel->car.bit.magic_error_enableL = 1;

              play_status = pac_play(time_out);
              if ((pel_sst_debug & 1))
                      tmq_play_til_key();
              if (play_status == FAILURE) {
                  (void)lm_error("Lane %c Pel %d: Play error trip %d byte %d chip %d bit %d\n",
                      current_lane + 'A', current_pel,
                      trip, byte, chip, bit);
                  pac_play_cleanup();
                  return(FAILURE);
              }

              if (report_bp_error()) {
                  (void)lm_error("Lane %c Pel %d: Unexpected backplane error from pin %d play\n",
                      current_lane + 'A', current_pel,
                      pin);
                  return(FAILURE);
              }
              if (check_short_status(pin, trip) != SUCCESS) {
                  retval = FAILURE;
                  if (lm_error("Lane %c Pel %d Chip %d: Pin %d short sensor %s\n",
                      current_lane + 'A', current_pel, chip,
                      pin,
                      trip? "did not trip" : "tripped") != SUCCESS)
                      return FAILURE;
              }
              toggle_pattern_bit(22, pin);        /* turn back on SEQMD* after shorting   */
              toggle_pattern_bit(28, pin);
          }
      }
      return retval;
}

set_pattern_bit(pattern, pin, value)
{
/*
**  |     Bank 0       |     Bank 1       |     Bank 2       |
**  |        :         |        :         |        :         |
**  |31      :        0|31      :        0|31      :        0|
**  |        :         |        :         |        :         |
**  |pin 79 ............................... pin 0|control|
*/
  PAT_WORD patptr;
  register long bank = 2 - ((pin + 16) >> 5);
  register long mask = 1 << ((pin + 16) & 0x1f);

  (void)pac_read_pattern(pattern, &patptr);

  patptr.mem_bank[bank] = (value & 1)?
    patptr.mem_bank[bank] | mask:
    patptr.mem_bank[bank] & ~mask;

  (void)pac_write_pattern(pattern, &patptr);
}

toggle_pattern_bit(pattern, pin)
{
/*
**  |     Bank 0       |     Bank 1       |     Bank 2       |
**  |        :         |        :         |        :         |
**  |31      :        0|31      :        0|31      :        0|
**  |        :         |        :         |        :         |
**  |pin 79 ............................... pin 0|control|
*/
  PAT_WORD patptr;
  register long bank = 2 - ((pin + 16) >> 5);
  register long mask = 1 << ((pin + 16) & 0x1f);
  register long value;

  (void)pac_read_pattern(pattern, &patptr);

  value = ((patptr.mem_bank[bank] & mask) == 0);

  patptr.mem_bank[bank] = (value & 1)?
    patptr.mem_bank[bank] | mask:
    patptr.mem_bank[bank] & ~mask;

  (void)pac_write_pattern(pattern, &patptr);
}

check_short_status(pin, trip)
{
    register long retval;
    register PEL *pel = (PEL *)(pel_addr(current_lane, current_pel));

    if (pel->car.bit.magic_errorL == 0) {
      retval = identify_shorted_pin(trip?pin:-1); /* short sample register */
```

Copyright 1989 Logic Modeling Systems

| SOURCE PROGRAM | DATE | PAGE # |
|---|---|---|
| diags/pel_sst.c | 5/23/89<br>TIME 4:41:29 pm | 3/142 |

LINE # SOURCE TEXT

```
    } else retval = trip? FAILURE : SUCCESS;

    /* clear pel errors */
    pel_clear_pel_errors();

    /* enable backplane errors */
    pel->car.bit.magic_error_enableL = 0;

    return retval;
}

/* identify_shorted_pin returns SUCCESS iff the one pin tripped */

identify_shorted_pin(pin)
{
    register PEL *pel = (PEL *)(pel_addr(current_lane, current_pel));
    register long chip, pinchip, bit;
    short word, pinword, error;
    long error_pin, retval = SUCCESS;

    if (pel_sst_debug & 4) {
        for (chip = 0; chip < 5; ++chip) {
            lm_message("%04X ", pel->magic_chip[chip].reg[8] & 0xffff);
        }
        lm_message("\n");
    }

    if (pin != -1) {
        pinchip = pin >> 4;
        pinword = (1 << (pin & 0xf));
    } else {
        pinchip = 0;
        pinword = 0;
    }

    for (chip = 0; chip < 5; ++chip) {
        word = pel->magic_chip[chip].reg[8];
        if (!(error = (chip == pinchip)? word ^ pinword : word))
            continue;
        retval = FAILURE;
        for (bit = 0; bit < 16; ++bit) {
            if (error & (1 << bit)) {
                error_pin = bit + 16 * chip;
                if (error_pin != pin) {
                    if (lm_error("Lane %c Pel %d Pin %d (chip %d bit %d) shorted on pin %d test.\n",
                      current_lane + 'A', current_pel,
                      error_pin,
                      chip, bit,
                      pin) == FAILURE)
                        return FAILURE;
                } else {
                    if (lm_error("Lane %c Pel %d Pin %d (chip %d bit %d) did not trip.\n",
                      current_lane + 'A', current_pel,
                      error_pin, chip, bit) == FAILURE)
                        return FAILURE;
                }
            }
        }
    }
    return retval;
}

pel_reset_all_pels_in_lane()
{
        register PEL *pel;
        register int pelno;

        for (pelno=0; pelno < NUMBER_OF_PELS; ++pelno) {
                if (probe_pel(current_lane, pelno) == SUCCESS) {
                        pel = (PEL *)(pel_addr(current_lane, pelno));
                        pel->car.bit.resetL = 0;
                }
        }
        lm_message("\n");
}

pel_clear_pel_errors()
{
    short dummy;
    register PEL *pel = (PEL *)(pel_addr(current_lane, current_pel));
    /* clear pel errors */

    dummy = pel->magic_chip[0].reg[15];
    pel->car.bit.resetL = 0;
    pel->car.bit.resetL = 1;
    return (int)dummy; /* shut lint up */
}

/* the following functions are used to measure short trip time */

pel_short_sensor_measure()
{
    long byte, timeout, retval = SUCCESS;
    register char *pattern_string;
    long chip, bit, pin, time;
    long min_time, max_time;

    if (pel_lane_init() != SUCCESS) {    /* set up pec/tmg/pel/dab */
        (void)lm_error("Unable to initialize lane %c\n", current_lane + 'A');
        return(FAILURE);
    }

    if (pel_dab_init(PUBLIC_DAB) != SUCCESS) {
        (void)lm_error("Unable to initialize DAB at Lane %c, PEL %d\n",
            current_lane + 'A', current_pel);
        return(FAILURE);
    }

    if (set_vlogl(0.8) == FAILURE) return(FAILURE);
    if (set_vlogh(2.0) == FAILURE) return(FAILURE);
    if (set_vlth(0.3) == FAILURE) return(FAILURE);
    if (set_vsl(0.4) == FAILURE) return(FAILURE);
    if (set_vsh(4.0) == FAILURE) return(FAILURE);
    if (set_vhth(4.4) == FAILURE) return(FAILURE);

    min_time = 10000000; /* impossibly large */
    max_time = 0; /* impossibly small */
    lm_message("Measuring trip times");
    for (byte = 0; byte < 2; ++byte) {
        pattern_string = byte?
```

Copyright 1989
Logic Modeling Systems

SOURCE PROGRAM diags/pel_sst.c

DATE 5/23/89 TIME 4:41:29 pm

LINE # SOURCE TEXT

```
            "z2f5z5z5f5f5f5z5z5z5z5z1z5z5z5z5z5f5f5f5f5U5U5f6f7z6z7z7z7":
            "z2f5r5z5f5f5f5z5z5z5z5z1z5z5z5z5z5f5f5f5z5z5f6f7z6r7r7r7";
        if ((build_pattern_data(pattern_string, 0)) == 0) {
            (void)pel_error("Unable to build pattern data\n");
            return (FAILURE).
        }
        if (build_pattern_control(0,
            strlen(pattern_string)/2, STOP_MODE) != SUCCESS) {
            (void)pel_error("Could not build control string\n");
            return(FAILURE);
        }
        if((timeout = pec_pre_play()) == 0)
        {
            (void)pel_error("Unable to prepare for play.\n");
            return(FAILURE);
        }

        for (chip = 0, chip < 5; ++chip) {
            lm_message(".");
            for (bit = 0; bit < 8, ++bit) {
                pin = chip * 16 + byte * 8 + bit;
                set_pattern_bit(28, pin, 1);
                if (!(time = pel_measure_pin_short_sensor(pin,timeout))) {
                    (void)lm_error("Error playing to pin %d\n", pin);
                }
                set_pattern_bit(28, pin, 0);
                if (pel_sst_debug & 2)
                    lm_message("pin %2d: %6dns\n", pin, time/1000);
                if (time > max_time) max_time = time;
                if (time < min_time) min_time = time;
            }
        }
    }
    lm_message("done.\n");
    lm_message("minimum trip time = %dns\n", min_time/1000);
    lm_message("maximum trip time = %dns\n", max_time/1000);
    return retval;
}

pel_measure_pin_short_sensor(pin,timeout)
{
    long play_status, delta;
    register PEL *pel = (PEL *)(pel_addr(current_lane, current_pel));
    long lower_limit = 0, upper_limit = 2000000,
    long time;
    static long edgetime[6] = {
        500000, 00000, 000000, 00000, 00000, 0
    };

    /* clear pel errors */
    pel_clear_pel_errors();

    for (delta = upper_limit - lower_limit; delta > 10000;
        delta = upper_limit - lower_limit) {
        time = lower_limit + delta/2;

        edgetime[0] = time;

        if (tmg_set_timing(3*time/2, edgetime, 01, 1500001, 25000001)
            != SUCCESS) {
            return FAILURE;
        }
        /* disable backplane errors */
        pel->car.bit.magic_error_enableL = 1;

        play_status = pec_play(timeout);
        if (play_status == FAILURE) {
            (void)pel_error("play failed\n");
            pec_play_cleanup();
            return 0;
        }

        if (report_bp_error()) {
            (void)pel_error("backplane error\n");
            return(0);
        }

        if (check_short_status(pin,1) == SUCCESS) {
            /* too long */
            upper_limit = time;
        } else {
            /* too short */
            lower_limit = time;
        }
    }
    return time;
}
```

Copyright 1989
Logic Modeling Systems

SOURCE PROGRAM diags/pel_util.c

DATE 5/23/89 TIME 4:41:30 pm

LINE # SOURCE TEXT

```
/* SCCS_ID: pel_util.c rev 3.1, 4/24/89 at 07:50:28 */

/*************************************************************************
 *
 *      PEL utiliti-
 *      used in PEL di-_-ostics
 *
 *************************************************************************/

#include <math.h>
#include "common.h"
#include "mod_def.h"
#include "modeler_exts.h"
#include "vrtx.h"
#include "lm_diags.h"
#include "tmg.h"
#include "tmg_exts.h"
#include "tmg_def.h"
#include "pac.h"
#include "pac_def.h"
#include "pac_exts.h"
#include "magic.h"
#include "pel.h"

/*      void flush_key_buf()
 *
 *      INPUT:  none
 *      OUTPUT: none
 *      DESCRIPTION: Clears key buffer.
 */
flush_key_buf()
{
  while(lm_check_key() != 0)
    lm_get_key();
}

/*      pel_tmg_init(void)
 *
 *      This function initializes the Timing Generator to default
 *      settings.
 *
 *      Inputs: none
 *      Outputs: function returns SUCCESS or FAILURE
 */
pel_tmg_init()
{
    long edgetime[6];

    lm_message("\nInitializing Timing Generator to Defaults\n");

    if (tmg_restore_calibration() != SUCCESS) {
        return FAILURE;
    }

    /*
     * These timings are absolutely critical to a number of different tests. They
     * should never get changed!!!
     */
    edgetime[0] = 5000;
    edgetime[1] = 5000;
    edgetime[2] = 5000;
    edgetime[3] = 15000;
    edgetime[4] = 5000;
    edgetime[5] = 0;
    if (tmg_set_tim ng(400001, edgetime, 01, 1000001, 80000001) != SUCCESS) {
        return FAILURE;
    }

    Lane_select(Lane_code(current_lane));

    lm_delay(1);        /* wait for PLL to lock */
    return(SUCCESS);
}

/*      pel_pac_init(void)
 *
 *      This function initializes the PAC
 *
 *      Inputs: none
 *      Outputs: function returns SUCCESS or FAILURE
 */
pel_pac_init()
{
    if (pac[current_lane].exists == TRUE) {
        if (pac_stack_pams(current_lane) != SUCCESS) {
            (void)pel_error("Unable to set up pattern memory.\n");
            return(FAILURE);
        }
    } else {
        (void)pel_error("There is no Pattern Controller in this lane.\n");
        return(FAILURE);
    }

    Clear_pac_errors(current_lane);

    return(SUCCESS);
}


/*      pel_dab_init()
 *
 *      This function initializes the DAB
 *
 *      Inputs: none
 *      Outputs: function returns SUCCESS or FAILURE
 */
pel_dab_init(mode)
int mode;
{
    register PEL *pel
        = (PEL *)(pel_addr(current_lane, current_pel));
    u_short  dummy;

    dummy = pel->magic_chip[0].reg[15];        /* reset MAGIC chip errors */

    pel->csr.bit.resetL = 0;                   /* reset the PEL */
    pel->csr.bit.initialize = 0;
    pel->csr.bit.eeprom_in = 0;
    pel->csr.bit.eeprom_clk = 0;
    pel->csr.bit.eeprom_sel = 0;
```

Copyright 1989 Logic Modeling Systems

| SOURCE PROGRAM | DATE | PAGE # |
|---|---|---|
| diags/pel_util.c | 5/23/89 | 2/145 |
| | TIME 4:41:30 pm | |

LINE # SOURCE TEXT

```
    pel->car.bit.magic_error_enableL = 0;

    pel->car.bit.is_use_led = 1;
    pel->car.bit.initialize = 1;
    pel->car.bit.resetL = 1;

    if (mode == PUBLIC_DAB) {
        pel->car.bit.private = 0;
        if (pel->car.reg != 0xff13) {
            (void)pel_error("Unable to initialize PUBLIC DAB\n");
            return(FAILURE);
        }
    } else {    /* mode = PRIVATE        */
        pel->car.bit.private = 1;
        if (pel->car.reg != 0xff17) {
            (void)pel_error("Unable to initialize PRIVATE DAB\n");
            return(FAILURE);
        }
    }
#ifdef lint
    if (dummy); /* shut lint up */
#endif lint

    return(SUCCESS);
}



/*      pel_lane_init(void)
 *
 *      This function initializes the lane (and the current PEL)
 *
 *      Inputs: none
 *      Outputs: function returns SUCCESS or FAILURE
 */
pel_lane_init()
{
    /* Clear any PEL errors which may be present */
    pel_clear_pel_errors();

    if (pel_tmg_init() != SUCCESS) {
        (void)pel_error("Unable to initialize TMG\n");
        return(FAILURE);
    }

    if (pel_pac_init() != SUCCESS) {
        (void)pel_error("Unable to initialize PAC\n");
        return(FAILURE);
    }

    return(SUCCESS);
}

more(at, size, count)
{
  register long illegal;
  static char sol[] = "\b\b\b\b\b\b\b\b\b\b\b\b\b\b\b"; /* start of line */

  lm_message("--More--(%d%%)", 100*(1+at)/(1+size));
  do {
    illegal = 0;
    switch (lm_get_key()) {
      case 'q': lm_message("%s%15s\n", sol, ""); return 0; break;
      case '\n': --count; lm_message("%s",sol); break;
      case ' ': lm_message("%s", sol); break;
      default: lm_message("\007"); ++illegal; /* illegal char */
    }
    Clear_key_buf();
  } while (illegal);
  return count;
}

#define is_space(c)     (((c) == ' ') || ((c) == '\t'))
#define is_num(c)       (((c) >= '0') && ((c) <= '9'))

char *
get_range(s, from, to)
register char *s;
register u_long *from, *to;
{
  char buffer[128];
  register char *b;

  while (is_space(*s)) ++s;
  b = buffer;
  if (!is_num(*s)) return 0; /* syntax error */
  while (is_num(*s)) *b++ = *s++;
  *b = '\0';
  *from = *to = atoi(buffer);
  while (is_space(*s)) ++s;

  if (*s == '-') {
  /* range of values */
    ++s;
    while (is_space(*s)) ++s;
    b = buffer;
    if (!is_num(*s)) return 0; /* syntax error */
    while (is_num(*s)) *b++ = *s++;
    *b = '\0';
    *to = atoi(buffer);
    while (is_space(*s)) ++s;
  }

  if (*s == ',') ++s; /* optional comma separator */

  return s;
}

pel_set_timing()
{
    static long edgetime[6] = {
        10000, 10000, 10000, 15000, 10000, 0
    };
    static long period = 40000;
    long edge;
    char buffer[80];

    diag_get_long(&period, "Period", 400001, 0x7fffffffl);
    for (edge = 0; edge < 6; ++edge) {
        sprintf(buffer, "Edge %d", edge);
```

Copyright 1989
Logic Modeling Systems

SOURCE PROGRAM diags/pel_util.c | DATE 5/23/89 | TIME 4:41:30 pm | PAGE # 3/146

LINE # SOURCE TEXT

```
        diag_get_long(&(edgetime[edge]), buffer, 0l, period);
    }
    if (tmg_set_timing(period, edgetime, 0l, 1000001, 25000001) != SUCCESS) {
      return FAILURE;
    }
    return SUCCESS;
}

pel_set_voltages()
{
    long vlogl = 800;
    long vlogh = 2000;
    long vlth = 300;
    long val = 400;
    long vah = 4000;
    long vhth = 4400;

    do {
        diag_get_long(&vlogl, "vlogl (mv)", 0l, 12000l);
    } while (set_vlogl(0.001 * (float)(vlogl)) != SUCCESS);
    do {
        diag_get_long(&vlogh, "vlogh (mv)", 0l, 12000l);
    } while (set_vlogh(0.001 * (float)(vlogh)) != SUCCESS);
    do {
        diag_get_long(&vlth, "vlth (mv)", 0l, 12000l);
    } while (set_vlth(0.001 * (float)(vlth)) != SUCCESS);
    do {
        diag_get_long(&val, "val (mv)", 0l, 12000l);
    } while (set_val(0.001 * (float)(val)) != SUCCESS);
    do {
        diag_get_long(&vah, "vah (mv)", 0l, 12000l);
    } while (set_vah(0.001 * (float)(vah)) != SUCCESS);
    do {
        diag_get_long(&vhth, "vhth (mv)", 0l, 12000l);
    } while (set_vhth(0.001 * (float)(vhth)) != SUCCESS);
}

pel_loop_play()
{
    int time_out;

    flush_key_buf();

    if((time_out = pac_pre_play()) == 0)
    {
      (void)pel_error("Unable to prepare for looping play.\n");
      return(FAILURE);
    }

    lm_message("Hit key to stop...");

    while (!lm_check_key()) {
        if (pac_play(time_out) == FAILURE) {
              (void)pel_error("pel_play_pattern_string failed in pac_play.\n ");
              pac_play_cleanup();
              break;
        }
    }
    flush_key_buf();
    return(SUCCESS);
}
```

Copyright 1989
Logic Modeling Systems

| SOURCE PROGRAM | DATE | PAGE # |
|---|---|---|
| diags/probe.c | 5/23/89 | 1/147 |
| | TIME 4:41:30 pm | |

LINE # SOURCE TEXT

```
/* SCCS_ID: probe.c rev 3.1, 4/24/89 at 07:50:31 */

/************************************************************************
 *      probe.c                                                          *
 *                                                                       *
 *      Probe functi..                                                   *
 *      used in diagnostics                                              *
 *                                                                       *
 ************************************************************************/

#include <math.h>
#include "common.h"
#include "lm_diags.h"
#include "mod_def.h"
#include "vrtx.h"
#include "tmg.h"
#include "pac.h"
#include "magic.h"
#include "pel.h"

int
probe_tmg()
{
  if(lm_read_probe((long)(0x8e000000)) != SUCCESS)
  {
    (void)lm_warning("No Timing Generator installed.\n");
    return(FAILURE);
  }
  else
    return(SUCCESS);
}


int
probe_all_lanes()
{
  int lane_no;

  /* Reset backplane lanes */
  if(diag_tmg_reset(TRUE) != SUCCESS)
  {
    (void)lm_error("Could not reset backplane during lane probe.\n");
    return(FAILURE);
  }
  for(lane_no = 0; lane_no < NUMBER_OF_LANES; lane_no++)
  {
    if(probe_lane(lane_no) == SUCCESS)
      return(SUCCESS);
  }
  (void)lm_warning("There are no PACs or PELs installed.\n");
  return(FAILURE);
}


int
probe_lane(lane_no)
int lane_no;
{
  if((probe_pac(lane_no) == SUCCESS) || (probe_all_pels(lane_no) == SUCCESS))
    return(SUCCESS);
  else
    return(FAILURE);
}

int
probe_pac(lane_no)
int lane_no;
{
  if(lm_read_probe((long)(LANE_A_OFFSET + (lane_no * LANE_SIZE) +
   PAC_REG_OFFSET)) != SUCCESS)
    return(FAILURE);
  else
    return(SUCCESS);
}

int
probe_all_pels(lane_no)
int lane_no;
{
  int slot_no;

  for(slot_no = 0; slot_no < NUMBER_OF_SLOTS; slot_no++)
  {
    if(probe_pel(lane_no, slot_no) == SUCCESS)
      return(SUCCESS);
  }
  return(FAILURE);
}


int
probe_pel(lane_no, slot_no)
int lane_no;
int slot_no;
{
  if(lm_read_probe((long)(pel_addr(lane_no, slot_no))) != SUCCESS)
    return(FAILURE);
  else
    return(SUCCESS);
}
```

Copyright 1989
Logic Modeling Systems

SOURCE PROGRAM diags/tmg_cal.c

DATE 5/23/89 TIME 4:41:30 pm

PAGE # 1/148

LINE # SOURCE TEXT

```
/* SCCS_ID: tmg_cal.c rev 3.2, 5/9/89 at 15:54:16      */

/*********************************************************************
 *
 *       Calibration routines for the Timing Generator.              *
 *
 ********************************************************************/

#include <math.h>
#include "common.h"
#include "mod_def.h"
#include "modeler_exts.h"
#include "vrtx.h"
#include "tmg.h"
#include "tmg_def.h"
#include "tmg_exts.h"
#include "tmg_run.h"
#include "pac.h"
#include "pac_def.h"
#include "pac_exts.h"
#ifdef DIAGS
#include "diag_setjmp.h"
#endif DIAGS
#include "intr.h"

#ifndef DIAGS
#define lm_message      printf
#define lm_warning      printf
#define lm_error        printf
null_function(){}
#endif DIAGS

#ifdef HOST
#include "lm_diags.h"
#define lm_message      lm_message
#define lm_error        (++total_errors[current_depth], lm_message)
#define lm_warning      lm_message
static  long    current_depth = 0;
#endif HOST

#undef MIN_PERIOD
#define MIN_PERIOD 33333
#define BIN_LIMIT 100 /* binary search count limit */

static void tmg_assume_ninth();
static long tmg_longest_delay_edge();

long tmg_cal_debug = 0;
long tmg_reduction_factor = 82; /* % reduction for edge search */

#define tmg_detect_always_high(r, e, p, t, c, actual) \
                tmg_detect_edge(r, e, DETECT_BOOL, \
                        p, t, c, actual)

#define tmg_detect_always_low(r, e, p, t, c, actual) \
                tmg_detect_edge(r, e, DETECT_BOOL|DETECT_LOW, \
                        p, t, c, actual)

#define tmg_detect_sample_always_high(er, sr, p, t7, ts, c, actual) \
                tmg_detect_sample(er, sr, DETECT_BOOL|DETECT_SAMPLE, \
                        p, t7, ts, c, actual)

#define tmg_detect_sample_always_low(er, sr, p, t7, ts, c, actual) \
                tmg_detect_sample(er, sr, \
                DETECT_BOOL|DETECT_LOW|DETECT_SAMPLE, \
                        p, t7, ts, c, actual)

#define tmg_get_sramp()         (tmgptr->sample_delay_range)
#define tmg_set_sramp(sramp)    (tmgptr->sample_delay_range = (sramp))


#define CALIBRATION_DONE        0xDEADBEEF
/* XXXXX */
#undef tmg_set_threshold

tmg_set_threshold(edge, threshold)
int edge, threshold;
{
  int i, other_thresh;
  if(threshold < 128)
    other_thresh = 255;
  else
    other_thresh = 10;
  tmgptr->edge_delay[edge].delay = threshold;
  for(i = 0; i < 6; i++)
  {
    if(i == edge)
      continue;
    tmgptr->edge_delay[i].delay = other_thresh;
  }
}


tmg_calibrate()
{
        return tmg_do_calibrate(1);
}

tmg_recalibrate()
{
        return tmg_do_calibrate(0);
}

tmg_do_calibrate(destructive)
{
#ifdef info
    1. reset the clock board
    2. find the minimum threshold of the fast ramp for all edges
    3. set_min_thresh of ramp to ramp 0's value for all edges:
    4. calculate slope & offset of fast ramp (0) for each edge
    5. set the delay line
    6. Finally calibrate all edges of all ramps
    7. Next measure edge 7 and Sample's ninth
    8. Measure edge7 and sample ramps
    9. Measure sample offsets
    10. Measure Early mode sample offsets
#endif info
    INTR_INIT
    extern struct CALIB default_calib;
    static char me[] = "tmg_calibrate";
```

Copyright 1989
Logic Modeling Systems

| SOURCE PROGRAM | DATE | PAGE # |
|---|---|---|
| diags/tmg_cal.c | 5/23/89<br>TIME 4:41:30 pm | 2/149 |

LINE # SOURCE TEXT

```
    register long ramp, eramp, aramp, first_aramp, last_aramp, edge;
    long threshold, thresh7, threshs;
    char buffer[80];

    long errors = 0;

    INTR_BEGIN

    /* if destructive, we should do a backplane reset (diag_tmg_reset(TRUE)) */
    /* because a side affect of that is to do a pac_info_init */
    if(diag_tmg_reset(destructive ? TRUE : FALSE) != SUCCESS)
    {
        tmg_report_failure(me, "diag_tmg_reset");
        ++errors;
        goto cleanup;
    }

    /* find the minimum threshold of the fast ramp for all edges */

    tmg_set_delay(14);          /* delay = 6ns + 14ns */

    tmgptr->sample_mode = EDGE7SAMPLETRIGGERMODE;

    if (destructive) {
      tmgptr->backplane_resetL = 0; /* assert backplane reset */
      lm_message("Measuring edge minimum thresholds");
      for (edge = 0; edge < NUMBER_OF_EDGES; ++edge) {
          lm_message(".");
          if (tmg_measure_minth(01, edge, &threshold) != SUCCESS) {
              tmg_report_failure(me, "tmg_measure_minth");
              ++errors;
              if (!(tmg_cal_debug & 0x20000000))
                  goto cleanup;
          }
          calib.EdgeMinThresh[0][edge] = threshold + START_DEAD_TIME_FUDGE;
      }
      lm_message("Done\n");
    } else {
      if (!tmg_is_calibrated()) {
        for (edge = 0; edge < NUMBER_OF_EDGES; ++edge) {
            calib.EdgeMinThresh[0][edge] = default_calib.EdgeMinThresh[0][edge];
        }
      }
    }

    /* set_min_thresh of ramp to ramp 0's value for all edges: */
    tmg_assume_minth(&calib);

    lm_message("Measuring edge ramp slopes");

    for (ramp = 0; ramp < NUMBER_OF_ERAMPS; ++ramp) {
         for (edge = 0; edge < NUMBER_OF_EDGES; ++edge) {
              lm_message(".");
              if (tmg_measure_ramp(ramp, edge, &calib, &errors) != SUCCESS) {
                   sprintf(buffer, "tmg_measure_ramp(%d,%d)", ramp, edge);
                   tmg_report_failure(me, buffer);
                   ++errors;
                   if (!(tmg_cal_debug & 0x20000000))
                       goto cleanup;
              }
         }
    }
    lm_message("Done\n");
#ifdef DIAGS
        if (tmg_cal_debug & 0x40000000)
            tmg_play_til_key();
#endif DIAGS

    /* set the delay line */

    if (tmg_calibrate_delay(&calib) != SUCCESS) {
        tmg_report_failure(me, "tmg_calibrate_delay");
        ++errors;
        if (!(tmg_cal_debug & 0x20000000))
            goto cleanup;
    }
#ifdef DIAGS
        if (tmg_cal_debug & 0x40000000)
            tmg_play_til_key();
#endif DIAGS

    /* remeasure the offsets */

    lm_message("Measuring edge offsets");
    for (ramp = 0; ramp < NUMBER_OF_ERAMPS; ++ramp) {
        for (edge = 0; edge < NUMBER_OF_EDGES; ++edge) {
            if (tmg_measure_offset(ramp, edge, &calib) != SUCCESS) {
                tmg_report_failure(me, "tmg_measure_offset");
                ++errors;
                if (!(tmg_cal_debug & 0x20000000))
                    goto cleanup;
            }
        }
    }
    lm_message("Done\n");
#ifdef DIAGS
        if (tmg_cal_debug & 0x40000000)
            tmg_play_til_key();
#endif DIAGS

    if (destructive) {
      /* Next measure edge 7 and Sample's minth */
      /* (edge 7 is THE edge that triggers a SAMPLE). */
      lm_message("Measuring Edge7 and Sample minimum thresholds");
      ramp = 0;
      tmg_set_sample_threshold(50); /* sure to cause a trigger */
      tmg_set_edge_7_threshold(50); /* sure to cause a trigger */
      if (tmg_measure_edge7_sample_minth(01, 01, &thresh7, &threshs) != SUCCESS) {
          tmg_report_failure(me, "tmg_measure_edge7_sample_minth");
          ++errors;
          if (!(tmg_cal_debug & 0x20000000))
              goto cleanup;
      }
      lm_message("Done\n");
#ifdef DIAGS
        if (tmg_cal_debug & 0x40000000)
            tmg_play_til_key();
#endif DIAGS
      for(eramp = 0; eramp < NUMBER_OF_ERAMPS; eramp++)
          calib.Edge7MinThresh[eramp] = thresh7 + START_DEAD_TIME_FUDGE;
```

Copyright 1989
Logic Modeling Systems

SOURCE PROGRAM diags/tmg_cal.c

DATE 5/23/89 TIME 4:41:30 pm

PAGE # 3/150

LINE # SOURCE TEXT

```
        for(sramp = 0; sramp < NUMBER_OF_SRAMPS; sramp++)
            calib.SampleMinThresh[sramp] = threshs + START_DEAD_TIME_FUDGE;
    } else {
        if (!tmg_is_calibrated()) {
          for(eramp = 0; eramp < NUMBER_OF_ERAMPS; eramp++)
            calib.Edge7MinThresh[eramp] = default_calib.Edge7MinThresh[eramp];
          for(sramp = 0; sramp < NUMBER_OF_SRAMPS; sramp++)
            calib.SampleMinThresh[sramp] = default_calib.SampleMinThresh[sramp];
        }
    }
    lm_message("Measuring Sample ramp slopes");
    for (eramp = 0; eramp < NUMBER_OF_ERAMPS; ++eramp) {
        lm_message(".");
        if (tmg_measure_edge7_ramp(eramp, &calib) != SUCCESS) {
            tmg_report_failure(me, "tmg_measure_edge7_ramp");
            ++errors;
            if (!(tmg_cal_debug & 0x20000000))
                goto cleanup;
        }
        else {
            switch (eramp) {
            case 0:
                first_sramp = 0;        /* just do first one     */
                last_sramp = 0;
                break;
            case 1:
                first_sramp = 1;        /* do next 2             */
                last_sramp = 2;
                break;
            case 2:
                first_sramp = 3;        /* do last one           */
                last_sramp = 3;
                break;
            default:
                first_sramp = 100;      /* don't do any          */
                last_sramp = 0;
                break;
            }
            for(sramp = first_sramp; sramp <= last_sramp; sramp++) {
                lm_message(".");
                if(tmg_measure_sample_ramp(eramp, sramp, &calib, &errors)
                    != SUCCESS) {
                    tmg_report_failure(me, "tmg_measure_sample_ramp");
                    ++errors;
                    if (!(tmg_cal_debug & 0x20000000))
                        goto cleanup;
                }
            }
        }
    }
    lm_message("Done\n");
#ifdef DIAGS
        if (tmg_cal_debug & 0x40000000)
            tmg_play_til_key();
#endif DIAGS

    lm_message("Measuring sample offsets");
    for(eramp = 0; eramp < NUMBER_OF_ERAMPS; eramp++) {
        for(sramp = 0, sramp < NUMBER_OF_SRAMPS, sramp++) {
            lm_message(".");
            if(tmg_measure_sample_offset_only(eramp,sramp,&calib,
               EDGE7SAMPLETRIGGERMODE) != SUCCESS)
            {
                tmg_report_failure(me, "tmg_measure_sample_offset_only\
                                            , Edge 7 mode");
                ++errors;
                if (!(tmg_cal_debug & 0x20000000))
                    goto cleanup;
            }
        }
    }

    for(sramp = 0; sramp < NUMBER_OF_SRAMPS; sramp++)
    {
      if(tmg_measure_sample_offset_only(0l,sramp,&calib,
                     EARLYSAMPLETRIGGERMODE) != SUCCESS)
      {
        tmg_report_failure(me, "tmg_measure_sample_offset_only, early mode");
        errors++;
        if(!(tmg_cal_debug & 0x20000000))
          goto cleanup;
      }
    lm_message(".");
    }

    lm_message("Done\n");
#ifdef DIAGS
        if (tmg_cal_debug & 0x40000000)
            tmg_play_til_key();
#endif DIAGS

    if(tmg_complete_calib_structure(&calib) != SUCCESS) {
        tmg_report_failure(me, "tmg_complete_calib_structure");
        ++errors;
        if (!(tmg_cal_debug & 0x20000000))
            goto cleanup;
    }
    if(tmg_cal_debug & 0x800000)
    {
      if(tmg_print_calib_structure(&calib, != SUCCESS)
      {
        tmg_report_failure(me, "tmg_print_calib_structure");
        ++errors;
        if (!(tmg_cal_debug & 0x20000000))
            goto cleanup;
      }
    }

    if(calib.EarlySampleMinDelay[0] > (long)calib.EdgeMinDelay[0])
    {
      errors++;
      lm_error("EarlySampleMinDelay[0] = %d ps > EdgeMinDelay[0] = %d ps\n",
            calib.EarlySampleMinDelay[0], calib.EdgeMinDelay[0]);
    }


    if(tmg_cal_debug & 0x80000000)
    {
      if(tmg_print_data_logging_messages(&calib) != SUCCESS)
      {
```

Copyright 1989 Logic Modeling Systems

LINE # SOURCE TEXT

```
          tmg_report_failure(me, "tmg_print_data_logging_messages");
          errors++;
          if(!(tmg_cal_debug & 0x20000000))
            goto cleanup;
        }
      }


cleanup:

      tmgptr->sample_mode = EDGE7SAMPLETRIGGERMODE;

      tmg_set_test_mode(0);
      if ((errors == 0) || ((tmg_cal_debug & 0x20000000) != 0)) {
          tmg_save_calibration();
          calib.CalCompleted = CALIBRATION_DONE;
      }
      if (destructive) {
        (void)diag_tmg_reset(1); /* full reset */
      }

      INTR_GOT_ONE
      tmg_set_test_mode(0);
      calib.CalCompleted = 0; /* unsuccessful */
      (void)diag_tmg_reset(0);
      intr();
      INTR_END

      if (errors) {
          calib.CalCompleted = 0; /* unsuccessful */
          return(FAILURE);
      }

      return(SUCCESS);
}

/*
 *       tmg_incremental_calibrate(part, destructiveflag)
 *
 *       Does a portion of what tmg_do_calibrate() does, selected by
 *        'part'.  Only does minimum threshold measurements if the
 *        'destructiveflag' is TRUE (normally only done at power up and
 *       at very long intervals, if ever again).
 */
int tmg_incremental_calibrate(part, destructive)
int part, destructive;
{
  static struct CALIB tempcal;
  int returncode = SUCCESS;
  long threshold, thresh7, threshs, edge, eramp, sramp, errors;
  int save_delay_line;


  if((part >= 0) && (part < 6) && !destructive)
  {
    edge = part % 6;
    tmgptr->backplane_resetL = 0; /* assert backplane reset */
    save_delay_line = tmg_get_delay();
    tmg_set_delay(14);
    if(tmg_measure_minth(0l, edge, &threshold) != SUCCESS)
      returncode = FAILURE;
    else
      for(eramp = 0; eramp < NUMBER_OF_ERAMPS; eramp++)
        calib.EdgeMinThresh[eramp][edge] = threshold + START_DEAD_TIME_FUDGE;
    tmg_set_delay(save_delay_line);
    tmgptr->backplane_resetL = 1;
    tmg_set_test_mode(0);
    return returncode;
  }
  else if((part >= 6) && (part < 30))   /* measure edge ramp slopes      */
  {
    edge = part % 6;
    eramp = (part - 6) / 6;
    save_delay_line = tmg_get_delay();
    tmg_set_delay(14);
    if(tmg_measure_ramp(eramp, edge, &tempcal, &errors) != SUCCESS)
      returncode = FAILURE;
    tmg_set_delay(save_delay_line);
    tmg_set_test_mode(0);
    return returncode;
  }
  else if(part == 30)   /* check or set delay line       */
  {
    save_delay_line = tmg_get_delay();
    if(tmg_calibrate_delay(&tempcal) != SUCCESS)
      returncode = FAILURE;
    if(!destructive)
    {
      if(abs((int)tmg_get_delay() - save_delay_line) > 1)
        returncode = FAILURE;
      tmg_set_delay(save_delay_line);
    }
    tmg_set_test_mode(0);
    return returncode;
  }
  else if((part > 30) && (part < 45))   /* remeasure edge ramp offsets  */
  {
    edge = (part - 3?) % 6;
    eramp = (part - [illegible]) / 6;
    if(tmg_measure_offset(eramp, edge, &tempcal) != SUCCESS)
      returncode = FAILURE;
    tmg_set_test_mode(0);
    return returncode;
  }
  else if((part == 45) && !destructive) /* measure Edge 7 min thresh    */
  {
    if(tmg_measure_edge7_sample_minth(0l, 0l, &thresh7, &threshs) != SUCCESS)
      returncode = FAILURE;
    for(eramp = 0; eramp < NUMBER_OF_ERAMPS; eramp++)
      tempcal.Edge7MinThresh[eramp] = thresh7 + START_DEAD_TIME_FUDGE;
    for(sramp = 0; sramp < NUMBER_OF_SRAMPS; sramp++)
      tempcal.SampleMinThresh[sramp] = threshs + START_DEAD_TIME_FUDGE;
    tmg_set_test_mode(0);
    return returncode;
  }
  else if((part > 45) && (part < 50))   /* measure Edge 7 slope */
  {
    eramp = (part - 46);
    if(tmg_measure_edge7_ramp(eramp, &tempcal) != SUCCESS)
      returncode = FAILURE.
```

Copyright 1989 Logic Modeling Systems

SOURCE PROGRAM diags/tmg_cal.c | DATE 5/23/89 | TIME 4:41:30 pm | PAGE # 5/152

LINE # SOURCE TEXT

```
      tmg_set_test_mode(0);
      return returncode;
    }
    else if((part >= 50) && (part < 54))  /* measure Sample slope */
    {
      aramp = (part - 50);
      switch(aramp)
      {
        case 0: eramp = 0; break;
        case 1: eramp = 1; break;
        case 2: eramp = 1; break;
        case 3: eramp = 2; break;
      }
      if(tmg_measure_sample_ramp(eramp, aramp, &tempcal, &errors) != SUCCESS)
        returncode = FAILURE;
      tmg_set_test_mode(0);
      return returncode;
    }
    else if((part >= 54) && ( part < 70))
    {
      eramp = (part - 54) % 4;
      aramp = (part - 54) / 4;
      if(tmg_measure_sample_offset_only(eramp, aramp, &tempcal,
          EDGE7SAMPLETRIGGERMODE) != SUCCESS)
        returncode = FAILURE;
      tmg_set_test_mode(0);
      return returncode;
    }
    else if(part == 70)
      return(tmg_process_and_transfer_calib_structure(&tempcal, &calib));
    else
      return FAILURE;
}


tmg_calibrate_delay(cal)
register struct CALIB *cal;
{
        static char me[] = "tmg_calibrate_delay";
        long delta;
        register long i;
        register long longest_delay_edge, count;

        lm_message("Setting delay line");

        /* Now find the ramp 0 edge with the longest delay */
        /* where delay = edgeoffset + (edgeminthresh * edgeslope) */

        longest_delay_edge = tmg_longest_delay_edge(0l, cal);

        /* Set the eramp delay */
        if (tmg_compute_delay(0l, longest_delay_edge, cal, &delta)
            != SUCCESS) {
                tmg_report_failure(me, "tmg_compute_delay");
                return FAILURE;
        }
        if(tmg_cal_debug & 0x10000)
          lm_message("%s: adjusting delay by %d ps\n", me, delta);
        tmg_adjust_delay(delta); /* do coarse adjustment */
        if (tmg_compute_delay(0l, longest_delay_edge, cal, &delta)
            != SUCCESS) {
                tmg_report_failure(me, "tmg_compute_delay");
                return FAILURE;
        }
        for (count = 0, i = (delta > 0); i == (delta > 0); ++count) {
                if (delta == 0)
                        break;
                delta = (delta > 0)? 1000: -1000;
                tmg_adjust_delay(delta); /* do fine adjustment */
                if (tmg_compute_delay(0l, longest_delay_edge, cal, &delta)
                    != SUCCESS) {
                    tmg_report_failure(me, "tmg_compute_delay");
                    return FAILURE;
                }
                if (count > 20) {
                    tmg_report_failure(me, "Delay adjustment");
                    return FAILURE;
                }
        }

        lm_message("Done\n");

        return SUCCESS;
}

/*
** tmg_assume_minth() assumes that the eramp 0 minth's have been measured
** and that it is a good assumption that the other ramps minths are the
** same
*/

static void
tmg_assume_minth(cal)
register struct CALIB *cal;
{
        register long threshold0, edge, ramp;

        for (edge = 0; edge < NUMBER_OF_EDGES; ++edge) {
                threshold0 = cal->EdgeMinThresh[0][edge];
                for (ramp = 1; ramp < NUMBER_OF_ERAMPS; ++ramp) {
                        /* set min thresh of ramp to ramp 0's value; */
                        cal->EdgeMinThresh[ramp][edge] = threshold0;
                }
        }
}

/*
** tmg_longest_delay_edge(ramp, cal)
** returns the edge with the longest delay for a given ramp
** where delay = offset + (minthresh * slope)
*/

static long
tmg_longest_delay_edge(ramp, cal)
register long ramp;
register struct CALIB *cal;
{
        register long edge, longest_delay_edge = 0;
        register long delay, longest_delay;
```

Copyright 1989 Logic Modeling Systems

SOURCE PROGRAM diags/tmg_cal.c

DATE 5/23/89 TIME 4:41:30 pm

LINE # SOURCE TEXT

```
        longest_delay = cal->EdgeOffset[ramp][0]
                        + (long)(cal->EdgeMinThresh[ramp][0]
                        * cal->EdgeSlope[ramp][0]);
        for (edge = 1; edge < NUMBER_OF_EDGES; ++edge) {
                delay = cal->EdgeOffset[ramp][edge]
                        + (long)(cal->EdgeMin...sh[ramp][edge]
                        * cal->EdgeSlope[ramp][edge]);
                if (delay > longest_delay) {
                        longest_delay = delay;
                        longest_delay_edge = edge;
                }
        }
        return longest_delay_edge;
}

struct measure_points {
    long low, mid, high;
    long slope; /* (psec/th) */
}Measure_points[] = {
        {104,   155,    250, 500},
        {28,    135,    250, 2000},
        {12,    125,    250, 10000},
        {10,    125,    250, 50000},
};

struct measure_sample_points {
    long low, mid, high;
    long slope; /* (psec/th) */
}Measure_sample_points[] = {
        {10,    125,    250, 500},
        {10,    125,    250, 1000},
        {10,    125,    250, 2000},
        {10,    125,    250, 4000},
};
/* long Measure_early_sample_points[] = {104, 54, 29, 16}; */
long Measure_early_sample_points[] = {125, 65, 37, 22};

struct measure_edge7_points {
    long low, mid, high;
    long slope; /* (psec/th) */
}Measure_edge7_points[] = {
        {104,   155,    250, 500},
        {28,    135,    250, 2000},
        {12,    125,    250, 10000},
        {10,    125,    250, 50000},
};

/* t is threshold array, p is period array, for general use      */
/*   during calibration of all ramps                              */
static long p[NUMBER_OF_ERAMPS][NUMBER_OF_EDGES + 1][7];
static long t[NUMBER_OF_ERAMPS][NUMBER_OF_EDGES + 1][7];

tmg_measure_ramp(ramp, edge, cal, errors)
register long ramp, edge, *errors;
register struct CALIB *cal;
{
    static char me[] = "tmg_measure_ramp";
    long try_tl;
    register long dt, dp, slope;
    long nopoints, point, temperrors;
    long *plist, *tlist, nogoodpts;
    register long count;

#ifdef DIAGS
    if (tmg_cal_debug & 2)
        lm_message("tmg_measure_ramp(%d,%d,%x)\n", ramp, edge, cal);
#endif DIAGS
    /*
    ** 1. find a point above but near the minimum threshold and longer
    **     than the magic chip dead time.
    ** 2. find a point high on the ramp.
    ** 3. Calculate the slope and offset of that line.
    ** 3a. Use the line to predict several points to do a fine calibration.
    ** 3b. Results of fine calibration are used for slope and offset.
    ** 4. Find a point aprox midway between the first two points using
    **          results of 3b.
    ** 5. Compute a linearity value.
    **
    ** Slope will be stored as a long. The units are v/s (or uv/us).
    */

    temperrors = 0;
    tmg_set_slot_count(2);

    t[ramp][edge][0] = Measure_points[ramp].low;
    if (!(p[ramp][edge][0] = tmg_find_period(ramp, edge,
                            (long)t[ramp][edge][0])))
    {
        tmg_report_failure(me,
            "can't find low period: tmg_find_period");
        return(FAILURE);
    }

    t[ramp][edge][2] = Measure_points[ramp].high;
    if (!(p[ramp][edge][2] = tmg_find_period(ramp, edge,
                            (long)t[ramp][edge][2])))
    {
        tmg_report_failure(me,
            "can't find high period: tmg_find_period");
        return(FAILURE);
    }

    if ((dt = t[ramp][edge][2] - t[ramp][edge][0]) == 0) {
        lm_error("Infinite edge ramp slope detected\n");
        return FAILURE;
    }

    if ((dp = p[ramp][edge][2] - p[ramp][edge][0]) == 0) {
        lm_error("Zero edge ramp slope detected\n");
        return FAILURE;
    }

    /* slopes are normally 500, 2000, 10000, and 50000  */
    slope = (dp/dt);
    if ((slope < 50) || (slope > 500000)) {
        lm_error("Illegal edge ramp slope %d ps/thr\n", slope);
        return FAILURE;
    }
    cal->EdgeSlope[ramp][edge] = slope;
    cal->EdgeOffset[ramp][edge] = (long)p[ramp][edge][0] -
```

Copyright 1989 Logic Modeling Systems

SOURCE PROGRAM diags/tmg_cal.c

DATE 5/23/89 TIME 4:41:30 pm

LINE # SOURCE TEXT

```
            (long)(cal->EdgeSlope[ramp][edge]) * (long)t[ramp][edge][0];
    if(ramp == 0)
      nopoints = 3;
    else
      nopoints = 7;
    tmg_set_slot_count(nopoints + 1);

    p[ramp][edge][0] = tmg_predict_period(Measure_points[ramp].high,
        cal->EdgeSlope[ramp][edge],
        cal->EdgeOffset[ramp][edge])/nopoints;

    try_t1 = tmg_predict_threshold(p[ramp][edge][0],
        cal->EdgeSlope[ramp][edge],
        cal->EdgeOffset[ramp][edge]);
    count = 0;
    do {
        t[ramp][edge][0] = try_t1--;
        if (++count > 10) {
            tmg_report_failure(me,
            "Unusual ramp thresholds: tmg_find_period");
            return(FAILURE);
        }
        if (!(p[ramp][edge][0] = tmg_find_period(ramp, edge,
                            (long)t[ramp][edge][0])))
        {
            tmg_report_failure(me,
            "can't find new low period: tmg_find_period");
            return(FAILURE);
        }

        t[ramp][edge][nopoints-1] = tmg_predict_threshold(p[ramp][edge][0] * nopoints,
            cal->EdgeSlope[ramp][edge],
            cal->EdgeOffset[ramp][edge]);
    } while (t[ramp][edge][nopoints-1] > 251);

    if (!(p[ramp][edge][nopoints-1] = tmg_find_precise_period(ramp, edge,
      (long)t[ramp][edge][nopoints - 1], (long)p[ramp][edge][0], nopoints)))
    {
        tmg_report_failure(me,
            "can't find high period: tmg_find_precise_period");
        tmg_set_slot_count(2);
        return(FAILURE);
    }

    /* do rest of points          */
    for(point = 1; point < nopoints - 1; point++)
    {
      t[ramp][edge][point] = tmg_predict_threshold(p[ramp][edge][0] * (point+1),
        cal->EdgeSlope[ramp][edge],
        cal->EdgeOffset[ramp][edge]);

      if (!(p[ramp][edge][point] = tmg_find_precise_period(ramp, edge,
         (long)t[ramp][edge][point], (long)p[ramp][edge][0], point + 1)))
      {
        tmg_report_failure(me,
            "can't find mid period: tmg_find_precise_period");
        tmg_set_slot_count(2);
        return(FAILURE);
      }
    }
    tmg_set_slot_count(2);
    if(ramp == 0)
    {
      plist = p[ramp][edge];
      tlist = t[ramp][edge];
      nogoodpts = nopoints;
    }
    else
    {
      plist = &(p[ramp][edge][2]);
      tlist = &(t[ramp][edge][2]);
      nogoodpts = nopoints - 2;
    }
    temperrors += (calculate_slope_and_offset_and_linearity(ramp,edge,cal,
      tlist,plist,nogoodpts,01)
       == SUCCESS) ? 0 : 1;
    *errors += temperrors;
    return (temperrors ? FAILURE : SUCCESS);
}

tmg_measure_offset(ramp, edge, cal)
register long ramp, edge;
register struct CALIB *cal;
{
        static char me[] = "tmg_measure_offset";
        long period;
        long threshold;
        long offset;

        lm_message(".");
#ifdef DIAGS
        if (tmg_cal_debug & 2)
                lm_message("tmg_measure_offset(%d,%d,%x)\n", ramp, edge, cal);
#endif DIAGS
        /*
        ** 1. Find a point near the high end of the ramp.
        ** 2. Measure delay of that point.
        ** 3. Using known slope, calculate the offset of that line.
        */

        tmg_set_slot_count(2);

        threshold = 250;
        if (!(period = tmg_find_period(ramp, edge, threshold))) {
                tmg_report_failure(me,
                        "can't find low period: tmg_find_period");
                return(FAILURE);
        }
        cal->EdgeOffset[ramp][edge] = tmg_predict_offset(period, threshold,
                cal->EdgeSlope[ramp][edge]);

        if (tmg_cal_debug & 8)
            lm_message("ramp %d edge %d offset is %d ps (%d p %d t %d s)\n",
                    ramp, edge, cal->EdgeOffset[ramp][edge],
                    period, threshold, cal->EdgeSlope[ramp][edge]);
        return SUCCESS;
}

calculate_slope_and_offset_and_linearity(ramp,edge,cal,t,p,nopoints,sramp)
register long ramp, edge;
```

Copyright 1989
Logic Modeling Systems

SOURCE PROGRAM diags/tmg_cal.c | DATE 5/23/89 | TIME 4:41:30 pm | PAGE # 8/155

LINE # SOURCE TEXT

```
long t[], p[], nopoints, aramp;
struct CALIB *cal;
{
    static char me[] = "calculate_slope_and_offset_and_linearity";
    void fit();
    float midpredicted, ..   rror, foffset, fslope;
    long period;
    long slope;                         /* picosec/threshold */
    long offset;                          /* picoseconds */
    long linearity;                     /* millipercent */
    register int i;
    long slope_delta, ideal_slope;
    int nonlinear;

    float x[7],y[7],siga,sigb,chi2,q, *xx, *yy;
#ifdef LOG_DEFINED
    float sigy[7], *ssigy;
    long p, junk;
    ssigy = sigy + 1;
#endif LOG_DEFINED

    xx = x - 1;
    yy = y - 1;
    for(i = 0; i < nopoints; i++)
    {
      x[i] = (float) t[i];
      y[i] = (float) p[i];
    }

#ifdef DIAGS
    if (tmg_cal_debug & 0x1000000)
    {
      for(i = 0; i < nopoints; i++)
        lm_message("x[%d] = %f ", i, x[i]);
      lm_message("\n");
      for(i = 0; i < nopoints; i++)
        lm_message("y[%d] = %f ", i, y[i]);
      lm_message("\n");
    }
#endif DIAGS

#ifdef LOG_DEFINED
    for(i = 0; i < nopoints; i++)
    {
      if (tmg_get_next_lower_period(p[i],
        &p, &junk, &junk, &junk, &junk) != SUCCESS) {
        tmg_report_failure(me, "tmg_get_frequency_setting(1)");
        return FAILURE;
      }
      sigy[i] = (p[i] - p);
    }

    fit(xx,yy,nopoints,ssigy,1,&foffset,&fslope,&siga,&sigb,&chi2,&q);
    linearity = (q * 1000.0);
#else LOG_DEFINED
    fit(xx,yy,nopoints,0,0,&foffset,&fslope,&siga,&sigb,&chi2,&q);
#endif LOG_DEFINED

    slope = fslope;
    offset = foffset;

    midpredicted = foffset + (float)t[nopoints >> 1] * fslope;
    miderror = fabs((midpredicted - (float)p[nopoints >> 1])
                                 /(float)p[nopoints >> 1]);
    linearity = (long)(100000 * miderror);

    if (tmg_cal_debug & 0x1000000) {
        lm_message("slope = %d offset = %d linearity = %d nopoints = %d\n",
             slope, offset, linearity, nopoints);
    }

    switch(edge) {
      case 0:
      case 1:
      case 2:
      case 3:
      case 4:
      case 5:
        cal->EdgeOffset[ramp][edge] = offset;
        cal->EdgeSlope[ramp][edge] = slope;
        cal->EdgeLinearity[ramp][edge] = linearity;
        ideal_slope = Measure_points[ramp].slope;
        break;
      case 6:                /* really edge 7 */
        cal->Edge7Slope[ramp] = slope;
        cal->Edge7Linearity[ramp] = linearity;
        ideal_slope = Measure_edge7_points[ramp].slope;
        break;
      case 7:                /* really sample */
        cal->SampleOffset[ramp][aramp] = offset;
        cal->SampleSlope[aramp] = slope;
        cal->SampleLinearity[aramp] = linearity;
        ideal_slope = Measure_sample_points[aramp].slope;
        break;
      default:
        lm_error("%s: Illegal edge %d\n", me, edge);
        break;
    }

    nonlinear = (linearity > 2500);  /* 2500m% == 2.5% */
    if (nonlinear) {
        lm_error("Ramp %d Edge %d slope %d failed linearity (%dm%%)\n",
            ramp, edge, slope, linearity);
    }
#ifdef DIAGS
    if ((tmg_cal_debug & 0x2000000) || nonlinear) {
        lm_message("\ncalculate_slope_and_offset_and_linearity(%d,%d):\n",
            ramp, edge);
        for(i = 0; i < nopoints; i++)
        {
            lm_message("t%d = %d p%d = %d ft%d = %g fp%d = %e\n\n",
                i,t[i],i,p[i], i,x[i],i,y[i]);
        }
        lm_message("fslope = %e slope = %d\n", fslope, slope);
        lm_message("foffset = %e offset = %d\n", foffset, offset);
        lm_message("midpredicted = %f linearity = %dm%%\n",
            midpredicted, linearity);
        lm_message("miderror = %f\n", miderror);
        lm_message("period = %d\n",
            period = tmg_predict_period(t[nopoints >> 1], slope, offset));
```

Copyright 1989
Logic Modeling Systems

SOURCE PROGRAM diags/tmg_cal.c

DATE 5/23/89 TIME 4:41:30 pm

SOURCE TEXT

```
        lm_message("threshold = %d\n",
            tmg_predict_threshold(period, slope, offset));
    }
#endif DIAGS
    if (noslin--' {
        return .  URE;
    }
    slope_delta = ideal_slope * 0.15; /* 15% */
    if ((slope < (ideal_slope - slope_delta))
        || (slope > (ideal_slope + slope_delta))) {
        lm_error("Ramp %d edge %d slope %d out of range (%d +/- 15%%)\n",
            (edge == 7)? sramp: ramp, edge, slope, ideal_slope);
        return FAILURE;
    }
    else
        return SUCCESS;
}

/*
** tmg_set_period(ramp, period)
** sets the clock to the closest period >= PERIOD psec and waits
** for the pll to settle
*/

#define CLOCK_SET_TIMEOUT       10000

tmg_set_period(ramp, period)
long ramp, *period;
{
        long timeout;
        static char me[] = "tmg_set_period";
        long jittar, n, k, select;
        long actual;

        if (tmg_get_frequency_setting(*period,
                &actual, &jittar, &n, &k, &select) != SUCCESS) {
                tmg_report_failure(me, "tmg_get_frequency_setting");
                return FAILURE;
        }
#ifdef DIAGS
        if (tmg_cal_debug & 0x08) {
            lm_message("%s:period %d actual %d psec n = %d k = %d sel = %d\n",
                me, *period, actual, n, k, select);
        }
#endif DIAGS
        *period = actual;
        if(lm_tmg_set_frequency((u_char)n,(u_char)k,(u_char)select) != SUCCESS)
        {
                tmg_report_failure(me, "lm_tmg_set_frequency");
                return FAILURE;
        }

        /* Set the Sample pulse width so the pac doesn't break */
        /* Do this while the pll settles */
        tmg_set_sample_width(actual, Measure_points[ramp].slope,
                (long)TMG_MIN_SAMPLE_WIDTH);

        for (timeout = CLOCK_SET_TIMEOUT;
                timeout && (lm_tmg_check_locked() != SUCCESS);
                --timeout)
                ;
        if (!timeout) {
                lm_error("\n%s: CLOCK SET TIMED OUT\n", me);
                return FAILURE;
        }
        return SUCCESS;
}

tmg_set_sample_width(period, slope, pw)
long period, slope, pw;
{
        register long sample_start_time, sample_width;

        if (pw < TMG_MIN_SAMPLE_WIDTH) return FAILURE;

        sample_start_time = 2 * 512 * slope;
        sample_width = (sample_start_time + pw)/period;
        if (sample_width > 255)
            sample_width = 255;
        if (tmg_cal_debug & 0x8000000)
            lm_message("period = %d, sample width = %d (%d ps)\n",
                period, sample_width, sample_width * period);
        tmg_set_sample_width_reg(sample_width);

        return SUCCESS;
}

#define MAX_THRESHOLD   50      /* 250 mv */

tmg_measure_minth(ramp, edge, threshold)
long ramp, edge, *threshold;
{
    static char me[] = "tmg_measure_minth";
    long period = 108375; /* 9.23 MHz == 108.375 nS */
    long found_high;

    if(tmg_clockoff() != SUCCESS) {
        lm_error("\nfind_min_th: could not turn clock off\n");
        return(FAILURE);
    }

    tmg_set_test_mode(1); tmg_set_slot_count(1);
    for(*threshold = 4; *threshold <= MAX_THRESHOLD; ++*threshold) {
        if (tmg_detect_always_high(ramp, edge, &period,
            *threshold, 10000l, &found_high) != SUCCESS) {
                tmg_report_failure(me, "tmg_detect_always_high");
                return FAILURE;
        }
        if (found_high) {
            break;
        }
    }

    if (*threshold > MAX_THRESHOLD) {
        lm_error("\n%s: testmode 1: no min threshold for edge %d below %d\n",
            me, edge, MAX_THRESHOLD);
        return(FAILURE);
    }

    if(tmg_cal_debug & 8)
```

Copyright 1989 Logic Modeling Systems

SOURCE PROGRAM diags/tmg_cal.c * DATE 5/23/89 TIME 4:41:30 pm PAGE # 10/157

LINE # SOURCE TEXT

```
        lm_message("Ramp %d edge %d min threshold = %d\n", ramp, edge, *threshold);

#ifdef DIAGS
    if (tmg_cal_debug & 1)
        tmg_play_til_key();
#endif DIAGS

    /* Now do double ramp tmg_set_test_mode(2) test */

    tmg_set_test_mode(2); tmg_set_slot_count(1);
    for(; *threshold <= MAX_THRESHOLD; ++*threshold) {
        if (tmg_detect_always_low(ramp, edge, &period,
            *threshold, 100001, &found_high) != SUCCESS) {
            tmg_report_failure(me, "tmg_detect_always_low");
            tmg_set_test_mode(1); tmg_set_slot_count(2);
            return FAILURE;
        }
        if (found_high) {
            break;
        }
    }

    if (*threshold > MAX_THRESHOLD) {
        lm_error("\n%s: testmode 2: no min threshold for edge %d below %d\n",
            me, edge, MAX_THRESHOLD);
        tmg_set_test_mode(1); tmg_set_slot_count(2);
        return(FAILURE);
    }

    if(tmg_cal_debug & 8)
      lm_message("Ramp %d edge %d min threshold = %d after testmode 2\n", ramp, edge, *threshold);

#ifdef DIAGS
    if (tmg_cal_debug & 1)
        tmg_play_til_key();
#endif DIAGS

    tmg_set_test_mode(1); tmg_set_slot_count(2);

    return(SUCCESS);
}


tmg_measure_edge7_sample_minth(eramp, sramp, thresh7, threshs)
long eramp, sramp, *thresh7, *threshs;
{
    static char me[] = "tmg_measure_edge7_sample_minth";
    long period = 100000;
    long found_high;

    if(tmg_clockoff() != SUCCESS) {
        lm_error("\ntmg_measure_edge7_sample_minth: could not turn clock off\n");
        return(FAILURE);
    }

    for(*thresh7 = 4; *thresh7 <= MAX_THRESHOLD; ++*thresh7) {
        lm_message(".");
        if(tmg_detect_sample_always_high(eramp, sramp, &period, *thresh7, 101,
                                         100001, &found_high) != SUCCESS) {
            tmg_report_failure(me, "tmg_detect_sample_always_high");
            goto cleanup;
        }
        if(found_high)
          break;
#ifdef DIAGS
        if (tmg_cal_debug & 0x100)
            tmg_play_til_key();
#endif DIAGS
    }
    if (*thresh7 > MAX_THRESHOLD) {
        lm_error("\n%s: no min threshold for edge 7 below %d\n",
            me, MAX_THRESHOLD);
        goto cleanup;
    }

    /* lm_message("Ramp %d edge 7 min threshold = %d\n", eramp, *thresh7); */

    for(*threshs = 4; *threshs <= MAX_THRESHOLD; ++*threshs) {
        lm_message(".");
        if(tmg_detect_sample_always_high(eramp, sramp, &period, 101, *threshs,
                                         100001, &found_high) != SUCCESS) {
            tmg_report_failure(me, "tmg_detect_sample_always_high");
            goto cleanup;
        }
        if(found_high)
          break;
#ifdef DIAGS
        if (tmg_cal_debug & 0x100)
            tmg_play_til_key();
#endif DIAGS
    }
    if (*threshs > MAX_THRESHOLD) {
        lm_error("\n%s: no min threshold for Sample below %d\n",
            me, MAX_THRESHOLD);
        goto cleanup;
    }

    /* lm_message("Ramp %d edge 7 min threshold = %d\n", 0, *threshs); */

    return SUCCESS;

cleanup:
    return FAILURE;
}


tmg_detect_sample(eramp, sramp, mode, period, thresh7, threshs, count, actual)
register long eramp, sramp;
long *period, *actual, thresh7, threshs, count;
int mode;
{
        static char me[] = "tmg_detect_sample";

        tmg_set_eramp(eramp);
        tmg_set_sramp(sramp);

        tmg_set_edge_7_threshold(thresh7);
        tmg_set_sample_threshold(threshs);

        if (tmg_set_period(eramp, period) != SUCCESS) {
```

Copyright 1989 Logic Modeling Systems

SOURCE PROGRAM diags/tmg_cal.c | DATE 5/23/89 | TIME 4:41:30 pm | PAGE # 11/158

LINE # SOURCE TEXT

```
                tmg_report_failure(me, "tmg_set_period");
                return FAILURE;
        }

#ifdef DIAGS
        if (tmg_cal_debug & 0x400) {
                lm_message("tmg_detect_sample: %d psec\n", *period);
        }
#endif DIAGS

        if (tmg_detect(01,count,actual,mode) != SUCCESS) {
                tmg_report_failure(me, "tmg_detect");
                return FAILURE;
        }
#ifdef DIAGS
        if (tmg_cal_debug & 0x800)
                lm_message("tmg_detect_sample: count = %d\n", *actual);
#endif DIAGS
        return SUCCESS;
}



/*
** tmg_detect_always_low() is a magic function that reads the edge register
** up to "count" times and returns 1 if the value is always 0.
** In our application remember that a sometimes high
** is as good as an always high, so this function returns 0 upon finding
** the first high.
**
** In searching for the threshold period, we will search for the shortest
** period that sometimes sees high.
**
**  ___________          ___________
**             |________|
**                      \-- this is the edge we will seek.
*/

tmg_detect_edge(ramp, edge, mode, period, threshold, count, actual)
register long ramp, edge;
register long *period, *actual;
long threshold, count;
{
        static char me[] = "tmg_detect_edge";

        tmg_set_eramp(ramp);

        tmg_set_threshold(edge, threshold);

        if (tmg_set_period(ramp, period) != SUCCESS) {
                tmg_report_failure(me, "tmg_set_period");
                return FAILURE;
        }

#ifdef DIAGS
        if (tmg_cal_debug & 2) {
                lm_message("tmg_detect_edge: %d psec\n", *period);
        }
#endif DIAGS

        if (tmg_detect(edge,count,actual,mode) != SUCCESS) {
                tmg_report_failure(me, "tmg_detect");
                return FAILURE;
        }
#ifdef DIAGS
        if (tmg_cal_debug & 8)
                lm_message("tmg_detect_edge: count = %d\n", *actual);
#endif DIAGS
        return SUCCESS;
}

int tmg_detect(edge, repcount, count, mode)
register long edge, repcount, *count;
int mode;
{
        register long mask;
        static char me[] = "tmg_detect";
        register long previous = 0, this;

        *count = 0;
        if(tmg_esffclear() != SUCCESS) {
                lm_error("tmg_esffclear: cal flip flops did not clear\n");
                tmg_report_failure(me, "tmg_esffclear");
                return FAILURE;
        }

        mask = 1 << edge;

        if (tmg_cal_debug & 2)
            printf("tmg_detect(%d,%d,%d,%d)\n", edge, repcount, count, mode);
        while(repcount-- > 0) {
                if(tmg_play((long)TIMEOUT) != SUCCESS) {
                        tmg_report_failure(me, "tmg_play");
                        return(FAILURE);
                }
                if (mode & DETECT_SAMPLE)
                        this = (tmg_get_sample_cal());
                else
                        this = (tmg_get_edge_cal() & mask);

                if ((this == previous) != ((mode & DETECT_LOW) != 0)) {
                        if (mode & DETECT_BOOL) {
                                *count = 0;
#ifdef DIAGS
                                if (tmg_cal_debug & 4)
                                        lm_message("%s: repcount = %d\n",
                                                me, repcount);
#endif DIAGS
                                return SUCCESS; /* Found a wrong */
                        }
                } else {
                        ++*count;
                }
                previous = this;
        }
        if (mode & DETECT_BOOL) {
                *count = (*count != 0);
        }
        return SUCCESS; /* Found all rights */
}
```

Copyright 1989
Logic Modeling Systems

SOURCE PROGRAM diags/tmg_cal.c | DATE 5/23/89 | TIME 4:41:30 pm | PAGE # 12/159

LINE # SOURCE TEXT

```
#define SEARCH_COUNT    100

tmg_find_period(ramp, edge, thr)
long ramp, edge, thr;
{
        static char me[] = "tmg_find_period";
        long period, count;
        register long upper_bound, lower_bound;

#ifdef info
        1. Select the first period such that for the fastest possible
                ramp or the slowest possible ramp, the ramp discharges
                durring the inactive phase of the first cycle (Set period
                to 1/3 longer than expected ramp speed):

                                                xxxxxxxx
                                        xxxxBxxx        x
                                xxxxxxxx                 x
                        xxxAxxxx                          x
                xxxxxxxx                                   x
        xxxxxxxx                                            x
xxxxxxxx                                                     x
________________________________________                        ____
                                        ________________________

_____________________                   ____________________
                     ____________________                     ____

        2. If you detect low, go to step 3 (see point B in the figure).
                Otherwise (see point A in the figure), keep reducing
                the period by .8 until you detect a low.
        3. Reduce the frequency by .8 until you get a high.  Remember the last
                frequencies that you got high and low.
        4. Do a binary search for the exact low-to-high period.
#endif info

        upper_bound = (4 * Measure_points[ramp].slope * 255)/3;
        /* if (upper_bound < MIN_PERIOD) then something is wrong */

#ifdef DIAGS
        if (tmg_cal_debug & 4)
                lm_message("tmg_find_period: starting at %d psec\n",
                    upper_bound);
#endif DIAGS

        /* correct for first time through loop: */
        period = (100 * upper_bound)/tmg_reduction_factor;
        do {
                upper_bound = period;
                period = (tmg_reduction_factor * period)/100;
                if (period < MIN_PERIOD)
                        period = MIN_PERIOD;
                if (tmg_detect_always_low(ramp,edge,
                    &period,thr,(long)SEARCH_COUNT, &count) != SUCCESS) {
                        tmg_report_failure(me, "tmg_detect_always_low(1)");
                        return 0;
                }
#ifdef DIAGS
                if (tmg_cal_debug & 1)
                        tmg_play_til_key();
#endif DIAGS
                if (period == upper_bound) {
                        lm_error("\ntmg_find_period: Could not find low\n");
                        return 0;
                }
        } while (!count);
#ifdef DIAGS
        if (tmg_cal_debug & 4)
                lm_message("(found low at %d)\n", period);
#endif DIAGS

        /* one more time... */
        do {
                upper_bound = period;
                period = (tmg_reduction_factor * period)/100;
                if (period < MIN_PERIOD)
                        period = MIN_PERIOD;
                if (tmg_detect_always_low(ramp,edge,
                    &period,thr,(long)SEARCH_COUNT, &count) != SUCCESS) {
                        tmg_report_failure(me, "tmg_detect_always_low(2)");
                        return 0;
                }
#ifdef DIAGS
                if (tmg_cal_debug & 1)
                        tmg_play_til_key();
#endif DIAGS
                if (period == upper_bound) {
                        lm_error("\ntmg_find_period: Could not find 2nd high\n");
                        return 0;
                }
        } while (count);
#ifdef DIAGS
        if (tmg_cal_debug & 4)
                lm_message("(found second high at %d)\n", period);
#endif DIAGS

        lower_bound = period;
        return tmg_edge_search(ramp,edge,thr,upper_bound,lower_bound);
}

tmg_edge_search(ramp,edge,thr,upper_bound,lower_bound)
long ramp, edge, thr, upper_bound, lower_bound;
{
        static char me[] = "tmg_edge_search";
        long period, found_high;
        long timeout = BIN_LIMIT;

        for (timeout = 0; timeout <= BIN_LIMIT; ++timeout) {
                period = (upper_bound + lower_bound)/2;
                if (tmg_detect_always_low(ramp,edge,&period,
                    thr,(long)SEARCH_COUNT, &found_high) != SUCCESS) {
                        tmg_report_failure(me, "tmg_detect_always_low(3)");
                }
#ifdef DIAGS
                if (tmg_cal_debug & 1)
                        tmg_play_til_key();
#endif DIAGS
                if ((period <= lower_bound) || (period >= upper_bound)) {
                        /* We can't get more exact than this */
#ifdef DIAGS
```

Copyright 1989
Logic Modeling Systems

SOURCE PROGRAM diags/tmg_cal.c

DATE 5/23/89 TIME 4:41:30 pm

LINE # SOURCE TEXT

```
                                if (tmg_cal_debug & 4)
                                        lm_message("(got it between %d and %d)\n",
                                            lower_bound, upper_bound);
#endif DIAGS
                                return period;
                        }
                        if (!found_high) {
                                /* too short - raise lower bound */
                                lower_bound = period;
                        } else {
                                /* too long - lower upper bound */
                                upper_bound = period;
                        }
                }
                lm_error("\aBINARY EDGE SEARCH FAILED TO CONVERGE!\n");
                return period;
}

tmg_find_precise_period(ramp, edge, thr, base_period, multiplier)
long ramp, edge, thr, base_period, multiplier;
{
        static char me[] = "tmg_find_precise_period";
        long period, count1, count2;
        register long upper_bound, lower_bound, delta;

#ifdef info
        1. Select the first period based on the predicted base value.
        2. Compute delta based on the period and multiplier.
        3. If you detect low, decrease period by delta. If you still
                detect low, then error out.
        4. If you detect high, increase period by delta. If you still
                detect high, then error out.
        5. Do a binary search for the exact low-to-high period.
#endif info
        period = base_period;
#ifdef DIAGS
        if (tmg_cal_debug & 0x2)
                lm_message("tmg_find_precise_period(%d,%d,%d,%d,%d)\n",
                        ramp, edge, thr, base_period, multiplier);

        if (tmg_cal_debug & 4)
                lm_message("%s: starting at %d psec\n", me, period);
#endif DIAGS

        delta = (period / 4) / multiplier;
        {
                if (tmg_detect_always_low(ramp,edge,
                    &period,thr,(long)SEARCH_COUNT, &count1) != SUCCESS) {
                        tmg_report_failure(me, "tmg_detect_always_low(1)");
                        return 0;
                }
#ifdef DIAGS
                if (tmg_cal_debug & 1)
                        tmg_play_til_key();
#endif DIAGS
                if (!count1) {
                        lower_bound = period;
                        period += delta;
                } else {
                        upper_bound = period;
                        period -= delta;
                }
        }
        {
                if (tmg_detect_always_low(ramp,edge,
                    &period,thr,(long)SEARCH_COUNT, &count2) != SUCCESS) {
                        tmg_report_failure(me, "tmg_detect_always_low(2)");
                        return 0;
                }
#ifdef DIAGS
                if (tmg_cal_debug & 1)
                        tmg_play_til_key();
#endif DIAGS
                if (!count2) {
                        lower_bound = period;
                } else {
                        upper_bound = period;
                }
        }

        if (count1 == count2) {
                lm_error("\n%s: %s on ramp %d edge %d\n", me,
                        "Can't find edge boundaries", ramp, edge);
                return 0;
        }
        return tmg_edge_search(ramp,edge,thr,upper_bound,lower_bound)
                * multiplier;
}

tmg_sample_search(eramp,sramp,thr7,thrs,upper_bound,lower_bound)
long eramp,sramp,thr7,thrs,upper_bound,lower_bound;
{
        static char me[] = "tmg_sample_search";
        long period, found_high;
        long timeout = BIN_LIMIT;

        for (timeout = 0; timeout <= BIN_LIMIT; ++timeout) {
                period = (upper_bound + lower_bound)/2;
                if (tmg_detect_sample_always_low(eramp,sramp,(long*)&period,
                    thr7,thrs,(long)SEARCH_COUNT, (long*)&found_high)
                     != SUCCESS)
                {
                        tmg_report_failure(me,
                          "tmg_detect_sample_always_low(3)");
                }
#ifdef DIAGS
                if (tmg_cal_debug & 0x100)
                        tmg_play_til_key();
#endif DIAGS
                if ((period <= lower_bound) || (period >= upper_bound)) {
                        /* We can't get more exact than this */
#ifdef DIAGS
                        if (tmg_cal_debug & 0x400)
                                lm_message("(got it between %d and %d)\n",
                                    lower_bound, upper_bound);
#endif DIAGS
                        return period;
                }
                if (!found_high) {
                        /* too short - raise lower bound */
```

Copyright 1989 Logic Modeling Systems

SOURCE PROGRAM diags/tmg_cal.c

DATE 5/23/89 TIME 4:41:30 pm PAGE # 14/161

SOURCE TEXT

```
                                lower_bound = period;
                        } else {
                                /* too long - lower upper bound */
                                upper_bound = period;
                        }
                }
        lm_error("\nBINARY SAMPLE SEARCH FAILED TO CONVERGE!\n");
        return period;

}       /* tmg_sample_search    */

tmg_find_precise_sample_period(eramp,aramp,thr7,thrs,base_period,multiplier)
long eramp, aramp, thr7, thrs, base_period, multiplier;
{
        static char me[] = "tmg_find_precise_sample_period";
        long period, count1, count2;
        register long upper_bound, lower_bound, delta;

#ifdef info
        1. Select the first period based on the predicted base value.
        2. Compute delta based on the period and multiplier.
        3. If you detect low, decrease period by delta. If you still
                detect low, then error out.
        4. If you detect high, increase period by delta. If you still
                detect high, then error out.
        5. Do a binary search for the exact low-to-high period.
#endif info
        period = base_period;
#ifdef DIAGS
        if (tmg_cal_debug & 0x200)
          lm_message("tmg_find_precise_sample_period(%d,%d,%d,%d,%d,%d)\n",
                        eramp, aramp, thr7, thrs, base_period, multiplier);

        if (tmg_cal_debug & 0x1000)
                lm_message("%s: starting at %d psec\n", me, period);
#endif DIAGS

        delta = (period / 4) / multiplier;
        {
                if (tmg_detect_sample_always_low(eramp,aramp,
                    &period,thr7,thrs,(long)SEARCH_COUNT, &count1) != SUCCESS) {
                        tmg_report_failure(me,
                            "tmg_detect_sample_always_low(1)");
                        return 0;
                }
#ifdef DIAGS
                if (tmg_cal_debug & 0x100)
                        tmg_play_til_key();
#endif DIAGS
                if (!count1) {
                        lower_bound = period;
                        period += delta;
                } else {
                        upper_bound = period;
                        period -= delta;
                }
        }
        {
                if (tmg_detect_sample_always_low(eramp,aramp,
                    &period,thr7,thrs,(long)SEARCH_COUNT, &count2) != SUCCESS) {
                        tmg_report_failure(me,
                            "tmg_detect_sample_always_low(2)");
                        return 0;
                }
#ifdef DIAGS
                if (tmg_cal_debug & 0x100)
                        tmg_play_til_key();
#endif DIAGS
                if (!count2) {
                        lower_bound = period;
                } else {
                        upper_bound = period;
                }
        }

        if (count1 == count2) {
                lm_error("\n%s: %s on edge ramp %d sample ramp %d\n", me,
                        "Can't find sample boundaries", eramp, aramp);
                return 0;
        }
        return tmg_sample_search(eramp,aramp,thr7,thrs,upper_bound,lower_bound)
                * multiplier;

}       /* tmg_find_precise_sample_period    */

tmg_find_sample_period(eramp, aramp, thresh7, threshs)
long eramp, aramp, thresh7, threshs;
{
        static char me[] = "tmg_find_sample_period";
        long found_high, period, count;
        register long upper_bound, lower_bound;
        long timeout;

#ifdef info
        1. Select the first period such that for the fastest possible
                ramp or the slowest possible ramp, the ramp discharges
                durring the inactive phase of the first cycle (Set period
                to 1/3 longer than expected ramp speed):

                                                        xxxxxxxx
                                                xxxxAxxx        x
                                        xxxxxxxx                 x
                                xxxAxxxx                          x
                        xxxxxxxx                                   x
                xxxxxxxx                                            x
Eramp   xxxxxxxx                                                     x
                                Sample    +|
                                Threshold / |
                                         /  |
                                        /   |
                                       /    |
Sramp   ______________________________/     |____________________________
                                             _____________________________
Sample  ____________________________________|
        _____________________________________                         ____
                                             _____________________________

        __________________________                   _____________________
                                  ___________________                     ____
```

Copyright 1989 Logic Modeling Systems

| SOURCE PROGRAM | DATE | PAGE # |
|---|---|---|
| diags/tmg_cal.c | 5/23/89 TIME 4:41:30 pm | 15/162 |

SOURCE TEXT

```
        2. If you detect low, go to step 3 (see point B in the figure).
                Otherwise (see point A in the figure), keep reducing
                the period by .8 until you detect a low.
        3. Reduce the frequency by .8 until you get a high.  Remember the last
                frequencies that you got high and low.
        4. Do a binary search for the --     low-to-high period.
#endif info

    if(threshs == 10)    /* must be looking at edge7 ramp      */
        upper_bound = (4 * Measure_edge7_points[eramp].slope * 255)/3;
    else
        upper_bound = (4 * Measure_sample_points[aramp].slope * 255)/3 + 40000;

    /* if (upper_bound < MIN_PERIOD) then something is wrong */

#ifdef DIAGS
    if (tmg_cal_debug &0x1000)
        lm_message("tmg_find_sample_period: starting at %d psec\n",
            upper_bound);
#endif DIAGS

    /* correct for first time through loop: */
    period = (100 * upper_bound)/tmg_reduction_factor;
    do {
        upper_bound = period;
        period = (tmg_reduction_factor * period)/100;
        if (period < MIN_PERIOD)
            period = MIN_PERIOD;
        if (tmg_detect_sample_always_low(eramp,aramp,
            &period,thresh7,threshs,(long)SEARCH_COUNT, &count) != SUCCESS) {
            tmg_report_failure(me, "tmg_detect_sample_always_low(1)");
            return 0;
        }
#ifdef DIAGS
        if (tmg_cal_debug & 0x100)
            tmg_play_til_key();
#endif DIAGS
        if (period == upper_bound) {
            lm_error("tmg_find_sample_period: Could not find low\n");
            return 0;
        }
    } while (!count);
#ifdef DIAGS
    if (tmg_cal_debug & 0x400)
        lm_message("(found low at %d)\n", period);
#endif DIAGS

    do {
        upper_bound = period;
        period = (tmg_reduction_factor * period)/100;
        if (period < MIN_PERIOD)
            period = MIN_PERIOD;
        if (tmg_detect_sample_always_low(eramp,aramp,
            &period,thresh7,threshs,(long)SEARCH_COUNT, &count) != SUCCESS) {
            tmg_report_failure(me, "tmg_detect_sample_always_low(2)");
            return 0;
        }
#ifdef DIAGS
        if (tmg_cal_debug & 0x100)
            tmg_play_til_key();
#endif DIAGS
        if (period == upper_bound) {
            lm_error("tmg_find_sample_period: Could not find 2nd high\n");
            return 0;
        }
    } while (count);
#ifdef DIAGS
    if (tmg_cal_debug & 0x400)
        lm_message("(found second high at %d)\n", period);
#endif DIAGS

    lower_bound = period;
    for (timeout = 0; timeout <= BIN_LIMIT; ++timeout) {
        period = (upper_bound + lower_bound)/2;
        if (tmg_detect_sample_always_low(eramp,aramp,&period,
            thresh7,threshs,(long)SEARCH_COUNT, &found_high) != SUCCESS) {
            tmg_report_failure(me, "tmg_detect_sample_always_low(3)");
        }
#ifdef DIAGS
        if (tmg_cal_debug & 0x100)
            tmg_play_til_key();
#endif DIAGS
        if ((period <= lower_bound) || (period >= upper_bound)) {
            /* We can't get more exact than this */
#ifdef DIAGS
            if (tmg_cal_debug & 0x400)
                lm_message("(got it between %d and %d)\n",
                    lower_bound, upper_bound);
#endif DIAGS
            return period;
        }
        if (!found_high) {
            /* too short - raise lower bound */
            lower_bound = period;
        } else {
            /* too long - lower upper bound */
            upper_bound = period;
        }
    }
    lm_error("\aBINARY SAMPLE EDGE SEARCH FAILED TO CONVERGE!\n");
    return period;
}

tmg_compute_delay(ramp, edge, cal, delay)
register long ramp, edge;
register long *delay;
register struct CALIB *cal;
{
    static char me[] ="tmg_compute_delay";
    long adjust;

    /* We assume that this ramp has already been measured */

    if (tmg_measure_offset(ramp, edge, cal) != SUCCESS) {
        tmg_report_failure(me, "tmg_measure_offset");
        return(FAILURE);
    }

    adjust = MAGIC_DEAD_TIME
        - cal->EdgeOffset[ramp][edge]
```

Copyright 1989 Logic Modeling Systems

LINE # SOURCE TEXT

```
        - (long)(cal->EdgeSlope[ramp][edge] * cal->EdgeMinThresh[ramp][edge]);

#ifdef DIAGS
    if (tmg_cal_debug & 0x20000) {
        lm_message("Given an offset of %d psec, slope of %d psec/thresh,\n",
            cal->EdgeOffset[ramp][edge], cal->EdgeSlope[ramp][edge]);
        lm_message("a threshold of %d and an estimated dead time of %d psec,\n",
            cal->EdgeMinThresh[ramp][edge], MAGIC_DEAD_TIME);
        lm_message("I think we should adjust the delay by %d psec.\n",
            adjust);
    }
#endif DIAGS

    *delay = MAGIC_DEAD_TIME - cal->EdgeOffset[ramp][edge]
        - cal->EdgeSlope[ramp][edge] * cal->EdgeMinThresh[ramp][edge];
    return(SUCCESS);
}

void
tmg_adjust_delay(delta)
register long delta; /* picoseconds */
{
        /* delay and delta are expressed in ns */

        long delay = tmg_get_delay();

#ifdef DIAGS
        if (tmg_cal_debug & 0x40000)
            lm_message("Present delay = %d ns (%d)\n", delay,
                tmg_get_delay_reg());
#endif DIAGS

        delay += delta/1000; /* nanoseconds */

#ifdef DIAGS
        if (tmg_cal_debug & 0x40000)
            lm_message("Setting delay to %d ns\n", delay);
#endif DIAGS

        /* should we do bounds checking here, bill? */

        tmg_set_delay(delay);

#ifdef DIAGS
        if (tmg_cal_debug & 0x40000)
            lm_message("New delay = %d ns (%d)\n", tmg_get_delay(),
                tmg_get_delay_reg());
#endif DIAGS
}

/*
 *      tmg_get_frequency_setting()
 *
 *      This routine computes the values for n, k, and clock
 *      select register setting to give the best approximation
 *      of the desired clock period.  The clock period provided
 *      is always equal to or greater than that requested.
 *      The actual clock period is related to n, k as follows:
 *              period = (k / n) * T_REF, where
 *      k = 1, 2, ..., 256 or k = 2, 4, ..., 512,
 *      n = 128, 129, ..., 256, and
 *      T_REF = 256 / 30 MHz = PLL reference period.
 *
 *      Identical to tmg_get_frequency_setting without max bounds checking.
 *
 *      Returns: SUCCESS except if period violates min bound.
 */

#define I_T_REF 8533333 /* reference period in ps       */
#define K_CRITICAL      251

tmg_get_frequency_setting(period,actualptr,jitterptr,nptr,kptr,selectptr)
register long period;           /* physical clock period in ps */
register long *actualptr;       /* actual clock period in ps */
register long *jitterptr;       /* jitter per period in ps */
register long *nptr;
register long *kptr;
register long *selectptr;
{
        register long estimate, error, besterror;
        register int k, n, save_k = 0, save_n = 0;
        register long psf = period/0x20000, sf;

        if ((period < 33333) || (period > 35000000))
                return(FAILURE);

        for(besterror = 0x7fffffff, n = N_MIN; n <= N_MAX; n++) {

                for ((error = (n * psf)/512), sf = 0; error; error >>= 1) {
                        ++sf;
                }
                /* use the most accurate formula for this period... */
                k = (n * (period >> sf)) / (I_T_REF >> sf);
                if (k > K_CRITICAL)
                        estimate = k * (I_T_REF/n);
                else
                        estimate = (k * I_T_REF)/n;
                if (estimate < period)
                        ++k;
                if (k > 512) /* see if out of range */
                        continue;               /* if so, ignore it */
                if(k > 256)                     /* see if above 256 */
                        if(k & 1)               /* see if odd       */
                                k++;            /* make even        */
                if (k > K_CRITICAL)
                        estimate = k * (I_T_REF/n);
                else
                        estimate = (k * I_T_REF)/n;
                if ((error = estimate - period) < 0)
                        continue;
                if (error < besterror) {
                        save_n = n;
                        save_k = k;
                        besterror = error;
                }
        }
        if (besterror == 0x7fffffff) {
                return(FAILURE);
        }
        *nptr = 256 - save_n + 1;                   /* value to put in reg */
```

Copyright 1989 Logic Modeling Systems

| SOURCE PROGRAM | DATE | PAGE # |
|---|---|---|
| diags/tmg_cal.c | 5/23/89 TIME 4:41:30 pm | 17/164 |

LINE # SOURCE TEXT

```
        if(save_k == 1) {
                *kptr = 255;                    /* special case */
                *selectptr = 0;                 /* select div by 2 */
        } else {
                if(save_k > 256) {
                 *kptr = 256 - (save_k >> 1) + 1;       /* divide k by 2 */
                 *selectptr = 2;                        /* select div by 4k */
                } else {
                 *kptr = 256 - save_k + 1;              /* normal case */
                 *selectptr = 1;                        /* select div by 2k */
                }
        }
        /* *actualptr = T_REF * save_k / save_n; */
        if (save_k > K_CRITICAL) {
                *actualptr = save_k * (I_T_REF/save_n);
        } else {
                *actualptr = (save_k * I_T_REF)/save_n;
        }
        *jitterptr = 20 * 2 * save_k;   /* 20 ps per PLL clock */
        return(SUCCESS);
}

tmg_get_next_lower_period(period,actualptr,jitterptr,nptr,kptr,selectptr)
register long period;           /* physical clock period in ps */
register long *actualptr;       /* actual clock period in ps */
register long *jitterptr;       /* jitter per period in ps */
register long *nptr;
register long *kptr;
register long *selectptr;
{
        register long estimate, error, besterror;
        register int k, n, save_k = 0, save_n = 0;
        register long pnf = period/0x20000, nf;

        if ((period < 33333) || (period > 35000000))
                return(FAILURE);

        for(besterror = 0x7fffffff, n = N_MIN; n <= N_MAX; n++) {

                for ((error = (n * pnf)/512), nf = 0; error; error >>= 1) {
                        ++nf;
                }
                /* use the most acurate formula for this period... */
                k = (n * (period >> nf)) / (I_T_REF >> nf);
                if (k > K_CRITICAL)
                        estimate = k * (I_T_REF/n);
                else
                        estimate = (k * I_T_REF)/n;
                if (estimate >= period)
                        ++k;
                if (k > 512) /* see if out of range */
                        continue;               /* if so, ignore it */
                if(k > 256)                     /* see if above 256 */
                        if(k & 1)               /* see if odd */
                                k++;            /* make even */
                if (k > K_CRITICAL)
                        estimate = k * (I_T_REF/n);
                else
                        estimate = (k * I_T_REF)/n;
                if ((error = period - estimate) <= 0)
                        continue;
                if (error < besterror) {
                        save_n = n;
                        save_k = k;
                        besterror = error;
                }
        }
        if (besterror == 0x7fffffff) {
                return(FAILURE);
        }
        *nptr = 256 - save_n + 1;               /* value to put in reg */
        if(save_k == 1) {
                *kptr = 255;                    /* special case */
                *selectptr = 0;                 /* select div by 2 */
        } else {
                if(save_k > 256) {
                 *kptr = 256 - (save_k >> 1) + 1;       /* divide k by 2 */
                 *selectptr = 2;                        /* select div by 4k */
                } else {
                 *kptr = 256 - save_k + 1;              /* normal case */
                 *selectptr = 1;                        /* select div by 2k */
                }
        }
        /* *actualptr = T_REF * save_k / save_n; */
        if (save_k > K_CRITICAL) {
                *actualptr = save_k * (I_T_REF/save_n);
        } else {
                *actualptr = (save_k * I_T_REF)/save_n;
        }
        *jitterptr = 20 * 2 * save_k;   /* 20 ps per PLL clock */
        return(SUCCESS);
}

/* threshold and period array for sample calibration */
static long st[NUMBER_OF_ERAMPS][NUMBER_OF_SRAMPS][7];
static long sp[NUMBER_OF_ERAMPS][NUMBER_OF_SRAMPS][7];

tmg_measure_sample_ramp(eramp, sramp, cal, errors)
register long eramp, sramp, *errors;
register struct CALIB *cal;
{
        static char me[] = "tmg_measure_sample_ramp";
        char buffer[64];
        long t17, t27;
        register long nopoints, slope, dp, dt, count, point, temperrors;
        long thresh, offset;
#ifdef DIAGS
        if (tmg_cal_debug & 0x200)
                lm_message("%s(%d,%x)\n", me, sramp, cal);
#endif DIAGS
        /*
        ** 1. find a point above but near the minimum threshold and longer
        **      than the magic chip dead time.
        ** 2. find a point high on the ramp.
        ** 3. Caculate the slope and offset of that line.
        ** 3a. Use slope and offset to predict points for fine calibration.
        ** 3b. Results of fine calibration are used for slope and offset.
        ** 4. Find a point aprox midway between the first two points
        **      using results of 3b.
        ** 5. Compute a linearity value.
```

Copyright 1989
Logic Modeling Systems

LINE # SOURCE TEXT

```
      **
      ** Slope will be stored as a long. The units are v/s (or uv/us).
      */

    tmperrors = 0;
    switch(aramp)
    {
      case 0:
      case 1:
        nopoints = 3;
        break;
      case 2:
      case 3:
        nopoints = 7;
        break;
    }
    tmg_set_slot_count(2);

    t17 = Measure_edge7_points[eramp].low;
    st[eramp][aramp][0] = Measure_sample_points[aramp].low;

    if(!(sp[eramp][aramp][0] = tmg_find_sample_period(eramp,aramp,t17,
                                        (long)st[eramp][aramp][0])))
    {
      tmg_report_failure(me,
        "can't find low period: tmg_find_sample_period");
      return(FAILURE);
    }

    t27 = Measure_edge7_points[eramp].low;
    st[eramp][aramp][2] = Measure_sample_points[aramp].high;
    if(!(sp[eramp][aramp][2] = tmg_find_sample_period(eramp,aramp,t27,
                                    (long)st[eramp][aramp][2])))
    {
      tmg_report_failure(me,
        "can't find high period: tmg_find_sample_period");
      return(FAILURE);
    }

    if ((dt = (st[eramp][aramp][2] - st[eramp][aramp][0])) == 0) {
        lm_error("Infinite sample ramp slope\n");
        return FAILURE;
    }

    if ((dp = (sp[eramp][aramp][2] - sp[eramp][aramp][0])) == 0) {
        lm_error("Zero sample ramp slope\n");
        return FAILURE;
    }

    /* slopes are normally 500, 1000, 2000, and 4000     */
    slope = dp/dt;
    if ((slope < 50) || (slope > 40000)) {
        lm_error("Illegal sample ramp slope %d ps/thr\n", slope);
        return FAILURE;
    }
    offset  = sp[eramp][aramp][0] - slope*st[eramp][aramp][0];

    sp[eramp][aramp][0] = tmg_predict_period(Measure_sample_points[aramp].high,
          slope, offset) * 2 / (nopoints + 1);

    thresh = tmg_predict_threshold((long)sp[eramp][aramp][0],
          slope, offset);

    st[eramp][aramp][0] = thresh;
    if(st[eramp][aramp][0] < cal->SampleMinThresh[aramp])
    {
      *errors++;
      sprintf(buffer,"Can't fit %d periods in sample ramp %d", nopoints, aramp);
      tmg_report_failure(me, buffer);
      return(FAILURE);
    }

    count = 0;
    do {
          if (++count > 10) {
          tmg_report_failure(me,
          "Unusual ramp thresholds: tmg_find_sample_period");
          return(FAILURE);
       }
       if (!(sp[eramp][aramp][0] = tmg_find_sample_period(eramp, aramp,t17,
                                    (long)st[eramp][aramp][0])))
       {
          tmg_report_failure(me,
          "can't find new low period: tmg_find_period");
          return(FAILURE);
       }

       st[eramp][aramp][nopoints-1] =
          tmg_predict_threshold(sp[eramp][aramp][0] * (nopoints + 1) / 2,
          slope, offset);
       if(--t17 < cal->Edge7MinThresh[eramp])
       {
         tmg_report_failure(me, "No allowable setting for Edge 7 Threshold");
         return FAILURE;
       }
    } while (st[eramp][aramp][nopoints-1] > 251);

    tmg_set_slot_count(nopoints + 1);
    if (!(sp[eramp][aramp][nopoints-1] =
        tmg_find_precise_sample_period(eramp, aramp, t17,
        (long)st[eramp][aramp][nopoints - 1], (long)(sp[eramp][aramp][0]
        / 2), (long)(nopoints + 1))))
    {
        tmg_report_failure(me,
            "can't find high period: tmg_find_precise_sample_period");
        tmg_set_slot_count(2);
        return(FAILURE);
    }

    /* do rest of points          */
    for(point = 1; point < nopoints - 1; point++)
    {
      st[eramp][aramp][point] = tmg_predict_threshold(sp[eramp][aramp][0]
        * (point+2) / 2, slope, offset);

      if (!(sp[eramp][aramp][point] =
           tmg_find_precise_sample_period(eramp, aramp, t17,
           (long)st[eramp][aramp][point], (long)(sp[eramp][aramp][0]
           / 2), (long)(point + 2))))
      {
```

Copyright 1989 Logic Modeling Systems

SOURCE PROGRAM diags/tmg_cal.c | DATE 5/23/89 | TIME 4:41:30 pm | PAGE # 19/166

LINE # SOURCE TEXT

```
            tmg_report_failure(me,
                "can't find mid period: tmg_find_precise_period");
            tmg_set_slot_count(2);
            return(FAILURE);
        }
    }
    tmg_set_slot_count(2);
    temperrors += (calculate_slope_and_offset_and_linearity(eramp,71,cal,
        (long*)st[eramp][aramp],(long*)sp[eramp][aramp],nopoints,aramp)
        == SUCCESS) ? 0 : 1;
    *errors += temperrors;
    return (temperrors ? FAILURE : SUCCESS);
}


tmg_measure_sample_offset_only(eramp, aramp, cal, mode)
register long eramp, aramp;
register struct CALIB *cal;
int mode;
{
        static char me[] = "tmg_measure_sample_offset_only";
        long period;
        long t7, ts;

        long threshold;
        long offset;

#ifdef DIAGS
        if (tmg_cal_debug & 0x200)
                lm_message("tmg_measure_sample_offset_only(%d,%d,%x,%d)\n",
                        eramp, aramp, cal, mode);
#endif DIAGS
        /*
        ** 1. if EDGE7SAMPLETRIGGERMODE, Use a point on Edge7 about 40 ns out
        **      else don't care about Edge 7
        ** 2. if EDGE7SAMPLETRIGGERMODE, Use a minimal point on Sample ramp
        **      else use point about 40 ns out
        ** 3. Calculate offset using previously measured slopes
        ** 4. Store results in calibration structure
        */

    if(mode == EDGE7SAMPLETRIGGERMODE)

    {
        t7 = Measure_edge7_points[eramp].low;
        ts = Measure_sample_points[aramp].low;
        if (!(period = tmg_find_sample_period(eramp, aramp, t7, ts))) {
                tmg_report_failure(me,
                        "can't find low period: tmg_find_sample_period");
                return(FAILURE);
        }
/*
        offset = (long)period
                - (long)(cal->Edge7Slope[eramp] * t7)
                - (long)(cal->SampleSlope[aramp] * ts);
        threshold = (400001 - (long)offset
                - (long)(cal->Edge7Slope[eramp] * t7))
                / (long)cal->SampleSlope[aramp];
        if(tmg_cal_debug & 0x400)
        {
          lm_message("\npredict offset = %ld, threshold = %ld\n",
                offset, threshold);
        }
        if(threshold < cal->SampleMinThresh[aramp])
          threshold = cal->SampleMinThresh[aramp];
        if(threshold > 250)
          threshold = 255;
        ts = threshold;
        if (!(period = tmg_find_sample_period(eramp, aramp, t7, ts)))
        {
          tmg_report_failure(me,
              "can't find real low period: tmg_find_sample_period");
          return(FAILURE);
        }
*/
        cal->SampleOffset[eramp][aramp] = (long)period
                                        - (long)(cal->Edge7Slope[eramp] * t7)
                                        - (long)(cal->SampleSlope[aramp] * ts);
    }

    else if(mode == EARLYSAMPLETRIGGERMODE)
    {
      tmgptr->sample_mode = EARLYSAMPLETRIGGERMODE;
      t7 = 255;         /* have to keep Edge 7 quiet!   */
      ts = Measure_early_sample_points[aramp];
      if(!(period = tmg_find_sample_period(0l, aramp, t7, ts)))
      {
        tmg_report_failure(me,"can't find low period: tmg_find_sample_period\
                        , early mode");
        tmgptr->sample_mode = EDGE7SAMPLETRIGGERMODE;
        return(FAILURE);
      }
      offset = (long)period
            - (long)cal->SampleSlope[aramp] * (long)ts;
      threshold = (400001 - (long)offset) / (long)(cal->SampleSlope[aramp]);
      if(threshold < cal->SampleMinThresh[aramp])
        threshold = cal->SampleMinThresh[aramp];
      if(threshold > 250)
        threshold = 255;
      ts = threshold;
      if(!(period = tmg_find_sample_period(0l, aramp, t7, ts)))
      {
        tmg_report_failure(me,"can't find real low period: \
                        tmg_find_sample_period, early mode");
        tmgptr->sample_mode = EDGE7SAMPLETRIGGERMODE;
        return(FAILURE);
      }
      cal->EarlySampleOffset[aramp] = (long)period
                        - (long)cal->SampleSlope[aramp] * (long)ts;
      tmgptr->sample_mode = EDGE7SAMPLETRIGGERMODE;
    }
    else
    {
      lm_error("Fussy mode passed to tmg_measure_sample_offset_only\n");
      return FAILURE;
    }

    return SUCCESS;
}
```

Copyright 1989 Logic Modeling Systems

| SOURCE PROGRAM | DATE | PAGE # |
|---|---|---|
| diags/tmg_cal.c | 5/23/89 TIME 4:41:30 pm | 20/167 |

LINE # SOURCE TEXT

```
tmg_measure_edge7_ramp(ramp, cal)
register long ramp;
register struct CALIB *cal;
{
        static char me[] = "tmg_measure_edge7_ramp";
        long nopoints, count;
        int point;
        register long slope, offset, dt, dp;
        char buffer[80];
#ifdef DIAGS
        if (tmg_cal_debug & 0x200)
                lm_message("tmg_measure_edge7_ramp(%d,%x)\n", ramp, cal);
#endif DIAGS
        /*
        ** 1. find a point above but near the minimum threshold and longer
        **      than the magic chip dead time.
        ** 2. find a point high on the ramp.
        ** 3. Caculate the slope and offset of that line.
        ** 3a. Use slope and offset to predict points for fine calibration.
        ** 3b. Results of fine calibration are used for slope and offset.
        ** 4. Find a point aprox midway between the first two points.
        ** 5. Compute a linearity value.
        **
        ** Slope will be stured as a long. The units are v/s (or uv/us).
        */

        if(ramp == 0)
          nopoints = 3;
        else
          nopoints = 7;

    tmg_set_slot_count(2);
        t[ramp][6][0] = Measure_edge7_points[ramp].low;
        if(!(p[ramp][6][0] = tmg_find_sample_period(ramp,01,
          (long)t[ramp][6][0],101)))
        {
                tmg_report_failure(me,
                        "can't find low period: tmg_find_sample_period");
                return(FAILURE);
        }

        t[ramp][6][2] = Measure_edge7_points[ramp].high;
        if(!(p[ramp][6][2] = tmg_find_sample_period(ramp,01,
          (long)t[ramp][6][2],101)))
        {
                tmg_report_failure(me,
                        "can't find high period: tmg_find_sample_period");
                return(FAILURE);
        }

        if ((dt = t[ramp][6][2] - t[ramp][6][0]) == 0) {
                lm_error("Infinite edge 7 ramp slope\n");
                return FAILURE;
        }

        if ((dp = p[ramp][6][2] - p[ramp][6][0]) == 0) {
                lm_error("Zero edge 7 ramp slope\n");
                return FAILURE;
        }

        /* slopes are normally 500, 2000, 10000, and 50000       */
        slope = dp/dt;
        if ((slope < 50) || (slope > 500000)) {
            lm_error("Illegal edge 7 ramp slope %d ps/thr\n", slope);
            return FAILURE;
        }
        offset  = p[ramp][6][0] - slope*t[ramp][6][0];

        p[ramp][6][0] = tmg_predict_period(Measure_edge7_points[ramp].high,
                slope, offset) / nopoints;
        t[ramp][6][0] = tmg_predict_threshold(p[ramp][6][0], slope, offset);
        if(t[ramp][6][0] < cal->Edge7MinThresh[ramp])
        {
          sprintf(buffer,"Can't fit %d periods in Edge7 ramp %d",nopoints,ramp);
          tmg_report_failure(me, buffer);
          return(FAILURE);
        }
    count = 0;
    do {
            if (++count > 10) {
            tmg_report_failure(me,
            "Unusual ramp thresholds: tmg_find_sample_period");
            return(FAILURE);
        }
        if (!(p[ramp][6][0] = tmg_find_sample_period(ramp, 01,
                                (long)t[ramp][6][0], 101)))
        {
            tmg_report_failure(me,
            "can't find new low period: tmg_find_period");
            return(FAILURE);
        }

        t[ramp][6][nopoints-1] =
            tmg_predict_threshold(p[ramp][6][0] * nopoints,
            slope, offset);

        if(--(t[ramp][6][0]) < cal->Edge7MinThresh[ramp])
        {
          tmg_repor'    'lure(me, "No allowable setting for Edge 7 Threshold");
          return FAILURE;
        }
    } while (t[ramp][6][nopoints-1] > 251);

    tmg_set_slot_count(nopoints + 1);
    if (!(p[ramp][6][nopoints-1] =
        tmg_find_precise_sample_period(ramp, 01,
        (long)t[ramp][6][nopoints - 1], 101, (long)p[ramp][6][0],
        (long)nopoints)))
    {
        tmg_report_failure(me,
            "can't find high period: tmg_find_precise_sample_period");
        tmg_set_slot_count(2);
        return(FAILURE);
    }

    /* do rest of points        */
    for(point = 1; point < nopoints - 1; point++)
    {
      t[ramp][6][point] = tmg_predict_threshold(p[ramp][6][0]
        * (point+1), slope, offset);
```

Copyright 1989 Logic Modeling Systems

LINE # SOURCE TEXT

```
        if (!(p[ramp][6][point] =
            tmg_find_precise_sample_period(ramp, 0l,
            (long)t[ramp][6][point], 10l, (long)p[ramp][6][0],
            (long)(point + 1))))
        {
          tmg_report_failure(me,
              "can't find mid period: tmg_find_precise_period");
          tmg_set_slot_count(2);
          return(FAILURE);
        }
      }
      tmg_set_slot_count(2);
      return calculate_slope_and_offset_and_linearity(ramp,6l,cal,
          (long*)t[ramp][6],(long*)p[ramp][6],nopoints,0l);
}

tmg_complete_calib_structure(calptr)
struct CALIB *calptr;
{
  long eramp, aramp, min_edge_slope, max_edge_slope, ave_slope;
  long max_min_delay, min_max_delay;
  long edge;
  long temp;

  /* Figure out EdgeMinDelay[] and EdgeMaxDelay[]         */
  /* average various edge slopes along with Edge7         */

  eramp = 0;
  {
    max_edge_slope = 0;
    min_edge_slope = 1000000;
    max_min_delay = 0;
    min_max_delay = 100000000;
    ave_slope = calptr->Edge7Slope[eramp];
    for(edge = 0; edge < NUMBER_OF_EDGES; edge++)
    {
      if(calptr->EdgeSlope[eramp][edge] > max_edge_slope)
        max_edge_slope = calptr->EdgeSlope[eramp][edge];
      if(calptr->EdgeSlope[eramp][edge] < min_edge_slope)
        min_edge_slope = calptr->EdgeSlope[eramp][edge];
      ave_slope += calptr->EdgeSlope[eramp][edge];
    }
    ave_slope /= NUMBER_OF_EDGES + 1;
    for(edge = 0; edge < NUMBER_OF_EDGES; edge++)
    {
      calptr->EdgeSlope[eramp][edge] = ave_slope;
      /* min thresh + 2 for thermal tail effects          */
      temp = (long)(calptr->EdgeMinThresh[eramp][edge] + 2) * max_edge_slope
             + calptr->EdgeOffset[eramp][edge];
      if(max_min_delay < temp)
        max_min_delay = temp;
      temp = (255 - END_DEAD_TIME_FUDGE) * (long)min_edge_slope
             + calptr->EdgeOffset[eramp][edge]
             - 2 * (long)ave_slope;     /* jitter */
      if(min_max_delay > temp)
        min_max_delay = temp;
    }
    calptr->Edge7Slope[eramp] = ave_slope;
    calptr->EdgeMinDelay[eramp] = max_min_delay;
    calptr->EdgeMaxDelay[eramp] = min_max_delay;
  }
  for(eramp = 1; eramp < NUMBER_OF_ERAMPS; eramp++)
  {
    max_edge_slope = 0;
    min_edge_slope = 1000000;
    max_min_delay = 0;
    min_max_delay = 100000000;
    ave_slope = calptr->Edge7Slope[eramp];
    for(edge = 0; edge < NUMBER_OF_EDGES; edge++)
    {
      if(calptr->EdgeSlope[eramp][edge] > max_edge_slope)
        max_edge_slope = calptr->EdgeSlope[eramp][edge];
      if(calptr->EdgeSlope[eramp][edge] < min_edge_slope)
        min_edge_slope = calptr->EdgeSlope[eramp][edge];
      ave_slope += calptr->EdgeSlope[eramp][edge];
    }
    ave_slope /= NUMBER_OF_EDGES + 1;
    for(edge = 0; edge < NUMBER_OF_EDGES; edge++)
    {
      calptr->EdgeSlope[eramp][edge] = ave_slope;
      /* min thresh + 2 for thermal tail effects          */
      temp = (long)(calptr->EdgeMinThresh[eramp][edge] + 2) * max_edge_slope
             + calptr->EdgeOffset[eramp][edge];
      if(max_min_delay < temp)
        max_min_delay = temp;
      temp = (255 - END_DEAD_TIME_FUDGE) * (long)min_edge_slope
             + calptr->EdgeOffset[eramp][edge]
             - 2 * (long)ave_slope;     /* jitter */
      if(min_max_delay > temp)
        min_max_delay = temp;
    }
    calptr->Edge7Slope[eramp] = ave_slope;
    calptr->EdgeMinDelay[eramp] = max_min_delay;
    calptr->EdgeMaxDelay[eramp] = min_max_delay;
    /* Now we have to account for case where a small step in the ramp   */
    /* causes a large negative offset that fools us into thinking      */
    /* the minimum delay is small.  The indication of this is when     */
    /* a slower ramp has a smaller minimum delay than a faster ramp    */
    if(calptr->EdgeMinDelay[eramp] < calptr->EdgeMinDelay[eramp-1])
    {
      for(edge = 0; edge < NUMBER_OF_EDGES; edge++)
      {
        /* increase the minimum threshold as necessary  */
        while(((long)(calptr->EdgeMinThresh[eramp][edge] + 2)
              * calptr->EdgeSlope[eramp][edge]
              + calptr->EdgeOffset[eramp][edge])
              < calptr->EdgeMinDelay[eramp-1])
          ++(calptr->EdgeMinThresh[eramp][edge]);
      }
      /* recompute minimum delays       */
      for(edge = 0; edge < NUMBER_OF_EDGES; edge++)
      {
        temp = (long)(calptr->EdgeMinThresh[eramp][edge] + 2) * max_edge_slope
            + calptr->EdgeOffset[eramp][edge];
        if(max_min_delay < temp)
          max_min_delay = temp;
      }
      calptr->EdgeMinDelay[eramp] = max_min_delay;
    }
```

Copyright 1989 Logic Modeling Systems

LINE # SOURCE TEXT

```
    }

    /* now figure out SampleMinDelay[]    */
    for(eramp = 0; eramp < NUMBER_OF_ERAMPS; eramp++)
    {
      max_min_delay = 0;
      for(aramp = 0; aramp < NUMBER_OF_SRAMPS; aramp++)
      {
        /* min thresh + 2 for thermal tail effects        */
        temp = (long)((calptr->Edge7MinThresh[eramp] + 2)
               * calptr->Edge7Slope[eramp])
            + (long)(calptr->SampleMinThresh[aramp] * calptr->SampleSlope[aramp])
            + calptr->SampleOffset[eramp][aramp];
        if(tmg_cal_debug & 0x10000000)
        {
          lm_message("\neramp(%ld), aramp(%ld)\n", eramp, aramp);
          lm_message("\tEdge7Minth = %ld, Edge7Slope = %ld\n",
                     calptr->Edge7MinThresh[eramp],calptr->Edge7Slope[eramp]);
          lm_message("\tSampleMinth = %ld, SampleSlope = %ld\n",
                   calptr->SampleMinThresh[aramp], calptr->SampleSlope[aramp]);
          lm_message("\ttemp = %ld\n", temp);
        }
        if(max_min_delay < temp)
          max_min_delay = temp;
      }
     calptr->SampleMinDelay[eramp] = max_min_delay;
       if(tmg_cal_debug & 0x10000000)
         lm_message("\tSampleMinDelay = %ld\n", max_min_delay);
    }

    for(aramp = 0; aramp < NUMBER_OF_ERAMPS; aramp++)
    {
      calptr->EarlySampleMinDelay[aramp] = (long)(calptr->SampleMinThresh[aramp]
                                           * calptr->SampleSlope[aramp])
                                           + calptr->EarlySampleOffset[aramp];
      calptr->EarlySampleMaxDelay[aramp] = (2551 - END_DEAD_TIME_FUDGE)
                                           * (long)calptr->SampleSlope[aramp]
                                           + calptr->EarlySampleOffset[aramp];
    }

   return SUCCESS;
 }

/*      tmg_print_calib_structure(calptr)
 *
 *      This routine prints the relavent stuff contained within
 *      a calibration structure.
 *
 *      Inputs: pointer to calib structure
 *      Ouputs: Always returns SUCCESS
 */
tmg_print_calib_structure(calptr)
struct CALIB *calptr;
{
  long eramp, aramp;
  long edge;

  for(eramp = 0; eramp < NUMBER_OF_ERAMPS, eramp++)
  {
    lm_message("Edge Ramp %d:\n", eramp);
    lm_message("\tMinimum delay = %d ps\n", calptr->EdgeMinDelay[eramp]);
    lm_message("\tMaximum delay = %d ps\n", calptr->EdgeMaxDelay[eramp]);
    lm_message("\tslope = %d ps/threshold\n",  calptr->EdgeSlope[eramp][0]);
    lm_message("\tEdge\t\t0\t1\t2\t3\t4\t5\n\tOffset\t");
    for(edge = 0; edge < NUMBER_OF_EDGES; edge++)
      lm_message("\t%d", calptr->EdgeOffset[eramp][edge]);
    lm_message("\n\tLinearity");
    for(edge = 0; edge < NUMBER_OF_EDGES; edge++)
      lm_message("\t%d", calptr->EdgeLinearity[eramp][edge]);
    lm_message("\n");
  }
 for(eramp = 0; eramp < NUMBER_OF_ERAMPS; eramp++)
 {
   lm_message("\nEdge Ramp %d:\n", eramp);
   lm_message("\tSample Minimum Delay = %d\n", calptr->SampleMinDelay[eramp]);
   lm_message("\tSample Ramp\t0\t1\t2\t3\n\tOffset\t");
   for(aramp = 0; aramp < NUMBER_OF_SRAMPS; aramp++)
     lm_message("\t%d", calptr->SampleOffset[eramp][aramp]);
 }
 lm_message("\nSample Ramp\t0\t1\t2\t3\nSlope\t");
 for(aramp = 0; aramp < NUMBER_OF_SRAMPS; aramp++)
   lm_message("\t%d", calptr->SampleSlope[aramp]);
 lm_message("\nLinearity");
 for(aramp = 0; aramp < NUMBER_OF_SRAMPS; aramp++)
   lm_message("\t%d", calptr->SampleLinearity[aramp]);
 lm_message("\n\n");

 lm_message("\nEarly Sample Ramp:\n");
 lm_message("\tRamp\t\t0\t1\t2\t3\n\tMinDelay");
 for(aramp = 0; aramp < NUMBER_OF_SRAMPS; aramp++)
   lm_message("\t%d", calptr->EarlySampleMinDelay[aramp]);
 lm_message("\n\tOffset\t");
 for(aramp = 0; aramp < NUMBER_OF_SRAMPS; aramp++)
   lm_message("\t%d", calptr->EarlySampleOffset[aramp]);
 lm_message("\n\n");

 return SUCCESS;
}

..g_print_data_logging_messages(calptr)
struct CALIB *calptr;
{
  int eramp, edge, aramp, lineno = 0;
  static char leader[] = "DATALOG: ";

  lm_message("\n%s%d BEGIN, Time = %d\n", leader, lineno++, lm_time());
  for(eramp = 0; eramp < NUMBER_OF_ERAMPS; eramp++)
  {
    lm_message("%s%d Edge Ramp %d\n", leader, lineno++, eramp);

    lm_message("%s%d Minimum Thresholds", leader, lineno++);
    for(edge = 0; edge < NUMBER_OF_EDGES; edge++)
      lm_message(" %d", calptr->EdgeMinThresh[eramp][edge]);
    lm_message("\n");

    lm_message("%s%d Minimum Delay %d\n", leader, lineno++,
        calptr->EdgeMinDelay[eramp]);

    lm_message("%s%d Maximum Delay %d\n", leader, lineno++,
        calptr->EdgeMaxDelay[eramp]);
```

Copyright 1989
Logic Modeling Systems

LINE # SOURCE TEXT

```
        lm_message("%s%d Edge Offset", leader, lineno++);
        for(edge = 0; edge < NUMBER_OF_EDGES; edge++)
          lm_message(" %d", calptr->EdgeOffset[aramp][edge]);
        lm_message("\n");

        lm_message("%s%d Edge Slope", leader, lineno++);
        for(edge = 0; edge < NUMBER_OF_EDGES; edge++)
          lm_message(" %d", calptr->EdgeSlope[aramp][edge]);
        lm_message("\n");

        lm_message("%s%d Edge Linearity", leader, lineno++);
        for(edge = 0; edge < NUMBER_OF_EDGES; edge++)
          lm_message(" %d", calptr->EdgeLinearity[aramp][edge]);
        lm_message("\n");

        lm_message("%s%d Edge 7 Minimum Threshold %d\n", leader, lineno++,
            calptr->Edge7MinThresh[aramp]);

        lm_message("%s%d Edge 7 Slope %d\n", leader, lineno++,
            calptr->Edge7Slope[aramp]);

        lm_message("%s%d Edge 7 Linearity %d\n", leader, lineno++,
            calptr->Edge7Linearity[aramp]);
      }
      for(sramp = 0; sramp < NUMBER_OF_SRAMPS; sramp++)
      {
        lm_message("%s%d Sample Ramp %d\n", leader, lineno++, sramp);

        lm_message("%s%d Sample Minimum Threshold %d\n", leader, lineno++,
            calptr->SampleMinThresh[sramp]);

        lm_message("%s%d Sample Minimum Delay %d\n", leader, lineno++,
            calptr->SampleMinDelay[sramp]);

        lm_message("%s%d Sample Maximum Delay %d\n", leader, lineno++,
            calptr->SampleMaxDelay[sramp]);

        lm_message("%s%d Sample Slope %d\n", leader, lineno++,
            calptr->SampleSlope[sramp]);

        lm_message("%s%d Sample Linearity %d\n", leader, lineno++,
            calptr->SampleLinearity[sramp]);

        lm_message("%s%d Sample Offset", leader, lineno++);
        for(eramp = 0; eramp < NUMBER_OF_ERAMPS; eramp++)
          lm_message(" %d", calptr->SampleOffset[sramp][eramp]);
        lm_message("\n");

        lm_message("%s%d Early Sample Minimum Delay %d\n", leader, lineno++,
            calptr->EarlySampleMinDelay[sramp]);

        lm_message("%s%d Early Sample Maximum Delay %d\n", leader, lineno++,
            calptr->EarlySampleMaxDelay[sramp]);

        lm_message("%s%d Early Sample Offset %d\n", leader, lineno++,
            calptr->EarlySampleOffset[sramp]);

      }
      lm_message("%s%d Delay Line Setting %d\n", leader, lineno++,
          calptr->DelayDelay);

      lm_message("%s%d END\n", leader, lineno++);
}


/*      tmg_process_and_transfer_calib_structure(tempptr, realptr)
 *
 *      This routine processes all the data in the temporary calibration
 *      structure and transfers it to the real one.
 *
 *      Inputs: pointers to the temporary and real calib structures
 *      Outputs: returns SUCCESS or FAILURE
 */
tmg_process_and_transfer_calib_structure(tempptr, realptr)
struct CALIB *tempptr, *realptr;
{
  int i;
  char *from, *to;
  tmg_complete_calib_structure(tempptr);
  from = (char *)tempptr;
  to = (char *)realptr;
  for(i = 0; i < sizeof(struct CALIB); i++)
    *to++ = *from++;
  return SUCCESS;
}


tmg_is_calibrated()
{
    return (calib.CalCompleted == CALIBRATION_DONE);
}

static long tmg_save_test_mode, tmg_save_delay_reg;

tmg_restore_calibration()
{
    if (!tmg_is_calibrated()) {
        if (tmg_fast_calibrate() != SUCCESS)
            return FAILURE;
    } else  {
        tmg_set_test_mode(tmg_save_test_mode);
        tmg_set_delay_reg(tmg_save_delay_reg);
    }
    return SUCCESS;
}

tmg_save_calibration()
{
    tmg_save_test_mode = tmg_get_test_mode();
    tmg_save_delay_reg = tmg_get_delay_reg();
}


/*
** tmg_set_timing(period, edgetime, sstime, setime, spw)
** Inputs:       period          clock period in picoseconds
**               edgetime        array of 7 edge times in picoseconds
**               sstime          sample start time in picoseconds
**               setime          latest expected sample start time in picoseconds
```

Copyright 1989
Logic Modeling Systems

SOURCE PROGRAM diags/tmg_cal.c

DATE 5/23/89 TIME 4:41:30 pm PAGE # 24/171

LINE # SOURCE TEXT

```
**                                        (used to select sample ramp)
**          spw                           sample pulse width in picoseconds
*/

tmg_set_timing(peri[illegible]dgetime, sstime, setime, spw)
long period, edgeti[illegible] sstime, setime, spw;
{
   static char me[] = "tmg_set_timing";
   long startdeadtime;
   long enddeadtime;
   long thresholds[NUMBER_OF_EDGES + 1];
   long ramp, edge, thr, slope, offset, srange, sthreshold;
   long edge_limit;
   long sample_delta, srampmindelay, minst;

   /* add start deadtime to andy's numbers */

   /* select edge ramp: */

   for (ramp = 0; ramp < NUMBER_OF_ERAMPS; ++ramp) {
     lm_tmg_get_ramp_dead_time(period, ramp, &startdeadtime, &enddeadtime);
     slope = calib.EdgeSlope[ramp][0];
     offset = calib.EdgeOffset[ramp][0];
     thr = tmg_predict_threshold((period - enddeadtime), slope, offset);
     if ((thr >= calib.EdgeMinThresh[ramp][0]) && (thr < 256))
       break;
   }

   if (ramp >= NUMBER_OF_ERAMPS) {
        lm_error("%s: Requested period out of range\n", me);
        return FAILURE;
   }

  /* Now we have selected our edge ramp, calculate thresholds: */

  /* Now, all edge settings are relative to time 0 (at minthr) */
  for(edge = 0; edge < NUMBER_OF_EDGES; edge++) {
    edge_limit = tmg_predict_period(thr,
      calib.EdgeSlope[ramp][edge], calib.EdgeOffset[ramp][edge]);
    thresholds[edge] = tmg_predict_threshold(edgetime[edge],
      calib.EdgeSlope[ramp][edge], 0) + calib.EdgeMinThresh[ramp][edge];
    if (edgetime[edge] > edge_limit) {
      if (tmg_cal_debug & 0x4000000)
        lm_warning("%s:Edge %d (%dps>=%dps thr %d) too large for ramp %d\n",
          me, edge, edgetime[edge], edge_limit, thresholds[edge], ramp);
      thresholds[edge] = 255;   /* shut the sucker off! */
    }
  }

  /* select sample mode: */
  tmgptr->sample_mode = EDGE7SAMPLETRIGGERMODE;

  /* select sample ramp: */
  sample_delta = setime - sstime;
  for (srange = 0; srange < NUMBER_OF_SRAMPS; ++srange) {
    if (sample_delta <
      (255 - END_DEAD_TIME_FUDGE - calib.SampleMinThresh[srange])
      * calib.SampleSlope[srange])
      break;
  }
  if (srange >= NUMBER_OF_SRAMPS) {
       lm_error("sample time too big\n");
       return FAILURE;
  }
  sthreshold = ca)ib.SampleMinThresh[srange];

  /* now calculate the minimum legal sample time: */
  srampmindelay = tmg_predict_period(calib.SampleMinThresh[srange],
      calib.SampleSlope[srange], calib.SampleOffset[ramp][srange]);
  minst = srampmindelay
    + tmg_predict_period(calib.Edge7MinThresh[ramp],
    calib.Edge7Slope[ramp], 0);

  /* select edge 7 threshold */
  thresholds[6] = tmg_predict_threshold(setime + minst,
    calib.Edge7Slope[ramp], srampmindelay);

  /* set clock period */
  if (tmg_set_period(ramp, &period) != SUCCESS) {
    tmg_report_failure(me, "tmg_set_period");
    return FAILURE;
  }

  /* set edges and edge ramp */
  if (lm_tmg_set_ramp_edge_settings(ramp, thresholds) != SUCCESS) {
    tmg_report_failure(me, "lm_tmg_set_ramp_edge_settings");
    return FAILURE;
  }

  /* set sample range and threshold */
  if (lm_tmg_set_rising_sample(srange, sthreshold) != SUCCESS) {
    tmg_report_failure(me, "lm_tmg_set_rising_sample");
    return FAILURE;
  }

  /* set sample pulse width */
  if (tmg_set_sample_width(period, slope, spw) != SUCCESS) {
    tmg_report_failure(me, "tmg_set_sample_width");
    return FAILURE;
  }

  if (tmg_cal_debug & 0x4000000)
  {
    lm_message("%s:\n", me);
    lm_message("\t period = %dps\n", period);
    lm_message("\t ramp = %d\n", ramp);
    for (edge = 0; edge <= NUMBER_OF_EDGES; edge++) {
      lm_message("\t Edge %d threshold = %d\n", edge, thresholds[edge]);
    }
    lm_message("\t sample range = %d\n", srange);
    lm_message("\t sample threshold = %d\n", sthreshold);
    lm_message("\t sample pulse width register = %d\n",
        tmg_get_sample_width_reg(sample_width));
  }

  return SUCCESS;
}


/* tmg_fast_calibrate() uses conservative default values for slopes */
```

Copyright 1989 Logic Modeling Systems

LINE # SOURCE TEXT

```
/* etc, then really measures and sets the proper delay. */

tmg_fast_calibrate()
{
        static char me[] = "tmg_fast_calibrate";
        extern  struct CALIB default_calib;
        static long fast_cal_delay = 0;
        long errors;
        register long edge;

        bcopy(&default_calib, &calib, sizeof(calib));

        tmg_set_slot_count(2);
        tmg_set_test_mode(1);

        if (!fast_cal_delay) {
                tmg_set_delay(14);              /* delay = 6ns + 14ns */
                if (tmg_measure_ramp(0l, 0l, &calib, &errors) != SUCCESS) {
                        tmg_report_failure(me, "tmg_measure_ramp(0,0)");
                        tmg_set_slot_count(1);
                        tmg_set_test_mode(0);
                        return FAILURE;
                }
                for (edge = 1; edge < NUMBER_OF_EDGES; ++edge) {
                        calib.EdgeSlope[0][edge] = calib.EdgeSlope[0][0];
                        calib.EdgeOffset[0][edge] = calib.EdgeOffset[0][0];
                }
                if (tmg_calibrate_delay(&calib) != SUCCESS) {
                        tmg_report_failure(me, "tmg_calibrate_delay");
                        tmg_set_slot_count(1);
                        tmg_set_test_mode(0);
                        return FAILURE;
                }
                fast_cal_delay = tmg_get_delay();
        } else {
                tmg_set_delay(fast_cal_delay);
        }
        tmg_set_slot_count(1);
        tmg_set_test_mode(0);
        return SUCCESS;
}


/* The following functions were put here for robert's beneifit */

/*      int tmg_esffclear(void)
 *
 *      Clears edge and sample flip flops
 *
 *      Inputs: none
 *      Returns: SUCCESS or FAILURE
 */
int tmg_esffclear()             /* clear the cal flip flops     */
{
  int returncode;

  tmgptr->es_ff_clearL = 0;
  if(tmgptr->edge_cal & 0x1f)   /* see if any still set */
  {
    lm_error("Could not clear cal flip flops\n");
    returncode = FAILURE;
  }
  else
    returncode = SUCCESS;
  tmgptr->es_ff_clearL = 1;

  return(returncode);
}


/*      int tmg_play(timeout)
 *
 *      Initiates pattern presentation
 *
 *      Inputs: none
 *      Returns: SUCCESS or FAILURE
 */
int tmg_play(timeout)                   /* start a presentation */
long timeout;
{
  if(tmg_initiate_play() != SUCCESS)
    return(FAILURE);
  if(tmg_complete_play(timeout) != SUCCESS)
    return(FAILURE);
  else
    return(SUCCESS);
}

/*      int tmg_initiate_play(void)
 *
 *      This routine turns clocks on and starts a presentation.
 *
 *      Inputs: none
 *      Outputs: function returns SUCCESS or FAILURE
 */
int tmg_initiate_play()
{
  if(tmg_clockoff() != SUCCESS)
  {
    lm_error("tmg_initiate_play: tmg_clockoff returned error\n");
    return(FAILURE);
  }
  if(tmg_clockon() != SUCCESS)
  {
    lm_error("play: tmg_clockon returned error\n");
    return(FAILURE);
  }
  tmgptr->pattern_intr_enable = 0;      /* just in case         */
  tmgptr->pattern_intr_enable = 1;      /* enable EOP interrupt */
  tmgptr->start_pattern_play = 1;       /* start presentation   */

  return(SUCCESS);
}


/*      int tmg_complete_play(long timeout)
 *
 *      This function waits for a presentation to complete by
 *      waiting for the EOP interrupt from the Timing Generator.
 *
```

Copyright 1989 Logic Modeling Systems

| SOURCE PROGRAM | DATE | TIME | PAGE # |
|---|---|---|---|
| diags/tmg_cal.c | 5/23/89 | 4:41:30 pm | 26/173 |

LINE # SOURCE TEXT

```
 *      Inputs: timeout is ms
 *      Outputs: function returns SUCCESS or FAILURE
 */
int tmg_complete_play(timeout)
long timeout;
{
  long start;
  int returncode = SUCCESS;

  start = lm_time();
#ifndef DIAGS
  while (!cpu_tmg_interrupt_status())
#else DIAGS
  while(!TMG_INT)                         /* wait for interrupt   */
#endif DIAGS
    if((lm_time() - start) > timeout)
    {
      lm_error("tmg_complete_play: timeout waiting for access mode\n");
      returncode = FAILURE;
      break;
    }
  tmgptr->pattern_intr_enable = 0;      /* clear EOP interrupt  */
  if(tmg_clockoff() != SUCCESS)
    returncode = FAILURE;
  return(returncode);
}


/*      int tmg_clockoff(void)
 *      shuts clock off
 *      Input: nothing
 *      Output: SUCCESS or FAILURE
 */
int tmg_clockoff()
{
  long start;

  tmgptr->clock_enable = 0;
  start = lm_time();
  while(tmgptr->clock_on)
    if((lm_time() - start) > 10)
    {
      if(tmgptr->clock_select > 2)     /* must be external clock       */
        tmgptr->clock_sync_clearL = 0;
      break;
    }
  if(tmgptr->clock_on)
    return(FAILURE);
  tmgptr->clock_sync_clearL = 0;
  return(SUCCESS);
}


/*      int tmg_clockon(void)
 *      turns clock on
 *      Input: nothing
 *      Output: SUCCESS or FAILURE
 */
int tmg_clockon()
{
  long start;
  int playmode;

  playmode = tmgptr->backplane_mode;

  tmgptr->clock_enable = 0;
  tmgptr->clock_sync_clearL = 1;
  tmgptr->clock_enable = 1;

  /* There is one weird condition that if the state machine is  */
  /* caught in play mode and the TMG is reset, when the clock   */
  /* turns on, PLAY goes low and turns it off again.            */
  if(playmode)
  {
    start = lm_time();
    while(!tmgptr->clock_on)
      if((lm_time() - start) > 10)
      {
        tmgptr->clock_enable = 0;
        tmgptr->clock_enable = 1;
        break;
      }
  }
  start = lm_time();
  while(!tmgptr->clock_on)
    if((lm_time() - start) > 10)
    {
      lm_error("tmg_clockon: did not turn on\n");
      return(FAILURE);
    }
  return(SUCCESS);
}

tmg_set_defaults()
{
  *REG(0)  = 0x30;      /* not OBRESET*, not RESET_OUT* */
  *REG(1)  = 0x00;
  *REG(2)  = 0x2c;      /* 25 MHz                       */
  *REG(3)  = 0x0ff;     /* Select divide by 2           */
  *REG(4)  = 0x00;      /* Select fast ramps, no lanes  */
  *REG(5)  = 0x62;      /* Test mode 1, 18ns dlydly     */
  *REG(6)  = 0x07;      /* 10ns dump, ext clock         */
  *REG(7)  = 0x0f;      /* 16 clock sample width        */
  *REG(16) = 0x07;      /* minimum threshold EDGE[0]    */
  *REG(17) = 0x07;      /* EDGE[1]                      */
  *REG(18) = 0x07;      /* EDGE[2]                      */
  *REG(19) = 0x07;      /* EDGE[3]                      */
  *REG(20) = 0x07;      /* EDGE[4]                      */
  *REG(21) = 0x07;      /* EDGE[5]                      */
  *REG(22) = 0x07;      /* SAMPLE Trigger               */
  *REG(23) = 0x07;      /* SAMPLE                       */
}

/*      int tmg_reset(do_bp_reset)
 *
 *      This function performs a power up initialization sequence.
 *
 *      Inputs: do_bp_reset = TRUE if backplane reset desired, else FALSE
 *      Outputs: function returns SUCCESS or FAILURE
 */
```

Copyright 1989
Logic Modeling Systems

LINE # SOURCE TEXT

```
int
tmg_reset(do_bp_reset)
int do_bp_reset;
{
  int returncode = SUCCESS;

#ifdef DIAGS
  if(Host)
    return(returncode);

  if (do_bp_reset) pac_info_init();
#endif DIAGS
  tmg_set_defaults();
  tmgptr->tmg_resetL = 0;
  if (do_bp_reset == TRUE)
    tmgptr->backplane_resetL = 0;

  lm_delay(1);  /* wait for PLL to lock  */

  /* some synchronous magic here... */
  if(tmg_clockoff() != SUCCESS)
  {
    lm_error("Reset: cannot turn clock off.\n");
    returncode = FAILURE;
  }
  if(tmg_clockon() != SUCCESS)
  {
    lm_error("Reset-1: cannot turn clock on.\n");
    returncode = FAILURE;
  }
  if(tmg_clockoff() != SUCCESS)
  {
    lm_error("Reset: cannot turn clock off.\n");
    returncode = FAILURE;
  }

  tmgptr->tmg_resetL = 1;        /* remove TMG reset */
  if(tmg_play((long)TIMEOUT) != SUCCESS)
  {
    lm_error("Reset: cannot play.\n");
    returncode = FAILURE;
  }

  tmg_set_test_mode(0);

  if (do_bp_reset == TRUE)
  {
    if(tmg_clockon() != SUCCESS)
    {
      lm_error("Reset-2: cannot turn clock on.\n");
      returncode = FAILURE;
    }
    lm_delay(5);
    if(tmg_clockoff() != SUCCESS)
    {
      lm_error("Reset: cannot turn clock off.\n");
      returncode = FAILURE;
    }
    lm_delay(5);
    tmgptr->backplane_resetL = 1; /* remove backplane reset */

    /* This next section of code checks for backplane errors
     * and attempts to remove them by probing the PACs in every
     * lane (whether they are there or not). This is becuase it
     * is possible for the PAC to have a bogus refresh error
     * after the reset is de-asserted.  Probing the error register
     * will remove this error.  If errors still exist after the
     * probing takes place, the function returns FAILURE.
     */
    if(tmgptr->lane_intr != 0)
    {
      (void)lm_write_probe(0x8c1002801, 01);
      (void)lm_write_probe(0x9c1002801, 01);
      (void)lm_write_probe(0xac1002801, 01);
      (void)lm_write_probe(0xbc1002801, 01);
    }
  }

  if(bp_mode() == PLAY_MODE)
  {
    (void)lm_error("Backplane is still in play mode after TMG init.\n");
    return FAILURE;
  }

#ifdef DIAGS
  /* Check for backplane errors */
  if(diag_clear_errors() != SUCCESS)
  {
    return FAILURE;
  }
#endif

  return returncode;
}

diag_tmg_reset(do_bp_reset)
int do_bp_reset;
{
  int returncode;
  static long edgetime[] = {
    5000,       /* edge 0 */
    5000,       /* edge 1 */
    5000,       /* edge 2 */
    15000,      /* edge 3 */
    5000,       /* edge 4 */
    0           /* edge 5 */
  };

  returncode = tmg_reset(do_bp_reset);

  if (tmg_restore_calibration() != SUCCESS) {
    (void)lm_error("Usable to restore calibration\n");
    return FAILURE;
  }
  tmg_set_slot_count(1);
  if (tmg_set_timing(1000001, edgetime, 01, 1000001, 25000001) != SUCCESS) {
      lm_error("Could not set edges\n");
      returncode = FAILURE;
  }
```

Copyright 1989
Logic Modeling Systems

SOURCE PROGRAM: diags/tmg_cal.c | DATE: 5/23/89 | TIME: 4:41:30 pm | PAGE # 28/175

LINE # SOURCE TEXT

```
  return(returncode);
}

tmg_report_failure(called_from, failing_func)
char *called_from, *failing_func;
{
  return lm_error("%s: %s failed\n", called_from, failing_func);
}


/*      void tmg_getc(&c, &prompt)
 *
 *        INPUT:  &c = input character
 *                &prompt = address of input prompt
 *        OUTPUT: none
 *        DESCRIPTION: Gets char value from keyboard.
 */
void
tmg_getc(c, prompt)
char *c;
char *prompt;
{
  char reply[2];
  char buffer[1024];

  /* Get input from keyboard */
  sprintf(buffer, "Enter %s : ", prompt);
#ifdef DIAGS
  lm_get_input(buffer, reply, 2);
#endif DIAGS
    *c = reply[0];
}


/***********************/
/* Debug flag routines*/
/***********************/
/*
 * Allow the user in "Wizard" mode to set/reset the various
 * debug flags (tmg_cal_debug) to turn on/off all the wonderful
 * messages available.  This is mostly a software debugging aid, but
 * can come in handy debugging hardware, too.
 */
#define WHAT(x) (tmg_cal_debug & (x) ? "ON" : "OFF")
#define FLIP(x) (tmg_cal_debug ^= (x))
long tmg_modify_edge_related_debug_flag()
{
  char answer;

  do
  {
    answer = 0;
    lm_message("\nEDGE related debug flags are currently set as follows:\n");
    lm_message("\tSingle step              (%s)\n", WHAT(1));
    lm_message("\tprint Arguments          (%s)\n", WHAT(2));
    lm_message("\tprint Process messages (%s)\n", WHAT(4));
    lm_message("\tprint Output messages   (%s)\n", WHAT(8));
    lm_message("\tprint sTarting points   (%s)\n", WHAT(0x10));
    tmg_getc(&answer,"flag to toggle, 'Q' to end");
    switch(answer)
    {
      case 's':
      case 'S': FLIP(1); break;
      case 'a':
      case 'A': FLIP(2); break;
      case 'p':
      case 'P': FLIP(4); break;
      case 'o':
      case 'O': FLIP(8); break;
      case 't':
      case 'T': FLIP(0x10); break;
      default : break;
    }
  } while((answer != 'q') && (answer != 'Q'));
  return SUCCESS;
}

long tmg_modify_sample_related_debug_flag()
{
  char answer;

  do
  {
    answer = 0;
    lm_message("\nSAMPLE related debug flags are currently set as follows:\n");
    lm_message("\tSingle step              (%s)\n", WHAT(0x100));
    lm_message("\tprint Arguments          (%s)\n", WHAT(0x200));
    lm_message("\tprint Process messages (%s)\n", WHAT(0x400));
    lm_message("\tprint Output messages   (%s)\n", WHAT(0x800));
    lm_message("\tprint sTarting points   (%s)\n", WHAT(0x1000));
    tmg_getc(&answer,"flag to toggle, 'Q' to end");
    switch(answer)
    {
      case 's':
      case 'S': FLIP(0x100); break;
      case 'a':
      case 'A': FLIP(0x200); break;
      case 'p':
      case 'P': FLIP(0x400); break;
      case 'o':
      case 'O': FLIP(0x800); break;
      case 't':
      case 'T': FLIP(0x1000); break;
      default : break;
    }
  } while((answer != 'q') && (answer != 'Q'));
  return SUCCESS;
}


long tmg_modify_delayline_related_debug_flag()
{
  char answer;

  do
  {
    answer = 0;
    lm_message("\nDELAY LINE related debug flags are currently set as follows:\n");
    lm_message("\tCalibrate delay output messages (%s)\n", WHAT(0x10000));
    lm_message("\tcOmpute delay process messages  (%s)\n", WHAT(0x20000));
```

Copyright 1989
Logic Modeling Systems

| SOURCE PROGRAM | DATE | PAGE # |
|---|---|---|
| diags/tmg_cal.c | 5/23/89 TIME 4:41:30 pm | 29/176 |

LINE # SOURCE TEXT

```
      lm_message("\tAdjust delay process messages   (%s)\n", WHAT(0x40000));
      tmg_getc(&answer,"flag to toggle, 'Q' to end");
      switch(answer)
      {
        case 'c':
        case 'C': FLIP(0x10000); break;
        case 'o':
        case 'O': FLIP(0x20000); break;
        case 'a':
        case 'A': FLIP(0x40000); break;
        default : break;
      }
    } while((answer != 'q') && (answer != 'Q'));
    return SUCCESS;
}


long tmg_modify_misc_related_debug_flag()
{
    char answer;

    do
    {
      answer = 0;
      lm_message("\nMISCELLANEOUS related debug flags are currently set as follows:\n");
      lm_message("\tprint Calibration structure                     (%s)\n", WHAT(0x800000));
      lm_message("\tprint Line fit arguments                        (%s)\n", WHAT(0x1000000));
      lm_message("\tprint line fit outputs                          (%s)\n", WHAT(0x2000000));
      lm_message("\ttmg_set_timing() Messages                       (%s)\n", WHAT(0x4000000));
      lm_message("\ttmg_set_sample_width() mEssages                 (%s)\n", WHAT(0x8000000));
      lm_message("\ttmg_complete_calib_structure Process messages   (%s)\n", WHAT(0x10000000));
      lm_message("\tAllow extra errors before abort                 (%s)\n", WHAT(0x20000000));
      lm_message("\tSingle step major calibration sections          (%s)\n", WHAT(0x40000000));
      lm_message("\tprint Data logging messages                     (%s)\n", WHAT(0x80000000));
      tmg_getc(&answer,"flag to toggle, 'Q' to end");
      switch(answer)
      {
        case 'c':
        case 'C': FLIP(0x800000); break;
        case 'l':
        case 'L': FLIP(0x1000000); break;
        case 'i':
        case 'I': FLIP(0x2000000); break;
        case 'm':
        case 'M': FLIP(0x4000000); break;
        case 'e':
        case 'E': FLIP(0x8000000); break;
        case 'p':
        case 'P': FLIP(0x10000000); break;
        case 'a':
        case 'A': FLIP(0x20000000); break;
        case 's':
        case 'S': FLIP(0x40000000); break;
        case 'd':
        case 'D': FLIP(0x80000000); break;
        default : break;
      }
    } while((answer != 'q') && (answer != 'Q'));
    return SUCCESS;
}


long tmg_modify_all_debug_flag()
{
    char answer;
    int done = 0;

    do
    {
      lm_message("Set or Reset all debug flags\n");
      tmg_getc(&answer,"Set, Reset, or Quit");
      switch(answer)
      {
        case 's':
        case 'S': tmg_cal_debug |= 0x0fffffffl; done++; break;
        case 'r':
        case 'R': tmg_cal_debug &= 0; done++; break;
        default: break;
      }
    } while(!done);
    return SUCCESS;
}

extern struct calib;
print_calib_structure()
{
    if(!tmg_is_calibrated())
    {
      lm_message("\007\007Calibration has not been successfully completed\n");
      lm_message("Interpret the calibration data accordingly\n\n");
    }
    tmg_print_calib_structure(&calib);
#ifdef PS_TS_DEBUG
    print_ps_and_ts();
#endif PS_TS_DEBUG
    return SUCCESS;
}

#ifdef PS_TS_DEBUG
print_ps_and_ts()
{
    int r, e, i;

    for (r = 0; r < NUMBER_OF_ERAMPS; ++ r) {
      for (e = 0; e < (NUMBER_OF_EDGES + 1); ++ e) {
        for (i = 0; i < 7; ++ i) {
          lm_message("R%d E%d %15d %3d\n", r, e, p[r][e][i], t[r][e][i]);
        }
        lm_message("\n");
      }
    }
}
#endif PS_TS_DEBUG
```

Copyright 1989
Logic Modeling Systems

SOURCE PROGRAM: diags/tmg_diag.c | DATE: 5/23/89 | TIME: 4:41:33 pm | PAGE # 1/177

LINE # SOURCE TEXT

```
/* SCCS_ID: tmg_diag.c rev 3.2, 5/9/89 at 15:55:24      */

/*********************************************************************
 *                                                                   *
 *      tmg_diag.c                                                   *
 *                                                                   *
 *      Diagnostic routines for the Timing Generator                 *
 *                                                                   *
 *********************************************************************/

#include "common.h"
#include "vrtx.h"
#include "cpu.h"
#include "lm_diags.h"
#include "tmg.h"
#include "tmg_def.h"
#include "mod_def.h"
#include "tmg_extn.h"
#include "id.h"
extern int tmg_cal_debug;

/*
 *      long tmg_register_test(void)
 *      Performs register test of all read/write registers
 *
 *      Input: none
 *      Returns: SUCCESS if no errors, else FAILURE
 */
tmg_register_test()
{
  int i, returncode;
  static unsigned char misc[] = {0x10, 2, 3, 4, 5, 6, 7, 8};
  unsigned char tmp;

  if(tmg_clockoff() != SUCCESS) /* turn clock off so as not to interfere*/
    return(FAILURE);

  returncode = SUCCESS;

/*      First check to see that all bits of all registers work          */
/* Register 0 is wierd in that it has OBRESET* that clears bits 0 and 1 */
/* so it gets its own walk1 and walk0 test.                             */
/* Register 2 is special because it is the PLL rate register and is not */
/* allowed to contain some values.  It can contain only values between  */
/* 1 and 129.  The walking 0 test has been modified accordingly.        */
  for(i = 0; i < 7; i++)
  {
    switch(i)
    {
      case 0:
        if(tmg_reg0walk1(REG(i)) != SUCCESS)
          returncode = FAILURE;
        if(tmg_reg0walk0(REG(i)) != SUCCESS)
          returncode = FAILURE;
        break;
      case 2:
        if(tmg_walk1(REG(i)) != SUCCESS)
          returncode = FAILURE;
        if(tmg_reg2walk0(REG(i)) != SUCCESS)
          returncode = FAILURE;
        break;
      default:
        if(tmg_walk1(REG(i)) != SUCCESS)
          returncode = FAILURE;
        if(tmg_walk0(REG(i)) != SUCCESS)
          returncode = FAILURE;
        break;
    }
  }

/*      Next, see that all registers are independently addressable      */
  for(i = 0; i < 8; i++)
    *REG(i) = misc[i];

  for(i = 0; i < 8; i++)
    if((tmp = *REG(i)) != misc[i])
    {
      (void)lm_error("Register at %08lx: wrote %02x, read %02x\n",
                (u_long)(REG(i)), misc[i], tmp);
      returncode = FAILURE;
    }

  if (tmg_reset(TRUE) != SUCCESS) /* force hard reset after this test */
  {
    (void)lm_warning("Reset after register test failed.\n");
  }

  return(returncode);
}


/*
 *      long tmg_idprom_test(void)
 *      Input: none
 *      Returns: SUCCESS or FAILURE
 */
tmg_idprom_test()
{
  u_char temp;
  if((temp = id_checksum((u_char *)((int)&tmgptr->id_prom[0] + 3)))
                                    != ID_CHECKSUM_GOOD)
  {
    (void)lm_error("ID Prom checksum %02X (should be %02X)\n",temp,ID_CHECKSUM_GOOD);
    return(FAILURE);
  }

  return SUCCESS;
}

/*
 *      long tmg_ctc_test(void)
 *      Input: none
 *      Returns: SUCCESS or FAILURE
 *
 *      Note: this routine relies on the clocks working.
 *      It will be hard to know if the CTC counts wrong or
 *      if the PLL generates the wrong clock frequency.
 */
tmg_ctc_test()
{
```

Copyright 1989 Logic Modeling Systems

| SOURCE PROGRAM | DATE | PAGE # |
|---|---|---|
| diags/tmg_diag.c | 5/23/89<br>TIME 4:41:33 pm | 2/178 |

SOURCE TEXT

```
  int returncode, i;
  int cntr1[3], cntr2[3];
  unsigned long start;
  int zero = 0;

  returncode = SUCCESS;
  if(tmg_clockoff() != SUCCESS) /* shut clock off if on        */
  {
    (void)lm_error("Cannot continue CTC Test with broken clock.\n");
    return(FAILURE);
  }
                                /* set clock to approx 25 MHz   */
  tmgptr->pll_rate = (256 - 213) + 1;  /* freq=30Mhz*213/256   */
  tmgptr->pll_divisor = 255;    /* just divide by 2             */
  tmgptr->clock_select = 0;     /* select divide by 2           */

  lm_delay(2);                  /* lots of lock time            */
  if(tmg_clockon() != SUCCESS)  /* turn it on                   */
  {
    (void)lm_error("Cannot continue CTC Test, clock does not turn on.\n");
    return(FAILURE);
  }
  tmgptr->ctc_intr_clearL = 0;  /* make sure output is false    */
  if(tmgptr->ctc_intr)
  {
    (void)lm_error("CTC Test: Interrupt flip flop did not clear.\n");
  }
  tmgptr->ctc_register[3].value = CNTR0CN;/* control word       */
  tmgptr->ctc_register[0].value = 1;    /* very short count, lsb*/
  tmgptr->ctc_register[0].value = zero; /* msb                  */

  tmgptr->ctc_intr_clearL = 1;  /* trigger timer                */
  for(i = 0; i < 10; i++)       /* wait just a little while     */
    ;
  if(!tmgptr->ctc_intr)
  {
    (void)lm_error("CTC Test: Interrupt failure after short count.\n");
    returncode = FAILURE;
  }

  tmgptr->ctc_intr_clearL = 0;  /* make sure output is false    */
  if(tmgptr->ctc_intr)
  {
    (void)lm_error("CTC Test: Interrupt flip flop did not clear.\n");
    returncode = FAILURE;
  }

  tmgptr->ctc_register[3].value = CNTR0CN;/* control word       */
  tmgptr->ctc_register[0].value = 0xe8; /* lsb of 1000          */
  tmgptr->ctc_register[0].value = 0x03; /* msb of 1000          */

  tmgptr->ctc_register[3].value = CNTR1CN;/* control word       */
  tmgptr->ctc_register[1].value = zero; /* max count 2 ** 32    */
  tmgptr->ctc_register[1].value = zero;

  tmgptr->ctc_register[3].value = CNTR2CN;/* control word       */
  tmgptr->ctc_register[2].value = zero; /* max count 2 ** 32    */
  tmgptr->ctc_register[2].value = zero;

  tmgptr->ctc_intr_clearL = 1;  /* start counter 0              */

  start = lm_time();
  while(!tmgptr->ctc_intr)               /* wait for done       */
    if((lm_time() - start) > 10)
    {
      (void)lm_error("CTC Test: Timer test did not finish.\n");
      returncode = FAILURE;
      break;
    }

  tmgptr->ctc_register[3].value = CNTR12LATCH;  /* latch count/status   */

/* counter 0 loaded with count of 1000                          */
/* counters 1,2 are loaded with 0, and count down.              */
/* freq of counter 0 clock is (213/256)*30 MHz)                 */
/* freq of counters 1,2 is 30 MHz / 8                           */
/* should count 1000*256*16/213/8 = 2403.7 = 963h clocks        */
/*   this results in reading 10000h - 963h = f69dh from         */
/*   counter 1 and nothing from counter 2                       */
/* Now, it is easy to get +/- one clock accuracy since the      */
/*   two clock frequencies are almost relatively prime, and     */
/*   with a little PLL error and the fact that .7 clocks is     */
/*   close to a whole clock, it is reasonable to expect that    */
/*   we could measure 963h +2,-1 clocks, or read f69bh thru     */
/*   f69eh.  If we read outside this range, it is an error.     */

  for(i = 0; i < 3; i++)
    cntr1[i] = tmgptr->ctc_register[1].value & 0x0ff;
  if(!(cntr1[0] & 0x40))          /* null flag not set    */
  {
    if((cntr1[1] < 0x9a) || (cntr1[1] > 0x9e))  /* lsb first    */
    {
      (void)lm_error("CTC Test: Count test, register 1 lsb = %02x, \
expected from 9a thru 9e.\n", cntr1[1]);
      returncode = FAILURE;
    }

    if(cntr1[2] != 0xf6)          /* msb next             */
    {
      (void)lm_error("CTC Test: Count test, register 1 msb = %02x, expected f6.\n", cntr1[2]);
      returncode = FAILURE;
    }
  }
  else
  {
    (void)lm_error("CTC Test: Counter 1 Null flag set.\n");
    returncode = FAILURE;
  }

  for(i = 0; i < 3; i++)
    cntr2[i] = tmgptr->ctc_register[2].value & 0x0ff;
  if(!(cntr2[0] & 0x40))          /* null flag not set    */
  {
    (void)lm_error("CTC Test: Count test, counter 2 null flag not set.\n");
    returncode = FAILURE;
  }

  return(returncode);
}
```

Copyright 1989
Logic Modeling Systems

LINE # SOURCE TEXT

```
/*      int tmg_plltime(timeptr)
 *      Measure lock time of PLL
 *      Input: pointer to lock time
 *      Ouput: time is assigned, function returns SUCCESS or FAILURE
 *
 *      This routine uses the 8254 in a strange way
 *      Counter 1 is used to count the time since it's clock
 *      is FREF2I32 (3.75 MHz), but the gate from Counter 0 Output
 *      must be high.
 *      1) First a fairly slow clock is selected
 *      2) Counter 0 is set for Mode 1 with a long count
 *      3) As soon as it's count is started, the clock should be
 *         turned off, leaving it's output active (gate for Counter 1)
 *      4) Load Counter 1
 *      5) Monkey with PLL
 *      6) When PLL is locked, check count in Counter 1, convert
 *         to time
 */
int tmg_plltime(timeptr)
unsigned long *timeptr;
{
  long i, usecs, maxtries, slewuptime, slewdowntime;
  unsigned long value, start;
  int cntrl[3], debounced;
  int successes, failures, successthistime, failedthistime;
  int upreturncode, downreturncode;
  int zero = 0;

  upreturncode = downreturncode = SUCCESS;

  if(tmg_clockoff() != SUCCESS) /* make sure clock is off          */
  {
    (void)lm_error("PLL Lock Time: cannot turn clock off(1)\n");
    return(FAILURE);
  }

  tmgptr->pll_rate = (256 - 128) + 1;    /* sets to 30 MHz          */
  tmgptr->pll_divisor = (256 - 15) + 1; /* choose div 2 * 15        */
  tmgptr->clock_select = 1;             /* sel div 2K              */

  lm_delay(2);                    /* wait lots of time for lock    */

  if(!tmgptr->pll_locked)
  {
    (void)lm_error("PLL Lock Time: Lock indicator not functional\n");
    return(FAILURE);
  }

  if(tmg_clockon() != SUCCESS)  /* make sure clock is on          */
  {
    (void)lm_error("PLL Lock Time: cannot turn clock on\n");
    return(FAILURE);
  }

  tmgptr->ctc_intr_clearL = 0;                    /* GATE0 low     */
  tmgptr->ctc_register[3].value = 0x30;           /* setup mode 0 */
  tmgptr->ctc_register[0].value = zero; /* lsb for max count       */
  tmgptr->ctc_register[0].value = zero; /* msb                      */

  /* since GATE0 has no effect on OUT0, OUT0 should be low        */
  /* and furthermore, Counter0 should not be counting              */

  /* at this point, merely verify that Counter0 output is low     */
  maxtries = 10000;
  while(1)
  {
    tmgptr->ctc_register[3].value = LATCH_CNTR_0;
    if(!(tmgptr->ctc_register[0].value & 0x80))
      break;
    if(--maxtries == 0)
    {
      (void)lm_error("PLL Lock Time: Counter0 output was not low.\n");
      return FAILURE;
    }
  }

  /* turn the clock off to keep the PACs & PELs happy              */
  if(tmg_clockoff() != SUCCESS) /* make sure clock is off          */
  {
    (void)lm_error("PLL Lock Time: cannot turn clock off(2)\n");
    return(FAILURE);
  }

  /* measure time to lock from 30 -> 60 MHz      */
  successes = failures = 0;
  slewuptime = 0;
  do
  {
    tmgptr->pll_rate = 129;                       /* set to 30 MHz         */
    lm_delay(2);                                  /* wait for lock         */
    maxtries = 1000;                              /* cpu speed dependent   */
    successthistime = failedthistime = FALSE;
    tmgptr->ctc_register[3].value = 0x070;        /* setup mode 0          */
    tmgptr->ctc_register[1].value = zero;
    tmgptr->ctc_register[1].value = zero;         /* counter now running   */

    CPU_DISABLE_INTERRUPTS;
    tmgptr->pll_rate = 1;                         /* (256 - 256) + 1)      *
                                                  /* slew to 60 MHz        */
    while(tmgptr->pll_locked == 1)
      if(--maxtries == 0)
      {
        ++failures;
        failedthistime = TRUE;
        break;
      }

    if(failures >= 100)
    {
      CPU_ENABLE_INTERRUPTS;
      break;                     /* break out of loop              */
    }
    if(failedthistime == TRUE)
    {
      CPU_ENABLE_INTERRUPTS;
      continue;                  /* go try again                   */
    }
    else
    {
```

Copyright 1989 Logic Modeling Systems

SOURCE PROGRAM diags/tmg_diag.c | DATE 5/23/89 | TIME 4:41:33 pm | PAGE # 4/180

LINE # SOURCE TEXT

```
        ++successes;               /* must have been a success      */
        successthistime = TRUE;
      }

      debounced = 0;
      maxtries = 10000;
      while(!debounced)    /* wait for lock and debounce, too      */
      {
        for(i = 0; i < 50; i++)    /* look for 50 samples in row    */
        {
          if(!(--maxtries))
          {
            CPU_ENABLE_INTERRUPTS;
            (void)lm_error("PLL Lock Time: Timeout waiting for lock true(1)\n");
            return FAILURE;
          }
          if(!tmgptr->pll_locked)
            break;
          if(i == 0)       /* get the time of first lock          */
          {
            tmgptr->ctc_register[3].value = LATCH_CNTR_1;
            for(i = 0; i < 3; i++)
              cntrl[i] = tmgptr->ctc_register[1].value & 0x0ff;
            if(cntrl[0] & 0x40)              /* if null flag set      */
              value = 0l;
            else
            {
              value = cntrl[1] + (cntrl[2] << 8);
              if(value == 0l)
                value = 1l;
              else
                value = 0x10001l - value;
            }
          }
        }
        if(i == 50)
          debounced = 1;
      }
      CPU_ENABLE_INTERRUPTS;
      if(successthistime == TRUE)
        slewuptime += value;
    } while(successes < 10);

    if(successes == 0)
    {
      upreturncode = FAILURE;
    }
    else
    {
      slewuptime = slewuptime * 2667 / (10000 * successes);
/*    lm_message("slew up time = %d usecs\n",slewuptime); */
    }


    /* now measure time to lock from 60 -> 30 MHz */
    successes = failures = 0;
    slewdowntime = 0;
    do
    {
      tmgptr->pll_rate = 1;                         /* set to 60 MHz         */
      lm_delay(2);                                  /* wait for lock         */
      maxtries = 1000;                              /* cpu speed dependent   */
      successthistime = failedthistime = FALSE;
      tmgptr->ctc_register[3].value = 0x070;        /* setup mode 0          */
      tmgptr->ctc_register[1].value = zero;
      tmgptr->ctc_register[1].value = zero;         /* counter now running   */

      CPU_DISABLE_INTERRUPTS;
      tmgptr->pll_rate = 129;                       /* (256 - 128) + 1)      */
                                                    /* slew to 30 MHz        */
      while(tmgptr->pll_locked == 1)
        if(--maxtries == 0)
        {
          ++failures;
          failedthistime = TRUE;
          break;
        }

      if(failures >= 100)
      {
        CPU_ENABLE_INTERRUPTS;
        break;                    /* break out of loop             */
      }
      if(failedthistime == TRUE)
      {
        CPU_ENABLE_INTERRUPTS;
        continue;                 /* go try again                  */
      }
      else
      {
        ++successes;              /* must have been a success      */
        successthistime = TRUE;
      }

      debounced = 0;
      maxtries = 10000;
      while(!debounced)    /* wait for lock and debounce, too      */
      {
        for(i = 0; i < 50; i++)    /* look for 50 samples in row    */
        {
          if(!(--maxtries))
          {
            CPU_ENABLE_INTERRUPTS;
            (void)lm_error("PLL Lock Time: Timeout waiting for lock true(2)\n");
            return FAILURE;
          }
          if(!tmgptr->pll_locked)
            break;
          if(i == 0)       /* get the time of first lock          */
          {
            tmgptr->ctc_register[3].value = LATCH_CNTR_1;
            for(i = 0; i < 3; i++)
              cntrl[i] = tmgptr->ctc_register[1].value & 0x0ff;
            if(cntrl[0] & 0x40)              /* if null flag set      */
              value = 0l;
            else
            {
              value = cntrl[1] + (cntrl[2] << 8);
              if(value == 0l)
                value = 1l;
```

Copyright 1989 Logic Modeling Systems

SOURCE PROGRAM diags/tmg_diag.c | DATE 5/23/89 | TIME 4:41:33 pm | PAGE # 5/181

LINE # SOURCE TEXT

```
                else
                    value = 0x100011 - value;
            }
        }
    }
    if(i == 50)
        debounced = 1;
  }
  CPU_ENABLE_INTERRUPTS;
  if(successthistime == TRUE)
    slewdowntime += value;
 } while(successes < 10);
 if(successes == 0)
 {
   downreturncode = FAILURE;
 }
 else
 {
   slewdowntime = slewdowntime * 2667 / (10000 * successes);
/*   lm_message("slew down time = %d usecs\n", slewdowntime); */
 }

 usecs = (slewuptime > slewdowntime) ? slewuptime : slewdowntime;

 *timeptr = usecs;
 if((upreturncode == SUCCESS) || (downreturncode == SUCCESS))
   return SUCCESS;
 else
   return FAILURE;
}


/*      long tmg_pll_lock(void)
 *
 *      This function checks PLL lock time against limits.  It
 *      calls tmg_plltime() to measure the time.
 *
 *      Inputs: none
 *      Outputs: function returns SUCCESS or FAILURE
 */
tmg_pll_lock()
{
  u_long locktime;

  if(tmg_plltime(&locktime) != SUCCESS)
  {
    (void)lm_error("PLL Lock Time: Error measuring lock time.\n");
    return(FAILURE);
  }
  (void)lm_message("PLL Lock Time is %ld microseconds.\n", locktime);
  if(locktime > 15001)
  {
    lm_error("PLL Lock Time (%d usec) exceeds 1500 usec bounds\n");
    return FAILURE;
  }
  else
    return(SUCCESS);
}


/*      long tmg_pll_rate(void)
 *      This routine checks the PLL frequencies for various
 *      values of N to verify all aspects of divide by N counter
 *
 *      Counter load values will be:   1 (N = 256)
 *                                     129 (N = 128)
 *                                     55h (N = 172)
 *                                     2ah (N = 42)
 *
 *      Input: nothing
 *      Return: SUCCESS or FAILURE
 *
 *      Test failures are those where tmg_checkrate() returns
 *      discrepancy of more than 1 clock.
 *
 *      PLL freq: fo = 2 * N * 30 MHz / 256
 *      TTLSUNK freq: TTLSOBRCV_CLK / 8
 *      TTLSOBRCV_CLK freq: either fo/2, fo/2K, or fo/4K
 *      TTLSFREFX32 freq: 30 MHz / 8 (reference to 8254)
 *
 *      The 8254 counts the number of reference clocks (TTLSFREFX32)
 *      that occur within 1000 unkown clocks (TTLSUNK).  This results
 *      in a measurement that is accurate to at least 1 part in 1000
 *      for the unknown frequency.
 *
 *      The time for 1000 clocks of unknown frequency is found to be
 *            t = 1000 / (2 * (N * (30 MHz / 256) / 16) / X), X = 2, 2K, or 4K
 *
 *      The number of reference clocks that expire in an interval t is
 *            #clocks = t * (30 MHz / 8)
 *                    = 1000 / ((N / 256) / X), X = 2, 2K, or 4X
 *      Even if the PLL were perfect, there could be +/- 1 clock in our
 *      measurement.  Some of the calculated number of clocks are non-integers
 *      that with a little error on the PLL, could result in another clock
 *      being measured.  Also, depending on how many of the PLL reference
 *      periods (~117 KHz) occur within the measurement interval, can get
 *      more error.  It is reasonable to expect 0.1% error over the short
 *      haul.
 *
 */
tmg_pll_rate()
{
     int i;
     int returncode;
     int noclocks;
     /* N = 256 => fo = 60 MHz, should count 2000 clocks          */
     /* N = 128 => fo = 30 MHz, should count 4000 clocks          */
     /* N = 172 => fo = 40.3125 MHz, should count 2976 clocks      */
     /* N = 215 => fo = 50.390625 MHz, should count 2381 clocks     */
     static int n[] = { 256, 128, 172, 215 };
     static long clocks[] = { 20001, 40001, 29761, 23811 };
     static int delta[] = { 3, 5, 5, 4 };
     static char error_format[]
     = "%s Divide by %d failure.\n\tExpected %d clocks, measured %d clocks\n";

     returncode = SUCCESS;

     for (i = 0; i < 4; ++i) {
         if((tmg_checkrate(n[i],2,clocks[i],&noclocks) != SUCCESS))
         {
```

Copyright 1989 Logic Modeling Systems

| SOURCE PROGRAM | DATE 5/23/89 | PAGE # |
|---|---|---|
| diags/tmg_diag.c | TIME 4:41:33 pm | 6/182 |

SOURCE TEXT

```
                returncode = FAILURE;
                if (lm_error("PLL Div by N: tmg_checkrate() returned error.\n")
                    != SUCCESS) return FAILURE;
            }
            else
            {
                if(abs(noclocks) > delta[i])     /* .2% + 1     */
                {
                    returncode = FAILURE;
                    if (lm_error(error_format, "PLL Div by N:",
                        n[i], clocks[i], clocks[i] + noclocks) != SUCCESS)
                        return FAILURE;
                }
            }
        }

        return(returncode);
}


/*      long tmg_pll_div(void)
 *      this test checks divide by 2K counter and last div 4K flip flop
 *
 *      All tests run using fo = 60 MHz
 *
 *      Input: nothing
 *      Return: SUCCESS or FAILURE
 */
tmg_pll_div()
{
    int returncode;
    int error;

    returncode = SUCCESS;

    /* 2K, K = 2, #clocks = 1000 / ((N/256)/2K), N = 256          */
    if(tmg_checkrate(256,4,4000l,&error) != SUCCESS)
      return(FAILURE);
    else
      if(abs(error) > 5)  /* .1% + 1      */
      {
        (void)lm_error("PLL Div by K: Divide by 2 failure.\n");
        returncode = FAILURE;
      }

    /* 2K, K = 256                                                 */
    if(tmg_checkrate(256,512,512000l,&error) != SUCCESS)
      return(FAILURE);
    else
      if(abs(error) > 5)  /* can't believe it could be that high  */
      {
        (void)lm_error("PLL Div by K: Divide by 256 failure.\n");
        returncode = FAILURE;
      }
    /* 2K, K = 172 (pll_divisor = 0x55)                            */
    if(tmg_checkrate(256,344,344000l,&error) != SUCCESS)
      return(FAILURE);
    else
      if(abs(error) > 5)  /* same as above      */
      {
        (void)lm_error("PLL Div by K: Divide by 172 failure.\n");
        returncode = FAILURE;
      }
    /* 2K, K = 87 (pll_divisor = 0xaa)                             */
    if(tmg_checkrate(256,174,174000l,&error) != SUCCESS)
      return(FAILURE);
    else
      if(abs(error) > 5)  /* same as above      */
      {
        (void)lm_error("PLL Div by K: Divide by 87 failure.\n");
        returncode = FAILURE;
      }

    return(returncode);
}


/*      tmg_slow_detect(void)
 *
 *      checks slow clock detector
 *      Inputs: none
 *      Returns: SUCCESS or FAILURE
 */
tmg_slow_detect()
{
    int returncode;
    u_long start;

    returncode = SUCCESS;
    if(tmg_clockoff() != SUCCESS)
    {
      (void)lm_error("Slow Clock Detect: Could not turn clock off.\n");
      return(FAILURE);
    }
    tmgptr->slow_clock_clearL = 0;
    if(tmgptr->slow_clock)
    {
      (void)lm_error("Slow Clock Detect: Slow status bit stuck true.\n");
      tmgptr->slow_clock_clearL = 0;
      return(FAILURE);
    }
    tmgptr->pll_rate = 1;          /* PLL set to 60 MHz      */
    tmgptr->pll_divisor = 33;      /* K = 224 (134 KHz)      */
    tmgptr->clock_select = 1;      /* Select divide by 2K    */
    lm_delay(10);                  /* wait for lock          */
    if(tmg_clockon() != SUCCESS)
    {
      (void)lm_error("Slow Clock Detect: cannot turn clock on.\n");
      return(FAILURE);
    }
    start = lm_time();
    do
    {
      if((lm_time() - start) > TIMEOUT)
      {
        (void)lm_error("Slow Clock Detect: timeout trying to initialize.\n");
        return FAILURE;
      }
      tmgptr->slow_clock_clearL = 0;       /* clear it              */
      tmgptr->slow_clock_clearL = 1;       /* unclear it            */
```

Copyright 1989
Logic Modeling Systems

SOURCE PROGRAM diags/tmg_diag.c | DATE 5/23/89 | TIME 4:41:33 pm | PAGE # 7/183

LINE # SOURCE TEXT

```
  } while(tmgptr->slow_clock);          /* it set, repeat      */

  /* now the flip flop is really cleared, lets see if it sets  */
  lm_delay(10);                  /* detector should not fire     */
                                 /* in about 8 usecs             */
  if(tmgptr->slow_clock)
  {
    (void)lm_error("Slow Clock Detect: detector fired at 134 KHz.\n");
    returncode = FAILURE;
  }
  if(tmg_clockoff() != SUCCESS)
  {
    (void)lm_error("Slow Clock Detect: cannot turn clock off.\n");
    return(FAILURE);
  }
  tmgptr->slow_clock_clearL = 0;
  tmgptr->pll_divisor = 1;      /* K = 256 (117 KHz)    */
  if(tmg_clockon() != SUCCESS)
  {
    (void)lm_error("Slow Clock Detect: cannot turn clock on.\n");
    return(FAILURE);
  }
  lm_delay(1);           /* wait for freq to stabilize   */
  tmgptr->slow_clock_clearL = 1;
  lm_delay(10);                  /* detector should fire */
                                 /* in about 8 usecs     */
  if(!tmgptr->slow_clock)        /* should be set        */
  {
    (void)lm_error("Slow Clock Detect: detector did not fire at 117 KHz.\n");
    returncode = FAILURE;
  }
  if(tmg_clockoff() != SUCCESS)
  {
    (void)lm_error("Slow Clock Detect: cannot turn clock off.\n");
    return(FAILURE);
  }
  tmgptr->pll_divisor = 33;     /* K = 224 (134 KHz)    */
  lm_delay(1);
  if(tmg_clockon() != SUCCESS)
  {
    (void)lm_error("Slow Clock Detect: cannot turn clock on.\n");
    return(FAILURE);
  }
  if(!tmgptr->slow_clock)        /* should still be set  */
  {
    (void)lm_error("Slow Clock Detect: output cleared without command.\n");
    returncode = FAILURE;
  }
  tmgptr->slow_clock_clearL = 0;

  return(returncode);
}


/*      int tmg_freq_ext0(void)
 *
 *      This function measures the frequency of External Clock 0.
 *
 *      Inputs: none
 *      Outputs: function returns SUCCESS or FAILURE
 */
int tmg_freq_ext0()
{
  unsigned long hertz, noclocks;

  if(tmg_clockoff() != SUCCESS)
  {
    (void)lm_error("Meas ure Ext0 Frequency: cannot shut clock off.\n");
    return(FAILURE);
  }
  tmgptr->clock_select = 3;
  if(tmg_measure_freq(&noclocks) != SUCCESS)
  {
    (void)lm_error("Measure Ext0 Frequency: FAILURE!\n");
    return(FAILURE);
  }
  hertz = (6e11 / (double)noclocks);
  (void)lm_banner("External Clock 0 frequency is %ld Hz.\n", hertz);
  return(SUCCESS);
}

/*      int tmg_freq_ext1(void)
 *
 *      This function measures the frequency of External Clock 1.
 *
 *      Inputs: none
 *      Outputs: function returns SUCCESS or FAILURE
 */
int tmg_freq_ext1()
{
  unsigned long hertz, noclocks;

  if(tmg_clockoff() != SUCCESS)
  {
    (void)lm_error("Measure Ext1 Frequency: cannot shut clock off.\n");
    return(FAILURE);
  }
  tmgptr->clock_select = 4;
  if(tmg_measure_freq(&noclocks) != SUCCESS)
  {
    (void)lm_error("Measure Ext1 Frequency: FAILURE!\n");
    return(FAILURE);
  }
  hertz = (6e11 / (double)noclocks);
  (void)lm_banner("External Clock 1 frequency is %ld Hz.\n", hertz);
  return(SUCCESS);
}


/*      long tmg_interrupts(void)
 *
 *      This function tests Timing Generator Interrupt capability.
 *
 *      Inputs: none
 *      Outputs: function returns SUCCESS or FAILURE
 */
tmg_interrupts()
{
  long returncode;
  u_long start;
```

Copyright 1989
Logic Modeling Systems

LINE # SOURCE TEXT

```
    int zero = 0;

    returncode = SUCCESS;

    if(tmg_reset(FALSE) != SUCCESS)
    {
      (void)lm_error("Interrupt Test: cannot reset.\n");
      return(FAILURE);
    }

    if(tmg_clockoff() != SUCCESS)
      (void)lm_error("Interrupt Test: cannot turn clock off.\n");
    if(tmg_clockon() != SUCCESS)
    {
      (void)lm_error("Interrupt Test: cannot turn clock on.\n");
      return(FAILURE);
    }

    /* first check that no interrupts exist        */
    if(TMG_INT)
    {
      (void)lm_error("Interrupt Test: interrupt active after reset, check CPU.\n");
      return(FAILURE);
    }

    /* check CTC Interrupt Capability      */
    (void)lm_message("Checking CTC Interrupt\n");
    if(tmgptr->ctc_intr)
    {
      (void)lm_error("Interrupt Test: CTC Interrupt active after reset.\n");
      returncode = FAILURE;
    }

    tmgptr->ctc_register[3].value = CNTR0CW;       /* initialize cntr 0    */
    tmgptr->ctc_intr_enable = 1;
    tmgptr->ctc_register[0].value = 1;    /* lsb of very short count     */
    tmgptr->ctc_register[0].value = zero; /* msb of very short count     */
    tmgptr->ctc_intr_clearL = 1;          /* start timer                 */
    start = lm_time();
    while(!TMG_INT)
      if((lm_time() - start) > 10)
      {
        (void)lm_error("Interrupt Test: CTC failed to interrupt.\n");
        returncode = FAILURE;
        break;
      }
    if(!tmgptr->ctc_intr)
    {
      (void)lm_error("Interrupt Test: expected CTC interrupt, received other.\n");
      returncode = FAILURE;
    }
    else
    {
      (void)lm_message("Interrupt Test: CTC interrupt received OK.\n");
      tmgptr->ctc_intr_clearL = 0;         /* clear output              */
      tmgptr->ctc_intr_enable = 0;         /* disable interrupt         */
    }

    /* now check EOP Interrupt Capability */
    (void)lm_message("Checking End-of-Play Interrupt\n");
    tmg_set_test_mode(1);
    tmgptr->pattern_intr_enable = 1;      /* enable EOP interrupt        */
    tmgptr->start_pattern_play = 1;       /* start the PLAY              */
    start = lm_time();
    while(!TMG_INT)
      if((lm_time() - start) > 10)
      {
        (void)lm_error("Interrupt Test: EOP failed to interrupt.\n");
        returncode = FAILURE;
        break;
      }
    if(TMG_INT)
      (void)lm_message("Interrupt Test: EOP interrupt received OK.\n");
    tmgptr->pattern_intr_enable = 0;
    if(TMG_INT)
    {
      (void)lm_error("Interrupt Test: EOP interrupt did not clear.\n");
      returncode = FAILURE;
    }

    /* finally check Error Interrupt Capability    */
    (void)lm_message("Checking Backplane Error Interrupt\n");
    if(tmg_clockoff() != SUCCESS)
      (void)lm_warning("Interrupt Test: cannot turn clock off.\n");
    if(tmg_clockon() != SUCCESS)
      (void)lm_warning("Interrupt Test: cannot turn clock on.\n");
    tmgptr->lane_intr_enable = 1;
    if(TMG_INT)
      (void)lm_warning("Interrupt Test: backplane is driving ERROR*.\n");
    else
      tmgptr->backplane_error = 1;
    start = lm_time();
    while(!TMG_INT)
      if((lm_time() - start) > 10)
      {
        (void)lm_error("Interrupt Test: Unable to cause BP Error Interrupt.\n");
        returncode = FAILURE;
        break;
      }
    if(TMG_INT)
      (void)
        lm_message("Interrupt Test: Backplane Error Interrupt received OK.\n");
    tmgptr->backplane_error = 0;
    tmgptr->lane_intr_enable = 0;
    if(TMG_INT)
    {
      (void)lm_error("Interrupt Test: Backplane interrupt did not clear.\n");
      returncode = FAILURE;
    }

    return(returncode);
}


/*      long tmg_loop(void)
 *
 *      This function is used for running continuous patterns.  Actual
 *      looping is handled by menu code.
 *
 *      Inputs: none
```

Copyright 1989 Logic Modeling Systems

SOURCE PROGRAM diags/tmg_diag.c | DATE 5/23/89 | TIME 4:41:33 pm | PAGE # 9/185

LINE # SOURCE TEXT

```
 *      Outputs: function returns SUCCESS or FAILURE
 */
tmg_loop()
{
  /* make sure clock is off        */
  if(tmg_clockoff() != SUCCESS)
    return(FAILURE);

  if(tmg_saffclear() != SUCCESS)
    (void)lm_warning("Loop: Cal flip flops did not clear.\n");

  /* then turn it on               */
  if(tmg_clockon() != SUCCESS)
    return(FAILURE);
  if(tmg_play(TIMEOUT) != SUCCESS)
    return(FAILURE);

  return(SUCCESS);
}

/*
 *      int tmg_select_mode(void)
 *
 *      This routine is a utility to allow setting of the desired
 *      test and sample modes from the diagnostic menus.
 *
 *      Input:  none
 *      Output: Always returns SUCCESS
 */
tmg_select_mode()
{
  u_long answer;
  (void)lm_message("Select test mode:\n");
  (void)lm_message("\t0)  Normal Mode\n");
  (void)lm_message("\t1)  Test Mode 1 (1 edge ramp, 1 sample ramp) (default)\n");
  (void)lm_message("\t2)  Test Mode 2 (2 edge ramps, 1 sample ramp)\n");
  (void)lm_message("\t3)  Test Mode 3 (Continuous edge ramps)\n");
  answer = 1;    /* test mode 1  */
  diag_get_ulong(&answer, "Choice", 0l, 3l);
  tmgptr->test_mode = answer;
  (void)lm_message("\nSelect sample mode:\n");
  (void)lm_message("\t0)  Early sample\n");
  (void)lm_message("\t1)  Edge7 triggered sample (default)\n");
  answer = 1;
  diag_get_ulong(&answer, "Choice", 0l, 1l);
  tmgptr->sample_mode = answer;
  return SUCCESS;
}

/*
 *      int tmg_select_ramps(void)
 *
 *      Choose ramps from diagnostic menus.
 *
 *      Input:  none
 *      Output: Always returns SUCCESS
 */
tmg_select_ramps()
{
  u_long answer;

  lm_message("Select ramps:\n");
  answer = 0;
  diag_get_ulong(&answer, "edge ramp", 0l, 3l);
  tmgptr->edge_delay_range = answer;
  answer = 0;
  diag_get_ulong(&answer, "sample ramp", 0l, 3l);
  tmgptr->sample_delay_range = answer;
  return SUCCESS;
}

/*
 *      int tmg_select_thresholds(void)
 *
 *      This routine allows setting edge/sample thresholds from
 *      the diagnostic menus.
 *
 *      Input:  none
 *      Output: always returns SUCCESS
 */
tmg_select_thresholds()
{
  u_long answer;
  char buffer[32];
  int i;

  (void)lm_message("Select thresholds:\n");
  for(i = 0; i < 6; i++)
  {
    answer = 10;
    sprintf(buffer, "edge[%d] threshold", i);
    diag_get_ulong(&answer, buffer, 0l, 255l);
    tmgptr->edge_delay[i].delay = answer;
  }
  answer = 10;
  diag_get_ulong(&answer, "sample trigger threshold", 0l, 255l);
  tmgptr->sample_trigger_threshold = answer;
  answer = 10;
  diag_get_ulong(&answer, "sample threshold", 0l, 25
  tmgptr->sample_delay = answer;

  return SUCCESS;
}


/*
 *      int tmg_select_slot_count(void)
 *
 *      This utility allows setting slot count from diagnostic menus.
 *
 *      Input: none
 *      Output: always returns SUCCESS
 */
tmg_select_slot_count()
{
  u_long answer;
  answer = 1;
  diag_get_ulong(&answer, "slot count", 1l, 8l);
  tmg_set_slot_count(answer);
  return SUCCESS;
```

Copyright 1989
Logic Modeling Systems

SOURCE PROGRAM diags/tmg_diag.c

DATE 5/23/89 TIME 4:41:33 pm PAGE # 10/186

LINE # SOURCE TEXT

```
}


/*
 *      int tmg_edge_jitter(void)
 *
 *      This utility sets up all edges at maximum threshold and allows the
 *      operator to step through the four ramps.  This makes taking an
 *      oscilloscope measurement of the jitter as painless as possible.
 *
 *      Inputs: none
 *      Outputs: always returns SUCCESS
 */
tmg_edge_jitter()
{
  int ramp, edge, period;
  static int jitter[] = {500, 2000, 10000, 50000};
  lm_message("Edge Jitter Measurement\n");
  lm_message("Trigger the oscilloscope on rising edge of U130-15, (CYCLE_CHARGE).\n");
  lm_message("Jitter is the maximum uncertainty in position of the edge rising edge.\n");
  tmg_set_slot_count(2);
  tmg_set_test_mode(1);
  for(edge = 0; edge < 6; edge++)
    tmgptr->edge_delay[edge].delay = 250;
  for(ramp = 0; ramp < 4; ramp++)
  {
    tmgptr->edge_delay_range = ramp;
    period = calib.EdgeMaxDelay[ramp] * 1.5;
    tmg_set_period(ramp, &period);
    lm_message("\nSelected edge ramp is %d\n", ramp);
    lm_message("Verify jitter to be less than %d ps for all 6 edges.\n",
        jitter[ramp]);
    tmg_play_til_key();
  }
  return SUCCESS;
}


/*
 *      int tmg_sample_jitter(void)
 *
 *      This utility sets up the sample at maximum threshold and allows the
 *      operator to step through the four ramps in both early and edge 7
 *      triggered modes.  This makes taking an
 *      oscilloscope measurement of the jitter as painless as possible.
 *
 *      Inputs: none
 *      Outputs: always returns SUCCESS
 */
tmg_sample_jitter()
{
  int ramp, edge, period;
  static int jitter[] = {500, 1000, 2000, 4000, 500, 2000, 10000, 50000};
  lm_message("Sample Jitter Measurement\n");
  lm_message("Trigger the oscilloscope on rising edge of U130-15, (CYCLE_CHARGE).\n");
  lm_message("Jitter is the maximum uncertainty in position of the sample rising edge.\n");
  lm_message("\nEarly trigger mode:\n");
  tmg_set_slot_count(2);
  tmg_set_test_mode(1);
  tmgptr->sample_delay = 250;
  tmgptr->sample_mode = 0;
  period = 150000;
  for(ramp = 0; ramp < 4; ramp++)
  {
    tmgptr->sample_delay_range = ramp;
    tmg_set_period(ramp, &period);
    lm_message("\nSelected sample ramp is %d\n", ramp);
    lm_message("Verify jitter to be less than %d ps.\n",
        jitter[ramp]);
    tmg_play_til_key();
  }
  lm_message("\nEdge 7 triggered mode:\n");
  tmg_set_slot_count(2);
  tmg_set_test_mode(1);
  tmgptr->sample_trigger_threshold = 250;
  tmgptr->sample_mode = 1;
  tmgptr->sample_delay_range = 0;
  tmgptr->sample_delay = 10;
  for(ramp = 0; ramp < 4; ramp++)
  {
    tmgptr->edge_delay_range = ramp;
    period = calib.EdgeMaxDelay[ramp] * 1.5;
    tmg_set_period(ramp, &period);
    lm_message("\nSelected edge ramp is %d\n", ramp);
    lm_message("Verify jitter to be less than %d ps.\n",
        jitter[ramp + 4]);
    tmg_play_til_key();
  }
  return SUCCESS;
}


/*
 *      int tmg_edge_alligmment(void)
 *
 *      This test sets up all edges to its best approximation of 50 ns
 *      delay.  The clock period is set to 100 ns.  This allows the operator
 *      to confirm edge alligmment with an oscilloscope.
 */
tmg_edge_alligmment()
{
  int edge;
  int period;
  period = 100000;      /* 100000 ps    */
  lm_message("Edge alligmment test:\n");
  if(!calib.CalCompleted)
  {
    lm_message("Please wait while calibration is performed...\n");
    tmg_calibrate();
    if(!calib.CalCompleted)
    {
      lm_message("This test requires that calibration be succussfully completed.\n");
      return SUCCESS;
    }
    else lm_message("\n\n");
  }
  lm_message("Target edge position is 50 ns with a clock period of 100 ns\n");
  lm_message("A convenient trigger is U130-15 (CYCLE_CHARGE).\n");
  tmg_set_slot_count(1);
  tmg_set_test_mode(1);
```

Copyright 1989 Logic Modeling Systems

| SOURCE PROGRAM | DATE | 5/23/89 | PAGE # |
|---|---|---|---|
| diags/tmg_diag.c | TIME | 4:41:33 pm | 11/187 |

LINE # SOURCE TEXT

```
    tmgptr->edge_delay_range = 0;
    tmgptr->sample_delay_range = 0;
    for(edge = 0; edge < 6; edge++)
      tmgptr->edge_delay[edge].delay = (50000l - (long)calib.EdgeOffset[0][edge])
                                     / (long)calib.EdgeSlope[0][edge];
    tmg_set_period(0, &period);   /* ramp 0, 100 ns          */
    lm_message("Verify maximum skew between edges is 1000 ps max.\n");
    lm_message("Check all edges of all lanes of slot 7\n");
    tmg_play_til_key();
}


/*      long tmg_continuouslocktest(void)
 *
 *      This routine is a utility to allow measuring the PLL lock
 *      time on an oscilloscope or to diagnose the PLL.  The PLL
 *      is continuously slewed from 30 to 60 MHz and back.
 *
 *      Inputs: none
 *      Outputs: after a key is pressed, always returns SUCCESS
 */
tmg_continuouslocktest()
{
  if(tmg_clockoff() != SUCCESS) /* make sure clock is off      */
  {
    (void)lm_error("tmg_continuouslocktest(): cannot turn clock off\n");
    return(FAILURE);
  }

  tmgptr->pll_rate = (256 - 128) + 1;   /* sets to 30 MHz          */
  tmgptr->pll_divisor = (256 - 15) + 1; /* choose div 2 * 15       */
  tmgptr->clock_select = 1;             /* sel div 2X              */

  lm_delay(2);                   /* wait lots of time for lock   */

  (void)lm_message("You may observe TTLSLOCK at U27-13 while triggering\n");
  (void)lm_message("the oscilloscope with TTLSRATE(7) at U160-10.\n");
  (void)lm_message("Press any key to abort...\n");
  while(!lm_check_key())
  {
    tmgptr->pll_rate = (256 - 256) + 1; /* set pll to 60 MHz     */
    lm_delay(2);                 /* wait for lock                */
    tmgptr->pll_rate = (256 - 128) + 1; /* set pll to 30 MHz     */
    lm_delay(2);
  }
  return SUCCESS;
}

/*  int tmg_clock_sync_test()
 *
 *  This test checks that the synchronizer really can turn the clock
 *  on and off.  It returns SUCCESS or FAILURE.
 */
int tmg_clock_sync_test()
{
  long start;
  static char me[] = "tmg_clock_sync_test";

  tmgptr->clock_enable = 0;               /* try to turn the clock off   */
  start = lm_time();
  while(tmgptr->clock_on)
    if((lm_time() - start) > 10)
    {
      if(tmgptr->clock_select > 2)        /* must be external clock      */
        tmgptr->clock_sync_clearL = 0;    /* ok to clear sync            */
      else
      {
        lm_error("%s: cannot clear synchronizer\n", me);
        return FAILURE;
      }
    }

  tmgptr->clock_sync_clearL = 0;          /* keep it cleared             */
  tmgptr->clock_select = 0;
  tmgptr->pll_rate = 0x2c;                /* set up for 25 MHz           */
  tmgptr->pll_divisor = 0xff;             /* divide by 2                 */

  tmgptr->clock_enable = 1;               /* hope it doesn't come on     */
  start = lm_time();
  while((lm_time() - start) > 10)
    ;
  if(tmgptr->clock_on)                    /* clock came on, bad clock    */
    return FAILURE;

  tmgptr->clock_enable = 0;
  tmgptr->clock_sync_clearL = 1;
  start = lm_time();
  while((lm_time() - start) > 10)
    ;
  if(tmgptr->clock_on)                    /* clock came on, bad clock    */
    return FAILURE;

  tmgptr->clock_enable = 1;               /* this time it should come on */
  start = lm_time();
  while(!tmgptr->clock_on)
    if((lm_time() - start) > 10)
    {
      lm_error("%s: timeout waiting for clock to turn on.\n", me);
      return FAILURE;
    }

  tmgptr->clock_enable = 0;               /* this time it should go off  */
  start = lm_time();
  while(tmgptr->clock_on)
    if((lm_time() - start) > 10)
    {
      lm_error("%s: timeout waiting for clock to turn on.\n", me);
      return FAILURE;
    }

  tmgptr->clock_sync_clearL = 0;          /* clear things and exit       */
  return SUCCESS;
}


/*
 *      int tmg_dac_settle(void)
 *
 *      This routine slews DAC 0 output back and forth from 0 to 255
 *      to allow measurement of slew rate and settling time on an
```

Copyright 1989 Logic Modeling Systems

LINE # SOURCE TEXT

```
 *      oscilloscope.
 *
 *      Input: none
 *      Output: always returns SUCCESS
 */
tmg_dac_settle()
{
#define DAC (char *)0x8e000043
  (void)lm_message("You may now observe ALOG$DA0 at U63-9.\n");
  (void)lm_message("Press any key to abort...\n");
  while(!lm_check_key())
  {
    *DAC = 0;
    lm_delay(2);
    *DAC = 255;
    lm_delay(2);
  }

  return SUCCESS;
}

#ifndef BIN_LIMIT
#define BIN_LIMIT 1000
#endif

tmg_edge_jitter_search(ramp,edge,thr,upper_bound,lower_bound,direction)
long ramp, edge, thr, upper_bound, lower_bound, direction;
{
        static char me[] = "tmg_edge_jitter_search";
        long period, found_high;
        long timeout = BIN_LIMIT;
        long chk_period, save_lower_bound, save_upper_bound;
        long jitterptr, aptr, kptr, selectptr;

        save_lower_bound = lower_bound;
        save_upper_bound = upper_bound;
        for (timeout = 0; timeout <= BIN_LIMIT; ++timeout) {
                period = (upper_bound + lower_bound)/2;
                if (tmg_detect_edge(ramp,edge,
                (direction ? DETECT_LOW : 0) | DETECT_BOOL,&period,
                    thr,100001, &found_high) != SUCCESS) {
                        tmg_report_failure(me, "tmg_detect_always_low(3)");
                }
#ifdef DIAGS
                if (tmg_cal_debug & 1)
                        tmg_play_til_key();
#endif DIAGS
                if ((period < save_lower_bound) || (period > save_upper_bound))
                {
                  lm_error("%s binary search failure(1)\n", me);
                  return period;
                }

                if ((period <= lower_bound) || (period >= upper_bound)) {

                        /* XXX */
                        while (1) {
                                tmg_get_next_lower_period(period, &chk_period,
                                        &jitterptr,&aptr,&kptr,&selectptr);
                                if (chk_period <= lower_bound) break;

                                if (tmg_detect_edge(ramp,edge,
                                    (direction ? DETECT_LOW : 0) |
                                    DETECT_BOOL, &chk_period,
                                    thr,100001, &found_high)
                                    != SUCCESS) {
                                        tmg_report_failure(me,
                                                "tmg_detect_edge_(4)");
                                }
                                if (direction ? !found_high : found_high) {
                                        /* too short - raise lower bound */
                                        lower_bound = chk_period;
                                        break;
                                } else {
                                        /* too long - lower upper bound */
                                        upper_bound = chk_period;
                                }
                                period = chk_period;
                        }
                        /* We can't get more exact than this */
#ifdef DIAGS
                        if (tmg_cal_debug & 4)
                                lm_message("(got it between %d and %d)\n",
                                    lower_bound, upper_bound);
#endif DIAGS
                        return (direction ? upper_bound : chk_period);
                }
                if (direction ? !found_high : found_high) {
                        /* too short - raise lower bound */
                        lower_bound = period;
                } else {
                        /* too long - lower upper bound */
                        upper_bound = period;
                }
        }
        lm_error("%s binary search failure(2)\n", me);
        return period;
}       /* tmg_edge_jitter_search       */

tmg_sample_jitter_search(eramp,sramp,thr7,thrs,upper_bound,lower_bound,direction)
long eramp,sramp,thr7,thrs,upper_bound,lower_bound,direction;
{
        static char me[] = "tmg_sample_jitter_search";
        long period, found_high;
        long timeout = BIN_LIMIT;
        long chk_period, save_lower_bound, save_upper_bound;
        long jitterptr, aptr, kptr, selectptr;

        save_lower_bound = lower_bound;
        save_upper_bound = upper_bound;

        for (timeout = 0; timeout <= BIN_LIMIT; ++timeout) {
                period = (upper_bound + lower_bound)/2;
                if (tmg_detect_sample(eramp,sramp,
                    (direction ? DETECT_LOW : 0) | DETECT_BOOL | DETECT_SAMPLE,
                    (long*)&period, thr7,thrs,100001, (long*)&found_high)
                    != SUCCESS)
                {
                        tmg_report_failure(me,
```

Copyright 1989 Logic Modeling Systems

LINE # SOURCE TEXT

```
                                        "tmg_detect_sample_(3)");
                        }
#ifdef DIAGS
                        if (tmg_cal_debug & 0x100)
                                tmg_play_til_key();
#endif DIAGS
                        if ((period < save_lower_bound) || (period > save_upper_bound))
                        {
                          lm_error("%s binary search failure(1)\n", me);
                          return period;
                        }

                        if ((period <= lower_bound) || (period >= upper_bound)) {
                                /* XXX */
                                while (1) {
                                        tmg_get_next_lower_period(period, &chk_period,
                                                &jitterptr,&nptr,&kptr,&selectptr);
                                        if (chk_period <= lower_bound) break;

                                        if (tmg_detect_sample(eramp,sramp,
                                        (direction ? DETECT_LOW : 0) |
                                            DETECT_BOOL | DETECT_SAMPLE,
                                            (long*)&chk_period,thr7,thrs,
                                            100001, (long*)&found_high)
                                            != SUCCESS)
                                        {
                                                tmg_report_failure(me,
                                                        "tmg_detect_sample_(4)");
                                        }
                                        if (direction ? !found_high : found_high) {
                                                /* too short - raise lower bound */
                                                lower_bound = chk_period;
                                                break;
                                        } else {
                                                /* too long - lower upper bound */
                                                upper_bound = chk_period;
                                        }
                                        period = chk_period;
                                }
                                /* We can't get more exact than this */
#ifdef DIAGS
                                if (tmg_cal_debug & 0x400)
                                        lm_message("(got it between %d and %d)\n",
                                            lower_bound, upper_bound);
#endif DIAGS
                                return (direction ? upper_bound : lower_bound);
                        }
                        if (direction ? !found_high : found_high) {
                                /* too short - raise lower bound */
                                lower_bound = period;
                        } else {
                                /* too long - lower upper bound */
                                upper_bound = period;
                        }
                }
                lm_error("%s binary search failure(2)\n", me);
                return period;

}               /* tmg_sample_jitter_search      */

tmg_jitter_test()
{
  int eramp, sramp, edge;
  long low_bound, high_bound, target, low_target, high_target;

  if(!calib.CalCompleted)
  {
    tmg_calibrate();
    if(!calib.CalCompleted)
    {
      lm_error("Cannot perform jitter test due to calibration failure\n");
      return FAILURE;
    }
  }
  tmg_set_test_mode(1);
  tmg_set_slot_count(2);
  tmgptr->sample_mode = EDGE7SAMPLETRIGGERMODE; /* select Edge7 trigger */

  for(eramp = 0; eramp < NUMBER_OF_ERAMPS; eramp++)
  {
    /* check jitter on all edges          */
    for(edge = 0; edge < NUMBER_OF_EDGES; edge++)
    {
      target = tmg_predict_period(250,calib.EdgeSlope[eramp][edge],
                      calib.EdgeOffset[eramp][edge]);
      low_target = 0.9 * target;
      high_target = 1.1 * target;
      low_bound = tmg_edge_jitter_search(eramp,edge,250,high_target,low_target,0);
      high_bound = tmg_edge_jitter_search(eramp,edge,250,high_target,low_target,1);
      lm_message("Ramp %d, edge %d, target %d, found %d-%d, jitter %d\n",
            eramp, edge, target, low_bound, high_bound, high_bound - low_bound);
    }
    /* do edge 7 */
    target = 250 * (long)calib.Edge7Slope[eramp]
            + 10 * (long)calib.SampleSlope[0]
            + (long)calib.SampleOffset[eramp][0];
    low_target = 0.9 * target;
    high_target = 1.1 * target;
    low_bound = tmg_sample_jitter_search(eramp,0,250,10,
                    high_target,low_target,0);
    high_bound = tmg_sample_jitter_search(eramp,0,250,10,
                    high_target,low_target,1);
    lm_message("Ramp %d, edge 7, target %d, found %d-%d, jitter %d\n", eramp,
        target, low_bound, high_bound, high_bound - low_bound);
  }
  /* now do sample      */
  tmgptr->sample_mode = EARLYSAMPLETRIGGERMODE; /* select early sample  */
  for(sramp = 0; sramp < NUMBER_OF_SRAMPS; sramp++)
  {
    target = 255 * (long)calib.SampleSlope[sramp]
            + (long)calib.EarlySampleOffset[sramp];
    low_target = 0.9 * target;
    high_target = 1.1 * target;
    low_bound = tmg_sample_jitter_search(3,sramp,255,255,
                    high_target,low_target,0);
    high_bound = tmg_sample_jitter_search(3,sramp,255,255,
                    high_target,low_target,1);
    lm_message("Ramp %d, sample, target %d, found %d-%d, jitter %d\n", sramp,
        target, low_bound, high_bound, high_bound - low_bound);
  }
```

Copyright 1989 Logic Modeling Systems

LINE # SOURCE TEXT

```
  return SUCCESS;
}


/*
 * This function sets the period to 128 ns.  It takes each edge in turn
 * and places it at 50 ns.  It then takes all other (2) edges that share
 * the same delay line module and sweeps them from 30 ns to 70 ns.  If
 * any coupling is detected, the function fails.
 */
tmg_delay_line_isolation()
{
  int target_edge, errors, count;
  long period;

  errors = 0;
  tmgptr->backplane_resetL = 0; /* assert backplane reset */
  tmg_set_slot_count(1);
  tmg_set_test_mode(1);
  tmg_set_eramp(0);
  period = 128000l;
  if(tmg_set_period(0, &period) != SUCCESS)
  {
    lm_error("tmg_delay_line_isolation: tmg_set_period()");
    return FAILURE;
  }

  for(target_edge = 0; target_edge < 6; target_edge++)
  {
    tmgptr->edge_delay[target_edge].delay = tmg_predict_threshold(50000l,
                                            calib.EdgeSlope[0][target_edge],
                                            calib.EdgeOffset[0][target_edge]);
    for(count = 1000; count > 0; count--)
      ;
    switch (target_edge)
    {
      case 0:
        tmg_sweep(target_edge, 1, &errors, &calib);
        tmg_sweep(target_edge, 2, &errors, &calib);
        break;
      case 1:
        tmg_sweep(target_edge, 0, &errors, &calib);
        tmg_sweep(target_edge, 2, &errors, &calib);
        break;
      case 2:
        tmg_sweep(target_edge, 0, &errors, &calib);
        tmg_sweep(target_edge, 1, &errors, &calib);
        break;
      case 3:
        tmg_sweep(target_edge, 4, &errors, &calib);
        tmg_sweep(target_edge, 5, &errors, &calib);
        break;
      case 4:
        tmg_sweep(target_edge, 3, &errors, &calib);
        tmg_sweep(target_edge, 5, &errors, &calib);
        break;
      case 5:
        tmg_sweep(target_edge, 3, &errors, &calib);
        tmg_sweep(target_edge, 4, &errors, &calib);
        break;
      default:
        break;
    }
  }
  (void)diag_tmg_reset(1); /* full reset */
  if(errors)
    return FAILURE;
  else
    return SUCCESS;
}

tmg_sweep(target_edge, other_edge, errorptr, calptr)
int target_edge, other_edge, *errorptr;
struct CALIB *calptr;
{
  int thresh, current_errors, actual, count, min, max;
  current_errors = 0;
  min = tmg_predict_threshold(30000l,
          calptr->EdgeSlope[0][other_edge],
          calptr->EdgeOffset[0][other_edge]);
  max = tmg_predict_threshold(70000l,
          calptr->EdgeSlope[0][other_edge],
          calptr->EdgeOffset[0][other_edge]);
  for(thresh = min; thresh < max; thresh++)
  {
    tmgptr->edge_delay[other_edge].delay = thresh;
    for(count = 1000; count > 0; count--)
      ;
    if (tmg_detect(target_edge, 100l, &actual, DETECT_BOOL) != SUCCESS)
    {
      current_errors++;
      break;
    }
    if(actual == 0)
    {
      current_errors++;
      break;
    }
  }
  if(current_errors)
  {
    *errorptr += current_errors;
    lm_message("delay line coupling detected between edges %d and %d\n",
               target_edge, other_edge);
  }
}
```

Copyright 1989 Logic Modeling Systems

| HEADER FILE | DATE | PAGE # |
|---|---|---|
| diags/tmg_extn.h | 5/23/89 | 1/191 |
| | TIME 4:41:35 pm | |

LINE # HEADER TEXT

```
/* SCCS_ID: tmg_extn.h rev 3.1, 4/24/89 at 07:50:48     */

/*********************************************************************
 *                                                                   *
 *      tmg_extn.h                                                   *
 *                                                                   *
 *      External declarations of global variables for the Timing     *
 *        Generator Diagnostics and Calibration                      *
 *      Last Modified 7/19/88 -- wfk                                 *
 *                                                                   *
 *********************************************************************/

extern TMG *tmgptr;
extern TMG_DIAG *tmgdiagptr;
extern char mbf[];
extern int intflag;
extern struct CALIB calib;
extern u_char *tmg_mptr;
extern u_char *tmg_kptr;
extern u_char *tmg_srcptr;
extern u_long *tmg_periodptr;
extern u_long tmg_max;
extern int tmg_freq_table_built;
extern u_long tmg_min_index1[];
extern u_long tmg_max_index1[];
extern u_long tmg_min_index2[];
extern u_long tmg_max_index2[];
extern u_long tmg_min_index3[];
extern u_long tmg_max_index3[];
```

Copyright 1989 Logic Modeling Systems

| SOURCE PROGRAM | DATE | TIME | PAGE # |
|---|---|---|---|
| diags/tmg_glbl.c | 5/23/89 | 4:41:35 pm | 1/192 |

LINE # SOURCE TEXT

```c
/* SCCS_ID: tmg_glbl.c rev 1.1, 4/24/89 at 07:50:50     */

/***********************************************************************
 *
 *      tmg_glbl.c
 *
 *      Global variables used in Timing Generator
 *      Diagnostics and Calibration.
 *
 ***********************************************************************/

#include "common.h"
#include "tmg.h"
#include "tmg_def.h"

TMG *tmgptr = (TMG *)CLOCK_BASE;          /* pointer to TMG            */
TMG_DIAG *tmgdiagptr = (TMG_DIAG *)CLOCK_BASE;  /* alternate pointer   */

/* global variables used for generating/maintaining frequency table     */
u_char *tmg_nptr;                 /* pointer to n register values       */
u_char *tmg_kptr;                 /* pointer to k register values       */
u_char *tmg_srcptr;               /* pointer to clock select values     */
u_long *tmg_periodptr;            /* pointer to clock period values     */
u_long tmg_max;                   /* pointer to maximum index for above */
int tmg_freq_table_built = FALSE;
u_long tmg_min_index1[4];         /* range limits for searching during  */
u_long tmg_max_index1[4];         /* calibration                        */
u_long tmg_min_index2[4];
u_long tmg_max_index2[4];
u_long tmg_min_index3[4];
u_long tmg_max_index3[4];

struct CALIB calib =
{
  {
    {8, 8, 8, 8, 8, 8},
    {8, 8, 8, 8, 8, 8},
    {8, 8, 8, 8, 8, 8},
    {8, 8, 8, 8, 8, 8}
  },                                        /* EdgeMinThresh         */
  {10000, 16000, 80000, 400000},            /* EdgeMinDelay          */
  {128000, 512000, 2560000, 12800000},      /* EdgeMaxDelay */
  {
    {0, 0, 0, 0, 0, 0},
    {0, 0, 0, 0, 0, 0},
    {0, 0, 0, 0, 0, 0},
    {0, 0, 0, 0, 0, 0}
  },                                        /* EdgeOffset            */
  {
    {575,575,575,575,575,575},
    {2300,2300,2300,2300,2300,2300},
    {11500,11500,11500,11500,11500,11500},
    {57500,57500,57500,57500,57500,57500}
  },                                        /* EdgeSlope             */
  {
    {0, 0, 0, 0, 0, 0},
    {0, 0, 0, 0, 0, 0},
    {0, 0, 0, 0, 0, 0},
    {0, 0, 0, 0, 0, 0},
  },                                        /* EdgeLinearity         */
  {8, 8, 8, 8},                             /* Edge7MinThresh        */
  {575, 2300, 11500, 57500},                /* Edge7Slope            */
  {0, 0, 0, 0},                             /* Edge7Linearity        */
  {8, 8, 8, 8},                             /* SampleMinThresh       */
  {50000, 62000, 126000, 446000},           /* SampleMinDelay        */
  {128000, 256000, 512000, 1024000},        /*SampleMaxDelay*/
  {500, 1000, 2000, 4000},                  /* SampleSlope           */
  {0, 0, 0, 0},                             /* SampleLinearity       */
  {
    {30000, 30000, 30000, 30000},
    {30000, 30000, 30000, 30000},
    {30000, 30000, 30000, 30000},
    {30000, 30000, 30000, 30000}
  },                                        /* SampleOffset          */
#ifdef EARLYSAMPLETRIGGER
  {9000, 13000, 21000, 37000},              /* EarlySampleMinDelay   */
  {110000, 220000, 440000, 880000},         /* EarlySampleMaxDelay   */
  {0, 0, 0, 0},                             /* EarlySampleOffset     */
#endif
  0x22,                                     /* DelayDelay            */
  7,                                        /* DumpDelay             */
  1                                         /* CalCompleted          */
};

struct CALIB default_calib =
{
  {
    {8, 8, 8, 8, 8, 8},
    {8, 8, 8, 8, 8, 8},
    {8, 8, 8, 8, 8, 8},
    {8, 8, 8, 8, 8, 8}
  },                                        /* EdgeMinThresh         */
  {10000, 16000, 80000, 400000},            /* EdgeMinDelay          */
  {128000, 512000, 2560000, 12800000},      /* EdgeMaxDelay */
  {
    {0, 0, 0, 0, 0, 0},
    {0, 0, 0, 0, 0, 0},
    {0, 0, 0, 0, 0, 0},
    {0, 0, 0, 0, 0, 0}
  },                                        /* EdgeOffset            */
  {
    {575,575,575,575,575,575},
    {2300,2300,2300,2300,2300,2300},
    {11500,11500,11500,11500,11500,11500},
    {57500,57500,57500,57500,57500,57500}
  },                                        /* EdgeSlope             */
  {
    {0, 0, 0, 0, 0, 0},
    {0, 0, 0, 0, 0, 0},
    {0, 0, 0, 0, 0, 0},
    {0, 0, 0, 0, 0, 0},
  },                                        /* EdgeLinearity         */
  {8, 8, 8, 8},                             /* Edge7MinThresh        */
  {575, 2300, 11500, 57500},                /* Edge7Slope            */
  {0, 0, 0, 0},                             /* Edge7Linearity        */
  {8, 8, 8, 8},                             /* SampleMinThresh       */
  {50000, 62000, 126000, 446000},           /* SampleMinDelay        */
  {128000, 256000, 512000, 1024000},        /*SampleMaxDelay*/
  {500, 1000, 2000, 4000},                  /* SampleSlope           */
  {0, 0, 0, 0},                             /* SampleLinearity       */
```

Copyright 1989
Logic Modeling Systems

SOURCE PROGRAM diags/tmg_glbl.c

DATE 5/23/89 TIME 4:41:35 pm

PAGE # 2/193

LINE # SOURCE TEXT

```
  {
    {30000, 30000, 30000, 30000},
    {30000, 30000, 30000, 30000},
    {30000, 30000, 30000, 30000},
    {30000, 30000, 30000, 30000}
  },                                           /* SampleOffset          */
#ifdef EARLYSAMPLETRIGGER
  {9000, 13000, 21000, 37000},                 /* EarlySampleMinDelay   */
  {110000, 220000, 440000, 880000},            /* EarlySampleMaxDelay   */
  {0, 0, 0, 0},                                /* EarlySampleOffset     */
#endif
  0x22,                                        /* DelayDelay            */
  7,                                           /* DumpDelay             */
  0                                            /* CalCompleted          */
};
```

Copyright 1989
Logic Modeling Systems

SOURCE PROGRAM diags/tmg_menu.c

DATE 5/23/89 TIME 4:41:35 pm PAGE # 1/194

LINE # SOURCE TEXT

```
/* SCCS_ID: tmg_menu.c rev 3.2, 5/9/89 at 15:55:01      */

/************************************************************************
 *                                                                      *
 *      tmg_menu.c                                                      *
 *                                                                      *
 *      Menu routines for Timing Generator Diagnostics                  *
 *                                                                      *
 ************************************************************************/

#include <math.h>
#include "common.h"
#include "tmg.h"
#include "tmg_def.h"
#include "vrtx.h"
#include "lm_diags.h"
#include "tmg_exts.h"

tmg_diag_disp(parent_menu)
LM_DIAG_MENU *parent_menu;
{
  extern int tmg_register_test(),
             tmg_idprom_test(),
             tmg_clock_sync_test(),
             tmg_ctc_test(),
             tmg_pll_rate(),
             tmg_pll_div(),
             tmg_pll_lock(),
             tmg_slow_detect(),
             tmg_interrupts(),
             tmg_calibrate(),
             tmg_diag_disp2(),
             tmg_delay_line_isolation();

  static LM_DIAG_MENU_ITEM menu_list[] =
  {
    {
      "1",
      "Register Test",
      tmg_register_test,
      LM_DIAG_diag_routine,
      LM_DIAG_null
    },
    {
      "2",
      "ID Prom Test",
      tmg_idprom_test,
      LM_DIAG_diag_routine,
      LM_DIAG_null
    },
    {
      "3",
      "Clock Synchronizer Test",
      tmg_clock_sync_test,
      LM_DIAG_diag_routine,
      LM_DIAG_null
    },
    {
      "4",
      "Counter Timer Test",
      tmg_ctc_test,
      LM_DIAG_diag_routine,
      LM_DIAG_null
    },
    {
      "5",
      "Phase Locked Loop Rate",
      tmg_pll_rate,
      LM_DIAG_diag_routine,
      LM_DIAG_null
    },
    {
      "6",
      "Phase Locked Loop Division",
      tmg_pll_div,
      LM_DIAG_diag_routine,
      LM_DIAG_null
    },
    {
      "7",
      "Phase Locked Loop Lock Time",
      tmg_pll_lock,
      LM_DIAG_diag_routine,
      LM_DIAG_null
    },
    {
      "8",
      "Slow Clock Detector Test",
      tmg_slow_detect,
      LM_DIAG_diag_routine,
      LM_DIAG_null
    },
    {
      "9",
      "Check Interrupt Sources",
      tmg_interrupts,
      LM_DIAG_diag_routine,
      LM_DIAG_null
    },
    {
      "10",
      "Check Calibration",
      tmg_calibrate,
      LM_DIAG_diag_routine,
      LM_DIAG_null
    },
    {
      "11",
      "Check Edge Isolation",
      tmg_delay_line_isolation,
      LM_DIAG_diag_routine,
      LM_DIAG_null
    },
    {
      "12",
      "Utilities",
      tmg_diag_disp2,
      LM_DIAG_utility_menu,
      LM_DIAG_null
    }
```

Copyright 1989
Logic Modeling Systems

| SOURCE PROGRAM | DATE | PAGE # |
|---|---|---|
| diags/tmg_menu.c | 5/23/89, TIME 4:41:35 pm | 2/195 |

LINE # SOURCE TEXT

```
  };

  static LM_DIAG_MENU menu =
  {
    "TIMING GENERATOR DIAGNOSTICS",
    sizeof(menu_list) / sizeof(LM_DIAG_MENU_ITEM),
    0,
    menu_list
  };
  menu.title = parent_menu->
    menu_items[parent_menu->current_selection].menu_text;

  return lm_display_menu(&menu);
}

tmg_diag_disp2(parent_menu)
LM_DIAG_MENU *parent_menu;
{
  int tmg_freq_ext0();
  int tmg_freq_ext1();
  int pac_sel_pat_clk();
  int tmg_select_mode();
  int tmg_select_ramps();
  int tmg_select_thresholds();
  int tmg_select_slot_count();
  int tmg_loop();
  int print_calib_structure();
  int tmg_plot_delays();
  int tmg_modify_debug_flag();
  int tmg_jitter_test();
  int tmg_scope_measurements();

  static LM_DIAG_MENU_ITEM menu_list[] =
  {
    {
      "1",
      "Measure Ext0 Frequency",
      tmg_freq_ext0,
      LM_DIAG_utility,
      LM_DIAG_null
    },
    {
      "2",
      "Measure Ext1 Frequency",
      tmg_freq_ext1,
      LM_DIAG_utility,
      LM_DIAG_null
    },
    {
      "3",
      "Select Pattern Clock Period",
      pac_sel_pat_clk,
      LM_DIAG_utility,
      LM_DIAG_null
    },
    {
      "4",
      "Select Test/Sample Modes",
      tmg_select_mode,
      LM_DIAG_utility,
      LM_DIAG_null
    },
    {
      "5",
      "Select Edge/Sample Ramps",
      tmg_select_ramps,
      LM_DIAG_utility,
      LM_DIAG_null
    },
    {
      "6",
      "Select Edge/Sample Thresholds",
      tmg_select_thresholds,
      LM_DIAG_utility,
      LM_DIAG_null
    },
    {
      "7",
      "Select Slot Count",
      tmg_select_slot_count,
      LM_DIAG_utility,
      LM_DIAG_null
    },
    {
      "8",
      "PLAY",
      tmg_loop,
      LM_DIAG_utility & ~LM_DIAG_no_repeat,
      LM_DIAG_null
    },
    {
      "9",
      "Print Current Calibration Structure",
      print_calib_structure,
      LM_DIAG_utility,
      LM_DIAG_null
    },
    {
      "10",
      "Plot Delay Line Delay vs Clock Frequency",
      tmg_plot_delays,
      LM_DIAG_utility,
      LM_DIAG_null
    },
    {
      "11",
      "Enable/Disable Optional Debugging Messages Menu",
      tmg_modify_debug_flag,
      LM_DIAG_utility_menu,
      LM_DIAG_null
    },
    {
      "12",
      "Jitter Measurement",
      tmg_jitter_test,
      LM_DIAG_utility,
      LM_DIAG_null
    },
    {
      "13",
```

Copyright 1989 Logic Modeling Systems

SOURCE PROGRAM diags/tmg_menu.c | DATE 5/23/89 | TIME 4:41:35 pm | PAGE # 3/196

LINE # SOURCE TEXT

```
        "Oscilloscope Measurements Menu",
        tmg_scope_measurements,
        LM_DIAG_utility_menu,
        LM_DIAG_null
      }
    };

    static LM_DIAG_MENU menu =
    {
      "TIMING GENERATOR UTILITIES",
      sizeof(menu_list) / sizeof(LM_DIAG_MENU_ITEM),
      0,
      menu_list
    };
    menu.title = parent_menu->
      menu_items[parent_menu->current_selection].menu_text;

    return lm_display_menu(&menu);
}

tmg_modify_debug_flag(parent_menu)
LM_DIAG_MENU *parent_menu;
{
    extern int tmg_modify_edge_related_debug_flag(),
               tmg_modify_sample_related_debug_flag(),
               tmg_modify_delayline_related_debug_flag(),
               tmg_modify_misc_related_debug_flag(),
               tmg_modify_all_debug_flag();
    static LM_DIAG_MENU_ITEM menu_list[] =
    {
      {
        "1",
        "Edge Calibration Related Debug Flags",
        tmg_modify_edge_related_debug_flag,
        LM_DIAG_utility | LM_DIAG_automatic_quit,
        LM_DIAG_null
      },
      {
        "2",
        "Sample Calibration Related Debug Flags",
        tmg_modify_sample_related_debug_flag,
        LM_DIAG_utility | LM_DIAG_automatic_quit,
        LM_DIAG_null
      },
      {
        "3",
        "Delay Line Calibration Related Debug Flags",
        tmg_modify_delayline_related_debug_flag,
        LM_DIAG_utility | LM_DIAG_automatic_quit,
        LM_DIAG_null
      },
      {
        "4",
        "Miscellaneous Calibration Related Debug Flags",
        tmg_modify_misc_related_debug_flag,
        LM_DIAG_utility | LM_DIAG_automatic_quit,
        LM_DIAG_null
      },
      {
        "5",
        "Set/Reset All Debug Flags",
        tmg_modify_all_debug_flag,
        LM_DIAG_utility | LM_DIAG_automatic_quit,
        LM_DIAG_null
      }
    };

    static LM_DIAG_MENU menu =
    {
      "TIMING GENERATOR DEBUG FLAGS",
      sizeof(menu_list) / sizeof(LM_DIAG_MENU_ITEM),
      0,
      menu_list
    };

    menu.title = parent_menu->
      menu_items[parent_menu->current_selection].menu_text;

    return(lm_display_menu(&menu));
}

tmg_scope_measurements(parent_menu)
LM_DIAG_MENU *parent_menu;
{
    int tmg_continuouslocktest();
    int tmg_dac_settle();
    int tmg_edge_jitter();
    int tmg_sample_jitter();
    int tmg_edge_allignment();

    static LM_DIAG_MENU_ITEM menu_list[] =
    {
      {
        "1",
        "Continuous Phase Lock Loop Lock/Unlock",
        tmg_continuouslocktest,
        LM_DIAG_utility,
        LM_DIAG_null
      },
      {
        "2",
        "D/A Converter Settling Time",
        tmg_dac_settle,
        LM_DIAG_utility,
        LM_DIAG_null
      },
      {
        "3",
        "Edge Jitter Measurement",
        tmg_edge_jitter,
        LM_DIAG_utility,
        LM_DIAG_null
      },
      {
        "4",
        "Sample Jitter Measurement",
        tmg_sample_jitter,
        LM_DIAG_utility,
        LM_DIAG_null
      },
```

Copyright 1989 Logic Modeling Systems

| SOURCE PROGRAM | DATE | TIME | PAGE # |
|---|---|---|---|
| diags/tmg_menu.c | 5/23/89 | 4:41:35 pm | 4/197 |

SOURCE TEXT

```
      {
        "5",
        "Edge Time Alligmment",
        tmg_edge_alligmment,
        LM_DIAG_utility,
        LM_DIAG_null
      }
    };

    static LM_DIAG_MENU menu =
    {
      "TIMING GENERATOR OSCILLOSCOPE MEASUREMENTS",
      sizeof(menu_list) / sizeof(LM_DIAG_MENU_ITEM),
      0,
      menu_list
    };
    menu.title = parent_menu->
      menu_items[parent_menu->current_selection].menu_text;

    return lm_display_menu(&menu);
}
```

Copyright 1989
Logic Modeling Systems

| SOURCE PROGRAM | DATE | PAGE # |
|---|---|---|
| diags/tmg_run.c | 5/23/89 TIME 4:41:35 pm | 1/198 |

LINE # SOURCE TEXT

```
/* SCCS_ID: tmg_run.c rev 1.1, 4/24/89 at 07:50:56      */

/*********************************************************************\
 *                                                                   *
 *      tmg_run.c                                                    *
 *                                                                   *
 *      Timing Generator Run-time support routines                   *
 *                                                                   *
\*********************************************************************/
#include "common.h"
#include "tmg.h"
#include "message.h"
#include "tmg_def.h"
#include "tmg_run.h"
#include "tmg_extn.h"
#include "vrtx.h"
#include <math.h>

extern u_char play_completed_flag;
u_char post_end_of_play;
extern int play_semaphore;
static int zero = 0;

#define DEBUG

#ifdef DEBUG
#define DPRINTF(x) printf x
#else
#define DPRINTF(x) /* do nothing */
#endif


/*
 *      lm_tmg_get_frequency_setting()
 *
 *      This routine computes the values for n, k, and clock
 *      select register setting to give the best approximation
 *      of the desired clock period.  The clock period provided
 *      is always equal to or greater than that requested.
 *      The actual clock period is related to n, k as follows:
 *              period = (k / n) * T_REF, where
 *      k = 1, 2, ..., 256 or k = 2, 4, ..., 512,
 *      n = 128, 129, ..., 256, and
 *      T_REF = 256 / 30 MHz = PLL reference period.
 *
 *      Returns: FAILURE if period out of range, else SUCCESS
 */

lm_tmg_get_frequency_setting(period,actualptr,jitterptr,nptr,kptr,selectptr)
u_long period;          /* physical clock period in ps  */
u_long *actualptr;      /* actual clock period in ps    */
u_long *jitterptr;      /* jitter per period in ps      */
u_long *nptr;
u_long *kptr;
u_long *selectptr;
{
  double error, besterror, kprime;
  int tmpk, n, save_k, save_n;

  if((period > MAX_PERIOD) || (period < MIN_PERIOD)) {
    lm_queue_message(ERROR_MSG, "period out of range; period = %d",
                     period);
    return(FAILURE);
  }

  for(besterror = 1.0, n = N_MIN; n <= N_MAX; n++)
  {
    kprime = n * period / T_REF;
    if((tmpk = (int)ceil(kprime)) > 512)/* see if out of range  */
      continue;                         /* if so, ignore it     */
    if(tmpk > 256)                      /* see if above 256     */
      if(tmpk & 1)                      /* see if odd           */
        tmpk++;                         /* make even            */
    if((error = (((double)tmpk - kprime) / kprime)) < besterror)
    {
      save_n = n;
      save_k = tmpk;
      besterror = error;
    }
  }
  *nptr = 256 - save_n + 1;             /* value to put in reg  */
  if(save_k == 1)
  {
    *kptr = 255;                        /* special case         */
    *selectptr = 0;                     /* select div by 2      */
  }
  else
    if(save_k > 256)
    {
      *kptr = 256 - (save_k >> 1) + 1;  /* divide k by 2        */
      *selectptr = 2;                   /* select div by 4k     */
    }
    else
    {
      *kptr = 256 - save_k + 1;         /* normal case          */
      *selectptr = 1;                   /* select div by 2k     */
    }
  *actualptr = T_REF * save_k / save_n;
  *jitterptr = 20 * 2 * save_k;         /* 20 ps per PLL clock  */
  return(SUCCESS);
}


/*      lm_tmg_get_sample_ramp_delay()
 *
 *      This function returns delay of SAMPLE with the given threshold.
 *      This contains an offset error and should not be used to compute
 *      absolute delays.  Using this function to compute a difference
 *      in time is OK since the offset errors cancel.  Delays are in ps.
 *
 *      Inputs: range (1 of 4 ramp rates), threshold value, pointer to
 *              delay variable, pointer to error
 *      Outputs: delay and error are assigned, function returns
 *              SUCCESS or FAILURE
 */
lm_tmg_get_sample_ramp_delay(rate, threshold, delayptr, errorptr)
u_char rate;
u_char threshold;
long *delayptr, *errorptr;
{
```

Copyright 1989 Logic Modeling Systems

SOURCE PROGRAM diags/tmg_run.c | DATE 5/23/89 | TIME 4:41:35 pm | PAGE # 2/199

LINE # SOURCE TEXT

```
    if((rate > 3) || (threshold < calib.SampleMinThresh[rate])) {
      lm_queue_message(ERROR_MSG, "rate too large OR threshold too small");
      return(FAILURE);
    }
    *errorptr = 0;                    /* tentatively not used */
    if(tmgptr->sample_mode)
    {
      *delayptr = threshold * calib.SampleSlope[rate];
     /* *errorptr = calib.SampleSlope[rate]; */
    }
    else
    {
      *delayptr = threshold * calib.SampleSlope[rate]
              + calib.EarlySampleOffset[rate];
     /* *errorptr = calib.EarlySampleSlope[rate] + 750; */
    }
    return(SUCCESS);
  }

/*      lm_tmg_get_early_sample_thres()
 *
 *      This function returns threshold of early SAMPLE given the delay.
 *      Inputs: range (1 of 4 ramp rates), delay value, pointer to
 *              threshold variable
 *      Outputs: threshold is assigned, function returns
 *              SUCCESS or FAILURE
 */
lm_tmg_get_early_sample_thres(rate, delay, thresholdptr)
u_char rate;
u_long delay;
u_char *thresholdptr;
{
  u_long max_delay;

  max_delay = 255 * calib.SampleSlope[rate] +
              calib.EarlySampleOffset[rate];

  if((rate > 3) || (delay > max_delay)) {
    lm_queue_message(ERROR_MSG, "rate too large OR delay too large");
    return(FAILURE);
  }

  *thresholdptr = (delay - calib.EarlySampleOffset[rate]) /
                     calib.SampleSlope[rate];

  return(SUCCESS);
}

/*      lm_tmg_get_dead_time()
 *
 *      This function returns dead time in ps for specified clock period
 *      in ps.  Currently, this function returns dead time that depends
 *      only upon the EDGE 0 slope of ramp needed to span the clock period.
 *      Start dead time is due to non-zero minimum thresholds for the
 *      longer ramp settings.  Ending dead time is due to finite dump time
 *      of the ramp.
 *
 *      Inputs: period in ps, pointers to start and ending dead times
 *      Outputs: dead times are assigned, function returns SUCCESS or FAILURE
 */
lm_tmg_get_dead_time(period, startdeadptr, enddeadptr)
u_long period;
u_long *startdeadptr;
u_long *enddeadptr;
{
  register u_long ramp;

  if((period < (u_long)MIN_PERIOD) || (period > (u_long)MAX_PERIOD)) {
    lm_queue_message(ERROR_MSG, "period out of range; period = %d",
                  period);
    return(FAILURE);
  }

  for(ramp = 0; ramp < 4; ramp++)
  {
    if(calib.EdgeMaxDelay[ramp] > period)
    {
      lm_tmg_get_ramp_dead_time(period, ramp, startdeadptr, enddeadptr);
      return(SUCCESS);
    }
  }
  lm_queue_message(ERROR_MSG, "period not reached; period = %d, EdgeMaxDelay[3] = %d\n",
          period, calib.EdgeMaxDelay[3]);
  return(FAILURE);
}

lm_tmg_get_ramp_dead_time(period, ramp, startdeadptr, enddeadptr)
register u_long period, ramp;
u_long *startdeadptr;
u_long *enddeadptr;
{
  int i;
  long min_offset;

  /* start dead time = edge minimum delay                  */
  *startdeadptr = calib.EdgeMinDelay[ramp];

  /* end dead time = ramp dump time                        */
  /*                + ramp uncertainty                     */
  /*                + 2 * edge jitter                      */
  /*                - min of all offsets of ramp 0         */
  /* Note: this should also include clock jitter, but      */
  /* this routine is unaware of clock frequency.           */
  /* This is accounted for elsewhere in runtime code       */
  min_offset = calib.EdgeOffset[0][0];
  for(i = 1; i < NUMBER_OF_EDGES; i++)
  {
    if(min_offset > calib.EdgeOffset[0][i])
      min_offset = calib.EdgeOffset[0][i];
  }
  *enddeadptr = (long)RAMP_DUMP_TIME
             + ((long)period / 501)          /* uncertainty = 2%      *
             + 2 * calib.EdgeSlope[ramp][0]  /* + 2 thresholds        */
             + 2 * calib.EdgeSlope[ramp][0]  /* 2 * edge jitter       */
             - min_offset;

  return(SUCCESS);
}

/*      lm_tmg_get_falling_sample_setting()
```

Copyright 1989
Logic Modeling Systems

| SOURCE PROGRAM | DATE | PAGE # |
|---|---|---|
| diags/tmg_run.c | 5/23/89 | 3/200 |
| | TIME 4:41:35 pm | |

LINE # SOURCE TEXT

```
 *
 *      This function returns the value to load into Timing Generator
 *      register 7.  The delay amount is equal to or greater than that
 *      requested.  Software must guarantee that this delay is greater
 *      than the delay for the leading edge of SAMPLE.
 *
 *      Inputs: period of clock in ps, delay requested in ps (referenced
 *              from last pattern), pointer to width setting
 *      Ouputs: width is assigned, if delay is possible, function returns
 *              SUCCESS, else FAILURE
 */
lm_tmg_get_falling_sample_setting(period, delay, widthptr)
u_long period;
u_long delay;
u_long *widthptr;
{
  unsigned int tmp;

  if((tmp = (unsigned int)ceil((double)delay / (double)period)) > 255) {
    lm_queue_message(ERROR_MSG,
        "requested delay of %d ps requires %d (>255) clocks",
         delay, tmp);
    return(FAILURE);
  }
  else
  {
    *widthptr = tmp;
    return(SUCCESS);
  }
}

/*      lm_tmg_get_edge_setting()
 *
 *      This function computes edge settings and selects appropriate
 *      ramp (edge 0) slope.  All delays are less than or equal to
 *      what is requested.
 *
 *      Inputs: logical clock period in ps, array of desired edge
 *              delay times in ps, pointer to array of threshold
 *              settings to generate desired delays
 *
 *      Outputs: threshold array is assigned along with quantization
 *               and extra delay, function returns SUCCESS or FAILURE
 */
lm_tmg_get_edge_setting(period, delay, threshold)
u_long period;
u_long delay[]; /* better be size 6 */
u_long threshold[];
{
  int i, j;
  u_long start, end, thresh;

  if(lm_tmg_get_dead_time(period, &start, &end) != SUCCESS) {
    return(FAILURE);
  }

  for(i = 0; i < 4; i++)
  {
    if(calib.EdgeMaxDelay[i] > period)
      break;
  }
  if(i == 4) {
    lm_queue_message(ERROR_MSG, "period too large; period = %d, EdgeMaxDelay[3] = %d",
             period, calib.EdgeMaxDelay[3]);
    return(FAILURE);
  }

  for(j = 0; j < 6; j++)
  {
    if((delay[j] < calib.EdgeMinDelay[i]) || (delay[j] > (period - end))) {
      lm_queue_message(ERROR_MSG, "delay out of range; delay[%d] = %d, EdgeMinDelay = %d, max = %d\n",
              j, delay[j], calib.EdgeMinDelay[i], (period - end));
      return(FAILURE);
    }
    threshold[j] = (delay[j] - calib.EdgeOffset[i][j]) / calib.EdgeSlope[i][0];
  }

  return(SUCCESS);
}


/*      lm_tmg_get_sample_setting()
 *
 *      This function computes edge 7 settings.
 *
 *      Inputs: logical clock period in ps, desired sample delay
 *              time in ps, pointer to threshold setting to generate
 *              desired delay.
 *
 *      Outputs: threshold is assigned, function returns SUCCESS or FAILURE
 */
lm_tmg_get_sample_setting(period, delay, thresholdptr)
u_long period;
u_long delay;
u_long *thresholdptr;
{
  int eramp, edge, sramp;
  u_long start, end;
  long thresh;
  long max_thresh, tmp;

    if(lm_tmg_get_dead_time(period, &start, &end) != SUCCESS)
      return(FAILURE);

  for(eramp = 0; eramp < 4; eramp++)
  {
    if(calib.EdgeMaxDelay[eramp] > period)
      break;
  }
  if(eramp == 4) {
    lm_queue_message(ERROR_MSG, "period too large; period = %d, EdgeMaxDelay[3] = %d",
             period, calib.EdgeMaxDelay[3]);
    return(FAILURE);
  }

  /* find maximum of all edge thresholds                        */
  /* use this to bound allowable values for Edge7 threshold     */
  for(max_thresh = 0, edge = 0; edge < NUMBER_OF_EDGES; edge++)
  {
    tmp = ((long)period - (long)end - calib.EdgeOffset[eramp][edge])
```

Copyright 1989
Logic Modeling Systems

| SOURCE PROGRAM | DATE 5/23/89 | PAGE # |
|---|---|---|
| diags/tmg_run.c | TIME 4:41:35 pm | 4/201 |

LINE # SOURCE TEXT

```
          / calib.EdgeSlope[eramp][edge];
      if(max_thresh < tmp)
        max_thresh = tmp;
    }

    if(delay < calib.SampleMinDel.._ ' .ramp])
    {
        lm_queue_message(ERROR_MSG, "delay out of range; delay[6] = %d, SampleMinDelay = %d, max = %d\n",
                delay, calib.SampleMinDelay[eramp], (period - end));
      return(FAILURE);
    }
    else
    {
      *thresholdptr = 255;
      for(aramp = 0; aramp < 4; aramp++)
      {
        thresh = ((long)delay - calib.SampleOffset[eramp][aramp]
                       - calib.SampleSlope[aramp]*calib.SampleMinThresh[aramp])
                       / calib.Edge7Slope[eramp];
        if((thresh < *thresholdptr) && (thresh > 0))
          *thresholdptr = thresh;
      }
      if(*thresholdptr < calib.Edge7MinThresh[0])
      {
        lm_queue_message(ERROR_MSG, "requested Edge 7 threshold below minimum");
        return FAILURE;
      }
      if(*thresholdptr > max_thresh)
      {
        lm_queue_message(ERROR_MSG, "requested Edge 7 threshold %d is above \
                              maximum for period %d", *thresholdptr,period);
        return FAILURE;
      }
    }

    return SUCCESS;
}


/*      lm_tmg_get_quantization_and_jitter_error(period, quantptr, jitterptr)
 *
 *      This function returns the quantization step size of delay
 *      with respect to threshold setting, everything in ps.
 *
 *      Inputs: logical clock period, pointer to error
 *      Outputs: quantization and jitter are assigned based on the edge 0
 *      slope of some ramp, returns SUCCESS or FAILURE
 */
lm_tmg_get_quantization_and_jitter_error(period, quantptr, jitterptr)
u_long period;
u_long *quantptr;
u_long *jitterptr;
{
  int i;

  for(i = 0; i < 4; i++)
    if(calib.EdgeMaxDelay[i] > period)
      break;

  if(i == 4) {
    lm_queue_message(ERROR_MSG, "period too large; period = %d, EdgeMaxDelay[3] = %d",
              period, calib.EdgeMaxDelay[3]);
    return(FAILURE);
  }
  *quantptr = calib.EdgeSlope[i][0];    /* always 1 threshold worth     */
  *jitterptr = calib.EdgeSlope[i][0];   /* 1 threshold for now          */

  return(SUCCESS);
}


/*      lm_tmg_get_minimum_sample_ramp_setting()
 *
 *      This function returns minimum threshold settings for the
 *      four sample ramps.
 *
 *      Inputs: pointers to minimum threshold variables
 *      Outputs: threshold variables are assigned, returns SUCCESS
 *               or FAILURE
 */
lm_tmg_get_minimum_sample_ramp_setting(r0ptr, r1ptr, r2ptr, r3ptr)
u_char *r0ptr;
u_char *r1ptr;
u_char *r2ptr;
u_char *r3ptr;
{
  if(!calib.CalCompleted) {
    lm_queue_message(ERROR_MSG, "problem was encountered during calibration");
    return(FAILURE);
  }
  *r0ptr = calib.SampleMinThresh[0];
  *r1ptr = calib.SampleMinThresh[1];
  *r2ptr = calib.SampleMinThresh[2];
  *r3ptr = calib.SampleMinThresh[3];
  return(SUCCESS);
}

/*      lm_tmg_get_sample_ramp_dead_time()
 *
 *      This function returns the maximum dead time in ps for the SAMPLE
 *      ramps.
 *
 *      Inputs: logical clock period, mode, pointer to dead time variable
 *      Outputs: dead time assigned, function returns SUCCESS or FAILURE
 */
lm_tmg_get_sample_ramp_dead_time(period, mode, deadptr, jitterptr)
u_long period;
u_long mode;
u_long *deadptr;
u_long *jitterptr;
{
  int eramp;

  for(eramp = 0; eramp < 4; eramp++)
    if(calib.EdgeMaxDelay[eramp] > period)
      break;
  if(eramp == 4) {
    lm_queue_message(ERROR_MSG, "period too large; period = %d, EdgeMaxDelay[3] = %d",
              period, calib.EdgeMaxDelay[3]);
    return(FAILURE);
```

Copyright 1989 Logic Modeling Systems

| SOURCE PROGRAM | DATE | PAGE # |
|---|---|---|
| diags/tmg_run.c | 5/23/89 TIME 4:41:35 pm | 5/202 |

LINE # SOURCE TEXT

```
  }

  if(!calib.CalCompleted) {
    lm_queue_message(ERROR_MSG, "problem was encountered during calibration");
    return(FAILURE);
  }
  if(mode == EDGE7SAMPLETRIGGERMODE)
  {
    if(eramp == 0)       /* don't need to include delay line effects   */
      *deadptr = calib.SampleMinDelay[eramp];
    else
      *deadptr = calib.SampleMinDelay[eramp] + 15001;   /* add 2 + 3/4 ns */
  }
  else
  {
    if(eramp == 0)
      *deadptr = 0;      /* ok to place edges at magic chip dead time    */
    else
      *deadptr = 2 * (calib.SampleMinDelay[eramp] + 15001);
     /* make sure this is greater than EDGE7 mode dead time              */
  }

  *jitterptr = calib.SampleSlope[3];    /* worst case sample jitter     */

  return(SUCCESS);
}

/*      lm_tmg_set_frequency()
 *
 *      This function sets the clock and starts timer using
 *      Counter 1.  This timer is used along with lock detect
 *      to decide if clock frequency has stabilized.  Counter 1
 *      is loaded with 3750 - 1 and counts at 3.75 MHz, resulting
 *      in a time delay of 1 ms.
 *
 *      Inputs: none
 *      Outputs: returns SUCCESS or FAILURE
 */
static int tmg_n_was_changed;
lm_tmg_set_frequency(n, k, source)
u_char n;
u_char k;
u_char source;
{
  static u_char tmg_last_n = 0;
  int realn, realk;
  int maxtries;

  if((source == EXT0) || (source == EXT1))
  {
    /* can't set frequency with clock on        */
    if(lm_tmg_clockoff() != SUCCESS)
      return(FAILURE);
    tmgptr->clock_select = source;
    tmg_n_was_changed = FALSE;
    if(isslow())
    {
      lm_queue_message(ERROR_MSG, "External clock is slow");
      return FAILURE;
    }
    else
      return SUCCESS;
  }

  realn = 257 - n;
  realk = 257 - k;


  if((realn < 128) || (realk == 0) || (source > 2)) {
    lm_queue_message(ERROR_MSG, "illegal value for n,k,source; n = %d, k = %d, source = %d",
                    n, k, source);
    return(FAILURE);
  }

  /* can't set frequency with clock on */
  if(lm_tmg_clockoff() != SUCCESS)
    return(FAILURE);

  if(n == tmg_last_n)    /* pll does not need any lock time      */
  {
    tmg_n_was_changed = FALSE;
    tmgptr->pll_divisor = k;
    tmgptr->clock_select = source;
    return(SUCCESS);
  }

  tmgptr->clock_select = 1;      /* don't know what freq, but its square */
  if(lm_tmg_clockon() != SUCCESS)
    return(FAILURE);

  tmgptr->ctc_intr_clearL = 0;
  tmgptr->ctc_register[3].value = 0x30;          /* setup mode 0          */
  tmgptr->ctc_register[0].value = zero;          /* lsb for max count     */
  tmgptr->ctc_register[0].value = zero;          /* msb for max count     */

  /* since GATE0 has no effect on OUT0, OUT0 should be low       */
  /* and furthermore, Counter0 should not be counting            */

  /* at this point, merely verify that Counter0 output is low    */
  maxtries = 10000;
  while(1)
  {
    tmgptr->ctc_register[3].value = LATCH_CNTR_0;
    if(!(tmgptr->ctc_register[0].value & 0x80))
      break;
    if(--maxtries == 0)
    {
      lm_queue_message(ERROR_MSG, "CTC failure\n");
      return FAILURE;
    }
  }

  /* turn the clock off to keep the PACs & PELs happy          */
  if(lm_tmg_clockoff() != SUCCESS)      /* shut off clock while output true */
    return(FAILURE);

  tmgptr->ctc_register[3].value = 0x070;         /* setup mode 0          */
  tmgptr->ctc_register[1].value = 0xa5;          /* lsb of 3750 - 1       */
  tmgptr->ctc_register[1].value = 0x0e;          /* msb of 3750 - 1       */
```

Copyright 1989
Logic Modeling Systems

| SOURCE PROGRAM | DATE | PAGE # |
|---|---|---|
| diags/tmg_run.c | 5/23/89 | 6/203 |
| | TIME 4:41:35 pm | |

LINE # SOURCE TEXT

```
  /* timer is now running, using Counter 1       */
  tmg_last_n = n;
  tmg_n_was_changed = TRUE;
  tmgptr->pll_rate = n;
  tr~~~~->pll_divisor = k;
  tmg,   ->clock_select = source;
  return(SUCCESS);
}


/*      lm_tmg_check_locked()
 *
 *      This function returns SUCCESS if PLL lock indicator is true
 *      and 1 ms has expired since changing its frequency, as
 *      indicated by Counter 1.  Counter 1 is setup by
 *      lm_tmg_set_frequency().
 */
lm_tmg_check_locked()
{
  if(!tmg_n_was_changed && tmgptr->pll_locked)  /* no need to wait       */
    return(SUCCESS);

  /* when Counter 1 output goes true, desired time delay has passed      */

  tmgptr->ctc_register[3].value = LATCH_CNTR_1_STATUS;

  if(((tmgptr->ctc_register[1].value & 0x0c0) == 0x080) && tmgptr->pll_locked)
    return(SUCCESS);            /* null flag not set and output true     */
  else
    return(FAILURE);
}


/*      lm_tmg_measure_clock()
 *
 *      This function measures the frequency of either external clock.
 *
 *      Inputs: clock type (external 0 or 1), pointer to clock period in ps
 *      Outputs: clock period is assigned, function returns SUCCESS
 *              or FAILURE.
 */
lm_tmg_measure_clock(clocktype, periodptr)
u_char clocktype;
u_long *periodptr;
{
  int i, saveintenable;
  u_long least, most, cntr1[3], cntr2[3], start;

  if(lm_tmg_clockoff() != SUCCESS)
    return(FAILURE);

  if((clocktype != EXT0) && (clocktype != EXT1)) {
    lm_queue_message(ERROR_MSG, "invalid clock type (%d)",
                     clocktype);
    return(FAILURE);
  }
  tmgptr->clock_select = clocktype;

  if(lm_tmg_clockon() != SUCCESS)
    return(FAILURE);
  if(isslow()) {
    lm_queue_message(ERROR_MSG, "clock is slow");
    return(FAILURE);
  }

  saveintenable = tmgptr->ctc_intr_enable;
  tmgptr->ctc_intr_enable = 0;
  tmgptr->ctc_intr_clearL = 0;           /* output false          */

  tmgptr->ctc_register[3].value = CNTR0CW;        /* setup 0               */
  tmgptr->ctc_register[0].value = 0xe8; /* lsb of 1000            */
  tmgptr->ctc_register[0].value = 0x03; /* msb of 1000            */

  tmgptr->ctc_register[3].value = CNTR1CW;        /* setup 1,2             */
  tmgptr->ctc_register[1].value = zero;
  tmgptr->ctc_register[1].value = zero;
  tmgptr->ctc_register[3].value = CNTR2CW;
  tmgptr->ctc_register[2].value = zero;
  tmgptr->ctc_register[2].value = zero;

  tmgptr->ctc_intr_clearL = 1;           /* let her rip           */
  start = lm_time();
  while(!tmgptr->ctc_intr)               /* wait for finish       */
    if((lm_time() - start) > 1000)
    {
      tmgptr->ctc_intr_clearL = 0;
      tmgptr->ctc_intr_enable = saveintenable;
      lm_queue_message(ERROR_MSG, "timeout; no CTC interrupt");
      return(FAILURE);
    }

  tmgptr->ctc_register[3].value = CNTR12LATCH;  /* latch count/status   */
  for(i = 0; i < 3; i++)
    cntr1[i] = tmgptr->ctc_register[1].value & 0x0ff;
  for(i = 0; i < 3; i++)
    cntr2[i] = tmgptr->ctc_register[2].value & 0x0ff;

  if(cntr1[0] & 0x40)                    /* check null flag       */
    least = 0;
  else
  {
    least = cntr1[1] + (cntr1[2] << 8);
    if(least == 0)
      least = 1;
    else
      least = 0x100011 - least;
  }

  if(cntr2[0] & 0x40)                    /* check null flag       */
    most = 0;
  else
  {
    most = cntr2[1] + (cntr2[2] << 8);
    if(most == 0)
      most = 1;
    else
      most = 0x100011 - most;
  }

  *periodptr = (((most << 16) + least) * 1000) / 60;
```

Copyright 1989 Logic Modeling Systems

LINE # SOURCE TEXT

```
  tmgptr->ctc_intr_clearL = 0;
  tmgptr->ctc_intr_enable = saveintenable;
  return(SUCCESS);
}

 islow()
{
  register long counter;
  u_long start;

  if(lm_tmg_clockon() != SUCCESS)
    return(1);  /* same as slow clock   */

  start = lm_time();
  do
  {
    if((lm_time() - start) > TIMEOUT)
    {
      lm_queue_message(ERROR_MSG,"isslow(): error in initialization\n");
      return FAILURE;
    }
    tmgptr->slow_clock_clearL = 0;      /* clear it             */
    tmgptr->slow_clock_clearL = 1;      /* unclear it           */
  } while(tmgptr->slow_clock);          /* it set, repeat       */

  /* wait about 25 msec to see if slow clock    */
  counter = 49;           /* delay = 500 ns * (49 + 1) = 25000 ns */
  while(--counter)
    ;

  return(tmgptr->slow_clock);
}


/*      int lm_tmg_clockoff(void)
 *      shuts clock off
 *      Input: nothing
 *      Output: SUCCESS or FAILURE
 */
int lm_tmg_clockoff()
{
  u_long start;

  tmgptr->clock_enable = 0;
  start = lm_time();
  while(tmgptr->clock_on)
    if((lm_time() - start) > 10)
    {
      if(tmgptr->clock_select > 2)      /* must be external clock       */
        tmgptr->clock_sync_clearL = 0;
      break;
    }
  if(tmgptr->clock_on)
  {
    lm_queue_message(ERROR_MSG, "can't turn off clock");
    return(FAILURE);
  }
  tmgptr->clock_sync_clearL = 0;
  return(SUCCESS);
}


/*      int lm_tmg_clockon(void)
 *      turns clock on
 *      Input: nothing
 *      Output: SUCCESS or FAILURE
 */
int lm_tmg_clockon()
{
  u_long start;

  if(lm_tmg_clockoff() != SUCCESS)
    return FAILURE;

  tmgptr->clock_sync_clearL = 1;

  tmgptr->clock_enable = 1;
  start = lm_time();
  while(!tmgptr->clock_on)
    if((lm_time() - start) > 10) {
      lm_queue_message(ERROR_MSG, "can't turn on clock");
      return(FAILURE);
    }

  return(SUCCESS);
}


/*      lm_tmg_set_falling_sample(count)
 *
 *      This function sets the sample width counter with the
 *      specified count after checking it against bounds.
 *
 *      Inputs: count (number of clock cycles - 1 for width)
 *      Outputs: function returns SUCCESS or FAILURE
 */
lm_tmg_set_falling_sample(count)
u_long count;
{
  if(count > 255) {
    lm_queue_message(ERROR_MSG, "value too large (%d)",
                     count);
    return(FAILURE);
  }
  else
  {
    tmgptr->sample_width = count;
    return(SUCCESS);
  }
}


/*      lm_tmg_set_rising_sample(range, threshold)
 *
 *      This function sets the comparator threshold used to
 *      determine rising edge of SAMPLE.  Threshold is checked
 *      against bounds.
 *
 *      Inputs: sample ramp and threshold value
 *      Outputs: function returns SUCCESS or FAILURE
```

Copyright 1989
Logic Modeling Systems

| SOURCE PROGRAM | DATE | PAGE # |
|---|---|---|
| diags/tmg_run.c | 5/23/89 TIME 4:41:35 pm | 8/205 |

LINE # SOURCE TEXT

```
 */
lm_tmg_set_rising_sample(range, threshold)
u_long range;
u_long threshold;
{
  if((range > 3) || (threshold > 255) ||
     (threshold < calib.SampleMinThresh[range])) {
    lm_queue_message(ERROR_MSG, "range too large (%d) OR threshold out of range (%d)",
                     range, threshold);
    return(FAILURE);
  }
  else
  {
    tmgptr->sample_delay = threshold;
    tmgptr->sample_delay_range = range;
    return(SUCCESS);
  }
}


/*      lm_tmg_set_edge_settings(period, thresholds)
 *
 *      This function sets the comparator thresholds used
 *      for the six timing edges and the sample ramp trigger.
 *      Thresholds are checked against bounds.
 *
 *      Inputs: logical clock period in ps, and threshold array
 *      Outputs: function returns SUCCESS or FAILURE
 */
lm_tmg_set_edge_settings(period, thresholds)
u_long period;
u_long thresholds[];
{
  int ramp;

  for(ramp = 0; ramp < 4; ramp++)
    if(calib.EdgeMaxDelay[ramp] > period)
      return lm_tmg_set_ramp_edge_settings(ramp, thresholds);

  lm_queue_message(ERROR_MSG, "period too large; period = %d, EdgeMaxDelay[3] = %d",
                   period, calib.EdgeMaxDelay[3]);
  return(FAILURE);
}

lm_tmg_set_ramp_edge_settings(ramp, thresholds)
register u_long ramp;
u_long thresholds[];
{
  register u_long edge;

  for(edge = 0; edge < 6; edge++)
    if((thresholds[edge] > 255) ||
       (thresholds[edge] < calib.EdgeMinThresh[ramp][edge])) {
      lm_queue_message(ERROR_MSG, "threshold for edge %d is out of range (%d)",
                       edge, thresholds[edge]);
      return(FAILURE);
    }
    else
      tmgptr->edge_delay[edge].delay = thresholds[edge];

#ifdef possible_bug
  if((thresholds[6] > 255) || (thresholds[6] < calib.EdgeMinThresh[ramp][6]))
#else possible_bug
  if((thresholds[6] > 255) || (thresholds[6] < calib.Edge7MinThresh[ramp]))
#endif possible_bug
    return(FAILURE);
  else
    tmgptr->sample_trigger_threshold = thresholds[6]; /* edge "7" */

  tmgptr->edge_delay_range = ramp;
  return(SUCCESS);
}

/*      int lm_tmg_play(timeout)
 *
 *      Initiates pattern presentation
 *
 *      Inputs: none
 *      Returns: SUCCESS or FAILURE
 */
int lm_tmg_play(timeout)                        /* start a presentation */
u_long timeout;
{
  if(lm_tmg_initiate_play() != SUCCESS)
    return(FAILURE);
  return(lm_tmg_complete_play(timeout));
}


/*      int lm_tmg_initiate_play(void)
 *
 *      This routine turns clocks on and starts a presentation.
 *
 *      Inputs: none
 *      Outputs: function returns SUCCESS or FAILURE
 */
int lm_tmg_initiate_play()
{
  if(tmgptr->lane_intr)                 /* is error on bus?     */
    if(tmgptr->lane_intr)               /* really?              */
    {
      lm_queue_message(ERROR_MSG, "lm_tmg_initiate_play: error on bus");
      return(FAILURE);
    }
  if(tmgptr->backplane_mode)            /* in PLAY mode?        */
  {
    lm_queue_message(ERROR_MSG, "lm_tmg_initiate_play: already in PLAY mode");
    return(FAILURE);
  }
  if(lm_tmg_clockoff() != SUCCESS)
    return(FAILURE);
  if(lm_tmg_clockon() != SUCCESS)
    return(FAILURE);

  play_completed_flag = 0;
  post_end_of_play=1;
  tmgptr->pattern_intr_enable = 0;      /* just in case         */
  tmgptr->pattern_intr_enable = 1;      /* enable EOP interrupt */
  tmgptr->start_pattern_play = 1;       /* start presentation   */
  return(SUCCESS);
```

Copyright 1989
Logic Modeling Systems

LINE # SOURCE TEXT

```
}


/*      int lm_tmg_complete_play(u_long timeout)
 *
 *      This function waits for a presentation to complete by
 *      waiting for the EOP interrupt from the Timing Generator.
 *
 *      Inputs: timeout is ms
 *      Outputs: function returns SUCCESS or FAILURE
 */
int lm_tmg_complete_play(timeout)
u_long timeout;
{
  u_long start;

#ifndef DIAGS
#ifdef MODELER
  int err;

  while (! play_completed_flag)
  {
        sc_spend( play_semaphore, lm_number_of_ticks( timeout ), &err );
        if( err == VRTX_TIMEOUT )
        {
                lm_tmg_abort_play();
                tmgptr->pattern_intr_enable = 0;        /* clear EOP interrupt  */
                post_end_of_play=0;
                return( FAILURE );
        }
        if( err != VRTX_OK )
        {
                post_end_of_play=0;
                printf("Error in lm_tmg_complete_play(), error code  %x\n",err);
                tmgptr->pattern_intr_enable = 0;        /* clear EOP interrupt  */
                return(FAILURE);
        }
  }
  post_end_of_play=0;
  tmgptr->pattern_intr_enable = 0;      /* clear EOP interrupt  */
  return(SUCCESS);
#endif
#else DIAGS
  start = lm_time();
  while(!TMG_INT)                       /* wait for interrupt   */
    if((lm_time() - start) > timeout)
    {
      lm_tmg_abort_play();
      tmgptr->pattern_intr_enable = 0;  /* clear EOP interrupt  */
      return(FAILURE);
    }
  tmgptr->pattern_intr_enable = 0;      /* clear EOP interrupt  */
  return(SUCCESS);
#endif DIAGS
}


/*      int lm_tmg_abort_play()
 *
 *      INPUT:  none
 *      OUTPUT: returns SUCCESS or FAILURE
 *      DESCRIPTION: Aborts pattern play by asserting and then removing
 *      the error line.
 */
int
lm_tmg_abort_play()
{
  u_long start;
  int stuck, returncode;
  int save_lane_intr_enable;

  save_lane_intr_enable = tmgptr->lane_intr_enable;

  stuck = FALSE;
  returncode = SUCCESS;

  if(!tmgptr->backplane_mode)           /* if ACCESS mode       */
  {
    tmgptr->pattern_intr_enable = 0;    /* clear EOP interrupt  */
    if(lm_tmg_clockoff() != SUCCESS)
    {
      lm_queue_message(ERROR_MSG, "lm_tmg_complete_play: clockoff returned error");
      return(FAILURE);
    }
  }
  else
    disable_mod_err();
    if(tmgptr->lane_enable)
    {
      if(tmgptr->lane_enable & ~tmgptr->lane_intr)
      {
        start = lm_time();
        tmgptr->lane_intr_enable = 0;
        tmgptr->backplane_error = 1;            /* Assert error line    */
        while(tmgptr->clock_on)         /* Wait for clock to stop */
          if((lm_time() - start) > 10)  /* 10 ms timeout        */
          {
            stuck = TRUE;
            lm_queue_me   ~e(ERROR_MSG, "lm_tmg_abort_play: PAC did not respond to ERROR*");
            break;
          }
        tmgptr->backplane_error = 0;    /* Deassert error line */
      }
    }

  if(stuck)
  {
    tmgptr->abort_pattern_play = 1;     /* last resort          */
    start = lm_time();
    while(tmgptr->clock_on)
      if((lm_time() - start) > 10)
      {
        returncode = FAILURE;
        lm_queue_message(ERROR_MSG, "lm_tmg_abort_play: TMG state machine did not quit");
        lm_queue_message(ERROR_MSG, "mode = %d",
                         tmgptr->backplane_mode);
        lm_queue_message(ERROR_MSG, "clock_on = %d",
                         tmgptr->clock_on);
        lm_queue_message(ERROR_MSG, "errors = %x",
                         tmgptr->lane_intr),
```

Copyright 1989
Logic Modeling Systems

SOURCE PROGRAM diags/tmg_run.c | DATE 5/23/89 | TIME 4:41:35 pm | PAGE # 10/207

LINE # SOURCE TEXT

```
        }
    }

    /* Flush error signal out of pipeline */
    if(lm_tmg_clockoff() != SUCCESS)        /* Turn off clock        */
      returncode = FAILURE;
    if(lm_tmg_clockon() != SUCCESS)         /* Turn on clock         */
      returncode = FAILURE;
    if(lm_tmg_clockoff() != SUCCESS)        /* Turn off clock        */
      returncode = FAILURE;

    tmgptr->lase_intr_enable = save_lase_intr_enable;

    enable_mod_err();
    return(returncode);
}


/*
 *      lm_tmg_set_sample_trigger_mode(mode)
 *
 *      Selects either normal or early sample trigger mode.
 *
 *      Input: mode
 *      Output: returns SUCCESS or FAILURE if mode is not 0 or 1
 */
lm_tmg_set_sample_trigger_mode(mode)
u_long mode;
{
  if(mode > 1)
  {
    lm_queue_message(ERROR_MSG, "lm_tmg_set_sample_trigger_mode: invalid mode");
    return FAILURE;
  }
  else
  {
    tmgptr->sample_mode = mode;
    return SUCCESS;
  }
}
```

Copyright 1989
Logic Modeling Systems

| HEADER FILE | DATE | 5/23/89 | PAGE # |
|---|---|---|---|
| diags/tmg_run.h | TIME | 4:41:37 pm | 1/208 |

LINE # HEADER TEXT

```
/* SCCS_ID: tmg_run.h rev 3.1, 4/24/89 at 07:51:00    */

#define N_MIN 128
#define N_MAX 256
#define T_REF 8533333.3            /* reference period in ps             */
#define MAX_PERIOD 6667746         /* 1 / 150 Khz ... ps                 */
                                   /* actually our approx of 150 KHz     */
#define MIN_PERIOD 40000.0         /* 1 / 25 MHz in ps                   */
#define DEAD_TIME 15000            /* guess in ps                        */
#ifndef LATCH_CNTR_0
#define LATCH_CNTR_0 0x0e2         /* latch count in Counter 0           */
#endif
#ifndef LATCH_CNTR_1
#define LATCH_CNTR_1 0x0c4         /* latch count in Counter 1           */
#endif
#define LATCH_CNTR_1_STATUS 0xe4           /* latch status only          */

#define EXT0 3             /* register value to select ext clock 0       */
#define EXT1 4             /* register value to select ext clock 1       */
```

Copyright 1989
Logic Modeling Systems

SOURCE PROGRAM diags/tmg_util.c | DATE 5/23/89 | TIME 4:41:37 pm | PAGE # 1/209

LINE # SOURCE TEXT

```
/* SCCS_ID: tmg_util.c rev 3.1, 4/24/89 at 07:51:03     */

/***********************************************************************
 *                                                                     *
 *       tmg_util.c                                                    *
 *                                                                     *
 *       A collection of small utility routines for the Timing         *
 *         Generator Diagnostics and Calibration                       *
 *                                                                     *
 ***********************************************************************/

#include "common.h"
#include "modeler_extn.h"
#include "mod_def.h"
#include "tmg.h"
#include "tmg_def.h"
#include "vrtx.h"
#include "tmg_extn.h"
#ifdef DIAGS
#include "diag_setjmp.h"
#endif DIAGS
#include "intr.h"

static int zero = 0;

/*      u_long tmg_measure_freq(void)
 *
 *      This routine measures clock frequency of the selected clock.
 *      It counts how many unknown clocks occur within 10,000 clocks
 *      of 3.75 MHz.  If the unknown frequency is as low as 150 KHz,
 *      there can be as many as 250,000 reference clocks, thus the
 *      need for a 32 bit count of reference clocks.
 *
 *      Inputs: none
 *      Returns: number of clocks (3.75 MHz, 266.7 ns period)
 */
u_long tmg_measure_freq(noclocksptr)
u_long *noclocksptr;
{
  int i;
  u_long least, most, cntr1[3], cntr2[3], start;

  if(tmg_clockoff() != SUCCESS)
  {
    lm_error("Measure Freq: could not turn clock off.\n");
    return(FAILURE);
  }
  if(tmg_clockon() != SUCCESS)
  {
    lm_error("Measure Freq: could not turn clock on.\n");
    lm_message("Please check the external clock connection\n");
    return(FAILURE);
  }
  if(tmg_isslow())
  {
    lm_warning("The frequency is too slow.\n");
    lm_warning("==> Please check the external clock connection.\n");
    lm_warning("==> Allowed range is 150 KHz to 25 MHz, 0-4 V p-p\n");
  }
  tmgptr->ctc_intr_clearL = 0;          /* output false          */

  tmgptr->ctc_register[3].value = CNTR0CW,      /* setup 0                 */
  tmgptr->ctc_register[0].value = 0x10; /* lsb of 10000          */
  tmgptr->ctc_register[0].value = 0x27; /* msb of 10000          */

  tmgptr->ctc_register[3].va_ue = CNTR1CW;      /* setup 1,2               */
  tmgptr->ctc_register[1].value = zero;
  tmgptr->ctc_register[1].value = zero;
  tmgptr->ctc_register[3].value = CNTR2CW;
  tmgptr->ctc_register[2].value = zero;
  tmgptr->ctc_register[2].value = zero;

  tmgptr->ctc_intr_clearL = 1;          /* let her rip           */

  start = lm_time();
  while(!tmgptr->ctc_intr)              /* wait for finish       */
    if((lm_time() - start) > 5000)
    {
      lm_error("Measure Freq: timeout error waiting for CTC\n");
      goto failure;
    }

  tmgptr->ctc_register[3].value = CNTR12LATCH;  /* latch count/status    */
  for(i = 0; i < 3; i++)
    cntr1[i] = tmgptr->ctc_register[1].value & 0x0ff;
  for(i = 0; i < 3; i++)
    cntr2[i] = tmgptr->ctc_register[2].value & 0x0ff;

  if(cntr1[0] & 0x40)                   /* check null flag       */
    least = 0;
  else
  {
    least = cntr1[1] + (cntr1[2] << 8);
    if(least == 0)
      least = 1;
    else
      least = 0x100011 - least;
  }

  if(cntr2[0] & 0x40)                   /* check null flag       */
    most = 0;
  else
  {
    most = cntr2[1] + (cntr2[2] << 8);
    if(most == 0)
      most = 1;
    else
      most = 0x100011 - most;
  }
  *noclocksptr = (most << 16) + least;
  if(tmg_clockoff() != SUCCESS)
  {
    lm_error("Measure Freq: could not turn clock off before successful exit.\n");
    return(FAILURE);
  }
  return(SUCCESS);

failure:
  if(tmg_clockoff() != SUCCESS)
  {
```

Copyright 1989 Logic Modeling Systems

SOURCE PROGRAM diags/tmg_util.c

DATE 5/23/89 TIME 4:41:37 pm PAGE # 2/210

LINE # SOURCE TEXT

```
      lm_error("Measure Freq: could not turn clock off before aborted exit.\n");
      return(FAILURE);
    }
  return FAILURE;
}

tmg_measure_period()
{
  u_long num_of_clocks;

  /* Measure the clock speed */
  if (tmg_measure_freq(&num_of_clocks) != SUCCESS)
  {
    (void)lm_error("Clock frequency measurement failed.\n");
    return 0;
  }
  /* return pattern clock period in picoseconds */
  return ((num_of_clocks * 101) / 61);
}


/*       int tmg_isslow(void)
 *       checks if clock is slow or not
 *       Inputs: none
 *       Outpus: 1 if slow, 0 if not
 */
int tmg_isslow()
{
  tmgptr->slow_clock_clearL = 0;
  tmgptr->slow_clock_clearL = 1;
  lm_delay(10);
  return(tmgptr->slow_clock);
}

/*       int tmg_toggle(int edge, int repcount, int mode)
 *
 *       This routine checks to see if the specified edge's
 *       calibration flip flop can toggle with the current
 *       setup (delay line settings, threshold, clock rate, etc).
 *       In particular, the proper test mode, if any, must be setup.
 *
 *       Inputs: the edge number to toggle 0..5
 *               a repeat count, and a mode bit
 *
 *       Returns: number of toggles, or -1 on error
 *
 */

int tmg_toggle(edge, repcount, mode)
int edge, repcount, mode;
{
  int current, mask, previous, timestoggled;

  if((edge < 0) || (edge > 5))
  {
    sys_out("tmg_toggle: invalid edge specified\n");
    return(-1);
  }

  if(tmg_effclear() != SUCCESS)
  {
    sys_out("tmg_toggle: cal flip flops did not clear\n");
    return(-1);
  }

  timestoggled = 0;
  previous = 0;
  mask = 1 << edge;

  if(mode == TOGGLEMODE)
    while(repcount-- > 0)
    {
      if(tmg_play(TIMEOUT) != SUCCESS)
      {
        sys_out("tmg_toggle: tmg_play(TIMEOUT) returned error\n");
        return(-1);
      }
      if((current = tmgptr->edge_cal & mask) != previous)
      {
        previous = current;
        timestoggled++;
      }
      else
        break;
    }
  else
    if(mode == NOTOGGLEMODE)
      while(repcount-- > 0)
      {
        if(tmg_play(TIMEOUT) != SUCCESS)
        {
          sys_out("tmg_toggle: tmg_play(TIMEOUT) returned error\n");
          return(-1);
        }
        if((current = tmgptr->edge_cal & mask) != previous)
        {
          timestoggled++;
          break;
        }
      }
    else
      return(-1);


  return(timestoggled);
}


/*       int tmg_toggle_all(count, no_toggles)
 *
 *       This function checks all edge calibration flip flops for toggling.
 *       This should be used when searching through clock periods to find
 *       points along ramps.
 *
 *       Inputs: count, array of toggles for each edge
 *       Outputs: array of toggles is assigned, function returns SUCCESS
 *                or FAILURE
 */
int tmg_toggle_all(count, no_toggles)
int count, no_toggles[];
```

Copyright 1989
Logic Modeling Systems

| SOURCE PROGRAM | DATE | TIME | PAGE # |
|---|---|---|---|
| diags/tmg_util.c | 5/23/89 | 4:41:37 pm | 3/211 |

LINE # SOURCE TEXT

```
{
  u_char data;
  int i;

  if(tmg_esffclear() != SUCCESS)
  {
    lm_error("tmg_toggle_all: cal flip flops dis not clear\n");
    return(FAILURE);
  }

  for(i = 0; i < 6; i++)
    no_toggles[i] = 0;
  data = 0;

  while(count--)
  {
    if(tmg_play(TIMEOUT) != SUCCESS)
    {
      lm_error("tmg_toggle_all: tmg_play(TIMEOUT) returned error\n");
      return(FAILURE);
    }
    data = tmgptr->edge_cal ^ data;
    for(i = 0; i < 6; i++)
      no_toggles[i] += (data >> i) & 1;
  }
  return(SUCCESS);
}


/*      int tmg_init(void)
 *
 *      This function initializes the Timing Generator to default
 *      settings.
 *
 *      Inputs: none
 *      Outputs: function returns SUCCESS or FAILURE
 */
int tmg_init()
{
    if(Host)
        return(SUCCESS);

    calib.CalCompleted = 0;
    return diag_tmg_reset(TRUE);
}

int tmg_walk1(p)
unsigned char *p;
{
  int i, j, returncode;
  unsigned char tmp;

  returncode = SUCCESS;
  for(i = 1, j = 0; j < 8; j++, i <<= 1)
  {
    *p = i;
    if((tmp = *p)  != i)
    {
      lm_error("walking1: address %08x wrote %02x read %02x\n", p, i, tmp);
      returncode = FAILURE;
    }
  }

  return(returncode);
}

int tmg_walk0(p)
unsigned char *p;
{
  unsigned int j, returncode;
  unsigned char i, tmp;

  returncode = SUCCESS;
  for(i = 1, j = 0; j < 8; i <<= 1, j++)
  {
    *p = ~i;
    if((tmp = *p) != ~i)
    {
      lm_error("walking0: address %08x wrote %02x read %02x\n", p, i, tmp);
      returncode = FAILURE;
    }
  }

  return(returncode);
}

int tmg_reg0walk1(p)
unsigned char *p;
{
  int i, j, returncode;
  unsigned char tmp;

  returncode = SUCCESS;
  for(i = 1, j = 0; j < 8; j++, i <<= 1)
  {
    if(j < 2)
    {
      *p = 0x10;              /* got to remove OBRESET*      */
      *p = i | 0x10;
      if((tmp = *p) != (i | 0x10))
      {
        lm_error("walking1: address %08x wrote %02x read %02x\n", p, i, tmp);
        returncode = FAILURE;
      }
    }
    else
    {
      *p = i;
      if((tmp = *p) != i)
      {
        lm_error("walking1: address %08x wrote %02x read %02x\n", p, i, tmp);
        returncode = FAILURE;
      }
    }
  }

  return(returncode);
}

int tmg_reg0walk0(p)
```

Copyright 1989
Logic Modeling Systems

LINE # SOURCE TEXT

```
unsigned char *p;
{
  int j, returncode;
  unsigned char i, tmp;

  returncode = SUCCESS;
  *p = 0x0ff;                        /* remove OBRESET*              */
  for(i = 1, j = 0; j < 8; i <<= 1, j++)
  {
    *p = ~i;
    if(j != 4)
    {
      if((tmp = *p) != ~i)
      {
        lm_error("walking0: address %08x wrote %02x read %02x\n", p, i, tmp);
        returncode = FAILURE;
      }
    }
    else
    {
      if((tmp = *p) != (~i & 0x0fc))
      {
        lm_error("walking0: address %08x wrote %02x read %02x\n", p, i, tmp);
        returncode = FAILURE;
      }
      *p = 0x0ff;                    /* remove OBRESET*              */
    }
  }

  return(returncode);
}

int tmg_reg2walk0(p)
unsigned char *p;
{
  int j, returncode;
  unsigned char i, tmp;

  returncode = SUCCESS;
  for(i = 0x7e, j =  0; j < 8; j++)
  {
    *p = i;
    if((tmp = *p) != i)
    {
      lm_error("walking0: address %08x wrote %02x read %02x\n", p, i, tmp);
      returncode = FAILURE;
    }
    i = ((i << 1) | 0x01) & 0x7f;          /* have to keep values  */
                                           /* within proper range  */
  }

  return(returncode);
}


/*      int checkrate(int, int, unsigned long, unsigned long *)
 *      This routine checks rate of the clock using the 8254
 *
 *      Input: value of N
 *             value of output division (2,4,6,...,512,516,520,...,1024)
 *             number of clocks expected
 *      Returns: discrepancy is assigned, function returns SUCCESS
 *               or FAILURE
 */
int tmg_checkrate(n,k,noclocks, discrepancyptr)
int n, k;
unsigned long noclocks;
int *discrepancyptr;
{
  int i, cntr1[3], cntr2[3], returncode;
  unsigned long actual, most, least, start;

  if(tmg_clockoff() != SUCCESS)          /* shut off clock              */
  {
    lm_error("Checkrate: cannot turn clock off.\n");
    return(FAILURE);
  }

  returncode = SUCCESS;

  if((n < 128) || (n > 256))
  {
    lm_warning("Checkrate: %d invalid value of N passed.\n", n);
    return(FAILURE);
  }

  if((k < 2) || (k > 1024) || (k & 1) || ((k > 512) && (k%4 != 0)))
  {
    lm_warning("Checkrate: %d invalid value of K passed.\n", k);
    return(FAILURE);
  }

  tmgptr->pll_rate = (256 - n) + 1;

  if(k == 2)
  {
    tmgptr->pll_divisor = 255;  /* have to for fo/2              */
    tmgptr->clock_select = 0;   /* select fo/2                   */
  }
  else if(k <= 512)
  {
    tmgptr->pll_divisor = (256 - (k >> 1)) + 1; /* fo/2k          */
    tmgptr->clock_select = 1;                   /* select fo/2k */
  }
  else
  {
    tmgptr->pll_divisor = (256 - (k >> 2)) + 1; /* fo/4k          */
    tmgptr->clock_select = 2;                   /* select fo/4k */
  }

  lm_delay(6);                         /* wait a long time for lock    */

  /* now that PLL is ready, do the thing with the 8254          */
  tmgptr->ctc_register[3].value = CNTR1CN;     /* setup 1,2 first      */
  tmgptr->ctc_register[1].value = zero;
  tmgptr->ctc_register[1].value = zero;
  tmgptr->ctc_register[3].value = CNTR2CN;
  tmgptr->ctc_register[2].value = zero;
  tmgptr->ctc_register[2].value = zero;
```

Copyright 1989 Logic Modeling Systems

SOURCE PROGRAM diags/tmg_util.c | DATE 5/23/89 | TIME 4:41:37 pm | PAGE # 5/213

SOURCE TEXT

```
   tmgptr->ctc_register[3].value = CNTR0CN;
   tmgptr->ctc_register[0].value = 0xe8;          /* lsb of 1000  */
   tmgptr->ctc_register[0].value = 0x03;          /* msb of 1000  */

   tmgptr->ctc_intr_clearL = 0;  /* make sure things are off     */
   if(tmg_clockon() != SUCCESS)
   {
     lm_error("Checkrate: cannot turn clock on.\n");
     return(FAILURE);
   }
   tmgptr->ctc_intr_clearL = 1;  /* let her rip                 */

   start = lm_time();
   while(!tmgptr->ctc_intr)        /* wait for finish             */
     if((lm_time() - start) > 150)        /* longest time is 137 ms      */
     {
       lm_error("Checkrate: timer timed out, n = %d, k = %d, noclocks = %d\n", n, k, noclocks);
       return(FAILURE);
     }

   tmgptr->ctc_register[3].value =  CNTR12LATCH; /* latch count  */
                                                 /* and status   */
   for(i = 0; i < 3; i++)
     cntr1[i] = tmgptr->ctc_register[1].value & 0x0ff;
   for(i = 0; i < 3; i++)
     cntr2[i] = tmgptr->ctc_register[2].value & 0x0ff;

   /* compute actual number of clocks that occurred      */
   if(cntr1[0] & 0x40)             /* check null flag     */
     least = 0;
   else
   {
     least = cntr1[1] + (cntr1[2] << 8);
     if(least == 0)
       least = 1;
     else
       least = 0x10001l - (unsigned long)least;
   }

   if(cntr2[0] & 0x40)             /* check null flag     */
     most = 0;
   else
   {
     most = cntr2[1] + (cntr2[2] << 8);
     if(most == 0)
       most = 1;
     else
       most = 0x10001l - (unsigned long)most;
   }

   actual = (most << 16) + least;

   *discrepancyptr = actual - noclocks;

   return(returncode);
}


/*      tmg_display_error()
 *
 *      This function displays the error latches for the various
 *      lanes.
 *
 *      Inputs: lanes to display, bit 0 = lane A, bit 3 = lane D
 *      Returns: lm_error returncode
 */
int tmg_display_error(lanes)
int lanes;
{
  int i;

  if(!(lanes & 0x0f))             /* no lanes specified   */
  {
    return(lm_error("tmg_display_error: no lanes specified\n"));
  }
  if(!tmgptr->tmg_intr)
  {
    return(lm_error("tmg_display_error: no error condition present\n"));
  }

  lm_message("\nTMG Error Register Display:\n");
  lm_message("\nLane(s)\t");
  for(i = 1; i != 0x10; i <<= 1)
    if(i & lanes)
      switch(i)
      {
        case 1: lm_message("\tA"); break;
        case 2: lm_message("\tB"); break;
        case 4: lm_message("\tC"); break;
        case 8: lm_message("\tD"); break;
        default: break;
      }
  lm_message("\n\npel_cntl<2..0>");
  for(i = 1; i != 0x10; i <<= 1)
    if(i & lanes)
      switch(i)
      {
        case 1: lm_message("\t%d", tmgptr->lane_a_pel_control); break;
        case 2: lm_message("\t%d", tmgptr->lane_b_pel_control); break;
        case 4: lm_message("\t%d", tmgptr->lane_c_pel_control); break;
        case 8: lm_message("\t%d", tmgptr->lane_d_pel_control); break;
        default: break;
      }
  lm_message("\nData Valid");
  for(i = 1; i != 0x10; i <<= 1)
    if(i & lanes)
      switch(i)
      {
        case 1: lm_message("\t%d", tmgptr->lane_a_data_valid); break;
        case 2: lm_message("\t%d", tmgptr->lane_b_data_valid); break;
        case 4: lm_message("\t%d", tmgptr->lane_c_data_valid); break;
        case 8: lm_message("\t%d", tmgptr->lane_d_data_valid); break;
        default: break;
      }
  lm_message("\n\n");
  return(lm_error("Failures in table.\n"));
}


/*      tmg_verify_pel_ctrl_error()
```

Copyright 1989 Logic Modeling Systems

| SOURCE PROGRAM | DATE | TIME | PAGE # |
|---|---|---|---|
| diags/tmg_util.c | 5/23/89 | 4:41:37 pm | 6/214 |

SOURCE TEXT

```
 *
 *      This function verifies that the specified bit in the specified lane
 *      disagrees with all other specified lanes.
 *
 *      Inputs: lanes that participated in the presentation, lane wit'
 *              the error, and its bit position
 *      Outputs: function returns SUCCESS if error is verified, else FAILURE
 */
int tmg_verify_pel_ctrl_error(lanes, badlane, bitpos)
int lanes, badlane, bitpos;
{
  int a, b, i, mask, returncode;
  char lane;

  if(!(lanes & 0x0f))
  {
    lm_message("tmg_verify_pel_ctrl: no lanes specified\n");
    return(SUCCESS);
  }
  if(lanes == badlane)
  {
    lm_message("tmg_verify_pel_ctrl: only one lane... no discrepancies!\n");
    return(SUCCESS);
  }
  if((badlane < 0) || (badlane > 0x0f))
  {
    lm_error("tmg_verify_pel_ctrl: invalid bad lane specification\n");
    return(FAILURE);
  }
  if((bitpos > 2) || (bitpos < 0))
  {
    lm_error("tmg_verify_pel_ctrl: invalid bit position specified\n");
    return(FAILURE);
  }
  mask = 1 << bitpos;

  returncode = SUCCESS;
  switch(badlane)
  {
    case 1: b = tmgptr->lane_a_pel_control; break;
    case 2: b = tmgptr->lane_b_pel_control; break;
    case 4: b = tmgptr->lane_c_pel_control; break;
    case 8: b = tmgptr->lane_d_pel_control; break;
    default: break;
  }
  for(i = 1; i != 0x10; i <<= 1)
  {
    if(i == badlane)
      continue;
    if(i & lanes)
    {
      switch(i)
      {
        case 1: a = tmgptr->lane_a_pel_control; lane = 'A'; break;
        case 2: a = tmgptr->lane_b_pel_control; lane = 'B'; break;
        case 4: a = tmgptr->lane_c_pel_control; lane = 'C'; break;
        case 8: a = tmgptr->lane_d_pel_control; lane = 'D'; break;
        default: break;
      }
      if(!((a ^ b) & mask))
      {
        lm_error("tmg_verify_pel_ctrl: bad data from lane %c, bit %d\n", lane,bitpos);
        returncode = FAILURE;
      }
    }
  }
  return(returncode);
}

/*      int tmg_verify_data_valid_error()
 *
 *      This function verifies that the specified data valid bit in the
 *      specified lane disagrees with all other specified lanes.
 *
 *      Inputs: lanes participating in the presentation, lane to check
 *      Outputs: function returns SUCCESS if error is verified, else FAILURE
 */
int tmg_verify_data_valid_error(lanes, badlane)
int lanes, badlane;
{
  int a, b, i, returncode;
  char lane;

  returncode = SUCCESS;

  if(!(lanes & 0x0f))
  {
    lm_message("tmg_verify_data_valid_error: no lanes specified\n");
    return(SUCCESS);
  }
  if(lanes == badlane)
  {
    lm_message("tmg_verify_data_valid_error: only one lane, no discrepancy\n");
    return(SUCCESS);
  }
  if((badlane < 0) || (badlane > 0x0f))
  {
    lm_error("tmg_verify data_valid_error: invalid bad lane specified\n");
    return(FAILURE);
  }
  switch(badlane)
  {
    case 1: b = tmgptr->lane_a_data_valid; break;
    case 2: b = tmgptr->lane_b_data_valid; break;
    case 4: b = tmgptr->lane_c_data_valid; break;
    case 8: b = tmgptr->lane_d_data_valid; break;
    default: break;
  }
  for(i = 1; i != 0x10; i <<= 1)
  {
    if(i == badlane)
      continue;
    if(i & lanes)
    {
      switch(i)
      {
        case 1: a = tmgptr->lane_a_data_valid; lane = 'A'; break;
        case 2: a = tmgptr->lane_b_data_valid; lane = 'B'; break;
        case 4: a = tmgptr->lane_c_data_valid; lane = 'C'; break;
        case 8: a = tmgptr->lane_d_data_valid; lane = 'D'; break;
```

Copyright 1989
Logic Modeling Systems

SOURCE PROGRAM diags/tmg_util.c

DATE 5/23/89 TIME 4:41:37 pm

LINE # SOURCE TEXT

```
            default: break;
        }
        if(!(a ^ b))
        {
          lm_error("tmg_verify_data_valid_error: no disagreement between bad lane and lane %c\n", lane);
          returncode = FAILURE;
        }
      }
    }
  return(returncode);
}


/*    int tmg_clear_error(void)
 *
 *    This function clears the TMG detected backplane error.
 *    It returns SUCCESS if successful, else ERROR.
 *
 */
int tmg_clear_error()
{
  if(!tmgptr->tmg_intr) /* no interrupt to clear */
    return(SUCCESS);

  tmgptr->tmg_intr_clearL = 0;
  tmgptr->tmg_intr_clearL = 1;

  if(!tmgptr->clock_on)
  {
    if(tmg_clockon() != SUCCESS)
    {
     lm_error("tmg_clear_error(): cannot turn clocks on\n");
     return(FAILURE);
    }
    if(tmg_clockoff() != SUCCESS)
    {
      lm_error("tmg_clear_error(): cannot turn clocks off\n");
      return(FAILURE);
    }
  }
  return(SUCCESS);
}

/* the following functions were previously in tmg_cal.c */

tmg_play_til_key()
{
        static char me[] = "tmg_play_til_key";

        lm_message("PRESS ANY KEY TO CONTINUE...\n");
        do {
                if(tmg_play(TIMEOUT) != SUCCESS) {
                        tmg_report_failure(me, "tmg_play");
                        return(FAILURE);
                }
        } while (lm_check_key() == 0);
        lm_message("THANK YOU\n");
        while(lm_check_key() != 0) lm_get_key();
        return SUCCESS;
}

long tmg_plot_delays()
{
    INTR_INIT
    register long ramp, edge;
    long minramp = 0;
    long minedge = 0;
    long maxramp = NUMBER_OF_ERAMPS - 1;
    long maxedge = NUMBER_OF_EDGES + 1;
    long decrement = 0;

    diag_get_long(&minramp, "start ramp", 0l, maxramp);
    diag_get_long(&maxramp, "end ramp", minramp, maxramp);
    diag_get_long(&minedge, "start edge", 0l, maxedge);
    diag_get_long(&maxedge, "end edge", minedge, maxedge);
    diag_get_long(&decrement, "Decrement = 1, Increment = 0", 0, 1);

    INTR_BEGIN
        tmg_set_test_mode(1); tmg_set_slot_count(1);
        for (ramp = minramp; ramp <= maxramp; ++ramp) {
            for (edge = minedge; edge <= maxedge; ++edge) {
                tmg_plot_delay(ramp, edge, decrement);
            }
        }
    INTR_GOT_ONE
        tmg_restore_calibration();
        intr();
    INTR_END
    tmg_restore_calibration();
    return SUCCESS;
}

tmg_plot_delay(ramp, edge, decrement)
register u_long ramp, edge;
{
    static char me[] = "tmg_plot_delay";
    long p1, p2, o1, o2, junk;
    register long thr, minth;
    int startthr, stopthr, incthr;

    tmg_set_slot_count(2);

    switch (edge) {
    default:
        thr = tmg_predict_threshold(40000,
            calib.EdgeSlope[ramp][edge], calib.EdgeOffset[ramp][edge]);
        minth = calib.EdgeMinThresh[ramp][edge];
        break;
    case 6: /* Edge 7 */
        thr = (40000 - calib.SampleOffset[ramp][0]
            - calib.SampleSlope[0] * 10)/ calib.Edge7Slope[ramp];
        minth = calib.Edge7MinThresh[ramp];
        tmgptr->sample_mode = EDGE7SAMPLETRIGGERMODE;
        break;
    case 7: /* Sample Ramp */

        thr = tmg_predict_threshold(40000,
            calib.SampleSlope[ramp], calib.EarlySampleOffset[ramp]);
        minth = calib.SampleMinThresh[ramp];
        tmgptr->sample_mode = EARLYSAMPLETRIGGERMODE;
```

Copyright 1989 Logic Modeling Systems

SOURCE PROGRAM diags/tmg_util.c

DATE 5/23/89 TIME 4:41:37 pm

LINE # SOURCE TEXT

```
            break;
        }
        if (thr < minth)
            thr = minth;

        if (decrement) {
            startthr = 250;
            stopthr = thr - 1;
            incthr = -1;
        } else {
            startthr = thr;
            stopthr = 251;
            incthr = 1;
        }

        for (thr = startthr; thr != stopthr; thr += incthr) {
            switch (edge) {
            default:
                if (!(p1 = tmg_find_period(ramp, edge, thr))) {
                    tmg_report_failure(me, "tmg_find_period");
                    return(FAILURE);
                }
                break;
            case 6: /* Edge 7 */
                if (!(p1 = tmg_find_sample_period(ramp, 0, thr, 10))) {
                    tmg_report_failure(me, "tmg_find_sample_period");
                    return(FAILURE);
                }
                break;
            case 7: /* Sample Ramp */
                if (!(p1 = tmg_find_sample_period(3, ramp, 255, thr))) {
                    tmg_report_failure(me, "tmg_find_sample_period");
                    return(FAILURE);
                }
                break;
            }
            if (tmg_get_next_lower_period(p1,
                &p2, &junk, &junk, &junk, &junk) != SUCCESS) {
                tmg_report_failure(me, "tmg_get_frequency_setting");
                return FAILURE;
            }
            switch (edge) {
            default:
                o1 = tmg_predict_offset(p1, thr, calib.EdgeSlope[ramp][edge]);
                o2 = tmg_predict_offset(p2, thr, calib.EdgeSlope[ramp][edge]);
                break;
            case 6: /* Edge 7 */
                o1 = p1 - calib.Edge7Slope[ramp] * thr - calib.SampleSlope[0] * 10;
                o2 = p2 - calib.Edge7Slope[ramp] * thr - calib.SampleSlope[0] * 10;
                break;
            case 7: /* Sample Ramp */
                o1 = tmg_predict_offset(p1, thr, calib.SampleSlope[ramp]);
                o2 = tmg_predict_offset(p2, thr, calib.SampleSlope[ramp]);
                break;
            }
            lm_message("%d %d %3d: %10d %10d %10d %10d\n", ramp, edge, thr,
                p1, o1, p2, o2);
        }

        tmg_set_slot_count(1);
        return SUCCESS;
}
```

Copyright 1989 Logic Modeling Systems

FILE bsp.diags/bsp.assem.s | DATE 5/23/89 | TIME 4:41:07 pm | PAGE # 1/1

LINE # TEXT

```
| SCCS_ID: bsp.assem.s rev 3.1, 4/24/89 at 07:54:58

|---- File Defines -----------------------------------


||||||||||||||||||||||||||||||||||||||||||||||||||||||||||||||
|
|               DEFINITIONS SPECIFIC FOR THE CPU BOARD
|
||||||||||||||||||||||||||||||||||||||||||||||||||||||||||||||
        DISINT = 0x3700
        ENAINT = 0x3000
        RTSCOPE = 0x01
        VRTX = 0x00
        IVT_BASE = 0x00000
        DUART_SR = 0x10c20014
        STATUS_REG_A = 0x10c20004
        STATUS_REG_B = 0x10c20024
        DUART_RX_TX_REG_A = 0x10c2000c
        DUART_RX_TX_REG_B = 0x10c2002c
        CHAR_TX_A = 24
        CHAR_RX_A = 25
        CHAR_TX_B = 28
        CHAR_RX_B = 29
        CPU_INTR_REG    = 0x10c60002
        TIMER_CONTROL = 0x10c3000c
        TIMER2_COUNT  = 0x10c30008
        READ_COUNTER2 = 0xd8000000
        TIMER2_TOTAL  = 0x013E
        TIMER2_LOW_COUNT = 0x40000000
        TIMER2_HIGH_COUNT = 0x01000000
        |TIMER2_LOW_COUNT = 0x20000000
        |TIMER2_HIGH_COUNT = 0x00000000
        ENABLE_LANCE = 0x08
        CPU_FUNC_REG = 0x10c60001


||||||||||||||||||||||||||||||||||||||||||||||||||||||||||||||
|
|               VRTX and RTSCOPE function codes
|
||||||||||||||||||||||||||||||||||||||||||||||||||||||||||||||
        TR_ENTER = 0x0102
        TR_EXIT = 0x0103
        TR_RXCHR = 0x0104
        TR_TXRDY = 0x0105
        UI_TXRDY = 0x0014
        UI_RXCHR = 0x0013
        UI_ENTER = 0x0016
        UI_EXIT = 0x0011
        UI_TIMER = 0x0012
        VRTX_INIT = 0x0030
        TR_INIT = 0x0100
        TR_GO = 0x0101
        SC_GO = 0x31
        SC_SPOST = 0x2e
        SC_TCREATE = 0x09
||||||||||||||||||||||||||||||||||||||||||||||||||||||||||||||
|
|               MAIN TASK DEFINITIONS
|
||||||||||||||||||||||||||||||||||||||||||||||||||||||||||||||
        MAIN_TMODE = 0                  | User mode
        MAIN_TID = 0                    | Task ID number 0
        MAIN_TPRI = 0                   | Task priority 0
|
|---- End Defines ------------
|
        XOFF = 0x13
        XON = 0x11
        .data
        .globl _Uart_mask, _lm_tick
        .globl _bus_error_address | Bus error reporting routine
        _bus_error_address: .long 0
        _Uart_mask: .long 0      | this is the DUART INTERRUPT MASK
        _lm_tick: .long 0
        Housekeeping: .word 0    | Timer variable for the housekeeping task
        .even
        _XOFF: .byte 0           | Keep track of XON/XOFF
||||||||||||||||||||||||||||||||||||||||||||||||||||||||||||||
|
|  ENTRY POINT.  When in EPROM, the following two longs are fetched
|                by the processor during a restart.
|
|--------------------------------------------------------------
|
|       .long    0x3FFFF0               | Initial Stack Pointer
|       .long    bsp_start              | Initial Program Counter
|
|
|---- Start of init code
|
        .text
        .globl  bsp_start
bsp_start:

        movw    #DISINT,sr              | Set Interrupt Level
        movl    #0x3FFFF0,sp            | Load Stack Pointer (for soft boot)
        reset
        movl    #IVT_BASE,d0
        movc    d0,vbr                  | Set Vector Base Registar up
        movl    #9,d0
        movc    d0,cacr                 | Clear and enable instruction cache

        jsr     _init_sys               | Exit to C code, never to return
|
|--------------------------------------------------------------
|

||||||||||||||||||||||||||||||||||||||||||||||||||||||||||||||
|
|  Utility Routines called by the C Init code.
|
|--------------------------------------------------------------
|

|
|---- Vrtx Init Interface
|
```

Copyright 1989 Logic Modeling Systems

FILE bsp.diags/bsp.assem.s | DATE 5/23/89 | TIME 4:41:07 pm | PAGE # 2/2

LINE # TEXT

```
        .globl  _vtx_init
_vtx_init:

        movl    #VRTX_INIT,d0           | Load Vrtx Init Function code
        trap    #VRTX                   | Trap to Vrtx
        rts                             | Return Error to C in D0
|-----------------------------------------------

|
|----  Rtscope Init Interface
|
        .globl  _rts_init
_rts_init:

|#ifdef RTSCOPE_DIAGS_DEBUG
        |link   a6,#0                   | frame pointer
        |movl   a0,sp@-                 | save A0 on the stack
        |movl   a6@(8),a0               | RTscope conf. table addr
        |movl   #TR_INIT,d0             | DBINIT
        |trap   #RTSCOPE                | call RTscope
        |movl   sp@+,a0                 | restore A0
        |unlk   a6                      | restore A6
|#endif
        rts
|-----------------------------------------------

|
|---- Rtscope Go Interface
|
        .globl  _rts_go
_rts_go:
|#ifdef RTSCOPE_DIAGS_DEBUG
        |movl   #TR_GO,d0               | DBGO
        |trap   #RTSCOPE                | call RTscope
|#endif
        movl    #_main,a0               | New task address
        movl    #MAIN_TMODE,d1          | Task mode
        movb    #MAIN_TID,d2            | Task ID number
        movb    #MAIN_TPRI,d1           | Task priority
        movl    #SC_TCREATE,d0          | System call code
        trap    #VRTX                   | Call VRTX
|
|----  Issue VRTX GO system call
|
        movl    #SC_GO,d0               | SC_GO
        trap    #VRTX                   | Shouldn't come back
        rts
|-----------------------------------------------
_bad_start:
        jmp     _bad_start


||||||||||||||||||||||||||||||||||||||||||||||||||||||||||||||||||||||||||||
|
|   Interrupt Service Routines
|
|------------------------------------------------------------------------
|
|---  Clock Board Error ISR  ------------------------------------
|
        .globl  _error_isr, _parity_isr
_error_isr:
        movl    d0,sp@-
        moveml  #0x7ffe,sp@-            | dont save a7 & d0 save d1-d7,a0-a6
        jsr     _mod_error_isr          | This is our C interrupt routine
        moveml  sp@+,#0x7ffe            | restore above regs.
|
|----  Perform UI_EXIT from ISR through Vrtx
|
        movl    #UI_EXIT,d0
        trap    #VRTX
|
|---- Parity ISR
|
_parity_isr:
        movl    d0,sp@-
        moveml  #0x7ffe,sp@-            | dont save a7 & d0 save d1-d7,a0-a6
        jsr     _parity_error           | This is our C interrupt routine
        moveml  sp@+,#0x7ffe            | restore above regs.
|
|----  Perform UI_EXIT from ISR through Vrtx
|
        movl    #UI_EXIT,d0
        trap    #VRTX
|
|---  Ethernet ISR  ---------------------------------------------
|
        .globl  _ether_isr
_ether_isr:
        movl    d0,sp@-
        moveml  #0x7ffe,sp@-            | dont save a7 & d0 save d1-d7,a0-a6
        movl    #0,_system_call         | check if  a system call is made?
        jsr     _lance_isr              | This is our C interrupt routine
        movl    _system_call, d0              | let us check bit 0
        moveml  sp@+,#0x7ffe            | restore above regs.
        btst    #0,d0                   | should we exit thru VRTX
        beq     no_sys_calls            | go to no system calls, if no VRTX
                                        | calls were made.
|
|----  Perform UI_EXIT from ISR through Vrtx
|
        movl    #UI_EXIT,d0
        trap    #VRTX
|
|----  NO SYSTEM CALLS WERE MADE  -------------------
|
no_sys_calls:
        movl    sp@+,d0
        rte
|
|-----          DUART ISR                 ---------------------------
|----  Channel A Serial Port - RX buffer full  ---------------------------
|
        .globl  _serial_isr
        .globl  _Uarta_rx_brk
_serial_isr:
        movl    d0,sp@-
        movl    d1,sp@-
        movl    a0,sp@-
        movl    #DUART_SR,a0            | get status
```

Copyright 1989 Logic Modeling Systems

FILE bsp.diags/bsp.assem.s | DATE 5/23/89 | TIME 4:41:07 pm | PAGE # 3/3

```
        movl    a0@,d1                  | load into reg
        andl    _Uart_mask,d1           | only look @ interrupts we are interested in
        andl    #0x03000000,d1          | see if VRTX interrupt
        jeq     rtscope_serial_isr      | no? go to RTscope
        movl    a0@,d1                  | load into reg
        btst    #CHAR_RX_A,d1           | check for CHAR_RX_A
        beq     not_rx_a                | nothing rcvd on channel a
        movl    #STATUS_REG_A,a0        | get the status
        movl    a0@,d0                  | status is in 24-31
        movl    #DUART_RX_TX_REG_A,a0   | get the byte
        movl    a0@,d1                  | byte is in 24-31
        andl    #0xnn0000000,d0         | see if error to rcv , break or framing
        bne     err_rx_a                | process error
        moveq   #24,d0                  | shift 24 bits
        asrl    d0,d1                   | d1 bits 0-7 = data

        cmpl    #XOFF,d1                | Flow control check for XON & XOFF
        jne     not_xoff
        movb    1,_XOFF
        jsr     txa_exit
        bra     not_tx_a
not_xoff:
        cmpl    #XON,d1
        jne     not_xon
        movb    0,_XOFF
        bra     not_rx_a
not_xon:

        movl    #UI_RXCHR,d0
        trap    #VRTX
not_rx_a:
        movl    #DUART_SR,a0            | get status
        movl    a0@,d1                  | load into reg
        btst    #CHAR_TX_A,d1           | check for CHAR_TX_A
        beq     not_tx_a                | nothing to tx on channel a
        jsr     _txa_isr                | go and transmit
not_tx_a:
        movl    sp@+,a0                 | restore address register
        movl    sp@+,d1
        movl    #UI_EXIT,d0
        trap    #VRTX
err_rx_a:
        andl    #0x80000000,d0          | see if break
        beq     not_rx_a                | not break
        moveq   #24,d0                  | shift 24 bits
        asrl    d0,d1                   | d1 bits 0-7 = data
        bne     not_rx_a                | not break start
        jsr     _Uarta_rx_brk           | process break
        bra     not_rx_a                | continue

|------ END rxa_isr ----------------------------------------------------

|
|---- Channel A Serial Port - TX buffer empty --------------------------
|
        .globl _txa_isr, _Vrtx_txa
_txa_isr:
        cmpb    #0x1,_XOFF              | Check flow control is not on
        jne     no_flow_cntl
        bra     txa_exit
no_flow_cntl:

        movl    #UI_TXRDY,d0
        trap    #VRTX
        cmpl    #0,d0
        bnes    txa_exit
|
| ------ This is the VRTX TX routine ------------------------------------
| ------ d1 = data to TX              ------------------------------------
| ------ save A0 & D0                 ------------------------------------
| ------ This is the hook for VRTX to resume or start transmiting chars --
|
_Vrtx_txa:
        movl    d0,sp@-
        movl    a0,sp@-
        movl    #DUART_RX_TX_REG_A,a0   | get address of register
        moveq   #24,d0                  | shift 24 bits to get byte in upper bits
        asll    d0,d1                   | d1 bits 00-07 = data
        movl    d1,a0@                  | byte is in 24-31 after shift
        movl    #DUART_SR,a0            | get status reg contents
        movl    _Uart_mask,d1           | this is a write only reg. so read from memory
        orl     #0x03000000,d1          | d1 = 03 enable tx ints
        movl    d1,_Uart_mask           | save in memory
        movl    d1,a0@                  | load into reg
        movl    sp@+,a0                 | restore registers
        movl    sp@+,d0
        rts
txa_exit:
        movl    #DUART_SR,a0            | get status reg contents
        movl    _Uart_mask,d1           | this is a write only reg. so read from memory
        andl    #0xfe000000,d1          | d1 =  disable tx ints
        movl    d1,_Uart_mask           | save in memory
        movl    d1,a0@                  | load into reg
        rts
|------ END txa_isr ----------------------------------------------------
|
|------ RTscope serial int. on chan B ---------------------------------

rtscope_serial_isr:
        movl    a0@,d1                  | load into reg
        btst    #CHAR_RX_B,d1           | check for CHAR_RX_B
        beq     not_rx_b                | nothing rcvd on channel b
        jsr     _modem_rx               | receive character
not_rx_b:
        movl    #DUART_SR,a0            | get status
        movl    a0@,d1                  | load into reg
        btst    #CHAR_TX_B,d1           | check for CHAR_TX_B
        beq     not_tx_b                | nothing can be trasmitted on channel b
        jsr     _modem_tx               | trasmit character
not_tx_b:
        movl    sp@+,a0                 | restore address register
        movl    sp@+,d1
        movl    #UI_EXIT,d0
        trap    #VRTX

|------ END rxb_isr ----------------------------------------------------
|
|
| ----- This is the RTSCOPE TX routine ----------------------------------
| ----- d1 = data to TX               ----------------------------------
```

Copyright 1989 Logic Modeling Systems

| FILE | DATE | PAGE # |
| --- | --- | --- |
| bsp.diags/bsp.assem.s | 5/23/89 TIME 4:41:07 pm | 4/4 |

LINE # TEXT

```
|  ===== save A0 & D0                    ====================================
|  ===== This is the hook for RTSCOPE to resume or start transmiting chars ==
|
        .globl  _Vrtx_txb
_Vrtx_txb:
        rts
|====== END txb_isr ==================================================

.globl _rtscope_in_poll, _rtscope_out_poll
_rtscope_in_poll:
        movl    a0,sp@-
        movl    d1,sp@-
        movl    #0xffffffff,d0                  | status
        cmpl    #500,_auto_start
        blt     inc_not_rx_b_poll
        cmpl    #500,_auto_start
        bne     not_time_for_G
        movl    #0x67,d0
        bra     inc_not_rx_b_poll
not_time_for_G:
        cmpl    #501,_auto_start
        bne     not_time_for_O
        movl    #0x6f,d0
        bra     inc_not_rx_b_poll
not_time_for_O:
        cmpl    #502,_auto_start
        bne     not_time_for_0xD
        movl    #0xd,d0
        bra     inc_not_rx_b_poll
not_time_for_0xD:
        movl    #DUART_SR,a0                    | get status reg contents
        movl    a0@,d1                          | load into reg
        btst    #CHAR_RX_B,d1                   | check for CHAR_RX_B
        beq     not_rx_b_poll                   | nothing rcvd on channel b
        movl    #DUART_RX_TX_REG_B,a0           | get the byte
        movl    a0@,d0                          | byte is in 24-31
        moveq   #24,d1                          | shift 24 bits
        asrl    d1,d0                           | d1 bits 0-7 = data

        |cmpl   #29,d0                          | check for ^]
        |jne    not_poll_cache_disable          | cache disable
        |movc   cacr,d0
        |orl    #8,d0
        |movc   d0,cacr                         | Clear and disable instruction cache
        |jmp    not_rx_b
not_poll_cache_disable:

not_rx_b_poll:
        movl    sp@+,d1
        movl    sp@+,a0                         | restore registers
        rts
inc_not_rx_b_poll:
        addql   #1,_auto_start
        movl    sp@+,d1
        movl    sp@+,a0                         | restore registers
        rts
|
|
|
_rtscope_out_poll:
        movb    sp@(7),d0
        movl    d1,sp@-
        movl    a0,sp@-
        movl    #DUART_SR,a0                    | get status
        movl    a0@,d1                          | load into reg
        btst    #CHAR_TX_B,d1                   | check for CHAR_TX_B
        beq     not_tx_b_poll                   | nothing can be transmitted on channel b
        movl    #DUART_RX_TX_REG_B,a0           | get address of register
        moveq   #24,d1                          | shift 24 bits to get byte in upper bits
        asll    d1,d0                           | d0 bits 00-07 = data
        movl    d0,a0@                          | byte is in 24-31 after shift
        movl    #DUART_SR,a0                    | get status reg contents
        movl    _Uart_mask,d1                   | this is a write only reg. so read from memory
        orl     #0x10000000,d1                  | d1 = 01 enable tx ints
        movl    d1,_Uart_mask                   | save in memory
        movl    d1,a0@                          | load into reg
        movl    #0,d0                           |successfully tx
        movl    sp@+,a0                         | restore registers
        movl    sp@+,d1
        rts
not_tx_b_poll:
        movl    #0xffffffff, d0                 | no tx took place
        movl    sp@+,a0                         | restore registers
        movl    sp@+,d1
        rts
|
|  ===== This is the BUS ERROR TX routine ======================================
|  ===== d1 = data to TX                  ====================================
|  ===== save A0 & D0                     ====================================
|
.globl _Bus_error_txa
_Bus_error_txa:
        link    a6,#0
        movl    d1,sp@-
        movl    d0,sp@-
        movl    a0,sp@-
not_ready_tx_a:
        movl    #DUART_SR,a0                    | get status
        movl    a0@,d1                          | load into reg
        btst    #CHAR_TX_A,d1                   | check for CHAR_TX_A
        beq     not_ready_tx_a                  | nothing to tx on channel a
        movl    a6@(8),d1                       | data to tx
        movl    #DUART_RX_TX_REG_A,a0           | get address of register
        moveq   #24,d0                          | shift 24 bits to get byte in upper bits
        asll    d0,d1                           | d1 bits 00-07 = data
        movl    d1,a0@                          | byte is in 24-31 after shift
        movl    sp@+,a0                         | restore registers
        movl    sp@+,d0
        movl    sp@+,d1
        unlk    a6
        rts
|==== Counter/Timer Interrupt ---------------------------------------------
|
        .globl  _ct_isr
_ct_isr:

        |
        |   This interrupt occurs every 5 ms
        |   we are using mode 0.
        |
```

Copyright 1989 Logic Modeling Systems

FILE bsp.diags/bsp.assem.s | DATE 5/23/89 | TIME 4:41:07 pm | PAGE # 5/5

LINE # TEXT

```
        movl    d0,sp@-
        movl    a0,sp@-
        movl    d1,sp@-
        movl    d2,sp@-


        |
        | -- disable interrupts
        |
        movl $CPU_INTR_REG,a0
        movb a0@,d2
        andb $0x7f,a0@

        |
        | -- reload tick value
        |
        movl    #TIMER_CONTROL,a0
        movl    #READ_COUNTER2,a0@
        movl    #TIMER2_COUNT,a0
        movl    a0@,d1
        movl    #24,d0
        asri    d0,d1
        andl    #0xff,d1                        | d1 bits 0-7 = low order data
        movl    a0@,d0
        asri    #8,d0
        asri    #8,d0                           | d0 bits 8-f = high order data
        andl    #0xff00,d0
        addl    d1,d0
        andl    #0x0000ffff, d0                 | mask off count
        addw    #TIMER2_TOTAL, d0
        asll    #8,d0
        asll    #8,d0
        movl    d0, d1
        asll    #8,d0
        movl    d0,a0@
        movl    d1,a0@
        |movl   #TIMER2_LOW_COUNT,a0@
                                        | of ticks since beginning of time
        |movl   #TIMER2_HIGH_COUNT,a0@
        |
        | -- Enable interrupts
        |
        movl $CPU_INTR_REG,a0
        btst #7,d2
        beq  disabled_ints
        orb #0x80,a0@
disabled_ints:
        addql   #1,_lm_tick             | This statement saves us a VRTX system call to determine no.
        addqw   #1,Housekeeping         | is it 1 second yet
        cmpw    #200,Housekeeping      | no. of ticks before we run housekeeping
        jne     no_housekeeping
        clrw    Housekeeping            | reset counter
        movl    #SC_SPOST, d0           | post to semaphor
        movl    _timer_semaphor, d1     | semaphor ID number
        trap    #VRTX
no_housekeeping:
|
|------ Make UI_TIMER Call to Vrtx
|

        |
        |- inform VRTX of tick
        |
        movl    #UI_TIMER,d0
        trap    #VRTX

        movl    sp@+,d2                 | restore registers
        movl    sp@+,d1                 | restore registers
        movl    sp@+,a0
                                                | restore registers
|
|----- Perform UI_EXIT from ISR through Vrtx
|
        movl    #UI_EXIT,d0
        trap    #VRTX

|------- END ct_isr --------------------------------------------------

|
|------- PROBE BUS ERROR HANDLER ------------------------------------------
|
        .globl  _bus_isr
_bus_isr:
        movl    sp,_bus_error_address

        moveml  #0xfffe,sp@-                    | dont save a7 save d1-d7,a0-a6
        jsr     _bus_error
        moveml  sp@+,#0x7fff                    | restore above regs.
        rte
|
|------- DIAG BUS ERROR HANDLER -------------------------------------------
|
        .globl  _diag_bus_isr
_diag_bus_isr:
        movl    sp,_bus_error_address

        moveml  #0xfffe,sp@-                    | dont save a7 save d1-d7,a0-a6
        jsr     _diag_bus_error
        moveml  sp@+,#0x7fff                    | restore above regs.
        rte
||||||||||||||||||||||||||||||||||||||||||||||||||||||||||||||||||||||
||
||---- TRAP ROUTINES for RTscope and VRTX
||
||||||||||||||||||||||||||||||||||||||||||||||||||||||||||||||||||||||

        .globl  _trp_vrtx
_trp_vrtx:

        trap    #VRTX
        rts

        .globl  _trp_rtscope
_trp_rtscope:

        trap    #RTSCOPE
        rts


||||||||||||||||||||||||||||||||||||||||||||||||||||||||||||||||||||||
```

Copyright 1989 Logic Modeling Systems

| FILE | DATE | PAGE # |
|---|---|---|
| bsp.diags/bsp.assem.s | 5/23/89 | 6/6 |
| | TIME 4:41:07 pm | |

```
|| ==== RESET_BRD
||              cause a board reset.
||
||
|||||||||||||||||||||||||||||||||||||||||||||||||||||||||||||||

        .globl  _reset_brd
_reset_brd:
        reset
        jsr     bsp_start
|
|       board reset occurs here
|
        rts


        .globl _do_nothing
_do_nothing:
        rts

|
| ------ Create a supervisory task ---------------
| err = sc_tcreate_supv_set_boot( task_address, SUPV\USER task , task_id, task priority)
| if( err != 0 ) FAILURE,
|
        .globl  _sc_tcreate_supv_set_boot
_sc_tcreate_supv_set_boot:
        link    a6,#0
        movl    a0,sp@-
        movl    d1,sp@-
        movl    d2,sp@-
        movl    d3,sp@-
        movl    #0,d2
        movl    #0,d1
        movl    a6@(8),a0               | task address
        movl    a6@(0x0c),d3            | task mode
        movl    a6@(0x10),d2            | task id
        movl    a6@(0x14),d1            |task priority
        movl    #SC_TCREATE,d0          | System call code
        trap    #VRTX                   | Call VRTX
        movl    sp@+,d3
        movl    sp@+,d2
        movl    sp@+,d1
        movl    sp@+,a0
        unlk    a6
        rts

        .globl _disable_cache
_disable_cache:
        movl    #8,d0
        movc    d0,cacr                         | Clear and disable instruction cache
        rts
```

Copyright 1989 Logic Modeling Systems

| SOURCE PROGRAM | DATE | TIME | PAGE # |
|---|---|---|---|
| bsp.diags/bsp.c | 5/23/89 | 4:41:07 pm | 1/7 |

LINE # SOURCE TEXT

```
/* SCCS_ID: bsp.c rev 3.1, 4/24/89 at 07:55:02     */

/*
** This is part of the board support package
**
** Make sure that both bsp.lm1000/bsp.c and bsp.diags/bsp.c
** are exactly the same.
*/
#include        "common.h"
#include        "task.h"
#include        "duart.h"
#include        "lm_rd_wr.h"
#include        "lmshmp.h"
#include        "cpu.h"
#include        "cpu_vec.h"
#include        "mod_err.h"
#include        "nvram.h"
#include        "id.h"
/*--------------- External routine definitions ---------------------*/
extern          bus_isr();
extern          serial_isr();
extern          parity_isr();
extern          ct_isr();
extern          void reset_cpu();
extern          ether_isr();
extern          error_isr();
extern          Vrtx_txa();
extern          Vrtx_txb();
extern          rtscope_in_poll();
extern          rtscope_out_poll();
extern          void id_load();
extern          trp_vrtx();
extern          trp_rtscope();
extern          u_short lm_nvram_access();
extern          u_long network_timeout;
extern          reset_brd();
extern          end;
#define MSECONDS_PER_SECOND 1000
/*--------------- The Globals ------------------------------------*/
/*************************************************************/
/*                         init_sys                          */
/* Initialize VRTX, and RTscope                              */
/* Activate RTscope and VRTX.                                */
/* STEPS                                                     */
/* 1.Setup interrupt vector table                            */
/* 2.Create VRTX conf table                                  */
/* 3.Create RTSCOPE conf table                               */
/* 4.Create component table                                  */
/* 5.Initialize VRTX                                         */
/* 6.Initialize TSCOPE                                       */
/*07.Setup 8254 Timers                                       */
/*08.Initialize DUART chan A                                 */
/*09.Enable CPU regs.                                        */
/*10.Partitions, create & malloc                             */
/*11.RTSCOPE go command                                      */
/*************************************************************/
unsigned long xtasknum = 0;
u_long  total_malloc_size = 0;
u_long available_malloc_size;
ID_PROM_CPU id_prom;
/*
** initialize routine
*/
init_sys()
{
long    err = 0;
char baud;
u_short short_network_timeout;
cpu_control_reg_struct  *p_cpu_cntl_reg = (cpu_control_reg_struct *) CPU_CONTROL_REG;

    /*
    ** set modeler state to booted
    */
    modeler_state = BOOTED;
    /*
    ** Turn off load led
    */
    p_cpu_cntl_reg->not_load_led = not_LED_OFF;
    /*
    **  shutdown and reset lance.
    p_cpu_cntl_reg->not_lance_reset = 1;
    */
    shutdown_and_reset_lance();

    /*
    ** calculate total partition size
    */
    total_malloc_size = (u_long)CPU_RAM_SIZE - (u_long)(&end);
    available_malloc_size = total_malloc_size;

    setup_ivt();                    /* Setup the interrupt table        */
    init_vcftble();                 /* Create VRTX conf. table          */
    init_rtsftble();                /* Create RTscope conf. table       */
    init_cvt();                     /* Create component table           */
    err = vtx_init();               /* Init VRTX                        */
    if( err )
    {
                                    /* error,         wait in loop      */
        for( ;; )
                reset_cpu(SUICIDE);
    }
#ifdef RTSCOPE_DIAGS_DEBUG
                                    /* Init RTscope                     */
    err = rts_init( &(cftbls->r_cnft) );
    if( err )
    {
                                    /* error, wait in loop              */
        for( ;; )
                reset_cpu(SUICIDE);
    }
#endif

    /*
    ** Initialize board devices
    */
    init_all_timer();           /* initialize all 3 timers          */
    /*
    ** validate NVram, setup baud rate, it should be valid
    */
    (void)lm_nvram_access((char *)0, (u_long)0, (u_long)0, MEMORY_VALIDATE,(u_long *) &err);
    /*
    ** set Modeler state to booted
```

Copyright 1989
Logic Modeling Systems

SOURCE PROGRAM bsp.diags/bsp.c | DATE 5/23/89 | TIME 4:41:07 pm | PAGE # 2/8

LINE # SOURCE TEXT

```
    */
    (void)lm_nvaram_access(&modeler_state, MODELER_STATE, SIZEOF_MODELER_STATE, MEMORY_WRITE,(u_long *) &err);
    Uarta_imr();
    Uartb_imr();
    /*
    ** set network timeout
    */
    if(lm_nvaram_access(&short_network_timeout, NETWORK_TIMEOUT, SIZEOF_NETWORK_TIMEOUT, MEMORY_READ, (u_long *)&err)==FAILURE)
    {
        sys_out("Unable to read network timeout\n");
    }
    /*
    ** Turn seconds to milliseconds
    */
    network_timeout = short_network_timeout;
    network_timeout *= MSECONDS_PER_SECOND;
    /*
    ** read Id prom
    */
    id_load((u_char *)CPU_ID_PROM, (u_char *)(&id_prom)); /* fetch id prom */
    enable_cpu_reg();              /* enable CPU regs                 */
    rts_go();                      /* Execute RTscope GO command      */

    /*
    ** SHOULD NOT COME BACK, if it does ????????????
    ** do nothing.
    */
    for( ;; )
        reset_cpu(SUICIDE);

} /* end init_sys */


/*************************************************************/
/*                         init_vcftble                      */
/* Create VRTX configuration table                           */
/*************************************************************/

init_vcftble()
{

VRTX_CNFTBL      *ct = (VRTX_CNFTBL *)&(cftbls->v_cnft);

    ct->v_wkspc = VRTX_WRK_SPACE;               /* VRTX workspace address     */
    ct->v_wk_size = VRTX_WK_SIZE;               /* VRTX workspace size        */
    ct->sys_stk_size = SYS_STK;                 /* System stack size          */
    ct->isr_stk_size = ISR_STK;                 /* Interrupt stack size       */
    ct->cb_count = CB_COUNT;                    /* Number of VRTX CB          */
    ct->res1 = 0;                               /* Reserved                   */
    ct->res2 = 0;;                              /* Reserved                   */
    ct->c_dis_lev = VC_DIS_LEVEL;               /* Component disable level    */
    ct->usr_stk_size = USR_STK;                 /* User stack size            */
    ct->res3 = 0;;                              /* Reserved                   */
    ct->usr_tsk_count = TASK_COUNT;             /* Number of tasks            */
    ct->res4 = 0;;                              /* Reserved                   */
    ct->tx_rdy = (long) Vrtx_txa;               /* Transmit ready interrupt   */
    ct->tcreate = 0;                            /* User supplied tcreate      */
    ct->tdelete = 0;                            /* User supplied tdelete      */
    ct->tswitch = 0;                            /* User supplied tswitch      */
#ifdef RTSCOPE_DIAGS_DEBUG
    ct->cvt_add = (CVT_TBL *)&(cftbls->cvt);    /* Component conf. table add*/
#else
    ct->cvt_add = (CVT_TBL *) 0;                /* Component conf. table add*/
#endif

} /* end init_vcftble */


/*************************************************************/
/*                         init_rtsftble                     */
/* Create RTscope configuration table                        */
/*************************************************************/

init_rtsftble()
{

RTCT_CNFTBL      *ct = (RTCT_CNFTBL *)&(cftbls->r_cnft);
RTIO_CNFTBL      *ioct = (RTIO_CNFTBL *)&(cftbls->rio_cnft);
short            i;

                 /* RTscope configuration table */
    ct->db_vrtx_c = VRTX_BASE;                  /* VRTX entry point           */
    ct->db_rt_w = RTS_WRK_SPACE;                /* RTscope workspace addr     */
    ct->db_wk_size = RTS_WK_SIZE;               /* RTscope workspace size     */
    ct->db_illegal = 0x4AFC;                    /* Illegal instruction, 68020 */
    ct->db_trap_t = 0;                          /* User supplied routine      */
    ct->db_comp_dis = RC_DIS_LEVEL;             /* Component disable level    */
    ct->db_priority = RT_SCP_PRI;               /* RTscope task priority      */
    ct->db_tid = RT_SCP_TID;                    /* RTscope task ID number     */
    ct->db_utrap = (long)trp_vrtx;              /* User supplied routine TRAP */
    ct->db_io_confg = ioct;                     /* IO conf table address      */
    for( i = 0; i < 4; i++ )                    /* Reserved                   */
        ct->res1[ i ] = 0;
    ct->db_vrtx_d = VRTX_WRK_SPACE;             /* VRTX workspace address     */
    ct->db_trp_vrtx = TRP_VRTX;                 /* VRTX TRAP vector number    */
    for( i = 0; i < 3; i++ )                    /* Reserved                   */
        ct->res2[ i ] = 0;

                 /* RTscope IO configuration ta..  */
    ioct->db_qid = 1;                           /* Queue ID number            */
    ioct->db_qsize = 80;                        /* Queue size                 */
    ioct->db_inpt_ll = 80;                      /* Input line length          */
    ioct->db_hstack = 10;                       /* History lines              */
    ioct->db_alias = 20;                        /* Number of alias            */
    ioct->db_sym_tab = 20;                      /* Number of symbols          */
    ioct->db_num_chnl = 2;                      /* Number of ports            */
    ioct->db_toggle = 0x1B;                     /* Toggle character           */
    ioct->db_xon = 0x11;                        /* Xon                        */
    ioct->db_xoff = 0x13;                       /* Xoff                       */
    ioct->db_exit = 0x01;                       /* Host exit character        */
    ioct->db_txrdy = (long)Vrtx_txb;            /* Hyperlink TXRDY driver addr*/
    ioct->db_in_filter = 0;                     /* Input filter               */
    ioct->db_out_filter = 0;                    /* Output filter              */
    ioct->db_pputc1 = (long)rtscope_out_poll;   /* Hyperlink input poll       */
    ioct->db_pgetc1 = (long)rtscope_in_poll;    /* Hyperlink output poll      */
    ioct->db_pputc2 = 0;                        /* Host input poll            */
    ioct->db_pgetc2 = 0;                        /* Host output poll           */
    ioct->db_spec_keys = (DB_SPCL *) 0; /* Special keys table  */

} /* end init_rtsftble */
```

Copyright 1989
Logic Modeling Systems

SOURCE PROGRAM bsp.diags/bsp.c

DATE 5/23/89 | TIME 4:41:07 pm | PAGE # 3/9

LINE # SOURCE TEXT

```
/*********************************************************/
/*                          init_cvt                     */
/* Create component configuration table                  */
/*********************************************************/

init_cvt()
{

CVT_TBL         *ct = (CVT_TBL *)&(cftble->cvt);
short           i;

    ct->hr_max = HR_MAX;                /* Ready System highest component no. */
    ct->usr_max = USR_MAX;              /* User highest component no.         */

    for( i = 0; i < 6; i++ )            /* Reserved                           */
         ct->res1[ i ] = 0;
    for( i = 0; i < 8; i++ )            /* Reserved                           */
         ct->res2[ i ] = 0;

    ct->comp1_code = 0;                 /* No IOX                             */
    ct->comp1_work = 0;                 /* No IOX                             */
    ct->comp2_code = 0;                 /* No FMX                             */
    ct->comp2_work = 0;                 /* No FMX                             */

} /* end init_cvt */



/*********************************************************/
/*                          setup_ivt                    */
/* Setup interrupt vector table                          */
/*********************************************************/

setup_ivt()
{

unsigned        long    *ivt = (unsigned long *)VEC_BASE_ADDRESS;

/*
** The bus handler
*/
        *(ivt + VEC_BUS_ERROR) = (unsigned long) bus_iar;
        *(ivt + VEC_ADDRESS_ERROR) = (unsigned long) bus_iar;
        *(ivt + VEC_ILLEGAL_INSTRUCTION) = (unsigned long) bus_iar;
/*
;------ Set up rtscope entry
*/

    *(ivt + 0x21) = (RTS_BASE + RTS_ENTRY);     /* RTscope entry point */

/*
;------ Set up Vrtx vectors
*/

    *(ivt + 0x40) = (long)&(cftble->v_cnft);    /* Config Table        */
    *(ivt + 0x20) = VRTX_BASE;                  /* VRTX Base           */

/*
;------ Set up Serial port interrupt vectors
*/

    /* Tx/Rx ISR handler address to IVT auto vector level 5 */
    *(ivt + VEC_DUART_INTERRUPT) = (long)serial_iar;

/*
;------ Set up Counter/Timer interrupt vector
*/

  /* Count/Timer ISR address to IVT 28, Auto vector level 4*/
    *(ivt + VEC_TIMER_INTERRUPT) = (unsigned long)ct_iar;

/*
;------ Set up ethernet interrupt vector
*/

  /* ethernet ISR address to IVT 30, Auto vector level 6*/
    *(ivt + VEC_LANCE_DOORBELL_INTR) = (unsigned long)ether_iar;
/*
;----- Clock board error ISR
*/
    *(ivt + VEC_CB_INTERRUPT) = (unsigned long)error_iar;
/*
;----- Parity ISR, IVT 31 , NMI
*/
        *(ivt + VEC_PARITY_INTERRUPT) = (unsigned long)parity_iar;
} /* end setup_ivt */


/*
** Enable cpu control register
*/
enable_cpu_reg()
{
        cpu_control_reg_struct  *p_cpu_cntl_reg = (cpu_control_reg_struct *) CPU_CONTROL_REG;
        /*
        ** enable timer gates, and enable the timer interrupt
        */
        p_cpu_cntl_reg->timer_gate_0 = 1;
        p_cpu_cntl_reg->timer_gate_1 = 1;
        p_cpu_cntl_reg->timer_intr_ena_2 = 1;
        /*
        ** enable parity intr
        */
        p_cpu_cntl_reg->parity_intr_ena = 1;
        /*
        ** enable interrupts
        */
        p_cpu_cntl_reg->global_intr_ena = 1;

}

/*
** reset the CPU
*/
void
reset_cpu(reset_modeler_state)
char reset_modeler_state;
```

Copyright 1989
Logic Modeling Systems

| SOURCE PROGRAM | DATE | TIME | PAGE # |
| --- | --- | --- | --- |
| bsp.diags/bsp.c | 5/23/89 | 4:41:07 pm | 4/10 |

LINE # SOURCE TEXT

```
{
        char modeler_reset = reset_modeler_state;
        u_long  err;
        cpu_control_reg_struct *cpu_catl = (cpu_control_reg_struct *) CPU_CONTROL_REG;

        /*
        ** reason for reset
        */
        if( reset_modeler_state != REBOOT )
        {
                (void)lm_nvram_access(&modeler_reset, MODELER_RESET, SIZEOF_MODELER_RESET, MEMORY_WRITE,(u_long *) &err);
                reset_modeler_state = SHUTDOWN;
        }
        (void)lm_nvram_access(&reset_modeler_state, MODELER_STATE, SIZEOF_MODELER_STATE, MEMORY_WRITE,(u_long *) &err);
        cpu_catl -> suicide = 1;
        for(;;);
}
```

Copyright 1989 Logic Modeling Systems

SOURCE PROGRAM bsp.diags/modem.c

DATE 5/23/89 TIME 4:41:08 pm PAGE # 1/11

LINE # SOURCE TEXT

```
/* SCCS_ID: modem.c rev 3.1, 4/24/89 at 07:55:06 */

#include "common.h"
#include "cpu_vec.h"
#include "lm_rd_wr.h"
#include "mod_err.h"
#include "nvaram.h"

#define Duart_ar        (*((int *)0x10c20014))
#define Srb             (*((int *)0x10c20024))
#define Uart_b          (*((int *)0x10c2002c))

#define QLOCK(q)        (&((q)->qlock))
#define PUTPARK(q)      (&((q)->putpark))
#define GETPARK(q)      (&((q)->getpark))
#define EMPTY(q)        ((q)->backp == (q)->frontp)

#define UART_BUFSIZE    256

struct qcontrol {
        char *qlock;
        int backp;
        int frontp;
        char *getpark;
        int getwaiters;
        char *putpark;
        int putwaiters;
        char qbuf[UART_BUFSIZE];
};

struct qcontrol Modem_txq, Modem_rxq;

static int *Save_duart_isr;

#define read_duart_status()     *((int *)0x10c20004)

modem_init()
{
        qinit(&Modem_txq);
        qinit(&Modem_rxq);
}

modemprintline(s)
char *s;
{
        while (*s) {
                qputc(&Modem_txq, *s++);
        }
        flushmodem();
}

getmodemc()
{
        extern int Uart_mask;

        /* this txq stuff should be in housekeeping task */
        if (!EMPTY(&Modem_txq)) {
                Uart_mask |= 0x10000000;
                Duart_ar = Uart_mask;
        }

        return qgetc(&Modem_rxq);
}

getmodemc_tmo(tmo, err)
int tmo, *err;
{
        extern int Uart_mask;

        /* this txq stuff should be in housekeeping task */
        if (!EMPTY(&Modem_txq)) {
                Uart_mask |= 0x10000000;
                Duart_ar = Uart_mask;
        }

        return qgetc_tmo(&Modem_rxq, tmo, err);
}

flushmodem()
{
        if (!EMPTY(&Modem_txq)) {
                Uart_mask |= 0x10000000;
                Duart_ar = Uart_mask;
        }
}

putmodemc(c)
int c;
{
        qputc(&Modem_txq, c);
        Uart_mask |= 0x10000000;
        Duart_ar = Uart_mask;
}

modem_rx()
{
        register int c;
        register int arb;
        [illegible] err;
        register struct qcontrol *qp = &Modem_rxq;

        arb = Srb;
        c = Uart_b >> 24;
        if (arb & 0xe0000000) {
                /* is this a break? */
                if (arb & 0x80000000) {
                        Uartb_rx_brk();
                }
                return;
        }
        if (qfull(qp)) return; /* waste character */

        qp->qbuf[qp->backp++] = c;
        if (qp->backp >= UART_BUFSIZE) qp->backp = 0;
        if (qp->getwaiters != 0) {
                qp->getwaiters--;
                sc_post(GETPARK(qp), (char *)1, &err);
        }
}
```

Copyright 1989 Logic Modeling Systems

| SOURCE PROGRAM | DATE | PAGE # |
|---|---|---|
| bsp.diags/modem.c | 5/23/89 | 2/12 |
| | TIME 4:41:08 pm | |

SOURCE TEXT

```
modem_tx()
{
        int err;
        extern int Uart_mask;
        register struct qcontrol *qp = &Modem_(

        if (!EMPTY(qp)) {
                Uart_b = qp->qbuf[qp->frontp++] << 24;
                if (qp->frontp >= UART_BUFSIZE) qp->frontp = 0;
                if (qp->putwaiters != 0) {
                        qp->putwaiters--;
                        sc_post(PUTPARK(qp), (char *)1, &err);
                }

                Uart_mask |= 0x10000000;
                Duart_sr = Uart_mask;
        } else {
                Uart_mask &= 0xef000000;
                Duart_sr = Uart_mask;
        }
}

qinit(qp)
struct qcontrol *qp;
{
        qp->qlock = (char *)1;
        qp->backp = 0;
        qp->frontp = 0;
        qp->getpark = 0;
        qp->getwaiters = 0;
        qp->putpark = 0;
        qp->putwaiters = 0;
}

qputc(qp, c)
struct qcontrol *qp;
{
        int err;

        sc_pend(QLOCK(qp), 0, &err);
        while (qfull(qp)) {
                ++qp->putwaiters;
                sc_post(QLOCK(qp), (char *)1, &err);
                sc_pend(PUTPARK(qp), 0, &err);
                sc_pend(QLOCK(qp), 0, &err);
        }
        qp->qbuf[qp->backp++] = c;
        if (qp->backp >= UART_BUFSIZE) qp->backp = 0;
        if (qp->getwaiters != 0) {
                qp->getwaiters--;
                sc_post(GETPARK(qp), (char *)1, &err);
        }
        sc_post(QLOCK(qp), (char *)1, &err);
        if (c == (int)'\n')
                qputc(qp, (int)'\r'); /* Recursive. Cool. */
}

qgetc(qp)
struct qcontrol *qp;
{
        int c, err;

        sc_pend(QLOCK(qp), 0, &err);
        while (EMPTY(qp)) {
                ++qp->getwaiters;
                sc_post(QLOCK(qp), (char *)1, &err);
                sc_pend(GETPARK(qp), 0, &err);
                sc_pend(QLOCK(qp), 0, &err);
        }
        c = qp->qbuf[qp->frontp++];
        if (qp->frontp >= UART_BUFSIZE) qp->frontp = 0;
        if (qp->putwaiters != 0) {
                qp->putwaiters--;
                sc_post(PUTPARK(qp), (char *)1, &err);
        }
        sc_post(QLOCK(qp), (char *)1, &err);
        return c;
}

/* get c with timeout */
qgetc_tmo(qp, tmo, err)
struct qcontrol *qp;
int tmo, *err;
{
        int c;

        sc_pend(QLOCK(qp), tmo, err);
        if (*err == 0xa) return 0;
        while (EMPTY(qp)) {
                ++qp->getwaiters;
                sc_post(QLOCK(qp), (char *)1, err);
                sc_pend(GETPARK(qp), tmo, err);
                if (*err == 0xa) return 0;
                sc_pend(QLOCK(qp), tmo, err);
                if (*err == 0xa) return 0;
        }
        c = qp->qbuf[qp->frontp++];
        if (qp->frontp >= UART_BUFSIZE) qp->frontp = 0;
        if (qp->putwaiters != 0) {
                qp->putwaiters--;
                sc_post(PUTPARK(qp), (char *)1, err);
        }
        sc_post(QLOCK(qp), (char *)1, err);
        return c;
}

qfull(qp)
struct qcontrol *qp;
{
        int n;
        n = qp->frontp - qp->backp - 1;
        return ((n == 0) || (n == -UART_BUFSIZE));
}
```

Copyright 1989 Logic Modeling Systems

SOURCE PROGRAM: tasks.diags/hkeeping_task.c

DATE 5/23/89 TIME 4:42:31 pm PAGE # 1/1

LINE # SOURCE TEXT

```
/* SCCS_ID: hkeeping_task.c rev 3.1, 4/24/89 at 07:55:11     */

#include "common.h"
#include "cpu.h"
#include "network.h"
#include "lance.h"
#include "mod_err.h"
#include "nvram.h"

unsigned long timer_semaphor;
extern u_short check_connection_for_life( );
extern u_long lm_tick;
extern CONNECTION       *table_of_conns[];
extern u_long   network_timeout;
extern BOOT_STRUCT boot;
static char string[ 50 ];
#define MAX_TRIES 3

void
housekeeping_task()
{
        cpu_control_reg_struct  *p_cpu_cntl_reg = (cpu_control_reg_struct *) CPU_CONTROL_REG;
        int err;
        u_char  value=0;
#ifdef  BROKEN_HARDWARE
        extern char reinitialize_lance;
#endif  BROKEN_HARDWARE
        u_char users = 0;
        register        CONNECTION      **conn_table;
        register        CONNECTION      *conn;
        /*
        ** This loop is the house keeping task..
        */
        while(1)
        {
                sc_spend( timer_semaphor, 0, &err);
                if(err) printf("\nError in spend in housekeeping tx.", err);
                if( value == 1)
                {
                        p_cpu_cntl_reg->not_test_led = not_LED_OFF;
                        value = 0;

                }
                else
                {
                        p_cpu_cntl_reg->not_test_led = not_LED_ON;
                        value = 1;
                }
#ifdef  BROKEN_HARDWARE
                if( reinitialize_lance == 1)
                {
                        reinitialize_lance = 0;
                        (void)sc_lock();
                        if( get_lance_ready_to_go( ) != SUCCESS)
                                printf("Can't reinitilalize lance\n");
                        else    printf("Reinitialized lance\n");
                        if( start_lance() != SUCCESS)
                                printf("Can't start lance\n");
                        else    printf("Restarted lance\n");
                        (void)sc_unlock();
                }
#endif  BROKEN_HARDWARE
                /*
                ** go thru conn structures
                ** checking for timeouts
                */
                conn_table = &table_of_conns[ 0 ];
                for( users = 0; users < MAX_USERS; users++ )
                {
                        conn = *conn_table++;
                        CPU_DISABLE_INTERRUPTS;
                        /*
                        ** close the connection
                        */
                        if( conn -> do_close == TRUE )
                        {
                                if(close_connection_for_server( conn ) == FAILURE) {
                                        sprintf(string,"Unable to close connection %d\n",conn->fd) ;
                                        output_routine(string);
                                }
                        }
                        else
                        {
                                /*
                                ** did we send the last part of the reply
                                ** and is this connection supposed to close
                                */
                                if( conn -> am_sending == FALSE && conn -> am_closing == TRUE ) {
                                        conn -> do_close = TRUE;
                                }
                        }
                        if(network_timeout != 0 && conn != (CONNECTION *) NULL &&  conn->am_timing_out == TRUE )
                        {
                                if( conn -> time_to_live < (lm_tick + 5))
                                {
                                        if( check_connection_for_life( conn ) == FAILURE)
                                        {
                                                sprintf(string,"Can't check connection for life in housekeeping task user # %d\n", users);
                                                output_routine(string);
                                        }
                                        conn -> time_to_live = (lm_tick + 5) + network_timeout;
                                        if( conn -> number_of_live_retries++ > MAX_TRIES )
                                        {
                                                /*
                                                * The host daemon is not responding to daemon
                                                * requests. This does not mean that the host is dead,
                                                * so just make a note of it and continue.
                                                */
                                                sprintf(string,"Warning: Connection timeout for user: %d\n", users);
                                                output_routine( string );
                                                sprintf(string,"        Check host daemon.\n");
                                                output_routine( string );
                                                conn->number_of_live_retries = 0;
                                        }
                                }
                        }
                        CPU_ENABLE_INTERRUPTS;
                }
        }
}
```

Copyright 1989
Logic Modeling Systems

| SOURCE PROGRAM | DATE | TIME | PAGE # |
|---|---|---|---|
| tasks.diags/hkeeping_task.c | 5/23/89 | 4:42:31 pm | 2/2 |

SOURCE TEXT

```
static void
set_test_led( )
{
        cpu_control_reg_struct  *p_cpu_cntl_...   (cpu_control_reg_struct *) CPU_CONTROL_REG;
                        p_cpu_cntl_reg->not_test_led = not_LED_ON;
}

static void
clear_test_led( )
{
        cpu_control_reg_struct  *p_cpu_cntl_reg = (cpu_control_reg_struct *) CPU_CONTROL_REG;
                        p_cpu_cntl_reg->not_test_led = not_LED_OFF;
}
```

Copyright 1989
Logic Modeling Systems

| SOURCE PROGRAM | DATE | PAGE # |
|---|---|---|
| tasks.diags/receive_task.c | 5/23/89 | 1/3 |
| | TIME 4:42:31 pm | |

LINE # SOURCE TEXT

```
/* SCCS_ID: receive_task.c rev 3.1, 4/24/89 at 07:55:14    */

#include <stdio.h>
#include "common.h"
#include "message.h"
#include "task.h"
#include "network.h"

extern CONNECTION *table_of_conns[ ];

void
receive_task()
{
        u_char  user;

        if(init_socket() == FAILURE) {
                printf("Unable to initialize socket\n");
                dequeue_all_messages();
                /* What should we do now? */
        }

        for (;;) {
                switch (lm_choose_connection(&user)) {
                case PENDING:
                        if (lm_send_reply(table_of_conns[user]) != SUCCESS) {
                                printf("user %d send reply failed\n", user);
                        }
                        break;
                case FAILURE:
                        dequeue_all_messages();
                        break;
                }
        }
}

static
dequeue_all_messages()
{
        u_short type;
        char    str[MAX_MESSAGE];

        while(lm_dequeue_message(&type, str) != FAILURE) {
                if (type == ERROR_MSG)
                        (void)printf("ERROR: %s\n",str);
                else (void)printf("WARNING: %s\n",str);
        }
}
```

Copyright 1989 Logic Modeling Systems

SOURCE PROGRAM tasks.diags/serial_task.c

DATE 5/23/89 TIME 4:42:31 pm PAGE # 1/4

LINE # SOURCE TEXT

```c
/* SCCS_ID: serial_task.c rev 3.1, 4/24/89 at 07:55:16 */

/*
** serial task
*/
#include "fifo.h"
#include "task.h"
#include "common.h"
#include "network.h"
#include "lm_diags.h"

static  char    Net_diag_message[256];

void
serial_task()

{
        static char buffer;
        struct fifo_entry fifo;

        fifo.fifo_no = RX_FIFO;
        fifo.user = 0;
        fifo.task = SERIAL_TASK_ID;

        for (;;) {
                fifo.data = (char *)sc_getc();
                if(diag_fifo_put( &fifo )== FAILURE) printf("Fifo Failure\n");
        }
}

void
modem_task()
{
        static char buffer;
        struct fifo_entry fifo;

        fifo.fifo_no = RX_FIFO;
        fifo.user = 1;
        fifo.task = SERIAL_TASK_ID;

        for (;;) {
                fifo.data = (char *)getmodemc();
                if(diag_fifo_put( &fifo )== FAILURE) printf("Fifo Failure\n");
        }
}

send_error_message (conn, message)
        CONNECTION      *conn;
        char            *message;
{       long    cmd;

        cmd = LM_GET_LONG(conn);
        output_error_message(conn, cmd, message);
}

output_error_message (conn, cmd, message)
        CONNECTION      *conn;
        char            *message;
{
        register long   i;

        LM_CHK_PUT_LONG(conn, cmd +1);
        LM_CHK_PUT_LONG(conn, 1);
        LM_CHK_PUT_CHAR(conn, (char) 1);
        for (i = 0; i<strlen(message); i++)
                LM_CHK_PUT_CHAR(conn, message[i]);
        LM_CHK_PUT_CHAR(conn, 0);
        lm_send_reply(conn);
}

char *
diag_get_mode(user,task)
{
        if (task == RECEIVE_TASK_ID)
                return Net_diag_message;
        if (user == 0)
                return "Modeler is running diagnostics from the console\n";
        else
                return "Modeler is running diagnostics over the modem\n";
}

#define LM_PEEK_LONG(X)         \
                (*((long *)(X)->incoming_buffer_pointer))

diag_fifo_put(fifo)
struct fifo_entry *fifo;
{
static  int User = 0;
static  int Task = 0;
static  char    diag_username[32] = "<unknown user>";
static  char    diag_hostname[32] = "<unknown host>";
static  char    *mode;
        char    *s, *name_pointer;
        CONNECTION *conn;
extern  CONNECTION      *table_of_conns[ ];
        int cmd;

        if (Task == 0) {

                sprintf(Net_diag_message,
                                "%s is running diagnostics over the network from %s \n",
                                diag_username, diag_hostname);

                if (fifo->task == RECEIVE_TASK_ID) {
                        conn = table_of_conns[fifo->user];
                        cmd = LM_PEEK_LONG(conn);
                        if (cmd != LM_DIAG_GIMME) {
                                mode = "[RUNNING DIAGNOSTICS]\n";
                                output_error_message(conn, cmd, mode);
                                set_close_connection_for_server(conn);
                                return SUCCESS;
                        }

                        if (4 < * (unsigned long *) (conn->incoming_buffer_pointer + 4)) {
                                s = diag_username;
                                name_pointer = conn->incoming_buffer_pointer + 8;
                                while (*s++ = *name_pointer++)
                                        ;

                                s = diag_hostname;
```

Copyright 1989
Logic Modeling Systems

SOURCE PROGRAM: tasks.diags/serial_task.c

DATE: 5/23/89 | TIME: 4:42:31 pm | PAGE # 2/5

SOURCE TEXT

```
                                while (*s++ = *name_pointer++)
                                        ;

                                sprintf(Net_diag_message,
                                        "%s is running diagnostics over the network from %s \n",
                                        diag_username, diag_hostname);
                        }
                }
                User = fifo->user;
                Task = fifo->task;
                mode = diag_get_mode(User,Task);
                printf(mode);
                modemprintline(mode);
        }

        if ((User == fifo->user) && (Task == fifo->task)) {
                return fifo_put(fifo);
        } else switch (fifo->task) {
        case SERIAL_TASK_ID:
                if ((char)fifo->data == INTR_CHARACTER) {
                        mode = diag_get_mode(fifo->user,fifo->task);
                        if (Task == RECEIVE_TASK_ID) {
                                /* close network connection */
                                conn = table_of_conns[User];
                                cmd = LM_PEEK_LONG(conn);
                                output_error_message(conn, cmd, mode);
                        }
                        User = fifo->user;
                        Task = fifo->task;
                        printf(mode);
                        modemprintline(mode);
                        return fifo_put(fifo);
                } else {
                        if (fifo->user == 0) {
                                printf(mode);
                        } else {
                                modemprintline(mode);
                        }
                }
                break;
        case RECEIVE_TASK_ID:
                conn = table_of_conns[fifo->user];
                cmd = LM_PEEK_LONG(conn);
                output_error_message(conn, cmd, mode);
                set_close_connection_for_server(conn);
                break;
        }
        return SUCCESS;
}
```

Copyright 1989 Logic Modeling Systems

| SOURCE PROGRAM | DATE | TIME | PAGE # |
| --- | --- | --- | --- |
| tasks.diags/transmit_task.c | 5/23/89 | 4:42:31 pm | 1/6 |

LINE # SOURCE TEXT

```
/* SCCS_ID: transmit_task.c rev 3.1, 4/24/89 at 07:55:19 */

void
.ansmit_task()
{
        tx_task();
}
```

Copyright 1989
Logic Modeling Systems

SOURCE PROGRAM lm1000/delay.c | DATE 5/23/89 | TIME 6:14:35 pm | PAGE # 1/1

LINE # SOURCE TEXT

```
/* SCCS_ID: delay.c rev 3.1, 4/24/89 at 07:52:37     */

#include "device.h"
#include "hardware.h"
#i"    " "eeprom.h"
#incl... "lmserver.h"
#include "protams.h"

get_delay(def_ptr, instance, ident_change, ident_inconsistent_pins,
          source_pin_number, source_pin_value)
DEVICE_SPEC          *def_ptr;
INSTANCE_INFO        *instance;
PTRN_BITS_LONGWORD   *ident_change;
PTRN_BITS_LONGWORD   *ident_inconsistent_pins;
register u_short      source_pin_number;
u_short               source_pin_value;
{
   PIN_SPEC              *pin_def;
   DAB_INFO              *dab_ptr;
   PIN_INFO              *pin_info;
   MIN_TYP_MAX           *new_mtym_ptr;
   MIN_TYP_MAX           *old_mtym_ptr;
   register TIMING_SPEC  *timing_ptr;
   register TIMING_SPEC  *max_timing_ptr;
   register u_short       key_state;
   register u_long        ident_change_word;
   register u_long        mask;
   register char          bitno;
   u_short                dest_pin_number;
   u_short                unit_pin_number_offset;
   u_short                word_pin_number_offset;
   u_char                 unitno, wordno;
   u_char                 dest_pin_value;

   /* If an output pin has several different path delays from the Eval/Store
    * input pins, then the delay for that output is calculated as shown in the
    * following table.
    *
    *   PREVIOUS EVENT          CURRENT EVENT              ACTION
    *
    * none                     eval table index == -1      table index == -1
    * none                     eval table index == x       table index == x
    *
    * table index == -1        eval table index == -1      table index == -1
    * table index == -1        eval table index == x       table index == x
    * table index == x         eval table index == -1      table index == x
    * table index == x         eval table index == y       combine -> comp delay
    * comp delay  == z         eval table index == -1      ? no change
    * comp delay  == z         eval table index == x       combine
    *
    * none                     store table index == -1     table index == -1
    * none                     store table index == x      table index == x
    *
    * table index == -1        store table index == -1     table index == -1
    * table index == -1        store table index == x      table index == x
    * table index == x         store table index == -1     table index == -1
    * table index == x         store table index == x      table index == x
    * comp delay == z          store table index == -1     table index == -1
    * comp delay == z          store table index == x      table index == x
    *
    *
    * NOTE:
    *    "none"                --> this is the first event output
    *    "table index == -1"   --> no delay is found in the delay table
    *    "comp delay"          --> the delay is a combination of
    *                              delay table entries
    *    "combine"             --> combine the min/typ/max to get
    *                              worst case delay
    *    "eval"                --> this is an eval event
    *    "store"               --> this is a store event
    */

/* ???? Note: make sure that the control field of ident_change is 0.
 */

dab_ptr = dab_list[instance->dab_info_index];

unit_pin_number_offset = 0;
for (unitno = 0; unitno < dab_ptr->unit_count; ++unitno) {

   word_pin_number_offset = unit_pin_number_offset + 79;
   for (wordno = 0; wordno < 3; ++wordno) {

      ident_change_word = ident_change[unitno].word[wordno];

      for (bitno = 31; bitno >= 0; --bitno) {

         mask = bitno_to_mask[bitno];

         /* Get out of the "for" loop if there are no more set
          * bits to look at.
          */
         if (ident_change_word == 0)
            break;

         if (ident_change_word & mask) {

            /* reset the bit */
            ident_change_word ^= mask;

            dest_pin_number = word_pin_number_offset + bitno - 31;

            if (read_ptrn_bit_long(&ident_inconsistent_pins[unitno],
                                   wordno, (u_char)bitno) != 0) {
               dest_pin_value = LOGIC_U;
            }
            else
               dest_pin_value =
                  read_pin_value_long(&instance->last_sample_value,
                                      unitno, wordno, (u_char)bitno);

            pin_info = &instance->pin_info_table[dest_pin_number];
            pin_def = &def_ptr->pin_table[dest_pin_number];
            timing_ptr = &pin_def->delay_table[0];
            max_timing_ptr = timing_ptr + pin_def->delay_cnt;

            key_state = dest_pin_value << 4 | source_pin_value;

            for (; timing_ptr < max timing_ptr; ++timing_ptr) {
```

Copyright 1989
Logic Modeling Systems

SOURCE PROGRAM
lm1000/delay.c

DATE 5/23/89
TIME 6:14:35 pm
PAGE # 2/2

LINE # SOURCE TEXT

```
                if (source_pin_number == timing_ptr->minor_pin &&
                    (u_short)(key_state & ((u_short *)timing_ptr)[1]) ==
                                                            key_state)
                   break;
             }

             pin_info->new_raw = dest_pin_value;
             if (pin_info->output_pin_is_linked == FALSE) {
                pin_info->output_pin_is_linked = TRUE;
                pin_info->event_pin_number = source_pin_number;
                pin_info->delay_type = DELAY_TABLE;
                pin_info->next_output_pin_index =
                                     instance->first_data_pin_index;
                instance->first_data_pin_index = dest_pin_number;

                if (timing_ptr == max_timing_ptr)
                   pin_info->min_delay = -1;
                else
                   pin_info->min_delay = timing_ptr->mtym_index;
             }
             else {
                if (timing_ptr != max_timing_ptr) {

                   if (pin_info->delay_type == DELAY_TABLE) {
                      if (pin_info->min_delay == -1) {
                         pin_info->min_delay = timing_ptr->mtym_index;
                         pin_info->event_pin_number = source_pin_number;
                         pin_info->delay_type = DELAY_TABLE;
                      }
                      else {
                         new_mtym_ptr = &def_ptr->mtym_table[
                                             timing_ptr->mtym_index];

                         old_mtym_ptr = &def_ptr->mtym_table[
                                             pin_info->min_delay];

                         combine_delay(&pin_info->min_delay,
                                       &pin_info->typ_delay,
                                       &pin_info->max_delay,
                                       new_mtym_ptr, old_mtym_ptr);

                         if (source_pin_number < pin_info->event_pin_number)
                            pin_info->event_pin_number = source_pin_number;

                         pin_info->delay_type = DELAY_TABLE_COMPOSITE;
                      }
                   }
                   else {
                      new_mtym_ptr = &def_ptr->mtym_table[
                                          timing_ptr->mtym_index];

                      old_mtym_ptr = (MIN_TYP_MAX *)&pin_info->min_delay;

                      combine_delay(&pin_info->min_delay,
                                    &pin_info->typ_delay,
                                    &pin_info->max_delay,
                                    new_mtym_ptr, old_mtym_ptr);


                      if (source_pin_number <  pin_info->event_pin_number)
                         pin_info->event_pin_number = source_pin_number;

                      pin_info->delay_type = DELAY_TABLE_COMPOSITE;
                   }
                }
             }
          }
       }

       word_pin_number_offset -= 32;
    }

    unit_pin_number_offset += 80;
  }
}

/*----------------------------------------------------------------------*/

combine_delay(min, typ, max, delay1, delay2)
long          *min;
long          *typ;
long          *max;
MIN_TYP_MAX   *delay1;
MIN_TYP_MAX   *delay2;
{
   if (delay1->minimum < delay2->minimum)
      *min = delay1->minimum;
   else
      *min = delay2->minimum;

   if (delay1->maximum > delay2->maximum)
      *max = delay1->maximum;
   else
      *max = delay2->maximum;

   *typ = (delay1->typical + delay2->typical) / 2;
}
```

Copyright 1989
Logic Modeling Systems

| SOURCE PROGRAM | DATE | PAGE # |
|---|---|---|
| lm1000/edgepl.c | 5/23/89 | 1/3 |
| | TIME 6:14:35 pm | |

LINE # SOURCE TEXT

```
/* SCCS_ID: edgepl.c rev 3.1, 4/24/89 at 07:52:41     */

#include "device.h"
#include "hardware.h"
#include "eeprom.h"
#include "lmserver.h"
#include "message.h"

#define NOT_FINISHED                -1
#define FINISHED                    -2
#define THRESHOLD_FUDGE_FACTOR       4
#define def_ptr_def_duty_cycle       50

place_edges(def_ptr, dab_ptr)
DEVICE_SPEC     *def_ptr;
DAB_INFO *dab_ptr;
{
    EXTRA_DEVICE_SPEC  *extra_def_ptr;
    PIN_SPEC *pin_def;
    u_long     extra_time_needed;
    u_long     sample_min_delay;
    u_long     sample_jitter_error;
    u_long     early_sample_min_delay;
    u_long     early_sample_jitter_error;
    u_long     start_dead_time;   /* dead time at the begining of PCLK period */
    u_long     end_dead_time;     /* deat time at the end of PCLK period */
    u_long     actual_end_dead_time;
    u_long     user_hold_time;
    u_long     user_setup_time;
    u_long     hold_time;
    u_long     setup_time;
    u_long     sample_edge_time1;
    u_long     sample_edge_time2;
    u_long     data_edge_time;
    u_long     store_edge_time;
    u_long     hdoff_edge_time;
    u_long     hdoff_edge_time2;
    u_long     clock_jitter_error;
    u_long     edge_jitter_error;
    u_long     quantization_error;
    u_long     physical_clock_period;
    u_long     logical_clock_period;
    u_long     xlogical_clock_period;
    u_long     min_logical_clock_period;
    u_long     max_logical_clock_period;
    u_long     max_modeler_logical_clock_period;
    u_long     n_reg;
    u_long     k_reg;
    u_long     source_reg;
    u_long     temp;
    u_long     other_edge_time;
    u_long     center_time;
    u_long     measured_period;
    u_long     edge_times[MAX_EDGE_COUNT];
    u_long     ret;
    u_long     minimum_fall_sample_time;
    u_short    pin_number;
    u_char     has_store_DNRZ_pins;
    u_char     has_store_R1_or_RZ_pins;
    u_char     has_io_store_pins;
    u_char     bits_per_pin = 1;  /* This will be declared in DABDEF */
    u_char     loop_count = 0;
    u_char     all_io_store_pins_are_hard_driven;
    u_char     all_io_data_pins_are_hard_driven;
    u_char     any_hard_driven_io_pins;
    u_char     pattern_unit_count;
    u_char     threshold1;
    u_char     threshold2;
    u_char     threshold3;
    u_char     put_hdoff_edge_after_store_edge;

    /* The declared clock_period is the DABDEF is the device's clock period.
     * If the device used DNRZ clock (but no R1/RZ clock) then this period
     * must be divided by 2. Furthermore, if there are "n" unit-patterns/lane
     * then this period is further divided by "n".
     */

    DPRINTF(("inside place_edges\n"));
    extra_def_ptr = (EXTRA_DEVICE_SPEC *)def_ptr->extra_data;

    all_io_store_pins_are_hard_driven = TRUE;
    all_io_data_pins_are_hard_driven = TRUE;
    has_store_DNRZ_pins = FALSE;
    has_store_R1_or_RZ_pins = FALSE;
    has_io_store_pins = FALSE;
    any_hard_driven_io_pins = FALSE;
    put_hdoff_edge_after_store_edge = FALSE;

    for (pin_number = 0; pin_number < def_ptr->pin_cnt; ++pin_number) {
       pin_def = &def_ptr->pin_table[pin_number];
       if ((pin_def->direction == NONE) ||
           (pin_def->direction == POWER) ||
           (pin_def->direction == GROUND) ||
           (pin_def->direction == NC))
          continue;

       if (pin_def->pin_class == STORE) {
          if (pin_def->clk_format == DNRZ)
             has_store_DNRZ_pins   TRUE;
          else if ((pin_def->clk_format == R1) || (pin_def->clk_format == R0))
             has_store_R1_or_RZ_pins = TRUE;

       }

       if (pin_def->direction == IO) {

          if (pin_def->pin_class == STORE)
             has_io_store_pins = TRUE;

          switch (pin_def->in_seq_drive) {
          case M_DRIVE:
          case NO_DRIVE:
             if (pin_def->pin_class == STORE)
                all_io_store_pins_are_hard_driven = FALSE,
             else
                all_io_data_pins_are_hard_driven = FALSE;
             break;
          case H_DRIVE:
          case HM_DRIVE:
             any_hard_driven_io_pins = TRUE;
```

Copyright 1989
Logic Modeling Systems

| SOURCE PROGRAM | DATE | 5/23/89 | PAGE # |
|---|---|---|---|
| lm1000/edgepl.c | TIME | 6:14:35 pm | 2/4 |

LINE # SOURCE TEXT

```
            break;
        default:
            break;
        }

        switch (pin_def->last_cyc_drive) {
        case H_DRIVE:
        case HM_DRIVE:
            any_hard_driven_io_pins = TRUE;
            break;
        default:
            break;
        }
    }
}

pattern_unit_count = bits_per_pin * dab_ptr->unit_count_per_lane;

/* Measure the clock frequency if we are using external clock */
switch (def_ptr->clock_type) {
case INTERNAL:

    /* We only multiply the hardware frequency by 2 if there are no R1/RZ
     * clocks because otherwise the R1/RZ clock will be running too fast.
     */
    if ((has_store_DNRZ_pins == TRUE) &&
                (has_store_R1_or_RZ_pins == FALSE)) {
        min_logical_clock_period = def_ptr->clock_period1 / 2;
        max_logical_clock_period = def_ptr->clock_period2 / 2;
    }
    else {
        min_logical_clock_period = def_ptr->clock_period1;
        max_logical_clock_period = def_ptr->clock_period2;
    }

    if (def_ptr->device_type == PRIVATE) {
        def_ptr->clock_period1 = PRIVATE_PATTERN_PERIOD;
        def_ptr->clock_period2 = MAX_MODELER_CLOCK_PERIOD;

        min_logical_clock_period = PRIVATE_PATTERN_PERIOD;
        max_logical_clock_period = MAX_MODELER_CLOCK_PERIOD;
    }

    break;
case EXT1:
    source_reg = EXT0_REG_VALUE;

    if (lm_tmg_measure_clock(EXT0_REG_VALUE, &measured_period) == FAILURE) {
        lm_queue_message(ERROR_MSG, "Timing Generator error: measure clock");
        return(FAILURE);
    }

    temp = measured_period * pattern_unit_count;

    if ((has_store_DNRZ_pins == TRUE) &&
                (has_store_R1_or_RZ_pins == FALSE))
        temp = temp * 2;

    if (temp < def_ptr->clock_period1 -
        def_ptr->clock_period1 * MAX_PERCENT_TOLERANCE / 100) {
        lm_queue_message(ERROR_MSG, "the external clock frequency measured (%0.2f MHz) cannot satisfy the maximum device_speed requirement (%
0.2f MHz)",
                        (double)1000000.0 / (double)measured_period,
                        (double)1000000.0 / (double)def_ptr->clock_period1);
        return(FAILURE);
    }

    if (temp > def_ptr->clock_period2 +
        def_ptr->clock_period2 * MAX_PERCENT_TOLERANCE / 100) {
        lm_queue_message(ERROR_MSG, "the external clock frequency measured (%0.2f MHz) cannot satisfy the minimum device_speed requirement (%
0.2f MHz)",
                        (double)1000000.0 / (double)measured_period,
                        (double)1000000.0 / (double)def_ptr->clock_period2);
        return(FAILURE);
    }

    def_ptr->clock_period1 = temp;
    def_ptr->clock_period2 = temp;

    if ((has_store_DNRZ_pins == TRUE) &&
                (has_store_R1_or_RZ_pins == FALSE)) {
        min_logical_clock_period = def_ptr->clock_period1 / 2;
        max_logical_clock_period = def_ptr->clock_period2 / 2;
    }
    else {
        min_logical_clock_period = def_ptr->clock_period1;
        max_logical_clock_period = def_ptr->clock_period2;
    }

    break;
case EXT2:
    source_reg = EXT1_REG_VALUE;

    if (lm_tmg_measure_clock(EXT1_REG_VALUE, &measured_period) == FAILURE) {
        lm_queue_message(ERROR_MSG, "Timing Generator error: measure clock");
        return(FAILURE);
    }

    temp = measured_period * pattern_unit_count;

    if ((has_store_DNRZ_pins == TRUE) &&
                (has_store_R1_or_RZ_pins == FALSE))
        temp = temp * 2;

    if (temp < def_ptr->clock_period1 -
        def_ptr->clock_period1 * MAX_PERCENT_TOLERANCE / 100) {
        lm_queue_message(ERROR_MSG, "the external clock frequency measured (%0.2f MHz) cannot satisfy the maximum device_speed requirement (%
0.2f MHz)",
                        (double)1000000.0 / (double)measured_period,
                        (double)1000000.0 / (double)def_ptr->clock_period1);
        return(FAILURE);
    }

    if (temp > def_ptr->clock_period2 +
        def_ptr->clock_period2 * MAX_PERCENT_TOLERANCE / 100) {
        lm_queue_message(ERROR_MSG, "the external clock frequency measured (%0.2f MHz) cannot satisfy the minimum device_speed requirement (%
0.2f MHz)",
                        (double)1000000.0 / (double)measured_period,
                        (double)1000000.0 / (double)def_ptr->clock_period2);
        return(FAILURE);
```

Copyright 1989
Logic Modeling Systems

SOURCE PROGRAM lm1000/edgepl.c

DATE 5/23/89 TIME 6:14:35 pm

PAGE # 3/5

LINE # SOURCE TEXT

```
        }

        def_ptr->clock_period1 = temp;
        def_ptr->clock_period2 = temp;

        if ((has_store_DNRZ_pins == TRUE) &&
                        (has_store_R1_or_RZ_pins == FALSE)) {
           min_logical_clock_period = def_ptr->clock_period1 / 2;
           max_logical_clock_period = def_ptr->clock_period2 / 2;
        }
        else {
           min_logical_clock_period = def_ptr->clock_period1;
           max_logical_clock_period = def_ptr->clock_period2;
        }


        break;
     default:
        lm_queue_message(ERROR_MSG, "internal error: unknown clock type");
        return(FAILURE);
     }

     /* Relax the frequency range by 1 % */
/*    min_logical_clock_period -= min_logical_clock_period / 100; */

     DPRINTF(("xedge_skew_time: %d\n", def_ptr->edge_skew_time));

     /* Calculate HOLD time */
     if (def_ptr->hold_time == -1)
        hold_time = 25000;
     else
        hold_time = def_ptr->hold_time;

     user_hold_time = hold_time;

     DPRINTF(("xraw_hold_time: %d\n", hold_time));

     hold_time += def_ptr->edge_skew_time;

     if (all_io_store_pins_are_hard_driven == TRUE)
        hold_time += def_ptr->hd_settling_time;
     else
        hold_time += def_ptr->md_settling_time;

     DPRINTF(("xneeded_hold_time: %d\n", hold_time));

     /* Calculate SETUP time */
     if (def_ptr->setup_time == -1)
        setup_time = 50000;
     else
        setup_time = def_ptr->setup_time;

     user_setup_time = setup_time;

     DPRINTF(("xraw_setup_time: %d\n", setup_time));

     setup_time += def_ptr->edge_skew_time;

     if (all_io_data_pins_are_hard_driven == TRUE)
        setup_time += def_ptr->hd_settling_time;
     else
        setup_time += def_ptr->md_settling_time;

     if (def_ptr->device_type == PUBLIC) {
        if (any_hard_driven_io_pins == TRUE) {
           /* ULTRA FAST */
           if (has_io_store_pins == TRUE) {
              if (setup_time < HDOFF_OFFSET + HDOFF_TO_STORE_OFFSET) {
                 setup_time = HDOFF_OFFSET + HDOFF_TO_STORE_OFFSET;
              }
              if ((hold_time > HDOFF_HOLD_TIME_THRESHOLD) ||
                  (max_logical_clock_period > HDOFF_PERIOD_THRESHOLD) ||
                  (hold_time + setup_time > HDOFF_PERIOD_THRESHOLD))
                 put_hdoff_edge_after_store_edge = TRUE;
           }
           else {
              if (setup_time < HDOFF_OFFSET)
                 setup_time = HDOFF_OFFSET;
           }
        }
     }

     DPRINTF(("xneeded_setup_time: %d\n", setup_time));

     if (min_logical_clock_period <
              MIN_MODELER_CLOCK_PERIOD * pattern_unit_count) {
        min_logical_clock_period = MIN_MODELER_CLOCK_PERIOD * pattern_unit_count;
     }

     if (def_ptr->clock_type == INTERNAL) {
        /* Get the actual clock period achieveable by the Timing Generator and
         * also the clock jitter error.
         */
        if (lm_tmg_get_frequency_setting(min_logical_clock_period /
                                                  pattern_unit_count,
                                         &physical_clock_period,
                                         &clock_jitter_error,
                                         &n_reg,
                                         &k_reg,
                                         &source_reg) == FAILURE) {
           lm_queue_message(ERROR_MSG, "Timing Generator error: get frequency");
           return(FAILURE);
        }
     }
     else {
        /* External clock --> clock jitter = 1% of period */
        clock_jitter_error = measured_period / 100;
        n_reg = 0;
        k_reg = 0;
        physical_clock_period = measured_period;
     }

     logical_clock_period = physical_clock_period * pattern_unit_count;

     if (lm_tmg_get_quantization_and_jitter_error(logical_clock_period,
                                   &quantization_error,
                                   &edge_jitter_error) == FAILURE) {
        lm_queue_message(ERROR_MSG, "Timing Generator error: get quantization error");
        return(FAILURE);
     }
```

Copyright 1989
Logic Modeling Systems

LINE # SOURCE TEXT

```
    if (lm_tmg_get_dead_time(logical_clock_period,
                             &start_dead_time,
                             &end_dead_time) == FAILURE) {
       lm_queue_message(ERROR_MSG, "Timing Generator error: get dead time");
       return(FAILURE);
    }

    if (start_dead_time < MAGIC_OUTPUT_DEAD_TIME)
       start_dead_time = MAGIC_OUTPUT_DEAD_TIME;

   /* The Timing Generator can only generate edges on the first 8 PCLK
    * periods o the logical clock period. If the number of pattern units
    * per lane is greated than 8, then consider the remaining PCLK periods
    * as end dead time in the edge time calculation.
    */
   if (pattern_unit_count > 8) {
      end_dead_time += (pattern_unit_count - 8) * physical_clock_period;
   }

   if (def_ptr->device_type == PRIVATE) {
      /* If PRIVATE mode, then increase the dead time by half of the clock
       * period to reserve place to put the DOFF edge.
       */
      actual_end_dead_time = end_dead_time;
      end_dead_time += PRIVATE_PATTERN_PERIOD / 2;
   }
   else {
      /* For PUBLIC device, increase the dead time by STORE_TO_HDOFF_OFFSET
       * if put_hdoff_edge_after_store_edge flag is TRUE.
       */
      if (put_hdoff_edge_after_store_edge == TRUE) {
         actual_end_dead_time = end_dead_time;
         end_dead_time += STORE_TO_HDOFF_OFFSET + quantization_error +
                                                  2 * edge_jitter_error;
      }
   }

   if (lm_tmg_get_sample_ramp_dead_time(logical_clock_period,
                                        (u_long)EDGE7SAMPLETRIGGERMODE,
                                        &sample_min_delay,
                                        &sample_jitter_error) == FAILURE) {
      lm_queue_message(ERROR_MSG, "Timing Generator error: get sample ramp dead time");
      return(FAILURE);
   }

   if (lm_tmg_get_sample_ramp_dead_time(logical_clock_period,
                              (u_long)EARLYSAMPLETRIGGERMODE,
                              &early_sample_min_delay,
                              &early_sample_jitter_error) == FAILURE) {
      lm_queue_message(ERROR_MSG, "Timing Generator error: get sample ramp dead time");
      return(FAILURE);
   }

   max_modeler_logical_clock_period =
               MAX_MODELER_CLOCK_PERIOD * pattern_unit_count;

   DPRINTF(("clock jitter error: %d\n", clock_jitter_error));

   while ((ret = calculate_edge_times(def_ptr,
               logical_clock_period,
               sample_min_delay, sample_jitter_error,
               early_sample_min_delay,
               edge_jitter_error, quantization_error,
               start_dead_time, end_dead_time + clock_jitter_error,
               hold_time + quantization_error + clock_jitter_error +
                                           2 * edge_jitter_error,
               setup_time + quantization_error + 2 * edge_jitter_error,
               &extra_time_needed,
               &sample_edge_time1,
               &sample_edge_time2,
               &data_edge_time,
               &store_edge_time)) != FINISHED) {

      if (ret == FAILURE)
         return(FAILURE);

      /* Return FAILURE if calculate_edge_times() returns NOT FINISHED */
      if (def_ptr->clock_type != INTERNAL) {
         lm_queue_message(ERROR_MSG, "the external clock period is too short to meet the setup and hold requirements");
         return(FAILURE);
      }

      /* Save guard to avoid infinite loop */
      ++loop_count;
      if (loop_count == 10) {
         lm_queue_message(ERROR_MSG, "internal error: cannot place edges in 10 iterations");
         return(FAILURE);
      }

      logical_clock_period += extra_time_needed;

      if (logical_clock_period > max_modeler_logical_clock_period) {
         lm_queue_message(ERROR_MSG, "this device requires clock period greater than maximum modeler clock period (%d ns)",
                          max_modeler_logical_clock_period);
         return(FAILURE);
      }

      /* Note: different clock period might have different end_dead_time and
       *       start_dead_time because we might have to switch to different
       *       edge ramp.
       */
      if (lm_tmg_get_frequency_setting(logical_clock_period /
                                              pattern_unit_count,
                                       &physical_clock_period,
                                       &clock_jitter_error,
                                       &m_reg,
                                       &k_reg,
                                       &source_reg) == FAILURE) {
         lm_queue_message(ERROR_MSG, "Timing Generator error: get frequency"),
         return(FAILURE);
      }

      DPRINTF(("clock jitter error: %d\n", clock_jitter_error));

      logical_clock_period = physical_clock_period * pattern_unit_count;

      if (lm_tmg_get_quantization_and_jitter_error(logical_clock_period,
                                       &quantization_error,
                                       &edge_jitter_error) == FAILURE) {
```

Copyright 1989 Logic Modeling Systems

SOURCE PROGRAM lm1000/edgepl.c | DATE 5/23/89 | TIME 6:14:35 pm | PAGE # 5/7

LINE # SOURCE TEXT

```
        lm_queue_message(ERROR_MSG, "Timing Generator error: get quantization error");
        return(FAILURE);
    }

    if (lm_tmg_get_dead_time(logical_clock_period,
                             &start_dead_time,
                             &end_dead_time) == FAILURE) {
        lm_queue_message(ERROR_MSG, "Timing Generator error: get dead time");
        return(FAILURE);
    }

    if (pattern_unit_count > 8) {
        end_dead_time += (pattern_unit_count - 8) * physical_clock_period;
    }

    if (def_ptr->device_type == PRIVATE) {
        /* If PRIVATE mode, then increase the dead time by half of the clock
         * period to reserve place to put the DOFF edge.
         */
        actual_end_dead_time = end_dead_time;
        end_dead_time += PRIVATE_PATTERN_PERIOD / 2;
    }
    else {
        /* For PUBLIC device, increase the dead time by STORE_TO_HDOFF_OFFSET
         * if put_hdoff_edge_after_store_edge flag is TRUE.
         */
        if (put_hdoff_edge_after_store_edge == TRUE) {
            actual_end_dead_time = end_dead_time;
            end_dead_time += STORE_TO_HDOFF_OFFSET + quantization_error +
                                                     2 * edge_jitter_error;
        }
    }

    if (start_dead_time < MAGIC_OUTPUT_DEAD_TIME)
        start_dead_time = MAGIC_OUTPUT_DEAD_TIME;

    if (lm_tmg_get_sample_ramp_dead_time(logical_clock_period,
                                         (u_long)EDGE7SAMPLETRIGGERMODE,
                                         &sample_min_delay,
                                         &sample_jitter_error) == FAILURE) {
        lm_queue_message(ERROR_MSG, "Timing Generator error: get sample ramp dead time");
        return(FAILURE);
    }

    if (lm_tmg_get_sample_ramp_dead_time(logical_clock_period,
                                (u_long)EARLYSAMPLETRIGGERMODE,
                                &early_sample_min_delay,
                                &early_sample_jitter_error) == FAILURE) {
        lm_queue_message(ERROR_MSG, "Timing Generator error: get sample ramp dead time");
        return(FAILURE);
    }
}

if (def_ptr->device_type == PUBLIC) {
    if (any_hard_driven_io_pins == TRUE) {
        /* Ultra Fast mode has DOFF edge HDOFF_OFFSET after data_edge_time */
        hdoff_edge_time = data_edge_time + HDOFF_OFFSET +
            quantization_error + 2 * edge_jitter_error;
    }
    else {
        /* Non Ultra Fast mode has DOFF edge at store_edge_time */
        hdoff_edge_time = store_edge_time -
            quantization_error - 2 * edge_jitter_error;
    }
    if (put_hdoff_edge_afte _store_edge == TRUE) {
        hdoff_edge_time2 = logical_clock_period - actual_end_dead_time;
    }
    else {
        hdoff_edge_time2 = hdoff_edge_time;
    }
}
else {
    hdoff_edge_time = logical_clock_period - actual_end_dead_time;
}

/* It's OK to exceed the specified period by 1 %. This is necessary
 * because the TMG can only return frequency with 1 % tolerance.
 */
max_logical_clock_period += max_logical_clock_period / 100;

if (logical_clock_period > max_logical_clock_period) {

    /* Adjust the logical_clock_period reported back to the user
     * if necessary.
     */
    if ((has_store_DNRZ_pins == TRUE) && (has_store_R1_or_RZ_pins == FALSE))
        xlogical_clock_period = logical_clock_period * 2;
    else
        xlogical_clock_period = logical_clock_period;

    if ((user_setup_time != 0) && (user_hold_time != 0)) {
        lm_queue_message(WARNING_MSG, "device_name: %s being modeled with a device_speed of %0.2f MHz to guarantee %d ns setup time and %d ns
         hold time; to increase the effective device_speed you must specify a smaller device_setup_time and/or a smaller device_hold_time.",
                         def_ptr->device_name,
                         (double)1000000.0 / (double)xlogical_clock_period,
                         user_setup_time / 1000,
                         user_hold_time / 1000);
    }
    else if ((user_setup_time != 0) && (user_hold_time == 0)) {
        lm_queue_message(WARNING_MSG, "device_name: %s being modeled with a device_speed of %0.2f MHz to guarantee %d ns setup time and %d ns
         hold time; to increase the effective device_speed you must specify a smaller device_setup_time.",
                         def_ptr->device_name,
                         (double)1000000.0 / (double)xlogical_clock_period,
                         user_setup_time / 1000,
                         user_hold_time / 1000);
    }
    else if ((user_setup_time == 0) && (user_hold_time != 0)) {
        lm_queue_message(WARNING_MSG, "device_name: %s being modeled with a device_speed of %0.2f MHz to guarantee %d ns setup time and %d ns
         hold time; to increase the effective device_speed you must specify a smaller device_hold_time.",
                         def_ptr->device_name,
                         (double)1000000.0 / (double)xlogical_clock_period,
                         user_setup_time / 1000,
                         user_hold_time / 1000);
    }
    else if ((user_setup_time == 0) && (user_hold_time == 0)) {
        lm_queue_message(WARNING_MSG, "device_name: %s being modeled with a device_speed of %0.2f MHz to guarantee %d ns setup time and %d ns
         hold time.",
                         def_ptr->device_name,
                         (double)1000000.0 / (double)xlogical_clock_period,
                         user_setup_time / 1000,
```

Copyright 1989 Logic Modeling Systems

SOURCE PROGRAM lm1000/edgepl.c | DATE 5/23/89 | TIME 6:14:35 pm | PAGE # 6/8

LINE # SOURCE TEXT

```
                              user_hold_time / 1000);
      }
   }

   extra_def_ptr->actual_phy_clock_period    = physical_clock_period;
   extra_def_ptr->logical_clock_period       = logical_clock_period;
   extra_def_ptr->sample_edge_time1          = sample_edge_time1;
   extra_def_ptr->sample_edge_time2          = sample_edge_time2;
   extra_def_ptr->data_edge_time             = data_edge_time;
   extra_def_ptr->hdoff_edge_time            = hdoff_edge_time;
   extra_def_ptr->hdoff_edge_time2           = hdoff_edge_time2;
   extra_def_ptr->store_edge_time            = store_edge_time;
   extra_def_ptr->n_reg                      = n_reg;
   extra_def_ptr->k_reg                      = k_reg;
   extra_def_ptr->source_reg                 = source_reg;

   temp = extra_def_ptr->store_edge_time -
      extra_def_ptr->logical_clock_period * def_ptr_def_duty_cycle / 100;

   if ((long)temp < (long)start_dead_time) {
      temp = start_dead_time;
   }

   extra_def_ptr->non_significant_store_edge_time = temp;

   /* Make sure that the hdoff edge is in the clock period */
   if (def_ptr->device_type == PUBLIC) {
      if (hdoff_edge_time > store_edge_time) {
/*         hdoff_edge_time = store_edge_time; */
         lm_queue_message(ERROR_MSG, "internal error: HDOFF time > store time");
         return(FAILURE);
      }
   }

   edge_times[0] = hdoff_edge_time;
   edge_times[1] = temp;
   edge_times[2] = data_edge_time;
   edge_times[3] = store_edge_time;
   edge_times[4] = temp;
   edge_times[5] = hdoff_edge_time2;

   other_edge_time = temp;

   center_time = temp + (store_edge_time - temp) / 2;

   /* When using early sample for R1 or RZ clock, we don't want to
    * search for the edge all the way back to the min threshold of the
    * sample ramp because we might miss the pulse. This is due to the
    * fact that the sample ramp is started before PCLK. So we will only
    * search back to the center of the pulse.
    * This is not a problem with the late sample because the minimum
    * threshold of the sample ramp will be just before the significant
    * edge of the R1/RZ clock.
    */
   if (extra_def_ptr->store_event_mode == EARLYSAMPLETRIGGERMODE) {

      if (lm_tmg_get_early_sample_thres(RESOLUTION_05_NS, other_edge_time,
                                        &threshold1) == FAILURE) {
         lm_queue_message(ERROR_MSG, "internal error: R1/RZ changes after the fastest sample ramp");
         return(FAILURE);
      }
      if (lm_tmg_get_early_sample_thres(RESOLUTION_05_NS, center_time,
                                        &threshold2) == FAILURE) {
         lm_queue_message(ERROR_MSG, "internal error: R1/RZ changes after the fastest sample ramp");
         return(FAILURE);
      }
      if (lm_tmg_get_early_sample_thres(RESOLUTION_05_NS, store_edge_time,
                                        &threshold3) == FAILURE) {
         lm_queue_message(ERROR_MSG, "internal error: R1/RZ changes after the fastest sample ramp");
         return(FAILURE);
      }

      DPRINTF(("leading center trailing: %d %d %d --> %d %d %d\n",
               other_edge_time, center_time, store_edge_time,
               threshold1, threshold2, threshold3));

      if (threshold1 >= threshold2) {
         lm_queue_message(ERROR_MSG, "internal error: center of pulse coincides with the leading edge of R1/RZ clock");
         return(FAILURE);
      }
      if (threshold2 >= threshold3 - THRESHOLD_FUDGE_FACTOR) {
         lm_queue_message(ERROR_MSG, "internal error: center of pulse coincides with the trailing edge of R1/RZ clock");
         return(FAILURE);
      }

      extra_def_ptr->r1_or_rz_min_threshold = threshold2;
      DPRINTF(("min threshold for R1 or RZ clock: %d\n", threshold2));
   }

   if (lm_tmg_get_edge_setting(logical_clock_period, edge_times,
                               extra_def_ptr->edge_setting) == FAILURE) {
      lm_queue_message(ERROR_MSG, "Timing Generator error: get edge setting");
      return(FAILURE);
   }

   if (extra_def_ptr->eval_event_mode == EARLYSAMPLETRIGGERMODE) {
      extra_def_ptr->edge_setting[6] = 255;
   }
   else {
      if (lm_tmg_get_sample_setting(logical_clock_period,
                                    sample_edge_time1,
                                    &extra_def_ptr->edge_setting[6]) == FAILURE) {
         lm_queue_message(ERROR_MSG, "Timing Generator error: get sample setting");
         return(FAILURE);
      }
   }

   if (extra_def_ptr->store_event_mode == EARLYSAMPLETRIGGERMODE) {
      extra_def_ptr->edge_setting[7] = 255;
   }
   else {
      if (lm_tmg_get_sample_setting(logical_clock_period,
                                    sample_edge_time2,
                                    &extra_def_ptr->edge_setting[7]) == FAILURE) {
         lm_queue_message(ERROR_MSG, "Timing Generator error: get sample setting");
         return(FAILURE);
      }
   }

   extra_def_ptr->edge_setting[8] = extra_def_ptr->edge_setting[6];
```

Copyright 1989
Logic Modeling Systems

| SOURCE PROGRAM | DATE 5/23/89 | PAGE # |
|---|---|---|
| lm1000/edgepl.c | TIME 6:14:35 pm | 7/9 |

LINE # SOURCE TEXT

```
    /* Set HDOFF edge to max(data_threshold + 1, threshold(datatime + 15)) */
    if (extra_def_ptr->edge_setting[0] < extra_def_ptr->edge_setting[2] + 1) {
       extra_def_ptr->edge_setting[0] = extra_def_ptr->edge_setting[2] + 1;
       extra_def_ptr->edge_setting[5] = extra_def_ptr->edge_setting[2] + 1;
    }

    /* Make sure data edge and store edge are in different bucket. */
    if (extra_def_ptr->edge_setting[2] == extra_def_ptr->edge_setting[3]) {
       lm_queue_message(ERROR_MSG, "internal error: same threshold for data edge and store edge");
       return(FAILURE);
    }

    /* Set the FALLING SAMPLE reg */
    if (def_ptr->five_state_sample == 0) {
       /* The user has not specified the five state sample in DABDEF,
        * use the greater of (2*logical_clock_period) or 1.6 us.
        * The 1.6 us sample time is OK whether or not we are doing
        * timing measurement.
        */
       if (any_small_soft_driver(def_ptr) == TRUE) {
          minimum_fall_sample_time = DEFAULT_FALL_SAMPLE_TIME2;
       }
       else {
          minimum_fall_sample_time = DEFAULT_FALL_SAMPLE_TIME;
       }

       if (2 * logical_clock_period > minimum_fall_sample_time) {

          /* Add 1 logical clock period to the sample time because
           * the sample time is reference to the beginning of the last ptrn.
           */
          if (lm_tmg_get_falling_sample_setting(physical_clock_period,
                      (u_long)(3 * logical_clock_period),
                                        &temp) != SUCCESS) {
             lm_queue_message(ERROR_MSG, "Timing Generator error: get falling sample setting");
             return(FAILURE);
          }

          DPRINTF(("falling sample --> physical_clock_period: %d, delay: %d, setting: %d\n",
                physical_clock_period, 3 * logical_clock_period, temp));
       }
       else {

          /* Add 1 logical clock period to the sample time because
           * the sample time is reference to the beginning of the last ptrn.
           */
          minimum_fall_sample_time += logical_clock_period;
          if (lm_tmg_get_falling_sample_setting(physical_clock_period,
                                              minimum_fall_sample_time,
                                              &temp) != SUCCESS) {
             lm_queue_message(ERROR_MSG, "Timing Generator error: get falling sample setting");
             return(FAILURE);
          }

          DPRINTF(("falling sample --> physical_clock_period: %d, delay: %d, setting: %d\n",
                   physical_clock_period, minimum_fall_sample_time, temp));
       }
    }
    else {
       /* We are going to do timing measurement.
        * The rising sample will be set at 255 * RESOLUTION_40_NS = 1000 ns.
        * So the earliest time that the falling sample can happen is
        * 1000 ns + MIN_SAMPLE_PULSE_WIDTH  --> 1600 ns.
        */
       if (def_ptr->five_state_sample <
          MAX_SAMPLE_TIME_RANGE + MIN_SAMPLE_PULSE_WIDTH) {
          lm_queue_message(ERROR_MSG, "default_sample_time value too small; minimum value: %d ns",
                  (MAX_SAMPLE_TIME_RANGE + MIN_SAMPLE_PULSE_WIDTH) / 1000);
          return(FAILURE);
       }

       /* Add 1 logical clock period to the sample time because
        * the sample time is reference to the beginning of the last ptrn.
        */
       if (lm_tmg_get_falling_sample_setting(physical_clock_period,
                          def_ptr->five_state_sample + logical_clock_period,
                                         &temp) != SUCCESS) {
          lm_queue_message(ERROR_MSG, "Timing Generator error: get falling sample setting");
          return(FAILURE);
       }

       DPRINTF(("falling sample --> physical_clock_period: %d, delay: %d, setting: %d\n",
             physical_clock_period,
             def_ptr->five_state_sample + logical_clock_period, temp));
    }

    extra_def_ptr->falling_sample_reg = temp;

    DPRINTF(("xmax_logical_period     : %d\n", max_logical_clock_period));
    DPRINTF(("xmin_logical_period     : %d\n", min_logical_clock_period));
    DPRINTF(("xlogical_clk_period     : %d\n", logical_clock_period));
    DPRINTF(("xactual_phy_clk_period  : %d\n", physical_clock_period));
    DPRINTF(("xsample_edge_eval       : %d\n", sample_edge_time1));
    DPRINTF(("xsample_edge_store      : %d\n", sample_edge_time2));
    DPRINTF(("xdata_edge              : %d\n", data_edge_time));
    DPRINTF(("xhdoff_edge             : %d\n", hdoff_edge_time));
    DPRINTF(("xhdoff_edge2            : %d\n", hdoff_edge_time2));
    DPRINTF(("xstore_edge             : %d\n", store_edge_t[illegible]));
    DPRINTF(("xother_edge             : %d\n", other_edge_time));
    DPRINTF(("xstart_dead_time        : %d\n", start_dead_time));
    DPRINTF(("xend_dead_time          : %d\n", end_dead_time));
    DPRINTF(("xsample_min_delay       : %d\n", sample_min_delay));
    DPRINTF(("xsample_jitter_error    : %d\n", sample_jitter_error));
    DPRINTF(("early_smpl_min_delay    : %d\n", early_sample_min_delay));
    DPRINTF(("early_smpl_jitter_error: %d\n", early_sample_jitter_error));
    DPRINTF(("xedge_jitter_error      : %d\n", edge_jitter_error));
    DPRINTF(("xhold_time              : %d\n", data_edge_time +
                                       logical_clock_period - store_edge_time));
    DPRINTF(("xsetup_time             : %d\n",
                                       store_edge_time - data_edge_time));
    DPRINTF(("xquantization_error     : %d\n", quantization_error));
    DPRINTF(("xclock_jitter_error     : %d\n", clock_jitter_error));
    DPRINTF(("xN_reg                  : %d\n", n_reg));
    DPRINTF(("xK_reg                  : %d\n", k_reg));
    DPRINTF(("xSource_reg             : %d\n", source_reg));
    DPRINTF(("xEdge_0_setting         : %d\n", extra_def_ptr->edge_setting[0]));
    DPRINTF(("xEdge_1_setting         : %d\n", extra_def_ptr->edge_setting[1]));
    DPRINTF(("xEdge_2_setting         : %d\n", extra_def_ptr->edge_setting[2]));
    DPRINTF(("xEdge_3_setting         : %d\n", extra_def_ptr->edge_setting[3]));
```

Copyright 1989 Logic Modeling Systems

| SOURCE PROGRAM | DATE | PAGE # |
|---|---|---|
| lm1000/edgepl.c | 5/23/89 | 8/10 |
| | TIME 6:14:35 pm | |

LINE # SOURCE TEXT

```
    DPRINTF(("xEdge_4_setting          : %d\n", extra_def_ptr->edge_setting[4]));
    DPRINTF(("xEdge_5_setting          : %d\n", extra_def_ptr->edge_setting[5]));
    DPRINTF(("xEdge_6_setting          : %d\n", extra_def_ptr->edge_setting[6]));
    DPRINTF(("xEdge_7_setting          : %d\n", extra_def_ptr->edge_setting[7]));
    DPRINTF(("xfalling_sample_setting: %d\n",
                                        extra_def_ptr->falling_sample_reg));
    DPRINTF(("exiting place_edges\n"));
    return(SUCCESS);
}


calculate_edge_times(def_ptr,
                         clock_period,
                         sample_min_delay, sample_jitter_error,
                         early_sample_min_delay,
                         edge_jitter_error, quantization_error,
                         start_pclk_dead_time, end_pclk_dead_time,
                         hold_time, setup_time,
                         extra_time_needed,
                         sample_edge_time1, sample_edge_time2,
                         data_edge_time, store_edge_time)
DEVICE_SPEC *def_ptr;
u_long        clock_period;
u_long        sample_min_delay;
u_long        sample_jitter_error;
u_long        early_sample_min_delay;
u_long        edge_jitter_error;
u_long        quantization_error;
u_long        start_pclk_dead_time;
u_long        end_pclk_dead_time;
u_long        hold_time;
u_long        setup_time;
u_long       *extra_time_needed;
u_long       *sample_edge_time1;
u_long       *sample_edge_time2;
u_long       *data_edge_time;
u_long       *store_edge_time;
{
   EXTRA_DEVICE_SPEC  *extra_def_ptr;
   long                store_edge;
   long                data_edge;
   long                current_setup_time;
   u_long              sample_ramp_dead_time;
   u_long              edge7_sample_ramp_dead_time;

   DPRINTF(("inside calculate_edge_times\n"));
   DPRINTF(("clock_period                  : %d\n", clock_period));
   DPRINTF(("sample_min_delay              : %d\n", sample_min_delay));
   DPRINTF(("sample_jitter_error           : %d\n", sample_jitter_error));
   DPRINTF(("early_sample_min_delay        : %d\n", early_sample_min_delay));
   DPRINTF(("edge_jitter_error             : %d\n", edge_jitter_error));
   DPRINTF(("quantization_error            : %d\n", quantization_error));
   DPRINTF(("start_pclk_dead_time          : %d\n", start_pclk_dead_time));
   DPRINTF(("end_pclk_dead_time            : %d\n", end_pclk_dead_time));
   DPRINTF(("hold_time                     : %d\n", hold_time));
   DPRINTF(("setup_time                    : %d\n", setup_time));

   extra_def_ptr = (EXTRA_DEVICE_SPEC *)def_ptr->extra_data;

   edge7_sample_ramp_dead_time = sample_min_delay + sample_jitter_error +
                                 edge_jitter_error + quantization_error;

   if (early_sample_min_delay < sample_min_delay) {
      /* use EARLY SAMPLE mode */
      sample_ramp_dead_time = early_sample_min_delay;
   }
   else {
      /* use EDGE 7 SAMPLE mode */
      sample_ramp_dead_time = sample_min_delay + sample_jitter_error +
                              edge_jitter_error + quantization_error;
   }

   if (extra_def_ptr->has_io_store == TRUE) {
      /* IO store pin can change to 1 at PCLK time, so the hold time
       * has to be satisfied before the next PCLK.
       */

      store_edge = - hold_time;

      if (store_edge > - (long)end_pclk_dead_time)
         store_edge = - end_pclk_dead_time;

      if (start_pclk_dead_time < sample_ramp_dead_time)
         data_edge = sample_ramp_dead_time;
      else
         data_edge = start_pclk_dead_time;
   }
   else {
      /* Does NOT have I/O store */
      store_edge = -end_pclk_dead_time;

      data_edge = store_edge + hold_time;

      if (start_pclk_dead_time < sample_ramp_dead_time) {
         /* sample_ramp_dead_time is the limiting factor */
         if (data_edge < (long)sample_ramp_dead_time)
            data_edge = sample_ramp_dead_time;
      }
      else {
         /* start_pclk_dead_time is the limiting factor */
         if (data_edge < (long)start_pclk_dead_time)
            data_edge = start_pclk_dead_time;
      }
   }

   *store_edge_time = clock_period + store_edge;
   *data_edge_time = data_edge;

   *sample_edge_time1 = sample_min_delay;
   *sample_edge_time2 = sample_min_delay;

   if (*data_edge_time >= edge7_sample_ramp_dead_time) {
      /* Use EDGE7 SAMPLE for EVAL event */
      extra_def_ptr->eval_event_mode = EDGE7SAMPLETRIGGERMODE;
      *sample_edge_time1 = *data_edge_time -
         (sample_jitter_error + edge_jitter_error + quantization_error);
      DPRINTF(("use edge7 sample for EVAL event\n"));
   }
   else {
      /* Use EARLY SAMPLE for EVAL event */
```

Copyright 1989 Logic Modeling Systems

SOURCE PROGRAM lm1000/edgepl.c

DATE 5/23/89 TIME 6:14:35 pm

LINE # SOURCE TEXT

```
        extra_def_ptr->eval_event_mode = EARLYSAMPLETRIGGERMODE;
        DPRINTF(("use early sample for EVAL event\n"));
    }

    if (*store_edge_time >= edge7_sample_ramp_dead_time) {
        /* Use EDGE7 SAMPLE for STORE event */
        extra_def_ptr->store_event_mode = EDGE7SAMPLETRIGGERMODE;
        *sample_edge_time2 = *store_edge_time -
            (sample_jitter_error + edge_jitter_error + quantization_error);
        DPRINTF(("use edge7 sample for STORE event\n"));
    }
    else {
        /* Use EARLY SAMPLE for STORE event */
        extra_def_ptr->store_event_mode = EARLYSAMPLETRIGGERMODE;
        DPRINTF(("use early sample for STORE event\n"));
    }

    current_setup_time = *store_edge_time - *data_edge_time;

    DPRINTF(("store edge time             : %d\n", *store_edge_time));
    DPRINTF(("data edge time2             : %d\n", *data_edge_time));
    DPRINTF(("sample edge time1 (eval)  : %d\n", *sample_edge_time1));
    DPRINTF(("sample edge time2 (store): %d\n", *sample_edge_time2));

    if (current_setup_time < (long)setup_time) {
        *extra_time_needed = setup_time - current_setup_time;
        DPRINTF(("extra time                  : %d\n", *extra_time_needed));
        return(NOT_FINISHED);
    }

    return(FINISHED);
}

any_small_soft_driver(def_ptr)
DEVICE_SPEC *def_ptr;
{
    /* If only the weakest soft drive high or low is on then return TRUE */

    PIN_SPEC     *pin_spec_ptr;
    u_short       pin_count;
    u_short       pinno;

    pin_count = def_ptr->pin_cnt;
    pin_spec_ptr = &def_ptr->pin_table[0];
    for (pinno = 0; pinno < pin_count; ++pinno) {
        if (pin_spec_ptr->direction != IO) {
            ++pin_spec_ptr;
            continue;
        }

        if ((pin_spec_ptr->s_drive_low == 1) ||
            (pin_spec_ptr->s_drive_hi == 1))
            return(TRUE);

        ++pin_spec_ptr;
    }

    return(FALSE);
}
```

Copyright 1989
Logic Modeling Systems

SOURCE PROGRAM lm1000/fault.c

DATE 5/23/89 TIME 6:14:37 pm PAGE # 1/12

LINE # SOURCE TEXT

```
/* SCCS_ID: fault.c rev 3.1, 4/24/89 at 07:52:46     */

#include "device.h"
#include "message.h"
#include "hardware.h"
#include "eeprom.h"
#include "lmserver.h"

setup_fault_pattern(user, inst_ptr, table_index)
USER_INFO               *user;
INSTANCE_INFO           *inst_ptr;
u_short                 *table_index;
{
    DEVICE_SPEC          *def_ptr;
    DAB_INFO             *dab_ptr;
    INSTANCE_INFO        *fault_ptr;
    LANE_ADDR_INFO       *lane_info;
    u_long               *temp_inst_unit_addr;
    u_long               *temp_fault_unit_addr;
    u_short               fault_id_table_index;
    u_short               total_unit;
    u_char                laneno;
    u_char                unitno;
    u_short               prev_block_number;
    u_long                block_number;
    u_long                link_table_addr;
    u_short               next_to_last_block_number;
    u_char                temp;

    def_ptr = inst_ptr->definition;

    dab_ptr = dab_list[inst_ptr->dab_info_index];

    total_unit = dab_ptr->unit_count_per_lane * dab_ptr->lane_count;

    if (new_and_link_instance(user, def_ptr, "fault",
                              dab_ptr->unit_count,
                              &fault_id_table_index,
                              (char)inst_ptr->dab_info_index) == FAILURE) {
       lm_queue_message(ERROR_MSG, "out of memory on modeler for instance");
       return(FAILURE);
    }

    fault_ptr = user->instance[fault_id_table_index];

    fault_ptr->is_fault = TRUE;

    copy_instance_info(inst_ptr, fault_ptr);

    fault_ptr->disjoint_flag = FALSE;

    /* allocate new block in each lane and store address in VAR_SEQ_ADDR */
    for (laneno = 0; laneno < MAX_LANE_COUNT; ++laneno) {
       if (dab_ptr->lane_used[laneno]) {
          if (new_block(&fault_ptr->var_seq_addr[laneno], &temp,
                        PATTERN_BLOCK, laneno) == FAILURE) {
             fault_ptr->failed_to_alloc_ptrn = TRUE;
             lm_queue_message(ERROR_MSG, "out of Fast Pattern Memory");
             return(FAILURE);
          }
       }
    }

    if (last_pattern_spans_2_blocks(inst_ptr) == TRUE) {
       /* If the last pattern of the instance spans 2 blocks, this mea:s
        * that the last 2 blocks of the instance are NOT feedback blocks.
        * It also means that the instance has at least 2 blocks.
        */

       /* find the address of the last common block from the beginning of
        * the instance pattern sequence.
        */
       for (laneno = 0; laneno < MAX_LANE_COUNT; ++laneno) {
          if (dab_ptr->lane_used[laneno]) {

             prev_block_number = 0;
             block_number = ptob(inst_ptr->seq_start_addr[laneno]);

             link_table_addr = ptol(inst_ptr->seq_start_addr[laneno]);

             next_to_last_block_number =
                ptob(inst_ptr->lane_addr[laneno].prev_max_addr - PTRN_ADDR_INC);

             while (block_number != next_to_last_block_number) {
                prev_block_number = block_number;
                block_number = read_loc_long((u_long *)link_table_addr) &
                                                       BLOCK_NUMBER_MASK;
                link_table_addr = btol(laneno, block_number);
             }

             if (prev_block_number == 0) {
                /* There are only 2 blocks in the instance sequence; so
                 * the fault sequence has to be disjoint from the instance seq.
                 * The condition will never happen when the instance has
                 * feedback sequence, because there would be at least 4 blocks
                 * in the instance sequence:
                 *     1+ block    PREAMBLE + pre feedback seq
                 *     2+ blocks   feedback seq
                 *     2+ blocks   post feedback seq + real user pattern seq
                 *                 (at least 2 blocks because the last pattern
                 *                  spans 2 blocks)
                 *
                 * Therefore we will never have to worry about allocating
                 * feedback blocks when we are creating faults.
                 */
                fault_ptr->disjoint_flag = TRUE;

                fault_ptr->seq_start_addr[laneno] =
                               fault_ptr->var_seq_addr[laneno];

                fault_ptr->last_common_block_addr[laneno] = 0;

                fault_ptr->last_common_block_is_feedback = FALSE;
             }
             else {
                fault_ptr->seq_start_addr[laneno] =
                   inst_ptr->seq_start_addr[laneno];

                fault_ptr->last_common_block_addr[laneno] =
                   btop(laneno. prev_block_number),
```

Copyright 1989
Logic Modeling Systems

SOURCE PROGRAM lm1000/fault.c

DATE 5/23/89 TIME 6:14:37 pm PAGE # 2/13

LINE # SOURCE TEXT

```
               if (fault_ptr->last_common_block_addr[laneno] ==
                   inst_ptr->fb_block_addr[laneno]) {
                  fault_ptr->last_common_block_is_feedback = TRUE;
               }
               else {
                  fault_ptr->last_common_block_is_feedback = FALSE;
               }
            }

            /* copy patterns from the instance next to last block to the
             * fault block addressed by VAR_SEQ_ADDR.
             */
            copy_pattern(inst_ptr->lane_addr[laneno].prev_max_addr -
                         BLOCK_ADDR_INC,
                         fault_ptr->var_seq_addr[laneno],
                         PTRN_PER_BLOCK);

            lane_info = &fault_ptr->lane_addr[laneno];

            lane_info->prev_max_addr =
               fault_ptr->var_seq_addr[laneno] + BLOCK_ADDR_INC;

            if (new_block(&lane_info->max_addr,
                          &temp,
                          PATTERN_BLOCK,
                          laneno) == FAILURE) {
               lm_queue_message(ERROR_MSG, "out of Fast Pattern Memory");
               fault_ptr->failed_to_alloc_ptrn = TRUE;
               return(FAILURE);
            }

            set_branch(lane_info->prev_max_addr - PTRN_ADDR_INC,
                       lane_info->max_addr);

            lane_info->max_addr += BLOCK_ADDR_INC;

            copy_pattern(inst_ptr->lane_addr[laneno].max_addr -
                         BLOCK_ADDR_INC,
                         fault_ptr->lane_addr[laneno].max_addr -
                         BLOCK_ADDR_INC,
                         PTRN_PER_BLOCK);
         }
      }

      temp_inst_unit_addr = &inst_ptr->
                            unit_addr[inst_ptr->cur_unit_addr_index][0];

      temp_fault_unit_addr = &fault_ptr->
                             unit_addr[fault_ptr->cur_unit_addr_index][0];

      for (unitno = 0; unitno < total_unit; ++unitno) {
         laneno = dab_ptr->unit_location[unitno].lane_no;

         /* Check if the unit is in the next to last block */
         if ((temp_inst_unit_addr[unitno] >=
              (inst_ptr->lane_addr[laneno].prev_max_addr - BLOCK_ADDR_INC)) &&
             (temp_inst_unit_addr[unitno] <
              (inst_ptr->lane_addr[laneno].prev_max_addr))) {

            temp_fault_unit_addr[unitno] =
               fault_ptr->lane_addr[laneno].prev_max_addr -
                  (inst_ptr->lane_addr[laneno].prev_max_addr -
                   temp_inst_unit_addr[unitno]);
         }
         else {
            temp_fault_unit_addr[unitno] =
               fault_ptr->lane_addr[laneno].max_addr -
                  (inst_ptr->lane_addr[laneno].max_addr -
                   temp_inst_unit_addr[unitno]);
         }

         fault_ptr->first_user_ptrn_unit_addr[unitno] =
                                  temp_fault_unit_addr[unitno];

         if (dab_ptr->unit_location[unitno].last_in_lane)
            fault_ptr->lane_addr[laneno].last_unit_addr =
               temp_fault_unit_addr[unitno];

         fault_ptr->lane_addr[laneno].new_block_addr = 0;
      }
   }
   else {
      /* The last pattern of the instance is completely contained in the
       * the last instance block.
       */
      for (laneno = 0; laneno < MAX_LANE_COUNT; ++laneno) {
         if (! dab_ptr->lane_used[laneno])
            continue;

         if (inst_ptr->lane_addr[laneno].prev_max_addr == 0) {
            /* The instance only has 1 block */

            fault_ptr->disjoint_flag = TRUE;

            fault_ptr->seq_start_addr[laneno] =
               fault_ptr->var_seq_addr[laneno];

            fault_ptr->last_common_block_addr[laneno] = 0;

         }
         else {

            fault_ptr->seq_start_addr[laneno] =
               inst_ptr->seq_start_addr[laneno];

            /* If there are feedback sequence, PREV_MAX_ADDR will point
             * to the end of the feedback blocks. We want to make
             * LAST_COMMON_BLOCK_ADDR point to the beginning of the
             * feedback blocks.
             */
            if (inst_ptr->lane_addr[laneno].prev_max_addr ==
                (inst_ptr->fb_block_addr[laneno] +
                 inst_ptr->fb_block_size[laneno] * BLOCK_ADDR_INC)) {
               /* PREV_MAX_ADDR points to the end of feedback blocks */

               fault_ptr->last_common_block_addr[laneno] =
                                           inst_ptr->fb_block_addr[laneno];
```

Copyright 1989
Logic Modeling Systems

SOURCE PROGRAM lm1000/fault.c | DATE 5/23/89 | TIME 6:14:37 pm | PAGE # 3/14

LINE # SOURCE TEXT

```
                fault_ptr->last_common_block_is_feedback = TRUE;
            }
            else {

                fault_ptr->last_common_block_addr[laneno] =
                   inst_ptr->lane_addr[laneno].prev_max_addr - BLOCK_ADDR_INC;

                fault_ptr->last_common_block_is_feedback = FALSE;
            }
         }

         copy_pattern(inst_ptr->lane_addr[laneno].max_addr -
                      BLOCK_ADDR_INC,
                      fault_ptr->var_seq_addr[laneno],
                      PTRN_PER_BLOCK);

         /* This is necessary to set the SEQ_END bit */
         fault_ptr->lane_addr[laneno].prev_max_addr =
            inst_ptr->lane_addr[laneno].prev_max_addr;

         fault_ptr->lane_addr[laneno].max_addr =
            fault_ptr->var_seq_addr[laneno] + BLOCK_ADDR_INC;
      }

      temp_inst_unit_addr = &inst_ptr->
                              unit_addr[inst_ptr->cur_unit_addr_index][0];

      temp_fault_unit_addr = &fault_ptr->
                              unit_addr[fault_ptr->cur_unit_addr_index][0];

      /* Setup the unit address for the fault */
      for (unitno = 0; unitno < total_unit; ++unitno) {

         laneno = dab_ptr->unit_location[unitno].lane_no;

         temp_fault_unit_addr[unitno] =
            fault_ptr->lane_addr[laneno].max_addr -
               (inst_ptr->lane_addr[laneno].max_addr -
                temp_inst_unit_addr[unitno]);

         fault_ptr->first_user_ptrs_unit_addr[unitno] =
                                      temp_fault_unit_addr[unitno];

         if (dab_ptr->unit_location[unitno].last_in_lane)
            fault_ptr->lane_addr[laneno].last_unit_addr =
               temp_fault_unit_addr[unitno];

         fault_ptr->lane_addr[laneno].new_block_addr = 0;

      }
   }

   /* Setup the LCYCHDB and LCYCMDB address.
    * If the fault is NOT disjoint from the instance, then
    * just copy the lcychdb and lcycmdb address from the instance.
    * If the fault is disjoint from the instance, then we can see above
    * that the instance can have at most 2 blocks.
    */
   if (fault_ptr->disjoint_flag == FALSE) {
      for (unitno = 0; unitno < total_unit; ++unitno) {
         fault_ptr->lcychdb_addr[unitno] =
                           inst_ptr->lcychdb_addr[unitno];

         fault_ptr->lcycmdb_addr[unitno] =
                           inst_ptr->lcycmdb_addr[unitno];
      }
   }
   else {
      for (unitno = 0; unitno < total_unit; ++unitno) {
         laneno = dab_ptr->unit_location[unitno].lane_no;

         /* Check if the instance's lcychdb is in prev block */
         if ((inst_ptr->lcychdb_addr[unitno] >=
              (inst_ptr->lane_addr[laneno].prev_max_addr - BLOCK_ADDR_INC)) &&
             (inst_ptr->lcychdb_addr[unitno] <
              (inst_ptr->lane_addr[laneno].prev_max_addr))) {

            fault_ptr->lcychdb_addr[unitno] =
               fault_ptr->lane_addr[laneno].prev_max_addr -
                  (inst_ptr->lane_addr[laneno].prev_max_addr -
                   inst_ptr->lcychdb_addr[unitno]);
         }
         else {
            fault_ptr->lcychdb_addr[unitno] =
               fault_ptr->lane_addr[laneno].max_addr -
                  (inst_ptr->lane_addr[laneno].max_addr -
                   inst_ptr->lcychdb_addr[unitno]);
         }

         /* Check if the instance's lcycmdb is in prev block */
         if ((inst_ptr->lcycmdb_addr[unitno] >=
              (inst_ptr->lane_addr[laneno].prev_max_addr - BLOCK_ADDR_INC)) &&
             (inst_ptr->lcycmdb_addr[unitno] <
              (inst_ptr->lane_addr[laneno].prev_max_addr))) {

            fault_ptr->lcycmdb_addr[unitno] =
               fault_ptr->lane_addr[laneno].prev_max_addr -
                  (inst_ptr->lane_addr[laneno].prev_max_addr -
                   inst_ptr->lcycmdb_addr[unitno]);
         }
         else {
            fault_ptr->lcycmdb_addr[unitno] =
               fault_ptr->lane_addr[laneno].max_addr -
                  (inst_ptr->lane_addr[laneno].max_addr -
                   inst_ptr->lcycmdb_addr[unitno]);
         }
      }
   }

   *table_index = fault_id_table_index;

   return(SUCCESS);
}

modify_instance_pattern_addr(inst_ptr, common_ptrs_count,
                             pattern_count,
                             unit_addr,
                             unit_addr2,
                             max_addr,
                             prev_max_addr)
```

Copyright 1989
Logic Modeling Systems

SOURCE PROGRAM lm1000/fault.c | DATE 5/23/89 | TIME 6:14:37 pm | PAGE # 4/15

LINE # SOURCE TEXT

```
INSTANCE_INFO  *inst_ptr;
long            common_ptrs_count;
u_long         *pattern_count;
u_long          unit_addr[];
u_long          unit_addr2[];
u_long          max_addr[];
u_long          prev_max_addr[];
{
   /* This routine changes the following information from the instance which
    * which is used by setup_fault_pattern() and saves the information in
    * the temporary variables:
    *        pattern_count
    *        unit_addr[0]
    *        unit_addr[1]
    *        prev_max_addr
    *        max_addr
    */

   DAB_INFO *dab_ptr;
   u_long    max_unit_addr[MAX_LANE_COUNT];
   u_long    link_table_addr;
   u_long    prev_block_number;
   u_long    cur_block_number;
   u_long    block_number;
   u_long   *temp_unit_addr;
   u_long   *temp_unit_addr2;
   u_char    laneno;
   u_char    unitno;

   dab_ptr = dab_list[inst_ptr->dab_info_index];

   /* Save/modify pattern_count */
   *pattern_count = inst_ptr->pattern_count;
   inst_ptr->pattern_count = inst_ptr->static_pattern_count +
                             dab_ptr->unit_count_per_lane;

   /* Save instance's unit_addr and previous unit_addr */
   temp_unit_addr = &inst_ptr->unit_addr[inst_ptr->cur_unit_addr_index][0];
   temp_unit_addr2 =
      &inst_ptr->unit_addr[inst_ptr->cur_unit_addr_index + 1 & 1][0];

   for (unitno = 0; unitno < MAX_UNIT_COUNT; ++unitno) {

      unit_addr[unitno] = temp_unit_addr[unitno];
      unit_addr2[unitno] = temp_unit_addr2[unitno];

      temp_unit_addr[unitno] =
                     inst_ptr->first_user_ptrs_unit_addr[unitno];
   }

   /* Save the max_addr, prev_max_addr */
   for (laneno = 0; laneno < MAX_LANE_COUNT; ++laneno) {

      max_addr[laneno] = inst_ptr->lane_addr[laneno].max_addr;

      prev_max_addr[laneno] = inst_ptr->lane_addr[laneno].prev_max_addr;

      max_unit_addr[laneno] = 0;
   }

   while (common_ptrs_count > 0) {

      increment_unit_addr(temp_unit_addr,
                          dab_ptr->unit_count,
                          dab_p^r->unit_count_per_lane);

      inst_ptr->pattern_count += dab_ptr->unit_count_per_lane;

      --common_ptrs_count;
   }

   /* find the maximum unit_addr */
   for (unitno = 0; unitno < dab_ptr->unit_count; ++unitno) {
      laneno = dab_ptr->unit_location[unitno].lane_no;

      if (max_unit_addr[laneno] < temp_unit_addr[unitno])
         max_unit_addr[laneno] = temp_unit_addr[unitno];

   }


   /* modify the max_addr, prev_max_addr */
   for (laneno = 0; laneno < MAX_LANE_COUNT; ++laneno) {

      if (! dab_ptr->lane_used[laneno])
         continue;

      inst_ptr->lane_addr[laneno].max_addr =
         (max_unit_addr[laneno] & BLOCK_START_MASK) + BLOCK_ADDR_INC;

      /* search the block before the current block occupied by the last unit */
      prev_block_number = 0;
      block_number = ptob(inst_ptr->seq_start_addr[laneno]);

      link_table_addr = ptol(inst_ptr->seq_start_addr[laneno]);

      cur_block_number = ptob(max_unit_addr[laneno]);

      while (block_number != cur_block_number) {

         prev_block_number = block_number;

         block_number = read_loc_long((u_long *)link_table_addr) &
                                                BLOCK_NUMBER_MASK;

         link_table_addr = btol(laneno, block_number);
      }

      if (prev_block_number == 0)
         inst_ptr->lane_addr[laneno].prev_max_addr = 0;
      else {
         inst_ptr->lane_addr[laneno].prev_max_addr =
            btop(laneno, prev_block_number) + BLOCK_ADDR_INC;

         if ((inst_ptr->lane_addr[laneno].prev_max_addr - BLOCK_ADDR_INC) ==
                                         inst_ptr->fb_block_addr[laneno])
            inst_ptr->lane_addr[laneno].prev_max_addr +=
               (inst_ptr->fb_block_size[laneno] - 1) * BLOCK_ADDR_INC;
      }
   }
```

Copyright 1989
Logic Modeling Systems

| SOURCE PROGRAM | DATE | PAGE # |
|---|---|---|
| lm1000/fault.c | 5/23/89 | 5/16 |
| | TIME 6:14:37 pm | |

LINE # SOURCE TEXT

```
}

restore_instance_pattern_addr(inst_ptr,
                              pattern_count,
                              unit_addr,
                              unit_addr2,
                              max_addr,
                              prev_max_addr)
INSTANCE_INFO   *inst_ptr;
u_long          pattern_count;
u_long          unit_addr[];
u_long          unit_addr2[];
u_long          max_addr[];
u_long          prev_max_addr[];
{
   /* This routine restores the following information for the instance which
    * which was saved in the temporary variables:
    *          pattern_count
    *          unit_addr[0]
    *          unit_addr[1]
    *          prev_max_addr
    *          max_addr
    */

   u_long   *temp_unit_addr;
   u_char    laneno;
   u_char    unitno;


   /* Restore pattern count */
   inst_ptr->pattern_count = pattern_count;

   /* Restore unit_addr[0] */
   temp_unit_addr = &inst_ptr->unit_addr[inst_ptr->cur_unit_addr_index][0];
   for (unitno = 0; unitno < MAX_UNIT_COUNT; ++unitno)
      temp_unit_addr[unitno] = unit_addr[unitno];

   /* Restore unit_addr[1] */
   temp_unit_addr =
      &inst_ptr->unit_addr[inst_ptr->cur_unit_addr_index + 1 & 1][0];
   for (unitno = 0; unitno < MAX_UNIT_COUNT; ++unitno)
      temp_unit_addr[unitno] = unit_addr2[unitno];

   /* Restore max_addr and prev_max_addr */
   for (laneno = 0; laneno < MAX_LANE_COUNT; ++laneno) {
      inst_ptr->lane_addr[laneno].max_addr = max_addr[laneno];
      inst_ptr->lane_addr[laneno].prev_max_addr = prev_max_addr[laneno];
   }
}

last_pattern_spans_2_blocks(instance)
INSTANCE_INFO *instance;
{
   /* Return TRUE if the last pattern of the given instance spans over
    * the last 2 blocks of the pattern sequence, otherwise return FALSE.
    * Note that we only have the check 1 lane since the pattern grows
    * proportionately in each lane.
    */

   DAB_INFO   *dab_ptr;
   u_long      block_addr;
   u_long     *temp_unit_addr;
   u_char      laneno;
   u_char      unitno;
   u_char      total_urit;

   dab_ptr = dab_list[instance->dab_info_index];
   laneno = dab_ptr->unit_location[0].lane_no;

   total_unit = dab_ptr->unit_count_per_lane * dab_ptr->lane_count;

   temp_unit_addr = &instance->unit_addr[instance->cur_unit_addr_index][0];
   block_addr = temp_unit_addr[0] & BLOCK_START_MASK;

   for (unitno = 1; unitno < total_unit; ++unitno) {
      if (dab_ptr->unit_location[unitno].lane_no == laneno) {
         if ((temp_unit_addr[unitno] & BLOCK_START_MASK) != block_addr)
            return(TRUE);
      }
   }

   return(FALSE);
}

copy_instance_info(inst_ptr, fault_ptr)
INSTANCE_INFO *inst_ptr;
INSTANCE_INFO *fault_ptr;
{
   /* Copy the following information from the instance data structure to the
    * fault data structure:
    *          PATTERN_COUNT
    *          STATIC_PATTERN_COUNT
    *          COMMON_PATTERN_COUNT
    *          FB_BLOCK_SIZE
    *          FB_BLOCK_ADDR
    *          PTRN_LOADED
    *          ENDENB_LOADED
    *          LCYCENB_LOADED
    *          LCYCMDS_LOADED
    *          SIM_PIN_VALUE
    *          LAST_SAMPLE_VALUE
    */

   DAB_INFO    *dab_ptr;
   u_char       laneno;
   u_char       unitno;
   u_char       total_unit;

   dab_ptr = dab_list[inst_ptr->dab_info_index];

   total_unit = dab_ptr->unit_count;

   fault_ptr->pattern_count = inst_ptr->pattern_count,
   fault_ptr->static_pattern_count = inst_ptr->static_pattern_count;
   fault_ptr->common_pattern_count = inst_ptr->pattern_count;

   for (laneno = 0; laneno < MAX_LANE_COUNT; ++laneno) {
      fault_ptr->fb_block_size[laneno] = inst_ptr->fb_block_size[laneno];
      fault_ptr->fb_block_addr[laneno] = inst_ptr->fb_block_addr[laneno];
   }
```

Copyright 1989
Logic Modeling Systems

| SOURCE PROGRAM | DATE | PAGE # |
| --- | --- | --- |
| lm1000/fault.c | 5/23/89 | 6/17 |
| | TIME 6:14:37 pm | |

SOURCE TEXT

```
    for (unitno = 0; unitno < total_unit; ++unitno) {
        fault_ptr->ptrn_loaded[unitno] = inst_ptr->ptrn_loaded[unitno];
        fault_ptr->hmdenb_loaded[unitno] = inst_ptr->ptrn_loaded[unitno];
        fault_ptr->lcychdb_loaded[unitno] = inst_ptr->lcychdb_loaded[unitno];
        fault_ptr->lcycmdb_loaded[unitno] = inst_ptr->lcycmdb_loaded[unitno];

        fault_ptr->sim_pin_value.data[unitno] =
                        inst_ptr->sim_pin_value.data[unitno];
        fault_ptr->sim_pin_value.hiz[unitno] =
                        inst_ptr->sim_pin_value.hiz[unitno];
        fault_ptr->sim_pin_value.unknown[unitno] =
                        inst_ptr->sim_pin_value.unknown[unitno];
        fault_ptr->sim_pin_value.soft[unitno] =
                        inst_ptr->sim_pin_value.soft[unitno];

        fault_ptr->last_sample_value.data[unitno] =
                        inst_ptr->last_sample_value.data[unitno];
        fault_ptr->last_sample_value.hiz[unitno] =
                        inst_ptr->last_sample_value.hiz[unitno];
        fault_ptr->last_sample_value.unknown[unitno] =
                        inst_ptr->last_sample_value.unknown[unitno];
        fault_ptr->last_sample_value.soft[unitno] =
                        inst_ptr->last_sample_value.soft[unitno];
    }
}
```

Copyright 1989
Logic Modeling Systems

| SOURCE PROGRAM | DATE | PAGE # |
|---|---|---|
| lm1000/function.c | 5/23/89 | 1/18 |
| | TIME 6:14:38 pm | |

LINE # SOURCE TEXT

```
/* SCCS_ID: function.c rev 3.7, 5/9/89 at 19:06:33      */

#include "common.h"
#include "device.h"
#include "message.h"
#include "hardware.h"
#include "eeprom.h"
#include "lmserver.h"
#include "protass.h"
#include "lm_sfi.h"
#include "lnetwork.h"
#include "network.h"
#include "mod_err.h"
#include "nvaram.h"

#ifdef MODELER
#include "vrtx.h"
#endif

extern CONNECTION    *table_of_conns[ ];

/* HMBL initialization routine */
extern void lm_Hinit_vars();

#define MAX_TEMP_BUF_SIZE (3*10*1024)
#define TICKS_PER_SECOND 200

extern char *lmsi_version;

extern long calculate_pel_count();

extern u_long total_malloc_size;
extern u_long available_malloc_size;

static  u_char  modeler_is_locked = FALSE;
static  char    user_with_lock[256];

void process_begin_session_cmd(user)
USER_INFO *user;
{
   char    *temp_ptr;
   char    error_string[512];
   u_short temp;
   u_short i;
   char    c;
   version_type       sim_Version;
   version_type       cmc_Version;
   version_type       Last_Compatible_Version;

   DPRINTF(("inside process_begin_session_cmd\n"));

   reset_obuf();
   lm_put_int(BEGIN_SESSION_ANS);

   /* Version number is encoded in simulator_type */
   sim_Version.Version = lm_get_int();
   cmc_Version.Version = SOFTWARE_REVISION_NUMBER;
   Last_Compatible_Version.Version = LAST_COMPATIBLE_CMC_VERSION;

   switch (sim_Version.field.sim_type) {
   case (LM_FAULT_SIMULATOR & SIM_TYPE_MASK):
      user->is_fault_simulator = TRUE;
      break;
   case (LM_LOGIC_SIMULATOR & SIM_TYPE_MASK):
      user->is_fault_simulator = FALSE;
      break;
   default:
      lm_queue_message(ERROR_MSG, "internal simulator error: illegal simulator type");
      end_queue_message();
      end_put(user->fd);
      return;
   }

   /* Check Version Number */
   if ( (sim_Version.field.Major > cmc_Version.field.Major)
        || (sim_Version.field.Major < Last_Compatible_Version.field.Major)
        || ((sim_Version.field.Major == Last_Compatible_Version.field.Major)
         && (sim_Version.field.minor < Last_Compatible_Version.field.minor))) {
      if (sim_Version.field.Major > cmc_Version.field.Major) {
         lm_queue_message(ERROR_MSG, "Modeler is booted with Core Modeler Code that is incompatible with host application; reboot Modeler with
          most recent Core Modeler Code release");
      } else {
         lm_queue_message(ERROR_MSG, "Modeler is booted with Core Modeler Code that is incompatible with host application; reboot Modeler with
          previous Core Modeler Code release");
      }
      end_queue_message();
      end_put(user->fd);
      return;
   }

   temp_ptr = (char *)LM_GET_ADDR(lm_global_conn_ptr);
   if (strlen(temp_ptr) + 1 > MAX_STRING_LENGTH) {
      lm_queue_message(ERROR_MSG, "internal simulator error: hostname too long");
      end_queue_message();
      end_put(user->fd);
      return;
   }
   for (i = 0; (c = lm_get_char()) != '\0'; ++i)
      user->hostname[i] = c;
   user->hostname[i] = '\0';

   temp_ptr = (char *)LM_GET_ADDR(lm_global_conn_ptr);
   if (strlen(temp_ptr) + 1 > MAX_STRING_LENGTH) {
      lm_queue_message(ERROR_MSG, "internal simulator error: username too long");
      end_queue_message();
      end_put(user->fd);
      return;
   }
   for (i = 0; (c = lm_get_char()) != '\0'; ++i)
      user->username[i] = c;
   user->username[i] = '\0';

   if (modeler_is_locked == TRUE) {
      DPRINTF(("intruder: %s@%s\n", user->username, user->hostname));
      if (strcmp(user->username, user_with_lock) != 0) {
         lm_queue_message(ERROR_MSG, "modeler is currently locked by: %s",
                          user_with_lock);
         abort_user(user);
         end_queue_message();
         end_put(user->fd);
```

Copyright 1989
Logic Modeling Systems

SOURCE PROGRAM lm1000/function.c

DATE 5/23/89 TIME 6:14:38 pm PAGE # 2/19

LINE # SOURCE TEXT

```
            if (set_close_connection_for_server(lm_global_conn_ptr) != SUCCESS) {
               while (1) {
                  if (lm_dequeue_message(&temp, error_string) != FAILURE)
                     DPRINTF(("%s", error_string));
                  else
                     break;
               }
            }
            return;
         }
      }
      end_queue_message();
      end_put(user->fd);
      return;
}

void process_create_def_cmd(user)
USER_INFO   *user;
{

     DEVICE_SPEC *def_ptr;
     PIN_SPEC    *pin_ptr;
     DAB_INFO    *dab_ptr;
     char        *buffer_ptr;
     u_long       pin_count_mark;
     u_long       number;
     long         units;
     u_short      pin_count;
     u_short      actual_pin_count;
     u_short      pinno;
     u_short      def_id_table_index;
     u_short      ntym_count;
     u_short      errors;
     u_short      warnings;
     char         dab_info_index;
     int          i;
     char         c;
     DEVICE_SPEC *backend_pass();

     DPRINTF(("inside process_create_def_cmd\n"));

     reset_obuf();
     lm_put_int(CREATE_DEF_ANS);

     number = lm_get_int();
     units  = lm_get_int();

     if (set_time_scale(user, number, units) == FAILURE) {
        end_queue_message();
        end_put(user->fd);
        return;
     }

     lm_Hinit_vars("HDBL");
     buffer_ptr = LM_GET_ADDR(lm_global_conn_ptr);

     def_ptr = backend_pass(buffer_ptr);
     if (def_ptr == NULL) {
        end_queue_message();
        end_put(user->fd);
        return;
     }

     /* Convert al' devices to PUBLIC if it is fault simulator. */
     if (user->is_fault_simulator == TRUE) {
        def_ptr->device_type = PUBLIC;
     }

     adjust_delay(user, def_ptr);

     lm_message_types(&errors, &warnings);

     if (errors) {
        end_queue_message();
        end_put(user->fd);
        return;
     }

     if (new_and_link_definition(user, def_ptr,
                                &def_id_table_index) == FAILURE) {
        free_device(def_ptr);
        lm_queue_message(ERROR_MSG, "out of memory on modeler for definition");
        end_queue_message();
        end_put(user->fd);
        return;
     }

     if ((short)(dab_info_index = find_dab(dab_list, def_ptr->device_name,
                                (u_char)def_ptr->device_type)) != -1) {

        if ((long)def_ptr->pin_cnt - 1 >=
             (long)dab_list[dab_info_index]->unit_count * MAX_PIN_PER_UNIT) {
           rls_definition(user, def_id_table_index);
           lm_queue_message(ERROR_MSG, "pin number too large; device %s only has %d pins",
                    def_ptr->device_name,
                    dab_list[dab_info_index]->unit_count * MAX_PIN_PER_UNIT);
           end_queue_message();
           end_put(user->fd);
           return;
        }

        if (fill_in_extra_data(def_ptr, dab_info_index) == FAILURE) {
           rls_definition(user, def_id_table_index);
           lm_queue_message(ERROR_MSG, "out of memory on modeler for definition");
           end_queue_message();
           end_put(user->fd);
           return;
        }
     }
     else {
        rls_definition(user, def_id_table_index);
        lm_queue_message(ERROR_MSG, "device_name: %s not found or being used as PRIVATE",
                     def_ptr->device_name);

        end_queue_message();

        end_put(user->fd);
        return;
     }
```

Copyright 1989 Logic Modeling Systems

| SOURCE PROGRAM | DATE | PAGE # |
|---|---|---|
| lm1000/function.c | 5/23/89<br>TIME 6:14:38 pm | 3/20 |

LINE # SOURCE TEXT

```
    dab_ptr = dab_list[dab_info_index];

    if (place_edges(def_ptr, dab_ptr) == FAILURE) {
        rls_definition(user, def_id_table_index);
        end_queue_message();
        end_put(user->fd);
        return;
    }

    if (calc_dab_voltage(def_ptr, dab_list[dab_info_index]) == FAILURE) {
        rls_definition(user, def_id_table_index);
        end_queue_message();
        end_put(user->fd);
        return;
    }

    if (verify_soft_drive_current(def_ptr,
                                  dab_list[dab_info_index]) == FAILURE) {
        rls_definition(user, def_id_table_index);
        end_queue_message();
        end_put(user->fd);
        return;
    }

    end_queue_message();

    /* write the Definition ID */
    lm_put_short(def_id_table_index);

    lm_put_char(def_ptr->use_default);
    lm_put_char(def_ptr->report_miss);

    lm_put_int(def_ptr->default_delay.minimum);
    lm_put_int(def_ptr->default_delay.typical);
    lm_put_int(def_ptr->default_delay.maximum);

    /* Return the delay table */
    mtym_count = def_ptr->mtym_cnt;
    lm_put_int(mtym_count);
    for (i = 0; i < mtym_count; ++i) {
        lm_put_int(def_ptr->mtym_table[i].minimum);
        lm_put_int(def_ptr->mtym_table[i].typical);
        lm_put_int(def_ptr->mtym_table[i].maximum);
    }

    /* write pin count */
    pin_count_mark = LM_MARK_BUFFER(lm_global_conn_ptr);
    lm_put_int(0);

    /* write pin id's */
    actual_pin_count = 0;
    pin_count = def_ptr->pin_cnt;
    pin_ptr = def_ptr->pin_table;
    for (pinno = 0; pinno < pin_count; ++pinno) {
        if (pin_ptr->direction == NONE) {
            ++pin_ptr;
            continue;
        }

#ifdef DEBUG
        DPRINTF(("   Pin name: %15s    PN: %3d   ",
                 pin_ptr->pin_name, pinno));

        switch (pin_ptr->pin_class) {
        case DATA:
            DPRINTF(("D  "));
            break;
        case EVAL:
            DPRINTF(("E  "));
            break;
        case STORE:
            switch (pin_ptr->clk_format) {
            case DNRZ:
                DPRINTF(("S  "));
                break;
            case R1:
                DPRINTF(("R  "));
                break;
            case R0:
                DPRINTF(("F  "));
                break;
            default:
                DPRINTF(("S? "));
                break;
            }
            break;
        default:
            DPRINTF(("?  "));
            break;
        }

        switch (pin_ptr->direction) {
        case IN:
            DPRINTF(("I   \n"));
            break;
        case OUT:
            DPRINTF(("O   \n"));
            break;
        case IO:
            DPRINTF(("IO  \n"));
            break;
        case POWER:
            DPRINTF(("PWR \n"));
            break;
        case GROUND:
            DPRINTF(("GND \n"));
            break;
        case NC:
            DPRINTF(("NC  \n"));
            break;
        default:
            DPRINTF(("??  \n"));
            break;
        }
#endif

        ++actual_pin_count;

        if ((pin_ptr->direction == POWER) ||
```

Copyright 1989
Logic Modeling Systems

| SOURCE PROGRAM | DATE | TIME | PAGE # |
|---|---|---|---|
| lm1000/function.c | 5/23/89 | 6:14:38 pm | 4/21 |

LINE # SOURCE TEXT

```
            (pin_ptr->direction == GROUND) ||
            (pin_ptr->direction == NC)) {
           lm_put_short(pinno);
           lm_put_short(DATA);
           lm_put_short(pin_ptr->direction);

           for (i = 0; c = pin_ptr->pin_name[i]; ++i)
              lm_put_char(c);
           lm_put_char('\0');

           for (i = 0; c = pin_ptr->pin_number[i]; ++i)
              lm_put_char(c);
           lm_put_char('\0');

           if (pin_ptr->pin_alias == NULL) {
              lm_put_char('\0');
           }
           else {
              for (i = 0; c = pin_ptr->pin_alias[i]; ++i)
                 lm_put_char(c);
              lm_put_char('\0');
           }

           ++pin_ptr;
           continue;
        }

        lm_put_short(pinno);
        switch (pin_ptr->pin_class) {
        case DATA:
        case EVAL:
           lm_put_short(pin_ptr->pin_class);
           break;
        case STORE:
           /* Figure out whether it's store both, store rise, or store fall */

           switch (pin_ptr->clk_format) {
           case DNRZ:
              lm_put_short(pin_ptr->pin_class);
              break;
           case R1:
              lm_put_short(EDGE_RISE);
              break;
           case R0:
              lm_put_short(EDGE_FALL);
              break;
           default:
              break;
           }
           break;
        default:
           break;
        }

        lm_put_short(pin_ptr->direction);

        for (i = 0; c = pin_ptr->pin_name[i]; ++i)
           lm_put_char(c);
        lm_put_char('\0');

        for (i = 0; c = pin_ptr->pin_number[i]; ++i)
           lm_put_char(c);
        lm_put_char('\0');

        if (pin_ptr->pin_alias == NULL) {
           lm_put_char('\0');
        }
        else {
           for (i = 0; c = pin_ptr->pin_alias[i]; ++i)
              lm_put_char(c);
           lm_put_char('\0');
        }

        ++pin_ptr;
     }

     LM_PUT_LONG_AT_MARK(pin_count_mark, lm_global_conn_ptr, actual_pin_count);

     end_put(user->fd);
}

/* ARGSUSED */
void process_check_dabdef_cmd(user)
USER_INFO   *user;
{
   DEVICE_SPEC *backend_pass();
   DEVICE_SPEC *def_ptr;
   char         *buffer_ptr;

   DPRINTF(("inside process_check_dabdef_cmd\n"));

   reset_obuf();
   lm_put_int(CHECK_DABDEF_ANS);

   lm_Hinit_vars("HMBL");
   buffer_ptr = LM_GET_ADDR(lm_global_conn_ptr);

   def_ptr = backend_pass(buffer_ptr);

   if (def_ptr != NULL)
      free_device(def_ptr);

   end_queue_message();
   end_put(user->fd);
}

void process_create_instance_cmd(user)
USER_INFO   *user;
{

   EXTRA_DEVICE_SPEC *extra_def_ptr;
   DEVICE_SPEC        *def_ptr;
   DAB_INFO           *dab_ptr;
   INSTANCE_INFO      *instance;
   long                def_id;
   char               *name_ptr;
   u_short             error_count;
   u_short             warning_count;
   u_short             inst_id_table_index;
   char                dab_info_index;
```

Copyright 1989
Logic Modeling Systems

| SOURCE PROGRAM | DATE | TIME | PAGE # |
|---|---|---|---|
| lm1000/function.c | 5/23/89 | 6:14:38 pm | 5/22 |

LINE # SOURCE TEXT

```
    DPRINTF(("inside process_create_instance_cmd\n"));

    reset_obuf();
    lm_put_int(CREATE_INSTANCE_ANS);

    def_id = lm_get_short();

     name_ptr = LM_GET_ADDR(lm_global_conn_ptr);

    /* verify the def_id */
    if ((def_id < 0) || (def_id >= user->def_table_size)) {
       lm_queue_message(ERROR_MSG, "internal simulator error: invalid definition id: %d specified",
                        def_id);
       end_queue_message();
       end_put(user->fd);
       return;
    }

    def_ptr = user->definition[def_id];
    if (BOGUS_DEFINITION(user, def_ptr)) {
       lm_queue_message(ERROR_MSG, "internal simulator error: invalid definition id: %d specified",
                        def_id);
       end_queue_message();
       end_put(user->fd);
       return;
    }

    extra_def_ptr = (EXTRA_DEVICE_SPEC *)def_ptr->extra_data;
    if (extra_def_ptr->dab_ok == FALSE) {
       lm_queue_message(ERROR_MSG, "Device Adapter was removed");
       end_queue_message();
       end_put(user->fd);
       return;
    }

    if ((short)(dab_info_index = find_dab(dab_list, def_ptr->device_name,
                                (u_char)def_ptr->device_type)) == -1) {
       /* If def_ptr->device_type == PUBLIC,  then this error can happen if
        *     - someone unplugged the DAB after the definition is created.
        *
        * If def_ptr->device_type == PRIVATE, then this error can happen if:
        *     - someone else has grabbed the device after the definition is
        *       created
        *     - this user has more instances than DAB's.
        */
       lm_queue_message(ERROR_MSG, "cannot find device_name: %s",
                        def_ptr->device_name);
       end_queue_message();
       end_put(user->fd);
       return;
    }

    dab_ptr = dab_list[dab_info_index];

    if (def_ptr->device_type == PRIVATE) {
       dab_ptr->used_as_private = TRUE;
    }

    if (new_and_link_instance(user, def_ptr, name_ptr,
                              dab_ptr->unit_count,
                              &inst_id_table_index,
                              dab_info_index) == FAILURE) {
       lm_queue_message(ERROR_MSG, "out of memory on modeler for instance");
       end_queue_message();
       end_put(user->fd);
       return;
    }

    instance = user->instance[inst_id_table_index];

    instance->is_fault = FALSE;

    if (def_ptr->device_type == PRIVATE) {
       set_private_mode(dab_ptr, TRUE);
    }

    build_static_pattern_seq(instance);

    lm_message_types(&error_count, &warning_count);

    if (error_count != 0) {
       /* If there are any errors then release this instance since the host
        * SFI is not going to create the instance if there are errors.
        */

       if (def_ptr->device_type == PRIVATE) {
          set_private_mode(dab_ptr, FALSE);
       }

       dab_ptr->used_as_private = FALSE;
       return_all_ptrs_block(instance);
       rls_instance(user, inst_id_table_index);
       end_queue_message();

    }
    else {

       if (def_ptr->device_type == PRIVATE) {
          instance->has_history = TRUE;
          instance->purge_ptrs_on_next_eval = TRUE;
       }

       dab_ptr->act_inst_count += 1;

       turn_on_in_use(dab_ptr);

       end_queue_message();

       lm_put_short(inst_id_table_index);

       copy_initial_values(instance);
    }

    end_put(user->fd);
}

void process_create_fault_cmd(user)
USER_INFO    *user;
{
```

Copyright 1989
Logic Modeling Systems

| SOURCE PROGRAM | DATE | PAGE # |
|---|---|---|
| lm1000/function.c | 5/23/89 | 6/23 |
| | TIME 6:14:38 pm | |

LINE # SOURCE TEXT

```
    INSTANCE_INFO       *inst_ptr;
    INSTANCE_INFO       *fault_ptr;
    DAB_INFO            *dab_ptr;
    long                 inst_id;
    long                 common_ptrs_count;
    u_long               temp_pattern_count;
    u_long               temp_unit_addr[MAX_UNIT_COUNT];
    u_long               temp_unit_addr2[MAX_UNIT_COUNT];
    u_long               temp_max_addr[MAX_LANE_COUNT];
    u_long               temp_prev_max_addr[MAX_LANE_COUNT];
    u_short              error_count;
    u_short              warning_count;
    u_short              table_index;

    DPRINTF(("inside process_create_fault_cmd\n"));

    reset_obuf();
    lm_put_int(CREATE_FAULT_ANS);

    inst_id = lm_get_short();

    /* verify the inst id */
    if ((inst_id < 0) || (inst_id >= user->inst_table_size)) {
        lm_queue_message(ERROR_MSG, "internal simulator error: invalid instance id: %d specified",
                         inst_id);
        end_queue_message();
        end_put(user->fd);
        return;
    }

    inst_ptr = user->instance[inst_id];
    if (BOGUS_INSTANCE(user, inst_ptr)) {
        lm_queue_message(ERROR_MSG, "internal simulator error: invalid instance id: %d specified",
                         inst_id);
        end_queue_message();
        end_put(user->fd);
        return;
    }

    if (inst_ptr->definition->device_type == PRIVATE) {
        /* This condition can happen if the user says it's LOGIC_SIMULATOR
         * and then call lm_create_fault(). If the simulator is FAULT_SIMULATOR
         * then we are going to convert the device_type to PUBLIC when
         * we create definition.
         */
        lm_queue_message(ERROR_MSG, "internal simulator error: cannot create fault on a private mode device");
        end_queue_message();
        end_put(user->fd);
        return;
    }

    if (((EXTRA_DEVICE_SPEC *)
            inst_ptr->definition->extra_data)->dab_ok == FALSE) {
        lm_queue_message(ERROR_MSG, "Device Adapter was removed");
        end_queue_message();
        end_put(user->fd);
        return;
    }

    dab_ptr = dab_list[inst_ptr->dab_info_index];

    common_ptrs_count = lm_get_int();

    if (common_ptrs_count == -1) {
        /* The fault pattern should branch out from whatever pattern t.
         * instance has currently.
         */
        (void)setup_fault_pattern(user, inst_ptr, &table_index);
    }
    else {
        /* Make setup_fault_pattern() believe that the instance only has
         * "common_ptrs_count" number of patterns. Save the actual
         * information about the instance pattern in temp_*.
         */
        modify_instance_pattern_addr(inst_ptr, common_ptrs_count,
                                     &temp_pattern_count,
                                     temp_unit_addr,
                                     temp_unit_addr2,
                                     temp_max_addr,
                                     temp_prev_max_addr);

        (void)setup_fault_pattern(user, inst_ptr, &table_index);

        restore_instance_pattern_addr(inst_ptr,
                                      temp_pattern_count,
                                      temp_unit_addr,
                                      temp_unit_addr2,
                                      temp_max_addr,
                                      temp_prev_max_addr);
    }

    lm_message_types(&error_count, &warning_count);

    if (error_count != 0) {
        /* If there are any errors then release this instance since the host
         * SFI is not going to create the instance if there are errors.
         */
        fault_ptr = user->instance[table_index];
        return_all_ptrs_b[illegible](fault_ptr);
        rls_instance(user, table_index);
        end_queue_message();
    }
    else {
        ++inst_ptr->fault_count;

        dab_ptr->act_var_count += 1;

        turn_on_in_use(dab_ptr);

        end_queue_message();
        lm_put_short(table_index);
    }

    end_put(user->fd);
}

void process_release_def_cmd(user)
USER_INFO    *user;
{
    DEVICE_SPEC    *def_ptr;
```

Copyright 1989 Logic Modeling Systems

| SOURCE PROGRAM | DATE | PAGE # |
|---|---|---|
| lm1000/function.c | 5/23/89 TIME 6:14:38 pm | 7/24 |

LINE # SOURCE TEXT

```
    INSTANCE_INFO *instance;
    long          def_id;
    u_short       i;

    DPRINTF(("inside process_release_def_cmd\n"));

    reset_obuf();
    lm_put_int(RELEASE_DEF_ANS);

    def_id = lm_get_short();

    /* verify the def_id */
    if ((def_id < 0) || (def_id >= user->def_table_size)) {
       lm_queue_message(ERROR_MSG, "internal simulator error: invalid definition id: %d specified",
                        def_id);
       end_queue_message();
       end_put(user->fd);
       return;
    }

    def_ptr = user->definition[def_id];
    if (BOGUS_DEFINITION(user, def_ptr)) {
       lm_queue_message(ERROR_MSG, "internal simulator error: invalid definition id: %d specified",
                        def_id);
       end_queue_message();
       end_put(user->fd);
       return;
    }

    /* Check if this definition still has instances/faults */
    for (i = 0; i < user->inst_table_size; ++i) {
       instance = user->instance[i];

       if (BOGUS_INSTANCE(user, instance))
          continue;

       if (instance->definition == def_ptr) {
          lm_queue_message(ERROR_MSG, "internal simulator error: definition id: %d still has instances/faults associated with it",
                           def_id);
          end_queue_message();
          end_put(user->fd);
          return;
       }
    }

    rls_definition(user, (u_short)def_id);

    end_queue_message();
    end_put(user->fd);
}

void process_release_instance_cmd(user)
USER_INFO   *user;
{
    INSTANCE_INFO    *instance;
    DAB_INFO         *dab_ptr;
    long              inst_id;

    DPRINTF(("inside process_release_instance_cmd\n"));

    reset_obuf();
    lm_put_int(RELEASE_INSTANCE_ANS);

    inst_id = lm_get_short();

    /* verify the inst_id */
    if ((inst_id < 0) || (inst_id >= user->inst_table_size)) {
       lm_queue_message(ERROR_MSG, "internal simulatrr error: invalid instance id: %d specified",
                        inst_id);
       end_queue_message();
       end_put(user->fd);
       return;
    }

    instance = user->instance[inst_id];
    if (BOGUS_INSTANCE(user, instance)) {
       lm_queue_message(ERROR_MSG, "internal simulator error: invalid instance id: %d specified",
                        inst_id);
       end_queue_message();
       end_put(user->fd);
       return;
    }

    if (instance->is_fault) {
       lm_queue_message(ERROR_MSG, "internal simulator error: instance id: %d is a fault",
                        inst_id);
       end_queue_message();
       end_put(user->fd);
       return;
    }

    /* Check if this instance still has faults */
    /* ??? Can't do this with the current structure.
     * Just make sure this condition is checked on the host.
     */

    return_all_ptrs_block(instance);

    dab   ~ = dab_list[instance->dab_info_index];

    rls_instance(user, (u_short)inst_id);

    --dab_ptr->act_inst_count;

    if (dab_ptr->used_as_private == TRUE) {
       dab_ptr->used_as_private = FALSE;

       set_private_mode(dab_ptr, FALSE);

    }

    if ((dab_ptr->act_inst_count + dab_ptr->act_var_count) == 0)
       turn_off_in_use(dab_ptr);

    end_queue_message();
    end_put(user->fd);
}

void process_release_fault_cmd(user)
```

Copyright 1989 Logic Modeling Systems

| SOURCE PROGRAM | DATE 5/23/89 | PAGE # |
|---|---|---|
| lm1000/function.c | TIME 6:14:38 pm | 8/25 |

LINE # SOURCE TEXT

```
USER_INFO    *user;
{
    INSTANCE_INFO    *fault;
    INSTANCE_INFO    *instance;
    DAB_INFO         *dab_ptr;
    long             fault_id;
    u_short          inst_id;
    u_short          i;

    DPRINTF(("inside process_release_fault_cmd\n"));

    reset_obuf();
    lm_put_int(RELEASE_FAULT_ANS);

    fault_id = lm_get_short();
    inst_id  = lm_get_short();

    /* verify the fault id */
    if ((fault_id < 0) || (fault_id >= user->inst_table_size)) {
        lm_queue_message(ERROR_MSG, "internal simulator error: invalid fault id: %d specified",
                         fault_id);
        end_queue_message();
        end_put(user->fd);
        return;
    }

    /* verify the inst_id */
    if ((inst_id < 0) || (inst_id >= user->inst_table_size)) {
        lm_queue_message(ERROR_MSG, "internal error: invalid inst id: %d specified",
                         inst_id);
        end_queue_message();
        end_put(user->fd);
        return;
    }

    fault = user->instance[fault_id];
    if (BOGUS_INSTANCE(user, fault)) {
        lm_queue_message(ERROR_MSG, "internal simulator error: invalid fault id: %d specified",
                         fault_id);
        end_queue_message();
        end_put(user->fd);
        return;
    }

    if (! fault->is_fault) {
        lm_queue_message(ERROR_MSG, "internal simulator error: fault id: %d is an instance",
                         fault_id);
        end_queue_message();
        end_put(user->fd);
        return;
    }

    instance = user->instance[inst_id];
    if (BOGUS_INSTANCE(user, instance)) {
        lm_queue_message(ERROR_MSG, "internal error: invalid inst id: %d specified",
                         inst_id);
        end_queue_message();
        end_put(user->fd);
        return;
    }

    if (instance->is_fault) {
        lm_queue_message(ERROR_MSG, "internal error: instance id: %d is a fault",
                         inst_id);
        end_queue_message();
        end_put(user->fd);
        return;
    }

    return_all_ptrs_block(fault);

    dab_ptr = dab_list[fault->dab_info_index];

    --instance->fault_count;

    rls_instance(user, (u_short)fault_id);

    --dab_ptr->act_var_count;

    if ((dab_ptr->act_inst_count + dab_ptr->act_var_count) == 0)
        turn_off_in_use(dab_ptr);

    end_queue_message();
    end_put(user->fd);
}

void process_eval_cmd(user)
USER_INFO    *user;
{
    INSTANCE_INFO *instance;
    DEVICE_SPEC   *def_ptr;
    u_short       inst_id;
    u_short       error_count;
    u_short       warning_count;
    u_char        replay_count;
    u_char        changed_dac;

    DPRINTF(("inside process_eval_cmd\n"));

    reset_obuf();
    lm_put_int(EVAL_ANS);

    inst_id = lm_get_short();

    /* verify inst_id */
    if (inst_id >= user->inst_table_size) {
        lm_queue_message(ERROR_MSG, "internal simulator error: invalid instance/fault id: %d specified",
                         inst_id);
        end_queue_message();
        end_put(user->fd);
        return;
    }

    instance = user->instance[inst_id];
    if (BOGUS_INSTANCE(user, instance)) {
        lm_queue_message(ERROR_MSG, "internal simulator error: invalid instance/fault id: %d specified",
                         inst_id);
        end_queue_message();
        end_put(user->fd);
        return;
```

Copyright 1989 Logic Modeling Systems

LINE # SOURCE TEXT

```
    }

    def_ptr = instance->definition;
    if (def_ptr == NULL) {
        lm_queue_message(ERROR_MSG, "internal error: no definition for instance");
        end_queue_message();
        end_put(user->fd);
        return;
    }

    if (((EXTRA_DEVICE_SPEC *)def_ptr->extra_data)->dab_ok == FALSE) {
        lm_queue_message(ERROR_MSG, "Device Adapter was removed");
        end_queue_message();
        end_put(user->fd);
        return;
    }

    if (instance->failed_to_alloc_ptrn == TRUE) {
        lm_queue_message(ERROR_MSG, "out of Fast Pattern Memory; cannot continue simulation");
        end_queue_message();
        end_put(user->fd);
        return;
    }

    if (instance->fatal_error == TRUE) {
        lm_queue_message(ERROR_MSG, "fatal error encountered on this instance; cannot continue simulation");
        end_queue_message();
        end_put(user->fd);
        return;
    }

    if (program_dac(def_ptr, (char)instance->dab_info_index,
                                &changed_dac) == FAILURE) {
        end_queue_message();
        end_put(user->fd);
        return;
    }

#ifndef DBASE
    if (start_tmg(def_ptr) == FAILURE) {
        end_queue_message();
        end_put(user->fd);
        return;
    }
#endif

    clear_ptrn_bits((char *)gbl_ident_inconsistent_pins,
                    dab_list[instance->dab_info_index]->unit_count);

    clear_ptrn_bits((char *)gbl_ident_change,
                    dab_list[instance->dab_info_index]->unit_count);

    if (instance->evaluation_count > 0) {
        replay_count = instance->sample_count;
        --instance->evaluation_count;
    }
    else
        replay_count = 0;

    if (copy_in_pin_changes(instance) == FAILURE) {
        end_queue_message();
        end_put(user->fd);
        return;
    }

    run_input_bcode(instance);

#ifdef DEBUG
    print_pin_changes(instance);
#endif

    if (def_ptr->device_type == PUBLIC) {
        if (instance->enable_timing_meas == TRUE) {
            (void)tm_evaluate_1_bit_per_pin(user, def_ptr, instance,
                                        gbl_ident_inconsistent_pins,
                                        &gbl_steady_state_result,
                                        &gbl_temp_steady_state_result,
                                        gbl_ident_change,
                                        &changed_dac);
        }
        else {
            (void)evaluate_1_bit_per_pin(def_ptr, instance,
                                    gbl_ident_inconsistent_pins,
                                    &gbl_temp_steady_state_result,
                                    gbl_ident_change,
                                    replay_count,
                                    &changed_dac);
        }
    }
    else {
        /* PRIVATE part */
        if (instance->had_shorted_pin == TRUE) {
            report_shorted_pin(instance);
            instance->fatal_error = TRUE;
            end_queue_message();
            end_put(user->fd);
            return;
        }

        if (instance->has_history == FALSE) {
            (void)evaluate_private(def_ptr, instance, gbl_ident_change,
                                gbl_ident_inconsistent_pins,
                                &changed_dac);
        }
        else {
            if (instance->purge_ptrn_on_next_eval == TRUE) {
                if (purge_ptrn(instance) == SUCCESS) {
                    (void)evaluate_private(def_ptr, instance, gbl_ident_change,
                                    gbl_ident_inconsistent_pins,
                                    &changed_dac);
                }
            }
            else {
                if (instance->enable_timing_meas == TRUE) {
                    (void)tm_evaluate_1_bit_per_pin(user, def_ptr, instance,
                                            gbl_ident_inconsistent_pins,
                                            &gbl_steady_state_result,
                                            &gbl_temp_steady_state_result,
                                            gbl_ident_change,
                                            &changed_dac);
```

Copyright 1989 Logic Modeling Systems

| SOURCE PROGRAM | DATE | PAGE # |
|---|---|---|
| lm1000/function.c | 5/23/89 TIME 6:14:38 pm | 10/27 |

LINE # SOURCE TEXT

```
            }
            else {
               (void)evaluate_1_bit_per_pin(def_ptr, instance,
                                            gbl_ident_inconsistent_pins,
                                            &gbl_temp_steady_state_result,
                                            gbl_ident_change,
                                            replay_count,
                                            &changed_dac);
            }
         }
      }
   }

   lm_message_types(&error_count, &warning_count);

   if (error_count != 0) {
      end_queue_message();
      end_put(user->fd);
      return;
   }

   run_output_bcode(instance);

   end_queue_message();

   copy_out_pin_changes(instance);

   end_put(user->fd);
}

void process_save_def_cmd(user)
USER_INFO    *user;
{
   DEVICE_SPEC     *def_ptr;
   INSTANCE_INFO   *instance;
   char            *def_buf;
   u_long           temp;
   u_short          def_id;
   long            i;
#ifdef DEBUG
   char            *temp_ptr;
#endif

   extern   char   *extract_device();

   DPRINTF(("inside process_save_def_cmd\n"));

   reset_obuf();
   lm_put_int(SAVE_DEF_ANS);

   def_id = lm_get_short();

   /* verify def_id */
   if (def_id >= user->def_table_size) {
      lm_queue_message(ERROR_MSG, "internal simulator error: invalid definition id: %d specified",
                       def_id);
      end_queue_message();
      end_put(user->fd);
      return;
   }

   def_ptr = user->definition[def_id];
   if (BOGUS_DEFINITION(user, def_ptr)) {
      lm_queue_message(ERROR_MSG, "internal simulator error: invalid definition id: %d specified",
                       def_id);
      end_queue_message();
      end_put(user->fd);
      return;
   }

   if (user->save_buffer != NULL) {
      lm_queue_message(ERROR_MSG, "internal error: left over text from previous save");
      end_queue_message();
      end_put(user->fd);
      return;
   }

   unadjust_delay(user, def_ptr);

   def_buf = extract_device(def_ptr);
   if (def_buf == NULL) {
      lm_queue_message(ERROR_MSG, "internal error: extract_device failed");
      end_queue_message();
      end_put(user->fd);
      return;
   }

   adjust_delay(user, def_ptr);

   DPRINTF(("length of extract_device buffer: %d\n", strlen(def_buf)));

#ifdef DEBUG
#ifdef MODELER
   temp_ptr = def_buf;
   while (*temp_ptr)
      ac_putc(*temp_ptr++);
   ac_putc('\n');
#else
   temp_ptr = def_buf;
   while (*temp_ptr)
      DPRINTF(("%c", *temp_ptr++));
   DPRINTF(("\n"));
#endif
#endif

   end_queue_message();

   temp = 0;
   for (i = 0; i < user->inst_table_size; ++i) {
      instance = user->instance[i];
      if (BOGUS_INSTANCE(user, instance))
         continue;

      if (instance->definition != def_ptr)
         continue;

      if (instance->is_fault == FALSE)
         temp += instance->pattern_count.
      else
         temp += instance->pattern_count -
```

Copyright 1989
Logic Modeling Systems

SOURCE PROGRAM lm1000/function.c | DATE 5/23/89 | TIME 6:14:38 pm | PAGE # 11/28

LINE # SOURCE TEXT

```
                instance->common_pattern_count;
    }

    lm_put_int(temp);                /* device pattern count       */
    lm_put_int(strlen(def_buf));  /* total size of the def_buf   */

    for (i = 0; def_buf[i] != '\0' && i < SAVE_REST_PTRN_BUFFER_LIMIT; ++i) {
        lm_put_char(def_buf[i]);
    }
    lm_put_char('\0');

    if (i < SAVE_REST_PTRN_BUFFER_LIMIT) {
        /* The whole definition text fits into the network buffer */
        user->save_buffer = NULL;
        user->save_buffer_offset = -1;
        DFREE(def_buf);
    }
    else {
        /* There are more to come */
        user->save_buffer = def_buf;
        user->save_buffer_offset = i;
    }

    end_put(user->fd);
}

void process_save_def_cont_cmd(user)
USER_INFO    *user;
{
    char            *def_buf;
    long            i;
    long            limit;

    DPRINTF(("inside process_save_def_cont_cmd\n"));

    reset_obuf();
    lm_put_int(SAVE_DEF_CONT_ANS);

    if (user->save_buffer == NULL) {
        lm_queue_message(ERROR_MSG, "internal error: no more definition text to return");
        end_queue_message();
        end_put(user->fd);
        return;
    }
    end_queue_message();

    def_buf = user->save_buffer;

    limit = user->save_buffer_offset + SAVE_REST_PTRN_BUFFER_LIMIT;
    for (i = user->save_buffer_offset; def_buf[i] != '\0' && i < limit; ++i) {
        lm_put_char(def_buf[i]);
    }
    lm_put_char('\0');

    if (i < limit) {
        user->save_buffer = NULL;
        user->save_buffer_offset = -1;
        DFREE(def_buf);
    }
    else {
        user->save_buffer_offset = i;
    }
    end_put(user->fd);
}

voit process_save_ptrn_cmd(user)
USER_INFO    *user;
{
    INSTANCE_INFO      *inst_ptr;
    DEVICE_SPEC        *def_ptr;
    PIN_SPEC           *pin_def;
    PIN_INFO           *pin;
    DAB_INFO           *dab_ptr;
    u_long              pattern_count;
    u_short             inst_id;
    u_long              pin_count_mark;
    u_long              pattern_count_follows_mark;
    u_long              out_buffer_remaining_size;
    u_short             pinno;
    u_short             pin_count;
    u_char              device_ptrn_size;    /* size of device pattern is bytes */

    DPRINTF(("inside process_save_ptrn_cmd\n"));

    user->save_state = SENT_RECV_NOTHING;

    reset_obuf();
    lm_put_int(SAVE_PTRN_ANS);

    inst_id = lm_get_short();

    /* verify inst_id */
    if (inst_id >= user->inst_table_size) {
        lm_queue_message(ERROR_MSG, "internal simulator error: invalid instance/fault id: %d specified",
                         inst_id);
        end_queue_message();
        end_put(user->fd);
        return;
    }

    inst_ptr = user->instance[inst_id];
    if (BOGUS_INSTANCE(user, inst_ptr)) {
        lm_queue_message(ERROR_MSG, "internal simulator error: invalid instance/fault id: %d specified",
                         inst_id);
        end_queue_message();
        end_put(user->fd);
        return;
    }

    dab_ptr = dab_list[inst_ptr->dab_info_index];

    if (inst_ptr->is_fault == FALSE) {
        /* This is an instance */

        /* The pattern_count includes the last pattern which is a variable
         * pattern. This variable pattern is the same as
         * INSTANCE_INFO.ptrn_loaded, so we don't have to store this in the
         * save set file. Therefore we need to subtract it by
         * unit_count_per_lane.
         */
```

Copyright 1989
Logic Modeling Systems

SOURCE PROGRAM lm1000/function.c | DATE 5/23/89 | TIME 6:14:38 pm | PAGE # 12/29

LINE # SOURCE TEXT

```
        user->pattern_to_send_count = inst_ptr->pattern_count -
           inst_ptr->static_pattern_count -
              dab_ptr->unit_count_per_lane;
     }
     else {
        /* This is a fault */
        /* We don't need to subtract it by unit_count_per_lane since both
         * pattern_count and common_pattern_count includes this variable
         * pattern already.
         */
        user->pattern_to_send_count = inst_ptr->pattern_count -
           inst_ptr->common_pattern_count;
     }

     end_queue_message();

     lm_put_char(dab_ptr->unit_count);

     /* The following is a total DEVICE ptrn count, and pattern_to_send_count
      * is the number of lane patterns. Therefore we need to divide it by
      * unit_count_per_lane.
      */
     lm_put_int(user->pattern_to_send_count / dab_ptr->unit_count_per_lane);

     /* write common_ptrn_count */
     if (inst_ptr->is_fault == FALSE)
        lm_put_int(-1);
     else {
        /* subtract by unit_count_per_lane because common_ptrn_count includes
         * the last pattern which is a variable pattern.
         */
        lm_put_int((inst_ptr->common_pattern_count -
                    inst_ptr->static_pattern_count -
                    dab_ptr->unit_count_per_lane) /
                   dab_ptr->unit_count_per_lane);
     }

     lm_put_char(inst_ptr->check_input_z_count);
     lm_put_char(inst_ptr->first_eval);
     lm_put_char(inst_ptr->sample_count);
     lm_put_int(inst_ptr->evaluation_count);
     lm_put_char(inst_ptr->purge_ptrn_on_next_eval);
     lm_put_char(inst_ptr->has_history);
     lm_put_char(inst_ptr->use_2_bit_per_pin);
     lm_put_char(inst_ptr->enable_timing_meas);
     lm_put_char(inst_ptr->had_shorted_pin);

     pin_count_mark = LM_MARK_BUFFER(lm_global_conn_ptr);
     lm_put_short(0);  /* dummy pin_count */

     def_ptr = inst_ptr->definition;
     pin_count = 0;
     for (pinno = 0; pinno < def_ptr->pin_cnt; ++pinno) {
        pin_def = &def_ptr->pin_table[pinno];

        if ((pin_def->direction == NONE) ||
            (pin_def->direction == POWER) ||
            (pin_def->direction == GROUND) ||
            (pin_def->direction == NC))
           continue;

        ++pin_count;
        pin = &inst_ptr->pin_info_table[pinno];

        lm_put_short(pinno);
        lm_put_char(pin->old_raw);
        lm_put_char(pin->old_filtered);
        lm_put_char(pin->new_raw);
        lm_put_char(pin->new_filtered);
        lm_put_int(pin->sim_time);
        lm_put_char(pin->uninitialized_pin);
     }

     LM_PUT_SHORT_AT_MARK(pin_count_mark, lm_global_conn_ptr, pin_count);

     pattern_count_follows_mark = LM_MARK_BUFFER(lm_global_conn_ptr);
     lm_put_int(0);     /* dummy pattern_count_follows */

     out_buffer_remaining_size = SAVE_REST_PTRN_BUFFER_LIMIT;

     device_ptrn_size = dab_ptr->unit_count * sizeof(PTRN_BITS);

     pattern_count = 0;
     while (out_buffer_remaining_size > device_ptrn_size) {

        if (send_pattern(user, inst_ptr) == FALSE)
           break;

        ++pattern_count;
        out_buffer_remaining_size -= device_ptrn_size;
     }

     LM_PUT_LONG_AT_MARK(pattern_count_follows_mark, lm_global_conn_ptr,
                         pattern_count);

     DPRINTF(("pattern_count_follows: %d\n", pattern_count));

     end_put(user->fd);
}

void process_save_ptrn_cont_cmd(user)
USER_INFO    *user;
{
   INSTANCE_INFO     *inst_ptr;
   DAB_INFO          *dab_ptr;
   u_long             pattern_count;
   u_short            inst_id;
   u_long             pattern_count_follows_mark;
   u_long             out_buffer_remaining_size;
   u_char             device_ptrn_size;   /* size of device pattern is bytes */

   DPRINTF(("inside process_save_ptrn_cont_cmd\n"));

   reset_obuf();
   lm_put_int(SAVE_PTRN_CONT_ANS);

   inst_id = lm_get_short();

   /* verify inst_id */
   if (inst_id >= user->inst_table_size) {
```

Copyright 1989 Logic Modeling Systems

| SOURCE PROGRAM | DATE 5/23/89 | PAGE # |
|---|---|---|
| lm1000/function.c | TIME 6:14:38 pm | 13/30 |

LINE # SOURCE TEXT

```
      lm_queue_message(ERROR_MSG, "internal simulator error: invalid instance/fault id: %d specified",
                       inst_id);
      end_queue_message();
      end_put(user->fd);
      return;
   }

   inst_ptr = user->instance[inst_id];
   if (BOGUS_INSTANCE(user, inst_ptr)) {
      lm_queue_message(ERROR_MSG, "internal simulator error: invalid instance/fault id: %d specified",
                       inst_id);
      end_queue_message();
      end_put(user->fd);
      return;
   }

   dab_ptr = dab_list[inst_ptr->dab_info_index];

   end_queue_message();

   pattern_count_follows_mark = LM_MARK_BUFFER(lm_global_conn_ptr);
   lm_put_int(0);      /* dummy count */

   out_buffer_remaining_size = SAVE_REST_PTRN_BUFFER_LIMIT;

   device_ptrn_size = dab_ptr->unit_count * sizeof(PTRN_BITS);

   pattern_count = 0;
   while (out_buffer_remaining_size > device_ptrn_size) {

      if (send_pattern(user, inst_ptr) == FALSE)
         break;

      ++pattern_count;
      out_buffer_remaining_size -= device_ptrn_size;
   }

   LM_PUT_LONG_AT_MARK(pattern_count_follows_mark, lm_global_conn_ptr,
                       pattern_count);

   DPRINTF(("pattern_count_follows: %d\n", pattern_count));

   end_put(user->fd);
}

void process_restore_inst_cmd(user)
USER_INFO    *user;
{
   INSTANCE_INFO *instance;
   PIN_INFO       *pin;
   u_short         inst_id;
   u_short         i;
   u_short         pin_count;
   u_short         pin_number;

   DPRINTF(("inside process_restore_inst_cmd\n"));

   reset_obuf();
   lm_put_int(RESTORE_INST_ANS);

   inst_id = lm_get_short();

   /* verity inst_id */
   if (inst_id >= user->inst_table_size) {
      lm_queue_message(ERROR_MSG, "internal simulator error: invalid instance/fault id: %d specified",
                       inst_id);
      end_queue_message();
      end_put(user->fd);
      return;
   }

   instance = user->instance[inst_id];
   if (BOGUS_INSTANCE(user, instance)) {
      lm_queue_message(ERROR_MSG, "internal simulator error: invalid instance/fault id: %d specified",
                       inst_id);
      end_queue_message();
      end_put(user->fd);
      return;
   }

   instance->check_input_z_count      = lm_get_char();
   instance->first_eval               = lm_get_char();
   instance->sample_count             = lm_get_char();
   instance->evaluation_count         = lm_get_int();
   instance->purge_ptrn_on_next_eval  = lm_get_char();
   instance->has_history              = lm_get_char();
   instance->use_2_bit_per_pin        = lm_get_char();
   instance->enable_timing_meas       = lm_get_char();
   instance->had_shorted_pin          = lm_get_char();

   pin_count = lm_get_short();

   for (i = 0; i < pin_count; ++i) {
      pin_number = lm_get_short();
      pin = &instance->pin_info_table[pin_number];
      pin->old_raw            = lm_get_char();
      pin->old_filtered       = lm_get_char();
      pin->new_raw            = lm_get_char();
      pin->new_filtered       = l[illegible]t_char();
      pin->sim_time           = l[illegible]t_int();
      pin->uninitialized_pin = lm_get_char();
   }

   end_queue_message();

   end_put(user->fd);
}

void process_restore_ptrn_cmd(user)
USER_INFO    *user;
{
   INSTANCE_INFO *instance;
   DAB_INFO       *dab_ptr;
   u_short         pattern_count_follows;
   u_short         inst_id;
   u_char          unit_count;
   u_short         i;

   DPRINTF(("inside process_restore_ptrn_cmd\n"));
```

Copyright 1989
Logic Modeling Systems

SOURCE PROGRAM lm1000/function.c

DATE 5/23/89 TIME 6:14:38 pm PAGE # 14/31

LINE # SOURCE TEXT

```
    reset_obuf();
    lm_put_int(RESTORE_PTRN_ANS);

    inst_id = lm_get_short();
    unit_count = lm_get_int();
    pattern_count_follows = lm_get_int();

    /* verity inst_id */
    if (inst_id >= user->inst_table_size) {
       lm_queue_message(ERROR_MSG, "internal simulator error: invalid instance/fault id: %d specified",
                        inst_id);
       end_queue_message();
       end_put(user->fd);
       return;
    }

    instance = user->instance[inst_id];
    if (BOGUS_INSTANCE(user, instance)) {
       lm_queue_message(ERROR_MSG, "internal simulator error: invalid instance/fault id: %d specified",
                        inst_id);
       end_queue_message();
       end_put(user->fd);
       return;
    }

    dab_ptr = dab_list[instance->dab_info_index];

    if (dab_ptr->unit_count != unit_count) {
       /* ???? error */
       lm_queue_message(ERROR_MSG, "internal error: current unit count does not equal saved unit count");

       end_queue_message();

       end_put(user->fd);
       return;
    }

    if (instance->failed_to_alloc_ptrs == TRUE) {
       lm_queue_message(ERROR_MSG, "out of Fast Pattern Memory; cannot restore");
       end_queue_message();
       end_put(user->fd);
       return;
    }

    if (pattern_count_follows == 0) {
       instance->restore_state = SENT_RECV_NOTHING;

       /* write the variable pattern */
       write_pattern(instance,
                     &instance->unit_addr[instance->cur_unit_addr_index][0],
                     instance->ptrs_loaded);

       end_queue_message();

       end_put(user->fd);
       return;
    }

    for (i = 0; i < pattern_count_follows; ++i) {
       if (restore_inst_pattern(instance, unit_count) == FAILURE)
          break;
    }

    end_queue_message();

    end_put(user->fd);
}

void process_ptrs_hist_cmd(user)
USER_INFO    *user;
{
    INSTANCE_INFO  *instance;
    u_short         inst_id;
    u_char          command;

    DPRINTF(("inside process_ptrs_hist_cmd\n"));

    reset_obuf();
    lm_put_int(PTRN_HIST_ANS);

    inst_id = lm_get_short();

    /* verify inst_id */
    if (inst_id >= user->inst_table_size) {
       lm_queue_message(ERROR_MSG, "internal simulator error: invalid instance id: %d specified",
                        inst_id);
       end_queue_message();
       end_put(user->fd);
       return;
    }

    instance = user->instance[inst_id];
    if (BOGUS_INSTANCE(user, instance)) {
       lm_queue_message(ERROR_MSG, "internal simulator error: invalid instance id: %d specified",
                        inst_id);
       end_queue_message();
       end_put(user->fd);
       return;
    }

    if (instance->definition->device_type == PUBLIC) {
       end_queue_message();
       end_put(user->fd);
       return;
    }

    switch (command = lm_get_char()) {
    case LM_KEEP_PATTERNS:
       if (instance->has_history == TRUE)
          instance->purge_ptrs_on_next_eval = FALSE;
       else
          lm_queue_message(ERROR_MSG, "internal simulator error: instance id: %d does not have history",
                           inst_id);
       break;
    case LM_DONT_KEEP_PATTERNS:
       if (instance->has_history == TRUE) {
          instance->purge_ptrs_on_next_eval = TRUE;
          if (instance->enable_timing_meas == TRUE) {
             lm_queue_message(WARNING_MSG, "timing measurement is turned off on private instance: %s because pattern history were deleted",
                              instance->device_info_string);
```

Copyright 1989 Logic Modeling Systems

| SOURCE PROGRAM | DATE | PAGE # |
|---|---|---|
| lm1000/function.c | 5/23/89 TIME 6:14:38 pm | 15/32 |

SOURCE TEXT

```
            }
        }
        break;
    default:
        lm_queue_message(ERROR_MSG, "internal simulator error: illegal command: %d",
                         command);
        break;
    }

    end_queue_message();
    end_put(user->fd);

}

void process_inq_modeler_cmd(user)
USER_INFO   *user;
{
    u_long      temp;
    u_long      value;
    u_short     attrib;
    u_char      laneno;
    u_char      pamno;
    u_char      slotno;
    u_char      i;

    DPRINTF(("inside process_inq_modeler_cmd\n"));

    reset_obuf();
    lm_put_int(INQ_MODELER_ANS);

    switch (attrib = lm_get_int()) {
    case LM_TOTAL_PATTERNS:
        end_queue_message();
        temp = 0;
        for (laneno = 0; laneno < MAX_LANE_COUNT; ++laneno)
            for (pamno = 0; pamno < MAX_PAM_COUNT; pamno++)
                if (system_config->lane[laneno]->pam[pamno] != NULL)
                    temp += system_config->lane[laneno]->pam[pamno]->mem_size;

        lm_put_int(temp);
        break;
    case LM_TOTAL_MODELER_MEMORY:
        end_queue_message();
        lm_put_int(total_malloc_size);
        break;
    case LM_AVAILABLE_PATTERNS:
        end_queue_message();
        temp = count_avail_pattern((u_char)MAX_LANE_COUNT) * PTRN_PER_BLOCK;
        lm_put_int(temp);
        break;
    case LM_AVAILABLE_MODELER_MEMORY:
        end_queue_message();
        lm_put_int(available_malloc_size);
        break;
    case LM_NUMBER_OF_USERS:
        end_queue_message();
        temp = 0;
        for (i = 0; i < MAX_USER_COUNT; ++i)
            if (user_info_array[i]->active == TRUE)
                ++temp;
        lm_put_int(temp);
        break;
    case LM_WHICH_USER_AM_I:
        end_queue_message();
        for (i = 0; i < MAX_USER_COUNT; ++i)
            if (user_info_array[i] == user)
                break;
        lm_put_int(i)
        break;
    case LM_NUMBER_OF_LANES:
        end_queue_message();
        lm_put_int(system_config->phy_lane_count);
        break;
    case LM_NUMBER_OF_SLOTS_PER_LANE:
        end_queue_message();
        lm_put_int((long)system_config->slot_count);
        break;
    case LM_NUMBER_OF_PACS:
        end_queue_message();
        temp = 0;
        for (laneno = 0; laneno < MAX_LANE_COUNT; ++laneno)
            if (system_config->lane[laneno]->pac_present == TRUE)
                ++temp;
        lm_put_int(temp);
        break;
    case LM_NUMBER_OF_PAMS:
        end_queue_message();
        temp = 0;
        for (laneno = 0; laneno < MAX_LANE_COUNT; ++laneno)
            for (pamno = 0; pamno < MAX_PAM_COUNT; ++pamno)
                if (system_config->lane[laneno]->pam[pamno] != NULL)
                    ++temp;
        lm_put_int(temp);
        break;
    case LM_NUMBER_OF_PELS:
        end_queue_message();
        temp = 0;
        for (laneno = 0; laneno < MAX_LANE_COUNT; ++laneno)
            for (slotno = 0; slotno < MAX_SLOT_COUNT; ++slotno)
                if (system_config->lane[laneno]->pel[slotno] != NULL)
                    ++temp;
        lm_put_int(temp);
        break;
    case LM_NUMBER_OF_DABS:
        end_queue_message();
        temp = 0;
        for (i = 0; i < MAX_LANE_COUNT * MAX_SLOT_COUNT; ++i)
            if (dab_list[i] != NULL) {
                temp += dab_list[i]->segment_count;
            }
        lm_put_int(temp);
        break;
    case LM_NUMBER_OF_PUBLIC_DEVICES:
        end_queue_message();
        temp = 0;
        for (i = 0; i < MAX_LANE_COUNT * MAX_SLOT_COUNT; ++i)
            if (dab_list[i] != NULL) {
                if (dab_list[i]->used_as_private == FALSE) {
                    ++temp;
                }
```

Copyright 1989
Logic Modeling Systems

| SOURCE PROGRAM | DATE 5/23/89 | PAGE # |
| --- | --- | --- |
| lm1000/function.c | TIME 6:14:38 pm | 16/33 |

LINE # SOURCE TEXT

```
        }
        lm_put_int(temp);
        break;
     case LM_NUMBER_OF_PRIVATE_DEVICES:
        end_queue_message();
        temp = 0;
        for (i = 0; i < MAX_LANE_COUNT * MAX_SLOT_COUNT; ++i)
           if (dab_list[i] != NULL) {
              if (dab_list[i]->used_as_private == TRUE) {
                 ++temp;
              }
           }
        lm_put_int(temp);
        break;
     case LM_NUMBER_OF_ACTIVE_INSTANCES:
        end_queue_message();
        temp = 0;
        for (i = 0; i < MAX_LANE_COUNT * MAX_SLOT_COUNT; ++i)
           if (dab_list[i] != NULL)
              temp += dab_list[i]->act_inst_count;
        lm_put_int(temp);
        break;
     case LM_NUMBER_OF_ACTIVE_FAULTS:
        end_queue_message();
        temp = 0;
        for (i = 0; i < MAX_LANE_COUNT * MAX_SLOT_COUNT; ++i)
           if (dab_list[i] != NULL)
              temp += dab_list[i]->act_var_count;
        lm_put_int(temp);
        break;
     case LM_SOFTWARE_REVISION_NUMBER:
        end_queue_message();
        lm_put_int(SOFTWARE_REVISION_NUMBER);
        break;
     case LM_PASSWORD_CHECK:
        if (check_password(user) == TRUE) {
           end_queue_message();
           lm_put_int(LM_TRUE);
        }
        else {
           end_queue_message();
           lm_put_int(LM_FALSE);
        }
        break;
     case LM_GET_VERSION_STRING_ADDR:
        end_queue_message();
        temp = (u_long)lmsi_version;
        lm_put_int(temp);
        break;
     default:
        if (epoch_info(attrib, &value) == FAILURE) {
           lm_queue_message(ERROR_MSG, "illegal attribute: %d",
                            attrib);
           end_queue_message();
        }
        else {
           end_queue_message();
           lm_put_int(value);
        }
        break;
   }

   end_put(user->fd);
}

/* ARGSUSED */
void process_inq_user_list_cmd(user)
USER_INFO    *user;
{
   u_short temp;
   u_short j;
   u_char  i;
   char    c;

   DPRINTF(("inside process_inq_user_list_cmd\n"));

   reset_obuf();
   lm_put_int(INQ_USER_LIST_ANS);

   end_queue_message();

   temp = 0;
   for (i = 0; i < MAX_USER_COUNT; ++i)
      if (user_info_array[i]->active == TRUE)
         ++temp;

   lm_put_int(temp);

   /* Put the user numbers to the Network buffer */
   for (i = 0; i < MAX_USER_COUNT; ++i)
      if (user_info_array[i]->active == TRUE)
         lm_put_int(i);

   /* Put the hostnames to the Network buffer */
   for (i = 0; i < MAX_USER_COUNT; ++i) {
      if (user_info_array[i]->active == TRUE) {
         for (j = 0; (c = user_info_array[i]->hostname[j]) != '\0'; ++j)
            lm_put_char(c);
         lm_put_char('\0');
      }
   }

   /* Put the usernames to the Network buffer */
   for (i = 0; i < MAX_USER_COUNT; ++i) {
      if (user_info_array[i]->active == TRUE) {
         for (j = 0; (c = user_info_array[i]->username[j]) != '\0'; ++j)
            lm_put_char(c);
         lm_put_char('\0');
      }
   }

   end_put(user->fd);
}

/* ARGSUSED */
void process_inq_user_cmd(user)
USER_INFO    *user;
{
   DEVICE_SPEC    *definition,
   INSTANCE_INFO *instance;
```

Copyright 1989
Logic Modeling Systems

| SOURCE PROGRAM | DATE | PAGE # |
|---|---|---|
| lm1000/function.c | 5/23/89 | 17/34 |
| | TIME 6:14:38 pm | |

LINE # SOURCE TEXT

```
    USER_INFO      *userx;
    CONNECTION     *conn;
    long            userno;
    long            attrib;
    u_long          temp;
    u_char          i;

    DPRINTF(("inside process_inq_user_cmd\n"));

    reset_obuf();
    lm_put_int(INQ_USER_ANS);

    userno = lm_get_int();
    attrib = lm_get_int();

    if (userno >= MAX_USER_COUNT) {
        lm_queue_message(ERROR_MSG, "invalid user number: %d specified",
                         userno);
        end_queue_message();
        end_put(user->fd);
        return;
    }

    if (user_info_array[userno]->active == FALSE) {
        lm_queue_message(ERROR_MSG, "user number: %d does not exist",
                         userno);
        end_queue_message();
        end_put(user->fd);
        return;
    }

    userx = user_info_array[userno];

    switch (attrib) {
    case LM_NUMBER_OF_PATTERNS_ALLOCATED:
        end_queue_message();
        temp = 0;
        for (i = 0; i < userx->inst_table_size; ++i) {
            instance = userx->instance[i];
            if (BOGUS_INSTANCE(userx, instance))
                continue;

            if (instance->is_fault == FALSE)
                temp += ((instance->pattern_count + PTRN_PER_BLOCK) /
                         PTRN_PER_BLOCK) * PTRN_PER_BLOCK;
            else
                temp += ((instance->pattern_count -
                    instance->common_pattern_count + PTRN_PER_BLOCK) /
                         PTRN_PER_BLOCK) * PTRN_PER_BLOCK;
        }
        lm_put_int(temp);
        break;
    case LM_NUMBER_OF_PATTERNS:
        end_queue_message();
        temp = 0;
        for (i = 0; i < userx->inst_table_size; ++i) {
            instance = userx->instance[i];
            if (BOGUS_INSTANCE(userx, instance))
                continue;

            if (instance->is_fault == FALSE)
                temp += instance->pattern_count;
            else
                temp += instance->pattern_count -
                    instance->common_pattern_count;
        }
        lm_put_int(temp);
        break;
    case LM_NUMBER_OF_PUBLIC_DEVICES:
        end_queue_message();
        temp = 0;
        for (i = 0; i < userx->def_table_size; ++i) {
            definition = userx->definition[i];
            if (BOGUS_DEFINITION(userx, definition))
                continue;

            if (definition->device_type == PUBLIC)
                ++temp;
        }
        lm_put_int(temp);
        break;
    case LM_NUMBER_OF_PRIVATE_DEVICES:
        end_queue_message();
        temp = 0;
        for (i = 0; i < userx->def_table_size; ++i) {
            definition = userx->definition[i];

            if (BOGUS_DEFINITION(userx, definition))
                continue;

            if (definition->device_type == PRIVATE)
                ++temp;
        }
        lm_put_int(temp);
        break;
    case LM_NUMBER_OF_ACTIVE_INSTANCES:
        end_queue_message();
        temp = 0;
        for (i = 0; i < userx->inst_table_size; ++i) {
            instance = userx->instance[i];
            if (BOGUS_INSTANCE(userx, instance))
                continue;

            if (instance->is_fault == FALSE)
                ++temp;
        }
        lm_put_int(temp);
        break;
    case LM_NUMBER_OF_ACTIVE_FAULTS:
        end_queue_message();
        temp = 0;
        for (i = 0; i < userx->inst_table_size; ++i) {
            instance = userx->instance[i];

            if (BOGUS_INSTANCE(userx, instance))
                continue;

            if (instance->is_fault == TRUE)
                ++temp;
        }
```

Copyright 1989
Logic Modeling Systems

SOURCE PROGRAM lm1000/function.c

DATE 5/23/89 TIME 6:14:38 pm PAGE # 18/35

LINE # SOURCE TEXT

```
        lm_put_int(temp);
        break;
    case LM_SECONDS_SINCE_LAST_RESPONSE:
        end_queue_message();
        conn = table_of_conns[userno];
        lm_put_int((lm_tick - conn->time_at_last_response) / TICKS_PER_SECOND);
        break;
    default:
        lm_queue_message(ERROR_MSG, "illegal attribute: %d",
                         attrib);
        end_queue_message();
        break;
    }
    end_put(user->fd);
}

/* ARGSUSED */
void process_inq_lane_cmd(user)
USER_INFO   *user;
{
    long lanenum;
    u_char pamno;
    u_char slotno;
    u_long temp;
    u_long attribute;

    DPRINTF(("inside process_inq_lane_cmd\n"));

    reset_obuf();
    lm_put_int(INQ_LANE_ANS);

    lanenum = lm_get_int();
    if ((lanenum < 0) ||
        (lanenum >= system_config->phy_lane_count)) {

        lm_queue_message(ERROR_MSG, "illegal lane: %d",
                         lanenum);

        end_queue_message();

        end_put(user->fd);
        return;
    }

    attribute = lm_get_int();

    if ((attribute != LM_IS_LANE_USABLE) &&
        (system_config->lane[lanenum]->pac_present == FALSE)) {

        lm_queue_message(ERROR_MSG, "lane: %c is not usable",
                         'A' + lanenum);

        end_queue_message();

        end_put(user->fd);
        return;
    }

    switch (attribute) {
    case LM_IS_LANE_USABLE:
        end_queue_message();

        if (system_config->lane[lanenum]->pac_present == TRUE)
            lm_put_int(LM_TRUE);
        else
            lm_put_int(LM_FALSE);
        break;
    case LM_TOTAL_PATTERNS:
        end_queue_message();

        temp = 0;
        for (pamno = 0; pamno < MAX_PAM_COUNT; ++pamno)
            if (system_config->lane[lanenum]->pam[pamno] != NULL)
                temp += system_config->lane[lanenum]->pam[pamno]->mem_size;
        lm_put_int(temp);
        break;
    case LM_AVAILABLE_PATTERNS:
        end_queue_message();
        temp = count_avail_pattern((u_char)lanenum) * PTRN_PER_BLOCK;
        lm_put_int(temp);
        break;
    case LM_NUMBER_OF_PAMS:
        end_queue_message();

        temp = 0;
        for (pamno = 0; pamno < MAX_PAM_COUNT; ++pamno)
            if (system_config->lane[lanenum]->pam[pamno] != NULL)
                ++temp;
        lm_put_int(temp);
        break;
    case LM_NUMBER_OF_PELS:
        end_queue_message();

        temp = 0;
        for (slotno = 0; slotno < MAX_SLOT_COUNT; ++slotno)
            if (system_config->lane[lanenum]->pel[slotno] != NULL)
                ++temp;
        lm_put_int(temp);
        break;
    case LM_NUMBER_OF_POPULATED_PELS:
        end_queue_message();

        lm_put_int(calculate_pel_count((u_char)lanenum));
        break;
    default:
        lm_queue_message(ERROR_MSG, "illegal attribute: %d",
                         attribute);
        end_queue_message();
        break;
    }
    end_put(user->fd);
}

/* ARGSUSED */
void process_inq_pam_cmd(user)
USER_INFO   *user;
{
    u_long pamno;
    u_long laneno;
    u_char attrib;
```

Copyright 1989
Logic Modeling Systems

SOURCE PROGRAM lm1000/function.c

DATE 5/23/89 TIME 6:14:38 pm PAGE # 19/36

LINE # SOURCE TEXT

```

    DPRINTF(("inside process_inq_pam_cmd\n"));

    reset_obuf();
    lm_put_int(INQ_PAM_ANS);
    laneno = lm_get_int();
    pamno = lm_get_int();

    if ((laneno < 0) || (laneno >= MAX_LANE_COUNT)) {
       lm_queue_message(ERROR_MSG, "illegal lane: %d",
                        laneno);
       end_queue_message();
       end_put(user->fd);
       return;
    }

    if ((pamno < 0) || (pamno >= MAX_PAM_COUNT)) {
       lm_queue_message(ERROR_MSG, "illegal Fast Pattern Memory: %d",
                        pamno);
       end_queue_message();
       end_put(user->fd);
       return;
    }

    if (system_config->lane[laneno]->pac_present == FALSE) {
       lm_queue_message(ERROR_MSG, "lane: %c does not exist",
                        'A' + laneno);
       end_queue_message();
       end_put(user->fd);
       return;
    }

    if (system_config->lane[laneno]->pam[pamno] == NULL) {
       lm_queue_message(ERROR_MSG, "Fast Pattern Memory: %d in lane: %c does not exist",
                        pamno, 'A' + laneno);
       end_queue_message();
       end_put(user->fd);
       return;
    }

    switch (attrib = lm_get_int()) {
    case LM_PAM_MEMORY_SIZE:
       end_queue_message();
       lm_put_int(system_config->lane[laneno]->pam[pamno]->mem_size);
       break;
    default:
       lm_queue_message(ERROR_MSG, "illegal attribute: %d",
                        attrib);
       end_queue_message();
       break;
    }

    end_put(user->fd);

}

/* ARGSUSED */
void process_inq_pel_cmd(user)
USER_INFO    *user;
{
    DAB_INFO    *dab_ptr;
    long         laneno;
    long         slotno;
    u_char       dabno;
    u_char       unitno;
    u_char       attrib;

    DPRINTF(("inside process_inq_pel_cmd\n"));

    reset_obuf();
    lm_put_int(INQ_PEL_ANS);

    laneno = lm_get_int();
    slotno = lm_get_int();
    attrib = lm_get_int();

    if ((laneno < 0) || (laneno >= MAX_LANE_COUNT)) {
       lm_queue_message(ERROR_MSG, "illegal lane: %d",
                        laneno);
       end_queue_message();
       end_put(user->fd);
       return;
    }

    if ((slotno < 0) || (slotno >= MAX_SLOT_COUNT)) {
       lm_queue_message(ERROR_MSG, "illegal slot: %d",
                        slotno);
       end_queue_message();
       end_put(user->fd);
       return;
    }

    if (system_config->lane[laneno]->pel[slotno] == NULL) {
       if (attrib == LM_DOES_PEL_EXIST) {
          end_queue_message();
          lm_put_int(LM_FALSE);
       }
       else {
          lm_queue_messa[illegal]RROR_MSG, "Pin Electronics Module in lane: %c slot: %d does not exist",
                        'A' + laneno, slotno);
          end_queue_message();
       }

       end_put(user->fd);
       return;
    }

    switch (attrib) {
    case LM_DOES_PEL_EXIST:
       end_queue_message();
       lm_put_int(LM_TRUE);
       break;
    case LM_IS_DAB_PRESENT:
       for (dabno = 0; dabno < (MAX_LANE_COUNT * MAX_SLOT_COUNT), ++dabno) {
          dab_ptr = dab_list[dabno];
          if (dab_ptr == NULL)
             continue;

          for (unitno = 0; unitno < dab_ptr->unit_count; ++unitno) {
             if ((dab_ptr->unit_location[unitno].lane_no == laneno) &&
```

Copyright 1989
Logic Modeling Systems

SOURCE PROGRAM
lm1000/function.c

DATE 5/23/89
TIME 6:14:38 pm
PAGE # 20/37

LINE # SOURCE TEXT

```
                  (dab_ptr->unit_location[unitno].slot_no == slotno)) {
                  end_queue_message();
                  lm_put_int(LM_TRUE);
                  end_put(user->fd);
                  return;
               }
            }
         }

         end_queue_message();
         lm_put_int(LM_FALSE);

         break;
      default:
         lm_queue_message(ERROR_MSG, "illegal attribute: %d",
                          attrib);
         end_queue_message();
         break;
   }

   end_put(user->fd);
}

/* ARGSUSED */
void process_inq_device_list_cmd(user)
USER_INFO    *user;
{
   u_long    dab_count_mark;
   u_char    dab_count;
   u_char    dabno;
   u_char    i;
   char      c;

   DPRINTF(("inside process_inq_device_list_cmd\n"));

   reset_obuf();
   lm_put_int(INQ_DEVICE_LIST_ANS);
   end_queue_message();

   dab_count_mark = LM_MARK_BUFFER(lm_global_conn_ptr);
   lm_put_int(0);    /* dummy dab_count */

   dab_count = 0;
   for (dabno = 0; dabno < MAX_LANE_COUNT * MAX_SLOT_COUNT; ++dabno) {
      if (dab_list[dabno] != NULL) {
         ++dab_count;
         lm_put_int((u_long)dabno);
      }
   }

   for (dabno = 0; dabno < MAX_LANE_COUNT * MAX_SLOT_COUNT; ++dabno) {
      if (dab_list[dabno] != NULL) {
         for (i = 0; (c = dab_list[dabno]->part_name[i]) != '\0'; ++i)
            lm_put_char(c);
         lm_put_char('\0');
      }
   }

   LM_PUT_LONG_AT_MARK(dab_count_mark, lm_global_conn_ptr, (u_long)dab_count);

   end_put(user->fd);
   return;
}

/* ARGSUSED */
void process_inq_device_name_cmd(user)
USER_INFO    *user;
{
   DAB_INFO *dab_ptr;
   u_long    device_no;
   u_char    i;
   char      c;

   DPRINTF(("inside process_inq_device_name_cmd\n"));

   reset_obuf();
   lm_put_int(INQ_DEVICE_NAME_ANS);

   device_no = lm_get_int();
   if (device_no >= (MAX_LANE_COUNT * MAX_SLOT_COUNT)) {
      lm_queue_message(ERROR_MSG, "invalid device number: %d specified",
                       device_no);
      end_queue_message();
      end_put(user->fd);
      return;
   }

   dab_ptr = dab_list[device_no];
   if (dab_ptr == NULL) {
      lm_queue_message(ERROR_MSG, "invalid device number: %d specified",
                       device_no);
      end_queue_message();
      end_put(user->fd);
      return;
   }

   end_queue_message();

   for   ' = 0; c = dab_ptr->part_name[i]; ++i)
      lm_ ut_char(c);
   lm_put_char('\0');

   end_put(user->fd);
}

/* ARGSUSED */
void process_inq_device_cmd(user)
USER_INFO    *user;
{
   USER_INFO             *userx;
   DAB_INFO              *dab_ptr;
   DAB_INFO              *temp;
   INSTANCE_INFO         *instance;
   EXTRA_DEVICE_SPEC     *extra_def_ptr;
   u_long                 device_no;
   u_long                 total_patterns;
   u_short                inst_id;
   u_char                 attrib;
   u_char                 userno;

```

Copyright 1989 Logic Modeling Systems

SOURCE PROGRAM lm1000/function.c

DATE 5/23/89 TIME 6:14:38 pm PAGE # 21/38

LINE # SOURCE TEXT

```
    DPRINTF(("inside process_inq_device_cmd\n"));

    reset_obuf();
    lm_put_int(INQ_DEVICE_ANS);

    device_no = lm_get_int();
    if (device_no >= (MAX_LANE_COUNT * MAX_SLOT_COUNT)) {
       lm_queue_message(ERROR_MSG, "invalid device number: %d specified",
                        device_no);
       end_queue_message();
       end_put(user->fd);
       return;
    }

    temp = dab_list[device_no];
    if (temp == NULL) {
       lm_queue_message(ERROR_MSG, "invalid device number: %d specified",
                        device_no);
       end_queue_message();
       end_put(user->fd);
       return;
    }

    switch (attrib = lm_get_int()) {
    case LM_DEVICE_STATUS:
       end_queue_message();
       if (temp->used_as_private == TRUE)
          lm_put_int(LM_PRIVATE);
       else
          lm_put_int(LM_PUBLIC);
       break;
    case LM_NUMBER_OF_DABS:
       end_queue_message();
       lm_put_int(temp->segment_count);
       break;
    case LM_NUMBER_OF_ACTIVE_INSTANCES:
       end_queue_message();
       lm_put_int(temp->act_inst_count);
       break;
    case LM_NUMBER_OF_ACTIVE_FAULTS:
       end_queue_message();
       lm_put_int(temp->act_var_count);
       break;
    case LM_NUMBER_OF_PATTERNS:
       total_patterns = 0;
       for (userno = 0; userno < MAX_USER_COUNT; ++userno) {
          userx = user_info_array[userno];

          if (userx->active == FALSE)
             continue;

          for (inst_id = 0; inst_id < userx->inst_table_size; ++inst_id) {
             instance = userx->instance[inst_id];

             if (BOGUS_INSTANCE(userx, instance))
                continue;

             extra_def_ptr = (EXTRA_DEVICE_SPEC *)
                             instance->definition->extra_data;

             if (extra_def_ptr->dab_ok == FALSE)
                continue;

             dab_ptr = dab_list[instance->dab_info_index];

             /* If this instance is using the device we are looking for then
              * count the pattern usage.
              */
             if (dab_ptr == temp) {
                if (instance->is_fault == FALSE) {
                   total_patterns += instance->pattern_count;
                }
                else {
                   total_patterns += instance->pattern_count -
                                     instance->common_pattern_count;
                }
             }
          }
       }
       end_queue_message();
       lm_put_int(total_patterns);
       break;
    default:
       lm_queue_message(ERROR_MSG, "illegal attribute: %d",
                        attrib);
       end_queue_message();
       break;
    }

    end_put(user->fd);
}

/* ARGSUSED */
void process_inq_dab_cmd(user)
USER_INFO    *user;
{
    DAB_INFO    *temp;
    SEGMENT_EL *seg_ptr;
    u_long      device_no;
    long        dab_number;
    char        str[16];
    u_char      i;
    u_char      attrib;
    char        c;

    DPRINTF(("inside process_inq_dab_cmd\n"));

    reset_obuf();
    lm_put_int(INQ_DAB_ANS);

    device_no = lm_get_int();
    if (device_no >= (MAX_LANE_COUNT * MAX_SLOT_COUNT)) {
       lm_queue_message(ERROR_MSG, "invalid device number: %d specified",
                        device_no);
       end_queue_message();
       end_put(user->fd);
       return;
    }

    temp = dab_list[device_no];
```

Copyright 1989
Logic Modeling Systems

LINE # SOURCE TEXT

```
    if (temp == NULL) {
        lm_queue_message(ERROR_MSG, "invalid device number: %d specified",
                         device_no);
        end_queue_message();
        end_put(user->fd);
        return;
    }

    dab_number = lm_get_int();

    if (dab_number >= temp->segment_count) {
        lm_queue_message(ERROR_MSG, "illegal Device Adapter number: %d",
                         dab_number);
        end_queue_message();
        end_put(user->fd);
        return;
    }

    if (temp->segment[0] != NULL)
        seg_ptr = temp->segment[0];
    else {
        seg_ptr = temp->segment[dab_number + 1];
        if (seg_ptr == NULL) {
            lm_queue_message(ERROR_MSG, "internal error: segment D/S not found");
            end_queue_message();
            end_put(user->fd);
            return;
        }

    }

    switch (attrib = lm_get_int()) {
    case LM_DAB_TYPE:
        end_queue_message();

        for (i = 0; c = seg_ptr->dab_type[i]; ++i)
            lm_put_char(c);
        lm_put_char('\0');

        break;
    case LM_DAB_REVISION:
        end_queue_message();

        for (i = 0; c = seg_ptr->revision[i]; ++i)
            lm_put_char(c);
        lm_put_char('\0');

        break;
    case LM_DAB_MANUFACTURER:
        end_queue_message();

        for (i = 0; c = seg_ptr->man_id[i]; ++i)
            lm_put_char(c);
        lm_put_char('\0');

        break;
    case LM_DAB_MAKER:
        end_queue_message();

        for (i = 0; c = seg_ptr->model_maker[i]; ++i)
            lm_put_char(c);
        lm_put_char('\0');

        break;
    case LM_DAB_MAKER_REVISION:
        end_queue_message();

        for (i = 0; c = seg_ptr->model_revision[i]; ++i)
            lm_put_char(c);
        lm_put_char('\0');

        break;
    case LM_DAB_INSERTIONS:
        end_queue_message();

        (void)sprintf(str, "%d", seg_ptr->insertion_count);

        for (i = 0; c = str[i]; ++i)
            lm_put_char(c);
        lm_put_char('\0');

        break;
    default:
        lm_queue_message(ERROR_MSG, "illegal attribute: %d",
                         attrib);
        end_queue_message();
        break;
    }

    end_put(user->fd);
}

/* ARGSUSED */
void process_inq_dab_loc_cmd(user)
USER_INFO    *user;
{
    DAB_INFO *temp;
    u_long     device_no;
    u_long     dab_no;

    DPRINTF(("inside process_inq_dab_loc_cmd\n"));

    reset_obuf();
    lm_put_int(INQ_DAB_LOC_ANS);

    device_no = lm_get_int();
    dab_no    = lm_get_int();
    if (device_no >= (MAX_LANE_COUNT * MAX_SLOT_COUNT)) {
        lm_queue_message(ERROR_MSG, "invalid device number: %d specified",
                         device_no);
        end_queue_message();
        end_put(user->fd);
        return;
    }

    temp = dab_list[device_no];
    if (temp == NULL) {
        lm_queue_message(ERROR_MSG, "invalid device number: %d specified",
                         device_no);
        end_queue_message();
```

Copyright 1989
Logic Modeling Systems

SOURCE PROGRAM
lm1000/function.c

DATE 5/23/89

TIME 6:14:38 pm

PAGE # 23/40

LINE # SOURCE TEXT

```
        end_put(user->fd);
        return;
    }

    if (temp->segment[0] != NULL) {
        /* Single segment device */
        if (dab_no != 0) {
            lm_queue_message(ERROR_MSG, "invalid Device Adapter number: %d specified",
                             dab_no);
            end_queue_message();
            end_put(user->fd);
            return;
        }
    }
    else {
        /* Multi segment device */
        if (dab_no >= temp->segment_count) {
            lm_queue_message(ERROR_MSG, "invalid Device Adapter number: %d specified",
                             dab_no);
            end_queue_message();
            end_put(user->fd);
            return;
        }
    }

    end_queue_message();

    dab_loc(temp, dab_no);

    end_put(user->fd);
}

void process_inq_instance_cmd(user)
USER_INFO   *user;
{
    INSTANCE_INFO *instance;
    u_long          freq;
    u_short         inst_id;
    u_short         attrib;

    DPRINTF(("inside process_inq_instance_cmd\n"));

    reset_obuf();
    lm_put_int(INQ_INSTANCE_ANS);

    inst_id = lm_get_short();
    attrib = lm_get_int();

    /* verify inst_id */
    if (inst_id >= user->inst_table_size) {
        lm_queue_message(ERROR_MSG, "invalid instance id: %d specified",
                         inst_id);
        end_queue_message();
        end_put(user->fd);
        return;
    }

    instance = user->instance[inst_id];
    if (BOGUS_INSTANCE(user, instance)) {
        lm_queue_message(ERROR_MSG, "invalid instance id: %d specified",
                         inst_id);
        end_queue_message();
        end_put(user->fd);
        return;
    }

    if (instance->is_fault) {
        lm_queue_message(ERROR_MSG, "instance id: %d is a fault",
                         inst_id);
        end_queue_message();
        end_put(user->fd);
        return;
    }

    switch (attrib) {
    case LM_NUMBER_OF_PATTERNS:
        end_queue_message();
        lm_put_int(instance->pattern_count);
        break;
    case LM_PATTERN_FREQUENCY:
        end_queue_message();
        freq = (double)1000000000000.0 / (double)((EXTRA_DEVICE_SPEC *)
            (instance->definition->extra_data))->actual_phy_clock_period + 0.5;
        lm_put_int(freq);
        break;
    default:
        lm_queue_message(ERROR_MSG, "illegal attribute: %d",
                         attrib);
        end_queue_message();
        break;
    }

    end_put(user->fd);
}

void process_inq_fault_cmd(user)
USER_INFO   *user;
{
    INSTANCE_INFO *fault;
    u_long          freq;
    u_short         fault_id;
    u_short         attrib;

    DPRINTF(("inside process_inq_fault_cmd\n"));

    reset_obuf();
    lm_put_int(INQ_FAULT_ANS);

    fault_id = lm_get_short();
    attrib = lm_get_int();

    /* verify fault_id */
    if (fault_id >= user->inst_table_size) {
        lm_queue_message(ERROR_MSG, "invalid fault id: %d specified",
                         fault_id);
        end_queue_message();
        end_put(user->fd);
        return;
    }
```

Copyright 1989
Logic Modeling Systems

SOURCE PROGRAM lm1000/function.c

DATE 5/23/89 TIME 6:14:38 pm

LINE # SOURCE TEXT

```
    fault = user->instance[fault_id];
    if (BOGUS_INSTANCE(user, fault)) {
        lm_queue_message(ERROR_MSG, "invalid fault id: %d specified",
                         fault_id);
        end_queue_message();
        end_put(user->fd);
        return;
    }

    if (! fault->is_fault) {
        lm_queue_message(ERROR_MSG, "fault id: %d is an instance",
                         fault_id);
        end_queue_message();
        end_put(user->fd);
        return;
    }

    switch (attrib) {
    case LM_NUMBER_OF_PATTERNS:
        end_queue_message();
        lm_put_int(fault->pattern_count);
        break;
    case LM_PATTERN_FREQUENCY:
        end_queue_message();
        freq = (double)1000000000000.0 / (double)((EXTRA_DEVICE_SPEC *)
            (fault->definition->extra_data))->actual_phy_clock_period + 0.5;
        lm_put_int(freq);
        break;
    default:
        lm_queue_message(ERROR_MSG, "illegal attribute: %d",
                         attrib);
        end_queue_message();
        break;
    }

    end_put(user->fd);
}

void process_inq_avail_ptrn_cmd(user)
USER_INFO   *user;
{
    DEVICE_SPEC     *def_ptr;
    DAB_INFO        *dab_ptr;
    long            temp;
    long            min_lane_ptrn_count;
    u_short         def_id;
    char            dab_info_index;
    u_char          laneno;

    /* Calculate the maximum number of patterns this definition can have.
     * This is used in RESTORE to first check if we can allocate the patterns
     * before actually sending the pattern.
     */

    DPRINTF(("inside process_inq_avail_ptrn_cmd\n"));

    reset_obuf();
    lm_put_int(INQ_AVAIL_PTRN_ANS);

    def_id = lm_get_short();

    /* verify def_id */
    if (def_id >= user->def_table_size) {
        lm_queue_message(ERROR_MSG, "invalid definition id: %d specified",
                         def_id);
        end_queue_message();
        end_put(user->fd);
        return;
    }

    def_ptr = user->definition[def_id];
    if (BOGUS_DEFINITION(user, def_ptr)) {
        lm_queue_message(ERROR_MSG, "invalid definition id: %d specified",
                         def_id);
        end_queue_message();
        end_put(user->fd);
        return;
    }

    if ((short)(dab_info_index = find_dab(dab_list, def_ptr->device_name,
                              (u_char)def_ptr->device_type)) == -1) {
        lm_queue_message(ERROR_MSG, "device_name: %s not found or being used as PRIVATE",
                         def_ptr->device_name);
        end_queue_message();
        end_put(user->fd);
        return;
    }

    dab_ptr = dab_list[dab_info_index];

    min_lane_ptrn_count = MAXINT;

    for (laneno = 0; laneno < MAX_LANE_COUNT; ++laneno) {

        if (dab_ptr->lane_used[laneno] == FALSE)
            continue;

        temp = count_avail_pattern((u_char)laneno) * PTRN_PER_BLOCK;

        if (temp < min_lane_ptrn_count)
            min_lane_ptrn_count = temp;

    }

    end_queue_message();

    lm_put_int(min_lane_ptrn_count);

    end_put(user->fd);
}

void process_tmeasurement_cmd(user)
USER_INFO   *user;
{
    DEVICE_SPEC   *def_ptr;
    INSTANCE_INFO *instance;
    u_short        inst_id;
    u_char         on_or_off;

    DPRINTF(("inside process_tmeasurement_cmd\n"));
```

Copyright 1989 Logic Modeling Systems

SOURCE PROGRAM lm1000/function.c | DATE 5/23/89 | TIME 6:14:38 pm | PAGE # 25/42

LINE # SOURCE TEXT

```
    reset_obuf();
    lm_put_int(TMEASUREMENT_ANS);

    inst_id = lm_get_short();
    on_or_off = lm_get_char();

    /* verify inst_id */
    if (inst_id >= user->inst_table_size) {
       lm_queue_message(ERROR_MSG, "internal simulator error: invalid instance id: %d specified",
                        inst_id);
       end_queue_message();
       end_put(user->fd);
       return;
    }

    instance = user->instance[inst_id];
    if (BOGUS_INSTANCE(user, instance)) {
       lm_queue_message(ERROR_MSG, "internal simulator error: invalid instance id: %d specified",
                        inst_id);
       end_queue_message();
       end_put(user->fd);
       return;
    }

    switch (on_or_off) {
    case LM_TIMING_OFF:
       instance->enable_timing_meas = FALSE;
       break;
    case LM_TIMING_ON:
       def_ptr = instance->definition;
       if (def_ptr->inh_tim_measure == TRUE) {
          lm_queue_message(ERROR_MSG, "Timing Measurement is inhibited for device: %s\n",
                           def_ptr->device_name);
       }
       else {
          if (def_ptr->device_type == PUBLIC)
             instance->enable_timing_meas = TRUE;
          else {
             if ((instance->has_history == TRUE) &&
                 (instance->purge_ptrn_on_next_eval == FALSE)) {
                instance->enable_timing_meas = TRUE;
             }
             else {
                lm_queue_message(ERROR_MSG, "private instance: %s does not have history",
                                 instance->device_info_string);
             }
          }
       }
       break;
    default:
       lm_queue_message(ERROR_MSG, "illegal attribute: %d",
                        on_or_off);
       break;
    }

    end_queue_message();
    end_put(user->fd);
}

void process_loop_ptrn_cmd(user)
USER_INFO    *user;
{
    INSTANCE_INFO *instance;
    DEVICE_SPEC   *def_ptr;
    u_short        inst_id;
    extern char    modeler_state;

    DPRINTF(("inside process_loop_ptrn_cmd\n"));

    reset_obuf();
    lm_put_int(LOOP_PTRN_ANS);

    inst_id = lm_get_short();

    /* verify inst_id */
    if (inst_id >= user->inst_table_size) {
       lm_queue_message(ERROR_MSG, "internal simulator error: invalid instance/fault id: %d specified",
                        inst_id);
       end_queue_message();
       end_put(user->fd);
       return;
    }

    instance = user->instance[inst_id];
    if (BOGUS_INSTANCE(user, instance)) {
       lm_queue_message(ERROR_MSG, "internal simulator error: invalid instance/fault id: %d specified",
                        inst_id);
       end_queue_message();
       end_put(user->fd);
       return;
    }

    def_ptr = instance->definition;
    if (def_ptr == NULL) {
       lm_queue_message(ERROR_MSG, "internal error: no definition for instance");
       end_queue_message();
       end_put(user->fd);
       return;
    }

    if (((EXTRA_DEVICE_SPEC *)def_ptr->extra_data)->dab_ok == FALSE) {
       lm_queue_message(ERROR_MSG, "Device Adapter was removed");
       end_queue_message();
       end_put(user->fd);
       return;
    }

    if (instance->failed_to_alloc_ptrn == TRUE) {
       lm_queue_message(ERROR_MSG, "out of Fast Pattern Memory; cannot continue simulation");
       end_queue_message();
       end_put(user->fd);
       return;
    }

    if (instance->fatal_error == TRUE) {
       lm_queue_message(ERROR_MSG, "fatal error encountered on this instance; cannot continue simulation");
       end_queue_message();
       end_put(user->fd);
```

Copyright 1989
Logic Modeling Systems

LINE # SOURCE TEXT

```
        return;
    }

    if (instance->definition->device_type == PRIVATE) {
        lm_queue_message(ERROR_MSG, "cannot loop pattern for PRIVATE device");
        end_queue_message();
        end_put(user->fd);
        return;
    }

    if (active_user_count() > 1) {
        lm_queue_message(ERROR_MSG, "modeler busy");
        end_queue_message();
        end_put(user->fd);
        return;
    }

    modeler_state = RUNNING_LOOPMODE;
    end_queue_message();
    end_put(user->fd); /* ack now  */

    (void)do_loop_ptrs(instance);
    modeler_state = MODELER_RUNNING;

}

active_user_count()
{
    int       i, count;

    for (i = count = 0; i < MAX_USER_COUNT; ++i)
        if (user_info_array[i]->active == TRUE)
            ++count;

    return(count);

}

void process_reset_inst_cmd(user)
USER_INFO   *user;
{
    DEVICE_SPEC        *def_ptr;
    INSTANCE_INFO      *instance;
    DAB_INFO           *dab_ptr;
    long                inst_id;
    u_short             error_count;
    u_short             warning_count;

    DPRINTF(("inside process_reset_inst_cmd\n"));

    reset_obuf();
    lm_put_int(RESET_INST_ANS);

    inst_id = lm_get_short();

    /* verify the inst_id */
    if ((inst_id < 0) || (inst_id >= user->inst_table_size)) {
        lm_queue_message(ERROR_MSG, "internal simulator error: invalid instance id: %d specified",
                         inst_id);
        end_queue_message();
        end_put(user->fd);
        return;
    }

    instance = user->instance[inst_id];
    if (BOGUS_INSTANCE(user, instance)) {
        lm_queue_message(ERROR_MSG, "internal simulator error: invalid instance id: %d specified",
                         inst_id);
        end_queue_message();
        end_put(user->fd);
        return;
    }

    def_ptr = instance->definition;
    if (((EXTRA_DEVICE_SPEC *)def_ptr->extra_data)->dab_ok == FALSE) {
        lm_queue_message(ERROR_MSG, "Device Adapter was removed");
        end_queue_message();
        end_put(user->fd);
        return;
    }

    if (instance->is_fault) {
        lm_queue_message(ERROR_MSG, "internal simulator error: cannot reset a fault; fault id: %d",
                         inst_id);
        end_queue_message();
        end_put(user->fd);
        return;
    }

    /* Check if this instance still has faults */
    /* ??? Can't do this with the current structure.
     * Just make sure this condition is checked on the host.
     */

    return_all_ptrs_block(instance);

    dab_ptr = dab_list[instance->dab_info_index];

    reinitialize_instance(instance);

    build_static_pattern_seq(instance);

    lm_message_types(&error_count, &warning_count);

    if (error_count != 0) {

        dab_ptr->used_as_private = FALSE;
/*      return_all_ptrs_block(instance);*/
        end_queue_message();

    }
    else {
        if (def_ptr->device_type == PRIVATE) {
            instance->has_history = TRUE;
            instance->purge_ptrs_on_next_eval = TRUE;
        }

        end_queue_message();

        copy_initial_values(instance);
```

Copyright 1989
Logic Modeling Systems

LINE # SOURCE TEXT

```
    }

    end_put(user->fd);
}

/* ARGSUSED */
void process_no_such(user)
USER_INFO   *user;
{
    DPRINTF(("inside process_no_such\n"));

    reset_obuf();

    lm_put_int(NO_SUCH_ANS);
    end_put(user->fd);
}

void process_test_network_cmd(user)
USER_INFO   *user;
{
    USER_INFO *userx;
    u_long     j;
    u_long     total_number;
    u_long     checksum;
    u_long     checksum2;
    u_long     command;
    u_long     subcommand;
    u_long     userno;
    char       error_string[512];
    u_short    temp;
    char       c;

    DPRINTF(("inside process_test_network\n"));

    reset_obuf();

    lm_put_int(TEST_NETWORK_ANS);

    command = lm_get_int();
    switch (command) {
    case 1:
        total_number = lm_get_int();

        DPRINTF(("total_number received = %d\n", total_number));

        checksum = 0;
        for (j = 0; j < total_number; ++j) {
            checksum += lm_get_int();
        }

        DPRINTF(("checksum on command: %d\n", checksum));

        if ((checksum2 = lm_get_int()) != checksum) {
            DPRINTF(("Checksum error\n"));
            lm_queue_message(ERROR_MSG, "internal error: checksum error on command: exp: %08x got: %08x",
                             checksum2, checksum);
            end_queue_message();
            end_put(user->fd);
            return;
        }

        end_queue_message();

        lm_put_int(total_number);

        checksum = 0;
        for (j = 0; j < total_number; ++j) {
            lm_put_int(j*123);
            checksum += j * 123;
        }

        DPRINTF(("checksum on answer: %d\n", checksum));

        lm_put_int(checksum);

        break;
    case 2:
        subcommand = lm_get_int();
        if (subcommand == 1000) {
            /* lock command */
            if (modeler_is_locked == TRUE) {
                lm_queue_message(ERROR_MSG, "modeler is currently locked by: %s",
                                 user_with_lock);
                end_queue_message();
                end_put(user->fd);
                return;
            }
            else {
                for (j = 0; (c = lm_get_char()) != '\0'; ++j)
                    user_with_lock[j] = c;
                user_with_lock[j] = '\0';
                modeler_is_locked = TRUE;
            }
        }
        else if (subcommand == 2000) {
            /* unlock command */
            if (modeler_is_locked == TRUE) {
                if (strcmp(user_with_lock, user->username) != 0) {
                    lm_queue_message(ERROR_MSG, "failed to unlock modeler; user: %s holds the lock",
                                     user_with_lock);
                    end_queue_message();
                    end_put(user->fd);
                    return;
                }
                modeler_is_locked = FALSE;
            }
        }
        else {
            lm_queue_message(ERROR_MSG, "unknown lock/unlock command");
            end_queue_message();
            end_put(user->fd);
            return;
        }
        break;
    case 3:
        userno = lm_get_int();

        if (userno >= MAX_USER_COUNT) {
            lm_queue_message(ERROR_MSG, "user: %d too large", userno);
            end_queue_message();
```

Copyright 1989
Logic Modeling Systems

SOURCE PROGRAM lm1000/function.c

DATE 5/23/89 TIME 6:14:38 pm PAGE # 28/45

LINE # SOURCE TEXT

```
            end_put(user->fd);
            return;
        }

        userx = [illegible]_info_array[userno];

        if (userx == NULL) {
            lm_queue_message(ERROR_MSG, "user number: %d does not exist", userno);
            end_queue_message();
            end_put(user->fd);
            return;
        }

        abort_user(userx);

        end_queue_message();

        end_put(user->fd);

        if (set_close_connection_for_server(table_of_conns[userno]) != SUCCESS) {
            while (1) {
                if (lm_dequeue_message(&temp, error_string) != FAILURE)
                    DPRINTF(("%s", error_string));
                else
                    break;
            }
        }
        return;
    case 4:
        /* Clear profile counter */
        profile_clear();
        break;
    case 5:
        /* Dump profile information */
        end_queue_message();
        profile_dump_count();
        break;
    default:
        lm_queue_message(ERROR_MSG, "unknown test network command");
        end_queue_message();
        break;
    }
    end_put(user->fd);
    return;
}

void process_abort_cmd(user)
USER_INFO   *user;
{
    u_short temp;
    char    error_string[512];

    DPRINTF(("inside process_abort_cmd\n"));

    reset_obuf();
    lm_put_int(ABORT_ANS);

    abort_user(user);

    end_queue_message();

    DPRINTF(("exiting process_abort_cmd, user: %d\n", lm_global_conn_ptr->fd));

    end_put(user->fd);


    if (set_close_connection_for_server(lm_global_conn_ptr) != SUCCESS) {
        while (1) {
            if (lm_dequeue_message(&temp, error_string) != FAILURE)
                DPRINTF(("%s", error_string));
            else
                break;
        }
    }
}

/* ARGSUSED */
void process_label_dab_cmd(user)
USER_INFO  *user;
{
    DAB_EEPROM   dab_eeprom;
    u_long       configuration;
    u_char       laneno;
    u_char       slotno;
    char         dab_type[MAX_STRING_LENGTH];
    char         device_name[MAX_STRING_LENGTH];
    char         model_maker[MAX_STRING_LENGTH];
    char         model_revision[MAX_STRING_LENGTH];
    char         manufacturer[MAX_STRING_LENGTH];
    char         revision[MAX_STRING_LENGTH];
    u_char       i;
    u_char       j;
    char         c;
    u_char       lanes_high;
    u_char       slots_wide;
    u_char       segment_number;
    DAB_INFO    *dab_ptr;
    u_char       dabno;
    u_char       unitno;

    DPRINTF(("inside process_label_dab_cmd\n"));

    reset_obuf();
    lm_put_int(LABEL_DAB_ANS);

    laneno = lm_get_char();
    if (laneno >= MAX_LANE_COUNT) {
        lm_queue_message(ERROR_MSG, "illegal lane: %d",
                         laneno);
        end_queue_message();
        end_put(user->fd);
        return;
    }

    slotno = lm_get_char();
    if (slotno >= MAX_SLOT_COUNT) {
        lm_queue_message(ERROR_MSG, "illegal slot: %d",
                         slotno);
        end_queue_message();
        end_put(user->fd);
```

Copyright 1989 Logic Modeling Systems

SOURCE PROGRAM lm1000/function.c

DATE 5/23/89 TIME 6:14:38 pm PAGE # 29/46

LINE # SOURCE TEXT

```
        return;
    }

    /* dab_type */
    for (i = 0; ((c = lm_get_char()) != '\0'); ++i)
        dab_type[i] = c;
    dab_type[i] = '\0';

    if (strlen(dab_type) > TYPE_LENGTH) {
        lm_queue_message(ERROR_MSG, "Device Adapter type: %s too long; max allowed: %d chars",
                        dab_type, TYPE_LENGTH);
        end_queue_message();
        end_put(user->fd);
        return;
    }

    /* device_name */
    for (i = 0; ((c = lm_get_char()) != '\0'); ++i)
        device_name[i] = c;
    device_name[i] = '\0';

    if (strlen(device_name) > NAME_LENGTH) {
        lm_queue_message(ERROR_MSG, "device_name: %s too long; max allowed: %d chars",
                        device_name, NAME_LENGTH);
        end_queue_message();
        end_put(user->fd);
        return;
    }

    /* model_maker */
    for (i = 0; ((c = lm_get_char()) != '\0'); ++i)
        model_maker[i] = c;
    model_maker[i] = '\0';

    if (strlen(model_maker) > MAKER_LENGTH) {
        lm_queue_message(ERROR_MSG, "Device Adapter model_maker: %s too long; max allowed: %d chars",
                        model_maker, MAKER_LENGTH);
        end_queue_message();
        end_put(user->fd);
        return;
    }

    /* model_revision */
    for (i = 0; ((c = lm_get_char()) != '\0'); ++i)
        model_revision[i] = c;
    model_revision[i] = '\0';

    if (strlen(model_revision) > REV_LENGTH) {
        lm_queue_message(ERROR_MSG, "Device Adapter model_revision: %s too long; max allowed: %d chars",
                        model_revision, REV_LENGTH);
        end_queue_message();
        end_put(user->fd);
        return;
    }

    /* manufacturer */
    for (i = 0; ((c = lm_get_char()) != '\0'); ++i)
        manufacturer[i] = c;
    manufacturer[i] = '\0';

    if (strlen(manufacturer) > MAN_LENGTH) {
        lm_queue_message(ERROR_MSG, "Device Adapter manufacturer: %s too long; max allowed: %d chars",
                        manufacturer, MAN_LENGTH);
        end_queue_message();
        end_put(user->fd);
        return;
    }

    /* revision */
    for (i = 0; ((c = lm_get_char()) != '\0'); ++i)
        revision[i] = c;
    revision[i] = '\0';

    if (strlen(revision) > REV_LENGTH) {
        lm_queue_message(ERROR_MSG, "Device Adapter revision: %s too long; max allowed: %d chars",
                        revision, REV_LENGTH);
        end_queue_message();
        end_put(user->fd);
        return;
    }

    lanes_high = lm_get_char();
    if (lanes_high > MAX_LANE_COUNT) {
        lm_queue_message(ERROR_MSG, "illegal lanes_high: %d; max allowed: %d",
                        lanes_high, MAX_LANE_COUNT);
        end_queue_message();
        end_put(user->fd);
        return;
    }

    if (lanes_high == 0) {
        lm_queue_message(ERROR_MSG, "illegal lanes_high: 0; min allowed: 1");
        end_queue_message();
        end_put(user->fd);
        return;
    }

    slots_wide = lm_get_char();
    if (slots_wide > MAX_SLOT_COUNT) {
        lm_queue_message(ERROR_MSG, "invalid slots_wide: %d; max allowed: %d",
                        slots_wide, MAX_SLOT_COUNT);
        end_queue_message();
        end_put(user->fd);
        return;
    }

    if (slots_wide == 0) {
        lm_queue_message(ERROR_MSG, "invalid slots_wide: 0; min allowed: 1");
        end_queue_message();
        end_put(user->fd);
        return;
    }

    segment_number = lm_get_char();
    if (segment_number > MAX_SEGMENT_PER_DEVICE) {
        lm_queue_message(ERROR_MSG, "invalid segment_number: %d; max allowed: %d",
                        segment_number, MAX_SEGMENT_PER_DEVICE);
        end_queue_message();
        end_put(user->fd);
        return;
```

Copyright 1989 Logic Modeling Systems

SOURCE PROGRAM lm1000/function.c

DATE 5/23/89 TIME 6:14:38 pm

LINE # SOURCE TEXT

```
    }

    if (check_dab_present(laneno, slotno) == FAILURE) {
       lm_queue_message(ERROR_MSG, "no Device Adapter in lane: %c slot: %d",
                        'A' + laneno, slotno);
       end_queue_message();
       end_put(user->fd);
       return;
    }

    /* Check through the dab list and see if any active instances or faults
    exit for this position.
    */
    for (dabno = 0; dabno < (MAX_LANE_COUNT * MAX_SLOT_COUNT); ++dabno) {
       dab_ptr = dab_list[dabno];
       if (dab_ptr == NULL)
          continue;

       for (unitno = 0; unitno < dab_ptr->unit_count; ++unitno) {
            if ((dab_ptr->unit_location[unitno].lane_no == laneno) &&
              (dab_ptr->unit_location[unitno].slot_no == slotno)) {
               if ( (dab_ptr->act_inst_count + dab_ptr->act_var_count) > 0 ) {
                  lm_queue_message(ERROR_MSG, "Device Adapter in lane: %c slot: %d is in use.",
                                   'A' + laneno, slotno);
                  end_queue_message();
                  end_put(user->fd);
                  return;
               }
            }
       }
    }

    /* Get the insertion count into the dab_eeprom structure */
    (void)lm_read_eeprom(laneno * MAX_SLOT_COUNT + slotno, &dab_eeprom);

    for (i = 0; device_name[i] != '\0'; ++i)
       dab_eeprom.device_name[i] = device_name[i];

    for (; i < NAME_LENGTH; ++i)
       dab_eeprom.device_name[i] = '\0';

    for (i = 0; model_maker[i] != '\0'; ++i)
       dab_eeprom.model_maker[i] = model_maker[i];

    for (; i < MAKER_LENGTH; ++i)
       dab_eeprom.model_maker[i] = '\0';

    for (i = 0; model_revision[i] != '\0'; ++i)
       dab_eeprom.model_revision[i] = model_revision[i];

    for (; i < REV_LENGTH; ++i)
       dab_eeprom.model_revision[i] = '\0';

    for (i = 0; manufacturer[i] != '\0'; ++i)
       dab_eeprom.dab_manufacturer[i] = manufacturer[i];

    for (; i < MAN_LENGTH; ++i)
       dab_eeprom.dab_manufacturer[i] = '\0';

    for (i = 0; revision[i] != '\0'; ++i)
       dab_eeprom.dab_revision[i] = revision[i];

    for (; i < REV_LENGTH; ++i)
       dab_eeprom.dab_revision[i] = '\0';

    for (i = 0; dab_type[i] != '\0'; ++i)
       dab_eeprom.dab_type[i] = dab_type[i];

    for (; i < TYPE_LENGTH; ++i)
       dab_eeprom.dab_type[i] = '\0';

    dab_eeprom.segment_number = segment_number;

    configuration = 0;
    for (i = 0; i < lanes_high; ++i) {
       for (j = 0; j < slots_wide; ++j) {
          configuration |= 1 << (i * MAX_SLOT_COUNT + j);
       }
    }

    dab_eeprom.configuration = configuration;

    /* Write the DAB_EEPROM structure to the EEPROM on the DAB */
    (void)lm_write_eeprom(laneno * MAX_SLOT_COUNT + slotno, &dab_eeprom);

    reconfigure_dab();

    end_queue_message();
    end_put(user->fd);
}

void process_eval_control_cmd(user)
USER_INFO   *user;
{
    INSTANCE_INFO *instance;
    u_short        inst_id;
    u_short        attrib;
    long           value;

    DPRINTF(("inside process_eval_control_cmd\n"));

    reset_obuf();
    lm_put_int(EVAL_CONTROL_ANS);

    inst_id = lm_get_short();
    attrib  = lm_get_int();
    value   = lm_get_int();

    /* verify inst_id */
    if (inst_id >= user->inst_table_size) {
       lm_queue_message(ERROR_MSG, "internal simulator error: invalid instance/fault id: %d specified",
                        inst_id);
       end_queue_message();
       end_put(user->fd);
       return;
    }

    instance = user->instance[inst_id];
    if (BOGUS_INSTANCE(user, instance)) {
       lm_queue_message(ERROR_MSG, "internal simulator error: invalid instance/fault id: %d specified",
```

Copyright 1989 Logic Modeling Systems

LINE # SOURCE TEXT

```
                         inst_id);
        end_queue_message();
        end_put(user->fd);
        return;
    }

    switch (attrib) {
    case LM_NUMBER_OF_SAMPLES:
        instance->sample_count = value;
        break;
    case LM_NUMBER_OF_EVALUATIONS:
        if (value == LM_EVERY_EVALUATION)
            instance->evaluation_count = MAXINT;
        else
            instance->evaluation_count = value;
        break;
    default:
        lm_queue_message(ERROR_MSG, "illegal attribute: %d",
                         attrib);
        break;
    }

    end_queue_message();
    end_put(user->fd);
}

void process_reboot_cmd(user)
USER_INFO  *user;
{
    DPRINTF(("inside process_reboot_cmd\n"));

    reset_obuf();
    lm_put_int(REBOOT_ANS);

#ifdef MODELER
    if (check_password(user) == TRUE) {
        reboot_flag = lm_get_char();

        reboot_delay_time = lm_get_int() * 1000; /* ms */

        time_reboot_was_issued = lm_time();
        rebooting = TRUE;
    }
    else {
        lm_queue_message(ERROR_MSG, "Password required to reboot modeler");
    }
#else
    lm_queue_message(ERROR_MSG, "Core Modeler Code is not running on modeler; command ignored...");
#endif

    end_queue_message();
    end_put(user->fd);
}

void process_shutdown_cmd(user)
USER_INFO  *user;
{
    DPRINTF(("inside process_shutdown_cmd\n"));

    reset_obuf();
    lm_put_int(SHUTDOWN_ANS);

#ifdef MODELER
    if (check_password(user) == TRUE) {
        reboot_flag = lm_get_char();

        reboot_delay_time = lm_get_int() * 1000; /* ms */

        time_reboot_was_issued = lm_time();
        rebooting = TRUE;
        xshutdown = TRUE;
    }
    else {
        lm_queue_message(ERROR_MSG, "Password required to shutdown modeler");
    }
#else
    lm_queue_message(ERROR_MSG, "Core Modeler Code is not running on modeler; command ignored...");
#endif

    end_queue_message();
    end_put(user->fd);
}

void process_password_cmd(user)
USER_INFO  *user;
{
    u_short   attrib;
    char      password[MAX_STRING_LENGTH];
    char      crypted_password[CRYPTED_PASSWORD_LENGTH];
    short     i;

    DPRINTF(("inside process_password_cmd\n"));

    reset_obuf();
    lm_put_int(PASSWORD_ANS);
    attrib = lm_get_int();

    i = 0;
    while (password[i++] = lm_get_char())
        ;

    lm_crypt(password, crypted_password);

    switch (attrib) {
    case LM_ASSIGN:
        if (check_password(user) == TRUE) {
            if (write_password(crypted_password) == SUCCESS) {
                for (i = 0; i < MAX_USER_COUNT; ++i) {
                    user_info_array[i]->good_password = FALSE;
                }
                user->good_password = TRUE;
            }
        }
        else {
            lm_queue_message(ERROR_MSG, "Password required to set new password on modeler");
        }
        break;
    case LM_ENTER:
        user->good_password = compare_password(crypted_password);
```

Copyright 1989
Logic Modeling Systems

LINE # SOURCE TEXT

```
        break;
    default:
        lm_queue_message(ERROR_MSG, "illegal attribute: %d",
                         attrib);
        break;
    }

    end_queue_message();
    end_put(user->fd);
}
```

Copyright 1989
Logic Modeling Systems

| HEADER FILE | DATE | PAGE # |
| --- | --- | --- |
| lm1000/function.h | 5/23/89 | 1/50 |
| | TIME 6:14:41 pm | |

LINE # HEADER TEXT

```
/* SCCS_ID: function.h rev 3.1, 4/24/89 at 07:52:59      */

extern void process_create_def_cmd();
extern void process_create_instance_cmd();
extern void process_create_fault_cmd();

extern void process_release_def_cmd();
extern void process_release_instance_cmd();
extern void process_release_fault_cmd();

extern void process_eval_cmd();

extern void process_save_def_cmd();
extern void process_save_def_cont_cmd();
extern void process_save_ptrn_cmd();
extern void process_save_ptrn_cont_cmd();
extern void process_restore_inst_cmd();
extern void process_restore_ptrn_cmd();
extern void process_ptrn_hist_cmd();

extern void process_inq_modeler_cmd();
extern void process_inq_user_list_cmd();
extern void process_inq_user_cmd();
extern void process_inq_lane_cmd();
extern void process_inq_pam_cmd();
extern void process_inq_pel_cmd();
extern void process_inq_device_list_cmd();
extern void process_inq_device_name_cmd();
extern void process_inq_device_cmd();
extern void process_inq_dab_cmd();
extern void process_inq_dab_loc_cmd();
extern void process_inq_instance_cmd();
extern void process_inq_fault_cmd();

extern void process_inq_avail_ptrn_cmd();

extern void process_tmeasurement_cmd();

extern void process_loop_ptrn_cmd();

extern void process_reset_inst_cmd();

extern void process_test_network_cmd();

extern void process_abort_cmd();

extern void process_begin_session_cmd();

extern void process_label_dab_cmd();

extern void process_eval_control_cmd();

extern void process_reboot_cmd();
extern void process_shutdown_cmd();

extern void process_check_dabdef_cmd();

extern void process_password_cmd();

extern void process_lm_read();
extern void process_lm_write();

extern void process_no_such();
```

Copyright 1989 Logic Modeling Systems

SOURCE PROGRAM lm1000/hardware.c | DATE 5/23/89 | TIME 6:14:41 pm | PAGE # 1/51

LINE # SOURCE TEXT

```
/* SCCS_ID: hardware.c rev 3.1, 4/24/89 at 07:53:02      */

#include "device.h"
#include "hardware.h"
#include "eeprom.h"
#include "lmserver.h"
#include "id.h"

#define LONG    0
#define SHORT   1
#define CHAR    2

extern void id_load();

typedef struct {
   DAB_EEPROM dab_eeprom;
   u_long     active;
} DAB_EEPROM_INFO;

DAB_EEPROM_INFO  dab_eeprom_info[MAX_LANE_COUNT][MAX_SLOT_COUNT];

/*-----------------------------------------------------------------------*/

init_dab_eeprom_info()
{
   u_char laneno;
   u_char slotno;

   for (laneno = 0; laneno < MAX_LANE_COUNT; ++laneno) {
      for (slotno = 0; slotno < MAX_SLOT_COUNT; ++slotno) {
         dab_eeprom_info[laneno][slotno].active = FALSE;
      }
   }
}

u_char
read_loc_char(address)
u_char *address;
{

#ifdef MODELER
   return(*address);
#else
#ifdef DIRECTCONN
   u_long value;

   dc_read_loc(CHAR, (u_long)address, &value);

   return(value & 0xff);
#else
   u_long value;

   (void)db_fetch((u_long)address, &value);

   return(value);
#endif
#endif
}

/*-----------------------------------------------------------------------*/

u_short
read_loc_short(address)
u_short *address;
{

#ifdef MODELER
   return(*address);
#else
#ifdef DIRECTCONN
   u_long value;

   dc_read_loc(SHORT, (u_long)address, &value);

   return(value & 0xffff);
#else

   u_long value;

   (void)db_fetch((u_long)address, &value);

   return(value);
#endif
#endif
}

/*-----------------------------------------------------------------------*/

u_long
read_loc_long(address)
u_long *address;
{
   /*
    * returns the contents of the location at address
    */
#ifdef MODELER
   return(*address);
#else
#ifdef DIRECTCONN
   u_long value;

   dc_read_loc(LONG, (u_long)address, &value);

   return(value);
#else
   u_long value;

   (void)db_fetch((u_long)address, &value);

   return(value);
#endif
#endif
}

/*-----------------------------------------------------------------------*/

void
write_loc_char(address, value)
u_char *address;
u_char value;
```

Copyright 1989
Logic Modeling Systems

SOURCE PROGRAM lm1000/hardware.c

DATE 5/23/89 TIME 6:14:41 pm PAGE # 2/52

LINE # SOURCE TEXT

```
{
   /*
    * write value into location address
    */

#ifdef MODELER
    *address = value;
#else
#ifdef DIRECTCONN
    dc_write_loc(CHAR, (u_long)address, value);
#else
    (void)db_write((u_long)address, value);
#endif
#endif
}

void
write_loc_short(address, value)
u_short *address;
u_short value;
{
   /*
    * write value into location address
    */

#ifdef MODELER
    *address = value;
#else
#ifdef DIRECTCONN
    dc_write_loc(SHORT, (u_long)address, value);
#else
    (void)db_write((u_long)address, value);
#endif
#endif
}

void
write_loc_long(address, value)
u_long *address;
u_long value;
{
   /*
    * write value into location address
    */

#ifdef MODELER
    *address = value;
#else
#ifdef DIRECTCONN
    dc_write_loc(LONG, (u_long)address, value);
#else
    (void)db_write((u_long)address, value);
#endif
#endif
}

/*--------------------------------------------------------------------------*/

probe(addr)
u_long addr;
{

#ifdef MODELER
   return(lm_read_probe(addr));
#else
#ifdef DIRECTCONN
   return(dc_probe(addr));
#else
   u_long junk;

   return(db_fetch(addr, &junk));
#endif
#endif
}

/*--------------------------------------------------------------------------*/

read_cpu(tot_system_mem, slot_count, lane_count)
u_long *tot_system_mem;
u_char *slot_count;
u_char *lane_count;
{
   /*
    * return the tot_system_mem, and clob_board_id.
    * This function better not fail !!.
    */
   ID_PROM_CPU  cpu_id_prom;
   u_long       status;
   u_short      model_number;
   u_char       dram_size;

#ifdef MODELER
   id_load((u_char *)CPU_ID_PROM_ADDR, (char *)&cpu_id_prom);

   dram_size = cpu_id_prom.dram_size;
   *tot_system_mem = (dram_size + 1) * ID_CPU_DRAM_SIZE_K;

   model_number = cpu_id_prom.model_number;

   if (model_number == 1000) {
      *slot_count = 8;
      *lane_count = 4;
   }

   return(SUCCESS);
#else
#ifdef DIRECTCONN
   *tot_system_mem = 4 * ID_CPU_DRAM_SIZE_K;

   model_number = 1000;

   if (model_number == 1000) {
      *slot_count = 8;
      *lane_count = 4;
   }

   return(SUCCESS);
#else

   *tot_system_mem    = read_loc_long((u_long *)CPU_MEM_SIZE_ADDR),
```

Copyright 1989
Logic Modeling Systems

| SOURCE PROGRAM | DATE | PAGE # |
|---|---|---|
| lm1000/hardware.c | 5/23/89 TIME 6:14:41 pm | 3/53 |

LINE # SOURCE TEXT

```
    *slot_count       = read_loc_long((u_long *)CPU_SLOT_COUNT_ADDR);
    *lane_count       = read_loc_long((u_long *)CPU_LANE_COUNT_ADDR);

    return(SUCCESS);
#endif
#endif
}

/*-----------------------------------------------------------------------*/

read_pac(lane_number)
u_char lane_number;
{
    /*
     * return the pac_board_id and the slot_count of the lane_number.
     * return 0 if lane does not exist else return 1.
     */

    u_long addr;

    addr = LANE_0_START_ADDR + lane_number * LANE_ADDR_INC +
           LANE_PAC_START_OFFSET + PAC_BOARD_ID_OFFSET;

    if (probe(addr) == FAILURE)
        return(FAILURE);

    return(SUCCESS);
}

/*-----------------------------------------------------------------------*/

read_pel(lane_number, slot_number, pel_board_id)
u_char lane_number;
u_char slot_number;
u_long *pel_board_id;
{
    /*
     * return the board_id of the PEL on geographical
     * address lane_number and slot_addr.
     * return 0 if PEL does not exist else return 1.
     */

    u_long addr;

    /* check if PEL exists */
    addr = LANE_0_START_ADDR + lane_number * LANE_ADDR_INC +
           LANE_PEL_0_START_OFFSET + slot_number * LANE_PEL_ADDR_INC +
           PEL_ID_PROM_OFFSET;

    if (probe(addr) == FAILURE)
        return(FAILURE);

    *pel_board_id = read_loc_long((u_long *)addr);

    return(SUCCESS);
}

/*-----------------------------------------------------------------------*/

read_tmg(tmg_board_id)
u_long *tmg_board_id;
{
    /*
     * return the board_id of the Timing Generator
     */

    u_long addr;

    addr = CLOB_START_ADDR + CLOB_BOARD_ID_OFFSET;

    if (probe(addr) == FAILURE)
        return(FAILURE);

    *tmg_board_id = read_loc_long((u_long *)addr);

    return(SUCCESS);
}

/*-----------------------------------------------------------------------*/

check_dab_present(lane_number, slot_number)
u_char          lane_number;
u_char          slot_number;
{
    u_long              addr;
    u_short             word;

    dab_eeprom_info[lane_number][slot_number].active = FALSE;
    if (dab_present(lane_number, slot_number) == FAILURE) {
        return(FAILURE);
    }

    addr = LANE_0_START_ADDR + lane_number * LANE_ADDR_INC +
           LANE_PEL_0_START_OFFSET + slot_number * LANE_PEL_ADDR_INC +
           PEL_STATUS_CONTROL_OFFSET;

    word = read_loc_long((u_long *)addr);

    /* assert RESET* with INITIALIZE 0 in anticipation for an
     * EEPROM write later.
     */
    word &= PEL_CS_RESET_MASK & PEL_CS_INITIALIZE_MASK;
    write_loc_long((u_long *)addr, (u_long)word);

    return(SUCCESS);
}

read_dab(lane_number, slot_number, man_id, dab_type, revision, part_name,
         model_maker, model_revision,
         dab_shape, dab_segment_number, insertion_count)
u_char lane_number;
u_char slot_number;
char *man_id;
char *dab_type;
char *revision;
char *part_name;
char *model_maker;
char *model_revision;
```

Copyright 1989
Logic Modeling Systems

LINE # SOURCE TEXT

```
u_long *dab_shape;
u_char *dab_segment_number;
u_short *insertion_count;
{
   /*
    * Return the info stored in the EEPROM for the DAB on
    * geographical address lane_number and slot_addr.
    * return 0 if DAB does not exist else return 1.
    */

#ifdef DBASE
   EEPROM_CONTENTS  *eeprom;
#endif
   DAB_EEPROM        dab_eeprom;
   u_long            addr;
   u_short           word;
   u_char            i;

   DPRINTF(("inside read_dab() lane: %d slot: %d\n",
           lane_number, slot_number));

   if (dab_present(lane_number, slot_number) == FAILURE) {
      DPRINTF(("dab absent\n"));
      dab_eeprom_info[lane_number][slot_number].active = FALSE;
      return(FAILURE);
   }

   DPRINTF(("dab present\n"));
#ifndef DBASE

   addr = LANE_0_START_ADDR + lane_number * LANE_ADDR_INC +
          LANE_PEL_0_START_OFFSET + slot_number * LANE_PEL_ADDR_INC +
          PEL_STATUS_CONTROL_OFFSET;

   /* Turn off the in use LED */
   word = read_loc_long((u_long *)addr) & 0xffff & PEL_CS_IN_USE_LED_MASK;
   write_loc_long((u_long *)addr, (u_long)word);

   DPRINTF(("rd: ln: %d sl: %d pel status: %04x\n",
           lane_number, slot_number, word));

   /* If the ACTIVE bit is set then we already know the contents of EEPROM */
   if (((word & ~PEL_CS_ACTIVE_MASK) != 0) &&
       (dab_eeprom_info[lane_number][slot_number].active == TRUE)) {
      dab_eeprom = dab_eeprom_info[lane_number][slot_number].dab_eeprom;
   }
   else {

      DPRINTF(("calling lm_read_eeprom() lane: %d slot: %d\n",
              lane_number, slot_number));
      /* assert RESET* */
      word &= PEL_CS_RESET_MASK;
      write_loc_long((u_long *)addr, (u_long)word);

      if (lm_read_eeprom(lane_number * MAX_SLOT_COUNT + slot_number,
                        &dab_eeprom) == FAILURE) {
         init_magic_and_pel(lane_number, slot_number);
         DPRINTF(("failure in lm_read_eeprom()\n"));
         dab_eeprom_info[lane_number][slot_number].active = FALSE;
         return(FAILURE);
      }

      dab_eeprom_info[lane_number][slot_number].active = TRUE;
      dab_eeprom_info[lane_number][slot_number].dab_eeprom = dab_eeprom;
   }

   for (i = 0; i < NAME_LENGTH; ++i)
      part_name[i] = dab_eeprom.device_name[i];
   part_name[i] = '\0';

   for (i = 0; i < MAKER_LENGTH; ++i)
      model_maker[i] = dab_eeprom.model_maker[i];
   model_maker[i] = '\0';

   for (i = 0; i < REV_LENGTH; ++i)
      model_revision[i] = dab_eeprom.model_revision[i];
   model_revision[i] = '\0';

   for (i = 0; i < MAN_LENGTH; ++i)
      man_id[i] = dab_eeprom.dab_manufacturer[i];
   man_id[i] = '\0';

   for (i = 0; i < REV_LENGTH; ++i)
      revision[i] = dab_eeprom.dab_revision[i];
   revision[i] = '\0';

   for (i = 0; i < TYPE_LENGTH; ++i)
      dab_type[i] = dab_eeprom.dab_type[i];
   dab_type[i] = '\0';

   *dab_shape           = dab_eeprom.configuration;
   *dab_segment_number  = dab_eeprom.segment_number;
   *insertion_count     = dab_eeprom.insertion_count;

   if (*dab_shape == 0) {
      init_magic_and_pel(lane_number, slot_number);
      DPRINTF(("dab shape is 0\n"));
      dab_eeprom_info[lane_number][slot_number].acti   = FALSE;
      return(FAILURE);
   }

   return(SUCCESS);
#else

   addr = LANE_0_START_ADDR + lane_number * LANE_ADDR_INC +
          LANE_PEL_0_START_OFFSET + slot_number * LANE_PEL_ADDR_INC;

   if (! db_fetch_array(addr + PEL_DAB_EEPROM_OFFSET, (char **)&eeprom))
      return(FAILURE);

   (void)strcpy(man_id, eeprom->man_id);
   (void)strcpy(dab_type, eeprom->dab_type);
   (void)strcpy(revision, eeprom->revision);
   (void)strcpy(part_name, eeprom->part_name);
   *dab_shape = eeprom->dab_shape;
   *dab_segment_number = eeprom->dab_segment_number;
   *insertion_count = 0;
   return(SUCCESS);
#endif
```

Copyright 1989
Logic Modeling Systems

SOURCE PROGRAM lm1000/hardware.c

DATE 5/23/89 TIME 6:14:41 pm PAGE # 5/55

LINE # SOURCE TEXT

```
/* ???
   if (! db_fetch_array(addr + 0xb00, (char **)&eeprom))
      return(FAILURE);

   (void)strcpy(man_id, eeprom->man_id);
   (void)strcpy(dab_type, eeprom->dab_type);
   (void)strcpy(revision, eeprom->revision);
   (void)strcpy(part_name, eeprom->part_name);
   *dab_shape = eeprom->dab_shape;
   *dab_segment_number = eeprom->dab_segment_number;
   *insertion_count = 0;
   return(SUCCESS);
*/
}

dab_present(lane_number, slot_number)
u_char  lane_number;
u_char  slot_number;
{
   u_long addr;
   u_long status;

   addr = LANE_0_START_ADDR + lane_number * LANE_ADDR_INC +
          LANE_PEL_0_START_OFFSET + slot_number * LANE_PEL_ADDR_INC +
          PEL_STATUS_CONTROL_OFFSET;

   /* PEL does not exist */
   if (system_config->lane[lane_number]->pel[slot_number] == NULL)
      return(FAILURE);

   status = read_loc_long((u_long *)addr);
   DPRINTF(("dp: ln: %d sl: %d pel status: %08x\n",
            lane_number, slot_number, status));

   if (status & ~PEL_CS_PRESENT_MASK)
      return(SUCCESS);

   return(FAILURE);
}

/*-----------------------------------------------------------------------*/

read_pam_count_reg(lane_number, count)
u_char lane_number;
u_char *count;
{
   u_long addr;
   u_long temp;

   *count = 0;

   if (read_pac(lane_number) == FAILURE)
      return(FAILURE);

   addr = LANE_0_START_ADDR + lane_number * LANE_ADDR_INC +
          LANE_PAC_START_OFFSET + PAC_PAM_COUNT_REG_OFFSET;

   temp = read_loc_long((u_long *)addr) & 0xf;

   switch (temp) {
   case PAC_PAM_COUNT_EQ_0:
      *count = 0;
      break;
   case PAC_PAM_COUNT_EQ_1:
      *count = 1;
      break;
   case PAC_PAM_COUNT_EQ_2:
      *count = 2;
      break;
   case PAC_PAM_COUNT_EQ_3:
      *count = 3;
      break;
   case PAC_PAM_COUNT_EQ_4:
      *count = 4;
      break;
   default:
      *count = 0;
      break;
   }
   return(SUCCESS);
}

/*-----------------------------------------------------------------------*/

read_pam_present(lane_number, pamno, value)
u_char lane_number;
u_char pamno;
u_char *value;
{
   /* If PAM present --> return "value" = 1 otherwise return "value" = 0 */

   u_long addr;

   *value = 0;
   if (read_pac(lane_number) == FAILURE)
      return(FAILURE);

   addr = LANE_0_START_ADDR + lane_number * LANE_ADDR_INC +
          LANE_PAC_START_OFFSET + PAC_PAM_0_PRESENT_REG_OFFSET +
          pamno * PAC_PAM_PRESENT_REG_ADDR_INC;

#ifndef DBASE
   /* PAM is present if D0 == 0 */
   *value = (read_loc_long((u_long *)addr) & 1) == 0;
#else
   *value = (read_loc_long((u_long *)addr) & 1) == 1;
#endif

   return(SUCCESS);
}

/*-----------------------------------------------------------------------*/

read_pam_id(lane_number, pamno, pam_type, pam_board_id)
u_char lane_number;
u_char pamno;
u_char *pam_type;
u_long *pam_board_id;
{
```

Copyright 1989
Logic Modeling Systems

LINE # SOURCE TEXT

```
    ID_PROM_PAM  pam_id_prom;
    u_long       addr;

    if (read_pac(lane_number) == FAILURE)
       return(FAILURE);

    /* The IDPROM on the PAM is located at the LSB of the longword boundary,
     * therefore we need to add 3 to the address.
     */
    addr = LANE_0_START_ADDR + lane_number * LANE_ADDR_INC +
           LANE_PAC_START_OFFSET + PAC_PAM_0_ID_SIZE_REG_OFFSET +
           pamno * PAC_PAM_ID_SIZE_REG_ADDR_INC + 3;

#ifdef MODELER
    id_load((u_char *)addr, (char *)&pam_id_prom);

    switch (pam_id_prom.generic.board_type) {
    case ID_BT_PAM128K:
       *pam_type = PAC_PAM_128K;
       break;
    case ID_BT_PAM512K:
       *pam_type = PAC_PAM_512K;
       break;
    case ID_BT_PAM2M:
       *pam_type = PAC_PAM_2M;
       break;
    default:
       *pam_type = PAC_PAM_128K;
       break;
    }

    *pam_board_id = 0;

#else
    *pam_type     = PAC_PAM_128K;
    *pam_board_id = 0;
#endif

    return(SUCCESS);
}

/*------------------------------------------------------------------------*/

cpu_tmg_interrupt_status()
{
    u_long status;

    /* This bit is active LOW */
    status = read_loc_long((u_long *)CPU_STATUS_REG_ADDR);

    if (status & ~CPU_TMG_INTR_MASK)
       return(FALSE);

    return(TRUE);
}

/*------------------------------------------------------------------------*/
```

| Copyright 1989 Logic Modeling Systems | SOURCE PROGRAM lm1000/hex.c | DATE 5/23/89 TIME 6:14:41 pm | PAGE # 1/57 |
|---|---|---|---|

LINE # SOURCE TEXT

```c
/* SCCS_ID: hex.c rev 3.1, 4/24/89 at 07:53:05      */

/*
** MAIN.C
** This file contains the startup code for the tasks.
** Tasks and resources begin here
*/
#include "common.h"
#include "cpu.h"
#include "task.h"
#include "lance.h"
#include "mod_err.h"
#include "nvaram.h"
#include "lm_rd_wr.h"

/*
** The globals
*/
BOOT_STRUCT boot;
extern unsigned long timer_semaphor, rcv_lance_pkt_semaphore;
int play_semaphore, malloc_semaphore;

/***************************************************************/
/*                          main                               */
/* The BSP creates the main task, and looks for the entry point */
/* named main.                                                 */
/***************************************************************/
u_long auto_start = 0;
main()
{

void    housekeeping_task();
void    output_routine( );
void    tx_task();
void    receive_task();
extern void     set_boot();
extern u_short lm_nvaram_access();
void pattern_task();
u_short write_lance_csr(), read_lance_csr();
int     err;
extern u_long modeler_inet;
extern          end;
unsigned long error;
        /*
        ** This routine initializes the partition used in the system.
        ** The only usage is by malloc and friends.
        */
        create_malloc_partition(&end, (u_long)CPU_RAM_SIZE - (u_long)(&end));
        /*
         * The LANCE requires that the STOP bit of CSR0 be set
         * before accessing CSR1, CSR2, or CSR3.
        if (write_lance_csr(SELECT_CSR0, STOP_ACTIVITY) == FAILURE)
                output_routine("Error Trying to set stop ");
         */
        if(lm_nvaram_access((char *) &boot, BOOT, SIZEOF_BOOT, MEMORY_READ,&error)==FAILURE)
        {
                output_routine( "\nFailed to read NVaram");
        }
        modeler_inet = boot.modeler_internet_address;
        /*
        ** initialize the fifos
        */
        fifo_initialize();
        /*
        ** create semaphor for timer
        ** 1 = init_value
        ** 0 = priority order
        */

        timer_semaphor = sc_screate( 1, 0, &err);
        if ( err ) output_routine("\nError creating timer semaphor");

        /*
        ** The malloc semaphore controls access to the malloc and free
        ** functions. This avoids re-entrancy problems associated with
        ** a multi-tasking environment.
        */
        malloc_semaphore = sc_screate( 1, 0, &err);
        if ( err ) output_routine("\nError creating malloc semaphor");

        /*
        ** end of play interrupt semaphore
        */
        play_semaphore = sc_screate( 0, 1, &err);
        if ( err ) sys_out("\nError creating event flag for EOP interrupt.");

        /*
        ** create semaphor for lance rcv ISR
        ** 0 = init_value
        ** 0 = priority order
        */
        rcv_lance_pkt_semaphore = sc_screate( 0, 0 , &err);
        if( err ) output_routine("\nError creating rcv lance pkt  semaphor");

        if (get_lance_ready_to_go() != SUCCESS) {
                output_routine("\nError getting the LANCE ready to go.");
                sc_tsuspend(0, 0, &err);
        }

        if (start_lance() != SUCCESS) {
                output_routine("\nError starting the LANCE.");
                sc_tsuspend(0, 0, &err);
        }
        /*
        ** spin of the tasks
        */
        sc_tcreate(housekeeping_task, HOUSEKEEPING_TASK_ID,
                                        HOUSEKEEPING_TASK_PRI,&err);
        if(err) output_routine("\nError creating housekeeping task.");



        sc_tcreate(tx_task, TRANSMIT_TASK_ID, TRANSMIT_TASK_PRI,&err);
        if(err) output_routine("\nError creating transmit task.");

        sc_tcreate( receive_task, RECEIVE_TASK_ID, RECEIVE_TASK_PRI, &err);
        if(err) output_routine("\nError creating receive task.");

        sc_tcreate( pattern_task, PATTERN_TASK_ID, PATTERN_TASK_PRI, &err);
        if(err) output_routine("\nError creating pattern task."),
```

Copyright 1989
Logic Modeling Systems

| SOURCE PROGRAM | DATE | PAGE # |
|---|---|---|
| lm1000/hex.c | 5/23/89 | 2/58 |
| | TIME 6:14:41 pm | |

LINE # SOURCE TEXT

```

        /* End of main task, main task commits suicide*/
        sc_tdelete( 0, 0, &err);

} /* end main */


/****************************************************************/
/*                          sys_out                             */
/* Sends message to serial channel A                            */
/****************************************************************/

sys_out( buf )
        char    *buf;
{
        while( *buf )
        {
                sc_putc( *buf++ );
        }
} /* end sys_out */
```

Copyright 1989 Logic Modeling Systems

| SOURCE PROGRAM | DATE | PAGE # |
|---|---|---|
| lm1000/hwconfig.c | 5/23/89 | 1/59 |
| | TIME 6:14:42 pm | |

LINE # SOURCE TEXT

```
/* SCCS_ID: hwconfig.c rev 1.1, 4/24/89 at 07:53:08      */

#include "device.h"
#include "message.h"
#include "hardware.h"
#include "mod_err.h"
#include "eeprom.h"
#include "lmserver.h"
#include "lnetwork.h"
#include "network.h"
#include "cpu.h"

#ifdef MODELER
#include "vrtx.h"
#endif


extern LM_HARDWARE_ERROR     modeler_error;
extern CONFIGURATION_ERRORS  config_error;

DAB_INFO  *bad_dab_list[MAX_LANE_COUNT * MAX_SLOT_COUNT];

#ifndef DBASE
/* Set this variable to FALSE (using adb) to skip TMG calibration. */
u_long        do_tmg_calibration = TRUE;
#else
u_long        do_tmg_calibration = FALSE;
#endif

#define LIGHT_FAULT_LED()         \
        (((cpu_control_reg_struct *)CPU_CONTROL_REG)->fault_led = LED_ON)

read_hw_config()
{
   /* Read the hardware configuration and fill in the data structure */

   SYSTEM_INFO       *new_system_info();
   LANE_INFO         *new_lane_info();
   PAM_INFO          *new_pam_info();
   PEL_INFO          *new_pel_info();
   LANE_INFO         *lane_ptr;
   PEL_INFO          *pel_ptr;
   u_long             board_id;
   u_char             laneno, pamno, slotno;
   u_char             fb_block_index;

#ifdef DIRECTCONN
   dc_ioinit();
#endif

   init_dab_eeprom_info();

   system_config = new_system_info();

   (void)read_cpu(&system_config->tot_system_mem,
                  &system_config->slot_count,
                  &system_config->phy_lane_count);

   if (read_tmg(&system_config->clob_board_id) == FAILURE) {
      LIGHT_FAULT_LED();
      lm_config_error(CERR_NO_TMG,0,0);
      write_config_error();
      return;
   }

#ifdef DIRECTCONN
   if (dc_init_pac() == FAILURE) {
      DPRINTF(("Error from dc_init_pac\n"));
      exit(1);
   }
#else
#ifdef MODELER
   if (backplane_reset() == FAILURE)
      DPRINTF(("ERROR in backplane_reset()\n"));
#else
   /* DBASE: don't do anything */
#endif
#endif

   if (do_tmg_calibration == TRUE) {
      DPRINTF(("calling tmg_calibrate()\n"));
      if (tmg_calibrate() == FAILURE) {
         DPRINTF(("FAILURE in tmg_calibrate()\n"));
         LIGHT_FAULT_LED();
         lm_config_error(CERR_TMG_CAL,0,0);
         write_config_error();
         return;
      }
   }

   for (laneno = 0; laneno < MAX_LANE_COUNT; laneno++) {
      /* check if the lane exists */
      lane_ptr = new_lane_info();
      system_config->lane[laneno] = lane_ptr;

      if (read_pac(laneno) == SUCCESS) {
         DPRINTF(("found lane: %d\n", laneno));
         lane_ptr->pac_present = TRUE;

         (void)configure_pam(laneno, lane_ptr);

         fb_block_index = 0;
         for (pamno = 0; pamno < MAX_PAM_COUNT; pamno++) {

            if (lane_ptr->pam[pamno] != NULL) {

               if (fb_block_index == 0)
                  fb_block_count_array[laneno].PAM_max_addr[fb_block_index] =
                     lane_offset(laneno) +
                     lane_ptr->pam[pamno]->mem_size * PTRN_ADDR_INC;
               else
                  fb_block_count_array[laneno].PAM_max_addr[fb_block_index] =
                     fb_block_count_array[laneno].
                                    PAM_max_addr[fb_block_index - 1] +
                        lane_ptr->pam[pamno]->mem_size * PTRN_ADDR_INC;

               fb_block_count_array[laneno].
                                    feedback_block_count[fb_block_index++] =
                  fb_block_count_for_PAM(lane_ptr->pam[pamno]->mem_size);
            }
```

Copyright 1989 Logic Modeling Systems

SOURCE PROGRAM lm1000/hwconfig.c

DATE 5/23/89 TIME 6:14:42 pm

PAGE # 2/60

LINE # SOURCE TEXT

```
            }
        }

        /* find all of the PEL's in this lane */
        for (slotno = 0;          < MAX_SLOT_COUNT; slotno++) {
            if (read_pel(laneno, slotno, &board_id)) {
                pel_ptr = new_pel_info();
                lane_ptr->pel[slotno] = pel_ptr;
                pel_ptr->board_id = board_id;
            }
        }
    }

    init_bad_dab_list();

    read_dab_configuration(dab_list);

    verify_dab_list(dab_list);

    /* We have to reset MAGIC ERRORs for ALL magic chips in the system, the
     * good ones and the bad ones.
     */

    reset_magic_error(dab_list);
    reset_magic_error(bad_dab_list);

    raise_pel_reset();

    rls_bad_dab_list();

    measure_dut_vcc(dab_list);

    build_free_block_list();

    write_config_error();
}

build_free_block_list()
{
    LANE_INFO *lane_ptr;
    u_long    total_mem;
    u_long    link_table_addr;
    u_long    max_link_table_addr;
    u_long    block_addr;
    u_short   i;
    u_short   block_count;
    u_char    laneno;
    u_char    pamno;

    for (laneno = 0; laneno < MAX_LANE_COUNT; ++laneno) {
        lane_ptr = system_config->lane[laneno];

        if (lane_ptr->pac_present == FALSE) {
            free_block_list[laneno] = NULL;
            continue;
        }

        /* Calculate total pattern memory */
        total_mem = 0;
        for (pamno = 0; pamno < MAX_PAM_COUNT; ++pamno) {

            if (lane_ptr->pam[pamno] != NULL) {

                total_mem += lane_ptr->pam[pamno]->mem_size;

            }
        }

        if (total_mem) {

            /* make the free_block_list point to block number 1 (second block) */
            free_block_list[laneno] = lane_offset(laneno) +
                BLOCK_ADDR_INC;

            /* Mark all blocks as being free in the link table */
            link_table_addr = lane_offset(laneno) + LANE_LINK_TABLE_OFFSET;


            block_count = total_mem / PTRN_PER_BLOCK;
            max_link_table_addr = link_table_addr +
                                  block_count * LINK_TABLE_ADDR_INC;

            while (link_table_addr != max_link_table_addr) {
                write_loc_long((u_long *)link_table_addr, (u_long)FREE_BLOCK_FLAG);
                link_table_addr += LINK_TABLE_ADDR_INC;
            }

            /* link all of the blocks */
            block_addr = free_block_list[laneno];
            for (i = 1; i < block_count; ++i) {
                /* write forward link */
                write_loc_long((u_long *)block_addr, block_addr + BLOCK_ADDR_INC);

                /* write backward link */
                write_loc_long((u_long *)(block_addr + 4),
                               block_addr - BLOCK_ADDR_INC);

                block_addr += BLOCK_ADDR_INC;
            }

            /* Fix the backward pointer of the HEAD of the list */
            write_loc_long((u_long *)(free_block_list[laneno] + 4), (u_long)NULL);

            /* Fix the forward pointer of the TAIL of the list */
            write_loc_long((u_long *)(block_addr - BLOCK_ADDR_INC), (u_long)NULL);
        }
        else
            free_block_list[laneno] = NULL;
    }
}

long calculate_pel_count(lane_number)
u_char lane_number;
{
    DAB_INFO *temp;
    u_char index;
    char i;
    u_char total_pel = 0;
    u_char dabno;
    u_char calculate_pel_count_in_segment();
```

Copyright 1989
Logic Modeling Systems

| SOURCE PROGRAM | DATE 5/23/89 | PAGE # |
|---|---|---|
| lm1000/hwconfig.c | TIME 6:14:42 pm | 3/61 |

LINE # SOURCE TEXT

```
    for (dabno = 0; dabno < MAX_LANE_COUNT * MAX_SLOT_COUNT; ++dabno) {
        if (dab_list[dabno] == NULL)
            continue;

        temp = dab_list[dabno];

        if (temp->segment[0] != NULL)
            total_pel += calculate_pel_count_in_segment(lane_number,
                                                         temp->segment[0]);
        else {
            index = 1;
            for (i = temp->segment_count; i >= 0; --i) {
                total_pel += calculate_pel_count_in_segment(lane_number,
                                                            temp->segment[index++]);
            }
        }
    }

    return(total_pel);
}

u_char calculate_pel_count_in_segment(lane_number, segment)
u_char lane_number;
SEGMENT_EL *segment;
{
    u_long mask;
    u_long shape_bit_map;
    u_char i;
    u_char count = 0;

    if (segment->lane_no > lane_number)
        return(0);
    else {
        shape_bit_map = segment->shape_bit_map;
        mask = 1 << (lane_number - segment->lane_no) * 8;
        for (i = 0; i < 8; ++i, mask <<= 1) {
            if (shape_bit_map & mask)
                ++count;
        }
    }

    return(count);
}

dab_loc(dab_ptr, dab_no)
DAB_INFO *dab_ptr;
u_long    dab_no;
{
    u_long    pro_number_of_locations_mark;
    long      *pro_lane_slot_array;
    u_long    shape_bit_map;
    u_long    mask;
    u_char    laneno, slotno;
    u_char    bit_no;
    u_char    seg_no;
    u_char    i, j;
    u_char    temp_lane;
    u_char    temp_slot;
    u_char    loc_count;

    pro_number_of_locations_mark = LM_MARK_BUFFER(lm_global_conn_ptr);
    lm_put_int(0);              /* advance the obuf ptr */

    pro_lane_slot_array = (long *)lm_get_cur_obuf_addr();

    loc_count = 0;
    if (dab_ptr->segment[0] != NULL) {
        laneno = dab_ptr->segment[0]->lane_no;
        slotno = dab_ptr->segment[0]->slot_no;
        shape_bit_map = dab_ptr->segment[0]->shape_bit_map;
        for (mask = 1, bit_no = 0; bit_no < 32; mask <<= 1, ++bit_no) {
            if (mask & shape_bit_map) {
                lm_put_int((long)(laneno + bit_no / 8));
                lm_put_int((long)(slotno + bit_no % 8));
                ++loc_count;
            }
        }
    }
    else {
        seg_no = dab_no + 1;

        laneno = dab_ptr->segment[seg_no]->lane_no;
        slotno = dab_ptr->segment[seg_no]->slot_no;
        shape_bit_map = dab_ptr->segment[seg_no]->shape_bit_map;
        for (mask = 1, bit_no = 0; bit_no < 32; mask <<= 1, ++bit_no) {
            if (mask & shape_bit_map) {
                lm_put_int((long)(laneno + bit_no / 8));
                lm_put_int((long)(slotno + bit_no % 8));
                ++loc_count;
            }
        }
    }

    LM_PUT_LONG_AT_MARK(pro_number_of_locations_mark, lm_global_conn_ptr,
                        loc_count);

    /* Now sort the array according to the lane number */
    for (i = 0; i < loc_count - 1; ++i) {
        for (j = i + 1; j < loc_count; ++j) {
            if (pro_lane_slot_array[i*2] > pro_lane_slot_array[j*2]) {
                temp_lane = pro_lane_slot_array[i*2];
                temp_slot = pro_lane_slot_array[i*2+1];

                pro_lane_slot_array[i*2]   = pro_lane_slot_array[j*2];
                pro_lane_slot_array[i*2+1] = pro_lane_slot_array[j*2+1];

                pro_lane_slot_array[j*2]   = temp_lane;
                pro_lane_slot_array[j*2+1] = temp_slot;
            }
        }
    }

    /* Then sort the array according to the slot number */
    for (i = 0; i < loc_count - 1; ++i) {
        for (j = i + 1; j < loc_count; ++j) {
            if (pro_lane_slot_array[i*2] == pro_lane_slot_array[j*2])
                if (pro_lane_slot_array[i*2+1] > pro_lane_slot_array[j*2+1]) {
                    temp_lane = pro_lane_slot_array[i*2];
                    temp_slot = pro_lane_slot_array[i*2+1];
```

Copyright 1989
Logic Modeling Systems

LINE # SOURCE TEXT

```
                pro_lane_slot_array[i*2]   = pro_lane_slot_array[j*2];
                pro_lane_slot_array[i*2+1] = pro_lane_slot_array[j*2+1];

                pro_lane_slot_array[j*2]   = temp_lane;
                pro_lane_slot_array[j*2+1] = temp_slot;
            }
        }
    }
}

read_dab_configuration(loc_dab_list)
DAB_INFO   *loc_dab_list[];
{
    DAB_INFO        *dab_ptr;
    DAB_INFO        *dab_ptr2;
    SEGMENT_EL      *seg;
    DAB_INFO        *new_dab_info();
    SEGMENT_EL      *new_segment();
    u_long           mask;
    u_long           dab_shape;
    u_char           *ptr, *end;
    u_short          insertion_count;
    u_char           count;
    u_char           dab_flag[MAX_LANE_COUNT][MAX_SLOT_COUNT];
    char             revision[REV_LENGTH + 1];
    char             dab_type[TYPE_LENGTH + 1];
    char             man_id[MAN_LENGTH + 1];
    char             model_maker[MAKER_LENGTH + 1];
    char             model_revision[REV_LENGTH + 1];
    u_char           slotno;
    u_char           laneno;
    char             dab_info_index;
    u_char           dab_segment_num;


    ptr = (u_char *)&dab_flag[0][0];
    end = &dab_flag[MAX_LANE_COUNT][0];  /* points to loc just past the array */
    while (ptr < end)
        *ptr++ = 0;

    for (slotno = 0; slotno < (MAX_LANE_COUNT * MAX_SLOT_COUNT); ++slotno)
        loc_dab_list[slotno] = NULL;

    for (laneno = 0; laneno < MAX_LANE_COUNT; ++laneno) {
        /* find all of the DAB's in this lane */
        dab_ptr = new_dab_info();
        for (slotno = 0; slotno < MAX_SLOT_COUNT; slotno++) {
            if (! dab_flag[laneno][slotno]) {
                dab_flag[laneno][slotno] = 1;

                if (read_dab(laneno, slotno,
                             man_id,
                             dab_type,
                             revision,
                             dab_ptr->part_name,
                             model_maker,
                             model_revision,
                             &dab_shape,
                             &dab_segment_num,
                             &insertion_count) == SUCCESS) {

                    for (count = 0, mask = 1; count < 32; mask <<= 1, ++count) {
                        if (dab_shape & mask)
                            dab_flag[laneno + count / 8][slotno + count % 8] = 1;
                    }

                    if ((short)(dab_info_index = find_dab(loc_dab_list,
                                                   dab_ptr->part_name,
                                                   (u_char)PUBLIC)) != -1)
                        dab_ptr2 = loc_dab_list[dab_info_index];
                    else
                        dab_ptr2 = NULL;

                    if (dab_ptr2 == NULL) {
                        enter_dab_info(loc_dab_list, dab_ptr, laneno, slotno);

                        seg = new_segment();

                        dab_ptr->segment[dab_segment_num] = seg;

                        seg->shape_bit_map     = dab_shape;
                        seg->lane_no           = laneno;
                        seg->slot_no           = slotno;
                        seg->insertion_count   = insertion_count;
                        (void)strcpy(seg->revision,        revision);
                        (void)strcpy(seg->dab_type,        dab_type);
                        (void)strcpy(seg->man_id,          man_id);
                        (void)strcpy(seg->model_maker,     model_maker);
                        (void)strcpy(seg->model_revision,  model_revision);

                        dab_ptr = new_dab_info();

                    }
                    else {
                        if (dab_segment_num != 0) {
                            if (dab_ptr2->segment[dab_segment_num] != NULL) {
                                /* The same kind of DAB has been seen before */
                                DPRINTF(("error: duplicate   ment\n"));
                                lm_config_error(CERR_DUPLIC..._SEGMENT,
                                                laneno, slotno);
                            }
                            else {
                                /* Other segment of the same part has been seen
                                 * before.
                                 */

                                seg = new_segment();

                                dab_ptr2->segment[dab_segment_num] = seg;

                                seg->shape_bit_map     = dab_shape;
                                seg->lane_no           = laneno;
                                seg->slot_no           = slotno;
                                seg->insertion_count   = insertion_count;
                                (void)strcpy(seg->revision,        revision);
                                (void)strcpy(seg->dab_type,        dab_type);
                                (void)strcpy(seg->man_id,          man_id);
                                (void)strcpy(seg->model_maker,     model_maker);
                                (void)strcpy(seg->model_revision,  model_revision);
```

Copyright 1989 Logic Modeling Systems

LINE # SOURCE TEXT

```
                        }
                    }
                    else {
                        enter_dab_info(loc_dab_list, dab_ptr, laneno, slotno);

                        seg = new_segment();

                        dab_ptr->segment[0] = seg;

                        seg->shape_bit_map     = dab_shape;
                        seg->lane_no           = laneno;
                        seg->slot_no           = slotno;
                        seg->insertion_count   = insertion_count;
                        (void)strcpy(seg->revision,         revision);
                        (void)strcpy(seg->dab_type,         dab_type);
                        (void)strcpy(seg->man_id,           man_id);
                        (void)strcpy(seg->model_maker,      model_maker);
                        (void)strcpy(seg->model_revision,   model_revision);

                        dab_ptr = new_dab_info();
                    }
                }
            }
        }
    }

    rls_dab_info(dab_ptr);
  }
}

reset_magic_error(loc_dab_list)
DAB_INFO *loc_dab_list[];
{
   DAB_INFO *dab_ptr;
   u_long    dab_shape;
   u_long    junk;
   u_long    mask;
   u_long    magic_addr;
   u_char    lanenobase;
   u_char    slotnobase;
   u_char    laneno;
   u_char    slotno;
   u_char    dabno;
   u_char    count;
   u_char    i;

   /* Reset each MAGIC chip error register in the system and also set the
    * ACTIVE bit.
    * Note that at this point the loc_dab_list has not been verified yet,
    * so there could be missing segments.
    */
   for (dabno = 0; dabno < MAX_LANE_COUNT * MAX_SLOT_COUNT; ++dabno) {
      if (loc_dab_list[dabno] == NULL)
         continue;

      dab_ptr = loc_dab_list[dabno];

      /* We don't need to reset magic if all units of the DABs are active */
      if (all_dab_unit_active_and_initialized(dab_ptr) == TRUE) {
         DPRINTF(("dab: %d active --> don't reset\n", dabno));
         continue;
      }

      DPRINTF(("reset dab: %d\n", dabno));

      if (dab_ptr->segment[0] != NULL) {
         /* This is a single segment device */
         lanenobase = dab_ptr->segment[0]->lane_no;
         slotnobase = dab_ptr->segment[0]->slot_no;
         dab_shape = dab_ptr->segment[0]->shape_bit_map;

         for (count = 0, mask = 1; count < 32; mask <<= 1, ++count) {
            if (dab_shape & mask) {

               laneno = lanenobase + count / 8;
               slotno = slotnobase + count % 8;

               if (read_pel(laneno, slotno, &junk) == SUCCESS) {
                  /* We only need to read reg 15 from ONE of the MAGIC Chip
                   * to reset the error register of ALL MAGIC Chips.
                   */
                  magic_addr = LANE_0_START_ADDR + laneno * LANE_ADDR_INC +
                     LANE_PEL_0_START_OFFSET + slotno * LANE_PEL_ADDR_INC +
                     PEL_MC_0_OFFSET;

                  (void)read_loc_long((u_long *)
                                      (magic_addr + MC_RESET_REG_OFFSET));

                  /* Need to read some other Magic register to affect reset */
                  (void)read_loc_long((u_long *)
                                      (magic_addr + MC_DATA_OUT_REG_OFFSET));

                  init_dab(laneno, slotno);
               }
            }
         }
      }
      else {
         /* This is a multi segments device */
         for (i = 0; i <= MAX_SEGMENT_PER_DEVICE; ++i) {

            if (dab_ptr->segment[i] == NULL)
               continue;

            lanenobase = dab_ptr->segment[i]->lane_no;
            slotnobase = dab_ptr->segment[i]->slot_no;
            dab_shape = dab_ptr->segment[i]->shape_bit_map;

            for (count = 0, mask = 1; count < 32; mask <<= 1, ++count) {
               if (dab_shape & mask) {
                  laneno = lanenobase + count / 8;
                  slotno = slotnobase + count % 8;

                  if (read_pel(laneno, slotno, &junk) == SUCCESS) {
                     /* We only need to read reg 15 from ONE of the MAGIC Chip
                      * to reset the error register of ALL MAGIC Chips.
                      */
                     magic_addr = LANE_0_START_ADDR + laneno * LANE_ADDR_INC +
                        LANE_PEL_0_START_OFFSET + slotno * LANE_PEL_ADDR_INC +
                        PEL_MC_0_OFFSET;
```

Copyright 1989 Logic Modeling Systems

SOURCE PROGRAM lm1000/hwconfig.c | DATE 5/23/89 | TIME 6:14:42 pm | PAGE # 6/64

LINE # SOURCE TEXT

```
                        (void)read_loc_long((u_long *)
                                    (magic_addr + MC_RESET_REG_OFFSET));

                        /* Need to read some other Magic reg to affect reset */
                        (void)read_loc_long((u_long *)
                                    (magic_addr + MC_DATA_OUT_REG_OFFSET));

                        (void)read_loc_long((u_long *)magic_addr);

                        init_dab(laneno, slotno);
                    }
                }
            }
        }
    }
  }
}

verify_dab_list(loc_dab_list)
DAB_INFO *loc_dab_list[];
{
   /* Verify that
    *    - all of the PEL's exist to support the DAB's.
    *    - the PAMs exist in each lane occupied by the DAB
    *    - all segments of parts exists.
    *    - duplicate devices have the same unit_location
    * Set up the unit_addr field in the dab_info.
    * Set up the last_in_lane field of the unit_addr_el
    * Set up lane_used[]
    * Set up lane_count
    * Set up unit_count_per_lane
    * Set up the dummy_ptrs
    * Set up ident_lane
    * Make the lane point to the most significant DAB.
    */

   DAB_INFO     *dab_ptr;
   DAB_INFO     *dab_ptr2;
   u_long       mask;
   u_long       dab_shape;
   u_char       pel_location[MAX_LANE_COUNT][MAX_SLOT_COUNT];
   u_char       cur_unit;
   u_char       laneno;
   u_char       slotno;
   u_char       count;
   u_char       i, j;
   u_char       last_segment_num;
   u_char       dabno;
   u_char       dabno2;

   for (dabno = 0; dabno < (MAX_LANE_COUNT * MAX_SLOT_COUNT); ++dabno) {

      if (loc_dab_list[dabno] == NULL)
         continue;

      dab_ptr = loc_dab_list[dabno];

      if (dab_ptr->segment[0] != NULL) {
         /* This is a single segment device */

         dab_ptr->segment_count = 1;
         cur_unit = 0;
         laneno = dab_ptr->segment[0]->lane_no;
         slotno = dab_ptr->segment[0]->slot_no;
         dab_shape = dab_ptr->segment[0]->shape_bit_map;

         for (count = 0, mask = 1; count < 32; mask <<= 1, ++count) {
            if (dab_shape & mask) {
               dab_ptr->unit_location[cur_unit].lane_no = laneno + count / 8;
               dab_ptr->unit_location[cur_unit].slot_no = slotno + count % 8;
               ++cur_unit;
            }
         }

         dab_ptr->unit_count = cur_unit;

         if (check_pel_and_pam(dab_ptr) == FAILURE)
            remove_dab_info(loc_dab_list, dabno);
         else
            set_last_in_lane(dab_ptr);
      }
      else {
         /* This is a multi segments device */
         /* find the last segment */
         for (i = MAX_SEGMENT_PER_DEVICE; i > 0; --i) {
            if (dab_ptr->segment[i] != NULL)
               break;
         }

         dab_ptr->segment_count = i;

         cur_unit = 0;
         last_segment_num = i;
         for (i = 1; i <= last_segment_num; i++) {
            if (dab_ptr->segment[i] == NULL)
               break;
            else {
               laneno = dab_ptr->segment[i]->lane_no;
               slotno = dab_ptr->segment[i]->slot_no;
               dab_shape = dab_ptr->segment[i]->shape_bit_map;

               for (count = 0, mask = 1; count < 32; mask <<= 1, ++count) {
                  if (dab_shape & mask) {
                     if (cur_unit == MAX_UNIT_COUNT) {
                        for (j = 1; j <= last_segment_num; j++) {
                           lm_config_error(CERR_DEVICE_TOO_LARGE,
                                          dab_ptr->segment[j]->lane_no,
                                          dab_ptr->segment[j]->slot_no);
                        }

                        remove_dab_info(loc_dab_list, dabno);

                        goto next;
                     }

                     dab_ptr->unit_location[cur_unit].lane_no =
                                                     laneno + count / 8;
                     dab_ptr->unit_location[cur_unit].slot_no =
                                                     slotno + count % 8;
```

Copyright 1989
Logic Modeling Systems

| SOURCE PROGRAM | DATE | 5/23/89 | PAGE # |
|---|---|---|---|
| lm1000/hwconfig.c | TIME | 6:14:42 pm | 7/65 |

LINE # SOURCE TEXT

```
                    ++cur_unit;
                }
            }
        }
    }

    dab_ptr->unit_count = cur_unit;

    if (i != last_segment_num) {
        /* Not all of the segments of the device were found.
         * Consider this device unusable and remove it from the dab_list
         */
        for (i = 1; i <= MAX_SEGMENT_PER_DEVICE; ++i) {
            if (dab_ptr->segment[i] == NULL)
                continue;
            lm_config_error(CERR_MISSING_SEGMENT,
                            dab_ptr->segment[i]->lane_no,
                            dab_ptr->segment[i]->slot_no);
        }

        remove_dab_info(loc_dab_list, dabno);
    }
    else {
        /* All of the segments were found */

        if (check_pel_and_pem(dab_ptr) == FAILURE) {
            remove_dab_info(loc_dab_list, dabno);
        }
        else {
            /* Make the lane point to the most significant segment */
            set_last_in_lane(dab_ptr);
        }
    }
  }
next:
    ;
  }

  /* Make sure that duplicate devices have the same relative unit_location.
   * Note: only single segment devices can have duplicates at this point.
   */
  for (dabno = 0; dabno < (MAX_LANE_COUNT * MAX_SLOT_COUNT) - 1; ++dabno) {

      if (loc_dab_list[dabno] == NULL)
          continue;

      dab_ptr = loc_dab_list[dabno];

      for (dabno2 = dabno + 1;
           dabno2 < (MAX_LANE_COUNT * MAX_SLOT_COUNT); ++dabno2) {

          if (loc_dab_list[dabno2] == NULL)
              continue;

          dab_ptr2 = loc_dab_list[dabno2];

          if (strcmp(dab_ptr->part_name, dab_ptr2->part_name) == 0) {
              if (cmp_dab_shape(dab_ptr, dab_ptr2) == FALSE) {
                  lm_config_error(CERR_ILLEGAL_DUPLICATE_DEVICE,
                                  dab_ptr2->segment[0]->lane_no,
                                  dab_ptr2->segment[0]->slot_no);
                  remove_dab_info(loc_dab_list, dabno2);
              }
          }
      }
  }

  /* Create a MAP of the PEL location to be used to check pel sta king */
  for (laneno = 0; laneno < MAX_LANE_COUNT; ++laneno) {
      for (slotno = 0; slotno < MAX_SLOT_COUNT; ++slotno) {
          pel_location[laneno][slotno] = 0;

          if (system_config->lane[laneno]->pel[slotno] != NULL)
              pel_location[laneno][slotno] = 1;
      }
  }

  for (dabno = 0; dabno < MAX_LANE_COUNT * MAX_SLOT_COUNT; ++dabno) {
      dab_ptr = loc_dab_list[dabno];

      if (dab_ptr == NULL)
          continue;

      if (check_pel_stacking(dab_ptr, pel_location) == FAILURE) {
          if (dab_ptr->segment[0] != NULL) {
              /* This is a single segment device */
              lm_config_error(CERR_ILLEGAL_PEL_STACKING,
                              dab_ptr2->segment[0]->lane_no,
                              dab_ptr2->segment[0]->slot_no);

              remove_dab_info(loc_dab_list, dabno);
          }
          else {
              /* This is a multi segment device */
              for (i = 1; i <= MAX_SEGMENT_PER_DEVICE; ++i) {
                  if (dab_ptr->segment[i] == NULL)
                      continue;

                  lm_co ^'ig_error(CERR_ILLEGAL_PEL_STACKING,
                                  dab_ptr->segment[i]->lane_no,
                                  dab_ptr->segment[i]->slot_no);
              }

              remove_dab_info(loc_dab_list, dabno);
          }
      }
  }

#ifdef DEBUG
  for (dabno = 0; dabno < (MAX_LANE_COUNT * MAX_SLOT_COUNT); ++dabno) {
      if (loc_dab_list[dabno] == NULL)
          continue;

      dab_ptr = loc_dab_list[dabno];

      DPRINTF(("device name           : %s\n", dab_ptr->part_name));
      DPRINTF(("unit_count_per_lane   : %d\n", dab_ptr->unit_count_per_lane));
      DPRINTF(("segment_count         : %d\n", dab_ptr->segment_count));
      DPRINTF(("lane_count            : %d\n", dab_ptr->lane_count));
      DPRINTF(("unit_count            : %d\n", dab_ptr->unit_count));
```

Copyright 1989
Logic Modeling Systems

SOURCE PROGRAM lm1000/hwconfig.c | DATE 5/23/89 | TIME 6:14:42 pm | PAGE # 8/66

LINE # SOURCE TEXT

```
        DPRINTF(("unit_location           : \n"));
        for (i = 0; i < dab_ptr->unit_count; ++i) {
           DPRINTF(("   lane: %d   slot: %d\n",
                  dab_ptr->unit_location[i].lane_no,
                  dab_ptr->unit_location[i].slot_no));
        }
     }
#endif
}

check_pel_and_pam(dab_ptr)
DAB_INFO *dab_ptr;
{
   /* Check to make sure that each unit of the device is supported by a PEL,
    * also that it is backed by PAM.
    */

   short i;
   u_char laneno, slotno;
   u_char any_error = FALSE;

   for (i = dab_ptr->unit_count - 1; i >= 0; --i) {
      laneno = dab_ptr->unit_location[i].lane_no;
      slotno = dab_ptr->unit_location[i].slot_no;

      /* Check if the PEL exists on this slot */
      if (system_config->lane[laneno]->pel[slotno] == NULL) {
         lm_config_error(CERR_NO_PEL_FOR_DAB,
                     dab_ptr->unit_location[i].lane_no,
                     dab_ptr->unit_location[i].slot_no);
         any_error = TRUE;
      }

      /* Check if the PAC exists */
      if (system_config->lane[laneno]->pac_present == FALSE) {
         lm_config_error(CERR_NO_PAM_FOR_DAB,
                     dab_ptr->unit_location[i].lane_no,
                     dab_ptr->unit_location[i].slot_no);
         any_error = TRUE;
         continue;
      }

      /* Check if the PAM exists on this lane */
      if (system_config->lane[laneno]->pam[0] == NULL) {
         lm_config_error(CERR_NO_PAM_FOR_DAB,
                     dab_ptr->unit_location[i].lane_no,
                     dab_ptr->unit_location[i].slot_no);
         any_error = TRUE;
      }
   }

   if (any_error == FALSE)
      return(SUCCESS);
   else
      return(FAILURE);
}

remove_dab_info(loc_dab_list, dabno)
DAB_INFO   *loc_dab_list[];
u_char      dabno;
{
   /* Remove the dab_info from the loc_dab_list and put it to bad_dab_list. */
   DAB_INFO  *dab_ptr;

   dab_ptr = loc_dab_list[dabno];

   bad_dab_list[dabno] = dab_ptr;

   loc_dab_list[dabno] = NULL;
}

init_dab(laneno, slotno)
u_char laneno;
u_char slotno;
{
   /* Initialize the DAB (set the ACTIVE bit) at the laneno/slotno. */
   u_long    addr;
   u_short   word;

   addr = LANE_0_START_ADDR + laneno * LANE_ADDR_INC +
          LANE_PEL_0_START_OFFSET + slotno * LANE_PEL_ADDR_INC +
          PEL_STATUS_CONTROL_OFFSET;

   /* assert RESET* */
   word = read_loc_long((u_long *)addr);
   DPRINTF(("id: ln: %d sl: %d pel status: %04x\n", laneno, slotno, word));
   word &= PEL_CS_RESET_MASK;
   write_loc_long((u_long *)addr, (u_long)word);

   /* write INITIALIZE to 0 with RESET* == 0*/
   word = read_loc_long((u_long *)addr);
   word = (word & PEL_CS_INITIALIZE_MASK);
   write_loc_long((u_long *)addr, (u_long)word);

   /* write INITIALIZE to 1 with RESET* == 0*/
   word = read_loc_long((u_long *)addr);
   word = word | ~PEL_CS_INITIALIZE_MASK;
   write_loc_long((u_long *)addr, (u_long)word);

   /* deassert RESET* */
   word = read_loc_long((u_long *)addr);
   word |= ~PEL_CS_RESET_MASK;

   /* ???? disable magic error*/
/*   word |= ~PEL_CS_MAGIC_ERROR_ENABLE_MASK; */

   write_loc_long((u_long *)addr, (u_long)word);

}

reconfigure_dab()
{
   DAB_INFO               *new_dab_list[MAX_LANE_COUNT*MAX_SLOT_COUNT],
   EXTRA_DEVICE_SPEC      *extra_def_ptr;
   USER_INFO              *user;
   DEVICE_SPEC            *definition;
   INSTANCE_INFO          *instance;
   DAB_INFO               *dab_ptr;
   DAB_INFO               *new_dab_ptr;
   u_short                 dab_info_index;
```

Copyright 1989
Logic Modeling Systems

SOURCE PROGRAM: lm1000/hwconfig.c

DATE 5/23/89 TIME 6:14:42 pm PAGE # 9/67

LINE # SOURCE TEXT

```
    u_short              inst_id;
    u_char               slotno;
    u_char               userno;
    u_char               again_count = 0;

again:
    modeler_error.dab_change = FALSE;

    DPRINTF(("waiting for DAB to settle\n"));
    lm_delay((u_long)(1 * 1000));

    if (modeler_error.error == TRUE) {
       modeler_error.error = FALSE;

       if ((modeler_error.pac_lane_errors != 0) ||
           (modeler_error.tmg_error == TRUE) ||
           (modeler_error.unknown_source_of_interrupt == TRUE)) {
          fatal_hardware_error_encountered = TRUE;
          return;
       }
    }

    /* We are going to reconfigure the DABs --> reinitialize the structure */
    config_error.duplicate_segment          = 0;
    config_error.missing_segment            = 0;
    config_error.no_pal_for_dab             = 0;
    config_error.no_pam_for_dab             = 0;
    config_error.illegal_duplicate_device   = 0;
    config_error.device_too_large           = 0;
    config_error.illegal_pal_stacking       = 0;
    non_fatal_configuration_error_encountered = FALSE;

    init_bad_dab_list();

    read_dab_configuration(new_dab_list);

    update_nvram_dab_insertion(new_dab_list);

    verify_dab_list(new_dab_list);

    for (userno = 0; userno < MAX_USER_COUNT; ++userno) {
       user = user_info_array[userno];

       if (user->active == FALSE)
          continue;

       for (inst_id = 0; inst_id < user->inst_table_size; ++inst_id) {

          instance = user->instance[inst_id];

          if (BOGUS_INSTANCE(user, instance))
             continue;

          definition = instance->definition;

          extra_def_ptr = (EXTRA_DEVICE_SPEC *)definition->extra_data;
          if (extra_def_ptr->dab_ok == TRUE) {
             dab_info_index = instance->dab_info_index;

             dab_ptr      = dab_list[dab_info_index];
             new_dab_ptr  = new_dab_list[dab_info_index];

             if ((new_dab_ptr != NULL) &&
                 (strcmp(dab_ptr->part_name,
                         new_dab_ptr->part_name) == 0) &&
                 (cmp_dab_location(dab_ptr, new_dab_ptr) == TRUE)) {
                /* The same DAB is present in the same location */

                if (all_dab_unit_active_and_initialized(dab_ptr) == FALSE) {
                   /* Check to see if the DAB is touched (removed and inserted
                    * back again) at all by looking at the ACTIVE bit.
                    */
                   if (definition->device_type == PRIVATE) {
                      /* If any of them is touched then invalidate PRIVATE
                       * device.
                       */
                      extra_def_ptr->dab_ok = FALSE;
                      instance->dab_info_index = -1;
                   }
                }
             }
             else {
                /* The DAB is removed or changed */
                extra_def_ptr->dab_ok = FALSE;
                instance->dab_info_index = -1;
             }
          }

          /* Increment the DAB_INFO.act_inst_count or DAB_INFO.act_var_count;
           * Set the DAB_INFO.used_as_private appropriately.
           */
          if (extra_def_ptr->dab_ok == TRUE) {
             if (instance->is_fault == TRUE)
                ++new_dab_ptr->act_var_count;
             else {
                ++new_dab_ptr->act_inst_count;
                if (definition->device_type == PRIVATE)
                   new_dab_ptr->used_as_private = TRUE;
             }
          }
       }
    }

    /* We have to reset MAGIC ERRORs for ALL magic chips in the system; the
     * good ones and the bad ones.
     */
    reset_magic_error(new_dab_list);
    reset_magic_error(bad_dab_list);

    raise_pel_reset();

    rls_bad_dab_list();

    measure_dut_vcc(new_dab_list);

    /* release the old dab_list */
    for (slotno = 0; slotno < (MAX_LANE_COUNT * MAX_SLOT_COUNT); ++slotno) {
       if (dab_list[slotno] != NULL) {
          rls_dab_info(dab_list[slotno]);
          dab_list[slotno] = NULL;
```

Copyright 1989 Logic Modeling Systems

SOURCE PROGRAM lm1000/hwconfig.c | DATE 5/23/89 | TIME 6:14:42 pm | PAGE # 10/68

LINE # SOURCE TEXT

```
        }
    }

    DPRINTF(("DAB found: \n"));
    /* copy the new_dab list to dab_list */
    for (slotno = 0; slotno < (MAX_LANE_COUNT * MAX_SLOT_COUNT); ++slotno) {
        if (new_dab_list[slotno] != NULL) {
            dab_list[slotno] = new_dab_list[slotno];

            DPRINTF(("%s\n", dab_list[slotno]->part_name));

            /* Turn on IN_USE led */
            if ((dab_list[slotno]->act_inst_count +
                dab_list[slotno]->act_var_count) != 0)
                turn_on_in_use(dab_list[slotno]);
        }
    }

    clear_non_fatal_mod_err();

    if (any_pel_with_reset_asserted() == TRUE) {
        if (again_count++ < 10) {
            DPRINTF(("some pels still have reset asserted\n"));
            goto again;
        }
        else {
            DPRINTF(("Infinite loop detected in reconfigure_dab. Bailing out...\n"));
        }
    }

    DPRINTF(("exiting reconfigure_dab\n"));
}

any_pel_with_reset_asserted()
{
    u_long    addr;
    u_short   word;
    u_char    laneno;
    u_char    slotno;

    for (laneno = 0; laneno < MAX_LANE_COUNT; ++laneno) {
        for (slotno = 0; slotno < MAX_SLOT_COUNT; ++slotno) {

            if (system_config->lane[laneno]->pel[slotno] == NULL)
                continue;

            addr = LANE_0_START_ADDR + laneno * LANE_ADDR_INC +
                LANE_PEL_0_START_OFFSET + slotno * LANE_PEL_ADDR_INC +
                PEL_STATUS_CONTROL_OFFSET;

            word = read_loc_long((u_long *)addr);
            DPRINTF(("apwra: ln: %d sl: %d pel status: %04x\n",
                     laneno, slotno, word));

            if ((word & ~PEL_CS_RESET_MASK) == 0) {
                DPRINTF(("pel reset on lane: %d slot: %d still asserted\n",
                         laneno, slotno));
                return(TRUE);
            }
        }
    }
    return(FALSE);
}
cmp_dab_location(dab_ptr1, dab_ptr2)
DAB_INFO  *dab_ptr1;
DAB_INFO  *dab_ptr2;
{
    /* compare the each unit position of dab_ptr1 and dab_ptr2.
     * Return TRUE if they are the same else return FALSE.
     */

    u_char  unitno;
    u_char  total_unit;

    if (dab_ptr1->unit_count != dab_ptr2->unit_count)
        return(FALSE);

    if (dab_ptr1->unit_count_per_lane != dab_ptr2->unit_count_per_lane)
        return(FALSE);

    total_unit = dab_ptr1->unit_count;
    for (unitno = 0; unitno < total_unit; ++unitno) {
        if ((dab_ptr1->unit_location[unitno].lane_no !=
             dab_ptr2->unit_location[unitno].lane_no) ||
            (dab_ptr1->unit_location[unitno].slot_no !=
             dab_ptr2->unit_location[unitno].slot_no))
           return(FALSE);

    }
    return(TRUE);
}

cmp_dab_shape(dab_ptr1, dab_ptr2)
DAB_INFO  *dab_ptr1;
DAB_INFO  *dab_ptr2;
{
    /* compare the each unit relative position of dab_ptr1 and dab_ptr2.
     * Return TRUE if they are the same else return FALSE.
     */

    u_char  unitno;
    u_char  total_unit;
    u_char  laneno1;
    u_char  slotno1;
    u_char  laneno2;
    u_char  slotno2;

    if (dab_ptr1->unit_count != dab_ptr2->unit_count)
        return(FALSE);

    if (dab_ptr1->unit_count_per_lane != dab_ptr2->unit_count_per_lane)
        return(FALSE);

    laneno1 = dab_ptr1->unit_location[0].lane_no;
    laneno2 = dab_ptr2->unit_location[0].lane_no;
    slotno1 = dab_ptr1->unit_location[0].slot_no;
    slotno2 = dab_ptr2->unit_location[0].slot_no;

    total_unit = dab_ptr1->unit_count;
    for (unitno = 0; unitno < total_unit; ++unitno) {
```

Copyright 1989
Logic Modeling Systems

SOURCE PROGRAM lm1000/hwconfig.c | DATE 5/23/89 | TIME 6:14:42 pm | PAGE # 11/69

LINE # SOURCE TEXT

```
        if ((dab_ptr1->unit_location[unitno].lane_no == laneno1 !=
             dab_ptr2->unit_location[unitno].lane_no == laneno2) ||
            (dab_ptr1->unit_location[unitno].slot_no == slotno1 !=
             dab_ptr2->unit_location[unitno].slot_no == slotno2))
           retur[illegible]SE);

   }
   return(TRUE);
}

measure_dut_vcc(loc_dab_list)
DAB_INFO  *loc_dab_list[];
{
   DAB_INFO   *dab_ptr;
   u_long      addr;
   u_long      delay;
   u_char      laneno;
   u_char      slotno;
   u_char      dabno;
   u_char      value;

   for (dabno = 0; dabno < (MAX_LANE_COUNT * MAX_SLOT_COUNT); ++dabno) {

      if (loc_dab_list[dabno] == NULL)
         continue;

      dab_ptr = loc_dab_list[dabno];

      laneno = dab_ptr->unit_location[0].lane_no;
      slotno = dab_ptr->unit_location[0].slot_no;

      addr = LANE_0_START_ADDR + laneno * LANE_ADDR_INC +
             LANE_PEL_0_START_OFFSET + slotno * LANE_PEL_ADDR_INC +
             PEL_DUTVCC_DAC_READ_OFFSET;

      /* The first measurement is always wrong after power up */
#ifndef DBASE
      value = read_loc_long((u_long *)addr) & 0xff;
      delay = 1000;
      while (--delay) ;
      value = read_loc_long((u_long *)addr) & 0xff;
#else
      value = 0xd5;
#endif

      dab_ptr->dut_vcc_measured = MAX_DUT_VCC_VOLTAGE * value / 256;

      DPRINTF(("dut measured: %d\n", dab_ptr->dut_vcc_measured));
   }
}

init_bad_dab_list()
{
   u_char slotno;

   for (slotno = 0; slotno < MAX_LANE_COUNT * MAX_SLOT_COUNT; ++slotno)
      bad_dab_list[slotno] = NULL;
}

rls_bad_dab_list()
{
   u_char slotno;
   for (slotno = 0; slotno < (MAX_LANE_COUNT * MAX_SLOT_COUNT); ++slotno) {
      if (bad_dab_list[slotno] == NULL)
         continue;

      rls_dab_info(bad_dab_list[slotno]);

      bad_dab_list[slotno] = NULL;
   }
}

all_dab_unit_active_and_initialized(dab_ptr)
DAB_INFO  *dab_ptr;
{
   /* Return TRUE if all unit of DAB has the ACTIVE bit, the
    * INITIALIZE bit set, and RESET is deasserted. The INITIALIZE bit
    * is set to 0 when we are labeling the DAB.
    */
   u_long  addr;
   u_short value;
   u_char  total_unit;
   u_char  unitno;
   u_char  laneno;
   u_char  slotno;

   total_unit = dab_ptr->unit_count;
   for (unitno = 0; unitno < total_unit; ++unitno) {
      laneno = dab_ptr->unit_location[unitno].lane_no;
      slotno = dab_ptr->unit_location[unitno].slot_no;

      addr = LANE_0_START_ADDR + laneno * LANE_ADDR_INC +
             LANE_PEL_0_START_OFFSET + slotno * LANE_PEL_ADDR_INC +
             PEL_STATUS_CONTROL_OFFSET;

      value = (u_short)read_loc_long((u_long *)addr);
      DPRINTF(("aduaai: ln: %d sl: %d pel status: %04x\n",
               laneno, slotno, value));

      if (((value & ~PEL_CS_ACTIVE_MASK) == 0) ||
          ((value & ~PEL_CS_INITIALIZE_MASK) == 0) ||
          ((value & ~PEL_CS_RESET_MASK) == 0))
         return(FALSE);
   }

   return(TRUE);
}

configure_pam(laneno, lane_ptr)
u_char laneno;
LANE_INFO    *lane_ptr;
{
   PAM_INFO     *pam_ptr;
   u_long       board_id;
#ifdef MODELER
   u_long       addr;
   u_long       link_addr;
   long         i;
#endif
   u_long       total_mem;
```

Copyright 1989 Logic Modeling Systems

| SOURCE PROGRAM | DATE | PAGE # |
|---|---|---|
| lm1000/hwconfig.c | 5/23/89<br>TIME 6:14:42 pm | 12/70 |

LINE # SOURCE TEXT

```
    u_char          pamno;
    u_char          temp;
    u_char          pam_count;
    u_char          config;
    u_char          pam_error_encountered;
    u_char          pam_type;
    u_char          cur_pam_type;

    DPRINTF(("inside configure_pam\n"));
    cur_pam_type = PAC_PAM_2M;

    (void)read_pam_count_reg(laneno, &pam_count);
    if (pam_count == 0) {
       lm_config_error(CERR_NO_PAM_FOR_PAC, laneno, 0);
       DPRINTF(("ERROR: no pam on lane %d\n", laneno));
       return(FAILURE);
    }

    DPRINTF(("pam count: %d\n", pam_count));

    /* find all of the PAM's in this lane */
    pam_error_encountered = 0;
    total_mem = 0;
    for (pamno = 0; pamno < pam_count; ++pamno) {
       (void)read_pam_present(laneno, pamno,  &temp);
       if (temp) {

          DPRINTF(("found pam: %d\n", pamno));

          /* The PAM is present */
          pam_ptr = new_pam_info();
          lane_ptr->pam[pamno] = pam_ptr;
          (void)read_pam_id(laneno, pamno, &pam_type, &board_id);

          pam_ptr->board_id = board_id;

          /* Check to make sure that the PAM's are ordered according
           * to decreasing memory size.
           */
          if (pam_type > cur_pam_type) {
             lm_config_error(CERR_PAM_STACKED_WRONG, laneno, pamno);
             DPRINTF(("ERROR: PAM %d is bigger than previous PAM\n",
                      pamno));
             pam_error_encountered = 1;
          }
          else
             cur_pam_type = pam_type;

          switch (pam_type) {
          case PAC_PAM_128K:
             pam_ptr->mem_size = PAM128K_PTRN_COUNT;
             break;
          case PAC_PAM_512K:
             pam_ptr->mem_size = PAM512K_PTRN_COUNT;
             break;
          case PAC_PAM_2M:
             pam_ptr->mem_size = PAM2M_PTRN_COUNT;
             break;
          default:
             break;
          }

          DPRINTF(("pam size: %d\n", pam_ptr->mem_size));

          total_mem += pam_ptr->mem_size;
       }
       else {
          lm_config_error(CERR_PAM_STRAPPED_WRONG, laneno, pamno);
          DPRINTF(("ERROR: PAM %d on lane %d is strapped incorrectly\n",
                   pamno, laneno));
          pam_error_encountered = 1;
       }
    }

    if (pam_error_encountered) {
       /* If there are any problems with PAM strapping, remove
        * all of the PAMs from the list.
        */
       for (pamno = 0; pamno < MAX_PAM_COUNT; ++pamno)
          lane_ptr->pam[pamno] = NULL;
       return(FAILURE);
    }

    /* Write PAM config register */
    switch (pam_count) {
    case 1:
       switch (total_mem / PTRN_PER_BLOCK) {
       case BLOCKS_IN_128K:
          config = 60;
          break;
       case BLOCKS_IN_512K:
          config = 61;
          break;
       case BLOCKS_IN_2M:
          config = 62;
          break;
       default:
          break;
       }
       break;
    case 2:
    case 3:
    case 4:
       config = ((total_mem / PTRN_PER_BLOCK) / BLOCKS_IN_128K) - 1;
       break;
    default:
       /* This condition will never occur */
       break;
    }

    /* set ODD parity on LOW and HIGH word --> set the bit to 1 */
    config |= PAC_CONFIG_HIGH_WORD_PARITY_MASK |
              PAC_CONFIG_LOW_WORD_PARITY_MASK;

    DPRINTF(("PAC config reg on lane: %d --> %08x\n", laneno, config));

    /* Configure the PAC with EVEN parity, then clear the memory, and
     * then set it to ODD parity. This will catch software problem; i.e.
     * if the software reads uninitialized memory inadvertently.
     */
```

Copyright 1989 Logic Modeling Systems

| SOURCE PROGRAM | DATE | TIME | PAGE # |
|---|---|---|---|
| lm1000/hwconfig.c | 5/23/89 | 6:14:42 pm | 13/71 |

LINE # SOURCE TEXT

```
    write_loc_long((u_long *)(lane_offset(laneno) +
                    LANE_PAC_START_OFFSET + PAC_PAM_CONFIG_REG_OFFSET),
                    (u_long)config);

#ifdef MODELER
    addr = LANE_0_START_ADDR + laneno * LANE_ADDR_INC;
    link_addr = addr + LANE_LINK_TABLE_OFFSET;

    for (i = 0; i < total_mem; ++i) {
       write_loc_long((u_long *)(addr), (u_long)0);
       write_loc_long((u_long *)(addr + LANE_SEGMENT_B_OFFSET), (u_long)0);
       write_loc_long((u_long *)(addr + LANE_SEGMENT_C_OFFSET), (u_long)0);
       addr += PTRN_ADDR_INC;
    }

    for (i = 0; i < MAX_LINK_TABLE_COUNT; ++i) {
       write_loc_long((u_long *)link_addr, (u_long)0);
       link_addr += LINK_TABLE_ADDR_INC;
    }
#else
#ifdef DIRECTCONN
    dc_clear_ptrs(laneno, (u_long)total_mem);
#endif
#endif

   /* set ODD parity on LOW and HIGH word --> set the bit to 1 */
   config |= ~PAC_CONFIG_HIGH_WORD_PARITY_MASK |
             ~PAC_CONFIG_LOW_WORD_PARITY_MASK;

   write_loc_long((u_long *)(lane_offset(laneno) +
                   LANE_PAC_START_OFFSET + PAC_PAM_CONFIG_REG_OFFSET),
                   (u_long)config);

   DPRINTF(("exiting configure_pam\n"));
   return(SUCCESS);
}

raise_pel_reset()
{
   u_long     magic_addr;
   u_long     addr;
   u_short    word;
   u_char     laneno;
   u_char     slotno;

   /* This routine deassert RESET on all PELs which still have
    * reset asserted. */
   for (laneno = 0; laneno < MAX_LANE_COUNT; ++laneno) {

      for (slotno = 0; slotno < MAX_SLOT_COUNT; ++slotno) {
         if (system_config->lane[laneno]->pel[slotno] == NULL)
            continue;

         magic_addr = LANE_0_START_ADDR + laneno * LANE_ADDR_INC +
                      LANE_PEL_0_START_OFFSET + slotno * LANE_PEL_ADDR_INC +
                      PEL_MC_0_OFFSET;

         (void)read_loc_long((u_long *)(magic_addr + MC_RESET_REG_OFFSET));

         /* Need to read some other Magic register to affect reset */
         (void)read_loc_long((u_long *)(magic_addr + MC_DATA_OUT_REG_OFFSET));

         addr = LANE_0_START_ADDR + laneno * LANE_ADDR_INC +
                LANE_PEL_0_START_OFFSET + slotno * LANE_PEL_ADDR_INC +
                PEL_STATUS_CONTROL_OFFSET;

         word = read_loc_long((u_long *)addr);
         DPRINTF(("rpr: ln: %d sl: %d pel status: %04x\n",
                  laneno, slotno, word));

         if (word & ~PEL_CS_RESET_MASK)
            continue;

         /* assert RESET* */
         word &= PEL_CS_RESET_MASK & PEL_CS_IN_USE_LED_MASK;
         write_loc_long((u_long *)addr, (u_long)word);

         /* write INITIALIZE to 0 with RESET* == 1*/
         word = (word & PEL_CS_INITIALIZE_MASK) | ~PEL_CS_RESET_MASK;
         write_loc_long((u_long *)addr, (u_long)word);

      }
   }
}

check_pel_stacking(dab_ptr, pel_location)
DAB_INFO   *dab_ptr;
u_char      pel_location[][MAX_SLOT_COUNT];
{
   char      i;
   u_char    slots_occupied[MAX_LANE_COUNT][MAX_SLOT_COUNT];
   char      minlaneno;
   char      maxlaneno;
   char      minslotno;
   char      maxslotno;
   char      laneno;
   char      slotno;

   minlaneno = MAX_LANE_COUNT;
   maxlaneno = -1;
   minslotno = MAX_SLOT_COUNT;
   maxslotno = -1;

   /* Initialize slots_occupied */
   for (laneno = 0; laneno < MAX_LANE_COUNT; ++laneno)
      for (slotno = 0; slotno < MAX_SLOT_COUNT; ++slotno)
         slots_occupied[laneno][slotno] = 0;

   /* Mark all of the slots occupied by this device */
   for (i = 0; i < dab_ptr->unit_count; ++i) {
      laneno = dab_ptr->unit_location[i].lane_no;
      slotno = dab_ptr->unit_location[i].slot_no;

      slots_occupied[laneno][slotno] = 1;

      if (laneno < minlaneno)
         minlaneno = laneno;
      if (laneno > maxlaneno)
         maxlaneno = laneno;
      if (slotno < minslotno)
```

Copyright 1989
Logic Modeling Systems

SOURCE PROGRAM lm1000/hwconfig.c | DATE 5/23/89 | TIME 6:14:42 pm | PAGE # 14/72

LINE # SOURCE TEXT

```
            minslotno = slotno;
        if (slotno > maxslotno)
            maxslotno = slotno;
    }

    for (slotno = minslotno ; slotno <= maxslotno; ++slotno) {

        /* Check if this slot is occupied at all */
        for (laneno = minlaneno; laneno <= maxlaneno; ++laneno) {
            if (slots_occupied[laneno][slotno] == 1)
                break;
        }

        /* Go to the next slot if there is no unit in this slot */
        if (laneno > maxlaneno)
            continue;

        /* Make sure that at this slotno there is a unit on each lane
         * that the device occupies. Don't do this check on
         * the rightmost slot.
         */
        if (slotno != maxslotno) {
            for (laneno = minlaneno; laneno <= maxlaneno; ++laneno) {
                if (dab_ptr->lane_used[laneno] == FALSE)
                    continue;

                if (slots_occupied[laneno][slotno] == 0)
                    return(FAILURE);
            }
        }

        /* Go through all other lanes occupied by this device and compare
         * the PEL stacking on this lane with the PEL stacking on the lane
         * found above.
         */
        for (laneno = minlaneno + 1; laneno <= maxlaneno; ++laneno) {
            if (dab_ptr->lane_used[laneno] == FALSE)
                continue;

            /* This condition can only happen for the rightmost slot */
            if (slots_occupied[laneno][slotno] == 0)
                continue;

            if (check_pel_to_left(pel_location, minlaneno,
                                  laneno, slotno) == FAILURE) {
                return(FAILURE);
            }
        }
    }
    return(SUCCESS);
}

check_pel_to_left(pel_location, laneno1, laneno2, toslotno)
u_char pel_location[][MAX_SLOT_COUNT];
char    laneno1;
char    laneno2;
char    toslotno;
{
    u_char slotno;

    DPRINTF(("inside check_pel_to_left on slot: %d between lane %d and %d\n",
            toslotno, laneno1, laneno2));

    for (slotno = 0; slotno < toslotno; ++slotno) {
        if (pel_location[laneno1][slotno] != pel_location[laneno2][slotno])
            return(FAILURE);
    }
    return(SUCCESS);
}

init_magic_and_pel(laneno, slotno)
u_char laneno;
u_char slotno;
{
    u_long  magic_addr;

    DPRINTF(("inside init_magic_and_pel, lane: %d slot: %d\n",
            laneno, slotno));

    magic_addr = LANE_0_START_ADDR + laneno * LANE_ADDR_INC +
        LANE_PEL_0_START_OFFSET + slotno * LANE_PEL_ADDR_INC +
        PEL_MC_0_OFFSET;

    (void)read_loc_long((u_long *)(magic_addr + MC_RESET_REG_OFFSET));

    /* Need to read some other Magic reg to affect reset */
    (void)read_loc_long((u_long *)(magic_addr + MC_DATA_OUT_REG_OFFSET));

    (void)read_loc_long((u_long *)magic_addr);

    init_dab(laneno, slotno);
}
```

Copyright 1989 Logic Modeling Systems

| SOURCE PROGRAM | DATE | PAGE # |
|---|---|---|
| lm1000/initseq.c | 5/23/89 TIME 6:14:43 pm | 1/73 |

LINE # SOURCE TEXT

```
/* SCCS_ID: initseq.c rev 3.1, 4/24/89 at 07:53:13      */

#include "device.h"
#include "message.h"
#include "hardware.h"
#include "eeprom.h"
#include "lmserver.h"

#ifdef DEBUG
extern u_char  loop_till_key;
extern u_long  debug_key;
extern u_long  debug_cmmr;
#endif

build_static_pattern_seq(instance)
INSTANCE_INFO *instance;
{
   /* This routine builds the static pattern seq for an instance:
    *     PREAMBLE, PRE_FB_SEQ, FB_SEQ, POST_FB_SEQ
    * by calling load_preamble(), load_pre_feedback_seq(),
    * load_feedback_seq(), and load_post_feedback_seq(), respectively.
    * Upon return from the routines load_preamble() and
    * load_pre_feedback_seq() the INSTANCE.unit_addr is pointing to the
    * last pattern loaded; whereas the INSTANCE.unit_addr is pointing at
    * the next pattern address to be loaded upon return from
    * load_feedback_seq() and load_post_feedback_seq().
    * The following combinations of preamble seq and reset seq are allowed:
    *      PREAMBLE   PRE   FB   POST
    *      PREAMBLE   PRE   FB
    *      PREAMBLE
    *      PREAMBLE         FB   POST
    *      PREAMBLE         FB
    *      PREAMBLE   PRE
    * any other combinations are illegal and should be checked by the parser.
    */

   PREAMBLE  preamble;
   DAB_INFO *dab_ptr;
   u_char    laneno;
   long      dummy_count;
   u_long   *temp_unit_addr;
   u_long    overflowed_pattern_count;
   short     i;
   u_char    reload_preamble_flag;

   dab_ptr = dab_list[instance->dab_info_index];

   setup_gbl_dummy_ptrn(dab_ptr);

   if (allocate_initial_block(instance) == FAILURE)
      return;

   /* set the sequence start address on each lane */
   for (laneno = 0; laneno < MAX_LANE_COUNT; ++laneno)
      instance->seq_start_addr[laneno] =
         instance->lane_addr[laneno].max_addr - BLOCK_ADDR_INC;

   if (instance->definition->fb_seq_len != 0)
      if (load_dummy_pattern(instance) == FAILURE)
         return;

   if (load_preamble(instance, (u_char)FALSE,
                     &preamble, &reload_preamble_flag) == FAILURE)
      return;

   if (instance->definition->pre_seq_len != 0) {
      if (grow_pattern(instance) == FAILURE)
         return;

      if (load_pre_feedback_seq(instance) == FAILURE)
         return;
   }

   if (instance->definition->fb_seq_len != 0) {

      /* Add more dummy patterns to make sure that the feedback signal
       * is quiet before we branch to the feedback sequence.
       */
      if (load_dummy_pattern2(instance) == FAILURE)
         return;

      if (allocate_feedback_block(instance) == FAILURE)
         return;

      if (load_feedback_seq(instance, &overflowed_pattern_count) == FAILURE)
         return;

      /* The sequence end bit has to be specified SEQ_END_LATENCY patterns
       * before the actual pattern we want to stop at. If the number of
       * post feedback sequence is less than the SEQ_END_LATENCY, we need
       * to add some dummy patterns in the beginning of the block after the
       * feedback block.
       */

      /* Total number of lane patterns needed for various unit_count_per_lane
       * (assuming SEQ_END_LATENCY = 6):
       *    unit_count_per_lane = 1 --> tot_lane_pattern_needed = 6
       *    unit_count_per_lane = 2 --> tot_lane_pattern_needed = 3
       *    unit_count_per_lane = 3 --> tot_lane_pattern_needed = 2
       *    unit_count_per_lane = 4 --> tot_lane_pattern_needed = 2
       *    unit_count_per_lane = 5 --> tot_lane_pattern_needed = 2
       *    unit_count_per_lane = 6 --> tot_lane_pattern_needed = 1
       *    unit_count_per_lane = 7 --> tot_lane_pattern_needed = 1
       *        ......
       */
      if (overflowed_pattern_count < SEQ_END_LATENCY) {
         dummy_count = SEQ_END_LATENCY / dab_ptr->unit_count_per_lane;

         if ((dummy_count * dab_ptr->unit_count_per_lane) < SEQ_END_LATENCY)
            ++dummy_count;

         dummy_count -= instance->definition->post_seq_len;
      }
      else
         dummy_count = 0;

      for (i = 0; i < dummy_count; ++i) {
         write_pattern(instance,
                       &instance->unit_addr[instance->cur_unit_addr_index][0],
                       gbl_dummy_ptrn);
```

Copyright 1989
Logic Modeling Systems

| SOURCE PROGRAM | DATE | PAGE # |
|---|---|---|
| lm1000/initseq.c | 5/23/89 | 2/74 |
| | TIME 6:14:43 pm | |

LINE # SOURCE TEXT

```
            if (grow_pattern(instance) == FAILURE)
                return;
        }
    }
    else {
        /* load_pre_feedback_seq() leaves the unit_addr pointing at the
         * last pattern written. We need to increment it by one pattern
         * so that the entry condition in load_post_feedback_seq() is
         * the same whether we have feedback sequence or not.
         */
        if (grow_pattern(instance) == FAILURE)
            return;
    }

    if (instance->definition->post_seq_len != 0)
        if (load_post_feedback_seq(instance) == FAILURE)
            return;

    if (reload_preamble_flag == TRUE) {
        if (reload_preamble(instance, &preamble) == FAILURE) {
            free_preamble(&preamble);
            return;
        }
    }

    free_preamble(&preamble);

    if (set_initial_values(instance) == FAILURE)
        return;

    /* Copy the current pattern_count to the static_pattern_count.
     * Note that grow_pattern() was called last, so the number in the
     * pattern_count is 1 logical pattern more than what it should be.
     */
    instance->static_pattern_count = instance->pattern_count -
                                     dab_ptr->unit_count_per_lane;

    /* Copy the unit_addr to first_user_ptrn_unit_addr */
    temp_unit_addr = &instance->unit_addr[instance->cur_unit_addr_index][0];
    for (i = 0; i < dab_ptr->unit_count; ++i)
        instance->first_user_ptrn_unit_addr[i] = temp_unit_addr[i];

}

load_preamble(instance, preamble_for_power_up, preamble, reload_preamble_flag)
INSTANCE_INFO *instance;
u_char          preamble_for_power_up;
PREAMBLE        *preamble;
u_char          *reload_preamble_flag;
{
    PREAMBLE_WORD           *preamble_word;
    PTRN_BITS_LONGWORD      *unit_ptrn;
    PTRN_BITS_LONGWORD      *preamble_unit_ptrn;
    PTRN_BITS               *ptrn_bits_ptr;
    PIN_SPEC                *pin_spec_ptr;
    DAB_INFO                *dab_ptr;
    DEVICE_SPEC             *def_ptr;
    EXTRA_DEVICE_SPEC       *extra_def_ptr;
    SEQ_SPEC                *seq_spec_ptr;
    PTRN_BITS_LONGWORD      *ident_outputs_ptr;
    PTRN_BITS_LONGWORD      *ident_ios_ptr;
    UWB_OFFSET              *uwb_ptr;
    u_long                  *temp_unit_addr;
    u_short                  seq_count;
    u_short                  pin_count;
    u_short                  pinno;
    u_short                  unitno;
    u_char                   wordno;
    u_char                   bitno;
    u_char                   unit_count;
    u_char                   i;
    u_char                   j;
    u_char                   temp;

    DPRINTF(("inside load_preamble\n"));

    *reload_preamble_flag = FALSE;

    def_ptr = instance->definition;
    extra_def_ptr = (EXTRA_DEVICE_SPEC *)def_ptr->extra_data;

    dab_ptr = dab_list[instance->dab_info_index];
    unit_count = dab_ptr->unit_count;

    preamble_word = (PREAMBLE_WORD *)preamble;

    for (i = 0; i < sizeof(PREAMBLE) / sizeof(PTRN_BITS *); ++i) {
        preamble_word->word[i] =
            (PTRN_BITS *)DCALLOC((unsigned)unit_count,
                                 (unsigned)sizeof(PTRN_BITS));

        if (preamble_word->word[i] == NULL) {
            lm_queue_message(ERROR_MSG, "out of memory on modeler");

            for (j = 0; j < i; ++j) {
                DFREE((char *)preamble_word->word[j]);
            }
            return(FAILURE);

    }

    for (i = 0; i < unit_count; ++i) {
        unit_ptrn = (PTRN_BITS_LONGWORD *)&preamble->sdlen3b[i];
        unit_ptrn->word[0] = 0xffffffff;
        unit_ptrn->word[1] = 0xffffffff;
        unit_ptrn->word[2] = 0xffff0000;
        unit_ptrn = (PTRN_BITS_LONGWORD *)&preamble->sdlen2b[i];
        unit_ptrn->word[0] = 0xffffffff;
        unit_ptrn->word[1] = 0xffffffff;
        unit_ptrn->word[2] = 0xffff0000;
        unit_ptrn = (PTRN_BITS_LONGWORD *)&preamble->sdlen1b[i];
        unit_ptrn->word[0] = 0xffffffff;
        unit_ptrn->word[1] = 0xffffffff;
        unit_ptrn->word[2] = 0xffff0000;
        unit_ptrn = (PTRN_BITS_LONGWORD *)&preamble->seqhdb[i];
        unit_ptrn->word[0] = 0xffffffff;
        unit_ptrn->word[1] = 0xffffffff;
        unit_ptrn->word[2] = 0xffff0000;
        unit_ptrn = (PTRN_BITS_LONGWORD *)&preamble->lcychdb[i];
        unit_ptrn->word[0] = 0xffffffff;
```

Copyright 1989
Logic Modeling Systems

SOURCE PROGRAM
lm1000/initseq.c

DATE 5/23/89
TIME 6:14:43 pm
PAGE # 3/75

LINE # SOURCE TEXT

```
        unit_ptrn->word[1] = 0xffffffff;
        unit_ptrn->word[2] = 0xffff0000;
        unit_ptrn = (PTRN_BITS_LONGWORD *)&preamble->lcycmdb[i];
        unit_ptrn->word[0] = 0xffffffff;
        unit_ptrn->word[1] = 0xffffffff;
        unit_ptrn->word[2] = 0xffff0000;
        unit_ptrn = (PTRN_BITS_LONGWORD *)&preamble->format1[i];
        unit_ptrn->word[0] = 0xffffffff;
        unit_ptrn->word[1] = 0xffffffff;
        unit_ptrn->word[2] = 0xffff0000;
        unit_ptrn = (PTRN_BITS_LONGWORD *)&preamble->format0[i];
        unit_ptrn->word[0] = 0xffffffff;
        unit_ptrn->word[1] = 0xffffffff;
        unit_ptrn->word[2] = 0xffff0000;
        unit_ptrn = (PTRN_BITS_LONGWORD *)&preamble->dummy_hmdenb[i];
        unit_ptrn->word[0] = 0xffffffff;
        unit_ptrn->word[1] = 0xffffffff;
        unit_ptrn->word[2] = 0xffff0000;
        unit_ptrn = (PTRN_BITS_LONGWORD *)&preamble->hmdenb[i];
        unit_ptrn->word[0] = 0xffffffff;
        unit_ptrn->word[1] = 0xffffffff;
        unit_ptrn->word[2] = 0xffff0000;
        unit_ptrn = (PTRN_BITS_LONGWORD *)&preamble->dummy_data2[i];
        unit_ptrn->word[0] = 0xffffffff;
        unit_ptrn->word[1] = 0xffffffff;
        unit_ptrn->word[2] = 0xffff0000;
    }

    pin_count = def_ptr->pin_cnt;
    pin_spec_ptr = &def_ptr->pin_table[0];
    for (pinno = 0; pinno < pin_count; ++pinno) {

        if (pin_spec_ptr->direction == NONE) {
            ++pin_spec_ptr;
            continue;
        }

        if ((pin_spec_ptr->direction == POWER) ||
            (pin_spec_ptr->direction == GROUND) ||
            (pin_spec_ptr->direction == NC)) {

            /* Float these pins */

            uwb_ptr = &pn_to_short_offset[pinno];
            unitno = uwb_ptr->unitno;
            wordno = uwb_ptr->wordno;
            bitno  = uwb_ptr->bitno;

            set_ptrn_bit(&preamble->seqmdb   [unitno], wordno, bitno);
            set_ptrn_bit(&preamble->adlen0b  [unitno], wordno, bitno);

            ++pin_spec_ptr;
            continue;
        }

        /* INPUT, OUTPUT, or IO pin */

        uwb_ptr = &pn_to_short_offset[pinno];
        unitno = uwb_ptr->unitno;
        wordno = uwb_ptr->wordno;
        bitno  = uwb_ptr->bitno;

        /* HDDISB */
        if (pin_spec_ptr->h_drive == ALWAYS_ON)
            set_ptrn_bit(&preamble->hddisb[unitno], wordno, bitno);

        /* For I/O STORE pin in NON ULTRA FAST mode,  set HDDISB to 1.
         * We can tell if it's in Non Ultra Fast mode because INSEQHD
         * will be off.
         */
        if ((pin_spec_ptr->direction == IO) &&
            (pin_spec_ptr->pin_class == STORE) &&
            (pin_spec_ptr->in_seq_drive != H_DRIVE) &&
            (pin_spec_ptr->in_seq_drive != HM_DRIVE)) {
            set_ptrn_bit(&preamble->hddisb[unitno], wordno, bitno);
        }

        /* Set DOFF to 1 (edge 5) for I/O STORE pins */
        if ((pin_spec_ptr->direction == IO) &&
            (pin_spec_ptr->pin_class == STORE))
            set_ptrn_bit(&preamble->doff[unitno], wordno, bitno);

        /* HMDENB */
        if (pin_spec_ptr->hm_drive == DRIVE_ON)
            reset_ptrn_bit(&preamble->hmdenb[unitno], wordno, bitno);

        /* SEQHDB and SEQMDB */
        switch (pin_spec_ptr->in_seq_drive) {
        case NO_DRIVE:
            set_ptrn_bit(&preamble->seqmdb    [unitno], wordno, bitno);
            break;
        case H_DRIVE:
            reset_ptrn_bit(&preamble->seqhdb  [unitno], wordno, bitno);
            set_ptrn_bit(&preamble->seqmdb    [unitno], wordno, bitno);
            break;
        case M_DRIVE:
            /* Default is Medium drive */
            break;
        case HM_DRIVE:
            reset_ptrn_bit(&preamble->seqhdb  [unitno], wordno, bitno);
            break;
        default:
            break;
        }

        /* LCYCHDB and LCYCMDB */
        switch (pin_spec_ptr->last_cyc_drive) {
        case NO_DRIVE:
            break;
        case H_DRIVE:
            reset_ptrn_bit(&preamble->lcychdb  [unitno], wordno, bitno);
            break;
        case M_DRIVE:
            reset_ptrn_bit(&preamble->lcycmdb  [unitno], wordno, bitno);
            break;
        case HM_DRIVE:
            reset_ptrn_bit(&preamble->lcychdb  [unitno], wordno, bitno);
            reset_ptrn_bit(&preamble->lcycmdb  [unitno], wordno, bitno);
            break;
        default:
```

Copyright 1989 Logic Modeling Systems

SOURCE PROGRAM lm1000/initseq.c

DATE 5/23/89 TIME 6:14:43 pm

LINE # SOURCE TEXT

```
            break;
        }

        /* FORMAT[1-0], SET[1-0], RESET[1-0] */
        switch (pin_spec_ptr->clk_format) {
        case NRZ:
        case DNRZ:
            if (pin_spec_ptr->pin_class == STORE) {
                /* use edge #3:
                 *      SET   [1-0] <-- 1
                 *      RESET [1-0] <-- 3
                 */
                set_ptrn_bit(&preamble->set0   [unitno], wordno, bitno);
                set_ptrn_bit(&preamble->reset1 [unitno], wordno, bitno);
                set_ptrn_bit(&preamble->reset0 [unitno], wordno, bitno);
            }
            else {
                /* use edge #2:
                 *      SET   [1-0] <-- 0
                 *      RESET [1-0] <-- 2
                 */
                set_ptrn_bit(&preamble->reset1 [unitno], wordno, bitno);
            }

            break;

        case R0:

            reset_ptrn_bit(&preamble->format1[unitno], wordno, bitno);

            /* falling edge (significant edge)      --> use edge #3
             * rising  edge (non significant edge)  --> use edge #4
             *     SET   [1-0] <-- 2
             *     RESET [1-0] <-- 3
             */
            set_ptrn_bit(&preamble->set1   [unitno], wordno, bitno);
            set_ptrn_bit(&preamble->reset1 [unitno], wordno, bitno);
            set_ptrn_bit(&preamble->reset0 [unitno], wordno, bitno);

            break;

        case R1:
            /* make sure the clock does not toggle in dummy_data */
            set_ptrn_bit(&preamble->dummy_data [unitno], wordno, bitno);
            set_ptrn_bit(&preamble->dummy_data2[unitno], wordno, bitno);

            reset_ptrn_bit(&preamble->format0[unitno], wordno, bitno);

            /* rising edge   (significant edge)      --> use edge #3
             * falling edge  (non significant edge) --> use edge #1
             *     SET   [1-0] <-- 1
             *     RESET [1-0] <-- 1
             */
            set_ptrn_bit(&preamble->set0   [unitno], wordno, bitno);
            set_ptrn_bit(&preamble->reset0 [unitno], wordno, bitno);

            break;
        case RC:
            /* ??? not supported */

            set_ptrn_bit(&preamble->reset1 [unitno], wordno, bitno);

            break;
        default:
            break;
        }

        /* SDHEN[3-0] */
        temp = pin_spec_ptr->s_drive_hi;
        DPRINTF(("s_drive_high: %d\n", temp));
        if (temp & 0x8)
            set_ptrn_bit(&preamble->sdhen3[unitno], wordno, bitno);
        else
            reset_ptrn_bit(&preamble->sdhen3[unitno], wordno, bitno);
        if (temp & 0x4)
            set_ptrn_bit(&preamble->sdhen2[unitno], wordno, bitno);
        else
            reset_ptrn_bit(&preamble->sdhen2[unitno], wordno, bitno);
        if (temp & 0x2)
            set_ptrn_bit(&preamble->sdhen1[unitno], wordno, bitno);
        else
            reset_ptrn_bit(&preamble->sdhen1[unitno], wordno, bitno);
        if (temp & 0x1)
            set_ptrn_bit(&preamble->sdhen0[unitno], wordno, bitno);
        else
            reset_ptrn_bit(&preamble->sdhen0[unitno], wordno, bitno);

        /* SDLEN[3-0]B */
        temp = pin_spec_ptr->s_drive_low;
        DPRINTF(("s_drive_low: %d\n", temp));
        if (temp & 0x8)
            reset_ptrn_bit(&preamble->sdlen3b[unitno], wordno, bitno);
        else
            set_ptrn_bit(&preamble->sdlen3b[unitno], wordno, bitno);
        if (temp & 0x4)
            reset_ptrn_bit(&preamble->sdlen2b[unitno], wordno, bitno);
        else
            set_ptrn_bit(&preamble->sdlen2b[unitno], wordno, bitno);
        if (temp & 0x2)
            reset_ptrn_bit(&preamble->sdlen1b[unitno], wordno, bitno);
        else
            set_ptrn_bit(&preamble->sdlen1b[unitno], wordno, bitno);
        if (temp & 0x1)
            reset_ptrn_bit(&preamble->sdlen0b[unitno], wordno, bitno);
        else
            set_ptrn_bit(&preamble->sdlen0b[unitno], wordno, bitno);

        /* Simulate pull up on feedback pin */
        if (preamble_for_power_up == FALSE) {
            if (pin_spec_ptr->feeds_back == 1) {
                if (pin_spec_ptr->direction == IO) {
                    if (pin_spec_ptr->in_seq_drive != M_DRIVE) {
                        set_ptrn_bit(&preamble->seqhdb    [unitno], wordno, bitno);
                        reset_ptrn_bit(&preamble->seqmdb  [unitno], wordno, bitno);
                        *reload_preamble_flag = TRUE;
                    }
                }
                else if (pin_spec_ptr->direction == OUT) {
                    reset_ptrn_bit(&preamble->seqmdb  [unitno], wordno, bitno);
                    *reload_preamble_flag = TRUE;
```

Copyright 1989
Logic Modeling Systems

| SOURCE PROGRAM | DATE | PAGE # |
|---|---|---|
| lm1000/initseq.c | 5/23/89 6:14:43 pm | 5/77 |

SOURCE TEXT

```
            }
        }
    }

    ++pin_spec_ptr
}

/* Setup the pattern control bits */
for (i = 0; i < sizeof(PREAMBLE) / sizeof(PTRN_BITS *); ++i) {
    ptrn_bits_ptr = preamble_word->word[i];
    for (unitno = 0; unitno < dab_ptr->unit_count; ++unitno) {
        set_pel_ctl(&ptrn_bits_ptr->ctl, PEL_CTL_LOAD_CONTROL);
        set_pel_sel(&ptrn_bits_ptr->ctl,
                    dab_ptr->unit_location[unitno].slot_no);
        ++ptrn_bits_ptr;
    }
}

/* modify the PEL CONTROL of SELECT_PEL */
ptrn_bits_ptr = preamble->select_pel;
for (unitno = 0; unitno < dab_ptr->unit_count; ++unitno) {
    set_pel_ctl(&ptrn_bits_ptr->ctl, PEL_CTL_SELECT_PEL);
    ++ptrn_bits_ptr;
}

/* modify the PEL CONTROL of LOAD_SDEN */
ptrn_bits_ptr = preamble->load_sden;
for (unitno = 0; unitno < dab_ptr->unit_count; ++unitno) {
    set_pel_ctl(&ptrn_bits_ptr->ctl, PEL_CTL_LOAD_SDEN_FORMAT);
    ++ptrn_bits_ptr;
}

/* modify the PEL CONTROL of DUMMY_HMDENB */
ptrn_bits_ptr = preamble->dummy_hmdenb;
for (unitno = 0; unitno < dab_ptr->unit_count; ++unitno) {
    set_pel_ctl(&ptrn_bits_ptr->ctl, PEL_CTL_LOAD_HMDEN);
    ++ptrn_bits_ptr;
}

/* modify the PEL CONTROL of HMDENB */
ptrn_bits_ptr = preamble->hmdenb;
for (unitno = 0; unitno < dab_ptr->unit_count; ++unitno) {
    set_pel_ctl(&ptrn_bits_ptr->ctl, PEL_CTL_LOAD_HMDEN);
    ++ptrn_bits_ptr;
}

/* modify the PEL CONTROL of DUMMY_DATA */
ptrn_bits_ptr = preamble->dummy_data;
for (unitno = 0; unitno < dab_ptr->unit_count; ++unitno) {

    if (dab_ptr->unit_location[unitno].last_in_lane)
        set_pel_ctl(&ptrn_bits_ptr->ctl, PEL_CTL_LOAD_DATA_LAST_UNIT);
    else
        set_pel_ctl(&ptrn_bits_ptr->ctl, PEL_CTL_LOAD_DATA);

    ++ptrn_bits_ptr;
}

/* modify the PEL CONTROL of DUMMY_DATA2 */
ptrn_bits_ptr = preamble->dummy_data2;
for (unitno = 0; unitno < dab_ptr->unit_count; ++unitno) {
    if (dab_ptr->unit_location[unitno].last_in_lane)
        set_pel_ctl(&ptrn_bits_ptr->ctl, PEL_CTL_LOAD_DATA_LAST_UNIT);
    else
        set_pel_c`l(&ptrn_bits_ptr->ctl, PEL_CTL_LOAD_DATA);

    ++ptrn_bits_ptr;
}

/* Save the PREAMBLE LCYCHBB, LCYCHDB, and HMDENB for the instance */
for (i = 0; i < sizeof(PREAMBLE) / sizeof(PTRN_BITS *); ++i) {

    if (&preamble_word->word[i] == &preamble->hmdenb) {

        /* copy the HMDENB ptrn into hmdenb_loaded in instance_info */
        unit_ptrn = (PTRN_BITS_LONGWORD *)instance->hmdenb_loaded;

        preamble_unit_ptrn =
              (PTRN_BITS_LONGWORD *)preamble_word->word[i];

        ident_outputs_ptr = extra_def_ptr->ident_outputs;
        ident_ios_ptr     = extra_def_ptr->ident_ios;

        for (unitno = 0; unitno < dab_ptr->unit_count; ++unitno) {

            for (wordno = 0; wordno < 3; ++wordno) {
                unit_ptrn[unitno].word[wordno] =
                                preamble_unit_ptrn[unitno].word[wordno];

                /* Turn off the HMDENB for OUTPUT and IO pins */
                preamble_unit_ptrn[unitno].word[wordno] |=
                    (ident_outputs_ptr[unitno].word[wordno] |
                             ident_ios_ptr[unitno].word[wordno]);
            }
        }

        /* Turn back on the HMDENB for those pins specified in either the
         * power-up reset sequence or the normal reset sequence.
         */
        if (preamble_for_power_up == TRUE) {
            lm_queue_message(ERROR_MSG, "internal error: can't have power up sequence");
            return(FAILURE);
        }
        else {
            seq_count = def_ptr->seq_cnt;
            for (pin_count = 0; pin_count < seq_count; ++pin_count) {
                seq_spec_ptr = &def_ptr->seq_table[pin_count];
                pinno = seq_spec_ptr->pin_number;

                uwb_ptr = &pn_to_short_offset[pinno];
                unitno = uwb_ptr->unitno;
                wordno = uwb_ptr->wordno;
                bitno  = uwb_ptr->bitno;

                reset_ptrn_bit(&preamble_unit_ptrn[unitno], wordno, bitno);

            }
        }
    }
```

Copyright 1989
Logic Modeling Systems

SOURCE PROGRAM lm1000/initseq.c

DATE 5/23/89 TIME 6:14:43 pm PAGE # 6/78

LINE # SOURCE TEXT

```
            if (&preamble_word->word[i] == &preamble->lcychdb) {

               unit_ptrs = (PTRN_BITS_LONGWORD *)instance->lcychdb_loaded;
               preamble_unit_ptrs =
                  (PTRN_BITS_LONGWORD *)preamble_word->word[i];

               temp_unit_addr = &instance->
                                unit_addr[instance->cur_unit_addr_index][0];

               for (unitno = 0; unitno < dab_ptr->unit_count; ++unitno) {

                  /* copy the addr of LCYCHDB into lcychdb_addr in instance_info */
                  instance->lcychdb_addr[unitno] = temp_unit_addr[unitno];

                  /* copy the LCYCHDB pattern into lcychdb_loaded in instance_info */

                  for (wordno = 0; wordno < 3; ++wordno) {
                     unit_ptrs[unitno].word[wordno] =
                                       preamble_unit_ptrs[unitno].word[wordno];
                  }
               }
            }

            if (&preamble_word->word[i] == &preamble->lcycmdb) {

               unit_ptrs = (PTRN_BITS_LONGWORD *)instance->lcycmdb_loaded;
               preamble_unit_ptrs =
                  (PTRN_BITS_LONGWORD *)preamble_word->word[i];

               temp_unit_addr = &instance->
                                unit_addr[instance->cur_unit_addr_index][0];

               for (unitno = 0; unitno < dab_ptr->unit_count; ++unitno) {

                  /* copy the addr of LCYCMDB into lcycmdb_addr in instance_info */
                  instance->lcycmdb_addr[unitno] = temp_unit_addr[unitno];

                  /* copy the LCYCMDB pattern into lcycmdb_loaded in instance_info */

                  for (wordno = 0; wordno < 3; ++wordno) {
                     unit_ptrs[unitno].word[wordno] =
                                       preamble_unit_ptrs[unitno].word[wordno];
                  }
               }
            }

            write_pattern(instance,
                          &instance->unit_addr[instance->cur_unit_addr_index][0],
                          preamble_word->word[i]);

         /* Don't grow the pattern on the last preamble pattern,
          * because otherwise grow_pattern() might allocate new blocks which
          * will have to be retracted if the preamble is followed by feedback
          * sequence (NO pre feedback sequence).
          */
         if (i != ((sizeof(PREAMBLE) / sizeof(PTRN_BITS *)) - 1))
            if (grow_pattern(instance) == FAILURE)
               return(FAILURE);
      }

      return(SUCCESS);
   }

   free_preamble(preamble)
   PREAMBLE *preamble;
   {
      PREAMBLE_WORD           *preamble_word;
      u_char                   i;

      preamble_word = (PREAMBLE_WORD *)preamble;

      for (i = 0; i < sizeof(PREAMBLE) / sizeof(PTRN_BITS *); ++i)
         DFREE((char *)preamble_word->word[i]);
   }

reload_preamble(instance, preamble)
INSTANCE_INFO   *instance;
PREAMBLE        *preamble;
{
   PREAMBLE_WORD          *preamble_word;
   PTRN_BITS_LONGWORD     *unit_ptrs;
   PTRN_BITS_LONGWORD     *preamble_unit_ptrs;
   PIN_SPEC               *pin_spec_ptr;
   UWB_OFFSET             *uwb_ptr;
   DEVICE_SPEC            *def_ptr;
   DAB_INFO               *dab_ptr;
   u_long                 *temp_unit_addr;
   u_short                 pin_count;
   u_short                 pinno;
   u_short                 unitno;
   u_char                  wordno;
   u_char                  bitno;
   u_char                  i;


   DPRINTF(("inside reload_preamble\n"));
   def_ptr = instance->definition;
   dab_ptr = dab_list[instance->dab_info_index];

   preamble_word = (PREAMBLE_WORD *)preamble;

   /* Load a dummy pattern after the feedback/post-feedback sequence
    * to let the last DATA pattern to get out of the MAGIC chip
    * before reloading the preamble.
    */
   setup_gbl_dummy_ptrs(dab_ptr);
   write_pattern(instance,
                 &instance->unit_addr[instance->cur_unit_addr_index][0],
                 gbl_dummy_ptrs);
   if (grow_pattern(instance) == FAILURE)
      return(FAILURE);

   pin_count = def_ptr->pin_cnt;
   pin_spec_ptr = &def_ptr->pin_table[0];
   for (pinno = 0; pinno < pin_count; ++pinno) {

      if ((pin_spec_ptr->direction == NONE) ||
          (pin_spec_ptr->direction == POWER) ||
          (pin_spec_ptr->direction == GROUND) ||
```

| Copyright 1989 Logic Modeling Systems | SOURCE PROGRAM lm1000/initseq.c | DATE 5/23/89 TIME 6:14:43 pm | PAGE # 7/79 |
|---|---|---|---|

LINE # SOURCE TEXT

```
            (pin_spec_ptr->direction == NC) ||
            (pin_spec_ptr->direction == IN)) {
           ++pin_spec_ptr;
           continue;
        }

        uwb_ptr = spn_to_short_offset(pinno);
        unitno = uwb_ptr->unitno;
        wordno = uwb_ptr->wordno;
        bitno  = uwb_ptr->bitno;

        /* SHOMDB and SEQMDB */
        switch (pin_spec_ptr->is_seq_drive) {
        case NO_DRIVE:
           set_ptrn_bit(&preamble->seqmdb    [unitno], wordno, bitno);
           break;
        case H_DRIVE:
           reset_ptrn_bit(&preamble->seqhdb  [unitno], wordno, bitno);
           set_ptrn_bit(&preamble->seqmdb    [unitno], wordno, bitno);
           break;
        case M_DRIVE:
           /* Default is Medium drive */
           break;
        case HM_DRIVE:
           reset_ptrn_bit(&preamble->seqhdb  [unitno], wordno, bitno);
           break;
        default:
           break;
        }

        ++pin_spec_ptr;
     }

     for (i = 0; i < sizeof(PREAMBLE) / sizeof(PTRN_BITS *); ++i) {

        /* Don't load the first half of the preamble */
        if ((long)&preamble_word->word[i] <= (long)&preamble->load_aden) {
           continue;
        }

        /* Break out of the for loop after we load seqhdb */
        if (&preamble_word->word[i] == &preamble->dummy_hmdenb) {
           break;
        }

        if (&preamble_word->word[i] == &preamble->lcychdb) {

           unit_ptrs = (PTRN_BITS_LONGWORD *)instance->lcychdb_loaded;
           preamble_unit_ptrs =
              (PTRN_BITS_LONGWORD *)preamble_word->word[i];

           temp_unit_addr = &instance->
                              unit_addr[instance->cur_unit_addr_index][0];

           for (unitno = 0; unitno < dab_ptr->unit_count; ++unitno) {

              /* copy the addr of LCYCHDB into lcychdb_addr in instance_info */
              instance->lcychdb_addr[unitno] = temp_unit_addr[unitno];

              /* copy the LCYCHDB pattern into lcychdb_loaded in instance_info */

              for (wordno = 0; wordno < 3; ++wordno) {
                 unit_ptrs[unitno].word[wordno] =
                                      preamble_unit_ptrs[unitno].word[wordno];
              }
           }
        }

        if (&preamble_word->word[i] == &preamble->lcycmdb) {

           unit_ptrs = (PTRN_BITS_LONGWORD *)instance->lcycmdb_loaded;
           preamble_unit_ptrs =
              (PTRN_BITS_LONGWORD *)preamble_word->word[i];

           temp_unit_addr = &instance->
                              unit_addr[instance->cur_unit_addr_index][0];

           for (unitno = 0; unitno < dab_ptr->unit_count; ++unitno) {

              /* copy the addr of LCYCMDB into lcycmdb_addr in instance_info */
              instance->lcycmdb_addr[unitno] = temp_unit_addr[unitno];

              /* copy the LCYCMDB pattern into lcycmdb_loaded in instance_info */

              for (wordno = 0; wordno < 3; ++wordno) {
                 unit_ptrs[unitno].word[wordno] =
                                      preamble_unit_ptrs[unitno].word[wordno];
              }
           }
        }

        DPRINTF(("reloading preamble word: %d\n", i));
        write_pattern(instance,
                      &instance->unit_addr[instance->cur_unit_addr_index][0],
                      preamble_word->word[i]);

        if (grow_pattern(instance) == FAILURE)
           return(FAILURE);
     }

     return(SUCCESS);
}

load_pre_feedback_seq(instance)
INSTANCE_INFO *instance;
{
   DEVICE_SPEC       *def;
   SEQ_SPEC          *seq_spec_ptr;
   UWB_OFFSET        *uwb_ptr;
   char              *bit_array;
   u_short            pre_seq_length;
   u_short            seq_count;
   u_short            i;
   u_short            pin_count;
   u_short            word_offset;
   u_short            bit_offset;
   u_short            pin_number;
   u_char             unitno;
   u_char             wordno;
   u_char             bitno;
```

Copyright 1989 Logic Modeling Systems

LINE # SOURCE TEXT

```
    DPRINTF(("inside load_pre_feedback_seq\n"));

    def = instance->definition;

    pre_seq_length = def->pre_seq_len;
    seq_count      = def->seq_cnt;

    for (i = 0; i < pre_seq_length; ++i) {

        word_offset = i / 8;
        bit_offset  = 7 - i % 8;

        for (pin_count = 0; pin_count < seq_count; ++pin_count) {

            seq_spec_ptr = &def->seq_table[pin_count];
            bit_array = seq_spec_ptr->pre_bits;
            pin_number = seq_spec_ptr->pin_number;

            uwb_ptr = &pm_to_short_offset[pin_number];
            unitno = uwb_ptr->unitno;
            wordno = uwb_ptr->wordno;
            bitno  = uwb_ptr->bitno;

            if ((bit_array[word_offset] >> bit_offset) & 1) {
                set_ptrn_bit(&instance->ptrn_loaded[unitno], wordno, bitno);
            }
            else {
                reset_ptrn_bit(&instance->ptrn_loaded[unitno], wordno, bitno);
            }
        }

        write_pattern(instance,
                      &instance->unit_addr[instance->cur_unit_addr_index][0],
                      instance->ptrn_loaded);
        /* Don't grow the pattern on the last pre feedback sequence pattern,
         * because otherwise grow_pattern() might allocate new blocks which
         * will have to be retracted if the pre feedback is followed by
         * a feedback sequence.
         */
        if (i != (pre_seq_length - 1))
            if (grow_pattern(instance) == FAILURE)
                return(FAILURE);
    }
    return(SUCCESS);
}

load_feedback_seq(instance, overflowed_pattern_count)
INSTANCE_INFO *instance;
u_long        *overflowed_pattern_count;
{
    DEVICE_SPEC          *def;
    PTRN_BITS_LONGWORD   *dummy_long;
    SEQ_SPEC             *seq_spec_ptr;
    DAB_INFO             *dab_ptr;
    UWB_OFFSET           *uwb_ptr;
    char                 *bit_array;
    u_long                dest_addr;
    u_long                source_addr[MAX_LANE_COUNT];
    u_long                saved_block_addr[MAX_LANE_COUNT];
    u_long               *temp_unit_addr;
    short                 leftover;
    u_short               quiet_patterns;
    short                 added_patterns;
    short                 extra_patterns;
    u_char                branch_nop;
    u_short               dummy_count;
    short                 branch_delay;
    short                 branch_location;
    short                 physical_seq_len;
    short                 sub_sequence;
    u_short               pin_number;
    u_short               fb_ptrn_count;
    short                 number_of_copies;
    short                 bits_per_pin = 1;
    u_short               i;
    u_short               j;
    u_short               played;
    u_short               ptrn_to_copy;
    short                 addr_offset;
    u_short               word_offset;
    u_short               pin_count;
    u_short               seq_count;
    u_short               fb_seq_length;
    u_short               power_of_2_ceiling;
    short                 dummy_count1;
    short                 dummy_count2;
    u_char                total_unit;
    u_char                unitno;
    u_char                wordno;
    u_char                bitno;
    u_char                bit_offset;
    u_char                laneno;
    u_char                max_block_size;

    DPRINTF(("inside load_feedback\n"));

    def = instance->definition;

    dab_ptr = dab_list[instance->dab_info_index];

    fb_ptrn_count = 0;
    if (bits_per_pin == 1) {
        if ((def->fb_seq_len * dab_ptr->unit_count_per_lane) >
             (FB_PTRN_COUNT - MAX_DUMMY_COUNT_1_BIT_PER_PIN)) {
            lm_queue_message(ERROR_MSG, "feedback sequence too long; max length: %d",
                             (FB_PTRN_COUNT - MAX_DUMMY_COUNT_1_BIT_PER_PIN) /
                             dab_ptr->unit_count_per_lane);
            return(FAILURE);
        }
    }
    else {
        if ((def->fb_seq_len * dab_ptr->unit_count_per_lane * 2) >
             (FB_PTRN_COUNT - MAX_DUMMY_COUNT_2_BIT_PER_PIN)) {
            lm_queue_message(ERROR_MSG, "feedback sequence too long; max length: %d",
                             (FB_PTRN_COUNT - MAX_DUMMY_COUNT_1_BIT_PER_PIN) /
                             (dab_ptr->unit_count_per_lane * 2));
            return(FAILURE);
        }
    }
```

Copyright 1989
Logic Modeling Systems

| SOURCE PROGRAM | DATE | PAGE # |
|---|---|---|
| lm1000/initseq.c | 5/23/89 TIME 6:14:43 pm | 9/81 |

LINE # SOURCE TEXT

```
    fb_seq_length = def->fb_seq_len;
    seq_count     = def->seq_cnt;

    for (i = 0; i < fb_seq_length; ++i) {
       word_offset = i / 8;
       bit_offset = 7 - i % 8;

       for (pin_count = 0; pin_count < seq_count; ++pin_count) {
          seq_spec_ptr = &def->seq_table[pin_count];
          bit_array = seq_spec_ptr->fb_bits;
          pin_number = seq_spec_ptr->pin_number;

          uwb_ptr = &pn_to_short_offset[pin_number];
          unitno = uwb_ptr->unitno;
          wordno = uwb_ptr->wordno;
          bitno  = uwb_ptr->bitno;


          if ((bit_array[word_offset] >> bit_offset) & 1) {
             set_ptrn_bit(&instance->ptrn_loaded[unitno], wordno, bitno);
          }
          else {
             reset_ptrn_bit(&instance->ptrn_loaded[unitno], wordno, bitno);
          }

       }

       fb_ptrn_count += dab_ptr->unit_count_per_lane;
       write_pattern(instance,
                     &instance->unit_addr[instance->cur_unit_addr_index][0],
                     instance->ptrn_loaded);
       if (grow_pattern(instance) == FAILURE)
          return(FAILURE);
    }

    physical_seq_len = fb_ptrn_count;

    /* Up to this point the pattern address has been incremented by
     * unit_count_per_lane units worth of addresses. From now on we
     * are going to start writing dummy pattern which is only 1 unit
     * long with write_pattern_unit(). The write_pattern_unit() will
     * look at the LANE_ADDR_INFO.last_unit_addr for the address to
     * write to. Since the last call to grow pattern has incremented
     * the address for unit_count_per_lane units, we need to adjust
     * it by calling the adjust_pattern_addr().
     */

    adjust_pattern_addr(instance);

    /* We need to wait the following number of PCLK:
     *    4 PCLK                  for the propagation delay from DUT output
     *                            to the input of the synchronizer register.
     *                            Later: this should depend on the frequency
     *                                   we are using.
     *    2 logical clock         since we assume that the DUT output changes
     *                            within 2 logical clock after the input.
     *                            Later: make this delay specifyable by the
     *                                   user in the DABDEF.
     *    1 logical clock         since the clock edges appear for the whole
     *                            logical clock after the pattern is latched
     *                            into the MAGIC register.
     */
   quiet_patterns = 4 + 3 * (dab_ptr->unit_count_per_lane * bits_per_pin);

   /* The clock edges can only span 8 PCLK maximum. So if
    * (unit_count_per_lane * bits_per_pin) is greater than 8 then we can
    * actually reduce the quiet_pattern_count by the remainder of PCLK where
    * there are no edges.
    */

   extra_patterns = dab_ptr->unit_count_per_lane * bits_per_pin - 8;
   if (extra_patterns < 0)
      extra_patterns = 0;

   added_patterns = quiet_patterns - extra_patterns;
   if (added_patterns < 0)
      added_patterns = 0;

  /* Add 1 more pattern to make the subsequence pattern even, so that
   * the branch command will stay at the odd address.
   */
  if (even(physical_seq_len + added_patterns))
      branch_nop = 0;
   else
      branch_nop = 1;

   dummy_count = added_patterns + branch_nop;

   DPRINTF(("FB dummy_count: %d\n", dummy_count));

   for (i = 0; i < dummy_count; ++i) {
      ++fb_ptrn_count;
      write_pattern_unit(instance, dab_ptr->dummy_ptrn);
      if (grow_pattern_unit(instance) == FAILURE)
         return(FAILURE);
   }

   sub_sequence = physical_seq_len + added_patterns + branch_nop;
   branch_delay = physical_seq_len - extra_patterns +
                  quiet_patterns + FB_PIPE_DELAY;

   if (! even(branch_delay))
      ++branch_delay;

   branch_location = branch_delay % sub_sequence - 1;

   if (branch_location < 0) {
      if (branch_location == -1) {
         branch_location = sub_sequence - 1;
      }
      else {
         lm_queue_message(ERROR_MSG, "internal error: branch location is negative");
         return(FAILURE);
      }
   }

   DPRINTF(("FB branch_location: %d\n", branch_location));
   set_feedback_branch(instance, branch_location);
```

Copyright 1989 Logic Modeling Systems

| SOURCE PROGRAM | DATE | PAGE # |
|---|---|---|
| lm1000/initseq.c | 5/23/89 | 10/82 |
| | TIME 6:14:43 pm | |

LINE # SOURCE TEXT

```
    /* Find the next power of 2 number after sub_sequence */
    power_of_2_ceiling = 1;
    while (power_of_2_ceiling < sub_sequence) {
       power_of_2_ceiling <<= 1;
    }

    dummy_count = 0;

    if (power_of_2_ceiling != sub_sequence) {
       /* sub_sequence is not power of 2 long ---> add more dummies:
        *     1. to make it power of 2 long
        *     2. to satisfy the BRANCH_LATENCY in the sub sequence.
        * Choose either 1 or 2 whichever produces less dummy ptrns.
        */
       dummy_count1 = power_of_2_ceiling - sub_sequence;

       /* Note the following:
        *     - branch_location is always odd
        *     - BRANCH_LATENCY is even
        *     - sub_sequence is even at this point
        * therefore dummy_count2 will always be even
        */
       dummy_count2 = (branch_location + 1) + BRANCH_LATENCY - sub_sequence;
       if (dummy_count2 < 0)
          dummy_count2 = 0;

       if (dummy_count1 < dummy_count2)
          dummy_count = dummy_count1;
       else
          dummy_count = dummy_count2;

       DPRINTF(("FB more dummy_count to satisfy branch constraint: %d\n",
                dummy_count));

       for (i = 0; i < dummy_count; ++i) {
          ++fb_ptrn_count;
          write_pattern_unit(instance, dab_ptr->dummy_ptrn);
          if (grow_pattern_unit(instance) == FAILURE)
             return(FAILURE);
       }
    }

    /* Replicate the feedback patterns to fill the whole feedback blocks */
    for (laneno = 0; laneno < MAX_LANE_COUNT; ++laneno) {

       if (dab_ptr->lane_used[laneno]) {
          dest_addr = instance->fb_block_addr[laneno] +
             fb_ptrn_count * PTRN_ADDR_INC;

          /* Fill the first 512K patterns */
          number_of_copies = PAM128K_FB_BLOCK_COUNT * PTRN_PER_BLOCK /
                                                     fb_ptrn_count - 1;
          DPRINTF(("copy FB sequence %d times\n", number_of_copies));
          while (number_of_copies > 0) {
             copy_pattern(instance->fb_block_addr[laneno],
                          dest_addr, fb_ptrn_count);
             dest_addr += fb_ptrn_count * PTRN_ADDR_INC;
             --number_of_copies;
          }

          /* Fill the remaining blocks with dummy patterns */
          leftover = PAM128K_FB_BLOCK_COUNT * PTRN_PER_BLOCK % fb_ptrn_count;
          DPRINTF(("FB fill block with dummy ptrns to 512 ptrns; count: %d\n",
                leftover));

          dummy_long = (PTRN_BITS_LONGWORD *)&dab_ptr->dummy_ptrn[laneno];
          while (leftover > 0) {
             write_loc_long((u_long *)dest_addr,
                                                   dummy_long->word[0]);
             write_loc_long((u_long *)(dest_addr + LANE_SEGMENT_B_OFFSET),
                                                   dummy_long->word[1]);
             write_loc_long((u_long *)(dest_addr + LANE_SEGMENT_C_OFFSET),
                                                   dummy_long->word[2]);

             DPRINTF(("FB dummy %08x:  %08X %08X %08X\n", dest_addr,
                   dummy_long->word[0],
                   dummy_long->word[1],
                   dummy_long->word[2]));


             --leftover;
             dest_addr += PTRN_ADDR_INC;
          }

          /* Replicate the first 512 patterns if necessary. */
          number_of_copies =
             instance->fb_block_size[laneno] / PAM128K_FB_BLOCK_COUNT - 1;

          DPRINTF(("FB replicate first 512 patterns for %d times\n",
                number_of_copies));

          while (number_of_copies > 0) {
             copy_pattern(instance->fb_block_addr[laneno], dest_addr,
                          PAM128K_FB_BLOCK_COUNT * PTRN_PER_BLOCK);
             dest_addr += PAM128K_FB_BLOCK_COUNT * PTRN_PER_BLOCK *
                                                   PTRN_ADDR_INC;
             --number_of_copies;
          }
       }
    }

    /* Increment the pattern count to the maximum feedback block. Note
     * that this number is greater than the actual pattern memory used
     * if the number of feedback block required on each lane is different.
     */
    max_block_size = 0;
    for (laneno = 0; laneno < MAX_LANE_COUNT; ++laneno) {
       if (instance->fb_block_size[laneno] > max_block_size)
          max_block_size = instance->fb_block_size[laneno];
    }
    instance->pattern_count += (max_block_size * PTRN_PER_BLOCK) -
                                                   fb_ptrn_count;
    if (allocate_initial_block(instance) == FAILURE)
       return(FAILURE);

    /* subtract pattern_count which was incremented in
     * allocate_initial_block().
     */
    instance->pattern_count -= dab_ptr->unit_count_per_lane;
```

Copyright 1989 Logic Modeling Systems

SOURCE PROGRAM lm1000/initseq.c

DATE 5/23/89 TIME 6:14:43 pm PAGE # 11/83

LINE # SOURCE TEXT

```
    /* Set the branch address for each block in the feedback sequence to
     * link the post feedback blocks to the feedback blocks.
     */
    for (laneno = 0; laneno < MAX_LANE_COUNT; ++laneno) {
       if (dab_ptr->lane_used[laneno]) {
          for (j = 0; j < instance->fb_block_[illegible][laneno]; ++j) {

             write_branch_table(instance->fb_block_addr[laneno] +
                                j * BLOCK_ADDR_INC,
                                instance->lane_addr[laneno].max_addr -
                                                      BLOCK_ADDR_INC);

          }
       }
    }

    /* Now copy the part of the feedback sequence to the post feedback blocks
     * because we might have played only part of the feedback sequence due
     * to the BRANCH LATENCY.
     */

    /* branch_location + 1 ---> to get count instead of pattern number */
    played = (branch_location + 1 + BRANCH_LATENCY) %
                                  (sub_sequence + dummy_count);
    ptrn_to_copy = 0;
    if (physical_seq_len > played)
       ptrn_to_copy = physical_seq_len - played;

    for (laneno = 0; laneno < MAX_LANE_COUNT; ++laneno) {
       if (dab_ptr->lane_used[laneno]) {
             source_addr[laneno] = instance->fb_block_addr[laneno] +
                                   played * PTRN_ADDR_INC;
       }
    }

    instance->pattern_count += ptrn_to_copy;

    DPRINTF(("copy FB sequence to post feedback blocks; ptrn_to_copy: %d\n",
          ptrn_to_copy));
    /* ptrn_to_copy can be up to 512 patterns, so we cannot
     * just do a copy_pattern() because we have only allocated 1 block.
     */
    if (ptrn_to_copy > PTRN_PER_BLOCK) {
       for (laneno = 0; laneno < MAX_LANE_COUNT; ++laneno) {
          if (dab_ptr->lane_used[laneno]) {

             copy_pattern(source_addr[laneno],
                          instance->lane_addr[laneno].max_addr - BLOCK_ADDR_INC,
                          PTRN_PER_BLOCK);

             source_addr[laneno] += BLOCK_ADDR_INC;
             saved_block_addr[laneno] = instance->lane_addr[laneno].max_addr -
                BLOCK_ADDR_INC;
          }
       }

       ptrn_to_copy -= PTRN_PER_BLOCK;

       if (allocate_initial_block(instance) == FAILURE)
          return(FAILURE);

       /* subtract pattern_count which was incremented in
        * allocate_initial_block().
        */
       instance->pattern_count -= dab_ptr->unit_count_per_lane;

       for (laneno = 0; laneno < MAX_LANE_COUNT; ++laneno) {
          if (dab_ptr->lane_used[laneno])
             set_branch(saved_block_addr[laneno]  + BLOCK_ADDR_INC -
                        PTRN_ADDR_INC,
                        instance->lane_addr[laneno].max_addr - BLOCK_ADDR_INC);
          }
       }
    }

    if (ptrn_to_copy > 0) {
       for (laneno = 0; laneno < MAX_LANE_COUNT; ++laneno) {
          if (dab_ptr->lane_used[laneno]) {
             copy_pattern(source_addr[laneno],
                          instance->lane_addr[laneno].max_addr - BLOCK_ADDR_INC,
                          ptrn_to_copy);
          }
       }
    }

    *overflowed_pattern_count = ptrn_to_copy;

    /* Setup the pattern unit address.
     * Make instance->unit_addr[] points to the last pattern which has
     * already been copied by copy_pattern(). When we do this it is possible
     * that some instance->unit_addr[] will point to addresses less than the
     * beginning address of the block. But this is OK because we will call
     * grow_pattern() next which will fix this problem. grow_pattern() will
     * make instance->unit_addr[] points to the address to load the next
     * pattern.
     */

    /* Calculate the addr_offset for each unit addr. Note that we can pick
     * any unit in any lane to calculate the offset, since this offset is
     * the same for any unit. Also note that the addr_offset could be negative
     * if the ptrn_to_copy is less than unit_count_per_lane.
     */
    laneno = dab_ptr->unit_location[0].lane_no;
    temp_unit_addr = &instance->unit_addr[instance->cur_unit_addr_index][0];
    addr_offset = instance->lane_addr[laneno].max_addr - BLOCK_ADDR_INC +
                  ptrn_to_copy * PTRN_ADDR_INC -
                  dab_ptr->unit_count_per_lane * PTRN_ADDR_INC -
                  temp_unit_addr[0];

    total_unit = dab_ptr->lane_count * dab_ptr->unit_count_per_lane;
    for (unitno = 0; unitno < total_unit; ++unitno) {
       temp_unit_addr[unitno] += addr_offset;
    }

    if (grow_pattern(instance) == FAILURE)
       return(FAILURE);

    return(SUCCESS);
}
```

Copyright 1989 Logic Modeling Systems

SOURCE PROGRAM lm1000/initseq.c | DATE 5/23/89 | TIME 6:14:43 pm | PAGE # 12/84

LINE # SOURCE TEXT

```
load_post_feedback_seq(instance)
INSTANCE_INFO *instance;
{
   DEVICE_SPEC          *def;
   SEQ_SPEC             *seq_spec_ptr;
   UWB_OFFSET           *uwb_ptr;
   char                 *bit_array;
   u_short               i;
   u_short               pin_count;
   u_short               word_offset;
   u_short               bit_offset;
   u_short               pin_number;
   u_short               post_seq_length;
   u_short               seq_count;
   u_char                unitno;
   u_char                wordno;
   u_char                bitno;

   DPRINTF(("inside load_post_feedback_seq\n"));

   def = instance->definition;
   seq_count = def->seq_cnt;
   post_seq_length = def->post_seq_len;

   for (i = 0; i < post_seq_length; ++i) {

      word_offset = i / 8;
      bit_offset  = 7 - i % 8;

      for (pin_count = 0; pin_count < seq_count; ++pin_count) {

         seq_spec_ptr = &def->seq_table[pin_count];
         bit_array = seq_spec_ptr->post_bits;
         pin_number = seq_spec_ptr->pin_number;

         uwb_ptr = &pn_to_short_offset[pin_number];
         unitno = uwb_ptr->unitno;
         wordno = uwb_ptr->wordno;
         bitno  = uwb_ptr->bitno;

         if ((bit_array[word_offset] >> bit_offset) & 1) {
            set_ptrn_bit(&instance->ptrn_loaded[unitno], wordno, bitno);
         }
         else {
            reset_ptrn_bit(&instance->ptrn_loaded[unitno], wordno, bitno);
         }
      }

      write_pattern(instance,
                    &instance->unit_addr[instance->cur_unit_addr_index][0],
                    instance->ptrn_loaded);
      if (grow_pattern(instance) == FAILURE)
         return(FAILURE);
   }
   return(SUCCESS);
}

set_initial_values(instance)
INSTANCE_INFO  *instance;
{
   DEVICE_SPEC          *def_ptr;
   EXTRA_DEVICE_SPEC    *extra_def_ptr;
   DAB_INFO             *dab_ptr;
   PIN_SPEC             *pin_spec_ptr;
   PIN_INFO             *pin_info;
   UWB_OFFSET           *uwb_ptr;
   PTRN_BITS            *ptrn_bits_ptr;
   PTRN_BITS_LONGWORD   *ptrn_loaded_ptr;
   PTRN_BITS_LONGWORD   *last_consistent_set_ptr;
   PTRN_BITS_LONGWORD   *ident_ios_ptr;
   PTRN_BITS_LONGWORD   *ident_store_ptr;
   PTRN_BITS_LONGWORD   *ident_outputs_ptr;
   PTRN_BITS_LONGWORD   *ident_R1_ptr;
   PTRN_BITS_LONGWORD   *ident_RZ_ptr;
   PTRN_BITS_LONGWORD   *hmdenb_loaded_ptr;
   PTRN_BITS_LONGWORD   *last_sample_value_hiz_ptr;
   u_long                inst_block_number[MAX_LANE_COUNT];
   u_long                ident_store_ios;
   u_long                seq_end_addr[MAX_LANE_COUNT];
   u_short               seq_count;
   u_short               pin_count;
   u_short               pin_number;
   u_char                total_unit;
   u_char                unitno;
   u_char                wordno;
   u_char                bitno;
   u_char                changed_dac;

   DPRINTF(("set initial values\n"));

   def_ptr = instance->definition;
   extra_def_ptr = (EXTRA_DEVICE_SPEC *)def_ptr->extra_data;

   dab_ptr = dab_list[instance->dab_info_index];
   total_unit = dab_ptr->unit_count;

   ptrn_loaded_ptr = (PTRN_BITS_LONGWORD *)instance->ptrn_loaded;
   ident_R1_ptr = (PTRN_BITS_LONGWORD *)extra_def_ptr->ident_R1;
   ident_RZ_ptr = (PTRN_BITS_LONGWORD *)extra_def_ptr->ident_RZ;
   ident_outputs_ptr = (PTRN_BITS_LONGWORD *)extra_def_ptr->ident_outputs;
   for (unitno = 0; unitno < total_unit; ++unitno) {
      for (wordno = 0; wordno < 3; ++wordno) {

         /* Disable the R1 and RZ clock */
         ptrn_loaded_ptr->word[wordno] |= ident_R1_ptr->word[wordno];
         ptrn_loaded_ptr->word[wordno] &= ~ident_RZ_ptr->word[wordno];

         ptrn_loaded_ptr->word[wordno] &= ~ident_outputs_ptr->word[wordno];
      }

      ++ptrn_loaded_ptr;
      ++ident_R1_ptr;
      ++ident_RZ_ptr;
      ++ident_outputs_ptr;
   }

   write_pattern(instance,
                 &instance->unit_addr[instance->cur_unit_addr_index][0],
                 instance->ptrn_loaded);
```

Copyright 1989
Logic Modeling Systems

SOURCE PROGRAM lm1000/initseq.c | DATE 5/23/89 | TIME 6:14:43 pm | PAGE # 13/85

LINE # SOURCE TEXT

```
#ifndef DBASE
   if (start_tmg(def_ptr) == FAILURE) {
      return(FAILURE);
   }
#endif

   if (program_dac(def_ptr, (char)instance->dab_info_index,
                              &changed_dac) == FAILURE) {
      return(FAILURE);
   }

   if (set_edge_and_sample_setting(extra_def_ptr,
                              (u_long)RESOLUTION_05_NS,
                              (u_long)MAX_SAMPLE_RAMP_RANGE) == FAILURE)
      return(FAILURE);

   set_seq_end_bit(instance,
                   instance->lane_addr,
                   FALSE,
                   seq_end_addr,
                   inst_block_number);

   if (play_ptrn_seq(instance, (u_long)PTRN_PLAY_TIMEOUT,
                              &changed_dac) == FAILURE)
      return(FAILURE);

#ifdef DEBUG
   if (loop_till_key == TRUE) {
      printf("looping in create instance\n");
      debug_key = 0;
      while (debug_key == 0) {
         if (play_ptrn_seq(instance,
                     (u_long)PTRN_PLAY_TIMEOUT, &changed_dac) == FAILURE)
            return(FAILURE);
      }
      if (debug_char == (u_long)'1') {
         loop_till_key = FALSE;
         printf("stop loop\n");
      }
      debug_key = 0;
   }
#endif

   remove_seq_end_bit(instance, seq_end_addr, inst_block_number);

   read_magic_full_sample_reg(instance, &instance->last_sample_value);

   /* Set the initial simulator pin values to whatever value we sample. */
   copy_ptrn_bits((char *)instance->last_sample_value.unknown,
                  (char *)instance->sim_pin_value.unknown,
                  dab_ptr->unit_count);
   copy_ptrn_bits((char *)instance->last_sample_value.hiz,
                  (char *)instance->sim_pin_value.hiz,
                  dab_ptr->unit_count);
   copy_ptrn_bits((char *)instance->last_sample_value.data,
                  (char *)instance->sim_pin_value.data,
                  dab_ptr->unit_count);

   /* Set the sim_pin_value to the last value of the reset sequence.
    * Note that this value is in the last_ptrn_loaded.
    * Also note that for R1/RZ pins, set the sim_pin_value to the inactive
    * state.
    */
   seq_count = def_ptr->seq_cnt;
   for (pin_count = 0; pin_count < seq_count; ++pin_count) {

      pin_number = def_ptr->seq_table[pin_count].pin_number;
      pin_spec_ptr = &def_ptr->pin_table[pin_number];
      pin_info = &instance->pin_info_table[pin_number];

      uwb_ptr = &pn_to_short_offset[pin_number];
      unitno = uwb_ptr->unitno;
      wordno = uwb_ptr->wordno;
      bitno  = uwb_ptr->bitno;

      switch (pin_spec_ptr->clk_format) {
      case DNRZ:
         pin_info->uninitialized_pin = FALSE;
         if (read_ptrn_bit(&instance->ptrn_loaded[unitno], wordno, bitno) == 0)
            set_pin_value(&instance->sim_pin_value,
                          unitno, wordno, bitno, (u_char)LOGIC_0);
         else
            set_pin_value(&instance->sim_pin_value,
                          unitno, wordno, bitno, (u_char)LOGIC_1);
         break;
      case R1:
         pin_info->uninitialized_pin = FALSE;
         set_pin_value(&instance->sim_pin_value,
                       unitno, wordno, bitno, (u_char)LOGIC_1);
         break;
      case R0:
         pin_info->uninitialized_pin = FALSE;
         set_pin_value(&instance->sim_pin_value,
                       unitno, wordno, bitno, (u_char)LOGIC_0);
         break;
      default:
         break;
      }
   }

   /* Set the initial simulator pin value for I/O store pins to Z.
    * Also set the HMDENB for I/O store pins which are driving to 1.
    */
   ident_ios_ptr     = (PTRN_BITS_LONGWORD *)extra_def_ptr->ident_ios;
   ident_store_ptr   = (PTRN_BITS_LONGWORD *)extra_def_ptr->ident_store;
   hmdenb_loaded_ptr = (PTRN_BITS_LONGWORD *)instance->hmdenb_loaded;
   last_sample_value_hiz_ptr =
                  (PTRN_BITS_LONGWORD *)instance->last_sample_value.hiz;

   for (unitno = 0; unitno < total_unit; ++unitno) {
      for (wordno = 0; wordno < 3; ++wordno) {
         ident_store_ios = ident_ios_ptr->word[wordno] &
                           ident_store_ptr->word[wordno];

         hmdenb_loaded_ptr->word[wordno] |=
            ident_store_ios & ~last_sample_value_hiz_ptr->word[wordno];
      }

      ++ident_ios_ptr;
```

Copyright 1989 Logic Modeling Systems

SOURCE PROGRAM lm1000/initseq.c DATE 5/23/89 TIME 6:14:43 pm PAGE # 14/86

LINE # SOURCE TEXT

```c
        ++ident_store_ptr;
        ++hmdenb_loaded_ptr;
        ++last_sample_value_biz_ptr;
    }

    /* Calculate consistent set */
    calculate_consistent_set(instance, def_ptr, instance->last_consistent_set);

    /* Restore the HMDENB to the actual value. The first HMDENB (in preamble)
     * disable the H/M driver for IO and OUTPUT pins.
     */
    write_pattern(instance,
                  &instance->unit_addr[instance->cur_unit_addr_index][0],
                  instance->hmdenb_loaded);

    if (grow_pattern(instance) == FAILURE)
        return(FAILURE);

    last_consistent_set_ptr = (PTRN_BITS_LONGWORD *)
                                  instance->last_consistent_set;
    ptrn_bits_ptr = instance->last_consistent_set;
    ident_R1_ptr = (PTRN_BITS_LONGWORD *)extra_def_ptr->ident_R1;
    ident_RZ_ptr = (PTRN_BITS_LONGWORD *)extra_def_ptr->ident_RZ;
    for (unitno = 0; unitno < total_unit; ++unitno) {
        set_pel_user_bit(&ptrn_bits_ptr->ctl);

        for (wordno = 0; wordno < 3; ++wordno) {

            /* Disable the R1 and RZ clock */
            last_consistent_set_ptr->word[wordno] |= ident_R1_ptr->word[wordno];
            last_consistent_set_ptr->word[wordno] &= ~ident_RZ_ptr->word[wordno];

        }

        ++last_consistent_set_ptr;
        ++ident_R1_ptr;
        ++ident_RZ_ptr;
        ++ptrn_bits_ptr;
    }

    /* Nail down the first pattern */
    write_pattern(instance,
                  &instance->unit_addr[instance->cur_unit_addr_index][0],
                  instance->last_consistent_set);

    /* User bit in first pattern only. */
    ptrn_bits_ptr = instance->last_consistent_set;
    for (unitno = 0; unitno < total_unit; ++unitno) {
        clear_pel_user_bit(&ptrn_bits_ptr->ctl);
        ++ptrn_bits_ptr;
    }

    if (grow_pattern(instance) == FAILURE)
        return(FAILURE);

    /* Duplicate the first pattern (with the trigger bit) because,
     * it can be overwritten by the HMDENB if any I/O store pins
     * change direction from driving to Z.
     */
    write_pattern(instance,
                  &instance->unit_addr[instance->cur_unit_addr_index][0],
                  instance->last_consistent_set);

    if (grow_pattern(instance) == FAILURE)
        return(FAILURE);

    /* copy the last_consistent_set to ptrn_loaded */
    copy_ptrn_bits((char *)instance->last_consistent_set,
                   (char *)instance->ptrn_loaded,
                   dab_ptr->unit_count);

    /* Initialize the OUTPUT pins in ptrn loaded to 0 */
    ptrn_loaded_ptr   = (PTRN_BITS_LONGWORD *)instance->ptrn_loaded;
    ident_outputs_ptr = (PTRN_BITS_LONGWORD *)extra_def_ptr->ident_outputs;
    for (unitno = 0; unitno < total_unit; ++unitno) {
        for (wordno = 0; wordno < 3; ++wordno) {
            ptrn_loaded_ptr->word[wordno] &= ~ident_outputs_ptr->word[wordno];
        }
        ++ptrn_loaded_ptr;
        ++ident_outputs_ptr;
    }

    /* Write out the measurement pattern */
    write_pattern(instance,
                  &instance->unit_addr[instance->cur_unit_addr_index][0],
                  instance->ptrn_loaded);

    return(SUCCESS);
}
```

Copyright 1989
Logic Modeling Systems

SOURCE PROGRAM
lm1000/lmserver.c

DATE 5/23/89
TIME 6:14:45 pm

PAGE # 1/87

LINE # SOURCE TEXT

```
/* SCCS_ID: lmserver.c rev 1.2, 5/9/89 at 17:20:35      */

#include "device.h"
#include "message.h"
#include "h[illegible]re.h"
#include "mo[illegible]r.h"
#include "eeprom.h"
#include "lmserver.h"
#include "lnetwork.h"
#include "network.h"
#include "function.h"
#include "lm_sfi.h"

#ifdef MODELER
#include "vrtx.h"
#endif

#ifdef DEBUG
extern u_long  debug_key;
extern u_long  debug_char;
u_char loop_till_key = FALSE;
#endif


/* ???? defined in uvaram.h */
#define SHUTDOWN        (char)2
#define REBOOT          (char)3

#define TICKS_PER_SECOND 1000
#define REBOOT_MSG_DELAY_TIME (TICKS_PER_SECOND * 30)

#ifdef DIRECTCONN
ac_spend(X, Y, Z) {}

u_char   play_completed_flag;
u_long   available_malloc_size;
u_long   total_malloc_size;
int play_semaphore;
#endif

#ifdef DEBUG
u_char                  lm_printit = TRUE;
#endif

CONNECTION              *lm_global_conn_ptr;
extern CONNECTION       *table_of_conns[ ];

DAB_INFO                *dab_list[MAX_LANE_COUNT * MAX_SLOT_COUNT];
USER_INFO               *user_info_array[MAX_USER_COUNT];
SYSTEM_INFO             *system_config;

void                    (*function_array[MAX_FUNCTION])();

CONFIGURATION_ERRORS  config_error;

/* CPU byte address of free block on each lane */
u_long                  free_block_list[MAX_LANE_COUNT];

u_long     bitno_to_mask[32];

/* ??? for debugging only */
#ifdef DBASE
TM_RESULT               tm_result_array[MAX_PIN_COUNT];
#endif
u_char                  in_measure_delay;

PTRN_BITS              *gbl_dummy_ptrn;

FULL_VALUE              gbl_new_sample_value;
FULL_VALUE              gbl_steady_state_result;
FULL_VALUE              gbl_temp_steady_state_result;
PTRN_BITS_LONGWORD      gbl_ident_inconsistent_pins[MAX_UNIT_COUNT];
PTRN_BITS_LONGWORD      gbl_ident_change[MAX_UNIT_COUNT];
TM_PIN_INFO             gbl_tm_pin_info_table[MAX_PIN_COUNT];

/* The convert bit pattern to logic value.
 * The syntax of the bit pattern is UNK:HIZ:SOFT:DATA
 */
u_char                  bit_to_logic_table[16];

#ifndef MODELER
LM_HARDWARE_ERROR       modeler_error;
#endif

extern LM_HARDWARE_ERROR          modeler_error;
u_char                  fatal_hardware_error_encountered = FALSE;
u_char                  fatal_configuration_error_encountered = FALSE;
u_char                  non_fatal_configuration_error_encountered = FALSE;
long                    time_reboot_was_issued;
long                    reboot_delay_time;
u_char                  rebooting = FALSE;
u_char                  reboot_flag;
u_char                  xshutdown = FALSE;

UWB_OFFSET              pn_to_short_offset[MAX_PIN_COUNT];

u_short                 gbl_eval_pin_number[MAX_EVAL_CHANGES];
u_char                  gbl_eval_pin_value[MAX_EVAL_CHANGES];
u_long                  gbl_eval_min_delay[MAX_EVAL_CHANGES];
u_long                  gbl_eval_max_delay[MAX_EVAL_CHANGES];

u_char                  lm_hardware_init_done = FALSE;

extern u_long           lm_dead_user_mask;

#ifndef MODELER
main()
#else
void
pattern_task()
#endif
{
    u_short      rtn;
    u_char       user;
    u_short      type;
    u_long       temp;
    u_long       mins, secs;
    char         str[MAX_MESSAGE];
    u_long      *reboot_msg_delay = (u_long*) NULL;
```

Copyright 1989
Logic Modeling Systems

| SOURCE PROGRAM | DATE | 5/23/89 | PAGE # |
|---|---|---|---|
| lm1000/lmserver.c | TIME | 6:14:45 pm | 2/88 |

LINE # SOURCE TEXT

```
    extern u_short lm_give_me_the_next_user();

    DPRINTF(("LM server\n"));

#ifdef MODELER
    init();

    if (init_socket() == FAILURE) {
        DPRINTF(("ERROR in init_socket\n"));
    }

    read_hw_config();

    init_mod_err();

    (void)printf("ready\n");
#endif

    lm_dead_user_mask = 0;
    while (1) {
        rts = lm_give_me_the_next_user(&user);
        DPRINTF(("got user: %d from lm_give_me_the_next_user\n", user));

        lm_global_conn_ptr = table_of_conns[user];
        if (lm_global_conn_ptr == NULL)
          continue;

        if (rts != SUCCESS) {
            while (lm_dequeue_message(&type, str) == SUCCESS) {
                DPRINTF(("%s\n", str));
            }
            DPRINTF(("error in lm_give_me_the_next_user()\n"));
        }
        else {

            lm_flush_message_queue();

            if (lm_hardware_init_done == FALSE) {
                send_hardware_init_message();
                continue;
            }

            if (user_info_array[user]->active == FALSE) {
                if (rebooting == FALSE) {
                    if (prepare_user(user) == FAILURE) {
                        send_alloc_error_message(user_info_array[user]);
                        check_reboot();
                        continue;
                    }

                    if (non_fatal_configuration_error_encountered == TRUE) {
                        queue_up_non_fatal_config_message();
                    }

                    process_client_request(user_info_array[user]);
                }
                else {
                    if (prepare_user(user) == FAILURE) {
                        send_alloc_error_message(user_info_array[user]);
                        check_reboot();
                        continue;
                    }

                    send_rebooting_message(user_info_array[user]);
                }
            }
            else {

                if (rebooting == TRUE) {
                    if (reboot_msg_delay == (u_long *) NULL) {
                        reboot_msg_delay = (u_long *) DCALLOC(MAX_USER_COUNT, sizeof(u_long));
                    }
                    temp = lm_time() - time_reboot_was_issued;
                    if (temp  > *(reboot_msg_delay + user)) {

                        if (reboot_delay_time > temp) {
                            mins = (reboot_delay_time - temp) / (60 * TICKS_PER_SECOND),
                            secs = ((reboot_delay_time - temp) / TICKS_PER_SECOND) - (mins * 60);
                            lm_queue_message(WARNING_MSG, "Modeler is going down in %d minutes and %d seconds.",
                                             mins,
                                             secs);
                        } else {
                            lm_queue_message(WARNING_MSG, "Modeler is going down when all users are finished.");
                        }
                        *(reboot_msg_delay + user) = temp + REBOOT_MSG_DELAY_TIME;
                    }
                }

                process_client_request(user_info_array[user]);
                }
        }

        check_reboot();
    }
}

process_client_request(cur_user)
USER_INFO *cur_user;
{
    u_short errors;
    u_short warnings;
    char func_number;

    DPRINTF(("inside process_client_request\n"));

#ifdef DEBUG
    if (debug_key == 1) {
        printf("key hit: %x\n", debug_char);
        if (debug_char == (u_long)'p') {
            if (lm_printit == TRUE)
                lm_printit = FALSE;
            else
                lm_printit = TRUE;
        }
        else if ((debug_char) == (u_long)'t') {
            if (loop_till_key == TRUE)
                loop_till_key = FALSE;
            else
                loop_till_key = TRUE;
        }
```

Copyright 1989
Logic Modeling Systems

| SOURCE PROGRAM | DATE | PAGE # |
|---|---|---|
| lm1000/lmserver.c | 5/23/89 | 3/89 |
| | TIME 6:14:45 pm | |

LINE # SOURCE TEXT

```
        else {
           printf("unknown key hit\n");
        }
        debug_key = 0;
     }
#endif

   if (fatal_hardware_error_encountered == TRUE) {
      DPRINTF(("fatal_hardware_error_encounter == TRUE\n"));
      send_fatal_hw_error_message(cur_user);
      return;
   }
   else if (fatal_configuration_error_encountered == TRUE) {
      DPRINTF(("fatal_configuration_error_encounter == TRUE\n"));
      send_fatal_config_error_message(cur_user);
      return;
   }
   else {
      if (modeler_error.error == TRUE) {
         DPRINTF(("modeler_error.error == TRUE\n"));
         modeler_error.error = FALSE;

         if ((modeler_error.pac_lane_errors != 0) ||
             (modeler_error.tmg_error == TRUE) ||
             (modeler_error.unknown_source_of_interrupt == TRUE)) {
            fatal_hardware_error_encountered = TRUE;
            send_fatal_hw_error_message(cur_user);
            return;
         }

         if (modeler_error.dab_change) {
            reconfigure_dab();
         }
         else {
            if (modeler_error.pel_error_list != 0) {
               /* Set it back to TRUE so that play_ptrn_seq() is aware
                * of this condition.
                */
               modeler_error.error = TRUE;
            }
         }
      }

      func_number = (lm_get_int() - 2) >> 1;

      if ((func_number >= 0) && (func_number < MAX_FUNCTION)) {
         function_array[func_number](cur_user);
      }
      else
         process_no_such(cur_user);
   }

   lm_message_types(&errors, &warnings);
   if ((errors + warnings) != 0)
      DPRINTF(("ASSERT: some messages not dequeued at end of process_*\n"));
}

send_hardware_init_message()
{
   char    command_number;
#ifdef DEBUG
   u_short temp;
   char    error_string[MAX_STRING_LENGTH];
#endif

   DPRINTF(("inside send_hardware_init_message\n"));

   command_number = lm_get_int();

   lm_put_int(command_number + 1);
   lm_queue_message(ERROR_MSG, "modeler is being initialized");

   end_queue_message();

   end_put(0);

   lm_delay(50);

   if (close_connection_for_server(lm_global_conn_ptr) != SUCCESS) {
#ifdef DEBUG
      while (1) {
         if (lm_dequeue_message(&temp, error_string) != FAILURE)
            DPRINTF(("%s", error_string));
         else
            break;
      }
#endif
   }
}

send_rebooting_message(user)
USER_INFO *user;
{
#ifdef DEBUG
   u_short   temp;
   char      error_string[512];
#endif
   char      command_number;

   DPRINTF(("inside send_rebooting_message\n"));

   command_number = lm_get_int();

   reset_obuf();
   lm_put_int(command_number + 1);
    if (xshutdown == FALSE) {
       lm_queue_message(ERROR_MSG, "cannot accept any new users; modeler is being rebooted...");
    } else {
       lm_queue_message(ERROR_MSG, "cannot accept any new users; modeler is being shut down...");
    }

   abort_user(user);

   end_queue_message();

   end_put(user->fd);


   if (set_close_connection_for_server(lm_global_conn_ptr) != SUCCESS) {
#ifdef DEBUG
```

Copyright 1989
Logic Modeling Systems

| SOURCE PROGRAM | DATE | PAGE # |
|---|---|---|
| lm1000/lmserver.c | 5/23/89 TIME 6:14:45 pm | 4/90 |

LINE # SOURCE TEXT

```
        while (1) {
            if (lm_dequeue_message(&temp, error_string) != FAILURE)
                DPRINTF(("%s", error_string));
            else
                break;
        }
#endif
    }
}

send_fatal_hw_error_message(user)
USER_INFO *user;
{
#ifdef DEBUG
    u_short     temp;
    char        error_string[512];
#endif
    char        command_number;

    DPRINTF(("inside send_fatal_hw_error_message\n"));

    command_number = lm_get_int();

    reset_obuf();
    lm_put_int(command_number + 1);

    get_fatal_hardware_message();

    abort_user(user);

    end_queue_message();

    end_put(user->fd);


    if (set_close_connection_for_server(lm_global_conn_ptr) != SUCCESS) {
#ifdef DEBUG
        while (1) {
            if (lm_dequeue_message(&temp, error_string) != FAILURE)
                DPRINTF(("%s", error_string));
            else
                break;
        }
#endif
    }
}

send_fatal_config_error_message(user)
USER_INFO *user;
{
    u_short     temp;
    char        command_number;
#ifdef DEBUG
    char        error_string[512];
#endif

    DPRINTF(("inside send_fatal_config_error_message\n"));

    command_number = lm_get_int();

    reset_obuf();
    lm_put_int(command_number + 1);

    lm_queue_message(ERROR_MSG, "fatal error encountered during hardware configuration");
    if (config_error.no_tmg) {
        lm_queue_message(ERROR_MSG, "Timing Generator is offline");
    }

    if (config_error.tmg_cal) {
        lm_queue_message(ERROR_MSG, "Timing Generator error: calibration failed");
    }

    if (config_error.no_pam_for_pac) {
        for (temp = 0; temp < MAX_LANE_COUNT; ++temp) {
            if (config_error.no_pam_for_pac & (1 << temp)) {
                lm_queue_message(ERROR_MSG, "no Fast Pattern Memory in lane: %c",
                                 'A' + temp);
            }
        }
    }

    if (config_error.pam_strapped_wrong) {
        for (temp = 0; temp < MAX_LANE_COUNT * MAX_PAM_COUNT; ++temp) {
            if (config_error.pam_strapped_wrong & (1 << temp)) {
                lm_queue_message(ERROR_MSG, "Fast Pattern Memory: %d in lane: %c is strapped incorrectly",
                                 temp % MAX_PAM_COUNT,
                                 'A' + temp / MAX_PAM_COUNT);
            }
        }
    }

    if (config_error.pam_stacked_wrong) {
        for (temp = 0; temp < MAX_LANE_COUNT * MAX_PAM_COUNT; ++temp) {
            if (config_error.pam_stacked_wrong & (1 << temp)) {
                lm_queue_message(ERROR_MSG, "Fast Pattern Memory: %d in lane: %c is stacked incorrectly",
                                 temp % MAX_PAM_COUNT,
                                 'A' + temp / MAX_PAM_COUNT);
            }
        }
    }

    abort_user(user);

    end_queue_message();

    end_put(user->fd);


    if (set_close_connection_for_server(lm_global_conn_ptr) != SUCCESS) {
#ifdef DEBUG
        while (1) {
            if (lm_dequeue_message(&temp, error_string) != FAILURE)
                DPRINTF(("%s", error_string));
            else
                break;
        }
#endif
    }
}
```

Copyright 1989
Logic Modeling Systems

SOURCE PROGRAM lm1000/lmserver.c

DATE 5/23/89 TIME 6:14:45 pm

LINE # SOURCE TEXT

```
send_alloc_error_message(user)
USER_INFO *user;
{
#ifdef DEBUG
   u_short   temp;
   char      error_string[512];
#endif
   char      command_number;

   DPRINTF(("inside send_alloc_error_message\n"));

   command_number = lm_get_int();

   reset_obuf();
   lm_put_int(command_number + 1);
   lm_queue_message(ERROR_MSG, "out of memory on modeler; user aborted...");

   abort_user(user);

   end_queue_message();

   end_put(user->fd);


   if (set_close_connection_for_server(lm_global_conn_ptr) != SUCCESS) {
#ifdef DEBUG
       while (1) {
           if (lm_dequeue_message(&temp, error_string) != FAILURE)
               DPRINTF(("%s", error_string));
           else
               break;
       }
#endif
   }
}

check_reboot()
{
   /* Read any modeler address space to force it to interrupt if there is
    * any dab configuration changes.
    */

   (void)probe((u_long)CLOB_START_ADDR);

   if (rebooting == TRUE) {
       if ((lm_time() - time_reboot_was_issued) > reboot_delay_time) {
           /* The number of seconds we need to wait has elapsed */
           if (reboot_flag == LM_FALSE) {
               /* We don't need to wait for all users to finish -->
                * just hit the software reset button now.
                */
               if (xshutdown == FALSE) {
#ifdef MODELER
                   lm_delay(1000);
                   reset_cpu(REBOOT);
#endif
               }
               else {
#ifdef MODELER
                   lm_delay(1000);
                   reset_cpu(SHUTDOWN);
#endif
               }
           }
           else {
               if (any_active_user() == FALSE) {
                   if (xshutdown == FALSE) {
#ifdef MODELER
                   lm_delay(1000);
                   reset_cpu(REBOOT);
#endif
                   }
                   else {
#ifdef MODELER
                   lm_delay(1000);
                   reset_cpu(SHUTDOWN);
#endif
                   }
               }
           }
       }
   }
}

any_active_user()
{
   u_char      i;

   for (i = 0; i < MAX_USER_COUNT; ++i)
       if (user_info_array[i]->active == TRUE)
           return(TRUE);

   return(FALSE);

}

queue_up_non_fatal_config_message()
{

   u_char slotno;

   DPRINTF(("inside queue_up_non_fatal_config_message\n"));

   if (config_error.duplicate_segment) {
       for (slotno = 0; slotno < MAX_LANE_COUNT * MAX_SLOT_COUNT; ++slotno) {
           if (config_error.duplicate_segment & (1 << slotno)) {
               lm_queue_message(WARNING_MSG, "duplicate segment in lane: %c slot: %d",
                               'A' + slotno / MAX_SLOT_COUNT,
                               slotno % MAX_SLOT_COUNT);
           }
       }
   }

   if (config_error.missing_segment) {
       for (slotno = 0; slotno < MAX_LANE_COUNT * MAX_SLOT_COUNT; ++slotno) {
           if (config_error.missing_segment & (1 << slotno)) {
               lm_queue_message(WARNING_MSG, "missing segment for Device Adapter in lane: %c slot: %d"
                               'A' + slotno / MAX_SLOT_COUNT,
                               slotno % MAX_SLOT_COUNT);
           }
```

Copyright 1989
Logic Modeling Systems

SOURCE PROGRAM lm1000/lmserver.c

DATE 5/23/89

TIME 6:14:45 pm

PAGE # 6/92

SOURCE TEXT

```
        }
    }

    if (config_error.no_pel_for_dab) {
        for (slotno = 0; slotno < MAX_LANE_COUNT * MAX_SLOT_COUNT; ++slotno) {
            if (config_error.no_pel_for_dab & (1 << slotno)) {
                lm_queue_message(WARNING_MSG, "Device Adapter in lane: %c slot: %d is not supported by a Pin Electronics Module",
                                 'A' + slotno / MAX_SLOT_COUNT,
                                 slotno % MAX_SLOT_COUNT);
            }
        }
    }

    if (config_error.no_pam_for_dab) {
        for (slotno = 0; slotno < MAX_LANE_COUNT * MAX_SLOT_COUNT; ++slotno) {
            if (config_error.no_pam_for_dab & (1 << slotno)) {
                lm_queue_message(WARNING_MSG, "Device Adapter in lane: %c slot: %d is not backed by Fast Pattern Memory",
                                 'A' + slotno / MAX_SLOT_COUNT,
                                 slotno % MAX_SLOT_COUNT);

            }
        }
    }

    if (config_error.illegal_duplicate_device) {
        for (slotno = 0; slotno < MAX_LANE_COUNT * MAX_SLOT_COUNT; ++slotno) {
            if (config_error.illegal_duplicate_device & (1 << slotno)) {
                lm_queue_message(WARNING_MSG, "non-identical duplicate Device Adapter in lane: %c slot: %d",
                                 'A' + slotno / MAX_SLOT_COUNT,
                                 slotno % MAX_SLOT_COUNT);
            }
        }
    }

    if (config_error.device_too_large) {
        for (slotno = 0; slotno < MAX_LANE_COUNT * MAX_SLOT_COUNT; ++slotno) {
            if (config_error.device_too_large & (1 << slotno)) {
                lm_queue_message(WARNING_MSG, "Device Adapter in lane: %c slot: %d makes up an illegal device size (> %d units)",
                                 'A' + slotno / MAX_SLOT_COUNT,
                                 slotno % MAX_SLOT_COUNT, MAX_UNIT_COUNT);
            }
        }
    }

    if (config_error.illegal_pel_stacking) {
        for (slotno = 0; slotno < MAX_LANE_COUNT * MAX_SLOT_COUNT; ++slotno) {
            if (config_error.illegal_pel_stacking & (1 << slotno)) {
                lm_queue_message(WARNING_MSG, "illegal Pin Electronics Module stacking for Device Adapter in lane: %c slot: %d",
                                 'A' + slotno / MAX_SLOT_COUNT,
                                 slotno % MAX_SLOT_COUNT, MAX_UNIT_COUNT);
            }
        }
    }
}
```

Copyright 1989
Logic Modeling Systems

| SOURCE PROGRAM | DATE | PAGE # |
|---|---|---|
| lm1000/network.c | 5/23/89 | 1/93 |
| | TIME 6:14:46 pm | |

LINE # SOURCE TEXT

```
/* SCCS_ID: network.c rev 3.1, 4/24/89 at 07:53:22     */

#include "common.h"
#include "message.h"
#include "lnetwork.h"
#include "network.h"

#ifdef DEBUG
#define DPRINTF(x) (void)printf x
#else
#define DPRINTF(x) /* do nothing */
#endif

end_queue_message()
{
   u_short errors;
   u_short warnings;
   u_short type;
   char    str[MAX_MESSAGE];
   char    *ptr;
   char    c;

   /* verify that we have not put anything in the output buffer except
    * the answer.
    */
   if (LM_BYTES_IN_BUFFER(lm_global_comm_ptr) != 4) {
      DPRINTF(("ASSERT: error count is not the first one in out buffer\n"));
   }

   lm_message_types(&errors, &warnings);
   if (errors+warnings) {
      DPRINTF(("there are %d errors and warnings\n", errors+warnings));
   }

   lm_put_int(errors + warnings);

   while (lm_dequeue_message(&type, str) == SUCCESS) {
      lm_put_char(type);

      ptr = str;
      while (c = *ptr++) {
         lm_put_char(c);
      }

      DPRINTF(("\n"));
      lm_put_char('\0');
   }
}
```

Copyright 1989
Logic Modeling Systems

| SOURCE PROGRAM | DATE | PAGE # |
|---|---|---|
| lm1000/nextuser.c | 5/23/89<br>TIME 6:14:46 pm | 1/94 |

LINE # SOURCE TEXT

```
/* SCCS_ID: nextuser.c rev 1.1, 4/24/89 at 07:53:25     */

#include "common.h"
#include "fifo.h"
#include "network.h"
#include "cpu.h"

#ifdef DEBUG
#define DPRINTF(x) (void)printf x
#else
#define DPRINTF(x) /* do nothing */
#endif

extern CONNECTION    *table_of_conns[ ];
extern u_long        lm_dead_user_mask;

u_short
lm_give_me_the_next_user(user)
u_char  *user;
{
#ifdef MODELER
    struct fifo_entry fifo;
#endif
    u_char   next_dead_user;

    if (lm_dead_user_mask != 0) {
        CPU_DISABLE_INTERRUPTS;
        for (next_dead_user = 0; next_dead_user < MAX_USERS; next_dead_user++) {
            if (lm_dead_user_mask & (1 << next_dead_user)) {
                abort_user_number( next_dead_user );
                close_connection_for_server( table_of_conns[ next_dead_user ]);
            }
        }
        lm_dead_user_mask = 0;
        CPU_ENABLE_INTERRUPTS;
    }
#ifndef MODELER
    u_short  ret;

    while (1) {
        ret = lm_choose_connection(user);
        if (ret == PENDING) {
            if (lm_send_reply(table_of_conns[*user]) != SUCCESS) {
                DPRINTF(("error in lm_send_reply()\n"));
                return(FAILURE);
            }
        }
        else {
            return(ret);
        }
    }
#else

    fifo.fifo_no = RX_FIFO;
    if (fifo_get(&fifo) == SUCCESS) {
        *user = fifo.user;
        return(SUCCESS);
    }
    else {
        return(FAILURE);
    }
#endif
}
```

Copyright 1989
Logic Modeling Systems

SOURCE PROGRAM lm1000/pac_util.c

DATE 5/23/89 TIME 6:14:46 pm PAGE # 1/95

LINE # SOURCE TEXT

```
/* SCCS_ID: pac_util.c rev 3.1, 4/24/89 at 07:53:29        */

#include "common.h"
#include "vrtx.h"
#include "tm[illegible]"
#include "tmg_[illegible].h"
#include "pac.h"
#include "pac_def.h"

extern TMG *tmgptr;

#ifdef DEBUG
#define DPRINTF(x) (void)printf x
#else
#define DPRINTF(x) /* do nothing */
#endif

/*      int backplane_reset()
 *
 *      INPUT:  none
 *      OUTPUT: return code = SUCCESS or FAILURE
 *      DESCRIPTION: Resets TMG and all four lanes.
 */
int
backplane_reset()
{
  long i;

  /* Initialize Timing Generator */

  DPRINTF(("inside backplane_reset\n"));
  *REG(0) = 0x00;        /* drive TMG reset and all lane resets */
  *REG(1) = 0x00;
  *REG(2) = 0x2c;        /* 25 MHz clock                 */
  *REG(3) = 0x0ff;       /* Select divide by 2           */
  *REG(4) = 0x000;       /* Select fast ramps, all lanes */
  *REG(5) = 0x62;        /* Test mode 1, 11ms dlydly     */
  *REG(6) = 0x07;        /* 10ms dump, int clock         */
  *REG(7) = 0x0f;        /* sample width = 1 clock cycle */
  *REG(16) = 0x07;       /* minimum threshold EDGE[0]    */
  *REG(17) = 0x08;       /* EDGE[1]                      */
  *REG(18) = 0x09;       /* EDGE[2]                      */
  *REG(19) = 0x0a;       /* EDGE[3]                      */
  *REG(20) = 0x0b;       /* EDGE[4]                      */
  *REG(21) = 0x0c;       /* EDGE[5]                      */
  *REG(22) = 0x07;       /* SAMPLE trigger               */
  *REG(23) = 0x07;       /* SAMPLE                       */

  if(pac_clock_off() != SUCCESS)
    return(FAILURE);
  if(pac_clock_on() != SUCCESS)
    return(FAILURE);

  tmgptr->tmg_resetL = 1;   /* remove TMG reset */

  if(tmg_play(101) != SUCCESS) {
    DPRINTF(("Power-on play failed.\n"));
    return(FAILURE);
  }

  *REG(5) = 0x22;                /* No test mode 2, 11ms dlydly  */

  if(pac_clock_off() != SUCCESS)
    return(FAILURE);
  if(pac_clock_on() != SUCCESS)
    return(!AILURE);

  DPRINTF(("wait 1\n"));
  for (i = 0; i < 10000; ++i)
      ;


  if(pac_clock_off() != SUCCESS)
    return(FAILURE);

  DPRINTF(("wait 1\n"));
  for (i = 0; i < 10000; ++i)
      ;

  *REG(0) = 0x30;        /* remove all resets */

  if (tmgptr->lane_intr != 0) {
     DPRINTF(("clearing lane_intr\n"));
     (void)lm_write_probe(0x8c100280,01);
     (void)lm_write_probe(0x9c100280,01);
     (void)lm_write_probe(0xac100280,01);
     (void)lm_write_probe(0xbc100280,01);
  }

  if (tmgptr->lane_intr != 0) {
     DPRINTF(("lane_intr stuck\n"));
     return(FAILURE);
  }

  DPRINTF(("backplane reset OK\n"));
  return(SUCCESS);
}

/*      int pac_clock_on()
 *
 *      INPUT:  none
 *      OUTPUT: returns SUCCESS or FAILURE
 *      DESCRIPTION: Turns on pattern clock.
 */
int
pac_clock_on()
{
  u_long start;

  DPRINTF(("inside pac_clock_on\n"));
  tmgptr->clock_sync_clearL = 1;
  tmgptr->clock_enable = 1;
  start = lm_time();
  while(!tmgptr->clock_on)
  {
    if((lm_time() - start) > 50)                 /* 5ms timeout */
    {
      DPRINTF(("Unable to turn on clock.\n"));
      return(FAILURE);
    }
```

Copyright 1989
Logic Modeling Systems

| SOURCE PROGRAM | DATE | TIME | PAGE # |
|---|---|---|---|
| lm1000/pac_util.c | 5/23/89 | 6:14:46 pm | 2/96 |

LINE # SOURCE TEXT

```
  }
  return(SUCCESS);
}


/*      int pac_clock_off()
 *
 *      INPUT:  none
 *      OUTPUT: returns SUCCESS or FAILURE
 *      DESCRIPTION: Turns off pattern clock.
 */
int
pac_clock_off()
{
  u_long start;

  tmgptr->clock_enable = 0;
  start = lm_time();
  while(tmgptr->clock_on)
  {
    if((lm_time() - start) > 50)              /* 5ms timeout */
    {
      DPRINTF(("Unable to turn off clock.\n"));
      return(FAILURE);
    }
  }
  tmgptr->clock_sync_clearL = 0;
  return(SUCCESS);
}
```

Copyright 1989
Logic Modeling Systems

| SOURCE PROGRAM | DATE | 5/23/89 | PAGE # |
|---|---|---|---|
| lm1000/private.c | TIME | 6:14:47 pm | 1/97 |

LINE # SOURCE TEXT

```
/* SCCS_ID: private.c rev 3.1, 4/24/89 at 07:53:32      */

#include "device.h"
#include "message.h"
#include "hardware.h"
#include "eeprom.h"
#include "lmserver.h"

#define MAX_LINE_LENGTH 256

evaluate_private(def_ptr, instance, ident_change,
                 ident_inconsistent_pins, changed_dac)
DEVICE_SPEC         *def_ptr;
INSTANCE_INFO       *instance;
PTRN_BITS_LONGWORD  *ident_change;
PTRN_BITS_LONGWORD  *ident_inconsistent_pins;
u_char              *changed_dac;
{
   EXTRA_DEVICE_SPEC    *extra_def_ptr;
   PIN_INFO             *pin_info;
   PIN_SPEC             *pin_def;
   UWB_OFFSET           *uwb_ptr;
   u_long                inst_block_number[MAX_LANE_COUNT];
   u_long                seq_end_addr[MAX_LANE_COUNT];
   u_short               eval_index = 0;
   u_short               i;
   short                 pin_number;
   u_char                pin_value;
   u_char                old_pin_value;
   u_char                junk1;
   u_char                junk2;
   u_char                unitno;
   u_char                wordno;
   u_char                bitno;
   u_char                any_driving_to_z;

   DPRINTF(("inside evaluate_private\n"));

   extra_def_ptr = (EXTRA_DEVICE_SPEC *)def_ptr->extra_data;

   if (set_edge_and_sample_setting(extra_def_ptr,
                                   (u_long)RESOLUTION_05_NS,
                                   (u_long)MAX_SAMPLE_RAMP_RANGE) == FAILURE) {
      return(FAILURE);
   }


   update_ptrn_loaded(instance, def_ptr);

   /* Process the data pins and modify the measurement pattern accordingly */
   pin_number = instance->first_data_pin_index;
   instance->first_data_pin_index = -1;
   while (pin_number != -1) {

      uwb_ptr = &pn_to_short_offset[pin_number];
      unitno = uwb_ptr->unitno;
      wordno = uwb_ptr->wordno;
      bitno  = uwb_ptr->bitno;

      pin_info = &instance->pin_info_table[pin_number];
      pin_info->input_pin_is_linked = FALSE;
      pin_value = pin_info->old_filtered;

      set_pin_value(&instance->sim_pin_value,
                    unitno, wordno, bitno, pin_value);

      set_measurement_pattern(instance, &def_ptr->pin_table[pin_number],
                              unitno, wordno, bitno, pin_value,
                              &junk1, &junk2);

      pin_number = pin_info->next_input_pin_index;
   }

   /* Process the eval pins and modify the measurement pattern accordingly */
   pin_number = instance->first_eval_pin_index;
   instance->first_eval_pin_index = -1;
   while (pin_number != -1) {

      uwb_ptr = &pn_to_short_offset[pin_number];
      unitno = uwb_ptr->unitno;
      wordno = uwb_ptr->wordno;
      bitno  = uwb_ptr->bitno;

      pin_info = &instance->pin_info_table[pin_number];
      pin_info->input_pin_is_linked = FALSE;
      pin_value = pin_info->old_filtered;

      set_pin_value(&instance->sim_pin_value,
                    unitno, wordno, bitno, pin_value);

      /* Save the EVAL changes to find the output delays */
      if (eval_index < MAX_EVAL_CHANGES) {
         gbl_eval_pin_number[eval_index] = pin_number;
         gbl_eval_pin_value[eval_index] = pin_value;
         ++eval_index;
      }
      else {
         lm_queue_message(WARNING_MSG, "internal error: not enough room to store eval changes, delay number might be incorrect");
      }

      set_measurement_pattern(instance, &def_ptr->pin_table[pin_number],
                              unitno, wordno, bitno, pin_value,
                              &junk1, &junk2);

      pin_number = pin_info->next_input_pin_index;
   }

   /* If there are any eval changes, then run a measurement cycle */
   if (eval_index != 0) {

      DPRINTF(("run measurement cycle for eval changes\n"));


      /* Write HMDENB to next to last address */
      write_pattern(instance,
            &instance->unit_addr[instance->cur_unit_addr_index + 1 & 1][0],
            instance->hmdenb_loaded);

      /* Write Consistent set */
      write_pattern(instance,
```

Copyright 1989
Logic Modeling Systems

| SOURCE PROGRAM | DATE | PAGE # |
|---|---|---|
| lm1000/private.c | 5/23/89 TIME 6:14:47 pm | 2/98 |

LINE # SOURCE TEXT

```
                &instance->unit_addr[instance->cur_unit_addr_index][0],
                instance->ptrn_loaded);

    set_seq_end_bit(instance,
                    instance->lane_addr,
                    FALSE,
                    seq_end_addr,
                    inst_block_number);

    if (play_ptrn_seq(instance, (u_long)PTRN_PLAY_TIMEOUT,
                                changed_dac) == FAILURE) {
       return(FAILURE);
    }

    if (get_result(def_ptr, instance, ident_change,
                   EVAL_EVENT, gbl_eval_pin_number,
                   eval_index, &any_driving_to_z) == FAILURE) {
       return(FAILURE);
    }

    remove_seq_end_bit(instance, seq_end_addr, inst_block_number);

    /* Get the delays from eval pins to outputs and put them in PIN_INFO */
    for (i = 0; i < eval_index; ++i) {
       get_delay(def_ptr, instance, ident_change,
                 ident_inconsistent_pins,
                 gbl_eval_pin_number[i], gbl_eval_pin_value[i]);
    }

    clear_ptrn_bits((char *)ident_change,
                    dab_list[instance->dab_info_index]->unit_count);
 }

 /* Process the STORE pin changes */
 for (pin_number = instance->first_store_pin_index,
      instance->first_store_pin_index = -1;
      pin_number != -1;
      pin_number = pin_info->next_input_pin_index) {

    update_ptrn_loaded(instance, def_ptr);

    gbl_eval_pin_number[0] = pin_number;

    uwb_ptr = &pn_to_short_offset[pin_number];
    unitno = uwb_ptr->unitno;
    wordno = uwb_ptr->wordno;
    bitno  = uwb_ptr->bitno;

    pin_info = &instance->pin_info_table[pin_number];
    pin_def = &def_ptr->pin_table[pin_number];

    pin_info->input_pin_is_linked = FALSE;
    pin_value = pin_info->old_filtered;

    if (pin_def->direction == IN) {
       /* INPUT STORE change */

       old_pin_value = read_pin_value(&instance->sim_pin_value,
                                      unitno, wordno, bitno);

       set_pin_value(&instance->sim_pin_value,
                     unitno, wordno, bitno, pin_value);

       switch (pin_def->clk_format) {
       case NRZ:
       case DNRZ:
          if (input_pin_transition(old_pin_value, pin_value,
                      pin_info->uninitialized_pin) == NO_TRANSITION) {
             /* This is an error because the host should have filtered the
              * transition.
              * On second thought it is NOT an error because the host only
              * filters transitions to exactly the same value.
              */
             DPRINTF(("No transition on IN STORE DNRZ pin %s\n", pin_def->pin_name));

             continue;
          }

          if (pin_value & (LOGIC_0 | LOGIC_S0 | LOGIC_Z0))
             reset_ptrn_bit(&instance->ptrn_loaded[unitno], wordno, bitno);
          else
             set_ptrn_bit  (&instance->ptrn_loaded[unitno], wordno, bitno);

          break;

      case R1:
          if (input_pin_transition(old_pin_value, pin_value,
                   pin_info->uninitialized_pin) != RISE_TRANSITION) {

             DPRINTF(("No transition on IN STORE R1 pin %s\n", pin_def->pin_name));
             continue;
          }

          /* Enable the R1 clock on the measurement pattern (ptrn_loaded) */
          reset_ptrn_bit(&instance->ptrn_loaded[unitno], wordno, bitno);

          break;
      case R0:
          if (input_pin_transition(old_pin_value, pin_value,
                   pin_info->uninitialized_pin) != FALL_TRANSITION) {
             DPRINTF(("No transition on IN STORE R0 pin %s\n", pin_def->pin_name));
             continue;
          }

          /* Enable the RZ clock on the measurement pattern (ptrn_loaded) */
          set_ptrn_bit(&instance->ptrn_loaded[unitno], wordno, bitno);

          break;
      default:
          lm_queue_message(ERROR_MSG, "internal error: illegal pin type in device.h");
          continue;
      }
    }
    else {
      /* IO STORE change */
      /* Note: IO store pin can only have DNRZ format */

      old_pin_value = read_pin_value(&instance->last_sample_value,
                                     unitno, wordno, bitno);
```

Copyright 1989
Logic Modeling Systems

LINE # SOURCE TEXT

```
        set_pin_value(&instance->sim_pin_value,
                      unitno, wordno, bitno, pin_value);

        if (io_pin_transition(old_pin_value, pin_value,
                              pin_info->uninitialized_pin) == NO_TRANSITION) {

            DPRINTF(("No transition on IO STORE pin %s\n", pin_def->pin_name));
            continue;
        }

        set_measurement_pattern(instance, pin_def,
                                unitno, wordno, bitno, pin_value,
                                &junk1, &junk2);
    }

    write_pattern(instance,
        &instance->unit_addr[instance->cur_unit_addr_index + 1 & 1][0],
        instance->hmdenb_loaded);

    write_pattern(instance,
                  &instance->unit_addr[instance->cur_unit_addr_index][0],
                  instance->ptrn_loaded);

    /* Disable the R1/R0 clock for the next evaluation */
    switch (pin_def->clk_format) {
    case R1:
        set_ptrn_bit(&instance->ptrn_loaded[unitno], wordno, bitno);
        break;
    case R0:
        reset_ptrn_bit(&instance->ptrn_loaded[unitno], wordno, bitno);
        break;
    default:
        break;
    }

    set_seq_end_bit(instance,
                    instance->lane_addr,
                    FALSE,
                    seq_end_addr,
                    inst_block_number);

    if (play_ptrn_seq(instance, (u_long)PTRN_PLAY_TIMEOUT,
                      changed_dac) == FAILURE) {
        return(FAILURE);
    }

    if (get_result(def_ptr, instance, ident_change,
                   STORE_EVENT, gbl_eval_pin_number,
                   1, &any_driving_to_z) == FAILURE) {
        return(FAILURE);
    }

    remove_seq_end_bit(instance, seq_end_addr, inst_block_number);

    get_delay(def_ptr, instance, ident_change, ident_inconsistent_pins,
              (u_short)pin_number, pin_value);

    clear_ptrn_bits((char *)ident_change,
                    dab_list[instance->dab_info_index]->unit_count);

    pin_info->uninitialized_pin = FALSE;
  }

  return(SUCCESS);

}

purge_ptrn(instance)
INSTANCE_INFO *instance;
{
   DAB_INFO  *dab_ptr;
   short      ptrn_count;
   u_char     dummy_ptrn_count;
   u_char     laneno;
   u_char     i;

   DPRINTF(("inside purge_ptrn\n"));

   dab_ptr = dab_list[instance->dab_info_index];

   return_all_ptrn_block(instance);

   setup_gbl_dummy_ptrn(dab_ptr);

   for (laneno = 0; laneno < MAX_LANE_COUNT; ++laneno) {

      instance->fb_block_size[laneno]            = 0;

      instance->lane_addr[laneno].max_addr       = 0;
      instance->lane_addr[laneno].prev_max_addr  = 0;
      instance->lane_addr[laneno].last_unit_addr = 0;
      instance->lane_addr[laneno].new_block_addr = 0;
   }

   instance->has_history = FALSE;
   instance->pattern_count = 0;
   instance->common_pattern_count = 0;
   instance->static_pattern_count = 0;
   instance->enab_timing_meas = FALSE;

   if (allocate_initial_block(instance) == FAILURE)
      return(FAILURE);

   /* set the sequence start address on each lane */
   for (laneno = 0; laneno < MAX_LANE_COUNT; ++laneno)
      instance->seq_start_addr[laneno] =
         instance->lane_addr[laneno].max_addr - BLOCK_ADDR_INC;

   /* For PRIVATE devices we only have 2 patterns: HMDENB_LOADED and
    * PTRN_LOADED.
    */
   ptrn_count = 2 * dab_ptr->unit_count_per_lane;

   dummy_ptrn_count = 0;
   if (ptrn_count <= SEQ_END_LATENCY) {
      dummy_ptrn_count = (SEQ_END_LATENCY - ptrn_count +
                          dab_ptr->unit_count_per_lane) /
                          dab_ptr->unit_count_per_lane;
   }
```

Copyright 1989
Logic Modeling Systems

| SOURCE PROGRAM | DATE | PAGE # |
|---|---|---|
| lm1000/private.c | 5/23/89 | 4/100 |
| | TIME 6:14:47 pm | |

LINE # SOURCE TEXT

```
    for (i = 0; i < dummy_ptrn_count; ++i) {
       write_pattern(instance,
                     &instance->unit_addr[instance->cur_unit_addr_index][0],
                     gbl_dummy_ptrn);

       if (grow_pattern(instance) == FAILURE)
          return(FAILURE);
    }

    /* allocate 1 pattern for ENDENB */
    if (grow_pattern(instance) == FAILURE)
       return(FAILURE);

    return(SUCCESS);
}

update_ptrn_loaded(instance, def_ptr)
INSTANCE_INFO   *instance;
DEVICE_SPEC     *def_ptr;
{
    EXTRA_DEVICE_SPEC    *extra_def_ptr;
    DAB_INFO             *dab_ptr;
    PTRN_BITS_LONGWORD   *ptrn_loaded_ptr;
    PTRN_BITS_LONGWORD   *sampled_data_ptr;
    PTRN_BITS_LONGWORD   *sampled_hiz_ptr;
    PTRN_BITS_LONGWORD   *sampled_unk_ptr;
    PTRN_BITS_LONGWORD   *sim_data_ptr;
    PTRN_BITS_LONGWORD   *sim_hiz_ptr;
    PTRN_BITS_LONGWORD   *sim_unk_ptr;
    PTRN_BITS_LONGWORD   *ident_outputs_ptr;
    PTRN_BITS_LONGWORD   *ident_ios_ptr;
    u_char                total_unit;
    u_char                unit;
    u_char                word;

    /* Modify the ptrn_loaded to include the value of the last sample:
     *    for OUTPUT  pins ---> take the last_sample_value
     *    for IO      pins ---> take the combination of sim_pin_value and
     *                          last_sample_value.
     */

    extra_def_ptr = (EXTRA_DEVICE_SPEC *)def_ptr->extra_data;
    dab_ptr = dab_list[instance->dab_info_index];
    total_unit = dab_ptr->unit_count;

    ptrn_loaded_ptr = (PTRN_BITS_LONGWORD *)instance->ptrn_loaded;
    sampled_data_ptr = (PTRN_BITS_LONGWORD *)
                                  instance->last_sample_value.data;
    sampled_hiz_ptr = (PTRN_BITS_LONGWORD *)
                                  instance->last_sample_value.hiz;
    sampled_unk_ptr = (PTRN_BITS_LONGWORD *)
                                  instance->last_sample_value.unknown;
    sim_data_ptr    = (PTRN_BITS_LONGWORD *)
                                  instance->sim_pin_value.data;
    sim_hiz_ptr     = (PTRN_BITS_LONGWORD *)
                                  instance->sim_pin_value.hiz;
    sim_unk_ptr     = (PTRN_BITS_LONGWORD *)
                                  instance->sim_pin_value.unknown;
    ident_outputs_ptr  = extra_def_ptr->ident_outputs;
    ident_ios_ptr      = extra_def_ptr->ident_ios;

    for (unit = 0; unit < total_unit; ++unit) {
       for (word = 0; word < 3; ++word) {

          /* OUTPUT pins.
           * Drive the output pins to 0 always.
           */
          ptrn_loaded_ptr->word[word] =
             (ptrn_loaded_ptr->word[word] & ~ident_outputs_ptr->word[word]);

          /* IO pins.
           * Drive the IO pins to the combination of sim_pin_value and
           * last_sample_value as follows:
           *
           *            +-------------------+-------------+-----+-------------+
           *    SIM     |       ANY         |      Z      |  U  |     ANY     |
           *            +-------------------+-------------+-----+-------------+
           *
           *            +---------------------+-----------------------+-------+
           *    SAMPLE  |        ANY          |          Z            |   U   |
           *            +---------------------+-----------------------+-------+
           *
           *            +---------------------+------+------+------+-------+
           *    RESULT  |        #1           |  #2  |  #5  |  #3  |  #4   |
           *            +---------------------+------+------+------+-------+
           *
           *   #1  ---> use sample data
           *   #2  ---> use sample data
           *   #3  ---> use sim data
           *   #4  ---> use the opposite value of sample data
           *   #5  ---> use sample data
           */

          ptrn_loaded_ptr->word[word] =
             (ptrn_loaded_ptr->word[word] & ~ident_ios_ptr->word[word]) |
             (ident_ios_ptr->word[word] &
              (
               /* Result #2 */
               ((sampled_hiz_ptr->word[word] & sim_hiz_ptr->word[word]) &
                                    sampled_data_ptr->word[word]) |
               /* Result #5 */
               ((sampled_hiz_ptr->word[word] & sim_unk_ptr->word[word]) &
                                    sampled_data_ptr->word[word]) |
               /* Result #3 */
               ((sampled_hiz_ptr->word[word] &
                     (sim_hiz_ptr->word[word] | sim_unk_ptr->word[word])) &
                                    sim_data_ptr->word[word]) |
               /* Result #4 */
               (sampled_unk_ptr->word[word] & ~ sampled_data_ptr->word[word]) |

               /* Result #1 */
               (~ (sampled_hiz_ptr->word[word] | sampled_unk_ptr->word[word]) &
                                     sampled_data_ptr->word[word])

              ));
       }

       ++ptrn_loaded_ptr;
       ++sampled_data_ptr;
```

Copyright 1989
Logic Modeling Systems

| SOURCE PROGRAM | DATE | PAGE # |
|---|---|---|
| lm1000/private.c | 5/23/89 | 5/101 |
| | TIME 6:14:47 pm | |

LINE # SOURCE TEXT

```
        ++sampled_hiz_ptr;
        ++sampled_unk_ptr;
        ++sim_data_ptr;
        ++sim_hiz_ptr;
        ++sim_unk_ptr;
        ++ident_outputs_ptr;
        ++ident_ios_ptr;
    }
}
```

Copyright 1989
Logic Modeling Systems

| SOURCE PROGRAM | DATE | PAGE # |
|---|---|---|
| lm1000/profile.c | 5/23/89 | 1/102 |
| | TIME 6:14:47 pm | |

LINE # SOURCE TEXT

```
/* SCCS_ID: profile.c rev 3.1, 4/24/89 at 07:53:35     */

#include "common.h"
#include "device.h"
#include "message.h"
#include "hardware.h"
#include "lm_rd_wr.h"
#include "mod_err.h"
#include "nvram.h"
#include "eeprom.h"
#include "lmserver.h"
#include "lnetwork.h"
#include "network.h"
#include "profile.h"

PROF_DATA   prof_data[MAX_FUNCTION_COUNT];
u_short     xindex;
u_char      initialized_profile = FALSE;
extern      long save_pc;

profile_clear()
{
   u_short i;

   for (i = 0; i < xindex; ++i) {
      prof_data[i].count = 0;
   }
}

profile_incr_count()
{
   register u_long pc;
   register short  start;
   register short  end;
   register short  mid;

   if (initialized_profile == FALSE)
      return;

   pc = save_pc;
   start = 0;
   end = xindex - 1;

   mid = (start + end) / 2;
   while (start <= end) {
      if (pc < prof_data[mid].function_addr) {
         end = mid - 1;
      }
      else {
         start = mid + 1;
      }
      mid = (start + end) / 2;
   }

   while (1) {
      if ((pc >= prof_data[end].function_addr) &&
          (pc <  prof_data[end+1].function_addr)) {
         break;
      }
      end++;
   }

   ++prof_data[end].count;
}

profile_dump_count()
{
   short   i;
   long    total;
   u_long  total_count_mark;

   total = 0;
   total_count_mark = LM_MARK_BUFFER(lm_global_conn_ptr);
   lm_put_int(0);

   for (i = 0; i < xindex; ++i) {
      if (prof_data[i].count != 0) {
         ++total;
         lm_put_int(prof_data[i].function_addr);
         lm_put_int(prof_data[i].count);
      }
   }

   LM_PUT_LONG_AT_MARK(total_count_mark, lm_global_conn_ptr, total);
}
```

Copyright 1989
Logic Modeling Systems

| HEADER FILE | DATE | PAGE # |
|---|---|---|
| lm1000/profile.h | 5/23/89 | 1/103 |
| | TIME 6:14:47 pm | |

HEADER TEXT

```
/* SCCS_ID: profile.h rev 3.1, 4/24/89 at 07:53:38      */

#define MAX_FUNCTION_COUNT 2000

typedef struct {
    u_long  func    _addr;
    u_long  count;
} PROF_DATA;

extern PROF_DATA    prof_data[MAX_FUNCTION_COUNT];
extern u_short      xindex;
extern u_char       initialized_profile;
```

Copyright 1989
Logic Modeling Systems

| SOURCE PROGRAM | DATE | PAGE # |
|---|---|---|
| lm1000/profile2.c | 5/23/89 | 1/104 |
| | TIME 6:14:47 pm | |

LINE # SOURCE TEXT

```
/* SCCS_ID: profile2.c rev 3.1, 4/24/89 at 07:53:41    */

#include "common.h"
#include "profile.h"

profile_.  .t()
{
    xindex = 0;
    prof_data[xindex++].function_addr = 0;
    prof_data[xindex++].function_addr = 0x00050000;
    prof_data[xindex++].function_addr = 0x00050026;
    prof_data[xindex++].function_addr = 0x00050030;
    prof_data[xindex++].function_addr = 0x00050048;
    prof_data[xindex++].function_addr = 0x00050076;
    prof_data[xindex++].function_addr = 0x0005007A;
    prof_data[xindex++].function_addr = 0x00050092;
    prof_data[xindex++].function_addr = 0x000500AA;
    prof_data[xindex++].function_addr = 0x000500DA;
    prof_data[xindex++].function_addr = 0x000500DE;
    prof_data[xindex++].function_addr = 0x0005013A;
    prof_data[xindex++].function_addr = 0x0005014E;
    prof_data[xindex++].function_addr = 0x0005017A;
    prof_data[xindex++].function_addr = 0x0005018E;
    prof_data[xindex++].function_addr = 0x0005019A;
    prof_data[xindex++].function_addr = 0x000501A8;
    prof_data[xindex++].function_addr = 0x000501B8;
    prof_data[xindex++].function_addr = 0x000501E8;
    prof_data[xindex++].function_addr = 0x00050204;
    prof_data[xindex++].function_addr = 0x00050230;
    prof_data[xindex++].function_addr = 0x00050238;
    prof_data[xindex++].function_addr = 0x0005024C;
    prof_data[xindex++].function_addr = 0x00050258;
    prof_data[xindex++].function_addr = 0x00050268;
    prof_data[xindex++].function_addr = 0x00050298;
    prof_data[xindex++].function_addr = 0x000502B4;
    prof_data[xindex++].function_addr = 0x000502E4;
    prof_data[xindex++].function_addr = 0x000502FC;
    prof_data[xindex++].function_addr = 0x00050314;
    prof_data[xindex++].function_addr = 0x00050330;
    prof_data[xindex++].function_addr = 0x00050336;
    prof_data[xindex++].function_addr = 0x00050342;
    prof_data[xindex++].function_addr = 0x0005038C;
    prof_data[xindex++].function_addr = 0x00050398;
    prof_data[xindex++].function_addr = 0x000503A2;
    prof_data[xindex++].function_addr = 0x000503CC;
    prof_data[xindex++].function_addr = 0x0005043E;
    prof_data[xindex++].function_addr = 0x00050480;
    prof_data[xindex++].function_addr = 0x00050494;
    prof_data[xindex++].function_addr = 0x000504AA;
    prof_data[xindex++].function_addr = 0x000504AE;
    prof_data[xindex++].function_addr = 0x000504B2;
    prof_data[xindex++].function_addr = 0x000504BA;
    prof_data[xindex++].function_addr = 0x000504BC;
    prof_data[xindex++].function_addr = 0x000504F8;
    prof_data[xindex++].function_addr = 0x00050504;
    prof_data[xindex++].function_addr = 0x0005073E;
    prof_data[xindex++].function_addr = 0x000507F8;
    prof_data[xindex++].function_addr = 0x00050986;
    prof_data[xindex++].function_addr = 0x00050A02;
    prof_data[xindex++].function_addr = 0x00050A92;
    prof_data[xindex++].function_addr = 0x00050AD6;
    prof_data[xindex++].function_addr = 0x00050BEC;
    prof_data[xindex++].function_addr = 0x00050C58;
    prof_data[xindex++].function_addr = 0x00050E56;
    prof_data[xindex++].function_addr = 0x00050E80;
    prof_data[xindex++].function_addr = 0x00050FA0;
    prof_data[xindex++].function_addr = 0x000510DE;
    prof_data[xindex++].function_addr = 0x000511A2;
    prof_data[xindex++].function_addr = 0x00051266;
    prof_data[xindex++].function_addr = 0x0005131E;
    prof_data[xindex++].function_addr = 0x0005152A;
    prof_data[xindex++].function_addr = 0x000515EE;
    prof_data[xindex++].function_addr = 0x0005166E;
    prof_data[xindex++].function_addr = 0x000516A4;
    prof_data[xindex++].function_addr = 0x0005192C;
    prof_data[xindex++].function_addr = 0x00051AA4;
    prof_data[xindex++].function_addr = 0x00051AD4;
    prof_data[xindex++].function_addr = 0x00051AE8;
    prof_data[xindex++].function_addr = 0x00051F34;
    prof_data[xindex++].function_addr = 0x00051FD8;
    prof_data[xindex++].function_addr = 0x0005201E;
    prof_data[xindex++].function_addr = 0x00052088;
    prof_data[xindex++].function_addr = 0x000520B0;
    prof_data[xindex++].function_addr = 0x000520FE;
    prof_data[xindex++].function_addr = 0x00052144;
    prof_data[xindex++].function_addr = 0x00052170;
    prof_data[xindex++].function_addr = 0x000521F4;
    prof_data[xindex++].function_addr = 0x0005221C;
    prof_data[xindex++].function_addr = 0x00052244;
    prof_data[xindex++].function_addr = 0x000523AE;
    prof_data[xindex++].function_addr = 0x000523E0;
    prof_data[xindex++].function_addr = 0x00052536;
    prof_data[xindex++].function_addr = 0x000527B6;
    prof_data[xindex++].function_addr = 0x0005283A;
    prof_data[xindex++].function_addr = 0x00052A7E;
    prof_data[xindex++].function_addr = 0x00052C88;
    prof_data[xindex++].function_addr = 0x00052D4A;
    prof_data[xindex++].function_addr = 0x00052F68;
    prof_data[xindex++].function_addr = 0x00052F90;
    prof_data[xindex++].function_addr = 0x00052FBA;
    prof_data[xindex++].function_addr = 0x00052FE2;
    prof_data[xindex++].function_addr = 0x0005301E;
    prof_data[xindex++].function_addr = 0x0005359C;
    prof_data[xindex++].function_addr = 0x000536B2;
    prof_data[xindex++].function_addr = 0x000536DA;
    prof_data[xindex++].function_addr = 0x00053704;
    prof_data[xindex++].function_addr = 0x0005372C;
    prof_data[xindex++].function_addr = 0x0005375A;
    prof_data[xindex++].function_addr = 0x00053CD8;
    prof_data[xindex++].function_addr = 0x00053DEE;
    prof_data[xindex++].function_addr = 0x00053E0C;
    prof_data[xindex++].function_addr = 0x00053E1C;
    prof_data[xindex++].function_addr = 0x00053E38;
    prof_data[xindex++].function_addr = 0x00053E58;
    prof_data[xindex++].function_addr = 0x0005418A;
    prof_data[xindex++].function_addr = 0x000542E4;
    prof_data[xindex++].function_addr = 0x0005432A;
    prof_data[xindex++].function_addr = 0x000544EA;
    prof_data[xindex++].function_addr = 0x0005470E;
    prof_data[xindex++].function_addr = 0x0005475E;
```

Copyright 1989
Logic Modeling Systems

SOURCE PROGRAM lm1000/profile2.c

DATE 5/23/89 TIME 6:14:47 pm

LINE # SOURCE TEXT

```
prof_data[xindex++].function_addr = 0x000547A8;
prof_data[xindex++].function_addr = 0x000547F6;
prof_data[xindex++].function_addr = 0x00054884;
prof_data[xindex++].function_addr = 0x00054908;
prof_data[xindex++].function_addr = 0x000549F6;
prof_data[xindex++].function_addr = 0x00054AA4;
prof_data[xindex++].function_addr = 0x00054B6C;
prof_data[xindex++].function_addr = 0x00054C32;
prof_data[xindex++].function_addr = 0x0005530E;
prof_data[xindex++].function_addr = 0x00055804;
prof_data[xindex++].function_addr = 0x00055952;
prof_data[xindex++].function_addr = 0x00055A24;
prof_data[xindex++].function_addr = 0x00055C92;
prof_data[xindex++].function_addr = 0x00055EB0;
prof_data[xindex++].function_addr = 0x00055FFE;
prof_data[xindex++].function_addr = 0x000562AA;
prof_data[xindex++].function_addr = 0x0005644E;
prof_data[xindex++].function_addr = 0x000567CE;
prof_data[xindex++].function_addr = 0x000568AA;
prof_data[xindex++].function_addr = 0x00056958;
prof_data[xindex++].function_addr = 0x00056A64;
prof_data[xindex++].function_addr = 0x00056B3C;
prof_data[xindex++].function_addr = 0x00056B6A;
prof_data[xindex++].function_addr = 0x00056B9A;
prof_data[xindex++].function_addr = 0x00056BE2;
prof_data[xindex++].function_addr = 0x00056C46;
prof_data[xindex++].function_addr = 0x00056C4E;
prof_data[xindex++].function_addr = 0x00056CA4;
prof_data[xindex++].function_addr = 0x00056D8A;
prof_data[xindex++].function_addr = 0x00056E22;
prof_data[xindex++].function_addr = 0x000572C2;
prof_data[xindex++].function_addr = 0x0005731C;
prof_data[xindex++].function_addr = 0x000576FC;
prof_data[xindex++].function_addr = 0x00057950;
prof_data[xindex++].function_addr = 0x0005795A;
prof_data[xindex++].function_addr = 0x00057A16;
prof_data[xindex++].function_addr = 0x00057ABE;
prof_data[xindex++].function_addr = 0x00057B62;
prof_data[xindex++].function_addr = 0x00057CBE;
prof_data[xindex++].function_addr = 0x00057D2A;
prof_data[xindex++].function_addr = 0x00057D3E;
prof_data[xindex++].function_addr = 0x00057D5A;
prof_data[xindex++].function_addr = 0x00057D72;
prof_data[xindex++].function_addr = 0x00057D8E;
prof_data[xindex++].function_addr = 0x00057F94;
prof_data[xindex++].function_addr = 0x00058274;
prof_data[xindex++].function_addr = 0x00058378;
prof_data[xindex++].function_addr = 0x000585C4;
prof_data[xindex++].function_addr = 0x000587FA;
prof_data[xindex++].function_addr = 0x0005891E;
prof_data[xindex++].function_addr = 0x00058AC2;
prof_data[xindex++].function_addr = 0x00058B58;
prof_data[xindex++].function_addr = 0x00058B80;
prof_data[xindex++].function_addr = 0x00058C0A;
prof_data[xindex++].function_addr = 0x00058C7A;
prof_data[xindex++].function_addr = 0x00058E0A;
prof_data[xindex++].function_addr = 0x00058E5A;
prof_data[xindex++].function_addr = 0x00058E62;
prof_data[xindex++].function_addr = 0x00058EDA;
prof_data[xindex++].function_addr = 0x00058F70;
prof_data[xindex++].function_addr = 0x00059160;
prof_data[xindex++].function_addr = 0x000593BA;
prof_data[xindex++].function_addr = 0x0005950C;
prof_data[xindex++].function_addr = 0x00059590;
prof_data[xindex++].function_addr = 0x000597E6;
prof_data[xindex++].function_addr = 0x0005A1CE;
prof_data[xindex++].function_addr = 0x0005A25E;
prof_data[xindex++].function_addr = 0x0005A5BC;
prof_data[xindex++].function_addr = 0x0005A8BC;
prof_data[xindex++].function_addr = 0x0005AA5C;
prof_data[xindex++].function_addr = 0x0005AC12;
prof_data[xindex++].function_addr = 0x0005AE3A;
prof_data[xindex++].function_addr = 0x0005B254;
prof_data[xindex++].function_addr = 0x0005B5CC;
prof_data[xindex++].function_addr = 0x0005B73C;
prof_data[xindex++].function_addr = 0x0005BFFC;
prof_data[xindex++].function_addr = 0x0005C1EA;
prof_data[xindex++].function_addr = 0x0005C6F0;
prof_data[xindex++].function_addr = 0x0005C938;
prof_data[xindex++].function_addr = 0x0005CB0A;
prof_data[xindex++].function_addr = 0x0005D494;
prof_data[xindex++].function_addr = 0x0005D76A;
prof_data[xindex++].function_addr = 0x0005DC3C;
prof_data[xindex++].function_addr = 0x0005E0DE;
prof_data[xindex++].function_addr = 0x0005E32C;
prof_data[xindex++].function_addr = 0x0005E678;
prof_data[xindex++].function_addr = 0x0005E870;
prof_data[xindex++].function_addr = 0x0005E9F8;
prof_data[xindex++].function_addr = 0x0005EEA6;
prof_data[xindex++].function_addr = 0x0005F454;
prof_data[xindex++].function_addr = 0x0005F5E8;
prof_data[xindex++].function_addr = 0x0005F8BC;
prof_data[xindex++].function_addr = 0x0005FB90;
prof_data[xindex++].function_addr = 0x0005FD9C;
prof_data[xindex++].function_addr = 0x0005FF5A;
prof_data[xindex++].function_addr = 0x00060160;
prof_data[xindex++].function_addr = 0x00060344;
prof_data[xindex++].function_addr = 0x00060398;
prof_data[xindex++].function_addr = 0x[illegible]0878;
prof_data[xindex++].function_addr = 0x0[illegible]0906;
prof_data[xindex++].function_addr = 0x000610F4;
prof_data[xindex++].function_addr = 0x000612D6;
prof_data[xindex++].function_addr = 0x000613C6;
prof_data[xindex++].function_addr = 0x000614C0;
prof_data[xindex++].function_addr = 0x0006151E;
prof_data[xindex++].function_addr = 0x0006152E;
prof_data[xindex++].function_addr = 0x0006153E;
prof_data[xindex++].function_addr = 0x0006154C;
prof_data[xindex++].function_addr = 0x0006155C;
prof_data[xindex++].function_addr = 0x0006156C;
prof_data[xindex++].function_addr = 0x0006157C;
prof_data[xindex++].function_addr = 0x00061590;
prof_data[xindex++].function_addr = 0x0006160A;
prof_data[xindex++].function_addr = 0x00061638;
prof_data[xindex++].function_addr = 0x0006168E;
prof_data[xindex++].function_addr = 0x000616C4;
prof_data[xindex++].function_addr = 0x00061774;
prof_data[xindex++].function_addr = 0x00061C32;
prof_data[xindex++].function_addr = 0x00061CCE;
prof_data[xindex++].function_addr = 0x00061D76;
```

Copyright 1989
Logic Modeling Systems

| SOURCE PROGRAM | DATE | TIME | PAGE # |
|---|---|---|---|
| lm1000/profile2.c | 5/23/89 | 6:14:47 pm | 3/106 |

SOURCE TEXT

```
prof_data[xindex++].function_addr = 0x00061DD0;
prof_data[xindex++].function_addr = 0x00061E56;
prof_data[xindex++].function_addr = 0x00061E7C;
prof_data[xindex++].function_addr = 0x00062108;
prof_data[xindex++].function_addr = 0x00062294;
prof_data[xindex++].function_addr = 0x00062342;
prof_data[xindex++].function_addr = 0x000623B6;
prof_data[xindex++].function_addr = 0x00062852;
prof_data[xindex++].function_addr = 0x00062BF4;
prof_data[xindex++].function_addr = 0x00062E90;
prof_data[xindex++].function_addr = 0x000633FE;
prof_data[xindex++].function_addr = 0x00063520;
prof_data[xindex++].function_addr = 0x00063558;
prof_data[xindex++].function_addr = 0x00063632;
prof_data[xindex++].function_addr = 0x000639A0;
prof_data[xindex++].function_addr = 0x00063A30;
prof_data[xindex++].function_addr = 0x00063AD2;
prof_data[xindex++].function_addr = 0x00063BC8;
prof_data[xindex++].function_addr = 0x00063C8E;
prof_data[xindex++].function_addr = 0x00063CB6;
prof_data[xindex++].function_addr = 0x00063D08;
prof_data[xindex++].function_addr = 0x00063DB2;
prof_data[xindex++].function_addr = 0x000640A0;
prof_data[xindex++].function_addr = 0x000641A8;
prof_data[xindex++].function_addr = 0x0006439E;
prof_data[xindex++].function_addr = 0x000643F8;
prof_data[xindex++].function_addr = 0x00064464;
prof_data[xindex++].function_addr = 0x0006470A;
prof_data[xindex++].function_addr = 0x00065ADA;
prof_data[xindex++].function_addr = 0x00065B0E;
prof_data[xindex++].function_addr = 0x00065EC6;
prof_data[xindex++].function_addr = 0x00066044;
prof_data[xindex++].function_addr = 0x000661D4;
prof_data[xindex++].function_addr = 0x00066B3A;
prof_data[xindex++].function_addr = 0x00066CBA;
prof_data[xindex++].function_addr = 0x0006727C;
prof_data[xindex++].function_addr = 0x00067444;
prof_data[xindex++].function_addr = 0x000674A2;
prof_data[xindex++].function_addr = 0x00067500;
prof_data[xindex++].function_addr = 0x00067E76;
prof_data[xindex++].function_addr = 0x00068040;
prof_data[xindex++].function_addr = 0x000681E8;
prof_data[xindex++].function_addr = 0x0006901C;
prof_data[xindex++].function_addr = 0x000693FC;
prof_data[xindex++].function_addr = 0x0006961E;
prof_data[xindex++].function_addr = 0x00069D3A;
prof_data[xindex++].function_addr = 0x00069E74;
prof_data[xindex++].function_addr = 0x0006A000;
prof_data[xindex++].function_addr = 0x0006A442;
prof_data[xindex++].function_addr = 0x0006A78A;
prof_data[xindex++].function_addr = 0x0006A85E;
prof_data[xindex++].function_addr = 0x0006A8AA;
prof_data[xindex++].function_addr = 0x0006A9CE;
prof_data[xindex++].function_addr = 0x0006A9D6;
prof_data[xindex++].function_addr = 0x0006AB6C;
prof_data[xindex++].function_addr = 0x0006B5E0;
prof_data[xindex++].function_addr = 0x0006C2E8;
prof_data[xindex++].function_addr = 0x0006D854;
prof_data[xindex++].function_addr = 0x0006D9DE;
prof_data[xindex++].function_addr = 0x0006DD50;
prof_data[xindex++].function_addr = 0x0006DF30;
prof_data[xindex++].function_addr = 0x0006DFE6;
prof_data[xindex++].function_addr = 0x0006E9FC;
prof_data[xindex++].function_addr = 0x0006ECFA;
prof_data[xindex++].function_addr = 0x0006ED38;
prof_data[xindex++].function_addr = 0x0006ED4C;
prof_data[xindex++].function_addr = 0x0006EFF8;
prof_data[xindex++].function_addr = 0x0006F2FC;
prof_data[xindex++].function_addr = 0x0006F35C;
prof_data[xindex++].function_addr = 0x00070190;
prof_data[xindex++].function_addr = 0x000702E8;
prof_data[xindex++].function_addr = 0x00070D9C;
prof_data[xindex++].function_addr = 0x00071122;
prof_data[xindex++].function_addr = 0x00071210;
prof_data[xindex++].function_addr = 0x000712C4;
prof_data[xindex++].function_addr = 0x00071690;
prof_data[xindex++].function_addr = 0x00071968;
prof_data[xindex++].function_addr = 0x00071994;
prof_data[xindex++].function_addr = 0x000719E8;
prof_data[xindex++].function_addr = 0x00071A08;
prof_data[xindex++].function_addr = 0x00071A22;
prof_data[xindex++].function_addr = 0x00071B34;
prof_data[xindex++].function_addr = 0x00071B6E;
prof_data[xindex++].function_addr = 0x00071BBA;
prof_data[xindex++].function_addr = 0x00071C16;
prof_data[xindex++].function_addr = 0x00071CEE;
prof_data[xindex++].function_addr = 0x00071D68;
prof_data[xindex++].function_addr = 0x00071D96;
prof_data[xindex++].function_addr = 0x00071DD2;
prof_data[xindex++].function_addr = 0x00071E44;
prof_data[xindex++].function_addr = 0x00071EA4;
prof_data[xindex++].function_addr = 0x00071EE2;
prof_data[xindex++].function_addr = 0x00071F3E;
prof_data[xindex++].function_addr = 0x00071F88;
prof_data[xindex++].function_addr = 0x000720AA;
prof_data[xindex++].function_addr = 0x00072496;
prof_data[xindex++].function_addr = 0x00072524;
prof_data[xindex++].function_addr = 0x000725CA;
prof_data[xindex++].function_addr = 0x00072796;
prof_data[xindex++].function_addr = 0x000728FC;
prof_data[xindex++].function_addr = 0x00072B5E;
prof_data[xindex++].function_addr = 0x00073C8C;
prof_data[xindex++].function_addr = 0x00073D00;
prof_data[xindex++].function_addr = 0x00073DEA;
prof_data[xindex++].function_addr = 0x00073E76;
prof_data[xindex++].function_addr = 0x00073E94;
prof_data[xindex++].function_addr = 0x00073EB2;
prof_data[xindex++].function_addr = 0x00073F24;
prof_data[xindex++].function_addr = 0x00073FA6;
prof_data[xindex++].function_addr = 0x00074014;
prof_data[xindex++].function_addr = 0x0007406A;
prof_data[xindex++].function_addr = 0x000740FC;
prof_data[xindex++].function_addr = 0x0007431C;
prof_data[xindex++].function_addr = 0x000743A4;
prof_data[xindex++].function_addr = 0x000743F0;
prof_data[xindex++].function_addr = 0x00074426;
prof_data[xindex++].function_addr = 0x0007445C;
prof_data[xindex++].function_addr = 0x00074492;
prof_data[xindex++].function_addr = 0x000744C8;
prof_data[xindex++].function_addr = 0x000744FE;
```

Copyright 1989
Logic Modeling Systems

SOURCE PROGRAM lm1000/profile2.c

DATE 5/23/89 TIME 6:14:47 pm PAGE # 4/107

LINE # SOURCE TEXT

```
prof_data[xindex++].function_addr = 0x00074534;
prof_data[xindex++].function_addr = 0x00074566;
prof_data[xindex++].function_addr = 0x00074598;
prof_data[xindex++].function_addr = 0x000745CA;
prof_data[xindex++].function_addr = 0x000745FC;
prof_data[xindex++].function_addr = 0x0007462E;
prof_data[xindex++].function_addr = 0x00074660;
prof_data[xindex++].function_addr = 0x000747D0;
prof_data[xindex++].function_addr = 0x00074830;
prof_data[xindex++].function_addr = 0x0007486E;
prof_data[xindex++].function_addr = 0x000748B6;
prof_data[xindex++].function_addr = 0x00074978;
prof_data[xindex++].function_addr = 0x00074B14;
prof_data[xindex++].function_addr = 0x00074BFA;
prof_data[xindex++].function_addr = 0x00074C30;
prof_data[xindex++].function_addr = 0x00074C96;
prof_data[xindex++].function_addr = 0x00074CD2;
prof_data[xindex++].function_addr = 0x00074D0A;
prof_data[xindex++].function_addr = 0x00074D58;
prof_data[xindex++].function_addr = 0x00074D90;
prof_data[xindex++].function_addr = 0x00074DC8;
prof_data[xindex++].function_addr = 0x00074E04;
prof_data[xindex++].function_addr = 0x00074E3A;
prof_data[xindex++].function_addr = 0x00074EF4;
prof_data[xindex++].function_addr = 0x00074F14;
prof_data[xindex++].function_addr = 0x000750A8;
prof_data[xindex++].function_addr = 0x000753B2;
prof_data[xindex++].function_addr = 0x000753C8;
prof_data[xindex++].function_addr = 0x0007544C;
prof_data[xindex++].function_addr = 0x000754CC;
prof_data[xindex++].function_addr = 0x000754FA;
prof_data[xindex++].function_addr = 0x00075562;
prof_data[xindex++].function_addr = 0x000755CA;
prof_data[xindex++].function_addr = 0x000755F4;
prof_data[xindex++].function_addr = 0x0007567C;
prof_data[xindex++].function_addr = 0x000756B2;
prof_data[xindex++].function_addr = 0x00075700;
prof_data[xindex++].function_addr = 0x00075746;
prof_data[xindex++].function_addr = 0x00075792;
prof_data[xindex++].function_addr = 0x00075A44;
prof_data[xindex++].function_addr = 0x00075B04;
prof_data[xindex++].function_addr = 0x00075C6C;
prof_data[xindex++].function_addr = 0x00075CD4;
prof_data[xindex++].function_addr = 0x00075D32;
prof_data[xindex++].function_addr = 0x00075DD8;
prof_data[xindex++].function_addr = 0x00075E1E;
prof_data[xindex++].function_addr = 0x000764E4;
prof_data[xindex++].function_addr = 0x00076720;
prof_data[xindex++].function_addr = 0x00076858;
prof_data[xindex++].function_addr = 0x00076866;
prof_data[xindex++].function_addr = 0x00078204;
prof_data[xindex++].function_addr = 0x00078270;
prof_data[xindex++].function_addr = 0x000782E6;
prof_data[xindex++].function_addr = 0x00078332;
prof_data[xindex++].function_addr = 0x0007837E;
prof_data[xindex++].function_addr = 0x000783F2;
prof_data[xindex++].function_addr = 0x00078476;
prof_data[xindex++].function_addr = 0x000784CE;
prof_data[xindex++].function_addr = 0x00078548;
prof_data[xindex++].function_addr = 0x00078612;
prof_data[xindex++].function_addr = 0x0007867E;
prof_data[xindex++].function_addr = 0x00078828;
prof_data[xindex++].function_addr = 0x0007887A;
prof_data[xindex++].function_addr = 0x00078A16;
prof_data[xindex++].function_addr = 0x00078A6C;
prof_data[xindex++].function_addr = 0x00078AB2;
prof_data[xindex++].function_addr = 0x00078B3C;
prof_data[xindex++].function_addr = 0x00078BEA;
prof_data[xindex++].function_addr = 0x00078C9A;
prof_data[xindex++].function_addr = 0x00078E02;
prof_data[xindex++].function_addr = 0x0007900E;
prof_data[xindex++].function_addr = 0x0007908A;
prof_data[xindex++].function_addr = 0x0007A6EC;
prof_data[xindex++].function_addr = 0x0007A7D0;
prof_data[xindex++].function_addr = 0x0007A7DE;
prof_data[xindex++].function_addr = 0x0007A7F4;
prof_data[xindex++].function_addr = 0x0007A834;
prof_data[xindex++].function_addr = 0x0007ADA4;
prof_data[xindex++].function_addr = 0x0007ADEE;
prof_data[xindex++].function_addr = 0x0007AE0A;
prof_data[xindex++].function_addr = 0x0007AF6C;
prof_data[xindex++].function_addr = 0x0007B5DC;
prof_data[xindex++].function_addr = 0x0007B63C;
prof_data[xindex++].function_addr = 0x0007B68C;
prof_data[xindex++].function_addr = 0x0007B6C6;
prof_data[xindex++].function_addr = 0x0007B6EE;
prof_data[xindex++].function_addr = 0x0007B7E0;
prof_data[xindex++].function_addr = 0x0007B830;
prof_data[xindex++].function_addr = 0x0007B856;
prof_data[xindex++].function_addr = 0x0007B890;
prof_data[xindex++].function_addr = 0x0007B8B6;
prof_data[xindex++].function_addr = 0x0007B8F0;
prof_data[xindex++].function_addr = 0x0007B916;
prof_data[xindex++].function_addr = 0x0007B93C;
prof_data[xindex++].function_addr = 0x0007B962;
prof_data[xindex++].function_addr = 0x0007B988;
prof_data[xindex++].function_addr = 0x0007B9C2;
prof_data[xindex++].function_addr = 0x0007BA08;
prof_data[xindex++].function_addr = 0x0007BA62;
prof_data[xindex++].function_addr = 0x0007BAF4;
prof_data[xindex++].function_addr = 0x0007BB5A;
prof_data[xindex++].function_addr = 0x0007BBA0;
prof_data[xindex++].function_addr = 0x0007BBD4;
prof_data[xindex++].function_addr = 0x0007BC00;
prof_data[xindex++].function_addr = 0x0007BC44;
prof_data[xindex++].function_addr = 0x0007BC8A;
prof_data[xindex++].function_addr = 0x0007BE04;
prof_data[xindex++].function_addr = 0x0007BE5C;
prof_data[xindex++].function_addr = 0x0007BEB6;
prof_data[xindex++].function_addr = 0x0007BEEA;
prof_data[xindex++].function_addr = 0x0007BF30;
prof_data[xindex++].function_addr = 0x0007C026;
prof_data[xindex++].function_addr = 0x0007C082;
prof_data[xindex++].function_addr = 0x0007C0F8;
prof_data[xindex++].function_addr = 0x0007C11E;
prof_data[xindex++].function_addr = 0x0007C19E;
prof_data[xindex++].function_addr = 0x0007C26E;
prof_data[xindex++].function_addr = 0x0007C2EC;
prof_data[xindex++].function_addr = 0x0007C362;
prof_data[xindex++].function_addr = 0x0007C3D8;
```

Copyright 1989
Logic Modeling Systems

| SOURCE PROGRAM | DATE | PAGE # |
|---|---|---|
| lm1000/profile2.c | 5/23/89<br>TIME 6:14:47 pm | 5/108 |

LINE # SOURCE TEXT

```
prof_data[xindex++].function_addr = 0x0007C46E;
prof_data[xindex++].function_addr = 0x0007C4C6;
prof_data[xindex++].function_addr = 0x0007C4E0;
prof_data[xindex++].function_addr = 0x0007C53E;
prof_data[xindex++].function_addr = 0x0007C568;
prof_data[xindex++].function_addr = 0x0007C64C;
prof_data[xindex++].function_addr = 0x0007C69C;
prof_data[xindex++].function_addr = 0x0007C6CA;
prof_data[xindex++].function_addr = 0x0007C6E8;
prof_data[xindex++].function_addr = 0x0007C702;
prof_data[xindex++].function_addr = 0x0007C74C;
prof_data[xindex++].function_addr = 0x0007CE2C;
prof_data[xindex++].function_addr = 0x0007CE88;
prof_data[xindex++].function_addr = 0x0007CEE4;
prof_data[xindex++].function_addr = 0x0007D24C;
prof_data[xindex++].function_addr = 0x0007E2E6;
prof_data[xindex++].function_addr = 0x0007E468;
prof_data[xindex++].function_addr = 0x0007E9CA;
prof_data[xindex++].function_addr = 0x0007EBC6;
prof_data[xindex++].function_addr = 0x0007EEAC;
prof_data[xindex++].function_addr = 0x0007F1FC;
prof_data[xindex++].function_addr = 0x0007F458;
prof_data[xindex++].function_addr = 0x0007F756;
prof_data[xindex++].function_addr = 0x0007FA54;
prof_data[xindex++].function_addr = 0x0007FD52;
prof_data[xindex++].function_addr = 0x0007FDDA;
prof_data[xindex++].function_addr = 0x0008038C;
prof_data[xindex++].function_addr = 0x000804AC;
prof_data[xindex++].function_addr = 0x000805FA;
prof_data[xindex++].function_addr = 0x000807E0;
prof_data[xindex++].function_addr = 0x00081A68;
prof_data[xindex++].function_addr = 0x00081BFE;
prof_data[xindex++].function_addr = 0x00081DEE;
prof_data[xindex++].function_addr = 0x00081E8C;
prof_data[xindex++].function_addr = 0x00081ED8;
prof_data[xindex++].function_addr = 0x00081FC8;
prof_data[xindex++].function_addr = 0x000823E2;
prof_data[xindex++].function_addr = 0x00082800;
prof_data[xindex++].function_addr = 0x000828B4;
prof_data[xindex++].function_addr = 0x000828EA;
prof_data[xindex++].function_addr = 0x00082A00;
prof_data[xindex++].function_addr = 0x00082AC6;
prof_data[xindex++].function_addr = 0x00082C1A;
prof_data[xindex++].function_addr = 0x00082F36;
prof_data[xindex++].function_addr = 0x00083252;
prof_data[xindex++].function_addr = 0x00083620;
prof_data[xindex++].function_addr = 0x000837CC;
prof_data[xindex++].function_addr = 0x00083CF8;
prof_data[xindex++].function_addr = 0x00083E4A;
prof_data[xindex++].function_addr = 0x00083FF4;
prof_data[xindex++].function_addr = 0x00085B3C;
prof_data[xindex++].function_addr = 0x00085B78;
prof_data[xindex++].function_addr = 0x00085CCE;
prof_data[xindex++].function_addr = 0x00086048;
prof_data[xindex++].function_addr = 0x0008614A;
prof_data[xindex++].function_addr = 0x0008622A;
prof_data[xindex++].function_addr = 0x0008634E;
prof_data[xindex++].function_addr = 0x000863A0;
prof_data[xindex++].function_addr = 0x000863E8;
prof_data[xindex++].function_addr = 0x0008649A;
prof_data[xindex++].function_addr = 0x00086740;
prof_data[xindex++].function_addr = 0x0008697C;
prof_data[xindex++].function_addr = 0x00086C42;
prof_data[xindex++].function_addr = 0x00086EC8;
prof_data[xindex++].function_addr = 0x00087104;
prof_data[xindex++].function_addr = 0x000871CC;
prof_data[xindex++].function_addr = 0x000872DC;
prof_data[xindex++].function_addr = 0x00087376;
prof_data[xindex++].function_addr = 0x00087446;
prof_data[xindex++].function_addr = 0x00087506;
prof_data[xindex++].function_addr = 0x0008758E;
prof_data[xindex++].function_addr = 0x00087644;
prof_data[xindex++].function_addr = 0x0008770A;
prof_data[xindex++].function_addr = 0x00087788;
prof_data[xindex++].function_addr = 0x00087D48;
prof_data[xindex++].function_addr = 0x00087E12;
prof_data[xindex++].function_addr = 0x00087EF4;
prof_data[xindex++].function_addr = 0x00087F04;
prof_data[xindex++].function_addr = 0x00087F3C;
prof_data[xindex++].function_addr = 0x00087F64;
prof_data[xindex++].function_addr = 0x00087F74;
prof_data[xindex++].function_addr = 0x00087F84;
prof_data[xindex++].function_addr = 0x00087F94;
prof_data[xindex++].function_addr = 0x00087FA4;
prof_data[xindex++].function_addr = 0x00087FB4;
prof_data[xindex++].function_addr = 0x00087FC4;
prof_data[xindex++].function_addr = 0x00087FD4;
prof_data[xindex++].function_addr = 0x00087FE4;
prof_data[xindex++].function_addr = 0x00087FF4;
prof_data[xindex++].function_addr = 0x00088004;
prof_data[xindex++].function_addr = 0x00088014;
prof_data[xindex++].function_addr = 0x00088024;
prof_data[xindex++].function_addr = 0x00088034;
prof_data[xindex++].function_addr = 0x00088044;
prof_data[xindex++].function_addr = 0x00088054;
prof_data[xindex++].function_addr = 0x00088064;
prof_data[xindex++].function_addr = 0x00088074;
prof_data[xindex++].function_addr = 0x00088082;
prof_data[xindex++].function_addr = 0x00088092;
prof_data[xindex++].function_addr = 0x000880A4;
prof_data[xindex++].function_addr = 0x000882C6;
prof_data[xindex++].function_addr = 0x00088324;
prof_data[xindex++].function_addr = 0x000883B6;
prof_data[xindex++].function_addr = 0x0008844C;
prof_data[xindex++].function_addr = 0x000884E0;
prof_data[xindex++].function_addr = 0x00088630;
prof_data[xindex++].function_addr = 0x0003882E;
prof_data[xindex++].function_addr = 0x000888BE;
prof_data[xindex++].function_addr = 0x0008890E;
prof_data[xindex++].function_addr = 0x000889CA;
prof_data[xindex++].function_addr = 0x00088BC4;
prof_data[xindex++].function_addr = 0x00088C1A;
prof_data[xindex++].function_addr = 0x00088ED0;
prof_data[xindex++].function_addr = 0x00088F68;
prof_data[xindex++].function_addr = 0x00089006;
prof_data[xindex++].function_addr = 0x00089084;
prof_data[xindex++].function_addr = 0x000890C0;
prof_data[xindex++].function_addr = 0x0008912E;
prof_data[xindex++].function_addr = 0x0008918E;
prof_data[xindex++].function_addr = 0x0008925A;
```

Copyright 1989
Logic Modeling Systems

| SOURCE PROGRAM | DATE | PAGE # |
|---|---|---|
| lm1000/profile2.c | 5/23/89 | 6/109 |
| | TIME 6:14:47 pm | |

LINE # SOURCE TEXT

```
prof_data[xindex++].function_addr = 0x0008927E;
prof_data[xindex++].function_addr = 0x0008931C;
prof_data[xindex++].function_addr = 0x000893B8;
prof_data[xindex++].function_addr = 0x000895E4;
prof_data[xindex++].function_addr = 0x000895EC;
prof_data[xindex++].function_addr = 0x00089600;
prof_data[xindex++].function_addr = 0x00089612;
prof_data[xindex++].function_addr = 0x00089C6E;
prof_data[xindex++].function_addr = 0x0008A19C;
prof_data[xindex++].function_addr = 0x0008A312;
prof_data[xindex++].function_addr = 0x0008A354;
prof_data[xindex++].function_addr = 0x0008A3F6;
prof_data[xindex++].function_addr = 0x0008AD32;
prof_data[xindex++].function_addr = 0x0008AEFC;
prof_data[xindex++].function_addr = 0x0008B292;
prof_data[xindex++].function_addr = 0x0008B384;
prof_data[xindex++].function_addr = 0x0008B3FC;
prof_data[xindex++].function_addr = 0x0008B656;
prof_data[xindex++].function_addr = 0x0008B7CE;
prof_data[xindex++].function_addr = 0x0008B87A;
prof_data[xindex++].function_addr = 0x0008B916;
prof_data[xindex++].function_addr = 0x0008BA3A;
prof_data[xindex++].function_addr = 0x0008BBC2;
prof_data[xindex++].function_addr = 0x0008BC6A;
prof_data[xindex++].function_addr = 0x0008BD92;
prof_data[xindex++].function_addr = 0x0008BE3E;
prof_data[xindex++].function_addr = 0x0008BF72;
prof_data[xindex++].function_addr = 0x0008C1B4;
prof_data[xindex++].function_addr = 0x0008C29E;
prof_data[xindex++].function_addr = 0x0008C310;
prof_data[xindex++].function_addr = 0x0008C4EE;
prof_data[xindex++].function_addr = 0x0008C6D0;
prof_data[xindex++].function_addr = 0x0008CFB6;
prof_data[xindex++].function_addr = 0x0008D19C;
prof_data[xindex++].function_addr = 0x0008D7AA;
prof_data[xindex++].function_addr = 0x0008DEF6;
prof_data[xindex++].function_addr = 0x0008E1D6;
prof_data[xindex++].function_addr = 0x0008E746;
prof_data[xindex++].function_addr = 0x0008E78A;
prof_data[xindex++].function_addr = 0x0008E7A2;
prof_data[xindex++].function_addr = 0x0008E7E6;
prof_data[xindex++].function_addr = 0x0008E816;
prof_data[xindex++].function_addr = 0x0008EC38;
prof_data[xindex++].function_addr = 0x0008EDC2;
prof_data[xindex++].function_addr = 0x0008EE14;
prof_data[xindex++].function_addr = 0x0008EE40;
prof_data[xindex++].function_addr = 0x0008EEAA;
prof_data[xindex++].function_addr = 0x0008EF20;
prof_data[xindex++].function_addr = 0x0008EFAC;
prof_data[xindex++].function_addr = 0x0008F08C;
prof_data[xindex++].function_addr = 0x0008F150;
prof_data[xindex++].function_addr = 0x0008F2FA;
prof_data[xindex++].function_addr = 0x0008F376;
prof_data[xindex++].function_addr = 0x0008F396;
prof_data[xindex++].function_addr = 0x0008F3BE;
prof_data[xindex++].function_addr = 0x0008F54A;
prof_data[xindex++].function_addr = 0x0008F6D6;
prof_data[xindex++].function_addr = 0x0008F7E0;
prof_data[xindex++].function_addr = 0x0008FA82;
prof_data[xindex++].function_addr = 0x0008FAE8;
prof_data[xindex++].function_addr = 0x0008FB24;
prof_data[xindex++].function_addr = 0x0008FFC4;
prof_data[xindex++].function_addr = 0x00090308;
prof_data[xindex++].function_addr = 0x00090324;
prof_data[xindex++].function_addr = 0x00090340;
prof_data[xindex++].function_addr = 0x000903E0;
prof_data[xindex++].function_addr = 0x000904C4;
prof_data[xindex++].function_addr = 0x0009054E;
prof_data[xindex++].function_addr = 0x00090652;
prof_data[xindex++].function_addr = 0x00090770;
prof_data[xindex++].function_addr = 0x0009085E;
prof_data[xindex++].function_addr = 0x000909F2;
prof_data[xindex++].function_addr = 0x00090A6E;
prof_data[xindex++].function_addr = 0x00090ABE;
prof_data[xindex++].function_addr = 0x00090AFE;
prof_data[xindex++].function_addr = 0x00090B68;
prof_data[xindex++].function_addr = 0x00090C10;
prof_data[xindex++].function_addr = 0x00090E76;
prof_data[xindex++].function_addr = 0x00091008;
prof_data[xindex++].function_addr = 0x00091380;
prof_data[xindex++].function_addr = 0x000913DE;
prof_data[xindex++].function_addr = 0x000914C8;
prof_data[xindex++].function_addr = 0x00091506;
prof_data[xindex++].function_addr = 0x00091510;
prof_data[xindex++].function_addr = 0x0009151A;
prof_data[xindex++].function_addr = 0x00091540;
prof_data[xindex++].function_addr = 0x00091698;
prof_data[xindex++].function_addr = 0x000916B8;
prof_data[xindex++].function_addr = 0x00091760;
prof_data[xindex++].function_addr = 0x000917DC;
prof_data[xindex++].function_addr = 0x00091ADE;
prof_data[xindex++].function_addr = 0x00091B24;
prof_data[xindex++].function_addr = 0x00091B4A;
prof_data[xindex++].function_addr = 0x00091B5A;
prof_data[xindex++].function_addr = 0x00091B68;
prof_data[xindex++].function_addr = 0x00091BBC;
prof_data[xindex++].function_addr = 0x00091C1C;
prof_data[xindex++].function_addr = 0x00091C3C;
prof_data[xindex++].function_addr = 0x00091C6C;
prof_data[xindex++].function_addr = 0x00091E28;
prof_data[xindex++].function_addr = 0x00091FB8;
prof_data[xindex++].function_addr = 0x00092086;
prof_data[xindex++].function_addr = 0x000921C0;
prof_data[xindex++].function_addr = 0x000922DC;
prof_data[xindex++].function_addr = 0x0009231C;
prof_data[xindex++].function_addr = 0x00092348;
prof_data[xindex++].function_addr = 0x0009237E;
prof_data[xindex++].function_addr = 0x0009239E;
prof_data[xindex++].function_addr = 0x000923F0;
prof_data[xindex++].function_addr = 0x00092434;
prof_data[xindex++].function_addr = 0x000924E2;
prof_data[xindex++].function_addr = 0x00092558;
prof_data[xindex++].function_addr = 0x000925B2;
prof_data[xindex++].function_addr = 0x000925F8;
prof_data[xindex++].function_addr = 0x0009269C;
prof_data[xindex++].function_addr = 0x000926D2;
prof_data[xindex++].function_addr = 0x0009274E;
prof_data[xindex++].function_addr = 0x00092804;
prof_data[xindex++].function_addr = 0x00092862;
prof_data[xindex++].function_addr = 0x000928DE;
```

Copyright 1989
Logic Modeling Systems

| SOURCE PROGRAM | DATE | PAGE # |
|---|---|---|
| lm1000/profile2.c | 5/23/89 | 7/110 |
| | TIME 6:14:47 pm | |

SOURCE TEXT

```
prof_data[xindex++].function_addr = 0x0009295A;
prof_data[xindex++].function_addr = 0x00092B1A;
prof_data[xindex++].function_addr = 0x00092B7A;
prof_data[xindex++].function_addr = 0x00092DD4;
prof_data[xindex++].function_addr = 0x00092EAA;
prof_data[xindex++].function_addr = 0x00092F66;
prof_data[xindex++].function_addr = 0x00093122;
prof_data[xindex++].function_addr = 0x000931C4;
prof_data[xindex++].function_addr = 0x00093250;
prof_data[xindex++].function_addr = 0x00093286;
prof_data[xindex++].function_addr = 0x000934D8;
prof_data[xindex++].function_addr = 0x0009356C;
prof_data[xindex++].function_addr = 0x00093870;
prof_data[xindex++].function_addr = 0x00093B60;
prof_data[xindex++].function_addr = 0x00094020;
prof_data[xindex++].function_addr = 0x00094062;
prof_data[xindex++].function_addr = 0x00094114;
prof_data[xindex++].function_addr = 0x0009414C;
prof_data[xindex++].function_addr = 0x00094AF4;
prof_data[xindex++].function_addr = 0x00094B10;
prof_data[xindex++].function_addr = 0x00094B2C;
prof_data[xindex++].function_addr = 0x00094B60;
prof_data[xindex++].function_addr = 0x00094BA0;
prof_data[xindex++].function_addr = 0x00094D88;
prof_data[xindex++].function_addr = 0x00094E7C;
prof_data[xindex++].function_addr = 0x00094F3E;
prof_data[xindex++].function_addr = 0x00094FBA;
prof_data[xindex++].function_addr = 0x00095020;
prof_data[xindex++].function_addr = 0x00095056;
prof_data[xindex++].function_addr = 0x0009507A;
prof_data[xindex++].function_addr = 0x000950BA;
prof_data[xindex++].function_addr = 0x000950DE;
prof_data[xindex++].function_addr = 0x00095210;
prof_data[xindex++].function_addr = 0x00095260;
prof_data[xindex++].function_addr = 0x000954CA;
prof_data[xindex++].function_addr = 0x000954E2;
prof_data[xindex++].function_addr = 0x000954FA;
prof_data[xindex++].function_addr = 0x0009551C;
prof_data[xindex++].function_addr = 0x0009553A;
prof_data[xindex++].function_addr = 0x00095554;
prof_data[xindex++].function_addr = 0x000955BE;
prof_data[xindex++].function_addr = 0x0009564E;
prof_data[xindex++].function_addr = 0x000956E2;
prof_data[xindex++].function_addr = 0x00095740;
prof_data[xindex++].function_addr = 0x000957BA;
prof_data[xindex++].function_addr = 0x00095824;
prof_data[xindex++].function_addr = 0x00095866;
prof_data[xindex++].function_addr = 0x000958E8;
prof_data[xindex++].function_addr = 0x00095980;
prof_data[xindex++].function_addr = 0x00095A18;
prof_data[xindex++].function_addr = 0x00095B34;
prof_data[xindex++].function_addr = 0x00095B9E;
prof_data[xindex++].function_addr = 0x00095C46;
prof_data[xindex++].function_addr = 0x00095CD8;
prof_data[xindex++].function_addr = 0x00095CF4;
prof_data[xindex++].function_addr = 0x00095D5C;
prof_data[xindex++].function_addr = 0x00095DF2;
prof_data[xindex++].function_addr = 0x00095E2A;
prof_data[xindex++].function_addr = 0x00095E6C;
prof_data[xindex++].function_addr = 0x00095E88;
prof_data[xindex++].function_addr = 0x00095EB8;
prof_data[xindex++].function_addr = 0x00095ED8;
prof_data[xindex++].function_addr = 0x00095F10;
prof_data[xindex++].function_addr = 0x00095F34;
prof_data[xindex++].function_addr = 0x00095F84;
prof_data[xindex++].function_addr = 0x00095FCC;
prof_data[xindex++].function_addr = 0x00096094;
prof_data[xindex++].function_addr = 0x000960C8;
prof_data[xindex++].function_addr = 0x00096114;
prof_data[xindex++].function_addr = 0x00096144;
prof_data[xindex++].function_addr = 0x00096174;
prof_data[xindex++].function_addr = 0x000961CC;
prof_data[xindex++].function_addr = 0x00096374;
prof_data[xindex++].function_addr = 0x0009639C;
prof_data[xindex++].function_addr = 0x0009651C;
prof_data[xindex++].function_addr = 0x00096550;
prof_data[xindex++].function_addr = 0x00096588;
prof_data[xindex++].function_addr = 0x000965B0;
prof_data[xindex++].function_addr = 0x000965D4;
prof_data[xindex++].function_addr = 0x00096B08;
prof_data[xindex++].function_addr = 0x00096C0C;
prof_data[xindex++].function_addr = 0x00096CB4;
prof_data[xindex++].function_addr = 0x00096D9E;
prof_data[xindex++].function_addr = 0x00096E74;
prof_data[xindex++].function_addr = 0x00097080;
prof_data[xindex++].function_addr = 0x000970E8;
prof_data[xindex++].function_addr = 0x0009713C;
prof_data[xindex++].function_addr = 0x0009726C;
prof_data[xindex++].function_addr = 0x0009748C;
prof_data[xindex++].function_addr = 0x000974F8;
prof_data[xindex++].function_addr = 0x00097504;
prof_data[xindex++].function_addr = 0x00097640;
prof_data[xindex++].function_addr = 0x0009764E;
prof_data[xindex++].function_addr = 0x0009765C;
prof_data[xindex++].function_addr = 0x00097678;
prof_data[xindex++].function_addr = 0x000976A0;
prof_data[xindex++].function_addr = 0x000976AE;
prof_data[xindex++].function_addr = 0x000976CC;
prof_data[xindex++].function_addr = 0x000976E2;
prof_data[xindex++].function_addr = 0x000976FA;
prof_data[xindex++].function_addr = 0x00097712;
prof_data[xindex++].function_addr = 0x0009772C;
prof_data[xindex++].function_addr = 0x00097744;
prof_data[xindex++].function_addr = 0x00097768;
prof_data[xindex++].function_addr = 0x0009778A;
prof_data[xindex++].function_addr = 0x000977B8;
prof_data[xindex++].function_addr = 0x000977E4;
prof_data[xindex++].function_addr = 0x0009780C;
prof_data[xindex++].function_addr = 0x00097832;
prof_data[xindex++].function_addr = 0x00097850;
prof_data[xindex++].function_addr = 0x00097876;
prof_data[xindex++].function_addr = 0x0009789C;
prof_data[xindex++].function_addr = 0x000978CC;
prof_data[xindex++].function_addr = 0x000978F0;
prof_data[xindex++].function_addr = 0x00097914;
prof_data[xindex++].function_addr = 0x00097938;
prof_data[xindex++].function_addr = 0x0009795E;
prof_data[xindex++].function_addr = 0x0009798E;
prof_data[xindex++].function_addr = 0x0009799E;
prof_data[xindex++].function_addr = 0x000979B0;
```

Copyright 1989
Logic Modeling Systems

SOURCE PROGRAM lm1000/profile2.c

DATE 5/23/89 TIME 6:14:47 pm PAGE # 8/111

LINE # SOURCE TEXT

```
    prof_data[xindex++].function_addr = 0x000979DE;
    prof_data[xindex++].function_addr = 0x00097A5E;
    prof_data[xindex++].function_addr = 0x00097B9C;
    prof_data[xindex++].function_addr = 0x00097BB6;
    prof_data[xindex++].function_addr = 0x00097BD0;
    prof_data[xindex++].function_addr = 0x00097C24;
    prof_data[xindex++].function_addr = 0x00097C2A;
    prof_data[xindex++].function_addr = 0x00097D5A;
    prof_data[xindex++].function_addr = 0x00097DA8;
    prof_data[xindex++].function_addr = 0x00097E8C;
    prof_data[xindex++].function_addr = 0x00097FE6;
    prof_data[xindex++].function_addr = 0x00097FF0;
    prof_data[xindex++].function_addr = 0x00098138;
    prof_data[xindex++].function_addr = 0x00098184;
    prof_data[xindex++].function_addr = 0x000981B4;
    prof_data[xindex++].function_addr = 0x00098234;
    prof_data[xindex++].function_addr = 0x00098242;
    prof_data[xindex++].function_addr = 0x000983BC;
    prof_data[xindex++].function_addr = 0x000983C0;
    prof_data[xindex++].function_addr = 0x00098464;
    prof_data[xindex++].function_addr = 0x0009855A;
    prof_data[xindex++].function_addr = 0x000985AC;
    prof_data[xindex++].function_addr = 0x000985F8;
    prof_data[xindex++].function_addr = 0x00098642;
    prof_data[xindex++].function_addr = 0x000986A6;
    prof_data[xindex++].function_addr = 0x000986F6;
    prof_data[xindex++].function_addr = 0x00098724;
    prof_data[xindex++].function_addr = 0x0009874E;
    prof_data[xindex++].function_addr = 0x00098790;
    prof_data[xindex++].function_addr = 0x000987D0;
    prof_data[xindex++].function_addr = 0x000987D8;
    prof_data[xindex++].function_addr = 0x00098816;
    prof_data[xindex++].function_addr = 0x00098828;
    prof_data[xindex++].function_addr = 0x0009883A;
    prof_data[xindex++].function_addr = 0x0009884A;
    prof_data[xindex++].function_addr = 0x0009885C;
    prof_data[xindex++].function_addr = 0x000988F0;
    prof_data[xindex++].function_addr = 0x00098936;
    prof_data[xindex++].function_addr = 0x0009898C;
    prof_data[xindex++].function_addr = 0x000989F8;
    prof_data[xindex++].function_addr = 0x00098A78;
    prof_data[xindex++].function_addr = 0x00098B0C;
    prof_data[xindex++].function_addr = 0x00098B5C;
    prof_data[xindex++].function_addr = 0x00098BA0;
    prof_data[xindex++].function_addr = 0x00098BFE;
    prof_data[xindex++].function_addr = 0x00098C54;
    prof_data[xindex++].function_addr = 0x00098CD0;
    prof_data[xindex++].function_addr = 0x00098D60;
    prof_data[xindex++].function_addr = 0x00098D7E;
    prof_data[xindex++].function_addr = 0x00099598;
    prof_data[xindex++].function_addr = 0x000995A4;
    prof_data[xindex++].function_addr = 0xffffffff;
    initialized_profile = TRUE;
}
```

Copyright 1989
Logic Modeling Systems

| SOURCE PROGRAM | DATE | PAGE # |
|---|---|---|
| lm1000/ptrnhist.c | 5/23/89 | 1/112 |
| | TIME 6:14:48 pm | |

LINE # SOURCE TEXT

```
/* SCCS_ID: ptrnhist.c rev 3.1, 4/24/89 at 07:53:47     */

#include "device.h"
#include "message.h"
#include "hardware.h"
#include "e[illegible].h"
#include "lmserver.h"
#include "protams.h"
#include "lmetwork.h"
#include "network.h"

#define MAX_LINE_LENGTH 128

#ifdef DEBUG
extern u_char  loop_till_key;
extern u_long  debug_key;
extern u_long  debug_char;
#endif

evaluate_1_bit_per_pin(def_ptr, instance,
                       ident_inconsistent_pins,
                       temp_steady_state_result,
                       ident_change,
                       replay_count,
                       changed_dac)
DEVICE_SPEC         *def_ptr;
INSTANCE_INFO       *instance;
PTRN_BITS_LONGWORD  *ident_inconsistent_pins;
FULL_VALUE          *temp_steady_state_result;
PTRN_BITS_LONGWORD  *ident_change;
u_char               replay_count;
u_char              *changed_dac;
{
   EXTRA_DEVICE_SPEC   *extra_def_ptr;
   PIN_INFO            *pin_info;
   PIN_SPEC            *pin_def;
   PTRN_BITS            consistent_set[MAX_UNIT_COUNT];
   UWB_OFFSET          *uwb_ptr;
   u_long               inst_block_number[MAX_LANE_COUNT];
   u_long               seq_end_addr[MAX_LANE_COUNT];
   u_long               timeout;
   u_short              eval_index = 0;
   u_short              i;
   short                pin_number;
   u_char               pin_value;
   u_char               old_pin_value;
   u_char               lcycmdb_modified = FALSE;
   u_char               lcychdb_modified = FALSE;
   u_char               unitno;
   u_char               wordno;
   u_char               bitno;
   u_char               total_unit;
   u_char               any_driving_to_z;

   DPRINTF(("inside evaluate_1_bit_per_pin\n"));

   /* The timeout value is set with the assumption that we are running at
    * 150KHz (~8us period).
    *     timeout = pattern play time  + 1 second for feedback
    *             = pattern_count * 8 microsec + 125000 * 8 microsec
    *             = (pattern_count + 125000) * 8 microsec
    *             = (pattern_count + 125000) * 8 / 1000  millisec
    *             = (pattern_count + 125000) >> 7;
    */
   timeout = (instance->pattern_count + PTRN_COUNT_FUDGE_FACTOR) >> 7;

   extra_def_ptr = (EXTRA_DEVICE_SPEC *)def_ptr->extra_data;

   if (set_edge_and_sample_setting(extra_def_ptr,
                                   (u_long)RESOLUTION_05_NS,
                                   (u_long)MAX_SAMPLE_RAMP_RANGE) == FAILURE)
      return(FAILURE);

   total_unit = dab_list[instance->dab_info_index]->unit_count;

   if (instance->is_fault == TRUE) {
      /* If it is a FAULT then always write the LCYCHDB and LCYCMDB */
      write_pattern(instance,
                    &instance->lcychdb_addr[0],
                    instance->lcychdb_loaded);

      write_pattern(instance,
                    &instance->lcycmdb_addr[0],
                    instance->lcycmdb_loaded);
   }
   else {
      /* If it an INSTANCE then write the LCYCHDB and LCYCMDB if this
       * instance has any faults.
       */
      if (instance->fault_count != 0) {
         write_pattern(instance,
                       &instance->lcychdb_addr[0],
                       instance->lcychdb_loaded);

         write_pattern(instance,
                       &instance->lcycmdb_addr[0],
                       instance->lcycmdb_loaded);
      }
   }

   /* Process the data pins and modify the measurement pattern accordingly */
   pin_number = instance->first_data_pin_index;
   instance->first_data_pin_index = -1;
   while (pin_number != -1) {

      uwb_ptr = &pn_to_short_offset[pin_number];
      unitno = uwb_ptr->unitno;
      wordno = uwb_ptr->wordno;
      bitno  = uwb_ptr->bitno;

      pin_info = &instance->pin_info_table[pin_number];
      pin_info->input_pin_is_linked = FALSE;
      pin_value = pin_info->old_filtered;

      set_pin_value(&instance->sim_pin_value,
                    unitno, wordno, bitno, pin_value);

      set_measurement_pattern(instance, &def_ptr->pin_table[pin_number],
                              unitno, wordno, bitno, pin_value,
                              &lcychdb_modified, &lcycmdb_modified);
```

Copyright 1989
Logic Modeling Systems

| SOURCE PROGRAM | DATE | PAGE # |
|---|---|---|
| lm1000/ptrnhist.c | 5/23/89 | 2/113 |
| | TIME 6:14:48 pm | |

LINE # SOURCE TEXT

```
         pin_number = pin_info->next_input_pin_index;
      }

      /* Process the eval pins and modify the measurement pattern accordingly */
      pin_number = instance->first_eval_pin_index;
      instance->first_eval_pin_index = -1;
      while (pin_number != -1) {

         uwb_ptr = ipn_to_short_offset[pin_number];
         unitno = uwb_ptr->unitno;
         wordno = uwb_ptr->wordno;
         bitno  = uwb_ptr->bitno;

         pin_info = &instance->pin_info_table[pin_number];
         pin_info->input_pin_is_linked = FALSE;
         pin_value = pin_info->old_filtered;

         set_pin_value(&instance->sim_pin_value,
                       unitno, wordno, bitno, pin_value);

         /* Save the EVAL changes to find the output delays */
         if (eval_index < MAX_EVAL_CHANGES) {
            gbl_eval_pin_number[eval_index] = pin_number;
            gbl_eval_pin_value[eval_index] = pin_value;
            ++eval_index;
         }
         else {
            lm_queue_message(WARNING_MSG, "internal error: not enough room to store eval changes, delay number might be incorrect");
         }

         set_measurement_pattern(instance, &def_ptr->pin_table[pin_number],
                                 unitno, wordno, bitno, pin_value,
                                 &lcychdb_modified, &lcycmdb_modified);

         pin_number = pin_info->next_input_pin_index;
      }

      /* If there are any eval changes, then run a measurement cycle */
      if (eval_index != 0) {

         DPRINTF(("run measurement cycle for eval changes\n"));

         if (lcychdb_modified == TRUE) {
            write_pattern(instance,
                          &instance->lcychdb_addr[0],
                          instance->lcychdb_loaded);
            lcychdb_modified = FALSE;
         }

         if (lcycmdb_modified == TRUE) {
            write_pattern(instance,
                          &instance->lcycmdb_addr[0],
                          instance->lcycmdb_loaded);
            lcycmdb_modified = FALSE;
         }

         write_pattern(instance,
                       &instance->unit_addr[instance->cur_unit_addr_index][0],
                       instance->ptrn_loaded);

         set_seq_end_bit(instance,
                         instance->lase_addr,
                         FALSE,
                         seq_end_addr,
                         inst_block_number);

         if (play_ptrn_seq(instance, timeout, changed_dac) == FAILURE) {
            remove_seq_end_bit(instance, seq_end_addr, inst_block_number);
            return(FAILURE);
         }

         if (get_result(def_ptr, instance, ident_change,
                        EVAL_EVENT, gbl_eval_pin_number,
                        eval_index, &any_driving_to_z) == FAILURE) {
            remove_seq_end_bit(instance, seq_end_addr, inst_block_number);
            return(FAILURE);
         }

         for (i = 0; i < replay_count; ++i) {
            if (play_ptrn_seq(instance, timeout, changed_dac) == FAILURE) {
               remove_seq_end_bit(instance, seq_end_addr, inst_block_number);
               return(FAILURE);
            }

            read_magic_full_sample_reg(instance, temp_steady_state_result);
            check_consistency(instance,
                              &instance->last_sample_value,
                              temp_steady_state_result,
                              ident_inconsistent_pins,
                              ident_change,
                              total_unit);
         }

#ifdef DEBUG
         if (loop_till_key == TRUE) {
            printf("looping in eval instance. EVAL changes\n");
            debug_key = 0;
            while (debug_key == 0) {
               if (play_ptrn_seq(instance,
                                 timeout, &changed_dac) == FAILURE) {
                  remove_seq_end_bit(instance, seq_end_addr, inst_block_number);
                  return(FAILURE);
               }
            }
            if (debug_char == (u_long)'t') {
               loop_till_key = FALSE;
               printf("stop loop\n");
            }
            debug_key = 0;
         }
#endif

         if (any_driving_to_z == TRUE) {
            /* Use 2 bits per pin --> hard drive those IO STORE pins which
             *                        change from driving to Z.
             */

            if (def_ptr->device_type == PUBLIC) {
               /* Write ENDENB_LOADED to previous pattern address.
```

Copyright 1989
Logic Modeling Systems

LINE # SOURCE TEXT

```
                 * For PRIVATE devices we don't have to do anything since
                 * HMDENB will always be written when we do the next evaluation.
                 */
               write_pattern(instance,
                            &instance->unit_addr[
                                 instance->cur_unit_addr_index + 1 & 1][0],
                            instance->hmdenb_loaded);

               write_pattern(instance,
                         &instance->unit_addr[instance->cur_unit_addr_index][0],
                         instance->last_consistent_set);

               if (grow_pattern(instance) == FAILURE)
                  return(FAILURE);
            }
         }

      remove_seq_end_bit(instance, seq_end_addr, inst_block_number);


      /* Get the delays from eval pins to outputs and put them in PIN_INFO */
      for (i = 0; i < eval_index; ++i) {
         get_delay(def_ptr, instance, ident_change,
                   ident_inconsistent_pins,
                   gbl_eval_pin_number[i], gbl_eval_pin_value[i]);
      }

      add_inconsistent_pins(instance, ident_inconsistent_pins);

      clear_ptrn_bits((char *)ident_change,
                      dab_list[instance->dab_info_index]->unit_count);

      clear_ptrn_bits((char *)ident_inconsistent_pins,
                      dab_list[instance->dab_info_index]->unit_count);
   }

   /* Process the STORE pin changes */
   for (pin_number = instance->first_store_pin_index,
        instance->first_store_pin_index = -1,
        pin_number != -1,
        pin_number = pin_info->next_input_pin_index) {

      gbl_eval_pin_number[0] = pin_number;

      uwb_ptr = &pn_to_short_offset[pin_number];
      unitno = uwb_ptr->unitno;
      wordno = uwb_ptr->wordno;
      bitno  = uwb_ptr->bitno;

      pin_info = &instance->pin_info_table[pin_number];
      pin_def = &def_ptr->pin_table[pin_number];

      pin_info->input_pin_is_linked = FALSE;
      pin_value = pin_info->old_filtered;

      if (pin_def->direction == IN) {
         /* INPUT STORE change */

         old_pin_value = read_pin_value(&instance->sim_pin_value,
                                        unitno, wordno, bitno);

         set_pin_value(&instance->sim_pin_value,
                       unitno, wordno, bitno, pin_value);

         switch (pin_def->clk_format) {
         case NRZ:
         case DNRZ:

            if (input_pin_transition(old_pin_value, pin_value,
                         pin_info->uninitialized_pin) == NO_TRANSITION) {
               /* This is an error because the host should have filtered the
                * transition.
                * On second thought it is NOT an error because the host only
                * filters transitions to exactly the same value.
                */
               DPRINTF(("No transition on IN STORE DNRZ pin %s\n", pin_def->pin_name));

               continue;
            }

            if (pin_value & (LOGIC_0 | LOGIC_S0 | LOGIC_Z0))
               reset_ptrn_bit(&instance->ptrn_loaded[unitno], wordno, bitno);
            else
               set_ptrn_bit  (&instance->ptrn_loaded[unitno], wordno, bitno);

            break;

         case R1:
            if (input_pin_transition(old_pin_value, pin_value,
                     pin_info->uninitialized_pin) != RISE_TRANSITION) {

               DPRINTF(("No transition on IN STORE R1 pin %s\n", pin_def->pin_name));
               continue;
            }

            /* Disable the R1 clock on the measurement pattern (ptrn_loaded) */
            set_ptrn_bit(&instance->ptrn_loaded[unitno], wordno, bitno);

            break;
         case R0:
            if (input_pin_transition(old_pin_value, pin_value,
                     pin_info->uninitialized_pin) != FALL_TRANSITION) {
               DPRINTF(("No transition on IN STORE R0 pin %s\n", pin_def->pin_name));
               continue;
            }

            /* Disable the RZ clock on the measurement pattern (ptrn_loaded) */
            reset_ptrn_bit(&instance->ptrn_loaded[unitno], wordno, bitno);

            break;
         default:
            lm_queue_message(ERROR_MSG, "internal error: illegal pin type in device.h");
            continue;
         }
      }
      else {
         /* IO STORE change */
         /* Note: IO store pin can only have DNRZ format */

         old_pin_value = read_pin_value(&instance->last_sample_value,
```

Copyright 1989
Logic Modeling Systems

SOURCE PROGRAM lm1000/ptrnhist.c | DATE 5/23/89 | TIME 6:14:48 pm | PAGE # 4/115

LINE # SOURCE TEXT

```
                                    unitno, wordno, bitno);

         set_pin_value(&instance->sim_pin_value,
                       unitno, wordno, bitno, pin_value);

         if (io_pin_transition(old_pin_value, pin_value,
                               pin_info->uninitialized_pin) == NO_TRANSITION) {

            DPRINTF(("No transition on IO STORE pin %s\n", pin_def->pin_name));

            continue;
         }

         set_measurement_pattern(instance, pin_def,
                                 unitno, wordno, bitno, pin_value,
                                 &lcychdb_modified, &lcycmdb_modified);


         if (lcychdb_modified == TRUE) {
            write_pattern(instance,
                          &instance->lcychdb_addr[0],
                          instance->lcychdb_loaded);
            lcychdb_modified = FALSE;
         }

         if (lcycmdb_modified == TRUE) {
            write_pattern(instance,
                          &instance->lcycmdb_addr[0],
                          instance->lcycmdb_loaded);
            lcycmdb_modified = FALSE;
         }
      }

      calculate_consistent_set(instance, def_ptr, consistent_set);

      switch (pin_def->clk_format) {
      case R1:
         reset_ptrn_bit(&consistent_set[unitno], wordno, bitno);
         break;
      case R0:
         set_ptrn_bit  (&consistent_set[unitno], wordno, bitno);
         break;
      default:
         break;
      }

      /* save the consistent set */
      copy_ptrn_bits((char *)consistent_set,
                     (char *)instance->last_consistent_set,
                     dab_list[instance->dab_info_index]->unit_count);

      if (instance->use_2_bit_per_pin == TRUE) {
         switch_to_2_bit_per_pin(instance);
      }

      write_pattern(instance,
                    &instance->unit_addr[instance->cur_unit_addr_index][0],
                    consistent_set);

      if (grow_pattern(instance) == FAILURE)
         return(FAILURE);

      write_pattern(instance,
                    &instance->unit_addr[instance->cur_unit_addr_index][0],
                    instance->ptrn_loaded);

      set_seq_end_bit(instance,
                      instance->lane_addr,
                      FALSE,
                      seq_end_addr,
                      inst_block_number);


      if (play_ptrn_seq(instance, timeout, changed_dac) == FAILURE) {
         remove_seq_end_bit(instance, seq_end_addr, inst_block_number);
         return(FAILURE);
      }

      if (get_result(def_ptr, instance, ident_change,
                     STORE_EVENT, gbl_eval_pin_number,
                     1, &any_driving_to_z) == FAILURE) {
         remove_seq_end_bit(instance, seq_end_addr, inst_block_number);
         return(FAILURE);
      }

      for (i = 0; i < replay_count; ++i) {
         if (play_ptrn_seq(instance, timeout, changed_dac) == FAILURE) {
            remove_seq_end_bit(instance, seq_end_addr, inst_block_number);
            return(FAILURE);
         }

         read_magic_full_sample_reg(instance, temp_steady_state_result);
         check_consistency(instance,
                           &instance->last_sample_value,
                           temp_steady_state_result,
                           ident_inconsistent_pins,
                           ident_change,
                           total_unit);
      }

#ifdef DEBUG
      if (loop_till_key == TRUE) {
         printf("looping in eval instance. STORE change...\n");
         debug_key = 0;
         while (debug_key == 0) {
            if (play_ptrn_seq(instance,
                              timeout, &changed_dac) == FAILURE) {
               remove_seq_end_bit(instance, seq_end_addr, inst_block_number);
               return(FAILURE);
            }
         }
         if (debug_char == (u_long)'t') {
            loop_till_key = FALSE;
            printf("stop loop\n");
         }
         debug_key = 0;
      }
#endif

      if (any_driving_to_z == TRUE) {
```

Copyright 1989 Logic Modeling Systems

| SOURCE PROGRAM | DATE | PAGE # |
|---|---|---|
| lm1000/ptrnhist.c | 5/23/89 | 5/116 |
| | TIME 6:14:48 pm | |

LINE # SOURCE TEXT

```
        /* Use 2 bits per pin ---> hard drive those IO STORE pins which
         *                         change from driving to Z.
         */

        if (def_ptr->device_type == PUBLIC) {
           /* Write HMDENB_LOADED to previous pattern addr...
            * For PRIVATE devices we don't have to do anything since
            * HMDENB will always be written when we do the next evaluation.
            */
           write_pattern(instance,
                        &instance->unit_addr[
                             instance->cur_unit_addr_index + 1 & 1][0],
                        instance->hmdenb_loaded);

           write_pattern(instance,
                     &instance->unit_addr[instance->cur_unit_addr_index][0],
                     instance->last_consistent_set);

           if (grow_pattern(instance) == FAILURE)
              return(FAILURE);
        }
      }

      remove_seq_end_bit(instance, seq_end_addr, inst_block_number);

      get_delay(def_ptr, instance, ident_change,
                ident_inconsistent_pins,
                (u_short)pin_number, pin_value);

      add_inconsistent_pins(instance, ident_inconsistent_pins);

      clear_ptrn_bits((char *)ident_change,
                      dab_list[instance->dab_info_index]->unit_count);

      clear_ptrn_bits((char *)ident_inconsistent_pins,
                      dab_list[instance->dab_info_index]->unit_count);

      pin_info->uninitialized_pin = FALSE;
   }

   return(SUCCESS);
}

set_measurement_pattern(instance, pin_def, unitno, wordno, bitno, pin_value,
                        lcychdb_modified, lcycmdb_modified)
INSTANCE_INFO *instance;
PIN_SPEC      *pin_def;
u_char         unitno;
u_char         wordno;
u_char         bitno;
u_char         pin_value;
u_char        *lcychdb_modified;
u_char        *lcycmdb_modified;
{
   u_char measured_value;

   if (pin_value & (LOGIC_0 | LOGIC_S0))
      reset_ptrn_bit(&instance->ptrn_loaded[unitno], wordno, bitno);
   else if (pin_value & (LOGIC_1 | LOGIC_S1))
      set_ptrn_bit(&instance->ptrn_loaded[unitno], wordno, bitno);
   else {
      measured_value = read_pin_value(&instance->last_sample_value,
                                      unitno, wordno, bitno);
      if (measured_value & (LOGIC_0 | LOGIC_Z0))
         reset_ptrn_bit(&instance->ptrn_loaded[unitno], wordno, bitno);
      else if (measured_value & (LOGIC_1 | LOGIC_Z1))
         set_ptrn_bit(&instance->ptrn_loaded[unitno], wordno, bitno);
      else {
         /* Simulator value is 1/U and measured value is U. Drive
          * this pin to the opposite value.
          */
         toggle_ptrn_bit(&instance->ptrn_loaded[unitno], wordno, bitno);
      }
   }

   if (instance->definition->device_type == PRIVATE) {
      if (pin_value & (LOGIC_0 | LOGIC_1 | LOGIC_S0 | LOGIC_S1)) {
         reset_ptrn_bit(&instance->hmdenb_loaded[unitno], wordno, bitno);
      }
      else {
         set_ptrn_bit(&instance->hmdenb_loaded[unitno], wordno, bitno);
      }
      return;
   }

   if (pin_def->direction == IO) {
      if (pin_value & (LOGIC_0 | LOGIC_1 | LOGIC_S0 | LOGIC_S1)) {
         switch (pin_def->last_cyc_drive) {
         case H_DRIVE:
            reset_ptrn_bit(&instance->lcychdb_loaded[unitno], wordno, bitno);
            *lcychdb_modified = TRUE;
            break;
         case M_DRIVE:
            reset_ptrn_bit(&instance->lcycmdb_loaded[unitno], wordno, bitno);
            *lcycmdb_modified = TRUE;
            break;
         case HM_DRIVE:
            reset_ptrn_bit(&instance->lcychdb_loaded[unitno], wordno, bitno);
            reset_ptrn_bit(&instance->lcycmdb_loaded[unitno], wordno, bitno);
            *lcychdb_modified = TRUE;
            *lcycmdb_modified = TRUE;
            break;
         case NO_DRIVE:
         default:
            break;
         }
      }
      else {
         switch (pin_def->last_cyc_drive) {
         case H_DRIVE:
            set_ptrn_bit(&instance->lcychdb_loaded[unitno], wordno, bitno);
            *lcychdb_modified = TRUE;
            break;
         case M_DRIVE:
            set_ptrn_bit(&instance->lcycmdb_loaded[unitno], wordno, bitno);
            *lcycmdb_modified = TRUE;
            break;
         case HM_DRIVE:
            set_ptrn_bit(&instance->lcychdb_loaded[unitno], wordno, bitno);
            set_ptrn_bit(&instance->lcycmdb_loaded[unitno], wordno, bitno);
```

Copyright 1989 Logic Modeling Systems

LINE # SOURCE TEXT

```
                *lcychdb_modified = TRUE;
                *lcycmdb_modified = TRUE;
                break;
            case NO_DRIVE:
            default:
                break;
            }
        }
    }
}


calculate_consistent_set(instance, def_ptr, consistent_set_ptr)
INSTANCE_INFO           *instance;
DEVICE_SPEC             *def_ptr;
PTRN_BITS_LONGWORD      *consistent_set_ptr;
{
    EXTRA_DEVICE_SPEC     *extra_def_ptr;
    DAB_INFO              *dab_ptr;
    PTRN_BITS_LONGWORD    *ptrn_loaded_ptr;
    PTRN_BITS_LONGWORD    *sampled_data_ptr;
    PTRN_BITS_LONGWORD    *sampled_hiz_ptr;
    PTRN_BITS_LONGWORD    *sampled_unk_ptr;
    PTRN_BITS_LONGWORD    *sim_data_ptr;
    PTRN_BITS_LONGWORD    *sim_hiz_ptr;
    PTRN_BITS_LONGWORD    *sim_unk_ptr;
    PTRN_BITS_LONGWORD    *ident_inputs_ptr;
    PTRN_BITS_LONGWORD    *ident_outputs_ptr;
    PTRN_BITS_LONGWORD    *ident_ios_ptr;
    u_char                 total_unit;
    u_char                 unit;
    u_char                 word;

     /* Calculate consistent set:
      *   for INPUT   pins ---> take the sim_pin_value (or ptrn_loaded)
      *                         disable R1/RZ clocks
      *   for OUTPUT  pins ---> take the last_sample_value
      *   for IO      pins ---> take the combination of sim_pin_value and
      *                         last_sample_value.
      */

    extra_def_ptr = (EXTRA_DEVICE_SPEC *)def_ptr->extra_data;
    dab_ptr = dab_list[instance->dab_info_index];
    total_unit = dab_ptr->unit_count;

    ptrn_loaded_ptr = (PTRN_BITS_LONGWORD *)instance->ptrn_loaded;
    sampled_data_ptr = (PTRN_BITS_LONGWORD *)
                                    instance->last_sample_value.data;
    sampled_hiz_ptr = (PTRN_BITS_LONGWORD *)
                                    instance->last_sample_value.hiz;
    sampled_unk_ptr = (PTRN_BITS_LONGWORD *)
                                    instance->last_sample_value.unknown;
    sim_data_ptr    = (PTRN_BITS_LONGWORD *)
                                    instance->sim_pin_value.data;
    sim_hiz_ptr     = (PTRN_BITS_LONGWORD *)
                                    instance->sim_pin_value.hiz;
    sim_unk_ptr     = (PTRN_BITS_LONGWORD *)
                                    instance->sim_pin_value.unknown;
    ident_inputs_ptr   = extra_def_ptr->ident_inputs;
    ident_outputs_ptr  = extra_def_ptr->ident_outputs;
    ident_ios_ptr      = extra_def_ptr->ident_ios;

    for (unit = 0; unit < total_unit; ++unit) {

        for (word = 0; word < 3; ++word) {
            /* INPUT pins.
             * The ptrn_loaded already contains the clock and the data bits
             * set correctly before this step, so just copy it. We cannot
             * use the sim_pin_value because the clock (R1/RZ) might not be
             * set correctly. For example if a pin is an R1 pin and we have
             * seen the falling transition but not the rising transition yet.
             * At that point the sim_pin_value will be set to 0. If some
             * other store pin change value and we use sim_pin_value to
             * build the consistent set, then the consistent set will have
             * that clock enabled (which is wrong !!!).
             */
            consistent_set_ptr->word[word] =
                ptrn_loaded_ptr->word[word] & ident_inputs_ptr->word[word];

            /* OUTPUT pins.
             * Drive the output pins to the last sampled value.
             */
            consistent_set_ptr->word[word] |=
                sampled_data_ptr->word[word] & ident_outputs_ptr->word[word];

            /* IO pins.
             * Drive the IO pins to the combination of sim_pin_value and
             * last_sample_value as follows:
             *
             *                +--------------+---------+----+-------------+
             *    SIM         |     ANY      |    Z    | U  |     ANY     |
             *                +--------------+---------+----+-------------+
             *
             *                +------------------+-------------------+----+
             *    SAMPLE      |       ANY        |         Z         | U  |
             *                +------------------+-------------------+----+
             *
             *                +------------------+-----+-----+-----+------+
             *    RESULT      |       #1         | #2  | #5  | #3  | #4   |
             *                +------------------+-----+-----+-----+------+
             *
             *    #1  ---> use sample data
             *    #2  ---> use sample data
             *    #3  ---> use sim data
             *    #4  ---> use the opposite value of sample data
             *    #5  ---> use sample data
             */

            consistent_set_ptr->word[word] |= ident_ios_ptr->word[word] &
                (
                 /* Result #2 */
                 ((sampled_hiz_ptr->word[word] & sim_hiz_ptr->word[word]) &
                                        sampled_data_ptr->word[word]) |
                 /* Result #5 */
                 ((sampled_hiz_ptr->word[word] & sim_unk_ptr->word[word]) &
                                        sampled_data_ptr->word[word]) |
                 /* Result #3 */
                 ((sampled_hiz_ptr->word[word] &
                    (sim_hiz_ptr->word[word] | sim_unk_ptr->word[word])) &
                                        sim_data_ptr->word[word]) |
```

Copyright 1989
Logic Modeling Systems

SOURCE PROGRAM lm1000/ptrnhist.c | DATE 5/23/89 | TIME 6:14:48 pm | PAGE # 7/118

LINE # SOURCE TEXT

```
                /* Result #4 */
                (sampled_unk_ptr->word[word] & ~ sampled_data_ptr->word[word]) |

                /* Result #1 */
                (~ (sampled_hiz_ptr->word[word] | sampled_unk_ptr->word[word]) &
                                                sampled_data_ptr->word[word])

            );

        }

        /* copy the control bits */
        ((PTRN_BITS *)consistent_set_ptr)->ctl =
                        ((PTRN_BITS *)ptrn_loaded_ptr)->ctl;

        ++ptrn_loaded_ptr;
        ++sampled_data_ptr;
        ++sampled_hiz_ptr;
        ++sampled_unk_ptr;
        ++sim_data_ptr;
        ++sim_hiz_ptr;
        ++sim_unk_ptr;
        ++ident_inputs_ptr;
        ++ident_outputs_ptr;
        ++ident_ios_ptr;
        ++consistent_set_ptr;
    }
}

get_result(def_ptr, instance, ident_change,
           event_type, eval_pin_number, eval_pin_count, any_driving_to_z)
DEVICE_SPEC         *def_ptr;
INSTANCE_INFO       *instance;
PTRN_BITS_LONGWORD  *ident_change;
u_char               event_type;
u_short             *eval_pin_number;
u_short              eval_pin_count;
u_char              *any_driving_to_z;
{
   /* Read the result from the magic chip and set the variable "ident_change".
    * "event_type" determines if it is legal to have IO STORE transitions.
    * "eval_pin_number" and "eval_pin_count" are used to report errors,
    * and ONLY used if "event_type" is EVAL_EVENT.
    * Also change the output pin's instance->ptrn_loaded to be the new
    * sample value.
    */

    DAB_INFO            *dab_ptr;
    EXTRA_DEVICE_SPEC   *extra_def_ptr;
    PIN_SPEC            *pin_spec;
    u_long              *new_sample_unk_ptr;
    u_long              *new_sample_hiz_ptr;
    u_long              *new_sample_data_ptr;
    u_long              *last_sample_unk_ptr;
    u_long              *last_sample_hiz_ptr;
    u_long              *last_sample_data_ptr;
    u_long              *ptrn_loaded_ptr;
    u_long              *ident_ios_ptr;
    u_long              *ident_outputs_ptr;
    u_long              *ident_change_ptr;
    u_long              *ident_store_ptr;
    u_long               ident_driving_to_z;
    u_long               ident_z_to_driving;
    u_long               ident_io_store;
    u_long               mask;
    u_long               ident_hiz_to_change;
    u_short              pin_number;
    char                 pin_name_list[MAX_LINE_LENGTH];
    u_char               build_pin_name_list = FALSE;
    u_char               i;
    u_char               total_word;
    u_char               total_unit;
    u_char               unitno;
    u_char               wordno;
    char                 bitno;
    u_char               unit_offset;
    u_char               word_offset;
    u_short              word_pin_number_offset;
    u_short              unit_pin_number_offset;

    DPRINTF(("inside get_result\n"));

    *any_driving_to_z = FALSE;

    extra_def_ptr = (EXTRA_DEVICE_SPEC *)def_ptr->extra_data;
    dab_ptr = dab_list[instance->dab_info_index];
    total_word = dab_ptr->unit_count *
                     sizeof(PTRN_BITS_LONGWORD) / sizeof(u_long);

    read_magic_full_sample_reg(instance, &gbl_new_sample_value);

    new_sample_unk_ptr  = (u_long *)gbl_new_sample_value.unknown;
    new_sample_hiz_ptr  = (u_long *)gbl_new_sample_value.hiz;
    new_sample_data_ptr = (u_long *)gbl_new_sample_value.data;

    last_sample_unk_ptr  = (u_long *)instance->last_sample_value.unknown;
    last_sample_hiz_ptr  = (u_long *)instance->last_sample_value.hiz;
    last_sample_data_ptr = (u_long *)instance->last_sample_value.data;

    ptrn_loaded_ptr      = (u_long *)instance->ptrn_loaded;

    ident_ios_ptr     = (u_long *)extra_def_ptr->ident_ios;
    ident_outputs_ptr = (u_long *)extra_def_ptr->ident_outputs;
    ident_store_ptr   = (u_long *)extra_def_ptr->ident_store;
    ident_change_ptr  = (u_long *)ident_change;

/*
    if (instance->first_eval == TRUE) {
       DPRINTF(("first_eval\n"));
       for (wordno = 0; wordno < total_word; ++wordno) {
          ident_change_ptr[wordno] |= 0xffffffff;

          ident_change_ptr[wordno] &=
             ident_ios_ptr[wordno] | ident_outputs_ptr[wordno];

          ptrn_loaded_ptr[wordno] =
             (ptrn_loaded_ptr[wordno] & ~ident_ios_ptr[wordno]) |
                (new_sample_data_ptr[wordno] & ident_ios_ptr[wordno]);

       }
```

Copyright 1989 Logic Modeling Systems

SOURCE PROGRAM lm1000/ptrnhist.c | DATE 5/23/89 | TIME 6:14:48 pm | PAGE # 8/119

LINE # SOURCE TEXT

```
            instance->first_eval = FALSE;
      }
      else {
*/
      {
            instance->first_eval = FALSE;
            for (wordno = 0; wordno < total_word; ++wordno) {
               /* Ignore the changes from Z1 to Z0 and vice versa */
                ident_hiz_no_change =
                   new_sample_hiz_ptr[wordno] & last_sample_hiz_ptr[wordno];

                ident_change_ptr[wordno] |=
                   new_sample_hiz_ptr[wordno] ^ last_sample_hiz_ptr[wordno] |
                   new_sample_unk_ptr[wordno] ^ last_sample_unk_ptr[wordno] |
                   (new_sample_data_ptr[wordno] ^ last_sample_data_ptr[wordno]) &
                       ~ident_hiz_no_change;

               /* We are interested only in IO and OUTPUT changes */
               ident_change_ptr[wordno] &=
                   ident_ios_ptr[wordno] | ident_outputs_ptr[wordno];

               DPRINTF(("chg word %d: %08x\n", wordno, ident_change_ptr[wordno]));

               ptrs_loaded_ptr[wordno] =
                   (ptrs_loaded_ptr[wordno] & ~ident_ios_ptr[wordno]) |
                      (new_sample_data_ptr[wordno] & ident_ios_ptr[wordno]);
            }
      }

      if (extra_def_ptr->has_io_store == TRUE) {

         total_unit = dab_ptr->unit_count;

         /* Check if any IO STORE pins go from driving to Z*/
         unit_pin_number_offset = 0;
         unit_offset = 0;
         for (unitno = 0; unitno < total_unit; ++unitno) {

            word_pin_number_offset = unit_pin_number_offset + 79;

            for (wordno = 0; wordno < 3; ++wordno) {

               word_offset = unit_offset + wordno;

               ident_io_store = ident_ios_ptr[word_offset] &
                                ident_store_ptr[word_offset];
/*

               ptrs_loaded_ptr[word_offset] =
                  (ptrs_loaded_ptr[word_offset] & ~ident_io_store) |
                     (new_sample_data_ptr[word_offset] & ident_io_store);
*/
               if (ident_driving_to_z =
                     (ident_io_store) &
                     (~ last_sample_hiz_ptr[word_offset] &
                      new_sample_hiz_ptr[word_offset] )) {

                  *any_driving_to_z = TRUE;

                  for (bitno = 31; bitno >= 0; --bitno) {
                     mask = bitno_to_mask[bitno];

                     if (ident_driving_to_z == 0)
                        break;

                     if (ident_driving_to_z & mask) {
                        ident_driving_to_z ^= mask;

                        if ((event_type == EVAL_EVENT) &&
                            (def_ptr->report_ioac == TRUE)) {
                          if (build_pin_name_list == FALSE) {

                             /* Get a list of EVAL pin names */
                             pin_name_list[0] = '\0';

                             for (i = 0; i < eval_pin_count; ++i) {
                                pin_spec =  &def_ptr->
                                                pin_table[eval_pin_number[i]];

                                if (strlen(pin_name_list) +
                                     strlen(pin_spec->pin_name) + 1 <
                                                      MAX_LINE_LENGTH) {
                                   (void)strcat(pin_name_list,
                                                pin_spec->pin_name);
                                   (void)strcat(pin_name_list, " ");
                                }
                                else
                                   break;
                             }

                             build_pin_name_list = TRUE;
                          }

                          pin_number = word_pin_number_offset + bitno - 31;

                          lm_queue_message(WARNING_MSG, "any of these eval pins: %s of instance: %s caused I/O store pin: %s to change from driv
                          ing to Z",
                             pin_name_list,
                             instance->device_info_string,
                             def_ptr->pin_table[pin_number].pin_name);
                        }

                        reset_ptrn_bit_long(
                           (PTRN_BITS_LONGWORD *)&instance->hmdeab_loaded[unitno],
                           wordno, (u_char)bitno);
                     }
                  }
               }

               word_pin_number_offset -= 32;
            }

            unit_offset += sizeof(PTRN_BITS_LONGWORD) / sizeof(u_long);

            unit_pin_number_offset += 80;
         }

         /* Check if any IO STORE pins go from Z to driving */

         unit_pin_number_offset = 0;
```

Copyright 1989
Logic Modeling Systems

SOURCE PROGRAM lm1000/ptrnhist.c | DATE 5/23/89 | TIME 6:14:48 pm | PAGE # 9/120

LINE # SOURCE TEXT

```
      unit_offset = 0;

      for (unitno = 0; unitno < total_unit; ++unitno) {

         word_pin_number_offset = unit_pin_number_offset + 79;

         for (wordno = 0; wordno < 3; ++wordno) {

            word_offset = unit_offset + wordno;

            if (ident_z_to_driving =
                 (ident_ios_ptr[word_offset] & ident_store_ptr[word_offset]) &
                 (last_sample_hiz_ptr[word_offset] &
                   new_sample_hiz_ptr[word_offset])) {

               instance->use_2_bit_per_pin = TRUE;

               for (bitno = 31; bitno >= 0; --bitno) {
                  mask = bitno_to_mask[bitno];

                  if (ident_z_to_driving == 0)
                     break;

                  if (ident_z_to_driving & mask) {
                     ident_z_to_driving ^= mask;

                     if ((event_type == EVAL_EVENT) &&
                          (def_ptr->report_iosc == TRUE)) {
                        if (build_pin_name_list == FALSE) {

                           /* Get a list of EVAL pin names */
                           pin_name_list[0] = '\0';

                           for (i = 0; i < eval_pin_count; ++i) {
                              pin_spec =  &def_ptr->
                                              pin_table[eval_pin_number[i]];

                              if (strlen(pin_name_list) +
                                   strlen(pin_spec->pin_name) <
                                                    MAX_LINE_LENGTH) {
                                 (void)strcat(pin_name_list,
                                              pin_spec->pin_name);
                                 (void)strcat(pin_name_list, " ");
                              }
                              else
                                 break;
                           }

                           build_pin_name_list = TRUE;
                        }

                        pin_number = word_pin_number_offset + bitno - 31;

                        lm_queue_message(WARNING_MSG, "any of these eval pins: %s of instance: %s caused I/O store pin: %s to change from Z to
                         driving",
                           pin_name_list,
                           instance->device_info_string,
                           def_ptr->pin_table[pin_number].pin_name);
                     }

                     set_ptrn_bit_long(
                        (PTRN_BITS_LONGWORD *)&instance->hmdenb_loaded[unitno],
                        wordno, (u_char)bitno);
                  }
               }
            }

            word_pin_number_offset -= 32;
         }

         unit_offset += sizeof(PTRN_BITS_LONGWORD) / sizeof(u_long);
         unit_pin_number_offset += 80;
      }
   }

   /* Save new_sample_value to instance->last_sample_value */
   copy_ptrn_bits((char *)new_sample_unk_ptr,
                  (char *)last_sample_unk_ptr,
                  dab_ptr->unit_count);
   copy_ptrn_bits((char *)new_sample_hiz_ptr,
                  (char *)last_sample_hiz_ptr,
                  dab_ptr->unit_count);
   copy_ptrn_bits((char *)new_sample_data_ptr,
                  (char *)last_sample_data_ptr,
                  dab_ptr->unit_count);

   return(SUCCESS);
}

check_consistency(instance, sample_result1, sample_result2,
                  ident_inconsistent_pins, ident_change, total_unit)
INSTANCE_INFO      *instance;
FULL_VALUE         *sample_result1;
FULL_VALUE         *sample_result2;
PTRN_BITS_LONGWORD *ident_inconsistent_pins;
PTRN_BITS_LONGWORD *ident_change;
u_char              total_unit;
{
   /* Compare sample_result1 and sample_result2.
    * ADD the differences to ident_inconsistent_pins and ident_change.
    */
   EXTRA_DEVICE_SPEC   *extra_def_ptr;
   PTRN_BITS_LONGWORD  *s1_data_ptr;
   PTRN_BITS_LONGWORD  *s1_hiz_ptr;
   PTRN_BITS_LONGWORD  *s1_unknown_ptr;
   PTRN_BITS_LONGWORD  *s2_data_ptr;
   PTRN_BITS_LONGWORD  *s2_hiz_ptr;
   PTRN_BITS_LONGWORD  *s2_unknown_ptr;
   PTRN_BITS_LONGWORD  *ident_outputs_ptr;
   PTRN_BITS_LONGWORD  *ident_ios_ptr;
   u_char               unitno;
   u_char               wordno;
#ifdef DEBUG
   u_long               inconsistent_pins;
   u_long               mask;
   u_short              pin_number;
   u_char               any_inconsistent_pins = FALSE;
   char                 bitno;
#endif
```

Copyright 1989
Logic Modeling Systems

SOURCE PROGRAM lm1000/ptrnhist.c

DATE 5/23/89 TIME 6:14:48 pm PAGE # 10/121

LINE # SOURCE TEXT

```
    extra_def_ptr      = (EXTRA_DEVICE_SPEC *)instance->definition->extra_data;
    ident_outputs_ptr = extra_def_ptr->ident_outputs;
    ident_ios_ptr      = extra_def_ptr->ident_ios;

    s1_data_ptr    = (PTRN_BITS_LONGWORD *)sample_result1->data;
    s1_hiz_ptr     = (PTRN_BITS_LONGWORD *)sample_result1->hiz;
    s1_unknown_ptr = (PTRN_BITS_LONGWORD *)sample_result1->unknown;

    s2_data_ptr    = (PTRN_BITS_LONGWORD *)sample_result2->data;
    s2_hiz_ptr     = (PTRN_BITS_LONGWORD *)sample_result2->hiz;
    s2_unknown_ptr = (PTRN_BITS_LONGWORD *)sample_result2->unknown;

    for (unitno = 0; unitno < total_unit; ++unitno) {
        for (wordno = 0; wordno < 3; ++wordno) {

            ident_inconsistent_pins->word[wordno] |=
                (s1_data_ptr    ->word[wordno] ^ s2_data_ptr    ->word[wordno] |
                 s1_hiz_ptr     ->word[wordno] ^ s2_hiz_ptr     ->word[wordno] |
                 s1_unknown_ptr ->word[wordno] ^ s2_unknown_ptr ->word[wordno]) &
                    (ident_outputs_ptr->word[wordno] |
                     ident_ios_ptr->word[wordno]);

            ident_change->word[wordno] |=
                ident_inconsistent_pins->word[wordno];

#ifdef DEBUG
            if (ident_inconsistent_pins->word[wordno]) {
                inconsistent_pins = ident_inconsistent_pins->word[wordno];

                for (bitno = 31; bitno >= 0; --bitno) {
                    if (inconsistent_pins == 0)
                        break;
                    mask = bitno_to_mask[bitno];
                    if (inconsistent_pins & mask) {
                        inconsistent_pins ^= mask;

                        pin_number = CALC_PIN_NUMBER_LONG(unitno, wordno, bitno);

                        DPRINTF(("PN: %d is found inconsistent\n", pin_number));
                    }
                }
                any_inconsistent_pins = TRUE;
            }
#endif

        }

        ++ident_inconsistent_pins;
        ++ident_outputs_ptr;
        ++ident_ios_ptr;
        ++ident_change;
        ++s1_data_ptr;
        ++s1_hiz_ptr;
        ++s1_unknown_ptr;
        ++s2_data_ptr;
        ++s2_hiz_ptr;
        ++s2_unknown_ptr;
    }

#ifdef DEBUG
    if (any_inconsistent_pins == TRUE) {
        DPRINTF(("there are inconsistent pins\n"));
    }
#endif
}

check_consistency2(instance, sample_result1, sample_result2,
                   ident_inconsistent_pins, ident_change, total_unit)
INSTANCE_INFO      *instance;
FULL_VALUE         *sample_result1;
FULL_VALUE         *sample_result2;
PTRN_BITS_LONGWORD *ident_inconsistent_pins;
PTRN_BITS_LONGWORD *ident_change;
u_char              total_unit;
{
    /* Compare sample_result1 and sample_result2.
     * ADD the differences to ident_inconsistent_pins and ident_change.
     * Don't compare data if it is HIZ or UNKNOWN.
     */
    EXTRA_DEVICE_SPEC    *extra_def_ptr;
    PTRN_BITS_LONGWORD   *s1_data_ptr;
    PTRN_BITS_LONGWORD   *s1_hiz_ptr;
    PTRN_BITS_LONGWORD   *s1_unknown_ptr;
    PTRN_BITS_LONGWORD   *s2_data_ptr;
    PTRN_BITS_LONGWORD   *s2_hiz_ptr;
    PTRN_BITS_LONGWORD   *s2_unknown_ptr;
    PTRN_BITS_LONGWORD   *ident_outputs_ptr;
    PTRN_BITS_LONGWORD   *ident_ios_ptr;
    u_long                ident_hiz_and_unk;
    u_char                unitno;
    u_char                wordno;
#ifdef DEBUG
    u_long                inconsistent_pins;
    u_long                mask;
    u_short               pin_number;
    u_char                any_inconsistent_pins = FALSE;
    char                  bitno;
#endif

    extra_def_ptr      = (EXTRA_DEVICE_SPEC *)instance->definition->extra_data;
    ident_outputs_ptr = extra_def_ptr->ident_outputs;
    ident_ios_ptr      = extra_def_ptr->ident_ios;

    s1_data_ptr    = (PTRN_BITS_LONGWORD *)sample_result1->data;
    s1_hiz_ptr     = (PTRN_BITS_LONGWORD *)sample_result1->hiz;
    s1_unknown_ptr = (PTRN_BITS_LONGWORD *)sample_result1->unknown;

    s2_data_ptr    = (PTRN_BITS_LONGWORD *)sample_result2->data;
    s2_hiz_ptr     = (PTRN_BITS_LONGWORD *)sample_result2->hiz;
    s2_unknown_ptr = (PTRN_BITS_LONGWORD *)sample_result2->unknown;

    for (unitno = 0; unitno < total_unit; ++unitno) {
        for (wordno = 0; wordno < 3; ++wordno) {

            ident_hiz_and_unk =
                s1_hiz_ptr     ->word[wordno] |
                    s2_hiz_ptr     ->word[wordno] |
                s1_unknown_ptr ->word[wordno] |
                    s2_unknown_ptr ->word[wordno];

```

Copyright 1989 Logic Modeling Systems

| SOURCE PROGRAM | DATE | PAGE # |
|---|---|---|
| lm1000/ptrnhist.c | 5/23/89 TIME 6:14:48 pm | 11/122 |

LINE # SOURCE TEXT

```
            ident_inconsistent_pins->word[wordno] |=
               (((s1_data_ptr    ->word[wordno] ^ s2_data_ptr    ->word[wordno]) &
                              ident_hiz_and_unk) |
                s1_hiz_ptr     ->word[wordno] ^ s2_hiz_ptr     ->word[wordno] |
                s1_unknown_ptr ->word[wordno] ^ s2_unknown_ptr ->word[wordno]) &
                  ident_outputs_ptr->word[wordno] |
                  ident_ios_ptr->word[wordno]);

            ident_change->word[wordno] |=
               ident_inconsistent_pins->word[wordno];

#ifdef DEBUG
            if (ident_inconsistent_pins->word[wordno]) {
               inconsistent_pins = ident_inconsistent_pins->word[wordno];

               for (bitno = 31; bitno >= 0; --bitno) {
                  if (inconsistent_pins == 0)
                     break;
                  mask = bitno_to_mask[bitno];
                  if (inconsistent_pins & mask) {
                     inconsistent_pins ^= mask;

                     pin_number = CALC_PIN_NUMBER_LONG(unitno, wordno, bitno);

                     DPRINTF(("PN: %d is found inconsistent\n", pin_number));
                  }
               }
               any_inconsistent_pins = TRUE;
            }
#endif

         }

         ++ident_inconsistent_pins;
         ++ident_outputs_ptr;
         ++ident_ios_ptr;
         ++ident_change;
         ++s1_data_ptr;
         ++s1_hiz_ptr;
         ++s1_unknown_ptr;
         ++s2_data_ptr;
         ++s2_hiz_ptr;
         ++s2_unknown_ptr;
   }

#ifdef DEBUG
   if (any_inconsistent_pins == TRUE) {
      DPRINTF(("there are inconsistent pins\n"));
   }
#endif
}

copy_in_pin_changes(instance)
INSTANCE_INFO *instance;
{
   PIN_INFO *pin_info;
   u_short  data_pin_count;
   u_short  eval_pin_count;
   u_short  store_pin_count;
   u_short  i;
   u_short  pin_number;

   data_pin_count = lm_get_short();
   eval_pin_count = lm_get_short();
   store_pir count = lm_get_short();

   for (i = 0; i < data_pin_count; ++i) {
      pin_number = lm_get_short();
      pin_info = &instance->pin_info_table[pin_number];

      if (pin_info->input_pin_is_linked == TRUE) {
         lm_queue_message(ERROR_MSG, "internal error: duplicate pin info from HOST (pinno: %d)",
                          pin_number);
         return(FAILURE);
      }
      else {
         pin_info->sim_time = lm_get_int();
         pin_info->new_raw = lm_get_char();

         /* Map Z0/Z1 to S1 for pullup OR Z0/Z1 to S0 for pulldown. */
         MAP_IN_LOGIC_VALUE(pin_number, pin_info->has_resistor,
                            pin_info->new_raw);
         pin_info->input_pin_is_linked = TRUE;
         pin_info->next_input_pin_index = instance->first_data_pin_index;
         instance->first_data_pin_index = pin_number;
      }
   }

   for (i = 0; i < eval_pin_count; ++i) {
      pin_number = lm_get_short();
      pin_info = &instance->pin_info_table[pin_number];

      if (pin_info->input_pin_is_linked == TRUE) {
         lm_queue_message(ERROR_MSG, "internal error: duplicate pin info from HOST (pinno: %d)",
                          pin_number);
         return(FAILURE);
      }
      else {
         pin_info->sim_time = lm_get_int();
         pin_info->new_raw = lm_get_char();

         /* Map Z0/Z1 to S1 for pullup OR Z0/Z1 to S0 for pulldown. */
         MAP_IN_LOGIC_VALUE(pin_number, pin_info->has_resistor,
                            pin_info->new_raw);
         pin_info->input_pin_is_linked = TRUE;
         pin_info->next_input_pin_index = instance->first_eval_pin_index;
         instance->first_eval_pin_index = pin_number;
      }
   }

   for (i = 0; i < store_pin_count; ++i) {
      pin_number = lm_get_short();
      pin_info = &instance->pin_info_table[pin_number];

      if (pin_info->input_pin_is_linked == TRUE) {
         lm_queue_message(ERROR_MSG, "internal error: duplicate pin info from HOST (pinno: %d)",
                          pin_number);
         return(FAILURE);
      }
      else {
```

Copyright 1989
Logic Modeling Systems

SOURCE PROGRAM lm1000/ptrnhist.c | DATE 5/23/89 | TIME 6:14:48 pm | PAGE # 12/123

LINE # SOURCE TEXT

```
            pin_info->sim_time = lm_get_int();
            pin_info->new_raw = lm_get_char();

            /* Map Z0/Z1 to S1 for pullup OR Z0/Z1 to S0 for pulldown. */
            MAP_IN_LOGIC_VALUE(pin_number, pin_info->has_resistor,
                               pin_info->new_raw);
            pin_info->input_pin_is_linked = TRUE;
            pin_info->next_input_pin_index = instance->first_store_pin_index;
            instance->first_store_pin_index = pin_number;
        }
    }

    return(SUCCESS);
}

copy_out_pin_changes(instance)
INSTANCE_INFO *instance;
{
   /* Copy the IO and OUTPUT changes from the PIN_INFO_TABLE to the
    * network buffer. These changes are linked with first_data_pin_index
    * as the head of the list.
    */

   PIN_INFO *pin_info;
   u_long    output_count_mark;
   short     pin_number;
   short     pin_count = 0;

   output_count_mark = LM_MARK_BUFFER(lm_global_comm_ptr);
   lm_put_short(0);

   pin_number = instance->first_data_pin_index;
   instance->first_data_pin_index = -1;

   while (pin_number != -1) {
      ++pin_count;
      pin_info = &instance->pin_info_table[pin_number];
      pin_info->output_pin_is_linked = FALSE;

      DPRINTF(("chg PN: %d val: %d EPN: %d ",
               pin_number, pin_info->old_filtered,
               pin_info->event_pin_number));
      lm_put_short(pin_number);

      /* Map Z1 to S1 for pullup or Z0 to S0 for pulldown. */
      MAP_OUT_LOGIC_VALUE(pin_number, pin_info->has_resistor,
                          pin_info->direction,
                          pin_info->old_filtered);

      lm_put_char(pin_info->old_filtered);
      lm_put_short(pin_info->event_pin_number);
      lm_put_char(pin_info->delay_type);

      switch (pin_info->delay_type) {
      default:
      case DELAY_TABLE_COMPOSITE:
         DPRINTF(("(%d, %d, %d)",
                  pin_info->min_delay,
                  pin_info->typ_delay, pin_info->max_delay));
         lm_put_int(pin_info->min_delay);
         lm_put_int(pin_info->typ_delay);
         lm_put_int(pin_info->max_delay);
         break;
      case DELAY_TABLE:
         DPRINTF(("idx: %d", pin_info->min_delay));
         lm_put_int(pin_info->min_delay);
         break;
      case MEASURED:
         DPRINTF(("meas: %d-%d", pin_info->min_delay, pin_info->max_delay));
         lm_put_int(pin_info->min_delay);
         lm_put_int(pin_info->max_delay);
         break;
      }
      DPRINTF(("\n"));

      pin_number = pin_info->next_output_pin_index;
   }

   LM_PUT_SHORT_AT_MARK(output_count_mark, lm_global_comm_ptr, pin_count);
}

run_input_bcode(instance)
INSTANCE_INFO *instance;
{
   /* The B-code uses the pin values in OLD_RAW, OLD_FILTERED, NEW_RAW, and
    * NEW_FILTERED, and leave the new modified pin values in OLD_FILTERED.
    * It should maintain the pin change link list.
    */

   /* Since we don't have the B-code yet, just copy the pin values from
    * NEW_RAW to OLD_FILTERED.
    */

   PIN_INFO  *pin_info;
   short pin_number;

   /* Copy the DATA pin changes */
   pin_number = instance->first_data_pin_index;

   while (pin_number != -1) {
      pin_info = &instance->pin_info_table[pin_number];

      pin_info->old_filtered = pin_info->new_raw;

      pin_number = pin_info->next_input_pin_index;
   }

   /* Copy the EVAL pin changes */
   pin_number = instance->first_eval_pin_index;

   while (pin_number != -1) {
      pin_info = &instance->pin_info_table[pin_number];

      pin_info->old_filtered = pin_info->new_raw;

      pin_number = pin_info->next_input_pin_index;
   }

   /* Copy the STORE pin changes */
   pin_number = instance->first_store_pin_index;
```

Copyright 1989
Logic Modeling Systems

SOURCE PROGRAM
lm1000/ptrnhist.c

DATE 5/23/89
TIME 6:14:48 pm

PAGE # 13/124

LINE # SOURCE TEXT

```
    while (pin_number != -1) {
        pin_info = &instance->pin_info_table[pin_number];

        pin_info->old_filtered = pin_info->new_raw;

        pin_number = pin_info->next_input_pin_index;
    }
}

run_output_bcode(instance)
INSTANCE_INFO *instance;
{
    PIN_INFO  *pin_info;
    short pin_number;

    /* Copy the OUTPUT pin changes */
    pin_number = instance->first_data_pin_index;

    while (pin_number != -1) {
        pin_info = &instance->pin_info_table[pin_number];

        pin_info->old_filtered = pin_info->new_raw;

        pin_number = pin_info->next_output_pin_index;
    }
}

copy_initial_values(instance)
INSTANCE_INFO   *instance;
{
    DEVICE_SPEC         *definition;
    UWB_OFFSET          *uwb_ptr;
    PIN_SPEC            *pin_ptr;
    PIN_INFO            *pin_info;
    u_long               output_pin_count_mark;
    u_short              output_pin_count;
    u_short              pinno;
    u_short              pin_count;
    u_char               pin_value;
    u_char               unitno;
    u_char               wordno;
    u_char               bitno;

    definition = instance->definition;

    output_pin_count_mark = LM_MARK_BUFFER(lm_global_conn_ptr);
    lm_put_short(0);   /* dummy out count */
    output_pin_count = 0;
    pin_count = definition->pin_cnt;
    pin_ptr = definition->pin_table;
    for (pinno = 0; pinno < pin_count; ++pinno) {
        switch (pin_ptr->direction) {
        case OUT:
        case IO:
            pin_info = &instance->pin_info_table[pinno];
            lm_put_short(pinno);

            uwb_ptr = &ps_tc_short_offset[pinno];
            unitno = uwb_ptr->unitno;
            wordno = uwb_ptr->wordno;
            bitno  = uwb_ptr->bitno;

            pin_value = read_pin_value(&instance->last_sample_value,
                                       unitno, wordno, bitno);

            /* Map Z1 to S1 for pullup or Z0 to S0 for pulldown. */
            MAP_OUT_LOGIC_VALUE(pinno, pin_info->has_resistor,
                                pin_info->direction,
                                pin_value);

            lm_put_char(pin_value);

            DPRINTF(("initial val PN: %d val: %d\n", pinno, pin_value));

            ++output_pin_count;
            break;

        default:
            break;
        }
        ++pin_ptr;
    }

    LM_PUT_SHORT_AT_MARK(output_pin_count_mark,
                         lm_global_conn_ptr, output_pin_count);
}

switch_to_2_bit_per_pin(instance)
INSTANCE_INFO  *instance;
{
    /* Copy the pattern before the measurement pattern to the measurement
     * pattern and write the HMDEB pattern to the measurement pattern
     * address - 1.
     */
    DAB_INFO *dab_ptr;
    u_long   *source_addr_ptr;
    u_long   *dest_addr_ptr;
    u_long    source_addr;
    u_long    dest_addr;
    u_long    temp;
    u_char    unitno;
    u_char    laneno;
    u_char    total_unit;

    DPRINTF(("inside switch_to_2_bit_per_pin\n"));

#ifdef DONT_FIXIT
    write_pattern(instance,
                  &instance->unit_addr[instance->cur_unit_addr_index][0],
                  instance->hmdeb_loaded);
#else
    source_addr_ptr = &instance->unit_addr[
                          instance->cur_unit_addr_index + 1 & 1][0];
    dest_addr_ptr = &instance->unit_addr[instance->cur_unit_addr_index][0];

    dab_ptr = dab_list[instance->dab_info_index];
    total_unit = dab_ptr->lane_count * dab_ptr->unit_count_per_lane;
    for (unitno = 0; unitno < total_unit; ++unitno) {
        source_addr = source_addr_ptr[unitno];
```

Copyright 1989
Logic Modeling Systems

SOURCE PROGRAM lm1000/ptrnhist.c

DATE 5/23/89 TIME 6:14:48 pm

LINE # SOURCE TEXT

```
            dest_addr = dest_addr_ptr(unitno);

            temp = read_loc_long((u_long *)source_addr);
            write_loc_long((u_long *)dest_addr,temp);

            temp = read_loc_long((u_long *)(source_addr + LANE_SEGMENT_B_OFFSET));
            write_loc_long((u_long *)(dest_addr + LANE_SEGMENT_B_OFFSET),  temp);

            temp = read_loc_long((u_long *)(source_addr + LANE_SEGMENT_C_OFFSET));
            write_loc_long((u_long *)(dest_addr + LANE_SEGMENT_C_OFFSET),  temp);

        }

        write_pattern(instance,
                      &instance->unit_addr[instance->cur_unit_addr_index+1&1][0],
                      instance->hmdenb_loaded);
#endif

    if (grow_pattern(instance) == FAILURE)
        return(FAILURE);

    instance->use_2_bit_per_pin = FALSE;
}
```

Copyright 1989 Logic Modeling Systems

| SOURCE PROGRAM | DATE | PAGE # |
|---|---|---|
| lm1000/saverest.c | 5/23/89 | 1/126 |
| | TIME 6:14:50 pm | |

LINE # SOURCE TEXT

```
/* SCCS_ID: saverest.c rev 1.1, 4/24/89 at 07:53:52     */

#include "device.h"
#include "hardware.h"
#include "eeprom.h"
#include "lmserver.h"
#include "lnetwork.h"
#include "network.h"

send_pattern(user, instance)
USER_INFO      *user;
INSTANCE_INFO  *instance;
{
   /* Copy one device pattern to the output buffer.
    * Return FALSE if there are no more pattern to copy to the buffer,
    * otherwise return TRUE.
    */

   PTRN_BITS_LONGWORD *ptrn_ptr;
   DAB_INFO            *dab_ptr;
   u_long              addr;
   u_long              temp;
   u_char              unit_count;
   u_char              wordno;
   u_char              unitno;

   dab_ptr = dab_list[instance->dab_info_index];

   unit_count = dab_ptr->unit_count;

   switch (user->save_state) {
   case SENT_RECV_NOTHING:

      ptrn_ptr = (PTRN_BITS_LONGWORD *)&instance->ptrn_loaded[0];

      for (unitno = 0; unitno < unit_count; ++unitno) {
         for (wordno = 0; wordno < 3; ++wordno) {
            lm_put_int(ptrn_ptr->word[wordno]);
         }
         ++ptrn_ptr;
      }

      user->save_state = SENT_RECV_PTRN_LOADED;
      break;
   case SENT_RECV_PTRN_LOADED:

      ptrn_ptr = (PTRN_BITS_LONGWORD *)&instance->hmdenb_loaded[0];

      for (unitno = 0; unitno < unit_count; ++unitno) {
         for (wordno = 0; wordno < 3; ++wordno) {
            lm_put_int(ptrn_ptr->word[wordno]);
         }
         ++ptrn_ptr;
      }

      user->save_state = SENT_RECV_HMDENB_LOADED;
      break;
   case SENT_RECV_HMDENB_LOADED:

      ptrn_ptr = (PTRN_BITS_LONGWORD *)&instance->lcychdb_loaded[0];

      for (unitno = 0; unitno < unit_count; ++unitno) {
         for (wordno = 0; wordno < 3; ++wordno) {
            lm_put_int(ptrn_ptr->word[wordno]);
         }
         ++ptrn_ptr;
      }

      user->save_state = SENT_RECV_LCYCHDB_LOADED;
      break;
   case SENT_RECV_LCYCHDB_LOADED:

      ptrn_ptr = (PTRN_BITS_LONGWORD *)&instance->lcycmdb_loaded[0];

      for (unitno = 0; unitno < unit_count; ++unitno) {
         for (wordno = 0; wordno < 3; ++wordno) {
            lm_put_int(ptrn_ptr->word[wordno]);
         }
         ++ptrn_ptr;
      }

      user->save_state = SENT_RECV_LCYCMDB_LOADED;
      break;
   case SENT_RECV_LCYCMDB_LOADED:

      ptrn_ptr = (PTRN_BITS_LONGWORD *)&instance->last_consistent_set[0];

      for (unitno = 0; unitno < unit_count; ++unitno) {
         for (wordno = 0; wordno < 3; ++wordno) {
            lm_put_int(ptrn_ptr->word[wordno]);
         }
         ++ptrn_ptr;
      }

      user->save_state = SENT_RECV_LAST_CONSISTENT_SET;
      break;
   case SENT_RECV_LAST_CONSISTENT_SET:

      ptrn_ptr = (PTRN_BITS_LONGWORD *)&instance->sim_pin_value.data[0];

      for (unitno = 0; unitno < unit_count; ++unitno) {
         for (wordno = 0; wordno < 3; ++wordno) {
            lm_put_int(ptrn_ptr->word[wordno]);
         }
         ++ptrn_ptr;
      }

      user->save_state = SENT_RECV_SIM_PIN_VALUE_DATA;
      break;
   case SENT_RECV_SIM_PIN_VALUE_DATA:

      ptrn_ptr = (PTRN_BITS_LONGWORD *)&instance->sim_pin_value.hiz[0];

      for (unitno = 0; unitno < unit_count; ++unitno) {
         for (wordno = 0; wordno < 3; ++wordno) {
            lm_put_int(ptrn_ptr->word[wordno]);
         }
         ++ptrn_ptr;
      }
```

Copyright 1989
Logic Modeling Systems

| SOURCE PROGRAM | DATE | 5/23/89 | PAGE # |
|---|---|---|---|
| lm1000/saverest.c | TIME | 6:14:50 pm | 2/127 |

LINE # SOURCE TEXT

```
      user->save_state = SENT_RECV_SIM_PIN_VALUE_HIZ;
      break;
    case SENT_RECV_SIM_PIN_VALUE_HIZ:

      ptrn_ptr = (PTRN_BITS_LONGWORD *)&instance->sim_pin_value.unknown[0];

      for (unitno = 0; unitno < unit_count; ++unitno) {
        for (wordno = 0; wordno < 3; ++wordno) {
          lm_put_int(ptrn_ptr->word[wordno]);
        }
        ++ptrn_ptr;
      }

      user->save_state = SENT_RECV_SIM_PIN_VALUE_UNK;
      break;
    case SENT_RECV_SIM_PIN_VALUE_UNK:

      ptrn_ptr = (PTRN_BITS_LONGWORD *)&instance->sim_pin_value.soft[0];

      for (unitno = 0; unitno < unit_count; ++unitno) {
        for (wordno = 0; wordno < 3; ++wordno) {
          lm_put_int(ptrn_ptr->word[wordno]);
        }
        ++ptrn_ptr;
      }

      user->save_state = SENT_RECV_SIM_PIN_VALUE_SOFT;
      break;
    case SENT_RECV_SIM_PIN_VALUE_SOFT:

      ptrn_ptr = (PTRN_BITS_LONGWORD *)&instance->last_sample_value.data[0];

      for (unitno = 0; unitno < unit_count; ++unitno) {
        for (wordno = 0; wordno < 3; ++wordno) {
          lm_put_int(ptrn_ptr->word[wordno]);
        }
        ++ptrn_ptr;
      }

      user->save_state = SENT_RECV_LAST_SAMPLE_VALUE_DATA;
      break;
    case SENT_RECV_LAST_SAMPLE_VALUE_DATA:

      ptrn_ptr = (PTRN_BITS_LONGWORD *)&instance->last_sample_value.hiz[0];

      for (unitno = 0; unitno < unit_count; ++unitno) {
        for (wordno = 0; wordno < 3; ++wordno) {
          lm_put_int(ptrn_ptr->word[wordno]);
        }
        ++ptrn_ptr;
      }

      user->save_state = SENT_RECV_LAST_SAMPLE_VALUE_HIZ;
      break;
    case SENT_RECV_LAST_SAMPLE_VALUE_HIZ:

      ptrn_ptr = (PTRN_BITS_LONGWORD *)&instance->last_sample_value.unknown[0];

      for (unitno = 0; unitno < unit_count; ++unitno) {
        for (wordno = 0; wordno < 3; ++wordno) {
          lm_put_int(ptrn_ptr->word[wordno]);
        }
        ++ptrn_ptr;
      }

      user->save_state = SENT_RECV_LAST_SAMPLE_VALUE_UNK;
      break;
    case SENT_RECV_LAST_SAMPLE_VALUE_UNK:

      ptrn_ptr = (PTRN_BITS_LONGWORD *)&instance->last_sample_value.soft[0];

      for (unitno = 0; unitno < unit_count; ++unitno) {
        for (wordno = 0; wordno < 3; ++wordno) {
          lm_put_int(ptrn_ptr->word[wordno]);
        }
        ++ptrn_ptr;
      }

      user->save_state = SENT_RECV_LAST_SAMPLE_VALUE_SOFT;
      break;
    case SENT_RECV_LAST_SAMPLE_VALUE_SOFT:
      if (user->pattern_to_send_count == 0) {
        user->save_state = SENT_RECV_PATTERN;
        return(FALSE);
      }

      for (unitno = 0; unitno < unit_count; ++unitno) {
        user->last_unit_sent_addr[unitno] =
          instance->first_user_ptrn_unit_addr[unitno];

        addr = user->last_unit_sent_addr[unitno];

        temp = read_loc_long((u_long *)addr);

        lm_put_int(temp);

        temp = read_loc_long((u_long *)(addr + LANE_SEGMENT_B_OFFSET));

        lm_put_int(temp);

        temp = read_loc_long((u_long *)(addr + LANE_SEGMENT_C_OFFSET));

        lm_put_int(temp);

      }

      increment_unit_addr(user->last_unit_sent_addr,
                          unit_count, dab_ptr->unit_count_per_lane);

      user->pattern_to_send_count -= dab_ptr->unit_count_per_lane;

      user->save_state = SENT_RECV_PATTERN;
      break;
    case SENT_RECV_PATTERN:
      if (user->pattern_to_send_count == 0) {
        return(FALSE);
      }

      for (unitno = 0; unitno < unit_count; ++unitno) {
        addr = user->last_unit_sent_addr[unitno];
```

Copyright 1989
Logic Modeling Systems

SOURCE PROGRAM
lm1000/saverest.c

DATE 5/23/89
TIME 6:14:50 pm

PAGE # 3/128

LINE # SOURCE TEXT

```
        temp = read_loc_long((u_long *)addr);

        lm_put_int(temp);

        temp = read_loc_long((u_long *)([illegible] + LANE_SEGMENT_B_OFFSET));

        lm_put_int(temp);

        temp = read_loc_long((u_long *)(addr + LANE_SEGMENT_C_OFFSET));

        lm_put_int(temp);

      }

      increment_unit_addr(user->last_unit_sent_addr, unit_count,
                          dab_ptr->unit_count_per_lane);

      user->pattern_to_send_count -= dab_ptr->unit_count_per_lane;

      break;
    default:
      return(FALSE);
    }

    return(TRUE);
}

restore_inst_pattern(instance, unit_count)
INSTANCE_INFO *instance;
u_short       unit_count;
{
    DAB_INFO          *dab_ptr;
    PTRN_BITS_LONGWORD *ptrn_ptr;
    PTRN_BITS          temp_ptrn[MAX_UNIT_COUNT];
    u_char             unitno;
    u_char             wordno;

    dab_ptr = dab_list[instance->dab_info_index];

    switch (instance->restore_state) {
    case SENT_RECV_NOTHING:
      ptrn_ptr = (PTRN_BITS_LONGWORD *)&instance->ptrn_loaded[0];

      for (unitno = 0; unitno < unit_count; ++unitno) {
        for (wordno = 0; wordno < 3; ++wordno) {
          ptrn_ptr->word[wordno] = lm_get_int();
        }

        fix_pel_ctl_word(ptrn_ptr, unitno, dab_ptr);

        ++ptrn_ptr;
      }

      instance->restore_state = SENT_RECV_PTRN_LOADED;
      break;
    case SENT_RECV_PTRN_LOADED:
      ptrn_ptr = (PTRN_BITS_LONGWORD *)&instance->hmdenb_loaded[0];

      for (unitno = 0; unitno < unit_count; ++unitno) {
        for (wordno = 0; wordno < 3; ++wordno) {
          ptrn_ptr->word[wordno] = lm_get_int();
        }

        fix_pel_ctl_word(ptrn_ptr, unitno, dab_ptr);

        ++ptrn_ptr;
      }

      instance->restore_state = SENT_RECV_HMDENB_LOADED;
      break;
    case SENT_RECV_HMDENB_LOADED:
      ptrn_ptr = (PTRN_BITS_LONGWORD *)&instance->lcychdb_loaded[0];

      for (unitno = 0; unitno < unit_count; ++unitno) {
        for (wordno = 0; wordno < 3; ++wordno) {
          ptrn_ptr->word[wordno] = lm_get_int();
        }

        fix_pel_ctl_word(ptrn_ptr, unitno, dab_ptr);

        ++ptrn_ptr;
      }

      instance->restore_state = SENT_RECV_LCYCHDB_LOADED;
      break;
    case SENT_RECV_LCYCHDB_LOADED:
      ptrn_ptr = (PTRN_BITS_LONGWORD *)&instance->lcycmdb_loaded[0];

      for (unitno = 0; unitno < unit_count; ++unitno) {
        for (wordno = 0; wordno < 3; ++wordno) {
          ptrn_ptr->word[wordno] = lm_get_int();
        }

        fix_pel_ctl_word(ptrn_ptr, unitno, dab_ptr);

        ++ptrn_ptr;
      }

      instance->restore_state = SENT_RECV_LCYCMDB_LOADED;
      break;
    case SENT_RECV_LCYCMDB_LOADED:
      ptrn_ptr = (PTRN_BITS_LONGWORD *)&instance->last_consistent_set[0];

      for (unitno = 0; unitno < unit_count; ++unitno) {
        for (wordno = 0; wordno < 3; ++wordno) {
          ptrn_ptr->word[wordno] = lm_get_int();
        }

        fix_pel_ctl_word(ptrn_ptr, unitno, dab_ptr);

        ++ptrn_ptr;
      }

      instance->restore_state = SENT_RECV_LAST_CONSISTENT_SET;
      break;
    case SENT_RECV_LAST_CONSISTENT_SET:
      ptrn_ptr = (PTRN_BITS_LONGWORD *)&instance->sim_pin_value.data[0];

      for (unitno = 0; unitno < unit_count. ++unitno) {
```

Copyright 1989
Logic Modeling Systems

SOURCE TEXT

```
         for (wordno = 0; wordno < 3; ++wordno) {
            ptrn_ptr->word[wordno] = lm_get_int();
         }
         ++ptrn_ptr;
      }

      instance->restore_state = SENT_RECV_SIM_PIN_VALUE_DATA;
      break;
   case SENT_RECV_SIM_PIN_VALUE_DATA:
      ptrn_ptr = (PTRN_BITS_LONGWORD *)&instance->sim_pin_value.hiz[0];

      for (unitno = 0; unitno < unit_count; ++unitno) {
         for (wordno = 0; wordno < 3; ++wordno) {
            ptrn_ptr->word[wordno] = lm_get_int();
         }
         ++ptrn_ptr;
      }

      instance->restore_state = SENT_RECV_SIM_PIN_VALUE_HIZ;
      break;
   case SENT_RECV_SIM_PIN_VALUE_HIZ:
      ptrn_ptr = (PTRN_BITS_LONGWORD *)&instance->sim_pin_value.unknown[0];

      for (unitno = 0; unitno < unit_count; ++unitno) {
         for (wordno = 0; wordno < 3; ++wordno) {
            ptrn_ptr->word[wordno] = lm_get_int();
         }
         ++ptrn_ptr;
      }

      instance->restore_state = SENT_RECV_SIM_PIN_VALUE_UNK;
      break;
   case SENT_RECV_SIM_PIN_VALUE_UNK:
      ptrn_ptr = (PTRN_BITS_LONGWORD *)&instance->sim_pin_value.soft[0];

      for (unitno = 0; unitno < unit_count; ++unitno) {
         for (wordno = 0; wordno < 3; ++wordno) {
            ptrn_ptr->word[wordno] = lm_get_int();
         }
         ++ptrn_ptr;
      }

      instance->restore_state = SENT_RECV_SIM_PIN_VALUE_SOFT;
      break;
   case SENT_RECV_SIM_PIN_VALUE_SOFT:
      ptrn_ptr = (PTRN_BITS_LONGWORD *)&instance->last_sample_value.data[0];

      for (unitno = 0; unitno < unit_count; ++unitno) {
         for (wordno = 0; wordno < 3; ++wordno) {
            ptrn_ptr->word[wordno] = lm_get_int();
         }
         ++ptrn_ptr;
      }

      instance->restore_state = SENT_RECV_LAST_SAMPLE_VALUE_DATA;
      break;
   case SENT_RECV_LAST_SAMPLE_VALUE_DATA:
      ptrn_ptr = (PTRN_BITS_LONGWORD *)&instance->last_sample_value.hiz[0];

      for (unitno = 0; unitno < unit_count; ++unitno) {
         for (wordno = 0; wordno < 3; ++wordno) {
            ptrn_ptr->word[wordno] = lm_get_int();
         }
         ++ptrn_ptr;
      }

      instance->restore_state = SENT_RECV_LAST_SAMPLE_VALUE_HIZ;
      break;
   case SENT_RECV_LAST_SAMPLE_VALUE_HIZ:
      ptrn_ptr = (PTRN_BITS_LONGWORD *)&instance->last_sample_value.unknown[0];

      for (unitno = 0; unitno < unit_count; ++unitno) {
         for (wordno = 0; wordno < 3; ++wordno) {
            ptrn_ptr->word[wordno] = lm_get_int();
         }
         ++ptrn_ptr;
      }

      instance->restore_state = SENT_RECV_LAST_SAMPLE_VALUE_UNK;
      break;
   case SENT_RECV_LAST_SAMPLE_VALUE_UNK:
      ptrn_ptr = (PTRN_BITS_LONGWORD *)&instance->last_sample_value.soft[0];

      for (unitno = 0; unitno < unit_count; ++unitno) {
         for (wordno = 0; wordno < 3; ++wordno) {
            ptrn_ptr->word[wordno] = lm_get_int();
         }
         ++ptrn_ptr;
      }

      instance->restore_state = SENT_RECV_LAST_SAMPLE_VALUE_SOFT;
      break;
   case SENT_RECV_LAST_SAMPLE_VALUE_SOFT:
      ptrn_ptr = (PTRN_BITS_LONGWORD *)&temp_ptrn[0];

      for (unitno = 0; unitno < unit_count; ++unitno) {
         for (wordno = 0; wordno < 3; ++wordno) {
            ptrn_ptr->word[wordno] = lm_get_int();
         }

         fix_pel_ctl_word(ptrn_ptr, unitno, dab_ptr);

         ++ptrn_ptr;
      }

      write_pattern(instance,
                    &instance->unit_addr[instance->cur_unit_addr_index][0],
                    (PTRN_BITS *)&temp_ptrn[0]);

      if (grow_pattern(instance) == FAILURE)
         return(FAILURE);

      instance->restore_state = SENT_RECV_PATTERN;
      break;
   case SENT_RECV_PATTERN:
      ptrn_ptr = (PTRN_BITS_LONGWORD *)&temp_ptrn[0];

      for (unitno = 0; unitno < unit_count; ++unitno) {
         for (wordno = 0; wordno < 3; ++wordno) {
            ptrn_ptr->word[wordno] = lm_get_int();
```

Copyright 1989
Logic Modeling Systems

SOURCE PROGRAM lm1000/saverest.c

DATE 5/23/89 TIME 6:14:50 pm

PAGE # 5/130

LINE # SOURCE TEXT

```
            }

            fix_pel_ctl_word(ptrn_ptr, unitno, dab_ptr);

            ++ptrn_ptr;
        }

        write_pattern(instance,
                      &instance->unit_addr[instance->cur_unit_addr_index][0],
                      (PTRN_BITS *)&temp_ptrn[0]);

        if (grow_pattern(instance) == FAILURE)
            return(FAILURE);

        break;
    default:
        break;
    }

    return(SUCCESS);
}
```

Copyright 1989
Logic Modeling Systems

| SOURCE PROGRAM | DATE | PAGE # |
|---|---|---|
| lm1000/timer.c | 5/23/89 | 1/131 |
| | TIME 6:14:50 pm | |

LINE # SOURCE TEXT

```
/* SCCS_ID: timer.c rev 3.1, 4/24/89 at 07:53:56     */

#ifndef MODELER

#inclu'   'gnal.h>
#include ../s/time.h>
#include "common.h"

static  u_long  lm_tick = 0;

static
handle_SIGALRM()
{
   ++lm_tick;
}

static  struct itimerval initial_value = { { 0, 20000}, {0, 20000} };

inittimer()
{
   struct itimerval oldval;

   signal(SIGVTALRM, handle_SIGALRM);

   setitimer(ITIMER_VIRTUAL, &initial_value, &oldval);

}

lm_time()
{
   return(lm_tick);
}

lm_delay(delay)
u_long delay;
{
   /* "delay" is msec */

   u_long start;
   u_long tick;

   tick = delay / 20 + 1;

   start = lm_time();
   while ((lm_time() - start) < tick)
       ;

}
#endif
```

Copyright 1989
Logic Modeling Systems

| SOURCE PROGRAM | DATE | PAGE # |
| --- | --- | --- |
| lm1000/tmeas.c | 5/23/89 | 1/132 |
| | TIME 6:14:50 pm | |

LINE # SOURCE TEXT

```
/* SCCS_ID: tmeas.c rev 3.4, 5/9/89 at 17:35:09     */

#include "device.h"
#include "message.h"
#include "hardware.h"
#include "eeprom.h"
#include "lmserver.h"
#include "protams.h"

#define MAGIC_0IN_0OUT_DELAY      400
#define MAGIC_0IN_1OUT_DELAY     1200
#define MAGIC_1IN_0OUT_DELAY    -1000
#define MAGIC_1IN_1OUT_DELAY    -1000

#define MAX_PIN_NAME_LIST        128

#ifdef DEBUG
#define SWEEP_RANGE  8
#else
#define SWEEP_RANGE  8
#endif

#define TRY_COUNT    1

/* The following is used to accumulate all changes from eval/store pins */
PTRN_BITS_LONGWORD    gbl_tm_ident_change[MAX_UNIT_COUNT];
PTRN_BITS_LONGWORD    gbl_tm_ident_inconsistent_pins[MAX_UNIT_COUNT];
PTRN_BITS             gnl_tm_ident_data_change[MAX_UNIT_COUNT];

#ifdef DEBUG
extern u_char         loop_till_key;
extern u_long         debug_key;
extern u_long         debug_char;

#endif

/* ARGSUSED */
tm_evaluate_1_bit_per_pin(user, def_ptr, instance,
                          ident_inconsistent_pins,
                          steady_state_result,
                          temp_steady_state_result,
                          ident_change,
                          changed_dac)
USER_INFO             *user;
DEVICE_SPEC           *def_ptr;
INSTANCE_INFO         *instance;
PTRN_BITS_LONGWORD    *ident_inconsistent_pins;
FULL_VALUE            *steady_state_result;
FULL_VALUE            *temp_steady_state_result;
PTRN_BITS_LONGWORD    *ident_change;
u_char                *changed_dac;
{
    PIN_INFO              *pin_info;
    EXTRA_DEVICE_SPEC     *extra_def_ptr;
    PTRN_BITS              consistent_set[MAX_UNIT_COUNT];
    PTRN_BITS              setup_ptrs[MAX_UNIT_COUNT];
    PTRN_BITS              lcychdb[MAX_UNIT_COUNT];
    PTRN_BITS              lcycmdb[MAX_UNIT_COUNT];
    PTRN_BITS_LONGWORD    *lcychdb_ptr;
    PTRN_BITS_LONGWORD    *lcycmdb_ptr;
    PTRN_BITS_LONGWORD    *ident_ios_ptr;
    PTRN_BITS_LONGWORD    *inst_lcychdb_ptr;
    PTRN_BITS_LONGWORD    *inst_lcycmdb_ptr;
    DAB_INFO              *dab_ptr;
    PIN_SPEC              *pin_def;
    UWB_OFFSET            *uwb_ptr;
    u_long                 inst_block_number[MAX_LANE_COUNT];
    u_long                 next_ptrn_addr[MAX_UNIT_COUNT];
    LANE_ADDR_INFO         last_unit_addr[MAX_LANE_COUNT];
    u_long                 seq_end_addr[MAX_LANE_COUNT];
    u_long                 timeout;
    short                  pin_number;
    u_short                eval_index = 0;
    u_char                 pin_value;
    u_char                 old_pin_value;
    u_char                 allocated_blocks;
    u_char                 junk1;
    u_char                 junk2;
    u_char                 total_unit;
    u_char                 unitno;
    u_char                 wordno;
    u_char                 bitno;
    u_char                 evaluation_count = 0;
    u_char                 old_val;
    u_char                 i;
    u_char                 any_driving_to_z;
    u_char                 measure;

    DPRINTF(("inside tm_evaluate_1_bit_per_pin\n"));

    /**********************************************************************
     * The timeout value is set with the assumption that we are running at
     * 150KHz (~8us period).
     *      timeout = pattern play time  + 1 second for feedback
     *              = pattern_count * 8 microsec + 125000 * 8 microsec
     *              = (pattern_count + 125000) * 8 microsec
     *              = (pattern_count + 125000) * 8 / 1000  millisec
     *              = (pattern_count + 125000) >> 7;
     **********************************************************************/
    timeout = (instance->pattern_count + PTRN_COUNT_FUDGE_FACTOR) >> 7;

    extra_def_ptr = (EXTRA_DEVICE_SPEC *) def_ptr->extra_data;
    dab_ptr = dab_list[instance->dab_info_index];
    total_unit = dab_ptr->unit_count;

    clear_ptrn_bits((char *) gbl_tm_ident_change, total_unit);
    clear_ptrn_bits((char *) gbl_tm_ident_inconsistent_pins, total_unit);
    clear_ptrn_bits((char *) gbl_tm_ident_data_change, total_unit);

    /*
     * We don't need to write the LCYCHDB and LCYCMDB patterns here as the
     * evaluate_1_bit_per_pin() because these will always be written below.
     */

    init_tm_pin_info_table(gbl_tm_pin_info_table, def_ptr->pin_cnt);

    if (get_next_pattern_addr(instance, next_ptrn_addr,
                              last_unit_addr, &allocated_blocks) == FAILURE)
        return (FAILURE);
```

Copyright 1989 Logic Modeling Systems

| SOURCE PROGRAM | DATE | PAGE # |
| --- | --- | --- |
| lm1000/tmeas.c | 5/23/89 TIME 6:14:50 pm | 2/133 |

LINE # SOURCE TEXT

```
    calculate_consistent_set(instance, def_ptr, setup_ptrs);

    /* Soft drive I/O pins during measurement pattern */
    lcychdb_ptr = (PTRN_BITS_LONGWORD *) lcychdb;
    lcycmdb_ptr = (PTRN_BITS_LONGWORD *) lcycmdb;
    inst_lcychdb_ptr = (PTRN_BITS_LONGWORD *) instance->lcychdb_loaded;
    inst_lcycmdb_ptr = (PTRN_BITS_LONGWORD *) instance->lcycmdb_loaded;
    ident_ios_ptr = extra_def_ptr->ident_ios;

    for (unitno = 0; unitno < total_unit; ++unitno) {
       for (wordno = 0; wordno < 3; ++wordno) {

          lcychdb_ptr->word[wordno] =
            inst_lcychdb_ptr->word[wordno] | ident_ios_ptr->word[wordno];

          lcycmdb_ptr->word[wordno] =
            inst_lcycmdb_ptr->word[wordno] | ident_ios_ptr->word[wordno];
       }

       ++lcychdb_ptr;
       ++lcycmdb_ptr;
       ++inst_lcychdb_ptr;
       ++inst_lcycmdb_ptr;
       ++ident_ios_ptr;
    }

    pin_number = instance->first_data_pin_index;
    instance->first_data_pin_index = -1;

    while (pin_number != -1) {

       uwb_ptr = &pn_to_short_offset[pin_number];
       unitno = uwb_ptr->unitno;
       wordno = uwb_ptr->wordno;
       bitno = uwb_ptr->bitno;

       set_ptrn_bit(&gbl_tm_ident_data_change[unitno], wordno, bitno);

       pin_def = &def_ptr->pin_table[pin_number];
       pin_info = &instance->pin_info_table[pin_number];
       pin_info->input_pin_is_linked = FALSE;
       pin_value = pin_info->old_filtered;

       /* Keep track of pin changes to build normal pattern sequence. */
       set_pin_value(&instance->sim_pin_value,
                     unitno, wordno, bitno, pin_value);

       set_measurement_pattern(instance, pin_def,
                               unitno, wordno, bitno, pin_value,
                               &junk1, &junk2);

       set_pattern(instance, pin_def,
                   setup_ptrs, unitno, wordno, bitno, pin_value);

       pin_number = pin_info->next_input_pin_index;
    }

    /* write the setup pattern */
    write_pattern(instance,
                  &instance->unit_addr[instance->cur_unit_addr_index][0],
                  setup_ptrs);

    /* Process the eval pins */
    for (pin_number = instance->first_eval_pin_index,
         instance->first_eval_pin_index = -1;
         pin_number != -1;
         pin_number = pin_info->next_input_pin_index) {

       /* Note that eval pin can only have DNRZ format. */

       uwb_ptr = &pn_to_short_offset[pin_number];
       unitno = uwb_ptr->unitno;
       wordno = uwb_ptr->wordno;
       bitno = uwb_ptr->bitno;

       pin_def = &def_ptr->pin_table[pin_number];
       pin_info = &instance->pin_info_table[pin_number];
       pin_info->input_pin_is_linked = FALSE;
       pin_value = pin_info->old_filtered;

       /* Keep track of pin changes to build normal pattern sequence. */
       set_pin_value(&instance->sim_pin_value,
                     unitno, wordno, bitno, pin_value);

       set_measurement_pattern(instance, pin_def,
                               unitno, wordno, bitno, pin_value,
                               &junk1, &junk2);

       old_val = read_ptrn_bit(&setup_ptrs[unitno], wordno, bitno);

       set_pattern(instance, pin_def,
                   setup_ptrs, unitno, wordno, bitno, pin_value);

       if (old_val == read_ptrn_bit(&setup_ptrs[unitno], wordno, bitno)) {

          /*
           * If the pin value in the last consistent set is equal to the pin
           * value in measurement pattern, then we cannot measure this
           * transition.
           */
          DPRINTF(("cannot measure eval PN: %d\n", pin_number));
          continue;
       }
       if (eval_index < MAX_EVAL_CHANGES) {
          gbl_eval_pin_number[eval_index] = (u_short) pin_number;
          gbl_eval_pin_value[eval_index++] = pin_value;
       } else {
          lm_queue_message(WARNING_MSG, "internal error: not enough room to store eval changes, delay number might be incorrect");
       }

       if (pin_def->direction == IO) {
          reset_ptrn_bit(&lcychdb[unitno], wordno, bitno);
          reset_ptrn_bit(&lcycmdb[unitno], wordno, bitno);
       }
    }

    if (eval_index != 0) {
       ++evaluation_count;
       write_pattern(instance, &instance->lcychdb_addr[0], lcychdb);
       write_pattern(instance, &instance->lcycmdb_addr[0], lcycmdb);
```

Copyright 1989
Logic Modeling Systems

| SOURCE PROGRAM | DATE | TIME | PAGE # |
|---|---|---|---|
| lm1000/tmeas.c | 5/23/89 | 6:14:50 pm | 3/134 |

SOURCE TEXT

```
   mask_off_output(instance, setup_ptrn);
   write_pattern(instance, next_ptrn_addr, setup_ptrn);


   set_seq_end_bit(instance,
                   last_unit_addr,
                   allocated_blocks,
                   seq_end_addr,
                   inst_block_number);

   if (measure_delay(def_ptr, instance, timeout,
                     EVAL_EVENT, gbl_eval_pin_number, eval_index,
                     steady_state_result,
                     ident_inconsistent_pins,
                     temp_steady_state_result,
                     gbl_tm_pin_info_table,
                     ident_change, changed_dac) == FAILURE) {
      remove_seq_end_bit(instance, seq_end_addr, inst_block_number);

      if (allocated_blocks == TRUE)
         return_last_blocks(instance);

      return (FAILURE);
   }
   remove_seq_end_bit(instance, seq_end_addr, inst_block_number);

   /* Soft drive the IO EVAL pins for next evaluation */
   for (i = 0; i < eval_index; ++i) {
      pin_number = gbl_eval_pin_number[i];
      if (def_ptr->pin_table[pin_number].direction == IO) {

         uwb_ptr = &pm_to_short_offset[pin_number];
         unitno = uwb_ptr->unitno;
         wordno = uwb_ptr->wordno;
         bitno = uwb_ptr->bitno;

         set_ptrn_bit(&lcychdb[unitno], wordno, bitno);
         set_ptrn_bit(&lcycmdb[unitno], wordno, bitno);
      }
   }

   /* Restore the sequence to normal state. */
   write_pattern(instance,
                 &instance->lcychdb_addr[0],
                 instance->lcychdb_loaded);
   write_pattern(instance,
                 &instance->lcycmdb_addr[0],
                 instance->lcycmdb_loaded);
   write_pattern(instance,
                 &instance->unit_addr[instance->cur_unit_addr_index][0],
                 instance->ptrn_loaded);

   /*
    * Run normal pattern history and check that the result obtained is the
    * same as with timing measurement pattern history.
    */

   set_seq_end_bit(instance,
                   instance->lane_addr,
                   FALSE,
                   seq_end_addr,
                   inst_block_number);


   if (play_ptrn_seq(instance, timeout, changed_dac) == FAILURE) {
      remove_seq_end_bit(instance, seq_end_addr, inst_block_number);

      if (allocated_blocks == TRUE)
         return_last_blocks(instance);

      return (FAILURE);
   }
   if (get_result(def_ptr, instance, ident_change,
                  EVAL_EVENT, gbl_eval_pin_number,
                  eval_index, &any_driving_to_z) == FAILURE) {
      remove_seq_end_bit(instance, seq_end_addr, inst_block_number);

      if (allocated_blocks == TRUE)
         return_last_blocks(instance);

      return (FAILURE);
   }
   check_consistency2(instance,
                      &instance->last_sample_value,
                      steady_state_result,
                      ident_inconsistent_pins,
                      ident_change,
                      total_unit);

   for (i = 0; i < eval_index; ++i) {
      pin_number = gbl_eval_pin_number[i];
      if (def_ptr->pin_table[pin_number].direction == IO) {

         uwb_ptr = &pm_to_short_offset[pin_number];
         unitno = uwb_ptr->unitno;
         wordno = uwb_ptr->wordno;
         bitno = uwb_ptr->bitno;

         reset  ~rn_bit(&ident_inconsistent_pins[unitno], wordno, bitno);

         /*
          * For timing measurement the eval pins will be sampled as driving
          * (because we turn on LCYCMDB) and sampled as Z for regular
          * pattern history, and therefore the ident_change will be set for
          * these eval pins. These are bogus changes so we need to reset the
          * ident_change bit for these pins.
          */
         reset_ptrn_bit(&ident_change[unitno], wordno, bitno);
      }
   }

   for (i = 0; i < eval_index; ++i) {

      /*
       * Get the table delays for all pins. Some of the delays will be
       * overrided later if it turned out that the pin delays can be
       * measured. This get_delay() loop has to be after we reset the
       * ident_change bit for the eval pins because otherwise we would see
       * unspec delays from one eval pin to another eval pin.
       */
```

Copyright 1989
Logic Modeling Systems

| SOURCE PROGRAM | DATE | PAGE # |
|---|---|---|
| lm1000/tmeas.c | 5/23/89 | 4/135 |
| | TIME 6:14:50 pm | |

LINE # SOURCE TEXT

```
        get_delay(def_ptr, instance, ident_change,
                  ident_inconsistent_pins,
                  gbl_eval_pin_number[i], gbl_eval_pin_value[i]);
      }

      /* Accumulate the pin changes in gbl_tm_ident_change.
      accumulate_ident_pins(ident_change, gbl_tm_ident_change, total_unit);

      copy_ptrn_bits((char *) ident_inconsistent_pins,
                     (char *) gbl_tm_ident_inconsistent_pins,
                     total_unit);

      add_inconsistent_pins(instance, ident_inconsistent_pins);

      clear_ptrn_bits((char *) ident_change, total_unit);
      clear_ptrn_bits((char *) ident_inconsistent_pins, total_unit);


      if (any_driving_to_z == TRUE) {

         /*
          * Use 2 bits per pin --> hard drive those IO STORE pins which change
          * from driving to Z.
          */

         if (def_ptr->device_type == PUBLIC) {

            /*
             * Write HMDEMB_LOADED to previous pattern address. For PRIVATE
             * devices we don't have to do anything since HMDEMB will always be
             * written when we do the next evaluation.
             */
            write_pattern(instance,
                          &instance->unit_addr[
                                instance->cur_unit_addr_index + 1 & 1][0],
                          instance->hmdemb_loaded);

            write_pattern(instance,
                       &instance->unit_addr[instance->cur_unit_addr_index][0],
                          instance->last_consistent_set);

            if (grow_pattern(instance) == FAILURE)
               return (FAILURE);
         }
      }
      remove_seq_end_bit(instance, seq_end_addr, inst_block_number);

   }
   if (allocated_blocks == TRUE)
      return_last_blocks(instance);

   /* Process the STORE pins */
   for (pin_number = instance->first_store_pin_index,
        instance->first_store_pin_index = -1;
        pin_number != -1;
        pin_number = pin_info->next_input_pin_index) {

      gbl_eval_pin_number[0] = (u_short) pin_number;

      uwb_ptr = &pn_to_short_offset[pin_number];
      unitno = uwb_ptr->unitno;
      wordno = uwb_ptr->wordno;
      bitno = uwb_ptr->bitno;

      pin_info = &instance->pin_info_table[pin_number];
      pin_def = &def_ptr->pin_table[pin_number];

      pin_info->input_pin_is_linked = FALSE;
      pin_value = pin_info->old_filtered;

      if (pin_def->direction == IN) {
         /* INPUT STORE change */

         old_pin_value = read_pin_value(&instance->sim_pin_value,
                                        unitno, wordno, bitno);

         set_pin_value(&instance->sim_pin_value,
                       unitno, wordno, bitno, pin_value);

         switch (pin_def->clk_format) {
            case NRZ:
            case DNRZ:

               if (input_pin_transition(old_pin_value, pin_value,
                            pin_info->uninitialized_pin) == NO_TRANSITION) {

                  /*
                   * This is an error because the host should have filtered the
                   * transition. On second thought it is NOT an error because
                   * the host only filters transitions to exactly the same
                   * value.
                   */
                  DPRINTF(("No transition on IN STORE DNRZ pin %s\n",
                           pin_def->pin_name));
                  continue;
               }
               if (pin_value & (LOGIC_0 | LOGIC_S0 | LOGIC_Z0))
                  reset_ptrn_bit(&instance->ptrn_loaded[unitno], wordno, bitno);
               else
                  set_ptrn_bit(&instance->ptrn_loaded[unitno], wordno, bitno);

               break;

            case R1:
               if (input_pin_transition(old_pin_value, pin_value,
                            pin_info->uninitialized_pin) != RISE_TRANSITION) {
                  DPRINTF(("No transition on IN STORE R1 pin %s\n",
                           pin_def->pin_name));
                  continue;
               }
               /* Disable the R1 clock on the measurement pattern (ptrn_loaded) */
               set_ptrn_bit(&instance->ptrn_loaded[unitno], wordno, bitno);

               break;
            case R0:
               if (input_pin_transition(old_pin_value, pin_value,
                            pin_info->uninitialized_pin) != FALL_TRANSITION) {
                  DPRINTF(("No transition on IN STORE R0 pin %s\n",
                           pin_def->pin_name));
                  continue;
```

Copyright 1989 Logic Modeling Systems

LINE # SOURCE TEXT

```
                }
                /* Disable the R1 clock on the measurement pattern (ptrn_loaded) */
                reset_ptrn_bit(&instance->ptrn_loaded[unitno], wordno, bitno);

                break;
             default:
                lm_queue_message(ERROR_MSG, "internal error: illegal pin type in device.h");
                continue;
          }
       } else {
          /* IO STORE change */
          /* Note: IO store pin can only have DNRZ format */

          old_pin_value = read_pin_value(&instance->last_sample_value,
                                         unitno, wordno, bitno);

          set_pin_value(&instance->sim_pin_value,
                        unitno, wordno, bitno, pin_value);

          if (io_pin_transition(old_pin_value, pin_value,
                                pin_info->uninitialized_pin) == NO_TRANSITION) {
             DPRINTF(("No transition on IO STORE pin %s\n", pin_def->pin_name));
             continue;
          }
          set_measurement_pattern(instance, pin_def,
                                  unitno, wordno, bitno, pin_value,
                                  &junk1, &junk2);
       }

       if (instance->use_2_bit_per_pin) {
          switch_to_2_bit_per_pin(instance);
       }

       measure = TRUE;
       switch (pin_def->clk_format) {
          case R1:
             write_pattern(instance,
                   &instance->unit_addr[instance->cur_unit_addr_index][0],
                      setup_ptrn);

             if (grow_pattern(instance) == FAILURE)
                return (FAILURE);

             reset_ptrn_bit(&setup_ptrn[unitno], wordno, bitno);
             break;
          case R0:
             write_pattern(instance,
                   &instance->unit_addr[instance->cur_unit_addr_index][0],
                      setup_ptrn);

             if (grow_pattern(instance) == FAILURE)
                return (FAILURE);

             set_ptrn_bit(&setup_ptrn[unitno], wordno, bitno);
             break;
          default:

             old_val = read_ptrn_bit(&setup_ptrn[unitno], wordno, bitno);

             write_pattern(instance,
                   &instance->unit_addr[instance->cur_unit_addr_index][0],
                      setup_ptrn);

             set_pattern(instance, pin_def,
                   setup_ptrn, unitno, wordno, bitno, pin_value);

             if (old_val == read_ptrn_bit(&setup_ptrn[unitno], wordno, bitno)) {

                DPRINTF(("cannot measure store PN: %d\n", pin_number));
                measure = FALSE;
             }
             if (grow_pattern(instance) == FAILURE)
                return (FAILURE);

             break;
       }

       if (pin_def->direction == IO) {
          /* Always Hard and Medium drive the event pin */
          reset_ptrn_bit(&lcychdb[unitno], wordno, bitno);
/*        reset_ptrn_bit(&lcycmdb[unitno], wordno, bitno);*/
       }
       if (measure == TRUE)
          ++evaluation_count;

       write_pattern(instance, &instance->lcychdb_addr[0], lcychdb);
       write_pattern(instance, &instance->lcycmdb_addr[0], lcycmdb);
       mask_off_output(instance, setup_ptrn);
       write_pattern(instance,
                 &instance->unit_addr[instance->cur_unit_addr_index][0],
                 setup_ptrn);

       if (measure == TRUE) {
          set_seq_end_bit(instance,
                          instance->lane_addr,
                          FALSE,
                          seq_end_addr,
                          inst_block_number);

          if (measure_delay(def_ptr, instance, timeout,
                            STORE_EVENT, (u_short *) & pin_number, 1,
                            steady_state_result,
                            ident_inconsistent_pins,
                            temp_steady_state_result,
                            gbl_tm_pin_info_table,
                            ident_change, changed_dac) == FAILURE) {
             remove_seq_end_bit(instance, seq_end_addr, inst_block_number);
             return (FAILURE);
          }
          remove_seq_end_bit(instance, seq_end_addr, inst_block_number);
       }
       /* Soft drive this IO pin for next evaluation */
       if (pin_def->direction == IO) {
          set_ptrn_bit(&lcychdb[unitno], wordno, bitno);
/*        set_ptrn_bit(&lcycmdb[unitno], wordno, bitno);*/
       }
       /* Make the pattern history look like normal pattern history */
       calculate_consistent_set(instance, def_ptr, consistent_set);

       switch (pin_def->clk_format) {
```

Copyright 1989 Logic Modeling Systems

LINE # SOURCE TEXT

```
            case R1:
               reset_ptrn_bit(&consistent_set[unitno], wordno, bitno);
               /* Disable the R1 clock on the setup ptrn so it will be
                * correct when we evaluation the next store change in
                * this simulation pass.
                */
               set_ptrn_bit(&setup_ptrn[unitno], wordno, bitno);
               break;
            case R0:
               set_ptrn_bit(&consistent_set[unitno], wordno, bitno);
               /* Disable the R0 clock on the setup ptrn so it will be
                * correct when we evaluation the next store change in
                * this simulation pass.
                */
               reset_ptrn_bit(&setup_ptrn[unitno], wordno, bitno);
               break;
            default:
               break;
         }

         /* save the consistent set */
         copy_ptrn_bits((char *) consistent_set,
                        (char *) instance->last_consistent_set,
                        dab_list[instance->dab_info_index]->unit_count);

         write_pattern(instance, &instance->lcychdb_addr[0],
                       instance->lcychdb_loaded);

         write_pattern(instance, &instance->lcycmdb_addr[0],
                       instance->lcycmdb_loaded);

         write_pattern(instance,
                       &instance->
                       unit_addr[instance->cur_unit_addr_index + 1 & 1][0],
                       consistent_set);

         write_pattern(instance,
                       &instance->unit_addr[instance->cur_unit_addr_index][0],
                       instance->ptrn_loaded);

         set_seq_end_bit(instance,
                         instance->lane_addr,
                         FALSE,
                         seq_end_addr,
                         inst_block_number);


         if (play_ptrn_seq(instance, timeout, changed_dac) == FAILURE) {
            remove_seq_end_bit(instance, seq_end_addr, inst_block_number);
            return (FAILURE);
         }
         if (get_result(def_ptr, instance, ident_change,
                        STORE_EVENT, gbl_eval_pin_number,
                        1, &any_driving_to_z) == FAILURE) {
            remove_seq_end_bit(instance, seq_end_addr, inst_block_number);
            return (FAILURE);
         }
         if (measure == TRUE) {
            check_consistency2(instance,
                               &instance->last_sample_value,
                               steady_state_result,
                               ident_inconsistent_pins,
                               ident_change,
                               total_unit);
         }
         reset_ptrn_bit(&ident_inconsistent_pins[unitno], wordno, bitno);
         reset_ptrn_bit(&ident_change[unitno], wordno, bitno);

         get_delay(def_ptr, instance, ident_change,
                   ident_inconsistent_pins,
                   (u_short) pin_number, pin_value);

         /* Accumulate the pin changes in gbl_tm_ident_change */
         accumulate_ident_pins(ident_change, gbl_tm_ident_change, total_unit);

         copy_ptrn_bits((char *) ident_inconsistent_pins,
                        (char *) gbl_tm_ident_inconsistent_pins,
                        total_unit);

         add_inconsistent_pins(instance, ident_inconsistent_pins);

         clear_ptrn_bits((char *) ident_change, total_unit);
         clear_ptrn_bits((char *) ident_inconsistent_pins, total_unit);

         if (any_driving_to_z == TRUE) {

            /*
             * Use 2 bits per pin --> hard drive those IO STORE pins which change
             * from driving to Z.
             */

            if (def_ptr->device_type == PUBLIC) {

               /*
                * Write HMDEMB_LOADED to previous pattern address. For PRIVATE
                * devices we don't have to do anything since HMDEMB will always be
                * written when we do the next evaluation.
                */
               write_pattern(instance,
                             &instance->unit_addr[
                                  instance->cur_unit_addr_index + 1 & 1][0],
                             instance->hmdemb_loaded);

               write_pattern(instance,
                          &instance->unit_addr[instance->cur_unit_addr_index][0],
                             instance->last_consistent_set);

               if (grow_pattern(instance) == FAILURE)
                  return (FAILURE);
            }
         }
         remove_seq_end_bit(instance, seq_end_addr, inst_block_number);

         pin_info->uninitialized_pin = FALSE;
      }

      if (evaluation_count == 0)
         return (SUCCESS);

      copy_tm_result(instance, gbl_tm_pin_info_table,
```

Copyright 1989
Logic Modeling Systems

SOURCE PROGRAM lm1000/tmeas.c

DATE 5/23/89 TIME 6:14:50 pm PAGE # 7/138

LINE # SOURCE TEXT

```
                     gbl_tm_ident_change, gbl_tm_ident_inconsistent_pins);

   return (SUCCESS);
}

set_pattern(instance, pin_def, ptrn_ptr, unitno, wordno, bitno, pin_value)
INSTANCE_INFO          *instance;
PIN_SPEC               *pin_def;
PTRN_BITS              *ptrn_ptr;
u_char                  unitno;
u_char                  wordno;
u_char                  bitno;
u_char                  pin_value;
{
   u_char                  last_sample_value;

   if (pin_def->direction == IN) {
      if (pin_value & (LOGIC_0 | LOGIC_S0))
         reset_ptrn_bit(&ptrn_ptr[unitno], wordno, bitno);
      else
         set_ptrn_bit(&ptrn_ptr[unitno], wordno, bitno);
   } else {
      /* IO pin ---> let the DUT pin dominates. */

      last_sample_value =
        read_pin_value(&instance->last_sample_value, unitno, wordno, bitno);

      if (last_sample_value & LOGIC_0)
         reset_ptrn_bit(&ptrn_ptr[unitno], wordno, bitno);
      else if (last_sample_value & LOGIC_1)
         set_ptrn_bit(&ptrn_ptr[unitno], wordno, bitno);
      else if (last_sample_value & (LOGIC_Z0 | LOGIC_Z1)) {

         if (pin_value & (LOGIC_0 | LOGIC_S0))
            reset_ptrn_bit(&ptrn_ptr[unitno], wordno, bitno);
         else if (pin_value & (LOGIC_1 | LOGIC_S1))
            set_ptrn_bit(&ptrn_ptr[unitno], wordno, bitno);
         else {
            if (last_sample_value & LOGIC_Z0)
               reset_ptrn_bit(&ptrn_ptr[unitno], wordno, bitno);
            else
               set_ptrn_bit(&ptrn_ptr[unitno], wordno, bitno);
         }

      } else {
         /* last sample is U */
         toggle_ptrn_bit(&ptrn_ptr[unitno], wordno, bitno);
      }
   }
}

copy_tm_result(instance, tm_pin_info_table, ident_change,
               ident_inconsistent_pins)
INSTANCE_INFO          *instance;
TM_PIN_INFO            *tm_pin_info_table;
PTRN_BITS_LONGWORD     *ident_change;
PTRN_BITS_LONGWORD     *ident_inconsistent_pins;
{
   DAB_INFO                *dab_ptr;
   TM_PIN_INFO             *tm_pin_info;
   PIN_INFO                *pin_info;
   u_long                   mask;
   u_long                   ident_change_word;
   u_short                  unit_pin_number_offset;
   u_short                  word_pin_number_offset;
   u_short                  dest_pin_number;
   u_char                   dest_pin_value;
   u_char                   total_unit;
   u_char                   unitno;
   u_char                   wordno;
   char                     bitno;

   dab_ptr = dab_list[instance->dab_info_index];
   total_unit = dab_ptr->unit_count;
   unit_pin_number_offset = 0;
   for (unitno = 0; unitno < total_unit; ++unitno) {

      word_pin_number_offset = unit_pin_number_offset + 79;

      for (wordno = 0; wordno < 3; ++wordno) {
         ident_change_word = ident_change[unitno].word[wordno];

         for (bitno = 31; bitno >= 0; --bitno) {
            if (ident_change_word == 0)
               break;

            mask = bitno_to_mask[bitno];
            if (ident_change_word & mask) {
               /* reset the bit */
               ident_change_word ^= mask;

               dest_pin_number = word_pin_number_offset + bitno - 31;
               tm_pin_info = &tm_pin_info_table[dest_pin_number];
               pin_info = &instance->pin_info_table[dest_pin_number];

               if (read_ptrn_bit_long(&ident_inconsistent_pins[unitno],
                                      wordno, (u_char) bitno) != 0) {
                  dest_pin_value = LOGIC_U;
                  tm_pin_info->delay_value_is_set = FALSE;
               } else {
                  dest_pin_value =
                    read_pin_value_long(&instance->last_sample_value,
                                        unitno, wordno, (u_char) bitno);
               }

               pin_info->new_raw = dest_pin_value;
               if (tm_pin_info->delay_value_is_set == TRUE) {
                  /* return measured delay */

                  DPRINTF(("measured PN: %d val: %d delay: %d-%d\n",
                           dest_pin_number,
                           dest_pin_value,
                           tm_pin_info->min_delay,
                           tm_pin_info->max_delay));

                  if (pin_info->output_pin_is_linked == FALSE) {
                     pin_info->next_output_pin_index =
                       instance->first_data_pin_index;
                     instance->first_data_pin_index = dest_pin_number;
                  }
```

Copyright 1989
Logic Modeling Systems

| SOURCE PROGRAM | DATE | PAGE # |
|---|---|---|
| lm1000/tmeas.c | 5/23/89<br>TIME 6:14:50 pm | 8/139 |

LINE # SOURCE TEXT

```
                    pin_info->output_pin_is_linked = TRUE;
                    pin_info->event_pin_number =
                      tm_pin_info->event_pin_number;
                    pin_info->delay_type = MEASURED;

                    pin_info->min_delay = tm_pin_info->min_delay;
                    pin_info->max_delay = tm_pin_info->max_delay;
                 } else {
                    /* pin delay was not measured */
                    UPRINTF(("Not measured PN: %d val: %d\n",
                             dest_pin_number,
                             dest_pin_value));
                 }
              }
           }
           word_pin_number_offset -= 32;
        }

        unit_pin_number_offset += 80;
    }
}

get_next_pattern_addr(instance, new_unit_addr,
                      last_unit_addr, allocated_blocks)
INSTANCE_INFO        *instance;
u_long               *new_unit_addr;
LANE_ADDR_INFO       *last_unit_addr;
u_char               *allocated_blocks;
{
   /* ???? */
   DAB_INFO             *dab_ptr;
   LANE_ADDR_INFO       *lane_info;
   u_long                new_block_addr[MAX_LANE_COUNT];
   u_long               *cur_unit_addr;
   u_long                addr_inc_per_lane;
   u_char                laneno;
   u_char                unitno;
   u_char                total_unit;
   u_char                junk;

   dab_ptr = dab_list[instance->dab_info_index];
   addr_inc_per_lane = dab_ptr->unit_count_per_lane * PTRN_ADDR_INC;
   total_unit = dab_ptr->lane_count * dab_ptr->unit_count_per_lane;

   *allocated_blocks = FALSE;
   for (laneno = 0; laneno < MAX_LANE_COUNT; ++laneno)
      new_block_addr[laneno] = 0;

   cur_unit_addr = &instance->unit_addr[instance->cur_unit_addr_index][0];
   for (unitno = 0; unitno < total_unit; ++unitno) {
      laneno = dab_ptr->unit_location[unitno].lane_no;
      lane_info = &instance->lane_addr[laneno];
      if ((cur_unit_addr[unitno] + addr_inc_per_lane) >=
          lane_info->max_addr) {
         if (new_block_addr[laneno] == 0) {
            if (new_block(&new_block_addr[laneno],
                          &junk,
                          PATTERN_BLOCK,
                          laneno) == FAILURE) {
               lm_queue_message(ERROR_MSG, "out of Fast Pattern Memory");
               instance->failed_to_alloc_ptrs = TRUE;
               return (FAILURE);
            }
            *allocated_blocks = TRUE;
            set_branch(lane_info->max_addr - PTRN_ADDR_INC,
                       new_block_addr[laneno]);
         }
         new_unit_addr[unitno] = new_block_addr[laneno] +
           cur_unit_addr[unitno] + addr_inc_per_lane -
           lane_info->max_addr;
      } else {
         new_unit_addr[unitno] = cur_unit_addr[unitno] + addr_inc_per_lane;
      }

      if (dab_ptr->unit_location[unitno].last_in_lane)
         last_unit_addr[laneno].last_unit_addr = new_unit_addr[unitno];
   }

   return (SUCCESS);
}

return_last_blocks(instance)
INSTANCE_INFO        *instance;
{

   /*
    * Release the blocks allocated after the current unit addr.
    * instance->lane_addr contains information related to the real pattern, not
    * the temporary pattern. We find the block to be released by looking at the
    * link table.
    */

   DAB_INFO             *dab_ptr;
   LANE_ADDR_INFO       *lane_info;
   u_short               blocknum_to_be_released;
   u_char                laneno;

   dab_ptr = dab_list[instance->dab_info_index];

   for (laneno = 0; laneno < MAX_LANE_COUNT; ++laneno) {
      lane_info = &instance->lane_addr[laneno];

      if (dab_ptr->lane_used[laneno]) {
         blocknum_to_be_released =
           read_branch_table_content(lane_info->max_addr - PTRN_ADDR_INC);

         release_block((u_long) (LANE_0_START_ADDR + laneno * LANE_ADDR_INC +
                    (blocknum_to_be_released << BLOCK_NUMBER_SHIFT)), laneno),

         unset_branch(lane_info->max_addr - PTRN_ADDR_INC);
      }
   }
}

measure_delay(def_ptr, instance, timeout,
              event_type, event_pin_number, event_pin_count,
              steady_state_result, ident_inconsistent_pins,
              temp_steady_state_result, tm_pin_info_table,
              ident_change, changed_dac)
DEVICE_SPEC          *def_ptr,
```

Copyright 1989 Logic Modeling Systems

SOURCE PROGRAM lm1000/tmeas.c

DATE 5/23/89 TIME 6:14:50 pm

LINE # SOURCE TEXT

```
INSTANCE_INFO           *instance;
u_long                   timeout;
u_char                   event_type;
u_short                 *event_pin_number;
u_char                   event_pin_count;
FULL_VALUE              *steady_state_result;
PTRN_BITS_LONGWORD      *ident_inconsistent_pins;
FULL_VALUE              *temp_steady_state_result;
TM_PIN_INFO             *tm_pin_info_table;
PTRN_BITS_LONGWORD      *ident_change;
u_char                  *changed_dac;
{

  /*
   * Measure delay of all output pins which change as a result of the pin
   * event_pin_number(s). The type of the event (EVAL_EVENT or STORE_EVENT) is
   * given in "event_type". If event_type == EVAL_EVENT then there could be
   * multiple eval pins that change on this particular pattern seq. We need to
   * add the skew of the eval pins to the measured pin delay that we found.
   */
    PTRN_BITS_LONGWORD    ident_all_pin_change[MAX_UNIT_COUNT];
    PTRN_BITS_LONGWORD   *ident_all_pin_change_ptr;
    PTRN_BITS_LONGWORD   *last_sample_data_ptr;
    PTRN_BITS_LONGWORD   *last_sample_hiz_ptr;
    PTRN_BITS_LONGWORD   *last_sample_unknown_ptr;
    PTRN_BITS_LONGWORD   *steady_state_data_ptr;
    PTRN_BITS_LONGWORD   *steady_state_hiz_ptr;
    PTRN_BITS_LONGWORD   *steady_state_unknown_ptr;
    PTRN_BITS_LONGWORD   *ident_ios_ptr;
    PTRN_BITS_LONGWORD   *ident_outputs_ptr;
    PTRN_BITS             two_state_result[MAX_UNIT_COUNT];
    DAB_INFO             *dab_ptr;
    TM_PIN_INFO          *event_pin;
    TM_PIN_INFO          *tm_pin_info;
    EXTRA_DEVICE_SPEC    *extra_def_ptr;
    UWB_OFFSET           *uwb_ptr;
    u_long                ident_change_word;
    u_long                mask;
    long                  min_event_pin_delay;
    long                  max_event_pin_delay;
    long                  min_delay;
    long                  max_delay;
    long                  save_min_delay;
    long                  save_max_delay;
    u_long                z_to_h_transition;
    u_long                measurement_error;
    short                 pins_to_be_measured_head;
    short                 all_pins_to_be_measured_head = -1;
    short                 pin_number;
    u_short               min_event_pin_number;
    u_char                resolution;
    u_char                total_pins_to_be_measured = 0;
    u_char                i;
    u_char                total_unit;
    u_char                unitno;
    u_char                wordno;
    char                  bitno;
    u_char                measurement_mode;

/* COMMENTED CODE
    char                  pin_name_list[MAX_PIN_NAME_LIST];
    u_char                build_pin_name_list = FALSE;
    END COMMENTED CODE
*/
    DPRINTF(("inside measure_delay\n"));

    extra_def_ptr = (EXTRA_DEVICE_SPEC *) def_ptr->extra_data;
    dab_ptr = dab_list[instance->dab_info_index];
    total_unit = dab_ptr->unit_count;

#ifdef DBASE
    setup_final_tm_result(total_unit * 80);
#endif

    in_measure_delay = TRUE;

    if (event_type == EVAL_EVENT) {
       /* Program the sample edge to start at data time */
       measurement_mode = extra_def_ptr->eval_event_mode;
       extra_def_ptr->edge_setting[6] = extra_def_ptr->edge_setting[8];
       if (lm_tmg_set_sample_trigger_mode(
                        (u_long)extra_def_ptr->eval_event_mode) == FAILURE) {
          lm_queue_message(ERROR_MSG, "Timing Generator error: set sample trigger mode");
          return (FAILURE);
       }
    } else {
       /* Program the sample edge to start at store time */
       measurement_mode = extra_def_ptr->store_event_mode;
       extra_def_ptr->edge_setting[6] = extra_def_ptr->edge_setting[7];
       if (lm_tmg_set_sample_trigger_mode(
                        (u_long)extra_def_ptr->store_event_mode) == FAILURE) {
          lm_queue_message(ERROR_MSG, "Timing Generator error: set sample trigger mode");
          return (FAILURE);
       }
    }

   /* Sample the outputs at the max range of the finest resolution */
   if (set_edge_and_sample_setting(extra_def_ptr,
                                   (u_long) RESOLUTION_05_NS,
                 (u_long) MAX_SAMPLE_RAMP_RANGE - SWEEP_RANGE) == FAILURE)
      return (FAILURE);

   if (play_ptrn_seq(instance, timeout, changed_dac) == FAILURE)
      return (FAILURE);


   DPRINTF(("get end range result; resolution: %d\n", RESOLUTION_05_NS));

   read_magic_full_sample_reg(instance, steady_state_result);
   read_magic_timing_sample_reg(instance, two_state_result,
                                MAX_SAMPLE_RAMP_RANGE - SWEEP_RANGE);

   ident_all_pin_change_ptr = ident_all_pin_change;
   last_sample_data_ptr = (PTRN_BITS_LONGWORD *)
     instance->last_sample_value.data;
   last_sample_hiz_ptr = (PTRN_BITS_LONGWORD *)
     instance->last_sample_value.hiz;
   last_sample_unknown_ptr = (PTRN_BITS_LONGWORD *)
     instance->last_sample_value.unknown;
```

Copyright 1989
Logic Modeling Systems

SOURCE PROGRAM lm1000/tmeas.c | DATE 5/23/89 | TIME 6:14:50 pm | PAGE # 10/141

LINE # SOURCE TEXT

```
    steady_state_data_ptr = (PTRN_BITS_LONGWORD *)
      steady_state_result->data;
    steady_state_hiz_ptr = (PTRN_BITS_LONGWORD *)
      steady_state_result->hiz;
    steady_state_unknown_ptr = (PTRN_BITS_LONGWORD *)
      steady_state_result->unknown;

    ident_ios_ptr = (PTRN_BITS_LONGWORD *) extra_def_ptr->ident_ios;
    ident_outputs_ptr = (PTRN_BITS_LONGWORD *) extra_def_ptr->ident_outputs;

    for (unitno = 0; unitno < total_unit; ++unitno) {
       for (wordno = 0; wordno < 3; ++wordno) {
          ident_all_pin_change_ptr->word[wordno] =
            last_sample_data_ptr->word[wordno]
            steady_state_data_ptr->word[wordno];

          /* Don't measure transitions to/from U/Z */
          ident_all_pin_change_ptr->word[wordno] &=
             ~(last_sample_hiz_ptr->word[wordno] |
               last_sample_unknown_ptr->word[wordno] |
               steady_state_hiz_ptr->word[wordno] |
               steady_state_unknown_ptr->word[wordno]);

          /* Measure Z1 to H0 transition on I/O pins */
          z_to_h_transition =
            ident_ios_ptr->word[wordno] &
            (last_sample_hiz_ptr->word[wordno] &
             last_sample_data_ptr->word[wordno]) &
            (~(steady_state_hiz_ptr->word[wordno] |
              steady_state_unknown_ptr->word[wordno]) &
             ~steady_state_data_ptr->word[wordno]);

          ident_all_pin_change_ptr->word[wordno] |= z_to_h_transition;

          if (z_to_h_transition) {
             DPRINTF(("found Z1 to H0 transition\n"));
          }
          /* Measure Z0 to H1 transition on I/O pins */
          z_to_h_transition =
            ident_ios_ptr->word[wordno] &
            (last_sample_hiz_ptr->word[wordno] &
             ~last_sample_data_ptr->word[wordno]) &
            (~(steady_state_hiz_ptr->word[wordno] |
               steady_state_unknown_ptr->word[wordno]) &
             steady_state_data_ptr->word[wordno]);

          ident_all_pin_change_ptr->word[wordno] |= z_to_h_transition;

          if (z_to_h_transition) {
             DPRINTF(("found Z0 to H1 transition\n"));
          }
          /* Only measure timing on I/O pins and outputs pins */
          ident_all_pin_change_ptr->word[wordno] &=
            ident_ios_ptr->word[wordno] | ident_outputs_ptr->word[wordno];
       }

       ++ident_all_pin_change_ptr;
       ++last_sample_data_ptr;
       ++last_sample_hiz_ptr;
       ++last_sample_unknown_ptr;
       ++steady_state_data_ptr;
       ++steady_state_hiz_ptr;
       ++steady_state_unknown_ptr;
       ++ident_ios_ptr;
       ++ident_outputs_ptr;
    }

    /*
     * Reset the bits in ident_all_pin_change corresponding to the
     * event_pin_number. These pins will be forced added later. This is
     * applicable only for IO pins because input pins have been masked off.
     */
    for (i = 0; i < event_pin_count; ++i) {
       pin_number = event_pin_number[i];

       uwb_ptr = &ps_to_short_offset[pin_number];
       unitno = uwb_ptr->unitno;
       wordno = uwb_ptr->wordno;
       bitno = uwb_ptr->bitno;

       reset_ptrn_bit(&((PTRN_BITS *) ident_all_pin_change)[unitno],
                      wordno, (u_char) bitno);
    }

    /* Find all pins which change values and link them in tm_pin_info_table */
    for (unitno = 0; unitno < total_unit; ++unitno) {
       for (wordno = 0; wordno < 3; ++wordno) {

          ident_change_word = ident_all_pin_change[unitno].word[wordno];
          for (bitno = 31; bitno >= 0; --bitno) {
             if (ident_change_word == 0)
                break;

             mask = bitno_to_mask[bitno];

             if (ident_change_word & mask) {

                ident_change_word &= ~mask;

                ++total_pins_to_be_measured;

                pin_number = CALC_PIN_NUMBER_LONG(unitno, wordno, bitno);

                DPRINTF(("link to tm_pin_info_table PN: %d\n", pin_number));

                tm_pin_info = &tm_pin_info_table[pin_number];
                tm_pin_info->delay_found = FALSL;

                tm_pin_info->next_pin_index = all_pins_to_be_measured_head;
                all_pins_to_be_measured_head = pin_number;

             }
          }
       }
    }

    /* Always measure the delay of the event pins */
    min_evest_pin_number = event_pin_number[0];
    for (i = 0; i < event_pin_count; ++i) {
       event_pin = &tm_pin_info_table[event_pin_number[i]];
```

Copyright 1989 Logic Modeling Systems

SOURCE PROGRAM lm1000/tmeas.c

DATE 5/23/89 TIME 6:14:50 pm PAGE # 11/142

SOURCE TEXT

```
        event_pin->delay_found = FALSE;
        DPRINTF(("link eval pin to tm_pin_info_table PN: %d\n",
                 event_pin_number[i]));

        /* Use the minimum pin number to identify the ev--- -in */
        if (event_pin_number[i] < min_event_pin_number)
           min_event_pin_number = event_pin_number[i];

        event_pin->next_pin_index = all_pins_to_be_measured_head;
        all_pins_to_be_measured_head = event_pin_number[i];
    }

    resolution = RESOLUTION_05_NS;

    while (resolution != RESOLUTION_INVALID) {

        /*
         * The actual pin delays are referenced to the event pin delay on the
         * same sample ramp. So we need to measure the event pins for each
         * resolution.
         */

        /* Add the event pins to the list of pins to be measured */
        for (i = 0; i < event_pin_count; ++i) {
           event_pin = &tm_pin_info_table[event_pin_number[i]];
           event_pin->delay_found = FALSE;
           ++total_pins_to_be_measured;
        }

        find_pins_to_be_measured(def_ptr,
                                 tm_pin_info_table, two_state_result,
                                 steady_state_result,
                                 ident_all_pin_change,
                                 event_pin_number,
                                 event_pin_count,
                                 &pins_to_be_measured_head,
                                 total_unit, resolution, measurement_mode);

        pin_number = pins_to_be_measured_head;
        while (pin_number != -1) {

           uwb_ptr = &pn_to_short_offset[pin_number];
           unitno = uwb_ptr->unitno;
           wordno = uwb_ptr->wordno;
           bitno = uwb_ptr->bitno;

           tm_pin_info_table[pin_number].event_pin_number =
             min_event_pin_number;

           if (read_ptrn_bit(&((PTRN_BITS *) ident_inconsistent_pins)[unitno],
                             wordno, (u_char) bitno) == 0) {
              if (measure_pin(instance, timeout,
                              tm_pin_info_table, (u_short) pin_number,
                              steady_state_result, ident_inconsistent_pins,
                              temp_steady_state_result, ident_change,
                          resolution, changed_dac, measurement_mode) == FAILURE)
                 return (FAILURE);
           } else {
              DPRINTF(("PN: %d inconsistent --> not measured\n",
                       pin_number));
           }

           --total_pins_to_be_measured;
           pin_number =
             tm_pin_info_table[pin_number].next_pin_to_be_measured;
        }

       if (get_composite_eval_pin_delay(def_ptr, instance, tm_pin_info_table,
                                        event_pin_number, event_pin_count,
                                        measurement_mode, resolution,
                     &min_event_pin_delay, &max_event_pin_delay) == FAILURE)
          return (FAILURE);

       pin_number = pins_to_be_measured_head;
       while (pin_number != -1) {
          tm_pin_info = &tm_pin_info_table[pin_number];

          /* Make believe that the delay is found, so that we will be
           * able to report delay not reached correctly.
           * We will look at the actual delay values to see whether
           * we can/can't measure the pin delay.
           */
          tm_pin_info->delay_found = TRUE;

          lm_tmg_get_sample_ramp_delay(resolution,
                                       tm_pin_info->min_threshold,
                                       &min_delay,
                                       &measurement_error);
          min_delay -= measurement_error;

          lm_tmg_get_sample_ramp_delay(resolution,
                                       tm_pin_info->max_threshold,
                                       &max_delay,
                                       &measurement_error);
          max_delay += measurement_error;

          if ((min_delay < max_event_pin_delay) ||
              (max_delay < min_event_pin_delay)) {
             /*****************************************************************
              * This is bogus delay (we failed to measure the pin transition).
              * This case happens when:
              * 1. We try to measure a transition from
              *    Z0 to 1 (or Z1 to 0) on a DATA pin, but the simulator is
              *    sending a 1 (or 0) with the clock transition which causes
              *    the pin to switch from Z0 to 1 (or Z1 to 0). The transition
              *    from Z0 to 1 (or Z1 to 0) will already happen in the setup
              *    pattern, and therefore we will NOT be able to measure the
              *    transition.
              * 2. There is a misdeclaration of a STORE or EVAL pin
              *    in the Shell Software as shown below:
              *                                   ______________
              *       DATA (s/b store/eval)   _______|
              *                                           ______
              *       STORE (causing event)   _______________|
              *       OUT                     _________|______________
              *    We fail to measure transition on OUT because it happens
              *    in the setup pattern.
              * 3. A pin is inconsistent between two sets of sample runs.
              *    Consider this scenario.  Store pin A change to 1 and we
              *    sample output B to be 1, then store pin A change to 0
              *    and we sample output B to be 0. At this point we say
              *    that we should measure the transition on pin B.
```

Copyright 1989
Logic Modeling Systems

SOURCE PROGRAM lm1000/tmeas.c

DATE 5/23/89 TIME 6:14:50 pm

PAGE # 12/143

LINE # SOURCE TEXT

```
                 *     It's possible that we will fail to measure A because
                 *     this time pin B does not change to 1 on the rising
                 *     edge of pin A.
                 ***************************************************************/

/* COMMENTED because      case 3 above
            for (i = 0, i < event_pin_count, ++i) {
               if (pin_number == event_pin_number[i])
                  break;
            }

            if (i != event_pin_count) {
               pin_number = tm_pin_info->next_pin_to_be_measured;
               continue;
            }

            usb_ptr = tpm_to_short_offset[pin_number];
            unitno = usb_ptr->unitno;
            wordno = usb_ptr->wordno;
            bitno  = usb_ptr->bitno;

            if (read_ptrn_bit(&((PTRN_BITS *)ident_inconsistent_pins)[unitno],
                              wordno, (u_char)bitno) != 0) {
               pin_number = tm_pin_info->next_pin_to_be_measured;
               continue;
            }

            if (read_ptrn_bit(&gbl_tm_ident_data_change[unitno],
                              wordno, bitno) == 0) {

               if (build_pin_name_list == FALSE) {
                  build_pn_list(def_ptr, total_unit,
                                (PTRN_BITS_LONGWORD *)gbl_tm_ident_data_change,
                                pin_name_list);
                  build_pin_name_list = TRUE;
               }

               lm_queue_message(ERROR_MSG, "could not measure pin: %s, one of these pins should be declared as store/eval: %s",
                                def_ptr->pin_table[pin_number].pin_name,
                                pin_name_list);
            }
END COMMENTED CODE */

         } else {

            save_min_delay = tm_pin_info->min_delay;
            save_max_delay = tm_pin_info->max_delay;

            /* The real delay is referenced to the skew of the eval pins */
            tm_pin_info->min_delay = min_delay - max_event_pin_delay;
            tm_pin_info->max_delay = max_delay - min_event_pin_delay;

            /* Adjust the delay further by the delay of the trace */
            adjust_measured_delay(def_ptr->pin_table, tm_pin_info, (u_short) pin_number, tm_pin_info_table);

            if (tm_pin_info->delay_value_is_set == FALSE) {
               tm_pin_info->delay_value_is_set = TRUE;
            } else {
               /* Coalesce delays from several runs of timing measurements. */
               if (save_min_delay < tm_pin_info->min_delay)
                  tm_pin_info->min_delay = save_min_delay;
               if (save_max_delay > tm_pin_info->max_delay)
                  tm_pin_info->max_delay = save_max_delay;
            }
         }

         pin_number = tm_pin_info->next_pin_to_be_measured;
      }

      if (total_pins_to_be_measured == 0) {
         break;
      }
      /* Go to the next coarser resolution */
      switch (resolution) {
         case RESOLUTION_05_NS:
            resolution = RESOLUTION_10_NS;
            break;
         case RESOLUTION_10_NS:
            resolution = RESOLUTION_20_NS;
            break;
         case RESOLUTION_20_NS:
            resolution = RESOLUTION_40_NS;
            break;
         case RESOLUTION_40_NS:
         default:
            resolution = RESOLUTION_INVALID;
            continue;
      }

      if (set_edge_and_sample_setting(extra_def_ptr,
                                      (u_long) resolution,
                  (u_long) MAX_SAMPLE_RAMP_RANGE - SWEEP_RANGE) == FAILURE)
         return (FAILURE);

      DPRINTF(("get end range result: resolution: %d\n", resolution));

      if (play_ptrn_seq(instance, timeout, changed_dac) == FAILURE)
         return (FAILURE);

      read_magic_full_sample_reg(instance, temp_steady_state_result);
      read_magic_timing_sample_reg(instance, two_state_result,
                                   MAX_SAMPLE_RAMP_RANGE - SWEEP_RANGE);

      /*
       * Note that "ident_change" below will be overwritten by get_result()
       * which we are going to call later on. This is OK since we only
       * collecting the "ident_inconsistent_pins. The above note does not apply
       * anymore since we are collecting the ident_change in get_result().
       */
      check_consistency(instance,
                        steady_state_result, temp_steady_state_result,
                        ident_inconsistent_pins, ident_change,
                        total_unit);
   }

   /* Set the delays for event pins to 0 */
   for (i = 0; i < event_pin_count; ++i) {
      event_pin = &tm_pin_info_table[event_pin_number[i]];
      event_pin->delay_value_is_set = FALSE;
      event_pin->min_delay = 0.
```

Copyright 1989
Logic Modeling Systems

| SOURCE PROGRAM | DATE 5/23/89 | PAGE # |
|---|---|---|
| lm1000/tmeas.c | TIME 6:14:50 pm | 13/144 |

LINE # SOURCE TEXT

```
            event_pin->max_delay = 0;
    }

    /*
     * Check that all pins are measured. Note that "event_pin" is pointing to
     * the last event pin.
     */
    pin_number = event_pin->next_pin_index;
    while (pin_number != -1) {
        tm_pin_info = &tm_pin_info_table[pin_number];
        if (tm_pin_info->delay_found == FALSE) {

            uwb_ptr = &pn_to_short_offset[pin_number];
            unitno = uwb_ptr->unitno;
            wordno = uwb_ptr->wordno;
            bitno = uwb_ptr->bitno;

            if (read_ptrn_bit(&((PTRN_BITS *) ident_inconsistent_pins)[unitno],
                              wordno, (u_char) bitno) == 0)
                lm_queue_message(WARNING_MSG, "pin: %s of instance: %s delay not reached",
                                 def_ptr->pin_table[pin_number].pin_name,
                                 instance->device_info_string);
        }
        pin_number = tm_pin_info->next_pin_index;
    }

    in_measure_delay = FALSE;
    DPRINTF(("exiting measure_delay\n"));
    return (SUCCESS);
}

find_pins_to_be_measured(def_ptr,
                         tm_pin_info_table, end_range_two_state_result,
                         steady_state_result, ident_all_pin_change,
                         event_pin_number, event_pin_count,
                         pins_to_be_measured_head,
                         total_unit, resolution, measurement_mode)
DEVICE_SPEC          *def_ptr;
TM_PIN_INFO          *tm_pin_info_table;
PTRN_BITS_LONGWORD   *end_range_two_state_result;
FULL_VALUE           *steady_state_result;
PTRN_BITS_LONGWORD   *ident_all_pin_change;
u_short              *event_pin_number;
u_char                event_pin_count;
short                *pins_to_be_measured_head;
u_char                total_unit;
u_char                resolution;
u_char                measuremnet_mode;
{
    PTRN_BITS_LONGWORD  *steady_state_data_ptr;
    PTRN_BITS_LONGWORD  *ident_change_ptr;
    PTRN_BITS_LONGWORD   ident_change[MAX_UNIT_COUNT];
    TM_PIN_INFO         *tm_pin_info;
    UWB_OFFSET          *uwb_ptr;
    u_long               ident_change_word;
    u_long               mask;
    u_short              pin_number;
    u_char               min_range;
    u_char               min_sample_ramp0;
    u_char               min_sample_ramp1;
    u_char               min_sample_ramp2;
    u_char               min_sample_ramp3;
    u_char               i;
    u_char               unitno;
    u_char               wordno;
    char                 bitno;

    DPRINTF(("inside find_pins_to_be_measured\n"));

    lm_tmg_get_minimum_sample_ramp_setting(&min_sample_ramp0,
                                           &min_sample_ramp1,
                                           &min_sample_ramp2,
                                           &min_sample_ramp3);

    switch (resolution) {
        case RESOLUTION_05_NS:
            min_range = min_sample_ramp0 + SWEEP_RANGE;
            break;
        case RESOLUTION_10_NS:
            min_range = min_sample_ramp1 + SWEEP_RANGE;
            break;
        case RESOLUTION_20_NS:
            min_range = min_sample_ramp2 + SWEEP_RANGE;
            break;
        case RESOLUTION_40_NS:
        default:
            min_range = min_sample_ramp3 + SWEEP_RANGE;
            break;
    }

    steady_state_data_ptr = (PTRN_BITS_LONGWORD *) steady_state_result->data;
    ident_change_ptr = (PTRN_BITS_LONGWORD *) ident_change;

    /*
     * Identify the pins that have attained their steady state value at the end
     * of the sample ramp.
     */
    for (unitno = 0; unitno < total_unit; ++unitno) {
        for (wordno = 0; wordno < 3; ++wordno) {
            ident_change_ptr->word[wordno] =
                ~(steady_state_data_ptr->word[wordno] ^
                 end_range_two_state_result->word[wordno]) &
               ident_all_pin_change->word[wordno];
        }
        ++steady_state_data_ptr;
        ++ident_change_ptr;
        ++end_range_two_state_result;
        ++ident_all_pin_change;
    }

    steady_state_data_ptr = (PTRN_BITS_LONGWORD *) steady_state_result->data;
    *pins_to_be_measured_head = -1;
    for (unitno = 0; unitno < total_unit; ++unitno) {
        for (wordno = 0; wordno < 3; ++wordno) {
            ident_change_word = ident_change[unitno].word[wordno];
            for (bitno = 31; bitno >= 0; --bitno) {
                if (ident_change_word == 0)
                    break;

                mask = bitno_to_mask[bitno];
```

Copyright 1989 Logic Modeling Systems

LINE # SOURCE TEXT

```
              if (ident_change_word & mask) {
                ident_change_word ^= mask;

                pin_number = CALC_PIN_NUMBER_LONG(unitno, wordno, bitno);

                DPRINTF(("measure this pin in cur res PN: %d\n",
                        pin_number));

                tm_pin_info = &tm_pin_info_table[pin_number];

                if (tm_pin_info->delay_found == FALSE) {
                  tm_pin_info->expected_value =
                    read_ptrs_bit_long(&steady_state_data_ptr[unitno],
                                      wordno, (u_char) bitno);
                  tm_pin_info->min_threshold = min_range;
                  tm_pin_info->max_threshold = MAX_SAMPLE_RAMP_RANGE -
                    SWEEP_RANGE;

                  tm_pin_info->next_pin_to_be_measured =
                    *pins_to_be_measured_head;
                  *pins_to_be_measured_head = pin_number;
                } else {
                  DPRINTF(("PN: %d delay is already found, not measured\n",
                          pin_number));
                }
              }
          }
        }
    }

    /* Link the event pins to the next_pin_to_be_measured. */
    for (i = 0; i < event_pin_count; ++i) {
        pin_number = event_pin_number[i];

        uwb_ptr = &pe_to_short_offset[pin_number];
        unitno = uwb_ptr->unitno;
        wordno = uwb_ptr->wordno;
        bitno = uwb_ptr->bitno;

        DPRINTF(("measure this pin in cur res PN: %d\n",
                pin_number));

        tm_pin_info = &tm_pin_info_table[pin_number];
        tm_pin_info->expected_value =
          read_ptrs_bit(&steady_state_result->data[unitno],
                        wordno, (u_char) bitno);

        if ((measurement_mode == EARLYSAMPLETRIGGERMODE) &&
            ((def_ptr->pin_table[pin_number].clk_format == R1) ||
             (def_ptr->pin_table[pin_number].clk_format == R0))) {
          tm_pin_info->min_threshold =
            ((EXTRA_DEVICE_SPEC *) def_ptr->extra_data)->r1_or_r2_min_threshold;
        } else {
          tm_pin_info->min_threshold = min_range;
        }

        tm_pin_info->max_threshold = MAX_SAMPLE_RAMP_RANGE - SWEEP_RANGE;

        tm_pin_info->next_pin_to_be_measured =
          *pins_to_be_measured_head;
        *pins_to_be_measured_head = pin_number;
    }

    DPRINTF(("exiting find_pins_to_be_measured\n"));
}

/*****************************************************************************
 *
 *  NAME:
 *      round_trip_trace_delay -- Return the round trip delay for this DAB.
 *
 *  PURPOSE:
 *      "round_trip_trace_delay" calculates the delay attributed to the propagation
 *      of the signal between the DUT and the magic chip. This includes the delay
 *      from the magic chip to the event pin, the delay from the result pin back to
 *      the magic chip and the PEL delay for driven pins.
 *
 *  INTERFACE:
 *
 *      u_short round_trip_trace_delay(pin_def, event_pin, result_pin)
 *
 *      PARAMETER       TYPE          DESCRIPTION
 *      -----------------------------------------------------------------
 *      pin_def         PIN_SPEC*     A pointer to the pin specifcation table.
 *      event_pin       u_short       The pin number of the event pin.
 *      result_pin      u_short       The pin number of the result pin.
 *
 *  CALLS:
 *      None.
 *
 *  EXTERNAL REFERENCES:
 *      None.
 *
 *  RESTRICTIONS:
 *      No checking is done to validate any of the parameters.
 *
 *  DESIGNER:
 *      Steve Parks
 *
 *****************************************************************************/

#define PEL_DELAY 400
u_short
round_trip_trace_delay(pin_def, event_pin, result_pin)
register PIN_SPEC   *pin_def;
u_short             event_pin;
u_short             result_pin;

/*
 * Return composite trace delay for this adapter (in Ps).
 */
{

   return (PEL_DELAY
           + pin_def[event_pin].trace_delay
           + pin_def[result_pin].trace_delay);
}

/*****************************************************************************
```

Copyright 1989
Logic Modeling Systems

SOURCE PROGRAM lm1000/tmeas.c | DATE 5/23/89 | TIME 6:14:50 pm | PAGE # 15/146

LINE # SOURCE TEXT

```
 *
 * NAME:
 *      adjust_measured_delay -- Compute actual delay from measured delay.
 *
 * PURPOSE:
 *      "adjust_measured_delay" adjusts the delay values for the
 *      maximum and minimum delays for "other" known delays not attributed
 *      to actual DUT. It also adjusts the delays attributed to the
 *      MAGIC LC delay effect.
 *      In the event that the measured delay is less than
 *      the "other" known delays, the measured delay will be set to zero.
 *
 * INTERFACE:
 *
 *      adjust_measured_delay(pin_def, tm_pin_info,
 *                            result_pin, tm_pin_info_table)
 *
 *      PARAMETER       TYPE            DESCRIPTION
 *      ---------------------------------------------------------------
 *      pin_def         PIN_SPEC*       A pointer to the pin specifcation table.
 *      tm_pin_for      TM_PIN_INFO*    A pointer to the timing measurement pin
 *                                      information table.
 *      result_pin      u_short         The pin number of the result pin.
 *
 *      tm_pin_info_table TM_PIN_INFO*  A pointer to the TM_PIN_INFO table
 *                                      to find the event pin's TM_PIN_INFO.
 *
 * CALLS:
 *      round_trip_trace_delay()
 *
 * EXTERNAL REFERENCES:
 *      None.
 *
 * RESTRICTIONS:
 *      No checking is done to validate any of the parameters.
 *
 * DESIGNER:
 *      Steve Parks
 *
 * MODIFICATIONS:
 *      05/09/89: REN Added Magic delay adjustments
 *
 ***************************************************************************/

adjust_measured_delay(pin_def, tm_pin_info, result_pin, tm_pin_info_table)
register PIN_SPEC    *pin_def;
register TM_PIN_INFO *tm_pin_info;
u_short               result_pin;
TM_PIN_INFO          *tm_pin_info_table;
{

   /*
    * The delay we measured is actually longer than it should be because of
    * trace delays on the PEL and the DAB.
    */
   u_short              event_pin = tm_pin_info->event_pin_number;
   u_short              trace_delay = round_trip_trace_delay(pin_def, event_pin, result_pin);
   TM_PIN_INFO         *event_tm_pin_info;
   short                magic_delay;

   DPRINTF(("Delay (%5s:%5s): ", pin_def[event_pin].pin_name, pin_def[result_pin].pin_name));
   DPRINTF(("Before: %5d,%5d; ", tm_pin_info->min_delay, tm_pin_info->max_delay));

   tm_pin_info->min_delay = (trace_delay > tm_pin_info->min_delay)
     ? 0 : tm_pin_info->min_delay - trace_delay;
   tm_pin_info->max_delay = (trace_delay > tm_pin_info->max_delay)
     ? 0 : tm_pin_info->max_delay - trace_delay;

   DPRINTF(("After: %5d,%5d; ", tm_pin_info->min_delay, tm_pin_info->max_delay));

   /* Adjust the delay further by the MAGIC LC effect. */
   event_tm_pin_info = &tm_pin_info_table[event_pin];
   if (event_tm_pin_info->expected_value) {
      if (tm_pin_info->expected_value) {
         magic_delay = MAGIC_1IN_1OUT_DELAY;
      }
      else {
         magic_delay = MAGIC_1IN_0OUT_DELAY;
      }
   }
   else {
      if (tm_pin_info->expected_value) {
         magic_delay = MAGIC_0IN_1OUT_DELAY;
      }
      else {
         magic_delay = MAGIC_0IN_0OUT_DELAY;
      }
   }

   tm_pin_info->min_delay =
     ((long)tm_pin_info->min_delay + (long)magic_delay < 0)
        ? 0 : tm_pin_info->min_delay + magic_delay;
   tm_pin_info->max_delay =
     ((long)tm_pin_info->max_delay + (long)magic_delay < 0)
        ? 0 : tm_pin_info->max_delay + magic_delay;

   DPRINTF(("After2: %5d,%5d\n", tm_pin_info->min_delay, tm_pin_info->max_delay));
}

measure_pin(instance, timeout, tm_pin_info_table, target_pin_number,
            steady_state_result, ident_inconsistent_pins,
            temp_steady_state_result, ident_change, resolution,
            changed_dac, measurement_mode)
INSTANCE_INFO        *instance;
u_long                timeout;
TM_PIN_INFO          *tm_pin_info_table;
u_short               target_pin_number;
FULL_VALUE           *steady_state_result;
PTRN_BITS_LONGWORD   *ident_inconsistent_pins;
FULL_VALUE           *temp_steady_state_result;
PTRN_BITS_LONGWORD   *ident_change;
u_char                resolution;
u_char               *changed_dac;
u_char                measurement_mode;
{
   DEVICE_SPEC          *def_ptr;
   EXTRA_DEVICE_SPEC    *extra_def_ptr;
   DAB_INFO             *dab_ptr;
   TM_PIN_INFO          *tm_pin_info;
   TM_PIN_INFO          *target_pin;
```

Copyright 1989 Logic Modeling Systems

| SOURCE PROGRAM | DATE | PAGE # |
|---|---|---|
| lm1000/tmeas.c | 5/23/89 TIME 6:14:50 pm | 16/147 |

LINE # SOURCE TEXT

```
    UWB_OFFSET          *uwb_ptr;
    PTRN_BITS           two_state_result[MAX_UNIT_COUNT];
    u_long              temp;
    short               pin_number;
    short               start;
    short               end;
    short               mid;
    u_char              total_unit;
    u_char              result;
    u_char              unitno;
    u_char              wordno;
    u_char              bitno;
    u_char              min_sample_ramp0;
    u_char              min_sample_ramp1;
    u_char              min_sample_ramp2;
    u_char              min_sample_ramp3;
    u_char              min_range;

    DPRINTF(("inside measure_pin PN: %d\n", target_pin_number));

    dab_ptr = dab_list[instance->dab_info_index];
    total_unit = dab_ptr->unit_count;

    def_ptr = instance->definition;
    extra_def_ptr = (EXTRA_DEVICE_SPEC *) instance->definition->extra_data;

    target_pin = &tm_pin_info_table[target_pin_number];

    start = target_pin->min_threshold;
    end = target_pin->max_threshold;
    mid = start + (end - start) / 2;

    while (start <= end) {
       /* Sample the pins at "mid" */

       if (set_edge_and_sample_setting(extra_def_ptr,
                                       (u_long) resolution,
                                       (u_long) mid) == FAILURE)
          return (FAILURE);

       DPRINTF(("getting two state sample; sample time: %d\n", mid));

       if (play_ptrn_seq(instance, timeout, changed_dac) == FAILURE)
          return (FAILURE);

#ifdef DEBUG
       if (loop_till_key == TRUE) {
          printf("looping for threshold: %d\n", mid);
          debug_key = 0;
          while (debug_key == 0) {
             if (play_ptrn_seq(instance, timeout, changed_dac) == FAILURE)
                return (FAILURE);
          }
          if (debug_char == (u_long) 't') {
             loop_till_key = FALSE;
             printf("stop loop\n");
          }
          debug_key = 0;
       }
#endif

       read_magic_full_sample_reg(instance, temp_steady_state_result);
       read_magic_timing_sample_reg(instance, two_state_result, (u_short) mid);

       /*
        * Note that "ident_change" below will be overwritten by get_result()
        * which we are going to call later on. This is OK since we only
        * collecting the "ident_inconsistent_pins. The above note does not apply
        * anymore since we are collecting the ident_change in get_result().
        */
       check_consistency(instance,
                         steady_state_result, temp_steady_state_result,
                         ident_inconsistent_pins, ident_change,
                         total_unit);


       /* Narrow the range for all pins to be measured except the target pin */
       pin_number = target_pin->next_pin_to_be_measured;
       while (pin_number != -1) {

          uwb_ptr = &pn_to_short_offset[pin_number];
          unitno = uwb_ptr->unitno;
          wordno = uwb_ptr->wordno;
          bitno = uwb_ptr->bitno;

          tm_pin_info = &tm_pin_info_table[pin_number];

          result = read_ptrn_bit(&two_state_result[unitno], wordno, bitno);

          if (result == tm_pin_info->expected_value) {
             if (mid < tm_pin_info->max_threshold)
                tm_pin_info->max_threshold = mid;
          } else {
             if (mid > tm_pin_info->min_threshold)
                tm_pin_info->min_threshold = mid;
          }

          pin_number = tm_pin_info->next_pin_to_be_measured;
       }

       uwb_ptr = &pn_to_short_offset[target_pin_number];
       unitno = uwb_ptr->unitno;
       wordno = uwb_ptr->wordno;
       bitno = uwb_ptr->bitno;

       /* Adjust the range of the target pin */
       result = read_ptrn_bit(&two_state_result[unitno], wordno, bitno);
       if (result == target_pin->expected_value) {
          target_pin->max_threshold = mid;
          end = mid - 1;
       } else {
          target_pin->min_threshold = mid;
          start = mid + 1;
       }

       mid = start + (end - start) / 2,
    }

    if (target_pin->min_threshold > target_pin->max_threshold) {
       /* Exchange the delay */
```

Copyright 1989
Logic Modeling Systems

| SOURCE PROGRAM | DATE | PAGE # |
|---|---|---|
| lm1000/tmeas.c | 5/23/89<br>TIME 6:14:50 pm | 17/148 |

LINE # SOURCE TEXT

```
         temp = target_pin->min_threshold;
         target_pin->min_threshold = target_pin->max_threshold;
         target_pin->max_threshold = temp;
      }
      DPRINTF(("delay found: %d - %d\n",
               target_pin->min_threshold, target_pin->max_threshold));

      if ((measurement_mode == EARLYSAMPLETRIGGERMODE) &&
          ((def_ptr->pin_table[target_pin_number].clk_format == R1) ||
           (def_ptr->pin_table[target_pin_number].clk_format == R0))) {
         min_range = extra_def_ptr->r1_or_rz_min_threshold;
      } else {
         lm_tmg_get_minimum_sample_ramp_setting(&min_sample_ramp0,
                                                &min_sample_ramp1,
                                                &min_sample_ramp2,
                                                &min_sample_ramp3);
         switch (resolution) {
            case RESOLUTION_05_NS:
               min_range = min_sample_ramp0;
               break;
            case RESOLUTION_10_NS:
               min_range = min_sample_rampl;
               break;
            case RESOLUTION_20_NS:
               min_range = min_sample_ramp2;
               break;
            case RESOLUTION_40_NS:
               min_range = min_sample_ramp3;
               break;
            default:
               min_range = 0xff;
               break;
         }
      }

      uwb_ptr = &pn_to_short_offset[target_pin_number];
      unitno = uwb_ptr->unitno;
      wordno = uwb_ptr->wordno;
      bitno = uwb_ptr->bitno;

      result = read_ptra_bit(&two_state_result[unitno], wordno, bitno);
      if (result == target_pin->expected_value) {
         if (target_pin->min_threshold <= min_range + SWEEP_RANGE) {
            DPRINTF(("pn: %d --> delay not found\n", target_pin_number));
            target_pin->delay_found = FALSE;
         } else {
            target_pin->delay_found = TRUE;
         }
      } else {
         target_pin->delay_found = TRUE;
      }

      DPRINTF(("delay found after sweep: %d - %d\n",
               target_pin->min_threshold, target_pin->max_threshold));

      DPRINTF(("exiting measure_pin\n"));

      return (SUCCESS);
}

#ifdef DBASE
setup_final_tm_result(total_pin_count)
u_short                      total_pin_count;
{
   u_short                   i;
   long                      pin_number;
   u_long                    expected_time;
   char                      line[80];

   DPRINTF(("enter final tm result; end with pin number == -1\n"));

   for (i = 0; i < total_pin_count; ++i) {
      tm_result_array[i].resolution = RESOLUTION_INVALID;
      tm_result_array[i].expected_time = MAX_SAMPLE_RAMP_RANGE - SWEEP_RANGE;
      tm_result_array[i].set_by_user = FALSE;
   }

   while (1) {
      DPRINTF(("pin_number: "));
      gets(line);
      sscanf(line, "%d", &pin_number);

      if (pin_number == -1)
         break;

      DPRINTF(("expected value: "));
      gets(line);

      if (strcmp(line, "0") == 0) {
         tm_result_array[pin_number].steady_state_full_value = LOGIC_0;
         tm_result_array[pin_number].two_state_value = LOGIC_0;
      } else if (strcmp(line, "1") == 0) {
         tm_result_array[pin_number].steady_state_full_value = LOGIC_1;
         tm_result_array[pin_number].two_state_value = LOGIC_1;
      } else if (strcmp(line, "Z0") == 0) {
         tm_result_array[pin_number].steady_state_full_value = LOGIC_Z0;
         tm_result_array[pin_number].two_state_value = LOGIC_0;
      } else if (strcmp(line, "Z1") == 0) {
         tm_result_array[pin_number   ~eady_state_full_value = LOGIC_Z1;
         tm_result_array[pin_number]._.o_state_value = LOGIC_1;
      } else if (strcmp(line, "U") == 0) {
         tm_result_array[pin_number].steady_state_full_value = LOGIC_U;
         tm_result_array[pin_number].two_state_value = LOGIC_0;
      } else {
         DPRINTF(("illegal value. ignored\n"));
         continue;
      }

      DPRINTF(("expected time: "));
      gets(line);
      sscanf(line, "%d", &expected_time);

      tm_result_array[pin_number].resolution = RESOLUTION_05_NS;
      tm_result_array[pin_number].expected_time = expected_time;
      tm_result_array[pin_number].set_by_user = TRUE;
   }
}

#endif
```

Copyright 1989 Logic Modeling Systems

SOURCE PROGRAM lm1000/tmeas.c

DATE 5/23/89 TIME 6:14:50 pm

LINE # SOURCE TEXT

```
accumulate_ident_pins(source, dest, total_unit)
PTRN_BITS_LONGWORD   *source;
PTRN_BITS_LONGWORD   *dest;
u_char                total_unit;
{
   u_long              *source_ptr;
   u_long              *dest_ptr;
   u_char               total_word;
   u_char               wordno;

   total_word = total_unit * 3;
   source_ptr = (u_long *) source;
   dest_ptr = (u_long *) dest;

   for (wordno = 0; wordno < total_word; ++wordno)
      dest_ptr[wordno] |= source_ptr[wordno];
}

/* COMMENTED CODE
build_pn_list(def_ptr, total_unit, ident_data_change_ptr, pin_name_list)
DEVICE_SPEC           *def_ptr;
u_char                 total_unit;
PTRN_BITS_LONGWORD   *ident_data_change_ptr;
char                  *pin_name_list;
{
   u_long               mask;
   u_long               ident_data_change;
   u_short              unit_pin_number_offset;
   u_short              word_pin_number_offset;
   u_short              pin_number;
   u_char               unitno;
   u_char               wordno;
   char                 bitno;
   u_char               max_string_length;

   max_string_length = MAX_PIN_NAME_LIST - 5;

   pin_name_list[0] = '\0';
   unit_pin_number_offset = 0;
   for (unitno = 0; unitno < total_unit; ++unitno) {
      word_pin_number_offset = unit_pin_number_offset + 79;
      for (wordno = 0; wordno < 3; ++wordno) {
         ident_data_change = ident_data_change_ptr[unitno].word[wordno];
         for (bitno = 31; bitno >= 0; --bitno) {
            if (ident_data_change == 0)
               break;
            mask = bitno_to_mask[bitno];
            if (ident_data_change & mask) {
               ident_data_change ^= mask;
               pin_number = word_pin_number_offset + bitno - 31;

               if (strlen(pin_name_list) +
                  strlen(def_ptr->pin_table[pin_number].pin_name) + 1 <=
                                                max_string_length) {
                  (void)strcat(pin_name_list,
                              def_ptr->pin_table[pin_number].pin_name);
                  (void)strcat(pin_name_list, " ");

               }
               else {
                  (void)strcat(pin_name_list, "...");
                  return(SUCCESS);
               }
            }
         }
         word_pin_number_offset -= 32;
      }
      unit_pin_number_offset += 80;
   }

   return(SUCCESS);
}

END COMMENTED CODE
*/

get_composite_eval_pin_delay(def_ptr, instance, tm_pin_info_table,
                             event_pin_number, event_pin_count,
                             measurement_mode, resolution,
                             comp_eval_min_delay, comp_eval_max_delay)
DEVICE_SPEC          *def_ptr;
INSTANCE_INFO        *instance;
TM_PIN_INFO          *tm_pin_info_table;
u_short              *event_pin_number;
u_char                event_pin_count;
u_char                measurement_mode;
u_char                resolution;
long                 *comp_eval_min_delay;
long                 *comp_eval_max_delay;
{

   u_char               i;
   TM_PIN_INFO         *event_pin;
   long                 min_event_pin_delay;
   long                 max_event_pin_delay;
   u_long               measurement_error;

   /* Convert the range found in measure_pin() to real delay in picosec */
   /* Find the min-max skew of all EVAL pins in terms of register setting */
   min_event_pin_dela,  MAX_SAMPLE_RAMP_RANGE - SWEEP_RANGE;
   max_event_pin_delay = 0;

   if (measurement_mode == EDGE7SAMPLETRIGGERMODE) {
      for (i = 0; i < event_pin_count; ++i) {
         event_pin = &tm_pin_info_table[event_pin_number[i]];

         if (event_pin->delay_found == FALSE) {
            lm_queue_message(ERROR_MSG, "internal error: event pin: %s of instance: %s delay not found",
                             def_ptr->pin_table[event_pin_number[i]].pin_name,
                             instance->device_info_string);
            return (FAILURE);
         } else {
            if (event_pin->min_threshold < min_event_pin_delay)
               min_event_pin_delay = event_pin->min_threshold;
            if (event_pin->max_threshold > max_event_pin_delay)
               max_event_pin_delay = event_pin->max_threshold;
         }
      }

      /* Convert the min-max skew to picosec */
```

Copyright 1989
Logic Modeling Systems

SOURCE PROGRAM lm1000/tmeas.c

DATE 5/23/89 TIME 6:14:50 pm

LINE # SOURCE TEXT

```
        lm_tmg_get_sample_ramp_delay(resolution,
                                     (u_char) min_event_pin_delay,
                                     &min_event_pin_delay,
                                     &measurement_error);
        min_event_pin_delay -= measurement_error;

        lm_tmg_get_sample_ramp_delay(resolution,
                                     (u_char) max_event_pin_delay,
                                     &max_event_pin_delay,
                                     &measurement_error);
        max_event_pin_delay += measurement_error;
    } else {
        /* Using EARLY SAMPLE mode */
        for (i = 0; i < event_pin_count; ++i) {
            event_pin = &tm_pin_info_table[event_pin_number[i]];

            if (resolution == RESOLUTION_05_NS) {
                if (event_pin->delay_found == FALSE) {
                    lm_queue_message(ERROR_MSG, "internal error: event pin: %s of instance: %s delay not found",
                                     def_ptr->pin_table[event_pin_number[i]].pin_name,
                                       instance->device_info_string);
                    return (FAILURE);
                }
            } else {
                break;
            }
        }

        if (i == event_pin_count) {
            /* All of the event pin delays are found. */

            for (i = 0; i < event_pin_count; ++i) {
                event_pin = &tm_pin_info_table[event_pin_number[i]];

                /* Save the delays in gbl_eval_min/max_delay[] */
                lm_tmg_get_sample_ramp_delay(resolution,
                                             event_pin->min_threshold,
                                             &gbl_eval_min_delay[i],
                                             &measurement_error);
                gbl_eval_min_delay[i] -= measurement_error;

                lm_tmg_get_sample_ramp_delay(resolution,
                                             event_pin->max_threshold,
                                             &gbl_eval_max_delay[i],
                                             &measurement_error);
                gbl_eval_max_delay[i] += measurement_error;

                /* Calculate the worst case threshold */
                if (event_pin->min_threshold < min_event_pin_delay)
                    min_event_pin_delay = event_pin->min_threshold;
                if (event_pin->max_threshold > max_event_pin_delay)
                    max_event_pin_delay = event_pin->max_threshold;
            }

            /* Convert the min-max skew to picosec */
            lm_tmg_get_sample_ramp_delay(resolution,
                                         (u_char) min_event_pin_delay,
                                         &min_event_pin_delay,
                                         &measurement_error);
            min_event_pin_delay -= measurement_error;

            lm_tmg_get_sample_ramp_delay(resolution,
                                         (u_char) max_event_pin_delay,
                                         &max_event_pin_delay,
                                         &measurement_error);
            max_event_pin_delay += measurement_error;
        } else {

            /*
             * Not all of the event pin delays are found. Use the delays from
             * previous resolution.
             */

            min_event_pin_delay = MAXINT;
            max_event_pin_delay = 0;

            for (i = 0; i < event_pin_count; ++i) {
                event_pin = &tm_pin_info_table[event_pin_number[i]];

                if (gbl_eval_min_delay[i] < min_event_pin_delay)
                    min_event_pin_delay = gbl_eval_min_delay[i];
                if (gbl_eval_max_delay[i] > max_event_pin_delay)
                    max_event_pin_delay = gbl_eval_max_delay[i];
            }
        }
    }

    *comp_eval_min_delay = min_event_pin_delay;
    *comp_eval_max_delay = max_event_pin_delay;

    return (SUCCESS);
}
```

Copyright 1989
Logic Modeling Systems

SOURCE PROGRAM lm1000/util.c | DATE 5/23/89 | TIME 6:14:53 pm | PAGE # 1/151

LINE # SOURCE TEXT

```
/* SCCS_ID: util.c rev 3.2, 5/9/89 at 11:02:18      */

#include "common.h"
#include "device.h"
#include "message.h"
#include "hardware.h"
#include "lm_rd_wr.h"
#include "mod_err.h"
#include "nvram.h"
#include "eeprom.h"
#include "lmserver.h"
#include "function.h"
#include "protcmd.h"
#include "protans.h"
#include "tmg.h"
#include "lm_sfi.h"

#ifdef MODELER
#include "vrtx.h"
#endif

#define lm_tmg_lane_select(ident_lane)  (tmgptr->lane_enable = ident_lane)

extern LM_HARDWARE_ERROR modeler_error;
extern CONFIGURATION_ERRORS config_error;

extern TMG *tmgptr;

u_long  lm_loop_pattern_count;

init()
{
   PTRN_BITS *ptrn_bits_ptr;
   u_short i, j;
   u_long mask;
   u_short pin_number;
   u_char  unit_pin_number;

#ifndef MODELER
   /* ???? need to substitute VRTX library lm_timer() and lm_delay() */
   inittimer();
#endif

   profile_init();

   init_config_error();

   /* initialize data structure */
   for (i = 0; i < MAX_USER_COUNT; ++i) {
      user_info_array[i] = (USER_INFO *)
                          DCALLOC((unsigned)1,
                                  (unsigned)sizeof(USER_INFO));
      if (user_info_array[i] == NULL)
         fatal_alloc_error();
   }

   /* initialize the dab_list array to NULL */
   for (i = 0; i < MAX_LANE_COUNT * MAX_SLOT_COUNT; ++i)
      dab_list[i] = NULL;

   /* initialize misc variables */
   system_config = NULL;

   for (i = 0; i < MAX_FUNCTION; i++)
      function_array[i] = process_no_suc\;

   function_array[(CREATE_DEF_CMD      - 2) / 2] = process_create_def_cmd;
   function_array[(CREATE_INSTANCE_CMD - 2) / 2] = process_create_instance_cmd;
   function_array[(CREATE_FAULT_CMD    - 2) / 2] = process_create_fault_cmd;

   function_array[(RELEASE_DEF_CMD     - 2) / 2] = process_release_def_cmd;
   function_array[(RELEASE_INSTANCE_CMD- 2) / 2] = process_release_instance_cmd;
   function_array[(RELEASE_FAULT_CMD   - 2) / 2] = process_release_fault_cmd;

   function_array[(EVAL_CMD            - 2) / 2] = process_eval_cmd;

   function_array[(SAVE_DEF_CMD        - 2) / 2] = process_save_def_cmd;
   function_array[(SAVE_PTRN_CMD       - 2) / 2] = process_save_ptrn_cmd;
   function_array[(SAVE_PTRN_CONT_CMD  - 2) / 2] = process_save_ptrn_cont_cmd;
   function_array[(RESTORE_INST_CMD    - 2) / 2] = process_restore_inst_cmd;
   function_array[(RESTORE_PTRN_CMD    - 2) / 2] = process_restore_ptrn_cmd;
   function_array[(PTRN_HIST_CMD       - 2) / 2] = process_ptrn_hist_cmd;

   function_array[(INQ_MODELER_CMD     - 2) / 2] = process_inq_modeler_cmd;
   function_array[(INQ_USER_LIST_CMD   - 2) / 2] = process_inq_user_list_cmd;
   function_array[(INQ_USER_CMD        - 2) / 2] = process_inq_user_cmd;
   function_array[(INQ_LANE_CMD        - 2) / 2] = process_inq_lane_cmd;
   function_array[(INQ_PAM_CMD         - 2) / 2] = process_inq_pam_cmd;
   function_array[(INQ_PEL_CMD         - 2) / 2] = process_inq_pel_cmd;
   function_array[(INQ_DEVICE_LIST_CMD - 2) / 2] = process_inq_device_list_cmd;
   function_array[(INQ_DEVICE_NAME_CMD - 2) / 2] = process_inq_device_name_cmd;
   function_array[(INQ_DEVICE_CMD      - 2) / 2] = process_inq_device_cmd;
   function_array[(INQ_DAB_CMD         - 2) / 2] = process_inq_dab_cmd;
   function_array[(INQ_DAB_LOC_CMD     - 2) / 2] = process_inq_dab_loc_cmd;
   function_array[(INQ_INSTANCE_CMD    - 2) / 2] = process_inq_instance_cmd;
   function_array[(INQ_FAULT_CMD       - 2) / 2] = process_inq_fault_cmd;

   function_array[(INQ_AVAIL_PTRN_CMD  - 2) / 2] = process_inq_avail_ptrn_cmd;

   function_array[(TMEASUREMENT_CMD    - 2) / 2] = process_tmeasurement_cmd;

   function_array[(LOOP_PTRN_CMD       - 2) / 2] = process_loop_ptrn_cmd;

   function_array[(RESET_INST_CMD      - 2) / 2] = process_reset_inst_cmd;

   function_array[(TEST_NETWORK_CMD    - 2) / 2] = process_test_network_cmd;

   function_array[(ABORT_CMD           - 2) / 2] = process_abort_cmd;

   function_array[(BEGIN_SESSION_CMD   - 2) / 2] = process_begin_session_cmd;

   function_array[(LABEL_DAB_CMD       - 2) / 2] = process_label_dab_cmd;

   function_array[(EVAL_CONTROL_CMD    - 2) / 2] = process_eval_control_cmd;

   function_array[(REBOOT_CMD          - 2) / 2] = process_reboot_cmd;
   function_array[(SHUTDOWN_CMD        - 2) / 2] = process_shutdown_cmd;

   function_array[(CHECK_DABDEF_CMD    - 2) / 2] = process_check_dabdef_cmd;
```

Copyright 1989
Logic Modeling Systems

SOURCE PROGRAM lm1000/util.c

DATE 5/23/89 TIME 6:14:53 pm

LINE # SOURCE TEXT

```
    function_array[(READ_CMD              - 2) / 2] = process_lm_read;
    function_array[(WRITE_CMD             - 2) / 2] = process_lm_write;

    function_array[(SAVE_DEF_CONT_CMD     - 2) / 2] = process_save_def_cont_cmd;
    function_array[(PASSWORD_CMD          - 2) / 2] = process_password_cmd;

    /* initialize feedback block count array */
    for (i = 0; i < MAX_LANE_COUNT; ++i)
       for (j = 0; j < MAX_PAM_COUNT; ++j) {
          fb_block_count_array[i].PAM_max_addr[j] = MAXINT;
          fb_block_count_array[i].feedback_block_count[j] = 0;
       }

    /* initialize the dummy pattern */
    gbl_dummy_ptrn = (PTRN_BITS *)DCALLOC((unsigned)MAX_UNIT_COUNT,
                                          (unsigned)sizeof(PTRN_BITS));
    if (gbl_dummy_ptrn == NULL)
       fatal_alloc_error();

    ptrn_bits_ptr = gbl_dummy_ptrn;
    for (i = 0; i < MAX_UNIT_COUNT; ++i) {
       set_pel_ctl(&ptrn_bits_ptr->ctl, PEL_CTL_SELECT_PEL);
       ++ptrn_bits_ptr;
    }

    /* initialize Word Mask Table which is used to convert bit number to
     * bit mask. */
    for (i = 0, mask = 1; i < 32; ++i, mask <<= 1) {
       bitno_to_mask[i] = mask;
    }

    /* Initialize global full_value structure */
    allocate_full_value(&gbl_new_sample_value);
    allocate_full_value(&gbl_steady_state_result);
    allocate_full_value(&gbl_temp_steady_state_result);

    /* Initialize BIT_TO_LOGIC_TABLE */
    bit_to_logic_table[0x0]  =  LOGIC_0;
    bit_to_logic_table[0x1]  =  LOGIC_1;
    bit_to_logic_table[0x2]  =  LOGIC_S0;
    bit_to_logic_table[0x3]  =  LOGIC_S1;

    bit_to_logic_table[0x4]  =  LOGIC_Z0;
    bit_to_logic_table[0x5]  =  LOGIC_Z1;
    bit_to_logic_table[0x6]  =  LOGIC_Z0;
    bit_to_logic_table[0x7]  =  LOGIC_Z1;

    bit_to_logic_table[0x8]  =  LOGIC_U;
    bit_to_logic_table[0x9]  =  LOGIC_U;
    bit_to_logic_table[0xa]  =  LOGIC_U;
    bit_to_logic_table[0xb]  =  LOGIC_U;
    bit_to_logic_table[0xc]  =  LOGIC_U;
    bit_to_logic_table[0xd]  =  LOGIC_U;
    bit_to_logic_table[0xe]  =  LOGIC_U;
    bit_to_logic_table[0xf]  =  LOGIC_U;

    /* initialize pin_number to unitno, wordno, bitno offset array */
    for (pin_number = 0; pin_number < MAX_PIN_COUNT; ++pin_number) {

       pn_to_short_offset[pin_number].unitno = pin_number / 80;
       unit_pin_number = pin_number % 80;
       pn_to_short_offset[pin_number].wordno = (79 - unit_pin_number) / 16;
       pn_to_short_offset[pin_number].bitno  = 15 - (79 - unit_pin_number) % 16;

    }

#ifdef DBASE
    /* initialize data base */
    db_init();
#endif
}

allocate_full_value(full_value_ptr)
FULL_VALUE *full_value_ptr;
{
    full_value_ptr->data =
       (PTRN_BITS *)DCALLOC((unsigned)MAX_UNIT_COUNT,
                            (unsigned)sizeof(PTRN_BITS));
    if (full_value_ptr->data == NULL)
       fatal_alloc_error();

    full_value_ptr->hiz =
       (PTRN_BITS *)DCALLOC((unsigned)MAX_UNIT_COUNT,
                            (unsigned)sizeof(PTRN_BITS));
    if (full_value_ptr->hiz == NULL)
       fatal_alloc_error();

    full_value_ptr->unknown =
       (PTRN_BITS *)DCALLOC((unsigned)MAX_UNIT_COUNT,
                            (unsigned)sizeof(PTRN_BITS));
    if (full_value_ptr->unknown == NULL)
       fatal_alloc_error();

    full_value_ptr->soft =
       (PTRN_BITS *)DCALLOC((unsigned)MAX_UNIT_COUNT,
                            (unsigned)sizeof(PTRN_BITS));
    if (full_value_ptr->soft == NULL)
       fatal_alloc_error();

}

SYSTEM_INFO *
new_system_info()
{
    SYSTEM_INFO *temp;
    u_char i;

    temp = (SYSTEM_INFO *)DCALLOC((unsigned)1,
                                  (unsigned)sizeof(SYSTEM_INFO));
    if (temp == NULL)
       fatal_alloc_error();

    for (i = 0; i < MAX_LANE_COUNT; ++i)
       temp->lane[i] = NULL;
    return(temp);
}

LANE_INFO *
new_lane_info()
{
```

Copyright 1989
Logic Modeling Systems

| SOURCE PROGRAM | DATE | PAGE # |
|---|---|---|
| lm1000/util.c | 5/23/89 | 3/153 |
| | TIME 6:14:53 pm | |

LINE # SOURCE TEXT

```
    LANE_INFO *temp;
    u_char i;

    temp = (LANE_INFO *)DCALLOC((unsigned)1, (unsigned)sizeof(LANE_INFO));
    if (temp == NULL)
       fatal_alloc_er.  .);

    temp->pac_present = FALSE;

    for (i=0; i < MAX_PAM_COUNT; i++)
       temp->pam[i] = NULL;
    for (i=0; i < MAX_SLOT_COUNT; i++)
       temp->pel[i] = NULL;
    return(temp);
}

PEL_INFO *
new_pel_info()
{
    PEL_INFO *temp;

    temp = (PEL_INFO *)DCALLOC((unsigned)1, (unsigned)sizeof(PEL_INFO));
    if (temp == NULL)
       fatal_alloc_error();

    return(temp);
}

DAB_INFO *
new_dab_info()
{
    /* creates the DAB info */

    DAB_INFO *temp;
    u_char i;

    temp = (DAB_INFO *)DCALLOC((unsigned)1, (unsigned)sizeof(DAB_INFO));
    if (temp == NULL)
       fatal_alloc_error();

    temp->used_as_private = FALSE;

    for (i = 0; i <= MAX_SEGMENT_PER_DEVICE; ++i)
       temp->segment[i] = NULL;

    return(temp);
}

rls_dab_info(dab_ptr)
DAB_INFO *dab_ptr;
{
    u_char i;

    for (i = 0; i <= MAX_SEGMENT_PER_DEVICE; ++i)
       if (dab_ptr->segment[i] != NULL)
          DFREE((char *)dab_ptr->segment[i]);

    DFREE((char *)dab_ptr);
}

enter_dab_info(loc_dab_list, dab_ptr, laneno, slotno)
DAB_INFO *loc_dab_list[];
DAB_INFO *dab_ptr;
u_short laneno;
u_short slotno;
{

    u_char index;

    index = laneno * MAX_SLOT_COUNT + slotno;

    DPRINTF(("inside enter_dab_info; name: %s laneno: %d slotno: %d index: %d\n",
          dab_ptr->part_name, laneno, slotno, index));

    loc_dab_list[index] = dab_ptr;

}


find_dab(loc_dab_list, name, device_type)
DAB_INFO  *loc_dab_list[];
char *name;
u_char device_type;  /* PRIVATE or PUBLIC */
{
    /*
     * Find the dab name in the device list.
     * Return the index to dab_list if the name is found otherwise return -1
     */
    DAB_INFO   *dab_ptr;
    u_short     i;

    DPRINTF(("inside find_dab\n"));

    for (i = 0; i < MAX_LANE_COUNT * MAX_SLOT_COUNT; ++i) {
       dab_ptr = loc_dab_list[i];
       if (dab_ptr != NULL)
          if (strcmp(dab_ptr->part_name, name) == 0) {
             if (device_type == PRIVATE) {
                if ((dab_ptr->used_as_private == FALSE) &&
                    ((dab_ptr->act_inst_count + dab_ptr->act_var_count) == 0))
                   return(i);
             }
             else {
                if (dab_ptr->used_as_private == FALSE)
                   return(i);
             }
          }
    }

    return(-1);

}

PAM_INFO *
new_pam_info()
{
    PAM_INFO *temp;

    temp = (PAM_INFO *)DCALLOC((unsigned)1, (unsigned)sizeof(PAM_INFO));
    if (temp == NULL)
```

Copyright 1989
Logic Modeling Systems

SOURCE PROGRAM lm1000/util.c | DATE 5/23/89 | TIME 6:14:53 pm | PAGE # 4/154

LINE # SOURCE TEXT

```
        fatal_alloc_error();

    return(temp);
}

SEGMENT_EL
new_segment()
{
    SEGMENT_EL *temp;

    temp = (SEGMENT_EL *)DCALLOC((unsigned)1, (unsigned)sizeof(SEGMENT_EL));
    if (temp == NULL)
        fatal_alloc_error();

    return(temp);
}

set_last_in_lane(dab_ptr)
DAB_INFO *dab_ptr;
{
    /* setup the following field in dab_info:
     *          last_in_lane
     *          lane_used field
     *          lane_count
     *          unit_count_per_lane
     *          dummy_ptrs
     *          ident_lane
     */

    char last_lane_found[MAX_LANE_COUNT];
    char unit_count[MAX_LANE_COUNT];
    u_char laneno;
    u_char i;
    u_char ident_lane = 0;
    u_char count;
    u_char any_used_slotno_on_lane[MAX_LANE_COUNT];

    for (laneno = 0; laneno < MAX_LANE_COUNT; ++laneno) {
        last_lane_found[laneno] = 0;
        unit_count[laneno]      = 0;
    }

    count = dab_ptr->unit_count;
    for (i = 0; i < count; ++i) {

        laneno = dab_ptr->unit_location[i].lane_no;

        dab_ptr->lane_used[laneno] = 1;

        if (last_lane_found[laneno] == 0) {

            dab_ptr->unit_location[i].last_in_lane = 1;
            last_lane_found[laneno] = 1;

            ident_lane |= 1 << laneno;

        }

        any_used_slotno_on_lane[laneno] = dab_ptr->unit_location[i].slot_no;

        ++unit_count[laneno];
    }

    dab_ptr->ident_lane = ident_lane;

    for (laneno = 0; laneno < MAX_LANE_COUNT; ++laneno) {
        if (dab_ptr->lane_used[laneno]) {
            ++dab_ptr->lane_count;

            if (unit_count[laneno] > dab_ptr->unit_count_per_lane)
                dab_ptr->unit_count_per_lane = unit_count[laneno];

            dab_ptr->dummy_ptrs[laneno].word[2] =
                DUMMY_CTL_WORD(any_used_slotno_on_lane[laneno]);
        }
    }
}

fb_block_count_for_PAM(memsize)
u_long memsize;
{
    switch (memsize) {
    case PAM128K_PTRN_COUNT:
        return(PAM128K_FB_BLOCK_COUNT);
    case PAM512K_PTRN_COUNT:
        return(PAM512K_FB_BLOCK_COUNT);
    case PAM2M_PTRN_COUNT:
        return(PAM2M_FB_BLOCK_COUNT);
    default:
        return(0);
    }
}

prepare_user(user_id)
u_char user_id;
{
    USER_INFO     *temp;
    INSTANCE_INFO **inst_ptr;
    DEVICE_SPEC   **def_ptr;
    u_char         j;

    DPRINTF(("inside prepare_user() user_id: %d\n", user_id));

    temp = user_info_array[user_id];
    temp->good_password = FALSE;
    temp->active = TRUE;
    temp->fd = -1;
    temp->time_scale = 1;
    temp->half_time_scale = 0;
    temp->divide_delay = FALSE;
    temp->save_buffer = NULL;
    temp->save_buffer_offset = -1;

    /* create the instance table for this user */
    temp->inst_table_size = INST_TABLE_SIZE;
    temp->instance = (INSTANCE_INFO **)
        DMALLOC((unsigned)(INST_TABLE_SIZE * sizeof(INSTANCE_INFO *)));
    if (temp->instance == NULL)
        return(FAILURE);
```

Copyright 1989
Logic Modeling Systems

SOURCE PROGRAM lm1000/util.c

DATE 5/23/89 TIME 6:14:53 pm PAGE # 5/155

LINE # SOURCE TEXT

```
    inst_ptr = (INSTANCE_INFO **)&temp->instance[1];
    for (j = 0; j < (INST_TABLE_SIZE - 1); ++j) {
        temp->instance[j] = (INSTANCE_INFO *)inst_ptr;
        ++inst_ptr;
    }
    temp->instance[j] = NULL;
    temp->free_inst_id = temp->instance;

    /* create the definition table for this user */
    temp->def_table_size = DEF_TABLE_SIZE;
    temp->definition = (DEVICE_SPEC **)
        DMALLOC((unsigned)(DEF_TABLE_SIZE * sizeof(DEVICE_SPEC *)));
    if (temp->definition == NULL)
        return(FAILURE);

    def_ptr = (DEVICE_SPEC **)&temp->definition[1];
    for (j = 0; j < (DEF_TABLE_SIZE - 1); ++j) {
        temp->definition[j] = (DEVICE_SPEC *)def_ptr;
        ++def_ptr;
    }

    temp->definition[j] = NULL;
    temp->free_def_id = temp->definition;

    return(SUCCESS);
}

abort_user(user)
USER_INFO   *user;
{
    DAB_INFO           *dab_ptr;
    DEVICE_SPEC        *definition;
    INSTANCE_INFO      *instance;
    EXTRA_DEVICE_SPEC  *extra_def_ptr;
    u_long              pattern_counth;
    u_long              pattern_countl;
    u_long              longest_pattern_seq;
    u_long              cur_pattern_count;
    u_short             def_count;
    u_short             inst_count;
    u_short             fault_count;
    u_short             i;
    u_char              lane_count;
    u_char              laneno;

    DPRINTF(("Inside abort_user\n"));

    if (user->active == FALSE) {
        lm_queue_message(ERROR_MSG, "internal error: attempt to release unused user");
        return;
    }

    if (user->save_buffer != NULL) {
        DFREE(user->save_buffer);
    }

    pattern_countl      = 0;
    pattern_counth      = 0;
    longest_pattern_seq = 0;
    def_count           = 0;
    inst_count          = 0;
    fault_count         = 0;
    lane_count          = 0;

    /* Free instances */
    for (i = 0; i < user->inst_table_size; ++i) {
        instance = user->instance[i];

        /* check if its a valid instance */
        if (BOGUS_INSTANCE(user, instance))
            continue;

        extra_def_ptr = (EXTRA_DEVICE_SPEC *)instance->definition->extra_data;

        for (laneno = 0; laneno < MAX_LANE_COUNT; ++laneno) {
            if (extra_def_ptr->lane_used & 1 << laneno)
                ++lane_count;
        }

        cur_pattern_count = instance->pattern_count * lane_count;

        add_64(&pattern_counth, &pattern_countl, (u_long)0, cur_pattern_count);

        if (cur_pattern_count > longest_pattern_seq)
            longest_pattern_seq = cur_pattern_count;

        return_all_ptrs_block(instance);

        if ((char)instance->dab_info_index != -1) {
            dab_ptr = dab_list[instance->dab_info_index];

            if (instance->is_fault == TRUE) {
                --dab_ptr->act_var_count;
                ++fault_count;
            }
            else {
                --dab_ptr->act_inst_count;
                ++inst_count;
            }

            if (dab_ptr->used_as_private == TRUE) {
                dab_ptr->used_as_private = FALSE;

                set_private_mode(dab_ptr, FALSE);
            }

            if ((dab_ptr->act_inst_count + dab_ptr->act_var_count) == 0)
                turn_off_in_use(dab_ptr);
        }

        rls_instance(user, i);
    }

    /* Free definitions */
    for (i = 0; i < user->def_table_size; ++i) {
        definition = user->definition[i];

        /* check if its a valid definition */
        if (BOGUS_DEFINITION(user, definition))
            continue;
```

Copyright 1989 Logic Modeling Systems

| SOURCE PROGRAM | DATE | 5/23/89 | PAGE # |
|---|---|---|---|
| lm1000/util.c | TIME | 6:14:53 pm | 6/156 |

LINE # SOURCE TEXT

```
        ++def_count;
        rls_definition(user, 1);
    }

    /* free the definition and instance tables */
    DFREE((char *)user->definition);
    DFREE((char *)user->instance);

    user->active = FALSE;

    write_user_stat(pattern_countb, pattern_countl, longest_pattern_seq,
                    def_count, inst_count, fault_count);

    DPRINTF(("exiting abort_user\n"));
}

new_and_link_definition(user, def_ptr, def_id_table_index)
USER_INFO       *user;
DEVICE_SPEC     *def_ptr;
u_short         *def_id_table_index;
{

    DEVICE_SPEC **slot_ptr;

    DPRINTF(("inside new_and_link_definition\n"));

    if (user->free_def_id == NULL)
        if (extend_def_table(user) == FAILURE)
            return(FAILURE);

    slot_ptr = user->free_def_id;

    *def_id_table_index = (u_short)
        (((u_long)slot_ptr - (u_long)user->definition) / sizeof(DEVICE_SPEC *));

    user->free_def_id = (DEVICE_SPEC **)*slot_ptr;
    *slot_ptr = def_ptr;

    def_ptr->extra_data = (char *)DCALLOC((unsigned)1,
                                   (unsigned)sizeof(EXTRA_DEVICE_SPEC));
    if (def_ptr->extra_data == NULL)
        return(FAILURE);

    ((EXTRA_DEVICE_SPEC *)def_ptr->extra_data)->dab_ok = TRUE;

    return(SUCCESS);
}

allocate_initial_block(instance)
INSTANCE_INFO *instance;
{
    /* Allocate a new block in each lane used by this instance.
     * Setup the following fields:
     *     LANE_ADDR_INFO.max_addr
     *     LANE_ADDR_INFO.prev_max_addr
     *     LANE_ADDR_INFO.last_unit_addr
     *     LANE_ADDR_INFO.new_block_addr
     *     INSTANCE_INFO.pattern_count
     *     INSTANCE_INFO.unit_addr
     */

    DAB_INFO        *dab_ptr;
    LANE_ADDR_INFO  *lane_ptr;
    u_long           ptrn_addr_to_assign[MAX_LANE_COUNT];
    u_long          *temp_unit_addr;
    u_char           unit_processed[MAX_LANE_COUNT];
    u_char           unit_count[MAX_LANE_COUNT];
    u_char           laneno;
    u_char           unitno;
    u_char           i;
    u_char           dummy_unit_offset;
    u_char           junk;

    DPRINTF(("inside allocate_initial_block\n"));

    dab_ptr = dab_list[instance->dab_info_index];

    for (laneno = 0; laneno < MAX_LANE_COUNT; ++laneno) {
        lane_ptr = (LANE_ADDR_INFO *)&instance->lane_addr[laneno];
        if (dab_ptr->lane_used[laneno]) {

            lane_ptr->prev_max_addr = lane_ptr->max_addr;

            if (new_block(&lane_ptr->max_addr,
                          &junk,
                          PATTERN_BLOCK,
                          laneno) == FAILURE) {
                lm_queue_message(ERROR_MSG, "out of Fast Pattern Memory");
                instance->failed_to_alloc_ptrs = TRUE;
                return(FAILURE);
            }

            lane_ptr->max_addr += BLOCK_ADDR_INC;

            lane_ptr->last_unit_addr = lane_ptr->max_addr - BLOCK_ADDR_INC +
                (dab_ptr->unit_count_per_lane - 1) * PTRN_ADDR_INC;

            lane_ptr->new_block_addr = 0

            ptrn_addr_to_assign[laneno] = lane_ptr->max_addr - BLOCK_ADDR_INC;

        }
        else {
            ptrn_addr_to_assign[laneno] = 0;
        }

        /* Initialize unit_count[] and unit_processed[] to be used later */
        unit_count[laneno] = 0;
        unit_processed[laneno] = 0;
    }

    /* Calculate the number of actual units in each lane */
    for (unitno = 0; unitno < dab_ptr->unit_count; ++unitno)
        ++unit_count[dab_ptr->unit_location[unitno].lane_no];

    /* Assign the addresses for the dummy patterns */
    dummy_unit_offset = dab_ptr->unit_count + 1;
    temp_unit_addr = &instance->unit_addr[0][0];
    instance->cur_unit_addr_index = 0;
```

Copyright 1989 Logic Modeling Systems

SOURCE PROGRAM lm1000/util.c | DATE 5/23/89 | TIME 6:14:53 pm | PAGE # 7/157

LINE # SOURCE TEXT

```
   for (laneno = 0; laneno < MAX_LANE_COUNT; ++laneno) {

      if (dab_ptr->lane_used[laneno]) {

         for (i = 0; i < dab_ptr->unit_count_per_lane -
                                  unit_count[laneno]; ++i) {
            temp_unit_addr[dummy_unit_offset++] =
               ptrs_addr_to_assign[laneno];

            ptrs_addr_to_assign[laneno] += PTRN_ADDR_INC;
         }
      }
   }

   /* Assign the addresses for the actual units */
   for (unitno = 0; unitno < dab_ptr->unit_count; ++unitno) {

      temp_unit_addr[unitno] =
         ptrs_addr_to_assign[dab_ptr->unit_location[unitno].lane_no];

      ptrs_addr_to_assign[dab_ptr->unit_location[unitno].lane_no] +=
                                                      PTRN_ADDR_INC;
   }

   instance->pattern_count += dab_ptr->unit_count_per_lane;

   return(SUCCESS);
}

load_dummy_pattern(instance)
INSTANCE_INFO *instance;
{
   /* This routine builds some dummy patterns If necessary so that a proper
    * branch can be made to the feedback sequence.
    */

   DAB_INFO *dab_ptr;
   u_long   *temp_unit_addr;
   u_short   ptrs_count;
   u_short   dummy_ptrs_count;
   u_short   i;
   u_short   quiet_patterns;
   u_char    total_unit;
   u_char    bits_per_pin = 1;
   u_char    unitno;

   dab_ptr = dab_list[instance->dab_info_index];

   quiet_patterns = 4 + 3 * (dab_ptr->unit_count_per_lane * bits_per_pin);

   ptrs_count = quiet_patterns / dab_ptr->unit_count_per_lane;
   if (quiet_patterns % dab_ptr->unit_count_per_lane != 0)
      ++ptrs_count;

   ptrs_count += (instance->definition->pre_seq_len +
                 sizeof(PREAMBLE) / sizeof(PTRN_BITS *)) *
                 dab_ptr->unit_count_per_lane;

   dummy_ptrs_count = 0;

   if (ptrs_count % PTRN_PER_BLOCK <= BRANCH_LATENCY) {
      dummy_ptrs_count = (BRANCH_LATENCY - (ptrs_count % PTRN_PER_BLOCK) +
                          dab_ptr->unit_count_per_lane) /
                          dab_ptr->unit_count_per_lane;
   }

   if (((ptrs_count + dummy_ptrs_count) * dab_ptr->unit_count_per_lane) & 1) {
      /* There will be an odd number of unit patterns before the feedback
       * sequence. This means that the last unit pattern before the
       * feedback sequence will be on an even pattern address. The branch
       * command has to be specified 24 patterns before this last unit pattern,
       * so it will also be on even pattern address. Since the branch can only
       * be made from an odd pattern address, therefore we need to add ONE
       * UNIT of dummy pattern on each lane to make a proper branch.
       */
      adjust_pattern_addr(instance);

      write_pattern_unit(instance, dab_ptr->dummy_ptrs);

      /* Increment the address of each unit by PTRN_ADDR_INC. Also set the
       * LANE_ADDR_INFO.last_unit_addr correctly because it was modified by
       * adjust_pattern_addr(). We don't have to worry about going over
       * current block max address because this is the first pattern in
       * the block.
       */
      total_unit = dab_ptr->lane_count * dab_ptr->unit_count_per_lane;
      temp_unit_addr = &instance->unit_addr[instance->cur_unit_addr_index][0];
      for (unitno = 0; unitno < total_unit; ++unitno) {

         temp_unit_addr[unitno] += PTRN_ADDR_INC;
         if (dab_ptr->unit_location[unitno].last_in_lane)
            instance->lane_addr[dab_ptr->unit_location[unitno].lane_no].
               last_unit_addr = temp_unit_addr[unitno];
      }

      /* The pattern_count was subtracted in adjust_pattern_addr() */
      instance->pattern_count += dab_ptr->unit_count_per_lane;
   }

   for (i = 0; i < dummy_ptrs_count; ++i) {
      write_pattern(instance,
                    &instance->unit_addr[instance->cur_unit_addr_index][0],
                    gbl_dummy_ptrs);
      if (grow_pattern(instance) == FAILURE)
         return(FAILURE);
   }

   return(SUCCESS);
}

load_dummy_pattern2(instance)
INSTANCE_INFO *instance;
{
   /* This routine builds some dummy patterns so that the feedback signal
    * is quiet before we branch to the feedback sequence.
    */

   DAB_INFO *dab_ptr;
   u_short   dummy_ptrs_count;
   u_short   i;
```

Copyright 1989
Logic Modeling Systems

SOURCE PROGRAM lm1000/util.c

DATE 5/23/89 TIME 6:14:53 pm PAGE # 8/158

LINE # SOURCE TEXT

```
    u_short    quiet_patterns;
    u_char     bits_per_pin = 1;

    dab_ptr = dab_list[instance->dab_info_index];

    quiet_patterns = 4 + 3 * (dab_ptr->unit_count_per_lane * bits_per_pin);

    dummy_ptrn_count = quiet_patterns / dab_ptr->unit_count_per_lane;
    if (quiet_patterns % dab_ptr->unit_count_per_lane != 0)
       ++dummy_ptrn_count;


    for (i = 0; i < dummy_ptrn_count; ++i) {
       if (grow_pattern(instance) == FAILURE)
          return(FAILURE);

       write_pattern(instance,
                     &instance->unit_addr[instance->cur_unit_addr_index][0],
                     gbl_dummy_ptrn);
    }

    return(SUCCESS);
}

allocate_feedback_block(instance)
INSTANCE_INFO *instance;
{
    DAB_INFO *dab_ptr;
    u_long    addr_inc;
    u_long   *temp_unit_addr;
    u_char    laneno;
    u_char    unitno;

    dab_ptr = dab_list[instance->dab_info_index];

    /* Allocate feedback blocks on each lane used */
    for (laneno = 0; laneno < MAX_LANE_COUNT; ++laneno) {

       if (dab_ptr->lane_used[laneno]) {

          if (new_block(&instance->fb_block_addr[laneno],
                        &instance->fb_block_size[laneno],
                        FEEDBACK_BLOCK,
                        laneno) == FAILURE) {
             instance->failed_to_alloc_ptrn = TRUE;
             lm_queue_message(ERROR_MSG, "out of Fast Pattern Memory for feedback");
             return(FAILURE);
          }

       }

    }

    /* Calculate how much each unit address has to be incremented to get to
     * a new block. This number is the same for each lane since up to this
     * point the pattern grows at the same rate on each lane.
     */
    laneno = dab_ptr->unit_location[0].lane_no;
    addr_inc = instance->lane_addr[laneno].max_addr -
               (instance->lane_addr[laneno].last_unit_addr -
                (dab_ptr->unit_count_per_lane - 1) * PTRN_ADDR_INC);

    for (laneno = 0; laneno < MAX_LANE_COUNT; ++laneno) {

       if (dab_ptr->lane_used[laneno]) {

          /* Set the branch command and enable feedback. */
          set_branch(instance->lane_addr[laneno].last_unit_addr,
                     instance->fb_block_addr[laneno]);

          /* Adjust PREV_MAX_ADDR and MAX_ADDR */
          instance->lane_addr[laneno].prev_max_addr =
             instance->lane_addr[laneno].max_addr;

          instance->lane_addr[laneno].max_addr =
             instance->fb_block_addr[laneno] +
             instance->fb_block_size[laneno] * BLOCK_ADDR_INC;
       }

    }

    temp_unit_addr = &instance->unit_addr[instance->cur_unit_addr_index][0];
    for (unitno = 0; unitno < dab_ptr->unit_count; ++unitno) {
       laneno = dab_ptr->unit_location[unitno].lane_no;
       temp_unit_addr[unitno] = instance->fb_block_addr[laneno] +
          temp_unit_addr[unitno] + addr_inc -
          instance->lane_addr[laneno].prev_max_addr;
    }

    return(SUCCESS);
}

set_ptrn_bit(ptrn_ptr, wordno, bitno)
PTRN_BITS *ptrn_ptr;
u_char wordno;
u_char bitno;
{
    ptrn_ptr->word[wordno] |= (u_short)bitno_to_mask[bitno];
}

reset_ptrn_bit(ptrn_ptr, wordno, bitno)
PTRN_BITS *ptrn_ptr;
u_char wordno;
u_char bitno;
{
    ptrn_ptr->word[wordno] &= (u_short)~bitno_to_mask[bitno];
}

toggle_ptrn_bit(ptrn_ptr, wordno, bitno)
PTRN_BITS *ptrn_ptr;
u_char wordno;
u_char bitno;
{
    ptrn_ptr->word[wordno] ^= (u_short)bitno_to_mask[bitno];
}

read_ptrn_bit(ptrn_ptr, wordno, bitno)
PTRN_BITS *ptrn_ptr;
u_char wordno;
u_char bitno;
```

Copyright 1989 Logic Modeling Systems

SOURCE PROGRAM lm1000/util.c

DATE 5/23/89 TIME 6:14:53 pm PAGE # 9/159

LINE # SOURCE TEXT

```
{
   return((ptrn_ptr->word[wordno] & (u_short)bitno_to_mask[bitno]) || 0);
}

set_pin_value(full_value_ptr, unitno, wordno, bitno, pin_value)
FULL_VALUE *full_value_ptr;
u_char      unitno;
u_char      wordno;
u_char      bitno;
u_char      pin_value;
{

   switch (pin_value) {
   case LOGIC_0:
      reset_ptrn_bit(&full_value_ptr->data    [unitno], wordno, bitno);
      reset_ptrn_bit(&full_value_ptr->hiz     [unitno], wordno, bitno);
      reset_ptrn_bit(&full_value_ptr->unknown [unitno], wordno, bitno);
      reset_ptrn_bit(&full_value_ptr->soft    [unitno], wordno, bitno);
      break;
   case LOGIC_1:
      set_ptrn_bit  (&full_value_ptr->data    [unitno], wordno, bitno);
      reset_ptrn_bit(&full_value_ptr->hiz     [unitno], wordno, bitno);
      reset_ptrn_bit(&full_value_ptr->unknown [unitno], wordno, bitno);
      reset_ptrn_bit(&full_value_ptr->soft    [unitno], wordno, bitno);
      break;
   case LOGIC_Z0:
      reset_ptrn_bit(&full_value_ptr->data    [unitno], wordno, bitno);
      set_ptrn_bit  (&full_value_ptr->hiz     [unitno], wordno, bitno);
      reset_ptrn_bit(&full_value_ptr->unknown [unitno], wordno, bitno);
      reset_ptrn_bit(&full_value_ptr->soft    [unitno], wordno, bitno);
      break;
   case LOGIC_Z1:
      set_ptrn_bit  (&full_value_ptr->data    [unitno], wordno, bitno);
      set_ptrn_bit  (&full_value_ptr->hiz     [unitno], wordno, bitno);
      reset_ptrn_bit(&full_value_ptr->unknown [unitno], wordno, bitno);
      reset_ptrn_bit(&full_value_ptr->soft    [unitno], wordno, bitno);
      break;
   case LOGIC_U:
      reset_ptrn_bit(&full_value_ptr->data    [unitno], wordno, bitno);
      reset_ptrn_bit(&full_value_ptr->hiz     [unitno], wordno, bitno);
      set_ptrn_bit  (&full_value_ptr->unknown [unitno], wordno, bitno);
      reset_ptrn_bit(&full_value_ptr->soft    [unitno], wordno, bitno);
      break;
   case LOGIC_S0:
      reset_ptrn_bit(&full_value_ptr->data    [unitno], wordno, bitno);
      reset_ptrn_bit(&full_value_ptr->hiz     [unitno], wordno, bitno);
      reset_ptrn_bit(&full_value_ptr->unknown [unitno], wordno, bitno);
      set_ptrn_bit  (&full_value_ptr->soft    [unitno], wordno, bitno);
      break;
   case LOGIC_S1:
      set_ptrn_bit  (&full_value_ptr->data    [unitno], wordno, bitno);
      reset_ptrn_bit(&full_value_ptr->hiz     [unitno], wordno, bitno);
      reset_ptrn_bit(&full_value_ptr->unknown [unitno], wordno, bitno);
      set_ptrn_bit  (&full_value_ptr->soft    [unitno], wordno, bitno);
      break;
   default:
      break;
   }
}

read_pin_value(full_value_ptr, unitno, wordno, bitno)
FULL_VALUE  *full_value_ptr;
u_char      unitno;
u_char      wordno;
u_char      bitno;
{
   u_char index;

   index = read_ptrn_bit(&full_value_ptr->
                        unknown[unitno], wordno, bitno) << 3 |
           read_ptrn_bit(&full_value_ptr->
                        hiz[unitno], wordno, bitno)     << 2 |
           read_ptrn_bit(&full_value_ptr->
                        soft[unitno], wordno, bitno)    << 1 |
           read_ptrn_bit(&full_value_ptr->
                        data[unitno], wordno, bitno);

   return(bit_to_logic_table[index]);
}

/*---------------------------------------------------------------------*/
/* The following routines are cousins to the above routines. The difference
 * is that the wordno and bitno offsets are longword offsets.
 */

set_ptrn_bit_long(ptrn_ptr, wordno, bitno)
PTRN_BITS_LONGWORD *ptrn_ptr;
u_char wordno;
u_char bitno;
{
   ptrn_ptr->word[wordno] |= bitno_to_mask[bitno];
}

reset_ptrn_bit_long(ptrn_ptr, wordno, bitno)
PTRN_BITS_LONGWORD *ptrn_ptr;
u_char wordno;
u_char bitno;
{
   ptrn_ptr->word[wordno] &= ~bitno_to_mask[bitno];
}

toggle_ptrn_bit_long(ptrn_ptr, wordno, bitno)
PTRN_BITS_LONGWORD *ptrn_ptr;
u_char wordno;
u_char bitno;
{
   ptrn_ptr->word[wordno] ^= bitno_to_mask[bitno];
}

read_ptrn_bit_long(ptrn_ptr, wordno, bitno)
PTRN_BITS_LONGWORD *ptrn_ptr;
u_char wordno;
u_char bitno;
{
   return((ptrn_ptr->word[wordno] & bitno_to_mask[bitno]) || 0);
}

set_pin_value_long(full_value_ptr, unitno, wordno, bitno, pin_value)
FULL_VALUE *full_value_ptr;
u_char      unitno;
```

Copyright 1989
Logic Modeling Systems

SOURCE PROGRAM
lm1000/util.c

DATE 5/23/89
TIME 6:14:53 pm
PAGE # 10/160

LINE # SOURCE TEXT

```
u_char      wordno;
u_char      bitno;
u_char      pin_value;
{

    switch (pin_value) {
    case LOGIC_0:
        reset_ptrs_bit_long(&full_value_ptr->data    [unitno], wordno, bitno);
        reset_ptrs_bit_long(&full_value_ptr->hiz     [unitno], wordno, bitno);
        reset_ptrs_bit_long(&full_value_ptr->unkown  [unitno], wordno, bitno);
        reset_ptrs_bit_long(&full_value_ptr->soft    [unitno], wordno, bitno);
        break;
    case LOGIC_1:
        set_ptrs_bit_long  (&full_value_ptr->data    [unitno], wordno, bitno);
        reset_ptrs_bit_long(&full_value_ptr->hiz     [unitno], wordno, bitno);
        reset_ptrs_bit_long(&full_value_ptr->unkown  [unitno], wordno, bitno);
        reset_ptrs_bit_long(&full_value_ptr->soft    [unitno], wordno, bitno);
        break;
    case LOGIC_Z0:
        reset_ptrs_bit_long(&full_value_ptr->data    [unitno], wordno, bitno);
        set_ptrs_bit_long  (&full_value_ptr->hiz     [unitno], wordno, bitno);
        reset_ptrs_bit_long(&full_value_ptr->unknown [unitno], wordno, bitno);
        reset_ptrs_bit_long(&full_value_ptr->soft    [unitno], wordno, bitno);
        break;
    case LOGIC_Z1:
        set_ptrs_bit_long  (&full_value_ptr->data    [unitno], wordno, bitno);
        set_ptrs_bit_long  (&full_value_ptr->hiz     [unitno], wordno, bitno);
        reset_ptrs_bit_long(&full_value_ptr->unkown  [unitno], wordno, bitno);
        reset_ptrs_bit_long(&full_value_ptr->soft    [unitno], wordno, bitno);
        break;
    case LOGIC_U:
        reset_ptrs_bit_long(&full_value_ptr->data    [unitno], wordno, bitno);
        reset_ptrs_bit_long(&full_value_ptr->hiz     [unitno], wordno, bitno);
        set_ptrs_bit_long  (&full_value_ptr->unkown  [unitno], wordno, bitno);
        reset_ptrs_bit_long(&full_value_ptr->soft    [unitno], wordno, bitno);
        break;
    case LOGIC_S0:
        reset_ptrs_bit_long(&full_value_ptr->data    [unitno], wordno, bitno);
        reset_ptrs_bit_long(&full_value_ptr->hiz     [unitno], wordno, bitno);
        reset_ptrs_bit_long(&full_value_ptr->unkown  [unitno], wordno, bitno);
        set_ptrs_bit_long  (&full_value_ptr->soft    [unitno], wordno, bitno);
        break;
    case LOGIC_S1:
        set_ptrs_bit_long  (&full_value_ptr->data    [unitno], wordno, bitno);
        reset_ptrs_bit_long(&full_value_ptr->hiz     [unitno], wordno, bitno);
        reset_ptrs_bit_long(&full_value_ptr->unkown  [unitno], wordno, bitno);
        set_ptrs_bit_long  (&full_value_ptr->soft    [unitno], wordno, bitno);
        break;
    default:
        break;
    }
}

read_pin_value_long(full_value_ptr, unitno, wordno, bitno)
FULL_VALUE  *full_value_ptr;
u_char      unitno;
u_char      wordno;
u_char      bitno;
{
    u_char index;

    index = read_ptrs_bit_long(&full_value_ptr->
                       unkown[unitno], wordno, bitno) << 3 |
            read_ptrs_bit_long(&full_value_ptr->
                       hiz[unitno], wordno, bitno)    << 2 |
            read_ptrs_bit_long(&full_value_ptr->
                       soft[unitno], wordno, bitno)   << 1 |
            read_ptrs_bit_long(&full_value_ptr->
                       data[unitno], wordno, bitno);

    return(bit_to_logic_table[index]);
}

set_pel_ctl(word, value)
u_short *word;
u_char  value;
{
    *word = (*word & PEL_CTL_MASK) | (value << PEL_CTL_SHIFT);
}

set_pel_user_bit(word)
u_short *word;
{
    *word |= ~PEL_USER_MASK;
}

clear_pel_user_bit(word)
u_short *word;
{
    *word &= PEL_USER_MASK;
}


set_pel_sel(word, value)
u_short *word;
u_char  value;
{
    *word = (*word & PEL_SEL_MASK) | (value << PEL_SEL_SHIFT);
}

set_pel_br(word, value)
u_short *word;
u_char  value;
{
    *word = (*word & PEL_BRANCH_MASK) | (value << PEL_BRANCH_SHIFT);
}

new_block(address, count, type, laneno)
u_long *address;
u_char *count;
u_char laneno;
u_char type;
{
    /* if type == PATTERN_BLOCK  then allocate 1 block on specified lane
     * if type == FEEDBACK_BLOCK then allocate n blocks on specified lane
     * Return:
     *     SUCCESS
     *         the starting addr of the block, and count if can allocate block
     *     FAILURE
     *         if cannot allocate block
```

Copyright 1989 Logic Modeling Systems

SOURCE PROGRAM lm1000/util.c | DATE 5/23/89 | TIME 6:14:53 pm | PAGE # 11/161

LINE # SOURCE TEXT

```
     * Note make sure when allocating feedback blocks, that the starting block
     * be on the x block boundary (where x is the number of blocks required
     * on the PAM type).
     */

    u_long      temp;
    u_long      temp2;
    u_long      link_table_addr;
    u_long      value;
    u_long      value2;
    u_long      PAM_max_addr;
    u_short     block_no;
    u_char      i;
    u_char      pamno;
    u_char      needed;

    *address = NULL;

    switch (type) {
    case PATTERN_BLOCK:
       if (free_block_list[laneno] == NULL)
          return(FAILURE);

       temp = free_block_list[laneno];

       DPRINTF(("New block addr: %8X\n", temp));

       link_table_addr = ptol(temp);

       DPRINTF(("link_table_addr: %8X\n", link_table_addr));

       write_loc_long((u_long *)link_table_addr, (u_long)SEQ_END_BLOCK_FLAG);

       free_block_list[laneno] = read_loc_long((u_long *)temp);

       DPRINTF(("addr of prev link: %8X\n", free_block_list[laneno] + 4));
       write_loc_long((u_long *)(free_block_list[laneno] + 4), (u_long)NULL);
/*
       free_block_list[laneno] = temp->next;
       temp->prev = NULL;
*/

       *address = (u_long)temp;
       *count   = 1;

       break;
    case FEEDBACK_BLOCK:
       if (free_block_list[laneno] == NULL)
          return(FAILURE);

       temp = free_block_list[laneno];
       while (temp != NULL) {

          for (pamno = 0; pamno < MAX_PAM_COUNT; ++pamno) {
             if ((u_long)temp < fb_block_count_array[laneno].
                                              PAM_max_addr[pamno])
                break;
          }

          needed = fb_block_count_array[laneno].
                                     feedback_block_count[pamno];

          PAM_max_addr = fb_block_count_array[laneno].
                                     PAM_max_addr[pamno];

          /* check if temp is in "needed" boundary */
          block_no = ptob(temp);

          if (! (block_no & needed)) {
             /* Temp is pointing to a block which is on "needed" boundary.
              * Now check if ("needed" - 1) blocks after temp are free.
              */

             temp2 = temp + BLOCK_ADDR_INC;
             for (i = 0; i < (needed - 1); ++i) {

                /* break from the for loop if temp2 points to an address
                 * outside the current PAM address range.
                 */

                if ((u_long)temp2 >= PAM_max_addr)
                   break;

                link_table_addr = ptol(temp2);

                value = read_loc_long((u_long *)link_table_addr) &
                                                  BLOCK_NUMBER_MASK;

                if (value != FREE_BLOCK_FLAG)
                   break;   /* break from the for loop */

                temp2 += BLOCK_ADDR_INC;
             }

             if (i == (needed - 1))
                break;    /* break from the while loop */
          }

          temp = read_loc_long((u_long *)temp);
       }

       if (temp == NULL)
          return(FAILURE);

       /* We found usable feedback blocks */
       *address = (u_long)temp;
       *count = needed;

       /* Take off "needed" blocks from the free list starting at temp. */
       for (i = 0; i < needed; ++i) {

          DPRINTF(("New FB block addr: %8X\n", temp));

          link_table_addr = ptol(temp);

          write_loc_long((u_long *)link_table_addr, (u_long)SEQ_END_BLOCK_FLAG);

          value = read_loc_long((u_long *)(temp + 4));
```

Copyright 1989
Logic Modeling Systems

| SOURCE PROGRAM | DATE | TIME | PAGE # |
|---|---|---|---|
| lm1000/util.c | 5/23/89 | 6:14:53 pm | 12/162 |

LINE # SOURCE TEXT

```
            if (value == NULL) {
               free_block_list[laneno] = read_loc_long((u_long *)temp);
            }
            else {
               value = read_loc_long((u_long *)temp);
               value2 = read_loc_long((u_long *)(temp + 4));
               write_loc_long((u_long *)value2, value);
            }

            value = read_loc_long((u_long *)(temp + 4));
            value2 = read_loc_long((u_long *)temp);
            write_loc_long((u_long *)(value2 + 4), value);

            temp = read_loc_long((u_long *)temp);

/*
            if (temp->prev == NULL)
               free_block_list[laneno] = temp->next;
            else
               temp->prev->next = temp->next;

            temp->next->prev = temp->prev;
            temp = temp->next;
*/
         }

         break;
      default:
         return(FAILURE);
   }

   return(SUCCESS);
}

release_block(address, laneno)
u_long address;
u_char laneno;
{
   /* This routine releases one pattern block back to the correct free list.
    * "address" can point anywhere in the block.
    */

   u_long link_table_addr;
   u_long block_addr;
   u_long temp;
   u_long temp2;

   if (address == NULL)
      return;

   address &= BLOCK_START_MASK;

   DPRINTF(("Release block addr: %8X\n", address));

   link_table_addr = ptol(address);

   /* Mark this block free. */
   write_loc_long((u_long *)link_table_addr, (u_long)FREE_BLOCK_FLAG);

   temp = link_table_addr - LINK_TABLE_ADDR_INC;
   temp2 = read_loc_long((u_long *)temp) & BLOCK_NUMBER_MASK;
   while (temp2 != FREE_BLOCK_FLAG) {

      temp -= LINK_TABLE_ADDR_INC;
      temp2 = read_loc_long((u_long *)temp) & BLOCK_NUMBER_MASK;

   }

   if (temp == ((address & LANE_ADDR_MASK) + LANE_LINK_TABLE_OFFSET)) {
      /* TEMP is pointing to the link table location corresponding to block
       * number 0. So none of the blocks before this block is free.
       * Insert it at the head of the free list.
       */

      if (free_block_list[laneno] != NULL) {
         write_loc_long((u_long *)(free_block_list[laneno] + 4), address);
      }
      write_loc_long((u_long *)address, free_block_list[laneno]);
      write_loc_long((u_long *)(address + 4), (u_long)NULL);

      free_block_list[laneno] = address;

   }
   else {
      /* insert the block after temp */

      block_addr = (temp & LANE_ADDR_MASK) +
                   (temp << (BLOCK_NUMBER_SHIFT - 2));

      DPRINTF(("insert block after block addr: %08X\n", block_addr));

      temp2 = read_loc_long((u_long *)block_addr);

      write_loc_long((u_long *)address, temp2);
      write_loc_long((u_long *)(address + 4), block_addr);

      write_loc_long((u_long *)block_addr, address);

      write_loc_long((u_long *)(temp2 + 4), address);
   }
}

read_branch_table_content(address)
u_long address;
{
   /* Read the content of the branch table corresponding to the block with
    * the given address.
    */

   u_long link_table_addr;
   u_long value;

   address &= BLOCK_START_MASK;

   link_table_addr = ptol(address);

   value = read_loc_long((u_long *)link_table_addr) & BLOCK_NUMBER_MASK;

   return(value);
}
```

Copyright 1989
Logic Modeling Systems

SOURCE PROGRAM lm1000/util.c

DATE 5/23/89 TIME 6:14:53 pm

LINE # SOURCE TEXT

```
write_pattern(instance, unit_addr, ptrn_ptr)
INSTANCE_INFO *instance;
u_long          unit_addr;
PTRN_BITS_L[illegible]ORD *ptrn_ptr;
{
   /* Write the patterns pointed to by "ptrn_ptr" to address specified in
    * "unit_addr" array.
    */
   DAB_INFO *dab_ptr;
   u_long     addr;
   u_char     unitno;
   u_char     laneno;
   u_char     total_unit;

   dab_ptr = dab_list[instance->dab_info_index];
   total_unit = dab_ptr->unit_count;

#ifdef DEBUG
   if (unit_addr[0] == instance->lcychdb_addr[0]) {
      DPRINTF(("LCYCHDB         :"));
   }
   else if (unit_addr[0] == instance->lcycmdb_addr[0]) {
      DPRINTF(("LCYCMDB         :"));
   }
   else {
      DPRINTF(("PTRN %08X:", unit_addr[0]));
   }

   for (unitno = 0; unitno < total_unit; ++unitno) {
      DPRINTF((" %08X %08X %08X\n", ptrn_ptr[unitno].word[0],
                                    ptrn_ptr[unitno].word[1],
                                    ptrn_ptr[unitno].word[2]));
   }
#endif

   for (unitno = 0; unitno < total_unit; ++unitno) {
      addr = unit_addr[unitno];
      write_loc_long((u_long *)addr,
                                          ptrn_ptr[unitno].word[0]);
      write_loc_long((u_long *)(addr + LANE_SEGMENT_B_OFFSET),
                                          ptrn_ptr[unitno].word[1]);
      write_loc_long((u_long *)(addr + LANE_SEGMENT_C_OFFSET),
                                          ptrn_ptr[unitno].word[2]);
   }

   total_unit = dab_ptr->lane_count * dab_ptr->unit_count_per_lane;
   for (; unitno < total_unit; ++unitno) {
      addr = unit_addr[unitno];
      laneno = dab_ptr->unit_location[unitno].lane_no;

      write_loc_long((u_long *)addr, dab_ptr->dummy_ptrn[laneno].word[0]);
      write_loc_long((u_long *)(addr + LANE_SEGMENT_B_OFFSET),
                                     dab_ptr->dummy_ptrn[laneno].word[1]);
      write_loc_long((u_long *)(addr + LANE_SEGMENT_C_OFFSET),
                                     dab_ptr->dummy_ptrn[laneno].word[2]);
   }
}


grow_pattern(instance)
INSTANCE_INFO *instance;
{
   DAB_INFO          *dab_ptr;
   LANE_ADDR_INFO    *lane_info;
   u_long            *cur_unit_addr;
   u_long            *new_unit_addr;
   u_long             addr_inc_per_lane;
   u_char             laneno;
   u_char             unitno;
   u_char             total_unit;
   u_char             junk;

   dab_ptr = dab_list[instance->dab_info_index];

   instance->pattern_count += dab_ptr->unit_count_per_lane;

   addr_inc_per_lane = dab_ptr->unit_count_per_lane * PTRN_ADDR_INC;

   total_unit = dab_ptr->lane_count * dab_ptr->unit_count_per_lane;

   cur_unit_addr = &instance->unit_addr[instance->cur_unit_addr_index][0];
   instance->cur_unit_addr_index = instance->cur_unit_addr_index + 1 & 1;
   new_unit_addr = &instance->unit_addr[instance->cur_unit_addr_index][0];
   for (unitno = 0; unitno < total_unit; ++unitno) {
      lane_info = &instance->lane_addr[dab_ptr->unit_location[unitno].lane_no];
      if ((cur_unit_addr[unitno] + addr_inc_per_lane) >=
                                          lane_info->max_addr) {
         if (lane_info->new_block_addr == 0) {
            if (new_block(&lane_info->new_block_addr,
                          &junk,
                          PATTERN_BLOCK,
                          dab_ptr->unit_location[unitno].lane_no) == FAILURE) {
               lm_queue_message(ERROR_MSG, "out of Fast Pattern Memory");
               instance->failed_to_alloc_ptrn = TRUE;
               return(FAILURE);
            }

            set_branch(lane_info->max_addr - PTRN_ADDR_INC,
                       lane_info->new_block_addr);
         }

         new_unit_addr[unitno] = lane_info->new_block_addr +
            cur_unit_addr[unitno] + addr_inc_per_lane -
            lane_info->max_addr;

      }
      else {
         new_unit_addr[unitno] = cur_unit_addr[unitno] + addr_inc_per_lane;
      }

      if (dab_ptr->unit_location[unitno].last_in_lane)
         lane_info->last_unit_addr = new_unit_addr[unitno];
   }

   for (laneno = 0; laneno < MAX_LANE_COUNT; ++laneno) {
      lane_info = &instance->lane_addr[laneno];

      if (lane_info->new_block_addr != 0) {
```

Copyright 1989 Logic Modeling Systems

SOURCE PROGRAM lm1000/util.c

DATE 5/23/89 TIME 6:14:53 pm PAGE # 14/164

SOURCE TEXT

```
            lane_info->prev_max_addr = lane_info->max_addr;
            lane_info->max_addr = lane_info->new_block_addr + BLOCK_ADDR_INC;
            lane_info->new_block_addr = 0;
         }
      }

   return(SUCCESS);
}

set_branch(cur_ptrn_addr, current_block_addr)
u_long cur_ptrn_addr;
u_long current_block_addr;
{
   /* Set the branch command BRANCH_LATENCY ptrns before the current pattern.
    * Modify the branch table appropriately.
    */

   u_long temp;
   u_long branch_addr;

   branch_addr = cur_ptrn_addr - BRANCH_LATENCY * PTRN_ADDR_INC +
                                                  LANE_SEGMENT_C_OFFSET;
   temp = read_loc_long((u_long *)branch_addr);

   temp = (temp & PEL_BRANCH_MASK) | (BRANCH_ALWAYS << PEL_BRANCH_SHIFT);

   write_loc_long((u_long *)branch_addr, temp);

   write_branch_table(cur_ptrn_addr, current_block_addr);
}

unset_branch(cur_ptrn_addr)
u_long cur_ptrn_addr;
{
   /* UNSet the branch command BRANCH_LATENCY ptrns before the current pattern.
    * Modify the branch table appropriately.
    */

   u_long temp;
   u_long branch_addr;

   branch_addr = cur_ptrn_addr - BRANCH_LATENCY * PTRN_ADDR_INC +
                                                  LANE_SEGMENT_C_OFFSET;
   temp = read_loc_long((u_long *)branch_addr);

   temp = (temp & PEL_BRANCH_MASK) | (BRANCH_NEVER << PEL_BRANCH_SHIFT);

   write_loc_long((u_long *)branch_addr, temp);

   /* Write 0 to the link table entry corresponding to cur_ptrn_addr
    * to indicate that this is the last block of the sequence.
    */
   write_branch_table(cur_ptrn_addr, (u_long)0);
}

write_branch_table(source, destination)
u_long source;
u_long destination;
{
   /* This routine writes the "destination" address into the branch table
    * location corresponding to the pattern block containing address
    * "source", i.e. "source" can point to be anywhere in the block.
    * Note that the contents of the link table is the "block number" of
    * the next block to jump to (not the actual address of the block).
    */

   u_long link_table_addr;

   source &= BLOCK_START_MASK;

   link_table_addr = ptol(source);

   write_loc_long((u_long *)link_table_addr,
            (destination >> BLOCK_NUMBER_SHIFT) & BLOCK_NUMBER_MASK);

}

grow_pattern_unit(instance)
INSTANCE_INFO *instance;
{
   /* This routine grows the last_in_lane unit pattern address on each lane
    * by just one unit.
    * It is assumed that there are enough rooms in the block for the pattern
    * to grow, it will not allocate new pattern block.
    */

   DAB_INFO         *dab_ptr;
   LANE_ADDR_INFO   *lane_info;
   u_char            laneno;

   dab_ptr = dab_list[instance->dab_info_index];

   instance->pattern_count += 1;

   for (laneno = 0; laneno < MAX_LANE_COUNT; ++laneno) {
      lane_info = &instance->lane_addr[laneno];

      if (dab_ptr->lane_used[laneno]) {
         if ((lane_info->last_unit_addr + PTRN_ADDR_INC(   >=
                                          lane_info .max_addr) {
            lm_queue_message(ERROR_MSG, "internal error: grow_pattern_unit pattern address overflow");
            return(FAILURE);
         }

         lane_info->last_unit_addr += PTRN_ADDR_INC;
      }
   }
   return(SUCCESS);
}

adjust_pattern_addr(instance)
INSTANCE_INFO *instance;
{
   /* This routine adjust the LANE_ADDR_INFO.last_unit_addr to point to
    * the address just past the last full lane pattern address.
    * It is assumed that subtracting the address does not make the address
    * go outside the block address boundary.
    */

   DAB_INFO  *dab_ptr;
```

Copyright 1989
Logic Modeling Systems

SOURCE PROGRAM lm1000/util.c

DATE 5/23/89 TIME 6:14:53 pm PAGE # 15/165

LINE # SOURCE TEXT

```
    u_char      laneno;

    dab_ptr = dab_list[instance->dab_info_index];
    for (laneno = 0; laneno < MAX_LANE_COUNT; ++laneno) {

       if (dab_ptr->lane_used[laneno]) {

          instance->lane_addr[laneno].last_unit_addr -=
             (dab_ptr->unit_count_per_lane - 1) * PTRN_ADDR_INC;
       }
    }

    instance->pattern_count = instance->pattern_count -
                              dab_ptr->unit_count_per_lane + 1;
}

write_pattern_unit(instance, ptrn_ptr)
INSTANCE_INFO *instance;
PTRN_BITS_LONGWORD *ptrn_ptr;
{
   /* Use the address for the last_in_lane unit to write the 1 unit worth
    * of pattern pointed by ptrn_ptr.
    */

   DAB_INFO       *dab_ptr;
   LANE_ADDR_INFO *lane_info;
   u_long          addr;
   u_char          laneno;

   dab_ptr = dab_list[instance->dab_info_index];

   for (laneno = 0; laneno < MAX_LANE_COUNT; ++laneno) {

      lane_info = &instance->lane_addr[laneno];

      if (dab_ptr->lane_used[laneno]) {

         addr = lane_info->last_unit_addr;

         write_loc_long((u_long *)addr,
                                             ptrn_ptr[laneno].word[0]);
         write_loc_long((u_long *)(addr + LANE_SEGMENT_B_OFFSET),
                                             ptrn_ptr[laneno].word[1]);
         write_loc_long((u_long *)(addr + LANE_SEGMENT_C_OFFSET),
                                             ptrn_ptr[laneno].word[2]);

#ifdef DEBUG
         DPRINTF(("PTRN UNIT %08x:  %08X %08X %08X\n", addr,
                  ptrn_ptr[laneno].word[0],
                  ptrn_ptr[laneno].word[1],
                  ptrn_ptr[laneno].word[2]));

#endif
      }
   }
}

copy_pattern(source_addr, dest_addr, count)
u_long source_addr;
u_long dest_addr;
u_short count;
{
   /* This routine copy "count" number of unit pattern from "source_addr"
    * to "dest_addr".
    */

   u_long   cur_source_addr;
   u_long   cur_dest_addr;
   u_long   value;
   u_short  i;

   DPRINTF(("copy_pattern: source_addr: %08X, dest_addr: %08X\n",
            source_addr, dest_addr));

   cur_source_addr = source_addr;
   cur_dest_addr   = dest_addr;

   for (i = 0; i < count; ++i) {

      value = read_loc_long((u_long *)cur_source_addr);
      write_loc_long((u_long *)cur_dest_addr, value);

      value =
         read_loc_long((u_long *)(cur_source_addr + LANE_SEGMENT_B_OFFSET));
      write_loc_long((u_long *)(cur_dest_addr + LANE_SEGMENT_B_OFFSET), value);

      value =
         read_loc_long((u_long *)(cur_source_addr + LANE_SEGMENT_C_OFFSET));
      write_loc_long((u_long *)(cur_dest_addr + LANE_SEGMENT_C_OFFSET), value);


      cur_source_addr += PTRN_ADDR_INC;
      cur_dest_addr += PTRN_ADDR_INC;
   }
}

extend_inst_table(user)
USER_INFO  *user;
{
   INSTANCE_INFO   **temp_ptr;
   char              *ptr;
   long               new_size;
   u_long             i;

   new_size = user->inst_table_size + INST_TABLE_INCR;

   ptr = (char *)
      DREALLOC((char *)user->instance,
            (unsigned)(new_size * sizeof(INSTANCE_INFO *)));
   if (ptr == NULL)
      return(FAILURE);

   user->instance = (INSTANCE_INFO **)ptr;

   user->free_inst_id = (INSTANCE_INFO **)
      &user->instance[user->inst_table_size];

   temp_ptr = &user->instance[user->inst_table_size + 1];

   for (i = user->inst_table_size; i < (new_size - 1); i++) {
```

Copyright 1989
Logic Modeling Systems

SOURCE PROGRAM lm1000/util.c | DATE 5/23/89 | TIME 6:14:53 pm | PAGE # 16/166

LINE # SOURCE TEXT

```
        user->instance[i] = (INSTANCE_INFO *)temp_ptr;
        temp_ptr++;
    }

    user->instance[i] = NULL;
    user->inst_table_size = new_size;

    return(SUCCESS);
}

extend_def_table(user)
USER_INFO   *user;
{
    DEVICE_SPEC  **temp_ptr;
    char          *ptr;
    long           new_size;
    u_long         i;

    new_size = user->def_table_size + DEF_TABLE_INCR;

    ptr = (char *)
        DREALLOC((char *)user->definition,
                 (unsigned)(new_size * sizeof(DEVICE_SPEC *)));
    if (ptr == NULL)
        return(FAILURE);

    user->definition = (DEVICE_SPEC **)ptr;

    user->free_def_id = &user->definition[user->def_table_size];

    temp_ptr = (DEVICE_SPEC **)
        &user->definition[user->def_table_size + 1];

    for (i = user->def_table_size; i < (new_size - 1); i++) {
        user->definition[i] = (DEVICE_SPEC *)temp_ptr;
        ++temp_ptr;
    }

    user->definition[i] = NULL;
    user->def_table_size = new_size;

    return(SUCCESS);
}

new_and_link_instance(user, def_ptr, name_ptr,
                      unit_count, inst_id_table_index,
                      dab_info_index)
USER_INFO       *user;
DEVICE_SPEC     *def_ptr;
char            *name_ptr;
u_short          unit_count;
u_short         *inst_id_table_index;
char             dab_info_index;
{
    INSTANCE_INFO        *temp_ptr;
    INSTANCE_INFO       **slot_ptr;
    PTRN_BITS            *ptrn_bits_ptr;
    PIN_INFO             *pin;
    DAB_INFO             *dab_ptr;
    EXTRA_DEVICE_SPEC    *extra_def_ptr;
    PTRN_BITS_LONGWORD   *unit_ptrn;
    PIN_SPEC             *pin_spec_ptr;
    long                  pinno;
    u_char                unitno;
    u_char                wordno;
    u_char                alloc_error = FALSE;

    temp_ptr = (INSTANCE_INFO *)DCALLOC((unsigned)1,
                                        (unsigned)sizeof(INSTANCE_INFO));
    if (temp_ptr == NULL)
        return(FAILURE);

    temp_ptr->device_info_string = (char *)
        DMALLOC((unsigned)(strlen(name_ptr) + 1));

    if (temp_ptr->device_info_string == NULL) {
        DFREE((char *)temp_ptr);
        return(FAILURE);
    }

    (void)strcpy(temp_ptr->device_info_string, name_ptr);

    temp_ptr->definition = def_ptr;
    extra_def_ptr = (EXTRA_DEVICE_SPEC *)def_ptr->extra_data;

    temp_ptr->dab_info_index = dab_info_index;
    temp_ptr->failed_to_alloc_ptrn = FALSE;
    temp_ptr->fatal_error          = FALSE;
    temp_ptr->had_shorted_pin      = FALSE;

    temp_ptr->restore_state  = SENT_RECV_NOTHING;

    dab_ptr = dab_list[temp_ptr->dab_info_index];

    temp_ptr->pin_info_table =
        (PIN_INFO *)DMALLOC((unsigned)(def_ptr->pin_cnt * sizeof(PIN_INFO)));
    if (temp_ptr->pin_info_table == NULL)
        alloc_error = TRUE;
    else {
        /* Firstly, clear the entire pin_info_table. */
        bzero((char *)temp_ptr->pin_info_table,
          (int)(def_ptr->pin_cnt * sizeof(PIN_INFO)));
        /* Secondly, initialize each element of the pin_info_table */
        for (pinno = def_ptr->pin_cnt - 1; pinno >= 0; --pinno) {
            pin_spec_ptr = &def_ptr->pin_table[pinno];
            pin = &temp_ptr->pin_info_table[pinno];

            pin->old_raw                   = LOGIC_U;
            pin->old_filtered              = LOGIC_U;
            pin->new_raw                   = LOGIC_U;
            pin->new_filtered              = LOGIC_U;
            pin->min_delay                 = -1;
            pin->sim_time                  = 0;
            pin->next_input_pin_index      = -1;
            pin->next_output_pin_index     = -1;
            pin->input_pin_is_linked       = FALSE;
            pin->output_pin_is_linked      = FALSE;
            pin->delay_type                = DELAY_TABLE;
            pin->uninitialized_pin         = TRUE;
            pin->has_resistor              = NO_PULLUP_OR_PULLDOWN;
```

Copyright 1989
Logic Modeling Systems

SOURCE PROGRAM lm1000/util.c

DATE 5/23/89 TIME 6:14:53 pm PAGE # 17/167

LINE # SOURCE TEXT

```
            pin->direction                  = pin_spec_ptr->direction;

            if ((pin_spec_ptr->direction == IN) ||
                (pin_spec_ptr->direction == OUT) ||
                (pin_spec_ptr->direction == IO)) {

               if (pin_spec_ptr->pulled_up == 1) {
                  pin->has_resistor = PULLUP;
               }

               if (pin_spec_ptr->pulled_down == 1) {
                  pin->has_resistor = PULLDOWN;
               }
            }
         }
      }

      temp_ptr->first_data_pin_index = -1;
      temp_ptr->first_eval_pin_index = -1;
      temp_ptr->first_store_pin_index = -1;

      temp_ptr->is_fault = FALSE;
      temp_ptr->enable_timing_meas = FALSE;
      temp_ptr->use_2_bit_per_pin = FALSE;
      temp_ptr->fault_count = 0;
      temp_ptr->check_input_z_count = MAX_CHECK_INPUT_Z_COUNT;
      temp_ptr->sample_count = DEFAULT_SAMPLE_COUNT;
      temp_ptr->evaluation_count = DEFAULT_EVALUATION_COUNT;

      temp_ptr->first_eval = TRUE;

      temp_ptr->ptrn_loaded =
         (PTRN_BITS *)DCALLOC((unsigned)unit_count,
                              (unsigned)sizeof(PTRN_BITS));
      if (temp_ptr->ptrn_loaded == NULL)
         alloc_error = TRUE;
      else {
         /* Initialize the ptrn_loaded to all 1 */
         for (unitno = 0; unitno < unit_count; ++unitno) {
            unit_ptrs = (PTRN_BITS_LONGWORD *)&temp_ptr->ptrn_loaded[unitno];
            unit_ptrs->word[0] = 0xffffffff;
            unit_ptrs->word[1] = 0xffffffff;
            unit_ptrs->word[2] = 0xffff0000;
         }

         /* Setup the pattern control bits */
         ptrn_bits_ptr = temp_ptr->ptrn_loaded;
         for (unitno = 0; unitno < dab_ptr->unit_count; ++unitno) {

            if (dab_ptr->unit_location[unitno].last_in_lane)
               set_pel_ctl(&ptrn_bits_ptr->ctl, PEL_CTL_LOAD_DATA_LAST_UNIT);
            else
               set_pel_ctl(&ptrn_bits_ptr->ctl, PEL_CTL_LOAD_DATA);

            set_pel_sel(&ptrn_bits_ptr->ctl,
                        dab_ptr->unit_location[unitno].slot_no);

            /* Disable the R1 clocks.
             * Note that the R1 clocks are already disabled because we initialize
             * ptrn_loaded to 0.
             */
            for (wordno = 0; wordno < 5; ++wordno) {
               ptrn_bits_ptr->word[wordno] |=
                  ((PTRN_BITS *)(&extra_def_ptr->ident_R1[unitno]))->word[wordno];
            }

            ++ptrn_bits_ptr;
         }
      }

      /* HMDEMB_LOADED, LCYCHDB_LOADED, LCYCMDB_LOADED are initialized in
       * load_preamble().
       */
      temp_ptr->hmdemb_loaded =
         (PTRN_BITS *)DMALLOC((unsigned)(unit_count * sizeof(PTRN_BITS)));
      if (temp_ptr->hmdemb_loaded == NULL)
         alloc_error = TRUE;

      temp_ptr->lcychdb_loaded =
         (PTRN_BITS *)DMALLOC((unsigned)(unit_count * sizeof(PTRN_BITS)));
      if (temp_ptr->lcychdb_loaded == NULL)
         alloc_error = TRUE;

      temp_ptr->lcycmdb_loaded =
         (PTRN_BITS *)DMALLOC((unsigned)(unit_count * sizeof(PTRN_BITS)));
      if (temp_ptr->lcycmdb_loaded == NULL)
         alloc_error = TRUE;

      temp_ptr->last_consistent_set =
         (PTRN_BITS *)DCALLOC((unsigned)unit_count, (unsigned)sizeof(PTRN_BITS));
      if (temp_ptr->last_consistent_set == NULL)
         alloc_error = TRUE;

      temp_ptr->sim_pin_value.data =
         (PTRN_BITS *)DCALLOC((unsigned)unit_count, (unsigned)sizeof(PTRN_BITS));
      if (temp_ptr->sim_pin_value.data == NULL)
         alloc_error = TRUE;

      temp_ptr->sim_pin_value.hiz =
         (PTRN_BITS *)DCALLOC((unsigned)unit_count, (unsigned)sizeof(PTRN_BITS));
      if (temp_ptr->sim_pin_value.hiz == NULL)
         alloc_error = TRUE;

      temp_ptr->sim_pin_value.unknown =
         (PTRN_BITS *)DCALLOC((unsigned)unit_count, (unsigned)sizeof(PTRN_BITS));
      if (temp_ptr->sim_pin_value.unknown == NULL)
         alloc_error = TRUE;

      temp_ptr->sim_pin_value.soft =
         (PTRN_BITS *)DCALLOC((unsigned)unit_count, (unsigned)sizeof(PTRN_BITS));
      if (temp_ptr->sim_pin_value.soft == NULL)
         alloc_error = TRUE;

      temp_ptr->last_sample_value.data =
         (PTRN_BITS *)DCALLOC((unsigned)unit_count, (unsigned)sizeof(PTRN_BITS));
      if (temp_ptr->last_sample_value.data == NULL)
         alloc_error = TRUE;

      temp_ptr->last_sample_value.hiz =
         (PTRN_BITS *)DCALLOC((unsigned)unit_count. (unsigned)sizeof(PTRN_BITS)),
```

Copyright 1989 Logic Modeling Systems

SOURCE PROGRAM lm1000/util.c

DATE 5/23/89 TIME 6:14:53 pm PAGE # 18/168

LINE # SOURCE TEXT

```
    if (temp_ptr->last_sample_value.hiz == NULL)
        alloc_error = TRUE;

    temp_ptr->last_sample_value.unknown =
        (PTRN_BITS *)DCALLOC((unsigned)unit_count, (unsigned)sizeof(PTRN_BITS));
    if (temp_ptr->last_sample_value.unknown == NULL)
        alloc_error = TRUE;

    temp_ptr->last_sample_value.soft =
        (PTRN_BITS *)DCALLOC((unsigned)unit_count, (unsigned)sizeof(PTRN_BITS));
    if (temp_ptr->last_sample_value.soft == NULL)
        alloc_error = TRUE;

    if (user->free_inst_id == NULL)
        if (extend_inst_table(user) == FAILURE)
            alloc_error = TRUE;

    if (alloc_error == TRUE) {

        DFREE((char *)temp_ptr->device_info_string);

        DFREE((char *)temp_ptr->pin_info_table);

        DFREE((char *)temp_ptr->last_consistent_set);

        DFREE((char *)temp_ptr->ptrn_loaded);
        DFREE((char *)temp_ptr->hmdemb_loaded);
        DFREE((char *)temp_ptr->lcychdb_loaded);
        DFREE((char *)temp_ptr->lcycmdb_loaded);

        DFREE((char *)temp_ptr->sim_pin_value.data);
        DFREE((char *)temp_ptr->sim_pin_value.hiz);
        DFREE((char *)temp_ptr->sim_pin_value.unknown);
        DFREE((char *)temp_ptr->sim_pin_value.soft);

        DFREE((char *)temp_ptr->last_sample_value.data);
        DFREE((char *)temp_ptr->last_sample_value.hiz);
        DFREE((char *)temp_ptr->last_sample_value.unknown);
        DFREE((char *)temp_ptr->last_sample_value.soft);

        DFREE((char *)temp_ptr);
        return(FAILURE);
    }

    slot_ptr = user->free_inst_id;

    *inst_id_table_index =
        (u_short)(((u_long)slot_ptr - (u_long)user->instance) /
                                                sizeof(INSTANCE_INFO *));

    user->free_inst_id = (INSTANCE_INFO **)*slot_ptr;
    *slot_ptr = temp_ptr;

    return(SUCCESS);
}

reinitialize_instance(instance)
INSTANCE_INFO     *instance;
{
    PTRN_BITS             *ptrn_bits_ptr;
    PIN_INFO              *pin;
    DAB_INFO              *dab_ptr;
    DEVICE_SPEC           *def_ptr;
    EXTRA_DEVICE_SPEC     *extra_def_ptr;
    PTRN_BITS_LONGWORD    *unit_ptrn;
    PTRN_BITS_LONGWORD    *last_consistent_set_ptr;
    PTRN_BITS_LONGWORD    *sim_pin_value_data_ptr;
    PTRN_BITS_LONGWORD    *sim_pin_value_hiz_ptr;
    PTRN_BITS_LONGWORD    *sim_pin_value_unknown_ptr;
    PTRN_BITS_LONGWORD    *sim_pin_value_soft_ptr;
    PTRN_BITS_LONGWORD    *last_sample_value_data_ptr;
    PTRN_BITS_LONGWORD    *last_sample_value_hiz_ptr;
    PTRN_BITS_LONGWORD    *last_sample_value_unknown_ptr;
    PTRN_BITS_LONGWORD    *last_sample_value_soft_ptr;
    long                   pinno;
    u_char                 unit_count;
    u_char                 unitno;
    u_char                 wordno;
    u_char                 laneno;

    def_ptr = instance->definition;
    extra_def_ptr = (EXTRA_DEVICE_SPEC *)def_ptr->extra_data;
    dab_ptr = dab_list[instance->dab_info_index];
    unit_count = dab_ptr->unit_count;

    instance->pattern_count = 0;
    instance->static_pattern_count = 0;
    instance->common_pattern_count = 0;

    for (laneno = 0; laneno < MAX_LANE_COUNT; ++laneno) {
        instance->fb_block_size[laneno]              = 0;
        instance->fb_block_addr[laneno]              = 0;
        instance->lane_addr[laneno].max_addr         = 0;
        instance->lane_addr[laneno].prev_max_addr    = 0;
        instance->lane_addr[laneno].last_unit_addr   = 0;
        instance->lane_addr[laneno].new_block_addr   = 0;
        instance->seq_start_addr[laneno]             = 0;
        instance->var_seq_addr[laneno]               = 0;
        instance->last_common_block_addr[laneno]     = 0;
    }

    for (unitno = 0; unitno < MAX_UNIT_COUNT; ++unitno) {
        instance->unit_addr[0][unitno]                = 0;
        instance->unit_addr[1][unitno]                = 0;
        instance->first_user_ptrn_unit_addr[unitno]   = 0;
        instance->lcychdb_addr[unitno]                = 0;
        instance->lcycmdb_addr[unitno]                = 0;
    }

    instance->failed_to_alloc_ptrn = FALSE;
    instance->restore_state  = SENT_RECV_NOTHING;

    instance->cur_unit_addr_index = 0;
    instance->has_history = FALSE;
    instance->had_shorted_pin = FALSE;
    instance->purge_ptrn_on_next_eval = FALSE;

    if (def_ptr->device_type == PRIVATE) {
        instance->has_history = TRUE;
        instance->purge_ptrn_on_next_eval = TRUE;
```

Copyright 1989
Logic Modeling Systems

SOURCE PROGRAM lm1000/util.c | DATE 5/23/89 | TIME 6:14:53 pm | PAGE # 19/169

LINE # SOURCE TEXT

```
    }

    /* Initialize pin_info_table */
    for (pinno = def_ptr->pin_cnt - 1; pinno >= 0; --pinno) {
       pin = &instance->pin_info_table[pinno];
       pin->old_raw                    = LOGIC_U;
       pin->old_filtered               = LOGIC_U;
       pin->new_raw                    = LOGIC_U;
       pin->new_filtered               = LOGIC_U;
       pin->min_delay                  = -1;
       pin->sim_time                   = 0;
       pin->next_input_pin_index       = -1;
       pin->next_output_pin_index      = -1;
       pin->input_pin_is_linked        = FALSE;
       pin->output_pin_is_linked       = FALSE;
       pin->delay_type                 = DELAY_TABLE;
       pin->uninitialized_pin          = TRUE;
    }
    instance->first_data_pin_index = -1;
    instance->first_eval_pin_index = -1;
    instance->first_store_pin_index = -1;

    instance->is_fault = FALSE;
    instance->enable_timing_meas = FALSE;
    instance->use_2_bit_per_pin = FALSE;
    instance->fault_count = 0;
    instance->check_input_z_count = MAX_CHECK_INPUT_Z_COUNT;
    instance->sample_count = DEFAULT_SAMPLE_COUNT;
    instance->evaluation_count = DEFAULT_EVALUATION_COUNT;

    instance->first_eval = TRUE;

    /* Initialize the ptrn_loaded to all 1 */
    for (unitno = 0; unitno < unit_count; ++unitno) {
       unit_ptrn = (PTRN_BITS_LONGWORD *)&instance->ptrn_loaded[unitno];
       unit_ptrn->word[0] = 0xffffffff;
       unit_ptrn->word[1] = 0xffffffff;
       unit_ptrn->word[2] = 0xffff0000;
    }

    /* Setup the pattern control bits */
    ptrn_bits_ptr = instance->ptrn_loaded;
    for (unitno = 0; unitno < unit_count; ++unitno) {

       if (dab_ptr->unit_location[unitno].last_in_lane)
          set_pel_ctl(&ptrn_bits_ptr->ctl, PEL_CTL_LOAD_DATA_LAST_UNIT);
       else
          set_pel_ctl(&ptrn_bits_ptr->ctl, PEL_CTL_LOAD_DATA);

       set_pel_sel(&ptrn_bits_ptr->ctl,
                   dab_ptr->unit_location[unitno].slot_no);

       /* Disable the R1 clocks.
        * Note that the R1 clocks are already disabled because we initialize
        * ptrn_loaded to 0.
        */
       for (wordno = 0; wordno < 5; ++wordno) {
          ptrn_bits_ptr->word[wordno] |=
             ((PTRN_BITS *)(&extra_def_ptr->ident_R1[unitno]))->word[wordno];
       }

       ++ptrn_bits_ptr;
    }

    /* NDCMDS_LOADED, LYCMDS_LOADED  LCYCMDS_LOADED are initialized in
     * load_preamble().
     */

    /* Initialize the following PTRN_BITS to 0 */
    last_consistent_set_ptr = (PTRN_BITS_LONGWORD *)
                                 instance->last_consistent_set;
    sim_pin_value_data_ptr  = (PTRN_BITS_LONGWORD *)
                                 instance->sim_pin_value.data;
    sim_pin_value_hiz_ptr  = (PTRN_BITS_LONGWORD *)
                                 instance->sim_pin_value.hiz;
    sim_pin_value_unknown_ptr  = (PTRN_BITS_LONGWORD *)
                                 instance->sim_pin_value.unknown;
    sim_pin_value_soft_ptr  = (PTRN_BITS_LONGWORD *)
                                 instance->sim_pin_value.soft;
    last_sample_value_data_ptr = (PTRN_BITS_LONGWORD *)
                                 instance->last_sample_value.data;
    last_sample_value_hiz_ptr = (PTRN_BITS_LONGWORD *)
                                 instance->last_sample_value.hiz;
    last_sample_value_unkown_ptr = (PTRN_BITS_LONGWORD *)
                                 instance->last_sample_value.unkown;
    last_sample_value_soft_ptr = (PTRN_BITS_LONGWORD *)
                                 instance->last_sample_value.soft;

    for (unitno = 0; unitno < unit_count; ++unitno) {
       for (wordno = 0; wordno < 3; ++wordno) {
          last_consistent_set_ptr->word[wordno] = 0;

          sim_pin_value_data_ptr->word[wordno]      = 0;
          sim_pin_value_hiz_ptr->word[wordno]       = 0;
          sim_pin_value_unknown_ptr->word[wordno]   = 0;
          sim_pin_value_soft_ptr->word[wordno]      = 0;

          last_sample_value_data_ptr->word[wordno]     = 0;
          last_sample_value_hiz_ptr->word[wordno]      = 0;
          last_sample_value_unkown_ptr->word[wordno]   = 0;
          last_sample_value_soft_ptr->word[wordno]     = 0;
       }

       ++last_consistent_set_ptr;

       ++sim_pin_value_data_ptr;
       ++sim_pin_value_hiz_ptr;
       ++sim_pin_value_unkown_ptr;
       ++sim_pin_value_soft_ptr;

       ++last_sample_value_data_ptr;
       ++last_sample_value_hiz_ptr;
       ++last_sample_value_unkown_ptr;
       ++last_sample_value_soft_ptr;
    }
}

rls_instance(user, inst_id_table_index)
USER_INFO      *user;
u_short        inst_id_table_index;
```

Copyright 1989
Logic Modeling Systems

SOURCE PROGRAM lm1000/util.c

DATE 5/23/89 TIME 6:14:53 pm

PAGE # 20/170

LINE # SOURCE TEXT

```
{

    INSTANCE_INFO      *instance;

    instance = user->instance[inst_id_table_index];

    DFREE((char *)instance->device_info_string);

    DFREE((char *)instance->pin_info_table);

    DFREE((char *)instance->last_consistent_set);

    DFREE((char *)instance->ptrs_loaded);
    DFREE((char *)instance->lmdmb_loaded);
    DFREE((char *)instance->lcycbdb_loaded);
    DFREE((char *)instance->lcycmdb_loaded);

    DFREE((char *)instance->sim_pin_value.data);
    DFREE((char *)instance->sim_pin_value.hiz);
    DFREE((char *)instance->sim_pin_value.unknown);
    DFREE((char *)instance->sim_pin_value.soft);

    DFREE((char *)instance->last_sample_value.data);
    DFREE((char *)instance->last_sample_value.hiz);
    DFREE((char *)instance->last_sample_value.unknown);
    DFREE((char *)instance->last_sample_value.soft);

    DFREE((char *)instance);

    user->instance[inst_id_table_index] = (INSTANCE_INFO *)user->free_inst_id;
    user->free_inst_id = &user->instance[inst_id_table_index];
}

rls_definition(user, def_id_table_index)
USER_INFO   *user;
u_short      def_id_table_index;
{
    EXTRA_DEVICE_SPEC  *extra_def_ptr;
    DEVICE_SPEC         *def_ptr;

    def_ptr = user->definition[def_id_table_index];

    extra_def_ptr = (EXTRA_DEVICE_SPEC *)def_ptr->extra_data;
    DFREE((char *)extra_def_ptr->ident_inputs);
    DFREE((char *)extra_def_ptr->ident_outputs);
    DFREE((char *)extra_def_ptr->ident_ios);
    DFREE((char *)extra_def_ptr->ident_Z1);
    DFREE((char *)extra_def_ptr->ident_Z2);
    DFREE((char *)extra_def_ptr->ident_store);

    DFREE((char *)extra_def_ptr);

    /* Free the DEVICE_SPEC structure by calling a procedure */
    free_device(def_ptr);

    /* Link the free slot */
    user->definition[def_id_table_index] = (DEVICE_SPEC *)user->free_def_id;
    user->free_def_id = &user->definition[def_id_table_index];
}

set_seq_end_bit(instance, lane_addr_info, alloc_temp_block, seq_end_addr,
                inst_block_number)
INSTANCE_INFO     *instance;
LANE_ADDR_INFO    *lane_addr_info;
u_char             alloc_temp_block;
u_long            *seq_end_addr;
u_long            *inst_block_number;
{
   /* The address of the last unit is specified in *lane_addr_info*.
    * If *alloc_temp_block* == FALSE then we should look at
    * instance->lane_addr[].prev_max_addr if we need to set the
    * SEQ_END_BIT in the previous block, otherwise we should look at
    * instance->last_addr[].max_addr.
    */

   DAB_INFO   *dab_ptr;
   u_long      addr;
   u_long      link_table_addr;
   u_long      temp;
   u_short     fault_block_number;
   u_short     ptrs_count;
   u_char      laneno;
   u_char      i;

   dab_ptr = dab_list[instance->dab_info_index];

   /* Fix the block link if it is a fault pattern sequence */
   if (instance->is_fault == TRUE) {
      if (instance->disjoint_flag == FALSE) {
         for (laneno = 0; laneno < MAX_LANE_COUNT; ++laneno) {

            if (! dab_ptr->lane_used[laneno])
               continue;

            link_table_addr =
                ptol(instance->last_common_block_addr[laneno]);

            inst_block_number[laneno] =
               read_loc_long((u_long *)link_table_addr) & BLOCK_NUMBER_MASK;

            fault_block_number = ptob(instance->var_seq_addr[laneno]);

            if (instance->last_common_block_is_feedback) {
               for (i = 0; i < instance->fb_block_size[laneno]; ++i) {
                  write_loc_long((u_long *)link_table_addr,
                                 (u_long)fault_block_number);
                  link_table_addr += LINK_TABLE_ADDR_INC;
               }
            }
            else {
               write_loc_long((u_long *)link_table_addr,
                                         (u_long)fault_block_number);
            }
         }
      }
   }

   for (laneno = 0; laneno < MAX_LANE_COUNT; ++laneno) {
      if (dab_ptr->lane_used[laneno]) {
```

Copyright 1989
Logic Modeling Systems

LINE # SOURCE TEXT

```
            addr = lane_addr_info[laneno].last_unit_addr;
            ptrn_count = PTRN_COUNT_ON_BLOCK(addr);
            if (ptrn_count <= SEQ_END_LATENCY) {
               if (alloc_temp_block == TRUE) {

                  adr = instance->lane_addr[laneno].max_addr -
                           (SEQ_END_LATENCY + 1 - ptrn_count) * PTRN_ADDR_INC +
                           LANE_SEGMENT_C_OFFSET;
               }
               else {

                  addr = instance->lane_addr[laneno].prev_max_addr -
                           (SEQ_END_LATENCY + 1 - ptrn_count) * PTRN_ADDR_INC +
                           LANE_SEGMENT_C_OFFSET;
               }
            }
            else {
               /* The SEQ END bit should be set in the current block */

               addr = addr - SEQ_END_LATENCY * PTRN_ADDR_INC +
                                                   LANE_SEGMENT_C_OFFSET;
            }

            seq_end_addr[laneno] = addr;

            DPRINTF(("setting SEQ_END bit at addr: %08x\n", addr));

            temp = read_loc_long((u_long *)addr);
            write_loc_long((u_long *)addr, (u_long)(temp | ~PEL_STOP_MASK));

      }
   }
}

remove_seq_end_bit(instance, seq_end_addr, inst_block_number)
INSTANCE_INFO *instance;
u_long        *seq_end_addr;
u_long        *inst_block_number;
{
   DAB_INFO     *dab_ptr;
   u_long        temp;
   u_long        link_table_addr;
   u_char        laneno;
   u_char        i;

   dab_ptr = dab_list[instance->dab_info_index];
   for (laneno = 0; laneno < MAX_LANE_COUNT; ++laneno) {
      if (dab_ptr->lane_used[laneno]) {

         DPRINTF(("removing seq end bit addr: %08x\n", seq_end_addr[laneno]));

         temp = read_loc_long((u_long *)(seq_end_addr[laneno]));

         write_loc_long((u_long *)(seq_end_addr[laneno]),
                        (u_long)(temp & PEL_STOP_MASK));

      }
   }

   /* Restore the block link if it is a fault pattern sequence */
   if (instance->is_fault == TRUE) {
      if (instance->disjoint_flag == FALSE) {
         for (laneno = 0; laneno < MAX_LANE_COUNT; ++laneno) {
            if (! dab_ptr->lane_used[laneno])
               continue;

            link_table_addr =
               ptol(instance->last_common_block_addr[laneno]);

            if (instance->last_common_block_is_feedback) {
               for (i = 0; i < instance->fb_block_size[laneno]; ++i) {
                  write_loc_long((u_long *)link_table_addr,
                                 (u_long)inst_block_number[laneno]);
                  link_table_addr += LINK_TABLE_ADDR_INC;
               }
            }
            else {
               write_loc_long((u_long *)link_table_addr,
                              (u_long)inst_block_number[laneno]);
            }
         }
      }
   }
}

play_ptrn_seq(instance, timeout, changed_dac)
INSTANCE_INFO *instance;
u_long         timeout;
u_char        *changed_dac;
{
   EXTRA_DEVICE_SPEC  *extra_def_ptr;
   u_long              start_time;
   u_long              elapsed;
   u_char              replay_pattern = FALSE;

   extra_def_ptr = (EXTRA_DEVICE_SPEC *)instance->definition->extra_data;

   load_starting_address(instance);

#ifdef DBASE
   if (lm_tmg_check_locked() != SUCCESS) {
      start_time = lm_time();
      while (lm_tmg_check_locked() != SUCCESS) {
         if ((lm_time() - start_time) > TMG_LOCK_TIMEOUT) {
            lm_queue_message(ERROR_MSG, "failed to lock Timing Generator");
            instance->fatal_error = TRUE;
            return(FAILURE);
         }
      }
   }
#endif

   /* Check if the DAB configuration has changed. */
   if (modeler_error.error == TRUE) {

      modeler_error.error = FALSE;
      if ((modeler_error.pac_lane_errors != 0) ||
          (modeler_error.tmg_error == TRUE) ||
          (modeler_error.unknown_source_of_interrupt == TRUE)) {
         fatal_hardware_error_encountered = TRUE;
```

Copyright 1989
Logic Modeling Systems

SOURCE PROGRAM lm1000/util.c | DATE 5/23/89 | TIME 6:14:53 pm | PAGE # 22/172

LINE # SOURCE TEXT

```
            get_fatal_hardware_message();
            instance->fatal_error = TRUE;
            return(FAILURE);
        }

            (modeler_error.dab_change) {
            reconfigure_dab();
        }
        else {
            /* Check PEL errors */
            if (modeler_error.pel_error_list != 0) {
                if (check_pel_errors(instance) == FAILURE) {
                    instance->fatal_error = TRUE;
                    return(FAILURE);
                }
            }
        }
    }

    if (extra_def_ptr->dab_ok == FALSE) {
        lm_queue_message(ERROR_MSG, "Device Adapter was removed");
        instance->fatal_error = TRUE;
        return(FAILURE);
    }

    if (*changed_dac == TRUE) {
        while (read_timer1() == FAILURE)
            ;
        *changed_dac = FALSE;
    }

    while (read_timer0(&elapsed) == FAILURE)
        ;

#ifndef DBASE
    /* Start pattern play */
    if (lm_tmg_initiate_play() == FAILURE) {
        lm_queue_message(ERROR_MSG, "failed to initiate pattern play");
        instance->fatal_error = TRUE;
        return(FAILURE);
    }
#endif

#ifdef MODELER
    if (lm_tmg_complete_play(timeout) == FAILURE) {
        lm_queue_message(ERROR_MSG, "failed to complete pattern play");
        instance->fatal_error = TRUE;
        return(FAILURE);
    }
#else
#ifdef DIRECTCONN
    /* Poll CPU status for TMG interrupt */
    start_time = lm_time();
    while (cpu_tmg_interrupt_status() == FALSE) {
        if ((lm_time() - start_time) > timeout) {
            DPRINTF(("play_ptrn_seq: TIMEOUT\n"));
            lm_tmg_abort_play();
            DPRINTF(("finished aborting play\n"));
            tmgptr->pattern_intr_enable = 0;
            lm_queue_message(ERROR_MSG, "timeout during pattern play");
            instance->fatal_error = TRUE;
            return(FAILURE);
        }
    }
    tmgptr->pattern_intr_enable = 0;
#els
    /* Do nothing if it's data base access */
#endif
#end:f

    if (modeler_error.error == TRUE) {
        modeler_error.error = FALSE;

        if ((modeler_error.pac_lane_errors != 0) ||
             (modeler_error.tmg_error == TRUE) ||
             (modeler_error.unknown_source_of_interrupt == TRUE)) {
            fatal_hardware_error_encountered = TRUE;
            get_fatal_hardware_message();
            instance->fatal_error = TRUE;
            return(FAILURE);
        }

        if (modeler_error.dab_change) {
            reconfigure_dab();
            replay_pattern = TRUE;
        }
        else {
            /* Check PEL errors */
            if (modeler_error.pel_error_list != 0) {
                if (check_pel_errors(instance) == FAILURE) {
                    instance->fatal_error = TRUE;
                    return(FAILURE);
                }
            }
        }
    }

    if (extra_def_ptr->dab_ok == FALSE) {
        lm_queue_message(ERROR_MSG, "Device Adapter was re[illegible]d");
        instance->fatal_error = TRUE;
        return(FAILURE);
    }

    if (replay_pattern == TRUE) {
        /* The DAB configuration was changed but, this device was not
         * invalidated by reconfigure_dab() (i.e. extra_def_ptr->dab_ok is still
         * TRUE). This could mean that this particular device is not touched
         * at all or that this device was removed but inserted back in.
         * Play the pattern again to take care of the second condition.
         */
        if (play_ptrn_seq(instance, timeout, changed_dac) == FAILURE) {
            instance->fatal_error = TRUE;
            return(FAILURE);
        }
    }

    return(SUCCESS);
}

return_all_ptrn_block(instance)
```

Copyright 1989
Logic Modeling Systems

LINE # SOURCE TEXT

```
INSTANCE_INFO *instance;
{
   /* Returns all of the pattern block used by this instance. This routine
    * looks at the seq_start_addr (for instance) or var_seq_addr (for fault)
    * to find the begining of the pattern block chain.
    */

   LANE_ADDR_INFO  *lane_ptr;
   EXTRA_DEVICE_SPEC *extra_def_ptr;
   u_long            block_addr;
   u_short           next_block_number;
   u_char            laneno;
   u_char            fb_block_count;
   char              i;

   DPRINTF(("Inside return_all_ptrn_block\n"));

   extra_def_ptr = (EXTRA_DEVICE_SPEC *)instance->definition->extra_data;

   for (laneno = 0; laneno < MAX_LANE_COUNT; ++laneno) {

      lane_ptr = (LANE_ADDR_INFO *)&instance->lane_addr[laneno];

      if (extra_def_ptr->lane_used & (1 << laneno)) {

         if (instance->is_fault == TRUE) {
            block_addr = instance->var_seq_addr[laneno];
            instance->var_seq_addr[laneno] = 0;
         }
         else {
            block_addr = instance->seq_start_addr[laneno];
            instance->seq_start_addr[laneno] = 0;
         }

         /* This happens if we fail when we call new_block() */
         if (block_addr == 0) {
            printf("block_addr is 0\n");
            continue;
         }

         next_block_number = read_branch_table_content(block_addr);
         while (next_block_number != 0) {

            DPRINTF(("next_block_number: %08x\n", next_block_number));
            release_block(block_addr, laneno);

            block_addr = (block_addr & LANE_ADDR_MASK) +
                         (next_block_number << BLOCK_NUMBER_SHIFT);


            next_block_number = read_branch_table_content(block_addr);
         }
         release_block(block_addr, laneno);

         /* If the pattern sequence has feedback, release the remaining
          * feedback blocks.
          */
         if ((instance->fb_block_size[laneno] != 0) &&
             (instance->is_fault == FALSE)) {

            DPRINTF(("releasing remaining feedback blocks\n"));
            block_addr = instance->fb_block_addr[laneno] + BLOCK_ADDR_INC;
            fb_block_count = instance->fb_block_size[laneno] - 1;

            instance->fb_block_addr[laneno] = 0;
            instance->fb_block_size[laneno] = 0;

            if (block_addr != BLOCK_ADDR_INC) {
               for (i = 0; i < fb_block_count; ++i) {

                  release_block(block_addr, laneno);

                  block_addr += BLOCK_ADDR_INC;

               }
            }
         }
      }
   }
}

#ifdef DEBUG

print_pin_changes(instance)
INSTANCE_INFO  *instance;
{
   PIN_INFO *pin_info;
   short pin_number;

   DPRINTF(("DATA pin changes: \n"));
   pin_number = instance->first_data_pin_index;
   while (pin_number != -1) {
      pin_info = &instance->pin_info_table[pin_number];
      DPRINTF(("  PN: %d  stime: %d", pin_number, pin_info->sim_time));
      switch (pin_info->old_filtered) {
      case LOGIC_0:
         DPRINTF(("  logval: 0\n"));
         break;
      case LOGIC_1:
         DPRINTF(("  logval: 1\n"));
         break;
      case LOGIC_Z0:
         DPRINTF(("  logval: Z0\n"));
         break;
      case LOGIC_Z1:
         DPRINTF(("  logval: Z1\n"));
         break;
      case LOGIC_U:
         DPRINTF(("  logval: U\n"));
         break;
      case LOGIC_S0:
         DPRINTF(("  logval: S0\n"));
         break;
      case LOGIC_S1:
         DPRINTF(("  logval: S1\n"));
         break;
      default:
         break;
      }
      pin_number = pin_info->next_input_pin_index;
```

Copyright 1989
Logic Modeling Systems

| SOURCE PROGRAM | DATE 5/23/89 | PAGE # |
|---|---|---|
| lm1000/util.c | TIME 6:14:53 pm | 24/174 |

LINE # SOURCE TEXT

```
    }

    DPRINTF(("EVAL pin changes: \n"));
    pin_number = instance->first_eval_pin_index;
    while (pin_number != -1) {
       pin_info = &instance->pin_info_table[pin_number];
       DPRINTF(("  PN: %d  stime: %d", pin_number, pin_info->sim_time));
       switch (pin_info->old_filtered) {
       case LOGIC_0:
          DPRINTF(("  logval: 0\n"));
          break;
       case LOGIC_1:
          DPRINTF(("  logval: 1\n"));
          break;
       case LOGIC_Z0:
          DPRINTF(("  logval: Z0\n"));
          break;
       case LOGIC_Z1:
          DPRINTF(("  logval: Z1\n"));
          break;
       case LOGIC_U:
          DPRINTF(("  logval: U\n"));
          break;
       case LOGIC_S0:
          DPRINTF(("  logval: S0\n"));
          break;
       case LOGIC_S1:
          DPRINTF(("  logval: S1\n"));
          break;
       default:
          break;
       }
       pin_number = pin_info->next_input_pin_index;
    }

    DPRINTF(("STORE pin changes: \n"));
    pin_number = instance->first_store_pin_index;
    while (pin_number != -1) {
       pin_info = &instance->pin_info_table[pin_number];
       DPRINTF(("  PN: %d  stime: %d", pin_number, pin_info->sim_time));
       switch (pin_info->old_filtered) {
       case LOGIC_0:
          DPRINTF(("  logval: 0\n"));
          break;
       case LOGIC_1:
          DPRINTF(("  logval: 1\n"));
          break;
       case LOGIC_Z0:
          DPRINTF(("  logval: Z0\n"));
          break;
       case LOGIC_Z1:
          DPRINTF(("  logval: Z1\n"));
          break;
       case LOGIC_U:
          DPRINTF(("  logval: U\n"));
          break;
       case LOGIC_S0:
          DPRINTF(("  logval: S0\n"));
          break;
       case LOGIC_S1:
          DPRINTF(("  logval: S1\n"));
          break;
       default:
          break;
       }
       pin_number = pin_info->next_input_pin_index;
    }
}

#endif

fill_in_extra_data(def_ptr, dab_info_index)
DEVICE_SPEC *def_ptr;
char          dab_info_index;
{
   PIN_SPEC              *pin_spec_ptr;
   EXTRA_DEVICE_SPEC     *extra_def_ptr;
   DAB_INFO              *dab_ptr;
   UWB_OFFSET            *uwb_ptr;
   u_short                pin_count;
   u_short                pin_number;
   u_char                 unitno;
   u_char                 wordno;
   u_char                 bitno;
   u_char                 laneno;

   extra_def_ptr = (EXTRA_DEVICE_SPEC *)def_ptr->extra_data;
   dab_ptr       = dab_list[dab_info_index];

   for (laneno = 0; laneno < MAX_LANE_COUNT; ++laneno) {
      if (dab_ptr->lane_used[laneno]) {
         extra_def_ptr->lane_used |= 1 << laneno;
      }
   }

   extra_def_ptr->has_io_store = FALSE;
   extra_def_ptr->ident_inputs   = (PTRN_BITS_LONGWORD *)
      DCALLOC((unsigned)dab_ptr->unit_count,
              (unsigned)sizeof(PTRN_BITS_LONGWORD));
   if (extra_def_ptr->ident_inputs == NULL)
      return(FAILURE);

   extra_def_ptr->ident_outputs  = (PTRN_BITS_LONGWORD *)
      DCALLOC((unsigned)dab_ptr->unit_count,
              (unsigned)sizeof(PTRN_BITS_LONGWORD));
   if (extra_def_ptr->ident_outputs == NULL)
      return(FAILURE);

   extra_def_ptr->ident_ios      = (PTRN_BITS_LONGWORD *)
      DCALLOC((unsigned)dab_ptr->unit_count,
              (unsigned)sizeof(PTRN_BITS_LONGWORD));
   if (extra_def_ptr->ident_ios == NULL)
      return(FAILURE);

   extra_def_ptr->ident_R1       = (PTRN_BITS_LONGWORD *)
      DCALLOC((unsigned)dab_ptr->unit_count,
              (unsigned)sizeof(PTRN_BITS_LONGWORD));
   if (extra_def_ptr->ident_R1 == NULL)
      return(FAILURE);
```

Copyright 1989 Logic Modeling Systems

SOURCE PROGRAM lm1000/util.c

DATE 5/23/89 TIME 6:14:53 pm PAGE # 25/175

LINE # SOURCE TEXT

```
    extra_def_ptr->ident_RZ        = (PTRN_BITS_LONGWORD *)
       DCALLOC((unsigned)dab_ptr->unit_count,
               (unsigned)sizeof(PTRN_BITS_LONGWORD));
    if (extra_def_ptr->ident_RZ == NULL)
       return(FAILURE);

    extra_def_ptr->ident_store     = (PTRN_BITS_LONGWORD *)
       DCALLOC((unsigned)dab_ptr->unit_count,
               (unsigned)sizeof(PTRN_BITS_LONGWORD));
    if (extra_def_ptr->ident_store == NULL)
       return(FAILURE);

    pin_count = def_ptr->pin_cnt;
    pin_spec_ptr = &def_ptr->pin_table[0];
    for (pin_number = 0; pin_number < pin_count; ++pin_number) {

       if ((pin_spec_ptr->direction == NONE) ||
           (pin_spec_ptr->direction == POWER) ||
           (pin_spec_ptr->direction == GROUND) ||
           (pin_spec_ptr->direction == NC)) {
          ++pin_spec_ptr;
          continue;
       }

       uwb_ptr = &pn_to_short_offset[pin_number];
       unitno = uwb_ptr->unitno;
       wordno = uwb_ptr->wordno;
       bitno  = uwb_ptr->bitno;

       if (pin_spec_ptr->pin_class == STORE) {

          set_ptrn_bit(&extra_def_ptr->ident_store   [unitno], wordno, bitno);

          if (pin_spec_ptr->direction == IO)
             extra_def_ptr->has_io_store = TRUE;
       }

       switch (pin_spec_ptr->direction) {
       case IN:
          set_ptrn_bit(&extra_def_ptr->ident_inputs  [unitno], wordno, bitno);
          break;
       case OUT:
          set_ptrn_bit(&extra_def_ptr->ident_outputs [unitno], wordno, bitno);
          break;
       case IO:
          set_ptrn_bit(&extra_def_ptr->ident_ios     [unitno], wordno, bitno);
          break;
       default:
          break;
       }

       switch (pin_spec_ptr->clk_format) {
       case R1:
          set_ptrn_bit(&extra_def_ptr->ident_R1      [unitno], wordno, bitno);
          break;
       case R0:
          set_ptrn_bit(&extra_def_ptr->ident_RZ      [unitno], wordno, bitno);
          break;
       default:
          break;
       }

       ++pin_spec_ptr;
    }

    return(SUCCESS);
}

increment_unit_addr(unit_addr, unit_count, unit_count_per_lane)
u_long          unit_addr[];
u_short         unit_count;
u_short         unit_count_per_lane;
{
    u_long   next_block_addr;
    u_long   max_block_addr;
    u_short  next_block_number;
    u_short  addr_inc_per_lane;
    u_char   unitno;

    addr_inc_per_lane = unit_count_per_lane * PTRN_ADDR_INC;

    for (unitno = 0; unitno < unit_count; ++unitno) {

       max_block_addr = (unit_addr[unitno] & BLOCK_START_MASK) + BLOCK_ADDR_INC;

       if ((unit_addr[unitno] + addr_inc_per_lane)  >= max_block_addr) {

          next_block_number = read_branch_table_content(unit_addr[unitno]);

          next_block_addr = (unit_addr[unitno] & LANE_ADDR_MASK) +
             (next_block_number << BLOCK_NUMBER_SHIFT);

          unit_addr[unitno] = next_block_addr +
             unit_addr[unitno] + addr_inc_per_lane - max_block_addr;
       }
       else {
          unit_addr[unitno] += addr_inc_per_lane;
       }
    }
}

set_feedback_branch(instance, branch_offset)
INSTANCE_INFO *instance;
short           branch_offset;
{

    DEVICE_SPEC      *def;
    DAB_INFO         *dab_ptr;
    u_long            addr;
    u_long            temp;
    u_char            laneno;

    def = instance->definition;
    dab_ptr = dab_list[instance->dab_info_index];

    for (laneno = 0; laneno < MAX_LANE_COUNT; ++laneno) {

       if (dab_ptr->lane_used[laneno]) {
          addr = instance->fb_block_addr[laneno] +
                   branch_offset * PTRN_ADDR_INC + LANE_SEGMENT_C_OFFSET;
```

Copyright 1989
Logic Modeling Systems

| SOURCE PROGRAM | DATE | PAGE # |
|---|---|---|
| lm1000/util.c | 5/23/89 | 26/176 |
| | TIME 6:14:53 pm | |

LINE # SOURCE TEXT

```
            DPRINTF(("set feedback branch at addr: %08X\n", addr));

            temp = read_loc_long((u_long *)addr);

            if (def->fb_type == FEEDBACK_RISE)
               temp = temp & PEL_BRANCH_MASK | BRANCH_RISE << PEL_BRANCH_SHIFT;
            else
               temp = temp & PEL_BRANCH_MASK | BRANCH_FALL << PEL_BRANCH_SHIFT;

            write_loc_long((u_long *)addr, temp);
        }
    }
}

/*------------------------------------------------------------------------*/

read_magic_full_sample_reg(instance, full_value_ptr)
INSTANCE_INFO  *instance;
FULL_VALUE     *full_value_ptr;
{

#ifndef DBASE
   DAB_INFO   *dab_ptr;
   u_long      addr;
   register u_long      magic_addr;
   u_char      total_unit;
   u_char      unitno;
   u_char      laneno;
   u_char      slotno;
   register u_char      wordno;
   register PTRN_BITS  *data_ptr;
   register PTRN_BITS  *hiz_ptr;
   register PTRN_BITS  *unk_ptr;

   DPRINTF(("inside read_magic_full_sample_reg\n"));

   dab_ptr = dab_list[instance->dab_info_index];

   data_ptr = full_value_ptr->data;
   hiz_ptr = full_value_ptr->hiz;
   unk_ptr = full_value_ptr->unknown;

   total_unit = dab_ptr->unit_count;
   for (unitno = 0; unitno < total_unit; ++unitno) {
      laneno = dab_ptr->unit_location[unitno].lane_no;
      slotno = dab_ptr->unit_location[unitno].slot_no;

      addr = LANE_0_START_ADDR + laneno * LANE_ADDR_INC +
             LANE_PEL_0_START_OFFSET + slotno * LANE_PEL_ADDR_INC;

      magic_addr = addr + PEL_MC_0_OFFSET +
                  (MAX_SHORT_WORD_COUNT - 1) * PEL_MC_ADDR_INC;
      for (wordno = 0; wordno < MAX_SHORT_WORD_COUNT; ++wordno) {
         /* MAGIC 0                 ---> pin 15..0
          * ptrn_ptr->word[0]       ---> pin 79..64
          */

         data_ptr->word[wordno] = read_loc_long((u_long *)
                                   (magic_addr + MC_VALUE_SAMPLE_REG_OFFSET));

         hiz_ptr->word[wordno] = read_loc_long((u_long *)
                                   (magic_addr + MC_HIZ_SAMPLE_REG_OFFSET));

         unk_ptr->word[wordno] = read_loc_long((u_lon- *)
                                   (magic_addr + MC_U_SAMPLE_REG_OFFSET));

         magic_addr -= PEL_MC_ADDR_INC;
      }

      DPRINTF((" DATA: %08X %08X %08X\n",
              ((PTRN_BITS_LONGWORD *)data_ptr)->word[0],
              ((PTRN_BITS_LONGWORD *)data_ptr)->word[1],
              ((PTRN_BITS_LONGWORD *)data_ptr)->word[2]));

      DPRINTF((" HIZ : %08X %08X %08X\n",
              ((PTRN_BITS_LONGWORD *)hiz_ptr)->word[0],
              ((PTRN_BITS_LONGWORD *)hiz_ptr)->word[1],
              ((PTRN_BITS_LONGWORD *)hiz_ptr)->word[2]));

      DPRINTF((" UNK : %08X %08X %08X\n",
              ((PTRN_BITS_LONGWORD *)unk_ptr)->word[0],
              ((PTRN_BITS_LONGWORD *)unk_ptr)->word[1],
              ((PTRN_BITS_LONGWORD *)unk_ptr)->word[2]));

      ++data_ptr;
      ++hiz_ptr;
      ++unk_ptr;
   }
#else
   DAB_INFO              *dab_ptr;
   UWB_OFFSET            *uwb_ptr;
   char                   line[80];
   u_long                 pin_number;
   u_short                total_pin;
   u_char                 pin_value;
   u_char                 unitno;
   u_char                 wordno;
   u_ch--                 bitno;

   DPRINTF(("inside read_magic_full_sample_reg()\n"));

   if (is_measure_delay == TRUE) {
      dab_ptr = dab_list[instance->dab_info_index];
      total_pin = dab_ptr->unit_count * 80;

      for (pin_number = 0; pin_number < total_pin; ++pin_number) {
         if (tm_result_array[pin_number].set_by_user == TRUE) {


            uwb_ptr = &pe_to_short_offset[pin_number];
            unitno = uwb_ptr->unitno;
            wordno = uwb_ptr->wordno;
            bitno  = uwb_ptr->bitno;

            set_pin_value(full_value_ptr, unitno, wordno, bitno,
                          tm_result_array[pin_number].steady_state_full_value);

         }
      }
```

Copyright 1989 Logic Modeling Systems

LINE # SOURCE TEXT

```
         return;
      }

      DPRINTF(("enter starting pin_number: \n"));
      gets(line);
      sscanf(line, "%d", &pin_number);

      /* assume that the UWB pin_number is sequential */

      DPRINTF(("enter pin value on at a time, end with 'X' (legal val: 0, 1, Z0, Z1, U)\n"));

      while (1) {
         DPRINTF(("pin value: "));
         gets(line);
         if (strcmp(line, "0") == 0)
            pin_value = LOGIC_0;
         else if (strcmp(line, "1") == 0)
            pin_value = LOGIC_1;
         else if (strcmp(line, "Z0") == 0)
            pin_value = LOGIC_Z0;
         else if (strcmp(line, "Z1") == 0)
            pin_value = LOGIC_Z1;
         else if (strcmp(line, "U") == 0)
            pin_value = LOGIC_U;
         else if (strcmp(line, "X") == 0)
            break;
         else {
            DPRINTF(("illegal value. ignored\n"));
            continue;
         }


         uwb_ptr = &pn_to_short_offset[pin_number];
         unitno = uwb_ptr->unitno;
         wordno = uwb_ptr->wordno;
         bitno  = uwb_ptr->bitno;

         set_pin_value(full_value_ptr, unitno, wordno, bitno, pin_value);

         ++pin_number;
   }
#endif
}

/*------------------------------------------------------------------------*/

/* ARGSUSED */
read_magic_timing_sample_reg(instance, ptrn_long_ptr, current_time)
INSTANCE_INFO         *instance;
PTRN_BITS_LONGWORD    *ptrn_long_ptr;
u_short                current_time;
{
#ifndef DBASE
   DAB_INFO     *dab_ptr;
   u_long        addr;
   u_long        magic_addr;
   u_char        total_unit;
   u_char        unitno;
   u_char        laneno;
   u_char        slotno;
   u_char        wordno;
   PTRN_BITS    *ptrn_ptr;

   DPRINTF(("inside read_magic_timing_sample_reg\n"));

   dab_ptr = dab_list[instance->dab_info_index];

   ptrn_ptr = (PTRN_BITS *)ptrn_long_ptr;
   total_unit = dab_ptr->unit_count;
   for (unitno = 0; unitno < total_unit; ++unitno) {
      laneno = dab_ptr->unit_location[unitno].lane_no;
      slotno = dab_ptr->unit_location[unitno].slot_no;

      addr = LANE_0_START_ADDR + laneno * LANE_ADDR_INC +
             LANE_PEL_0_START_OFFSET + slotno * LANE_PEL_ADDR_INC;

      magic_addr = addr + PEL_MC_0_OFFSET + MC_TIMING_SAMPLE_REG_OFFSET +
                   (MAX_SHORT_WORD_COUNT - 1) * PEL_MC_ADDR_INC;
      for (wordno = 0; wordno < MAX_SHORT_WORD_COUNT; ++wordno) {
         /* MAGIC 0                --> pin 15..0
          * ptrn_ptr->word[8]      --> pin 79..64
          */

         ptrn_ptr->word[wordno] = read_loc_long((u_long *)magic_addr);

         magic_addr -= PEL_MC_ADDR_INC;

      }

      DPRINTF((" DATA: %08X %08X %08X\n",
              ((PTRN_BITS_LONGWORD *)ptrn_ptr)->word[0],
              ((PTRN_BITS_LONGWORD *)ptrn_ptr)->word[1],
              ((PTRN_BITS_LONGWORD *)ptrn_ptr)->word[2]));

      ++ptrn_ptr;
   }
#else
   DAB_INFO              *dab_ptr;
   UWB_OFFSET            *uwb_ptr;
   char                   line[80];
   u_long                 pin_number;
   u_short                total_pin;
   u_char                 unitno;
   u_char                 wordno;
   u_char                 bitno;

   DPRINTF(("inside read_magic_timing_sample_reg()\n"));

   if (in_measure_delay == TRUE) {
      dab_ptr = dab_list[instance->dab_info_index];
      total_pin = dab_ptr->unit_count * 80;

      for (pin_number = 0; pin_number < total_pin; ++pin_number) {
         if (tm_result_array[pin_number].set_by_user == TRUE) {

            uwb_ptr = &pn_to_short_offset[pin_number];
            unitno = uwb_ptr->unitno;
            wordno = uwb_ptr->wordno;
            bitno  = uwb_ptr->bitno;
```

Copyright 1989 Logic Modeling Systems

| SOURCE PROGRAM | DATE | PAGE # |
|---|---|---|
| lm1000/util.c | 5/23/89 TIME 6:14:53 pm | 28/178 |

LINE # SOURCE TEXT

```
                if (tm_result_array[pin_number].expected_time <= current_time) {
                    if (tm_result_array[pin_number].two_state_value == LOGIC_0) {
                        reset_ptrn_bit(&((PTRN_BITS *)ptrn_long_ptr)[unitno],
                                       wordno, bitno);
                    }
                    else {
                        set_ptrn_bit(&((PTRN_BITS *)ptrn_long_ptr)[unitno],
                                       wordno, bitno);
                    }
                }
                else {
                    if (tm_result_array[pin_number].two_state_value == LOGIC_0) {
                        set_ptrn_bit(&((PTRN_BITS *)ptrn_long_ptr)[unitno],
                                       wordno, bitno);
                    }
                    else {
                        reset_ptrn_bit(&((PTRN_BITS *)ptrn_long_ptr)[unitno],
                                     wordno, bitno);
                    }
                }
            }
        }
        return;
    }

    DPRINTF(("enter starting pin_number: \n"));
    gets(line);
    sscanf(line, "%d", &pin_number);

    /* assume that the DAB pin_number is sequential */

    DPRINTF(("enter pin value on at a time, end with 'X' (legal val: 0, 1)\n"));

    while (1) {

        uwb_ptr = &pe_to_short_offset[pin_number];
        unitno = uwb_ptr->unitno;
        wordno = uwb_ptr->wordno;
        bitno  = uwb_ptr->bitno;

        DPRINTF(("pin value: "));
        gets(line);

        if (strcmp(line, "0") == 0)
            reset_ptrn_bit(&((PTRN_BITS *)ptrn_long_ptr)[unitno], wordno, bitno);
        else if (strcmp(line, "1") == 0)
            set_ptrn_bit(&((PTRN_BITS *)ptrn_long_ptr)[unitno], wordno, bitno);
        else if (strcmp(line, "X") == 0)
            break;
        else {
            DPRINTF(("illegal value. ignored\n"));
            continue;
        }

        ++pin_number;
    }
#endif
}

/*-----------------------------------------------------------------------*/

clear_ptrn_bits(ptrn_ptr, total_unit)
char     *ptrn_ptr;
u_char    total_unit;
{
    char *memset();

    (void)memset(ptrn_ptr, 0, (int)(total_unit * sizeof(PTRN_BITS)));
}

copy_ptrn_bits(source, dest, total_unit)
char    *source;
char    *dest;
u_char   total_unit;
{
    char *memcpy();

    (void)memcpy(dest, source, (int)(total_unit * sizeof(PTRN_BITS)));
}

init_tm_pin_info_table(tm_pin_info_table, pin_count)
TM_PIN_INFO  *tm_pin_info_table;
u_short       pin_count;
{
    u_short pinno;

    for (pinno = 0; pinno < pin_count; ++pinno) {
        tm_pin_info_table[pinno].delay_found        = FALSE;
        tm_pin_info_table[pinno].delay_value_is_set = FALSE;
    }
}

setup_gbl_dummy_ptrn(dab_ptr)
DAB_INFO   *dab_ptr;
{
    u_char unitno;
    u_char total_unit;

    total_unit = dab_ptr->unit_count;
    for (unitno = 0; unitno < total_unit; ++unitno) {
        set_pel_sel(&gbl_dummy_ptrn[unitno].ctl,
                    dab_ptr->unit_location[unitno].slot_no);

    }
}

lm_print_message()
{
    /* ???? This is needed by EMBL */
}

start_tmg(def_ptr)
DEVICE_SPEC  *def_ptr;
{
    EXTRA_DEVICE_SPEC  *extra_def_ptr;

    extra_def_ptr = (EXTRA_DEVICE_SPEC *)def_ptr->extra_data;

    if (lm_tmg_set_frequency(extra_def_ptr->n_reg,
                             extra_def_ptr->k_reg,
```

Copyright 1989
Logic Modeling Systems

LINE # SOURCE TEXT

```
                                 extra_def_ptr->source_reg) != SUCCESS) {
         lm_queue_message(ERROR_MSG, "Timing Generator error: set frequency");
         return(FAILURE);
    }

    /* Set the mode to EARLY SAMPLE and the EDGE 7 threshold to 255,
     * in order to get a sample pulse.
     * These values will be overrided if we are doing timing measurement.
     */
    extra_def_ptr->edge_setting[6] = 255;

    if (lm_tmg_set_sample_trigger_mode(
                                    (u_long)EARLYSAMPLETRIGGERMODE) == FAILURE) {
        lm_queue_message(ERROR_MSG, "Timing Generator error: set sample trigger mode");
        return(FAILURE);
    }

    return(SUCCESS);
}

load_starting_address(instance)
INSTANCE_INFO  *instance;
{
    /* Load the starting pattern address on each lane and
     * also load the clock frequency register.
     */
    EXTRA_DEVICE_SPEC  *extra_def_ptr;
    DAB_INFO           *dab_ptr;
    u_long              addr;
    u_char              laneno;
    u_short             blocknum;
    u_char              clock_speed_reg;

    extra_def_ptr = (EXTRA_DEVICE_SPEC *)instance->definition->extra_data;

    if (extra_def_ptr->actual_phy_clock_period < PAC_FREQUENCY_THRESHOLD)
        clock_speed_reg = 1;
    else
        clock_speed_reg = 0;

    dab_ptr = dab_list[instance->dab_info_index];

    /* Tell the TMG which lane we are playing to */
    lm_tmg_lane_select(dab_ptr->ident_lane);

    for (laneno = 0; laneno < MAX_LANE_COUNT; ++laneno) {
        if (dab_ptr->lane_used[laneno]) {
            blocknum = ptob(instance->seq_start_addr[laneno]);
            addr = LANE_0_START_ADDR + laneno * LANE_ADDR_INC +
                       LANE_PAC_START_OFFSET;

            /* set the starting address */
            write_loc_long((u_long *)(addr + PAC_BRANCH_ADDR_REG_OFFSET),
                           (u_long)blocknum);

            /* set the clock speed register */
            write_loc_long((u_long *)(addr + PAC_CLOCK_SPEED_REG_OFFSET),
                           (u_long)clock_speed_reg);

        }
    }
}

#ifndef MODELER
sc_delay()
{
}
#endif

set_edge_and_sample_setting(extra_def_ptr, resolution, sample_threshold)
EXTRA_DEVICE_SPEC  *extra_def_ptr;
u_long              resolution;
u_long              sample_threshold;
{

#ifndef DBASE
    if (lm_tmg_set_edge_settings(extra_def_ptr->logical_clock_period,
                                 extra_def_ptr->edge_setting) != SUCCESS) {
        lm_queue_message(ERROR_MSG, "Timing Generator error: set edge settings");
        return(FAILURE);
    }

    if (lm_tmg_set_rising_sample(resolution, sample_threshold) != SUCCESS) {
        lm_queue_message(ERROR_MSG, "Timing Generator error: set rising sample");
        return(FAILURE);
    }

    if (lm_tmg_set_falling_sample(extra_def_ptr->falling_sample_reg) !=
                                                              SUCCESS) {
        lm_queue_message(ERROR_MSG, "Timing Generator error: set falling sample");
        return(FAILURE);
    }
#endif
    setup_timer0(TMG_TIMER_VALUE);
    return(SUCCESS);
}

calc_dab_voltage(def_ptr, dab_ptr)
DEVICE_SPEC    *def_ptr;
DAB_INFO       *dab_ptr;
{
    EXTRA_DEVICE_SPEC  *extra_def_ptr;
    u_short             temp;
    u_short             adjusted_val;
    u_short             adjusted_vsh;
    u_short             adjusted_vil;
    u_short             adjusted_vih;
    u_short             adjusted_vlth;
    u_short             adjusted_vhth;

    extra_def_ptr = (EXTRA_DEVICE_SPEC *)def_ptr->extra_data;

    if (dab_ptr->dut_vcc_measured < MIN_DUTVCC) {
        lm_queue_message(ERROR_MSG, "device VCC measured (%d mV) is too low, min allowed: %d mV",
                         dab_ptr->dut_vcc_measured,
                         MIN_DUTVCC);
        return(FAILURE);
    }

    if (dab_ptr->dut_vcc_measured > MAX_DUTVCC) {
```

Copyright 1989 Logic Modeling Systems

LINE # SOURCE TEXT

```
        lm_queue_message(ERROR_MSG, "device VCC measured (%d mV) is too high, max allowed: %d mV",
                         dab_ptr->dut_vcc_measured,
                         MAX_DUTVCC);
        return(FAILURE);
    }

    if (within_tolerance(dab_ptr->dut_vcc_measured, def_ptr->vcc) == FALSE) {
        lm_queue_message(ERROR_MSG, "device VCC does not match, measured: %d mV specified: %d mV",
                         dab_ptr->dut_vcc_measured, def_ptr->vcc);
        return(FAILURE);
    }

    if (def_ptr->vsl > def_ptr->vcc / 5) {
        lm_queue_message(ERROR_MSG, "Vsl out of range. Specified: %d mV range: (%d mV - %d mV)",
                         def_ptr->vsl, 0, def_ptr->vcc / 5);
        return(FAILURE);
    }

    if ((def_ptr->vsh < def_ptr->vcc / 2) ||
        (def_ptr->vsh > def_ptr->vcc)) {
        lm_queue_message(ERROR_MSG, "Vsh out of range. Specified: %d mV range: (%d mV - %d mV)",
                         def_ptr->vsh,
                         def_ptr->vcc / 2,
                         def_ptr->vcc);
        return(FAILURE);
    }

    if (def_ptr->vlth > def_ptr->vcc / 5) {
        lm_queue_message(ERROR_MSG, "Vlth out of range. Specified: %d mV range: (%d mV - %d mV)",
                         def_ptr->vlth, 0, def_ptr->vcc / 5);
        return(FAILURE);
    }

    if ((def_ptr->vhth < def_ptr->vcc / 2) ||
        (def_ptr->vhth > def_ptr->vcc)) {
        lm_queue_message(ERROR_MSG, "Vhth out of range. Specified: %d mV range: (%d mV - %d mV)",
                         def_ptr->vhth,
                         def_ptr->vcc / 2,
                         def_ptr->vcc);
        return(FAILURE);
    }

    if (def_ptr->vil > def_ptr->vcc) {
        lm_queue_message(ERROR_MSG, "Vil out of range. Specified: %d mV range: (%d mV - %d mV)",
                         def_ptr->vil,
                         0,
                         def_ptr->vcc);
        return(FAILURE);
    }

    if (def_ptr->vih > def_ptr->vcc) {
        lm_queue_message(ERROR_MSG, "Vih out of range. Specified: %d mV range: (%d mV - %d mV)",
                         def_ptr->vih,
                         0,
                         def_ptr->vcc);
        return(FAILURE);
    }

    adjusted_vsl = def_ptr->vsl * dab_ptr->dut_vcc_measured / def_ptr->vcc;
    extra_def_ptr->vsl_dac_value =
        REG_VALUE(0, dab_ptr->dut_vcc_measured / 5, adjusted_vsl);

    extra_def_ptr->private_vsl_dac_value =
        REG_VALUE(0, dab_ptr->dut_vcc_measured / 5, 0);

    adjusted_vsh = def_ptr->vsh * dab_ptr->dut_vcc_measured / def_ptr->vcc;
    extra_def_ptr->vsh_dac_value =
        REG_VALUE(dab_ptr->dut_vcc_measured / 2,
                  dab_ptr->dut_vcc_measured,
                  adjusted_vsh);

    if (def_ptr->vsh + 400 > dab_ptr->dut_vcc_measured)
        temp = dab_ptr->dut_vcc_measured;
    else
        temp = def_ptr->vsh + 400;

    extra_def_ptr->private_vsh_dac_value =
        REG_VALUE(dab_ptr->dut_vcc_measured / 2,
                  dab_ptr->dut_vcc_measured,
                  temp);

    adjusted_vlth = def_ptr->vlth * dab_ptr->dut_vcc_measured / def_ptr->vcc;
    extra_def_ptr->vlth_dac_value =
        REG_VALUE(0, dab_ptr->dut_vcc_measured / 5, adjusted_vlth);

    adjusted_vhth = def_ptr->vhth * dab_ptr->dut_vcc_measured / def_ptr->vcc;
    extra_def_ptr->vhth_dac_value =
        REG_VALUE(dab_ptr->dut_vcc_measured / 2,
                  dab_ptr->dut_vcc_measured,
                  adjusted_vhth);

    adjusted_vil = def_ptr->vil * dab_ptr->dut_vcc_measured / def_ptr->vcc;
    extra_def_ptr->vil_dac_value =
        REG_VALUE(0, dab_ptr->dut_vcc_measured, adjusted_vil);

    adjusted_vih = def_ptr->vih * dab_ptr->dut_vcc_measured / def_ptr->vcc;
    extra_def_ptr->vih_dac_value =
        REG_VALUE(0, dab_ptr->dut_vcc_measured, adjusted_vih);

    DPRINTF(("vih   : %4d mV --> %x\n", adjusted_vih,
        extra_def_ptr->vih_dac_value));
    DPRINTF(("vil   : %4d mV --> %x\n", adjusted_vil,
        extra_def_ptr->vil_dac_value));
    DPRINTF(("vhth  : %4d mV --> %x\n", adjusted_vhth,
        extra_def_ptr->vhth_dac_value));
    DPRINTF(("vlth  : %4d mV --> %x\n", adjusted_vlth,
        extra_def_ptr->vlth_dac_value));
    DPRINTF(("vsh   : %4d mV --> %x\n", adjusted_vsh,
        extra_def_ptr->vsh_dac_value));
    DPRINTF(("vsl   : %4d mV --> %x\n", adjusted_vsl,
        extra_def_ptr->vsl_dac_value));
    return(SUCCESS);
}

within_tolerance(ref_value, value)
u_short ref_value;
u_short value;
{
    /* Return TRUE if "value" is +- MAX_PERCENT_TOLARANCE percent from
     * "ref_value", else return FALSE.
```

Copyright 1989
Logic Modeling Systems

SOURCE PROGRAM lm1000/util.c

DATE 5/23/89 TIME 6:14:53 pm PAGE # 31/181

LINE # SOURCE TEXT

```
    */

    if ((value < ref_value - MAX_PERCENT_TOLERANCE * ref_value / 100) ||
        (value > ref_value + MAX_PERCENT_TOLERANCE * ref_value / 100))
       retu     SE);

    return(TRUE);
}

verify_soft_drive_current(def_ptr, dab_ptr)
DEVICE_SPEC  *def_ptr;
DAB_INFO     *dab_ptr;
{
    PIN_SPEC          *pin_spec_ptr;
    u_long            total_current;
    u_short           pin_count;
    u_short           max_pin_count;
    u_short           soft_drive_low_count[MAX_LANE_COUNT * MAX_SLOT_COUNT][4];
    u_short           soft_drive_high_count[MAX_LANE_COUNT * MAX_SLOT_COUNT][4];
    u_short           pinno;
    u_char            unitno;
    u_char            pelno;
    u_char            temp;
    u_char            current_limit_exceeded = FALSE;

    for (pelno = 0; pelno < MAX_LANE_COUNT * MAX_SLOT_COUNT; ++pelno) {
       for (temp = 0; temp < 4; ++temp) {
          soft_drive_low_count[pelno][temp] = 0;
          soft_drive_high_count[pelno][temp] = 0;
       }
    }

    pin_count = def_ptr->pin_cnt;
    max_pin_count = dab_ptr->unit_count * MAX_PIN_PER_UNIT;

    unitno = pn_to_short_offset[pin_count - 1].unitno;
    pelno = dab_ptr->unit_location[unitno].lane_no * MAX_SLOT_COUNT +
                                 dab_ptr->unit_location[unitno].slot_no;

    for (pinno = pin_count; pinno < max_pin_count; ++pinno) {
       /* These pins are not specified but are not in the device.h
        * because the pin_table in the device.h only goes up to
        * the largest pin the user specifies.
        */
       soft_drive_low_count[pelno][0] += 1;
    }

    pin_spec_ptr = &def_ptr->pin_table[0];
    for (pinno = 0; pinno < pin_count; ++pinno) {

       unitno = pn_to_short_offset[pinno].unitno;
       pelno = dab_ptr->unit_location[unitno].lane_no * MAX_SLOT_COUNT +
                                 dab_ptr->unit_location[unitno].slot_no;

       if (pin_spec_ptr->direction == NONE) {
          /* These pins will be soft driven LOW with minimum current */
          soft_drive_low_count[pelno][0] += 1;
          ++pin_spec_ptr;
          continue;
       }

       if ((pin_spec_ptr->direction == POWER) ||
           (pin_spec_ptr->direction == GROUND) ||
           (pin_spec_ptr->direction == NC)) {
          +pin_spec_ptr;
          continue;
       }

       /* SDHEN[3-0] */
       temp = pin_spec_ptr->s_drive_hi;
       if (temp & 0x8)
          soft_drive_high_count[pelno][3] += 1;
       if (temp & 0x4)
          soft_drive_high_count[pelno][2] += 1;
       if (temp & 0x2)
          soft_drive_high_count[pelno][1] += 1;
       if (temp & 0x1)
          soft_drive_high_count[pelno][0] += 1;

       /* SDLEN[3-0]B */
       temp = pin_spec_ptr->s_drive_low;
       if (temp & 0x8)
          soft_drive_low_count[pelno][3] += 1;
       if (temp & 0x4)
          soft_drive_low_count[pelno][2] += 1;
       if (temp & 0x2)
          soft_drive_low_count[pelno][1] += 1;
       if (temp & 0x1)
          soft_drive_low_count[pelno][0] += 1;

       ++pin_spec_ptr;
    }

   for (pelno = 0; pelno < MAX_LANE_COUNT * MAX_SLOT_COUNT; ++pelno) {

      /* Check the HIGH current limit */
      total_current =
         PEL_SDRIVE_HIGH_3_CURRENT * soft_drive_high_count[pe'no][3] +
         PEL_SDRIVE_HIGH_2_CURRENT * soft_drive_high_count[pe.   [2] +
         PEL_SDRIVE_HIGH_1_CURRENT * soft_drive_high_count[pelno][1] +
         PEL_SDRIVE_HIGH_0_CURRENT * soft_drive_high_count[pelno][0];

      /* Adjust the total high current depending on how far vsh is from vcc */
      total_current *= (((def_ptr->vcc - def_ptr->vsh) * 4) / 2500 + 1);

      if (total_current > MAX_PEL_SDRIVE_CURRENT) {
         current_limit_exceeded = TRUE;
         lm_queue_message(ERROR_MSG, "Pin Electronics Module in lane: %c slot: %d high current limit exceeded",
                          'A' + pelno / MAX_SLOT_COUNT,
                          pelno % MAX_SLOT_COUNT);
      }


      /* Check the LOW current limit */
      total_current =
         PEL_SDRIVE_LOW_3_CURRENT * soft_drive_low_count[pelno][3] +
         PEL_SDRIVE_LOW_2_CURRENT * soft_drive_low_count[pelno][2] +
         PEL_SDRIVE_LOW_1_CURRENT * soft_drive_low_count[pelno][1] +
         PEL_SDRIVE_LOW_0_CURRENT * soft_drive_low_count[pelno][0];
```

Copyright 1989
Logic Modeling Systems

LINE # SOURCE TEXT

```
        if (total_current > MAX_PEL_SDRIVE_CURRENT) {
            current_limit_exceeded = TRUE;
            lm_queue_message(ERROR_MSG, "Pin Electronics Module in lane: %c slot: %d low current limit exceeded",
                             'A' + pelno / MAX_SLOT_COUNT,
                             pelno % MAX_SLOT_COUNT);

    }

    if (current_limit_exceeded == TRUE)
        return(FAILURE);

    return(SUCCESS);
}

program_dac(def_ptr, dab_info_index, changed_dac)
DEVICE_SPEC  *def_ptr;
char          dab_info_index;
u_char       *changed_dac;
{
    EXTRA_DEVICE_SPEC  *extra_def_ptr;
    DAB_INFO           *dab_ptr;
    u_long              addr;
    u_char              unitno;
    u_char              total_unit;
    u_char              laneno;
    u_char              slotno;

    DPRINTF(("inside program_dac\n"));

    *changed_dac = FALSE;
    extra_def_ptr = (EXTRA_DEVICE_SPEC *)def_ptr->extra_data;
    dab_ptr = dab_list[dab_info_index];

    total_unit = dab_ptr->unit_count;
    for (unitno = 0; unitno < total_unit; ++unitno) {
        laneno = dab_ptr->unit_location[unitno].lane_no;
        slotno = dab_ptr->unit_location[unitno].slot_no;

        addr = LANE_0_START_ADDR + laneno * LANE_ADDR_INC +
               LANE_PEL_0_START_OFFSET + slotno * LANE_PEL_ADDR_INC;

        if (dab_ptr->vsl_programmed != extra_def_ptr->vsl_dac_value) {
            DPRINTF(("program VSL\n"));
            write_loc_long((u_long *)(addr + PEL_VSL_DAC_WRITE_OFFSET),
                           (u_long)extra_def_ptr->vsl_dac_value);
            *changed_dac = TRUE;
        }

        if (dab_ptr->vsh_programmed != extra_def_ptr->vsh_dac_value) {
            DPRINTF(("program VSH\n"));
            write_loc_long((u_long *)(addr + PEL_VSH_DAC_WRITE_OFFSET),
                           (u_long)extra_def_ptr->vsh_dac_value);
            *changed_dac = TRUE;
        }

        if (dab_ptr->vlth_programmed != extra_def_ptr->vlth_dac_value) {
            DPRINTF(("program VLTH\n"));
            write_loc_long((u_long *)(addr + PEL_VLTH_DAC_WRITE_OFFSET),
                           (u_long)extra_def_ptr->vlth_dac_value);
            *changed_dac = TRUE;
        }

        if (dab_ptr->vhth_programmed != extra_def_ptr->vhth_dac_value) {
            DPRINTF(("program VHTH\n"));
            write_loc_long((u_long *)(addr + PEL_VHTH_DAC_WRITE_OFFSET),
                           (u_long)extra_def_ptr->vhth_dac_value);
            *changed_dac = TRUE;
        }

        if (dab_ptr->vil_programmed != extra_def_ptr->vil_dac_value) {
            DPRINTF(("program VIL\n"));
            write_loc_long((u_long *)(addr + PEL_VIL_DAC_WRITE_OFFSET),
                           (u_long)extra_def_ptr->vil_dac_value);
            *changed_dac = TRUE;
        }

        if (dab_ptr->vih_programmed != extra_def_ptr->vih_dac_value) {
            DPRINTF(("program VIH\n"));
            write_loc_long((u_long *)(addr + PEL_VIH_DAC_WRITE_OFFSET),
                           (u_long)extra_def_ptr->vih_dac_value);
            *changed_dac = TRUE;
        }

        /* If there are no DAC change on the first unit of the DAB,
         * there won't be any on other units; so just break from the
         * for loop.
         */
        if (*changed_dac == FALSE)
            break;
    }

#ifdef MODELER
    if (*changed_dac == TRUE) {
        DPRINTF(("changed dac value\n"));

        setup_timer1(DAC_TIMER_VALUE);

        dab_ptr->vsl_programmed = extra_def_ptr->vsl_dac_value;
        dab_ptr->vsh_programmed = extra_def_ptr->vsh_dac_value;
        dab_ptr->vlth_programmed = extra_def_ptr->vlth_dac_value;
        dab_ptr->vhth_programmed = extra_def_ptr->vhth_dac_value;
        dab_ptr->vil_programmed = extra_def_ptr->vil_dac_value;
        dab_ptr->vih_programmed = extra_def_ptr->vih_dac_value;
    }
#endif

    return(SUCCESS);
}

set_private_mode(dab_ptr, set_it)
DAB_INFO  *dab_ptr;
u_char     set_it;
{
    /* If "set_it" == TRUE then set the PRIVATE bit on each PEL
     * otherwise reset the bit.
     */
    u_long addr;
    u_char total_unit;
    u_char value;
    u_char laneno;
```

Copyright 1989 Logic Modeling Systems

| SOURCE PROGRAM | DATE | PAGE # |
|---|---|---|
| lm1000/util.c | 5/23/89 TIME 6:14:53 pm | 33/183 |

SOURCE TEXT

```
   u_char slotno;
   u_char unitno;

   total_unit = dab_ptr->unit_count;
   for (unitno = 0; unitno < total_unit; ++unitno) {
      laneno = dab_ptr->unit_location[unitno].lane_no;
      slotno = dab_ptr->unit_location[unitno].slot_no;

      addr = LANE_0_START_ADDR + laneno * LANE_ADDR_INC +
             LANE_PEL_0_START_OFFSET + slotno * LANE_PEL_ADDR_INC +
             PEL_STATUS_CONTROL_OFFSET;

      value = read_loc_long((u_long *)addr) & 0xff;
      if (set_it == TRUE) {
         value |= ~PEL_CS_PRIVATE_PUBLIC_MASK;
      }
      else {
         value &= PEL_CS_PRIVATE_PUBLIC_MASK;
      }

      write_loc_long((u_long *)addr, (u_long)value);
   }
}

turn_on_in_use(dab_ptr)
DAB_INFO  *dab_ptr;
{
   u_long addr;
   u_char total_unit;
   u_char value;
   u_char laneno;
   u_char slotno;
   u_char unitno;

   total_unit = dab_ptr->unit_count;
   for (unitno = 0; unitno < total_unit; ++unitno) {
      laneno = dab_ptr->unit_location[unitno].lane_no;
      slotno = dab_ptr->unit_location[unitno].slot_no;

      addr = LANE_0_START_ADDR + laneno * LANE_ADDR_INC +
             LANE_PEL_0_START_OFFSET + slotno * LANE_PEL_ADDR_INC +
             PEL_STATUS_CONTROL_OFFSET;

      value = read_loc_long((u_long *)addr) & 0xff | ~PEL_CS_IN_USE_LED_MASK;

      write_loc_long((u_long *)addr, (u_long)value);
   }
}

turn_off_in_use(dab_ptr)
DAB_INFO  *dab_ptr;
{
   u_long addr;
   u_char total_unit;
   u_char value;
   u_char laneno;
   u_char slotno;
   u_char unitno;

   total_unit = dab_ptr->unit_count;
   for (unitno = 0; unitno < total_unit; ++unitno) {
      laneno = dab_ptr->unit_location[unitno].lane_no;
      slotno = dab_ptr->unit_location[unitno].slot_no;

      addr = LANE_0_START_ADDR + laneno * LANE_ADDR_INC +
             LANE_PEL_0_START_OFFSET + slotno * LANE_PEL_ADDR_INC +
             PEL_STATUS_CONTROL_OFFSET;

      value = read_loc_long((u_long *)addr) & 0xff & PEL_CS_IN_USE_LED_MASK;

      write_loc_long((u_long *)addr, (u_long)value);
   }
}

do_loop_ptrs(instance)
INSTANCE_INFO  *instance;
{
   DEVICE_SPEC        *def_ptr;
   EXTRA_DEVICE_SPEC  *extra_def_ptr;
   u_long              inst_block_number[MAX_LANE_COUNT];
   u_long              seq_end_addr[MAX_LANE_COUNT];
   u_long              i;
   u_long              timeout;
   u_char              changed_dac;
   extern int          lm_intr_requested; /* global interrupt advisory flag */

   lm_intr_requested = 0;

   /* The timeout value is set with the assumption that we are running at
    * 150KHz (~8us period).
    *       timeout = pattern play time + 1 second for feedback
    *               = pattern_count * 8 microsec + 125000 * 8 microsec
    *               = (pattern_count + 125000) * 8 microsec
    *               = (pattern_count + 125000) * 8 / 1000  millisec
    *               = (pattern_count + 125000) >> 7;
    */
   timeout = (instance->pattern_count + PTRN_COUNT_FUDGE_FACTOR) >> 7;

   def_ptr = instance->definition;
   extra_def_ptr = (EXTRA_DEVICE_SPEC *)def_ptr->extra_data;

   if (program_dac(def_ptr, (char)instance->dab_info_index,
                                  &changed_dac) == FAILURE) {
      return(FAILURE);
   }

#ifndef DBASE
   if (start_tmg(def_ptr) == FAILURE) {
      return(FAILURE);
   }
#endif

   if (set_edge_and_sample_setting(extra_def_ptr,
                                  (u_long)RESOLUTION_05_NS,
                                  (u_long)MAX_SAMPLE_RAMP_RANGE) == FAILURE)
      return(FAILURE);

   set_seq_end_bit(instance,
                   instance->lane_addr,
                   FALSE,
```

Copyright 1989 Logic Modeling Systems

LINE # SOURCE TEXT

```
                    seq_end_addr,
                    inst_block_number);

    for (i = 0; lm_intr_requested == 0; ++i) {
        if (play_ptrn_seq(instance, timeout, &changed_dac) == FAILURE) {
            remove_seq_end_bit(instance, seq_end_addr, inst_block_number);
            if (i > 0)
                lm_queue_message(ERROR_MSG, "failed in loop number: %d",
                                 i - lm_loop_pattern_count);
            return(FAILURE);
        }
    }

    remove_seq_end_bit(instance, seq_end_addr, inst_block_number);

    return(SUCCESS);
}

count_avail_pattern(lanenum)
u_char lanenum;
{
    u_long   total_block;
    u_long   temp;
    u_char   laneno;

    if (lanenum == MAX_LANE_COUNT) {
        total_block = 0;
        for (laneno = 0; laneno < MAX_LANE_COUNT; ++laneno)
            total_block += count_avail_pattern(laneno);
        DPRINTF(("avail on lane: ALL --> %d blocks\n", total_block));
        return(total_block);
    }
    else {
        total_block = 0;
        temp = free_block_list[lanenum];
        while (temp != NULL) {
            ++total_block;
            temp = read_loc_long((u_long *)temp);
        }
        DPRINTF(("avail on lane: %d --> %d blocks\n", lanenum, total_block));
        return(total_block);
    }
}

lm_free(ptr)
char *ptr;
{
    DPRINTF(("lm_free: %08X\n", ptr));
    free(ptr);
}

char *
lm_calloc(nelem, elsize)
unsigned nelem, elsize;
{
    char *ptr;

    DPRINTF(("lm_calloc: %d elements of %d bytes --> ", nelem, elsize));
    ptr = calloc(nelem, elsize);
    DPRINTF(("%08X\n", ptr));
    return(ptr);
}

char *
lm_malloc(size)
unsigned size;
{
    char *ptr;

    DPRINTF(("lm_malloc: %d bytes --> ", size));
    ptr = malloc(size);
    DPRINTF(("%08X\n", ptr));
    return(ptr);
}

char *
lm_realloc(ptr, size)
char *ptr;
unsigned size;
{
    char *ptr2;

    DPRINTF(("lm_realloc: ptr = %08X size = %08X -->", ptr, size));
    ptr2 = realloc(ptr, size);
    DPRINTF(("%08x\n", ptr2));
    return(ptr2);
}

get_fatal_hardware_message()
{
    u_char  laneno;

    if (modeler_error.tmg_error == TRUE)
        lm_queue_message(ERROR_MSG, "fatal Timing Generator error");

    if (modeler_error.unknown_source_of_interrupt == TRUE) {
        for (laneno = 0; laneno < MAX_LANE_COUNT; ++laneno) {
            if (! (modeler_error.lane_errors & (1 << laneno)))
                continue;

            lm_queue_message(ERROR_MSG, "unknown source of interrupt on lane: %c",
                             'A' + laneno);
        }
    }

    if (modeler_error.lane_errors) {
        for (laneno = 0; laneno < MAX_LANE_COUNT; ++laneno) {
            if (! (modeler_error.lane_errors & (1 << laneno)))
                continue;
            if (modeler_error.pac_error[laneno].pac_refresh_error == TRUE)
                lm_queue_message(ERROR_MSG, "fatal Pattern Controller refresh error in lane: %c",
                                 'A' + laneno);
            if (modeler_error.pac_error[laneno].pac_request_error == TRUE)
                lm_queue_message(ERROR_MSG, "fatal Pattern Controller request error in lane: %c",
                                 'A' + laneno);
            if (modeler_error.pac_error[laneno].pac_pattern_error == TRUE)
                lm_queue_message(ERROR_MSG, "fatal Pattern Controller pattern error in lane: %c",
                                 'A' + laneno);
            if (modeler_error.pac_error[laneno].
                                 pac_control_word_parity_error == TRUE)
```

Copyright 1989 Logic Modeling Systems

| SOURCE PROGRAM | DATE | PAGE # |
|---|---|---|
| lm1000/util.c | 5/23/89 | 35/185 |
| | TIME 6:14:53 pm | |

LINE # SOURCE TEXT

```
            lm_queue_message(ERROR_MSG, "fatal Pattern Controller CTL word parity error in lane: %c",
                             'A' + laneno);
         if (modeler_error.pac_error[laneno].
                              pac_high_word_parity_error == TRUE)
            lm_queue_message(ERROR_MSG, "fatal Pattern Controller high word parity error in lane: %c",
                             'A' + laneno);
         if (modeler_error.pac_error[laneno].
                              pac_low_word_parity_error == TRUE)
            lm_queue_message(ERROR_MSG, "fatal Pattern Controller low word parity error in lane: %c",
                             'A' + laneno);
      }
   }
}

check_pel_errors(instance)
INSTANCE_INFO  *instance;
{
   DAB_INFO         *dab_ptr;
   u_long           pel_error_list;
   u_long           mask;
   u_char           cur_pelno;
   u_char           pelno;
   u_char           magicno;
   u_char           unitno;
   u_char           magic_mask;
   u_char           found_error;
   u_char           error_on_this_instance = FALSE;

   dab_ptr = dab_list[instance->dab_info_index];

   pel_error_list = modeler_error.pel_error_list;
   modeler_error.pel_error_list = 0;
   for (pelno = 0; pelno < MAX_LANE_COUNT * MAX_SLOT_COUNT; ++pelno) {
      if (pel_error_list == 0)
         break;

      found_error = FALSE;

      mask = 1 << pelno;
      if (! (pel_error_list & mask))
         continue;

      if (system_config->lane[pelno / MAX_SLOT_COUNT]->
                        pel[pelno % MAX_SLOT_COUNT] == NULL)
         continue;

      pel_error_list ^= mask;

      /* Check PLAY error */
      if (modeler_error.pel_error[pelno].play_error == TRUE) {
         lm_queue_message(ERROR_MSG, "play error in lane: %c slot: %d",
                          'A' + pelno / MAX_SLOT_COUNT,
                          pelno % MAX_SLOT_COUNT);
         found_error = TRUE;
         modeler_error.pel_error[pelno].play_error = FALSE;
      }

      /* Check MAGIC PARITY error */
      if (modeler_error.pel_error[pelno].any_magic_parity == TRUE) {

         found_error = TRUE;
         modeler_error.pel_error[pelno].any_magic_parity = FALSE;

         for (magicno = 0; magicno < MAX_MAGIC_COUNT; ++magicno) {
            magic_mask = 1 << magicno;
            if ((modeler_error.pel_error[pelno].
                  magic_parity_out & magic_mask) != 0) {
               lm_queue_message(ERROR_MSG, "Pin Electronics Module parity error in lane: %c slot: %d channel: %d",
                                'A' + pelno / MAX_SLOT_COUNT,
                                pelno % MAX_SLOT_COUNT,
                                magicno);
               modeler_error.pel_error[pelno].magic_parity_out ^= magic_mask;
            }
         }
      }

      /* Check MAGIC SHORT error */
      if (modeler_error.pel_error[pelno].any_magic_short == TRUE) {

         /* Find the unitno of this pel */
         for (unitno = 0; unitno < dab_ptr->unit_count; ++unitno) {
            cur_pelno =
               dab_ptr->unit_location[unitno].lane_no * 8 +
                  dab_ptr->unit_location[unitno].slot_no;
            if (cur_pelno == pelno) {
               break;
            }
         }

         if (unitno == dab_ptr->unit_count) {
            mark_instance_shorted_pin(pelno);
            init_dab(pelno / MAX_SLOT_COUNT, pelno % MAX_SLOT_COUNT);
            continue;
         }

         found_error = TRUE;

         report_shorted_pin(instance);
      }

      if (found_error == TRUE) {
         error_on_this_instance = TRUE;
         init_dab(pelno / MAX_SLOT_COUNT, pelno % MAX_SLOT_COUNT);
      }
   }

   if (error_on_this_instance == TRUE)
      return(FAILURE);

   return(SUCCESS);
}

mark_instance_shorted_pin(pelno)
u_char  pelno;
{
   USER_INFO             *user;
   INSTANCE_INFO         *instance,
   DAB_INFO              *dab_ptr;
   u_short                inst_id;
   u_char                 userno;
```

Copyright 1989
Logic Modeling Systems

| SOURCE PROGRAM | DATE | PAGE # |
|---|---|---|
| lm1000/util.c | 5/23/89<br>TIME 6:14:53 pm | 36/186 |

LINE # SOURCE TEXT

```
   u_char                 unitno;
   u_char                 cur_pelno;

   for (userno = 0; userno < MAX_USER_COUNT; ++userno) {
      user = user_info_array[userno];

      if (user->active == FALSE)
         continue;

      for (inst_id = 0; inst_id < user->inst_table_size; ++inst_id) {

         instance = user->instance[inst_id];

         if (BOGUS_INSTANCE(user, instance))
            continue;

         dab_ptr = dab_list[instance->dab_info_index];

         for (unitno = 0; unitno < dab_ptr->unit_count; ++unitno) {
            cur_pelno =
               dab_ptr->unit_location[unitno].lane_no * 8 +
                  dab_ptr->unit_location[unitno].slot_no;
            if (cur_pelno == pelno) {
               /* This instance is using the pelno */
               instance->had_shorted_pin = TRUE;
               return;
            }
         }
      }
   }
}

report_shorted_pin(instance)
INSTANCE_INFO *instance;
{
   DEVICE_SPEC        *definition;
   DAB_INFO           *dab_ptr;
   u_short             magic_short;
   u_short             pin_number;
   u_short             bit_mask;
   u_char              unitno;
   u_char              pelno;
   u_char              magicno;
   u_char              bitno;
   u_char              unit_pin_number;
   u_char              direction;

   dab_ptr = dab_list[instance->dab_info_index];
   definition = instance->definition;

   for (unitno = 0; unitno < dab_ptr->unit_count; ++unitno) {
      pelno =
         dab_ptr->unit_location[unitno].lane_no * 8 +
            dab_ptr->unit_location[unitno].slot_no;

      if (modeler_error.pel_error[pelno].any_magic_short == TRUE) {
         modeler_error.pel_error[pelno].any_magic_short = FALSE;

         for (magicno = 0; magicno < MAX_MAGIC_COUNT; ++magicno) {
            magic_short = modeler_error.pel_error[pelno].magic_short[magicno];
            modeler_error.pel_error[pelno].magic_short[magicno] = 0;

            if (magic_short != 0) {
               for (bitno = 0; bitno < 16; ++bitno) {

                  if (magic_short == 0)
                     break;

                  bit_mask = 1 << bitno;

                  if (! (magic_short & bit_mask))
                     continue;

                  magic_short ^= bit_mask;

                  unit_pin_number = magicno * 16 + bitno;

                  pin_number = unitno * 80 + unit_pin_number;
                  direction = definition->pin_table[pin_number].direction;
                  if ((direction == NONE) ||
                      (direction == POWER) ||
                      (direction == GROUND) ||
                      (direction == NC))
                     lm_queue_message(ERROR_MSG, "internal error: shorted NONE/POWER/GROUND/NC pin in lane: %c slot: %d unit PN: %d",
                                      'A' + pelno / MAX_SLOT_COUNT,
                                      pelno % MAX_SLOT_COUNT,
                                      unit_pin_number);
                  else
                     lm_queue_message(ERROR_MSG, "pin: %s of instance: %s is shorted",
                                      definition->pin_table[pin_number].pin_name,
                                      instance->device_info_string);
               }
            }
         }
      }
   }
}

init_. ~ err()
{
   u_long junk;
   u_char laneno;
   u_char pelno;
   u_char magicno;

   if (read_tmg(&junk) == SUCCESS) {
      tmgptr->lane_intr_enable           = 1;
      tmgptr->tmg_intr_enable            = 1;
      tmgptr->tmg_intr_clearL            = 1;
   }

   modeler_error.pel_error_list       = 0;
   modeler_error.error                = FALSE;
   modeler_error.lane_errors          = 0;
   modeler_error.pac_lane_errors      = 0;
   modeler_error.dab_change           = FALSE;
   modeler_error.tmg_error            = FALSE;

   for (laneno = 0; laneno < MAX_LANE_COUNT; ++laneno) {
      modeler_error.pac_error[laneno].pac_refresh_error           = FALSE;
```

Copyright 1989
Logic Modeling Systems

SOURCE PROGRAM lm1000/util.c

DATE 5/23/89 TIME 6:14:53 pm PAGE # 37/187

LINE # SOURCE TEXT

```
      modeler_error.pec_error[laneno].pec_request_error          = FALSE;
      modeler_error.pec_error[laneno].pec_pattern_error          = FALSE;
      modeler_error.pec_error[laneno].pec_control_word_parity_error = FALSE;
      modeler_error.pec_error[laneno].pec_high_word_parity_error = FALSE;
      modeler_error.pec_error[laneno].pec_low_word_parity_error  = FALSE;
      modeler_error.pec_error[laneno].p--_branch_address         = 0;
      modeler_error.pec_error[laneno].pec_block_offset           = 0;
      modeler_error.pec_error[laneno].pec_parity_error_address   = 0;
   }

   for (pelno = 0; pelno < MAX_LANE_COUNT * MAX_SLOT_COUNT; ++pelno) {
      modeler_error.pel_error[pelno].dab_inserted                = FALSE;
      modeler_error.pel_error[pelno].dab_removed                 = FALSE;
      modeler_error.pel_error[pelno].play_error                  = FALSE;
      modeler_error.pel_error[pelno].any_magic_short             = FALSE;
      modeler_error.pel_error[pelno].any_magic_parity            = FALSE;
      modeler_error.pel_error[pelno].magic_parity_out            = 0;

      for (magicno = 0; magicno < 5; ++magicno) {
         modeler_error.pel_error[pelno].magic_short[magicno]     = 0;
      }
   }
}

clear_non_fatal_mod_err()
{
   u_char pelno;
   u_char magicno;

   modeler_error.pel_error_list        = 0;
   for (pelno = 0; pelno < MAX_LANE_COUNT * MAX_SLOT_COUNT; ++pelno) {
      modeler_error.pel_error[pelno].dab_inserted                = FALSE;
      modeler_error.pel_error[pelno].dab_removed                 = FALSE;
      modeler_error.pel_error[pelno].play_error                  = FALSE;
      modeler_error.pel_error[pelno].any_magic_short             = FALSE;
      modeler_error.pel_error[pelno].any_magic_parity            = FALSE;
      modeler_error.pel_error[pelno].magic_parity_out            = 0;

      for (magicno = 0; magicno < 5; ++magicno) {
         modeler_error.pel_error[pelno].magic_short[magicno]     = 0;
      }
   }
}

lm_config_error(error_type, laneno, slotno)
u_char error_type;
u_char laneno;
u_char slotno;
{
   switch (error_type) {
   case CERR_TMG_CAL:
      config_error.tmg_cal = 1;
      fatal_configuration_error_encountered = TRUE;
      break;
   case CERR_NO_TMG:
      config_error.no_tmg = 1;
      fatal_configuration_error_encountered = TRUE;
      break;
   case CERR_NO_PAM_FOR_PAC:
      config_error.no_pam_for_pac |= 1 << laneno;
      fatal_configuration_error_encountered = TRUE;
      break;
   case CERR_PAM_STRAPPED_WRONG:
      config_error.pam_strapped_wrong |=
                     1 << (laneno * MAX_PAM_COUNT + slotno);
      fatal_configuration_error_encountered = TRUE;
      break;
   case CERR_PAM_STACKED_WRONG:
      config_error.pam_stacked_wrong |=
                     1 << (laneno * MAX_PAM_COUNT + slotno);
      fatal_configuration_error_encountered = TRUE;
      break;
   case CERR_DUPLICATE_SEGMENT:
      config_error.duplicate_segment |=
                     1 << (laneno * MAX_SLOT_COUNT + slotno);
      non_fatal_configuration_error_encountered = TRUE;
      break;
   case CERR_MISSING_SEGMENT:
      config_error.missing_segment |=
                     1 << (laneno * MAX_SLOT_COUNT + slotno);
      non_fatal_configuration_error_encountered = TRUE;
      break;
   case CERR_NO_PEL_FOR_DAB:
      config_error.no_pel_for_dab |=
                     1 << (laneno * MAX_SLOT_COUNT + slotno);
      non_fatal_configuration_error_encountered = TRUE;
      break;
   case CERR_NO_PAM_FOR_DAB:
      config_error.no_pam_for_dab |=
                     1 << (laneno * MAX_SLOT_COUNT + slotno);
      non_fatal_configuration_error_encountered = TRUE;
      break;
   case CERR_ILLEGAL_DUPLICATE_DEVICE:
      config_error.illegal_duplicate_device |=
                     1 << (laneno * MAX_SLOT_COUNT + slotno);
      non_fatal_configuration_error_encountered = TRUE;
      break;
   case CERR_DEVICE_TOO_LARGE:
      config_error.device_too_large |=
                     1 << (laneno * MAX_SLOT_COUNT + slotno);
      non_fatal_configuration_error_encountered = TRUE;
      break;
   case CERR_ILLEGAL_PEL_STACKING:
      config_error.illegal_pel_stacking |=
                     1 << (laneno * MAX_SLOT_COUNT + slotno);
      non_fatal_configuration_error_encountered = TRUE;
      break;
   default:
      DPRINTF(("illegal error_type in config_error\n"));
      break;
   }
}

init_config_error()
{
   u_long error;

   config_error.do_tmg_calibration          = 0;

#ifdef MODELER
```

Copyright 1989 Logic Modeling Systems

SOURCE PROGRAM lm1000/util.c

DATE 5/23/89 TIME 6:14:53 pm PAGE # 38/188

LINE # SOURCE TEXT

```
    (void)lm_nvram_access((char *)&config_error, CONFIG_ERROR,
                          (u_long)sizeof(CONFIGURATION_ERRORS), MEMORY_READ,
                          &error);
#endif

    config_error.tmg_cal                    = 0;
    config_error.no_tmg                     = 0;
    config_error.no_pam_for_pac             = 0;
    config_error.pam_strapped_wrong         = 0;
    config_error.pam_stacked_wrong          = 0;
    config_error.duplicate_segment          = 0;
    config_error.missing_segment            = 0;
    config_error.no_pel_for_dab             = 0;
    config_error.no_pam_for_dab             = 0;
    config_error.illegal_duplicate_device   = 0;
    config_error.device_too_large           = 0;
    config_error.illegal_pel_stacking       = 0;
}

write_config_error()
{

#ifdef MODELER
    u_long   error;

    DPRINTF(("write_config_error: CONFIG_ERROR: %08x, size: %d\n",
            CONFIG_ERROR, sizeof(CONFIGURATION_ERRORS)));

    DPRINTF(("tmg_cal                    = %d\n",
            config_error.tmg_cal));
    DPRINTF(("no_tmg                     = %d\n",
            config_error.no_tmg));
    DPRINTF(("no_pam_for_pac             = %08x\n",
            config_error.no_pam_for_pac));
    DPRINTF(("pam_strapped_wrong         = %08x\n",
            config_error.pam_strapped_wrong));
    DPRINTF(("pam_stacked_wrong          = %08x\n",
            config_error.pam_stacked_wrong));
    DPRINTF(("duplicate_segment          = %08x\n",
            config_error.duplicate_segment));
    DPRINTF(("missing_segment            = %08x\n",
            config_error.missing_segment));
    DPRINTF(("no_pel_for_dab             = %08x\n",
            config_error.no_pel_for_dab));
    DPRINTF(("no_pam_for_dab             = %08x\n",
            config_error.no_pam_for_dab));
    DPRINTF(("illegal_duplicate_device   = %08x\n",
            config_error.illegal_duplicate_device));
    DPRINTF(("device_too_large           = %08x\n",
           config_error.device_too_large));
    DPRINTF(("illegal_pel_stacking       = %08x\n",
            config_error.illegal_pel_stacking));

    (void)lm_nvram_access((char *)&config_error, CONFIG_ERROR,
                          (u_long)sizeof(CONFIGURATION_ERRORS), MEMORY_WRITE,
                          &error);

#endif
}

write_user_stat(pattern_counth, pattern_countl, longest_pattern_seq,
                def_count, inst_count, fault_count)
u_long      pattern_counth;
u_long      pattern_countl;
u_long      longest_pattern_seq;
u_short     def_count;
u_short     inst_count;
u_short     fault_count;
{
#ifdef MODELER
    u_long  error;
#endif
    RUNTIME_STAT_STRUCT nvram_value;

#ifdef MODELER
    (void)lm_nvram_access((char *)&nvram_value, RUNTIME_STAT,
                          (u_long)sizeof(RUNTIME_STAT_STRUCT), MEMORY_READ,
                          &error);
#endif

    add_64(&nvram_value.pattern_count_msl,
           &nvram_value.pattern_count_lsl,
           pattern_counth, pattern_countl);

    if (nvram_value.longest_pattern_seq < longest_pattern_seq)
       nvram_value.longest_pattern_seq = longest_pattern_seq;

    nvram_value.definition_count += def_count;
    nvram_value.instance_count   += inst_count;
    nvram_value.fault_count      += fault_count;

#ifdef MODELER
    (void)lm_nvram_access((char *)&nvram_value, RUNTIME_STAT,
                          (u_long)sizeof(RUNTIME_STAT_STRUCT), MEMORY_WRITE,
                          &error);
#endif
}

add_64(op1h, op1l, op2h, op2l)
u_long   *op1h;
u_long   *op1l;
u_long   op2h;
u_long   op2l;
{
    /* 64 bit add: *op1 <-- *op1 + op2 */

    u_long th;
    u_long tl;

    th = *op1h + op2h;
    tl = *op1l + op2l;

    if (((*op1l & 0x80000000) && (op2l & 0x80000000)) ||
        (((*op1l & 0x80000000) || (op2l & 0x80000000)) && ! (tl & 0x80000000)))
       ++th;

    *op1h = th;
    *op1l = tl;
}
```

Copyright 1989
Logic Modeling Systems

SOURCE PROGRAM lm1000/util.c

DATE 5/23/89 TIME 6:14:53 pm

LINE # SOURCE TEXT

```
update_svaram_dab_insertion(loc_dab_list)
DAB_INFO   *loc_dab_list[];
{
    DAB_INFO    *dab_ptr;
#ifdef MODELER
    DAB_EEPROM   dab_eeprom;
    u_long       svaram_dab_insertion;
    u_long       error;
#endif
    u_char       dab_insertion = 0;
    u_char       dabno;
    char         segno;

    for (dabno = 0; dabno < MAX_LANE_COUNT * MAX_SLOT_COUNT; ++dabno) {
        if (loc_dab_list[dabno] == NULL)
            continue;

        dab_ptr = loc_dab_list[dabno];

        for (segno = 0; segno <= MAX_SEGMENT_PER_DEVICE; ++segno) {
            if (dab_ptr->segment[segno] == NULL)
                continue;

            if (dab_active(dab_ptr->segment[segno]->lane_no,
                           dab_ptr->segment[segno]->slot_no) == FALSE) {
                ++dab_insertion;

#ifdef MODELER
                (void)lm_write_eeprom_ins_count(
                          dab_ptr->segment[segno]->lane_no * MAX_SLOT_COUNT +
                          dab_ptr->segment[segno]->slot_no,
                          (u_short)dab_ptr->segment[segno]->insertion_count + 1);

/* ???? */
                (void)lm_read_eeprom(
                          dab_ptr->segment[segno]->lane_no * MAX_SLOT_COUNT +
                          dab_ptr->segment[segno]->slot_no,
                          &dab_eeprom);

                if (dab_eeprom.insertion_count !=
                     dab_ptr->segment[segno]->insertion_count + 1) {
                    DPRINTF(("DAB EEPROM write insertion_count failed !!!!!!!!!!\n"));
                    DPRINTF(("wrote: %d read: %d\n",
                              dab_ptr->segment[segno]->insertion_count + 1,
                              dab_eeprom.insertion_count));
                }

#endif

            }
        }
    }

#ifdef MODELER
    (void)lm_svaram_access((char *)&svaram_dab_insertion, RUNTIME_STAT,
                           (u_long)sizeof(u_long), MEMORY_READ,
                           &error);

    svaram_dab_insertion += dab_insertion;

    (void)lm_svaram_access((char *)&svaram_dab_insertion, RUNTIME_STAT,
                           (u_long)sizeof(u_long), MEMORY_WRITE,
                           &error);
#endif
}


dab_active(laneno, slotno)
u_char laneno;
u_char slotno;
{
    u_long    addr;
    u_short   value;

    addr = LANE_0_START_ADDR + laneno * LANE_ADDR_INC +
           LANE_PEL_0_START_OFFSET + slotno * LANE_PEL_ADDR_INC +
           PEL_STATUS_CONTROL_OFFSET;

    value = (u_short)read_loc_long((u_long *)addr);

    if (((value & ~PEL_CS_ACTIVE_MASK) == 0) ||
        ((value & ~PEL_CS_INITIALIZE_MASK) == 0) ||
        ((value & ~PEL_CS_RESET_MASK) == 0))
        return(FALSE);

    return(TRUE);
}

fatal_alloc_error()
{
    /* ???? */
}

add_inconsistent_pins(instance, ident_inconsistent_pins)
INSTANCE_INFO       *instance;
PTRN_BITS_LONGWORD *ident_inconsistent_pins;
{
    DAB_INFO     *dab_ptr;
    u_long       *unknown_ptr;
    u_char        total_word;
    u_char        wordno;

    dab_ptr = dab_list[instance->dab_info_index];
    total_word = dab_ptr->unit_count *
                    sizeof(PTRN_BITS_LONGWORD) / sizeof(u_long);

    unknown_ptr = (u_long *)instance->last_sample_value.unknown;
    for (wordno = 0; wordno < total_word; ++wordno) {
        unknown_ptr[wordno] |= ((u_long *)ident_inconsistent_pins)[wordno];
    }
}

epoch_info(attr, value)
u_short attr;
u_long  *value;
{

#ifdef MODELER
    u_long               error;
    RUNTIME_STAT_STRUCT  rstat;
```

Copyright 1989
Logic Modeling Systems

SOURCE PROGRAM lm1000/util.c | DATE 5/23/89 | TIME 6:14:53 pm | PAGE # 40/190

LINE # SOURCE TEXT

```
    (void)lm_svram_access((char *)&rstat, RUNTIME_STAT,
                          (u_long)sizeof(RUNTIME_STAT_STRUCT), MEMORY_READ,
                          &error);

    switch (attr) {
    case LM_EPOCH_ADAPTER_INSERTIONS:
        *value = rstat.dab_insertion_count;
        break;
    case LM_EPOCH_LONGEST_SEQUENCE:
        *value = rstat.longest_pattern_seq;
        break;
    case LM_EPOCH_PATTERNS_ADDED_HIGH:
        *value = rstat.pattern_count_msl;
        break;
    case LM_EPOCH_PATTERNS_ADDED_LOW:
        *value = rstat.pattern_count_lsl;
        break;
    case LM_EPOCH_DEFINITIONS:
        *value = rstat.definition_count;
        break;
    case LM_EPOCH_INSTANCES:
        *value = rstat.instance_count;
        break;
    case LM_EPOCH_FAULTS:
        *value = rstat.fault_count;
        break;
    default:
        return(FAILURE);
    }
#else
    switch (attr) {
    case LM_EPOCH_ADAPTER_INSERTIONS:
    case LM_EPOCH_LONGEST_SEQUENCE:
    case LM_EPOCH_PATTERNS_ADDED_HIGH:
    case LM_EPOCH_PATTERNS_ADDED_LOW:
    case LM_EPOCH_DEFINITIONS:
    case LM_EPOCH_INSTANCES:
    case LM_EPOCH_FAULTS:
        *value = 0;
        break;
    default:
        return(FAILURE);
    }
#endif
    return(SUCCESS);
}

adjust_delay(user, def_ptr)
USER_INFO       *user;
DEVICE_SPEC     *def_ptr;
{
    u_short     i;
    u_short     mtym_count;

    /* Adjust the default delay if specified, otherwise set it to 1 */
    if (def_ptr->use_default == TRUE) {
        ADJUST_DELAY(def_ptr->default_delay.minimum,
                     user->time_scale,
                     user->half_time_scale,
                     user->divide_delay);
        ADJUST_DELAY(def_ptr->default_delay.typical,
                     user->time_scale,
                     user->half_time_scale,
                     user->divide_delay);
        ADJUST_DELAY(def_ptr->default_delay.maximum,
                     user->time_scale,
                     user->half_time_scale,
                     user->divide_delay);
    }
    else {
        def_ptr->default_delay.minimum = 1;
        def_ptr->default_delay.typical = 1;
        def_ptr->default_delay.maximum = 1;
    }

    mtym_count = def_ptr->mtym_cnt;
    for (i = 0; i < mtym_count; ++i) {
        if ((long)def_ptr->mtym_table[i].minimum != -1)
            ADJUST_DELAY(def_ptr->mtym_table[i].minimum,
                         user->time_scale,
                         user->half_time_scale,
                         user->divide_delay);

        if ((long)def_ptr->mtym_table[i].typical != -1)
            ADJUST_DELAY(def_ptr->mtym_table[i].typical,
                         user->time_scale,
                         user->half_time_scale,
                         user->divide_delay);
        if ((long)def_ptr->mtym_table[i].maximum != -1)
            ADJUST_DELAY(def_ptr->mtym_table[i].maximum,
                         user->time_scale,
                         user->half_time_scale,
                         user->divide_delay);
    }
}

unadjust_delay(user, def_ptr)
USER_INFO       *user;
DEVICE_SPEC     *def_ptr;
{
    u_short     i;
    u_short     mtym_count;

    /* Unadjust the default delay if specified */
    if (def_ptr->use_default == TRUE) {
        UNADJUST_DELAY(def_ptr->default_delay.minimum,
                       user->time_scale,
                       user->half_time_scale,
                       user->divide_delay);
        UNADJUST_DELAY(def_ptr->default_delay.typical,
                       user->time_scale,
                       user->half_time_scale,
                       user->divide_delay);
        UNADJUST_DELAY(def_ptr->default_delay.maximum,
                       user->time_scale,
                       user->half_time_scale,
                       user->divide_delay);
    }
```

Copyright 1989 Logic Modeling Systems

LINE # SOURCE TEXT

```
    mtym_count = def_ptr->mtym_cnt;
    for (i = 0; i < mtym_count; ++i) {
        if ((long)def_ptr->mtym_table[i].minimum != -1)
            UNADJUST_DELAY(def_ptr->mtym_table[i].minimum,
                           user->time_scale,
                           user->half_time_scale,
                           user->divide_delay);

        if ((long)def_ptr->mtym_table[i].typical != -1)
            UNADJUST_DELAY(def_ptr->mtym_table[i].typical,
                           user->time_scale,
                           user->half_time_scale,
                           user->divide_delay);
        if ((long)def_ptr->mtym_table[i].maximum != -1)
            UNADJUST_DELAY(def_ptr->mtym_table[i].maximum,
                           user->time_scale,
                           user->half_time_scale,
                           user->divide_delay);
    }
}


set_time_scale(user, number, units)
USER_INFO  *user;
u_long      number;
long        units;
{
    double   temp;

    switch (units) {
    case LM_FEMTOSECONDS:
        temp = 1000.0;
        break;
    case LM_PICOSECONDS:
        temp = 1.0;
        break;
    case LM_NANOSECONDS:
        temp = 0.001;
        break;
    case LM_MICROSECONDS:
        temp = 0.000001;
        break;
    default:
        lm_queue_message(ERROR_MSG, "internal simulator error: illegal unit: %d for simulation tick",
                         units);
        return(FAILURE);
    }

    temp = temp / (double)number;

    if (temp > 1.0) {
        user->divide_delay = FALSE;
        user->time_scale = (u_long)temp;
    }
    else {
        user->divide_delay = TRUE;
        user->time_scale = (u_long)(1.0 / temp);
    }

    user->half_time_scale = user->time_scale / 2;

    /* Just in case */
    if (user->time_scale == 0)
        user->time_scale = 1;

    return(SUCCESS);
}

mask_off_output(instance, setup_ptrs)
INSTANCE_INFO  *instance;
PTRN_BITS      *setup_ptrs;
{
    /* Mask off the ptrs bits for outputs in the measurement pattern.
     * This has to be done because for output pins we only have the soft
     * drive 0 turned on, so we need to pull the outputs low.
     */
    EXTRA_DEVICE_SPEC   *extra_def_ptr;
    DAB_INFO            *dab_ptr;
    u_long              *setup_ptrs_ptr;
    u_long              *ident_outputs_ptr;
    u_char               total_word;
    u_char               wordno;

    extra_def_ptr = (EXTRA_DEVICE_SPEC *)instance->definition->extra_data;
    dab_ptr = dab_list[instance->dab_info_index];
    total_word = dab_ptr->unit_count *
                 sizeof(PTRN_BITS_LONGWORD) / sizeof(u_long);

    setup_ptrs_ptr = (u_long *)setup_ptrs;
    ident_outputs_ptr = (u_long *)extra_def_ptr->ident_outputs;

    for (wordno = 0; wordno < total_word; ++wordno) {
        *setup_ptrs_ptr &= ~*ident_outputs_ptr;
        ++setup_ptrs_ptr;
        ++ident_outputs_ptr;
    }
}


lm_crypt (password, crypted_string)
        char    *password;
        char    *crypted_string;

        /*  If you change this you MUST change the backdoor password  */

{       char    *temp_ptr;
        char    password_buffer[CRYPTED_PASSWORD_LENGTH];
        int     i;
        char     c;

        DPRINTF(("inside lm_crypt; password: %s\n", password));

        if (strlen(password) == 0) {
                for (i = 0; i < CRYPTED_PASSWORD_LENGTH; ++i) {
                        crypted_string[i] = '\0';
                }
                return(SUCCESS);
        }

        i = 0;
```

Copyright 1989 Logic Modeling Systems

LINE # SOURCE TEXT

```
        while (i < CRYPTED_PASSWORD_LENGTH) {
                temp_ptr = password;
                while ((c = *temp_ptr++) && (i < CRYPTED_PASSWORD_LENGTH)) {
                        password_buffer[i++] = c;
                }
        }

        for (i=0; i<CRYPTED_PASSWORD_LENGTH; i++)
                crypted_string[i] =
                        (((char) i + strlen(password) << 3) ^ (password_buffer[i] ^ (password_buffer[CRYPTED_PASSWORD_LENGTH-(i+1)] << 1)));

        return(SUCCESS);
}


check_password(user)
USER_INFO  *user;
{
    char       good_password[CRYPTED_PASSWORD_LENGTH];
    u_long     status;
    u_char     i;

    DPRINTF(("inside check_password\n"));

    if (user->good_password == TRUE) {
       DPRINTF(("user->good_password is TRUE\n"));
       return(SUCCESS);
    }

    if (proc_lm_rd(LM_NVSRAM_MEMORY, 0, PASSWORD,
                   SIZEOF_PASSWORD, good_password, &status) == FAILURE) {
       lm_queue_message(ERROR_MSG, "internal error: Failed to read password");
       DPRINTF(("error in read\n"));
       return(FAILURE);
    }

    /* Check for no password */
    for (i = 0; i < CRYPTED_PASSWORD_LENGTH; ++i) {
       if (good_password[i] != '\0')
          break;
    }
    if (i == CRYPTED_PASSWORD_LENGTH) {
       DPRINTF(("No password is set\n"));
       lm_queue_message(WARNING_MSG, "No password set on modeler");
       return(SUCCESS);
    }

    /* Check for CPU switch 3 */
    status = read_loc_long((u_long *)CPU_STATUS_REG_ADDR);
    if (status & ~CPU_DIP_SWITCH3_MASK) {
       /* dip switch 3 is up=OFF=1 */
       DPRINTF(("Password not checked due to hardware override\n"));
       lm_queue_message(WARNING_MSG, "Password not checked due to hardware override");
       return(SUCCESS);
    }

    DPRINTF(("error in check_password\n"));
    return(FAILURE);
}

write_password(crypted_password)
char *crypted_password;
{
    u_long  status;

    DPRINTF(("inside write_password\n"));
    if (proc_lm_wr(LM_NVSRAM_MEMORY, 0, PASSWORD,
                   SIZEOF_PASSWORD, crypted_password, &status) == FAILURE) {
       lm_queue_message(ERROR_MSG, "internal error: Failed to write password");
       return(FAILURE);
    }
    return(SUCCESS);
}

compare_password(crypted_password)
char *crypted_password;
{
    char       good_password[CRYPTED_PASSWORD_LENGTH];
static   char       backdoor_password[] = { 0xD5, 0xCF, 0xD0, 0xED, 0xE0, 0xFA,
                        0xE3, 0xCA, 0x15, 0x0F, 0x10, 0x2D, 0x20, 0x3A, 0x23, 0x0A };
                        /* DO NOT change this unless you change lm_crypt()  */
    u_long     status;
    u_char     i;

    DPRINTF(("inside compare_password\n"));

    if (proc_lm_rd(LM_NVSRAM_MEMORY, 0, PASSWORD,
                   SIZEOF_PASSWORD, good_password, &status) == FAILURE) {
       DPRINTF(("error in read\n"));
       lm_queue_message(ERROR_MSG, "internal error: Failed to read password");
       return(FAILURE);
    }

    DPRINTF(("crypted_password: %s backdoor_password: %s\n",
             crypted_password, backdoor_password));

    /* Check for backdoor passwords */
    if (memcmp(crypted_password
               backdoor_passwor   CRYPTED_PASSWORD_LENGTH) == 0) {
       DPRINTF(("password matches with backdoor password\n"));
       return(SUCCESS);
    }

    /* Compare the password the user entered with the one in NVSRAM */
    if (memcmp(crypted_password, good_password, CRYPTED_PASSWORD_LENGTH) != 0) {
       DPRINTF(("password don't match\n"));
       lm_queue_message(ERROR_MSG, "Invalid password entered");
       return(FAILURE);
    }

    DPRINTF(("password matches !!!!!!\n"));
    return(SUCCESS);

}
```

Copyright 1989 Logic Modeling Systems

| FILE | DATE | PAGE # |
|---|---|---|
| bsp.lm1000/bsp.assem.s | 5/23/89 | 1/1 |
| | TIME 4:41:10 pm | |

LINE # TEXT

```
| SCCS_ID: bsp.assem.s rev 3.1, 4/24/89 at 07:54:47
|
|---- File Defines ------------------------------------------
|

||||||||||||||||||||||||||||||||||||||||||||||||||||||||||||||
||
||                 DEFINITIONS SPECIFIC FOR THE CPU BOARD
||
||||||||||||||||||||||||||||||||||||||||||||||||||||||||||||||
        DISINT = 0x3700
        ENAINT = 0x3000
        RTSCOPE = 0x01
        VRTX = 0x00
        IVT_BASE = 0x00000
        DUART_SR = 0x10c20014
        STATUS_REG_A = 0x10c20004
        STATUS_REG_B = 0x10c20024
        DUART_RX_TX_REG_A = 0x10c2000c
        DUART_RX_TX_REG_B = 0x10c2002c
        CHAR_TX_A = 24
        CHAR_RX_A = 25
        CHAR_TX_B = 28
        CHAR_RX_B = 29
        CPU_INTR_REG    = 0x10c60002
        CPU_MISC_CONTROL = 0x10c60003
        FALSE = 0
        TEST_LED = 0x40
        TIMER_CONTROL = 0x10c3000c
        TIMER2_COUNT  = 0x10c30008
        READ_COUNTER2 = 0xd8000000
        TIMER2_TOTAL  = 0x013E
        TIMER2_LOW_COUNT = 0x40000000
        TIMER2_HIGH_COUNT = 0x01000000
        ENABLE_LANCE = 0x08
        CPU_FUNC_REG = 0x10c60001


||||||||||||||||||||||||||||||||||||||||||||||||||||||||||||||
||
||                 VRTX and RTSCOPE function codes
||
||||||||||||||||||||||||||||||||||||||||||||||||||||||||||||||
        TR_ENTER = 0x0102
        TR_EXIT = 0x0103
        TR_RXCHR = 0x0104
        TR_TXRDY = 0x0105
        UI_TXRDY = 0x0014
        UI_RXCHR = 0x0013
        UI_ENTER = 0x0016
        UI_EXIT = 0x0011
        UI_TIMER = 0x0012
        VRTX_INIT = 0x0030
        TR_INIT = 0x0100
        TR_GO = 0x0101
        SC_GO = 0x31
        SC_SPOST = 0x2e
        SC_TCREATE = 0x00

||||||||||||||||||||||||||||||||||||||||||||||||||||||||||||||
||
||                 MAIN TASK DEFINITIONS
||
||||||||||||||||||||||||||||||||||||||||||||||||||||||||||||||
        MAIN_TMODE = 0               | User mode
        MAIN_TID = 0                 | Task ID number 0
        MAIN_TPRI = 0                | Task priority 0
|
|---- End Defines -----------
|
        XOFF = 0x13
        XON = 0x11
        .data
        .globl _Uart_mask, _lm_tick, _Got_a_char, _debug_key, _debug_char
        .globl _save_pc
        .globl _bus_error_address | Bus error reporting routine
        _save_pc: .long 0
        _debug_key: ..long 0     | got a key for debugging.
        _debug_char: .long 0
        _Got_a_char: .long 0     | Tell housekeeping of chars.
                                 | so it can print a message.

        _bus_error_address: .long 0
        _Uart_mask: .long 0      | this is the DUART INTERRUPT MASK
        _lm_tick: .long 0
        Housekeeping: .word 0    | Timer variable for the housekeeping task
        .even
        _XOFF: .byte 0           | Keep track of XON/XOFF

|||||||||||||||||||||||||||||||||||||||||||||||||||||||||||||||||||
|
|    ENTRY POINT.  When in EPROM, the following two longs are fetched
|                  by the processor during a restart.
|
|-------------------------------------------------------------------
|
|       .long    0x3FFFF0              | Initial Stack Pointer
|       .long    bsp_start             | Initial Program Counter
|
|
|---- Start of init code
|
        .text
        .globl  bsp_start
bsp_start:

        movw    #DISINT,sr             | Set Interrupt Level
        movl    #0x3FFFF0,sp            | Load Stack Pointer (for soft boot)
        reset
        movl    #IVT_BASE,d0
        movc    d0,vbr                 | Set Vector Base Regisetar up
        movl    #9,d0
        movc    d0,cacr                | Clear and enable instruction cache

        jsr     _init_sys              | Exit to C code, never to return
|
|-------------------------------------------------------------------
|

|||||||||||||||||||||||||||||||||||||||||||||||||||||||||||||||||||
```

Copyright 1989 Logic Modeling Systems

FILE bsp.lm1000/bsp.assem.s | DATE 5/23/89 | TIME 4:41:10 pm | PAGE # 2/2

LINE # TEXT

```
|   Utility Routines called by the C Init code.
|
|-----------------------------------------------------------

|
|----  Vrtx Init Interface
|
        .globl  _vtx_init
_vtx_init:

        movl    #VRTX_INIT,d0           | Load Vrtx Init Function code
        trap    #VRTX                   | Trap to Vrtx
        rts                             | Return Error to C in D0
|--------------------------------------------

|
|----  Rtscope Init Interface
|
        .globl  _rts_init
_rts_init:
        link    a6,#0                   | frame pointer
        movl    a0,sp@-                 | save A0 on the stack
        movl    a6@(8),a0               | RTscope conf. table addr
        movl    #TR_INIT,d0             | DBINIT
        trap    #RTSCOPE                | call RTscope
        movl    sp@+,a0                 | restore A0
        unlk    a6                      | restore A6
        rts
|--------------------------------------------

|
|---- Rtscope Go Interface
|
        .globl  _rts_go
_rts_go:
        cmpl    #0,_RTscope_present     | Is rtscope present
        jeq     no_rtscope_1
        movl    #TR_GO,d0               | DBGO
        trap    #RTSCOPE                | call RTscope
no_rtscope_1:
        movl    #_main,a0               | New task address
        movl    #MAIN_TMODE,d1          | Task mode
        movb    #MAIN_TID,d2            | Task ID number
        movb    #MAIN_TPRI,d1           | Task priority
        movl    #SC_TCREATE,d0          | System call code
        trap    #VRTX                   | Call VRTX
|
|---- Issue VRTX GO system call
|
        movl    #SC_GO,d0               | SC_GO
        trap    #VRTX                   | Shouldn't come back
        rts
|--------------------------------------------
_bad_start:
        jmp     _bad_start


||||||||||||||||||||||||||||||||||||||||||||||||||||||||||||||||||
|
|   Interrupt Service Routines
|
|------------------------------------------------------------ ---
|
|---   Clock Board Error ISR  ---------------------------------
|
        .globl  _error_isr, _parity_isr
_error_isr:
        movl    d0,sp@-
        moveml  #0x7ffe,sp@-                    | dont save a7 & d0 save d1-d7,a0-a6
        jsr     _mod_error_isr                  | This is our C interrupt routine
        moveml  sp@+,#0x7ffe                    | restore above regs.
|
|----  Perform UI_EXIT from ISR through Vrtx
|
        movl    #UI_EXIT,d0
        trap    #VRTX
|
|---- Parity ISR
|
_parity_isr:
        movl    d0,sp@-
        moveml  #0x7ffe,sp@-                    | dont save a7 & d0 save d1-d7,a0-a6
        jsr     _parity_error                   | This is our C interrupt routine
        moveml  sp@+,#0x7ffe                    | restore above regs.
|
|----  Perform UI_EXIT from ISR through Vrtx
|
        movl    #UI_EXIT,d0
        trap    #VRTX
|
|---   Ethernet ISR  -----------------------------------------
|
        .globl  _ether_isr
_ether_isr:
        movl    d0,sp@-
        moveml  #0x7ffe,sp(                     | dont save a7 & d0 save d1-d7,a0-a6
        movl    #0,_system_call                 | check if  a system call is made?
        jsr     _lance_isr                      | This is our C interrupt routine
        movl    _system_call, d0                        | let us check bit 0
        moveml  sp@+,#0x7ffe                    | restore above regs.
        btst    #0,d0                           | should we exit thru VRTX
        beq     no_sys_calls                    | go to no system calls, if no VRTX
                                                | calls were made.
|
|----  Perform UI_EXIT from ISR through Vrtx
|
        movl    #UI_EXIT,d0
        trap    #VRTX
|
|----  NO SYSTEM CALLS WERE MADE ------------------
|
no_sys_calls:
        movl    sp@+,d0
        rte
|
|-----         DUART ISR                          ----------------------
|----  Channel A Serial Port - RX buffer full    ----------------------
|
        .globl  _serial_isr
```

Copyright 1989 Logic Modeling Systems

FILE bsp.lm1000/bsp.assem.s

DATE 5/23/89 TIME 4:41:10 pm PAGE # 3/3

```
_serial_isr:
        movl    d0,sp@-
        movl    d1,sp@-
        movl    a0,sp@-
        movl    #DUART_SR,a0                    | get status
        movl    a0@,d1                          | load into reg
        andl    _Uart_mask,d1                   | only look @ interrupts we are interested in
        andl    #0x03000000,d1                  | see if VRTX interrupt
        jeq     rtscope_serial_isr              | no? go to RTscope
        movl    a0@,d1                          | load into reg
        btst    #CHAR_RX_A,d1                   | check for CHAR_RX_A
        beq     not_rx_a                        | nothing rcvd on channel a
        movl    #STATUS_REG_A,a0                | get the status
        movl    a0@,d0                          | status is in 24-31
        movl    #DUART_RX_TX_REG_A,a0           | get the byte
        movl    a0@,d1                          | byte is in 24-31
andl    #0xe0000000,d0                  | see if error to rcv , break or framing
jne     not_rx_a                        | false alarm   , there was an error
        moveq   #24,d0                          | shift 24 bits
        asrl    d0,d1                           | d1 bits 0-7 = data

-.      cmpl    #XOFF,d1                        | Flow control check for XON & XOFF
        jne     not_xoff
        movb    1,_XOFF
        jsr     txa_exit
        bra     not_tx_a
not_xoff:
        cmpl    #XON,d1
        jne     not_xon
        movb    0,_XOFF
        bra     not_rx_a
not_xon:
        movl    #1,_Got_a_char                  | we got a char tell em' we are busy
        movl    #1,_debug_key                   | got a key for debugging.
        movl    d1,_debug_char
        andl    #0xff,_debug_char
        movl    #UI_RXCHR,d0
        trap    #VRTX
not_rx_a:
        movl    #DUART_SR,a0                    | get status
        movl    a0@,d1                          | load into reg
        btst    #CHAR_TX_A,d1                   | check for CHAR_TX_A
        beq     not_tx_a                        | nothing to tx on channel a
        jsr     _txa_isr                        | go and transmit
not_tx_a:
        movl    sp@+,a0                         | restore address register
        movl    sp@+,d1
        movl    #UI_EXIT,d0
        trap    #VRTX

|------ END rxa_isr -------------------------------------------------------

|
|---- Channel A Serial Port - TX buffer empty ----------------------
|
        .globl _txa_isr, _Vrtx_txa
_txa_isr:
        cmpb    #0x1,_XOFF                      | Check flow control is not on
        jne     no_flow_cntl
        bra     txa_exit
no_flow_cntl:

        movl    #UI_TXRDY,d0
        trap    #VRTX
        cmpl    #0,d0
        bnes    txa_exit
|
| ----- This is the VRTX TX routine --------------------------------------
| ----- d1 = data to TX             --------------------------------------
| ----- save A0 & D0                --------------------------------------
| ----- This is the hook for VRTX to resume or start transmiting chars --
|
_Vrtx_txa:
        movl    d0,sp@-
        movl    a0,sp@-
        movl    #DUART_RX_TX_REG_A,a0           | get address of register
        moveq   #24,d0                          | shift 24 bits to get byte in upper bits
        asll    d0,d1                           | d1 bits 00-07 = data
        movl    d1,a0@                          | byte is in 24-31 after shift
        movl    #DUART_SR,a0                    | get status reg contents
        movl    _Uart_mask,d1                   | this is a write only reg. so read from memory
        orl     #0x03000000,d1                  | d1 = 03 enable tx ints
        movl    d1,_Uart_mask                   | save in memory
        movl    d1,a0@                          | load into reg
        movl    sp@+,a0                         | restore registers
        movl    sp@+,d0
        rts
txa_exit:
        movl    #DUART_SR,a0                    | get status reg contents
        movl    _Uart_mask,d1                   | this is a write only reg. so read from memory
        andl    #0xfe000000,d1                  | d1 =  disable tx ints
        movl    d1,_Uart_mask                   | save in memory
        movl    d1,a0@                          | load into reg
        rts
|------ END txa_isr -------------------------------------------------------
|
|------ RTsco.. rial int. on chan B --------------------------------------

rtscope_serial_isr:
        movl    a0@,d1                          | load into reg
        btst    #CHAR_RX_B,d1                   | check for CHAR_RX_B
        beq     not_rx_b                        | nothing rcvd on channel b
        movl    #DUART_RX_TX_REG_B,a0           | get the byte
        movl    a0@,d1                          | byte is in 24-31

        cmpl    #0,_RTscope_present             | Is rtscope present
        jeq     not_rx_b

        moveq   #24,d0                          | shift 24 bits
        asrl    d0,d1                           | d1 bits 0-7 = data
        cmpl    #29,d1                          | check for ^]
        jne     not_cache_disable               | cache disable
        movl    #8,d0
        movc    d0,cacr                         | Clear and disable instruction cache
        jmp     not_rx_b
not_cache_disable:
        movl    #TR_RXCHR,d0
        trap    #RTSCOPE
not_rx_b:
        movl    #DUART_SR,a0                    | get status
```

Copyright 1989 Logic Modeling Systems

| FILE | DATE | PAGE # |
|---|---|---|
| bsp.lm1000/bsp.assem.s | 5/23/89 | 4/4 |
| | TIME 4:41:10 pm | |

LINE # TEXT

```
        movl    a0@,d1                          | load into reg
        btst    #CHAR_TX_B,d1                   | check for CHAR_TX_B
        beq     not_tx_b                        | nothing can be transmitted on channel b
        jsr     _txb_isr                        | go and transmit
not_tx_b:
        movl    sp@+,a0                         | restore address register
        movl    sp@+,d1

        cmpl    #0,_RTscope_present             | Is rtscope present
        jeq     no_rtscope_2
        movl    #TX_EXIT,d0
        trap    #RTSCOPE
no_rtscope_2:
        movl    #UI_EXIT,d0
        trap    #VRTX

|------ END txb_isr ------------------------------------------------


|---- Channel B Serial Port - TX buffer empty --------------------

        .globl _txb_isr, _Vrtx_txb
_txb_isr:

        cmpl    #0,_RTscope_present     | Is rtscope present
        jeq     txb_exit
        movl    #TX_TXRDY,d0
        trap    #RTSCOPE
        cmpl    #0,d0
        bnes    txb_exit

 ------ This is the RTSCOPE TX routine ------------------------------
 ------ d1 = data to TX                ------------------------------
 ------ save A0 & D0                   ------------------------------
 ------ This is the hook for RTSCOPE to resume or start transmiting chars --

_Vrtx_txb:
        movl    d0,sp@-
        movl    a0,sp@-
        movl    #DUART_RX_TX_REG_B,a0           | get address of register
        moveq   #24,d0                          | shift 24-bits to get byte in upper bits
        asll    d0,d1                           | d1 bits 00-07 = data
        movl    d1,a0@                          | byte is in 24-31 after shift
        movl    #DUART_SR,a0                    | get status reg contents
        movl    _Uart_mask,d1                   | this is a write only reg. so read from memory
        orl     #0x10000000,d1                  | d1 = 01 enable tx ints
        movl    d1,_Uart_mask                   | save in memory
        movl    d1,a0@                          | load into reg
        movl    sp@+,a0                         | restore registers
        movl    sp@+,d0
        rts
txb_exit:
        movl    #DUART_SR,a0                    | get status reg contents
        movl    _Uart_mask,d1                   | this is a write only reg. so read from memory
        andl    #0xef000000,d1                  | d1 =  disable tx ints
        movl    d1,_Uart_mask                   | save in memory
        movl    d1,a0@                          | load into reg
        rts
|------ END txb_isr ------------------------------------------------

.globl _rtscope_in_poll, _rtscope_out_poll
_rtscope_in_poll:
        movl    a0,sp@-
        movl    d1,sp@-
        movl    #0xffffffff,d0                  | status
        cmpl    #500,_auto_start
        blt     inc_not_rx_b_poll
        cmpl    #500,_auto_start
        bne     not_time_for_G
        movl    #0x67,d0
        bra     inc_not_rx_b_poll
not_time_for_G:
        cmpl    #501,_auto_start
        bne     not_time_for_O
        movl    #0x6f,d0
        bra     inc_not_rx_b_poll
not_time_for_O:
        cmpl    #502,_auto_start
        bne     not_time_for_0xD
        movl    #0xd,d0
        bra     inc_not_rx_b_poll
not_time_for_0xD:
        movl    #DUART_SR,a0                    | get status reg contents
        movl    a0@,d1                          | load into reg
        btst    #CHAR_RX_B,d1                   | check for CHAR_RX_B
        beq     not_rx_b_poll                   | nothing rcvd on channel b
        movl    #DUART_RX_TX_REG_B,a0           | get the byte
        movl    a0@,d0                          | byte is in 24-31
        moveq   #24,d1                          | shift 24 bits
        asrl    d1,d0                           | d1 bits 0-7 = data

       |cmpl    #29,d0                          | check for ^]
       |jne     not_poll_cache_disable          | cache disable
       |movl    #8,d0
       |movc    d0,cacr                         | Clear and disable instruction cache
       |jmp     not_rx_b
not_po.  .che_disable:

not_rx_b_poll:
        movl    sp@+,d1
        movl    sp@+,a0                         | restore registers
        rts
inc_not_rx_b_poll:
        addql   #1,_auto_start
        movl    sp@+,d1
        movl    sp@+,a0                         | restore registers
        rts



_rtscope_out_poll:
        movb    sp@(7),d0
        movl    d1,sp@-
        movl    a0,sp@-
        movl    #DUART_SR,a0                    | get status
        movl    a0@,d1                          | load into reg
        btst    #CHAR_TX_B,d1                   | check for CHAR_TX_B
        beq     not_tx_b_poll                   | nothing can be transmitted on channel b
        movl    #DUART_RX_TX_REG_B,a0           | get address of register
        moveq   #24,d1                          | shift 24 bits to get byte in upper bits
```

Copyright 1989 Logic Modeling Systems

FILE bsp.lm1000/bsp.assem.s

DATE 5/23/89 TIME 4:41:10 pm

LINE # TEXT

```
        asll    d1,d0                          d0 bits 00-07 = data
        movl    d0,a0@                         byte is in 24-31 after shift
        movl    #DUART_SR,a0                   get status reg contents
        movl    _Uart_mask,d1                  this is a write only reg. so read from memory
        orl     #0x10000000,d1                 d1 = 01 enable tx ints
        movl    d1,_Uart_mask                  save in memory
        movl    d1,a0@                         load into reg
        movl    #0,d0                         successfully tx
        movl    sp@+,a0                       | restore registers
        movl    sp@+,d1
        rts
not_tx_b_poll:
        movl    #0xffffffff, d0               | no tx took place
        movl    sp@+,a0                       | restore registers
        movl    sp@+,d1
        rts
|
| ----- This is the BUS ERROR TX routine ----------------------------------
| ----- d1 = data to TX                 ---------------------------------
| ----- save A0 & D0                    ---------------------------------
|
.globl _Bus_error_txa
_Bus_error_txa:
        link    a6,#0
        movl    d1,sp@-
        movl    d0,sp@-
        movl    a0,sp@-
not_ready_tx_a:
        movl    #DUART_SR,a0                  | get status
        movl    a0@,d1                        | load into reg
        btst    #CHAR_TX_A,d1                 | check for CHAR_TX_A
        beq     not_ready_tx_a                | nothing to tx on channel a
        movl    a6@(8),d1                     | data to tx
        movl    #DUART_RX_TX_REG_A,a0         | get address of register
        moveq   #24,d0                        | shift 24 bits to get byte in upper bits
        asll    d0,d1                         | d1 bits 00-07 = data
        movl    d1,a0@                        | byte is in 24-31 after shift
        movl    sp@+,a0                       | restore registers
        movl    sp@+,d0
        movl    sp@+,d1
        unlk    a6
        rts
|----  Counter/Timer Interrupt -------------------------------------------
|
        .globl  _ct_iar
_ct_iar:

        |
        | This interrupt occurs every 5 ms
        | we are using mode 0.
        |
        movl    sp@(2), _save_pc
        movl    d0,sp@-
        moveml  #0x7ffe,sp@-          | dont save a7 & d0 save d1-d7,a0-a6

        |
        | -- disable interrupts
        |
        movl #CPU_INTR_REG,a0
        movb a0@,d2
        andb #0x7f,a0@

        |
        | -- reload tick value
        |
        movl    #TIMER_CONTROL,a0
        movl    #READ_COUNTER2,a0@
        movl    #TIMER2_COUNT,a0
        movl    a0@,d1
        movl    #24,d0
        asrl    d0,d1                         | d1 bits 0-7 = low order data
        andl    #0xff,d1
        movl    a0@,d0
        asrl    #8,d0
        asrl    #8,d0                         | d0 bits 8-f = high order data
        andl    #0xff00,d0
        addl    d1,d0
        andl    #0x0000ffff, d0               | mask off count
        addw    #TIMER2_TOTAL, d0
        asll    #8,d0
        asll    #8,d0
        movl    d0, d1
        asll    #8,d0
        movl    d0,a0@
        movl    d1,a0@
        |movl   #TIMER2_LOW_COUNT,a0@
                                      | of ticks since beginning of time
        |movl   #TIMER2_HIGH_COUNT,a0@
        |
        | -- Enable interrupts
        |
        movl #CPU_INTR_REG,a0
        btst #7,d2
        beq  ints_disabled
        orb #0x80,a0@
ints_disabled:
        |jsr     _profile_incr_count
        addql   #1,_lm_tick           | This statement saves us a VRTX system call to determine no.
        addqw   #1,Housekeeping       | is it 1 second yet
        cmpw    #200,Housekeeping     | no. of ticks before we run housekeeping
        jne     no_housekeeping
        clrw    Housekeeping          | reset counter
        movl    #SC_SPOST, d0         | post to semaphor
        movl    _timer_semaphor, d1   | semaphor ID number
        trap    #VRTX
        cmpb    #FALSE, _lm_hardware_init_done   | are we initializing
        jne     no_housekeeping
        eorb    #TEST_LED,CPU_MISC_CONTROL | should blink LED
no_housekeeping:
|
|-----  Make UI_TIMER Call to Vrtx
|

        |
        |- inform VRTX of tick
        |
        movl    #UI_TIMER,d0
        trap    #VRTX

        moveml  sp@+,#0x7ffe                  | restore above regs.
```

Copyright 1989 Logic Modeling Systems

LINE # TEXT

```
|
|----   Perform UI_EXIT from ISR through Vrtx
|
        movl    #UI_EXIT,d0
        trap    #VRTX

|------  END ct_isr  --------------------------------------------------

|
|------ BUS ERROR HANDLER --------------------------------------------
|
        .globl  _bus_isr
_bus_isr:
        movl    sp,_bus_error_address

        moveml  #0xfffe,sp@-                    | dont save a7 save d1-d7,a0-a6
        jsr     _bus_error
        moveml  sp@+,#0x7fff                    | restore above regs.
        rts
||||||||||||||||||||||||||||||||||||||||||||||||||||||||||||||||||
||
||---- TRAP ROUTINES for RTscope and VRTX
||
||||||||||||||||||||||||||||||||||||||||||||||||||||||||||||||||||

        .globl  _trp_vrtx
_trp_vrtx:

        trap    #VRTX
        rts

        .globl  _trp_rtscope
_trp_rtscope:

        trap    #RTSCOPE
        rts


||||||||||||||||||||||||||||||||||||||||||||||||||||||||||||||||||
||
||---- RESET_BRD
||              cause a board reset.
||
||
||||||||||||||||||||||||||||||||||||||||||||||||||||||||||||||||||

        .globl  _reset_brd
_reset_brd:
        reset
        jsr     bsp_start
|
|       board reset occurs here
|
        rts


        .globl _do_nothing
_do_nothing:
        rts

|
| ------ Create a supervisory task ---------------
| err = sc_tcreate_supv_set_b?ot( task_address, SUPV\USER task , task_id, task priority)
| if( err != 0 ) FAILURE,
|
        .globl  _sc_tcreate_s:pv_set_boot
_sc_tcreate_supv_set_boot:
        link    a6,#0
        movl    a0,sp@-
        movl    d1,sp@-
        movl    d2,sp@-
        movl    d3,sp@-
        movl    #0,d2
        movl    #0,d1
        movl    a6@(8),a0               | task address
        movl    a6@(0x0c),d3            | task mode
        movl    a6@(0x10),d2            | task id
        movl    a6@(0x14),d1            |task priority
        movl    #SC_TCREATE,d0          | System call code
        trap    #VRTX                   | Call VRTX
        movl    sp@+,d3
        movl    sp@+,d2
        movl    sp@+,d1
        movl    sp@+,a0
        unlk    a6
        rts

        .globl _disable_cache
_disable_cache:
        movl    #8,d0
        movc    d0,cacr                         | Clear and disable instruction cache
        rts
```

Copyright 1989 Logic Modeling Systems

| SOURCE PROGRAM | DATE | PAGE # |
|---|---|---|
| bsp.lm1000/bsp.c | 5/23/89 | 1/7 |
| | TIME 4:41:11 pm | |

SOURCE TEXT

```
/* SCCS_ID: bsp.c rev 3.1, 4/24/89 at 07:54:50 */

/*
** This is part of the board support package
**
** Make sure that both bsp.lm1000/bsp.c and bsp.diags/bsp.c
** are exactly the same.
*/
#include        "common.h"
#include        "task.h"
#include        "duart.h"
#include        "lm_rd_wr.h"
#include        "lmsbsp.h"
#include        "cpu.h"
#include        "cpu_vec.h"
#include        "mod_err.h"
#include        "nvaram.h"
#include        "id.h"
/*--------------- External routine definitions -------------------*/
extern          bus_iar();
extern          serial_iar();
extern          parity_iar();
extern          ct_iar();
extern          void reset_cpu();
extern          ether_iar();
extern          error_iar();
extern          Vrtx_txa();
extern          Vrtx_txb();
extern          rtscope_in_poll();
extern          rtscope_out_poll();
extern          void id_load();
extern          trp_vrtx();
extern          trp_rtscope();
extern          u_short lm_nvaram_access();
extern          u_long network_timeout;
extern          reset_bsd();
extern          end;
#define MSECONDS_PER_SECOND 1000
/*--------------- The Globals ----------------------------------------*/
/*****************************************************************/
/*                       init_sys                                */
/* Initialize VRTX, and RTscope                                  */
/* Activate RTscope and VRTX.                                    */
/* STEPS                                                         */
/* 1.Setup interrupt vector table                                */
/* 2.Create VRTX conf table                                      */
/* 3.Create RTSCOPE conf table                                   */
/* 4.Create component table                                      */
/* 5.Initialize VRTX                                             */
/* 6.Initialize TSCOPE                                           */
/*07.Setup 8254 Timers                                           */
/*08.Initialize DUART chan A                                     */
/*09.Enable CPU regs.                                            */
/*10.Partitions, create & malloc                                 */
/*11.RTSCOPE go command                                          */
/*****************************************************************/
unsigned long xtaskws = 0;
u_long  RTscope_present = 0;
u_long  total_malloc_size = 0;
u_long available_malloc_size;
ID_PROM_CPU id_prom;
/*
** initialize routine
*/
init_sys()
{
long    err = 0;
char baud;
u_short short_network_timeout;
cpu_control_reg_struct  *p_cpu_cntl_reg = (cpu_control_reg_struct *) CPU_CONTROL_REG;

    RTscope_present = *(u_long *) (RTS_BASE);
    /*
    ** set modeler state to booted
    */
    modeler_state = BOOTED;
    /*
    ** Turn off load led
    */
    p_cpu_cntl_reg->not_load_led = not_LED_OFF;
    /*
    **  shutdown and reset lance.
    p_cpu_cntl_reg->not_lance_reset = 1;
    */
    shutdown_and_reset_lance();

    /*
    ** calculate total partition size
    */
    total_malloc_size = (u_long)CPU_RAM_SIZE - (u_long)(&end);
    available_malloc_size = total_malloc_size;

    setup_ivt();                /* Setup the interrupt table        */
    init_vcftble();             /* Create VRTX conf. table          */
    init_rtsftble();            /* Create RTscope conf. table       */
    init_cvt();                 /* Create component table           */
    err = vtx_init();           /* Init VRTX                        */
    if( err )
    {                           /* error,         wait in loop      */
        for( ;; )
                reset_cpu(SUICIDE);
    }
                                /* Init RTscope                     */
    if( RTscope_present )
    {
            err = rts_init( &(cftbls->r_cnft) );
            if( err )
            {                           /* error, wait in loop        */
                for( ;; )
                        reset_cpu(SUICIDE);
            }
    }

    /*
    ** Initialize board devices
    */
    init_all_timer();           /* initialize all 3 timers          */
    /*
    ** validate NVaram, setup baud rate, it should be valid
    */
```

Copyright 1989 Logic Modeling Systems

| SOURCE PROGRAM | DATE | PAGE # |
|---|---|---|
| bsp.lm1000/bsp.c | 5/23/89 | 2/8 |
| | TIME 4:41:11 pm | |

SOURCE TEXT

```
	(void)lm_nvram_access((char *)0, (u_long)0, (u_long)0, MEMORY_VALIDATE,(u_long *) &err);
	/*
	** set Modeler state to booted
	*/
	(void)lm_nvram_access(&modeler_state, MODELER_STATE, SIZEOF_MODELER_STATE, MEMORY_WRITE,(u_long *) &err);
	Uarta_imr();
	Uartb_imr();
	/*
	** set network timeout
	*/
	if(lm_nvram_access(&short_network_timeout, NETWORK_TIMEOUT, SIZEOF_NETWORK_TIMEOUT, MEMORY_READ, (u_long *)&err)==FAILURE)
	{
		sys_out("Unable to read network timeout\n");
	}
	/*
	** Turn seconds to milliseconds
	*/
	network_timeout = short_network_timeout;
	network_timeout *= MSECONDS_PER_SECOND;
	/*
	** read Id prom
	*/
	id_load((u_char *)CPU_ID_PROM, (u_char *)(&id_prom)); /* fetch id prom */
	enable_cpu_reg();		/* enable CPU regs		*/
	rts_go();			/* Execute RTscope GO command	*/

	/*
	** SHOULD NOT COME BACK, if it does ????????????
	** do nothing.
	*/
	for( ;; )
		reset_cpu(SUICIDE);

} /* end init_sys */


/********************************************************/
/*			init_vcftble				*/
/* Create VRTX configuration table			*/
/********************************************************/

init_vcftble()
{

VRTX_CNFTBL	*ct = (VRTX_CNFTBL *)&(cftble->v_cnft);

	ct->v_wkspc = VRTX_WRK_SPACE;		/* VRTX workspace address	*/
	ct->v_wk_size = VRTX_WK_SIZE;		/* VRTX workspace size		*/
	ct->sys_stk_size = SYS_STK;		/* System stack size		*/
	ct->isr_stk_size = ISR_STK;		/* Interrupt stack size		*/
	ct->cb_count = CB_COUNT;		/* Number of VRTX CB		*/
	ct->res1 = 0;				/* Reserved			*/
	ct->res2 = 0;;				/* Reserved			*/
	ct->c_dis_lev = VC_DIS_LEVEL;		/* Component disable level	*/
	ct->usr_stk_size = USR_STK;		/* User stack size		*/
	ct->res3 = 0;;				/* Reserved			*/
	ct->usr_tsk_count = TASK_COUNT;		/* Number of tasks		*/
	ct->res4 = 0;;				/* Reserved			*/
	ct->tx_rdy = (long) Vrtx_txa;		/* Transmit ready interrupt	*/
	ct->tcreate = 0;			/* User supplied tcreate	*/
	ct->tdelete = 0;			/* User supplied tdelete	*/
	ct->tswitch = 0;			/* User supplied tswitch	*/
	if( RTscope_present )
		ct->cvt_add = (CVT_TBL *)&(cftble->cvt);	/* Component conf. table add*/
	else
		ct->cvt_add = (CVT_TBL *) 0;		/* Component conf. table add*/

} /* end init_vcftble */


/********************************************************/
/*			init_rtsftble				*/
/* Create RTscope configuration table			*/
/********************************************************/

init_rtsftble()
{

RTCT_CNFTBL	*ct = (RTCT_CNFTBL *)&(cftble->r_cnft);
RTIO_CNFTBL	*ioct = (RTIO_CNFTBL *)&(cftble->rio_cnft);
short		i;

			/* RTscope configuration table */
	ct->db_vrtx_c = VRTX_BASE;		/* VRTX entry point		*/
	ct->db_rt_w = RTS_WRK_SPACE;		/* RTscope workspace addr	*/
	ct->db_wk_size = RTS_WK_SIZE;		/* RTscope workspace size	*/
	ct->db_illegal = 0x4AFC;		/* Illegal instruction, 68020	*/
	ct->db_trap_t = 0;			/* User supplied routine	*/
	ct->db_comp_dis = RC_DIS_LEVEL;		/* Component disable level	*/
	ct->db_priority = RT_SCP_PRI;		/* RTscope task priority	*/
	ct->db_tid = RT_SCP_TID;		/* RTscope task ID number	*/
	ct->db_utrap = (long)trp_vrtx;		/* User supplied routine TRAP	*/
	ct->db_io_config = ioct;		/* IO conf table address	*/
	for( i = 0; i < 4; i++ )		/* Reserved			*/
		ct->res1[ i ] = 0;
	ct->db_vrtx_d = VRTX_WRK_SPACE;		/* VRTX workspace address	*/
	ct->db_trp_vrtx = TRP_VRTX;		/* VRTX    ? vector number	*/
	for( i = 0; i < 3; i++ )		/* Reserved			*/
		ct->res2[ i ] = 0;

			/* RTscope IO configuration table */
	ioct->db_qid = 1;			/* Queue ID number		*/
	ioct->db_qsize = 80;			/* Queue size			*/
	ioct->db_inpt_ll = 80;			/* Input line length		*/
	ioct->db_hstack = 10;			/* History lines		*/
	ioct->db_alias = 20;			/* Number of alias		*/
	ioct->db_sym_tab = 20;			/* Number of symbols		*/
	ioct->db_num_chnl = 2;			/* Number of ports		*/
	ioct->db_toggle = 0x1B;			/* Toggle character		*/
	ioct->db_xon = 0x11;			/* Xon				*/
	ioct->db_xoff = 0x13;			/* Xoff				*/
	ioct->db_exit = 0x01;			/* Host exit character		*/
	ioct->db_txrdy = (long)Vrtx_txb;	/* Hyperlink TXRDY driver addr*/
	ioct->db_in_filter = 0;			/* Input filter			*/
	ioct->db_out_filter = 0;		/* Output filter		*/
	ioct->db_pputc1 = (long)rtscope_out_poll,	/* Hyperlink input poll	*/
	ioct->db_pgetc1 = (long)rtscope_in_poll;	/* Hyperlink output poll	*/
	ioct->db_pputc2 = 0;			/* Host input poll		*/
	ioct->db_pgetc2 = 0;			/* Host output poll		*/
	ioct->db_spec_keys = (DB_SPCL *) 0, /* Special keys table	*/
```

Copyright 1989 Logic Modeling Systems

| SOURCE PROGRAM | DATE | 5/23/89 | PAGE # |
|---|---|---|---|
| bsp.lm1000/bsp.c | TIME | 4:41:11 pm | 3/9 |

SOURCE TEXT

```
} /* end init_rtsftble */


/**************************************************************/
/*                         init_cvt                            */
/* Create component configuration table                        */
/**************************************************************/


init_cvt()
{

CVT_TBL         *ct = (CVT_TBL *)&(cftble->cvt);
short           i;

    ct->hr_max = HR_MAX;                 /* Ready System highest component no. */
    ct->usr_max = USR_MAX;               /* User highest component no.         */

    for( i = 0; i < 6; i++ )             /* Reserved                           */
        ct->res1[ i ] = 0;
    for( i = 0; i < 8; i++ )             /* Reserved                           */
        ct->res2[ i ] = 0;

    ct->comp1_code = 0;                  /* No IOX                             */
    ct->comp1_work = 0;                  /* No IOX                             */
    ct->comp2_code = 0;                  /* No FMX                             */
    ct->comp2_work = 0;                  /* No FMX                             */

} /* end init_cvt */



/**************************************************************/
/*                         setup_ivt                           */
/* Setup interrupt vector table                                */
/**************************************************************/

setup_ivt()
{

unsigned        long    *ivt = (unsigned long *)VEC_BASE_ADDRESS;

/*
** The bus handler
*/
        *(ivt + VEC_BUS_ERROR) = (unsigned long) bus_isr;
        *(ivt + VEC_ADDRESS_ERROR) = (unsigned long) bus_isr;
        *(ivt + VEC_ILLEGAL_INSTRUCTION) = (unsigned long) bus_isr;
/*
;------ Set up rtscope entry
*/

    *(ivt + 0x21) = (RTS_BASE + RTS_ENTRY);     /* RTscope entry point */


/*
;------ Set up Vrtx vectors
*/

    *(ivt + 0x40) = (long)&(cftble->v_cnft);    /* Config Table        */
    *(ivt + 0x20) = VRTX_BASE;                  /* VRTX Base           */

/*
;------ Set up Serial port interrupt vectors
*/

    /* Tx/Rx ISR handler address to IVT auto vector level 5 */
    *(ivt + VEC_DUART_INTERRUPT) = (long)serial_isr;

/*
;------ Set up Counter/Timer interrupt vector
*/

  /* Count/Timer ISR address to IVT 28, Auto vector level 4*/
    *(ivt + VEC_TIMER_INTERRUPT) = (unsigned long)ct_isr;

/*
;------ Set up ethernet interrupt vector
*/

  /* ethernet ISR address to IVT 30, Auto vector level 6*/
    *(ivt + VEC_LANCE_DOORBELL_INTR) = (unsigned long)ether_isr;
/*
;----- Clock board error ISR
*/
    *(ivt + VEC_CB_INTERRUPT) = (unsigned long)error_isr;
/*
;----- Parity ISR, IVT 31 , NMI
*/
        *(ivt + VEC_PARITY_INTERRUPT) = (unsigned long)parity_isr;
} /* end setup_ivt */


/*
** Enable cpu control register
*/
enable_cpu_reg()
{
        cpu_control_reg_struct  *p_cpu_cntl_reg = (cpu_control_reg_struct *) CPU_CONTROL_REG;
        /*
        ** enable timer gates, and enable the timer interrupt
        */
        p_cpu_cntl_reg->timer_gate_0 = 1;
        p_cpu_cntl_reg->timer_gate_1 = 1;
        p_cpu_cntl_reg->timer_intr_ena_2 = 1;
        /*
        ** enable parity intr
        */
        p_cpu_cntl_reg->parity_intr_ena = 1;
        /*
        ** enable interrupts
        */
        p_cpu_cntl_reg->global_intr_ena = 1;

}

/*
** reset the CPU
*/
void
```

Copyright 1989
Logic Modeling Systems

| SOURCE PROGRAM | DATE | PAGE # |
|---|---|---|
| bsp.lm1000/bsp.c | 5/23/89 | 4/10 |
| | TIME 4:41:11 pm | |

LINE # SOURCE TEXT

```
reset_cpu(reset_modeler_state)
char reset_modeler_state;
{
        char modeler_reset = reset_modeler_state;
        u_long  err;
        cpu_control_reg_struct *cpu_cntl = (cpu_control_reg_struct *) CPU_CONTROL_REG;

        /*
        ** reason for reset
        */
        if( reset_modeler_state != REBOOT )
        {
                (void)lm_svaram_access(&modeler_reset, MODELER_RESET, SIZEOF_MODELER_RESET, MEMORY_WRITE,(u_long *) &err);
                reset_modeler_state = SHUTDOWN;
        }
        (void)lm_svaram_access(&reset_modeler_state, MODELER_STATE, SIZEOF_MODELER_STATE, MEMORY_WRITE,(u_long *) &err);
        cpu_cntl -> suicide = 1;
        for(;;);
}
```

Copyright 1989
Logic Modeling Systems

| SOURCE PROGRAM | DATE | PAGE # |
|---|---|---|
| tasks.lm1000/hkeeping_task.c | 5/23/89 | 1/1 |
| | TIME 4:42:33 pm | |

SOURCE TEXT

```
/* SCCS_ID: hkeeping_task.c rev 3.1, 4/24/89 at 07:55:25 */

#include "common.h"
#include "network.h"
#include "cpu.h"
#include "lance.h"
#include "mod_err.h"
#include "lm_rd_wr.h"
#include "nvram.h"

u_long          calibrate_led = 0;
u_long          timer_semaphor;

void            clear_test_led();
void            set_test_led();
u_short         check_connection_for_life();

extern u_long   lm_tick;
extern u_long   Got_a_char;
extern u_long   network_timeout;
extern u_char   lm_hardware_init_done;

extern u_char   fatal_hardware_error_encountered;
extern u_char   fatal_configuration_error_encountered;
extern u_char   non_fatal_configuration_error_encountered;

extern BOOT_STRUCT boot;
extern CONNECTION *table_of_conns[];

#define MAX_TRIES 3
#define MSECONDS_PER_SECOND 1000

void
housekeeping_task()
{
    int             err;
    u_char          value = 0;
    u_char          users = 0;
    extern BOOT_STRUCT boot;

#ifdef  BROKEN_HARDWARE
    extern char     reinitialize_lance;

#endif  BROKEN_HARDWARE
    u_short         short_network_timeout;
    register CONNECTION **conn_table;
    register CONNECTION *conn;

    extern char    *lmsi_version;


    modeler_state = MODELER_CALIBRATING;
    (void) lm_nvram_access(&modeler_state, MODELER_STATE,
                    SIZEOF_MODELER_STATE, MEMORY_WRITE, (u_long *) & err);

    printf("\n%s\n", lmsi_version);

    init();

    read_hw_config();

    init_mod_err();

    enable_mod_err();

    lm_hardware_init_done = TRUE;

    modeler_state = MODELER_RUNNING;
    (void) lm_nvram_access(&modeler_state, MODELER_STATE,
                    SIZEOF_MODELER_STATE, MEMORY_WRITE, (u_long *) & err);

    if (fatal_hardware_error_encountered == TRUE) {
        printf("Fatal Hardware Error Encountered during start up.\n");
    }
    if (fatal_configuration_error_encountered == TRUE) {
        printf("Fatal Configuration Error Encountered during start up.\n");
    }
    if (non_fatal_configuration_error_encountered == TRUE) {
        printf("Non-Fatal Configuration Error Encountered during start up.\n");
    }

    printf("Ready to accept network connections\n");
    clear_test_led();

    while (TRUE) {
        sc_spend(timer_semaphor, 0, &err);
        if (err)
            printf("\nError in spend in housekeeping %x", err);

        if (Got_a_char == 1) {
            Got_a_char = 0;
            printf("Running Core Modeler Code, this port is inactive.\n");
        }

#ifdef  BROKEN_HARDWARE

        /*
         * if lance requires a jump start let's do it.
         */
        if (reinitialize_lance == 1) {
            reinitialize_lance = 0;
            (void) sc_lock();
            if (get_lance_ready_to_go() != SUCCESS)
                printf("Can't reinitilalize lance\n");
            else
                printf("Reinitialized lance\n");
            if (start_lance() != SUCCESS)
                printf("Can't start lance\n");
            else
                printf("Restarted lance\n");
            (void) sc_unlock();
        }
#endif  BROKEN_HARDWARE

        /*
         * read the boot structure.
         */
        if (lm_nvram_access((char *) &boot, BOOT, SIZEOF_BOOT,
                        MEMORY_READ, (u_long *) & err) == FAILURE) {
            printf("Failed to read boot structure.\n");
```

Copyright 1989 Logic Modeling Systems

| SOURCE PROGRAM | DATE | PAGE # |
|---|---|---|
| tasks.lm1000/hkeeping_task.c | 5/23/89 | 2/2 |
| | TIME 4:42:33 pm | |

SOURCE TEXT

```
        }

        /*
         * set network timeout
         */
        if (lm_sysram_access(&short_network_timeout, NETWORK_TIMEOUT,
            SIZEOF_NETWORK_TIMEOUT, MEMORY_READ, (u_long *) & err) == FAILURE)
            printf("Unable to read network timeout\n");
        else {

            /*
             * Turn seconds to milliseconds
             */
            network_timeout = short_network_timeout;
            network_timeout *= MSECONDS_PER_SECOND;
        }

        /*
         * Check reboot
         */
        check_reboot();

        /*
         * if we are calibrating TMG, set calibrate_led
         */
        if (calibrate_led == 1) {
            if (value == 0) {
                clear_test_led();
                value = 1;
            } else {
                set_test_led();
                value = 0;
            }
        }

        /*
         * go thru conn structures checking for timeouts
         */
        conn_table = &table_of_conns[0];
        for (users = 0; users != MAX_USERS; users++) {
            conn = *conn_table++;

            if (conn == (CONNECTION *) NULL)
                continue;

            CPU_DISABLE_INTERRUPTS;

            /*
             * close the connection
             */
            if (conn->do_close == TRUE) {
                if (close_connection_for_server(conn) == FAILURE) {
                    CPU_ENABLE_INTERRUPTS;
                    printf("Unable to close connection %d\n", conn->fd);
                    CPU_DISABLE_INTERRUPTS;
                }
            } else {

                /*
                 * did we send the last part of the reply and is this
                 * connection supposed to close
                 */
                if (conn->am_sending == FALSE && conn->am_closing == TRUE) {
                    conn->do_close = TRUE;
                }
            }

            /*
             * network timeout is set, and we are timing out.
             */
            if (network_timeout != 0 && conn != (CONNECTION *) NULL &&
                conn->am_timing_out == TRUE) {
                if (conn->time_to_live < (lm_tick * 5)) {
                    CPU_ENABLE_INTERRUPTS;
                    if (check_connection_for_life(conn) == FAILURE) {
                        printf("Can't check connection for life in housekeeping task user # %d\n",
                               users);
                    }
                    conn->time_to_live = (lm_tick * 5) + network_timeout;
                    if (conn->number_of_live_retries++ > MAX_TRIES) {

                        /*
                         * The host daemon is not responding to daemon
                         * requests. This does not mean that the host is dead,
                         * so just make a note of it and continue.
                         */
                        conn->number_of_live_retries = 0;
                    }
                }
            }
        }
        if ((conn = table_of_conns[MAX_USERS]) == (CONNECTION *) NULL) {
            CPU_ENABLE_INTERRUPTS;
            continue;
        }

        /*
         * close the connection
         */
        if (conn->do_close == TRUE) {
            if (close_connection_for_server(conn) == FAILURE) {
                CPU_ENABLE_INTERRUPTS;
                printf("Unable to close connection %d\n", conn->fd);
            }
            CPU_ENABLE_INTERRUPTS;
            continue;
        }

        /*
         * Did we send the 1 packet reply and is this connection supposed to
         * close ?
         */
        if (conn->am_closing == TRUE) {
            conn->do_close = TRUE;
        }
        CPU_ENABLE_INTERRUPTS;
    }
}

void
```

Copyright 1989
Logic Modeling Systems

| SOURCE PROGRAM | DATE | TIME | PAGE # |
|---|---|---|---|
| tasks.lm1000/hkeeping_task.c | 5/23/89 | 4:42:33 pm | 3/3 |

LINE # SOURCE TEXT

```
set_test_led()
{
    cpu_control_reg_struct *p_cpu_cntl_reg =
    (cpu_control_reg_struct *) CPU_CONTROL_REG;

    p_cpu_cntl_reg->not_test_led = not_LED_ON;
}

void
clear_test_led()
{
    cpu_control_reg_struct *p_cpu_cntl_reg =
    (cpu_control_reg_struct *) CPU_CONTROL_REG;

    p_cpu_cntl_reg->not_test_led = not_LED_OFF;
}
```

Copyright 1989 Logic Modeling Systems

SOURCE PROGRAM tasks.lm1000/receive_task.c | DATE 5/23/89 | TIME 4:42:34 pm | PAGE # 1/4

LINE # SOURCE TEXT

```
/* SCCS_ID: receive_task.c rev 1.1, 4/24/89 at 07:55:29      */

/*
** receive_   t.c
*/
#include "common.h"
#include "fifo.h"
#include "cpu.h"
#include "task.h"
#include "message.h"
#include "network.h"

u_long  lm_global_clock;

extern CONNECTION *table_of_conns[ ];


void
receive_task()
{
        u_short type;
        char    str[MAX_MESSAGE];

        u_long  rtn;
        u_char  user;

        CONNECTION      *conn;

        /*
        ** Initialize socket, before doing anything else
        ** sets up base conn.
        */
        if(init_socket() == FAILURE) {
                ; /* FIXIT */
        }

        lm_global_clock = 0;
        for (;;)
        {
                rtn = lm_choose_connection( &user );
                if (rtn != FAILURE)
                {
                        conn = table_of_conns[ user ];
                        if( rtn == PENDING )
                        {
                                if (lm_send_reply(conn) != SUCCESS)
                                {
                                        printf("aaaaaaaaaaaaaaaa");
                                        ; /* FIXIT */
                                }
                        }
                        else
                        {
                                ; /* FIXIT */
                        }
                }
                else
                {
                        while(lm_dequeue_message(&type, str) != FAILURE) {
                                if (type == ERROR_MSG)
                                        (void) printf("ERROR: %s\n", str);
                                else (void) printf("WARNING: %s\n", str);
                        }
                }
        }
}
```

Copyright 1989
Logic Modeling Systems

SOURCE PROGRAM os/arp.c | DATE 5/23/89 | TIME 4:42:10 pm | PAGE # 1/1

SOURCE TEXT

```
/* SCCS_ID: arp.c rev 3.1, 4/24/89 at 07:46:29      */

/*
**      This file contains the ARP request and response
**      functions.  For information on ARP and RARP see
**      the DDN protocol handbook, volume 3, pp 3-615.
*/

#include "common.h"
#include "arp.h"

/*  external function declarations  */

extern unsigned short lance_transmit();
extern char *memcpy();


/*
**  This routine broadcasts an arp request for a modeler.
**  The receive task will receive the reply and handle
**  appropriately
*/

send_arp_request (enet_address, inet_address, dest_inet_address)
        char            *enet_address;
        unsigned long   inet_address;
        unsigned long   dest_inet_address;
{
        static struct   ethernet_arp_packet     arp_request;
        long    error;

        (void) memcpy ((char *) arp_request.destination, BROADCAST, ARP_HARDWARE_SIZE);
        (void) memcpy ((char *) arp_request.source, enet_address, ARP_HARDWARE_SIZE);

        arp_request.type = ARP_ARP;

        arp_request.arp.arp_hardware_type = ARP_ETHERNET;
        arp_request.arp.arp_protocol_type = ARP_IP;
        arp_request.arp.arp_hardware_address_length = ARP_HARDWARE_SIZE;
        arp_request.arp.arp_protocol_address_length = ARP_PROTOCOL_SIZE;
        arp_request.arp.arp_opcode = ARP_REQUEST;
        arp_request.arp.arp_source_protocol_address = inet_address;
        arp_request.arp.arp_target_protocol_address = dest_inet_address;

        (void) memcpy ((char *) arp_request.arp.arp_source_hardware_address, enet_address, ARP_HARDWARE_SIZE);
        (void) memcpy ((char *) arp_request.arp.arp_target_hardware_address, NULL_ADDRESS, ARP_HARDWARE_SIZE);

        (void) lance_transmit (&arp_request, (short) sizeof (arp_request), &error);

        return;
}



/*  This routine generates a response to an ARP request.  It is   */
/*  currently unimplemented  The modeler will not respond to      */
/*  ARP requests, a host machine must publish an ARP response     */
/*  for a modeler.  I wrote this routine simply because it was    */
/*  easy to do while I had my nose in the DDN book.  If we ever   */
/*  implement a full ARP, I hope I saved someone some time and    */
/*  effort, if not, oh well...                                    */

send_arp_reply (arp_reply, enet_address, inet_address, dest_enet_address, dest_inet_address)
        struct  ethernet_arp_packet     *arp_reply;
        char            *enet_address;
        unsigned long   inet_address;
        char            *dest_enet_address;
        unsigned long   dest_inet_address;
{
        long    error;

        (void) memcpy ((char *) arp_reply->destination, dest_enet_address, ARP_HARDWARE_SIZE);
        (void) memcpy ((char *) arp_reply->source, enet_address, ARP_HARDWARE_SIZE);

        arp_reply->type = ARP_ARP;

        arp_reply->arp.arp_hardware_type = ARP_ETHERNET;
        arp_reply->arp.arp_protocol_type = ARP_IP;
        arp_reply->arp.arp_hardware_address_length = ARP_HARDWARE_SIZE;
        arp_reply->arp.arp_protocol_address_length = ARP_PROTOCOL_SIZE;
        arp_reply->arp.arp_opcode = ARP_REPLY;
        arp_reply->arp.arp_source_protocol_address = inet_address;
        arp_reply->arp.arp_target_protocol_address = dest_inet_address;

        (void) memcpy ((char *) arp_reply->arp.arp_source_hardware_address, enet_address, ARP_HARDWARE_SIZE),
        (void) memcpy ((char *) arp_reply->arp.arp_target_hardware_address, dest_enet_address, ARP_HARDWARE_SIZE);

        (void) lance_transmit (arp_reply, (short) sizeof (arp_reply), &error);

        return;
}
```

Copyright 1989
Logic Modeling Systems

| SOURCE PROGRAM | DATE | 5/23/89 | PAGE # |
|---|---|---|---|
| os/bus.c | TIME | 4:42:10 pm | 1/2 |

SOURCE TEXT

```
/* SCCS_ID: bus.c rev 3.1, 4/24/89 at 07:46:32     */

/*
** bus.c
** bus error handle.
** It is more complicated than it needs to be,
** we need to use this to determine if a PAC
** is present...
*/
#include "common.h"
#include "cpu.h"
#include "cpu_vec.h"
#include "mod_err.h"
#include "nvram.h"
#include "lm_rd_wr.h"
#include "bus.h"
static char buf[ 200 ];
extern          bus_isr();
u_long setup_ivt_bus( );
extern u_short lm_nvram_access();
extern void reset_cpu();
void Bus_error_txn( );
void output_routine( );
u_short address_in_map();
static u_char *ignore_low_address;
static u_char *ignore_hi_address;
u_char ignore_mem_error;
static u_char mem_error;
static char debug_bus = 1;
/*
** Bus error handler
*/
void bus_error( )
{
        extern STACK_FRAME *bus_error_address;
        STACK_FRAME *stack_frame = bus_error_address;
        u_long err;
        if( address_in_map( stack_frame->address ) == SUCCESS)
        {
                if( ignore_mem_error == TRUE )
                    if( ignore_low_address >= stack_frame -> address &&
                        ignore_hi_address <= stack_frame -> address)
                    {
                            if(stack_frame->spec_status_word &  0x0100)
                            {
                                stack_frame->spec_status_word ~= 0x0100;
                                mem_error = TRUE;
                                return;
                            }
                    }
        }
        if(lm_nvram_access((char *) &stack_frame->address, BUS_ADDR, (u_long)SIZEOF_BUS_ADDR, MEMORY_WRITE,&err)==FAILURE)
        {
                reset_cpu(SUICIDE);
        }
        if(lm_nvram_access((char *) &stack_frame -> spec_status_word, SSW_REG , (u_long)SIZEOF_SSW_REG, MEMORY_WRITE,&err)==FAILURE)
        {
                reset_cpu(SUICIDE);
        }
        if(lm_nvram_access((char *) &stack_frame -> vector, ERROR_VECTOR, (u_long)SIZEOF_ERROR_VECTOR, MEMORY_WRITE,&err)==FAILURE)
        {
                reset_cpu(SUICIDE);
        }
        /*
        ** print out screen
        */
        if( debug_bus == 1 )
        {
                sprintf(buf,"\nInterrupt priority Level %0x",(stack_frame -> sr & 0x700 ) >> 8);
                output_routine(buf);
                sprintf(buf, "\nProgram Counter %0x",stack_frame -> pc);
                output_routine(buf);
                sprintf(buf,"\nFailed at address %0x",stack_frame -> address);
                output_routine(buf);
                if(stack_frame -> spec_status_word & 0x100)
                {
                        sprintf(buf, "\nData Access");
                        output_routine(buf);
                        if( stack_frame -> spec_status_word & 0x80)
                        {
                                sprintf(buf, "Read Modify write cycle ");
                                output_routine(buf);
                        }
                        if( stack_frame -> spec_status_word & 0x10)
                        {
                                sprintf(buf, " Byte ");
                                output_routine(buf);
                        }
                        if( stack_frame -> spec_status_word & 0x20)
                        {
                                sprintf(buf, " Word ");
                                output_routine(buf);
                        }
                        if(!( stack_frame -> spec_status_word & 0x30))
                        {
                                sprintf(buf, " Long ");
                                output_routine(buf);
                        }
                        if( stack_frame -> spec_status_word & 0x40)
                        {
                                sprintf(buf, "Read cycle ");
                                output_routine(buf);
                        }
                        else
                        {

                                sprintf(buf, "Write cycle ");
                                output_routine(buf);
                        }
                }
                if(stack_frame -> spec_status_word & 0x3000)
                {
                        sprintf(buf, "\nInstruction Access ");
                        output_routine(buf);
                }
        }
        /*
        ** we crashed
        if( address_in_map( stack_frame->address ) == FAILURE)
        */
```

Copyright 1989
Logic Modeling Systems

SOURCE PROGRAM os/bus.c | DATE 5/23/89 | TIME 4:42:10 pm | PAGE # 2/3

LINE # SOURCE TEXT

```
        reset_cpu( BUS_ERROR );
}

#define ALWAYS_MEMORY   0
#define NEVER_MEMORY    1
#define OPTIONAL_MEMORY   2
#define MAP_SIZE 32
static u_long map[MAP_SIZE][2]= {
                0x003fffff, ALWAYS_MEMORY ,
                0x0fffffff, OPTIONAL_MEMORY ,
                0x107fffff, NEVER_MEMORY ,
                0x10bfffff, OPTIONAL_MEMORY ,
                0x10dfffff, ALWAYS_MEMORY ,
                0x1fffffff, NEVER_MEMORY ,
                0x7fffffff, NEVER_MEMORY ,
                0x8c1fffff, OPTIONAL_MEMORY ,
                0x8cffffff, NEVER_MEMORY ,
                0x8d0effff, OPTIONAL_MEMORY ,
                0x8dffffff, NEVER_MEMORY ,
                0x8e0fffff, OPTIONAL_MEMORY ,
                0x8fffffff, NEVER_MEMORY ,
                0x9c1fffff, OPTIONAL_MEMORY ,
                0x9cffffff, NEVER_MEMORY ,
                0x9d0effff, OPTIONAL_MEMORY ,
                0x9dffffff, NEVER_MEMORY ,
                0x9e0fffff, OPTIONAL_MEMORY ,
                0x9fffffff, NEVER_MEMORY ,
                0xac1fffff, OPTIONAL_MEMORY ,
                0xacffffff, NEVER_MEMORY ,
                0xad0effff, OPTIONAL_MEMORY ,
                0xadffffff, NEVER_MEMORY ,
                0xae0fffff, OPTIONAL_MEMORY ,
                0xafffffff, NEVER_MEMORY ,
                0xbc1fffff, OPTIONAL_MEMORY ,
                0xbcffffff, NEVER_MEMORY ,
                0xbd0effff, OPTIONAL_MEMORY ,
                0xbdffffff, NEVER_MEMORY ,
                0xbe0fffff, OPTIONAL_MEMORY ,
                0xbfffffff, NEVER_MEMORY ,
                0xffffffff, NEVER_MEMORY
               };
u_short
address_in_map( address )
u_char *address;
{
        register u_char i;
        /*
        ** Go thru above table to determine what to do..
        */
        for( i = 0; i <= MAP_SIZE; ++i)
        {
                if( map[ i ][ 0 ] >= (u_long) address )
                {
                        if( map[ i ][ 1 ] == NEVER_MEMORY )
                                return( FAILURE );
                        return( SUCCESS );
                }
        }
        return( FAILURE );
}

/*
** address for which errors are to be ignored
*/
void lm_ignore_bus_error( addr_lo, addr_hi )
u_char *addr_lo, *addr_hi;
{
        ignore_low_address = addr_lo;
        ignore_hi_address = addr_hi;
        ignore_mem_error = TRUE;
        mem_error = FALSE;
}

/*
** did we get a bus error
*/
lm_check_bus_error( )
{
        return( mem_error );
}

/*
** deal with bus error correctly, and do not ignore any errors
*/
void lm_enable_bus_error()
{
        ignore_mem_error = FALSE;
}

u_short
lm_read_probe( addr )
register u_long *addr;
{
        cpu_control_reg_struct  *cpu_control_register= (cpu_control_reg_struct *) CPU_CONTROL_REG;
        u_long junk, temp;
        temp = setup_ivt_bus( (u_long)bus_isr );
        lm_ignore_bus_error((u_char *)addr,(u_char    addr );
        /*
        ** read.
        */
        junk = *addr;
        lm_enable_bus_error();
        (void) setup_ivt_bus( temp );
        if(lm_check_bus_error() == TRUE )
                return( FAILURE );
        return( SUCCESS );
}
u_short
lm_write_probe( addr, value )
register u_long *addr, value;
{
        u_long temp;
        cpu_control_reg_struct  *cpu_control_register= (cpu_control_reg_struct *) CPU_CONTROL_REG;
        temp = setup_ivt_bus( (u_long)bus_isr );
        lm_ignore_bus_error((u_char *)addr,(u_char *) addr );
        /*
        ** write.
        */
        *addr = value;
        lm_enable_bus_error();
```

Copyright 1989
Logic Modeling Systems

| SOURCE PROGRAM | DATE | PAGE # |
|---|---|---|
| os/bus.c | 5/23/89 | 3/4 |
| | TIME 4:42:10 pm | |

LINE # SOURCE TEXT

```
        (void) setup_ivt_bus( temp );
        if(lm_check_bus_error() == TRUE )
                return( FAILURE );
        return( SUCCESS );
}

static
u_long setup_ivt_bus( bus_isr )
u_long bus_isr;
{
    unsigned        long    *ivt = (unsigned long *)VEC_BASE_ADDRESS;
    u_long temp;
    /*
    ** The bus handler
    */
    temp = *(ivt + 2);
    *(ivt + 2) = (unsigned long) bus_isr;
    return( temp );
}

void output_routine( buf )
char *buf;
{
        char *bufptr = buf;
        while( *bufptr )
        {
                Bus_error_txs( *bufptr++ );
        }
}
```

Copyright 1989
Logic Modeling Systems

SOURCE PROGRAM os/duart.c | DATE 5/23/89 | TIME 4:42:10 pm | PAGE # 1/5

LINE # SOURCE TEXT

```
/* SCCS_ID: duart.c rev 3.1, 4/24/89 at 07:46:36     */

/*
** Duart.c
*/

#include "cpu.h"
#include "duart.h"

/*
** have UARTA  & UARTB been initialized
** 0 = no, 1  = yes.
*/
extern INTERRUPT_REG  Uart_mask ;

int lm_uarta_baud; /* current uart a baud rate */
int lm_uartb_baud; /* current uart b baud rate */

/*
** Uarta_init()
**          Initialize channel A of the DUART.
*/
Uarta_init( baud )
unsigned int baud;
{
        MODE_REG_1      mode_reg1a, *p_mode_reg1a = (MODE_REG_1 *)(CPU_DUART + MODE_REG1_A );
        MODE_REG_2      mode_reg2a, *p_mode_reg2a = (MODE_REG_2 *)(CPU_DUART + MODE_REG2_A );
        CMND_REG        cmnd_rega, *p_cmnd_rega   = (CMND_REG *)  (CPU_DUART + CMD_REG_A );
        ACR             acr, *p_acr = (ACR *)(CPU_DUART + AUX_CNTL_REG );

        /*
        ** reset everything
        ** through command register
        */
        /*
        ** disable tx & rx
        */
        cmnd_rega.zero = 0;
        cmnd_rega.command = NOP;
        cmnd_rega.dis_tx = DUART_ENABLE;
        cmnd_rega.ena_tx = DUART_DISABLE;
        cmnd_rega.dis_rx = DUART_ENABLE;
        cmnd_rega.ena_rx = DUART_DISABLE;
        *p_cmnd_rega = cmnd_rega;
        /*
        ** reset channel
        */
        cmnd_rega.command = RESET_CH;
        *p_cmnd_rega = cmnd_rega;

        /*
        ** reset error
        */
        cmnd_rega.command = RESET_ERR;
        *p_cmnd_rega = cmnd_rega;
        /*
        ** reset rcvr
        */
        cmnd_rega.command = RESET_RCVR;
        *p_cmnd_rega = cmnd_rega;
        /*
        ** reset tx
        */
        cmnd_rega.command = RESET_TX;
        *p_cmnd_rega = cmnd_rega;
        /*
        ** reset mode register
        */
        cmnd_rega.command = RESET_MODE_REG;
        *p_cmnd_rega = cmnd_rega;
        /*
        ** set up mode reg 1
        ** char mode, 8 bits/char & no parity
        */
        mode_reg1a.rx_rts = DUART_DISABLE;
        mode_reg1a.rx_int = RX_INT_RRDY;
        mode_reg1a.error_mode = ERR_MODE_CHAR;
        mode_reg1a.parity = PARITY_NONE;
        mode_reg1a.bits_per_char = BITS_PER_CHAR_8;
        *p_mode_reg1a = mode_reg1a;
        /*
        ** set up mode reg 2
        */
        mode_reg2a.Chan_mode = CH_MODE_NORMAL;
        mode_reg2a.tx_rts = DUART_DISABLE;
        mode_reg2a.cts_enable = DUART_DISABLE;
        mode_reg2a.stop_len = STOP_BITS_2;
        *p_mode_reg2a = mode_reg2a;
        /*
        ** clock select
        */
        Uarta_baud( baud );
        /*
        ** set up aux. control reg
        */
        acr.zero = 0;
        *p_acr = acr;
        /*
        ** set up int. mask reg
        ** this controls ints. for both UART's
        ** we must take this into consideration.
        */
        Uarta_imr();
        /*
        ** enable tx & rx operations
        */
        cmnd_rega.command = NOP;
        cmnd_rega.dis_tx = DUART_DISABLE;
        cmnd_rega.ena_tx = DUART_ENABLE ;
        cmnd_rega.dis_rx = DUART_DISABLE;
        cmnd_rega.ena_rx = DUART_ENABLE;
        *p_cmnd_rega = cmnd_rega;
}

Uarta_baud( baud )
{
        CLK_SEL clk_sela, *p_clk_sela = (CLK_SEL *)(CPU_DUART + CLK_SEL_REG_A);

        lm_uarta_baud = baud & 0xf;
```

Copyright 1989
Logic Modeling Systems

SOURCE PROGRAM os/duart.c | DATE 5/23/89 | TIME 4:42:10 pm | PAGE # 2/6

LINE # SOURCE TEXT

```
        /*
        ** clock select
        */
        clk_sela.RX_clk = baud;
        clk_sela.TX_clk = baud;
        *p_clk_sela = clk_sela;
}

Uarta_imr()
{
        INTERRUPT_REG   interrupt_reg, *p_interrupt_reg = (INTERRUPT_REG *)(CPU_DUART + INT_MASK_REG);

        /*
        ** set up int. mask reg
        ** this controls ints. for both UART's
        ** we must take this into consideration.
        */
        interrupt_reg = Uart_mask;
        interrupt_reg.in_port = DUART_DISABLE;
        interrupt_reg.delta_brk_b =DUART_DISABLE;
        interrupt_reg.counter = DUART_DISABLE;
        interrupt_reg.delta_brk_a =DUART_DISABLE;
        interrupt_reg.rx_rdy_a = DUART_ENABLE ;
        interrupt_reg.tx_rdy_a = DUART_ENABLE ;
        /*
        ** set interrupt reg, and save in mask this is a write only reg.
        */
        Uart_mask = interrupt_reg;
        *p_interrupt_reg = interrupt_reg;
}



Uartb_init( baud )
unsigned int baud;
{
        MODE_REG_1      mode_reg1b, *p_mode_reg1b = (MODE_REG_1 *)(CPU_DUART + MODE_REG1_B );
        MODE_REG_2      mode_reg2b, *p_mode_reg2b = (MODE_REG_2 *)(CPU_DUART + MODE_REG2_B );
        CLK_SEL         clk_selb, *p_clk_selb     = (CLK_SEL *)   (CPU_DUART + CLK_SEL_REG_B);
        CMND_REG        cmnd_regb, *p_cmnd_regb   = (CMND_REG *)  (CPU_DUART + CMD_REG_B );

        lm_uartb_baud = baud & 0xf;

        /*
        ** reset everything
        ** through command register
        */
        /*
        ** disable tx & rx
        */
        cmnd_regb.zero = 0;
        cmnd_regb.command = NOP;
        cmnd_regb.dis_tx = DUART_ENABLE;
        cmnd_regb.ena_tx = DUART_DISABLE;
        cmnd_regb.dis_rx = DUART_ENABLE;
        cmnd_regb.ena_rx = DUART_DISABLE;
        *p_cmnd_regb = cmnd_regb;
        /*
        ** reset channel
        */
        cmnd_regb.command = RESET_CH;
        *p_cmnd_regb = cmnd_regb;

        /*
        ** reset error
        */
        cmnd_regb.command = RESET_ERR;
        *p_cmnd_regb = cmnd_regb;
        /*
        ** reset rcvr
        */
        cmnd_regb.command = RESET_RCVR;
        *p_cmnd_regb = cmnd_regb;
        /*
        ** reset tx
        */
        cmnd_regb.command = RESET_TX;
        *p_cmnd_regb = cmnd_regb;
        /*
        ** reset mode register
        */
        cmnd_regb.command = RESET_MODE_REG;
        *p_cmnd_regb = cmnd_regb;
        /*
        ** set up mode reg 1
        ** char mode, 8 bits/char & no parity
        */
        mode_reg1b.rx_rts = DUART_DISABLE;
        mode_reg1b.rx_int = RX_INT_RRDY;
        mode_reg1b.error_mode = ERR_MODE_CHAR;
        mode_reg1b.parity = PARITY_NONE;
        mode_reg1b.bits_per_char = BITS_PER_CHAR_8;
        *p_mode_reg1b = mode_reg1b;
        /*
        ** set up mode reg 2
        */
        mode_reg2b.chan_mode = CH_MODE_NORMAL;
        mode_reg2b.tx_rts = DUART_DISABLE;
        mode_reg2b.cts_enable = DUART_DISABLE;
        mode_reg2b.stop_len = STOP_BITS_2;
        *p_mode_reg2b = mode_reg2b;
        /*
        ** clock select
        */
        Uartb_baud(baud);
        /*
        ** set up int. mask reg
        ** this controls ints. for both UART's
        ** we must take this into consideration.
        */
        Uartb_imr();
        /*
        ** enable tx & rx operations
        */
        cmnd_regb.command = NOP;
        cmnd_regb.dis_tx = DUART_DISABLE;
        cmnd_regb.ena_tx = DUART_ENABLE ;
        cmnd_regb.dis_rx = DUART_DISABLE;
        cmnd_regb.ena_rx = DUART_ENABLE;
        *p_cmnd_regb = cmnd_regb;
```

Copyright 1989
Logic Modeling Systems

| SOURCE PROGRAM | DATE 5/23/89 | PAGE # |
|---|---|---|
| os/duart.c | TIME 4:42:10 pm | 3/7 |

LINE # SOURCE TEXT

```
}

Uartb_baud( baud )
unsigned int baud;
{
        CLK_SEL clk_selb, *p_clk_selb = (CLK_SEL *)(CPU_DUART + CLK_SEL_REG_B);

        lm_uartb_baud = baud & 0xf;

        /*
        ** clock select
        */
        clk_selb.RX_clk = baud;
        clk_selb.TX_clk = baud;
        *p_clk_selb = clk_selb;
}

Uartb_imr()
{
        INTERRUPT_REG   interrupt_reg, *p_interrupt_reg = (INTERRUPT_REG *)(CPU_DUART + INT_MASK_REG);

        /*
        ** set up int. mask reg
        ** this controls ints. for both UART's
        ** we must take this into consideration.
        */
        interrupt_reg = Uart_mask;
        interrupt_reg.rx_rdy_b = DUART_ENABLE  ;
        interrupt_reg.tx_rdy_b = DUART_ENABLE  ;
        /*
        ** set interrupt reg, and save in mask this is a write only reg.
        */
        Uart_mask = interrupt_reg;
        *p_interrupt_reg = interrupt_reg;
}

/* UART BREAK RELATED FUNCTIONS */

Uarta_rx_brk()
{
        int nvabaud;

        lm_get_nvaram_bauda(&nvabaud);

        if ((nvabaud & 0xf0) != 0x10)
                return;

        Uarta_baud(get_next_baud(lm_uarta_baud));
}

Uartb_rx_brk()
{
        int nvabaud;

        lm_get_nvaram_baudb(&nvabaud);

        if ((nvabaud & 0xf0) != 0x10)
                return;

        Uartb_baud(get_next_baud(lm_uartb_baud));
}

static
get_next_baud(baud)
{
        switch (baud) {
        default:
        case BAUD_1200:
                return BAUD_2400;
        case BAUD_2400:
                return BAUD_9600;
        case BAUD_9600:
                return BAUD_1200;
        }
}
```

Copyright 1989
Logic Modeling Systems

| SOURCE PROGRAM | DATE | TIME | PAGE # |
|---|---|---|---|
| os/eeprom.c | 5/23/89 | 4:42:11 pm | 1/8 |

LINE # SOURCE TEXT

```
/* SCCS_ID: eeprom.c rev 3.1, 4/24/89 at 07:46:35      */

/*
** EEprom Access routines
*/
#include "common.h"
#include "mod_def.h"
#include "magic.h"
#include "pel.h"
#include "eeprom.h"
#include "lm_rd_wr.h"
#define REG_ADDRESS 8
#define REG_DATA 0xa

extern u_char diag_dab;
u_char debug_eeprom = 0;
static unsigned short reset[] = {
                                        SET_CLK_0,
                                        SET_CS_0,
                                        SET_CS_1,
                                        SET_DATA_IN_LOW,
                                        TOG_CLK,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NOP,
                                        NO_TOG_CLK,
                                        SET_CS_0,
                                        SET_CLK_0,
                                        DONE };
static unsigned short read_command[] = {
                                        SET_CLK_0,
                                        SET_CS_1,
                                        TOG_CLK,
                                        LITERAL + 1,
                                        START_OPCODE,
                                        LITERAL + 2,
                                        EEPROM_READ,
                                        LITERAL + 6,
                                        0,              /* THIS IS WHERE THE ADDRESS GOES */
                                        SET_DATA_IN_LOW,
                                        NOP,
                                        READ_DATA,
                                        SET_CS_0,
                                        SET_CS_0,
                                        SET_CLK_0,
                                        NO_TOG_CLK,
                                        DONE };

static unsigned short write_command[] = {
                                        SET_CLK_0,
                                        SET_CS_1,
                                        TOG_CLK,
                                        LITERAL + 1,
                                        START_OPCODE,
                                        LITERAL + 2,
                                        EEPROM_WRITE,
                                        LITERAL + 6,
                                        0,              /* THIS IS WHERE THE ADDRESS GOES */
                                        LITERAL + 16,
                                        0,              /* THIS IS WHERE THE DATA GOES    */
                                        SET_CS_0,
                                        SET_CS_0,
                                        SET_CS_1,
                                        /* WAIT_OUT_LOW,*/
                                        WAIT_OUT_HIGH,
                                        SET_CS_0,
                                        NO_TOG_CLK,
                                        DONE };

static unsigned short erase_command[] = {
                                        SET_CLK_0,
                                        SET_CS_1,
                                        TOG_CLK,
                                        LITERAL + 1,
                                        START_OPCODE,
                                        LITERAL + 2,
                                        EEPROM_ERASE,
                                        LITERAL + 6,
                                        0,              /* THIS IS WHERE THE ADDRESS GOES */
                                        SET_DATA_IN_LOW,
                                        NOP,
                                        NOP,
                                        SET_CS_0,
                                        SET_CS_0,
                                        SET_CS_1,
                                        /* WAIT_OUT_LOW,*/
                                        WAIT_OUT_HIGH,
                                        SET_CS_0,
                                        NO_TOG_CLK,
                                        DONE };

static unsigned short write_enable[] = {
                                        SET_CLK_0,
                                        SET_CS_1,
                                        TOG_CLK,
                                        LITERAL + 1,
                                        START_OPCODE,
```

Copyright 1989
Logic Modeling Systems

| SOURCE PROGRAM | DATE | PAGE # |
|---|---|---|
| os/eeprom.c | 5/23/89 | 2/9 |
| | TIME 4:42:11 pm | |

SOURCE TEXT

```
                                LITERAL + 2,
                                EEPROM_ALL,
                                LITERAL + 6,
                                EEPROM_EWEN,
                                SET_CS_0,
                                NOP,
                                NOP,
                                NOP,
                                NO_TOG_CLK,
                                DONE };

static unsigned short write_disable[] = {
                                SET_CLK_0,
                                SET_CS_1,
                                TOG_CLK,
                                LITERAL + 1,
                                START_OPCODE,
                                LITERAL + 2,
                                EEPROM_ALL,
                                LITERAL + 6,
                                EEPROM_EWDS,
                                SET_CS_0,
                                NOP,
                                NOP,
                                NOP,
                                NO_TOG_CLK,
                                DONE };

static unsigned short write_all_command[] = {
                                SET_CLK_0,
                                SET_CS_1,
                                TOG_CLK,
                                LITERAL + 1,
                                START_OPCODE,
                                LITERAL + 2,
                                EEPROM_ALL,
                                LITERAL + 6,
                                EEPROM_WRAL,
                                LITERAL + 16,
                                0,              /* THIS IS WHERE THE DATA GOES     */
                                SET_CS_0,
                                SET_CS_0,
                                SET_CS_1,
                                /*WAIT_OUT_LOW,*/
                                WAIT_OUT_HIGH,
                                SET_CS_0,
                                NO_TOG_CLK,
                                DONE };


static unsigned short erase_all_command[] = {
        SET_CLK_0,
        SET_CS_1,
        TOG_CLK,
        LITERAL + 1,
        START_OPCODE,
        LITERAL + 2,
        EEPROM_ALL,
        LITERAL + 6,
        EEPROM_ERAL,
        NOP,
        NOP,
        SET_CS_0,
        SET_CS_0,
        SET_CS_1,
        /* WAIT_OUT_LOW,*/
        WAIT_OUT_HIGH,
        SET_CS_0,
        NO_TOG_CLK,
        DONE
};

DAB_EEPROM dab_e2;
extern u_short lm_e2prom_access();
u_short access_eeprom();
u_short write_eeprom(), read_eeprom();
void disable_eeprom(), enable_eeprom(), erase_all_eprom();

static void
memory_copy(s1, s2, count)
register        u_long  *s1;
register        u_long  *s2;
register        short   count;
{
register short remain = count & 3;

        /*
        ** divide by 4,
        ** How many long moves we need to perform
        */
        count >>= 2;
        while(--count >= 0) {
                *s1++ = *s2++;
        }
        /*
        ** clean up, by moving remaining bytes
        */
        while(--remain >= 0) {
                *(u_char *)s1++ = *(u_char *)s2++;
        }
}

#ifdef DEBUG
static u_long error = 0;
main( )
{
        u_short eedata;

        u_char ee_number = 2;
        erase_command[ REG_ADDRESS ] = 0x22;
        write_command[ REG_DATA    ] = 0x44;
        write_command[ REG_ADDRESS ] = 0x22;
        printf("erase");
        (void) access_eeprom(ee_number, &erase_command[ 0 ], &eedata);
        printf("\nwrite");
        (void) access_eeprom(ee_number, &write_command[ 0 ], &eedata);
}
test_eeprom( ee_number )
u_long ee_number ;
{
```

Copyright 1989
Logic Modeling Systems

SOURCE PROGRAM os/eeprom.c | DATE 5/23/89 | TIME 4:42:11 pm | PAGE # 3/10

SOURCE TEXT

```
        printf("test_eeprom\n");
        if( lm_e2prom_access( (char *)&dab_e2, (u_long) 0, ee_number, (u_long )sizeof( dab_e2 ) , MEMORY_VALIDATE, &error) == FAILURE)
        {
                printf( "\n INVALID e2PROM ");
                if( lm_e2prom_access( (char *)&dab_e2, (u_long) 0, ee_number, (u_long )sizeof( dab_e2 ) , MEMORY_INIT, &error) == FAILURE)
                {
                        printf("\n ERROR INITIALIZING E2PROM");
                }
        }
        if( lm_e2prom_access( (char *)&dab_e2, (u_long) 0, ee_number, (u_long )sizeof( dab_e2 ) , MEMORY_VALIDATE, &error) == FAILURE)
        {
                printf("\n ERROR RE_validating E2PROM");
        }
        if( lm_e2prom_access( (char *)&dab_e2, (u_long) 0, ee_number, (u_long )sizeof( dab_e2 ) , MEMORY_READ, &error) == FAILURE)
        {
                printf(" ERROR READING");
        }
        /*
        if( lm_e2prom_access( (char *)&dab_e2, (u_long) 0, ee_number, (u_long )sizeof( dab_e2 ) , MEMORY_WRITE, &error) == FAILURE)
        {
                printf(" ERROR WRITING ");
        }
        */
        if( lm_e2prom_access( (char *)&dab_e2, (u_long) 0, ee_number, (u_long )sizeof( dab_e2 ) , MEMORY_VALIDATE, &error) == FAILURE)
        {
                printf("ERRORRRRRRRRRRRRRRRR\n");
        }
        printf("SUCCESSFULLY TESTED EEPROM");
}
#endif
void
enable_eeprom( ee_number )
u_char ee_number;
{
        u_short eedata;

        (void)access_eeprom(ee_number,&write_enable[ 0 ], &eedata);
}
void
erase_all_eeprom( ee_number )
u_char ee_number;
{
        u_short eedata;

        enable_eeprom( ee_number );
        (void)access_eeprom(ee_number,&erase_all_command[ 0 ], &eedata);
        disable_eeprom( ee_number );
}
void
disable_eeprom( ee_number )
u_char ee_number;
{
        u_short eedata;

        (void)access_eeprom(ee_number,&write_disable[ 0 ], &eedata);
}
u_short
write_eeprom( ee_number, address, data )
u_char ee_number;
u_char address;
u_short data;
{
        u_short w_cmd[ sizeof(write_command)],  e_cmd[ sizeof(erase_command)];
        u_short eedata;
        u_short status;

        (void)memory_copy( (u_long *)e_cmd, (u_long *)erase_command, (short )sizeof(erase_command));
        (void)memory_copy( (u_long *)w_cmd, (u_long *)write_command, (short )sizeof(write_command));
        e_cmd[ REG_ADDRESS ] = address;
        w_cmd[ REG_ADDRESS ] = address;
        w_cmd[ REG_DATA    ] = data;
        if(access_eeprom(ee_number,  &write_enable[ 0 ], &eedata)==FAILURE) return( FAILURE);
        if(access_eeprom(ee_number, &e_cmd[ 0 ], &eedata)==FAILURE) return( FAILURE);
        if(access_eeprom(ee_number, &w_cmd[ 0 ], &eedata)==FAILURE) return( FAILURE);
        if(access_eeprom(ee_number,&write_disable[ 0 ], &eedata)==FAILURE) return( FAILURE);
        if( read_eeprom( ee_number, address, &status ) != data)
        {
                if( debug_eeprom == 1)
                printf("\nerror reading ee_number %x address %x expected data %x", ee_number, address, data);
                return( FAILURE );
        }
        return( status );
}
u_short
read_eeprom(ee_number,  address, status )
u_short *status;
u_char ee_number;
u_char address;
{
u_short r_cmd[ sizeof(read_command)], eedata;


        memory_copy( (u_long *)r_cmd, (u_long *)read_command,
                (short )sizeof(read_command));
        r_cmd[ REG_ADDRESS ] = address;
        *status = access_eeprom(ee_number, &r_cmd[ 0 ], &eedata);
        return( eedata ).
}

#define ACCESS_TIMEOUT  1000

u_short
access_eeprom(ee_number, array, data)
u_char ee_number;
unsigned short array[];
register unsigned short *data;
{
        register PEL *pel_access_reg;
        register unsigned short *parray = &array[0];
        register unsigned char skip = FALSE;
        register unsigned char  count = 16, toggle = 0;
        register int timeout = 0;

        *data = 0;
        pel_access_reg = (PEL *)
                (pel_addr(((ee_number & 0x18) >> 3), (ee_number & 7)));
        /*
        ** if EEOUT is stuck low, return FAILURE.
        */
```

Copyright 1989
Logic Modeling Systems

| SOURCE PROGRAM | DATE 5/23/89 | PAGE # |
|---|---|---|
| os/eeprom.c | TIME 4:42:11 pm | 4/11 |

LINE # SOURCE TEXT

```
        if( read_out( pel_access_reg ) == 0)
        {
                printf("EEOUT is stuck low\n");
                return( FAILURE );
        }
        while (*parray != DONE)
        {
                if (timeout >= ACCESS_TIMEOUT) break;

                /*
                ** skip for diag dab
                ** otherwise, check active bit.
                */
                if(diag_dab == 0 &&  pel_access_reg->csr.bit.active == 0)
                {
                        set_cs( pel_access_reg, 0);
                        set_clk( pel_access_reg, 0);
                        write_data( pel_access_reg, 0);
                        return( FAILURE );
                }
                if( toggle )
                {
                        if( skip == FALSE )
                                set_clk( pel_access_reg, 0 );
                        skip = FALSE;
                }
                if( *parray & LITERAL  )
                {
                        if( *parray ^ LITERAL )
                        {
                                if( count != 0 )
                                {
                                        if(count > (*parray ^ LITERAL))
                                                count = *parray ^ LITERAL;
                                        count--;
                                        write_data(pel_access_reg,
                                                (*(parray + 1) >> count ) & 1);
                                }
                                else
                                {
                                        count = 16;
                                        parray++;
                                        parray++;
                                        skip = TRUE;
                                        continue;
                                }
                        }
                }
                else
                {
                        switch( *parray++ )
                        {
                        case SET_CLK_0:
                                set_clk( pel_access_reg, 0 );
                                break;
                        case SET_CLK_1:
                                set_clk( pel_access_reg, 1 );
                                break;
                        case TOG_CLK:
                                toggle = 1;
                                break;
                        case NO_TOG_CLK:
                                toggle = 0;
                                break;
                        case SET_CS_0:
                                set_cs( pel_access_reg, 0 );
                                break;
                        case SET_CS_1:
                                set_cs( pel_access_reg, 1 );
                                break;
                        case READ_DATA:
                                if( count-- )
                                {
                                        parray--;
                                        *data = (*data << 1)
                                                + read_out(pel_access_reg);
                                }
                                else
                                        count = 16;
                                break;
                        case WRITE_DATA:
                                if( count-- )
                                {
                                        parray--;
                                        write_data(pel_access_reg,
                                                *data & (1 << (count - 1)));
                                }
                                else
                                        count = 16;
                                break;
                        case WAIT_OUT_LOW:
                                if( read_out( pel_access_reg ) == 1) {
                                        ++timeout;
                                        parray--;
                                }
                                break;
                        case WAIT_OUT_HIGH:
                                if( read_out( pel_access_reg ) == 0) {
                                        ++timeout;
                                        parray--;
                                }
                                break;
                        case WAIT_IN_LOW:
                                if( read_in( pel_access_reg ) == 1) {
                                        ++timeout;
                                        parray--;
                                }
                                break;
                        case WAIT_IN_HIGH:
                                if( read_in( pel_access_reg ) == 0) {
                                        ++timeout;
                                        parray--,
                                }
                                break;
                        case SET_DATA_IN_LOW:
                                write_data(pel_access_reg,  0 ).
                                skip = TRUE;
                                continue;

                        case NOP:
```

Copyright 1989
Logic Modeling Systems

| SOURCE PROGRAM | DATE | PAGE # |
|---|---|---|
| os/eeprom.c | 5/23/89 | 5/12 |
| | TIME 4:42:11 pm | |

LINE # SOURCE TEXT

```
                                break;
                        }
                }
                if( toggle )
                {
                        set_clk(pel_access_reg,  1 );
                }
        }
        return (timeout < ACCESS_TIMEOUT)? SUCCESS: FAILURE;
}

set_clk( pel_access_reg, i )
PEL *pel_access_reg;
u_char i;
{
#ifdef DEBUG
        printf("\nCLK=%d",i);
#else
#ifdef HOST
        if( i )
            write_loc_short(&pel_access_reg->csr.bit, read_loc_short( &pel_access_reg->csr.bit ) | 0x40);
        else
            write_loc_short(&pel_access_reg->csr.bit, read_loc_short( &pel_access_reg->csr.bit ) & 0xbf);
#else
        pel_access_reg ->csr.bit.eeprom_clk = i;
#endif
#endif
}
set_cs( pel_access_reg, i )
PEL *pel_access_reg;
u_char i;
{
#ifdef DEBUG
        printf("\nCS=%d",i);
#else
#ifdef HOST
        if( i )
            write_loc_short(&pel_access_reg->csr.bit, read_loc_short( &pel_access_reg->csr.bit ) | 0x80);
        else
            write_loc_short(&pel_access_reg->csr.bit, read_loc_short( &pel_access_reg->csr.bit ) & 0x7f);
#else
        pel_access_reg -> csr.bit.eeprom_sel = i;
#endif
#endif
}
read_out( pel_access_reg )
PEL *pel_access_reg;
{
#ifdef DEBUG
        printf("\nRead out");
        if(getchar() == '1')
        {
                return( 1 );
        }
        return 0;
#else
#ifdef HOST
        if(read_loc_short( &pel_access_reg->csr.bit) & 0x100)
#else
        if(pel_access_reg -> csr.bit.eeprom_out == 1)
#endif
        {
                return( 1 );
        }
        return 0;
#endif
}
read_in( pel_access_reg )
PEL *pel_access_reg;
{
#ifdef DEBUG
        printf("\nRead in");
        if(getchar() == '1')
        {
                return( 1 );
        }
        return 0;
#else
#ifdef HOST
        if(read_loc_short( &pel_access_reg->csr.bit) & 0x20 )
#else
        if(pel_access_reg -> csr.bit.eeprom_in == 1)
#endif
        {
                return( 1 );
        }
        return 0;
#endif
}
write_data(pel_access_reg,  i )
PEL *pel_access_reg;
unsigned char i;
{
#ifdef DEBUG
        printf("\nwrite data %x",i);
#else
#ifdef HOST
        if( i )
            write_loc_short(&pel_access_reg->csr.bit, read_loc_short( &pel_access_reg->csr.bit ) | 0x20);
        else
            write_loc_short(&pel_access_reg->csr.bit, read_loc_short( &pel_access_reg->csr.bit ) & 0xdf);
#else
        pel_access_reg -> csr.bit.eeprom_in = i;
#endif
#endif
}
```

Copyright 1989
Logic Modeling Systems

| SOURCE PROGRAM | DATE | TIME | PAGE # |
|---|---|---|---|
| os/fifo.c | 5/23/89 | 4:42:11 pm | 1/13 |

LINE # SOURCE TEXT

```
/* SCCS_ID: fifo.c rev 3.1, 4/24/89 at 07:46:42      */

/*
** fifo.c
** fifo handling for CPU board.
*/
#include "common.h"
#include "fifo.h"
#include "cpu.h"
/*
** The event flag
*/
unsigned int event_flag;
unsigned int fifo_group;
/*
** fifos for the whole system
*/
struct fifo_type fifo[ MAX_FIFOS + 1 ];

/*
** semaphores, and their IDs
*/
unsigned int fifo_0_id;
unsigned int semaphore_id[ MAX_FIFOS + 1 ];
unsigned int semaphore_count[ MAX_FIFOS + 1 ];
/*
** headers for each fifo entry.
*/
struct fifo_header_type fifo_header[ MAX_FIFO_ENTRIES ];

/*
** Initialize fifo's and the headers.
*/
fifo_initialize()
{
        register int i;
        unsigned int err;
        register struct fifo_header_type *pfifo_header = &fifo_header[ 0 ];
        /*
        ** set the fifo data structure to zero.
        */
        event_flag = 0;
        bzero(fifo,  sizeof(fifo));
        bzero(fifo_header, sizeof( fifo_header ));
        /*
        ** The headers organized in a queue, and associated with fifo 0
        */
        for( i = 0; i != MAX_FIFO_ENTRIES-1; i++, pfifo_header++ )
                pfifo_header->next = pfifo_header + 1;

        fifo[ HEADER_FIFO ].count = MAX_FIFO_ENTRIES;
        fifo[ HEADER_FIFO ].head  = &fifo_header[ 0 ];
        fifo[ HEADER_FIFO ].tail  = &fifo_header[ MAX_FIFO_ENTRIES - 1];

        /*
        ** create semaphore 1 per fifo
        */
        for( i = 0; i <= MAX_FIFOS; i++)
        {
                semaphore_id[ i ] = sc_screate ( 0, 1, &err );
                semaphore_count[ i ] = 0;
                if( err )
                {
                        sys_out( "error creating SEMAPHORE\n");
                        return( FAILURE );
                }
        }
        /*
        ** This avaids access to the array semaphore_id
        ** allocation of ID should be linear
        */
        fifo_0_id = semaphore_id[ 0 ];
        return( SUCCESS );
}

/*
** place a data_buffer in a fifo[pfifo_entry->fifo_number]
*/
fifo_put( pfifo_entry ).
register struct fifo_entry *pfifo_entry;
{
register struct fifo_header_type *pfifo_header;
register struct fifo_type *pfifo;
register char fifo_no = pfifo_entry -> fifo_no;
register unsigned int *fifo_count = &semaphore_count[ fifo_no ];
int err = 0;
        /*
        ** do a sanity check
        */
        if( fifo_no > MAX_FIFOS ) return ( FAILURE );
        /*
        ** grab a header
        */
        /*
        ** speed up access to fifo
        */
        pfifo = &fifo[ HEADER_FIFO ];
        /*
        ** disable interrupts
        */
        CPU_DISABLE_INTERRUPTS;
        /*
        ** are there any header buffers, for the ISR
        */
        if( pfifo_entry -> task == ISR_TASK )
        {
                if(!pfifo->count)
                {
                        CPU_ENABLE_INTERRUPTS;
                        return( FAILURE ).
                }
        }
        else
        {
                /*
                ** are there eny header buffers, for the TASK
                */
                while( pfifo->count < MIN_TASK_ENTRIES )
                {
                        event_flag |= ((unsigned int) 1 << HEADER_FIFO);
```

Copyright 1989
Logic Modeling Systems

| SOURCE PROGRAM | DATE | PAGE # |
|---|---|---|
| os/fifo.c | 5/23/89 TIME 4:42:11 pm | 2/14 |

SOURCE TEXT

```
                        CPU_ENABLE_INTERRUPTS;
                        sc_spend( semaphore_id[ HEADER_FIFO ], 0, &err );
                        if( err ) return( FAILURE );
                        CPU_DISABLE_INTERRUPTS;
                }
        }
        /*
        ** get pointer to first entry
        */
        pfifo_header = pfifo->head;
        /*
        ** having retrieved, update posters and count
        */
        if(--pfifo->count)
                pfifo->head = pfifo_header -> next;
        else
                pfifo->head = pfifo->tail = 0;
        /*
        ** point to appropriate fifo
        */
        pfifo = &fifo[ fifo_no ];
        /*
        ** set up the header
        */
        pfifo_header -> user = pfifo_entry -> user;
        pfifo_header -> next = 0;
        pfifo_header -> data = pfifo_entry -> data;
        pfifo_header -> task = pfifo_entry -> task;
        /*
        ** add to the appropriate queue
        */
        if( pfifo->count )
                pfifo->tail-> next = pfifo_header;
        else
                pfifo->head = pfifo_header;

        pfifo->tail = pfifo_header;

        pfifo->count++;

        if( *fifo_count  )
        {
                /* semaphore_count[ fifo_no ]--;  */
                (*fifo_count)--;
                /* system_call = 1; */
                CPU_ENABLE_INTERRUPTS;
                /*
                ** should we try and wakeup someone
                ** to avoid an array access -> sc_spost(semaphore_id[ fifo_no ], &err);
                ** use fifo_0_id.
                */
                sc_spost(fifo_0_id +  fifo_no , &err );

                if( err )
                        return( FAILURE );
        }
        CPU_ENABLE_INTERRUPTS;
        return( SUCCESS );
}

/*
** get a fifo entry
*/
fifo_get( pfifo_entry )
struct fifo_entry *pfifo_entry;
{
register struct fifo_header_type *pfifol;
register struct fifo_type *pfifo;
register char fifo_no = pfifo_entry -> fifo_no;
int err = 0;
int event = 0;

        if( fifo_no > MAX_FIFOS ) return( FAILURE );
        /*
        ** set up pointer to appropriate fifo
        */
        pfifo = &fifo[ fifo_no ];
        /*
        ** disable interrupts
        */
        CPU_DISABLE_INTERRUPTS;
        /*
        ** while no entries stick around
        */
        while( !pfifo->count )
        {
                semaphore_count[ fifo_no ]++;
                CPU_ENABLE_INTERRUPTS;
                /*
                ** To avoid an array access, use fifo_0_id
                */
                sc_spend( fifo_0_id +  fifo_no , 0, &err );
                if( err ) return( FAILURE );
                CPU_DISABLE_INTERRUPTS;
        }
        /*
        ** get an entry
        */
        pfifol = pfifo -> head;
        /*
        ** adjust pointers
        */
        pfifo -> head = pfifo -> head -> next;
        /*
        ** if no entry? tail = head = 0
        */
        if(!( --pfifo -> count ))
                pfifo -> tail = 0;
        /*
        ** prepare return data struct
        */
        pfifo_entry->data = pfifol -> data;
        pfifo_entry->user = pfifol -> user;
        pfifo_entry->task = pfifol -> task;
        /*
        ** return header to free queue
        */
        pfifo = &fifo[ HEADER_FIFO ];
        /*
        ** adjust pointers and check
```

Copyright 1989 Logic Modeling Systems

| SOURCE PROGRAM | DATE | 5/23/89 | PAGE # |
|---|---|---|---|
| os/fifo.c | TIME | 4:42:11 pm | 3/15 |

LINE # SOURCE TEXT

```
        ** if any one waiting for this
        */
        if( pfifo->count )
                'ifo->tail-> next = pfifol;
        else
                pfifo->head = pfifol;

        /*
        ** the tail points to the new entry
        */
        pfifo->tail = pfifol;
        /*
        ** update count
        */
        pfifo->count++;
        /*
        ** is any one waiting for a header
        */
        if( event_flag & ( 1 << HEADER_FIFO))
                event = 1;
        /*
        ** enable interrupts
        */
        CPU_ENABLE_INTERRUPTS;
        /*
        ** post event to a flag
        */
        if( event )
        {
                sc_spost( semaphore_id[ HEADER_FIFO ], &err);
        }

        /*
        ** done
        */
        if( err )
                return( FAILURE );
        return( SUCCESS );
}

/*
** return number of elements in a fifo
*/
fifo_inquiry( pfifo_entry )
struct fifo_entry *pfifo_entry;
{
register struct fifo_type *pfifo;
register char fifo_no = pfifo_entry -> fifo_no;

        if( fifo_no > MAX_FIFOS ) return(0);
        /*
        ** set up pointer to appropriate fifo
        */
        pfifo = &fifo[ fifo_no ];

        return pfifo->count;
}
```

Copyright 1989
Logic Modeling Systems

| SOURCE PROGRAM | DATE 5/23/89 | PAGE # |
|---|---|---|
| os/id.c | TIME 4:42:12 pm | 1/16 |

LINE # SOURCE TEXT

```
/* SCCS_ID: id.c rev 3.1, 4/24/89 at 07:46:44     */

#include "common.h"
#include "lm_diags.h"
#include "lm_sfi.h"
#include "id.h"

/*
 * Compute and verify checksum on ID PROM
 *
 * Pass pointer to first byte in ID PROM.
 * Subsequent ID_NUM_BYTES-1 bytes are 4 bytes apart.
 * Algorithm:
 *      initialize checksum to an arbitrary (but well-known) value
 *      for each byte (including checksum)
 *          circular left shift left checksum
 *          add data byte
 *          mask checksum to 8 bits
 * Returns computed checksum.
 */
int
id_check(address)
u_char *address;
{
    register int checksum;
    register u_long byte_count;

    checksum= ID_CHECKSUM_INIT;

    for (byte_count= 0; byte_count < ID_NUM_BYTES; byte_count++)
    {
        checksum= (checksum << 1) + ((checksum & 0x80) >> 7);
        checksum+= *(address + 4 * byte_count);
        checksum&= 0xFF;
    }
    return(checksum);
}

/*
 * Load an ID PROM into a character buffer
 *
 * address is the physical byte address of the first byte in the ID PROM.
 * buffer is the byte address of the first byte in a ID_NUM_BYTES buffer.
 * In practice, buffer is really an appropriate ID_PROM_XXX structure, and
 * a pointer to it is passed, cast to (u_char *).
 */
void
id_load(address, buffer)
u_char *address;
u_char *buffer;
{
    register int byte_count;
    for (byte_count= 0; byte_count < ID_NUM_BYTES; byte_count++)
    {
        *buffer= *address;
        buffer++;
        address+= 4;
    }
}
```

Copyright 1989
Logic Modeling Systems

SOURCE PROGRAM os/lance.c

DATE 5/23/89 TIME 4:42:12 pm

PAGE # 1/17

LINE # SOURCE TEXT

```c
/* SCCS_ID: lance.c rev 3.2, 4/25/89 at 16:44:16      */

#include "common.h"
#include "cpu.h"
#include "vrtx.h"
#include "lance.h"
#include "id.h"
#include "network.h"
#include "mod_err.h"
#include "nvram.h"
#include "lm_rd_wr.h"
#include "arp.h"

#define SECOND          200
#define TIMEOUT          33

#define MAX_LANCE_ENABLE_POLLS          30
#define MAX_INITIALIZED_DONE_POLLS      5
/*
 * Memory for the LANCE initialization block.
 * init_block_mem[] must be word aligned.
 */
char    init_block_mem[sizeof(INIT_BLOCK)];

u_long system_call;
u_long rcv_lance_pkt_semaphore;

static  u_long alive_inet;

u_char accept_arp_reply = 0;

u_long modeler_inet;
u_long modeler_inet_address ;

#ifdef  BROKEN_HARDWARE
char reinitialize_lance = 0;
#endif  BROKEN_HARDWARE
extern BOOT_STRUCT boot;
/*
 * Required variable to allow the Lance diagnostics to use sendto()
 * with small (runt) packets.
 */
u_short allow_runt_packets = FALSE;

/*
 * Structure definition and allocation of permanent memory
 * for the desired number of receive buffers.
 */
typedef struct  {
        char    buf[MAX_RECEIVE_BUFFER_SIZE];
} RECV_BUF;

static  RECV_BUF        lm_receive_buffers[MAX_RECEIVE_BUFFERS + MAX_USERS];

static  RECV_BUF        *p_lm_rcv_buffers_extra[ MAX_USERS ];
static  RECV_MDE        extra_rcv_desc_buffers[ MAX_USERS ];

static  unsigned char extra_rcv_desc_count = 0;
static  unsigned char in_extra_rcv_desc_ptr = 0;
static  unsigned char out_extra_rcv_desc_ptr = 0;

static  char too_many_buffers = 0;
static  char available_extra_buffer = (MAX_USERS -1);

/*
 * Note that the following character array space is 8 bytes larger than
 * what is really required in order to get space that is aligned on a
 * quadword (8 byte) boundary.  The stupid SUN assembler has no means for
 * allowing me to specify this directly.
 *
 * Also note that each entry mapped into the table must start on a
 * quadword (8 byte) boundary.  This automatically happens because of
 * the sizeof(*_MDE) being equal to 8 bytes.
 */
static  char    recv_desc_ring_memory[8 + MAX_RECEIVE_BUFFERS * sizeof(RECV_MDE)];
static  char    trans_desc_ring_memory[8 + MAX_TRANSMIT_BUFFERS * sizeof(TRANS_MDE)];

/*
 * Macro for returning a pointer value that is aligned on a quad-word boundary.
 */
#define QUAD_WORD_ALIGN(X)      ( 8 * (((u_long) (X) + 8) / 8) )

/*
 * Pointers to keep track of our notion of the beginning, current and end
 * of the receive and transmit descriptor message rings.  These pointers
 * are given values when the receive and transmit rings are initialized.
 */
static  RECV_MDE        *minimum_receive_pointer;
static  RECV_MDE        *current_receive_pointer;
static  RECV_MDE        *maximum_receive_pointer;
static  TRANS_MDE       *minimum_transmit_pointer;
static  TRANS_MDE       *current_transmit_pointer;
static  TRANS_MDE       *maximum_transmit_pointer;

static  TRANS_MDE       *lance_sent_packet;

extern  u_short initialize_lance();
extern  u_short set_up_control_and_status_registers();

extern  void    set_up_extra_buffers();
extern  void    memory_align_ring_descriptors();
extern  void    initialize_transmit_buffers();
extern  void    initialize_receive_buffers();
extern  void    output_routine();
extern  void    set_up_initialization_block();
static  void    memory_copy();
extern  void    lance_isr_receive();

extern  u_short lance_receive();
extern  u_short lance_transmit();
extern  u_short process_transmit_interrupt();
extern  u_short process_receive_interrupt();

int lm_intr_requested; /* global interrupt advisory flag */

/*
 *  Properly reset the LANCE using the CPU control register bit.
 *  Leaves it reset, or may be followed by turning off the lance reset
 *  to provide a reset_lance() function.
 */
```

Copyright 1989 Logic Modeling Systems

| SOURCE PROGRAM | DATE | PAGE # |
| --- | --- | --- |
| os/lance.c | 5/23/89 | 2/18 |
| | TIME 4:42:12 pm | |

SOURCE TEXT

```
void
shutdown_lance()
{
    register cpu_control_reg_struct *control_reg;
    register u_long delay_count;

    /*
     * The LANCE may very well be doing something.  In that event, we
     * don't want to risk confusing its requester and possibly the CPU
     * arbiter, so we let it complete.  In order to guarantee that it
     * doesn't start any master cycles, turn off the lance enable bit.
     * Then delay a generous amount of time to allow for a worst-case
     * burst.  These nominally require 6-8us, so we'll allow 50us.  After
     * all, we're not in THAT much of a hurry here.  Then pound on the
     * reset bit and hold it. Though the Am7990 specs just 2 clock cycles
     * minimum low time (i.e. 200ns), we drive it for a more comfortable
     * 5us.  No real good reason.
     */
    control_reg = (cpu_control_reg_struct *) CPU_CONTROL_REG;
    control_reg->lance_enable = 0;
    delay_microseconds(delay_count, 50);
    control_reg->not_lance_reset = 0;
    delay_microseconds(delay_count, 5);

    /*
     *  Runt packets are used only in diagnostics for loopback tests.
     *  We shut off this flag here just in case it got set spuriously.
     */
    allow_runt_packets= FALSE;
}


/*
 *  Shutdown the LANCE, then allow it to come out of reset.
 */
void
shutdown_and_reset_lance()
{
    register cpu_control_reg_struct *control_reg;

    control_reg = (cpu_control_reg_struct *) CPU_CONTROL_REG;

    shutdown_lance();

    control_reg->not_lance_reset = 1;
}


u_short
get_lance_ready_to_go()
{
        RECV_MDE        *recv_ring;
        TRANS_MDE       *trans_ring;

        lm_intr_requested = 0;

        shutdown_and_reset_lance();

        set_up_extra_buffers();

        memory_align_ring_descriptors(&recv_ring, &trans_ring);

        initialize_transmit_buffers(trans_ring);

        initialize_receive_buffers(recv_ring);

        if (initialize_lance(recv_ring, trans_ring) == FAILURE)
                return(FAILURE);

        return(SUCCESS);
}


void
set_up_extra_buffers()
{
        register i;

        for( i=0; i < MAX_USERS; i++ ) {
                p_lm_rcv_buffers_extra[ i ] = &lm_receive_buffers[ i + MAX_RECEIVE_BUFFERS ];
        }
}


u_short
start_lance()
{
        u_short value;
        register        u_short i;


        /*
         * Tell the LANCE to initialize itself.
         */
        if (write_lance_csr(SELECT_CSR0, INITIALIZE_START) == FAILURE)
                return(FAILURE);

         /*
         * We must wait for the LANCE to finish its
         * initialization before we continue processing.
         */
        for (i=0; i<MAX_INITIALIZED_DONE_POLLS; ++i) {
                lm_delay(3);

                if (read_lance_csr(SELECT_CSR0, &value) == FAILURE)
                        return(FAILURE);

                if ((value & INITIALIZE_DONE) == INITIALIZE_DONE)
                        break;
        }

        /*
         * If the LANCE still hasn't initialized itself, give up.
         */
        if ((value & INITIALIZE_DONE) != INITIALIZE_DONE)
                return(FAILURE);

        /*
         * Let's get the show on the road.
         */
```

Copyright 1989
Logic Modeling Systems

| SOURCE PROGRAM | DATE | 5/23/89 | PAGE # |
|---|---|---|---|
| os/lance.c | TIME | 4:42:12 pm | 3/19 |

LINE # SOURCE TEXT

```
        if (write_lance_csr(SELECT_CSR0, START_ACTIVITY) == FAILURE)
                return(FAILURE);

        /*
         * Things appear to work better (at all?) if we wait a little bit here.
         */
        lm_delay(10);

        /*
         * Enable LANCE interrupts.
         */
        if (write_lance_csr(SELECT_CSR0, INTERRUPT_ENABLE) == FAILURE)
                return(FAILURE);
        /*
         * Things appear to work better (at all?) if we wait a little bit here.
         */
        lm_delay(10);

        return(SUCCESS);
}

/*
 *  The following function is used by the CPU diagnostics to have the
 *  LANCE read the initialization block but not start activity.  It must
 *  not use any VRTX calls, e.g. lm_delay().
 */
u_short
start_lance_initialize_only()
{
        u_short i;
        u_short value;
        register u_long bogus;

    /*
     * Tell the LANCE to initialize itself.
     */
    if (write_lance_csr(SELECT_CSR0, (u_short)INITIALIZE_START) == FAILURE)
        return (FAILURE);

    /*
     * We must wait for the LANCE to finish its initialization before we
     * continue processing.
     */
    for (i = 0; i < MAX_INITIALIZED_DONE_POLLS; ++i)
    {
        delay_milliseconds(bogus, 3);

        if (read_lance_csr(SELECT_CSR0, &value) == FAILURE)
            return (FAILURE);

        if ((value & INITIALIZE_DONE) == INITIALIZE_DONE)
            break;
    }

    /*
     * If the LANCE still hasn't initialised itself, give up.
     */
    if ((value & INITIALIZE_DONE) != INITIALIZE_DONE)
        return (FAILURE);

    return(SUCCESS);
}


static  void
memory_align_ring_descriptors(recv, trans)
register        RECV_MDE        **recv;
register        TRANS_MDE       **trans;
{
        /*
         * Quad-word align the transmit and receive message descriptor rings.
         * This is a LANCE requirement that the SUN assembler can not provide.
         */
        if ((u_long) trans_desc_ring_memory & 8 == 0)
                *trans = (TRANS_MDE *) trans_desc_ring_memory;
        else *trans = (TRANS_MDE *) QUAD_WORD_ALIGN(trans_desc_ring_memory);

        if ((u_long) recv_desc_ring_memory & 8 == 0)
                *recv = (RECV_MDE *) recv_desc_ring_memory;
        else *recv = (RECV_MDE *) QUAD_WORD_ALIGN(recv_desc_ring_memory);
}


void
initialize_transmit_buffers(trans)
register        TRANS_MDE       *trans;
{
        register        u_short i;


        /*
         * Set an unchanging pointer to the beginning of the transmit
         * message descriptor ring so that we know were to wrap around
         * to as more and more messages are sent (see lance_transmit()).
         */
        minimum_transmit_pointer = trans;

        /*
         * Set our, as opposed to the LANCE's, notion of what the current
         * transmit message descriptor is.
         */
        current_transmit_pointer = trans;
        lance_sent_packet = trans;

        for(i=0; i<MAX_TRANSMIT_BUFFERS; ++i) {
                /* No other fields in the transmit message descriptor   */
                /* need be initialized at this time.  They are all set  */
                /* when the to be transmitted packet buffer is set up.  */

                trans->must_be_ones = 0xF;
                trans->own_buffer = HOST_BUFFER_OWNERSHIP;

                ++trans; /* advance to the next transmit descriptor. */
        }

        /*
         * Set an unchanging pointer to the end of the transmit
         * message descriptor ring so that we know when to wrap around
         * as more and more messages are sent (see lance_transmit()).
         */
```

Copyright 1989
Logic Modeling Systems

| SOURCE PROGRAM | DATE | PAGE # |
|---|---|---|
| os/lance.c | 5/23/89 | 4/20 |
| | TIME 4:42:12 pm | |

SOURCE TEXT

```
        maximum_transmit_pointer = trans;
}


void
initialize_receive_buffers(recv)
register        RECV_MDE        *recv;
{
        register        u_short i;


        /*
         * Set an unchanging pointer to the beginning of the receive
         * message descriptor ring so that we know were to wrap around
         * to as more and more messages are received (see lance_receive()).
         */
        minimum_receive_pointer = recv;

        /*
         * Set our, as opposed to the LANCE's, notion of what the current
         * receive message descriptor is.
         */
        current_receive_pointer = recv;

        for(i=0; i<MAX_RECEIVE_BUFFERS; ++i) {
                /* Set receive message descriptor 0 */
                recv->low_buffer_address = (u_short) &lm_receive_buffers[i];

                /* Set receive message descriptor 1 */
                recv->own_buffer = LANCE_BUFFER_OWNERSHIP;
                recv->error_summary = 0;
                recv->framing_error = 0;
                recv->overflow_error = 0;
                recv->crc_error = 0;
                recv->buffer_error = 0;
                recv->start_of_packet = 0;
                recv->end_of_packet = 0;
                recv->high_buffer_address = (unsigned) &lm_receive_buffers[i] >> 16;

                /* Set receive message descriptor 2 */
                recv->must_be_ones = 0xF;
                recv->buffer_byte_count = MAX_RECEIVE_BUFFER_SIZE;

                /* Set receive message descriptor 3 */
                recv->must_be_zeros = 0;
                recv->message_byte_count = 0;

                ++recv; /* advance to the next receive descriptor. */
        }

        /*
         * Set an unchanging pointer to the end of the receive
         * message descriptor ring so that we know when to wrap around
         * as more and more messages are received (see lance_receive()).
         */
        maximum_receive_pointer = recv;
}


u_short
initialize_lance(recv, trans)
register        RECV_MDE        *recv;
register        TRANS_MDE       *trans;
{
        if (set_up_control_and_status_registers() == FAILURE)
                return(FAILURE);

        set_up_initialization_block(recv, trans);

        return(SUCCESS);
}


static  u_short
set_up_control_and_status_registers()
{
        /*
         * The LANCE requires that the STOP bit of CSR0 be set
         * before accessing CSR1, CSR2, or CSR3.
         */
        if (write_lance_csr(SELECT_CSR0, STOP_ACTIVITY) == FAILURE)
                return(FAILURE);

        /*
         * The CPU requires that byte control and swap be set.
         */
        if (write_lance_csr(SELECT_CSR3, BYTE_CONTROL|BYTE_SWAP) == FAILURE)
                return(FAILURE);

        /*
         * Load in the address of the initialization block.
         */
        if (write_lance_csr(SELECT_CSR2, (u_short) (0xFF & ((u_long) init_block_mem >> 16))) == FAILURE)
                return(FAILURE);
        if (write_lance_csr(SELECT_CSR1, (u_short) (0xFFFF & (u_long) init_block_mem)) == FAILURE)
                return(FAILURE);

        return(SUCCESS);
}


static  void
set_up_initialization_block(recv, trans)
register        RECV_MDE        *recv;
register        TRANS_MDE       *trans;
{
        register        u_char  *enet_address;
        register        INIT_BLOCK      *init_block;

        extern  ID_PROM_CPU     id_prom;



        init_block = (INIT_BLOCK *) init_block_mem;

        /* Set up the correct operational modes */
        init_block->promiscuous = 0;
        init_block->reserved_1 = 0;
        init_block->internal_loopback = 0;
        init_block->disable_retry = 0;
```

Copyright 1989 Logic Modeling Systems

| SOURCE PROGRAM | DATE | PAGE # |
|---|---|---|
| os/lance.c | 5/23/89 | 5/21 |
| | TIME 4:42:12 pm | |

LINE # SOURCE TEXT

```
        init_block->force_collision = 0;
        init_block->disable_crc_transmit = 0;
        init_block->loopback = 0;
        init_block->disable_transmit = 0;
        init_block->disable_receive = 0;

        /* Set up the 48-bits for the physical Ethernet address */
        /* Note the byte swapping (see lance.h for details)     */
        enet_address = (u_char *) id_prom.ethernet;
        init_block->physical_address_1 = *enet_address++;
        init_block->physical_address_2 = *enet_address++;
        init_block->physical_address_3 = *enet_address++;
        init_block->physical_address_4 = *enet_address++;
        init_block->physical_address_5 = *enet_address++;
        init_block->physical_address_6 = *enet_address++;

        /* Set up the logical address filter */
        /* Must always be zero (0) as we don't implement multi-casting */
        init_block->logical_address_1 = 0;
        init_block->logical_address_2 = 0;

        /* Set up the receive descriptor ring pointer */
        init_block->low_receive_ring_address = (u_short) recv;
        init_block->high_receive_ring_address = (unsigned) recv >> 16;
        init_block->receive_ring_length = POWER_OF_2_MAX_RECEIVE_BUFFERS;
        init_block->reserved_2 = 0;

        /* Set up the transmit descriptor ring pointer */
        init_block->low_transmit_ring_address = (u_short) trans;
        init_block->high_transmit_ring_address = (unsigned) trans >> 16;
        init_block->transmit_ring_length = POWER_OF_2_MAX_TRANSMIT_BUFFERS;
        init_block->reserved_3 = 0;
}

/*
** This is the fast access method to r/w CSR0
** The interrupt routine calls this to speed up access to the lance
** it reads CSR0 then clears set bits and enables INTS
** from Lance.
*/
u_short
isr_read_write_lance_csr( value )
register        u_short *value;
{
        register        u_short i;
        register        u_short *lance_data_register;
        register        u_short *lance_address_register;

        register cpu_control_reg_struct *cpu_control_register= (cpu_control_reg_struct *) CPU_CONTROL_REG;


        /*
         * Initialize our local register variables.
         */
        lance_data_register = (u_short *) CPU_LANCE_DATA_REG;
        lance_address_register = (u_short *) CPU_LANCE_ADDR_REG;

        /*
         * Don't change this code unless you carefully examine the assembler
         * that is produced to ensure that the code will properly handle
         * the hardware idiosyncrasies of the LANCE.  Talk with Mark if
         * you have any questions regarding the LANCE's functionality.
         */

        i = MAX_LANCE_ENABLE_POLLS;
        cpu_control_register->lance_enable = 0;
        while (cpu_control_register->lance_busy == 1) {
                if (!--i) {
                        cpu_control_register->lance_enable = 1; /* Why? */
                        return(FAILURE);
                }
        }

        *lance_address_register = SELECT_CSR0;
        *value = *lance_data_register;

        *lance_data_register = *value | INTERRUPT_ENABLE;
        cpu_control_register->lance_enable = 1;

        return(SUCCESS);
}


u_short
write_lance_csr(which_csr, value)
register        u_short which_csr;
register        u_short value;
{
        register        u_short i;
        register        u_short *lance_data_register;
        register        u_short *lance_address_register;
        register        u_short interrupts_were_enabled;

        register cpu_control_reg_struct *cpu_control_register= (cpu_control_reg_struct *) CPU_CONTROL_REG;


        /*
         * Initialize our local register variables.
         */
        lance_data_register = (u_short *) CPU_LANCE_DATA_REG;
        lance_address_register = (u_short *) CPU_LANCE_ADDR_REG;

        /*
         * Don't change this code unless you carefully examine the assembler
         * that is produced to ensure that the code will properly handle
         * the hardware idiosyncrasies of the LANCE.  Talk with Mark if
         * you have any questions regarding the LANCE's functionality.
         */

        /*
         * MUST disable interrupts during this time as the data that
         * gets written depends upon which data port is selected by
         * the CPU_LANCE_ADDR_REG, among other things.
         */
        interrupts_were_enabled = cpu_control_register->global_intr_ena;
        CPU_DISABLE_INTERRUPTS;

        /*
         * Inhibit the LANCE from doing anything while we get at its CSR.
         *
```

Copyright 1989
Logic Modeling Systems

SOURCE PROGRAM
os/lance.c

DATE 5/23/89
TIME 4:42:12 pm
PAGE # 6/22

LINE # SOURCE TEXT

```
         * Then test several times for the LANCE being busy.  When its
         * free, look at the value in the LANCE's data register.
         * The address port must be written before the data port.
         * Note that we reset the LANCE's address port to reference
         * CSR0.  See the comment above for this "feature's" motivation.
         *
         * Enable the LANCE after we're done accessing it's CSR.
         */

        i = MAX_LANCE_ENABLE_POLLS;
        cpu_control_register->lance_enable = 0;
        while (cpu_control_register->lance_busy == 1 ) {
                if (!--i) {
                        cpu_control_register->lance_enable = 1; /* Why? */
                        return(FAILURE);
                }
        }

        *lance_address_register = which_csr;
        *lance_data_register = value;
        cpu_control_register->lance_enable = 1;

        /*
         * Turn interrupts back on, only if they were enabled before.
         */
        if (interrupts_were_enabled)
            CPU_ENABLE_INTERRUPTS;

        return(SUCCESS);
}


u_short
read_lance_csr(which_csr, value)
register        u_short which_csr;
register        u_short *value;
{
        register        u_short i;
        register        u_short *lance_data_register;
        register        u_short *lance_address_register;
        register        u_short interrupts_were_enabled;

        register cpu_control_reg_struct *cpu_control_register= (cpu_control_reg_struct *) CPU_CONTROL_REG;


        /*
         * Initialize our local register variables.
         */
        lance_data_register = (u_short *) CPU_LANCE_DATA_REG;
        lance_address_register = (u_short *) CPU_LANCE_ADDR_REG;

        /*
         * Don't change this code unless you carefully examine the assembler
         * that is produced to ensure that the code will properly handle
         * the hardware idiosyncrasies of the LANCE.  Talk with Mark if
         * you have any questions regarding the LANCE's functionality.
         */

        /*
         * MUST disable interrupts during this time as the data that
         * gets written depends upon which data port is selected by
         * the CPU_LANCE_ADDR_REG, among other things.
         */
        interrupts_were_enabled = cpu_control_register->global_intr_ena;
        CPU_DISABLE_INTERRUPTS;

        /*
         * Inhibit the LANCE from doing anything while we get at its CSR.
         *
         * Then test several times for the LANCE being busy.  When its
         * free, look at the value in the LANCE's data register.
         * The address port must be written before the data port.
         * Note that we reset the LANCE's address port to reference
         * CSR0.  See the comment above for this "feature's" motivation.
         *
         * Enable the LANCE after we're done accessing it's CSR.
         */

        i = MAX_LANCE_ENABLE_POLLS;
        cpu_control_register->lance_enable = 0;
        while (cpu_control_register->lance_busy == 1) {
                if (!--i) {
                        cpu_control_register->lance_enable = 1; /* Why? */
                        return(FAILURE);
                }
        }

        *lance_address_register = which_csr;
        *value = *lance_data_register;
        cpu_control_register->lance_enable = 1;

        /*
         * Turn interrupts back on, only if they were enabled before.
         */
        if (interrupts_were_enabled)
            CPU_ENABLE_INTERRUPTS;

        return(SUCCESS);
}


int
sendto(fd, message, length, flag, sock, sock_size)
int     fd;             /* ignored */
register char   *message;
int     length;
int     flag;
register SOCKET_ADDRESS *sock;
int     sock_size;      /* ignored */
{
        u_long  error;

        register        ETHERNET_HEADER *enet_header;
        register        IP_HEADER       *ip_header;
        register        UDP_HEADER      *udp_header;
        register        INIT_BLOCK      *init_block;

        extern  u_short compute_ip_checksum();

```

Copyright 1989 Logic Modeling Systems

SOURCE PROGRAM os/lance.c

DATE 5/23/89 TIME 4:42:12 pm

PAGE # 7/23

SOURCE TEXT

```
        /*
         * Initialize the network headers on the outgoing message.
         */
        enet_he-      (ETHERNET_HEADER *) message;

        /*
         * Copy the Ethernet source address from the LANCE's
         * initialization block to the outgoing message buffer.
         */
        init_block = (INIT_BLOCK *) init_block_mem;
        enet_header->source[0] = init_block->physical_address_1;
        enet_header->source[1] = init_block->physical_address_2;
        enet_header->source[2] = init_block->physical_address_3;
        enet_header->source[3] = init_block->physical_address_4;
        enet_header->source[4] = init_block->physical_address_5;
        enet_header->source[5] = init_block->physical_address_6;

        /*
         * Copy the Ethernet destination address from the
         * message socket to the outgoing message buffer.
         */
        enet_header->destination[0] = sock->destination[0];
        enet_header->destination[1] = sock->destination[1];
        enet_header->destination[2] = sock->destination[2];
        enet_header->destination[3] = sock->destination[3];
        enet_header->destination[4] = sock->destination[4];
        enet_header->destination[5] = sock->destination[5];

        /*
         * Copy the packet type from the message socket to the
         * outgoing message buffer.
         */
        enet_header->type = sock->packet_type;
        if ((flag & UDP_IP_PACKET) == UDP_IP_PACKET) {
                ip_header = (IP_HEADER *)(message + sizeof(ETHERNET_HEADER));
                udp_header = (UDP_HEADER *)(message + sizeof(ETHERNET_HEADER) + sizeof(IP_HEADER));

                ip_header->version_and_header_length = 0x45;    /* IP  */
                ip_header->type_of_service      = 0x00;         /* not used */
                ip_header->total_length         = length + sizeof( IP_HEADER ) + sizeof( UDP_HEADER );  /* length of packet w/ headers */
                ip_header->identification       = 0x0000;       /* not used  */
                ip_header->fragment_offset      = 0x0000;       /* not used  */
                ip_header->time_to_live         = 0xff;         /* 255 seconds  */
                ip_header->protocol             = 0x11;         /* UDP */
                ip_header->checksum             = 0x0000;       /* computed later */
                if (((flag & ALIVE_PACKET) == ALIVE_PACKET)
                    || ((flag & DEATH_PACKET) == DEATH_PACKET))
                        ip_header->source_address = alive_inet;
                else    ip_header->source_address = modeler_inet;
                ip_header->destination_address  = sock->address;

                ip_header->checksum = compute_ip_checksum ((u_short *)ip_header);

                if ((flag & ALIVE_PACKET) == ALIVE_PACKET)
                        udp_header->source_port = MODELERS_ARE_YOU_ALIVE_PORT;
                else if ((flag & DEATH_PACKET) == DEATH_PACKET)
                        udp_header->source_port = MODELERS_DEATH_PORT;
                else    udp_header->source_port = MODELERS_ETHERNET_PORT;
                udp_header->destination_port    = sock->port;
                udp_header->length              = (u_short) (length + sizeof(UDP_HEADER));
                udp_header->checksum            = 0x0000;       /*  Not used   */

                if (lance_transmit(message, (u_short)(length+sizeof(ETHERNET_HEADER)+sizeof(IP_HEADER)+sizeof(UDP_HEADER)), &error) != SUCCESS
                ) {
                        return(-error); /* Must return negative number to indicate error. */
                }
        }
        else { /* RAW_PACKET */
                if (lance_transmit(message, (u_short)(length+sizeof(ETHERNET_HEADER)), &error) != SUCCESS) {
                        return(-error); /* Must return negative number to indicate error. */
                }
        }

        return(length);
}


static u_short
compute_ip_checksum (a).
register        u_short *a;
{
        /*
         * This function computes the IP header checksum.  The header is passed in as
         * an array of unsigned shorts.  This function should be called only after all
         * of the bytes have been appropriately swapped.  The resulting checksum must
         * NOT be byte swapped.  (Stolen from RK's VMS network code.)
         */
        register        u_long  sum;


        /*  Sum up the 10 words (20 bytes) of the ip header.  */
        sum = *a;
        sum += *++a;
        sum += *++a;
        sum += *++a;
        sum += *++a;
        sum += *++a;
        sum += *++a;
        sum += *++a;
        sum += *++a;
        sum += *++a;

        sum += sum >> 16;       /*  add in the carry   */
        return((u_short) ~sum); /* return the one's complement of the checksum */
}


int
recvfrom(fd, message, length, option, from, from_len)
int     fd,
char    *message;
int     length;
int     option;
SOCKET_ADDRESS  *from;
int     *from_len;
{
        u_long  error;
        u_short error_code, actual_length;
        int err;
```

Copyright 1989 Logic Modeling Systems

| SOURCE PROGRAM | DATE 5/23/89 | PAGE # |
|---|---|---|
| os/lance.c | TIME 4:42:12 pm | 8/24 |

LINE # SOURCE TEXT

```
        register        ETHERNET_HEADER *enet_header;
        register        RECV_MDE *recv;
        register        IP_HEADER       *ip_header;
        register        UDP_HEADER      *udp_header;
        register        struct ethernet_arp_packet *packet;


        while( 1 )
        {
                /*
                ** wait for a message from host
                */
                CPU_DISABLE_INTERRUPTS;
                while( !extra_rcv_desc_count )
                {
                        CPU_ENABLE_INTERRUPTS;
                        if( option == RECVFROM_TIMEOUT )
                                sc_spend( rcv_lance_pkt_semaphore, SECOND * TIMEOUT, &err );
                        else    sc_spend( rcv_lance_pkt_semaphore, 0, &err );
                        if( err )
                                return( -1 );
                }
                CPU_ENABLE_INTERRUPTS;
                /*
                ** there is something from a host
                */
                recv = &extra_rcv_desc_buffers[ out_extra_rcv_desc_ptr ];

                /*
                ** get message
                */
                if (lance_receive(message, (u_short)length,
                        &actual_length, recv, option, &error) != SUCCESS)
                {
                        if( option != MSG_PEEK )
                        {
                                CPU_DISABLE_INTERRUPTS;
                                extra_rcv_desc_count--;
                                out_extra_rcv_desc_ptr++;
                                out_extra_rcv_desc_ptr &= ( MAX_USERS -1 );
                                p_lm_rcv_buffers_extra[ ++available_extra_buffer ]
                                        =(RECV_BUF *)((recv->high_buffer_address << 16)
                                        | recv->low_buffer_address);
                                if( too_many_buffers == 1)
                                        lance_iar_receive( &error_code );
                                CPU_ENABLE_INTERRUPTS;
                        }

                        /* Must return negative number to indicate error. */
                        if (error <= 0)
                                return(-1);
                        else return(-error);
                }
                if( option != MSG_PEEK )
                {
                        CPU_DISABLE_INTERRUPTS;
                        extra_rcv_desc_count--;
                        out_extra_rcv_desc_ptr++;
                        out_extra_rcv_desc_ptr &= ( MAX_USERS -1 );
                        p_lm_rcv_buffers_extra[ ++available_extra_buffer ]
                                =(RECV_BUF *)((recv->high_buffer_address << 16)
                                | recv->low_buffer_address);
                        if( too_many_buffers == 1)
                                lance_iar_receive( &error_code );
                        CPU_ENABLE_INTERRUPTS;
                }

                udp_header = (UDP_HEADER *) (message+sizeof(ETHERNET_HEADER)+sizeof(IP_HEADER));
                ip_header = (IP_HEADER *) (message + sizeof(ETHERNET_HEADER));

                packet = (struct ethernet_arp_packet *) message;
                if ( packet->arp.arp_opcode == ARP_REPLY )
                {
                        return(sizeof(struct ethernet_arp_packet));
                }
                enet_header = (ETHERNET_HEADER *) message;
                from->packet_type = enet_header->type;
                from->destination[0] = enet_header->source[0];
                from->destination[1] = enet_header->source[1];
                from->destination[2] = enet_header->source[2];
                from->destination[3] = enet_header->source[3];
                from->destination[4] = enet_header->source[4];
                from->destination[5] = enet_header->source[5];

                from->port = udp_header->source_port;
                from->address = ip_header->source_address;
                from->family = AF_INET;

                modeler_inet_address = ip_header->destination_address;

                *from_len = SOCK_SIZE;

                actual_length = ip_header->total_length - (sizeof( IP_HEADER ) + sizeof( UDP_HEADER )); /* length of packet w/o headers */

                /*
                ** if we get a packet with funny insides just continue.
                */
                if( actual_length > MAX_RECEIVE_BUFFER_SIZE || actual_length == 0)
                        continue;

                return(actual_length);
        }
}


u_short
lance_transmit(message, length, error)
register        char    *message;
register        u_short length;
register        u_long  *error;
{
        register        TRANS_MDE       *trans;
        register        u_short interrupts_were_enabled;


        /*
         * Start out with no errors.
         */
        *error = 0;
```

Copyright 1989
Logic Modeling Systems

SOURCE PROGRAM: os/lance.c | DATE: 5/23/89 | TIME: 4:42:12 pm | PAGE # 9/25

SOURCE TEXT

```
        interrupts_were_enabled =
                ((cpu_control_reg_struct *) CPU_CONTROL_REG)->global_intr_ena;
        CPU_DISABLE_INTERRUPTS;

        /*
         * Local register pointer.
         */
        trans = current_transmit_pointer;

        /*
         * Set our, as opposed to the LANCE's, notion of what the current transmit
         * message descriptor is.  Actually, this is the next transmit descriptor
         * to be used, but I think the code is clearer if it's name is "current".
         *
         * The transmit message descriptors are in a ring structure which causes
         * us to have to wrap around to the beginning when the end of the list
         * is reached.
         */
        if (++current_transmit_pointer >= maximum_transmit_pointer) {
                current_transmit_pointer = minimum_transmit_pointer;
        }

        if (interrupts_were_enabled)
            CPU_ENABLE_INTERRUPTS;

        if( trans->own_buffer == LANCE_BUFFER_OWNERSHIP )
                return( FAILURE );

        /*
         * Set up the address of the message that is being sent, indicate that
         * this is both the start and the end of this packet, set the packet
         * byte count, finally - note that this must be done last - the
         * buffer is turned over to the LANCE for transmission.
         */
        trans->low_buffer_address = (u_short) message;
        trans->high_buffer_address = (unsigned) message >> 16;
        trans->start_of_packet = 1;
        trans->end_of_packet = 1;

        /*
        ** most hosts will not like very short packets
        ** 64 is a minimum for SUN's
        */
        if (allow_runt_packets == FALSE) {
                if (length < 60) {
                        length = 60;
                }
        }

        trans->buffer_byte_count = (unsigned) (1 + ~length);
        trans->own_buffer = LANCE_BUFFER_OWNERSHIP;

        /*
         * Poke the LANCE to let it know that we have a message for it to send.
         * Otherwise, it would wait until the polling time interval had elapsed.
         * Note that we must set the interrupt enable bit ON every time the
         * transmit demand bit is set, because for some unknown reason, interrupts
         * are disabled whenever we set transmit demand.
         */
        if (write_lance_csr(SELECT_CSR0, TRANSMIT_DEMAND|INTERRUPT_ENABLE) == FAILURE) {
                *error |= FAILURE_TO_WRITE_TO_LANCE_CSR;
                return(FAILURE);
        }

        return(SUCCESS);
}

static  u_short
lance_receive(buffer, max_length, actual_length, recv, option, error)
register        char    *buffer;
register        u_short max_length;
register        u_short *actual_length;
register        u_long  *error;
int             option;
register        RECV_MDE        *recv;
{
        register        char    *recv_buffer;
        /*
         * Start out with no errors.
         */
        *error = 0;


        /*
         * This implementation of the LANCE code requires that the entire
         * message fit within a single receive message buffer.  Check that
         * the LANCE thinks that this has happened.
         */
        if (recv->start_of_packet != 1)
                *error |= PACKET_OVERFLOW_ERROR;
        if (recv->end_of_packet != 1)
                *error |= PACKET_OVERFLOW_ERROR;

        if (*error != 0)
                return(FAILURE);

        /*
         * Looks like we have a good message.  Let's process and return it
         * to the anxious user.
         */

        /*
         * Check to see if the size of the received message is small enough
         * to fit into the buffer that the user passed us.  The number of
         * bytes that the LANCE deals with is 4 more than one would expect
         * because of the 4 byte CRC.  Adjust the actual length as indicated.
         */
        *actual_length = recv->message_byte_count-4;
        if( option != MSG_PEEK )
        {
                if (*actual_length > max_length)
                {
                        *error |= BUFFER_TOO_SMALL;
                        return(FAILURE);
                }
        }

        /*
         * Copy the received buffer to the user's buffer.
         */
```

Copyright 1989 Logic Modeling Systems

SOURCE PROGRAM os/lance.c | DATE 5/23/89 | TIME 4:42:12 pm | PAGE # 10/26

LINE # SOURCE TEXT

```
        recv_buffer = (char *) ((recv->high_buffer_address << 16) | recv->low_buffer_address);

        /*
         * If the packet is not a broadcast, copy the data from the LANCE's buffer
         * to the calling routine's buffer.  Broadcast packets are indicated by
         * a returned length of 0 - no data is copied.
         */
        if( option != MSG_PEEK )
                memory_copy((u_long *)buffer, (u_long *)recv_buffer, (short)*actual_length);
        else    memory_copy((u_long *)buffer, (u_long *)recv_buffer, (short)max_length);
        /*
         * We must adjust the length of the actual message to compensate for the
         * calling routines lack of knowledge of the Ethernet header.
         */
        *actual_length -= sizeof(ETHERNET_HEADER);


        return(SUCCESS);
}


/*
 * The code has been changed so that it is not possible for lance_isr_receive()
 * to return any failures.  If the calling routine wants to see if "warnings"
 * occurred, they can look at the returned "error".
 */
static  void
lance_isr_receive( error )
register u_short *error;
{
        register        char    *recv_buffer;

        register        RECV_MDE        *recv;
        register        IP_HEADER       *ip_header;
        register        UDP_HEADER      *udp_header;
        register        LM_HEADER       *lm_header;
        register        ICMP_HEADER     *icmp_pkt;

        extern  char lm_valid_system;
        extern  void    process_other_stuff();
        extern  void    process_are_you_alive();


        /*
         * Start out with no errors.
         */
        *error = 0;

        /*
         * Note: in the following code we must wait until the last possible
         * moment to turn the buffer back over to the LANCE.  Therefore, don't
         * execute the following line of code until you have to:
         */
        /* recv->own_buffer = LANCE_BUFFER_OWNERSHIP; */


        while (current_receive_pointer->own_buffer == HOST_BUFFER_OWNERSHIP) {
                /*
                 * Local register pointer.
                 */
                recv = current_receive_pointer;
                /*
                 * Check for errors that occurred during reception.
                 */
                if (recv->error_summary == 1) {
                        if (recv->framing_error == 1) {
                                *error |= FRAMING_ERROR;
                                /* output_routine("FE"); /* Framing Error */
                        }
                        if (recv->overflow_error == 1) {
                                *error |= OVERFLOW_ERROR;
                                /* output_routine("OF"); /* Overflow error */
                        }
                        if (recv->crc_error == 1) {
                                *error |= CRC_ERROR;
                                /* output_routine("CRC"); /* CRC error */
                        }
                        if (recv->buffer_error == 1) {
                                *error |= BUFFER_ERROR;
                                /* output_routine("BUF"); /* BUFfer error */
                        }

                        /* Turn the buffer back over to the LANCE. */
                        recv->own_buffer = LANCE_BUFFER_OWNERSHIP;

                        if (++current_receive_pointer >= maximum_receive_pointer)
                                current_receive_pointer = minimum_receive_pointer;

                        continue;
                }

                /* Get the address of the buffer. */
                recv_buffer = (char *) ((recv->high_buffer_address << 16) | recv->low_buffer_address);

                /* Set up pointers to the UDP and IP parts of the buffer. */
                ip_header = (IP_HEADER *) (recv_buffer + sizeof(ETHERNET_HEADER));
                udp_header = (UDP_HEADER *) (recv_buffer+sizeof(ETHERNET_HEADER)+sizeof(IP_HEADER));
                lm_header = (LM_HEADER *) (recv_buffer+sizeof(ETHERNET_HEADER)+sizeof(IP_HEADER)+sizeof(UDP_HEADER));

                /* Reject broadcast, non-UDP, and incorrect port packets. */

                if (( *(u_long *)recv_buffer != 0xFFFFFFFF) && ( *(u_short *)(recv_buffer+4) != 0xFFFF)) {

                    if ( *(u_short *) (recv_buffer+12) == 0x0800 ) {  /*  type is IP  */

                        if (ip_header->protocol ==  0x11) {
                            switch(udp_header->destination_port) {
                            case MODELERS_ARE_YOU_ALIVE_PORT:
                                    process_are_you_alive(recv_buffer,
                                        ip_header, udp_header, lm_header,
                                        ALIVE_PACKET);
                                    break;
                            case MODELERS_DEATH_PORT:
                                    /* respond as if are you alive */
                                    process_are_you_alive(recv_buffer,
                                        ip_header, udp_header, lm_header,
                                        DEATH_PACKET);
                                    output_routine("\nREMOTE RESET\n");
                                    /* I think I'm gunna kill myself */
                                    reset_cpu(REMOTE_RESET);
```

Copyright 1989
Logic Modeling Systems

SOURCE PROGRAM os/lance.c DATE 5/23/89 TIME 4:42:12 pm PAGE # 11/27

LINE # SOURCE TEXT

```
                                break;
                        case MODELERS_ETHERNET_PORT:
                        case MODELERS_OUT_OF_BAND_PORT:
                                proce[illegible]her_stuff(recv);
                                break;
                        }
                }
                else
                {
                        /*
                        ** we have a ICMP
                        */
                        if( ip_header -> protocol == 0x1 )
                        {
                                icmp_pkt = (ICMP_HEADER *)udp_header,
                                /*
                                ** check for echo request
                                */
                                if( icmp_pkt->type == 8)
                                {
                                        send_icmp_reply(recv_buffer);
                                }
                        }
                }
            } else if ( *(u_short *) (recv_buffer+12) == ARP_ARP ) {   /*  type is ARP  */

                struct ethernet_arp_packet *packet;
                long    error;

                packet = (struct ethernet_arp_packet *) recv_buffer;
                if ( packet->arp.arp_opcode == ARP_REPLY && accept_arp_reply) {

                        /*  We have received a reply to our ARP     */
                        /*  request. Pass it to HL code             */
                        process_other_stuff(recv);
                }

                if ( packet->arp.arp_opcode == ARP_REQUEST) {

                        /*  This is an ARP request directed at the  */
                        /*  modeler.  Here is where we should       */
                        /*  initiate a response.                    */
                        if( lm_valid_nvram == TRUE )
                        {
                                send_arp_reply ((struct ethernet_arp_packet *) recv_buffer,
                                        (u_char *) id_prom.ethernet,
                                        boot.modeler_internet_address,
                                        packet->arp.arp_source_hardware_address,
                                        packet->arp.arp_source_protocol_address );
                        }
                }
            }

        } else {

                /*  We have a broadcast packet which might be of interest  */

                struct ethernet_arp_packet *packet;

                packet = (struct ethernet_arp_packet *) recv_buffer;
                if ( packet->arp.arp_opcode == ARP_REQUEST) {

                        if (packet->arp.arp_target_protocol_address == boot.modeler_internet_address) {
                                /*  This is a broadcasted ARP request for   */
                                /*  this modeler.  Here is where we should  */
                                /*  initiate a response.                    */
                                if( lm_valid_nvram == TRUE )
                                {
                                        send_arp_reply ((struct ethernet_arp_packet *) recv_buffer,
                                                (u_char *) id_prom.ethernet,
                                                boot.modeler_internet_address,
                                                packet->arp.arp_source_hardware_address,
                                                packet->arp.arp_source_protocol_address );
                                }

                        }
                }

        }

        too_many_buffers = 0;

        /*
         * Turn the buffer back over to the LANCE.
         */
        recv->own_buffer = LANCE_BUFFER_OWNERSHIP;

        /*
         * Set our, as opposed to the LANCE's, notion of what the current receive
         * message descriptor is.  Actually, this is the next receive descriptor
         * to be used, but I think the code is clearer if it's name is "current".
         *
         * The receive message descriptors are in a ring structure which causes
         * us to have to wrap around to the beginning when the end of the list
         * is reached.
         */
        if (++current_receive_pointer >= maximum_receive_pointer)
                current_receive_pointer = minimum_receive_pointer;
    }
}

static  void
process_are_you_alive(message, ip_header, udp_header, lm_header, flag)
register        char    *message;
register        IP_HEADER       *ip_header;
register        UDP_HEADER      *udp_header;
register        LM_HEADER       *lm_header;
{
        SOCKET_ADDRESS  from;
        register        ETHERNET_HEADER *enet_header;
        long            *lptr = (long *)(lm_header + 1);
        long            cmd;
        long            size;
        char            *buffer;

        extern  char    modeler_state,

        cmd = *lptr++;
        size = *lptr++;
```

Copyright 1989 Logic Modeling Systems

SOURCE PROGRAM os/lance.c | DATE 5/23/89 | TIME 4:42:12 pm | PAGE # 12/28

LINE # SOURCE TEXT

```
	buffer = (char *)lptr;

	enet_header = (ETHERNET_HEADER *) message;

	from.packet_type = enet_header->type;
	from.destination[0] = enet_header->source[0];
	from.destination[1] = enet_header->source[1];
	from.destination[2] = enet_header->source[2];
	from.destination[3] = enet_header->source[3];
	from.destination[4] = enet_header->source[4];
	from.destination[5] = enet_header->source[5];

	from.family = AF_INET;
	from.port = udp_header->source_port;
	from.address = ip_header->source_address;

	alive_inet = ip_header->destination_address;

	lm_header->byte_count = sizeof(LM_HEADER) + 4; /* Choose to send 4 bytes. */
	/* All other lm_header fields are already properly set. */

	/* NOTE: update the version when either "unknown" changes to a known. */

	/* At the end of the header, put a version and the desired return data. */
	*(u_char *)((char *)lm_header+sizeof(LM_HEADER)+0) = (u_char) 0x1; /* version */
	*(u_char *)((char *)lm_header+sizeof(LM_HEADER)+1) = (u_char) modeler_state;
	*(u_char *)((char *)lm_header+sizeof(LM_HEADER)+2) = (u_long) 0x0; /* unknown */
	*(u_char *)((char *)lm_header+sizeof(LM_HEADER)+3) = (u_long) 0x0; /* unknown */

	(void) sendto(0, message, (int)lm_header->byte_count,
		UDP_IP_PACKET|flag, (struct sockaddr*)&from, SOCK_SIZE);

	switch (cmd) {
		case AYA_INQUIRE:
			break;
		case AYA_KILL:
			output_routine("\nREMOTE RESET\n");
			/* I think I'm gunna kill myself */
			reset_cpu(REMOTE_RESET);
			break;
		case AYA_INTERRUPT:
			lm_intr_requested = 1;
			break;
	}
}


static  void
process_other_stuff(recv)
register	RECV_MDE	*recv;
{
	int		err;

	/*
	** inform task of packet arrival and let the ISR know
	** we made a system call so it uses UI_EXIT to leave ISR.
	*/
	if (copy_from_lance_ring(recv) == FAILURE) {
		too_many_buffers = 1;
		output_routine("NB"); /* No Buffers */
		return; /* non-fatal error */
	}

	system_call = 1;
	if (extra_rcv_desc_count == 1) {
		sc_spost (rcv_lance_pkt_semaphore, &err);
		if (err) {
			/* Turn the buffer back over to the LANCE. */
			recv->own_buffer = LANCE_BUFFER_OWNERSHIP;

			if (++current_receive_pointer >= maximum_receive_pointer)
				current_receive_pointer = minimum_receive_pointer;

			output_routine("SP"); /* Semaphore Post */
			return; /* non-fatal error */
		}
	}
}


static  void
memory_copy(s1, s2, count)
register	u_long	*s1;
register	u_long	*s2;
register	short	count;
{
register short remain = count & 3;

	/*
	** divide by 4,
	** How many long moves we need to perform
	*/
	count >>= 2;
	while(--count >= 0) {
		*s1++ = *s2++;
	}
	/*
	** clean up, by moving remaining bytes
	*/
	while(--remain >= 0) {
		*(u_char *)s1++ = *(u_char *)s2++;
	}
}


/*
 * LANCE Interrupt Service Routine
 */
void
lance_isr()
{
	u_short error;
	u_short reset = 0;
	u_short not_a_register_csr0;

	register	u_short csr0;
	register	TRANS_MDE	*trans_ptr;


	/*
```

Copyright 1989
Logic Modeling Systems

SOURCE PROGRAM os/lance.c | DATE 5/23/89 | TIME 4:42:12 pm | PAGE # 13/29

SOURCE TEXT

```
         * Check the status of LANCE control and status register 0
         * for possible errors and the source of the interrupt.
         */
        if (isr_rea[illegible]_lance_csr( &not_a_register_csr0 ) != SUCCESS) {
                reset = 1;
                output_routine("CSR");
                not_a_register_csr0 = 0x0;

                /* I know gotos are gross, but we don't want to
                 * check the stuff below if the CSR read failed.
                 */
                goto close_up_shop;
        }

        /*
         * Create a local register variable for csr0.
         */
        csr0 = not_a_register_csr0;

        /*
        ** If we didn't get an interrupt, just harmlessly return.
        ** In reality, something is seriously broken - oh well.
        */
        if((csr0 & INTERRUPT_SUMMARY) != INTERRUPT_SUMMARY)
                return;

        /*
         * Check all the conditions that could have occurred.
         * Note that there are several fatal error conditions.
         */
        if ((csr0 & ERROR_SUMMARY) == ERROR_SUMMARY) {
                /* Note that we don't reset here because if the error is
                 * fatal the receiver and/or transmitter will be off and
                 * checked below.
                 */
                if ((csr0 & TRANSMIT_BABBLE_ERROR) == TRANSMIT_BABBLE_ERROR)
                        output_routine("BBL");
                if ((csr0 & MISSED_PACKET_ERROR) == MISSED_PACKET_ERROR)
                {
                        /* output_routine("MISS"); */
                        ;
                }
                if ((csr0 & MEMORY_ERROR) == MEMORY_ERROR)
                {
                        /* output_routine("MEM"); */
                        ;
                }
                /* COLLISION_ERROR
                 * According the LANCE technical manual, P4-15, collision error
                 * should not be considered fatal.  Comment out this test for
                 * now but give it a try during system debug/test.
                 */
                if ((csr0 & COLLISION_ERROR) == COLLISION_ERROR)
                {
                        /* output_routine("COL"); */
                        ;
                }
        }

        if ((csr0 & RECEIVE_ON) != RECEIVE_ON) {
                reset = 1;
                output_routine("RX");
        }

        if ((csr0 & TRANSMIT_ON) != TRANSMIT_ON) {
                reset = 1;
                output_routine("TX");
        }

        if ( ((csr0 & RECEIVE_INTERRUPT) == RECEIVE_INTERRUPT) ||
             (too_many_buffers && (extra_rcv_desc_count != MAX_USERS)) )
        {
                lance_isr_receive( &error );
        }

        if ((csr0 & TRANSMIT_INTERRUPT) == TRANSMIT_INTERRUPT) {
                trans_ptr = lance_sent_packet;
                if (++lance_sent_packet >= maximum_transmit_pointer) {
                      . lance_sent_packet = minimum_transmit_pointer;
                }
                if(trans_ptr->own_buffer == HOST_BUFFER_OWNERSHIP) {
                        if(trans_ptr->buffer_error == 1)
                                output_routine("BUFF");
                        if(trans_ptr->error_summary == 1)
                        {
                                if(trans_ptr->underflow_error == 1)
                                {
#ifdef  BROKEN_HARDWARE
                                        reinitialize_lance = 1;
                                        ((cpu_control_reg_struct *) CPU_CONTROL_REG)->control_spare = 1;
#endif  BROKEN_HARDWARE
                                        output_routine("UFLO");
                                }
                                if(trans_ptr->late_collision_error == 1)
                                {
                                        /* output_routine("LCOL"); */
                                        ;
                                }
                                if(trans_ptr->lost_carrier_error == 1)
                                        output_routine("LCAR");
                                if(trans_ptr->retry_error == 1)
                                {
                                        /* output_routine("RT"); */
                                        ;
                                }
                        }
                }
        }

close_up_shop:
        if(reset == 1) {
                (void)lm_nvram_access((char *) &not_a_register_csr0, LANCE_CSR_REG, SIZEOF_LANCE_CSR_REG, MEMORY_WRITE, &error);
                reset_cpu(LANCE_ERROR);
        }
}

/*
** exchange buffers
** between lance rcv ring & our spare ring
** This avoids the situation of having to copy buffers in the ISR
```

Copyright 1989 Logic Modeling Systems

SOURCE PROGRAM os/lance.c | DATE 5/23/89 | TIME 4:42:12 pm | PAGE # 14/30

SOURCE TEXT

```
*/
copy_from_lance_ring( recv )
register        RECV_MDE        *recv;
{
        register RECV_MDE *new_recv = &extra_rcv_desc_buffers[ in_extra_rcv_desc_ptr ];

        /*
        ** any buffers?
        */
        if( (available_extra_buffer < 0) || (extra_rcv_desc_count == MAX_USERS))
                return( FAILURE );

        /*
        ** copy the recv descriptor
        */
        *new_recv = *recv;

        /*
        ** bump the "pointer", and the count
        */
        in_extra_rcv_desc_ptr++;
        in_extra_rcv_desc_ptr &= ( MAX_USERS -1 );

        extra_rcv_desc_count++;

        /*
        ** give lance one of our spare buffers
        */
        recv->low_buffer_address =
                        (u_short) p_lm_rcv_buffers_extra[ available_extra_buffer ];
        recv->high_buffer_address =
                        (unsigned) p_lm_rcv_buffers_extra[ available_extra_buffer-- ] >> 16;
        return( SUCCESS );
}
#ifdef  ICMP_MESSAGES


#define PR(number)      { int i; for(i=0; i<number; ++i) { (void)printf("%02x",*ptr++);} (void)printf("\n");}

static
print_garbage_header(message)
char    *message;
{
        register        u_char  *ptr;


        ptr = (u_char *)message;

        (void)printf("received garbage\n");

        (void)printf("Enet source:      "); PR(6)
        (void)printf("Enet destination: "); PR(6)

        (void)printf("Enet type:        "); PR(2)
        (void)printf("Inet V,IHL,Type:  "); PR(2)
        (void)printf("Inet length:      "); PR(2)
        (void)printf("Inet Id,Frag:     "); PR(4)
        (void)printf("Inet TTL,Prot:    "); PR(2)
        (void)printf("Inet Chksum:      "); PR(2)
        (void)printf("Inet source:      "); PR(4)
        (void)printf("Inet destination: "); PR(4)

        if (*(((u_char*)message) + 23) != 0x1) {
                (void)printf("ERROR: unknown protocol(0X%02x)\n", *(ptr+23));
        }
        else {
                (void)printf("ICMP Type,Code:   "); PR(2)
                (void)printf("ICMP Chksum:      "); PR(2)
                (void)printf("ICMP unused:      "); PR(4)
                (void)printf("Inet V,IHL,Type:  "); PR(2)
                (void)printf("Inet length:      "); PR(2)
                (void)printf("Inet Id,Frag:     "); PR(4)
                (void)printf("Inet TTL,Prot:    "); PR(2)
                (void)printf("Inet Chksum:      "); PR(2)
                (void)printf("Inet source:      "); PR(4)
                (void)printf("Inet destination: "); PR(4)
        }
}
#endif  ICMP_MESSAGES
send_icmp_reply(recv_buf)
register char *recv_buf;
{
        extern  ID_PROM_CPU     id_prom;
        u_long inet_address, error;
        register PACKET_HEADER *recv_buffer = (PACKET_HEADER *)recv_buf;
        register u_long i, csum;
        register u_short j;
        register u_char *enet_address = (u_char *) id_prom.ethernet;
        register ICMP_HEADER *icmp_pkt = (ICMP_HEADER *) (recv_buf + sizeof( ETHERNET_HEADER) + sizeof( IP_HEADER ));
        register u_short *icmp_checksum = (u_short *) (recv_buf + sizeof( ETHERNET_HEADER) + sizeof( IP_HEADER ));
        /*
        ** xchg source destination ethernet address
        */
        recv_buffer->ethernet_hdr.destination[0]=recv_buffer->ethernet_hdr.source[0];
        recv_buffer->ethernet_hdr.destination[1]=recv_buffer->ethernet_hdr.source[1];
        recv_buffer->ethernet_hdr.destination[2]=recv_buffer->ethernet_hdr.source[2];
        recv_buffer->ethernet_hdr.destination[3]=recv_buffer->ethernet_hdr.source[3];
        recv_buffer->ethernet_hdr.destination[4]=recv_buffer->ethernet_hdr.source[4];
        recv_buffer->ethernet_hdr.destination[5]=recv_buffer->ethernet_hdr.source[5];
        recv_buffer->ethernet_hdr.source[0]=enet_address[0];
        recv_buffer->ethernet_hdr.source[1]=enet_address[1];
        recv_buffer->ethernet_hdr.source[2]=enet_address[2];
        recv_buffer->ethernet_hdr.source[3]=enet_address[3];
        recv_buffer->ethernet_hdr.source[4]=enet_address[4];
        recv_buffer->ethernet_hdr.source[5]=enet_address[5];
        j = recv_buffer->ip_hdr.total_length - sizeof( IP_HEADER );
        /*
        ** xchg source destination internet addresses.
        */
        inet_address = recv_buffer->ip_hdr.source_address;
        recv_buffer->ip_hdr.source_address=recv_buffer->ip_hdr.destination_address;
        recv_buffer->ip_hdr.destination_address = inet_address;
        /*
        ** set reply type
        */
        icmp_pkt->type = 0;
        /*
        ** calculate ICMP checksum
        */
        csum = 0;
```

Copyright 1989
Logic Modeling Systems

SOURCE PROGRAM: os/lance.c

DATE: 5/23/89 TIME: 4:42:12 pm

PAGE #: 15/31

LINE # SOURCE TEXT

```
        icmp_pkt->checksum = 0;
        for( i = 0; i < j; i+=2 )
                csum += *icmp_checksum++;
        csum += csum >> 16;       /*  add in the carry   */
        icmp_pkt->checksum = ((u_short) ~csum); /* the one's complement of the checksum */
        lance_transmit(recv_buf, recv_buffer->ip_hdr.total_length
                + sizeof( ETHERNET_HEADER ), &error);
}
```

Copyright 1989 Logic Modeling Systems

SOURCE PROGRAM os/lm_ee_access.c | DATE 5/23/89 | TIME 4:42:13 pm | PAGE # 1/32

LINE # SOURCE TEXT

```
/* SCCS_ID: lm_ee_access.c rev 3.1, 4/24/89 at 07:46:54     */

#include "common.h"
#include "mod_def.h"
#include "cpu.h"
#include "magic.h"
#include "pel.h"
#include "lm_rd_wr.h"
#include "eeprom.h"

u_short access_eeprom();
u_short write_eeprom(), read_eeprom();
void disable_eeprom(), enable_eeprom(), erase_all_eeprom();
u_char diag_dab;
u_short
lm_e2prom_access(data_struct, field, ee_num,  sizeof_field, option, error)
char *data_struct;
unsigned long field;
u_long ee_num;
unsigned long sizeof_field, option;
unsigned long *error;
{
        register PEL *pel_access_reg;
        u_short status;
        register u_char ee_number = ee_num;
        register unsigned char  eeprom = (unsigned char ) field;
        register unsigned short checksum = 0;
        register unsigned short temp, i = 0, *ptr = (u_short *) data_struct;

        u_char   old_eeprom_in_bit;
        u_char   old_initialize_bit;

        *error = NO_NVRAM_ERROR;

        pel_access_reg = (PEL *)
                (pel_addr(((ee_number & 0x18) >> 3), (ee_number & 7)));

        /*
        ** check for diag dab by toggling eeprom in
        ** and  present should follow.
        */
        diag_dab = 0;
        old_eeprom_in_bit = pel_access_reg->car.bit.eeprom_in;
        pel_access_reg->car.bit.eeprom_in = 1;
        if( pel_access_reg->car.bit.present == 0)
        {
                pel_access_reg->car.bit.eeprom_in = 0;
                if( pel_access_reg->car.bit.present == 1)
                {
                        diag_dab = 1;
                }
        }
        pel_access_reg->car.bit.eeprom_in = old_eeprom_in_bit;
        old_initialize_bit = pel_access_reg->car.bit.initialize;
        pel_access_reg->car.bit.initialize = 0;
        pel_access_reg->car.bit.initialize = 1;
        /*
        ** if reading or writing we have valid eeprom
        ** and eeprom acess is within bounds
        */
        if(option == MEMORY_READ || option == MEMORY_WRITE)
        {
                if(field + sizeof_field > (CPU_E2PROM_SIZE ))
                {
                        *error = NO_NVRAM;
                        pel_access_reg->car.bit.initialize = old_initialize_bit;
                        return( FAILURE );
                }
        }
        /*
        ** perform read
        */
        if( option == MEMORY_READ )
        {
                /*
                ** take care of odd reads
                */
                if( eeprom & 1 )
                {
                        *(u_char *) ptr =(u_char) ((read_eeprom( ee_number, eeprom >> 1, &status)) >> 8);
                        if( status == FAILURE ) {
                           pel_access_reg->car.bit.initialize = old_initialize_bit;
                           return( FAILURE );
                        }
                        ++eeprom;
                        (u_char *) ++ptr;
                        --sizeof_field;
                }
                eeprom >>= 1;
                /*
                ** Anything else to read
                */
                if( sizeof_field )
                {
                        /*
                        ** skip odd read at the end
                        */
                        temp = sizeof_field & 0xfffe;
                        if( temp )
                        {
                                for(i = 0; i < temp; i+=2)
                                {
                                        *ptr++ = read_eeprom( ee_number, eeprom, &status );
                                        if( status == FAILURE ) {
                                           pel_access_reg->car.bit.initialize = old_initialize_bit;
                                           return( FAILURE );
                                        }
                                        eeprom ++;
                                }
                        }
                        /*
                        ** do odd read at the end
                        */
                        if(sizeof_field  &  1 )
                        {
                                *(u_char *) ptr =(u_char) (read_eeprom( ee_number, eeprom, &status));
                                if( status == FAILURE ) {
                                    pel_access_reg->car.bit.initialize = old_initialize_bit;
                                    return( FAILURE );
                                }
```

Copyright 1989
Logic Modeling Systems

SOURCE PROGRAM: os/lm_ee_access.c | DATE 5/23/89 | TIME 4:42:13 pm | PAGE # 2/33

SOURCE TEXT

```
                        }
                }
                pel_access_reg->car.bit.initialize = old_initialize_bit;
                return( SUCCESS );
        }
        /*
        ** perform write
        */
        if( option == MEMORY_WRITE )
        {
                /*
                ** take care of odd writes
                */
                if( eeprom & 1 )
                {
                        if( write_eeprom(ee_number, eeprom>>1, (read_eeprom( ee_number, eeprom>>1 & 0xff, &status)) | ((*(u_char *) ptr) << 8)
                        ) == FAILURE)
                        {
                                *error = WRITE_FAILURE;
                                pel_access_reg->car.bit.initialize = old_initialize_bit;
                                return( FAILURE );
                        }
                        if( status == FAILURE ) {
                            pel_access_reg->car.bit.initialize = old_initialize_bit,
                            return( FAILURE );
                        }
                        ++eeprom;
                        (u_char *) ++ptr;
                        --sizeof_field;
                }
                eeprom >>= 1;
                /*
                ** Anything else to write
                */
                if( sizeof_field )
                {
                        /*
                        ** skip odd write at the end
                        */
                        temp = sizeof_field & 0xfffe;
                        if( temp )
                        {
                                for(i = 0; i < temp; i+=2)
                                {
                                        if( write_eeprom( ee_number, eeprom, *ptr++ ) == FAILURE )
                                        {
                                                *error = WRITE_FAILURE;
                                                pel_access_reg->car.bit.initialize = old_initialize_bit;
                                                return( FAILURE );
                                        }
                                        eeprom ++;
                                }
                        }
                        /*
                        ** do odd read at the end
                        */
                        if(sizeof_field & 1 )
                        {
                                if( write_eeprom(ee_number, eeprom, ((read_eeprom( ee_number, eeprom)) & 0xff00, &status) + *(u_char *) ptr) =
                                = FAILURE)
                                {
                                        *error = WRITE_FAILURE;
                                        pel_access_reg->car.bit.initia'ize = old_initialize_bit;
                                        return( FAILURE );
                                }
                                if( status == FAILURE ) {
                                    pel_access_reg->car.bit.initialize = old_initialize_bit;
                                    return ( FAILURE );
                                }
                        }
                }
                /*
                ** This assumes checksum and write count are on a even boundary
                */
                if( write_eeprom(ee_number, EEPROM_WRITE_COUNT, read_eeprom( ee_number,EEPROM_WRITE_COUNT )+1, &status) == FAILURE )
                {
                        *error = WRITE_FAILURE;
                        pel_access_reg->car.bit.initialize = old_initialize_bit;
                        return( FAILURE );
                }
                if( status == FAILURE ) {
                    pel_access_reg->car.bit.initialize = old_initialize_bit;
                    return ( FAILURE );
                }
                /*
                ** calculate checksum, do not use checksum in the calculation
                ** 2's complement of the sum of the rest of the fields
                */
                for( i = 0; i != 63; i++)
                {
                        checksum += read_eeprom( ee_number, i, &status);
                        if( status == FAILURE ) {
                            pel_access_reg->car.bit.initialize = old_initialize_bit;
                            return ( FAILURE );
                        }
                }
                checksum   ~checksum;
                ++checksum;
                if( write_eeprom(ee_number, EEPROM_CHECKSUM, checksum) == FAILURE )
                {
                        *error = WRITE_FAILURE;
                        pel_access_reg->car.bit.initialize = old_initialize_bit;
                        return( FAILURE );
                }
                pel_access_reg->car.bit.initialize = old_initialize_bit;
                return( SUCCESS );
        }
        /*
        ** Initialize Sram
        */
        if( option == MEMORY_INIT )
        {
                /*
                ** clean out EEprom
                */
                erase_all_eeprom( ee_number );
                /*
                ** Fill fields with 0
                */
                for( i = EEPROM_SIGNATURE_1+1; i < EEPROM_WRITE_COUNT; ++i)
```

Copyright 1989
Logic Modeling Systems

| SOURCE PROGRAM | DATE 5/23/89 | PAGE # |
|---|---|---|
| os/lm_ee_access.c | TIME 4:42:13 pm | 3/34 |

SOURCE TEXT

```
                        (void) write_eeprom(ee_number, i, (u_short) 0);
                /*
                ** set up signature
                */
                if( write_eeprom(ee_number, EEPROM_SIGNATURE_0, (u_short) SIG_WORD_0) == FAILURE )
                {
                        *error = WRITE_FAILURE;
                        pel_access_reg->csr.bit.initialize = old_initialize_bit;
                        return( FAILURE );
                }
                /*
                ** set up signature
                */
                if( write_eeprom(ee_number, EEPROM_SIGNATURE_1, (u_short) SIG_WORD_1) == FAILURE )
                {
                        *error = WRITE_FAILURE;
                        pel_access_reg->csr.bit.initialize = old_initialize_bit;
                        return( FAILURE );
                }
                /*
                ** This assumes checksum and write count are on a even boundary
                */
                if( write_eeprom(ee_number, EEPROM_WRITE_COUNT, (u_short) read_eeprom( ee_number,EEPROM_WRITE_COUNT )+1, &status) == FAILURE)
                {
                        *error = WRITE_FAILURE;
                        pel_access_reg->csr.bit.initialize = old_initialize_bit;
                        return( FAILURE );
                }
                /*
                ** calculate checksum, do not use checksum in the calculation
                ** 2's complement of the sum of the rest of the fields
                */
                for( i = 0; i != 63; i++)
                {
                        checksum += read_eeprom( ee_number, i, &status);
                        if( status == FAILURE ) {
                            pel_access_reg->csr.bit.initialize = old_initialize_bit;
                            return ( FAILURE );
                        }
                }
                if( write_eeprom(ee_number, EEPROM_CHECKSUM, (u_short) ((~checksum) + 1))== FAILURE)
                {
                        *error = WRITE_FAILURE;
                        pel_access_reg->csr.bit.initialize = old_initialize_bit;
                        return( FAILURE );
                }
                pel_access_reg->csr.bit.initialize = old_initialize_bit;
                return( SUCCESS );
        }
        /*
        ** validate NVRAM
        */
        if( option == MEMORY_VALIDATE )
        {
                if( read_eeprom( ee_number, EEPROM_SIGNATURE_0, &status ) != SIG_WORD_0)
                {
                        *error = INVALID_NVRAM;
                        pel_access_reg->csr.bit.initialize = old_initialize_bit;
                        return( FAILURE );
                }
                if( status == FAILURE ) {
                    pel_access_reg->csr.bit.initialize = old_initialize_bit;
                    return ( FAILURE );
                }
                if( read_eeprom( ee_number, EEPROM_SIGNATURE_1, &status ) != SIG_WORD_1)
                {
                        *error = INVALID_NVRAM;
                        pel_access_reg->csr.bit.initialize = old_initialize_bit;
                        return( FAILURE );
                }
                if( status == FAILURE ) {
                    pel_access_reg->csr.bit.initialize = old_initialize_bit;
                    return ( FAILURE );
                }
                /*
                ** calculate checksum, do not use checksum in the calculation
                ** 2's complement of the sum of the rest of the fields
                */
                for( i = 0; i != 64; i++)
                {
                        *ptr = read_eeprom( ee_number, i, &status);
                        if( status == FAILURE ) {
                            pel_access_reg->csr.bit.initialize = old_initialize_bit;
                            return ( FAILURE );
                        }
                        checksum += *ptr++;
                }
                if( checksum )
                {
                        *error = INVALID_NVRAM;
                        pel_access_reg->csr.bit.initialize = old_initialize_bit;
                        return( FAILURE );
                }
                pel_access_reg->csr.bit.initialize = old_initialize_bit;
                return( SUCCESS );
        }
        pel_acc    reg->csr.bit.initialize = old_initialize_bit;
        return( FAILURE );
}


u_short
lm_read_eeprom( ee_number, dab )
u_long ee_number;
DAB_EEPROM *dab;
{
u_long error;
        (void)bzero((char *)dab, sizeof(DAB_EEPROM));
        if( lm_e2prom_access( (char *)dab, (u_long) 0, ee_number, (u_long )sizeof(DAB_EEPROM) , MEMORY_VALIDATE, &error)==FAILURE)
        {
                /* Don't initialize the EEPROM on read errors.
                lm_e2prom_access( (char *)dab, (u_long) 0, ee_number, (u_long )sizeof(DAB_EEPROM) , MEMORY_INIT, &error).
                */
                return( FAILURE );
        }
        return( SUCCESS );
}

char trash = 'L';
u_short
```

Copyright 1989
Logic Modeling Systems

| SOURCE PROGRAM | DATE | PAGE # |
|---|---|---|
| os/lm_ee_access.c | 5/23/89 | 4/35 |
| | TIME 4:42:13 pm | |

LINE # SOURCE TEXT

```
lm_write_eeprom( ee_number, dab )
register u_long ee_number;
register DAB_EEPROM *dab;
{
u_long error;
u_short status;
DAB_EEPROM dab2;

        if( lm_e2prom_access( (char *)&dab2, (u_long) 0, ee_number,
                (u_long)sizeof(DAB_EEPROM), MEMORY_VALIDATE, &error)==FAILURE)
        {
                lm_e2prom_access( (char *)&dab2, (u_long) 0, ee_number,
                        (u_long )sizeof(DAB_EEPROM), MEMORY_INIT, &error);
        }

        dab->signature[ 0 ] = trash;
        dab->signature[ 1 ] = 'M';
        dab->signature[ 2 ] = 'S';
        dab->signature[ 3 ] = 'I';

        dab->write_count = read_eeprom( (u_char)ee_number,
                EEPROM_WRITE_COUNT, &status )+1;

        return( lm_e2prom_access( (char *)dab, (u_long) 0, ee_number,
                        (u_long)sizeof(DAB_EEPROM), MEMORY_WRITE, &error)).
}

u_short
lm_write_eeprom_ins_count( ee_number, count)
register u_long ee_number;
u_short count;
{
u_long error;
        return( lm_e2prom_access((char *)&count, (u_long) (E2_INS_COUNT ), ee_number, (u_long )sizeof(short) , MEMORY_WRITE, &error)),
}
```

Copyright 1989
Logic Modeling Systems

SOURCE PROGRAM os/lm_rd_wr.c | DATE 5/23/89 | TIME 4:42:14 pm | PAGE # 1/36

LINE # SOURCE TEXT

```c
/* SCCS_ID: lm_rd_wr.c rev 3.1, 4/24/89 at 07:46:57      */

/*
** process_lm_read()
** read modeler memory
*/

#include "common.h"
#include "cpu.h"
#include "lm_rd_wr.h"
#include "mod_err.h"
#include "nvram.h"
#include "id.h"
#include "eprom.h"
#include "duart.h"


extern u_short lm_cpuram_access();

extern u_short lm_nvram_access();
extern u_short lm_eprom_access();
extern u_short lm_idprom_access();
extern u_short lm_e2prom_access();
extern u_short lm_modeler_access();
extern u_short lm_cpureg_access();
extern u_short lm_duarta_access();
extern u_short lm_duartb_access();

static char init = 0;
static u_short (*rd_wr_routines[ LM_MAX_MEMORY ])();
static void
init_lm_rd_wr()
{
        rd_wr_routines[ LM_CPURAM_MEMORY ] = lm_cpuram_access;
        rd_wr_routines[ LM_NVSRAM_MEMORY ] = lm_nvram_access;
        rd_wr_routines[ LM_EPROM_MEMORY  ] = lm_eprom_access;
        rd_wr_routines[ LM_E2PROM_MEMORY ] = lm_e2prom_access;
        rd_wr_routines[ LM_IDPROM_MEMORY ] = lm_idprom_access;
        rd_wr_routines[ LM_MODELER_MEMORY ] = lm_modeler_access;
        rd_wr_routines[ LM_CPUREG_MEMORY ] = lm_cpureg_access;
        rd_wr_routines[ LM_DUARTA_MEMORY ] = lm_duarta_access;
        rd_wr_routines[ LM_DUARTB_MEMORY ] = lm_duartb_access;
        init= 1;
}

/*
** read from modeler memory space
*/
u_short
proc_lm_rd( memory_type, ee_number, offset, number_of_bytes, buffer, status)
register u_long memory_type;
register u_long ee_number;
register u_long offset;
register u_long number_of_bytes;
register char *buffer;
register u_long *status;
{
        /*
        ** Make sure function array is set up
        */
        if( init == 0 )
                init_lm_rd_wr();

        /*
        ** do error checking
        */
        if( memory_type > LM_MAX_MEMORY )
        {
                *status = INVALID_PARAMETER;
                return( FAILURE );
        }

        if( number_of_bytes > MAX_RD_WR_BUFFER_SIZE )
        {
                *status = INVALID_PARAMETER;
                return( FAILURE );
        }


        /*
        ** make the call
        */
        if( memory_type == LM_E2PROM_MEMORY )
                return((*rd_wr_routines[ LM_E2PROM_MEMORY ])( buffer, offset, ee_number,  number_of_bytes, MEMORY_READ, status ));
        else
                return((*rd_wr_routines[ memory_type ])( buffer, offset, number_of_bytes, MEMORY_READ, status));
}
/*
** write to modeler memory space
*/
u_short
proc_lm_wr( memory_type, ee_number, offset, number_of_bytes, buffer, status)
register u_long memory_type;
register u_long ee_number;
register u_long offset;
register u_long number_of_bytes;
register char *buffer;
register u_long *status;
{
        /*
        ** Make sure function array is set up
        */
        if( init == 0 )
                init_lm_rd_wr();

        /*
        ** do error checking
        */
        if( memory_type > LM_MAX_MEMORY )
        {
                *status = INVALID_PARAMETER;
                return( FAILURE );
        }

        if( number_of_bytes > MAX_RD_WR_BUFFER_SIZE )
        {
                *status = INVALID_PARAMETER;
                return( FAILURE );
        }
```

Copyright 1989 Logic Modeling Systems

SOURCE PROGRAM os/lm_rd_wr.c | DATE 5/23/89 | TIME 4:42:14 pm | PAGE # 2/37

SOURCE TEXT

```
        /*
        ** make the call
        */
        if( memory_type == _ _2PROM_MEMORY )
                return((*rd_wr_routines[ LM_E2PROM_MEMORY ])( buffer, offset, ee_number,  number_of_bytes, MEMORY_WRITE, status ));
        else
                return((*rd_wr_routines[ memory_type ])( buffer, offset, number_of_bytes, MEMORY_WRITE, status));
}
/*
** access CPU RAM
*/
u_short lm_cpuram_access( buffer, offset, number_of_bytes, option, status )
register u_long option;
register u_long offset;
register u_long number_of_bytes;
register char *buffer;
register u_long *status;
{
register char *src_ptr, *dst_ptr;

        if((offset + number_of_bytes) >= CPU_RAM_SIZE )
        {
                *status = NO_MEMORY;
                return( FAILURE );
        }
        /*
        ** set up pointers
        */
        if( option == MEMORY_READ )
        {
                src_ptr = (char *)(CPU_RAM + offset);
                dst_ptr = buffer;
        }

        if( option == MEMORY_WRITE )
        {
                dst_ptr = (char *)(CPU_RAM + offset);
                src_ptr = buffer;
        }
        /*
        ** Do the copy
        */
        while( number_of_bytes-- )
                *dst_ptr++ = *src_ptr++;

        return( SUCCESS );
}


/*
** access CPU eprom
*/
u_short lm_eprom_access( buffer, offset, number_of_bytes, option, status )
register u_long option;
register u_long offset;
register u_long number_of_bytes;
register char *buffer;
register u_long *status;
{
register char *src_ptr, *dst_ptr;
register  eprom_struct *eprom;

        if( option == MEMORY_WRITE )
        {
                *status = INVALID_PARAMETER;
                return( FAILURE );

        }
        eprom = (eprom_struct *)CPU_EPROM;
        if((offset + number_of_bytes) >= (CPU_EPROM + eprom->eprom_size))
        {
                *status = NO_MEMORY;
                return( FAILURE );
        }
        /*
        ** set up pointers
        */
        if( option == MEMORY_READ )
        {
                src_ptr = (char *)(CPU_EPROM + offset);
                dst_ptr = buffer;
        }

        /*
        ** Do the copy
        */
        while( number_of_bytes-- )
                *dst_ptr++ = *src_ptr++;

        return( SUCCESS );
}
/*
** access CPU idprom
*/
u_short lm_idprom_access( buffer, offset, number_of_bytes, option, status )
register u_long option;
register u_long offset;
register u_long number_of_bytes;
register char *buffer;
register u_long *status;
{
register char *src_ptr, *dst_ptr;
extern ID_PROM_CPU id_prom;

        if( option == MEMORY_WRITE )
        {
                *status = INVALID_PARAMETER;
                return( FAILURE );

        }

        if(( offset + number_of_bytes ) >= CPU_ID_PROM_SIZE)
        {
                *status = NO_MEMORY;
                return( FAILURE );
        }
        /*
        ** set up pointers
        */
```

Copyright 1989 Logic Modeling Systems

LINE # SOURCE TEXT

```
        if( option == MEMORY_READ )
        {
                src_ptr = ((char *) &id_prom) + offset;
                [illegible]r = buffer;
        }

        /*
        ** Do the copy
        */
        while( number_of_bytes-- )
                *dst_ptr++ = *src_ptr++;

        return( SUCCESS );
}

/*
** access modeler
*/
u_short lm_modeler_access( buffer, offset, number_of_bytes, option, status )
register u_long option;
register u_long offset;
register u_long number_of_bytes;
register char *buffer;
register u_long *status;
{
register char *src_ptr, *dst_ptr;

        /*
        ** set up pointers
        */
        if( option == MEMORY_READ )
        {
                src_ptr = (char *)(CPU_RAM + offset);
                dst_ptr = buffer;
        }

        if( option == MEMORY_WRITE )
        {
                dst_ptr = (char *)(CPU_RAM + offset);
                src_ptr = buffer;
        }
        /*
        ** Do the copy
        */
        while( number_of_bytes-- )
                *dst_ptr++ = *src_ptr++;

        return( SUCCESS );
}
/*
** access CPUreg
** At present this sets the PC.
*/
u_short lm_cpureg_access( buffer, offset, number_of_bytes, option, status )
register u_long option;
register u_long offset;
register u_long number_of_bytes;
register char *buffer;
register u_long *status;
{
register void (*execution_address)();
unsigned long err;
char mod_state;

        if( offset >= CPU_RAM_SIZE )
        {
                *status = NO_MEMORY;
                return( FAILURE );
        }
        /*
        ** set up pointers
        */
        if( option == MEMORY_READ )
        {
                *status = INVALID_PARAMETER;
                return( FAILURE );
        }

        if( option == MEMORY_WRITE )
        {
                if(lm_nvram_access(&mod_state, MODELER_STATE, SIZEOF_MODELER_STATE, MEMORY_READ,&err)==FAILURE)
                {
                        sys_out( "\nFailed to read NVram state");
                }
                if( mod_state != BOOTED )
                {
                        (void)disable_cache();
                        execution_address = (void(*)())offset;
                        (*execution_address)();
                }
        }
        return( FAILURE );
}
/*
** access DUART A
** At present this sets the DUART.
*/
u_short lm_duarta_access( buffer, offset, number_of_bytes, option, status )
register u_long option;
register u_long offset;
register u_long number_of_bytes;
register char *buffer;
register u_long *status;
{
        if( number_of_bytes != 1 )
        {
                *status = INVALID_PARAMETER;
                return( FAILURE );
        }
        switch( *buffer & 0xf )
        {
                case BAUD_110:  /* Baud rate 110   */
                case BAUD_300:  /* Baud rate 300   */
                case BAUD_1200: /* Baud rate 1200  */
                case BAUD_2400: /* Baud rate 2400  */
                case BAUD_4800: /* Baud rate 4800  */
                case BAUD_9600: /* Baud rate 9600  */
                        break;
                default:
                        *status = INVALID_PARAMETER;
```

| Copyright 1989 Logic Modeling Systems | SOURCE PROGRAM os/lm_rd_wr.c | DATE 5/23/89 TIME 4:42:14 pm | PAGE # 4/39 |
|---|---|---|---|

SOURCE TEXT

```
                        return( FAILURE );

        }
        /*
        ** set up pointers
        */
        if( option == MEMORY_READ )
        {
                *status = INVALID_PARAMETER;
                return( FAILURE );
        }
        /*
        ** set baud rate
        */
        if( option == MEMORY_WRITE )
        {
                CPU_DISABLE_INTERRUPTS;
                Uarta_init( *buffer );
                CPU_ENABLE_INTERRUPTS;
        }
        return( SUCCESS );
}
/*
** access DUART B
** At present this sets the DUART.
*/
u_short lm_duartb_access( buffer, offset, number_of_bytes, option, status )
register u_long option;
register u_long offset;
register u_long number_of_bytes;
register char *buffer;
register u_long *status;
{
        if( number_of_bytes != 1 )
        {
                *status = INVALID_PARAMETER;
                return( FAILURE );
        }
        switch( *buffer & 0xf )
        {
                case BAUD_110:  /* Baud rate 110   */
                case BAUD_300:  /* Baud rate 300   */
                case BAUD_1200: /* Baud rate 1200  */
                case BAUD_2400: /* Baud rate 2400  */
                case BAUD_4800: /* Baud rate 4800  */
                case BAUD_9600: /* Baud rate 9600  */
                        break;
                default:
                        *status = INVALID_PARAMETER;
                        return( FAILURE );

        }
        /*
        ** set up pointers
        */
        if( option == MEMORY_READ )
        {
                *status = INVALID_PARAMETER;
                return( FAILURE );
        }
        /*
        ** set baud rate
        */
        if( option == MEMORY_WRITE )
        {
                CPU_DISABLE_INTERRUPTS;
                Uartb_init( *buffer );
                CPU_ENABLE_INTERRUPTS;
        }
        return( SUCCESS );
}

lm_get_nvram_bauda(baud)
unsigned long *baud;
{
        unsigned long err;

        if(lm_nvram_access(baud, BAUD_RATEA, SIZEOF_BAUD_RATEA,
            MEMORY_READ, &err) == SUCCESS) {
                *baud >>= 24;
        } else {
                *baud = BAUD_96_12_24;
        }
}

lm_get_nvram_baudb(baud)
unsigned long *baud;
{
        unsigned long err;

        if(lm_nvram_access(baud, BAUD_RATEB, SIZEOF_BAUD_RATEB,
            MEMORY_READ, &err) == SUCCESS) {
                *baud >>= 24;
        } else {
                *baud = BAUD_24_96_12;
        }
}
```

Copyright 1989 Logic Modeling Systems

| SOURCE PROGRAM | DATE | PAGE # |
|---|---|---|
| os/malloc.c | 5/23/89 | 1/40 |
| | TIME 4:42:14 pm | |

LINE # SOURCE TEXT

```c
/* SCCS_ID: malloc.c rev 3.1, 4/24/89 at 07:47:00     */

/*
 * Allocator/Deallocator
 *    singly-linked, first-fit
 *    roving pointer, coalescing during allocation
 *    free call resets roving pointer to newly-freed block
 */

# define CHECK
# define ACCOUNT
# ifdef ACCOUNT
extern unsigned long available_malloc_size ; /* to track remaining memory */
# endif ACCOUNT
extern int malloc_semaphore ;
static int err ;
static unsigned long *rover = 0 ;

void
create_malloc_partition ( start , size )
  register char *start ;
  register unsigned long size ;
  { register unsigned long addr , end_addr ;
# ifdef CHECK
    if ( rover )
      { ( void ) printf ( "create_ called more than once\n" ) ;
        return ;
      }
# endif CHECK
# ifdef DEBUG
    ( void ) printf ( "init(%lx,%lu)\n" , ( unsigned long ) start , size ) ;
# endif DEBUG
    addr = ( unsigned long ) start ; /* get the start address */
    end_addr = addr + size ; /* address just past the arena */
    addr += 3 ; /* to round up to 4-byte boundary */
    addr ^= addr & 3 ; /* clear bottom 2 bits */
    end_addr ^= end_addr & 3 ; /* to round down to 4-byte boundary */
    rover = ( unsigned long * ) end_addr ; /* point past the arena */
    rover [ -1 ] = addr + 5 ; /* zero-length last block is busy */
    rover = ( unsigned long * ) addr ; /* initialize rover to first block-1 */
    *rover++ = end_addr ; /* link first block to last block */
  } /* create_malloc_partition */

static char *
allocate ( size )
  register unsigned long size ;
  { register unsigned long *save , *next ; /* to save our starting point */
    register unsigned long tmp_size ; /* temp to store a blocks size */
# ifdef CHECK
    if ( rover == 0 )
      return printf ( "allocate called before create_\n" ) , ( char * ) 0 ;
    if ( size == 0 )
      return printf ( "allocate called with zero size\n" ) , ( char * ) 0 ;
# endif CHECK
# ifdef DEBUG
    ( void ) printf ( "allo(%lu)=" , size ) ;
# endif DEBUG
    size += 3 ; /* to round up to a multiple of 4 */
    size ^= size & 3 ; /* clear bottom 2 bits */
    save = rover ; /* so we know when we have seen it all */
    do /* loop through blocks */
      { if ( rover [ -1 ] & 1 ) /* block is busy */
          rover = ( unsigned long * ) ( rover [ -1 ] - 1 ) ; /* to next block */
        else /* got a free block */
          { next = ( unsigned long * ) rover [ -1 ] ; /* check for coalescing */
            while ( ( next [ -1 ] & 1 ) == 0 ) /* repeatedly coalesce */
              { rover [ -1 ] = next [ -1 ] ; /* do the coalesce */
                next = ( unsigned long * ) rover [ -1 ] ; /* check next block */
              }
            tmp_size =
              rover [ -1 ] - ( unsigned long ) rover - 4 ; /* size of block */
            if ( tmp_size == size ) /* the block is exactly the right size */
              { save = rover ; /* save the pointer to be returned */
                rover = ( unsigned long * ) rover [ -1 ] ; /* to next block */
                ++save [ -1 ] ; /* mark this block as busy */
# ifdef ACCOUNT
                available_malloc_size -= size + 4 ;
# endif ACCOUNT
# ifdef DEBUG
                ( void ) printf ( "{1}%lx\n" , ( unsigned long ) save ) ;
# endif DEBUG
                return ( char * ) save ; /* there's the block requested */
              }
            else if ( tmp_size > size ) /* the block is larger than we need */
              { size >>= 2 ; /* change from a byte count to a word count */
                rover [ size ] = rover [ -1 ] ; /* create next block */
                rover [ -1 ] = ( unsigned long ) ( rover + ++size ) ; /* link */
                save = rover ; /* save the pointer to be returned */
                rover += size ; /* bump rover to next block */
                ++save [ -1 ] ; /* mark this block as busy */
# ifdef ACCOUNT
                available_malloc_size -= size << 2 ;
# endif ACCOUNT
# ifdef DEBUG
                ( void ) printf ( "{2}%lx\n" , ( unsigned long ) save ) ;
# endif DEBUG
                return ( char * ) save ; /* here's the block requested */
              }
            else /* the block is too small */
              rover = ( unsigned long * ) rover [ -1 ] ; /* to next block */
          }
      }
    while ( rover != save ) ; /* until we come back to where we started */
# ifdef DEBUG
    ( void ) printf ( "{0}NULL\n" ) ;
# endif DEBUG
    return 0 ; /* failure, no free blocks are large enough */
  } /* allocate */

static void
deallocate ( ptr )
  register char *ptr ;
  {
# ifdef CHECK
    register unsigned long addr ;
    if ( ptr == 0 )
      { ( void ) printf ( "NULL pointer passed to deallocate\n" ) ;
        return ;
      }
    addr = ( unsigned long ) ptr ;
```

Copyright 1989
Logic Modeling Systems

| SOURCE PROGRAM | DATE 5/23/89 | PAGE # |
|---|---|---|
| os/malloc.c | TIME 4:42:14 pm | 2/41 |

LINE # SOURCE TEXT

```
    if ( addr & 3 )
      { ( void ) printf ( "bad pointer passed to deallocate\n" ) ;
        return ;
      }
    rover = ( unsigned long * ) addr ;
    if ( ( rover [ -1 ] & 1 ) == 0 )
      { ( void ) printf ( "free block passed to deallocate\n" ) ;
        return ;
      }
# endif CHECK
# ifdef DEBUG
    ( void ) printf ( "free(%lx)\n" , ( unsigned long ) ptr ) ;
# endif DEBUG
    rover = ( unsigned long * ) ptr ; /* turn char pointer into long pointer */
    --rover [ -1 ] ; /* mark the passed block as free */
# ifdef ACCOUNT
    available_malloc_size += rover [ -1 ] - ( unsigned long ) rover ;
# endif ACCOUNT
  } /* deallocate */

char *
malloc ( size )
  register unsigned long size ;
  { register char *ret ;
    if ( sc_spend ( malloc_semaphore , 0 , &err ) , err )
      return printf ( "sc_spend() failed in malloc()\n" ) , ( char * ) 0 ;
    ret = allocate ( size ) ;
    if ( sc_spost ( malloc_semaphore , &err ) , err )
      ( void ) printf ( "sc_spost() failed in malloc()\n" ) ;
    return ret ;
  } /* malloc */

void
free ( ptr )
  register char *ptr ;
  { if ( sc_spend ( malloc_semaphore , 0 , &err ) , err )
      { ( void ) printf ( "sc_spend() failed in free()\n" ) ;
        return ;
      }
    deallocate ( ptr ) ;
    if ( sc_spost ( malloc_semaphore , &err ) , err )
      ( void ) printf ( "sc_spost() failed in free()\n" ) ;
  } /* free */

char *
realloc ( ptr , size )
  register char *ptr ;
  register unsigned long size ;
  { register char *new , *ret ;
    register unsigned long old ;
    register unsigned long *rov ;
# ifdef CHECK
    if ( ptr == 0 )
      { ( void ) printf ( "NULL pointer passed to realloc()\n" ) ;
        return 0 ;
      }
# endif CHECK
    if ( sc_spend ( malloc_semaphore , 0 , &err ) , err )
      return printf ( "sc_spend() failed in realloc()\n" ) , ( char * ) 0 ;
    rov = ( unsigned long * ) ptr ;
    old = rov [ -1 ] - ( unsigned long ) ptr - 5 ;
    deallocate ( ptr ) ;
    ret = new = allocate ( size ) ;
    if ( new == 0 )
      { ++rov [ -1 ] ;
# ifdef ACCOUNT
        available_malloc_size -= old + 4 ;
# endif ACCOUNT
      }
    else if ( new != ptr )
      { if ( old > size )
          old = size ;
        while ( old-- )
          *new++ = *ptr++ ;
      }
    if ( sc_spost ( malloc_semaphore , &err ) , err )
      ( void ) printf ( "sc_spost() failed in realloc()\n" ) ;
    return ret ;
  } /* realloc */

char *
calloc ( count , size )
  register unsigned long count , size ;
  { register char *ret ;
    ret = malloc ( count *= size ) ;
    if ( ret )
      bzero ( ret , count ) ;
    return ret ;
  } /* calloc */
```

Copyright 1989 Logic Modeling Systems

| SOURCE PROGRAM | DATE | PAGE # |
|---|---|---|
| os/mem_acc.c | 5/23/89 | 1/42 |
| | TIME 4:42:15 pm | |

SOURCE TEXT

```
/* SCCS_ID: mem_acc.c rev 1.1, 4/24/89 at 07:47:04     */

#include "common.h"
#include "lm_rd_wr.h"
#include "device.h"
#include "message.h"
#include "hardware.h"
#include "eeprom.h"
#include "lmserver.h"
#include "protass.h"
#include "lsetwork.h"
#include "network.h"

char read_err_buf[] = "Failure to read from the Modeler";
char write_err_buf[] = "Failure to write to the Modeler";

void
process_lm_read( user )
USER_INFO   *user;
{
#ifdef MODELER
register u_long memory_type;
register u_long ee_number;
register u_long offset;
register u_long number_of_bytes, i;
register char *err_msg;
char buffer[ MAX_RD_WR_BUFFER_SIZE ];
register char *buf_ptr = buffer;
u_long status;

        reset_obuf();
        lm_put_int(READ_ANS);
        memory_type     = lm_get_int();
        ee_number       = lm_get_int();
        offset          = lm_get_int();
        number_of_bytes = lm_get_int();
        /*
        ** read memory, and copy output buffer
        */
        if( proc_lm_rd( memory_type, ee_number, offset, number_of_bytes, buffer, &status) == FAILURE )
        {
                lm_put_int( 1 ); /* Failure */
                lm_put_char( ERROR_MSG );
                err_msg = read_err_buf;
                while(*err_msg)
                        lm_put_char( *err_msg++ );
                lm_put_char( 0 );
        }
        else
        {
                status=0;
                lm_put_int( status );
                for( i=0; i < number_of_bytes; ++i)
                        lm_put_char( *buf_ptr++ );
        }
        end_put(user->fd);
        return;
#else

        reset_obuf();
        lm_put_int(READ_ANS);
        lm_put_int( 0 ); /* status */
        lm_put_int( (u_long) FAILURE);
        end_put(user->fd);
        return;

#endif
}


void
process_lm_write( user )
USER_INFO   *user;
{

#ifdef MODELER
register u_long memory_type;
register u_long ee_number;
register u_long offset;
register char *err_msg;
register u_long number_of_bytes, i;
register char buffer[ MAX_RD_WR_BUFFER_SIZE ], *buf_ptr;
u_long status;

        reset_obuf();
        lm_put_int(WRITE_ANS);

        memory_type     = lm_get_int();
        ee_number       = lm_get_int();
        offset          = lm_get_int();
        number_of_bytes = lm_get_int();
        buf_ptr = buffer;
        for( i=0; i < number_of_bytes; ++i)
                *buf_ptr++ = lm_get_char();
        /*
        ** write to  memory, and copy status to output
        */
        if( proc_lm_[illegible]( memory_type, ee_number, offset, number_of_bytes, buffer, &status) == FAILURE )
        {
                lm_put_int(1); /* Failure */
                lm_put_char( ERROR_MSG );
                err_msg = write_err_buf;
                while(*err_msg)
                        lm_put_char( *err_msg++ );
                lm_put_char( 0 );
        }
        else
        {
                lm_put_int( 0 );
        }
        end_put(user->fd);
        return.
#else

        reset_obuf().
        lm_put_int(WRITE_ANS).
        lm_put_int( 0 ); /* status */
        lm_put_int( (u_long) FAILURE);
        end_put(user->fd);
        return.
```

Copyright 1989 Logic Modeling Systems

| SOURCE PROGRAM | DATE | TIME | PAGE # |
|---|---|---|---|
| os/mem_acc.c | 5/23/89 | 4:42:15 pm | 2/43 |

SOURCE TEXT

```
#endif
}
```

Copyright 1989 Logic Modeling Systems

| SOURCE PROGRAM | DATE | PAGE # |
|---|---|---|
| os/mod_err.c | 5/23/89 | 1/44 |
| | TIME 4:42:15 pm | |

LINE # SOURCE TEXT

```
/* SCCS_ID: mod_err.c rev 3.1, 4/24/89 at 07:47:08 */

#include "common.h"
#include "tmg.h"
#include "pac.h"
#include "magic.h"
#include "mod_def.h"
#include "pel.h"
#include "mod_err.h"
#include "cpu.h"
#include "nvram.h"
#include "lm_rd_wr.h"
#include "vrtx.h"

char    buffer[256];

LM_HARDWARE_ERROR modeler_error;

PAC *pacptr[] = {
                (PAC *)( LANE_A_OFFSET + PAC_REG_OFFSET),
                (PAC *)( LANE_B_OFFSET + PAC_REG_OFFSET),
                (PAC *)( LANE_C_OFFSET + PAC_REG_OFFSET),
                (PAC *)( LANE_D_OFFSET + PAC_REG_OFFSET)
                };
u_char  play_completed_flag= 0;
extern u_short lm_read_probe(), lm_nvram_access();
extern void reset_cpu(), output_routine();
void disable_mod_err();
extern TMG *tmgptr;
extern u_char   post_end_of_play;
extern  int     play_semaphore;
static char unknown_source_of_interrupt = 0;
void
mod_error_isr()
{
unsigned long error;
int err;
PEL pel_access_reg;
PEL *pel_access_reg_ptr;
u_short junk, j, i;
u_short k, lanes_enable, lanes_short, multi_lanes;
register char fatal = 0, found_source_of_interrupt = 0;
u_char   found_pel_error;
        /*
        ** initialize some variables.
        */
        lanes_enable = lanes_short = 0;
        ++play_completed_flag;
        /*
        ** bump count of unknown errors, then set to 0 if source is found.
        */
        if(tmgptr -> pattern_intr_enable == 1 && post_end_of_play == 1 )
        {
                sc_gpost( play_semaphore, &err );
                if( err != VRTX_OK)
                {
                        printf("Error posting in mod_error_isr() status=%x\n",err);
                }
        }
        /*
        ** did we get a error on the lanes
        */
        if( tmgptr -> lane_intr == 0)
        {
                if(tmgptr->backplane_mode == 0 && tmgptr -> pattern_intr_enable == 1)
                {
                        /*
                        ** This happens if we get EOP without errors
                        printf("EOP interrupt without any lanes having fault\n");
                        */
                        tmgptr -> pattern_intr_enable = 0;
                        /*
                        ** EOP interrupt.
                        */
                        found_source_of_interrupt=1;
                        /*
                        ** we know source.
                        */
                        unknown_source_of_interrupt = 0;
                        return;
                }
        }
        else {
                /*
                output_routine("SE\n");
                */
                modeler_error.error = 1;
        }
        /*
        ** see if, TMG is driving ERROR*
        */
        if( tmgptr -> tmg_intr || tmgptr -> backplane_error )
        {
                /*output_routine("TMG error interrupt\n");*/
                modeler_error.tmg_error = 1;
                /*
                ** if tmg error, read and store tmg error latches
                */
                if( tmgptr -> tmg_intr == 1)
                {
                        /*
                        ** read and store tmg error latches
                        */
                        modeler_error.lane_enable = tmgptr -> lane_enable;
                        /*
                        ** determine if it was a multi lane play
                        ** since shorts can cause sync problems with multi lane
                        ** play.
                        */
                        lanes_enable = (u_short ) modeler_error.lane_enable;
                        multi_lanes = lanes_enable & 1;
                        multi_lanes += (lanes_enable >> 1) & 1;
                        multi_lanes += (lanes_enable >> 2) & 1;
                        multi_lanes += (lanes_enable >> 3) & 1;
                        modeler_error.lane_b_pel_control = tmgptr -> lane_b_pel_control;
                        modeler_error.lane_b_data_valid = tmgptr -> lane_b_data_valid;
                        modeler_error.lane_a_pel_control = tmgptr -> lane_a_pel_control;
                        modeler_error.lane_a_data_valid = tmgptr -> lane_a_data_valid;
                        modeler_error.lane_d_pel_control = tmgptr -> lane_d_pel_control;
                        modeler_error.lane_d_data_valid = tmgptr -> lane_d_data_valid;
```

Copyright 1989
Logic Modeling Systems

SOURCE PROGRAM os/mod_err.c | DATE 5/23/89 | TIME 4:42:15 pm | PAGE # 2/45

SOURCE TEXT

```
                        modeler_error.lane_c_pel_control = tmgptr -> lane_c_pel_control;
                        modeler_error.lane_c_data_valid = tmgptr -> lane_c_data_valid;
                }
                tmgptr -> backplane_error = 0;
                tmgptr -.    g_intr_clearL = 0;

                if (lm_tmg_clocken() == FAILURE)
                        reset_cpu_on_fatal_error();

                while( i++ < 0x8000 );

                if (lm_tmg_clockoff() == FAILURE)
                        reset_cpu_on_fatal_error();

                tmgptr -> tmg_intr_clearL = 1;

                /*
                sprintf(buffer, "1: %d %x\n" ,
                        tmgptr->tmg_intr, tmgptr->lane_intr);
                output_routine(buffer);
                */
                /*
                ** which lanes have error
                */
                modeler_error.lane_errors |= tmgptr -> lane_intr;
                /*
                ** this is a fatal condition
                */
                fatal = 1;
                /*
                ** found an error
                */
                found_source_of_interrupt=1;
        }
        i = 0;
        /*
        ** Check to see if we are
        ** stuck in presentation mode
        */
        while( tmgptr -> backplane_mode == 1)
        {
                /*
                ** delay a while before trying
                ** give up if we can not resolve in two tries.
                */
                while( i++ < 0x8000 );
                /*
                ** go abort play
                */
                lm_tmg_abort_play();
                if( i++ > 0x8002 && tmgptr -> backplane_mode == 1)
                {
                        modeler_error.tmg_error = 1;
                        /*
                        ** save in NVaram
                        */
                        (void)lm_nvaram_access((char *) &modeler_error, HARDWARE_ERROR, SIZEOF_HARDWARE_ERROR, MEMORY_WRITE,&error);
                        reset_cpu(BACKPLANE_ERROR);
                }
                /*
                ** found an error
                */
                found_source_of_interrupt=1;
        }

        /*
        sprintf(buffer, "2: %d %x\n" ,
                tmgptr->tmg_intr, tmgptr->lane_intr);
        output_routine(buffer);
        */
        /*
        ** which lanes have error
        */
        modeler_error.lane_errors |= tmgptr -> lane_intr;
        /*
        ** go check PAC and PEL
        ** PAC first
        */
        for( i=0; i !=4 ; i++)
        {
                /*
                ** is there any hardware there
                */
                if(!( tmgptr -> lane_intr & ( 1 << i )))
                                continue;
                if(lm_read_probe( (u_long *) (pacptr[ i ]) ) == SUCCESS )
                {
                        /*
                        ** This is fatal refresh error
                        */
                        if( pacptr[ i ] -> refresh_error == 1)
                        {
                                modeler_error.pac_lane_errors |= 1 << i;
                                modeler_error.pac_error[ i ].pac_refresh_error = 1;
                                fatal = 1;
                                /*output_routine("refresh error\n");*/
                        }
                        /*
                        ** This is fatal request error
                        */
                        if( pacptr[ i ] -> request_error == 1)
                        {
                                modeler_error.pac_lane_errors |= 1 << i;
                                modeler_error.pac_error[ i ].pac_request_error = 1;
                                fatal = 1;
                                /*output_routine("request error\n");*/
                        }
                        /*
                        ** This is fatal pattern error
                        */
                        if( pacptr[ i ] -> pattern_error == 1)
                        {
                                modeler_error.pac_lane_errors |= 1 << i;
                                modeler_error.pac_error[ i ].pac_pattern_error = 1;
                                fatal = 1;
                                /*output_routine("pattern error\n");*/
                        }
                        /*
                        ** This is a fatal parity error
                        */
```

Copyright 1989 Logic Modeling Systems

| SOURCE PROGRAM | DATE | 5/23/89 | PAGE # |
|---|---|---|---|
| os/mod_err.c | TIME | 4:42:15 pm | 3/46 |

SOURCE TEXT

```
                if( pacptr[ i ] -> parity_error == 1)
                {
                        /*
                        ** The block where error was found
                        ** and branch address
                        */
                        modeler_error.pac_lane_errors |= 1 << i;
                        modeler_error.pac_error[ i ].pac_branch_address = pacptr[ i ] -> branch_address;
                        modeler_error.pac_error[ i ].pac_block_offset = pacptr[ i ] -> block_offset;
                        modeler_error.pac_error[ i ].pac_control_word_parity_error = 1;
                        fatal = 1;
                        /*output_routine("parity error\n");*/
                }
                /*
                ** There was a parity error on high word
                */
                if( pacptr[ i ] -> high_word_parity_error )
                {
                        /*
                        ** save the address where parity error was detected
                        */
                        modeler_error.pac_lane_errors |= 1 << i;
                        modeler_error.pac_error[ i ].pac_parity_error_address = pacptr[ i ] -> parity_error_address;
                        modeler_error.pac_error[ i ].pac_high_word_parity_error = 1;
                        fatal = 1;
                        /*output_routine(" High word parity error\n");*/
                }
                /*
                ** There was a parity error on low word
                */
                if( pacptr[ i ] -> low_word_parity_error )
                {
                        /*
                        ** save the address where parity error was detected
                        */
                        modeler_error.pac_lane_errors |= 1 << i;
                        modeler_error.pac_error[ i ].pac_parity_error_address = pacptr[ i ] -> parity_error_address;
                        modeler_error.pac_error[ i ].pac_low_word_parity_error = 1;
                        fatal = 1;
                        /*output_routine(" Low word parity error\n");*/
                }
                /*
                ** clear the errors, by writing to any bit in the register
                */
                pacptr[ i ] -> pattern_error = 0;
        }
        for(j = 0; j != 8; j++)
        {
                pel_access_reg_ptr = (PEL *) (pel_addr(i , j ));
                if(lm_read_probe((u_long *) pel_access_reg_ptr ) == FAILURE )
                        continue;
                pel_access_reg.car.reg = (u_short)pel_access_reg_ptr->car.reg;
                /*
                ** Check out the PEL
                */
                found_pel_error = FALSE;
                if(pel_access_reg.car.bit.errorL == 0)
                {
                        /*
                        sprintf(buffer, "I%04XI\n", pel_access_reg.car.reg);
                        output_routine(buffer);
                        */

                        if( pel_access_reg.car.bit.present == 1 )
                        {
                                /*
                                ** DAB is present
                                */
                                if( pel_access_reg.car.bit.active == 0)
                                {
                                        /*
                                        ** DAB plugged in but not active
                                           printf("DAB inserted\n");
                                           output_routine("I");
                                        */
                                        modeler_error.dab_change = 1;
                                        modeler_error.pel_error[i * 8 + j ].dab_inserted = 1;
                                        found_pel_error = TRUE;

                                }
                        }
                        else
                        {
                                /*
                                ** DAB is absent
                                */
                                if( pel_access_reg.car.bit.initialize == 1 )
                                {
                                        /*
                                        ** DAB was plugged in & set active
                                        ** but, since, then has been removed
                                           pristf("DAB removed\n");
                                           output_routine("Y");
                                        */
                                        lanes_short |= (u_short ) 1 << i;
                                        modeler_error.dab_change = 1;
                                        modeler_error.pel_error[ i * 8 + j ].dab_removed = 1;
                                        found_pel_error = TRUE;
                                }

                        }
                        /*
                        ** play error, either DAB not present or
                        ** PEL not active.
                        */
                        if( pel_access_reg.car.bit.play_errorL == 0)
                        {

                                /*output_routine("Play error\n");*/
                                lanes_short |= (u_short ) 1 << i;
                                modeler_error.pel_error[ i * 8 + j ].play_error = 1;
                                found_pel_error = TRUE;
                        }
                        if( pel_access_reg.car.bit.magic_errorL == 0)
                        {
                                for(k=0; k < 5; ++k)
                                {
                                        /*
                                        ** check parity
                                        */
```

Copyright 1989
Logic Modeling Systems

SOURCE TEXT

```
                                        if( pel_access_reg_ptr->magic_chip[ k ].m.parity_out != 0)
                                        {
                                                /*output_routine("pel parity error\n");*/
                                                modeler_error.pel_error[ i * 8 + j ].any_magic_parity = 1;
                                                modeler_error.pel_error[ i * 8 + j ].magic_parity_out |= 1 << k;
                                                if(lm_read_probe( (u_long *) (pacptr[ i ]) ) == SUCCESS )
                                                {
                                                        modeler_error.pac_error[ i ].pac_branch_address = pacptr[ i ] -> branch_addres
                                                        s;
                                                        modeler_error.pac_error[ i ].pac_block_offset = pacptr[ i ] -> block_offset;
                                                }
                                                fatal = 1;
                                        }
                                        /*
                                        ** check shorts
                                        */
                                        if((junk = pel_access_reg_ptr->magic_chip[ k ].m.short_sample) != 0)
                                        {
                                                /*output_routine("pel short error\n");*/
                                                lanes_short |= (u_short ) 1 << i;
                                                modeler_error.pel_error[ i * 8 + j ].any_magic_short = 1;
                                                modeler_error.pel_error[ i * 8 + j ].magic_short[ k ] = junk;
                                        }
                                }
                                /*
                                ** reset MAGIC chip
                                */
                                junk = pel_access_reg_ptr->magic_chip[ 0 ].m.reset;
                                found_pel_error = TRUE;
                        }
                        /*
                        ** do reset PEL
                        */
                        if (found_pel_error == TRUE) {
                          /*
                          sprintf(buffer, "RST: %d %d\n", i,j);
                          output_routine(buffer);
                          */

                          /* Reset the PEL only if we really find
                           * the source of interrupt.
                           */
                          pel_access_reg_ptr->car.bit.resetL=0;
                          /*
                           ** found source of error, error with PEL
                           */
                          modeler_error.pel_error_list |= 1 << ( i * 8 + j );
                        }
                        else {
                          /* Toggle Reset to clear the PEL error */
                          pel_access_reg_ptr->car.bit.resetL=0;
                          pel_access_reg_ptr->car.bit.resetL=1;
                        }
                        found_source_of_interrupt=1;
                }
        }
}
if(!tmgptr -> lane_intr)
{
        tmgptr -> lane_intr_enable = 0;
        tmgptr -> lane_intr_enable = 1;
        /*
        ** no one is driving error.
        */
        found_source_of_interrupt=1;
}
if( fatal == 1)
{
        /*
        ** found source of error, but it was fatal.
        */
        found_source_of_interrupt=1;
        if(modeler_error.tmg_error == 1 &&
                (( lanes_enable & lanes_short ) && multi_lanes > 1))
                modeler_error.tmg_error = 0;
        else
        {
                /*
                ** save in NVaram
                */
                (void)lm_nvram_access((char *) &modeler_error,
                        HARDWARE_ERROR, SIZEOF_HARDWARE_ERROR,
                        MEMORY_WRITE,&error);
                reset_cpu(BACKPLANE_ERROR);
        }

}
if( found_source_of_interrupt == 1 )
{
        unknown_source_of_interrupt = 0;
}
else
{
        if( unknown_source_of_interrupt++ > 2 )
        {
                (void)disable_mod_err();
                printf("Unknown source of backplane interrupt\n");
                modeler_error.unknown_source_of_interrupt=1;
        }
}
}

void
enable_mod_err()
{
        cpu_control_reg_struct  *p_cpu_cntl_reg = (cpu_control_reg_struct *) CPU_CONTROL_REG;
        /*
        printf("enable_mod_err()\n");
        ** enable clock board interrupts
        */
        p_cpu_cntl_reg->tmg_intr_ena = 1;
}

void
disable_mod_err()
{
        cpu_control_reg_struct  *p_cpu_cntl_reg = (cpu_control_reg_struct *) CPU_CONTROL_REG;
        /*
        printf("disable_mod_err()\n");
        ** enable clock board interrupts
```

Copyright 1989
Logic Modeling Systems

| SOURCE PROGRAM | DATE | PAGE # |
| --- | --- | --- |
| os/mod_err.c | 5/23/89 | 5/48 |
| | TIME 4:42:15 pm | |

LINE # SOURCE TEXT

```
        */
        p_cpu_cntl_reg->tmg_intr_ena = 0;
}

reset_cpu_on_fatal_error()
{
        unsigned long error;
        /*
        ** save in NVram
        */

        (void)lm_nvram_access((char *) &modeler_error, HARDWARE_ERROR, SIZEOF_HARDWARE_ERROR, MEMORY_WRITE,&error);
        reset_cpu(BACKPLANE_ERROR);
}
```

Copyright 1989 Logic Modeling Systems

| SOURCE PROGRAM | DATE | TIME | PAGE # |
|---|---|---|---|
| os/nvsram.c | 5/23/89 | 4:42:16 pm | 1/49 |

SOURCE TEXT

```
/* SCCS_ID: nvsram.c rev 3.1, 4/24/89 at 07:47:12     */

/*
** Routines to access NVSRAM
*/
#include "common.h"
#include "cpu.h"
#include "lm_rd_wr.h"
#include "mod_err.h"
#include "nvsram.h"
#include "duart.h"

char modeler_state = 0; /* undefined */

static char sram_init = 0;
char  lm_valid_nvsram = FALSE;

/*
 *  Compute checksum of NVSRAM, passed pointer to start, returns as u_long
 */
u_long
nvsram_compute_checksum(sram)
u_long *sram;
{
    register u_short i;
    register u_long checksum;

    checksum = 0;
    for(i = 0 ; i < (CPU_NVSRAM_SIZE / 4); i++)
    {
        checksum += (*sram & 0xff000000);
        sram++;
    }
    /*
    ** return 2's complement
    */
    return (((~checksum) & 0xff000000) + 0x01000000);
}

u_short
lm_nvsram_access(data_struct, field, sizeof_field, option, error)
register char *data_struct;
register u_long field;
register u_long sizeof_field, option;
register u_long *error;
{
        u_short version;
        register u_long *sram = (u_long *) (CPU_NVSRAM + field);
        cpu_control_reg_struct  *p_cpu_cntl_reg = (cpu_control_reg_struct *) CPU_CONTROL_REG;
        register u_long checksum;
        register u_short i;
        *error = NO_NVRAM_ERROR;

        /*
        ** if reading or writing we have valid sram
        ** and sram acess is within bounds
        */
        if(option == MEMORY_READ || option == MEMORY_WRITE)
        {
                if((field + sizeof_field) > CPU_NVSRAM_SIZE)
                {
                        *error = NO_NVRAM;
                        return (FAILURE);
                }
                if(!sram_init)
                {
                        *error = INVALID_NVRAM;
                        return (FAILURE);
                }
        }

        switch (option)
        {
            case MEMORY_READ:
                /*
                ** perform read
                */
                for(i = 0; i < sizeof_field; i++)
                {
                        *data_struct++ = (u_char) (*sram >> 24);
                        sram++;
                }
                return (SUCCESS);
            case MEMORY_WRITE:
                /*
                ** perform write
                */
                p_cpu_cntl_reg->nvsram_write_ena = 1;
                for(i = 0; i < sizeof_field; i++)
                {
                        *sram++ = (u_long) *data_struct << 24;
                        data_struct++;
                }
                /*
                ** setup pointer again
                */
                sram = (u_long *) (CPU_ ~VSRAM + CHECKSUM);
                /*
                ** clear previous checksum, calculate, and store
                */
                *sram = 0;
                checksum = nvsram_compute_checksum(sram);
                *sram = checksum;
                p_cpu_cntl_reg->nvsram_write_ena = 0;
                return (SUCCESS);
            case MEMORY_INIT:
                /*
                ** Initialize Sram
                */
                p_cpu_cntl_reg->nvsram_write_ena = 1;
                /*
                ** write signature
                */
                sram = (u_long *) (CPU_NVSRAM + BSIG);
                *sram++ = (u_long) 'l' << 24;
                *sram++ = (u_long) 'm' << 24;
                *sram++ = (u_long) 's' << 24;
                *sram++ = (u_long) 'i' << 24;
                /*
                ** initialize rest of SRAM to 0
```

Copyright 1989
Logic Modeling Systems

SOURCE PROGRAM
os/nvsram.c

DATE 5/23/89
TIME 4:42:16 pm

LINE # SOURCE TEXT

```
                */
                for(i = 4 ;i < (CPU_NVSRAM_SIZE / 4); i++)
                        *sram++ = 0;
                /*
                ** set up BAUD rat.
                */
                sram = (u_long *) CPU_NVSRAM;
                *(u_long *) ((int) sram + BAUD_RATEA) =
                    (u_long) (BAUD_96_12_24 << 24);
                *(u_long *) ((int) sram + BAUD_RATEB) =
                    (u_long) (BAUD_24_96_12 << 24);
                /*
                ** compute and store checksum
                */
                checksum = nvsram_compute_checksum(sram);
                *(u_long *) ((int) sram + CHECKSUM) = checksum;

                sram_init = 1;
                p_cpu_cntl_reg->nvsram_write_ena = 0;
                return (SUCCESS);
            case MEMORY_VALIDATE:
                /*
                ** validate NVRAM signature
                */
                sram = (u_long *) (CPU_NVSRAM + BSIG);
                /*
                ** check for sram initialized, but without a boot
                ** structure
                */
                if(((*sram >> 24)!= 'L')
                || ((*(sram+1) >> 24)!= 'M')
                || ((*(sram+2) >> 24)!= 'S')
                || ((*(sram+3) >> 24)!= 'I'))
                {
                        *error = INVALID_NVRAM;
                        return (FAILURE);
                }


                /*
                ** calculate checksum and verify
                */
                checksum = nvsram_compute_checksum((u_long *) CPU_NVSRAM);
                if (checksum != 0)
                {
                        *error = INVALID_NVRAM;
                        return (FAILURE);
                }
                sram_init = 1;
                /*
                ** validate NVRAM version.
                */
                version = (u_short) *(u_char *) (CPU_NVSRAM + BVER + 1*4);
                if( version < EPROM_NVSRAM_VERSION ) {
                        *error = STALE_HOST_SOFTWARE;
                        return( FAILURE );
                }
                else if( version > EPROM_NVSRAM_VERSION ) {
                        *error = STALE_EPROM_SOFTWARE;
                        return( FAILURE );
                }
                lm_valid_nvsram = TRUE;
                return (SUCCESS);
            case MEMORY_DIAG_INIT:
                sram_init = 1;
                return (SUCCESS);
            default:
                return (FAILURE);
        }
}
```

Copyright 1989
Logic Modeling Systems

SOURCE PROGRAM os/parity.c

DATE 5/23/89 TIME 4:42:16 pm PAGE # 1/51

SOURCE TEXT

```
/* SCCS_ID: parity.c rev 3.1, 4/24/89 at 07:47:16    */

/*
** Parity error handler
**
*/
#include "common.h"
#include "cpu.h"
#include "mod_err.h"
#include "nvram.h"
#include "lm_rd_wr.h"
extern u_short lm_nvram_access();
extern void output_routine(), reset_cpu();
parity_error()
{
        register cpu_control_reg_struct *control_reg = (cpu_control_reg_struct *) CPU_CONTROL_REG;
        register cpu_par_err_reg *parity_reg = (cpu_par_err_reg *) CPU_PAR_ERR_REG, parity;
        u_long error;
        char buffer[ 100 ];

                parity = *parity_reg;
                if (control_reg->not_parity_intr == 0)
                {
                    sprintf(buffer, "Parity error addr = %08x\n",
                        parity_reg->error_addr * 4);
                        output_routine(buffer);
                    sprintf(buffer, "68020 %d VME %d LANCE %d\n",
                        parity_reg->not_68020_master,
                        parity_reg->not_VME_master,
                        parity_reg->not_LANCE_master);
                        output_routine(buffer);
                    sprintf(buffer, "hi %d um %d lm %d lo %d\n",
                        parity_reg->not_error_hi,
                        parity_reg->not_error_um,
                        parity_reg->not_error_lm,
                        parity_reg->not_error_lo);
                        output_routine(buffer);
                        (void)lm_nvram_access((char *) parity_reg, PARITY_ERR , SIZEOF_PARITY_ERR, MEMORY_WRITE,&error);
                        control_reg->parity_force= 0;
                        reset_cpu(PARITY_ERROR);
                }
}
```

Copyright 1989
Logic Modeling Systems

| SOURCE PROGRAM | DATE | PAGE # |
|---|---|---|
| os/timer.c | 5/23/89 TIME 4:42:16 pm | 1/52 |

LINE # SOURCE TEXT

```
/* SCCS_ID: timer.c rev 3.1, 4/24/89 at 07:47:19      */

/*
** Initialize all three timers.
*/
#include "common.h"
#include "cpu.h"
#include "timer.h"

init_all_timer()
{
        unsigned long *timer;
        timer_control *timer_control_reg;
        timer_control timer_8254_control;

        /*
        ** set up timer 0
        */
        /*
        ** write the control register
        ** timer 0, write lsb then msb, use binary value for counter.
        */
        timer_8254_control.select_timer_counter = SELECT_TIMER_COUNTER0;
        timer_8254_control.R_W_timer_counter    = R_W_LSB_MSB_TIMER_CNTR;
        timer_8254_control.timer_mode           = TIMER_MODE3;
        timer_8254_control.bcd                  = BINARY;
        /*
        ** set up a pointer to the 8254 timer chip, control register
        ** and setup timer 0
        */
        timer_control_reg = (timer_control *) (CPU_TIMER + TIMER_CNTL_WORD);
        *timer_control_reg = timer_8254_control;
        /*
        ** write LSB then MSB counter regs to obtain 5 ms waveform
        ** ( 0x1400) = 1024000/ 200;
        */
        timer = (unsigned long *) (CPU_TIMER + TIMER_COUNTER0);
        *timer = 0x00000000;
        timer = (unsigned long *) (CPU_TIMER + TIMER_COUNTER0);
        *timer = 0x14000000;
        /*
        ** set up timer 1
        */
        /*
        ** write the control register
        ** timer 1, write lsb then msb, use binary value for counter.
        */
        timer_8254_control.select_timer_counter = SELECT_TIMER_COUNTER1;
        /*
        ** write to the 8254 timer chip, control register
        */
        *timer_control_reg = timer_8254_control;
        /*
        ** write LSB then MSB counter regs to obtain 5 ms waveform
        ** 320 ( 0x140 ) = 64000 / 200;
        */
        timer = (unsigned long *) (CPU_TIMER + TIMER_COUNTER1);
        *timer = 0x40000000;
        timer = (unsigned long *) (CPU_TIMER + TIMER_COUNTER1);
        *timer = 0x01000000;
        /*
        ** set up timer 2
        */
        /*
        ** write the control register
        ** set up timer mode 0
        ** This provides tick for s/w clock
        ** timer 2, write lsb then msb, use binary value for counter.
        */
        timer_8254_control.timer_mode           = TIMER_MODE0;
        timer_8254_control.select_timer_counter = SELECT_TIMER_COUNTER2;
        /*
        ** write to the 8254 timer chip, control register
        */
        *timer_control_reg = timer_8254_control;
        /*
        ** write LSB then MSB counter regs to obtain 5 ms waveform
        ** 320 ( 0x140 ) = 64000 / 200;
        */
        timer = (unsigned long *) (CPU_TIMER + TIMER_COUNTER2);
        *timer = 0x40000000;
        timer = (unsigned long *) (CPU_TIMER + TIMER_COUNTER2);
        *timer = 0x01000000;
}
/*
** setup timer 0 to trigger after time microseconds
*/
static u_short time_to_wait;
void
setup_timer0( time )
unsigned long time;
{
        unsigned long *timer;
        timer_control *timer_control_reg;
        timer_control timer_8254_control;

        /*
        ** set up timer 0
        */
        time_to_wait = time = ((1024000 / ( 1000000 / time)) & 0xffff)-1;
        /*
        ** write the control register
        ** timer 0, write lsb then msb, use binary value for counter.
        */
        timer_8254_control.select_timer_counter = SELECT_TIMER_COUNTER0;
        timer_8254_control.R_W_timer_counter    = R_W_LSB_MSB_TIMER_CNTR;
        timer_8254_control.timer_mode           = TIMER_MODE0;
        timer_8254_control.bcd                  = BINARY;
        /*
        ** set up a pointer to the 8254 timer chip, control register
        ** and setup timer 0
        */
        timer_control_reg = (timer_control *) (CPU_TIMER + TIMER_CNTL_WORD);
        *timer_control_reg = timer_8254_control;
        /*
        ** write LSB then MSB counter regs
        */
        timer = (unsigned long *) (CPU_TIMER + TIMER_COUNTER0);
        *timer = time << 24;
        timer = (unsigned long *) (CPU_TIMER + TIMER_COUNTER0).
```

Copyright 1989
Logic Modeling Systems

SOURCE PROGRAM os/timer.c | DATE 5/23/89 | TIME 4:42:16 pm | PAGE # 2/53

SOURCE TEXT

```
        *timer = time << 16;
}

/*
** return FAILURE if timer0 has not expired
** else SUCCESS
** must call setup_timer0( microseconds_to_time ),
** before checking.
*/
unsigned short
read_timer0(elapsed)
u_long *elapsed;
{
        counter_status timer_0_status, *ptr_timer_0_status = (counter_status *) (CPU_TIMER + TIMER_COUNTER0);
        timer_status *timer_status_reg;
        timer_status timer_8254_status;
        unsigned long *timer;
        u_short time;

        /*
        ** read timer 0 status
        ** The bits are not the same
        */
        timer_8254_status.read_back             = READ_BACK_TIMER;      /* READ BACK COMMAND */
        timer_8254_status.count_status          = READ_BACK_STATUS;     /* read status */
        timer_8254_status.counter               = READ_TIMER0;          /* timer 0 */
        timer_8254_status.zero                  = 0;                    /* must be 0 */
        /*
        ** set up a pointer to the 8254 timer chip, control register
        ** and setup timer 0
        */
        timer_status_reg = (timer_status *) (CPU_TIMER + TIMER_CNTL_WORD);
        *timer_status_reg = timer_8254_status;

        timer_0_status = *ptr_timer_0_status;

        if( timer_0_status.output == OUT_HIGH ) {
                return( SUCCESS );
        }
        else
        {
                /*
                ** read timer 0 count
                */
                timer_8254_status.read_back             = READ_BACK_TIMER;      /* READ BACK COMMAND */
                timer_8254_status.count_status          = READ_BACK_COUNT;      /* read count */
                timer_8254_status.counter               = READ_TIMER0;          /* timer 0 */
                timer_8254_status.zero                  = 0;                    /* must be 0 */
                *timer_status_reg = timer_8254_status;

                timer = (unsigned long *) (CPU_TIMER + TIMER_COUNTER0);

                time = (u_short)((*timer >> 24) & 0xff);
                time |= (u_short)((*timer >> 16) & 0xff00);
                time = time_to_wait - time;
                *elapsed = (u_long)time * 1000 / 1024;
                return( FAILURE );
        }
}
/*
** setup timer 1 to trigger after time microseconds
*/
void
setup_timer1( time )
unsigned long time;
{
        unsigned long *timer;
        timer_control *timer_control_reg;
        timer_control timer_8254_control;

        /*
        ** set up timer 1
        */
        time = ((64000 / ( 1000000 / time)) & 0xffff)-1;
        /*
        ** write the control register
        ** timer 1, write lsb then msb, use binary value for counter.
        */
        timer_8254_control.select_timer_counter = SELECT_TIMER_COUNTER1;
        timer_8254_control.R_W_timer_counter    = R_W_LSB_MSB_TIMER_CNTR;
        timer_8254_control.timer_mode           = TIMER_MODE0;
        timer_8254_control.bcd                  = BINARY;
        /*
        ** set up a pointer to the 8254 timer chip, control register
        ** and setup timer 1
        */
        timer_control_reg = (timer_control *) (CPU_TIMER + TIMER_CNTL_WORD);
        *timer_control_reg = timer_8254_control;
        /*
        ** write LSB then MSB counter regs
        */
        timer = (unsigned long *) (CPU_TIMER + TIMER_COUNTER1);
        *timer = time << 24;
        timer = (unsigned long *) (CPU_TIMER + TIMER_COUNTER1);
        *timer = time << 16;
}

/*
** return FAILURE if timer0 has not expired
** else SUCCESS
** must call setup_timer1( microseconds_to_time ),
** before checking.
*/
unsigned short
read_timer1( )
{
        counter_status timer_1_status, *ptr_timer_1_status = (counter_status *) (CPU_TIMER + TIMER_COUNTER1),
        timer_status *timer_status_reg;
        timer_status timer_8254_status,

        /*
        ** read timer 1 status
        ** The bits are not the same
        */
        timer_8254_status.read_back             = READ_BACK_TIMER;      /* READ BACK COMMAND */
        timer_8254_status.count_status          = READ_BACK_STATUS;     /* read status */
        timer_8254_status.counter               = READ_TIMER1,          /* timer 1 */
        timer_8254_status.zero                  = 0;                    /* must be 0 */
        /*
        ** set up a pointer to the 8254 timer chip, control register
```

Copyright 1989
Logic Modeling Systems

| SOURCE PROGRAM | DATE | PAGE # |
|---|---|---|
| os/timer.c | 5/23/89 | 3/54 |
| | TIME 4:42:16 pm | |

SOURCE TEXT

```
        ** and setup timer 1
        */
        timer_status_reg = (timer_status *) (CPU_TIMER + TIMER_CNTL_WORD);
        *timer_status_reg = timer_8254_status;

        timer_1_status = *ptr_timer_1_status;

        if( timer_1_status.output == OUT_HIGH )
                return( SUCCESS );
        else
        {
                return( FAILURE );
        }
}
```

Copyright 1989 Logic Modeling Systems

| SOURCE PROGRAM | DATE | TIME | PAGE # |
|---|---|---|---|
| os/vrtxkeys.c | 5/23/89 | 4:42:16 pm | 1/55 |

LINE # SOURCE TEXT

```
/* SCCS_ID: vrtxkeys.c rev 1.1, 4/24/89 at 07:47:22      */

int key_hit;

#define GET_KEY 1
#define SIZEOFARRAY 0x1f /* MUST ALWAYS BE A POWER OF 2 minus 1*/
static  char in_ptr = 0, out_ptr = 0, count_keys = 0, array[SIZEOFARRAY+1];

/*
** buffer up keys, as they arrive
** this is a task and it should be given the highest priority
** count_keys keeps track of keys.
*/
void
put_getc()
{
char ch;
long err;
        while( 1 )
        {
                ch = sc_getc();
                if( count_keys < SIZEOFARRAY )
                {
                        array[ in_ptr++ ] = ch;
                        in_ptr &= SIZEOFARRAY;
                        count_keys++;
                        count_keys &= SIZEOFARRAY;
                        sc_spost( key_hit, &err );
                        if( err )
                                printf( "error posting to semaphore");
                }
        }
}

/*
** stick around till a key is entered
*/
get_key( )
{
int err;
char ch;
        while( 1 )
        {
                sc_spend( key_hit, 0, &err);
                if( err )
                        printf( "error pending for semaphore" );
                if( count_keys )
                {
                        count_keys--;
                        ch = array[ out_ptr++ ];
                        out_ptr &= SIZEOFARRAY;
                        return( ch );
                }

        }
}


/*
** return number of unprocessed keys
*/
check_key()
{
        return( count_keys );
}
```

Copyright 1989 Logic Modeling Systems

SOURCE PROGRAM misc/message.c

DATE 5/23/89 TIME 1:20:42 pm PAGE # 1/1

SOURCE TEXT

```
/* SCCS_ID: message.c ver 3.1, 4/24/89 at 07:37:13 */

#ifndef MODELER
/* On the host, get the definition for [illegible] f(). */
#include <stdio.h>
#endif
#include <errno.h>
#include <varargs.h>
/* On the modeler, get the definition for sprintf(). */
#include "common.h"
#include "message.h"

#ifdef VMS
#include        <descrip>
#endif

#define ABSOLUTE_MAXIMUM_MESSAGE        1024

typedef struct  message {
        u_short message_severity;
        char    *message_text;
        struct  message *next_message;
} MESSAGE;

static  u_short error_message_present = FALSE;
static  u_short warning_message_present = FALSE;

static  MESSAGE *start_of_message_list = (MESSAGE *) NULL;
static  MESSAGE *end_of_message_list = (MESSAGE *) NULL;

static  MESSAGE out_of_memory;
static  u_short no_memory_already_linked = FALSE;
static  char    *no_memory_message = "cannot allocate memory to store error/warning message";

static          error_count = 0;
static          warning_count = 0;

extern  void    link_message();
extern  void    queue_message();
extern  void    get_system_string();
extern  void    handle_out_of_memory();


/*VARARGS*/
void
lm_queue_message(va_alist)
va_dcl
{
        va_list args;
        u_long  type;
        char    *format;

        int     error_number;

        char    system_message[MAX_MESSAGE];
        char    lm_msg[ABSOLUTE_MAXIMUM_MESSAGE];


        va_start(args);
        type = (u_long) va_arg(args, u_long);

        if (type == VMS_ERROR_MSG || type == VMS_WARNING_MSG)
                error_number = va_arg(args, int);
        else if (type == SYS_ERROR_MSG || type == SYS_WARNING_MSG)
                error_number = errno;

        format = va_arg(args, char *);
        (void) vsprintf(lm_msg, format, args);
        va_end(args);

        if ( type == SYS_ERROR_MSG || type == SYS_WARNING_MSG ||
             type == VMS_ERROR_MSG || type == VMS_WARNING_MSG
           ) {
                get_system_string(error_number, system_message);
                (void) strcat(lm_msg, system_message);
        }

        if (type == ERROR_MSG || type == SYS_ERROR_MSG || type == VMS_ERROR_MSG) {
                ++error_count;   /* does not work if out of memory */
                error_message_present = TRUE;
                queue_message(ERROR_MSG, lm_msg);
        }
        else {
                ++warning_count;  /* does not work if out of memory */
                warning_message_present = TRUE;
                queue_message(WARNING_MSG, lm_msg);
        }
}


void
lm_flush_message_queue()
{
        register        MESSAGE *message;


        error_count = 0;
        warning_count = 0;
        error_message_present = FALSE;
        warning_message_present = FALSE;
        while(start_of_message_list != (MESSAGE *) NULL) {
                message = start_of_message_list;
                start_of_message_list = start_of_message_list->next_message;


                if (message == &out_of_memory) {
                        no_memory_already_linked = FALSE;
                }
                else {
                        (void) free(message->message_text);
                        (void) free((char *)message);
                }
        }
}


u_short
lm_dequeue_message(type, str)
u_short *type;
char    *str;
```

Copyright 1989 Logic Modeling Systems

SOURCE PROGRAM misc/message.c

DATE 5/23/89 TIME 1:20:42 pm PAGE # 2/2

LINE # SOURCE TEXT

```
{
        register        MESSAGE *old_message;


        if (start_of_message_list == (MESSAGE *) NULL) {
                error_message_present = FALSE;
                warning_message_present = FALSE;
                error_count = 0;
                error_count = 0;
                return(FAILURE);
        }

        *type = start_of_message_list->message_severity;
        (void) strcpy(str, start_of_message_list->message_text);
        if (*type == ERROR_MSG)
                --error_count;
        else
                --warning_count;

        old_message = start_of_message_list;
        start_of_message_list = start_of_message_list->next_message;

        if (old_message != &out_of_memory) {
                (void) free(old_message->message_text);
                (void) free((char *)old_message);
        }
        else {
                no_memory_already_linked = FALSE;
        }

        return(SUCCESS);
}

u_short
lm_remove_message(type, str)
u_short type;
char    *str;
{
        register        MESSAGE *message;
        register        MESSAGE *old_message;


        if (start_of_message_list == (MESSAGE *) NULL) {
                return(FAILURE);
        }

        message = start_of_message_list;
        old_message = start_of_message_list;
        while(message != (MESSAGE *)NULL) {
                if ( (type == message->message_severity) &&
                     (strcmp(message->message_text, str) == 0) )
                {
                        /* Unlink the message we are trying to get rid of */
                        old_message->next_message = message->next_message;

                        if (old_message == message)
                           start_of_message_list = old_message->next_message;

                        if (message != &out_of_memory) {
                                (void) free(message->message_text);
                                (void) free((char *)message);
                        }

                        if (--error_count == 0)
                                error_message_present = FALSE;
                        return(SUCCESS);
                }

                old_message = message;
                message = message->next_message;
        }

        return(FAILURE);
}

void
lm_message_types(errors, warnings)
u_short *errors;
u_short *warnings; .
{
        *errors = error_count;
        *warnings = warning_count;
}

static  void
get_system_string(error_number, str)
int     error_number;
char    *str;
{
#ifndef VMS
        extern  int     sys_nerr;
        extern  char    *sys_errlist[];


        if (error_number < 0)
                (void) sprintf(str, "");
        else if (error_number < sys_nerr)
                (void) sprintf(str, ": %s(%d)", sys_errlist[error_number], error_number);
        else (void) sprintf(str, ": (%d)", error_number);

#else /* VMS */

        {       unsigned short          message_length;
                unsigned long           status;
                unsigned long           flags = 0x0F;
                struct  dsc$descriptor  message_descriptor;
                struct {
                        unsigned char   reserved1;
                        unsigned char   fao_count;
                        unsigned char   user_value;
                        unsigned char   reserved2;
                }       status_struct;

                message_descriptor.dsc$b_class = DSC$K_CLASS_S;
                message_descriptor.dsc$b_dtype = DSC$K_DTYPE_T;
                message_descriptor.dsc$w_length = 256;  /* max VMS message */
                message_descriptor.dsc$a_pointer = str;

                status = SYS$GETMSG (error_number, &message_length,
                                &message_descriptor, flags, &status_struct);
```

Copyright 1989 Logic Modeling Systems

| SOURCE PROGRAM | DATE | PAGE # |
|---|---|---|
| misc/message.c | 5/23/89 | 3/3 |
| | TIME 1:20:42 pm | |

LINE # SOURCE TEXT

```
                if (! (status & 1))
                        LIBSSIGNAL (status);

                s[message_length] = '\0';    /* null terminate string */

        }
#endif /* VMS */
}


static  void
queue_message(severity, str)
u_short severity;
char    *str;
{
        register        int     length;
        register        MESSAGE *message;


        message = (MESSAGE *)malloc((unsigned)sizeof(MESSAGE));
        if (message == (MESSAGE *)NULL) {
                handle_out_of_memory();
                return;
        }

        message->message_severity = severity;

        if ((length=strlen(str)) >= 256) {
                length = 256;
                str[length] = '\0';
        }

        message->message_text = malloc((unsigned)(length+1));
        if (message->message_text == (char *) NULL) {
                free((char *)message);
                handle_out_of_memory();
                return;
        }

        (void) strcpy(message->message_text, str);

        link_message(message);
}


static  void
handle_out_of_memory()
{
        if (no_memory_already_linked == FALSE) {
                no_memory_already_linked = TRUE;
                out_of_memory.message_severity = ERROR_MSG;
                out_of_memory.message_text = no_memory_message;

                link_message(&out_of_memory);
        }
}


static  void
link_message(message)
MESSAGE *message;
{
        if (start_of_message_list == (MESSAGE *) NULL) {
                start_of_message_list = end_of_message_list = message;
        }
        else {
                end_of_message_list->next_message = message;
                end_of_message_list = message;
        }

        end_of_message_list->next_message = (MESSAGE *) NULL;
}
```

Copyright 1989 Logic Modeling Systems

| SOURCE PROGRAM | DATE | PAGE # |
|---|---|---|
| misc/resolve.c | 5/23/89 | 1/4 |
| | TIME 1:20:42 pm | |

SOURCE TEXT

```
/* SCCS_ID: resolve.c rev 3.4, 5/3/89 at 15:44:24 */

#ifndef VMS
#include        <sys/types.h>
#include        <sys/stat.h>
#ifdef  SYS5
#include        <dirent.h>
#else
#include        <sys/dir.h>
#endif
#include        <stdio.h>
#include        <ctype.h>
#include        "lm_sfi.h"
#include        "common.h"
#include        "message.h"

#define max_str 256

long    check_all_sub_dirs();
char    *getenv();


lm_check_path_variable (lm_path)
        char    *lm_path;

{       char    *p, *pos, dir[max_str], pathname[1024];
        char    *end_of_string;
        long    accessible;
        char    delimiter[max_str];
        long    status;
        struct  stat    dir_stat;


        /* get the path to search */

        p = (char *) getenv (lm_path);
        if (NULL == p) {
                lm_queue_message(ERROR_MSG, "environment variable \"%s\" is not defined ",
                                                lm_path);
                return(LM_ERROR);
        }

        if ((strlen (p) > sizeof (pathname))) {
                lm_queue_message(ERROR_MSG, "environment variable \"%s\" is too long ", lm_path);
                return(LM_ERROR);
        }

        (void) strcpy (pathname, p);
        p = pathname;
        end_of_string = pathname + strlen(pathname);


        /* find out if it's a colon or space seperated list */

        pos = (char *) strpbrk (pathname, " :");
        if (NULL == pos) pos = pathname + strlen(pathname);

        (void) strncpy (delimiter, pos, 1);
        delimiter[1] = NULL;


        /* look for the file in each element of the path */

        status = LM_SUCCESS;

        do {
                pos = (char *) strpbrk (p, delimiter);
                if (NULL == pos) pos = pathname + strlen(pathname);

                (void) strncpy (dir, p, pos-p);
                dir[pos-p] = NULL;
                p = pos + 1;

                accessible = lm_access(dir, 0);
                if (accessible != 0) {
                        lm_queue_message(WARNING_MSG, "directory \"%s\" in \"%s\" does not exist or cannot be accessed ", dir, lm_path);
                        status = LM_WARNING;
                } else {

                        stat (dir, &dir_stat);
                        if (!(dir_stat.st_mode & S_IFDIR)) {
                                lm_queue_message(WARNING_MSG, "\"%s\" in \"%s\" is not a directory ", dir, lm_path);
                                status = LM_WARNING;
                        }
                }

        } while (pos != end_of_string);

        return (status);
}


static int
lm_access (filename, read_flag)
        char    *filename;
        int     read_flag;
{

#ifdef SR9_7
#define shell_var       "SHELL"
#define aegis_shell     "/com/sh"


        /* Aegis filename resolution.  The file is assumed to be either  */
        /* (1) exactly as the user entered it (2) exactly as the user     */
        /* entered it, but with :x instead of X, (3) entirely uppercase   */
        /* on the disk (as distributed by LMSI) or (4) entirely lowercase */
        /* on the disk (default for files created under aegis 9.7).       */

        /* The user may completely ignore case sensitivity problems with  */
        /* the following exceptions:                                      */
        /*                                                                */
        /* 1) The file is mixed case on the disk                          */
        /* 2) The file is on a disk NFSed to a true Unix machine          */
        /*                                                                */
        /* in these cases, the filename must be entered as it resides on  */
        /* the disk.                                                      */

        if (getenv(shell_var) && (0 == strcmp(aegis_shell, getenv(shell_var)))) {
```

Copyright 1989 Logic Modeling Systems

SOURCE PROGRAM misc/resolve.c | DATE 5/23/89 | TIME 1:20:42 pm | PAGE # 2/5

SOURCE TEXT

```
		char	local_filename[max_str];  /* don't change the filename in here */
		char	old_local_filename[max_str];
		char	*filename_pointer;
		char	*old_filename;

		/* check the filename as entered by the user, if we find	*/
		/* it great, if not, keep hunting				*/

		if (0 == access (filename, read_flag))
			return(0);


		/* convert all uppercase to :lower, 'X' to ':x' for all	*/
		/* characters including the path.			*/

		strcpy (local_filename, filename);
		filename_pointer = local_filename;
		old_filename = filename;

		while (*old_filename) {
			if (isupper(*old_filename)) {
				*filename_pointer++ = ':';
				*filename_pointer++ = tolower(*old_filename++);
			} else
				*filename_pointer++ = *old_filename++;
		}

		*filename_pointer = NULL;

		if (0 == access(local_filename, read_flag)) {
			strcpy (filename, local_filename);
			return(0);
		}


		/* remove all ':'s (except '::'s) in the filename, NOT	*/
		/* the path, and try again.				*/

		filename_pointer = local_filename;
		if (strrchr(filename_pointer, '/'))
			filename_pointer = strrchr(filename_pointer, '/');

		while (*filename_pointer) {
			if ((*filename_pointer == ':') && (*(filename_pointer+1) != ':'))
				strcpy (filename_pointer, filename_pointer+1);
			filename_pointer++;
		}

		*filename_pointer = NULL;

		if (0 == access(local_filename, read_flag)) {
			strcpy (filename, local_filename);
			return(0);
		}


		/* add ':'s to all characters (assume all CAPS) in the	*/
		/* filename NOT the path, and try yet again.		*/

		strcpy(old_local_filename, local_filename);
		filename_pointer = local_filename;
		if (strrchr(filename_pointer, '/'))
			filename_pointer = strrchr(filename_pointer, '/');

		old_filename = old_local_filename;
		if (strrchr(old_filename, '/'))
			old_filename = strrchr(old_filename, '/');

		while (*old_filename) {
			if (isalpha(*old_filename)) {
				*filename_pointer ++ = ':';
			}
			*filename_pointer ++ = *old_filename ++;
		}

		*filename_pointer = NULL;

		if (0 == access(local_filename, read_flag)) {
			strcpy (filename, local_filename);
			return(0);
		}

	}
#endif

	/* if not running aegis 9.7, just return the access() */

	return (access (filename, read_flag));
}


lm_resolve_filename(lm_path, filename, return_filename, filename_size, read_flag)
	char	*lm_path, *filename, *return_filename;
	long	filename_size, read_flag;

{	char	*p, *pos, dir[max_str], pathname[1024];
	char	*end_of_string;
	long	accessible;
	char	delimiter[max_str];



	/* first, see if the file is accessible */

	accessible = lm_access(filename, (int) read_flag);
	(void) strncpy (return_filename, filename, (int) filename_size);
	if ((accessible == 0) && (!file_is_a_directory(filename))) return(LM_SUCCESS);

	/* If it's an absolute path and we're writing the file */
	/* check to see if the directory can be written to	*/

	if (('/' == filename[0]) && (read_flag == 2)) {
		(* (char *) strrchr (filename, '/')) = (char) NULL;
		accessible = lm_access(filename, (int) read_flag);
		if ((accessible == 0) && (!file_is_a_directory(filename))) return(LM_SUCCESS);
		return(LM_ERROR);
	}

	/* get the path to search */
```

Copyright 1989 Logic Modeling Systems

| SOURCE PROGRAM | DATE | PAGE # |
| --- | --- | --- |
| misc/resolve.c | 5/23/89 | 3/6 |
| | TIME 1:20:42 pm | |

SOURCE TEXT

```
        p = (char *) getenv (lm_path);
        if (NULL == p) {
                lm_queue_message(ERROR_MSG, "environment variable \"%s\" is not defined ",
                                                lm_path);

                return(LM_ERROR);
        }

        if ((strlen (p) > sizeof (pathname))) {
                lm_queue_message(ERROR_MSG, "environment variable \"%s\" is too long ", lm_path);
                return(LM_ERROR);
        }

        (void) strcpy (pathname, p);
        p = pathname;
        end_of_string = pathname + strlen(pathname);


        /* find out if it's a colon or space separted list */

        pos = (char *) strpbrk (pathname, " :");
        if (NULL == pos) pos = pathname + strlen(pathname);

        (void) strncpy (delimiter, pos, 1);
        delimiter[1] = NULL;


        /* look for the file in each element of the path */

        do {
                pos = (char *) strpbrk (p, delimiter);
                if (NULL == pos) pos = pathname + strlen(pathname);

                (void) strncpy (dir, p, pos-p);
                dir[pos-p] = NULL;
                p = pos + 1;
                (void) strcat (dir, "/");
                (void) strcat (dir, filename);

                accessible = lm_access(dir, (int) read_flag);

                if ((accessible == 0) && (!file_is_a_directory(dir))) {
                        (void) strncpy (return_filename, dir, (int) filename_size);
                        return (LM_SUCCESS);
                }
        } while (pos != end_of_string);

        /* if we get here, the file does not exist */
        /* which is OK if were going to create it  */

        if (2 == read_flag) {

                /* return the first directory that we can write to */

                p = (char *) getenv (lm_path);
                (void) strcpy (pathname, p);
                p = pathname;

                pos = (char *) strpbrk (pathname, " :");
                if (NULL == pos) pos = pathname + strlen(pathname);

                (void) strncpy (delimiter, pos, 1);
                delimiter[1] = NULL;

                do {
                        pos = (char *) strpbrk (p, delimiter);
                        if (NULL == pos) pos = pathname + strlen(pathname);

                        (void) strncpy (dir, p, pos-p);
                        dir[pos-p] = NULL;
                        p = pos + 1;

                        accessible = lm_access(dir, (int) read_flag);

                        if (accessible == 0) {
                                (void) strcat (dir, "/");
                                (void) strcat (dir, filename);
                                (void) strncpy (return_filename, dir, (int) filename_size);
                                return (LM_SUCCESS);
                        }
                } while (pos != end_of_string);

                /* if we get here, we couldn't find a directory to write to */

                lm_queue_message (ERROR_MSG,
                        "write permission denied on file \"%s\" in \"%s\" ",
                        filename, lm_path);
                return(LM_ERROR);

        }

        lm_queue_message(ERROR_MSG,
                "unable to find file \"%s\" in \"%s\" ", filename, lm_path);
        return (LM_ERROR);
}


lm_resolve_library_file(lm_path, target_filename, return_filename, filename_size)
        char    *lm_path, *target_filename, *return_filename;
        long    filename_size;

{       char    *p, *pos, dir[max_str], pathname[1024];
        char    file_name[max_str];
        char    *end_of_string;
        long    accessible, num_files;
        char    delimiter[max_str];

        /* first, check to see if the file is in the default directory */

        accessible = lm_access(target_filename, 0);
        (void) strncpy (return_filename, target_filename, (int) filename_size);
        if ((accessible == 0) && (!file_is_a_directory(target_filename))) return(LM_SUCCESS);

        /* Now, let's look down the LM_DIR path */

        p = (char *) getenv (lm_path);
        if (NULL == p) {
                lm_queue_message(ERROR_MSG, "environment variable \"%s\" is not defined ",
                                                lm_path);
                return(LM_ERROR);
```

Copyright 1989 Logic Modeling Systems

SOURCE PROGRAM misc/resolve.c

DATE 5/23/89 TIME 1:20:42 pm PAGE # 4/7

SOURCE TEXT

```
        }

        if ((strlen (p) > sizeof (pathname))) {
                lm_queue_message(ERROR_MSG, "environment variab[illegible]s\" is too long ", lm_path);
                return(LM_ERROR);
        }

        (void) strcpy (pathname, p);
        p = pathname;

        pos = (char *) strpbrk (pathname, " :");
        if (NULL == pos) pos = pathname + strlen(pathname);

        (void) strncpy (delimiter, pos, 1);
        delimiter[1] = NULL;

        /* look in each of the elements of the path */

        end_of_string = pathname + strlen(pathname);

        do {
                pos = (char *) strpbrk (p, delimiter);
                if (NULL == pos) pos = pathname + strlen(pathname);


                (void) strncpy (dir, p, pos-p);
                dir[pos-p] = NULL;
                p = pos + 1;
                (void) strcpy (file_name, dir);
                (void) strcat (file_name, "/");
                (void) strcat (file_name, target_filename);

                accessible = lm_access(file_name, 0);

                if ((accessible == 0) && (!file_is_a_directory(file_name))) {

                        (void) strncpy (return_filename, file_name, (int) filename_size);

                        /* we have found the file we're looking for in this     */
                        /* directory.  Now, check for the same file in a subdir */
                        /* if we find it, it's an error.                         */

                        if (0 != check_all_sub_dirs (dir, target_filename, return_filename, filename_size)) {
                                lm_queue_message(ERROR_MSG, "%s exists in more than one subdirectory of %s ",
                                        target_filename, dir);
                                return(LM_ERROR);
                        }

                        return (LM_SUCCESS);
                }

                /* We couldn't find the file in the directory, now check all */
                /* subdirectories.                                          */

                if (1 == (num_files = check_all_sub_dirs (dir, target_filename, return_filename, filename_size)))
                        return(LM_SUCCESS);

                if (num_files>1) {
                        if (0 != check_all_sub_dirs (dir, target_filename, return_filename, filename_size)) {
                                lm_queue_message(ERROR_MSG, "%s exists in more than one subdirectory of %s ",
                                        target_filename, dir);
                                return(LM_ERROR);
                        }
                }
        } while (pos != end_of_string);


        lm_queue_message (ERROR_MSG, "unable to find file \"%s\" in \"%s\" ", target_filename, lm_path);
        return (LM_ERROR);
}

static long
check_all_sub_dirs (dir, filename, return_file, ret_size)
        char    *dir;
        char    *filename;
        char    *return_file;
        long    ret_size;

{       long    num_files = 0;
        char    file[max_str];
        DIR     *dir_pointer;
        char    *found_dir_name;
#ifdef  SYS5
        struct  dirent  *dir_entry;
#else
        struct  direct  *dir_entry;
#endif

        dir_pointer = opendir (dir);
        if (NULL == dir_pointer) {
                lm_queue_message (WARNING_MSG, "Unable to open directory for reading: %s ", dir);
                return(-1);
        }

        while (NULL != (dir_entry = readdir(dir_pointer))) {
#ifdef  SR9_7
                found_dir_name = dir_entry->d_name + kludge_apollo_sys5_sr9_7();
#else   /* all m... sr9.7 systems */
                found_dir_name = dir_entry->d_name;
#endif  /* SR9_7 */

                if ( (strcmp (found_dir_name, ".") != 0) &&
                        (strcmp (found_dir_name, "..") != 0)) {

                        (void) strcpy (file, dir);
                        (void) strcat (file, "/");
                        (void) strcat (file, found_dir_name);
                        (void) strcat (file, "/");
                        (void) strcat (file, filename);
                        if (0 == lm_access(file, 0) && (!file_is_a_directory(file))) {
                                num_files++;
                                if (num_files == 1) {
                                        (void) strncpy (return_file, file, (int) ret_size);
                                        if (ret_size<strlen(file)) {
                                                lm_queue_message(ERROR_MSG,
                                                        "expanded filename too long for buffer");
                                                return(-1);
                                        }
                                }
                        }
```

Copyright 1989 Logic Modeling Systems

| SOURCE PROGRAM | DATE 5/23/89 | PAGE # |
|---|---|---|
| misc/resolve.c | TIME 1:20:42 pm | 5/8 |

LINE # SOURCE TEXT

```
		}
	}

	(void) closedir (dir_pointer);

	return (num_files);
}

#ifdef	SR9_7
/*
 * This routine determines whether we are executing in a SYS5 or BSD environment
 * by exploiting the fact that on SYS5 sprintf() returns a reasonable value
 * that equals the number of characters transfered into the buffer.  This is
 * opposed to BSD which returns the address of the output buffer.  We check to
 * see if sprintf() doesn't return the address of the buffer, thus indicating
 * a SYS5 runtime environment.
 *
 * This information is used to compensate for the difference in the definition
 * of the structure returned by readdir() in the SYS5 and BSD environments.
 * A lucky(?) turn of events is that in SR10.1, readdir() returns a structure
 * that is equivalent in both environments.
 */
static
kludge_apollo_sys5_sr9_7()
{
	char	buf[2];

	if ((int)sprintf(buf, "A") != (int)buf)
		return(2); /* SYS5 */
	else return(0); /* BSD */
}
#endif	/* SR9_7 */


static file_is_a_directory(filename)
	char	*filename;

{	struct	stat	filestat_buffer;

	stat(filename, &filestat_buffer);
	if (filestat_buffer.st_mode & S_IFDIR) return (SUCCESS);

	return (FAILURE);

}

#else /* VMS */

#include	"common.h"
#include	"message.h"
#include	"lm_sfi.h"
#include	<ssdef.h>
#include	<rmsdef.h>
#include	<descrip.h>

#define max_str 256

lm_check_path_variable (lm_path)
	char	*lm_path;

{

	if (NULL == (char *) getenv (lm_path)) {
		lm_queue_message(ERROR_MSG, "environment variable \"%s\" is not defined ",
							lm_path);
		return(LM_ERROR);
	}

	return(LM_SUCCESS);
}



lm_resolve_filename(lm_path, filename, return_filename, filename_size, read_flag)
	char	*lm_path, *filename, *return_filename;
	long	filename_size, read_flag;

{	int	context;
	int	status;
	struct	dsc$descriptor	filespec_descriptor;
	struct	dsc$descriptor	result_descriptor;
	char	filespec[max_str];
	struct	{
			short	size;
			char	result[max_str];
		}	ret_file;

	status = lm_check_path_variable (lm_path);
	if (status != LM_SUCCESS)
		return(status);

	strcpy (filespec, filename);

	filespec_descriptor.dsc$b_class = DSC$K_CLASS_S;
	filespec_descriptor.dsc$b_dtype = DSC$K_DTYPE_T;
	filespec_descriptor.dsc$w_length = strlen(filespec);
	filespec_descriptor.dsc$a_pointer = filespec;

	result_descriptor.dsc$b_class = DSC$K_CLASS_VS;
	result_descriptor.dsc$b_dtype = DSC$K_DTYPE_T;
	result_descriptor.dsc$w_length = sizeof(ret_file.result);
	result_descriptor.dsc$a_pointer = &ret_file;
	context = 0;

	status = lib$find_file (&filespec_descriptor, &result_descriptor, &context);

	if ((RMS$_NORMAL == status) || (SS$_NORMAL == status)) {
		ret_file.result[ret_file.size] = '\0';  /* NULL terminate the string */
		strncpy (return_filename, ret_file.result, filename_size);
		return(LM_SUCCESS);
	}

	strcpy (filespec, lm_path);
	strcat (filespec, ":");
	strcat (filespec, filename);

	if (read_flag != 0) {
		strncpy (return_filename, filespec, filename_size);
		return(LM_SUCCESS);
	}
```

Copyright 1989 Logic Modeling Systems

| SOURCE PROGRAM | DATE 5/23/89 | PAGE # |
|---|---|---|
| misc/resolve.c | TIME 1:20:42 pm | 6/9 |

SOURCE TEXT

```
        filespec_descriptor.dsc$b_class = DSC$K_CLASS_S;
        filespec_descriptor.dsc$b_dtype = DSC$K_DTYPE_T;
        filespec_descriptor.dsc$w_length = strlen(filespec);
        filespec_descriptor.dsc$a_po[illegible] filespec;

        result_descriptor.dsc$b_class = DSC$K_CLASS_VS;
        result_descriptor.dsc$b_dtype = DSC$K_DTYPE_T;
        result_descriptor.dsc$w_length = sizeof(ret_file.result);
        result_descriptor.dsc$a_pointer = &ret_file;
        context = 0;

        status = lib$find_file (&filespec_descriptor, &result_descriptor, &context);

        if (!((SS$_NORMAL == status) || (RMS$_NORMAL == status))) {
                lm_queue_message (VMS_ERROR_MSG, status,
                        "unable to find file \"%s\" in \"%s\" ", filename,
                        lm_path);
                return (LM_ERROR);
        }

        ret_file.result[ret_file.size] = '\0';  /* NULL terminate the string */
        strncpy (return_filename, ret_file.result, filename_size);
        return(LM_SUCCESS);

}


lm_resolve_library_file(lm_path, target_filename, return_filename, filename_size)
        char    *lm_path, *target_filename, *return_filename;
        long    filename_size;

{       int     context = 0;
        int     status;
        int     count;
        char    *p;
        int     i;

        struct  dsc$descriptor  filespec_descriptor;
        struct  dsc$descriptor  result_descriptor;
        char    filespec[max_str];
        struct  {
                        short   size;
                        char    result[max_str];
                }       ret_file;

        strcpy (filespec, target_filename);

        filespec_descriptor.dsc$b_class = DSC$K_CLASS_S;
        filespec_descriptor.dsc$b_dtype = DSC$K_DTYPE_T;
        filespec_descriptor.dsc$w_length = strlen(filespec);
        filespec_descriptor.dsc$a_pointer = filespec;

        result_descriptor.dsc$b_class = DSC$K_CLASS_VS;
        result_descriptor.dsc$b_dtype = DSC$K_DTYPE_T;
        result_descriptor.dsc$w_length = sizeof(ret_file);
        result_descriptor.dsc$a_pointer = &ret_file;

        status = lib$find_file (&filespec_descriptor, &result_descriptor, &context);

        if ((RMS$_NORMAL == status) || (SS$_NORMAL == status)) {
                ret_file.result[ret_file.size] = '\0';  /* NULL terminate the string */
                strncpy (return_filename, ret_file.result, filename_size);
                return(LM_SUCCESS);
        }

        else {
                strcpy (filespec, lm_path);
                strcat (filespec, ":[000000...]");
                strcat (filespec, target_filename);

                filespec_descriptor.dsc$b_class = DSC$K_CLASS_S;
                filespec_descriptor.dsc$b_dtype = DSC$K_DTYPE_T;
                filespec_descriptor.dsc$w_length = strlen(filespec);
                filespec_descriptor.dsc$a_pointer = filespec;

                context = 0;
                count = 0;

                do {
                        status = lib$find_file (&filespec_descriptor, &result_descriptor, &context);
                        if ((RMS$_NORMAL == status) || (SS$_NORMAL == status)) {
                                ret_file.result[ret_file.size] = '\0';  /* NULL terminate the string */
                                strncpy (return_filename, ret_file.result, filename_size);
                                count++;
                        }
                } while (context != 0);

                if (count == 0) {
                        lm_queue_message (VMS_ERROR_MSG, status,
                                "unable to find file \"%s\" in \"%s\" ",
                                target_filename, lm_path);
                        return (LM_ERROR);
                }

                if (count > 1) {
                        lm_queue_message (ERROR_MSG,
                                "%s exists in more than one subdirectory of %s ",
                                target_filename, lm_path);
                        return (LM_ERROR);
                }

                if (count == 1) {
                        for (i=0, p=return_filename; i<strlen(return_filename); i++, p++)
                                if (0 == strncmp(p, "][000000.", 9))
                                        strcpy (p, p+9);
                        for (i=0, p=return_filename; i<strlen(return_filename); i++, p++)
                                if (0 == strncmp(p, "[000000.", 8))
                                        strcpy (p, p+8);

                        return(LM_SUCCESS);
                }
        }
}

#endif
```

We claim:

1. A method for use in a hardware modeling system for determining if a pin of an electronic device or circuitry that is electrically coupled to a pin driver of the hardware modeling system is in a driving low state, the pin driver being individually programmable by software means to drive the pin according to one of a predetermined soft-drive high I/V characteristic curve and a predetermined soft-drive low I/V characteristic curve, comprising the steps of:

(a) programming the pin driver of the hardware modeling system to drive the pin according to the predetermined soft-drive low I/V characteristic curve;

(b) driving the pin with the pin driver of the hardware modeling system according to the predetermined soft-drive low I/V characteristic curve; and (c) while driving the pin, automatically determining if the voltage of the pin is below a reference voltage to indicate that the pin is in a driving low state, or if the voltage of the pin is above the reference voltage to indicate that the pin is in another state.

2. A method for use in a hardware modeling system for determining if a pin of an electronic device or circuitry that is electrically coupled to a pin driver of the hardware modeling system is in a non-driving state, the pin driver being individually programmable by software means to drive the pin according to one of a predetermined soft-drive high I/V characteristic curve and a predetermined soft-drive low I/V characteristic curve, comprising the steps of:

(a) programming the pin driver of the hardware modeling system to drive the pin according to the predetermined soft-drive low I/V characteristic curve;

(b) driving the pin with the pin driver of the hardware modeling system according to the predetermined soft-drive low I/V characteristic curve; and (c) while driving the pin, automatically determining if the voltage of the pin is between a first and a second reference voltage to indicate that the pin is in the non-driving state, or if the voltage of the pin is other than between the first and second reference voltages to indicate that the pin is in another state.

3. A method for use in a hardware modeling system for determining if a pin of an electronic device or circuitry that is electrically coupled to a pin driver of the hardware modeling system is in a non-driving state, the pin driver being individually programmable by software means to drive the pin according to one of a predetermined soft-drive high I/V characteristic curve and a predetermined soft-drive low I/V characteristic curve, comprising the steps of:

(a) programming the pin driver of the hardware modeling system to drive the pin according to the predetermined soft-drive low I/V characteristic curve;

(b) driving the pin with the pin driver of the hardware modeling system according to the predetermined soft-drive high I/V characteristic curve; and (c) while driving the pin, automatically determining if the voltage of the pin is between a first and a second reference voltage to indicate that the pin is in the non-driving state, or if the voltage of the pin is other than between the first and second reference voltages to indicate that pin is in another state.

4. A method for use in a hardware modeling system for determining if a pin of an electronic device or circuitry that is electrically coupled to a pin driver of the hardware modeling system is in a driving high state, the pin driver being individually programmable by software means to drive the pin according to one of a predetermined soft-drive high I/V characteristic curve and a predetermined soft-drive low I/V characteristic curve, comprising the steps of:

(a) programming the pin driver of the hardware modeling system to drive the pin according to the predetermined soft-drive high I/V characteristic curve;

(b) driving the pin with the pin driver of the hardware modeling system according to the predetermined soft-drive high I/V characteristic curve; and (c) while driving the pin, automatically determining if the voltage of the pin is above a reference voltage to indicate that the pin is in a driving high state, or if the voltage of the pin is below the reference voltage to indicate that the pin is in another state.

5. A method for use in a hardware modeling system for determining if a pin of an electronic device or circuitry that is electrically coupled to a pin driver of the hardware modeling system is in a driving low state, non-driving state, or driving high state, the pin driver being individually programmable by software means to drive the pin according to one of a predetermined soft-drive high I/V characteristic curve and a predetermined soft-drive low I/V characteristic curve, comprising the steps of:

(a) programming the pin driver of the hardware modeling system to drive the pin according to the predetermined soft-drive low I/V characteristic curve;

(b) driving the pin with the pin driver of the hardware modeling system according to the predetermined soft-drive low I/V characteristic curve; and (c) while driving the pin, automatically determining if the voltage of the pin is below a first reference voltage to indicate that the pin is in the driving low state, or if the voltage of the pin is between the first reference voltage and a second reference voltage to indicate that the pin is in the non-driving state, or if the voltage of the pin is above the second reference voltage to indicate that the pin is in the driving high state.

6. A method for use in a hardware modeling system for determining if a pin of an electronic device or circuitry that is electrically coupled to a pin driver of the hardware modeling system is in a driving low state, non-driving state, or driving high state, the pin driver being individually programmable by software means to drive the pin according to one of a predetermined soft-drive high I/V characteristic curve and a predetermined soft-drive low I/V characteristic curve, comprising the steps of:

(a) programming the pin driver of the hardware modeling system to drive the pin according to the predetermined soft-drive high I/V characteristic curve;

(b) driving the pin with the pin driver of the hardware modeling system according to the predetermined soft-drive high I/V characteristic curve; and (c) while driving the pin, automatically determining if the voltage of the pin is below a first reference voltage to indicate that the pin is in the driving low state, or if the voltage of the pin is between the first reference voltage and a second reference voltage to indicate that the pin is in the non-driving state, or if the voltage of the pin is above the second reference voltage to indicate that the pin is in the driving high state.

7. A method for use in a hardware modeling system for determining if a pin of an electronic device or circuitry that is electrically coupled to a pin driver of the hardware modeling system is in a driving low state or non-driving state, the pin driver being individually programmable by software means to drive the pin according to a predetermined soft-drive high I/V characteristic curve or a predetermined soft-drive low I/V characteristic curve, comprising the steps of:

(a) programming the pin driver of the hardware modeling system to drive the pin according to the predetermined soft-drive low I/V characteristic curve;
(b) driving the pin with the pin driver of the hardware modeling system according to the predetermined soft-drive low I/V characteristic curve; and
(c) while driving the pin, automatically determining if the voltage of the pin is below a first reference voltage to indicate that the pin is in the driving low state, or if the voltage of the pin is between the first reference voltage and a second reference voltage to indicate that the pin is in the non-driving state.

8. A method for use in a hardware modeling system for determining if a pin of an electronic device or circuitry that is electrically coupled to a pin driver of the hardware modeling system is in a driving high state or non-driving state, the pin driver being individually programmable by software means to drive the pin according to a predetermined soft-drive high I/V characteristic curve or a predetermined soft-drive low I/V characteristic curve, comprising the steps of:

(a) programming the pin driver of the hardware modeling system to drive the pin according to the predetermined soft-drive high I/V characteristic curve;
(b) driving the pin with the pin driver of the hardware modeling system according to the predetermined soft-drive high I/V characteristic curve; and
(c) while driving the pin, automatically determining if the voltage of the pin is above a first reference voltage to indicate that the pin is in the driving high state, or if the voltage of the pin is between the first reference voltage and a second reference voltage to indicate that the pin is in the non-driving state.

9. A method for use in a hardware modeling system for determining if a pin of an electronic device or circuitry that is electrically coupled to a pin driver of the hardware modeling system is in a driving low state, the pin driver being individually programmable by software means to drive the pin according to one of a predetermined soft-drive high I/V characteristic curve and a predetermined soft-drive low I/V characteristic curve, comprising the steps of:

(a) programming the pin driver of the hardware modeling system to drive the pin according to the predetermined soft-drive low I/V characteristic curve;
(b) driving the pin with the pin driver of the hardware modeling system according to the predetermined soft-drive low I/V characteristic curve; and
(c) while driving the pin, automatically determining if the current into the pin is greater that the reference current to indicate that the pin is in a driving low state, or if the current into the pin is less than the reference current to indicate the pin is in another state.

10. A method for use in a hardware modeling system for determining if a pin of an electronic device or circuitry that is electrically coupled to a pin driver of the hardware modeling system is in a non-driving state, the pin driver being individually programmable by software means to drive the pin according to one of a predetermined soft-drive high I/V characteristic curve and a predetermined soft-drive low I/V characteristic curve, comprising the steps of:

(a) programming the pin driver of the hardware modeling system to drive the pin according to the predetermined soft-drive low I/V characteristic curve;
(b) driving the pin with the pin driver of the hardware modeling system according to the predetermined soft-drive low I/V characteristic curve; and
(c) while driving the pin, automatically determining if the current into the pin is between a first and a second reference current to indicate that the pin is in the non-driving state, or if the current into the pin is other than between the first and second reference currents to indicate that the pin is in another state.

11. A method for use in a hardware modeling system for determining if a pin of an electronic device or circuitry that is electrically coupled to a pin driver of the hardware modeling system is in a non-driving state, the pin driver being individually programmable by software means to drive the pin according to a predetermined soft-drive high I/V characteristic curve or a predetermined soft-drive low I/V characteristic curve, comprising the steps of:

(a) programming the pin driver of the hardware modeling system to drive the pin according to the predetermined soft-drive high I/V characteristic curve;
(b) driving the pin with the pin driver of the hardware modeling system according to the predetermined soft-drive high I/V characteristic curve; and
(c) while driving the pin, automatically determining if the current into the pin is between a first and a second reference current to indicate that the pin is in the non-driving state, or if the current into the pin is other than between the first and second reference currents to indicate that the pin is in another state.

12. A method for use in a hardware modeling system for determining if a pin of an electronic device or circuitry that is electrically coupled to a pin driver of the hardware modeling system is in a driving high state, the pin driver being individually programmable by software means to drive the pin according to a predetermined soft-drive high I/V characteristic curve or a predetermined soft-drive low I/V characteristic curve, comprising the steps of:

(a) programming the pin driver of the hardware modeling system to drive the pin according to the predetermined soft-drive high I/V characteristic curve;
(b) driving the pin with the pin driver of the hardware modeling system according to the predetermined soft-drive high I/V characteristic curve; and
(c) while driving the pin, automatically determining if the current into the pin is less than a reference current to indicate that the pin is in a driving high state, or if the current into the pin is greater than the reference current to indicate that the pin is in another state.

13. A method for use in a hardware modeling system for determining if a pin of an electronic device or circuitry that is electrically coupled to a pin driver of the hardware modeling system is in a driving low state, non-driving state, or driving high state, the pin driver being individually programmable by software means to drive the pin according to a predetermined soft-drive high I/V characteristic curve or a predetermined soft-drive low I/V characteristic curve, comprising the steps of:

(a) programming the pin driver of the hardware modeling system to drive the pin according to the predetermined soft-drive low I/V characteristic curve;
(b) driving the pin with the pin driver of the hardware modeling system according to the predetermined soft-drive low I/V characteristic curve; and
(c) while driving the pin, automatically determining if the current into the pin is greater than a first reference current to indicate that the pin is in the driving low state, or if the current into the pin is between the first and a second reference current to indicate that the pin is in the non-driving state, or if the current into the pin is less than the second reference current to indicate that the pin is in the driving high state.

14. A method for use in a hardware modeling system for determining if a pin of an electronic device or circuitry that is electrically coupled to a pin driver of the hardware modeling system is in a driving low state, non-driving state, or driving high state, the pin driver being individually programmable by software means to drive the pin according to a predetermined soft-drive high I/V characteristic curve or a predetermined soft-drive low I/V characteristic curve, comprising the steps of:

(a) programming the pin driver of the hardware modeling system to drive the pin according to the predetermined soft-drive high I/V characteristic curve;
(b) driving the pin with the pin driver of the hardware modeling system according to the predetermined soft-drive high I/V characteristic curve; and
(c) while driving the pin, automatically determining if the current into the pin is greater than a first reference current to indicate that the pin is in the driving low state, or if the current into the pin is between the first and a second reference current to indicate that the pin is in the non-driving state, or if the current into the pin is less than the second reference current to indicate that the pin is in the driving high state.

15. A method for use in a hardware modeling system for determining if a pin of an electronic device or circuitry that is electrically coupled to a pin driver of the hardware modeling system is in a driving low state or non-driving state, the pin driver being individually programmable by software means to drive the pin according to a predetermined soft-drive high I/V characteristic curve or a predetermined soft-drive low I/V characteristic curve, comprising the steps of:

(a) programming the pin driver of the hardware modeling system to drive the pin according to the predetermined soft-drive low I/V characteristic curve;
(b) driving the pin with the pin driver of the hardware modeling system according to the predetermined soft-drive low I/V characteristic curve; and
(c) while driving the pin, automatically determining if the current into the pin is greater than a first reference current to indicate that the pin is in the driving low state, or if the current into the pin is between the first and a second reference current to indicate that the pin is in the non-driving state.

16. A method for use in a hardware modeling system for determining if a pin of an electronic device or circuitry that is electrically coupled to a pin driver of the hardware modeling system is in a driving high state or non-driving state, the pin driver being individually programmable by software means to drive the pin according to a predetermined soft-drive high I/V characteristic curve or a predetermined soft-drive low I/V characteristic curve, comprising the steps of:

(a) programming the pin driver of the hardware modeling system to drive the pin according to the predetermined soft-drive high I/V characteristic curve;
(b) driving the pin with the pin driver of the hardware modeling system according to the predetermined soft-drive high I/V characteristic curve; and
(c) while driving the pin, automatically determining if the current into the pin is less than a first reference current to indicate that the pin is in the driving high state, or if the current into the pin is between the first and a second reference current to indicate that the pin is in the non-driving state.

17. The method as recited in claim 1, 2, 3, 4, 5, 6, 7, or 8, wherein the method further comprises the step of selecting one of the soft-drive low I/V characteristic curve and the soft-drive high I/V characteristic curve to program the pin driver according to a state of simulated circuitry connected to the pin in a simulated circuit design.

18. The method as recited in claim 9, 10, 11, 12, 13, 14, 15, or 16, wherein the method further comprises the step of selecting one of the soft-drive low I/V characteristic curve and the soft-drive high I/V characteristic curve to program the pin driver according to a state of simulated circuitry connected to the pin in a simulated circuit design.

19. The method as recited in claim 1, 2, 3, 4, 5, 6, 7, 8, 9, 10, 11, 12, 13, 14, 15, or 16, wherein the method further comprises the step of determining simultaneously the states of a plurality of pins of an electronic device or circuitry that are electrically coupled to software programmable pin drivers of the hardware modeling systems.

20. The method as recited in claim 19, wherein the pin drivers that are electrically coupled to the pins are collectively programmable to drive with the predetermined soft-drive high I/V characteristic curve or predetermined soft-drive low I/V characteristic curve.

21. The method as recited in claim 1, 2, 3, 4, 5, 6, 7, or 8, wherein the reference voltages are software programmable by the hardware modeling system.

22. The method as recited in claim 17, wherein the reference voltages are software programmable by the hardware modeling system.

23. The method as recited in claim 19, wherein the reference voltages are software programmable by the hardware modeling system.

24. The method as recited in claim 20, wherein the reference voltages are software programmable by the hardware modeling system.

25. The method as recited in claim 1, 2, 3, 4, 5, 6, 7, or 8, wherein reference voltages are hardware programmable by the hardware modeling system.

26. The method as recited in claim 17, wherein the reference voltages are hardware programmable by the hardware modeling system.

27. The method as recited in claim 19, wherein the reference voltages are hardware programmable by the hardware modeling system.

28. The method as recited in claim 20, wherein the reference voltages are hardware programmable by the hardware modeling system.

29. The method as recited in claim 9, 10, 11, 12, 13, 14, 15, or 16, wherein the reference currents are software programmable by the hardware modeling system.

30. The method as recited in claim 18, wherein the reference currents are software programmable by the hardware modeling system.

31. The method as recited in claim 19, wherein the reference currents are software programmable by the hardware modeling system.

32. The method as recited in claim 20, wherein the reference currents are software programmable by the hardware modeling system.

33. The method as recited in claim 9, 10, 11, 12, 13, 14, 15, or 16, wherein the reference currents are hardware programmable by the hardware modeling system.

34. The method as recited in claim 18, wherein the reference currents are hardware programmable by the hardware modeling system.

35. The method as recited in claim 19, wherein the reference currents are hardware programmable by the hardware modeling system.

36. The method as recited in claim 20, wherein the reference currents are hardware programmable by the hardware modeling system.

37. A method for use in a hardware modeling system for determining if a pin of an electronic device or circuitry that is electrically coupled to a pin driver of the hardware modeling system is in a driving low state, the pin driver being individually programmable by software means to drive the pin toward a logic high or a logic low, comprising the steps of:

(a) programming the pin driver of the hardware modeling system to drive the pin toward the logic low;
(b) driving the pin with the pin driver of the hardware modeling system toward the logic low; and
(c) while driving the pin, automatically determining if the voltage of the pin is below a reference voltage to indicate that the pin is in the driving low state, or if the voltage of the pin is above the reference voltage to indicate that the pin is in another state.

38. A method for use in a hardware modeling system for determining if a pin of an electronic device or circuitry that is electrically coupled to a pin driver of the hardware modeling system is in a non-driving state, the pin driver being individually programmable by software means to drive the pin toward one of a logic low and a logic high, comprising the steps of:

(a) programming the pin driver of the hardware modeling system to drive the pin toward the logic low;
(b) driving the pin with the pin driver of the hardware modeling system toward the logic low; and
(c) while driving the pin, automatically determining if the voltage of the pin is between a first and a second reference voltage to indicate that the pin is in the non-driving state, or if the voltage of the pin is other than between the first and second reference voltages to indicate that the pin is in another state.

39. A method for use in a hardware modeling system for determining if a pin of an electronic device or circuitry that is electrically coupled to a pin driver of the hardware modeling system is in a non-driving state, the pin driver being individually programmable by software means to drive the pin toward one of a logic low and a logic high, comprising the steps of:

(a) programming the pin driver of the hardware modeling system to drive the pin toward the logic high;
(b) driving the pin with the pin driver of the hardware modeling system toward the logic high; and
(c) while driving the pin, automatically determining if the voltage of the pin is between a first and a second reference voltage to indicate that the pin is in the non-driving state, or if the voltage of the pin is other than between the first and second reference voltages to indicate that the pin is in another state.

40. A method for use in a hardware modeling system for determining if a pin of an electronic device or circuitry that is electrically coupled to a pin driver of the hardware modeling system is in a driving high state, the pin driver being individually programmable by software means to drive the pin towards a logic low or a logic high, comprising the steps of:

(a) programming the pin driver of the hardware modeling system to drive the pin toward the logic high;
(b) driving the pin with the pin driver of the hardware modeling system toward the logic high; and
(c) while driving the pin, automatically determining if the voltage of the pin is above a reference voltage to indicate that the pin is in the driving high state, or if the voltage of the pin is below the reference voltage to indicate that the pin is in another state.

41. A method for use in a hardware modeling system for determining if a pin of an electronic device or circuitry that is electrically coupled to a pin driver of the hardware modeling system is in a driving low state, non-driving state, or driving high state, the pin driver being individually programmable by software means to drive the pin toward a logic high or a logic low, comprising the steps of:

(a) programming the pin driver of the hardware modeling system to drive the pin toward the logic low;
(b) driving the pin with the pin driver of the hardware modeling system toward the logic low; and
(c) while driving the pin, automatically determining if the voltage of the pin is below a first reference voltage to indicate that the pin is in the driving low state, or if the voltage of the pin is between the first and a second reference voltage to indicate that the pin is in the non-driving state, or if the voltage of the pin is above the second reference voltage to indicate that the pin is in the driving high state.

42. A method for use in a hardware modeling system for determining if a pin of an electronic device or circuitry that is electrically coupled to a pin driver of the hardware modeling system is in a driving low state, non-driving state, or driving high state, the pin driver being individually programmable by software means to drive the pin toward a logic high or a logic low, comprising the steps of:

(a) programming the pin driver of the hardware modeling system to drive the pin toward the logic high;
(b) driving the pin with the pin driver of the hardware modeling system toward the logic high; and
(c) while driving the pin, automatically determining if the voltage of the pin is below a first reference voltage to indicate that the pin is in the driving low state, or if the voltage of the pin is between a first and a second reference voltage to indicate that the pin is in the non-driving state, or if the voltage of the pin is above the second reference voltage to indicate that the pin is in the driving high state.

43. A method for use in a hardware modeling system for determining if a pin of an electronic device or circuitry that is electrically coupled to a pin driver of the hardware modeling system is in a driving low state or non-driving state, the pin driver being individually programmable by software means to drive the pin toward a logic high or a logic low, comprising the steps of:

(a) programming the pin driver of the hardware modeling system to drive the pin toward the logic low;

(b) driving the pin with the pin driver of the hardware modeling system toward the logic low; and (c) while driving the pin, automatically determining if the voltage of the pin is below a first reference voltage to indicate that the pin is in the driving low state, or if the voltage of the pin is between the first and a second reference voltage to indicate that the pin is in the non-driving state.

44. A method for use in a hardware modeling system for determining if a pin of an electronic device or circuitry that is electrically coupled to a pin driver of the hardware modeling system is in a driving high state or non-driving state, the pin driver being individually programmable by software means to drive the pin toward a logic high or a logic low, comprising the steps of:

(a) programming the pin driver of the hardware modeling system to drive the pin toward the logic high;

(b) driving the pin with the pin driver of the hardware modeling system toward the logic high; and (c) while driving the pin, automatically determining if the voltage of the pin is above a first reference voltage to indicate that the pin is in the driving high state, or if the voltage of the pin is between the first and a second reference voltage to indicate that the pin is in the non-driving state.

45. A method for use in a hardware modeling system for determining if a pin of an electronic device or circuitry that is electrically coupled to a pin driver of the hardware modeling system is in the driving low state, the pin driver being individually programmable by software means to drive the pin toward a logic high or a logic low, comprising the steps of:

(a) programming the pin driver of the hardware modeling system to drive the pin toward the logic low;

(b) driving the pin with the pin driver of the hardware modeling system toward the logic low; and (c) while driving the pin, automatically determining if the current into the pin is greater than a reference circuit to indicate that the pin is in the driving low state, or if the current into the pin is less than the reference current to indicate that the pin is in another state.

46. A method for use in a hardware modeling system for determining if a pin of an electronic device or circuitry that is electrically coupled to a pin driver of the hardware modeling system is in a non-driving state, the pin driver being individually programmable by software means to drive the pin toward a logic low or a logic high, comprising the steps of:

(a) programming the pin driver of the hardware modeling system to drive the pin toward the logic low;

(b) driving the pin with the pin driver of the hardware modeling system toward the logic low; and (c) while driving the pin, automatically determining if the current into the pin is between a first reference current and a second reference current to indicate that the pin is in the non-driving state, or if the current at the pin is other than between the first and second reference currents to indicate that the pin is in another state.

47. A method for use in a hardware modeling system for determining if a pin of an electronic device or circuitry that is electrically coupled to a pin driver of the hardware modeling system is in a non-driving state, the pin driver being individually programmable by software means to drive the pin toward a logic low or a logic high, comprising the steps of:

(a) programming the pin driver of the hardware modeling system to drive the pin toward the logic high;

(b) driving the pin with the pin driver of the hardware modeling system toward the logic high; and (c) while driving the pin, automatically determining if the current into the pin is between a first and a second reference current to indicate that the pin is in the non-driving state, or if the current into the pin is other than between the first and second reference currents to indicate that the pin is in another state.

48. A method for use in a hardware modeling system for determining if a pin of an electronic device or circuitry that is electrically coupled to a pin driver of the hardware modeling system is in a driving high state, the pin driver being individually programmable by software means to drive the pin toward a logic low or a logic high, comprising the steps of:

(a) programming the pin driver of the hardware modeling system to drive the pin toward the logic high;

(b) driving the pin with the pin driver of the hardware modeling system toward the logic high; and (c) while driving the pin, automatically determining if the current into the pin is less than a reference current to indicate that the pin is in the driving high state, or if the current into the pin is greater than the reference current to indicate that the pin is in another state.

49. A method for use in a hardware modeling system for determining if a pin of an electronic device or circuitry that is electrically coupled to a pin driver of the hardware modeling system is in a driving low state, non-driving state, or driving high state, the pin driver being individually programmable by software means to drive the pin toward a logic high or a logic low, comprising the steps of:

(a) programming the pin driver of the hardware modeling system to drive the pin toward the logic low;

(b) driving the pin with the pin driver of the hardware modeling system toward the logic low; and (c) while driving the pin, automatically determining if the current into the pin is greater than a first reference current to indicate that the pin is the driving low state, or if the current into the pin is between the first and a second reference current to indicate that the pin is in the non-driving state, or if the current into the pin is less than the second reference current to indicate that the pin is in the driving high state.

50. A method for use in a hardware modeling system for determining if a pin of an electronic device or circuitry that is electrically coupled to a pin driver of the hardware modeling system is in a driving low state, non-driving state, or driving high state, the pin driver being individually programmable by software means to drive the pin toward a logic high or a logic low, comprising the steps of:

(a) programming the pin driver of the hardware modeling system to drive the pin toward the logic high;
(b) driving the pin with the pin driver of the hardware modeling system toward the logic high; and
(c) while driving the pin, automatically determining if the current into the pin is greater than a first reference current to indicate that the pin is in the driving low state, or if the current into the pin is between the first and a second reference current to indicate that the pin is in the non-driving state, or if the current into the pin is less than the second reference current to indicate that the pin is in the driving high state.

51. A method for use in a hardware modeling system for determining if a pin of an electronic device or circuitry that is electrically coupled to a pin driver of the hardware modeling system is in a driving low state or non-driving state, the pin driver being individually programmable by software means to drive the pin toward a logic high or a logic low, comprising the steps of:

(a) programming the pin driver of the hardware modeling system to drive the pin toward the logic low;
(b) driving the pin with the pin driver of the hardware modeling system toward the logic low; and
(c) while driving the pin, automatically determining if the current into the pin is greater than a first reference current to indicate that the pin is in the driving low state, or if the current into the pin is between the first and a second reference current to indicate that the pin is in the non-driving state.

52. A method for use in a hardware modeling system for determining if a pin of an electronic device or circuitry that is electrically coupled to a pin driver of the hardware modeling system is in a driving high state or non-driving state, the pin driver being individually programmable by software means to drive the pin toward a logic high or a logic low, comprising the steps of:

(a) programming the pin driver of the hardware modeling system to drive the pin toward the logic high;
(b) driving the pin with the pin driver of the hardware modeling system toward the logic high; and
(c) while driving the pin, automatically determining if the current into the pin is less than a first reference current to indicate that the pin is in the driving high state, or if the current into the pin is between the first and a second reference current to indicate that the pin is in the non-driving state.

53. A method for determining with a hardware modeling system a state of a pin of an electronic device or circuitry that is electrically coupled to the hardware modeling system, comprising: driving the pin with a pin driver of the hardware modeling system and at the same time, automatically comparing the voltage of the pin with a plurality of reference voltage levels that differentiate between at least four states of the pin.

54. A method for determining with a hardware modeling system a state of a pin of an electronic device or circuitry that is electrically coupled to the hardware modeling system, comprising: driving the pin with a pin driver of the hardware modeling system and at the same time, automatically comparing the current into the pin with a plurality of reference current levels that differentiate between at least four states of the pin.

55. A method for determining with a hardware modeling system a state of a pin of an electronic device or circuitry that is electrically coupled to the hardware modeling system, comprising: driving the pin with a pin driver of the hardware modeling system and at the same time, automatically comparing the voltage at the pin with a plurality of reference voltage levels that differentiate between at least a driving low state, non-driving low state, non-driving high state, and driving high state.

56. A method for determining with a hardware modeling system a state of a pin of an electronic device or circuitry that is electrically coupled to the hardware modeling system, comprising: driving the pin with a pin driver of the hardware modeling system and at the same time, automatically comparing the current into the pin with a plurality of reference current levels that differentiate between at least a driving low state, non-driving low state, non-driving high state, and driving high state.

57. A method for determining with a hardware modeling system a state of a pin of an electronic device or circuitry that is electrically coupled to the hardware modeling system, comprising: driving the pin with a pin driver of the hardware modeling system and at the same time, automatically comparing the voltage at the pin with at least three reference voltages.

58. The method as recited in claim 57, wherein the method further includes the step of programming the reference voltages with the hardware modeling system.

59. The method as recited in claim 58, wherein the method includes programming the reference voltages by software means.

60. The method as recited in claim 58, wherein the method includes programming the reference voltages by hardware means.

61. A method for determining with a hardware modeling system a state of a pin of an electronic device or circuitry that is electrically coupled to the hardware modeling system, comprising: driving the pin with a pin driver of the hardware modeling system and at the same time, automatically comparing the current into the pin with at least three reference currents.

62. The method as recited in claim 61, wherein the method further includes the step of programming the reference currents with the hardware modeling systems.

63. The method as recited in claim 62, wherein the method includes programming the reference currents by software means.

64. The method as recited in claim 62, wherein the method includes programming the reference currents by hardware means.

65. A method for determining with a hardware modeling system a state of a pin of an electronic device or circuitry that is electrically coupled to the hardware modeling system, comprising: driving the pin with a pin driver of the hardware modeling system and at the same time, automatically comparing voltage at the pin in at least three comparators with a different reference voltage being provided to each comparator.

66. The method as recited in claim 65, wherein the reference voltages are software programmable by the hardware modeling system.

67. The method as recited in claim 65, wherein the reference voltages are hardware programmable by the hardware modeling system.

68. A method for determining with a hardware modeling system a state of a pin of an electronic device or circuitry that is electrically coupled to the hardware modeling system, comprising: driving the pin with a pin driver of the hardware modeling system and at the same time, automatically comparing the current into the pin in at least three comparators with a different reference current being provided to each comparator.

69. The method as recited in claim 68, wherein the reference currents are software programmable by the hardware modeling system.

70. The method as recited in claim 68, wherein the reference currents are hardware programmable by the hardware modeling system.

71. A method for use in a hardware modeling system for determining a state of a pin of an electronic device or circuitry that is electrically coupled to the hardware modeling system, comprising: driving the pin with a software programmable, current limited pin driver of the hardware modeling system, with the pin driver being programmable to drive with any one of at least eight different current limits, and at the same time, automatically comparing the voltage of the pin with at least one reference voltage.

72. The method as recited in claim 71 wherein the electronic devices or circuitry includes a plurality of pins electrically coupled to pin drivers of the hardware modeling system, and the current limit of the pin driver associated with each pin is independently software programmable by the hardware modeling system.

73. A method for use in a hardware modeling system for determining a state of a pin of an electronic device or circuitry that is electrically coupled to the hardware modeling system, comprising: driving the pin with a software programmable, current limited pin driver of the hardware modeling system, with the pin driver being programmable to drive with any one of at least eight different current limits and at the same time, automatically comparing the current into the pin with at least one reference current.

74. The method as recited in claim 73, wherein the electronic devices or circuitry includes a plurality of pins electrically coupled to pin drivers of the hardware modeling system, and the current limit of the pin driver associated with each pin is independently software programmable by the hardware modeling system.

75. A method for use in a hardware modeling system for determining a state of a pin of an electronic device or circuitry that is electrically coupled to the hardware modeling system, comprising: driving the pin with a software programmable, current limited pin driver of the hardware modeling system, the pin driver being both a current sink and source and driving toward a predetermined software programmable voltage level, and at the same time, automatically comparing the voltage of the pin with at least two reference voltages.

76. A method for use in a hardware modeling system for determining a state of a pin of an electronic device or circuitry that is electrically coupled to the hardware modeling system, comprising: driving the pin with a software programmable, current limited pin driver of the hardware modeling system, the pin driver being both a current sink and source and driving toward a predetermined software programmable voltage level and at the same time, automatically comparing the current into the pin with at least two reference currents.

77. A method for use in a hardware modeling system for determining a state of a pin of an electronic device or circuitry that is electrically coupled to the hardware modeling system, comprising: driving the pin with a software programmable pin driver of the hardware modeling system, the pin driver being programmable to drive with any one of at least eight different I/V characteristic curves, and at the same time, automatically comparing the voltage of the pin with at least one reference voltage.

78. A method for use in a hardware modeling system for determining a state of a pin of an electronic device or circuitry that is electrically coupled to the hardware modeling system, comprising: driving the pin with a software programmable pin driver of the hardware modeling system, the pin driver being programmable to drive with any one of at least eight different I/V characteristic curves, and at the same time, automatically comparing the current into the pin with at least one reference current.

79. The method as recited in claims 1, 2, 3, 4, 5, 6, 7, 8, 9, 10, 11, 12, 13, 14, 15, 16, wherein the method includes determining the state of a pin of an electronic device or circuitry that is electrically coupled to the hardware modeling system in response to an access to the hardware modeling system being assessed by a simulator via network means.

80. The method as recited in claims 1, 2, 3, 4, 5, 6, 7, 8, 9, 10, 11, 12, 13, 14, 15, 16, wherein the method includes determining a state of a pin of an electronic device or circuitry that is electrically coupled to the hardware modeling system with the hardware modeling system being time shared among a plurality of simulators.

81. The method as recited in claims 1, 2, 3, 4, 5, 6, 7, 8, 9, 10, 11, 12, 13, 14, 15, 16, wherein the method includes determining the state of a pin of an electronic device or circuitry that is electrically coupled to the hardware modeling system, the hardware modeling system having a plurality of electronic devices or circuitry connected thereto with each electronic device or circuitry having at least one pin that is electrically coupled to the hardware modeling system.

82. The method as recited in claims 1, 2, 3, 4, 5, 6, 7, 8, 9, 10, 11, 12, 13, 14, 15, 16, wherein the pin is capable of functioning as both an input and an output.

83. The method as recited in claims 1, 2, 3, 4, 5, 6, 7, 8, 9, 10, 11, 12, 13, 14, 15, 16, wherein the method includes determining the states of a plurality of pins of the electronic device or circuitry simultaneously.

84. The method as recited in claim 53, 54, 55, 56, 57, 58, 59, 60, 61, 62, 63, 64, 65, 66, 67, 68, 69, 70, 71, 72, 73, 74, 75, 76, 77, or 78, wherein the method further includes as a first step resetting and restoring the electronic device or circuitry to a specific internal state by presentation of a history sequence of stimulation patterns to the electronic device or circuitry.

85. A multi-channel pin driver integrated circuit of a hardware modeling system for simultaneously stimulating and sensing at least a portion of the pins of an electronic device or circuitry electrically coupled to the integrated circuit, the integrated circuit including at least one current limited pin driver of the hardware modeling system that is electrically coupled to a pin of the electronic device or circuitry, the current limit of the pin driver of the hardware modeling system being software programmable by the hardware modeling system.

86. A multi-channel pin driver integrated circuit of a hardware modeling system for simultaneously stimulating and sensing at least a portion of the pins of an electronic device or circuitry electrically coupled to the integrated circuit, the integrated circuit including at least one pin driver of the hardware modeling system that is electrically coupled to a pin of the electronic device or circuitry, the pin driver of the hardware modeling system providing a programmable drive voltage for driving the pin connected thereto, the drive voltage being programmable to at least three different voltages.

87. The multi-channel pin driver integrated circuit as recited in claim 86, wherein the drive voltage is software programmable by the hardware modeling system.

88. A multi-channel pin driver integrated circuit of a hardware modeling system for simultaneously stimulating and sensing at least a portion of the pins of an electronic device or circuitry electrically coupled to the integrated circuit, the integrated circuit including at least one channel having at least three voltage comparators for use in determining a state of at least one pin.

89. A multi-channel pin driver integrated circuit of a hardware modeling system for simultaneously stimulating and sensing at least a portion of the pins of an electronic device or circuitry electrically coupled to the integrated circuit, the integrated circuit including at least one channel having at least one voltage comparator for use in determining the state of at least one pin, the voltage comparator having input thereto a programmable reference voltage.

90. The multi-channel pin driver integrated circuit as recited in claim 89, wherein the reference voltage is software programmable by the hardware modeling system.

91. A method for use in a hardware modeling system for executing hardware modeling system diagnostics using known-good diagnostic circuitry, comprising the steps of:

(a) electrically coupling the diagnostic circuitry to the pin electronics circuitry of the hardware modeling system;

(b) presenting stimulus patterns to the diagnostic circuitry using the pin electronics circuitry;

(c) measuring a response of the diagnostic circuitry to the stimulus patterns applied in step (b); and (d) automatically comparing the response measured in step (c) with a known-good response to determine if the hardware modeling system is functioning properly.

92. A method for use in a hardware modeling system for determining a state of at least one pin of an electronic device or circuitry that is electrically coupled to the hardware modeling system, comprising: driving the pin with a pin driver of the hardware modeling system, and at the same time, automatically determining whether the pin is in a driving low state or a non-driving low state.

93. A method for use in a hardware modeling system for determining a state of at least one pin of an electronic device or circuitry that is electrically coupled to the hardware modeling system, comprising: driving the pin with a pin driver of the hardware modeling system, and at the same time, automatically determining whether the pin is in a driving high state or a non-driving high state.

94. A method for use in a hardware modeling system for restoring an electronic device or circuitry to a specific internal state, the electronic device or circuitry having at least one I/O pin electrically coupled to the hardware modeling system, the method comprising presenting a history sequence of stimulation patterns to the I/O pin of the electronic device or circuitry with a current limited pin driver of the hardware modeling system coupled to the I/O pin.

95. The method as recited in claim 94, wherein the current limit for the pin driver is less than 50 mA.

96. A method for use in a hardware modeling system for restoring an electronic device or circuitry to a specific internal state, the electronic device or circuitry having at least one I/O pin electrically coupled to the hardware modeling system, the method comprising presenting a history sequence of stimulation patterns to the I/O pin of the electronic device or circuitry with a pulsed driver of the hardware modeling system coupled to the I/O pin.

97. A method for use in a hardware modeling system for determining an output delay of at least a first pin of an electronic device or circuitry according to a present internal state of the electronic device or circuitry in response to a stimulus applied to at least a second pin of the electronic device or circuitry, the pins being electrically coupled to the hardware modeling system, comprising the steps of:

(a) resetting the electronic device or circuitry coupled to the hardware modeling system to a known internal state;

(b) restoring the electronic device or circuitry coupled to the hardware modeling system to the present internal state;

(c) stimulating the electronic device or circuitry coupled to the hardware modeling system by applying stimulus through at least the second pin;

(d) sampling the state of the first pin according to a software programmable delay after the stimulus was applied;

(e) changing the software programmable delay in a predetermined manner based on the state sampled during step (d); and (f) repeating steps (a)–(e) until the output delay time is determined.

98. A multi-channel pin driver integrated circuit of a hardware modeling system for stimulating at least a portion of the pins of an electronic device or circuitry electrically coupled to the integrated circuit, the integrated circuit including circuit means to stage pin stimulation patterns for simultaneous presentation of the pin stimulation patterns to the pins connected to the integrated circuit and for simultaneous presentation of the pin stimulation patterns with pin stimulation patterns of other multi-channel pin driver integrated circuits.

99. A multi-channel pin driver integrated circuit of a hardware modeling system for stimulating at least a portion of the pins of an electronic device or circuitry electrically coupled to the integrated circuit, the integrated circuit including one shared data path for both programming internal control registers of the integrated circuit and for providing pin stimulation pattern data to the integrated circuit from circuitry of the hardware modeling system.

100. A multi-channel pin driver integrated circuit of a hardware modeling system for stimulating at least a portion of the pins of an electronic device or circuitry electrically coupled to the integrated circuit, the integrated circuit including one shared data path for both reading internal control registers of the integrated circuit and for providing pin stimulation pattern data to the integrated circuit from circuitry of the hardware modeling system.

101. A multi-channel pin driver integrated circuit of a hardware modeling system for stimulating at least a portion of the pins of an electronic device or circuitry electrically coupled to the integrated circuit, the integrated circuit including circuitry for error checking incoming pins stimulation patterns.

102. The multi-channel pin driver integrated circuit as recited in claim 101, wherein the error checking circuitry performs parity error checks.

103. A multi-channel pin driver integrated circuit of a hardware modeling system for stimulating at least a portion of the pins of an electronic device or circuitry electrically coupled to the integrated circuit, the integrated circuit including a strobe input for use in determining the sampling times for measuring output delays.

104. A method for use in a hardware modeling system of restoring an internal state of an electronic device or circuitry having at least one I/O pin, the I/O pin being electrically coupled to a pin driver of the hardware modeling system, comprising the steps of:

(a) storing a history sequence of stimulation patterns for the I/O pin in memory means with at least one stimulation pattern of the history sequence for the I/O pin being stored in a single bit of the memory means;

(b) retrieving from the memory means at least one stimulation pattern of the history sequence for the I/O pin;

(c) presenting the retrieved I/O pin stimulation pattern or patterns to the I/O pin with the pin driver of the hardware modeling system; and (d) repeating steps (b) and (c) until the entire history sequence is presented to the I/O pin.

105. A method for use in a hardware modeling system of restoring an internal state of an electronic device or circuitry having at least one I/O pin, the I/O pin being electronically coupled to a pin driver of the hardware modeling system, comprising the steps of:

(a) storing a history sequence of stimulation patterns for the I/O pin in memory means in a plurality of memory means bits, the number of bits being used being less than twice the number of stimulation patterns for the I/O pin;

(b) retrieving from the memory means at least one stimulation pattern of the history sequence for the I/O pin;

(c) presenting the retrieved I/O pin stimulation pattern or patterns to the I/O pin with the pin driver of the hardware modeling system; and (d) repeating steps (b) and (c) until the entire history sequence is presented to the pin.

106. A method for use in a hardware modeling system of restoring an internal state of an electronic device or circuitry having pins electrically coupled to pin drivers of the hardware modeling system and at least one I/O pin that is electrically coupled to a pin driver of the hardware modeling system, comprising the steps of:

(a) presenting a history sequence of stimulation patterns to the pins of the electronic device or circuitry with the pin drivers of the hardware modeling system;

(b) determining the state of the I/O pin;

(c) embedding in the history sequence a stimulation pattern which will cause the pin driver of the hardware modeling system connected to the I/O pin to drive high when said pattern of the history sequence is again presented regardless of the logic state of simulated circuitry connected to the I/O pin in a design under simulation if the state of the I/O pin was determined in step (b) to be a driving high state; and (d) embedding in the history sequence a pin stimulation pattern which will cause the pin driver of the hardware modeling system connected to the I/O pin to drive in a low state when said pattern of the history sequence is again presented regardless of the logic state of a simulated circuitry connected to the I/O pin in a design under simulation if the state of the I/O pin was determined in step (b) to be a driving low state.

107. A hardware modeling system for stimulating and sensing a response of electronic devices or circuitry to the stimulus, the electronic device or circuitry being electrically coupled to the hardware modeling system, the improvement being that the presence and type of electronic device or circuitry is determined automatically when the electronic device or circuitry is connected to a powered hardware modeling system.

108. A hardware modeling system for stimulating and sensing a response of electronic devices or circuitry to the stimulus, the improvement being that the hardware modeling system has fixturing means for connecting an electronic device or circuitry to the hardware modeling system that is powered.

109. An apparatus for connecting an electronic device or circuitry to a hardware modeling system, comprising fixturing means that has matched length traces connecting pins of the electronic device or circuitry to pin electronics circuitry of the hardware modeling system.

110. A method for use in a hardware modeling system for generating a portion of an electronic device or circuitry timing specification, the electronic device or circuitry being electrically coupled to the hardware modeling system, the method comprising measuring output delays of pins of the electrical device or circuitry coupled to the hardware modeling system, in response to stimulus, and deriving the timing specification from the output delays.

111. A hardware modeling system for stimulating and sensing a response of electronic devices or circuitry to the stimulus, the hardware modeling system having a plurality of electronic devices or circuitry electrically coupled thereto, the improvement being that a fixturing means of the hardware modeling system provides a plurality of different power supply voltages to accommodate connections of electronic devices or circuitry that operate at different power supply voltages.

* * * * *

UNITED STATES PATENT AND TRADEMARK OFFICE

CERTIFICATE OF CORRECTION

PATENT NO. : 5,353,243

DATED : October 4, 1994

INVENTOR(S) : Andrew J. Read et al.

It is certified that error appears in the above-indentified patent and that said Letters Patent is hereby corrected as shown below:

Column 1863, line 48, change "low" to --high--.

Column 1863, line 58, insert --the-- after "that".

Column 1865, line 59, change "that" to --than--.

Column 1865, line 62, insert --that-- after "indicate".

Column 1868, line 67, insert --the-- after "wherein".

Column 1871, line 52, change "circuit" to --current--.

Column 1874, lines 42-43, change "systems" to --system--.

Column 1875, line 58, insert a comma --,-- immediately after "level".

Column 1878, line 68, change "pins" to --pin--.

Signed and Sealed this

Twenty-first Day of March, 1995

Attest:

Bruce Lehman

BRUCE LEHMAN

*Attesting Officer*

*Commissioner of Patents and Trademarks*